US012507524B2

(12) United States Patent
Kwak et al.

(10) Patent No.: US 12,507,524 B2
(45) Date of Patent: Dec. 23, 2025

(54) LIGHT-EMITTING DEVICE AND ELECTRONIC APPARATUS INCLUDING THE SAME

(71) Applicant: Samsung Electronics Co., Ltd., Suwon-si (KR)

(72) Inventors: Seungyeon Kwak, Suwon-si (KR); Byungjoon Kang, Seoul (KR); Hyungjun Kim, Suwon-si (KR); Myungsun Sim, Suwon-si (KR); Kum Hee Lee, Suwon-si (KR); Sunghun Lee, Hwaseong-si (KR); Byoungki Choi, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 566 days.

(21) Appl. No.: 17/833,946

(22) Filed: Jun. 7, 2022

(65) Prior Publication Data

US 2023/0105127 A1 Apr. 6, 2023

(30) Foreign Application Priority Data

Jun. 8, 2021 (KR) ........................ 10-2021-0074303

(51) Int. Cl.

*H10K 50/852* (2023.01)
*C09K 11/06* (2006.01)

(Continued)

(52) U.S. Cl.

CPC ............ *H10K 50/852* (2023.02); *C09K 11/06* (2013.01); *H10K 50/11* (2023.02); *H10K 50/13* (2023.02);

(Continued)

(58) Field of Classification Search

CPC ..... H10K 50/19; H10K 50/13; H10K 2101/90

See application file for complete search history.

(56) References Cited

U.S. PATENT DOCUMENTS

| | | | |
|---|---|---|---|
| 9,184,405 | B2 | 11/2015 | Song et al. |
| 2013/0240851 | A1 | 9/2013 | Uesaka et al. |

(Continued)

FOREIGN PATENT DOCUMENTS

| | | | |
|---|---|---|---|
| CN | 103681760 | A | 3/2014 |
| CN | 105679948 | A | 6/2016 |

(Continued)

OTHER PUBLICATIONS

English Translation of Office Action dated Feb. 14, 2023, issued in corresponding KR Patent Application No. 10-2021-0074303, 6 pp.

(Continued)

*Primary Examiner* — Evren Seven

(74) *Attorney, Agent, or Firm* — CANTOR COLBURN LLP

(57) ABSTRACT

Provided are a light-emitting device and an electronic apparatus including the same. The light-emitting device includes a first electrode, a second electrode facing the first electrode, and an emission layer between the first electrode and the second electrode, wherein the first electrode is a reflective electrode, the emission layer includes i) a first emission layer, ii) a second emission layer, or a combination thereof, wherein when the first emission layer and the second emission layer are both present, then the second emission layer is located between the first emission layer and the second electrode, the first emission layer includes a first compound capable of emitting first light having a first spectrum, $\lambda P(1)$ is an emission peak wavelength (nm) of the first spectrum, the second emission layer includes a second compound capable of emitting second light having a second spectrum, $\lambda P(2)$ is an emission peak wavelength (nm) of the second spectrum, the emission layer may emit third light having a third spectrum, $\lambda P(3)$ is an emission peak wavelength (nm) of the third spectrum, $\lambda P(1)$ is less than $\lambda P(2)$, $|\lambda P(1)-\lambda P(2)|$ (Continued)

10 is greater than 0 nm and less than or equal to 30 nm, and each of |λP(2)−λP(3)| and |λP(3)−λP(1)| is greater than or equal to 0 nm and less than or equal to 30 nm.

19 Claims, 2 Drawing Sheets

(51) Int. Cl.

| | |
|---|---|
| ***H10K 50/11*** | (2023.01) |
| ***H10K 50/13*** | (2023.01) |
| ***H10K 85/30*** | (2023.01) |
| ***H10K 85/40*** | (2023.01) |
| ***H10K 101/10*** | (2023.01) |

(52) U.S. Cl.
CPC ........... *H10K 85/342* (2023.02); *H10K 85/40* (2023.02); *C09K 2211/1029* (2013.01); *C09K 2211/1048* (2013.01); *C09K 2211/185* (2013.01); *H10K 2101/10* (2023.02)

(56) References Cited

U.S. PATENT DOCUMENTS

| | | | | |
|---|---|---|---|---|
| 2014/0070196 | A1 | 3/2014 | Kim et al. | |
| 2015/0053958 | A1 | 2/2015 | Ishisone et al. | |
| 2016/0163771 | A1 | 6/2016 | Jang et al. | |
| 2016/0248031 | A1 | 8/2016 | Seo | |
| 2020/0091439 | A1* | 3/2020 | Ihn | H10K 85/654 |
| 2021/0159282 | A1 | 5/2021 | Jang et al. | |
| 2021/0167313 | A1* | 6/2021 | Seo | H10K 50/11 |

FOREIGN PATENT DOCUMENTS

| | | | |
|---|---|---|---|
| CN | 107230744 | A | 10/2017 |
| EP | 3032600 | A2 | 6/2016 |
| JP | 2008091198 | A | 4/2008 |
| JP | 2016157691 | A | 9/2016 |
| JP | 2021002655 | A | 1/2021 |
| KR | 20140059713 | A | 5/2014 |
| KR | 20160046806 | A | 4/2016 |
| KR | 20160069625 | A | 6/2016 |
| KR | 20170143292 | A | 12/2017 |
| KR | 2012069 | B1 | 8/2019 |
| KR | 20220127421 | A | 9/2022 |

OTHER PUBLICATIONS

Office Action dated Feb. 14, 2023, issued in corresponding KR Patent Application No. 10-2021-0074303, 6 pp.
English Abstract of JP 2008-091198.
English Abstract of JP 2021-002655.
English Abstract of KR 2017-0143292.
English Abstract of KR 2022-0127421.
Extended European Search Report dated Nov. 21, 2022 issued in EP Patent Application No. 22177369.0, 8 pp.
English Translation of Office Action dated Apr. 30, 2025, issued in corresponding CN Patent Application No. 202210649534.1, 10 pp.
Office Action dated Apr. 30, 2025, issued in corresponding CN Patent Application No. 202210649534.1, 7 pp.

* cited by examiner

LIGHT-EMITTING DEVICE AND ELECTRONIC APPARATUS INCLUDING THE SAME

CROSS-REFERENCE TO RELATED APPLICATION

This application claims priority under 35 U.S.C. § 119 to Korean Patent Application No. 10-2021-0074303, filed on Jun. 8, 2021, in the Korean Intellectual Property Office, the content of which is incorporated by reference herein in its entirety.

BACKGROUND

1. Field

The present disclosure relates to light-emitting devices and electronic apparatuses including the same.

2. Description of the Related Art

From among light-emitting devices, organic light-emitting devices are self-emissive devices, which have improved characteristics in terms of viewing angles, response time, luminance, driving voltage, and response speed, and produce full-color images.

In an example, an organic light-emitting device may include an anode, a cathode, and an organic layer located between the anode and the cathode and including an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

Provided are light-emitting devices having a novel emission layer and electronic apparatuses including the same.

Additional aspects will be set forth in part in the description, which follows and, in part, will be apparent from the description, or may be learned by practice of the presented embodiments of the disclosure.

According to an aspect of an embodiment, a light-emitting device includes a first electrode, a second electrode facing the first electrode, and an emission layer between the first electrode and the second electrode, wherein the first electrode is a reflective electrode, the emission layer includes i) a first emission layer, and ii) a second emission layer between the first emission layer and the second electrode, the first emission layer includes a first compound capable of emitting a first light having a first spectrum, and $\lambda P(1)$ is an emission peak wavelength in nm of the first spectrum, the second emission layer includes a second compound capable of emitting a second light having a second spectrum, and $\lambda P(2)$ is an emission peak wavelength in nm of the second spectrum, the emission layer emits a third light having a third spectrum, and $\lambda P(3)$ is an emission peak wavelength in nm of the third spectrum, $\lambda P(1)$ is less than $\lambda P(2)$, $|\lambda P(1)-\lambda P(2)|$ is greater than 0 nm and less than or equal to about 30 nm, each of $|\lambda P(2)-\lambda P(3)|$ and $|\lambda P(3)-\lambda P(1)|$ is greater than or equal to 0 nm and less than or equal to about 30 nm, $\lambda P(1)$ and $\lambda P(2)$ are evaluated from photoluminescence spectra measured for a first film and a second film, respectively, the first film includes the first compound, the second film includes the second compound, and $\lambda P(3)$ is evaluated from an electroluminescence spectrum of the light-emitting device.

According to an aspect of another embodiment, an electronic apparatus includes the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
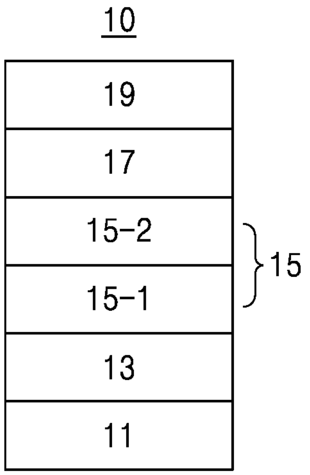
FIG. 1 shows a schematic cross-sectional view of a light-emitting device according to an exemplary embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term “and/or” includes any and all combinations of one or more of the associated listed items. Expressions such as “at least one of,” when preceding a list of elements, modify the entire list of elements and do not modify the individual elements of the list.

It will be understood that when an element is referred to as being “on” another element, it can be directly on the other element or intervening elements may be present therebetween. In contrast, when an element is referred to as being “directly on” another element, there are no intervening elements present.

It will be understood that, although the terms “first,” “second,” “third” etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, “a first element,” “component,” “region,” “layer” or “section” discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A light-emitting device according to an embodiment of the disclosure may include a first electrode, a second electrode facing the first electrode, and an emission layer between the first electrode and the second electrode.

The first electrode may be a reflective electrode.

The emission layer may include i) a first emission layer, and ii) a second emission layer between the first emission layer and the second electrode. In an embodiment, the first emission layer may be in direct contact with the second emission layer.

The first emission layer includes a first compound capable of emitting first light having a first spectrum, $\lambda P(1)$ is an emission peak wavelength (nm) of the first spectrum, the second emission layer includes a second compound capable of emitting second light having a second spectrum, $\lambda P(2)$ is an emission peak wavelength (nm) of the second spectrum, the emission layer may emit third light having a third spectrum, and $\lambda P(3)$ is an emission peak wavelength (nm) of the third spectrum.

$\lambda P(1)$ may be less than $\lambda P(2)$, $|\lambda P(1)-\lambda P(2)|$ may be greater than 0 nm and less than or equal to about 30 nm, and each of $|\lambda P(2)-\lambda P(3)|$ and $|\lambda P(3)-\lambda P(1)|$ may be greater than or equal to 0 nm and less than or equal to about 30 nm.

$|\lambda P(1)-\lambda P(2)|$, $|\lambda P(2)-\lambda P(3)|$, and $|\lambda P(3)-\lambda P(1)|$ are absolute values of $\lambda P(1)-\lambda P(2)$, $\lambda P(2)-\lambda P(3)$, and $\lambda P(3)-\lambda P(1)$, respectively.

$\lambda P(1)$ and $\lambda P(2)$ may be evaluated from photoluminescence spectra measured for a first film and a second film, respectively.

In the present specification, the "first film" is a film including the first compound, and the "second film" is a film including the second compound. The first film and the second film may be manufactured using various methods such as any method known in the art, for example, a vacuum deposition method, a coating method, and heating method. The first film and the second film may further include other compounds, for example, a host described in the present specification, in addition to the first compound and the second compound.

For example, a method of evaluating $\lambda P(1)$ and $\lambda P(2)$ may be the same as described in Evaluation Example 1 in the present specification.

$\lambda P(3)$ is evaluated from an electroluminescence spectrum of the light-emitting device. In an embodiment, a method of evaluating $\lambda P(3)$ may be the same as described in Evaluation Example 3 in the present specification.

The third light may be extracted to the outside of the light-emitting device through the second electrode. In an embodiment, the second electrode may be a transparent electrode or a semi-transparent electrode.

A first region may exist between the emission layer and the first electrode of the light-emitting device.

In an embodiment, the first region may be a hole transport region.

In an embodiment, the first electrode may be an anode, and the second electrode may be a cathode.

Because the first electrode of the light-emitting device is a reflective electrode, the third light emitted from the emission layer may vibrate between the first electrode and the second electrode according to the principle of constructive interference, and may be extracted to the outside of the light-emitting device by a microcavity effect through the second electrode.

The microcavity effect for the third light generated from the emission layer has a close relationship with a resonance distance which is a distance between an "interface between the emission layer and the first region (e.g., hole transport region)" and an "interface between the first region (e.g., hole transport region) and the first electrode (e.g., anode)." An external extraction efficiency of light having an emission peak wavelength corresponding to the resonance distance is relatively high due to the microcavity effect, whereas an external extraction efficiency of light having an emission peak wavelength not corresponding to the resonance distance is not substantially affected by the microcavity effect and thus may be relatively low.

The resonance distance as described above may not always be kept constant due to deviations in a manufacturing process when a large number of the light-emitting devices are manufactured. This may cause a deviation in the emission color (i.e., light extracted toward the outside of the light-emitting device among the third light) between manufactured light-emitting devices, that is, a deviation in CIE coordinates (e.g., CIEx) and a deviation in luminescence efficiency. The deviation in luminescence efficiency according to the change in CIEx may be a factor impairing process stability in mass production of light-emitting devices.

Figure 3:
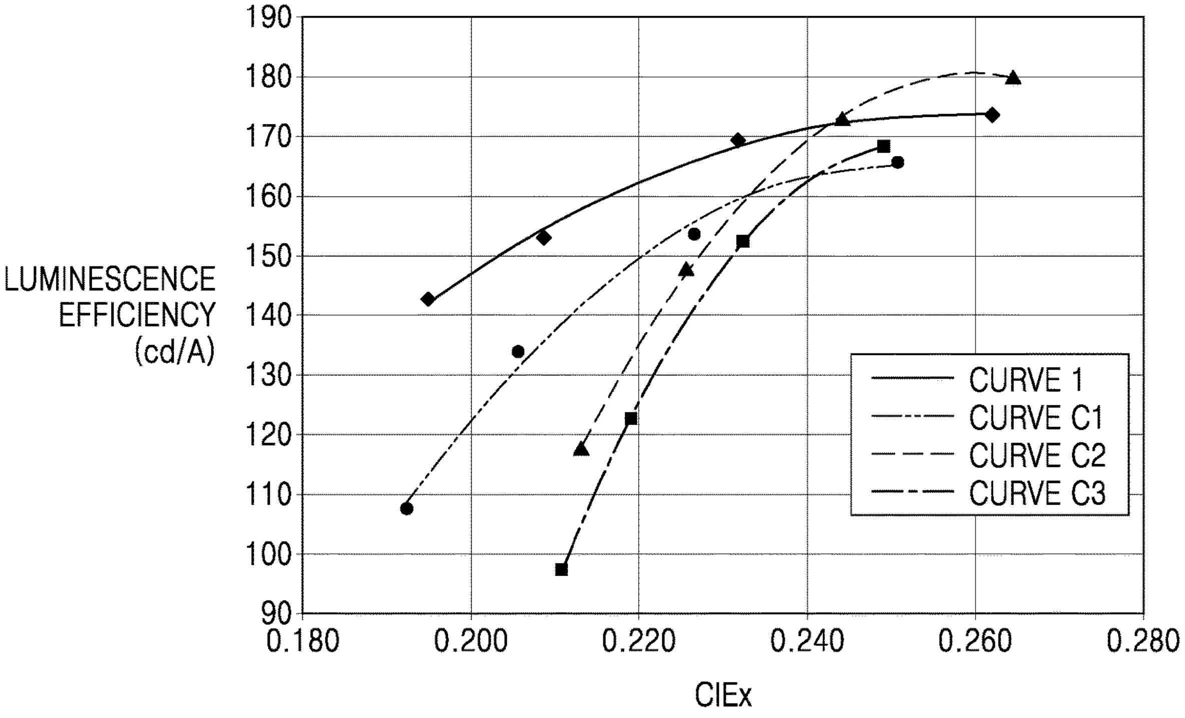
FIG. 3 is a diagram showing a curve 1 and curves C1 to C3, which are CIEx—luminescence efficiency curves of an OLED 1 and OLEDs C1 to C3, respectively.

However, as described above, the first emission layer including the first compound having a smaller emission peak wavelength than that of the second compound is arranged closer to the first electrode than the second emission layer including the second compound, thereby reducing a resonance distance of the first light, which is a distance between an "interface between the first emission layer and the first region (e.g., hole transport region)" and an "interface between the first region (e.g., hole transport region) and the first electrode (e.g., anode)" and strengthening the resonance of the first light, and thus, the curvature of a CIEx-luminescence efficiency curve of the light-emitting device may be improved (i.e., becoming gentle)(e.g., see FIG. 3).

As described above, because the curvature of the CIEx-luminescence efficiency curve of the light-emitting device is improved, when the light-emitting device is mass-produced, a luminescence efficiency sensitivity according to emission color may be greatly improved, and thus a process deviation may be improved. Also, because the curvature of the CIEx-luminescence efficiency curve of the light-emitting device is improved, a phenomenon, in which light observed from the side of the light-emitting device (for example, a point shifted by 450 relative to the front) is blue-shifted compared to light observed from the front thereof and thus the light observed from the side of the light-emitting device has a relatively small luminescence efficiency, is substantially prevented, and the light-emitting device may have an excellent side luminance ratio (e.g., a ratio of luminance at a point shifted to the side by 45° relative to luminance at the front).

In an embodiment, $|\lambda P(1)-\lambda P(2)|$ may be greater than 0 nm and less than or equal to about 20 nm.

In an embodiment, $|\lambda P(1)-\lambda P(2)|$ may be greater than 0 nm and less than or equal to about 10 nm.

In an embodiment, each of $|\lambda P(2)-\lambda P(3)|$ and $|\lambda P(3)-\lambda P(1)|$ may be greater than or equal to 0 nm and less than or equal to about 15 nm.

In an embodiment, each of $|\lambda P(1)-\lambda P(2)|$, $|\lambda P(2)-\lambda P(3)|$ and $|\lambda P(3)-\lambda P(1)|$ may be greater than 0 nm and less than or equal to about 20 nm.

In an embodiment, each of $|\lambda P(1)-\lambda P(2)|$, $|\lambda P(2)-\lambda P(3)|$, and $|\lambda P(3)-\lambda P(1)|$ may be greater than 0 nm and less than or equal to about 10 nm.

In an Embodiment, $$\lambda P(1)<\lambda P(2)\leq\lambda P(3), \quad \text{i)}$$

$$\lambda P(1)\leq\lambda P(3)<\lambda P(2), \quad \text{ii)}$$

$$\lambda P(1)<\lambda P(3)\leq\lambda P(2), \text{ or} \quad \text{iii)}$$

$$\lambda P(3)\leq\lambda P(1)<\lambda P(2). \quad \text{iv)}$$

In an embodiment, each of λP(1), λP(2), and λP(3) may be about 500 nm to about 570 nm.

In an Embodiment, i) λP(1) may be about 510 nm to about 530 nm, λP(2) may be about 520 nm to about 540 nm, and λP(3) may be about 500 nm to about 540 nm, or ii) λP(1) may be about 540 nm to about 560 nm, λP(2) may be about 550 nm to about 570 nm, and λP(3) may be about 540 nm to about 570 nm.

In an embodiment, each of λP(1), λP(2), and λP(3) may be about 570 nm to about 650 nm.

In an embodiment, λP(1) may be about 570 nm to about 630 nm, λP(2) may be about 620 nm to about 650 nm, and λP(3) may be about 570 nm to about 650 nm.

In an embodiment, each of λP(1), λP(2), and λP(3) may be about 400 nm to about 500 nm.

In an embodiment, λP(1) may be about 430 nm to about 480 nm, λP(2) may be about 470 nm to about 500 nm, and λP(3) may be about 400 nm to about 500 nm.

In an embodiment, the light-emitting device may satisfy Condition A:

$$CD(1)<CD(2) \quad \text{Condition A}$$

wherein, in Condition A,

CD(1) is a current density in $mA/cm^2$ of a first light-emitting device,

CD(2) is a current density in $mA/cm^2$ of a second light-emitting device,

CD(1) and CD(2) are evaluated by measuring current densities of the first light-emitting device and the second light-emitting device under same voltage, the first light-emitting device includes:

the first electrode;

the second electrode facing the first electrode; and an emission layer E1 between the first electrode and the second electrode, the emission layer E1 of the first light-emitting device includes the first emission layer, the emission layer E1 of the first light-emitting device does not include the second emission layer, the second light-emitting device includes:

the first electrode;

the second electrode facing the first electrode; and an emission layer E2 between the first electrode and the second electrode, the emission layer E2 of the second light-emitting device does not include the first emission layer, the emission layer E2 of the second light-emitting device includes the second emission layer, and a structure of the first light-emitting device excluding the emission layer E1 and a structure of the second light-emitting device excluding the emission layer E2 are identical to each other.

By satisfying Condition A, when the light-emitting device is driven, an amount of excitons generated in the first emission layer may be greater than an amount of excitons generated in the second emission layer. Thus, the emission of the first light from the first emission layer becomes dominant over the emission of the second light from the second emission layer, and thus, the curvature of the CIEx-luminescence efficiency curve of the light-emitting device may become further improved (i.e., gentle), and the side luminance ratio of the light-emitting device may be further improved.

A detailed example of the first light-emitting device may be understood by referring to a light-emitting device A of Evaluation Example 2 below. A detailed example of the second light-emitting device may be understood by referring to a light-emitting device B of Evaluation Example 2 below.

A fourth light having a fourth spectrum may be extracted to the outside of the light-emitting device through the second electrode of the light-emitting device, and λP(OLED) is an emission peak wavelength (nm) of the fourth spectrum. In an embodiment, λP(OLED) may be evaluated from an electroluminescence spectrum of the light-emitting device.

In an embodiment, λP(3) and λP(OLED) may each independently be about 500 nm to about 570 nm.

In an embodiment, λP(3) and λP(OLED) may each independently be about 500 nm to about 540 nm.

In an embodiment, λP(3) and λP(OLED) may each independently be about 540 nm to about 570 nm.

In an embodiment, the third light and the fourth light may each be green light, yellow-green light, or yellow light.

In an embodiment, λP(3) and λP(OLED) may each independently be 570 nm to 650 nm.

In an embodiment, the third light and the fourth light may each be red light.

In an embodiment, λP(3) and λP(OLED) may each independently be 400 nm to 500 nm.

In an embodiment, the third light and the fourth light may each be blue light.

In an embodiment, the third light and the fourth light may not be white light.

In an embodiment, the third spectrum may include i) a main emission peak having λP(3), and may not include ii) an additional emission peak having an emission peak wavelength of λP(3)+about 50 nm or more or λP(3)−about 50 nm or less.

In an embodiment, the third spectrum may include i) a main emission peak having λP(3), and may not include ii) an additional emission peak having an emission peak wavelength of a red light and/or blue light region.

In an embodiment, the fourth spectrum may include i) a main emission peak having λP(OLED), and may not include ii) an additional emission peak having an emission peak wavelength of λP(OLED)+about 50 nm or more or λP(OLED)−about 50 nm or less.

In an embodiment, the fourth spectrum may include i) a main emission peak having λP(OLED), and may not include ii) an additional emission peak having an emission peak wavelength of red light and/or blue light region.

In an embodiment, the first compound may be an organometallic compound including a transition metal (e.g., iridium, platinum, osmium, etc.). In an embodiment, the first light may be phosphorescent light.

In an embodiment, the second compound may be an organometallic compound including a transition metal (e.g., iridium, platinum, osmium, etc.). In an embodiment, the second light may be phosphorescent light.

Each of the first compound and the second compound may include one transition metal.

Each of the first compound and the second compound may be electrically neutral.

In an embodiment, the first compound and the second compound may each independently be an organometallic compound including platinum or an organometallic compound including iridium.

In an embodiment, the first compound and the second compound may each be an organometallic compound including iridium, and the first compound and the second compound may be different from each other.

In an embodiment, the first compound and the second compound may each be a heteroleptic organometallic compound including iridium.

In an embodiment, the first compound and the second compound may each independently be:

i) an organometallic compound including platinum and a tetradentate ligand bonded to the platinum; or ii) an organometallic compound including iridium and a first ligand, a second ligand, and a third ligand, each bonded to the iridium.

In an embodiment, the organometallic compound including platinum and a tetradentate ligand bonded to the platinum may be an organometallic compound including a) a chemical bond between a carbon atom of the tetradentate ligand and the platinum and b) a chemical bond between an oxygen (O) atom of the tetradentate ligand and the platinum.

In an embodiment, the organometallic compound including platinum and a tetradentate ligand bonded to the platinum may be an organometallic compound including a) a chemical bond between a carbon atom of the tetradentate ligand and the platinum and b) a chemical bond between a sulfur (S) atom of the tetradentate ligand and the platinum.

In an embodiment, a) the first ligand, the second ligand, and the third ligand may be identical to one another, b) the first ligand and the second ligand may be identical to each other, and the second ligand and the third ligand may be different from each other, or c) the first ligand, the second ligand, and the third ligand may be different from one another, and the first ligand, the second ligand, and the third ligand may each be:

a bidentate ligand bonded to the iridium through two nitrogen atoms;

a bidentate ligand bonded to the iridium through a nitrogen atom and a carbon atom; or a bidentate ligand bonded to the iridium through two carbon atoms.

In an embodiment, the first ligand, the second ligand, and the third ligand may each be a bidentate ligand bonded to the iridium through a nitrogen atom and a carbon atom.

In an embodiment, the first compound and the second compound may each independently be an organometallic compound represented by Formula 1 or an organometallic compound represented by Formula 2:

Formula 1

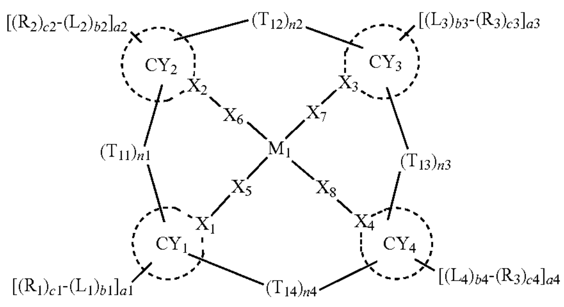

Formula 2

$$M_2(L_{11})_{n11}(L_{12})_{n12}(L_{13})_{n13}$$

wherein, $M_1$ in Formula 1 is platinum (Pt), and $M_2$ in Formula 2 is iridium (Ir).

$L_{11}$ in Formula 2 may be a ligand represented by Formula 2-1, $L_{12}$ may be a ligand represented by Formula 2-2, and $L_{13}$ may be a ligand represented by Formula 2-1 or 2-2:

Formula 2-1

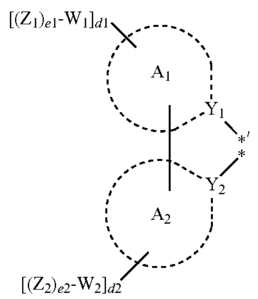

Formula 2-2

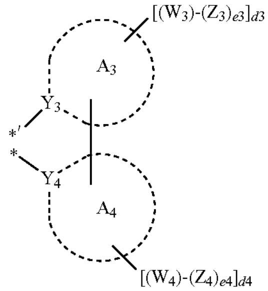

wherein, Formulae 2-1 and 2-2 are the same as described in the present specification.

$L_{11}$ and $L_{12}$ in Formula 2 may be different from each other.

n11 to n13 in Formula 2 may each indicate numbers of $L_{11}$ to $L_{13}$, respectively, wherein n11, n12, and n13 may each independently be 0, 1, 2, or 3, and the sum of n11, n12, and n13 may be 3.

In an embodiment, in Formula 2, n11 may be 1, 2, or 3, and n12 and n13 may each independently be 0, 1, or 2.

In an embodiment, in Formula 2, n12 may be 1, 2, or 3, and n11 and n13 may each independently be 0, 1, or 2.

In an embodiment, n11 may be 1, n12 may be 2, and n13 may be 0.

In an embodiment, n11 may be 2, n12 may be 1, and n13 may be 0.

In an embodiment, n11 may be 3, and n12 and n13 may each be 0.

In an embodiment, n12 may be 3, and n11 and n13 may each be 0.

The organometallic compound represented by Formula 2 may be a heteroleptic complex or a homoleptic complex.

In an embodiment, the organometallic compound represented by Formula 2 may be a heteroleptic complex.

$X_1$ to $X_4$ and $Y_1$ to $Y_4$ in Formulae 1, 2-1, and 2-2 may each independently be C or N.

In an embodiment, at least one of $X_1$ to $X_4$ in Formula 1 may be C.

In an embodiment, $X_1$ in Formula 1 may be C.

In an embodiment, in Formula 1, i) $X_1$ and $X_3$ may each be C, and $X_2$ and $X_4$ may each be N, or ii) $X_1$ and $X_4$ may each be C, and $X_2$ and $X_3$ may each be N.

In an embodiment, in Formulae 2-1 and 2-2, $Y_1$ and $Y_3$ may each be N, and $Y_2$ and $Y_4$ may each be C.

$X_5$ to $X_8$ in Formula 1 may each independently be a chemical bond, O, S, N(R'), C(R')(R''), or C(=O), wherein at least one of $X_5$ to $X_8$ may not be a chemical bond. R' and R'' are each the same as described in the present specification.

In an embodiment, $X_5$ in Formula 1 may not be a chemical bond.

In an embodiment, $X_5$ in Formula 1 may be O or S.

In an embodiment, in Formula 1, $X_5$ may be O or S, and $X_6$ to $X_8$ may each be a chemical bond.

Regarding Formula 1, two of a bond between $X_5$ or $X_1$ and $M_1$, a bond between $X_6$ or $X_2$ and $M_1$, a bond between $X_7$ or $X_3$ and $M_1$, and a bond between $X_8$ or $X_4$ and $M_1$ may each be a coordinate bond, and the other two may each be a covalent bond.

In an embodiment, a bond between $X_2$ and $M_1$ in Formula 1 may be a coordinate bond.

In an embodiment, regarding Formula 1, a bond between $X_5$ or $X_1$ and Mi and a bond between $X_3$ and $M_1$ may each be a covalent bond, and a bond between $X_2$ and $M_1$ and a bond between $X_4$ and $M_1$ may each be a coordinate bond.

Ring $CY_1$ to ring $CY_4$ and ring $A_1$ to ring $A_4$ in Formulae 1, 2-1, and 2-2 may each independently be a $C_5$-$C_{30}$ carbocyclic group or a $C_1$-$C_{30}$ heterocyclic group.

In an embodiment, in Formula 1, ring $CY_1$, ring $CY_3$, and ring $CY_4$ may each not be a benzimidazole group.

In an embodiment, ring $CY_1$ to ring $CY_4$ and ring $A_1$ to ring $A_4$ in Formulae 1, 2-1, and 2-2 may each independently be i) a first ring, ii) a second ring, iii) a condensed ring in which two or more first rings are condensed with each other, iv) a condensed ring in which two or more second rings are condensed with each other, or v) a condensed ring in which at least one first ring and at least one second ring are condensed with each other, the first ring may be a cyclopentane group, a cyclopentene group, a cyclopentadiene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a piperidine group, a cyclohexane group, a cyclohexene group, a benzene group, a pyridine group, a pyrimidine group, a pyrazine group, a pyridazine group, or a triazine group.

In an embodiment, ring $CY_1$ to ring $CY_4$ and ring $A_1$ to ring $A_4$ in Formulae 1, 2-1, and 2-2 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an iso-oxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a naphthopyrrole group, a naphthopyrazole group, a naphthoimidazole group, a naphthooxazole group, a naphthoisoxazole group, a naphthothiazole group, a naphthoisothiazole group, a naphthooxadiazole group, a naphthothiadiazole group, a phenanthrenopyrrole group, a phenanthrenopyrazole group, a phenanthrenoimidazole group, a phenanthrenooxazole group, a phenanthrenoisoxazole group, a phenanthrenothiazole group, a phenanthrenoisothiazole group, a phenanthrenooxadiazole group, a phenanthrenothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

In an embodiment, ring $CY_1$ and ring $CY_3$ in Formula 1 may each independently be:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with a cyclohexane group, a cyclohexene group, a norbornane group, a piperidine group, or any combination thereof.

In an embodiment, ring $CY_2$ in Formula 1 may be:

an imidazole group, a benzimidazole group, a pyridine group, a pyrimidine group, a pyridazine group, a pyrazine group, a triazine group, a quinoline group, an isoquinoline group, a quinoxaline group, or a quinazoline group; or an imidazole group, a benzimidazole group, a pyridine group, a pyrimidine group, a pyridazine group, a pyrazine group, a triazine group, a quinoline group, an isoquinoline group, a quinoxaline group, or a quinazoline group, each condensed with a cyclohexane group, a cyclohexene group, a norbornane group, a benzene group, a pyridine group, a pyrimidine group, or any combination thereof.

In an embodiment, ring $CY_4$ in Formula 1 may be:

a pyridine group, a pyrimidine group, a pyridazine group, a pyrazine group, a triazine group, a quinoline group, an isoquinoline group, a quinoxaline group, a quinazoline group, an azadibenzofuran group, an azadibenzothiophene group, an azadibenzoselenophene group, an azacarbazole group, an azafluorene group, or an azadibenzosilole group; or a pyridine group, a pyrimidine group, a pyridazine group, a pyrazine group, a triazine group, a quinoline group, an isoquinoline group, a quinoxaline group, a quinazoline group, an azadibenzofuran group, an azadibenzothiophene group, an azadibenzoselenophene group, an azacarbazole group, an azafluorene group, or an azadibenzosilole group, each condensed with a cyclohexane group, a cyclohexene group, a norbornane group, a benzene group, a pyridine group, a pyrimidine group, or any combination thereof.

Ring $A_1$ and ring $A_3$ in Formulae 2-1 and 2-2 may be different from each other.

In an embodiment, a $Y_1$-containing monocyclic group in ring $A_1$, a $Y_2$-containing monocyclic group in ring $A_2$, and a $Y_4$-containing monocyclic group in ring $A_4$ may each be a 6-membered ring.

In an embodiment, a $Y_3$-containing monocyclic group in ring $A_3$ may be a 6-membered ring.

In an embodiment, a $Y_3$-containing monocyclic group in ring $A_3$ may be a 5-membered ring.

In an embodiment, a $Y_1$-containing monocyclic group in ring $A_1$ may be a 6-membered ring, and a $Y_3$-containing monocyclic group in ring $A_3$ may be a 5-membered ring.

In an embodiment, ring $A_1$ and ring $A_3$ in Formulae 2-1 and 2-2 may each independently be i) an A group, ii) a polycyclic group in which two or more A groups are condensed with each other, or iii) a polycyclic group in which at least one A group and at least one B group are condensed with each other, the A group may be a pyridine group, a pyrimidine group, a pyridazine group, a pyrazine group, or a triazine group, and the B group may be a cyclohexane group, a cyclohexene group, a norbornane group, a benzene group, a furan group, a thiophene group, a selenophene group, a pyrrole group, a cyclopentadiene group, or a silole group.

In an embodiment, in Formula 2-2, ring $A_3$ may be i) a C group, ii) a polycyclic group in which two or more C groups are condensed with each other, or iii) a polycyclic group in which at least one C group and at least one D group are condensed with each other, the C group may be a pyrrole group, a pyrazole group, an imidazole group, a triazole group, an oxazole group, an isoxazole group, a thiazole group, or an isothiazole group, and the D group may be a cyclohexane group, a cyclohexene group, a norbornane group, a benzene group, a furan group, a thiophene group, a selenophene group, a cyclopentadiene group, a silole group, a pyridine group, a pyrimidine group, a pyridazine group, a pyrazine group, or a triazine group.

In an embodiment, ring $A_1$ in Formula 2-1 may be:

a pyridine group, a pyrimidine group, a pyridazine group, or a pyrazine group; or a pyridine group, a pyrimidine group, a pyridazine group, or a pyrazine group, each condensed with a cyclohexane group, a norbornane group, a benzene group, or any combination thereof.

In an embodiment, ring $A_3$ in Formula 2-2 may be:

a pyridine group, a pyrimidine group, a pyridazine group, or a pyrazine group;

a pyridine group, a pyrimidine group, a pyridazine group, or a pyrazine group, each condensed with a cyclohexane group, a norbornane group, a benzene group, or any combination thereof; or an imidazole group, a benzimidazole group, a naphthoimidazole group, a phenanthrenoimidazole group, a pyridoimidazole group, an oxazole group, a benzoxazole group, a naphthooxazole group, a phenanthrenooxazole group, a pyridooxazole group, a thiazole group, a benzothiazole group, a naphthothiazole group, a phenanthrenothiazole group, or a pyridothiazole group.

In an embodiment, ring $A_2$ and ring $A_4$ in Formulae 2-1 and 2-2 may be different from each other.

In an embodiment, ring $A_2$ and ring $A_4$ in Formulae 2-1 and 2-2 may each independently be i) an E group, ii) a polycyclic group in which two or more E groups are condensed with each other, or iii) a polycyclic group in which at least one E group and at least one F group are condensed with each other, the E group may be a benzene group, a pyridine group, a pyrimidine group, a pyridazine group, a pyrazine group, or a triazine group, and the F group may be a furan group, a thiophene group, a selenophene group, a pyrrole group, a cyclopentadiene group, a silole group, a pyrazole group, an imidazole group, an oxazole group, a thiazole group, an isoxazole group, or an isothiazole group.

In an embodiment, ring $A_2$ in Formula 2-1 may be a polycyclic group in which two or more E groups and at least one F group are condensed with each other.

In an embodiment, ring $A_4$ in Formula 2-2 may be a polycyclic group in which two or more E groups and at least one F group are condensed with each other.

In an embodiment, ring $A_2$ in Formula 2-1 may be:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with a cyclohexane group, a norbornane group, a benzene group, or any combination thereof.

In an embodiment, ring $A_4$ in Formula 2-2 may be:

a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or a dibenzosilole group; or a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or a dibenzosilole group, each condensed with a benzene group, a pyridine group, a pyrimidine group, a pyridazine group, a pyrazine group, a cyclohexane group, a norbornane group, a furan group, a thiophene group, a selenophene group, a pyrrole group, a cyclopentadiene group, a silole group, a pyrazole group, an imidazole group, an oxazole group, a thiazole group, an isoxazole group, an isothiazole group, or any combination thereof.

$T_{11}$ to $T_{14}$ in Formula 1 may each independently be a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(=O)—*', *—S(=O)—*', *—S(=O)$_2$—*', *—C($R_{5a}$)=*', *=C($R_{5a}$)—*', *—C($R_{5a}$)=C($R_{5b}$)—*', *—C(=S)—*', *—C≡C—*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In an embodiment, $T_{11}$ and $T_{12}$ in Formula 1 may be a single bond, and $T_{13}$ may be a single bond, *—N($R_{5a}$)-*', *—B($R_{5a}$)-*', *—P($R_{5a}$)-*', *—C($R_{5a}$)($R_{5b}$)—*', *—Si($R_{5a}$)($R_{5b}$)—*', *—Ge($R_{5a}$)($R_{5b}$)—*', *—S—*', or *—O—*'.

n1 to n4 in Formula 1 indicate numbers of $T_{11}$ to $T_{14}$, respectively, and may each independently be 0 or 1, wherein three or more of n1 to n4 may each be 1. That is, an organometallic compound represented by Formula 1 may have a tetradentate ligand.

When n1 in Formula 1 is 0, $T_{11}$ may not exist (i.e., ring $CY_1$ and ring $CY_2$ are not connected to each other), when n2 is 0, $T_{12}$ may not exist (i.e., ring $CY_2$ and ring $CY_3$ are not connected to each other), when n3 is 0, $T_{13}$ may not exist (i.e., ring $CY_3$ and ring $CY_4$ are not connected to each other), and when n4 is 0, $T_{14}$ may not exist (i.e., ring $CY_4$ and ring $CY_1$ are not connected to each other).

In an embodiment, n1 to n3 in Formula 1 may each be 1, and n4 may be 0.

$L_1$ to $L_4$ and $W_1$ to $W_4$ in Formulae 1, 2-1, and 2-2 may each independently be a single bond, a $C_1$-$C_{20}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In an embodiment, $L_1$ to $L_4$ and $W_1$ to $W_4$ in Formulae 1, 2-1, and 2-2 may each independently be:

a single bond; or a $C_1$-$C_{20}$ alkylene group, a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In an embodiment, $L_1$ to $L_4$ and $W_1$ to $W_4$ in Formulae 1, 2-1, and 2-2 may each independently be:

a single bond; or a benzene group, a naphthalene group, a pyridine group, a fluorene group, a carbazole group, a dibenzofuran group, or a dibenzothiophene group, each unsubstituted or substituted with at least one $R_{10a}$.

In an embodiment, $L_1$ to $L_4$ and $W_1$ to $W_4$ in Formulae 1, 2-1, and 2-2 may each independently be:

a single bond; or a $C_1$-$C_{20}$ alkylene group, a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

b1 to b4 in Formula 1 indicate number of $L_1$ to $L_4$, respectively, and may each independently be an integer from 1 to 10. When b1 is 2 or more, two or more of $L_1$(s) may be identical to or different from each other, when b2 is 2 or more, two or more of $L_2$(s) may be identical to or different from each other, when b3 is 2 or more, two or more of $L_3$(s) may be identical to or different from each other, and when b4 is 2 or more, two or more of $L_4$(s) may be identical to or different from each other. In an embodiment, b1 to b4 may each independently be 1, 2, or 3.

$R_1$ to $R_4$, $R_{5a}$, $R_{5b}$, R', R", and $Z_1$ to $Z_4$ in Formulae 1, 2-1, and 2-2 may each independently be hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$). $Q_1$ to $Q_9$ are each the same as described in the present specification.

In an embodiment, $R_1$ to $R_4$, $R_{5a}$, $R_{5b}$, R', R", and $Z_1$ to $Z_4$ in Formulae 1, 2-1, and 2-2 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, -$CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (e.g., a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a deuterated phenyl group, a fluorinated phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $-N(Q_1)(Q_2)$, $-Si(Q_3)(Q_4)(Q_5)$, $-Ge(Q_3)(Q_4)(Q_5)$, $-B(Q_6)(Q_7)$, $-P(=O)(Q_8)(Q_9)$, or $-P(Q_8)(Q_9)$, wherein $Q_1$ to $Q_9$ may each independently be:

deuterium, —F, $-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, $-CD_2CDH_2$, $-CF_3$, $-CF_2H$, $-CFH_2$, $-CH_2CF_3$, $-CH_2CF_2H$, $-CH_2CFH_2$, $-CHFCH_3$, $-CHFCF_2H$, $-CHFCFH_2$, $-CHFCF_3$, $-CF_2CF_3$, $-CF_2CF_2H$, or $-CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In an embodiment, $R_1$ to $R_4$, $R_{5a}$, $R_{5b}$, R', R", and $Z_1$ to $Z_4$ in Formulae 1, 2-1, and 2-2 may each independently be:

hydrogen, deuterium, —F, or a cyano group;

a $C_1$-$C_{20}$ alkyl group that is unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ a heterocycloalkyl group, a phenyl group, a biphenyl group, a naphthyl group, a pyridinyl group, a fluorenyl group, a carbazolyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{1a}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or any combination thereof; or $Si(Q_3)(Q_4)(Q_5)$ or —$Ge(Q_3)(Q_4)(Q_5)$.

In an embodiment, e1 and d1 in Formula 2-1 may each not be 0, and at least one of $Z_1$(s) may be a deuterated $C_1$-$C_{20}$ alkyl group, —$Si(Q_3)(Q_4)(Q_5)$, or —$Ge(Q_3)(Q_4)(Q_5)$. $Q_3$ to $Q_5$ are each the same as described in the present specification.

In an embodiment, $Q_3$ to $Q_5$ may each independently be:

a $C_1$-$C_{60}$ alkyl group unsubstituted or substituted with deuterium, a $C_1$-$C_{60}$ alkyl group, a $C_6$-$C_{60}$ aryl group, or any combination thereof; or a $C_6$-$C_{60}$ aryl group unsubstituted or substituted with deuterium, a $C_1$-$C_{60}$ alkyl group, a $C_6$-$C_{60}$ aryl group, or any combination thereof.

In an embodiment, $Q_3$ to $Q_5$ may each independently be:

—$CH_3$, -$CD_3$, -$CD_2H$, -$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, -$CD_2CD_3$, -$CD_2CD_2H$, or -$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In an embodiment, $Q_3$ to $Q_5$ may be identical to each other.

In an embodiment, two or more of $Q_3$ to $Q_5$ may be different from each other.

In an embodiment, the organometallic compound represented by Formula 2 may satisfy at least one of Condition (1) to Condition (8):

Condition (1)

e1 and d1 in Formula 2-1 are each not 0, and at least one $Z_1$(s) includes deuterium;

Condition (2)

e2 and d2 in Formula 2-1 are each not 0, and at least one $Z_2$(s) includes deuterium;

Condition (3)

e3 and d3 in Formula 2-2 are each not 0, and at least one $Z_3$(s) includes deuterium;

Condition (4)

e4 and d4 in Formula 2-2 are each not 0, and at least one $Z_4$(s) includes deuterium;

Condition (5)

e1 and d1 in Formula 2-1 are each not 0, and at least one $Z_1$(s) includes a fluoro; group Condition (6)

e2 and d2 in Formula 2-1 are each not 0, and at least one $Z_2$(s) includes a fluoro group;

Condition (7)

e3 and d3 in Formula 2-2 are each not 0, and at least one $Z_3$(s) includes a fluoro group;

Condition (8)

e4 and d4 in Formula 2-2 are each not 0, and at least one $Z_4$(s) includes a fluoro group.

In an embodiment, $R_1$ to $R_4$, $R_{5a}$, $R_{5b}$, R', R", and $Z_1$, to $Z_4$ in Formulae 1, 2-1, and 2-2 may each independently be hydrogen, deuterium, —F, —$CH_3$, -$CD_3$, -$CD_2H$, -$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-227, a group represented by one of Formulae 9-201 to 9-227 in which at least one hydrogen is substituted with deuterium, a group represented by one of Formulae 9-201 to 9-227 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —$Si(Q_3)(Q_4)(Q_5)$, or —$Ge(Q_3)(Q_4)(Q_5)$(where $Q_3$ to $Q_5$ are each the same as described in the present specification):

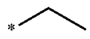

9-1

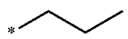

9-2

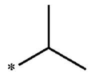

9-3

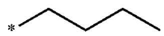

9-4

-continued
9-5
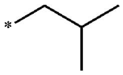
9-6
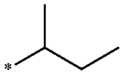
9-7
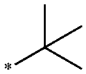
9-8
9-9
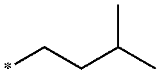
9-10
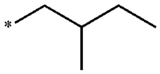
9-11
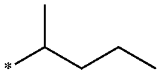
9-12
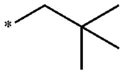
9-13
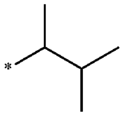
9-14
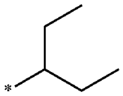
9-15
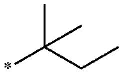
9-16
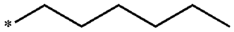
9-17
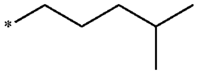
9-18
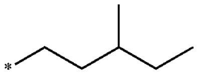
9-19
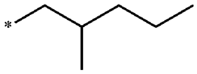
9-20
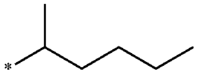
9-21
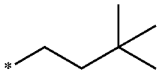
-continued
9-22
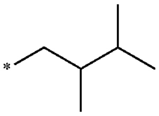
9-23
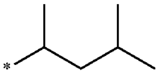
9-24
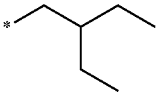
9-25
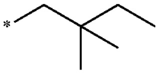
9-26
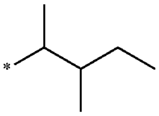
9-27
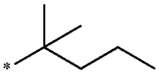
9-28
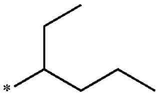
9-29
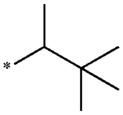
9-30
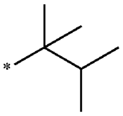
9-31
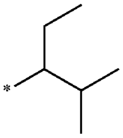
9-32
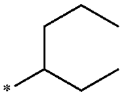
9-33
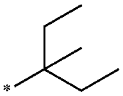
9-34
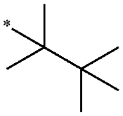
9-35
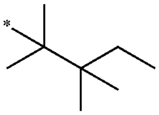

-continued
9-36
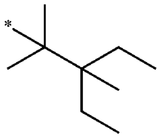
9-37
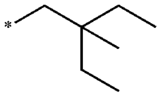
9-38
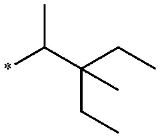
9-39
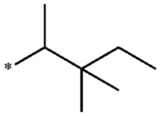
9-201
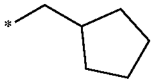
9-202
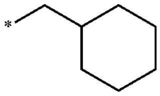
9-203
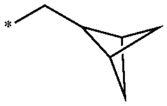
9-204
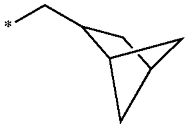
9-205
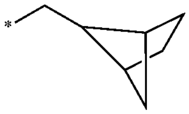
9-206
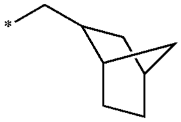
9-207
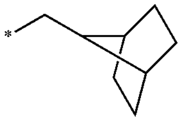
9-208
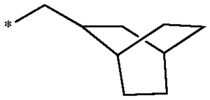
-continued
9-209
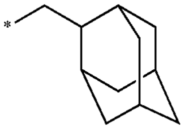
9-210
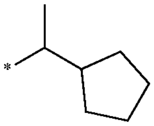
9-211
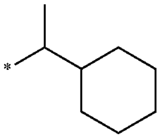
9-212
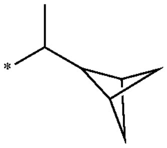
9-213
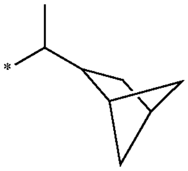
9-214
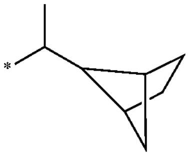
9-215
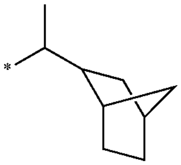
9-216
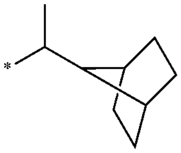
9-217
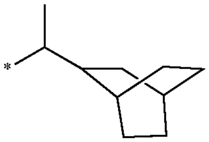
9-218
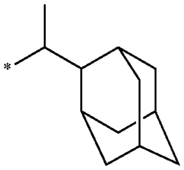

-continued
9-219
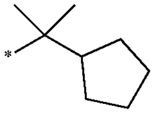
9-220
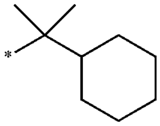
9-221
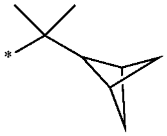
9-222
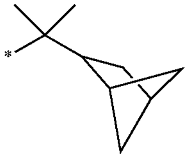
9-223
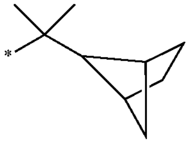
9-224
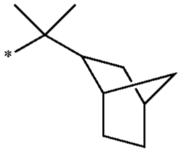
9-225
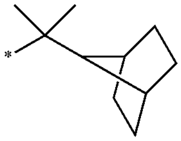
9-226
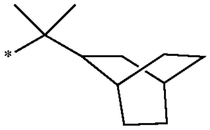
9-227
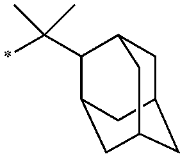
10-1
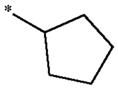
10-2
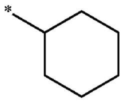
-continued
10-3
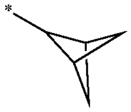
10-4
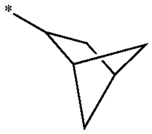
10-5
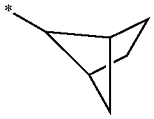
10-6
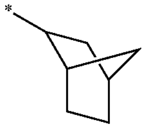
10-7
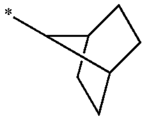
10-8
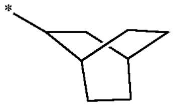
10-9
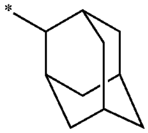
10-10
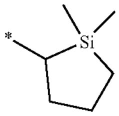
10-11
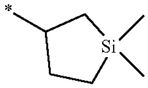
10-12
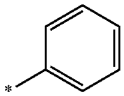
10-13
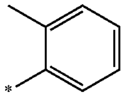
10-14
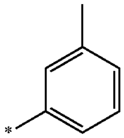

-continued
10-15
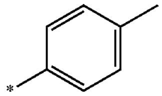
10-16
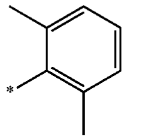
10-17
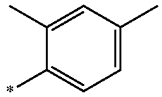
10-18
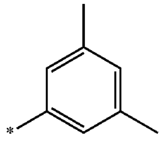
10-19
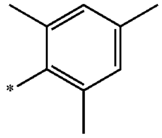
10-20
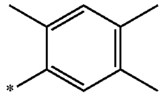
10-21
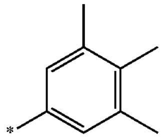
10-22
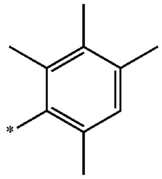
10-23
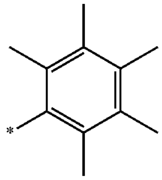
10-24
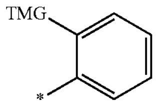
10-25
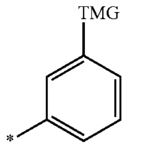
-continued
10-26
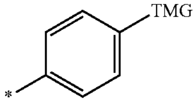
10-27
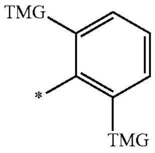
10-28
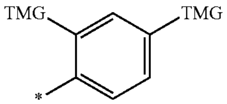
10-29
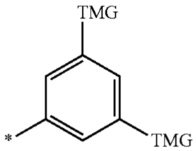
10-30
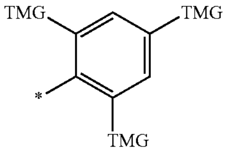
10-31
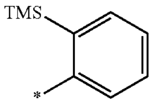
10-32
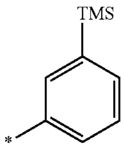
10-33
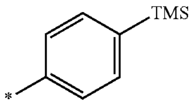
10-34
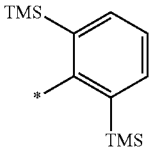
10-35
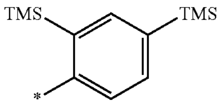
10-36
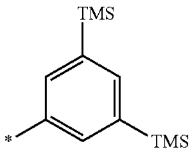

-continued
10-37
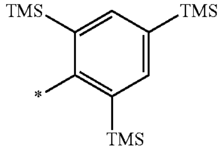
10-38
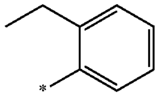
10-39
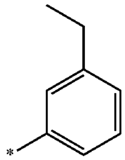
10-40
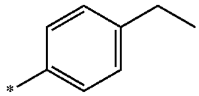
10-41
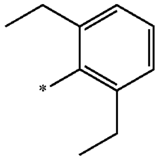
10-42
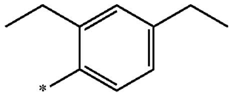
10-43
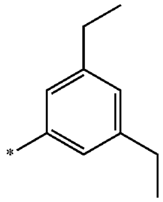
10-44
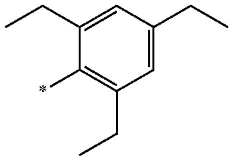
10-45
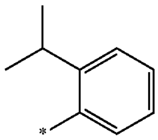
10-46
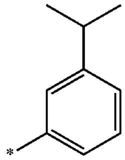
-continued
10-47
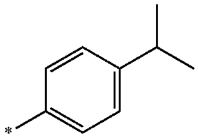
10-48
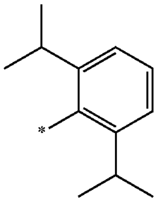
10-49
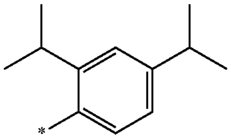
10-50
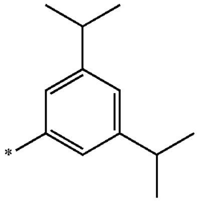
10-51
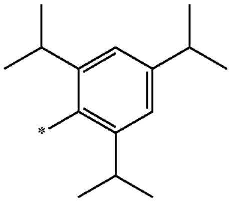
10-52
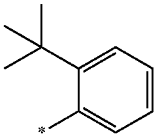
10-53
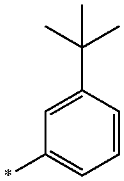
10-54
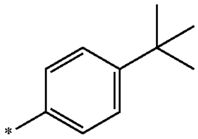

-continued
10-55
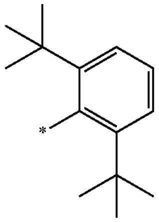
10-56
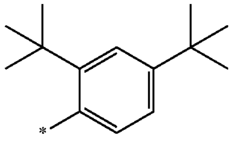
10-57
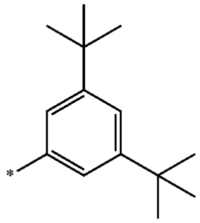
10-58
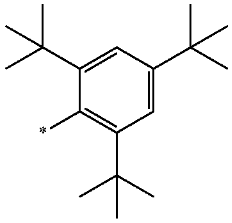
10-59
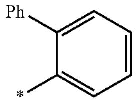
10-60
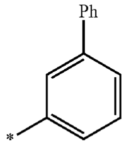
10-61
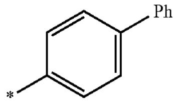
10-62
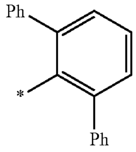
10-63
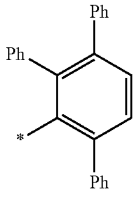
-continued
10-64
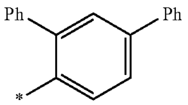
10-65
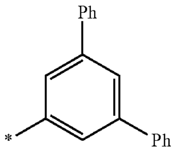
10-66
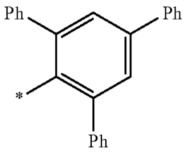
10-67
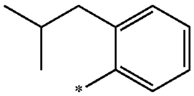
10-68
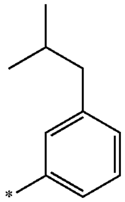
10-69
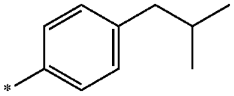
10-70
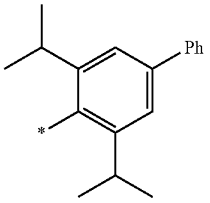
10-71
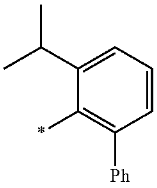
10-72
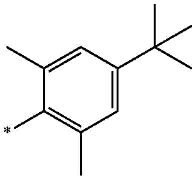

-continued
10-73
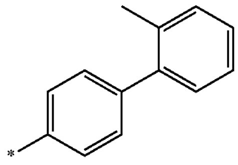
10-74
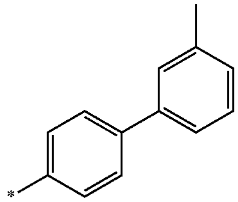
10-75
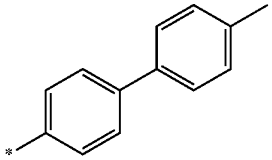
10-76
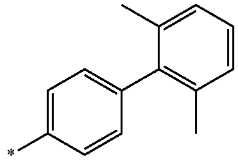
10-77
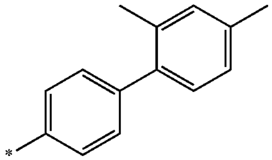
10-78
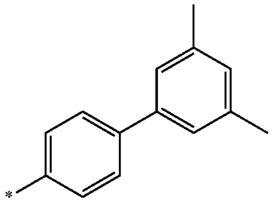
10-79
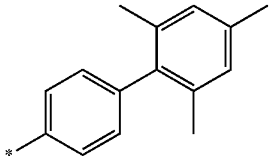
10-80
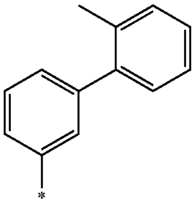
-continued
10-81
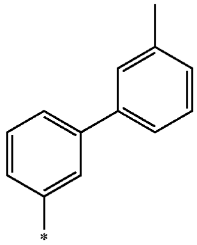
10-82
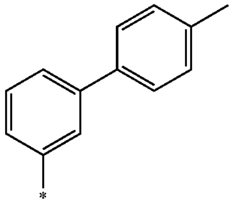
10-83
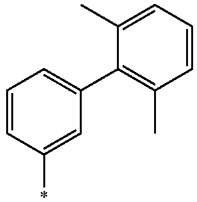
10-84
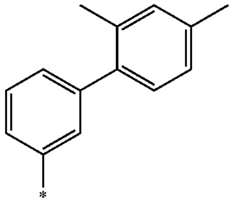
10-85
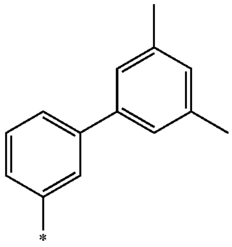
10-86
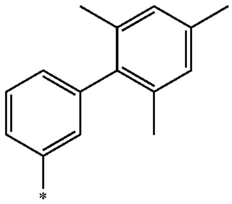
10-87
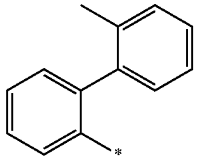

-continued
10-88
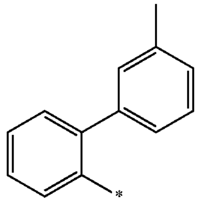
10-89
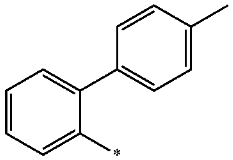
10-90
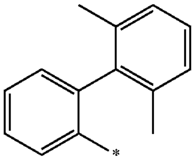
10-91
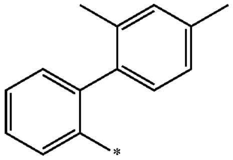
10-92
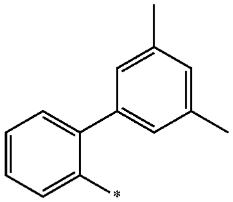
10-93
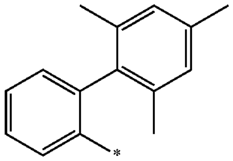
10-94
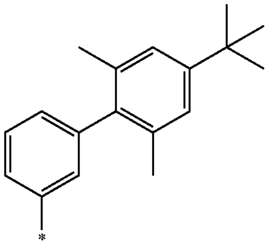
10-95
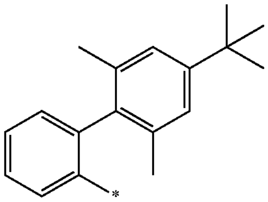
-continued
10-96
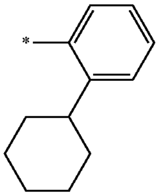
10-97
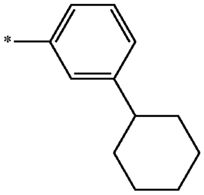
10-98
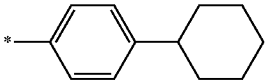
10-99
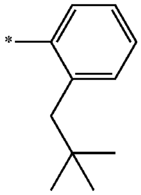
10-100
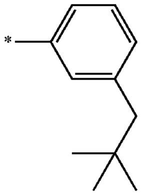
10-101
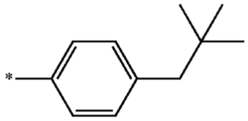
10-102
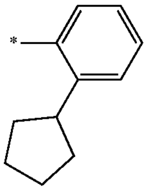
10-103
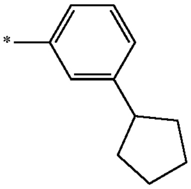
10-104
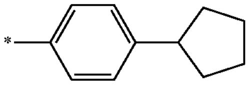

-continued
10-105
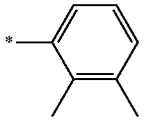
10-106
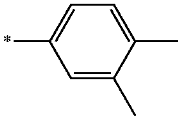
10-107
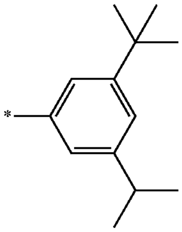
10-108
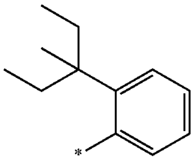
10-109
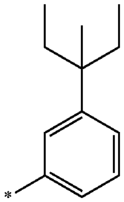
10-110
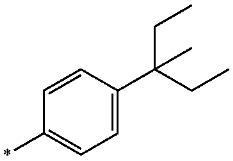
10-111
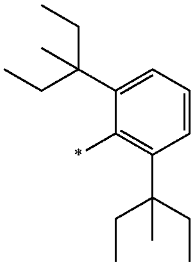
10-112
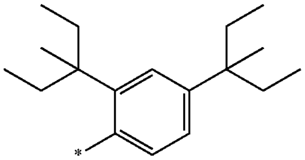
-continued
10-113
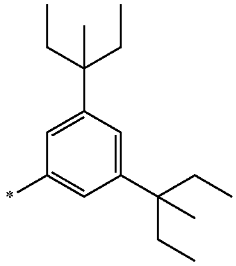
10-114
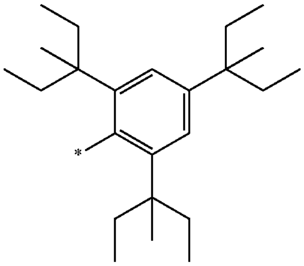
10-115
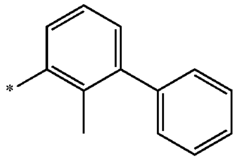
10-116
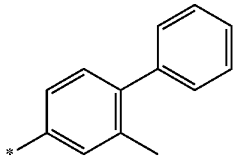
10-117
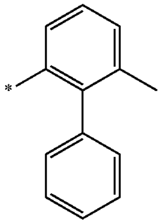
10-118
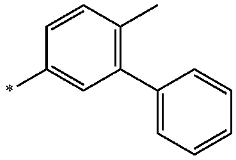
10-119
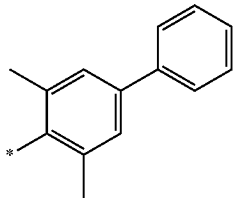

-continued
10-120
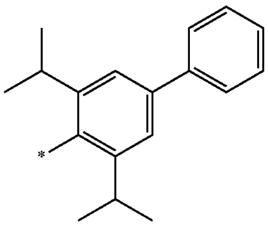
10-121
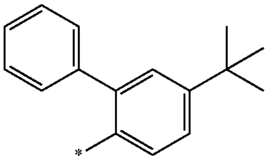
10-122
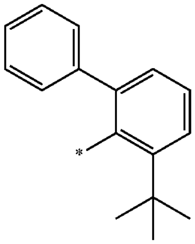
10-123
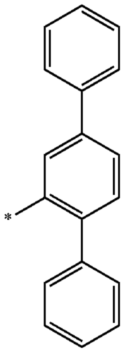
10-124
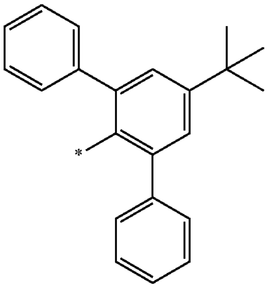
10-125
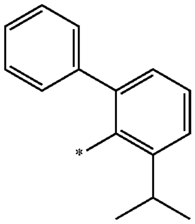
-continued
10-126
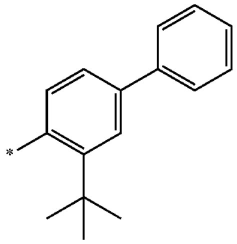
10-127
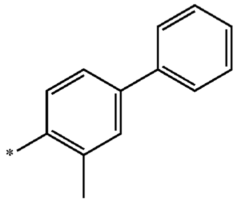
10-128
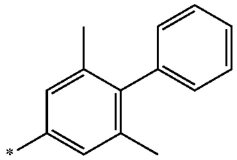
10-129
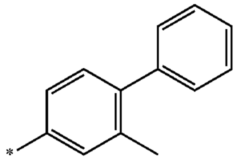
10-201
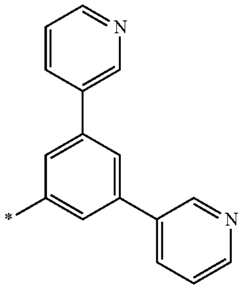
10-202
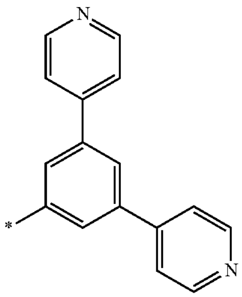

-continued
10-203
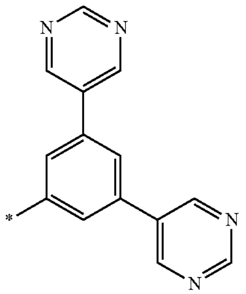
10-204
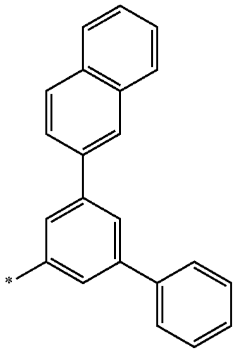
10-205
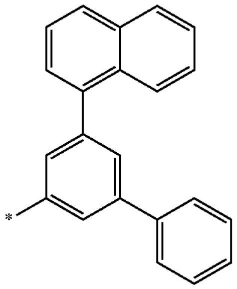
10-206
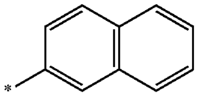
10-207
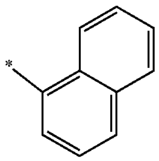
10-208
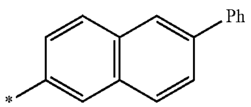
10-209
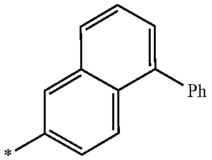
-continued
10-210
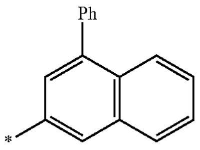
10-211
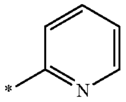
10-212
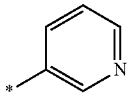
10-213
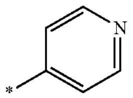
10-214
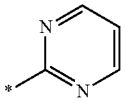
10-215
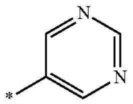
10-216
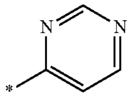
10-217
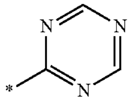
10-218
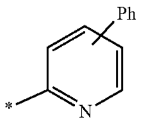
10-219
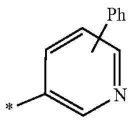
10-220
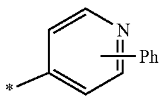
10-221
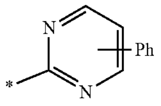
10-222
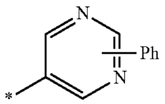

-continued
10-223
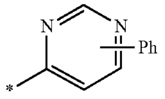
10-224
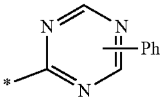
10-225
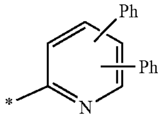
10-226
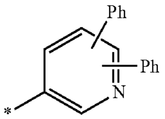
10-227
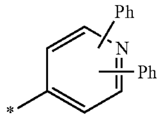
10-228
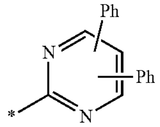
10-229
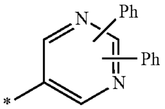
10-230
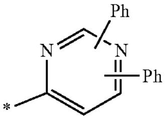
10-231
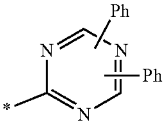
10-232
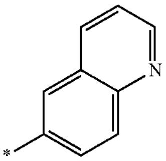
10-233
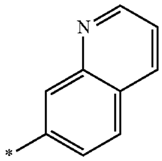
-continued
10-234
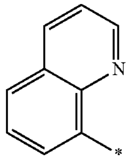
10-235
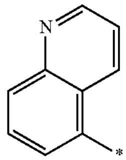
10-236
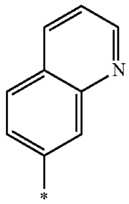
10-237
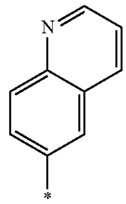
10-238
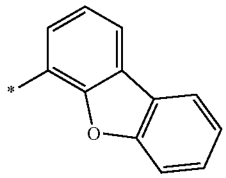
10-239
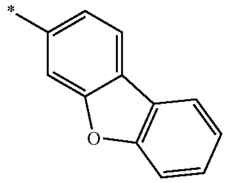
10-240
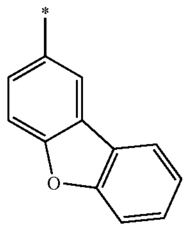
10-241
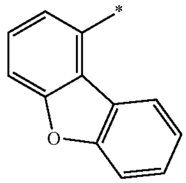

-continued
10-242
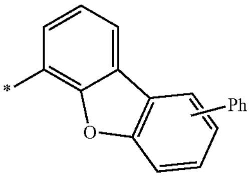
10-243
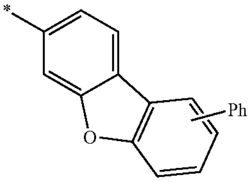
10-244
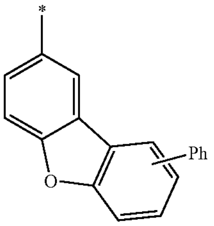
10-245
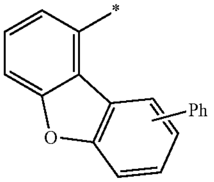
10-246
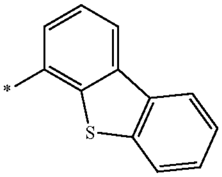
10-247
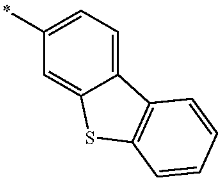
10-248
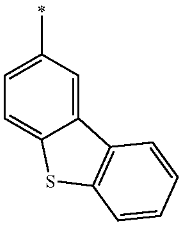
10-249
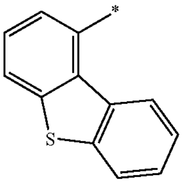
-continued
10-250
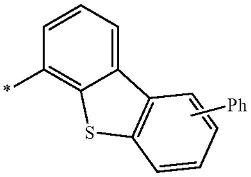
10-251
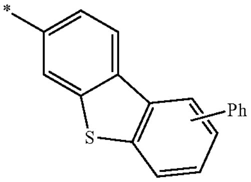
10-252
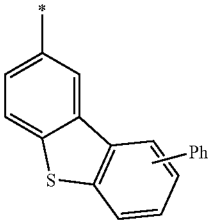
10-253
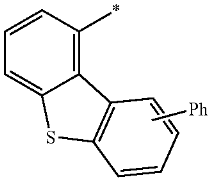
10-254
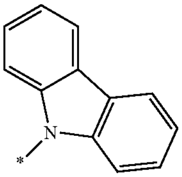
10-255
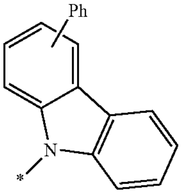
10-256
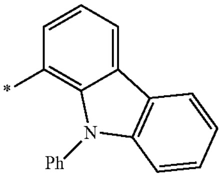
10-257
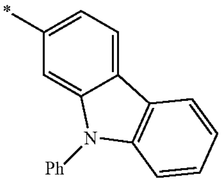

-continued
10-258
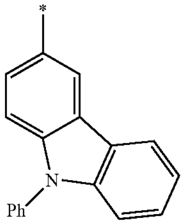
10-259
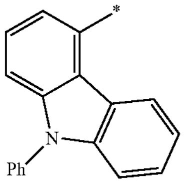
10-260
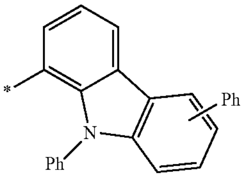
10-261
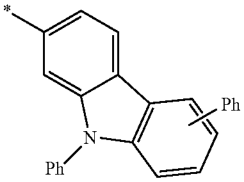
10-262
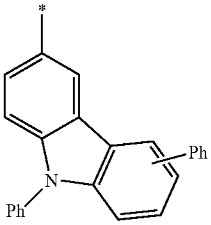
10-263
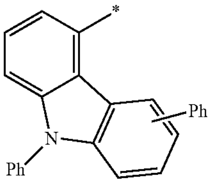
10-264
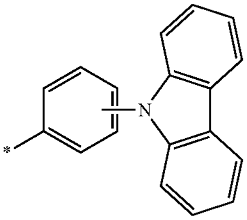
-continued
10-265
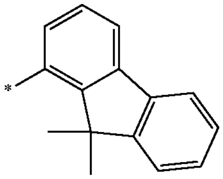
10-266
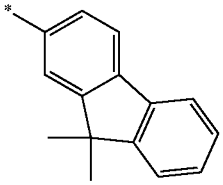
10-267
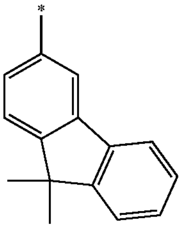
10-268
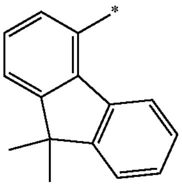
10-269
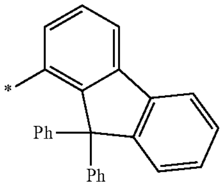
10-270
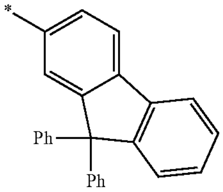
10-271
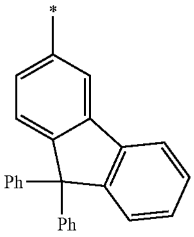

-continued
10-272
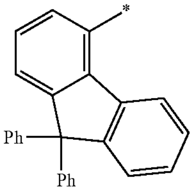
10-273
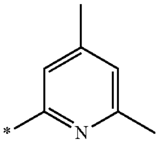
10-274
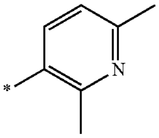
10-275
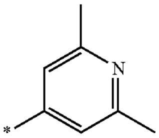
10-276
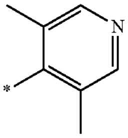
10-277
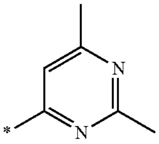
10-278
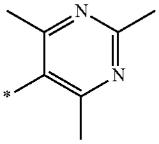
10-279
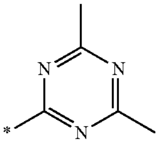
10-280
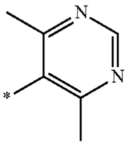
10-281
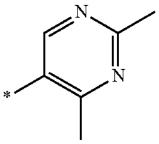
-continued
10-282
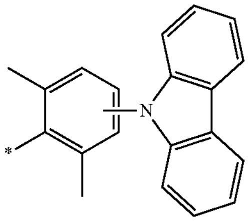
10-283
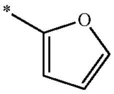
10-284
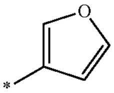
10-285
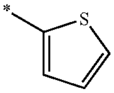
10-286
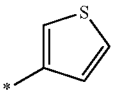
10-287
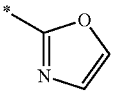
10-288
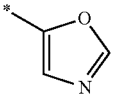
10-289
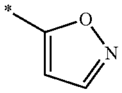
10-290
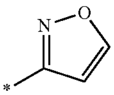
10-291
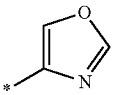
10-292
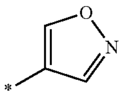
10-293
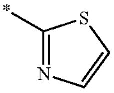
10-294
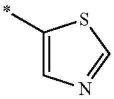

-continued
10-295
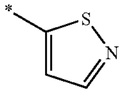
10-296
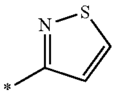
10-297
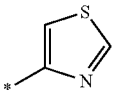
10-298
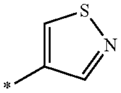
10-299
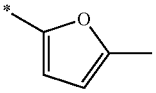
10-300
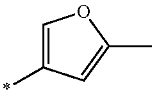
10-301
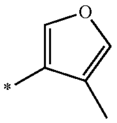
10-302
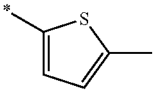
10-303
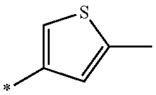
10-304
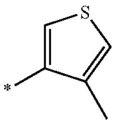
10-305
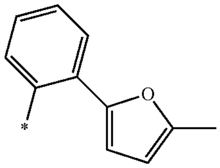
10-306
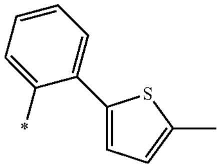
-continued
10-307
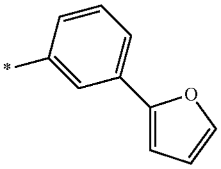
10-308
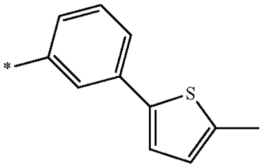
10-309
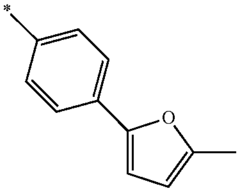
10-310
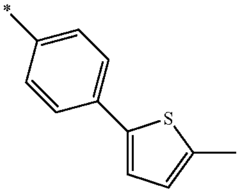
10-311
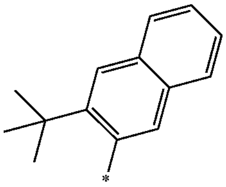
10-312
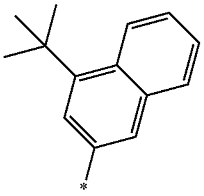
10-313
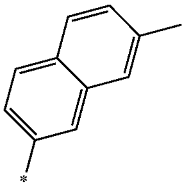
10-314
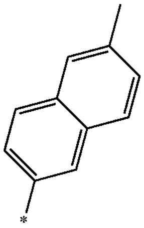

-continued
10-315
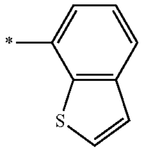
10-316
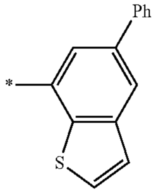
10-317
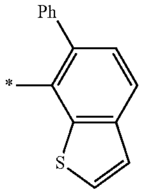
10-318
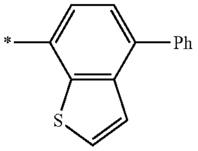
10-319
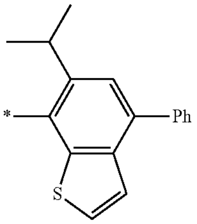
10-320
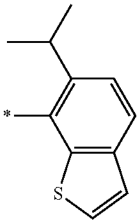
10-321
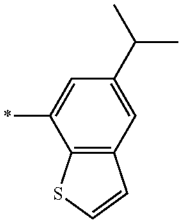
10-322
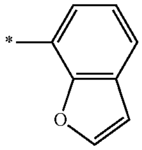
-continued
10-323
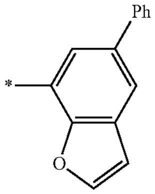
10-324
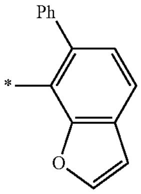
10-325
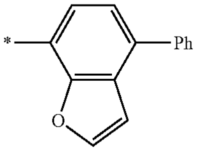
10-326
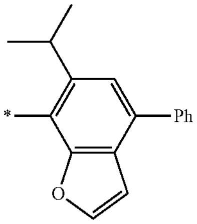
10-327
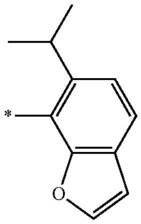
10-328
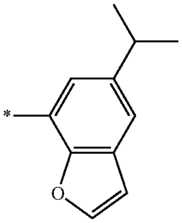
10-329
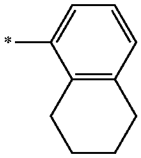
10-300
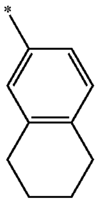

-continued
10-331
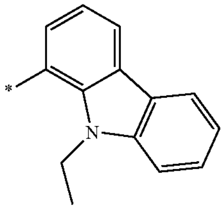
10-332
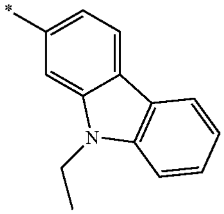
10-333
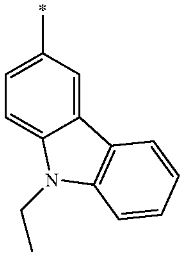
10-334
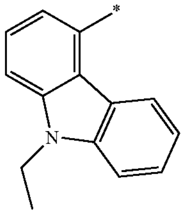
10-335
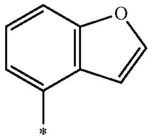
10-336
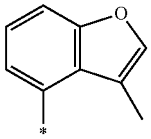
10-337
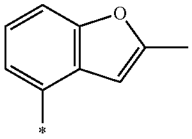
10-338
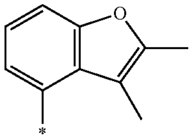
-continued
10-339
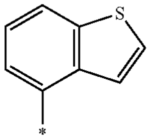
10-340
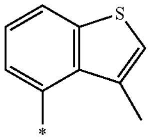
10-341
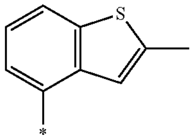
10-342
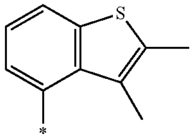
10-343
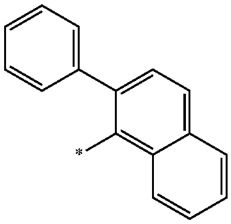
10-344
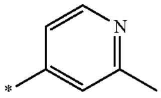
10-345
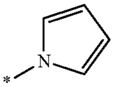
10-346
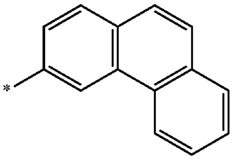
10-347
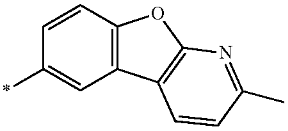
10-348
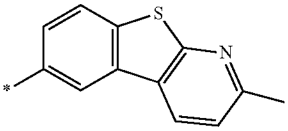

-continued 10-349

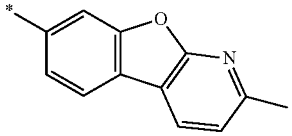

10-350

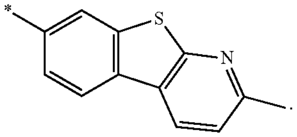

In Formulae 9-1 to 9-39, 9-201 to 9-227, 10-1 to 10-129, and 10-201 to 10-350, * indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-227 in which at least one hydrogen is substituted with deuterium" may be, for example, a group represented by one of Formulae 9-501 to 9-514 and 9-601 to 9-636:

9-501

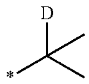

9-502

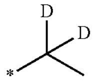

9-503

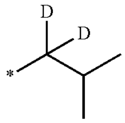

9-504

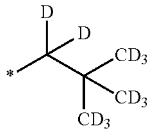

9-505

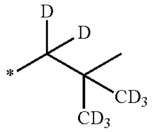

9-506

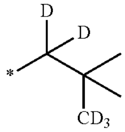

9-507

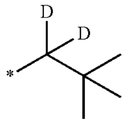

9-508

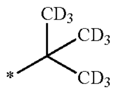

-continued 9-509

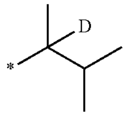

9-510

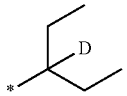

9-511

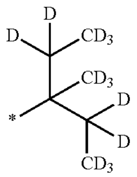

9-512

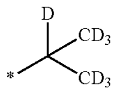

9-513

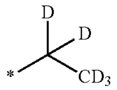

9-514

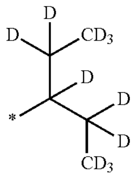

9-601

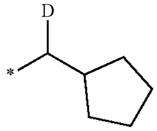

9-602

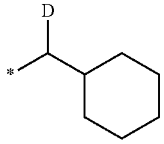

9-603

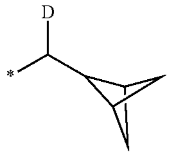

9-604

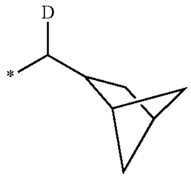

-continued
9-605
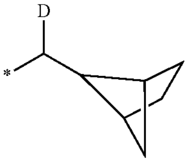
9-606
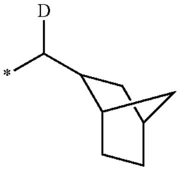
9-607
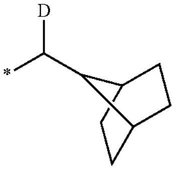
9-608
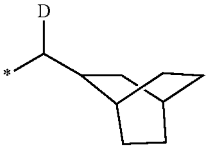
9-609
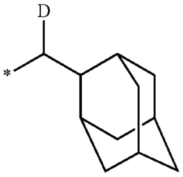
9-610
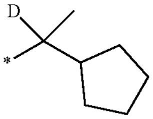
9-611
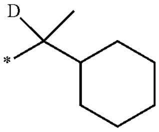
9-612
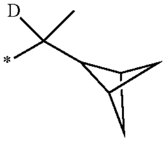
9-613
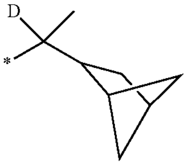
-continued
9-614
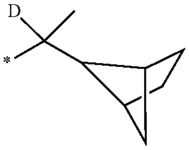
9-615
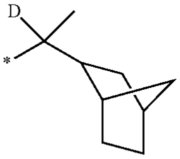
9-616
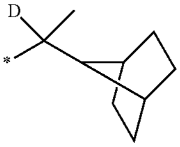
9-617
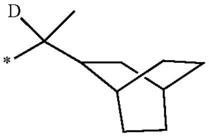
9-618
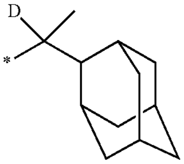
9-619
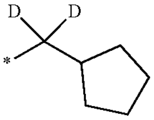
9-620
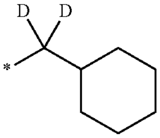
9-621
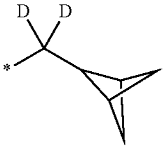
9-622
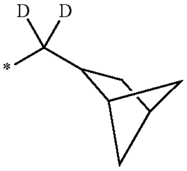
9-623
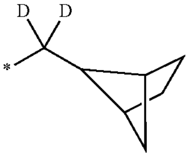

-continued
9-624
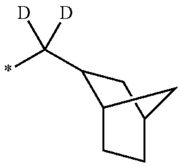
9-625
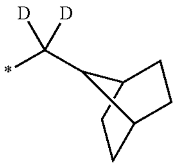
9-626
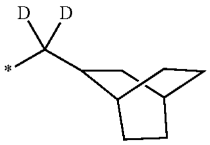
9-627
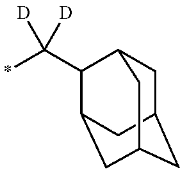
9-628
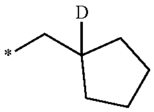
9-629
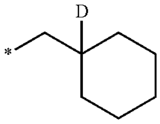
9-630
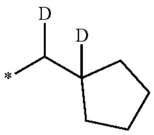
9-631
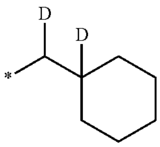
9-632
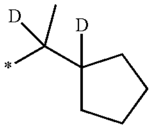
9-633
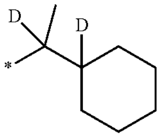
-continued
9-634
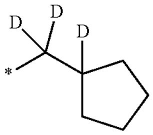
9-635
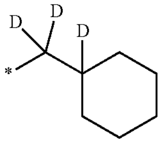
9-636
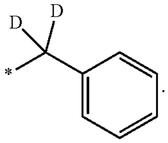
The "group represented by one of Formulae 9-1 to 9-39 in which at least one hydrogen is substituted with —F" and the "group represented by one of Formulae 9-201 to 9-227 in which at least one hydrogen is substituted with —F" may be, for example, a group represented by one of Formulae 9-701 to 9-710:
9-701
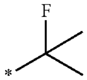
9-702
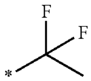
9-703
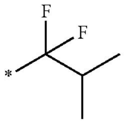
9-704
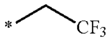
9-705
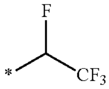
9-706
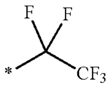
9-707
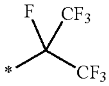
9-708
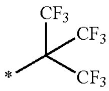
9-709
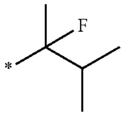

-continued
9-710
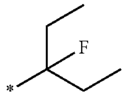
The "group represented by one of Formulae 10-1 to 10-129 in which at least one hydrogen is substituted with deuterium" and the "group represented by one of Formulae 10-201 to 10-350 in which at least one hydrogen is substituted with deuterium" may be, for example, a group represented by one of Formulae 10-501 to 10-553:
10-501
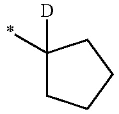
10-502
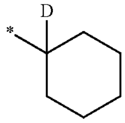
10-503
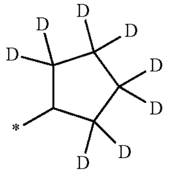
10-504
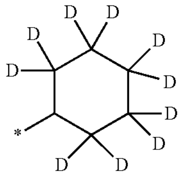
10-505
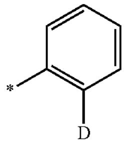
10-506
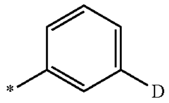
10-507
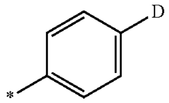
10-508
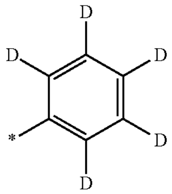
-continued
10-509
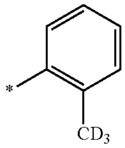
10-510
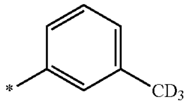
10-511
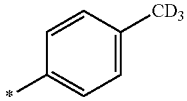
10-512
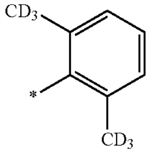
10-513
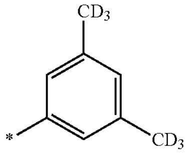
10-514
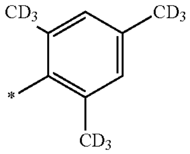
10-515
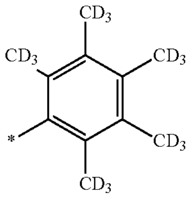
10-516
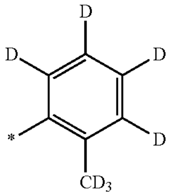
10-517
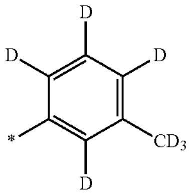

-continued
10-518
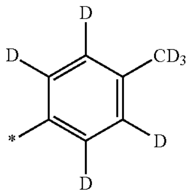
10-519
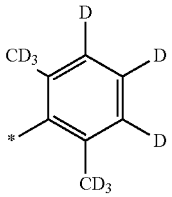
10-520
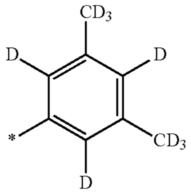
10-521
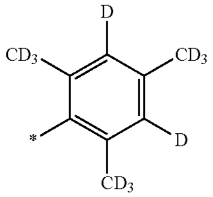
10-522
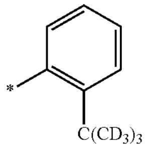
10-523
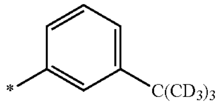
10-524
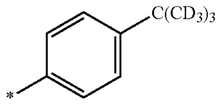
10-525
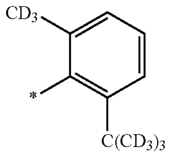
10-526
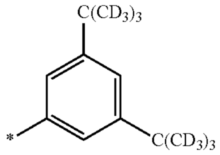
-continued
10-527
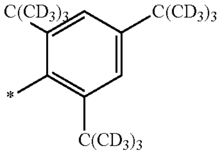
10-528
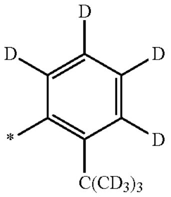
10-529
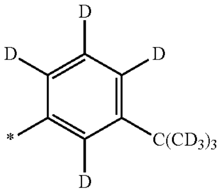
10-530
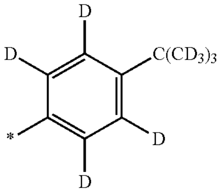
10-531
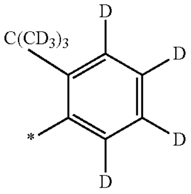
10-532
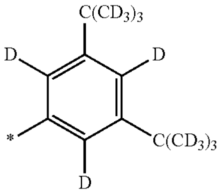
10-533
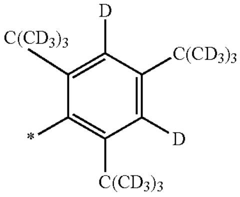
10-534
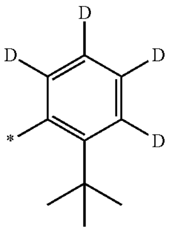

-continued
10-535
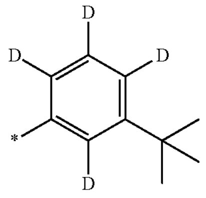
10-536
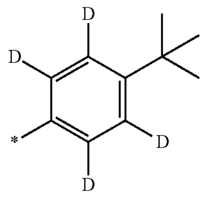
10-537
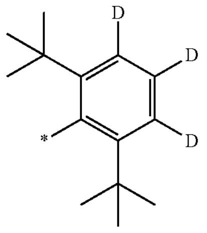
10-538
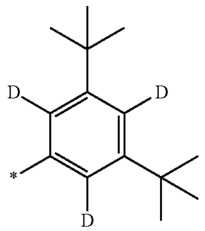
10-540
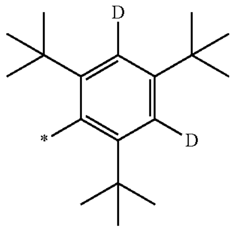
10-541
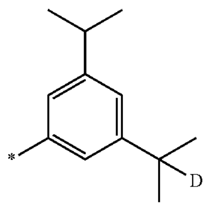
10-542
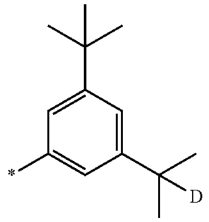
-continued
10-543
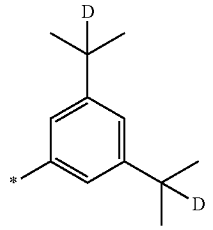
10-544
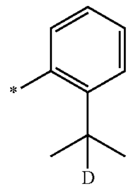
10-545
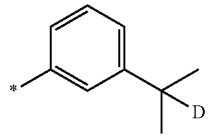
10-546
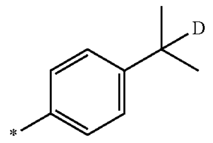
10-547
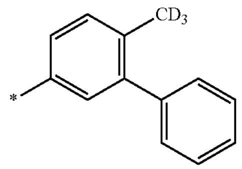
10-548
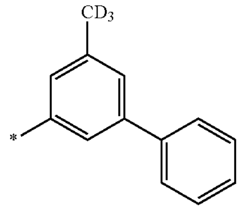
10-549
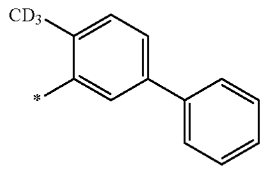
10-550
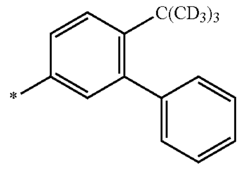

-continued
10-551
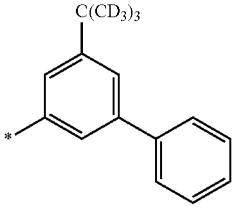
10-552
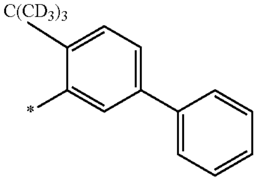
10-553
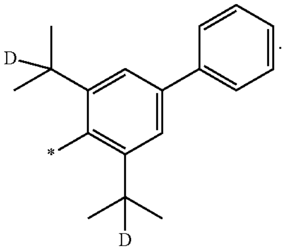
The “group represented by one of Formulae 10-1 to 10-129 in which at least one hydrogen is substituted with —F” and the “group represented by one of Formulae 10-201 to 10-350 in which at least one hydrogen is substituted with —F” may be, for example, a group represented by one of Formulae 10-601 to 10-617:
10-601
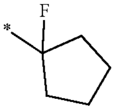
10-602
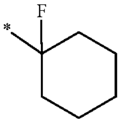
10-603
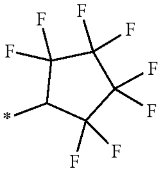
10-604
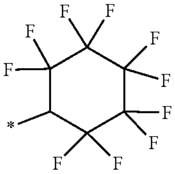
-continued
10-605
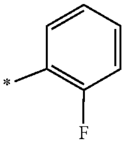
10-606
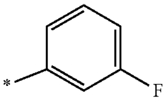
10-607
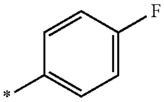
60-608
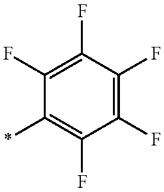
10-609
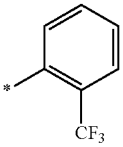
10-610
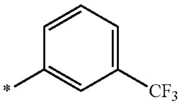
10-611
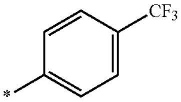
10-612
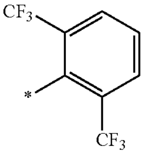
10-613
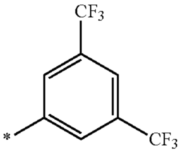
10-614
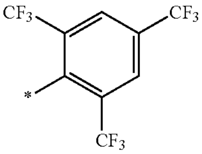

-continued 10-615

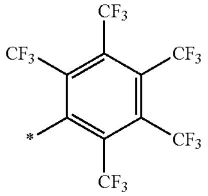

10-616

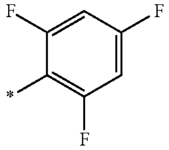

10-617

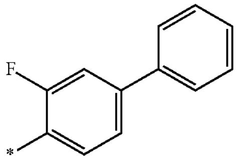

c1 to c4, a1 to a4, e1 to e4, and d1 to d4 in Formulae 1, 2-1, and 2-2 indicate numbers of $R_1$ to $R_4$, a group represented by *-[$(L_1)_{b1}$—$(R_1)_{c1}$], a group represented by *-[$(L_2)_{b2}$—$(R_2)_{c2}$], a group represented by *-[$(L_3)_{b3}$—$(R_3)_{c3}$], a group represented by *-[$(L_4)_{b4}$-$(R_4)_{c4}$], $Z_1$ to $Z_4$, a group represented by *—[$W_1$—$(Z_1)_{e1}$], a group represented by *—[$W_2$—$(Z_2)_{e2}$], a group represented by *—[$W_3$—$(Z_3)_{e3}$], and a group represented by *—[$W_4$—$(Z_4)_{e4}$], respectively, and may each independently be an integer from 0 to 20. When c1 is 2 or more, two or more of $R_1$(s) may be identical to or different from each other, when c2 is 2 or more, two or more of $R_2$(s) may be identical to or different from each other, when c3 is 2 or more, two or more of $R_3$(s) may be identical to or different from each other, when c4 is 2 or more, two or more of $R_4$(s) may be identical to or different from each other, when a1 is 2 or more, two or more of groups represented by *-[$(L_1)_{b1}$—$(R_1)_{c1}$] may be identical to or different from each other, when a2 is 2 or more, two or more of groups represented by *-[$(L_2)_{b2}$—$(R_2)_{c2}$] may be identical to or different from each other, when a3 is 2 or more, two or more of groups represented by *-[$(L_3)_{b3}$—$(R_3)_{c3}$] may be identical to or different from each other, when a4 is 2 or more, two or more of groups represented by *-[$(L_4)_{b4}$—$(R_1)_{c4}$] may be identical to or different from each other, when e1 is 2 or more, two or more of $Z_1$(s) may be identical to or different from each other, when e2 is 2 or more, two or more of $Z_2$(s) may be identical to or different from each other, when e3 is 2 or more, two or more of $Z_3$(s) may be identical to or different from each other, when e4 is 2 or more, two or more of $Z_4$(s) may be identical to or different from each other, when d1 is 2 or more, two or more of groups represented by *—[$W_1$—$(Z_1)_{e1}$] may be identical to or different from each other, when d2 is 2 or more, two or more of groups represented by *—[$W_2$—$(Z_2)_{e2}$] may be identical to or different from each other, when d3 is 2 or more, two or more of groups represented by *—[$W_3$—$(Z_3)_{e3}$] may be identical to or different from each other, and when d4 is 2 or more, two or more of groups represented by *—[$W_4$—$(Z_4)_{e1}$] may be identical to or different from each other. In an embodiment, c1 to c4, a1 to a4, e1 to e4, and d1 to d4 in Formulae 1, 2-1, and 2-2 may each independently be 0, 1, 2, or 3.

In an embodiment, the first compound and the second compound may each not be tris[2-phenyl pyridine]iridium.

In an embodiment, in Formula 2-1, a case where $Y_1$ is N, ring $A_1$ is a pyridine group, $Y_2$ is C, ring $A_2$ is a benzene group, and d1 and d2 are each 0 may be excluded.

In Formulae 1, 2-1, and 2-2, at least one of i) two or more of a plurality of $R_1$(s), ii) two or more of a plurality of $R_2$(s), iii) two or more of a plurality of $R_3$(s), iv) two or more of a plurality of $R_4$(s), v) $R_{5a}$ and $R_{5b}$, vi) two or more of a plurality of $Z_1$(s), vii) two or more of a plurality of $Z_2$(s), viii) two or more of a plurality of $Z_3$(s), ix) two or more of a plurality of $Z_4$(s), x) two or more of $R_1$ to $R_4$, $R_{5a}$, and $R_{5b}$, and xi) two or more of $Z_1$ to $Z_4$ may each optionally bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ may be the same as described in connection with $R_1$.

and *' in the present specification each indicate a binding site to a neighboring atom, unless otherwise stated.

In an embodiment, in Formula 1, n1 may not be 0, n4 may be 0, and a group represented by

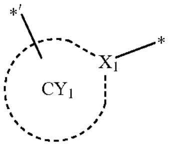

may be a group represented by one of Formulae CY1(1) to CY1(23):

CY1(1)

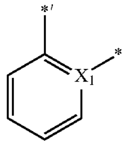

CY1(2)

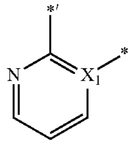

CY1(3)

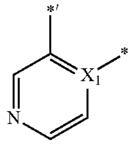

CY1(4)

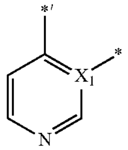

-continued
CY1(5)
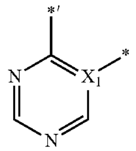
CY1(6)
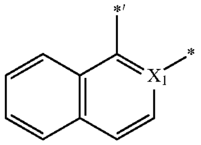
CY1(7)
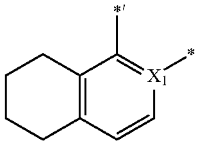
CY1(8)
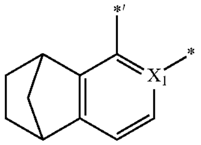
CY1(9)
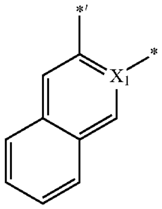
CY1(10)
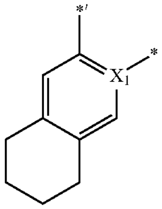
CY1(11)
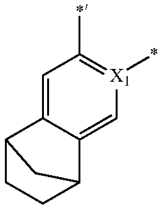
CY1(12)
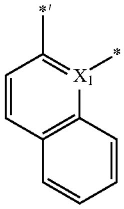
-continued
CY1(13)
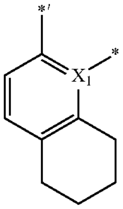
CY1(14)
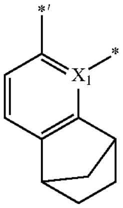
CY1(15)
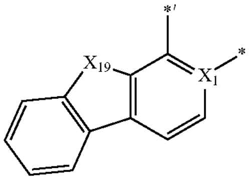
CY1(16)
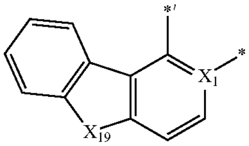
CY1(17)
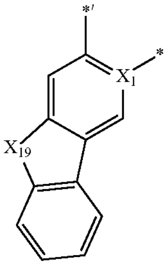
CY1(18)
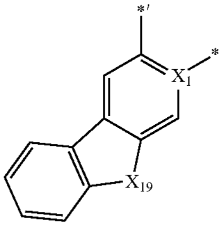
CY1(19)
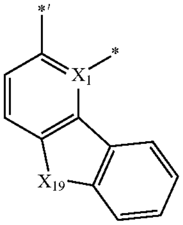

-continued

CY1(20)

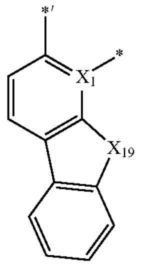

CY1(21)

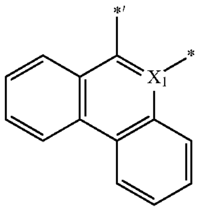

CY1(22)

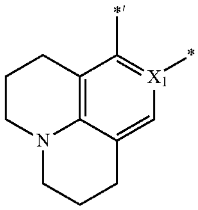

CY1(23)

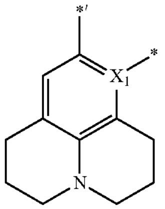

wherein, in Formulae CY1(1) to CY1(23), $X_1$ is the same as described in the present specification, $X_{19}$ may be O, S, Se, $N(R_{19a})$, $C(R_{19a})(R_{19b})$, or $Si(R_{19a})(R_{19b})$, $R_{19a}$ and $R_{19b}$ are each the same as described in connection with $R_1$ in the present specification,

* indicates a binding site to $X_5$ in Formula 1, and

*' indicates a binding site to $T_{11}$ in Formula 1.

In an embodiment, in Formula 1, n1 may be 1, n4 may be 0, and a group represented by

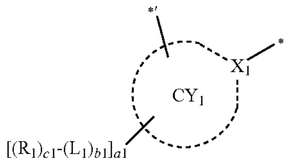

may be a group represented by one of Formulae CY1-1 to CY1-18:

CY1-1

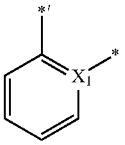

CY1-2

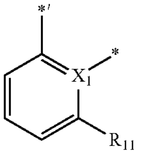

CY1-3

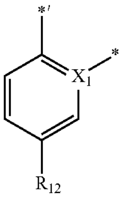

CY1-4

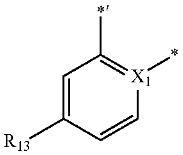

CY1-5

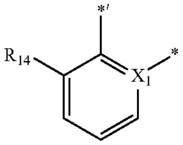

CY1-6

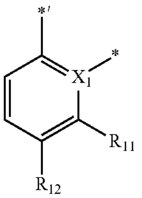

CY1-7

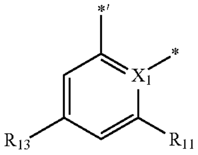

CY1-8

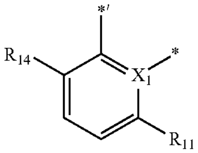

CY1-9

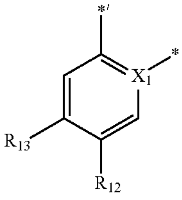

-continued

CY1-10

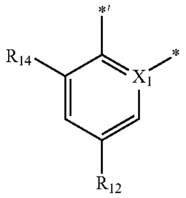

CY1-11

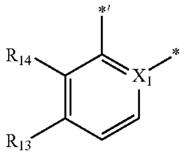

CY1-12

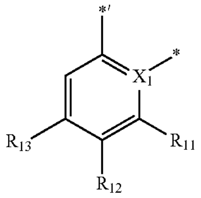

CY1-13

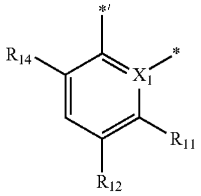

CY1-14

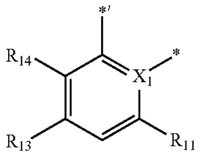

CY1-15

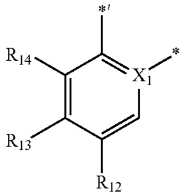

CY1-16

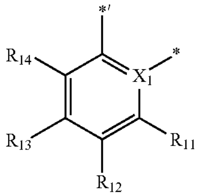

CY1-17

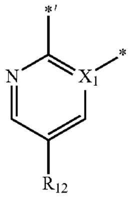

-continued

CY1-18

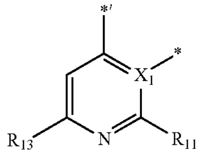

wherein, in Formulae CY1-1 to CY1-18, $X_1$ is the same as described above, $R_{11}$ to $R_{14}$ are each the same as described in connection with $R_1$ in the present specification, wherein $R_{11}$ to $R_{14}$ are each not hydrogen,

* indicates a binding site to $X_5$ in Formula 1, and

*' indicates a binding site to $T_{11}$ in Formula 1.

In an embodiment, in Formula 1, n1 and n2 may each be 1, and ring $CY_2$ may be a group represented by Formula CY2A or CY2B:

CY2A

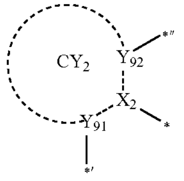

CY2B

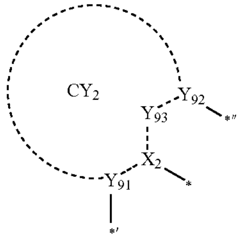

wherein, in Formulae CY2A and CY2B, $X_2$ and ring $CY_2$ are each the same as described in the present specification, $Y_{91}$ to $Y_{93}$ may each independently be O, S, N, C, or Si, a bond between $X_2$ and $Y_{91}$, a bond between $X_2$ and $Y_{92}$, a bond between $X_2$ and $Y_{93}$, and a bond between $Y_{92}$ and $Y_{93}$ are each a chemical bond,

*' indicates a binding site to $T_{11}$ in Formula 1,

* indicates a binding site to $M_1$ in Formula 1, and

* indicates a binding site to $T_{12}$ in Formula 1.

In an embodiment, in Formula 1, n1 and n2 may each not be 0, and a group represented by

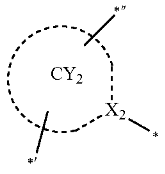

may be a group represented by one of Formulae CY2(1) to CY2(21):

CY2(1)
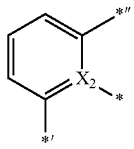
CY2(2)
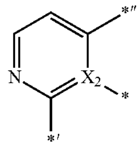
CY2(3)
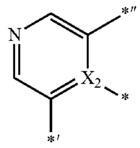
CY2(4)
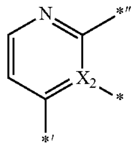
CY2(5)
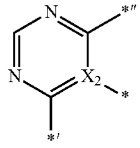
CY2(6)
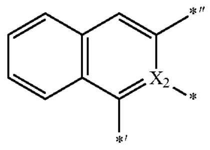
CY2(7)
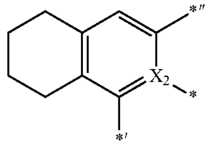
CY2(8)
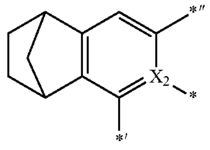
CY2(9)
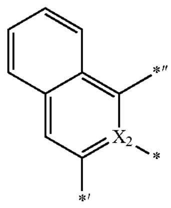
-continued
CY2(10)
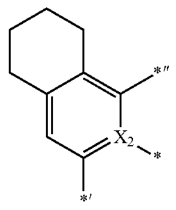
CY2(11)
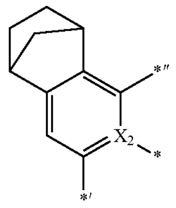
CY2(12)
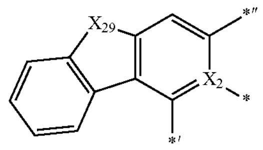
CY2(13)
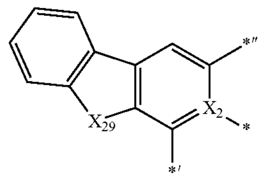
CY2(14)
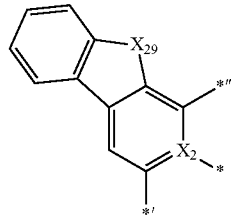
CY2(15)
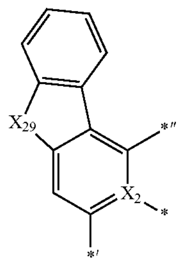
CY2(16)
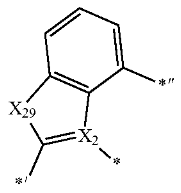

-continued

CY2(17)

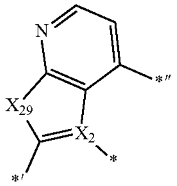

CY2(18)

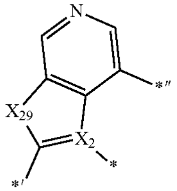

CY2(19)

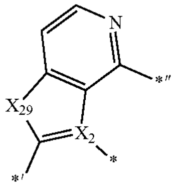

CY2(20)

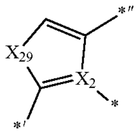

CY2(21)

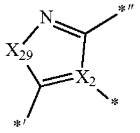

wherein, in Formulae CY2(1) to CY2(21), $X_2$ is the same as described in the present specification, $X_{29}$ may be O, S, N-[$(L_2)_{b2}$—$(R_2)_{c2}$], C($R_{29a}$)($R_{29b}$), or Si($R_{29a}$)($R_{29b}$), $L_2$, b2, $R_2$, and c2 are each the same as described in the present specification, $R_{29a}$ and $R_{29b}$ are each the same as described in connection with $R_2$ in the present specification,

*' indicates a binding site to $T_{11}$ in Formula 1,

* indicates a binding site to $M_1$ in Formula 1, and

*" is a binding site to $T_{12}$ in Formula 1.

In an embodiment, in Formula 1, n1 and n2 may each be 1, and a group represented by

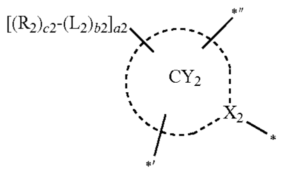

may be a group represented by one of Formulae CY2-1 to CY2-16:

CY2-1

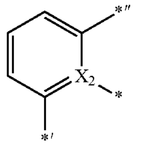

CY2-2

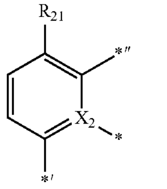

CY2-3

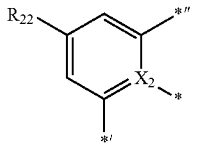

CY2-4

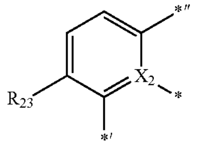

CY2-5

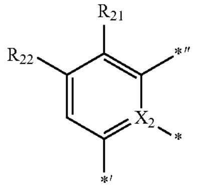

CY2-6

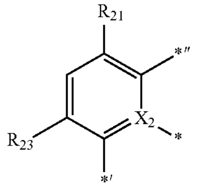

CY2-7

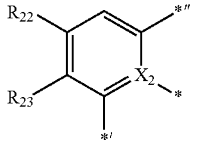

CY2-8

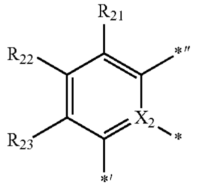

CY2-9

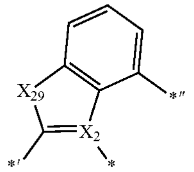

-continued

CY2-10

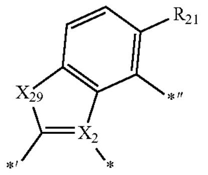

CY2-11

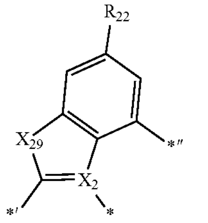

CY2-12

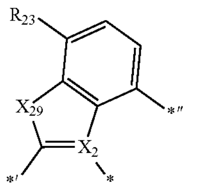

CY2-13

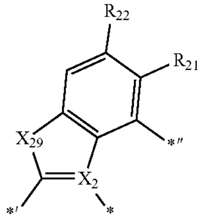

CY2-14

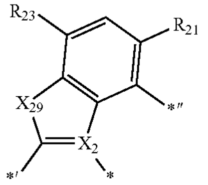

CY2-15

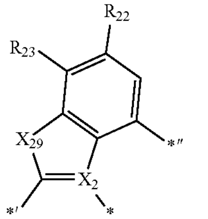

CY2-16

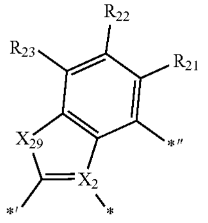

wherein, in Formulae CY2-1 to CY2-16, $X_2$ is the same as described in the present specification, $X_{29}$ may be O, S, N-[$(L_2)_{b2}$-$(R_2)_{c2}$], C($R_{29a}$)($R_{29b}$), or Si($R_{29a}$)($R_{29b}$), $L_2$, b2, $R_2$, and c2 are each the same as described in the present specification, $R_{21}$ to $R_{23}$, $R_{29a}$, and $R_{29b}$ are each the same as described in connection with $R_2$ in the present specification, wherein $R_{21}$ to $R_{23}$ are each not hydrogen,

*' indicates a binding site to $T_{11}$ in Formula 1,

* indicates a binding site to $M_1$ in Formula 1, and

*" is a binding site to $T_{12}$ in Formula 1.

In an embodiment, in Formula 1, n1 and n2 may each be 1, a group represented by

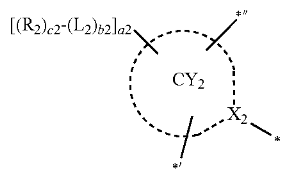

may be a group represented by one of Formulae CY2-9 to CY2-16, $X_{29}$ in Formulae CY2-9 to CY2-16 may be N-[$(L_2)_{b2}$-$(R_2)_{c2}$], $L_2$ may be a benzene group unsubstituted or substituted with at least one $R_{10a}$, b2 may be 1 or 2, c2 may be 1 or 2, and when c2 is 1, $R_2$ may be a phenyl group unsubstituted or substituted with deuterium, a $C_1$-$C_{20}$ alkyl group, or a combination thereof; and when c2 is 2, a) one of two $R_2$(s) may be a phenyl group substituted or unsubstituted with deuterium, a $C_1$-$C_{20}$ alkyl group, a phenyl group, a deuterated phenyl group, a ($C_1$-$C_{20}$ alkyl) phenyl group, or any combination thereof, and b) the other $R_2$ may be a $C_4$-$C_{20}$ alkyl group or a deuterated $C_1$-$C_{20}$alkyl group, each unsubstituted or substituted with a $C_3$-$C_{10}$ cycloalkyl group.

In an embodiment, in Formula 1, n2 and n3 may each not be 0, and a group represented by

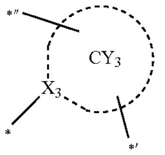

may be a group represented by one of Formulae CY3(1) to CY3(15):

CY3(1)

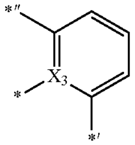

CY3(2)

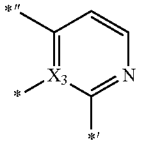

-continued

CY3(3)

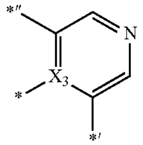

CY3(4)

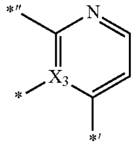

CY3(5)

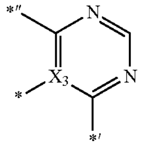

CY3(6)

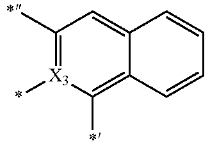

CY3(7)

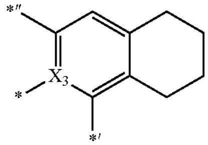

CY3(8)

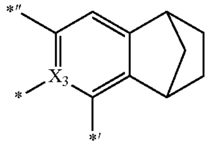

CY3(9)

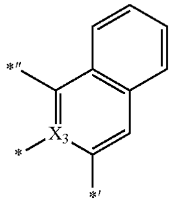

CY3(10)

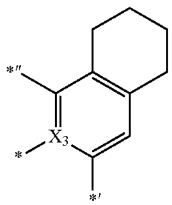

CY3(11)

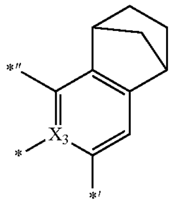

-continued

CY3(12)

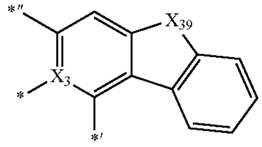

CY3(13)

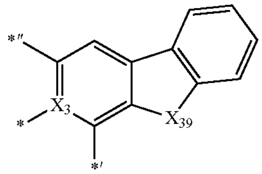

CY3(14)

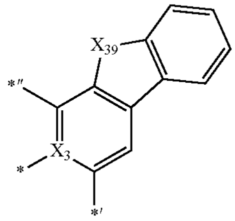

CY3(15)

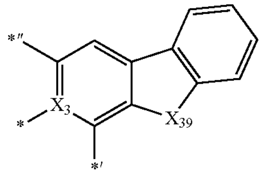

wherein, in Formulae CY3(1) to CY3(15), $X_3$ is the same as described in the present specification, $X_{39}$ may be O, S, $N(Z_{39a})$, $C(R_{39a})(R_{39b})$, or $Si(R_{39a})(R_{39b})$, $R_{39a}$ and $R_{39b}$ are each the same as described in connection with $R_3$ in the present specification,

*" indicates a binding site to $T_{12}$ in Formula 1,

* indicates a binding site to $M_1$ in Formula 1, and

*' indicates a binding site to $T_{13}$ in Formula 1.

In an embodiment, in Formula 1, n2 and n3 may each be 1, and a group represented by

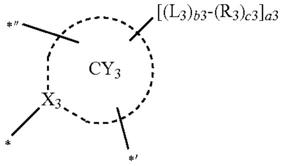

may be a group represented by one of Formulae CY3-1 to CY3-13:

CY3-1

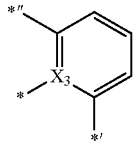

-continued

CY3-2

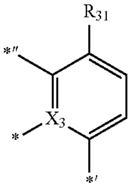

CY3-3

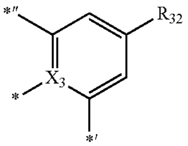

CY3-4

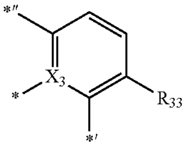

CY3-5

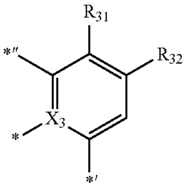

CY3-6

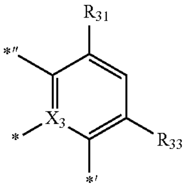

CY3-7

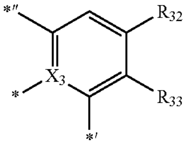

CY3-8

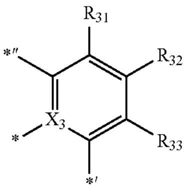

CY3-8

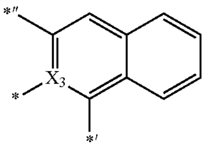

CY3-9

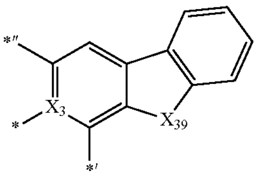

-continued

CY3-10

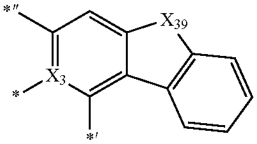

CY3-11

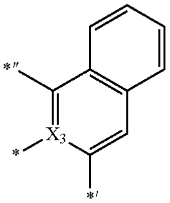

CY3-12

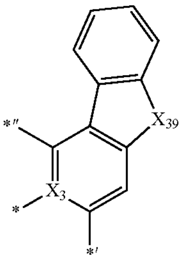

CY3-13

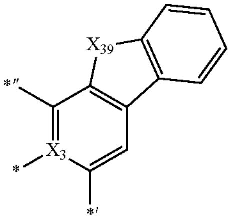

wherein, in Formulae CY3-1 to CY3-13, $X_3$ is the same as described in the present specification, $X_{39}$ may be O, S, N-$[(L_3)_{b3}$-$(R_3)_{c3}]$, $C(R_{39a})(R_{39b})$, or $Si(R_{39a})(R_{39b})$, $L_3$, b3, $R_3$, and c3 are each the same as described in the present specification, $R_{31}$ to $R_{33}$, $R_{39a}$, and $R_{39b}$ are each the same as described in connection with $R_3$ in the present specification, wherein $R_{31}$ to $R_{33}$ are each not hydrogen,

*" indicates a binding site to $T_{12}$ in Formula 1,

* indicates a binding site to $M_1$ in Formula 1, and

*' indicates a binding site to $T_{13}$ in Formula 1.

In an embodiment, in Formula 1, n3 may not be 0, n4 may be 0, and a group represented by

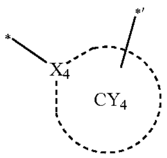

may be a group represented by one of Formulae CY4(1) to CY4(20):

CY4(1)
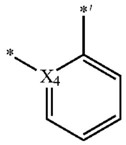
CY4(2)
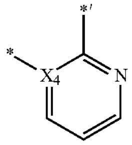
CY4(3)
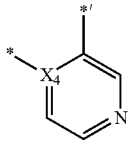
CY4(4)
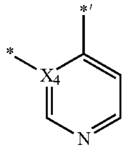
CY4(5)
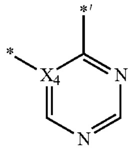
CY4(6)
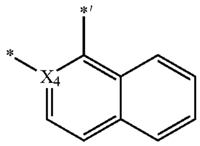
CY4(7)
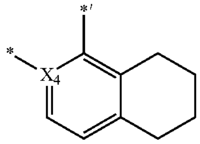
CY4(8)
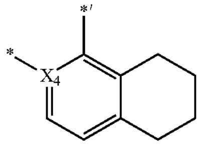
CY4(9)
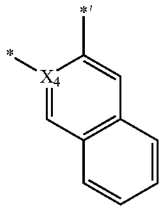
-continued
CY4(10)
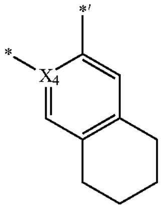
CY4(11)
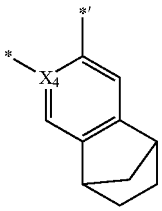
CY4(12)
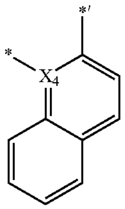
CY4(13)
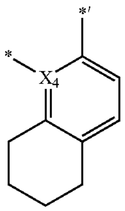
CY4(14)
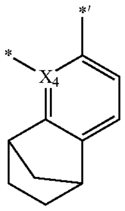
CY4(15)
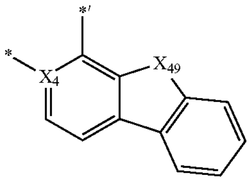
CY4(16)
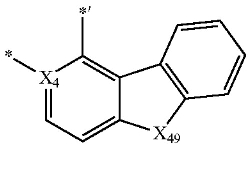

-continued

CY4(17)

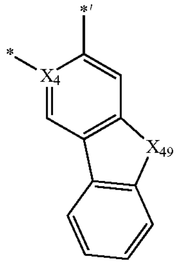

CY4(18)

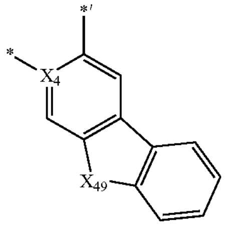

CY4(19)

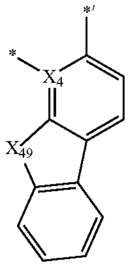

CY4(20)

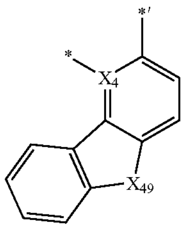

wherein, in Formulae CY4(1) to CY4(20), $X_4$ is the same as described in the present specification, $X_{49}$ may be O, S, $N(R_{49a})$, $C(R_{49a})(R_{49b})$, or $Si(R_{49a})(R_{49b})$, $R_{49a}$ and $R_{49b}$ are each the same as described in connection with $R_4$ in the present specification,

*' indicates a binding site to $T_{13}$ in Formula 1, and

* is a binding site to $M_1$ in Formula 1.

In an embodiment, in Formula 1, n3 may be 1, n4 may be 0, and a group represented by

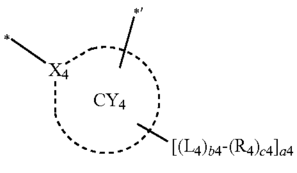

may be a group represented by one of Formulae CY4-1 to CY4-16:

CY4-1

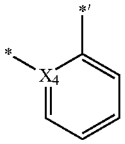

CY4-2

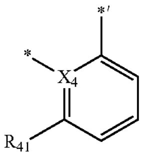

CY4-3

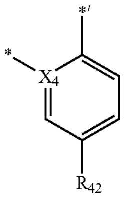

CY4-4

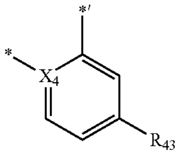

CY4-5

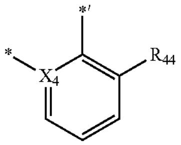

CY4-6

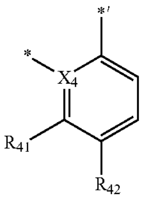

CY4-7

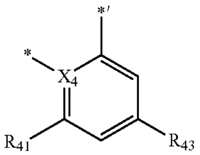

CY4-8

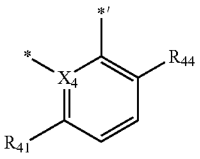

CY4-9

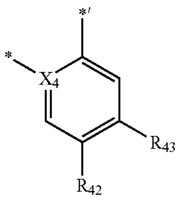

-continued

CY4-10

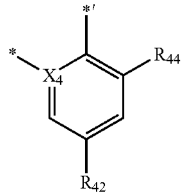

CY4-11

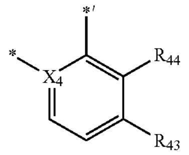

CY4-12

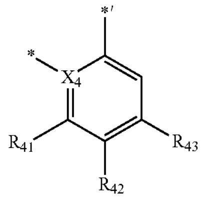

CY4-13

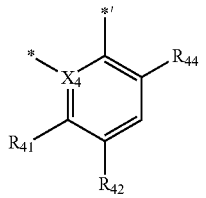

CY4-14

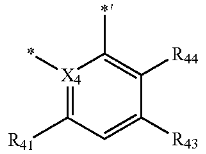

CY4-15

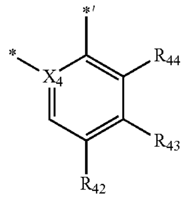

CY4-16

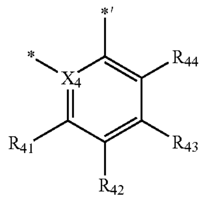

wherein, in Formulae CY4-1 to CY4-16, $X_4$ is the same as described in the present specification, $R_{41}$ to $R_{44}$ are each the same as described in connection with $R_4$ in the present specification, wherein $R_{41}$ to $R_{44}$ are each not hydrogen,

*' indicates a binding site to $T_{13}$ in Formula 1, and

* is a binding site to $M_1$ in Formula 1.

In an embodiment, the organometallic compound represented by Formula 1 may be a compound represented by one of Formulae 1-1 to 1-3:

1-1

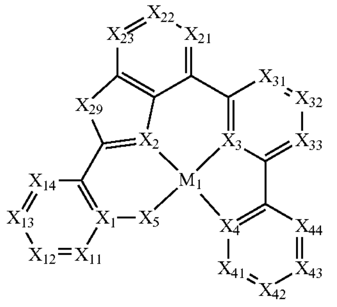

1-2

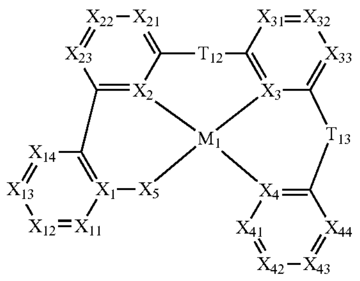

1-3

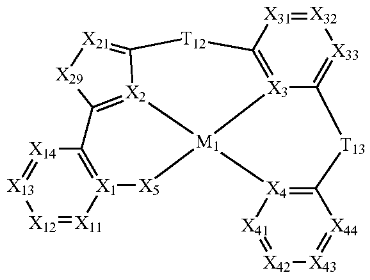

wherein, in Formulae 1-1 to 1-3, $M_1$, $X_1$ to $X_5$, $T_{12}$, and $T_{13}$ are each the same as described in the present specification, $X_{11}$ may be N or $C(R_{11})$, $X_{12}$ may be N or $C(R_{12})$, $X_{13}$ may be N or $C(R_{13})$, and $X_{14}$ may be N or $C(R_{14})$, $R_{11}$ to $R_{14}$ are each the same as described in connection with $R_1$ in the present specification, two or more of $R_{11}$ to $R_{14}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{21}$ may be N or $C(R_{21})$, $X_{22}$ may be N or $C(R_{22})$, and $X_{23}$ may be N or $C(R_{23})$, $X_{29}$ may be O, S, $N-[(L_2)_{b2}-(R_2)_{c2}]$, $C(R_{29a})(R_{29b})$, or $Si(R_{29a})(R_{29b})$, $L_2$, b2, $R_2$, and c2 are each the same as described in the present specification, $R_{21}$ to $R_{23}$, $R_{29a}$, and $R_{29b}$ are each the same as described in connection with $R_2$ in the present specification, two or more of $R_{21}$ to $R_{23}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{31}$ may be N or $C(R_{31})$, $X_{32}$ may be N or $C(R_{32})$, and $X_{33}$ may be N or $C(R_{33})$, $R_{31}$ to $R_{33}$ are each the same as described in connection with $R_3$ in the present specification, two or more of $R_{31}$ to $R_{33}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{41}$ may be N or C($R_{41}$), $X_{42}$ may be N or C($R_{42}$), $X_{43}$ may be N or C($R_{43}$), and $X_{44}$ may be N or C($R_{44}$), $R_{41}$ to $R_{44}$ are each the same as described in connection with $R_4$ in the present specification, two or more of $R_{41}$ to $R_{44}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

In an embodiment, $Y_1$ in Formula 2-1 may be N, and a group represented by

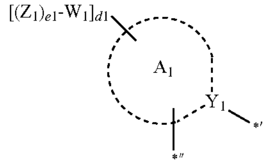

in Formula 2-1 may be a group represented by one of Formulae A1-1 to A1-3:

A1-1

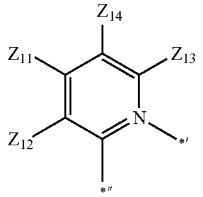

A1-2

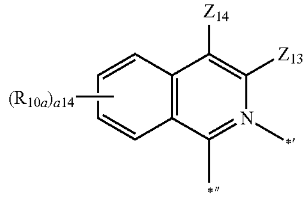

A1-3

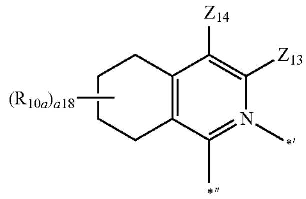

wherein, in Formulae A1-1 to A1-3, $Z_{11}$ to $Z_{14}$ are each the same as described in connection with $Z_1$ in the present specification, $R_{10a}$ is the same as described in the present specification, a14 may be an integer from 0 to 4, a18 may be an integer from 0 to 8,

*' indicates a binding site to $M_2$ in Formula 2, and

*" indicates a binding site to ring $A_2$.

For example, at least one of $Z_{11}$, $Z_{12}$, and $Z_{14}$ (for example, $Z_{14}$) in Formulae A1-1 to A1-3 may be:

a $C_1$-$C_{20}$ alkyl group that is unsubstituted or substituted with deuterium, —F, a phenyl group, or any combination thereof;

—$Si(Q_3)(Q_4)(Q_5)$; or

—$Ge(Q_3)(Q_4)(Q_5)$.

In an Embodiment, $Y_3$ in Formula 2-2 may be N, and a group represented by

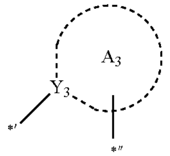

in Formula 2-2 may be a group represented by one of Formulae NR1 to NR48:

NR1

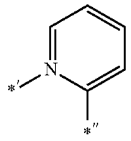

NR2

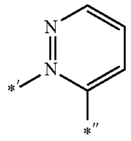

NR3

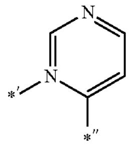

NR4

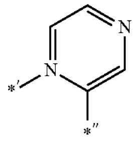

NR5

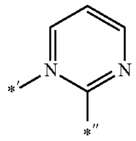

NR6

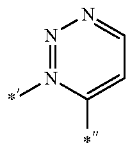

-continued
NR7
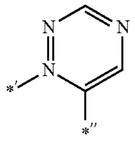
NR8
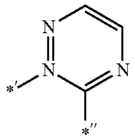
NR9
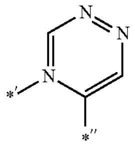
NR10
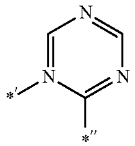
NR11
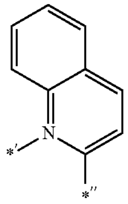
NR12
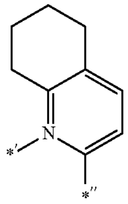
NR13
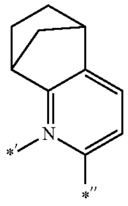
NR14
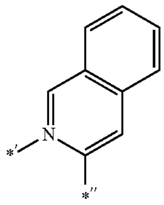
-continued
NR15
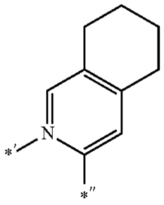
NR16
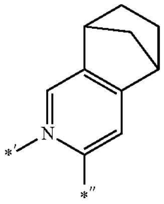
NR17
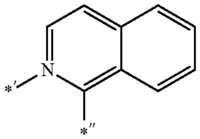
RN18
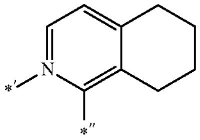
NR19
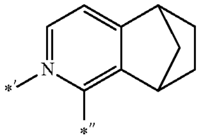
RN20
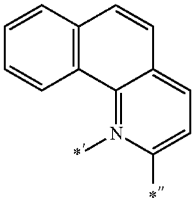
NR21
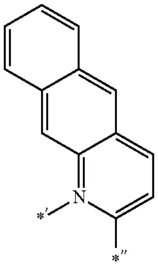
NR22
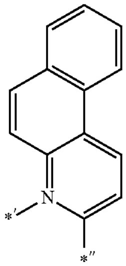

-continued
NR23
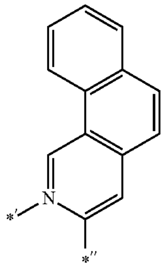
NR24
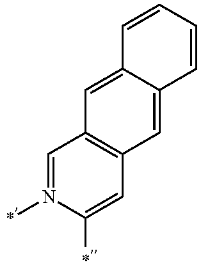
NR25
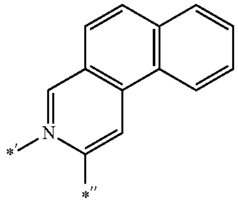
NR26
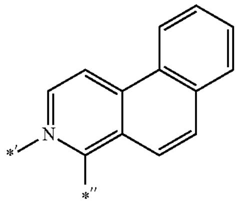
NR27
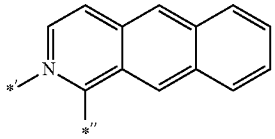
NR28
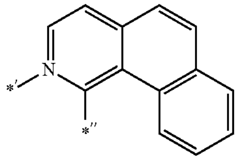
NR29
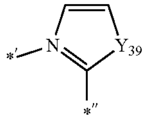
NR30
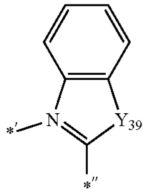
-continued
NR31
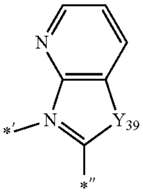
NR32
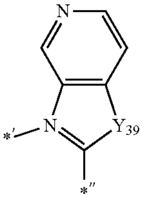
NR33
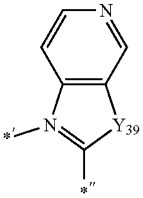
NR34
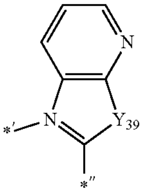
NR35
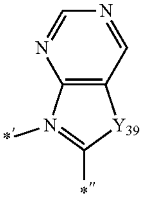
NR36
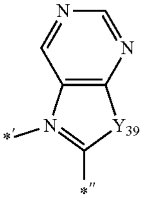
NR37
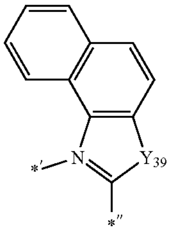

-continued
NR38
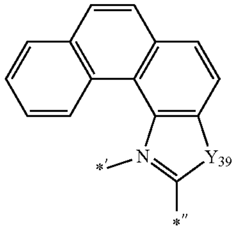
NR39
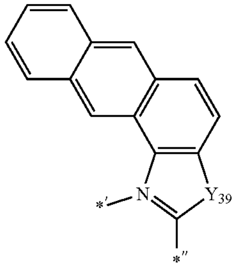
NR40
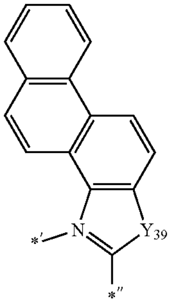
NR41
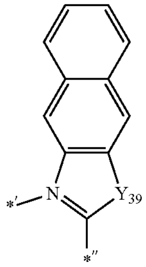
NR42
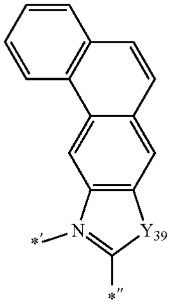
-continued
NR43
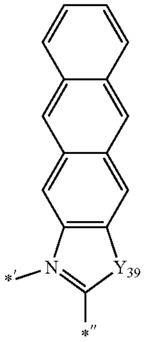
NR44
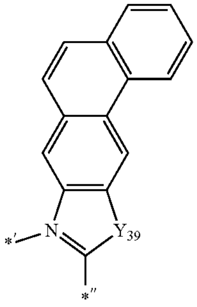
NR45
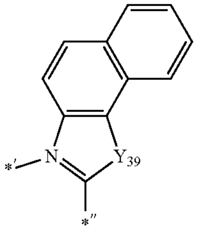
NR46
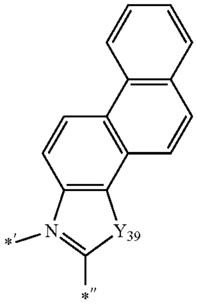
NR47
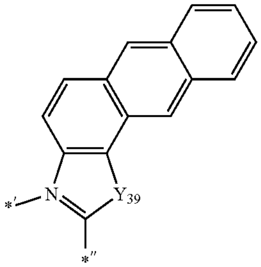

-continued

NR48

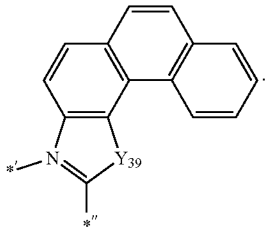

wherein, in Formulae NR1 to NR48, $Y_{39}$ may be O, S, Se, N—[$W_3$—$(Z_3)_{e3}$], $C(Z_{39a})(Z_{39b})$, or $Si(Z_{39a})(Z_{39b})$, $W_3$, $Z_3$, and e3 are each the same as described in the present specification, and $Z_{39a}$ and $Z_{39b}$ are each the same as described in connection with $Z_3$ in the present specification,

*' indicates a binding site to $M_2$ in Formula 2, and

*" indicates a binding site to ring $A_4$.

In an Embodiment, $Y_2$ and $Y_4$ in Formulae 2-1 and 2-2 may each be C, and a group represented by

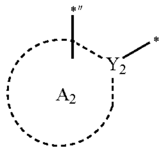

in Formula 2-1 and a group represented by

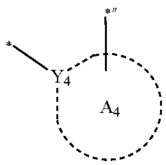

in Formula 2-2 may each independently be a group represented by one of Formulae CR1 to CR29:

CR1

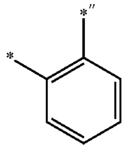

CR2

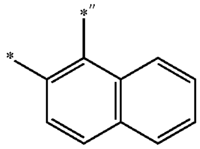

CR3

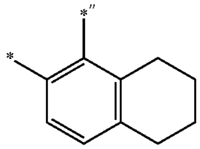

-continued

CR4

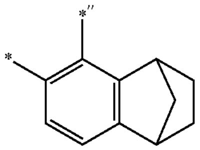

CR5

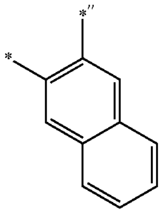

CR6

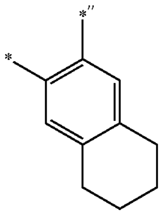

CR7

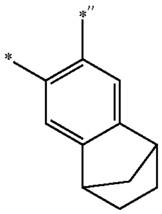

CR8

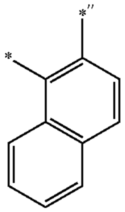

CR9

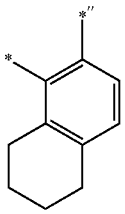

CR10

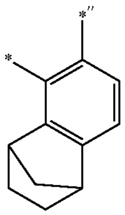

-continued
CR11
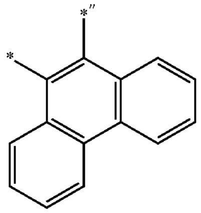
CR12
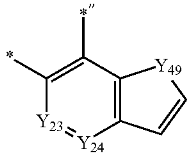
CR13
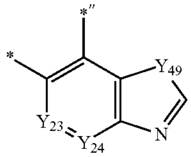
CR14
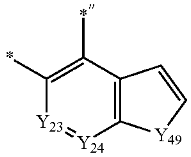
CR15
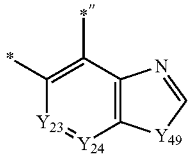
CR16
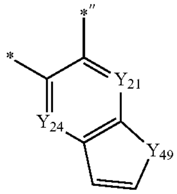
CR17
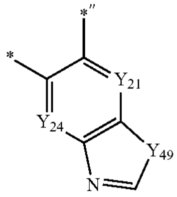
CR18
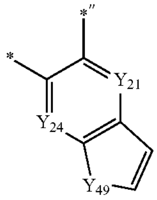
-continued
CR19
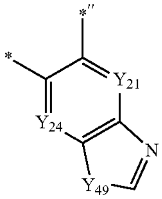
CR20
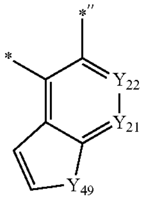
CR21
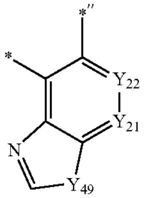
CR22
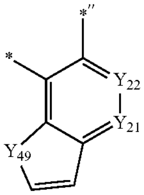
CR23
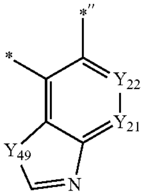
CR24
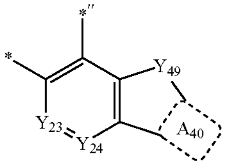
CR25
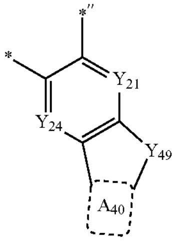

-continued

CR26

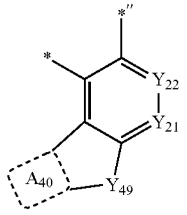

CR27

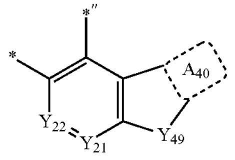

CR28

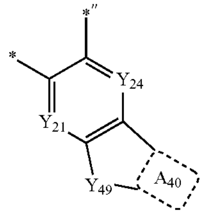

CR29

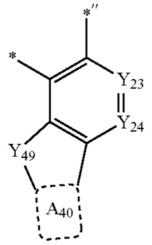

wherein, in Formulae CR1 to CR29, $Y_{49}$ may be O, S, Se, N—[$W_2$—$(Z_2)_{e2}$], N—[$W_4$—$(Z_4)_{e4}$], $C(Z_{29a})(Z_{29b})$, $C(Z_{49a})(Z_{49b})$, $Si(Z_{29a})(Z_{29b})$, or $Si(Z_{49a})(Z_{49b})$, $W_2$, $W_4$, $Z_2$, $Z_4$, e2, and e4 are each the same as described in the present specification, $Z_{29a}$ and $Z_{29b}$ are each the same as described in connection with $Z_2$ in the present specification, and $Z_{49a}$ and $Z_{49b}$ are each the same as described in connection with $Z_4$ in the present specification, $Y_{21}$ to $Y_{24}$ may each independently be N or C, ring $A_{40}$ may be a $C_5$-$C_{30}$ carbocyclic group or a $C_1$-$C_{30}$ heterocyclic group (for example, a benzene group, a naphthalene group, a phenanthrene group, a pyridine group, a pyrimidine group, a pyrazine group, a pyridazine group, a quinoline group, an isoquinoline group, a benzoquinoline group, a benzoisoquinoline group, a quinoxaline group, a benzoquinoxaline group, a quinazoline group, or a benzoquinazoline group),

* indicates a binding site to $M_2$ in Formula 2, and

*" indicates a binding site to ring A, or ring $A_3$.

In an Embodiment, a group represented by

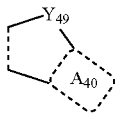

in Formulae CR24 to CR29 may be a group represented by one of Formulae CR(1) to CR(13):

CR(1)

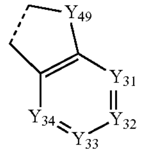

CY(2)

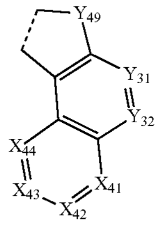

CR(3)

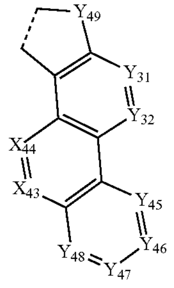

CR(4)

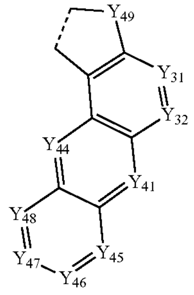

CR(5)

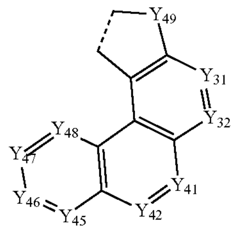

CR(6)

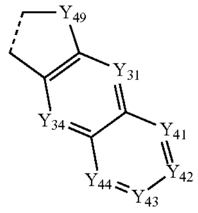

-continued

CR(7)

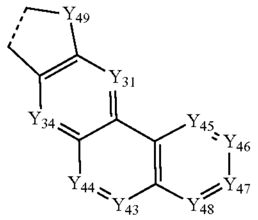

CR(8)

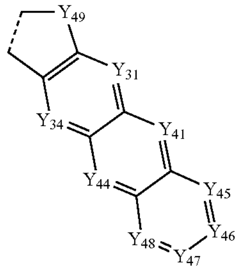

CR(9)

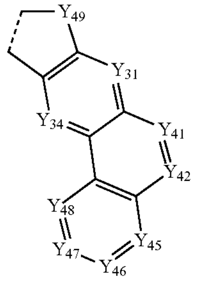

CR(10)

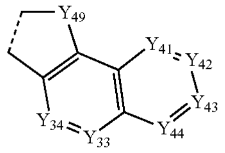

CR(11)

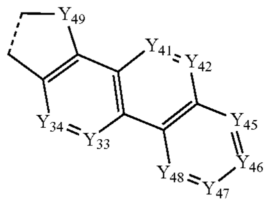

CR(12)

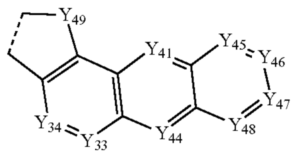

CR(13)

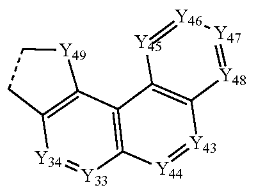

wherein, in Formulae CR(1) to CR(13), $Y_{49}$ is the same as described in the present specification, and $Y_{31}$ to $Y_{34}$ and $Y_{41}$ to $Y_{48}$ may each independently be C or N.

In an embodiment, the first compound may include at least one deuterium.

In an embodiment, the second compound may include at least one deuterium.

For example, the first compound and the second compound may each independently be selected from compounds of Group 1-1 to Group 1-4 and compounds of Group 2-1 to Group 2-5:

Group 1-1

1-1

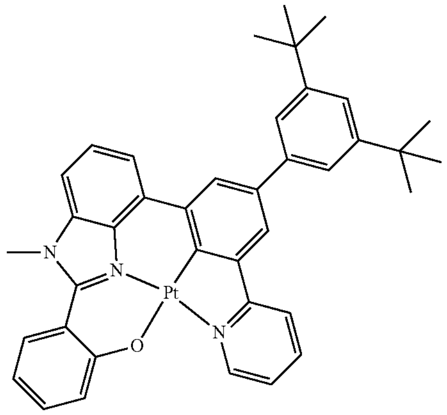

1-2

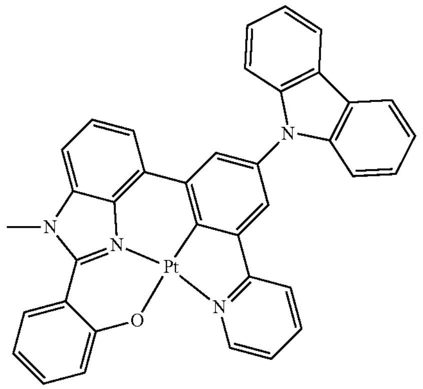

1-3

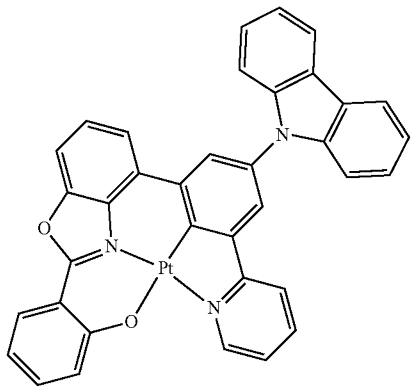

-continued
1-4
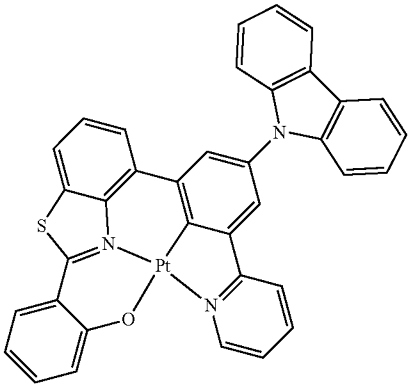
1-5
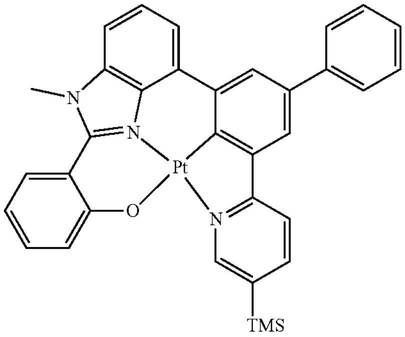
1-6
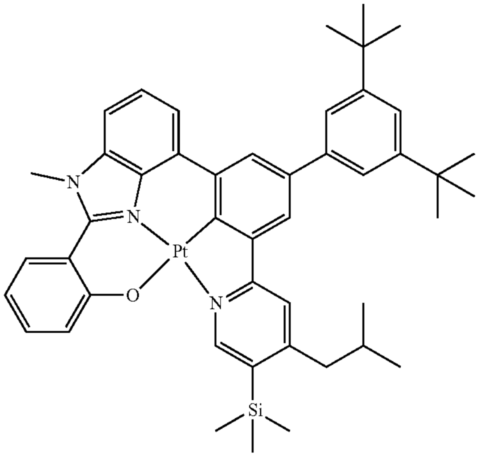
1-7
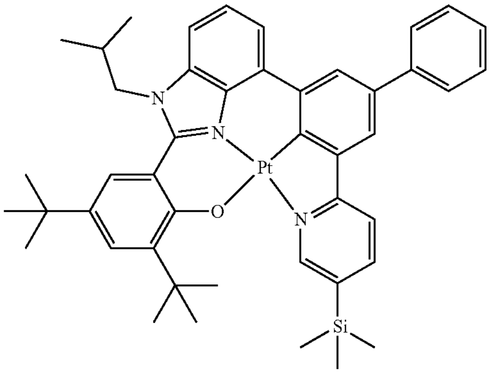
-continued
1-8
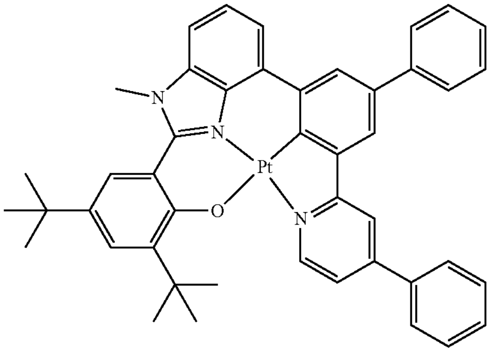
1-9
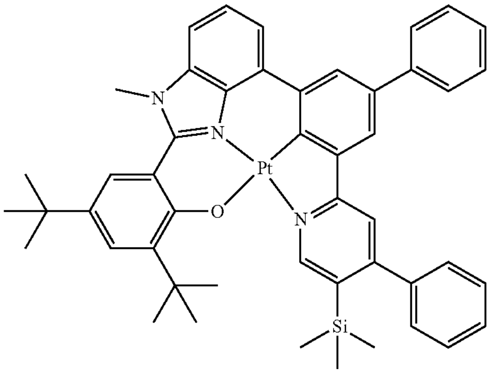
1-10
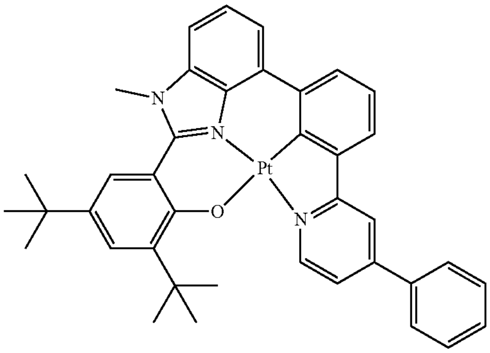
1-11
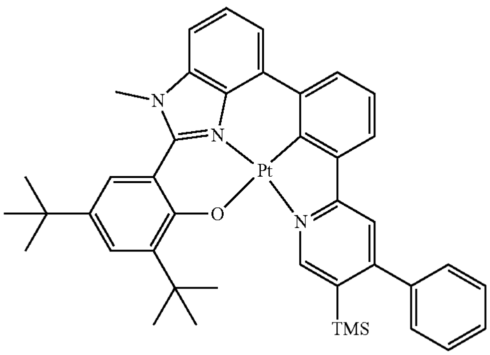

-continued
1-12
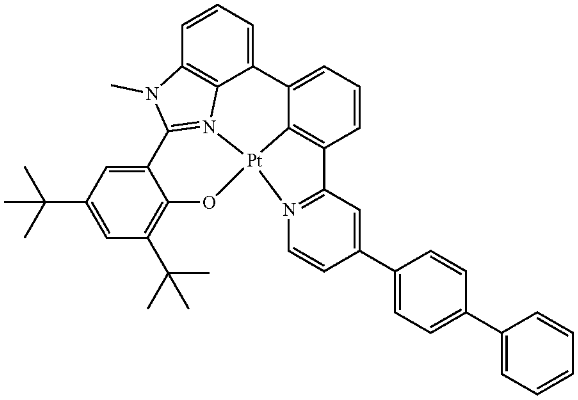
1-13
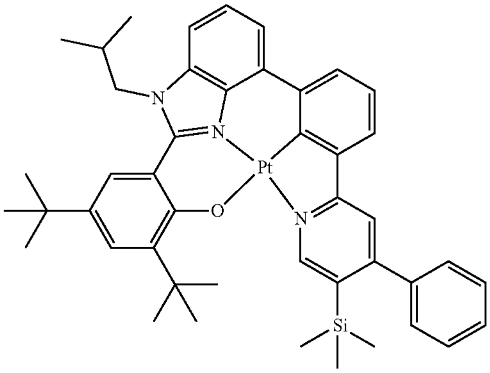
1-14
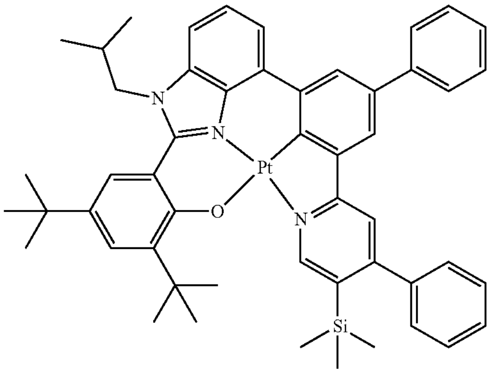
1-15
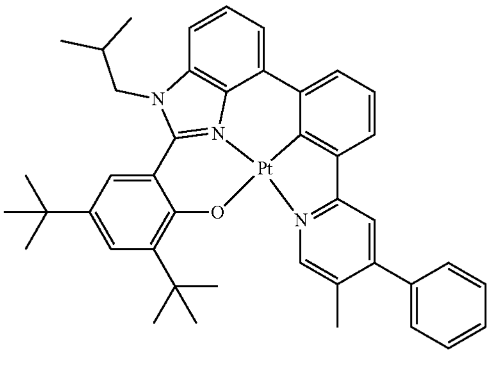
-continued
1-16
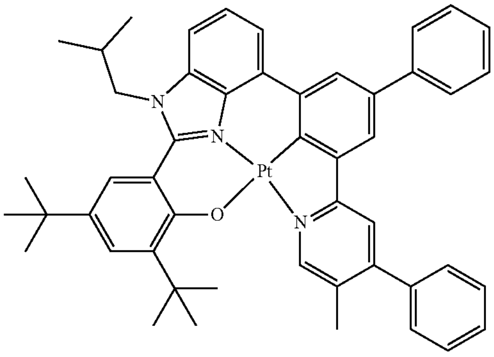
1-17
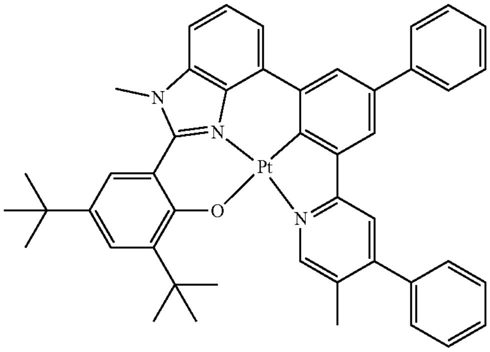
1-18
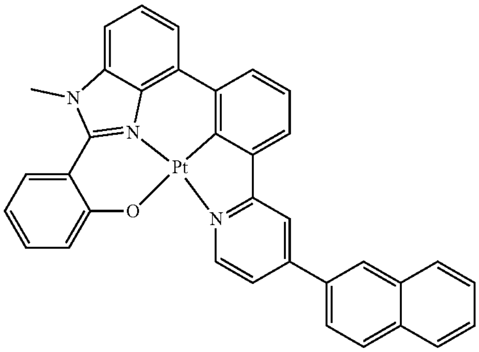
1-19
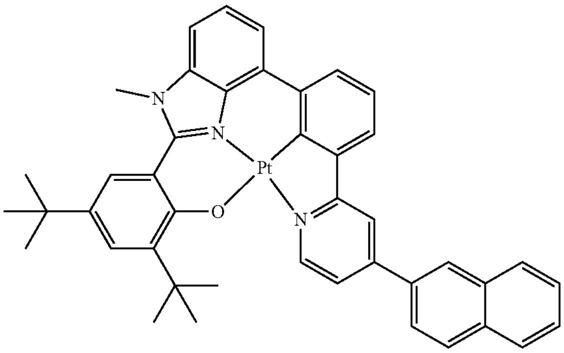

-continued
1-20
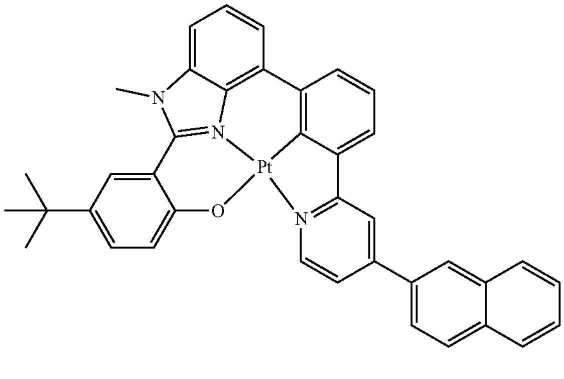
1-21
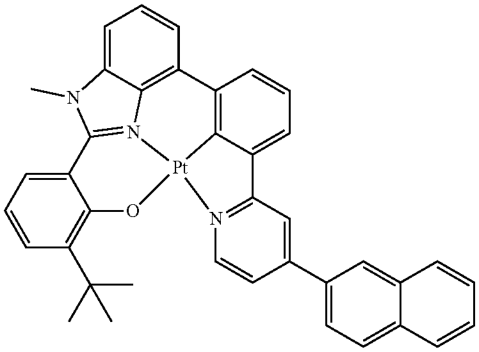
1-22
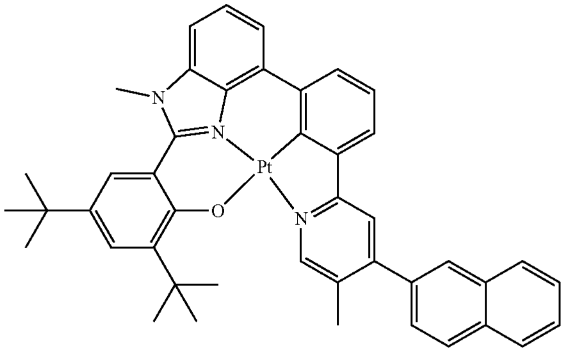
1-23
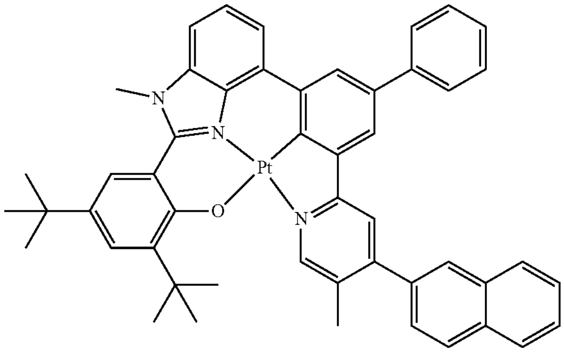
-continued
1-24
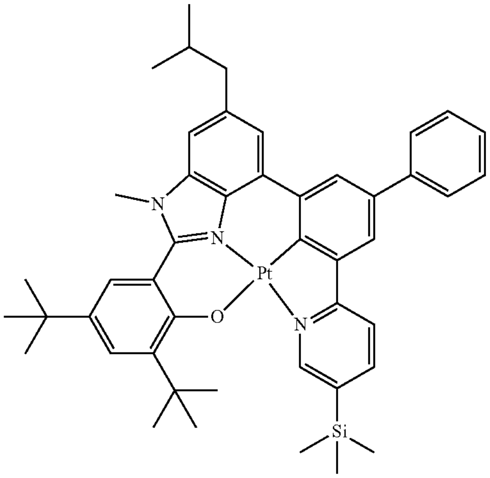
1-25
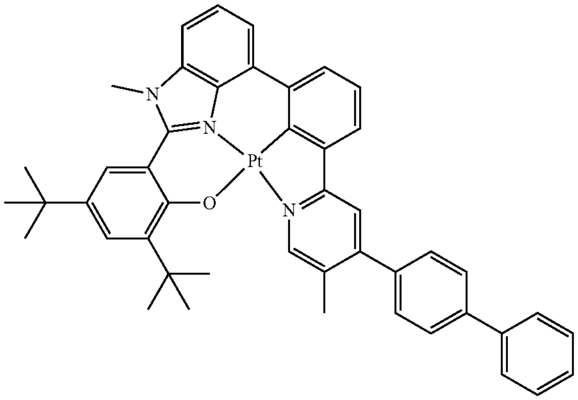
1-26
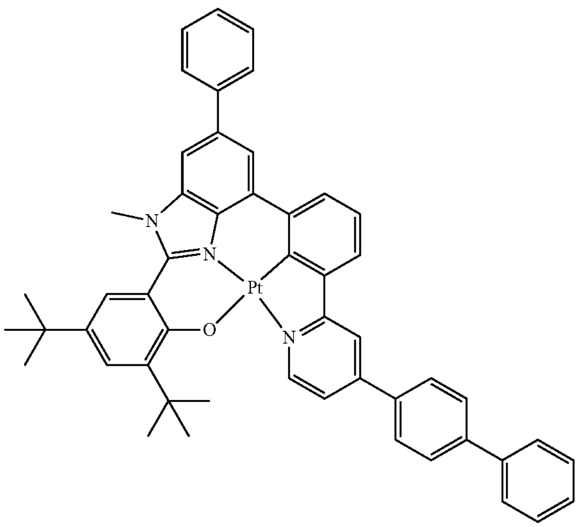

-continued
1-27
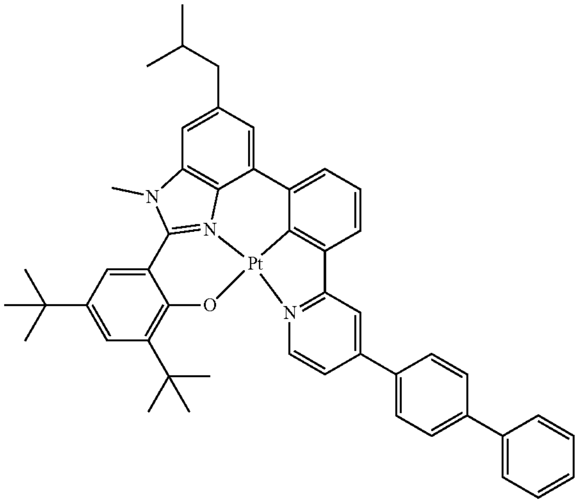
1-28
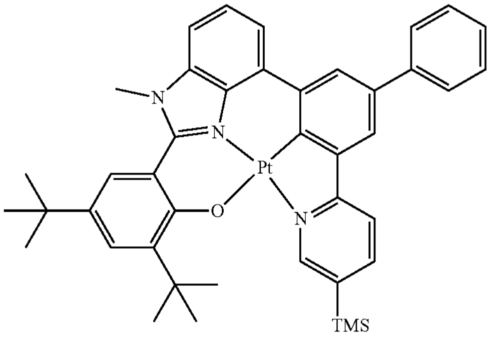
1-29
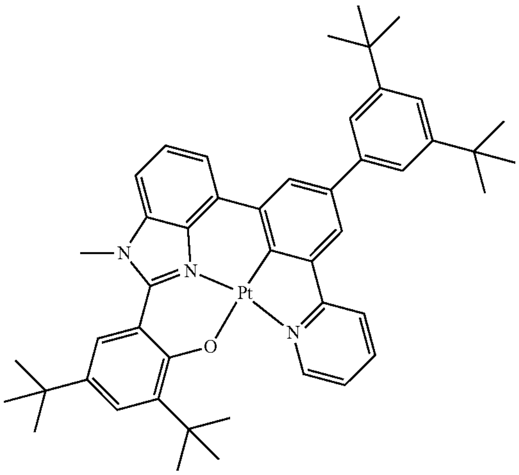
-continued
1-30
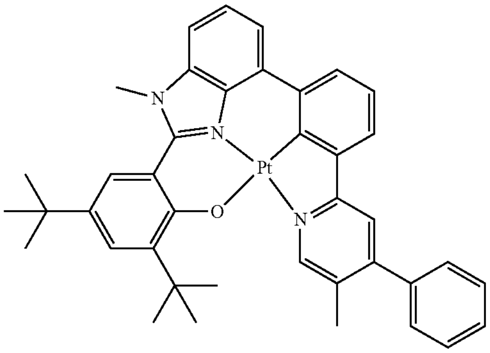
1-31
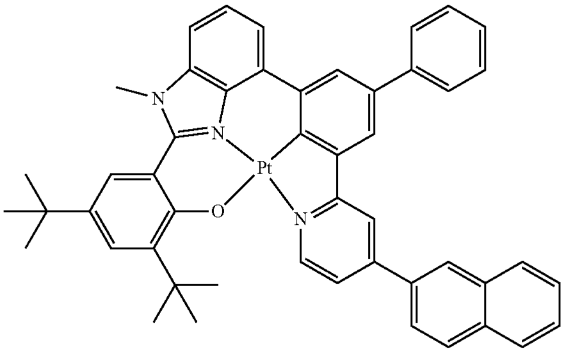
1-32
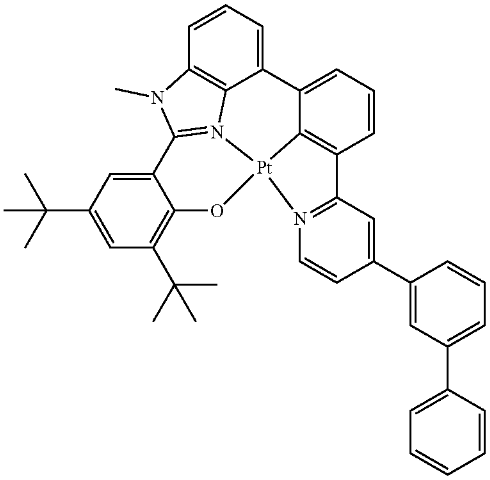
1-33
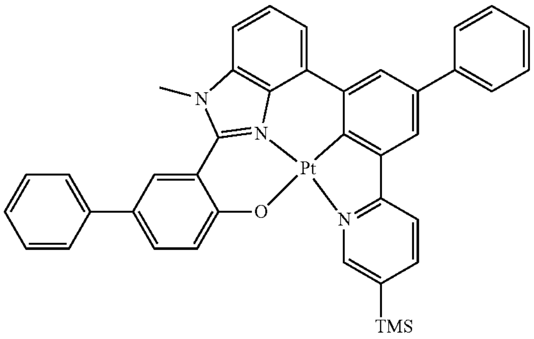

1-34
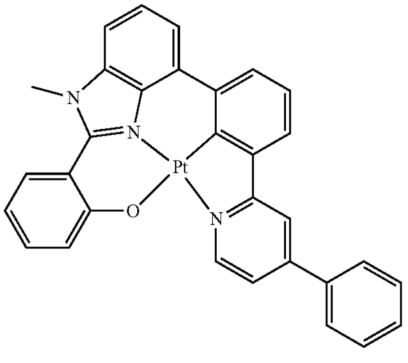
1-35
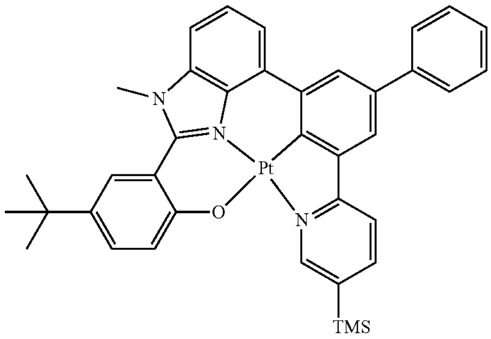
1-36
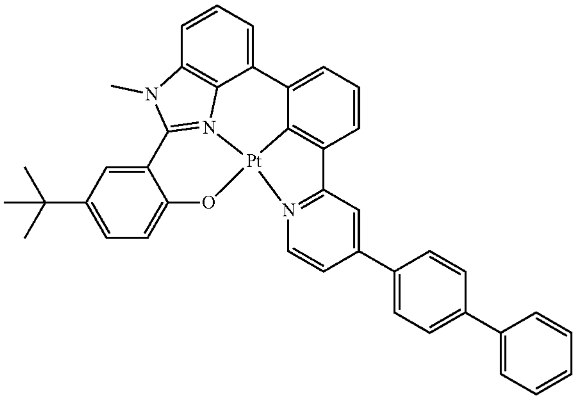
1-37
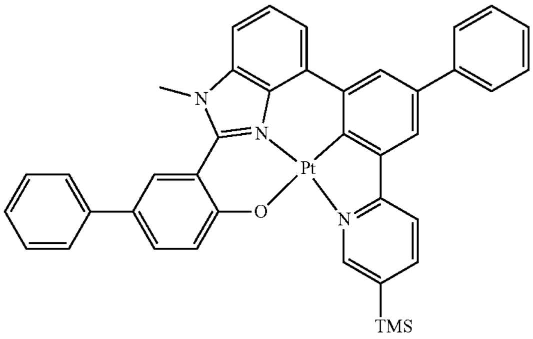
1-38
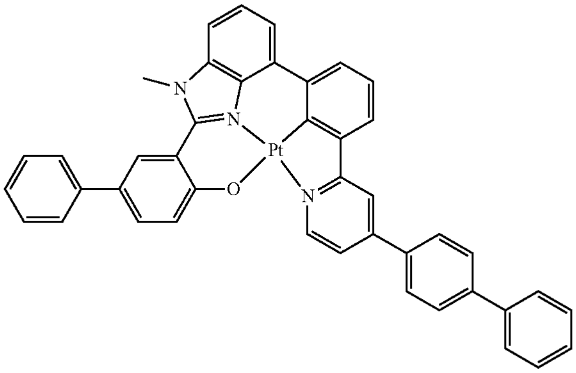
1-39
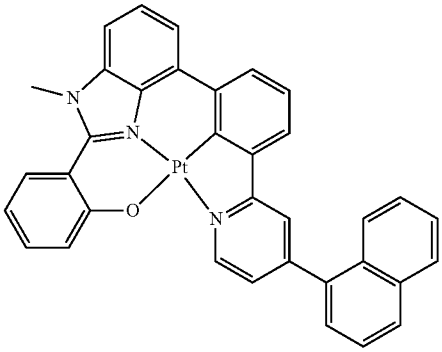
1-40
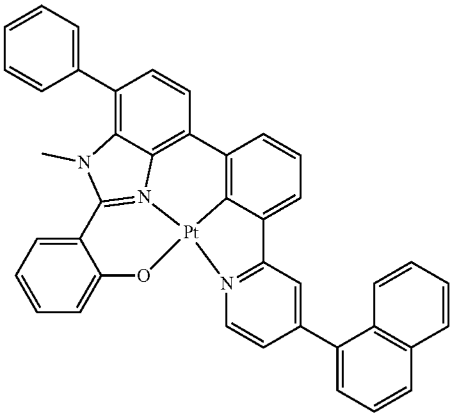
1-41
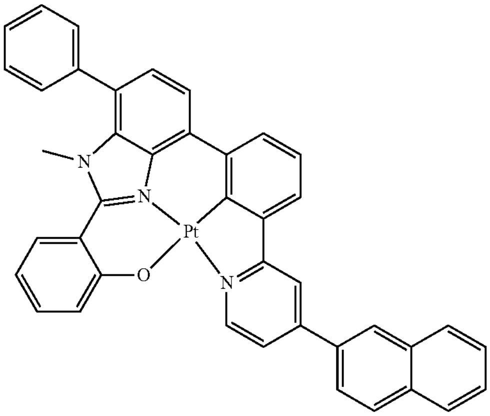

1-42
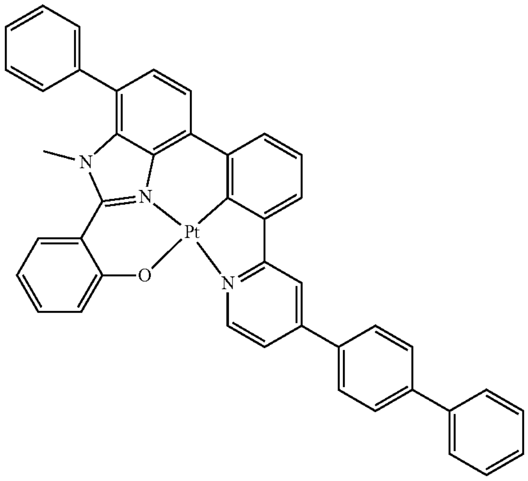
1-43
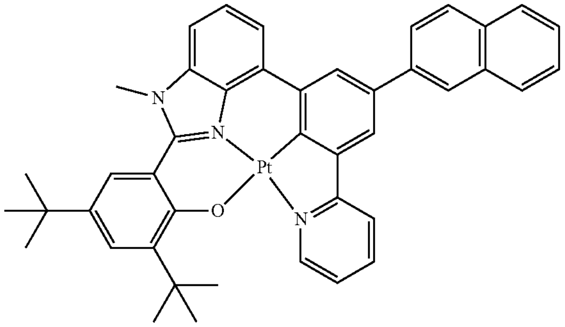
1-44
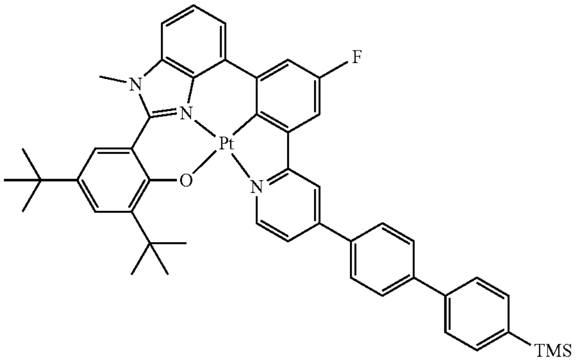
1-45
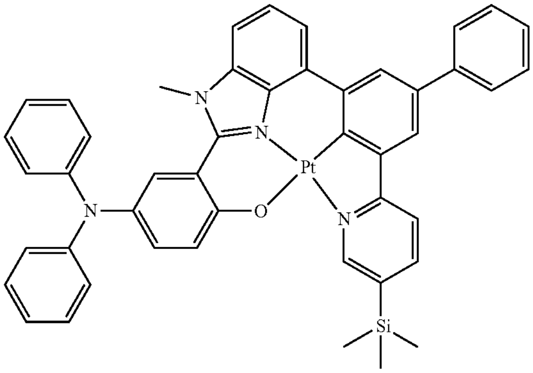
1-46
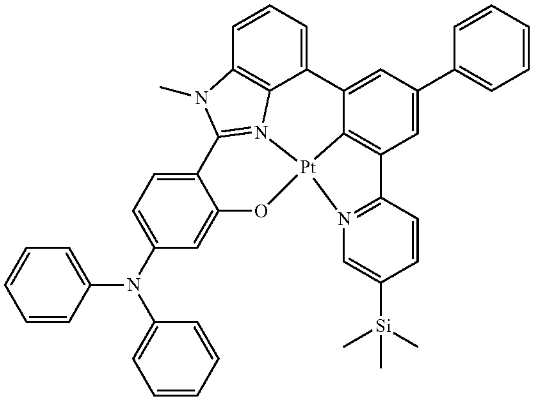
1-47
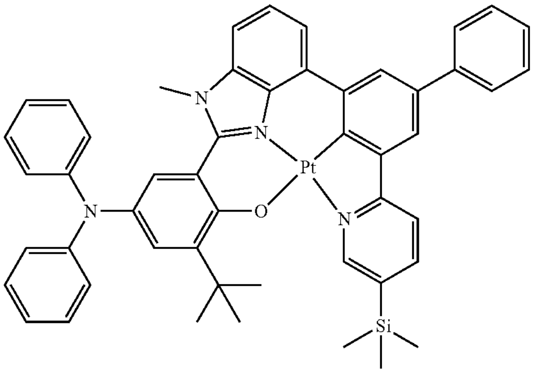
1-48
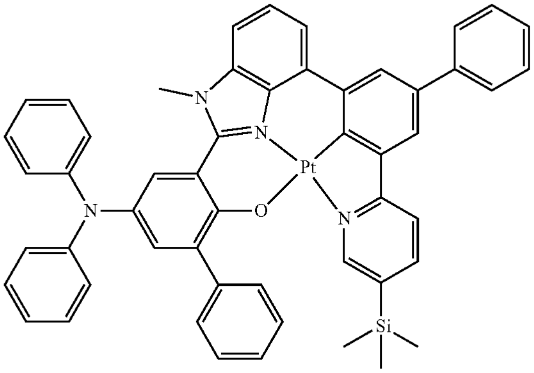
1-49
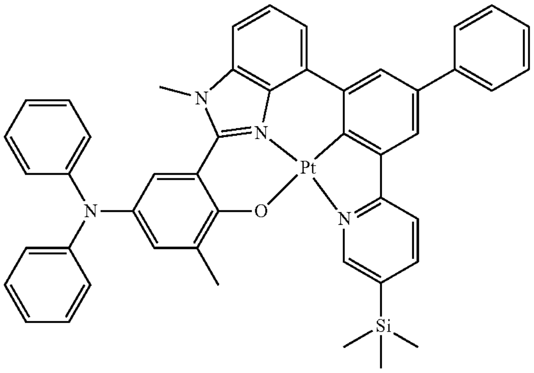

-continued
1-50
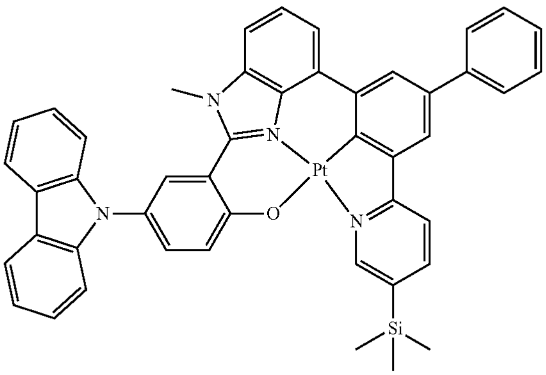
1-51
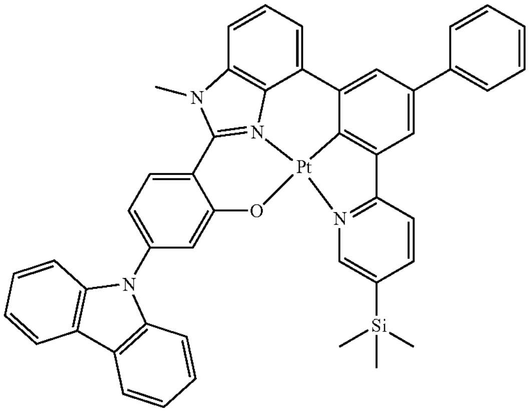
1-52
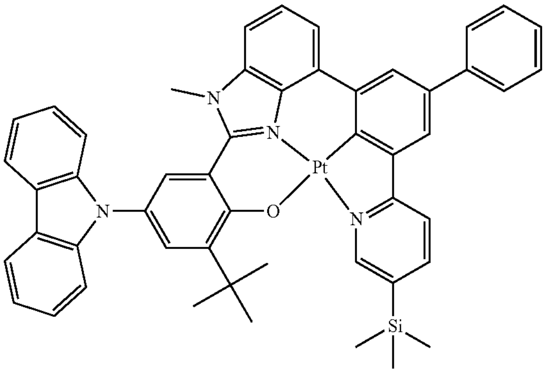
1-53
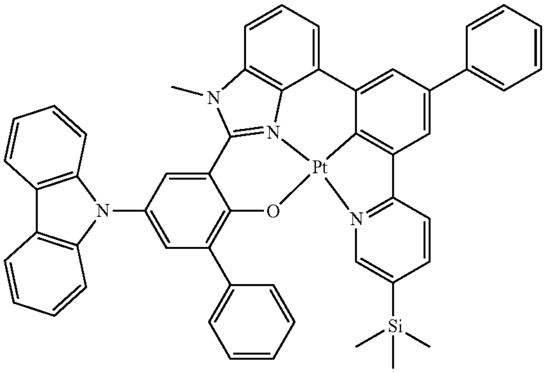
-continued
1-54
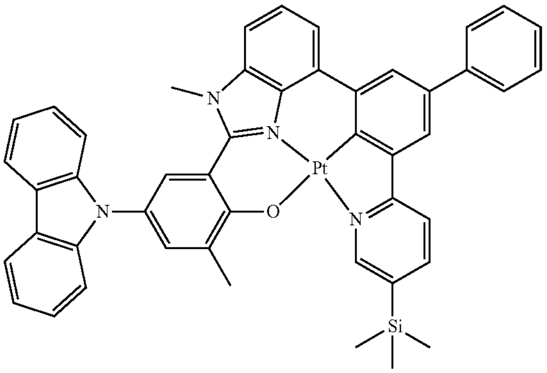
1-55
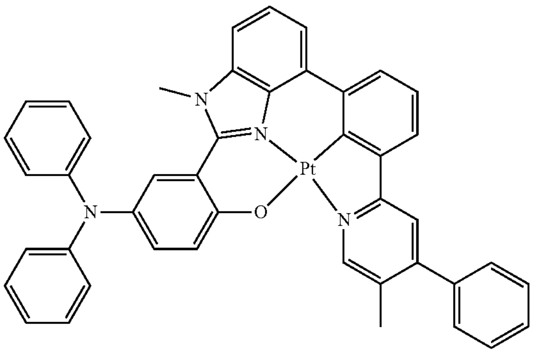
1-56
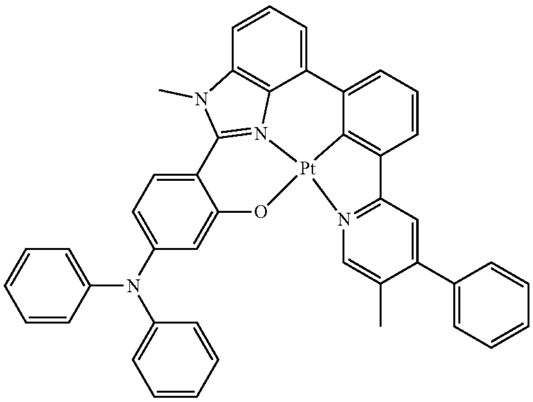
1-57
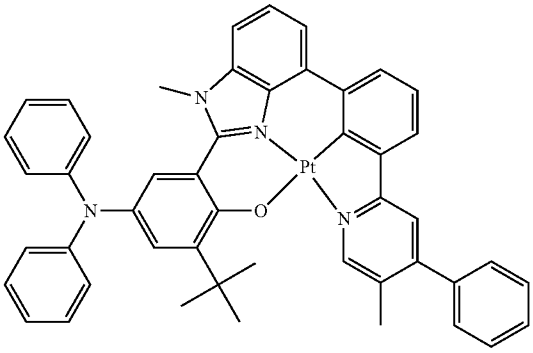

-continued
1-58
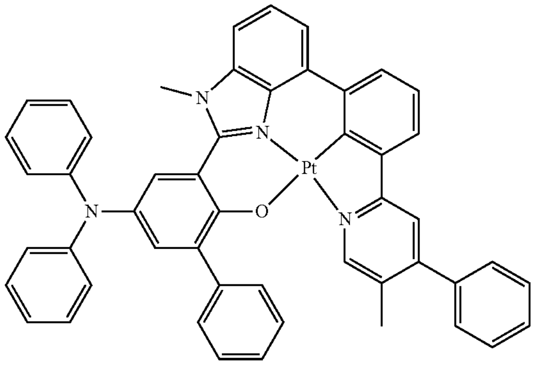
1-59
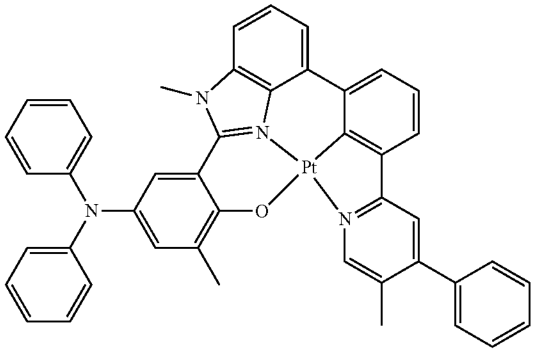
1-60
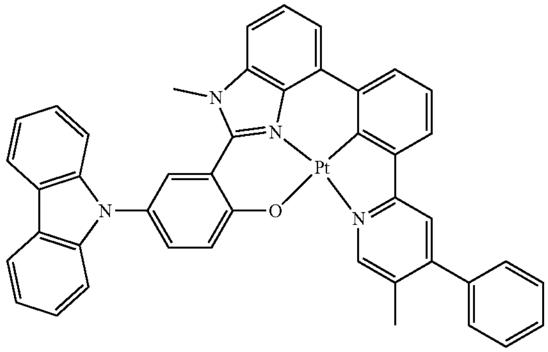
1-61
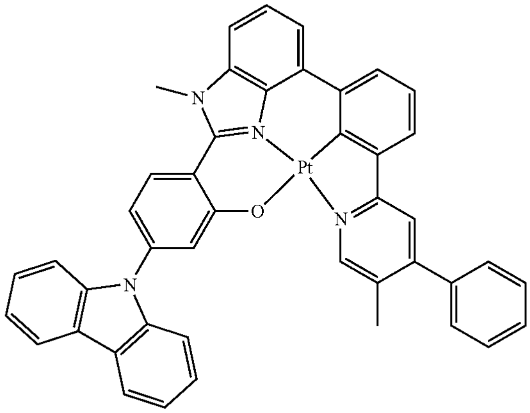
-continued
1-62
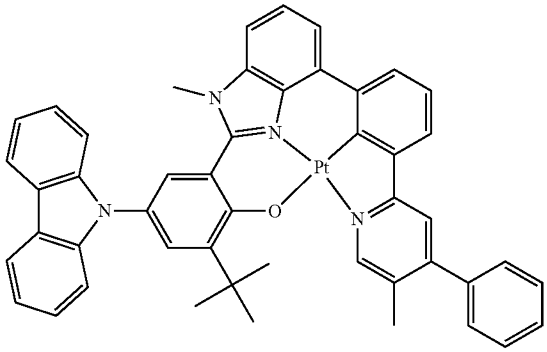
1-63
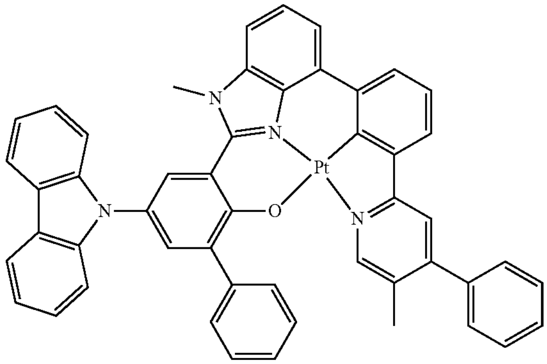
1-64
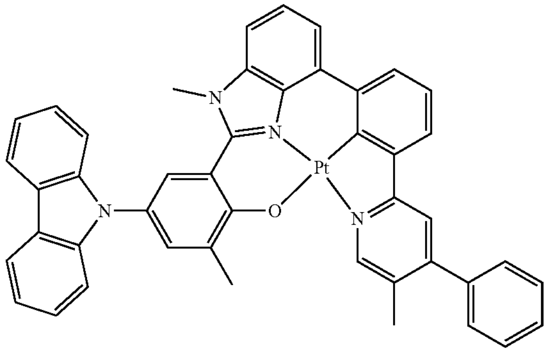
1-65
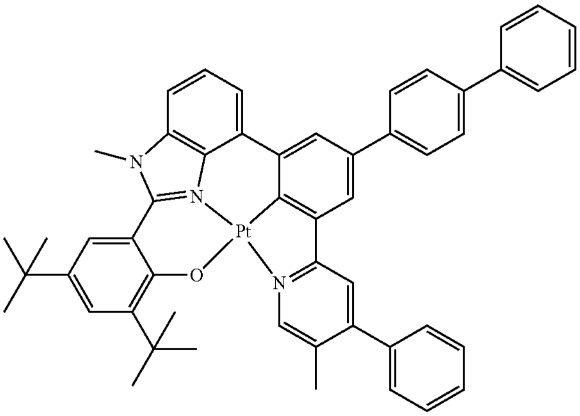

-continued
1-66
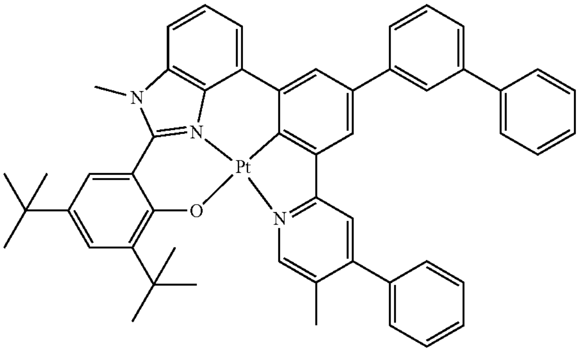
1-67
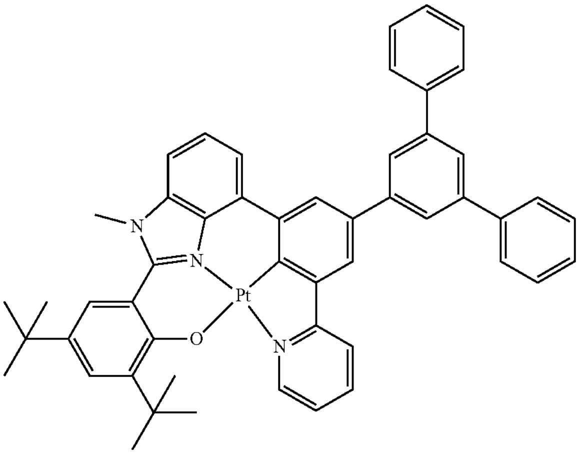
1-68
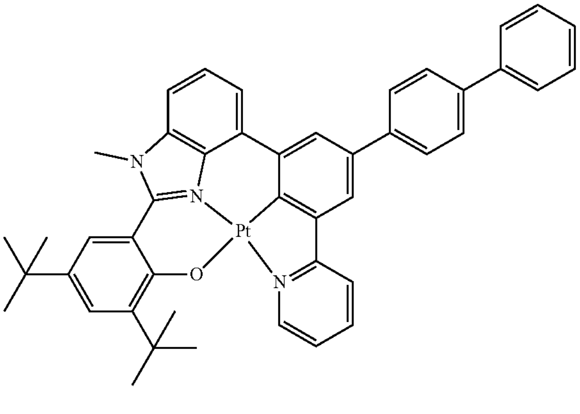
-continued
1-69
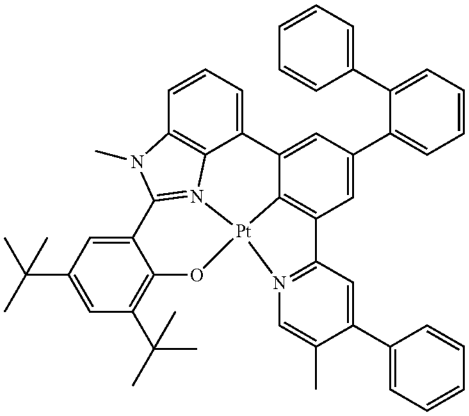
1-70
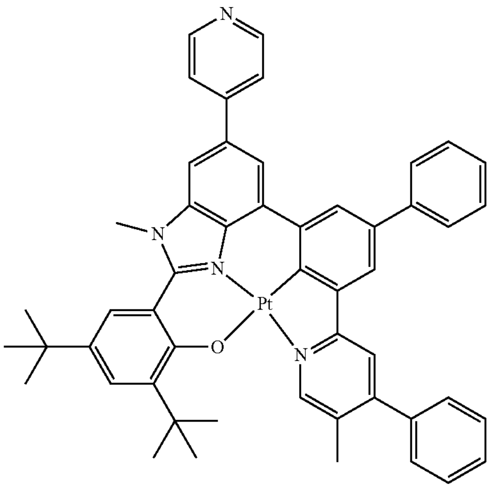
1-71
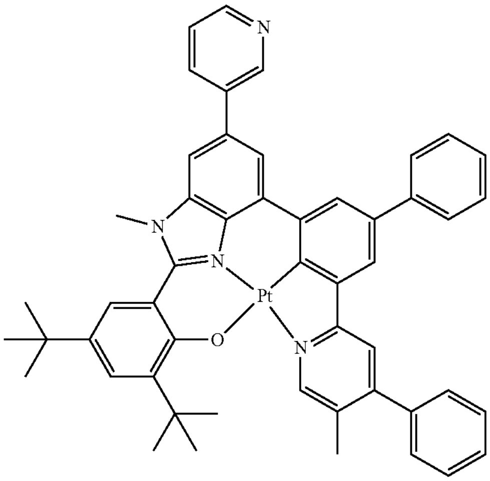

-continued
1-72
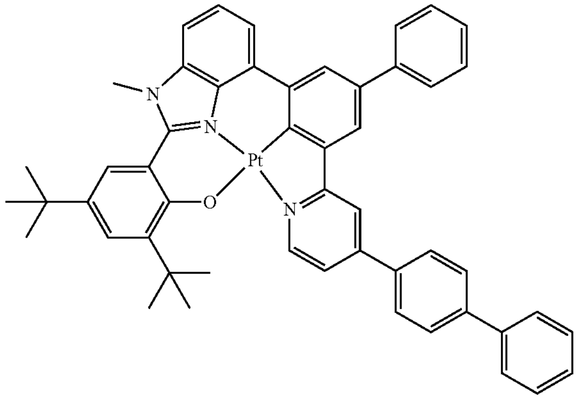
1-73
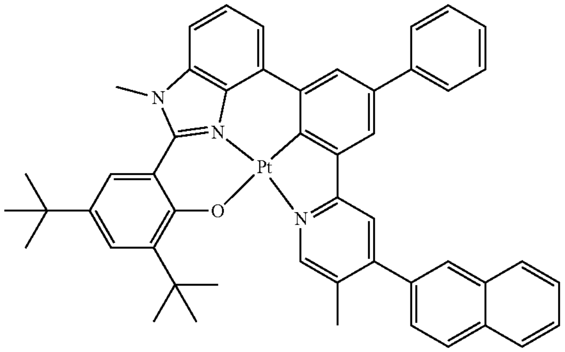
1-74
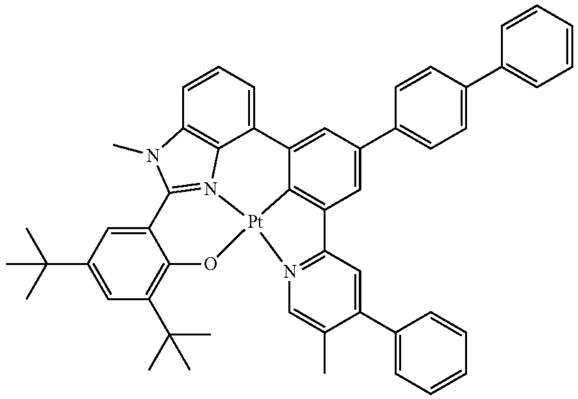
1-75
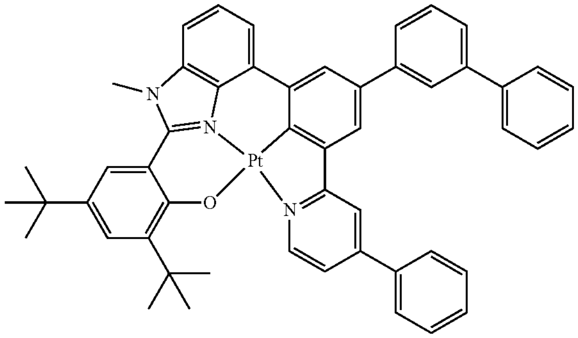
-continued
1-76
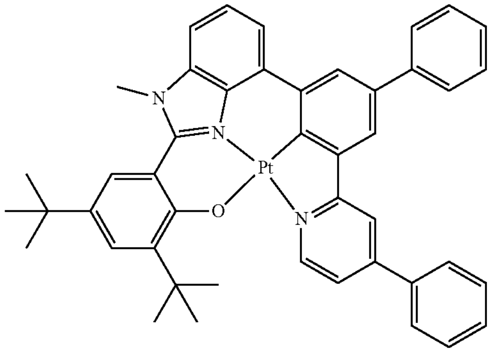
1-77
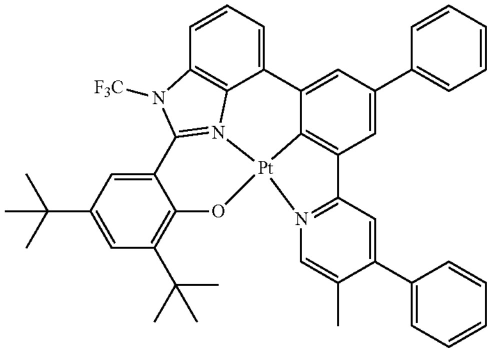
1-78
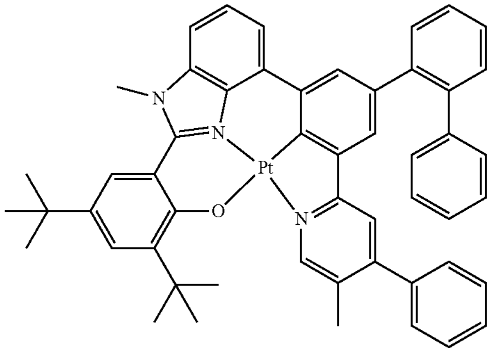
1-79
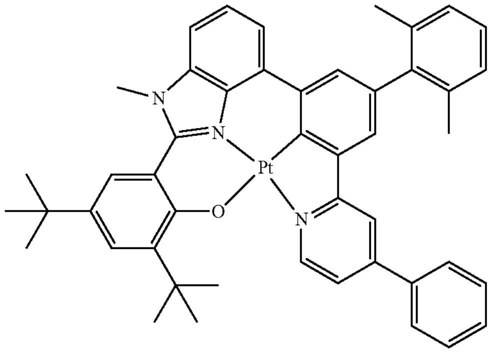

-continued
1-80
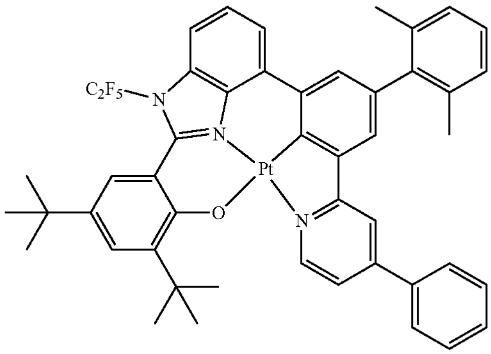
1-81
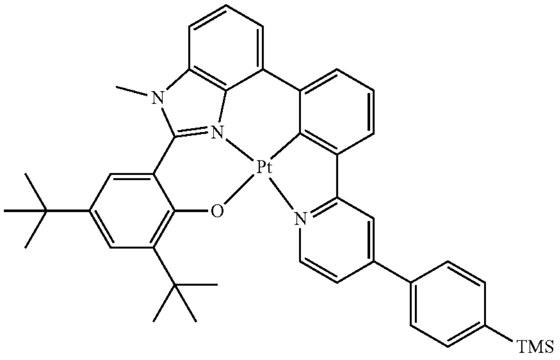
1-82
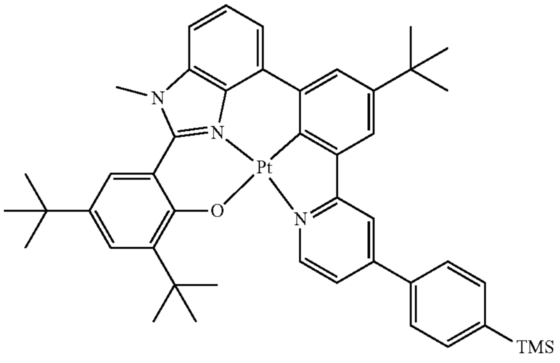
1-83
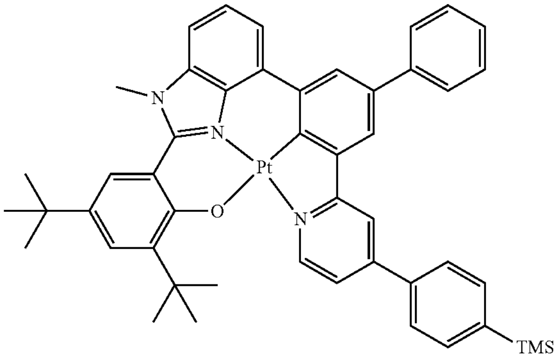
-continued
1-84
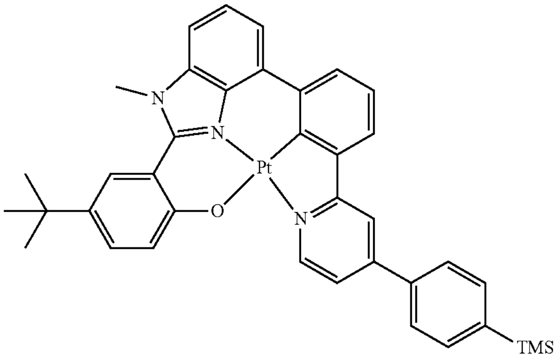
1-85
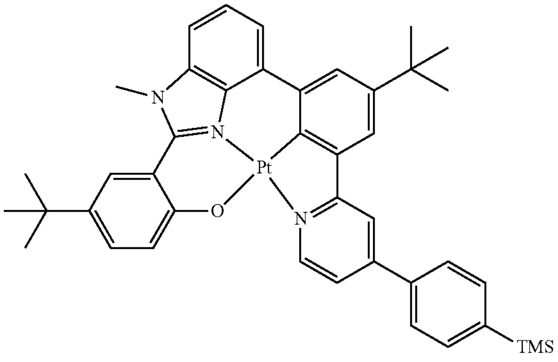
1-86
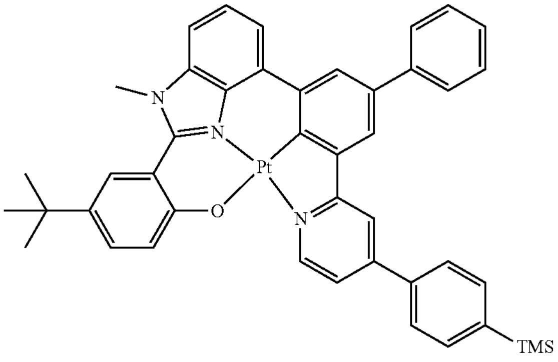
1-87
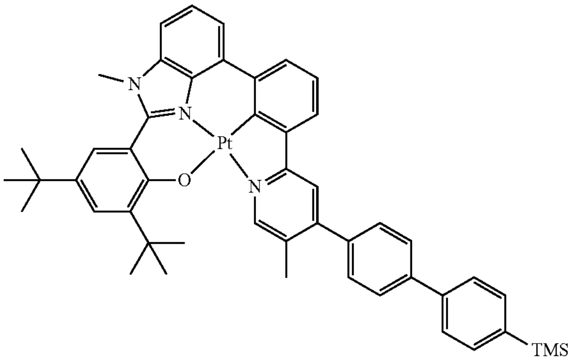

1-88
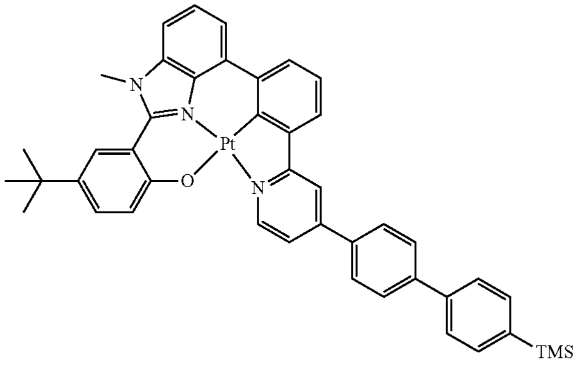
2-1
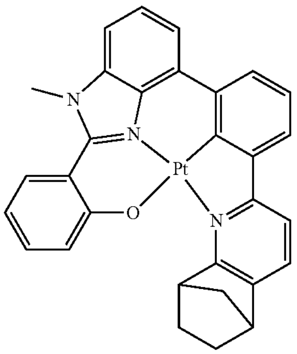
2-2
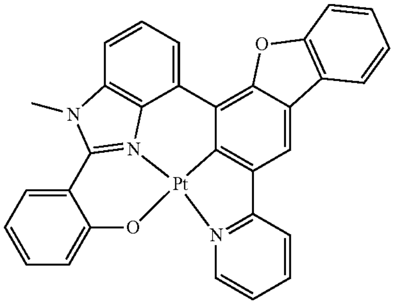
2-3
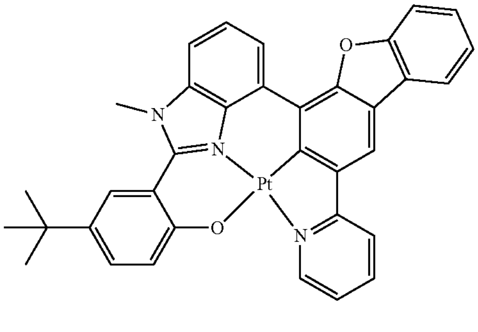
2-4
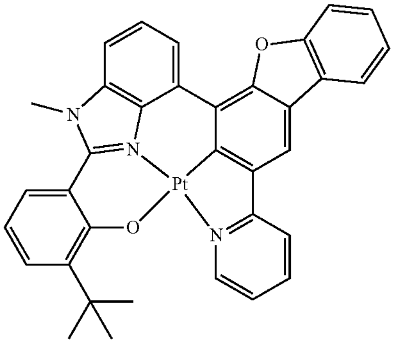
2-5
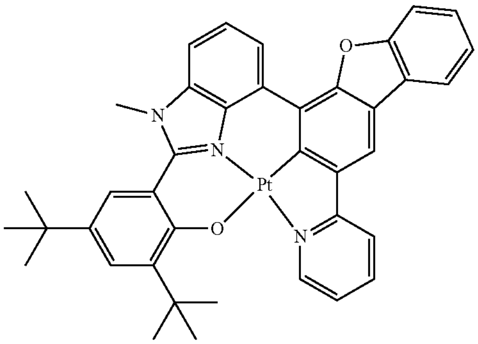
2-6
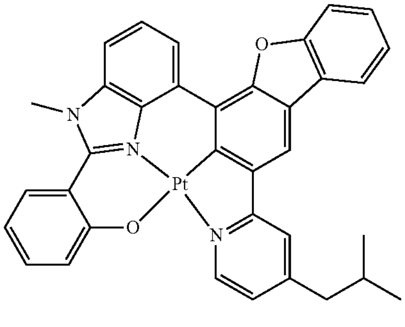
2-7
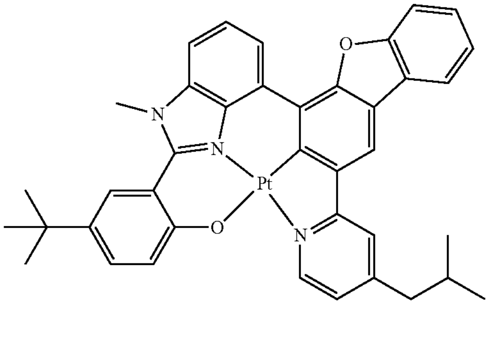

-continued
2-8
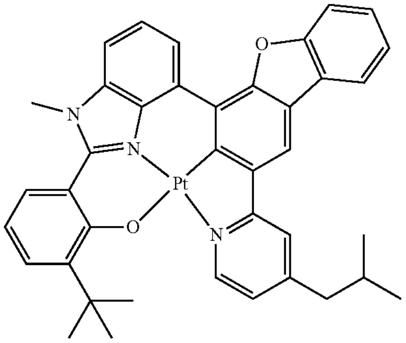
2-9
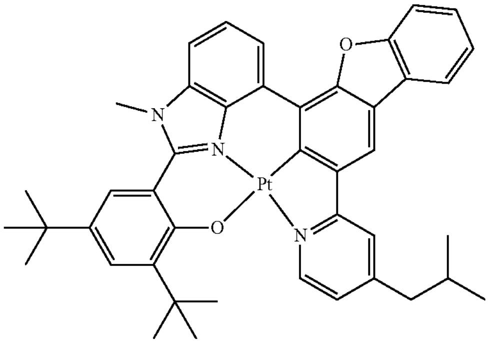
2-10
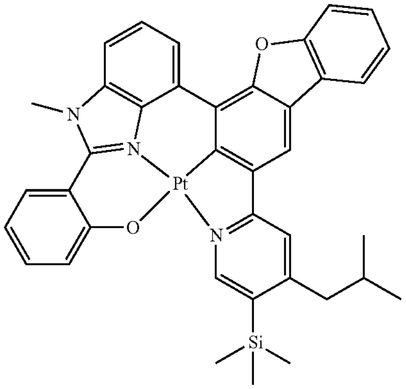
2-11
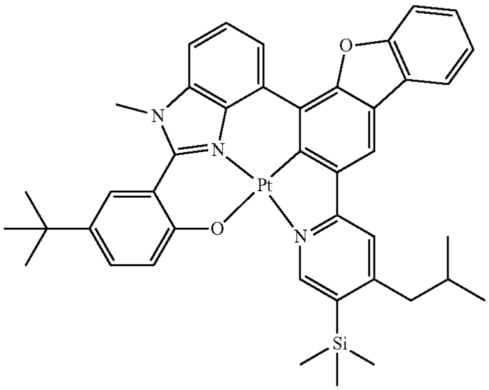
-continued
2-12
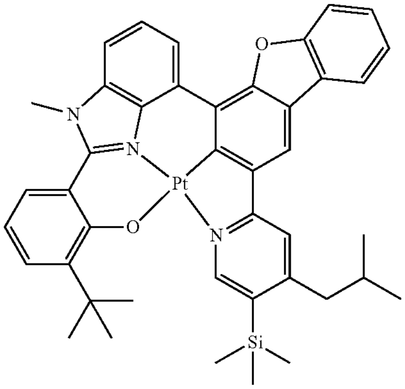
2-13
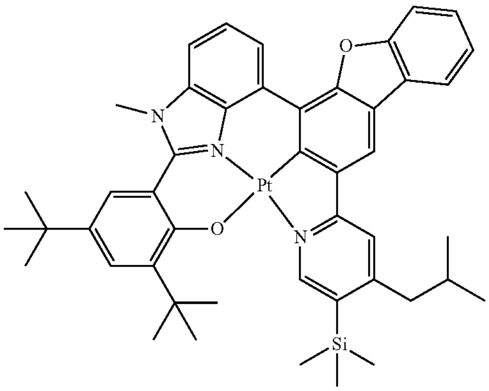
2-14
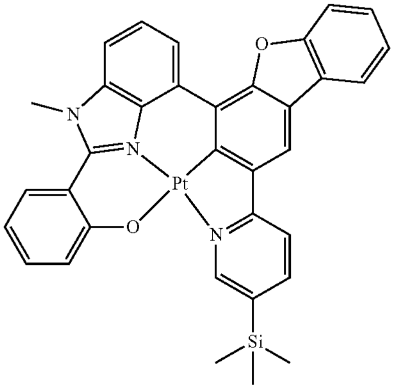
2-15
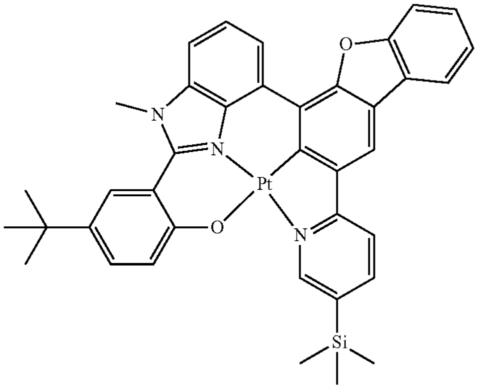

-continued
2-16
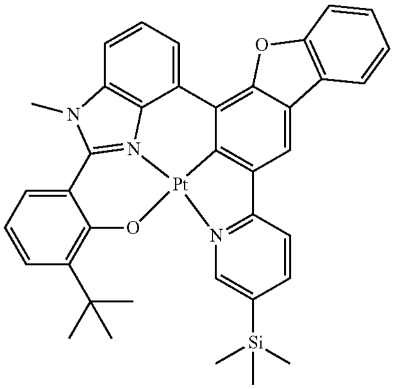
2-17
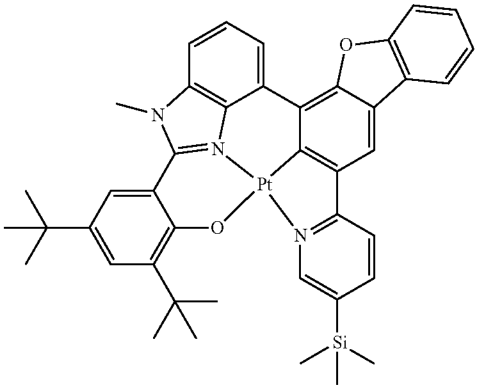
2-18
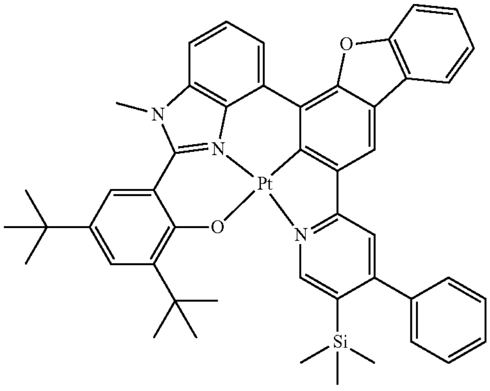
2-19
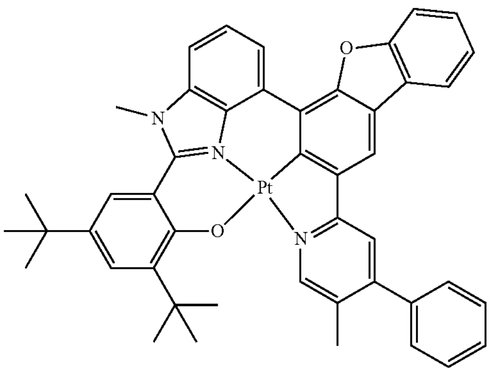
-continued
2-20
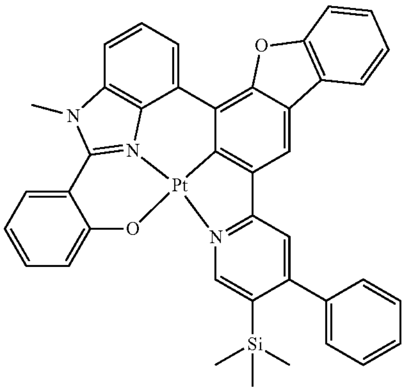
2-21
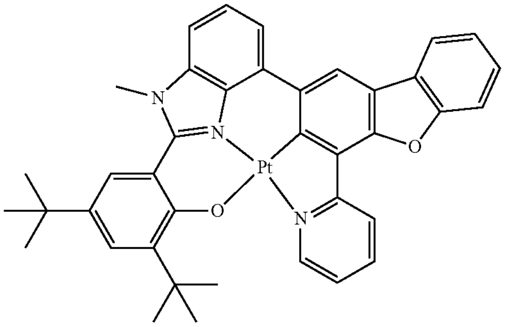
2-22
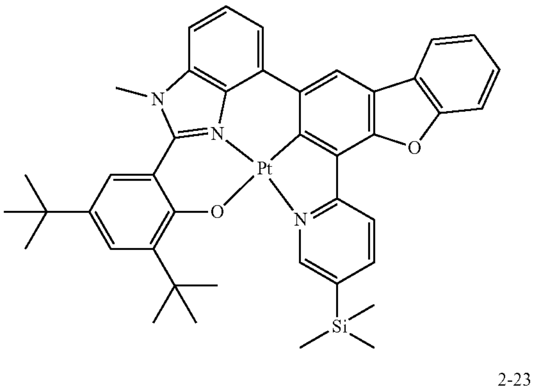
2-23
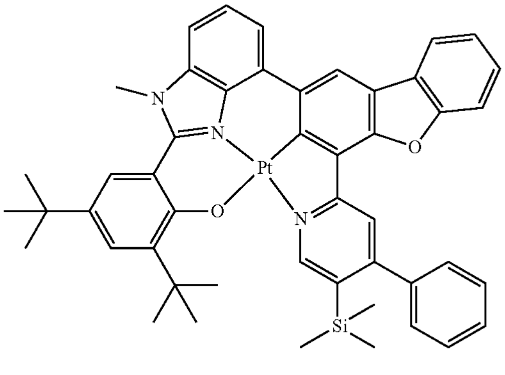

2-24
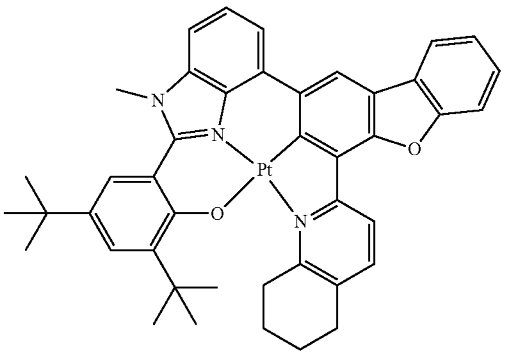
2-25
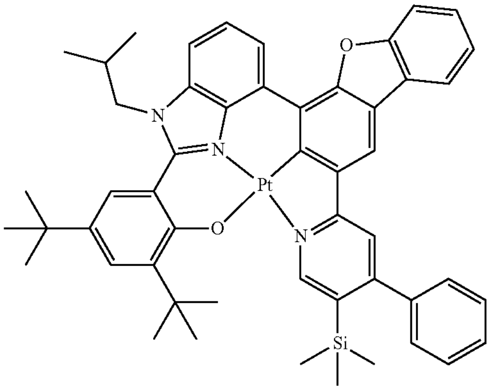
2-26
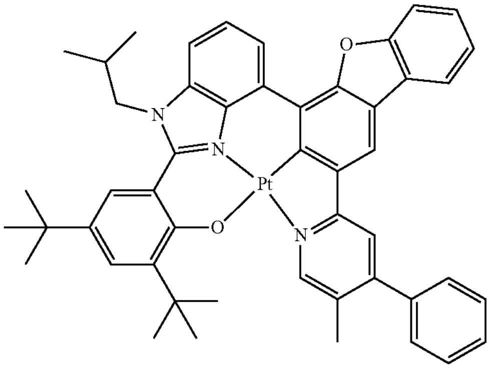
2-27
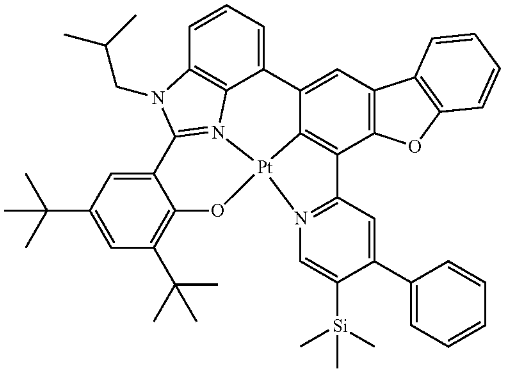
2-28
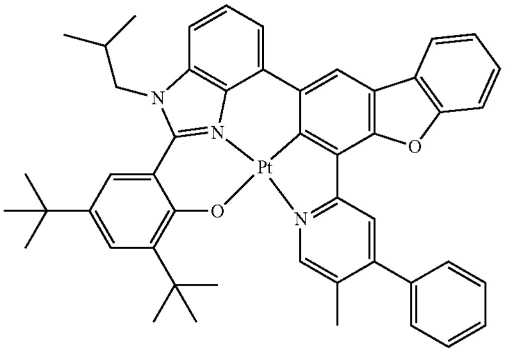
2-29
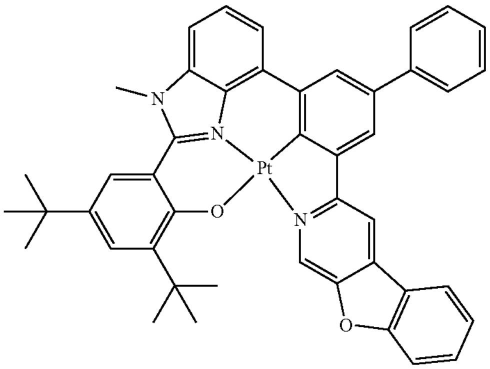
2-30
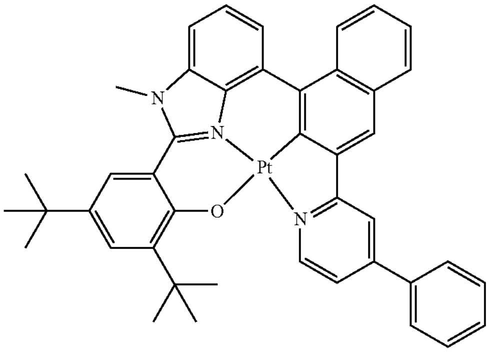
2-31
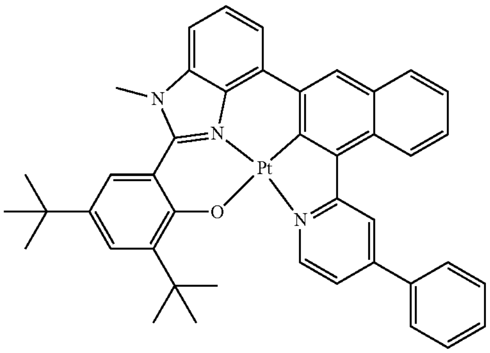

-continued
2-32
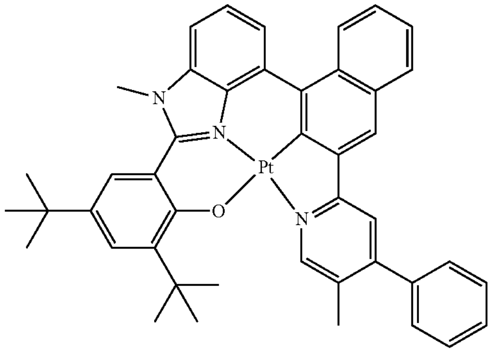
2-33
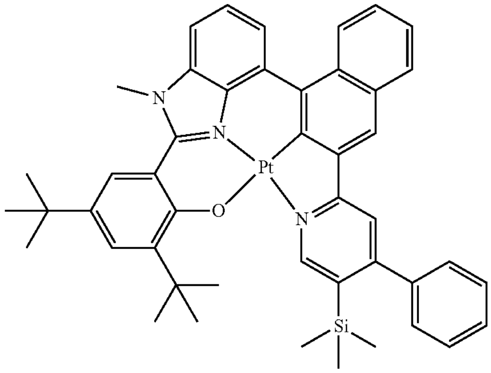
2-34
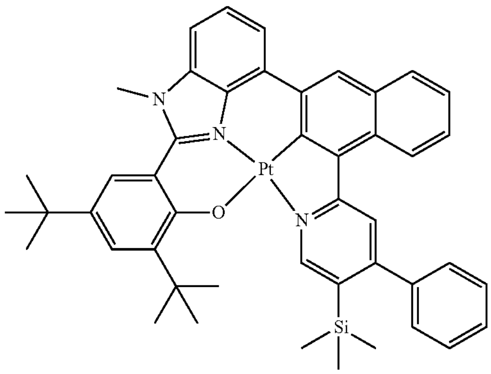
2-35
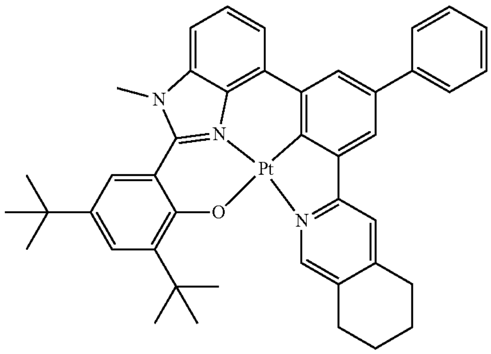
-continued
2-36
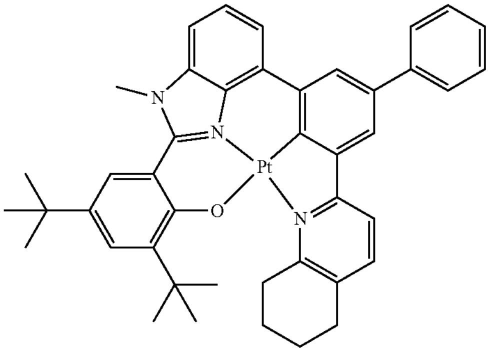
2-37
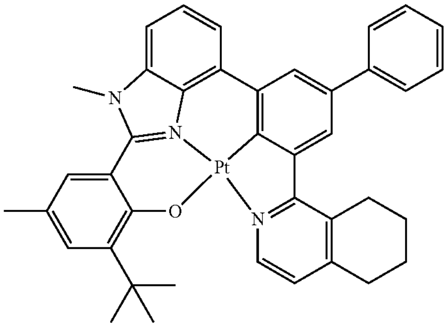
2-38
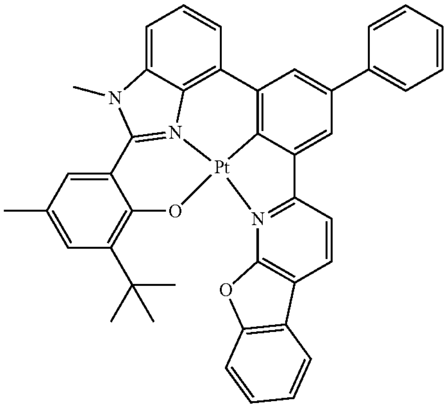
2-39
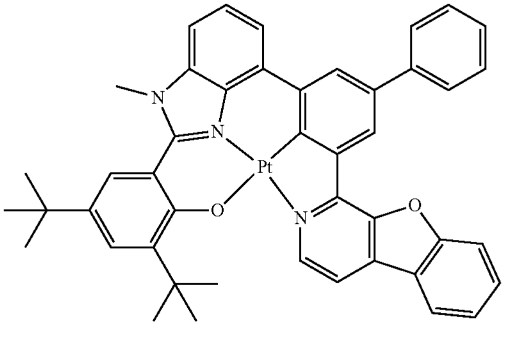

-continued
2-40
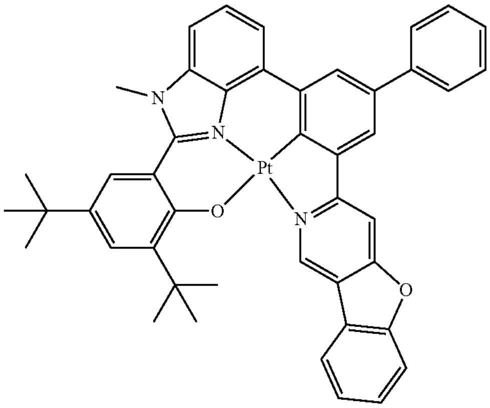
2-41
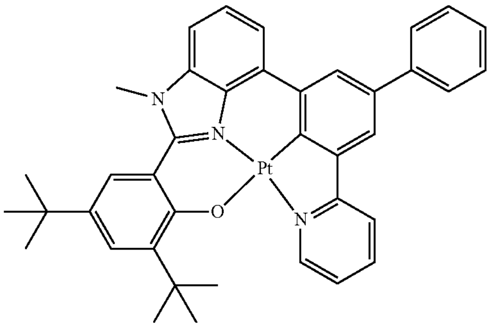
2-42
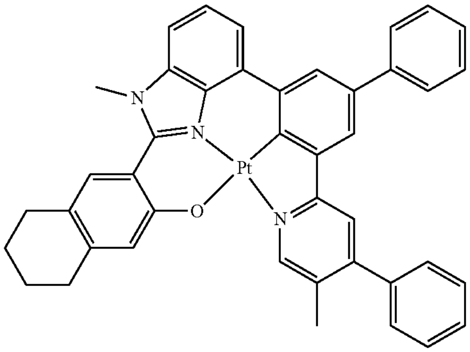
2-43
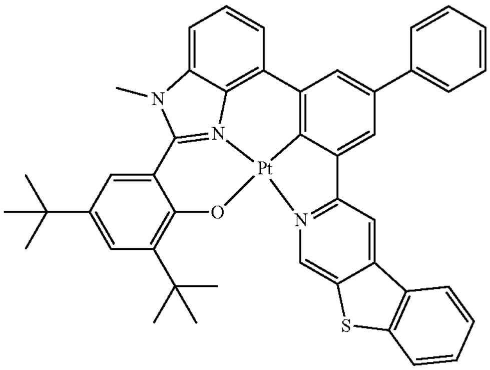
-continued
2-44
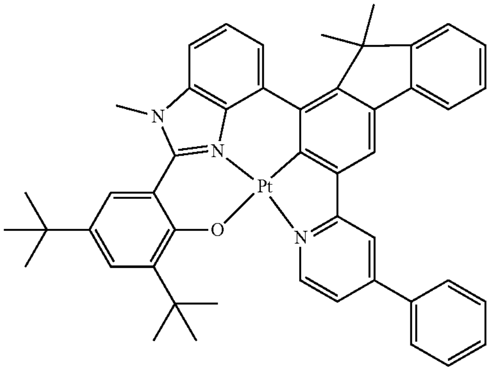
2-45
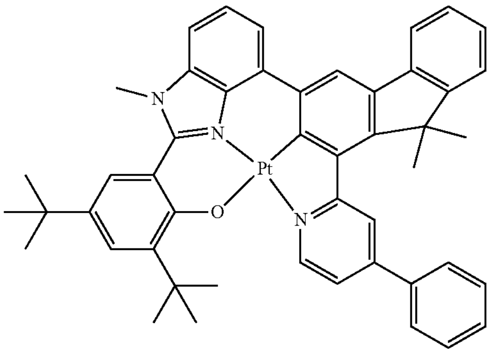
2-46
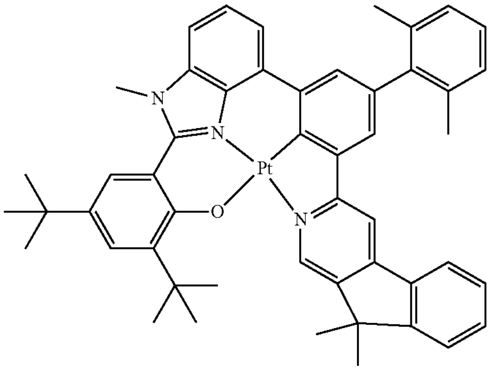
2-47
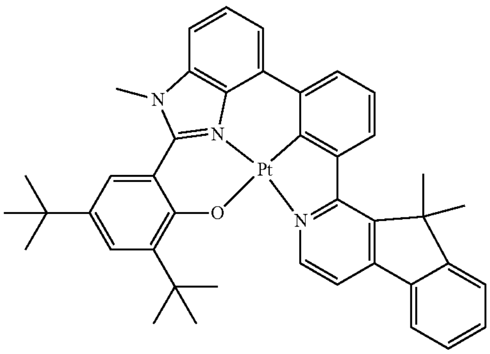

3-1
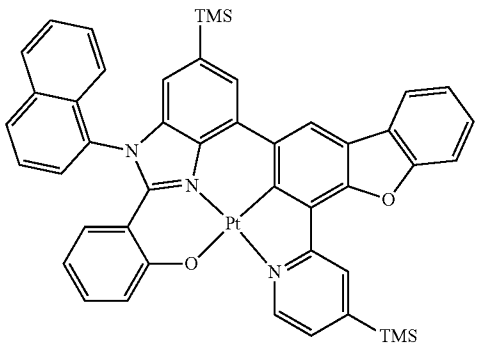
3-2
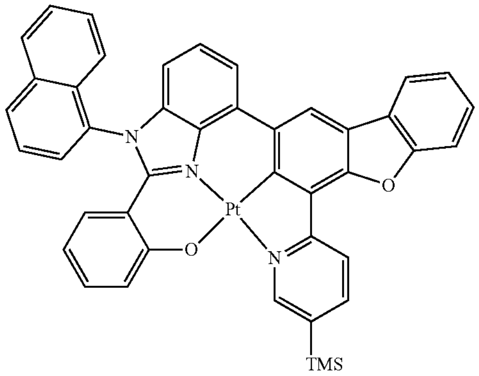
3-3
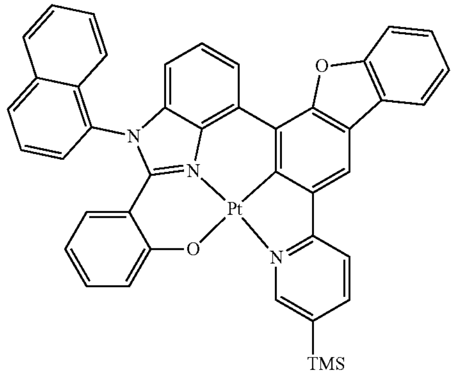
3-4
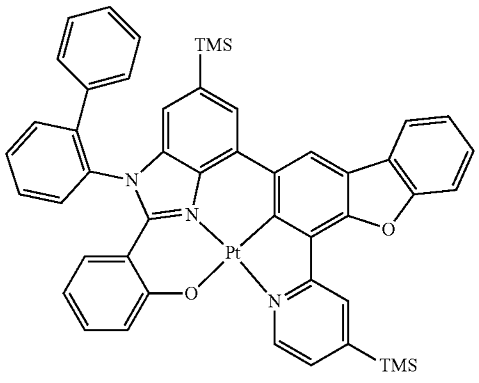
-continued
3-5
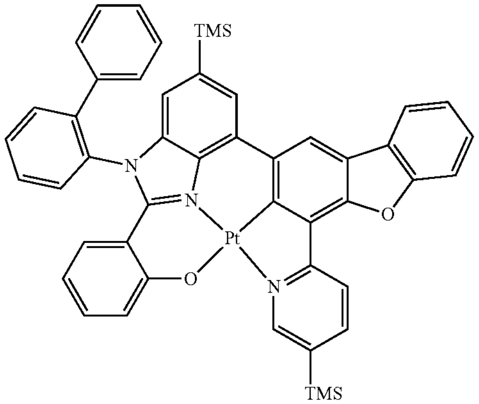
3-6
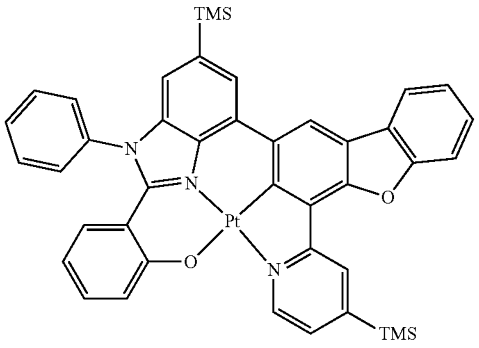
3-7
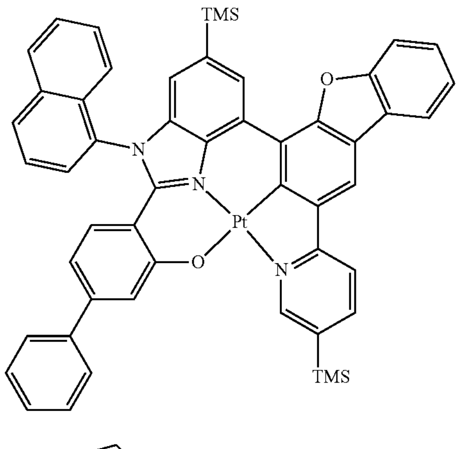
3-8
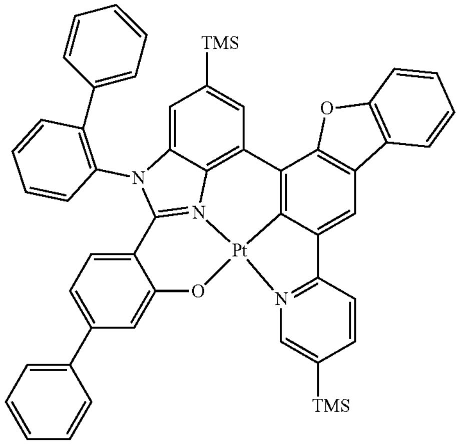

-continued
3-9
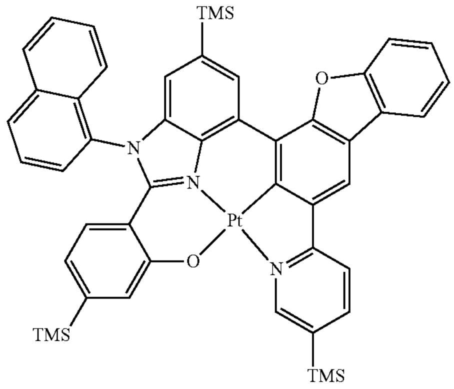
3-10
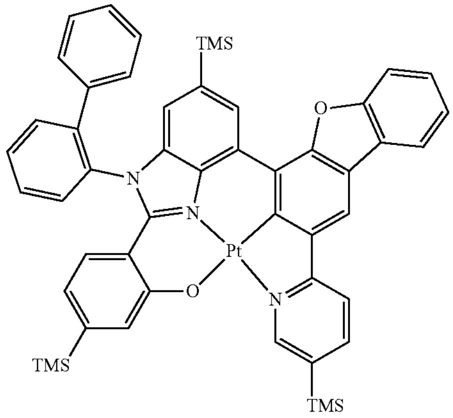
3-11
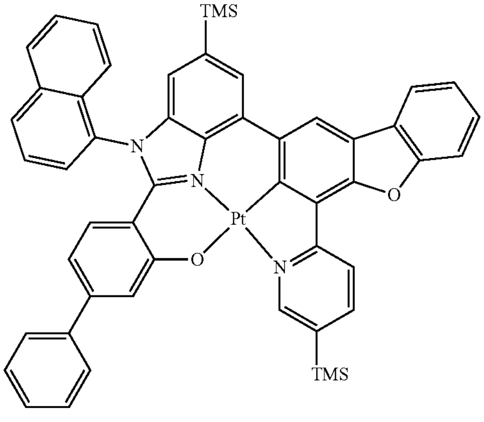
-continued
3-12
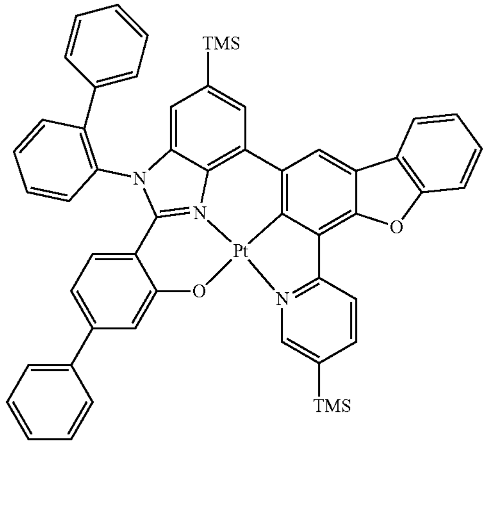
3-13
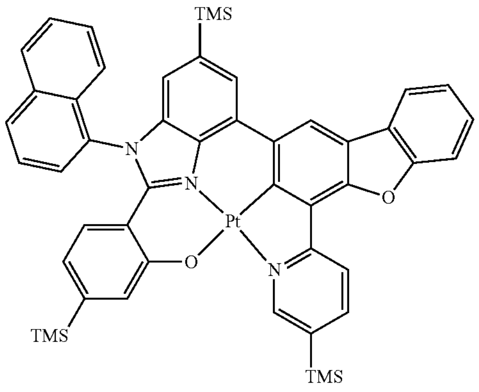
3-14
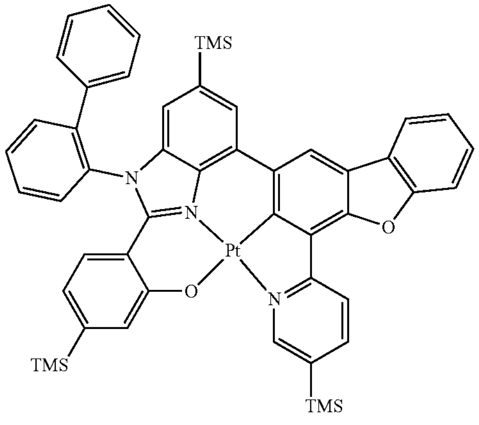

-continued
3-15
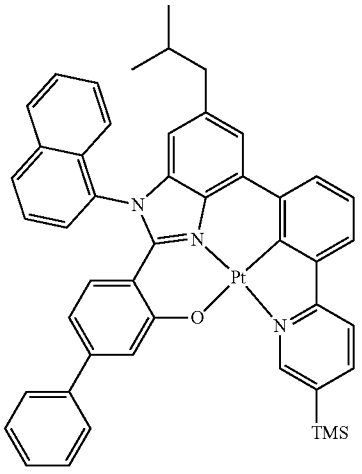
3-16
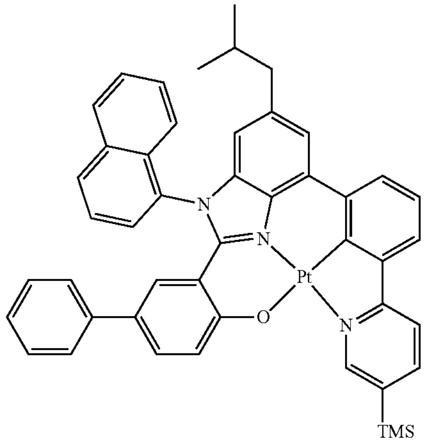
3-17
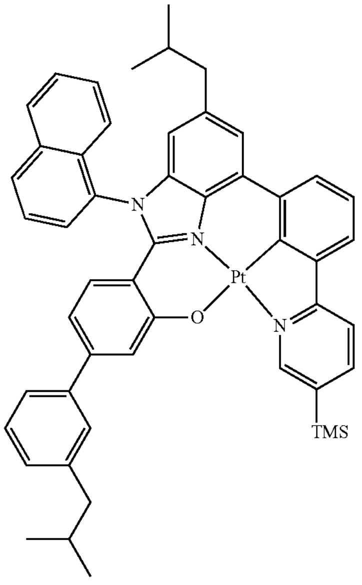
-continued
3-18
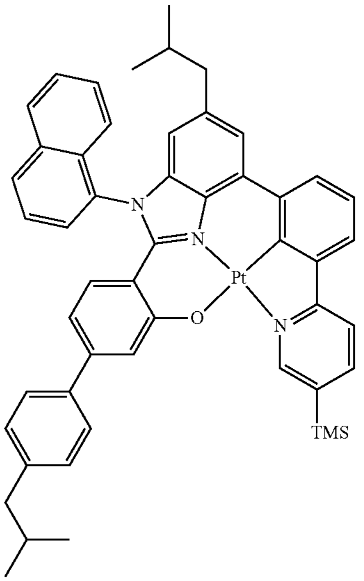
3-19
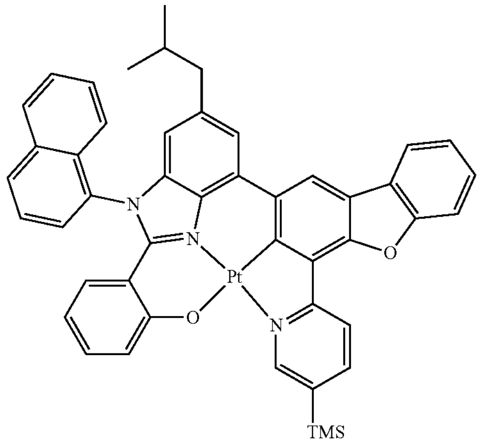
3-20
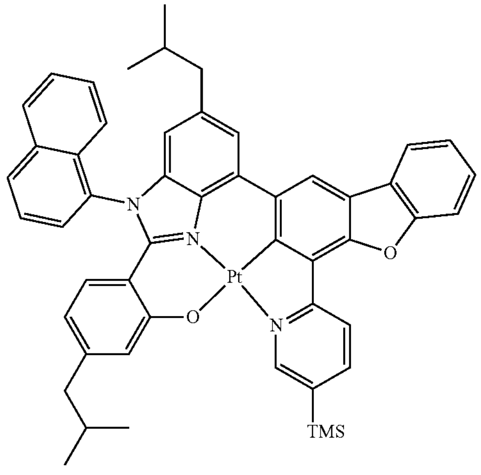

-continued
3-21
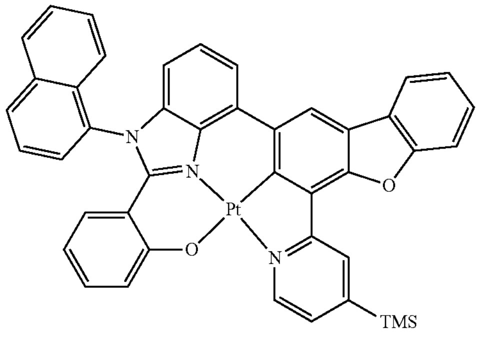
3-22
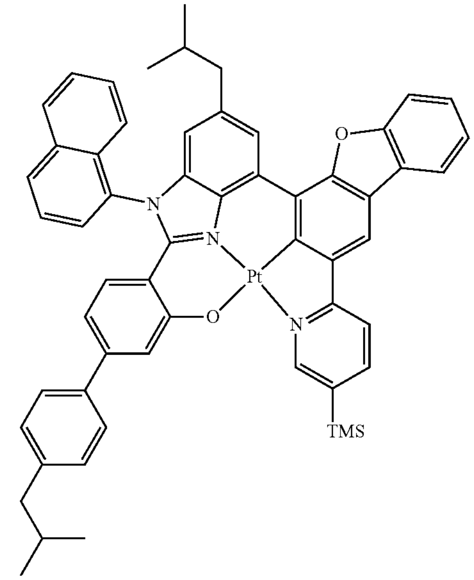
3-23
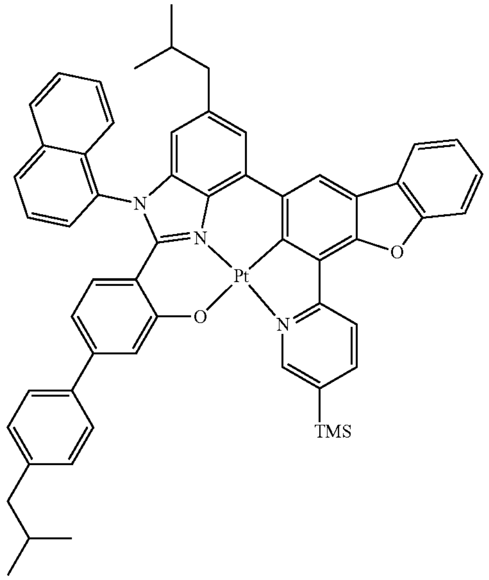
-continued
3-24
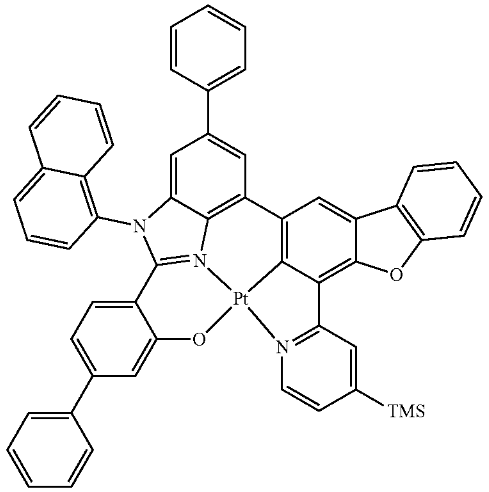
3-25
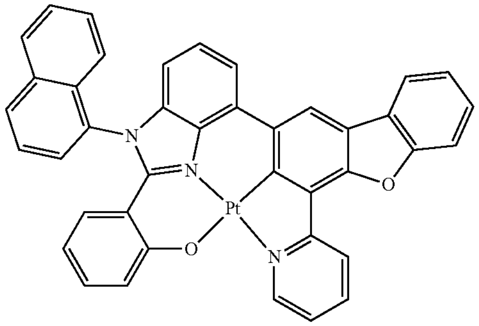
3-26
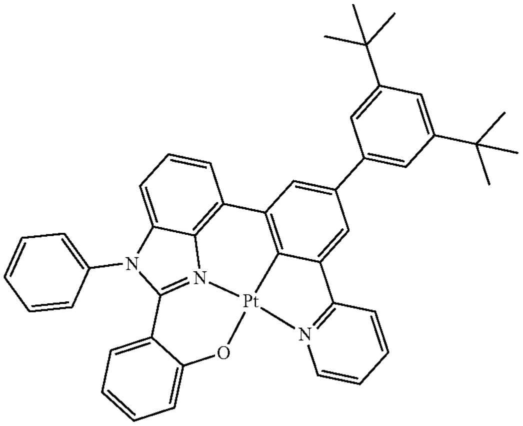

-continued
3-27
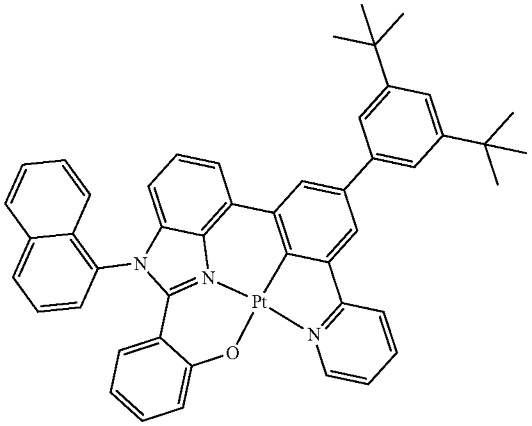
3-28
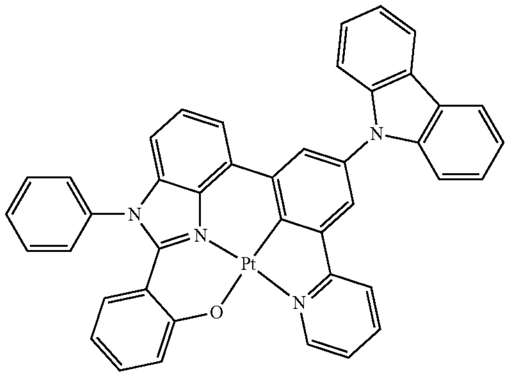
3-29
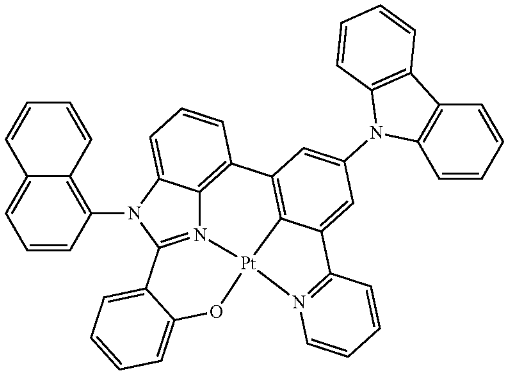
-continued
3-30
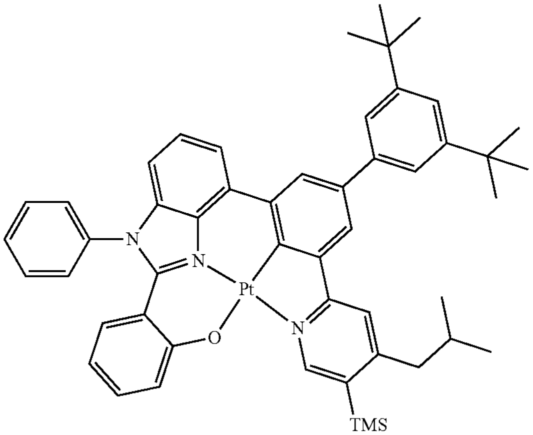
3-31
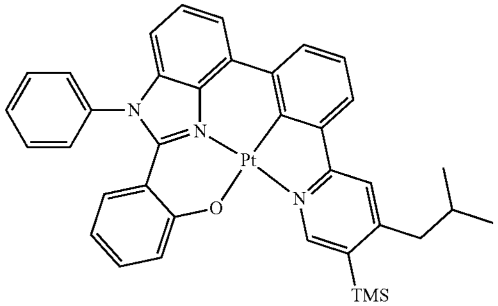
3-32
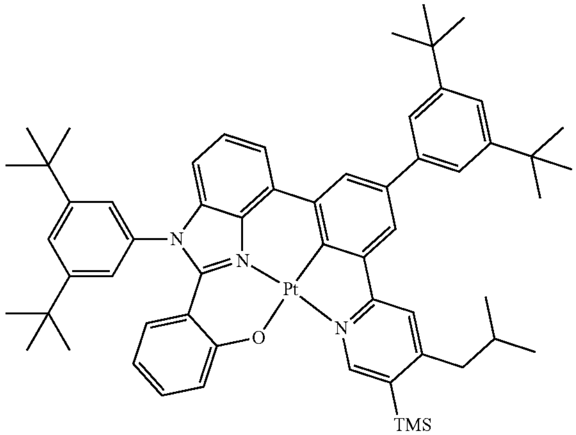
3-33
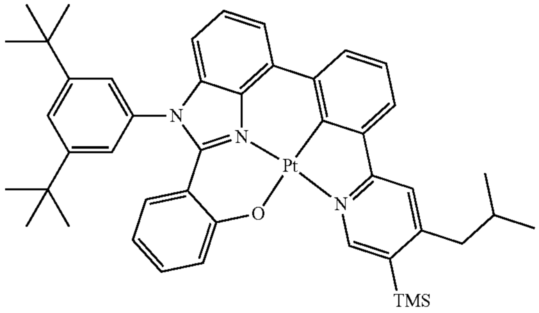

-continued
3-34
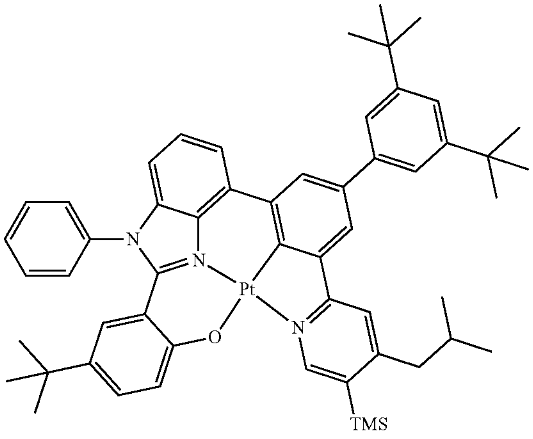
3-35
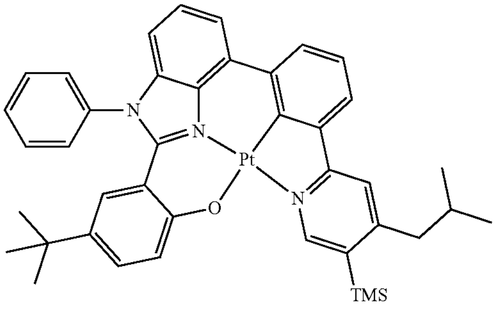
3-36
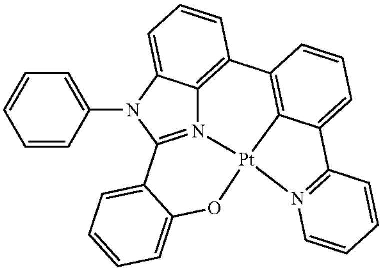
3-37
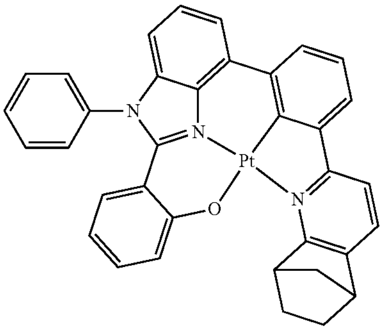
-continued
3-38
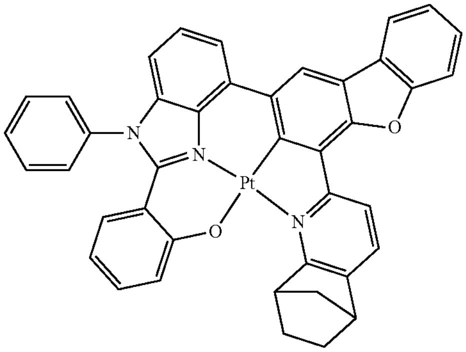
3-39
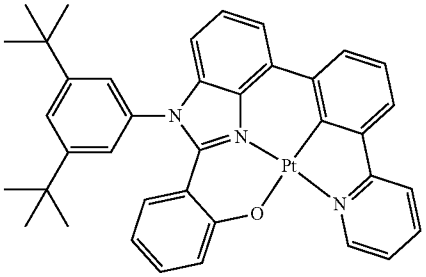
3-40
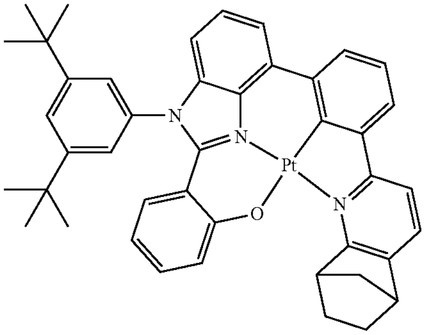
3-41
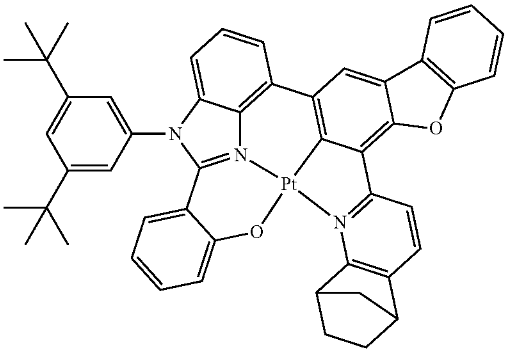
3-42
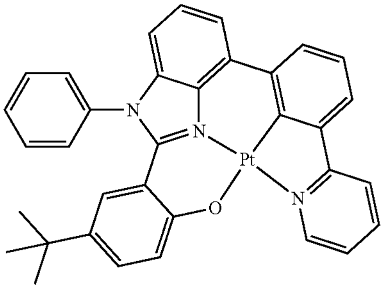

-continued
3-43
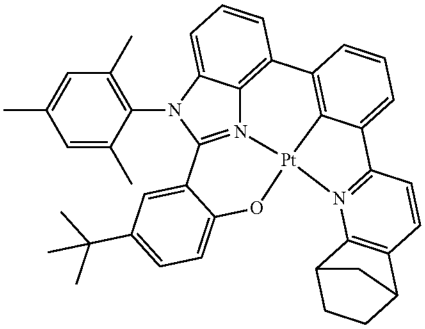
3-44
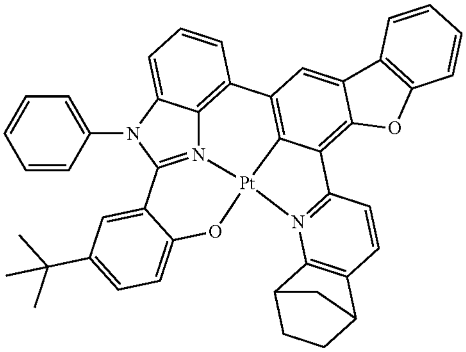
3-45
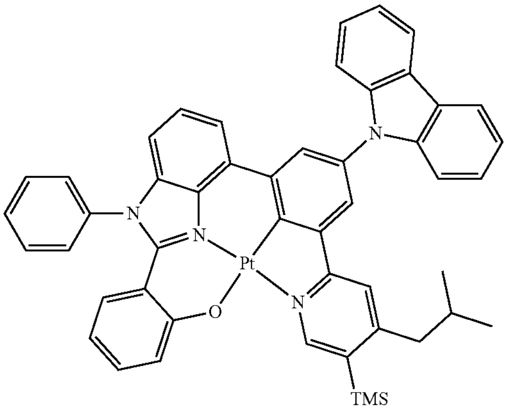
3-46
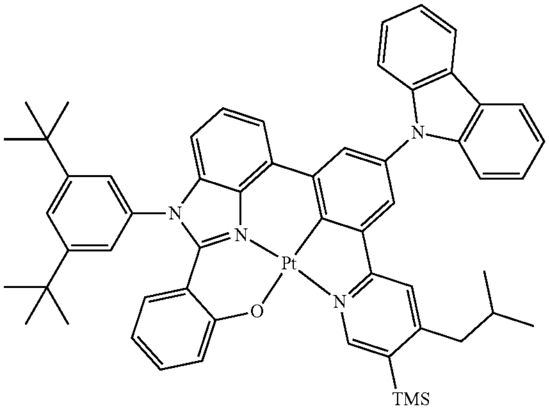
-continued
3-47
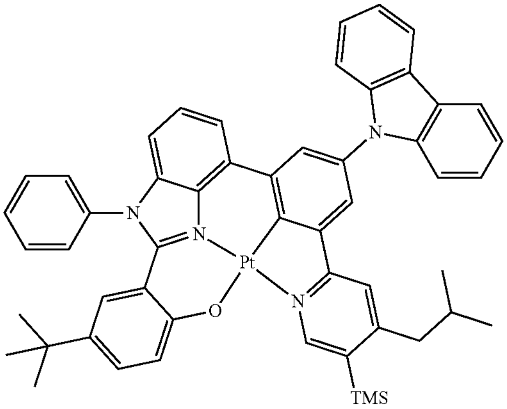
3-48
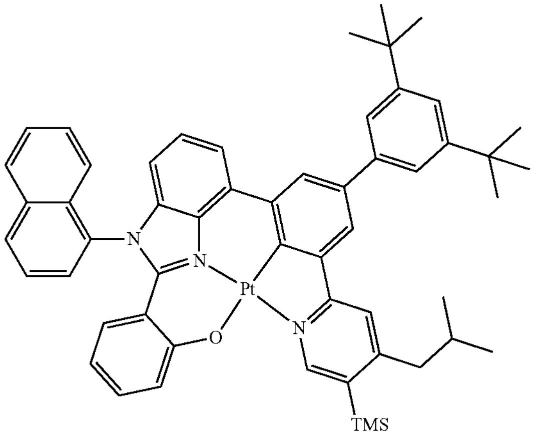
3-49
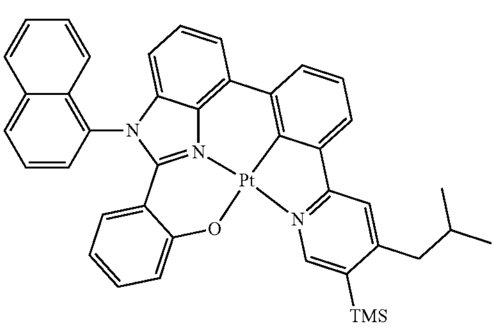

-continued
3-50
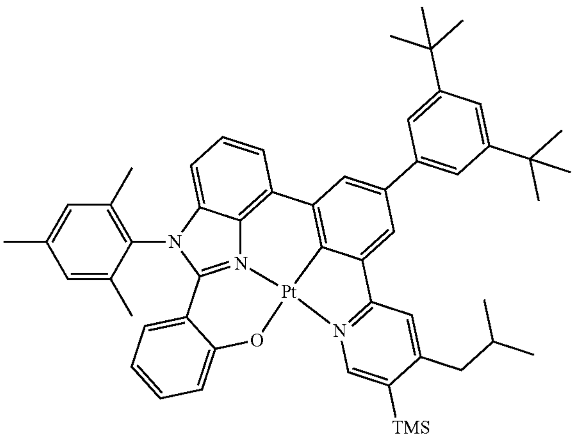
3-51
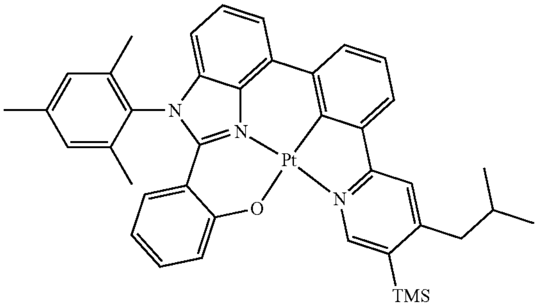
3-52
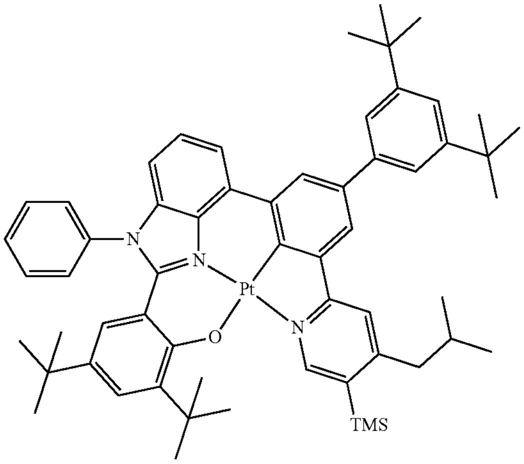
3-53
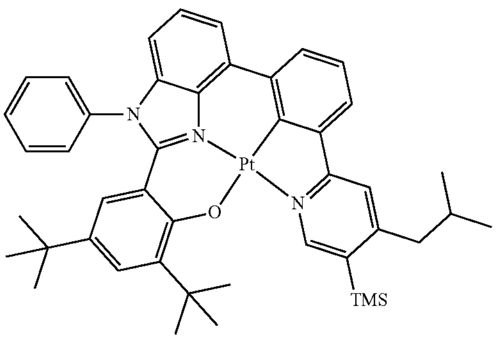
-continued
3-54
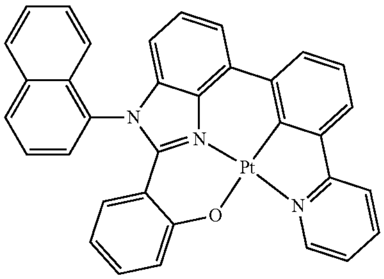
3-55
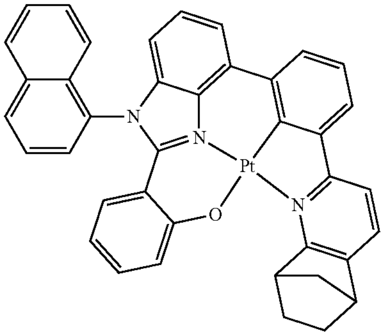
3-56
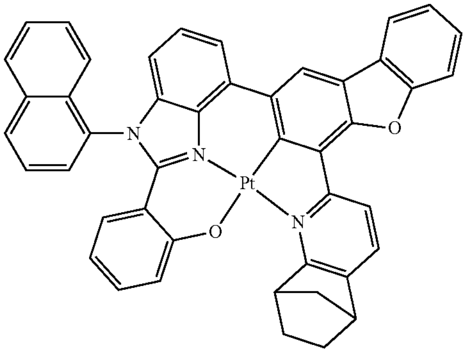
3-57
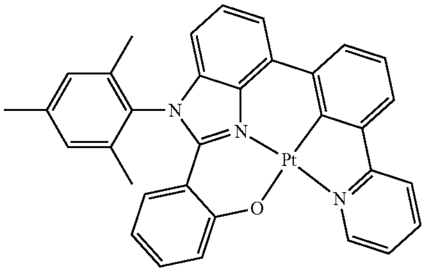
3-58
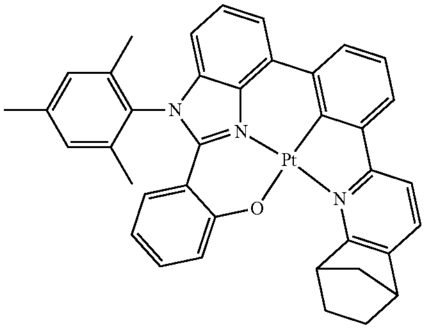

-continued
3-59
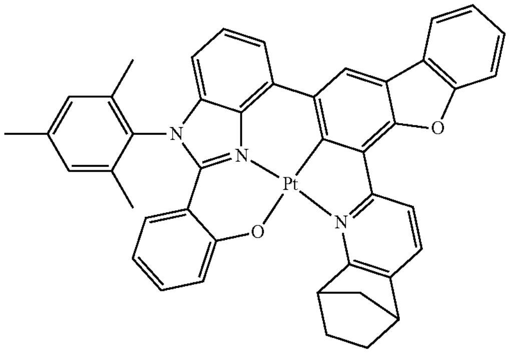
3-60
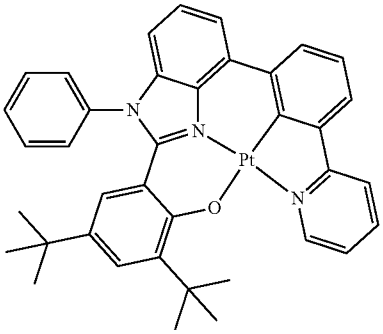
3-61
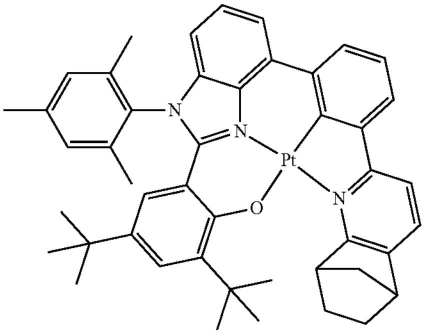
3-62
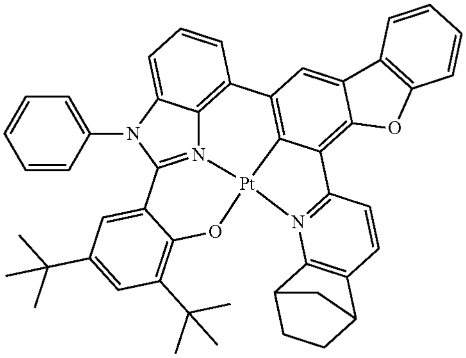
-continued
3-63
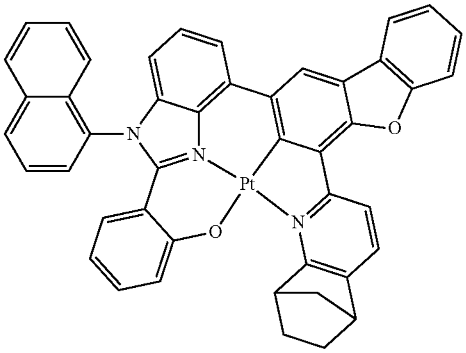
3-64
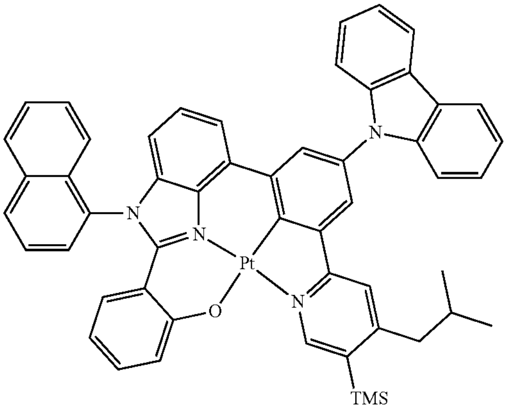
3-65
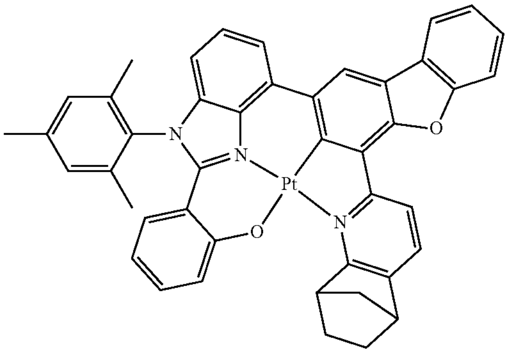
3-66
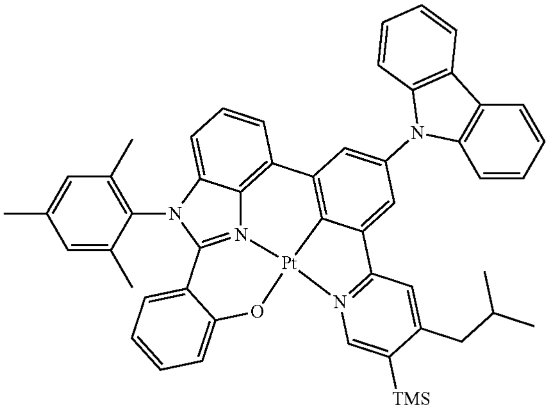

-continued
3-67
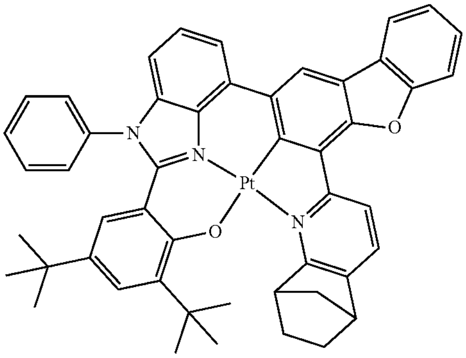
3-68
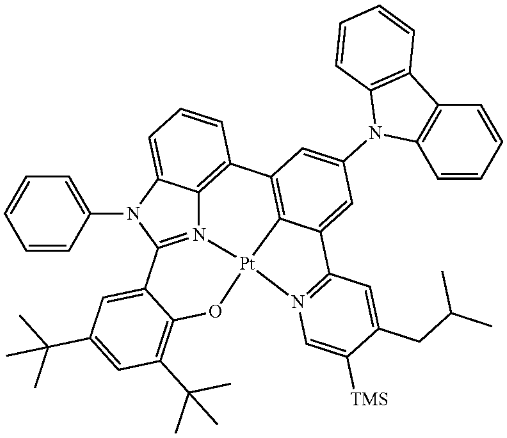
3-69
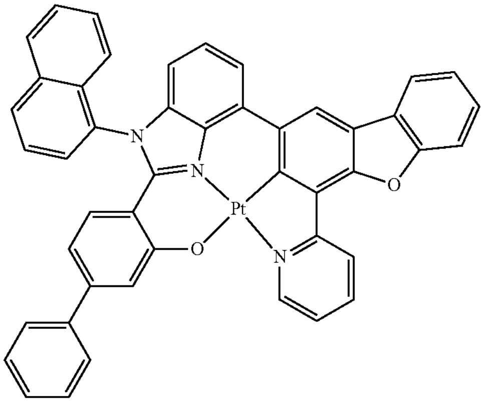
3-70
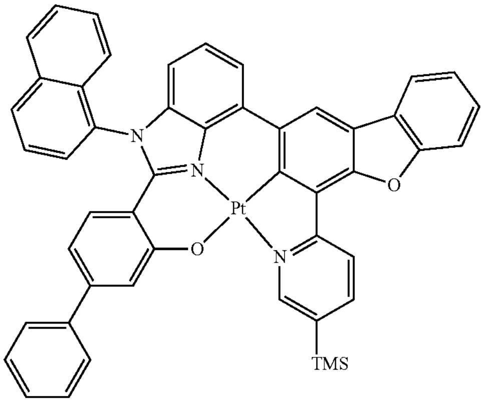
-continued
3-71
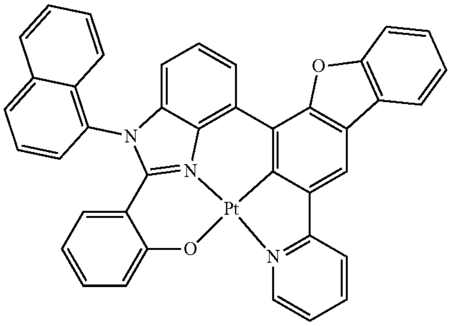
3-72
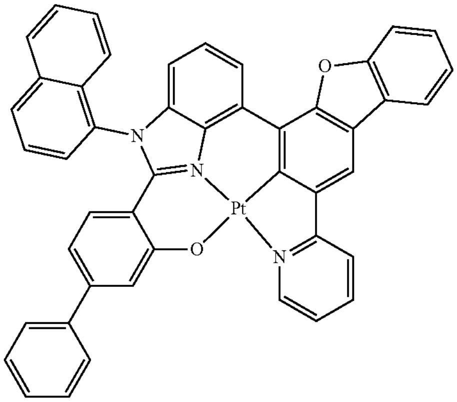
3-73
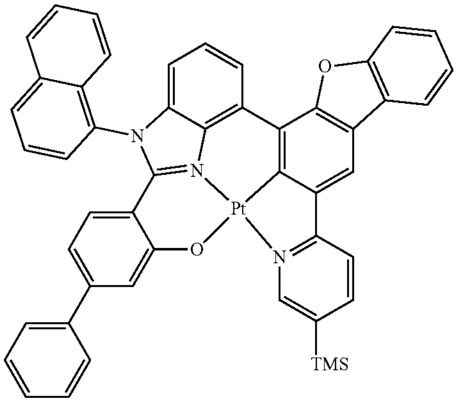
3-74
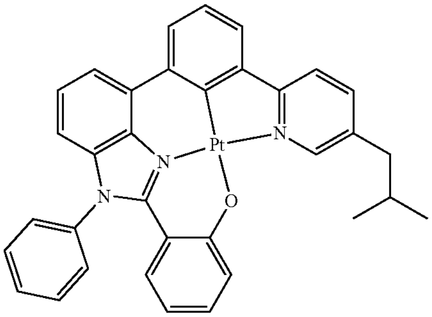

3-75
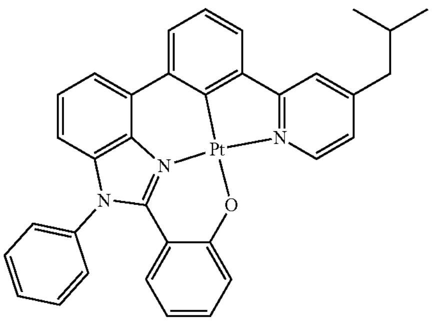
3-76
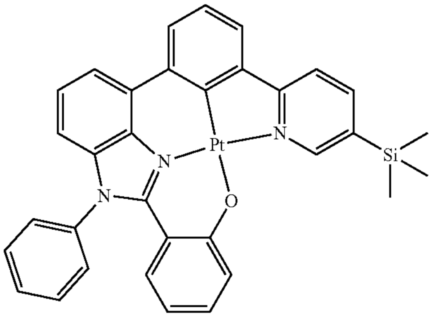
3-77
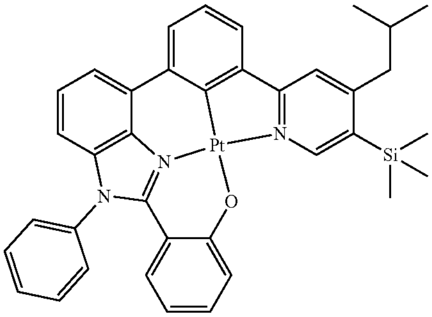
3-78
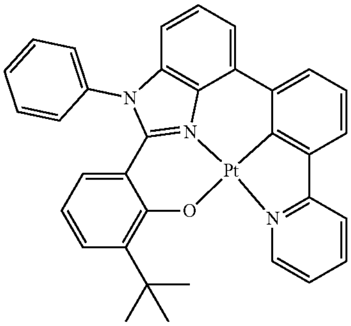
3-79
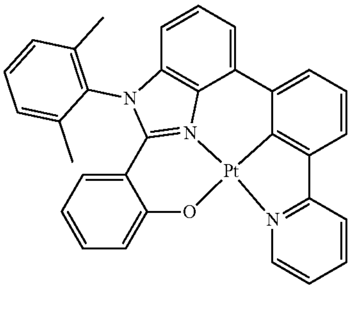
3-80
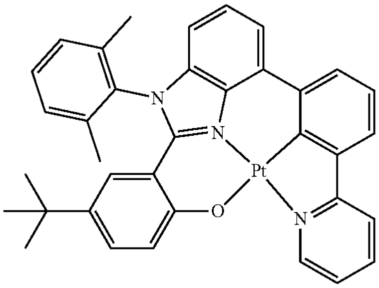
3-81
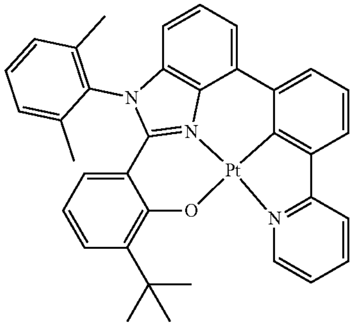
3-82
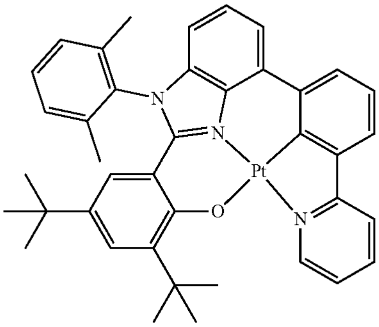
3-83
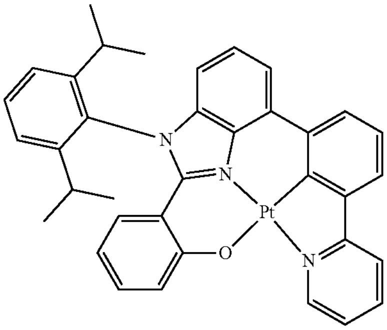
3-84
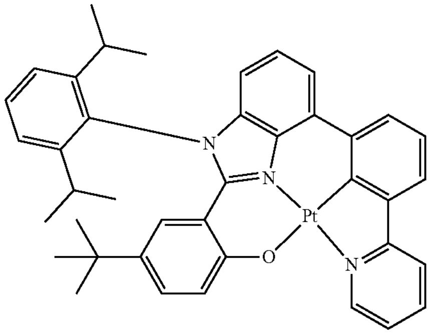

-continued
3-85
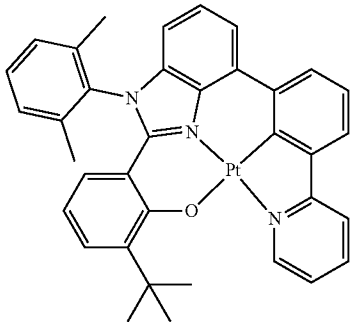
3-86
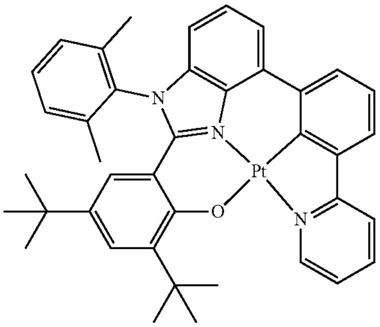
3-87
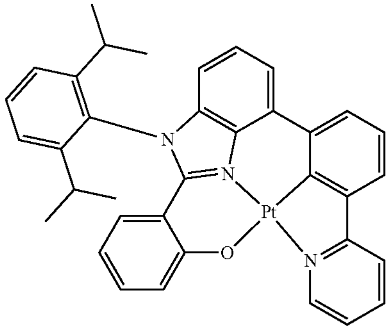
3-88
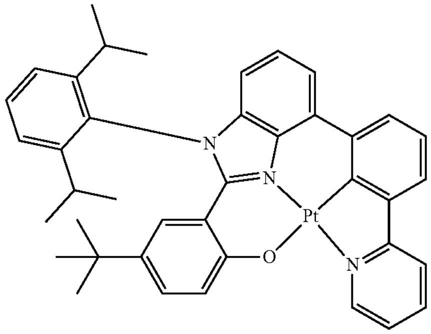
-continued
3-89
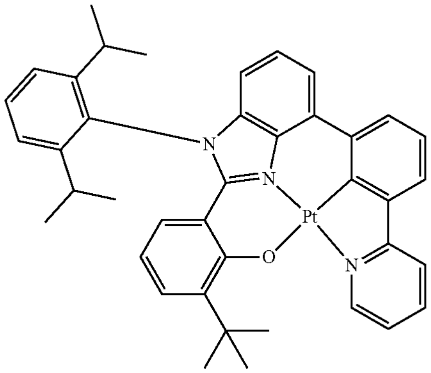
3-90
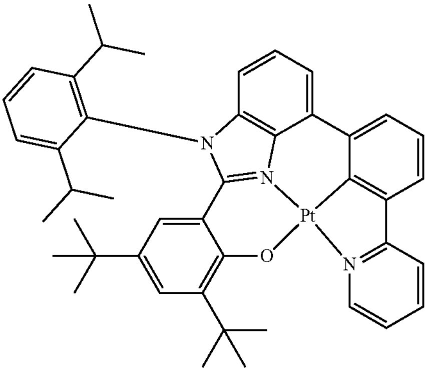
3-91
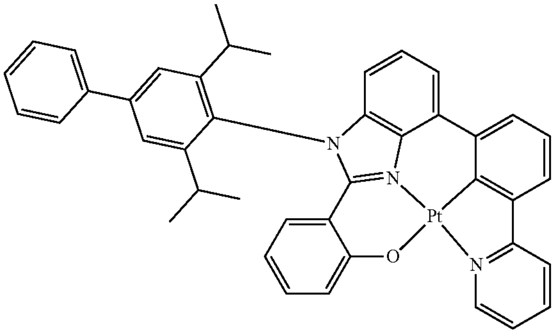
3-92
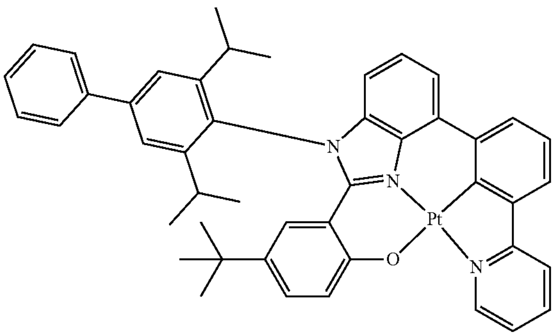

-continued
3-93
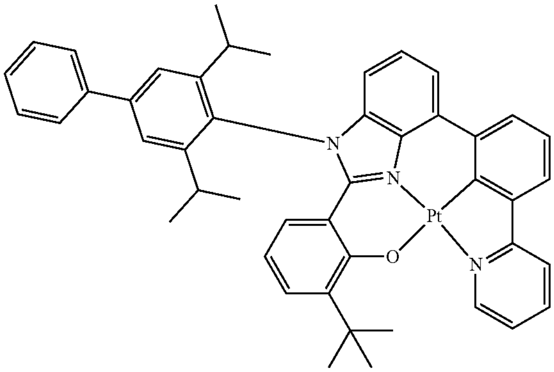
3-94
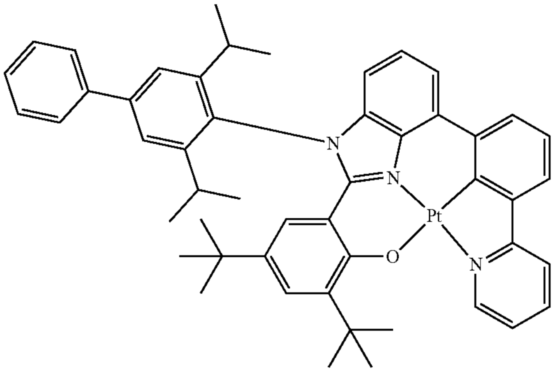
3-95
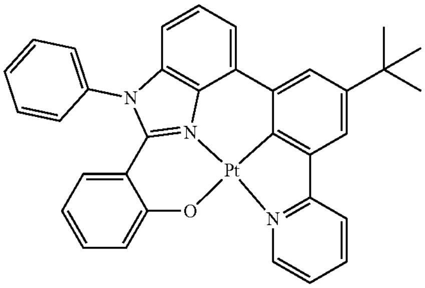
3-96
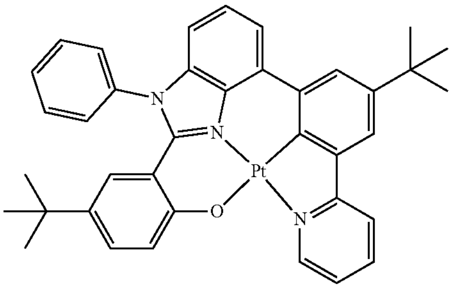
-continued
3-97
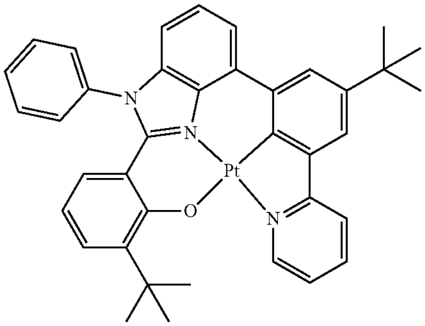
3-98
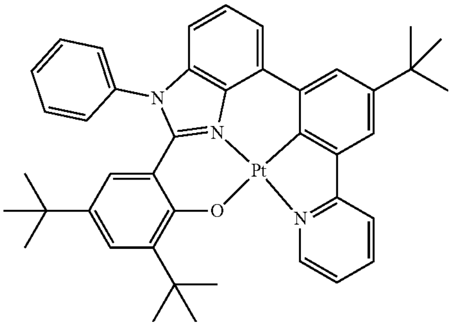
3-99
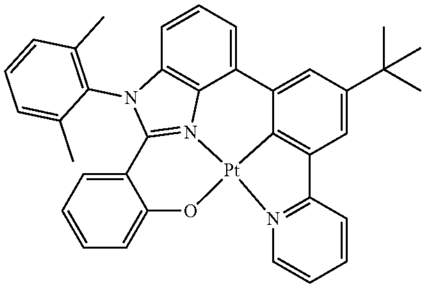
3-100
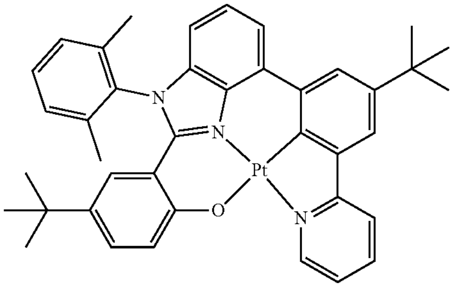
3-101
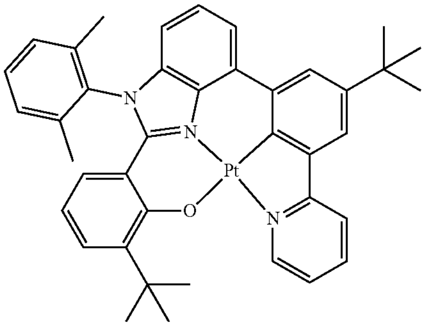

-continued
3-102
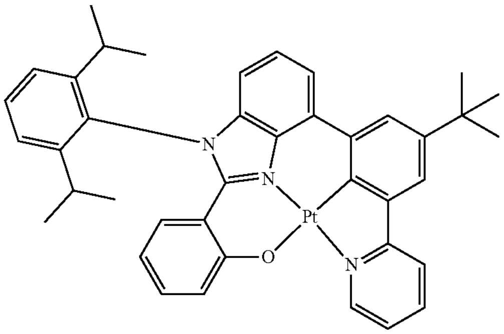
3-103
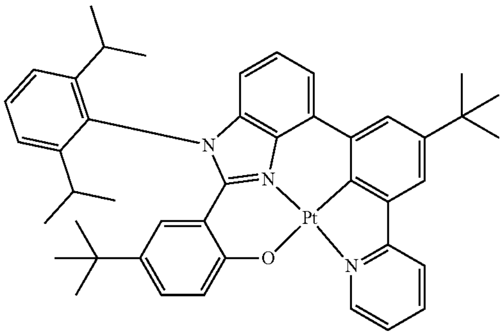
3-104
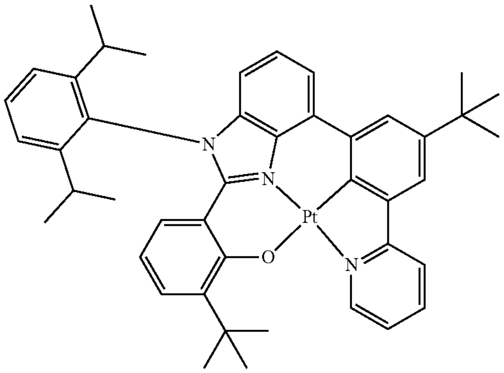
3-105
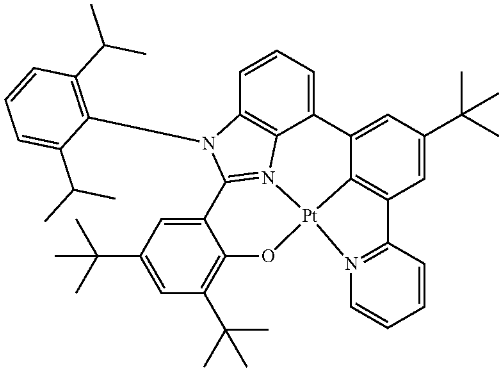
-continued
3-106
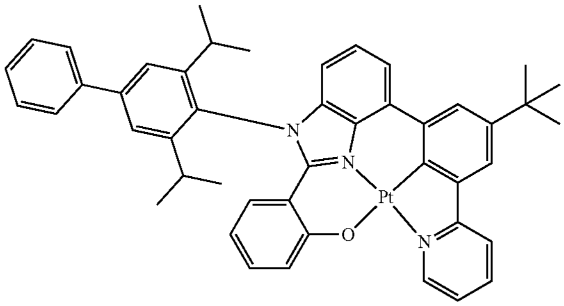
3-107
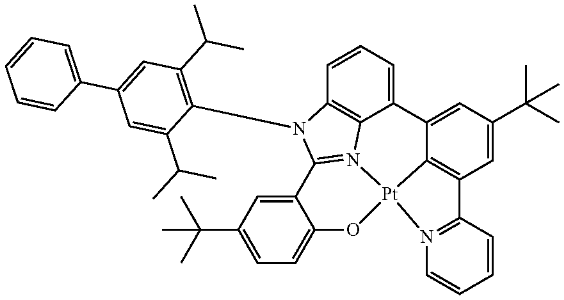
3-108
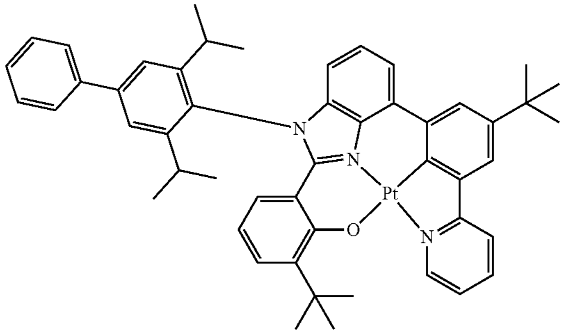
3-109
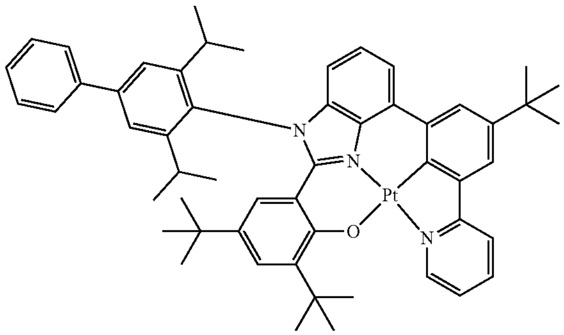

3-110
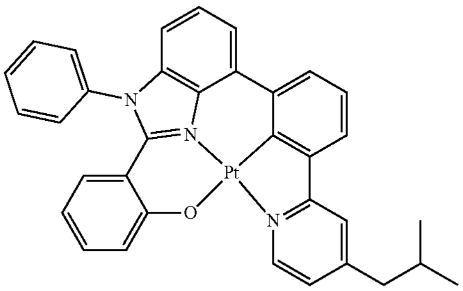
3-111
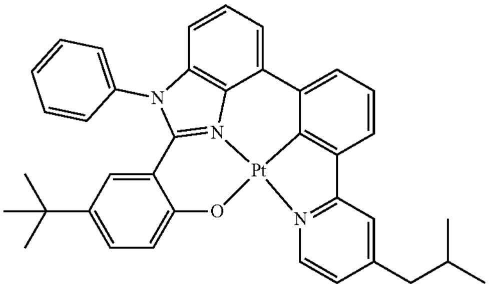
3-112
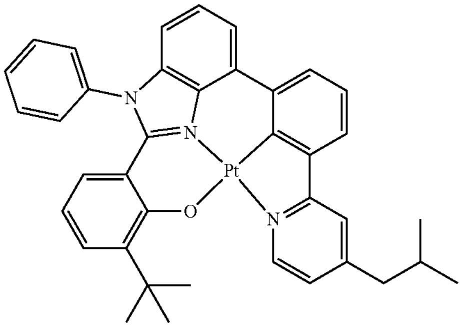
3-113
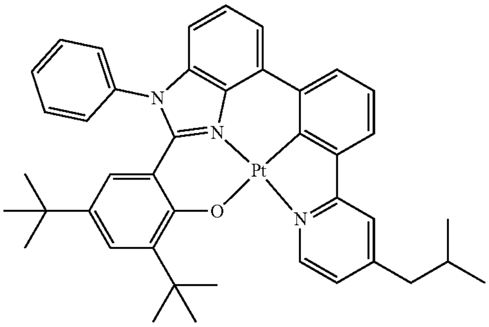
3-114
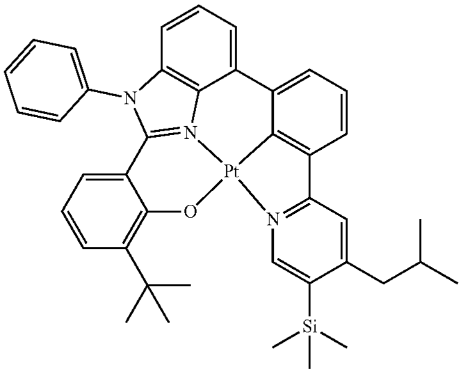
3-115
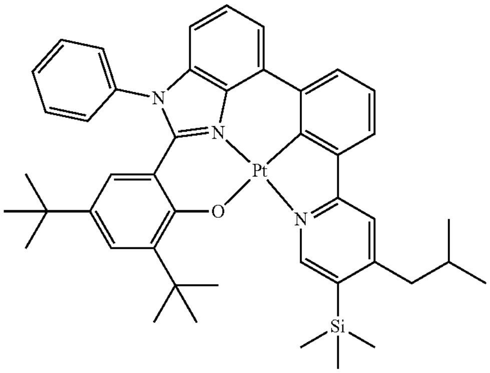
3-116
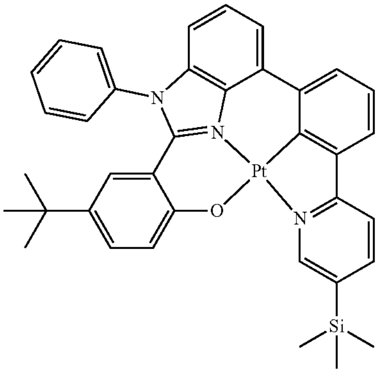
3-117
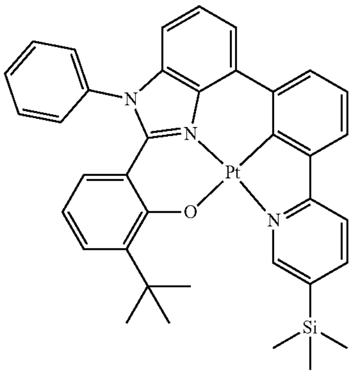

-continued
3-118
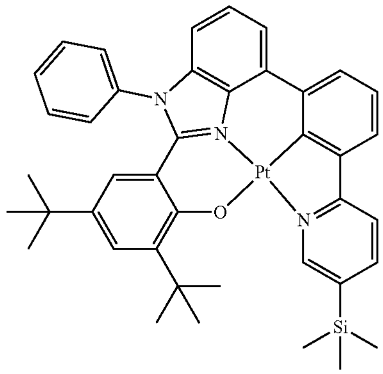
3-119
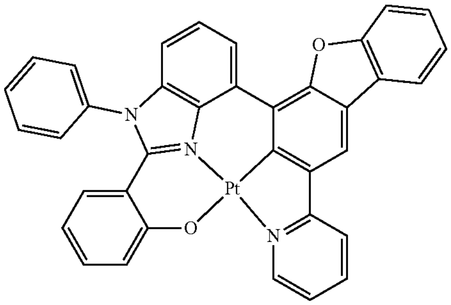
3-120
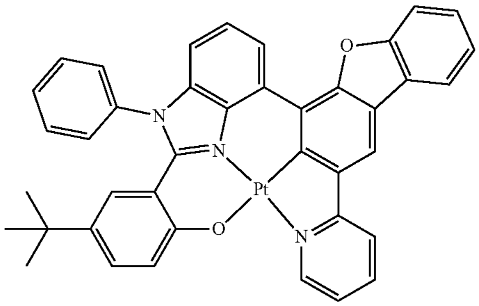
3-121
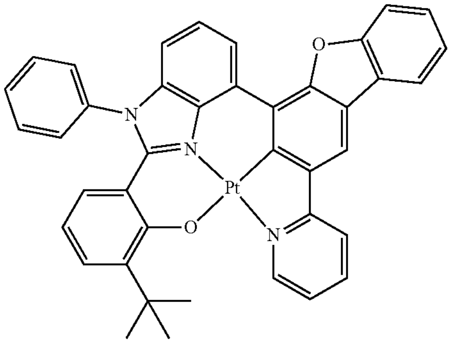
-continued
3-122
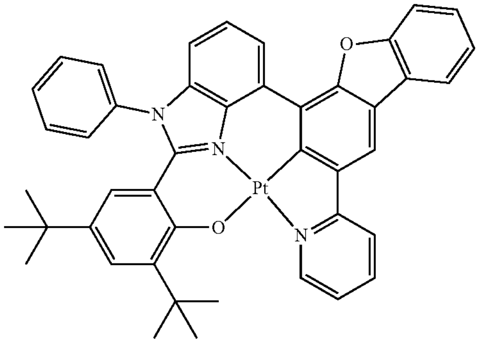
3-123
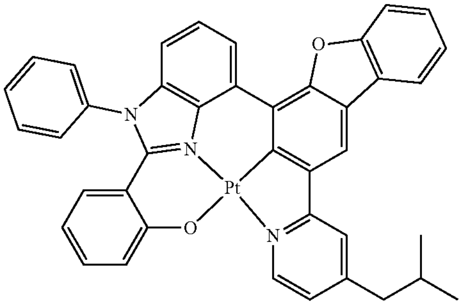
3-124
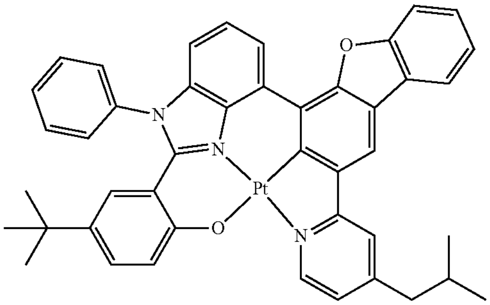
3-125
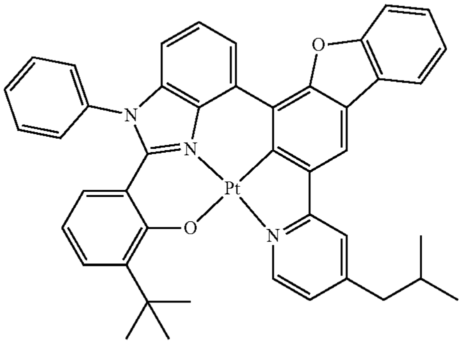

-continued
3-126
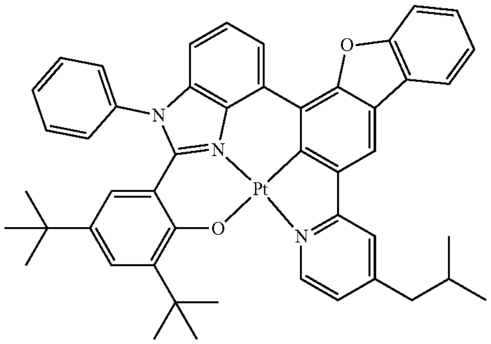
3-127
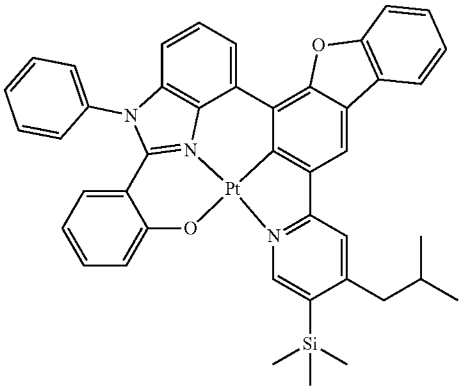
3-128
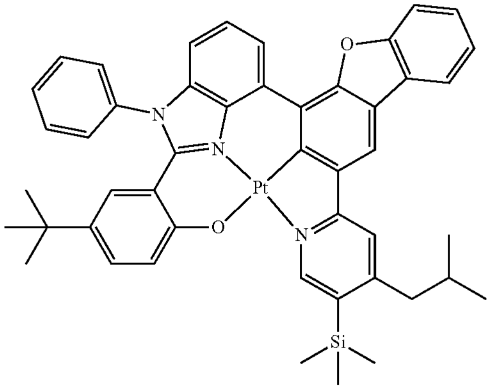
3-129
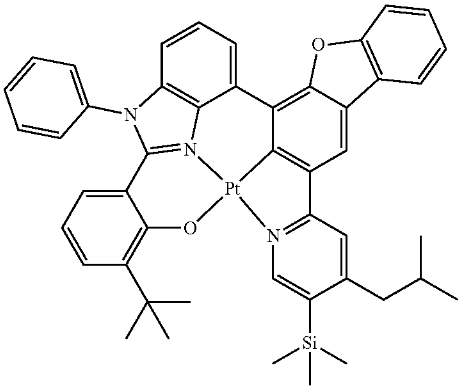
-continued
3-130
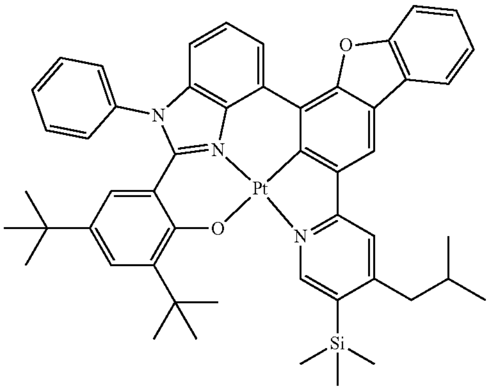
3-131
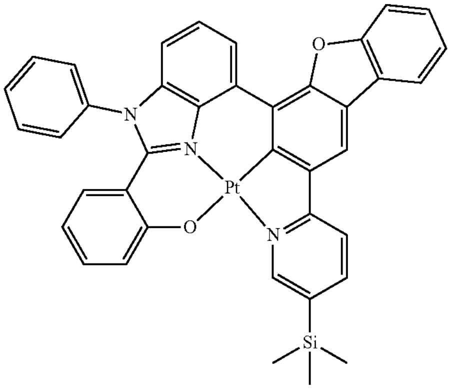
3-132
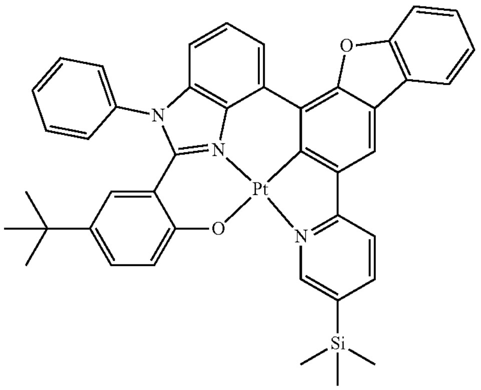
3-133
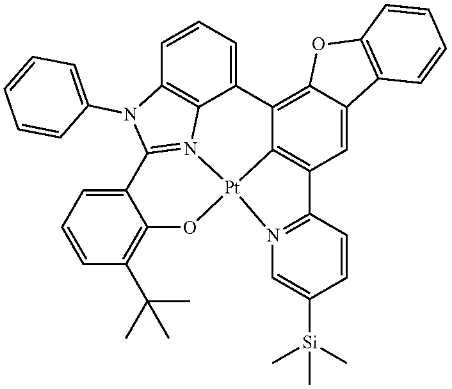

-continued
3-134
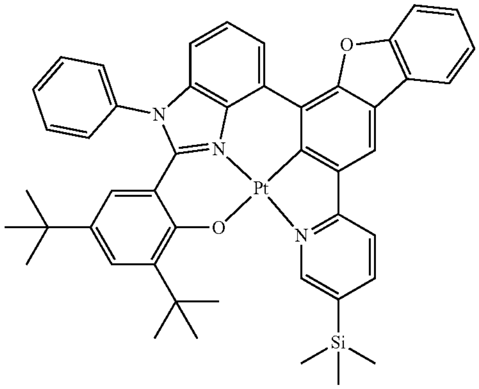
3-135
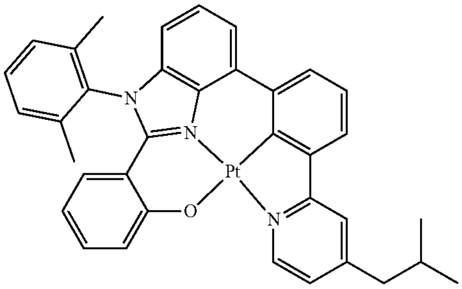
3-136
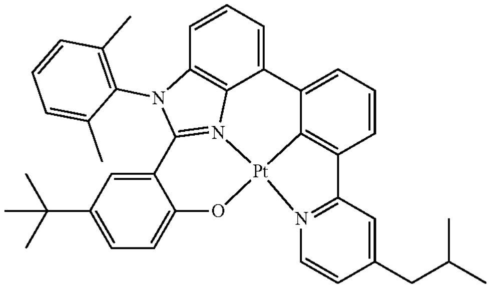
3-137
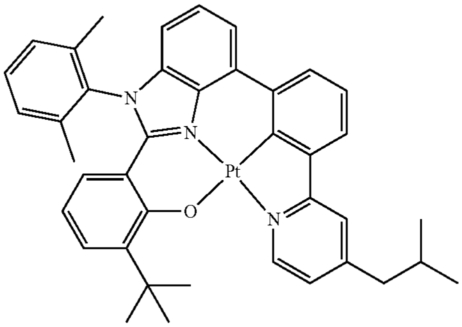
3-138
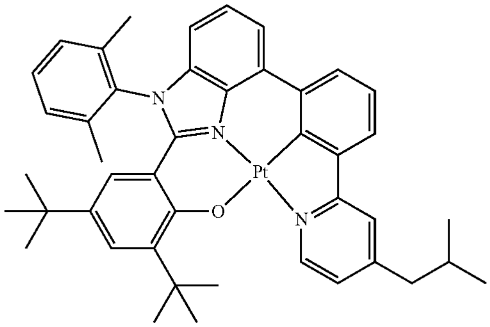
-continued
3-139
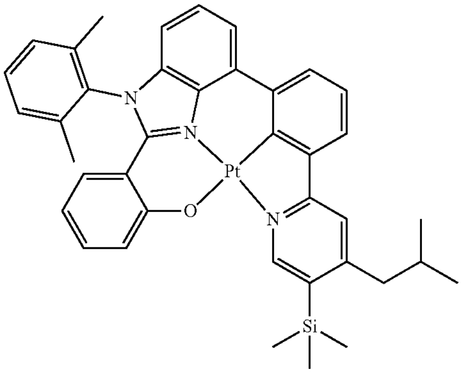
3-140
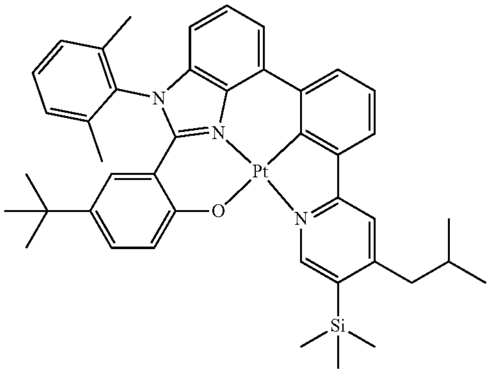
3-141
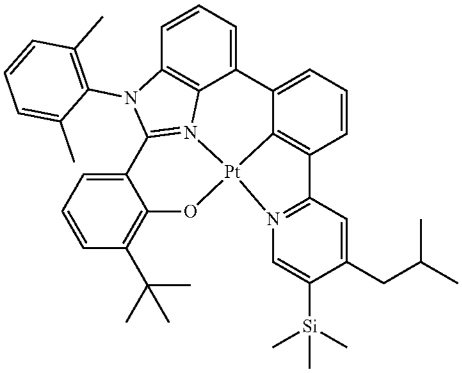
3-142
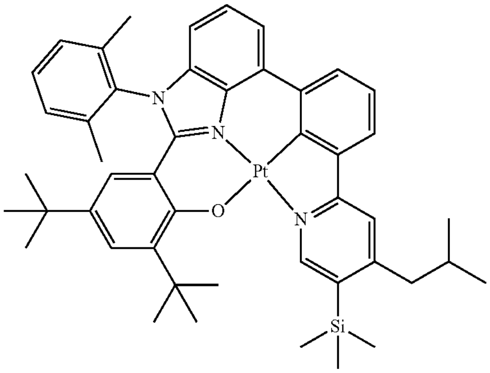

3-143
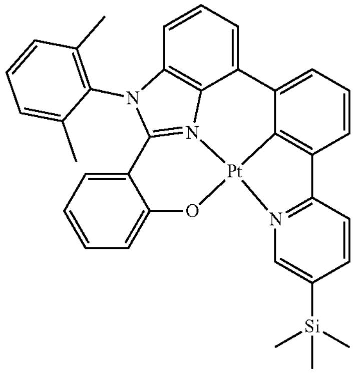
3-144
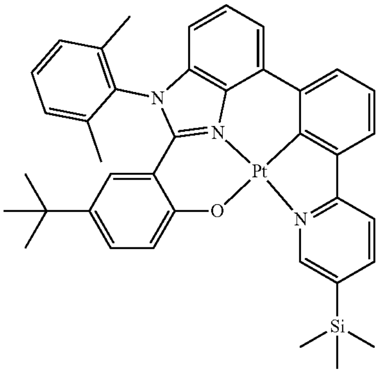
3-145
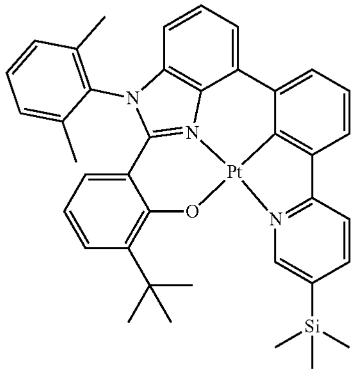
3-146
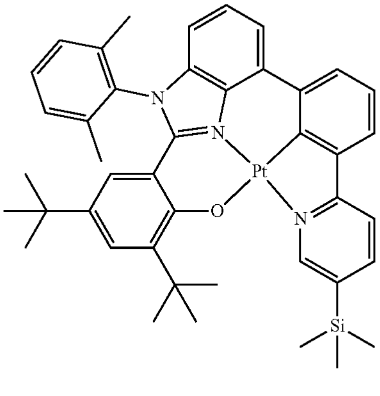
3-147
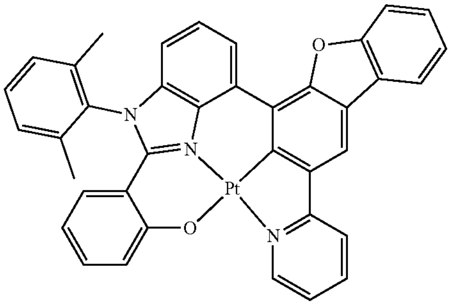
3-148
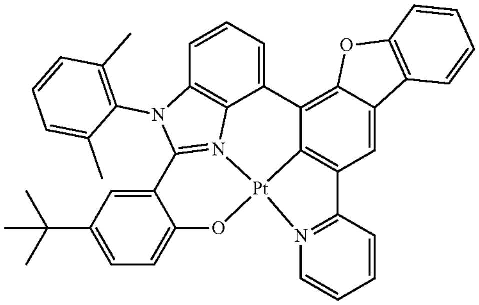
3-149
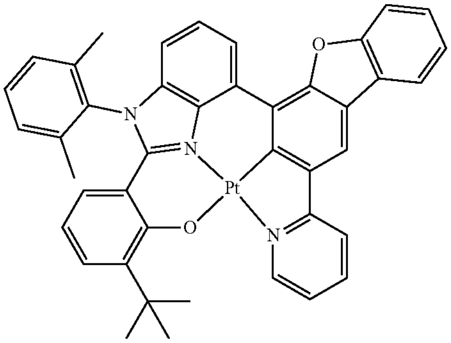
3-150
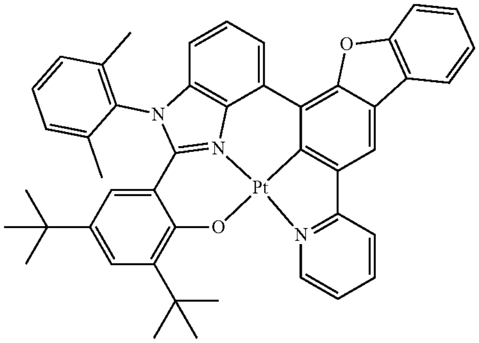
3-151
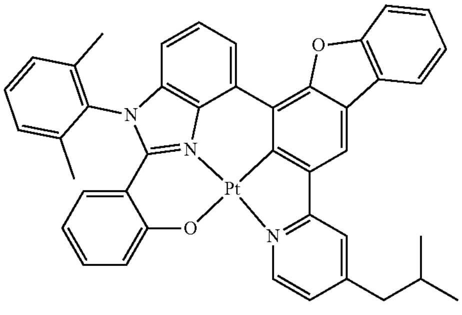

-continued
3-152
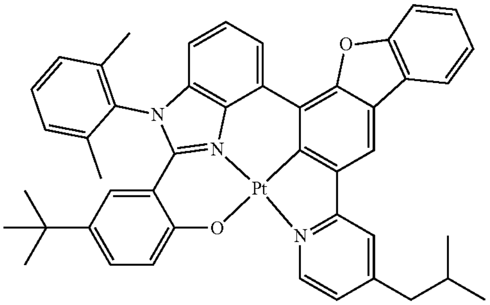
3-153
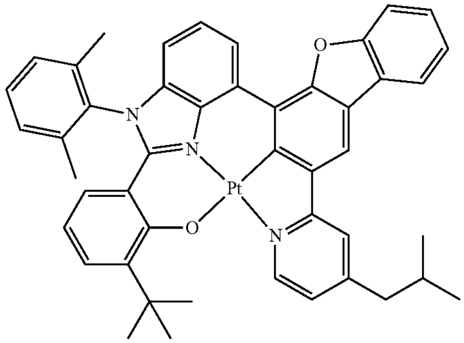
3-154
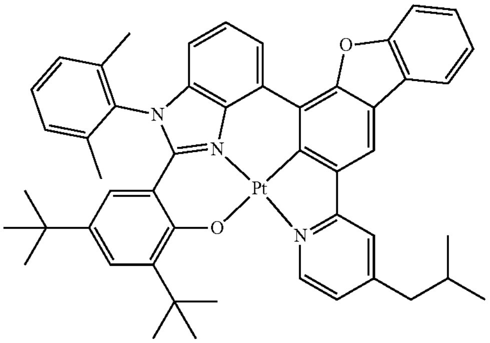
3-155
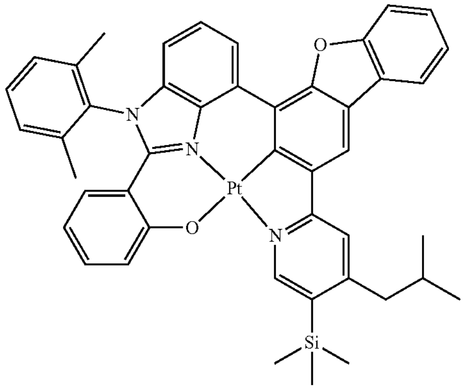
-continued
3-156
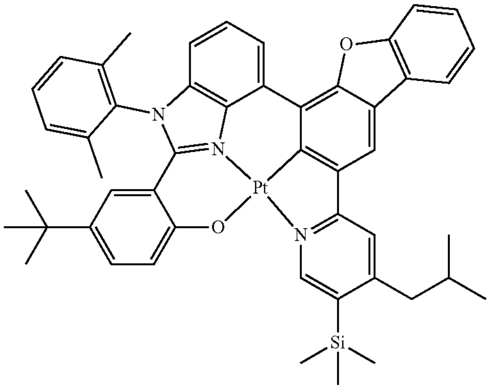
3-157
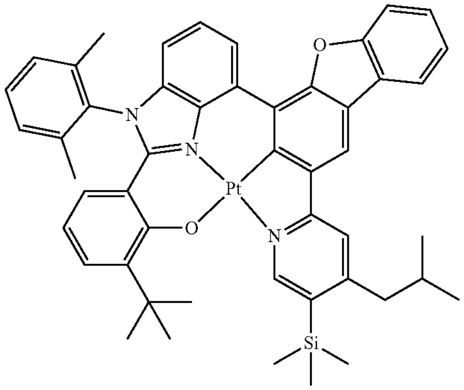
3-158
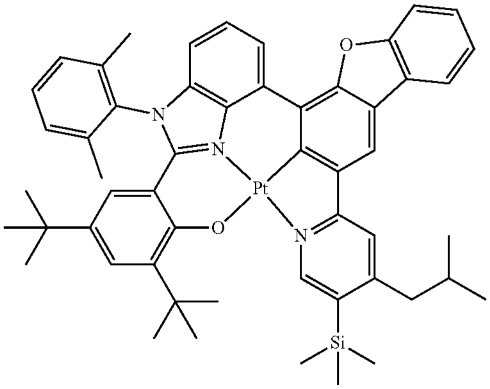
3-159
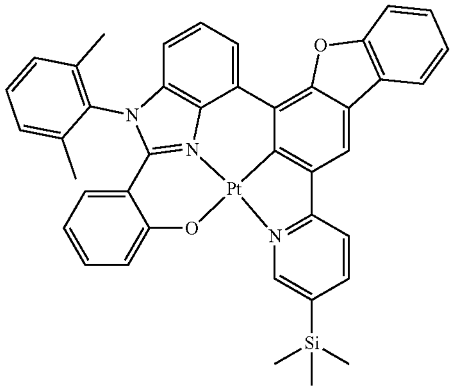

-continued
3-160
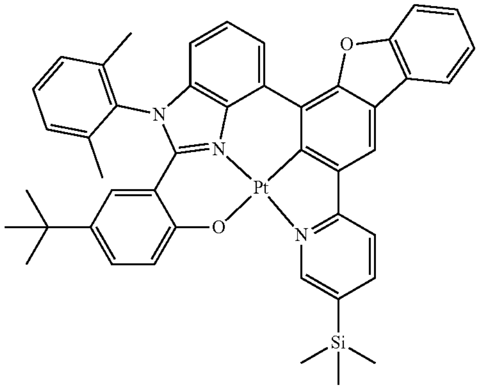
3-161
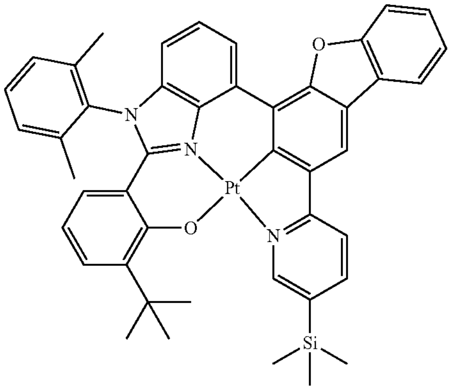
3-162
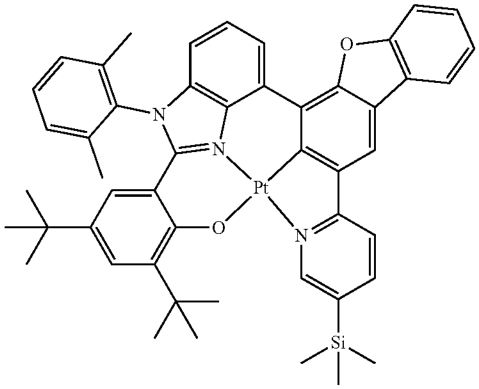
3-163
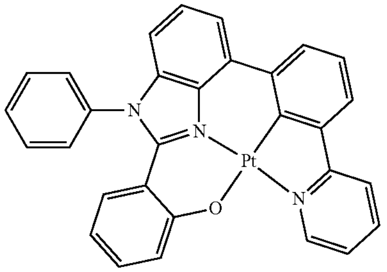
-continued
3-164
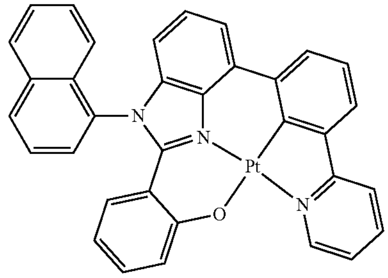
3-165
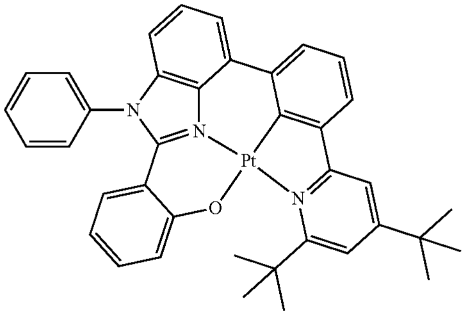
3-166
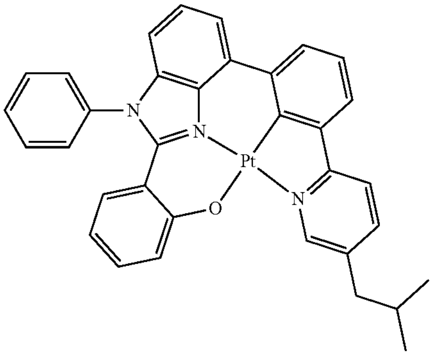
3-167
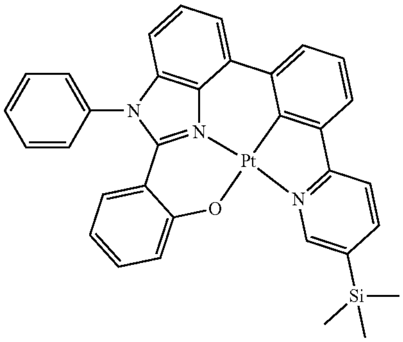

-continued
3-168
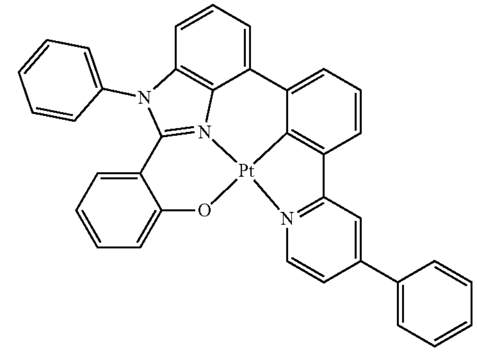
3-169
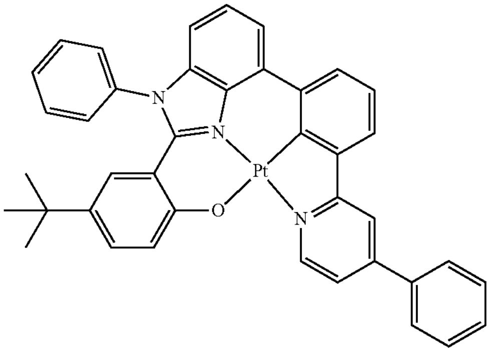
3-170
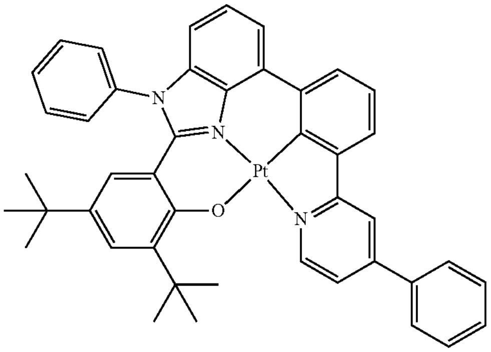
3-171
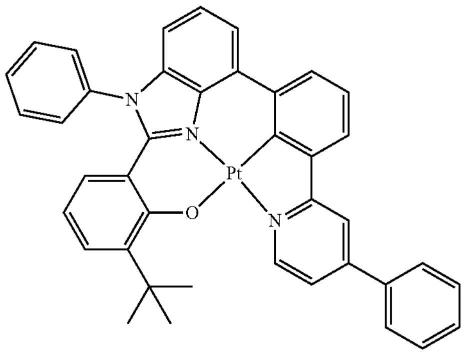
-continued
3-172
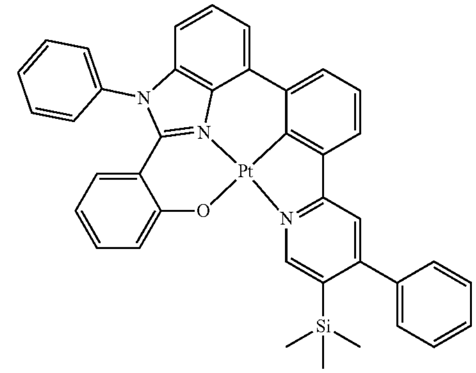
3-173
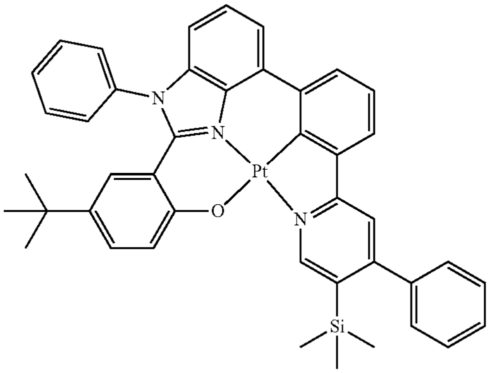
3-174
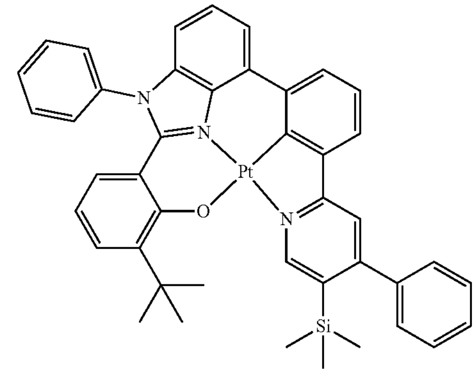
3-175
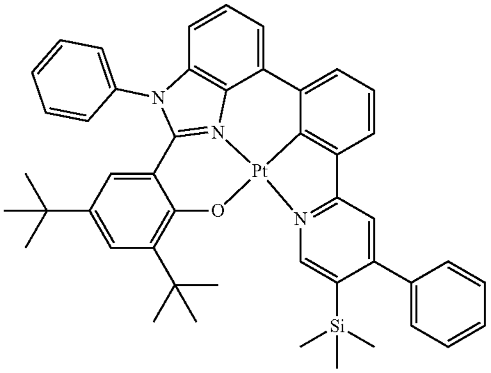

-continued
3-176
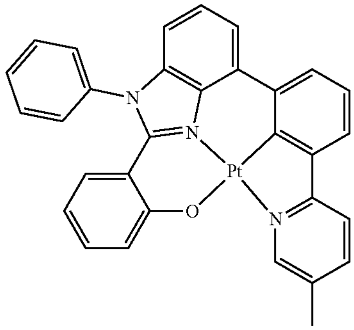
3-177
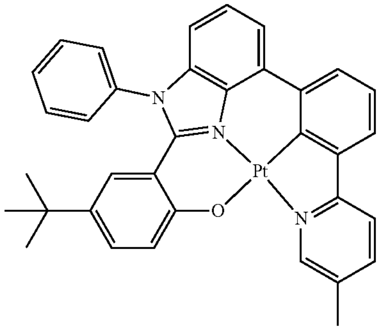
3-178
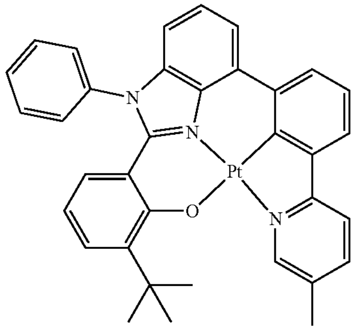
3-179
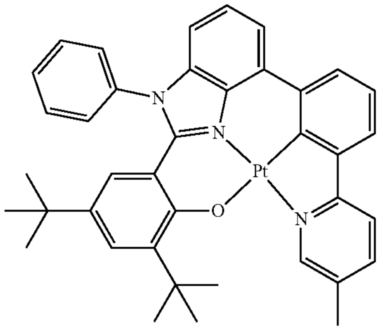
-continued
3-180
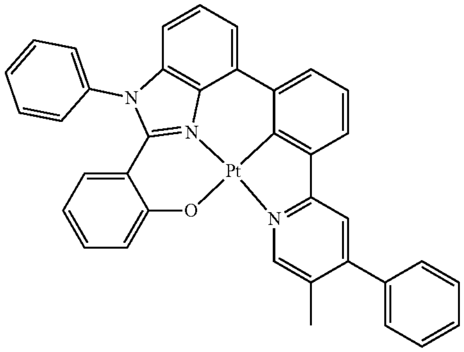
3-181
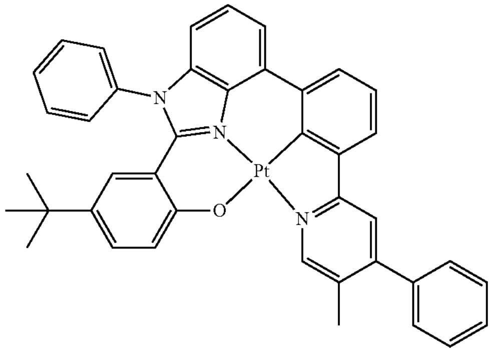
3-182
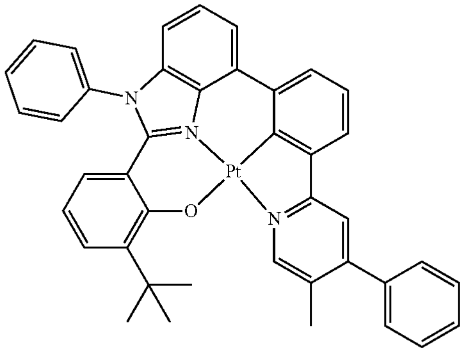
3-183
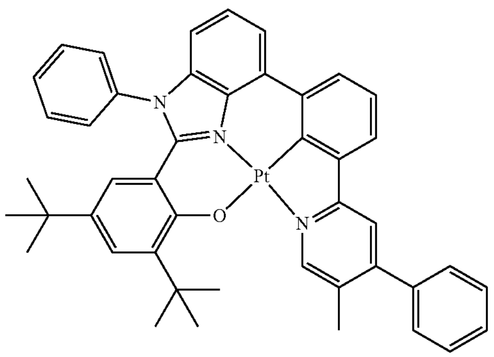

-continued
3-184
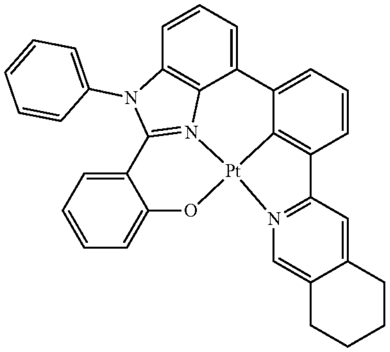
3-185
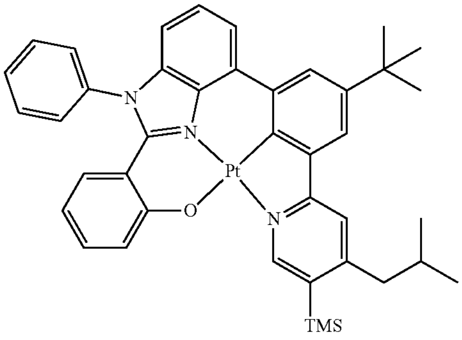
3-186
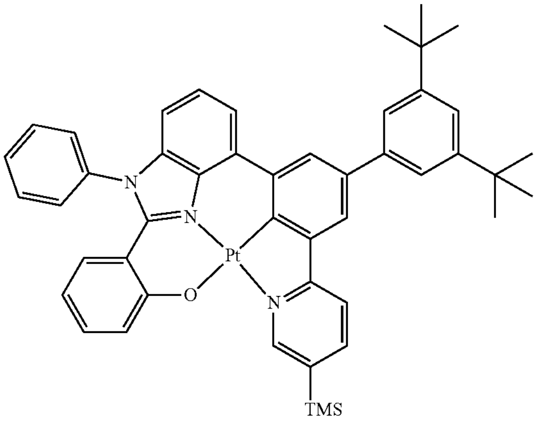
3-187
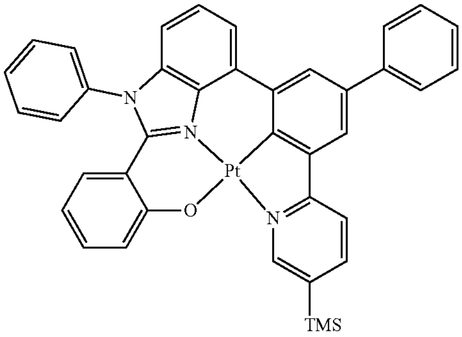
-continued
3-188
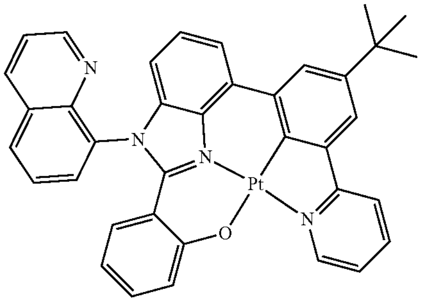
3-189
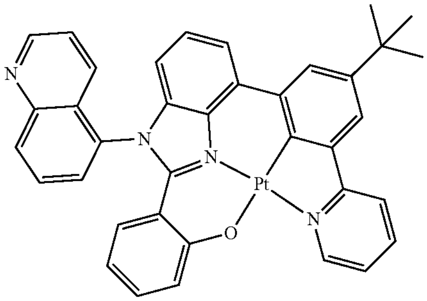
3-190
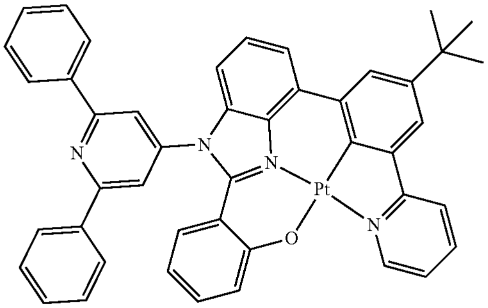
3-191
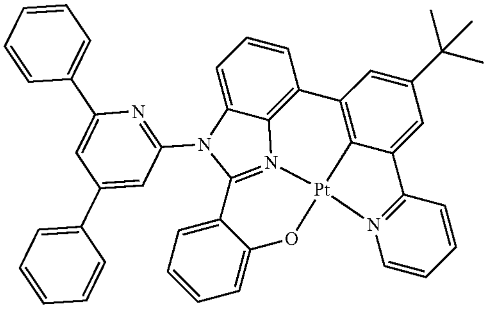
3-192
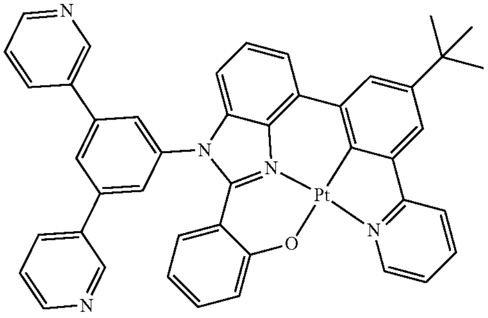

-continued
3-193
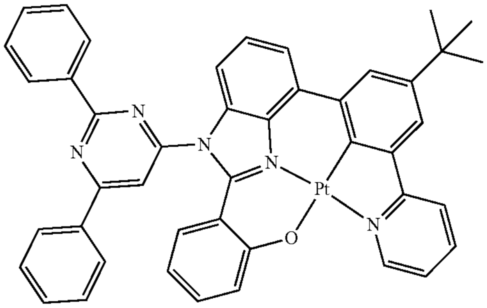
3-194
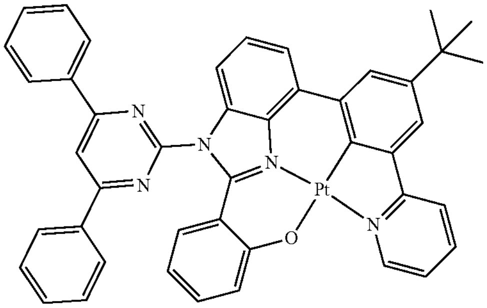
3-195
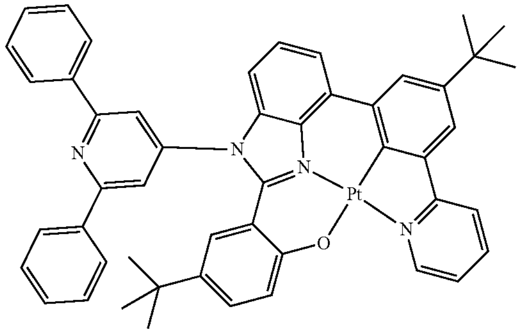
3-196
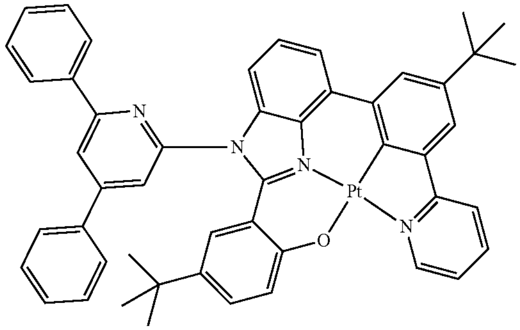
-continued
3-197
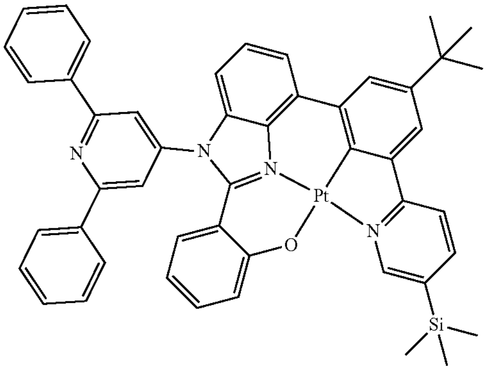
3-198
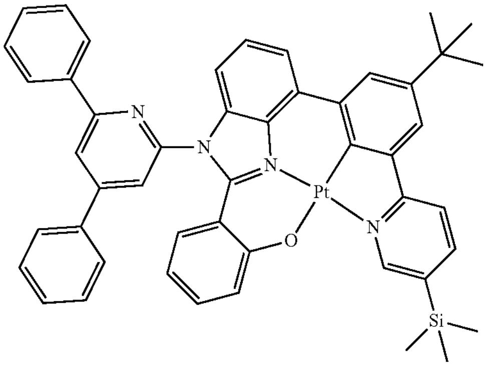
3-199
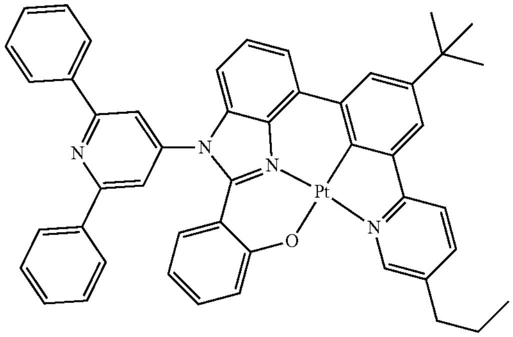
3-200
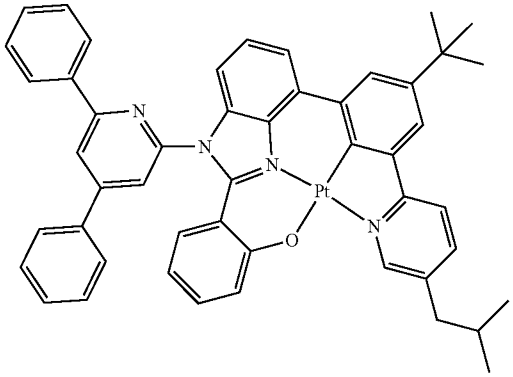

-continued
3-201
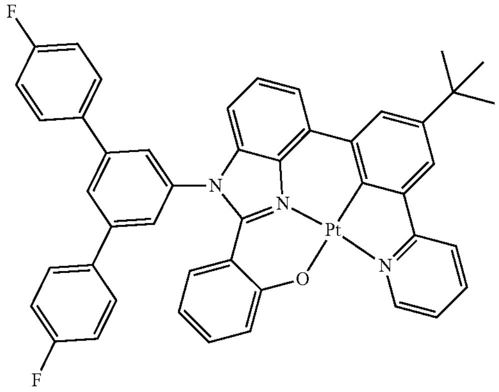
3-202
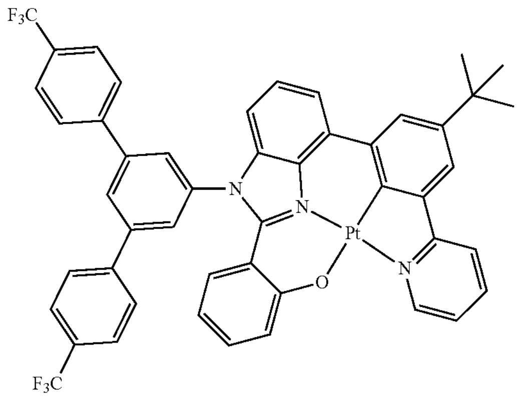
3-203
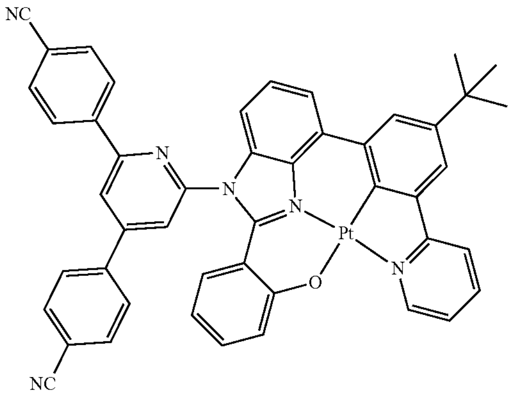
3-204
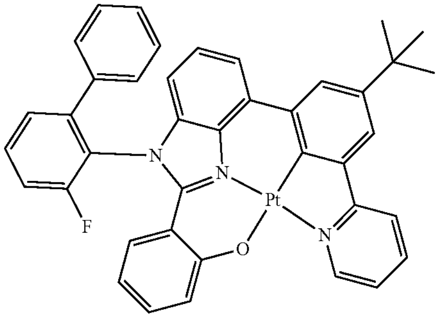
-continued
3-205
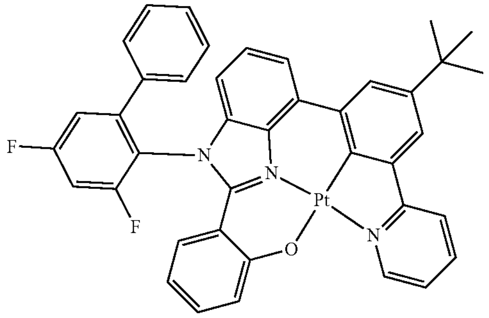
3-206
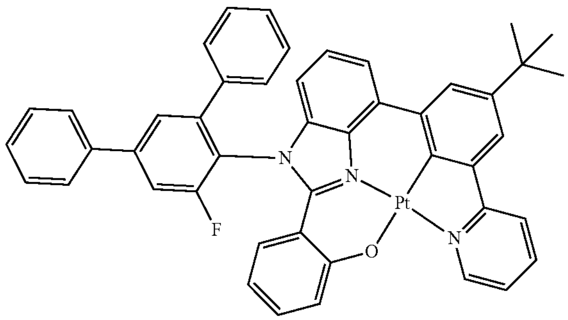
3-207
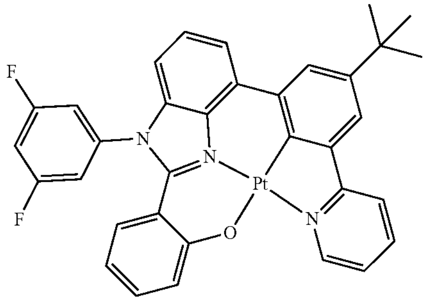
3-208
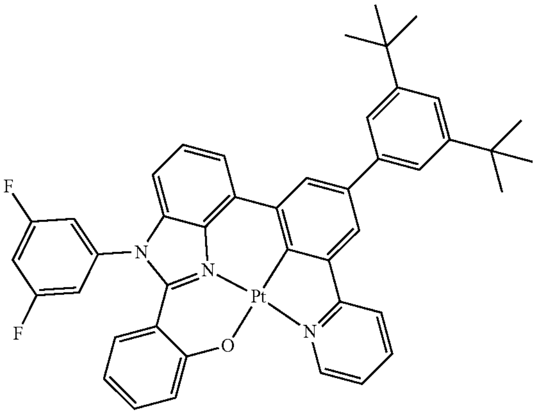

-continued
3-209
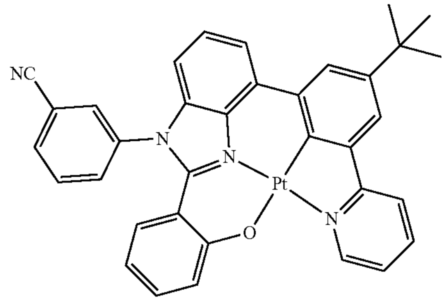
3-210
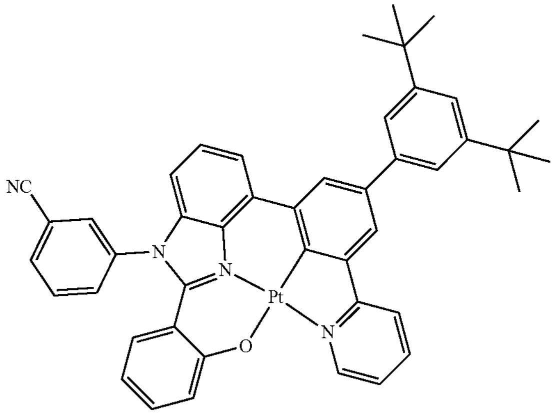
3-211
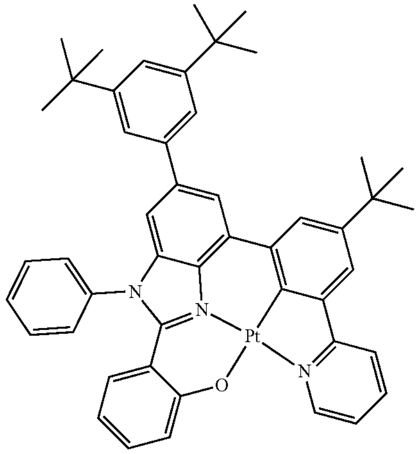
3-212
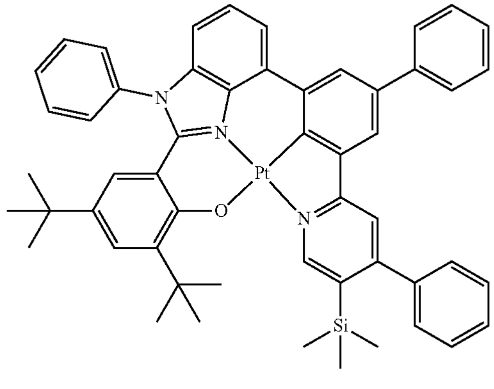
-continued
3-213
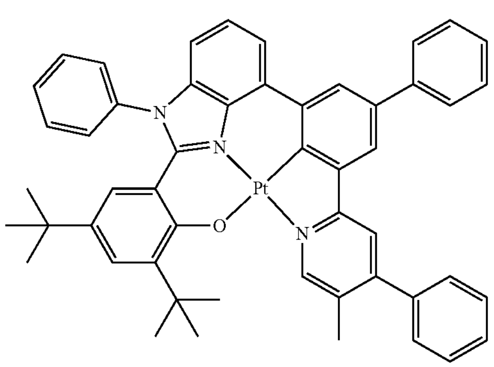
3-214
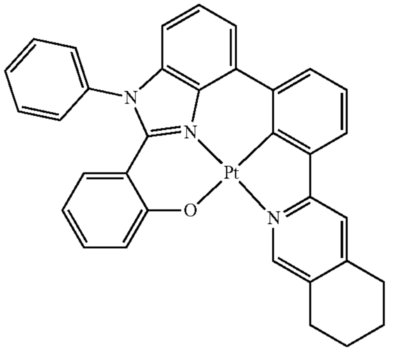
3-215
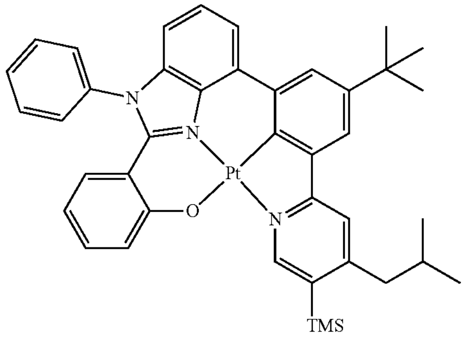
3-216
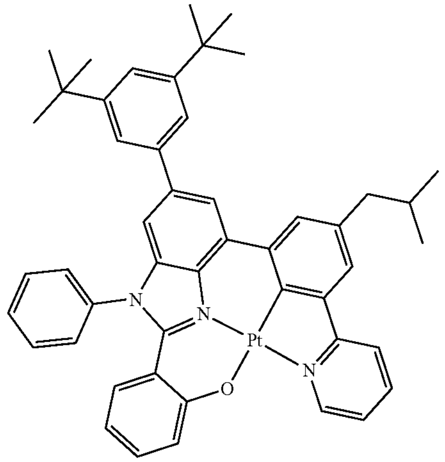

-continued
3-217
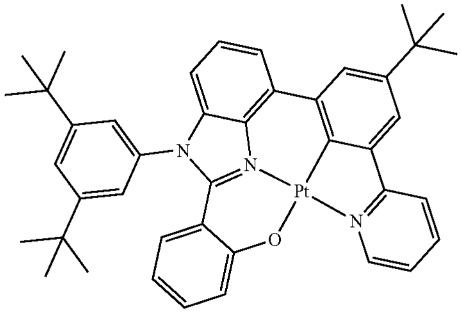
3-218
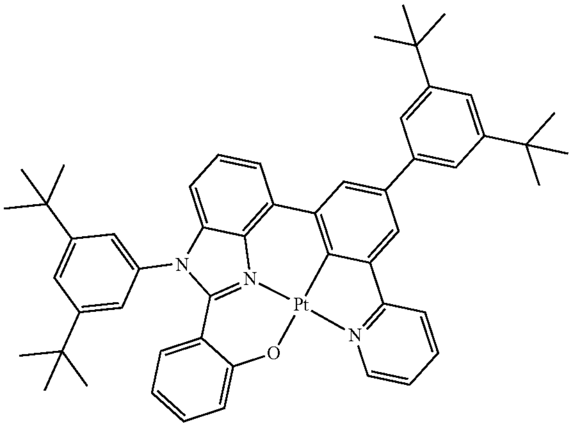
3-219
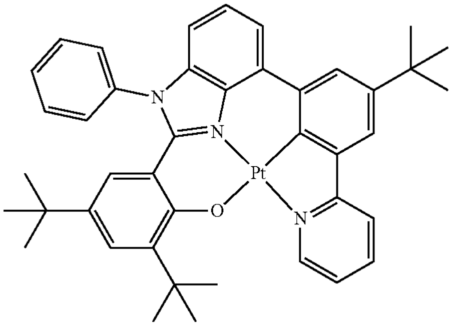
3-220
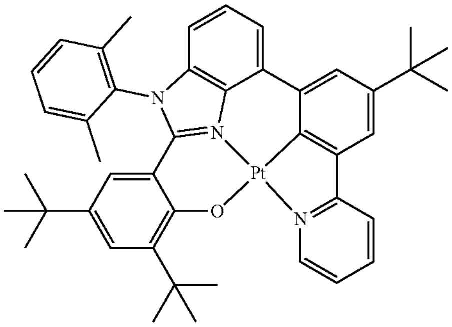
-continued
3-221
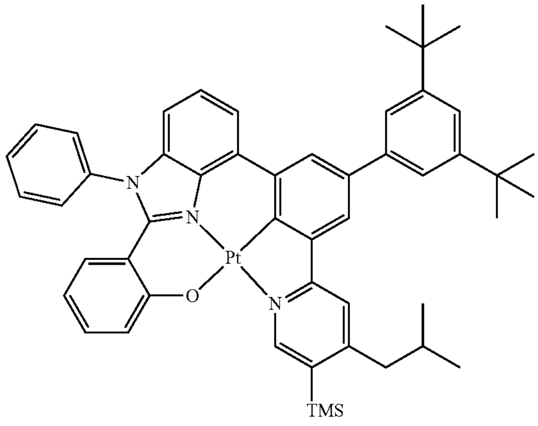
3-222
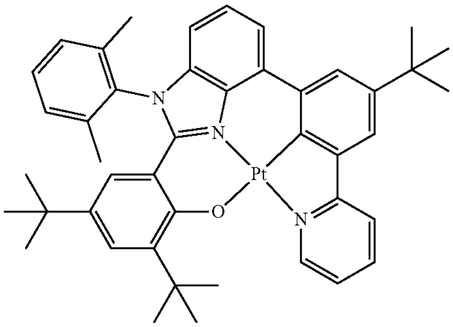
3-223
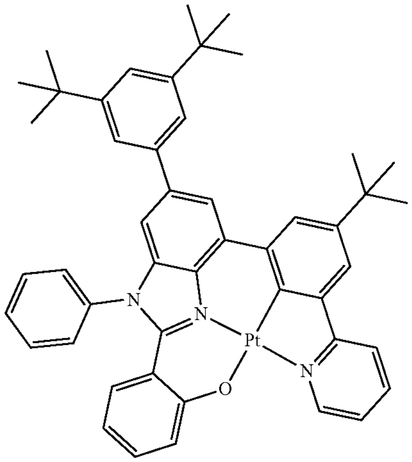
3-224
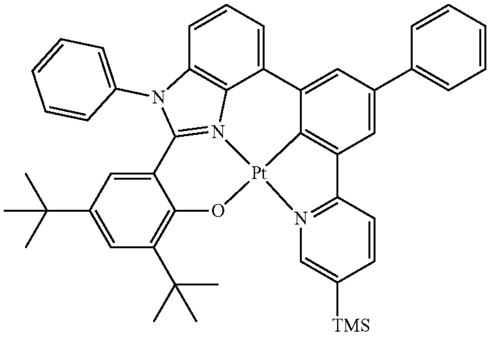

-continued
3-225
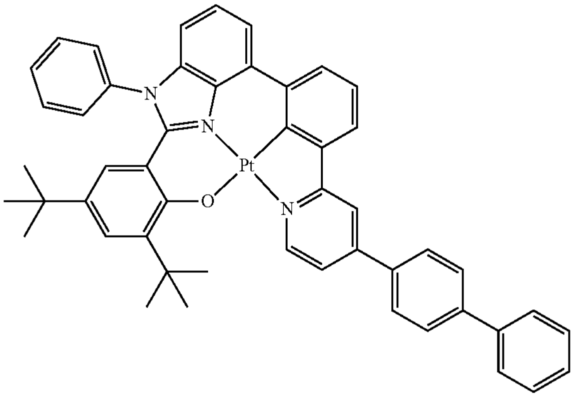
3-226
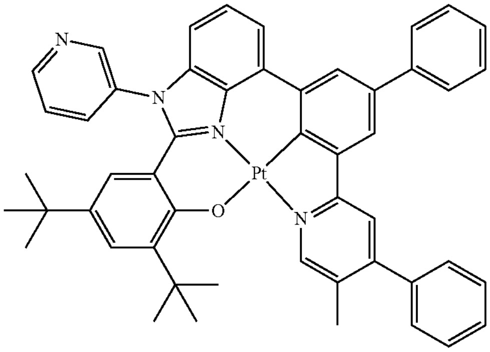
3-227
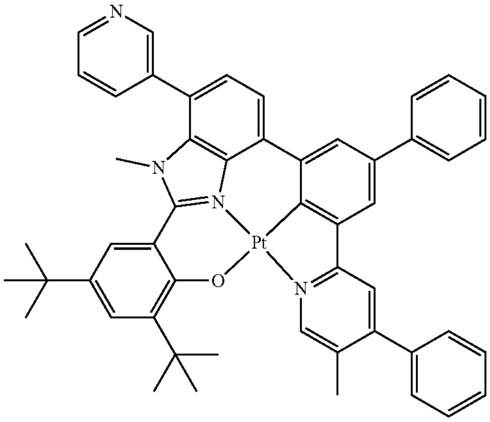
3-228
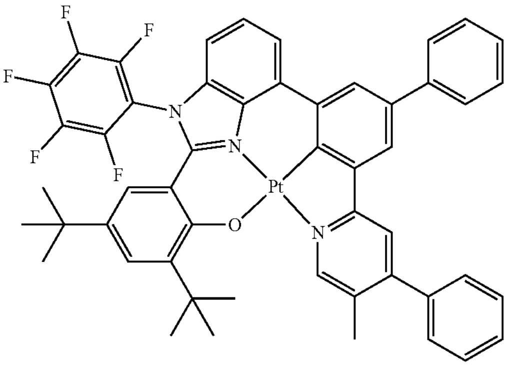
-continued
3-229
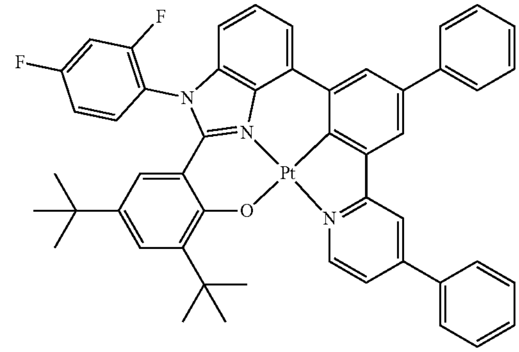
3-230
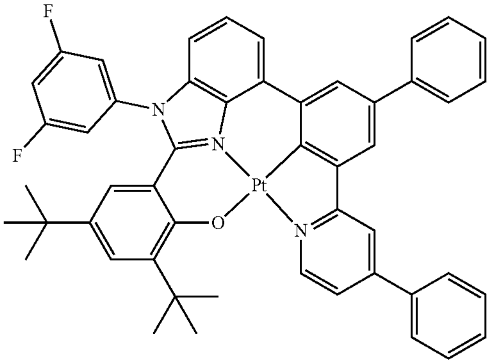
3-231
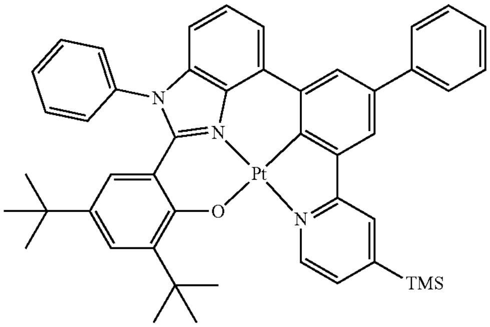
3-232
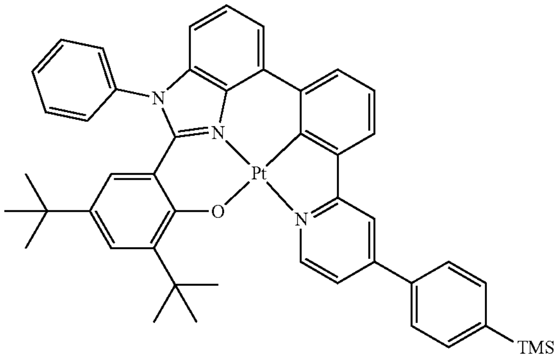

3-233
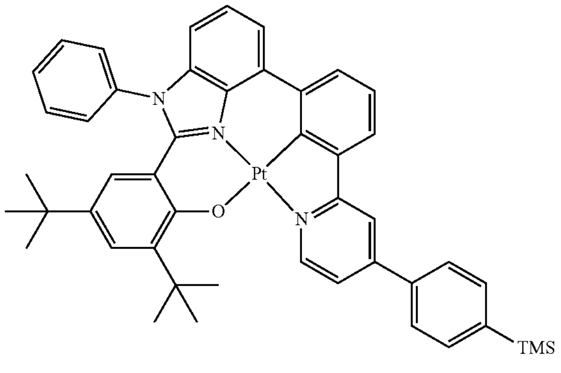
3-234
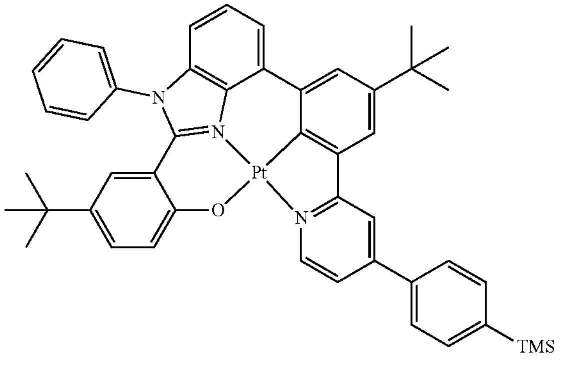
3-235
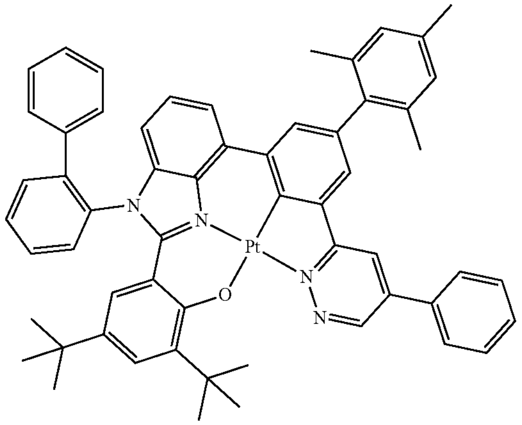
3-236
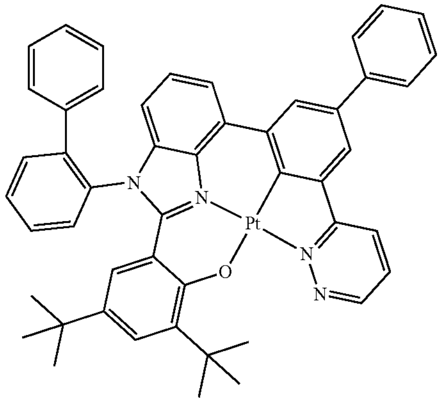
3-237
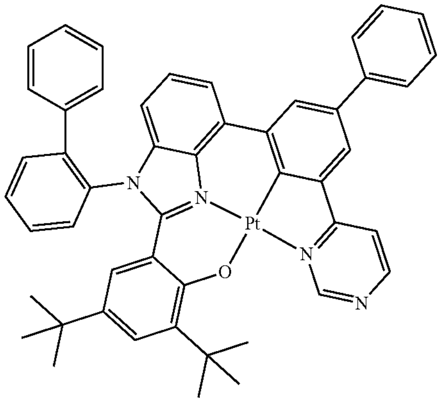
3-238
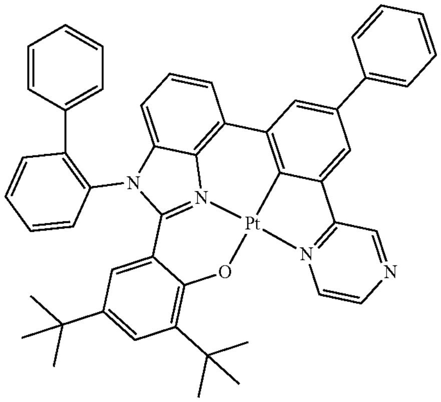
3-239
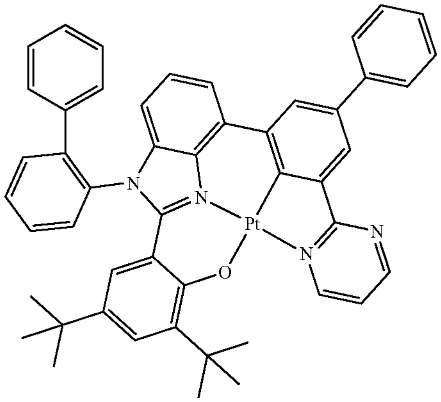
3-240
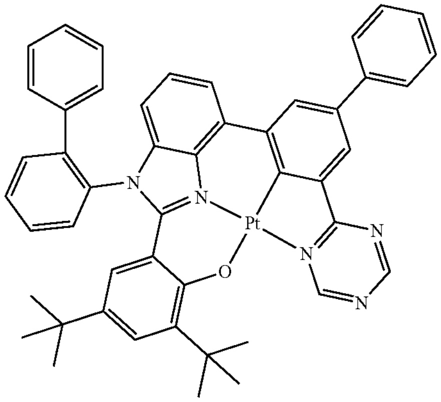

-continued
3-241
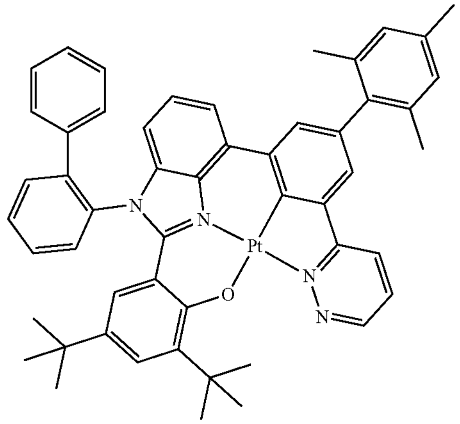
3-242
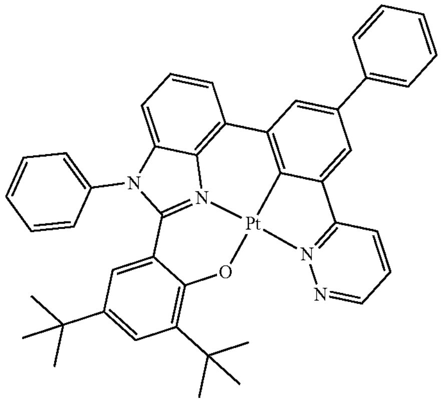
3-243
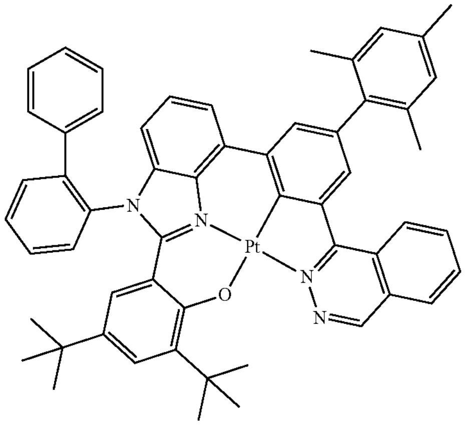
-continued
3-244
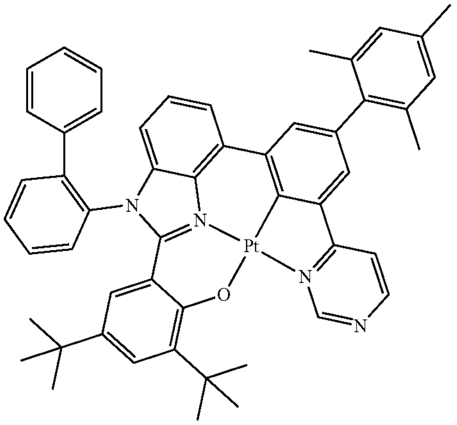
3-245
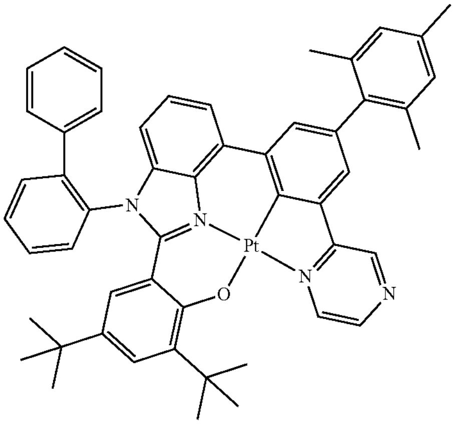
3-246
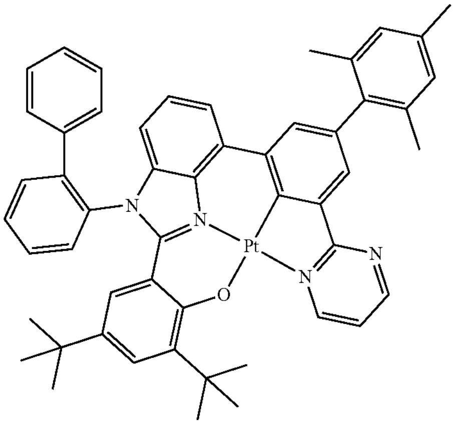

-continued
3-247
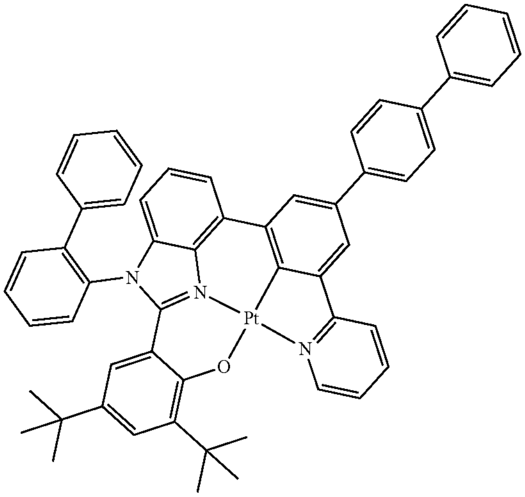
3-248
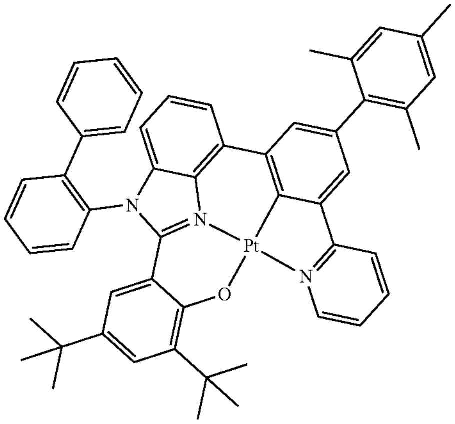
3-249
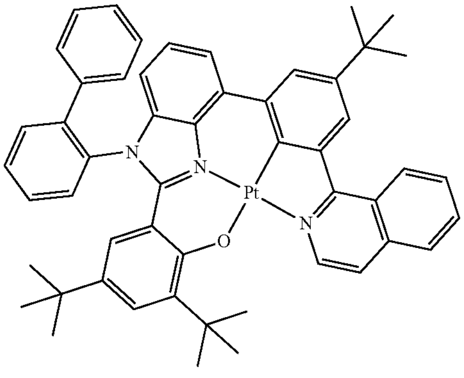
-continued
3-250
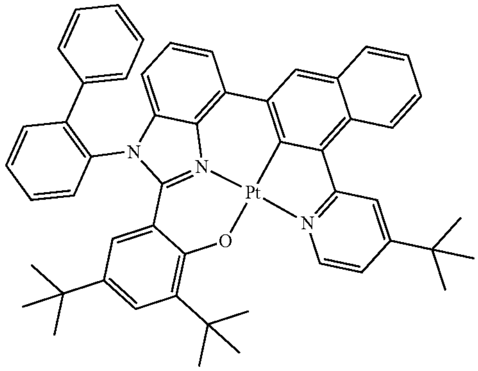
3-251
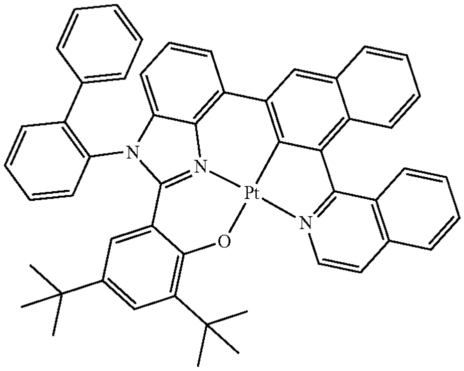
3-252
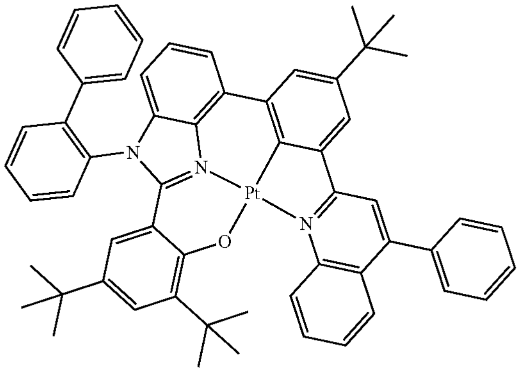
3-253
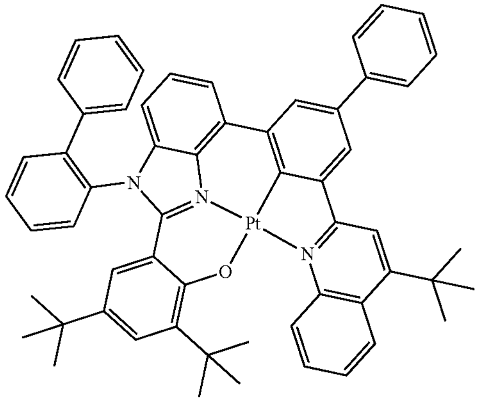

-continued
3-254
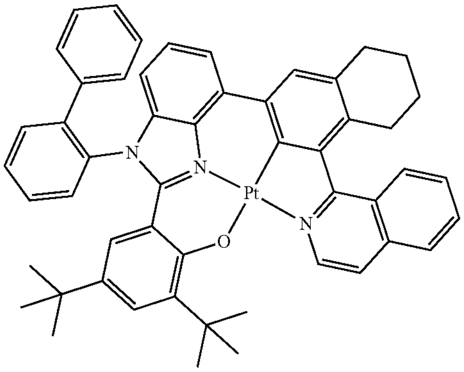
3-255
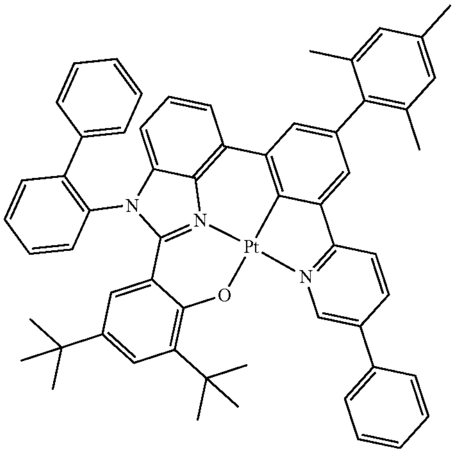
3-256
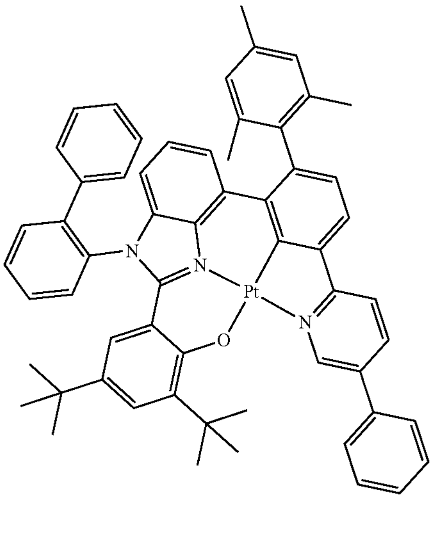
-continued
3-257
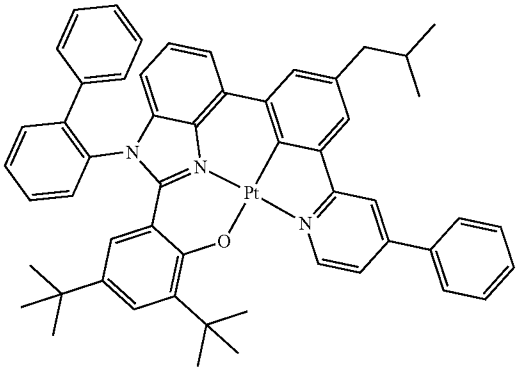
3-258
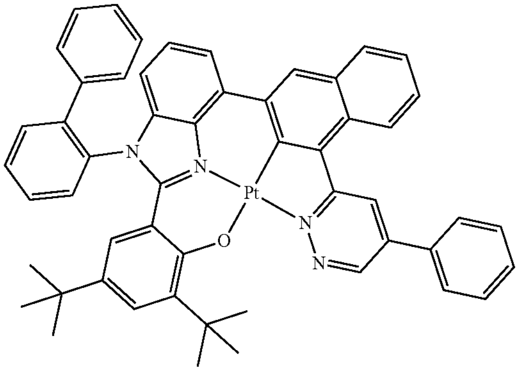
3-259
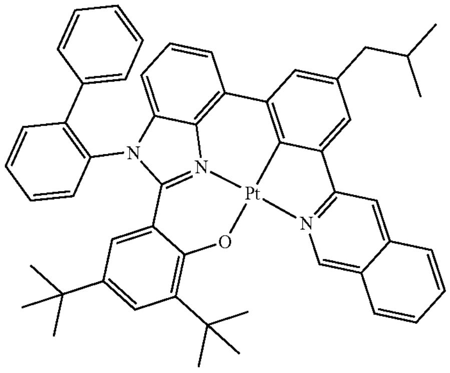
3-260
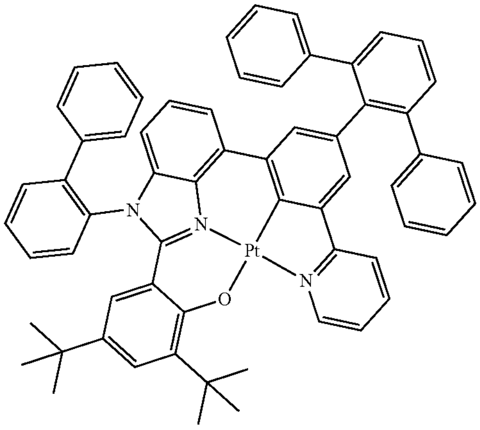

-continued
3-261
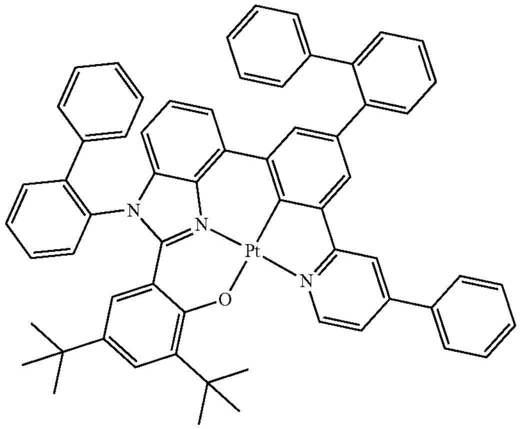
3-262
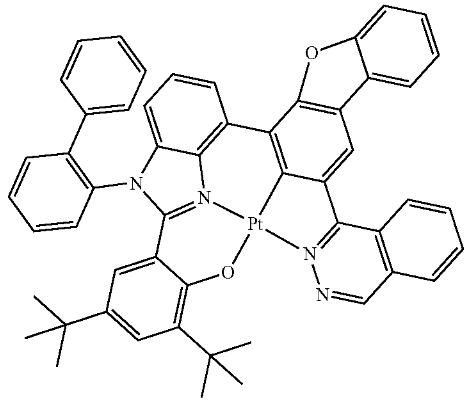
3-263
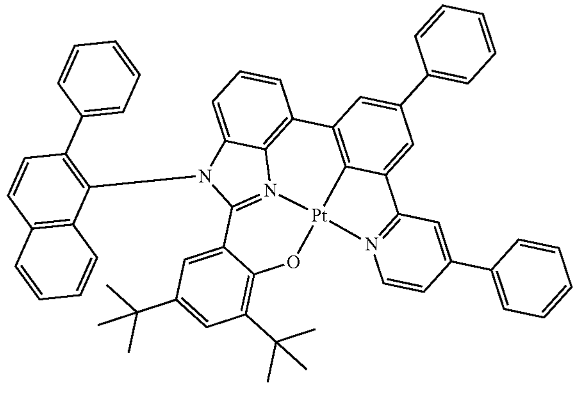
-continued
3-264
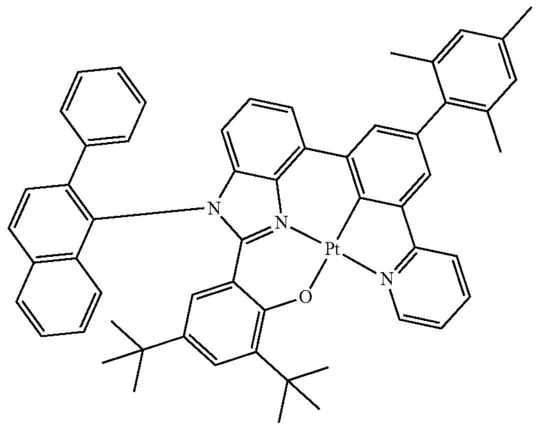
3-265
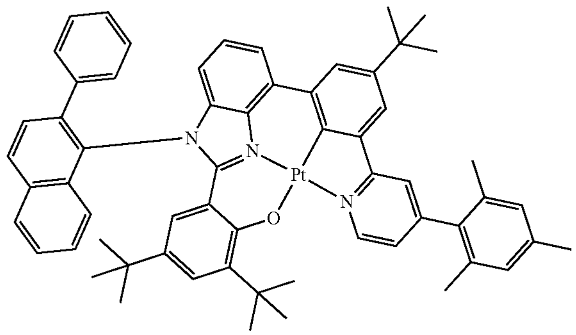
3-266
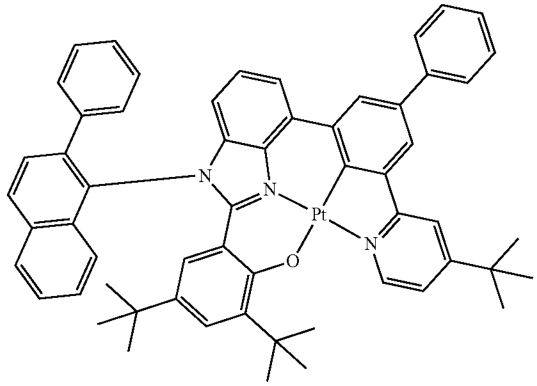
3-267
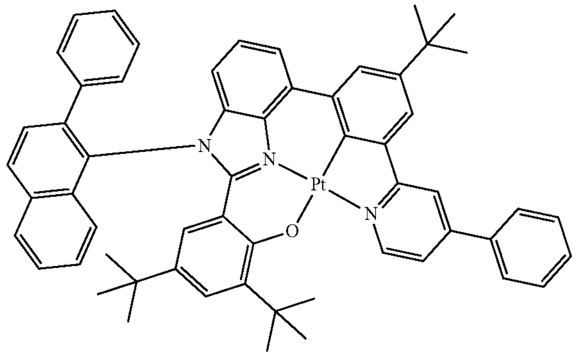

-continued
3-268
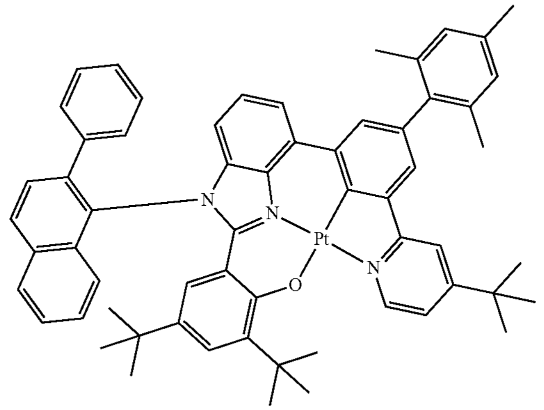
3-269
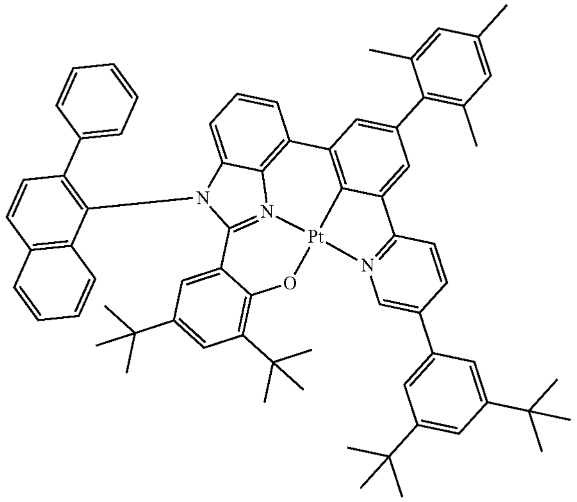
3-270
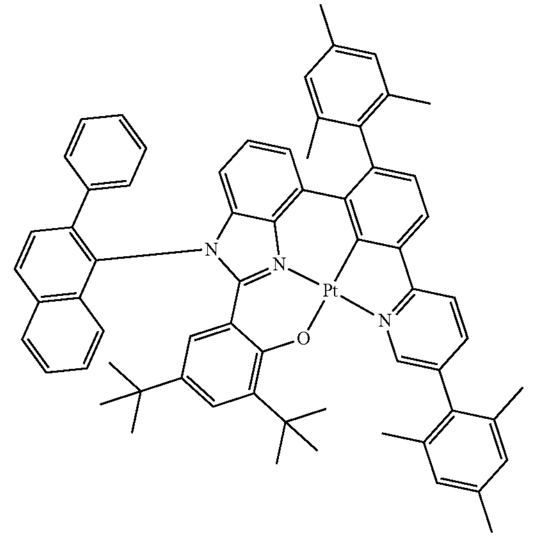
-continued
3-271
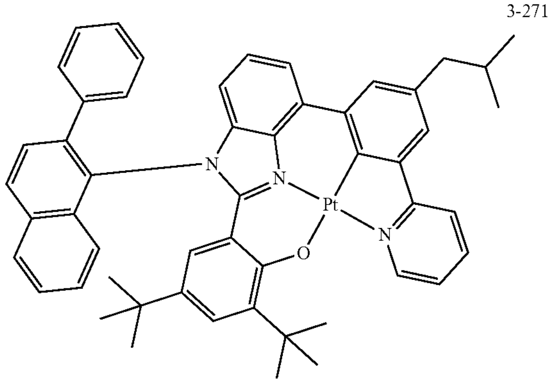
3-272
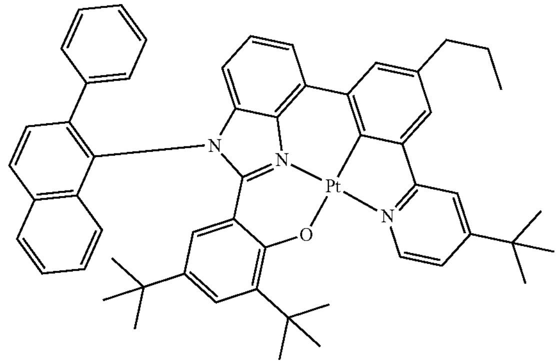
3-273
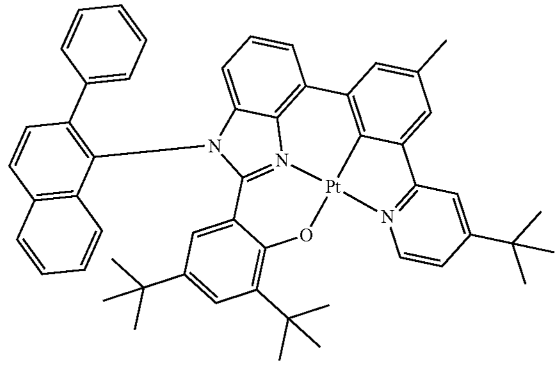
3-274
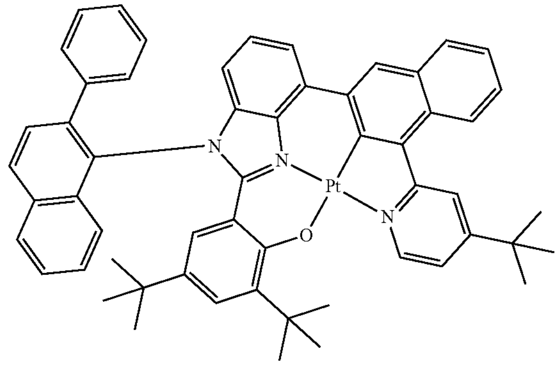

-continued
3-275
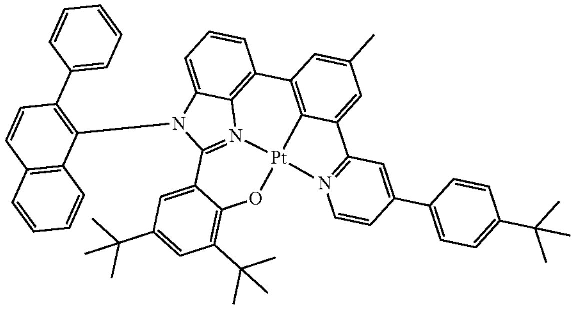
3-276
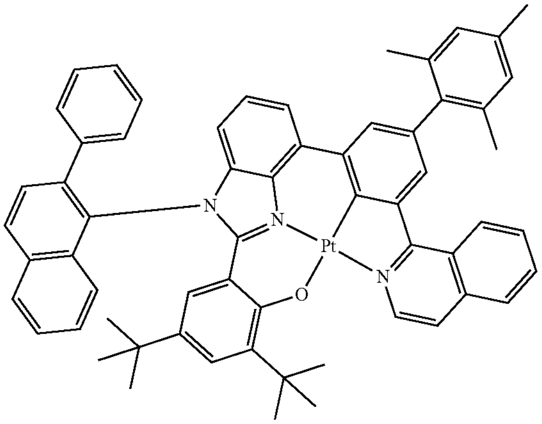
3-277
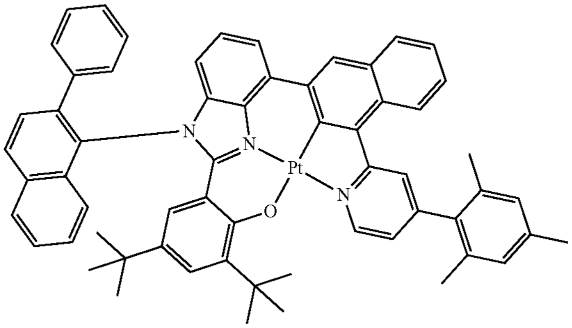
3-278
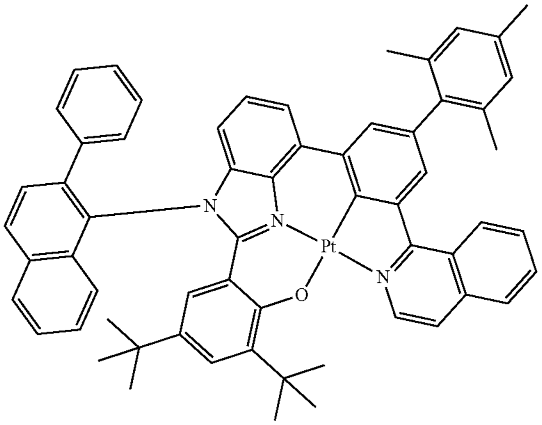
-continued
3-279
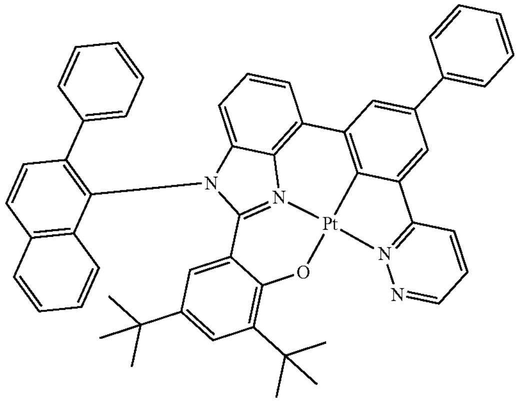
3-280
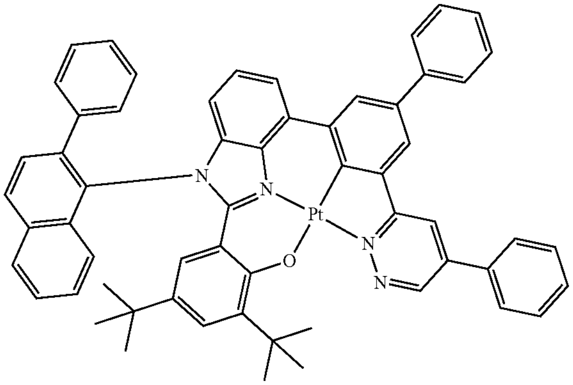
3-281
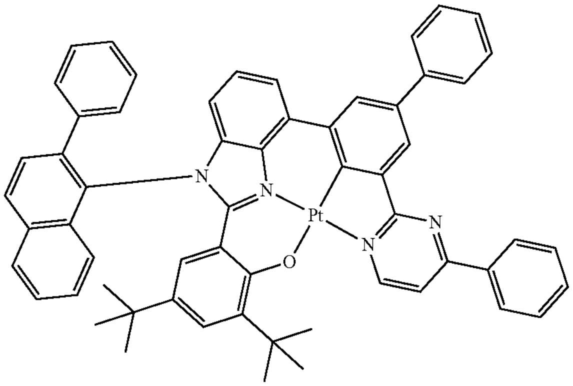
3-282
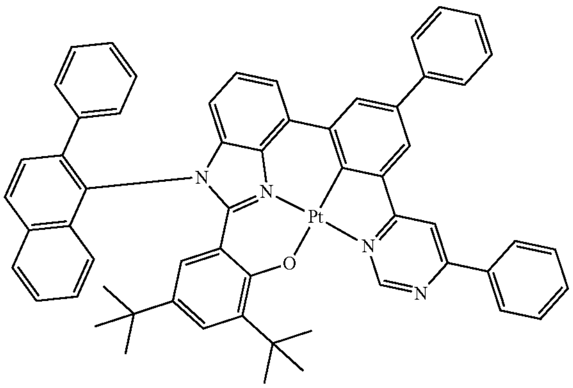

-continued
3-283
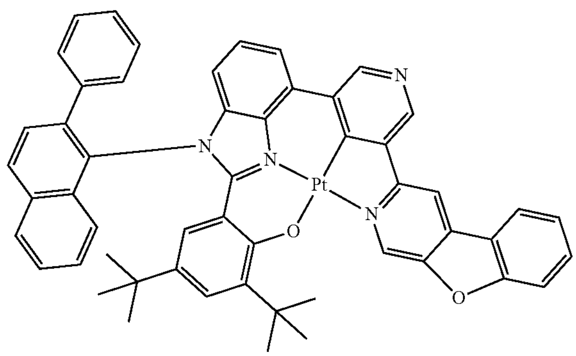
3-284
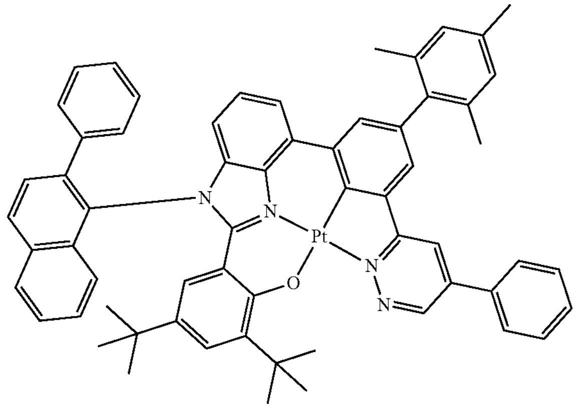
3-285
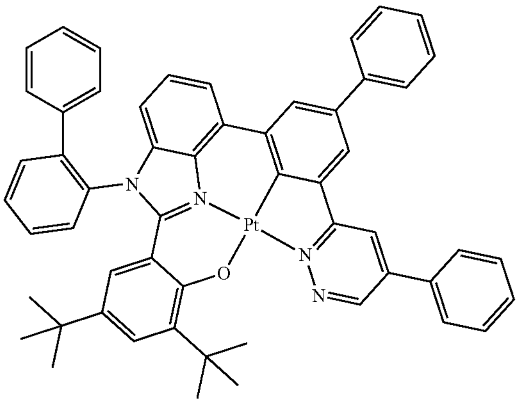
3-286
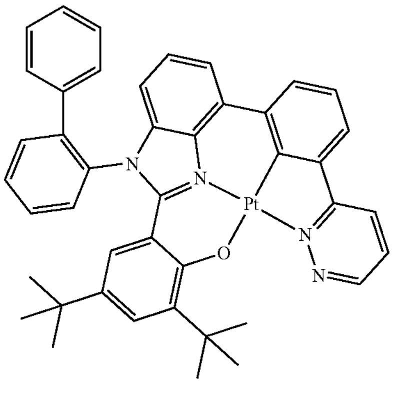
-continued
3-287
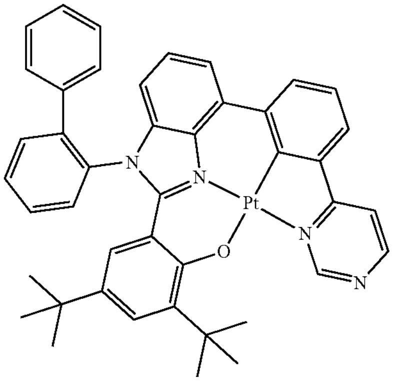
3-288
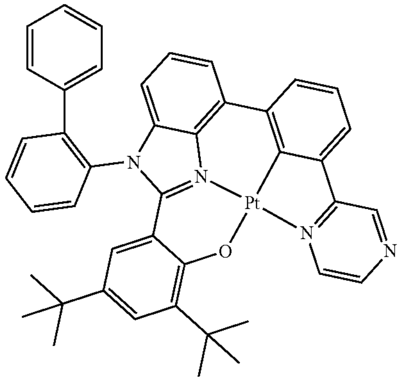
3-289
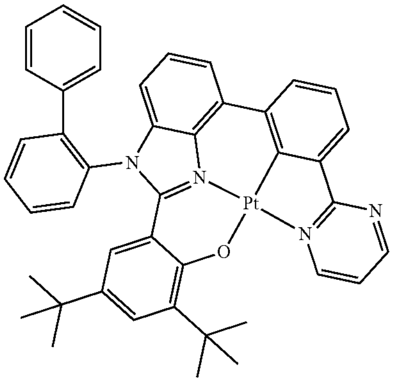
3-290
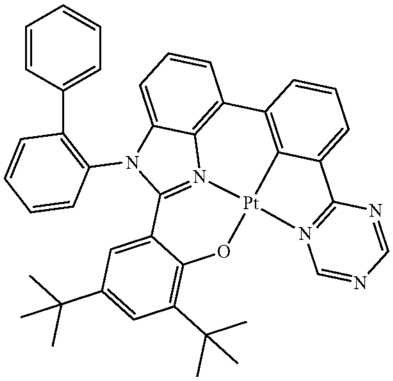

-continued
3-291
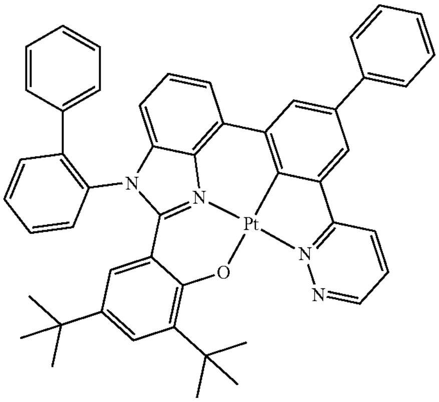
3-292
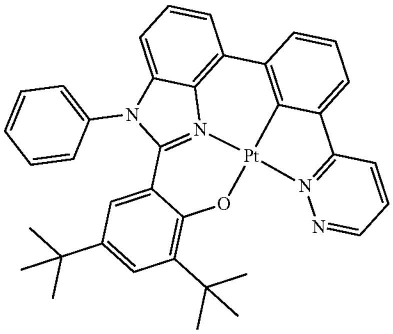
3-293
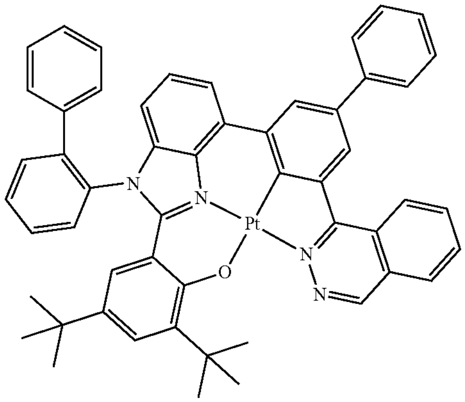
3-294
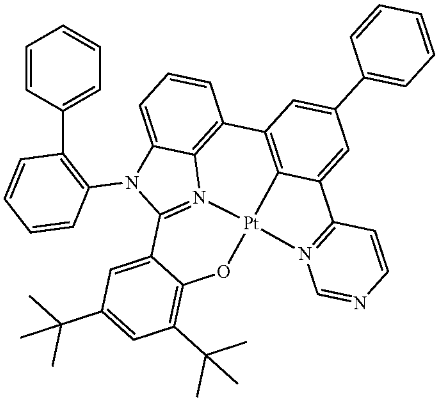
-continued
3-295
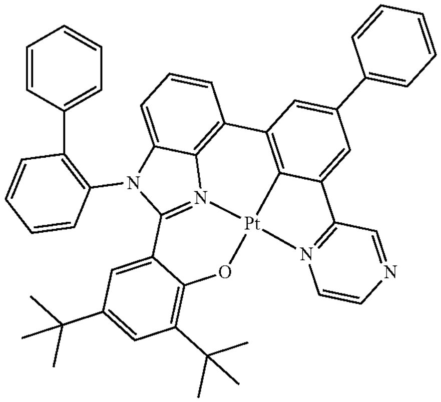
3-296
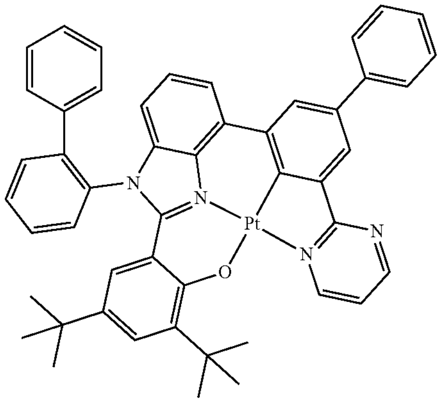
3-297
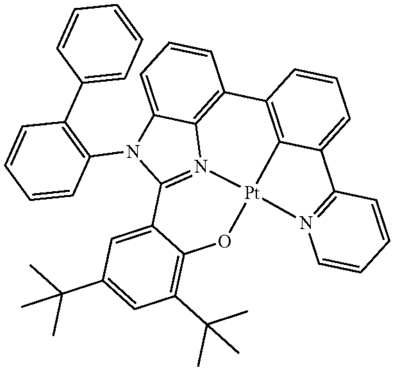
3-298
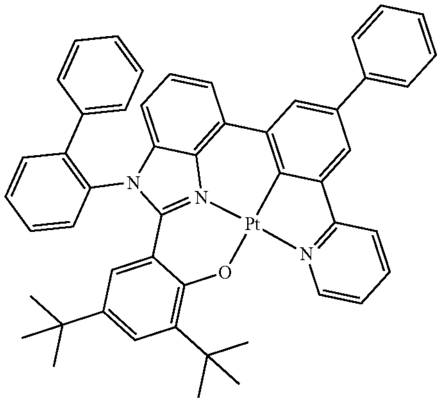

3-299
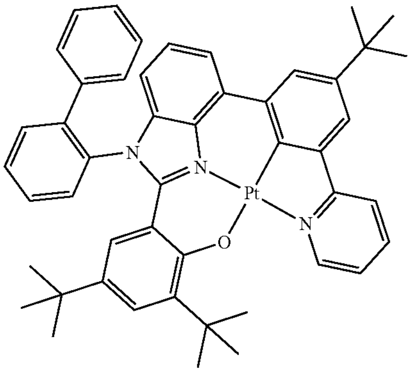
3-300
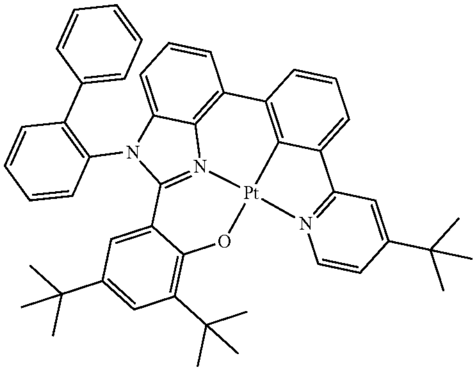
3-301
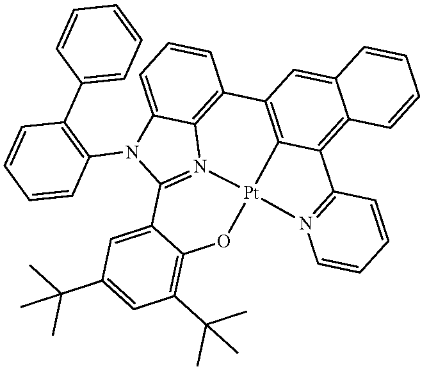
3-302
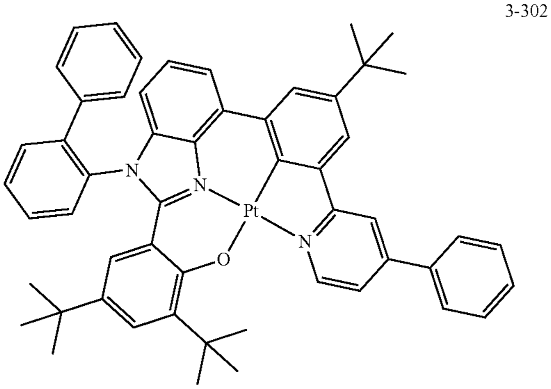
3-303
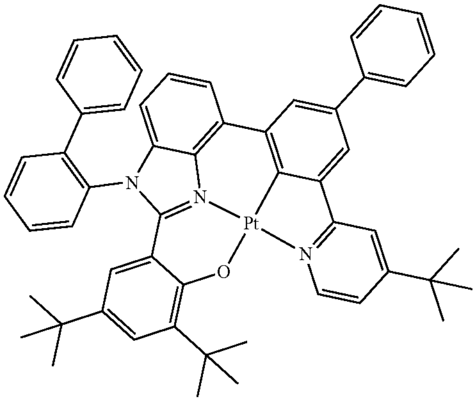
3-304
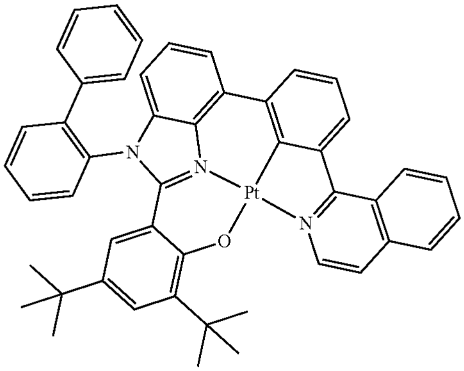
3-305
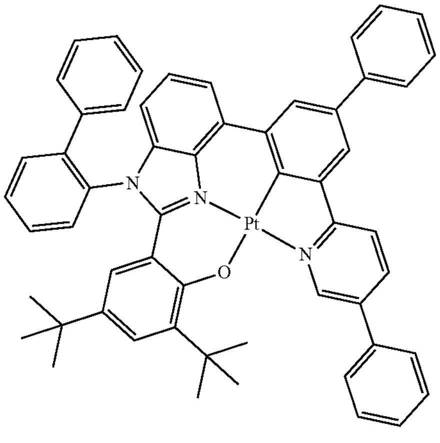

-continued
3-306
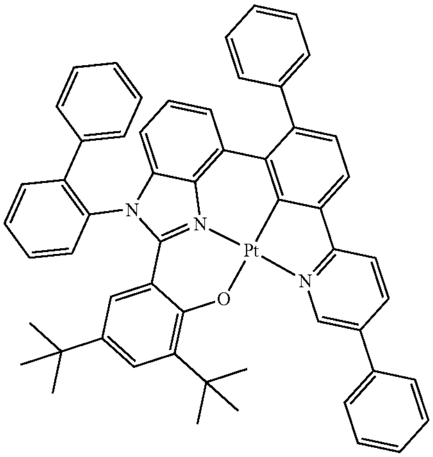
3-307
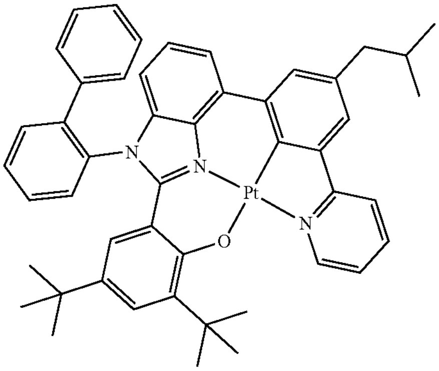
3-308
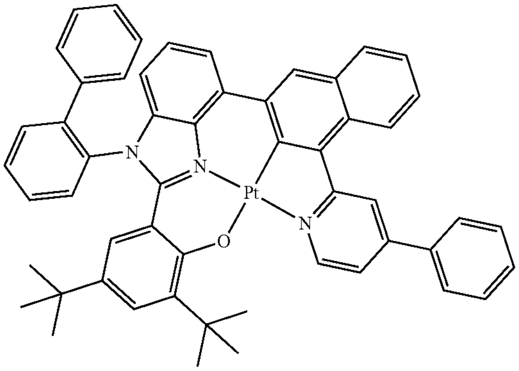
3-309
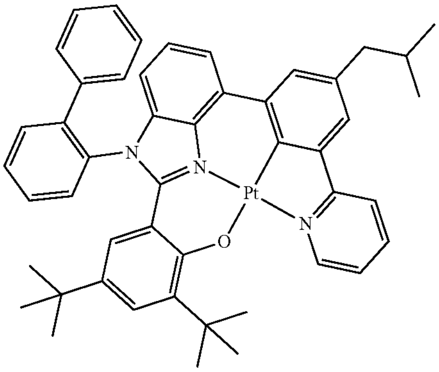
-continued
3-310
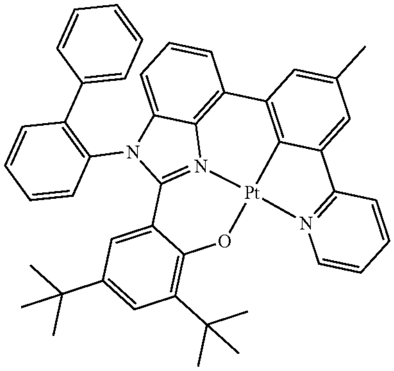
3-311
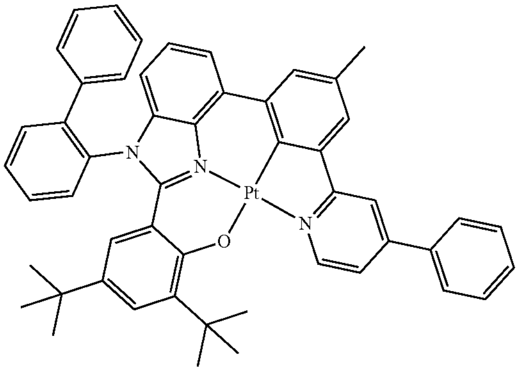
3-312
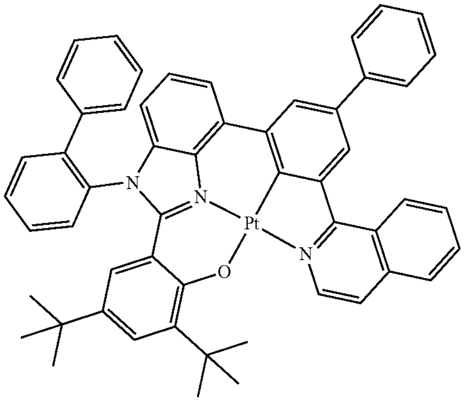
3-313
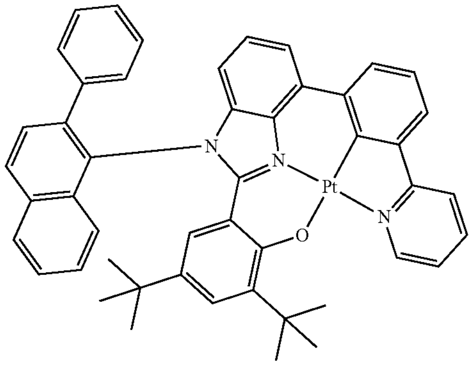

-continued
3-314
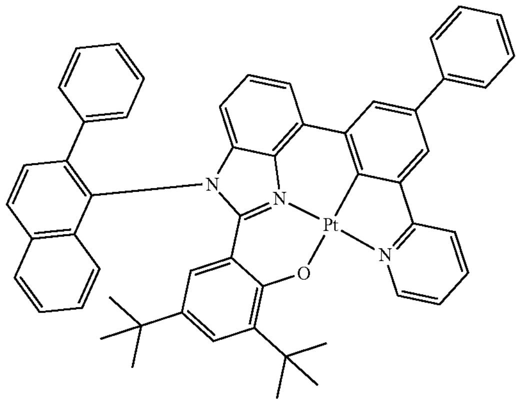
3-315
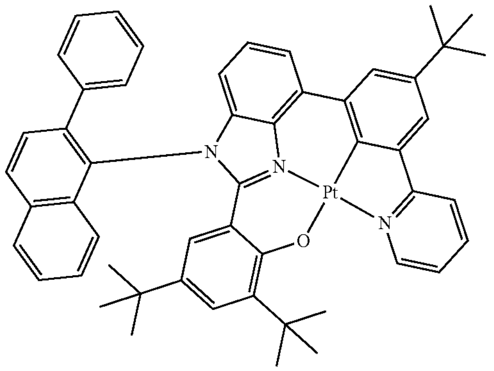
3-316
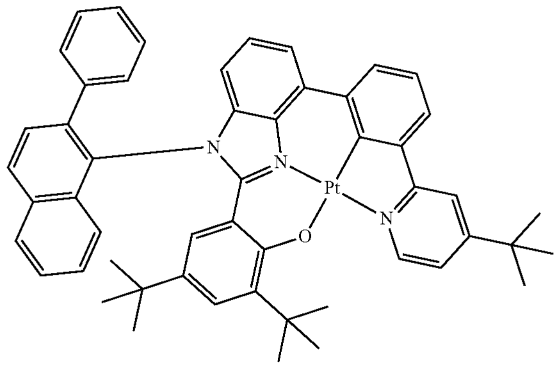
3-317
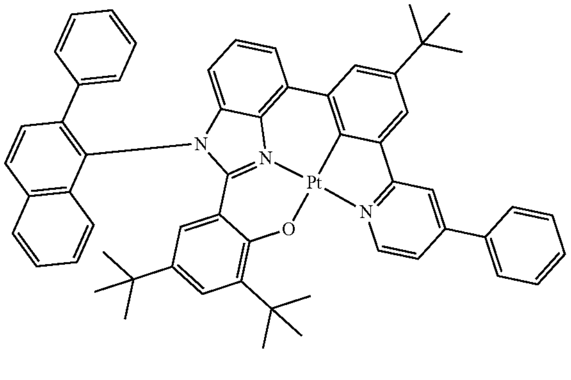
-continued
3-318
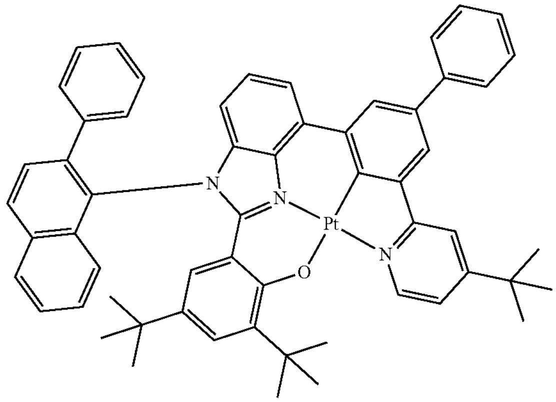
3-319
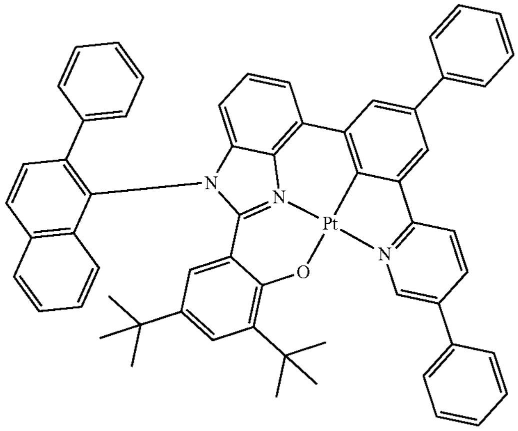
3-320
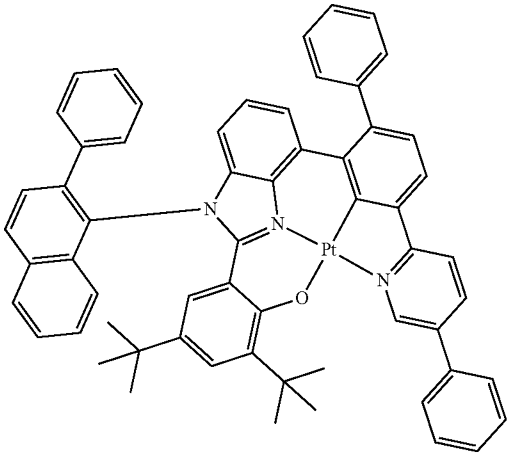

-continued
3-321
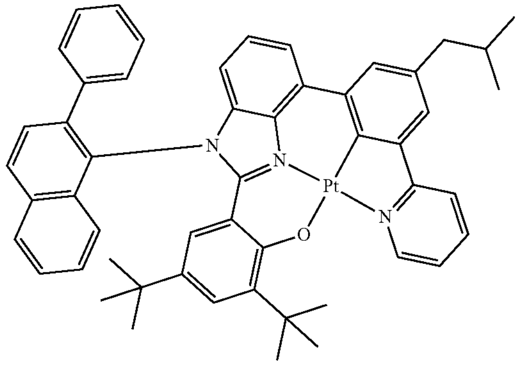
3-322
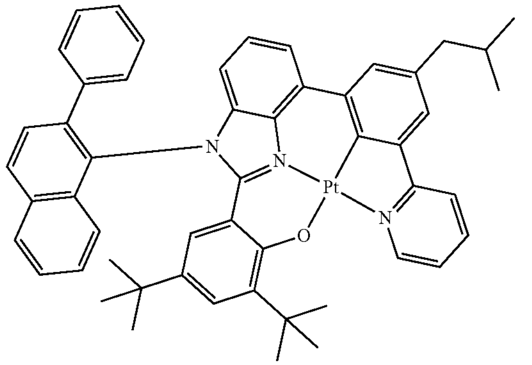
3-323
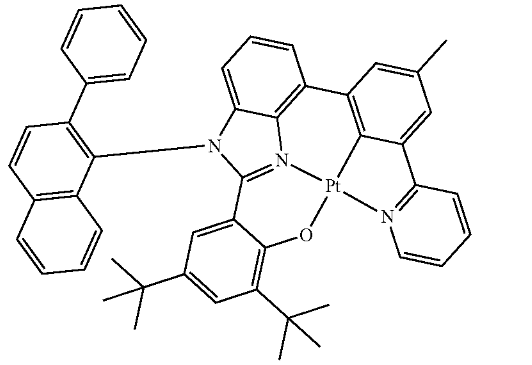
3-324
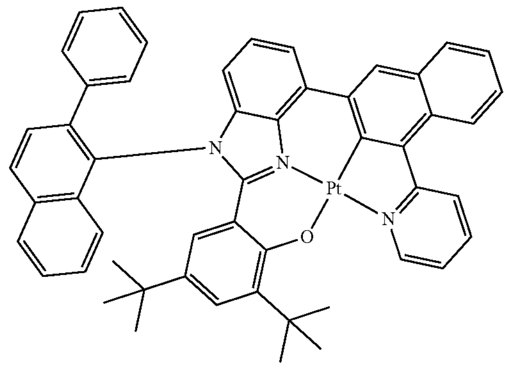
3-325
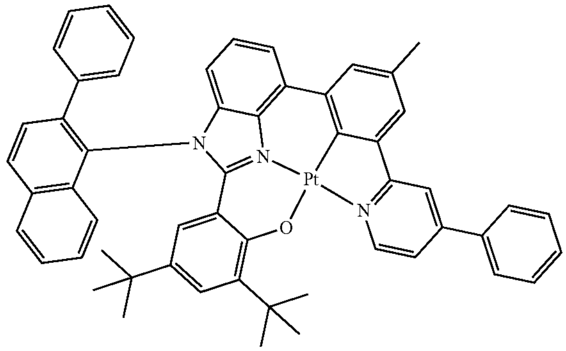
3-326
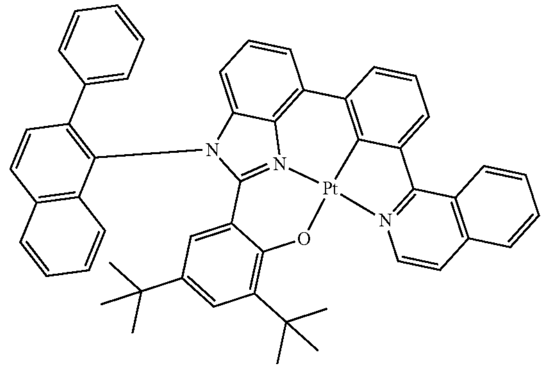
3-327
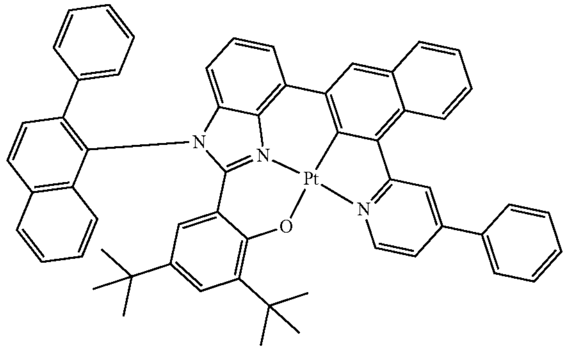
3-328
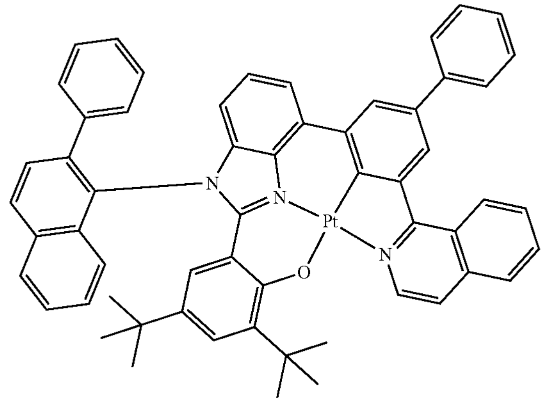

3-329
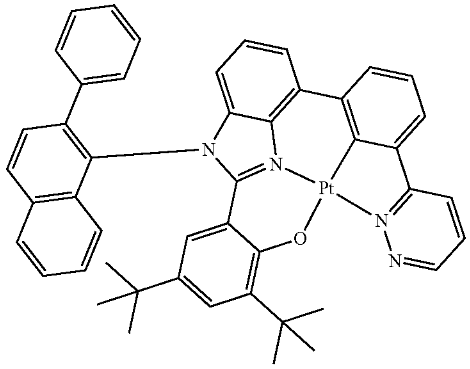
3-330
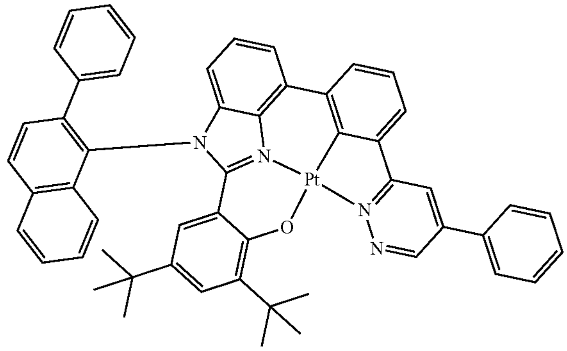
3-331
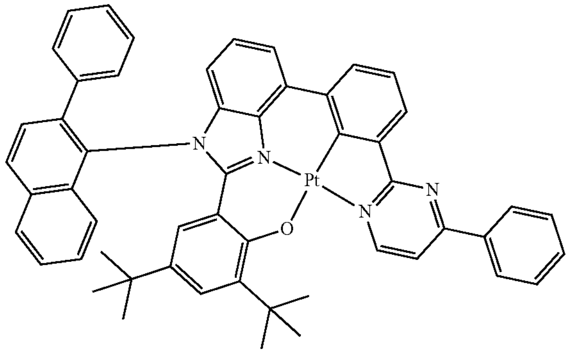
3-332
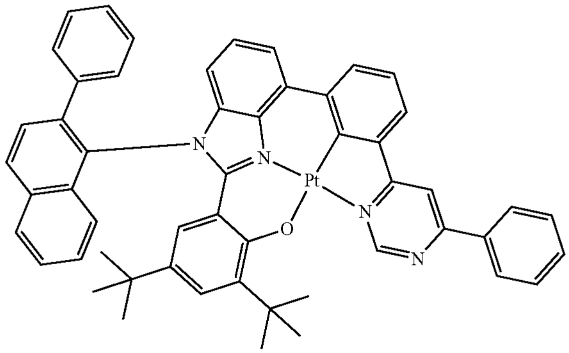
3-333
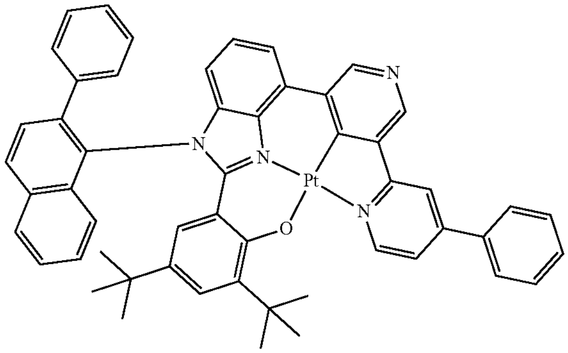
3-334
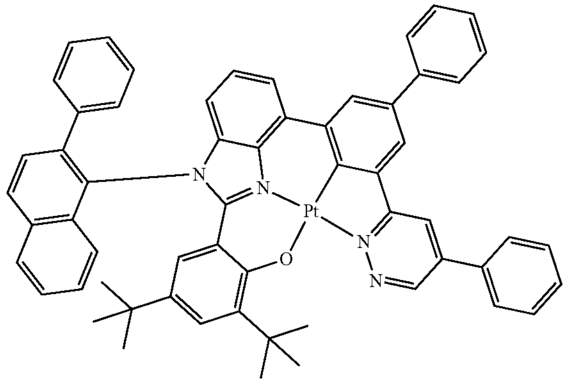
3-335
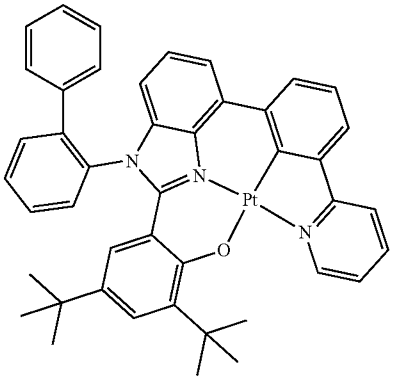
3-336
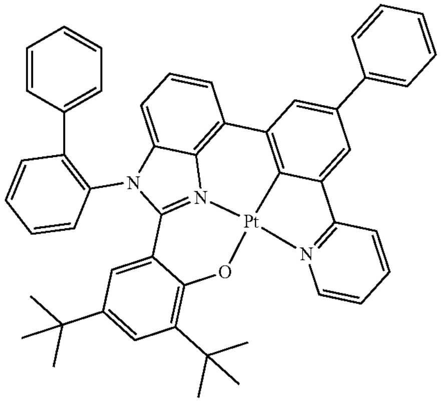

-continued
3-337
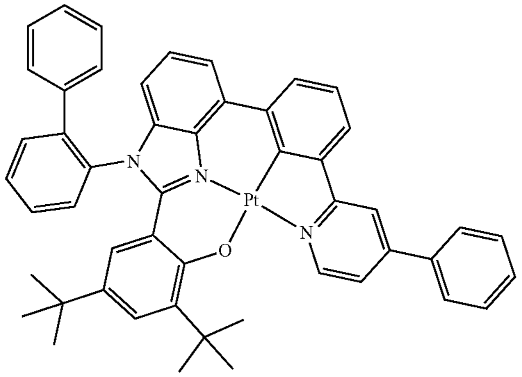
3-338
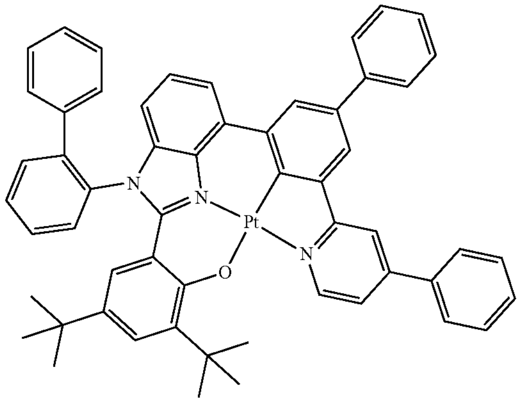
3-339
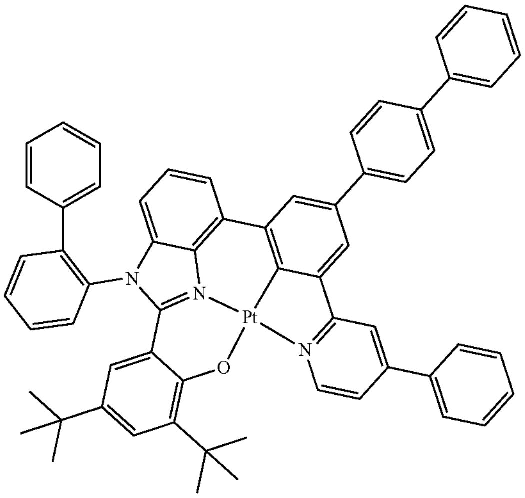
-continued
3-340
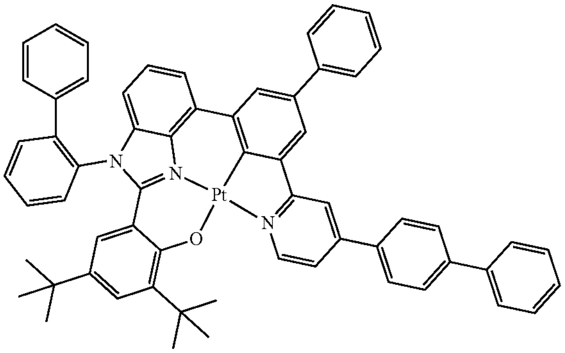
3-341
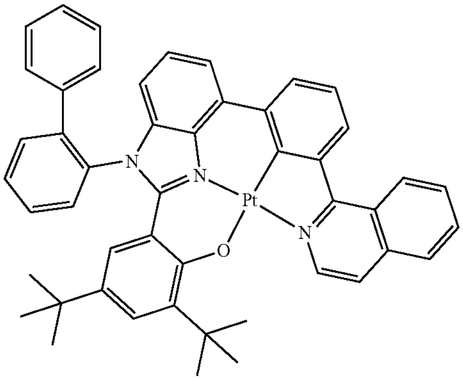
3-342
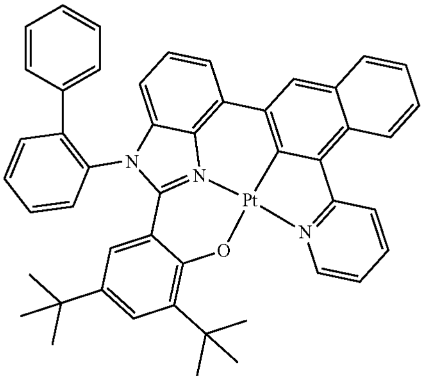
3-343
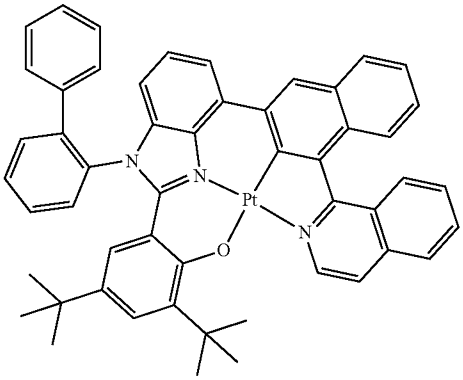

-continued
3-344
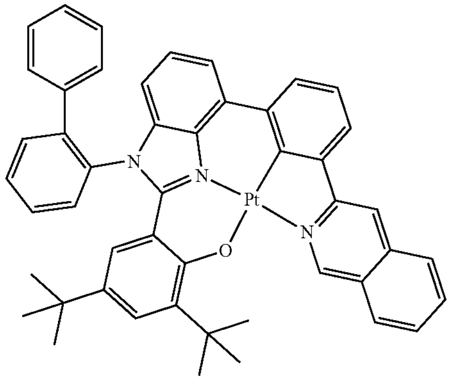
3-345
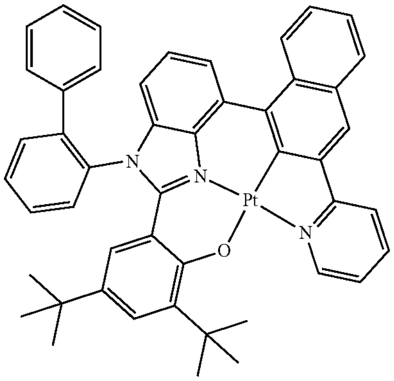
3-346
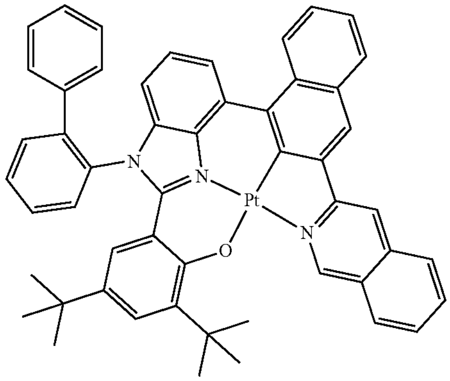
3-347
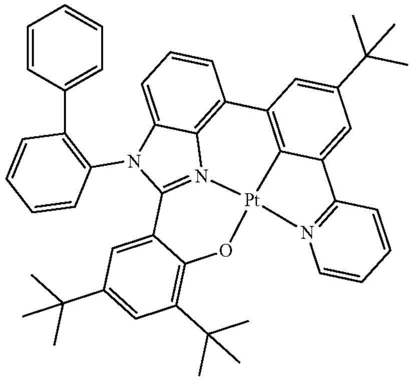
-continued
3-348
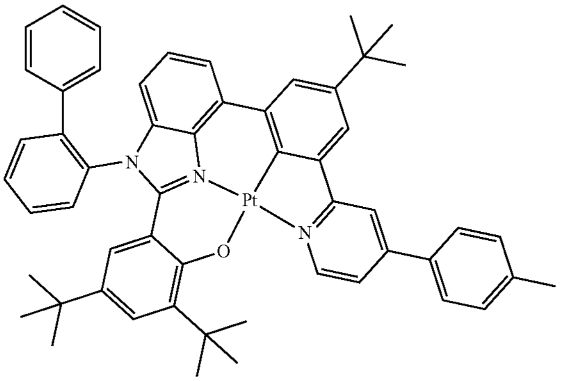
3-349
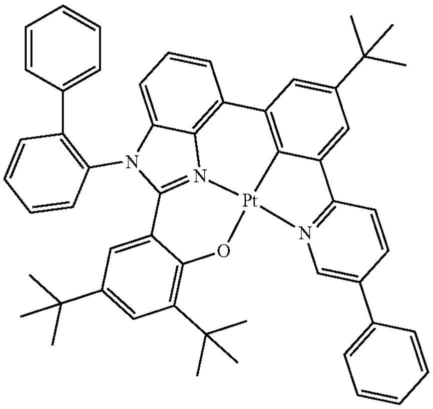
3-350
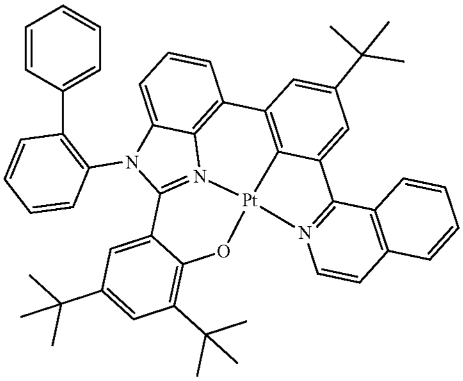
3-351
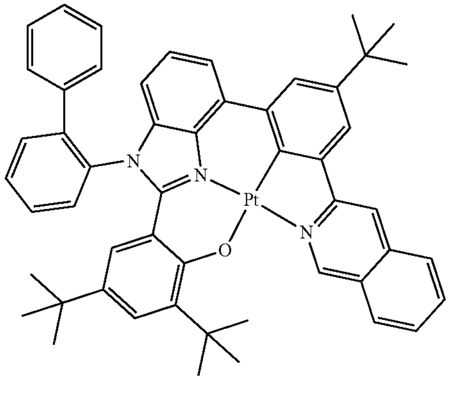

-continued
3-352
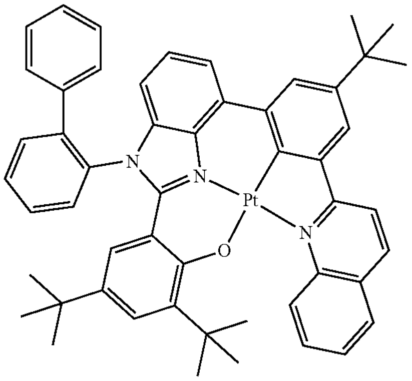
3-353
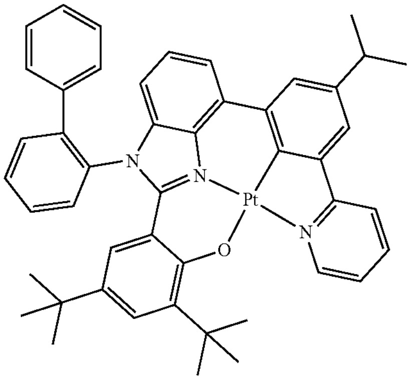
3-354
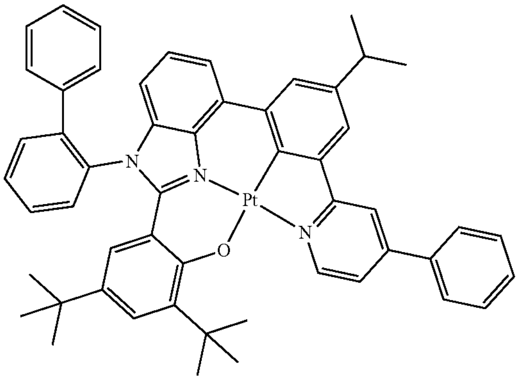
3-355
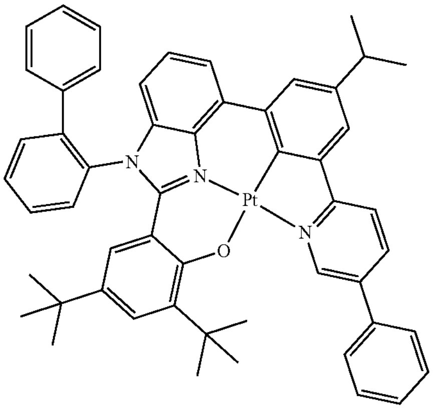
-continued
3-356
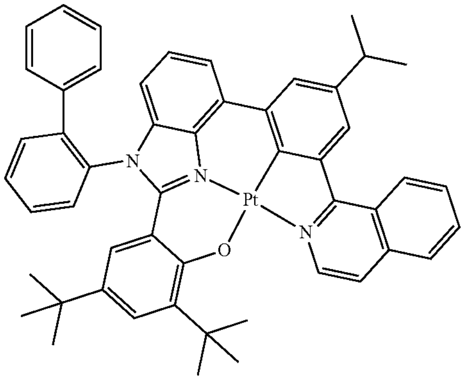
3-357
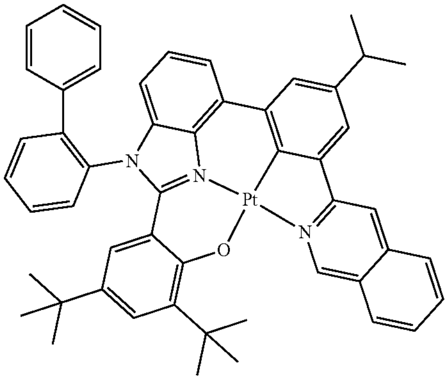
3-358
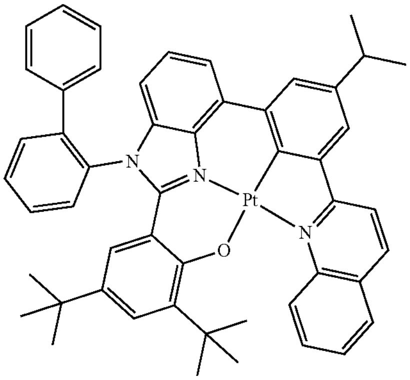
3-359
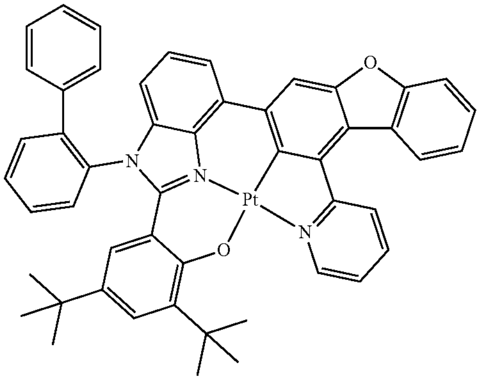

-continued
3-360
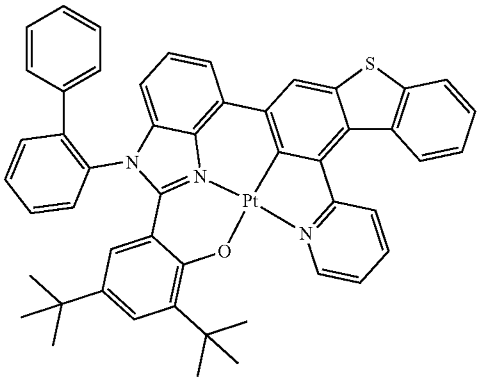
3-361
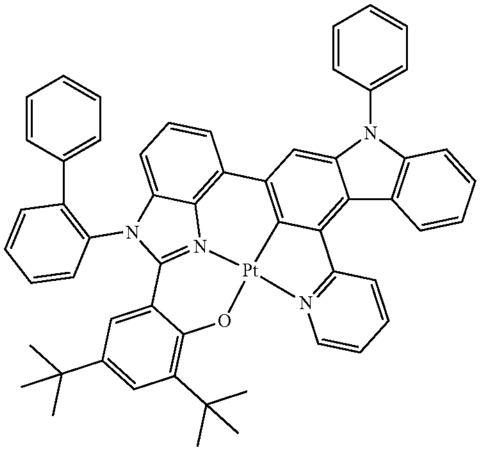
3-362
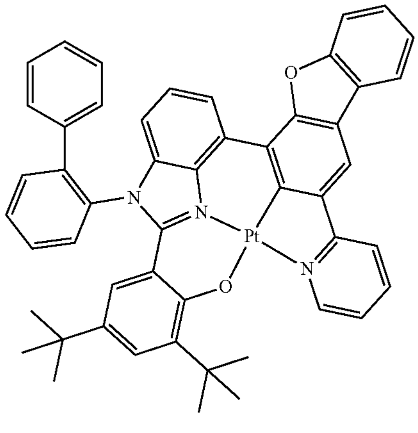
-continued
3-363
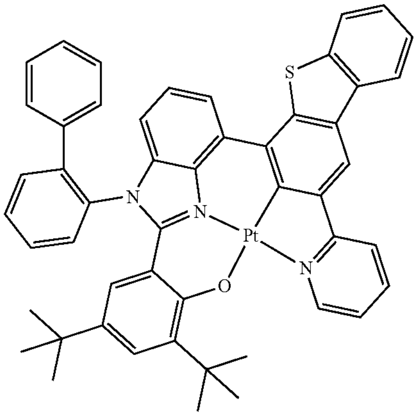
3-364
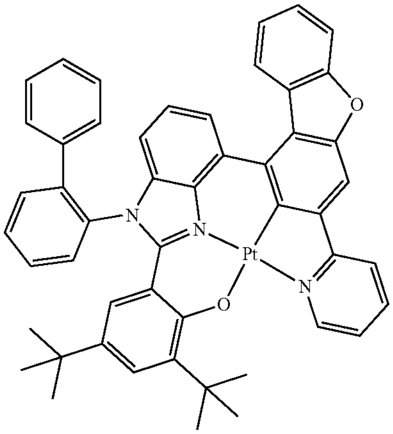
3-365
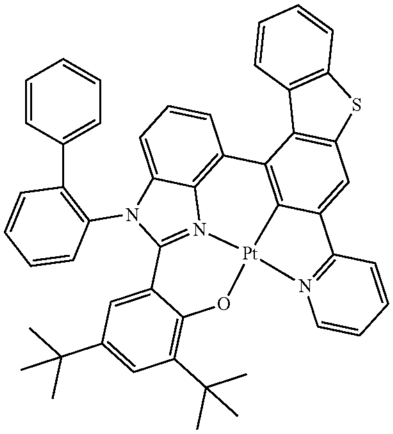

-continued
3-366
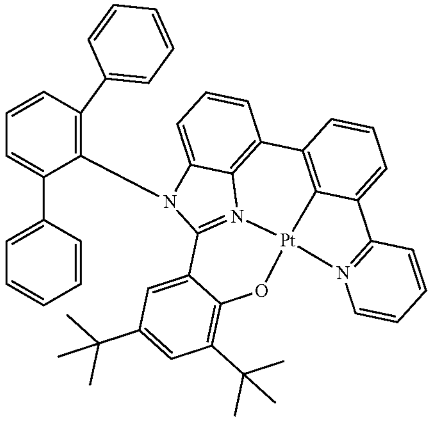
3-367
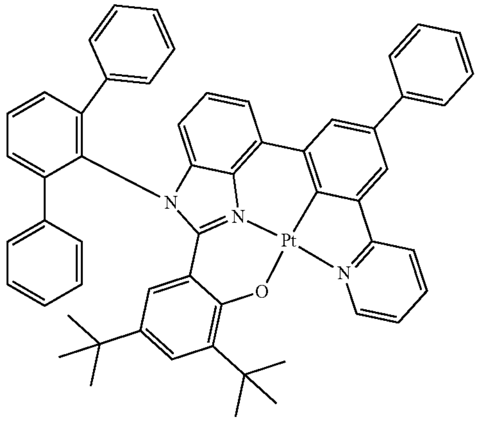
3-368
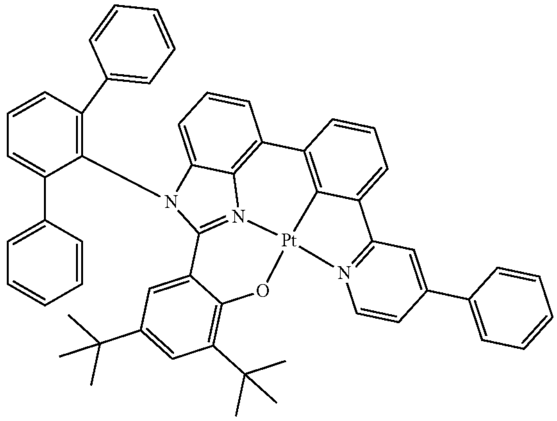
-continued
3-369
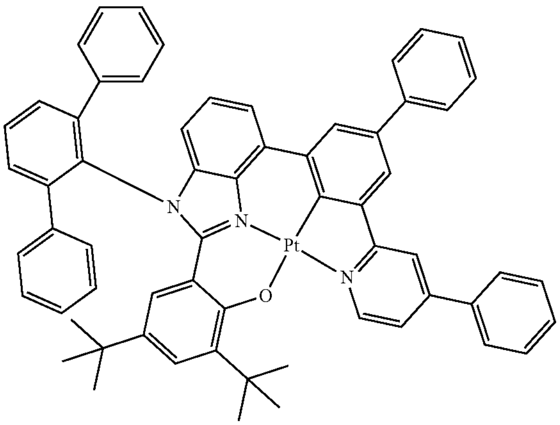
3-370
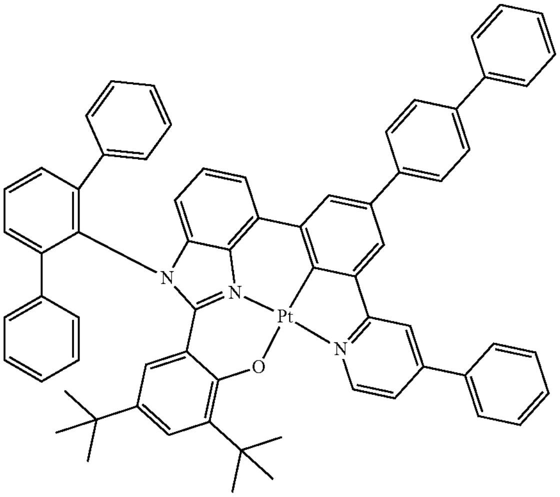
3-371
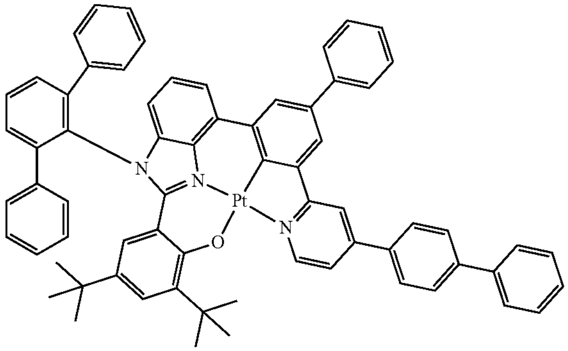

-continued
3-372
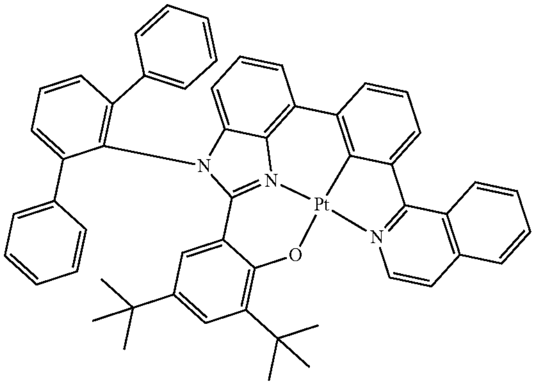
3-373
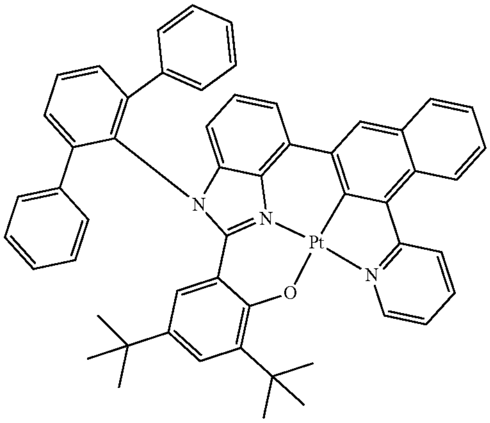
3-374
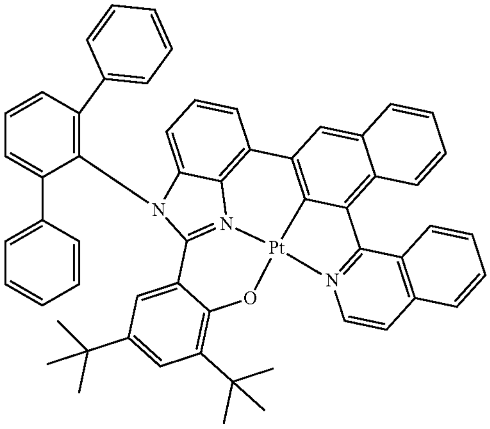
-continued
3-375
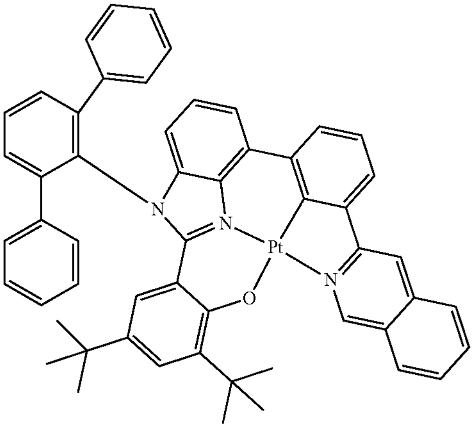
3-376
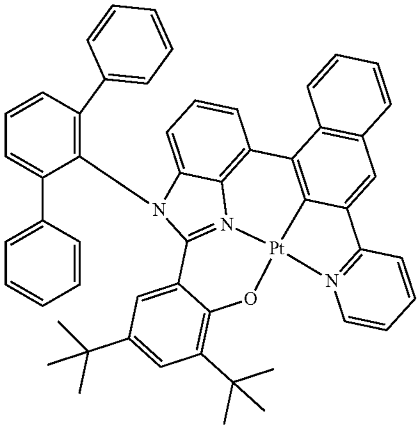
3-377
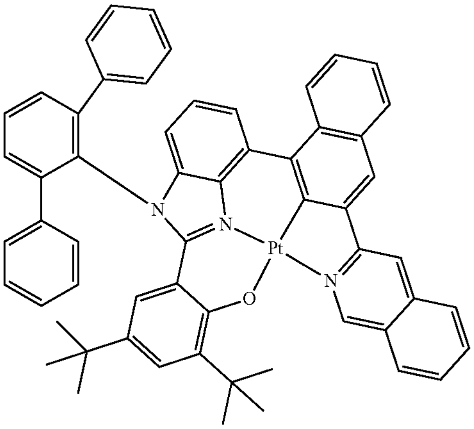

-continued
3-378
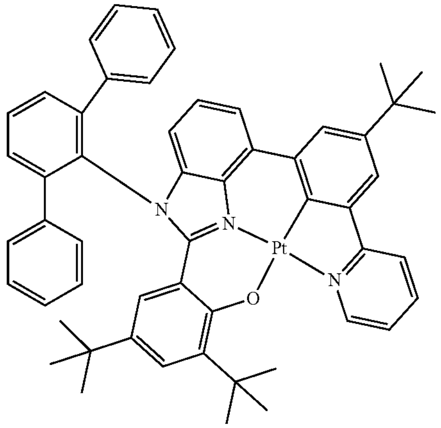
3-379
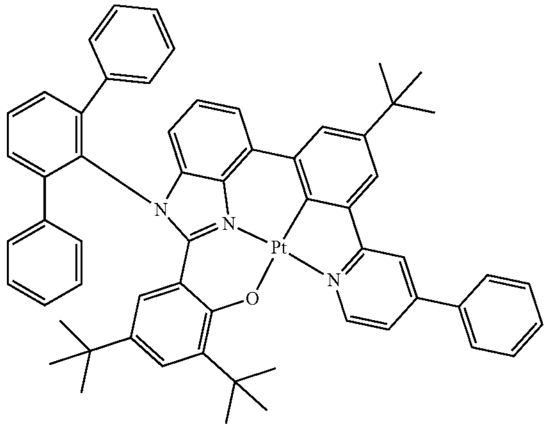
3-380
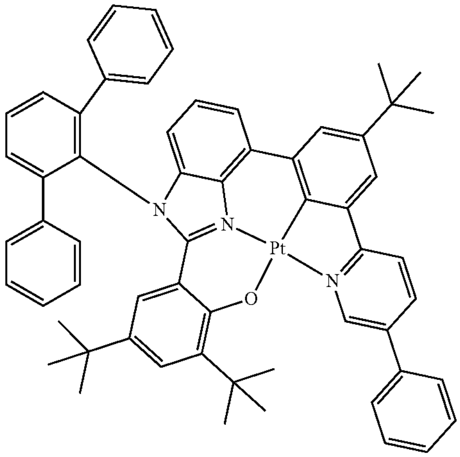
-continued
3-381
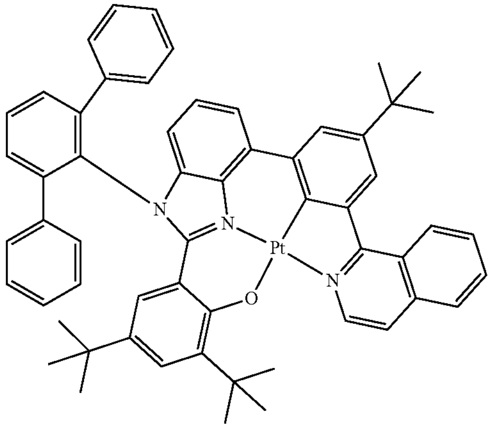
3-382
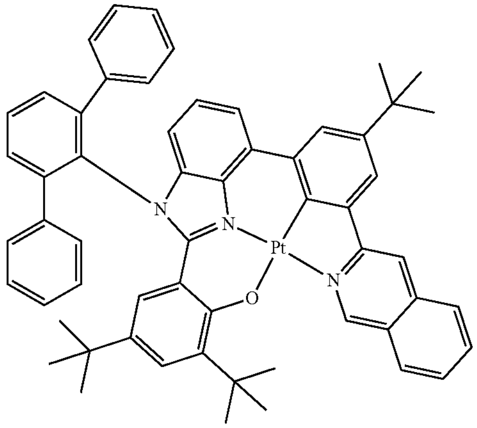
3-383
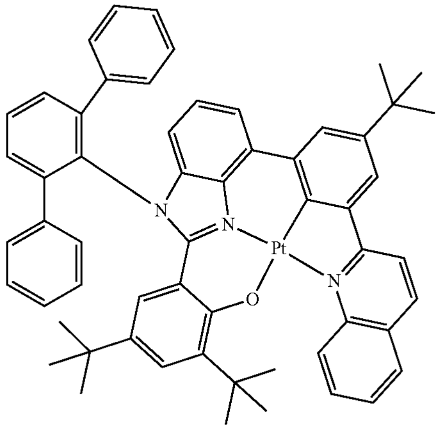

-continued
3-384
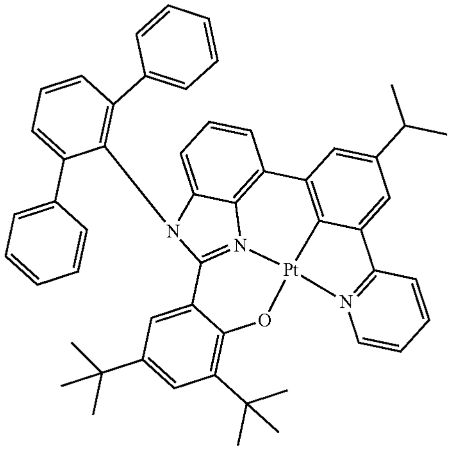
3-385
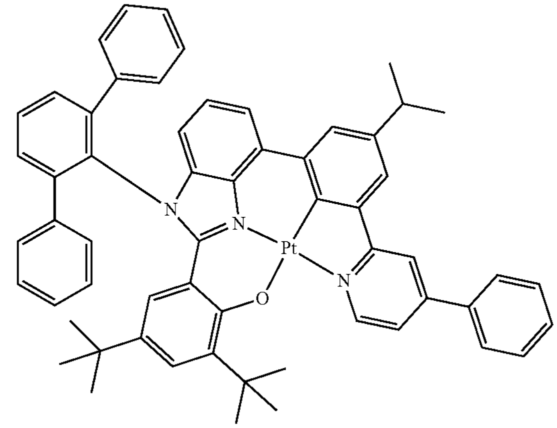
3-386
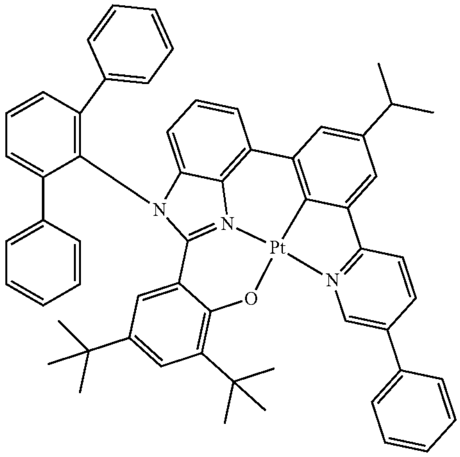
-continued
3-387
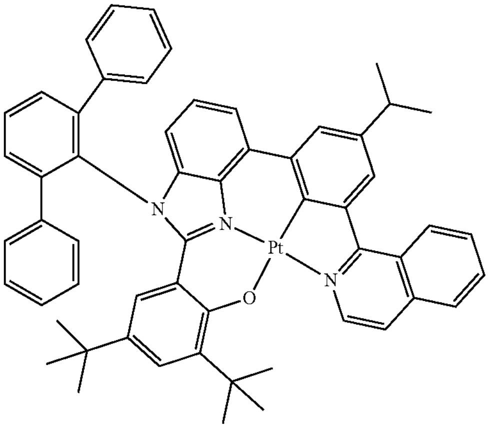
3-388
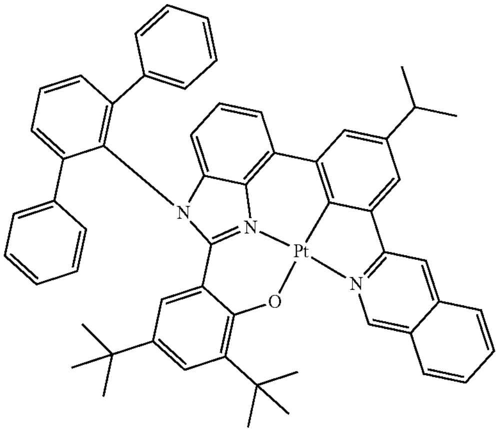
3-389
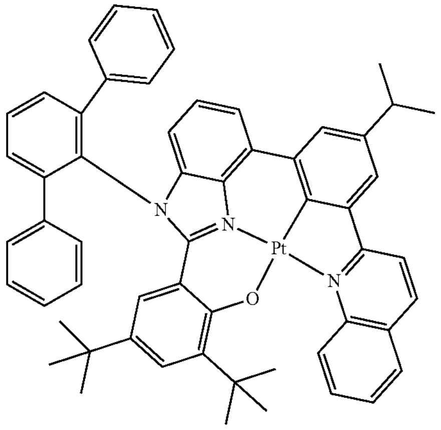

-continued
3-390
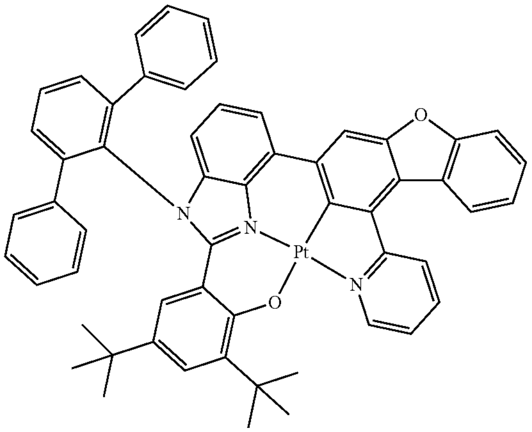
3-391
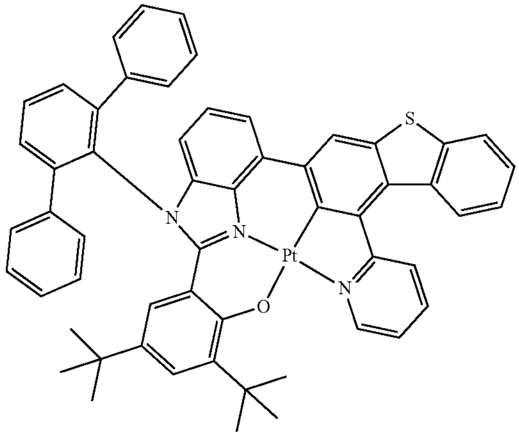
3-392
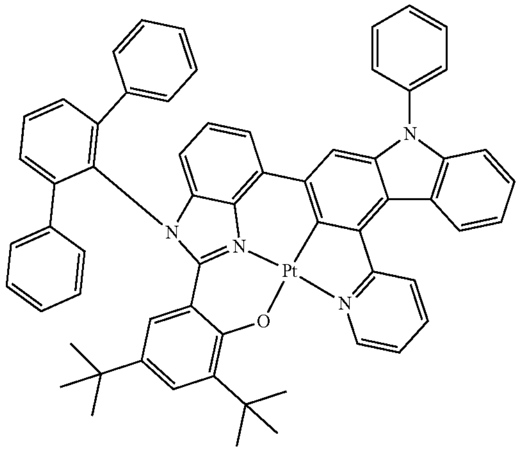
-continued
3-393
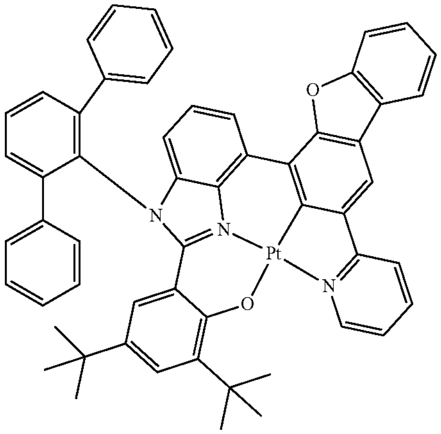
3-394
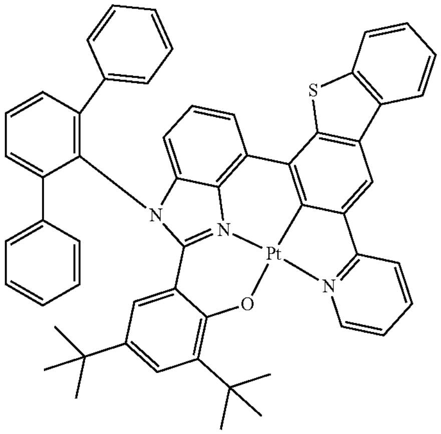
3-395
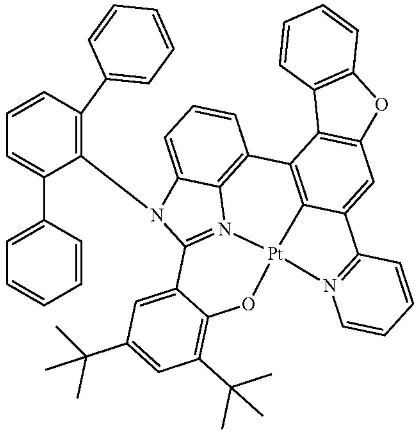

-continued
3-396
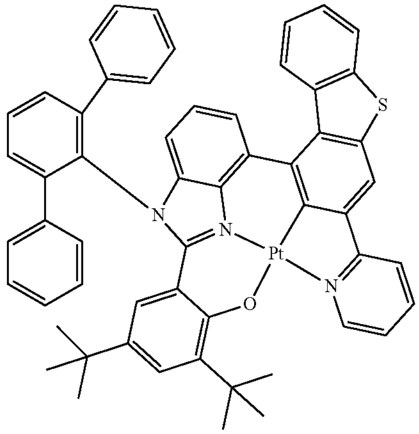
3-397
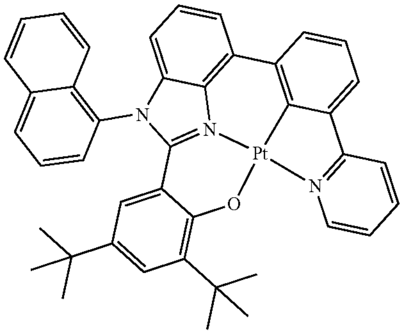
3-398
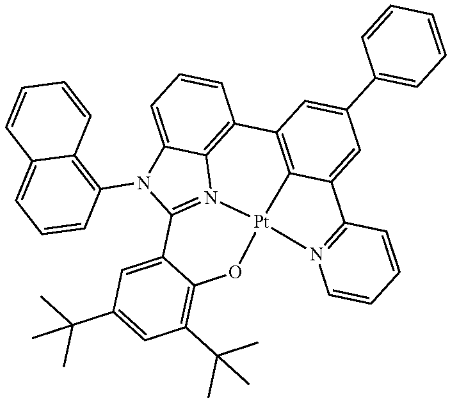
3-399
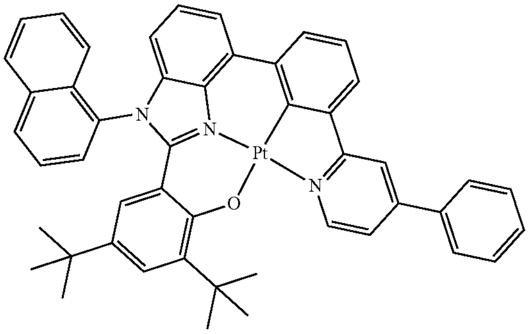
-continued
3-400
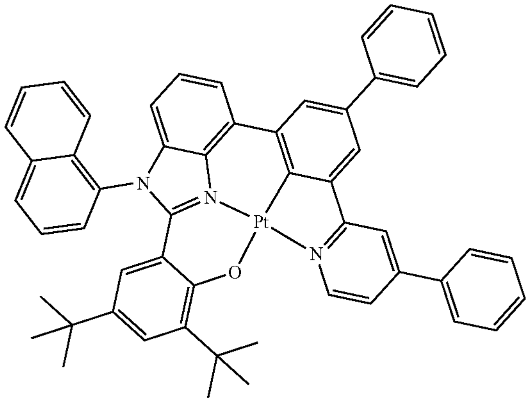
3-401
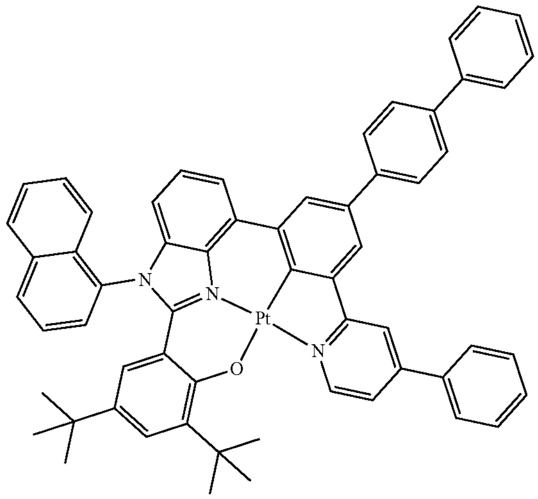
3-402
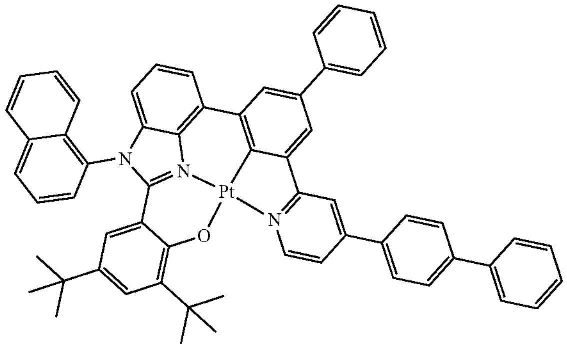
3-403
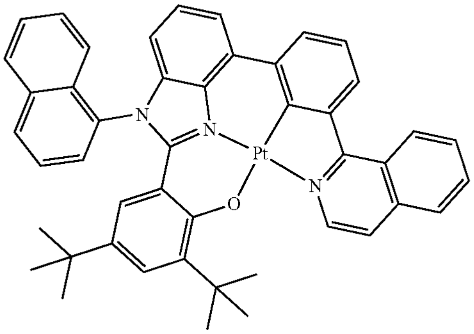

-continued
3-404
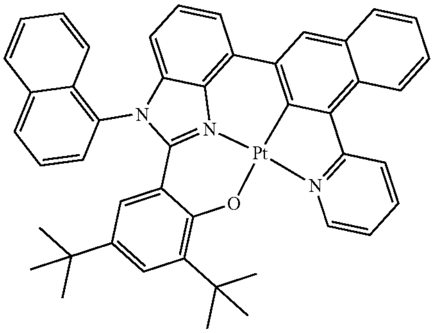
3-405
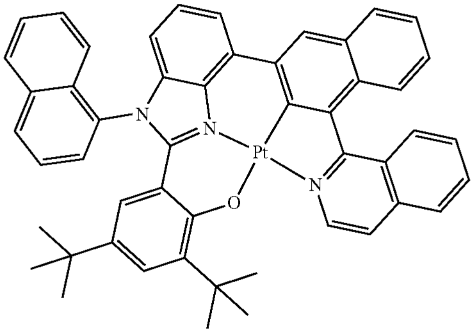
3-406
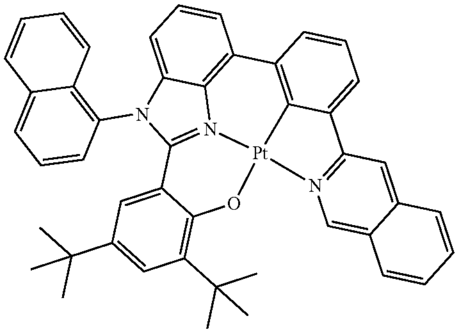
-continued
3-407
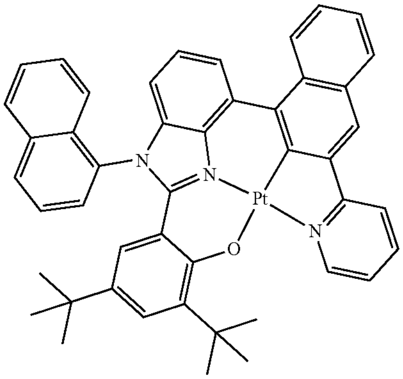
3-408
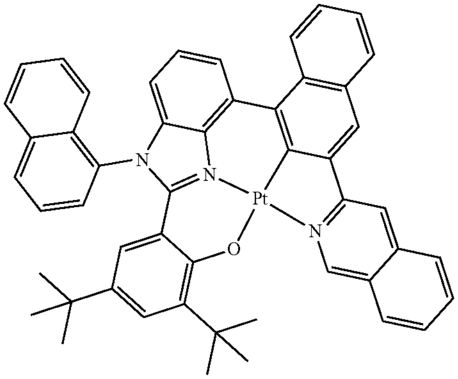
3-417
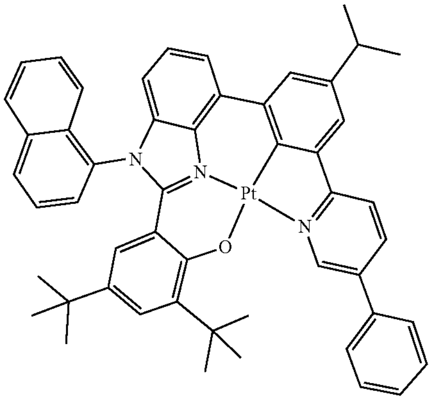
3-418
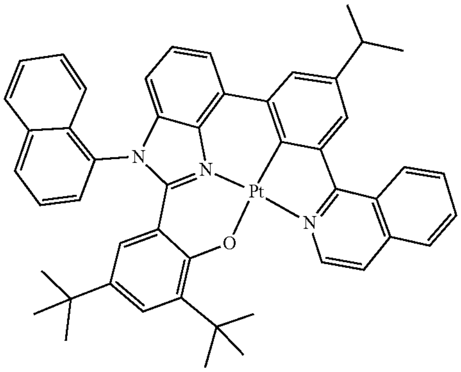

-continued
3-419
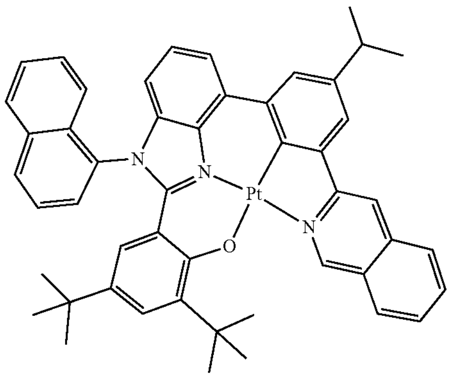
3-420
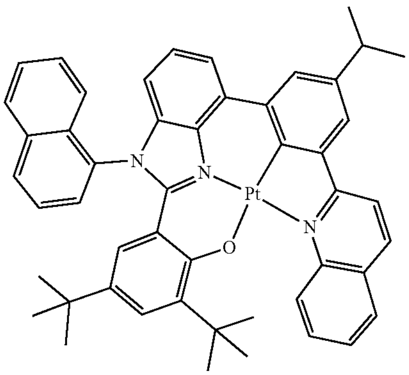
3-421
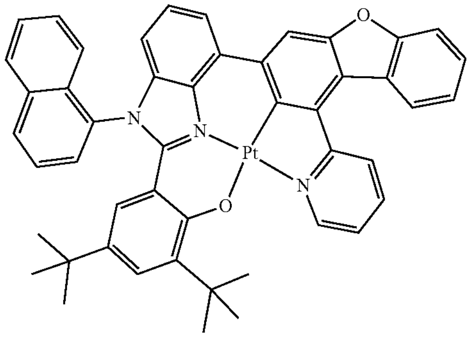
3-422
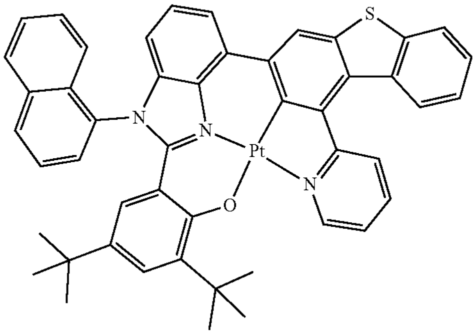
3-423
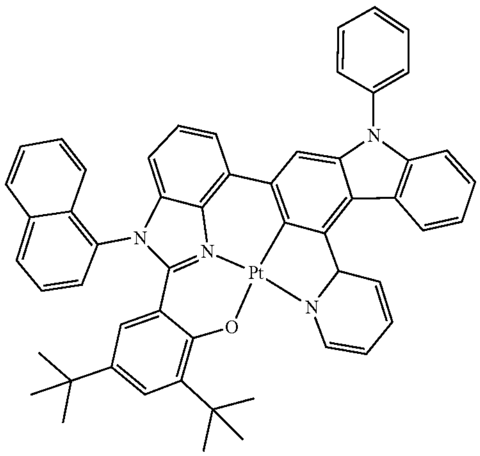
3-424
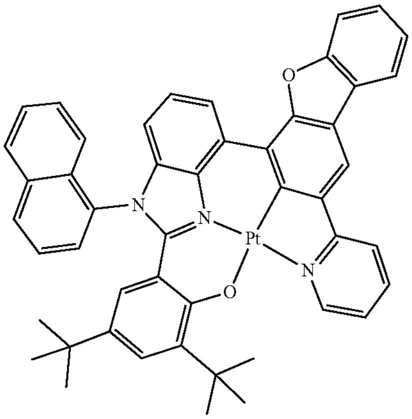
3-425
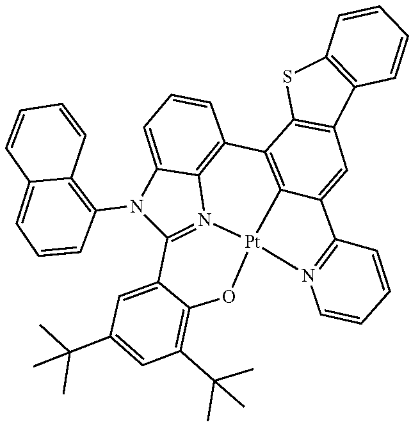
3-426
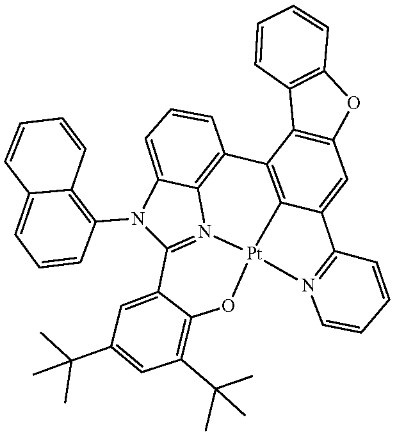

-continued
3-427
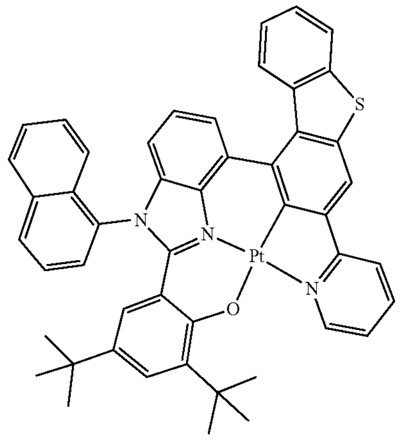
3-428
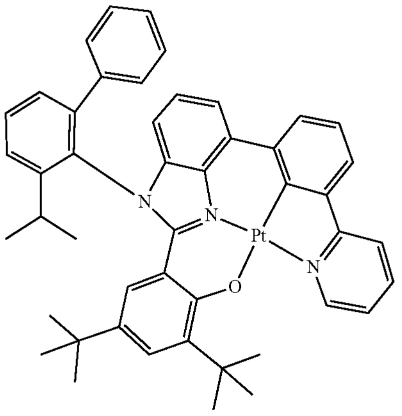
3-429
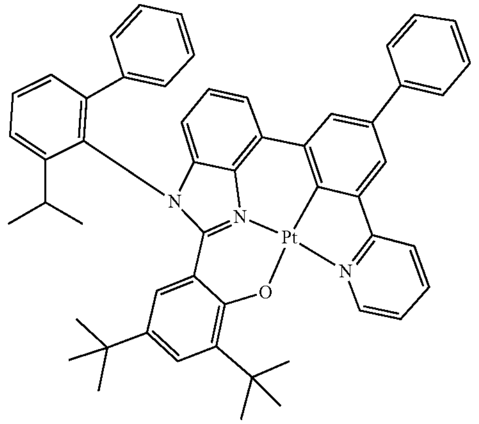
3-430
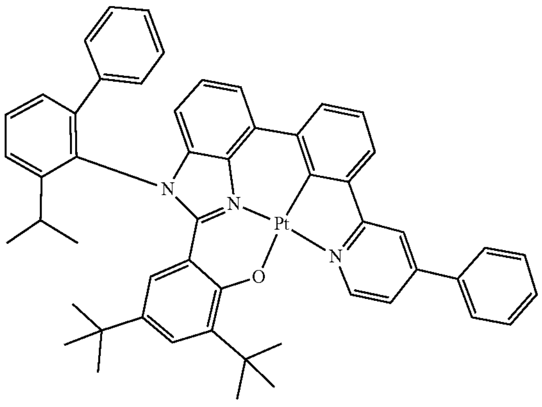
3-431
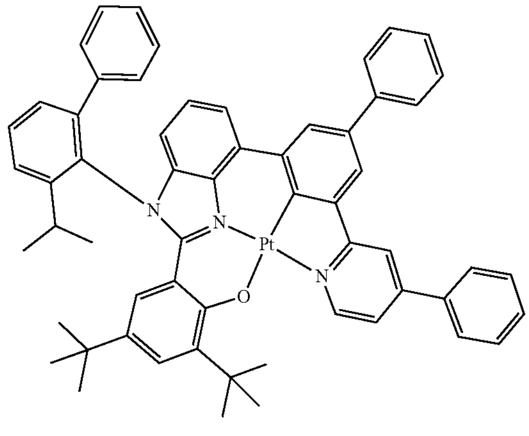
3-432
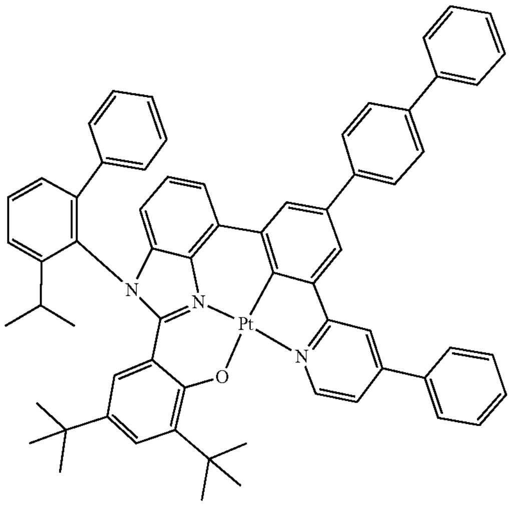

-continued
3-433
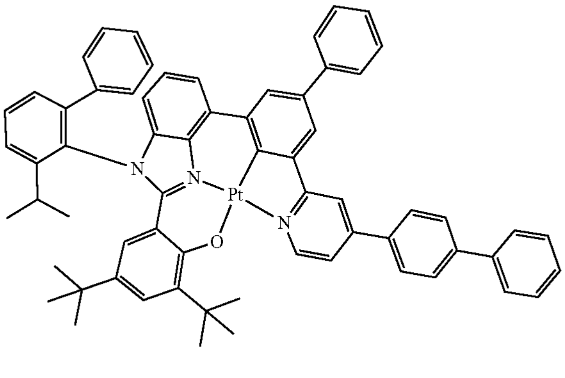
3-434
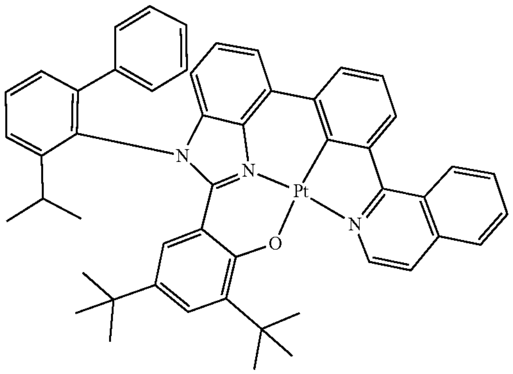
4-435
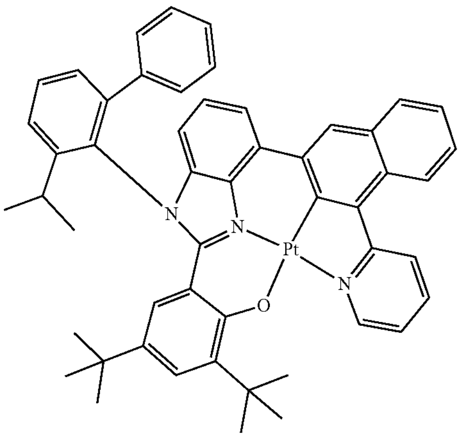
3-436
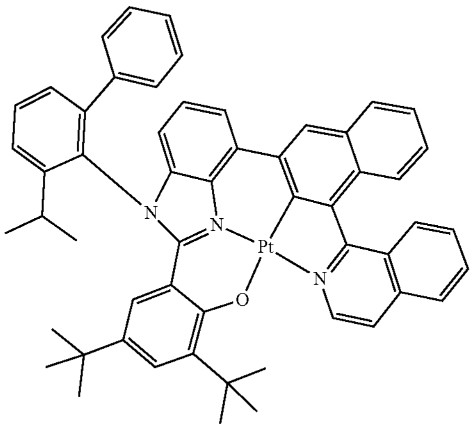
3-437
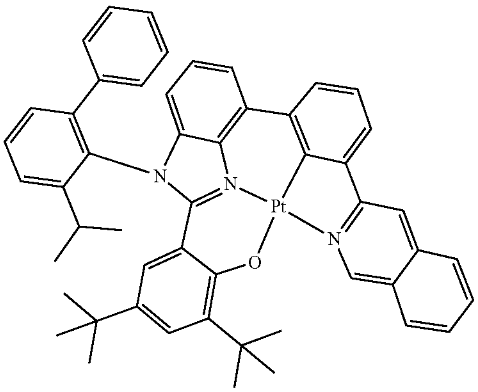
3-448
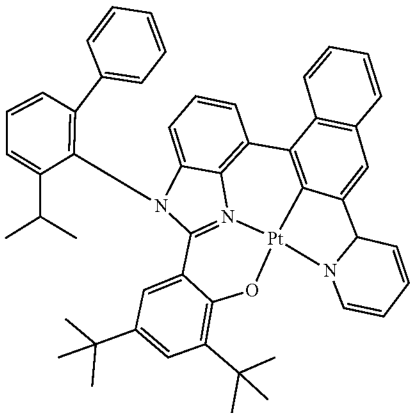

-continued
3-439
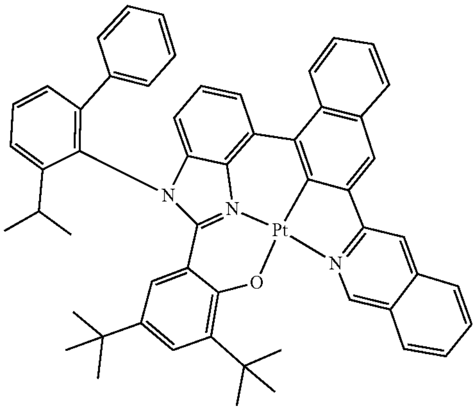
3-440
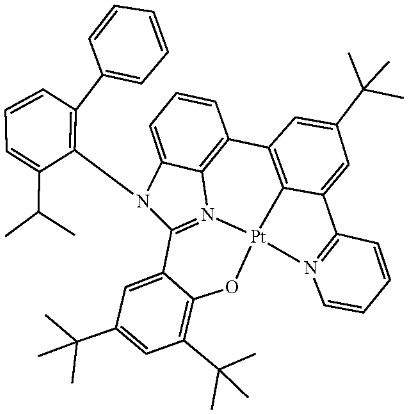
3-441
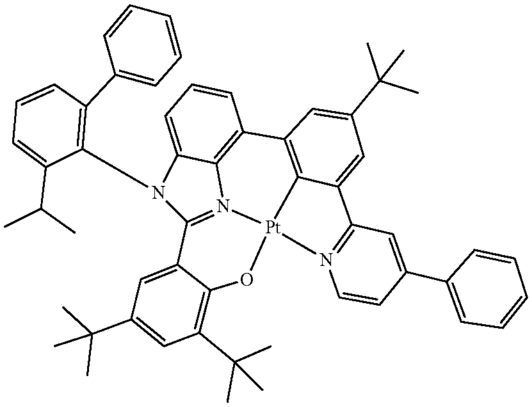
3-442
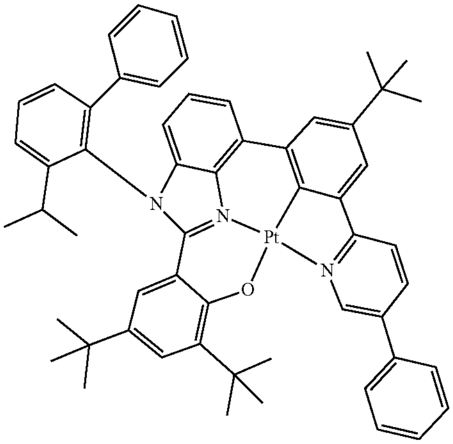
3-443
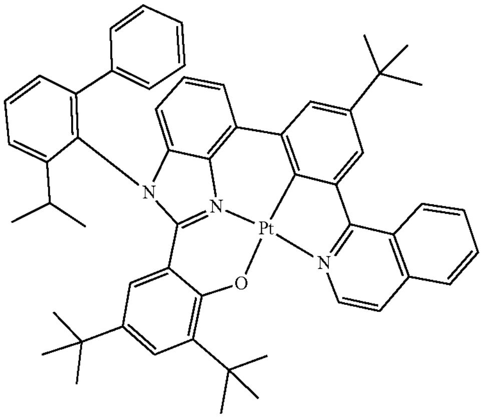
3-444
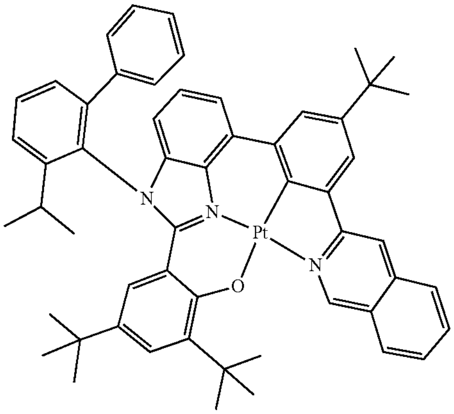

-continued
3-445
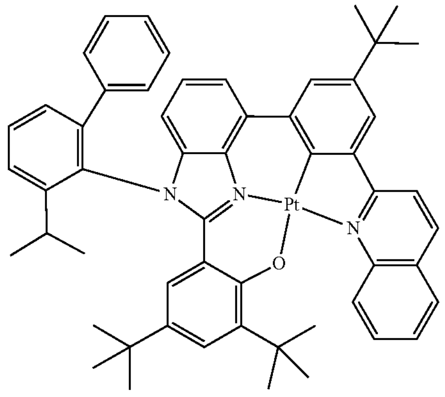
3-446
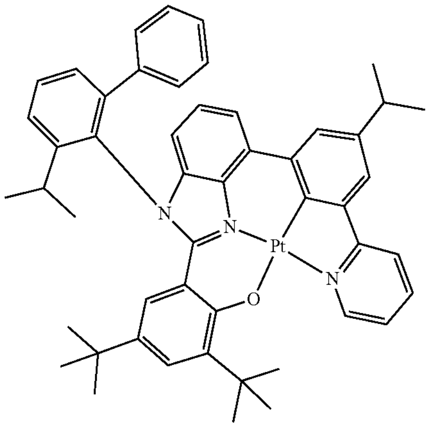
3-447
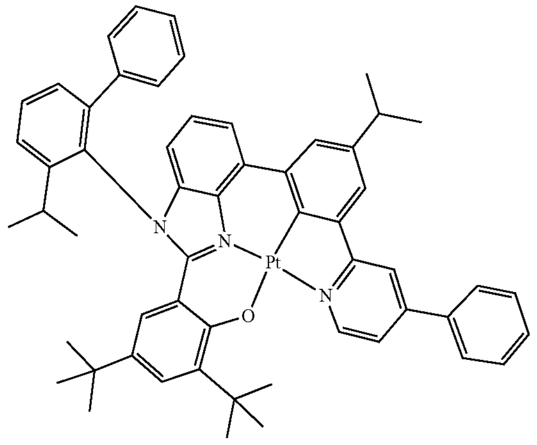
3-448
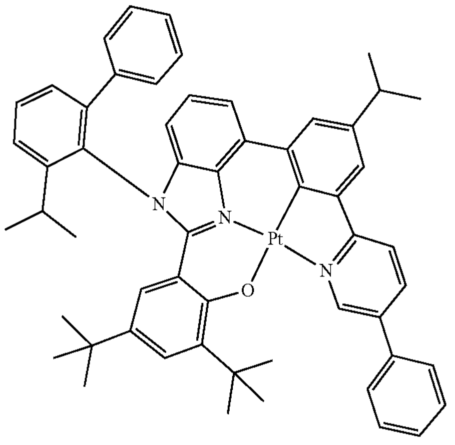
3-449
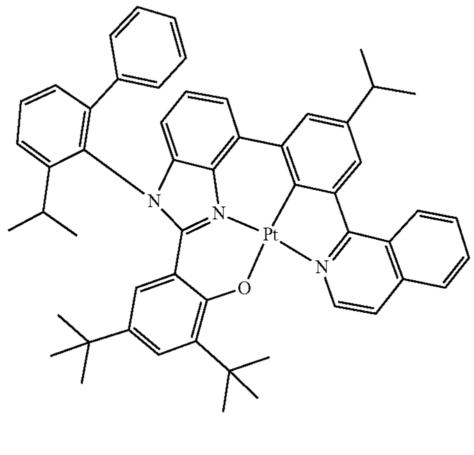
3-450
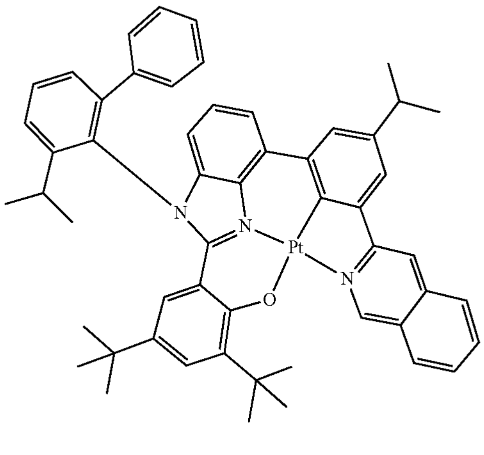

-continued
3-451
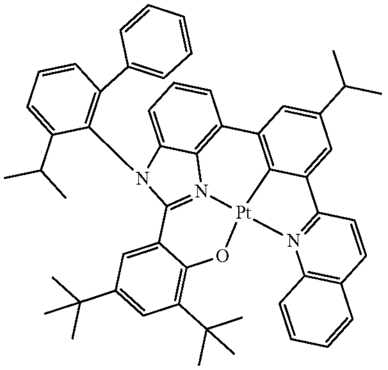
3-452
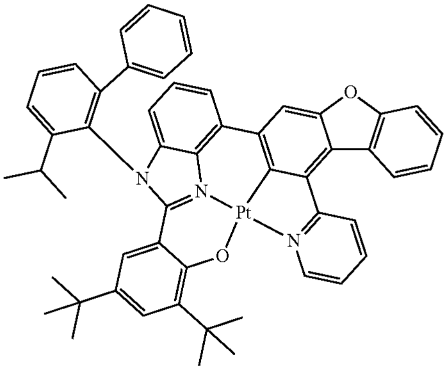
3-453
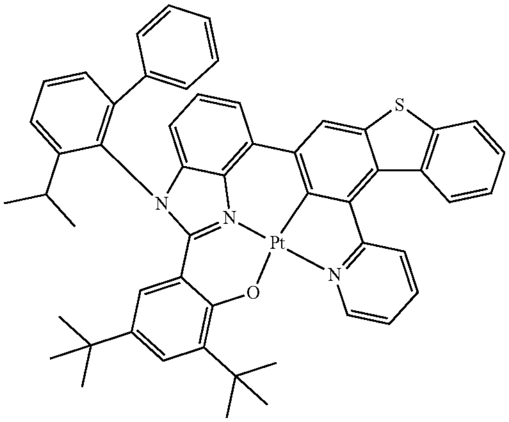
3-454
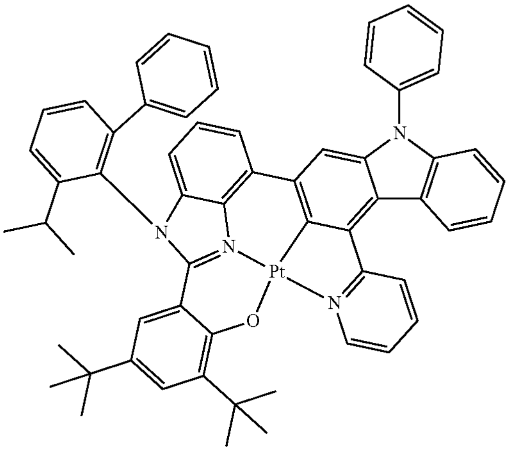
3-413
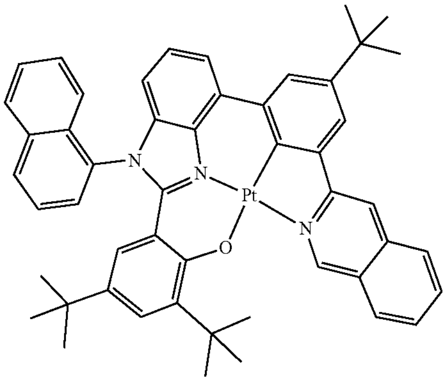
3-414
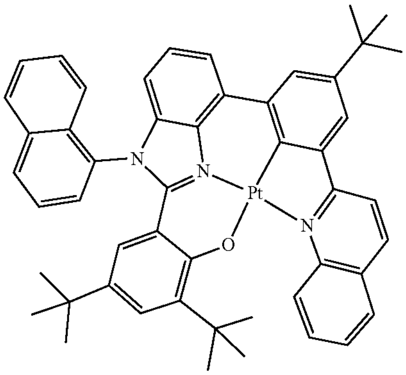
3-415
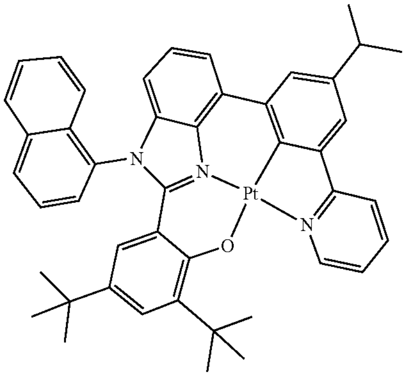
3-416
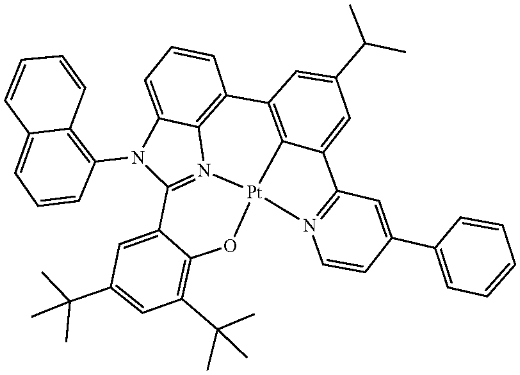

3-524
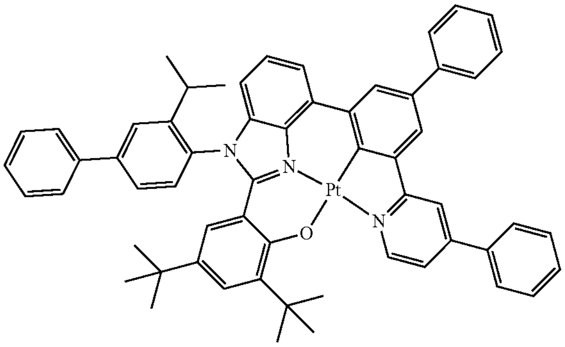
3-525
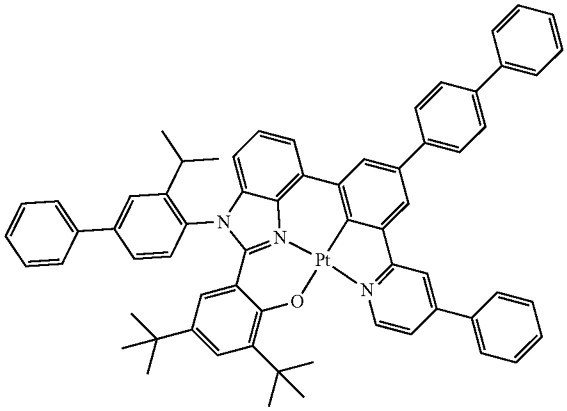
3-526
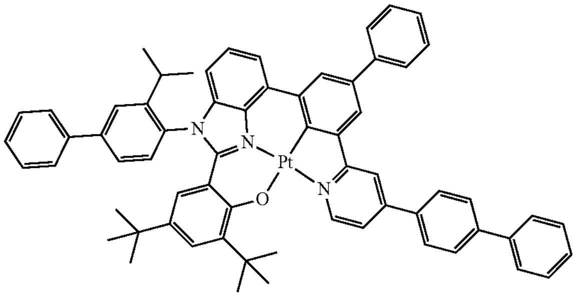
3-527
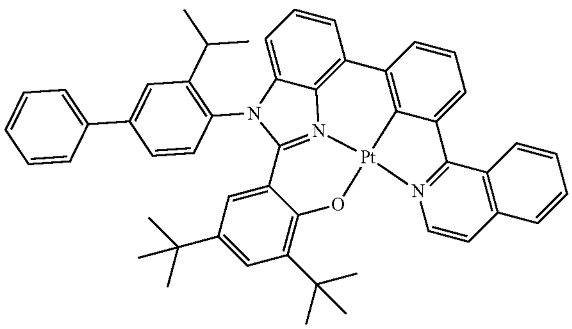
-continued
3-528
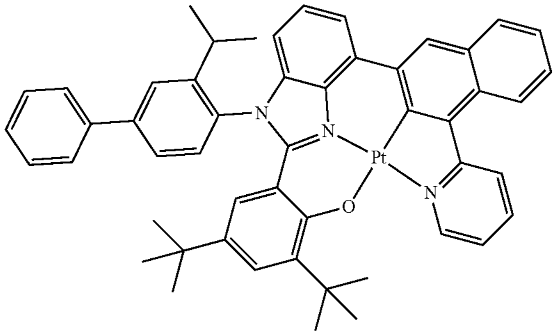
3-529
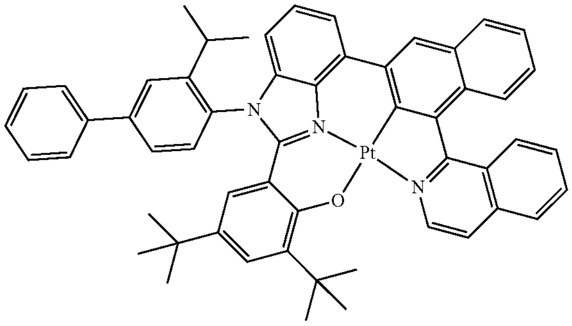
3-530
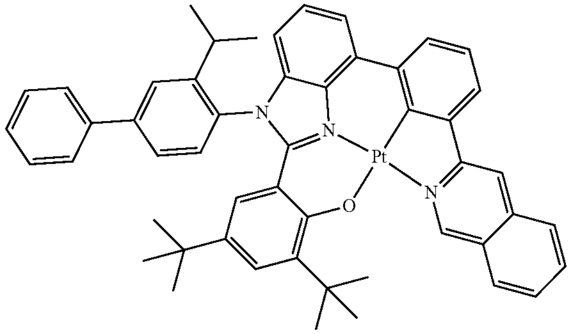
3-531
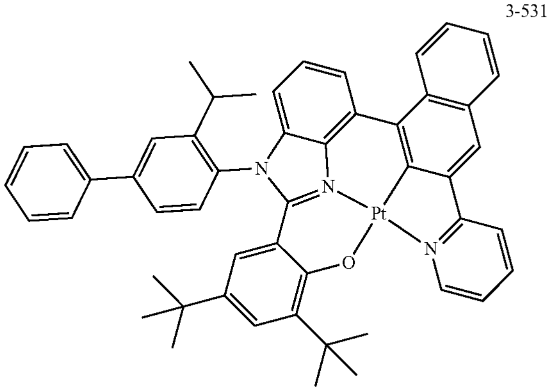

-continued
3-532
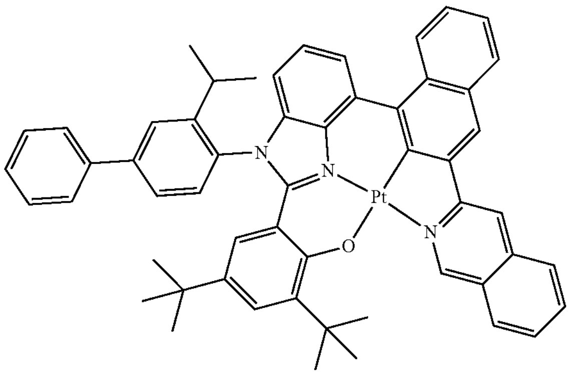
3-533
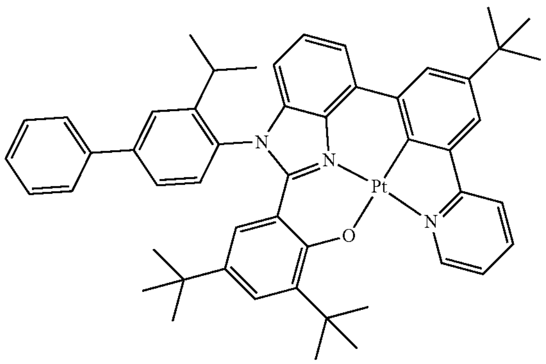
3-534
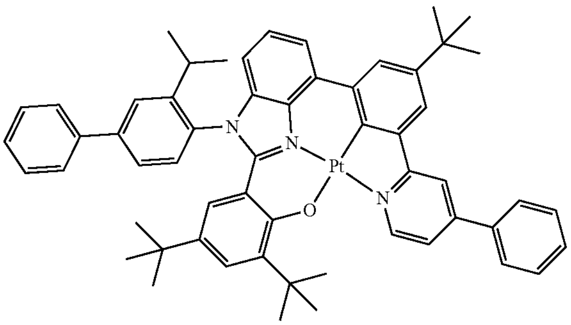
3-535
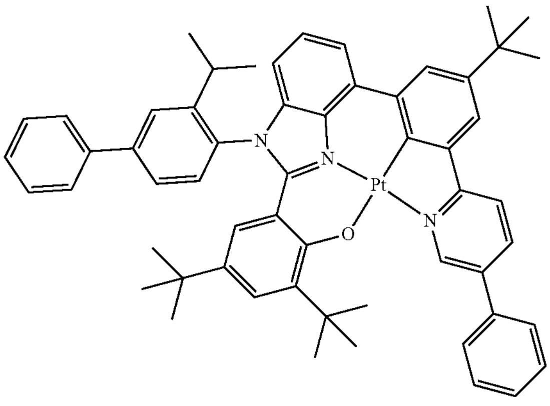
-continued
3-536
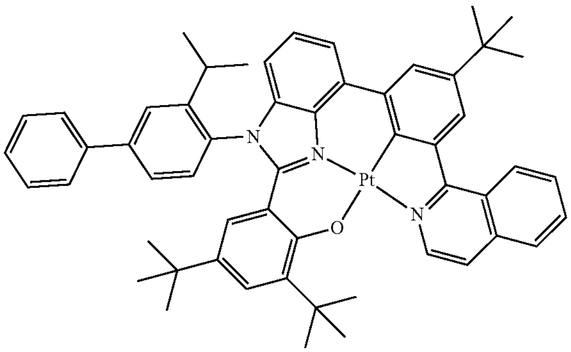
3-537
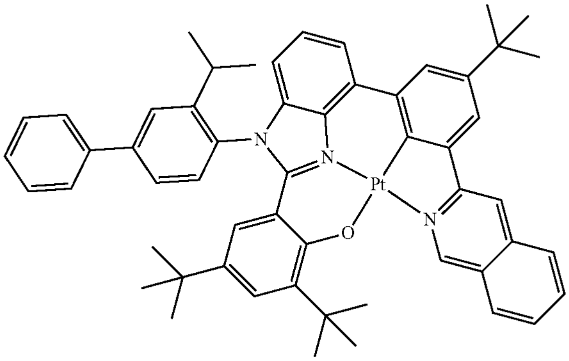
3-538
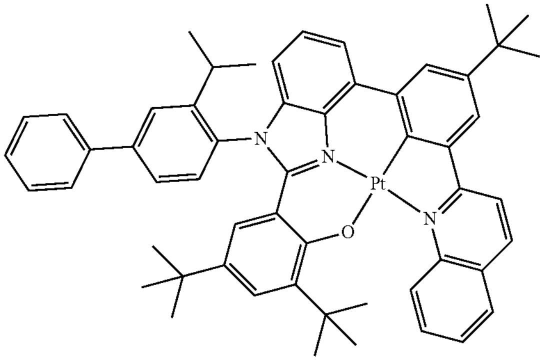
3-539
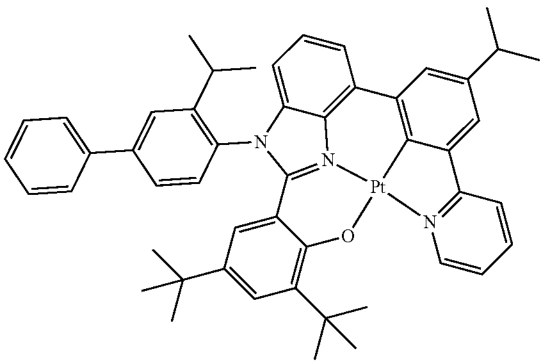

-continued
3-540
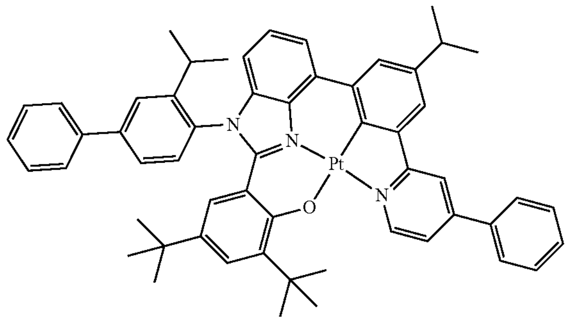
3-541
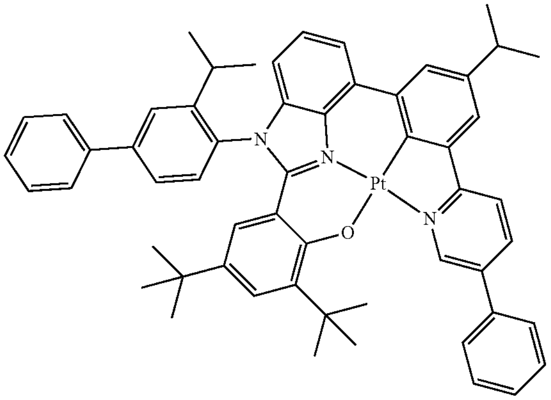
3-542
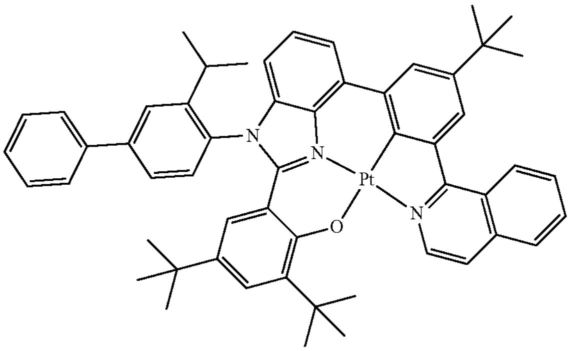
3-543
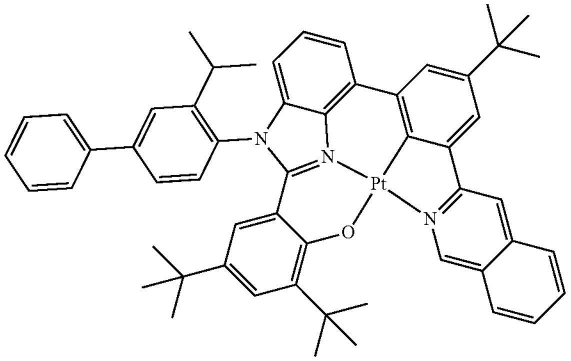
-continued
3-544
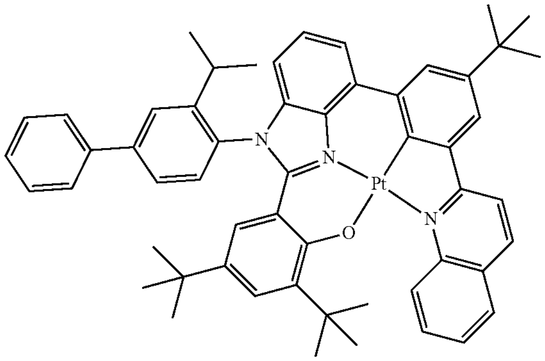
3-545
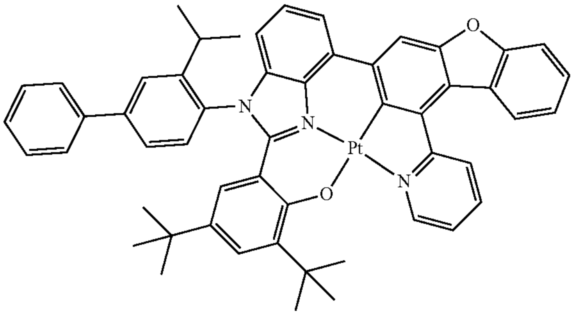
3-546
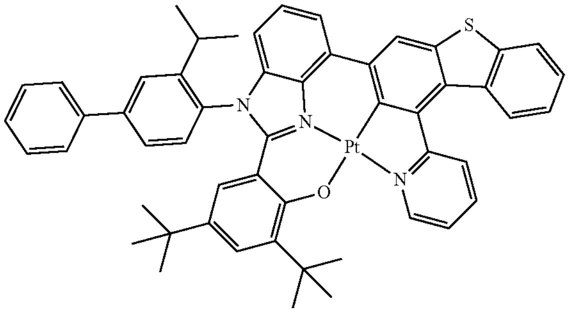
3-547
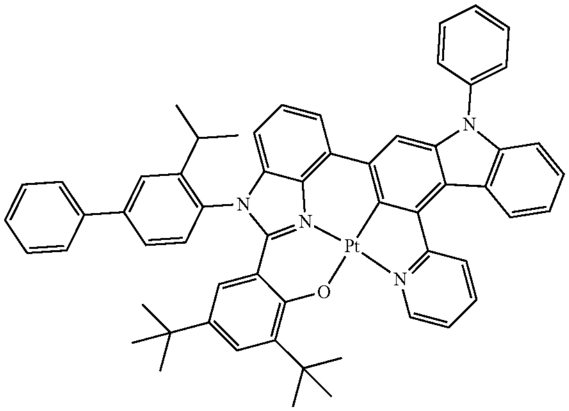

-continued
3-548
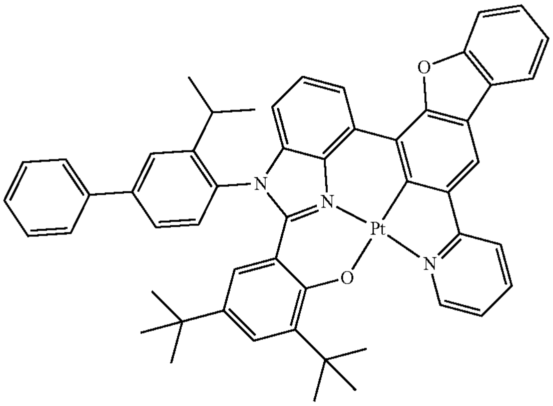
3-549
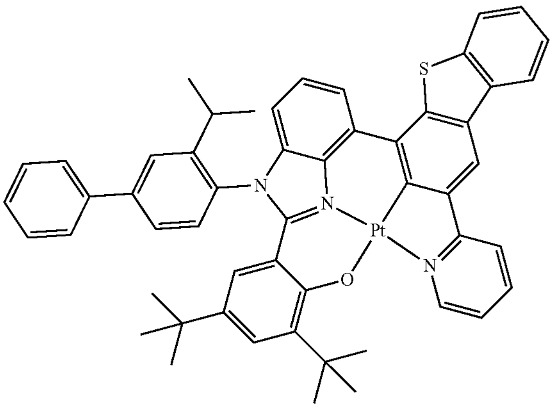
3-550
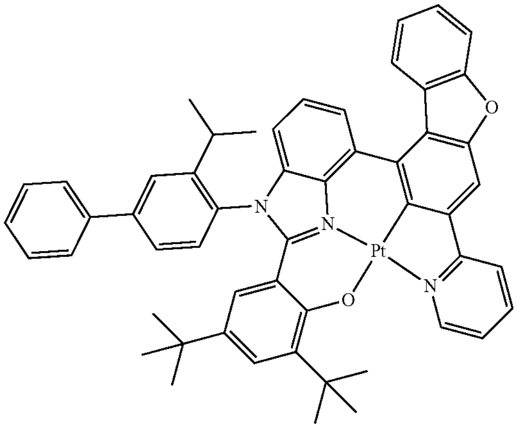
-continued
3-551
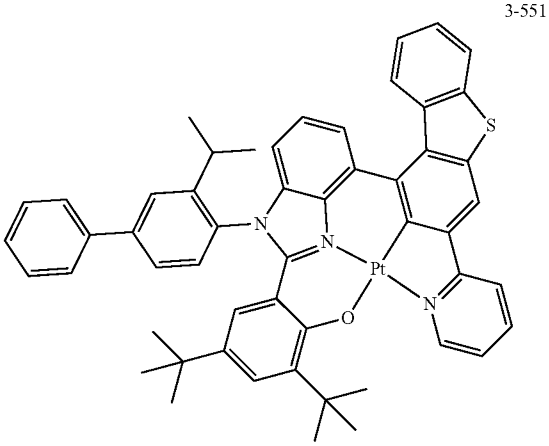
3-552
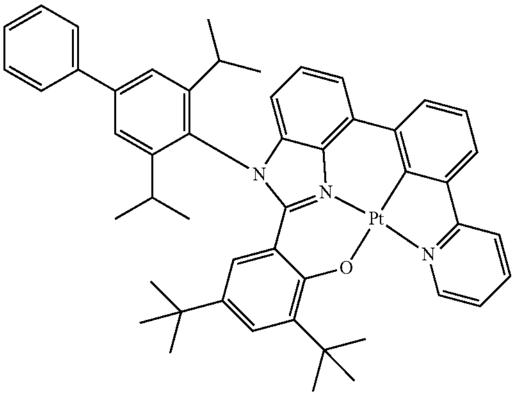
3-553
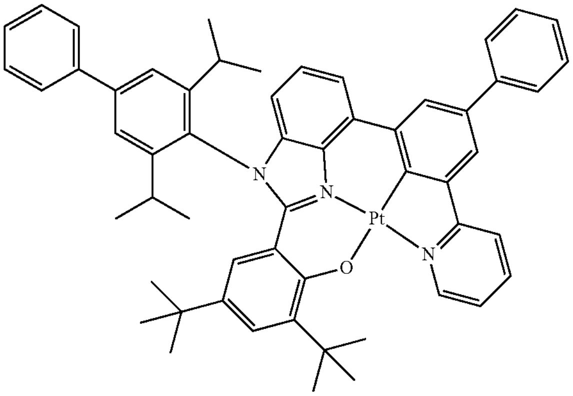
3-554
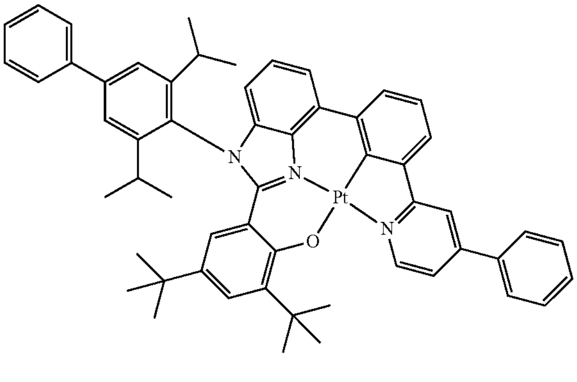

3-555
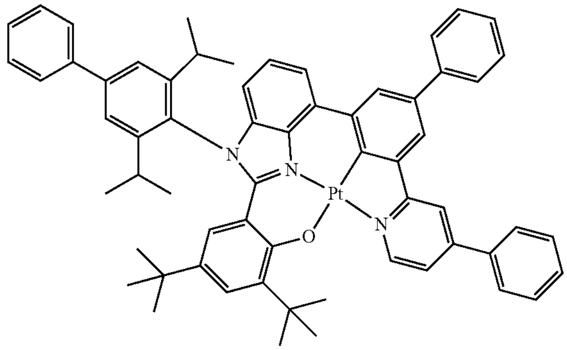
3-556
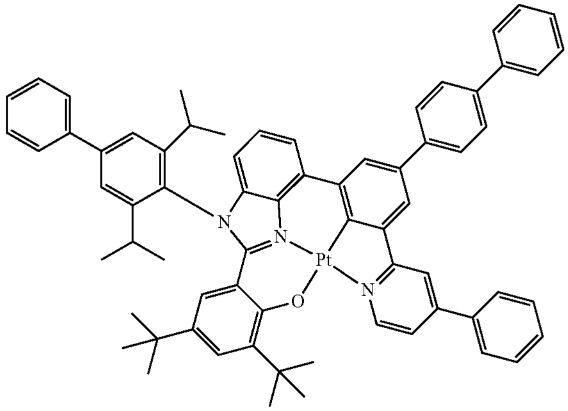
3-557
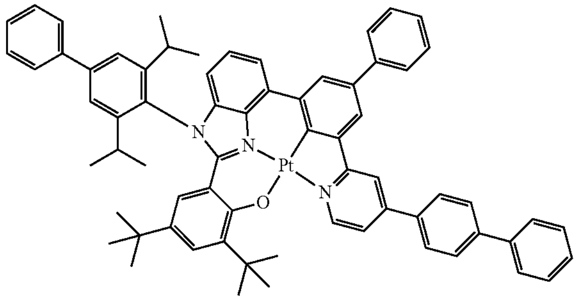
3-558
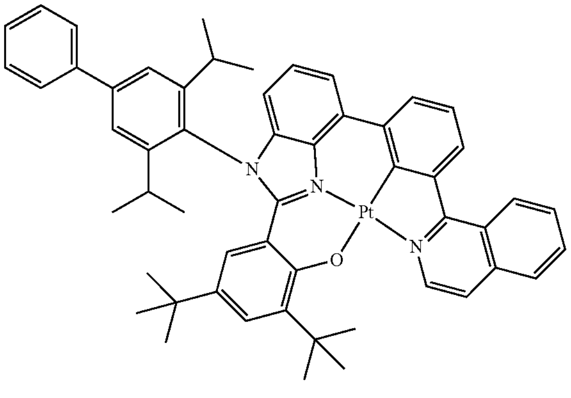
3-559
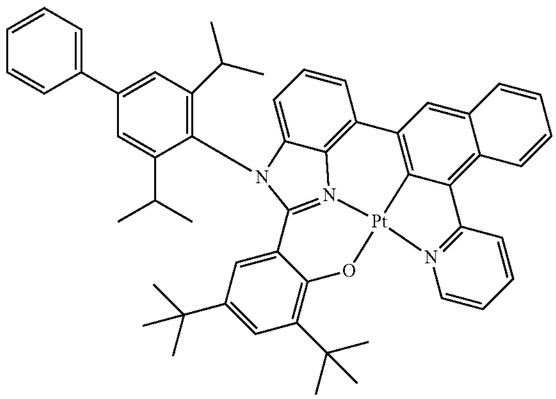
3-560
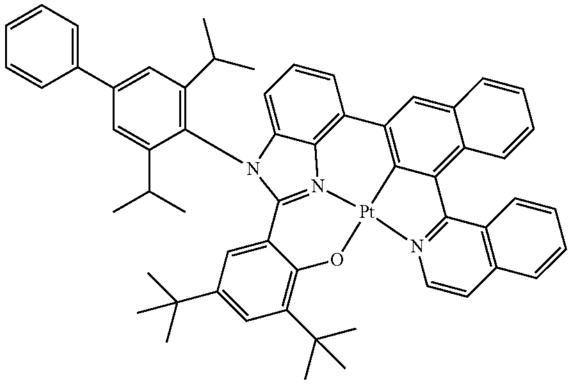
3-561
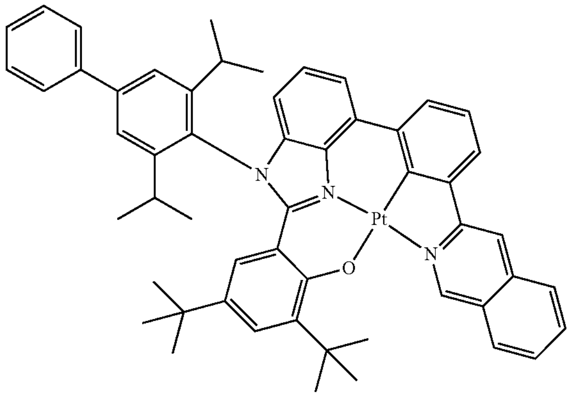
3-562
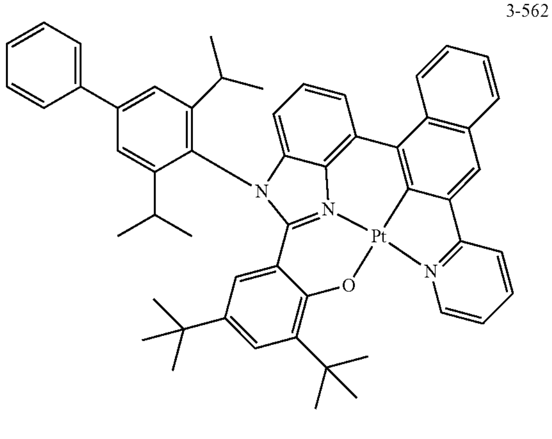

3-563
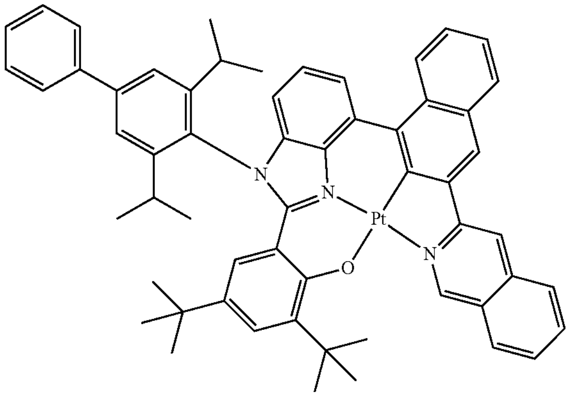
3-564
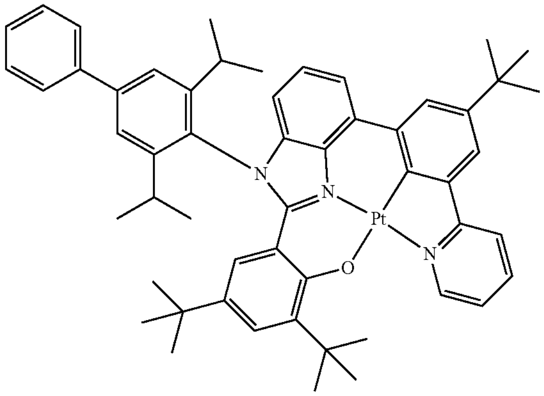
3-565
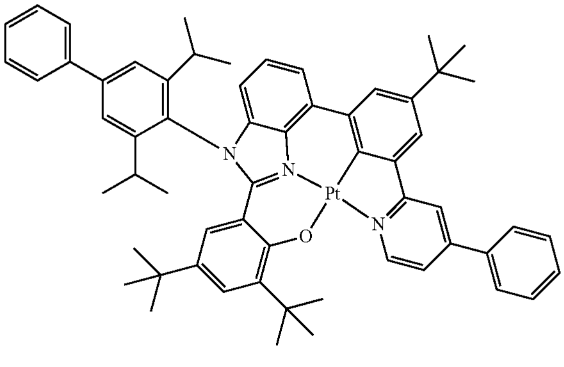
3-566
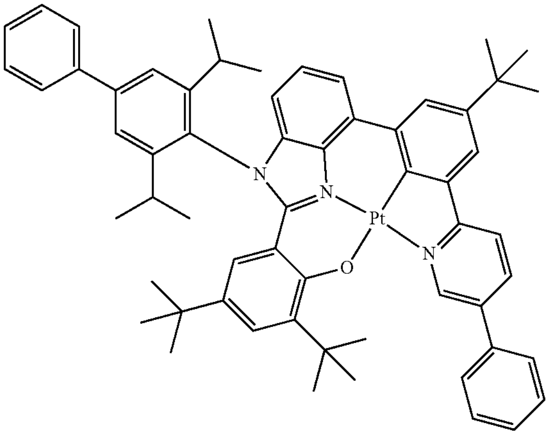
3-567
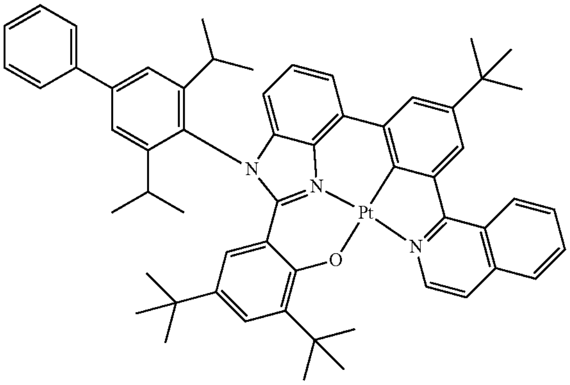
3-568
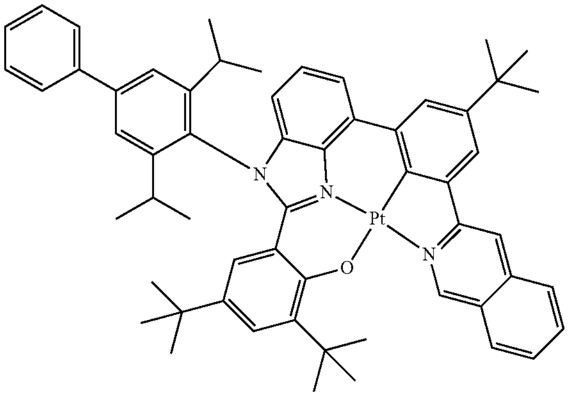

-continued
3-569
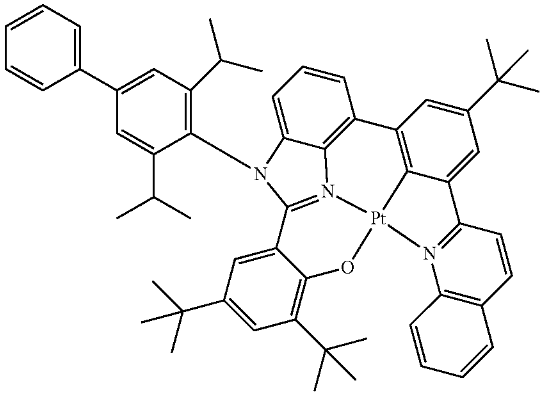
3-570
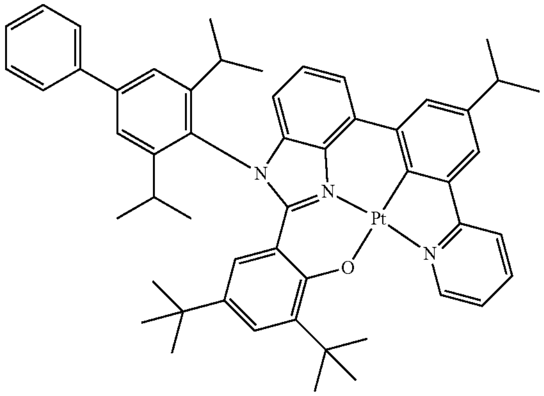
3-571
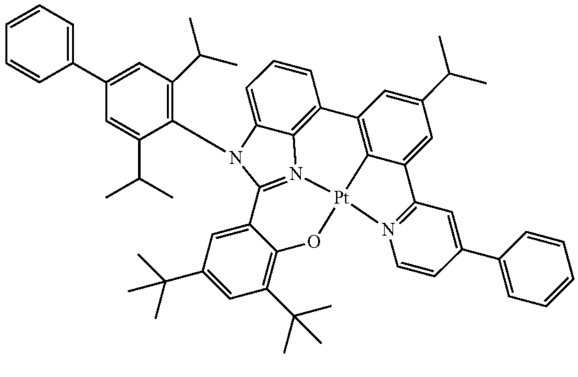
-continued
3-572
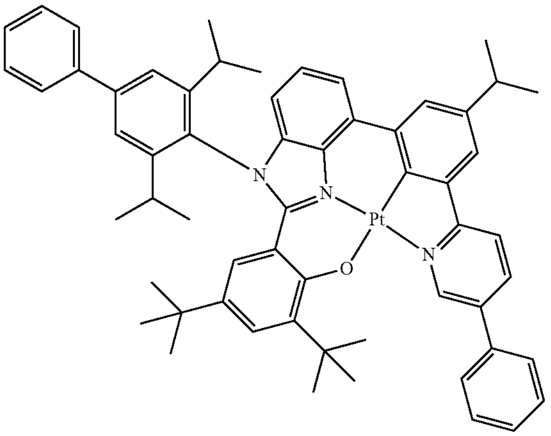
3-573
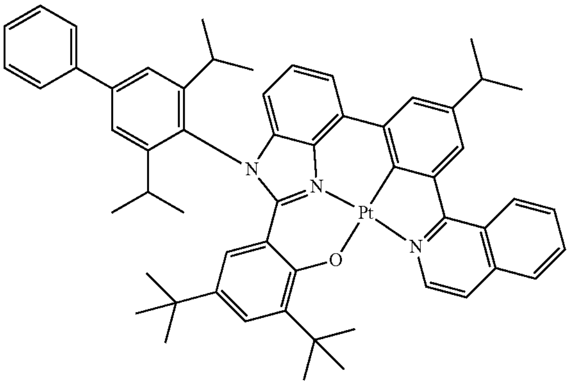
3-574
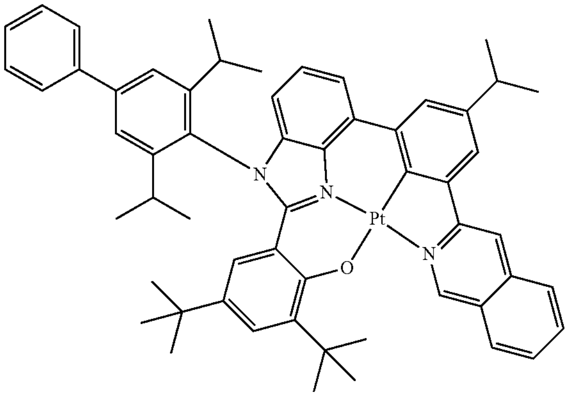

-continued
3-575
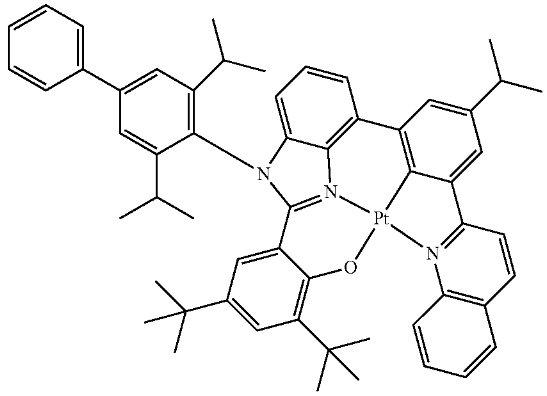
3-576
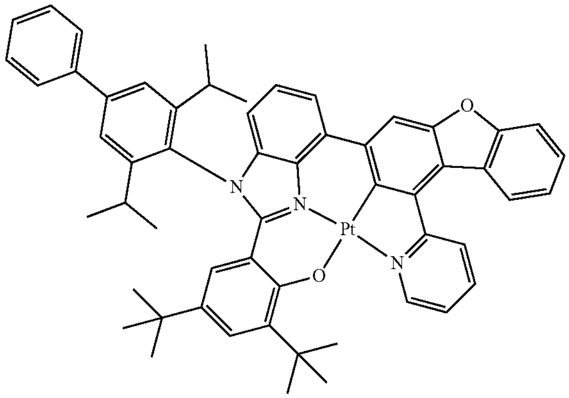
3-577
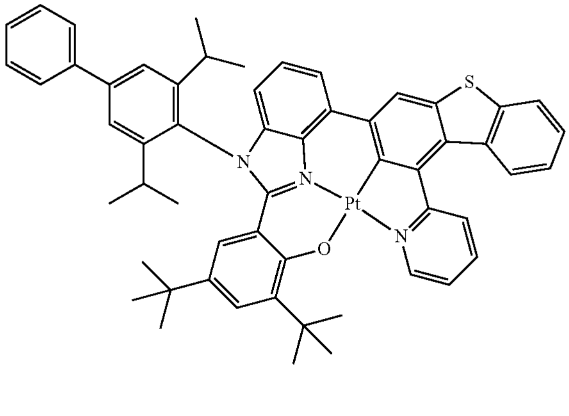
-continued
3-578
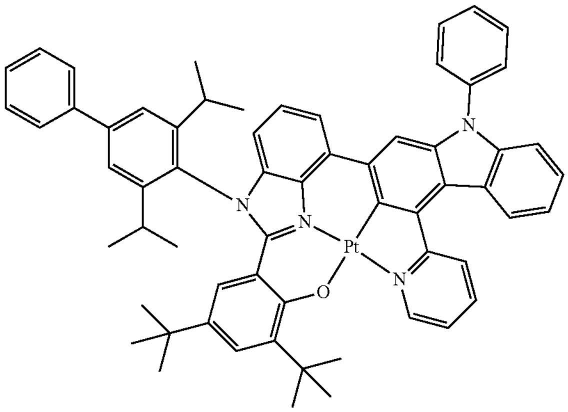
3-579
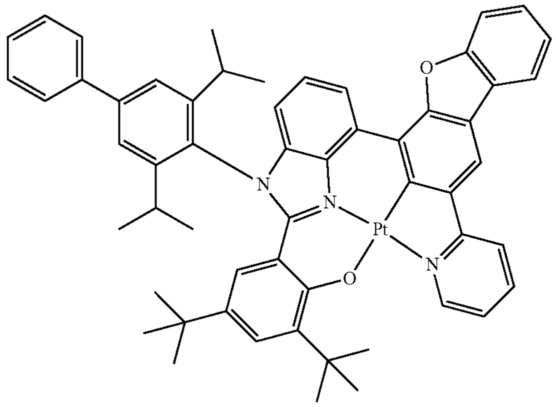
3-580
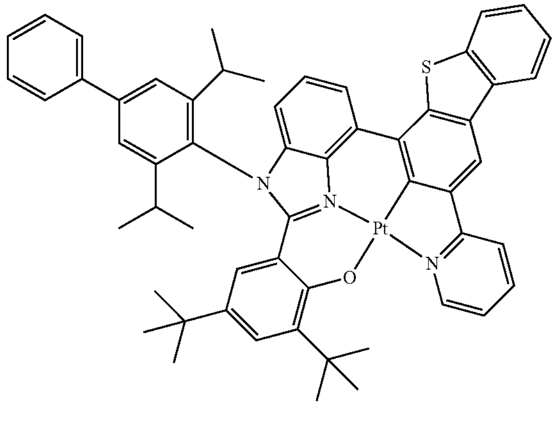

-continued
3-581
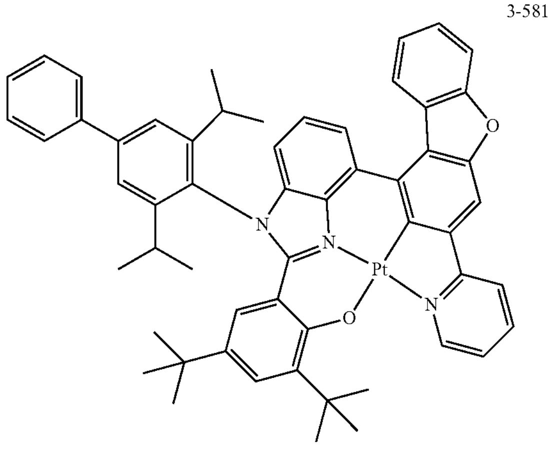
3-582
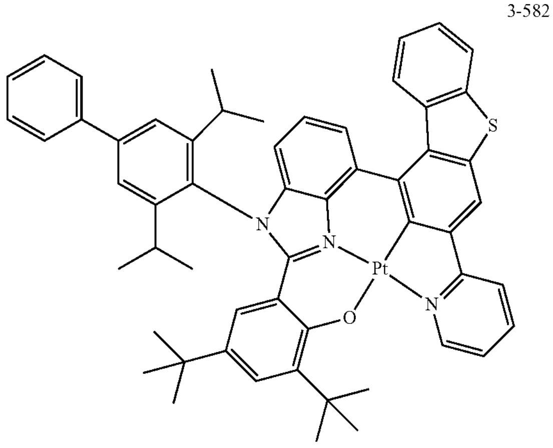
Group 1-2
1
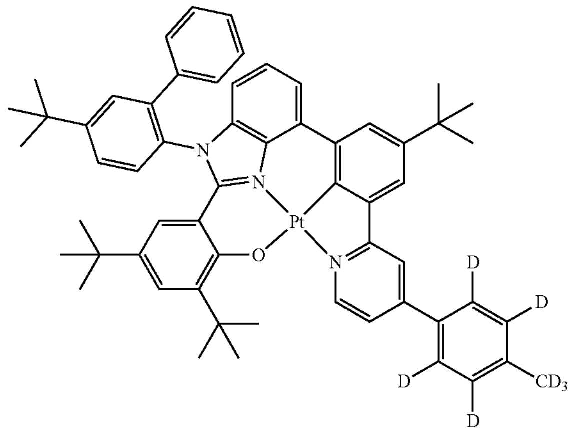
-continued
2
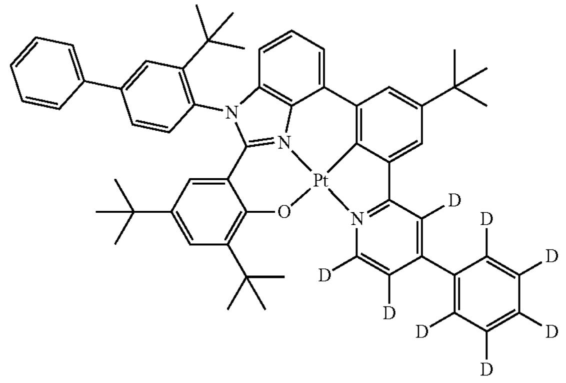
3
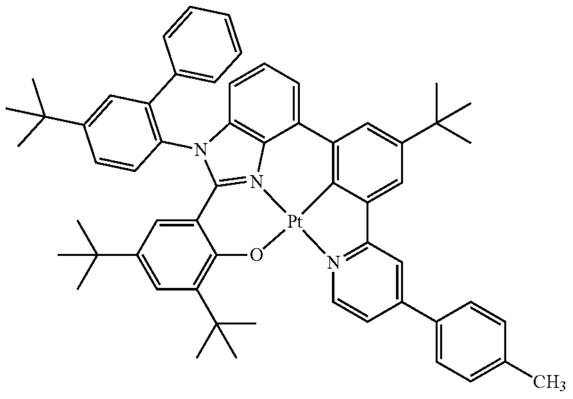
4
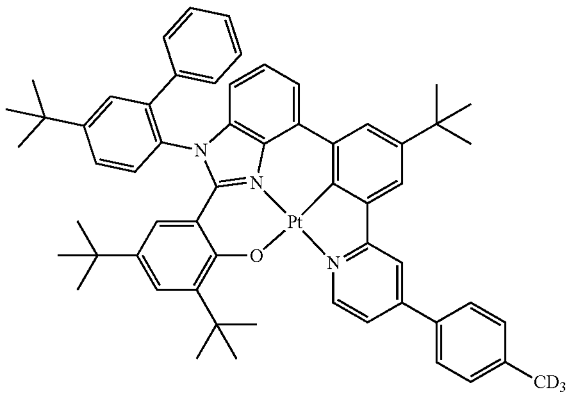

-continued
5
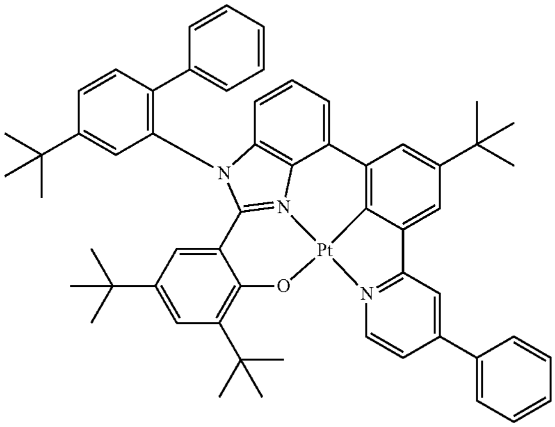
6
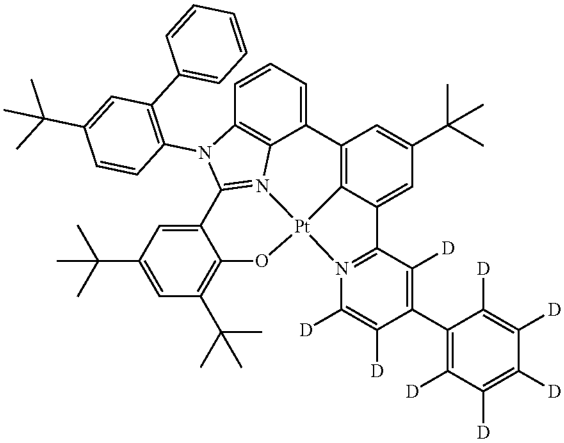
7
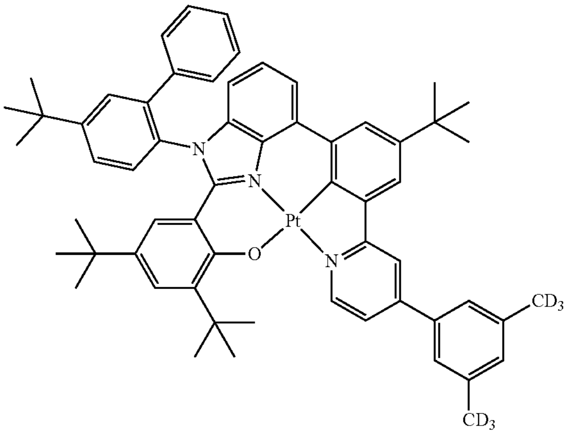
-continued
8
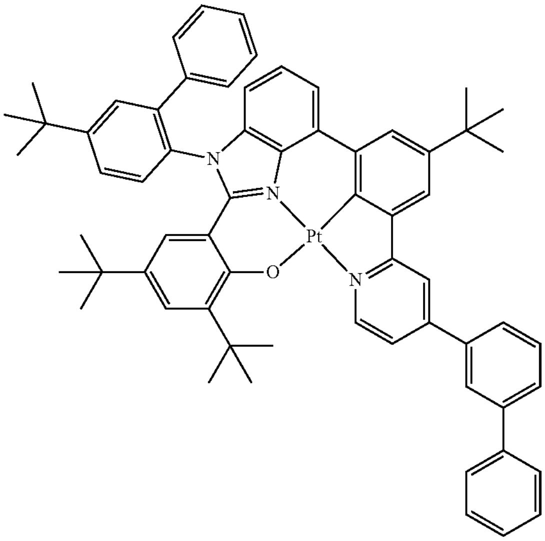
9
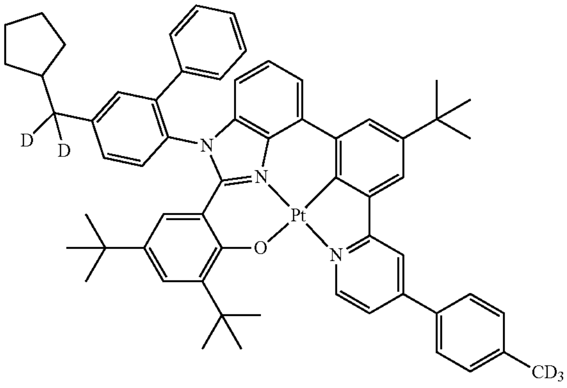
10
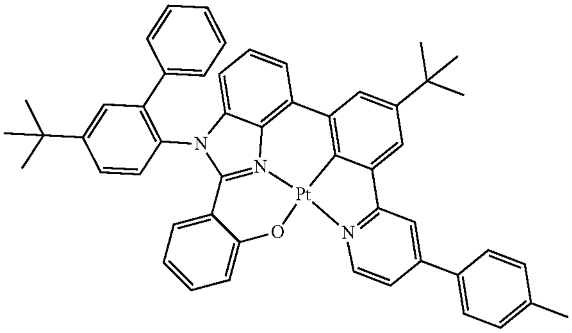
11
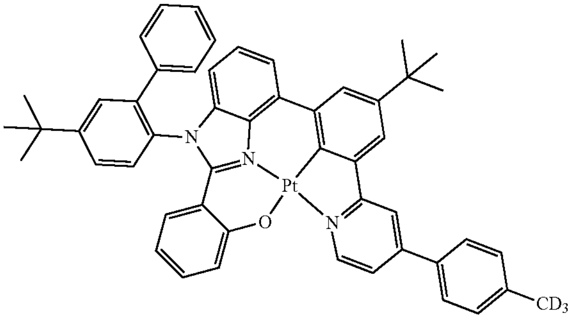

-continued
12
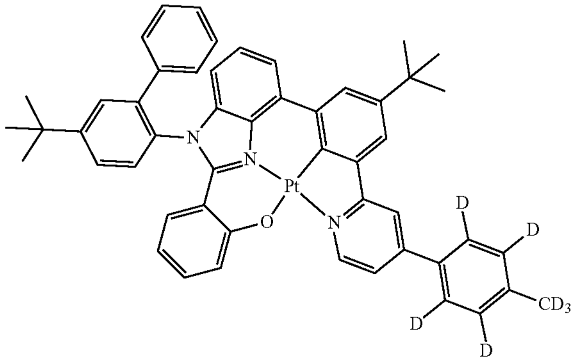
13
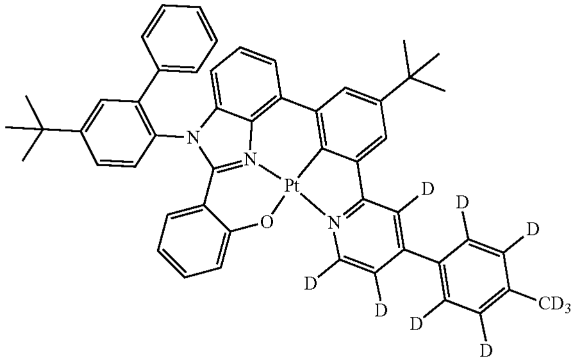
14
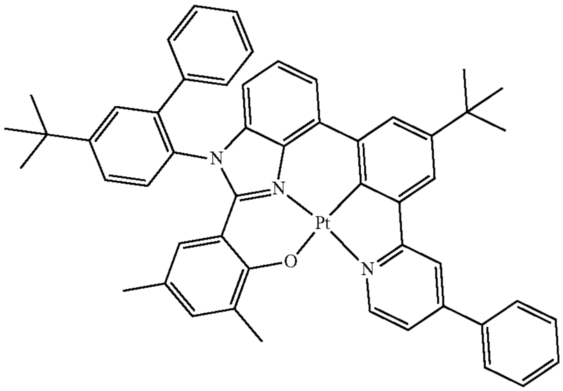
15
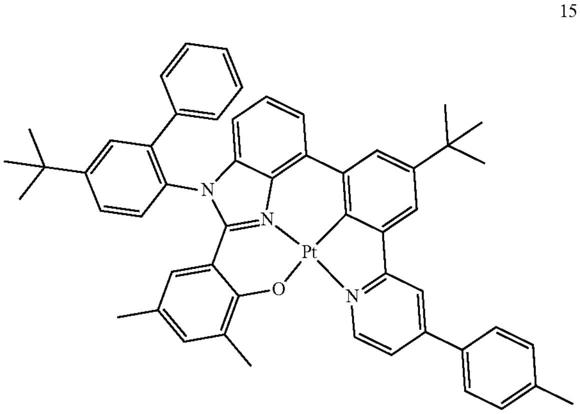
-continued
16
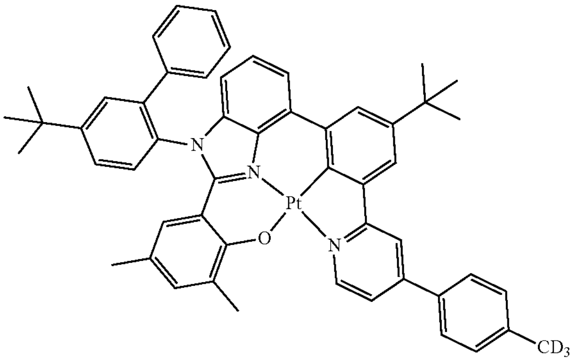
17
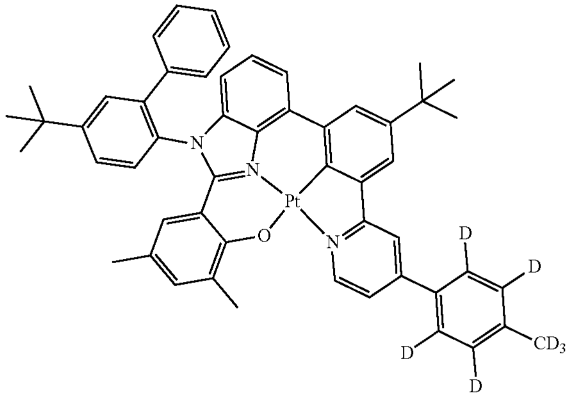
18
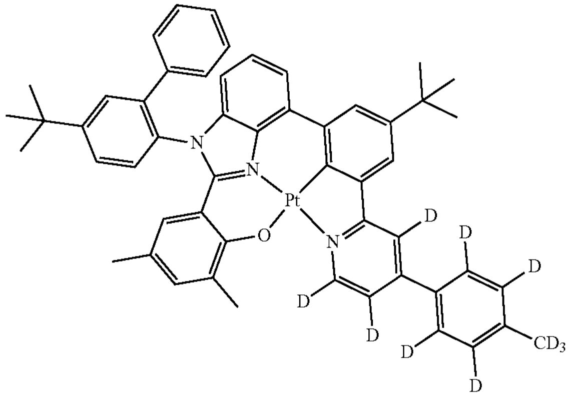
19
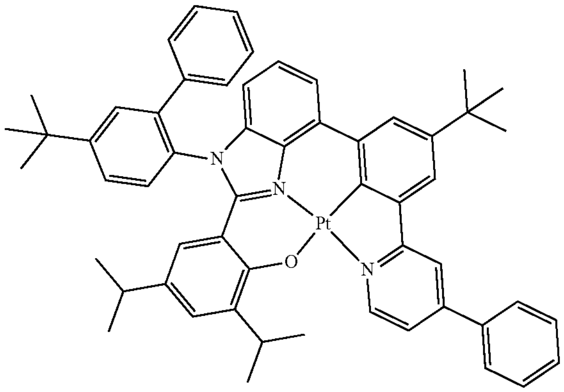

-continued
20
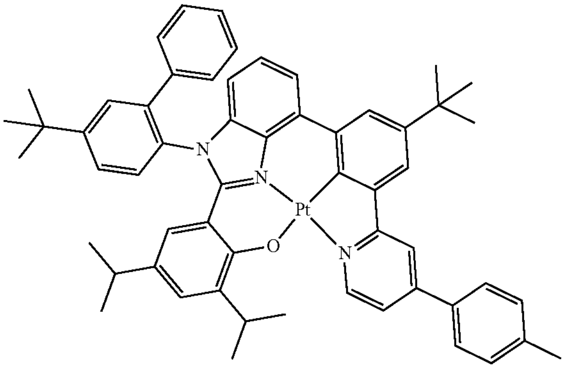
21
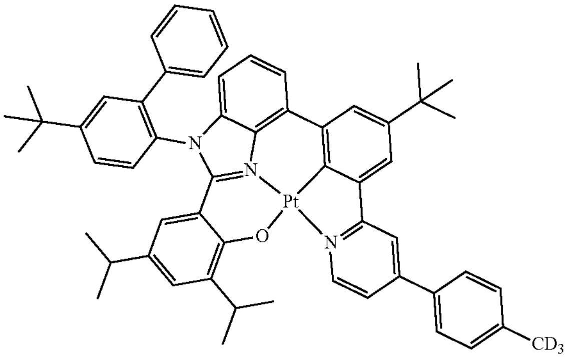
22
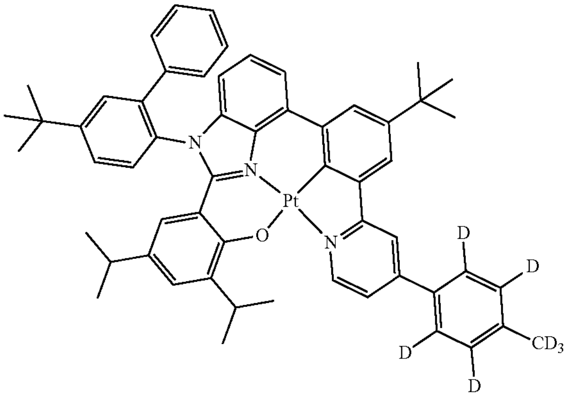
23
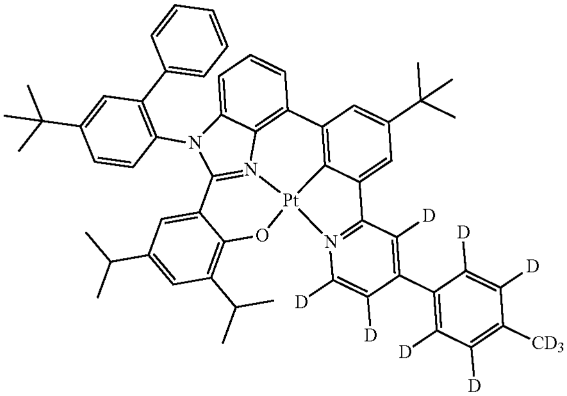
-continued
24
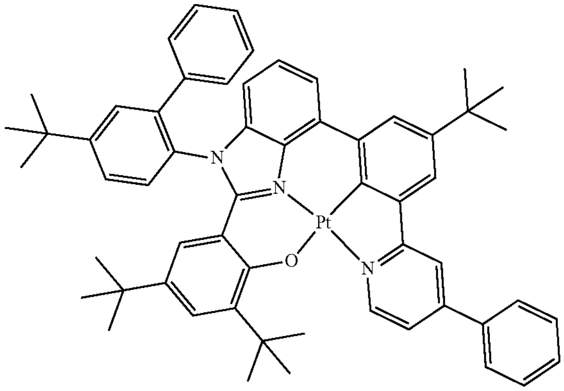
25
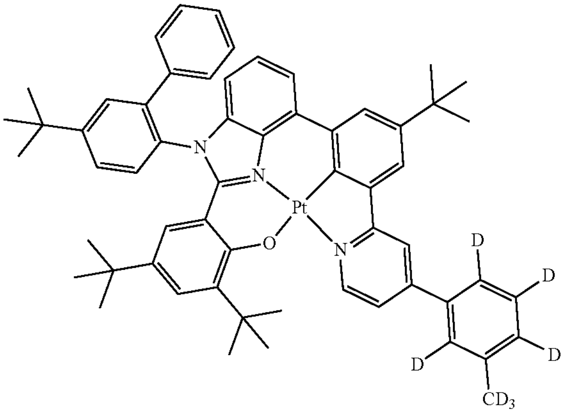
26
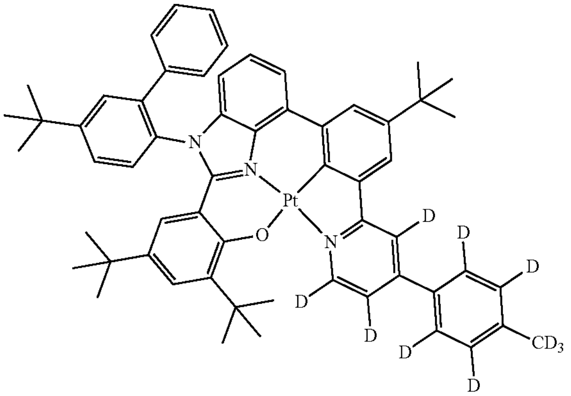

-continued
27
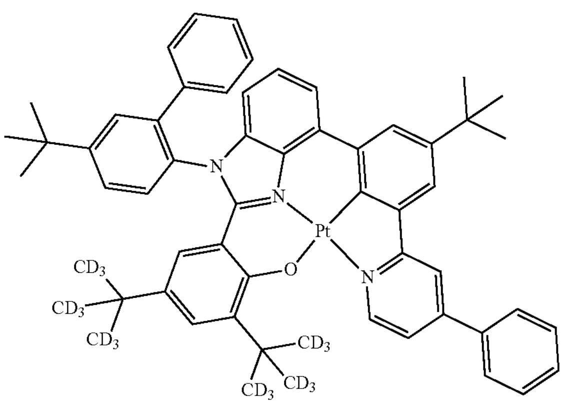
28
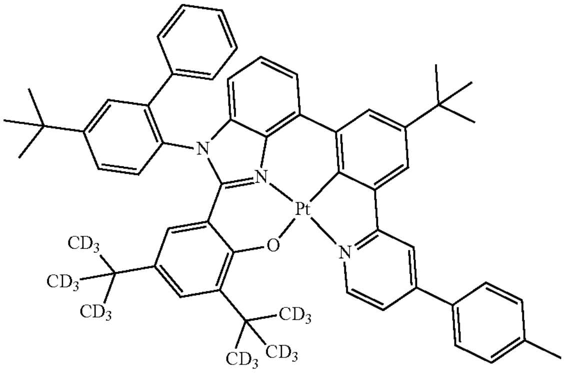
29
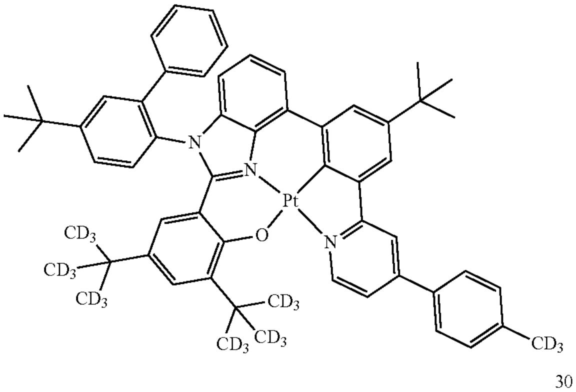
30
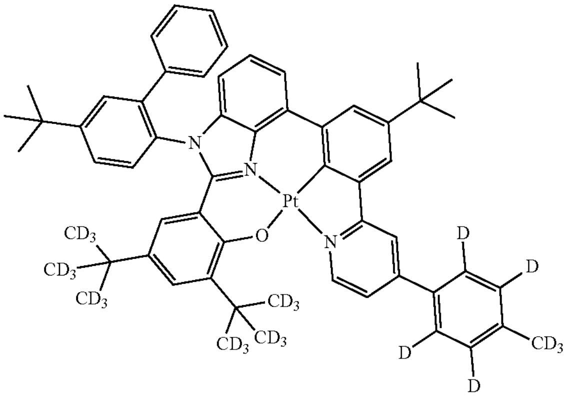
-continued
31
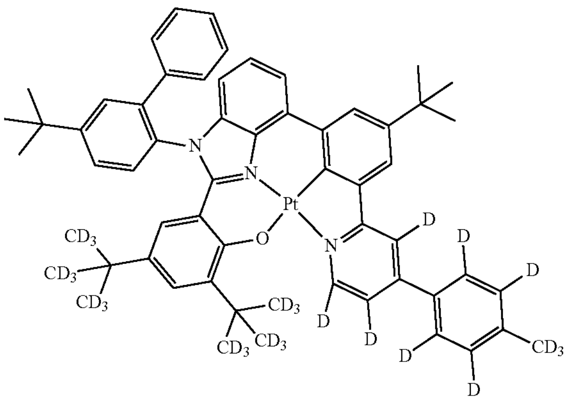
32
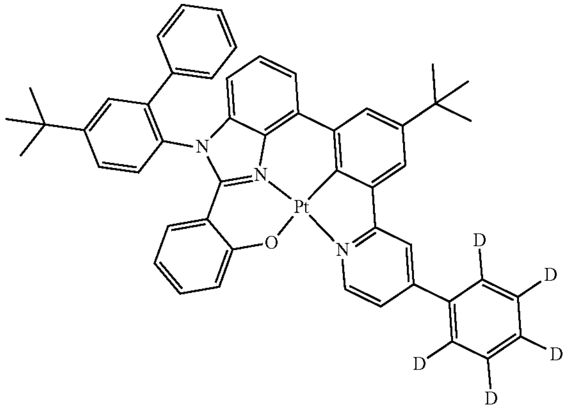
33
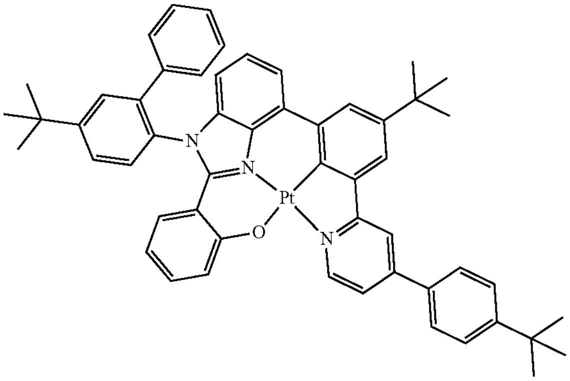
34
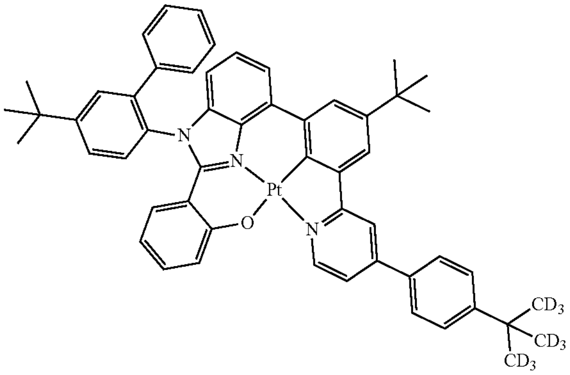

-continued
35
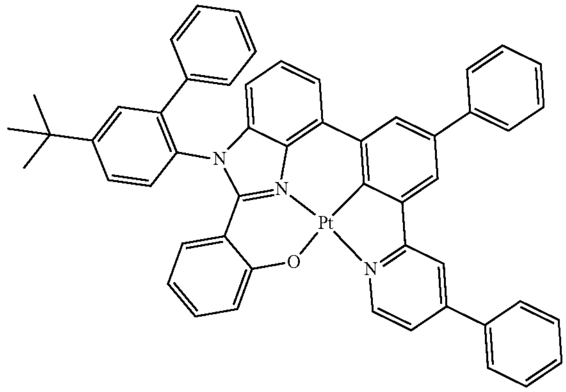
36
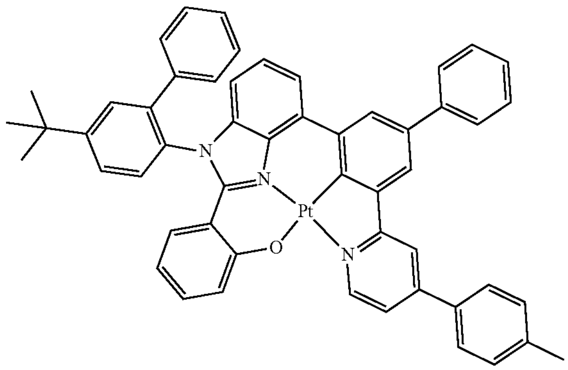
37
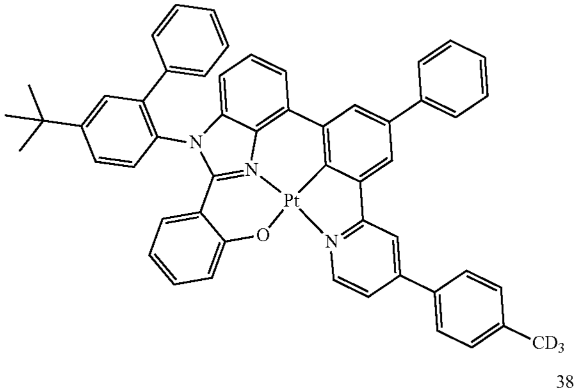
38
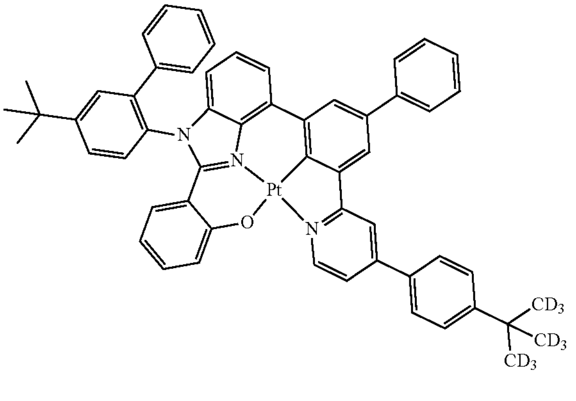
-continued
39
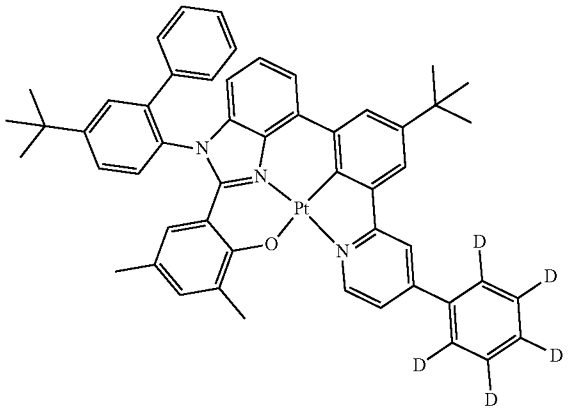
40
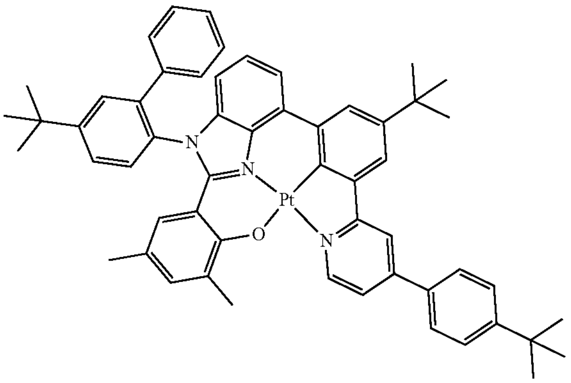
41
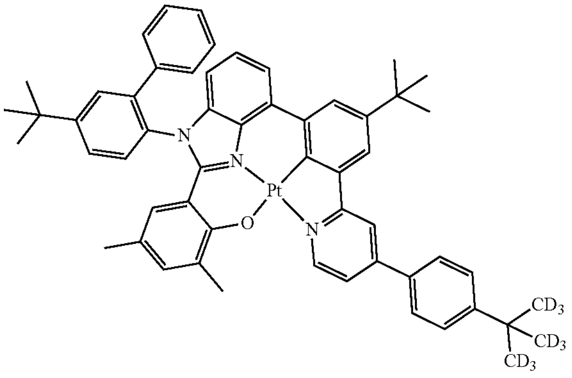
42
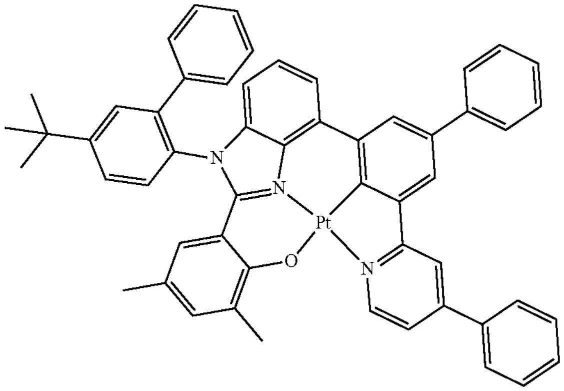

-continued
43
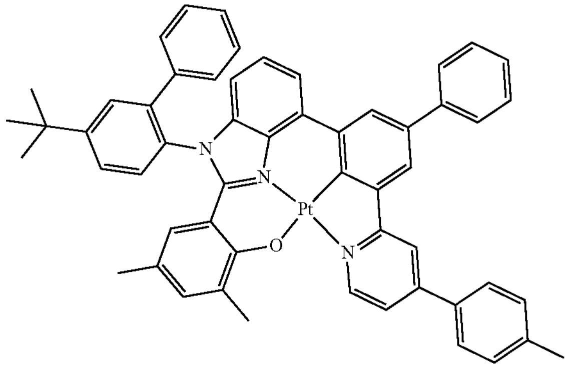
44
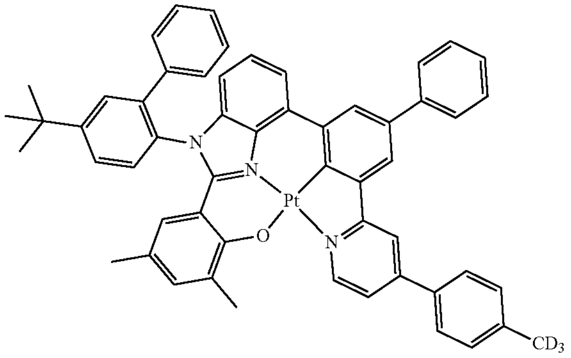
45
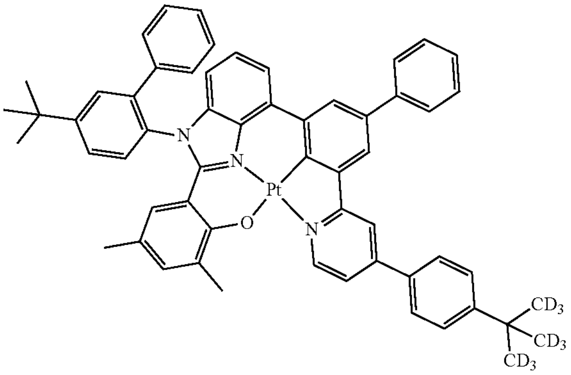
46
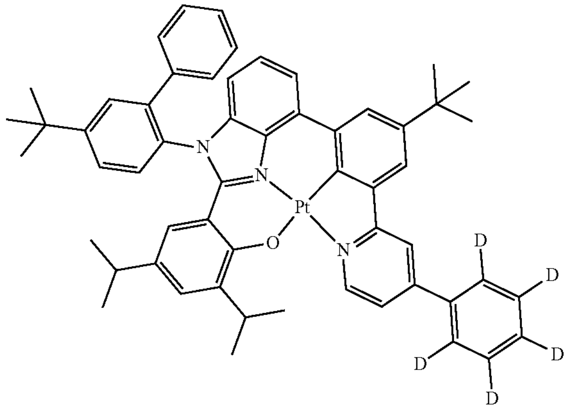
-continued
47
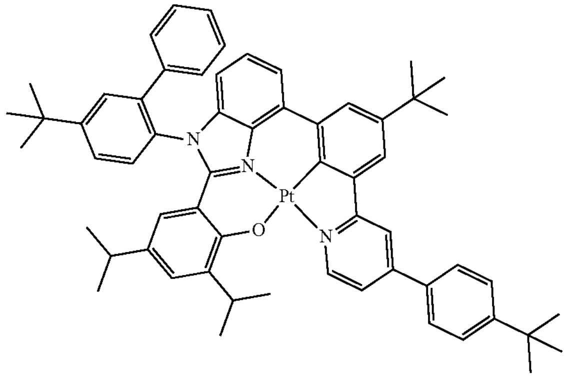
48
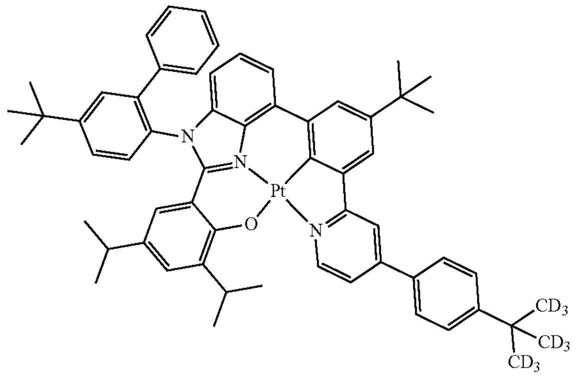
49
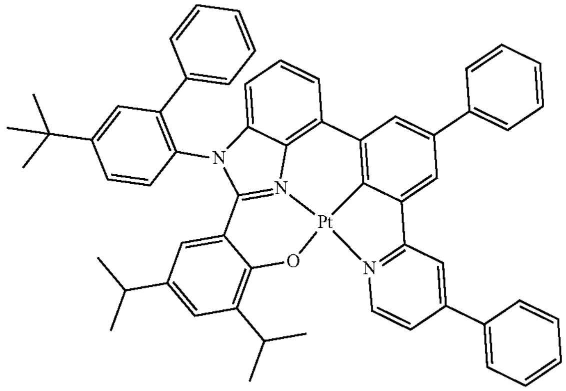
50
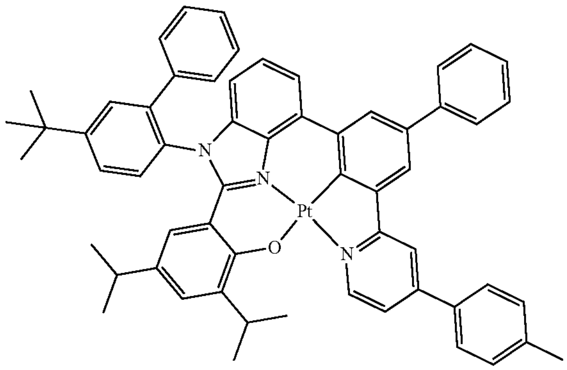

-continued
51
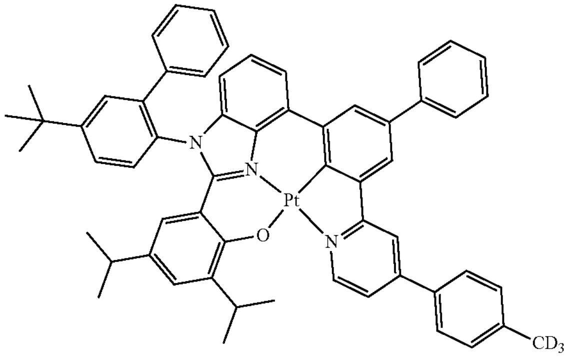
52
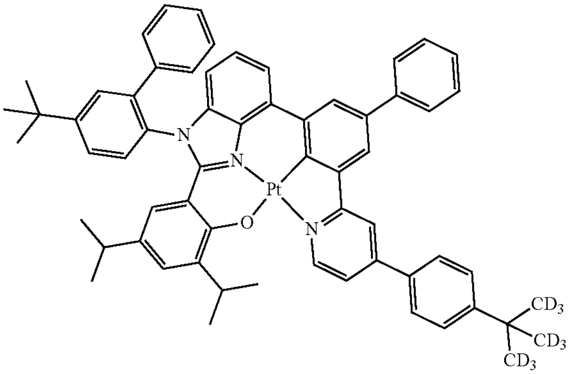
53
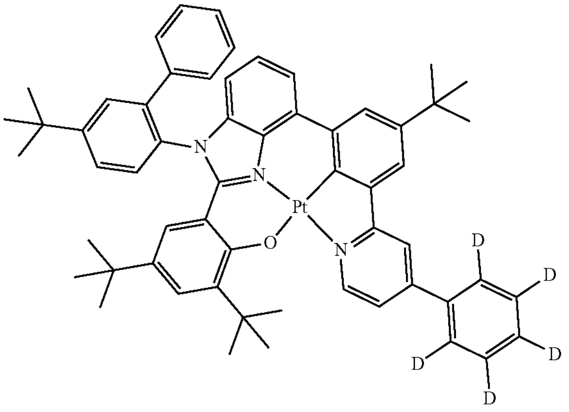
54
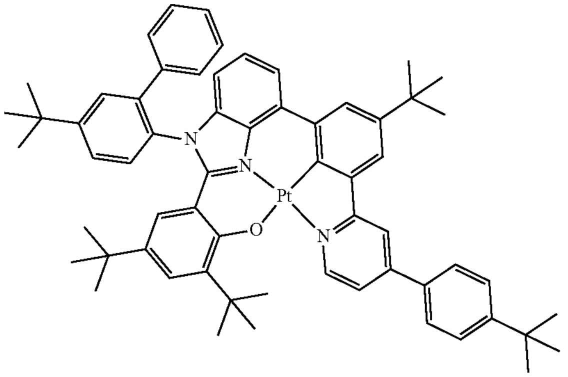
-continued
55
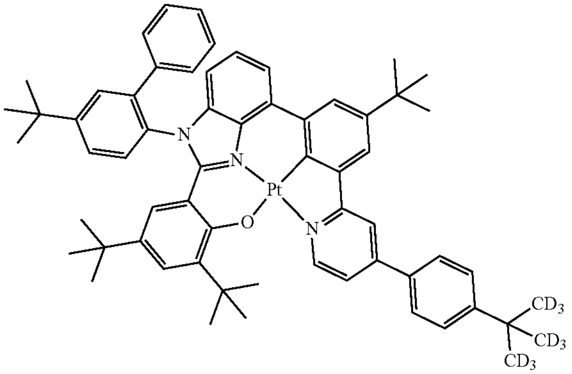
56
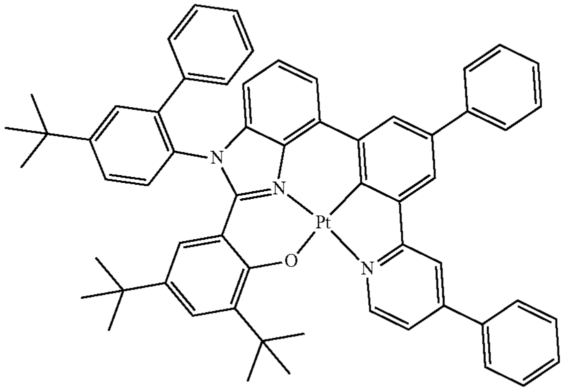
57
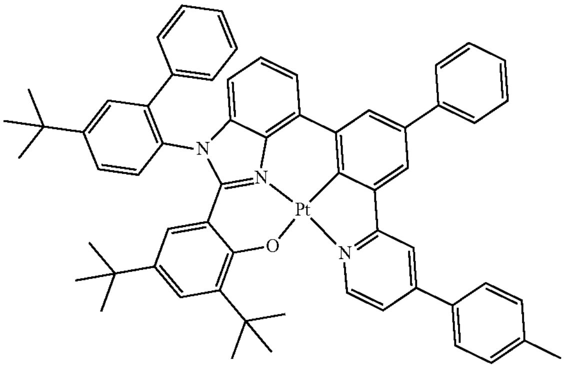
58
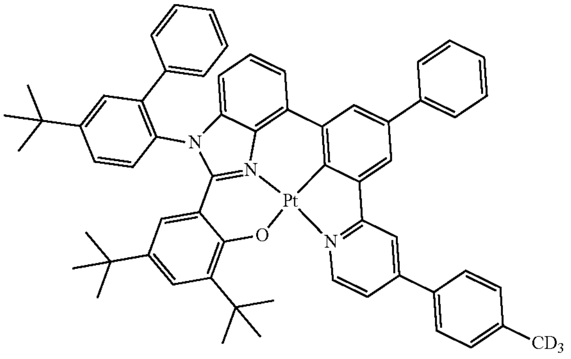

-continued
59
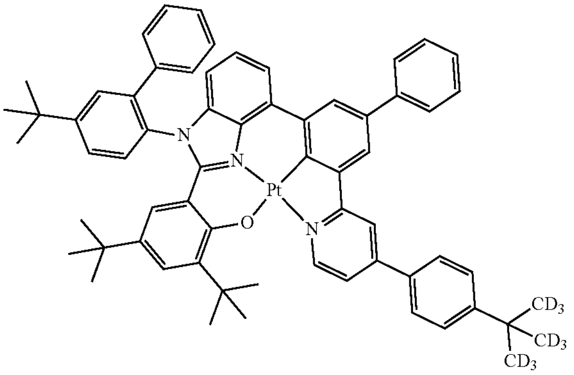
60
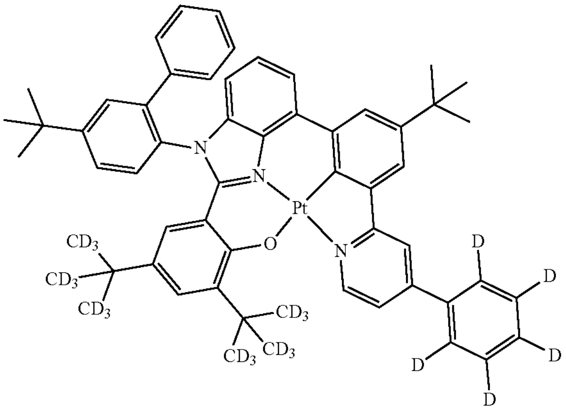
61
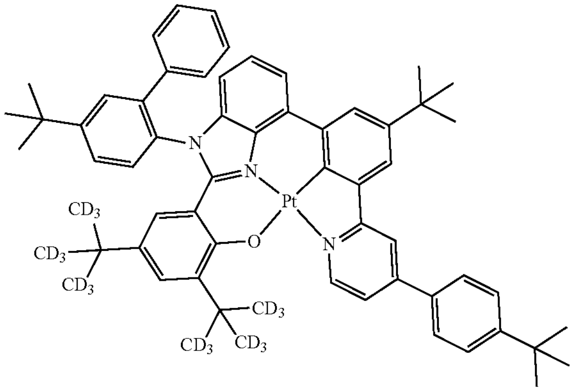
-continued
62
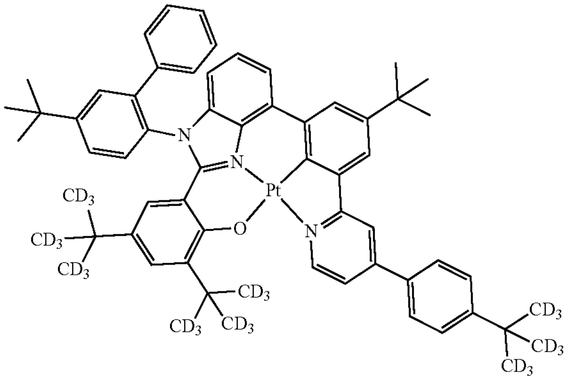
63
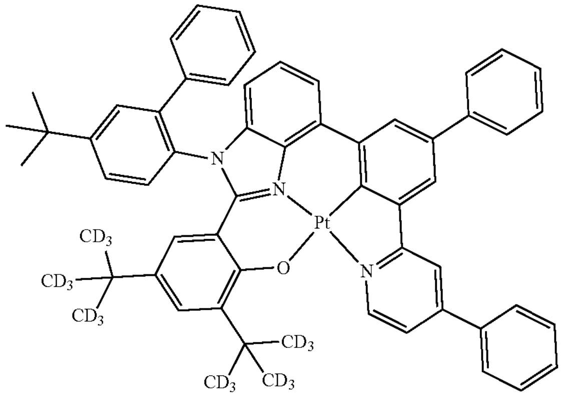
64
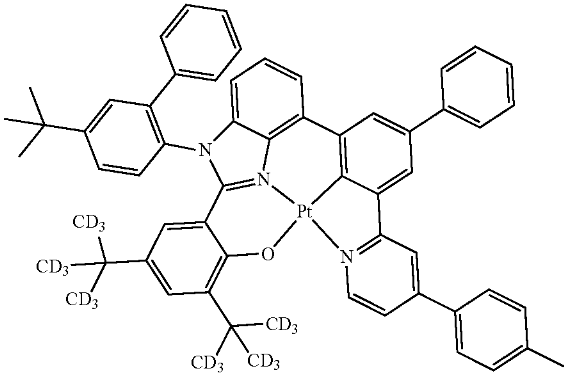
65
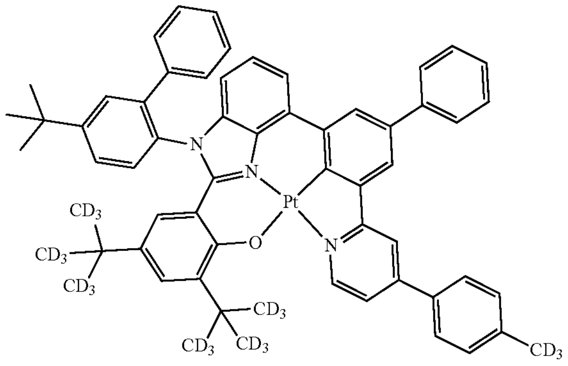

-continued
66
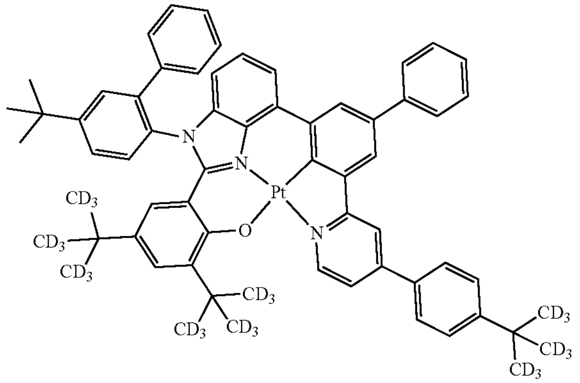
67
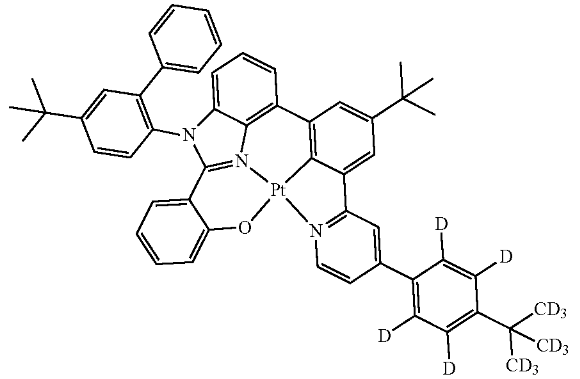
68
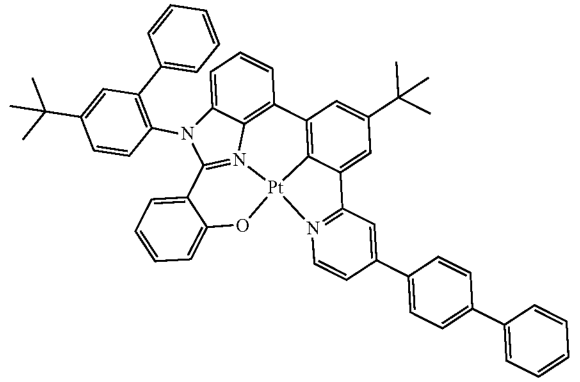
69
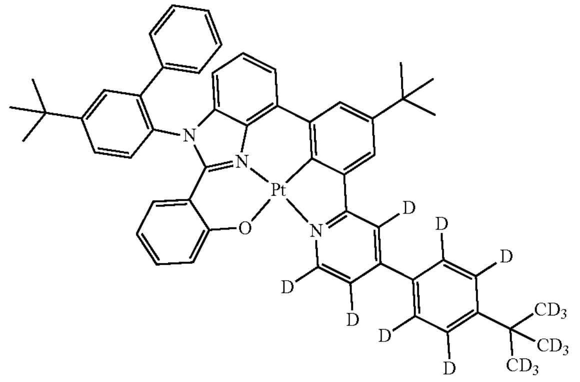
-continued
70
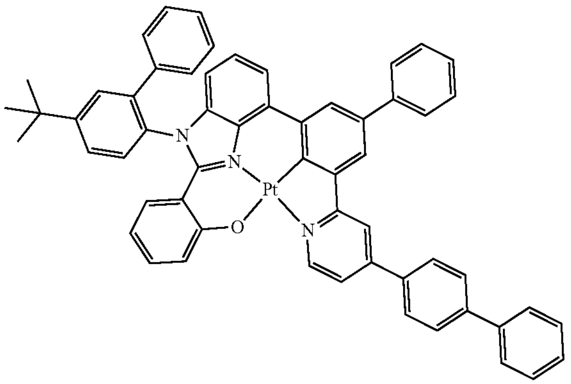
71
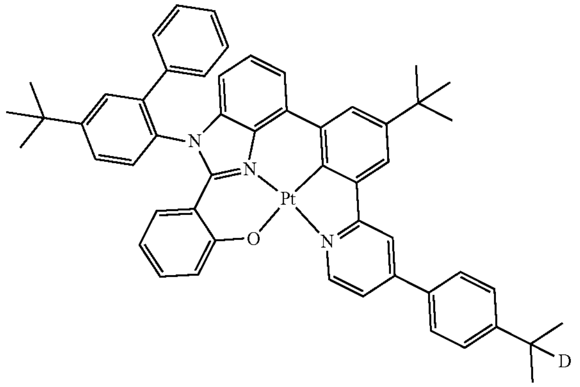
72
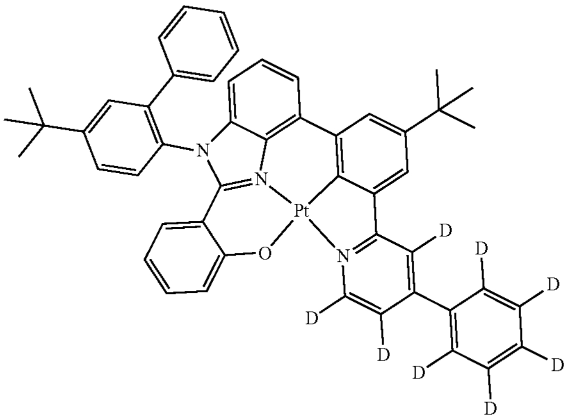

-continued
73
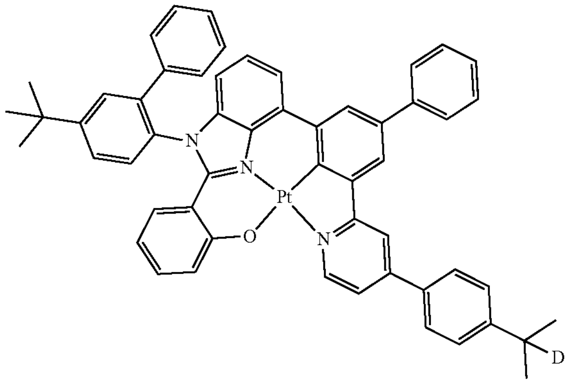
74
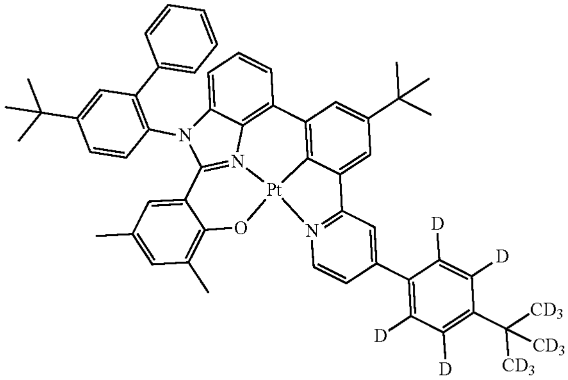
75
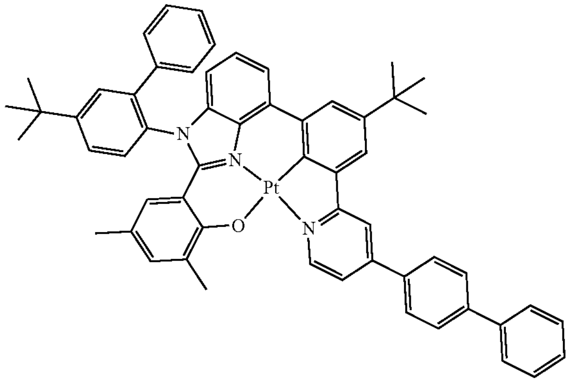
76
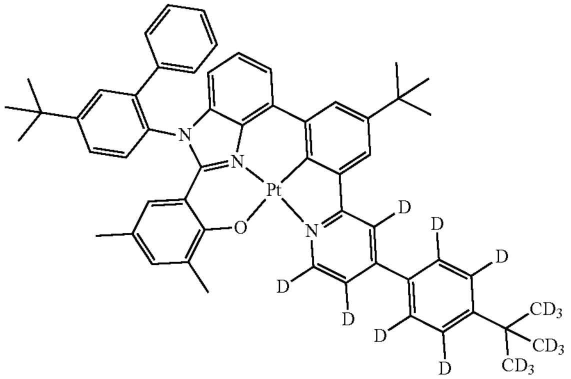
-continued
77
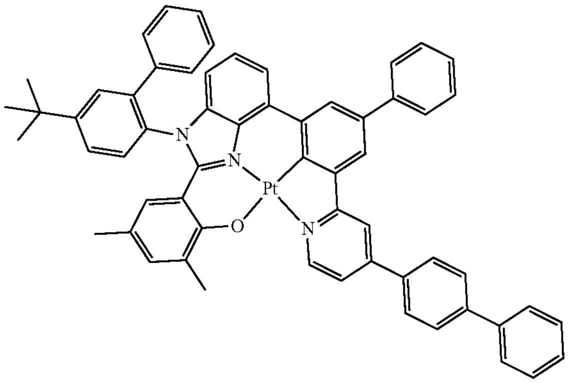
78
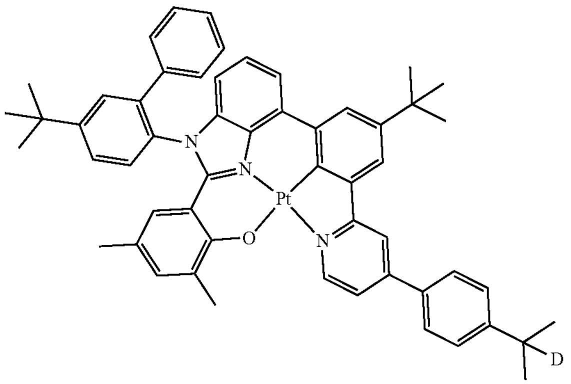
79
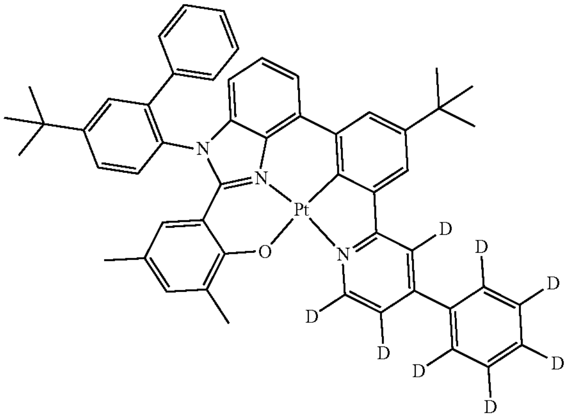
80
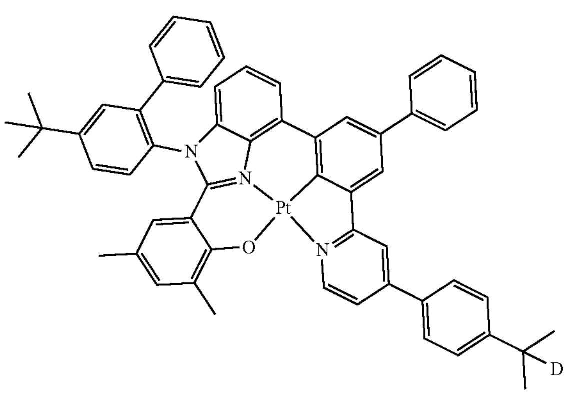

-continued
81
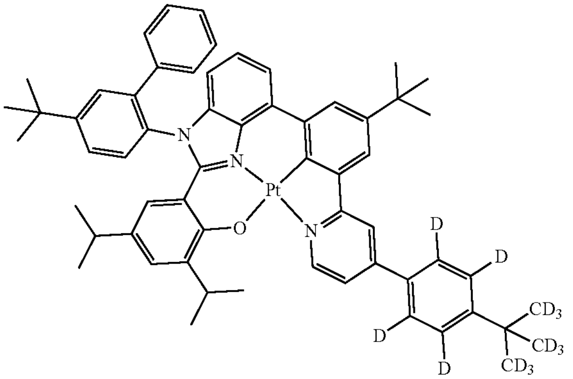
82
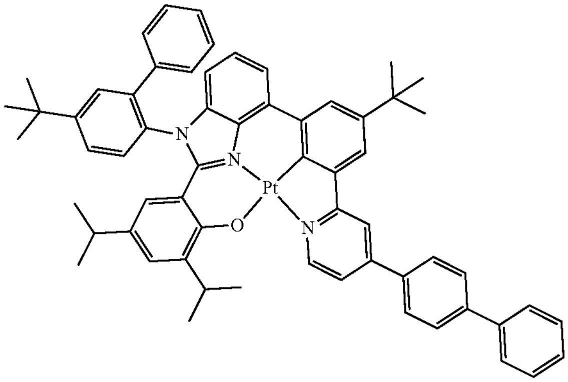
83
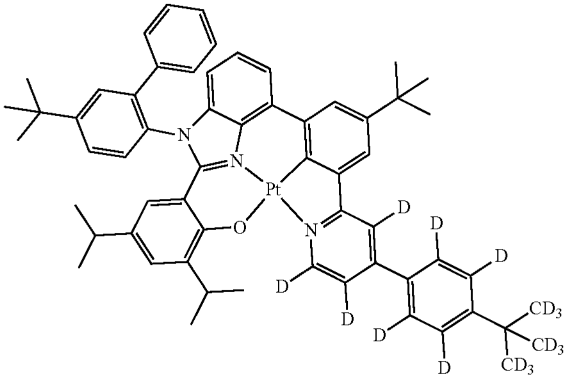
84
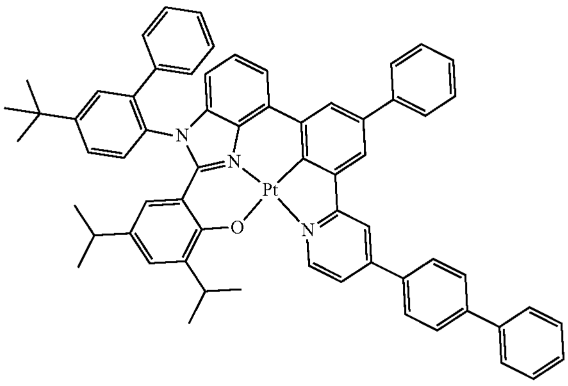
-continued
85
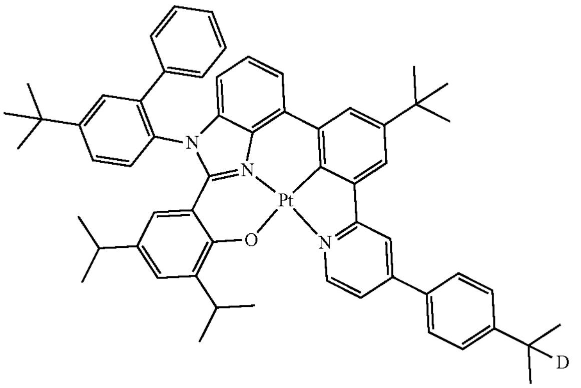
86
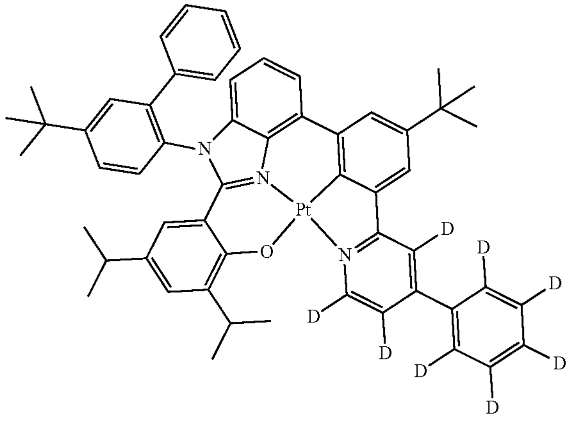
87
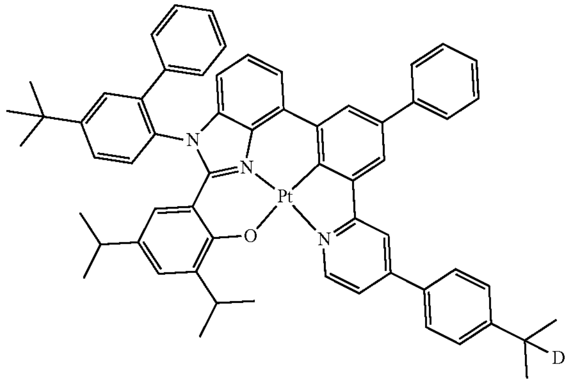
88
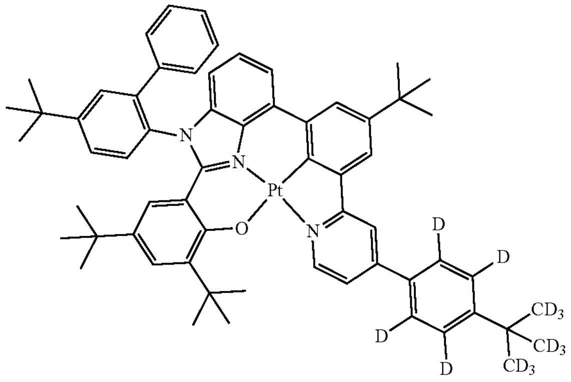

-continued
89
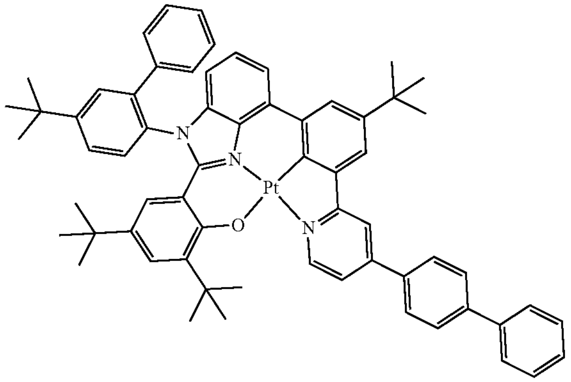
90
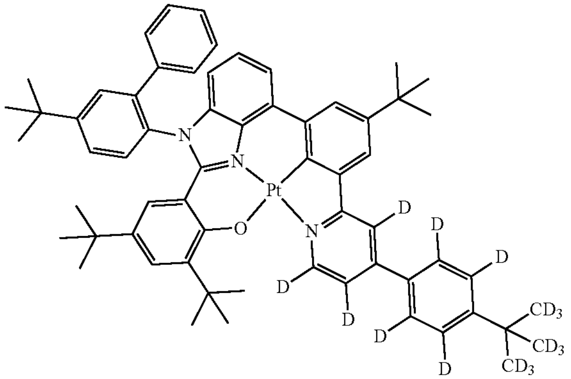
91
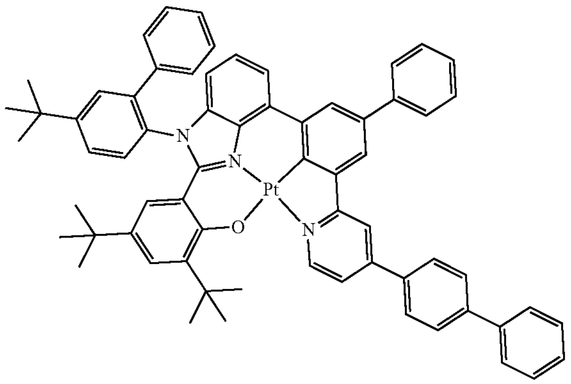
92
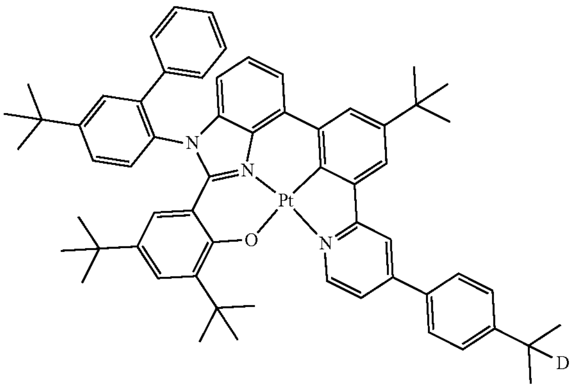
-continued
93
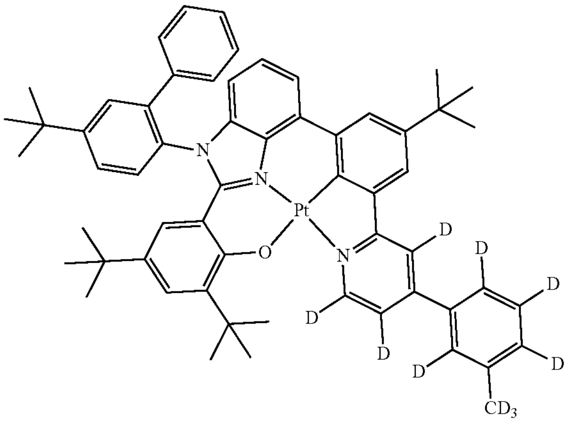
94
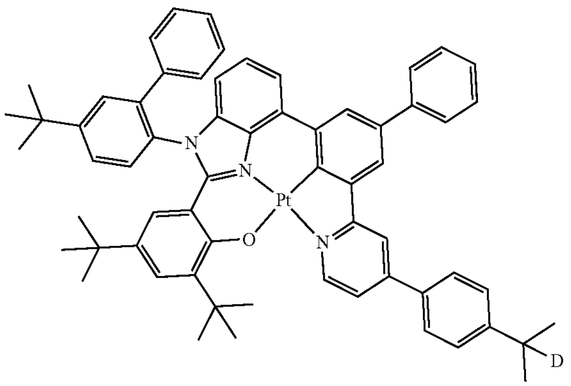
95
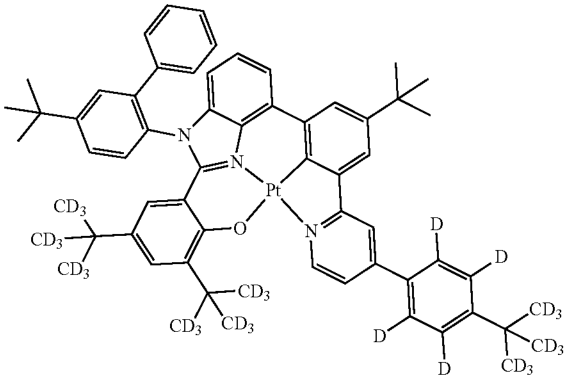
96
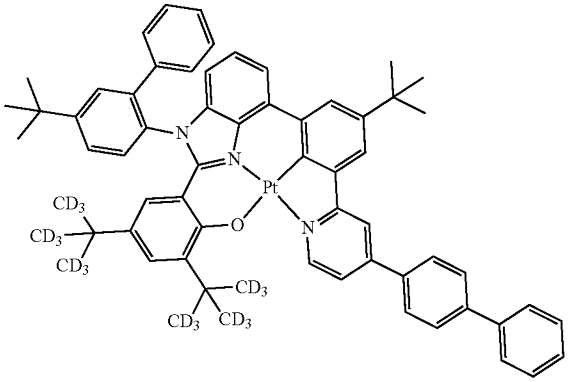

-continued
97
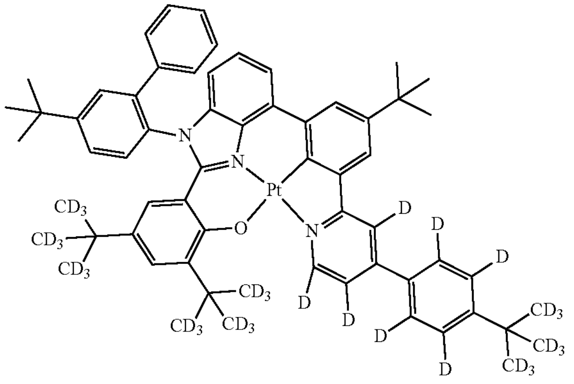
98
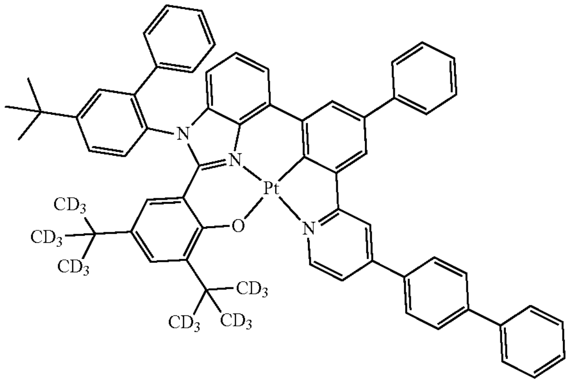
99
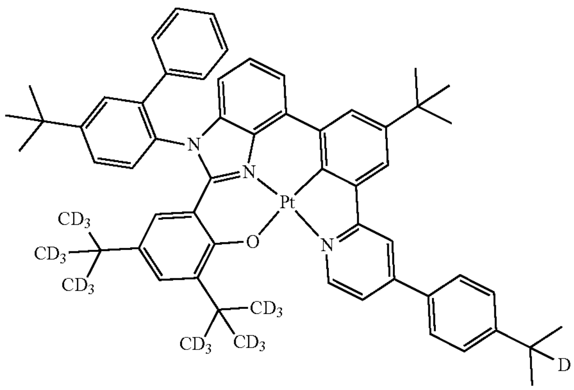
-continued
100
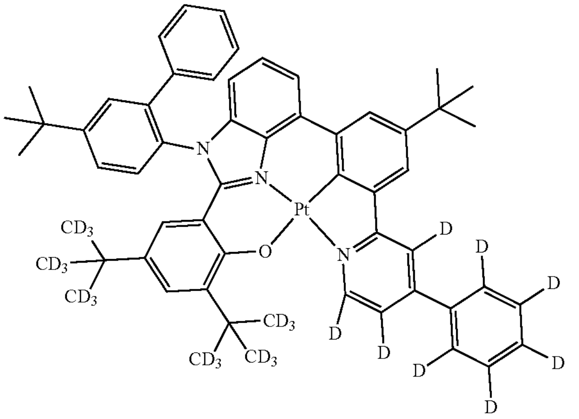
101
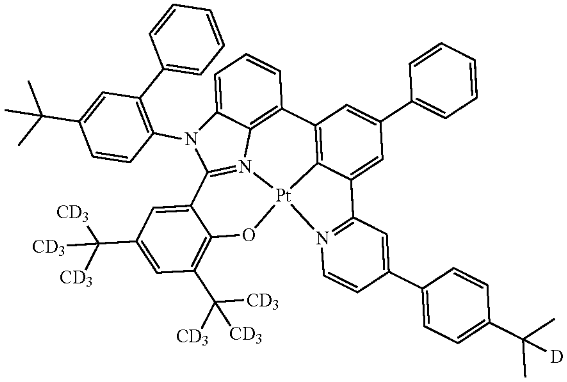
102
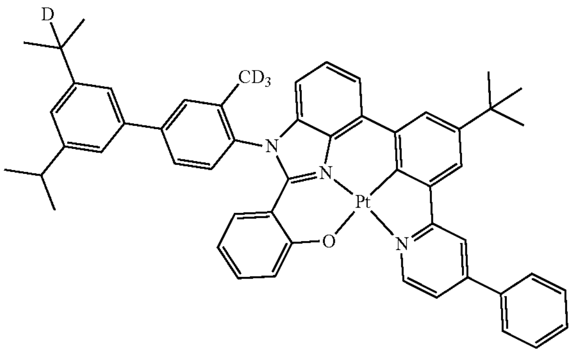
103
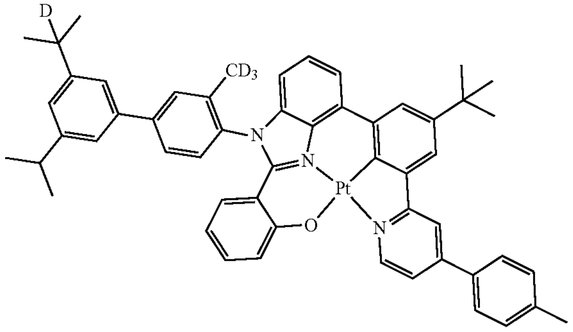

-continued
104
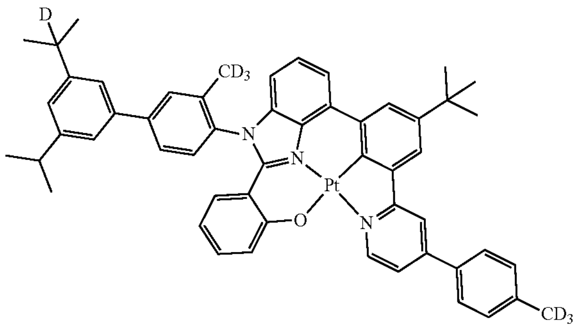
105
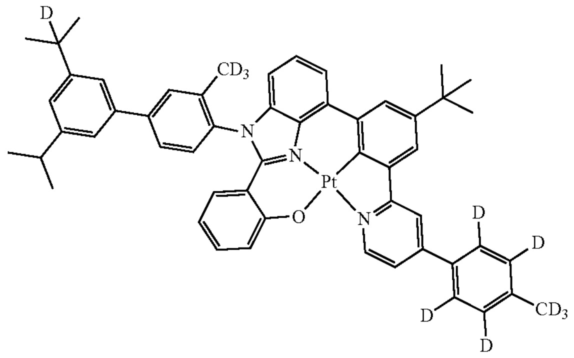
106
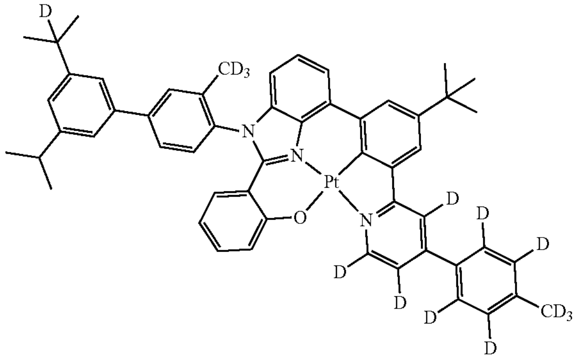
107
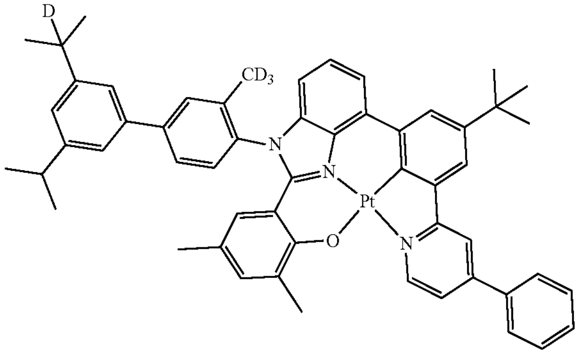
-continued
108
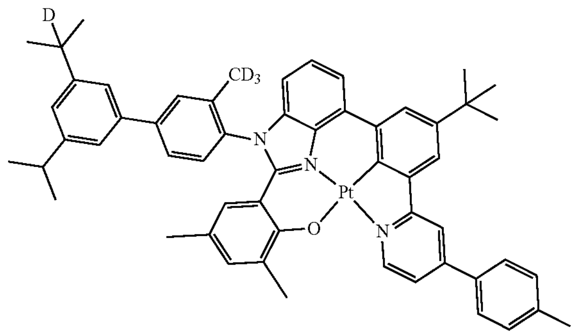
109
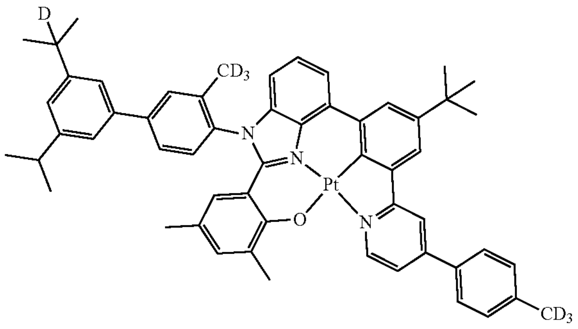
110
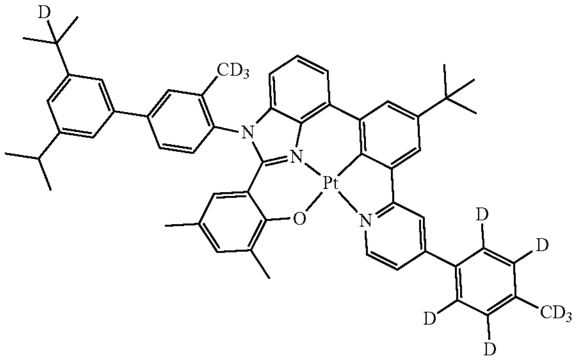
111
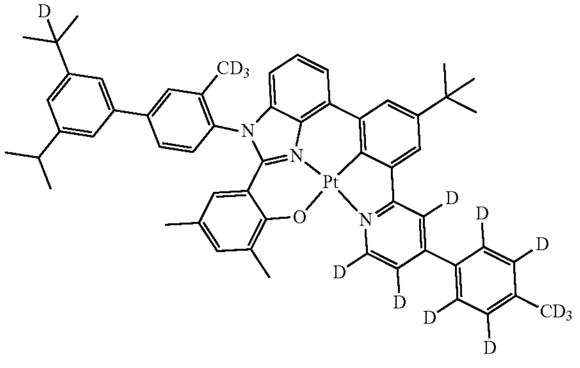

-continued
112
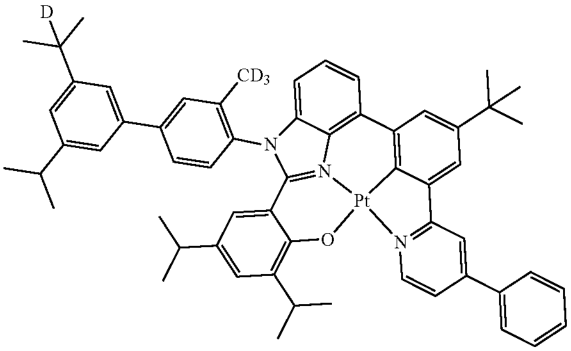
113
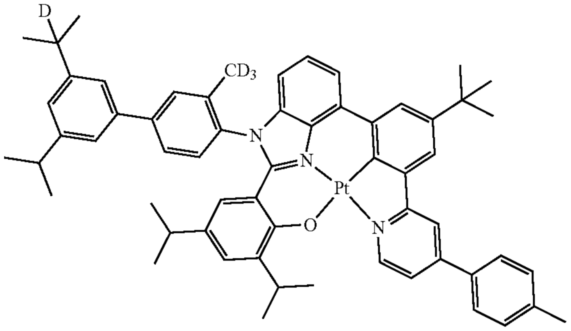
114
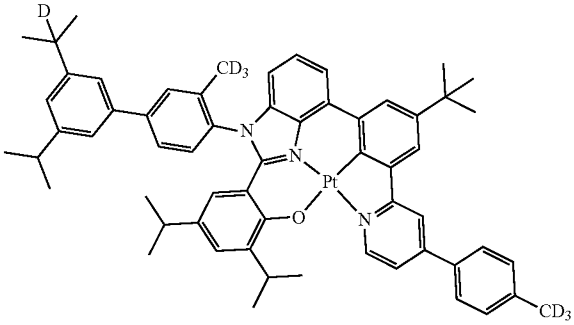
115
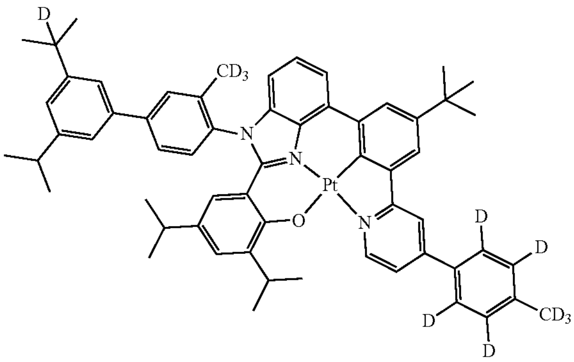
-continued
116
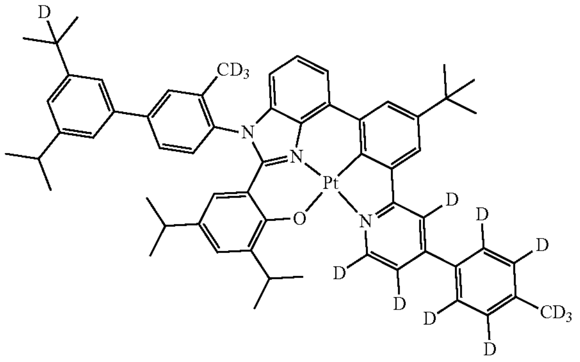
117
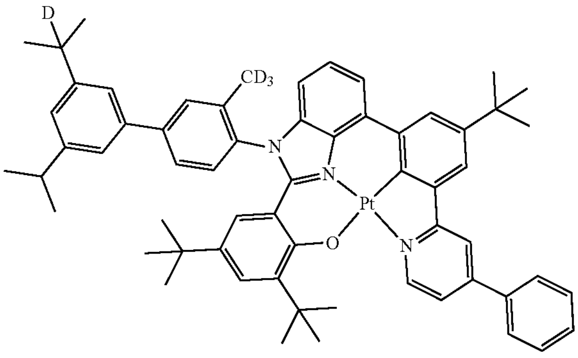
118
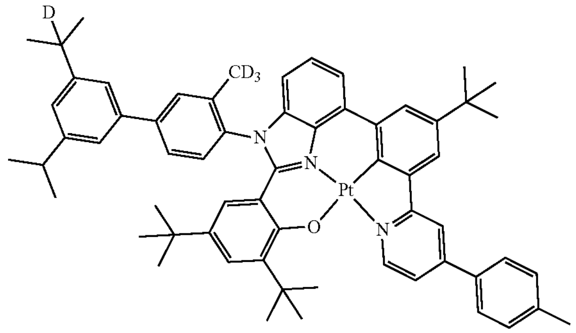
119
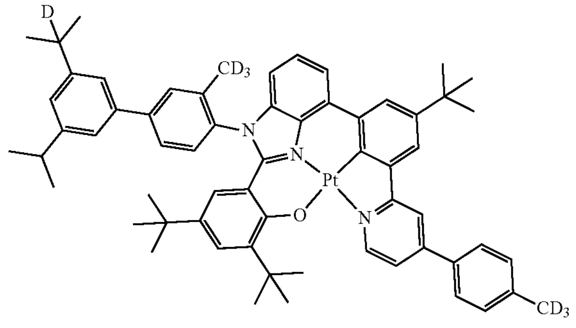

-continued
120
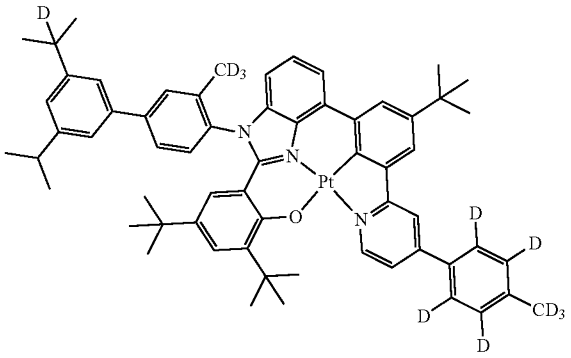
121
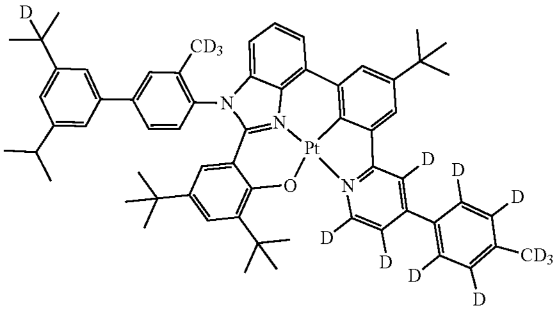
122
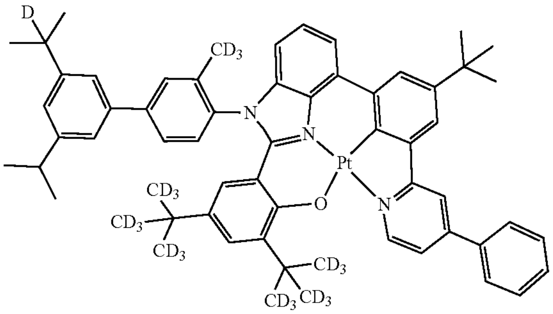
123
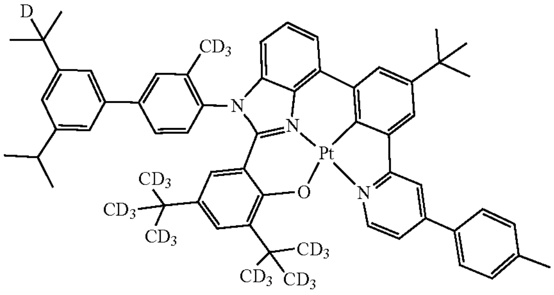
124
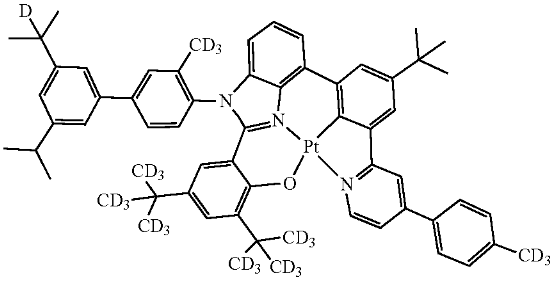
125
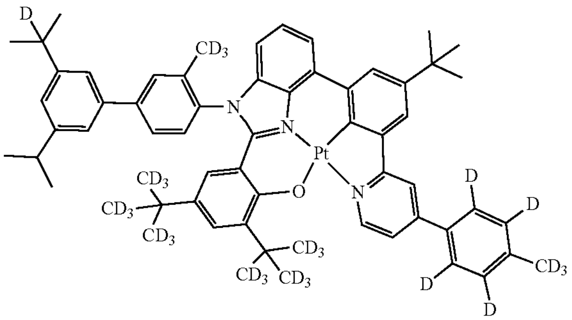
126
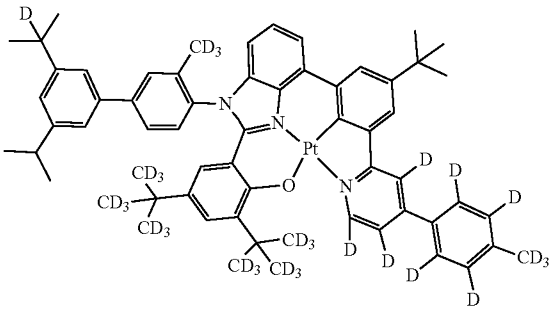

-continued
127
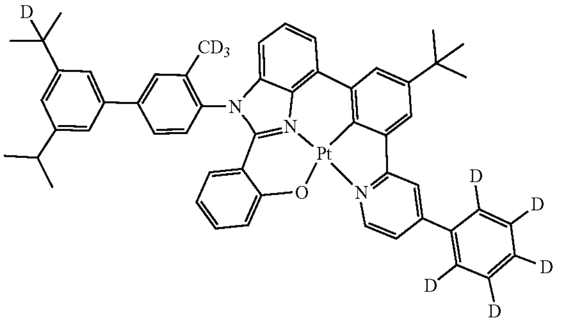
128
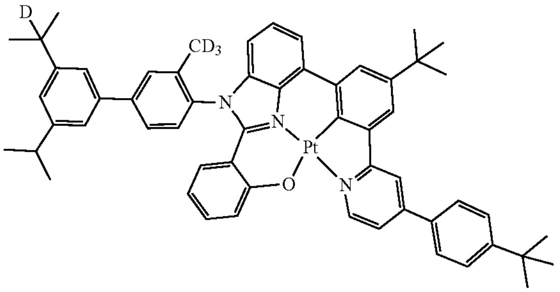
129
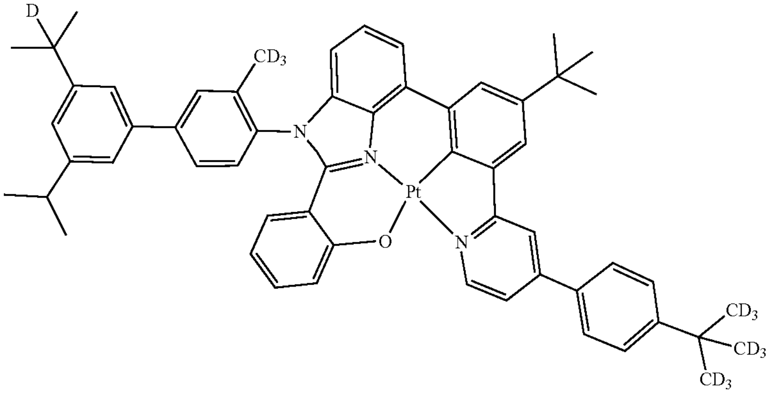
130
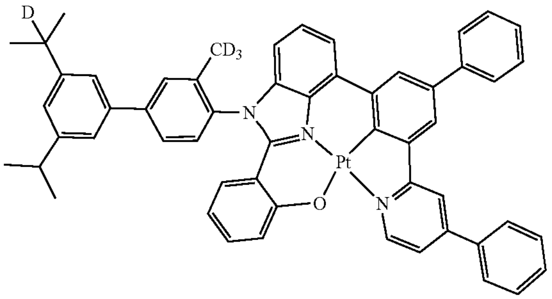
131
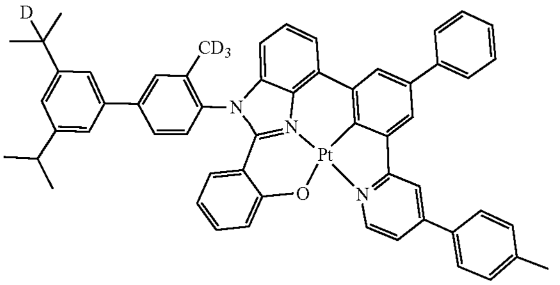
132
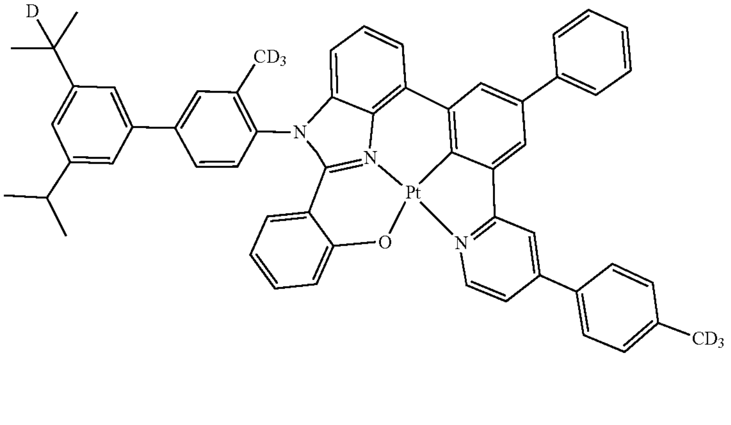

-continued
133
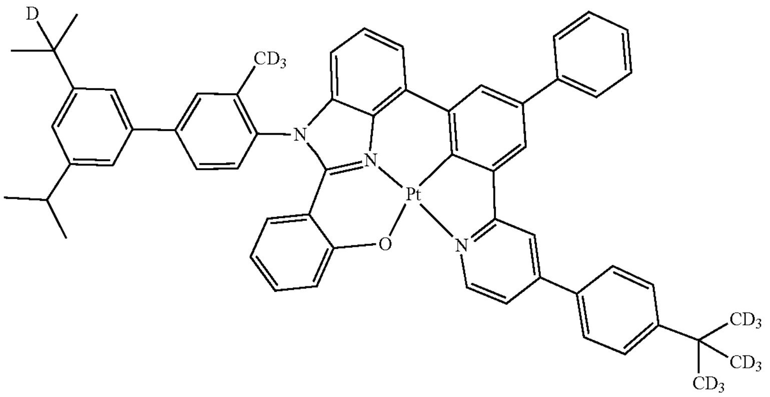
134
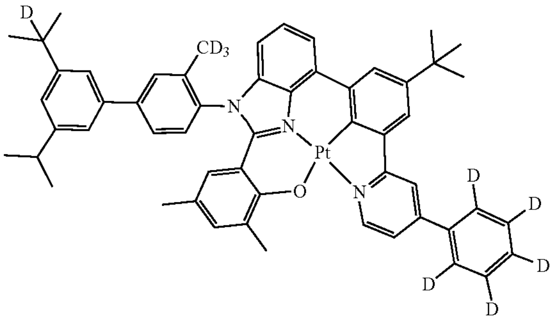
135
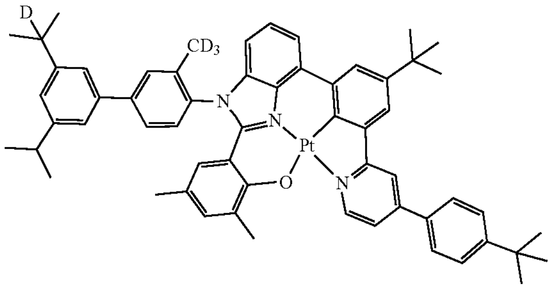
136
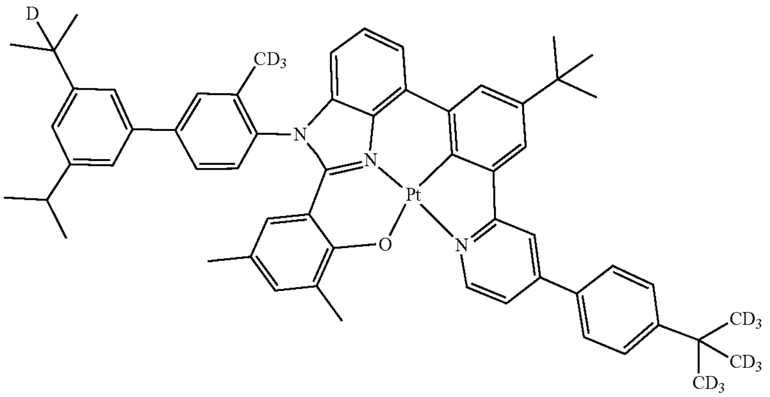
137
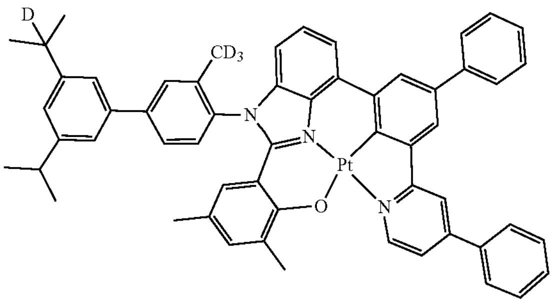
138
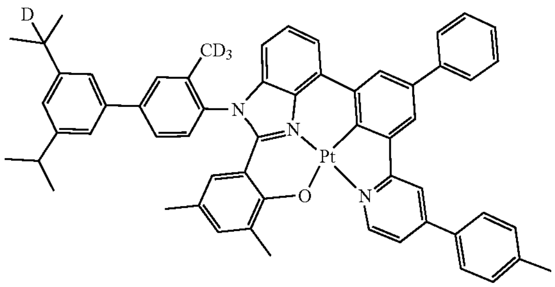

-continued
139
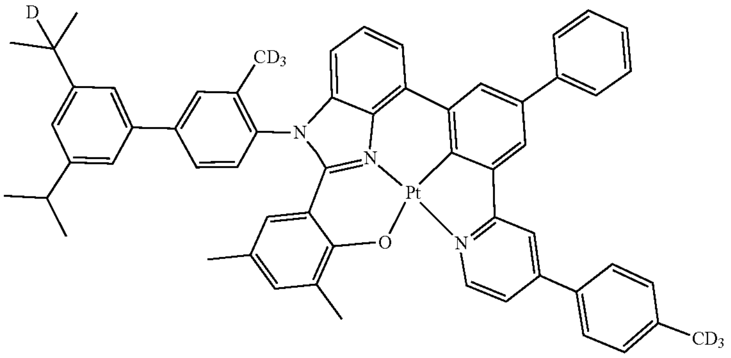
140
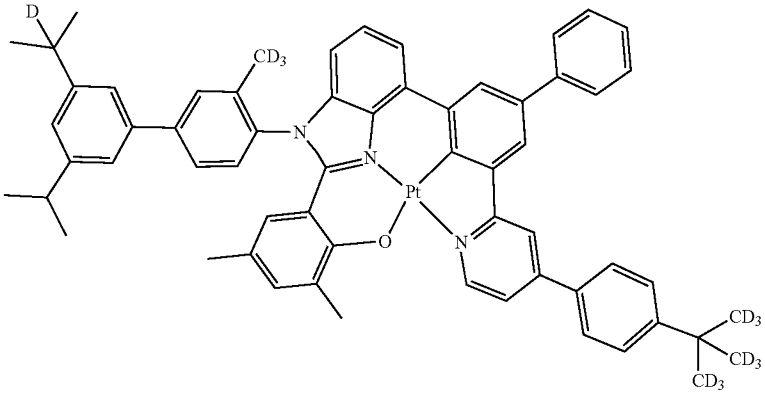
141
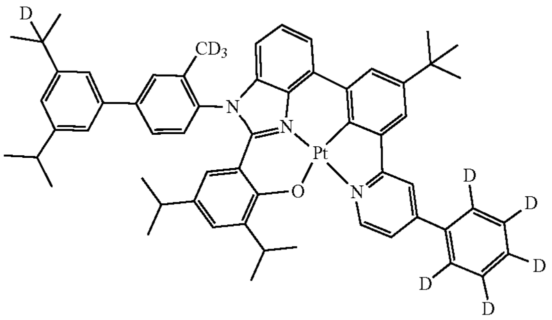
142
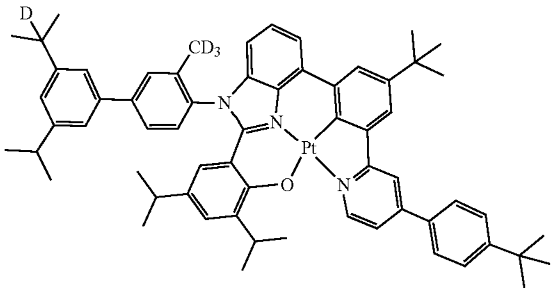
143
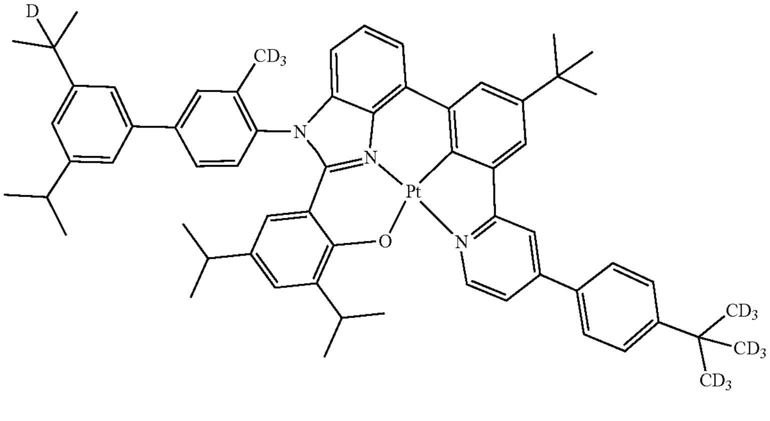

-continued
144
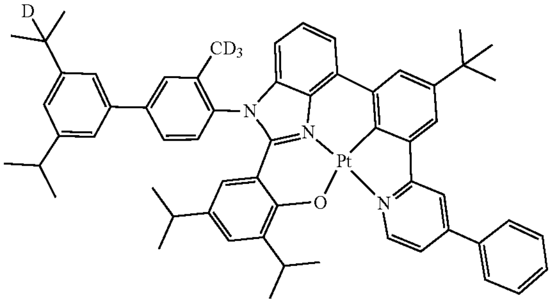
145
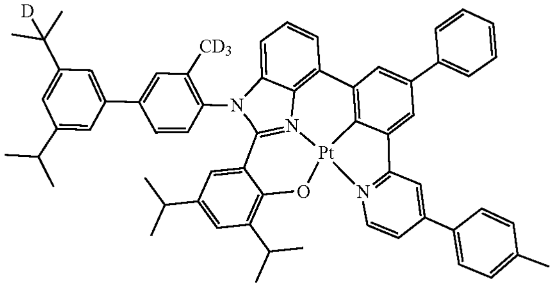
146
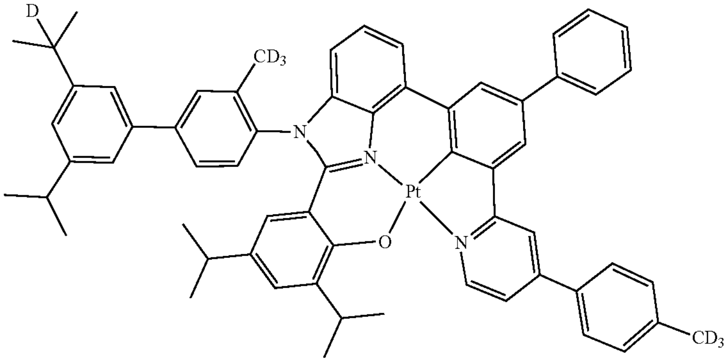
147
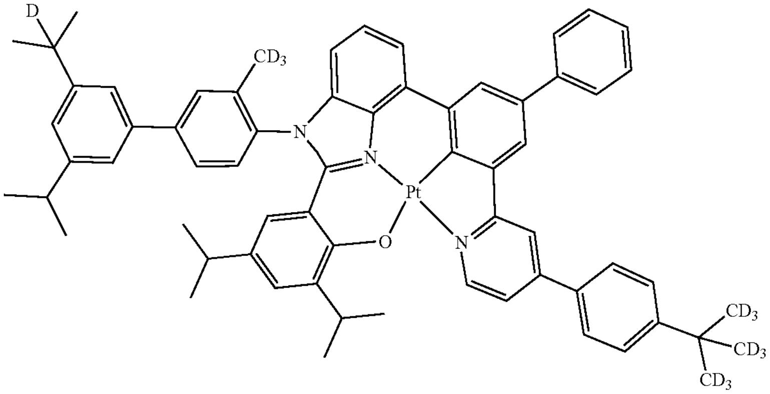
148
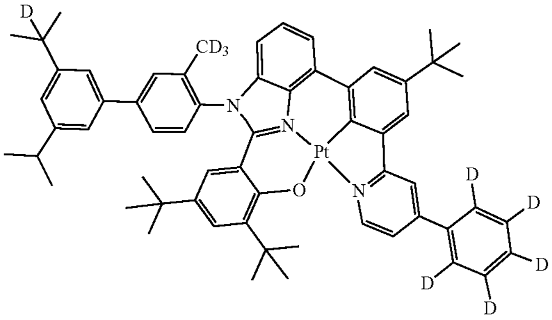
149
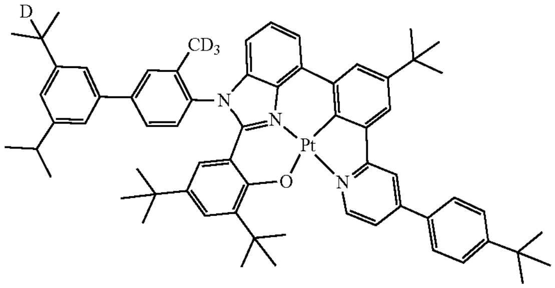

-continued
150
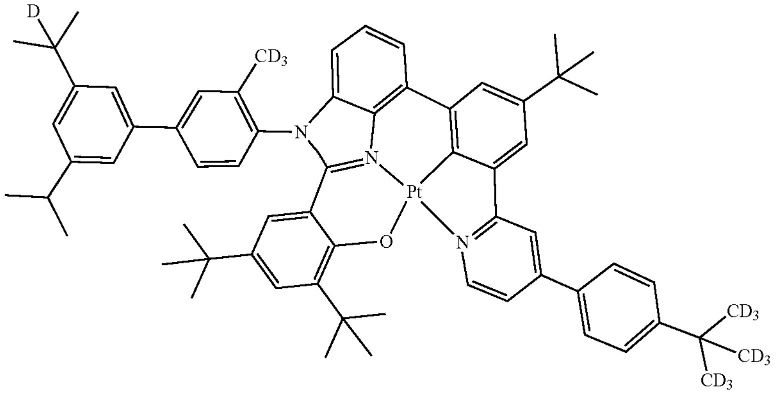
151
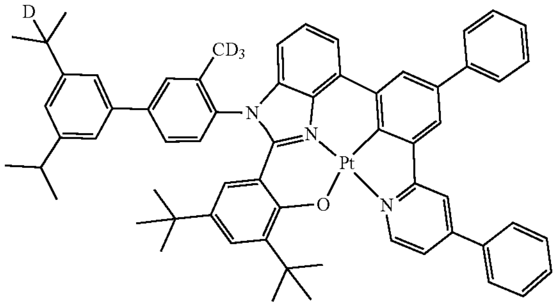
152
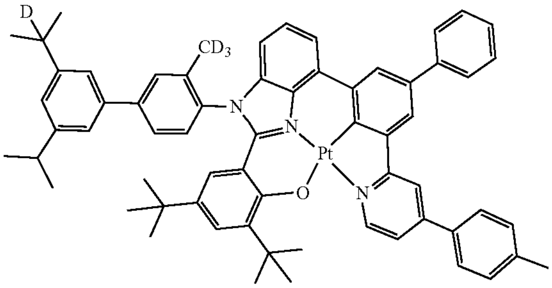
154
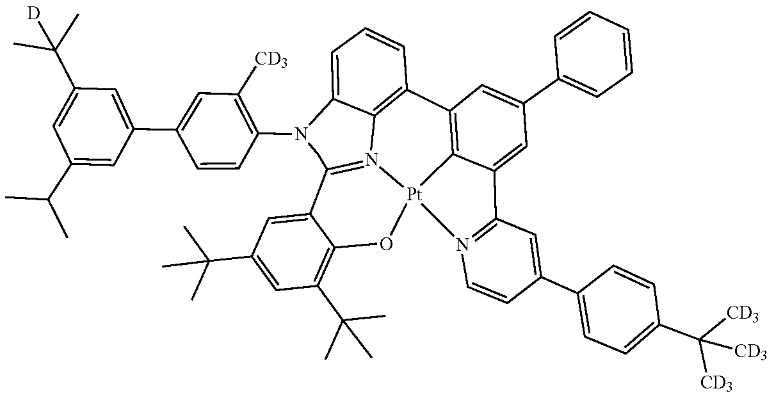
155
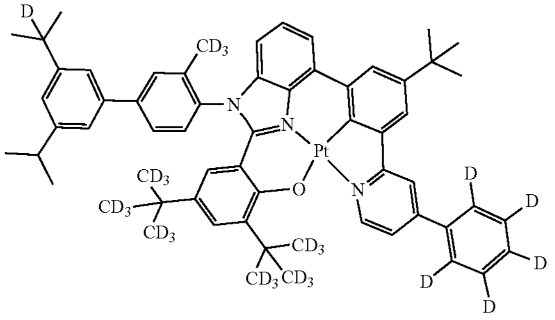
156
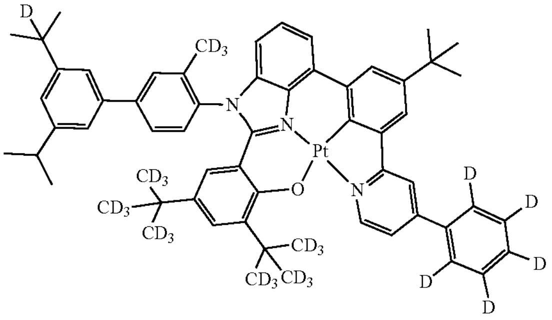

-continued
157
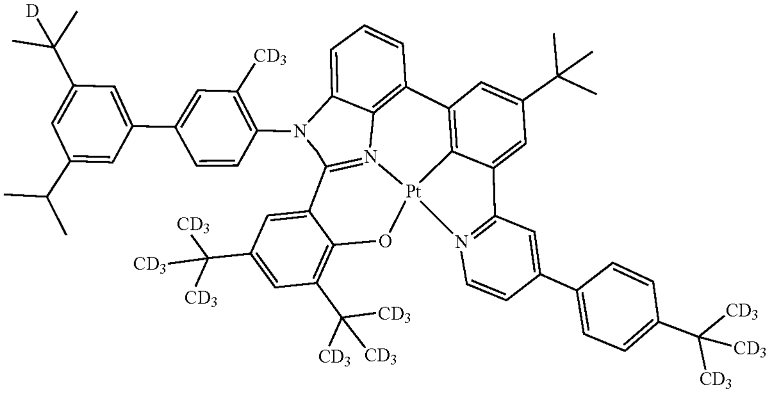
158
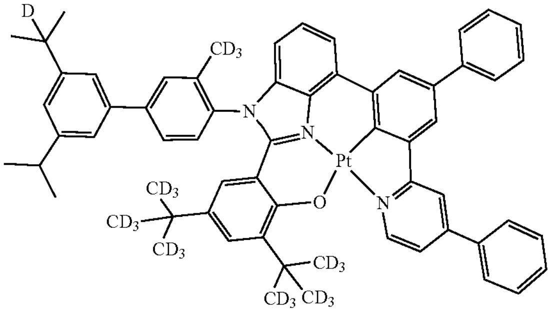
159
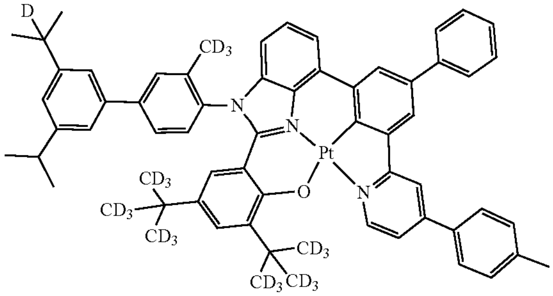
160
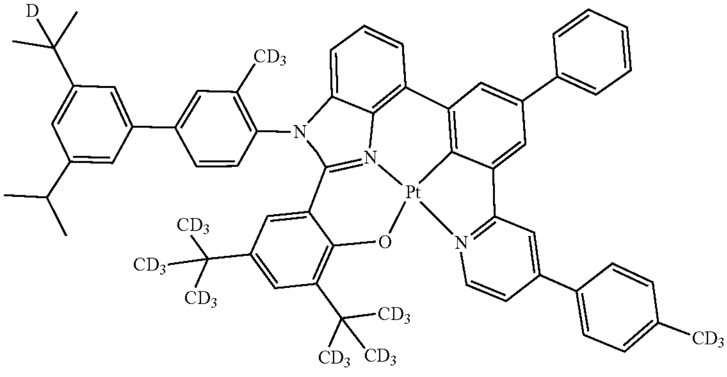
161
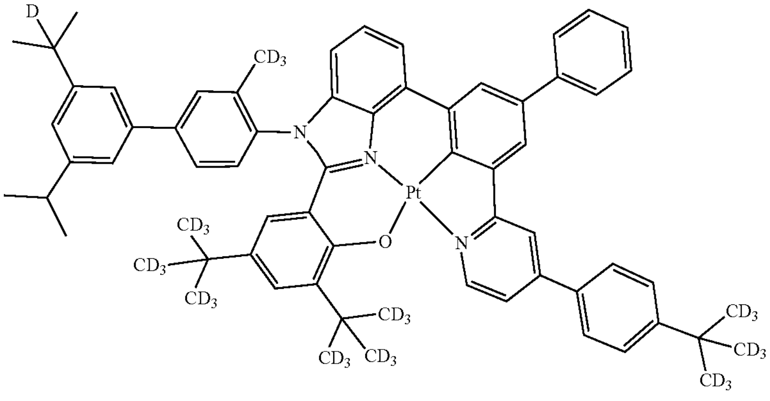

-continued
162
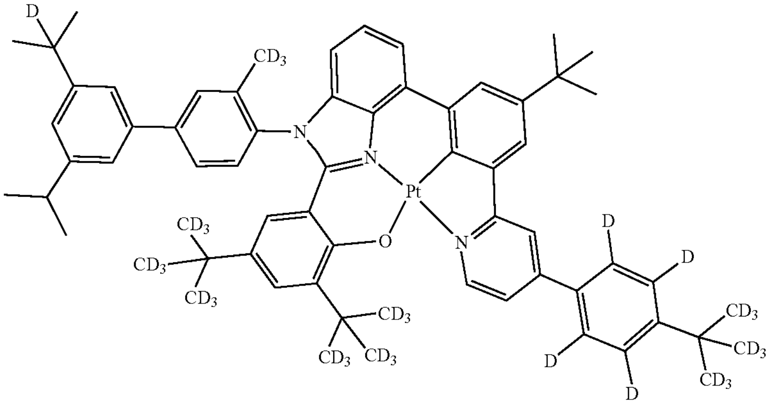
163
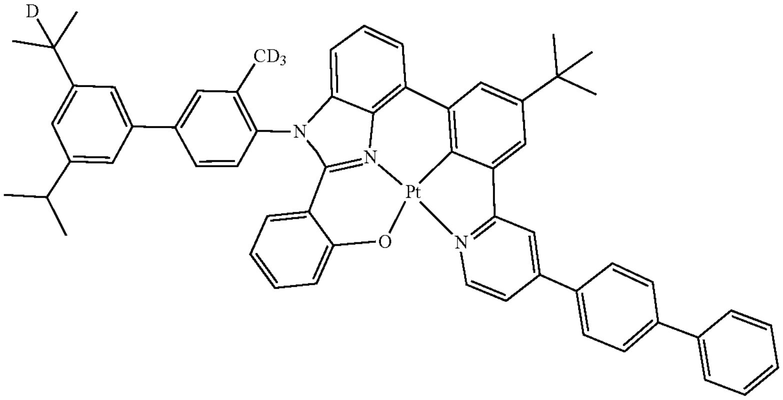
164
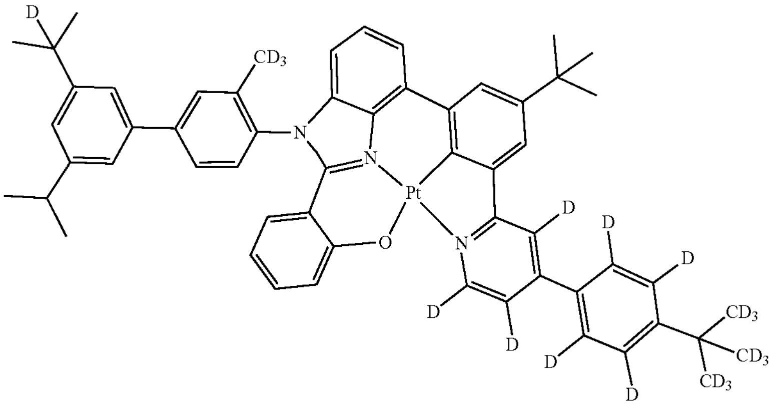
165
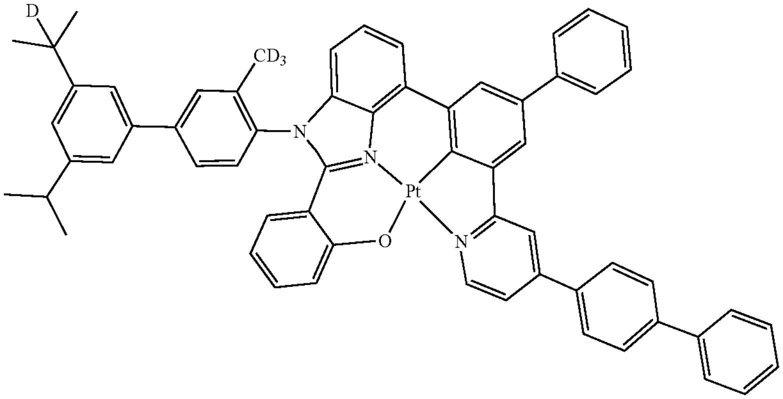

-continued
166
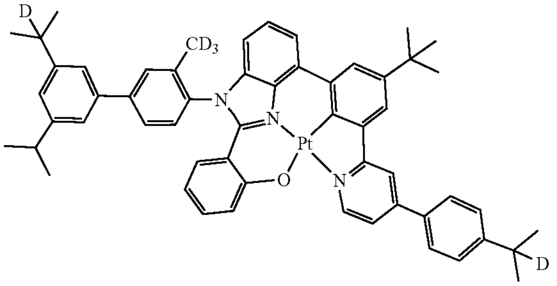
167
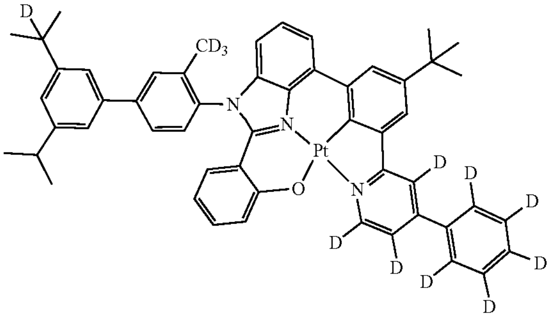
168
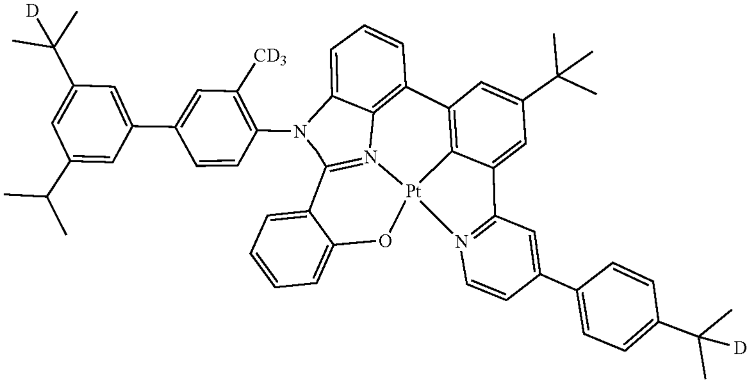
169
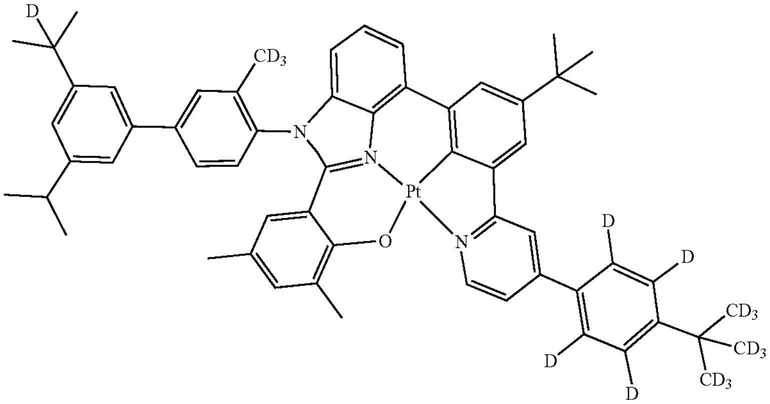
170
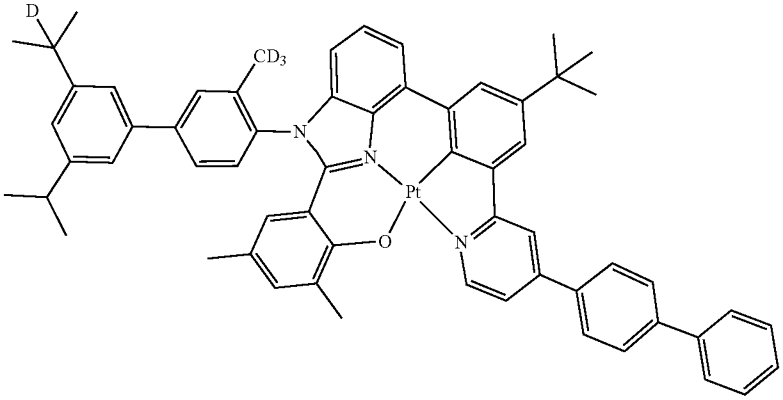

-continued
171
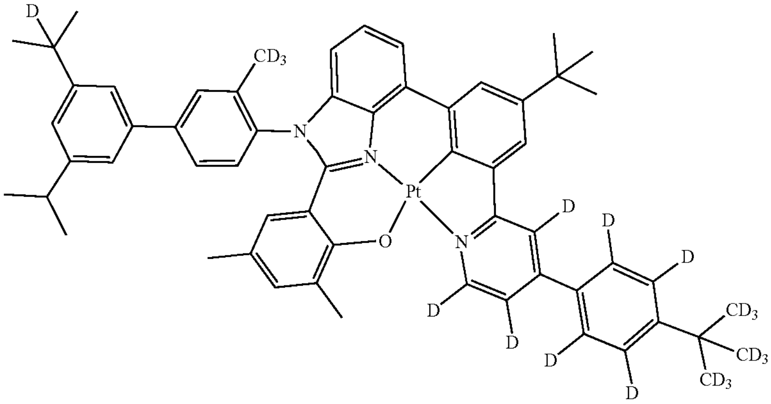
172
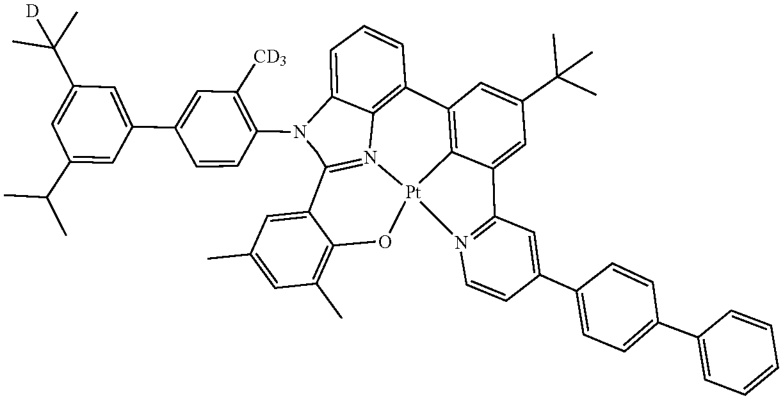
173
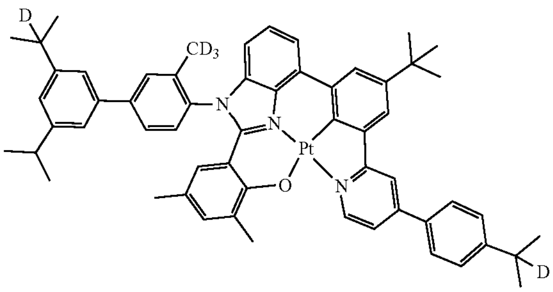
174
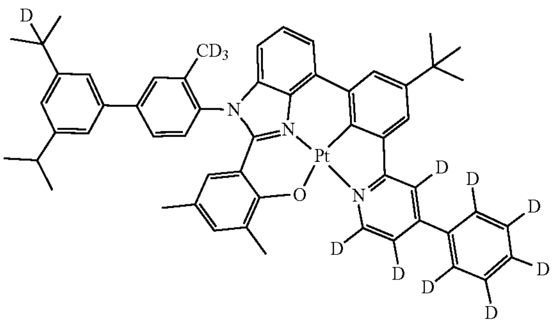
175
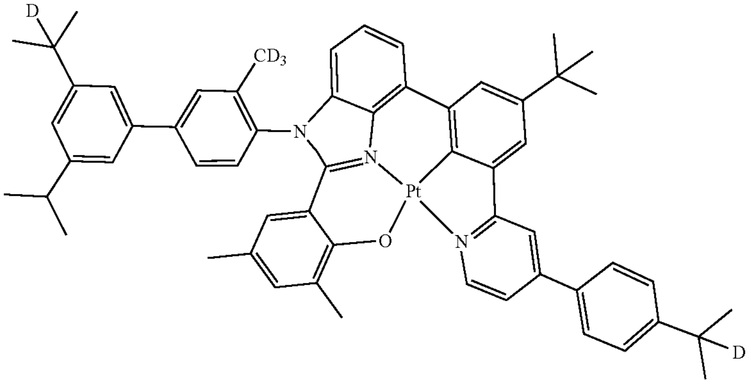

-continued
176
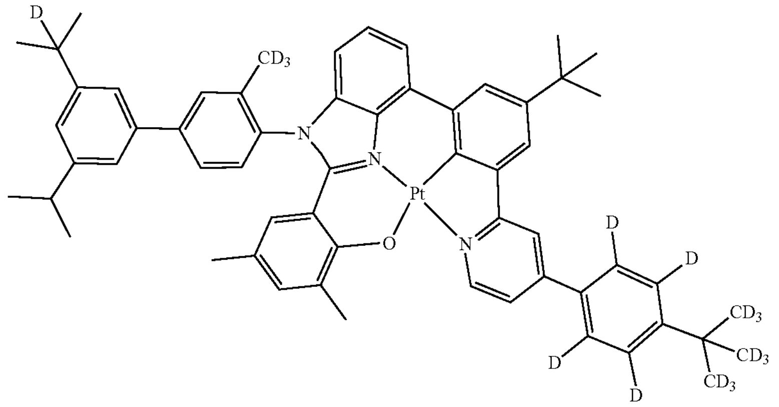
177
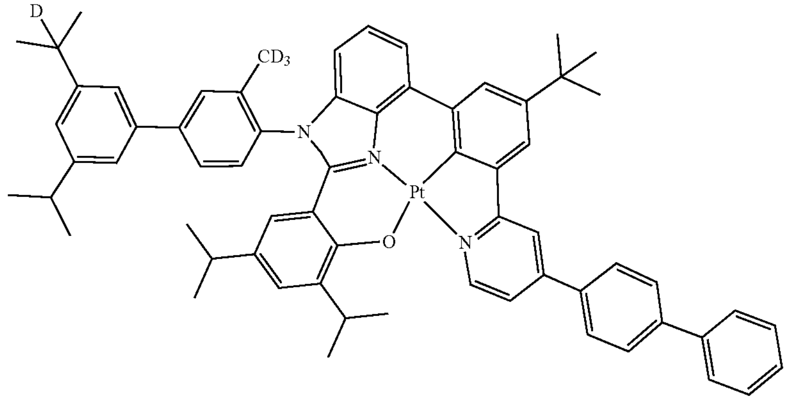
178
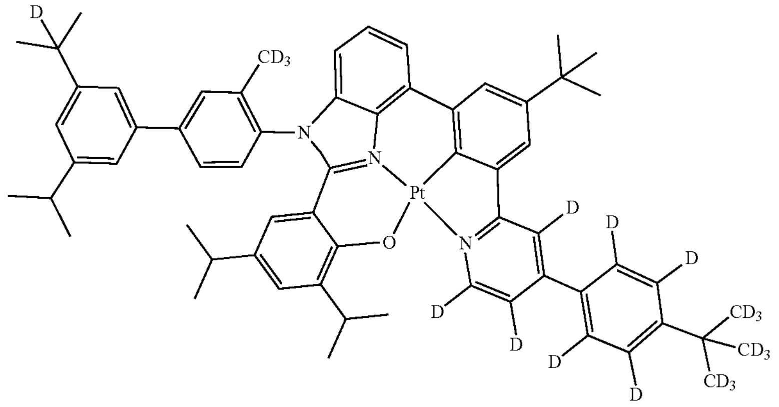
179
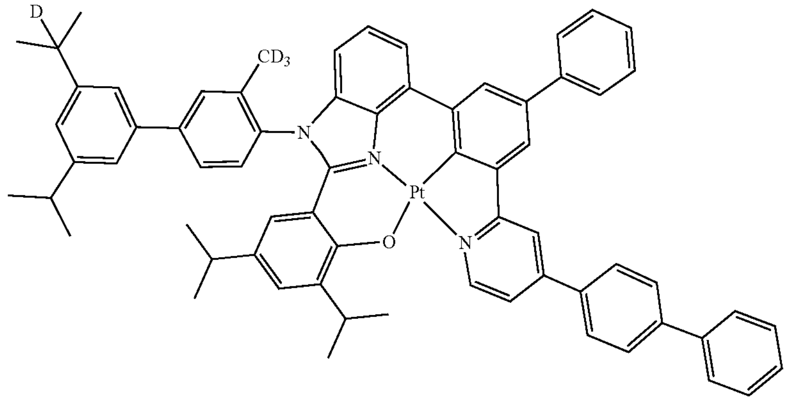

-continued
180
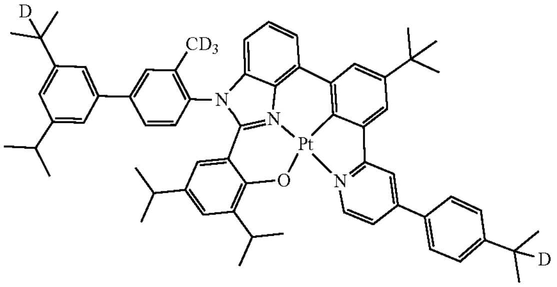
181
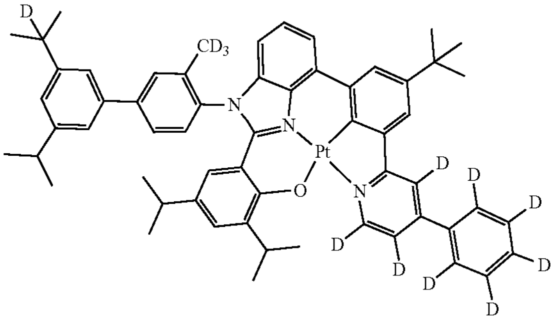
182
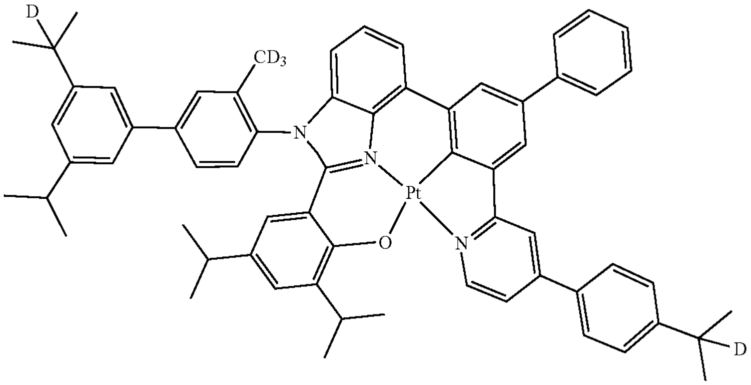
183
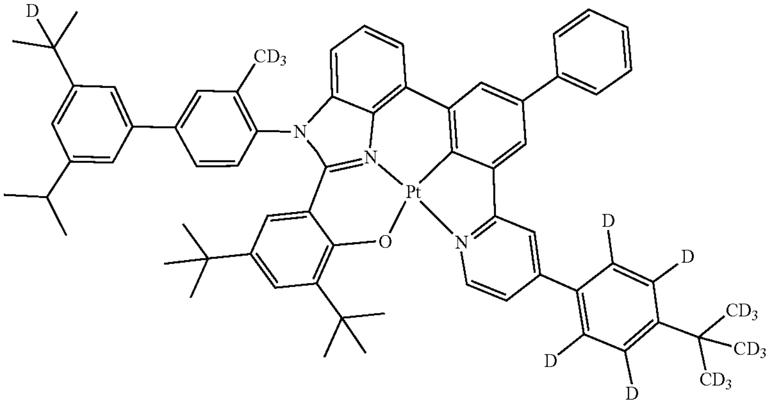
184
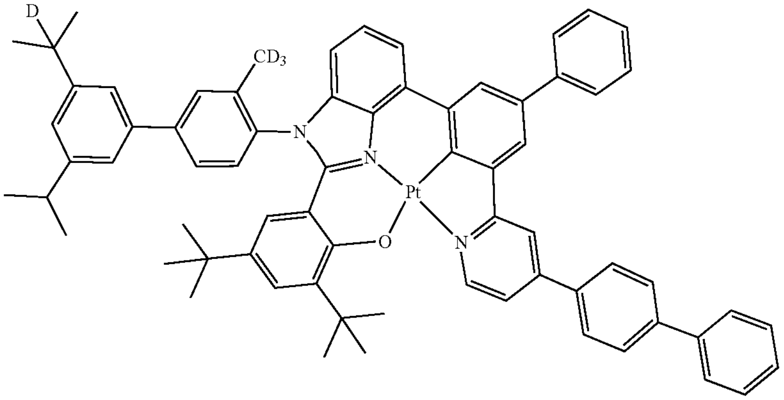

-continued
185
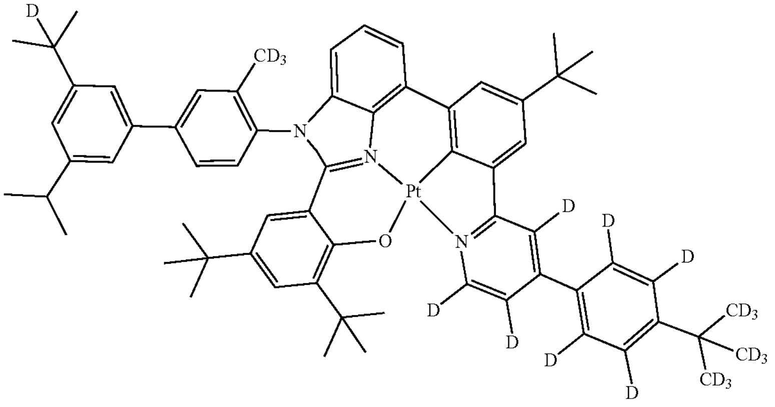
186
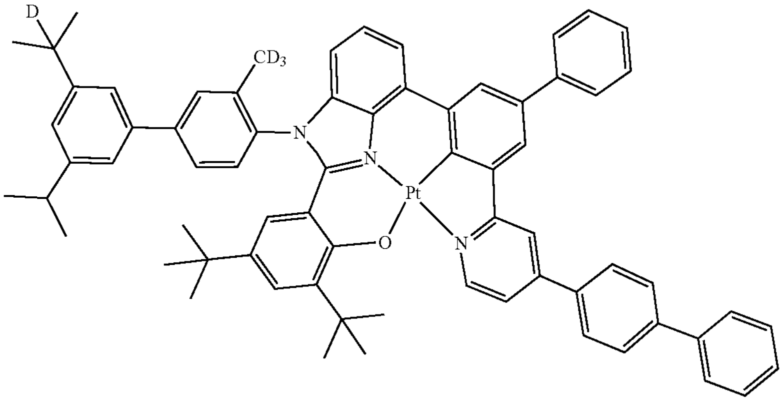
187
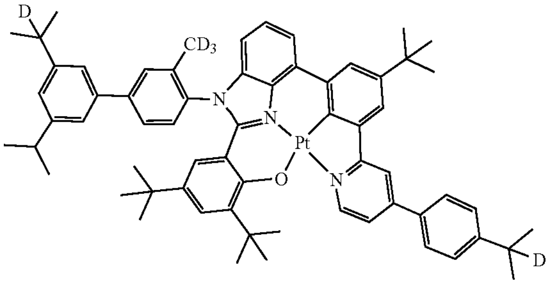
188
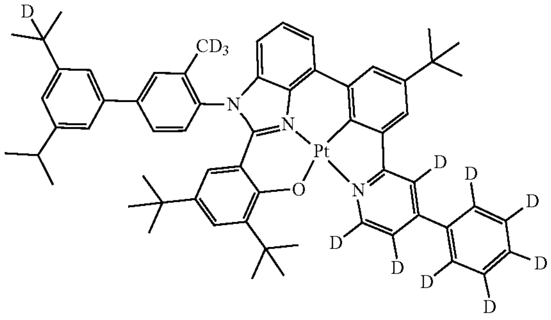
189
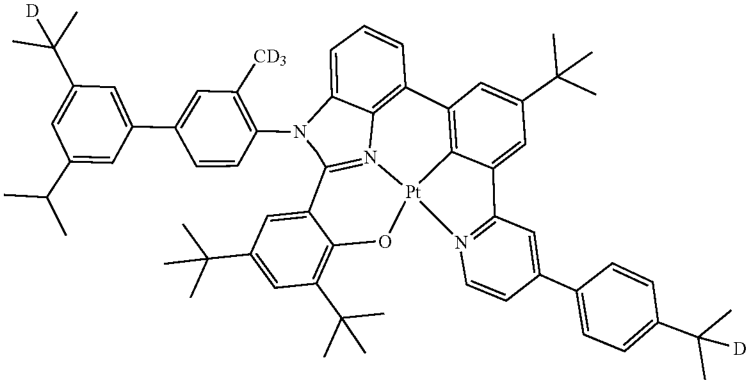

-continued
190
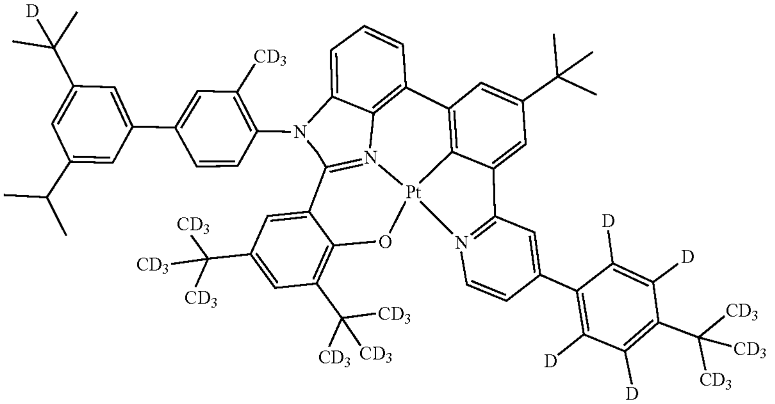
191
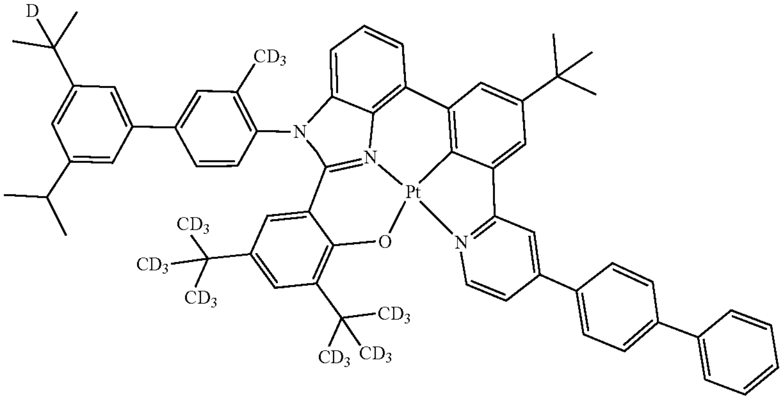
192
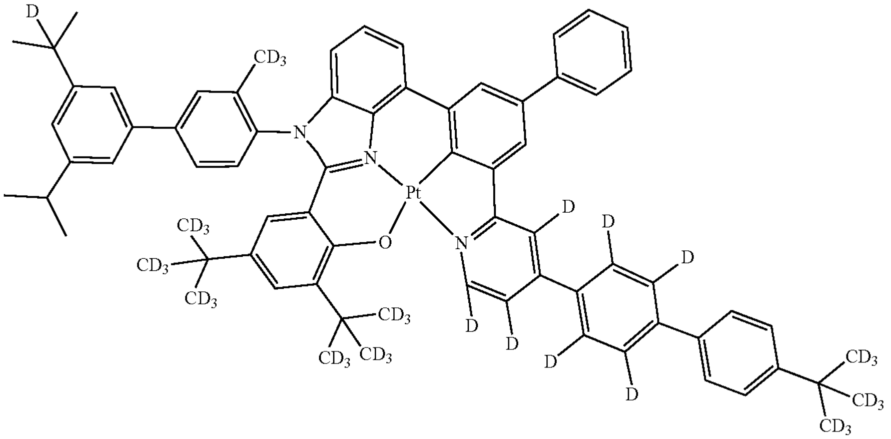
193
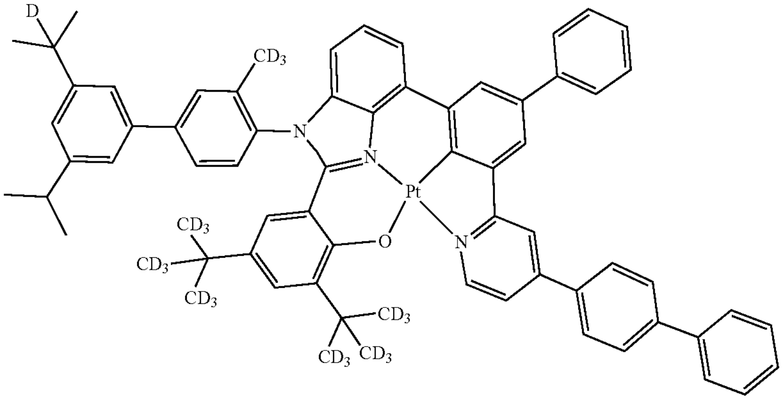

-continued
194
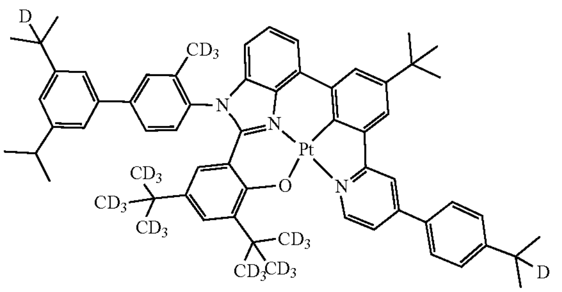
195
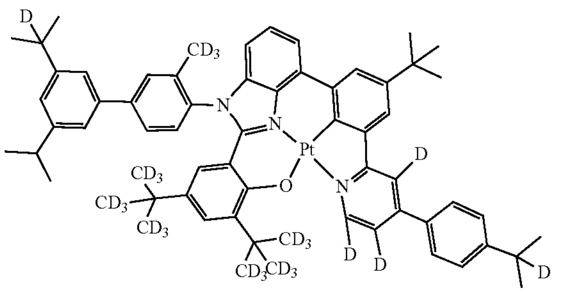
196
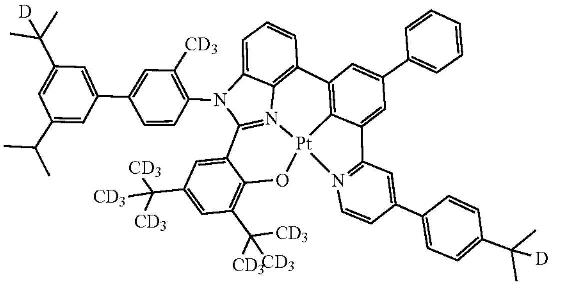
197
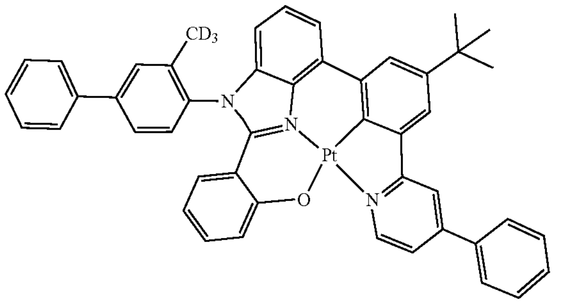
198
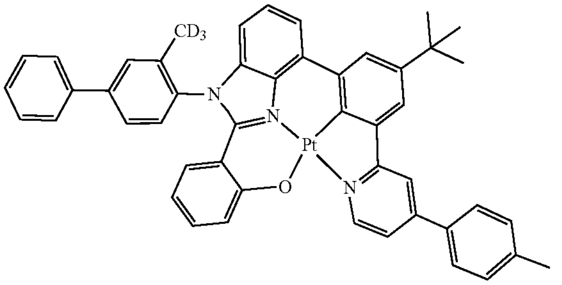
199
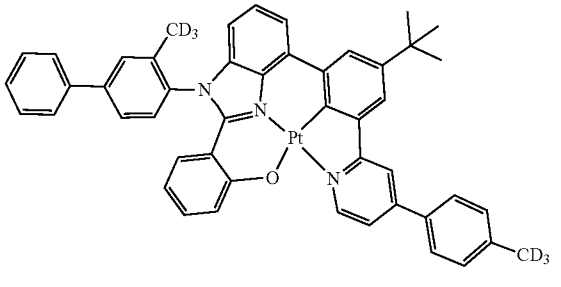
200
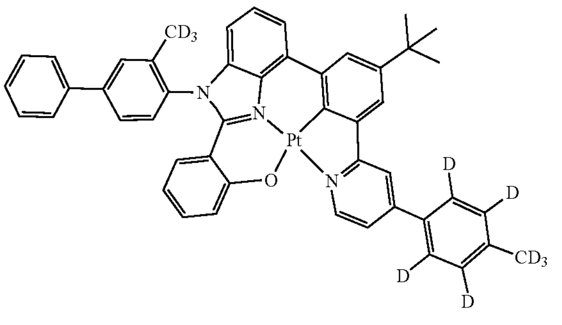
201
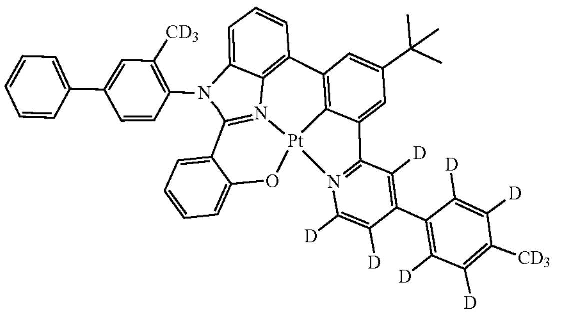
202
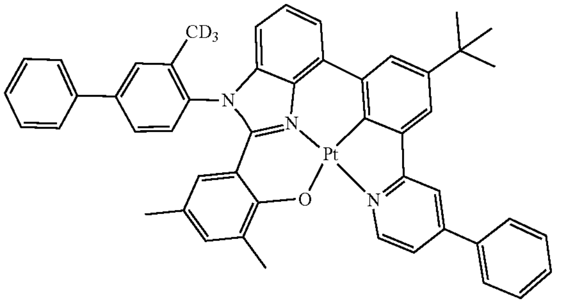
203
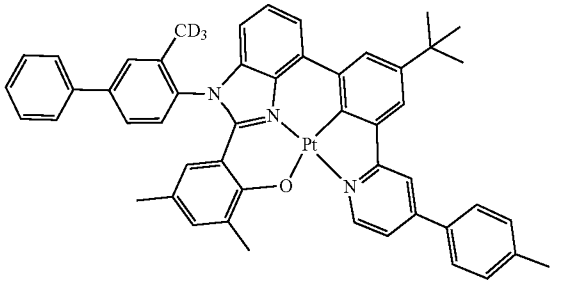

-continued
204
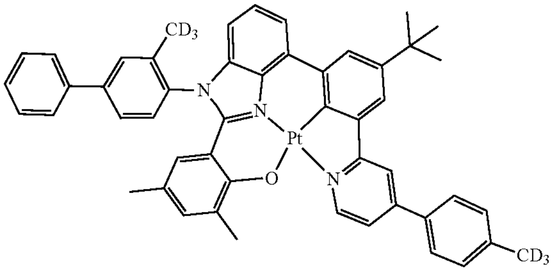
205
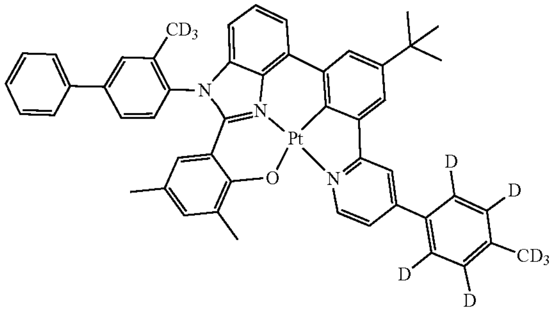
206
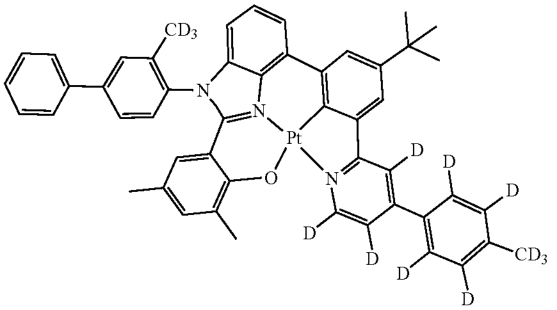
207
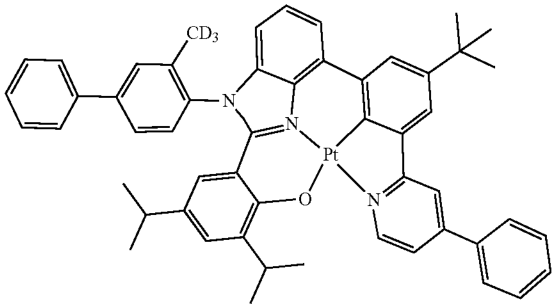
208
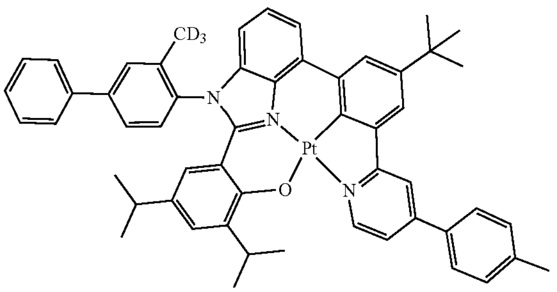
209
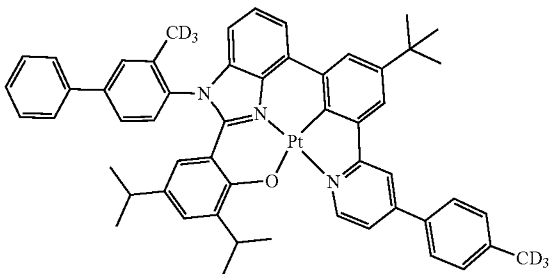
210
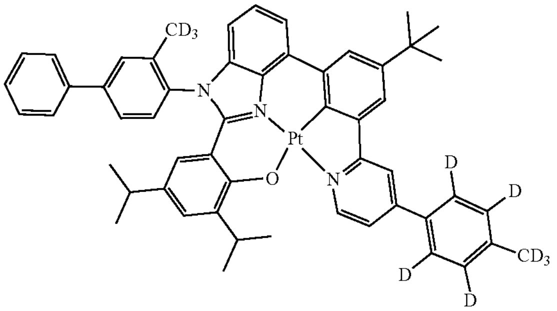
211
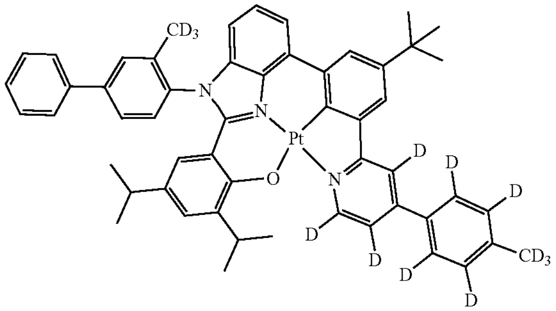
212
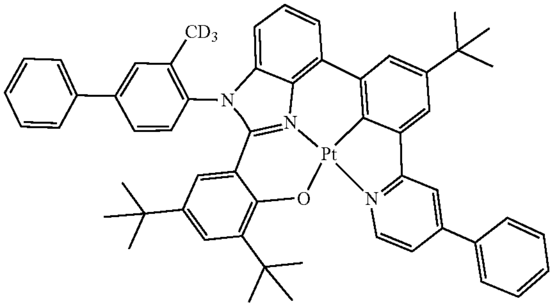
213
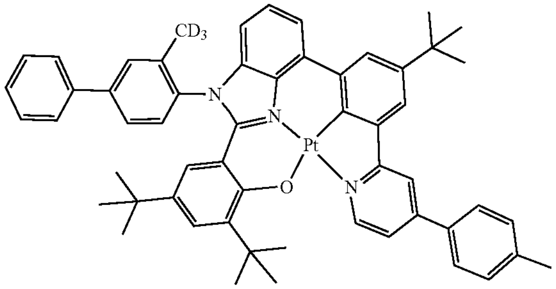

-continued
214
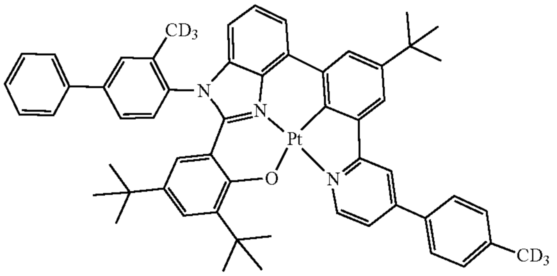
215
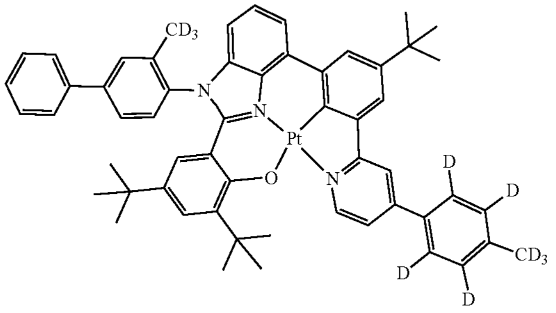
216
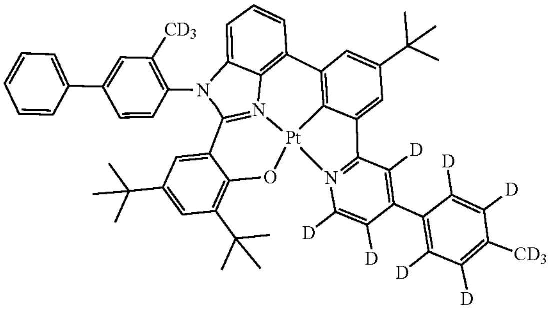
217
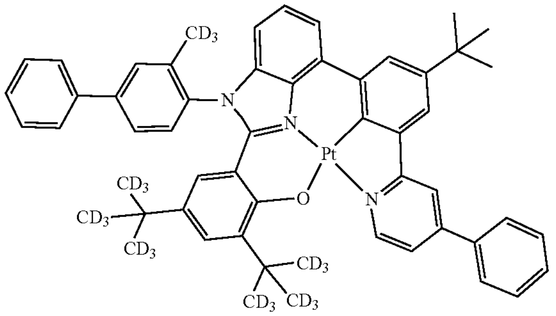
218
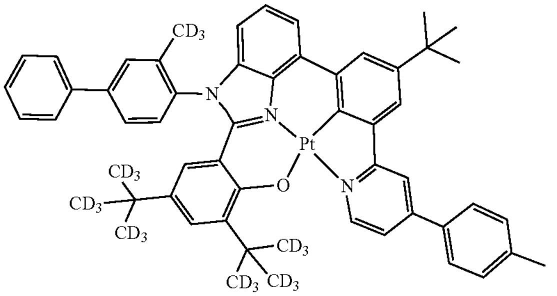
219
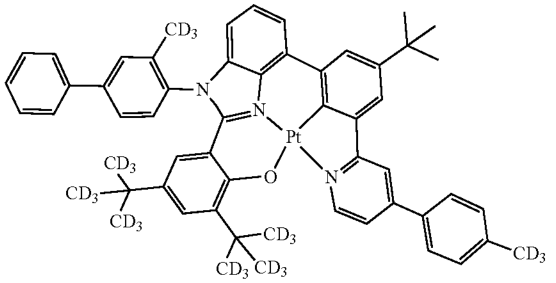
220
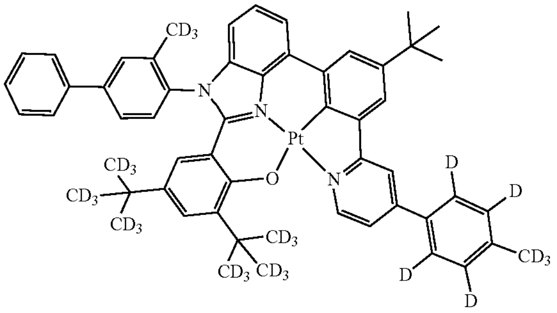
221
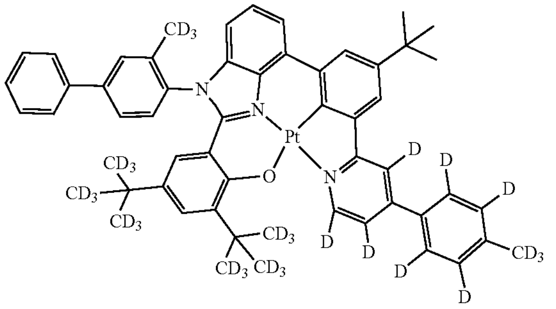
222
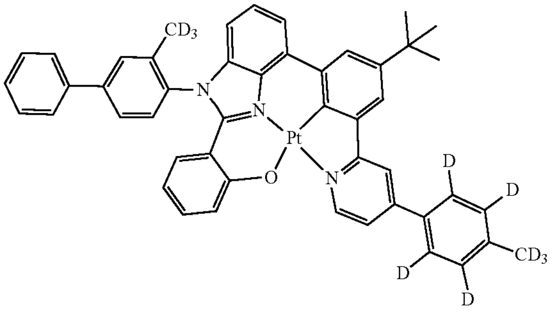
223
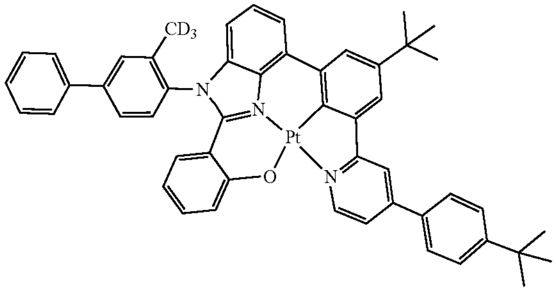

-continued
224
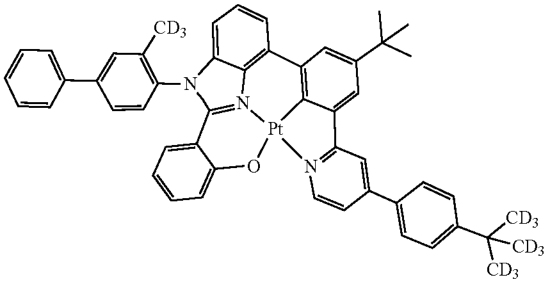
225
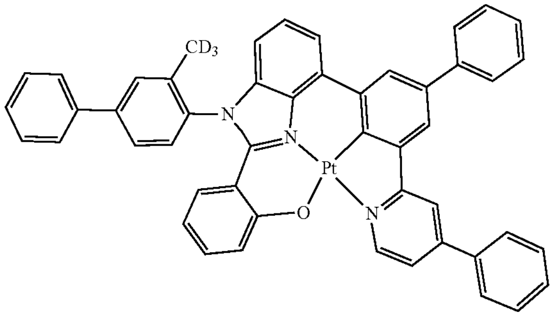
226
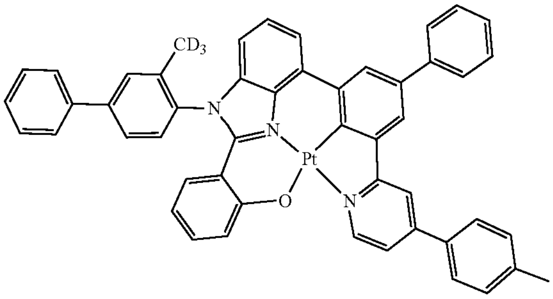
227
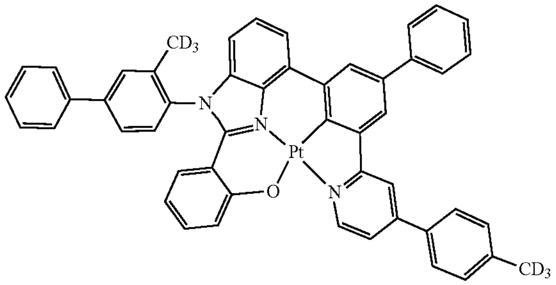
228
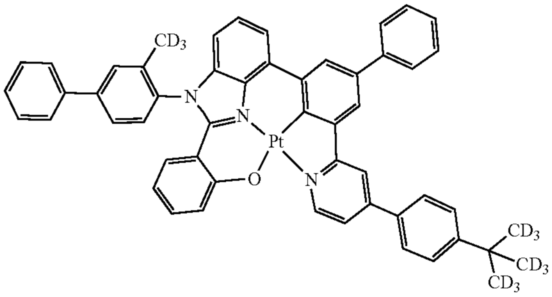
229
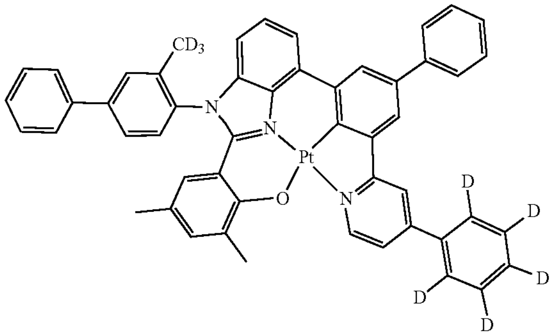
230
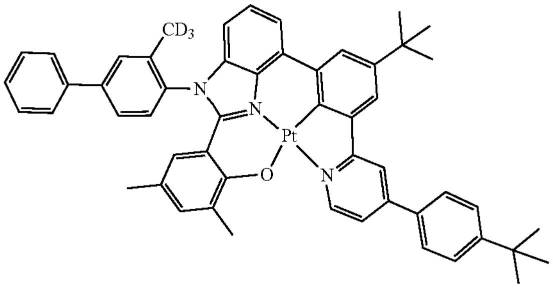
231
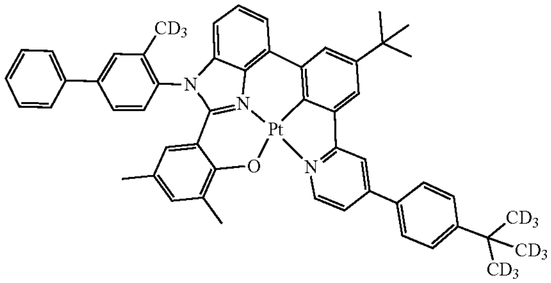

-continued
232
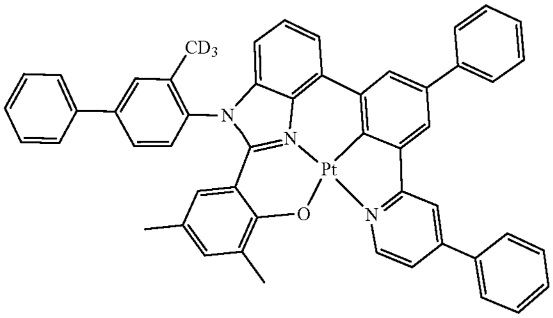
233
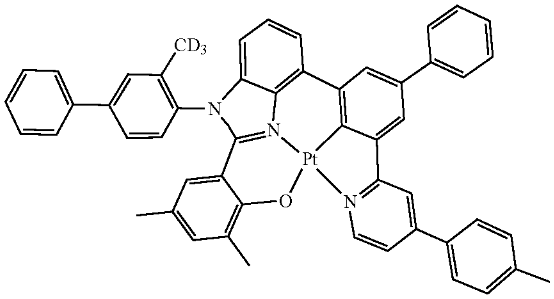
234
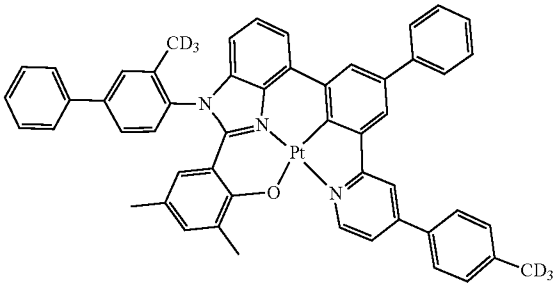
235
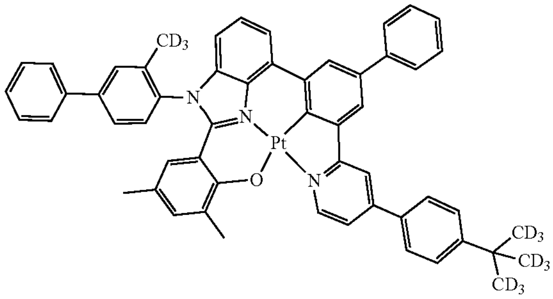
236
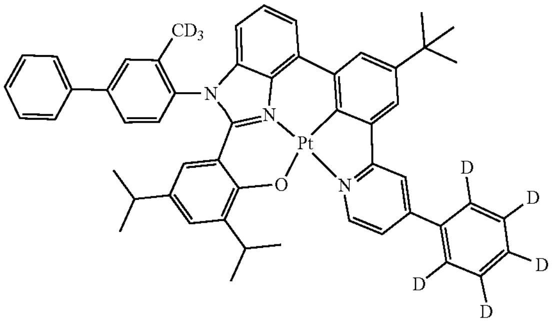
237
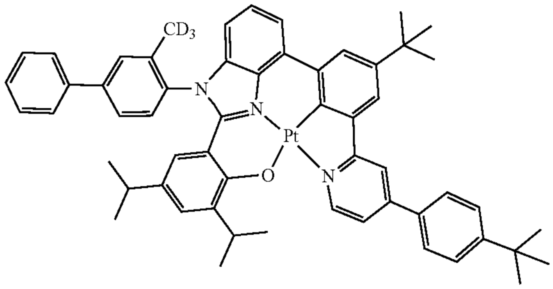
238
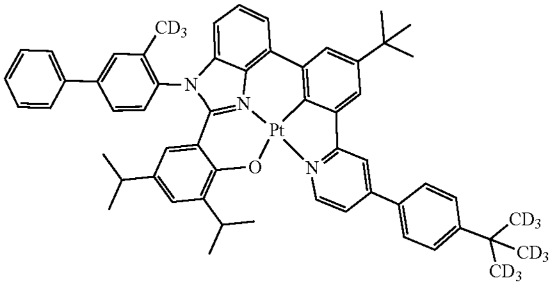
239
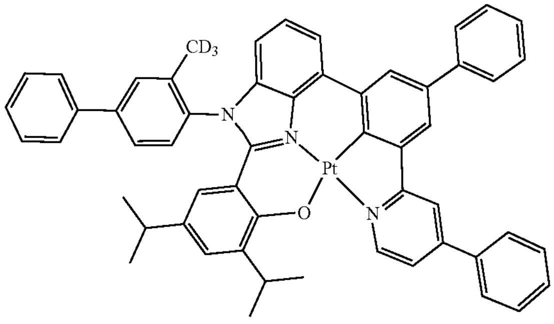

-continued
240
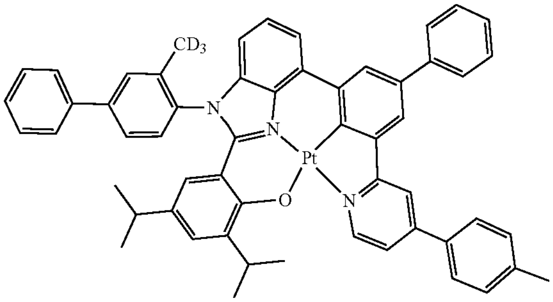
241
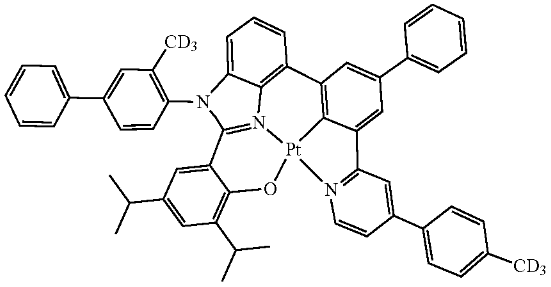
242
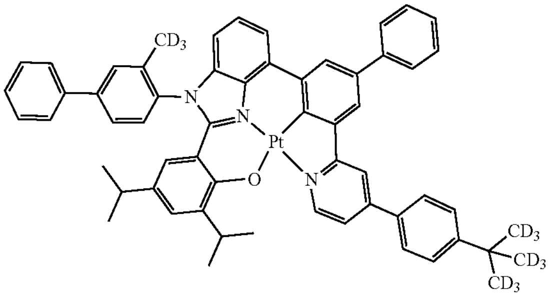
243
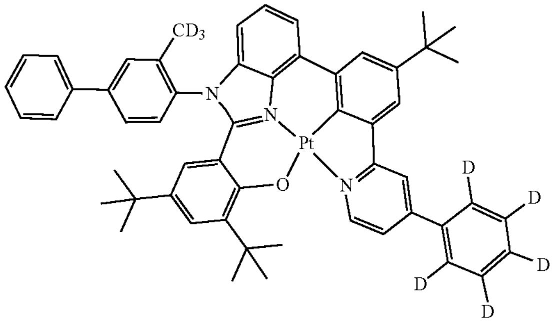
244
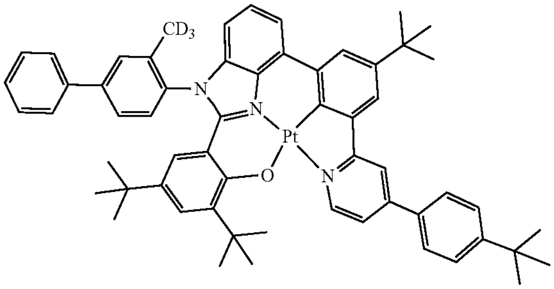
245
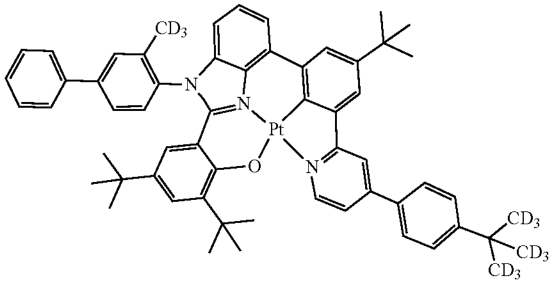
246
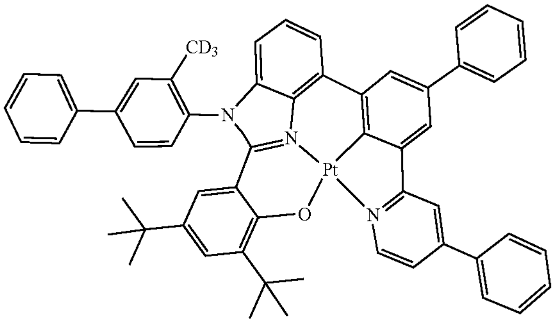
247
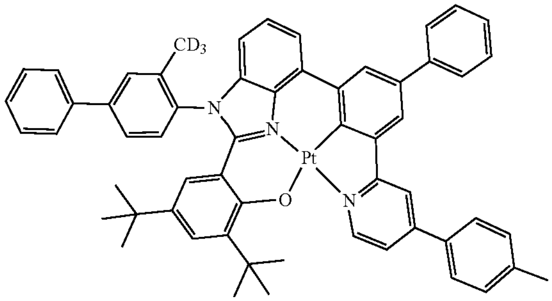

-continued
248
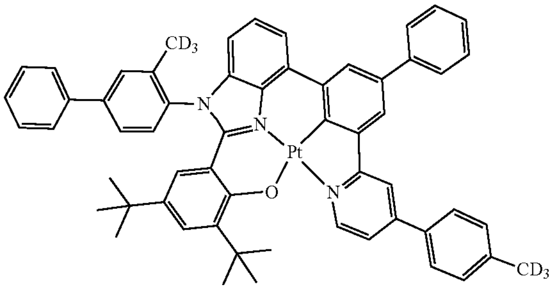
249
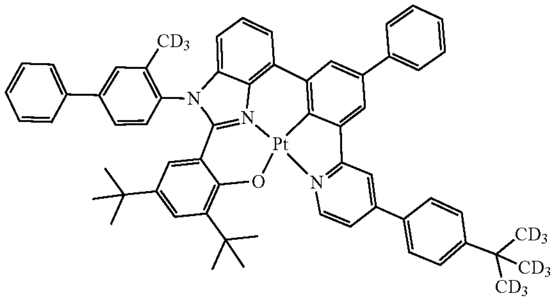
250
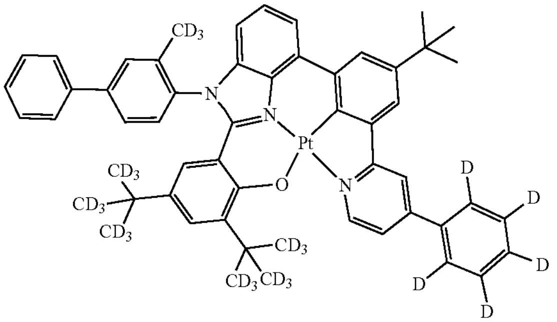
251
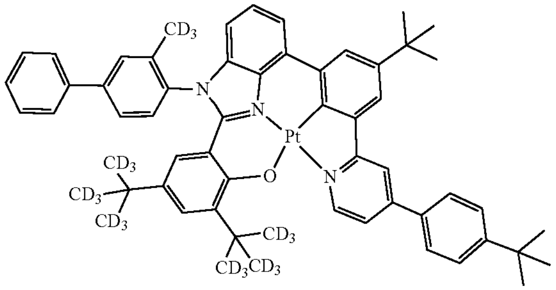
252
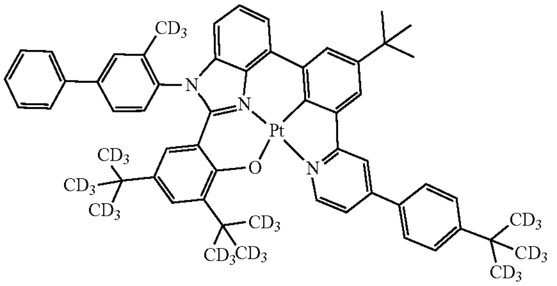
253
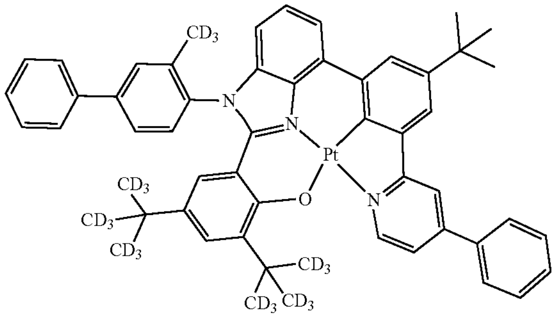
254
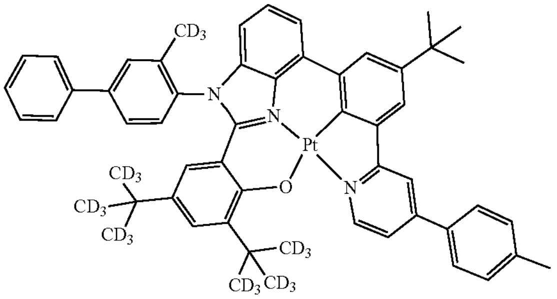
255
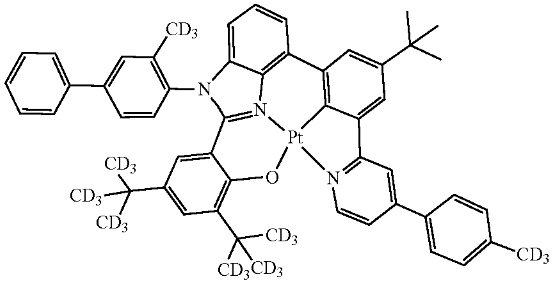

-continued
256
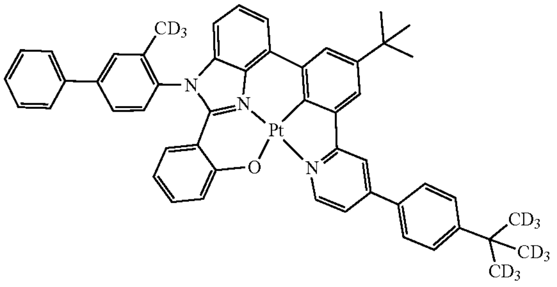
257
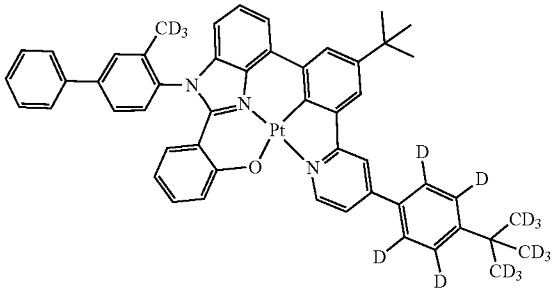
258
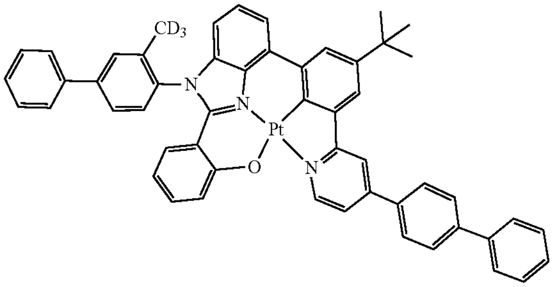
259
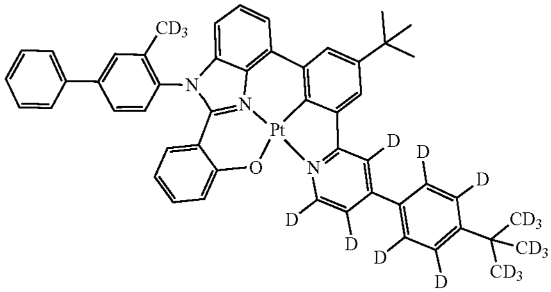
260
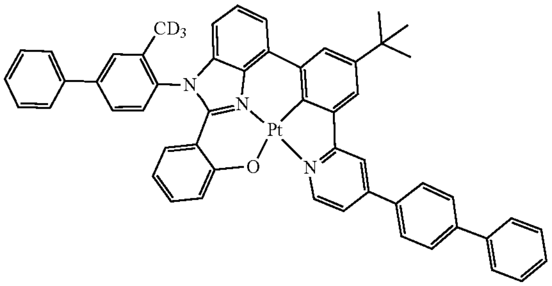
261
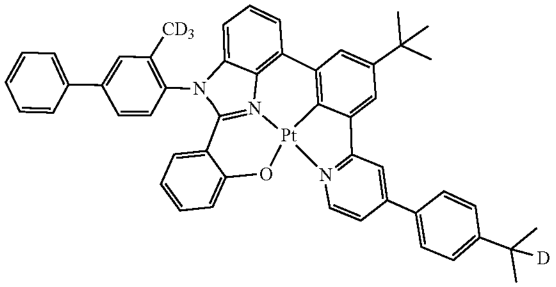
262
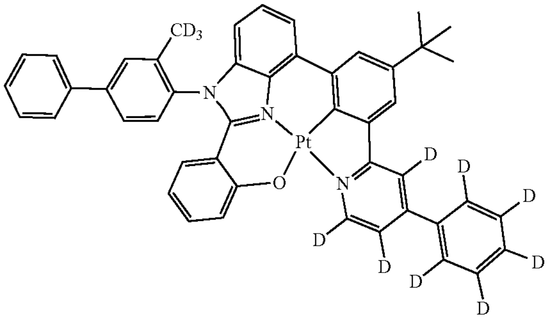
263
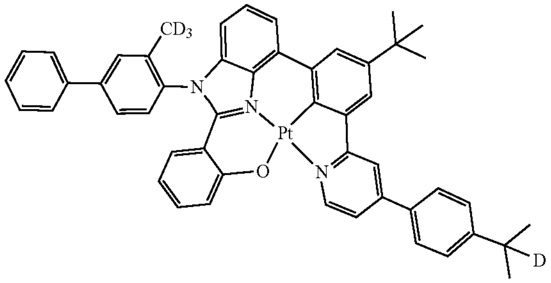

-continued
264
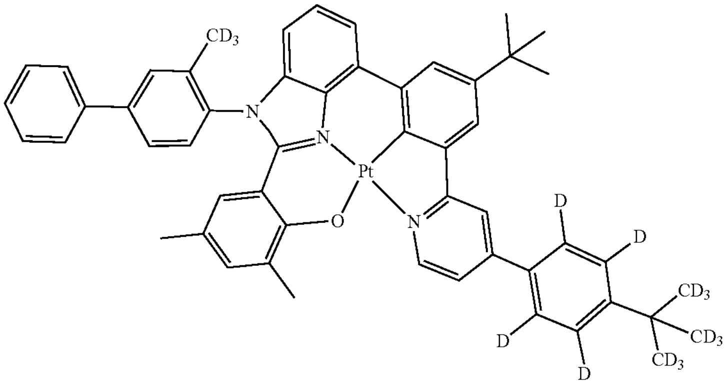
-continued
265
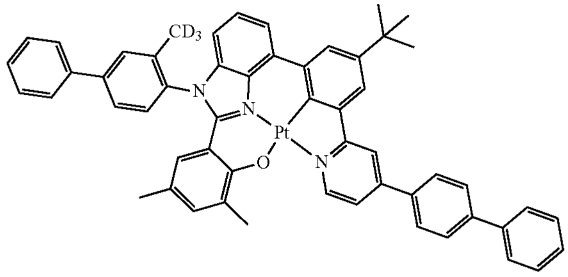
266
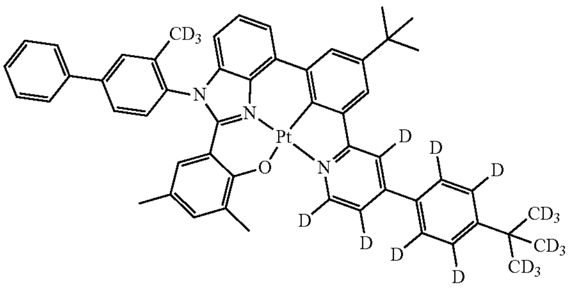
267
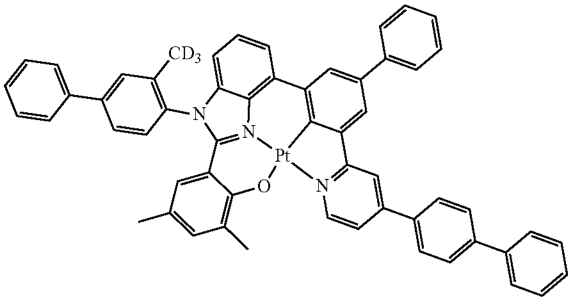
268
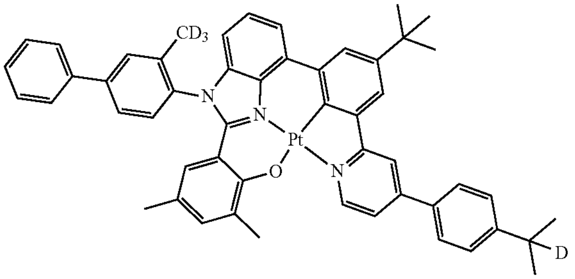
269
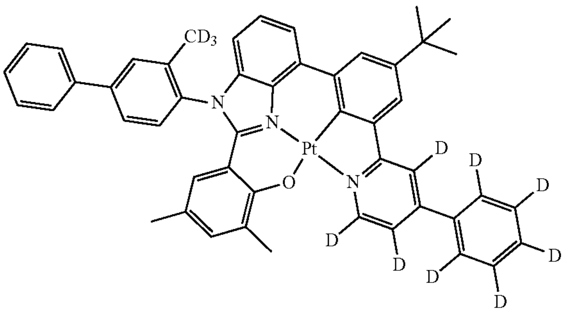
270
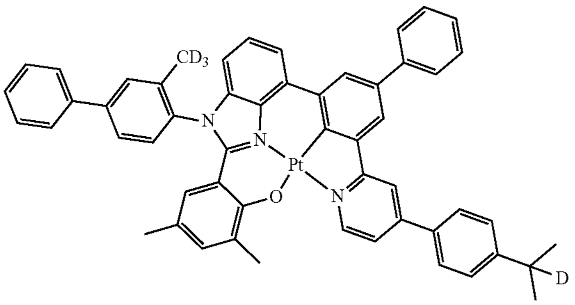

271
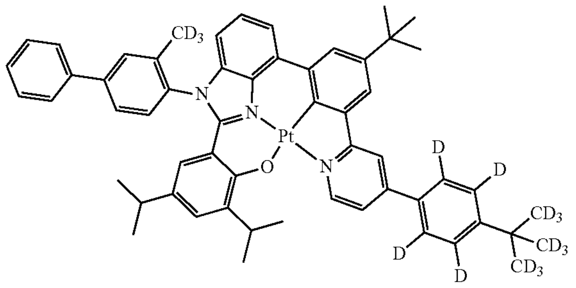
272
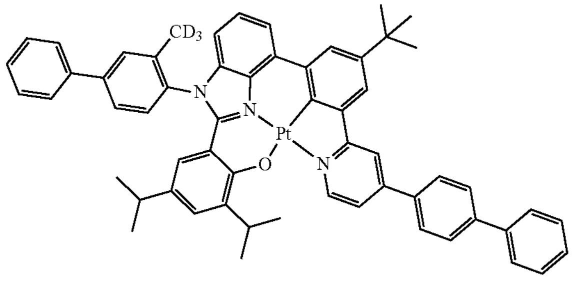
273
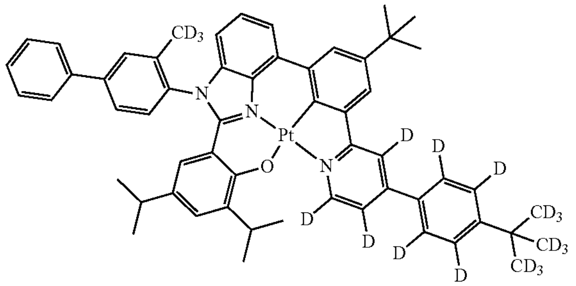
274
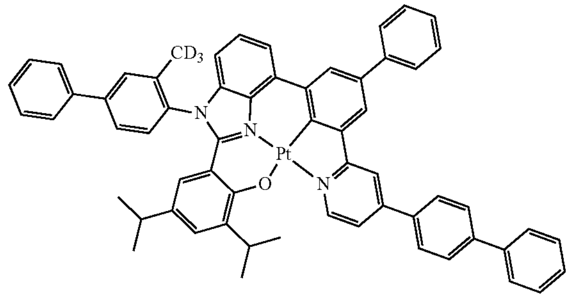
275
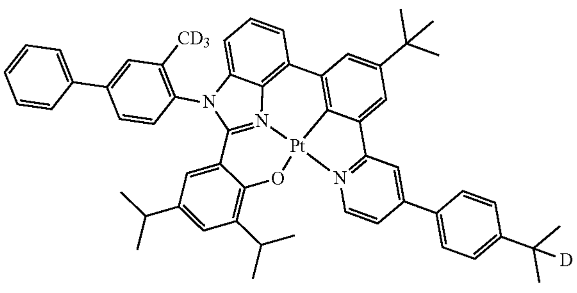
276
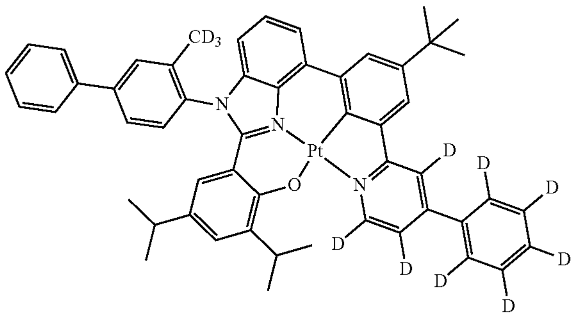
277
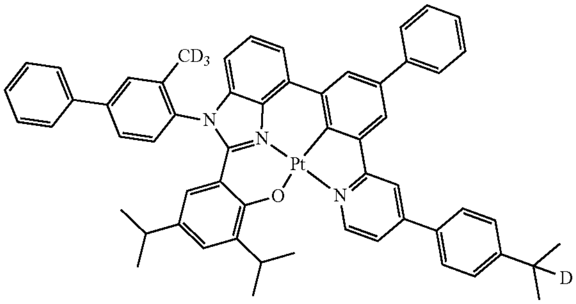
278
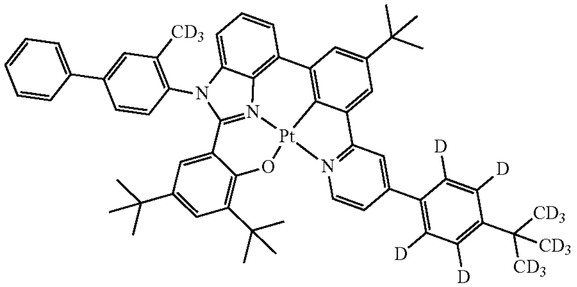
279
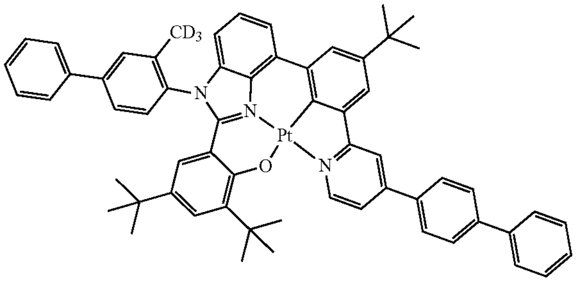
280
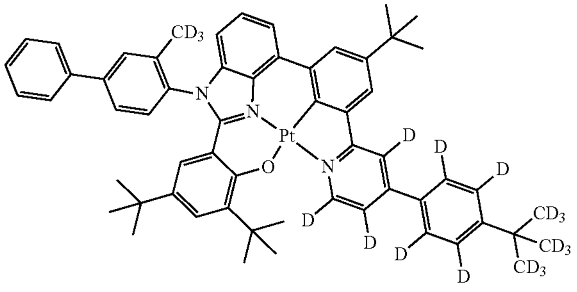

-continued
281
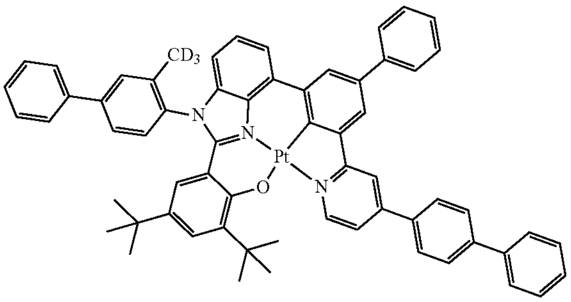
282
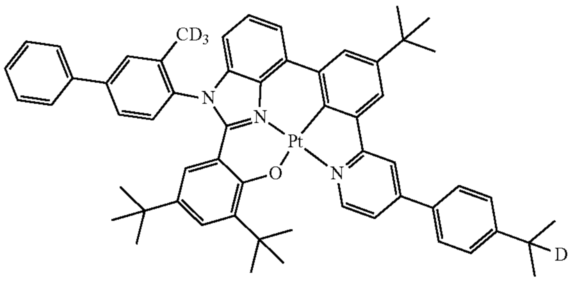
283
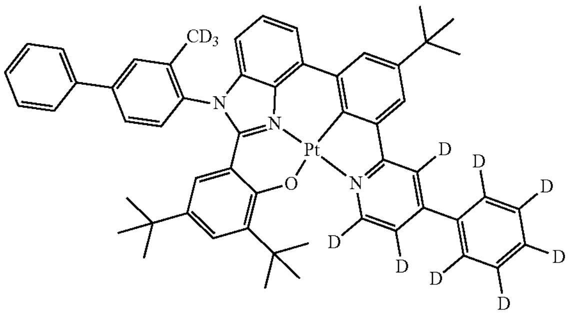
284
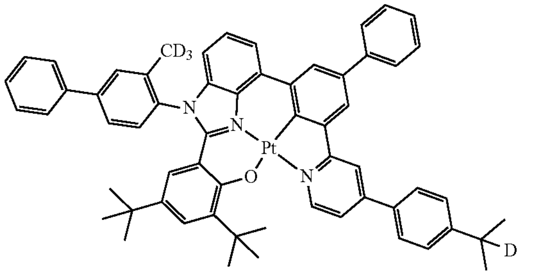
285
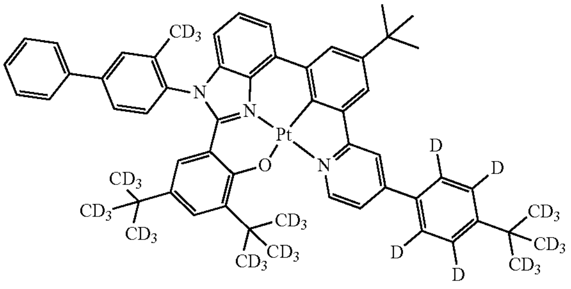
-continued
286
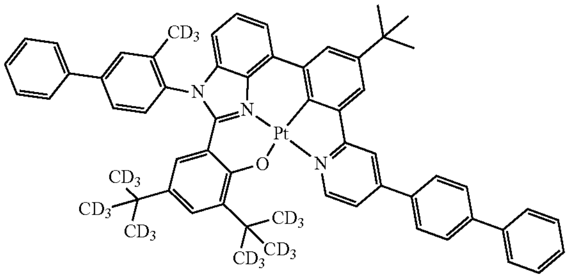
287
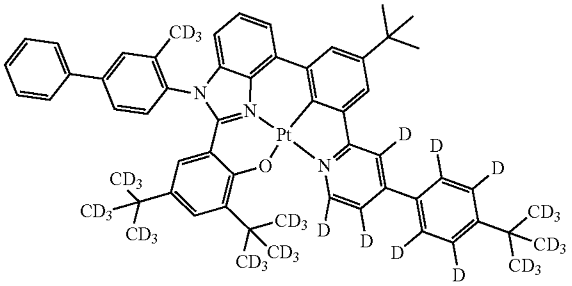
288
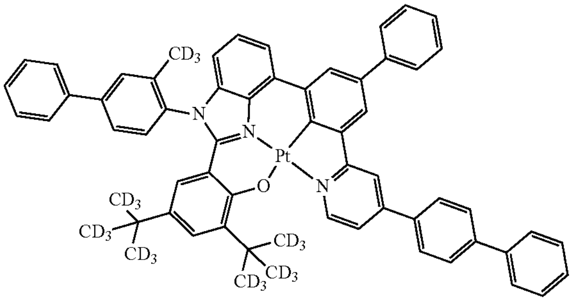
289
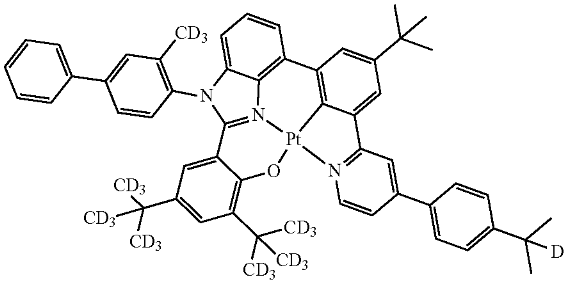
290
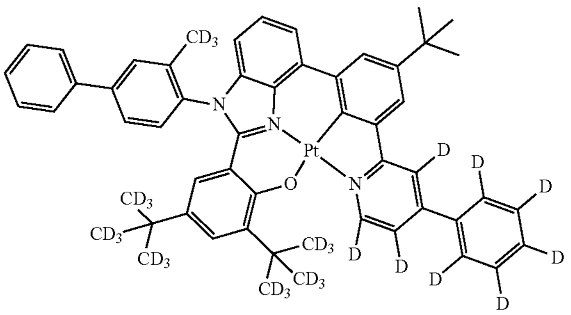

-continued
291
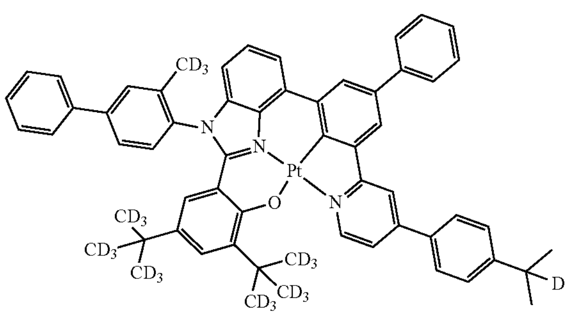
292
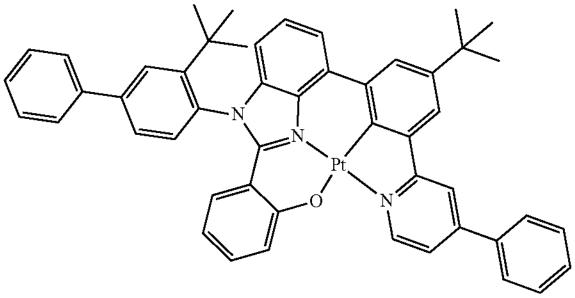
293
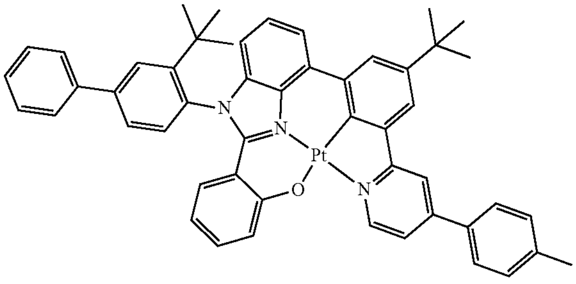
294
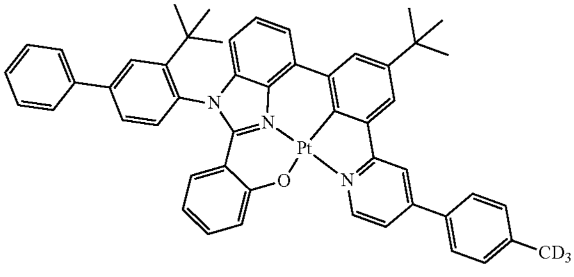
295
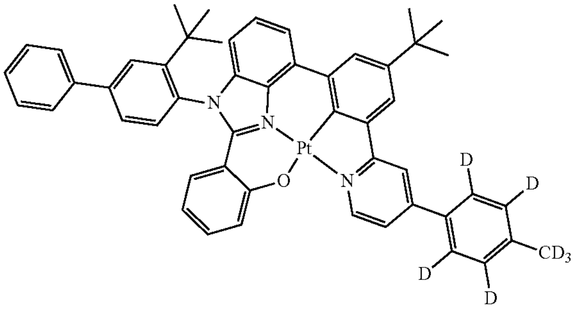
-continued
296
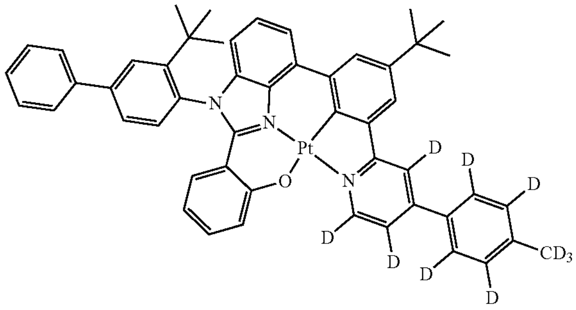
297
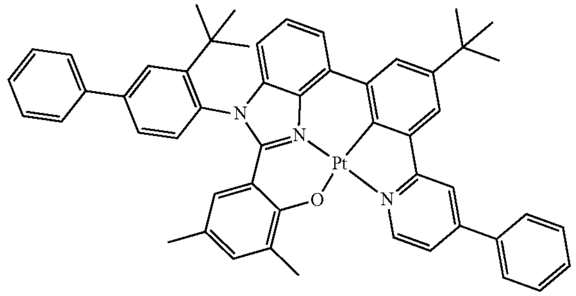
298
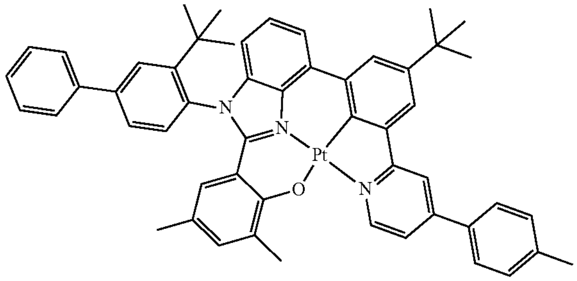
299
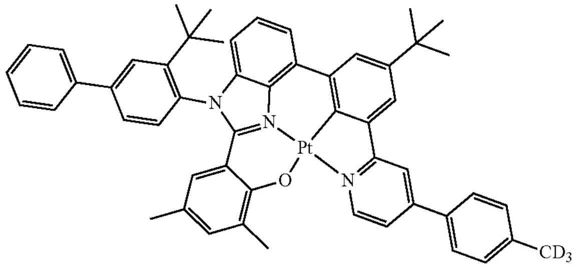
300
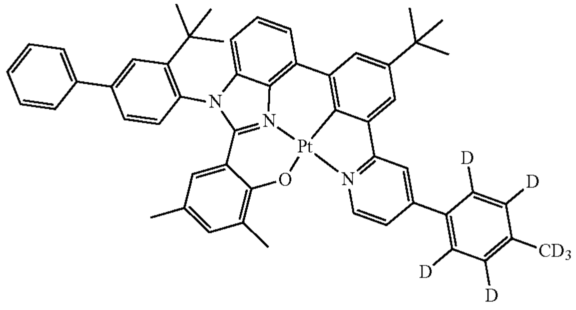

-continued
301
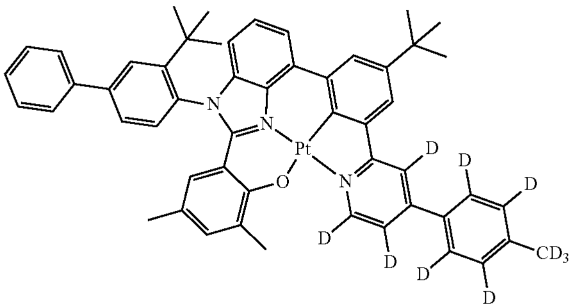
302
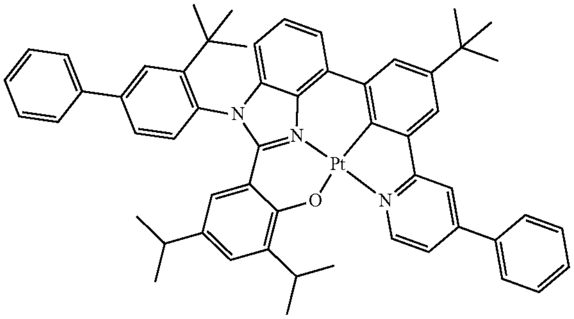
303
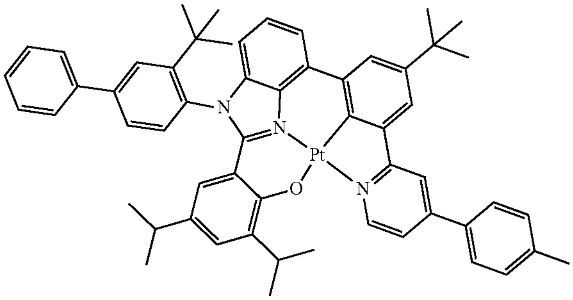
304
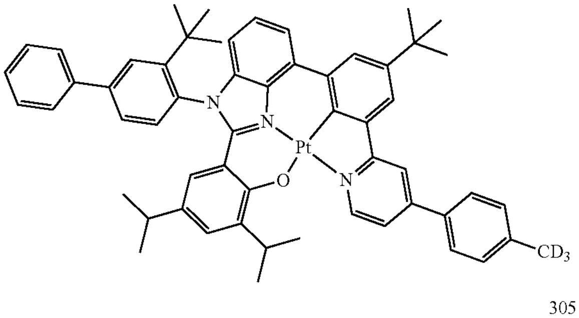
305
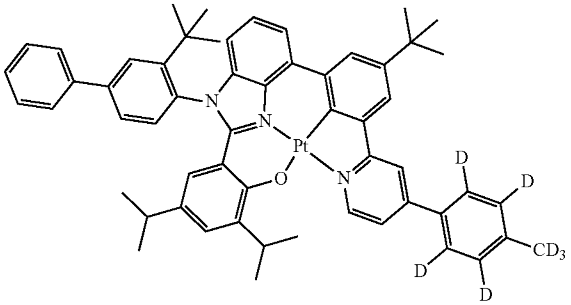
-continued
306
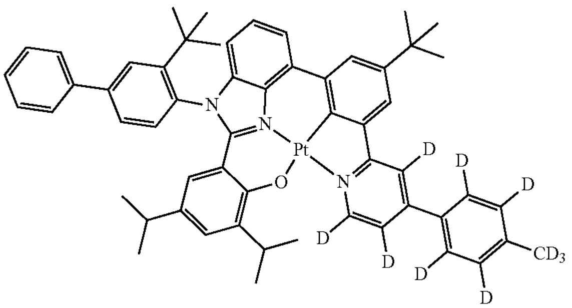
307
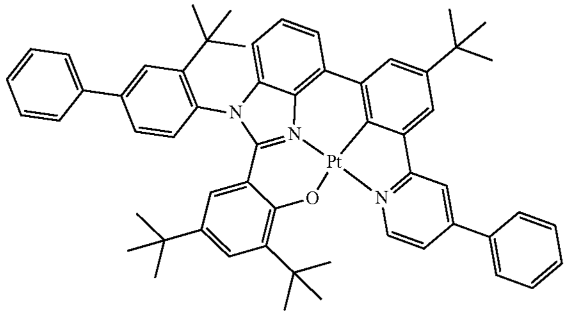
308
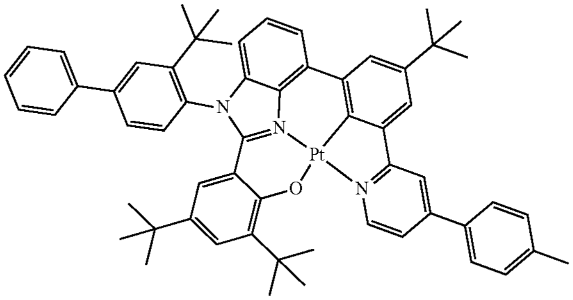
309
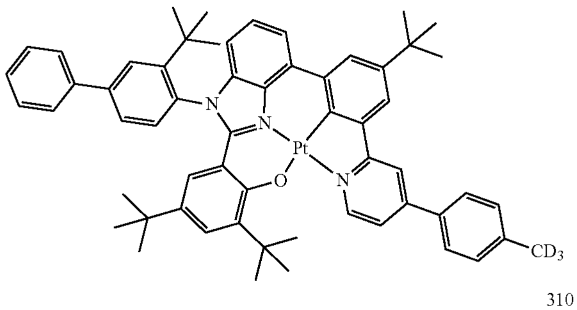
310
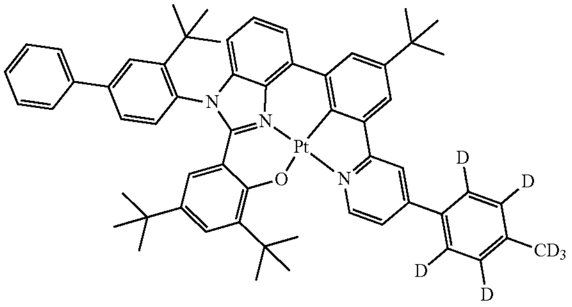

-continued
311
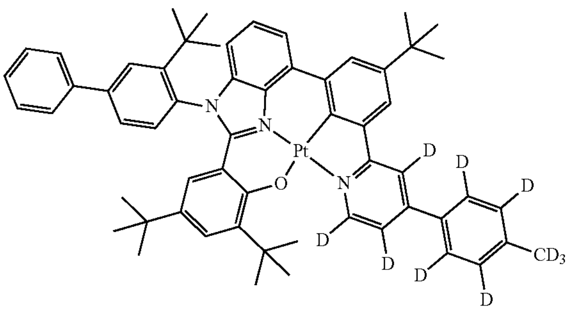
312
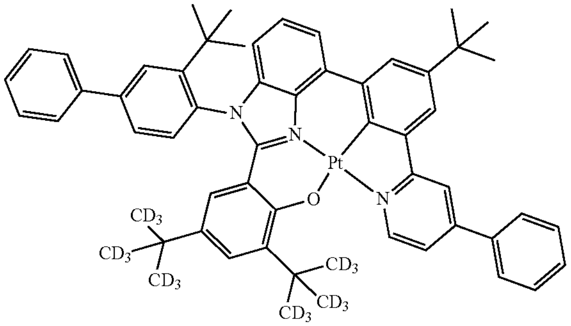
313
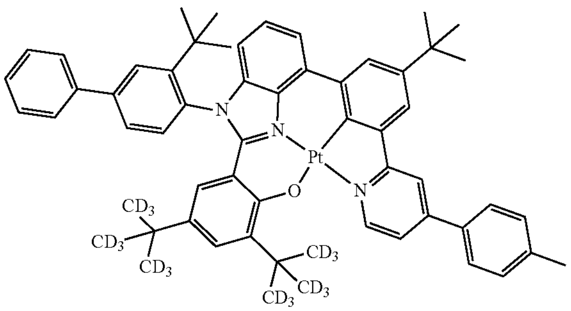
314
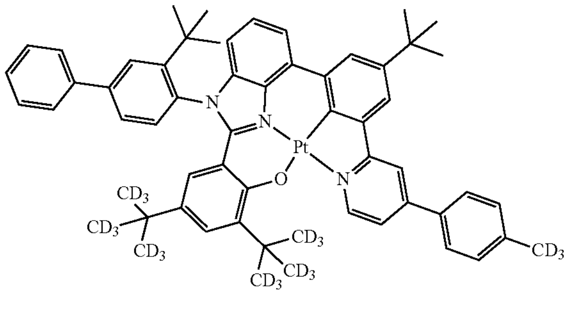
-continued
315
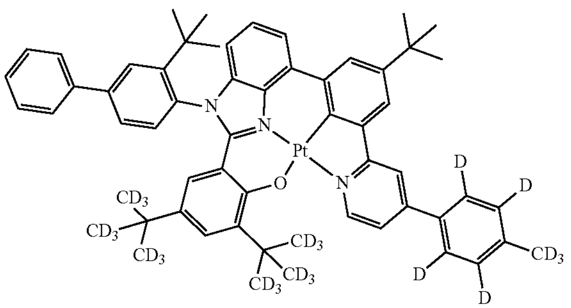
316
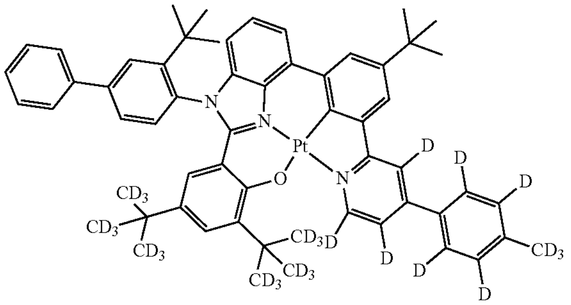
317
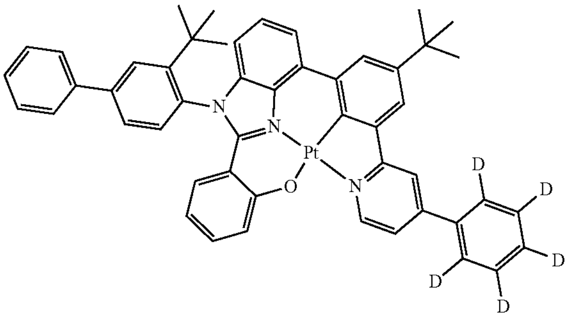
318
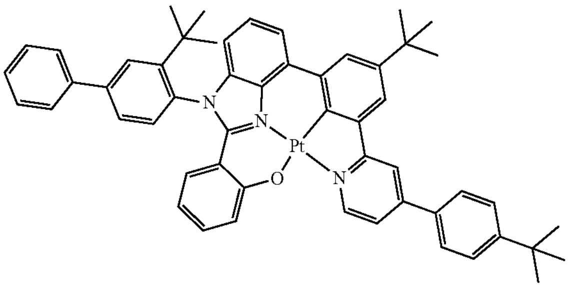
319
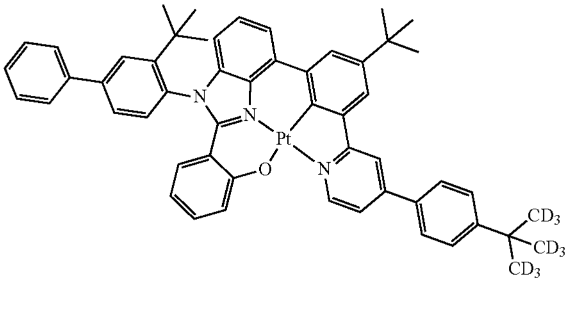

-continued
320
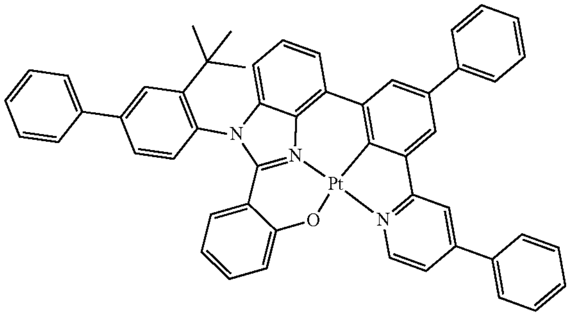
321
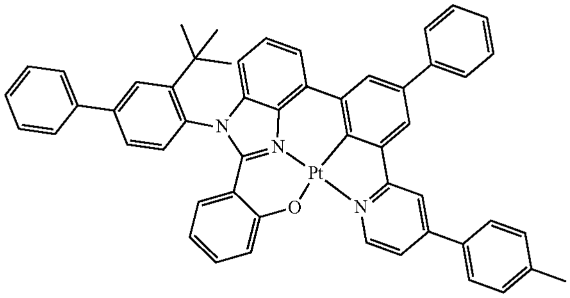
322
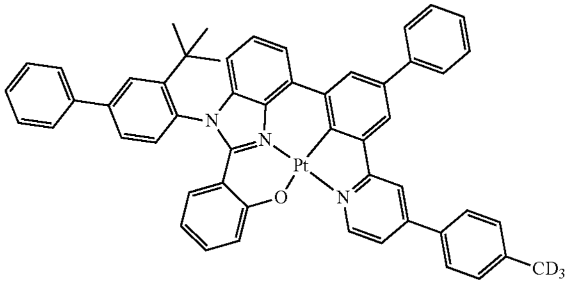
323
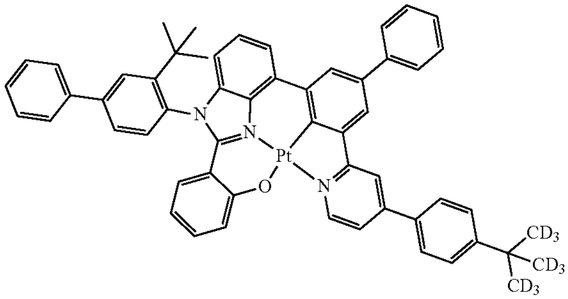
324
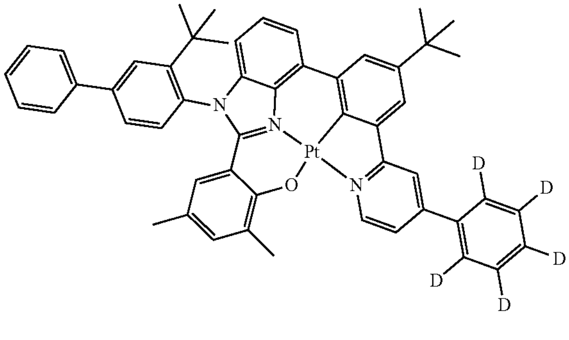
-continued
325
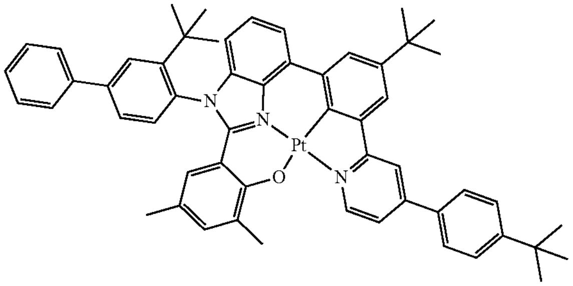
326
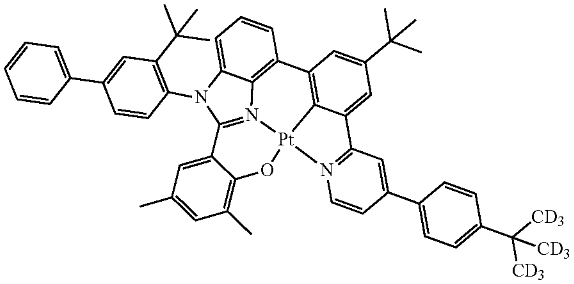
327
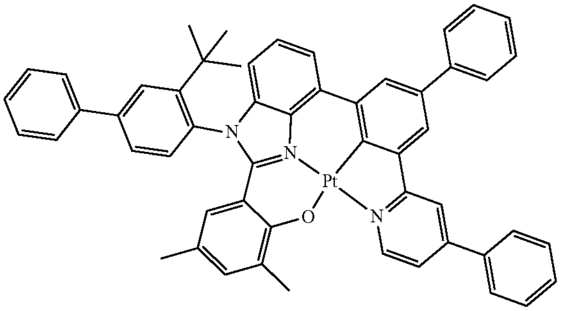
328
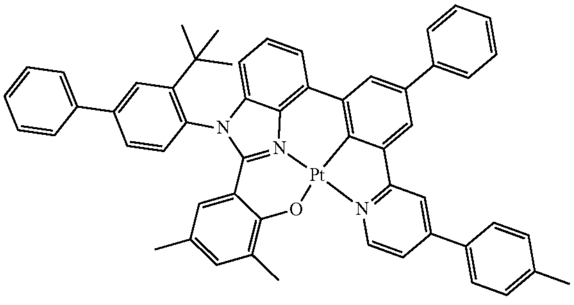
329
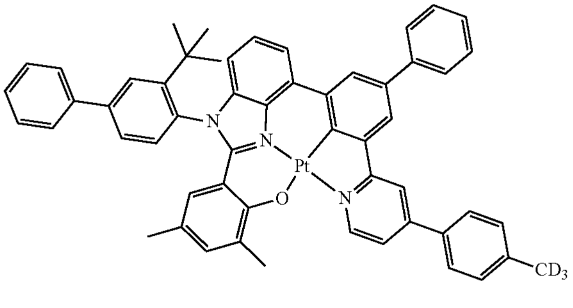

-continued
330
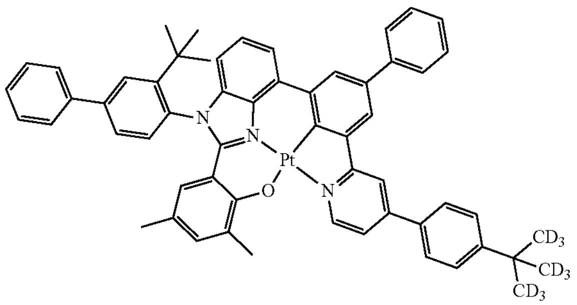
331
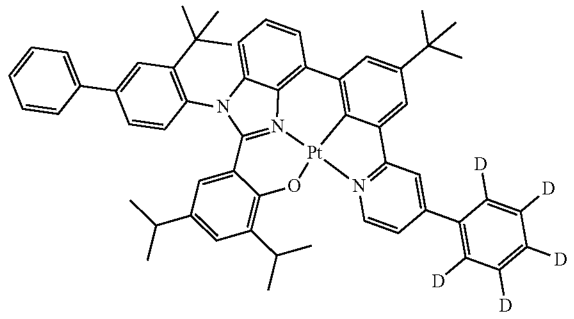
332
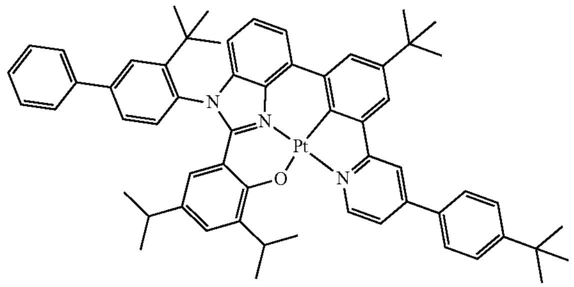
333
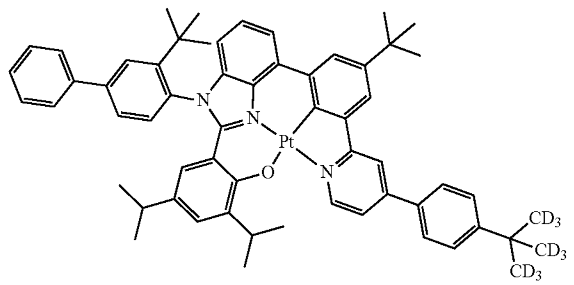
334
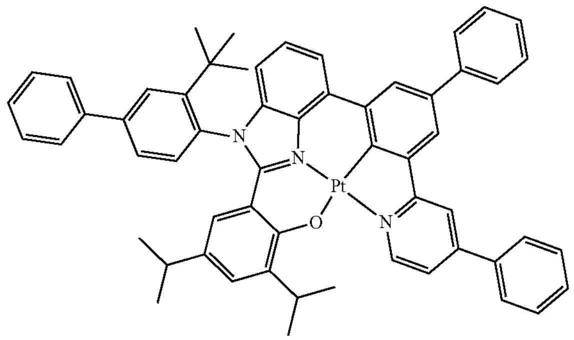
-continued
335
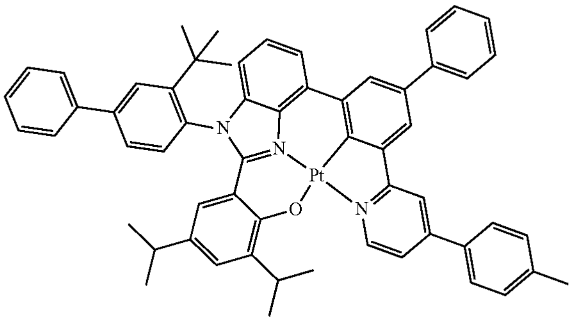
336
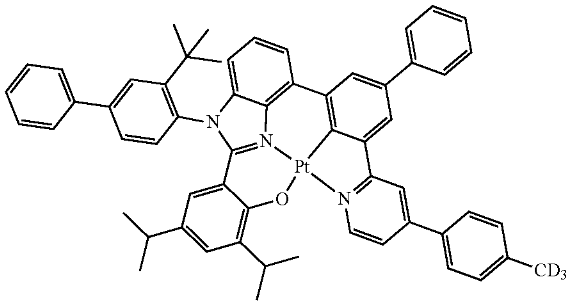
337
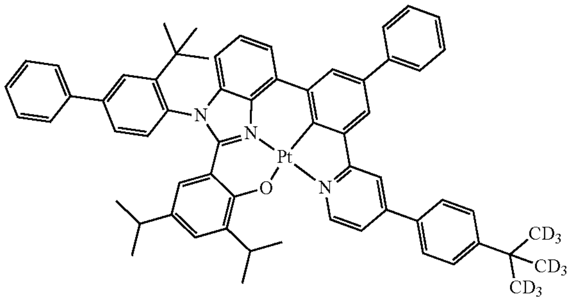
338
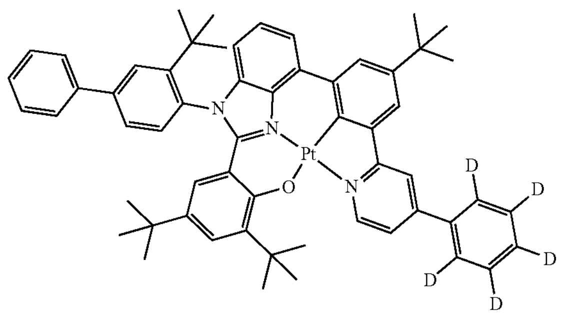
339
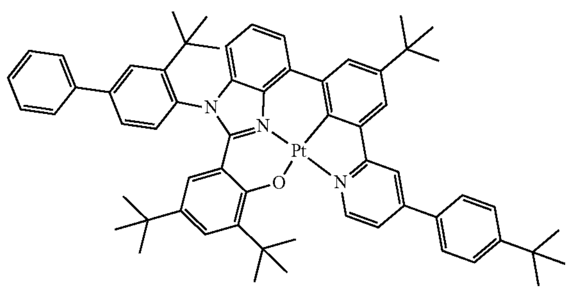

-continued
340
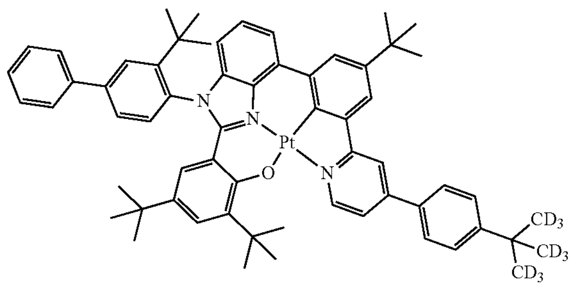
341
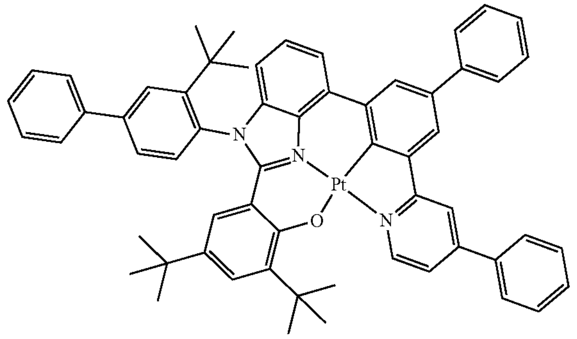
342
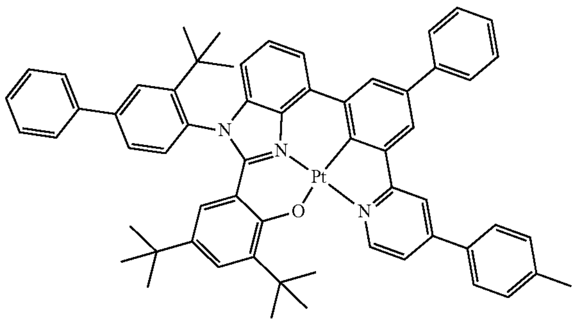
343
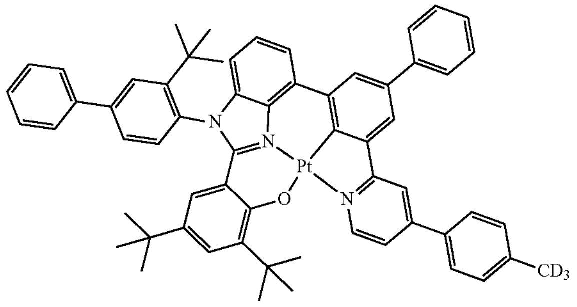
-continued
344
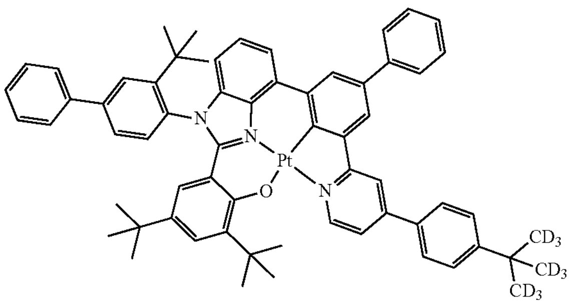
345
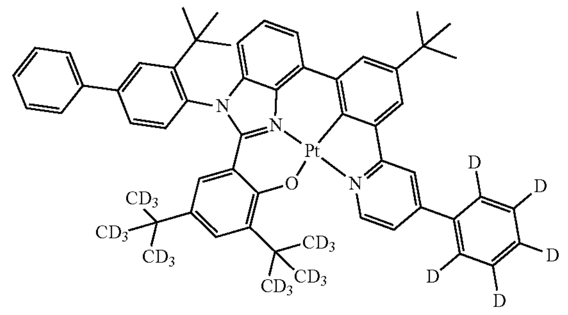
346
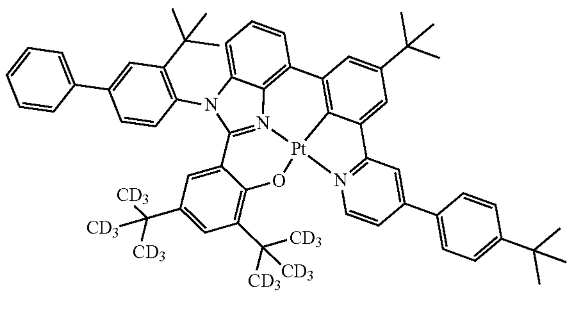
347
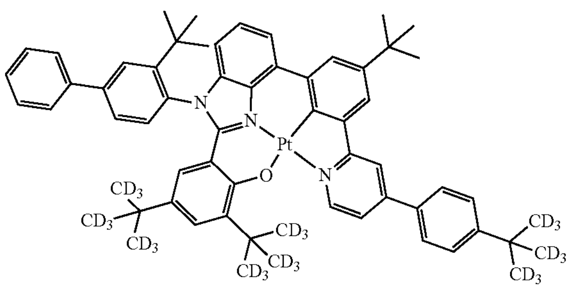

-continued
348
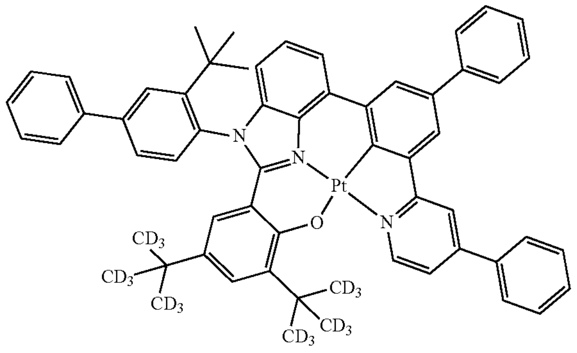
349
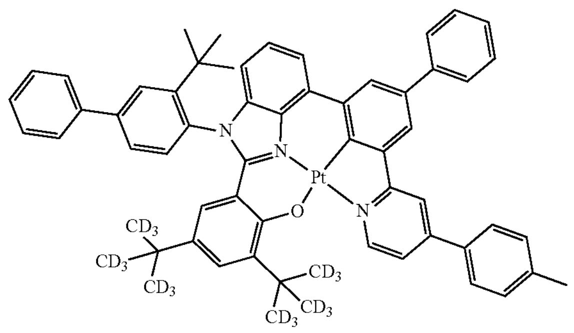
350
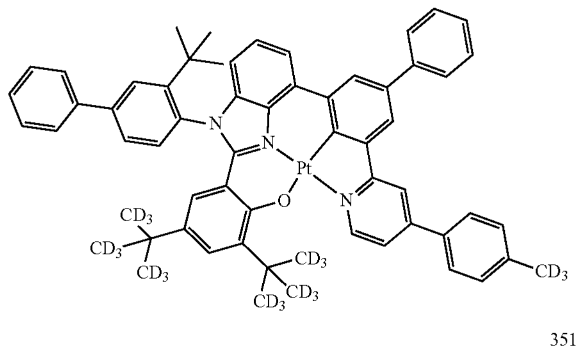
351
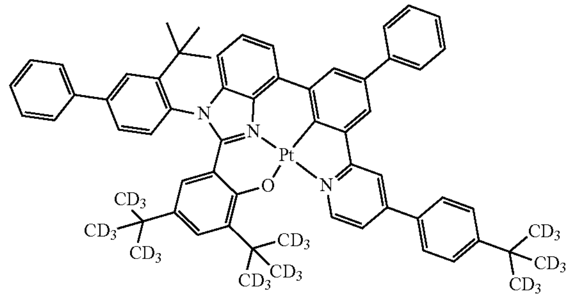
-continued
352
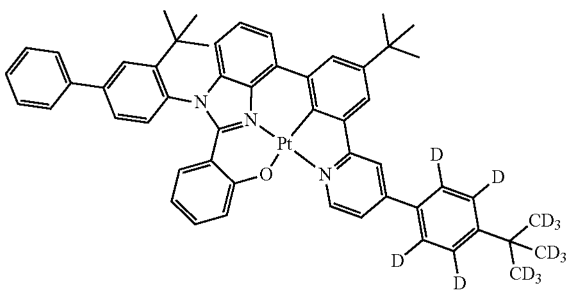
353
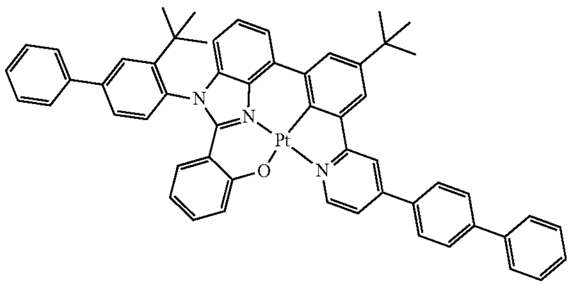
354
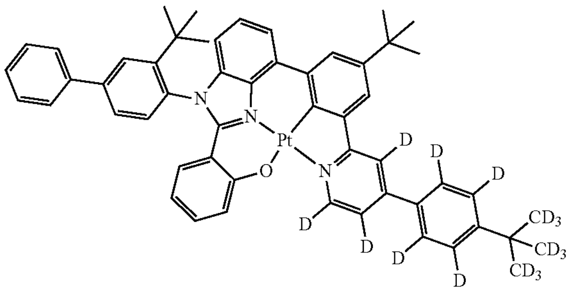
355
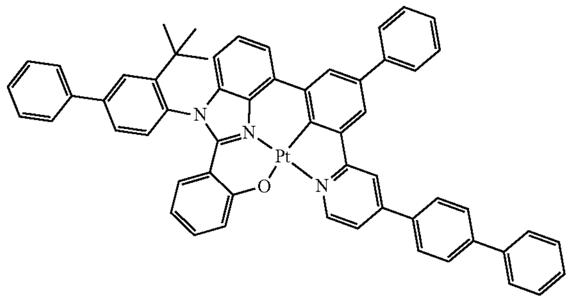
356
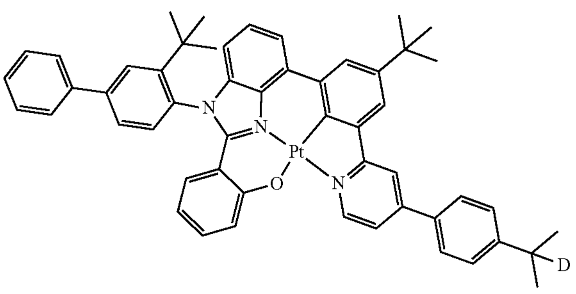

-continued
357
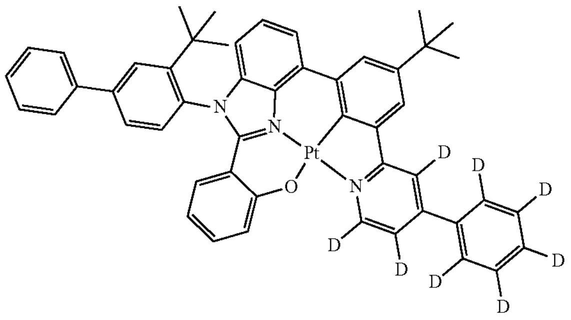
358
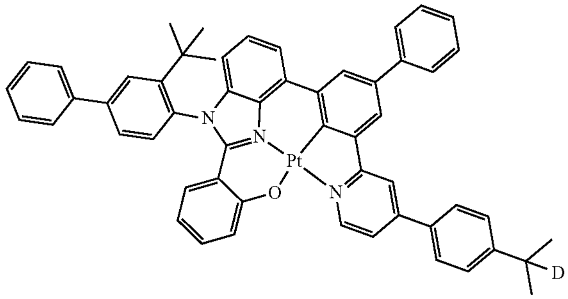
359
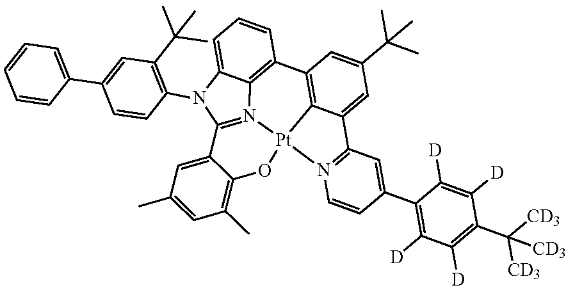
360
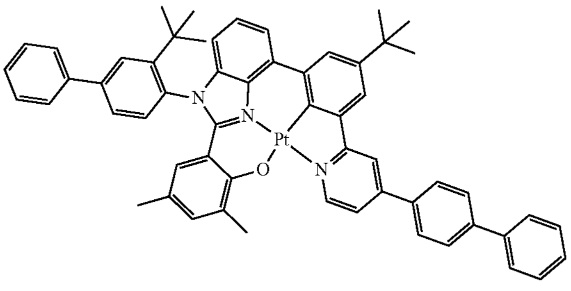
361
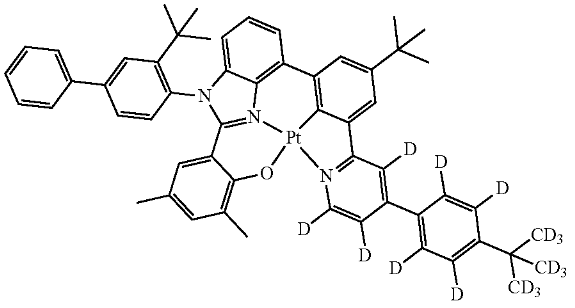
362
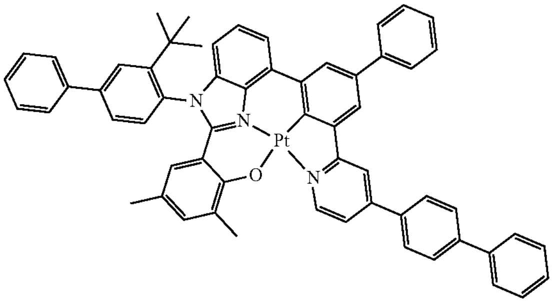
363
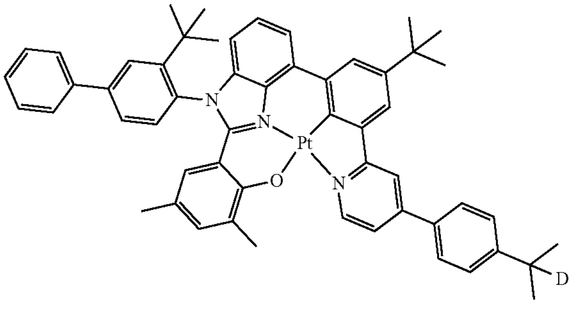
364
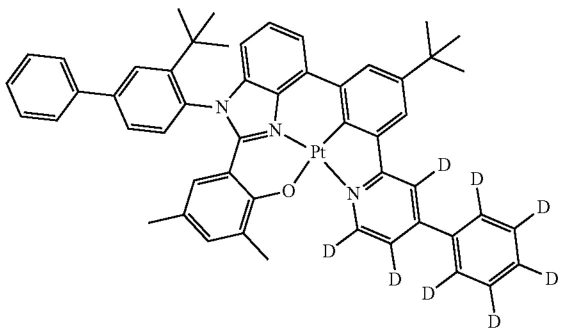

-continued
365
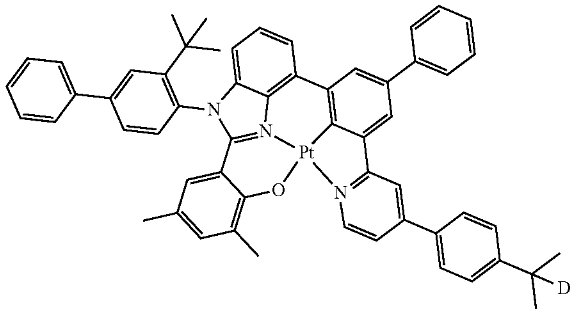
366
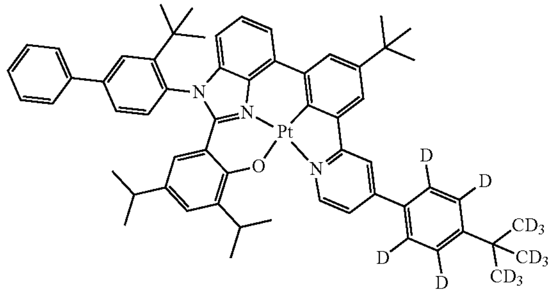
367
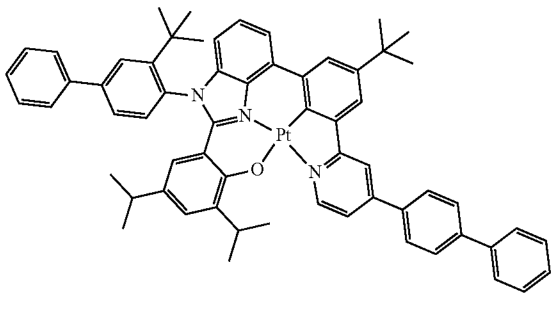
368
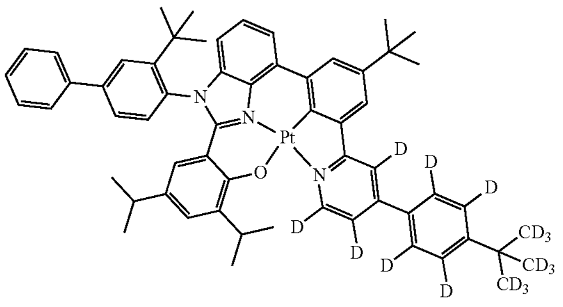
369
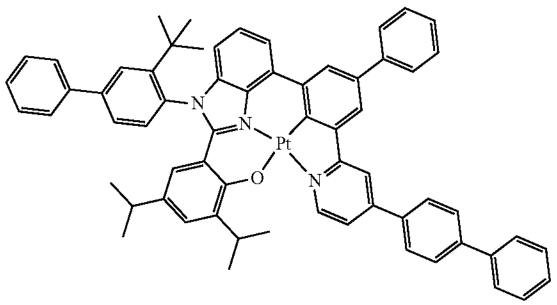
-continued
370
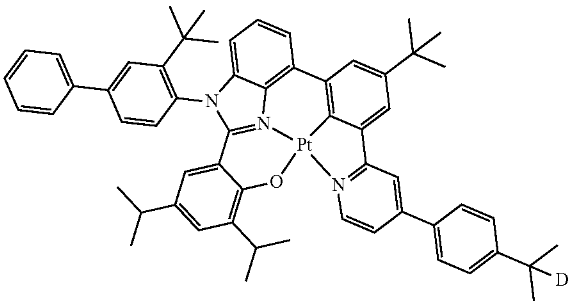
371
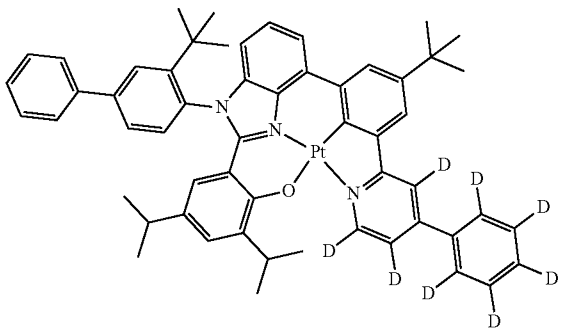
372
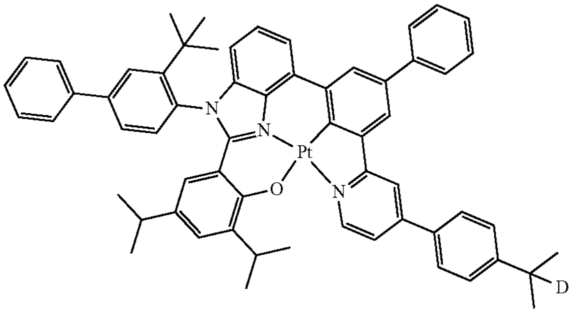
373
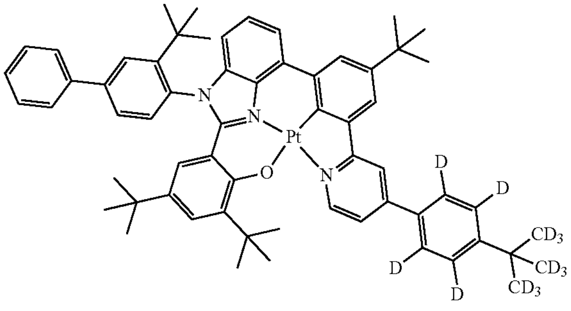

374
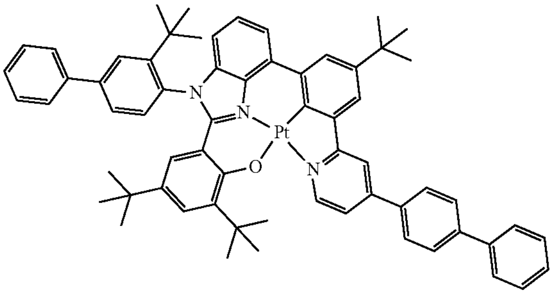
375
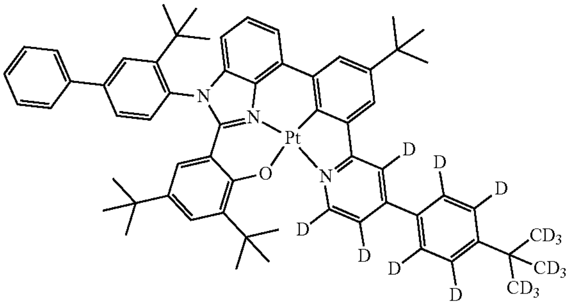
376
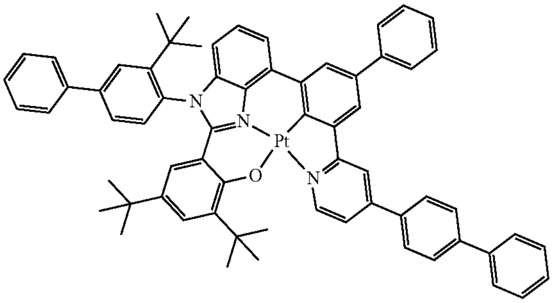
377
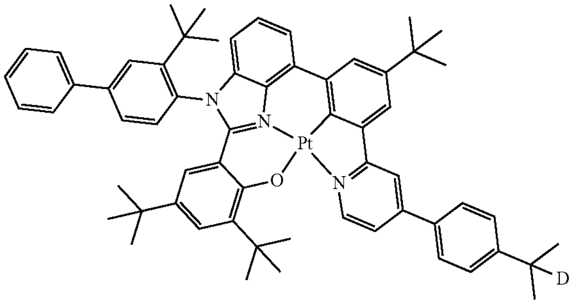
378
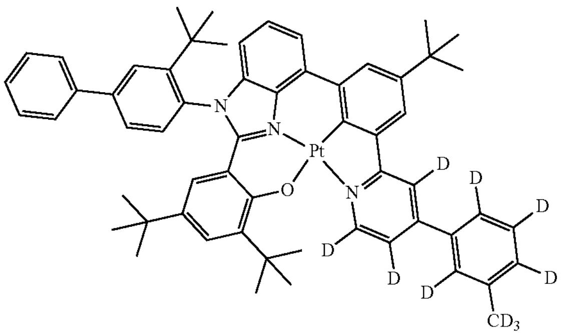
379
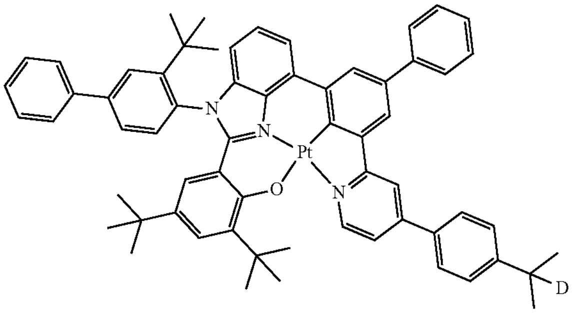
380
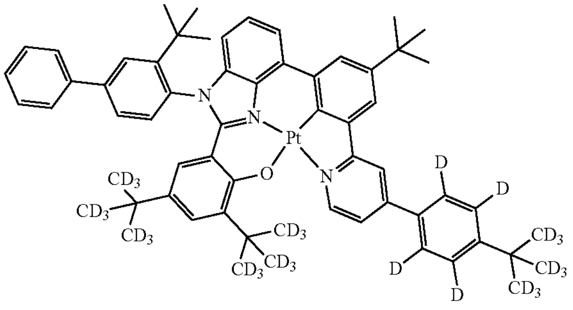
381
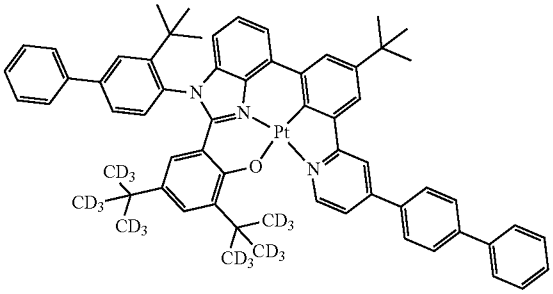

-continued
382
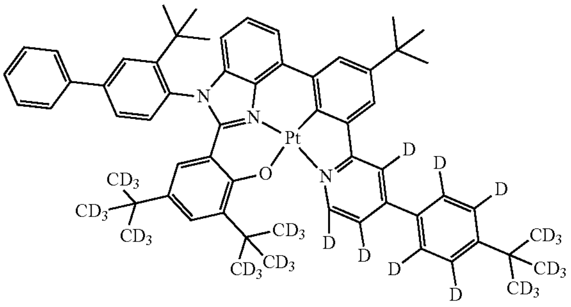
383
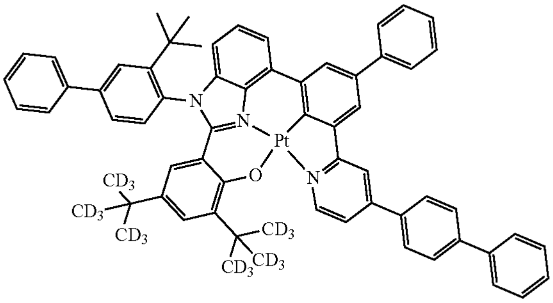
384
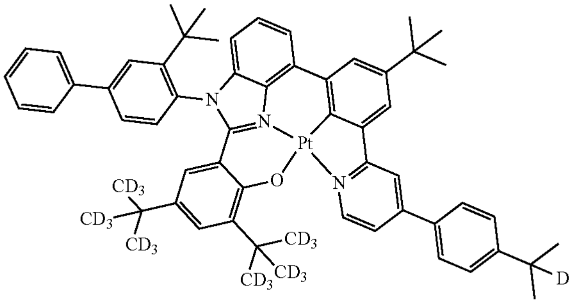
385
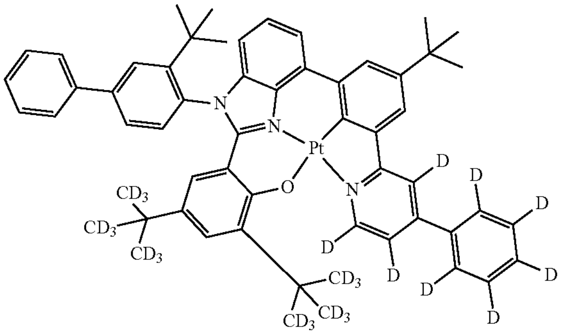
-continued
386
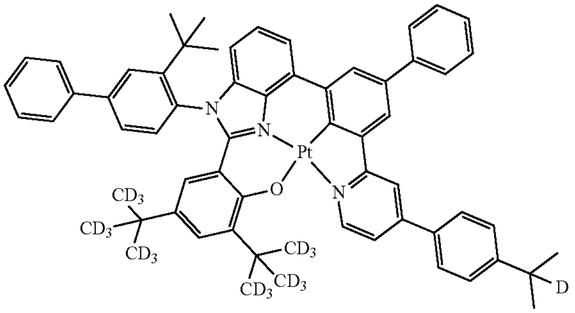
387
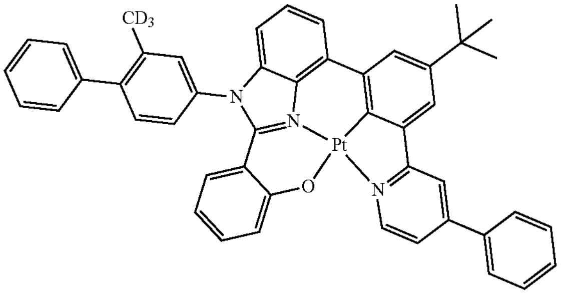
388
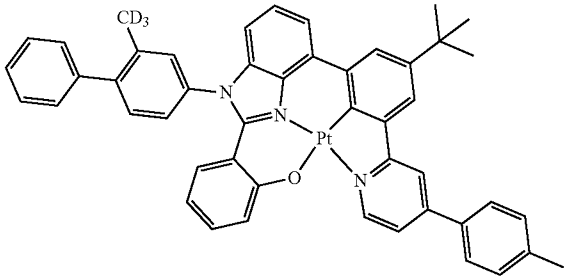
389
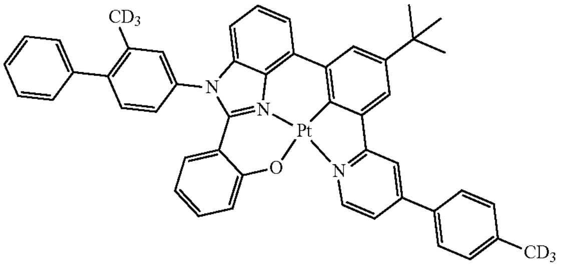
390
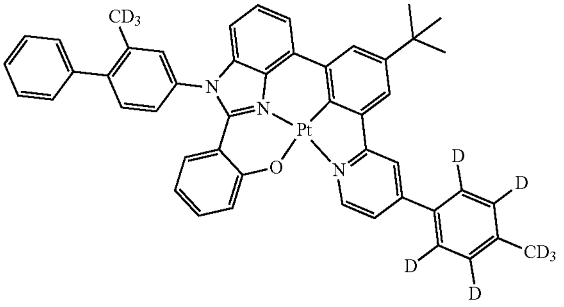

-continued
391
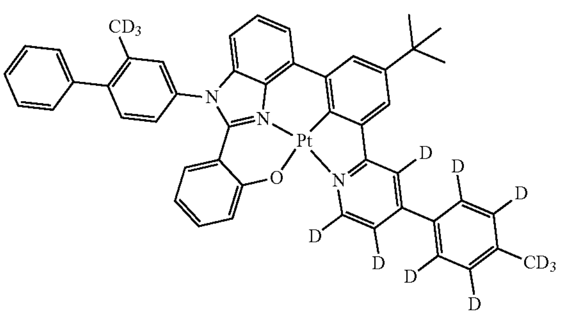
392
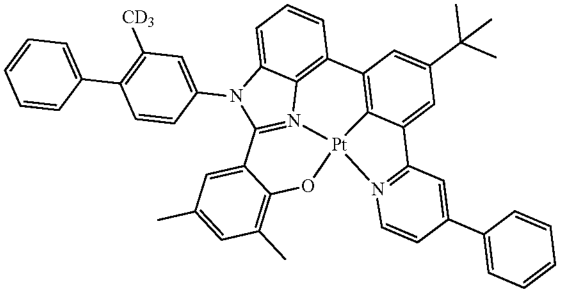
393
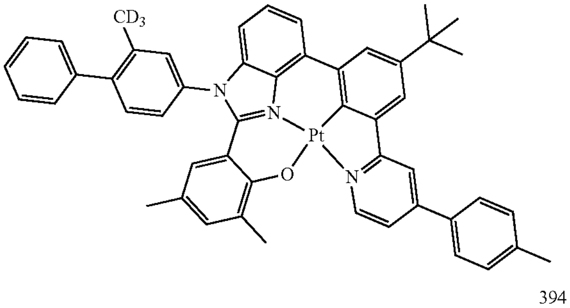
394
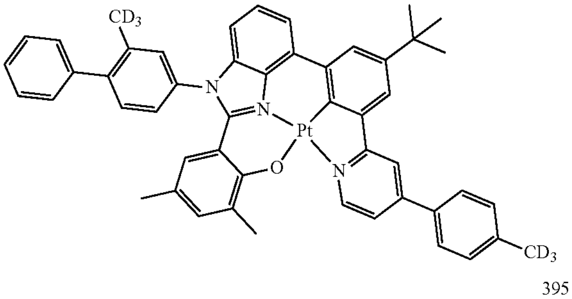
395
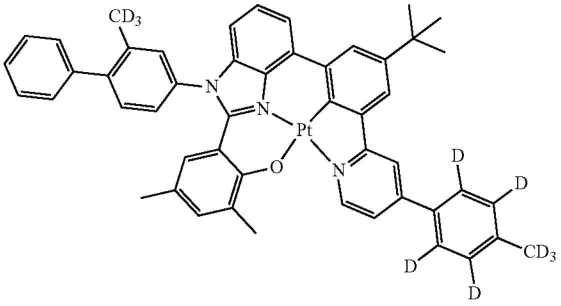
-continued
396
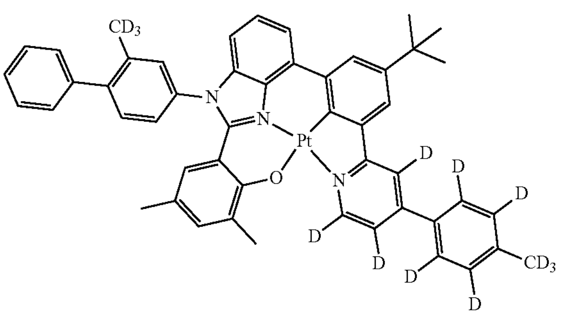
397
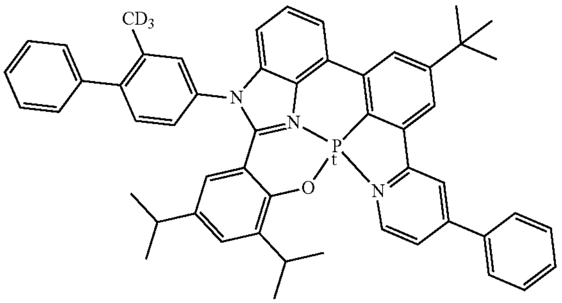
398
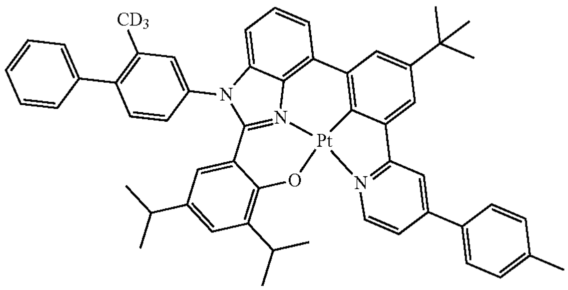
399
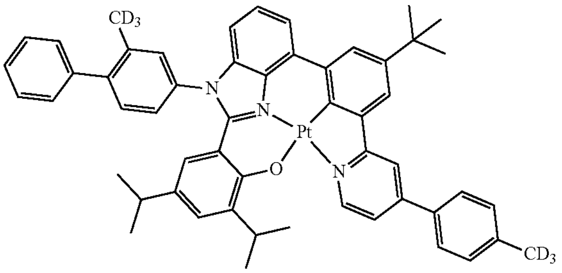
400
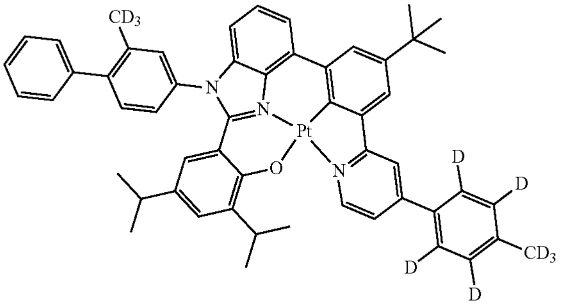

-continued
401
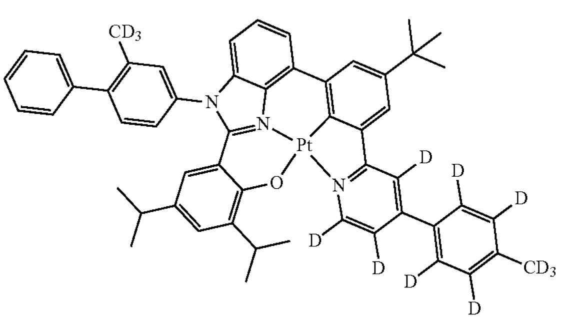
402
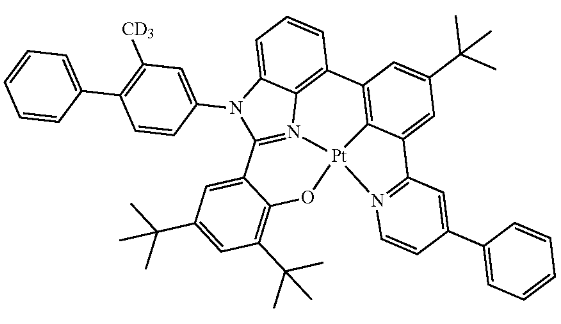
403
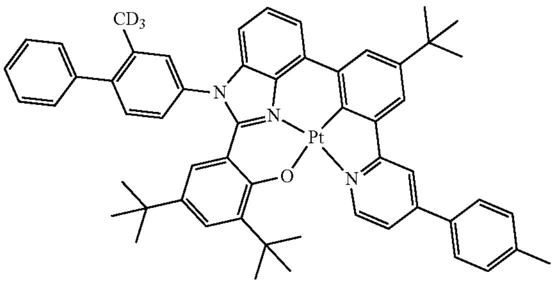
404
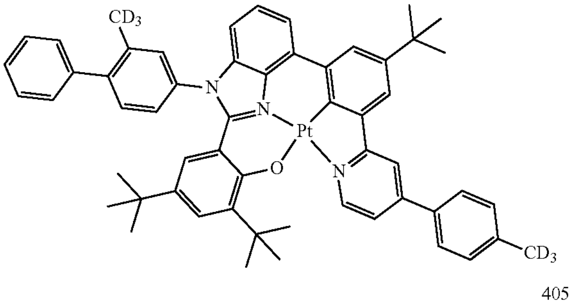
405
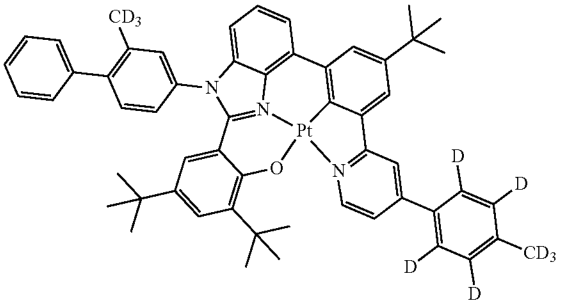
-continued
406
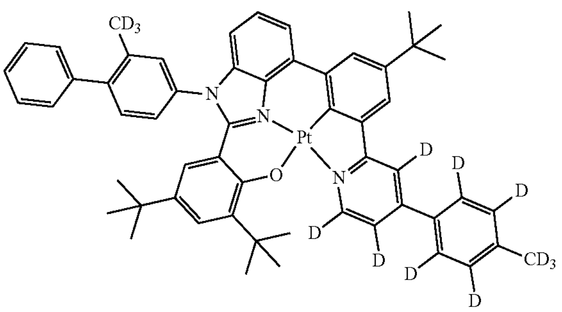
407
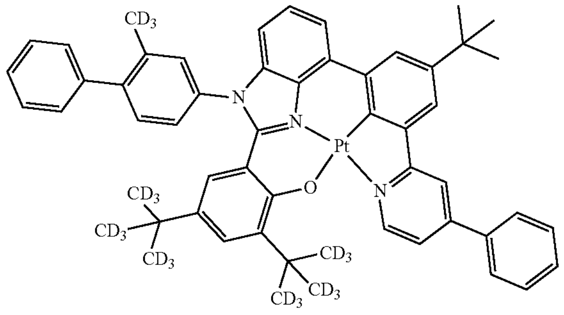
408
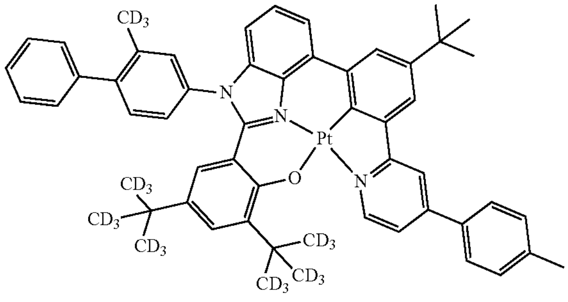
409
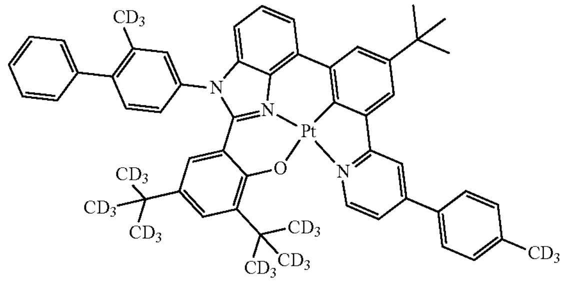
410
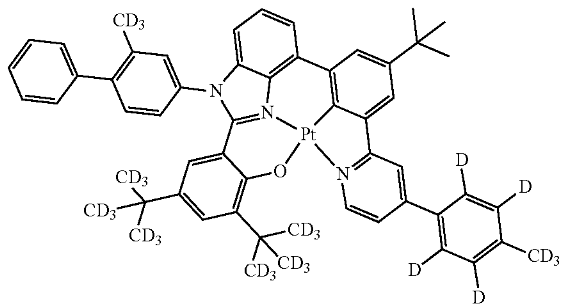

-continued
411
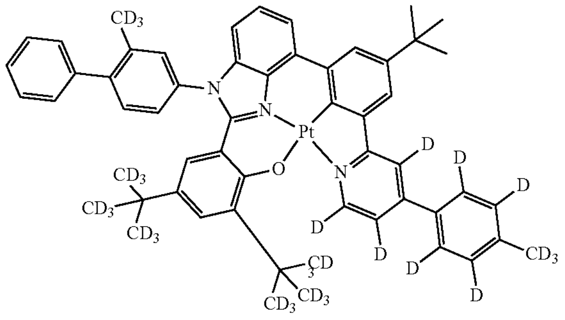
412
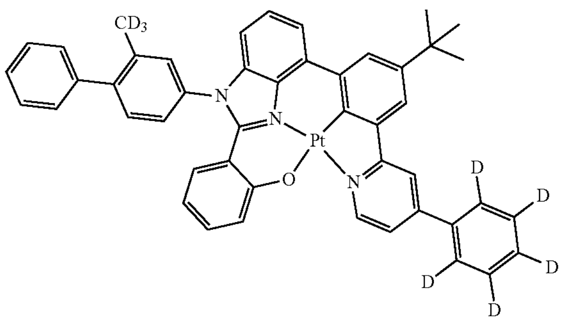
413
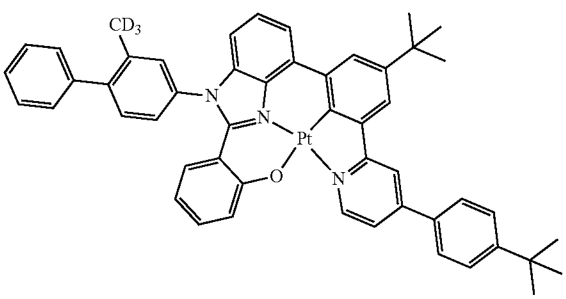
414
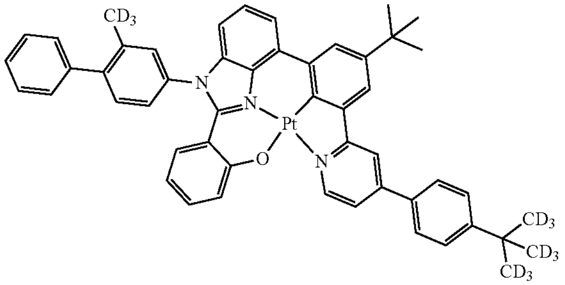
415
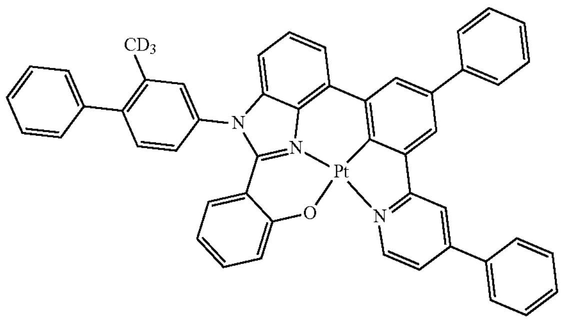
-continued
416
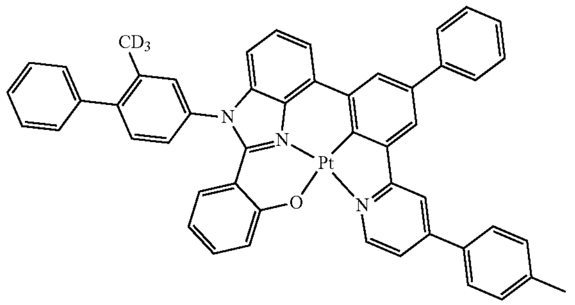
417
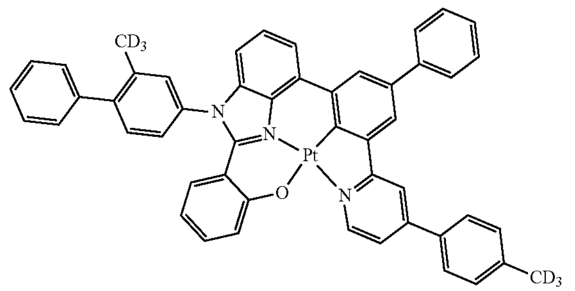
418
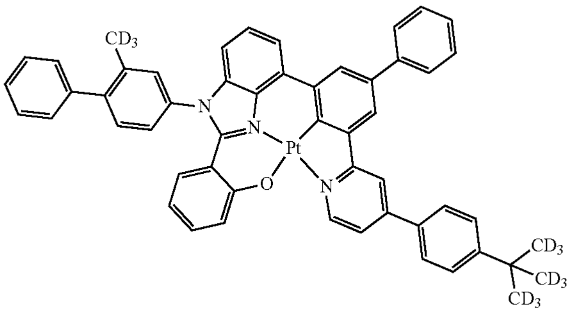
419
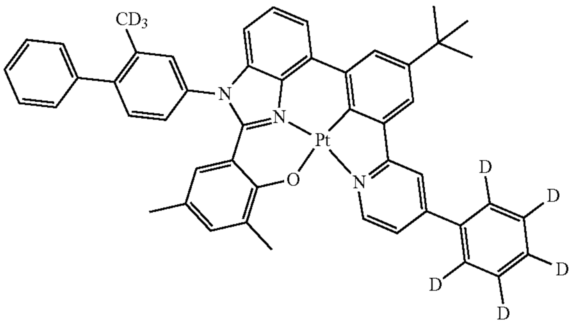
420
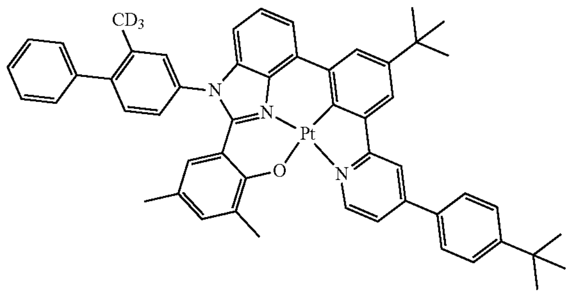

-continued
421
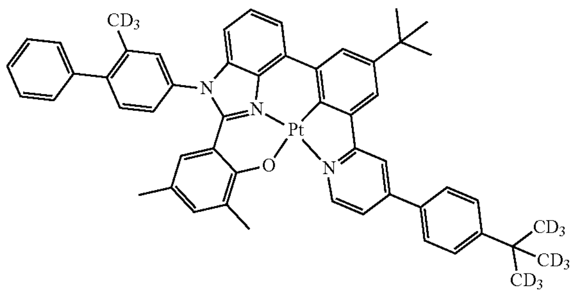
422
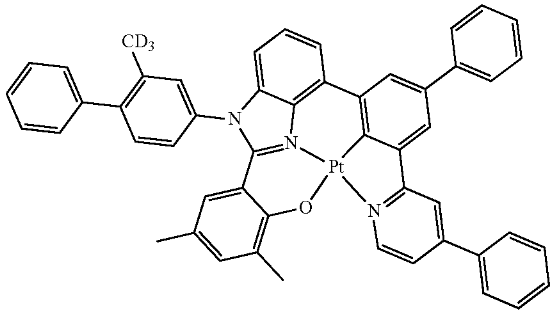
423
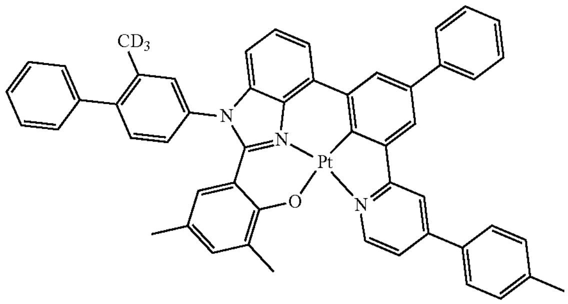
424
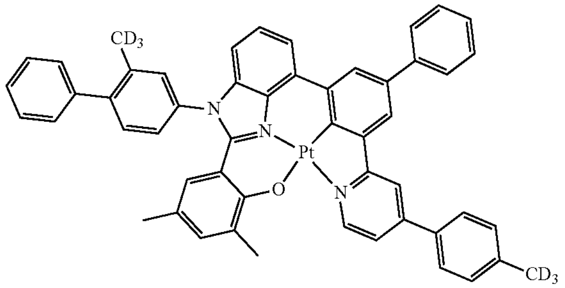
425
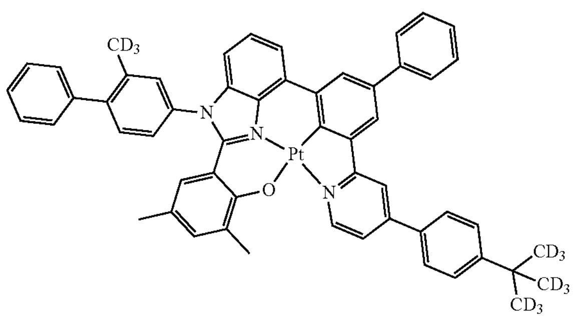
-continued
426
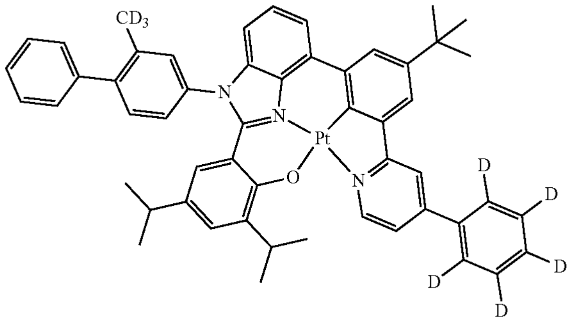
427
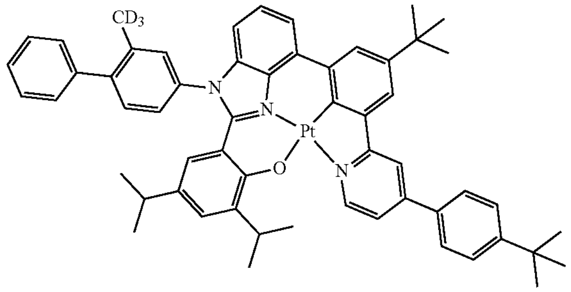
428
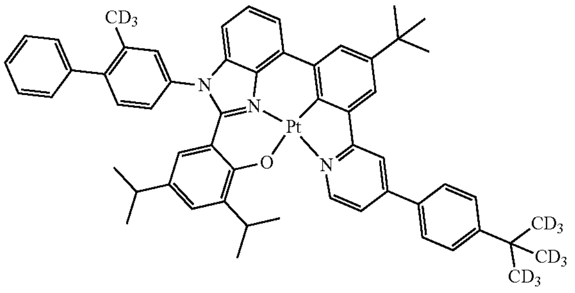
429
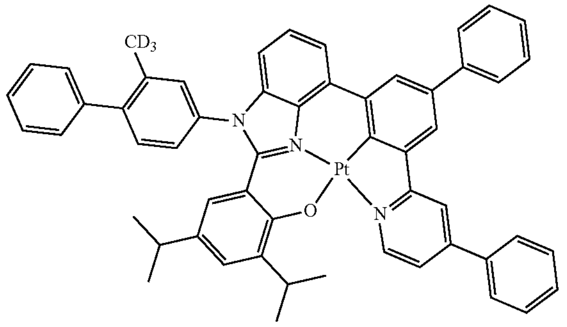

-continued
430
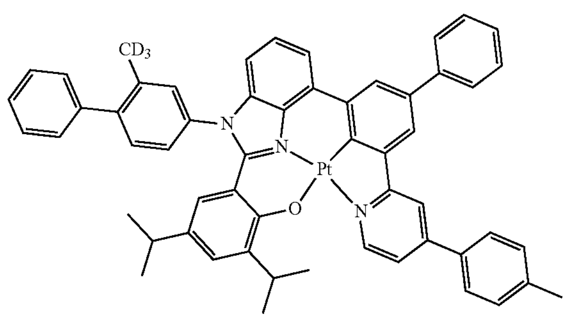
431
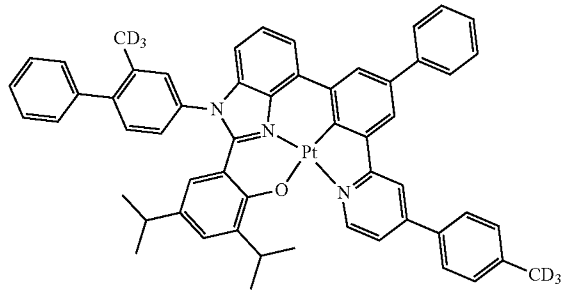
432
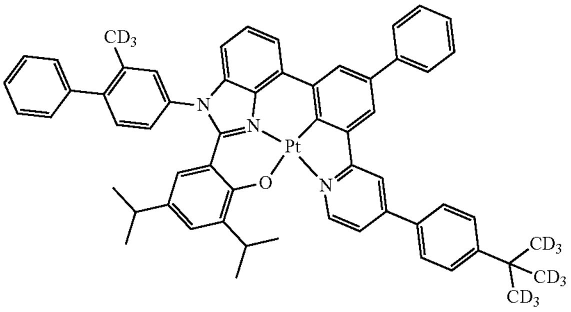
433
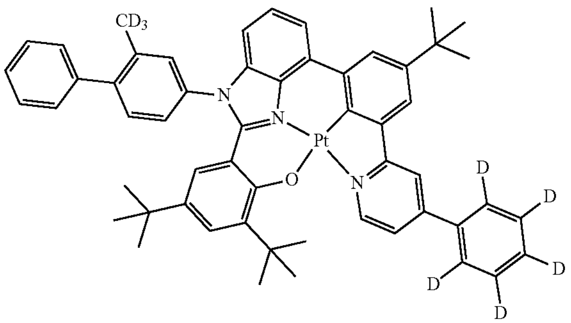
434
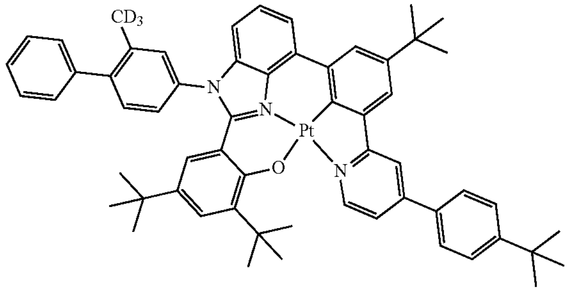
-continued
435
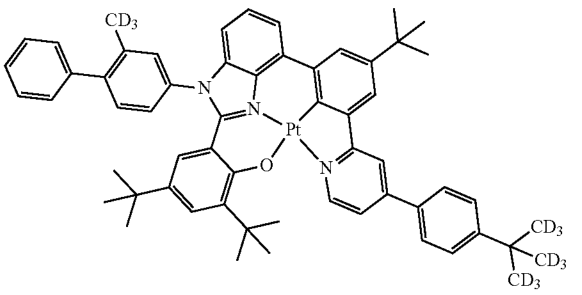
436
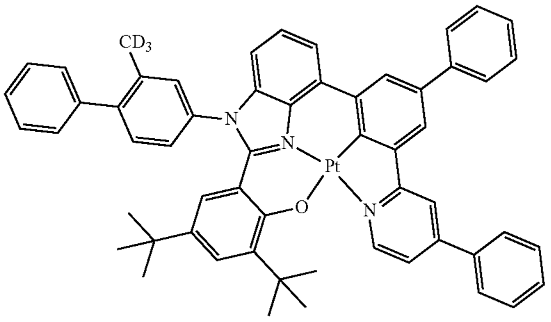
437
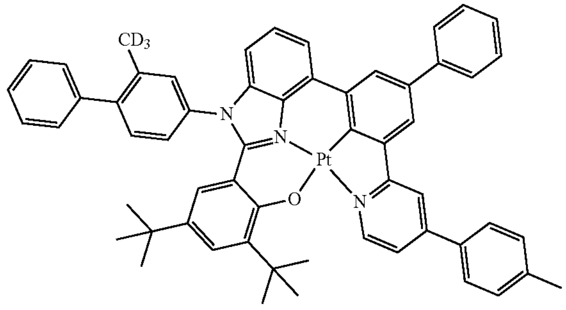
438
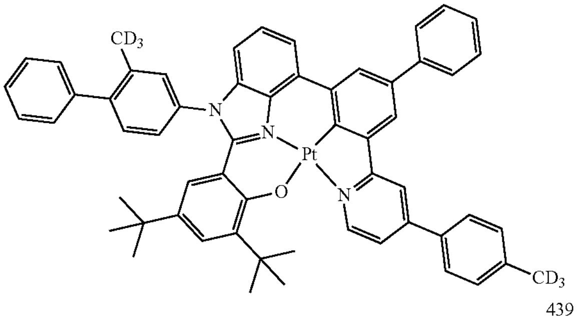
439
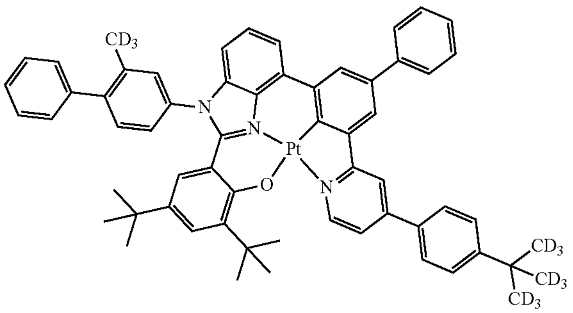

-continued
440
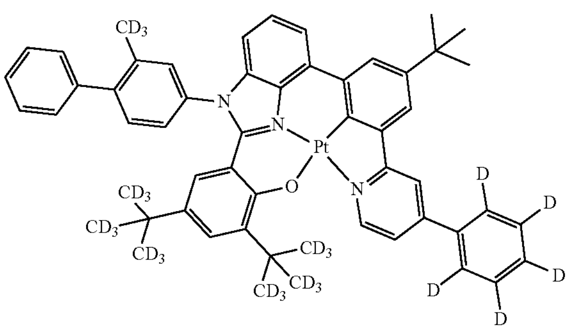
441
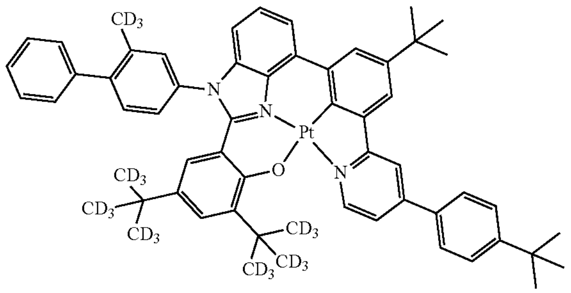
442
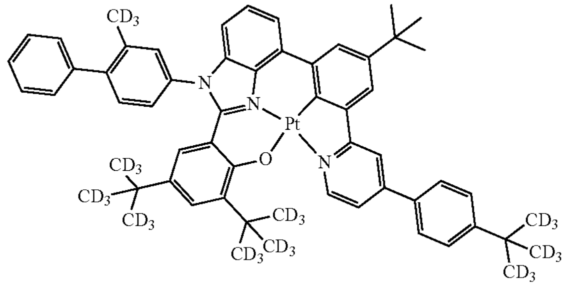
443
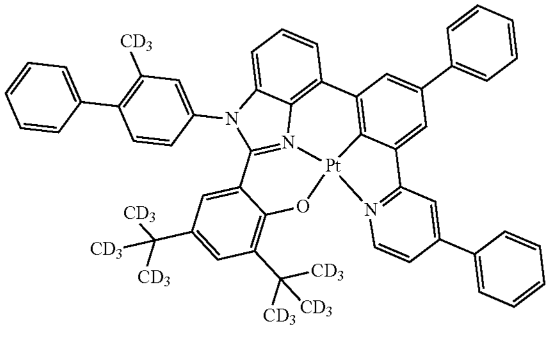
-continued
444
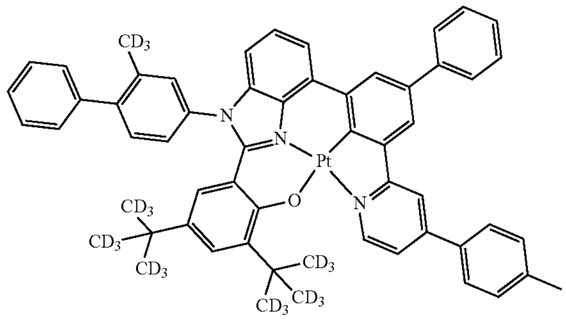
445
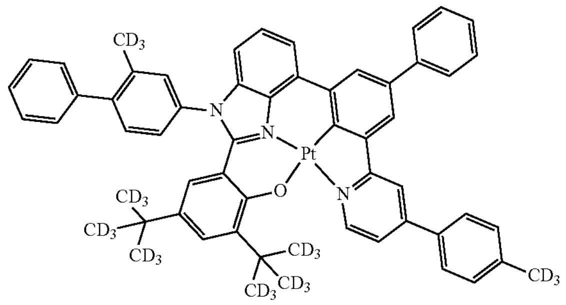
446
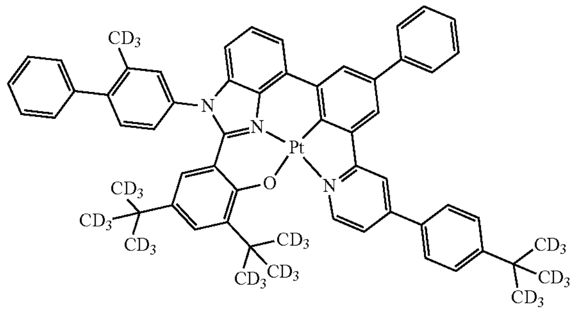
447
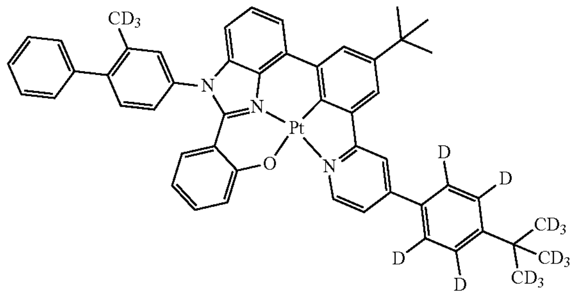
448
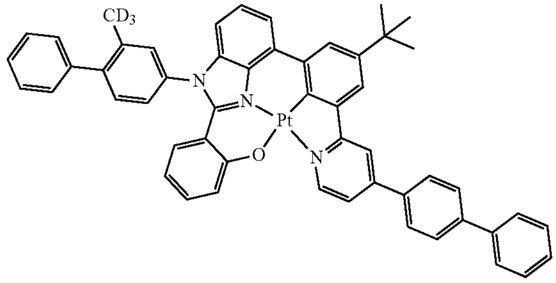

-continued
449
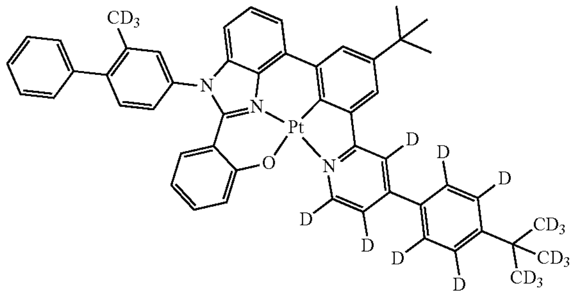
450
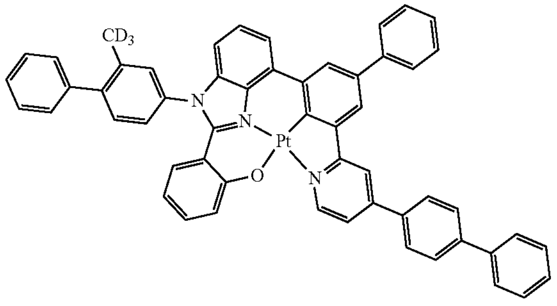
451
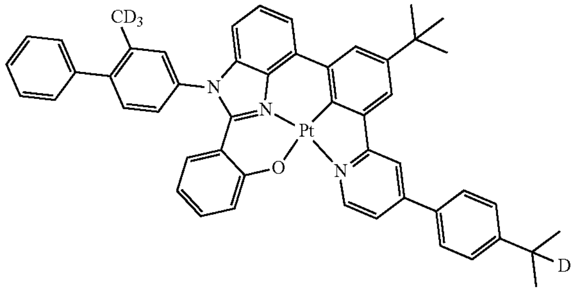
452
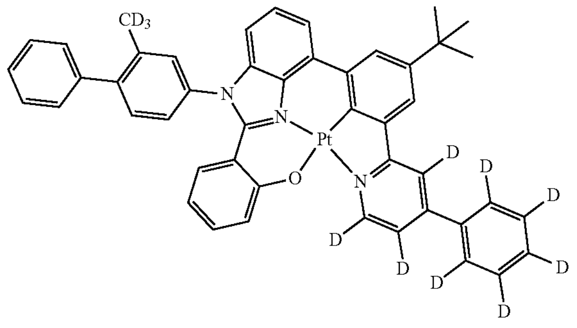
453
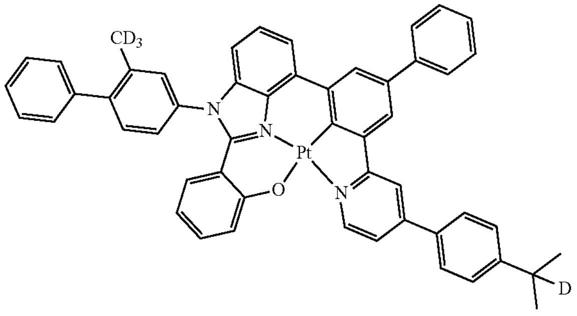
-continued
454
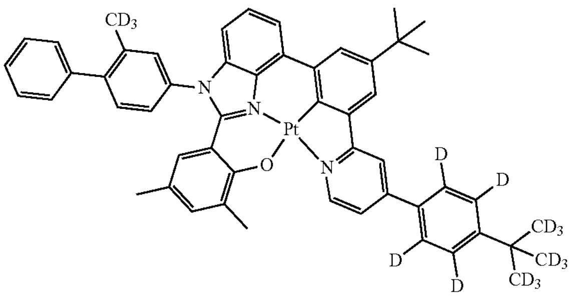
455
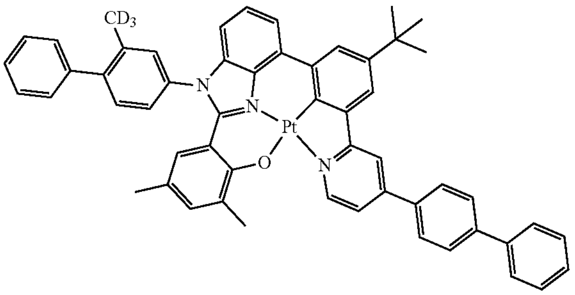
456
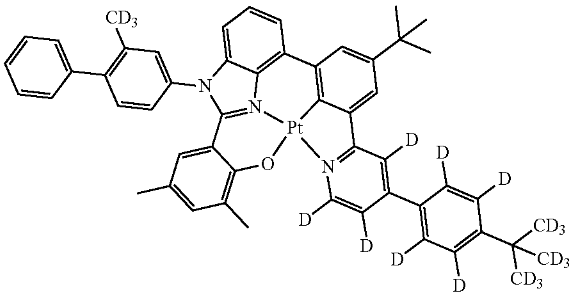
457
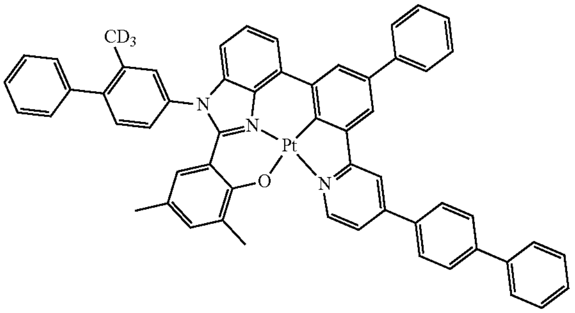
458
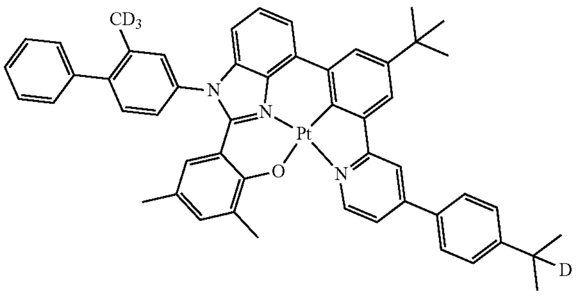

-continued
459
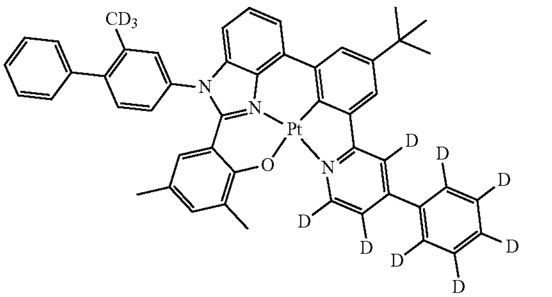
460
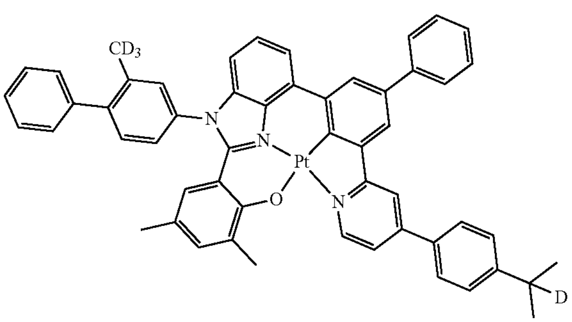
461
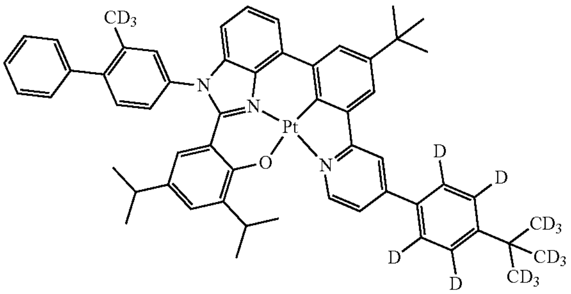
462
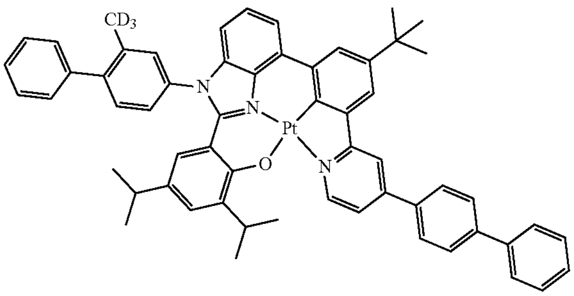
463
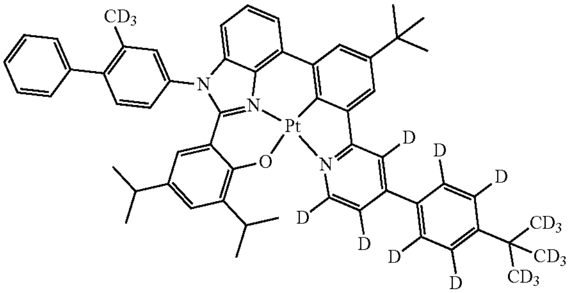
-continued
464
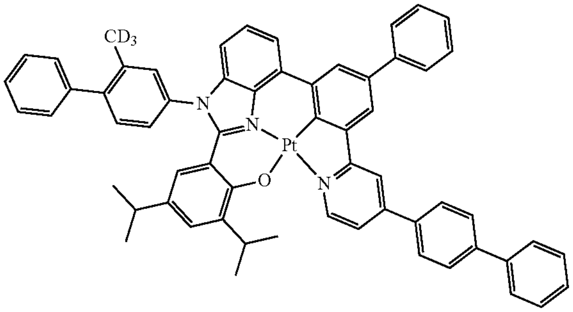
465
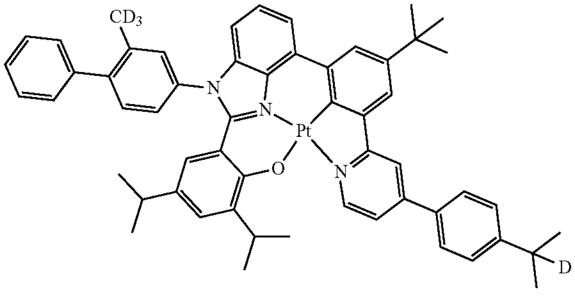
466
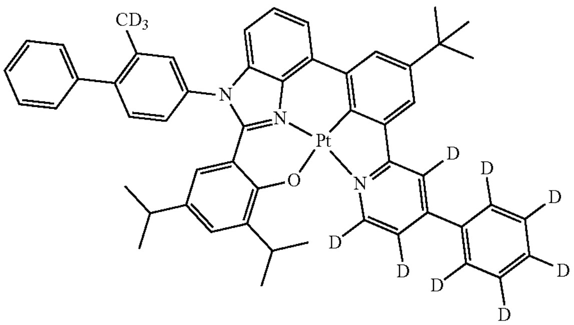
467
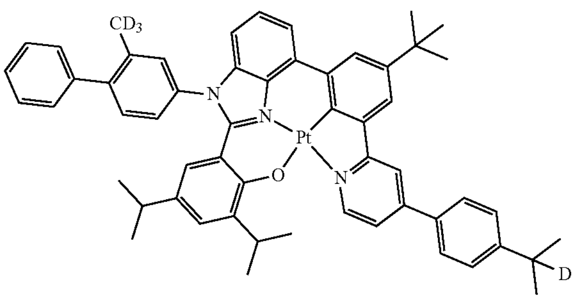
468
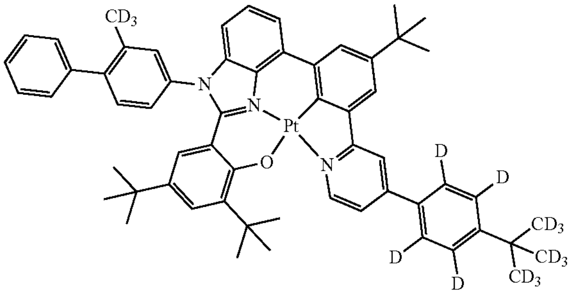

-continued
469
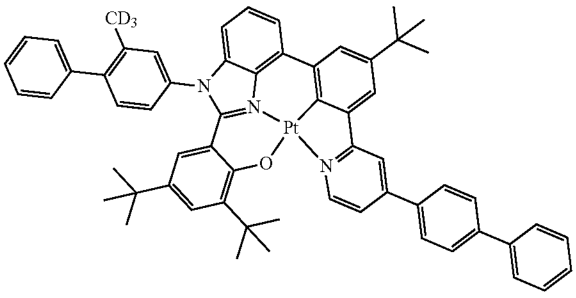
470
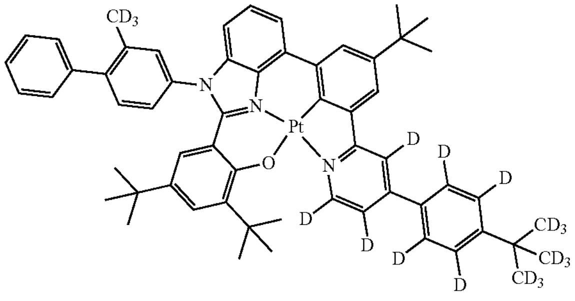
471
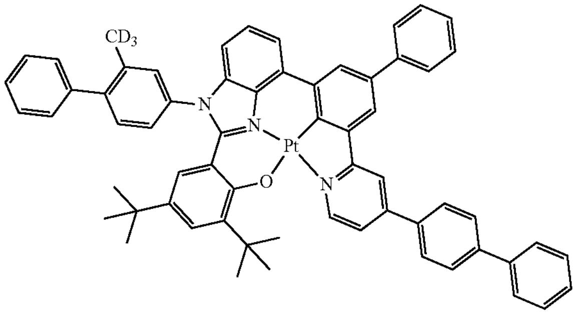
472
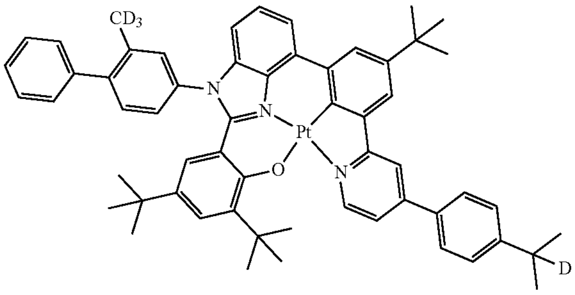
473
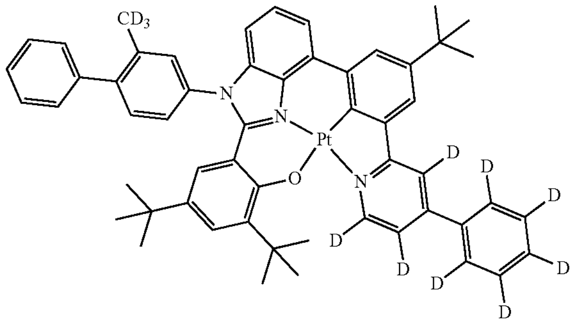
-continued
474
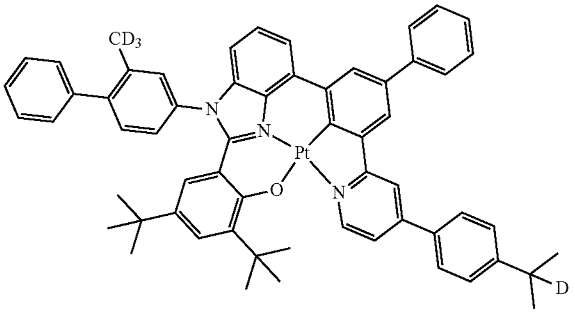
475
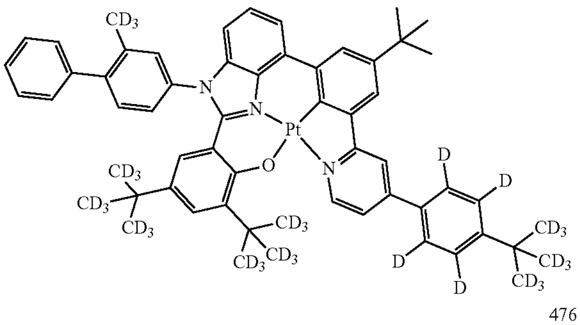
476
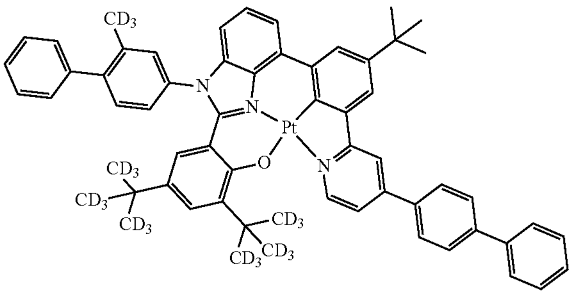
477
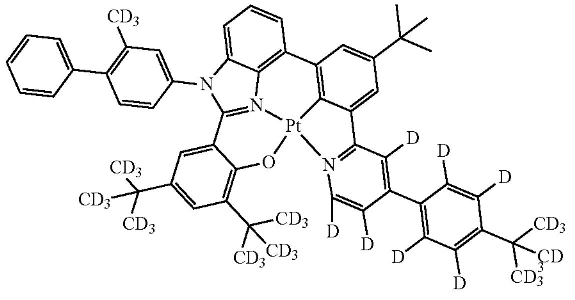
478
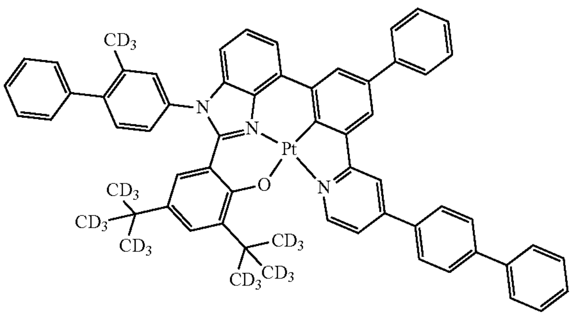

-continued
479
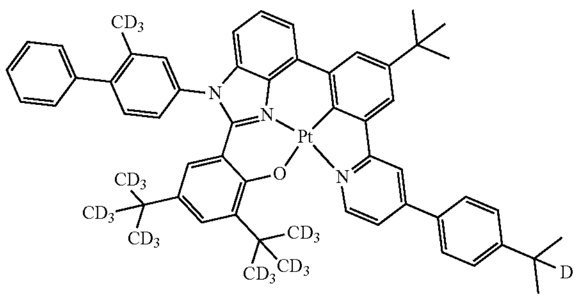
480
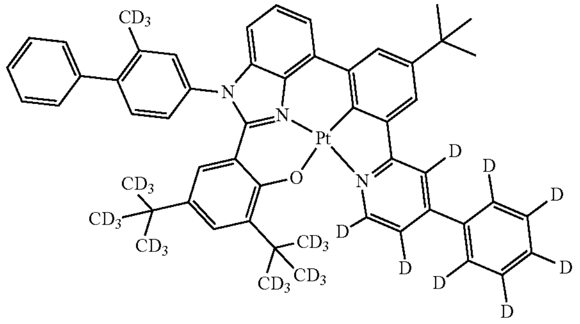
481
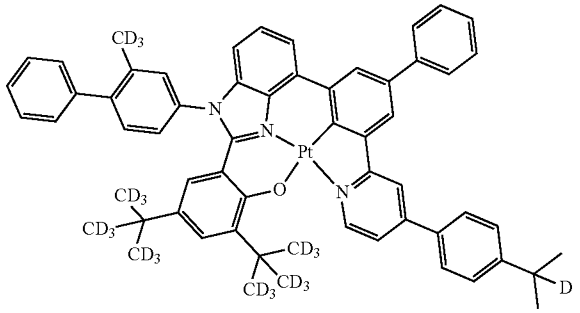
482
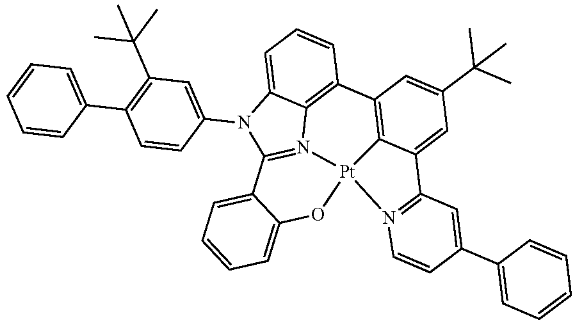
-continued
483
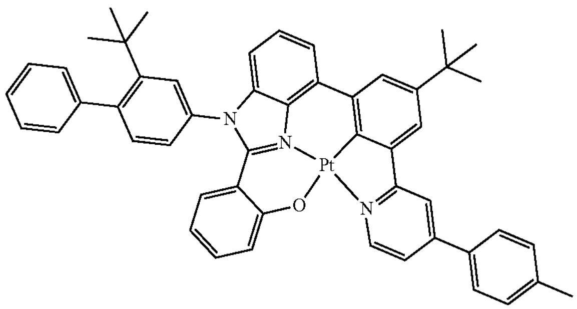
484
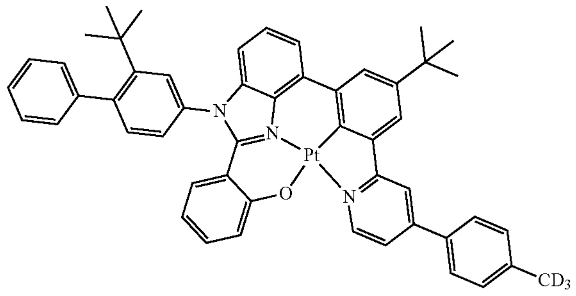
485
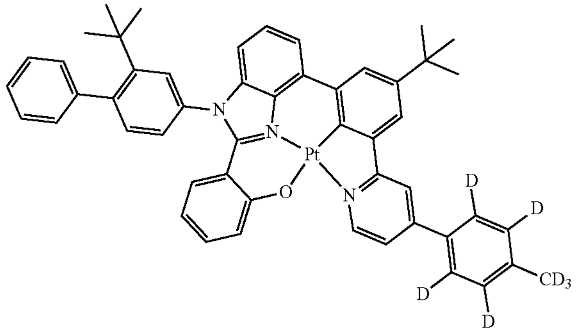
486
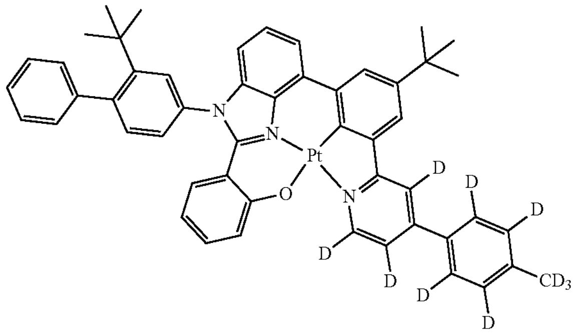

-continued
487
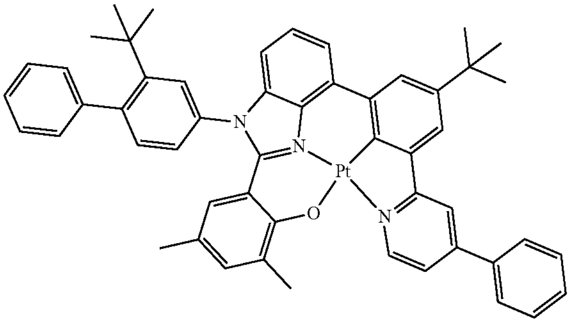
488
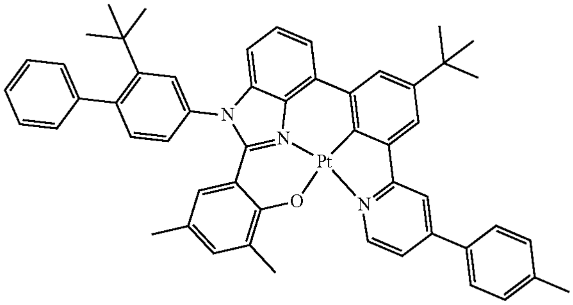
489
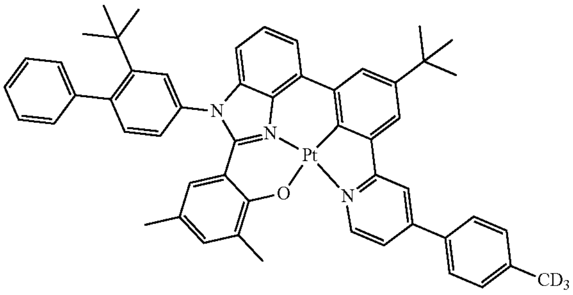
490
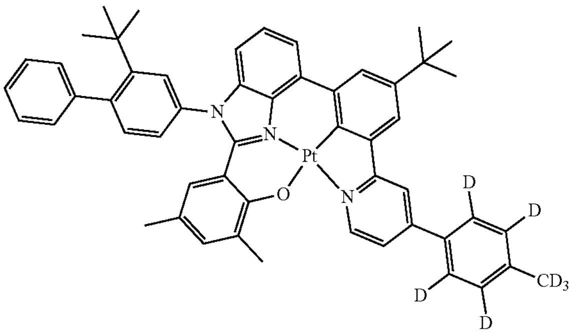
-continued
491
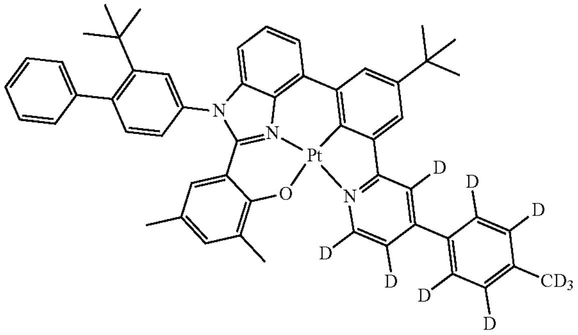
492
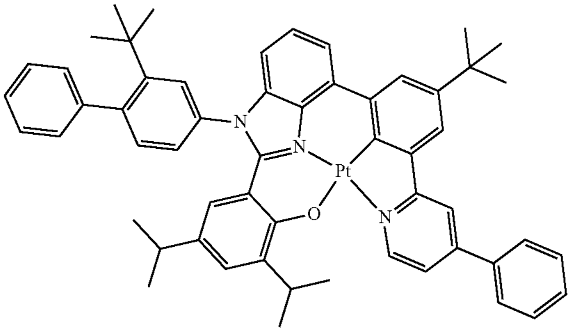
493
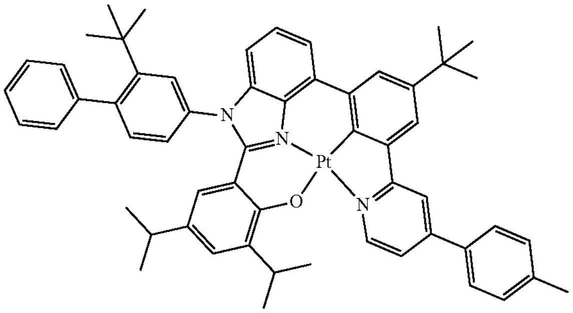
494
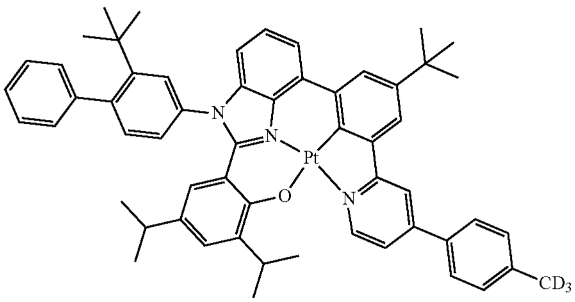

495
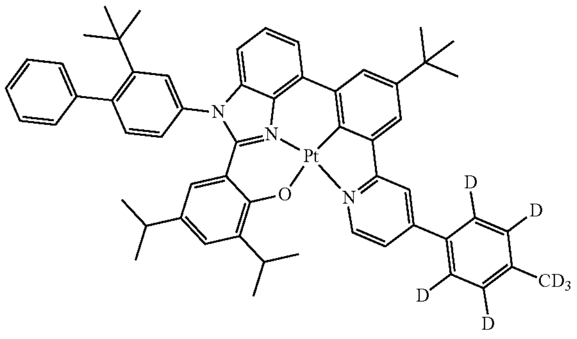
496
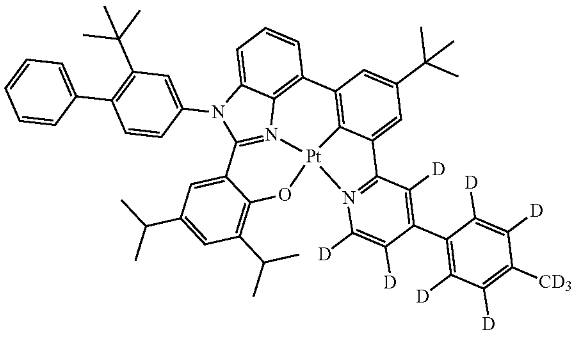
497
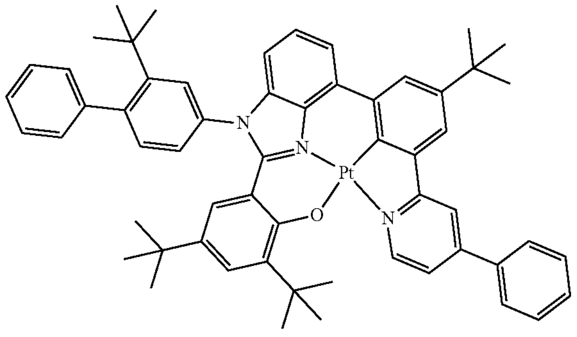
498
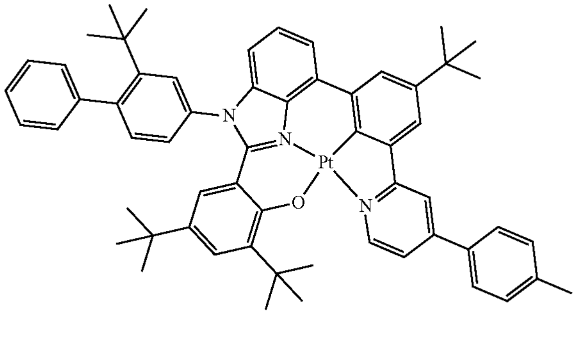
499
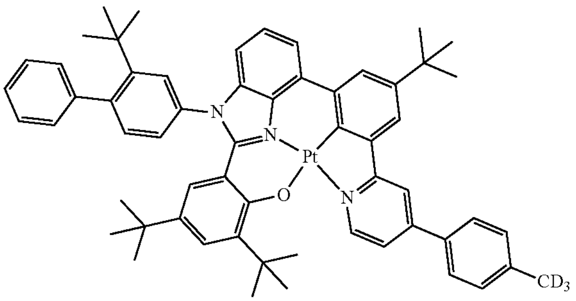
500
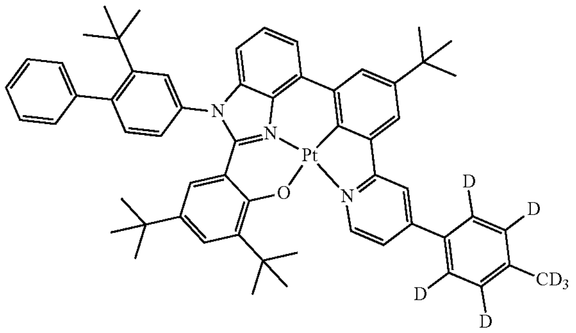
501
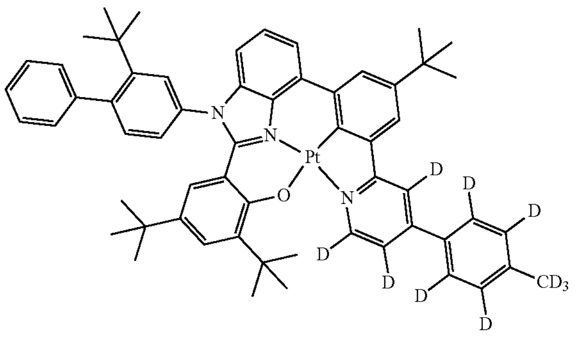
502
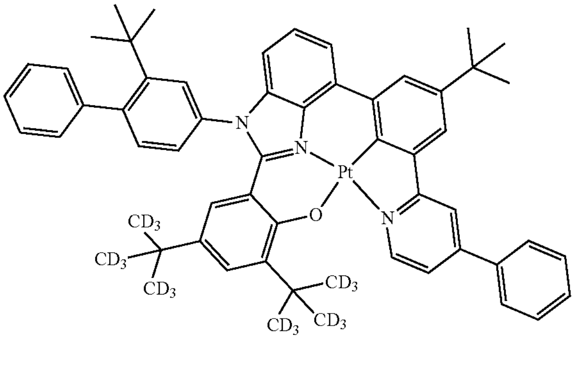

-continued
503
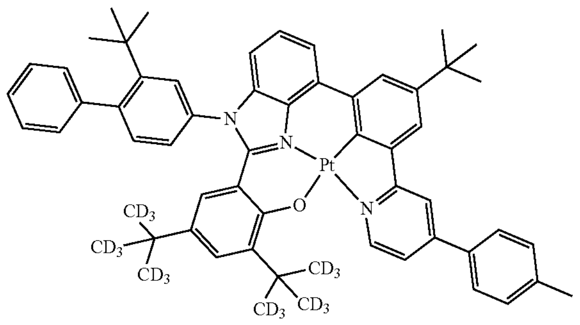
504
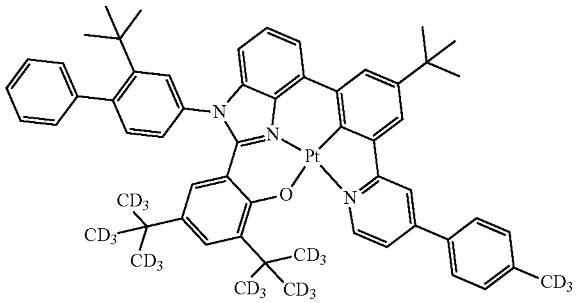
505
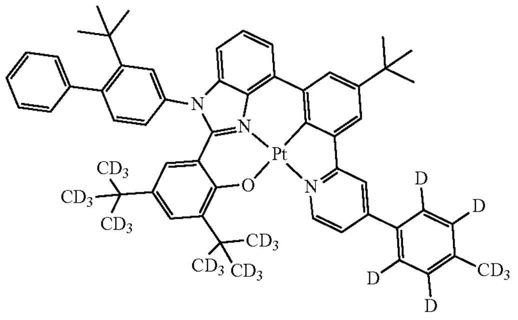
506
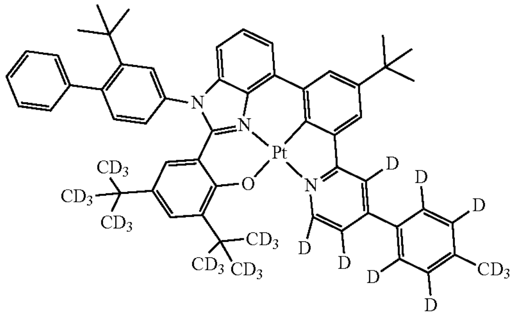
-continued
507
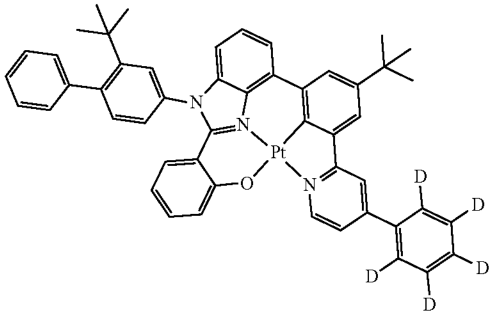
508
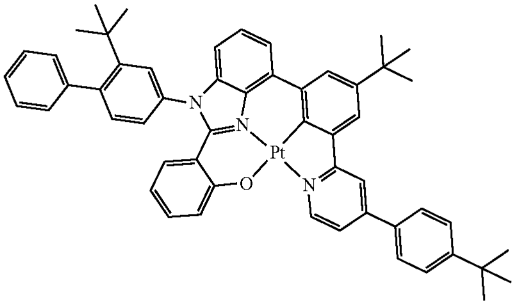
509
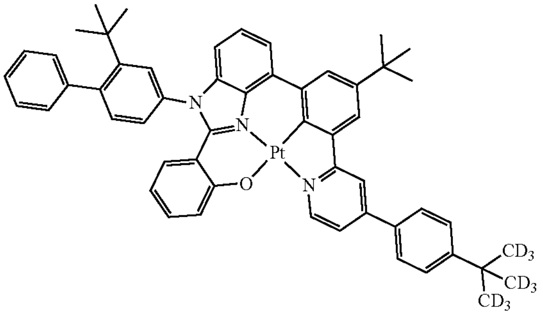
510
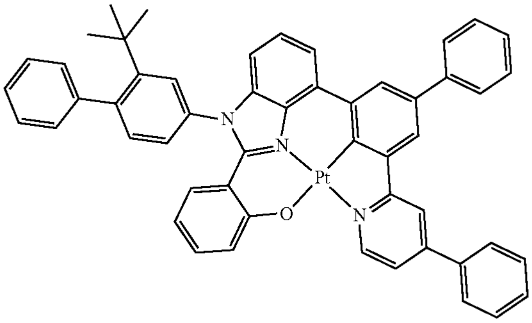
511
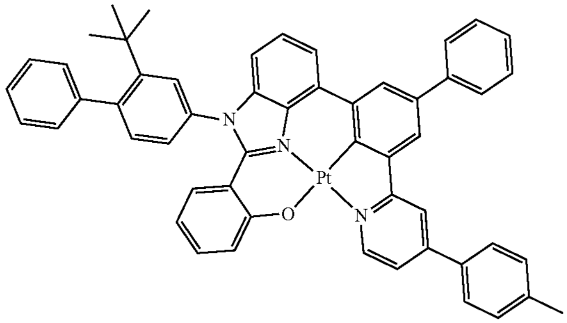

-continued
512
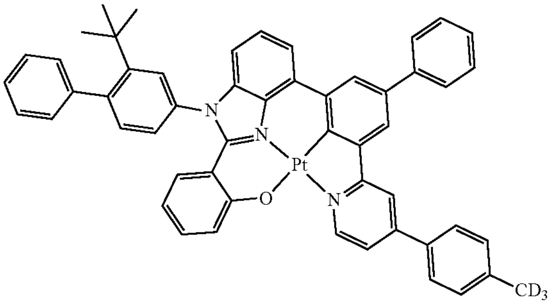
513
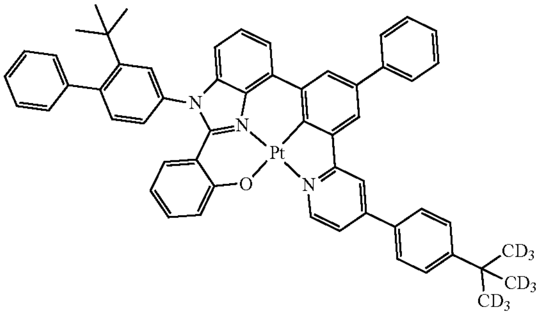
514
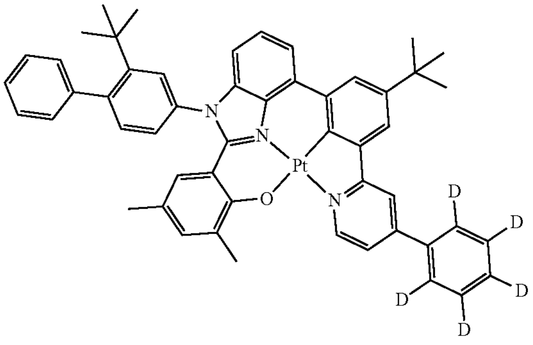
515
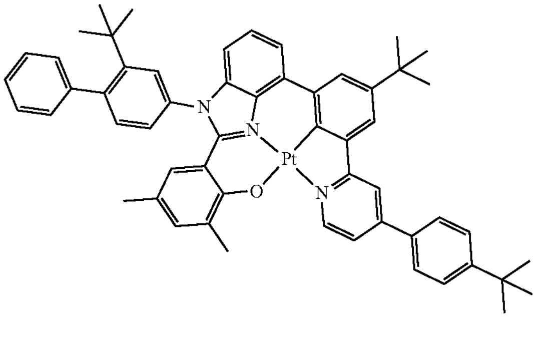
-continued
516
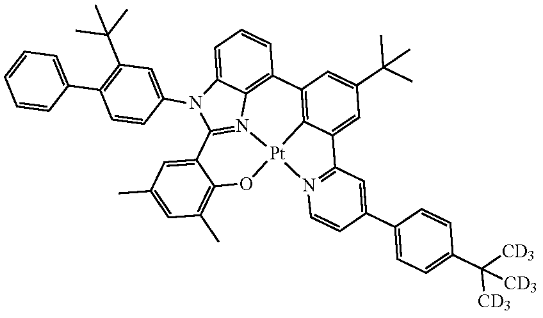
517
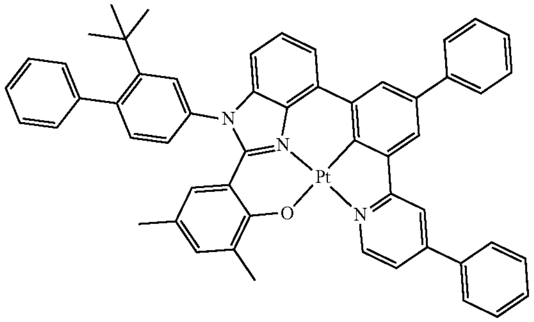
518
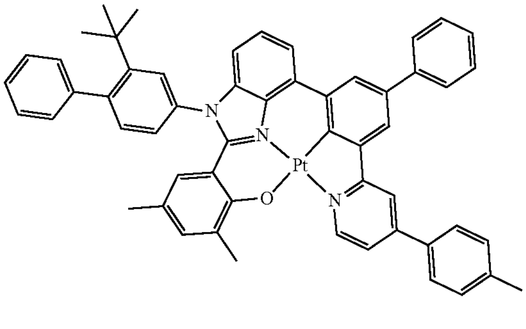
519
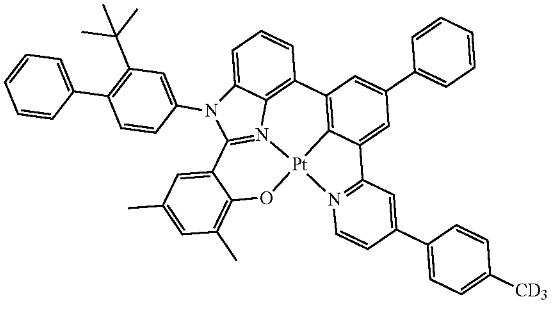

-continued
520
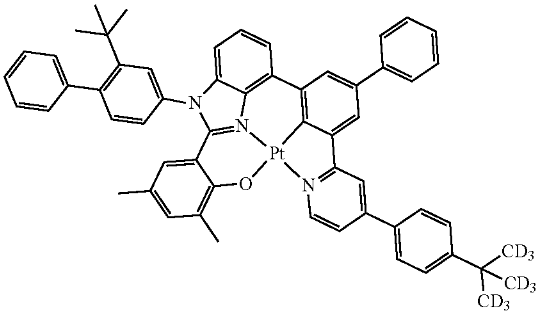
521
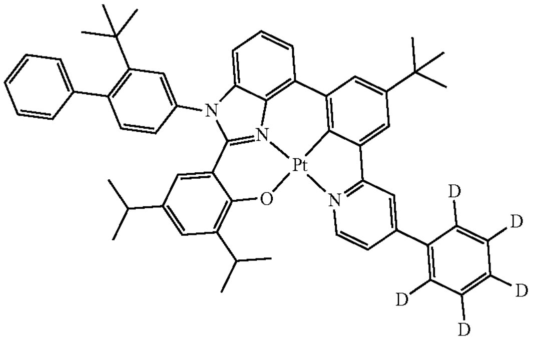
522
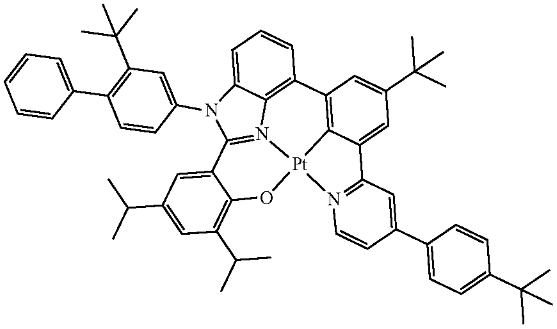
523
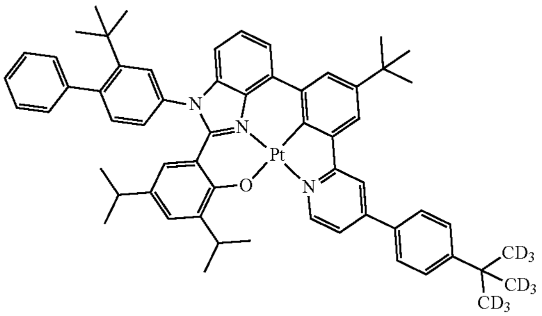
-continued
524
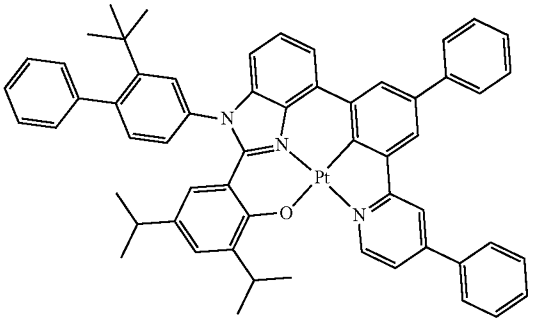
525
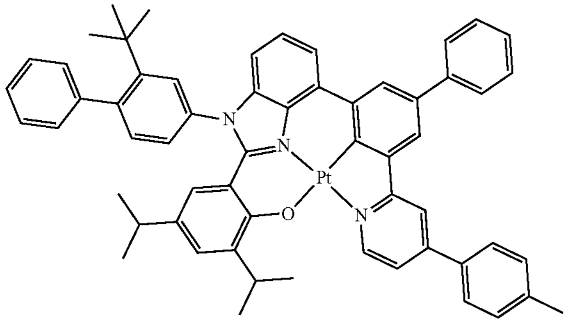
526
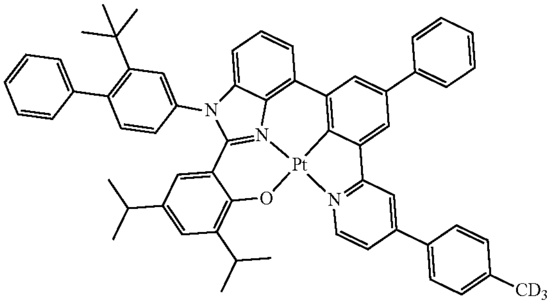
527
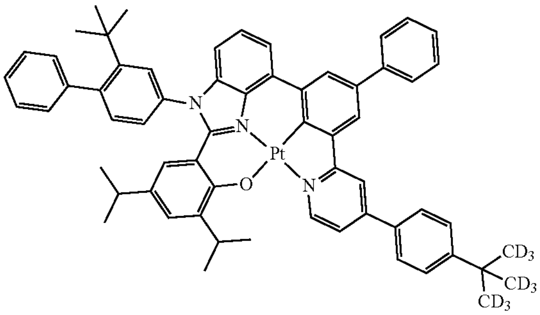

-continued
528
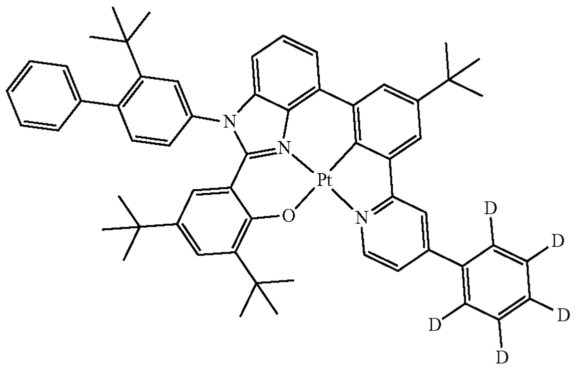
529
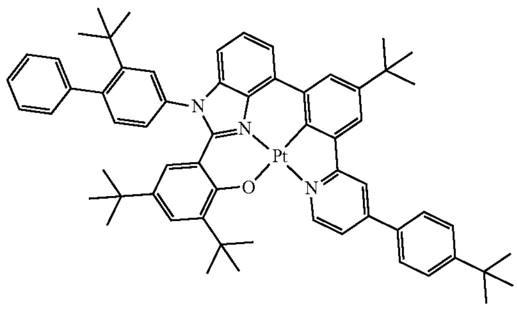
530
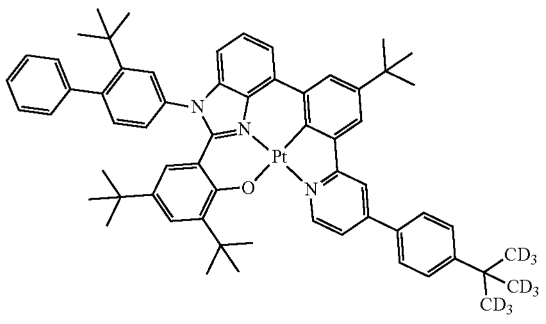
531
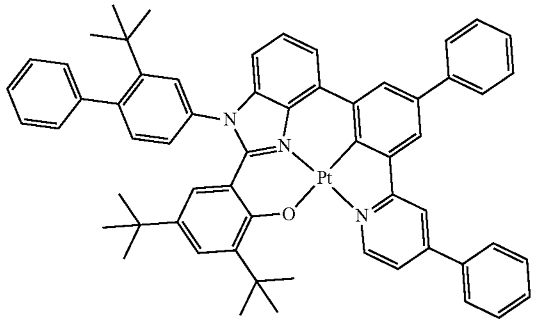
-continued
532
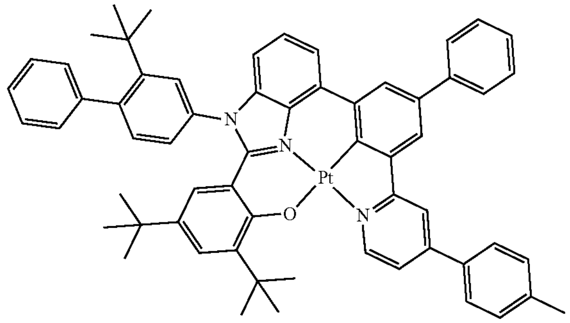
533
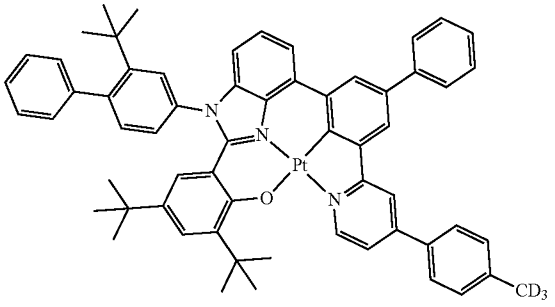
534
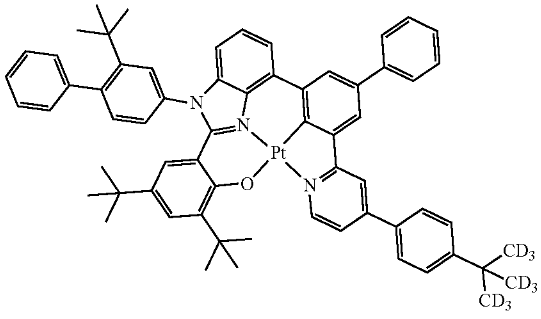
535
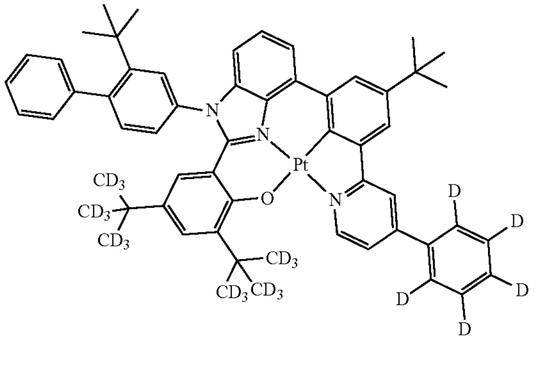

-continued
536
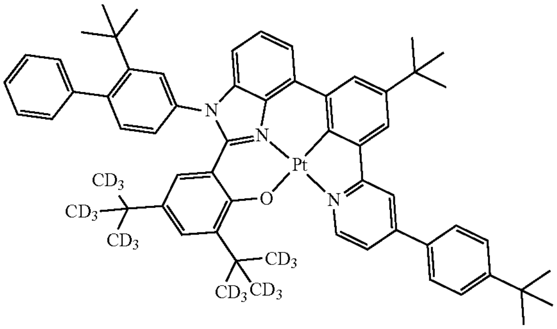
537
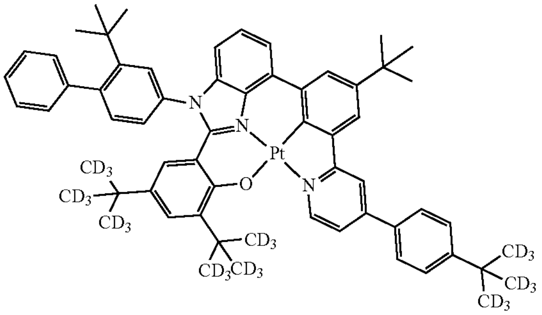
538
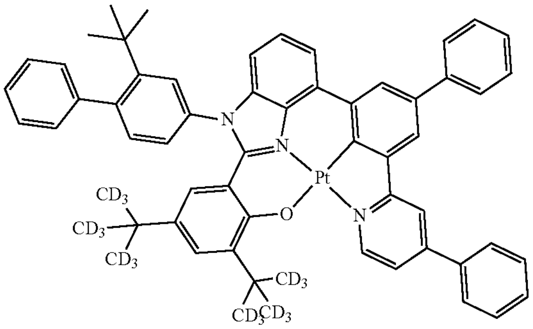
539
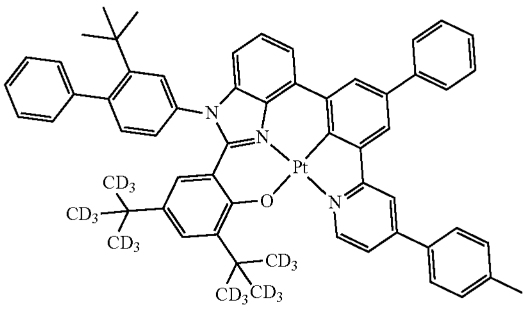
-continued
540
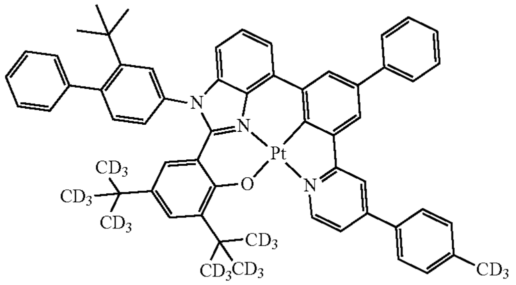
541
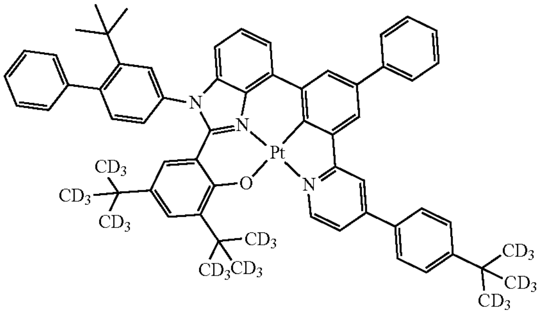
542
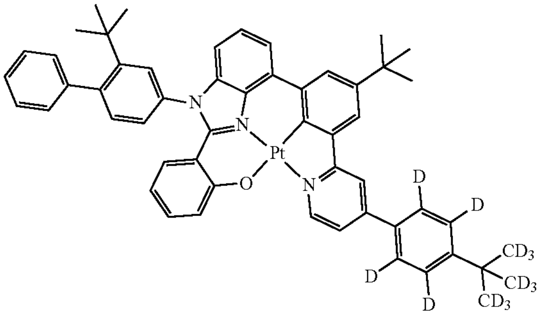
543
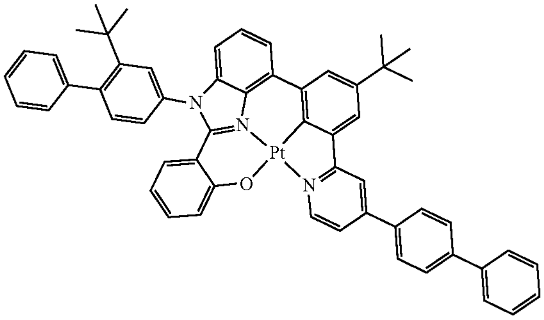
544
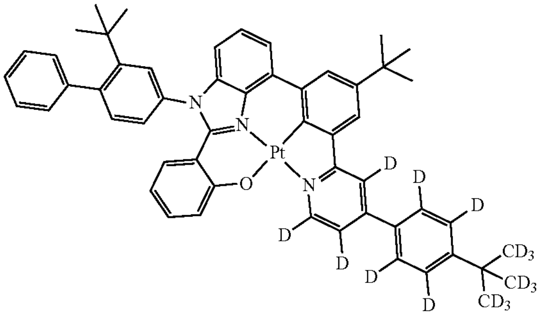

-continued
545
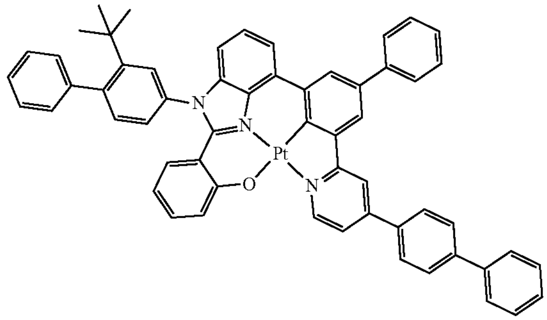
546
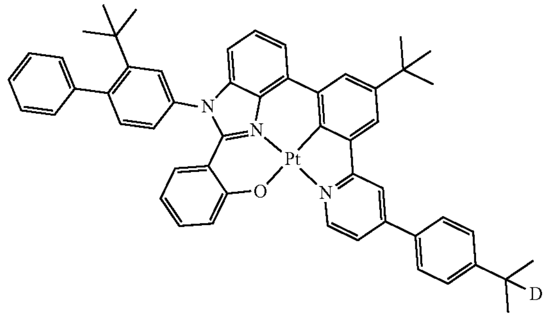
547
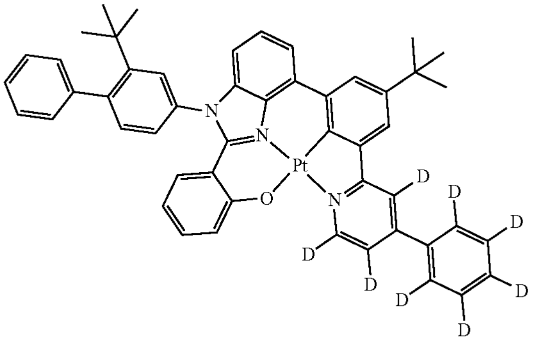
548
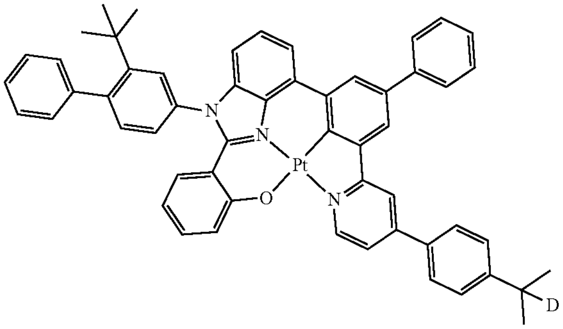
-continued
549
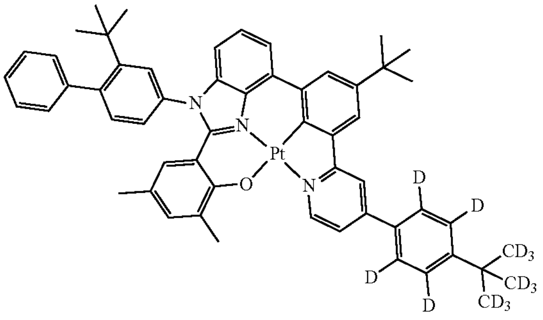
550
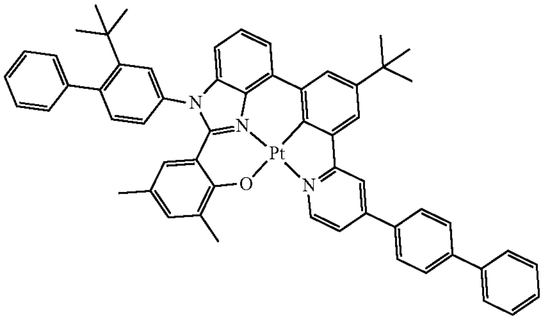
551
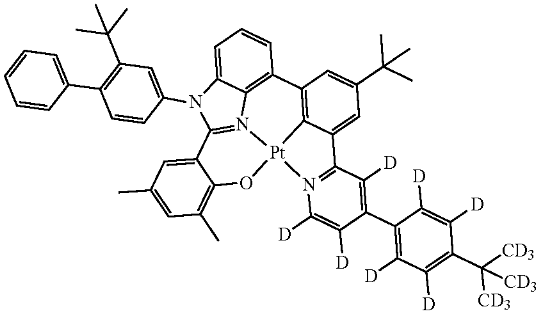
552
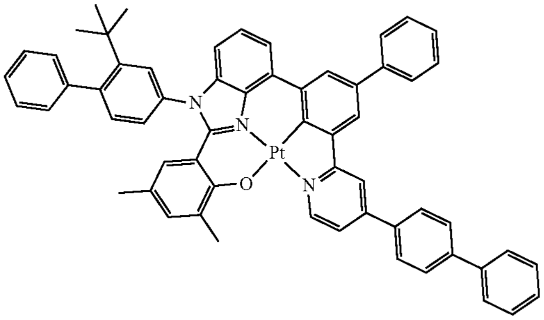

-continued
553
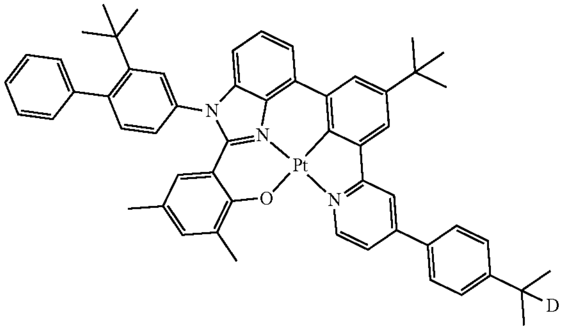
554
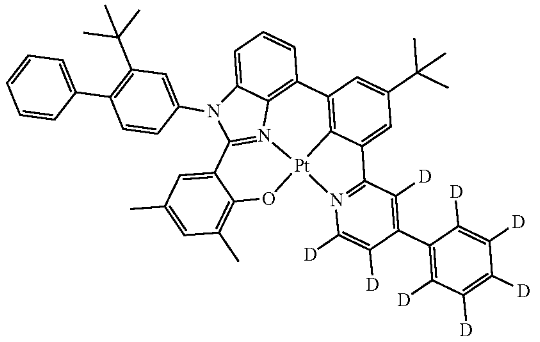
555
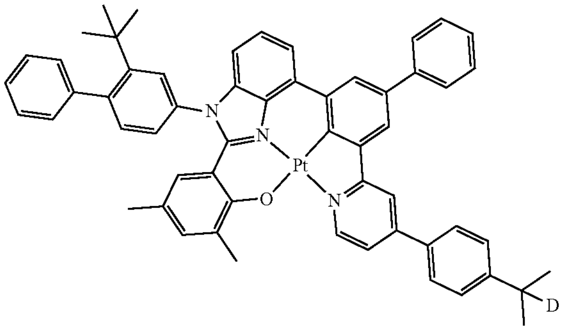
556
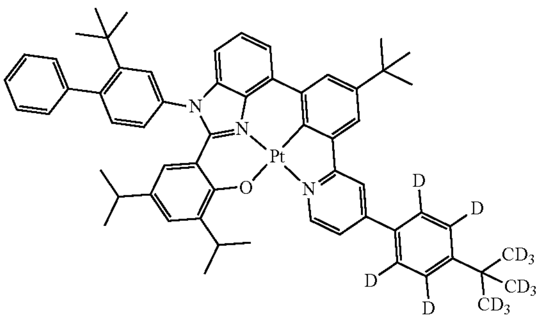
-continued
557
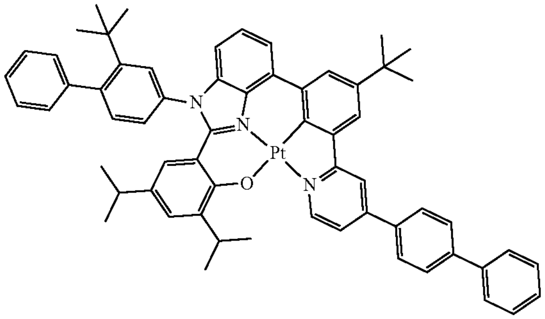
558
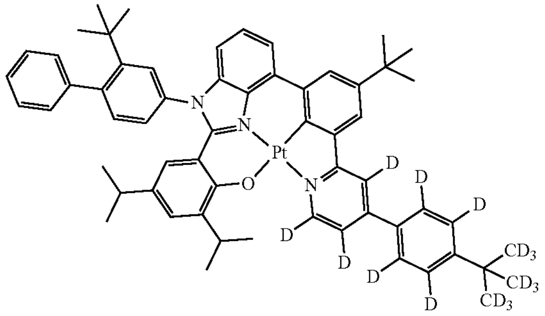
559
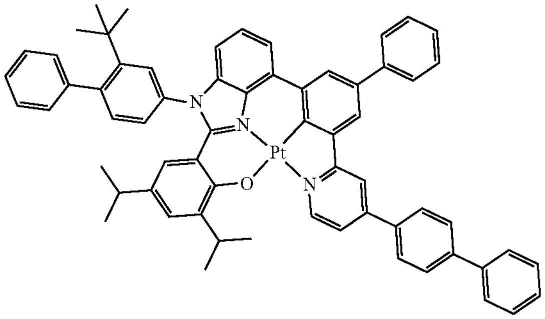
560
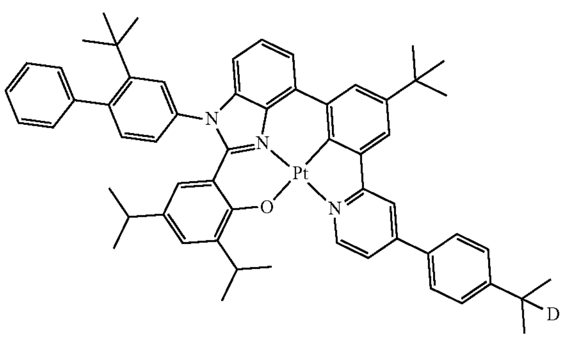

-continued
561
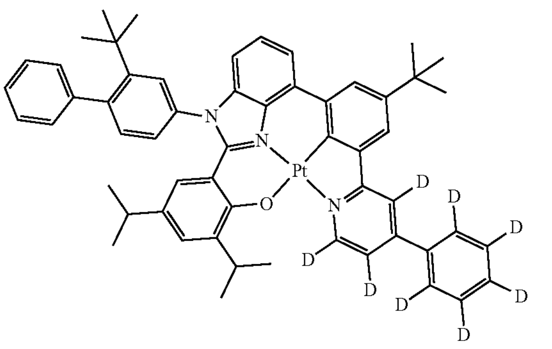
562
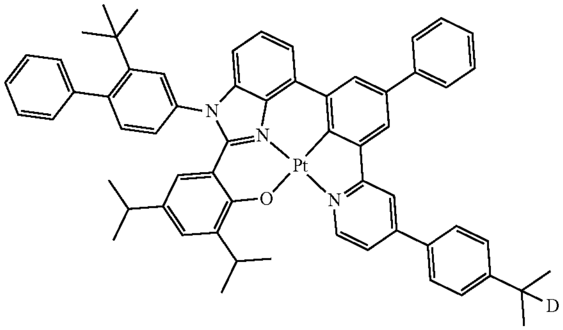
563
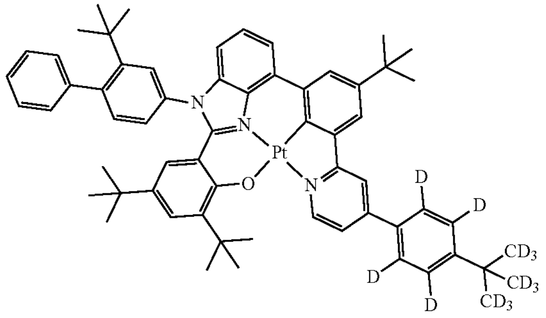
564
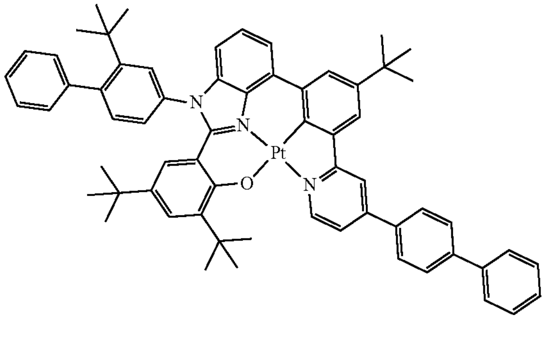
-continued
565
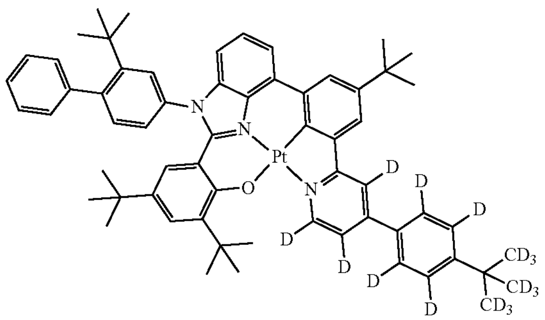
566
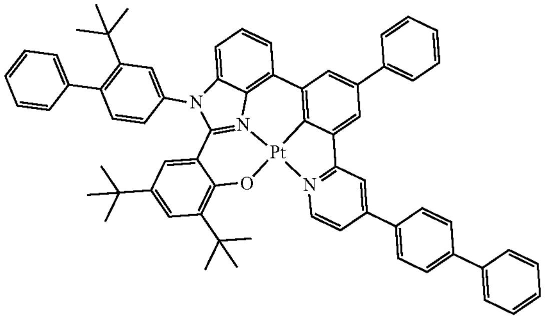
568
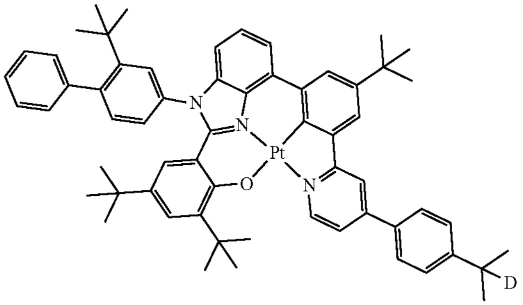
568
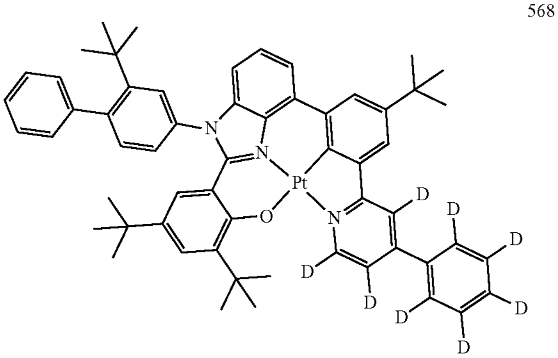

-continued
569
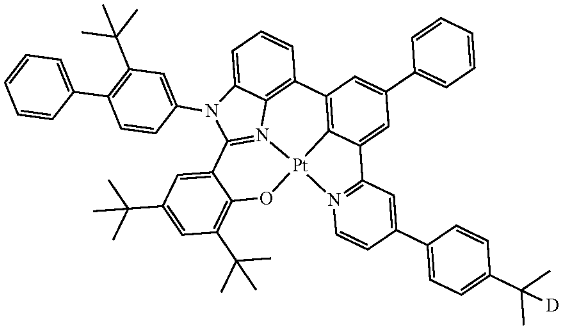
570
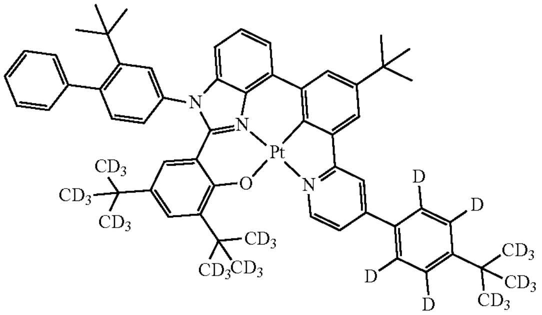
571
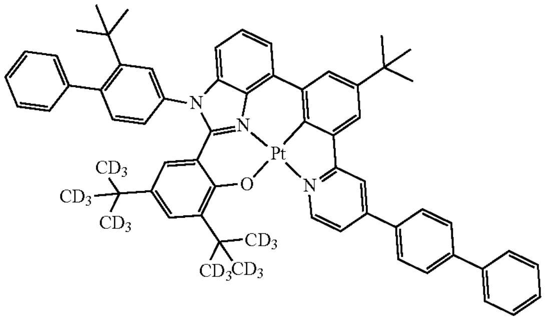
572
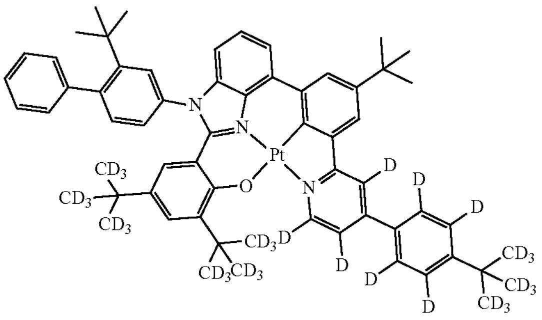
-continued
573
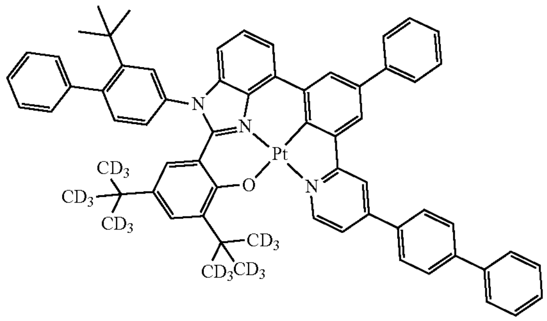
574
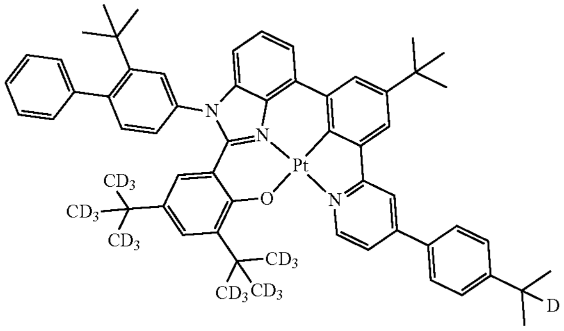
575
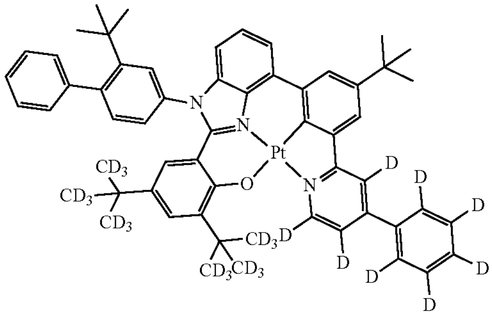
576
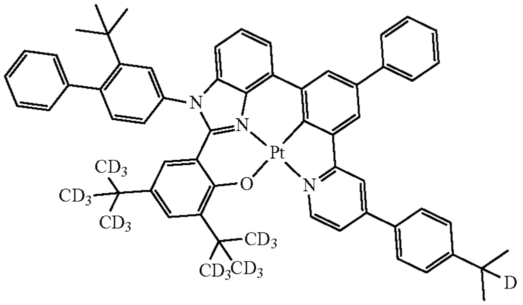

-continued
577
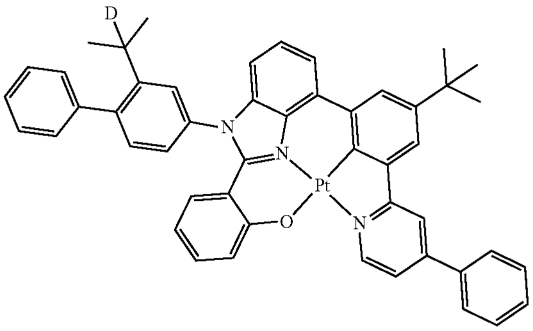
578
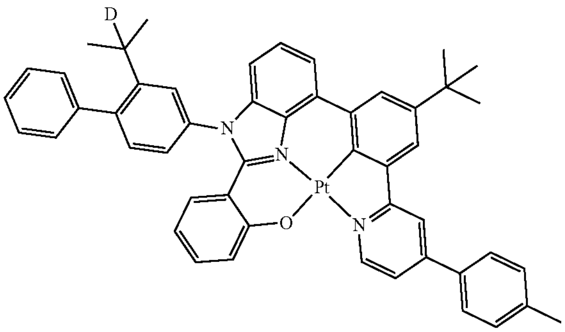
579
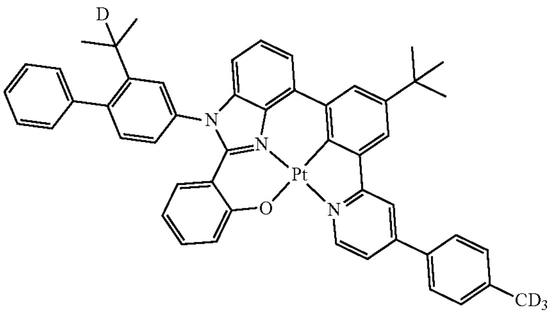
580
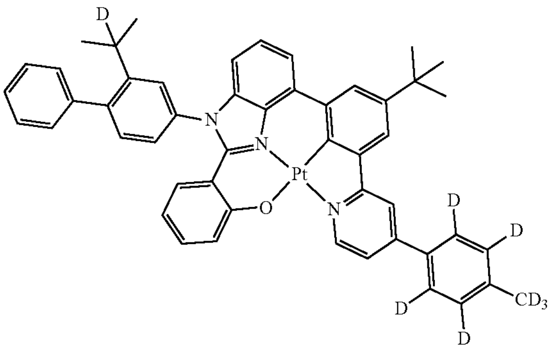
-continued
581
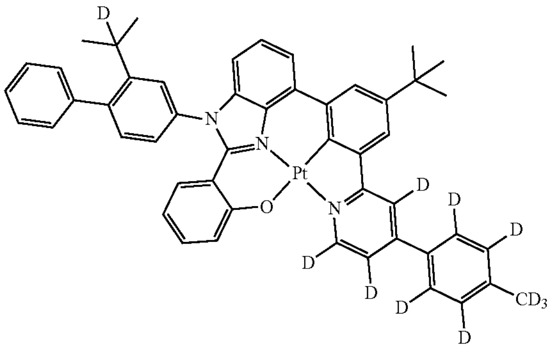
582
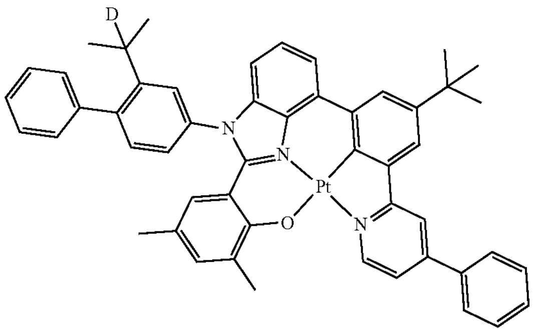
583
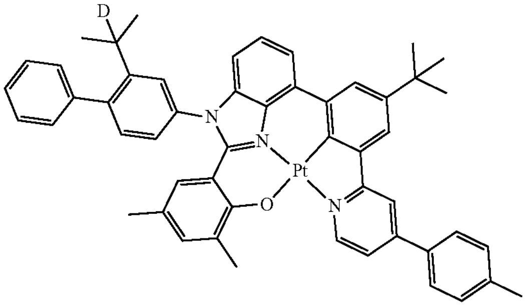
584
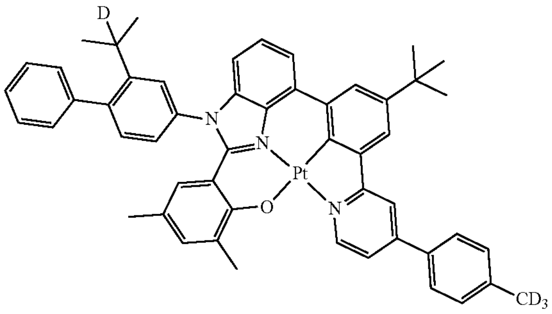

-continued
585
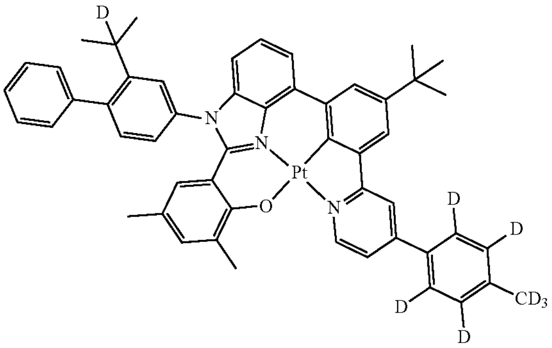
586
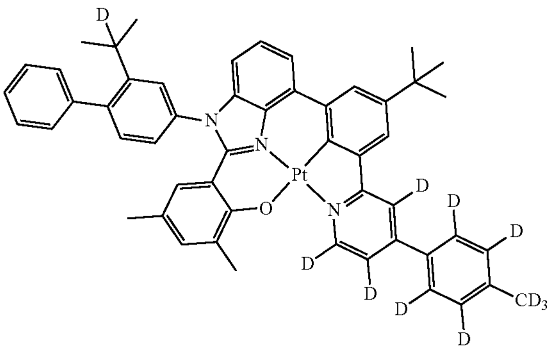
587
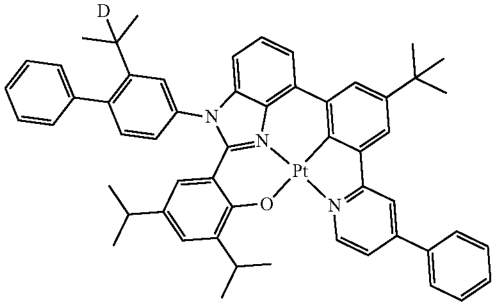
588
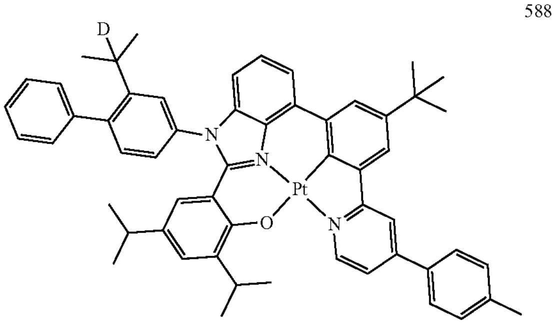
-continued
589
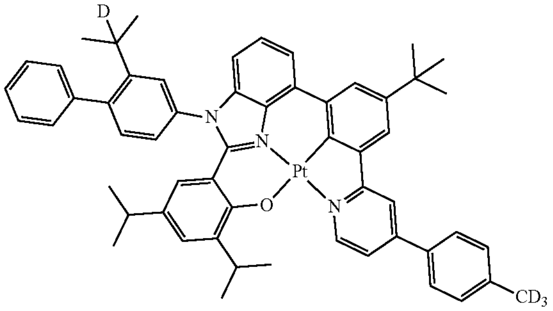
590
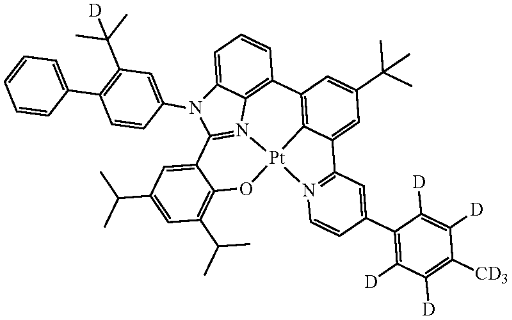
591
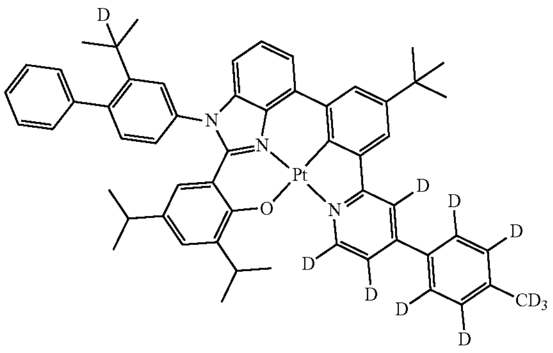
592
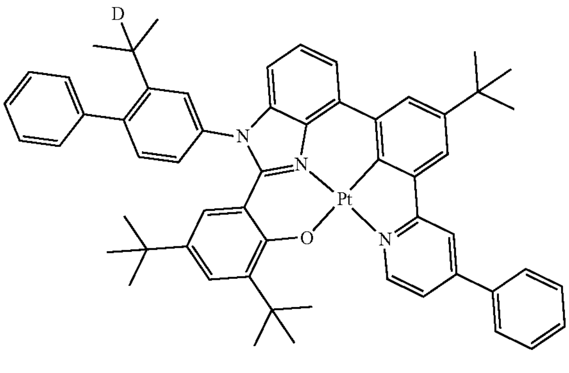

-continued
593
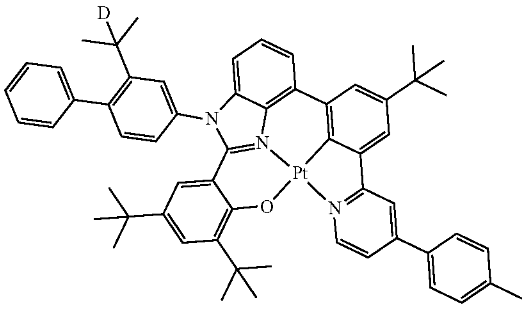
594
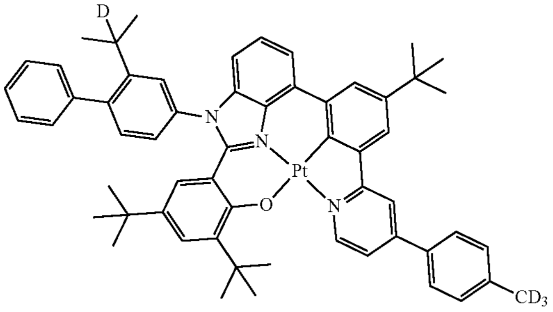
595
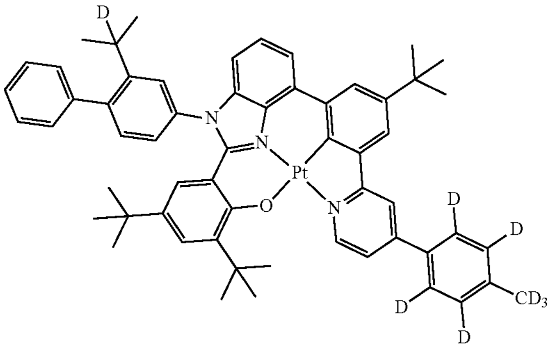
596
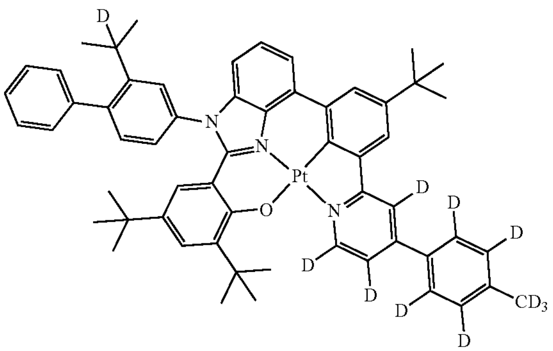
-continued
597
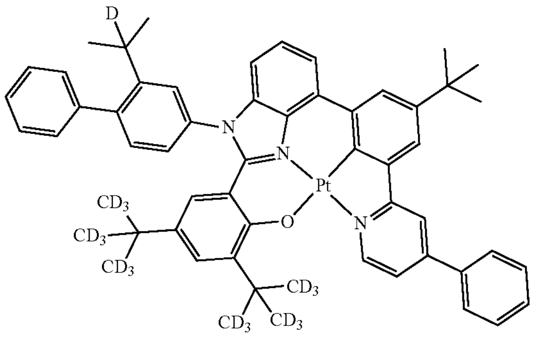
598
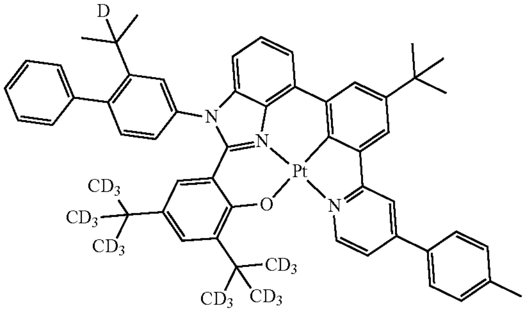
599
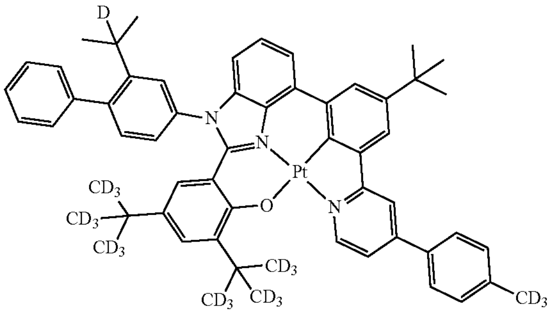
600
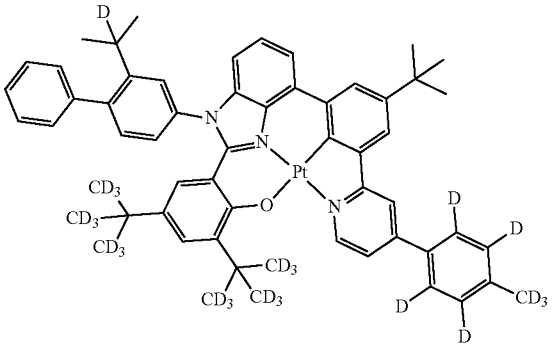

601
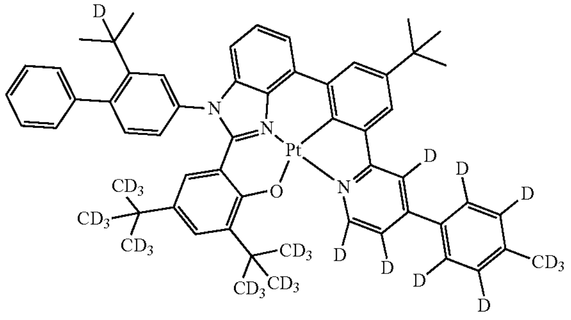
602
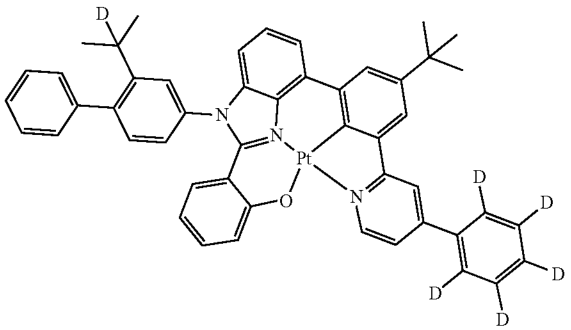
603
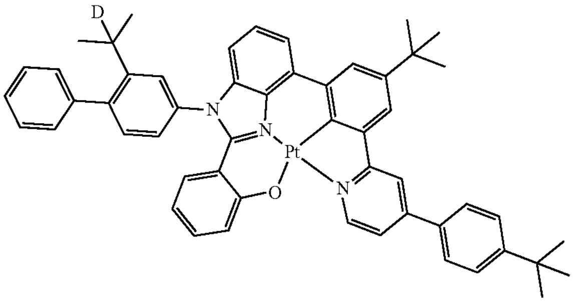
604
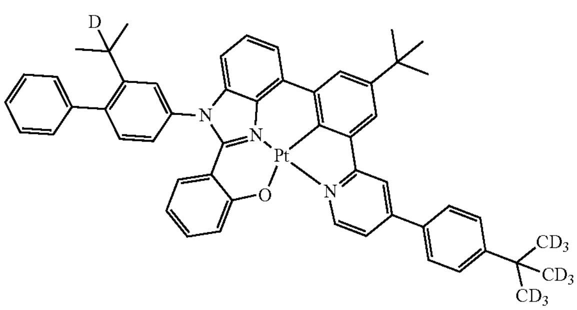
-continued
605
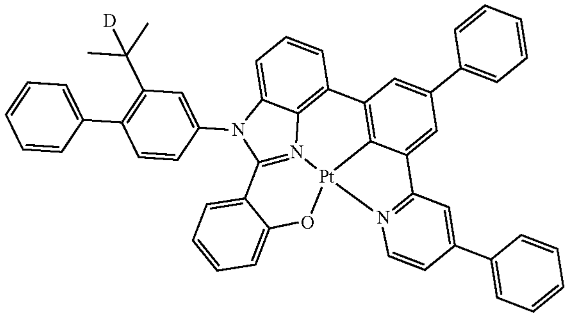
606
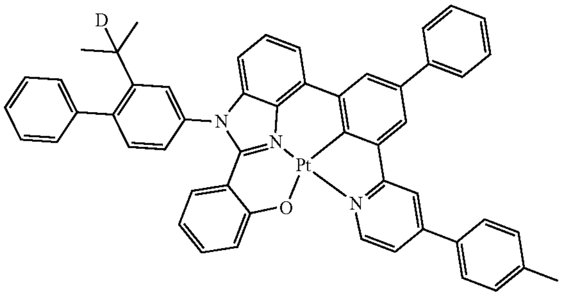
607
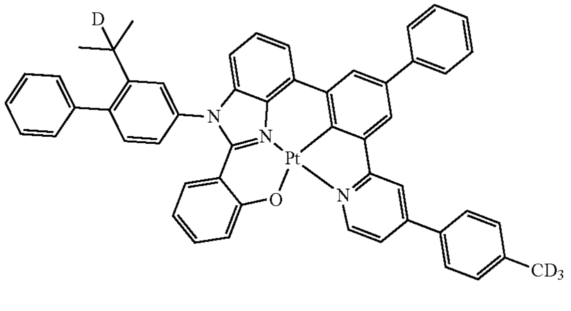
608
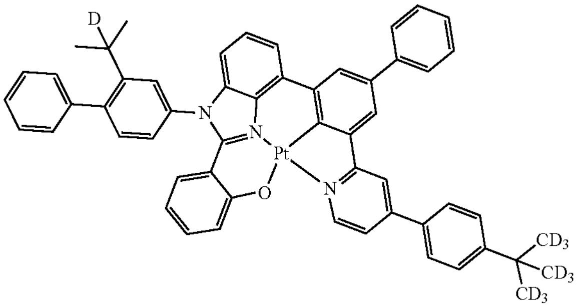

-continued
609
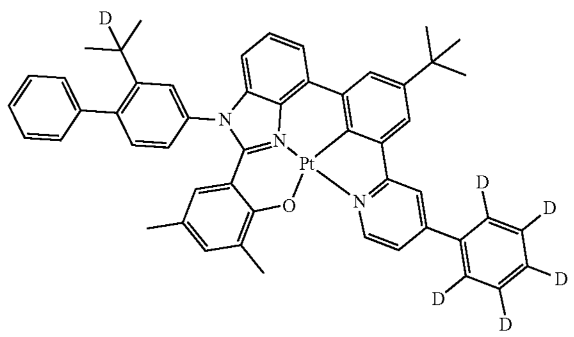
610
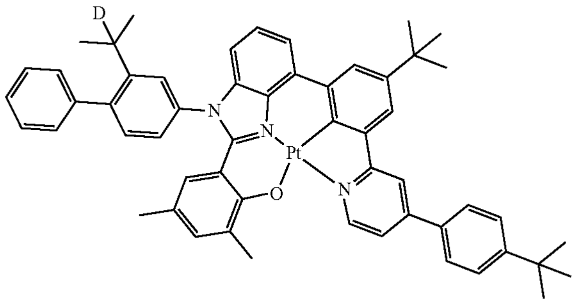
611
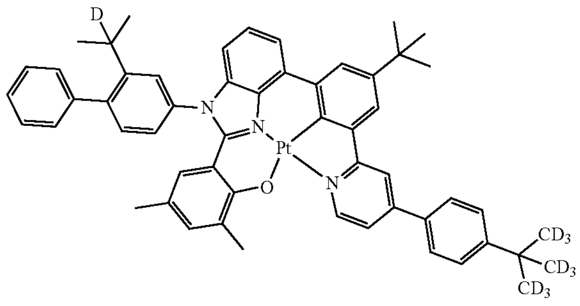
612
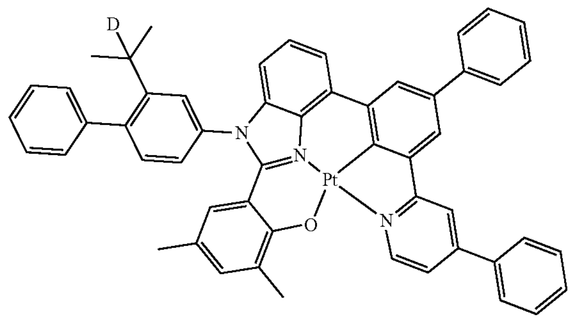
-continued
613
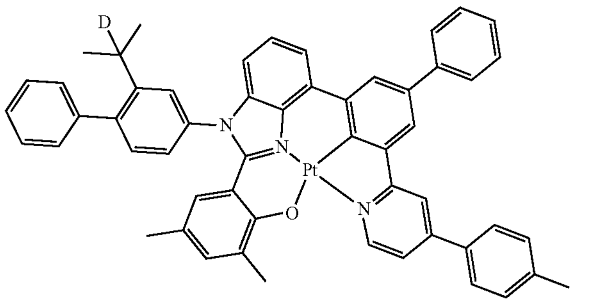
614
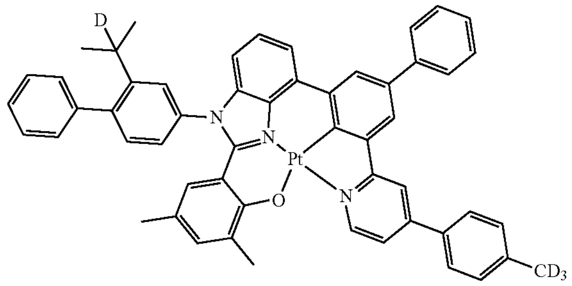
615
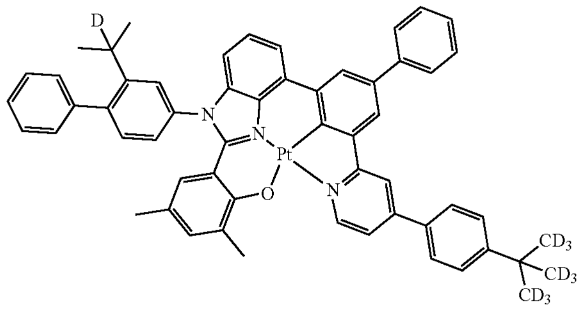
616
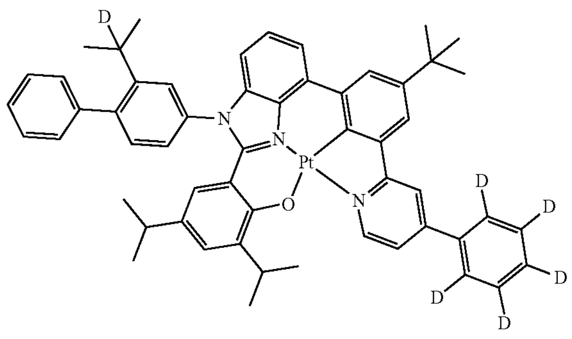
617
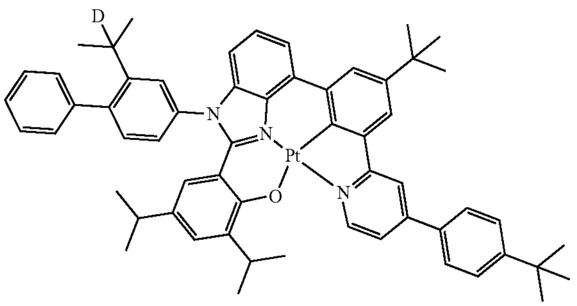

-continued
618
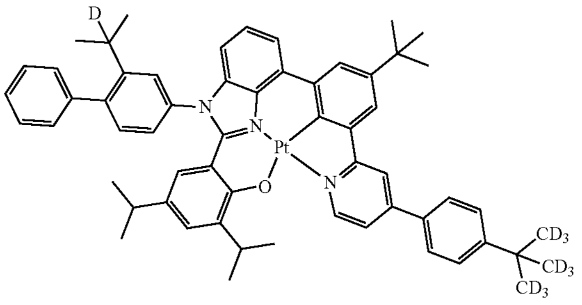
619
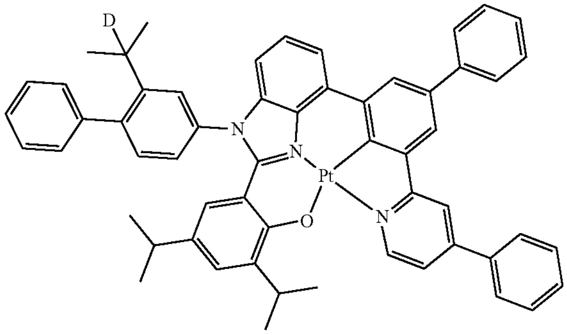
620
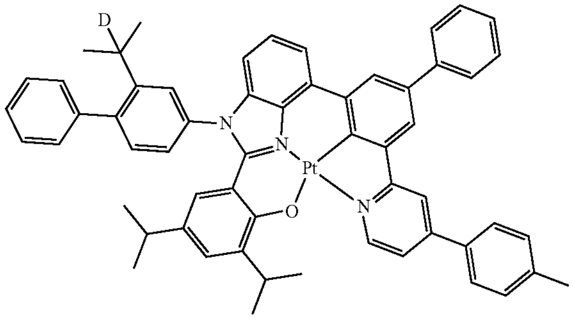
621
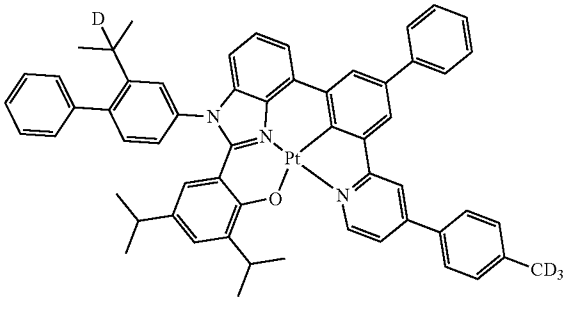
-continued
622
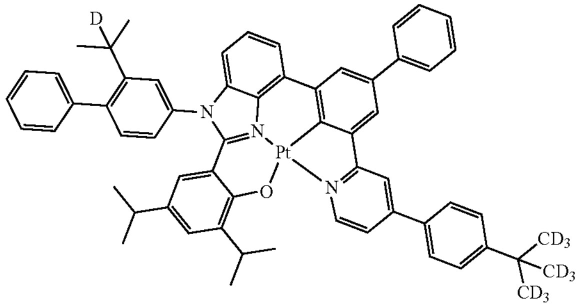
623
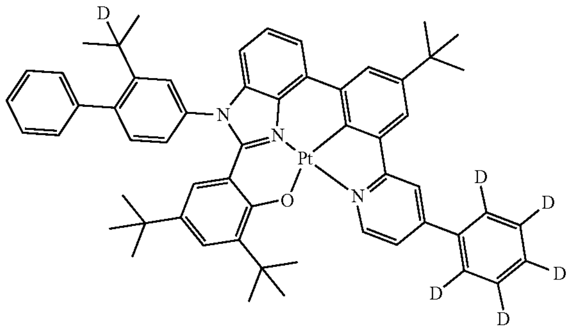
624
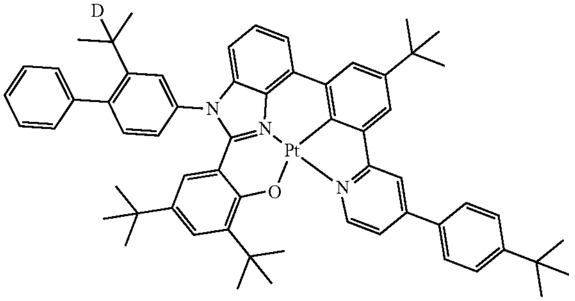
625
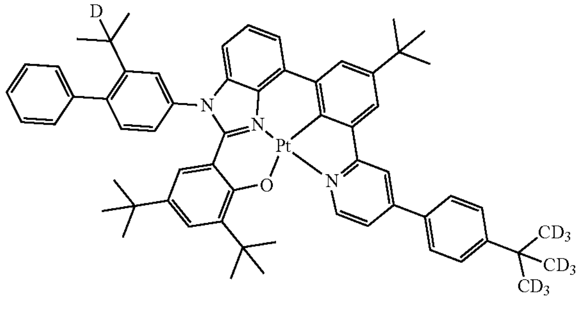

-continued
626
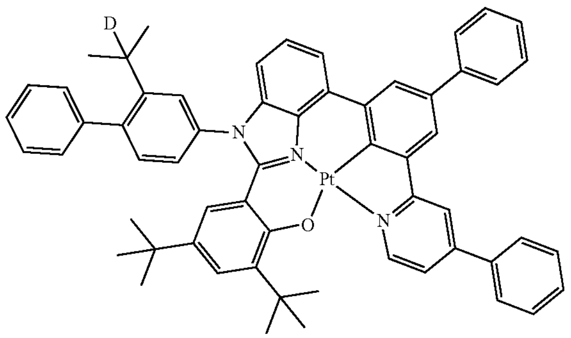
627
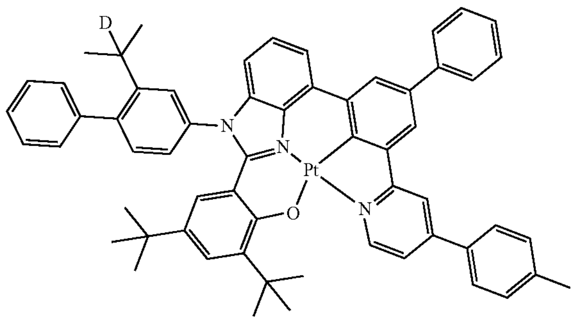
628
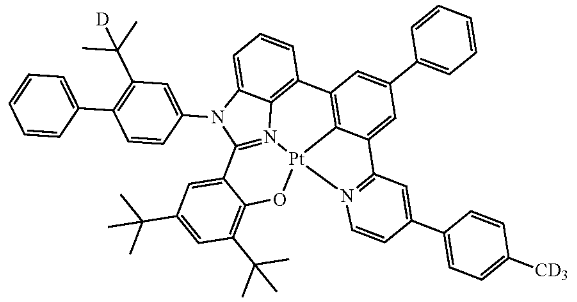
629
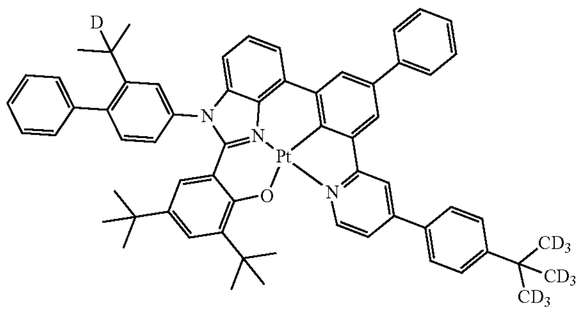
-continued
630
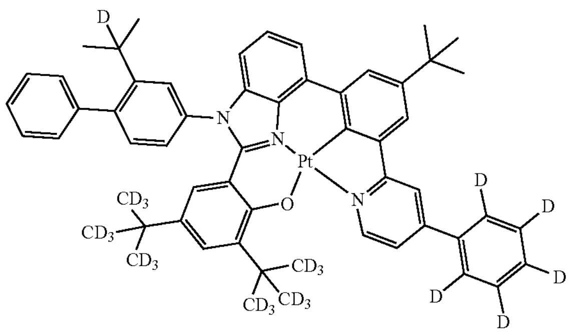
631
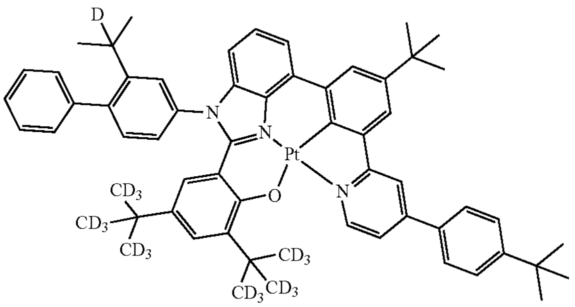
632
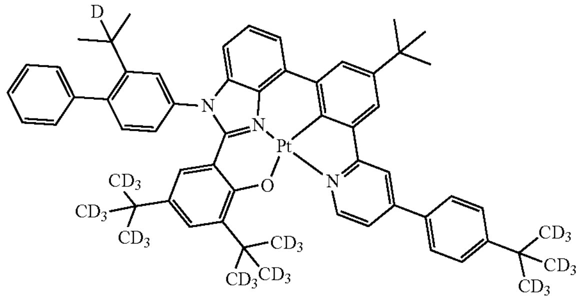
633
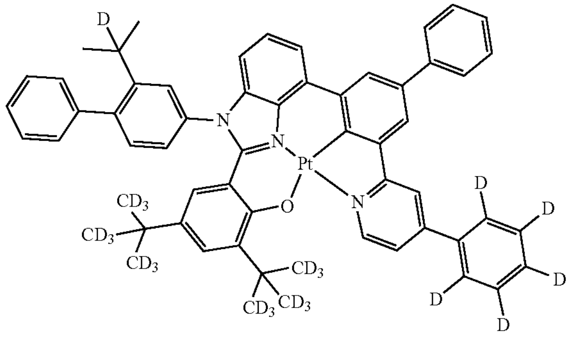

-continued
634
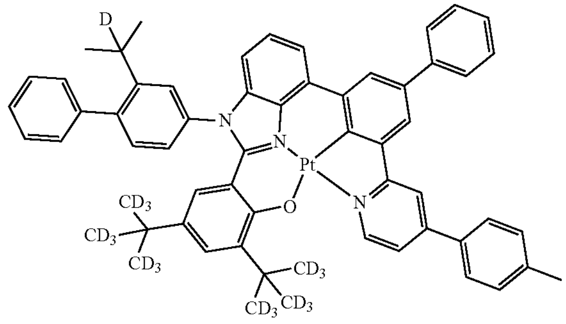
635
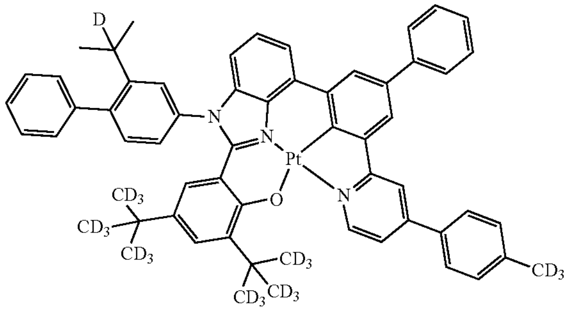
636
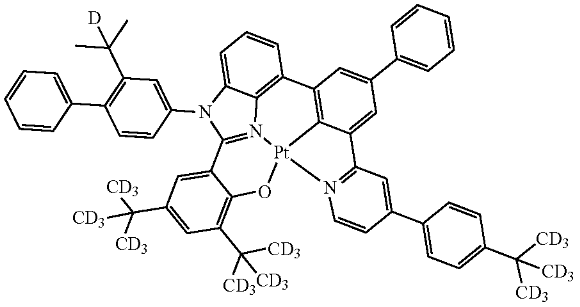
637
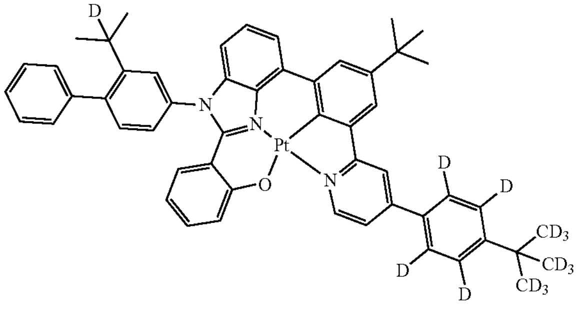
-continued
638
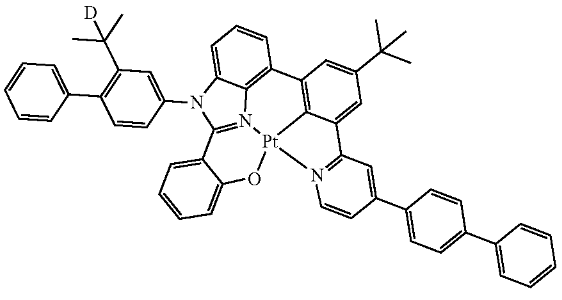
639
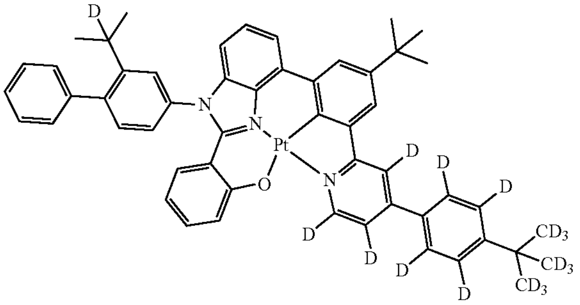
640
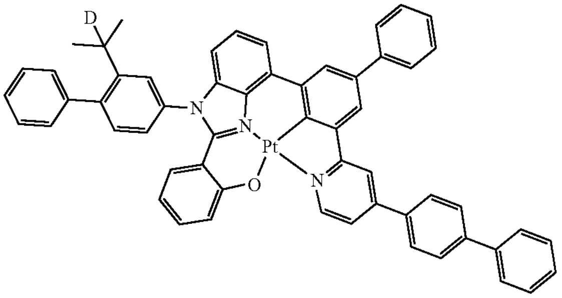
641
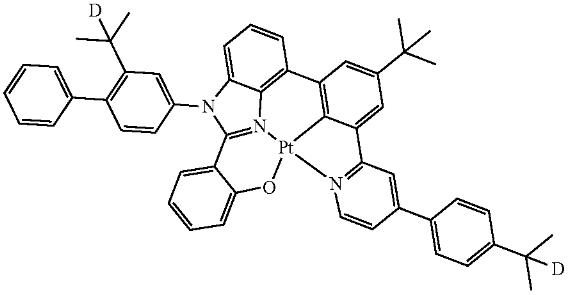
642
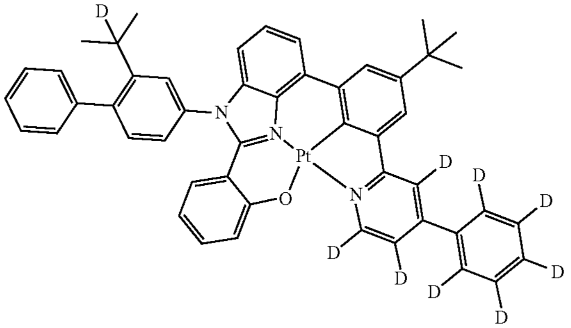

-continued
643
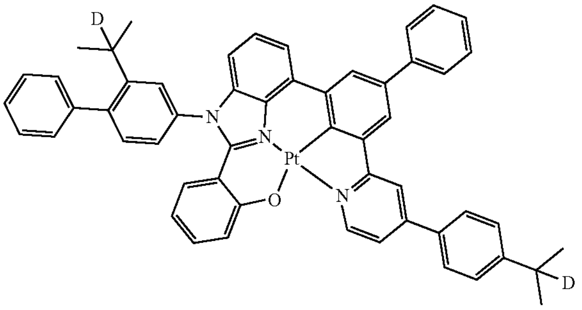
644
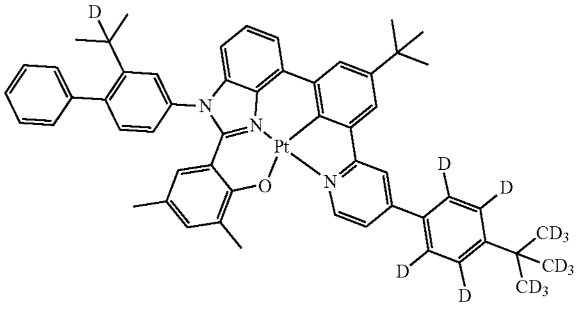
645
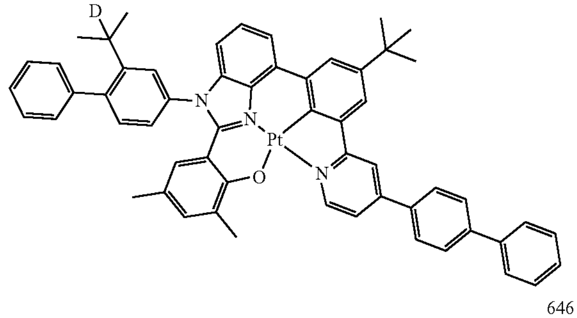
646
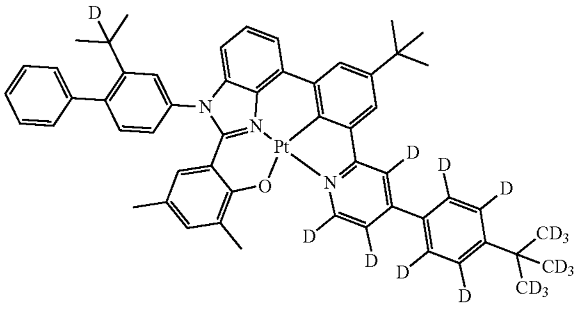
647
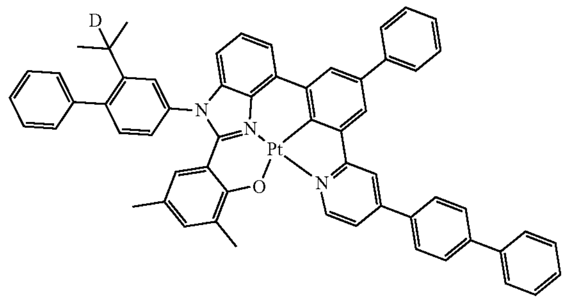
-continued
648
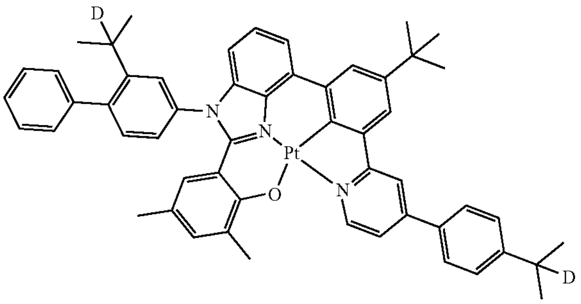
649
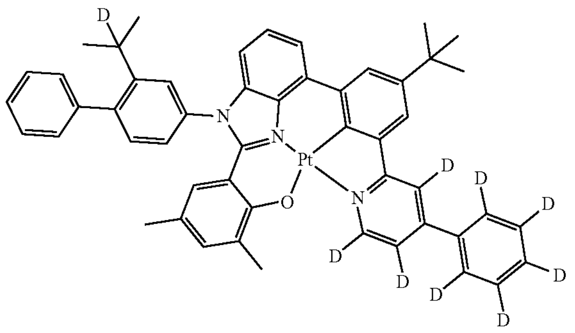
650
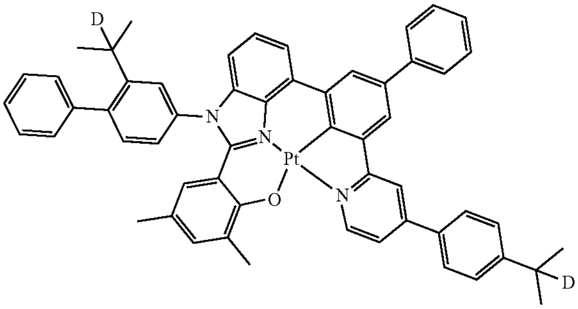
651
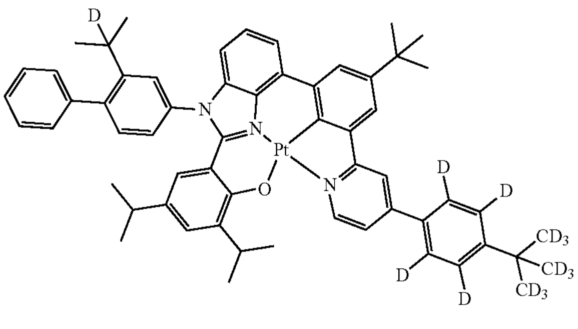

-continued
652
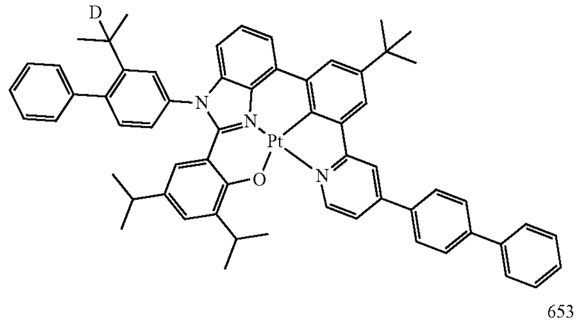
653
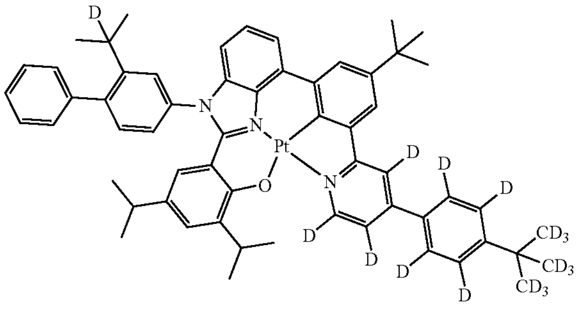
654
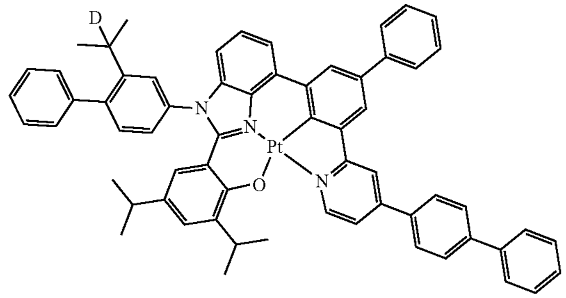
655
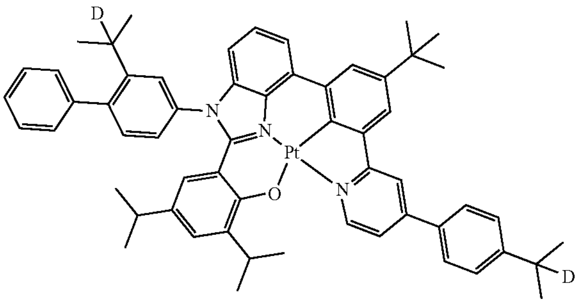
656
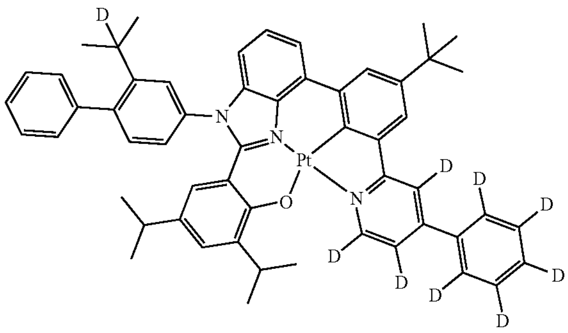
-continued
657
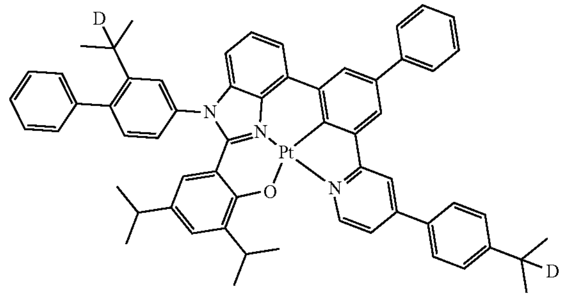
658
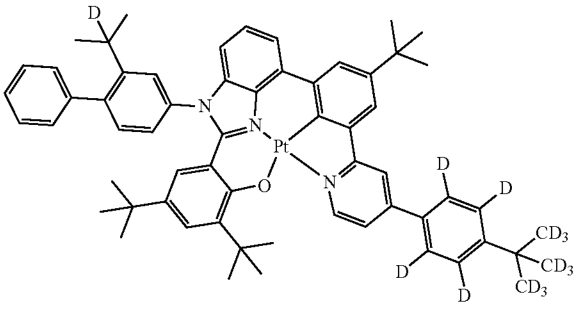
659
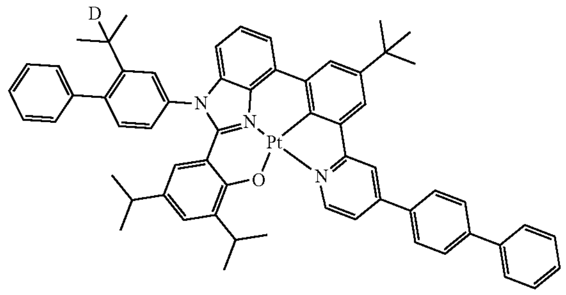
660
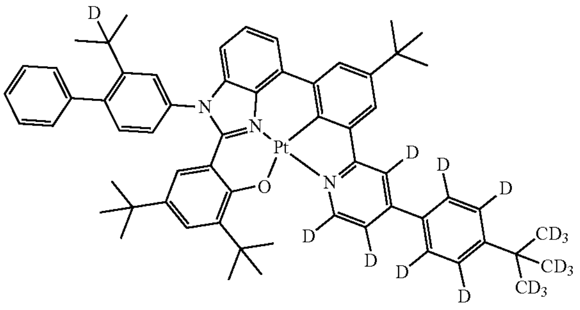
661
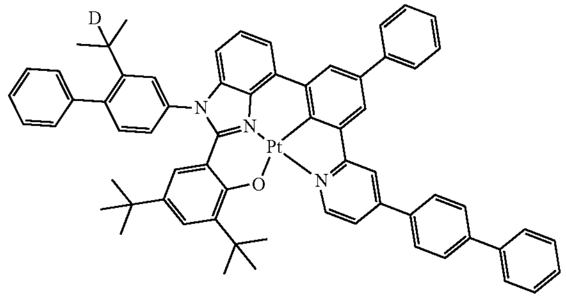

-continued
662
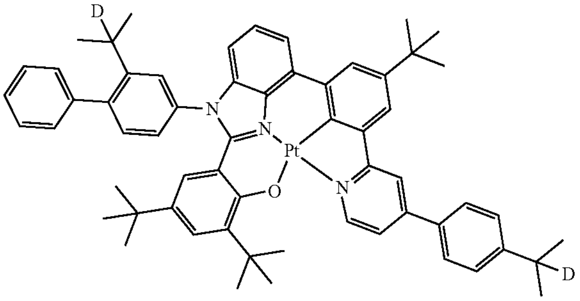
663
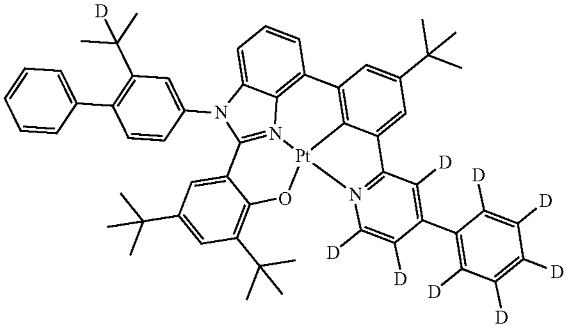
664
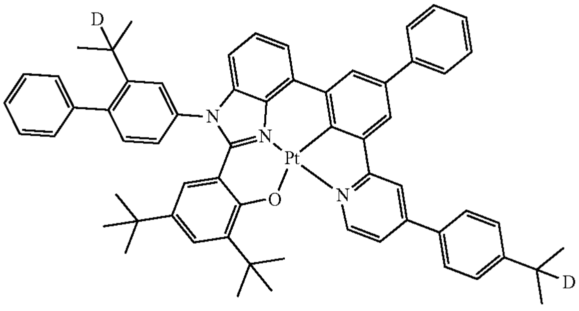
665
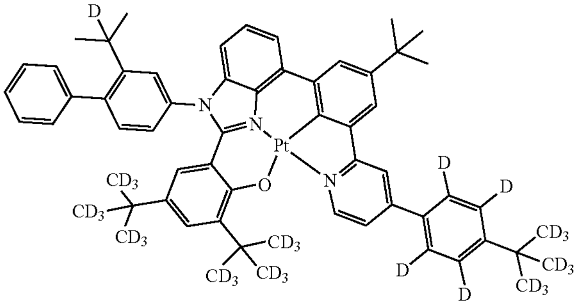
-continued
666
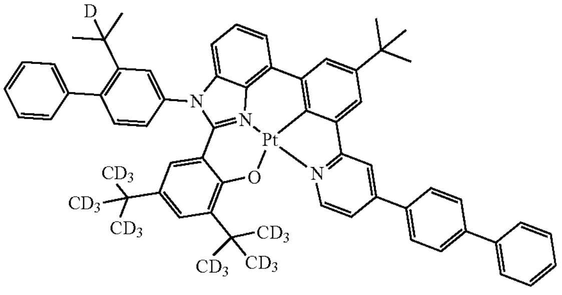
667
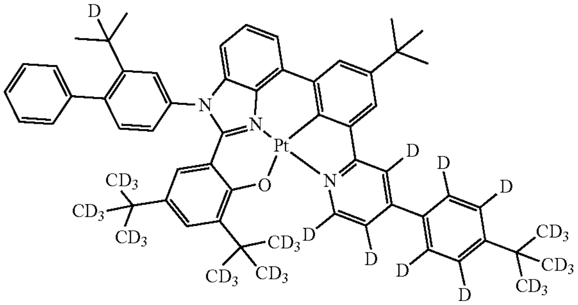
668
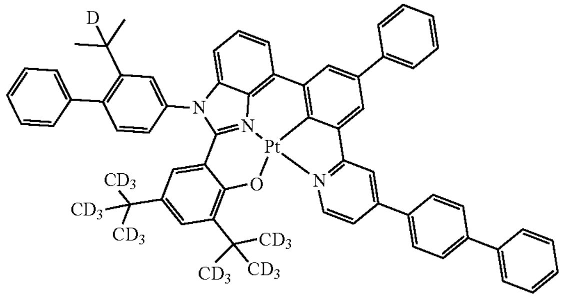
669
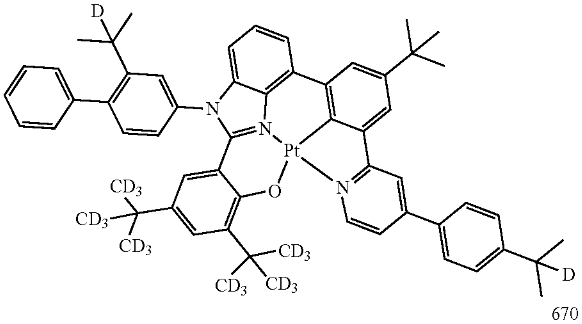
670
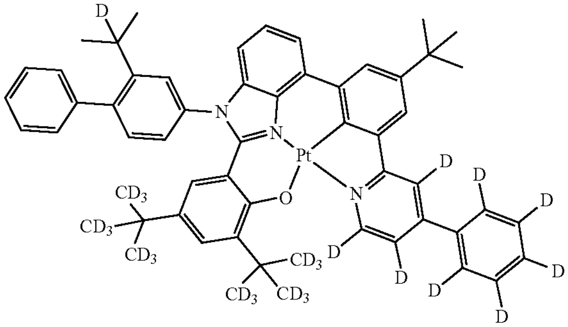

-continued
671
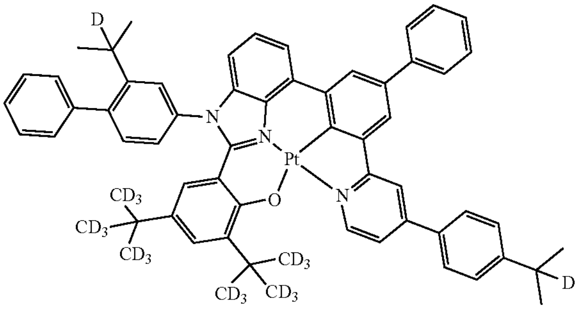
672
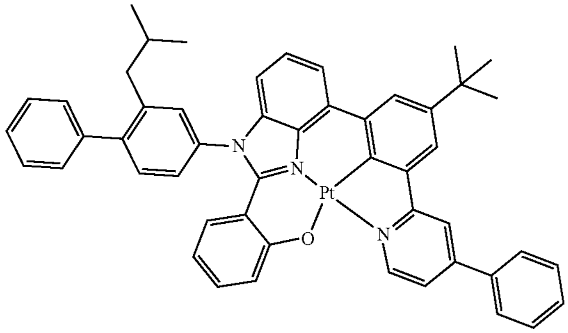
673
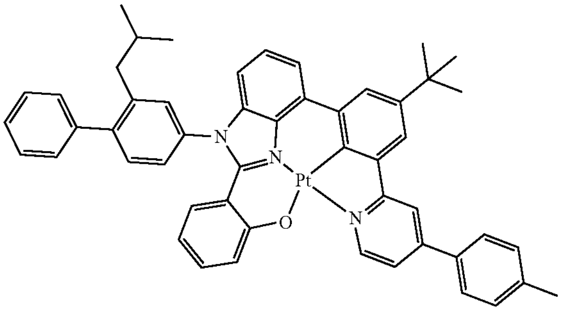
674
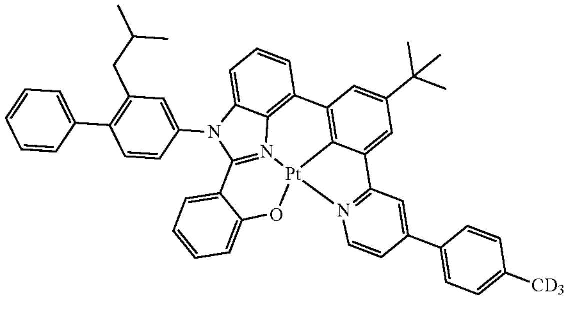
-continued
675
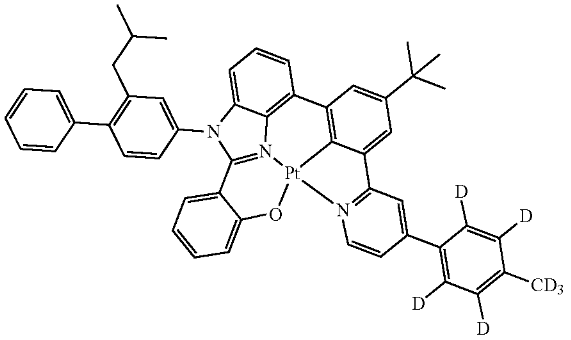
676
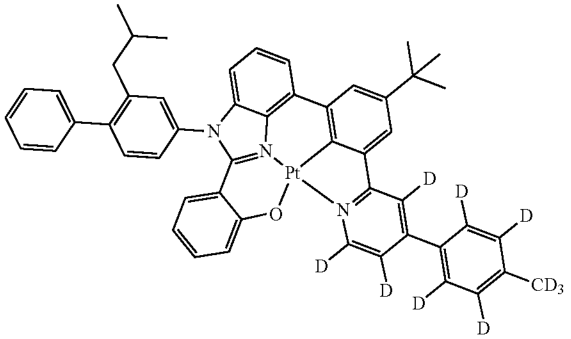
677
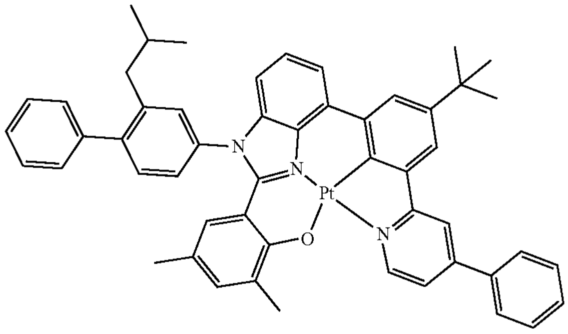
678
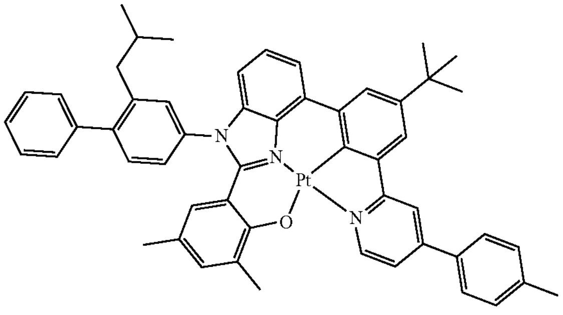

-continued
679
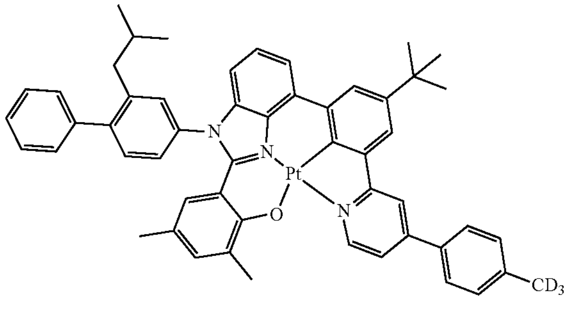
680
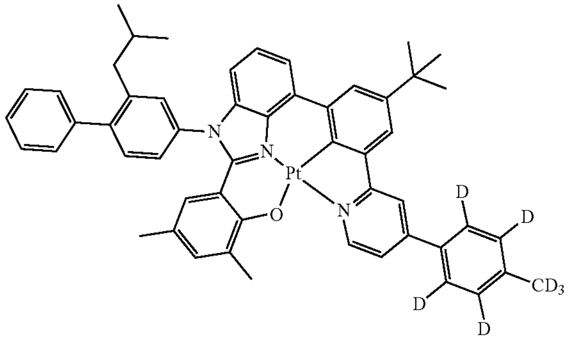
681
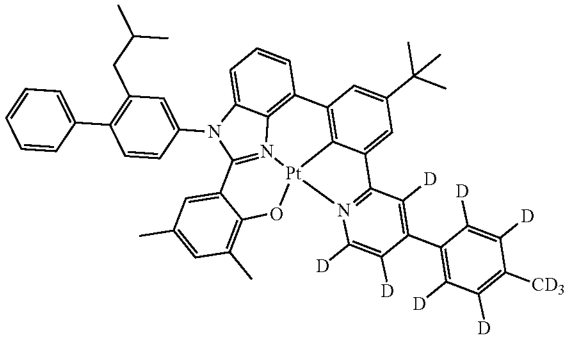
682
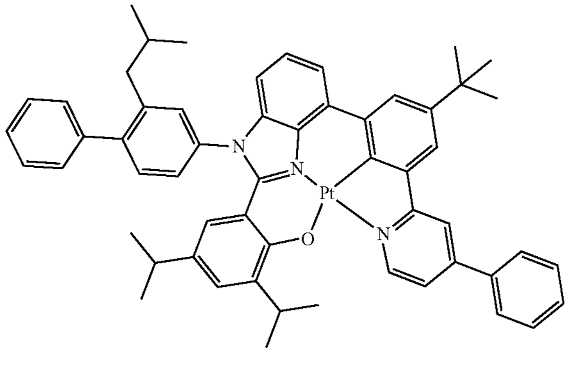
-continued
683
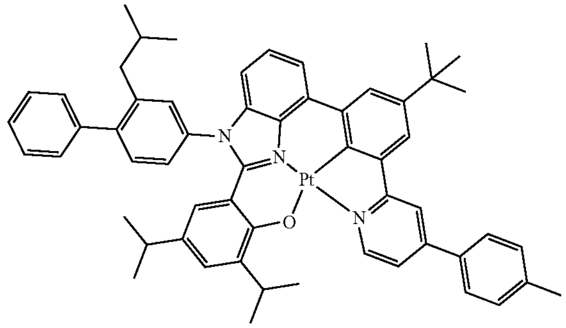
684
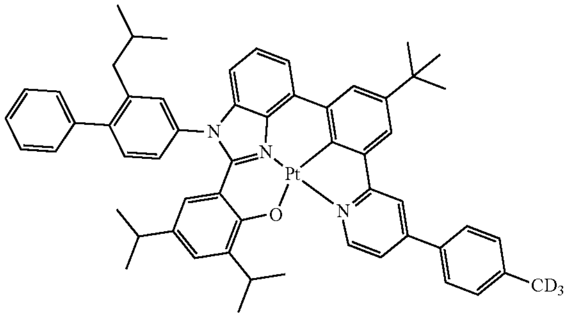
685
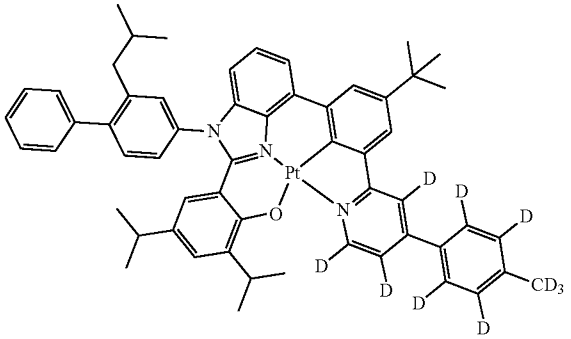
686
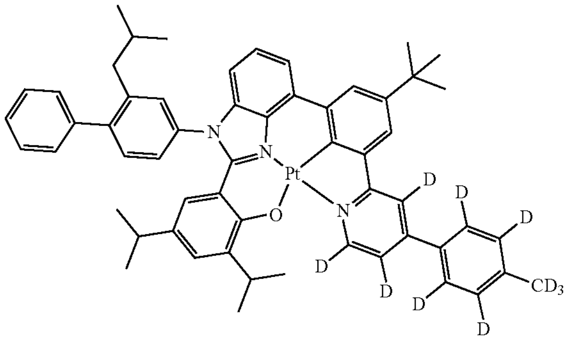

-continued
687
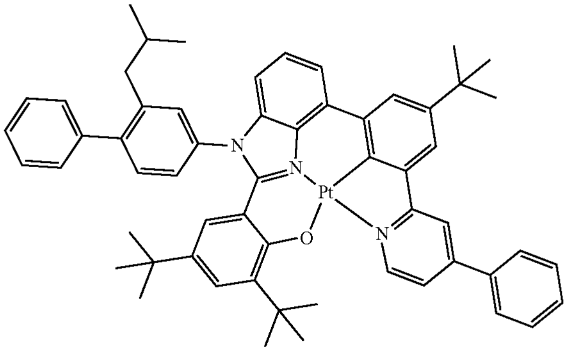
688
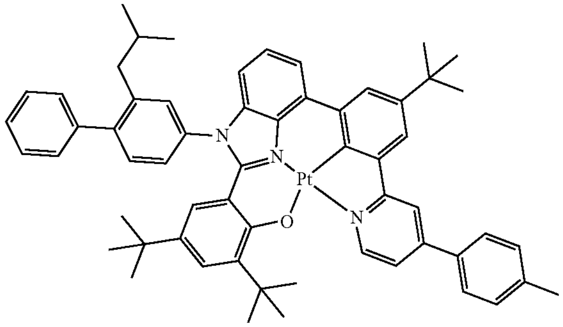
689
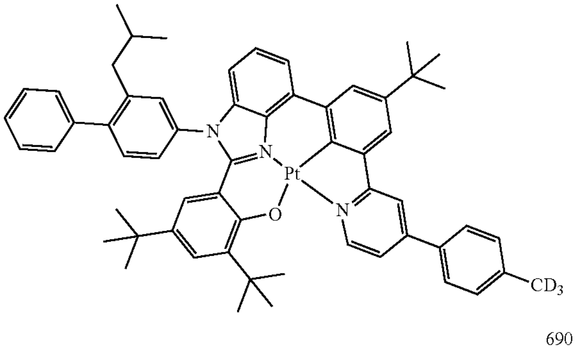
690
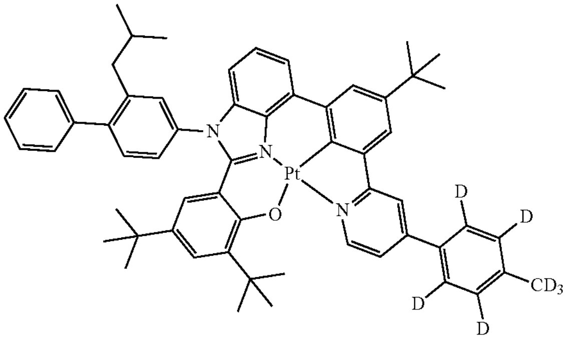
-continued
691
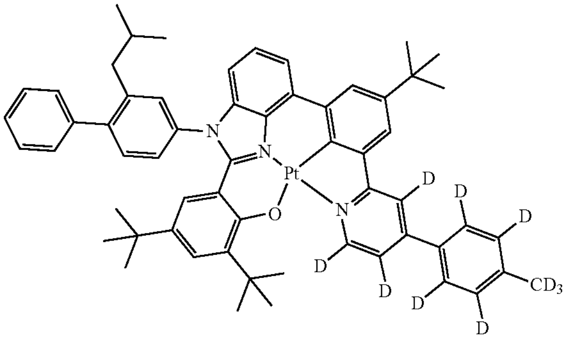
692
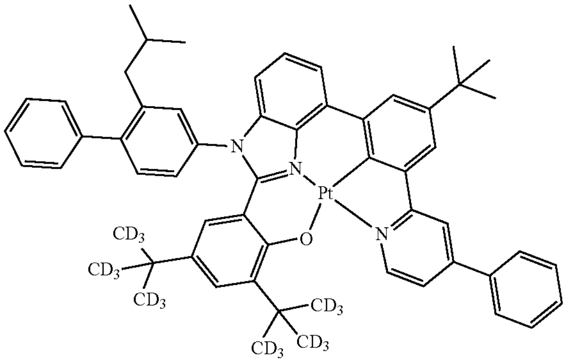
693
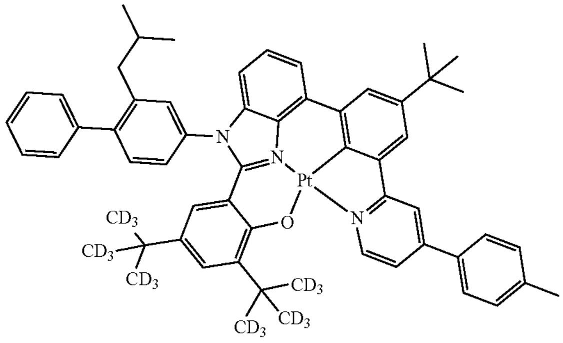
964
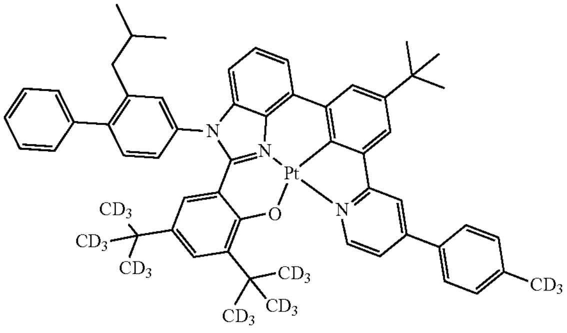

-continued
695
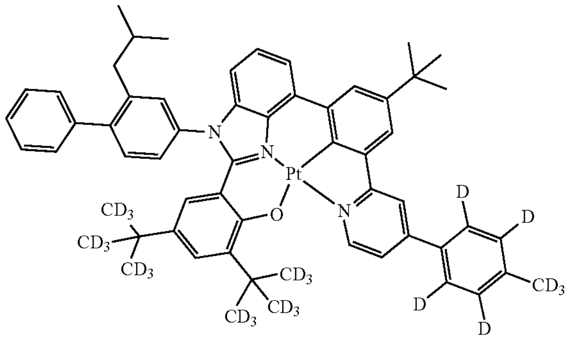
696
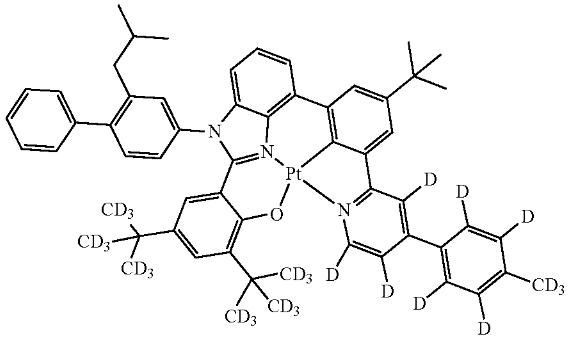
697
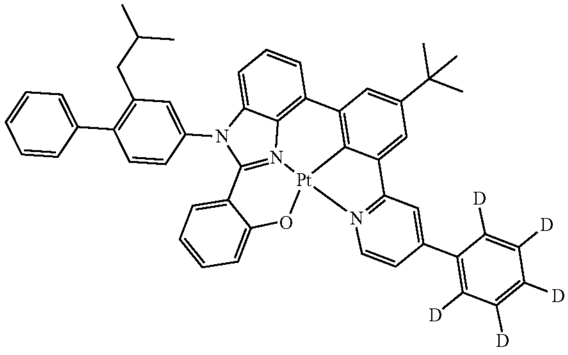
698
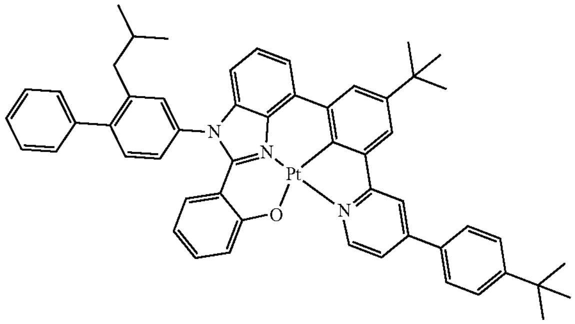
-continued
699
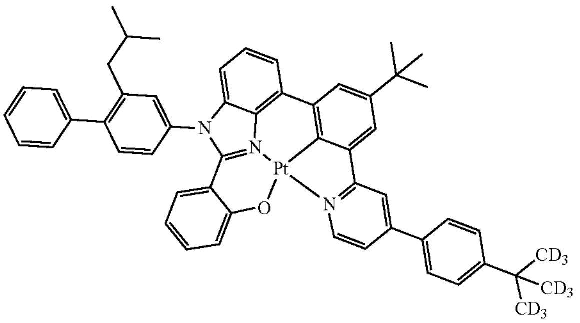
700
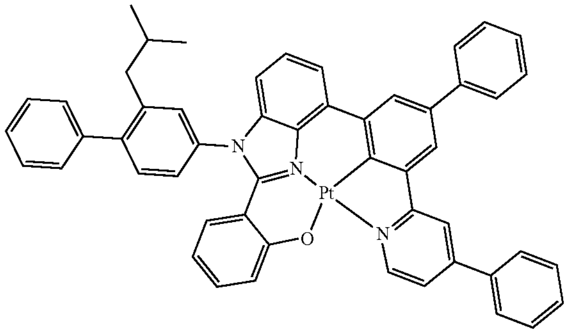
701
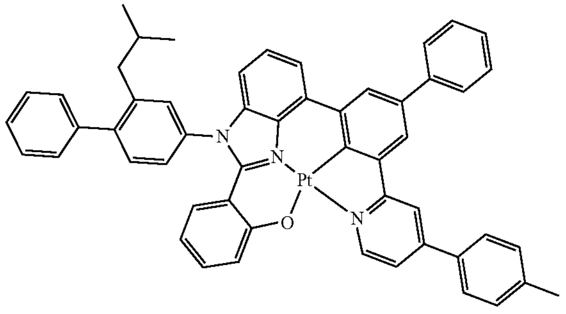
702
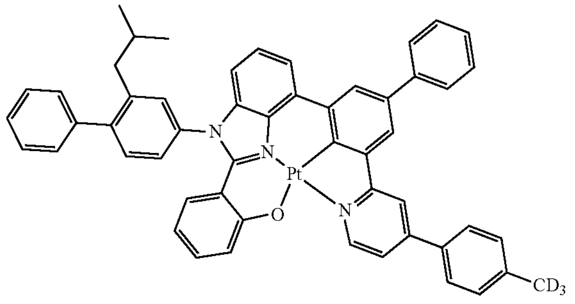

-continued
703
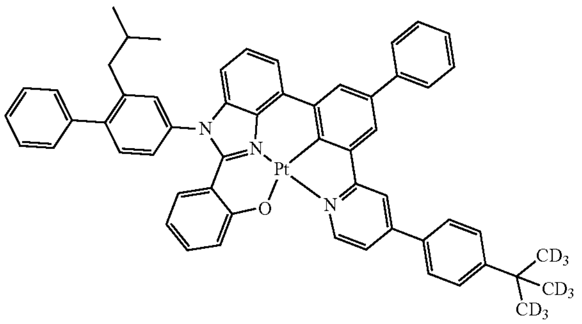
704
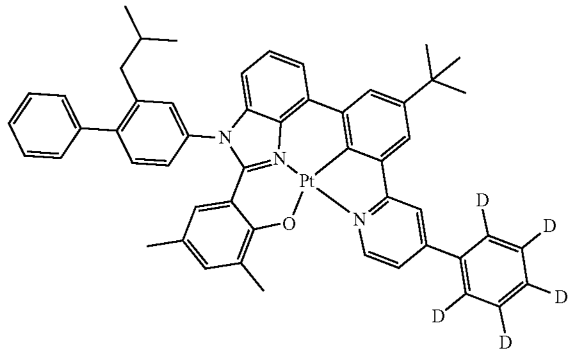
705
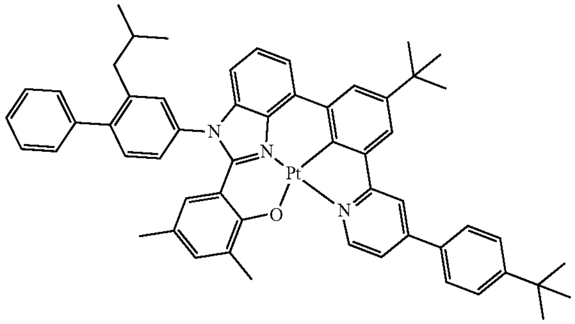
706
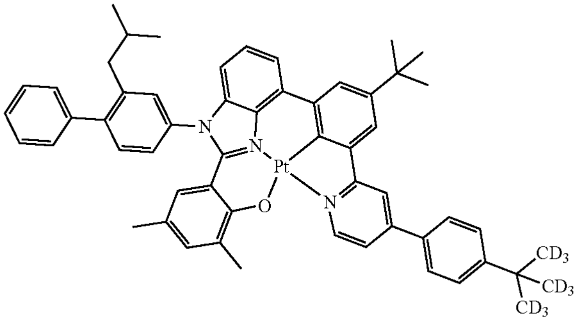
-continued
707
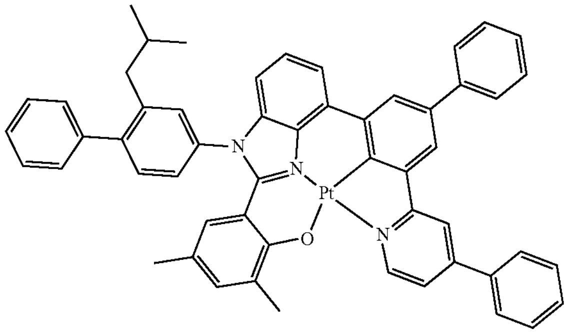
708
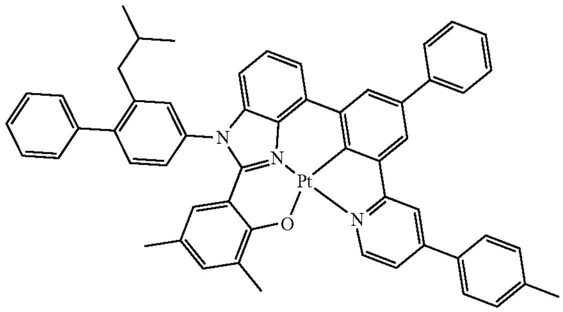
709
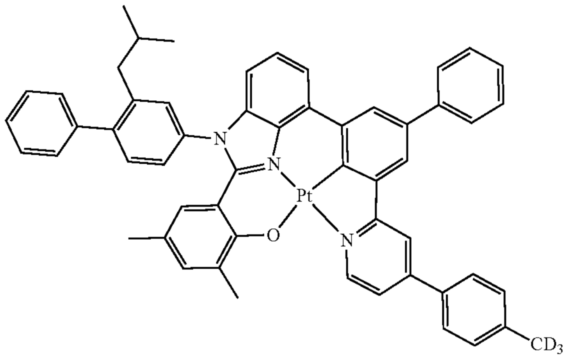
710
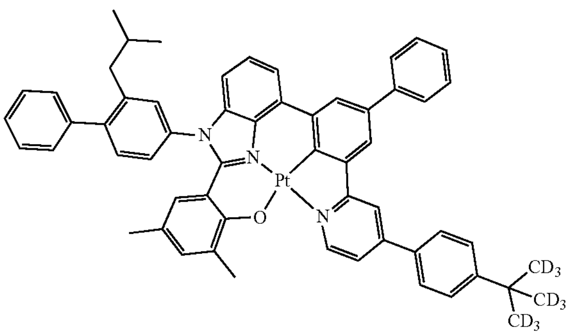

-continued
711
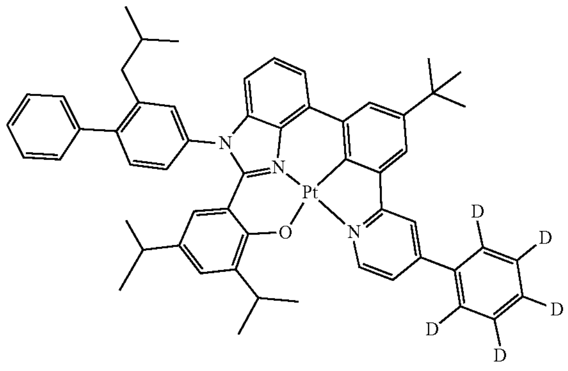
712
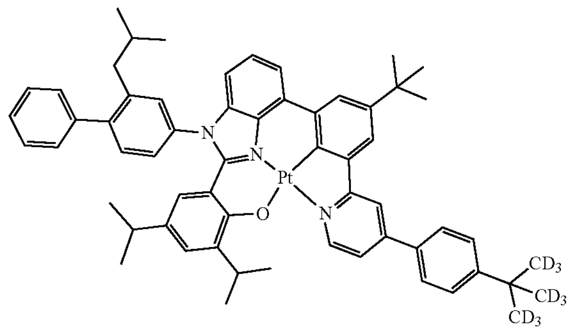
713
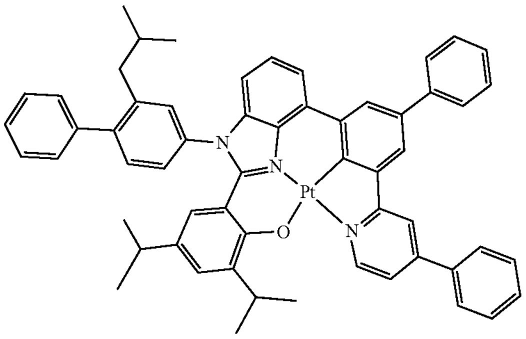
714
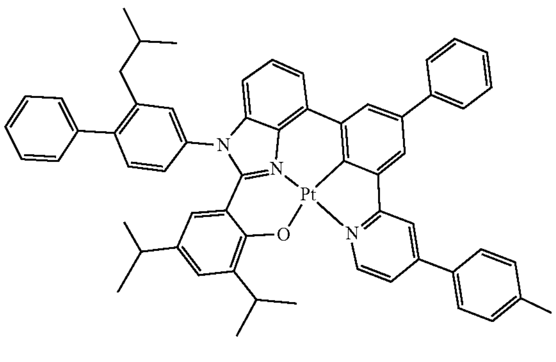
-continued
715
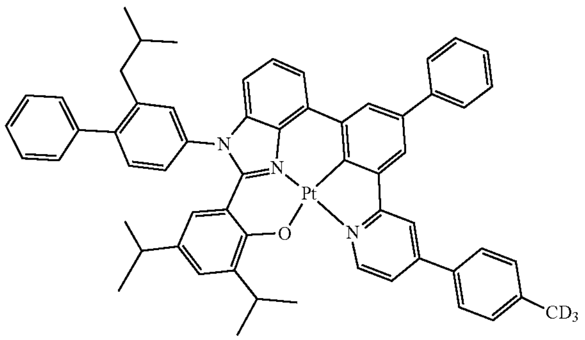
716
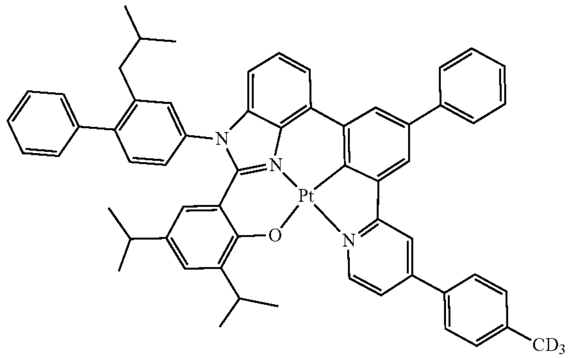
717
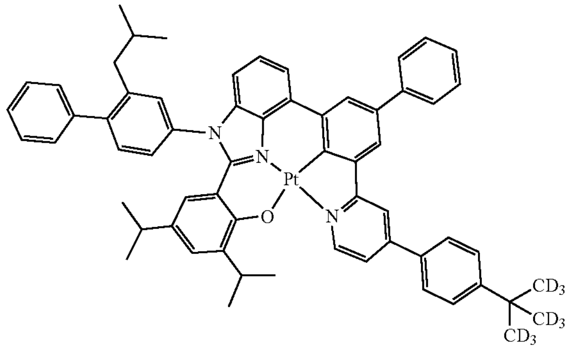
718
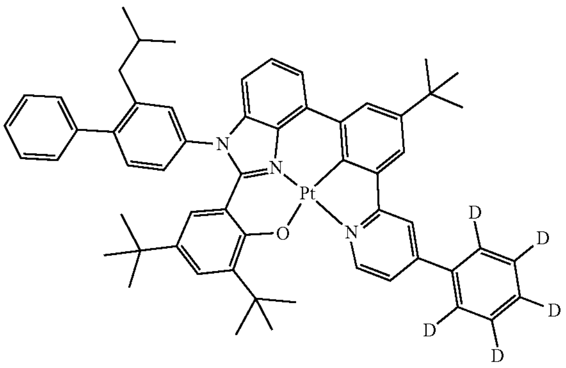

-continued
719
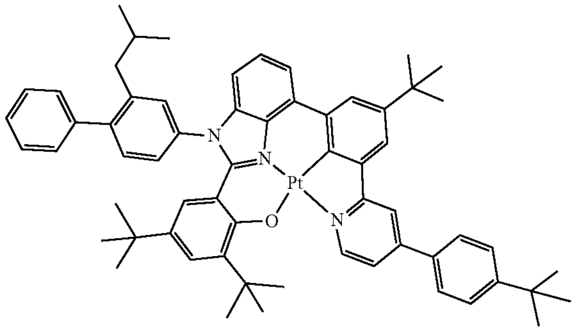
720
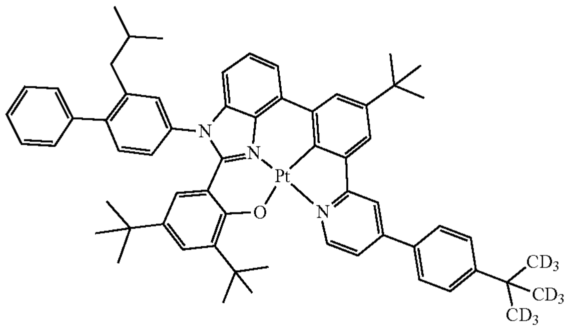
721
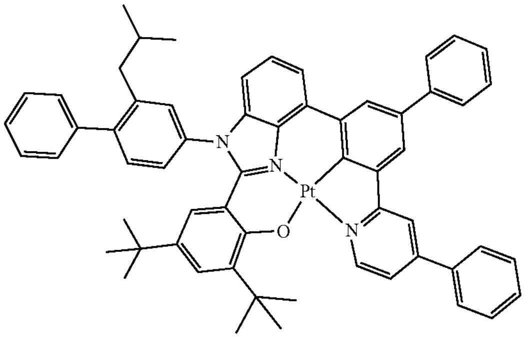
722
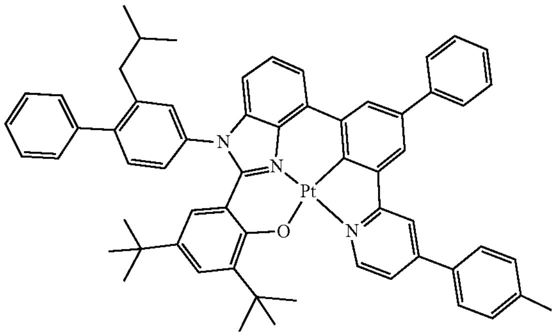
-continued
723
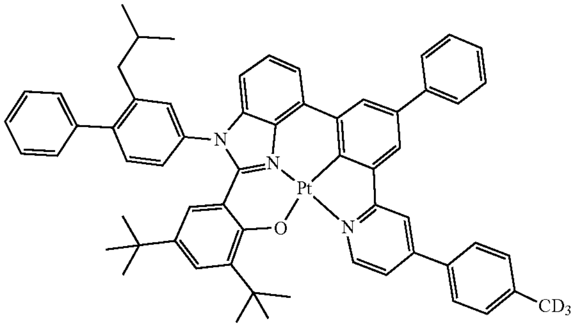
724
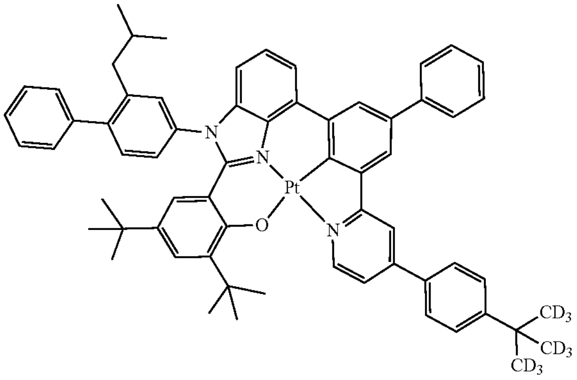
725
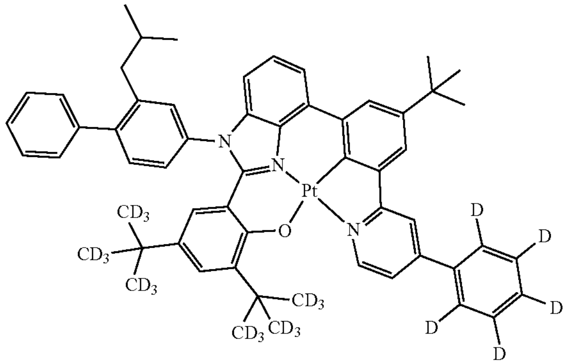
726
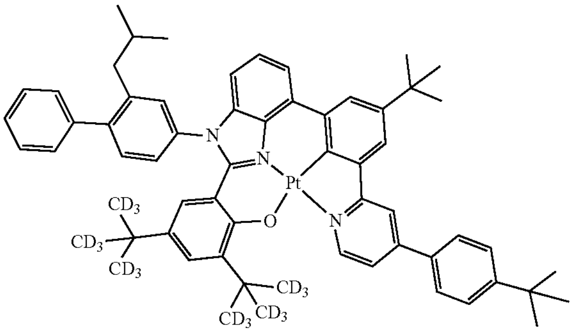

-continued
727
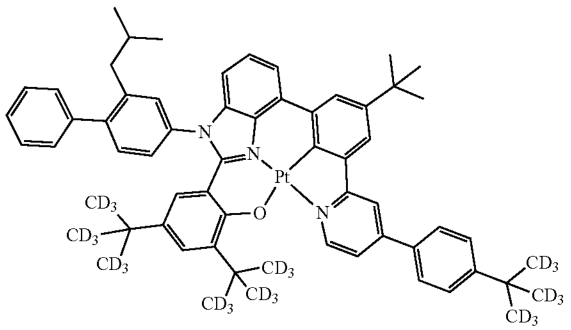
728
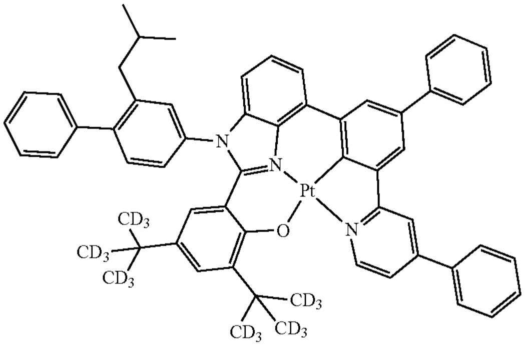
729
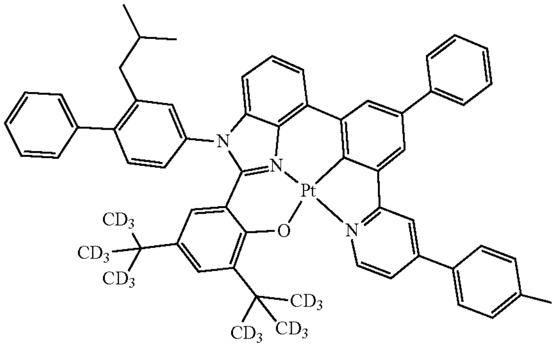
730
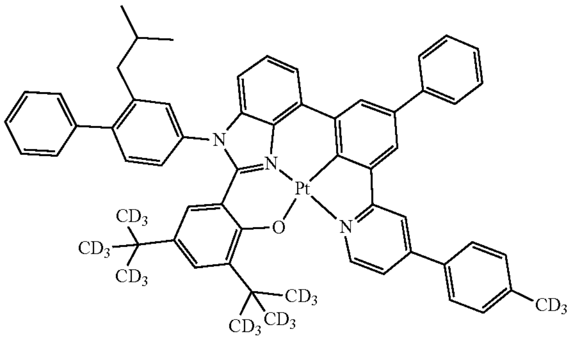
-continued
731
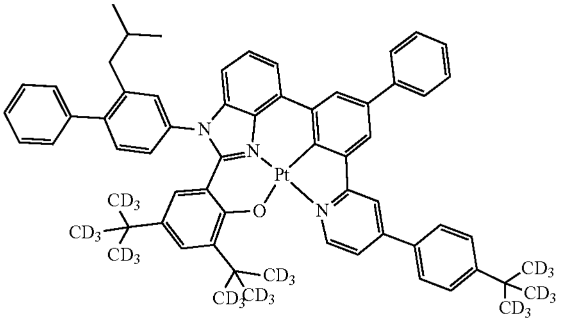
732
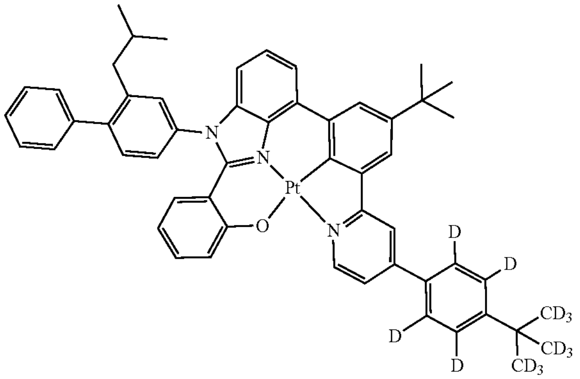
733
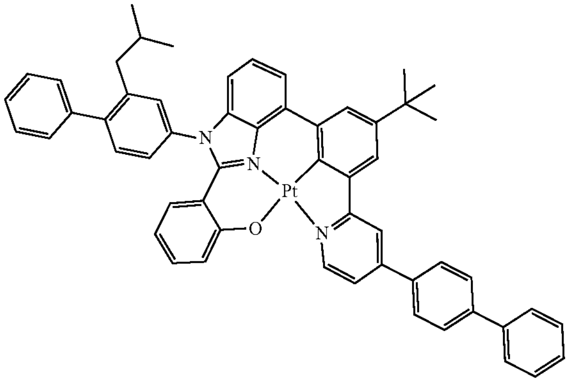
734
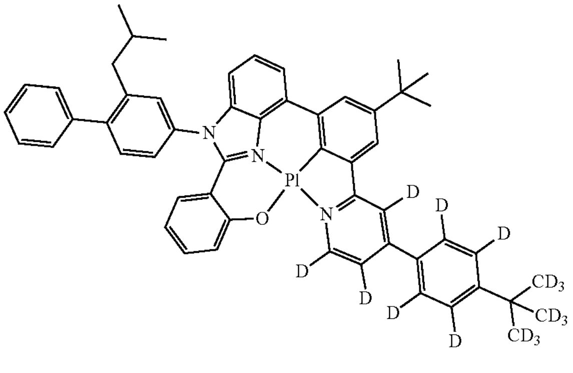

-continued
735
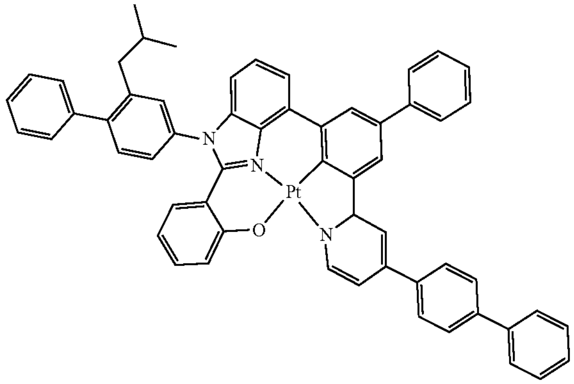
736
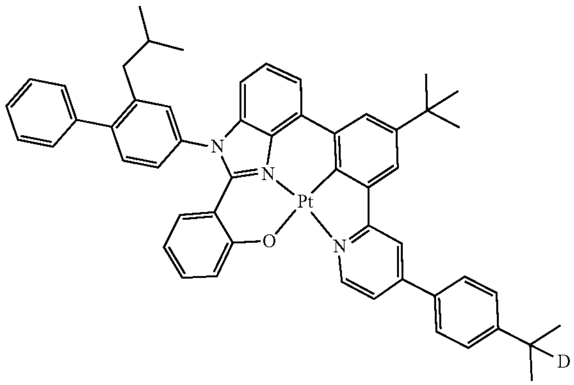
737
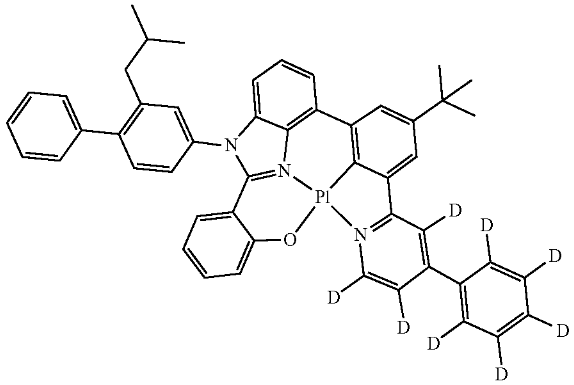
738
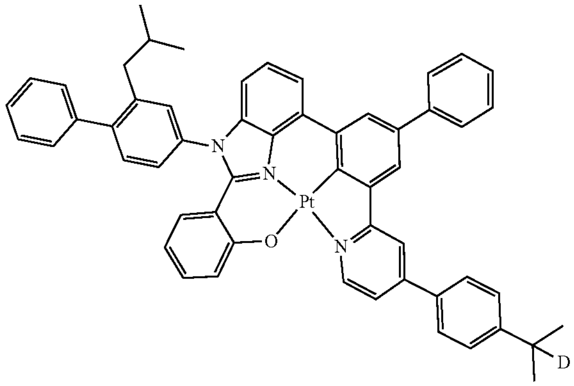
-continued
739
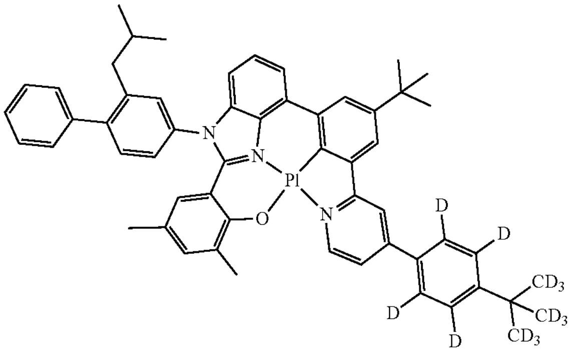
740
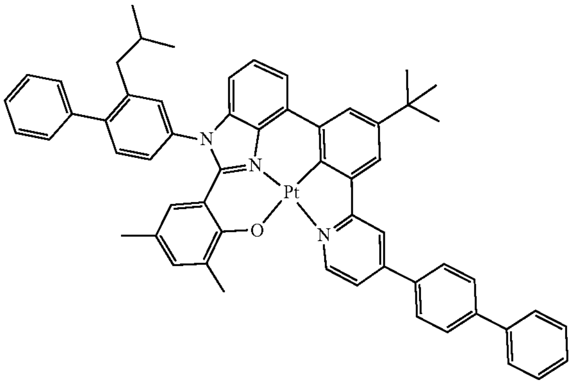
741
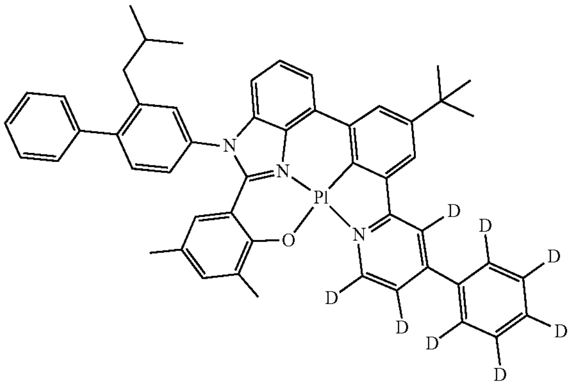
742
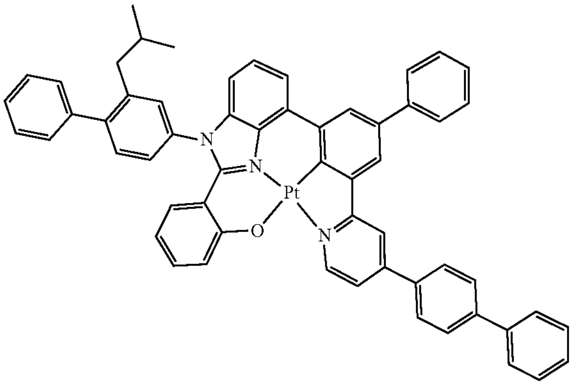

-continued
743
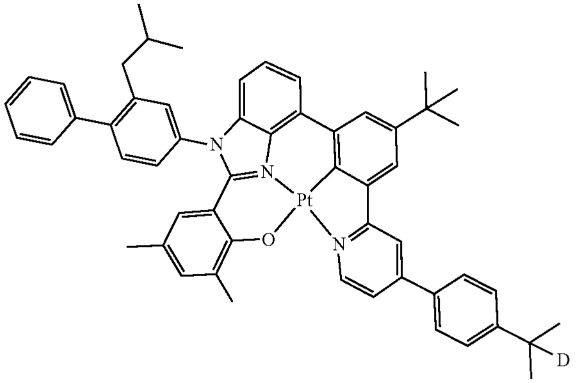
744
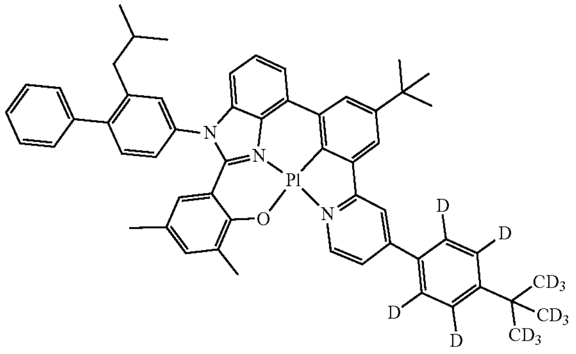
745
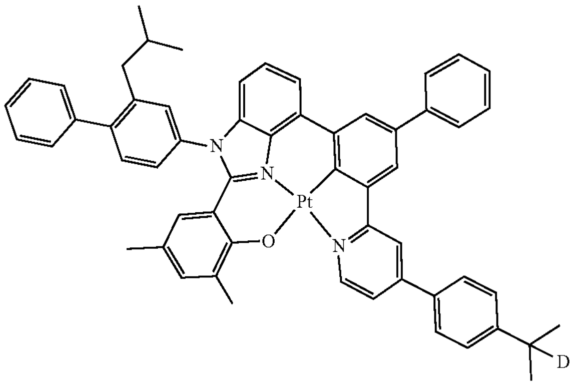
746
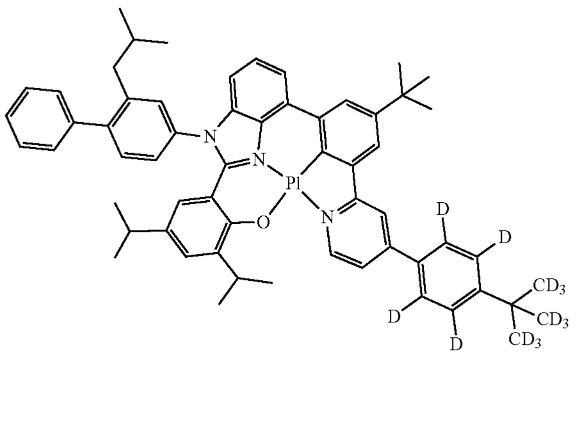
-continued
747
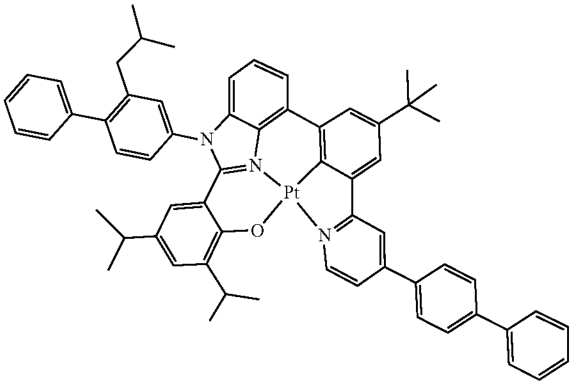
748
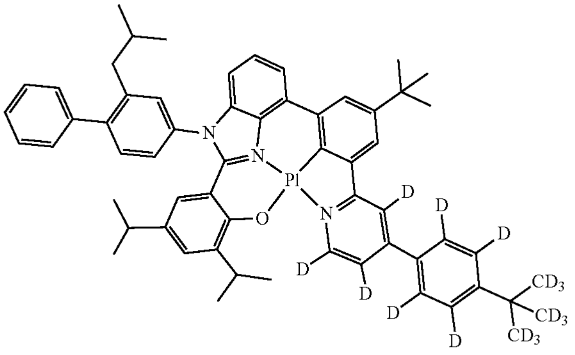
749
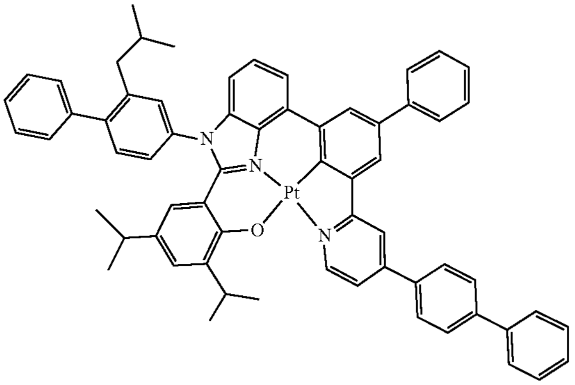
750
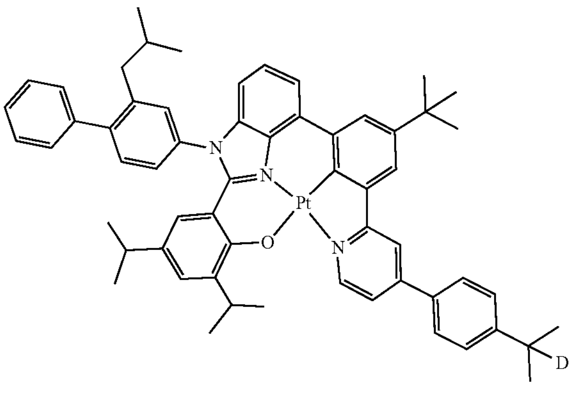

-continued
751
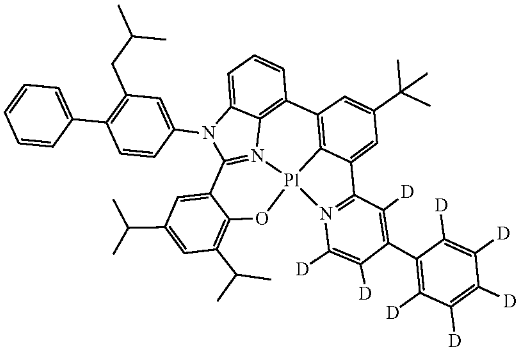
752
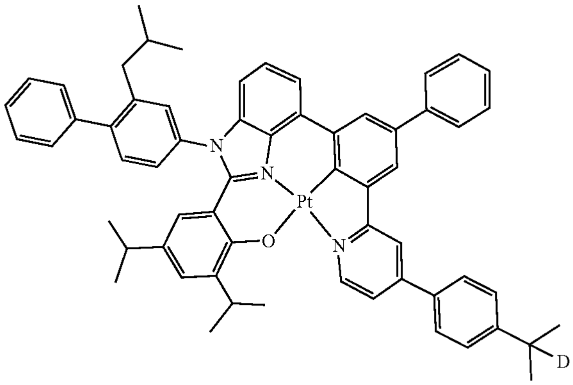
753
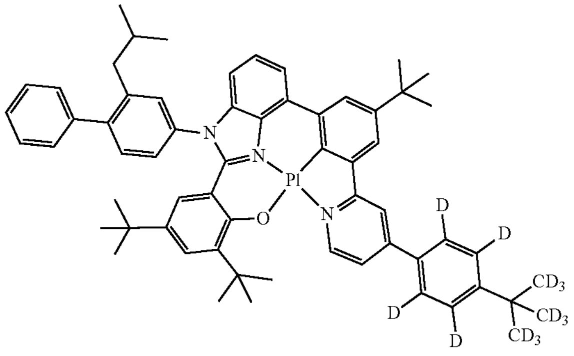
754
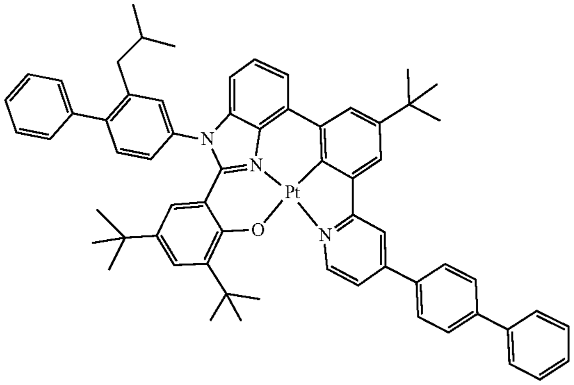
-continued
755
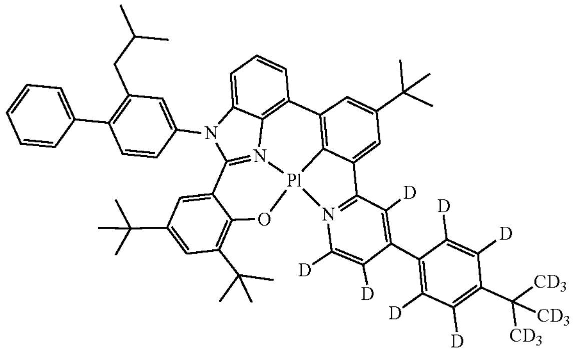
756
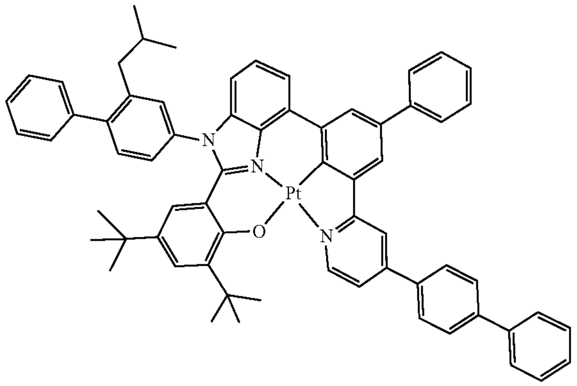
757
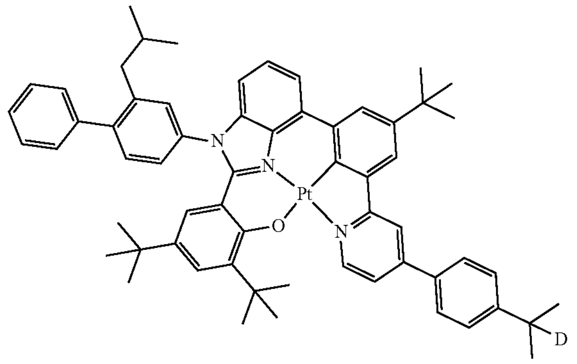

-continued
758
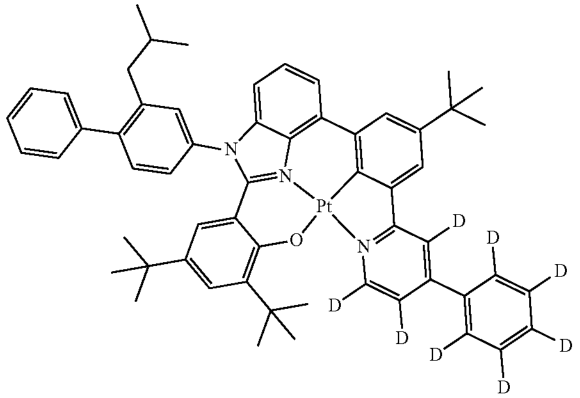
759
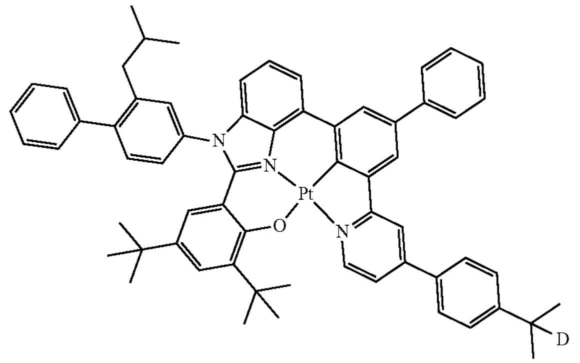
760
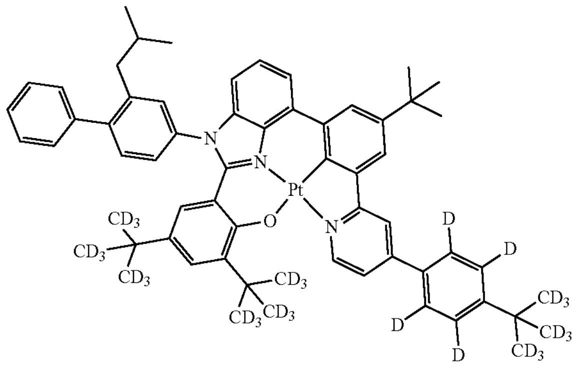
761
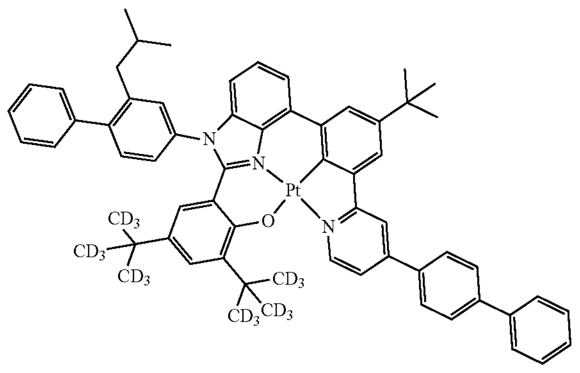
-continued
762
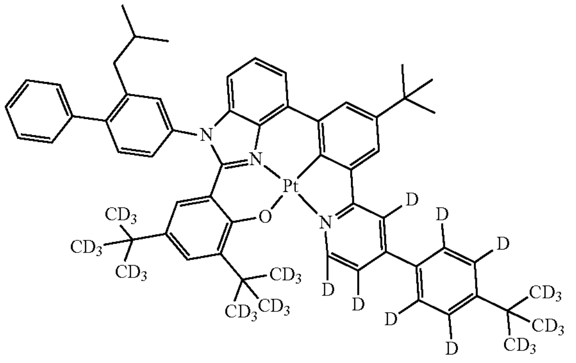
763
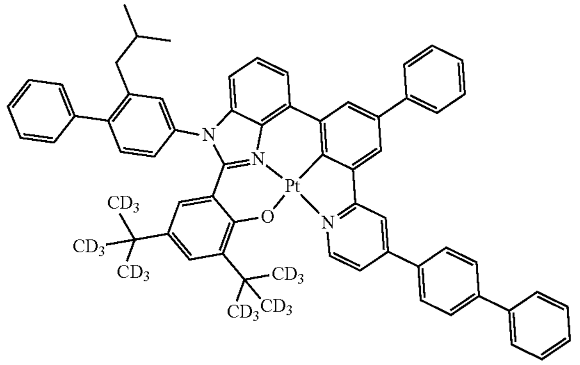
764
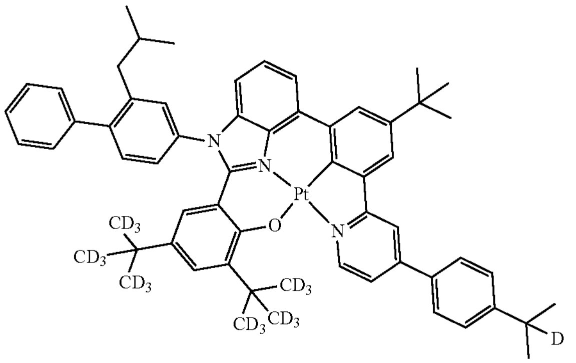
765
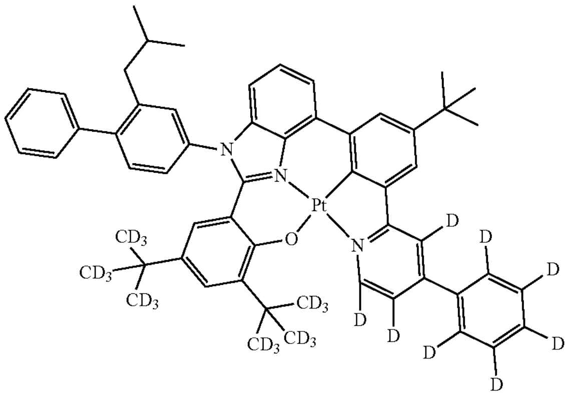

-continued
766
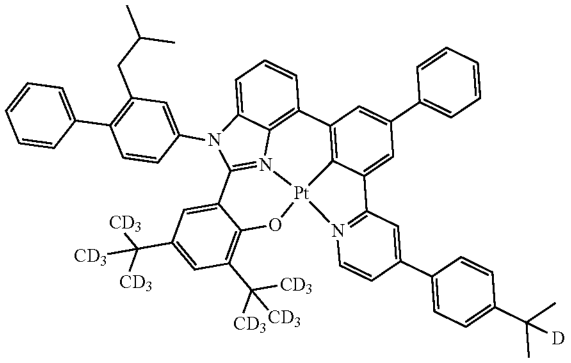
767
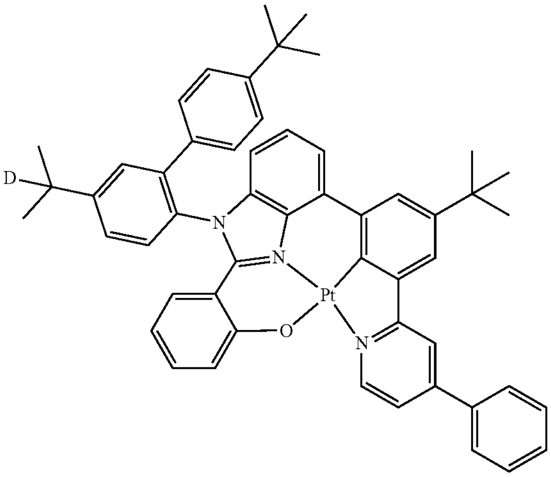
768
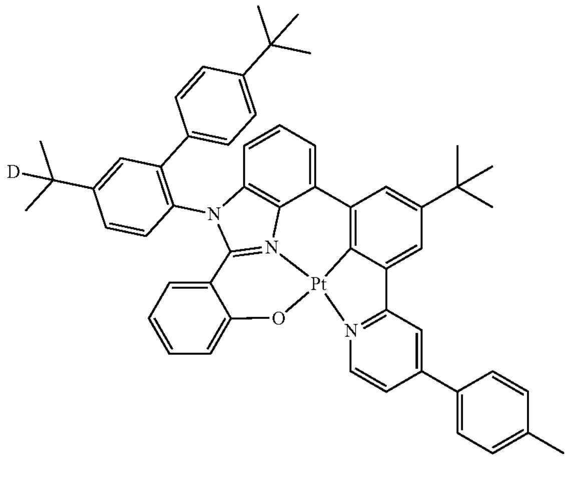
-continued
769
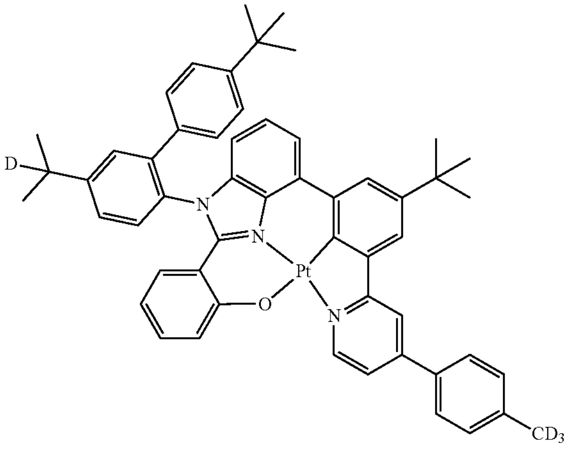
770
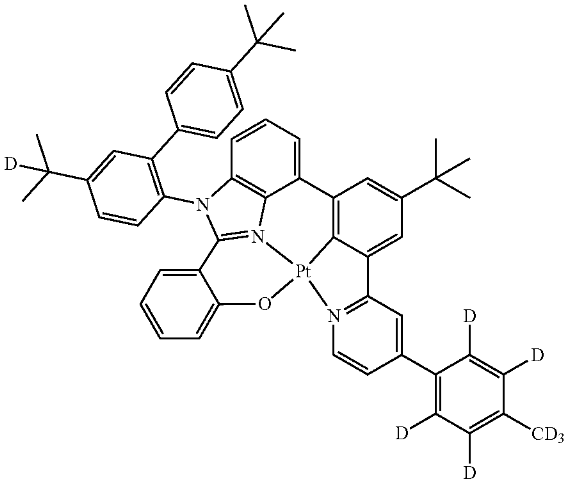
771
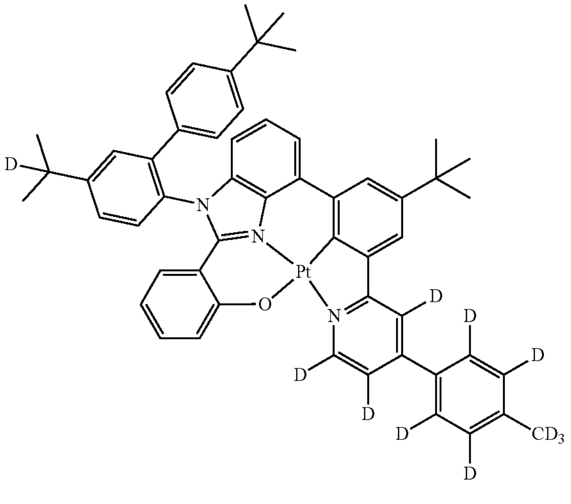

-continued
772
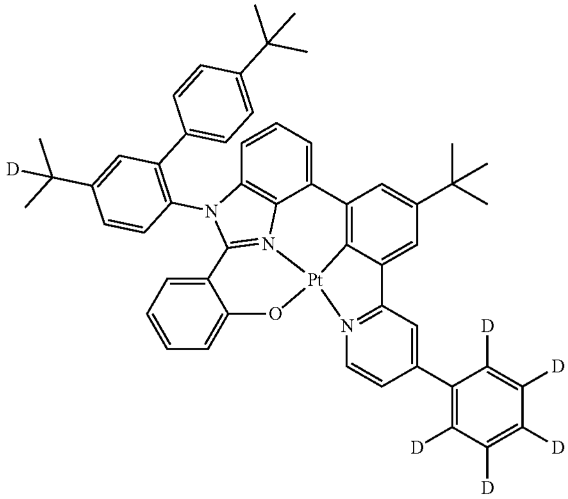
773
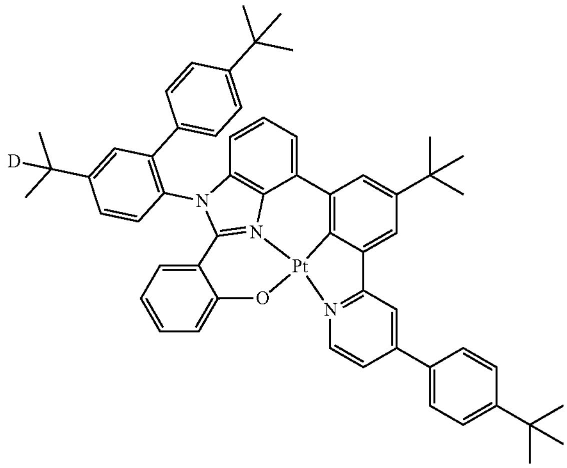
774
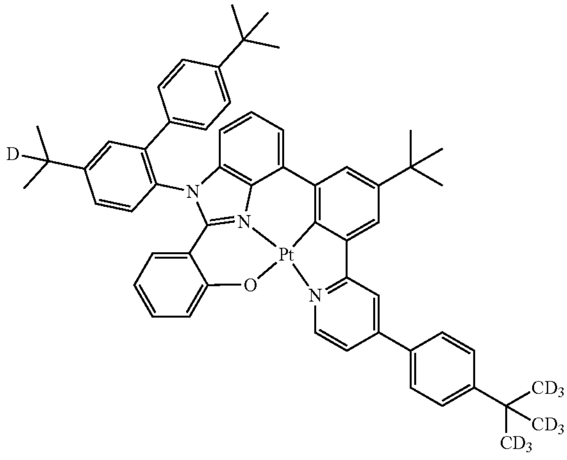
-continued
775
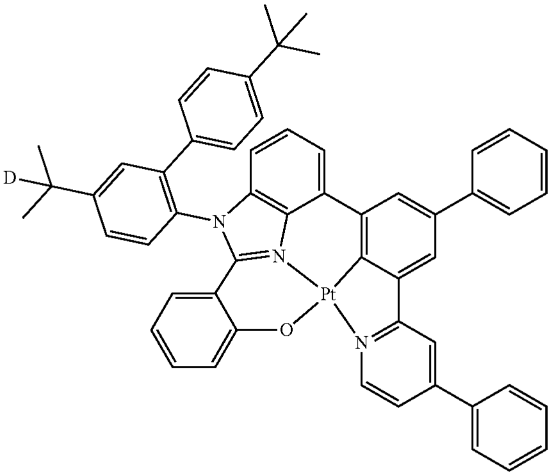
776
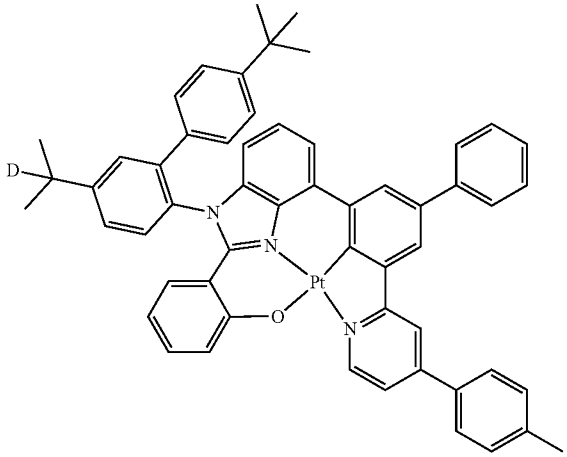
777
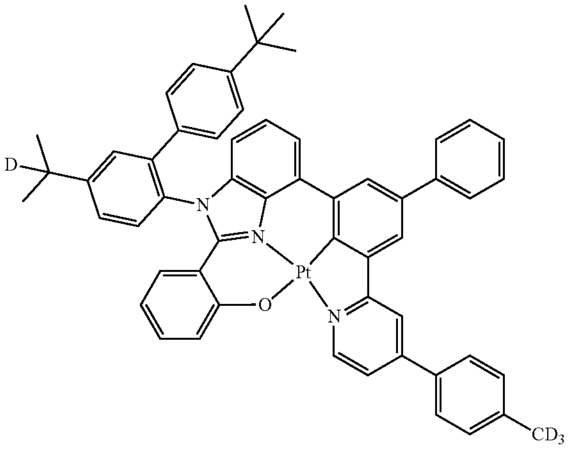

-continued
778
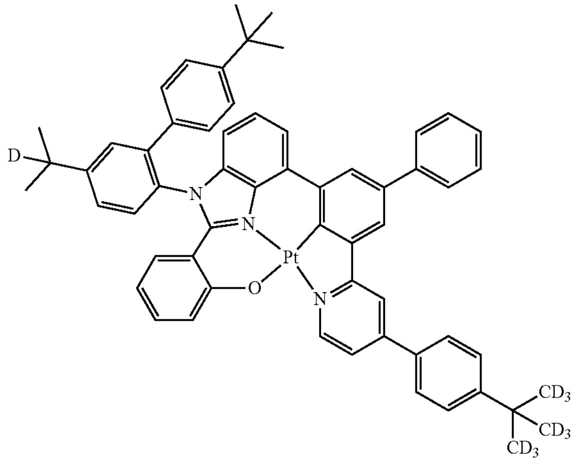
779
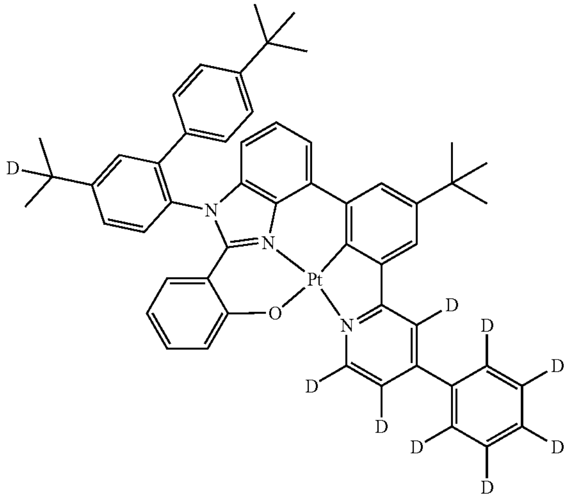
780
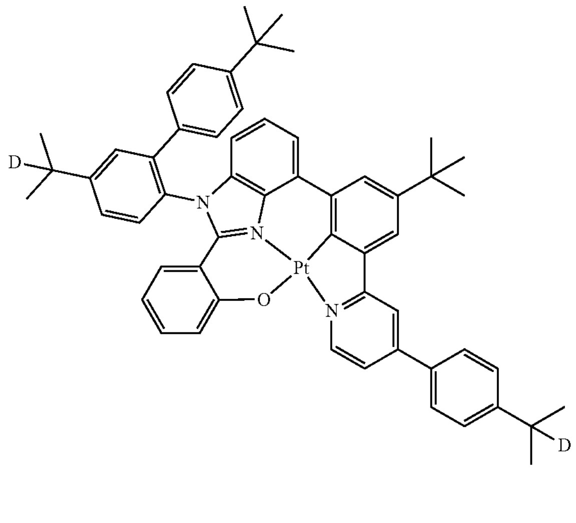
-continued
781
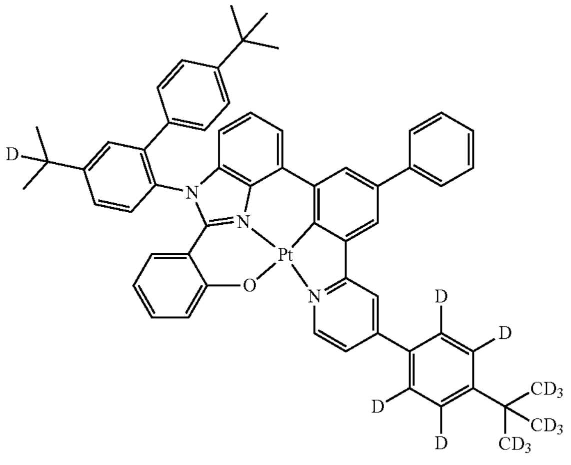
782
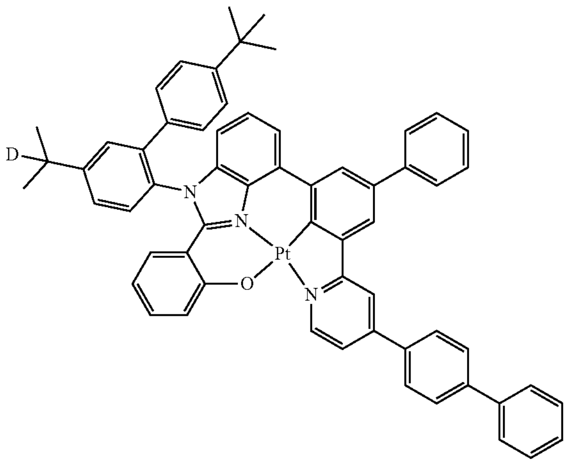
783
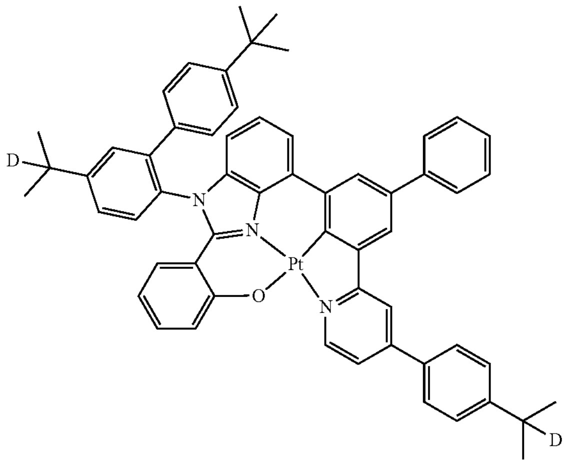

-continued
784
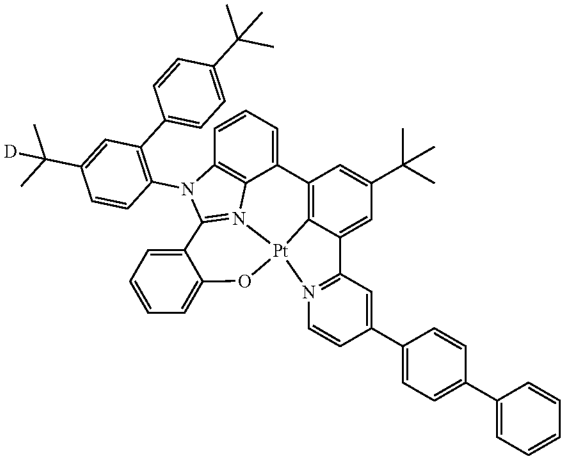
758
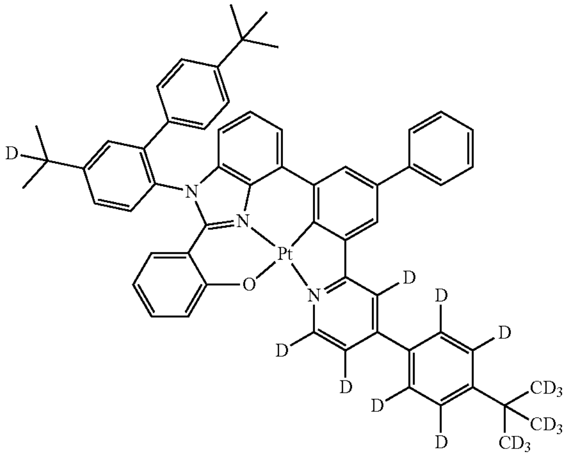
786
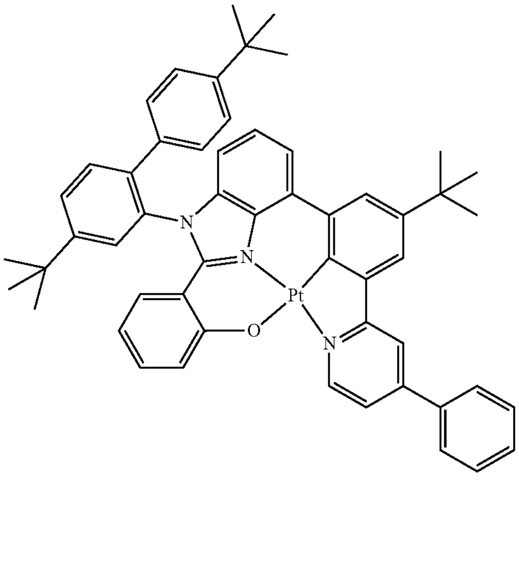
-continued
787
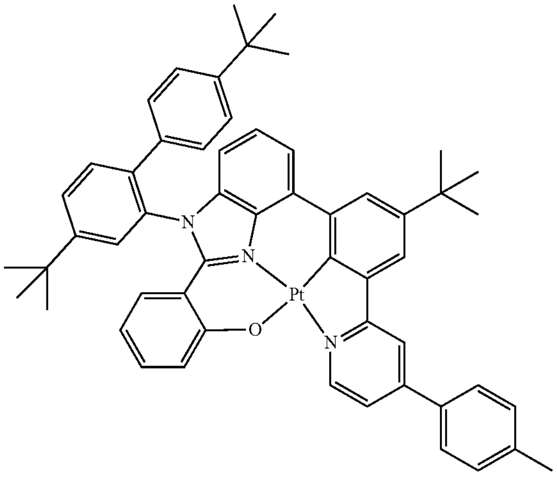
788
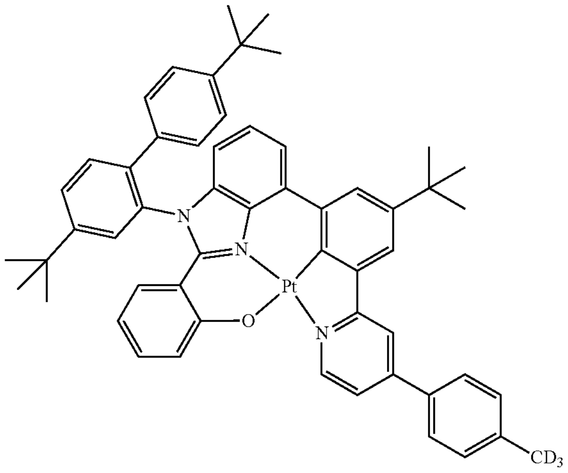
789
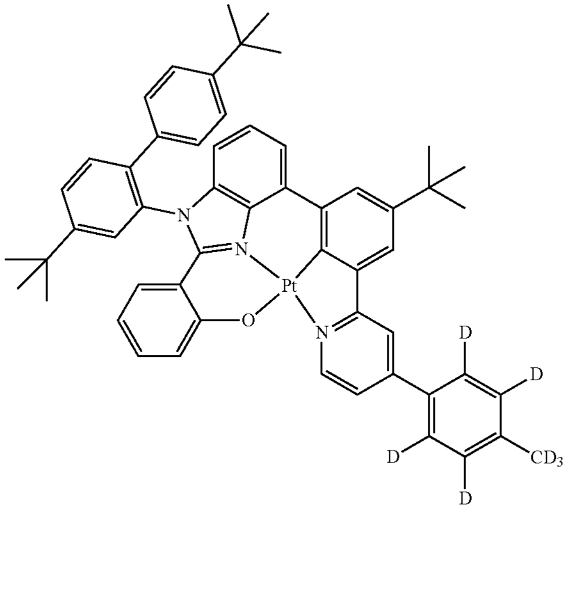

-continued
790
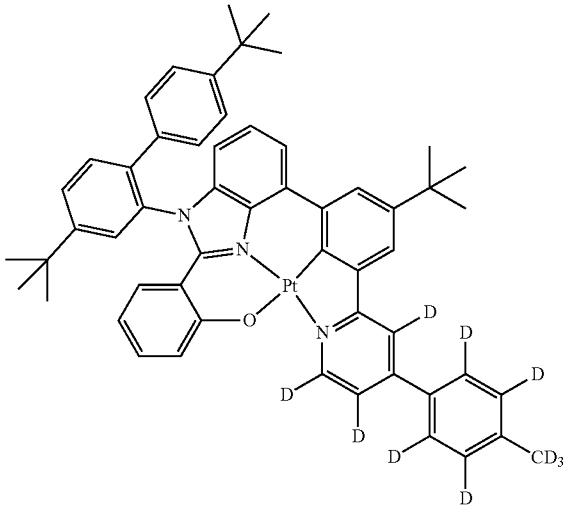
791
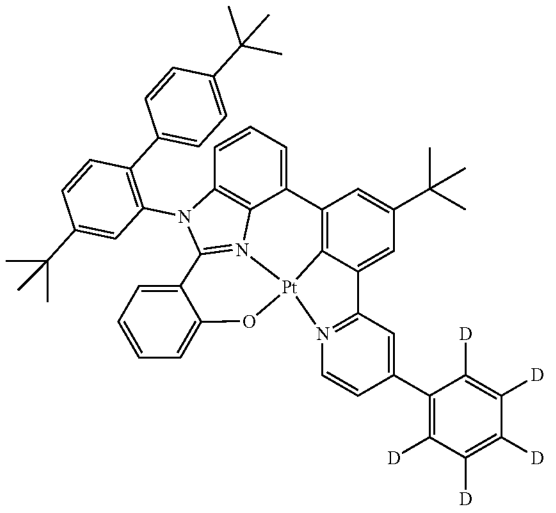
792
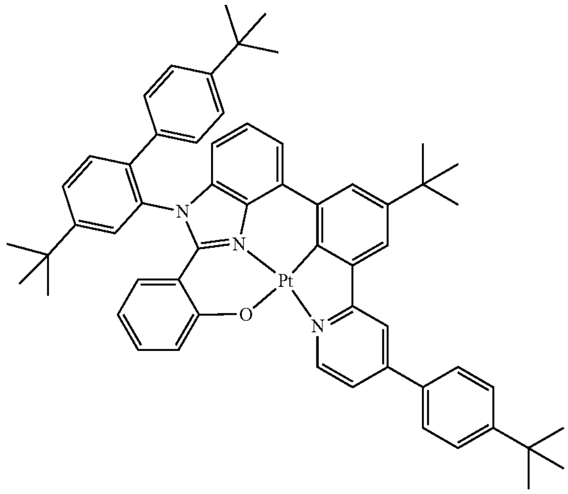
-continued
793
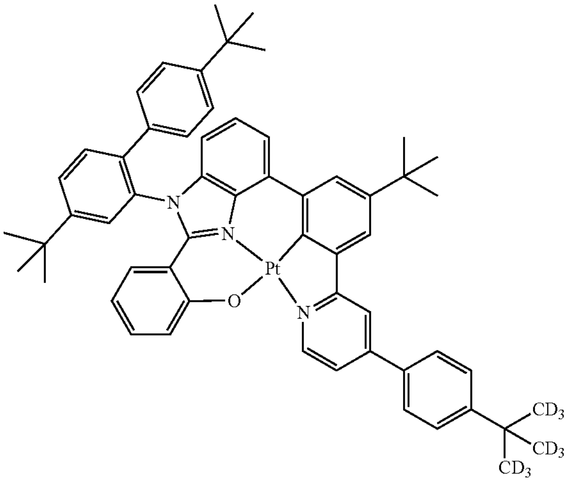
794
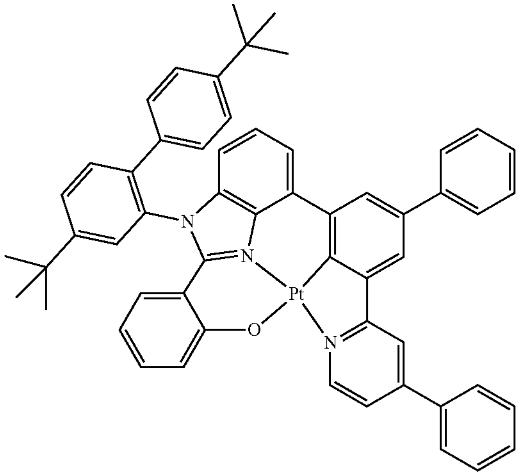
795
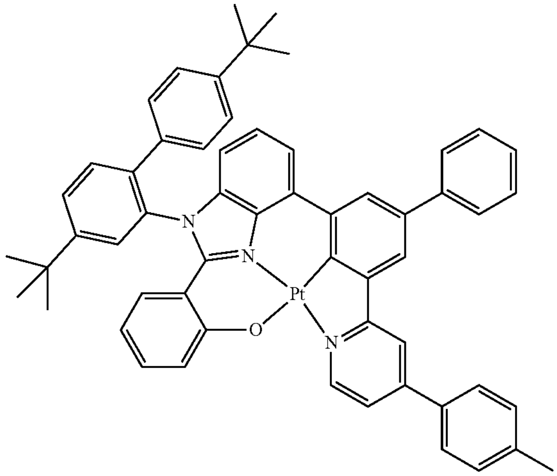

-continued
796
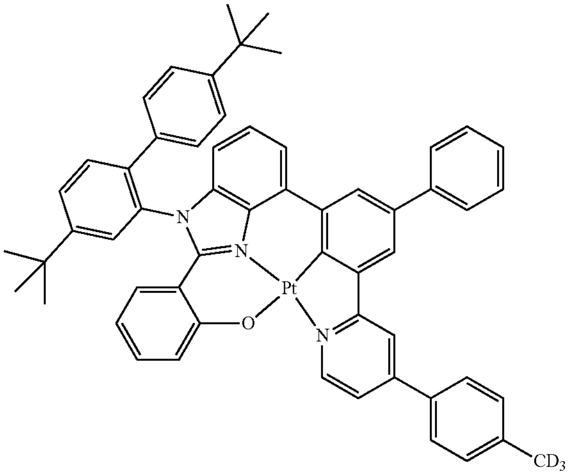
797
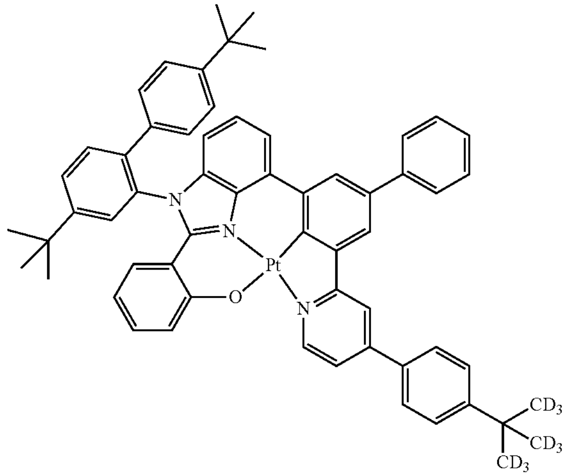
798
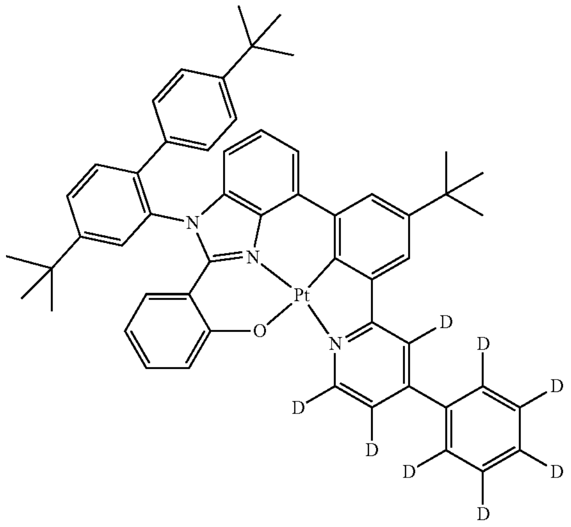
-continued
799
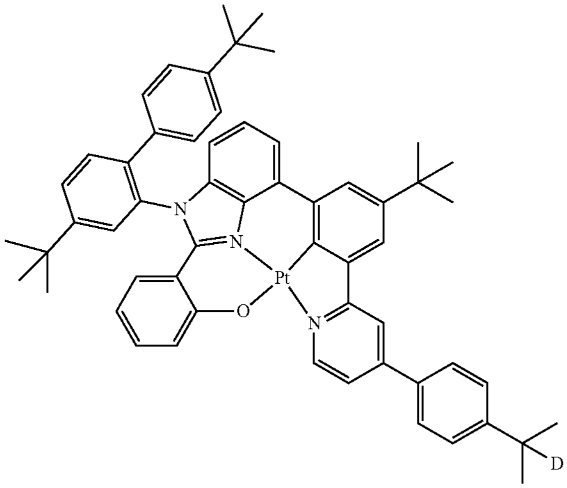
800
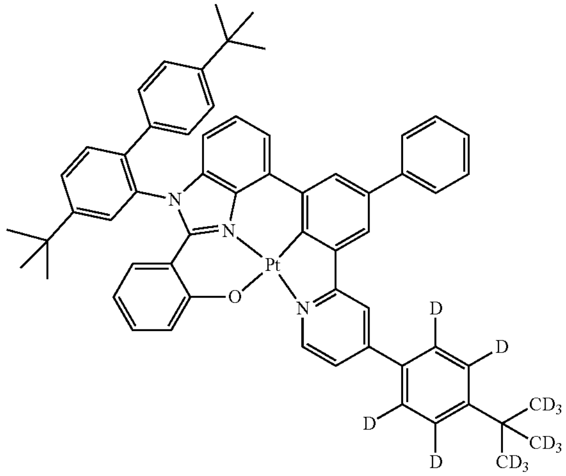
801
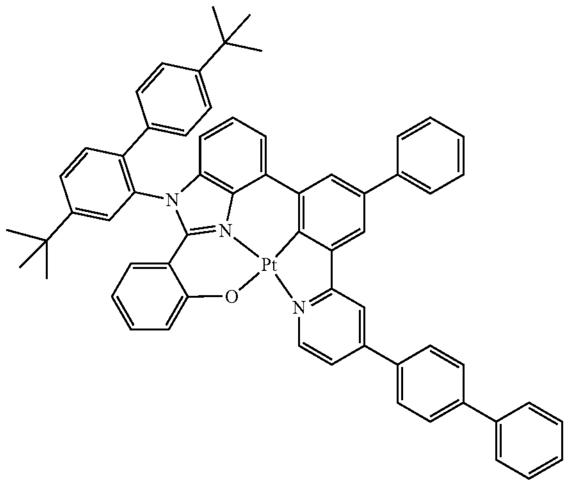

-continued
802
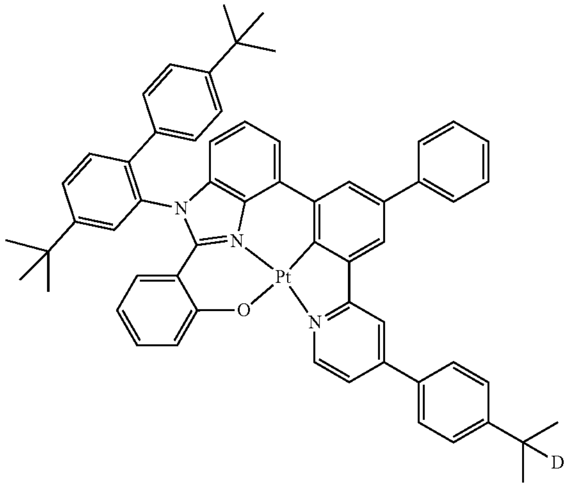
803
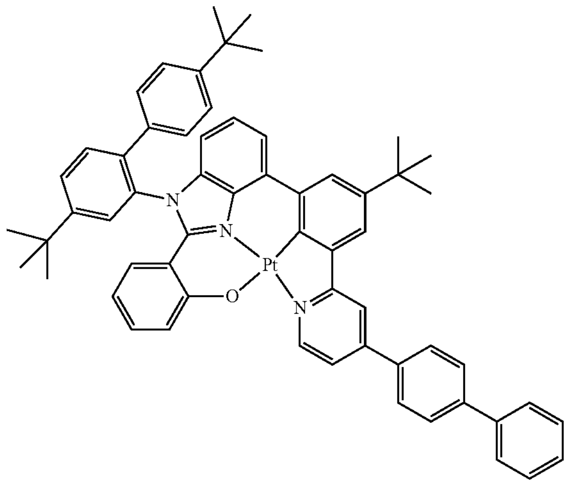
804
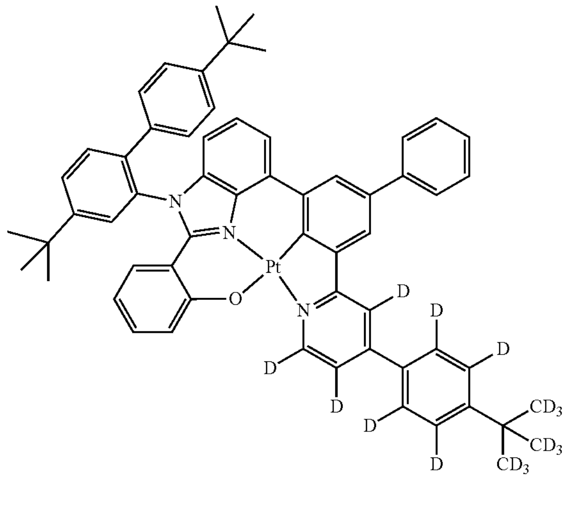
-continued
805
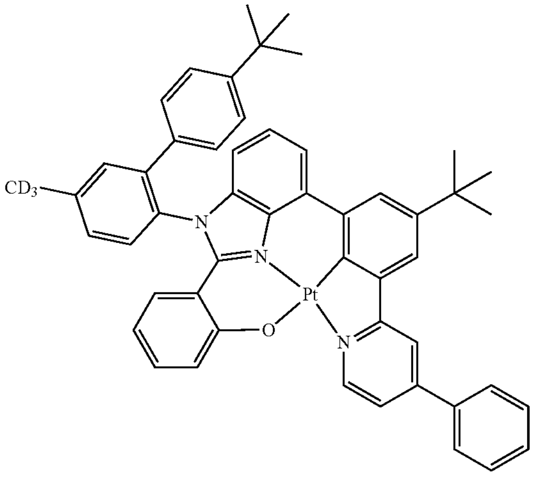
806
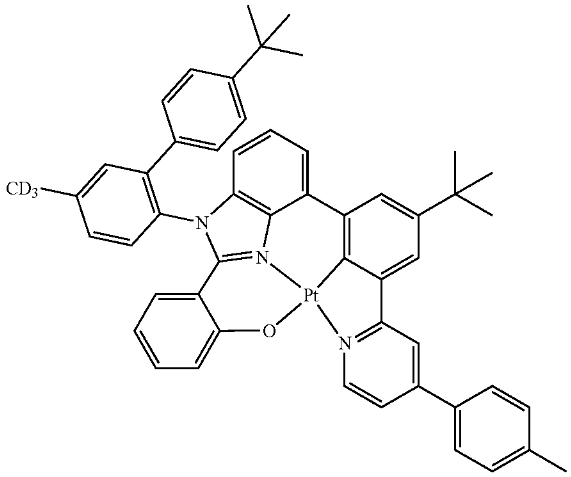
807
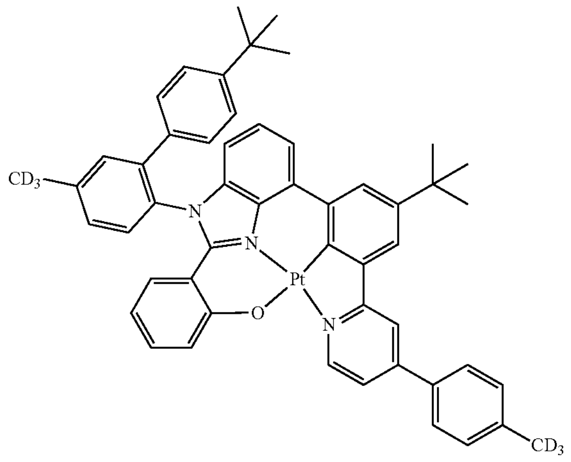

808
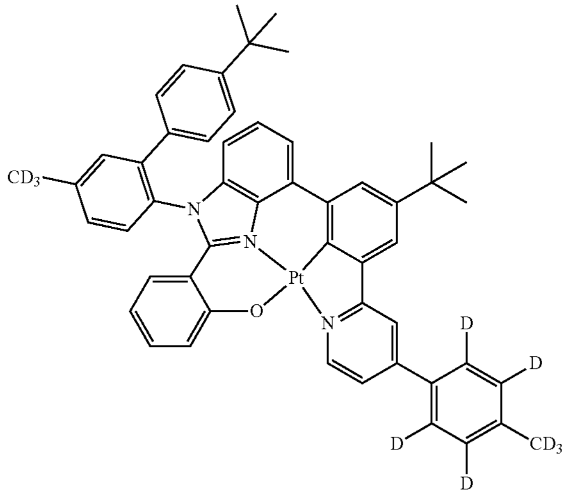
809
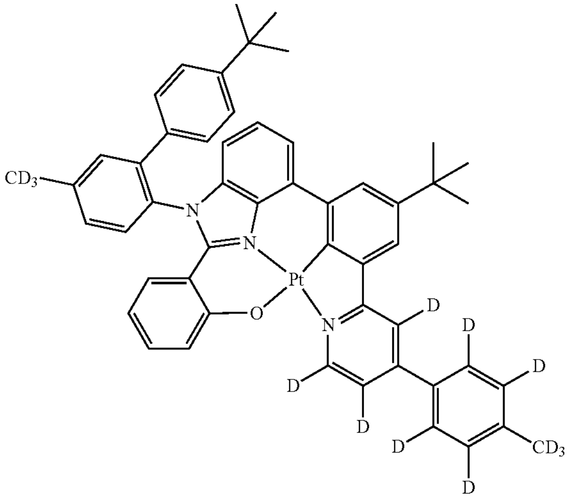
810
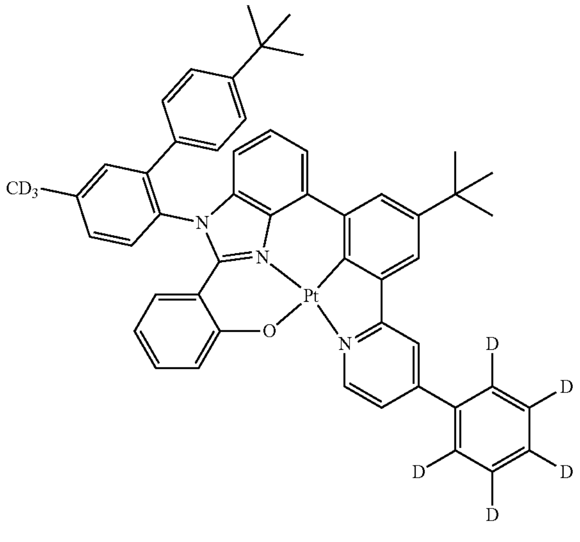
811
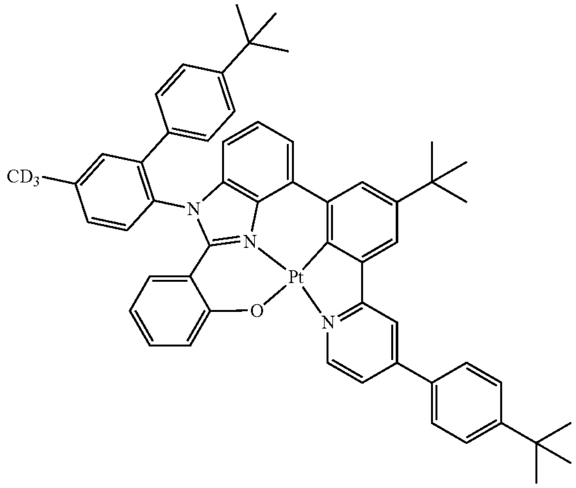
812
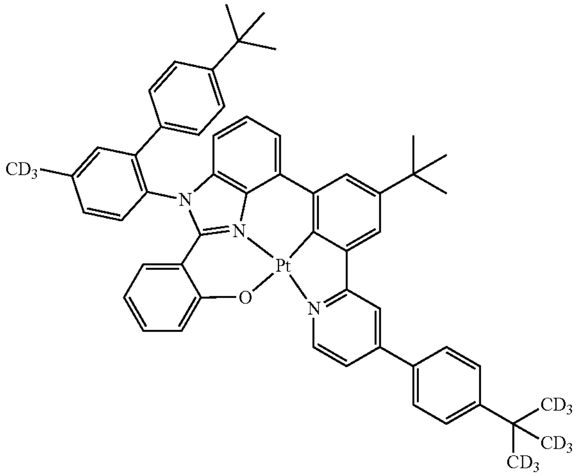
813
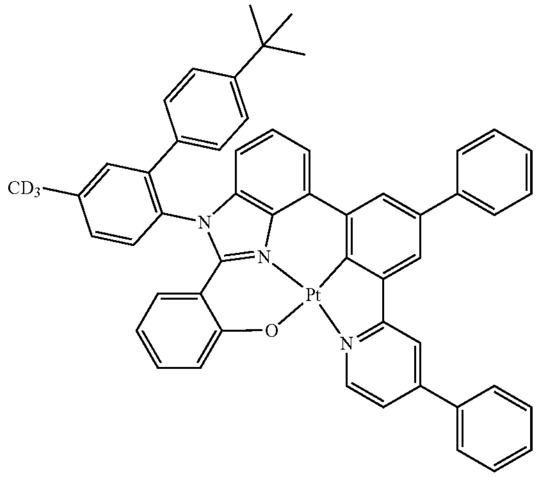

-continued
814
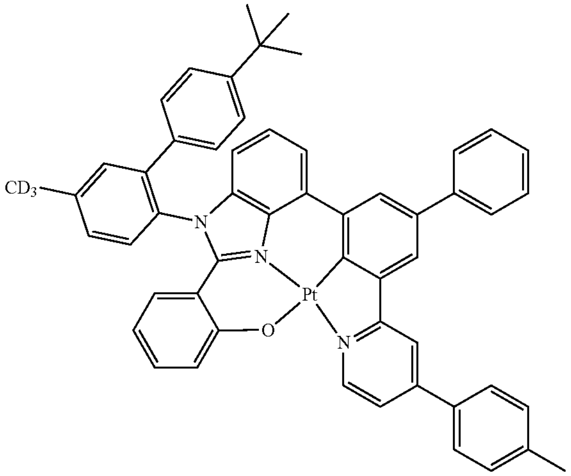
815
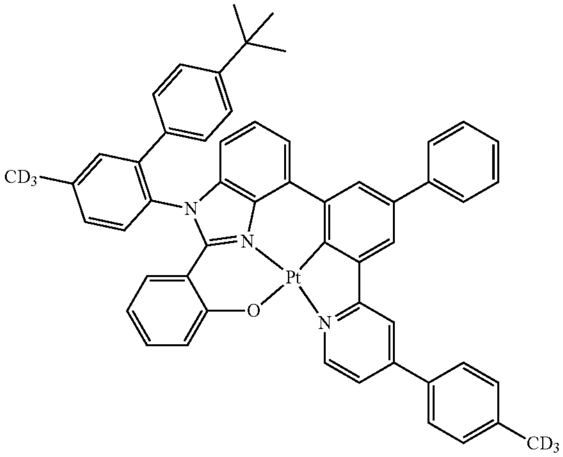
816
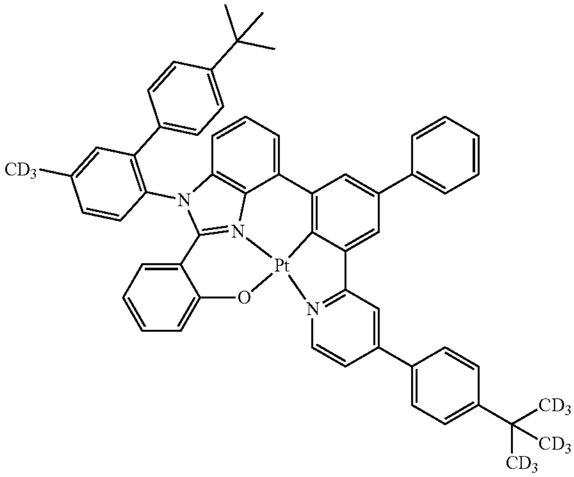
-continued
817
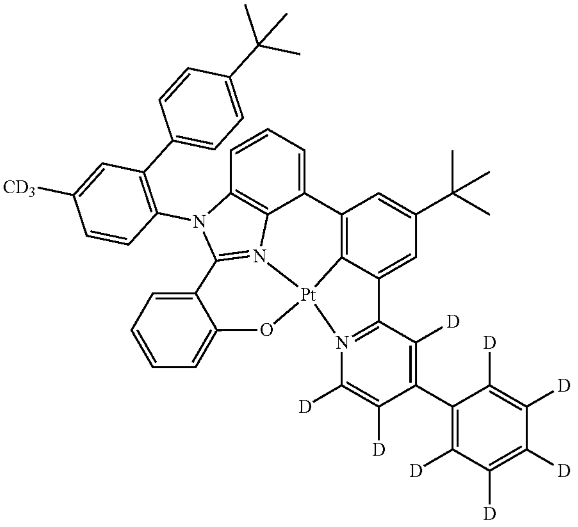
818
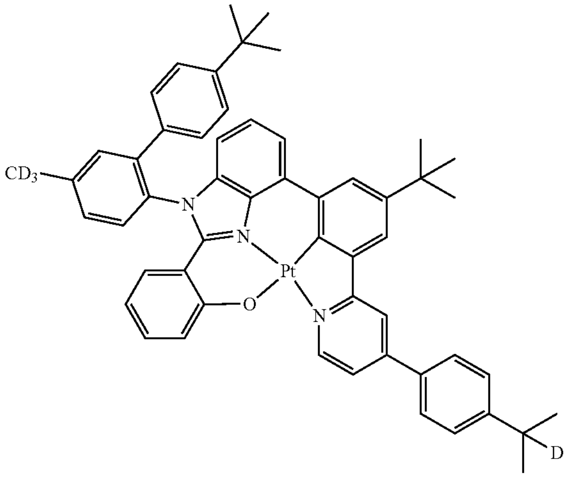
819
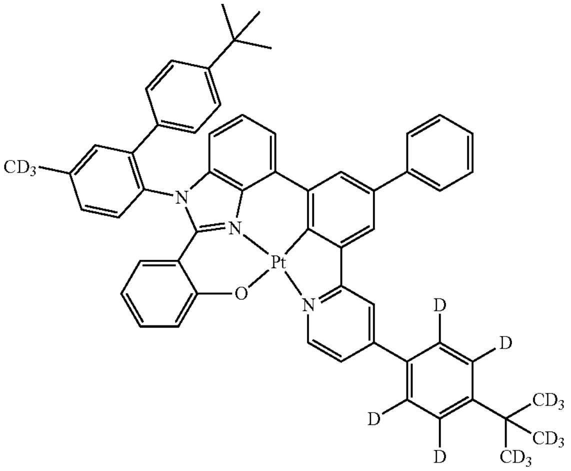

-continued
820
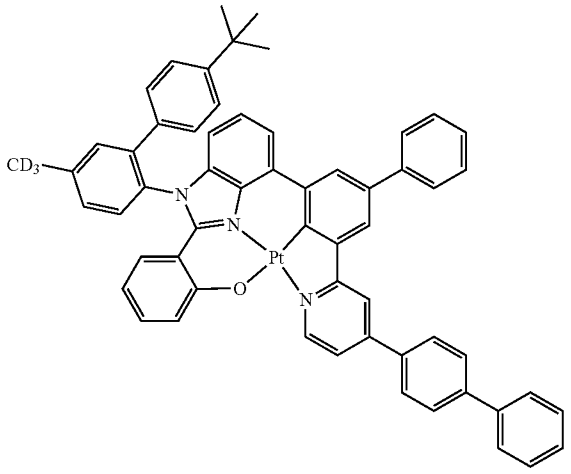
821
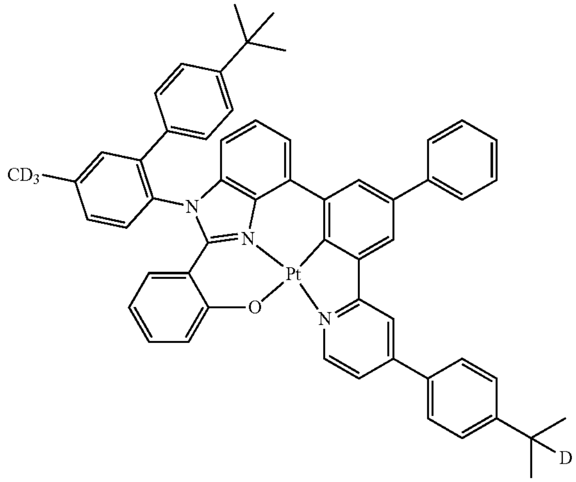
822
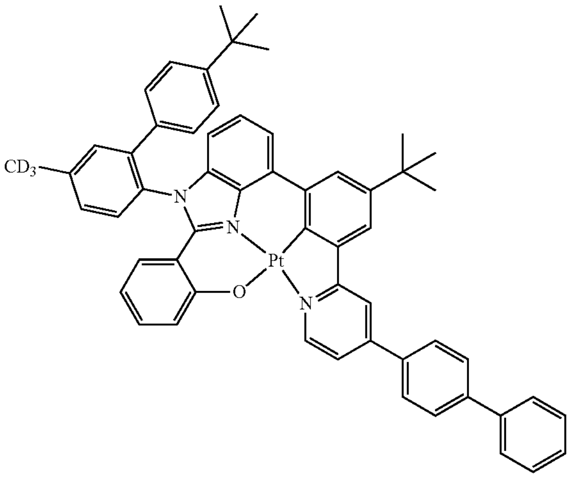
-continued
823
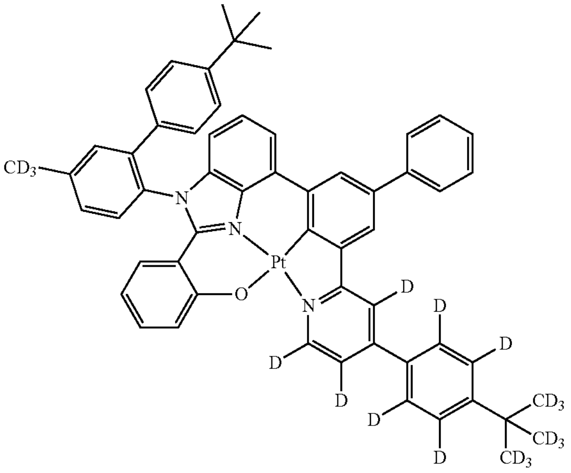
824
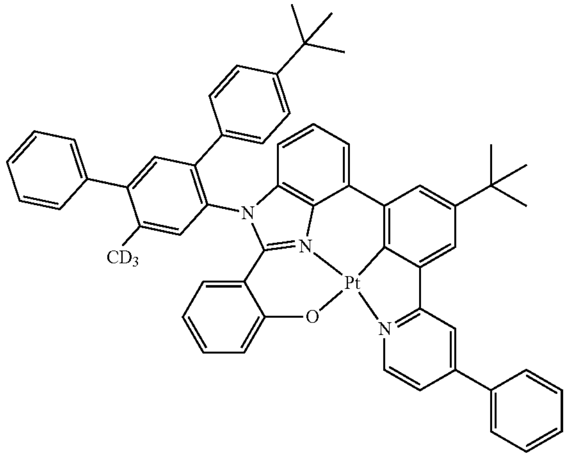
825
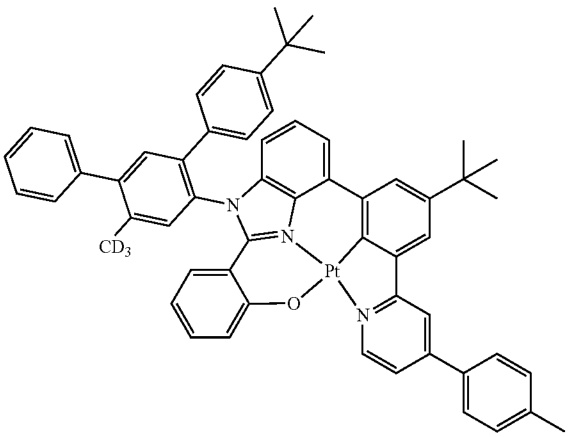

-continued
826
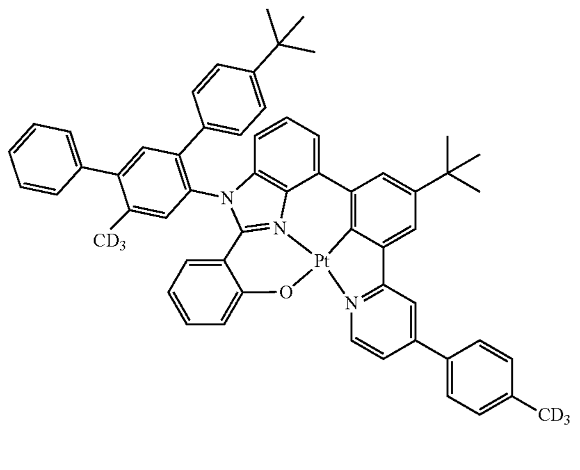
827
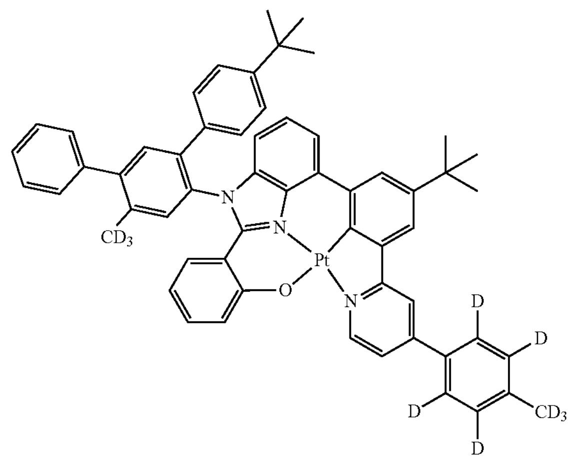
828
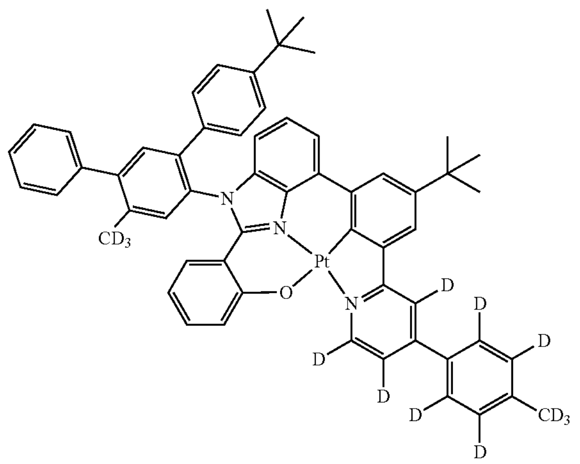
829
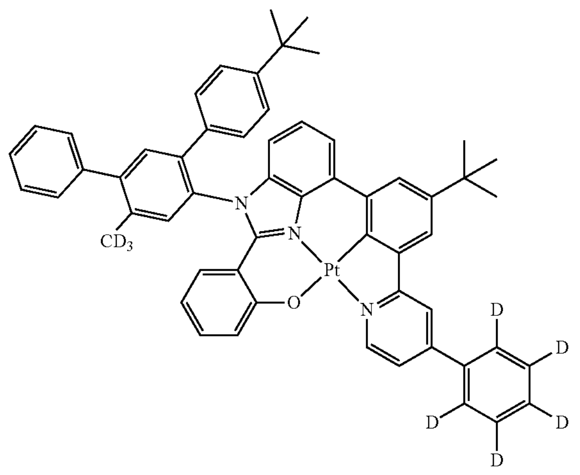
830
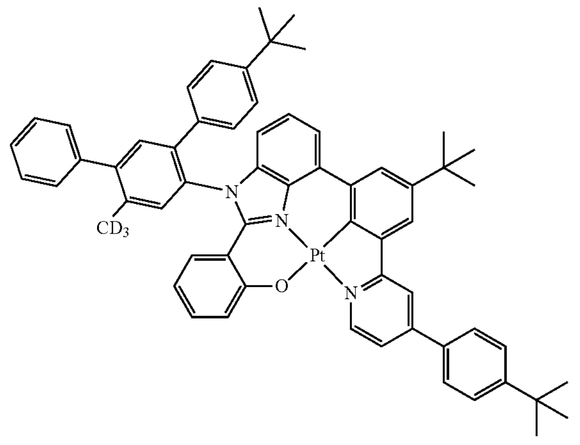
831
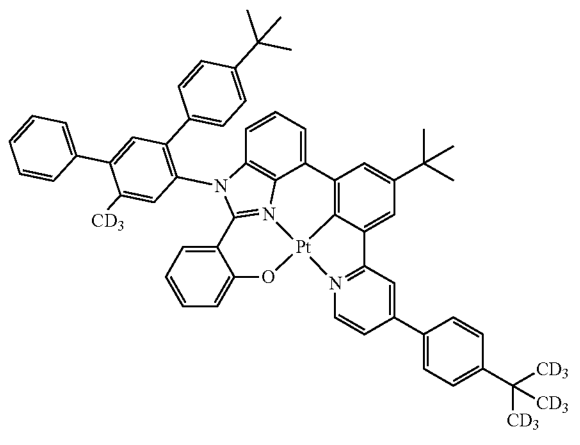

-continued
832
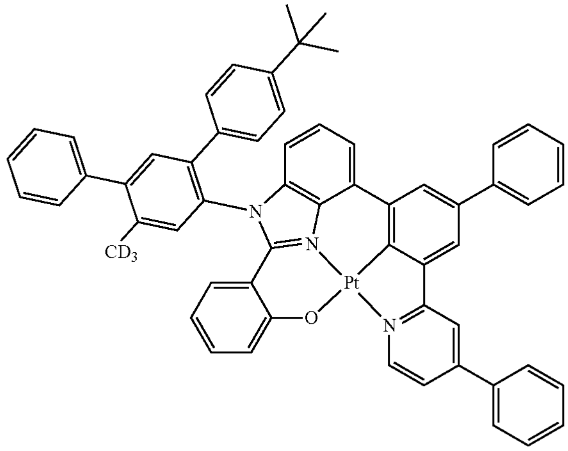
833
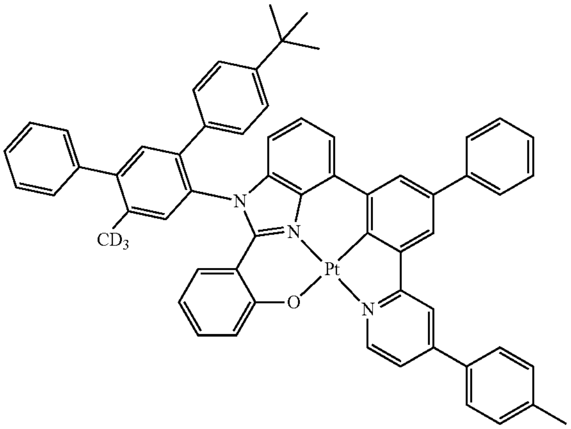
834
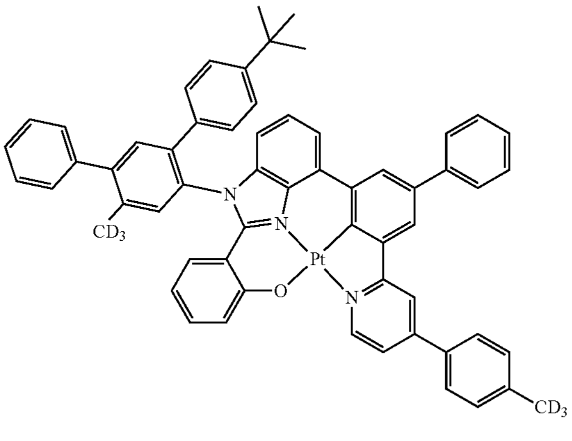
-continued
835
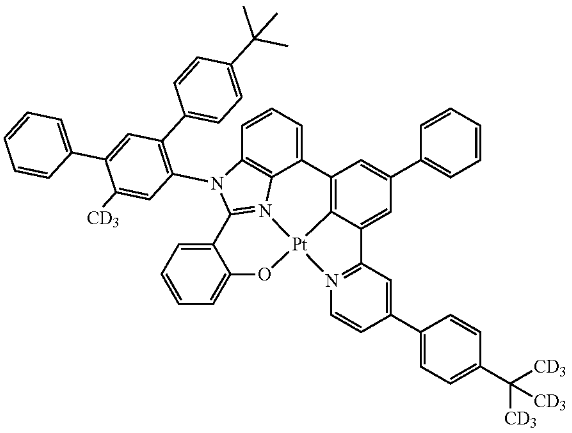
836
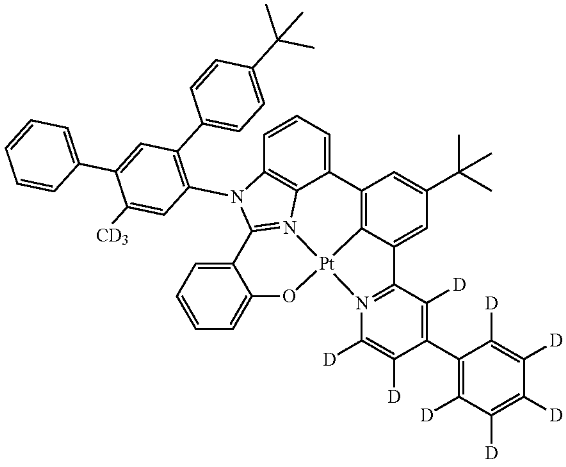
837
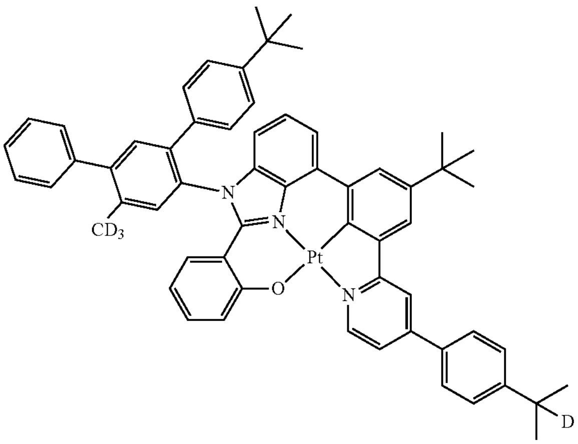

-continued
838
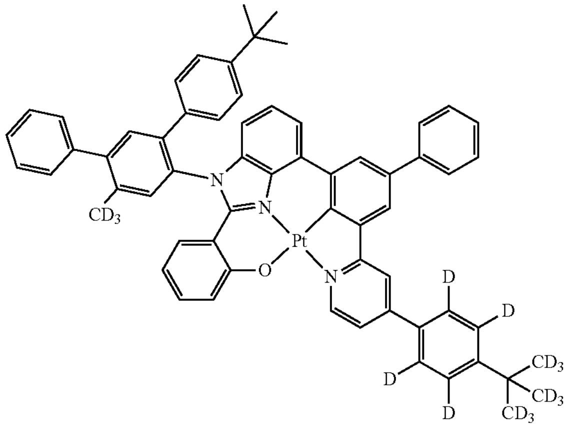
839
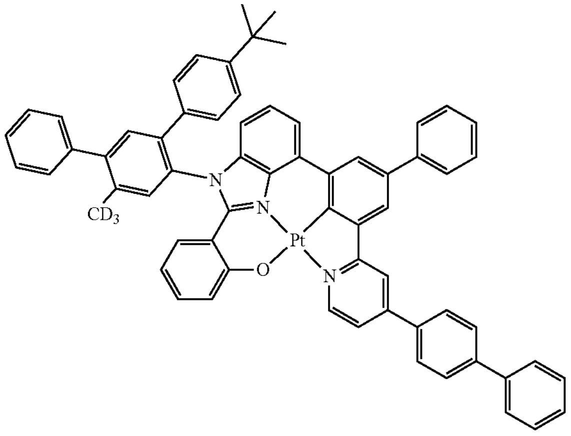
840
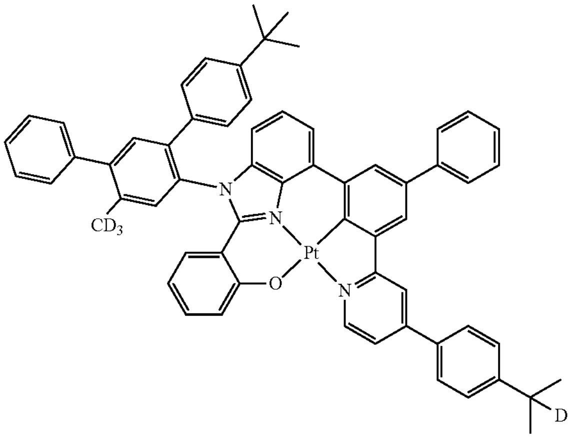
-continued
841
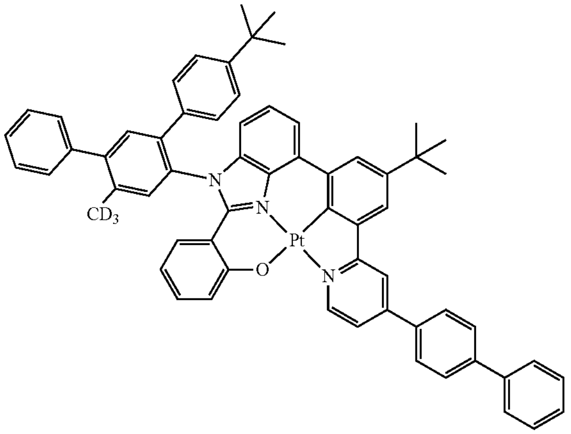
842
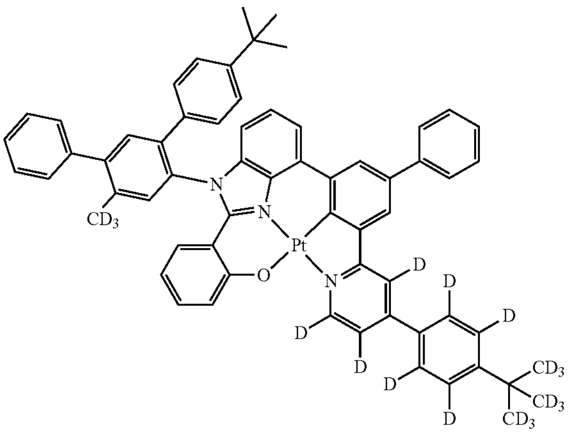
843
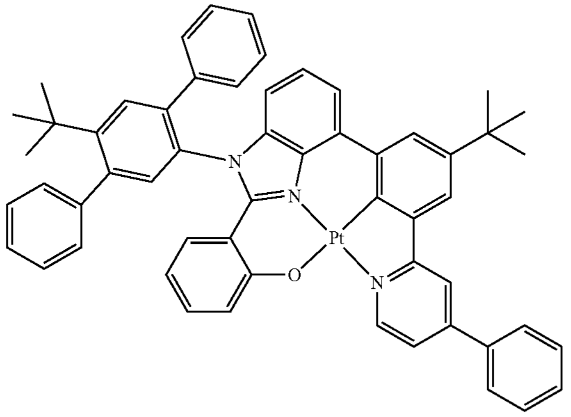

-continued
844
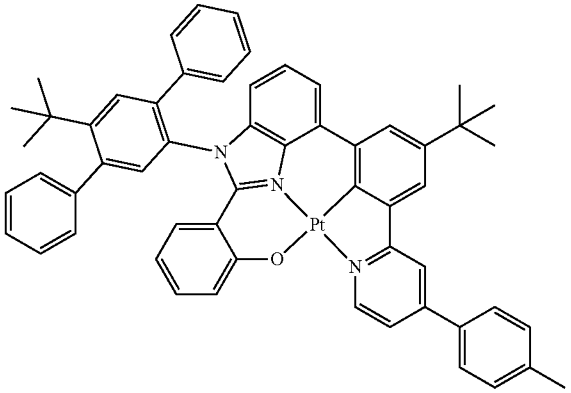
845
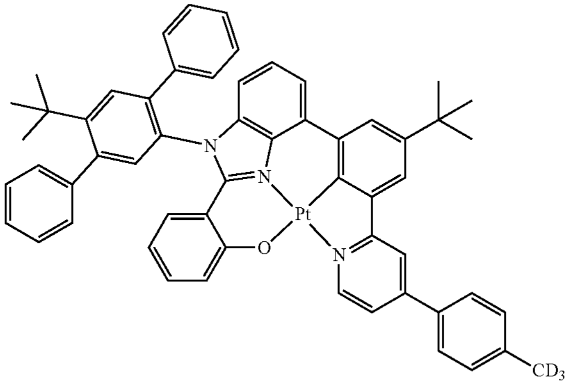
846
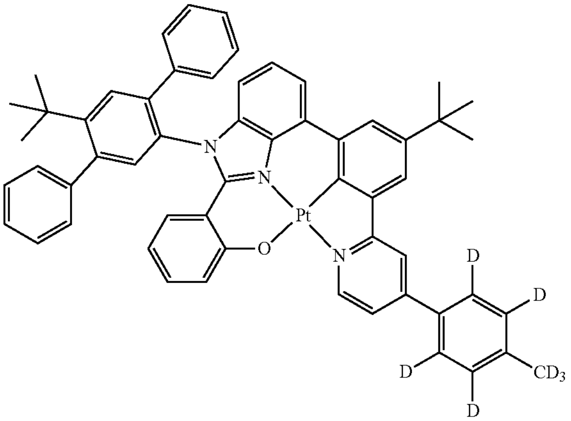
-continued
847
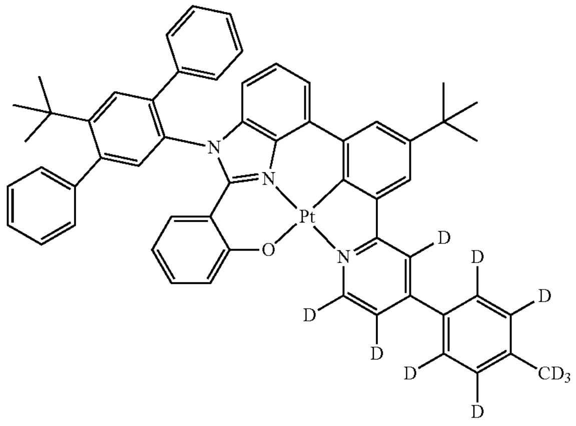
848
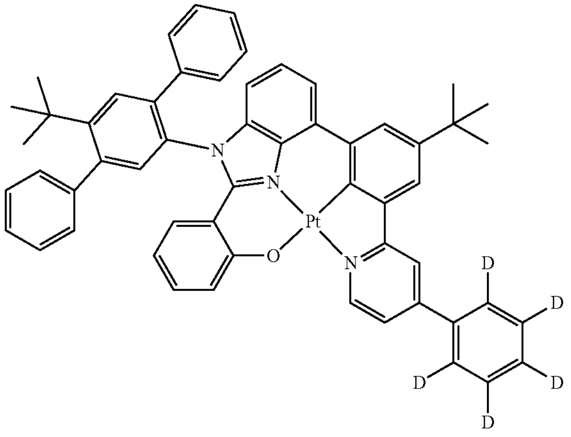
849
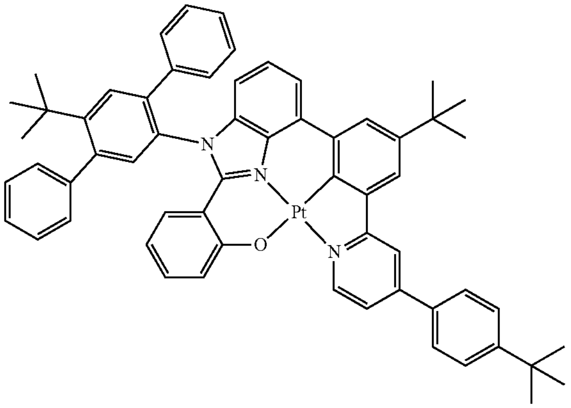

-continued
850
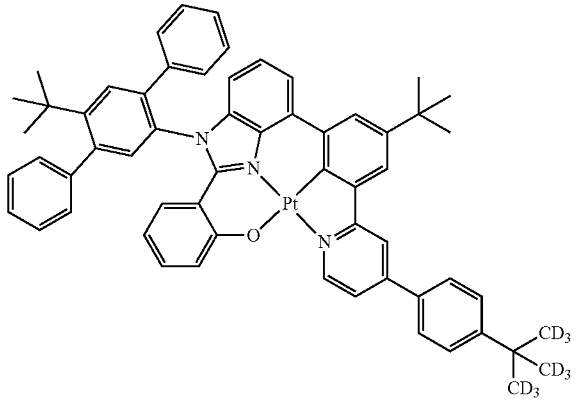
851
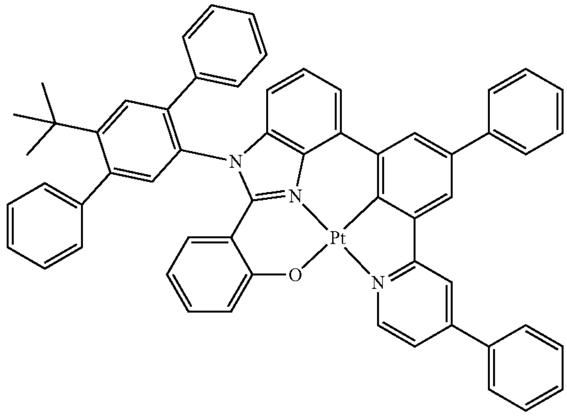
852
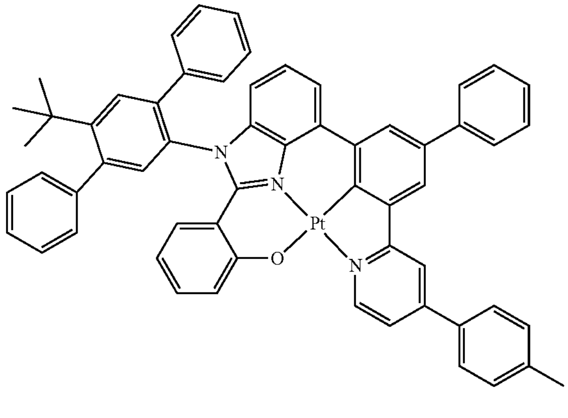
-continued
853
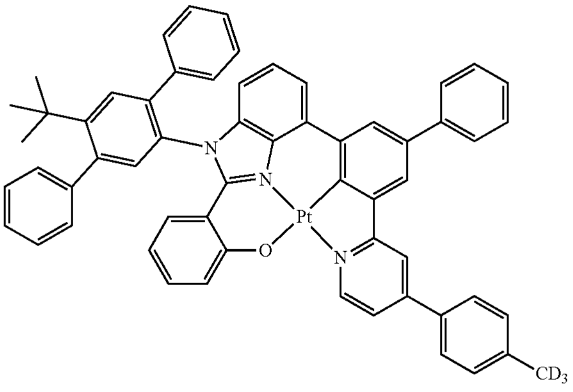
854
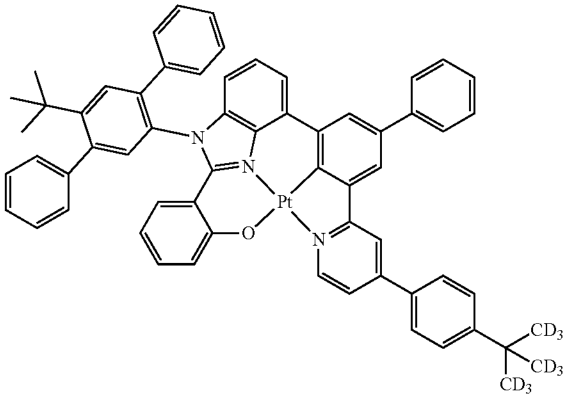
855
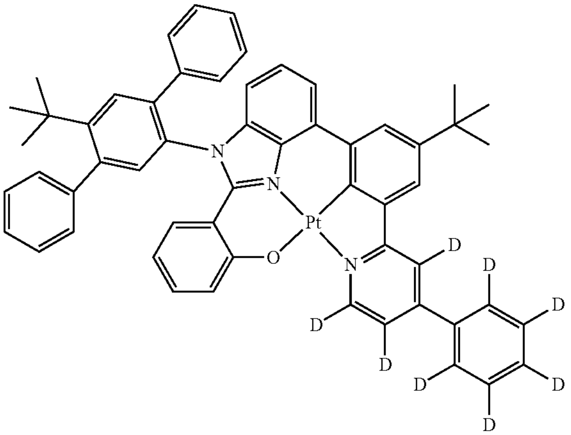

-continued
856
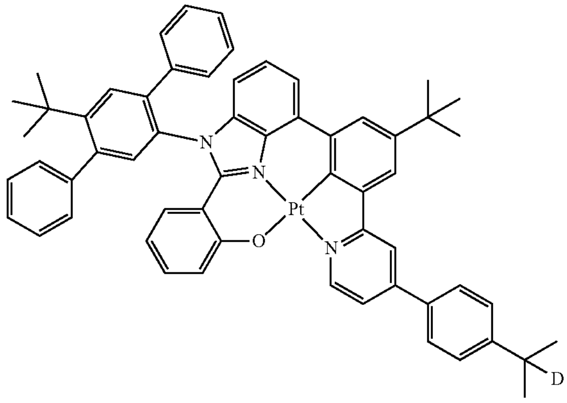
857
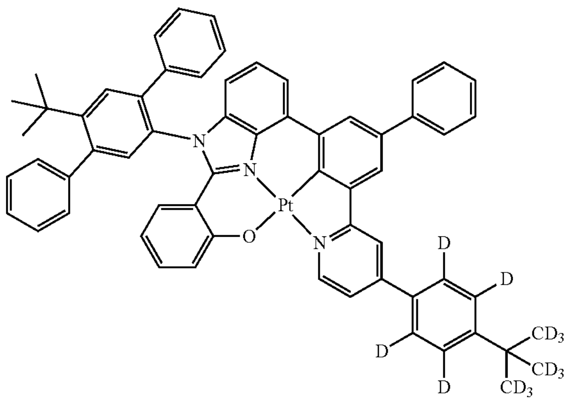
858
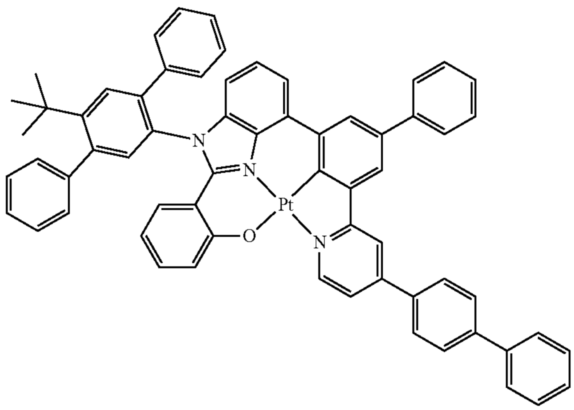
-continued
859
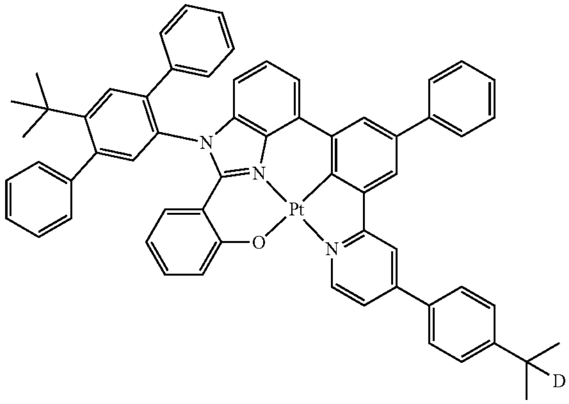
860
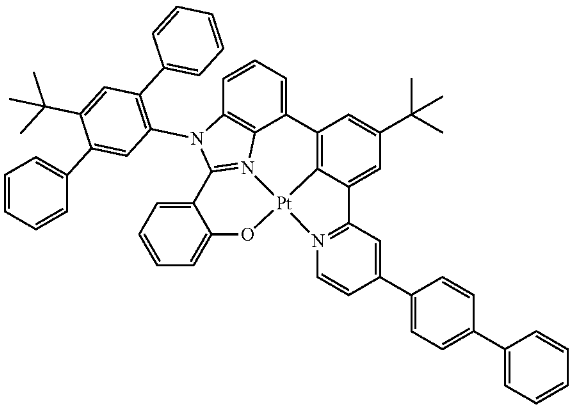
861
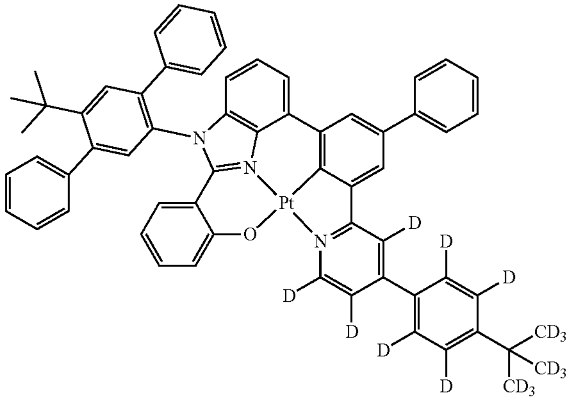

-continued
862
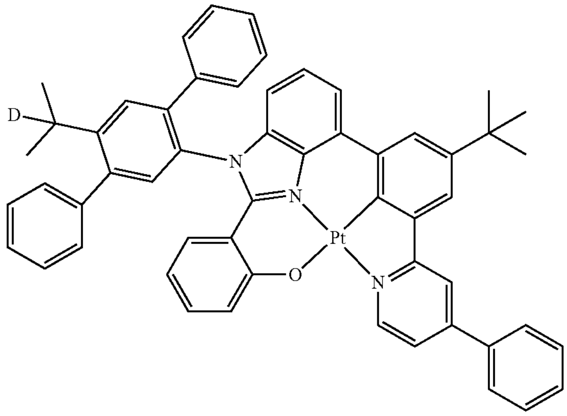
863
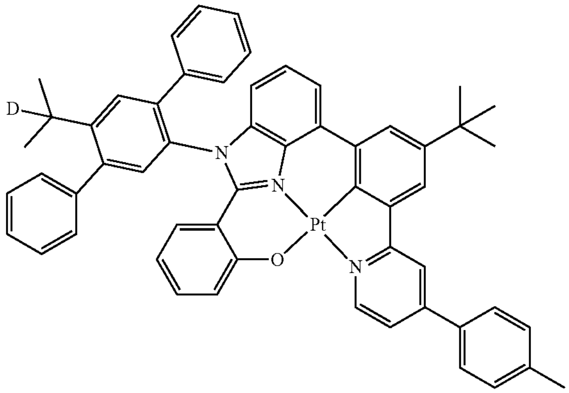
864
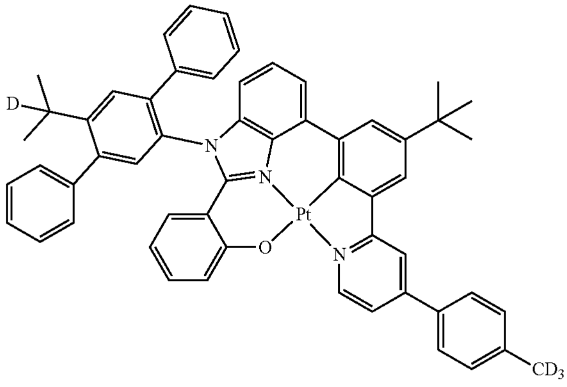
-continued
865
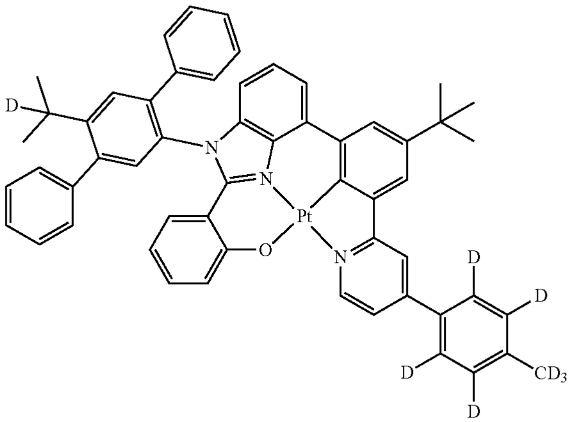
866
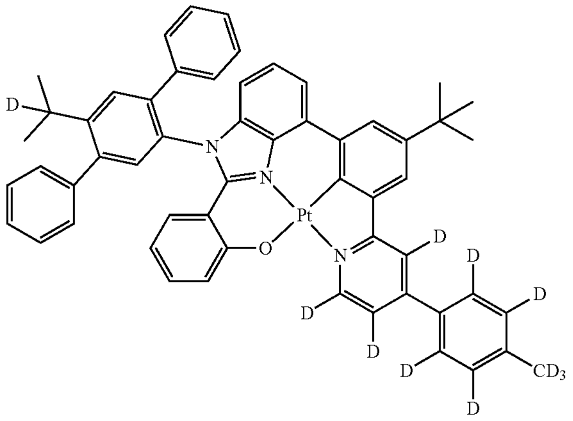
867
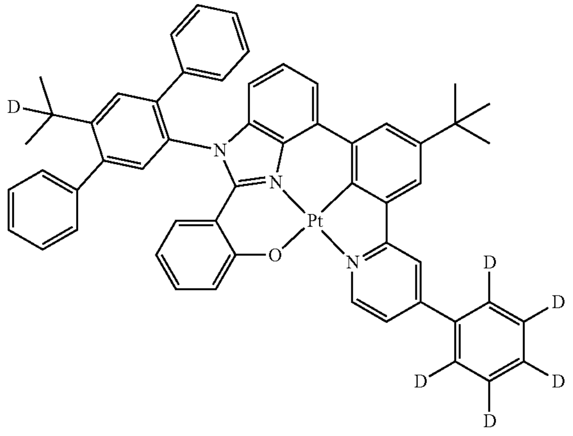

-continued
868
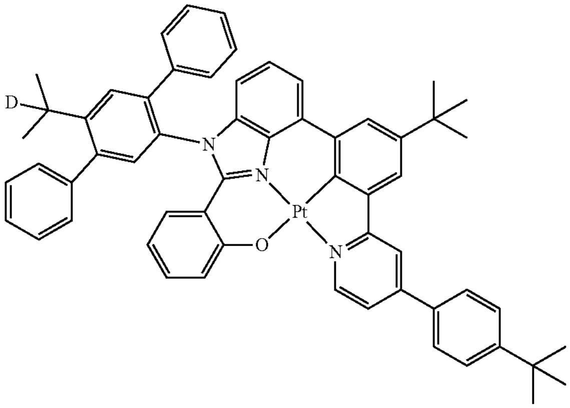
869
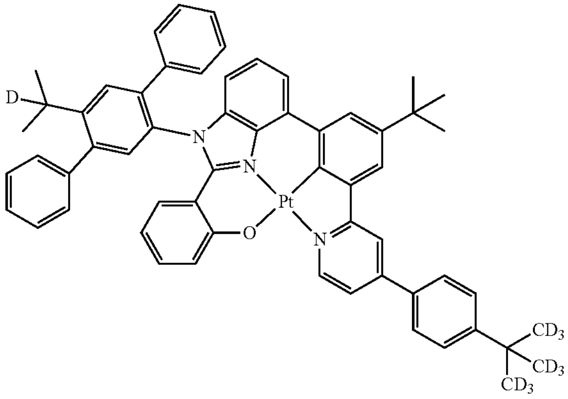
870
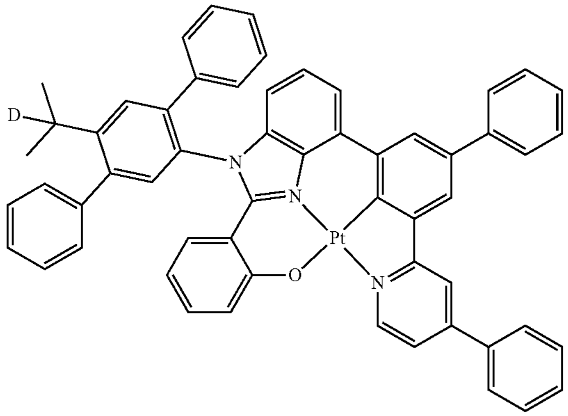
-continued
871
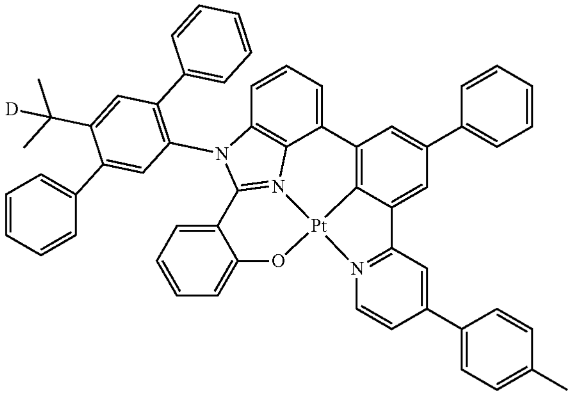
872
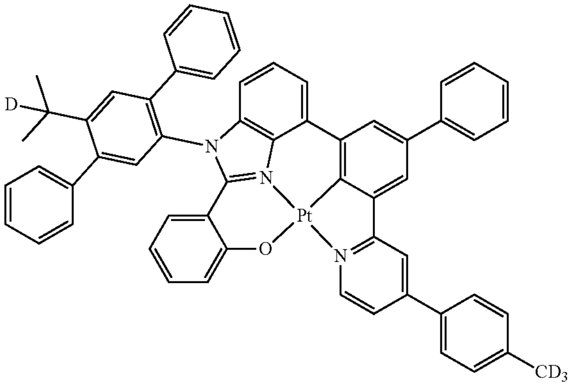
873
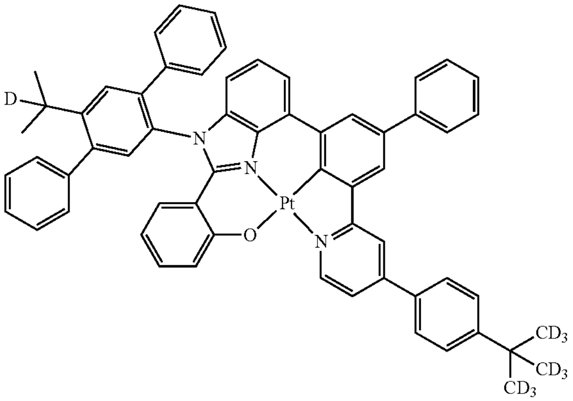

874
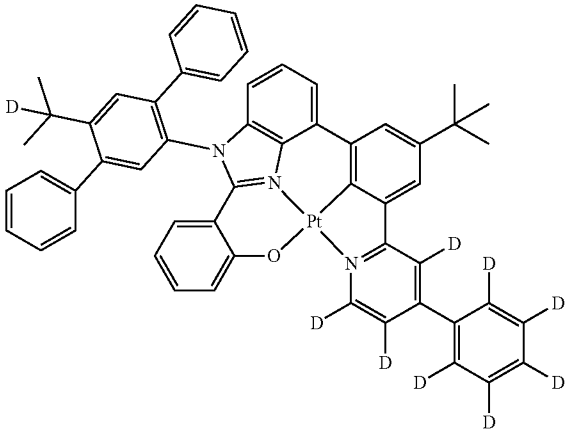
875
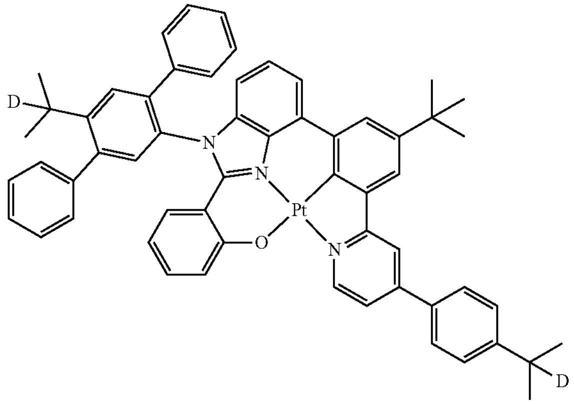
876
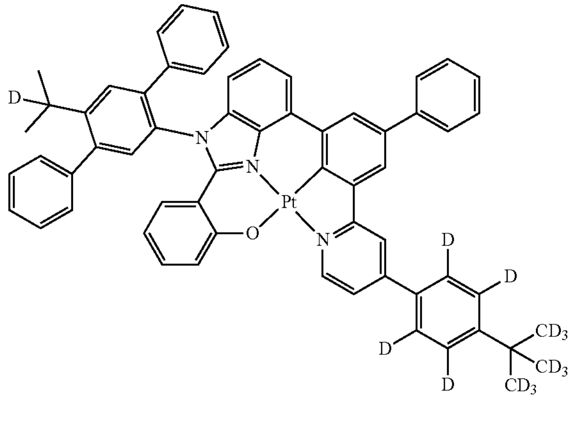
877
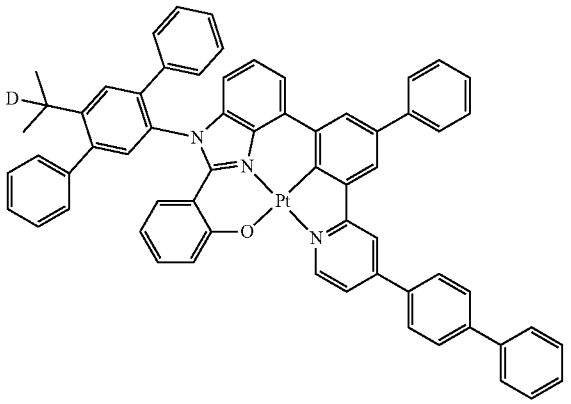
878
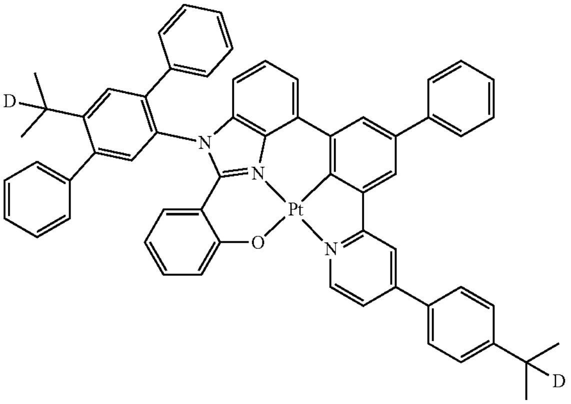
879
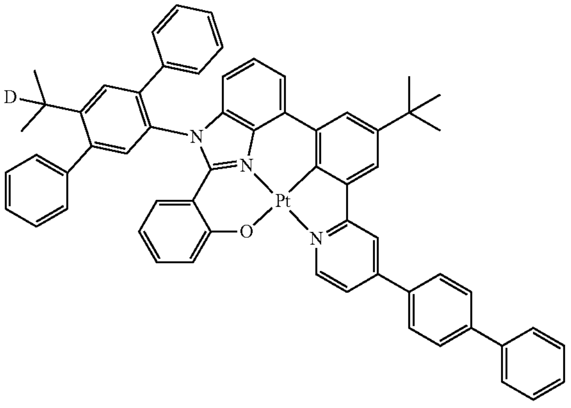

-continued
880
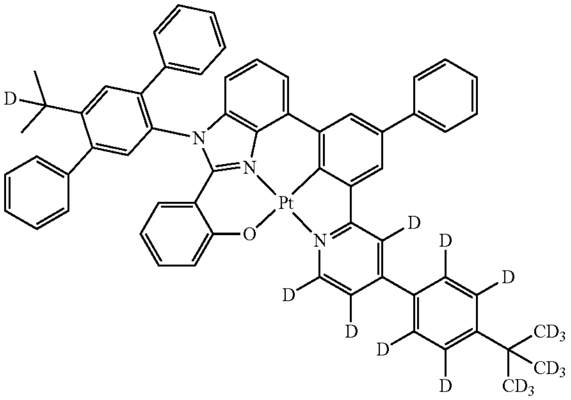
881
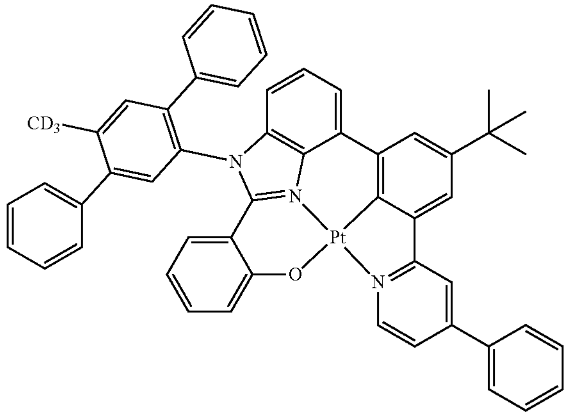
882
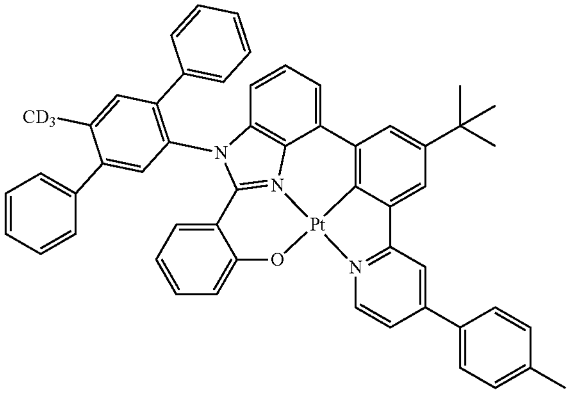
-continued
883
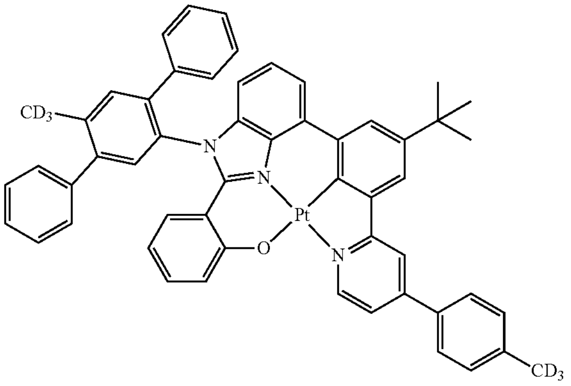
884
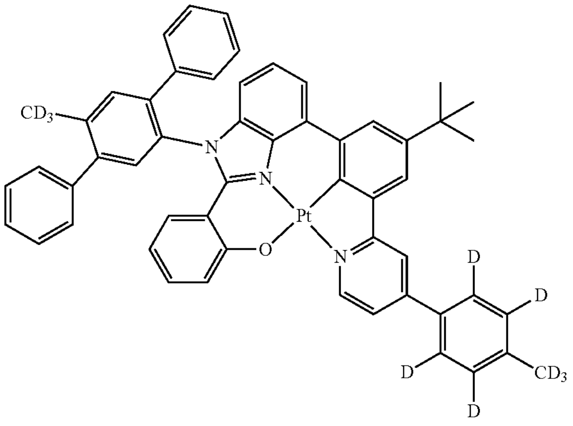
885
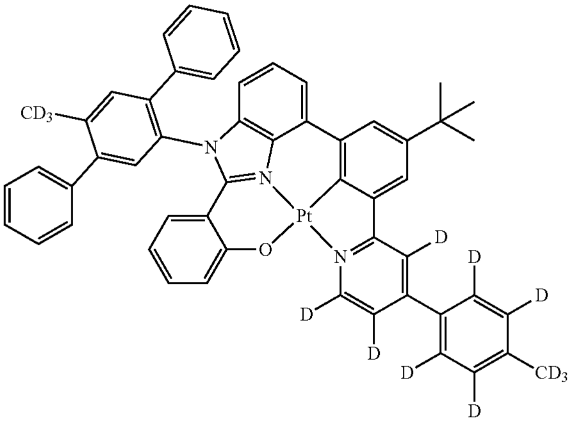

-continued
886
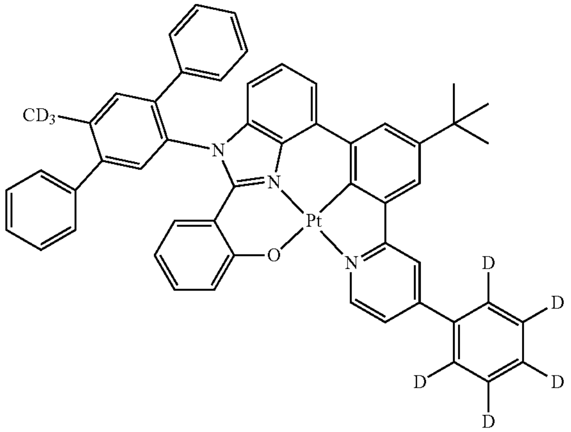
887
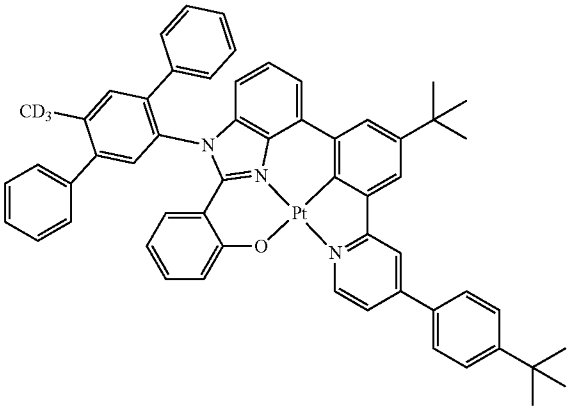
888
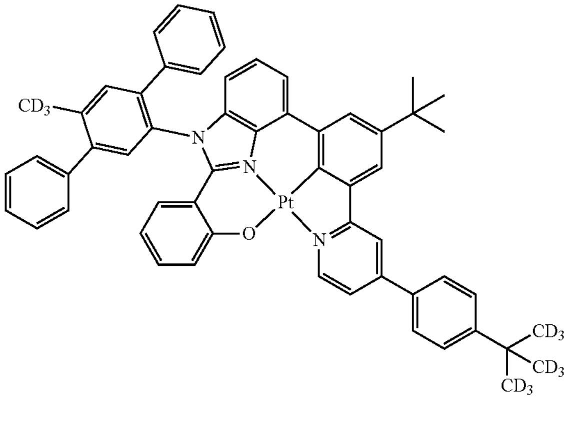
889
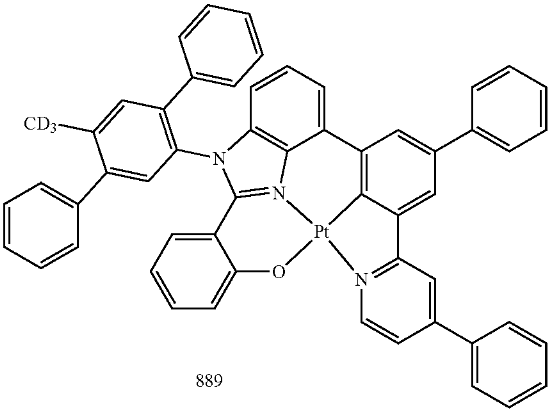
889
890
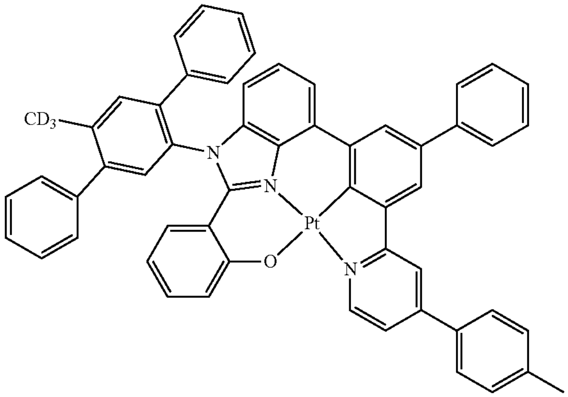
891
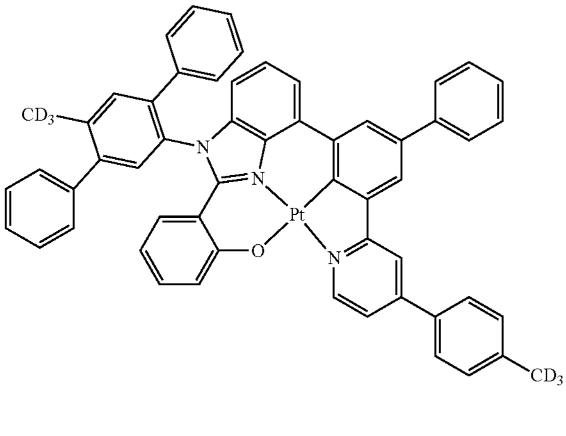

-continued
892
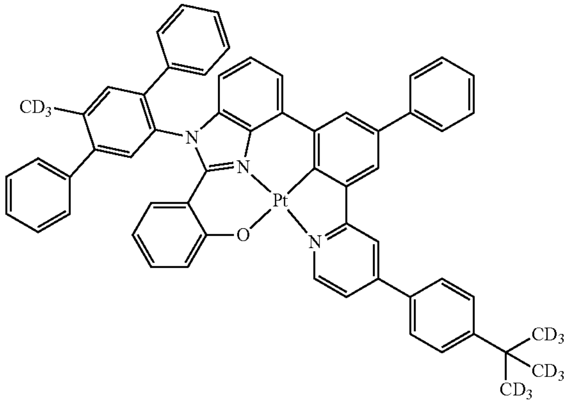
893
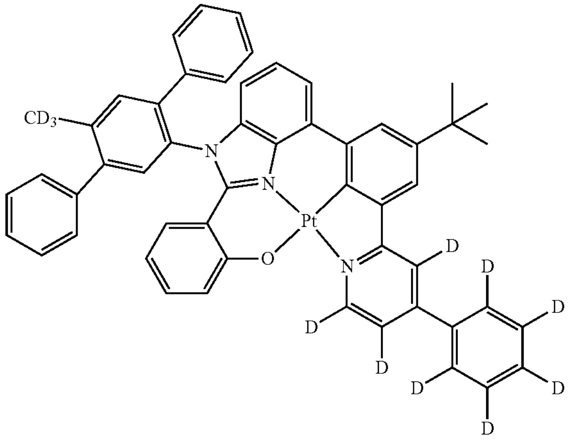
894
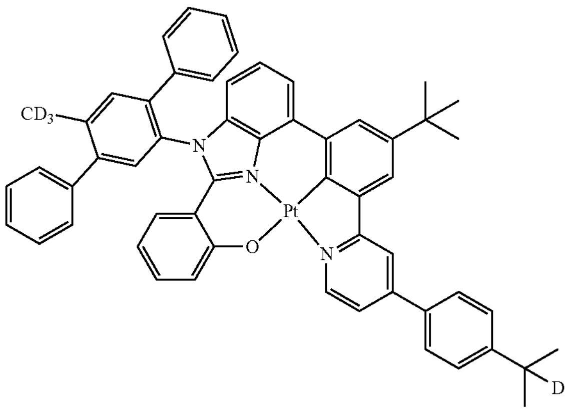
-continued
895
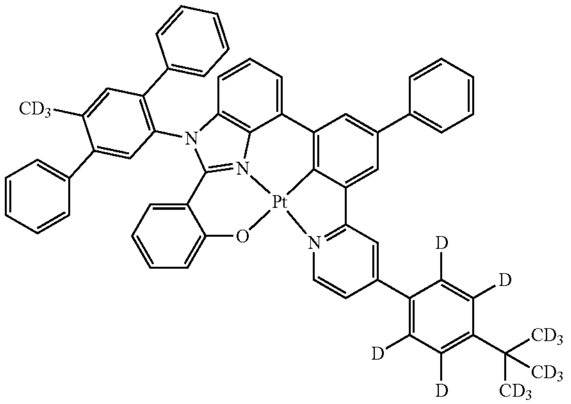
896
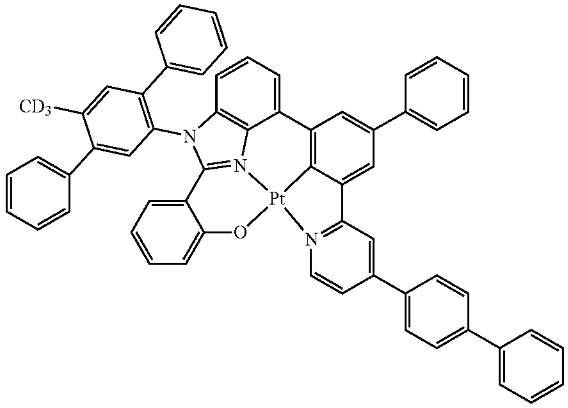
897
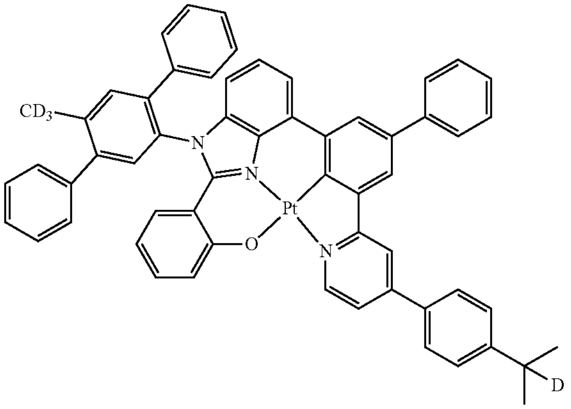

-continued
898
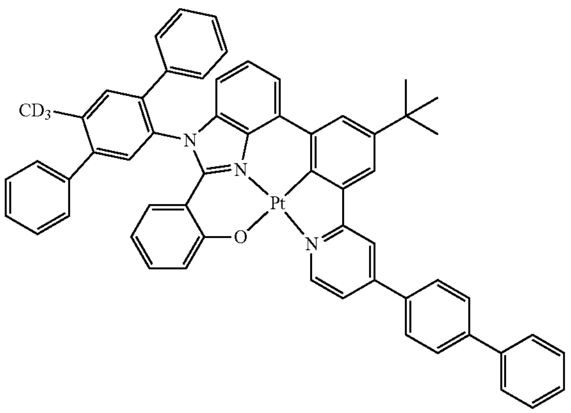
899
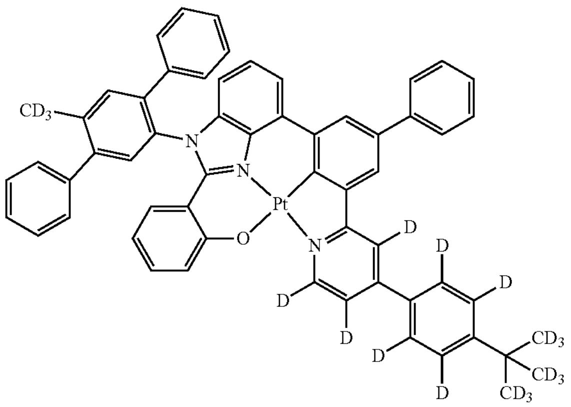
900
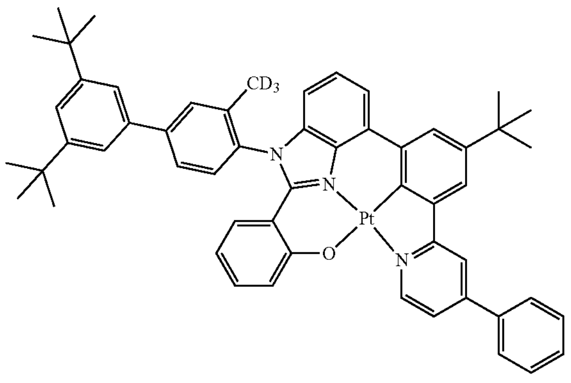
901
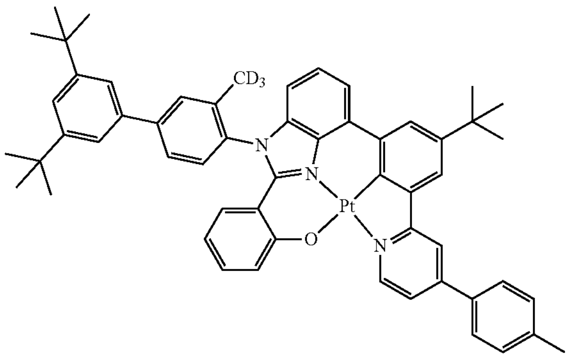
-continued
902
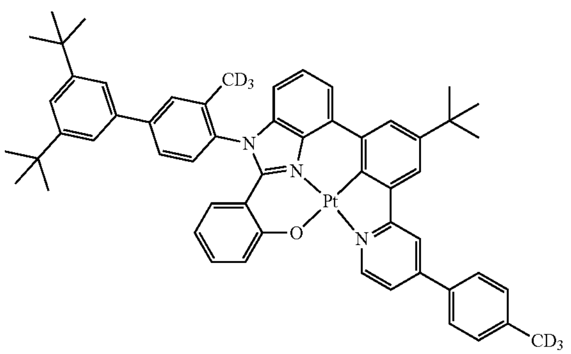
903
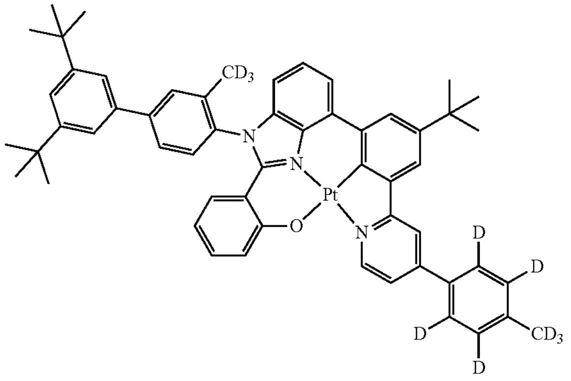
904
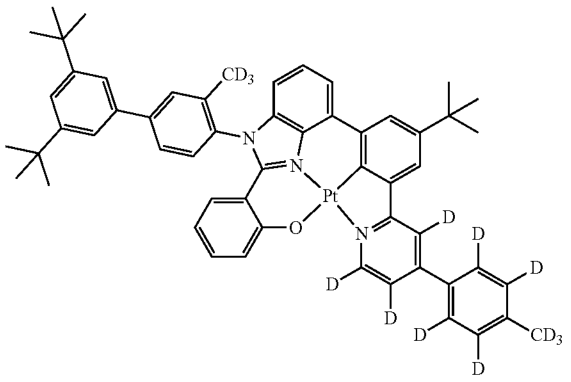
905
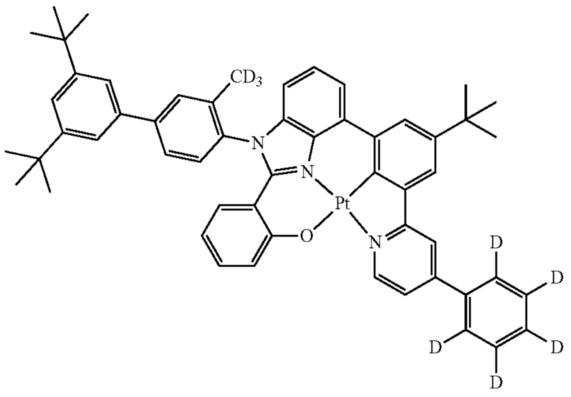

-continued
906
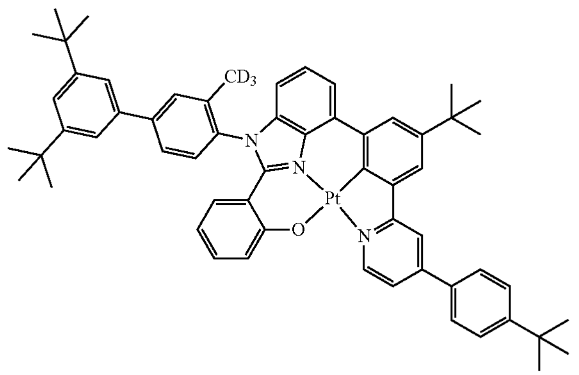
907
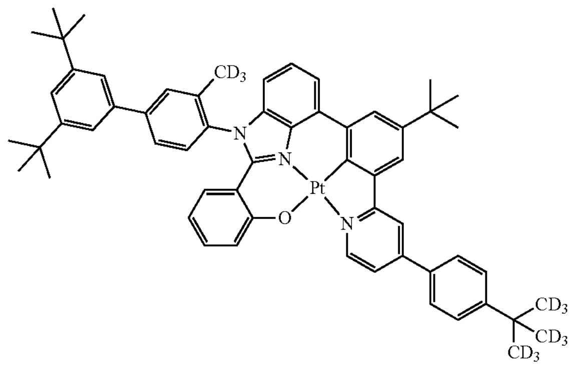
908
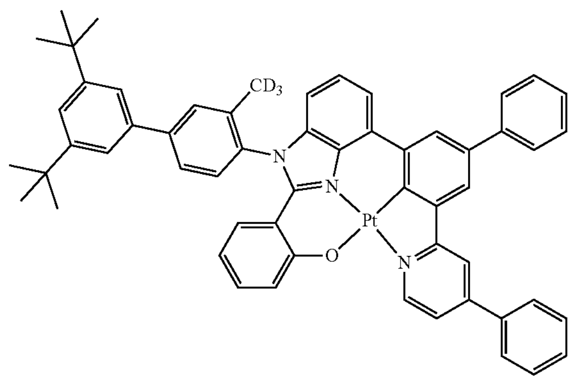
909
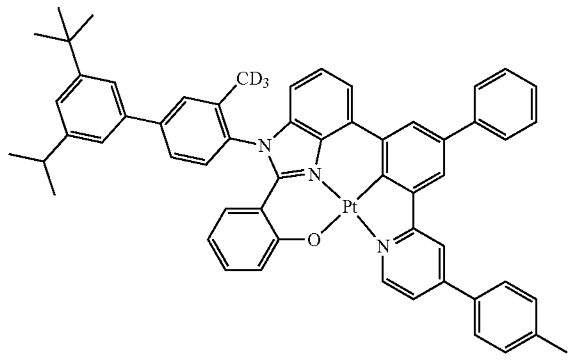
-continued
910
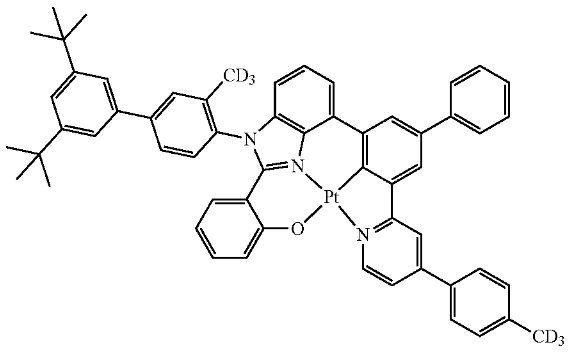
911
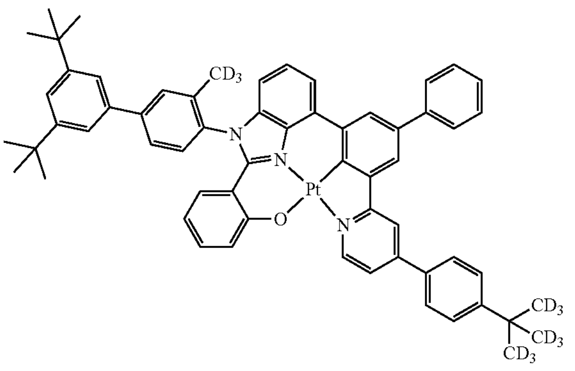
912
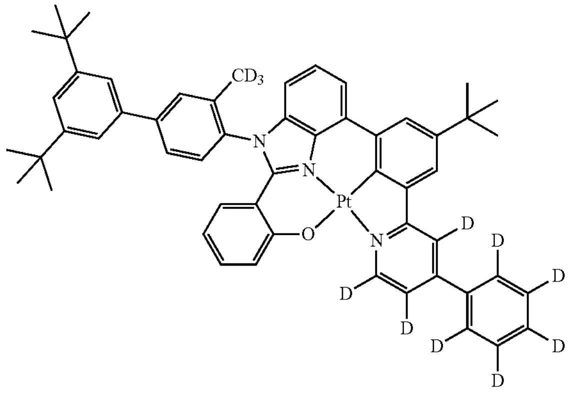
913
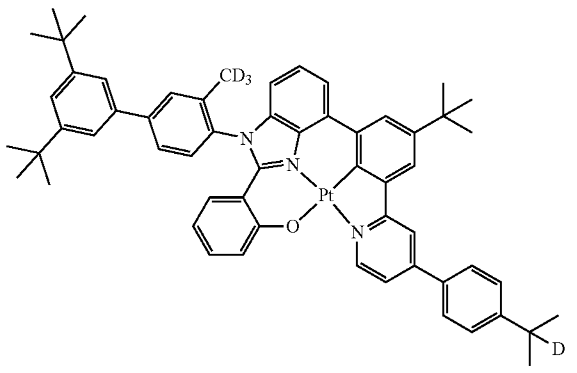

-continued
914
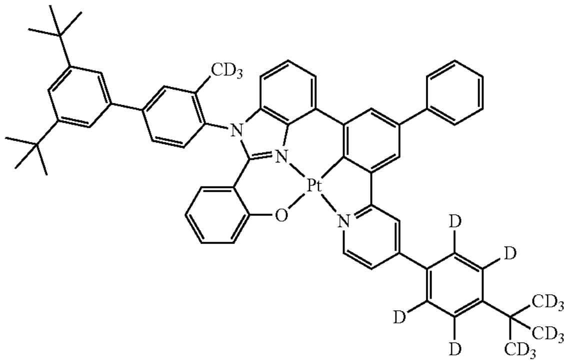
915
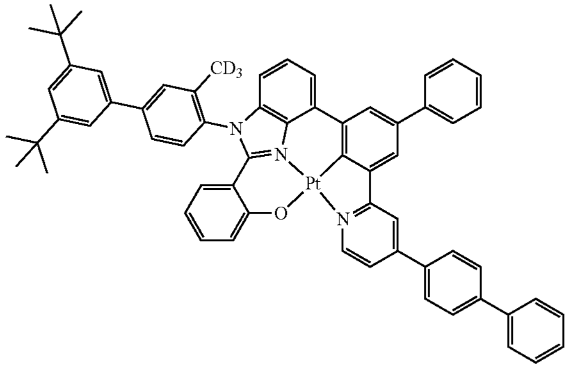
916
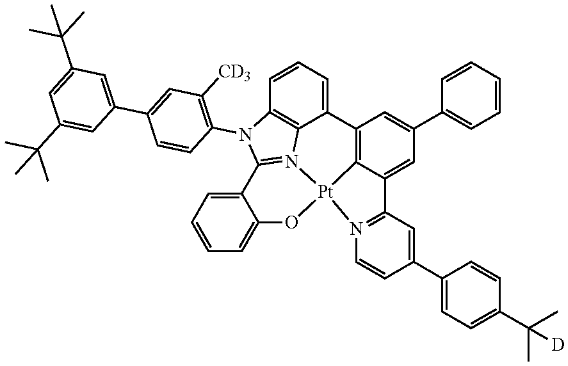
917
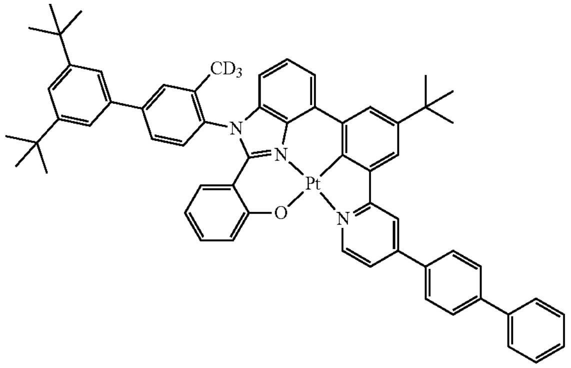
-continued
918
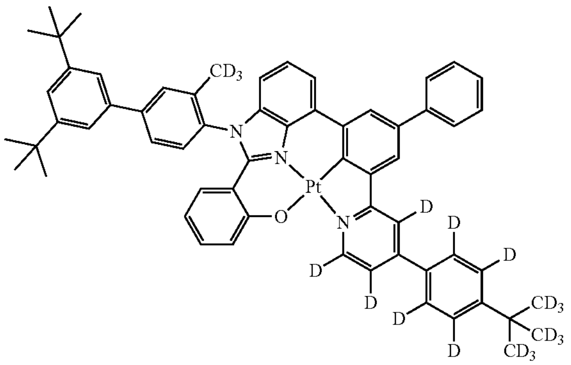
919
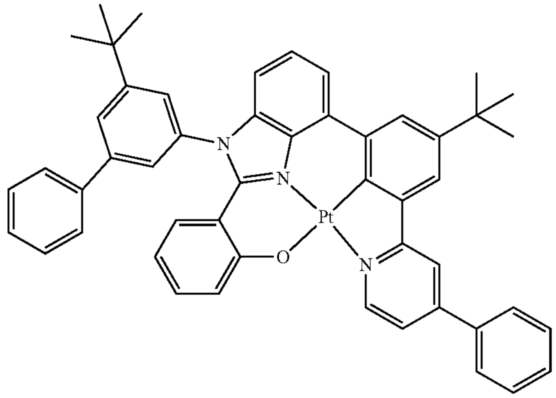
920
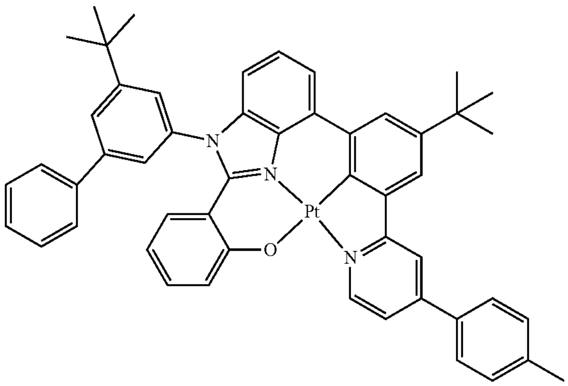
921
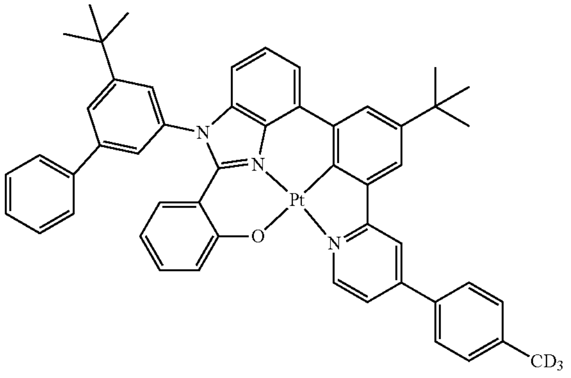

-continued
922
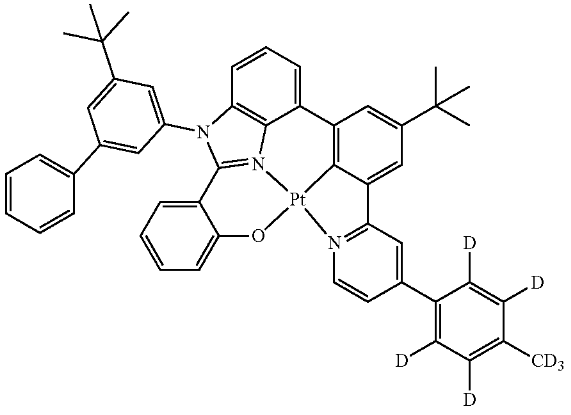
923
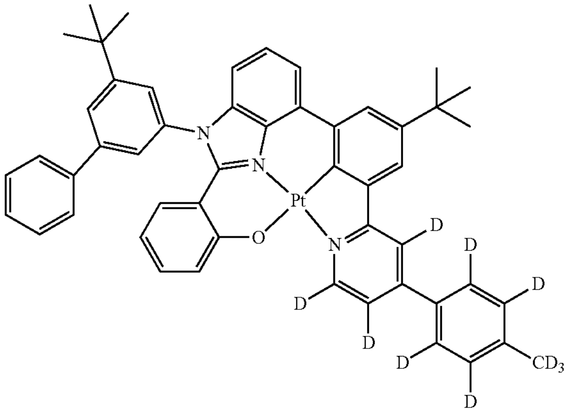
924
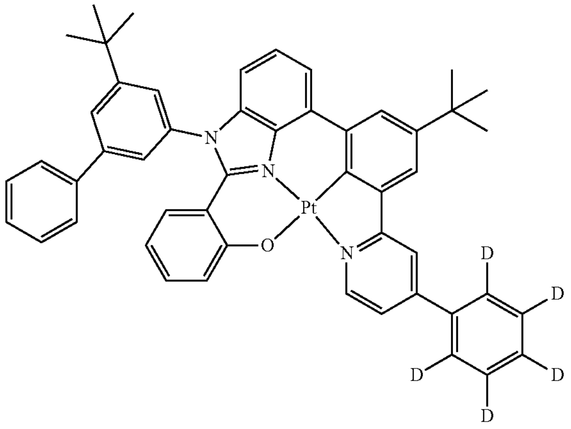
-continued
925
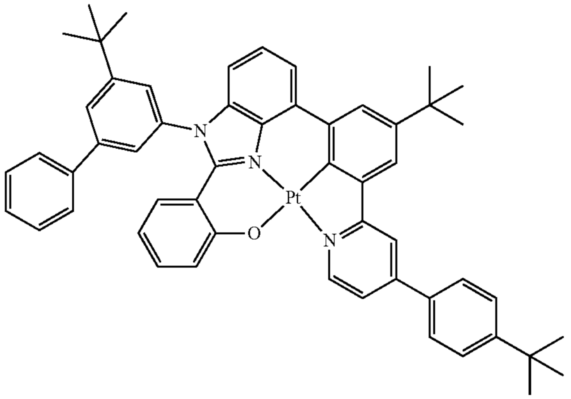
926
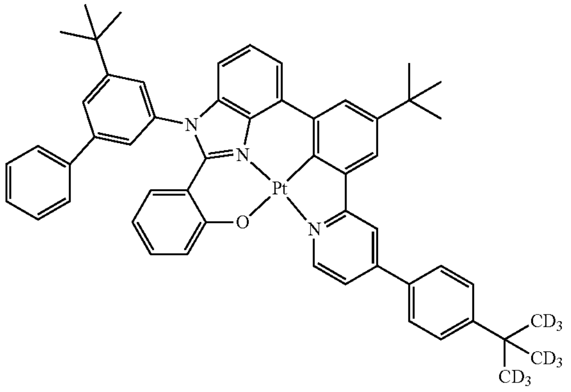
927
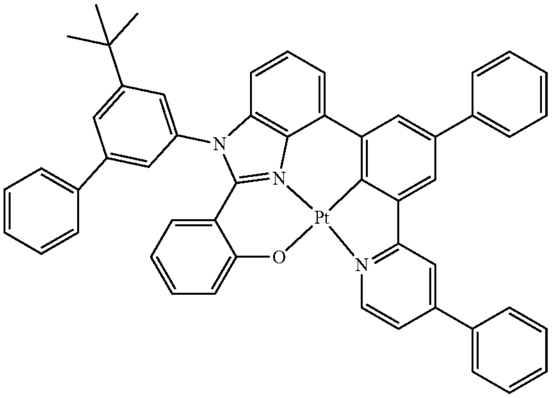

-continued
928
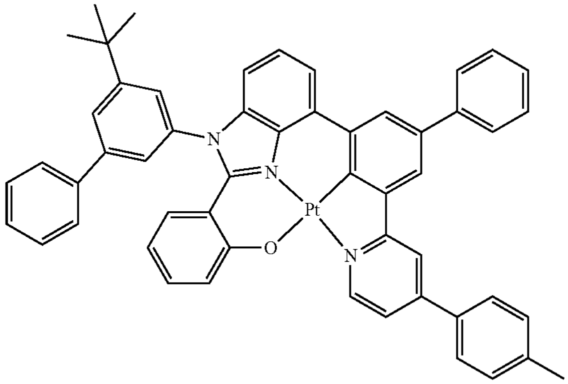
929
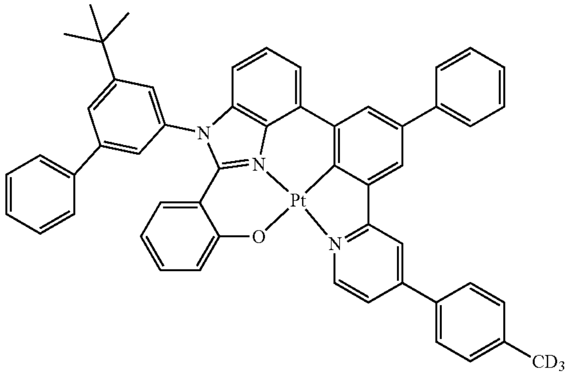
930
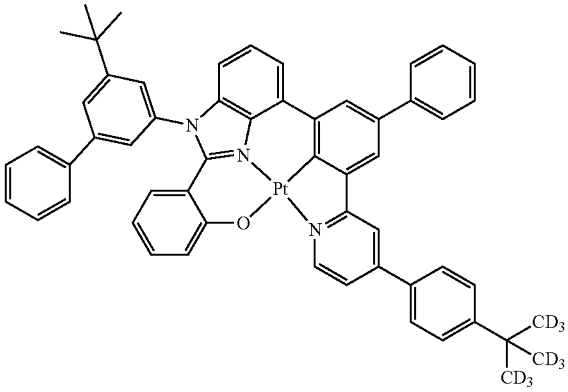
-continued
931
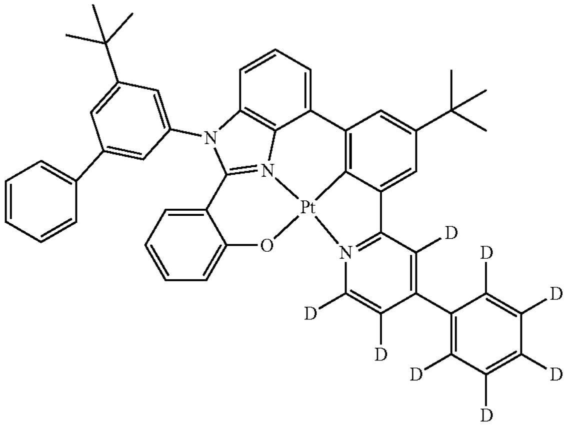
932
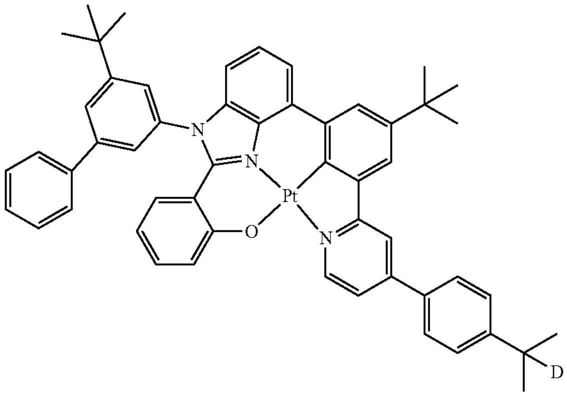
933
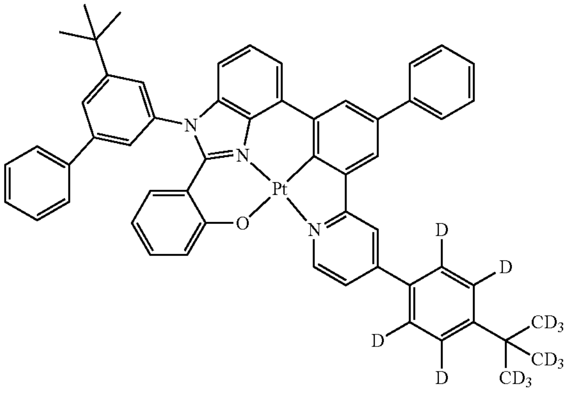

-continued
934
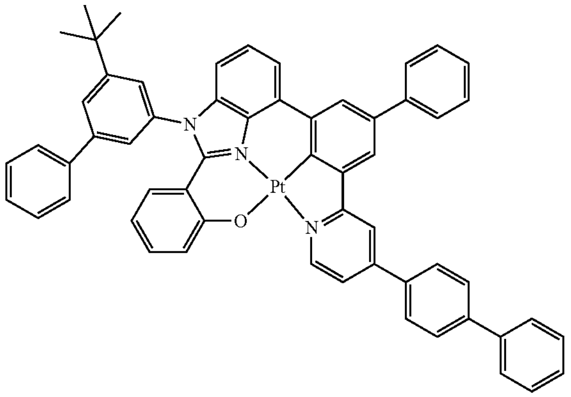
935
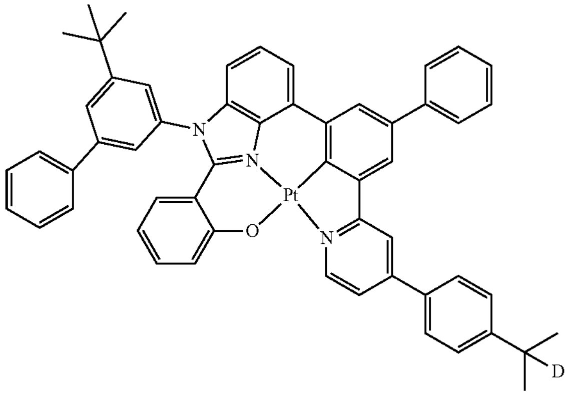
936
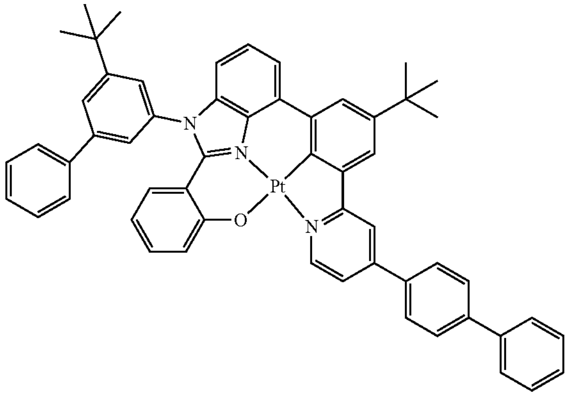
-continued
937
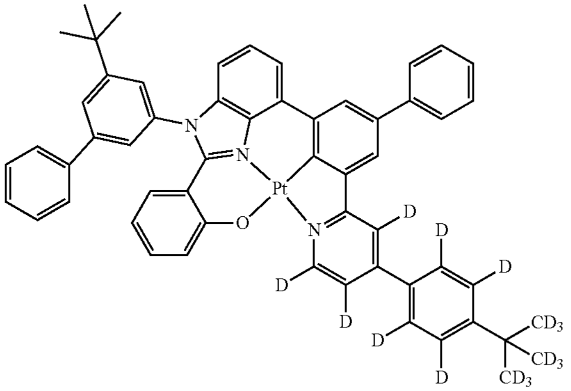
938
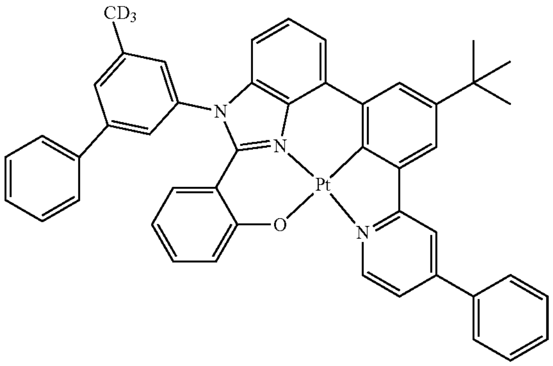
939
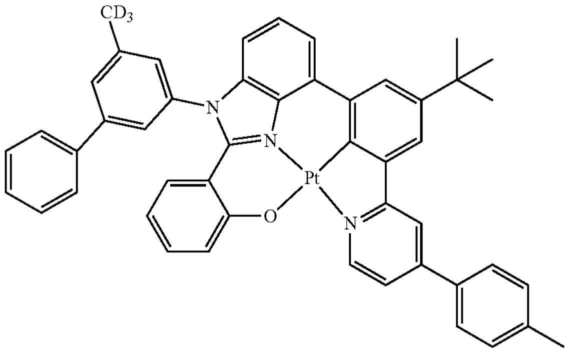
940
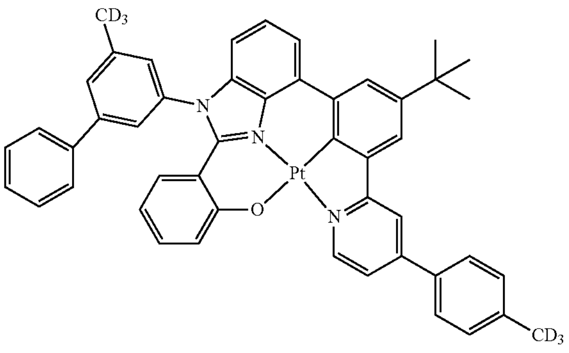

-continued
941
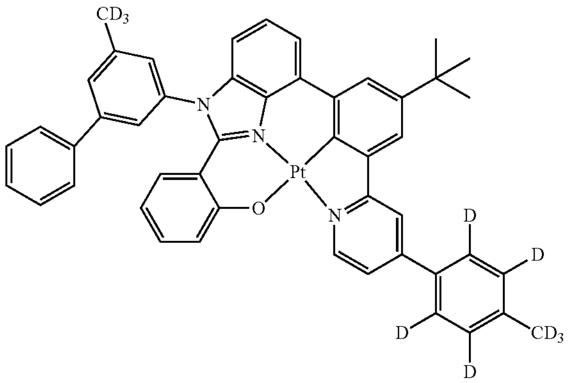
942
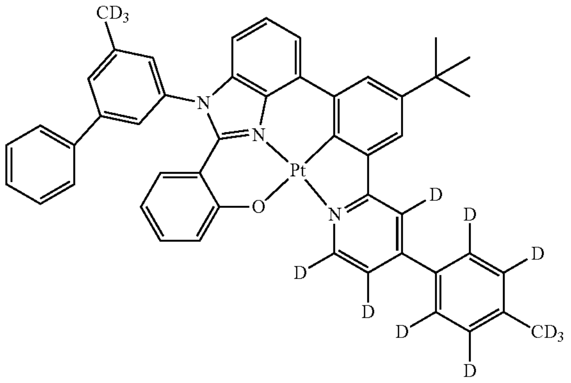
943
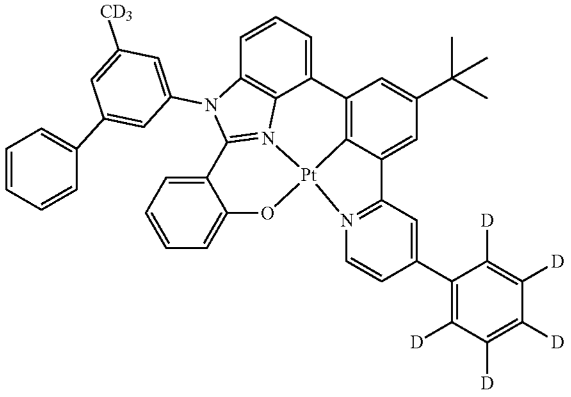
944
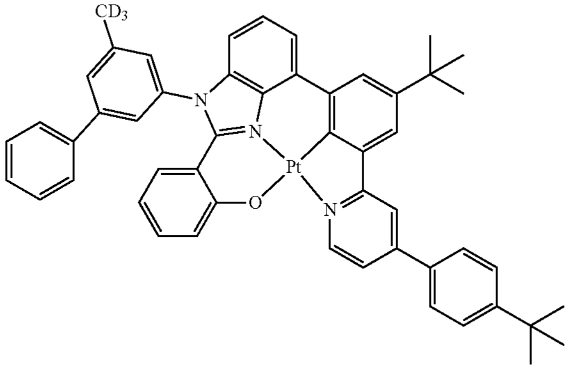
-continued
945
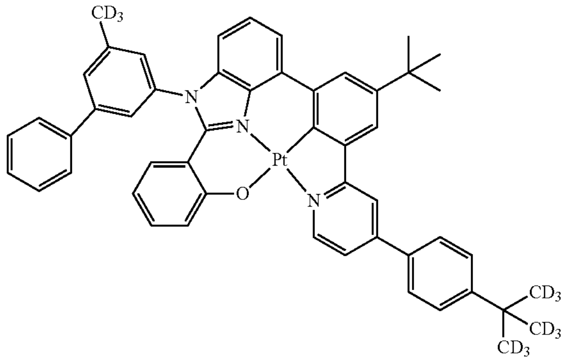
946
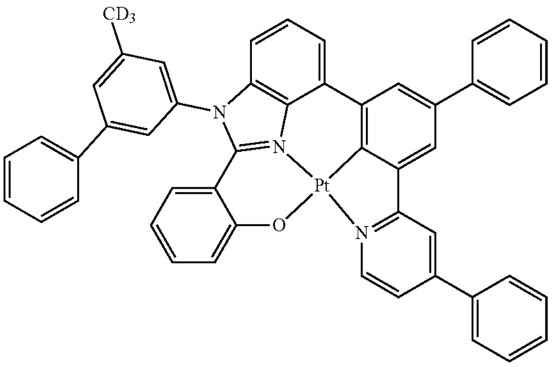
947
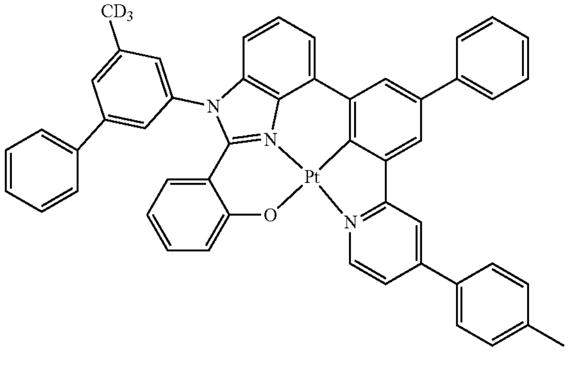
948
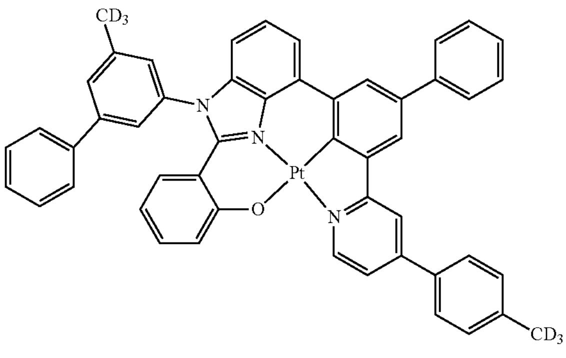

-continued
949
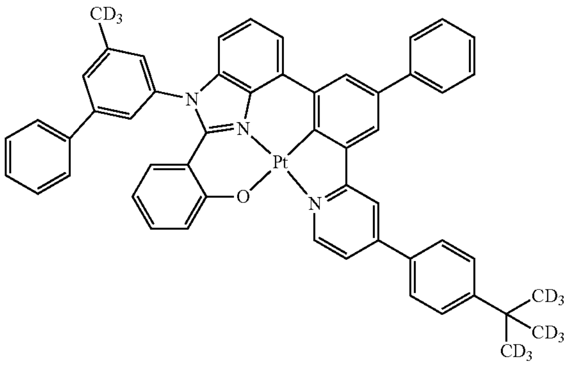
950
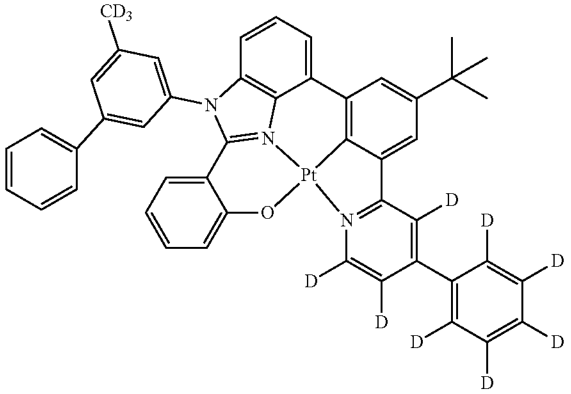
951
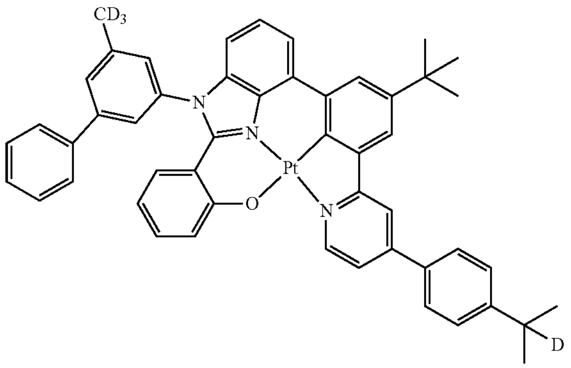
952
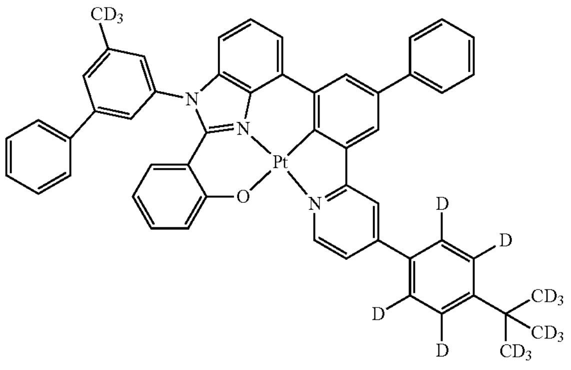
-continued
953
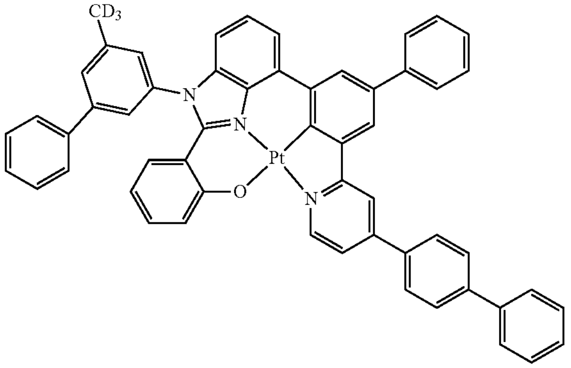
954
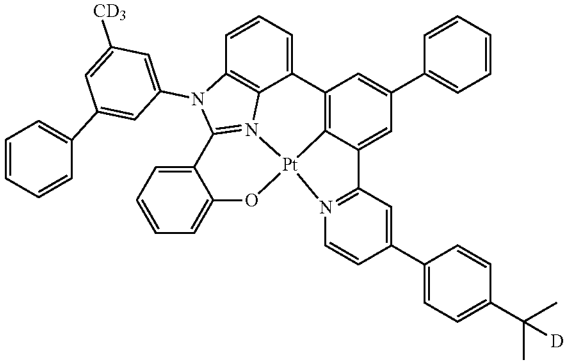
955
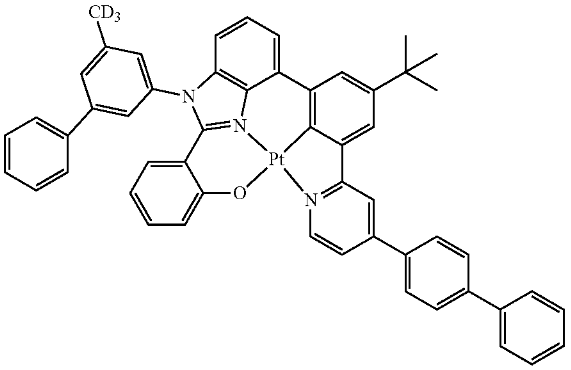
956
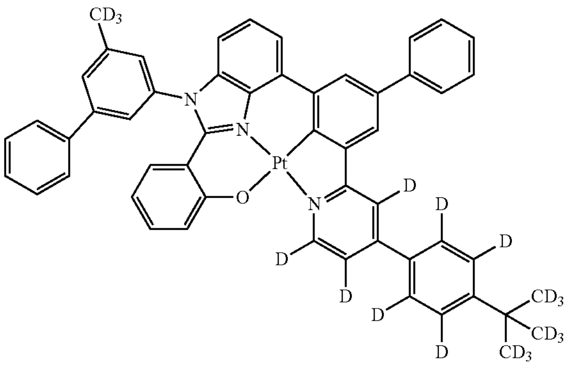

-continued
957
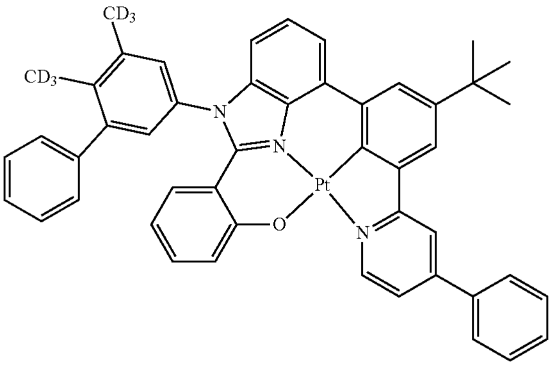
958
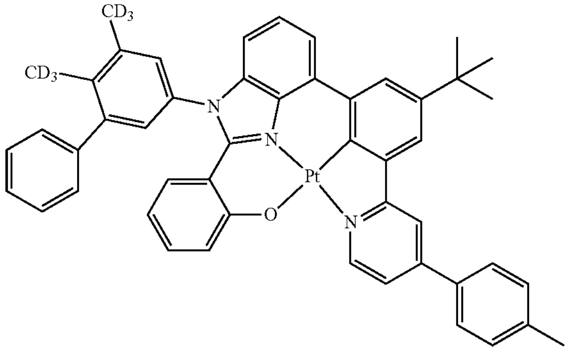
959
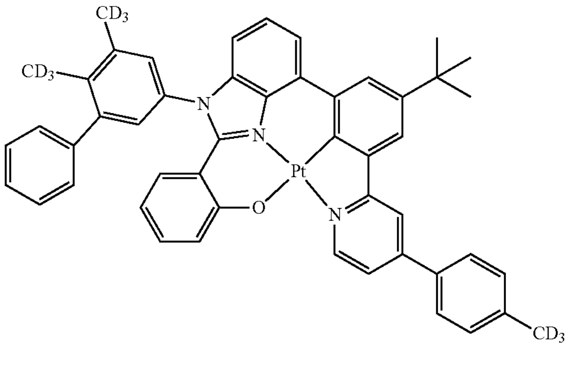
960
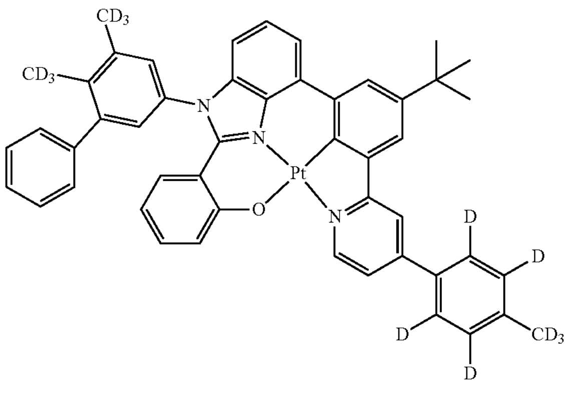
-continued
961
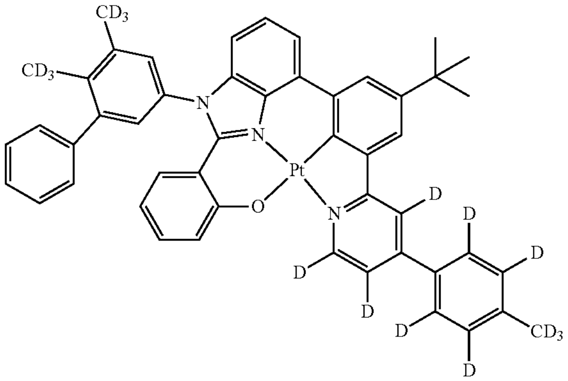
962
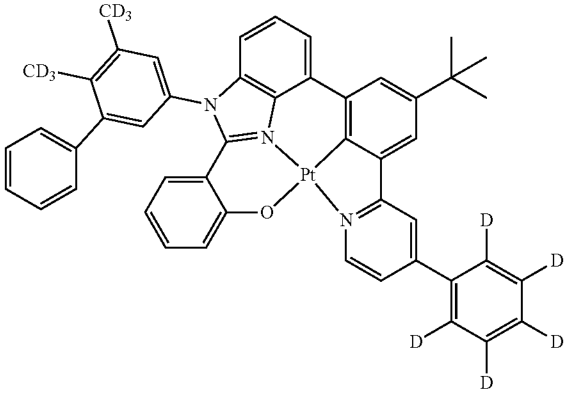
963
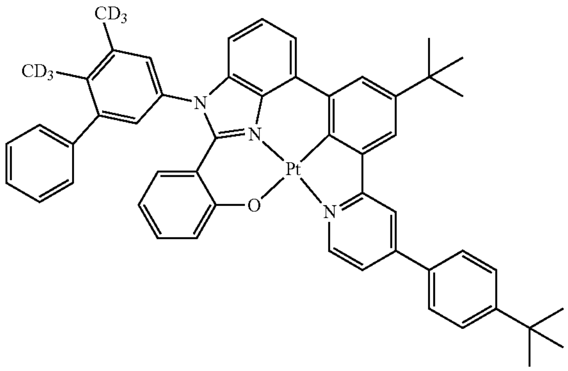
964
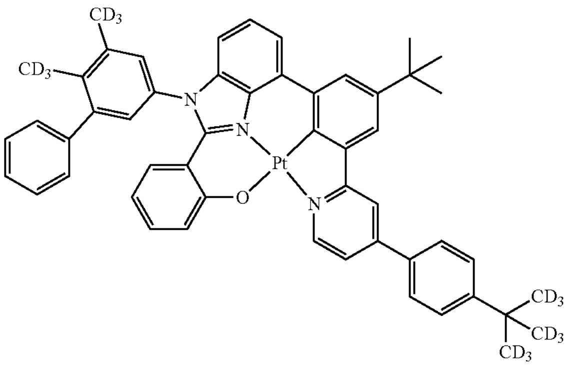

-continued
965
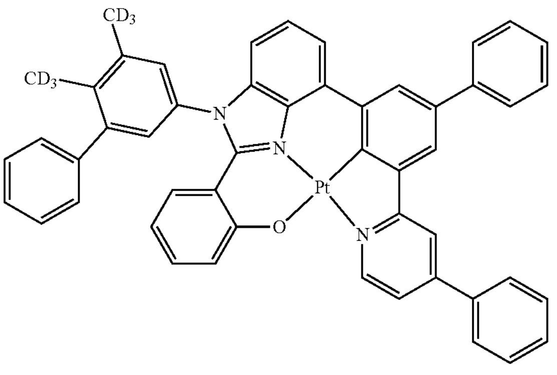
966
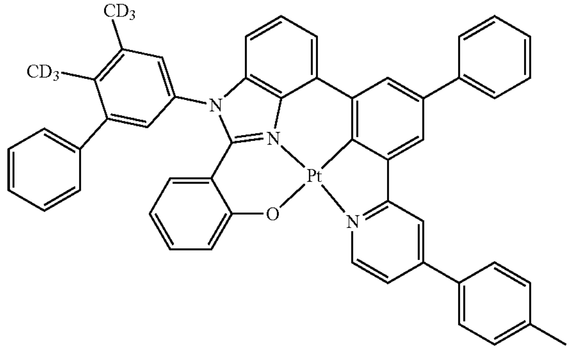
967
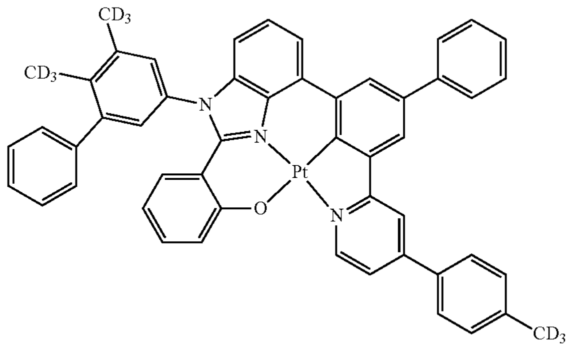
968
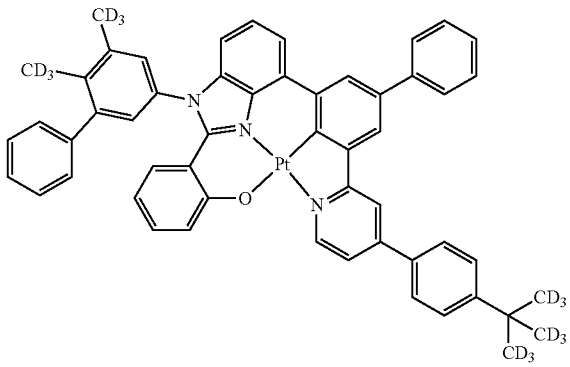
-continued
969
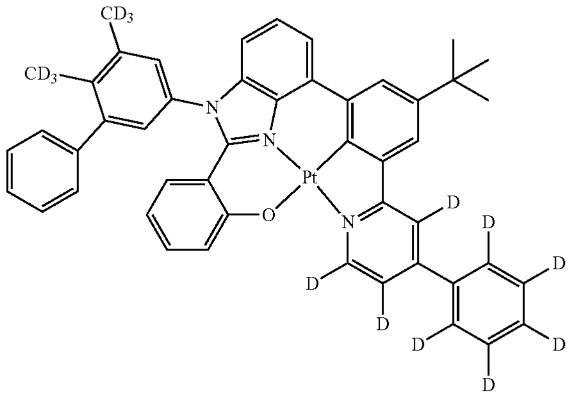
970
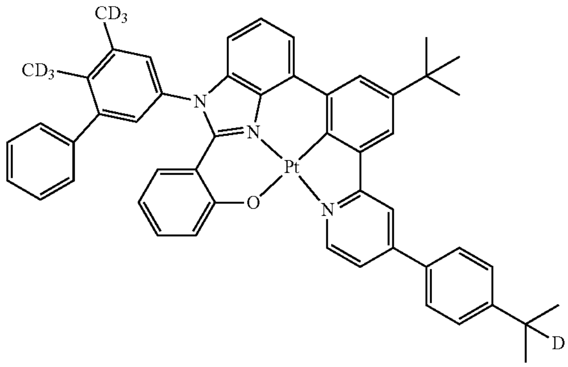
971
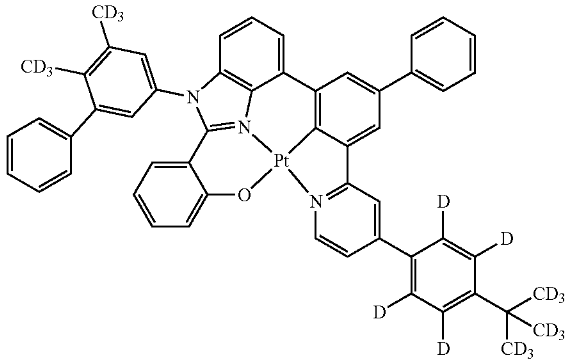
972
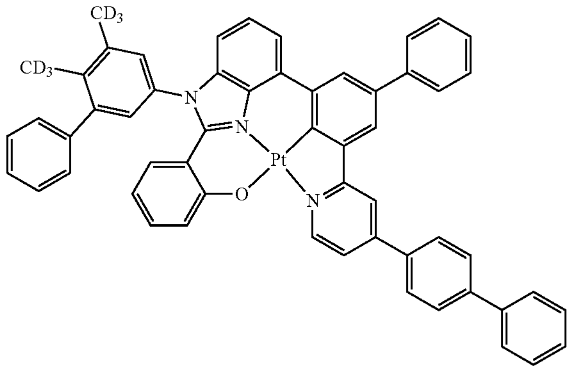

-continued
973
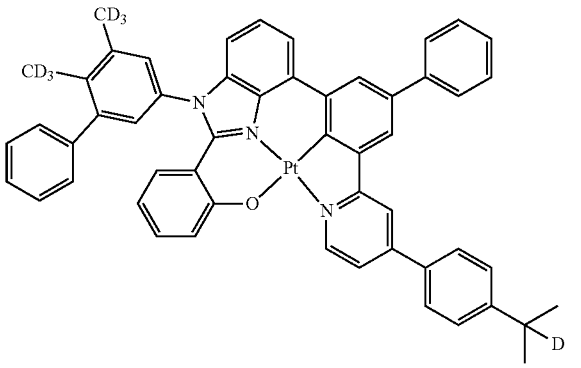
974
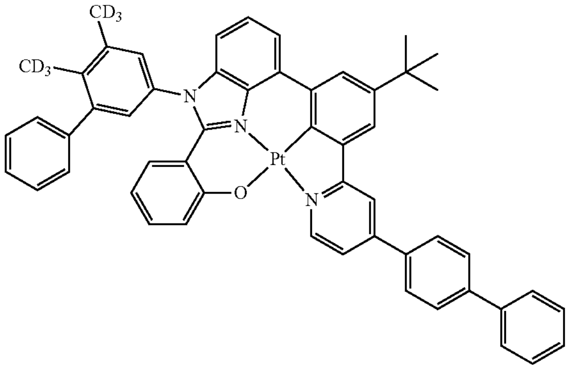
975
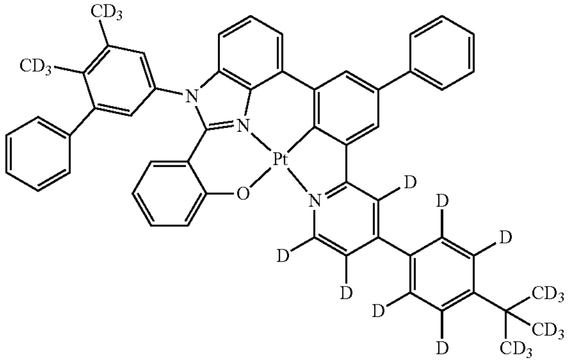
976
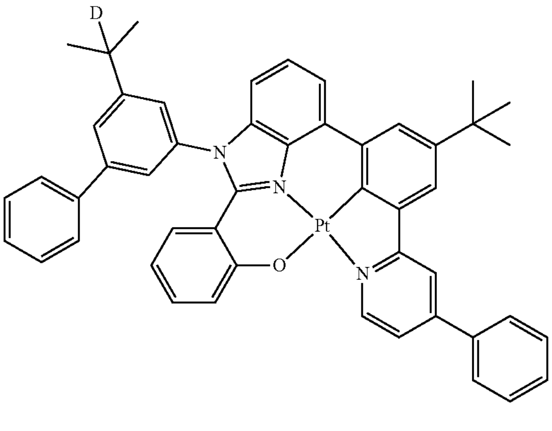
-continued
977
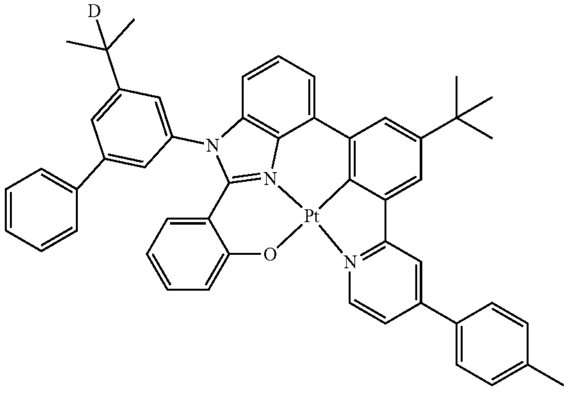
978
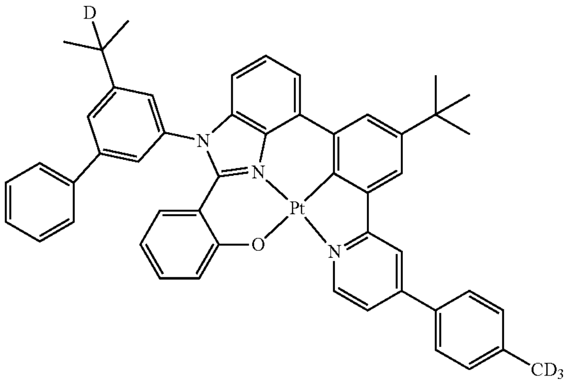
979
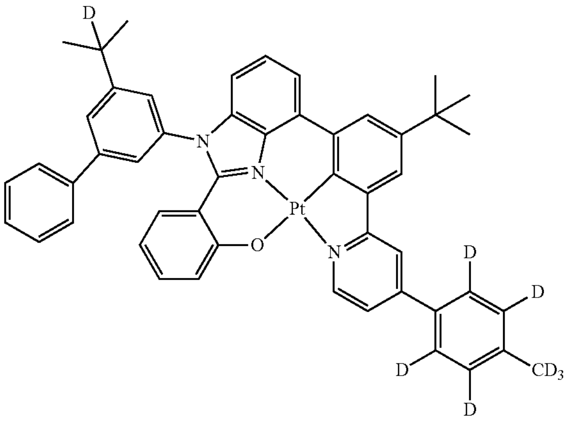

-continued
980
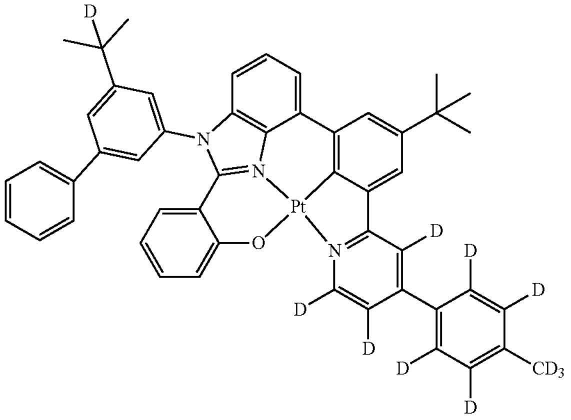
981
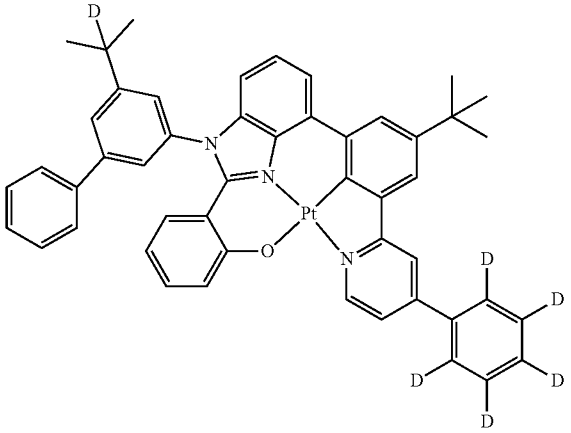
982
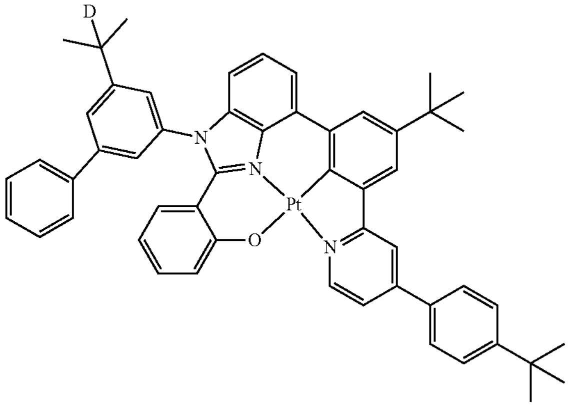
-continued
983
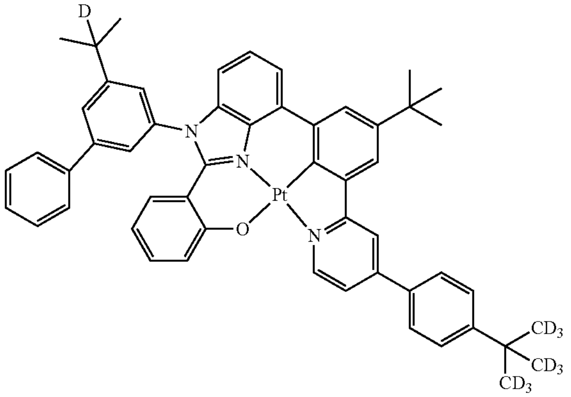
984
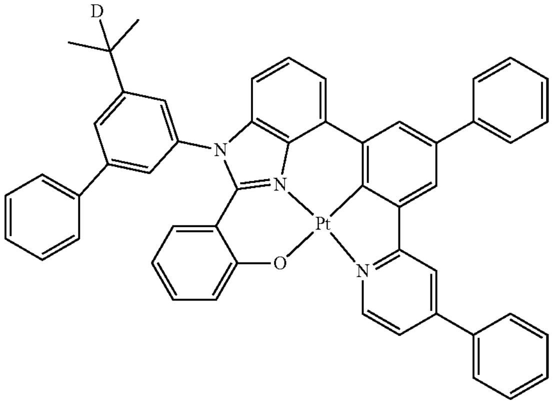
985
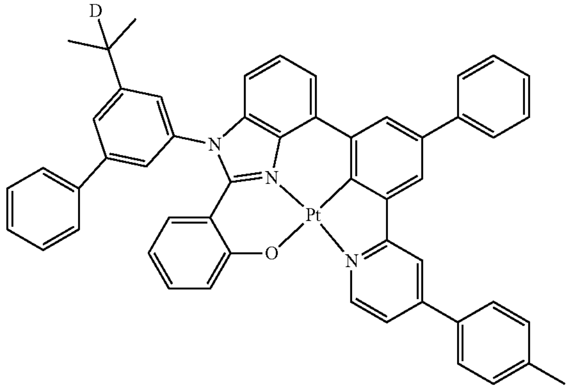

-continued
986
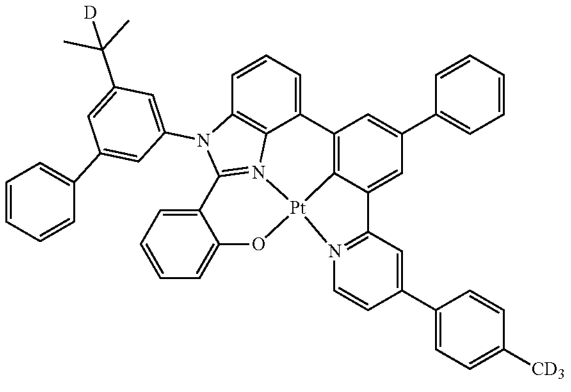
987
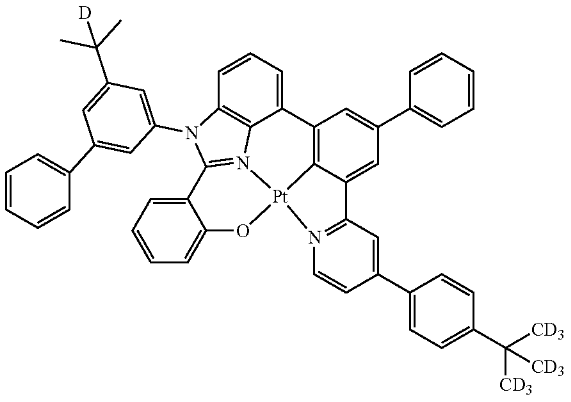
988
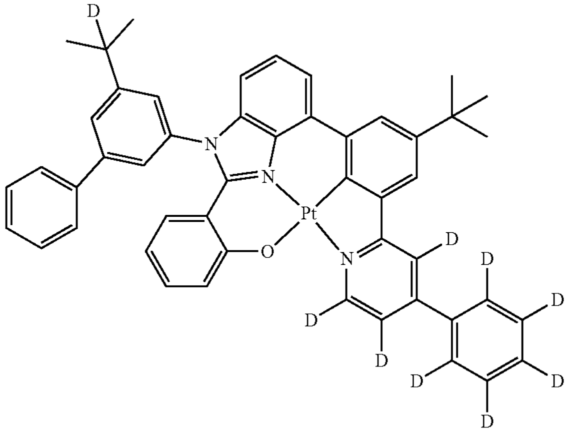
-continued
989
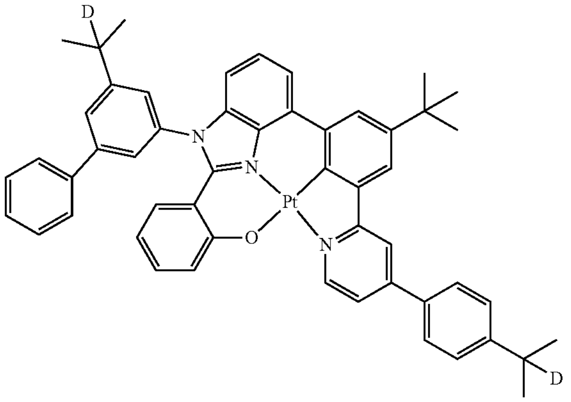
990
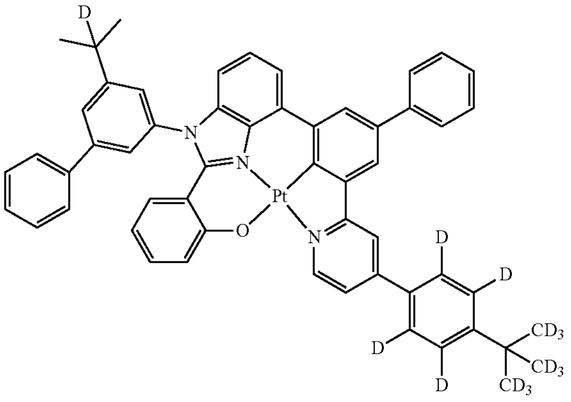
991
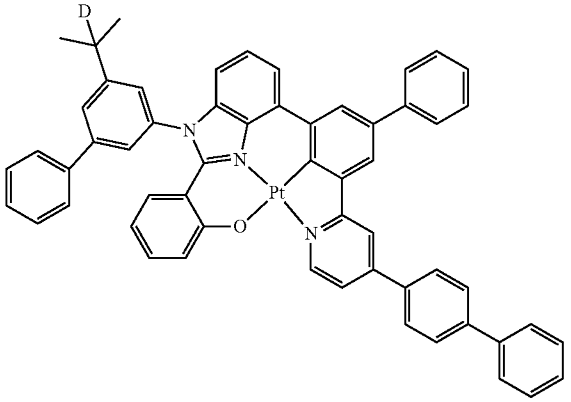

-continued
992
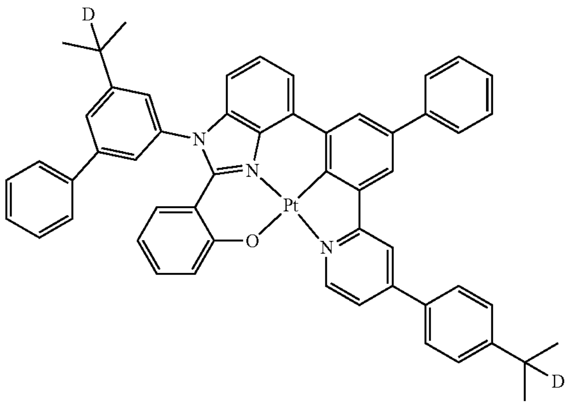
993
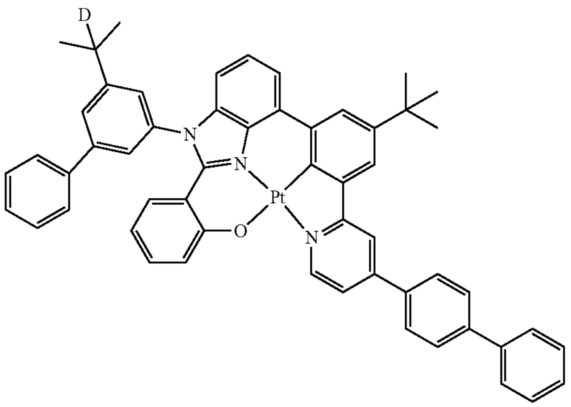
994
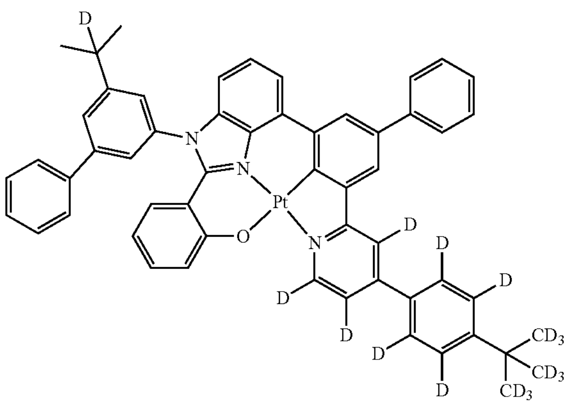
-continued
995
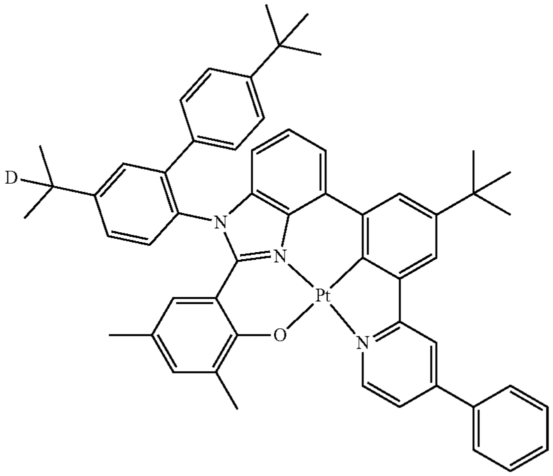
996
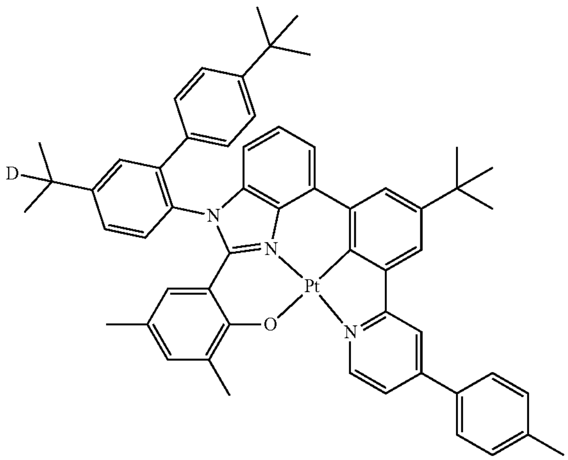
997
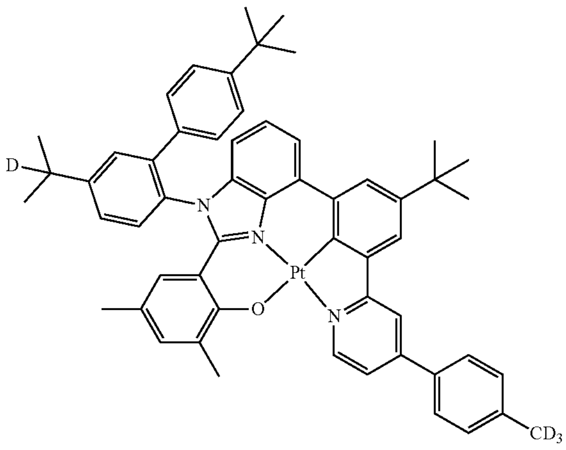

-continued
998
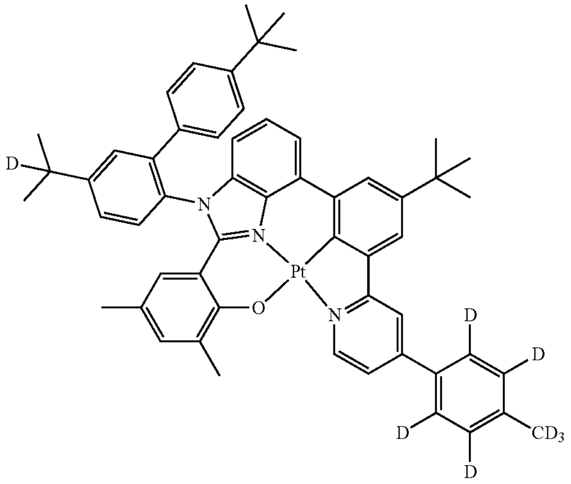
999
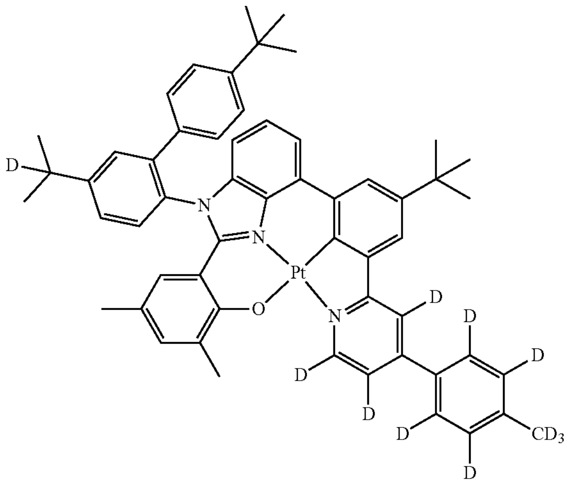
1000
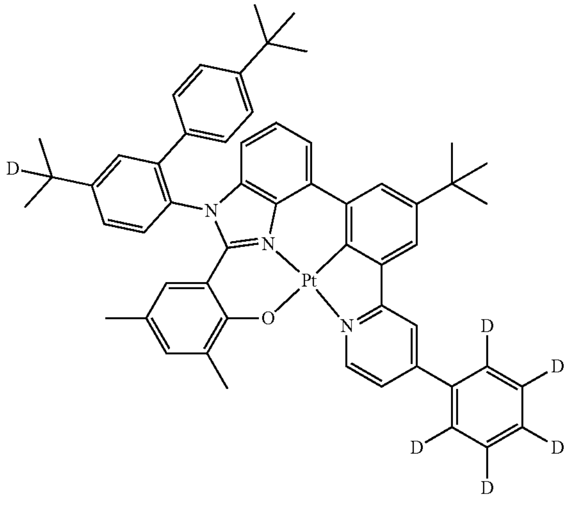
-continued
1001
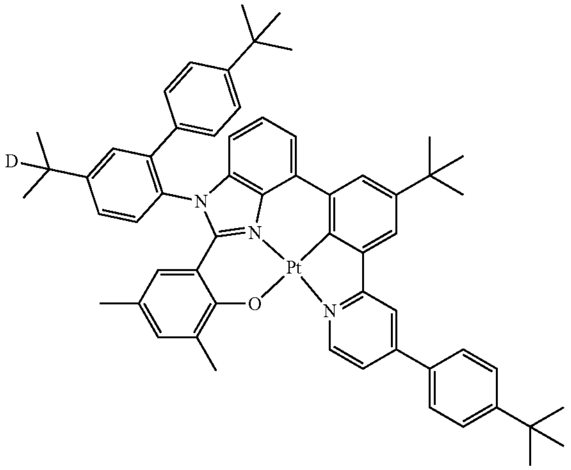
1002
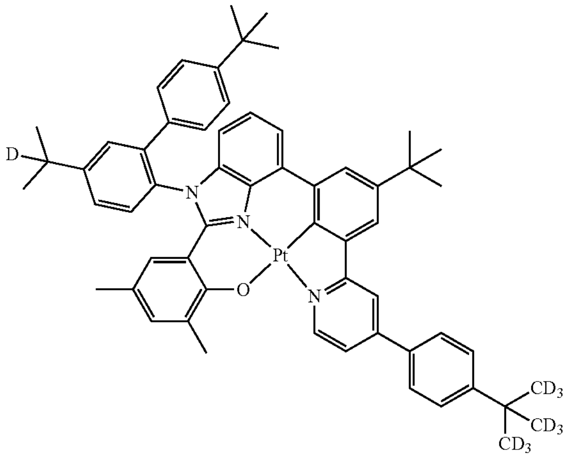
1003
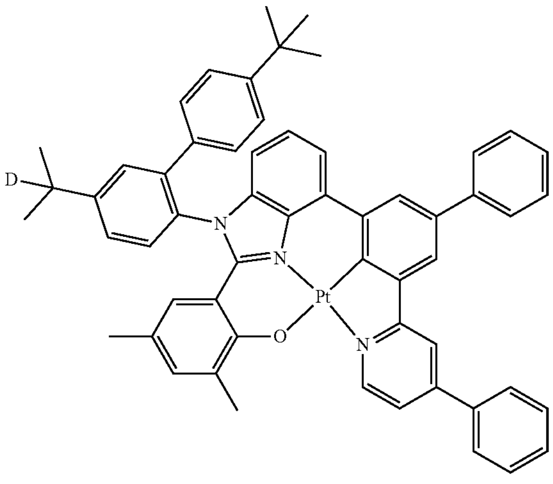

-continued
1004
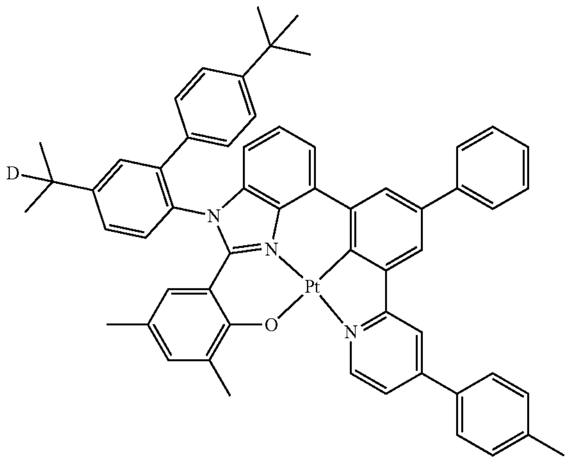
1005
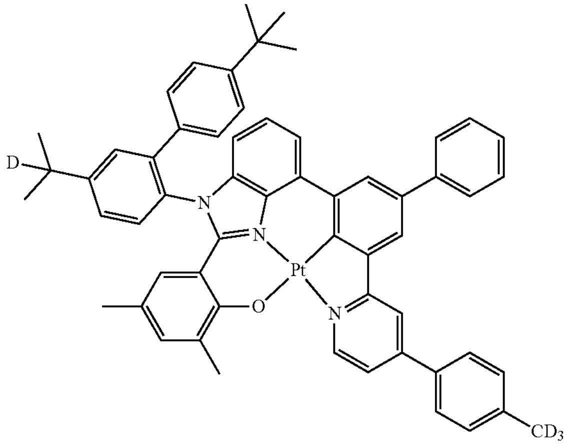
1006
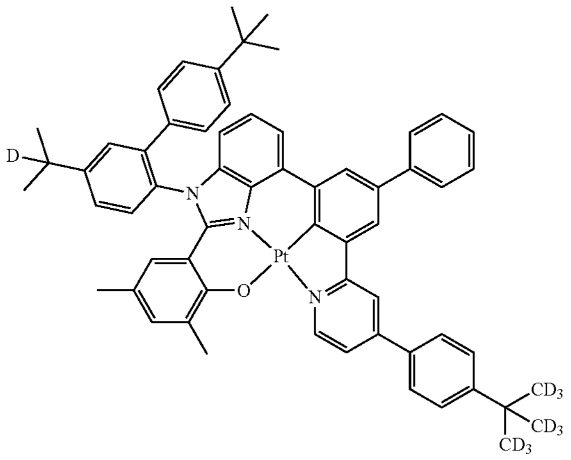
-continued
1007
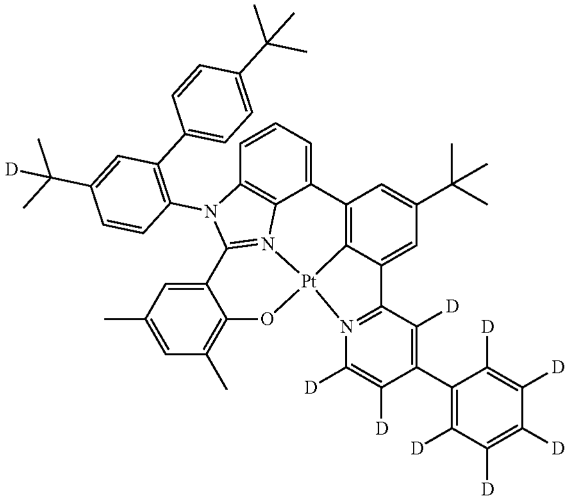
1008
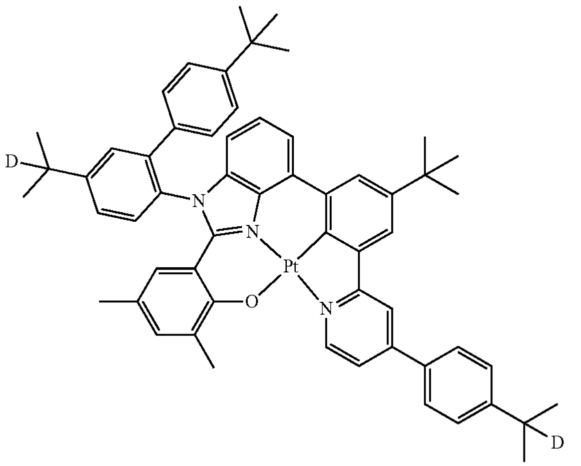
1009
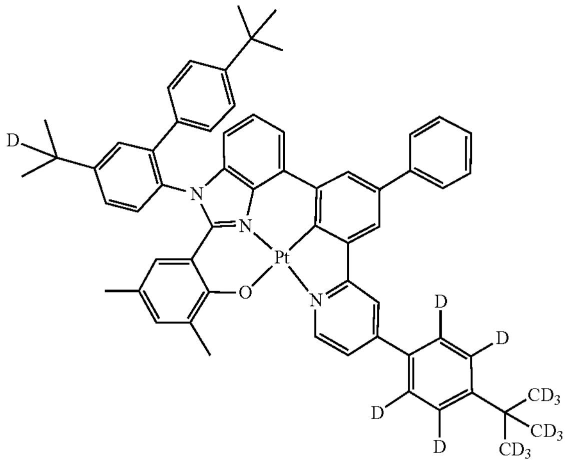

-continued
1010
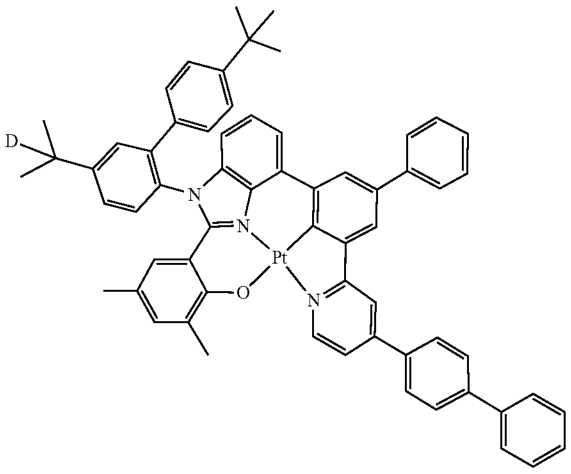
1011
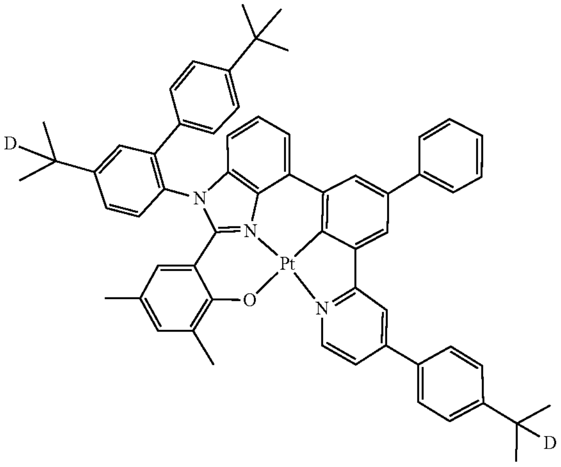
1012
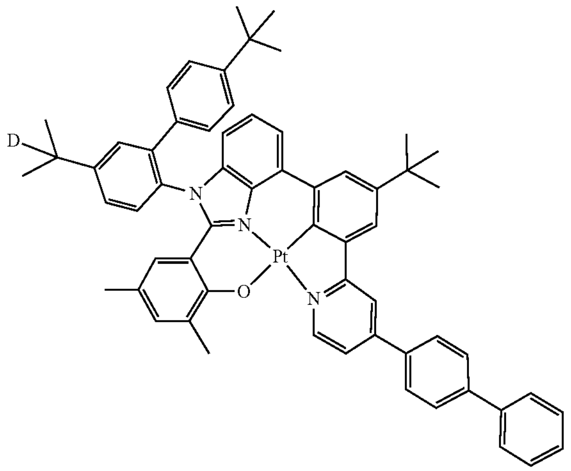
-continued
1013
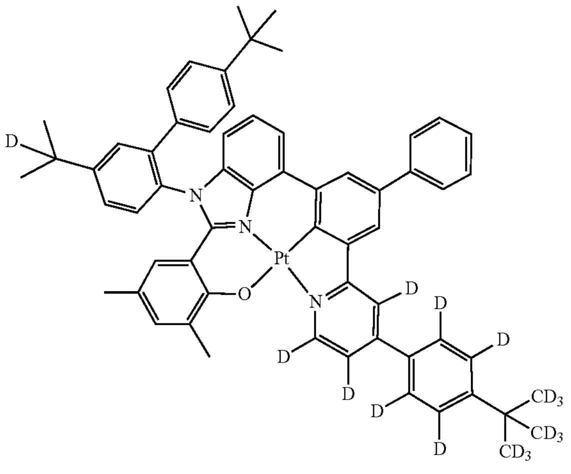
1014
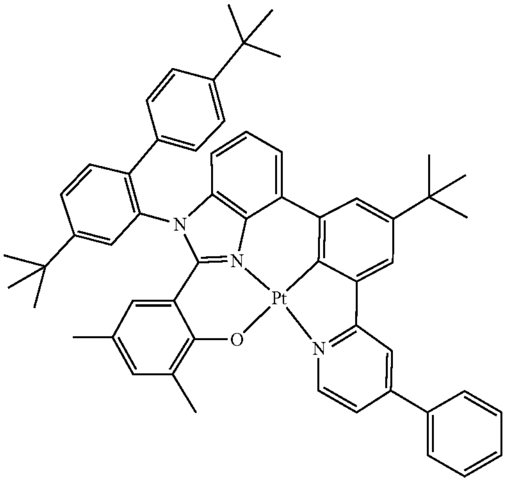
1015
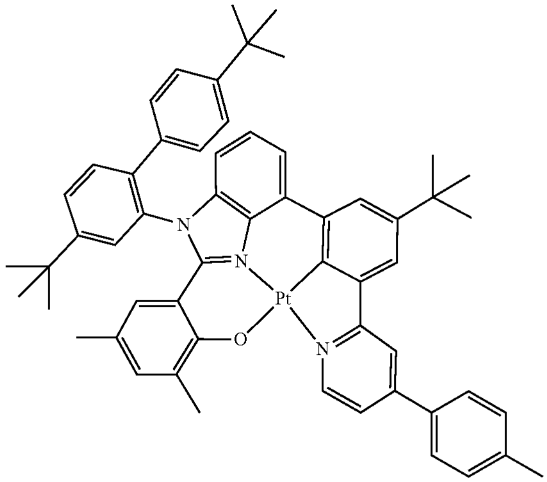

-continued
1016
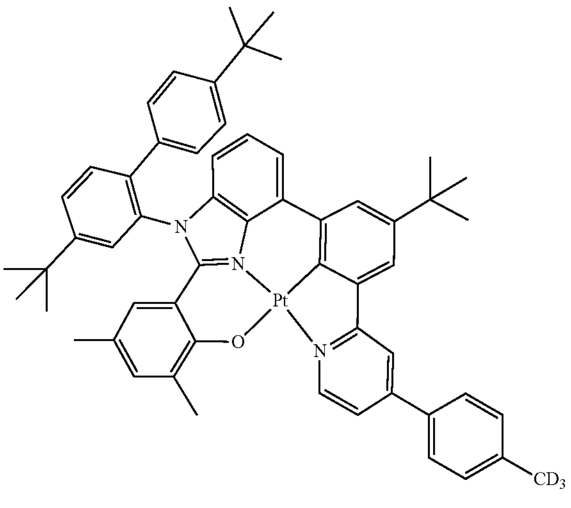
1017
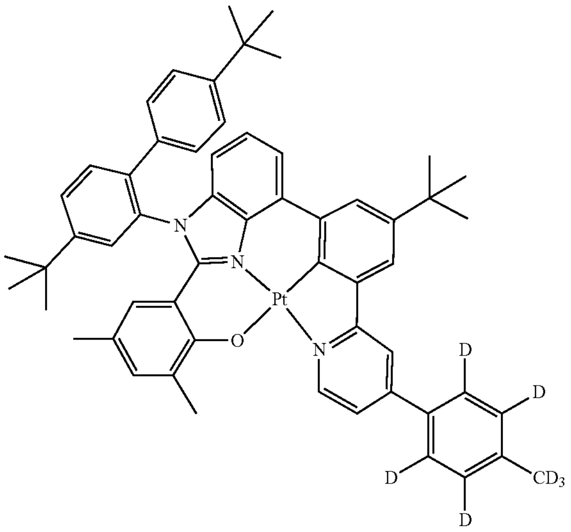
1018
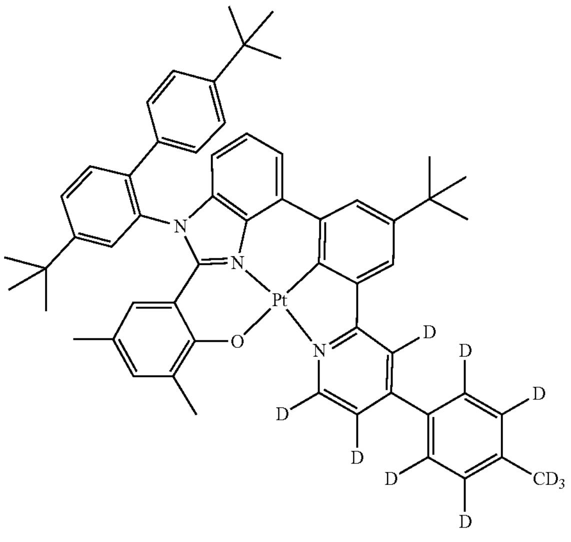
-continued
1019
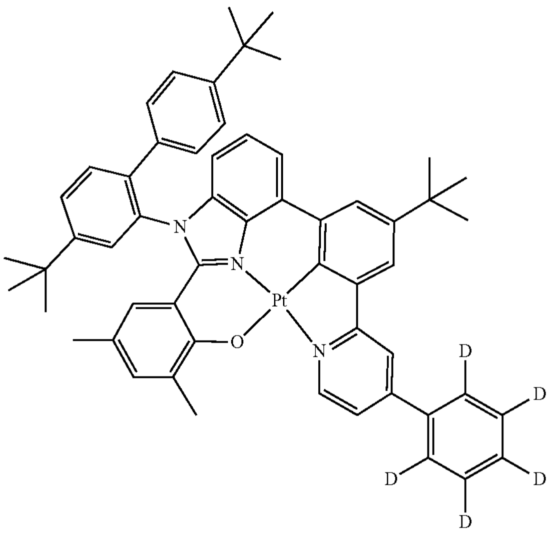
1020
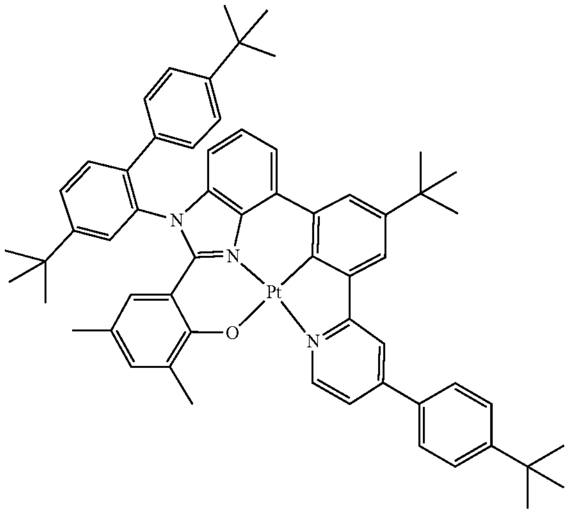
1021
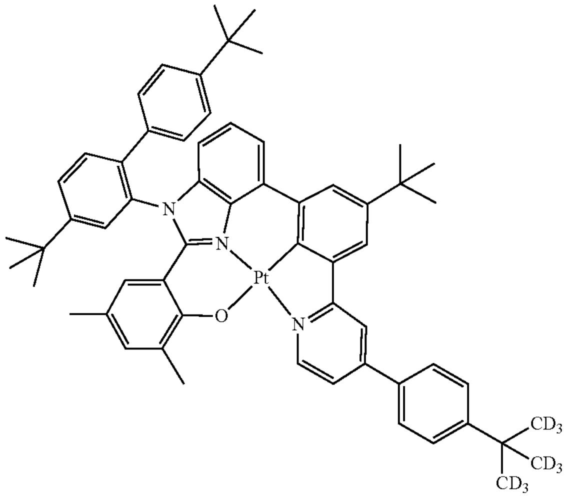

-continued
1022
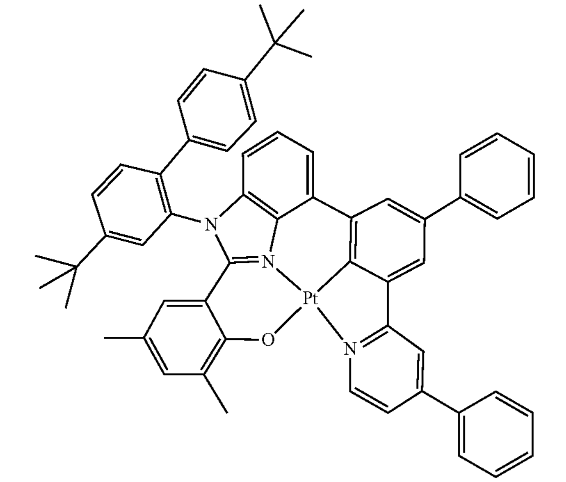
1023
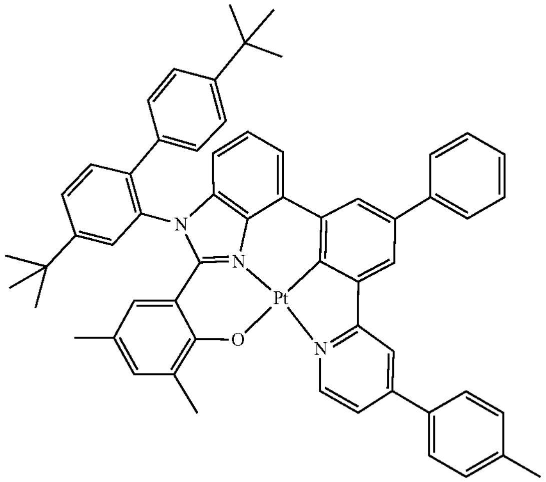
1024
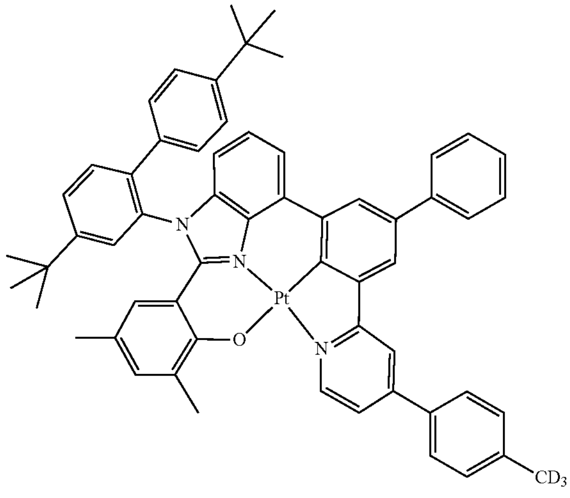
-continued
1025
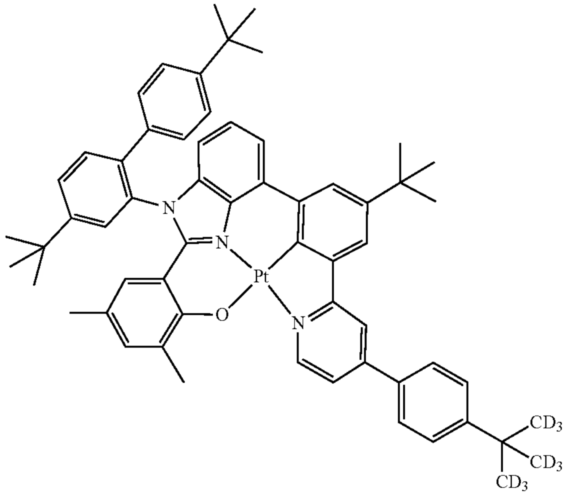
1026
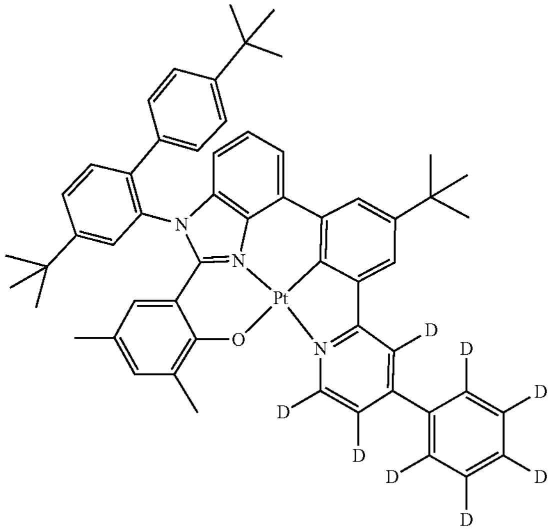
1027
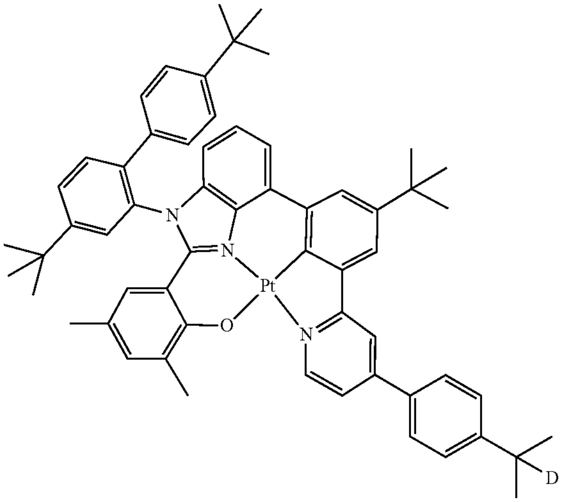

-continued
1028
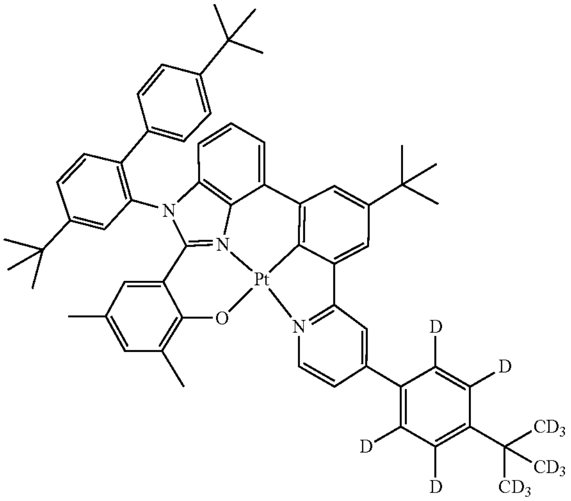
1029
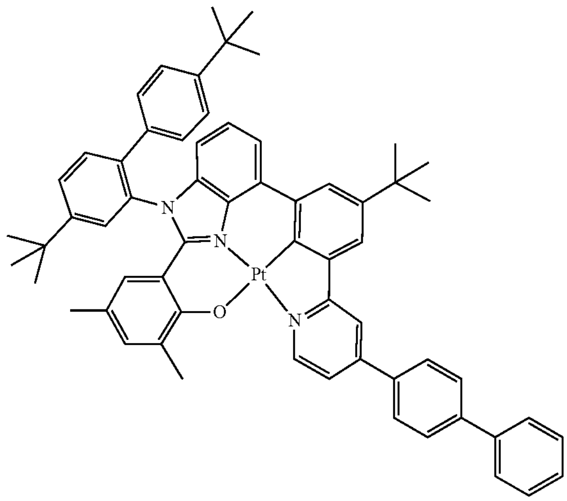
1030
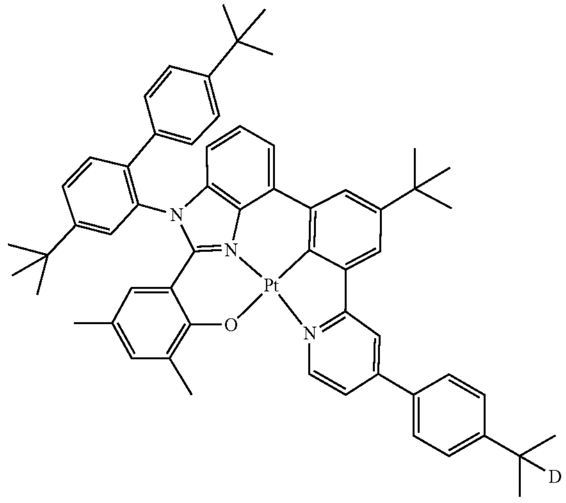
-continued
1031
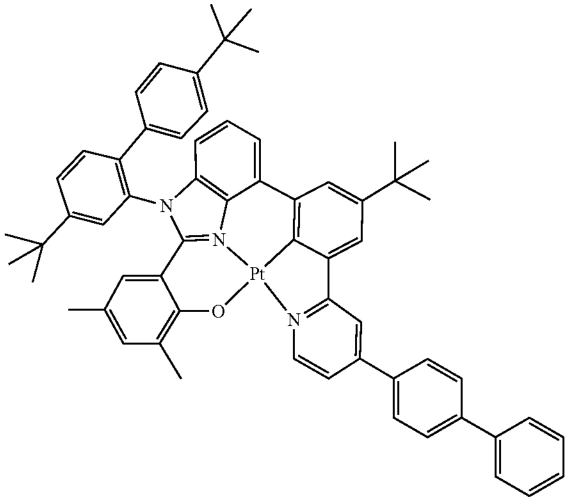
1032
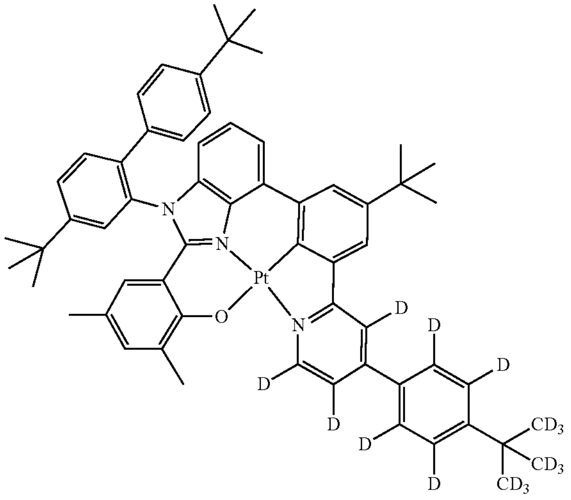
1033
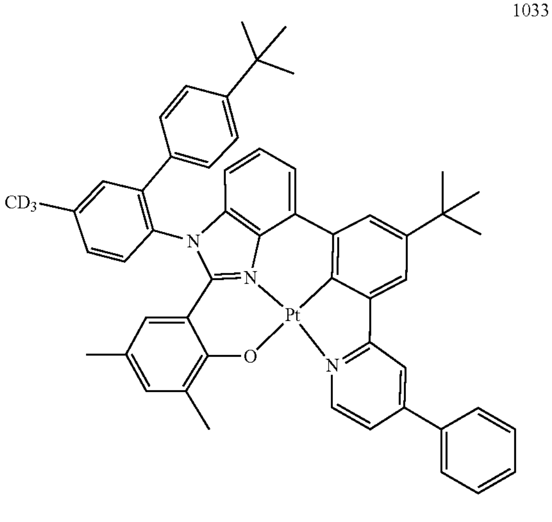

-continued
1034
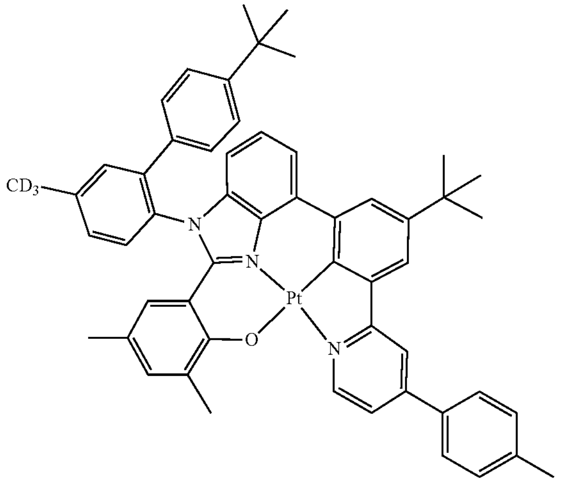
1035
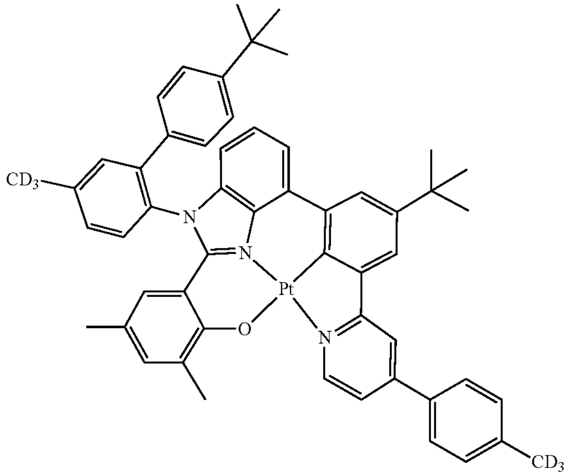
1036
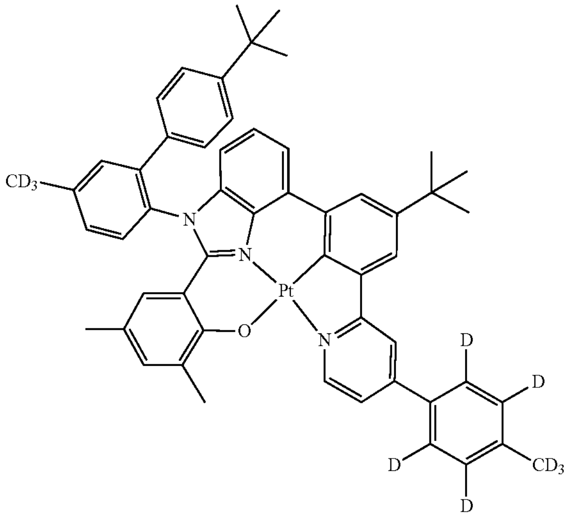
-continued
1037
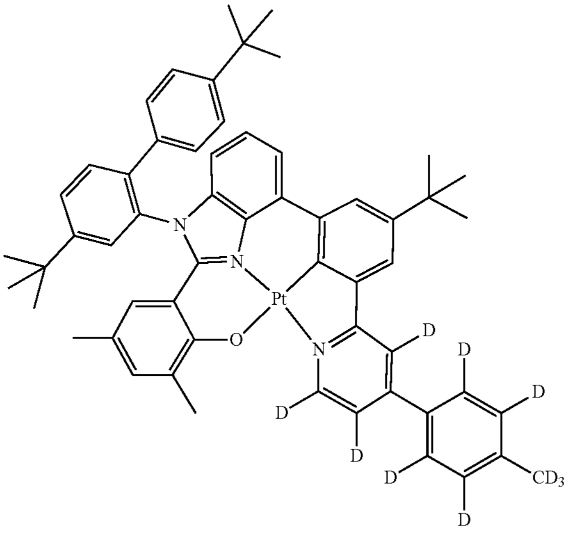
1038
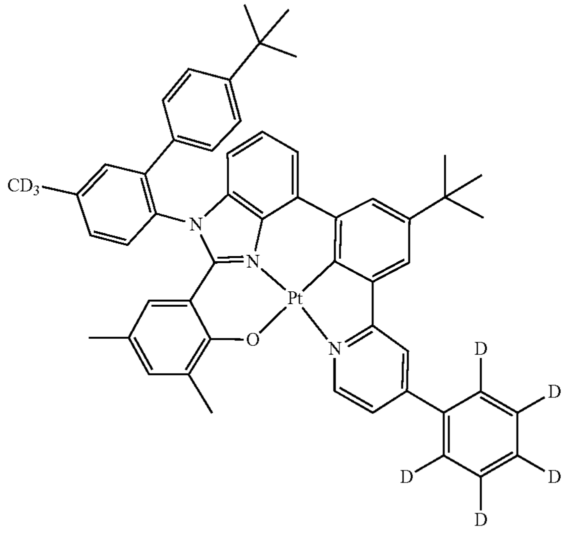
1039
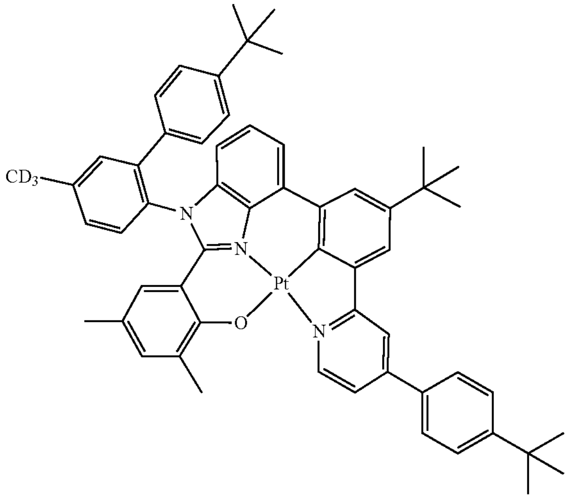

-continued
1040
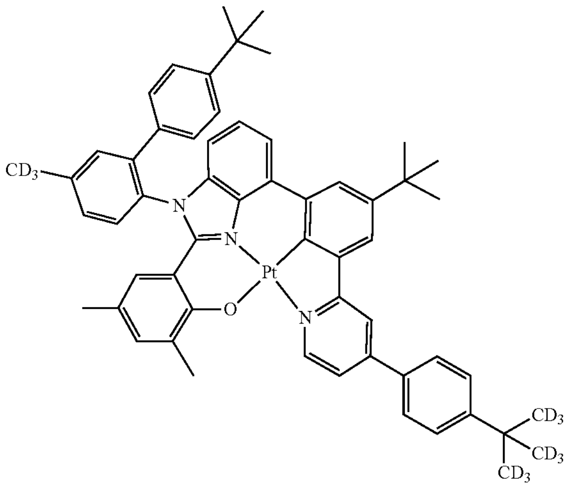
1041
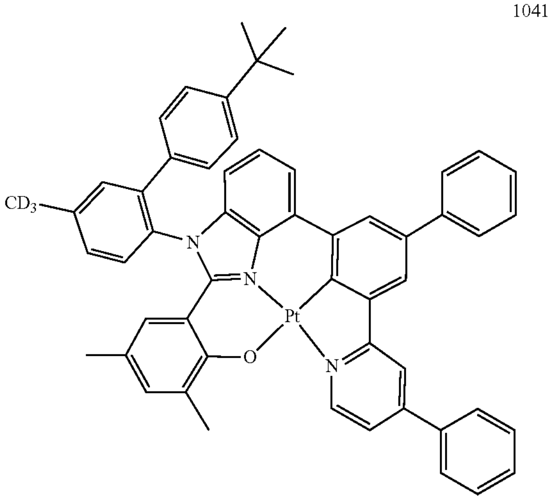
1042
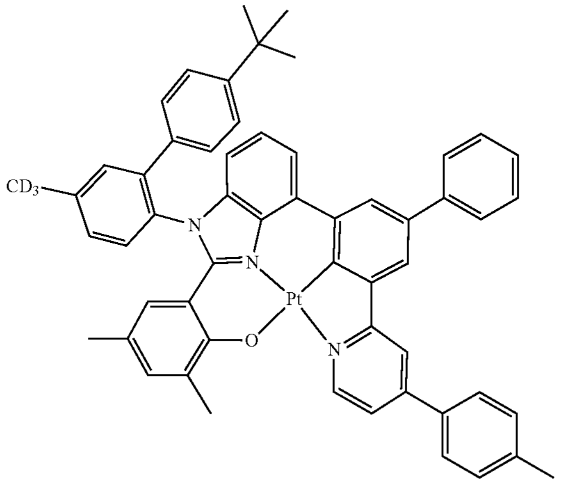
-continued
1043
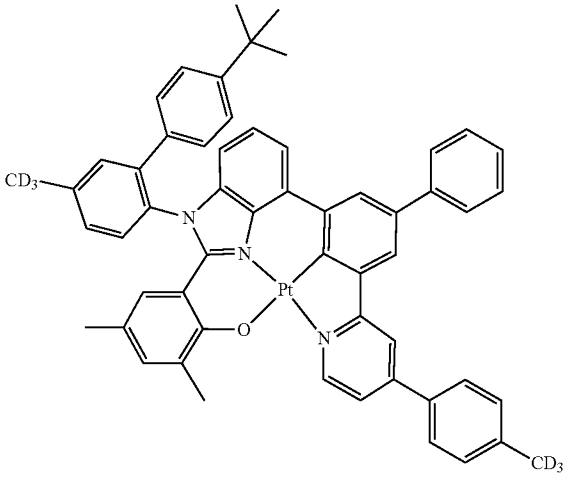
1044
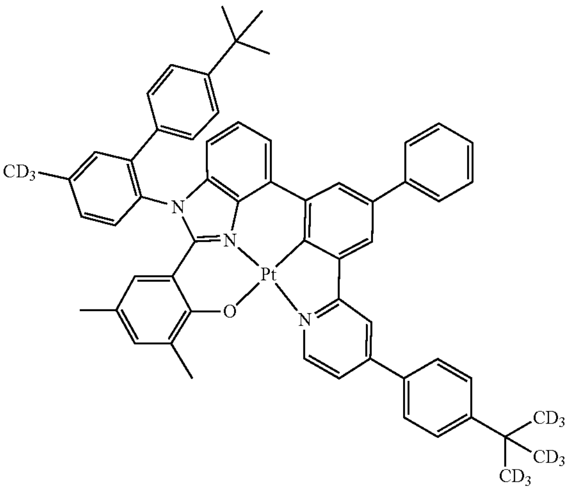
1045
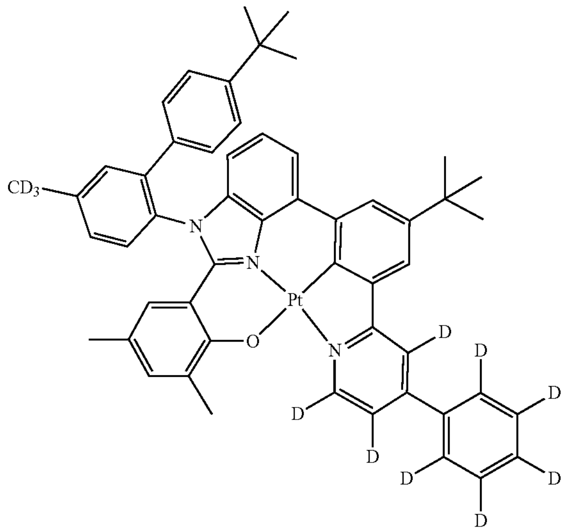

-continued
1046
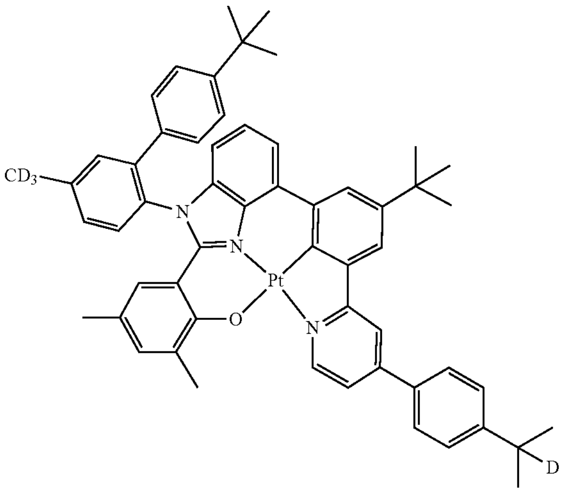
1047
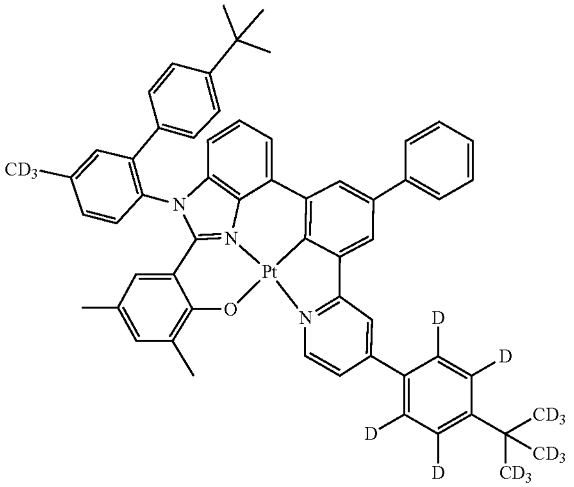
1048
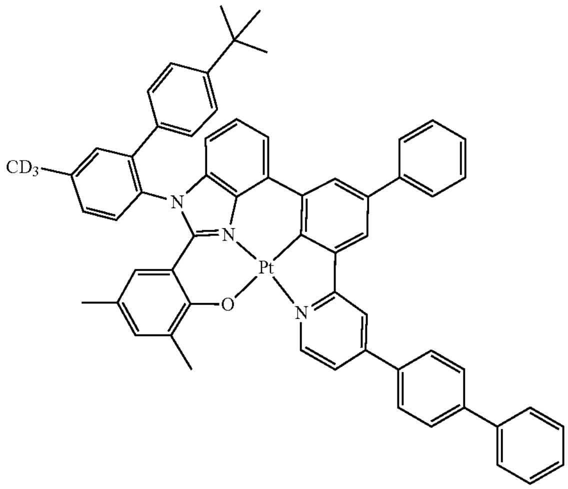
-continued
1049
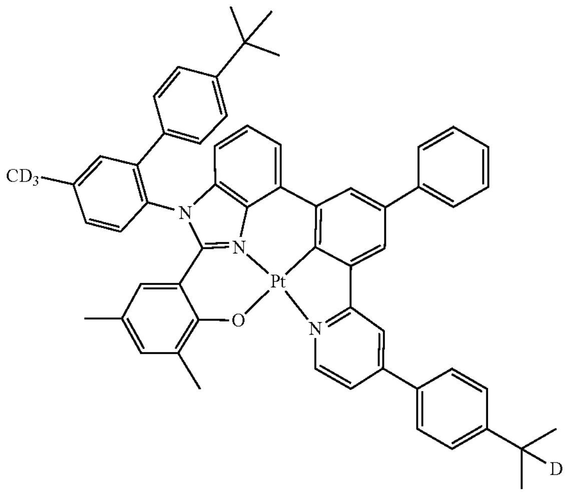
1050
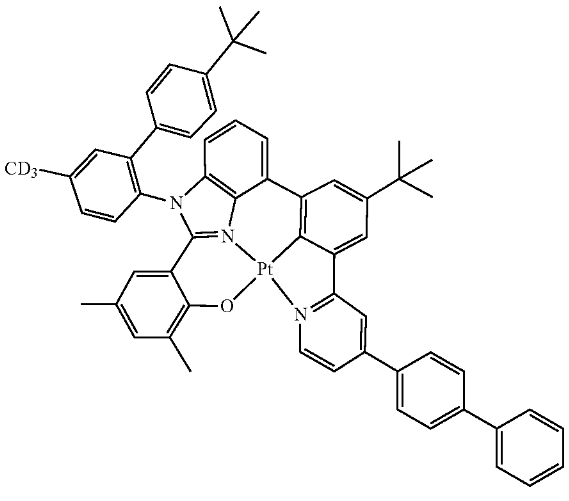
1051
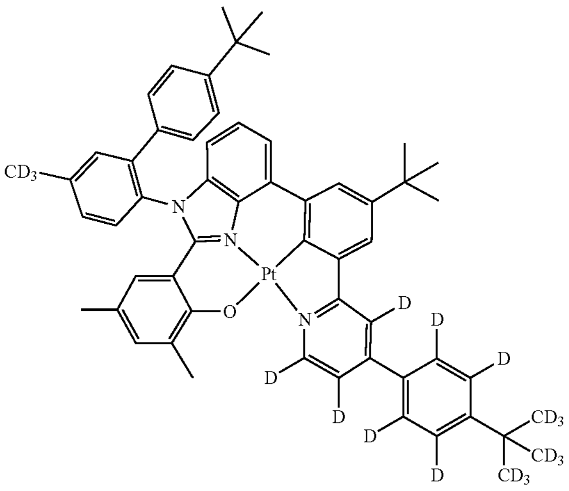

-continued
1052
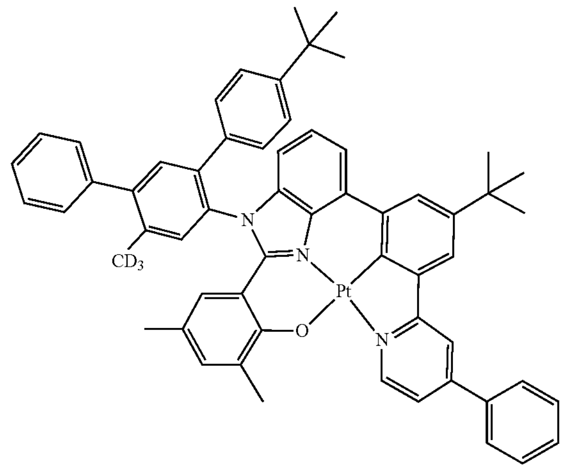
1053
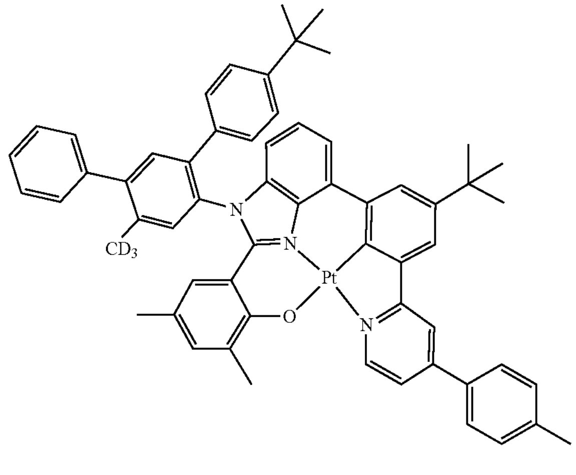
1054
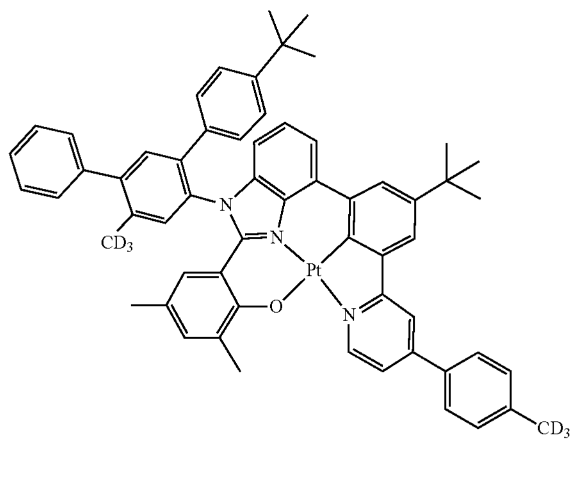
-continued
1055
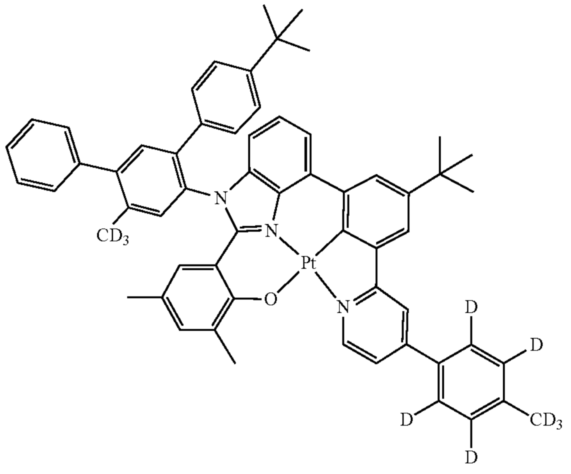
1056
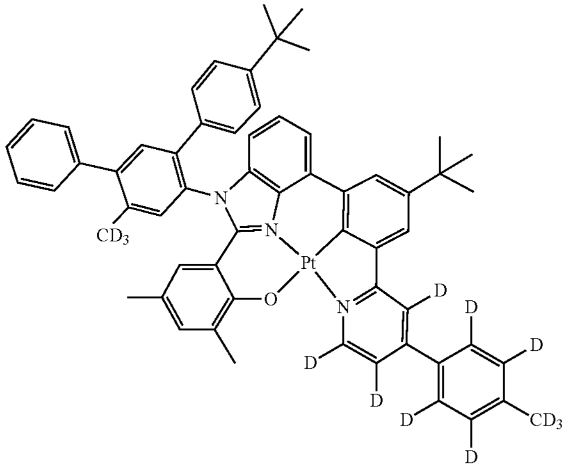
1057
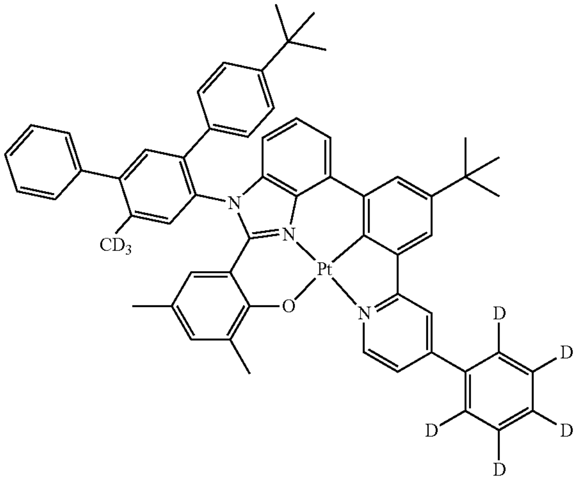

-continued
1058
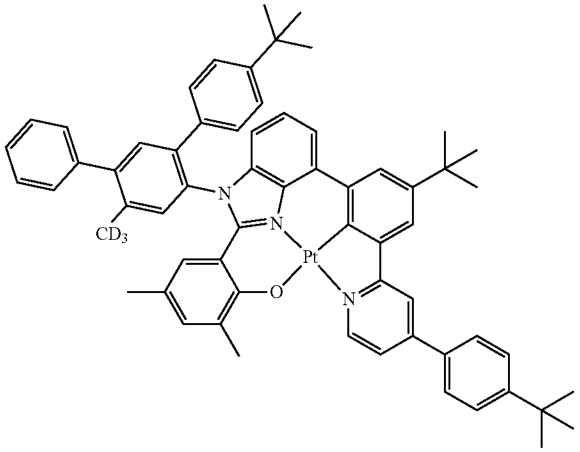
1059
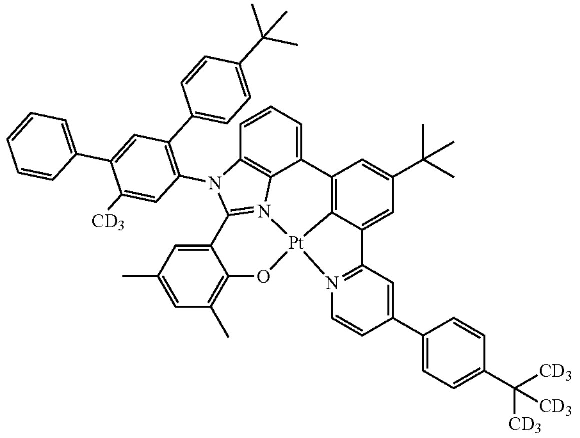
1060
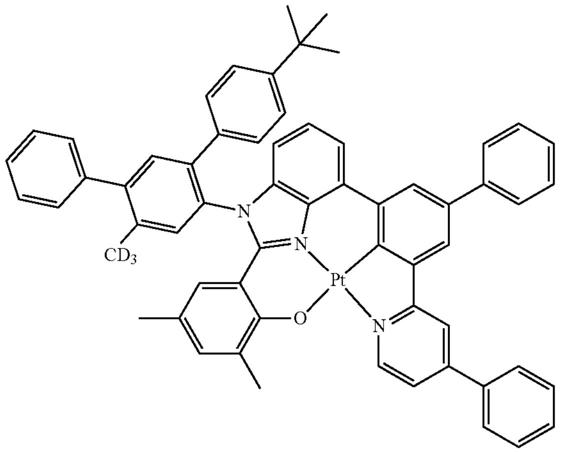
-continued
1061
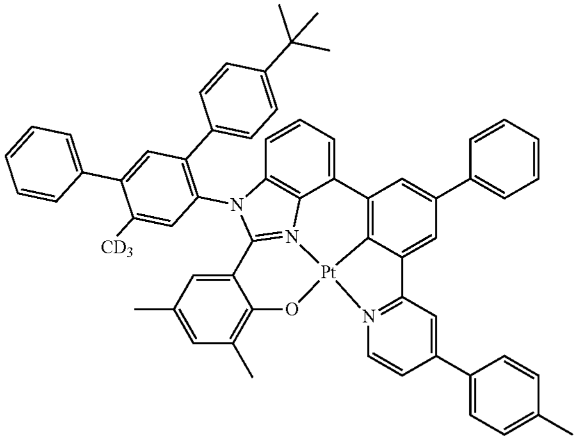
1062
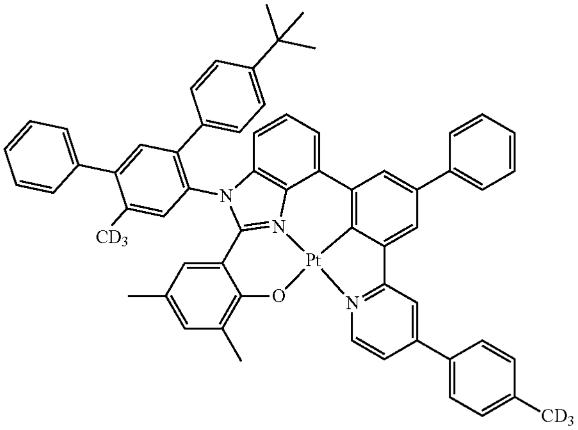
1063
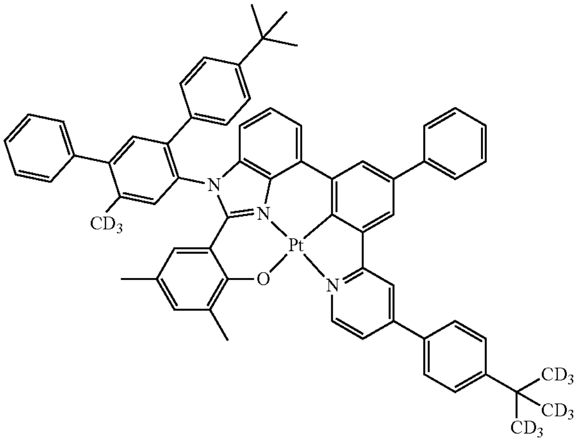

-continued
1064
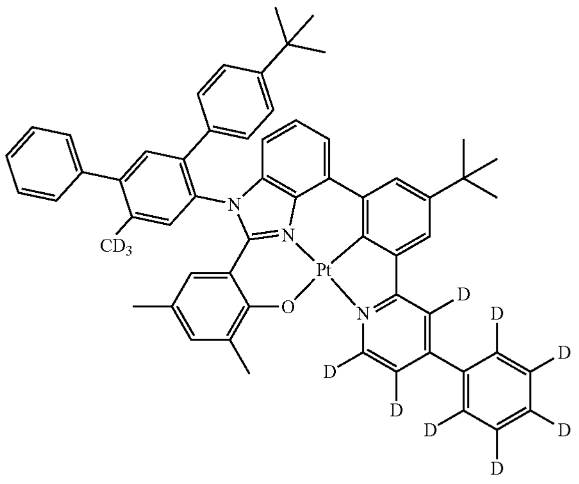
1065
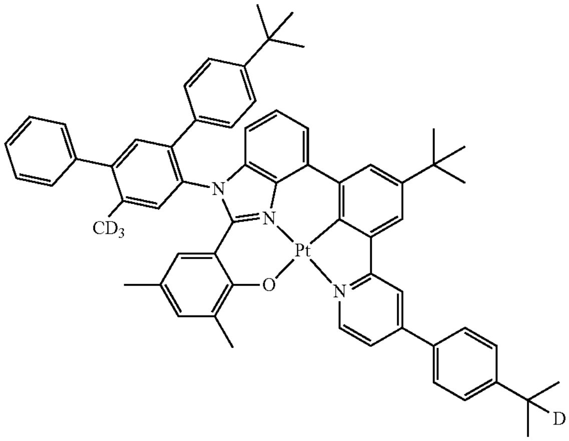
1066
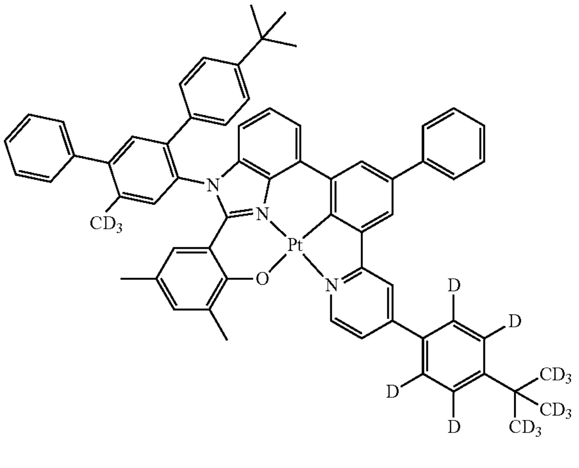
-continued
1067
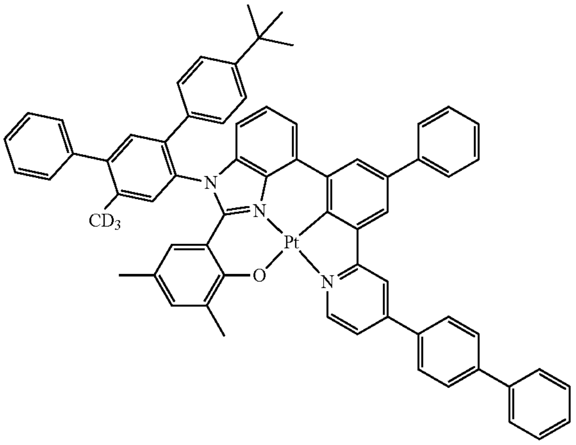
1068
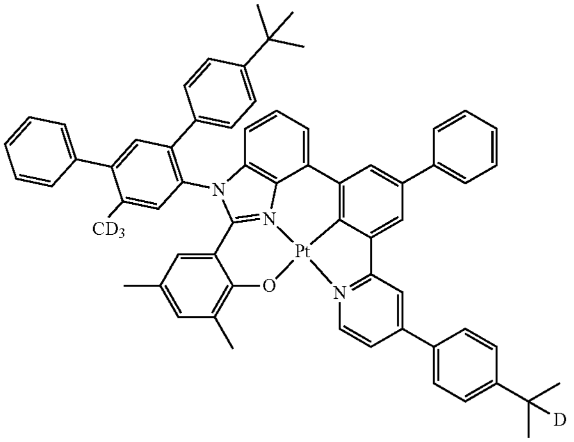
1069
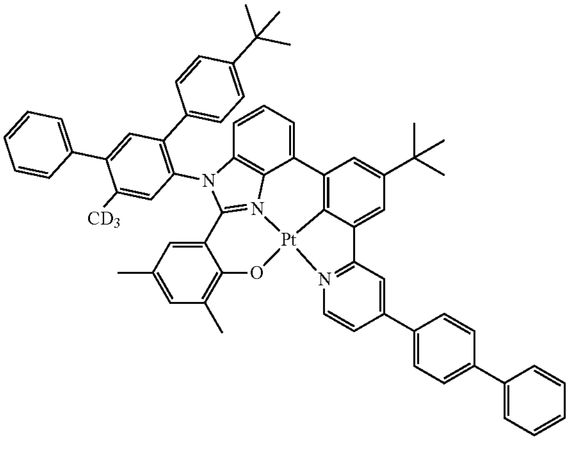

-continued
1070
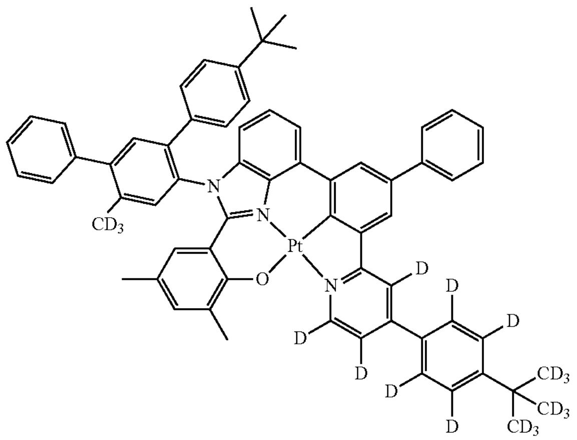
1071
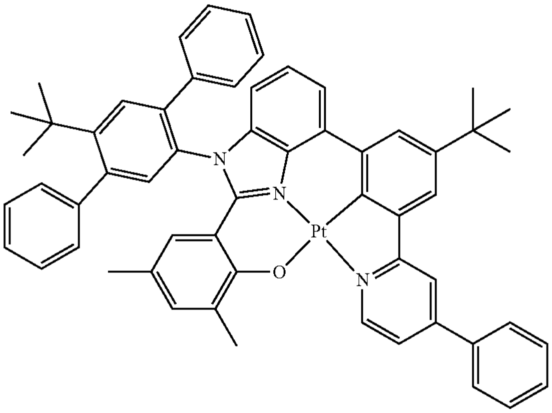
1072
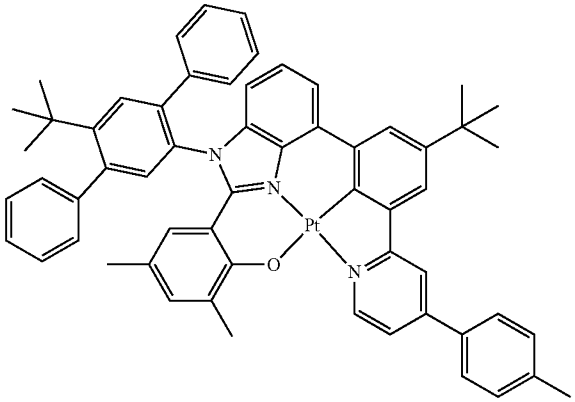
-continued
1073
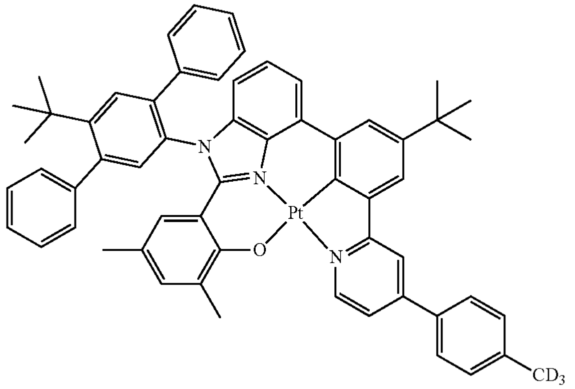
1074
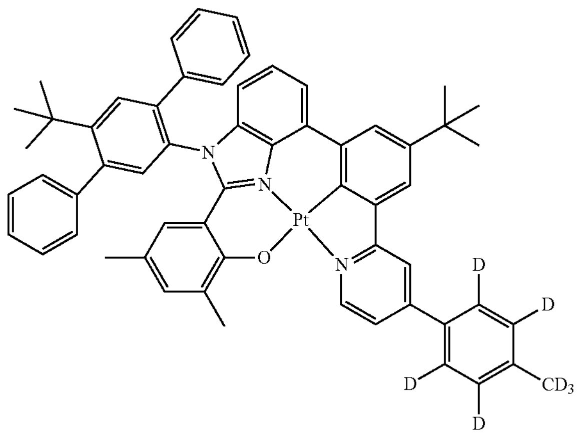
1075
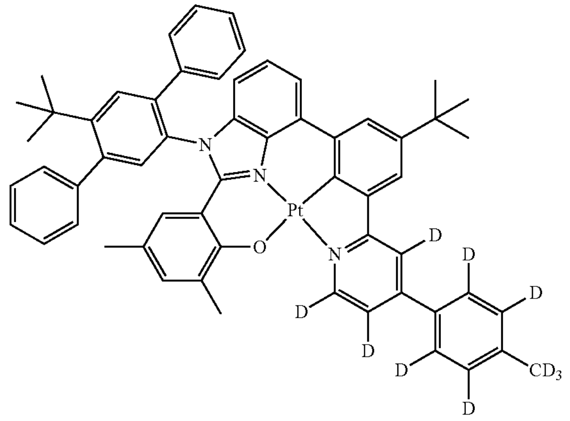

-continued
1076
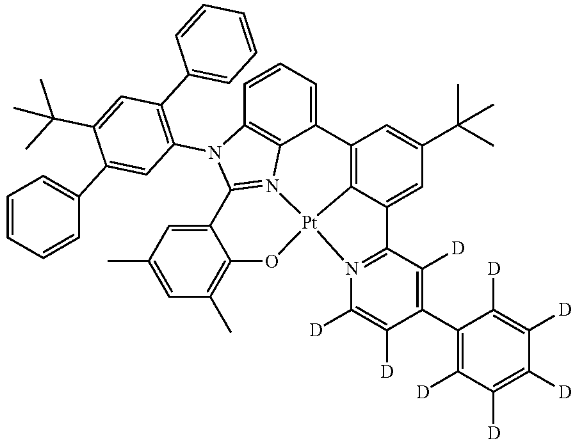
1077
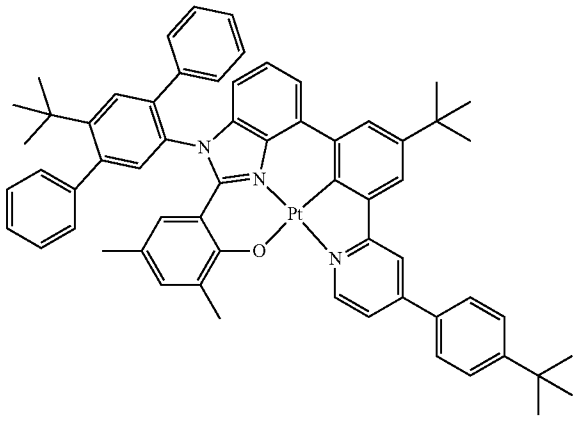
1078
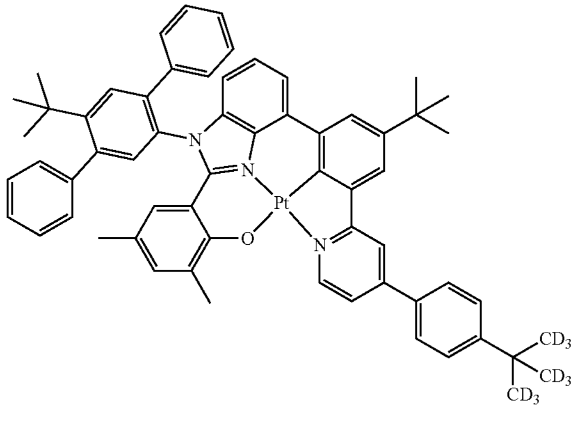
-continued
1079
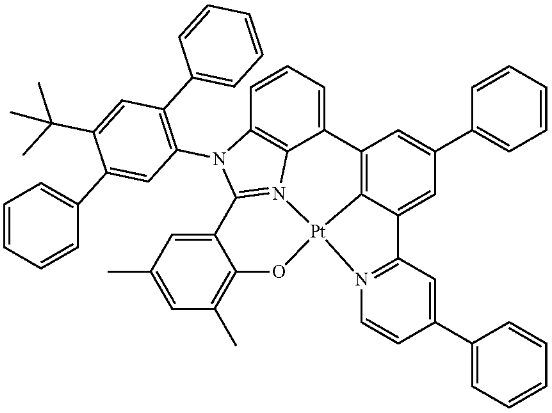
1080
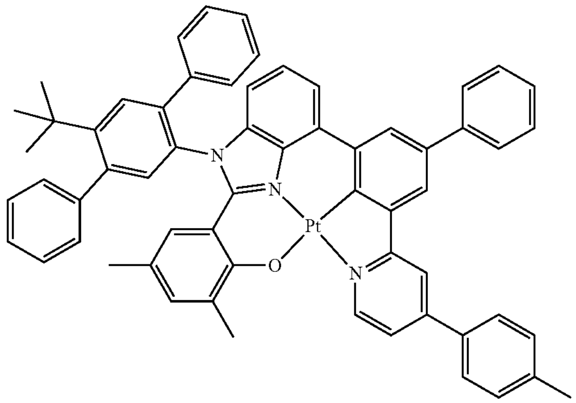
1081
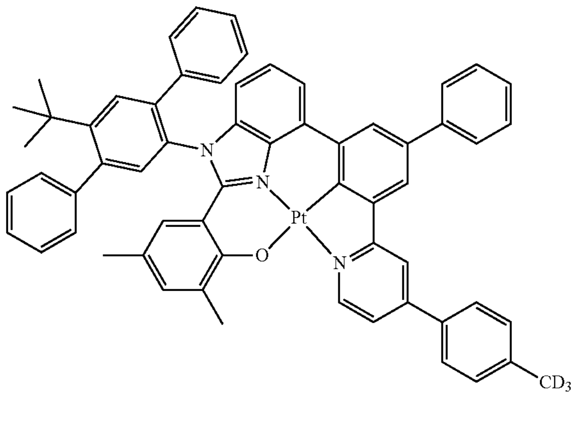

-continued
1082
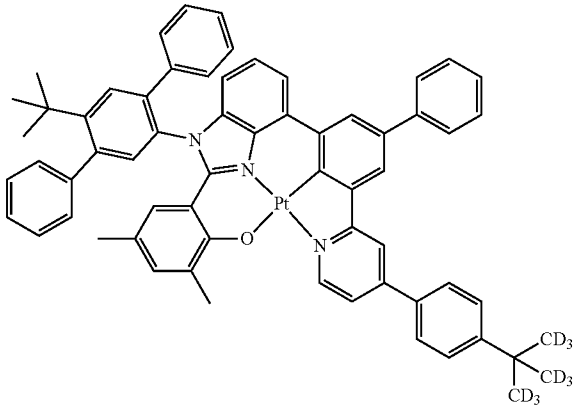
1083
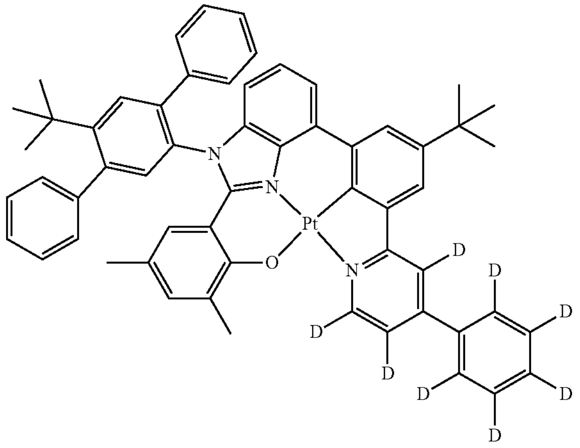
1084
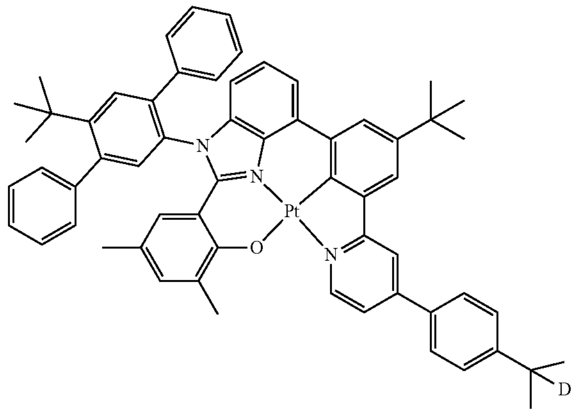
-continued
1085
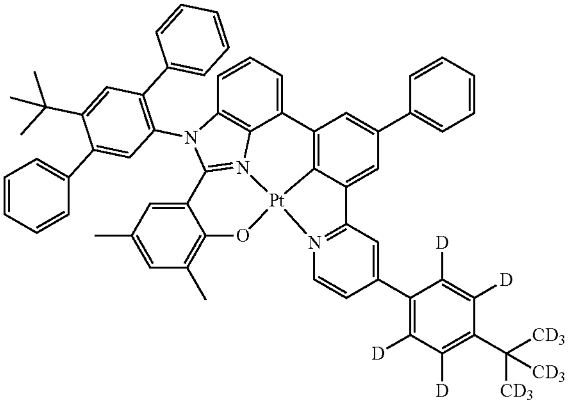
1086
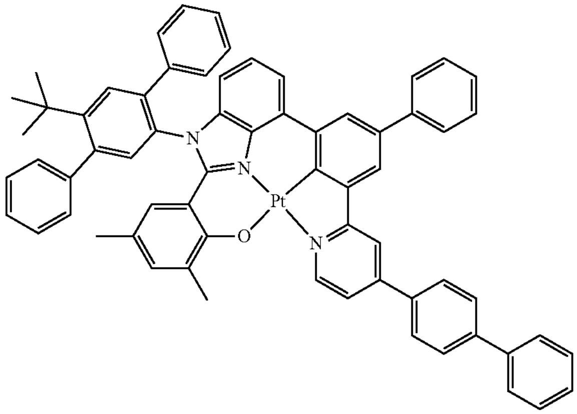
1087
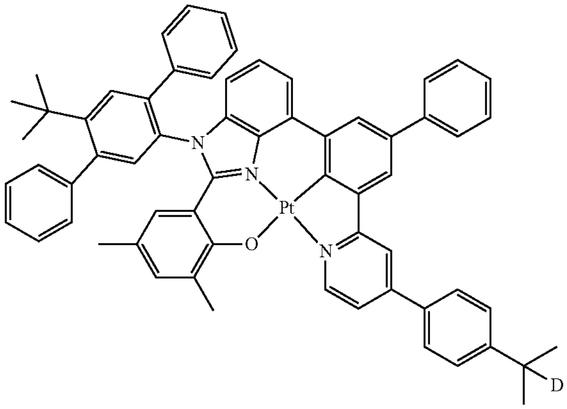

-continued
1088
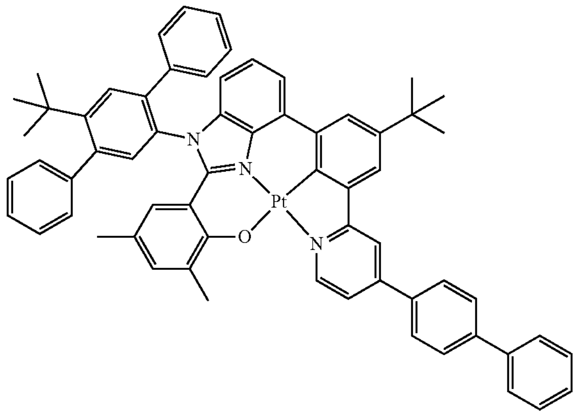
1089
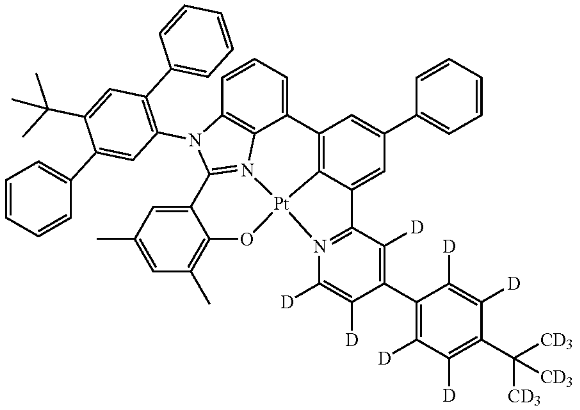
1090
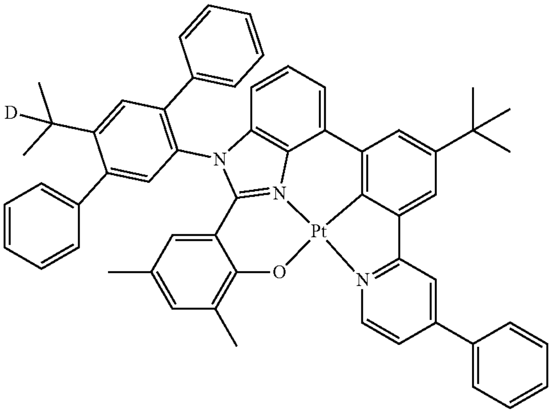
-continued
1091
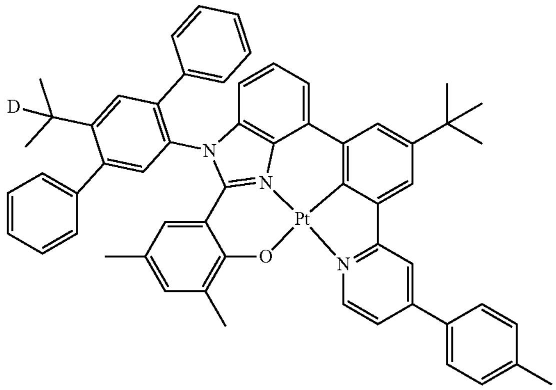
1092
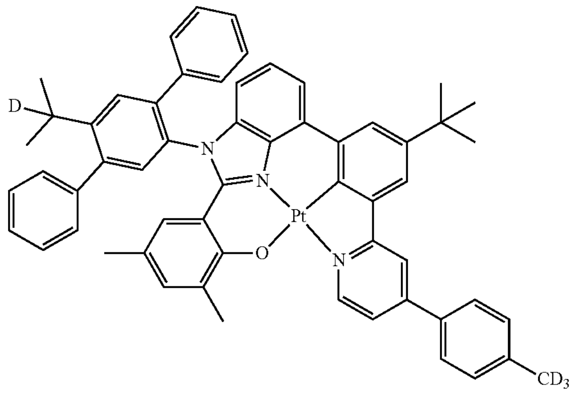
1093
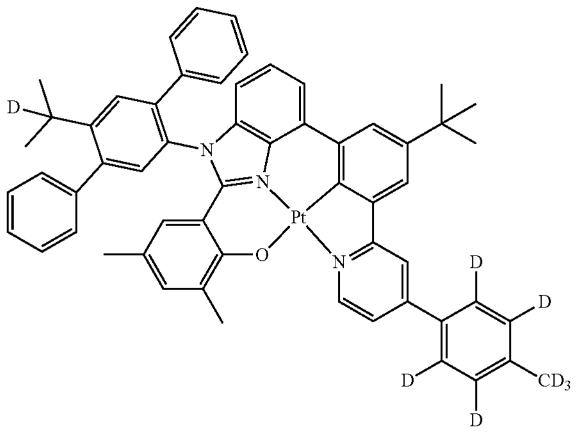

-continued
1094
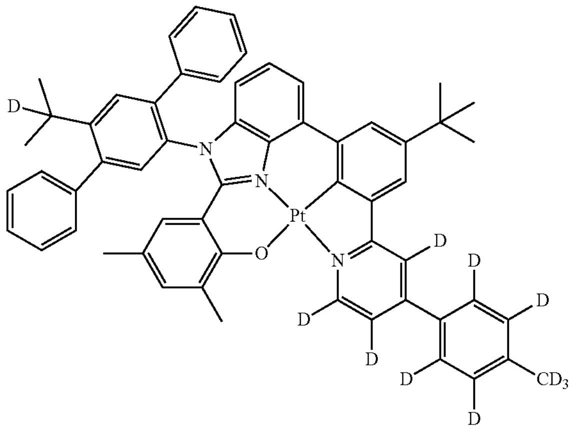
1095
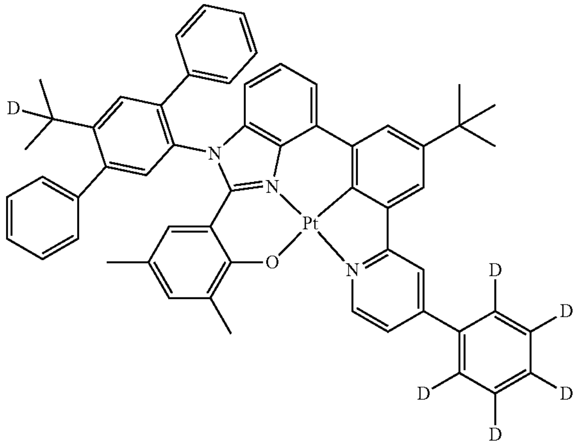
1096
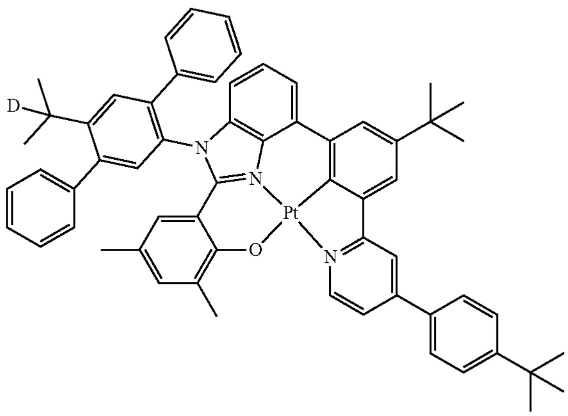
-continued
1097
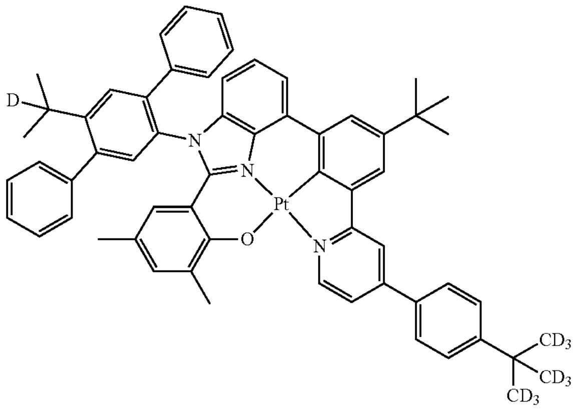
1098
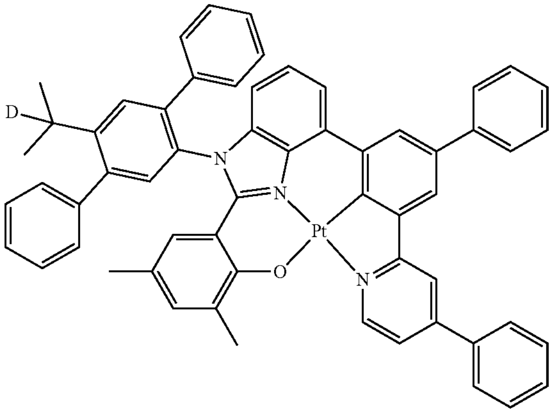
1099
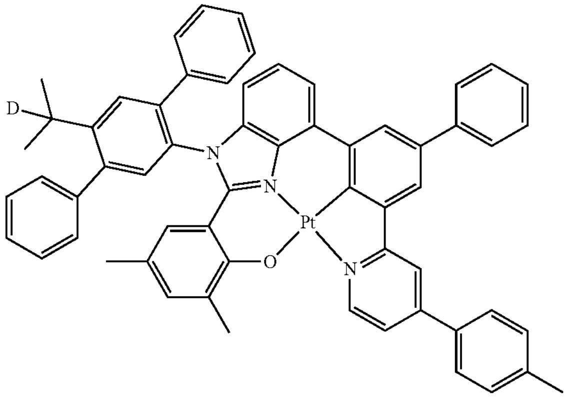

-continued
1100
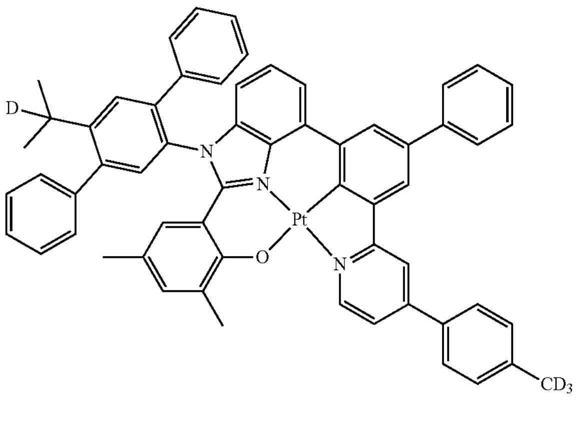
1101
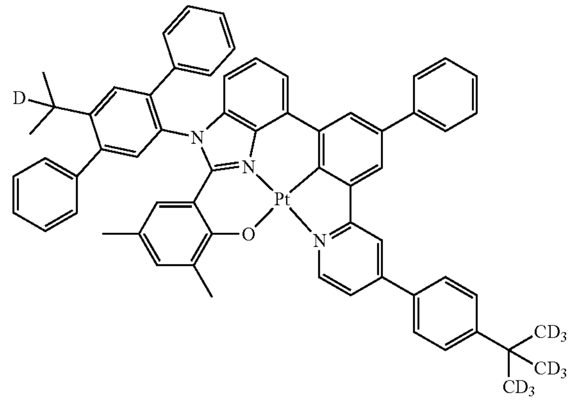
1102
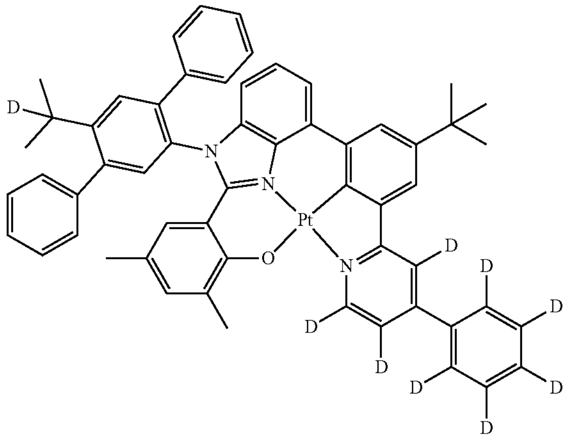
-continued
1103
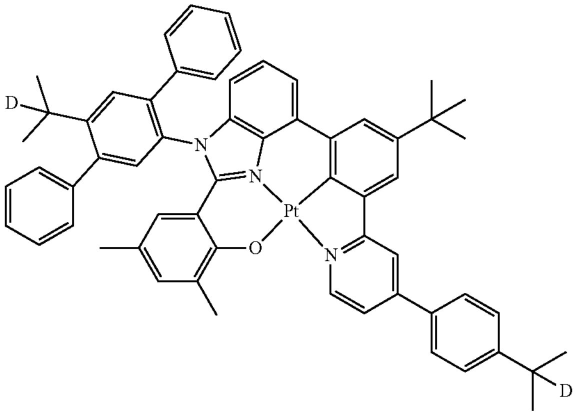
1104
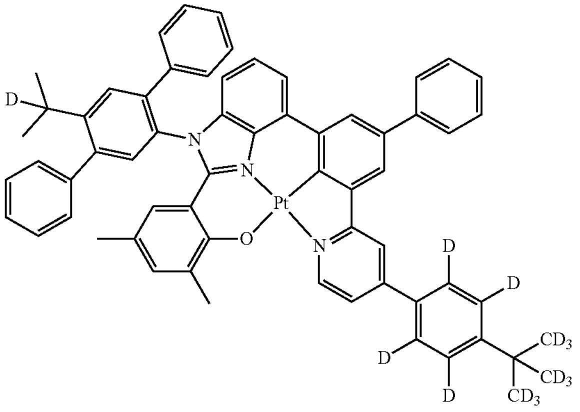
1105
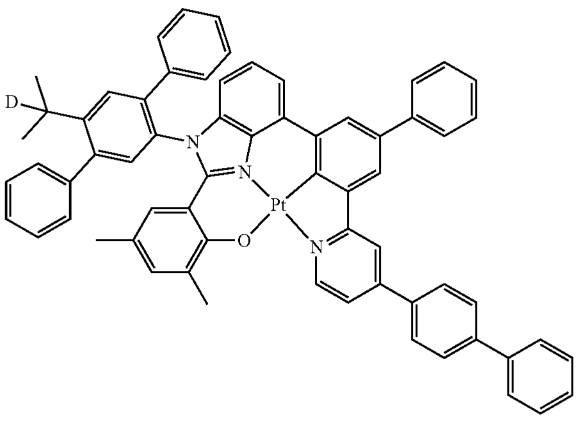

-continued
1106
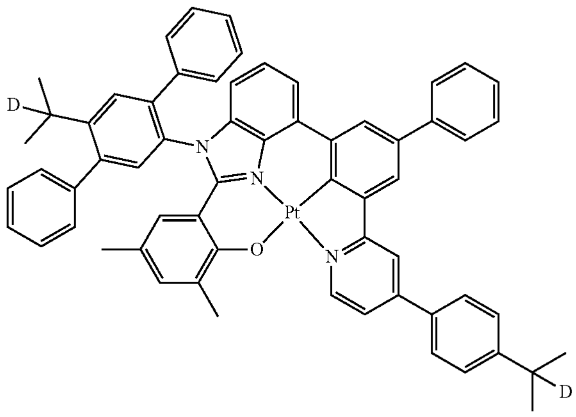
1107
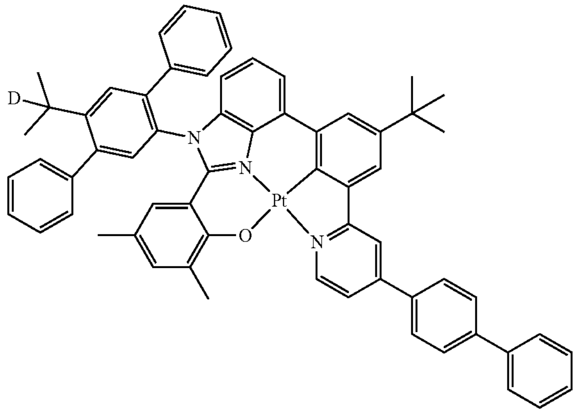
1108
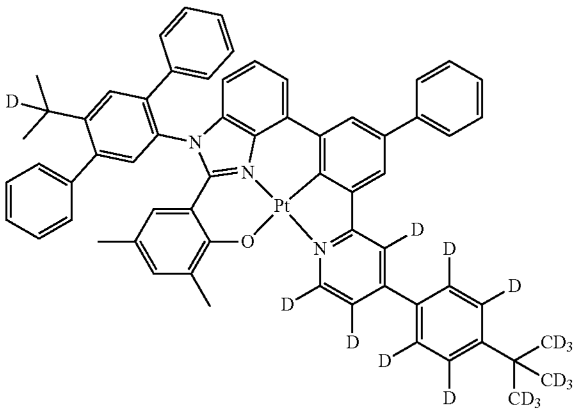
-continued
1109
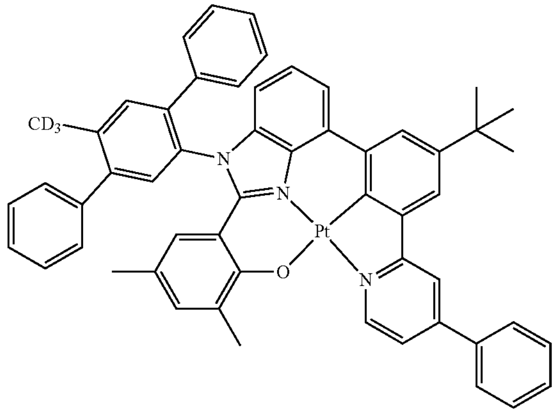
1110
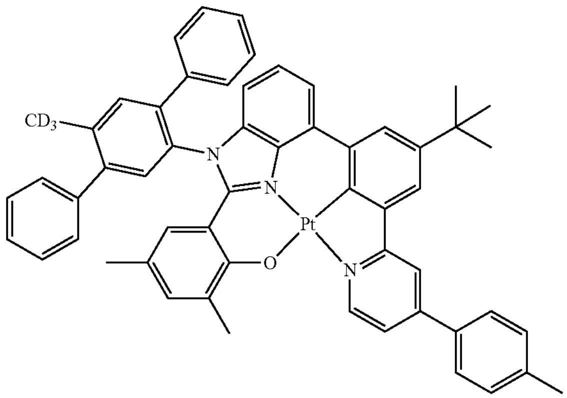
1111
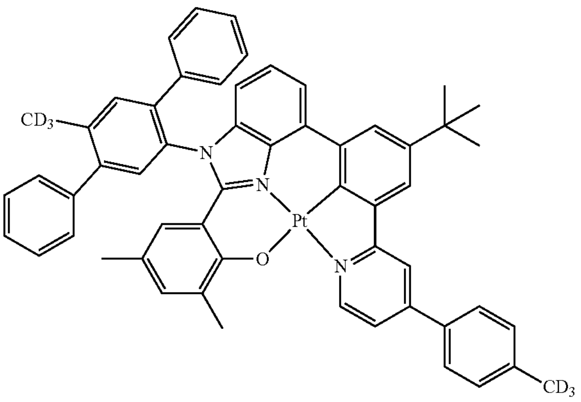

-continued
1112
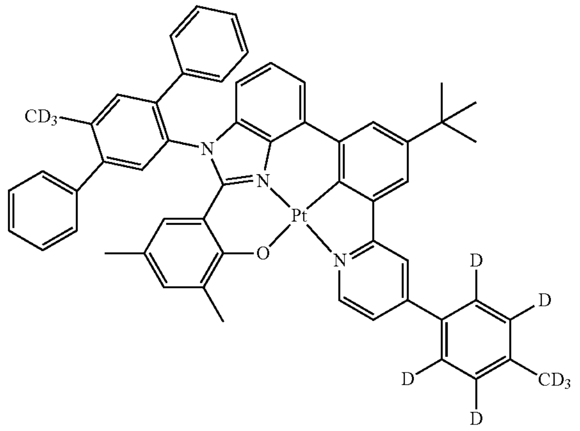
1113
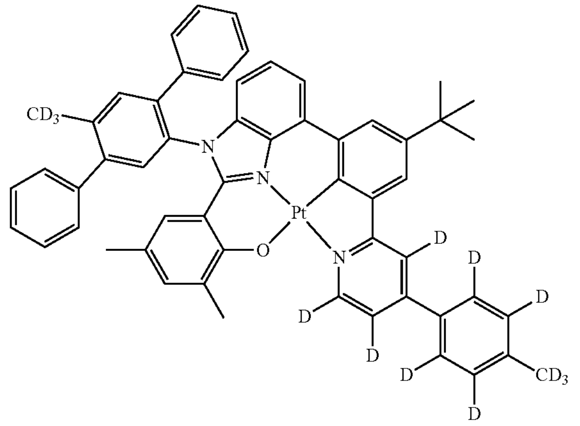
1114
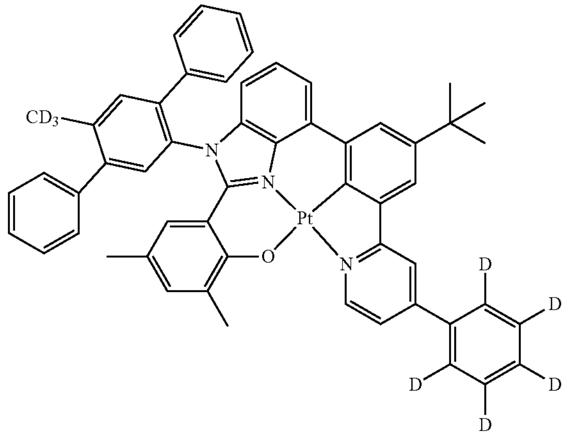
-continued
1115
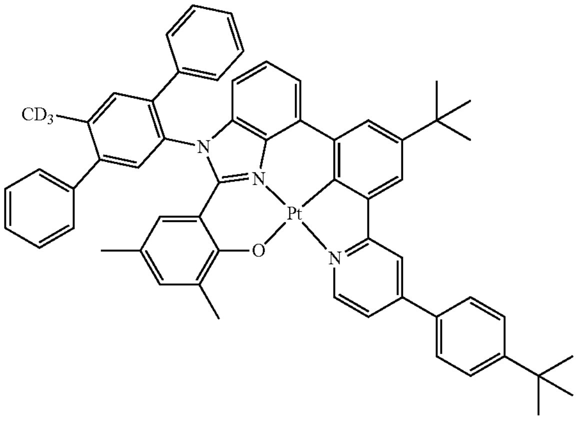
1116
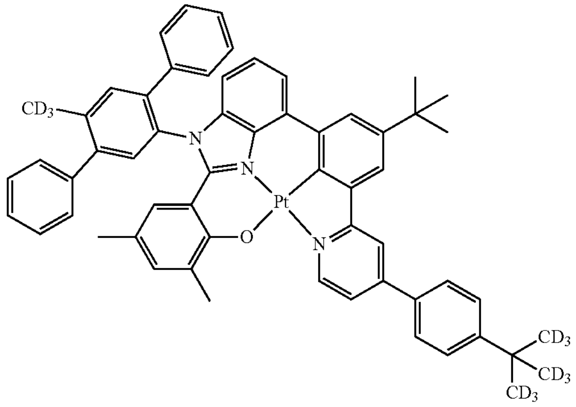
1117
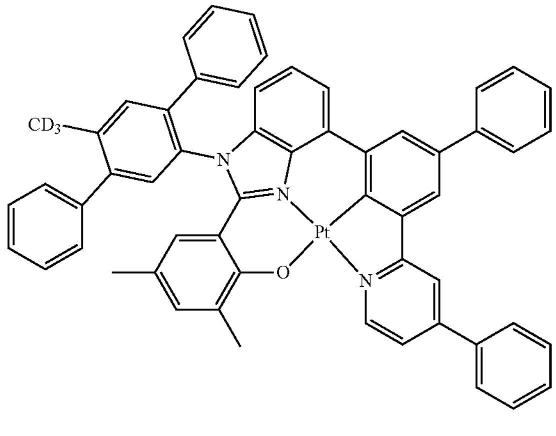

-continued
1118
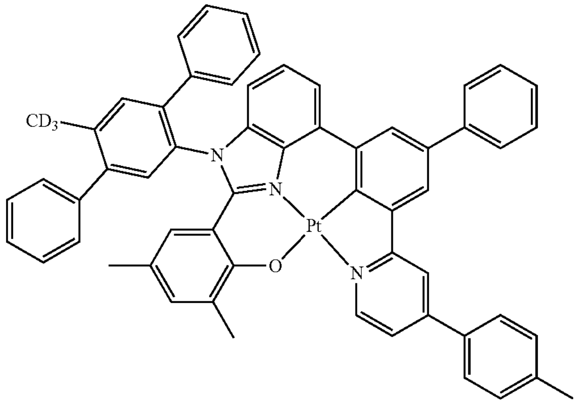
1119
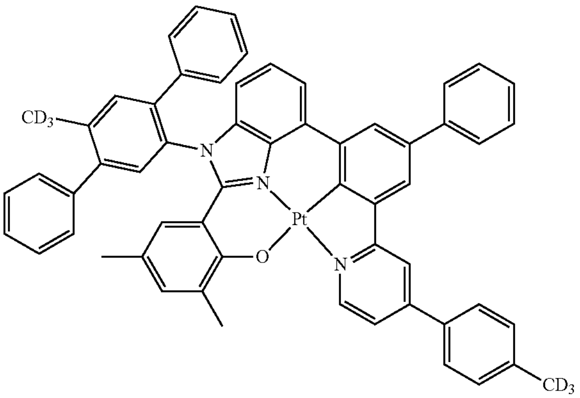
1120
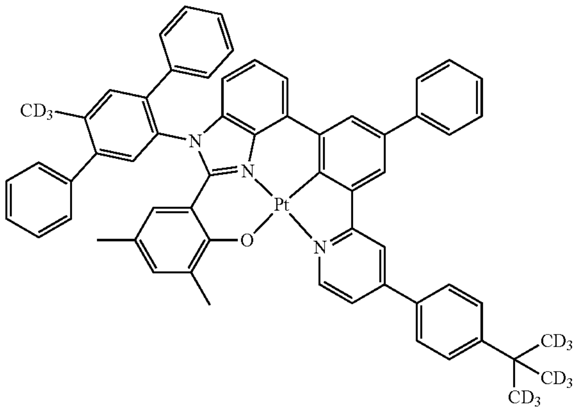
-continued
1121
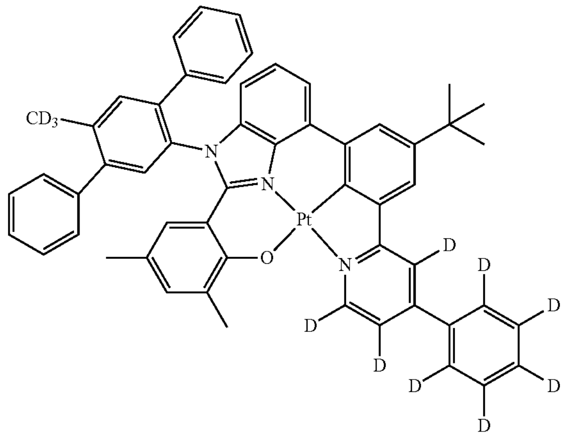
1122
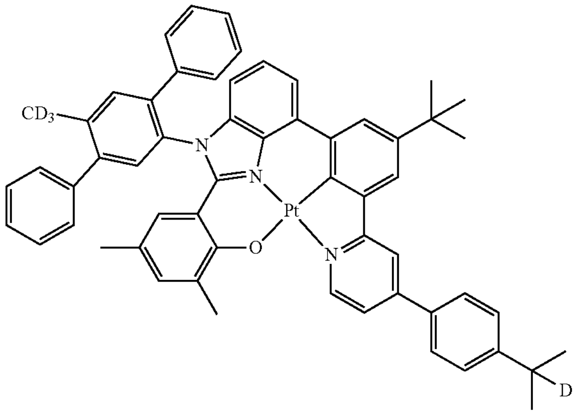
1123
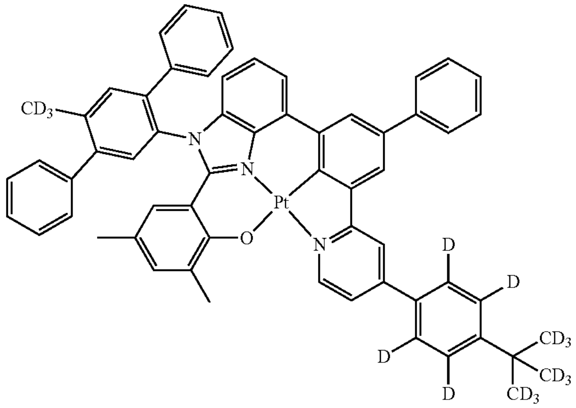

-continued
1124
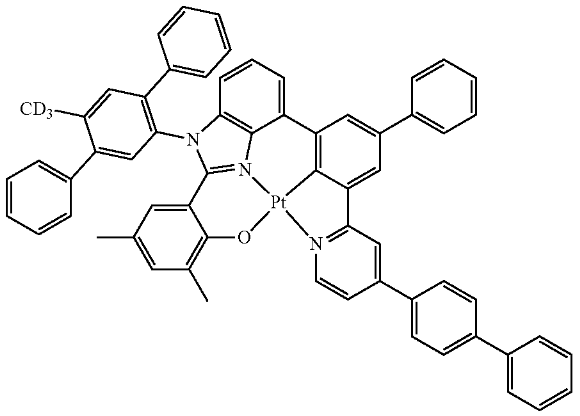
1125
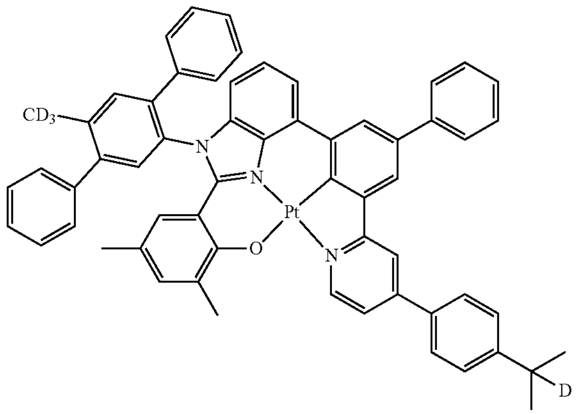
1126
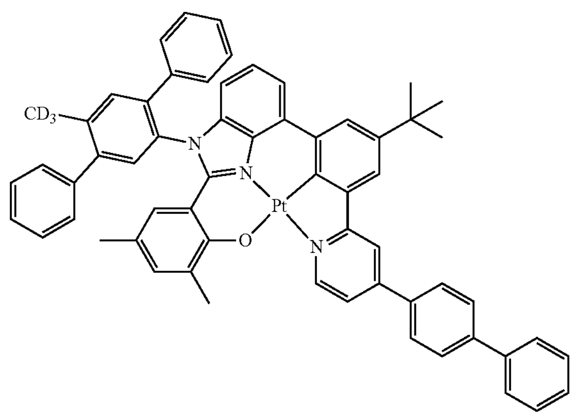
-continued
1127
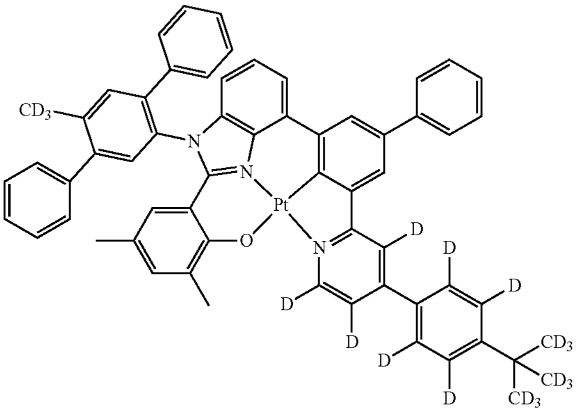
1128
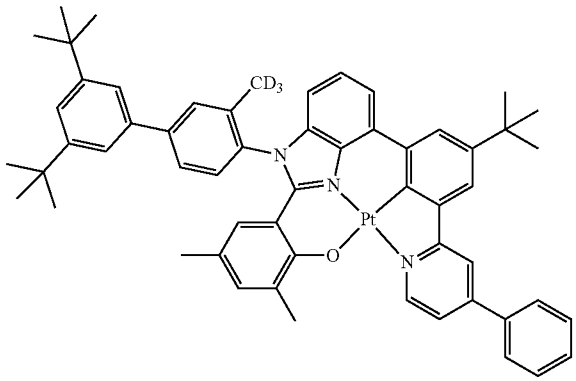
1129
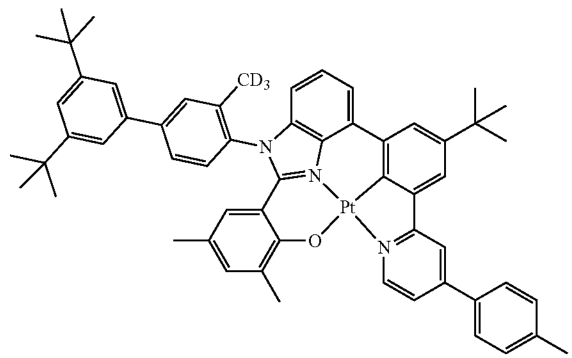
1130
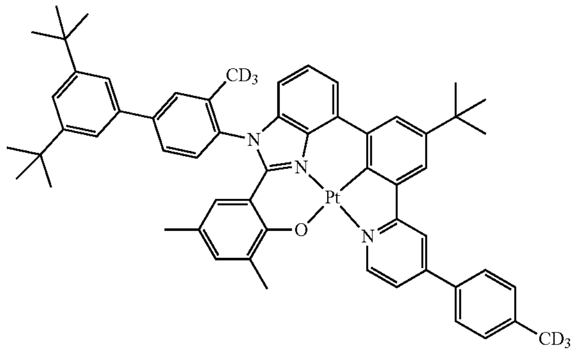

-continued
1131
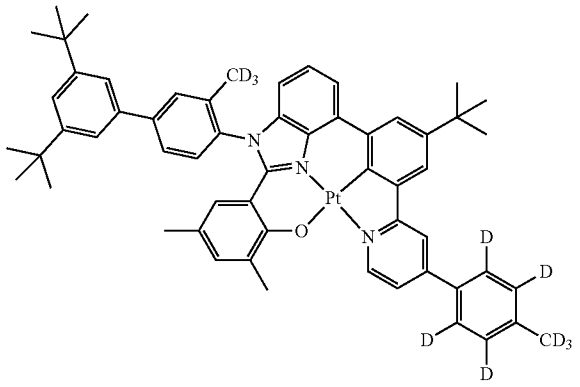
1132
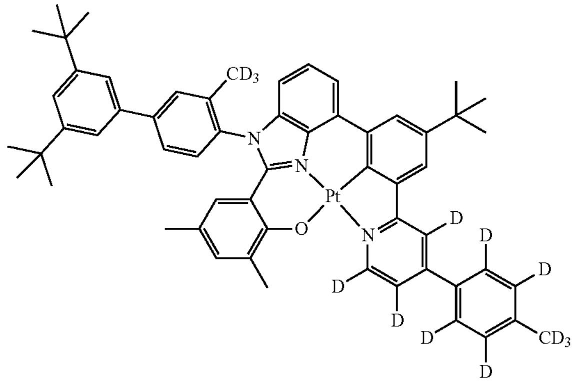
1133
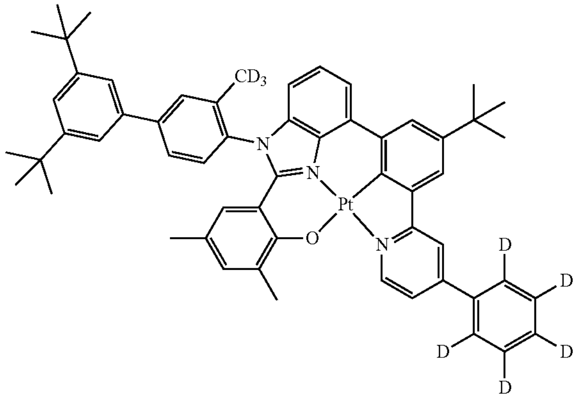
1134
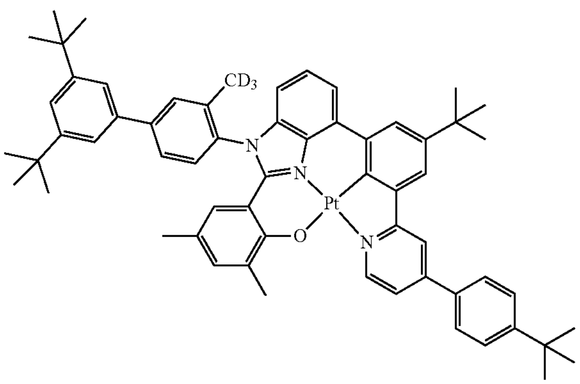
-continued
1135
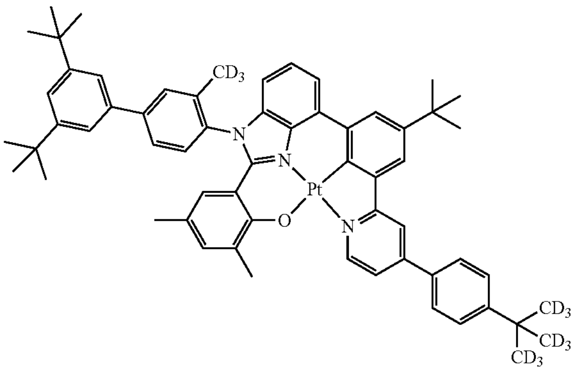
1136
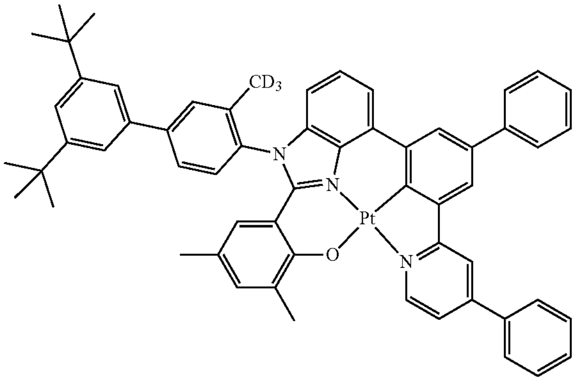
1137
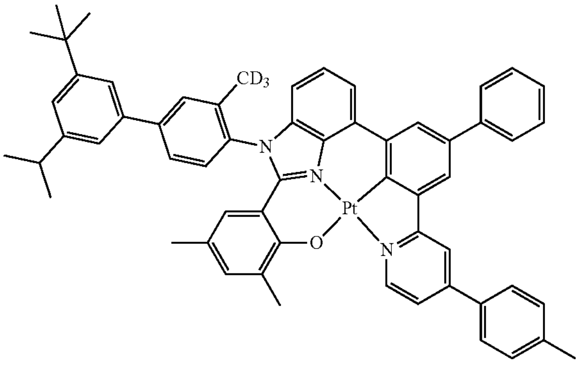
1138
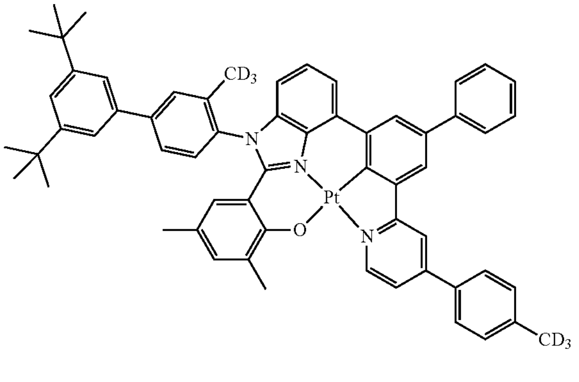

-continued
1139
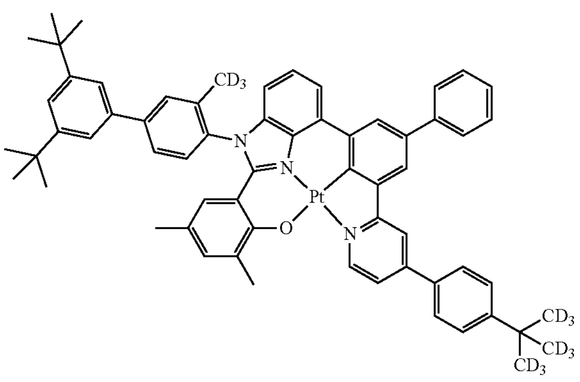
1140
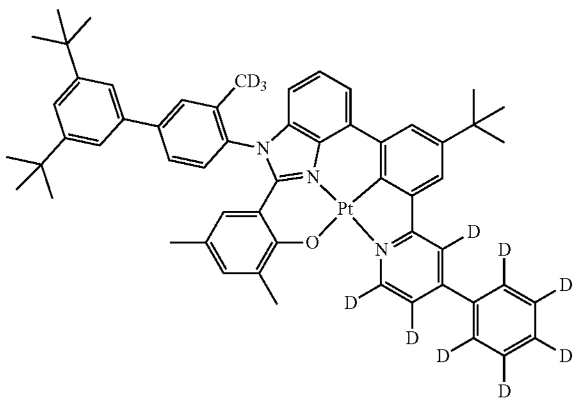
1141
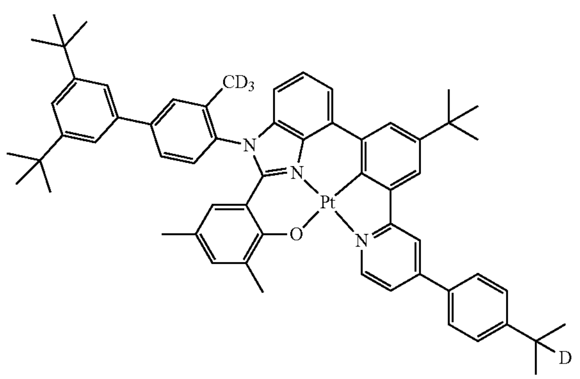
1142
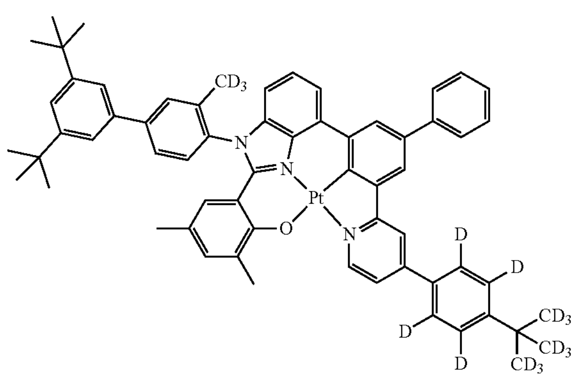
-continued
1143
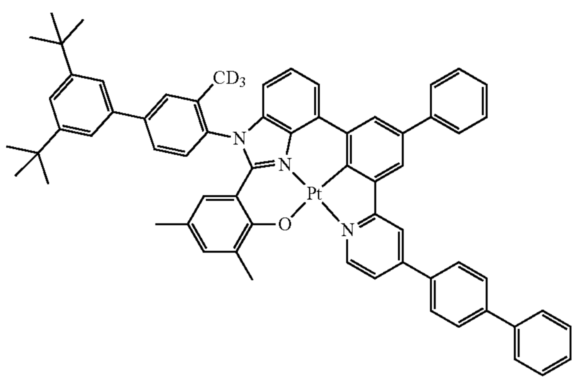
1144
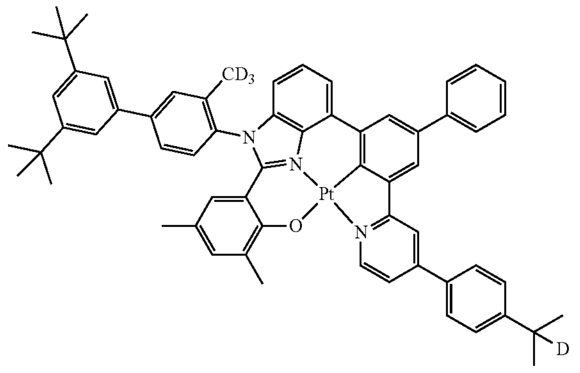
1145
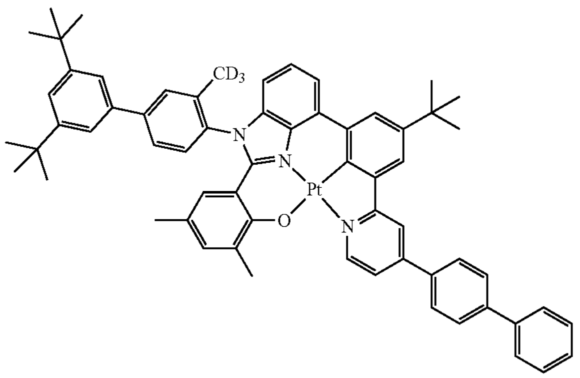
1146
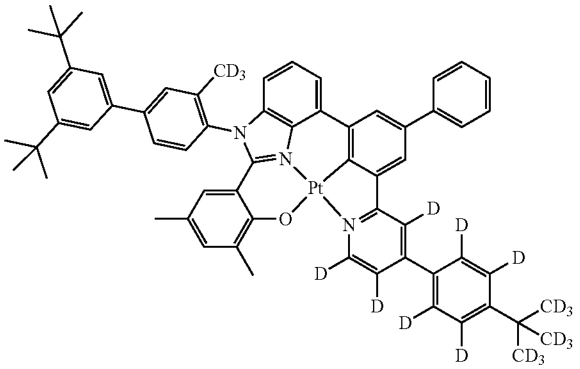

-continued
1147
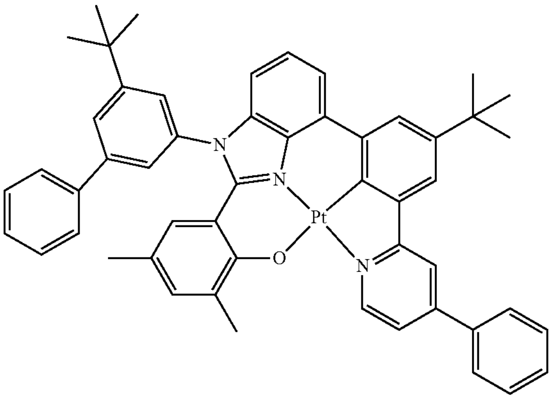
1148
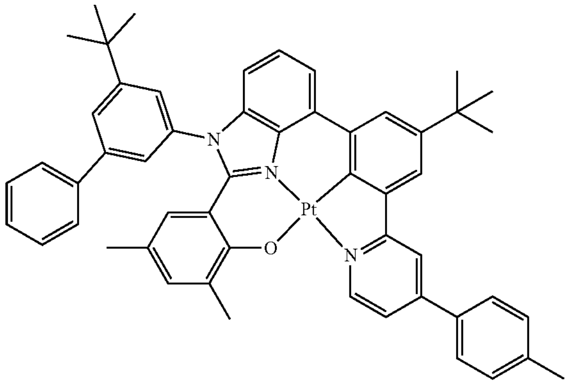
1149
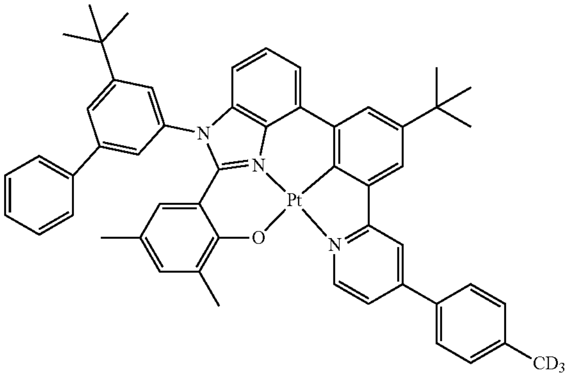
-continued
1150
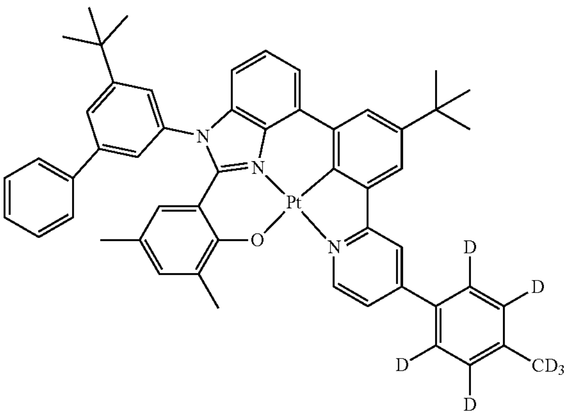
1151
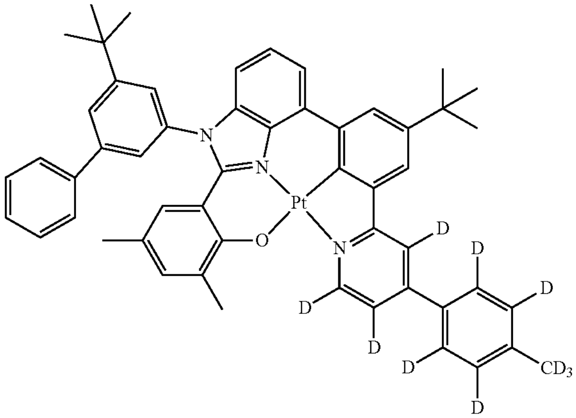
1152
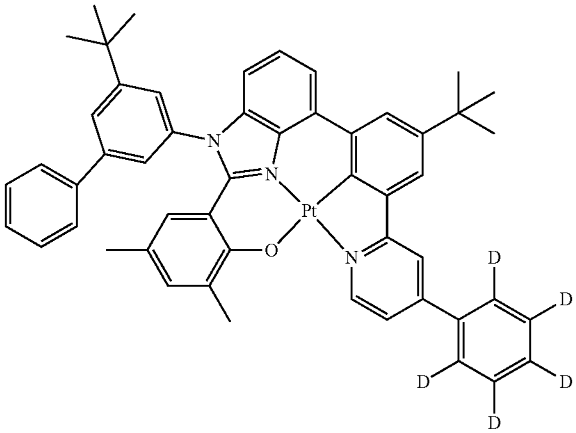

-continued
1153
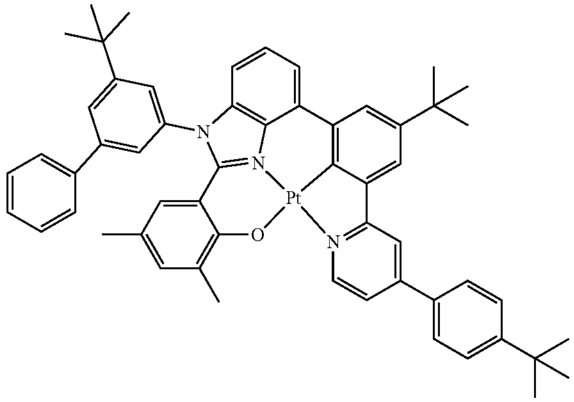
1154
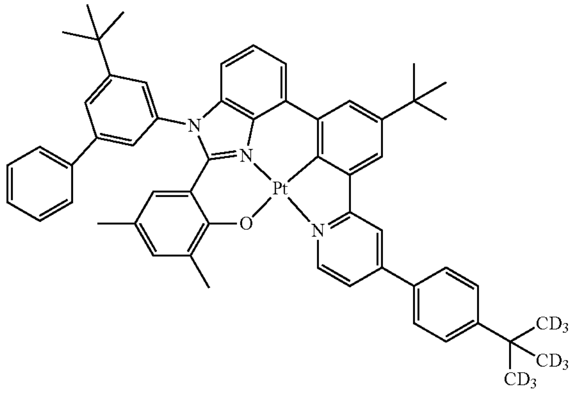
1155
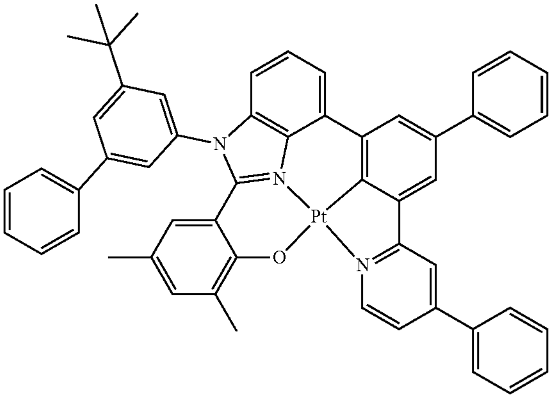
-continued
1156
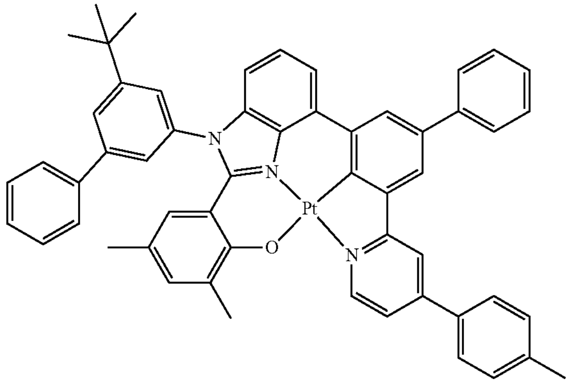
1157
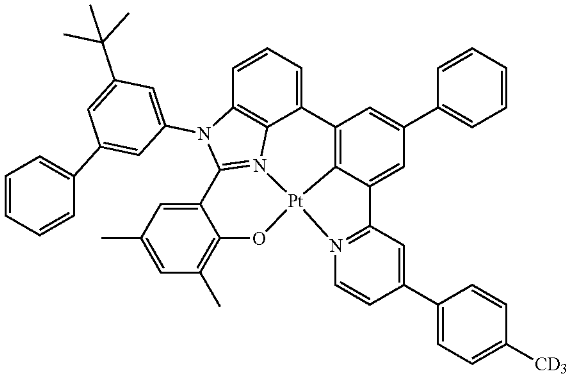
1158
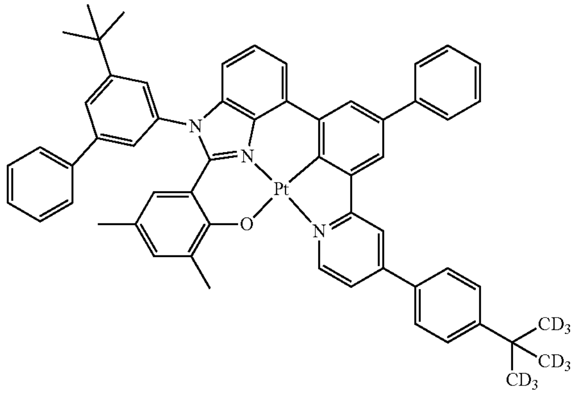

-continued
1159
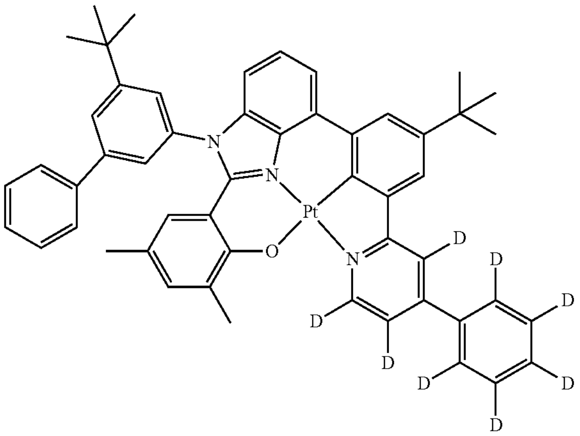
1160
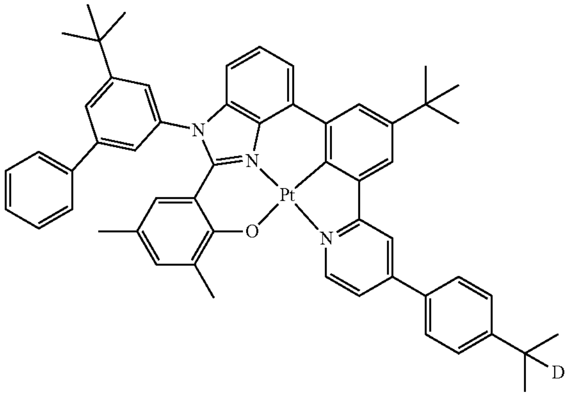
1161
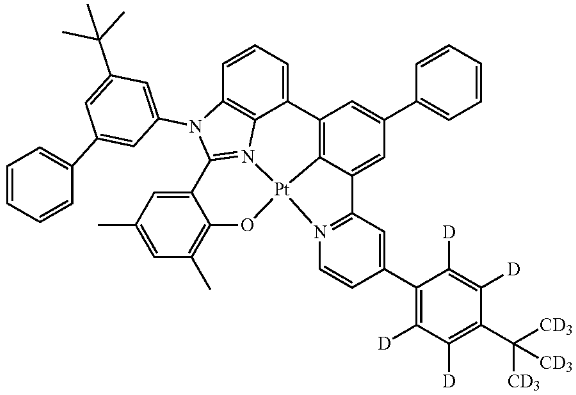
-continued
1162
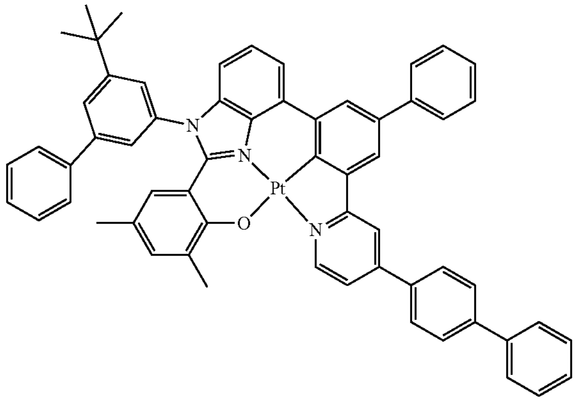
1163
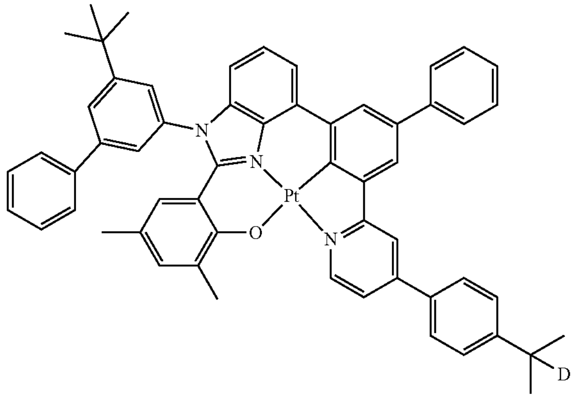
1164
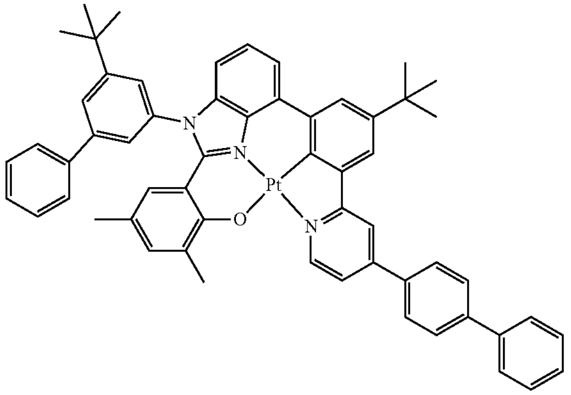

-continued
1165
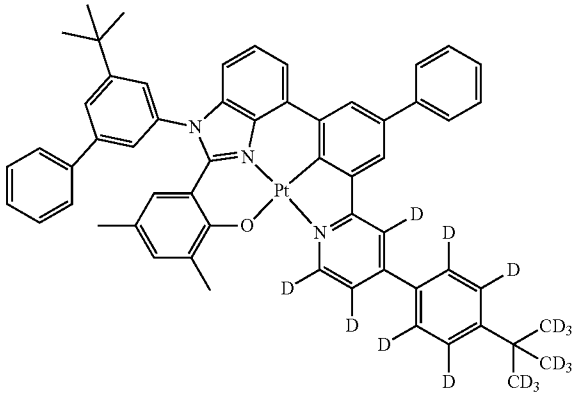
1166
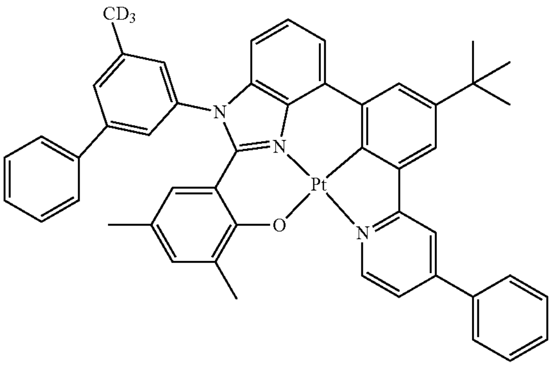
1167
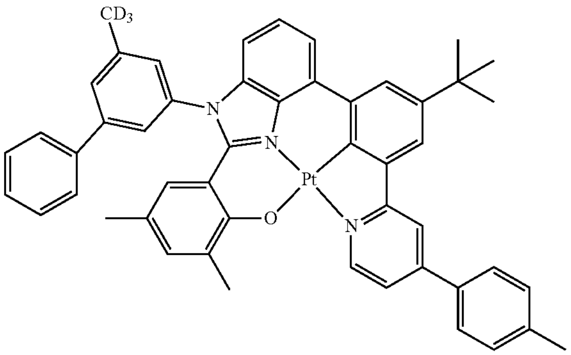
1168
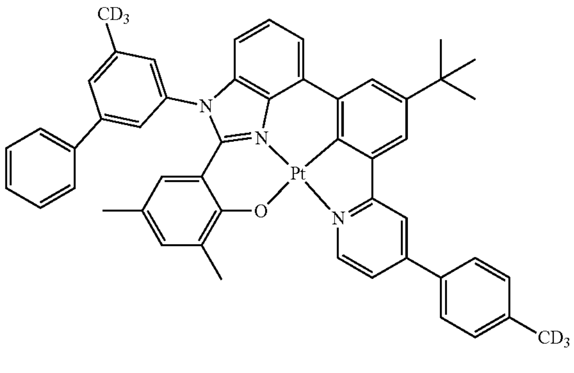
-continued
1169
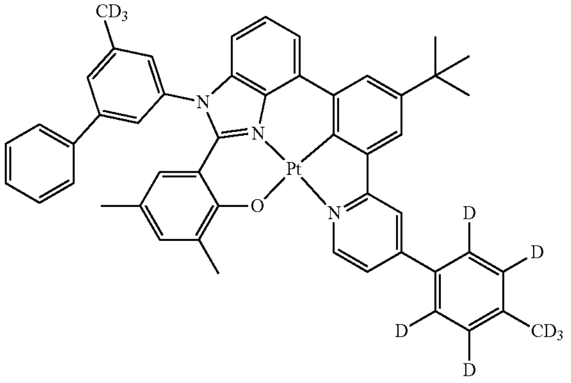
1170
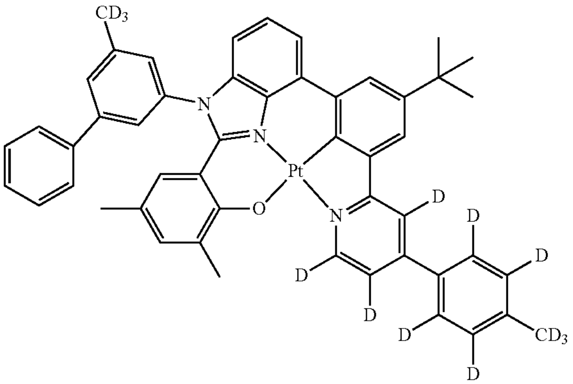
1171
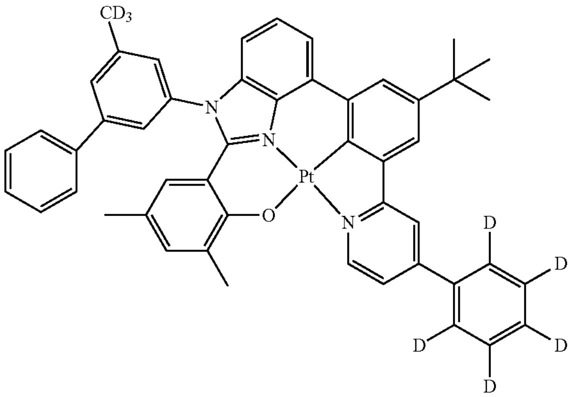
1172
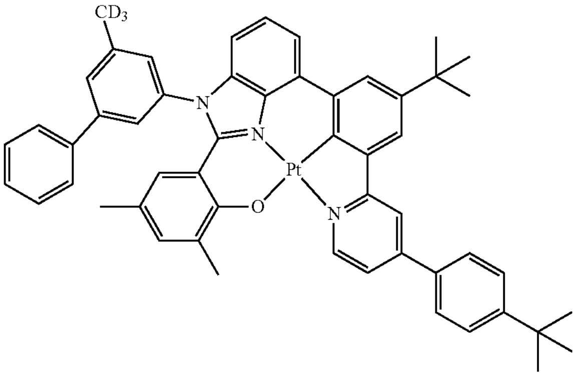

-continued
1173
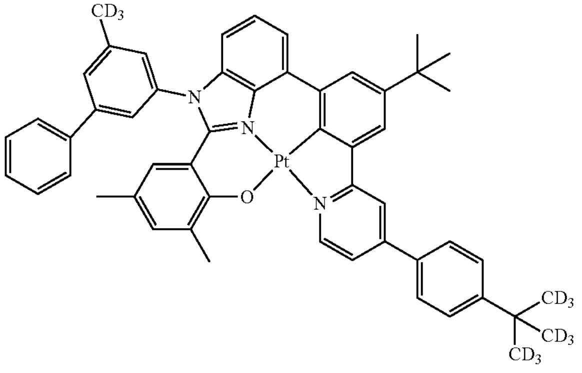
1174
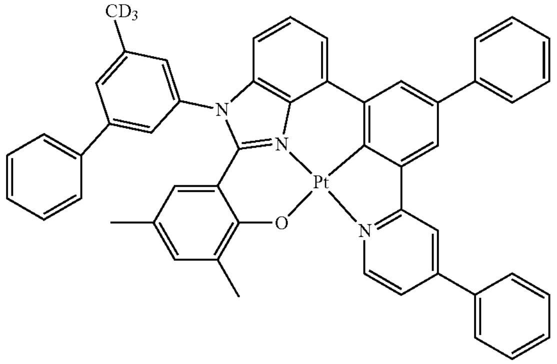
1175
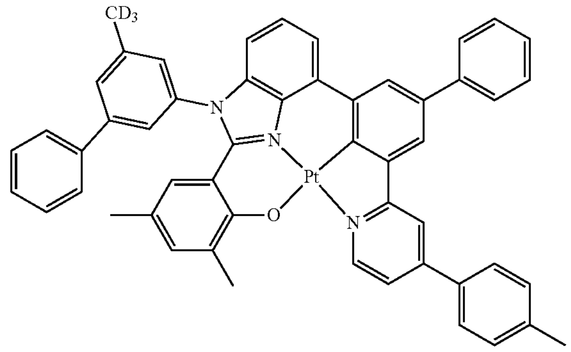
1176
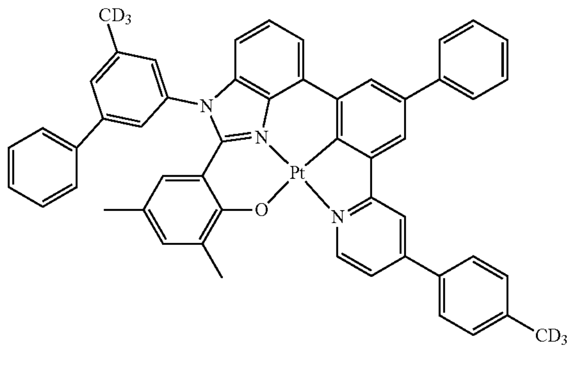
-continued
1177
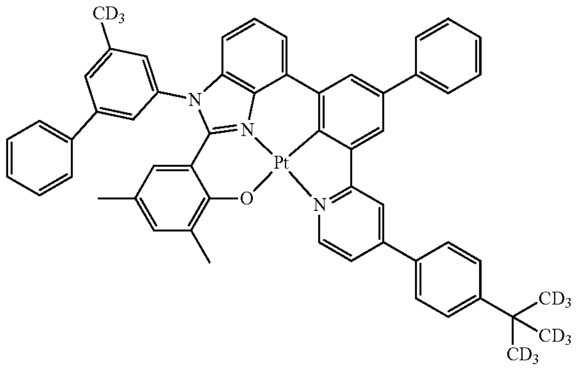
1178
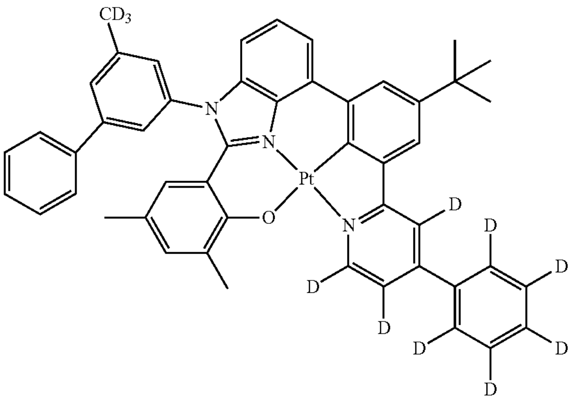
1179
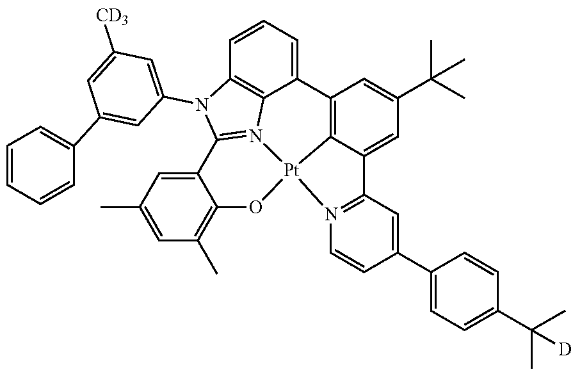
1180
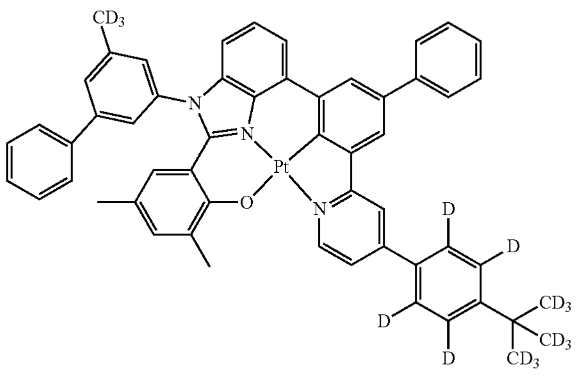

-continued
1181
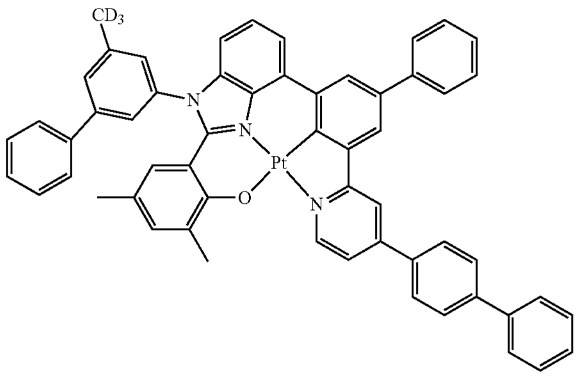
1182
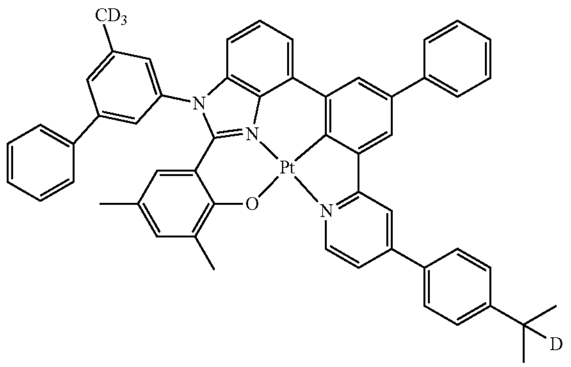
1183
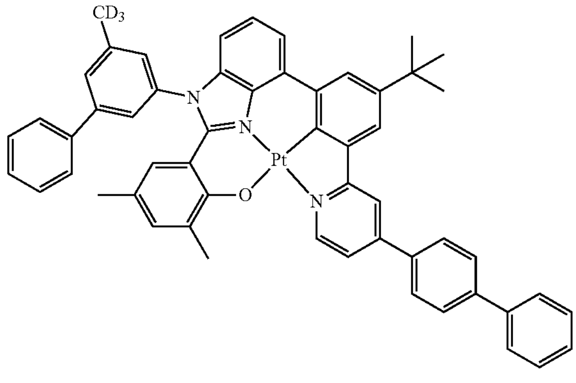
1184
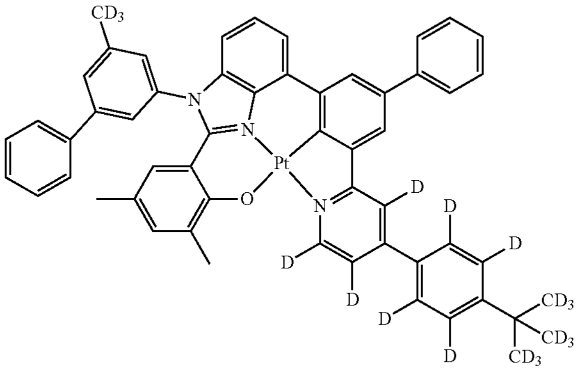
-continued
1185
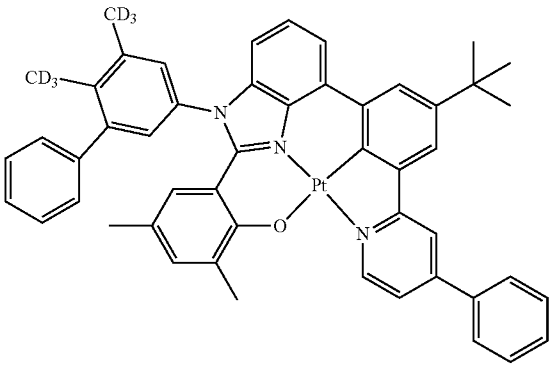
1186
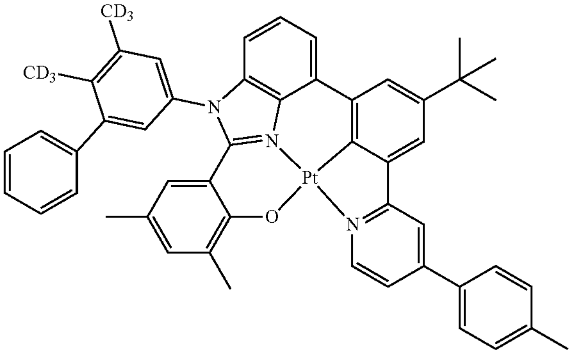
1187
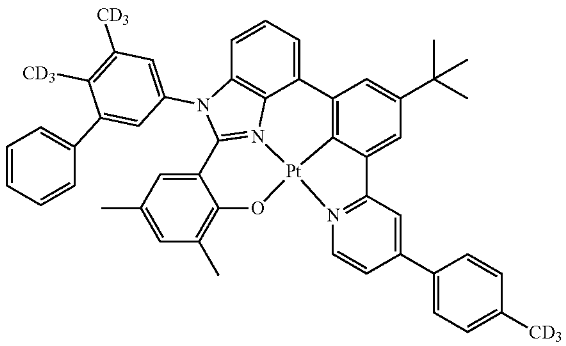
1188
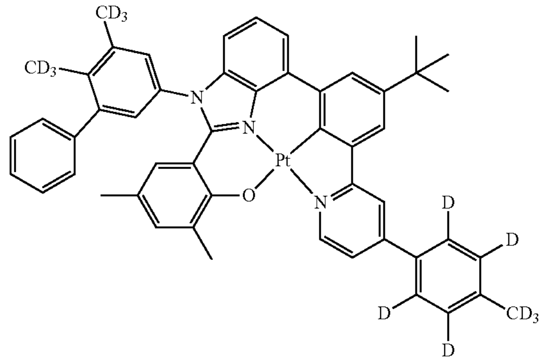

-continued
1189
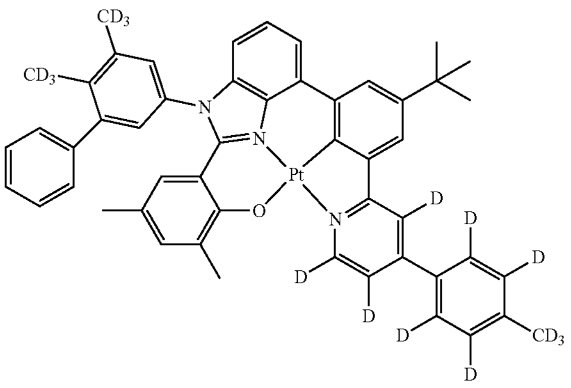
1190
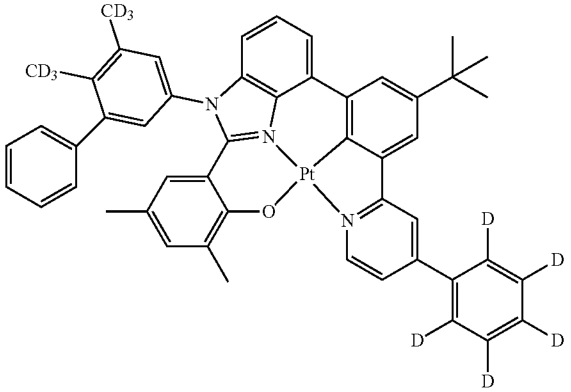
1191
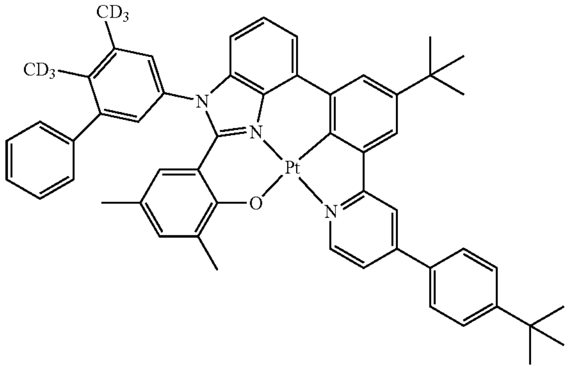
1192
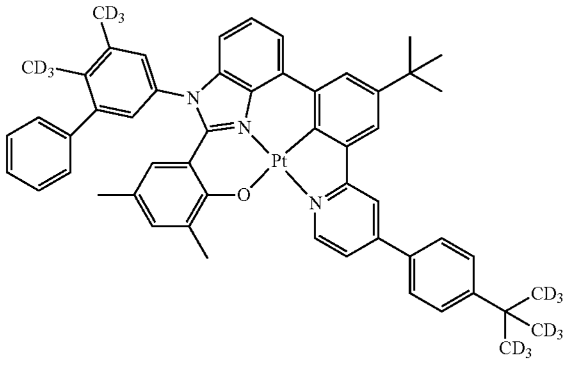
1193
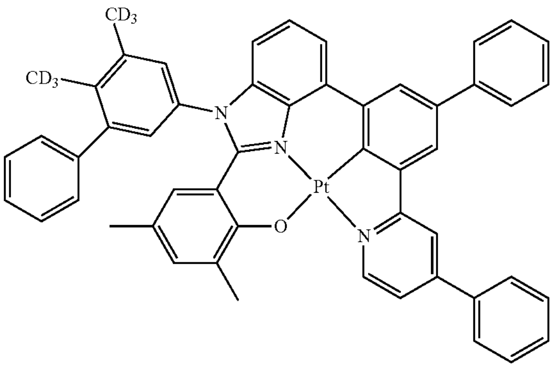
1194
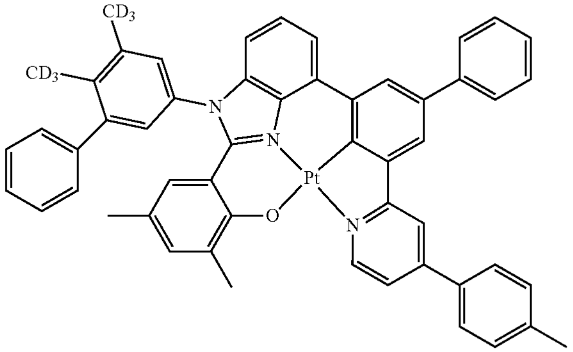
1195
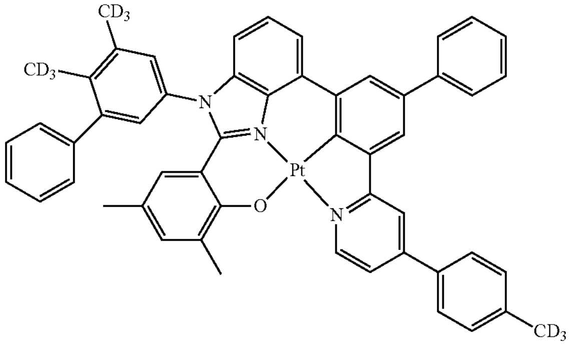
1196
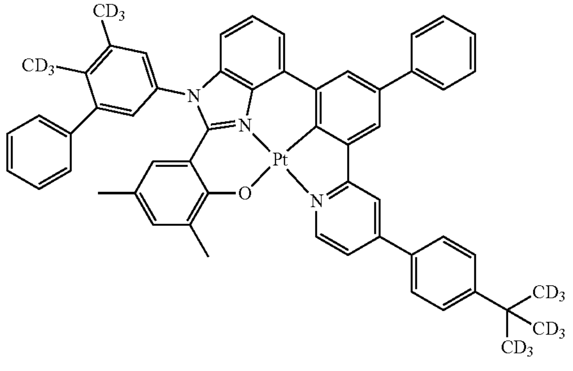

-continued
1197
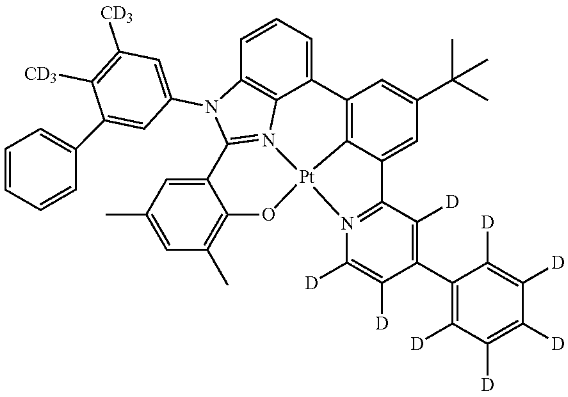
1198
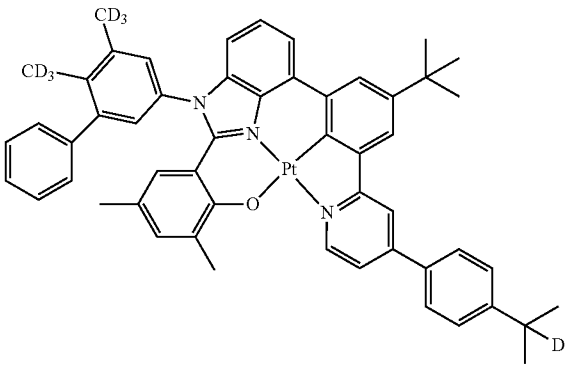
1199
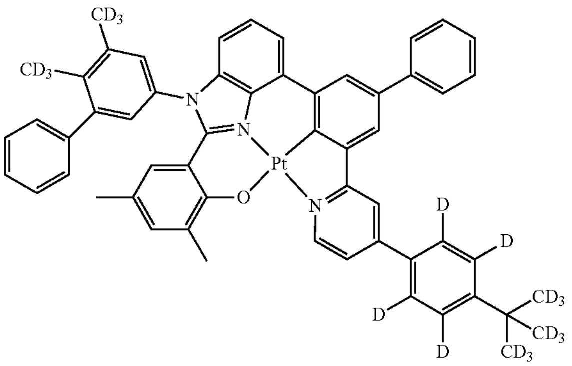
1200
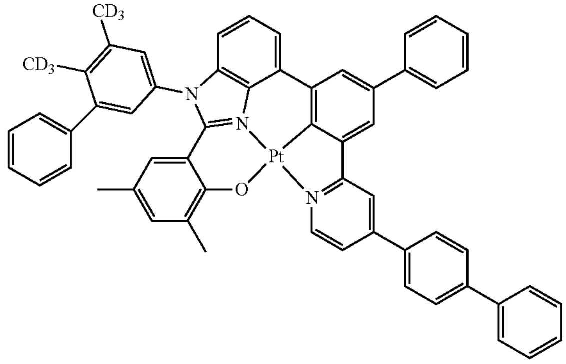
-continued
1201
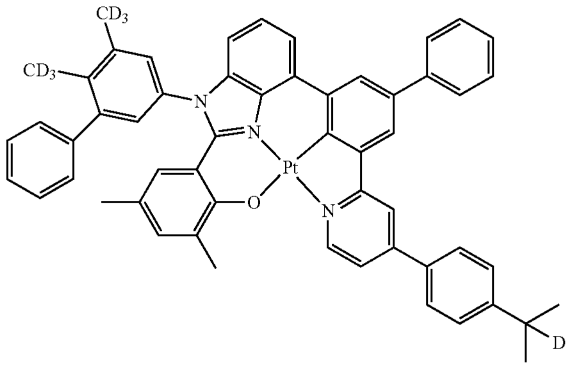
1202
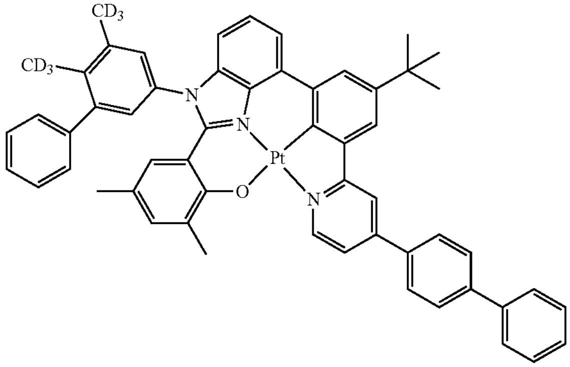
1203
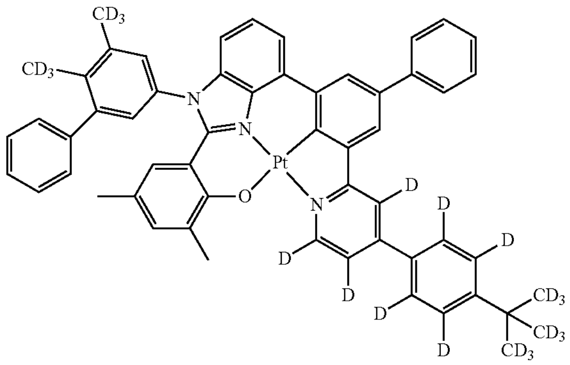
1204
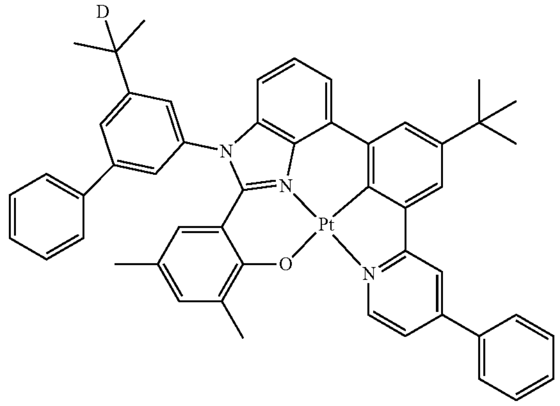

1205
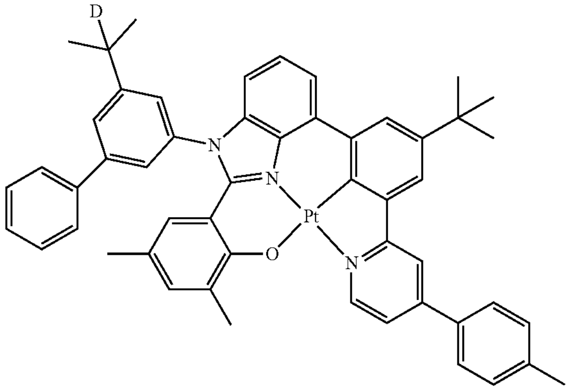
1206
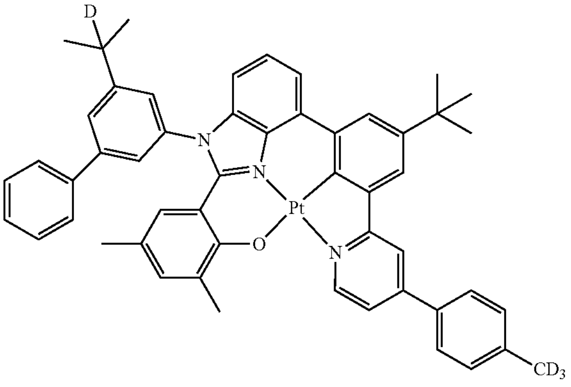
1207
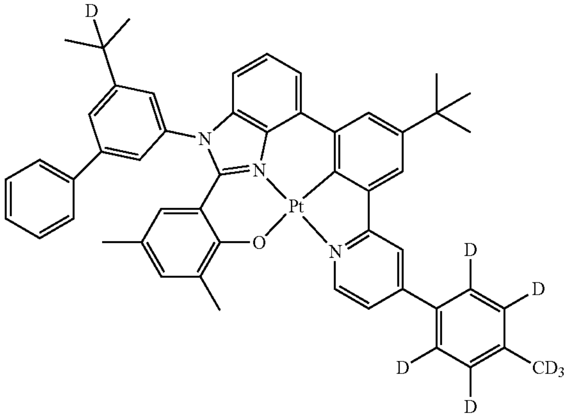
1208
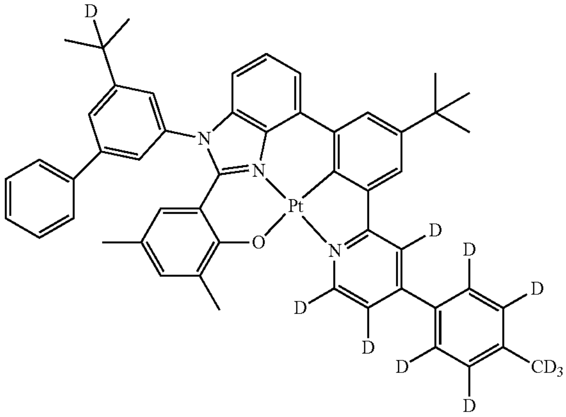
1209
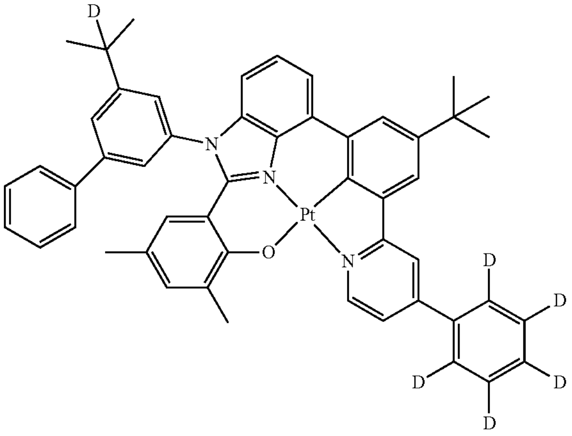
1210
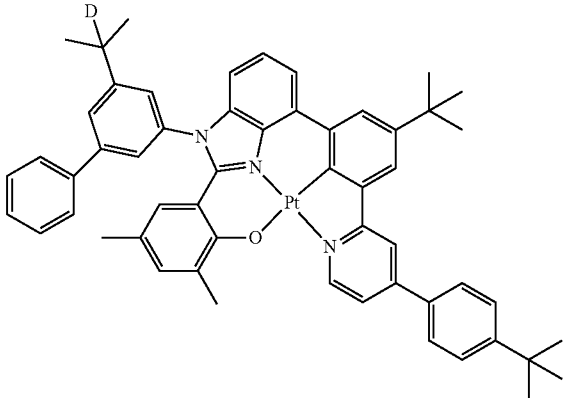

-continued
1211
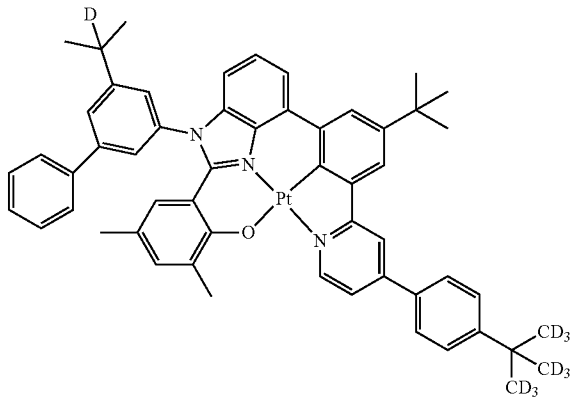
1212
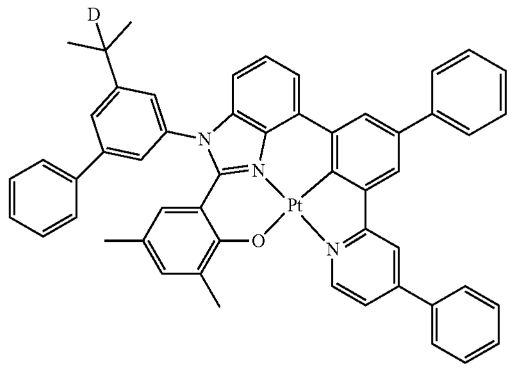
1213
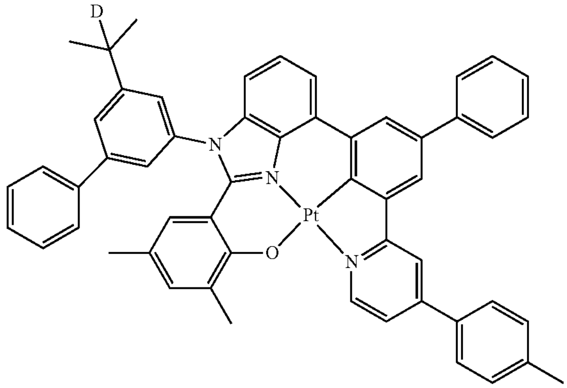
1214
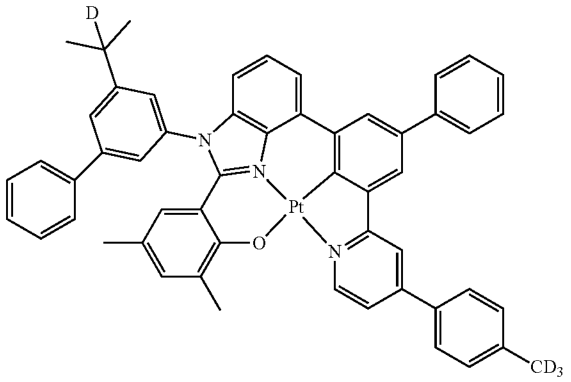
-continued
1215
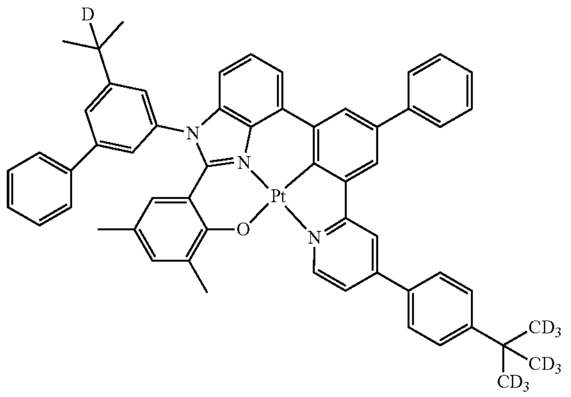
1216
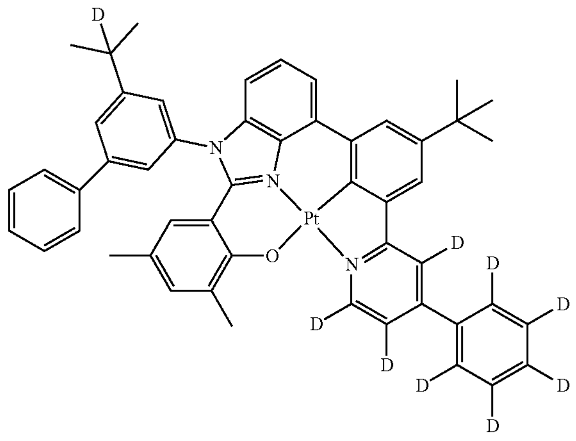
1217
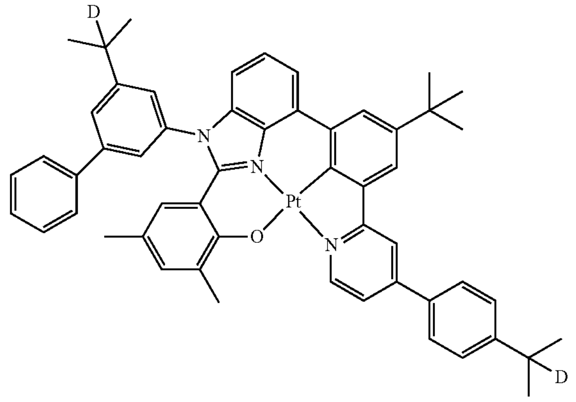

-continued
1218
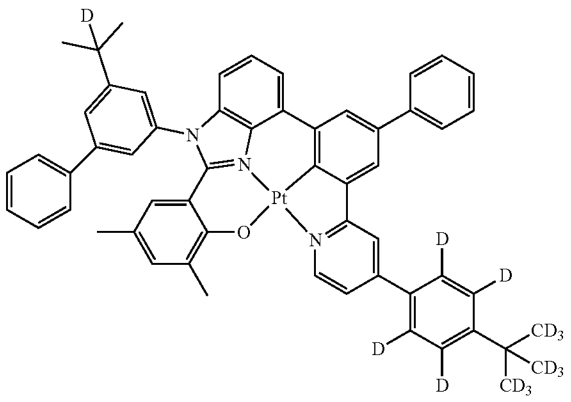
1219
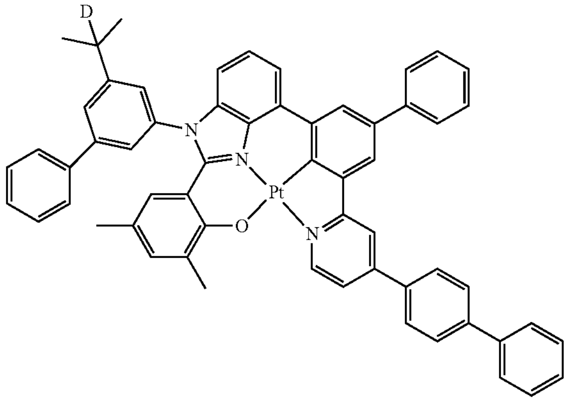
1220
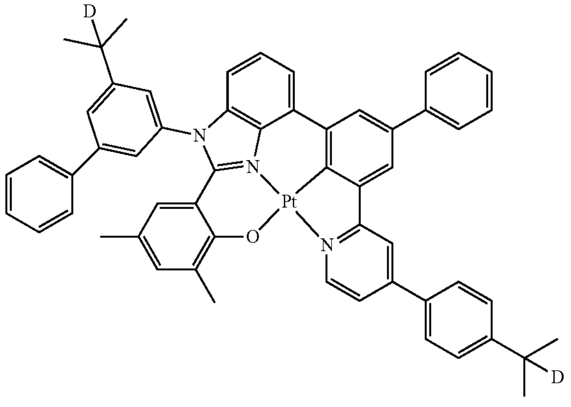
-continued
1221
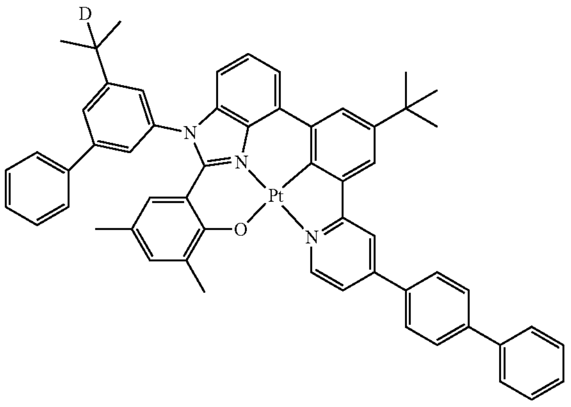
1222
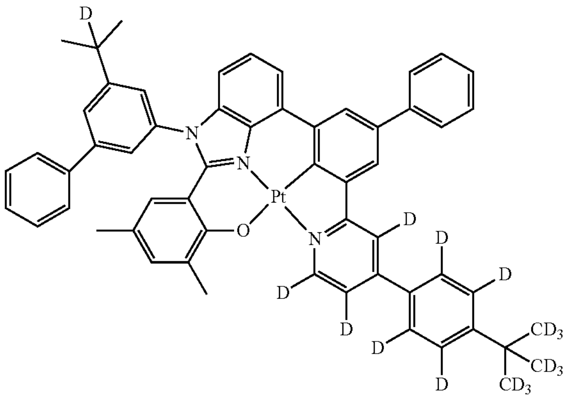
1223
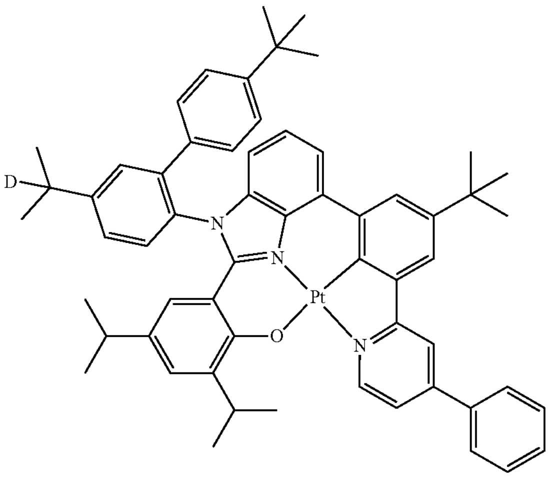

-continued
1224
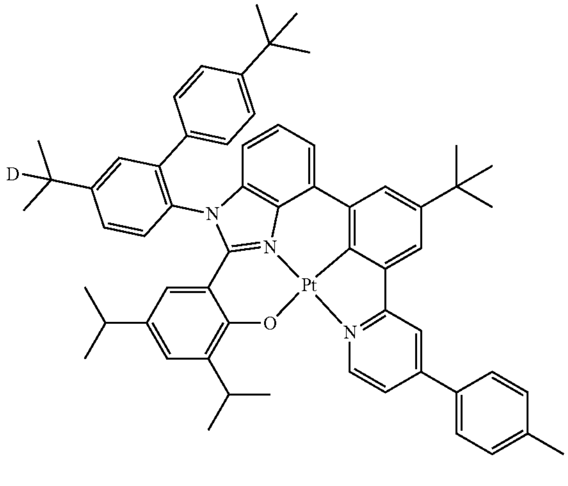
1225
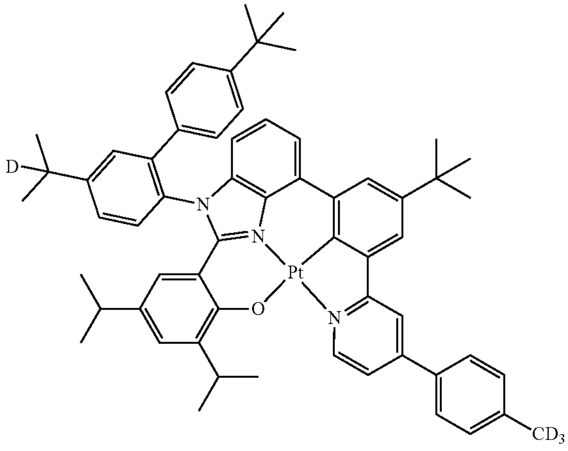
1226
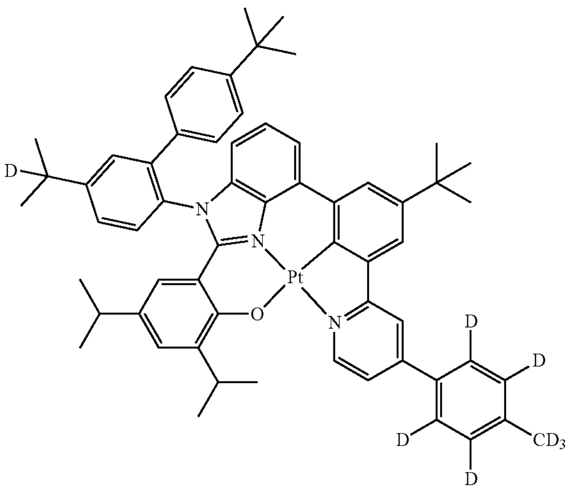
-continued
1227
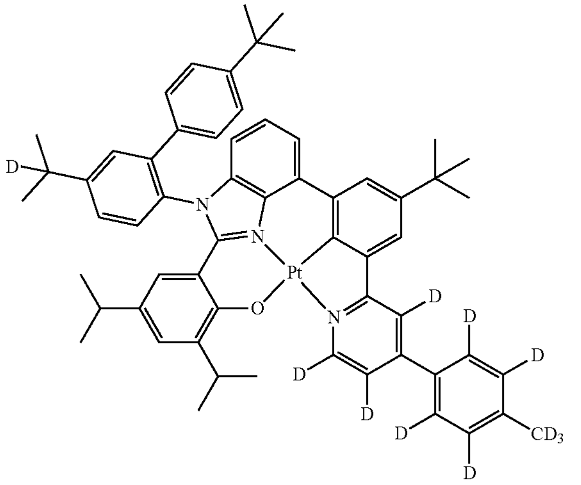
1228
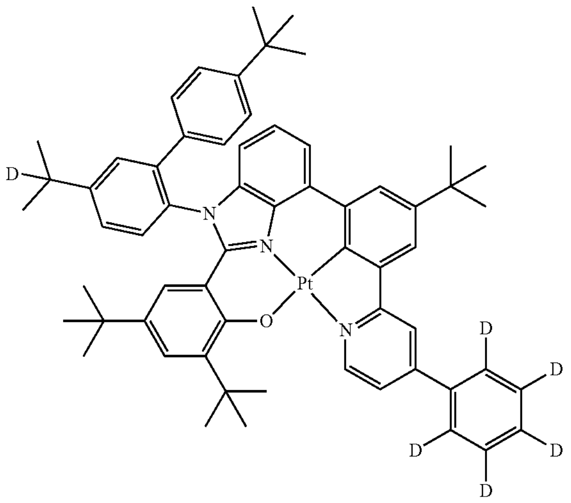
1229
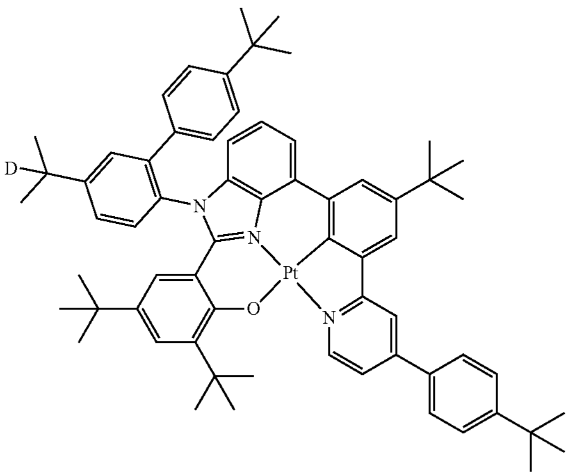

-continued
1230
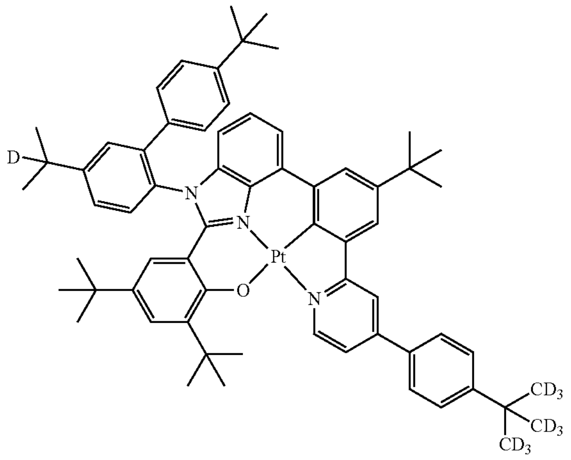
1231
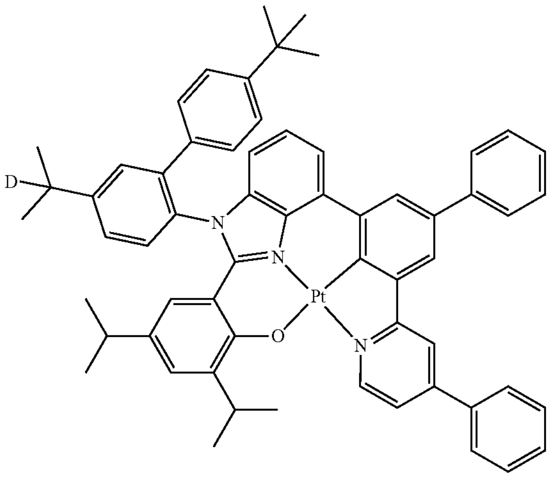
1232
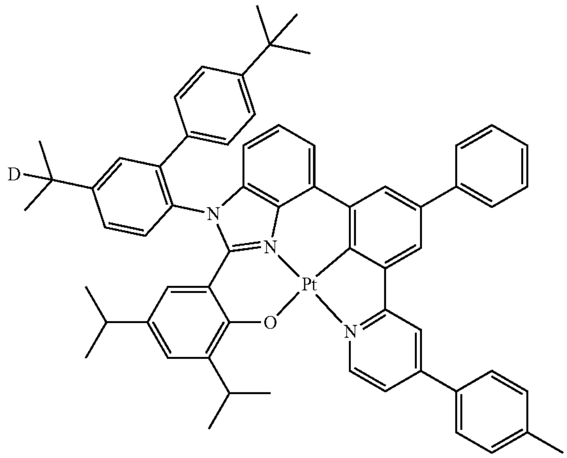
-continued
1233
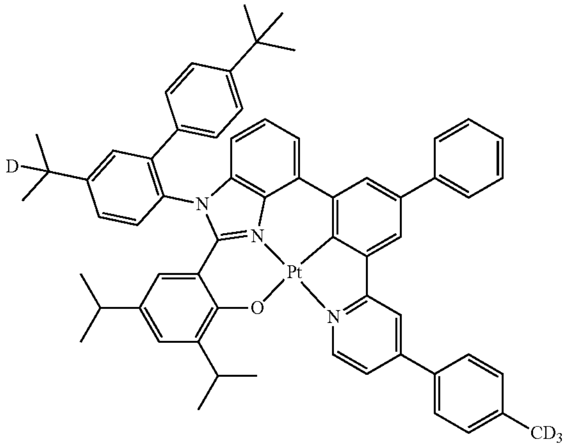
1234
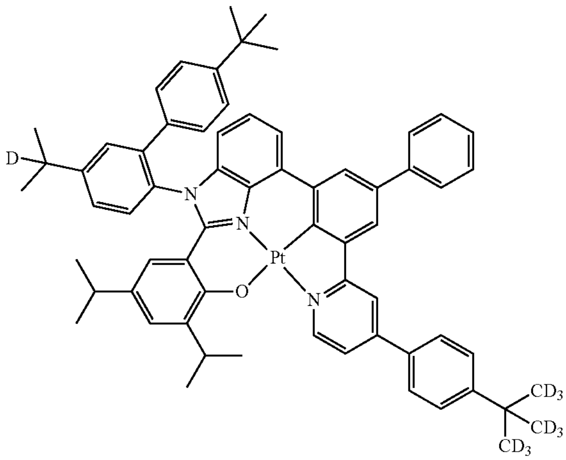
1225
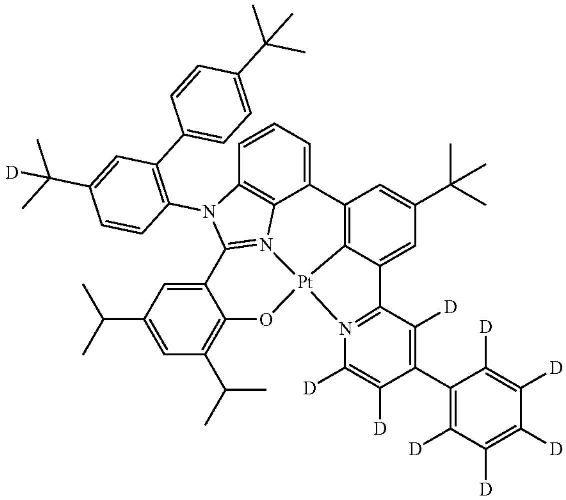

-continued
1236
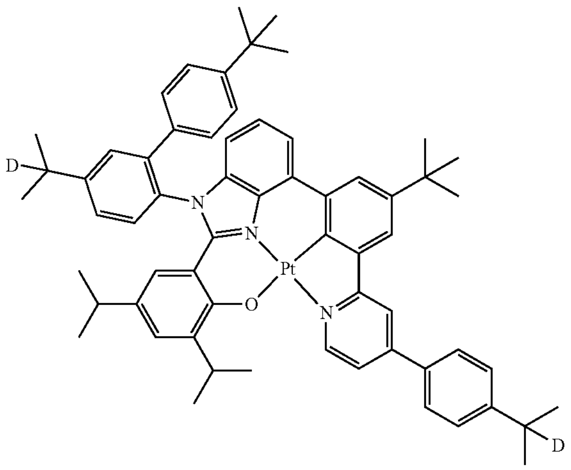
1237
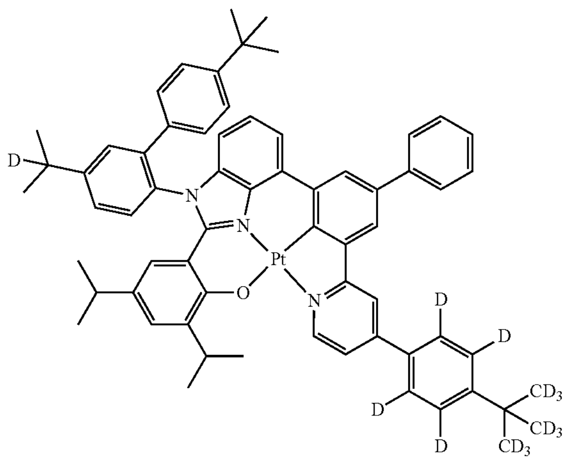
1238
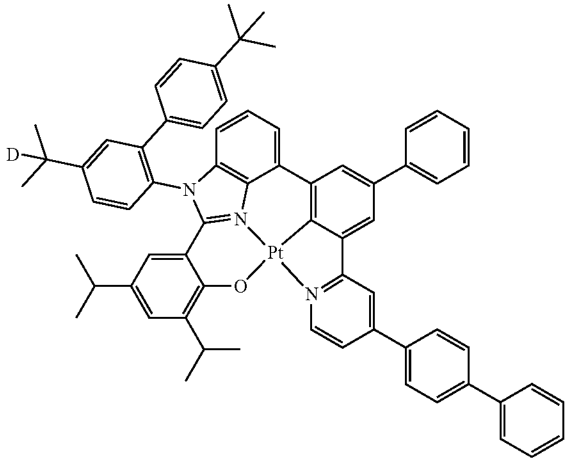
-continued
1239
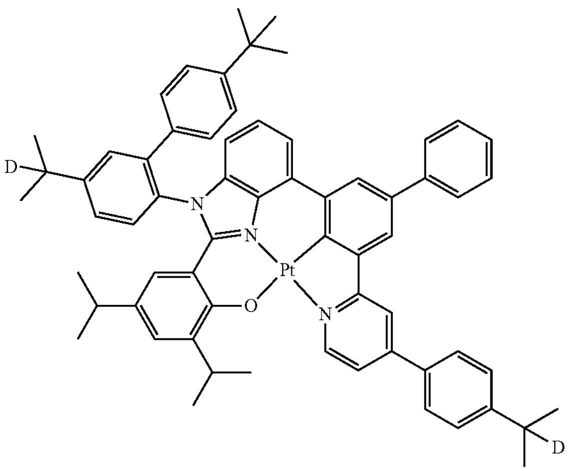
1240
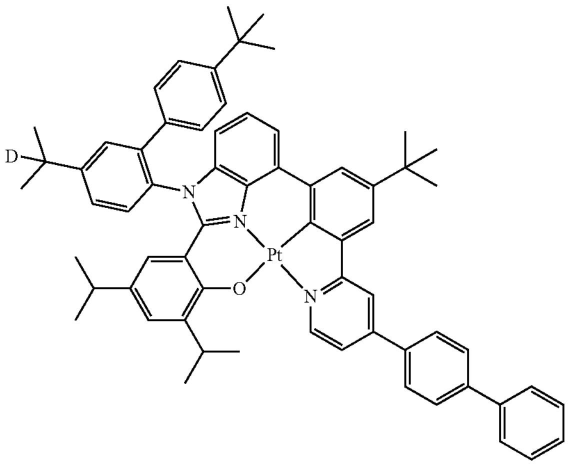
1241
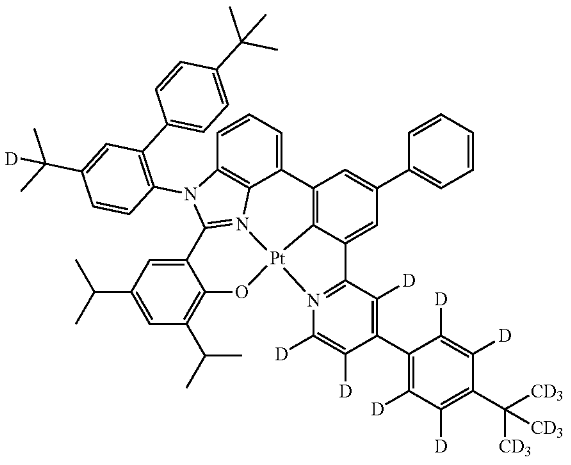

-continued
1242
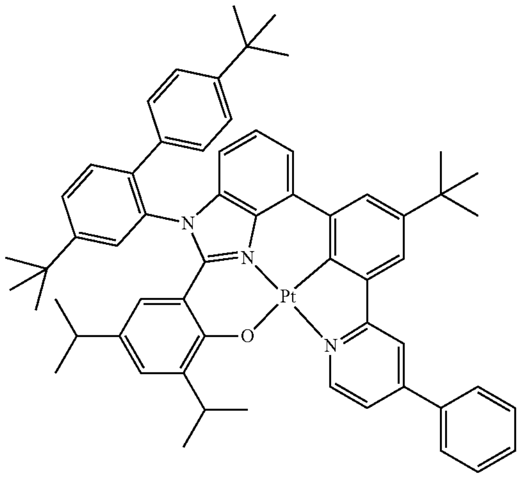
1243
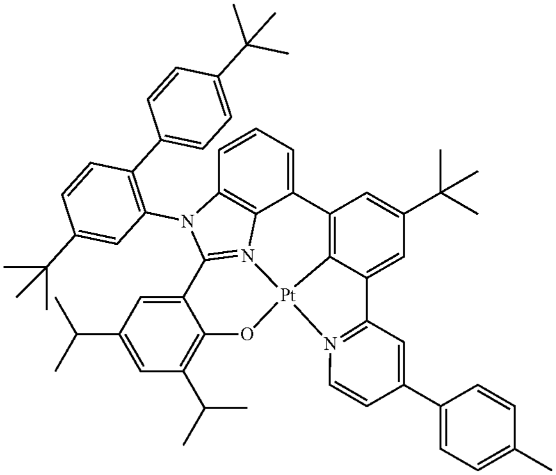
1244
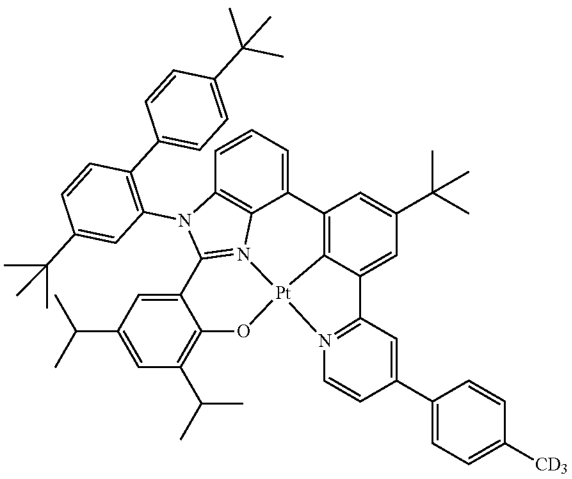
-continued
1245
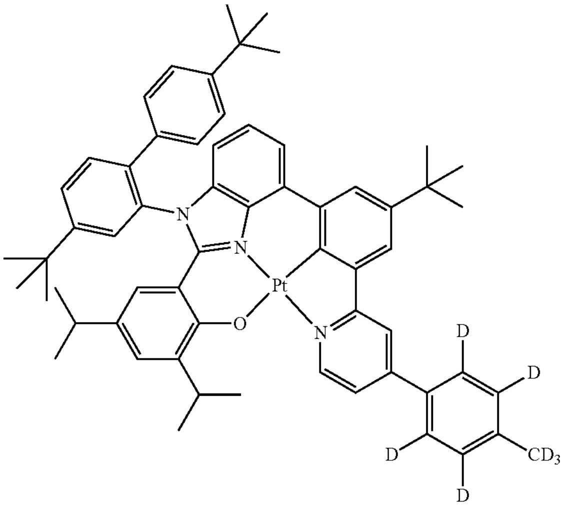
1246
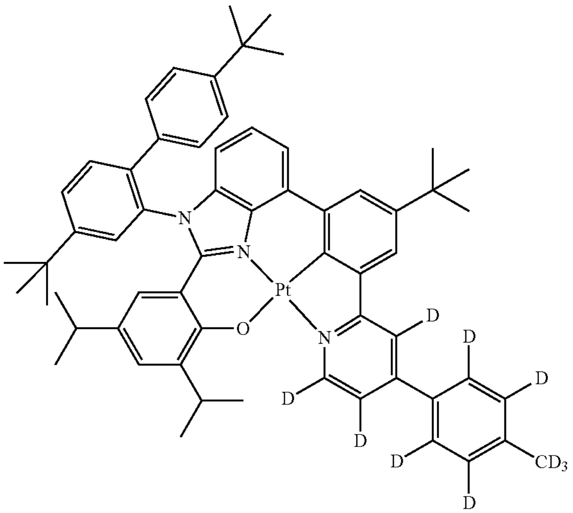
1247
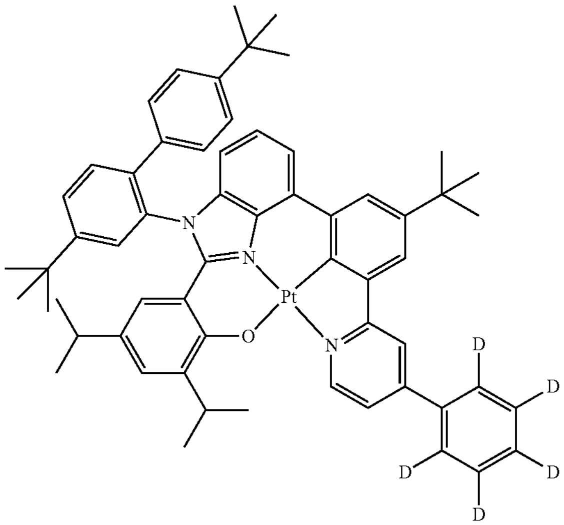

-continued
1248
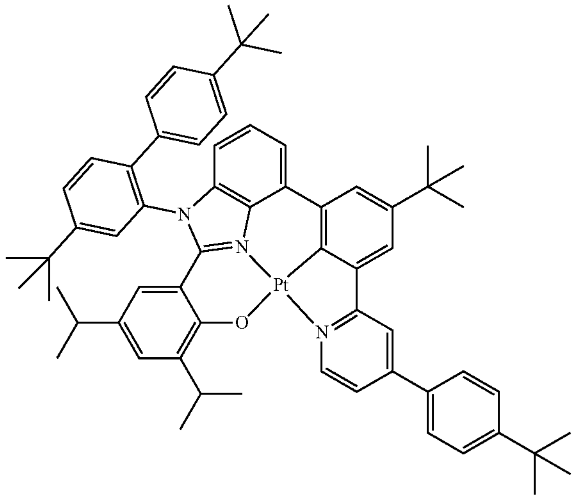
1249
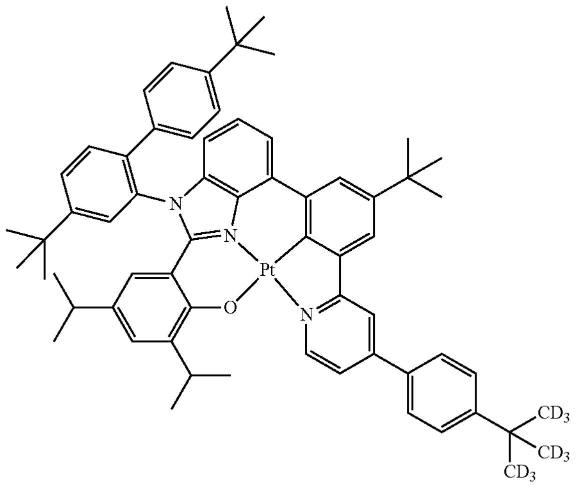
1250
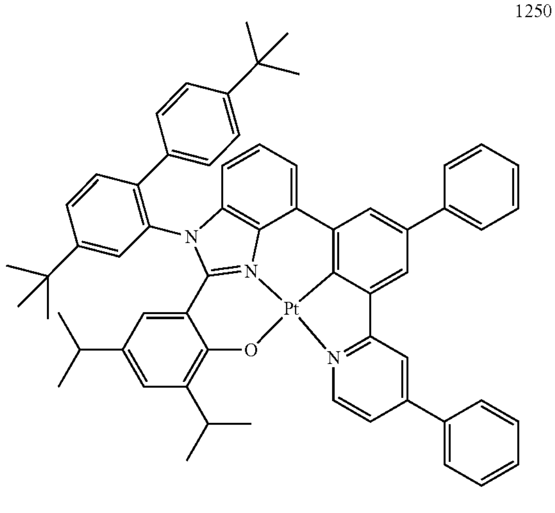
-continued
1251
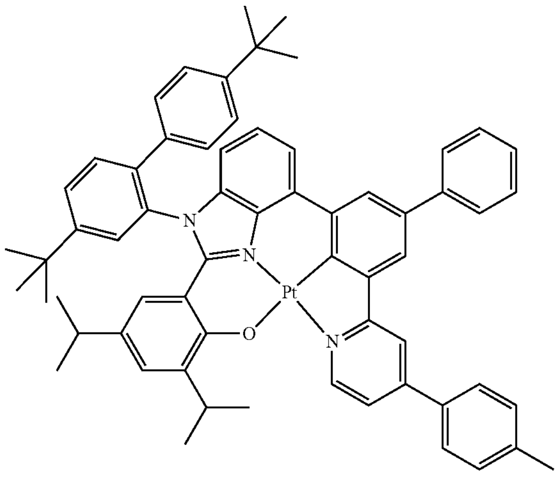
1252
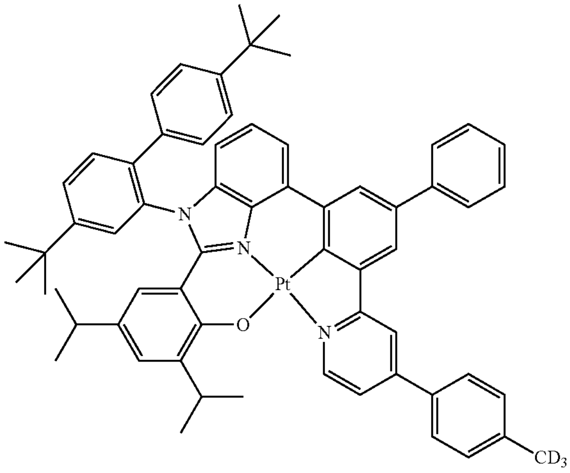
1253
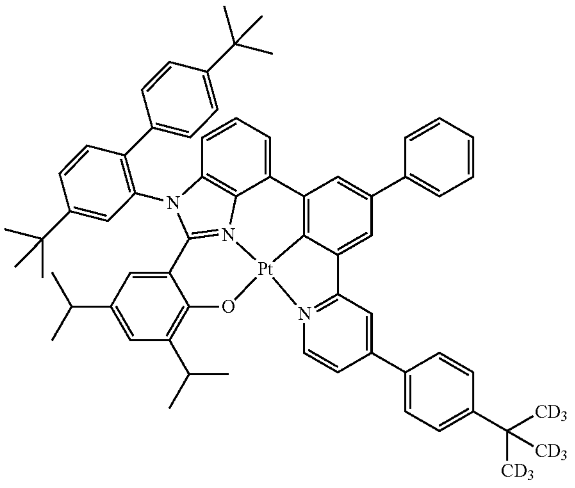

1254
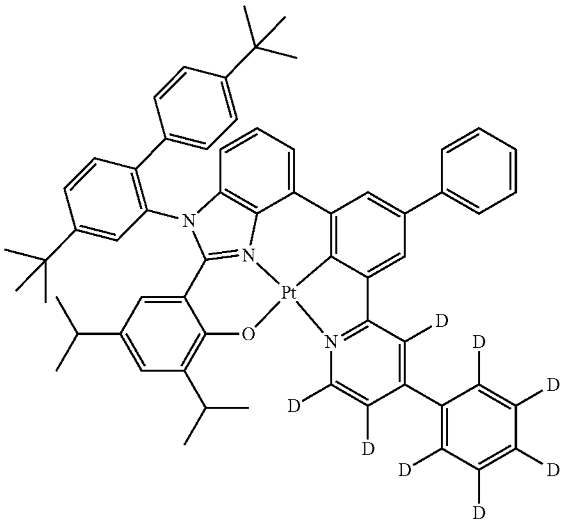
1255
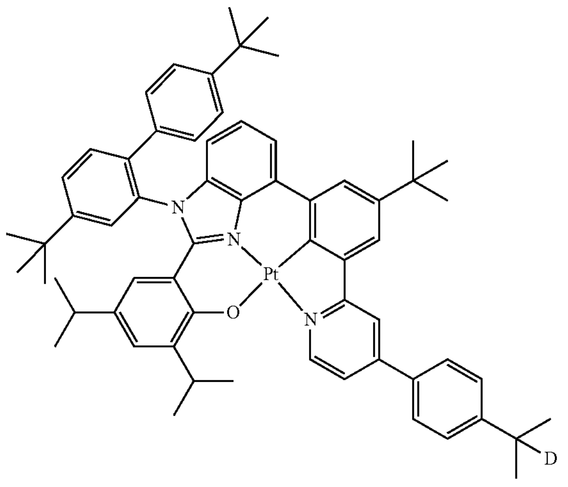
1256
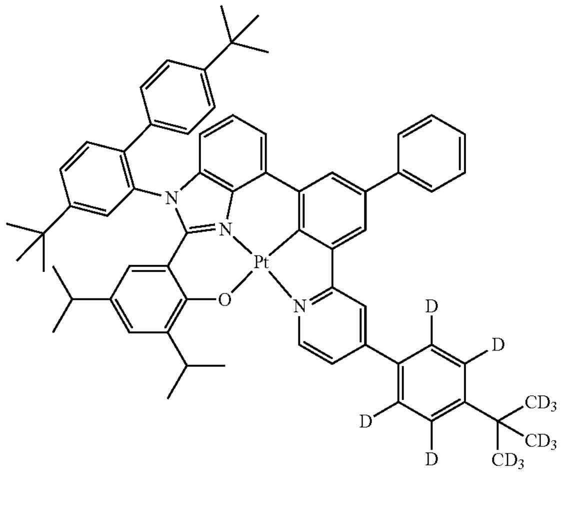
1257
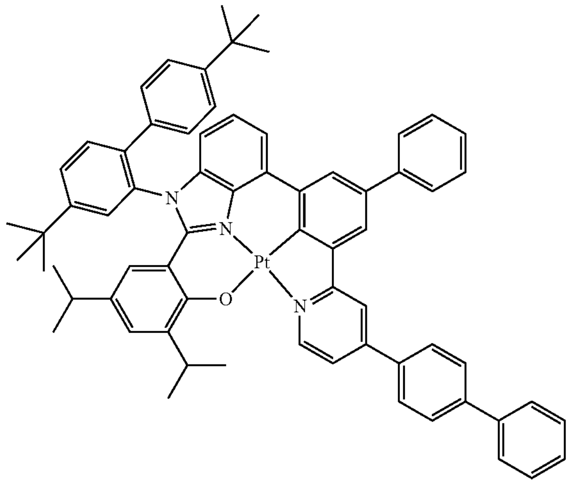
1258
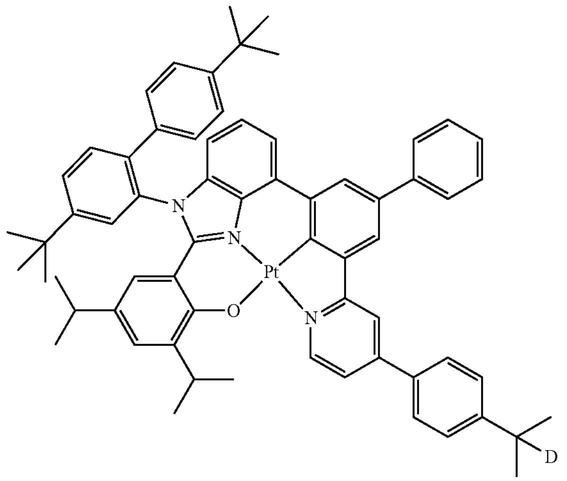
1259
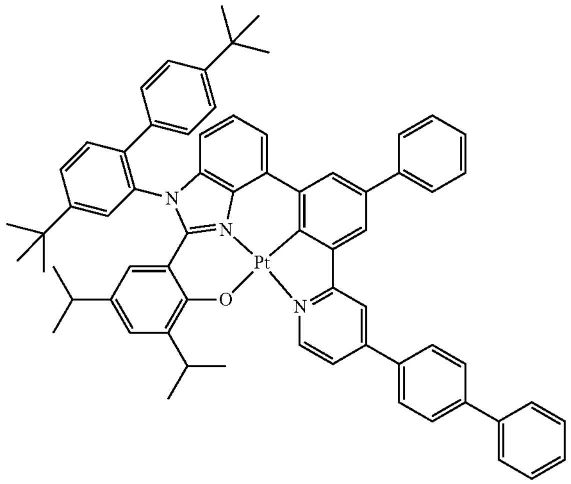

-continued
1260
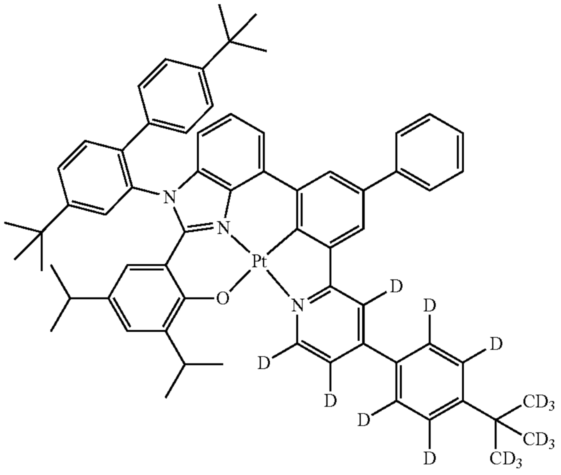
1261
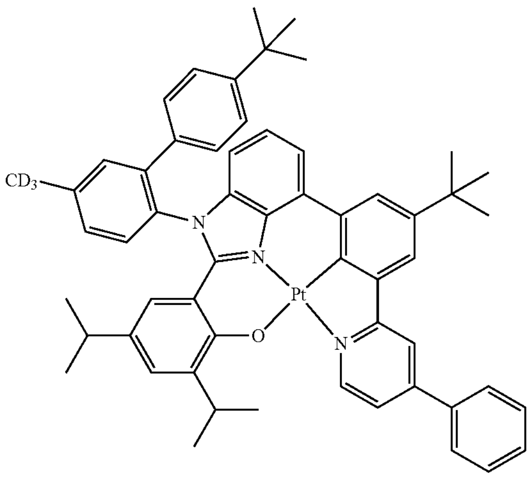
1262
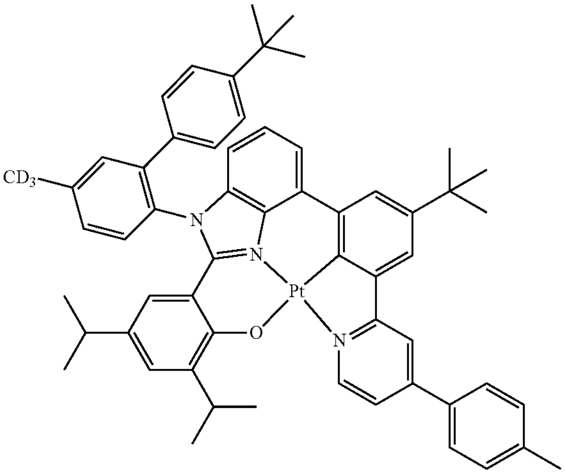
-continued
1263
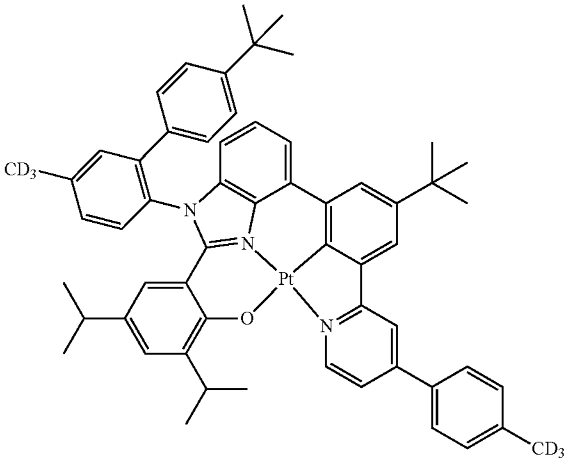
1264
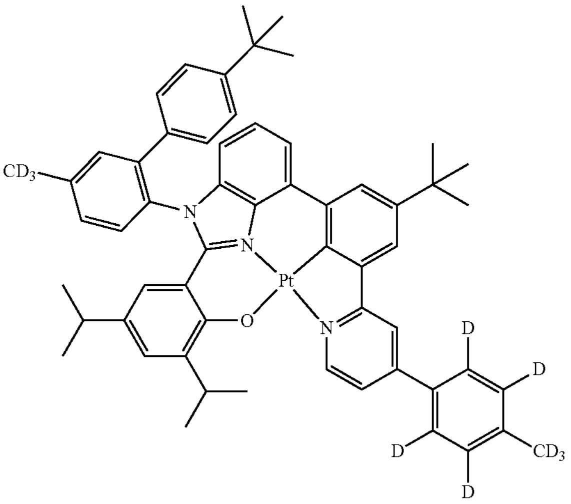
1265
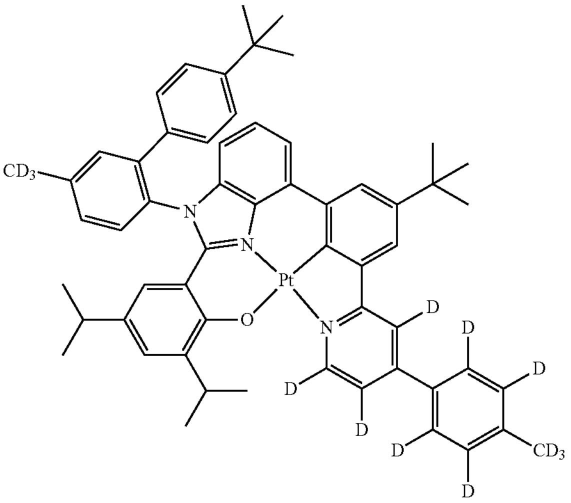

-continued
1266
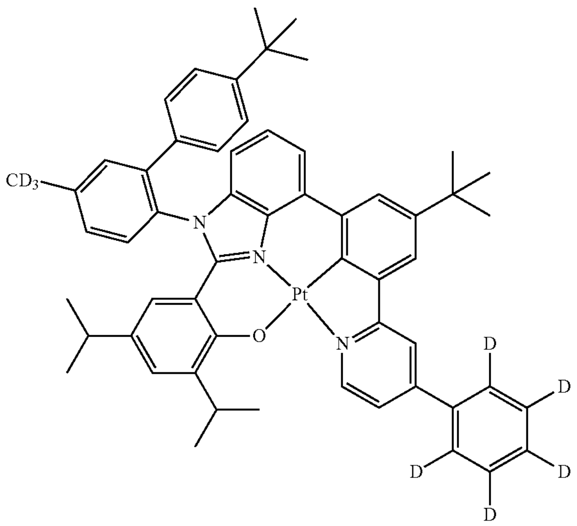
1267
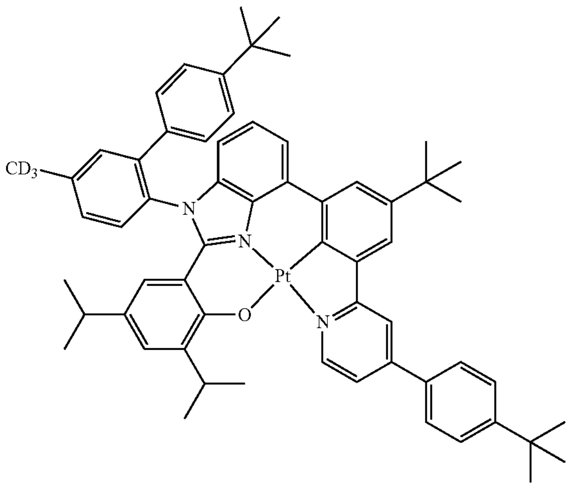
1268
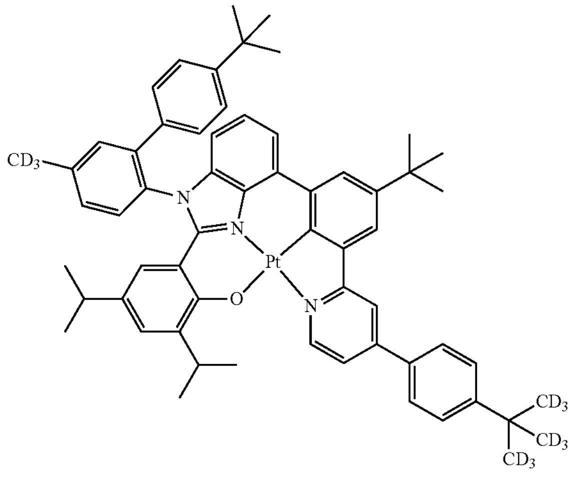
-continued
1269
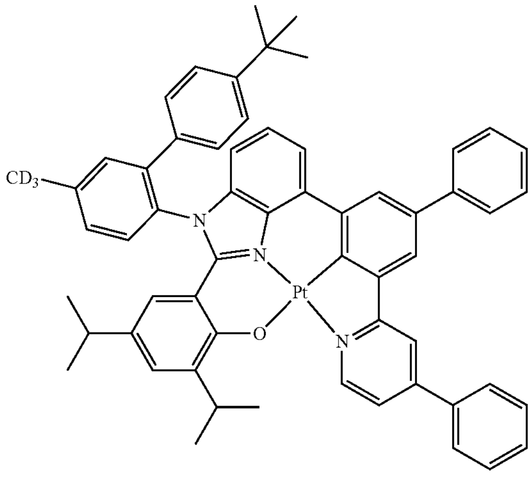
1270
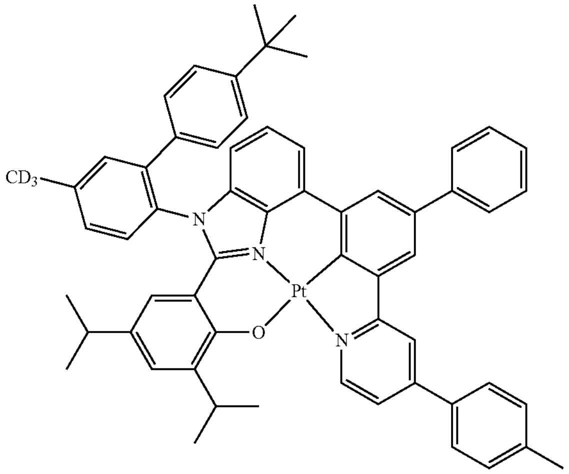
1271
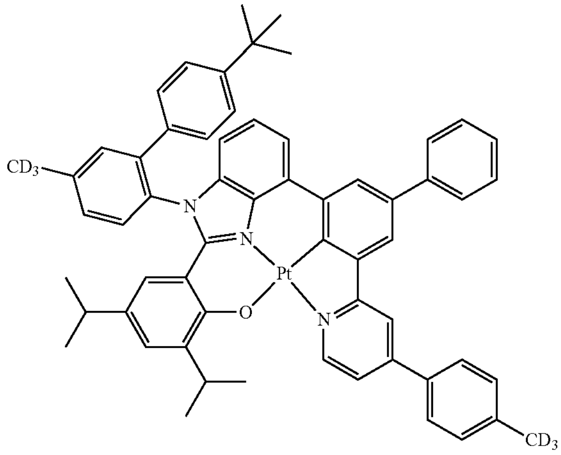

-continued
1272
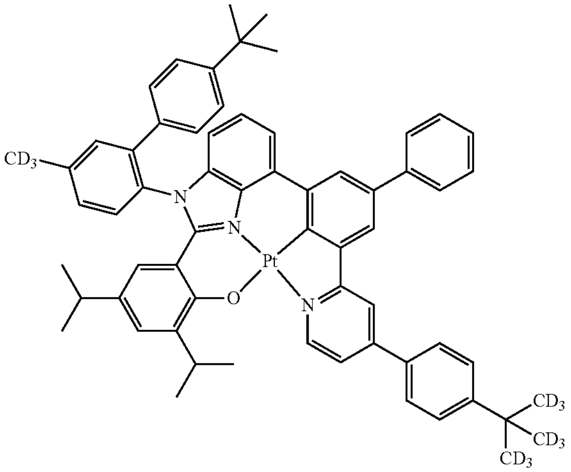
1273
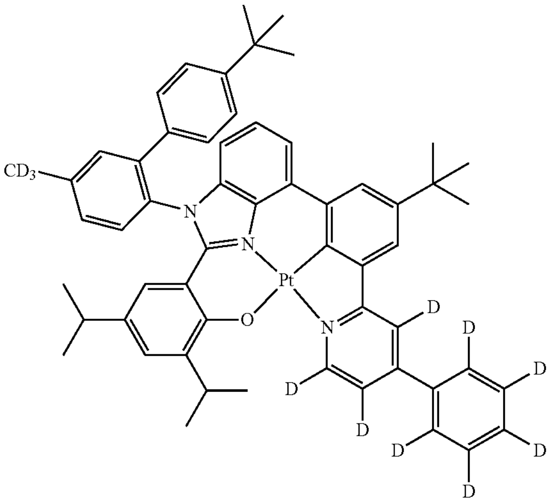
1274
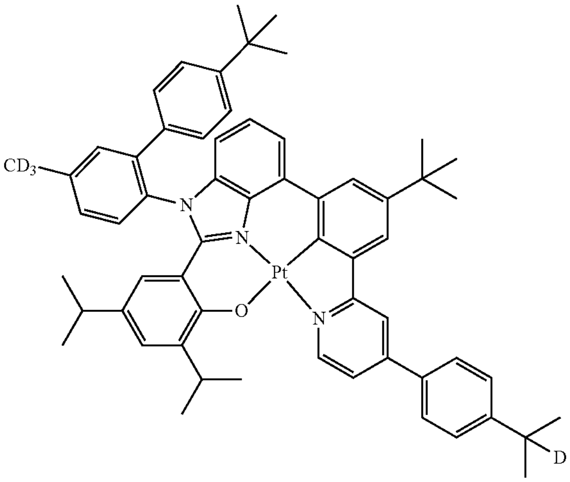
-continued
1275
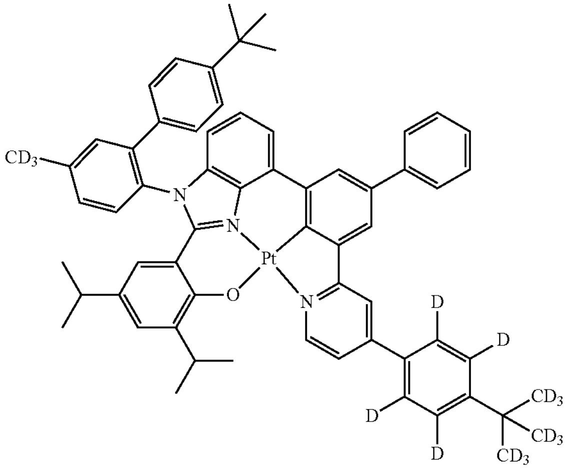
1276
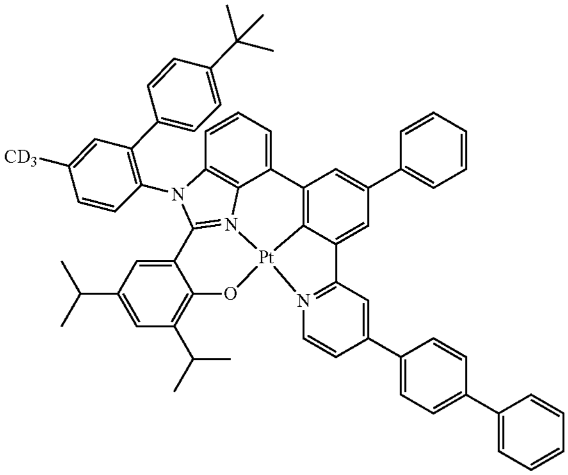
1277
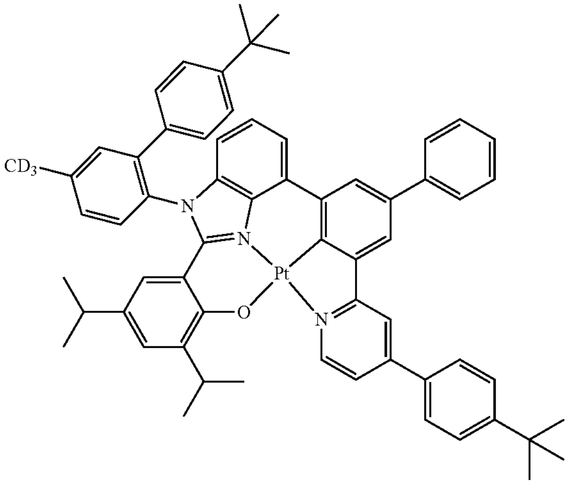

-continued
1278
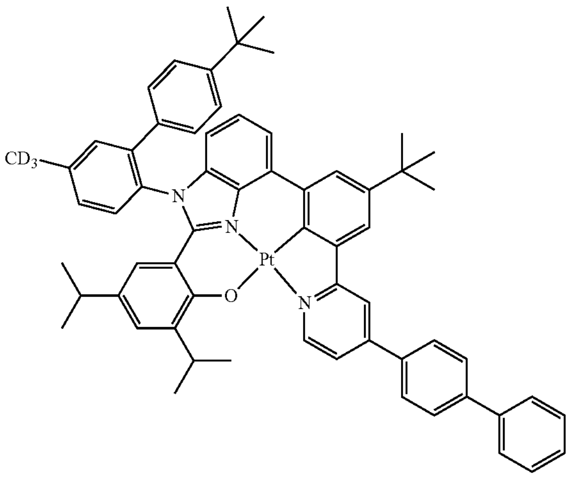
1279
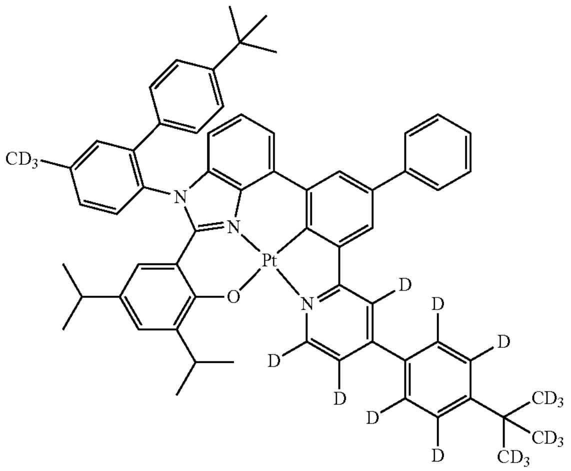
1280
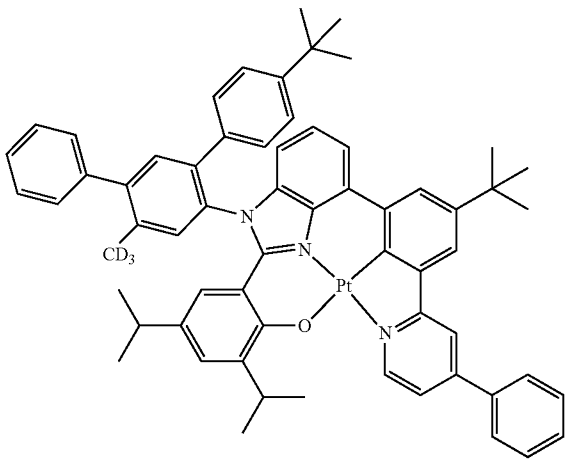
-continued
1281
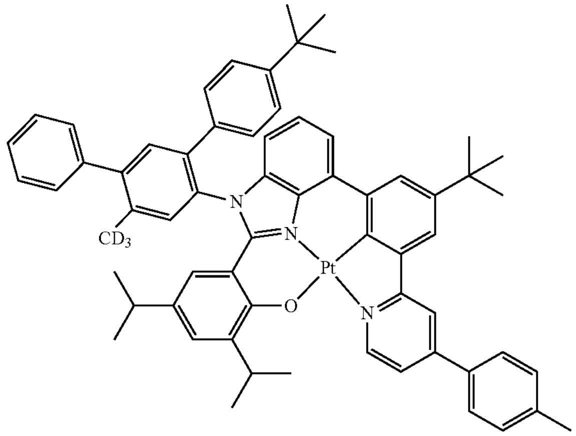
1282
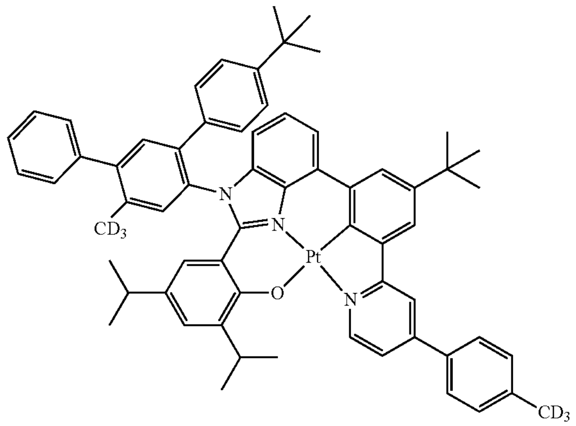
1283
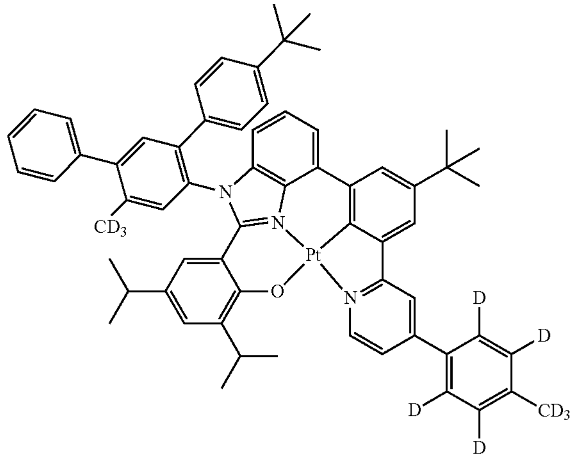

-continued
1284
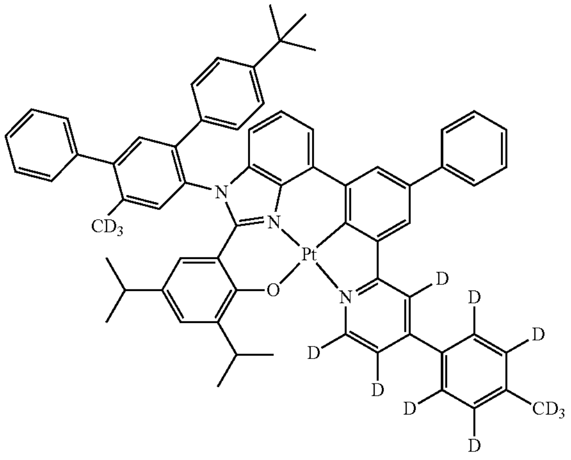
1285
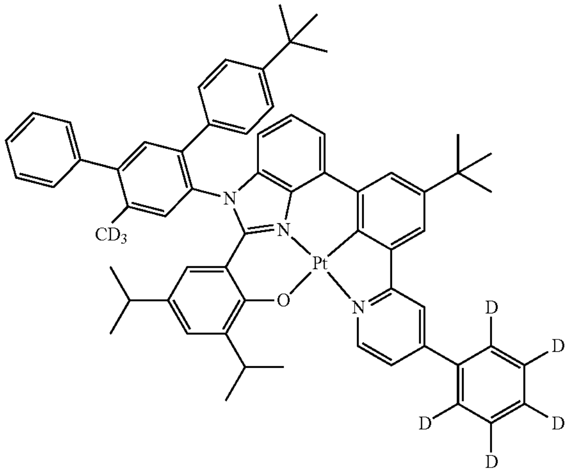
1286
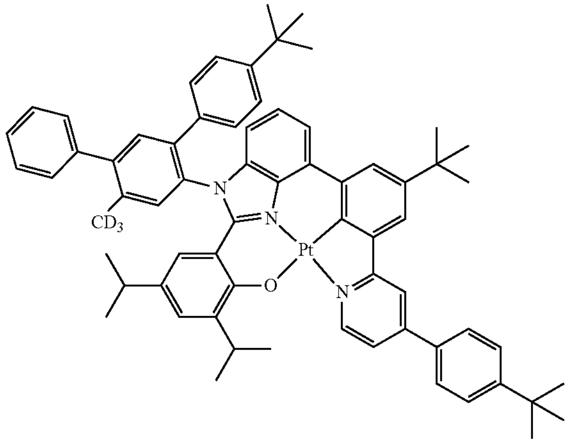
-continued
1287
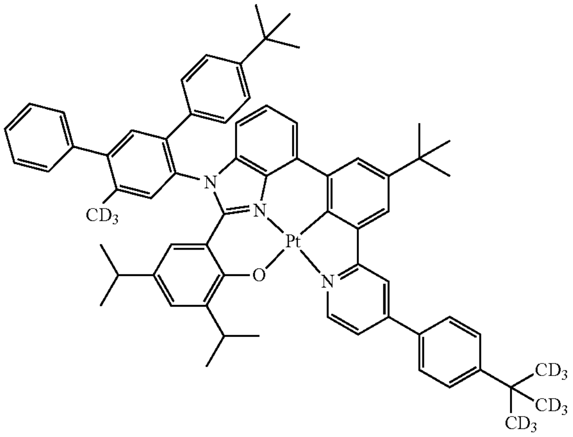
1288
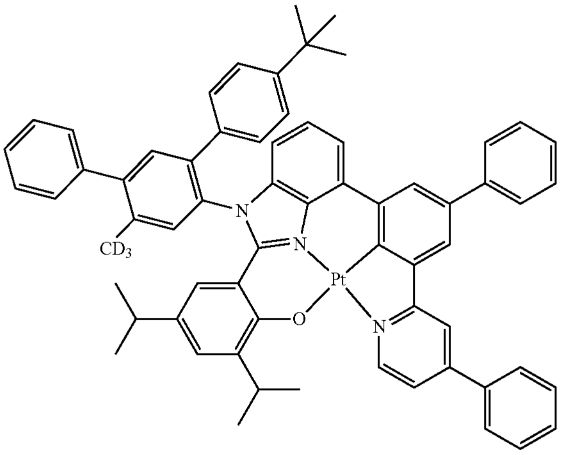
1289
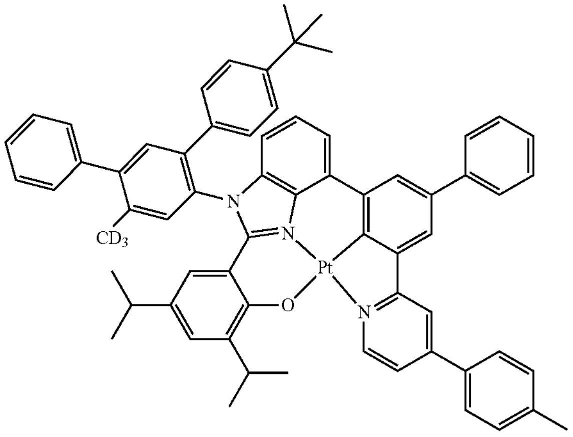

-continued
1290
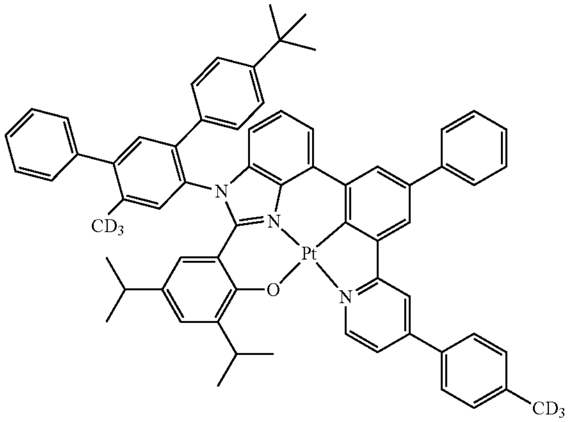
1291
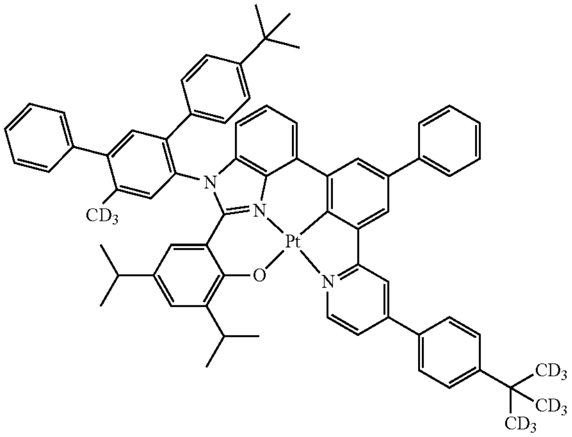
1292
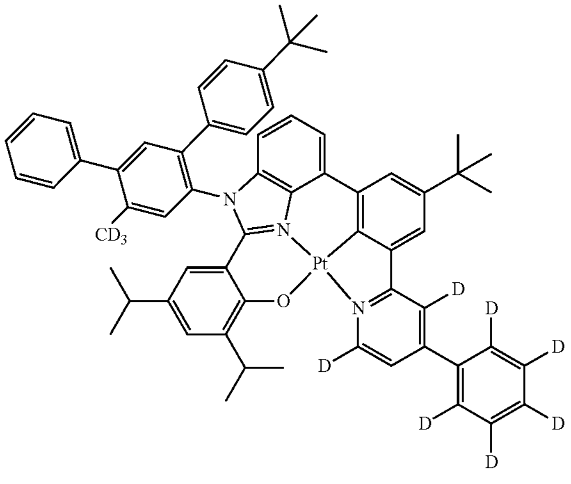
-continued
1293
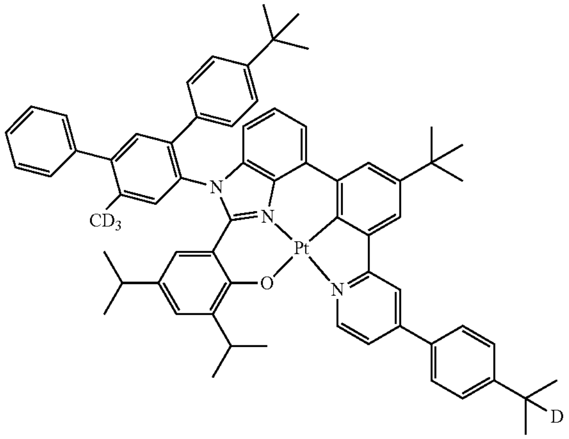
1294
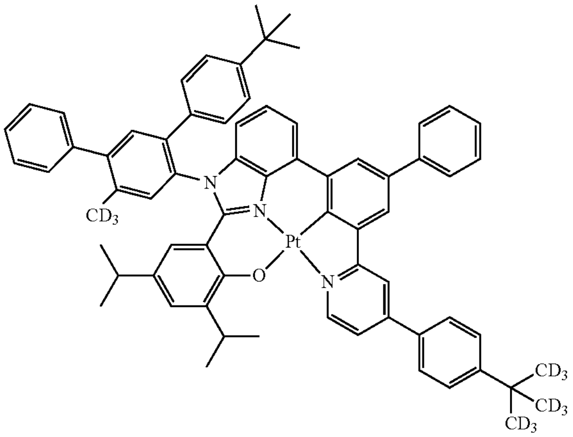
1295
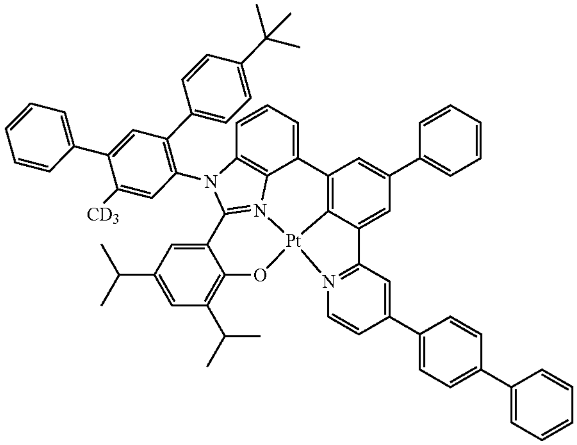

-continued
1296
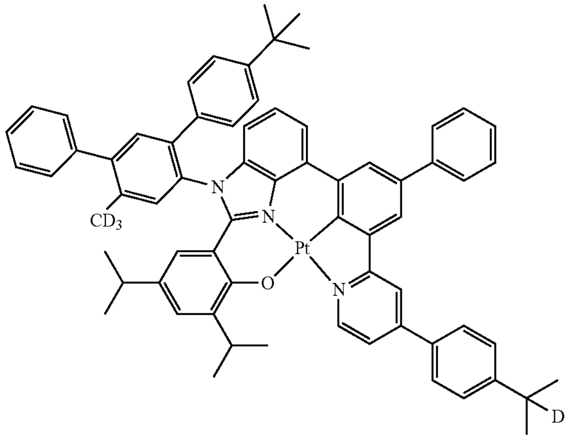
1297
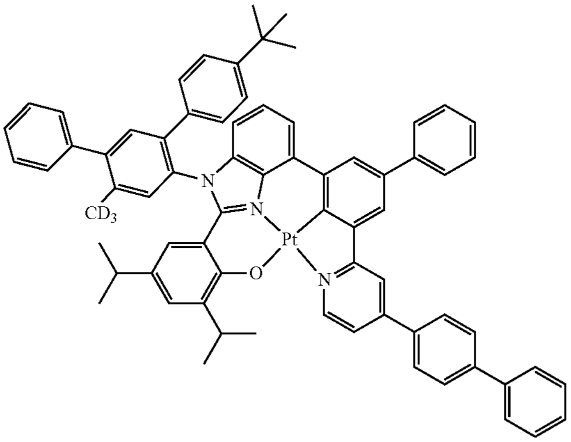
1298
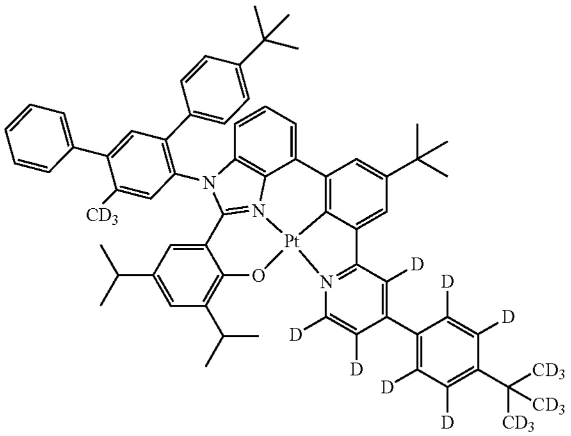
-continued
1299
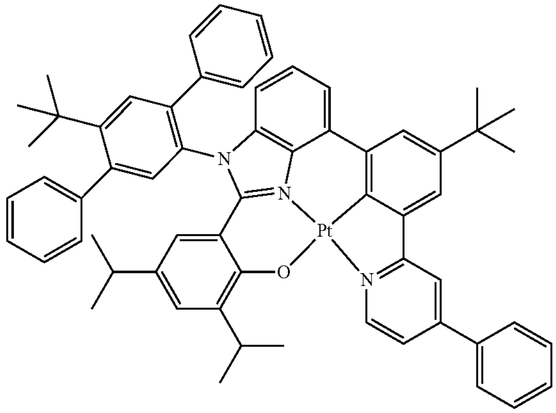
1300
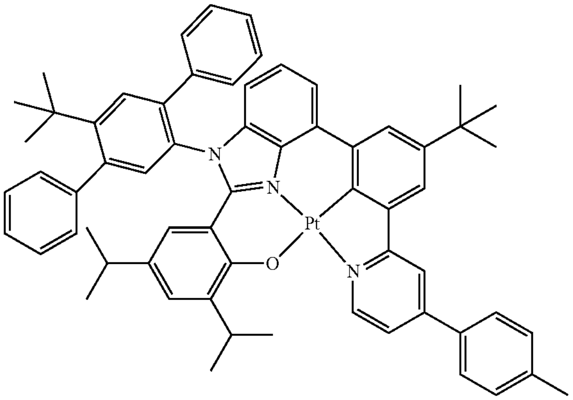
1301
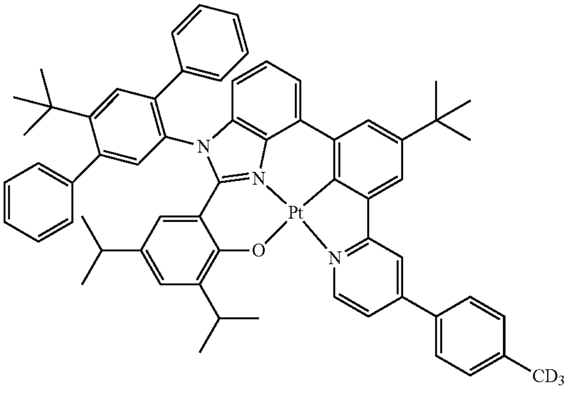

-continued
1302
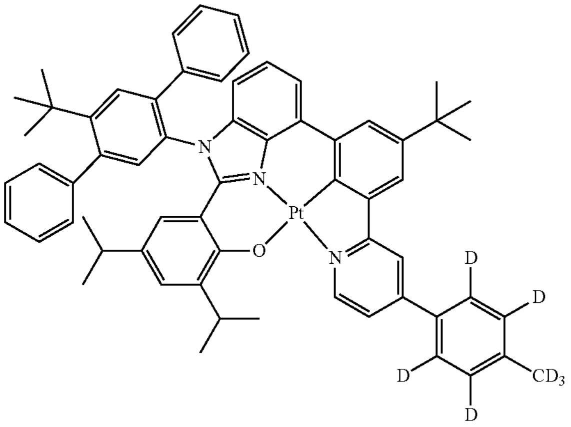
1303
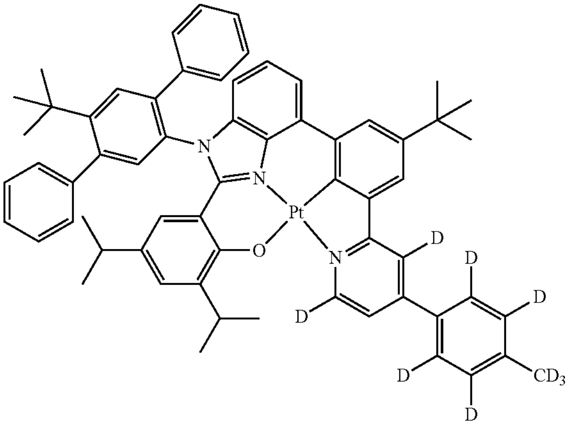
1304
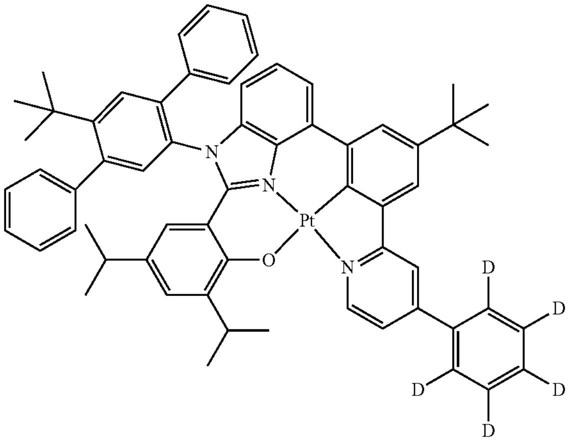
-continued
1305
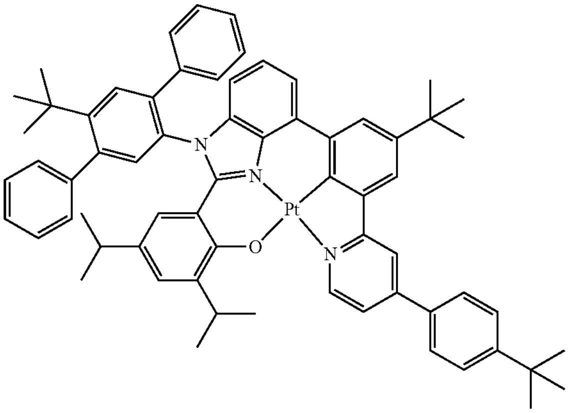
1306
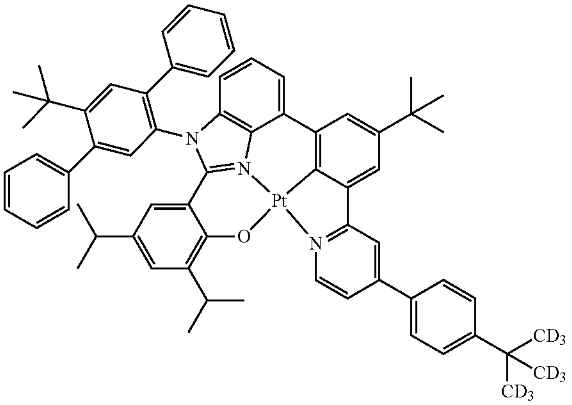
1307
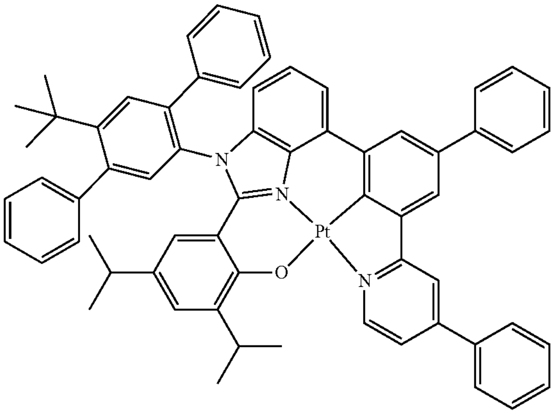

1308
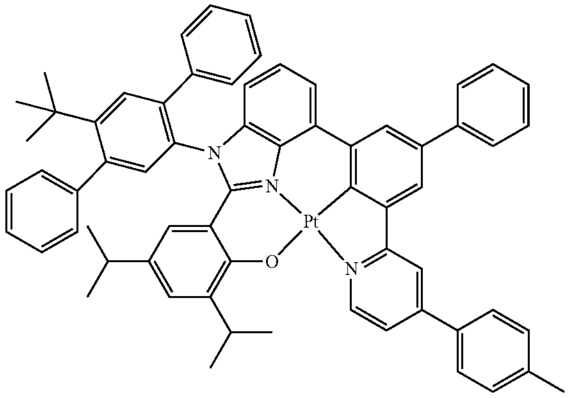
1309
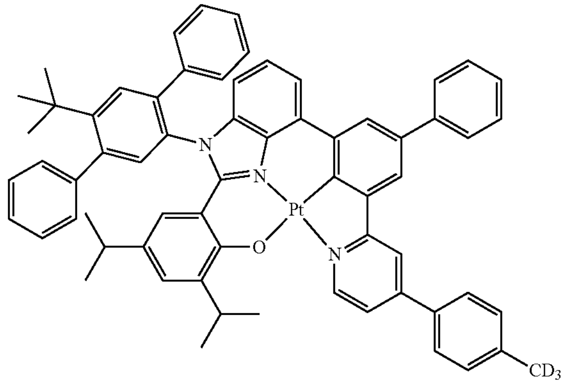
1310
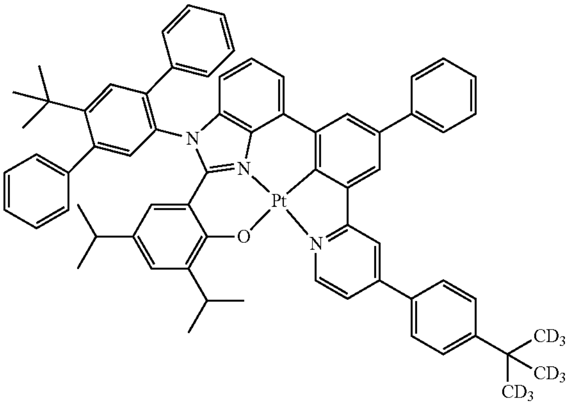
1311
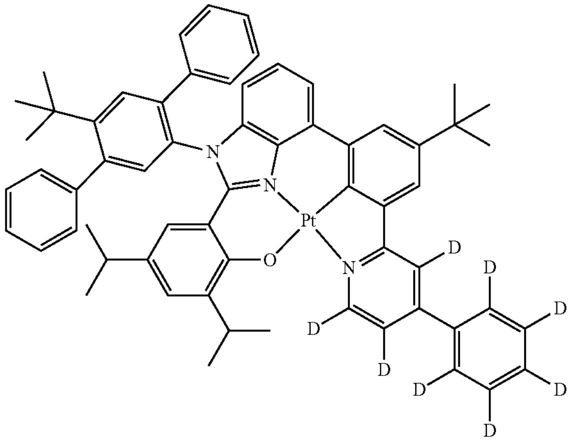
1312
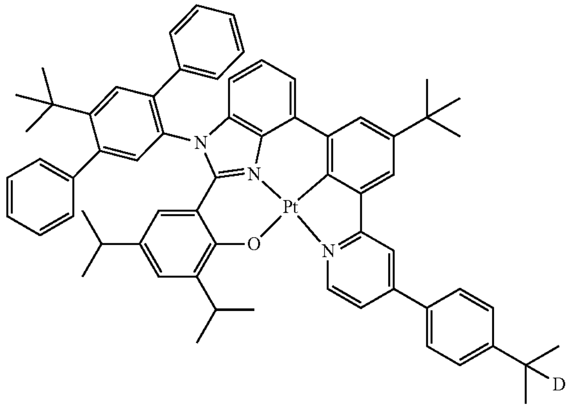
1313
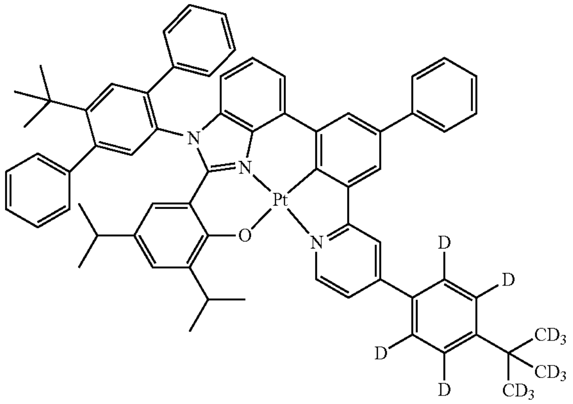

-continued
1314
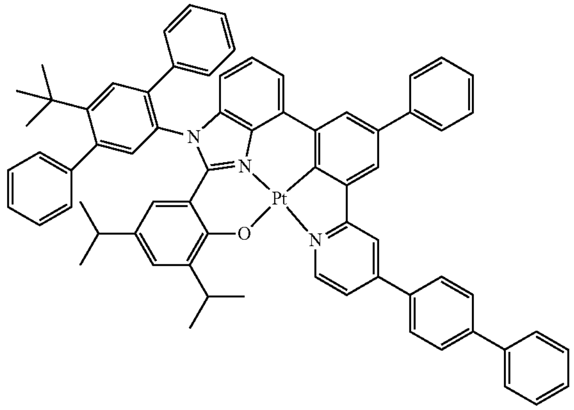
1315
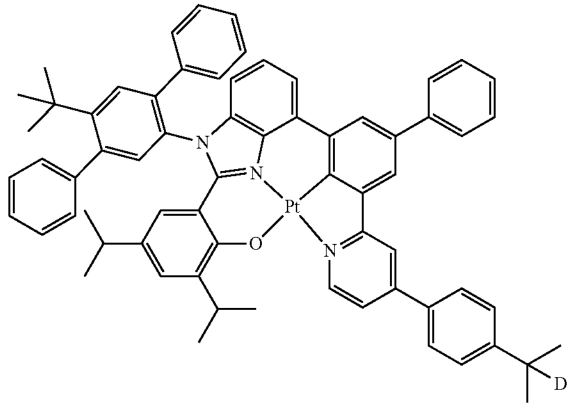
1316
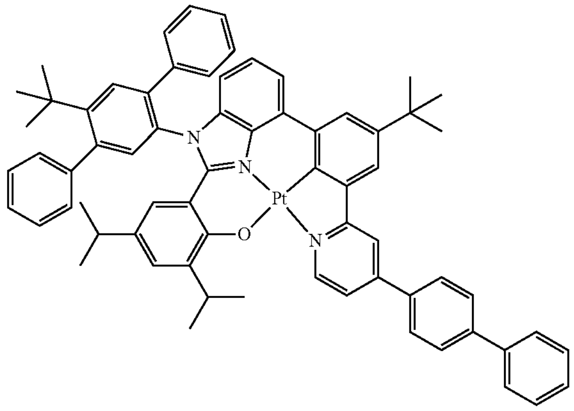
-continued
1317
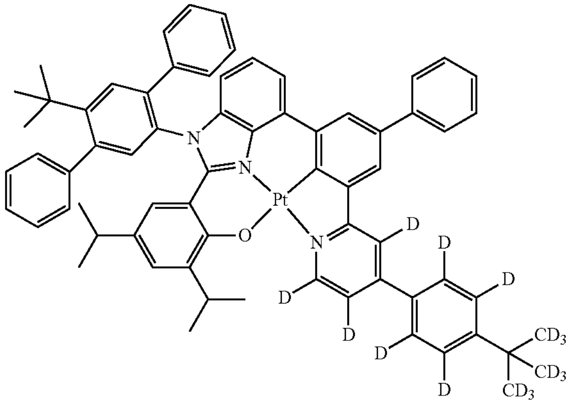
1318
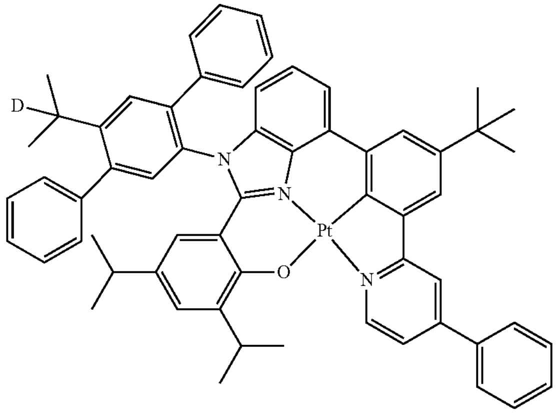
1319
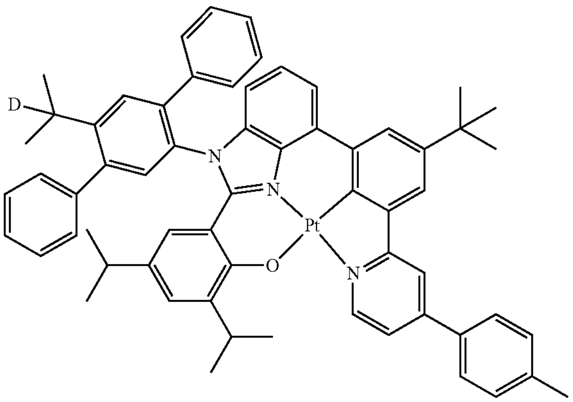

-continued
1320
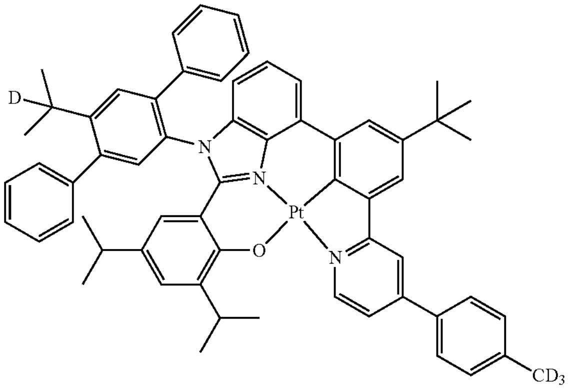
1321
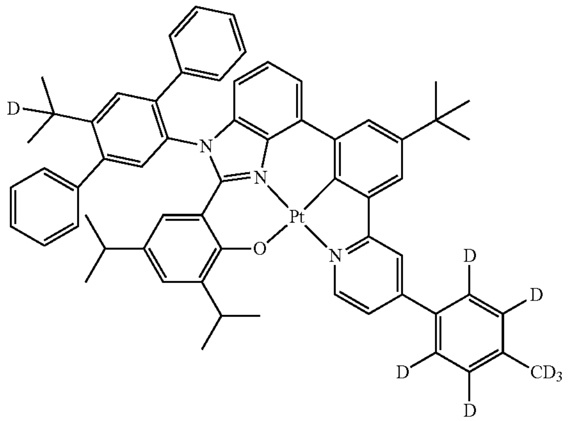
1322
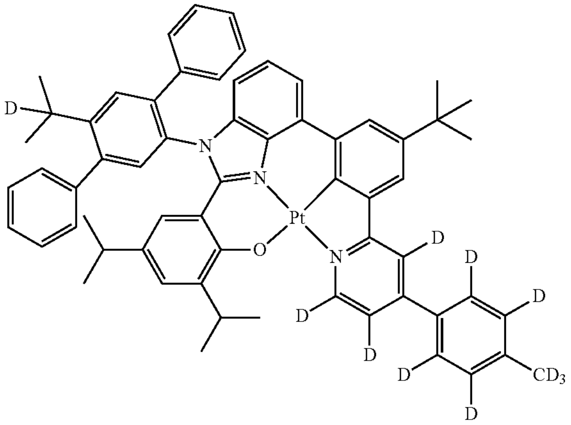
-continued
1323
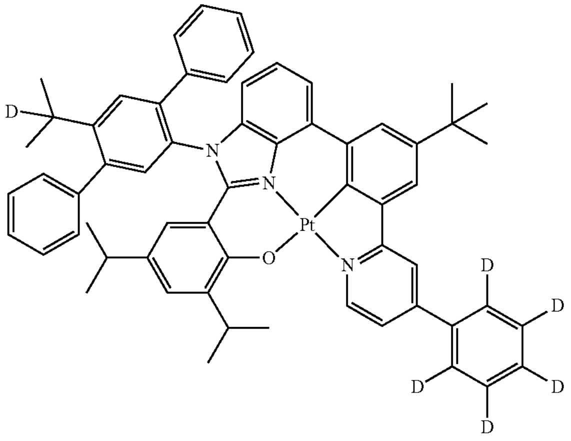
1324
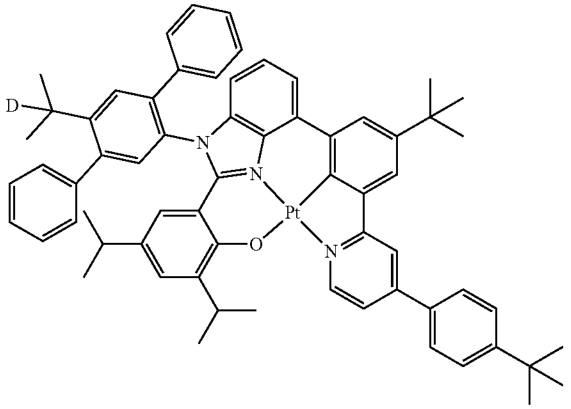
1325
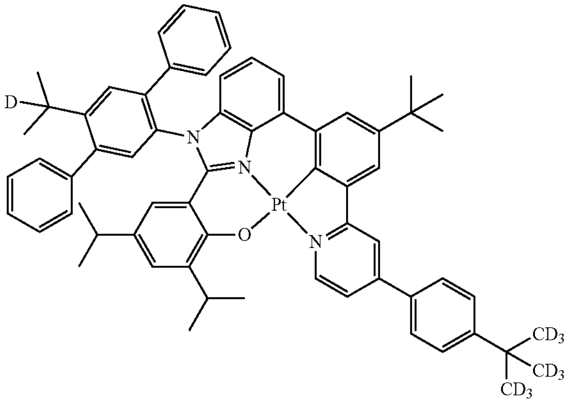

-continued
1326
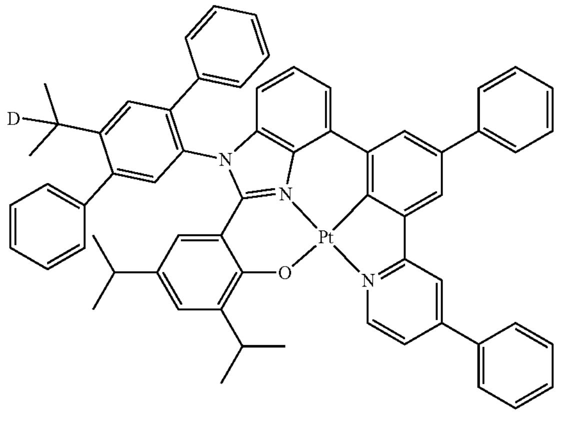
1327
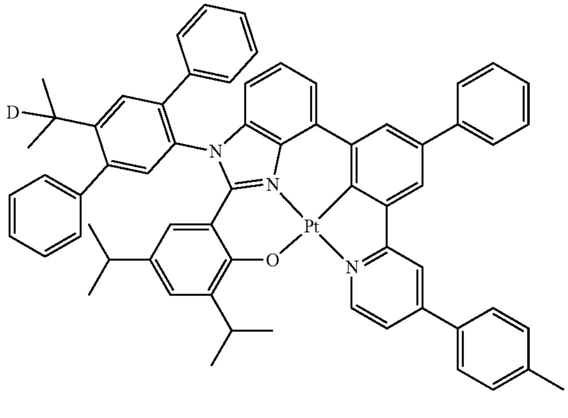
1328
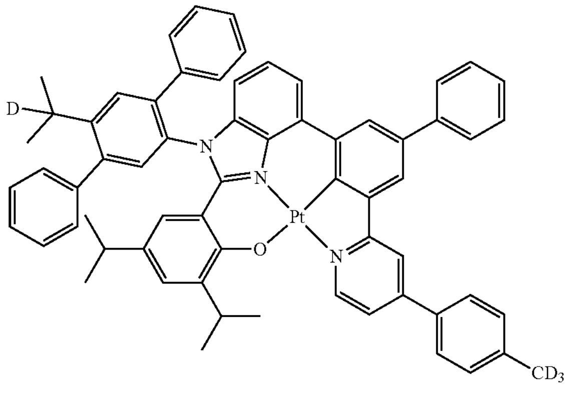
-continued
1329
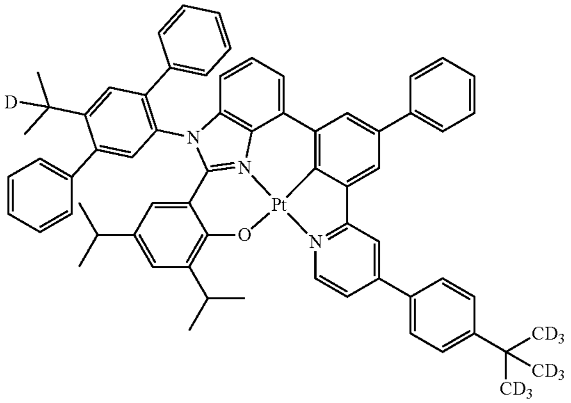
1330
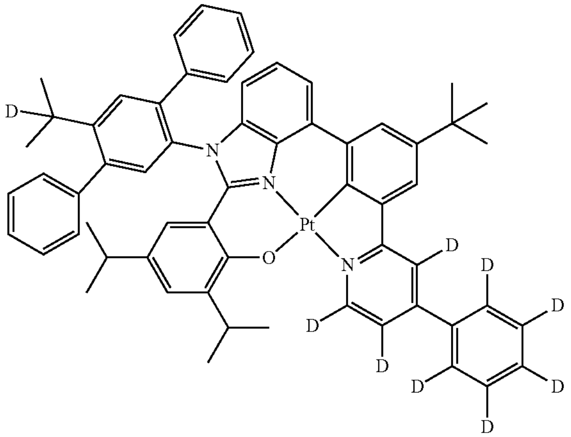
1331
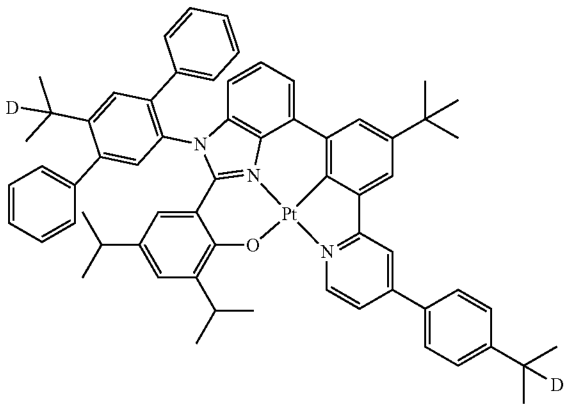

-continued
1332
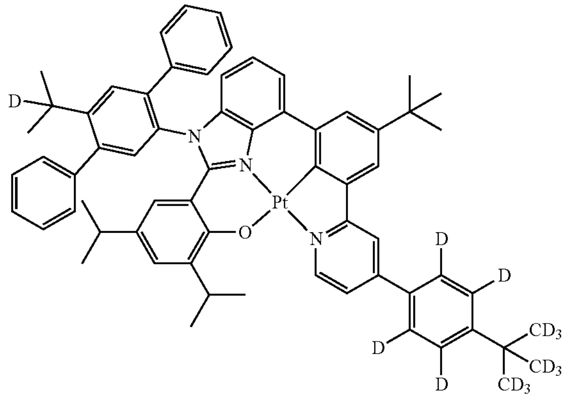
1333
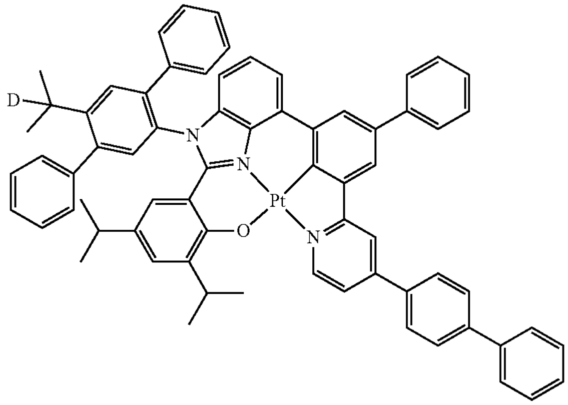
1334
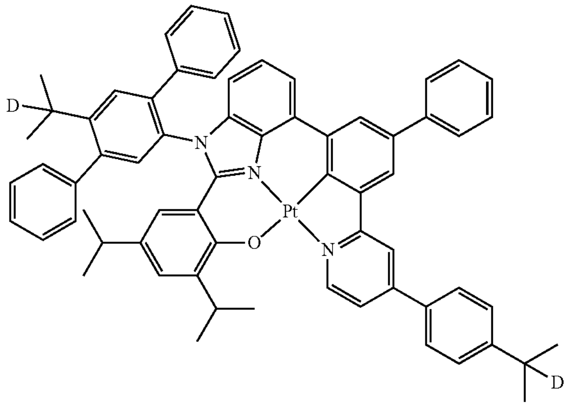
-continued
1335
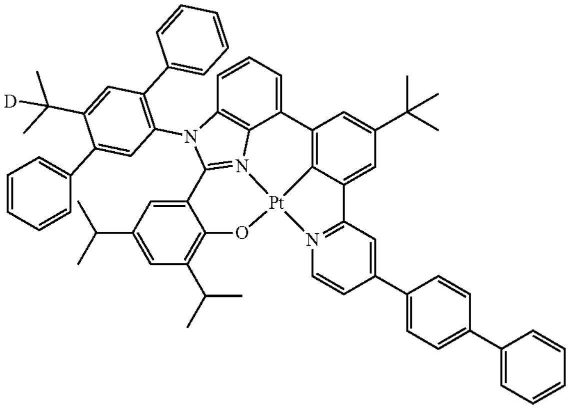
1336
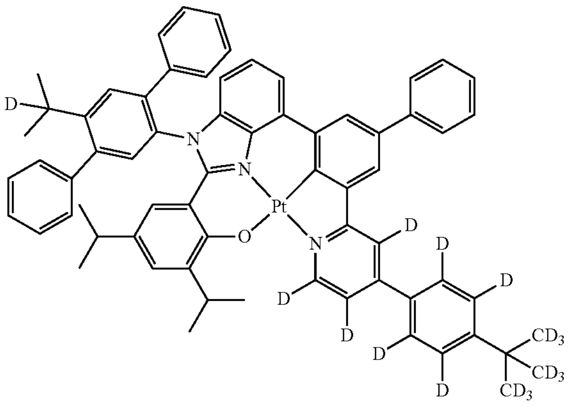
1337
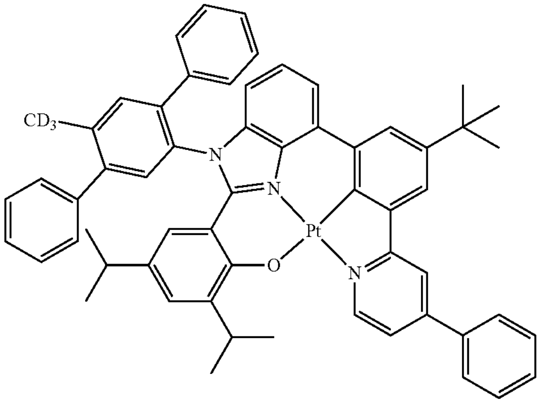

-continued
1338
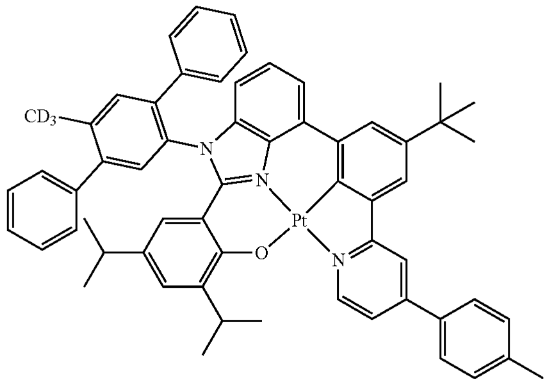
1339
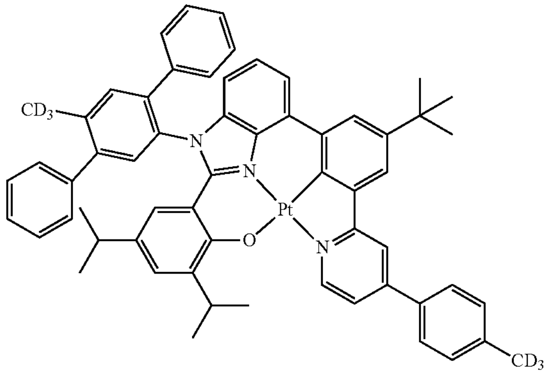
1340
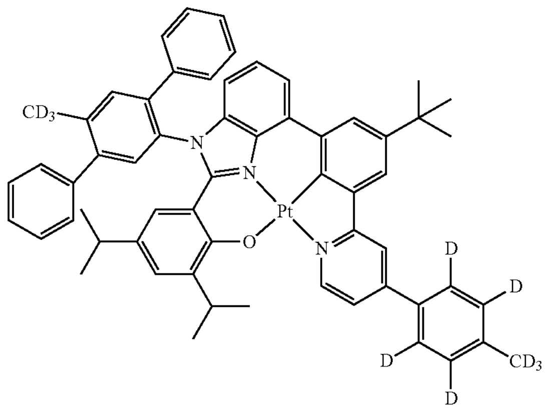
-continued
1341
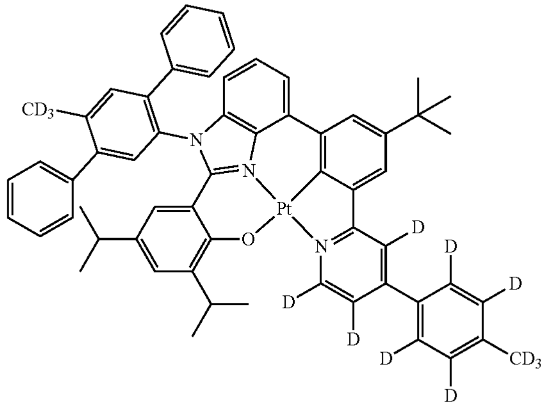
1342
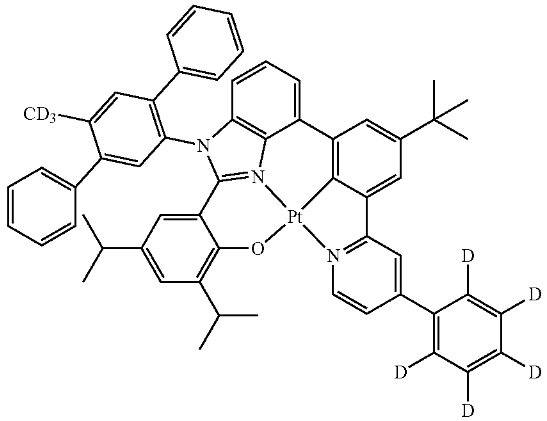
1343
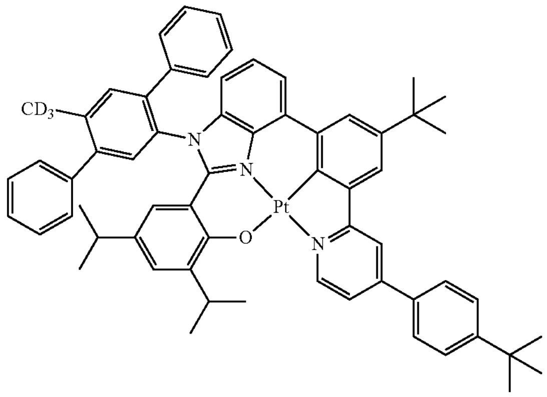

-continued
1344
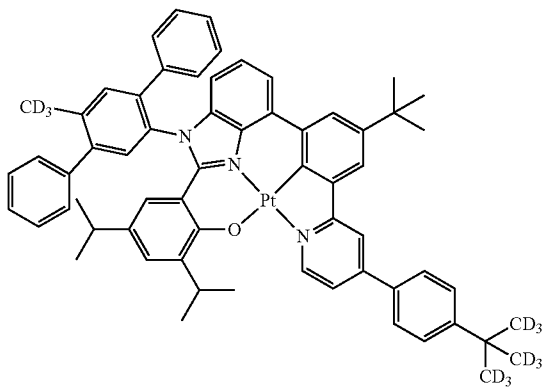
1345
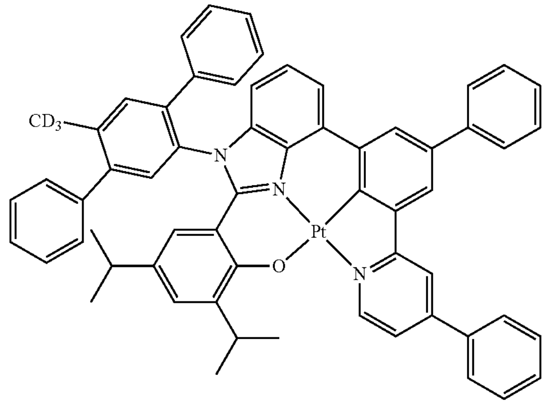
1346
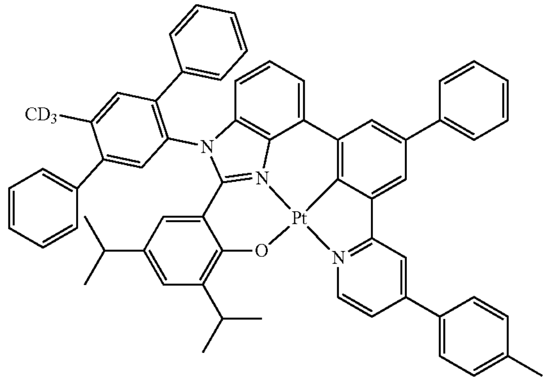
1347
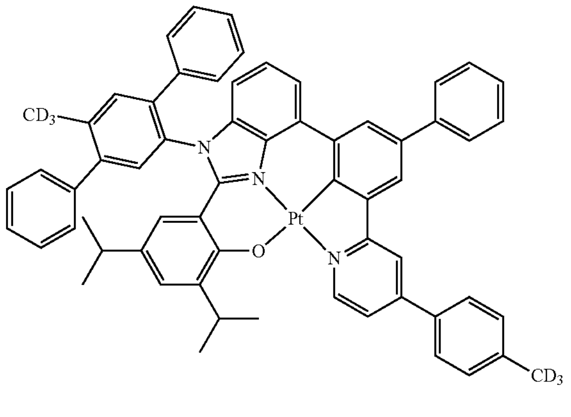
-continued
1348
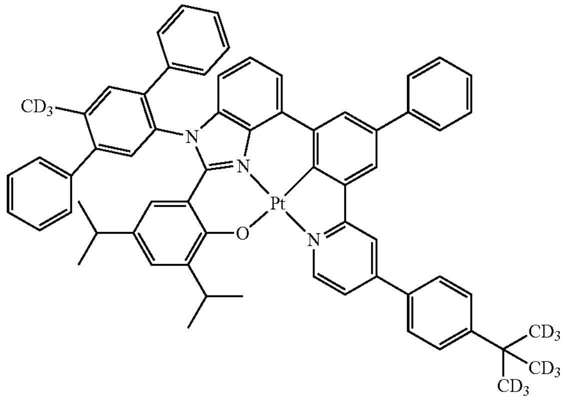
1349
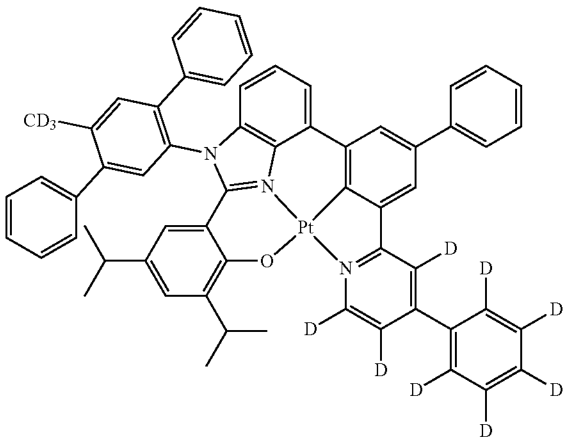
1350
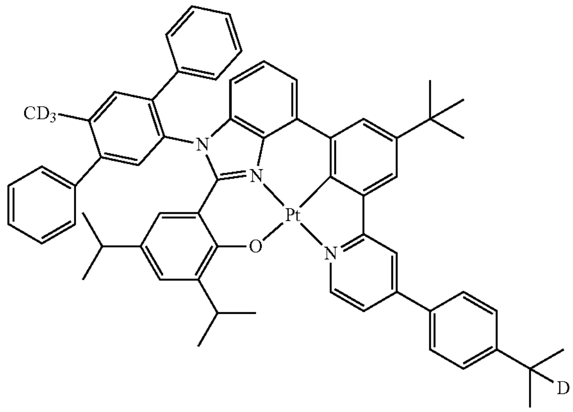

-continued
1351
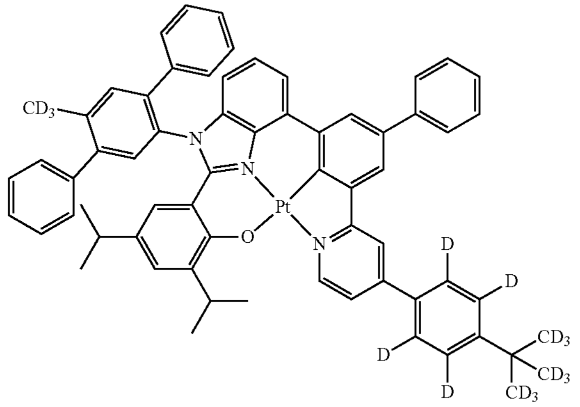
1352
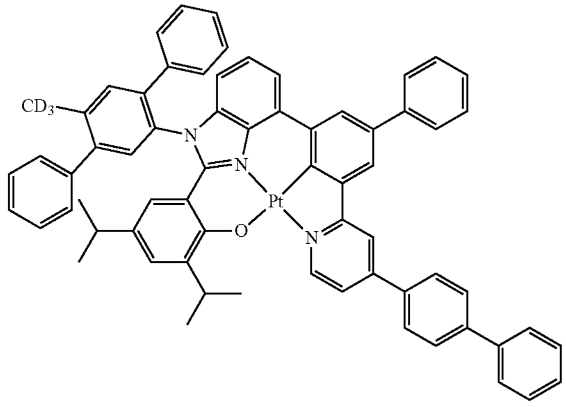
1353
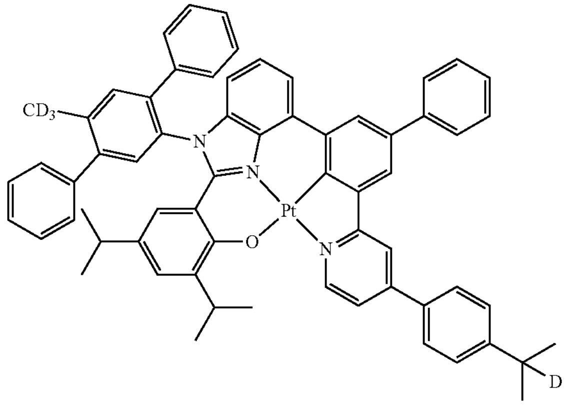
-continued
1354
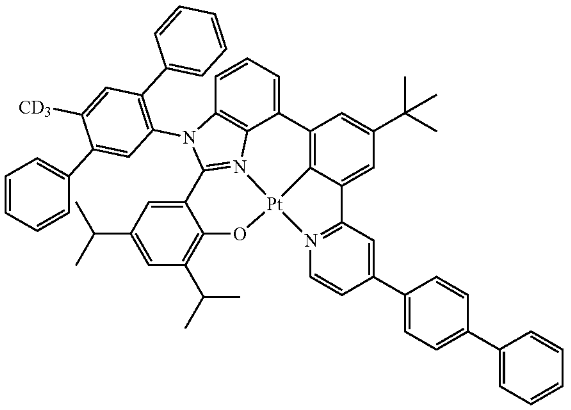
1355
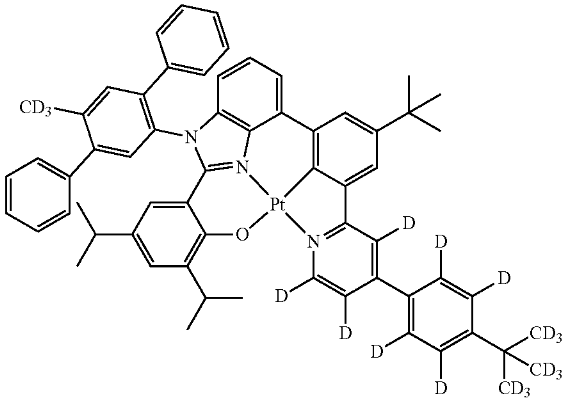
1356
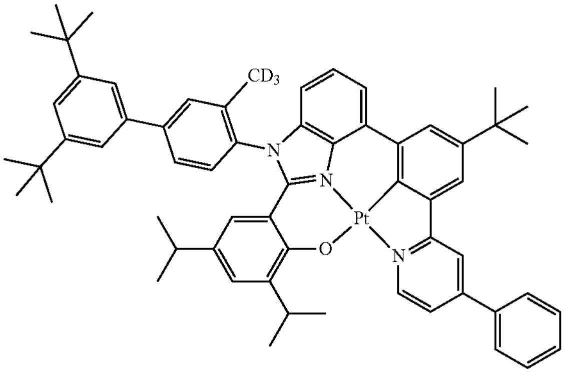
1357
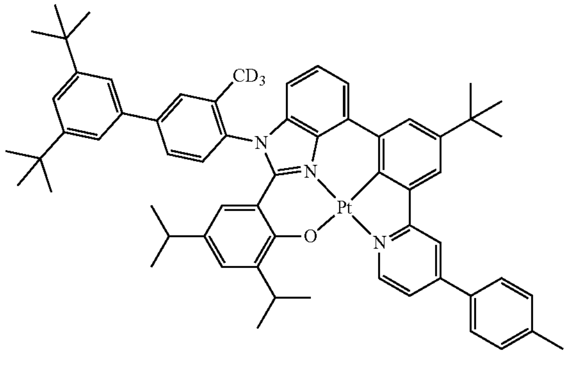

-continued
1358
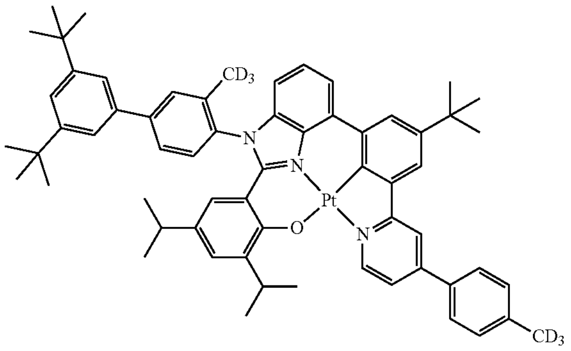
1359
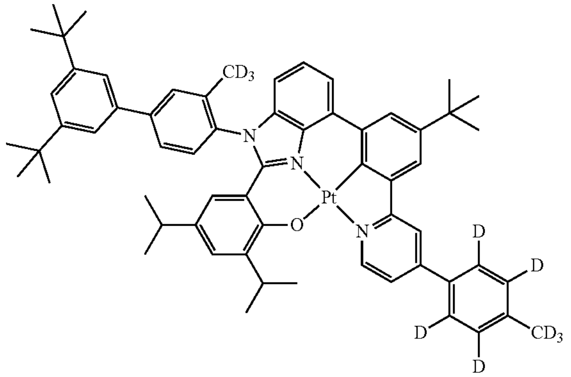
1360
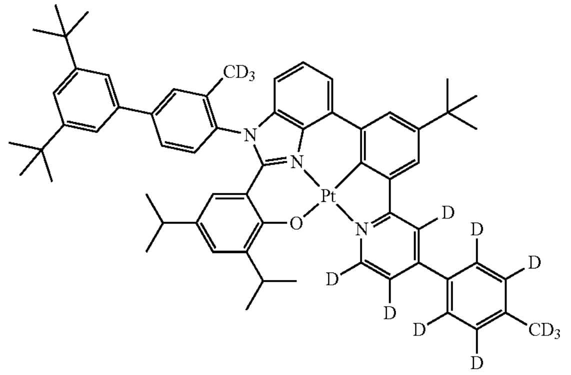
1361
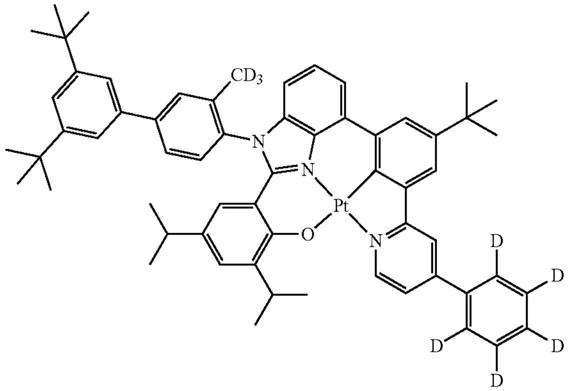
-continued
1362
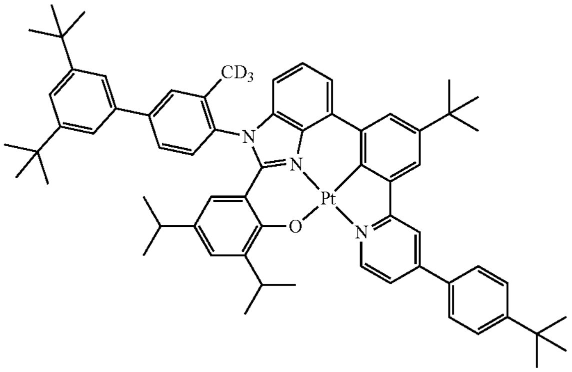
1363
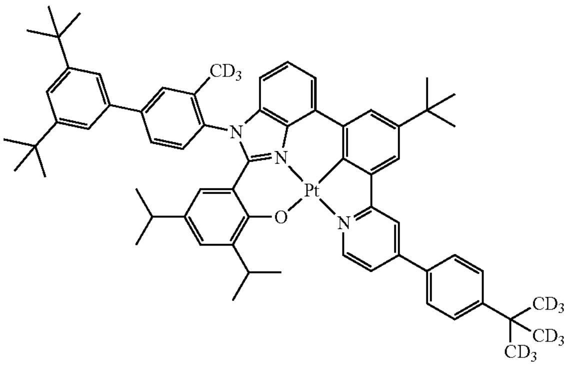
1364
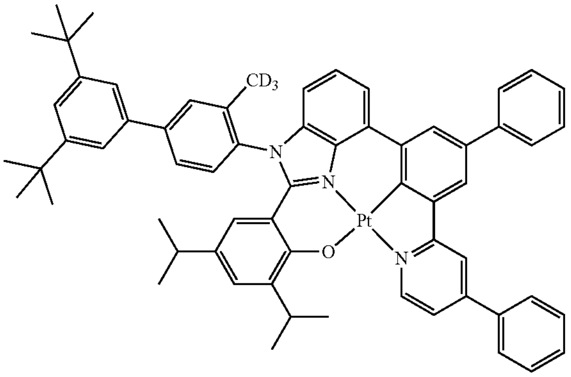
1365
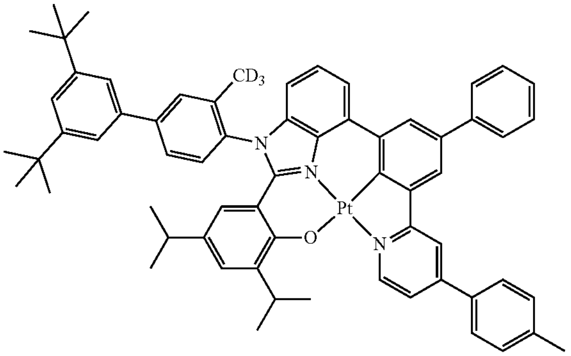

-continued
1366
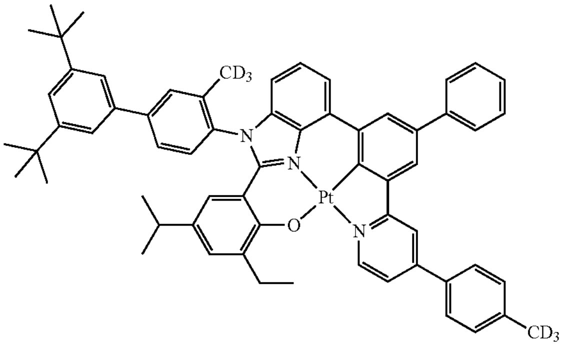
1367
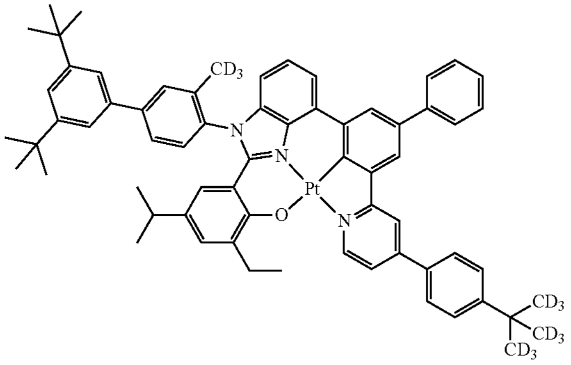
1368
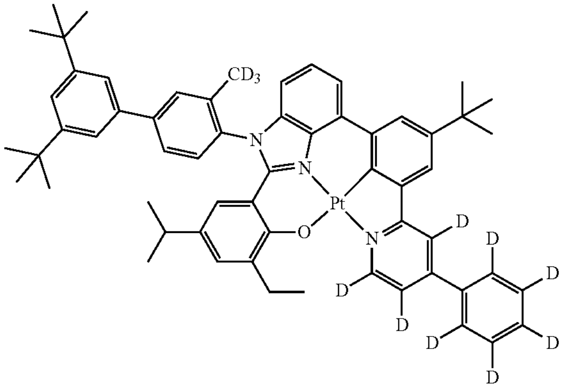
1369
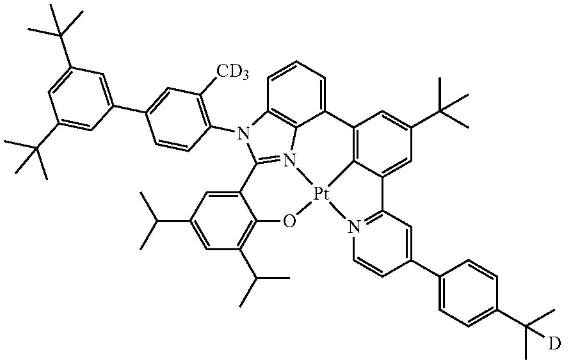
-continued
1370
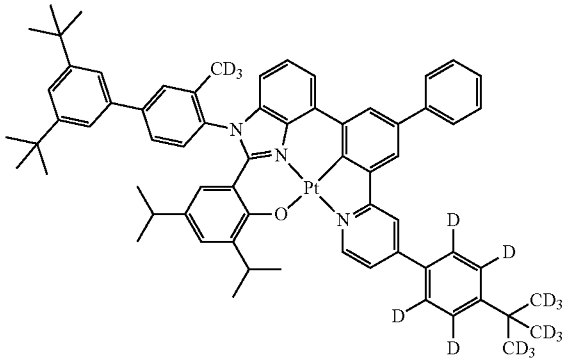
1371
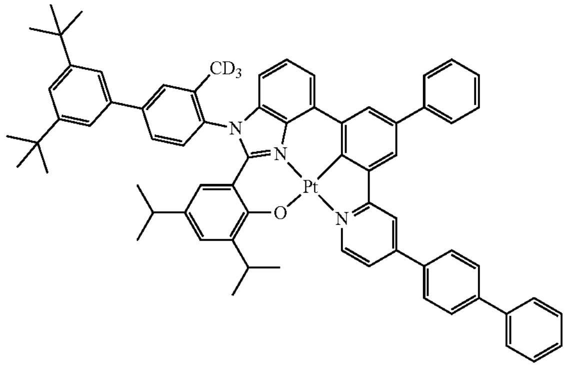
1372
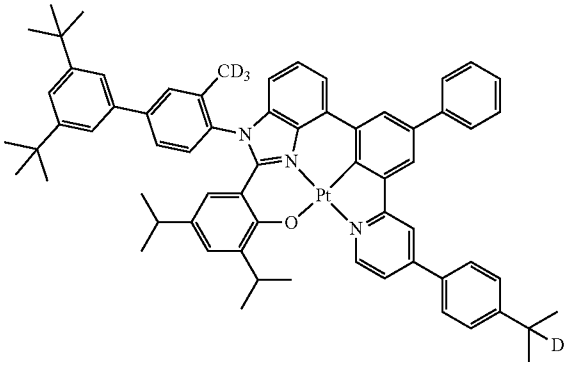
1373
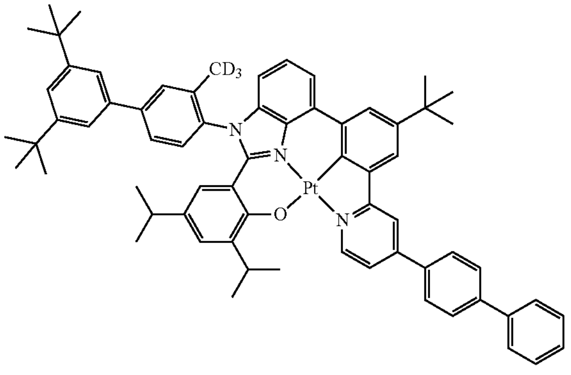

-continued
1374
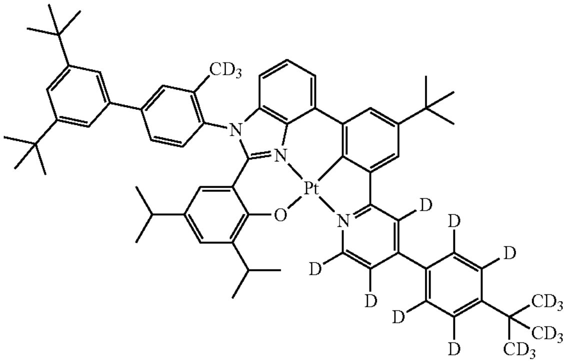
1375
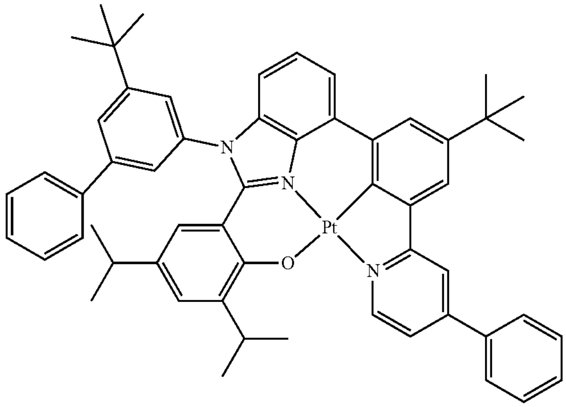
1376
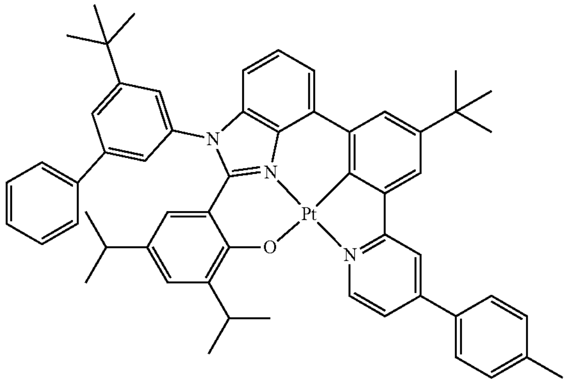
1377
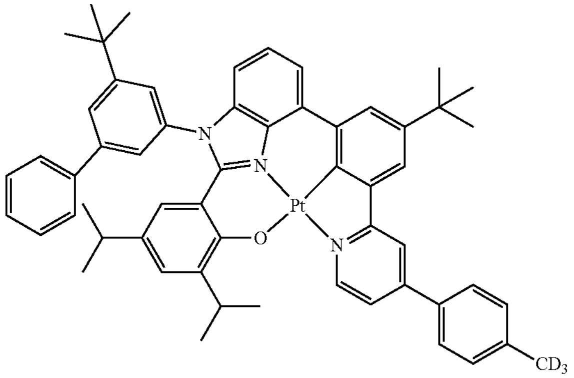
-continued
1378
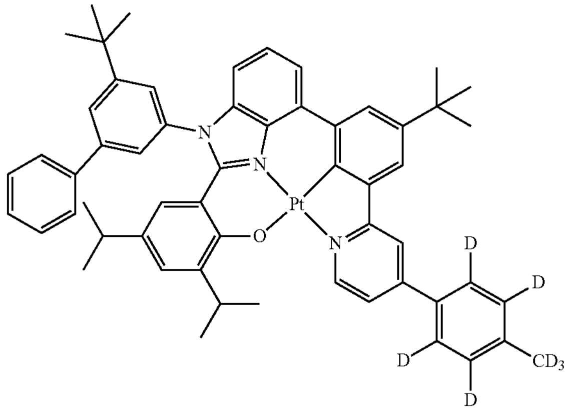
1379
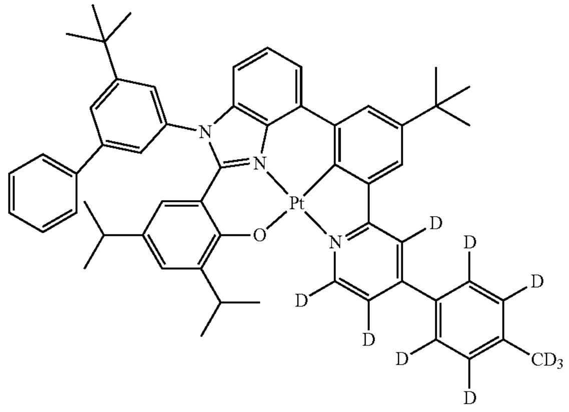
1380
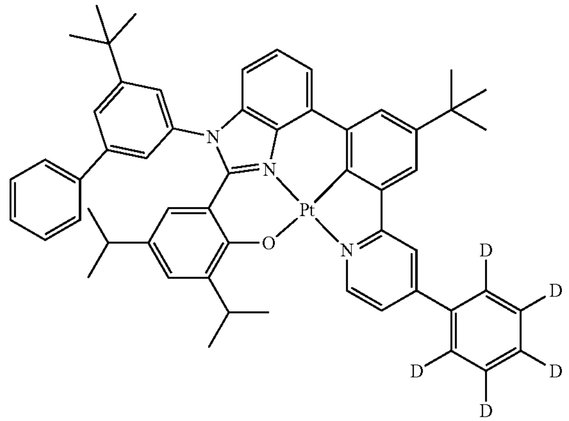

1381
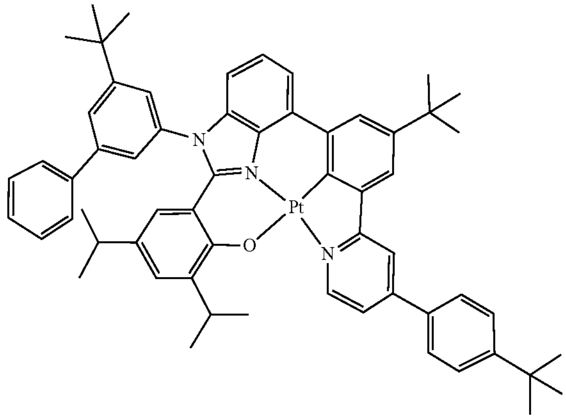
1382
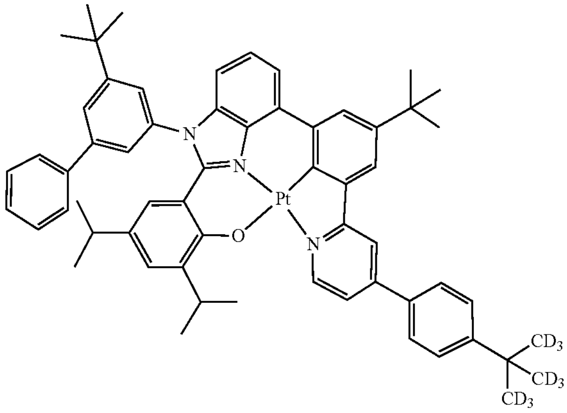
1383
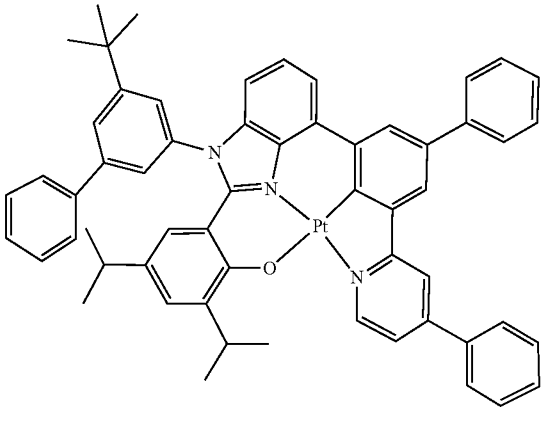
-continued
1384
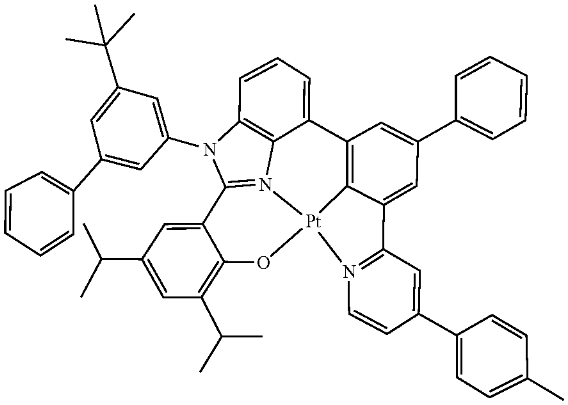
1385
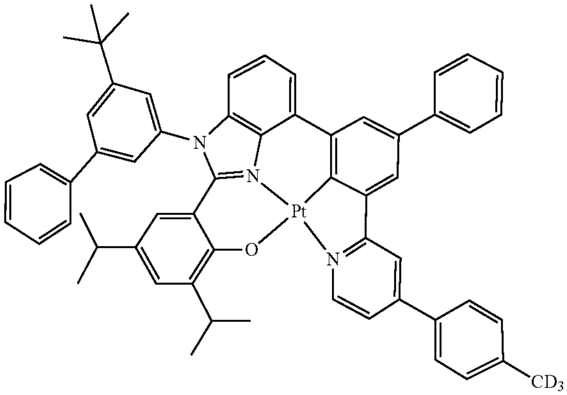
1386
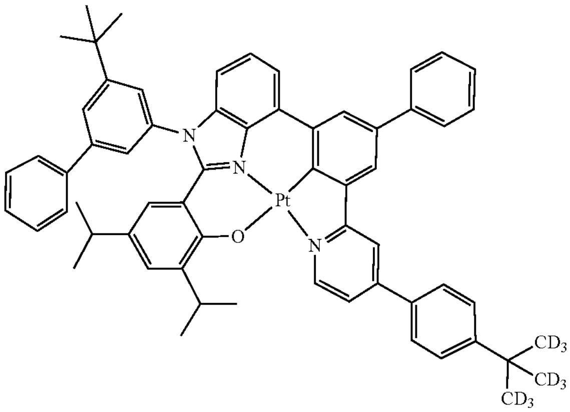

-continued
1387
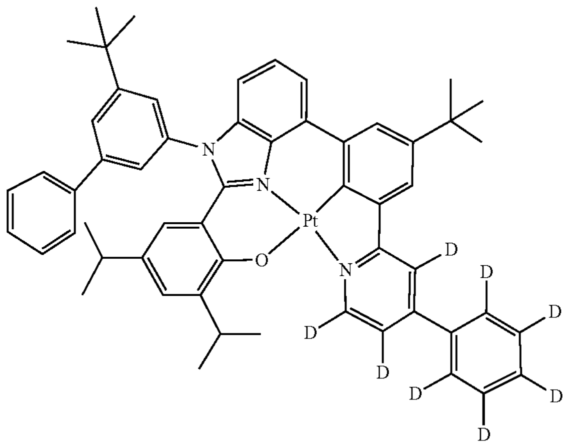
1388
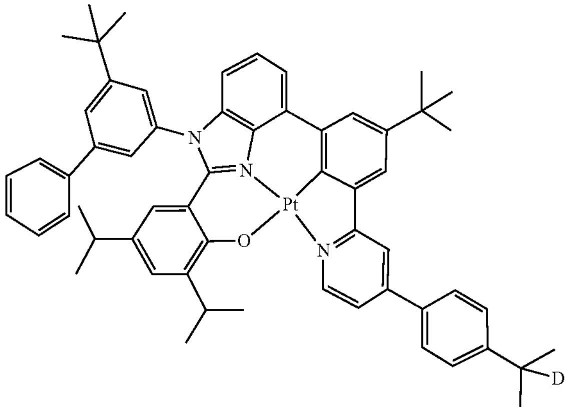
1389
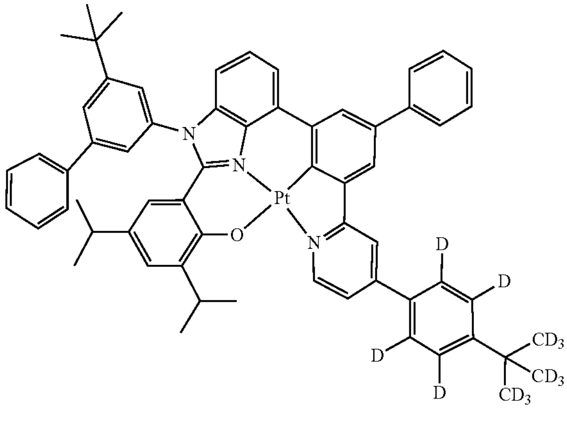
-continued
1390
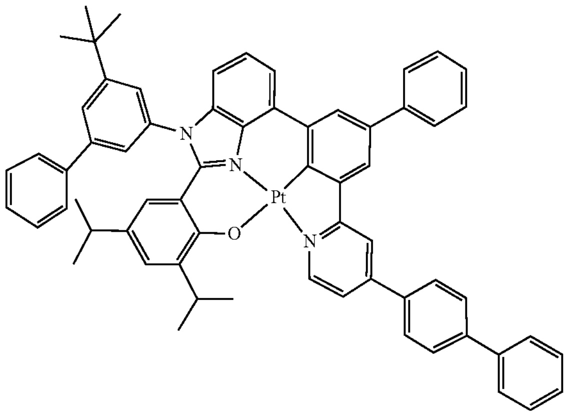
1391
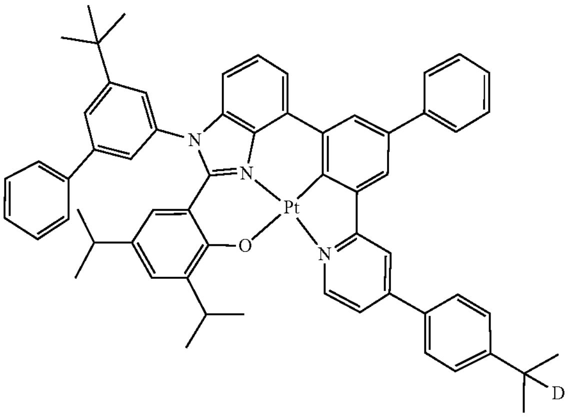
1392
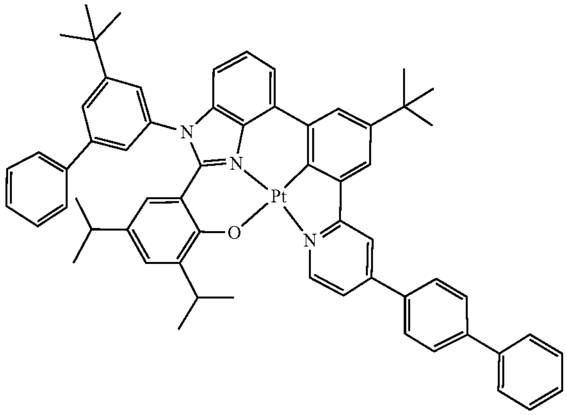

-continued
1393
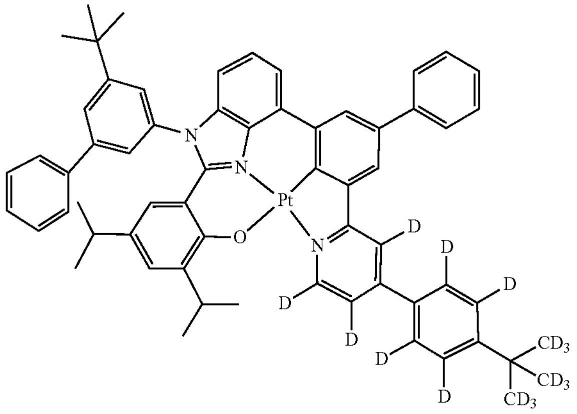
1394
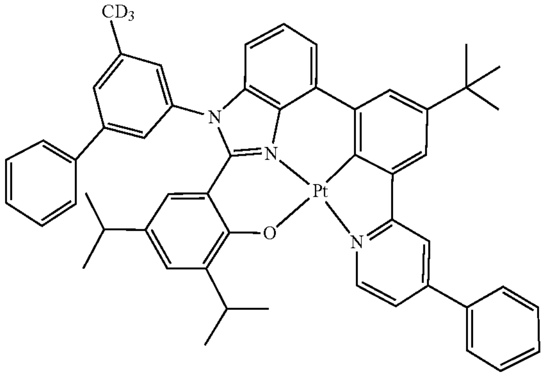
1395
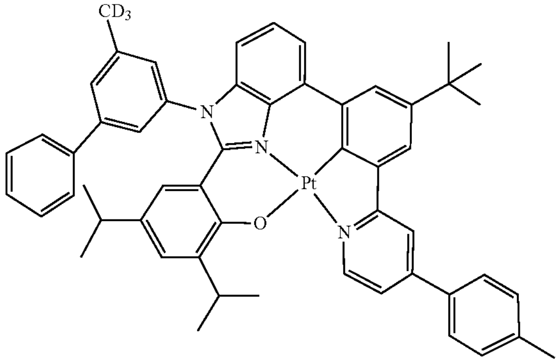
1396
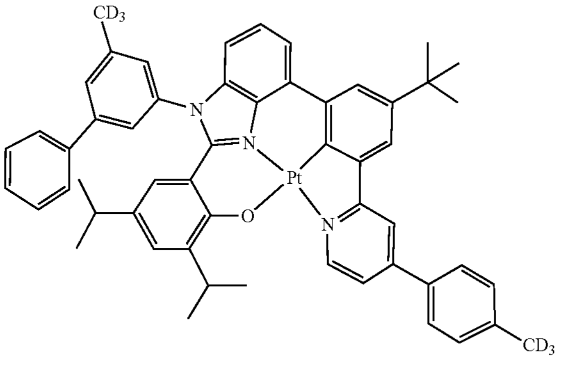
-continued
1397
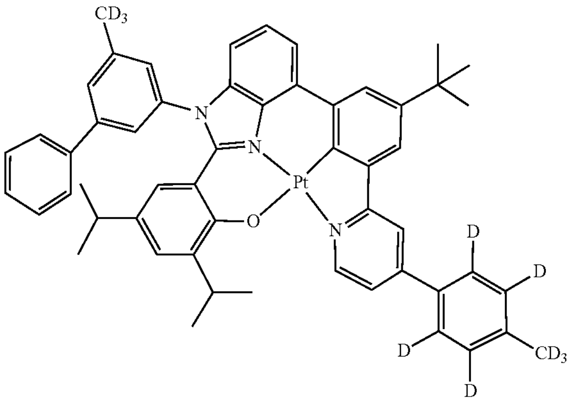
1398
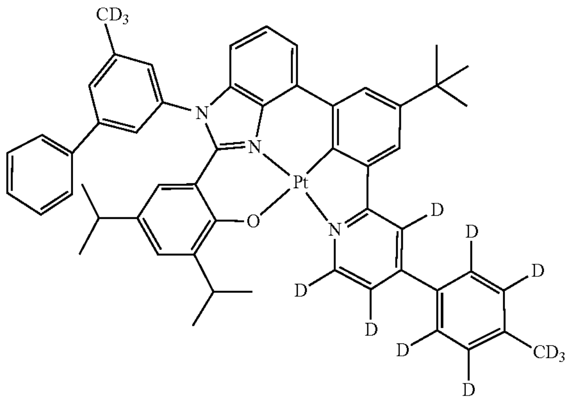
1399
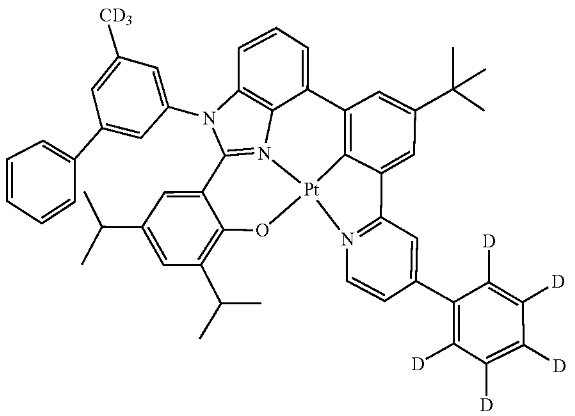

-continued
1400
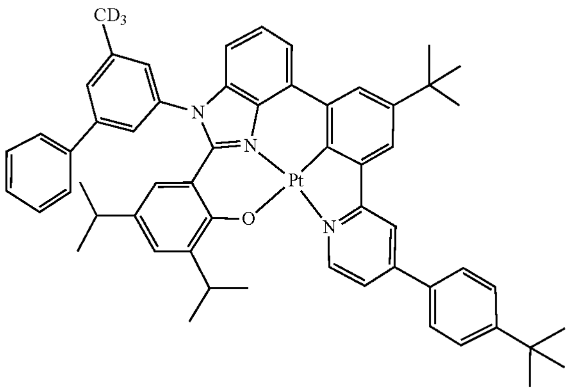
1401
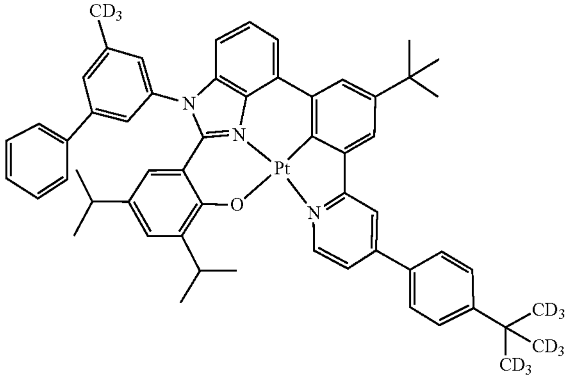
1402
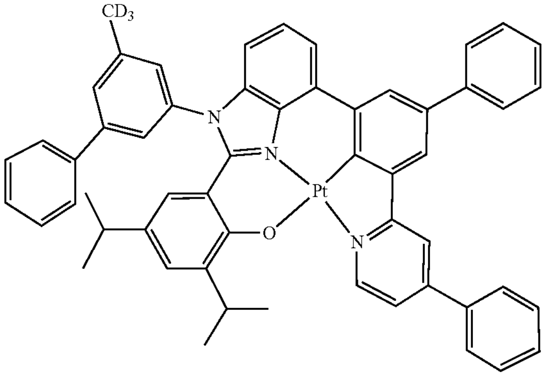
1403
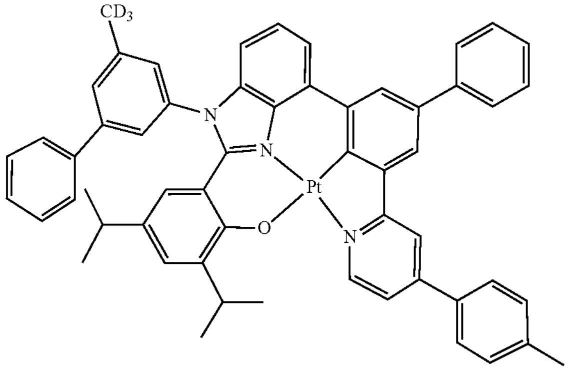
-continued
1404
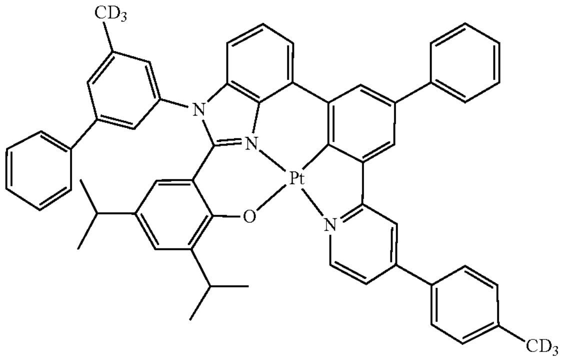
1405
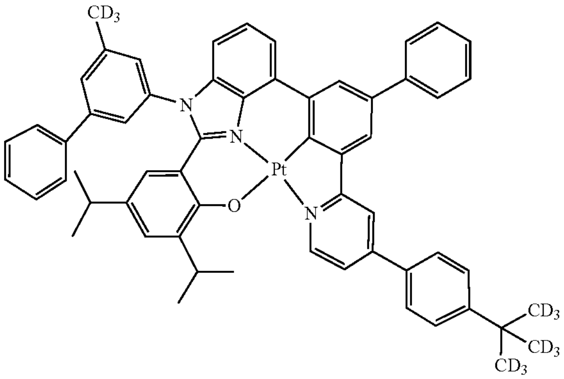
1406
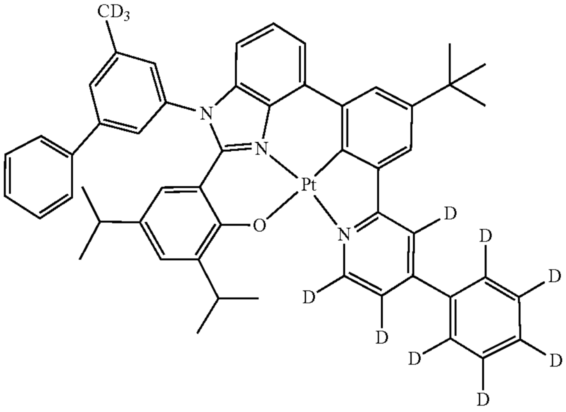
1407
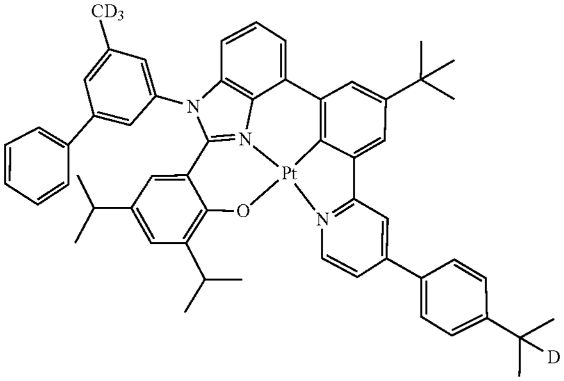

-continued
1408
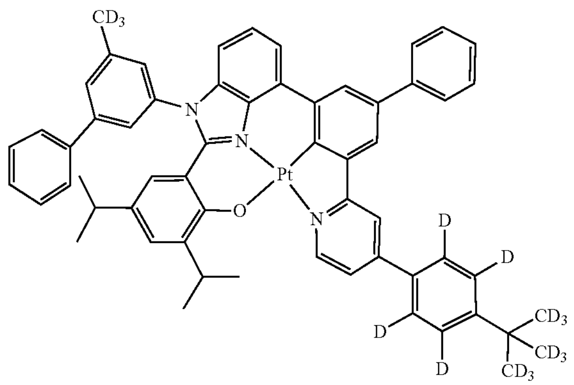
1409
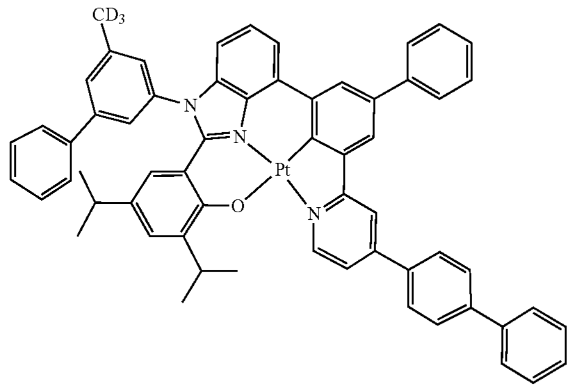
1410
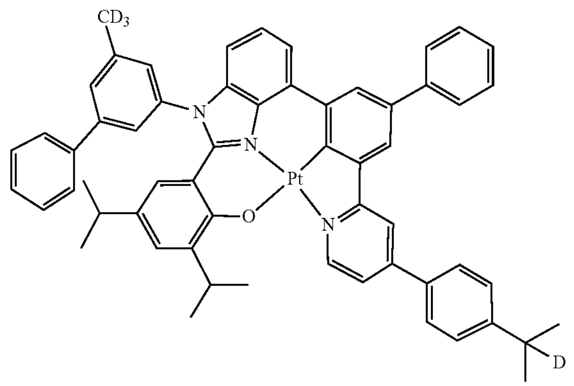
1411
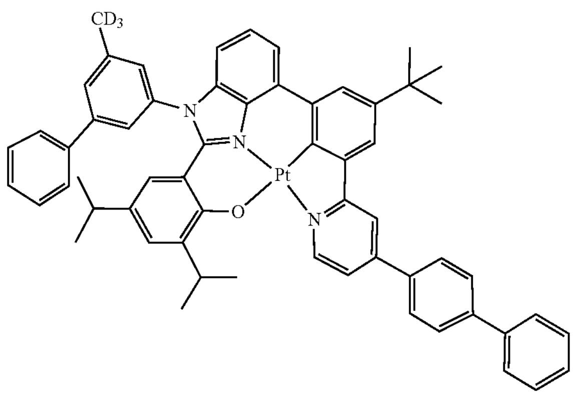
-continued
1412
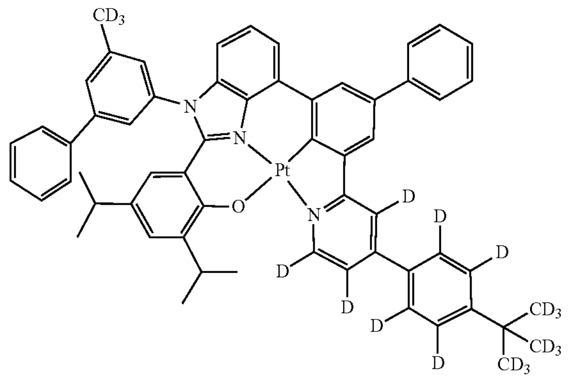
1413
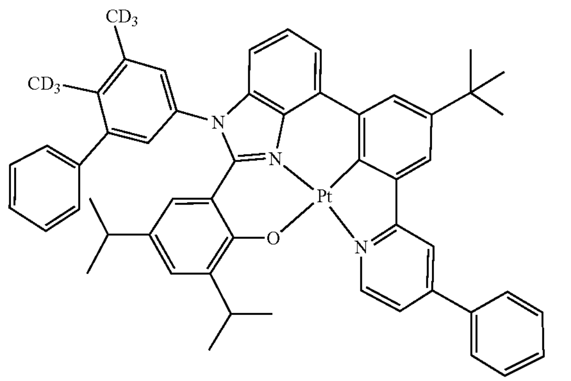
1414
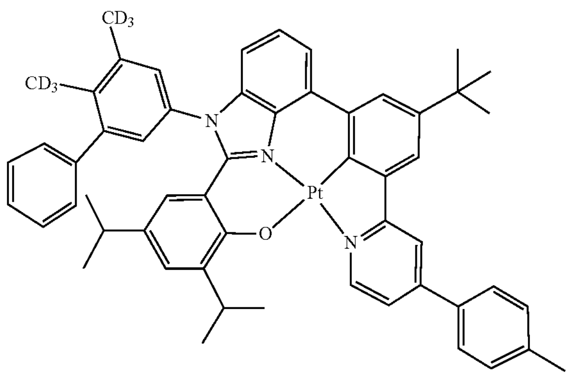
1415
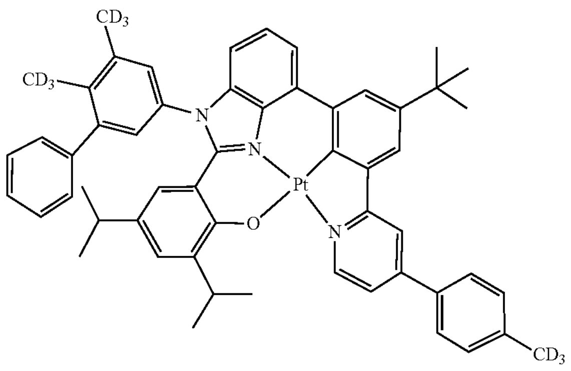

-continued
1416
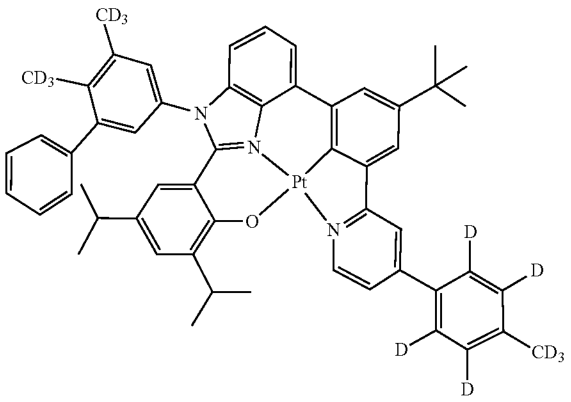
1417
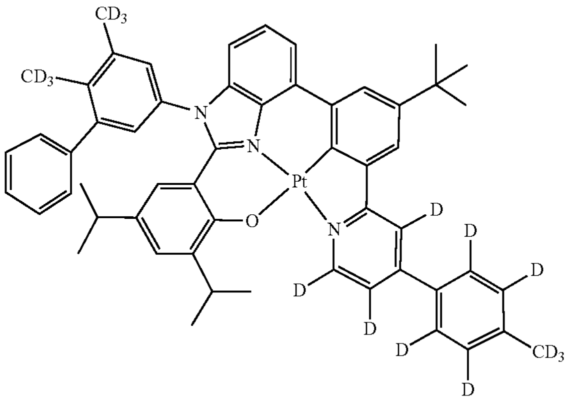
1418
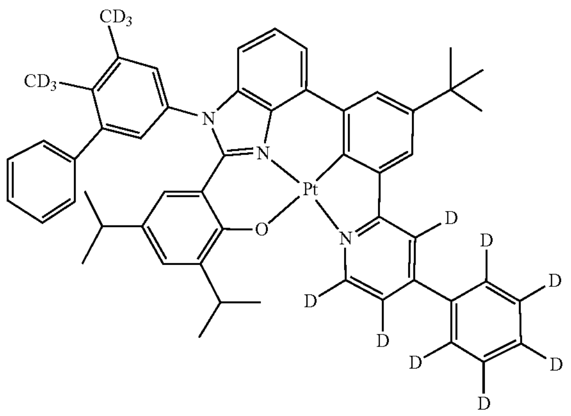
-continued
1419
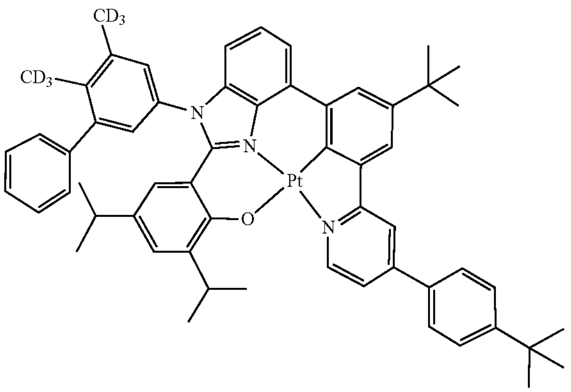
1420
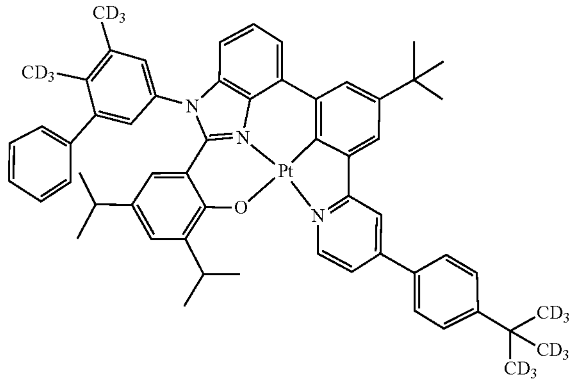
1421
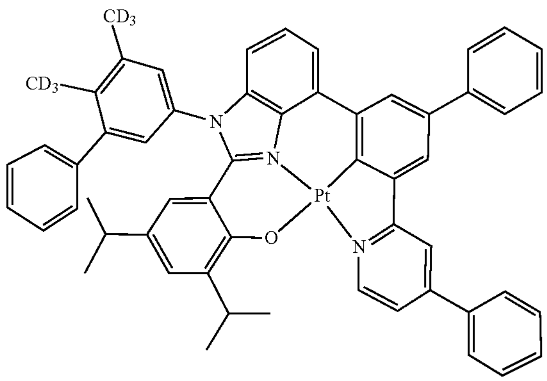
1422
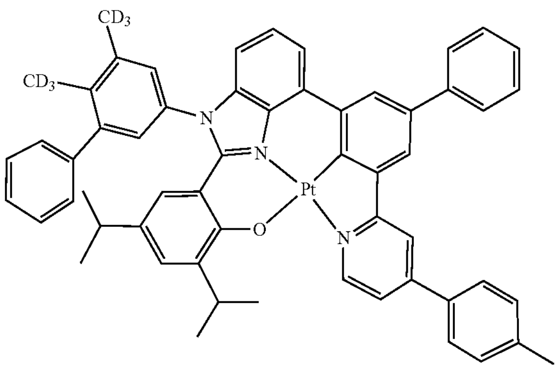

-continued
1423
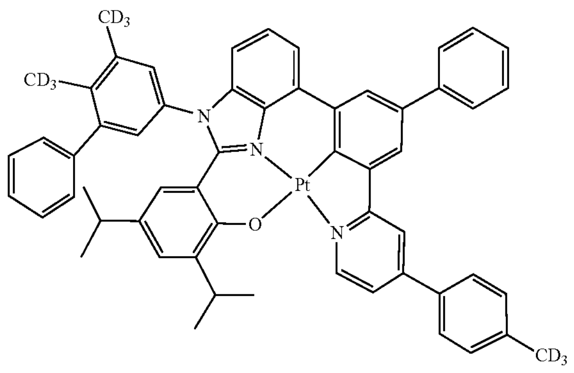
1424
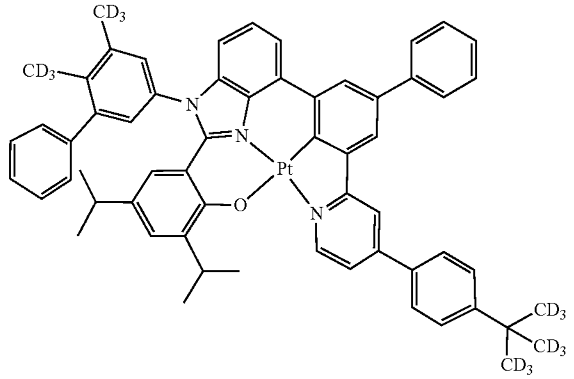
1425
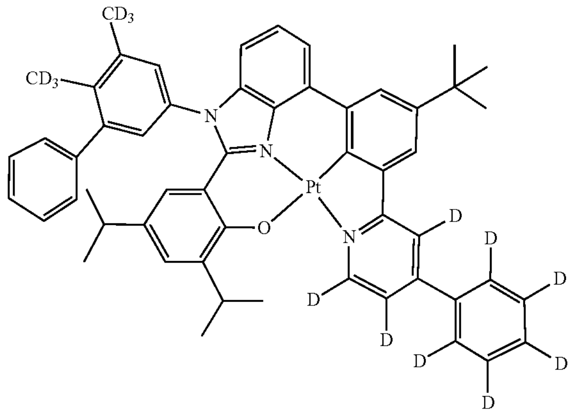
1426
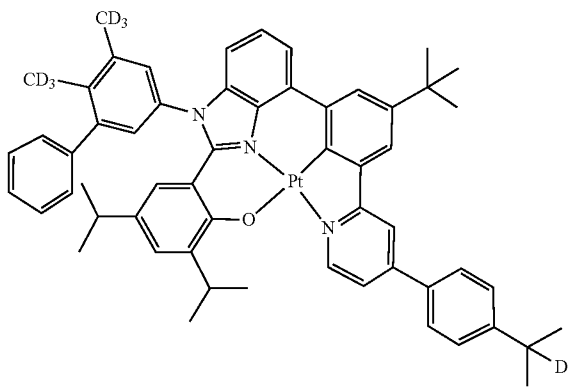
-continued
1427
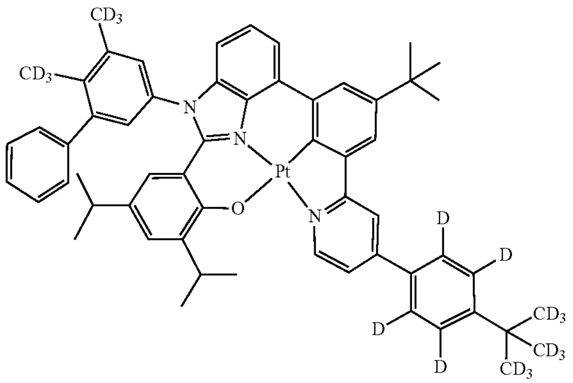
1428
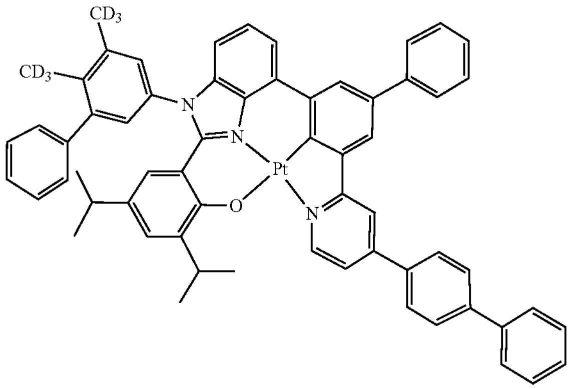
1429
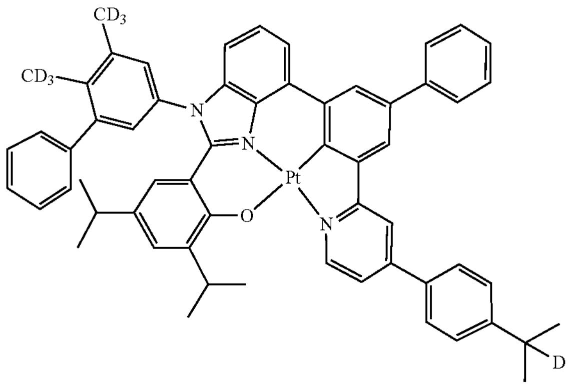
1430
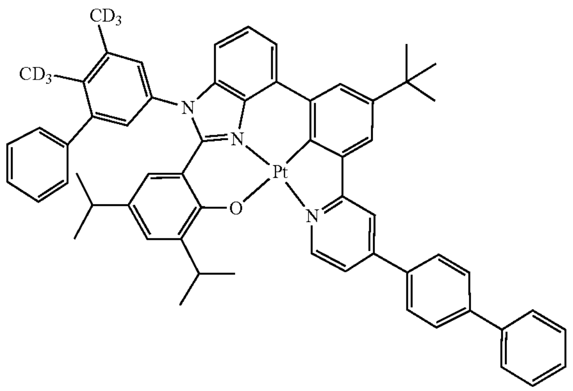

-continued
1431
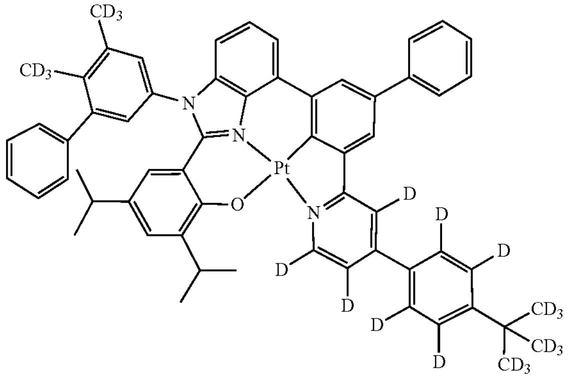
1432
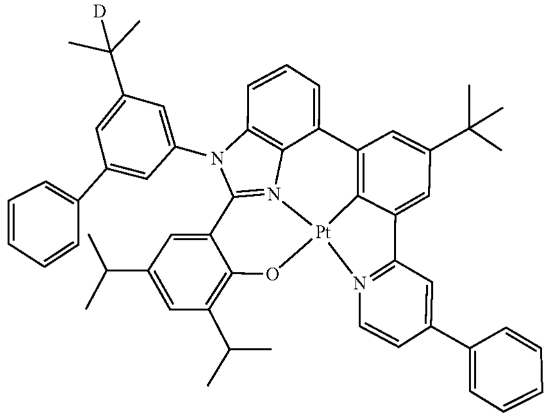
1433
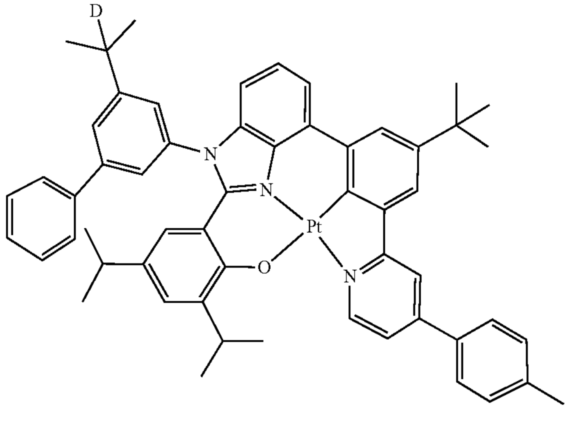
-continued
1434
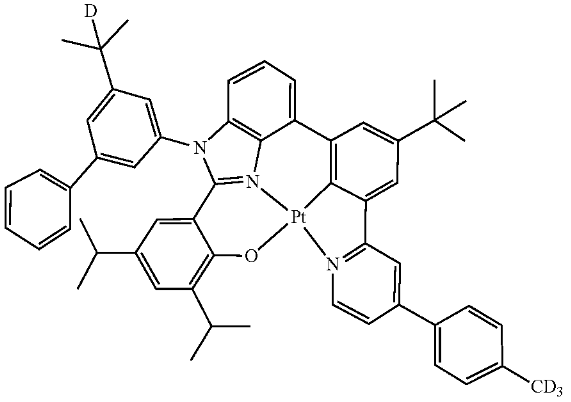
1435
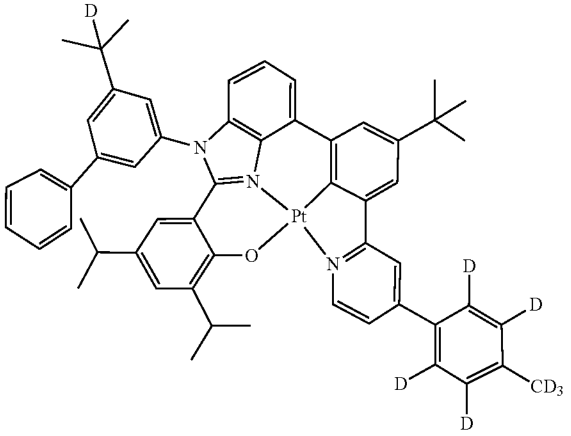
1436
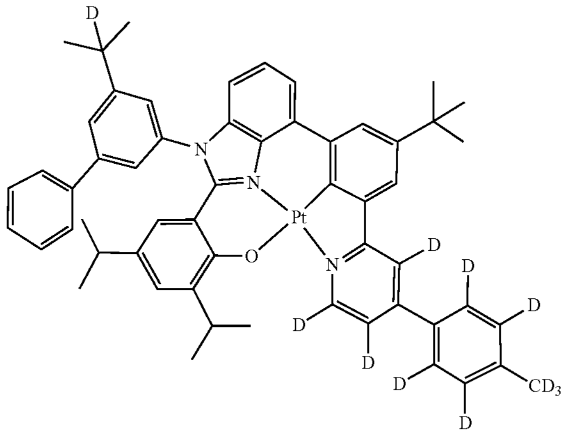

-continued
1437
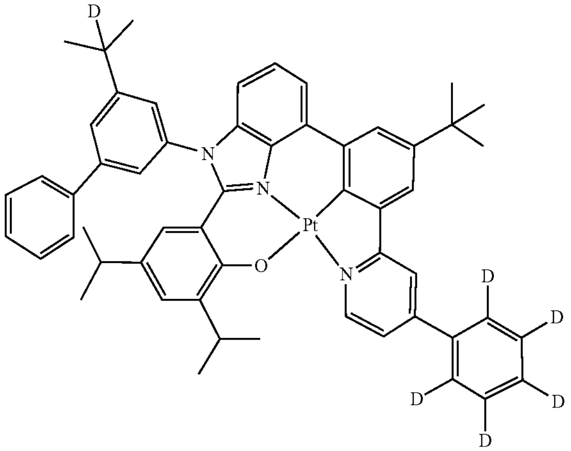
1438
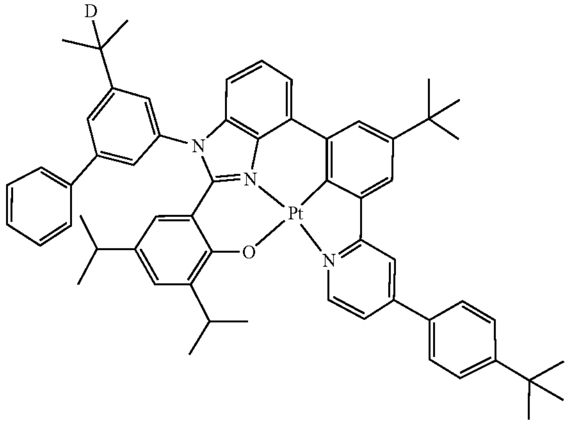
1439
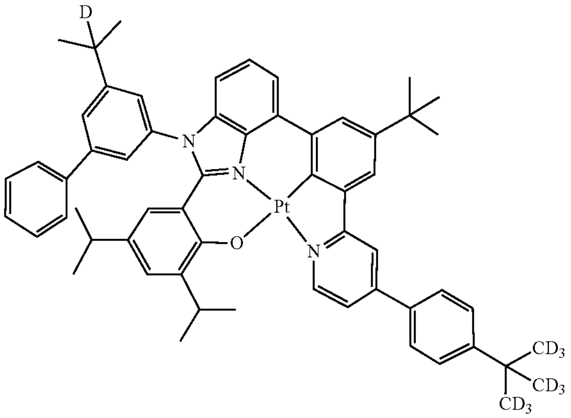
-continued
1440
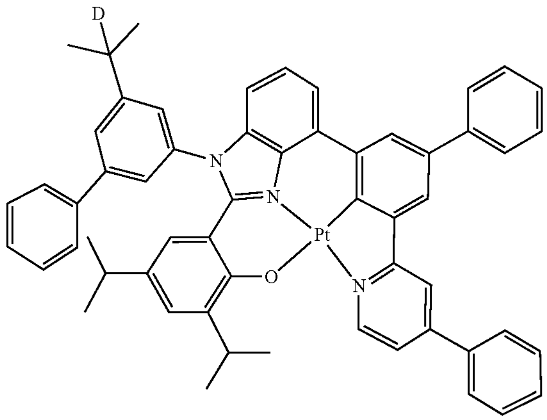
1441
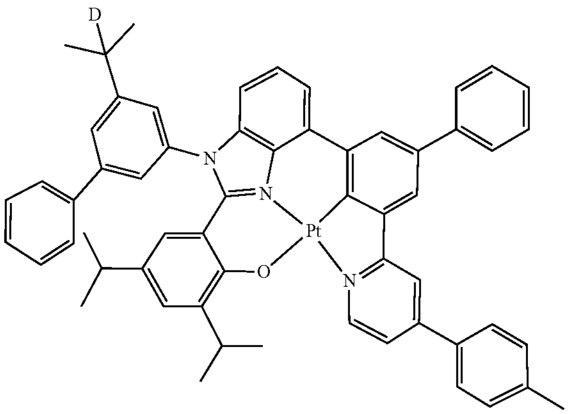
1442
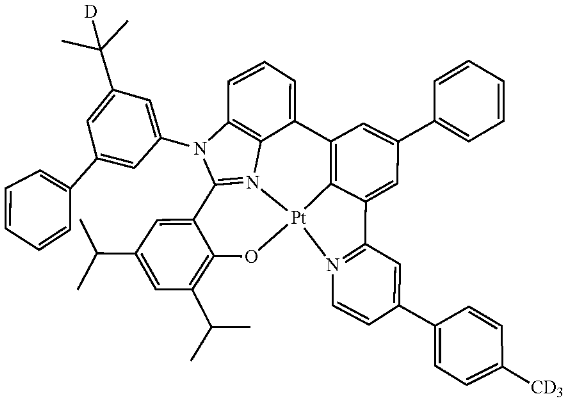

-continued
1443
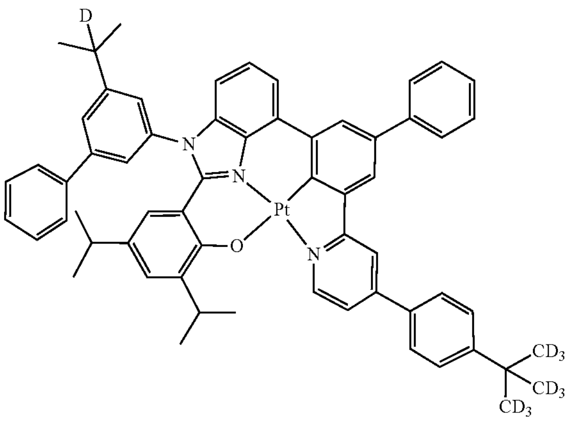
1444
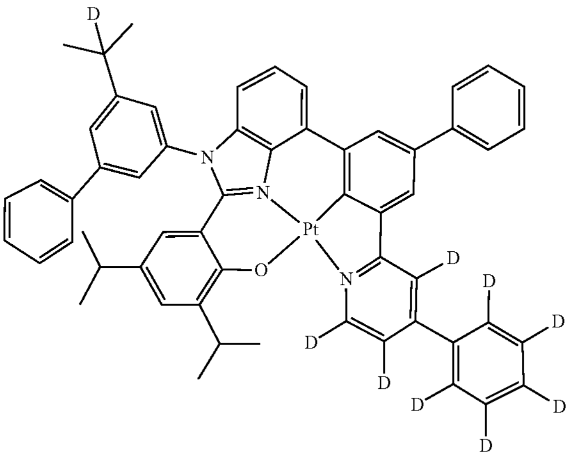
1445
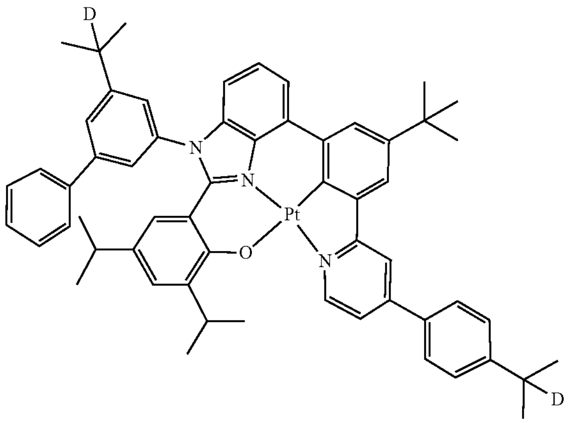
-continued
1446
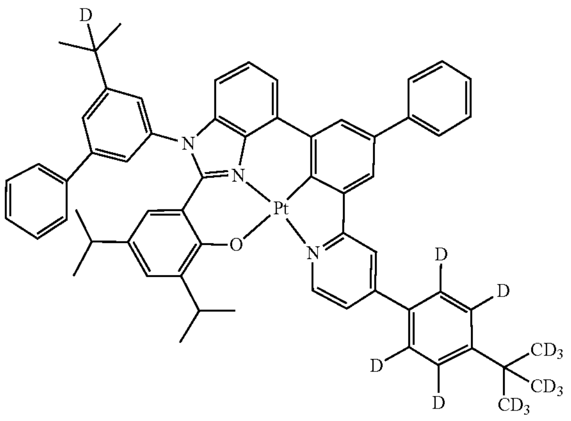
1447
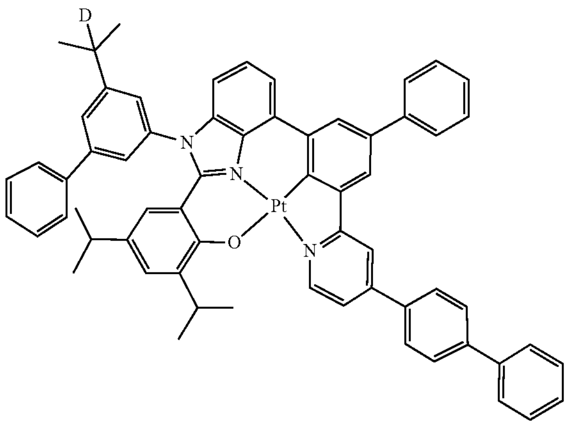
1448
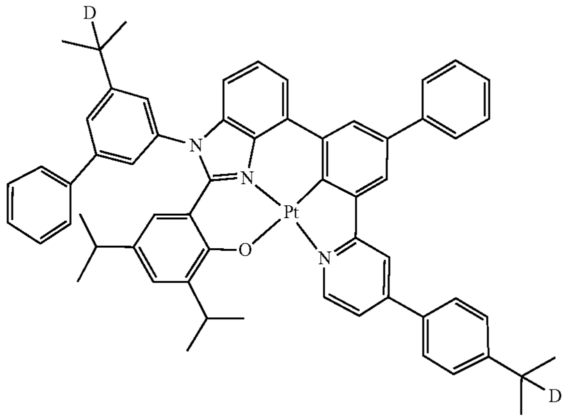

-continued
1449
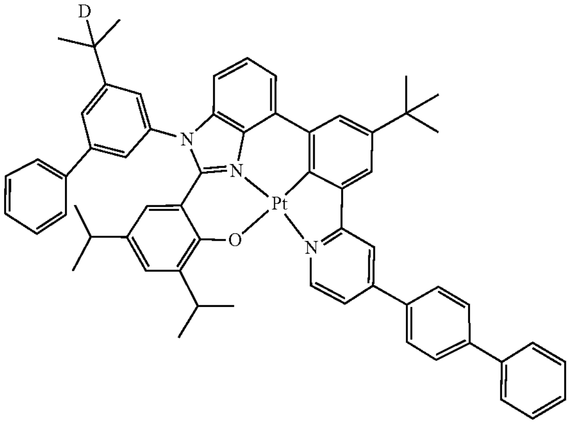
1450
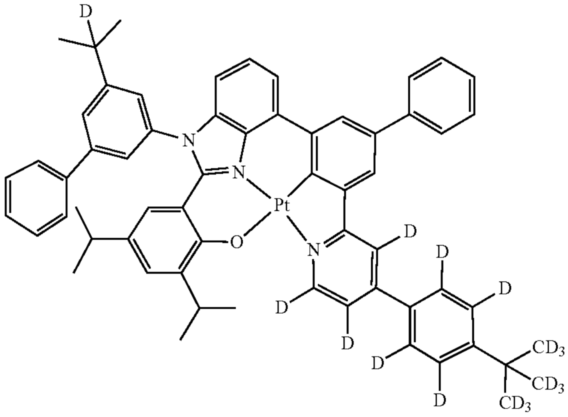
1451
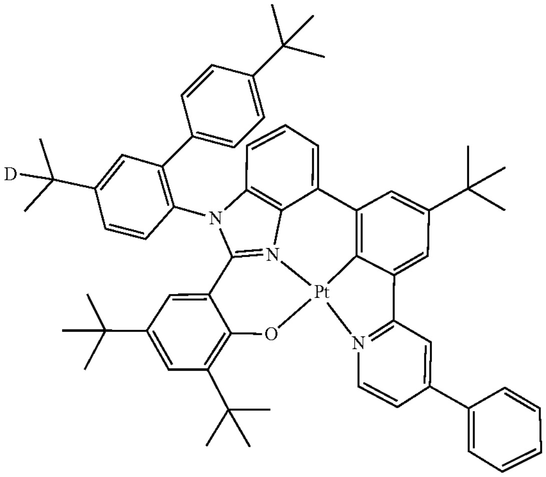
-continued
1452
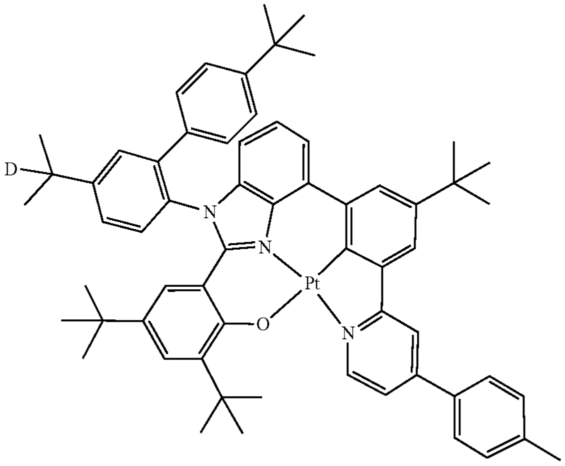
1453
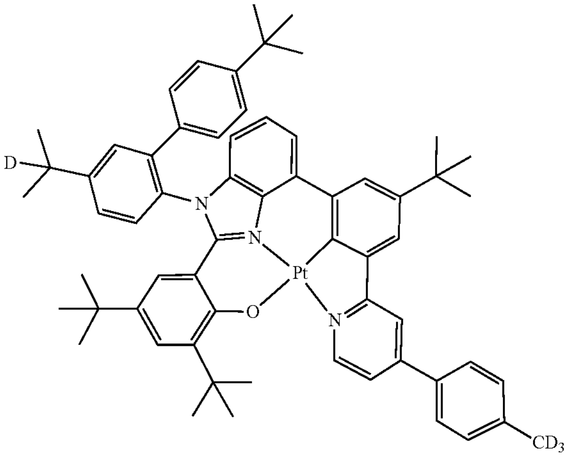
1454
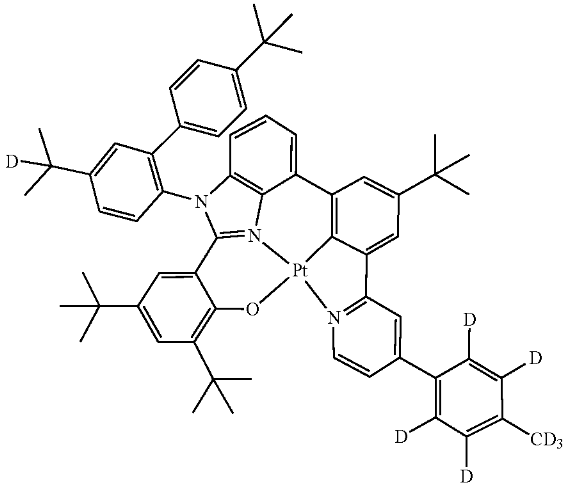

-continued
1455
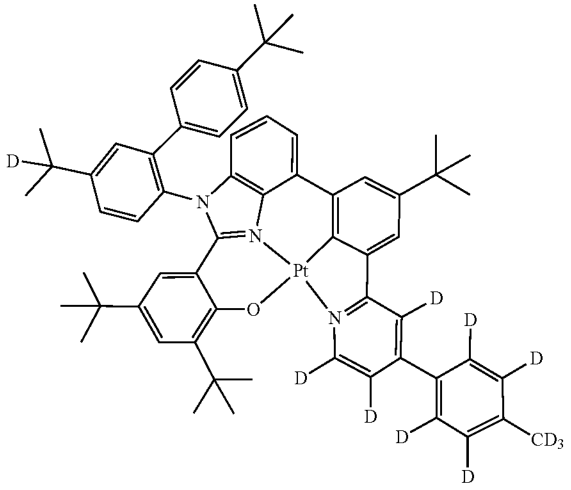
1456
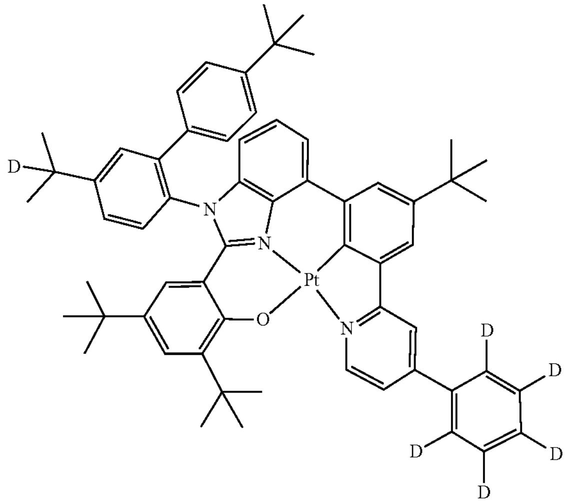
1457
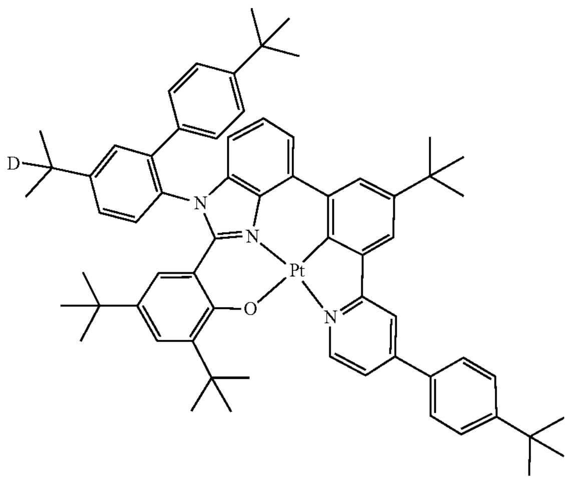
-continued
1458
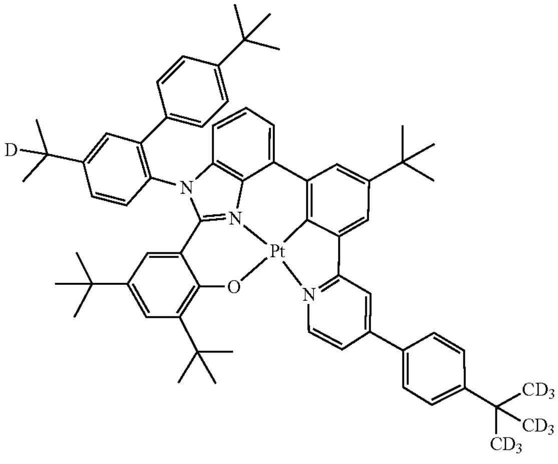
1459
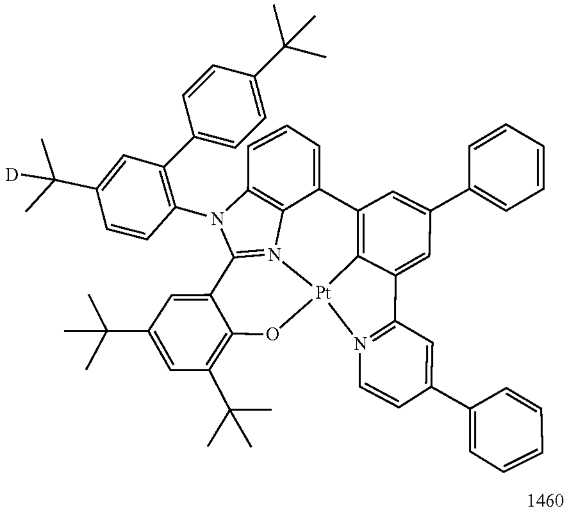
1460
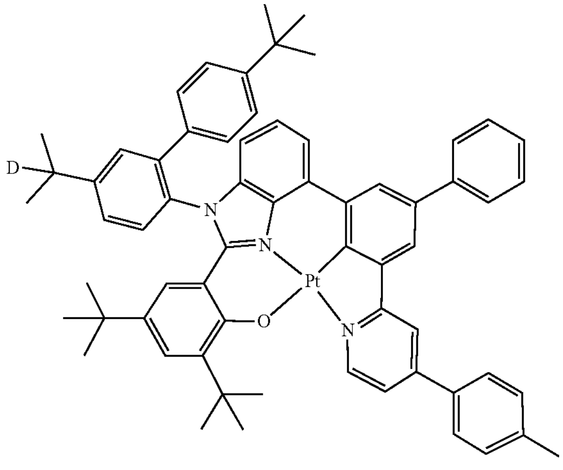

-continued
1461
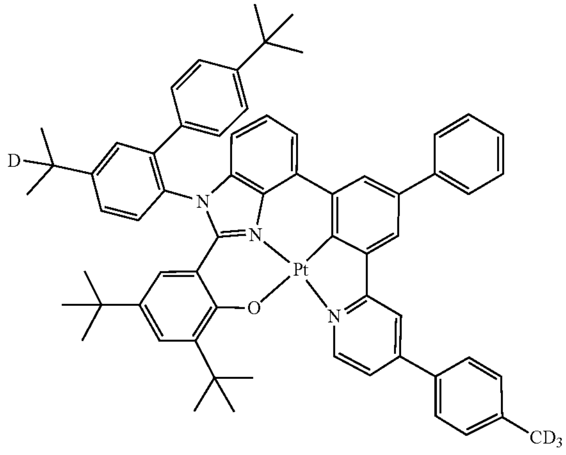
1462
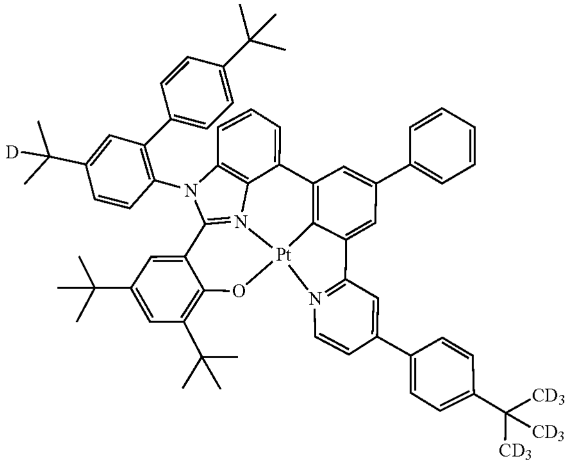
1463
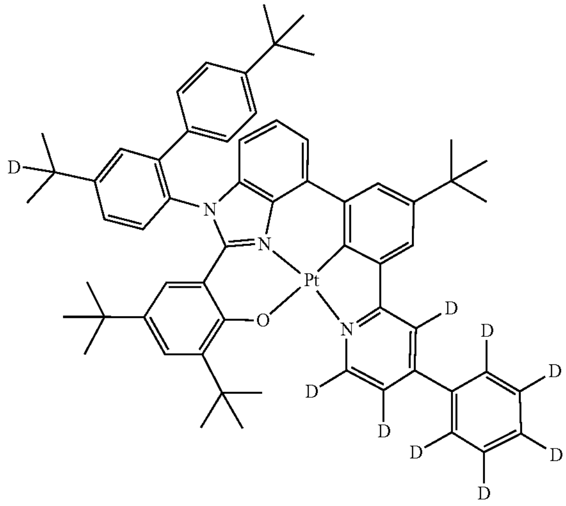
-continued
1464
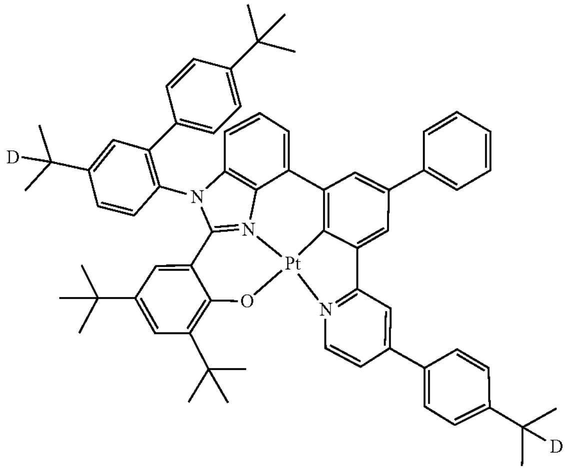
1465
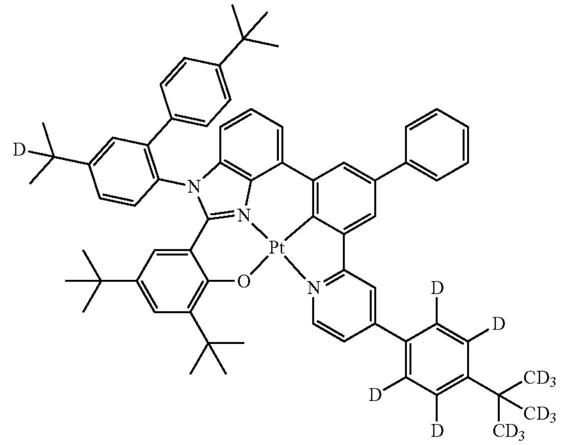
1466
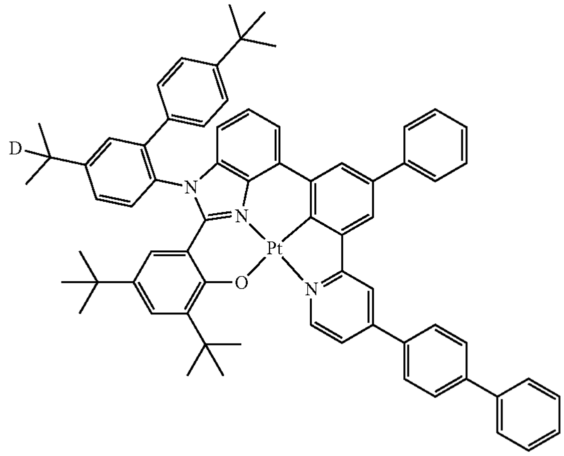

-continued
1467
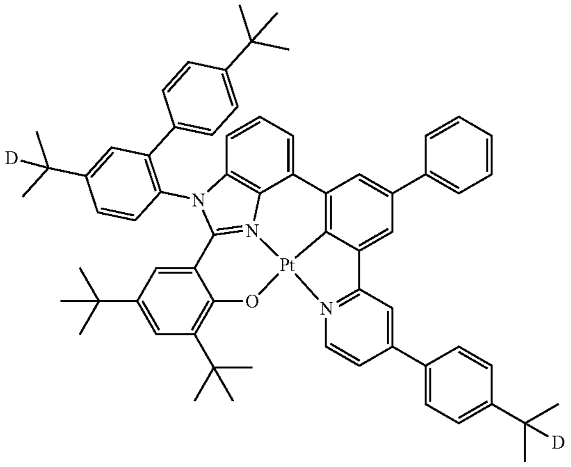
1468
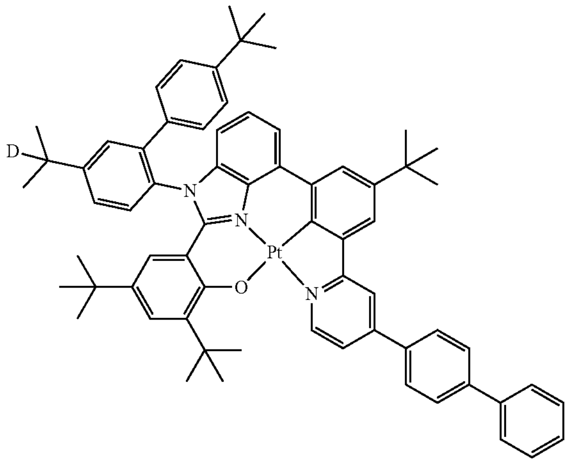
1469
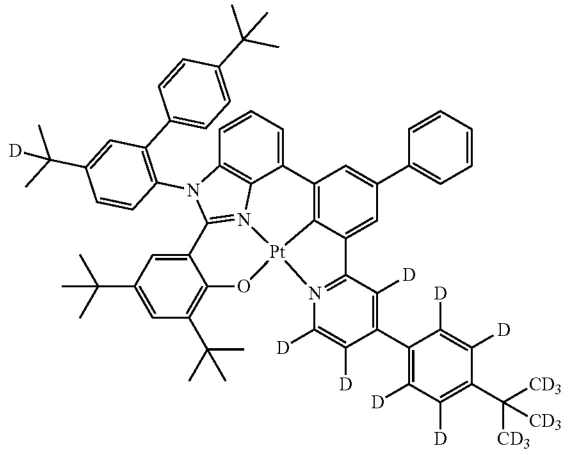
-continued
1470
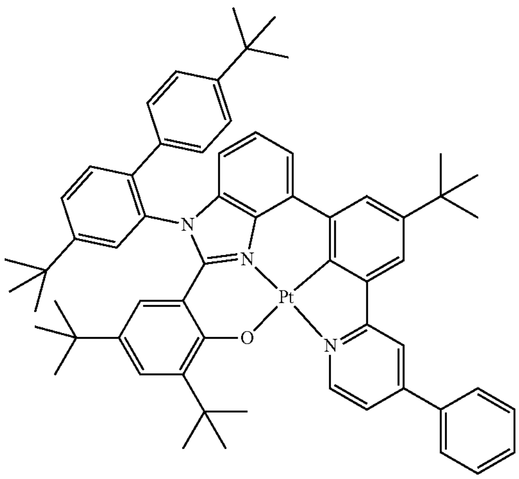
1471
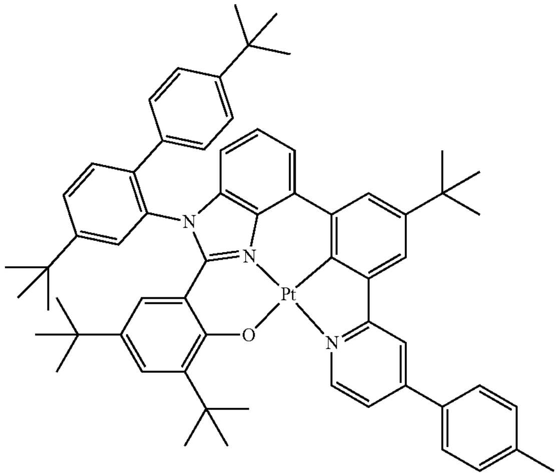
1472
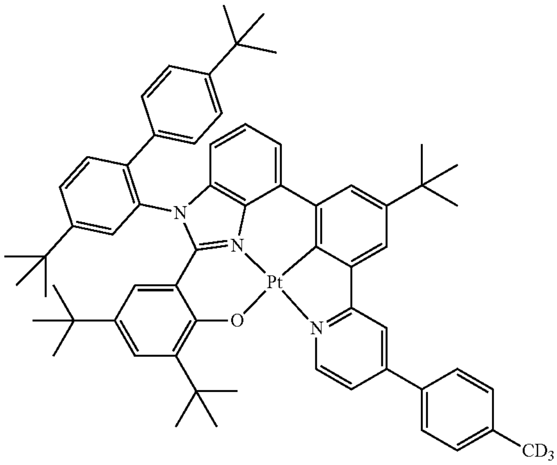

-continued
1473
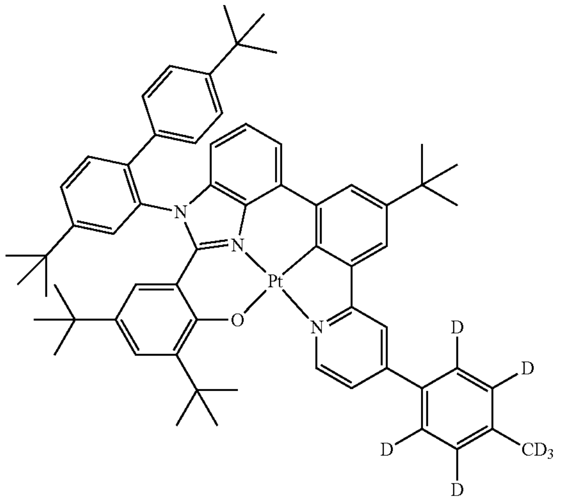
1474
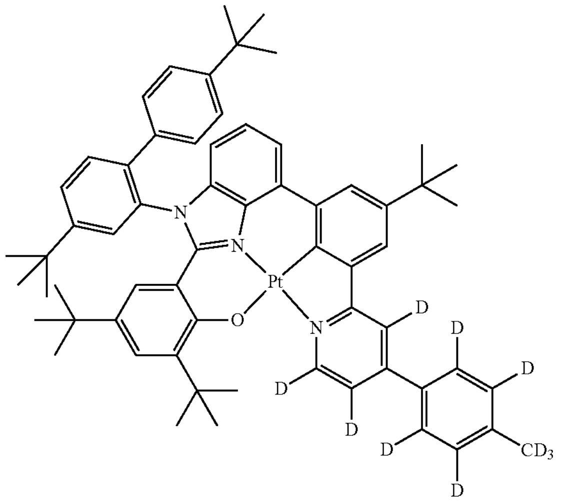
1475
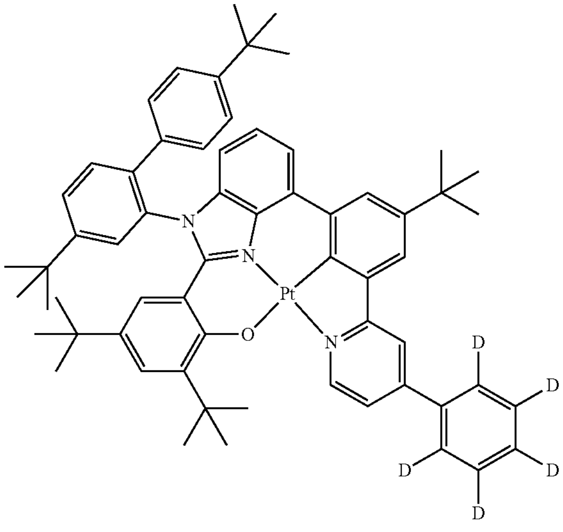
-continued
1476
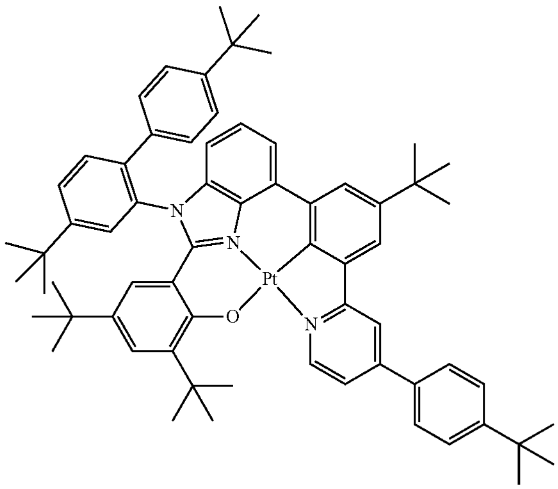
1477
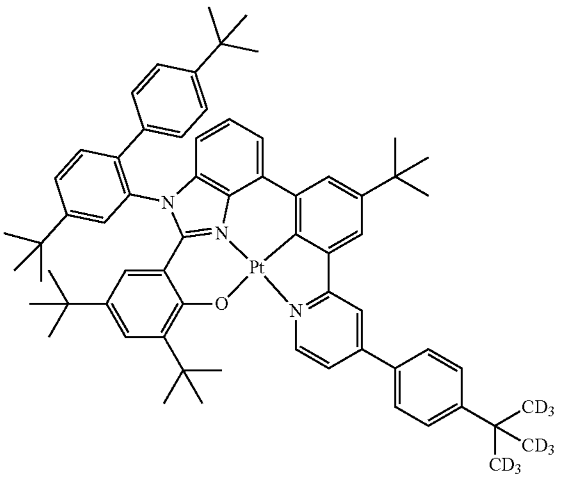
1478
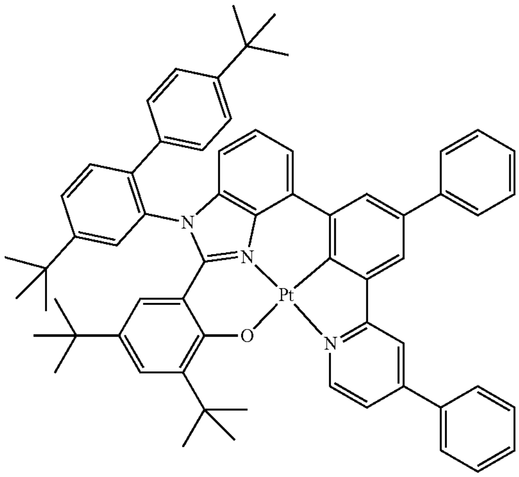

-continued
1479
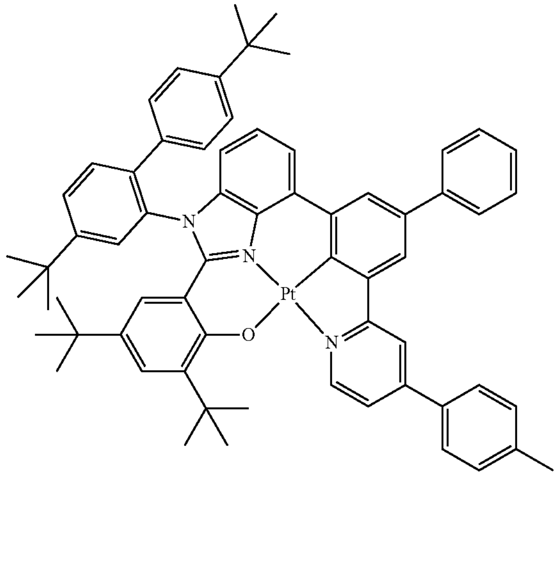
1480
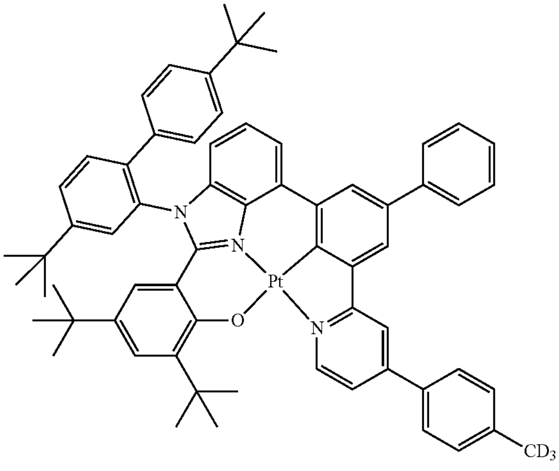
1481
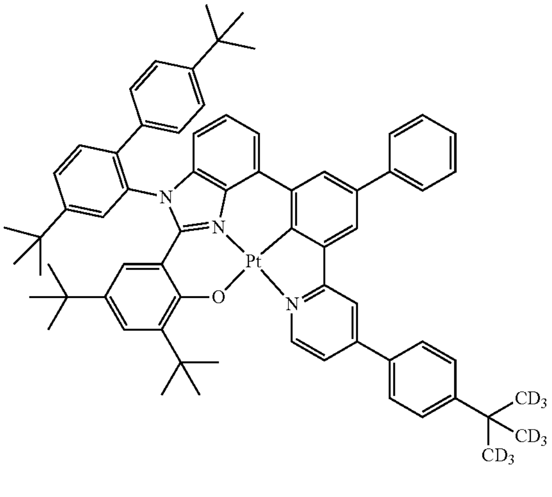
-continued
1482
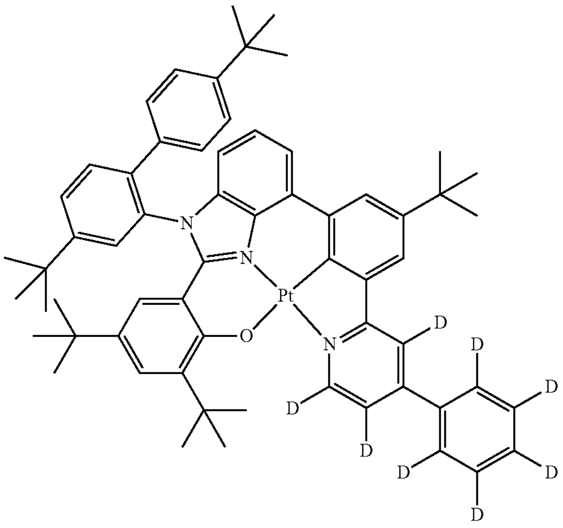
1483
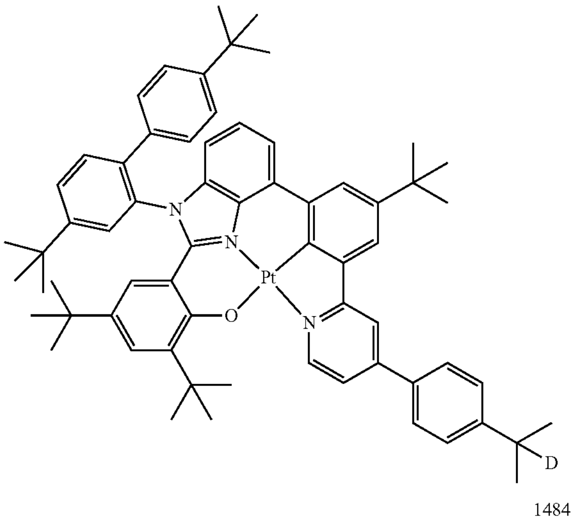
1484
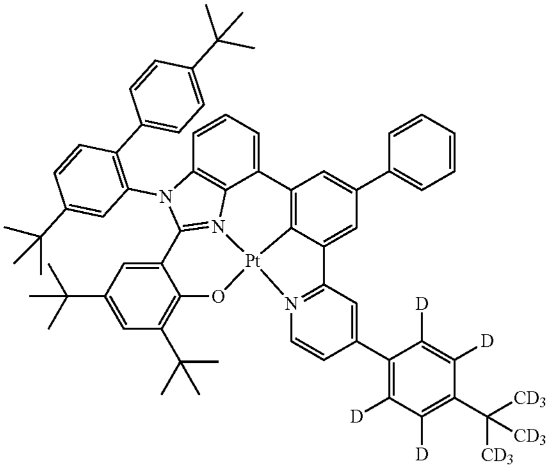

-continued
1485
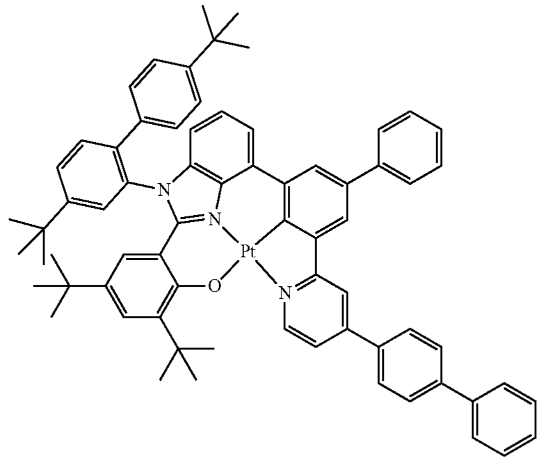
1486
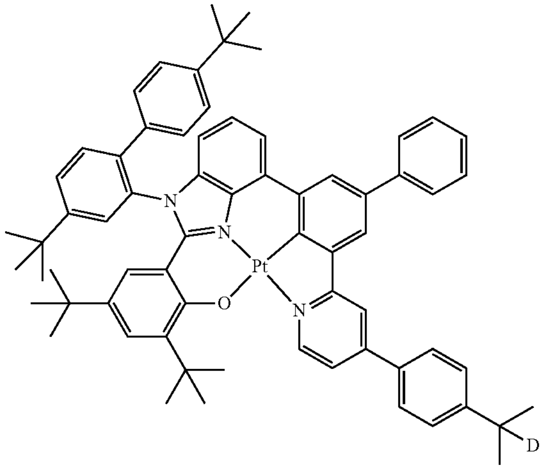
1487
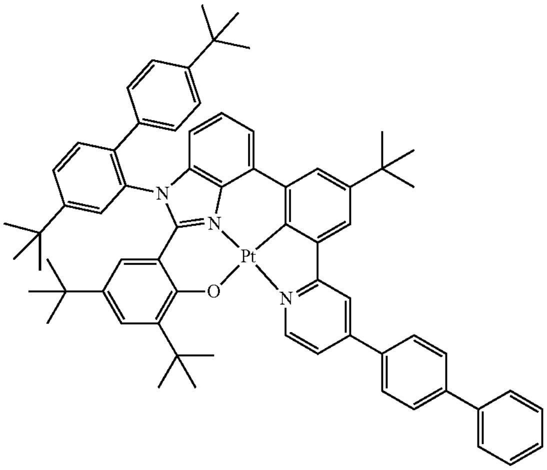
-continued
1488
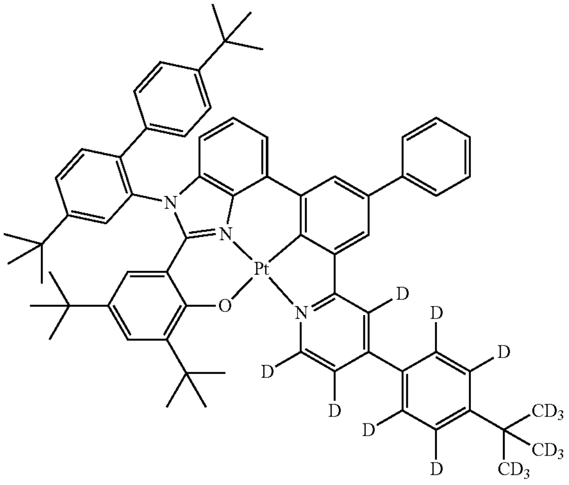
1489
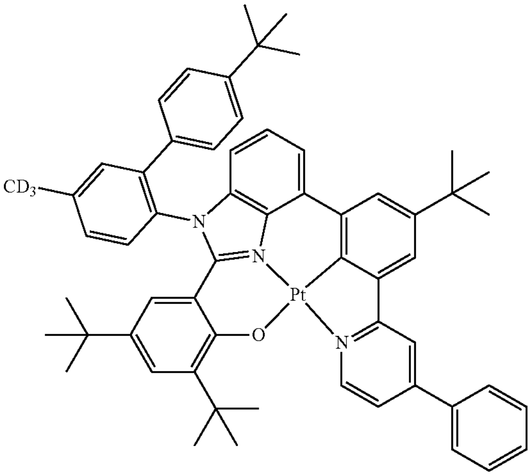
1490
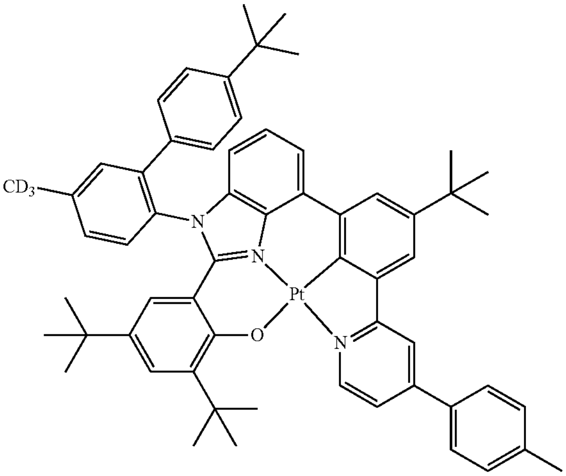

-continued
1491
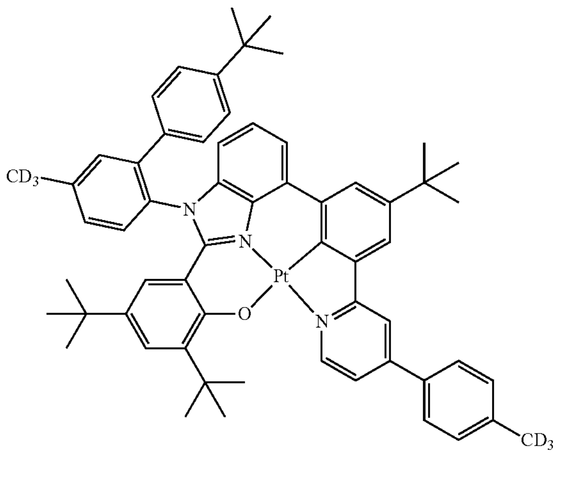
1492
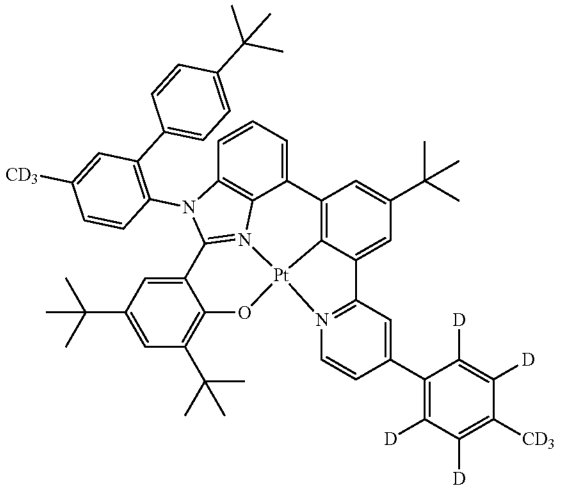
1493
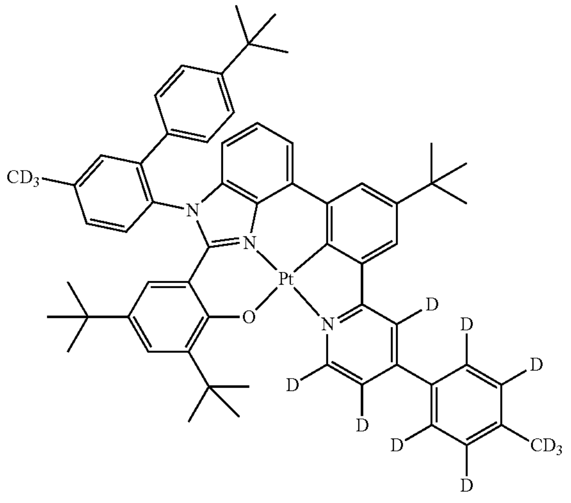
-continued
1494
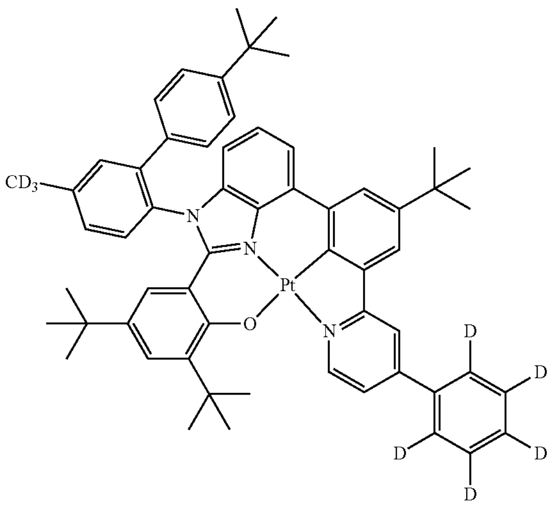
1495
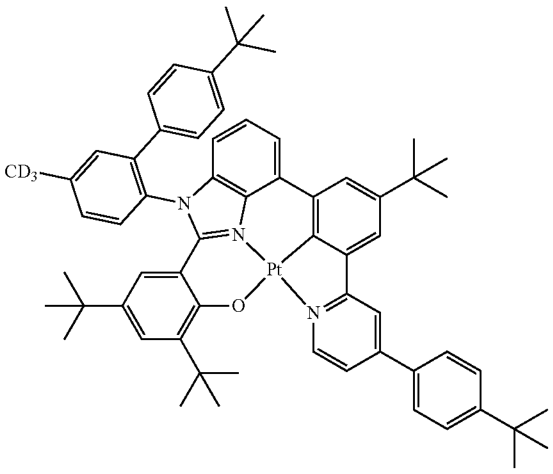
1496
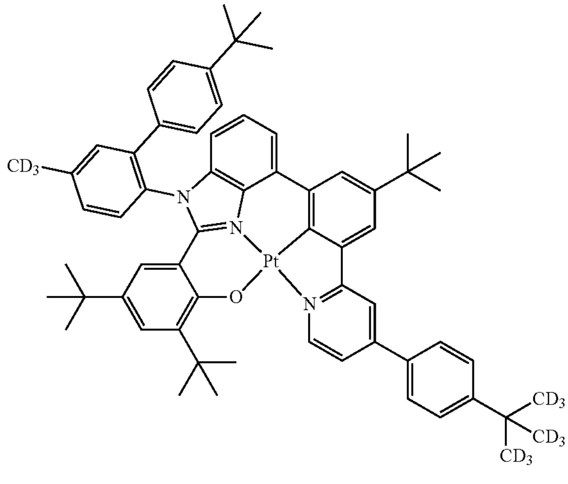

-continued
1497
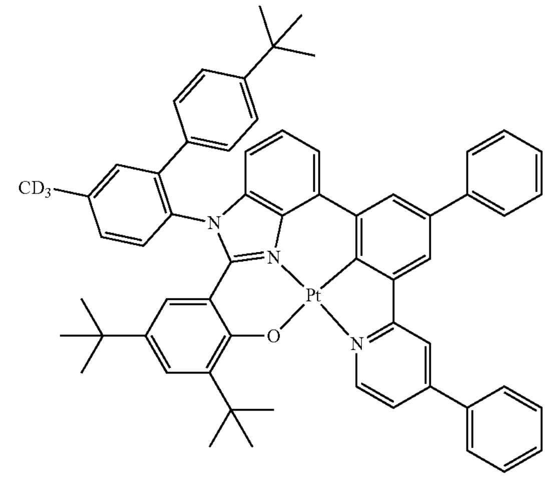
1498
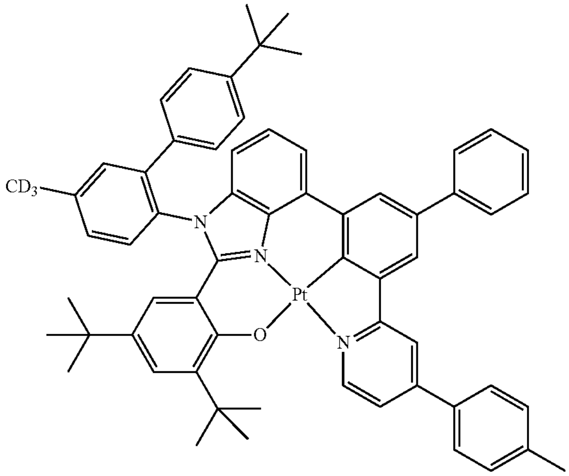
1499
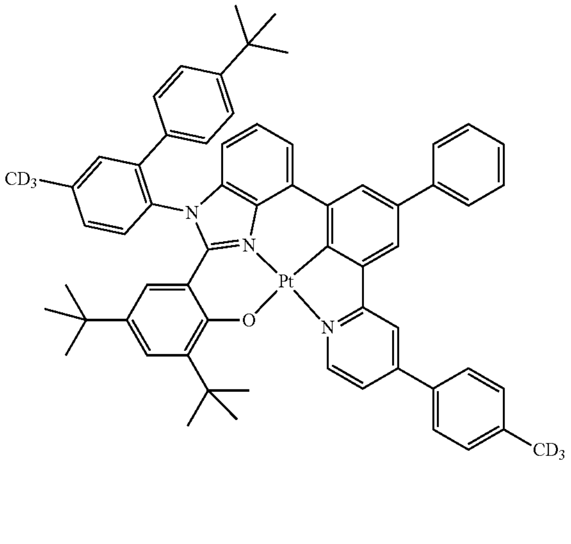
-continued
1500
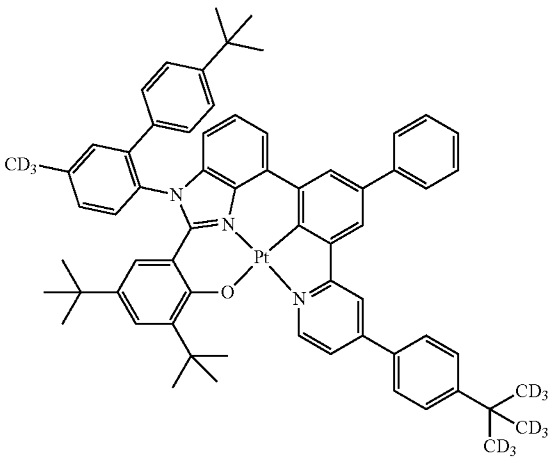
1501
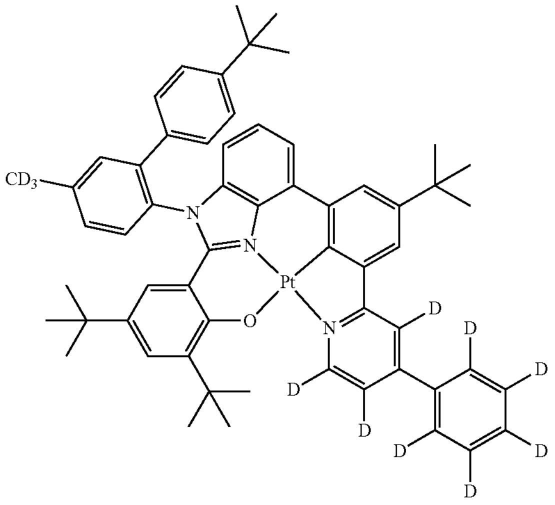
1502
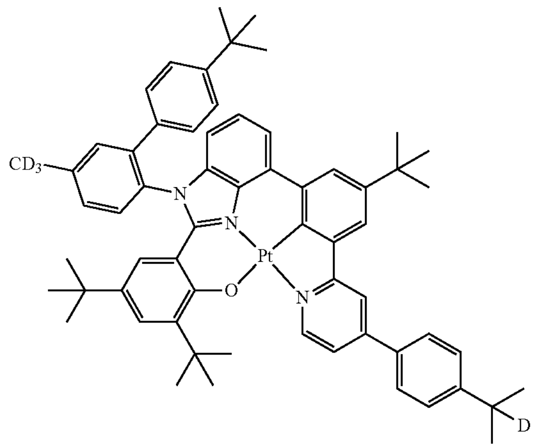

1503
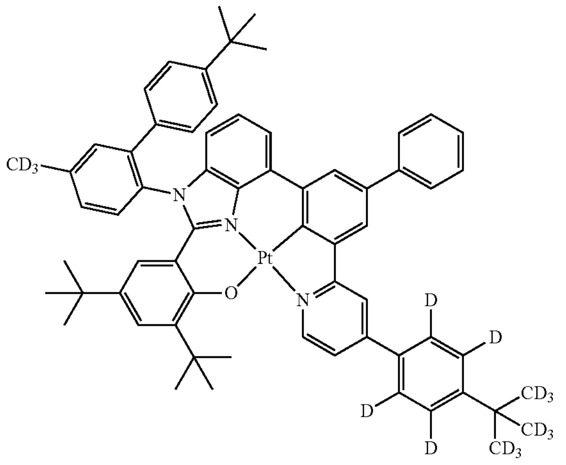
1504
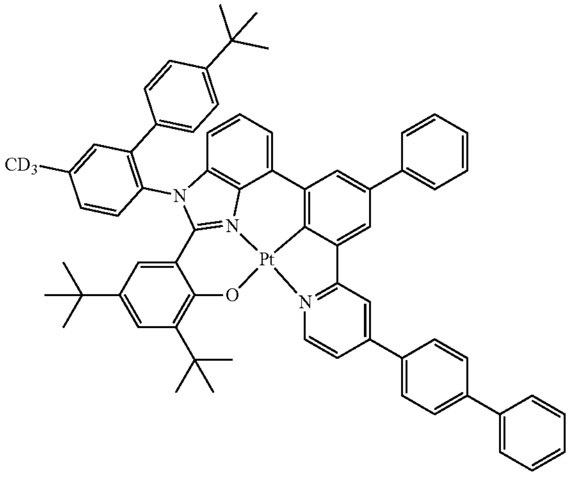
1505
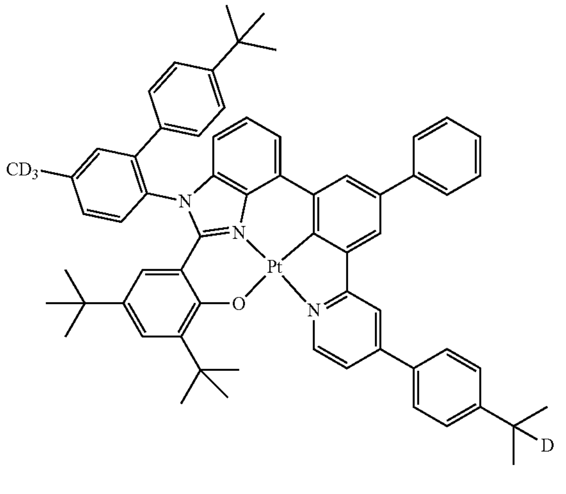
1506
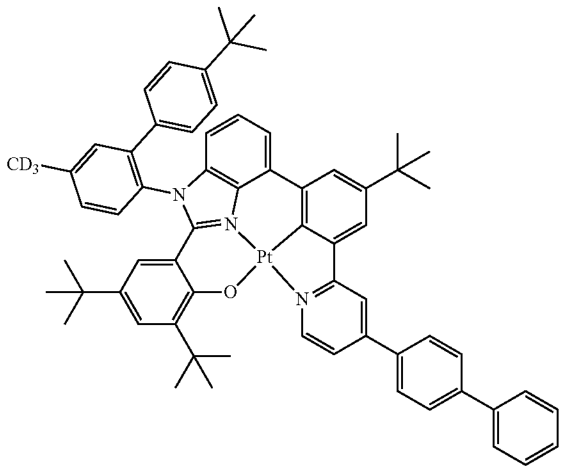
1507
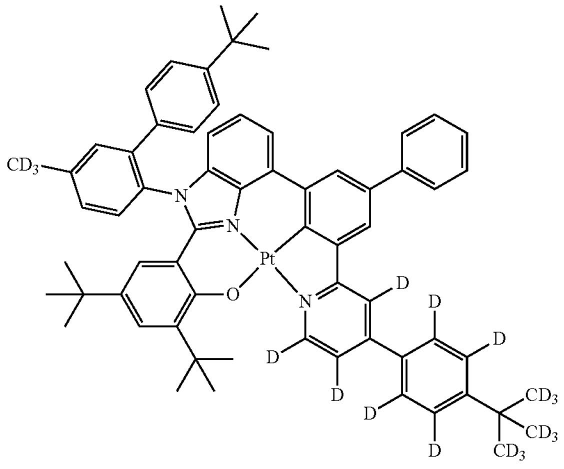
1508
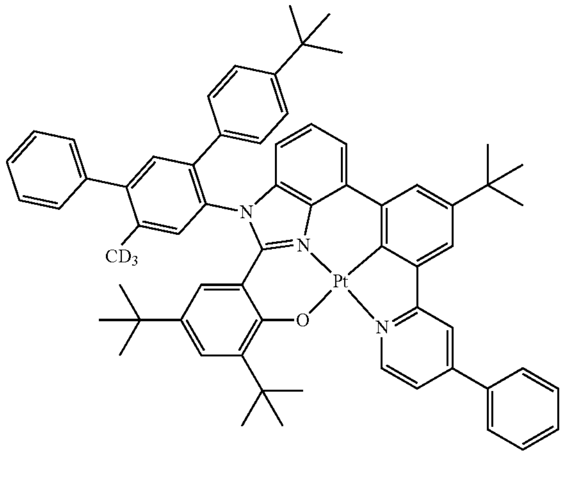

-continued
1509
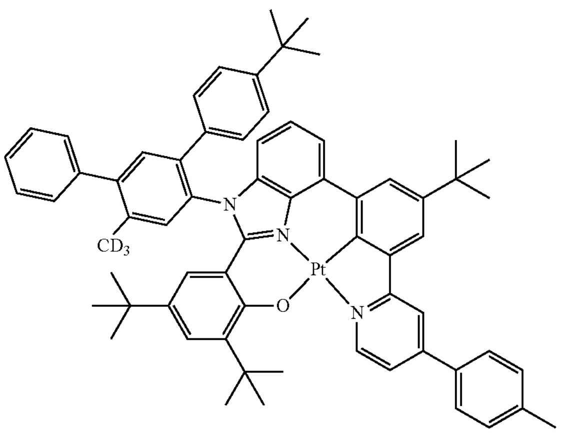
1510
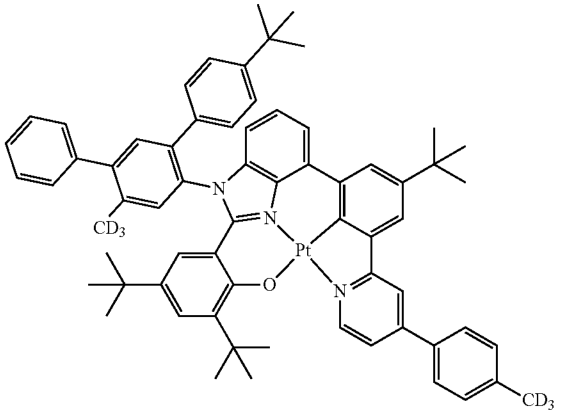
1511
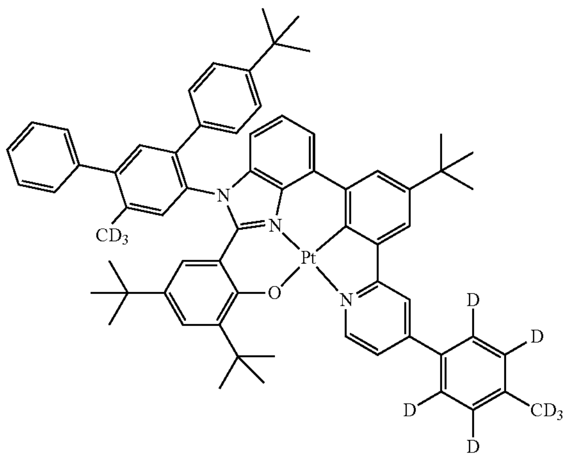
-continued
1512
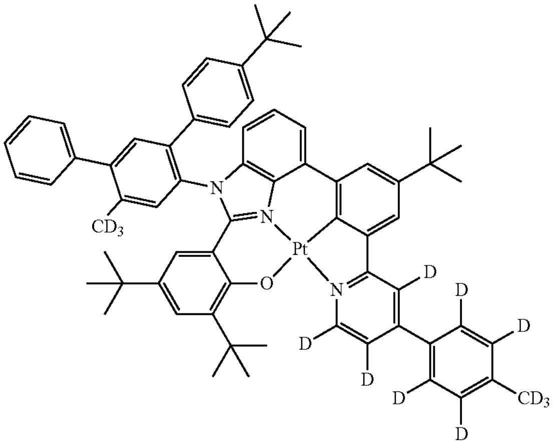
1513
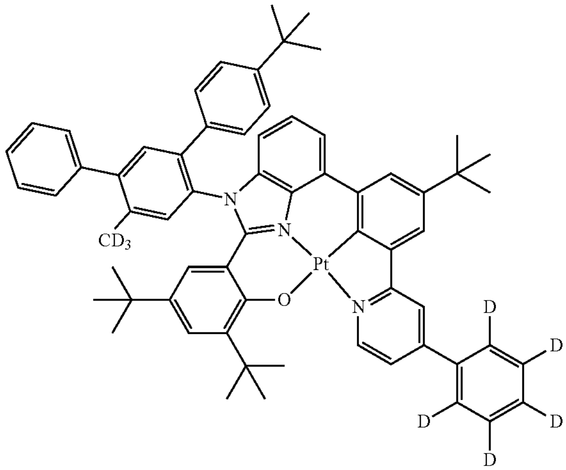
1514
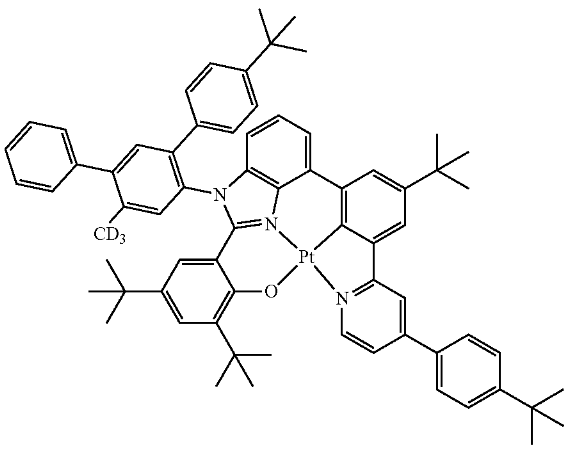

-continued
1515
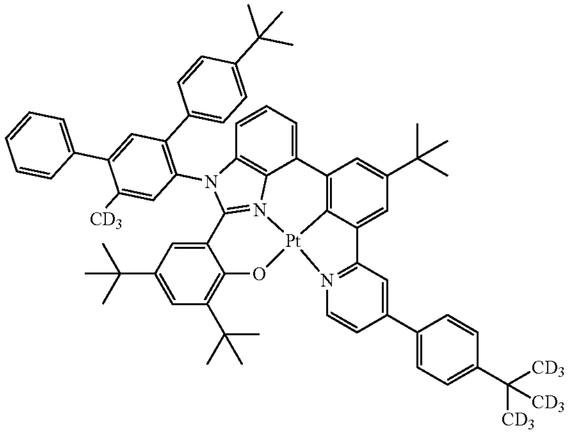
1516
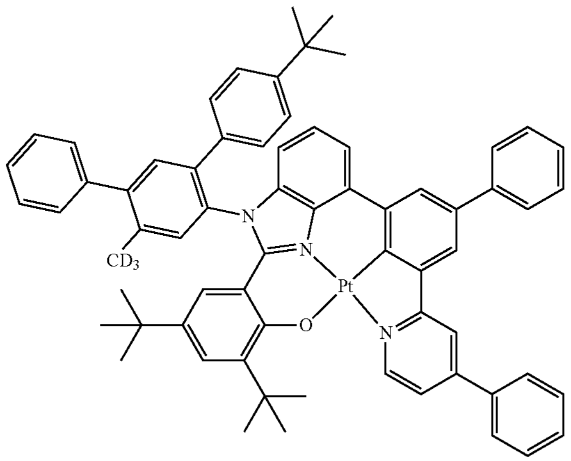
1517
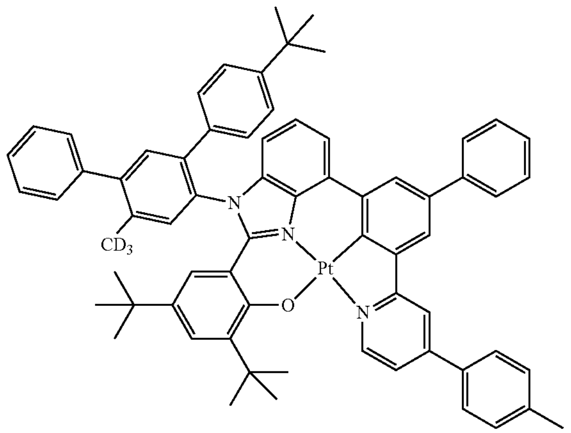
-continued
1518
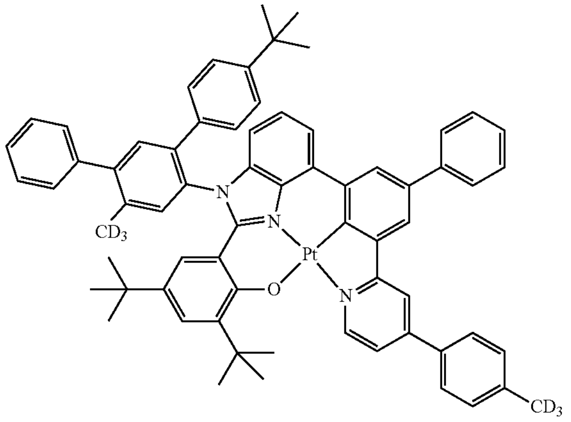
1519
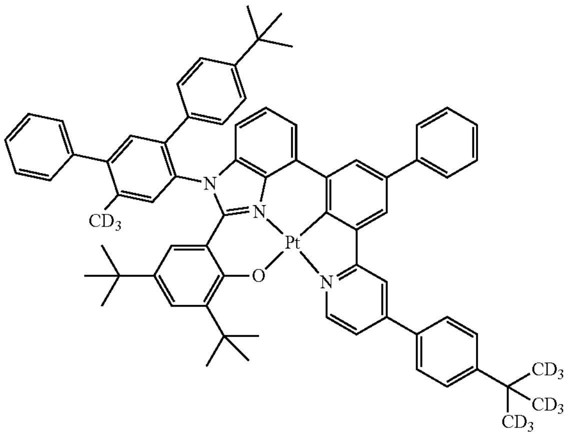
1520
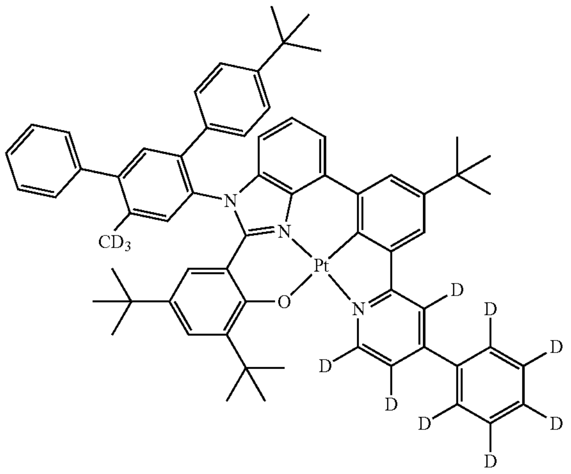

-continued
1521
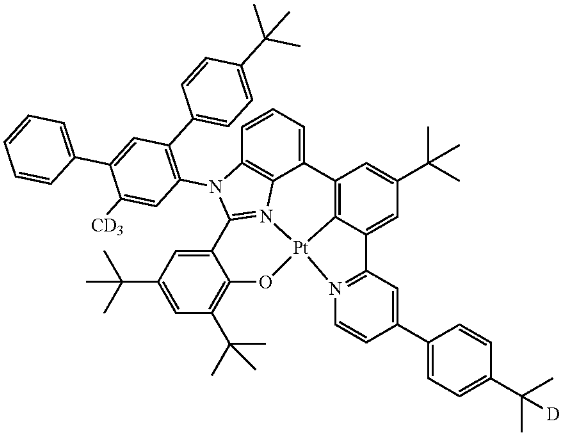
1522
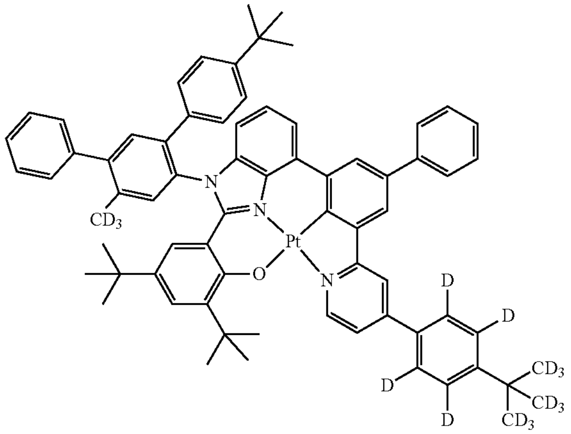
1523
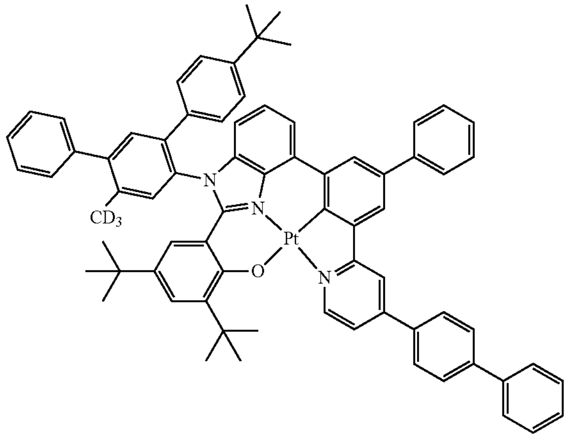
-continued
1524
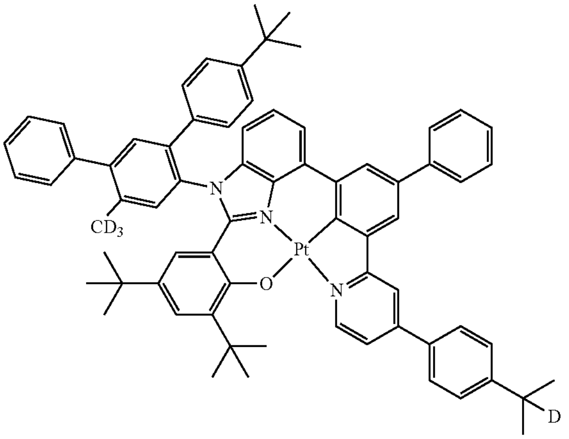
1525
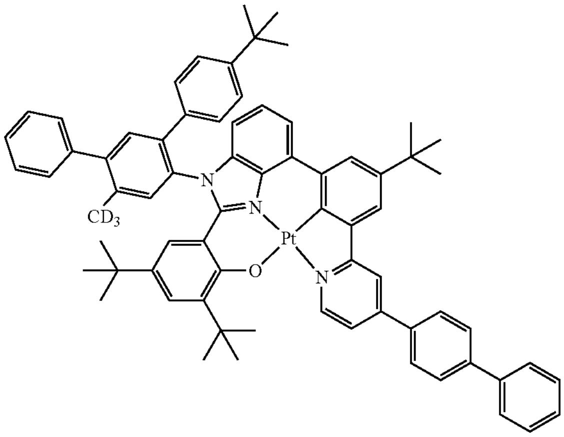
1526
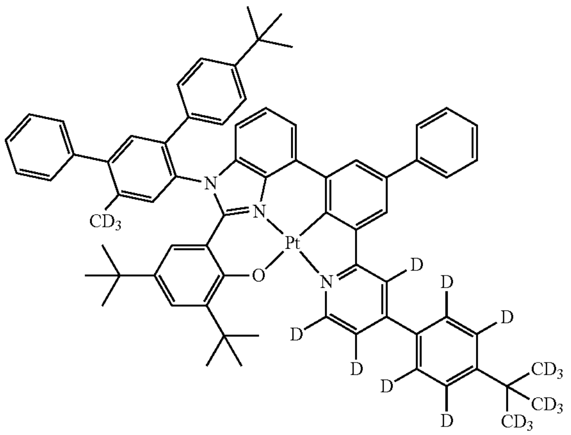

-continued
1527
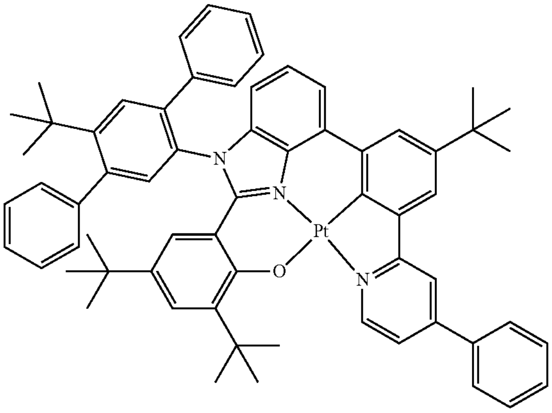
1528
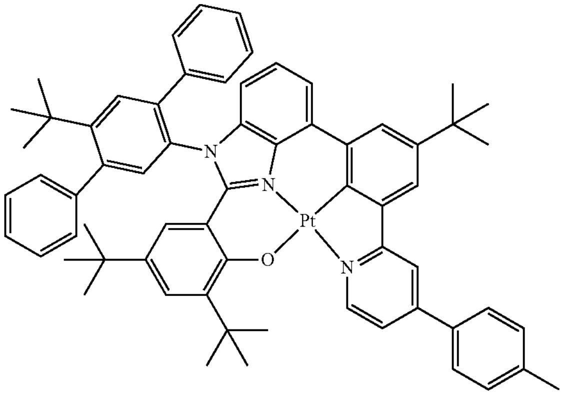
1529
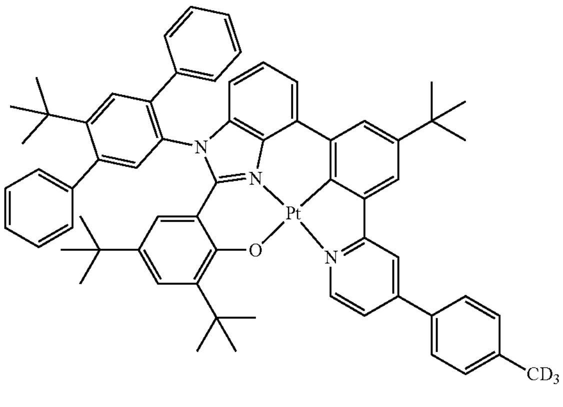
-continued
1530
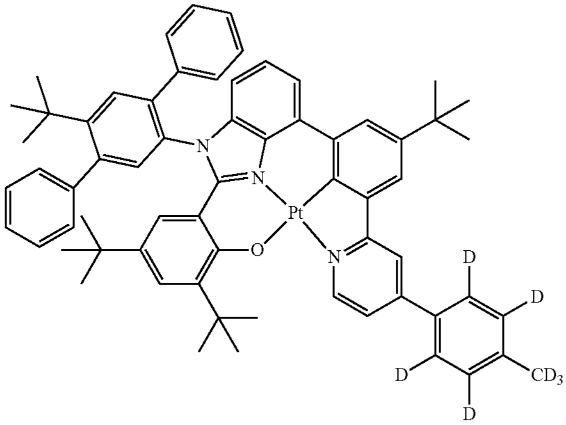
1531
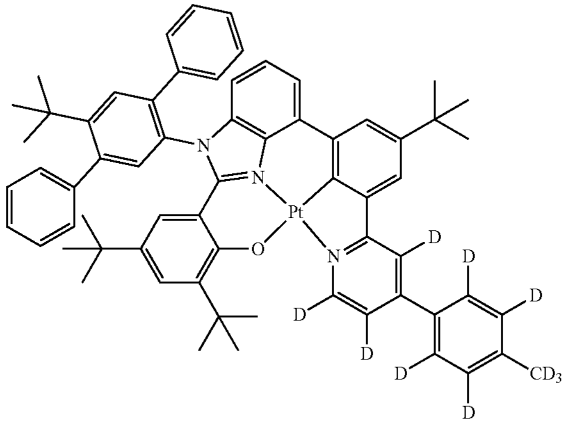
1532
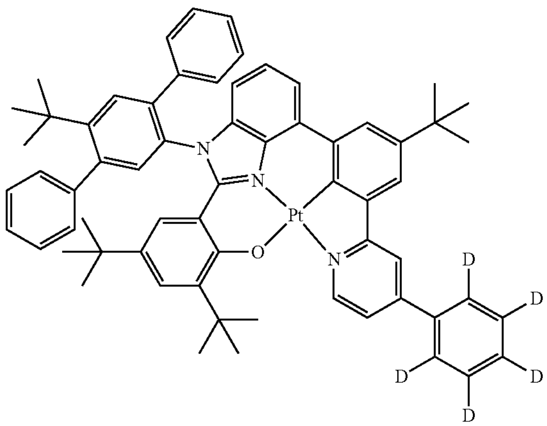

1533
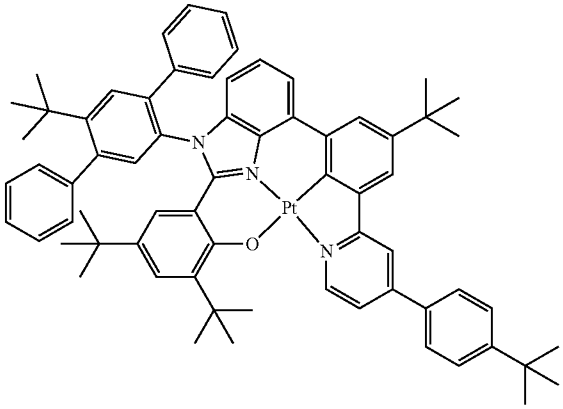
1534
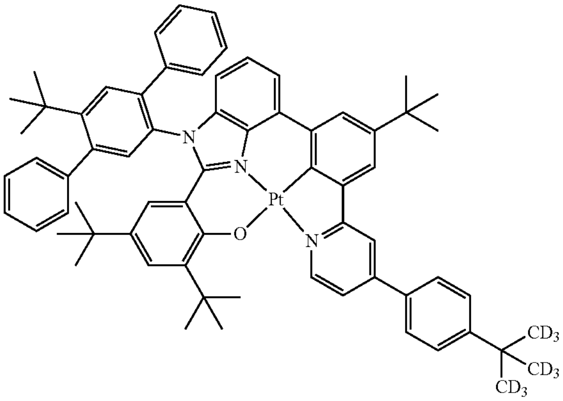
1535
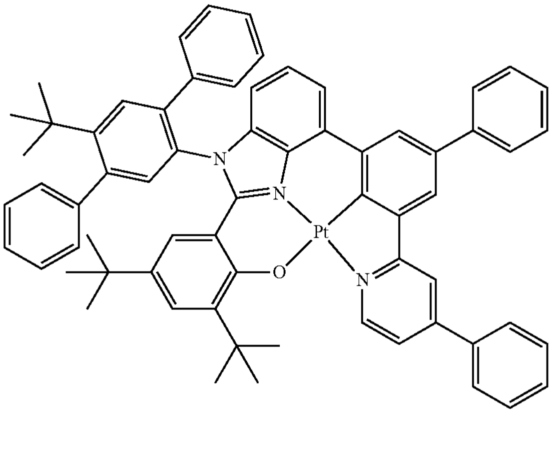
1536
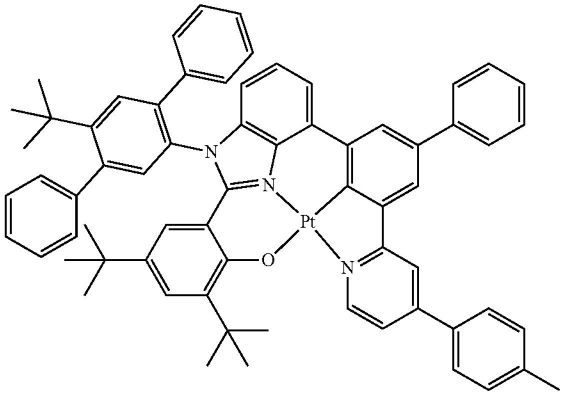
1537
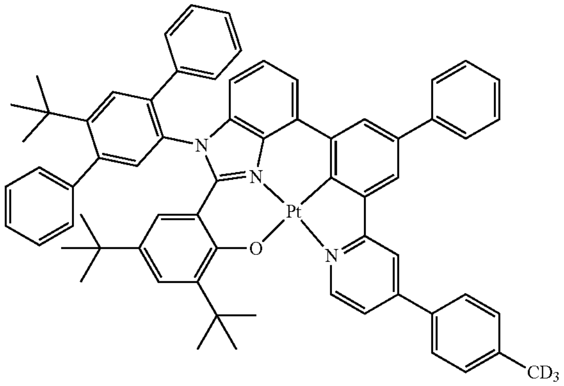
1538
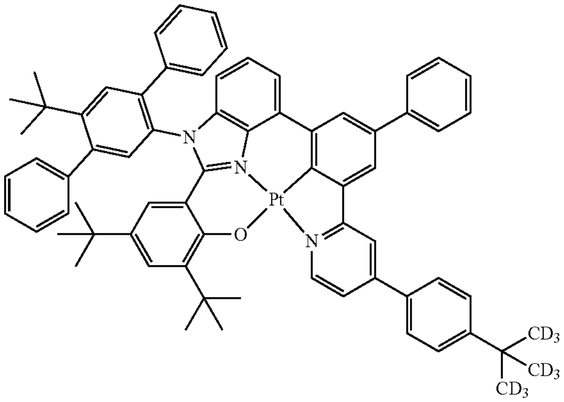

1539
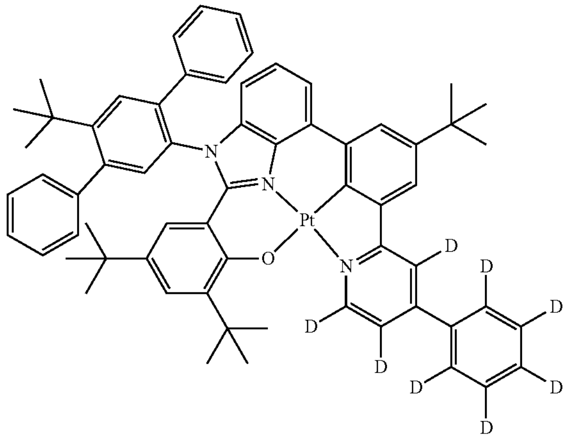
1540
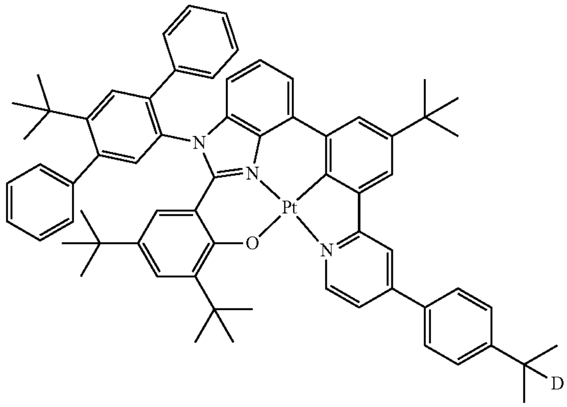
1541
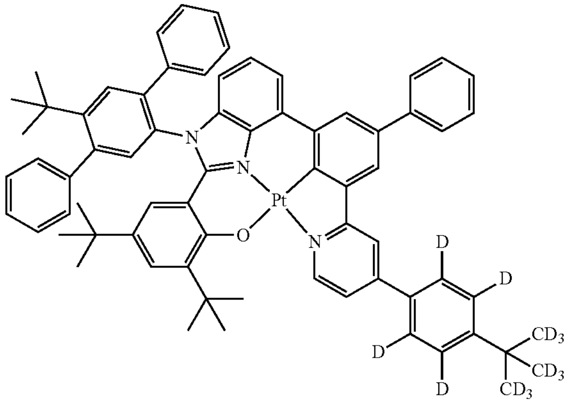
1542
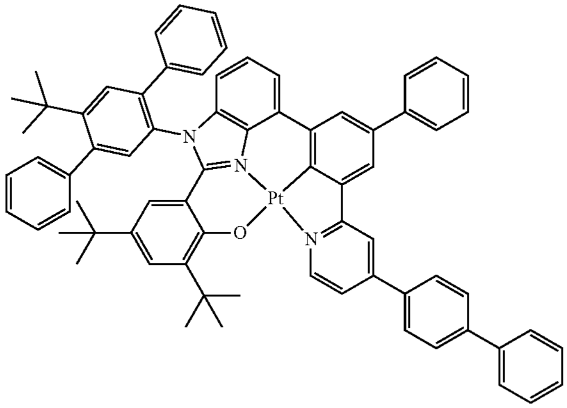
1543
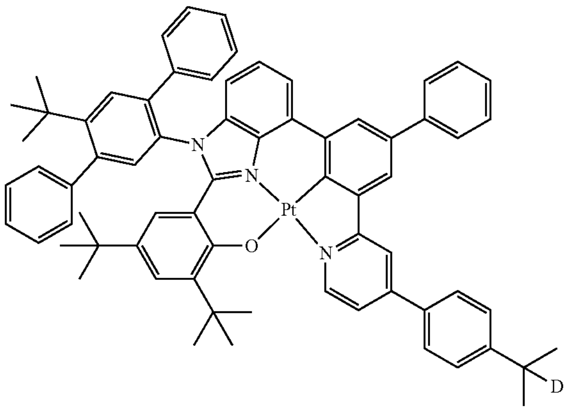
1544
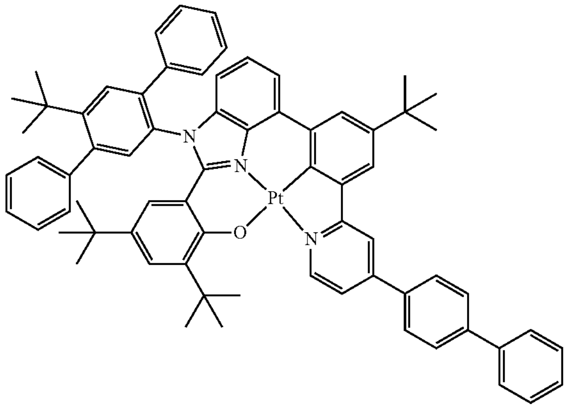

1545
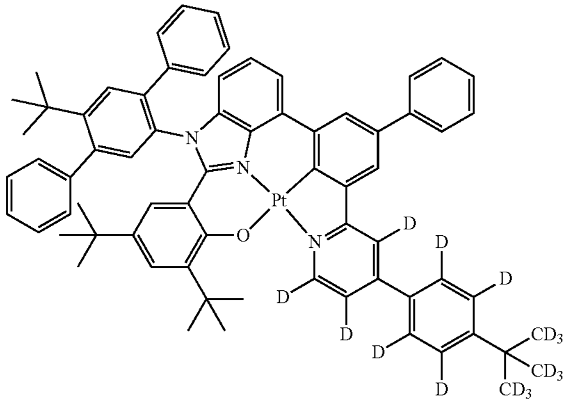
1546
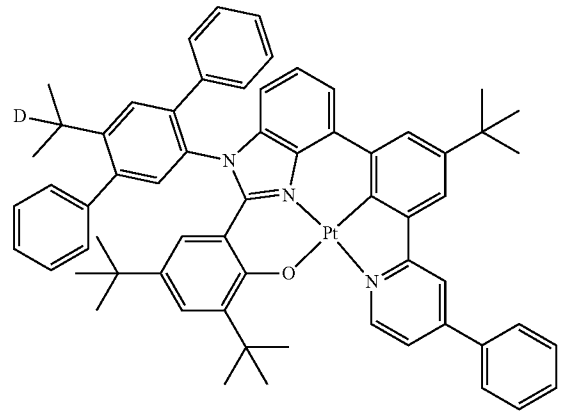
1547
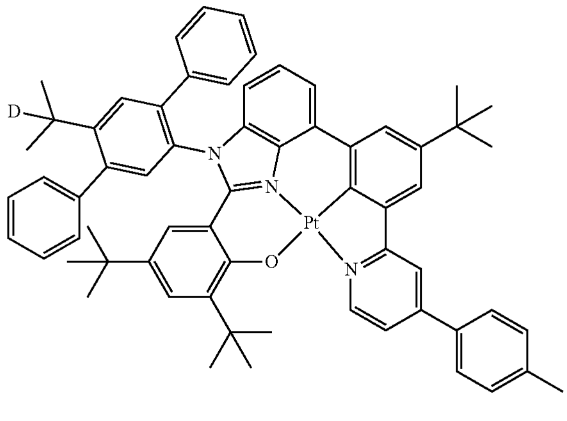
1548
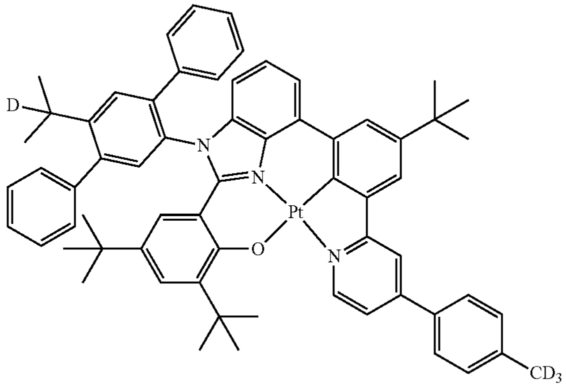
1549
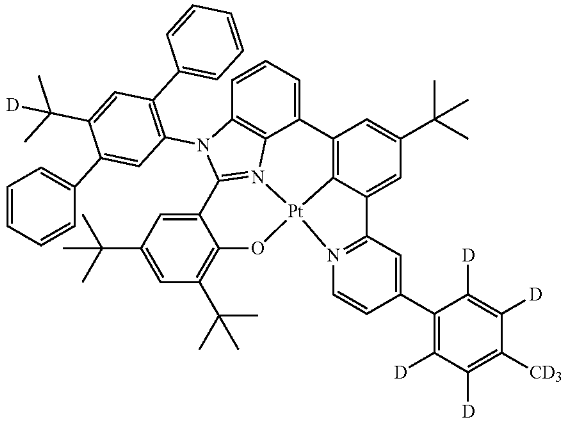
1550
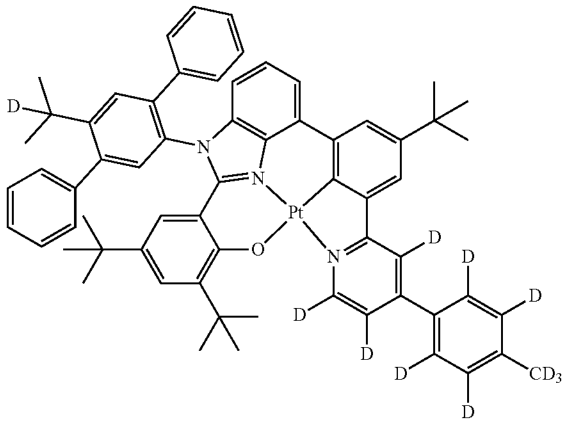

-continued
1551
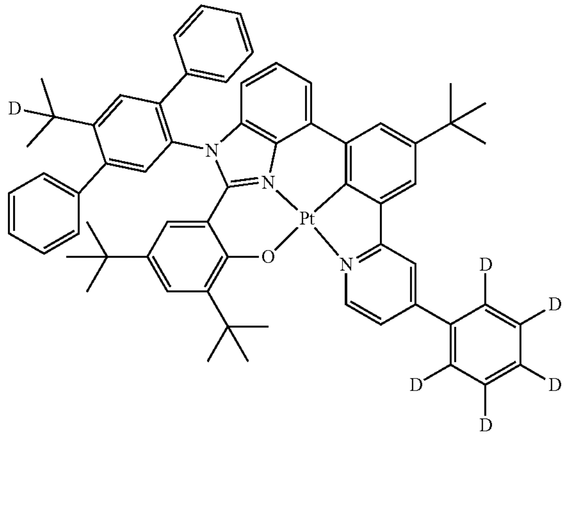
1552
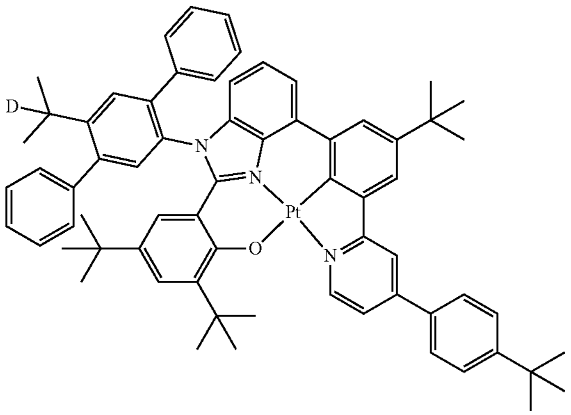
1553
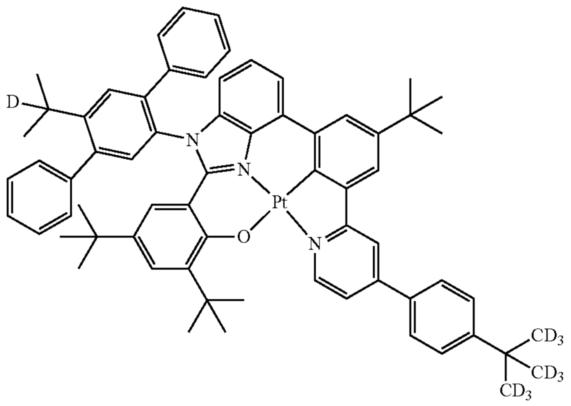
-continued
1554
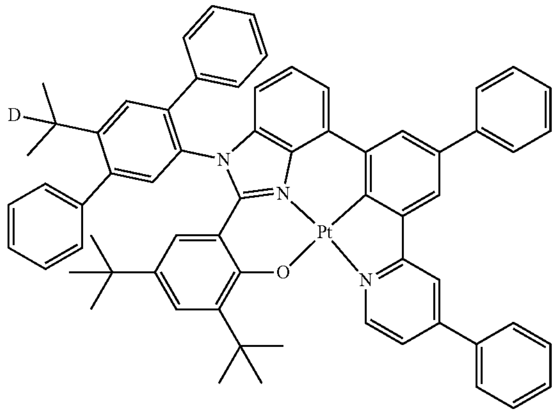
1555
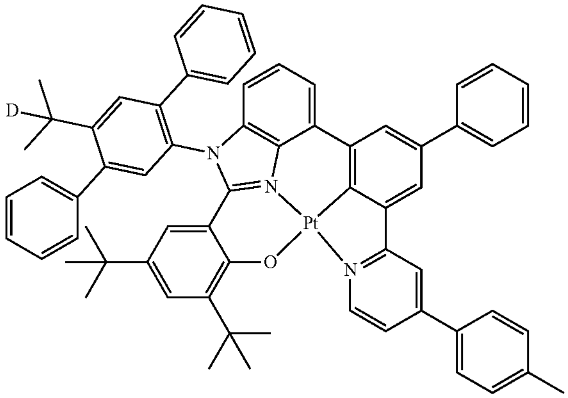
1556
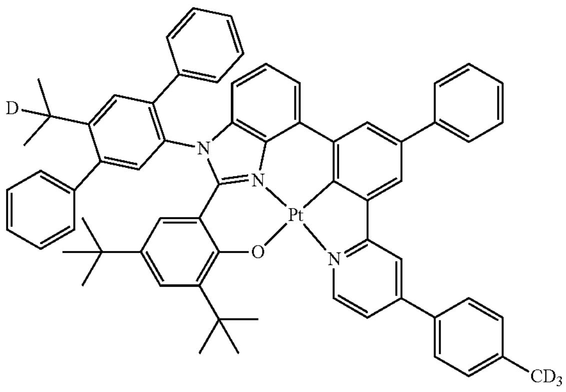

-continued
1557
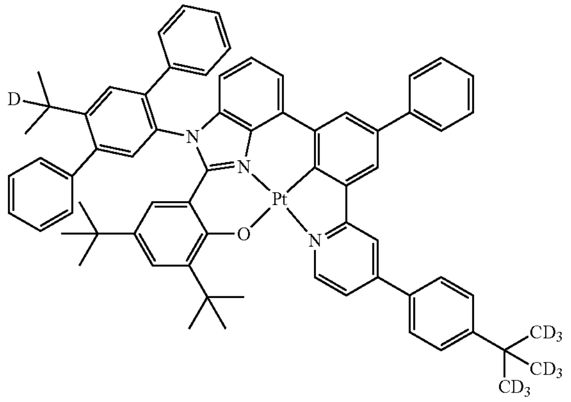
1558
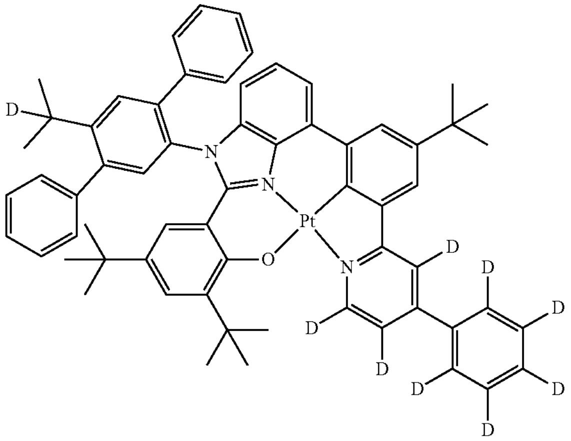
1559
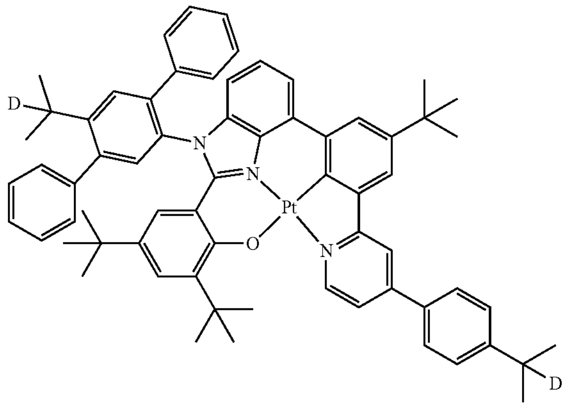
-continued
1560
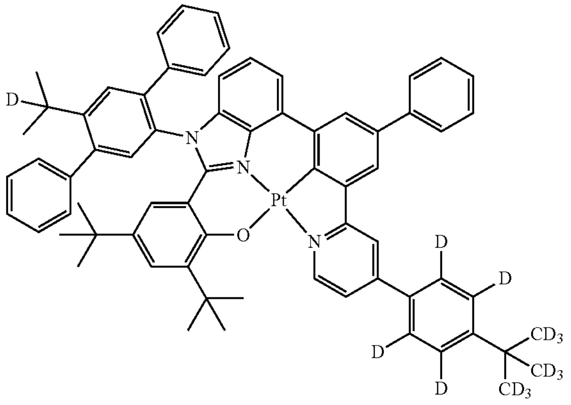
1561
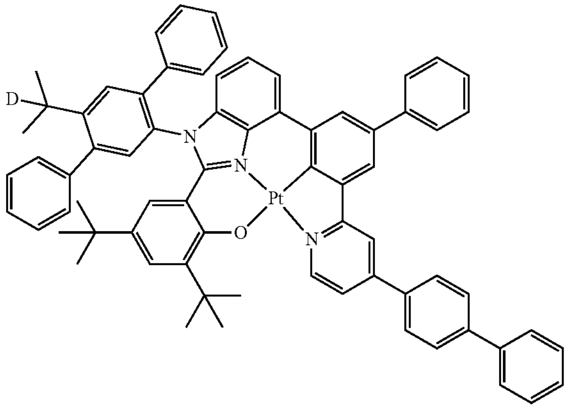
1562
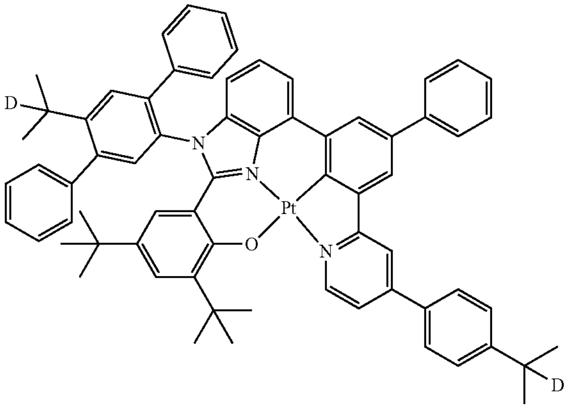

-continued
1563
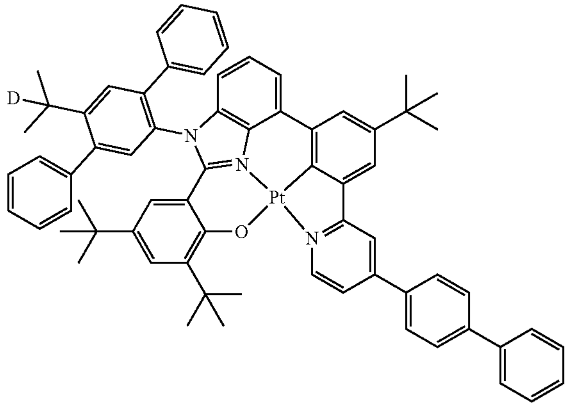
1564
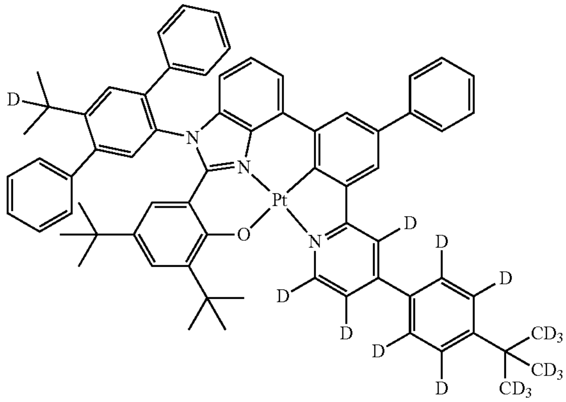
1565
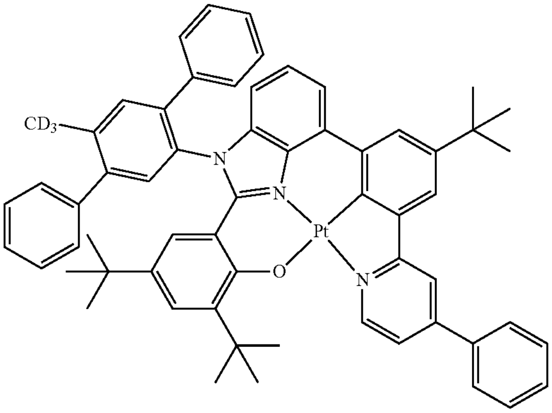
-continued
1566
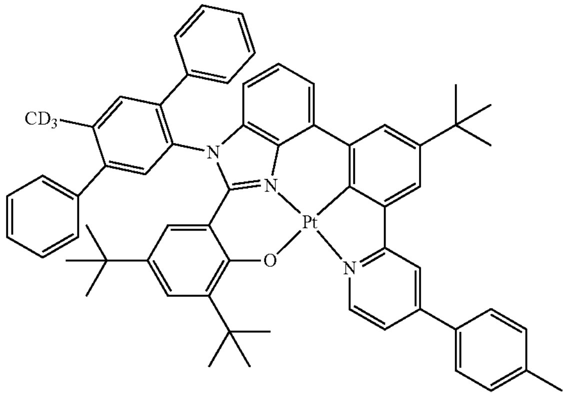
1567
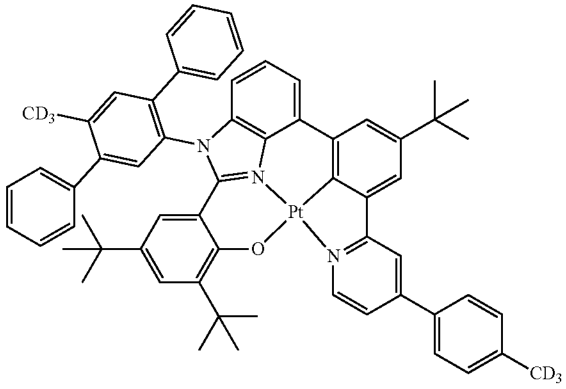
1568
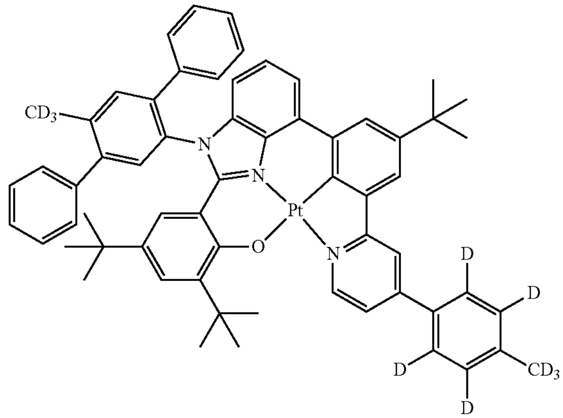

-continued
1569
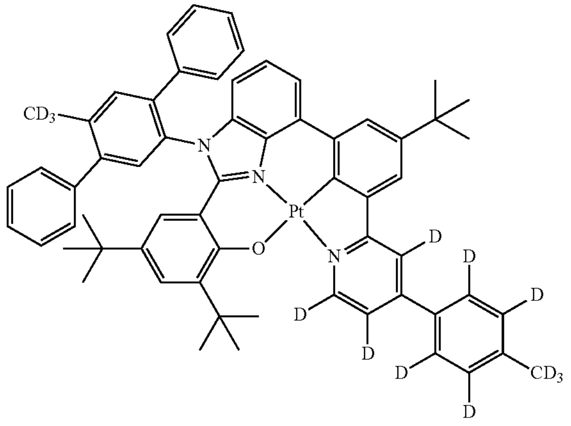
1570
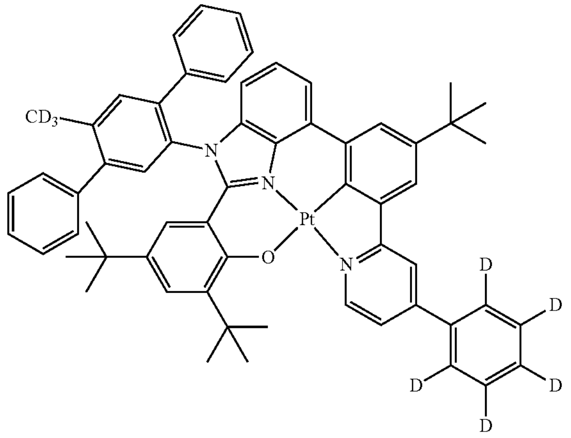
1571
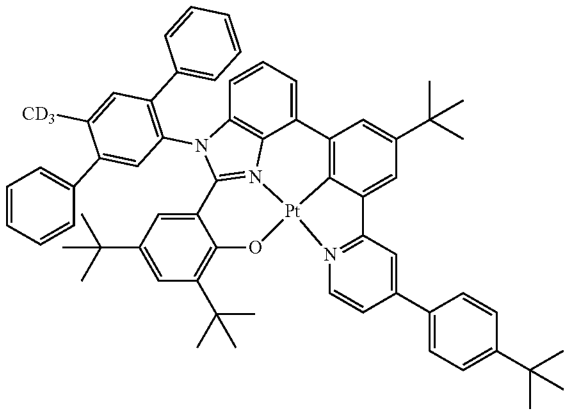
-continued
1572
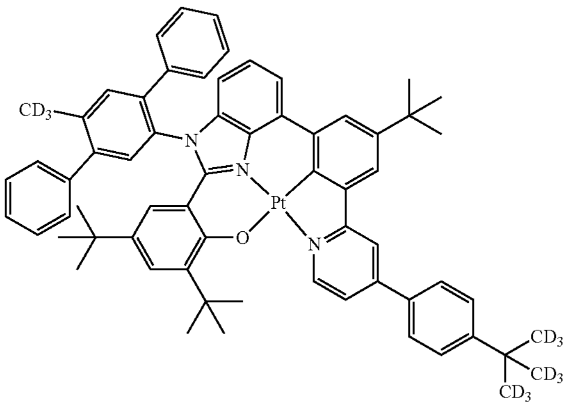
1573
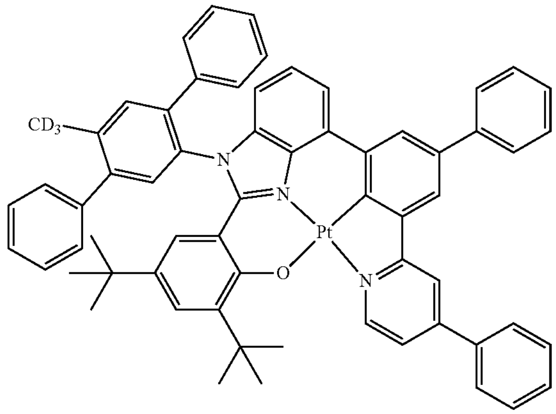
1574
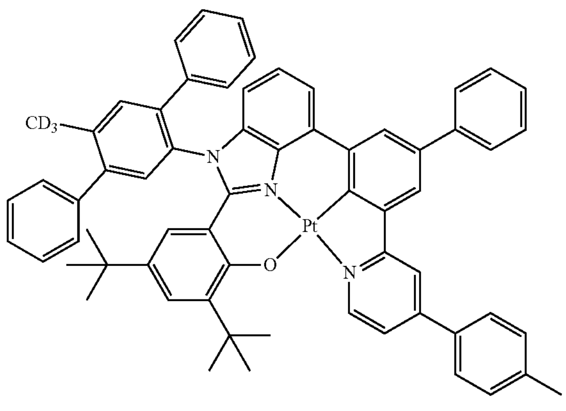

-continued
1575
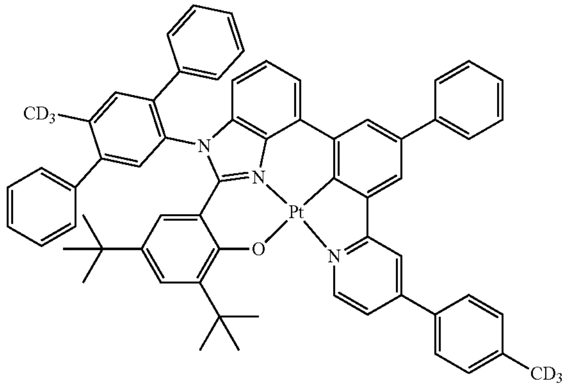
1576
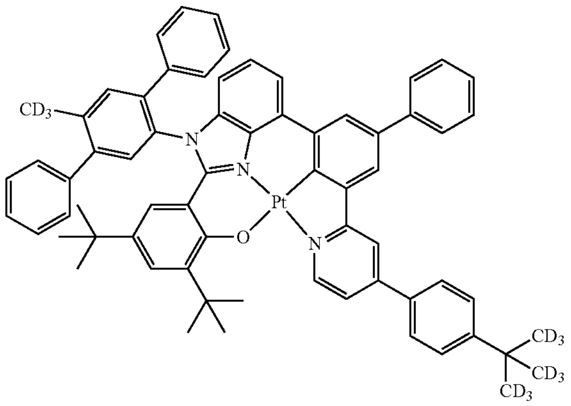
1577
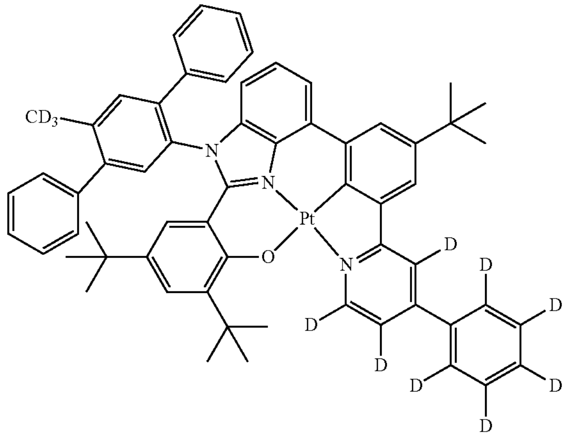
-continued
1578
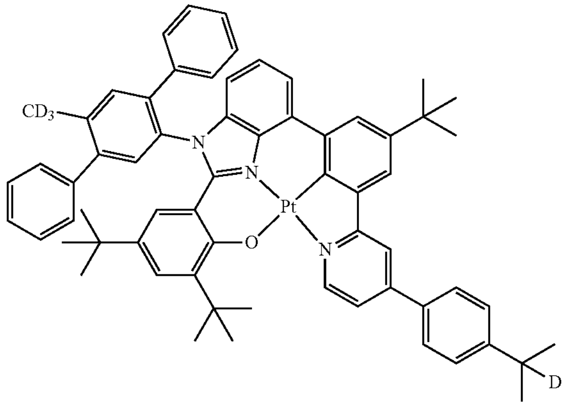
1579
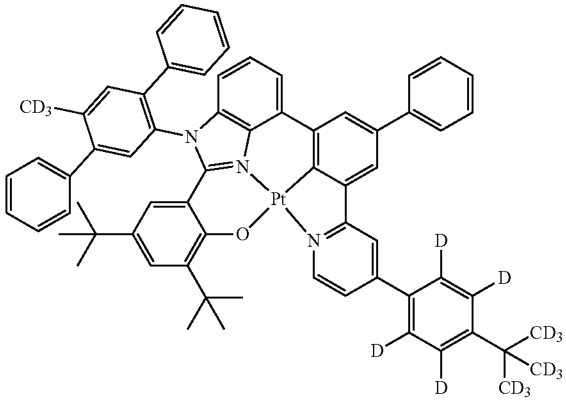
1580
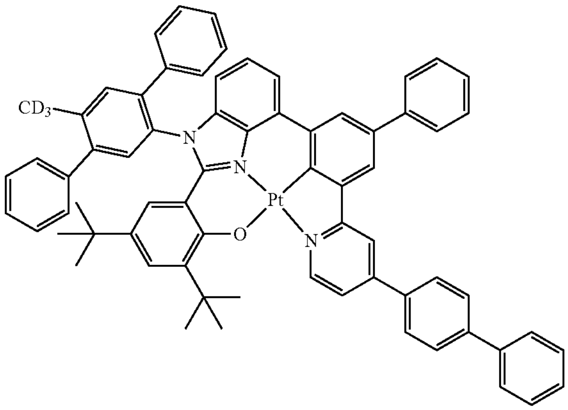

-continued
1581
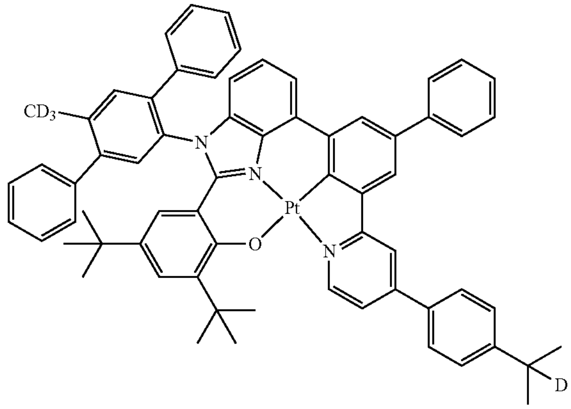
1582
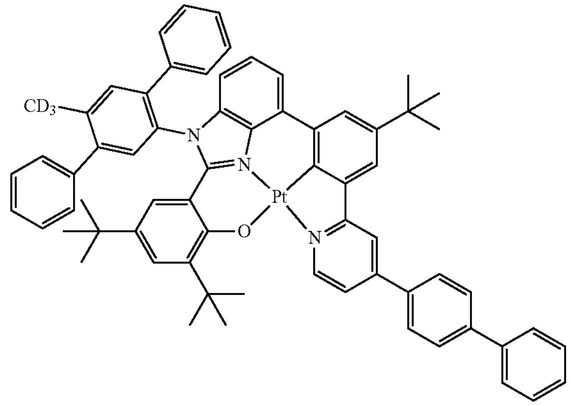
1583
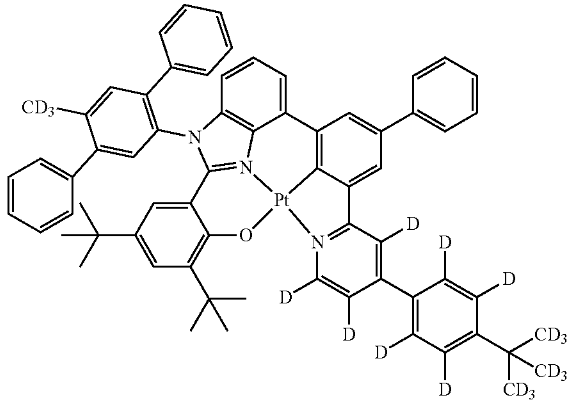
-continued
1584
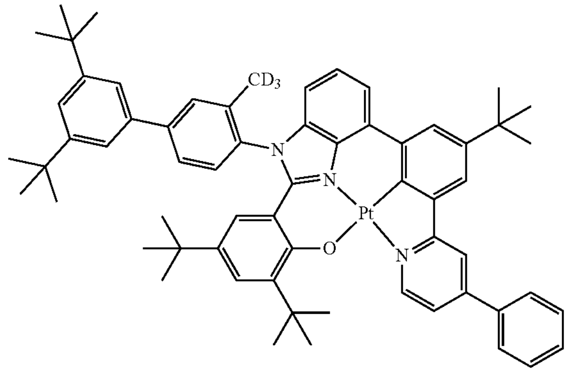
1585
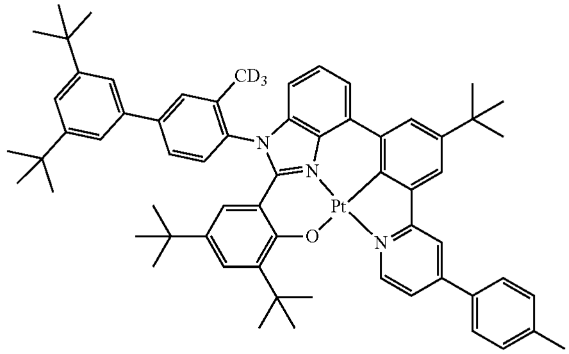
1586
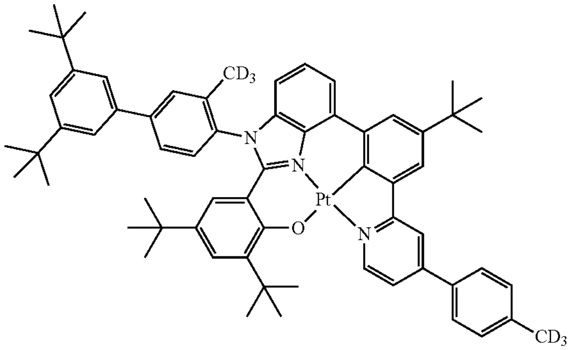
1587
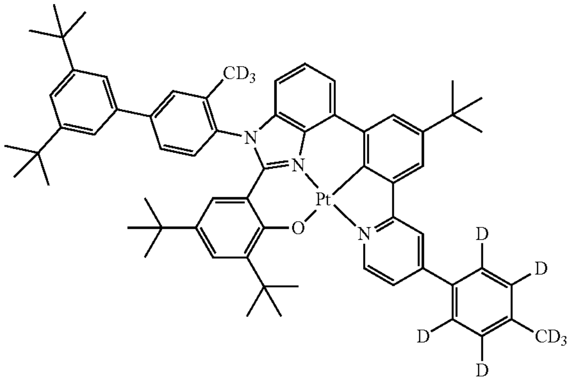

-continued
1588
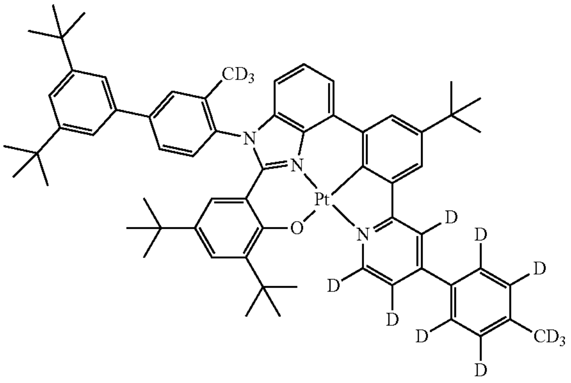
1589
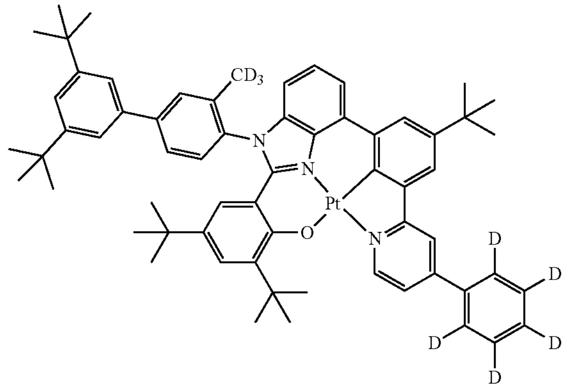
1590
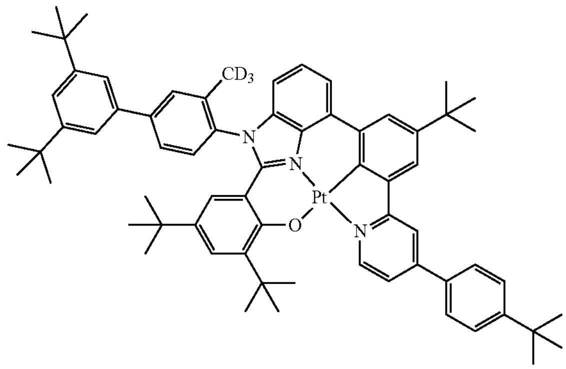
1591
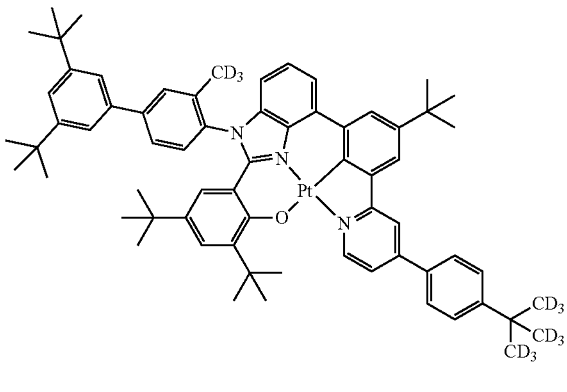
-continued
1592
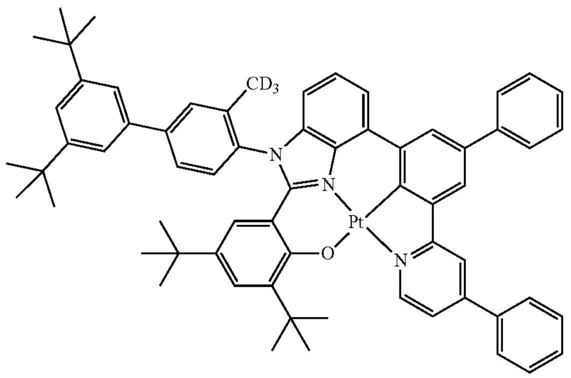
1593
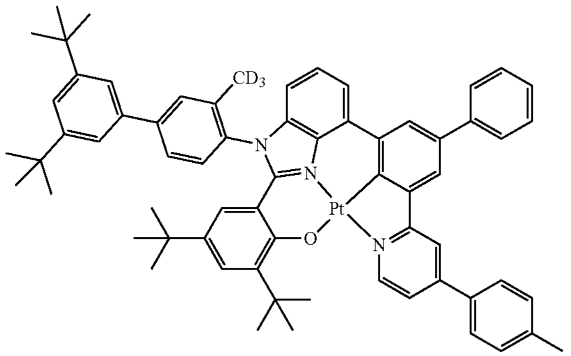
1594
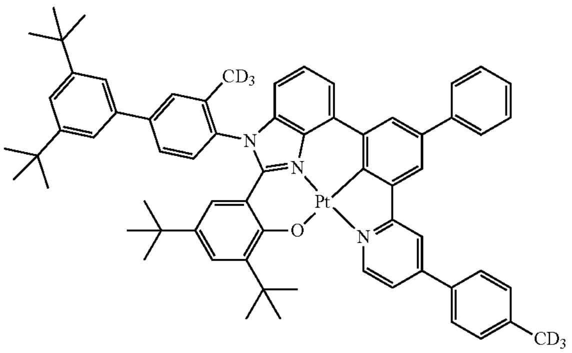
1595
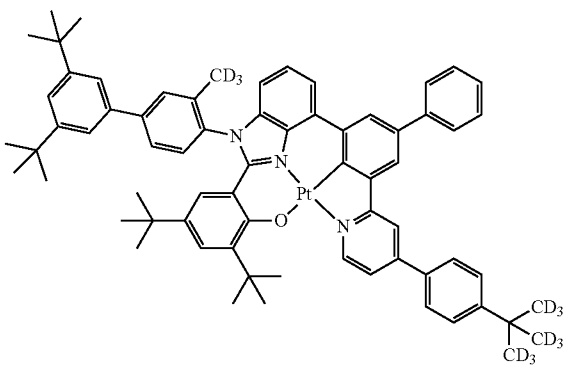

1596
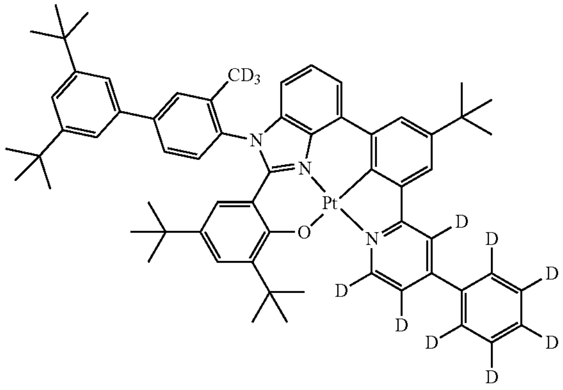
1597
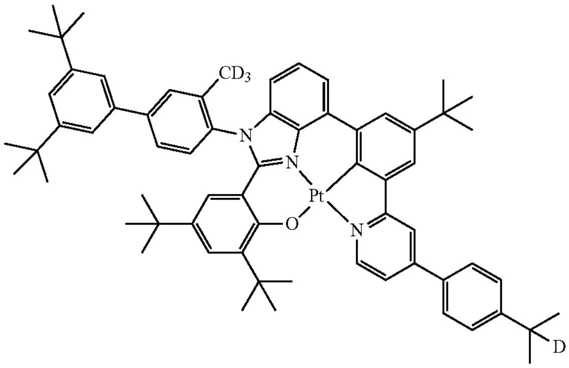
1598
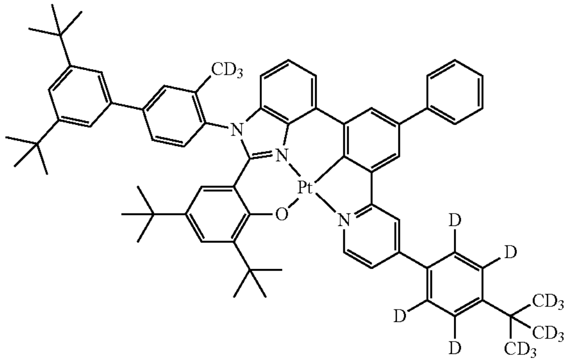
1599
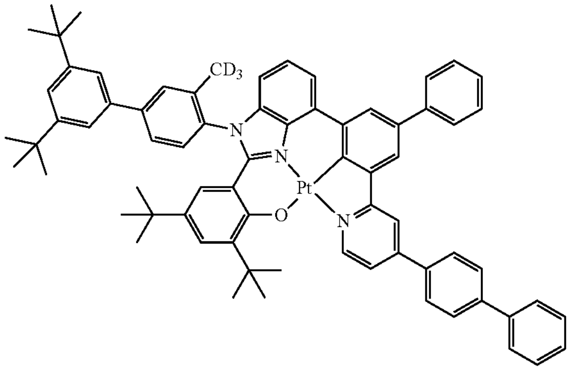
1600
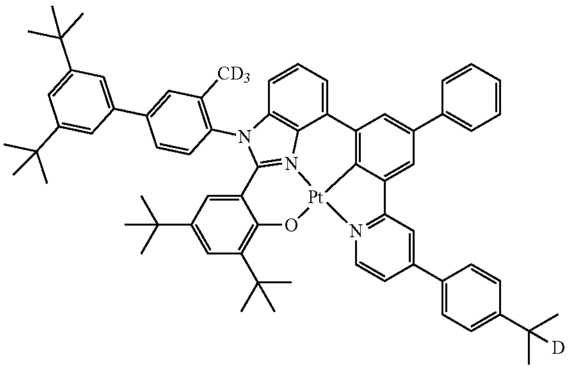
1601
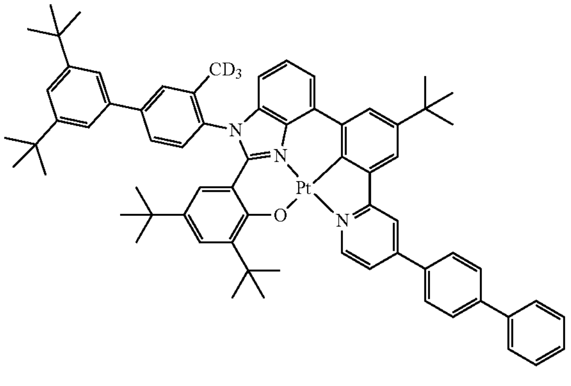
1602
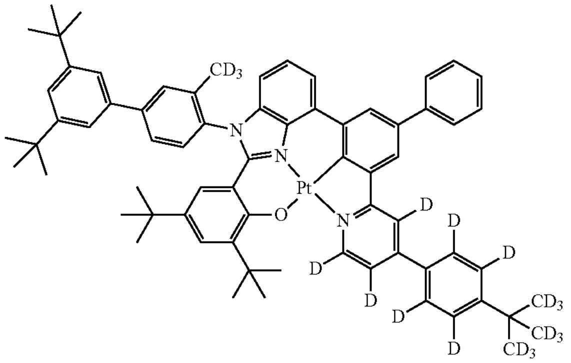
1603
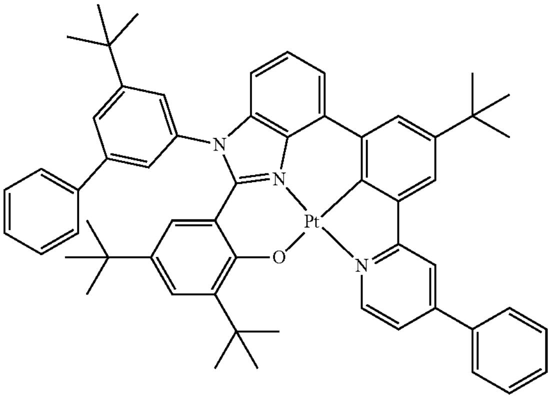

-continued
1604
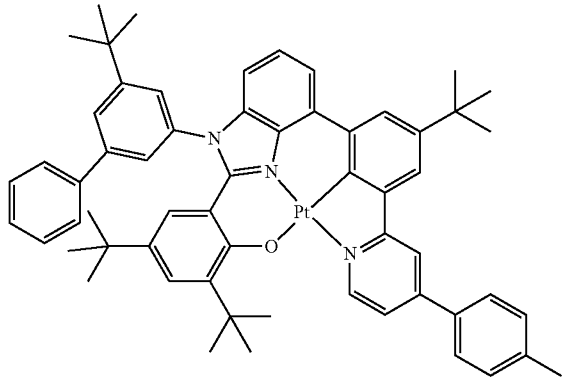
1605
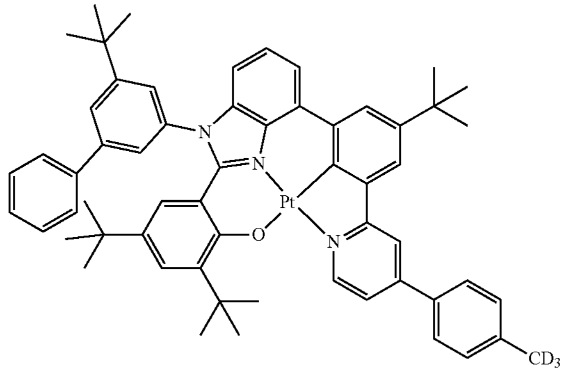
1606
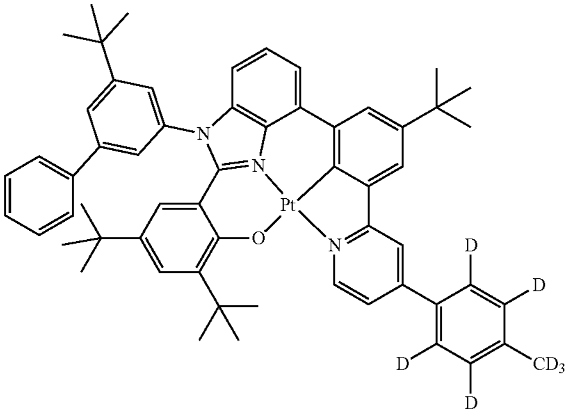
-continued
1607
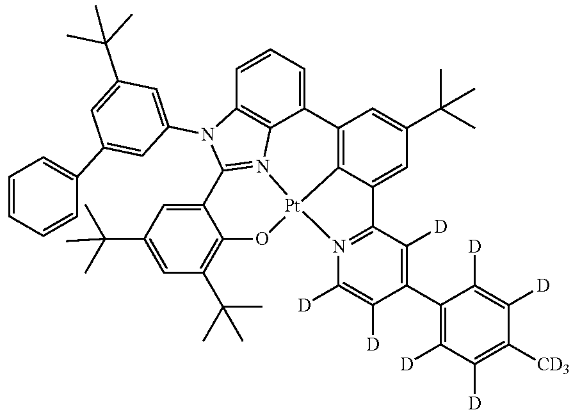
1608
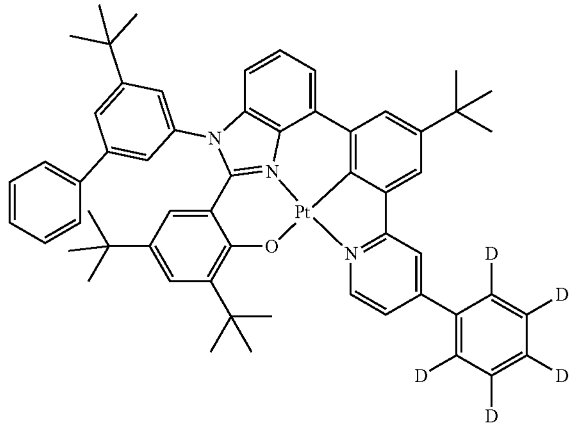
1609
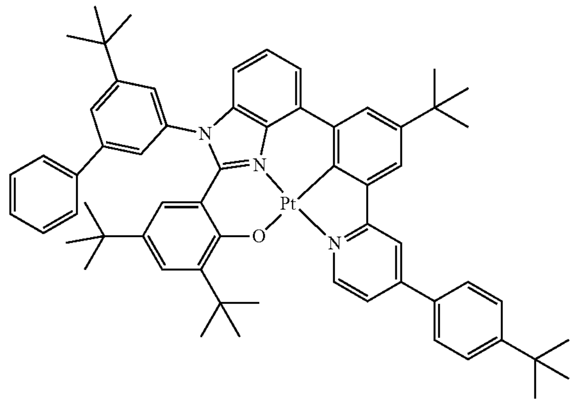

-continued
1610
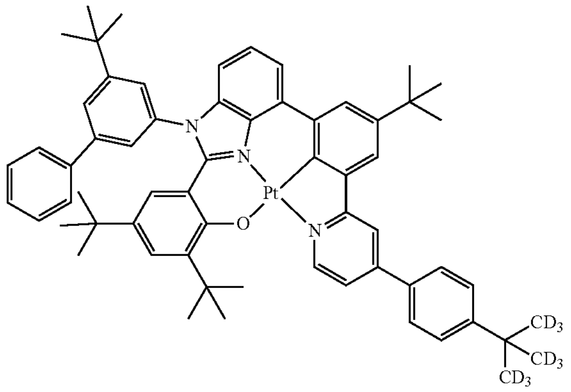
1611
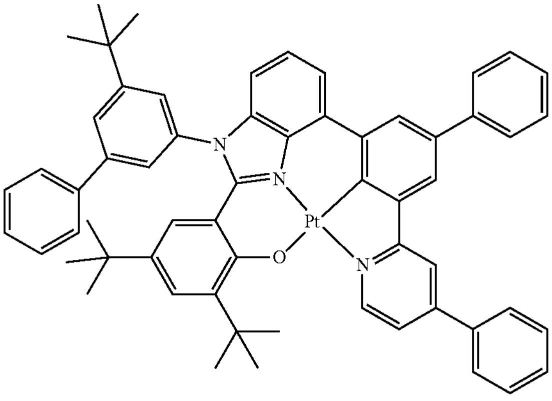
1612
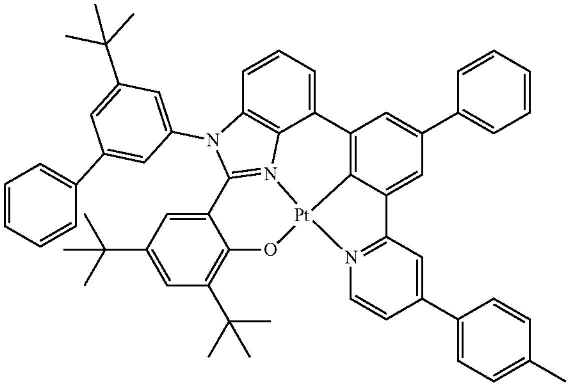
1613
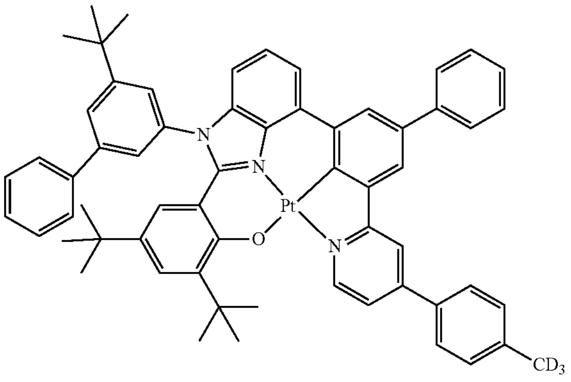
-continued
1614
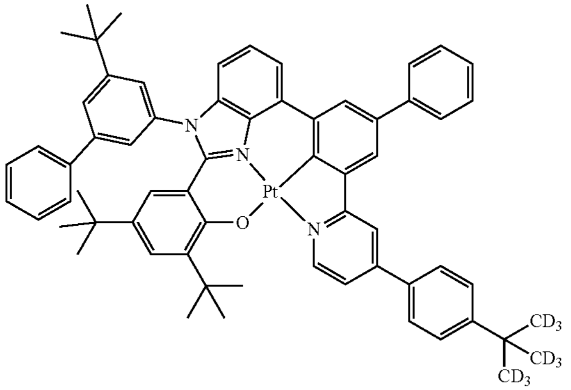
1615
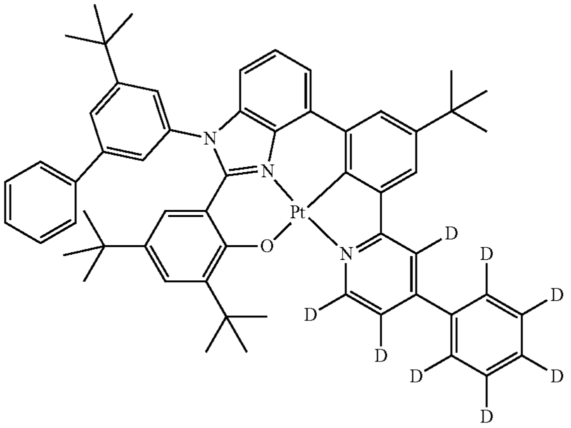
1616
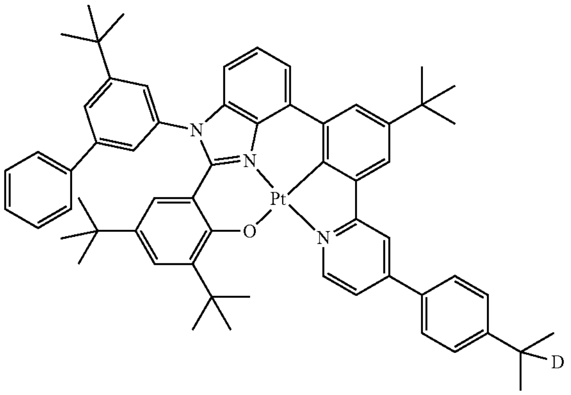

1617
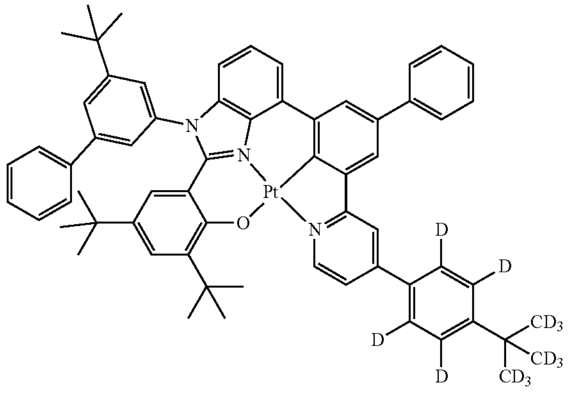
1618
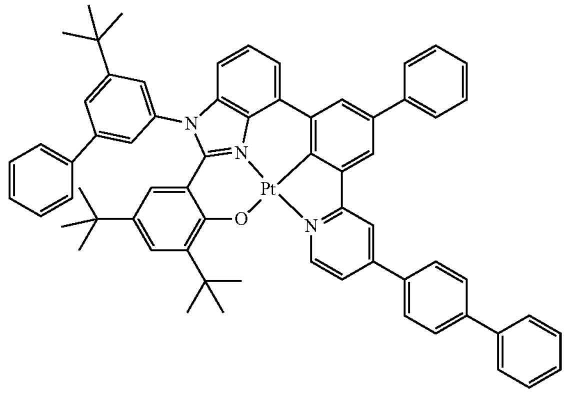
1619
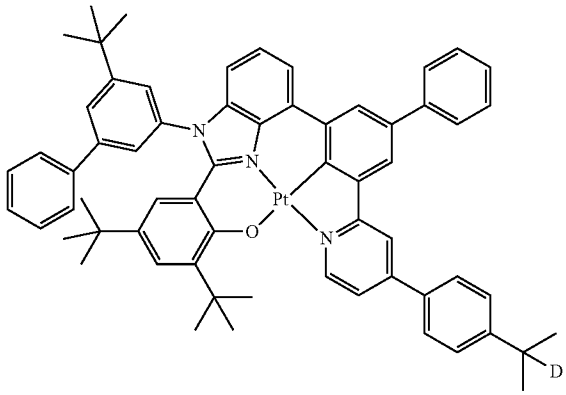
1620
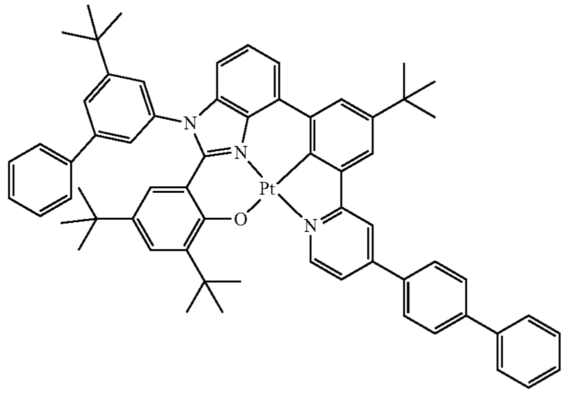
1621
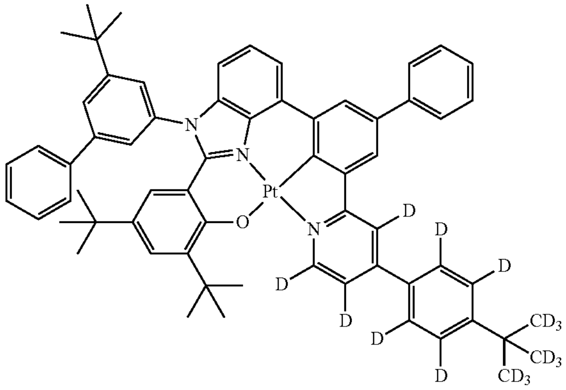
1622
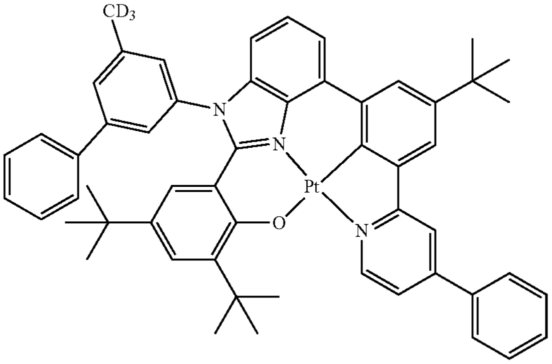
1623
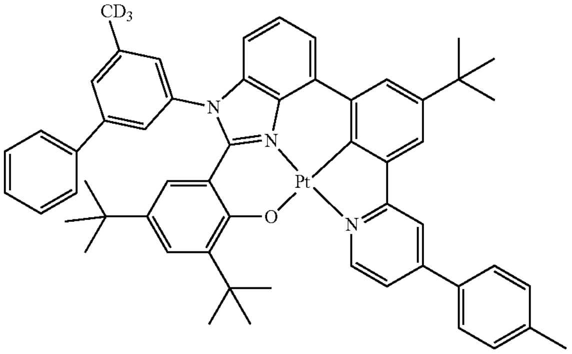

-continued
1624
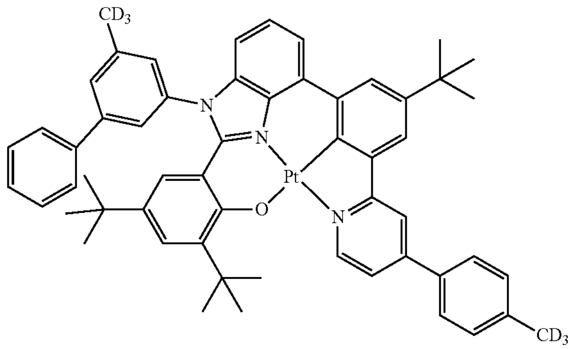
1625
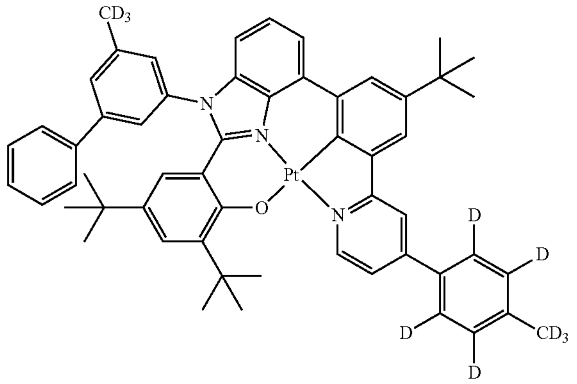
1626
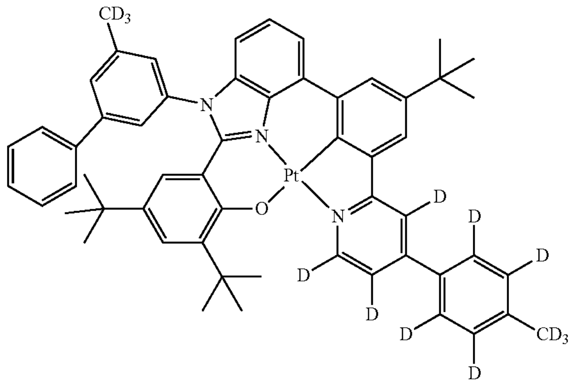
1627
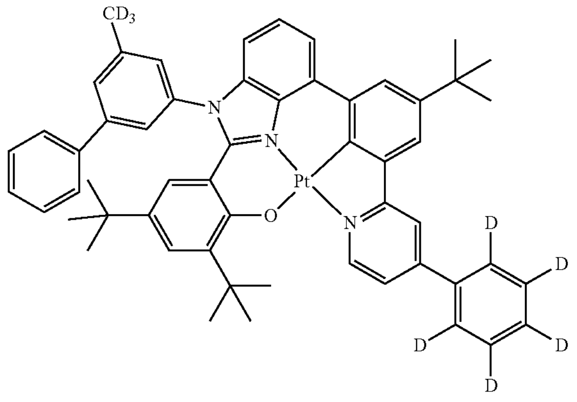
-continued
1628
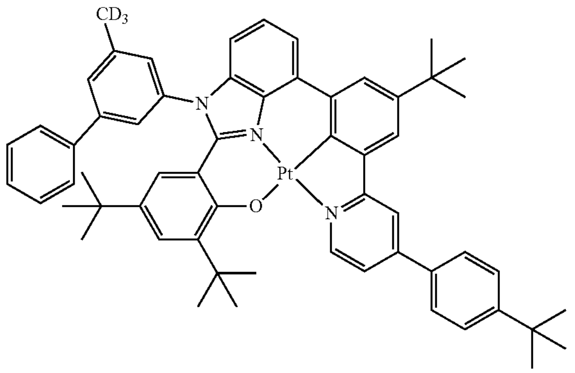
1629
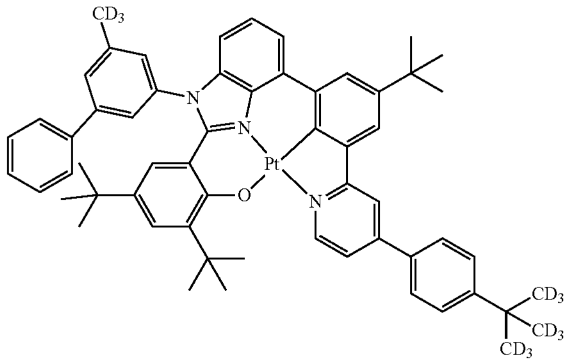
1630
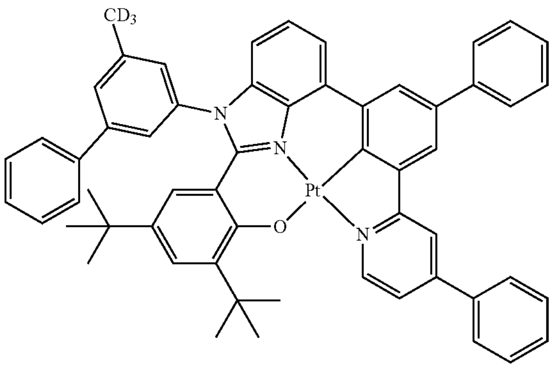
1631
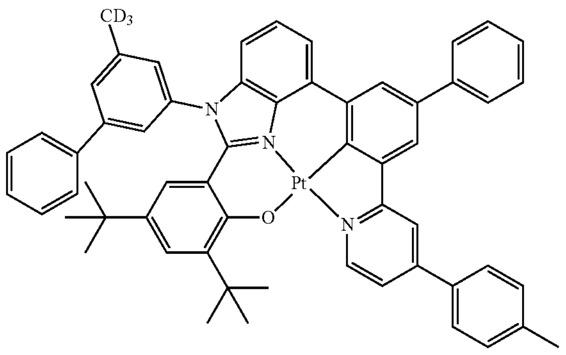

-continued
1632
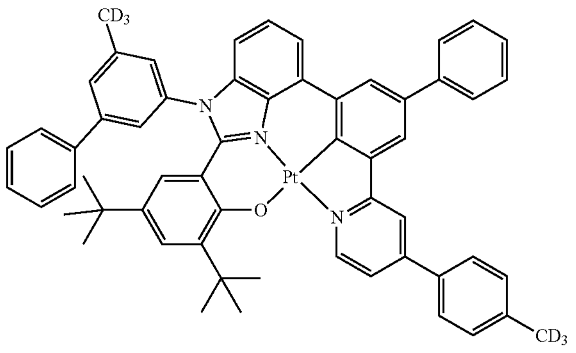
1633
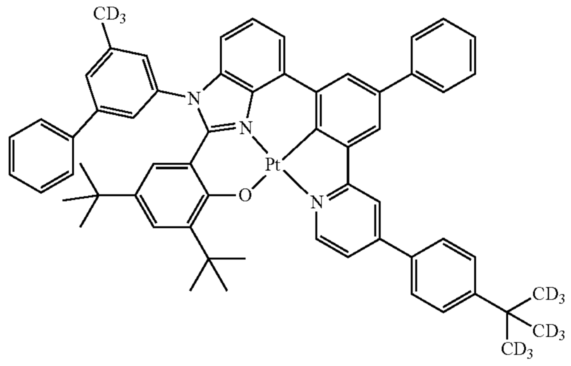
1634
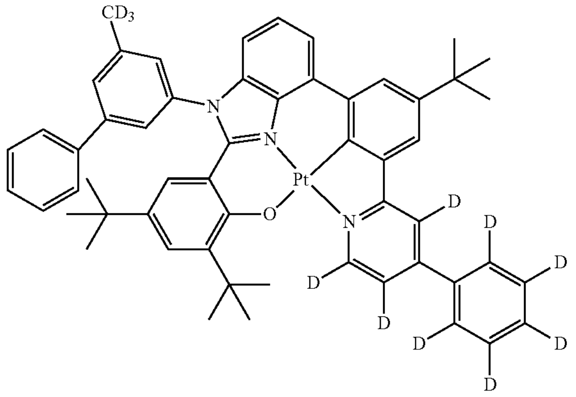
1635
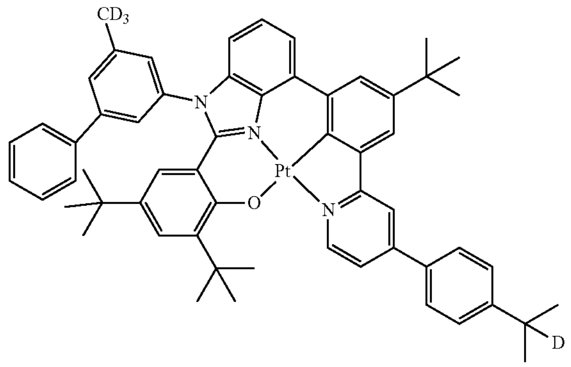
-continued
1636
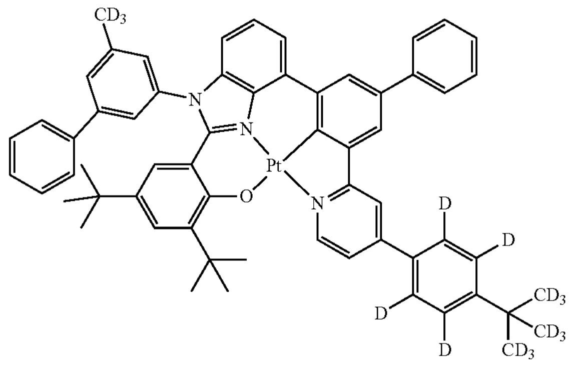
1637
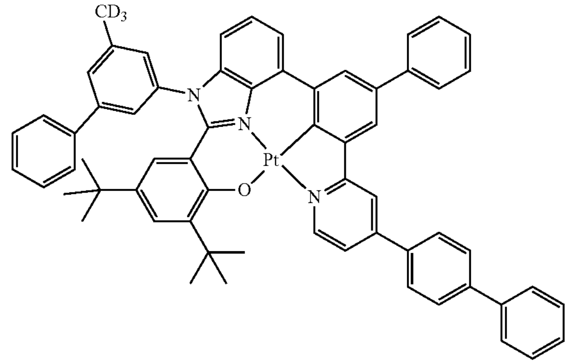
1638
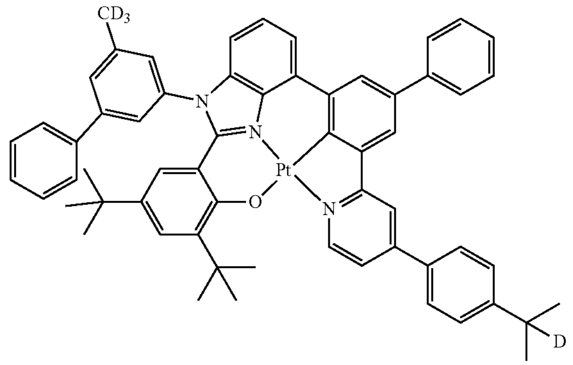
1639
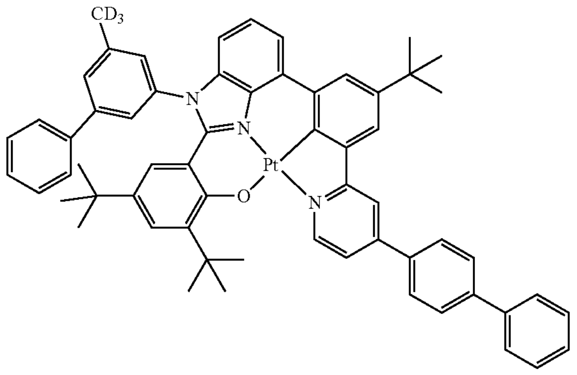

-continued
1640
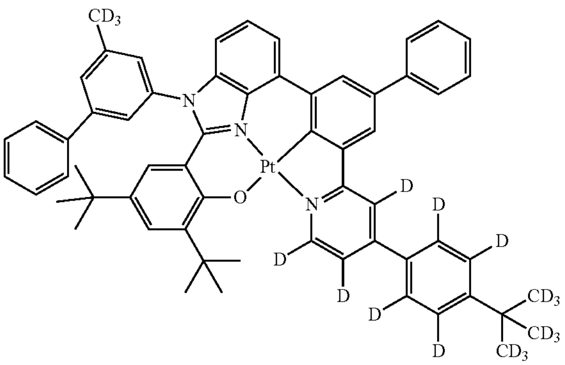
1641
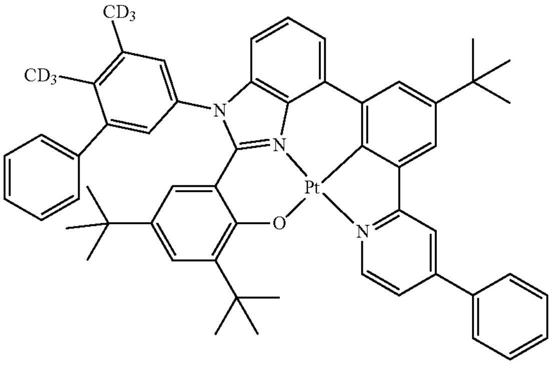
1642
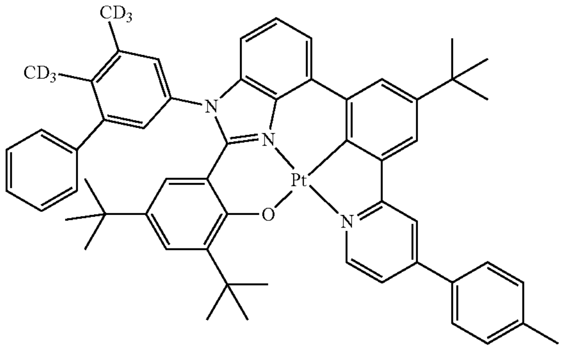
1643
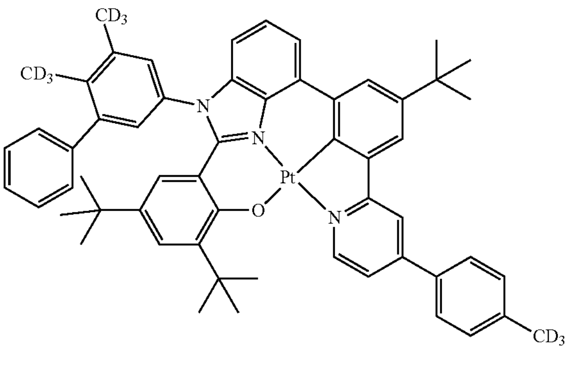
-continued
1644
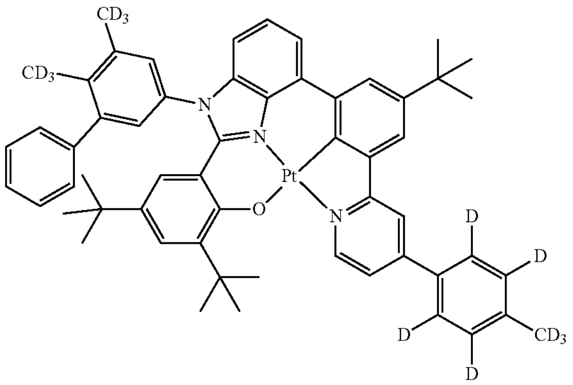
1645
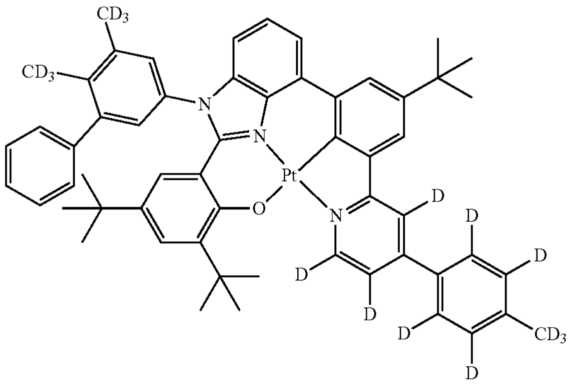
1646
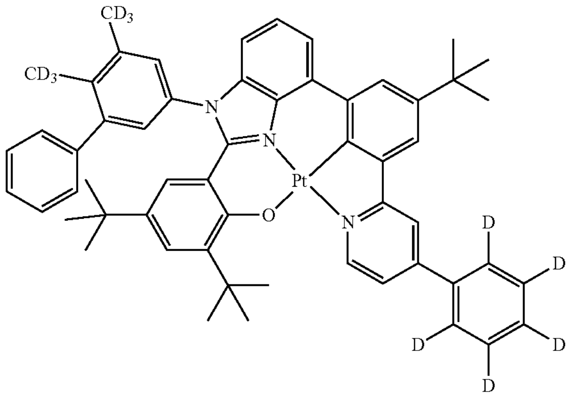
1647
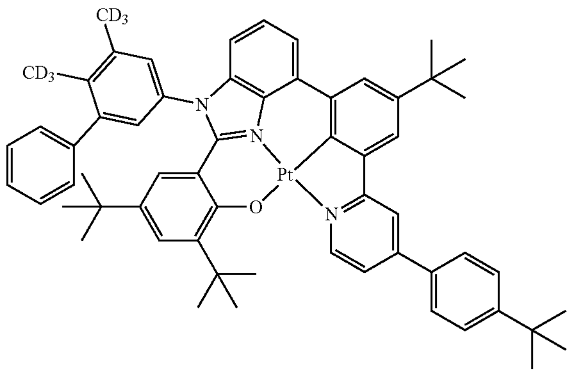

-continued
1648
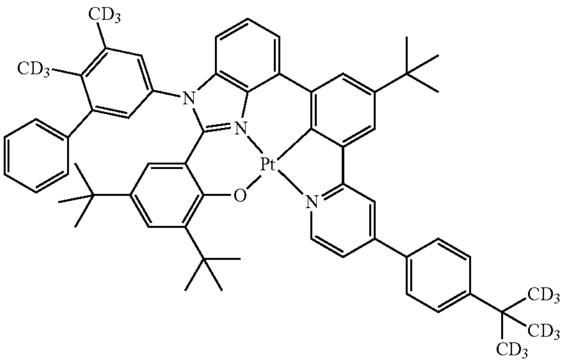
1649
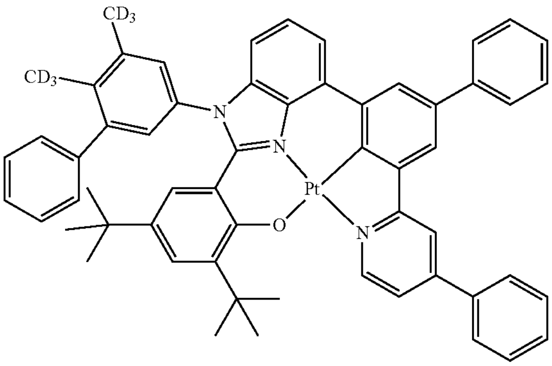
1650
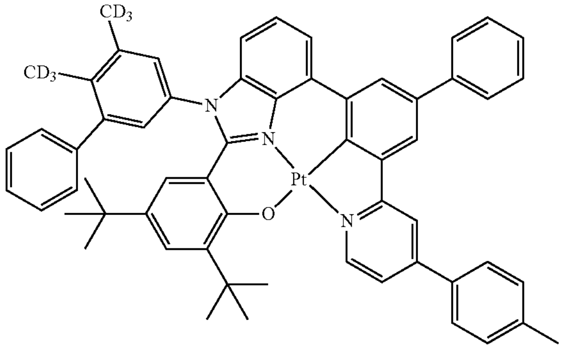
1651
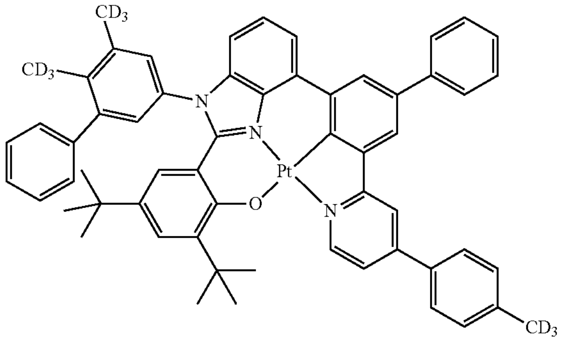
-continued
1652
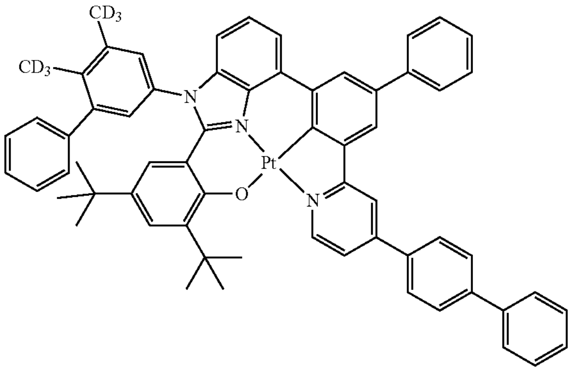
1653
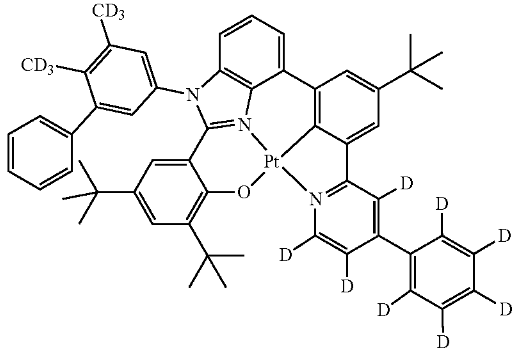
1654
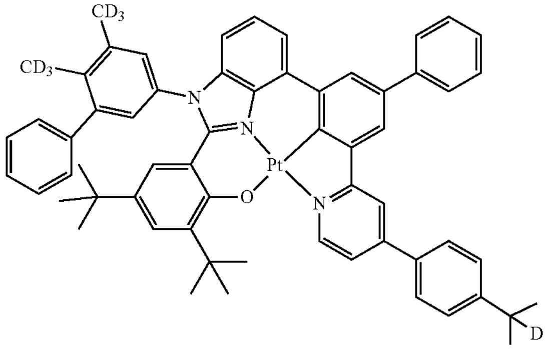
1655
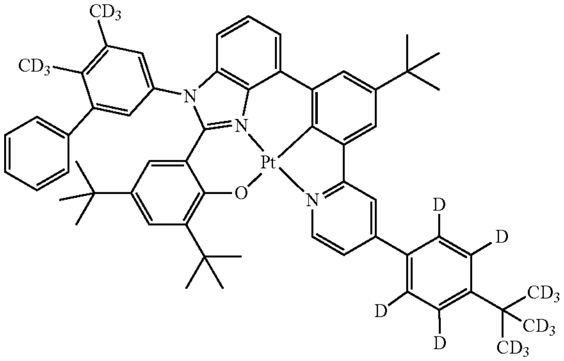

-continued
1656
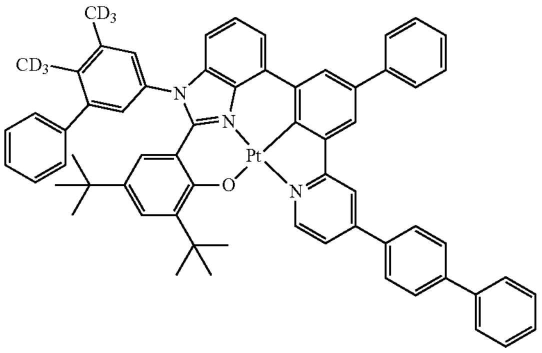
1657
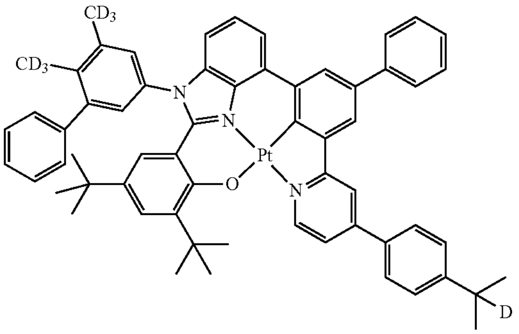
1658
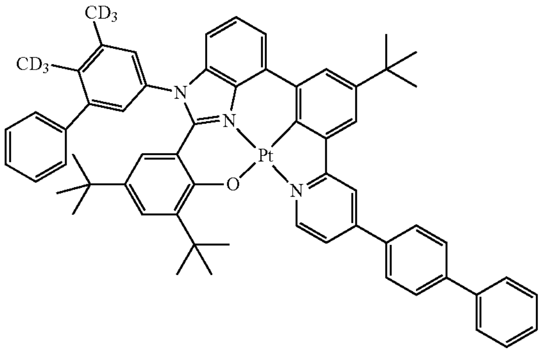
1659
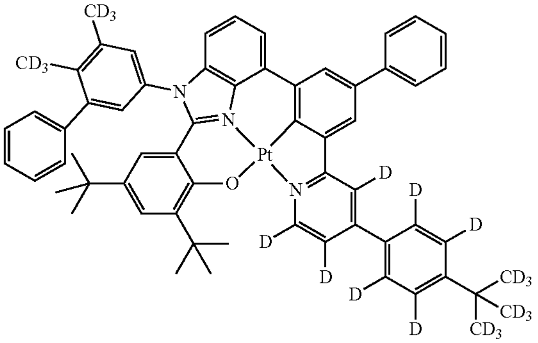
1660
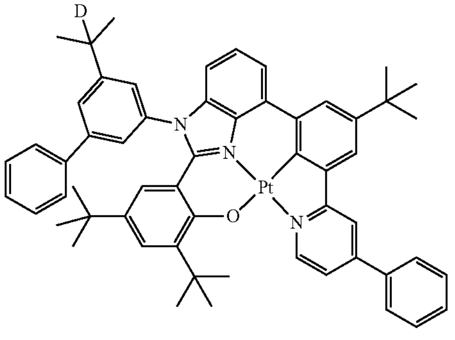
1661
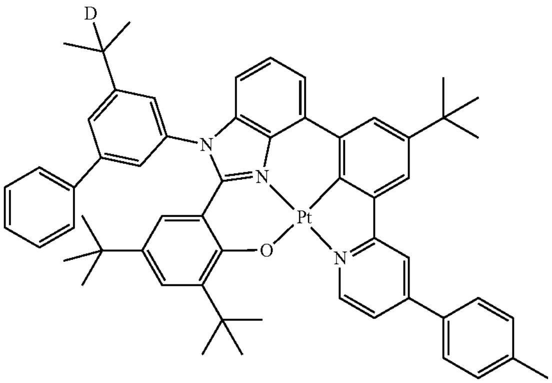
1662
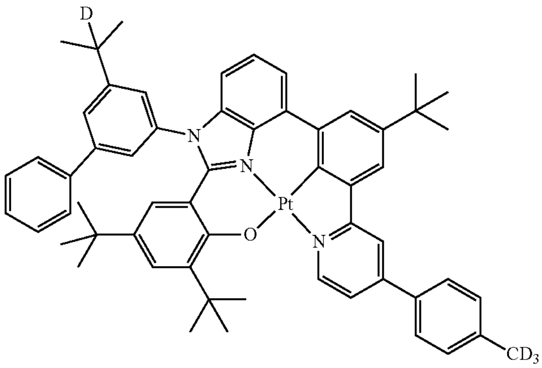

-continued
1663
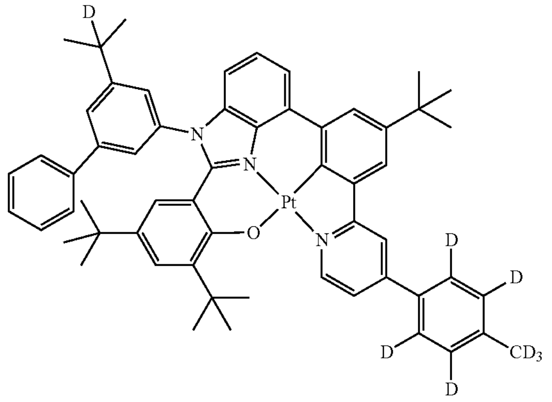
1664
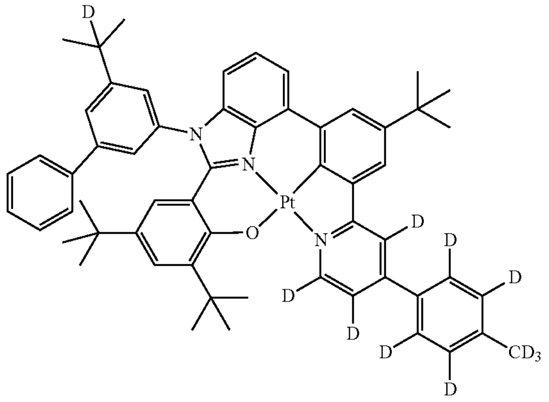
1665
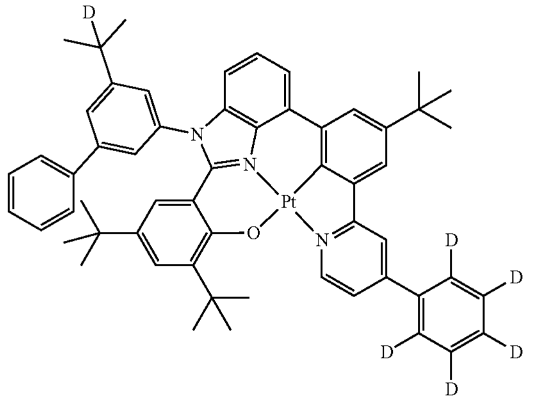
1666
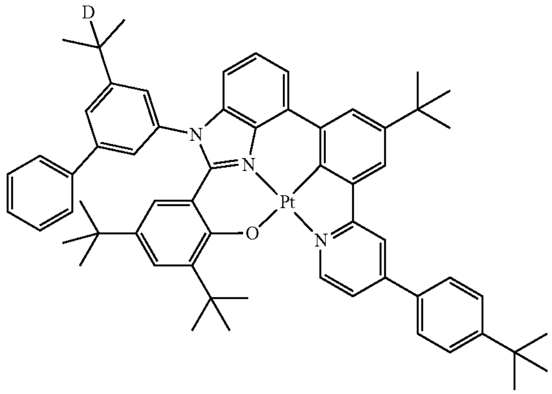
1667
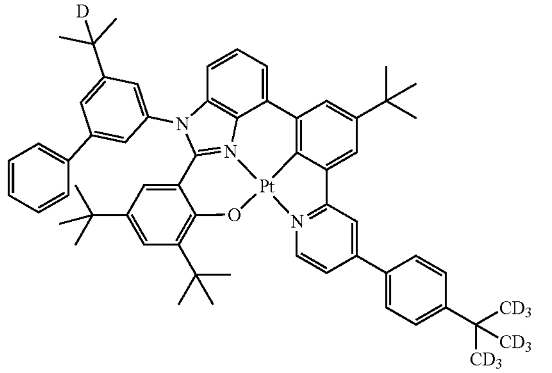
1668
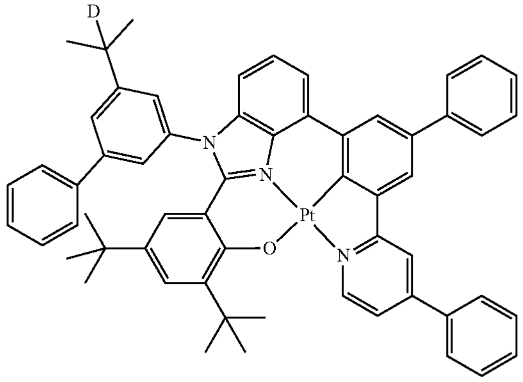
1669
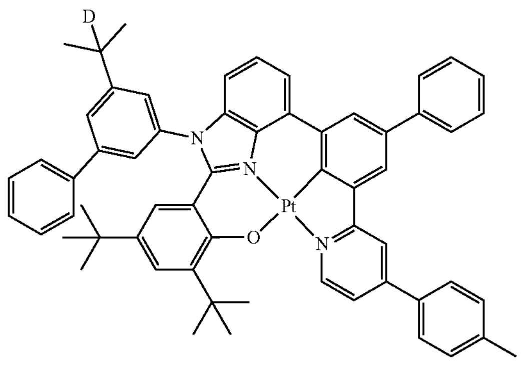
1670
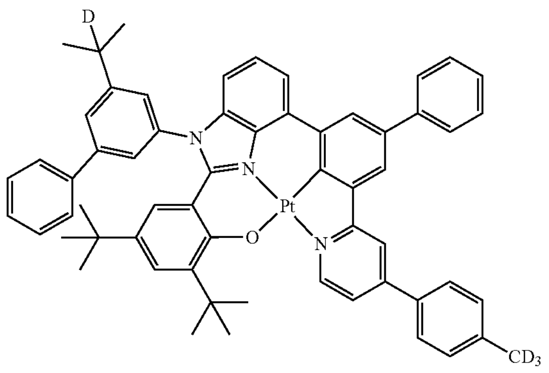

-continued
1671
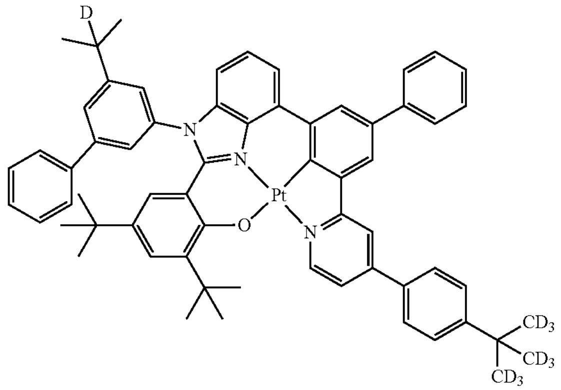
1672
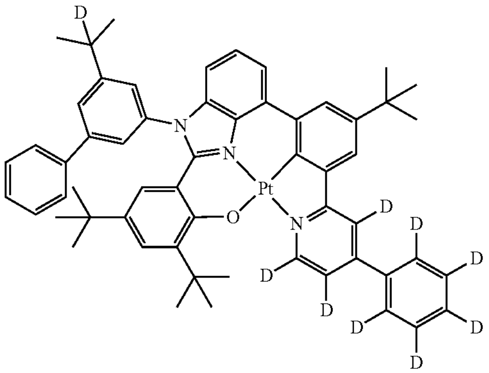
1673
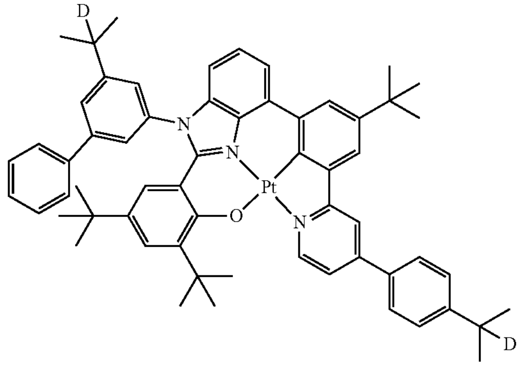
1674
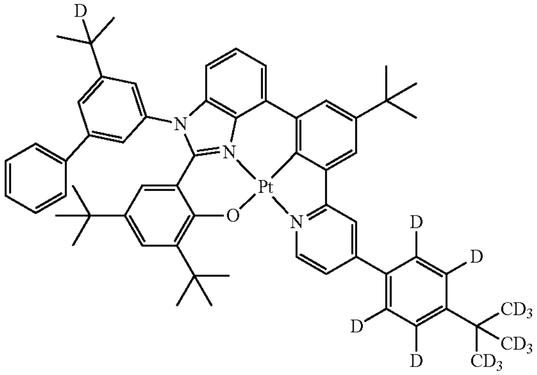
1675
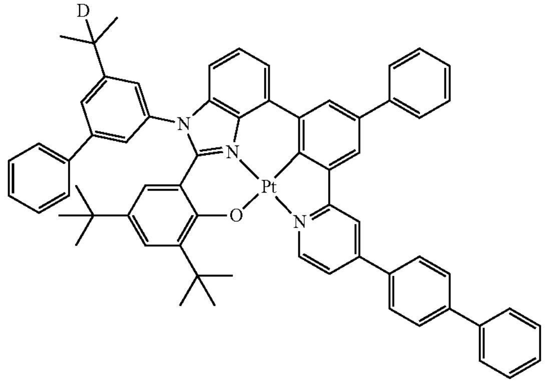
1676
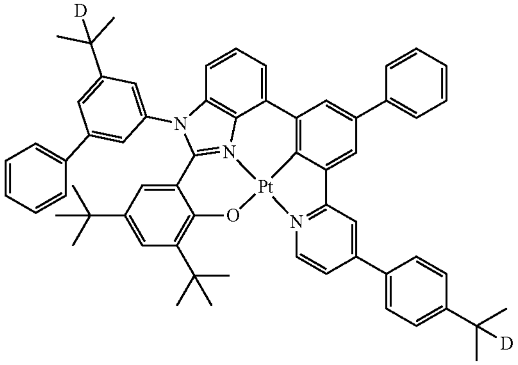
1677
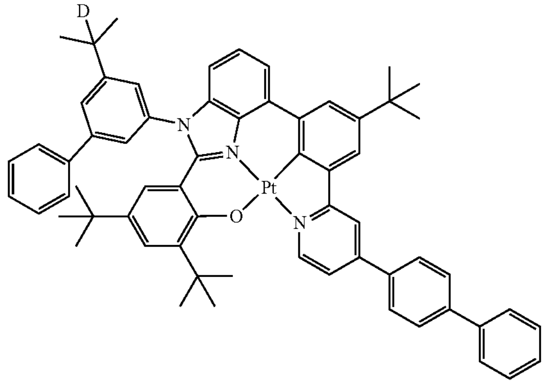
1678
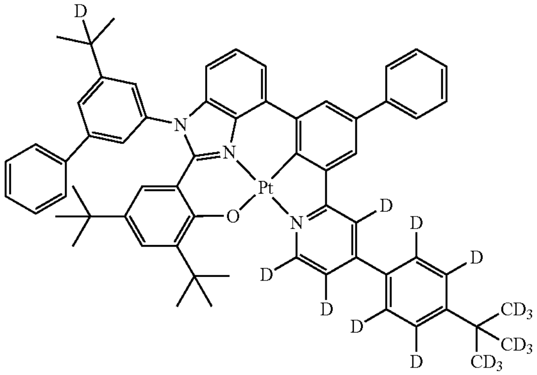

-continued
1679
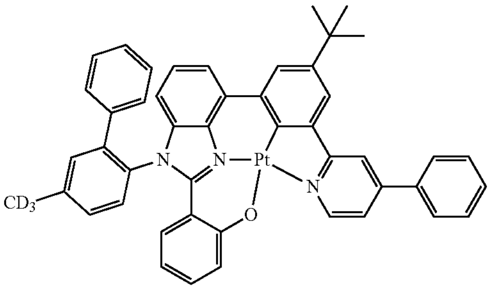
1680
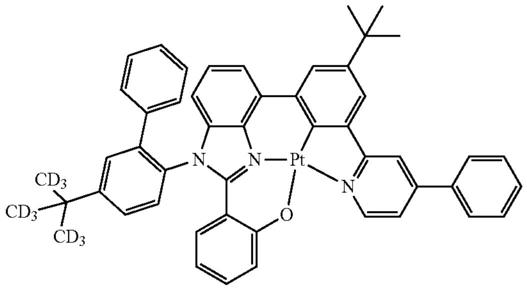
1681
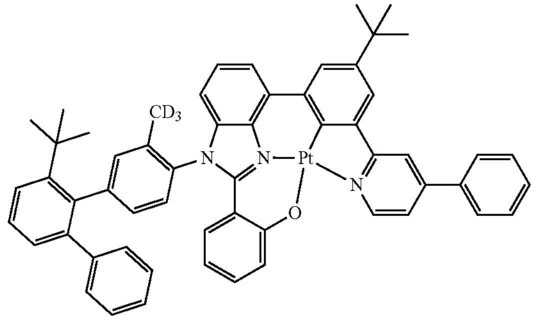
1682
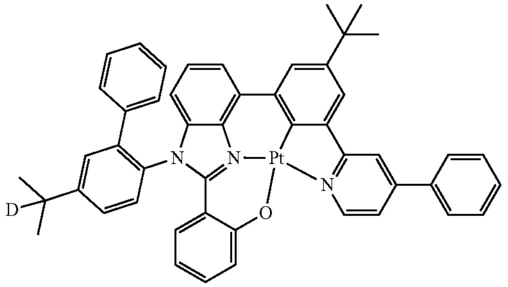
1683
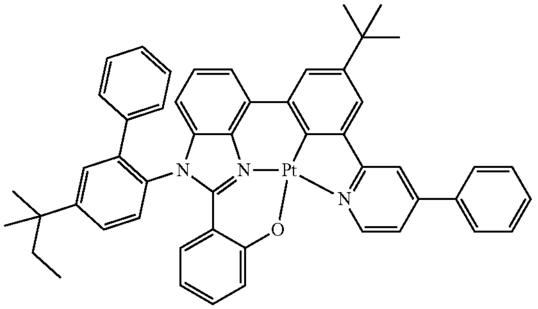
1684
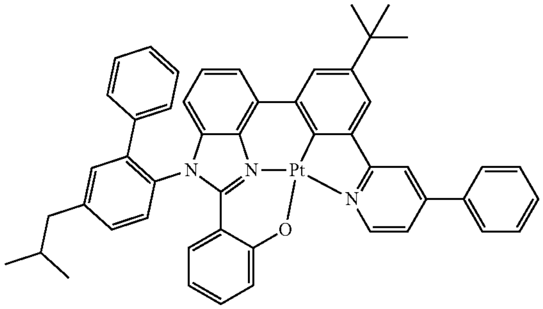
1685
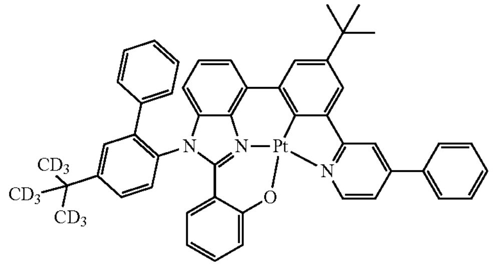
1686
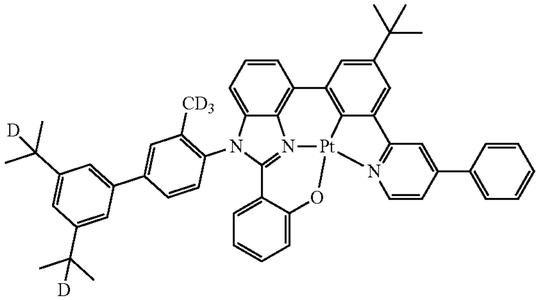
1687
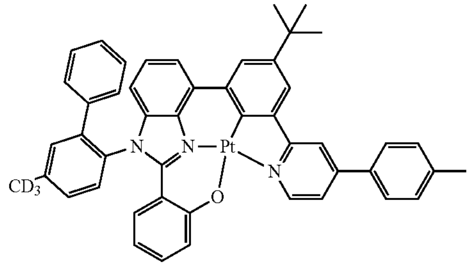
1688
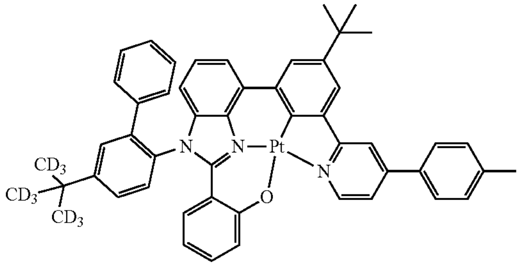

-continued
1689
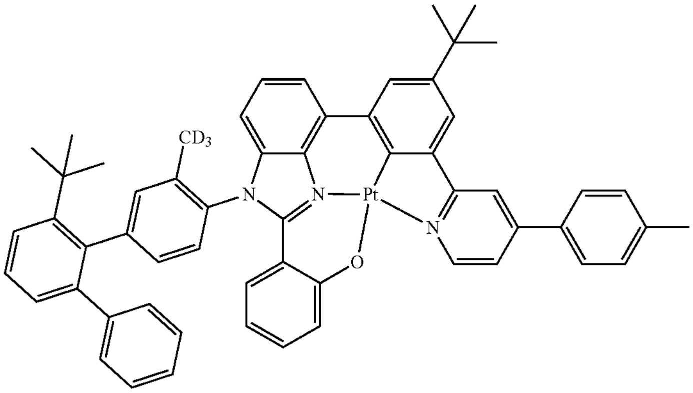
1690
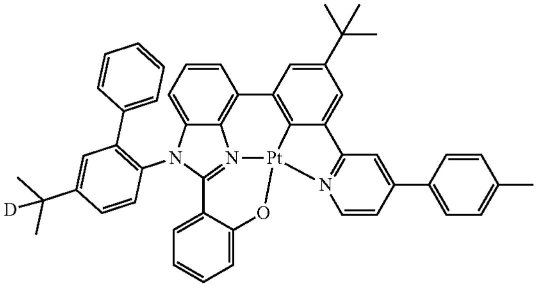
1691
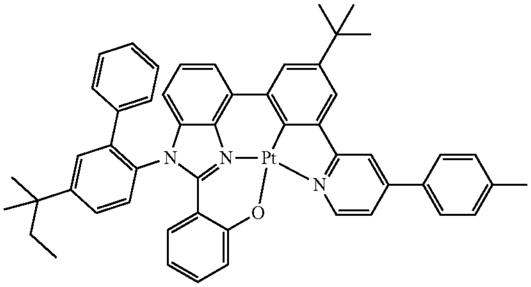
1692
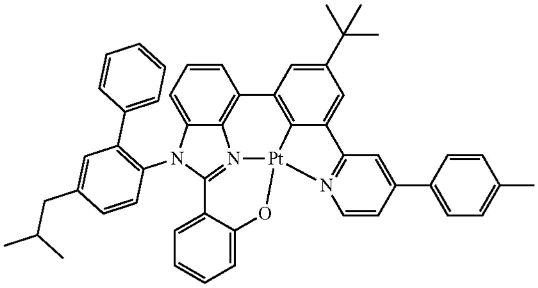
1693
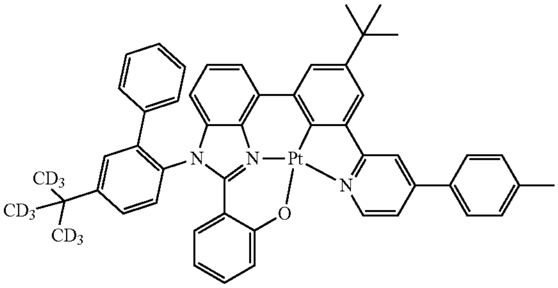
1694
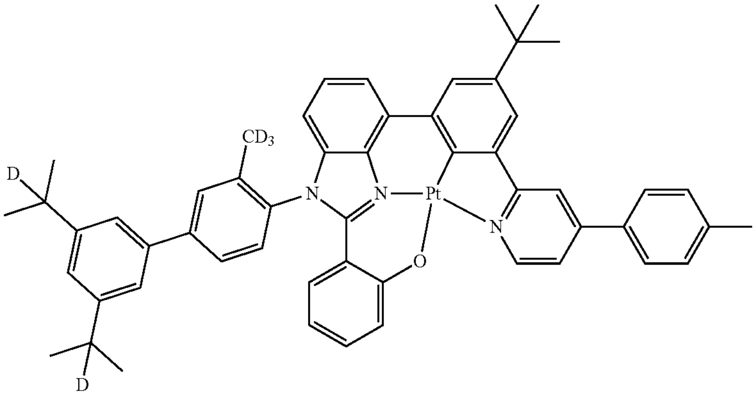

-continued
1695
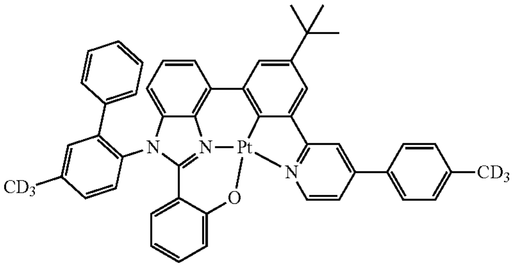
1696
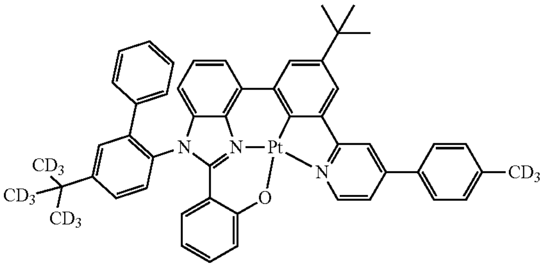
1697
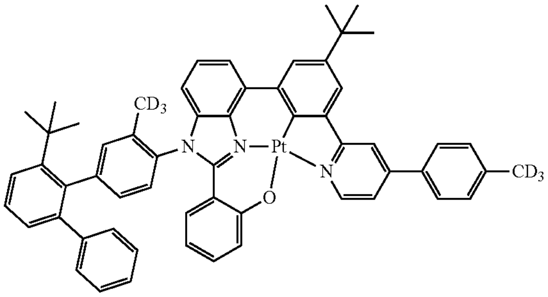
1698
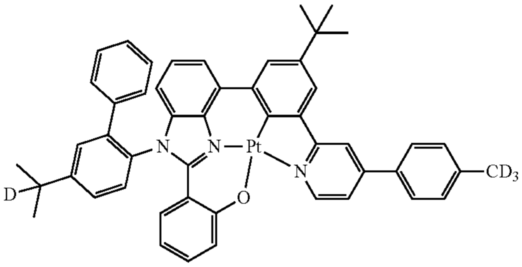
1699
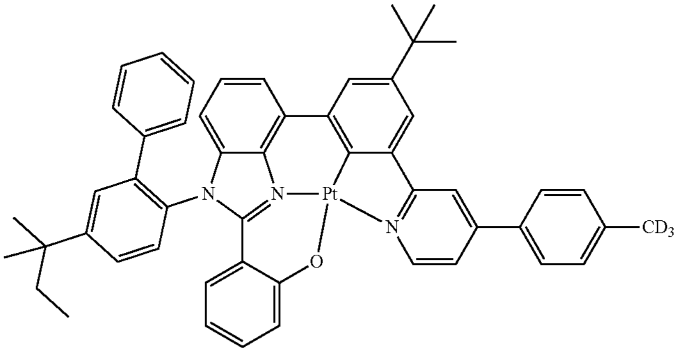
1700
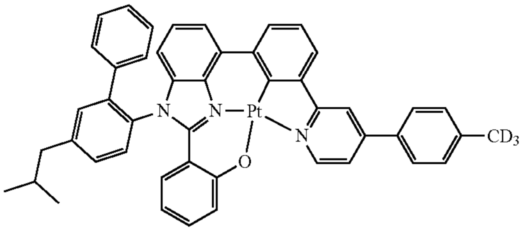
1701
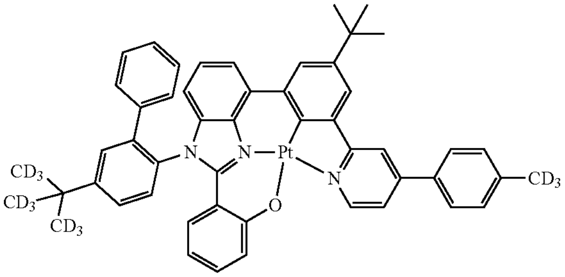

-continued
1702
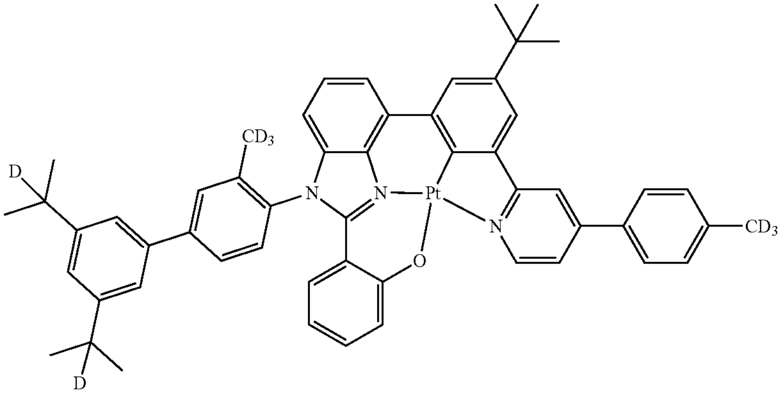
1703
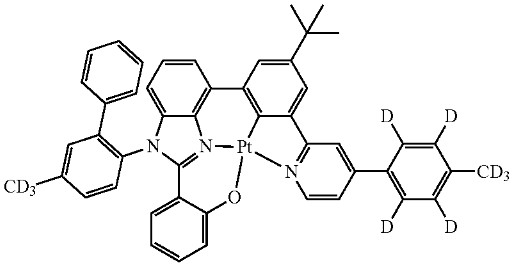
1704
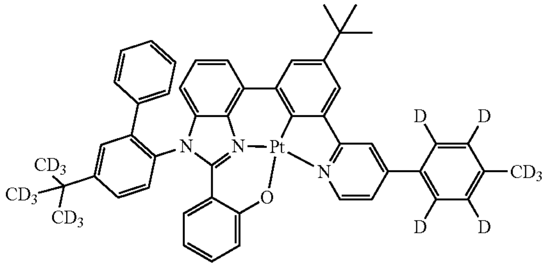
1705
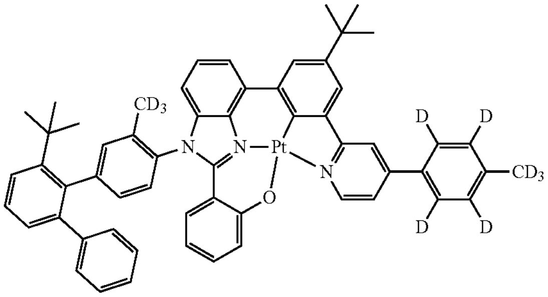
1706
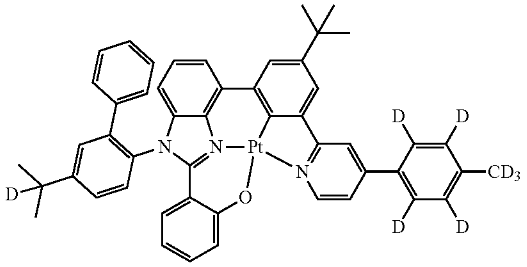
1707
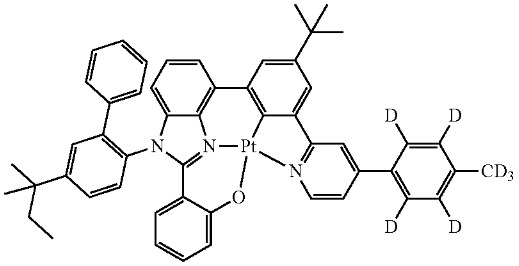
1708
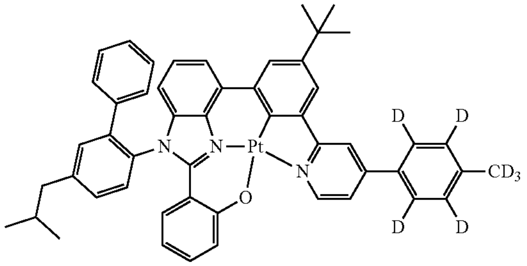
1709
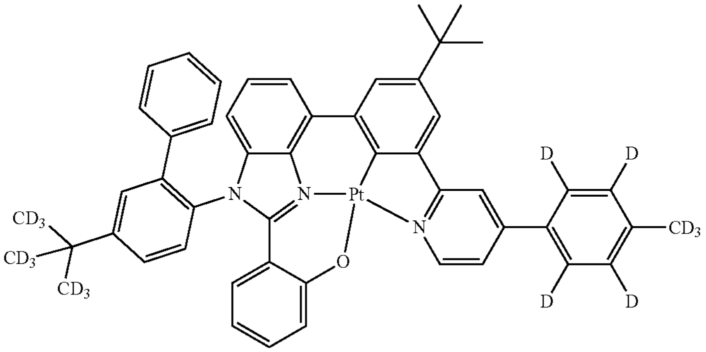

-continued
1710
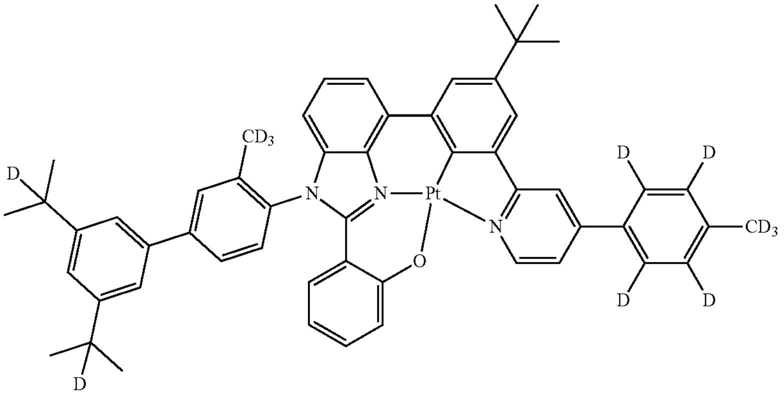
1711
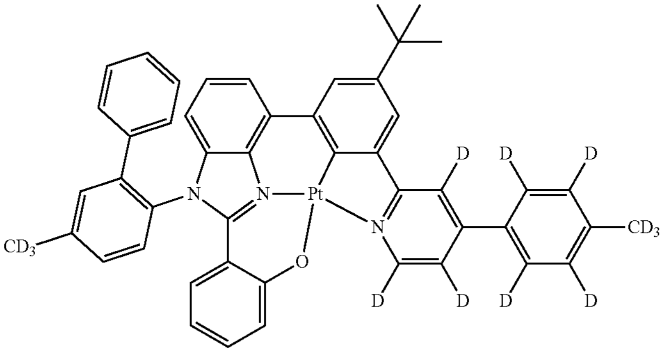
1712
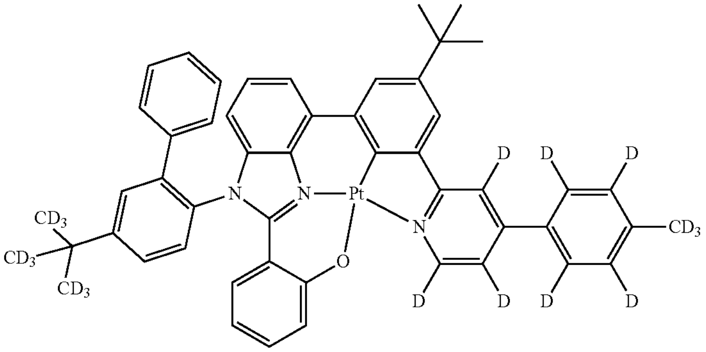
1713
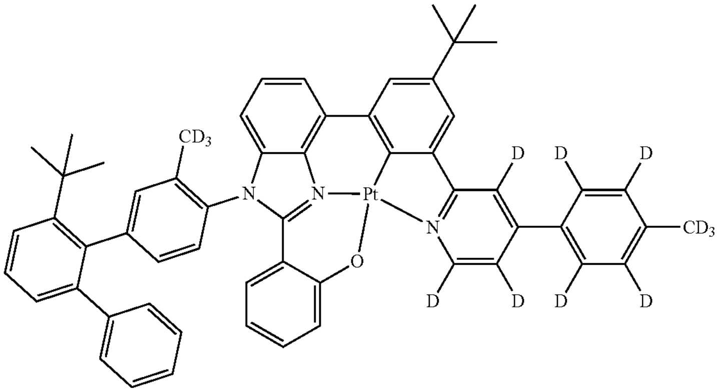

-continued
1714
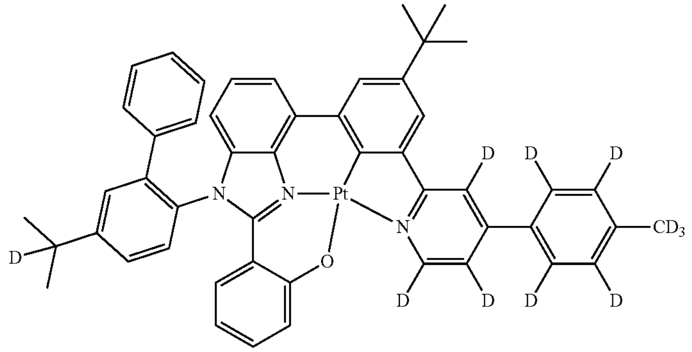
1715
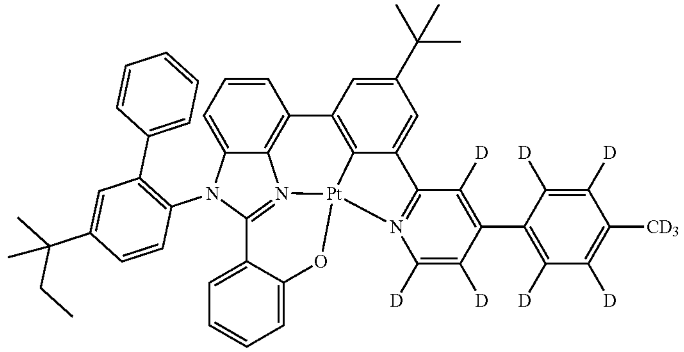
1716
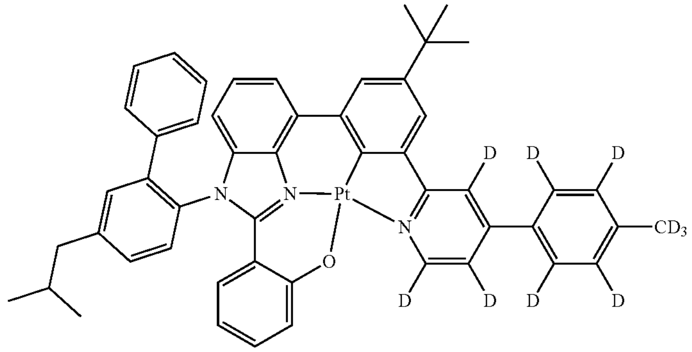
1717
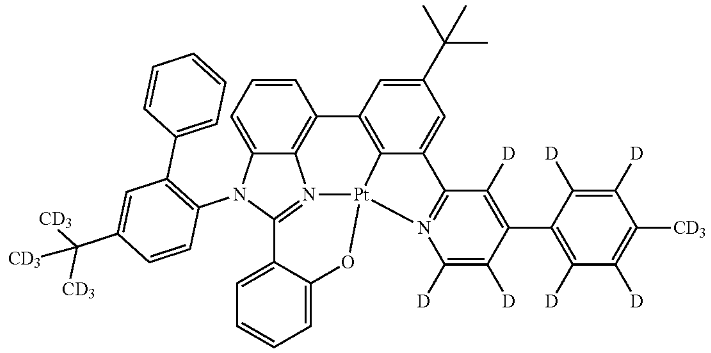

-continued
1718
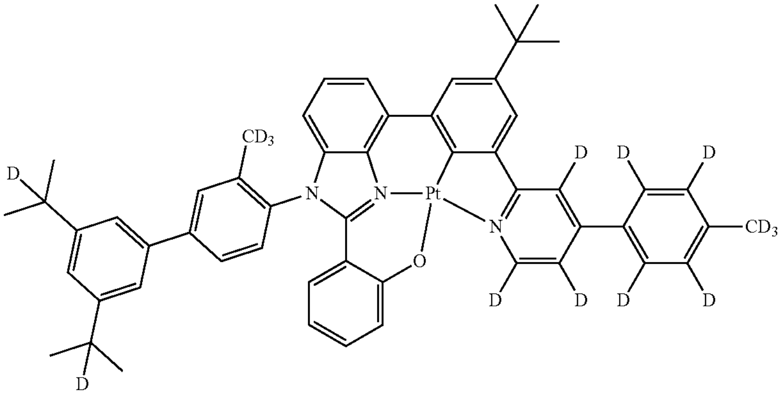
1719
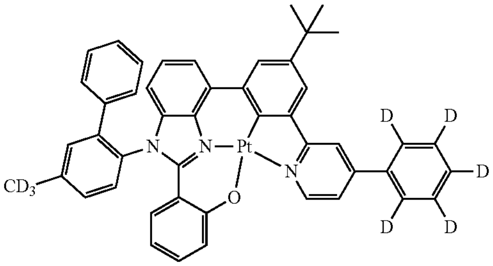
1720
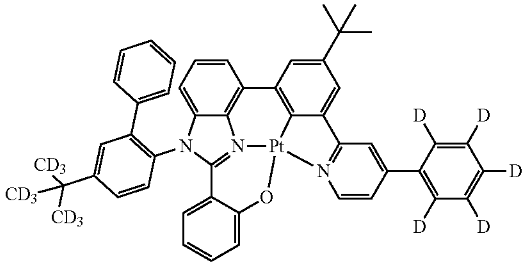
1721
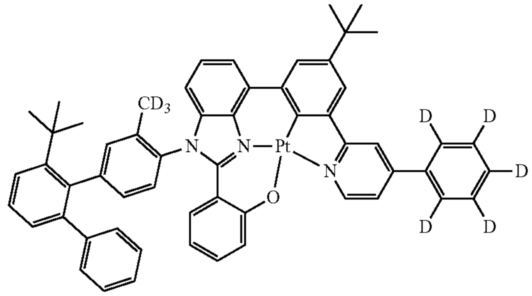
1722
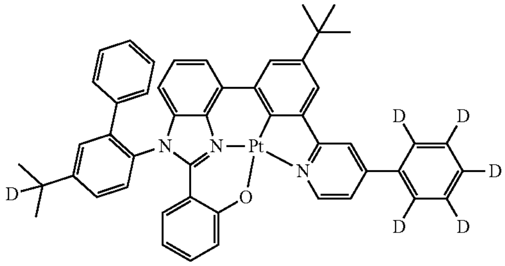
1723
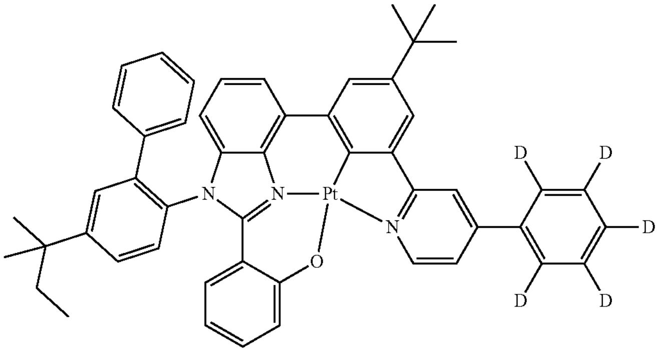
1724
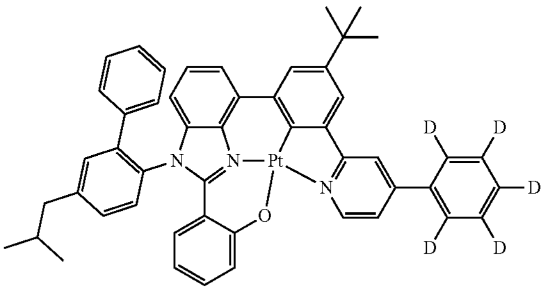
1725
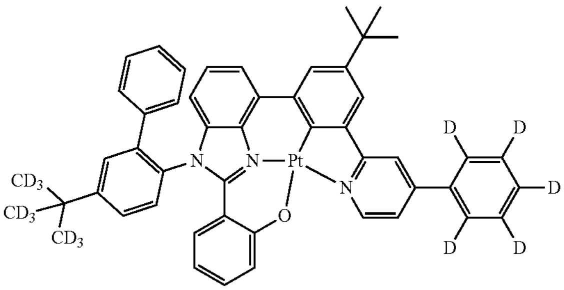

-continued
1726
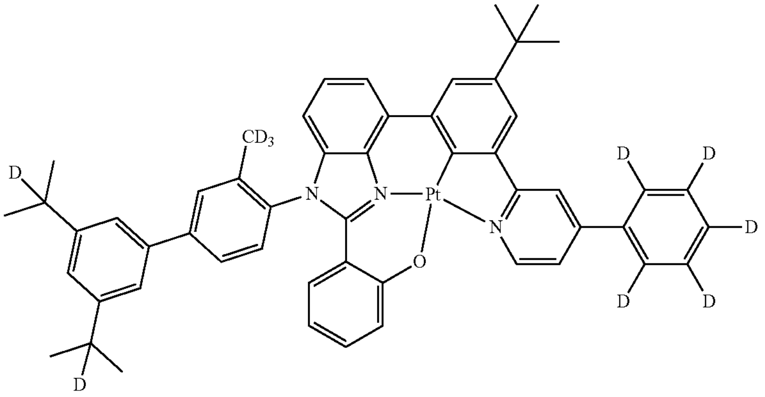
1727
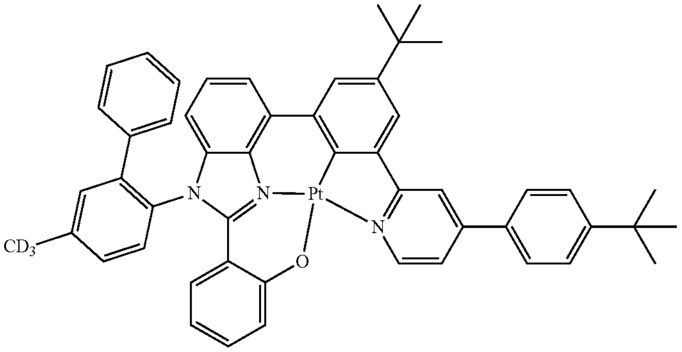
1728
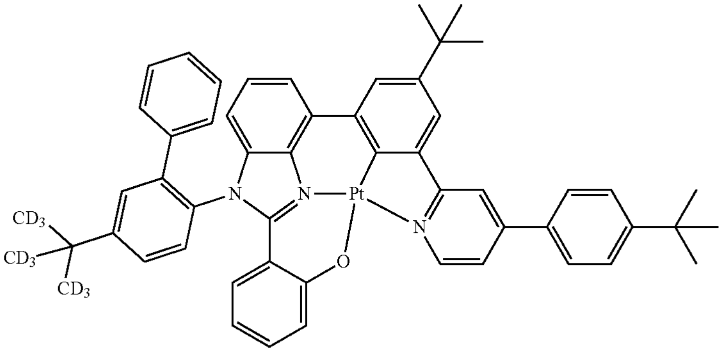
1729
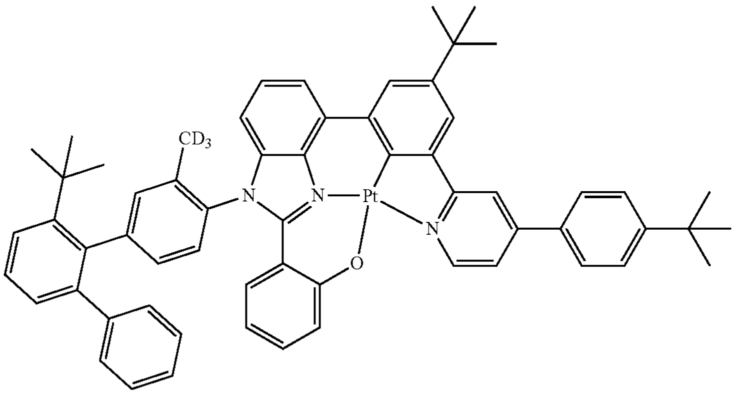

-continued
1730
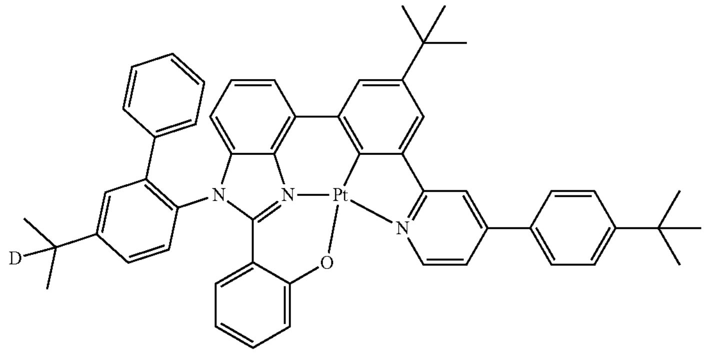
1731
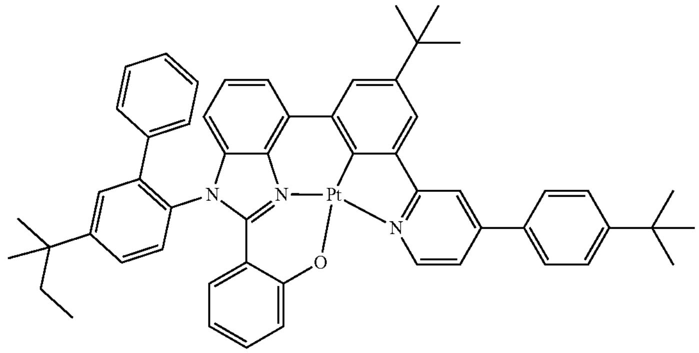
1732
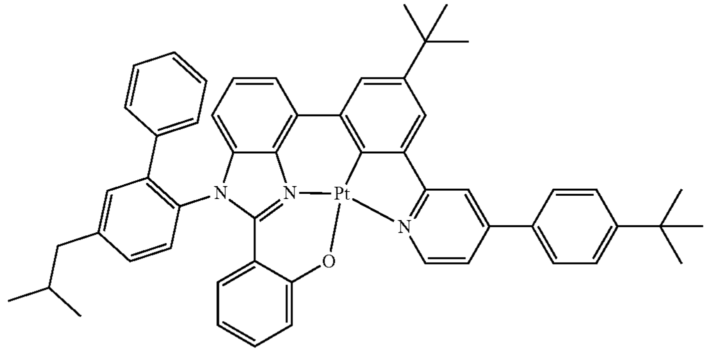
1733
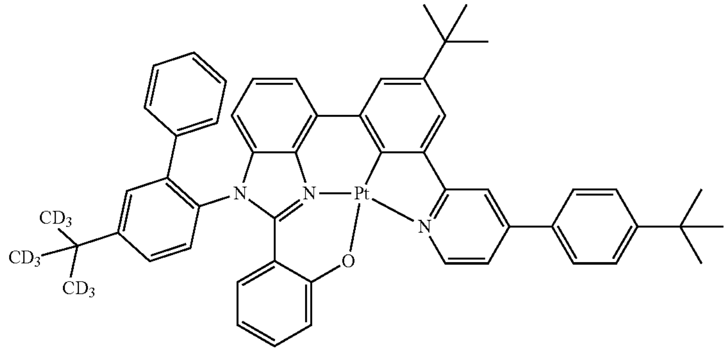

-continued
1734
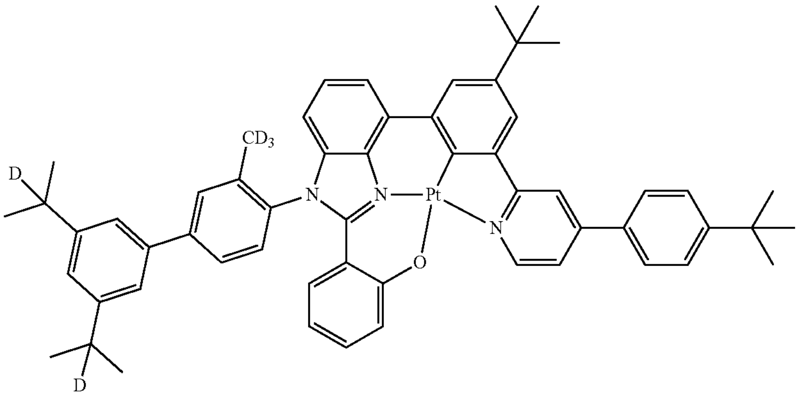
1735
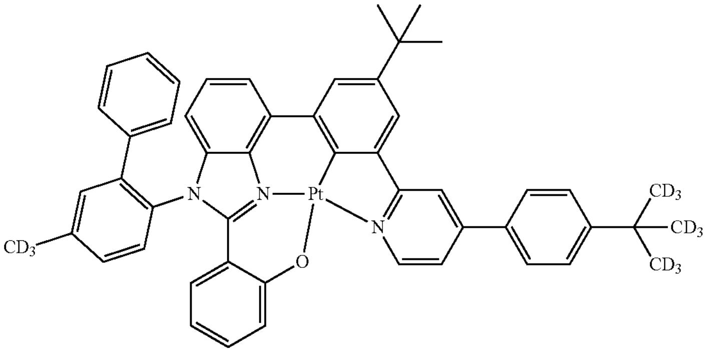
1736
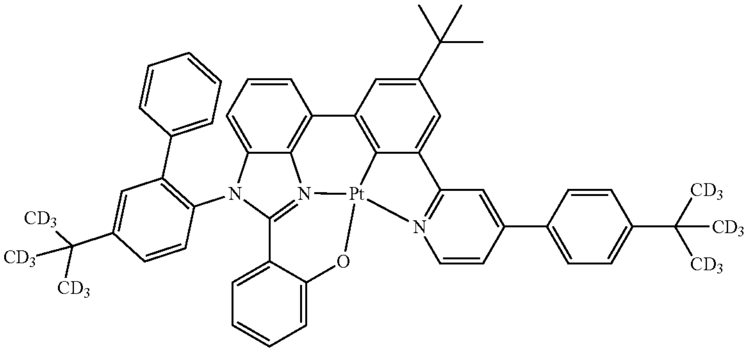
1737
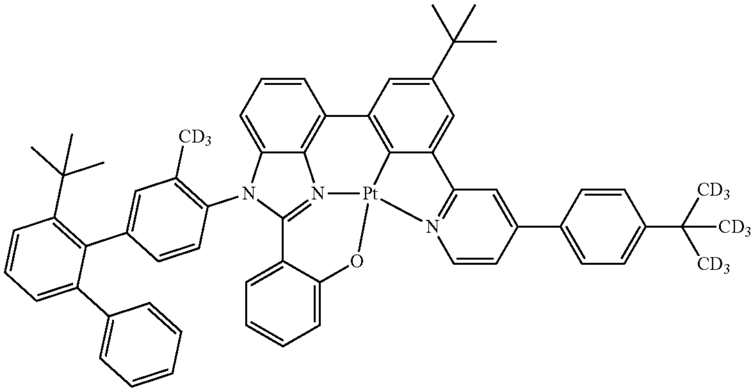

-continued
1738
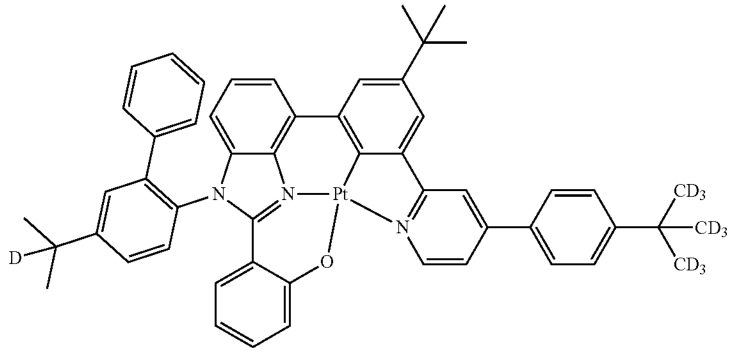
1739
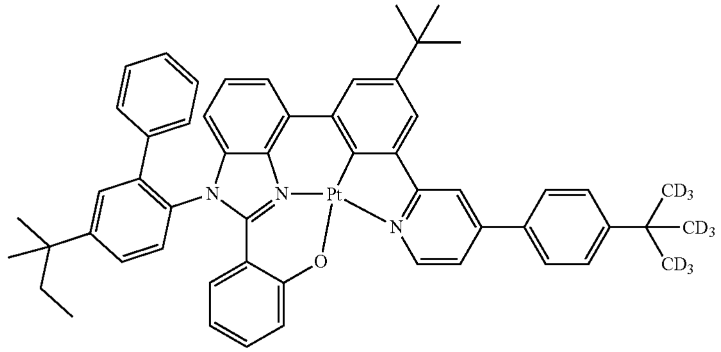
1740
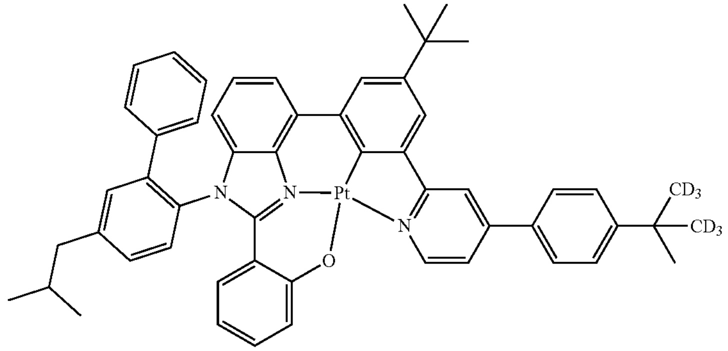
1741
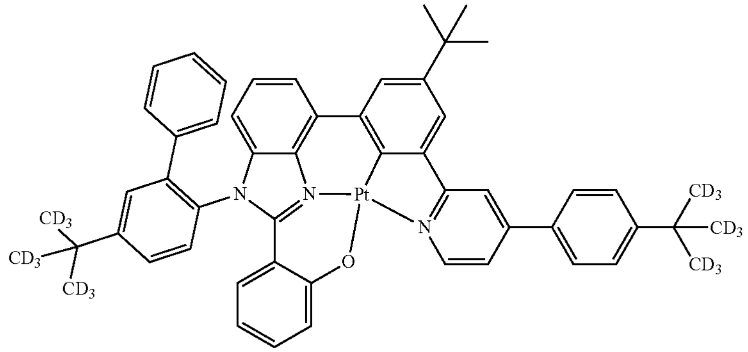

-continued
1742
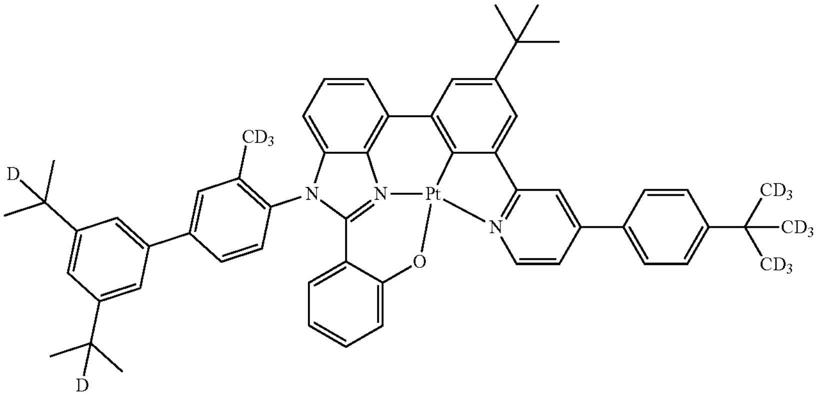
1743
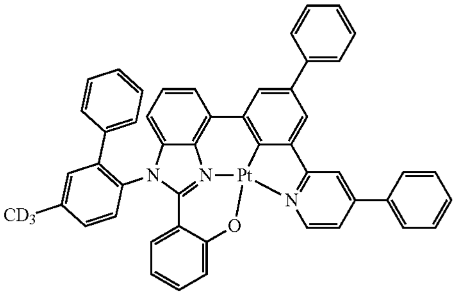
1744
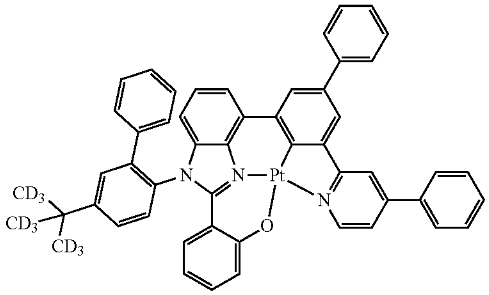
1745
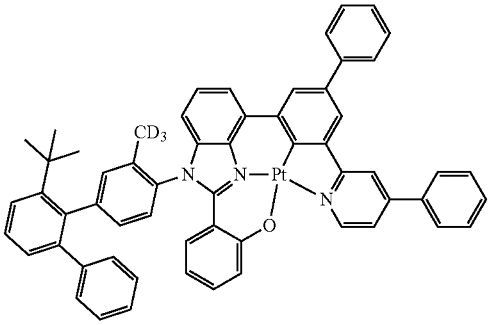
1746
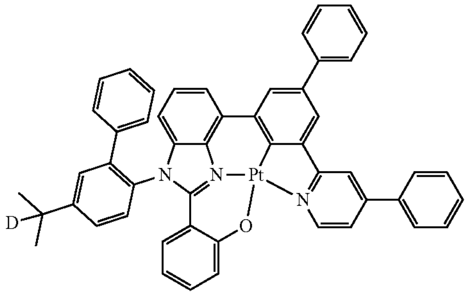
1747
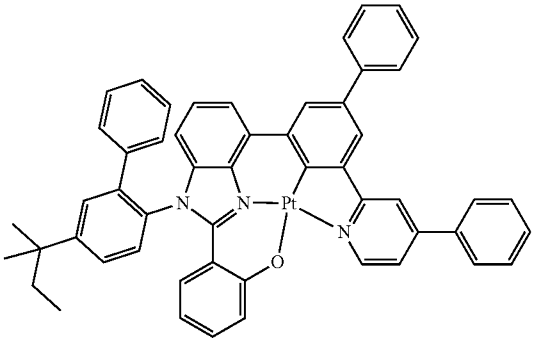
1748
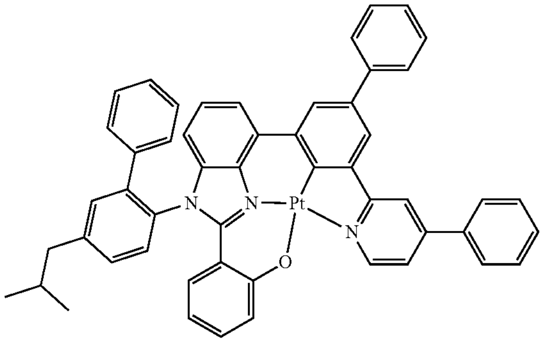

-continued
1749
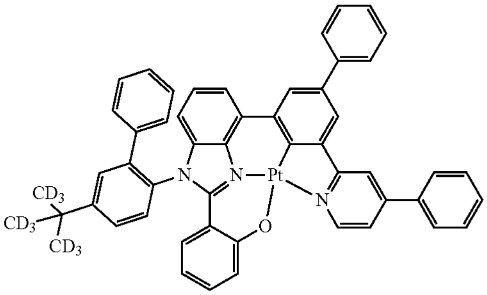
1750
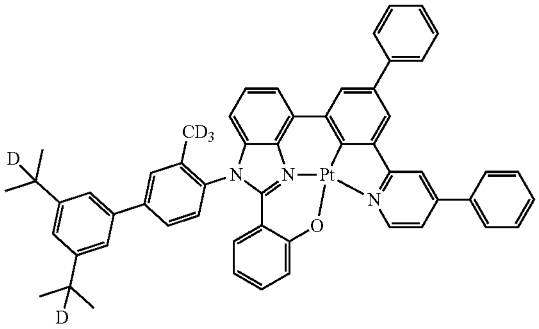
1751
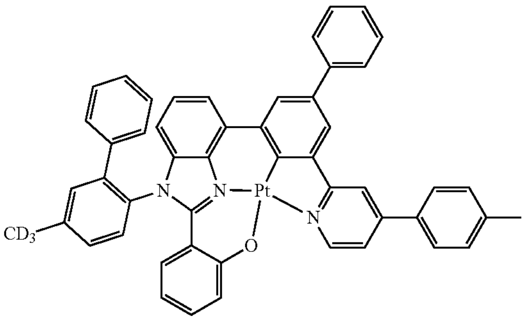
1752
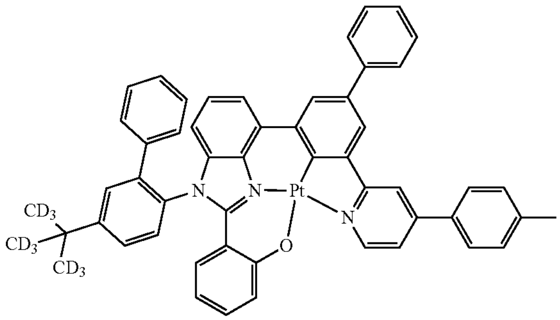
1753
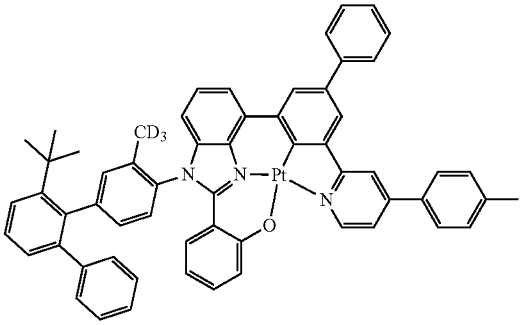
1754
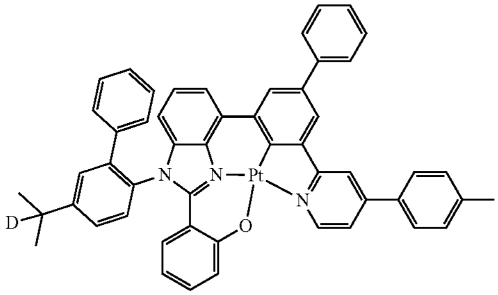
1755
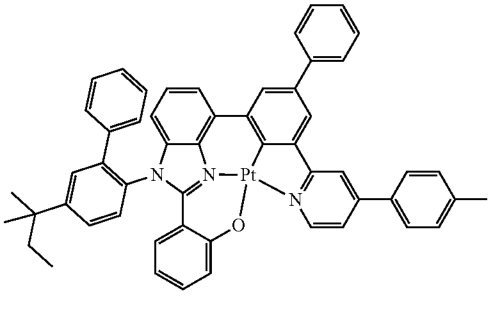
1756
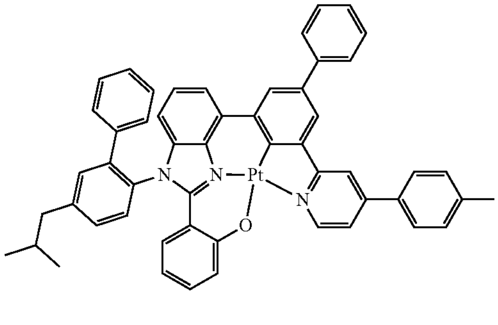

-continued
1757
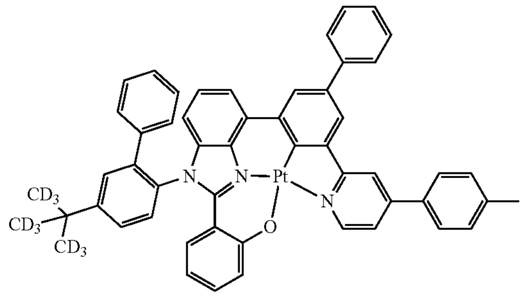
1758
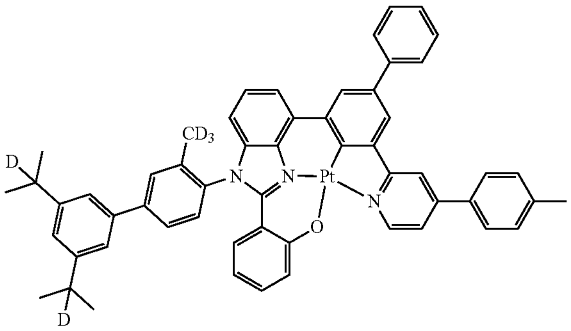
1759
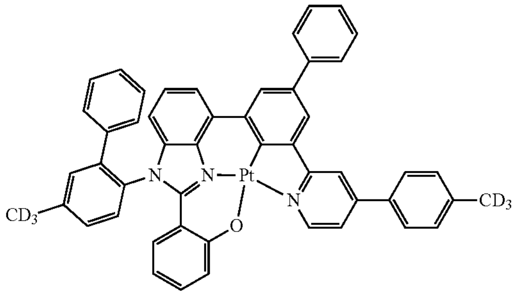
1760
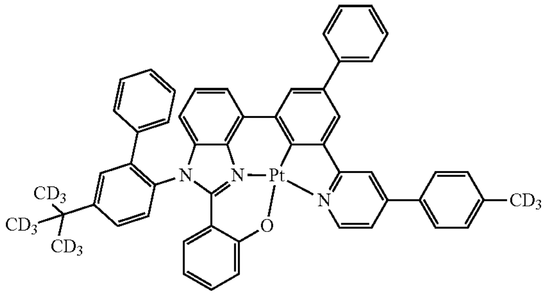
1761
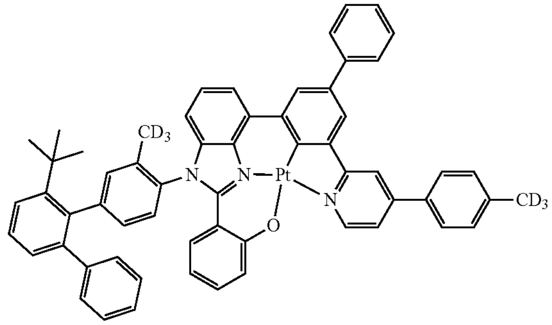
1762
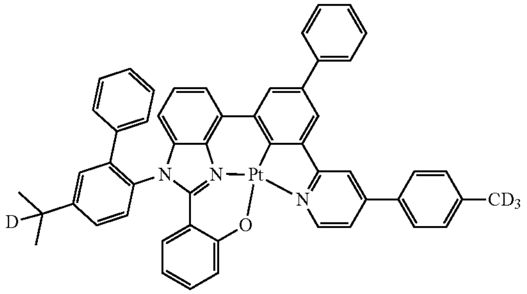
1763
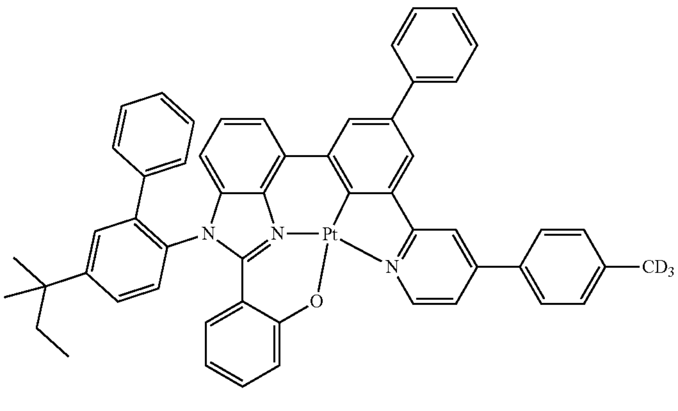

-continued
1764
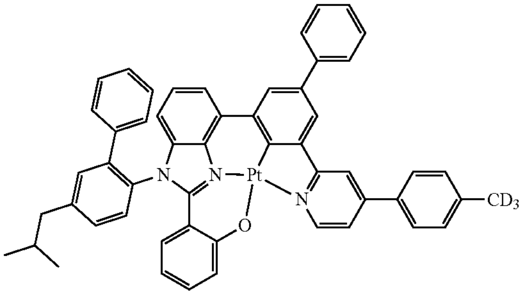
1765
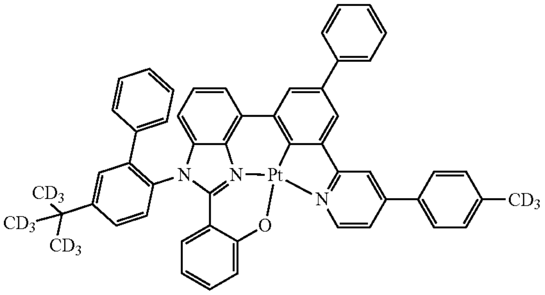
1766
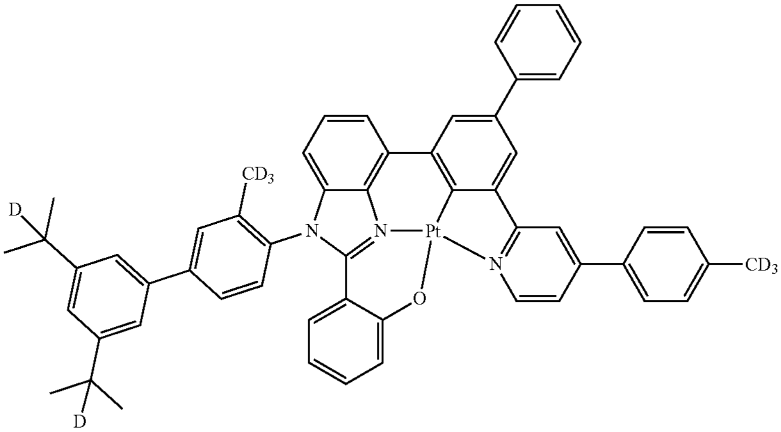
1767
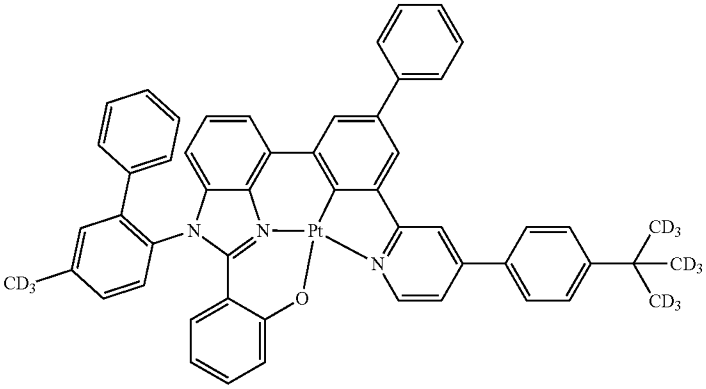
1768
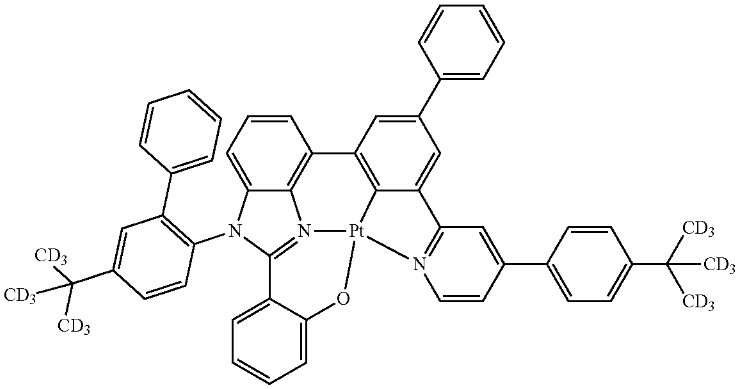

-continued
1769
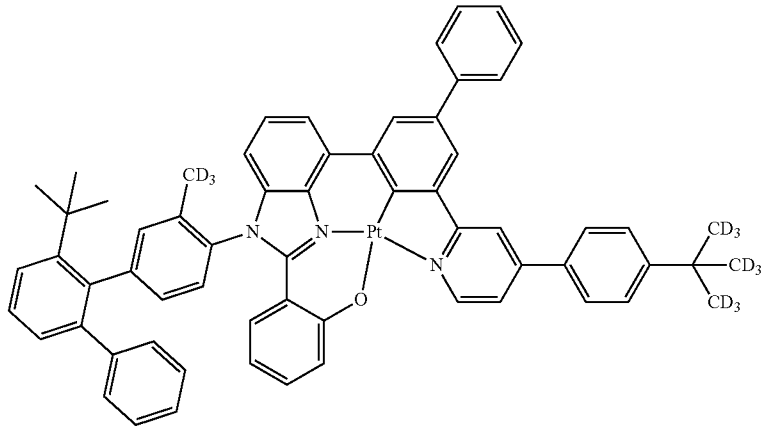
1770
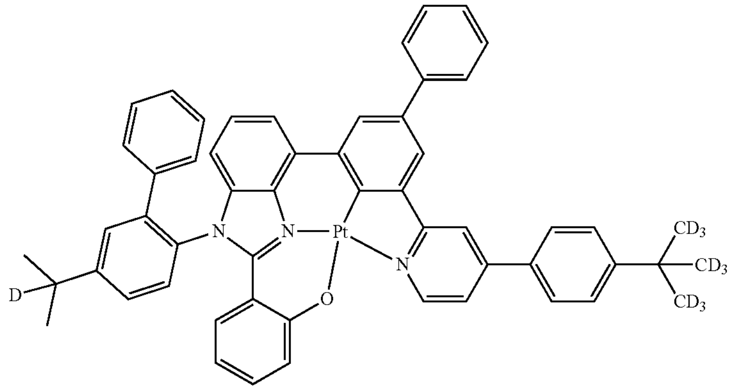
1771
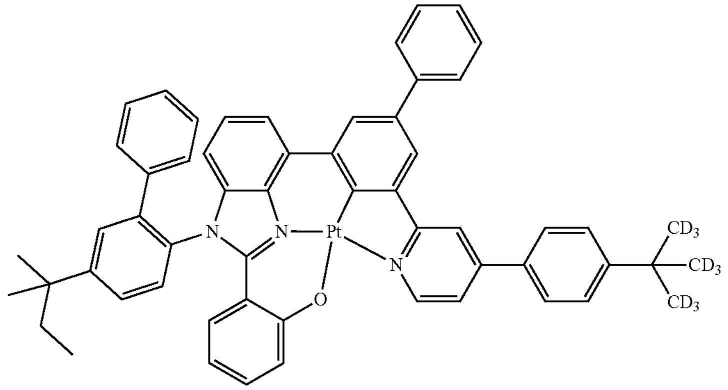
1772
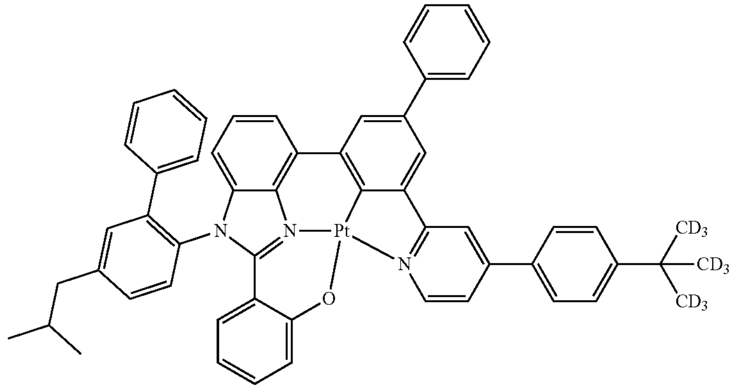

-continued
1773
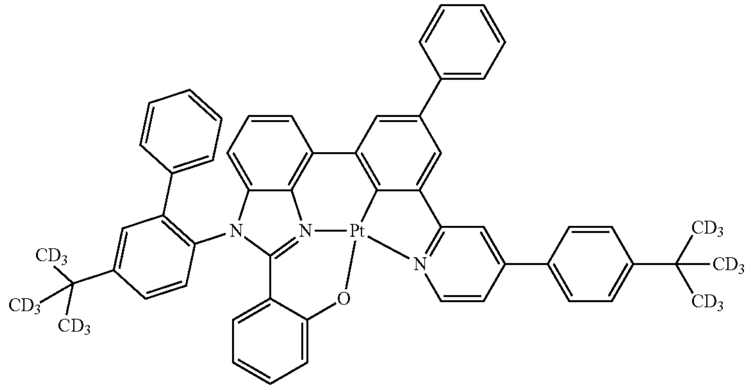
1774
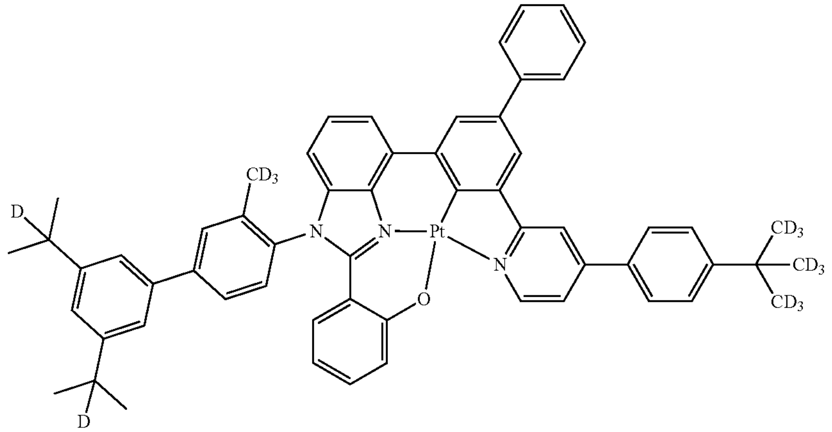
1775
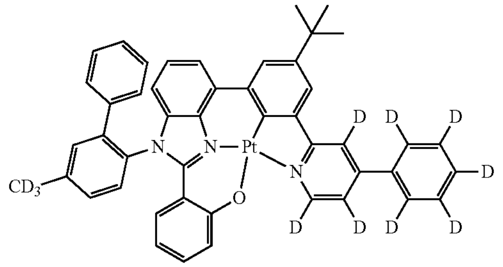
1776
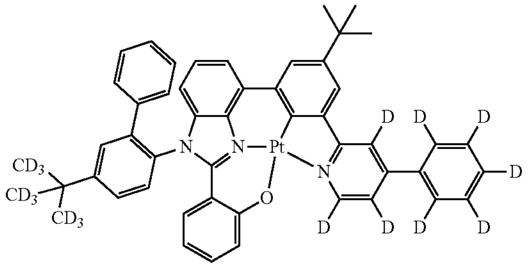
1777
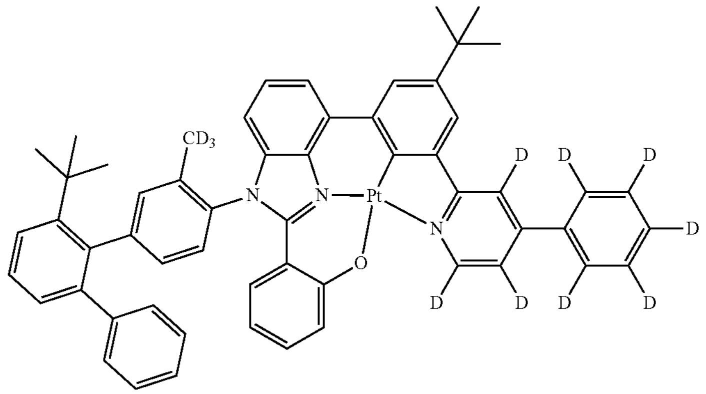

-continued
1778
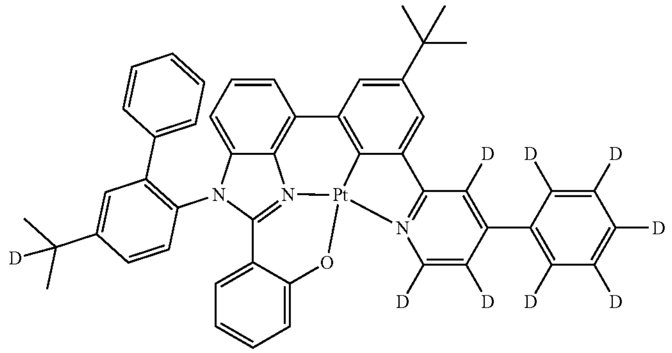
1779
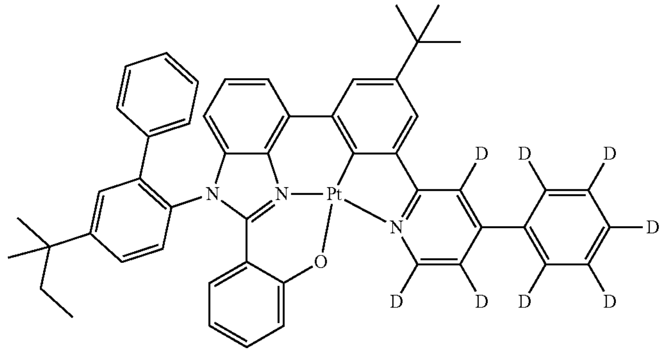
1780
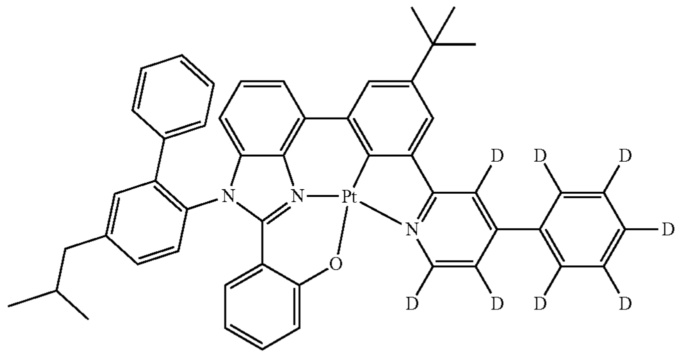
1781
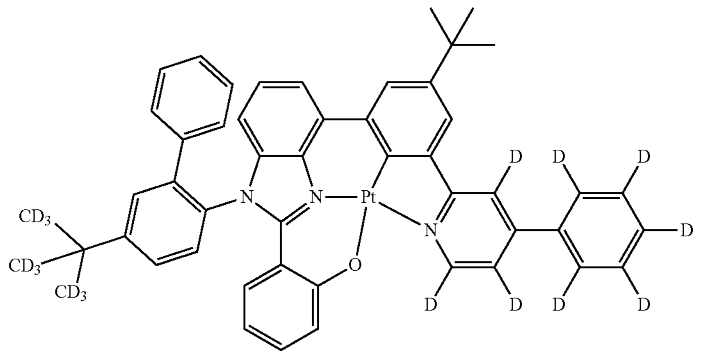

-continued
1782
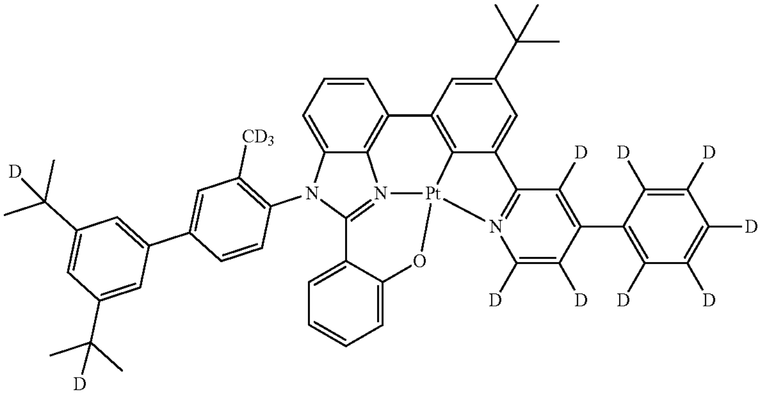
1783
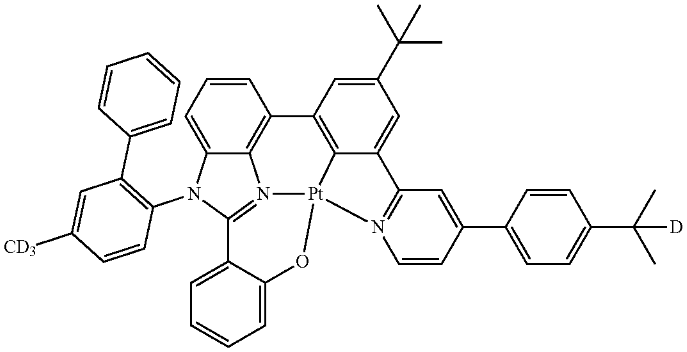
1784
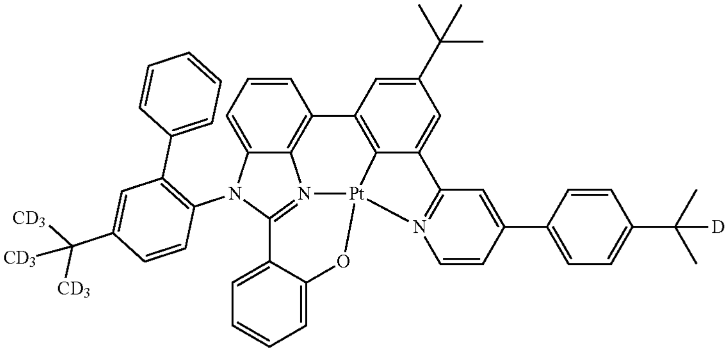
1785
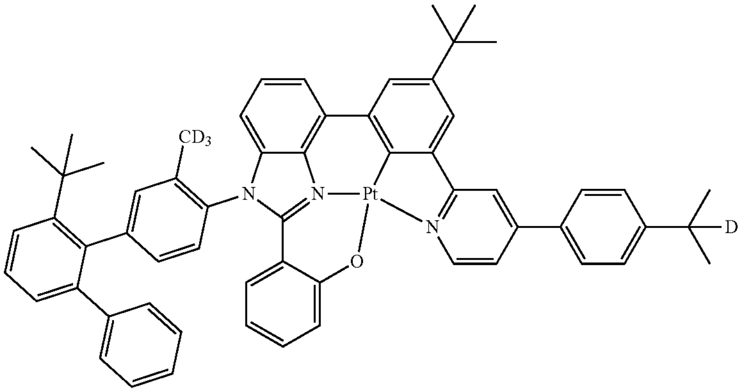

-continued
1786
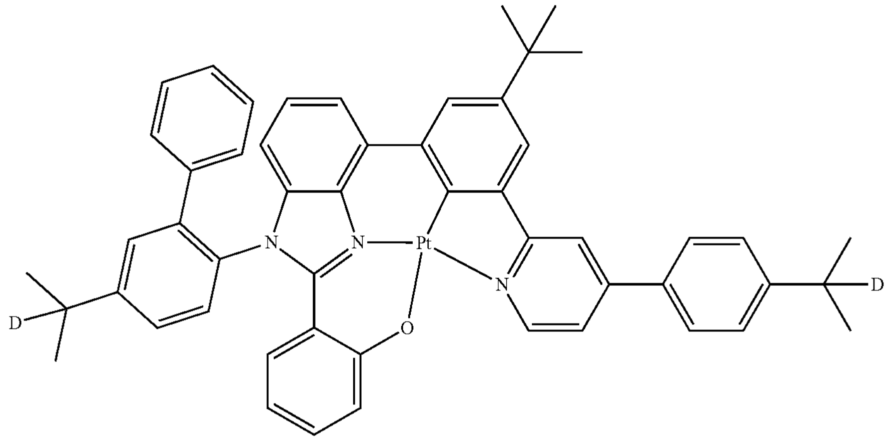
1787
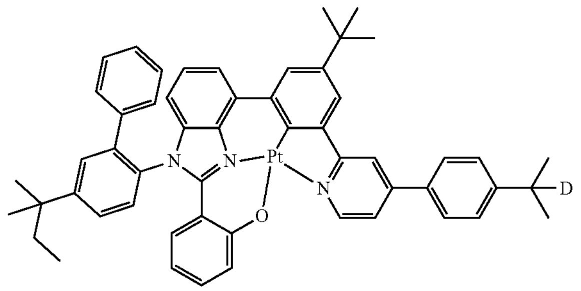
1788
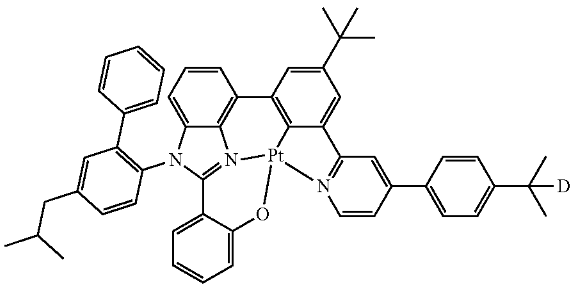
1789
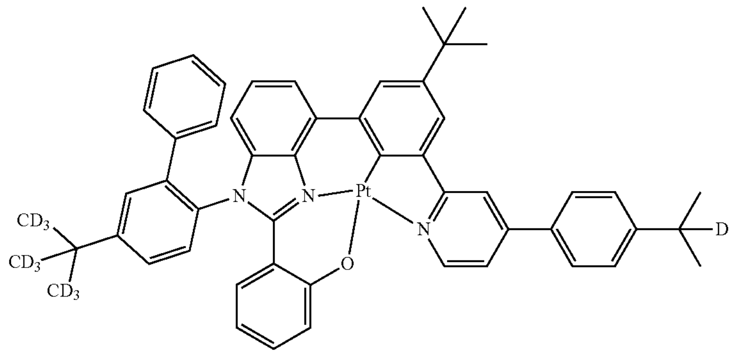
1790
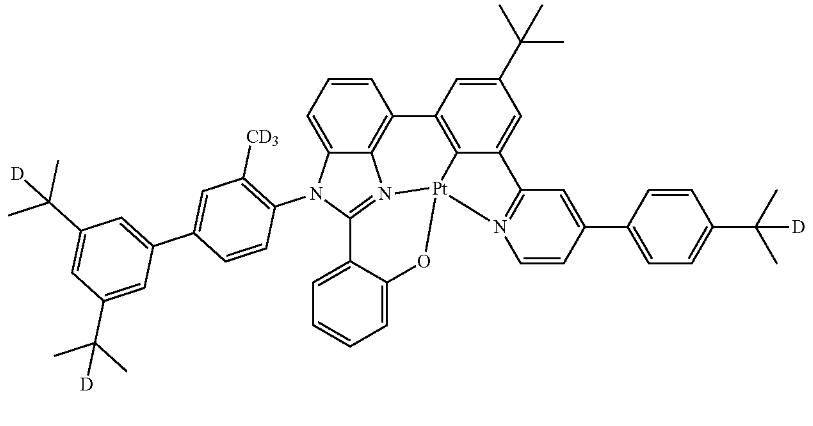

-continued
1791
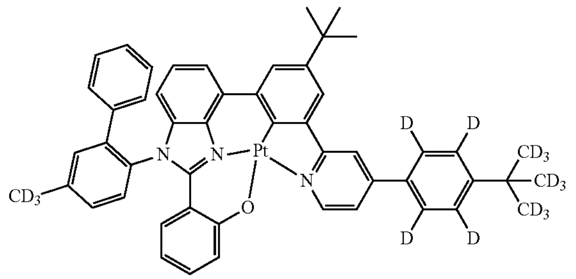
1792
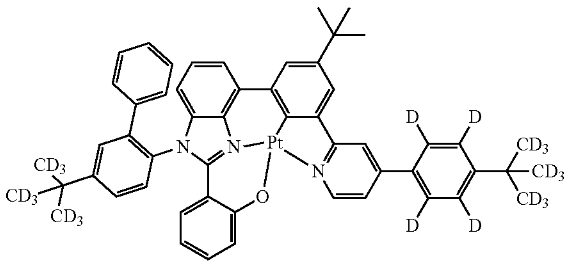
1793
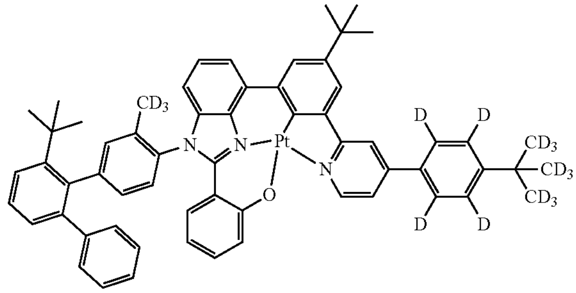
1794
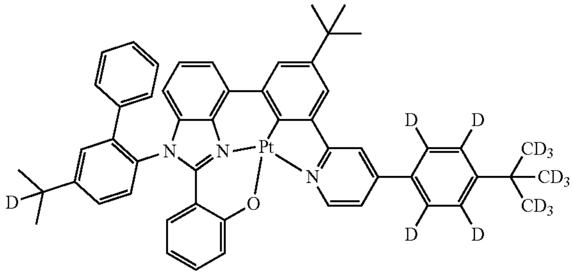
1795
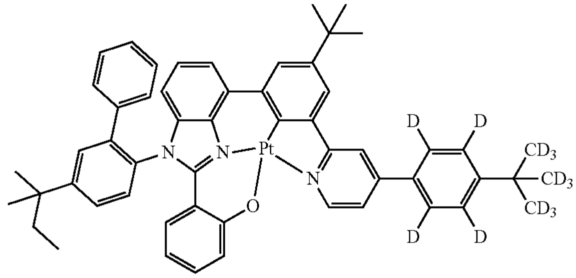
1796
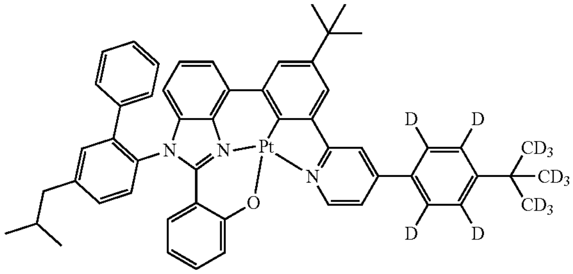
1797
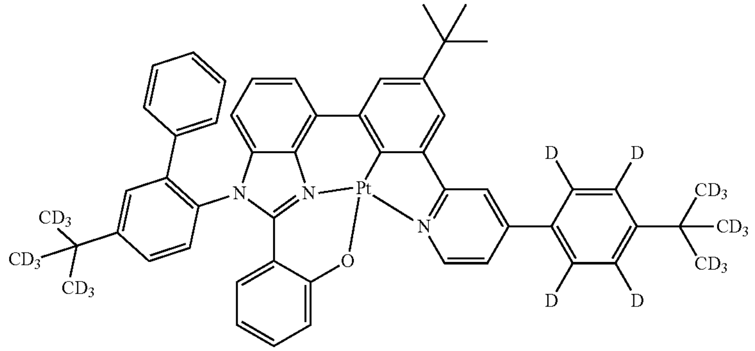

-continued
1798
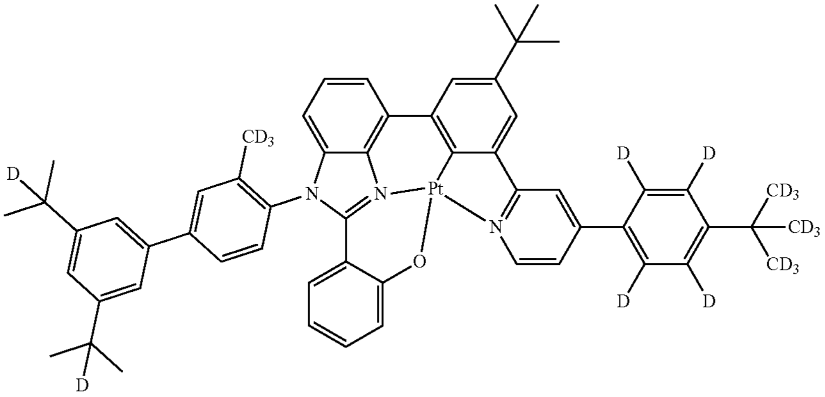
1799
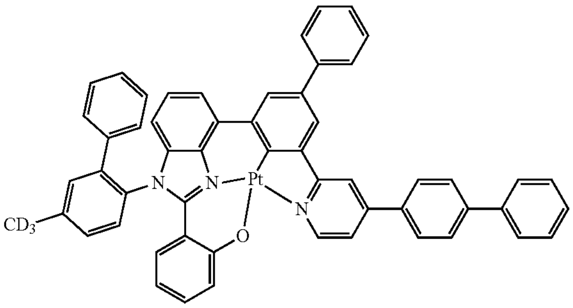
1800
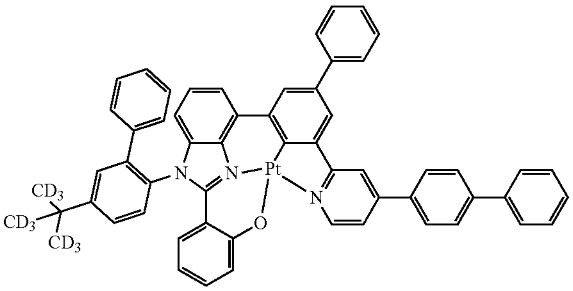
1801
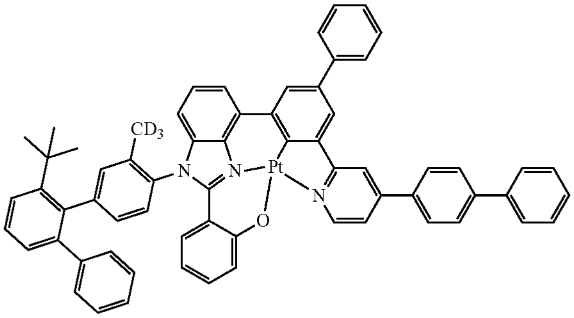
1802
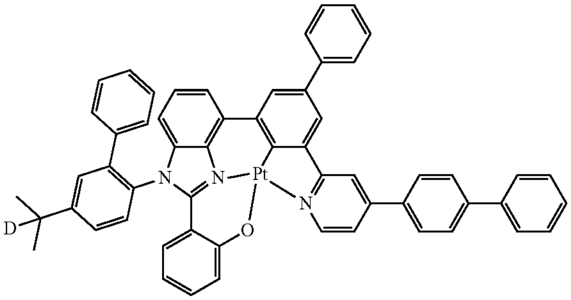
1803
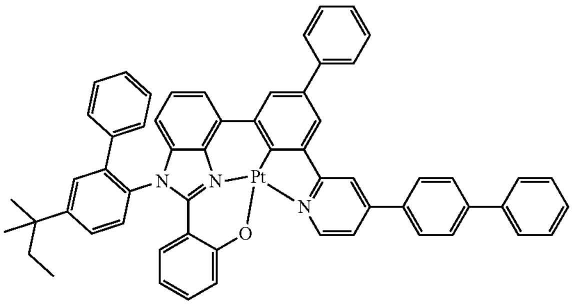
1804
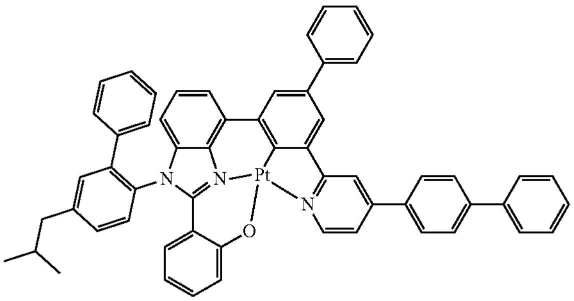

-continued
1805
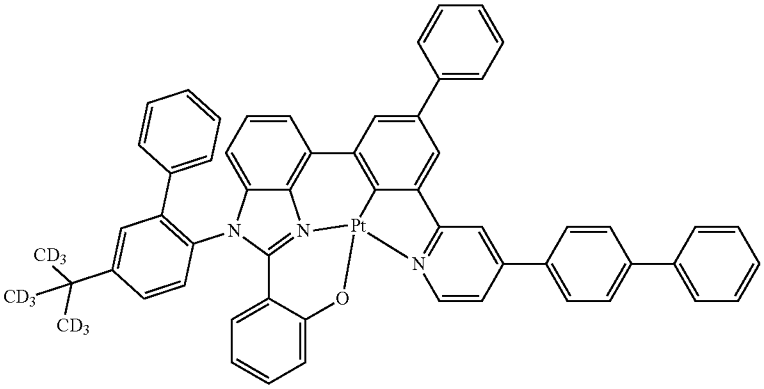
1806
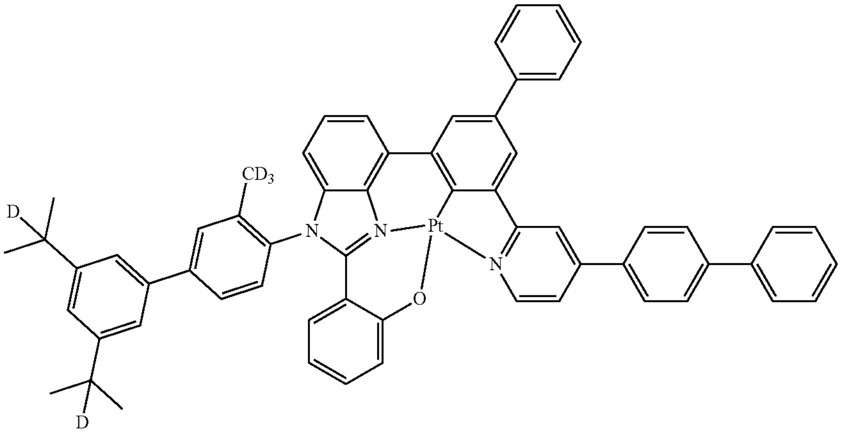
1807
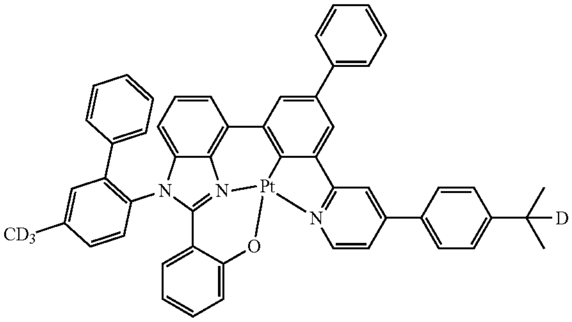
1808
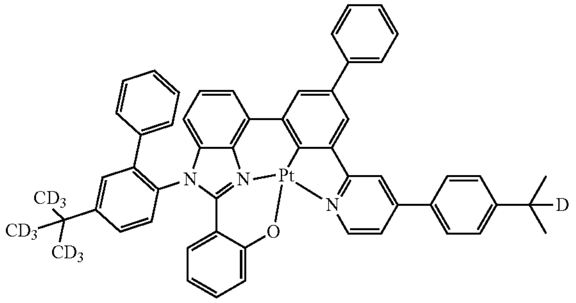
1809
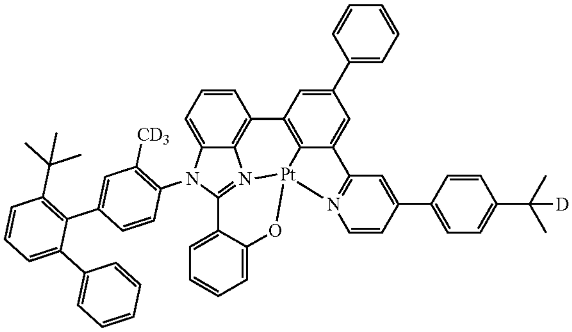
1810
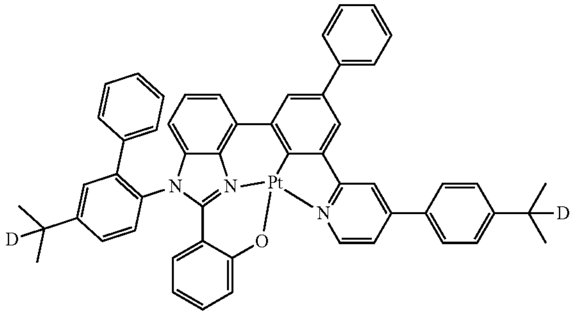

-continued
1811
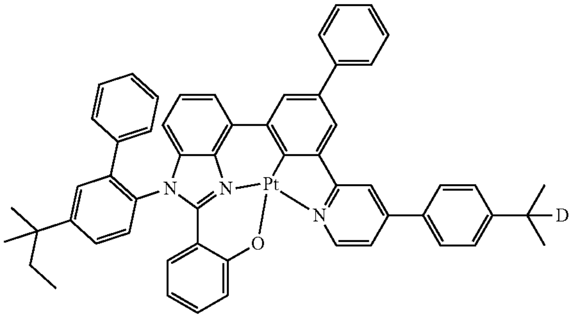
1812
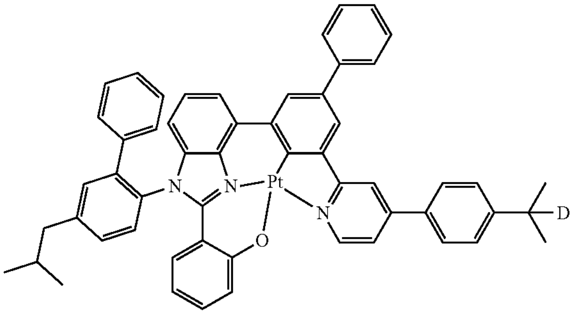
1813
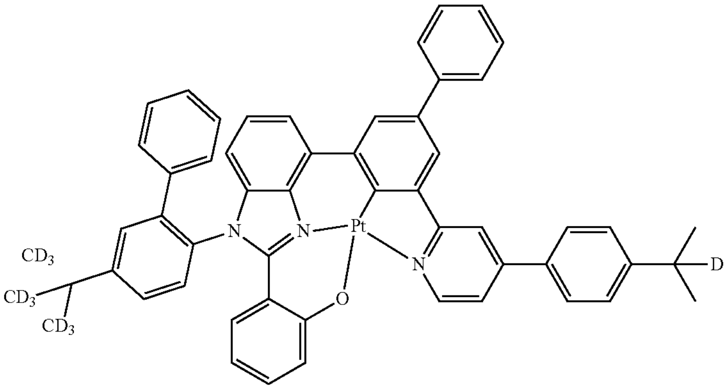
1814
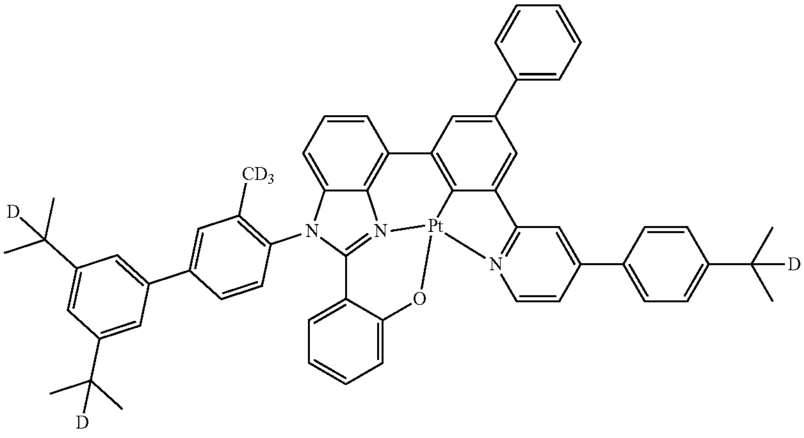
1815
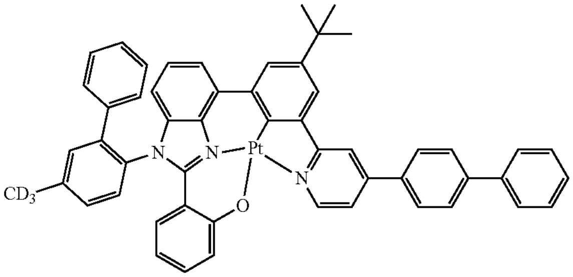
1816
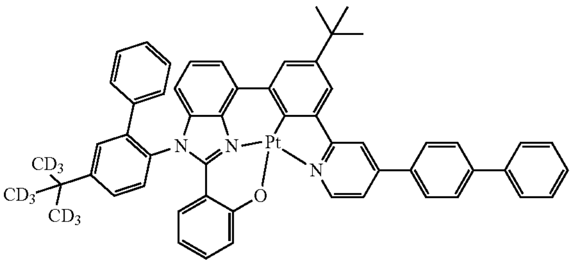

-continued
1817
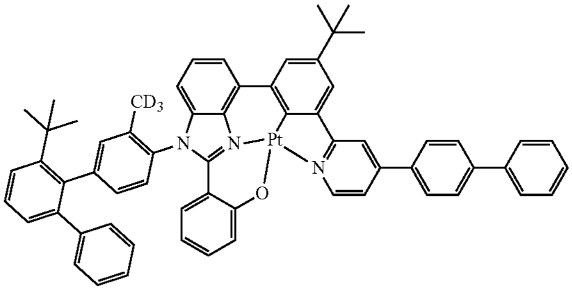
1818
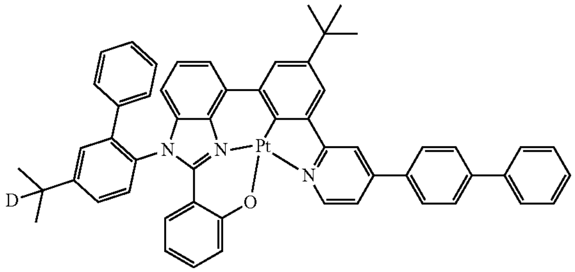
1819
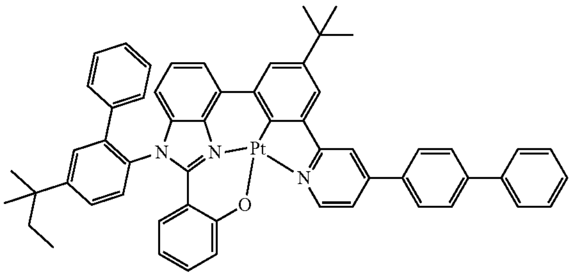
1820
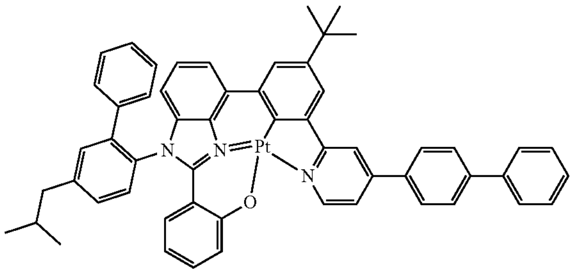
1821
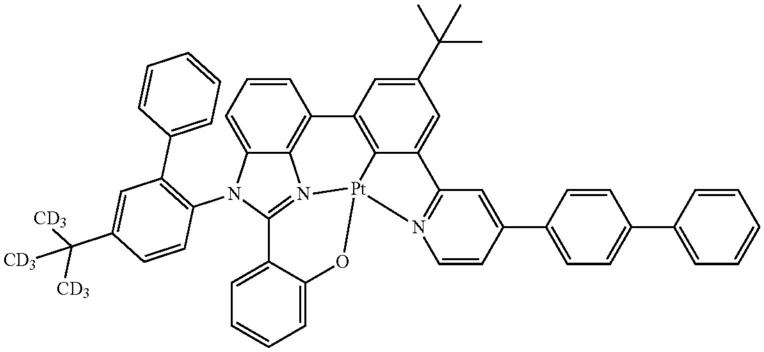
1822
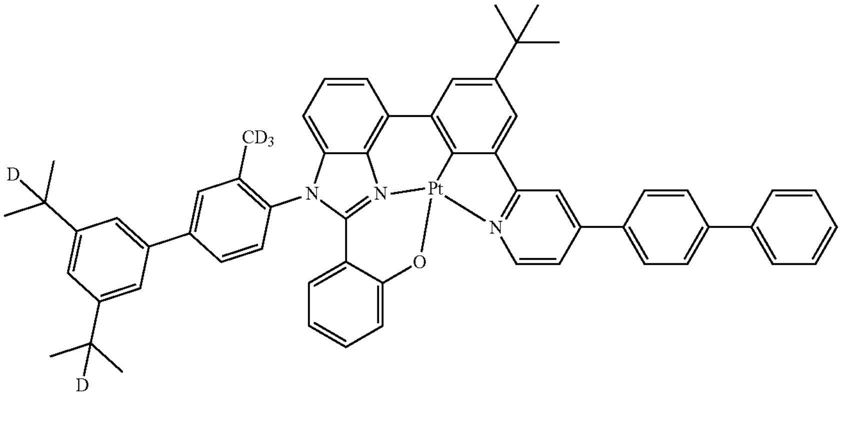

-continued
1823
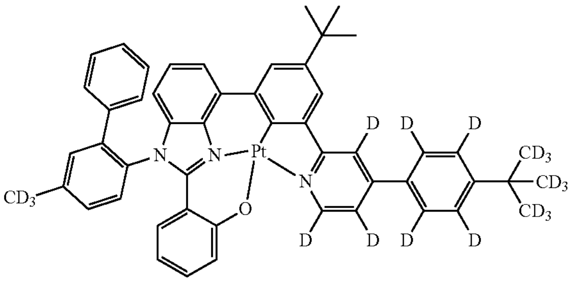
1824
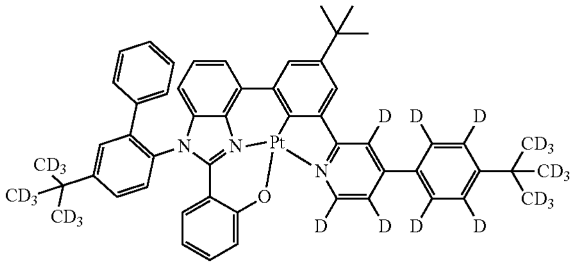
1825
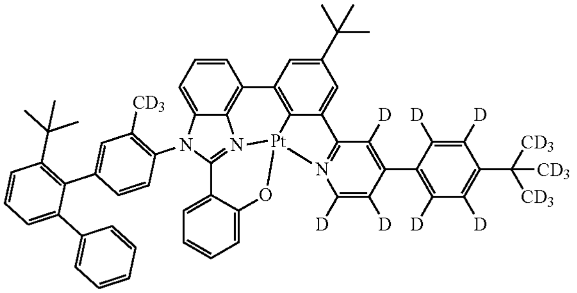
1826
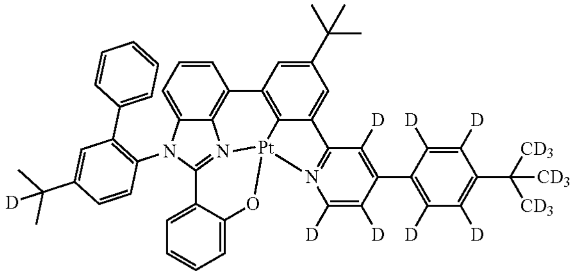
1827
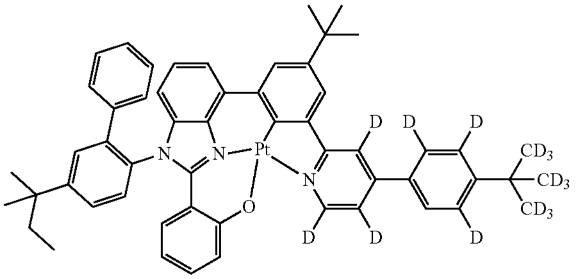
1828
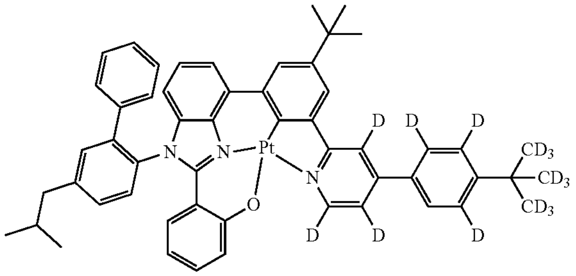
1829
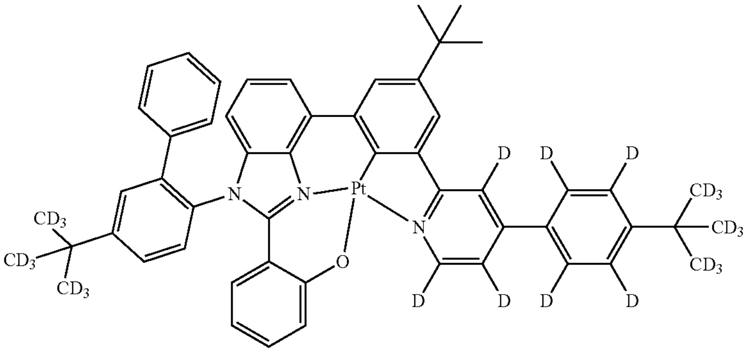

-continued
1830
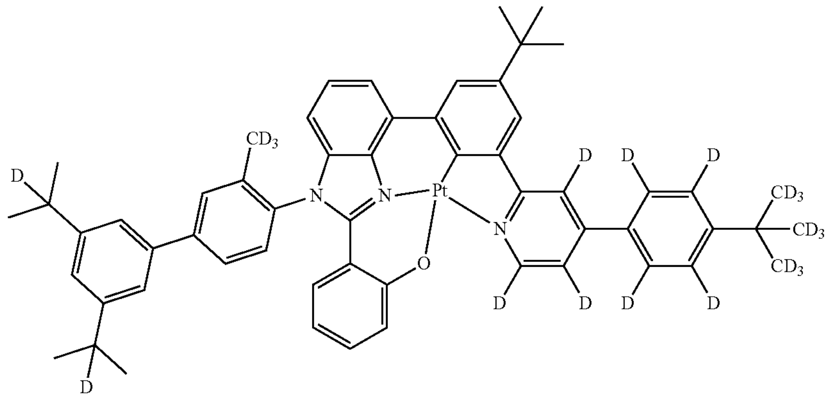
1831
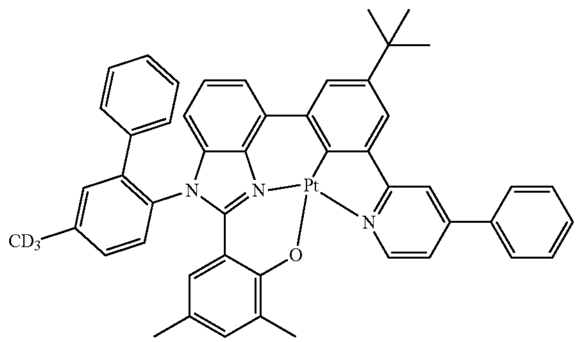
1832
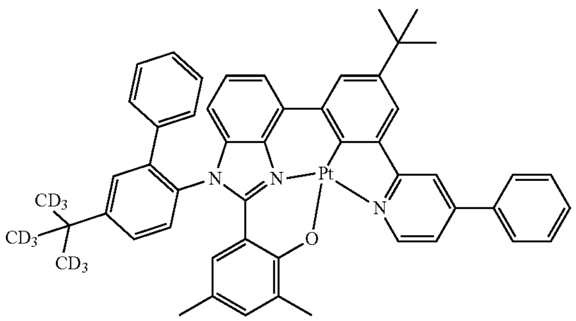
1833
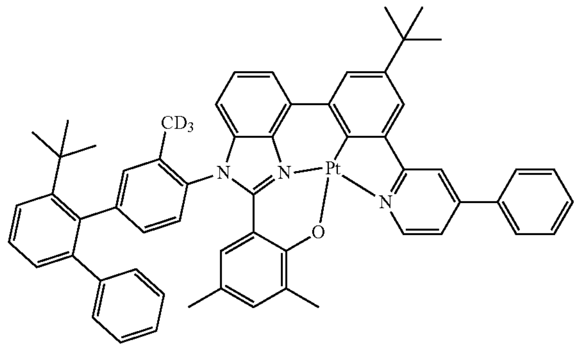
1834
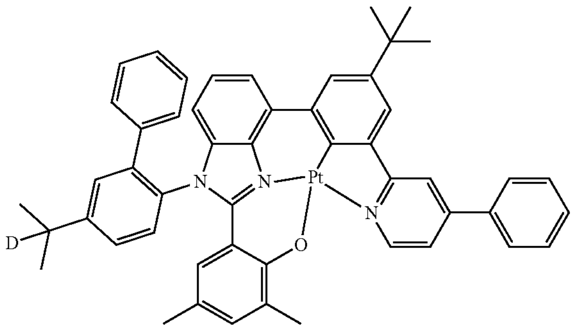
1835
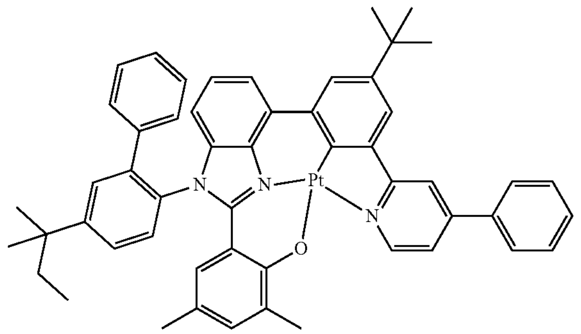
1836
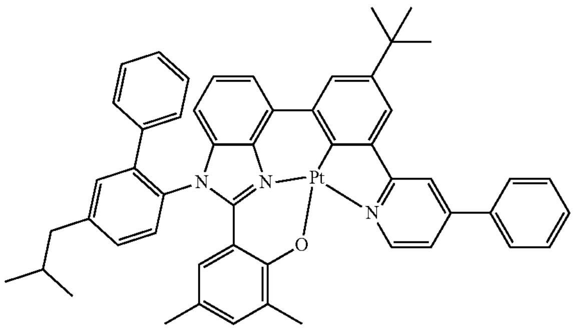

-continued
1837
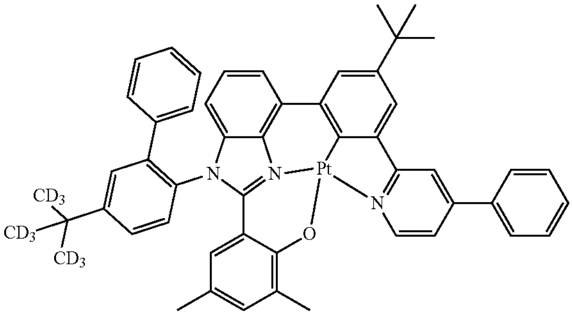
1838
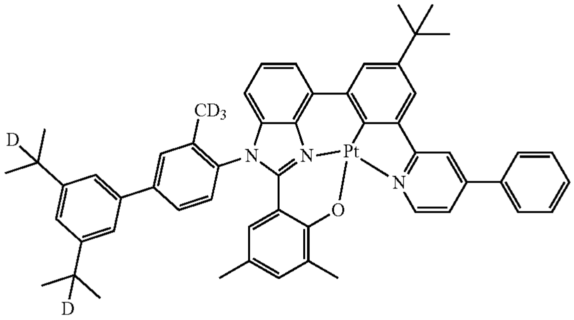
1839
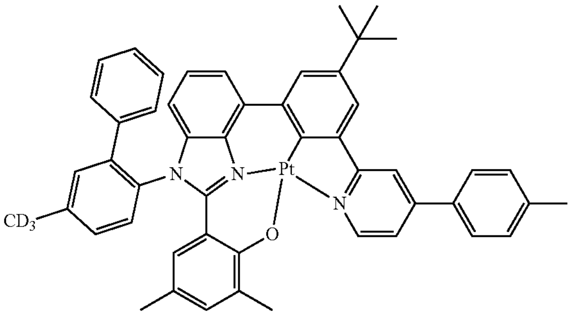
1840
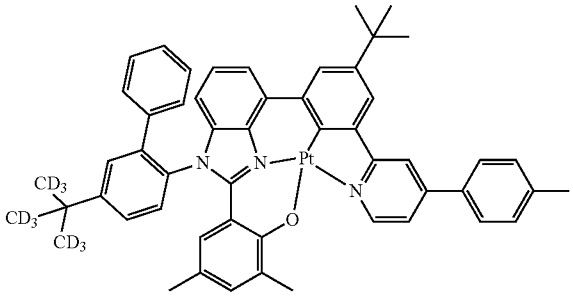
1841
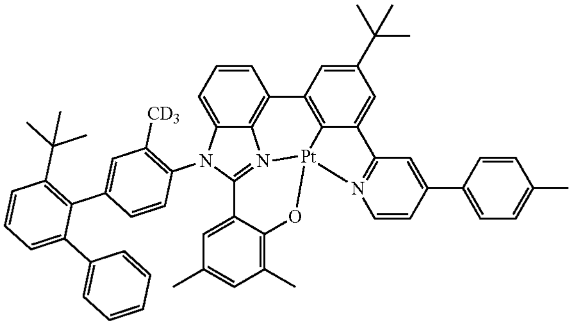
1842
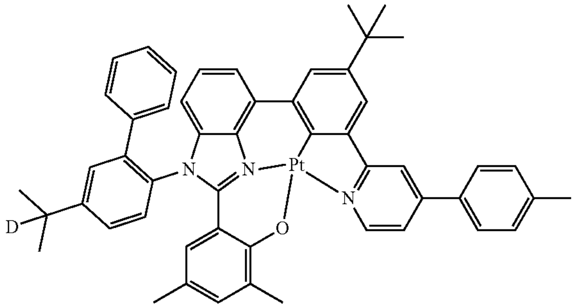
1843
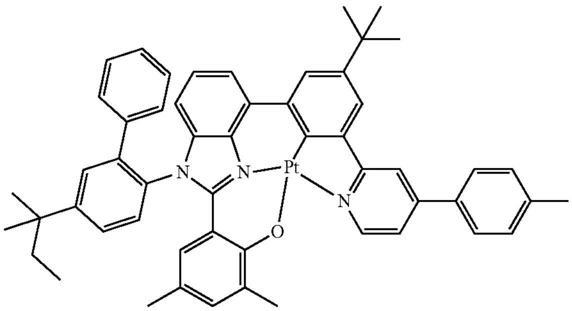
1844
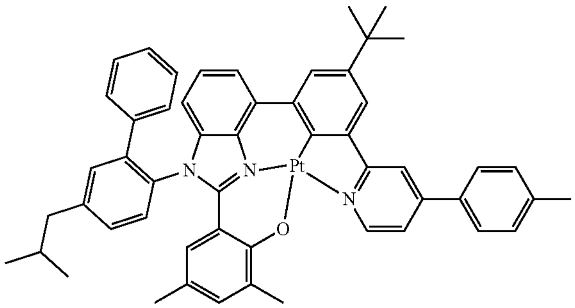

-continued
1845
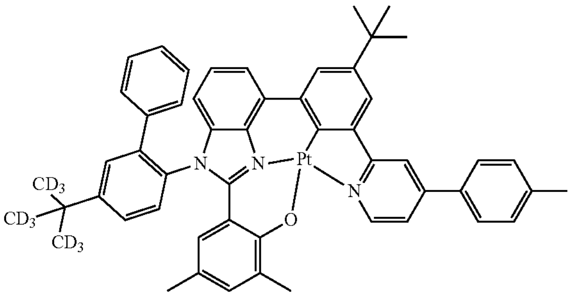
1846
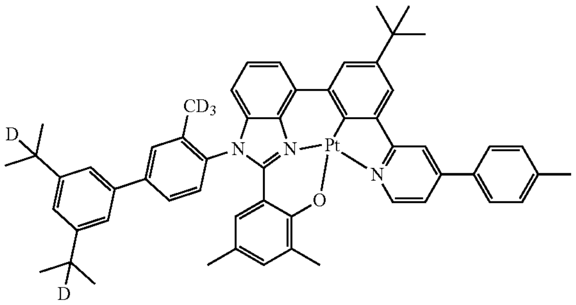
1847
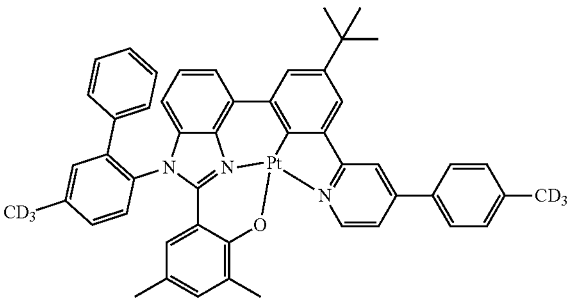
1848
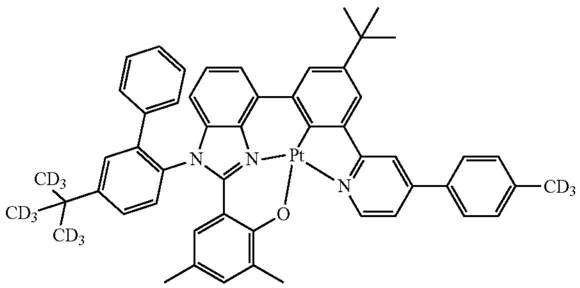
1849
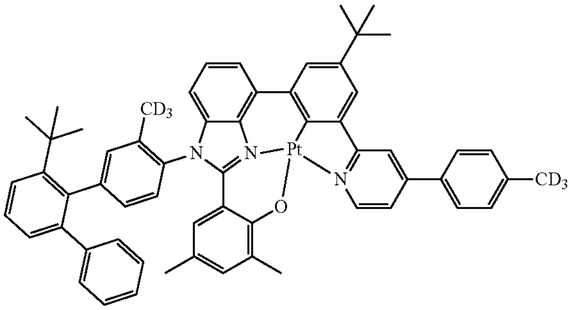
1850
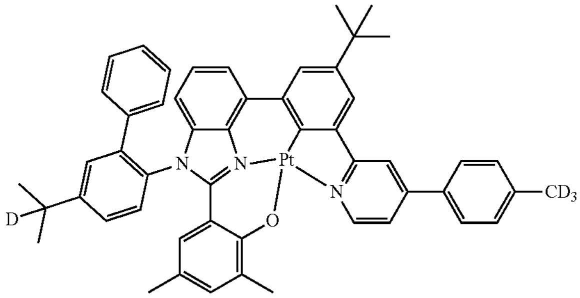
1851
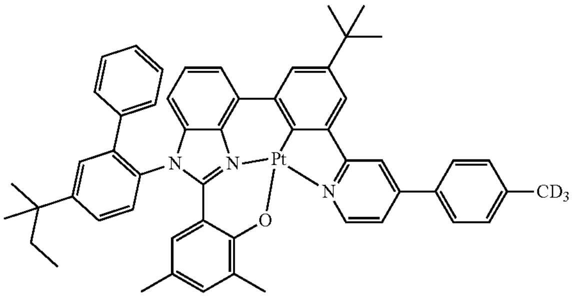
1852
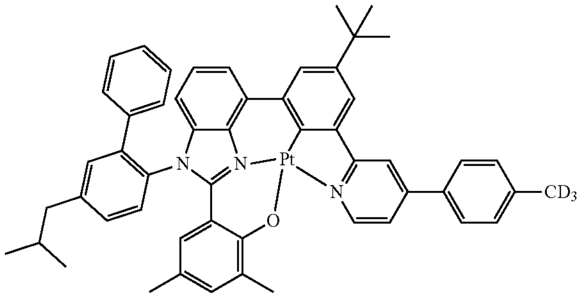
1853
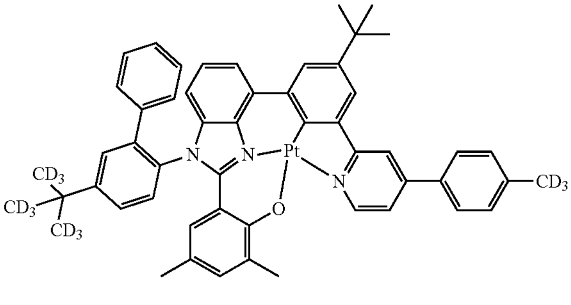
1854
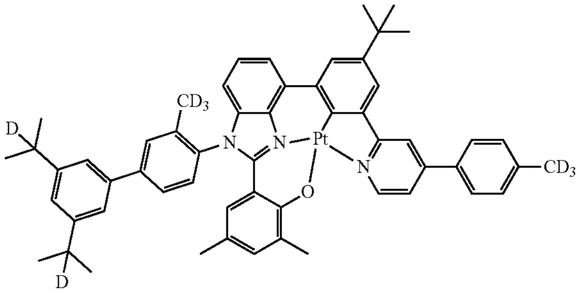

-continued
1855
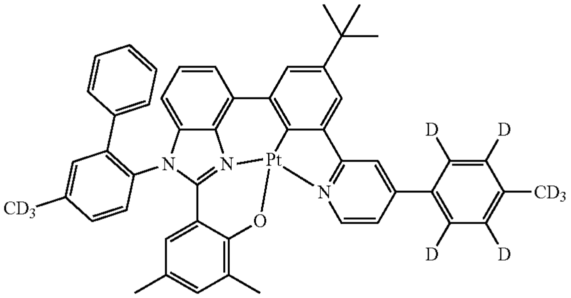
1856
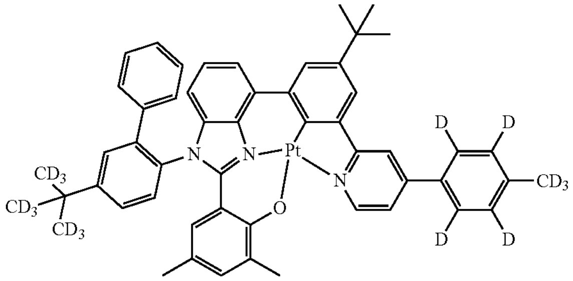
1857
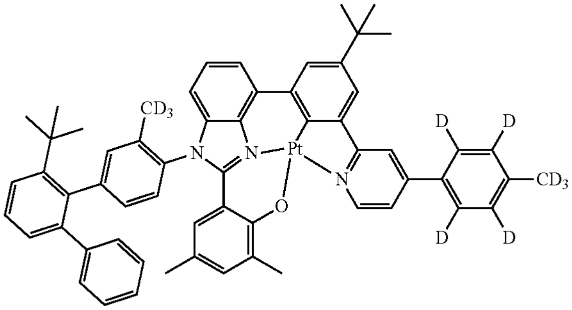
1858
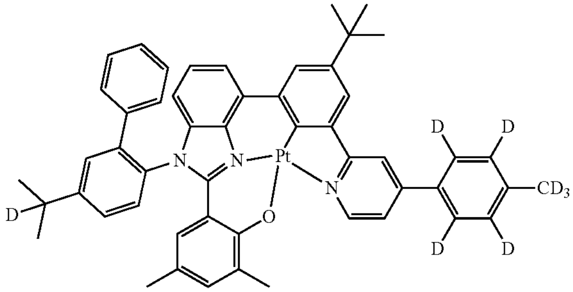
1859
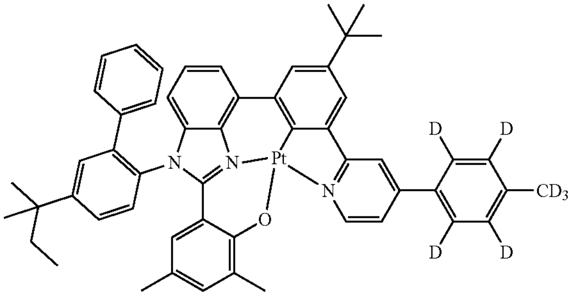
1860
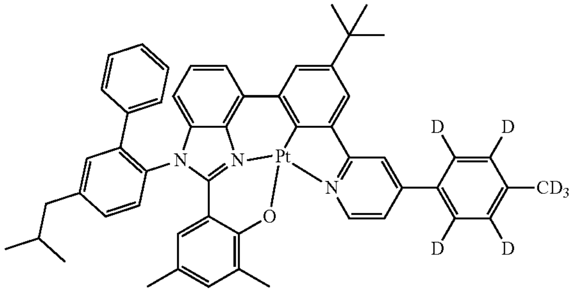
1961
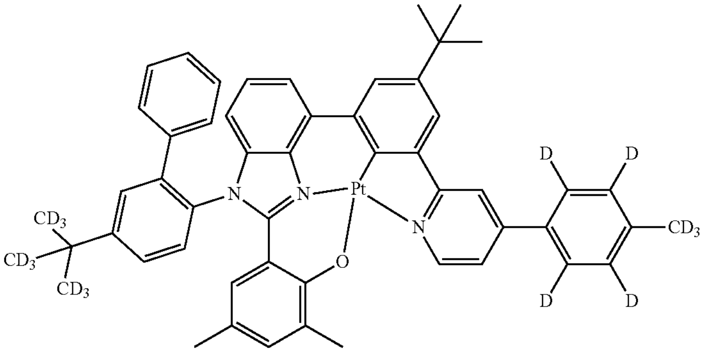

-continued
1862
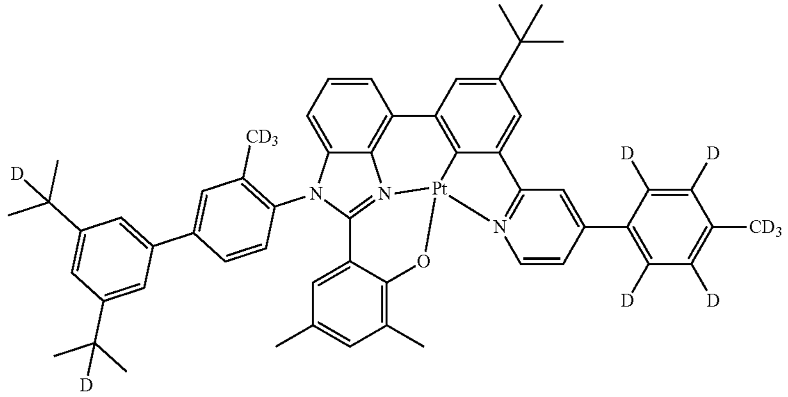
1863
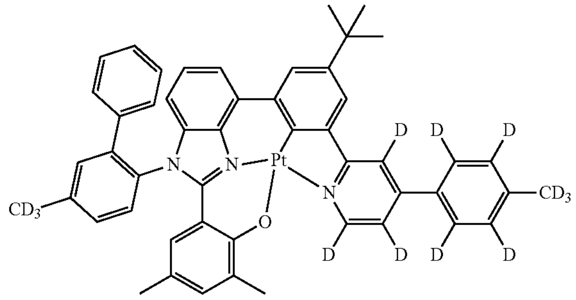
1864
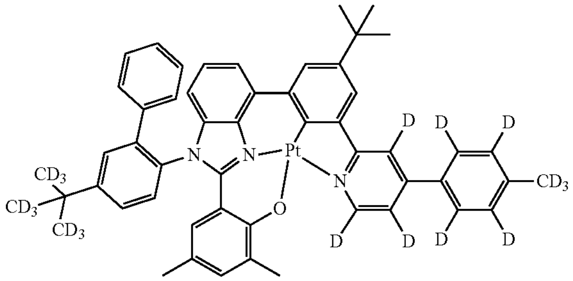
1865
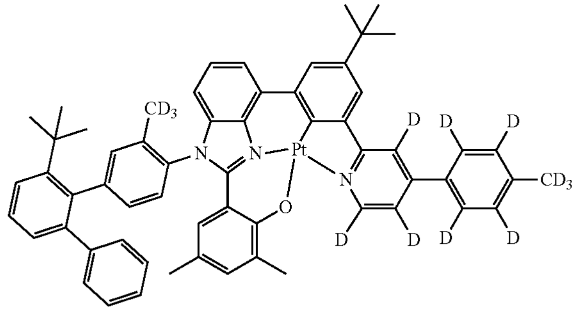
1866
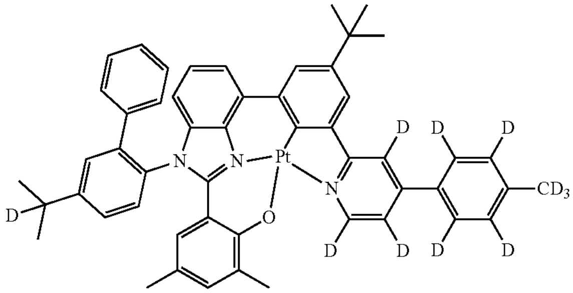
1867
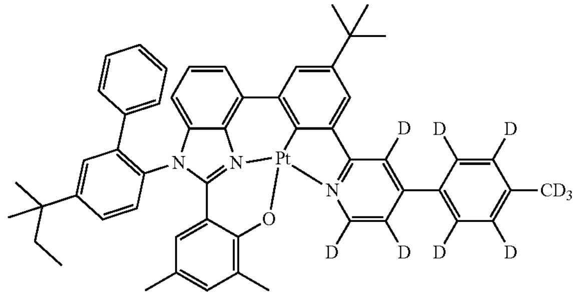
1868
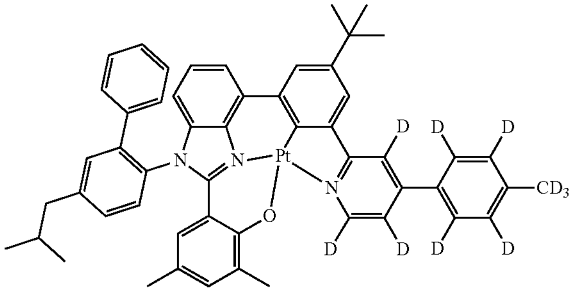

-continued
1869
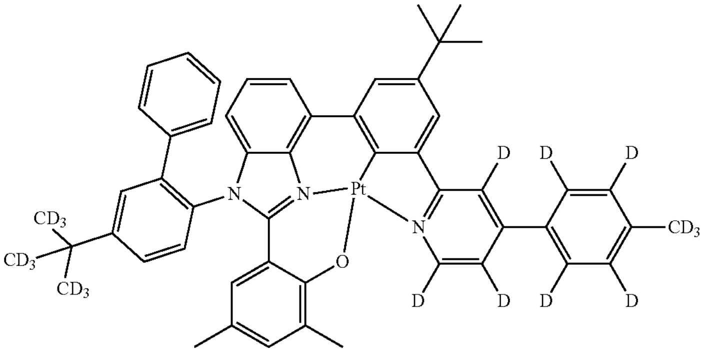
1870
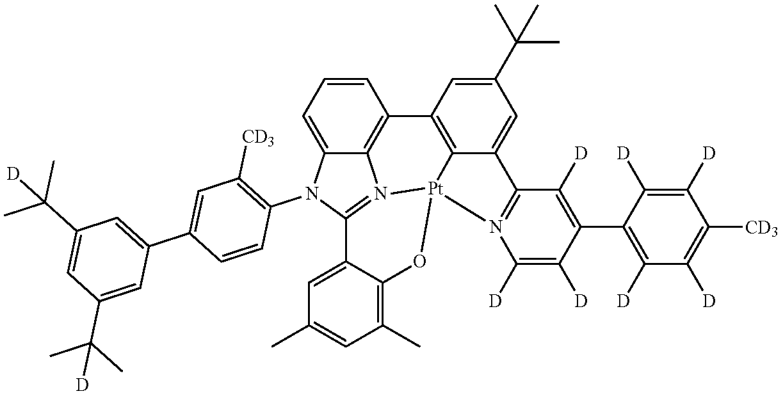
1871
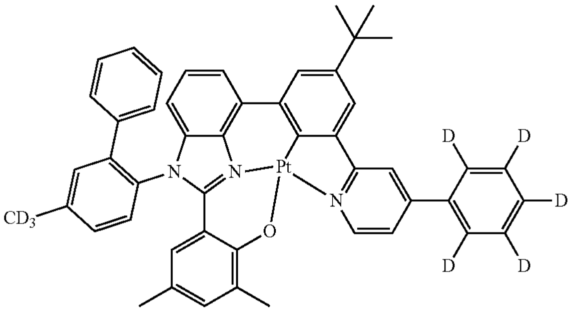
1872
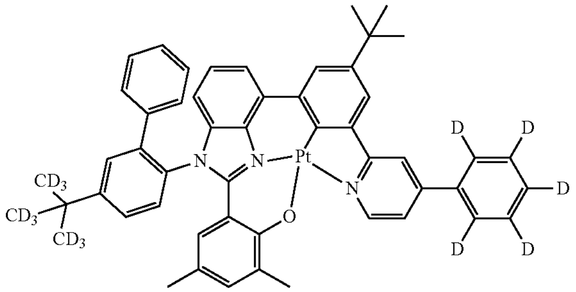
1873
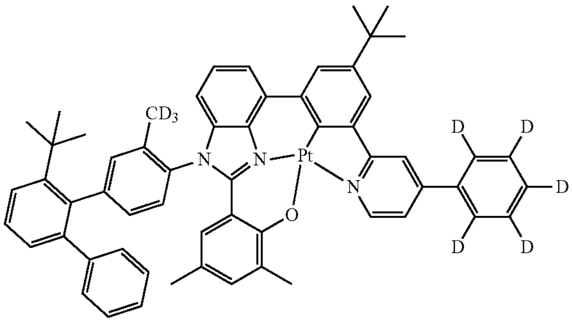
1874
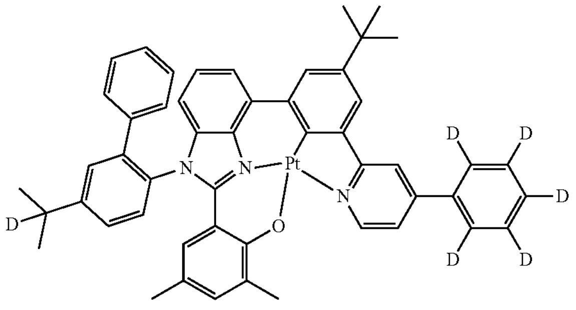

-continued
1875
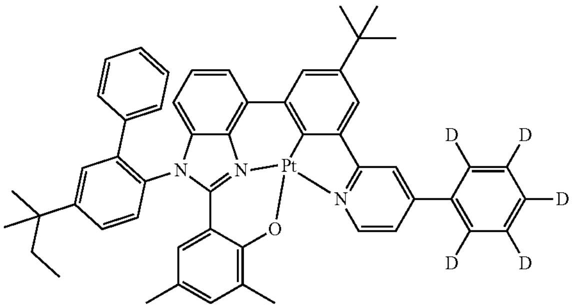
1876
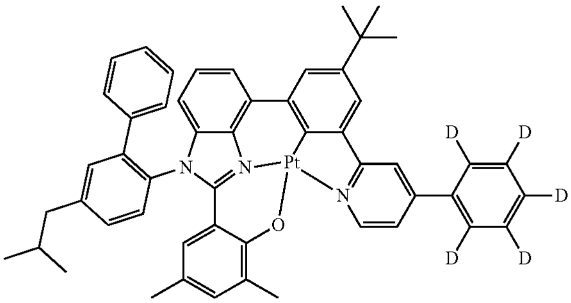
1877
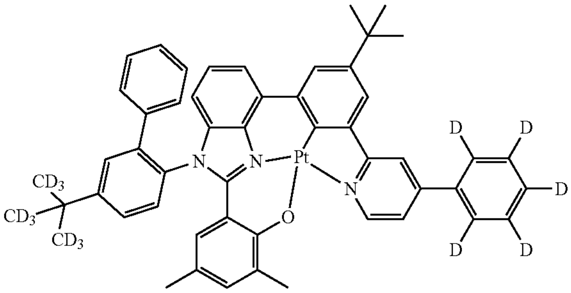
1878
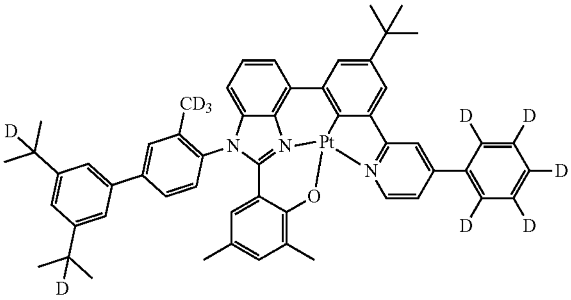
1879
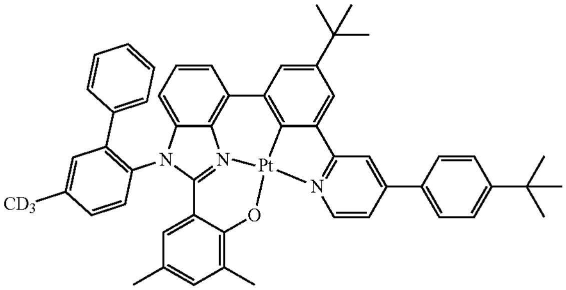
1880
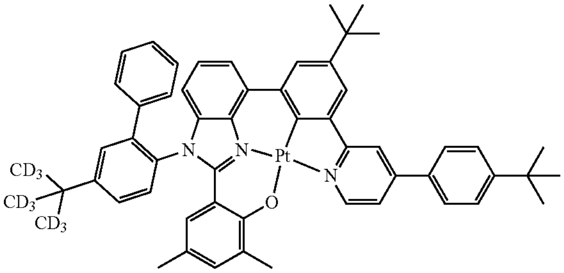
1881
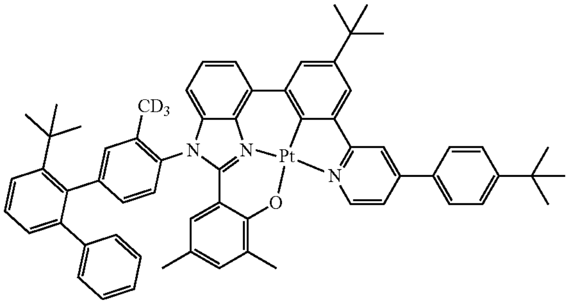
1882
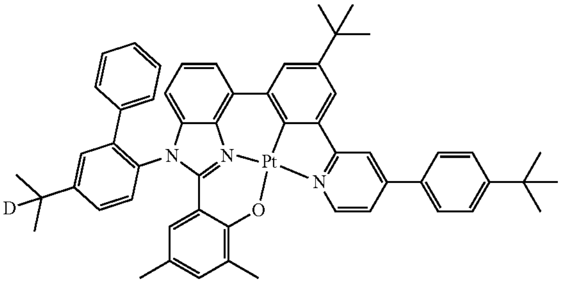

-continued
1883
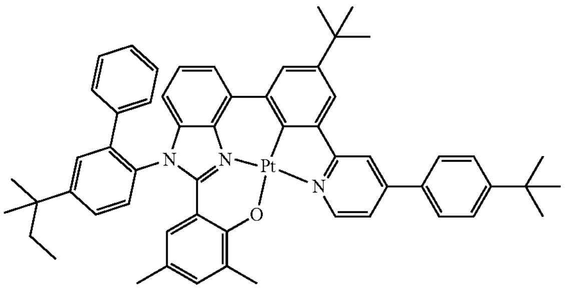
1884
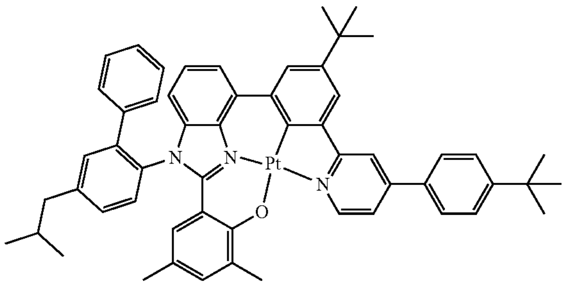
1885
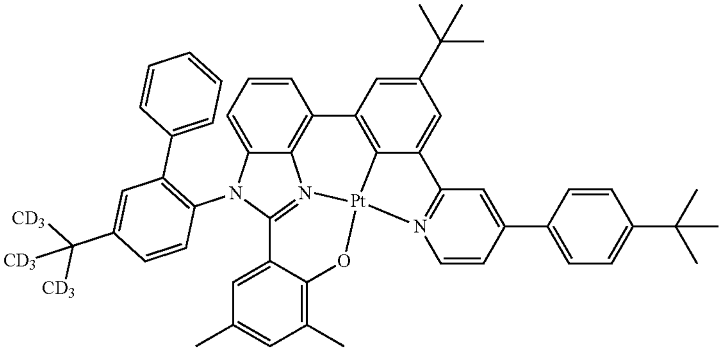
1886
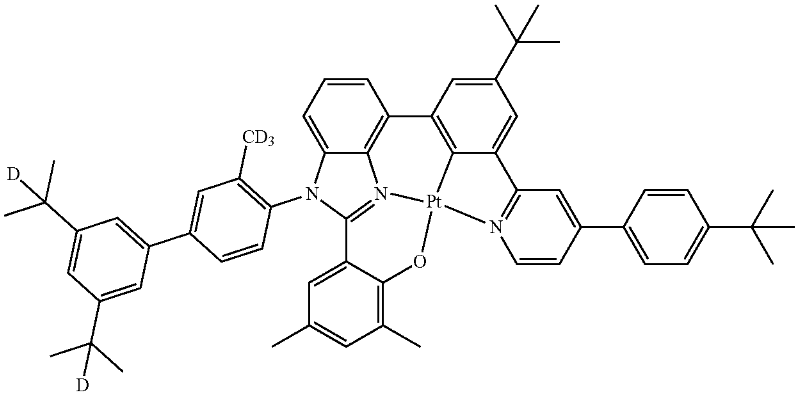
1887
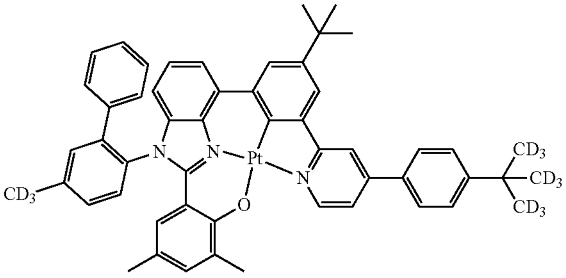
1888
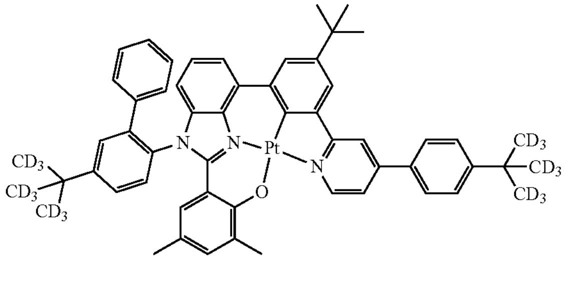

-continued
1889
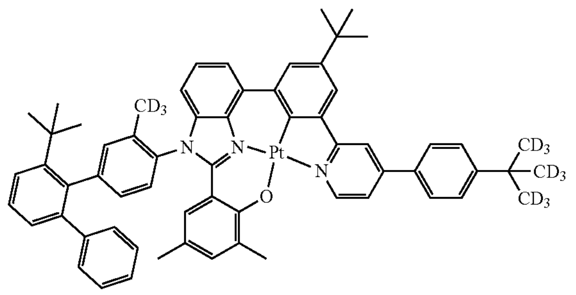
1890
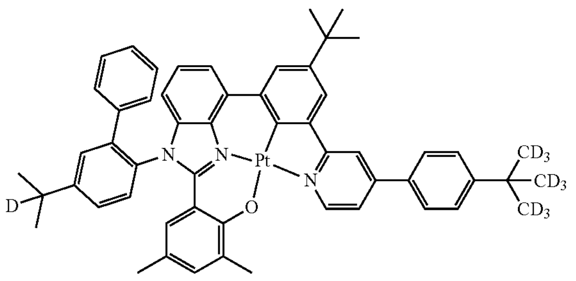
1891
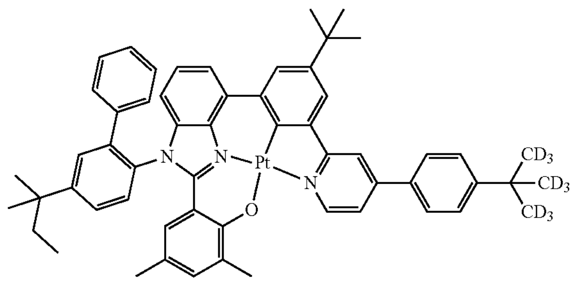
1892
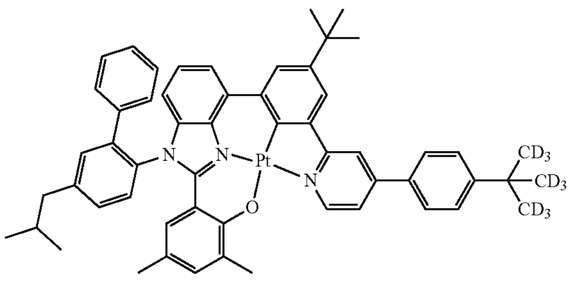
1893
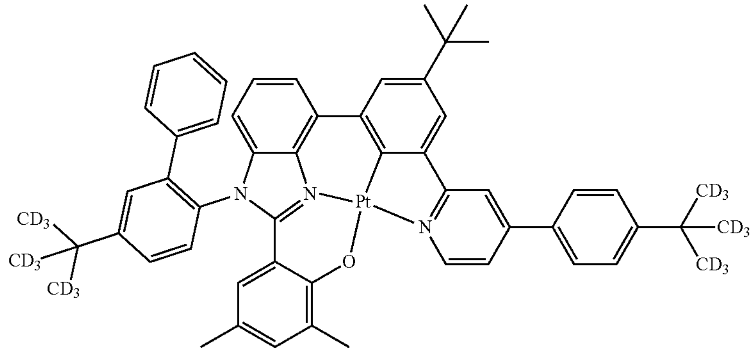
1894
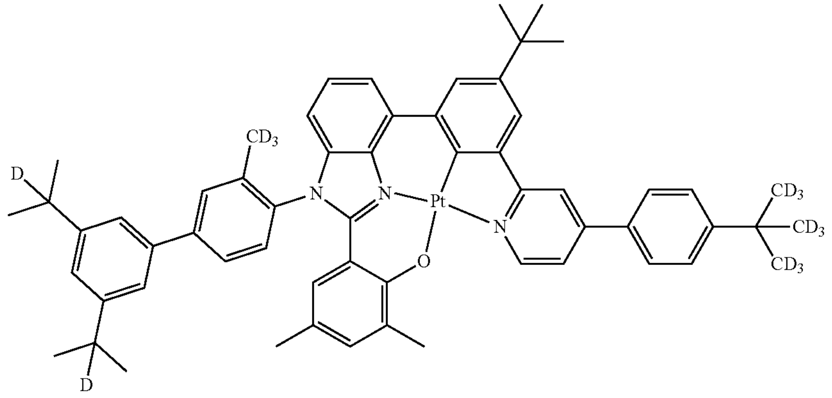

-continued
1895
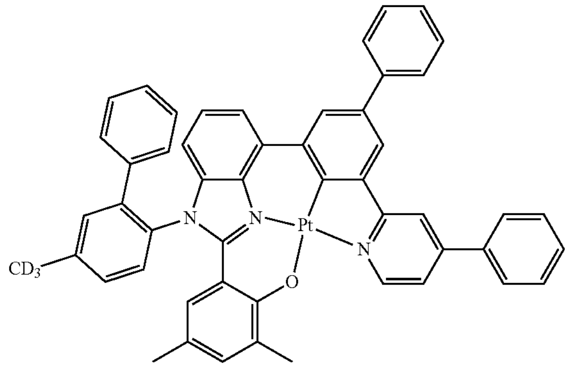
1896
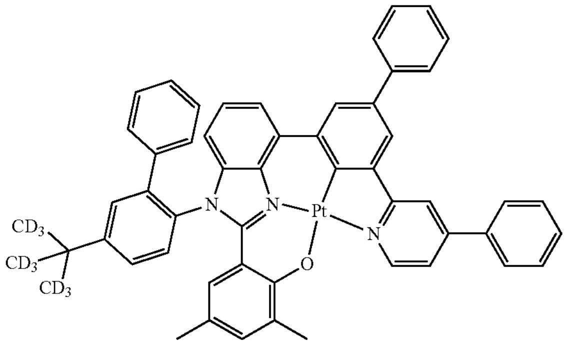
1897
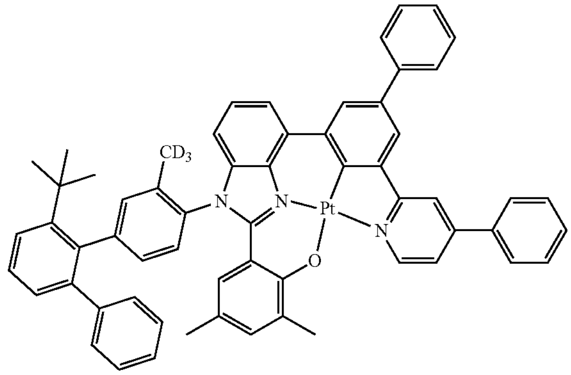
1898
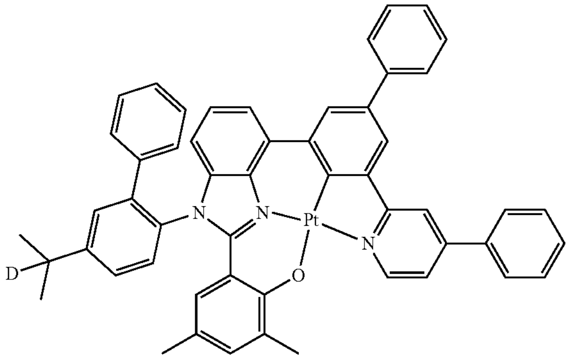
1899
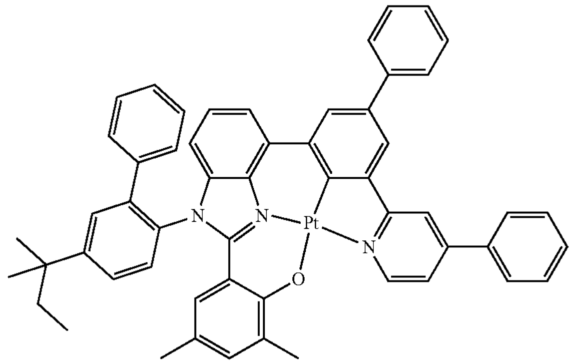
1900
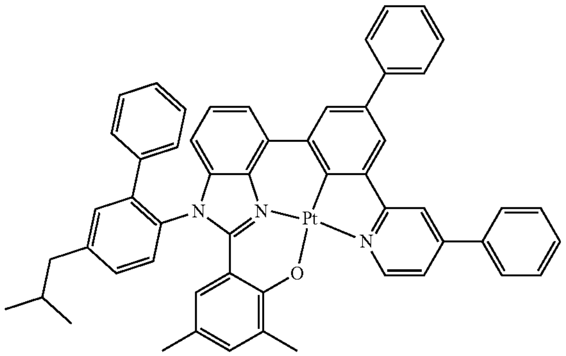
1901
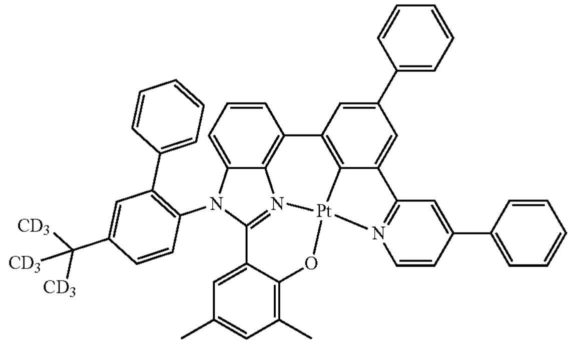
1902
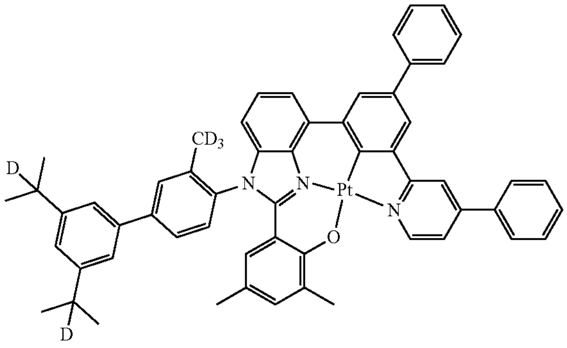

-continued
1903
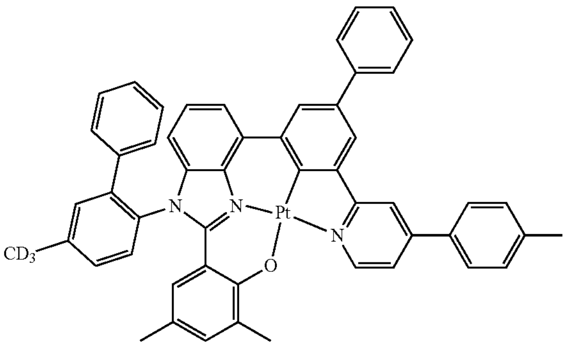
1904
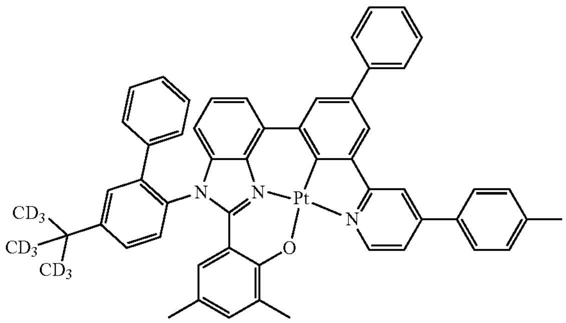
1905
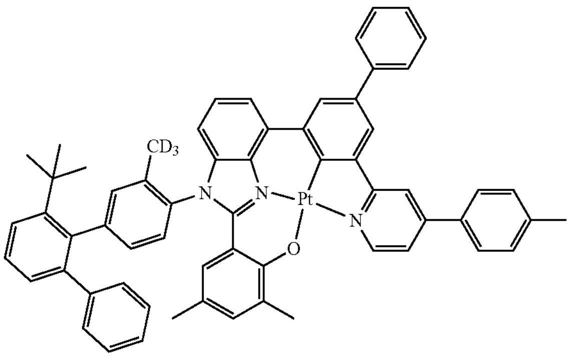
1906
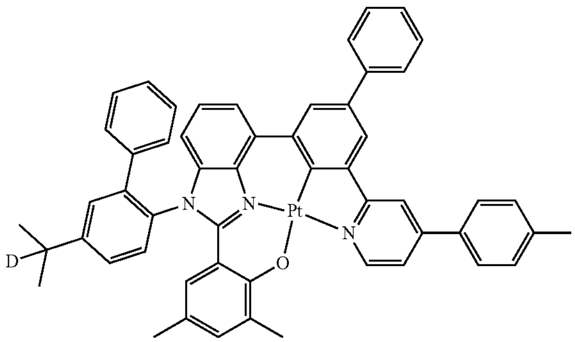
1907
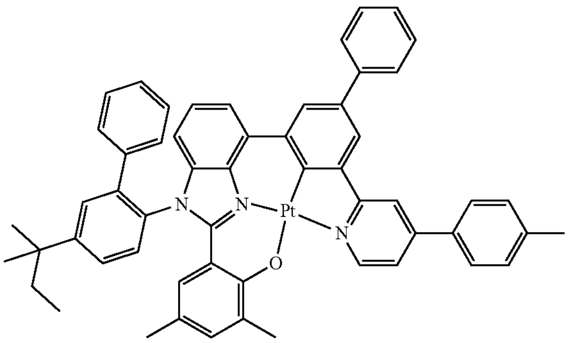
1908
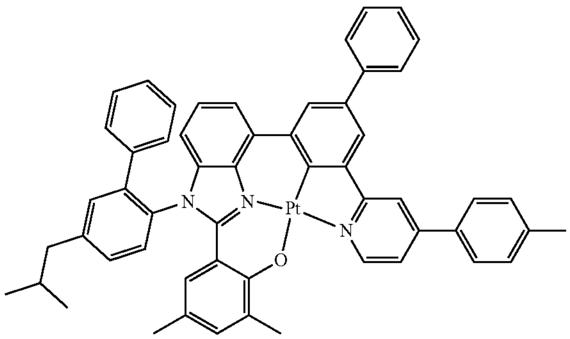
1909
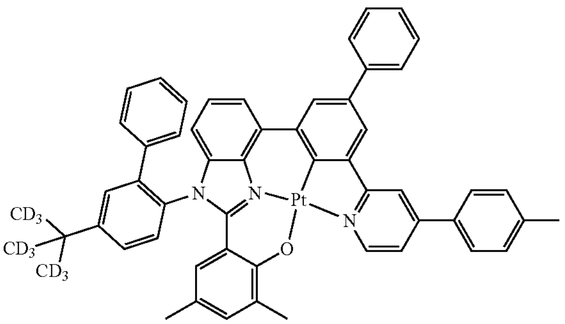
1910
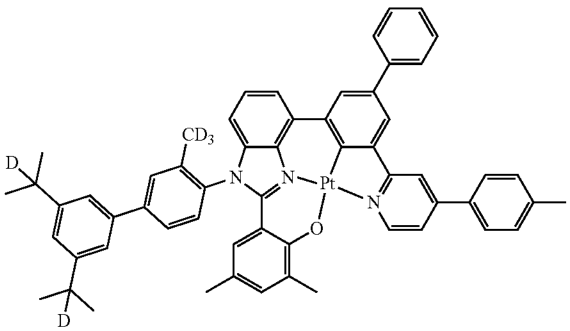

-continued
1911
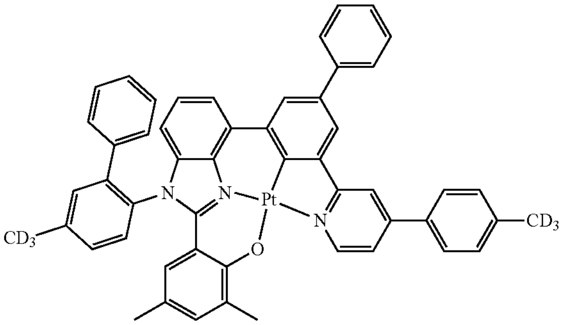
1912
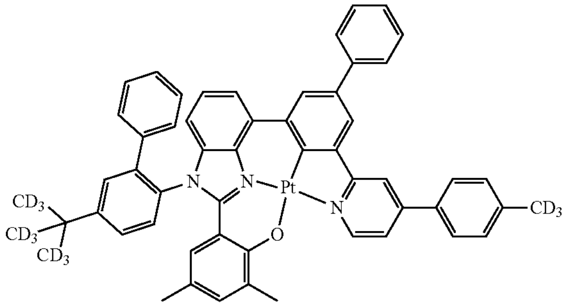
1913
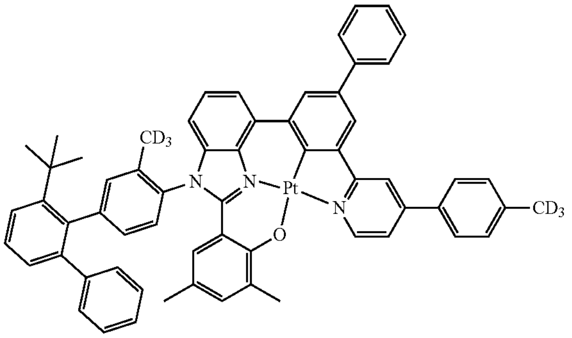
1914
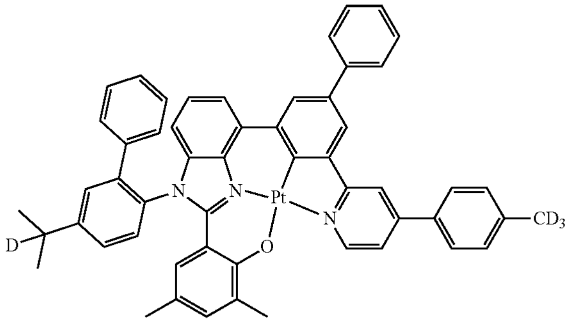
1915
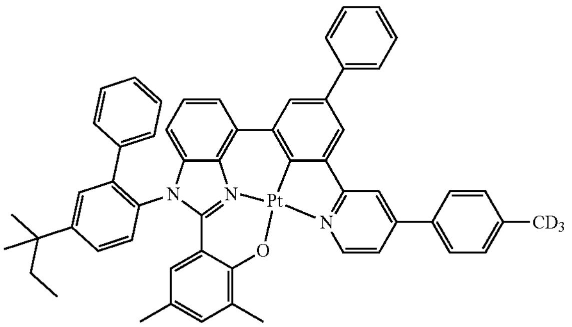
1916
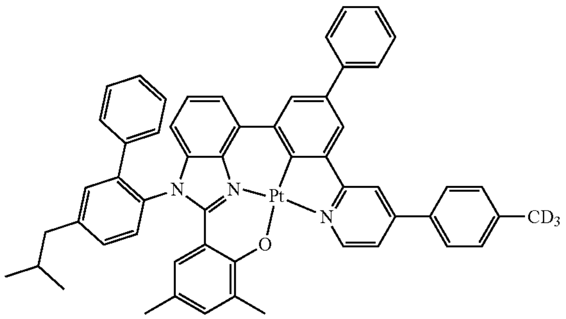
1917
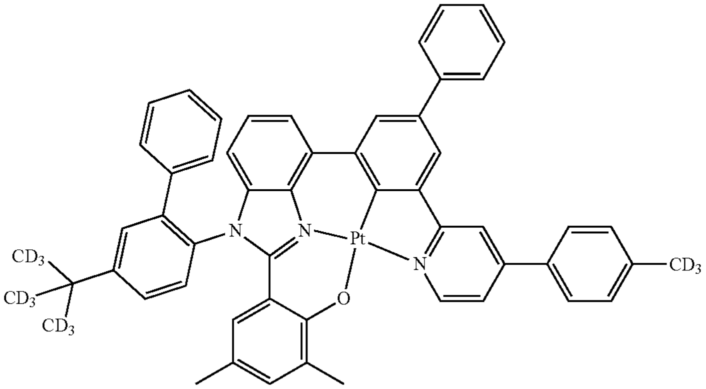

-continued
1918
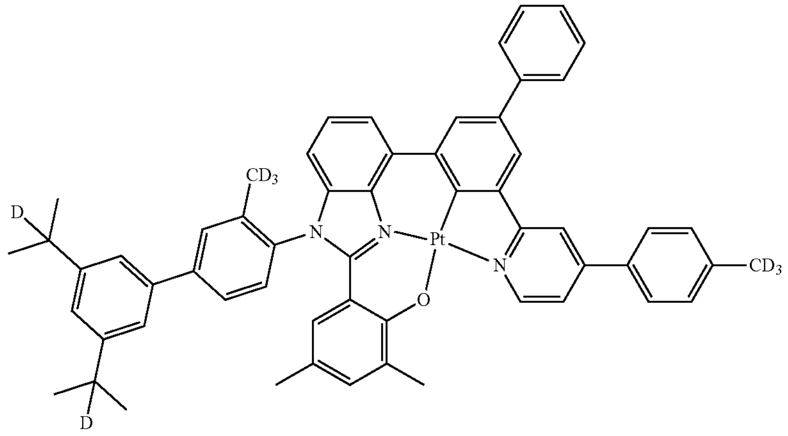
1919
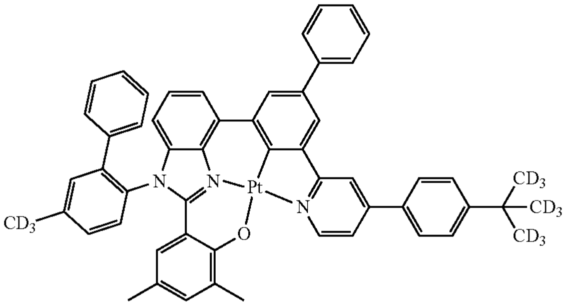
1920
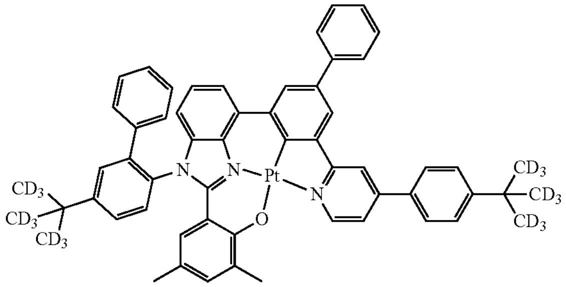
1921
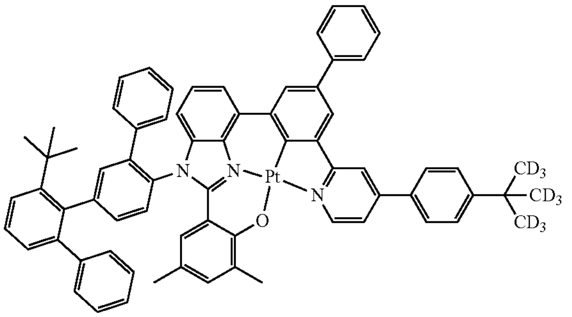
1922
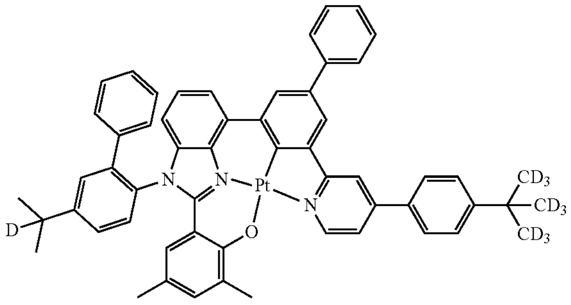
1923
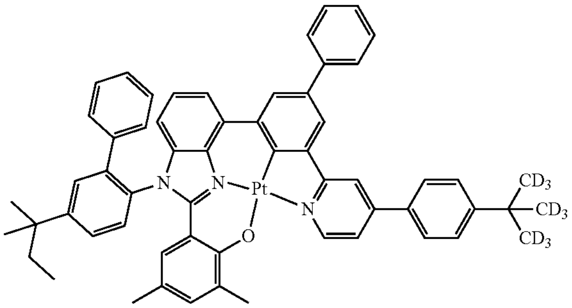
1924
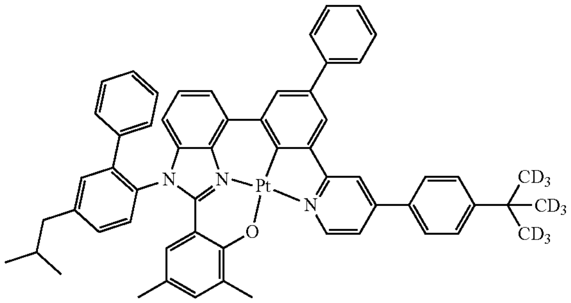

-continued
1925
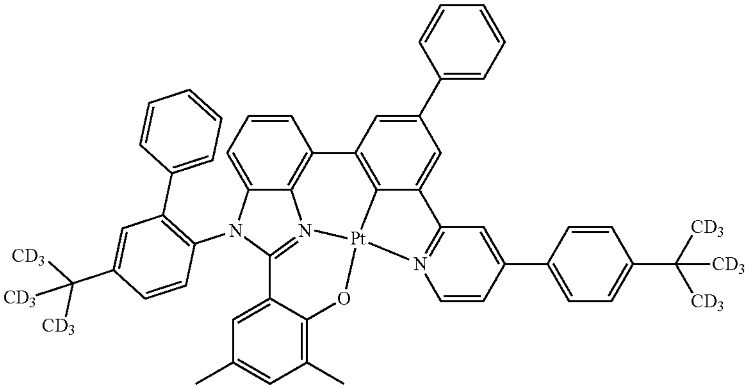
1926
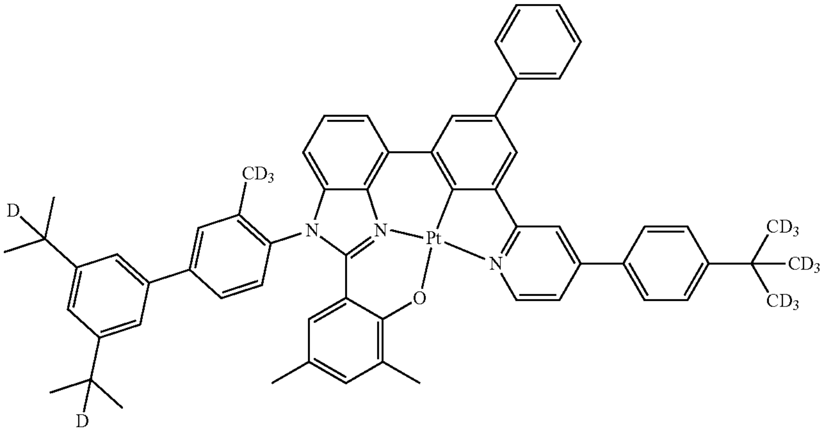
1927
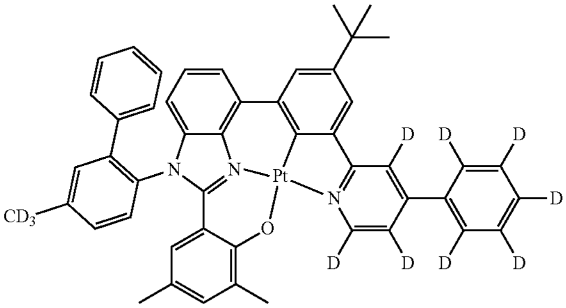
1928
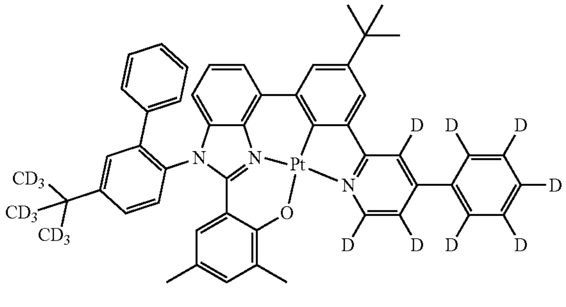
1929
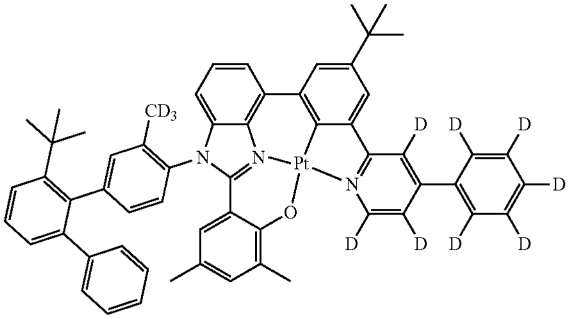
1930
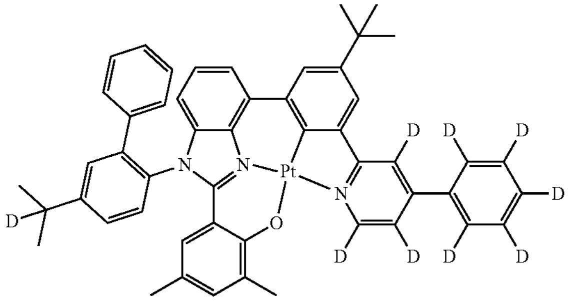

-continued
1931
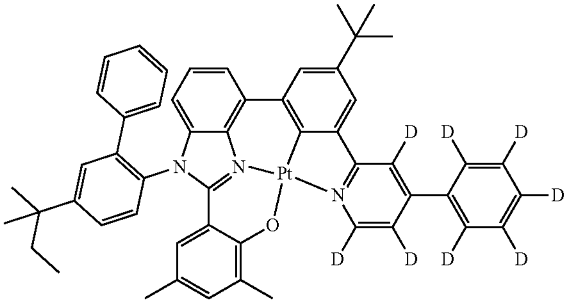
1932
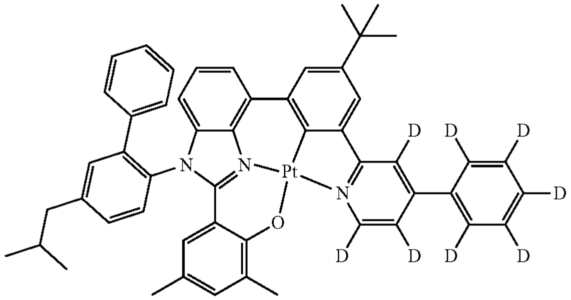
1933
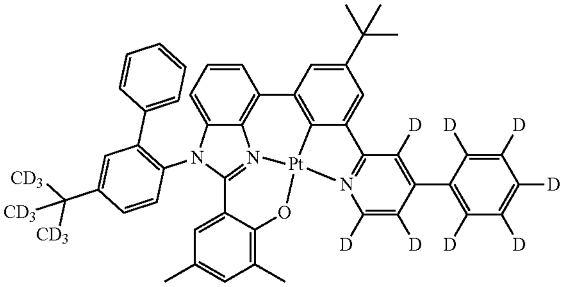
1934
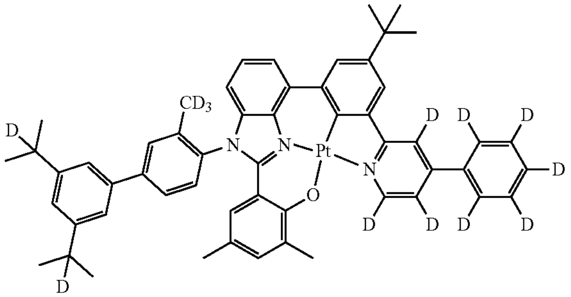
1935
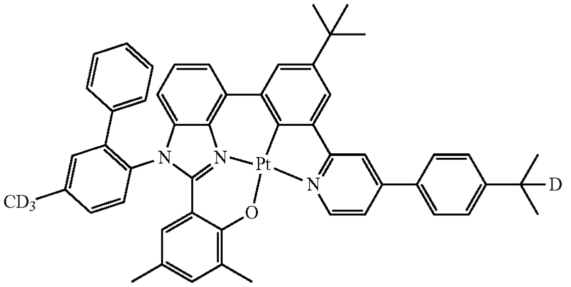
1936
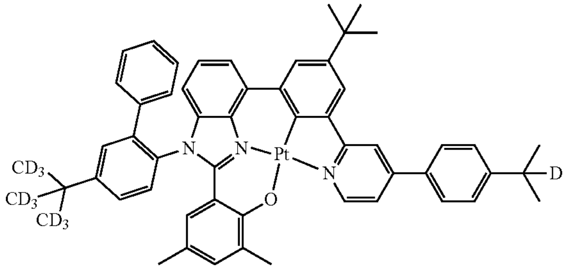
1937
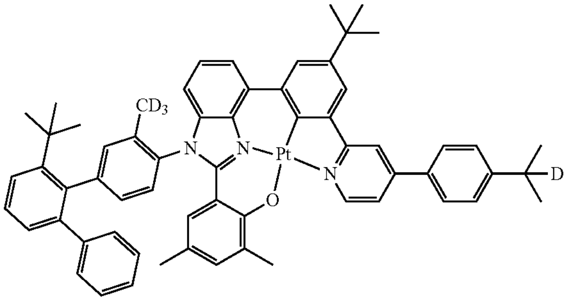
1938
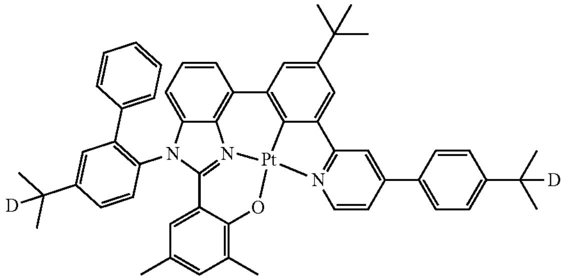
1939
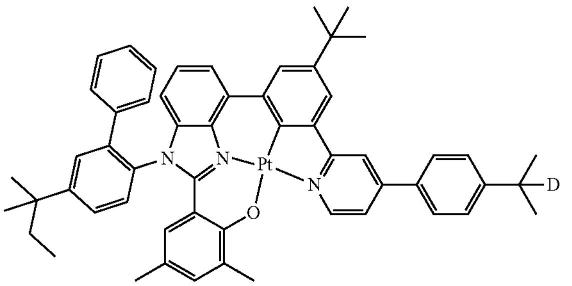
1940
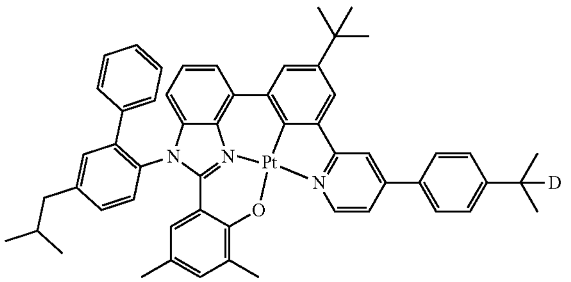

-continued
1941
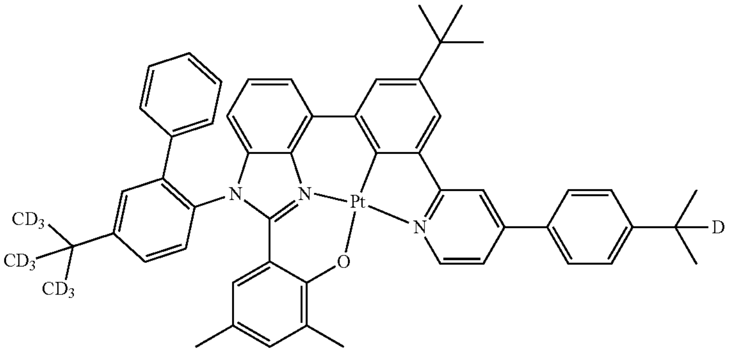
1942
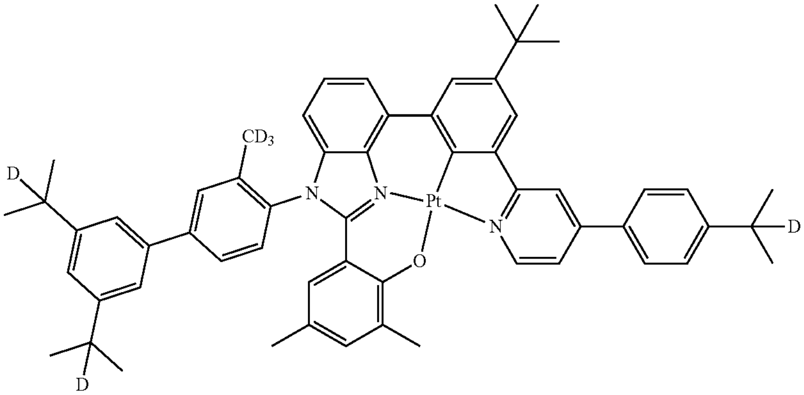
1943
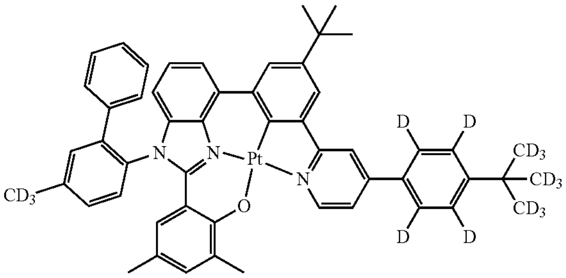
1944
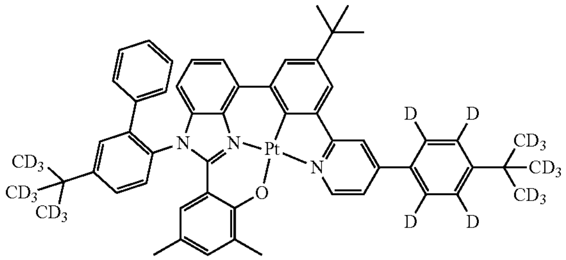
1945
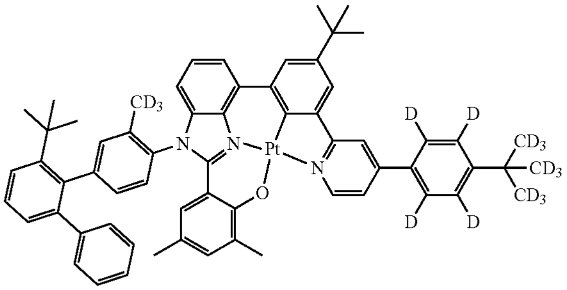
1946
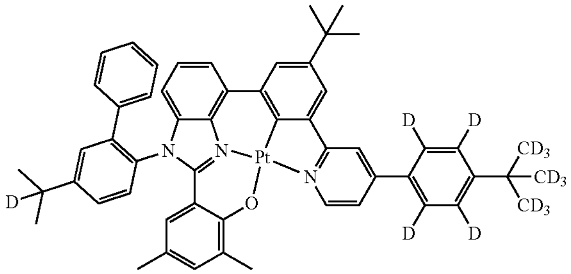

-continued
1947
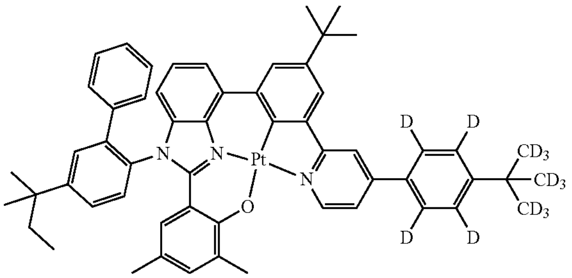
1948
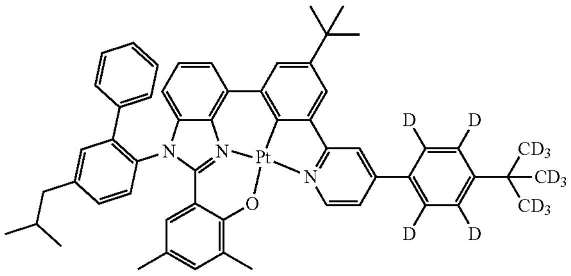
1949
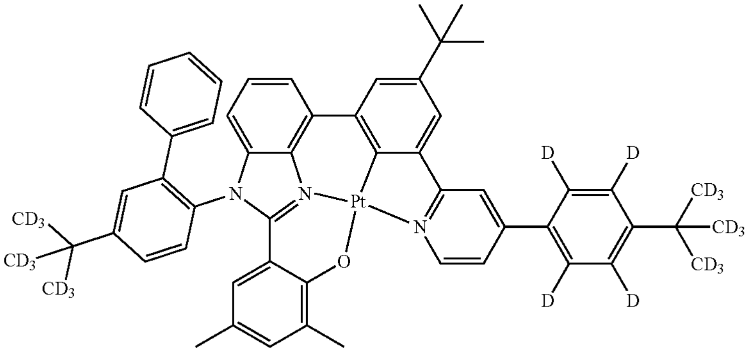
1950
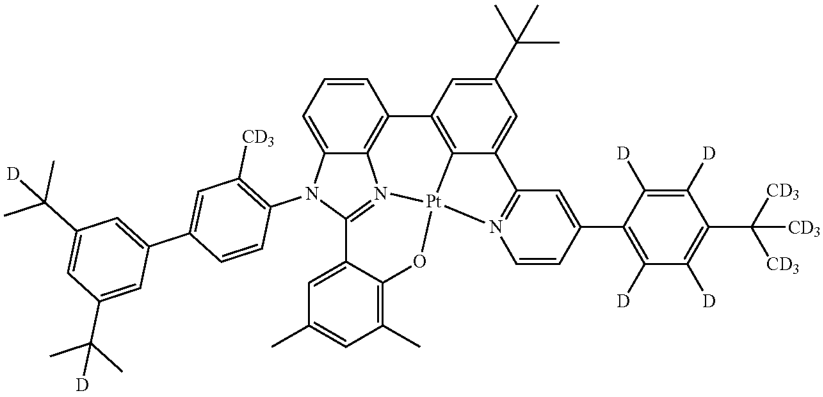
1951
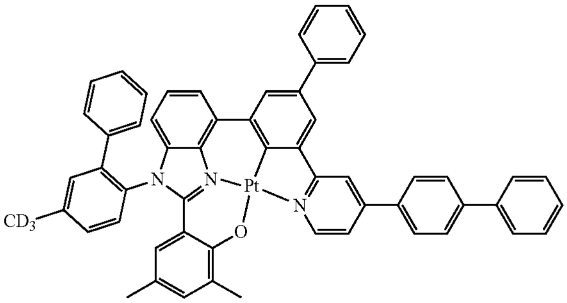
1952
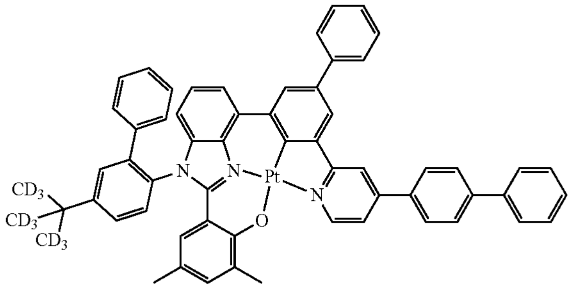

-continued
1953
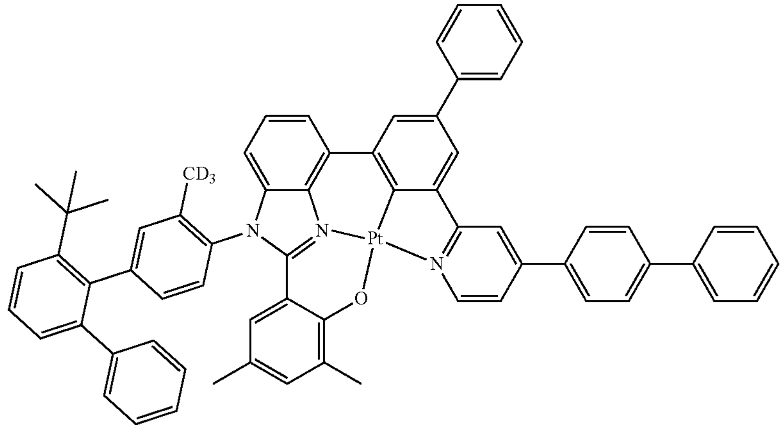
1954
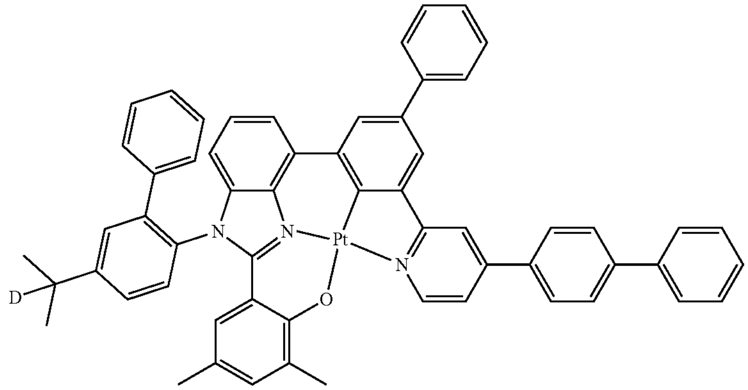
1955
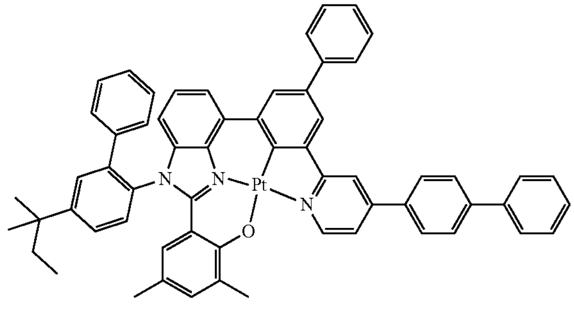
1956
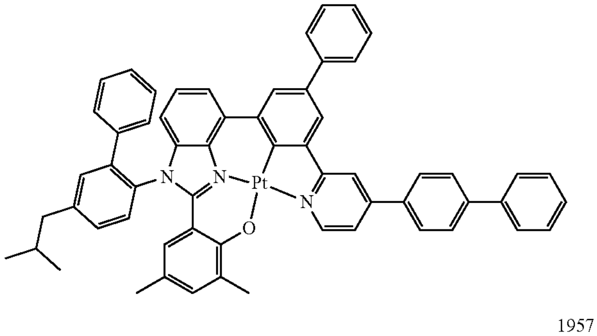
1957
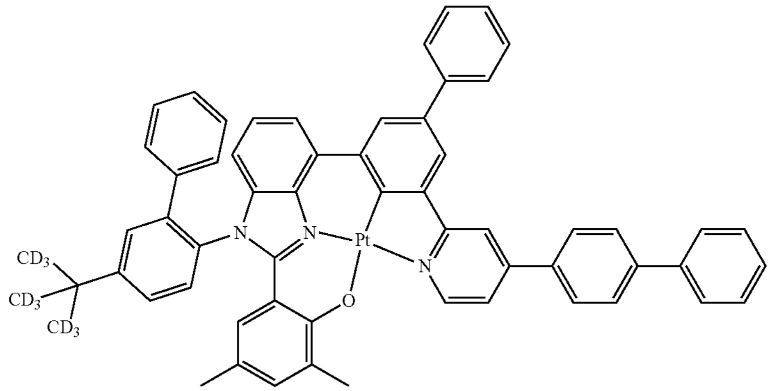

-continued
1958
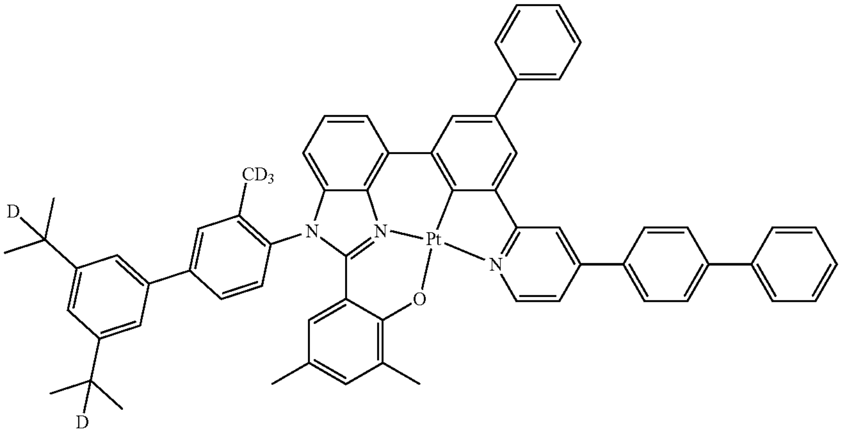
1959
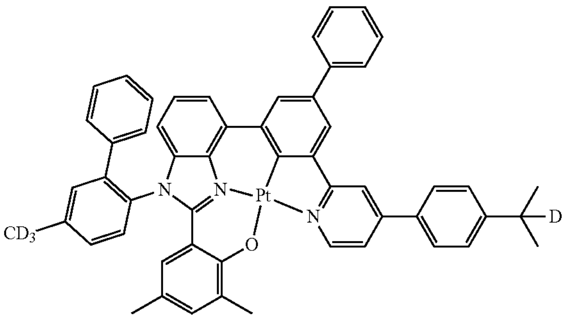
1960
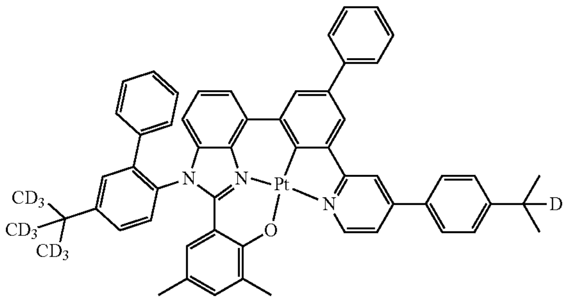
1961
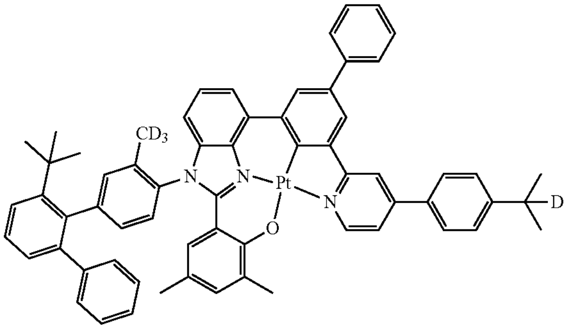
1962
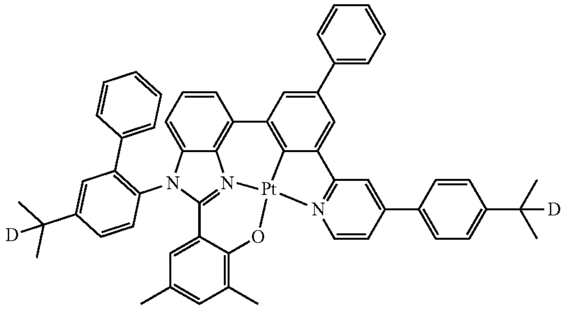
1963
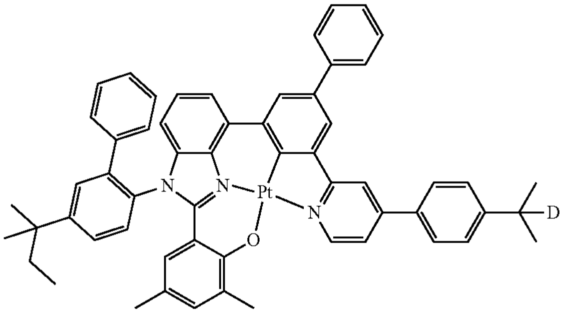
1964
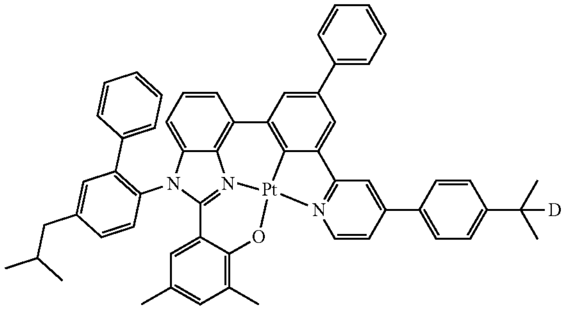

-continued
1965
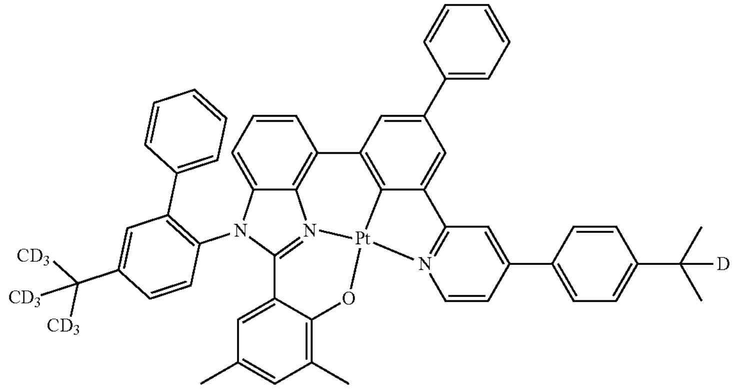
1966
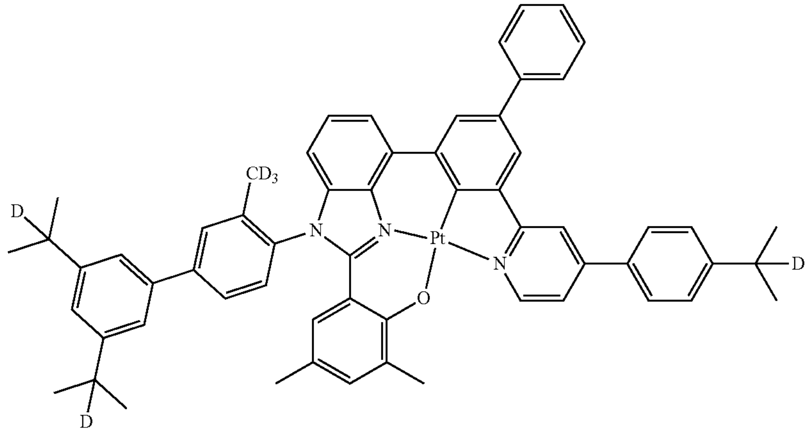
1967
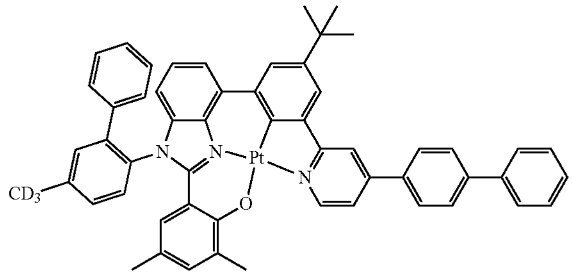
1968
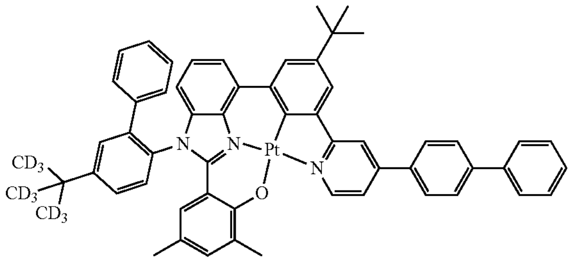
1969
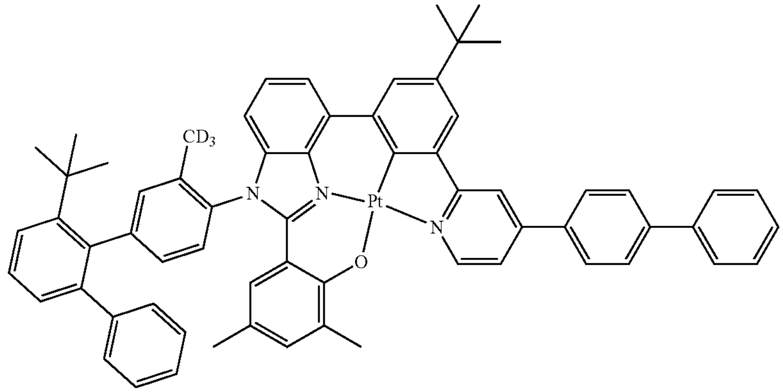

-continued
1970
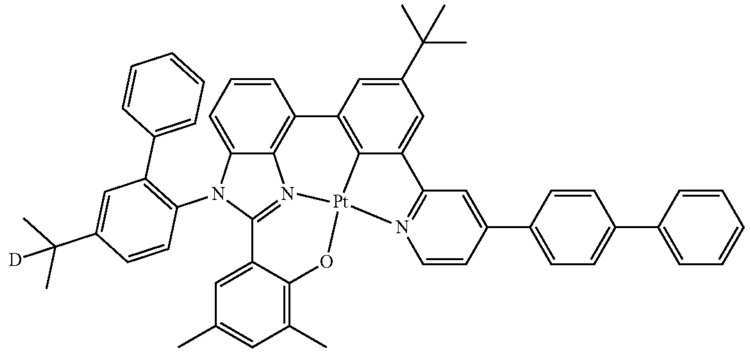
1971
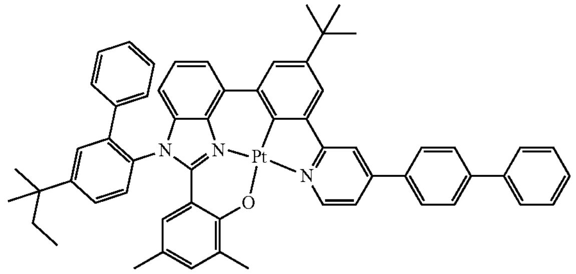
1972
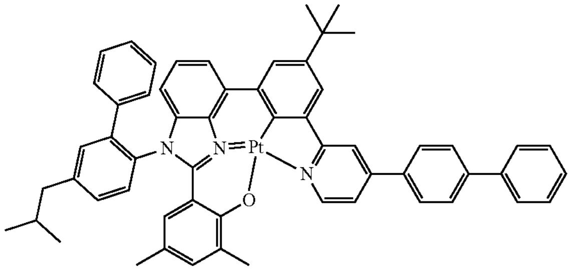
1973
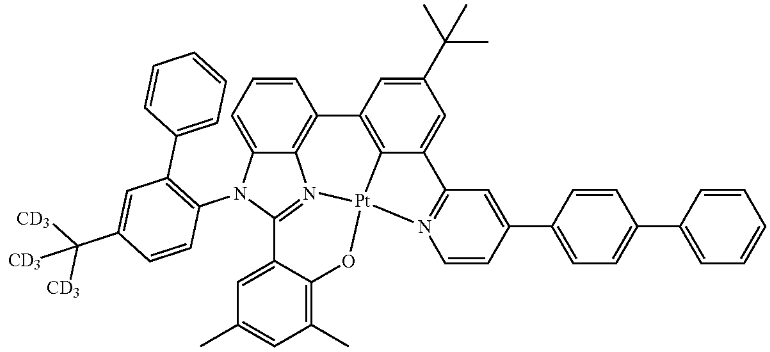
1974
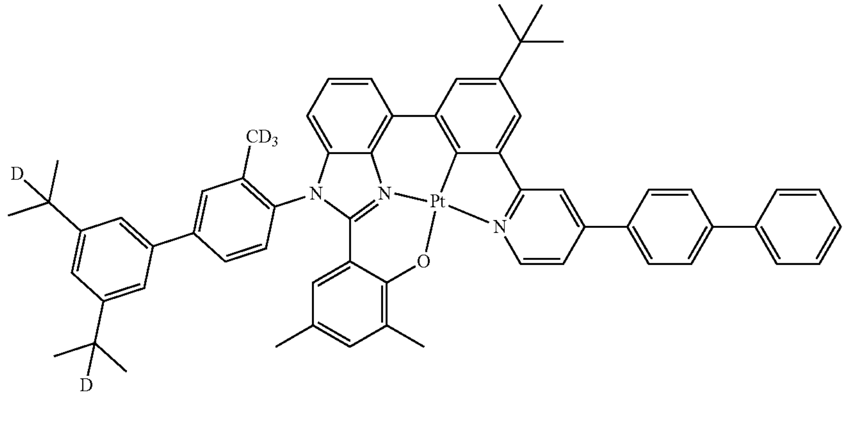

-continued
1975
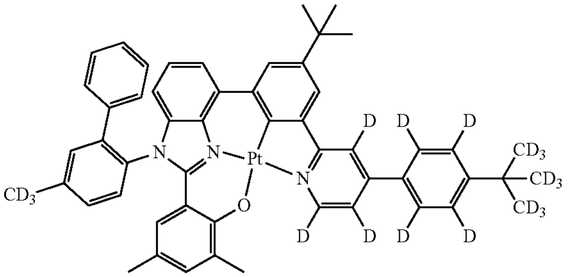
1976
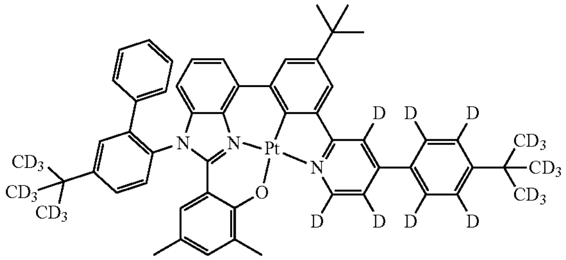
1977
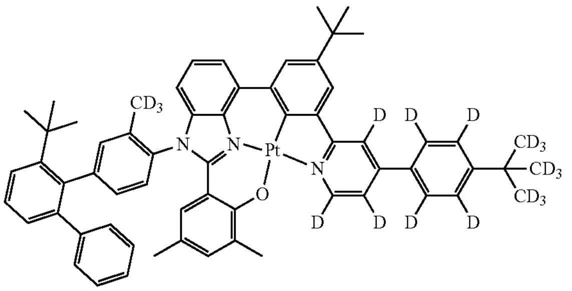
1978
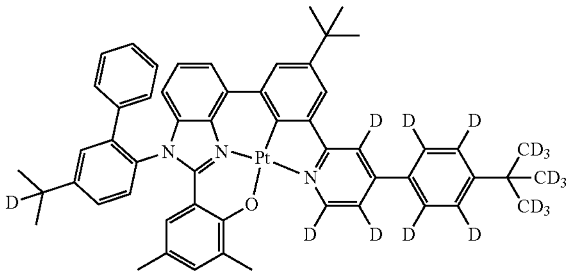
1979
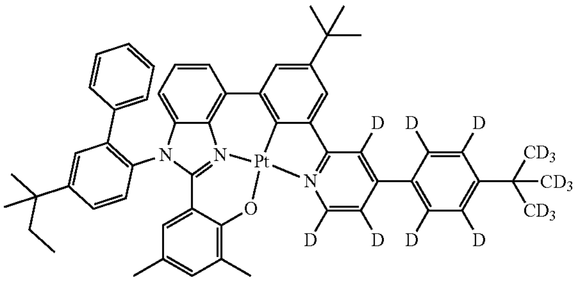
1980
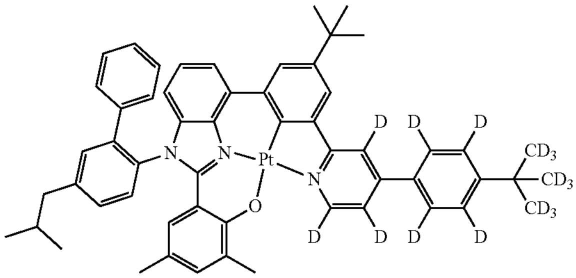
1981
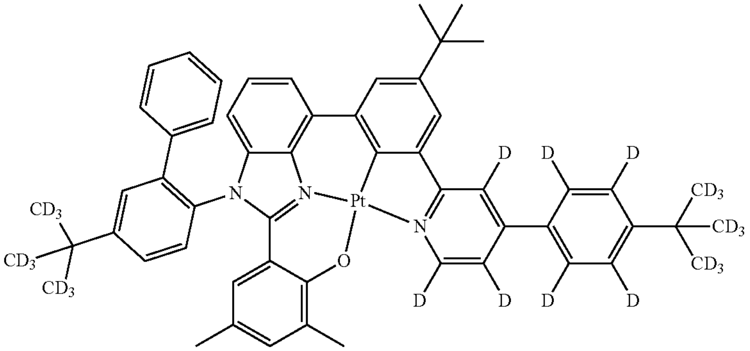

-continued
1982
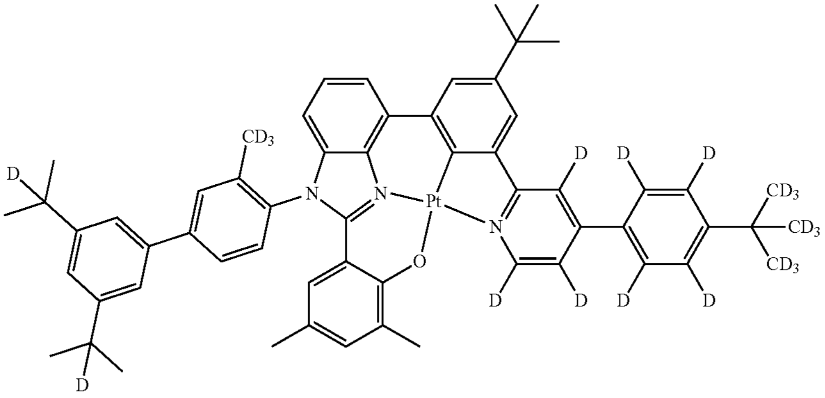
1983
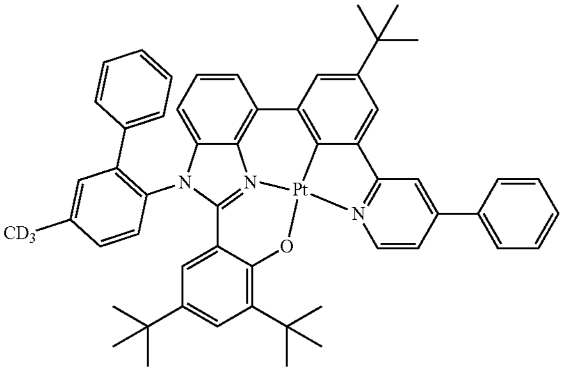
1984
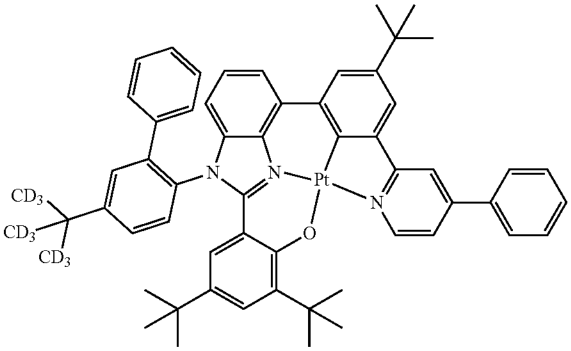
1985
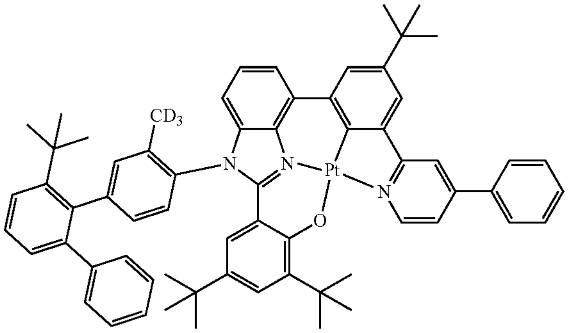
1986
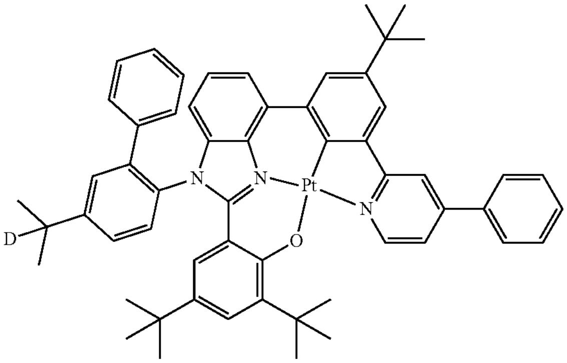
1987
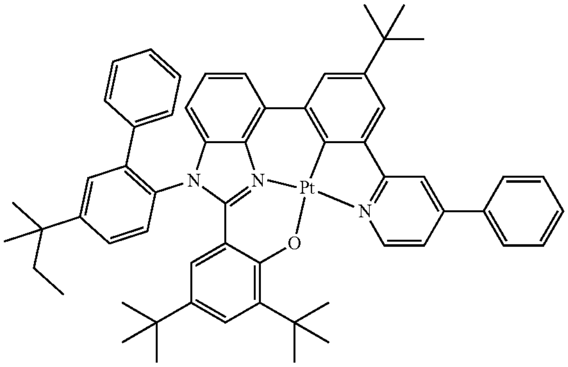
1988
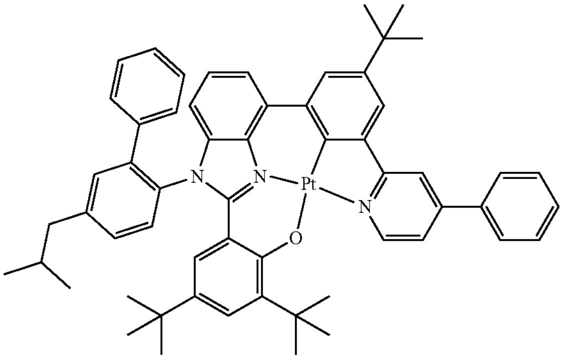

-continued
1989
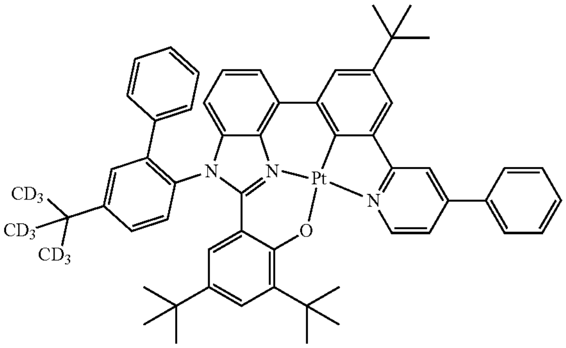
1990
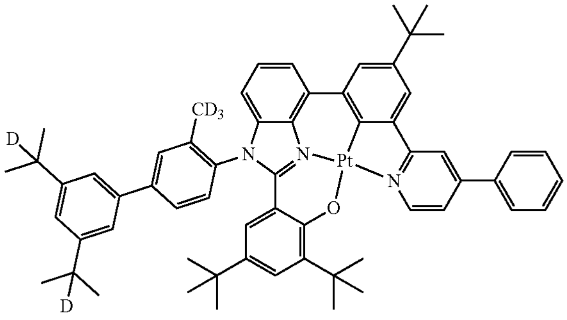
1991
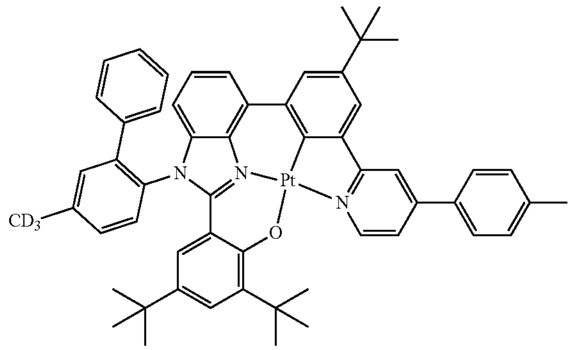
1992
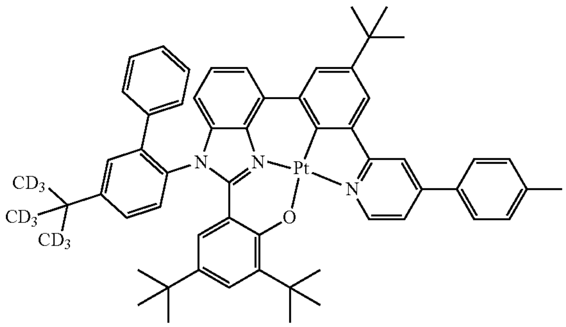
1993
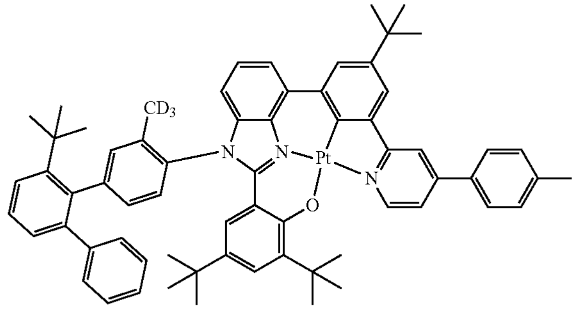
1994
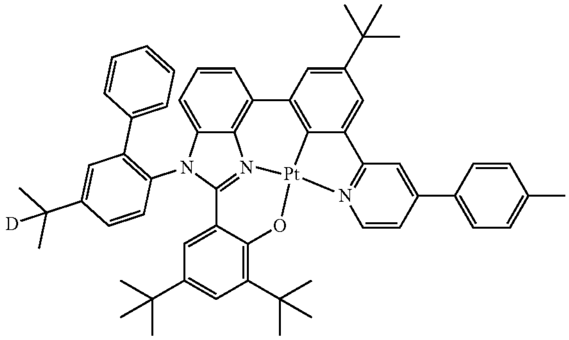
1995
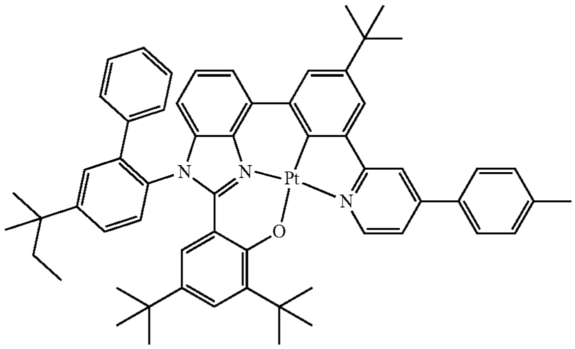
1996
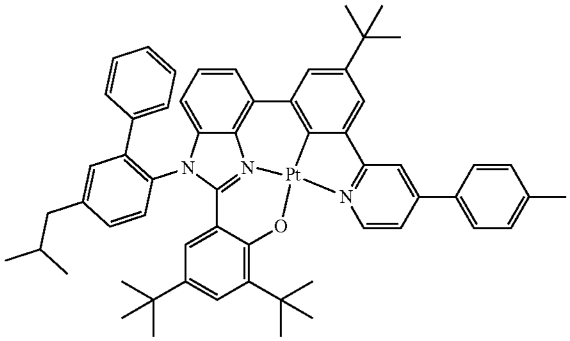

-continued
1997
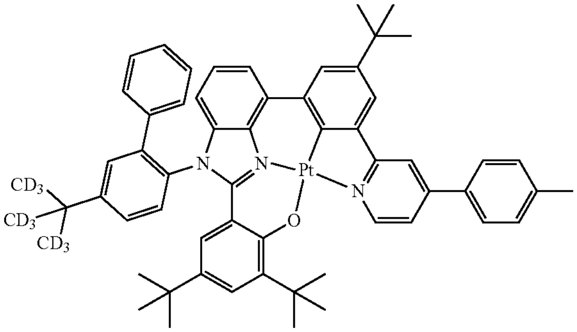
1998
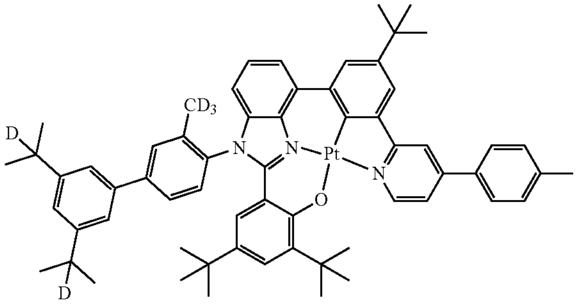
1999
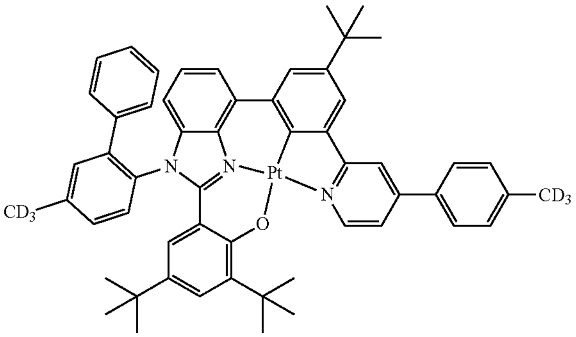
2000
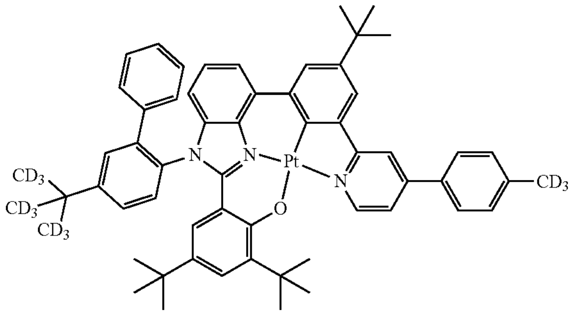
2001
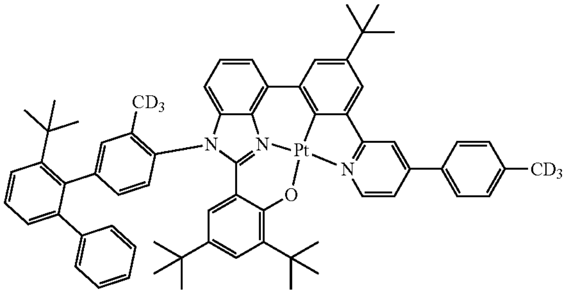
2002
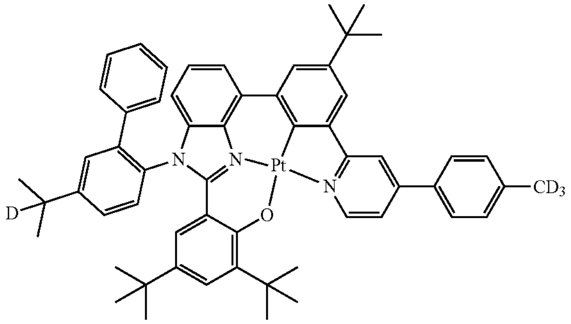
2003
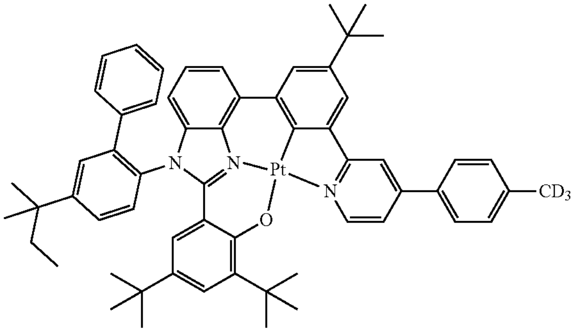
2004
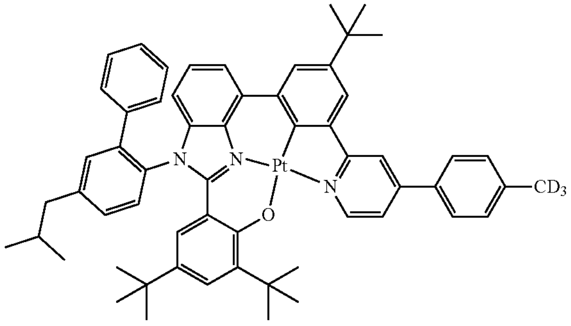

-continued
2005
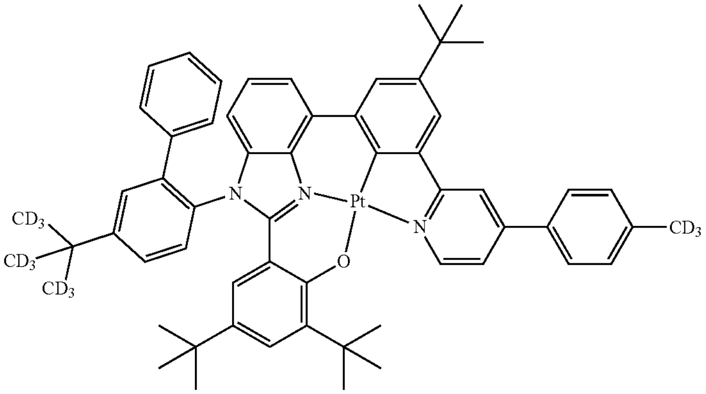
2006
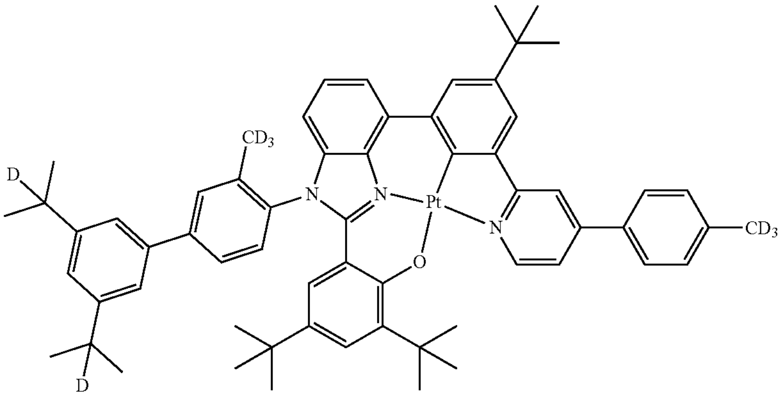
2007
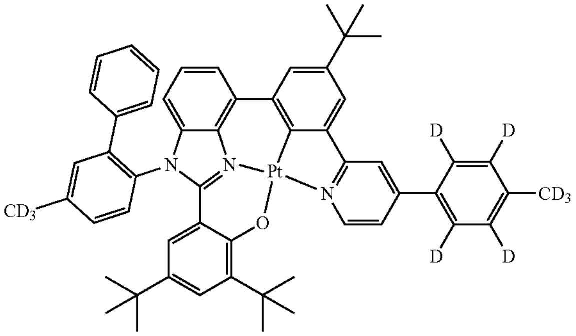
2008
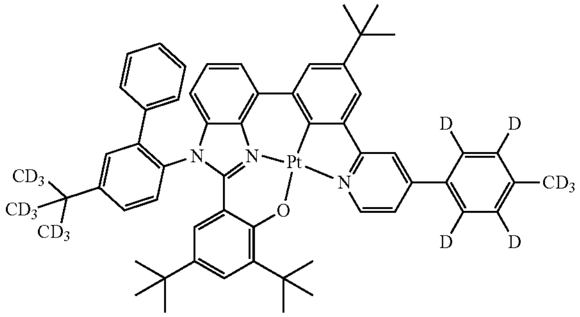
2009
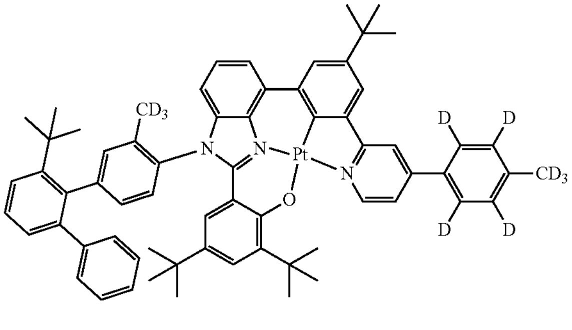
2010
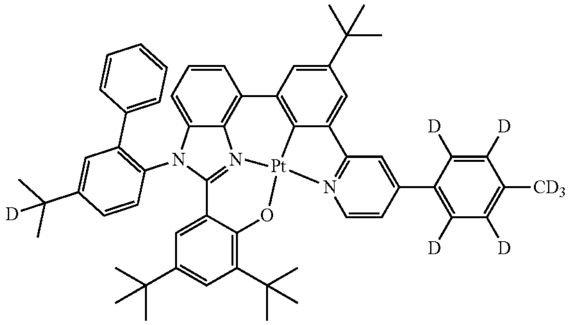

-continued
2011
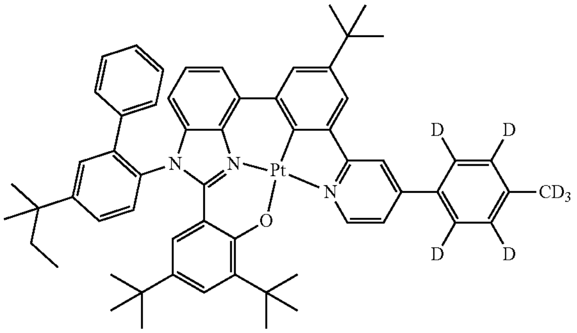
2012
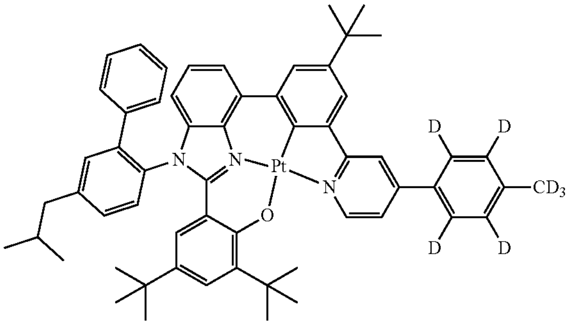
2013
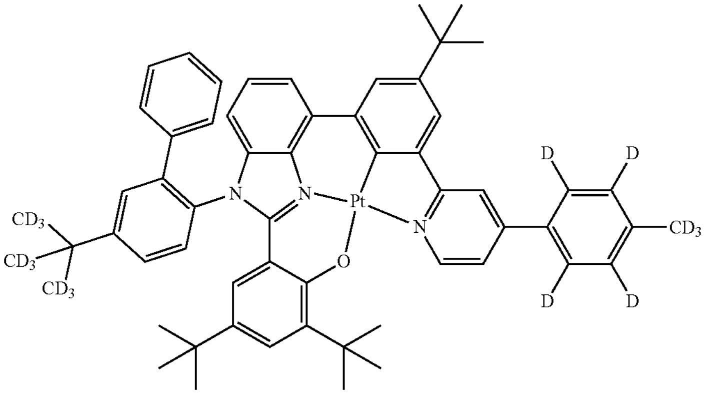
2014
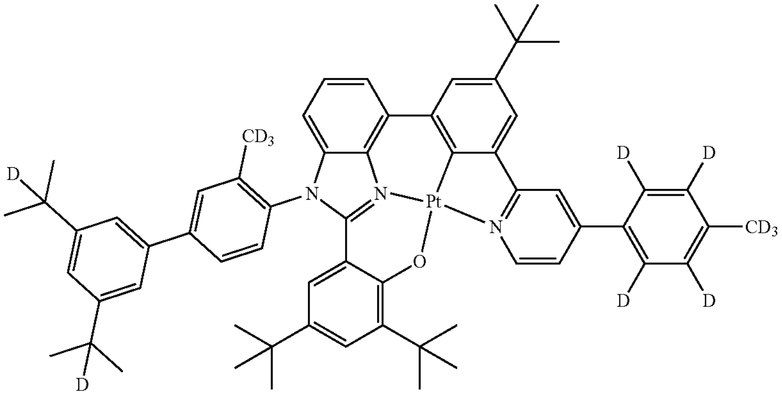
2015
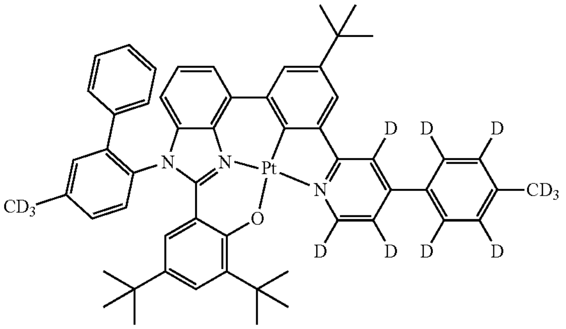
2016
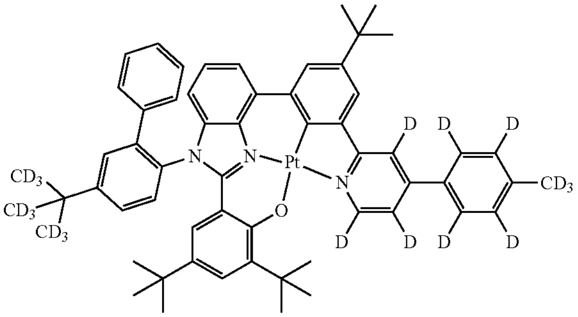

-continued
2017
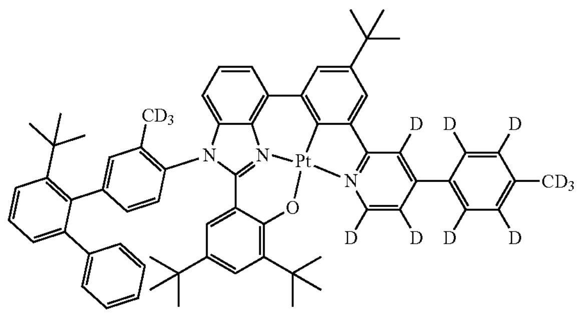
2018
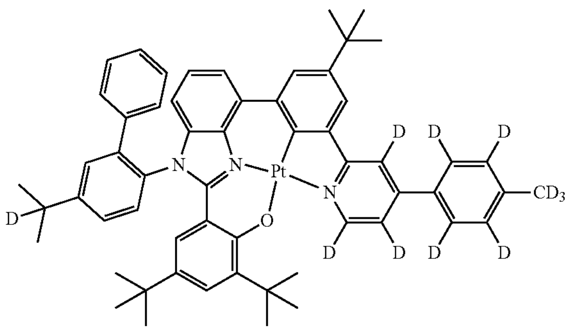
2019
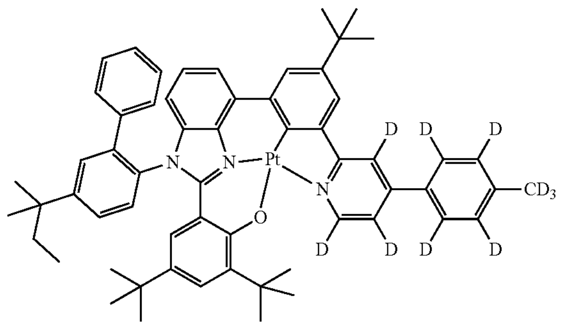
2020
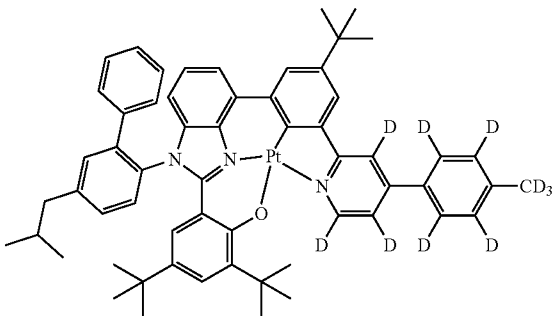
2021
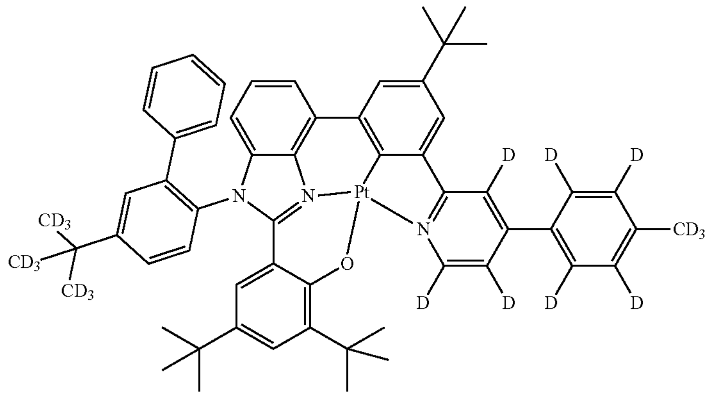
2022
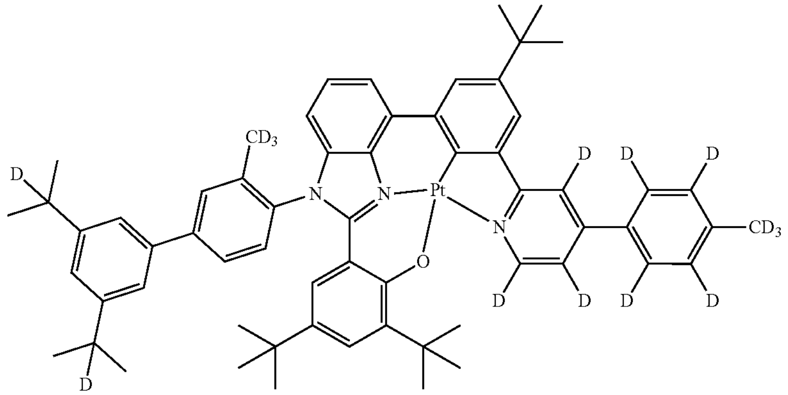

-continued
2023
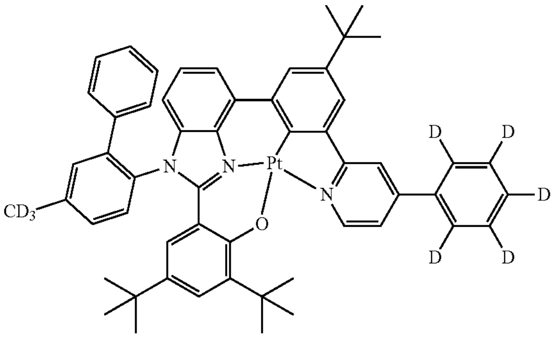
2024
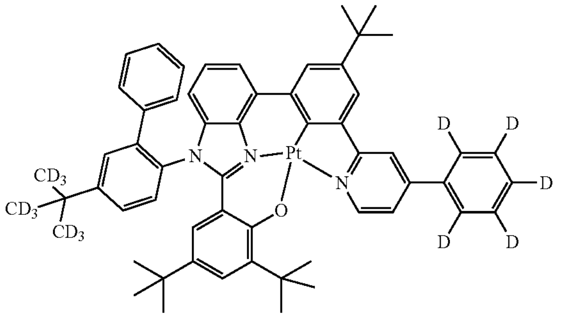
2025
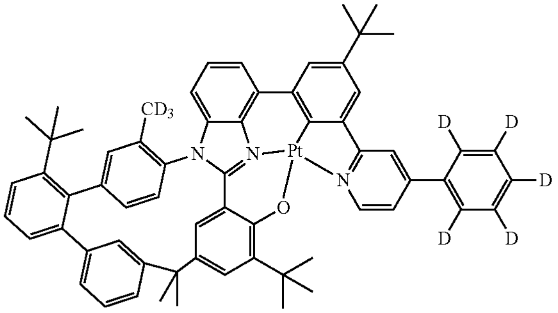
2026
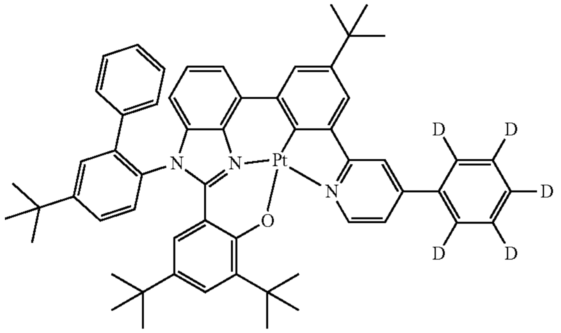
2027
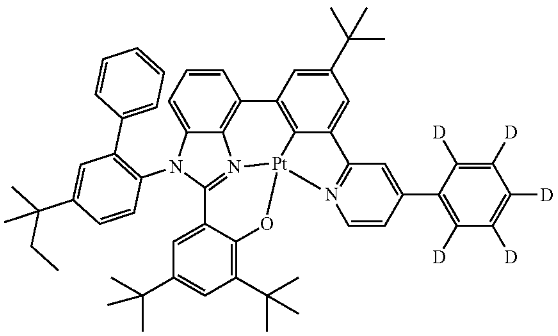
2028
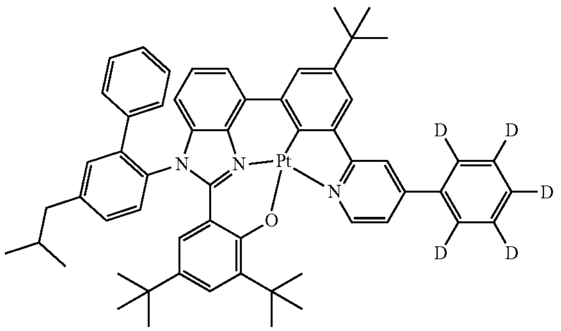
2029
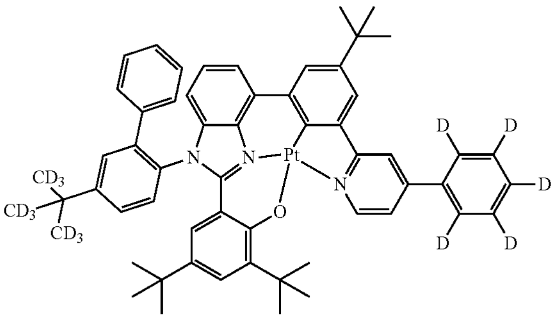
2030
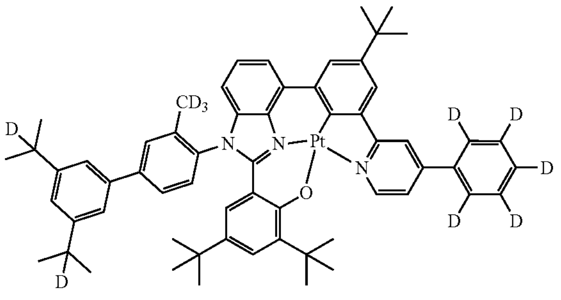

-continued
2031
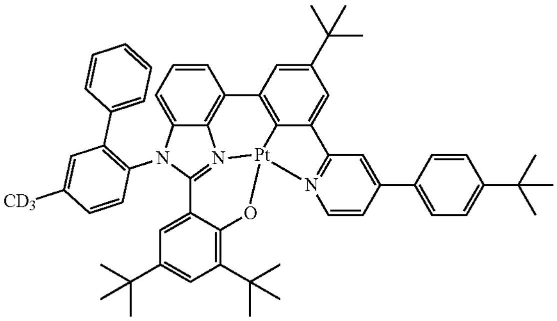
2032
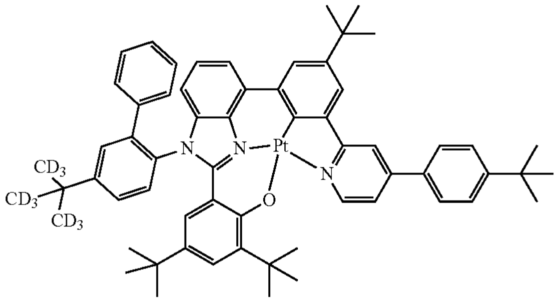
2033
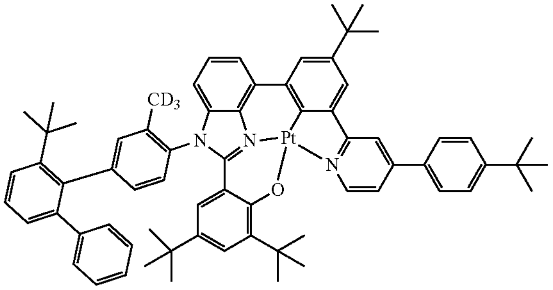
2034
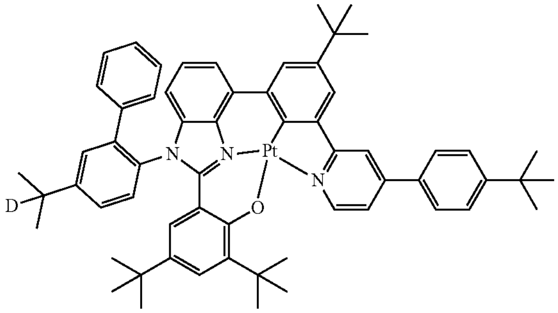
2035
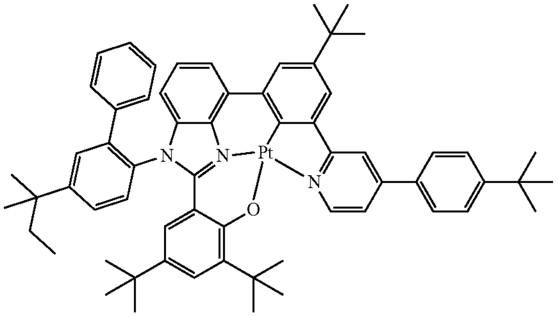
2036
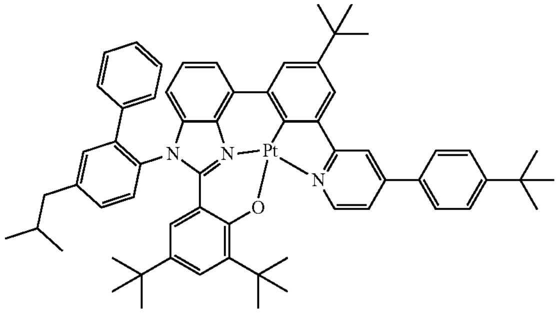
2037
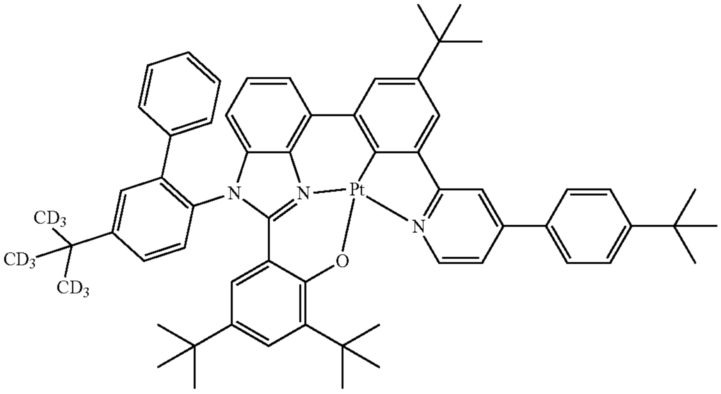

-continued
2038
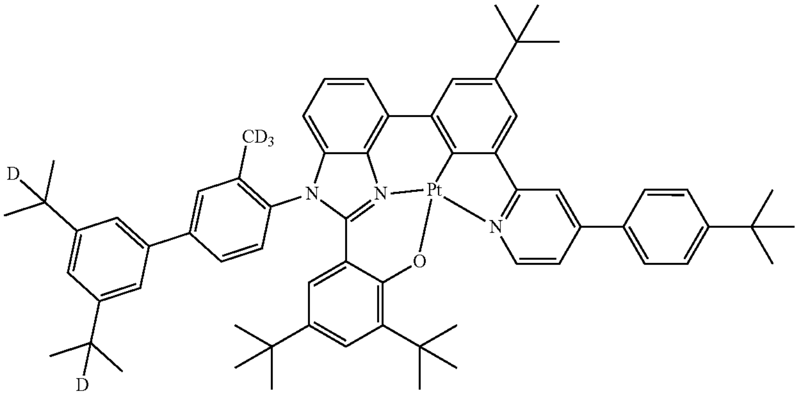
2039
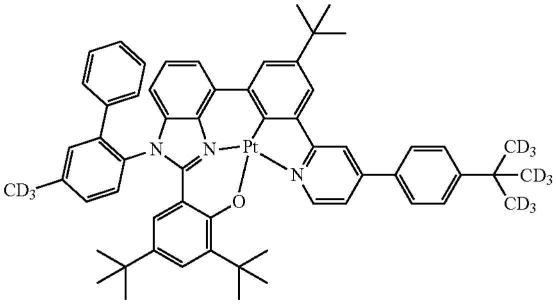
2040
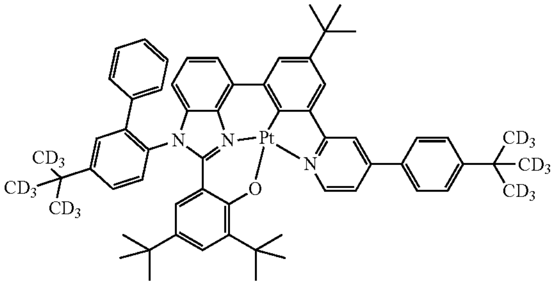
2041
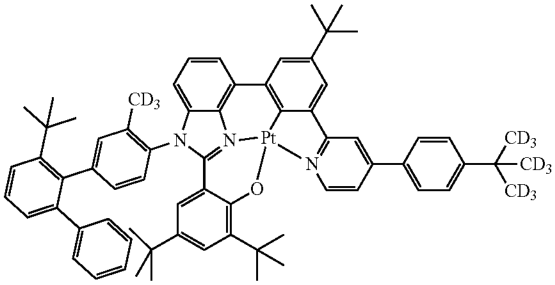
2042
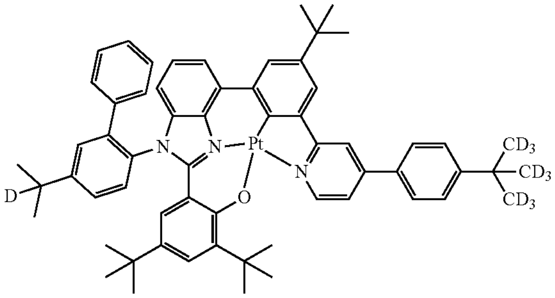
2043
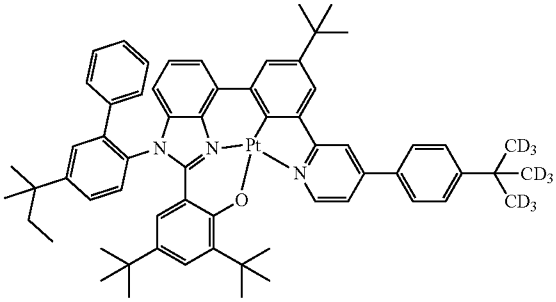
2044
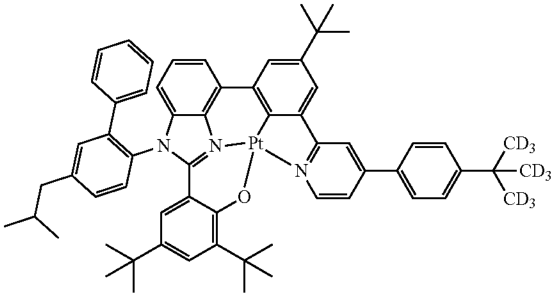

-continued
2045
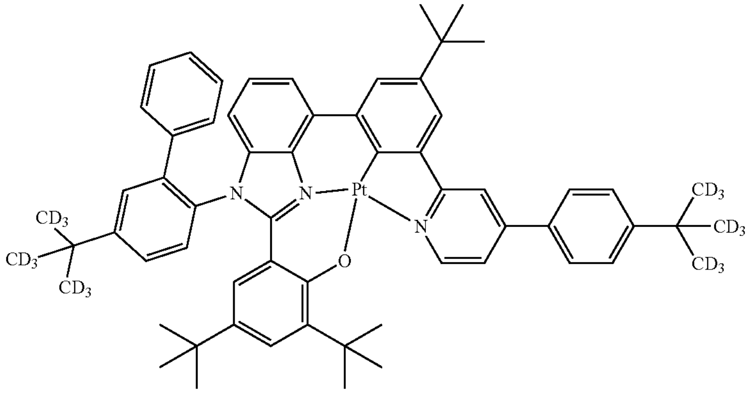
2046
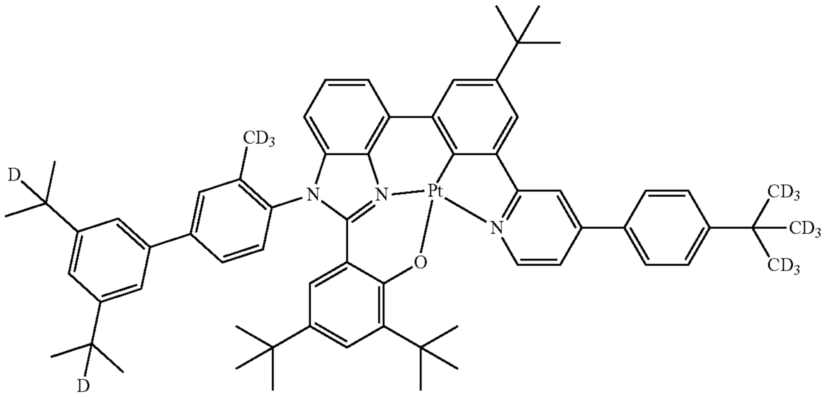
2047
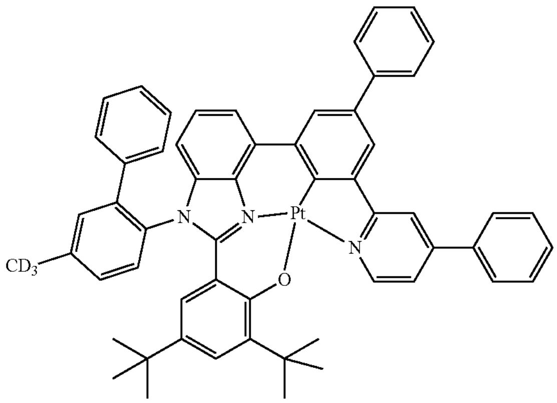
2048
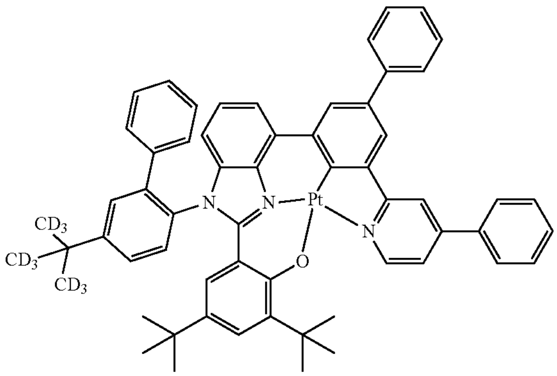
2049
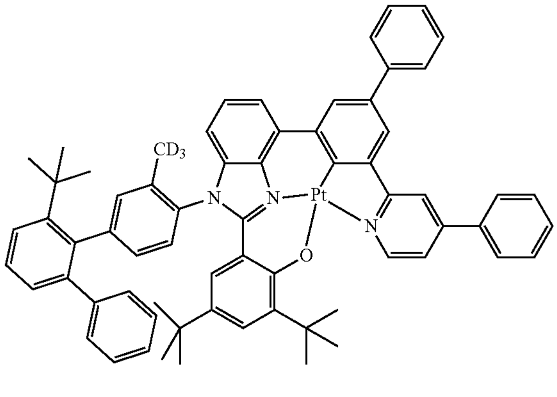
2050
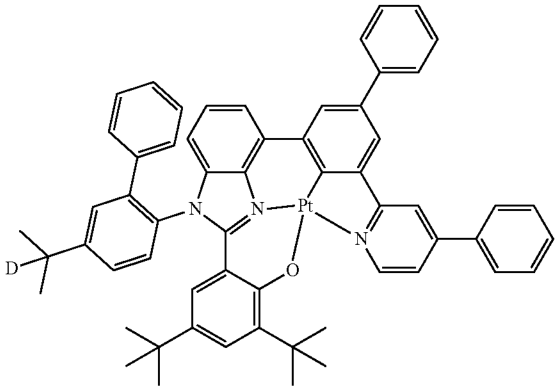

-continued
2051
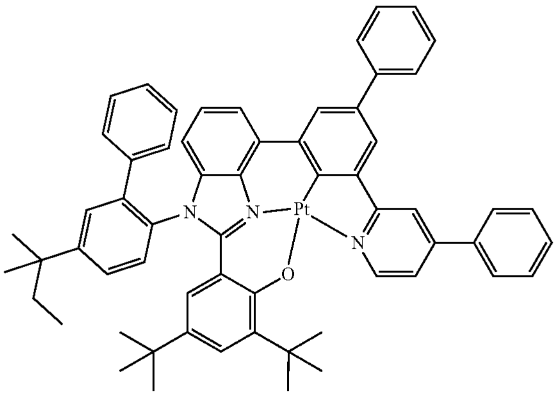
2052
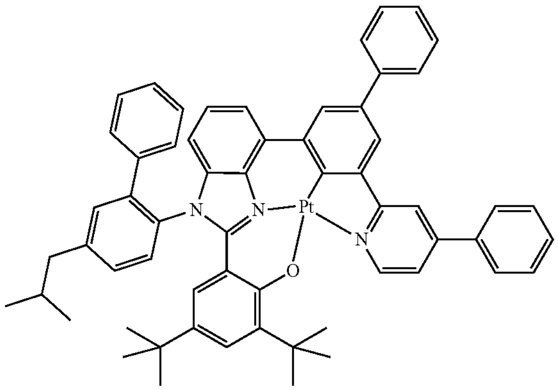
2053
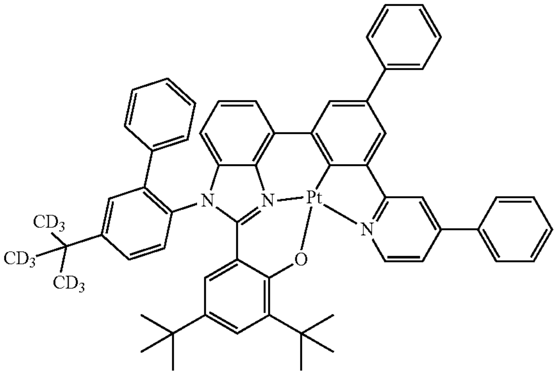
2054
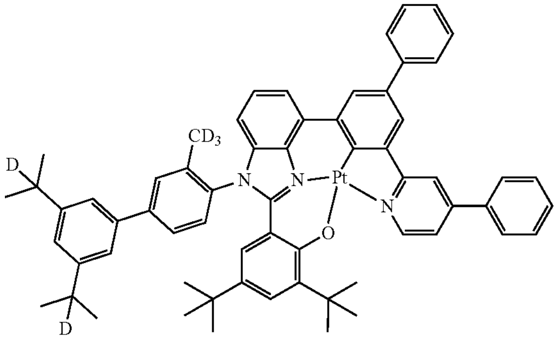
2055
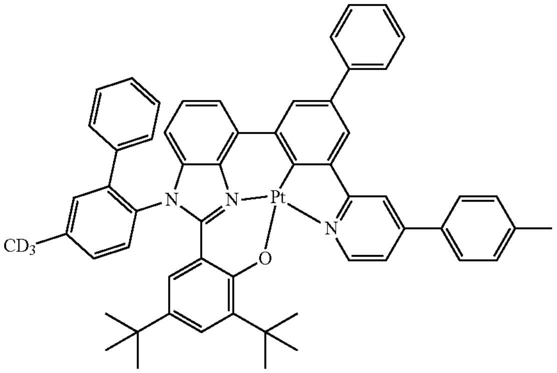
2056
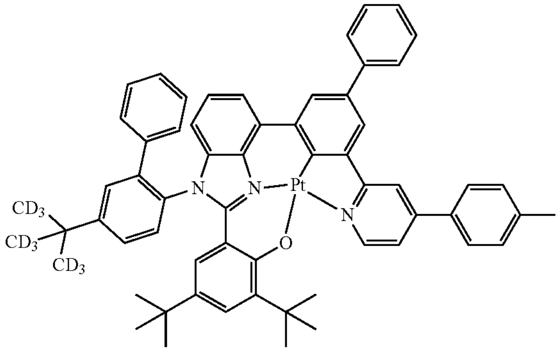
2057
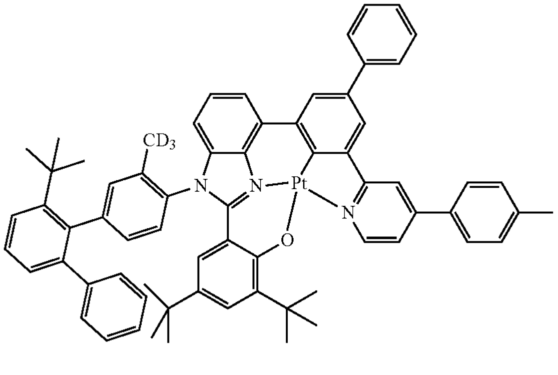
2058
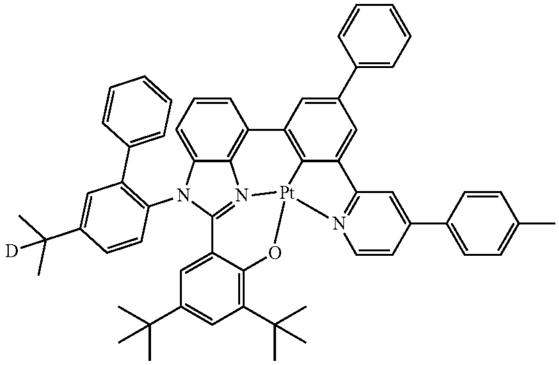

-continued
2059
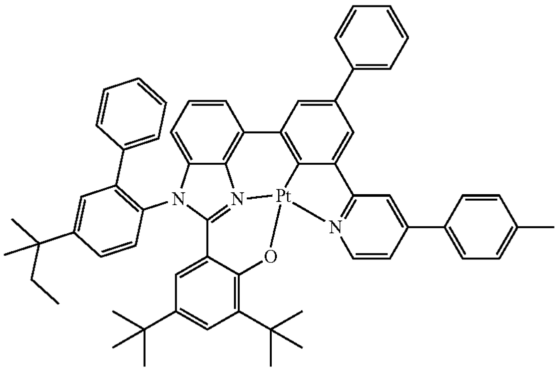
2060
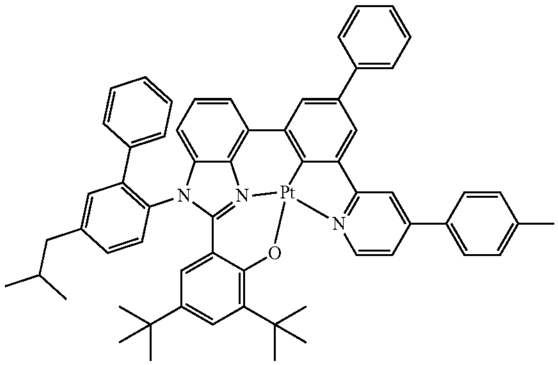
2061
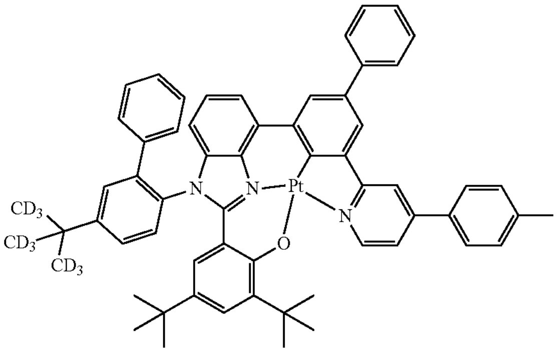
2062
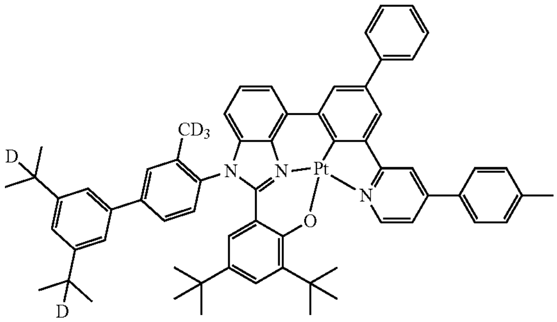
2063
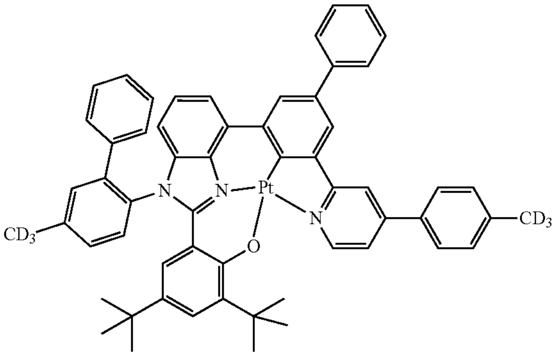
2064
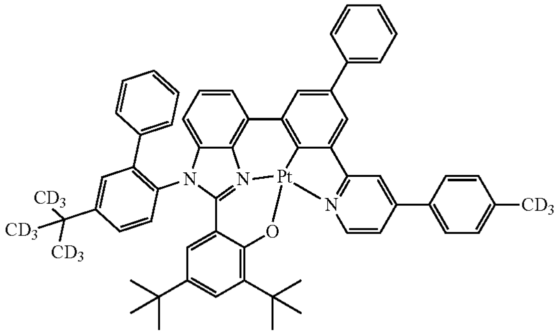
2065
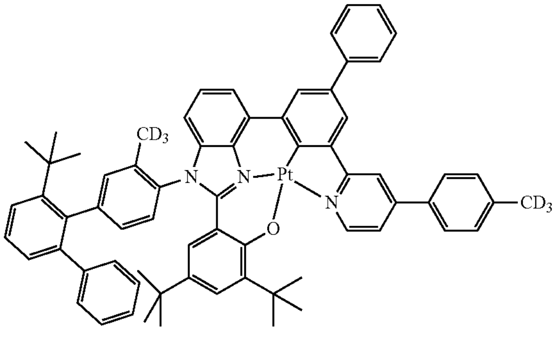
2066
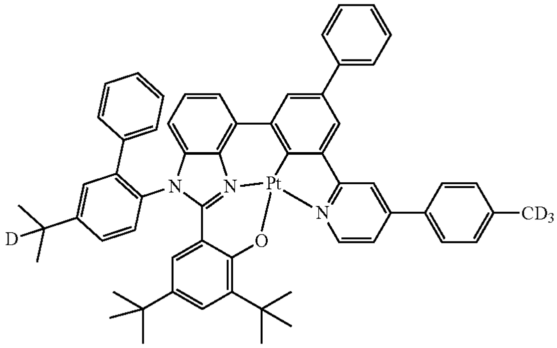

-continued
2067
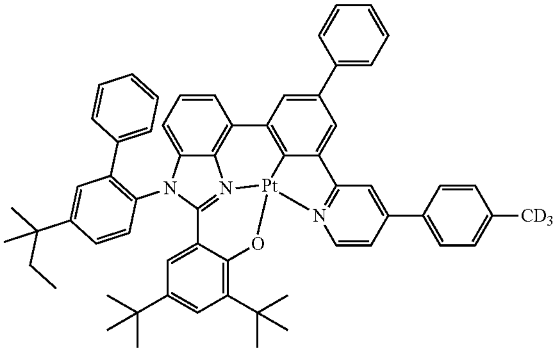
2068
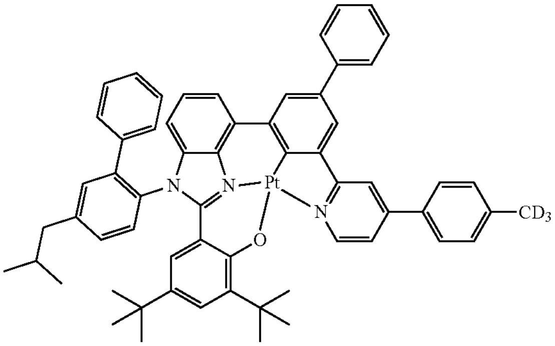
2069
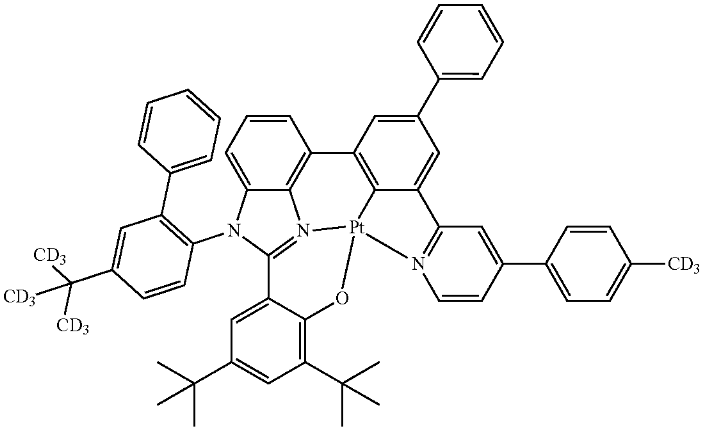
2070
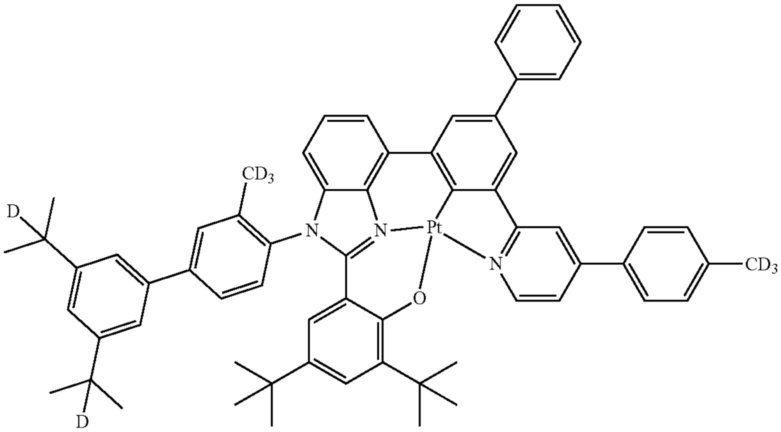
2071
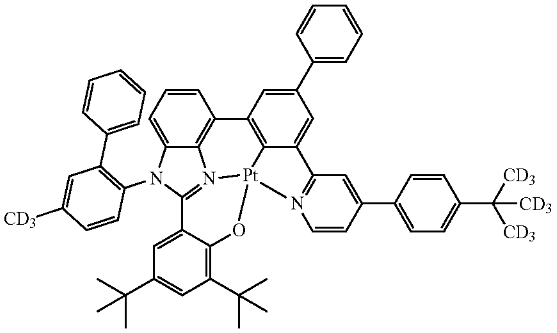
2072
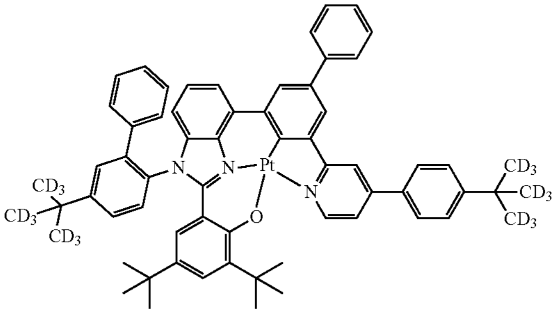

-continued
2073
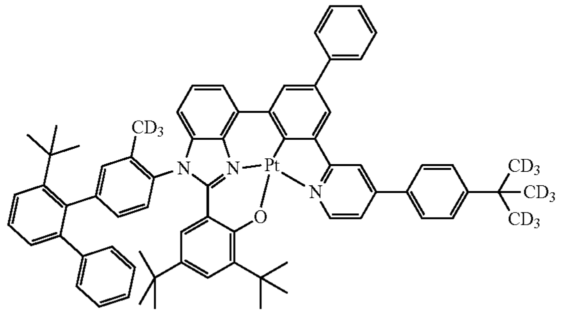
2074
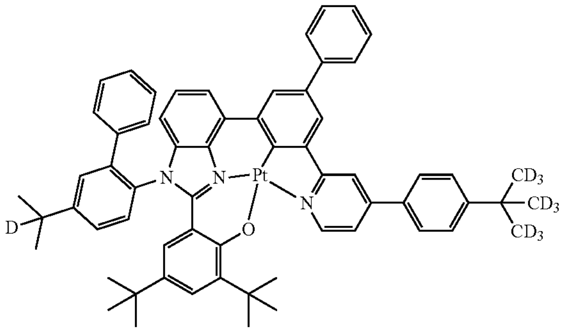
2075
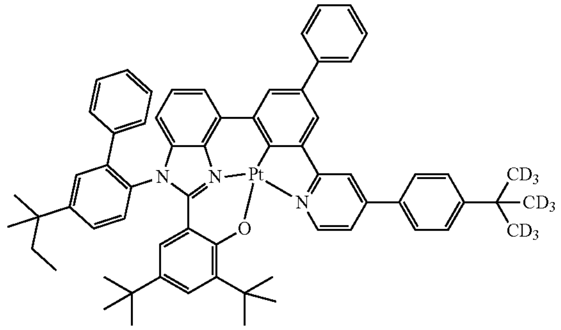
2076
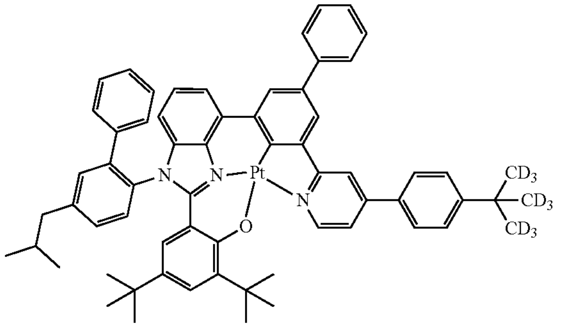
2077
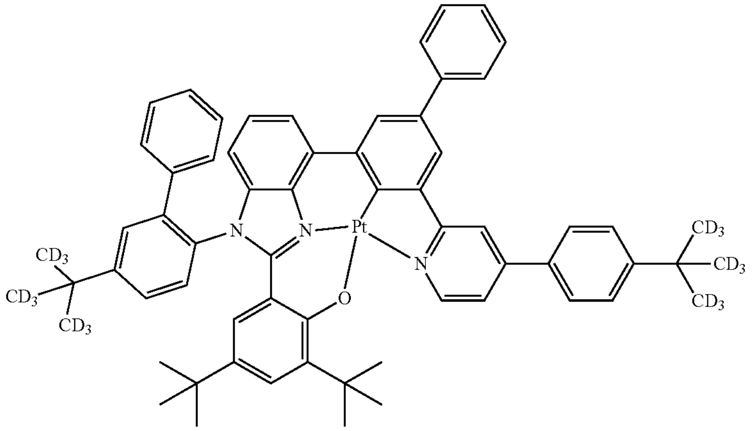
2078
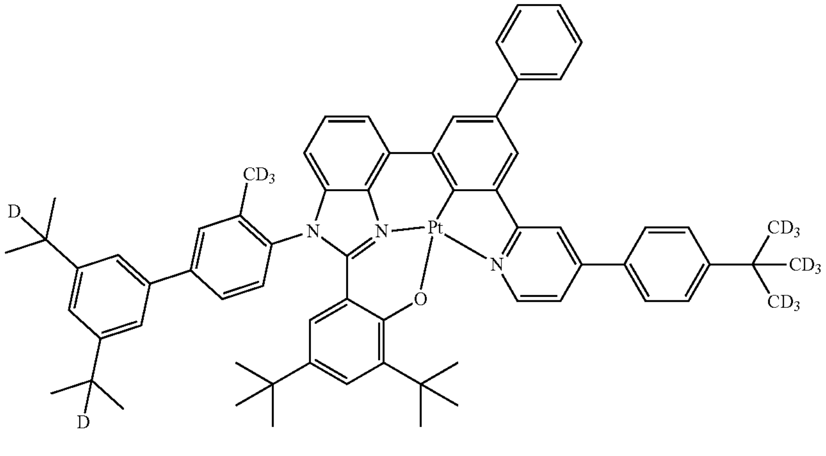

-continued
2079
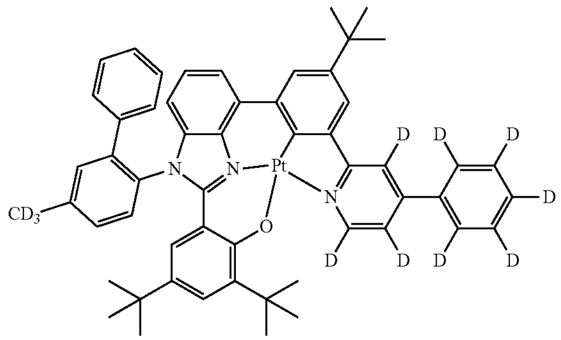
2080
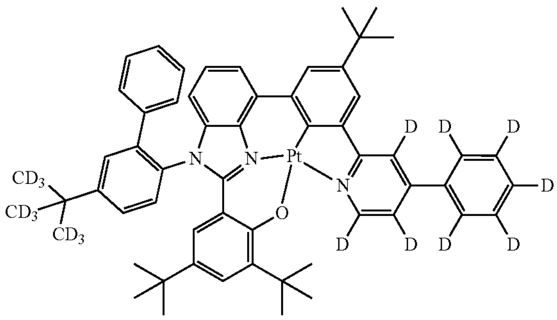
2081
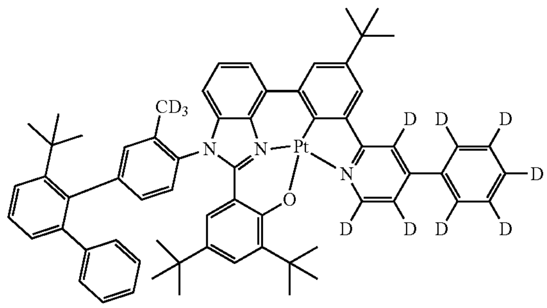
2082
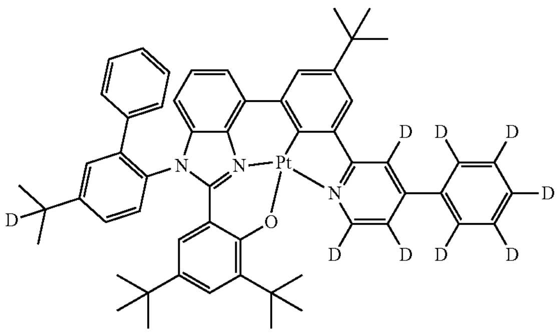
2083
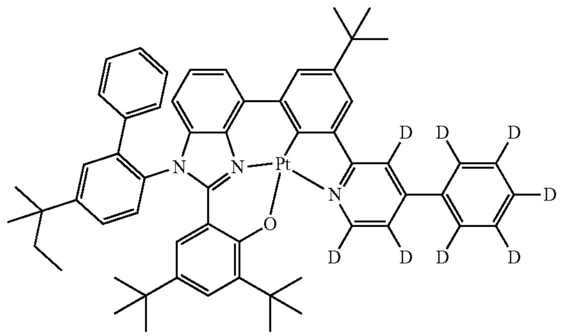
2084
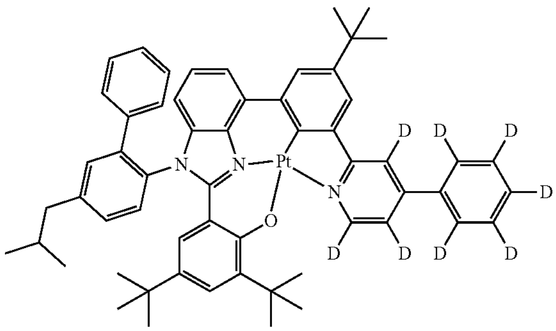
2085
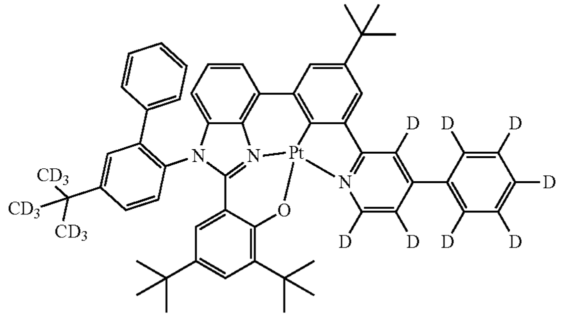
2086
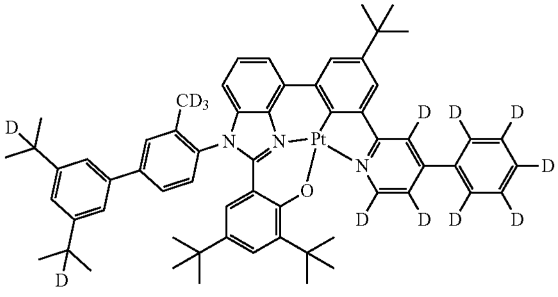

-continued
2087
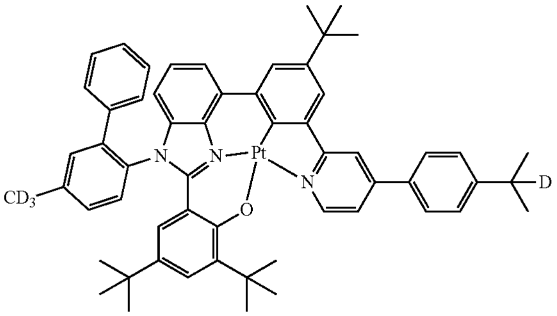
2088
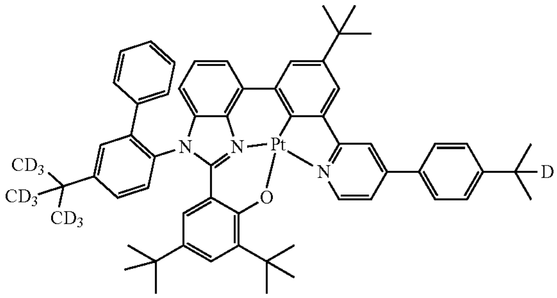
2089
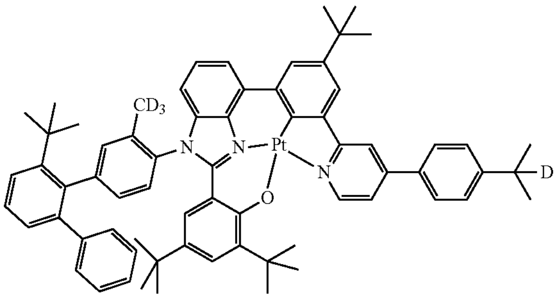
2090
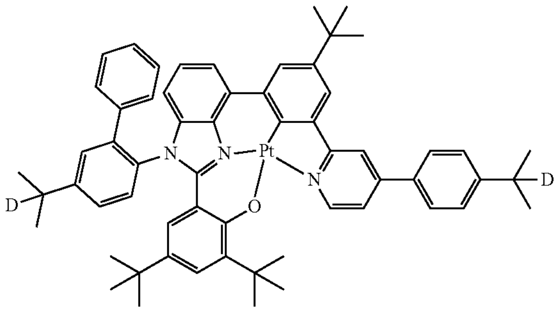
2091
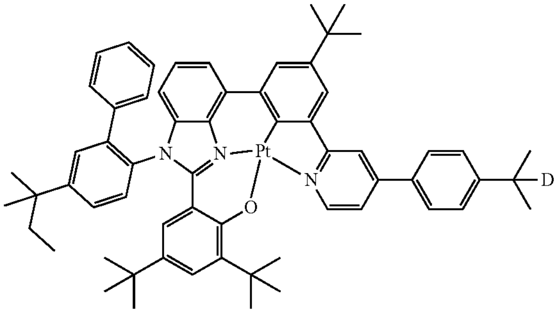
2092
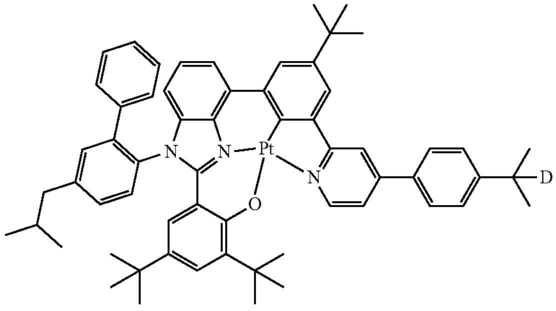
2093
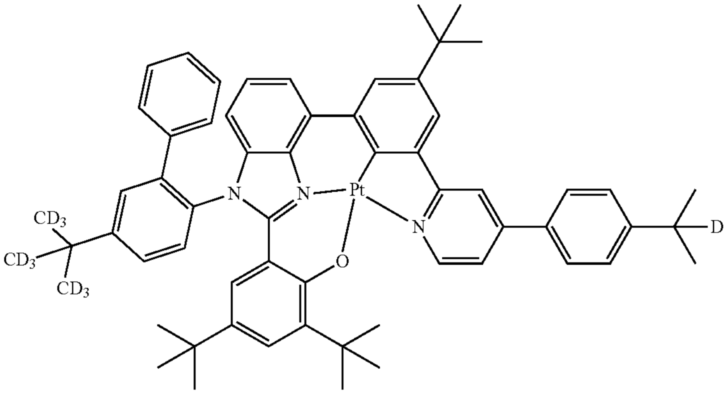

-continued
2094
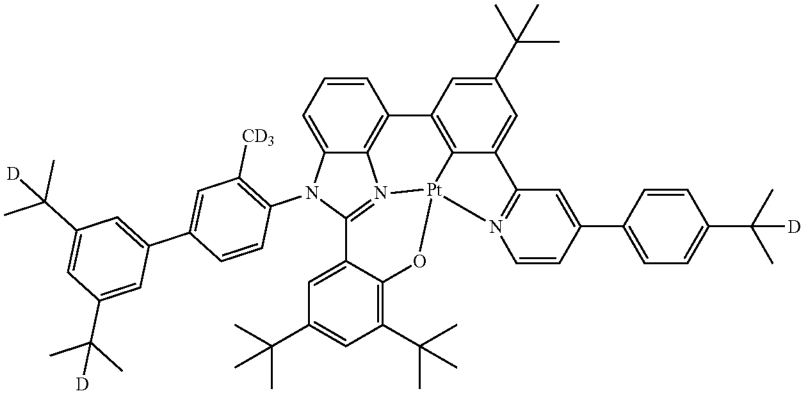
2095
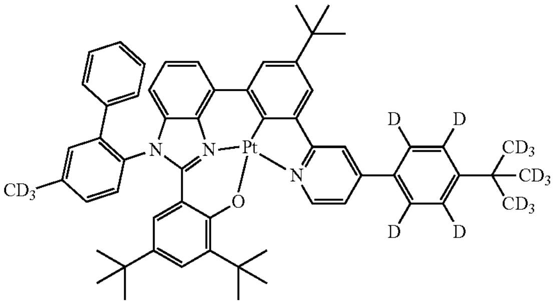
2096
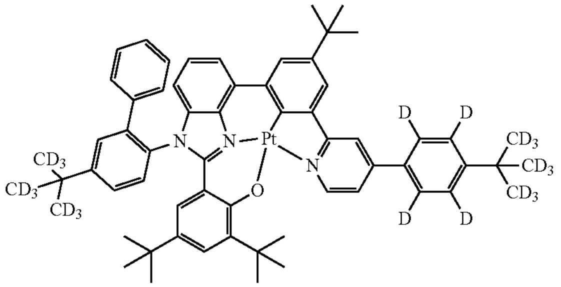
2097
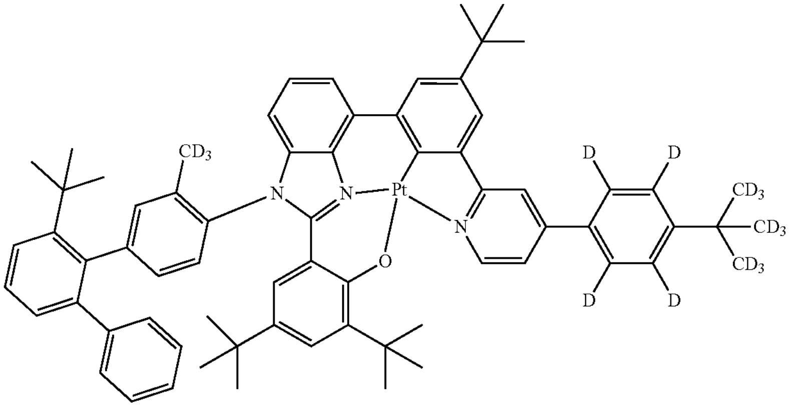
2098
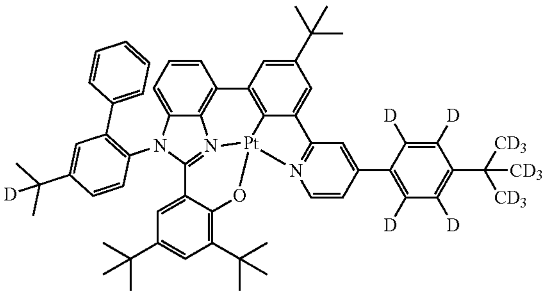
2099
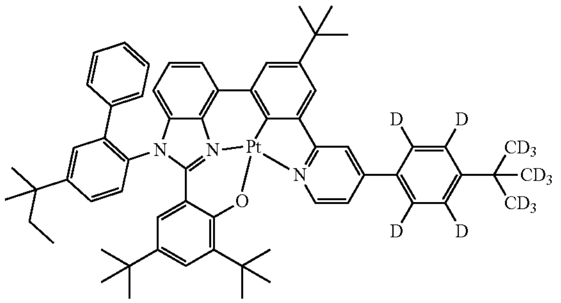

-continued
2100
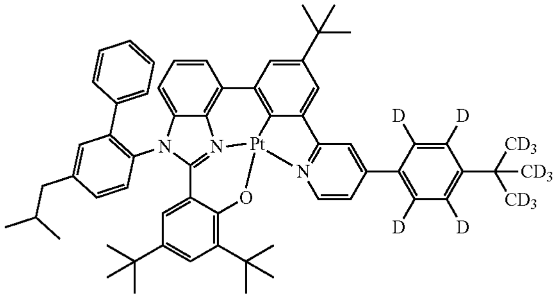
2101
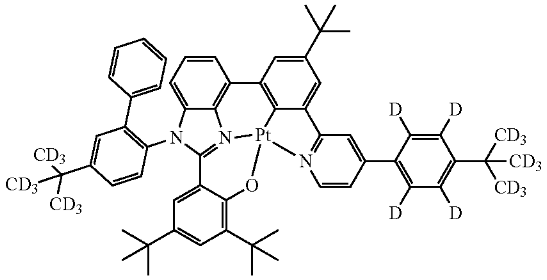
2102
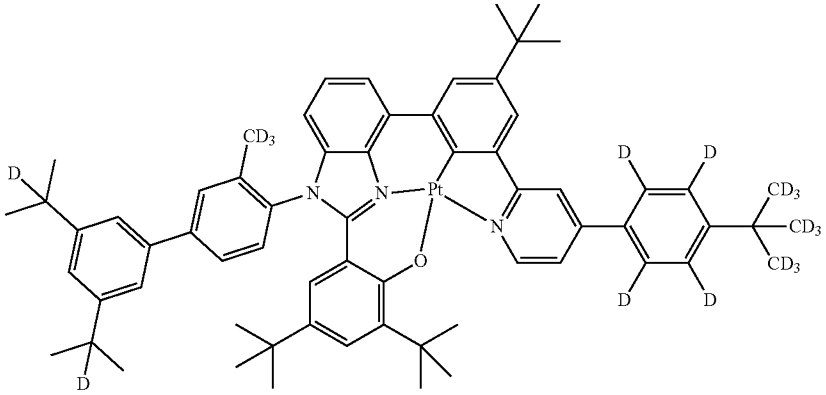
2103
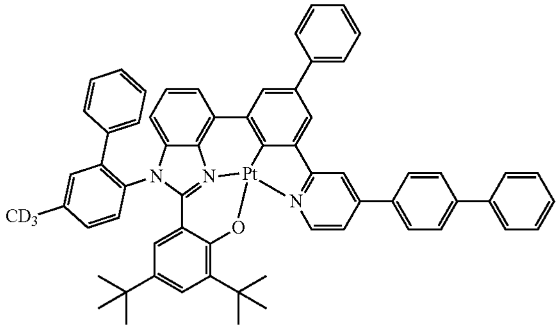
2104
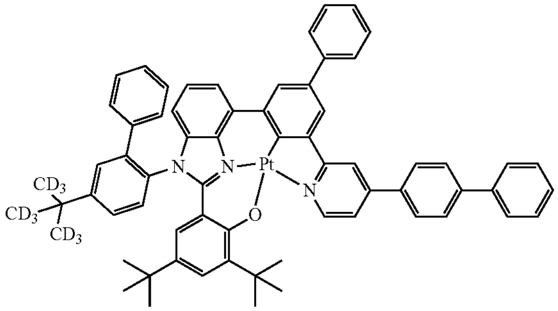
2105
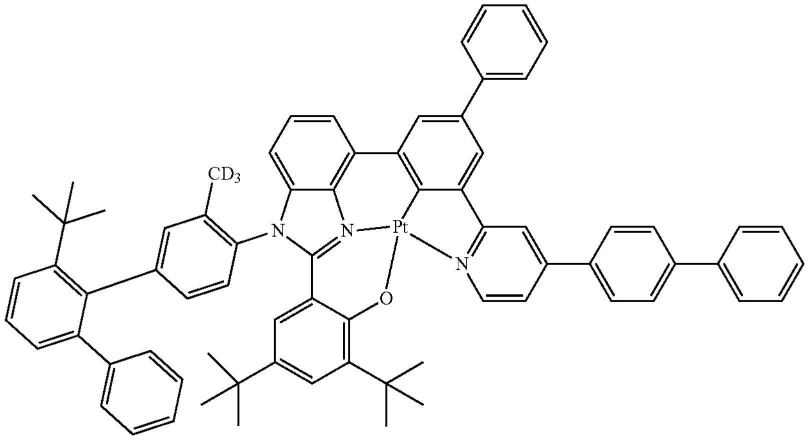

-continued
2106
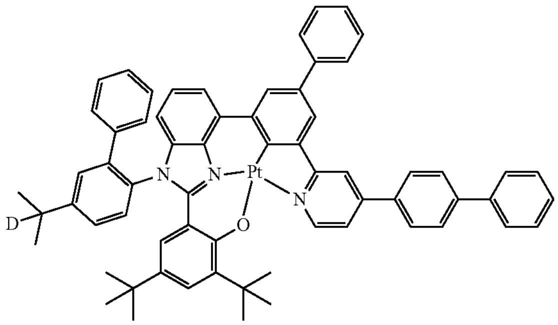
2107
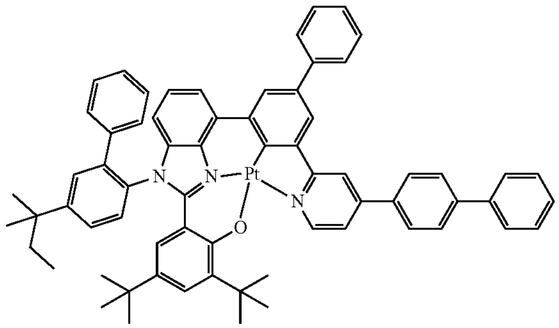
2108
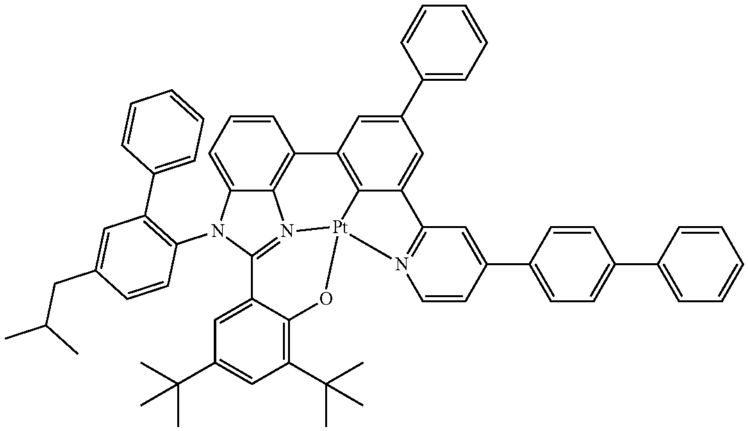
2109
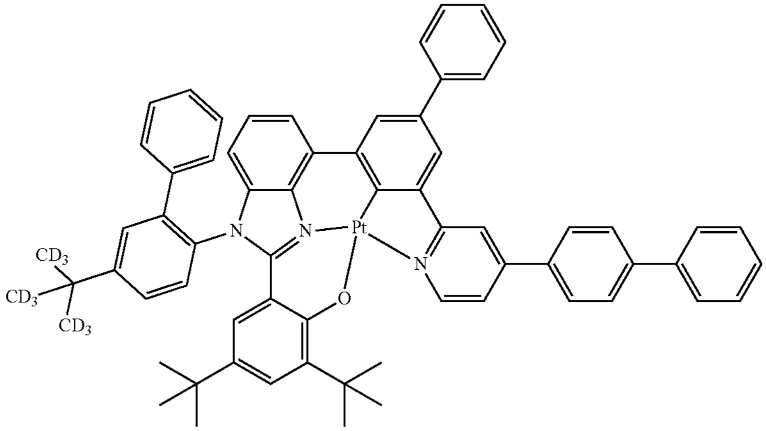
2110
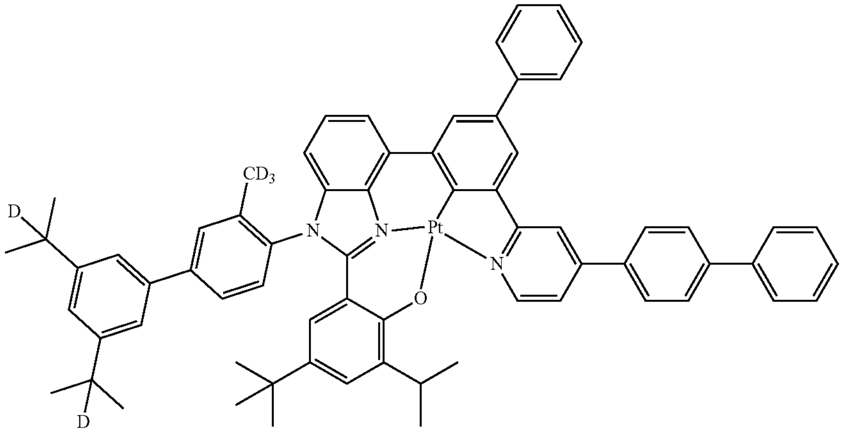

-continued
2111
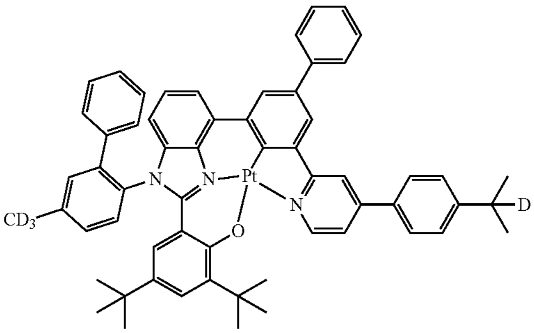
2112
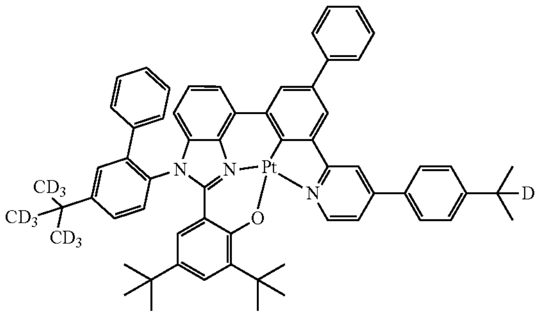
2113
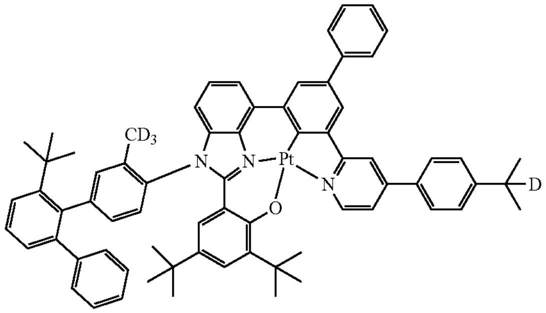
2114
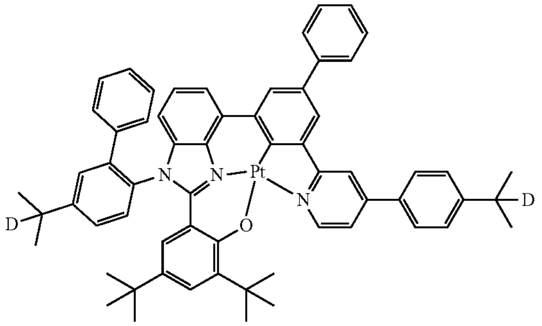
2115
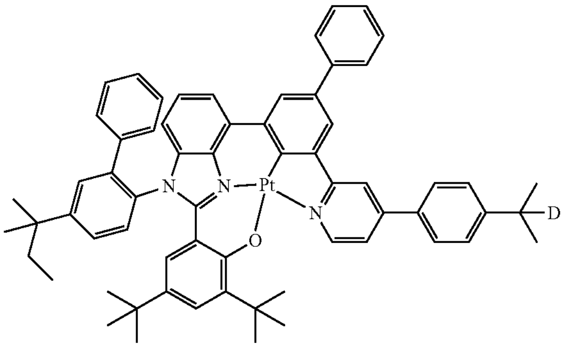
2116
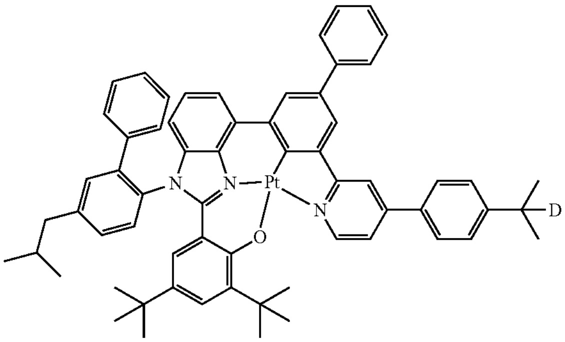
2117
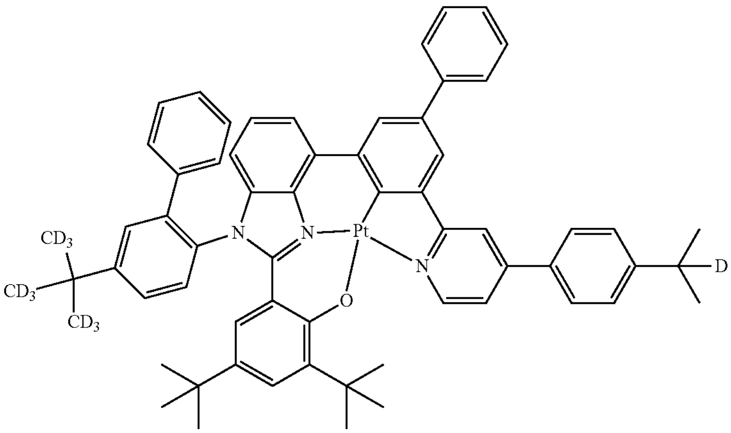

-continued
2118
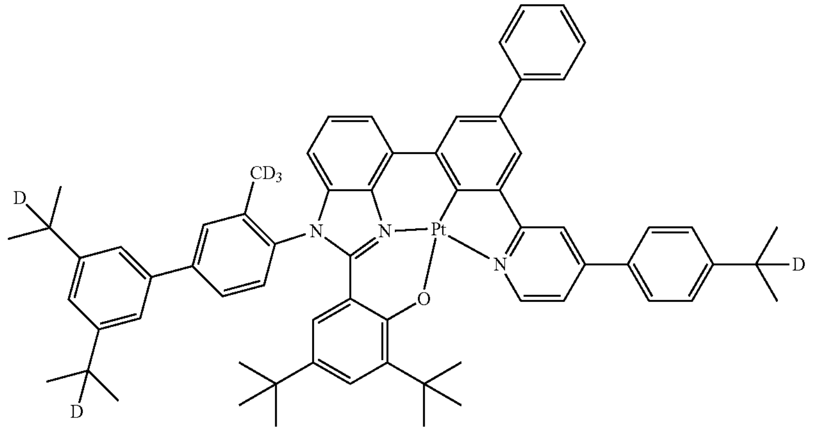
2119
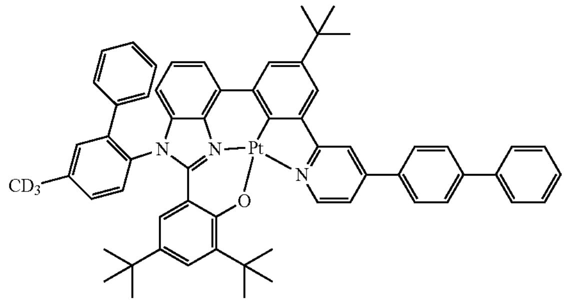
2120
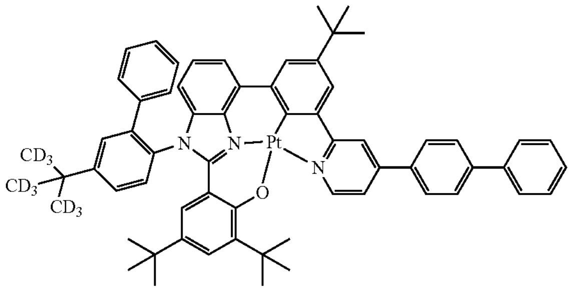
2121
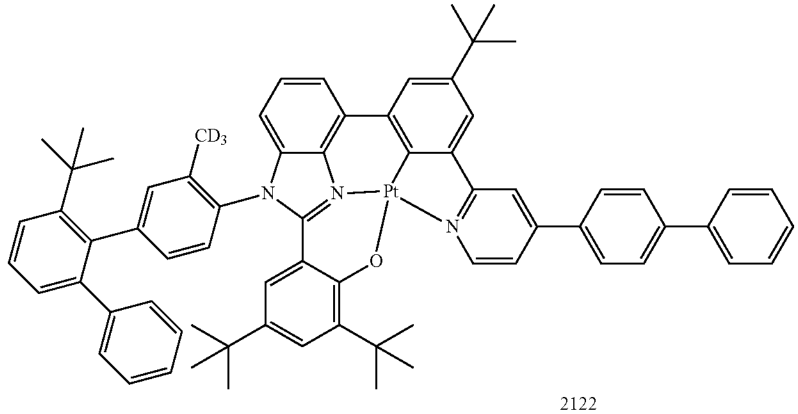
2122
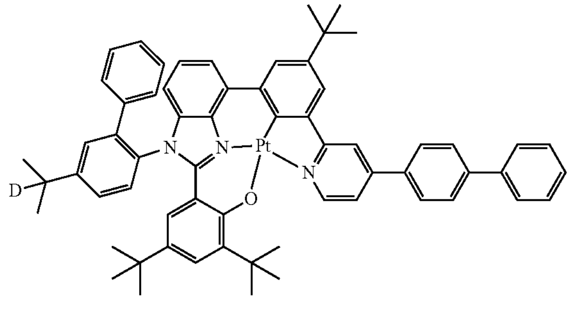
2123
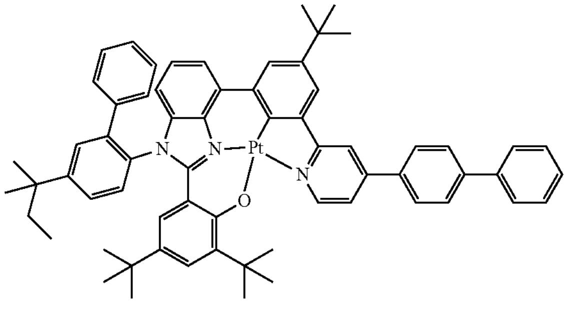

-continued
2124
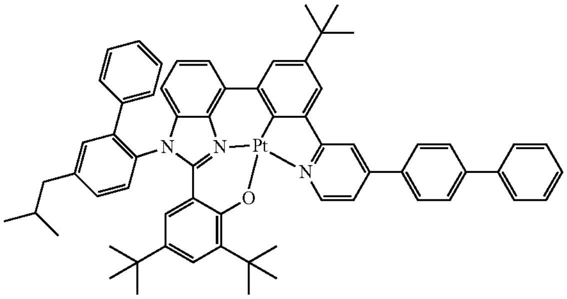
2125
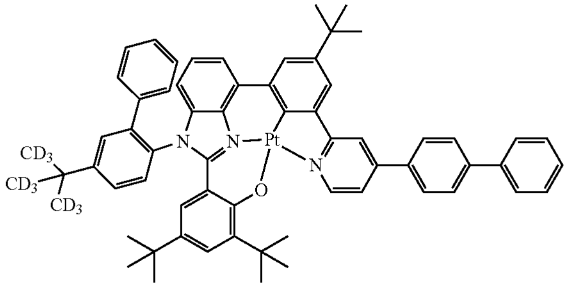
2126
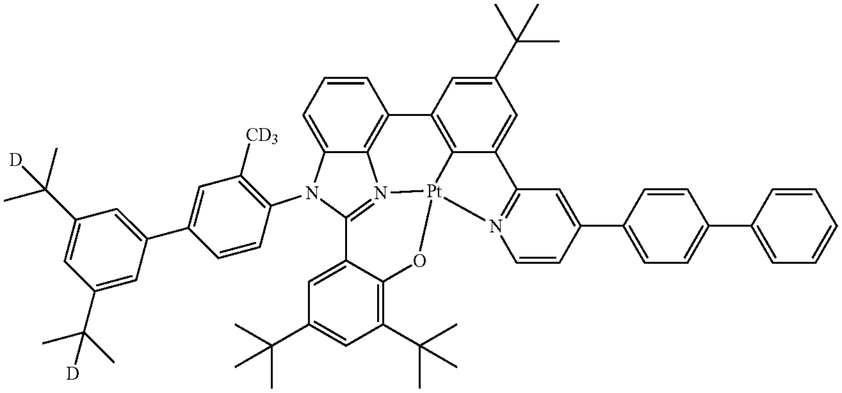
2127
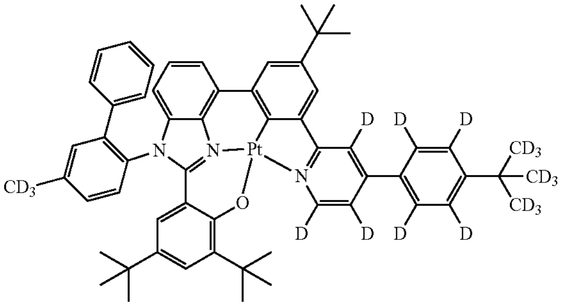
2128
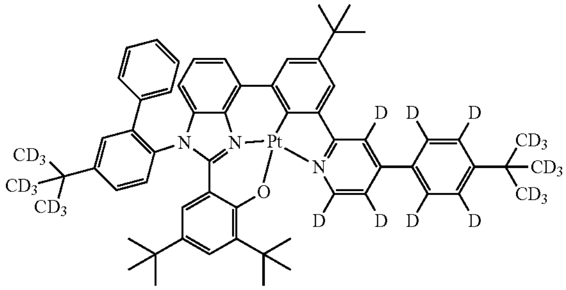
2129
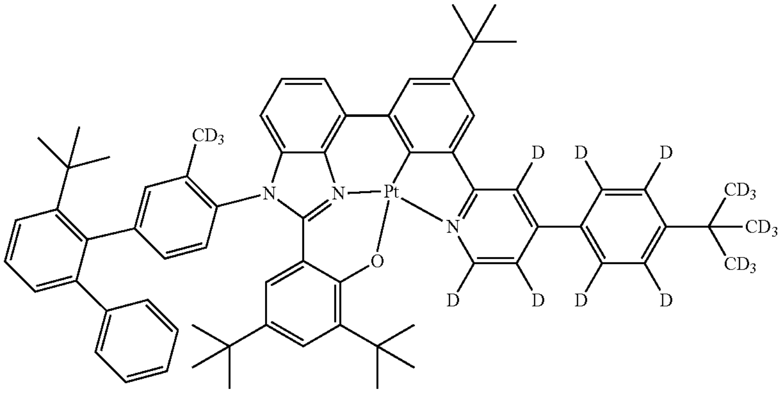

-continued
2130
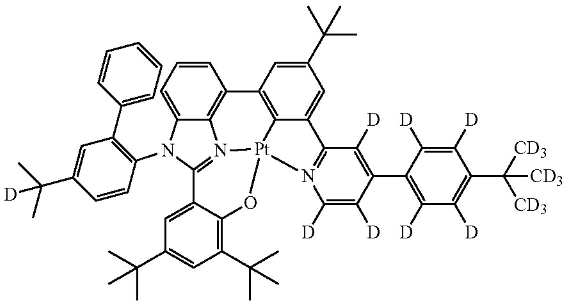
2131
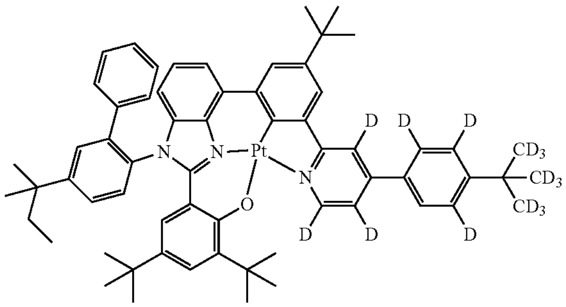
2132
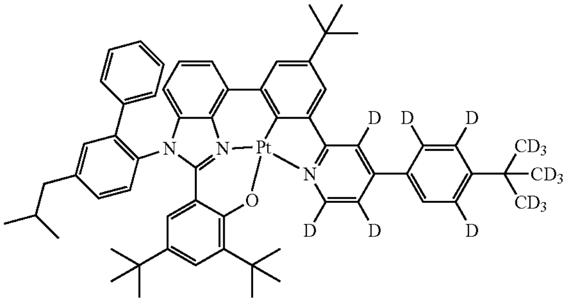
2133
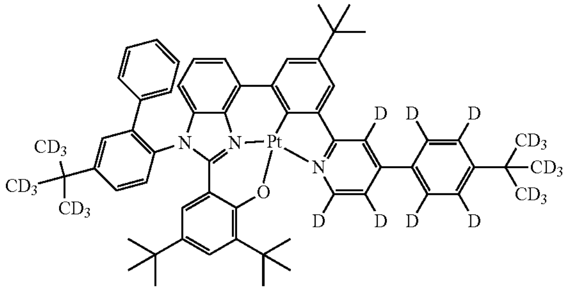
2134
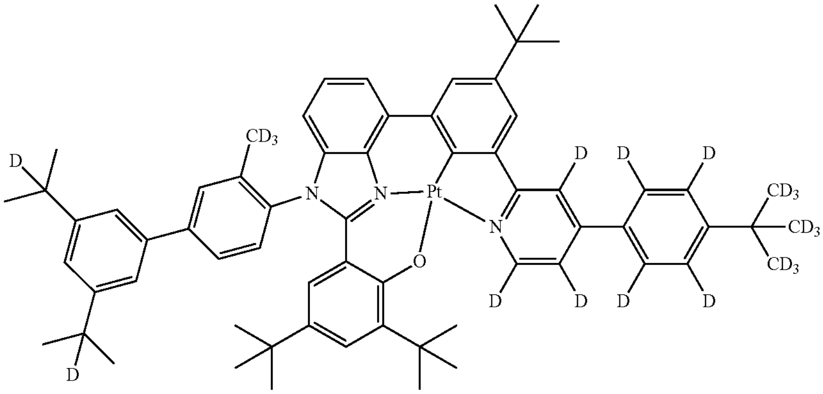
2135
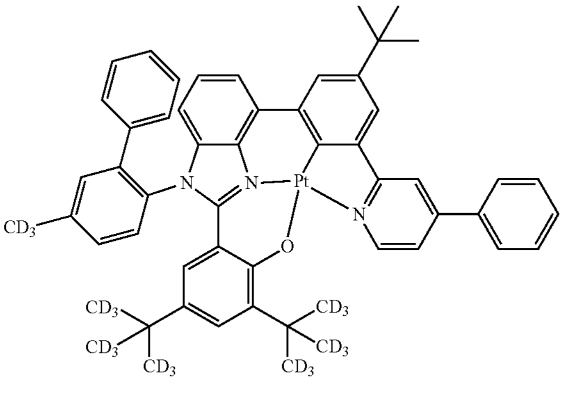
2136
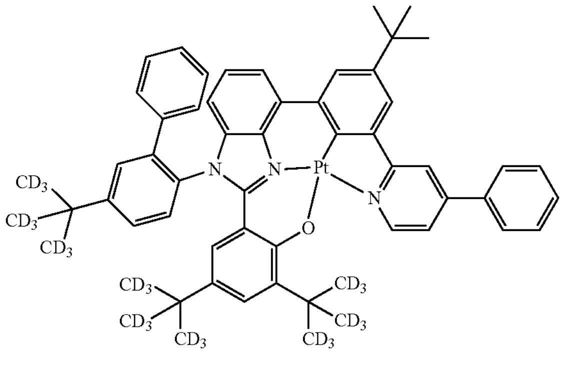

-continued
2137
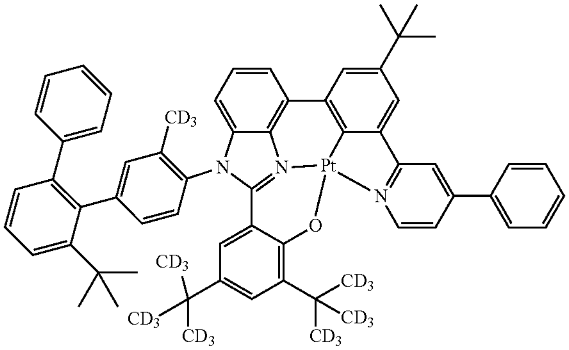
2138
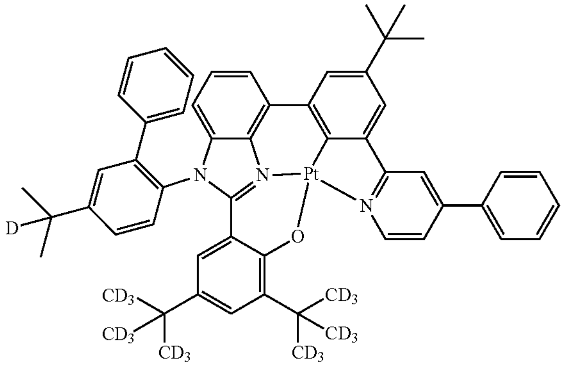
2139
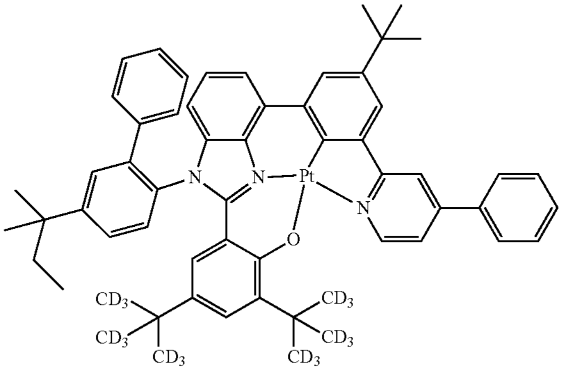
2140
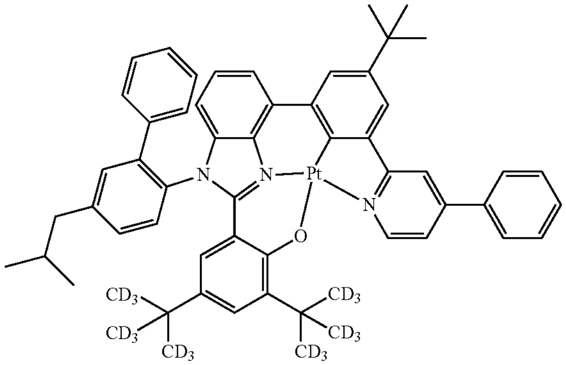
2141
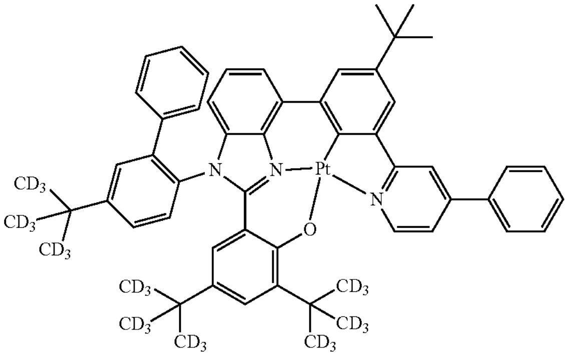
2142
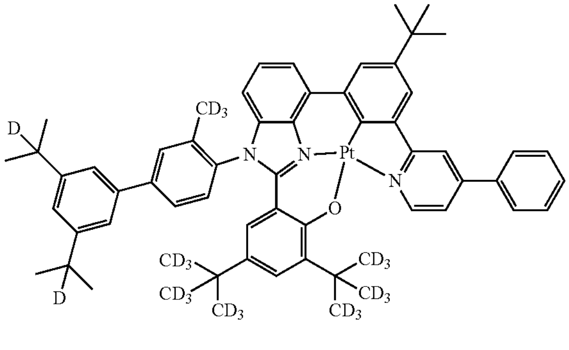
2143
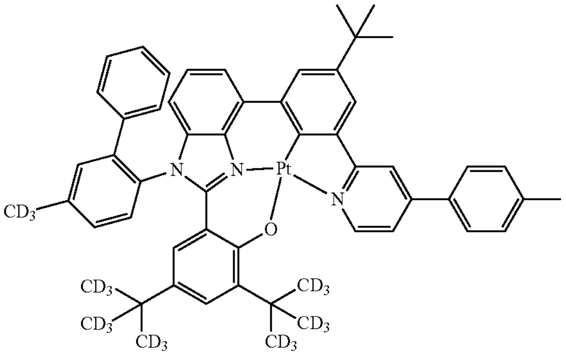
2144
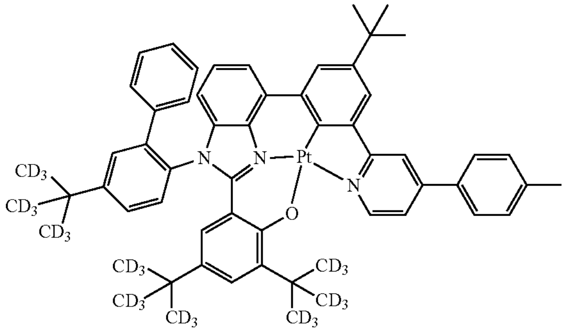

-continued
2145
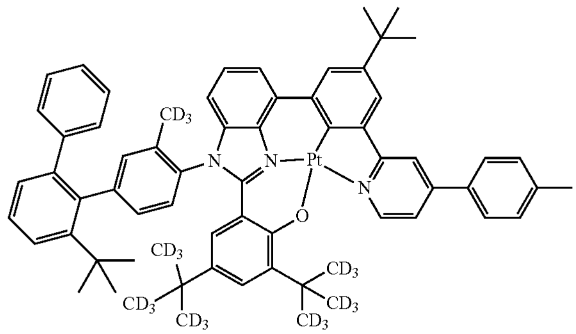
2146
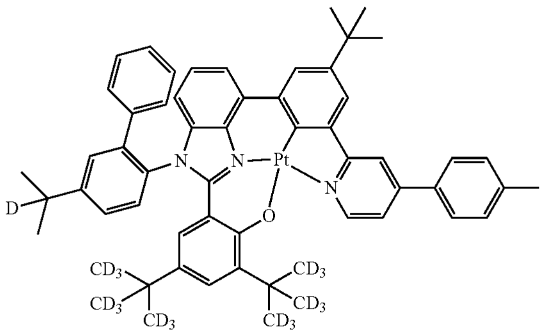
2147
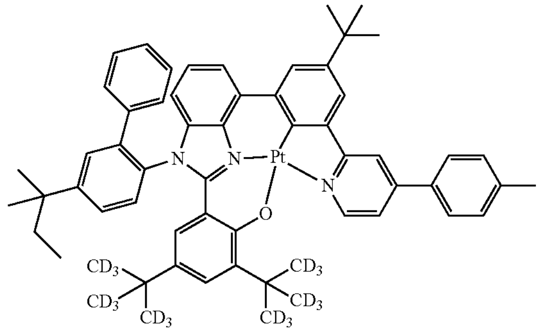
2148
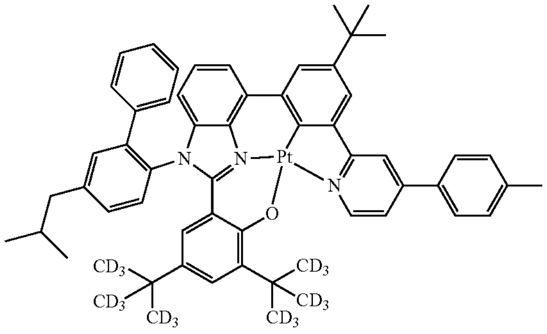
2149
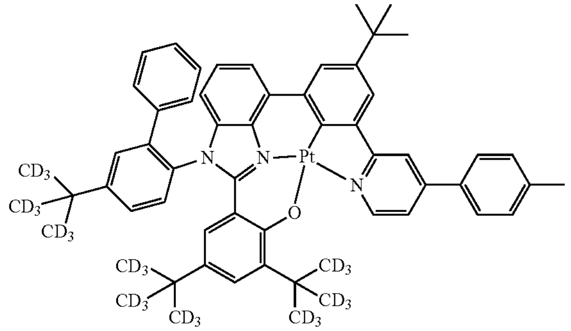
2150
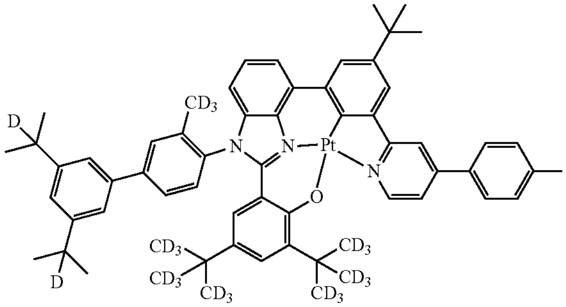
2151
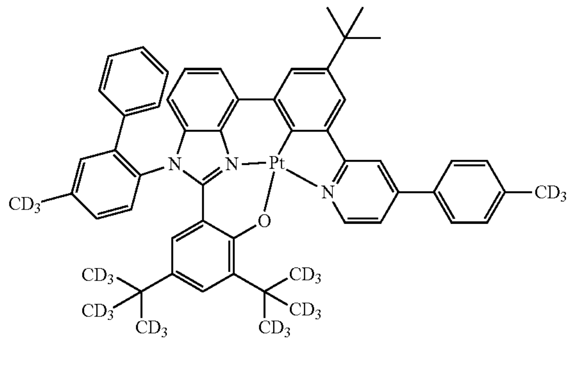
2152
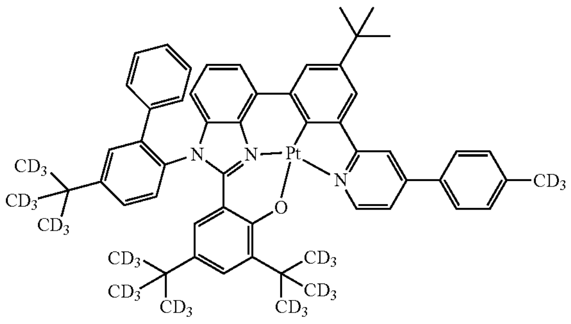

-continued
2153
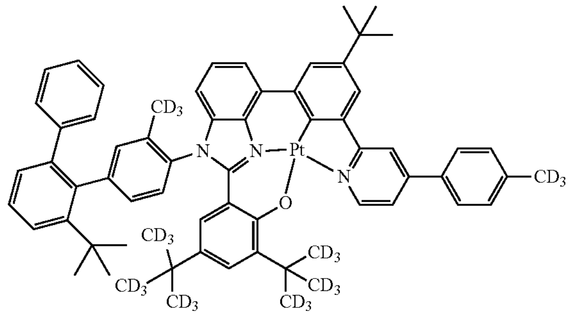
2154
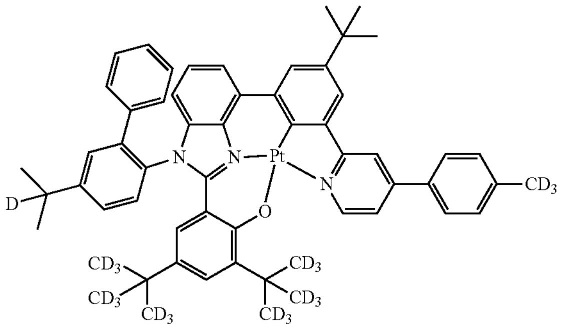
2155
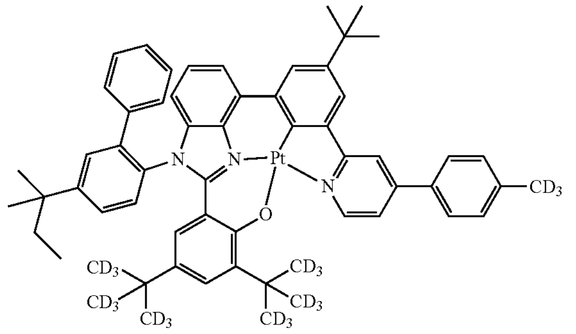
2156
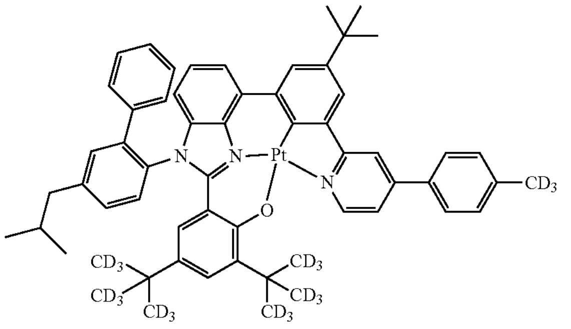
2157
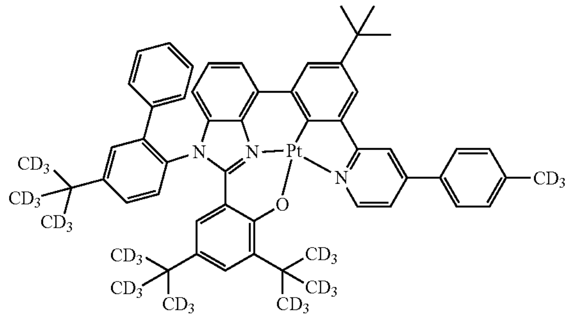
2158
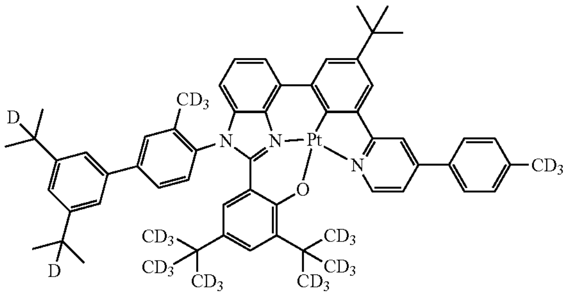
2159
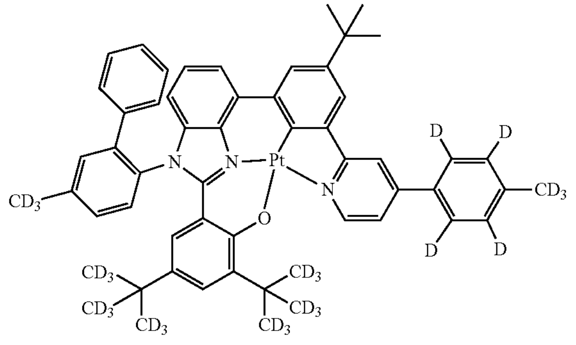
2160
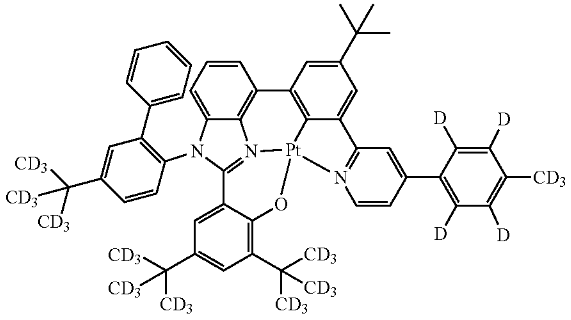

-continued
2161
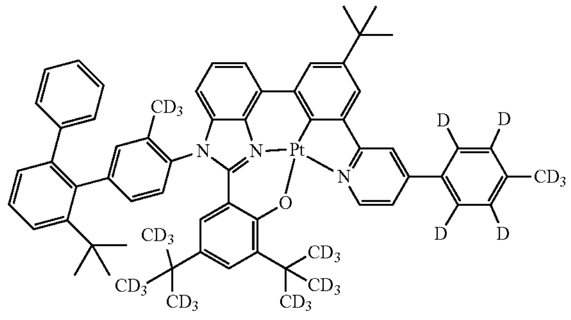
2162
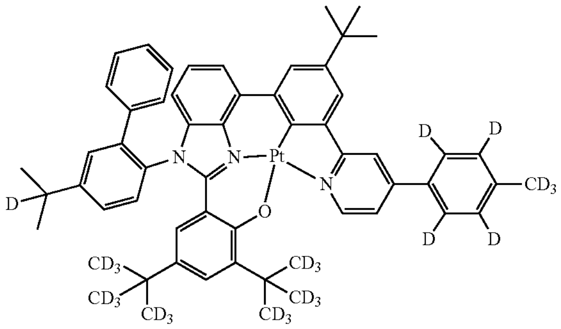
2163
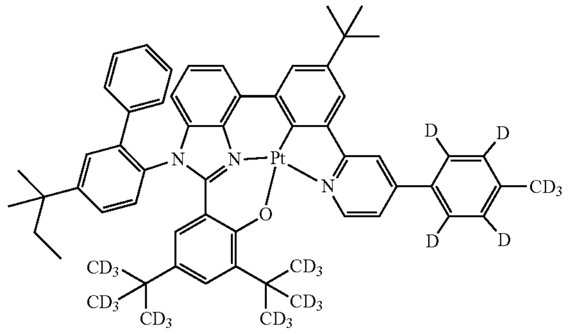
2164
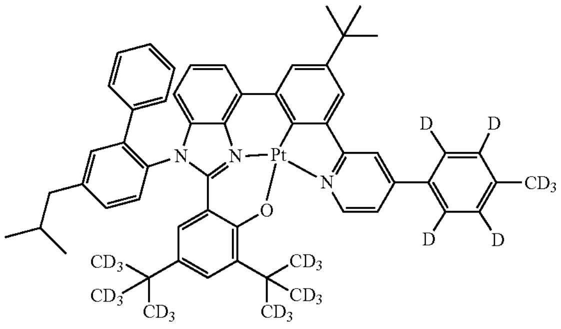
2165
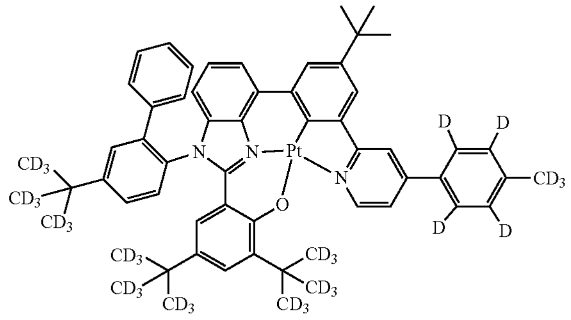
2166
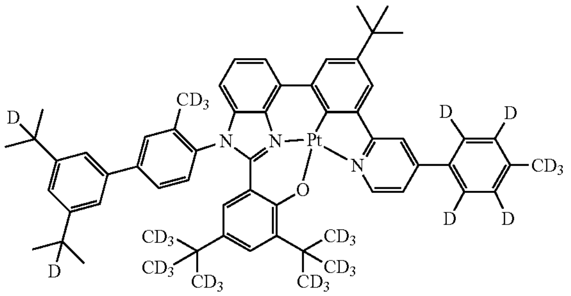
2167
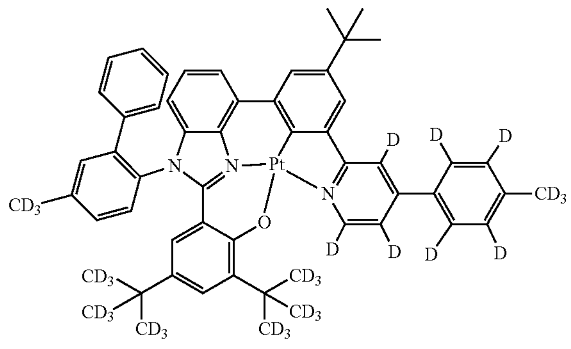
2168
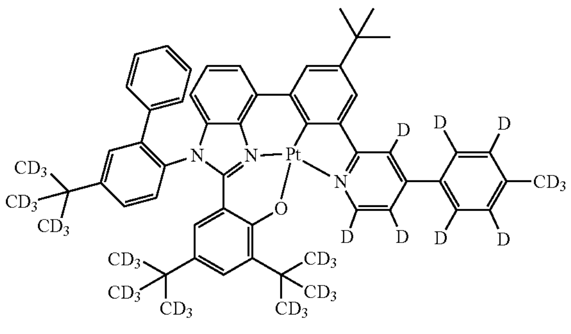

-continued
2169
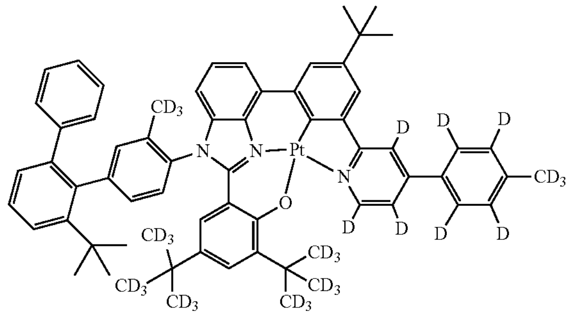
2170
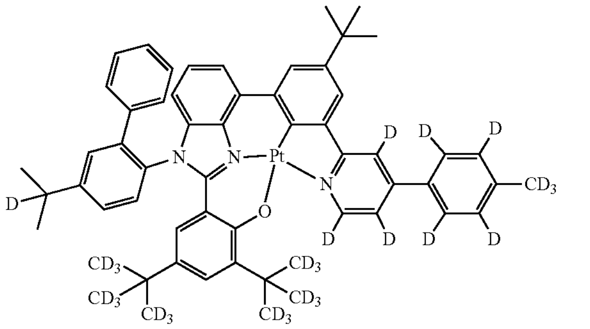
2171
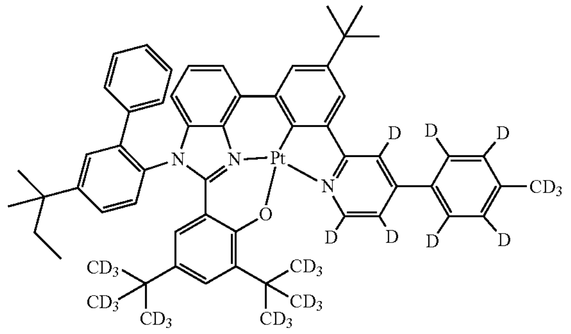
2172
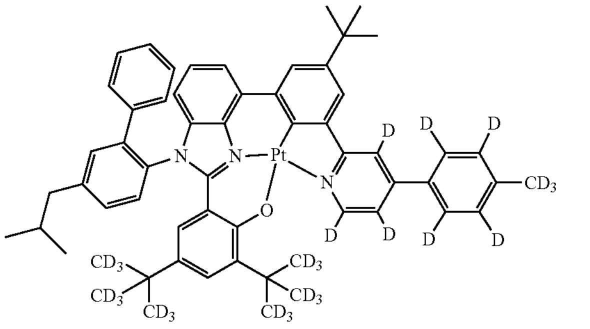
2173
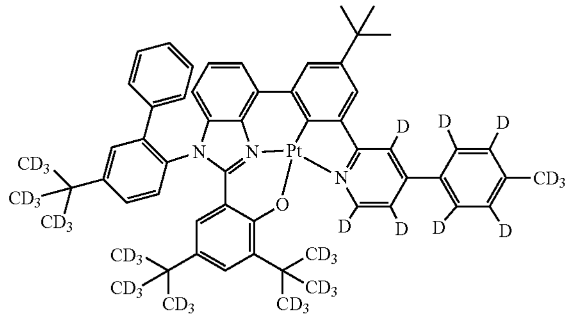
2174
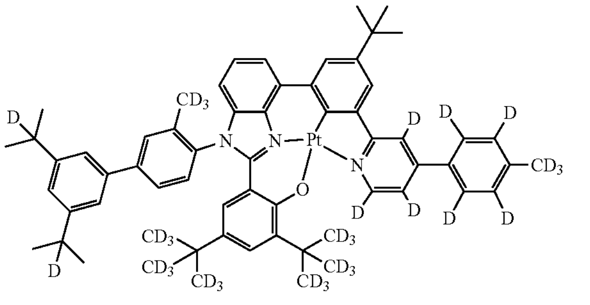
2175
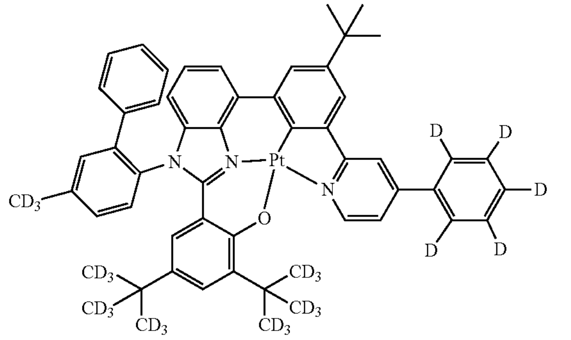
2176
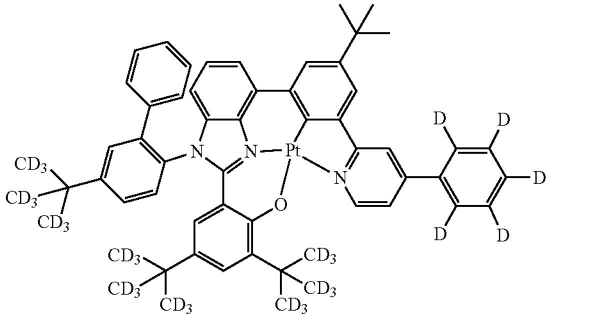

-continued
2177
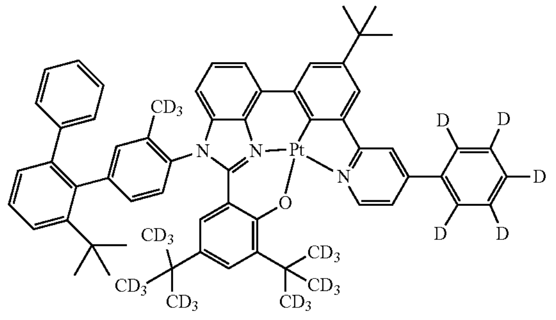
2178
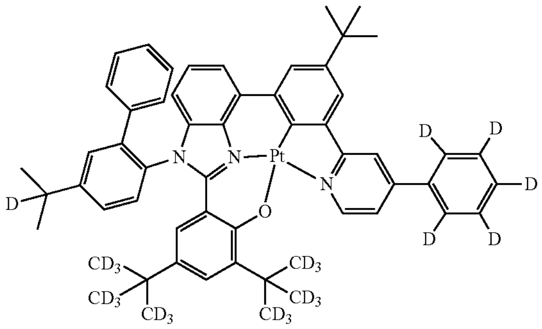
2179
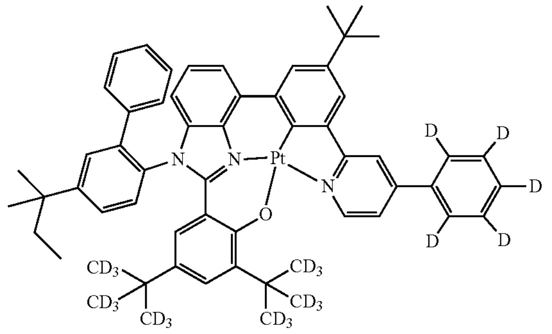
2180
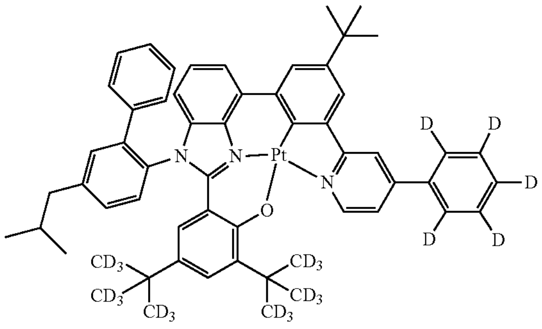
2181
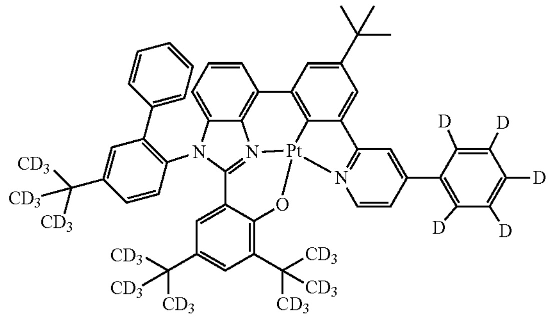
2182
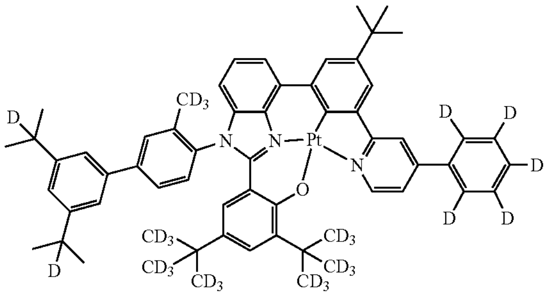
2183
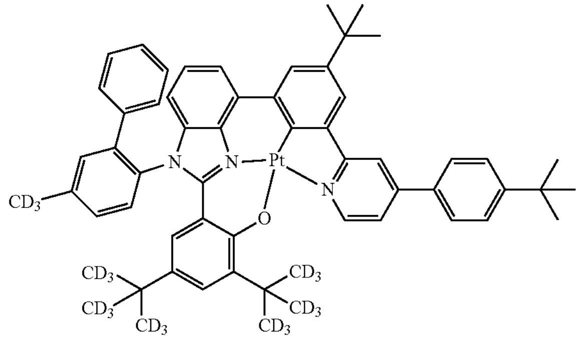
2184
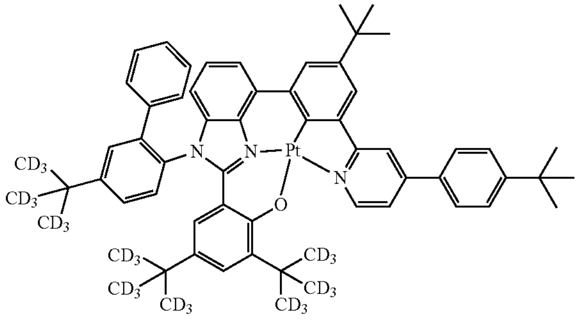

-continued
2185
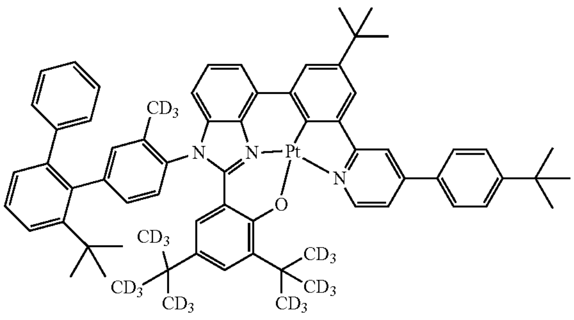
2186
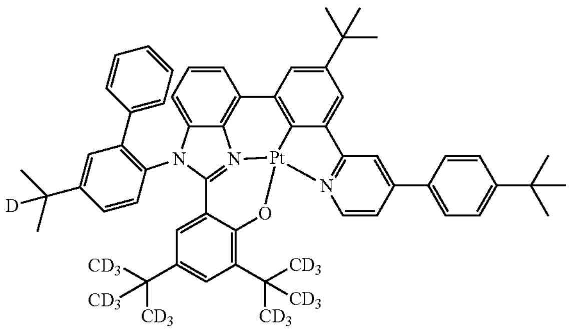
2187
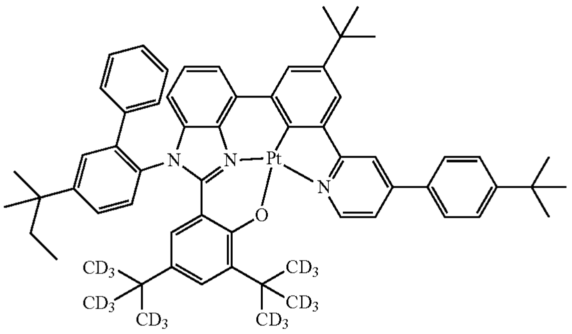
2188
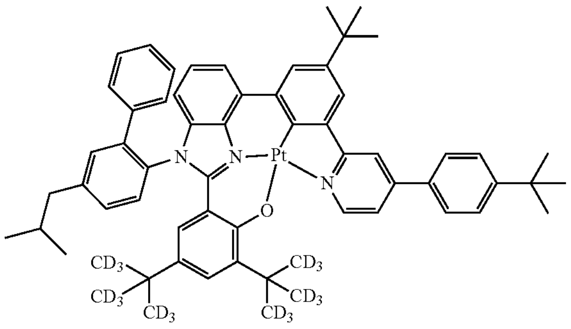
2189
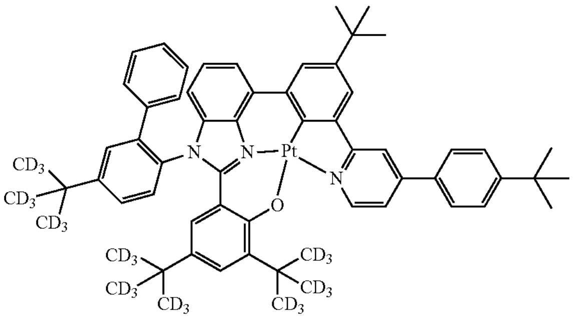
2190
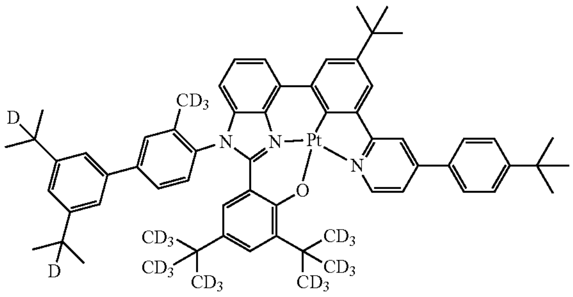
2191
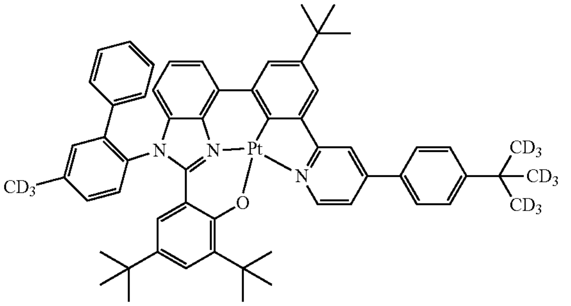
2192
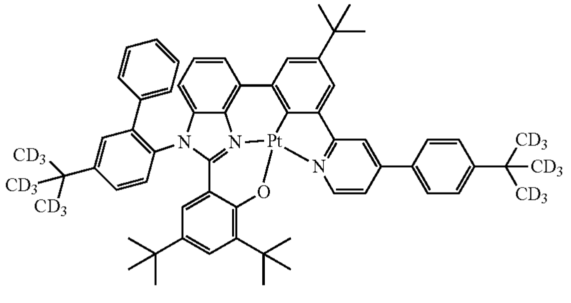

-continued
2193
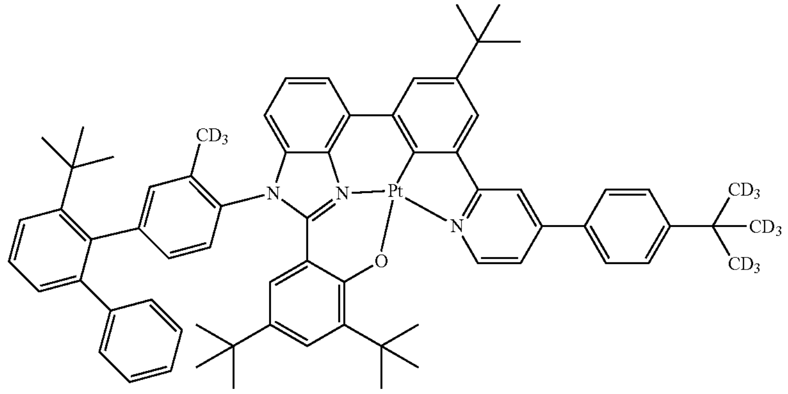
2194
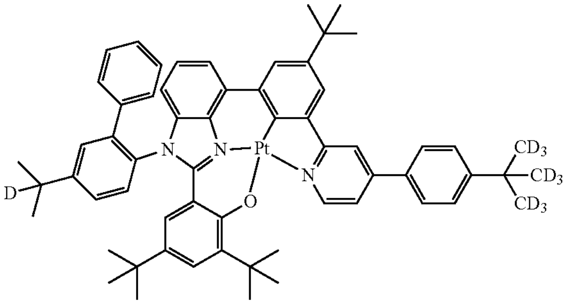
2195
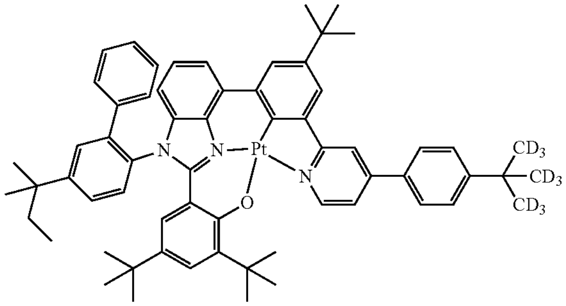
2196
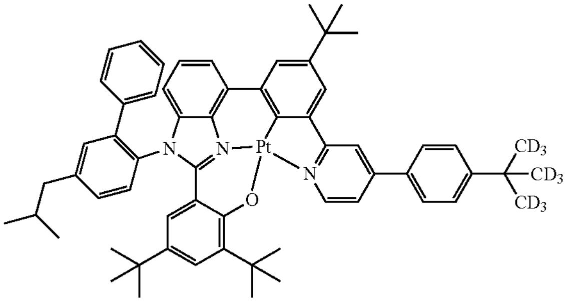
2197
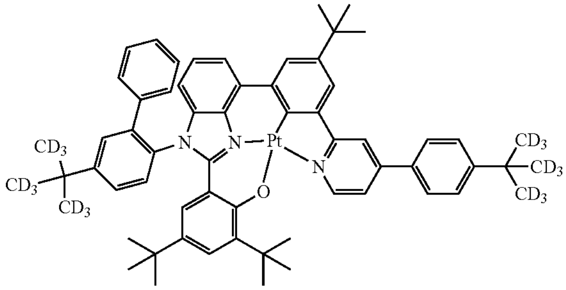
2198
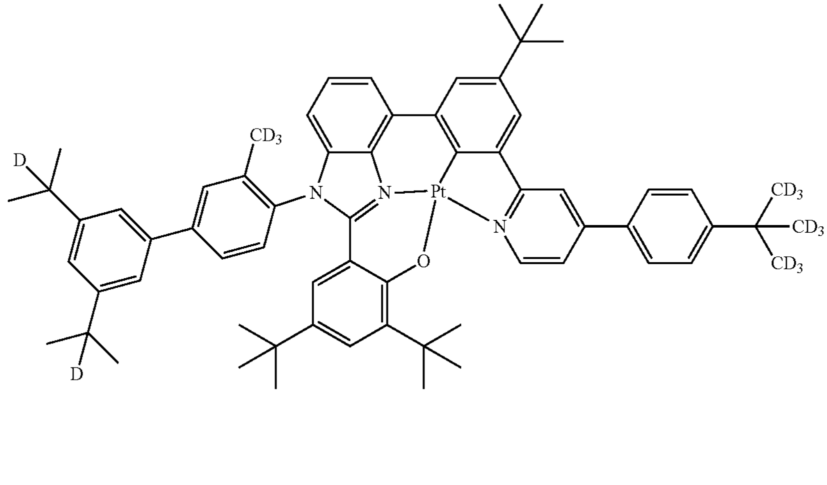

-continued
2199
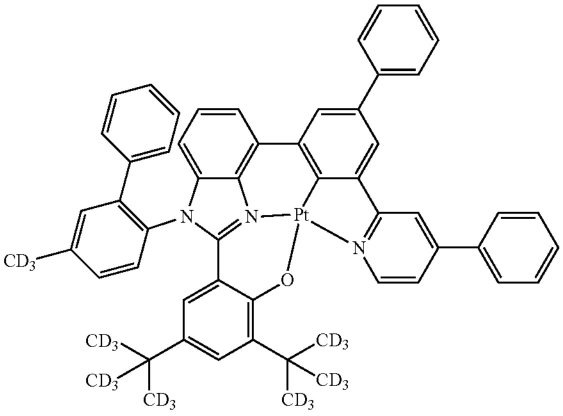
2200
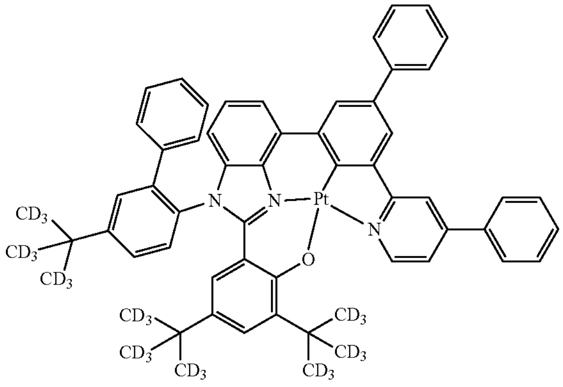
2201
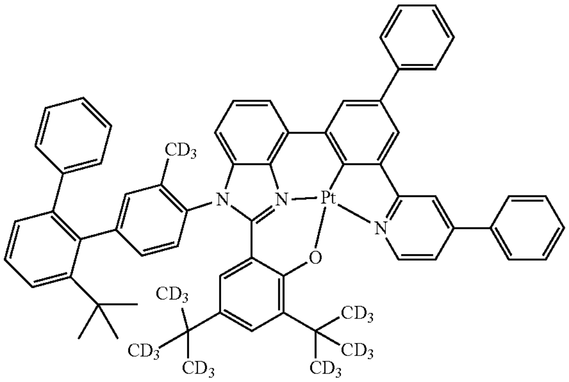
2202
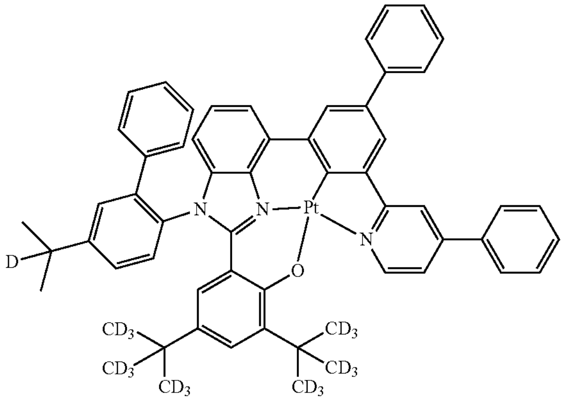
2203
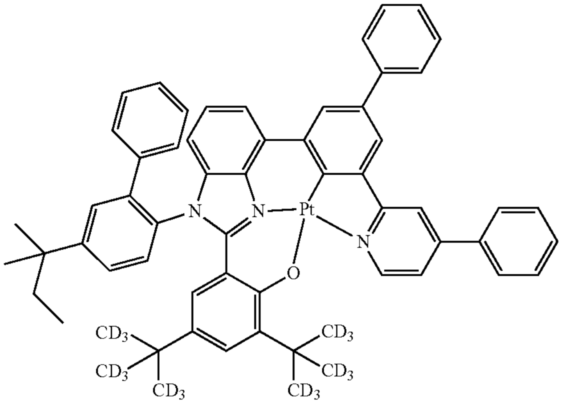
2204
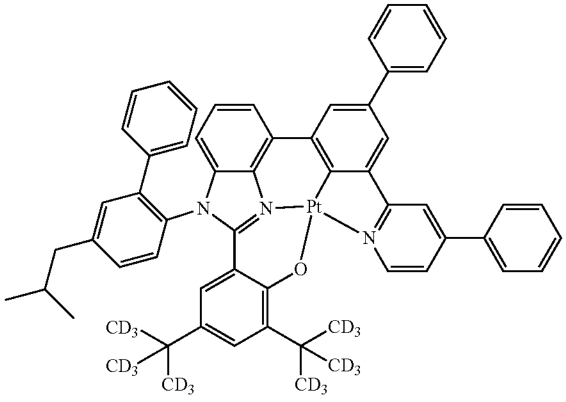

-continued
2205
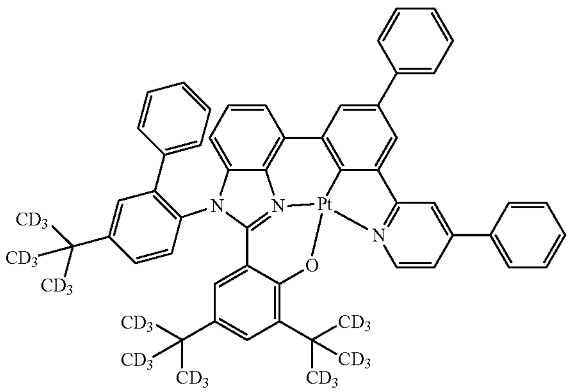
2206
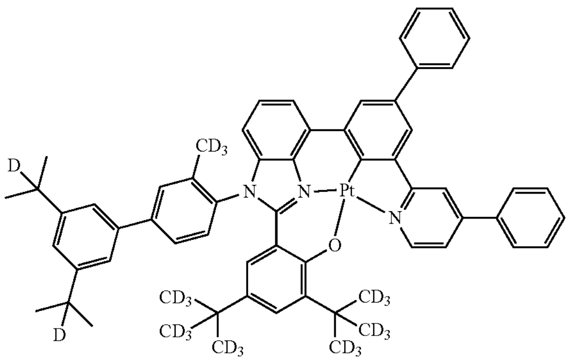
2207
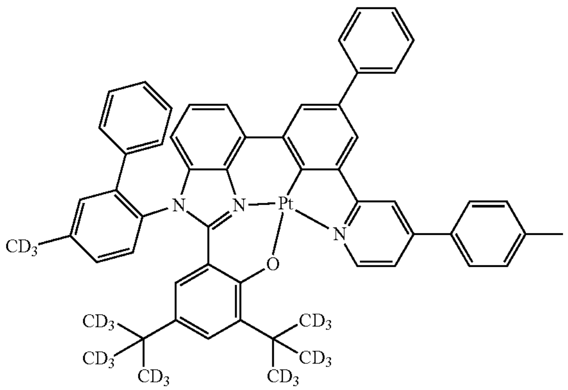
2208
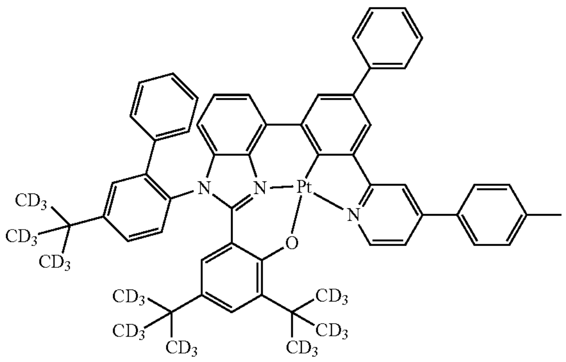
2209
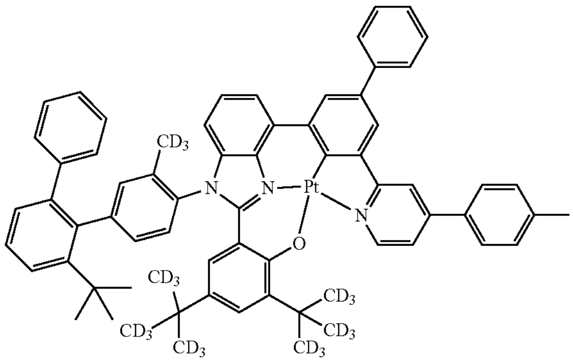
2210
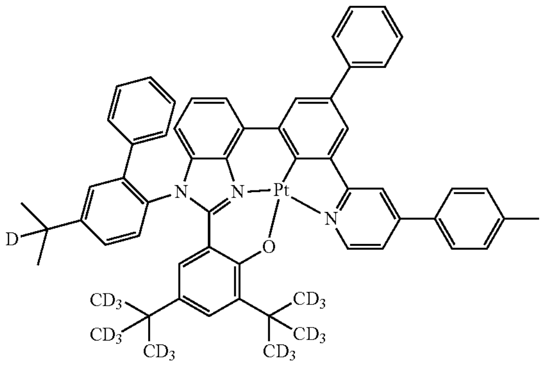
2211
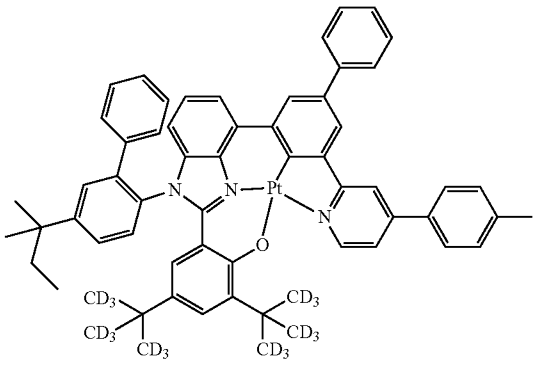
2212
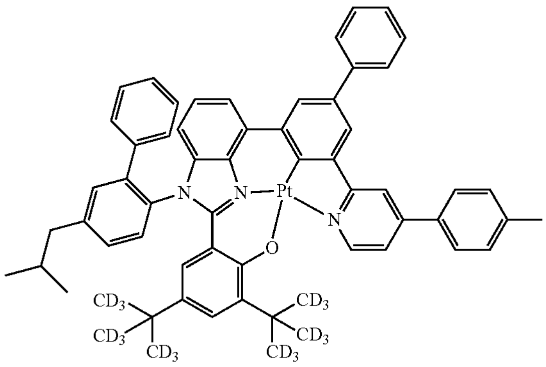

-continued
2213
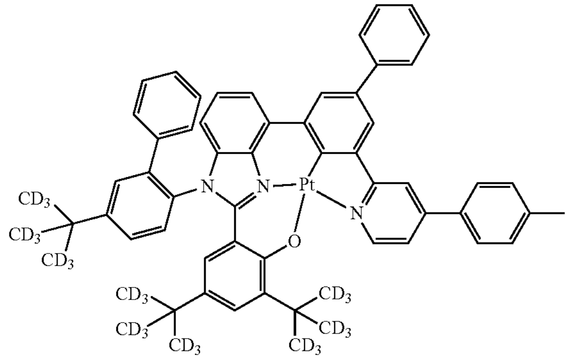
2214
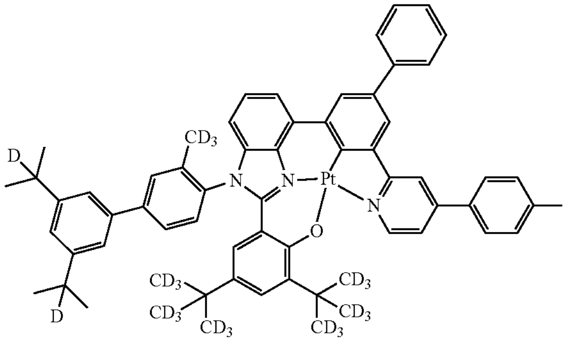
2215
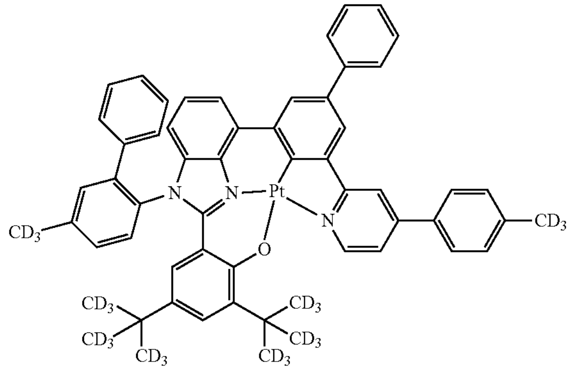
2216
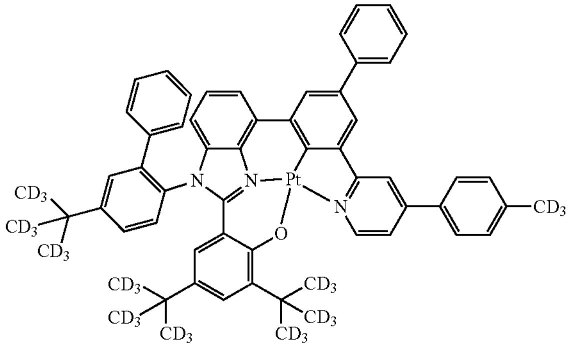
2217
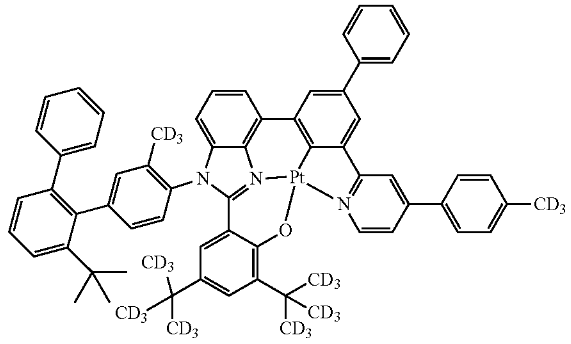
2218
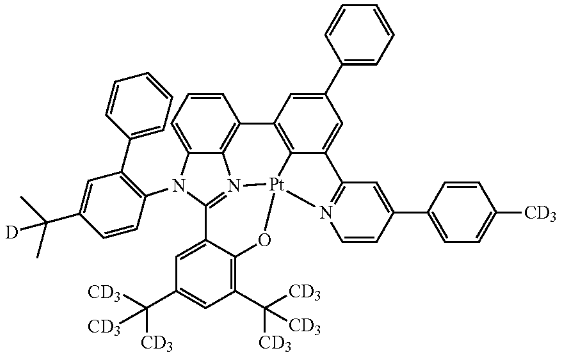
2219
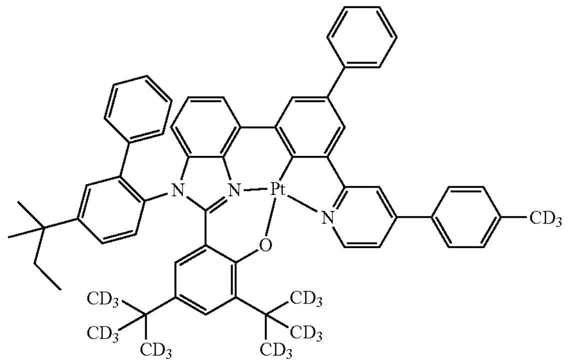
2220
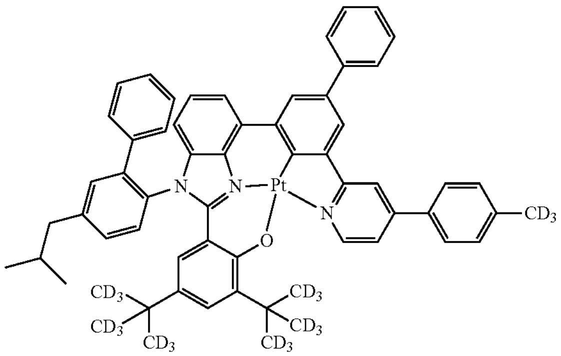

-continued
2221
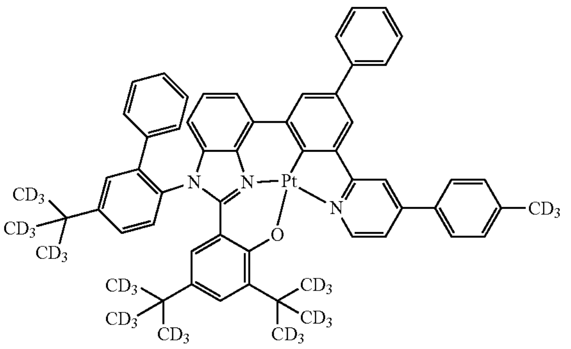
2222
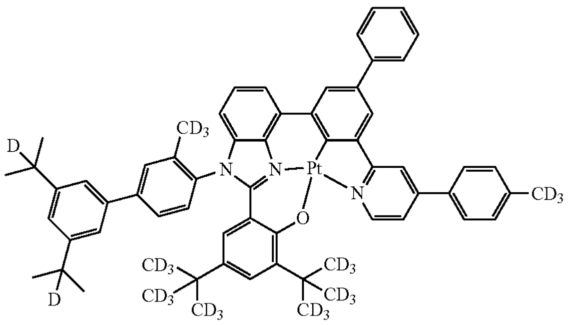
2223
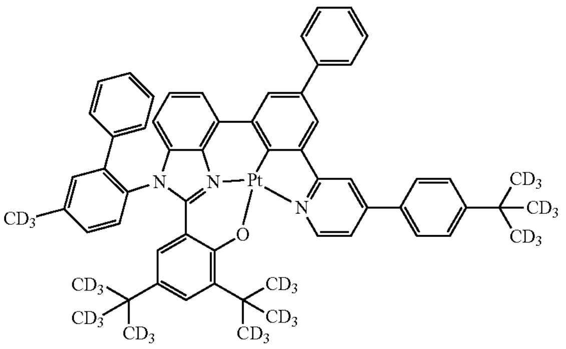
2224
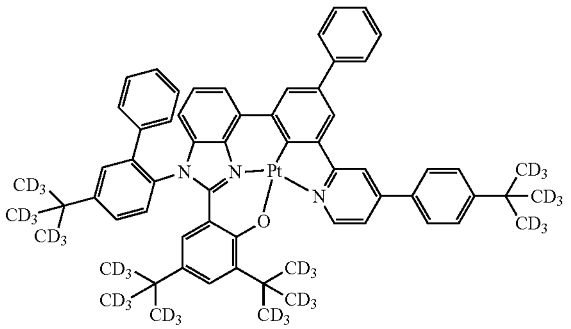
2225
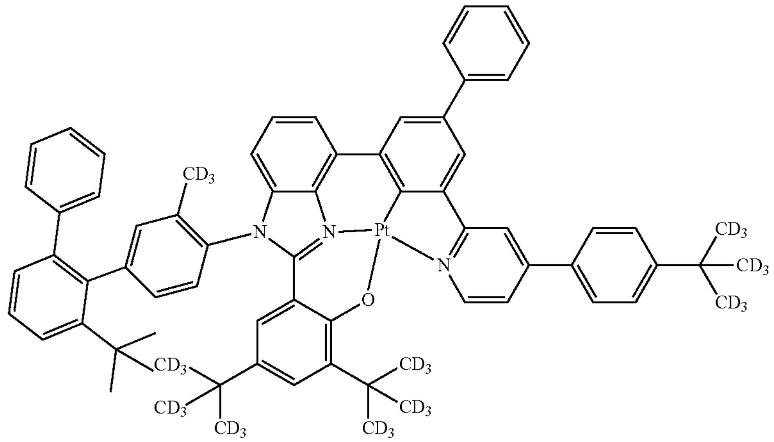
2226
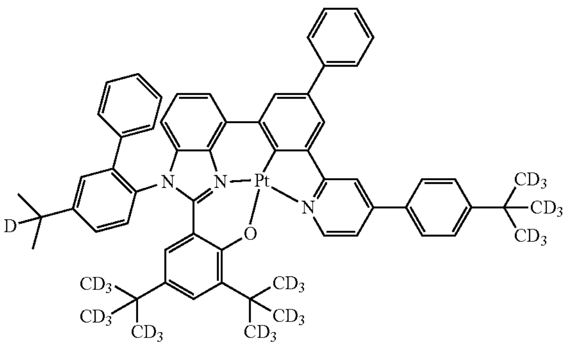
2227
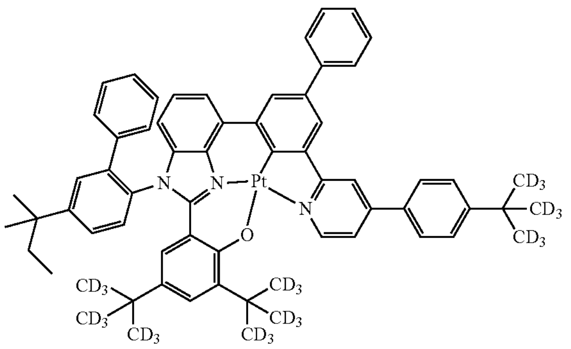

-continued
2228
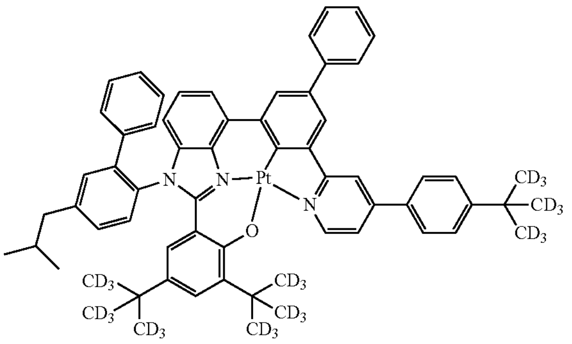
2229
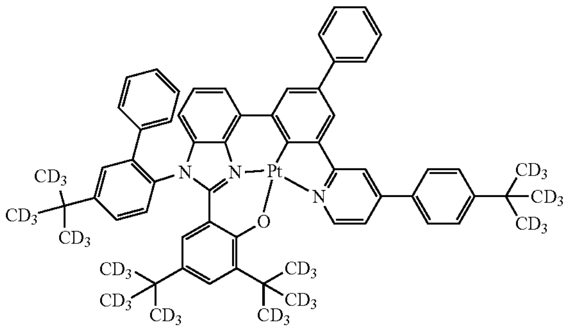
2230
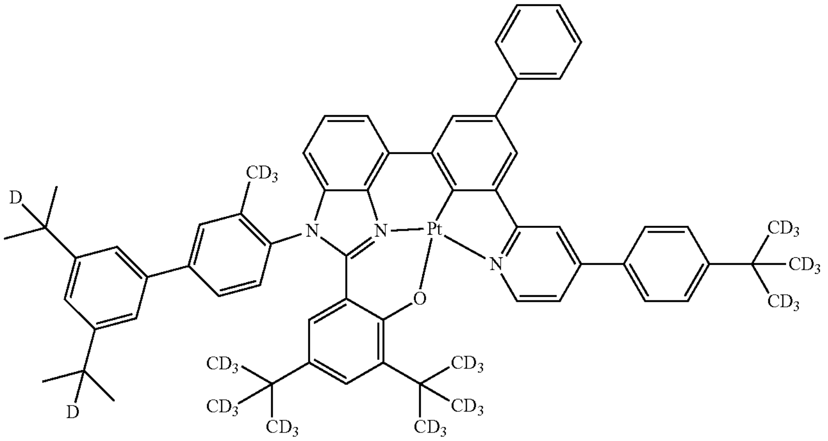
2231
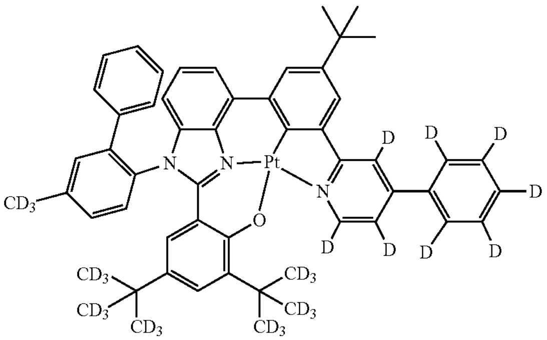
2232
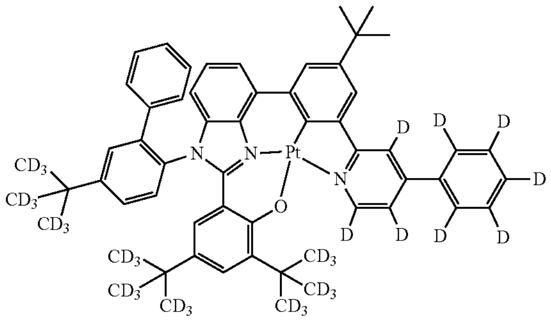
2233
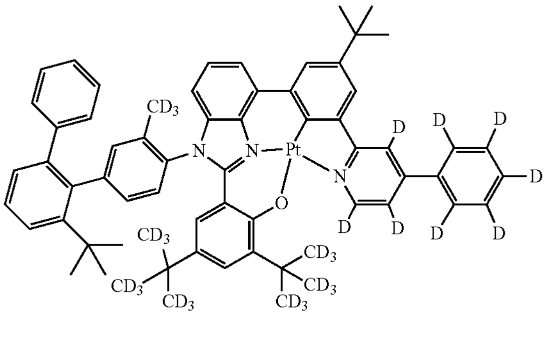
2234
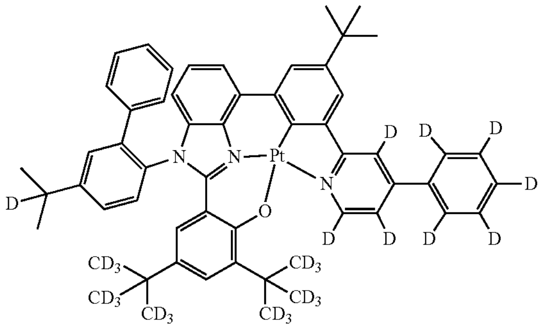

-continued
2235
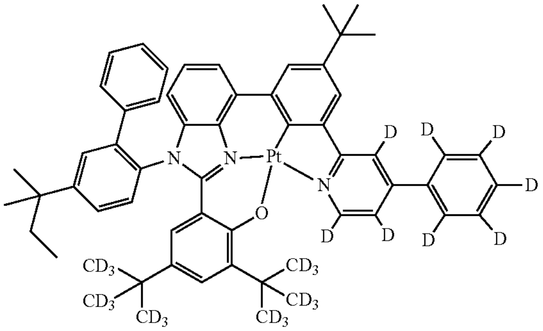
2236
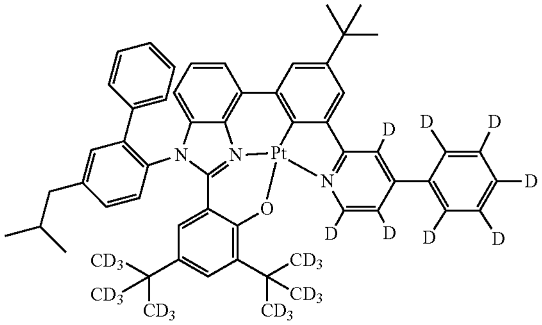
2237
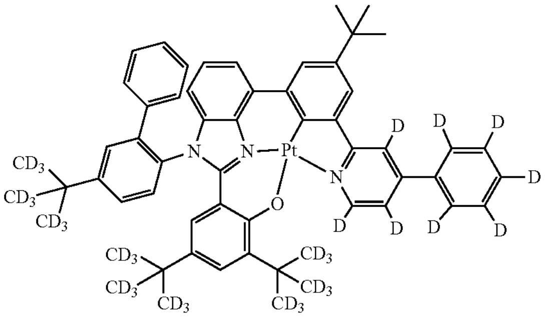
2238
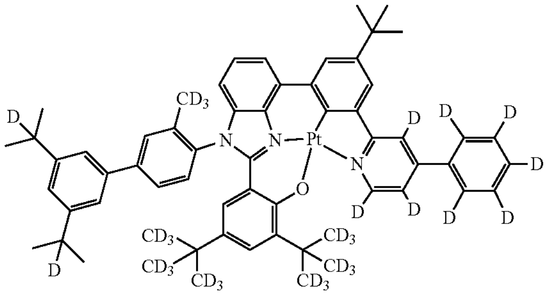
2239
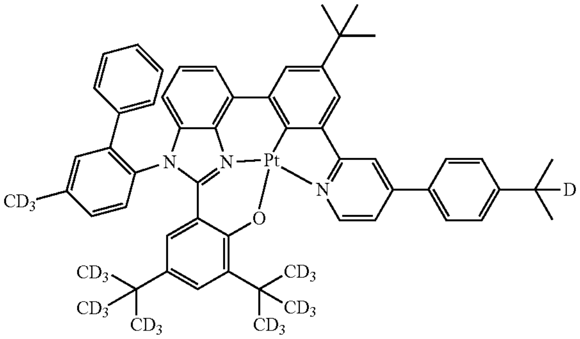
2240
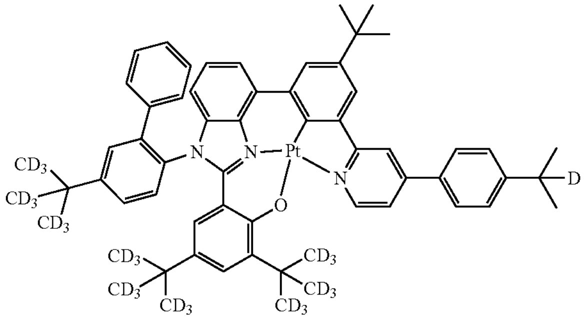
2241
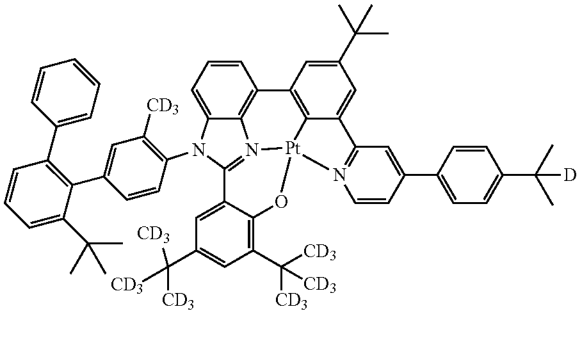
2242
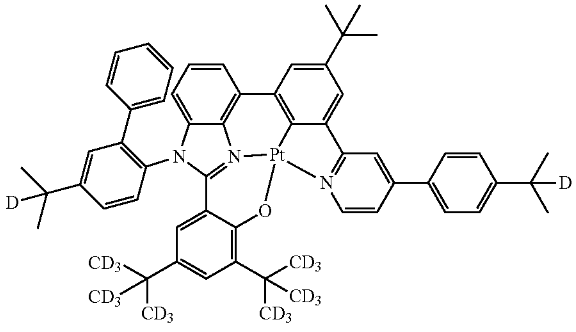

-continued
2243
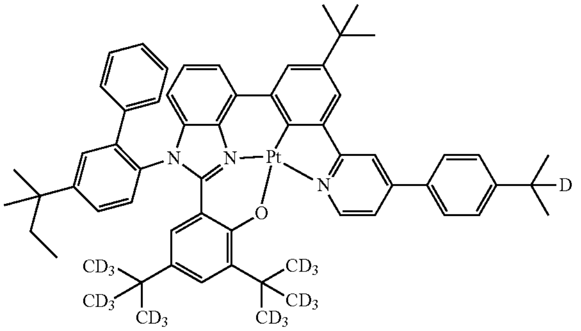
2244
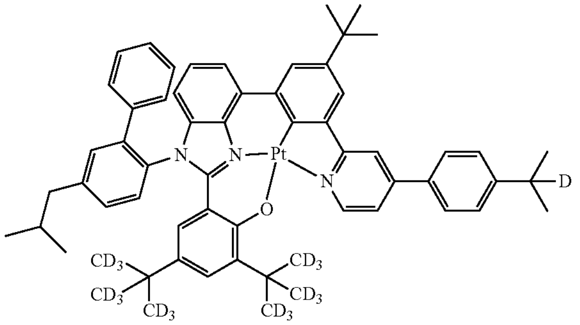
2245
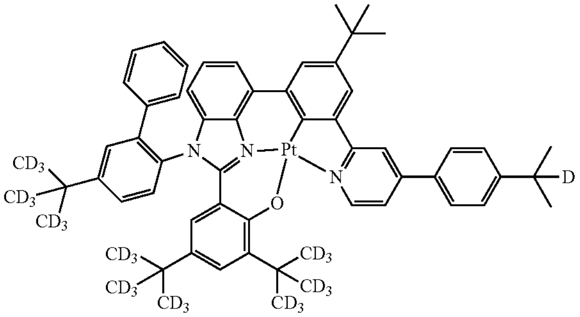
2246
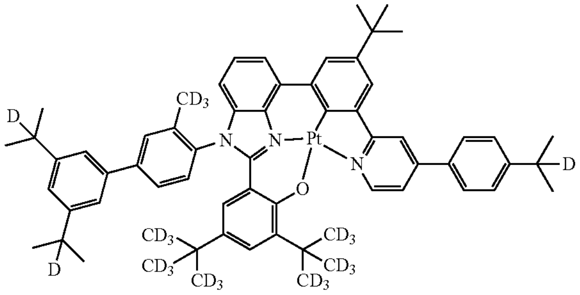
2247
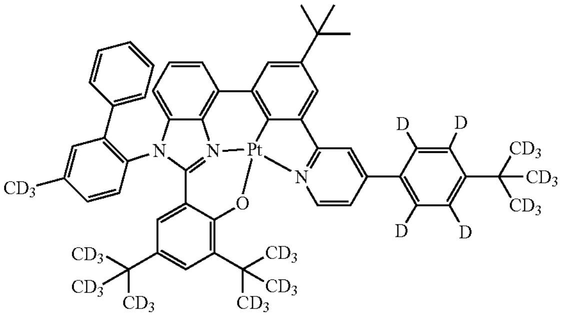
2248
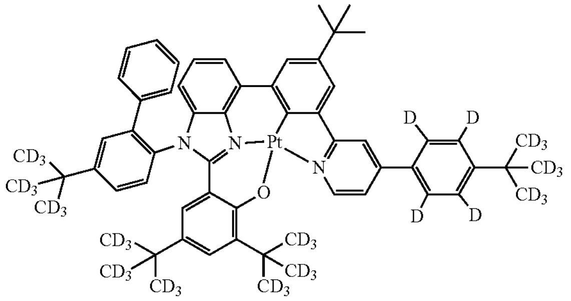
2249
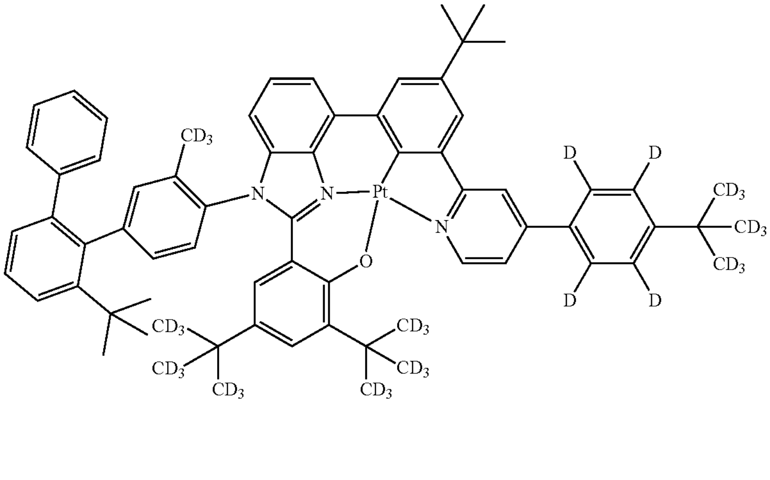

-continued
2250
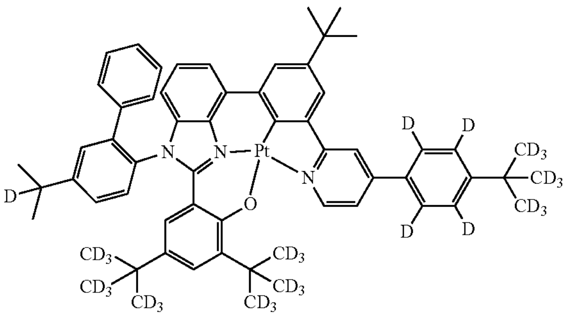
2251
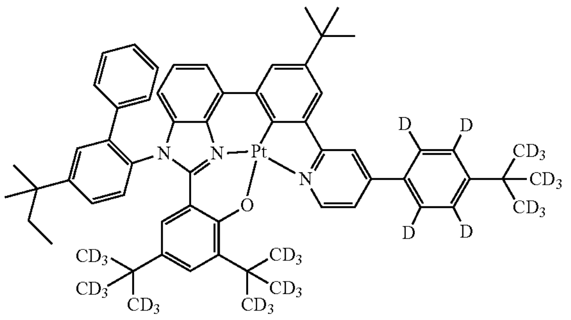
2252
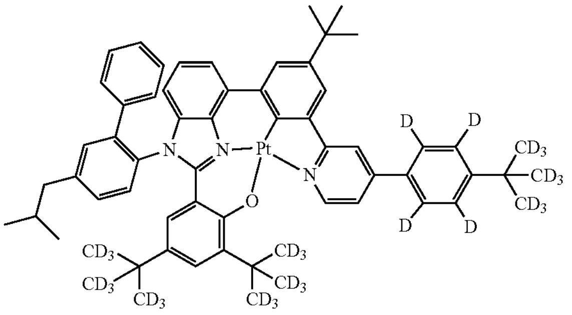
2253
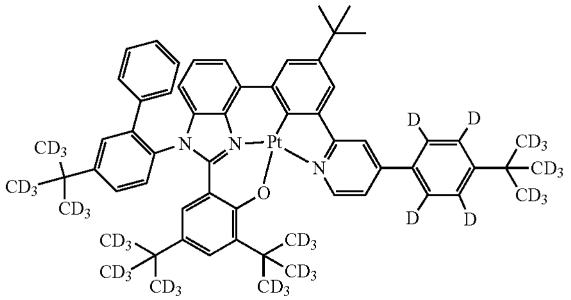
2254
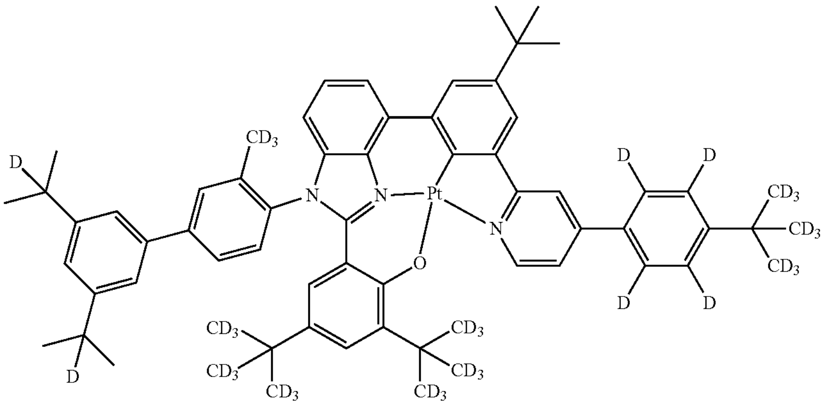
2255
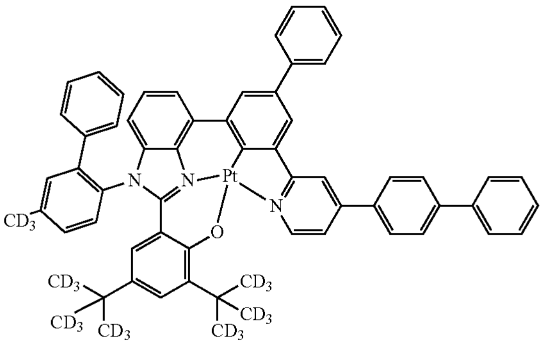
2256
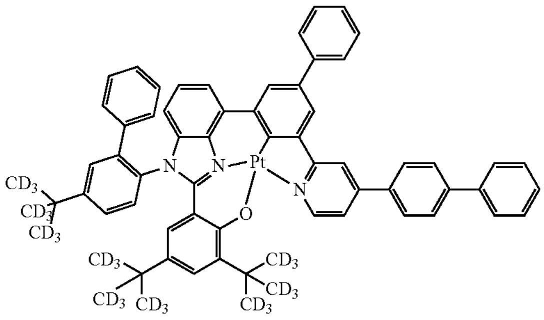

-continued
2257
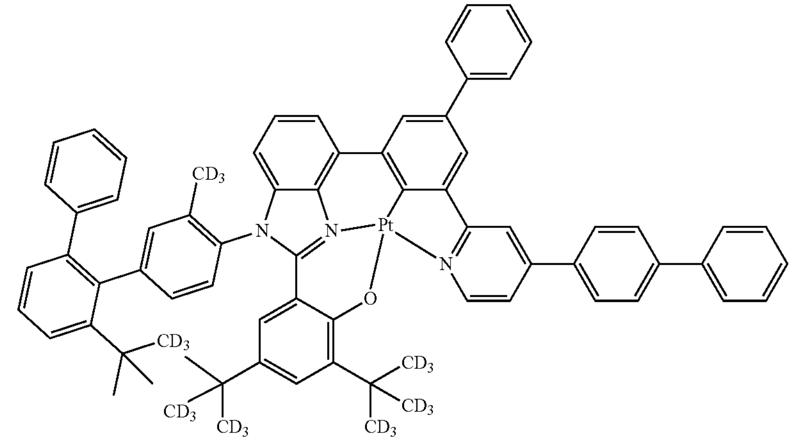
2258
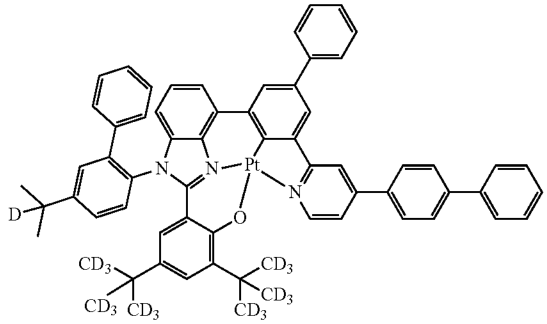
2259
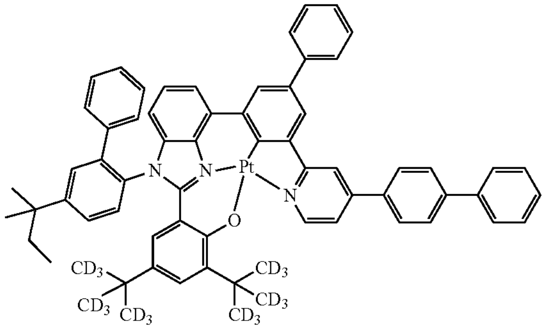
2260
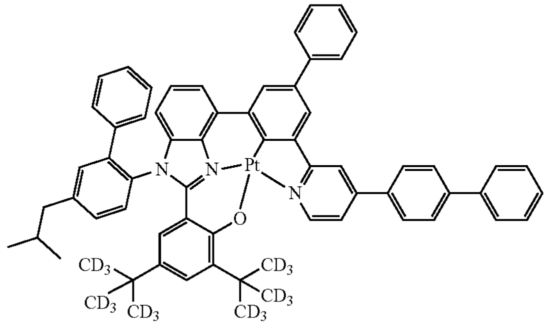
2261
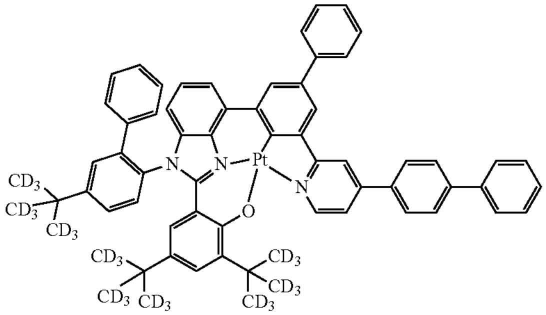
2262
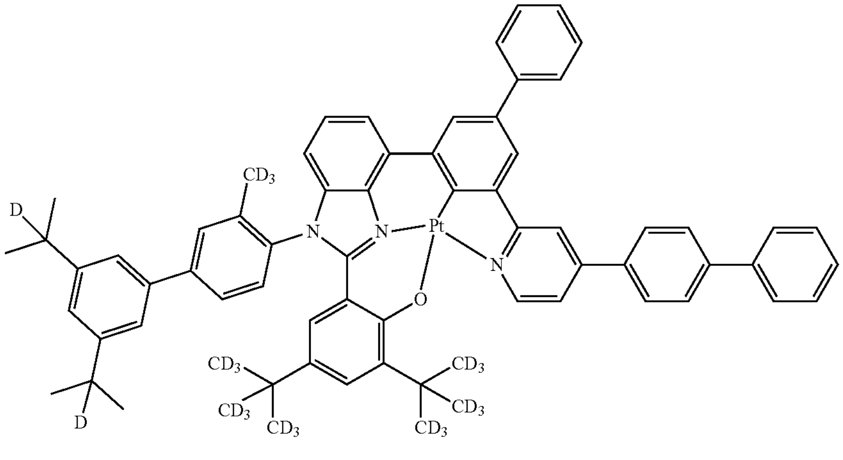

-continued
2263
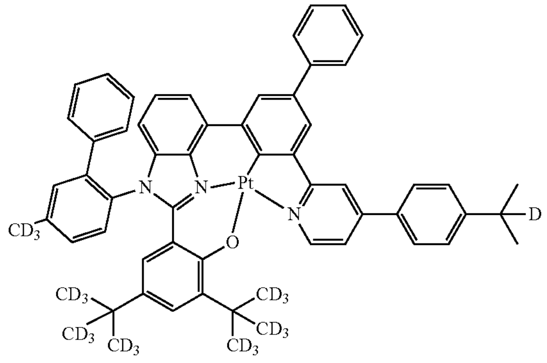
2264
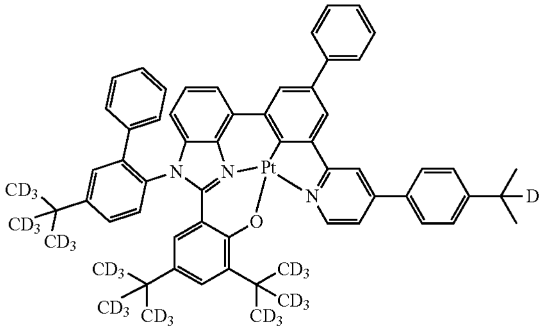
2265
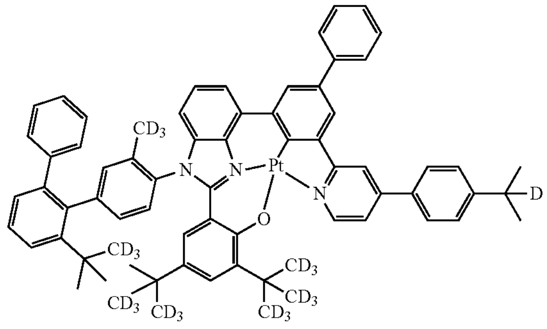
2266
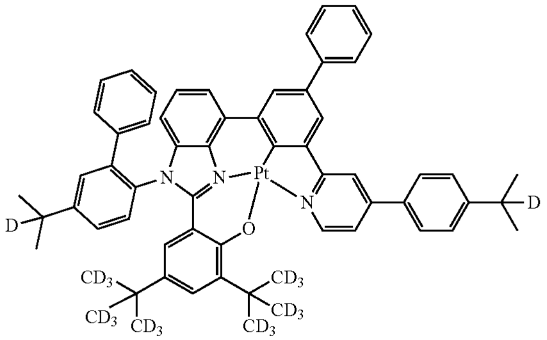
2267
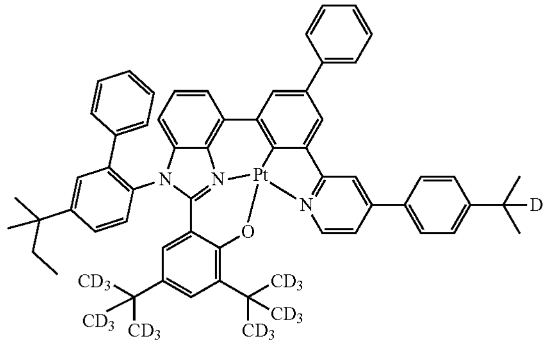
2268
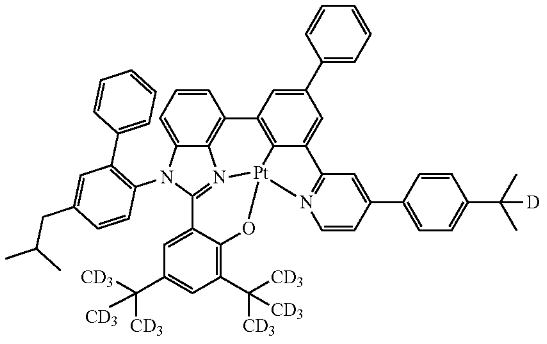
2269
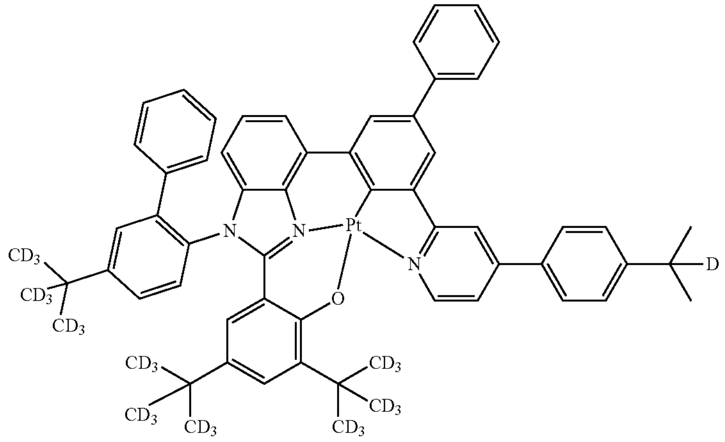

-continued
2270
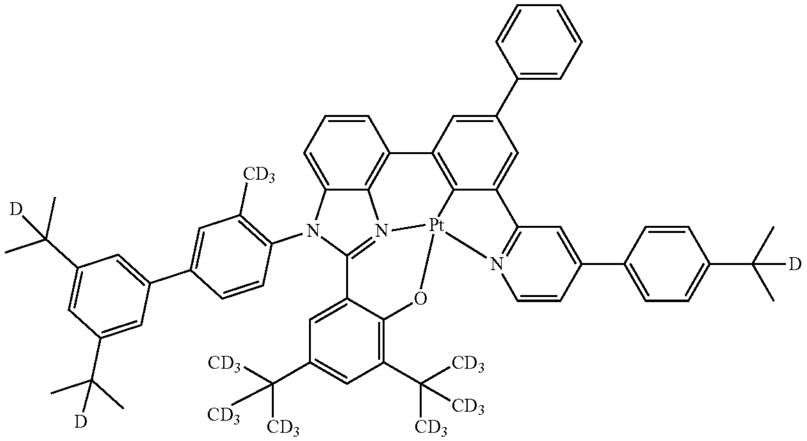
2271
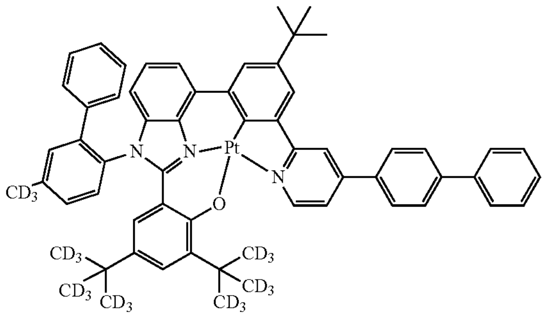
2272
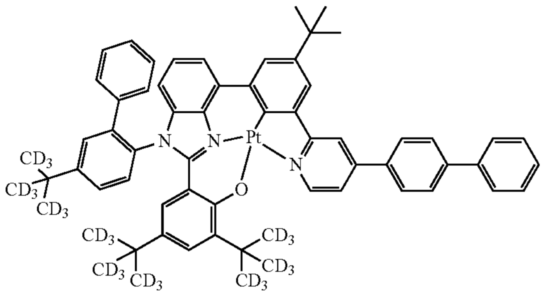
2273
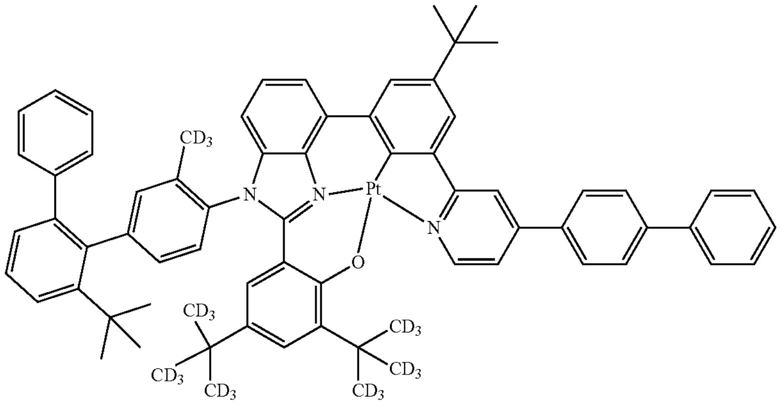
2274
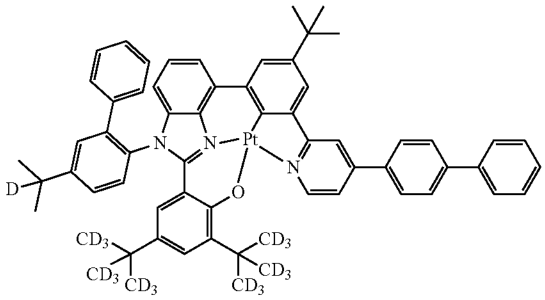
2275
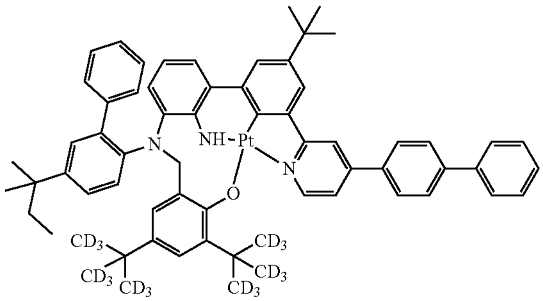

-continued
2276
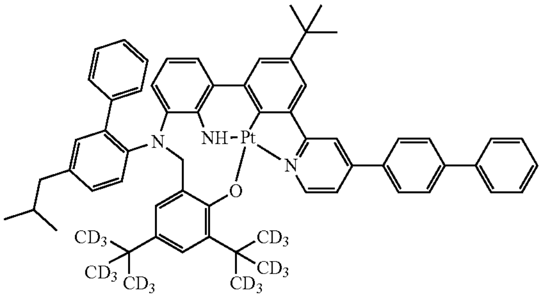
2277
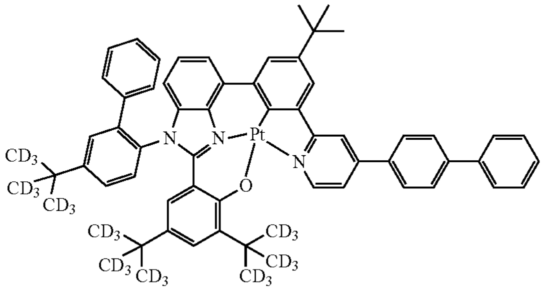
2278
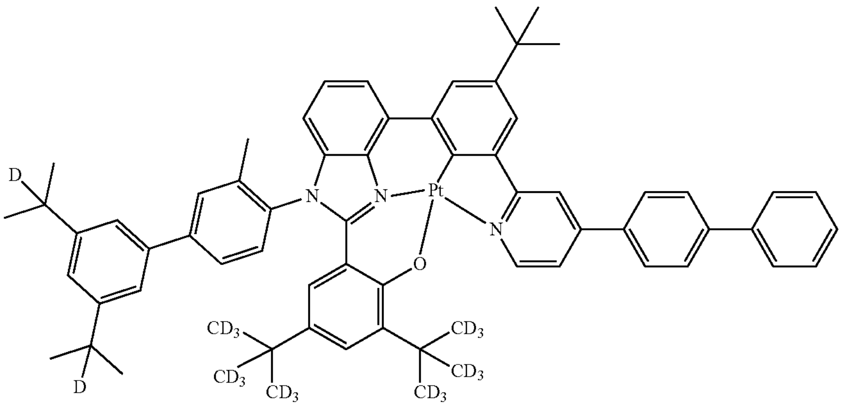
2279
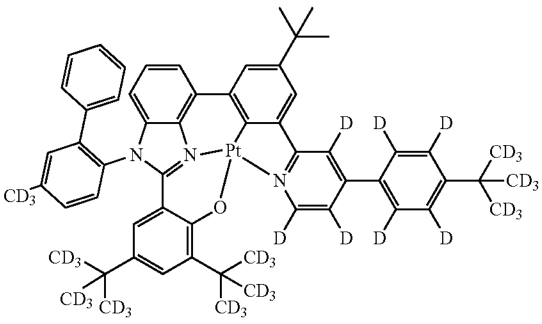
2280
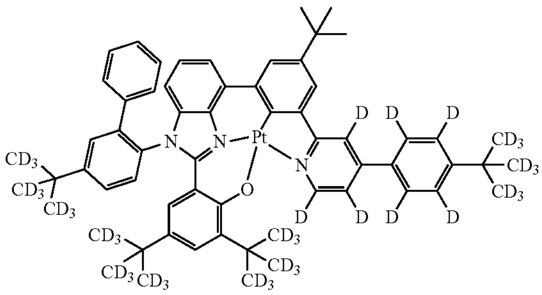
2281
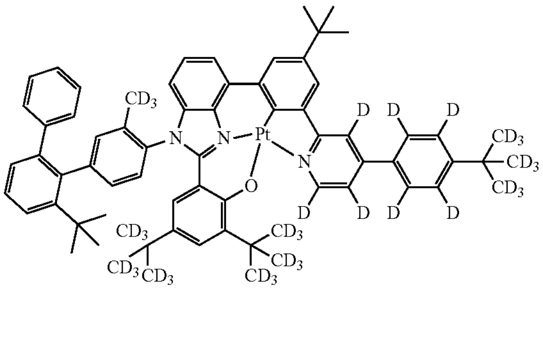
2282
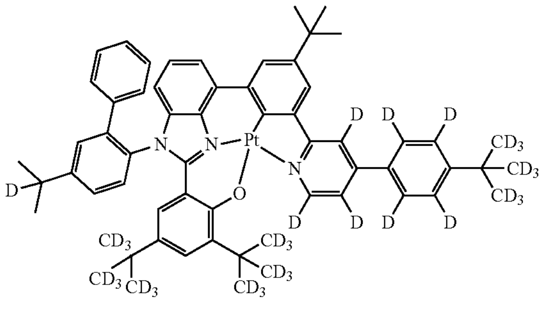

-continued
2283
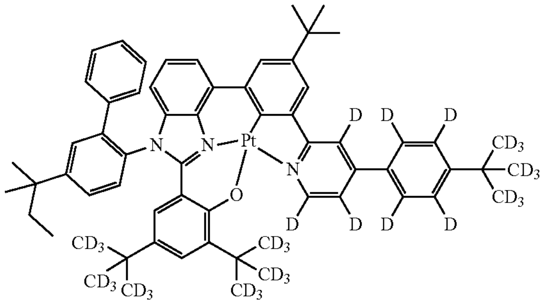
2284
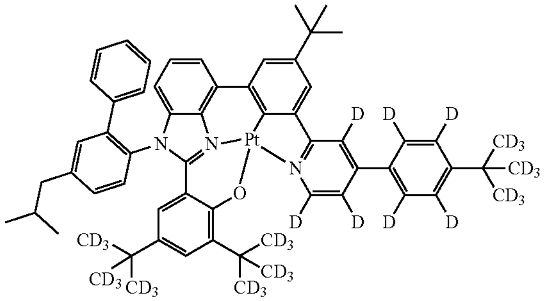
2285
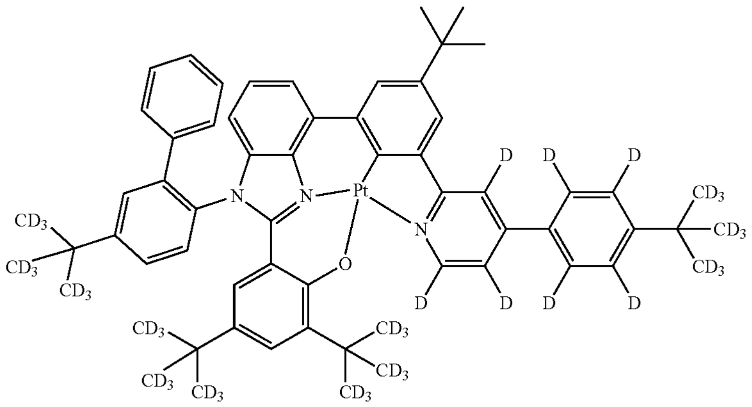
2286
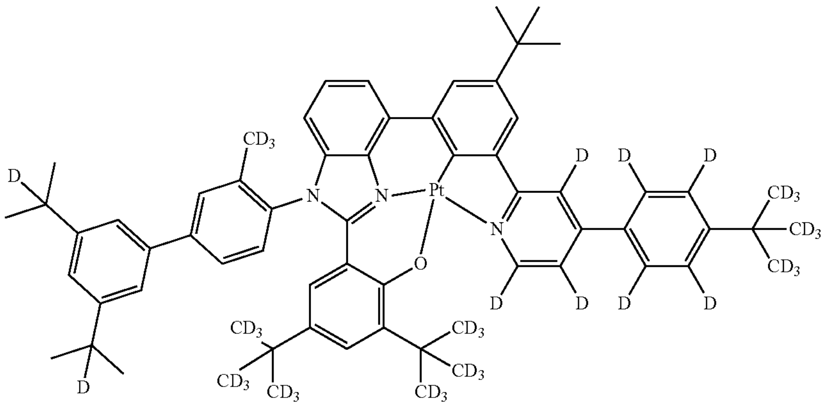
2287
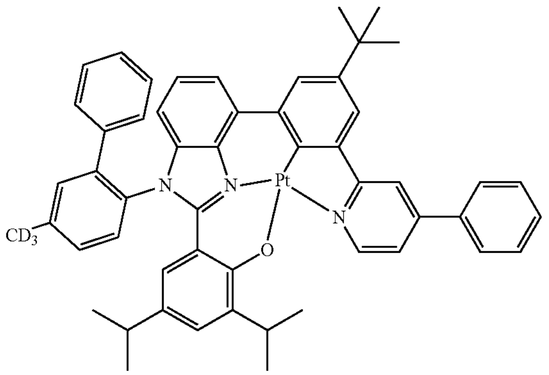
2288
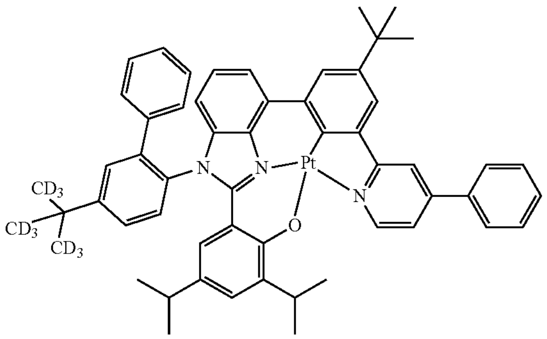

-continued
2289
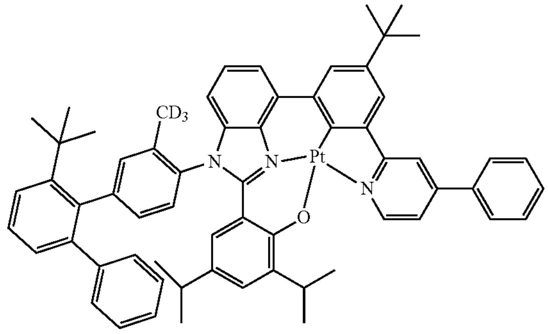
2290
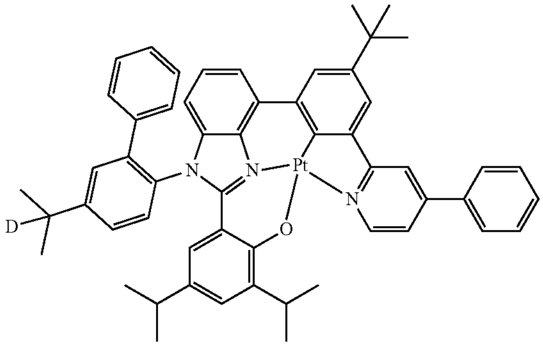
22911
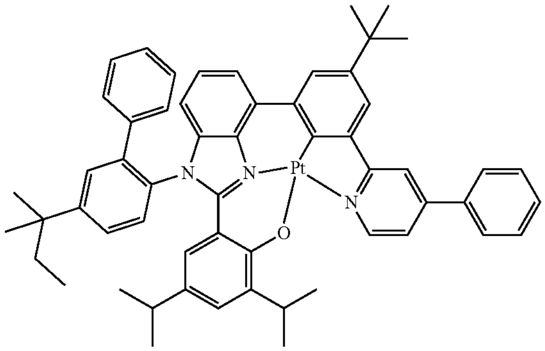
2292
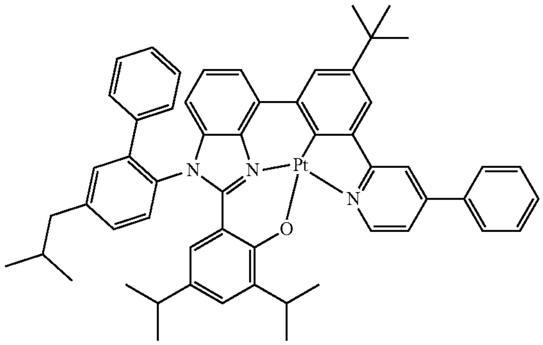
2293
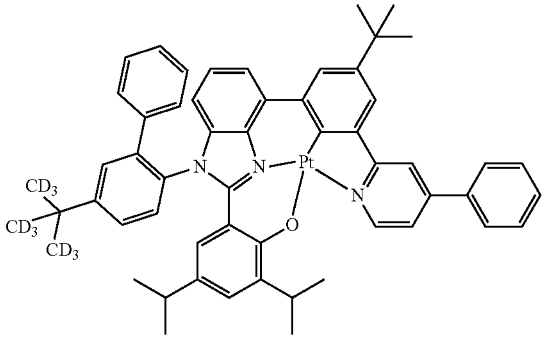
2294
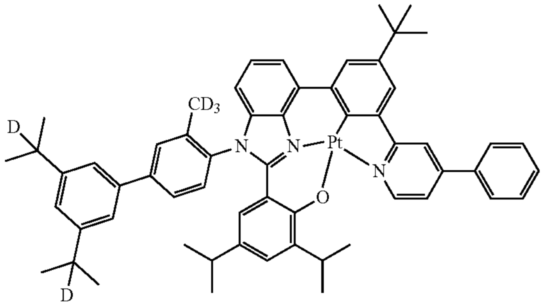
2295
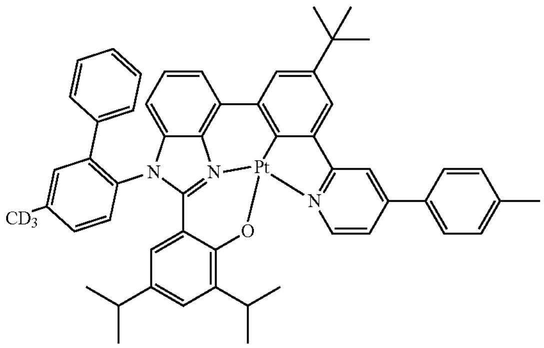
2296
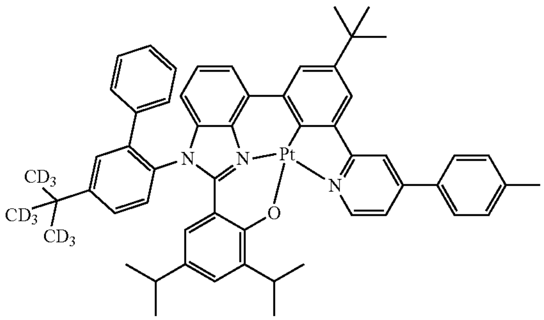

-continued
2297
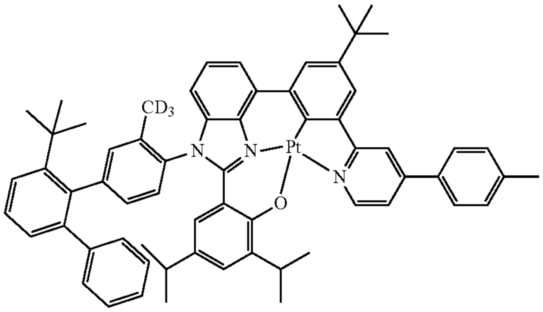
2298
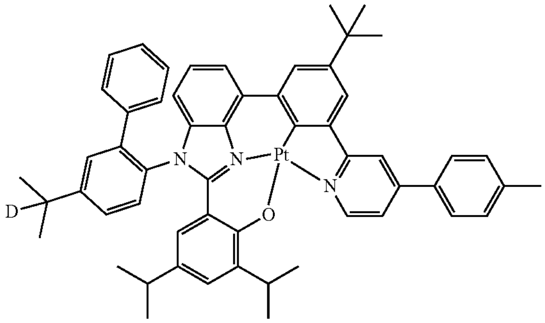
2299
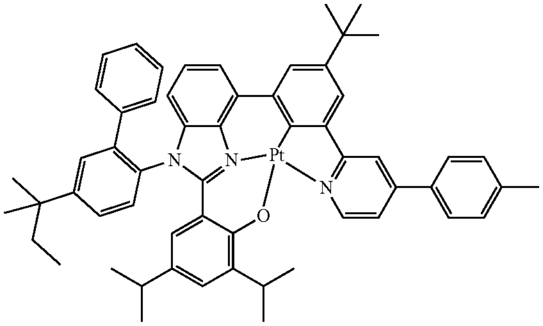
2300
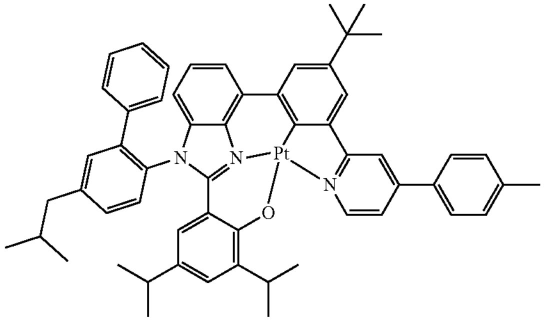
2301
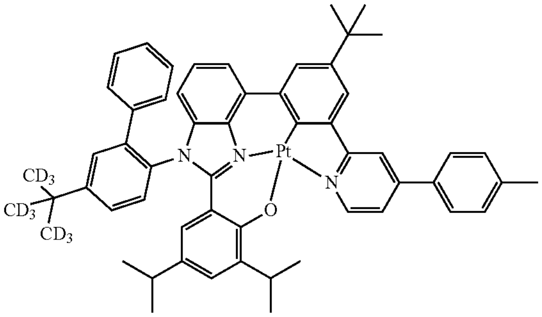
2302
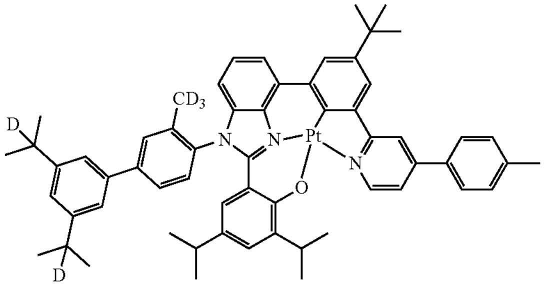
2303
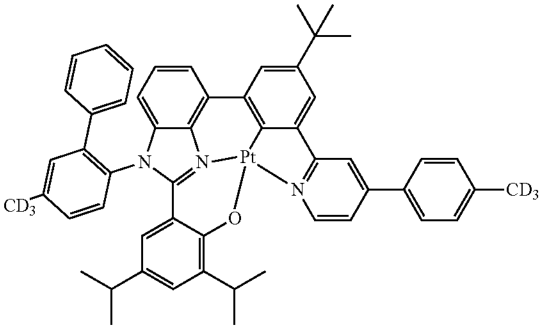
2304
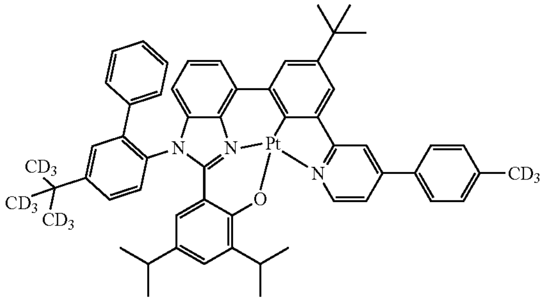

-continued
2305
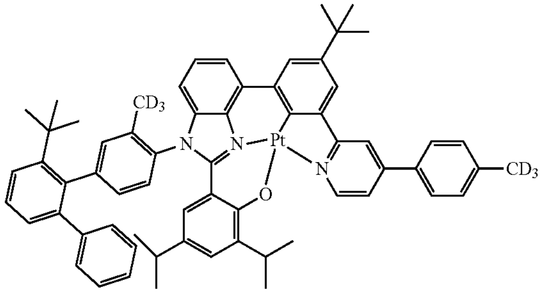
2306
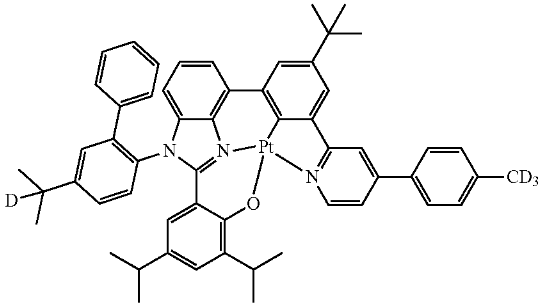
2307
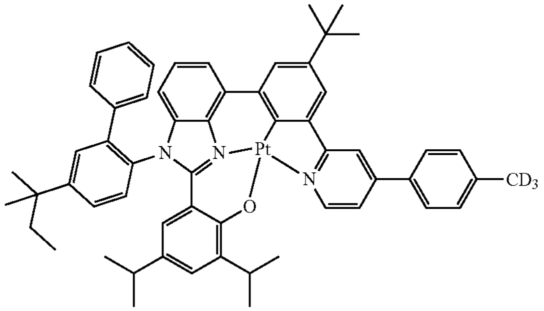
2308
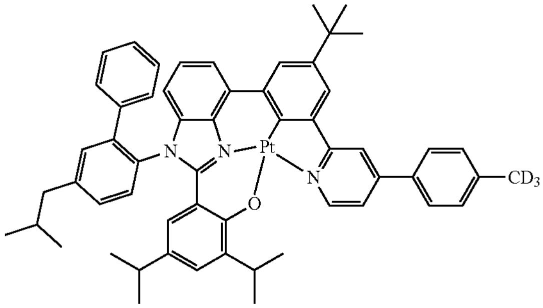
2309
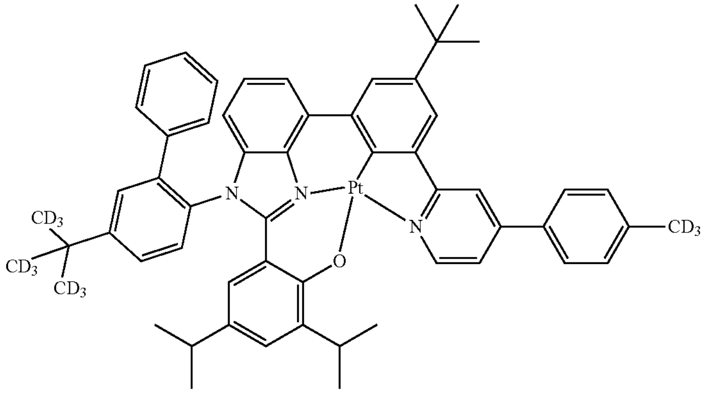
2310
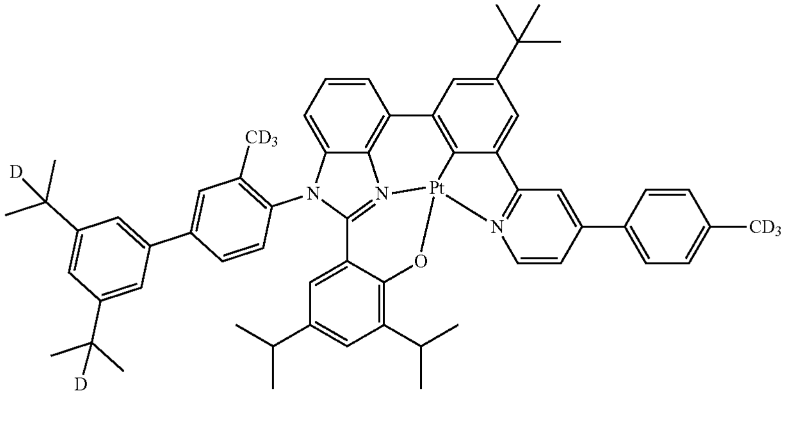

-continued
2311
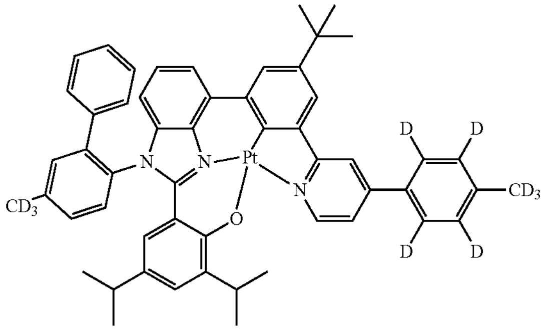
2312
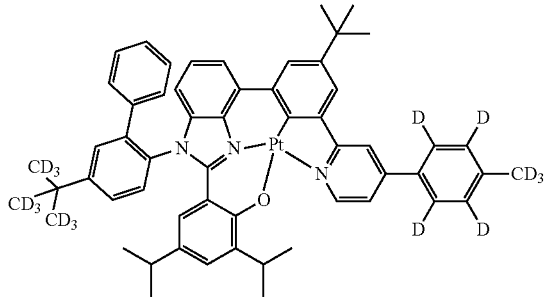
2313
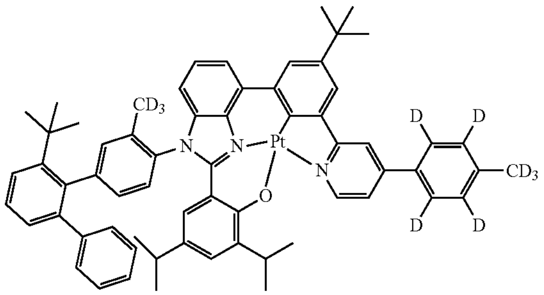
234
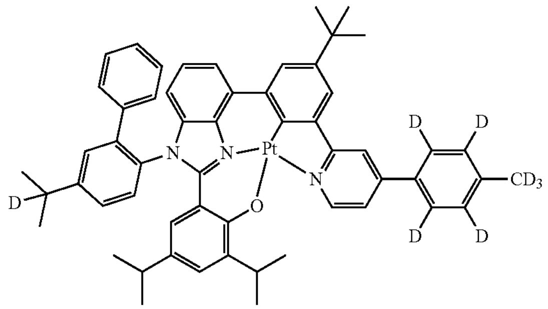
2315
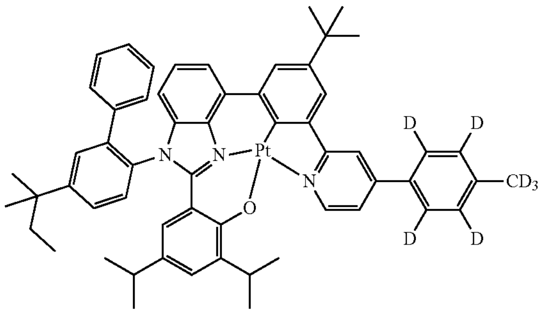
2316
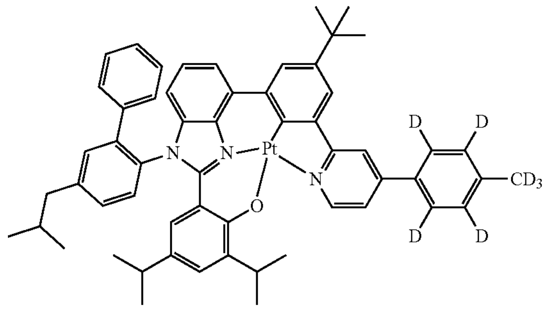
2317
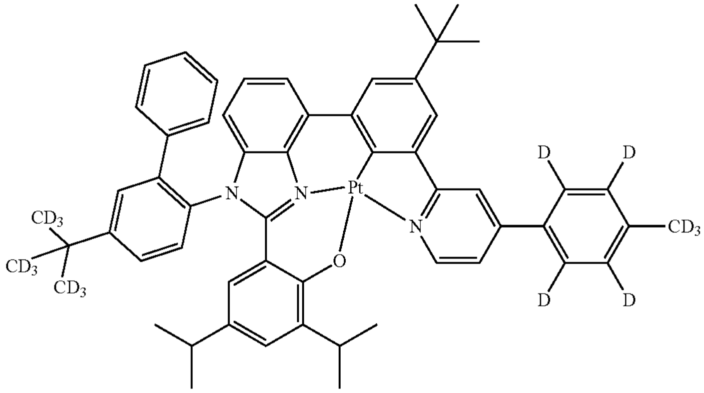

-continued
2318
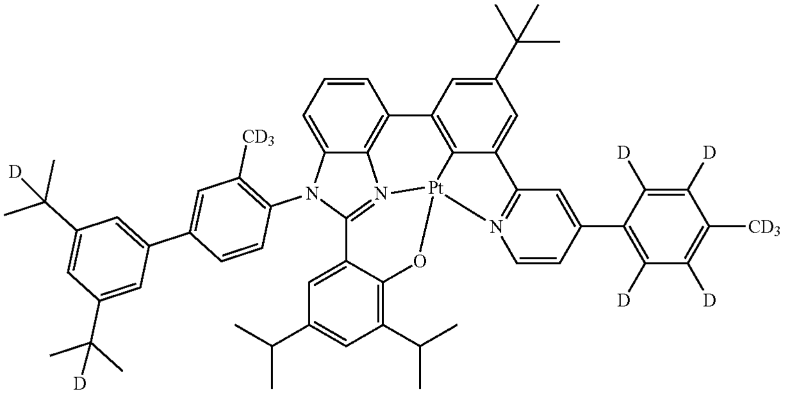
2319
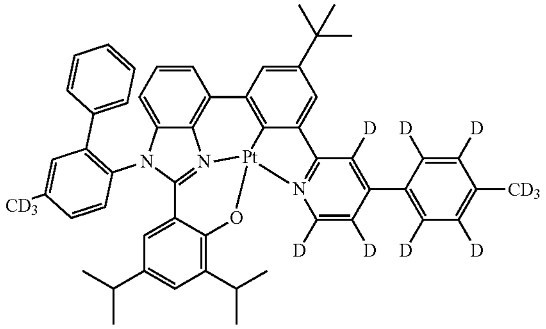
2320
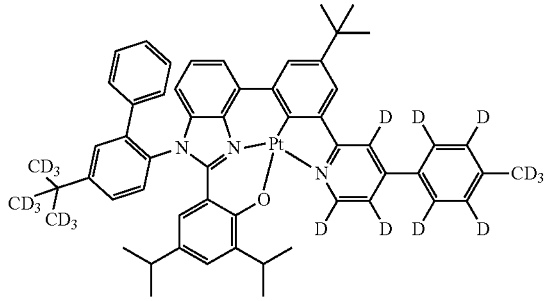
2321
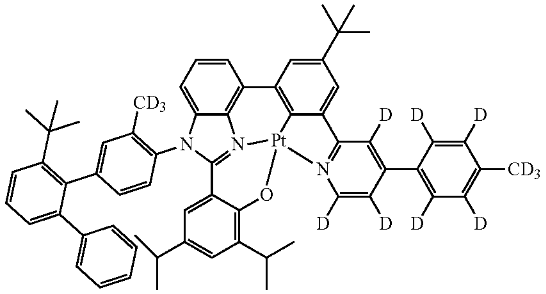
2322
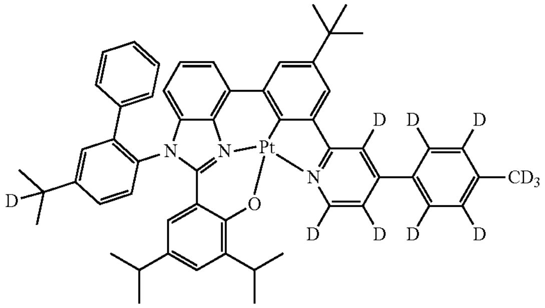
2323
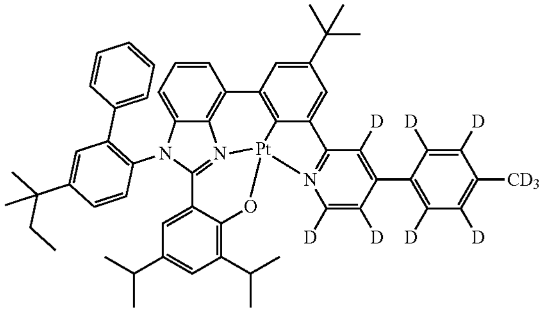
2324
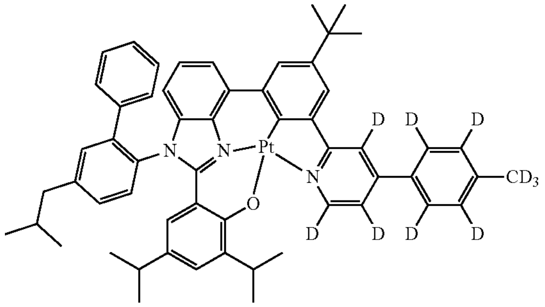

-continued
2325
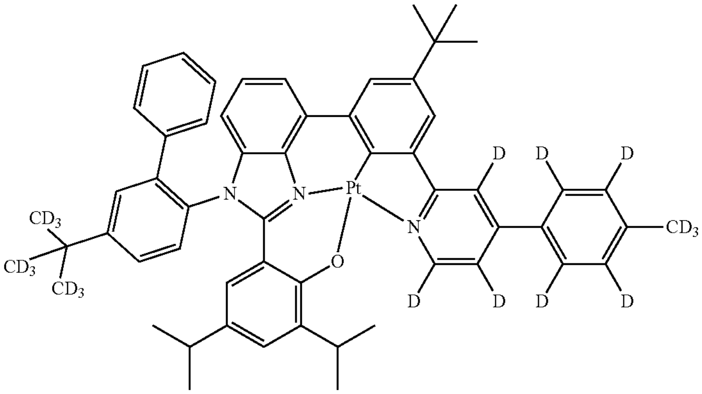
2326
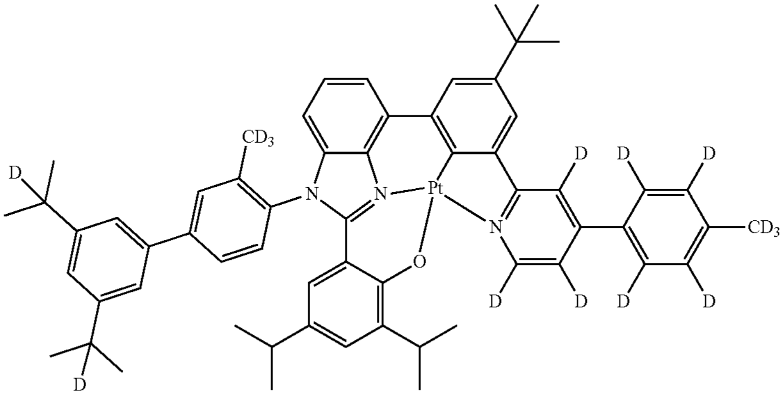
2327
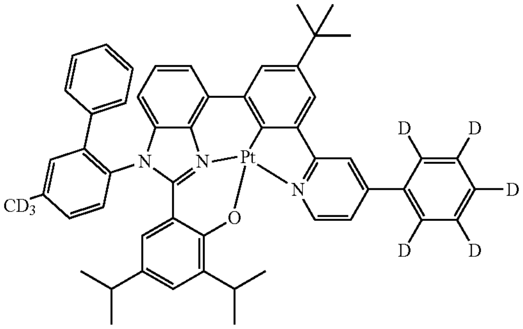
2328
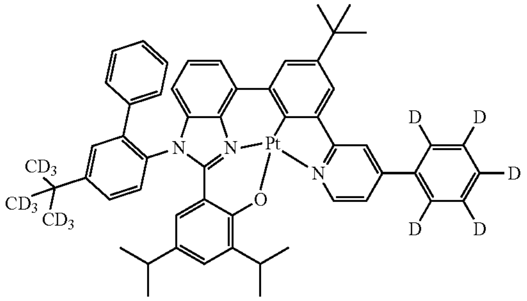
2329
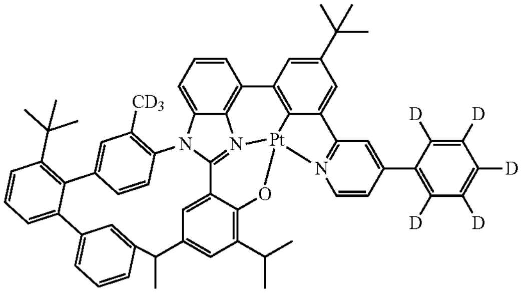
2330
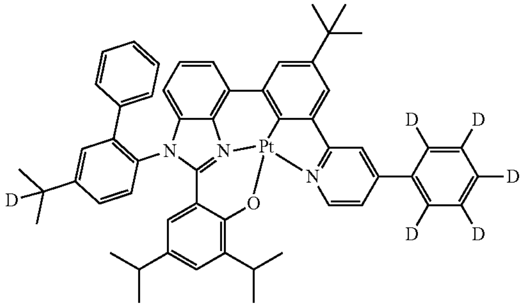

-continued
2331
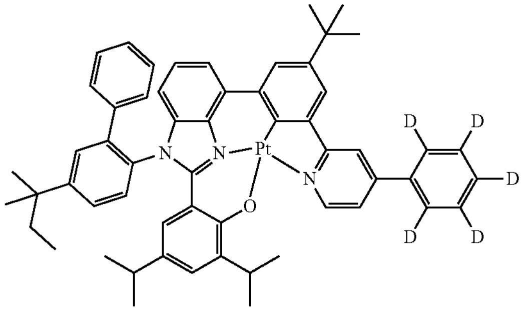
2332
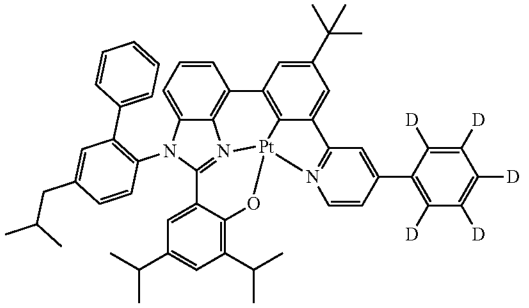
2333
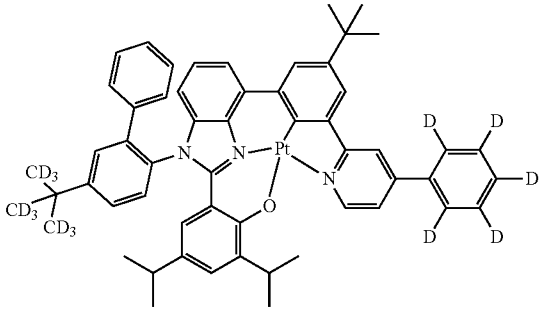
2334
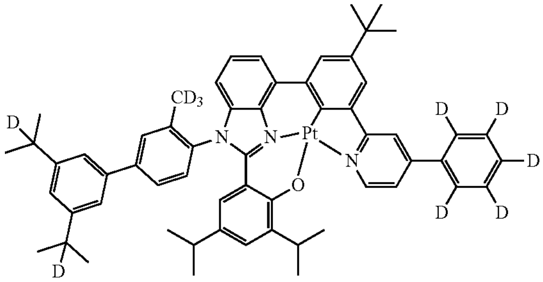
2335
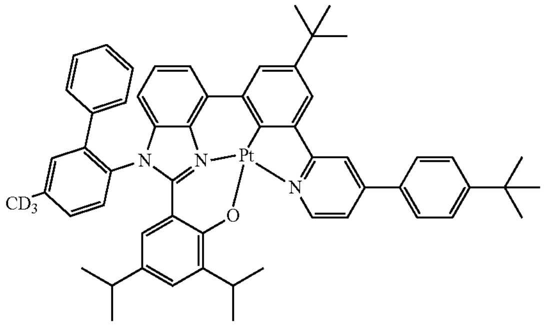
2336
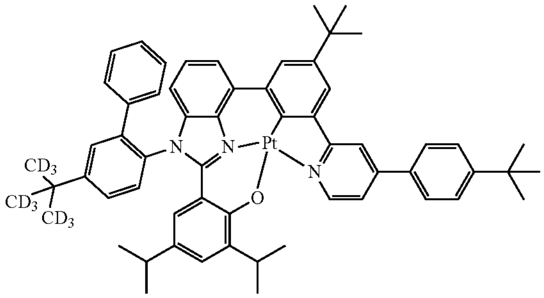
2337
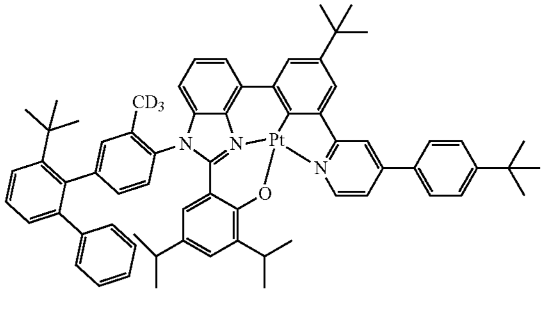
2338
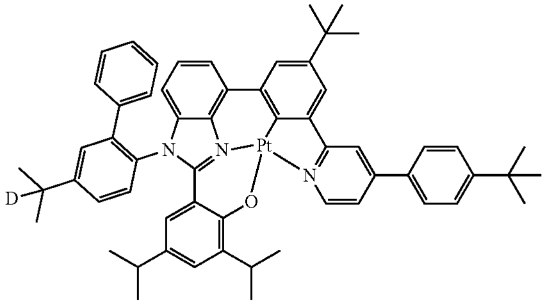

-continued
2339
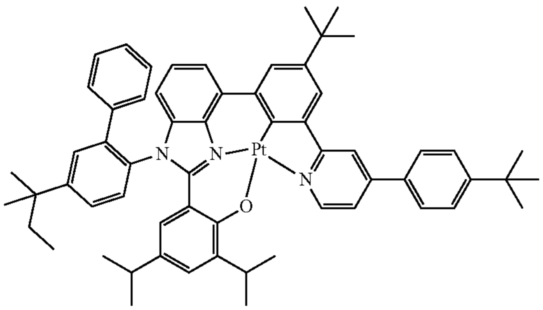
2340
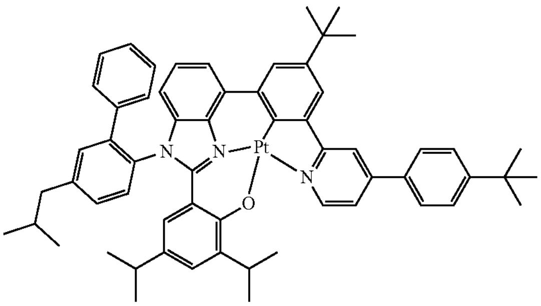
2341
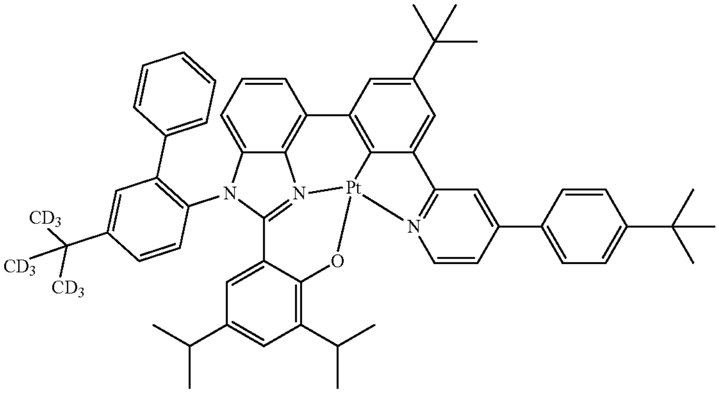
2342
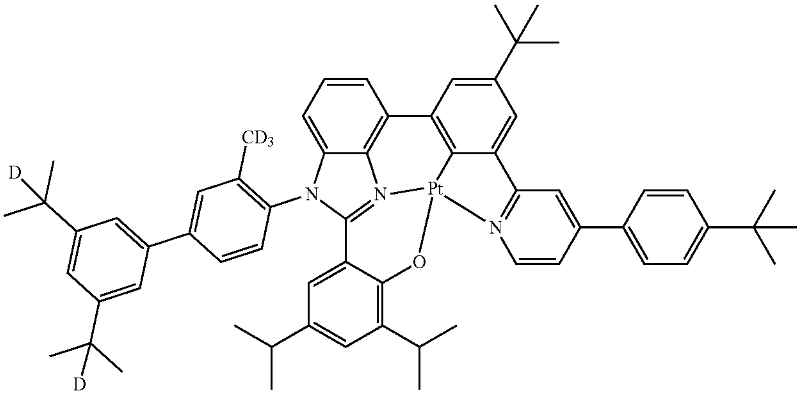
2343
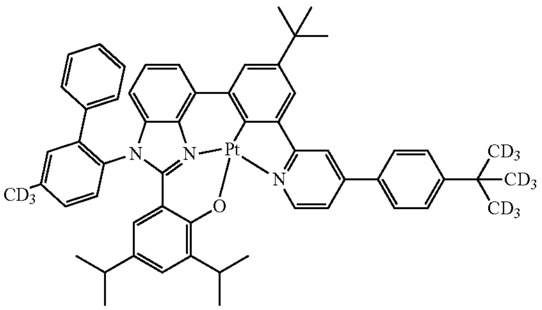
2344
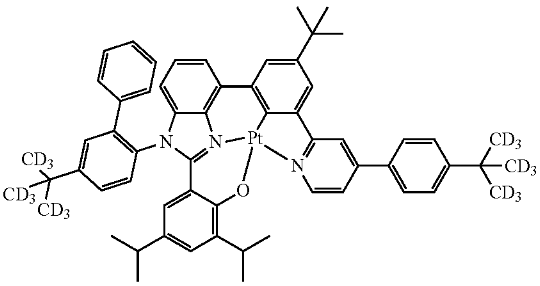

-continued
2345
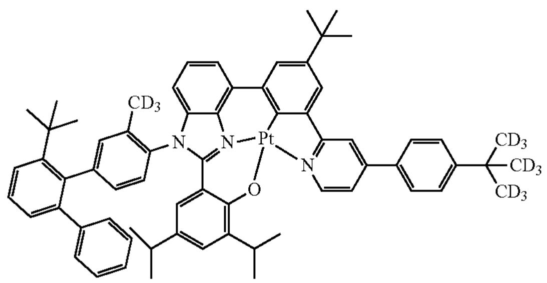
2346
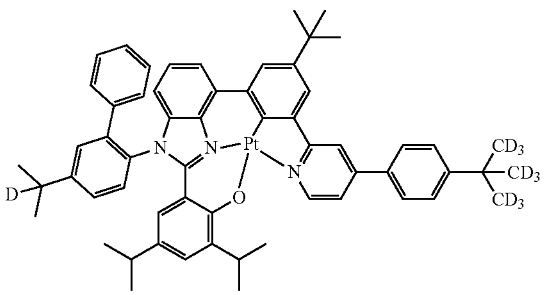
2347
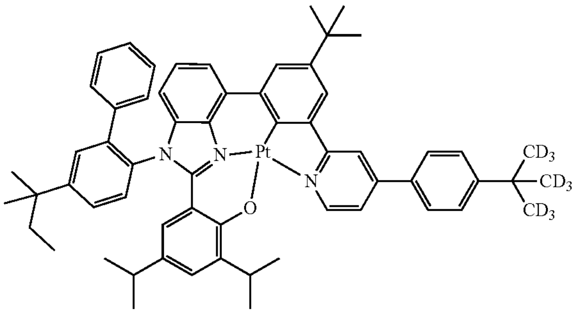
2348
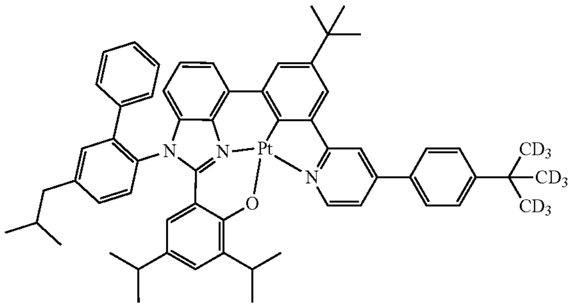
2349
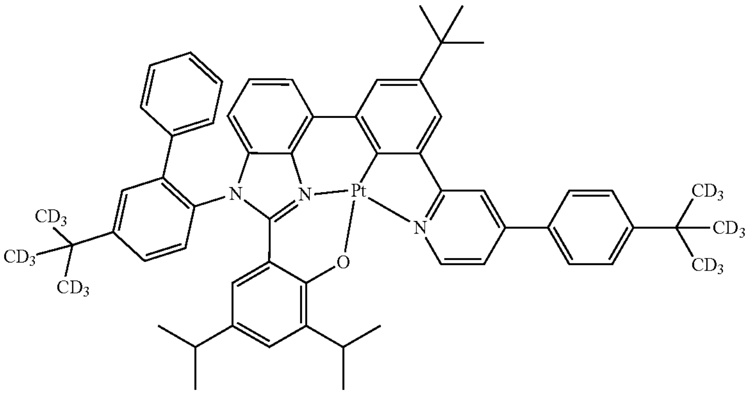
2350
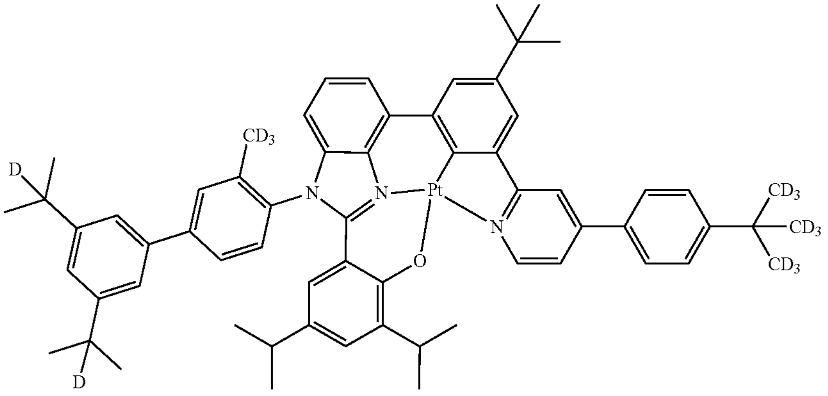

-continued
2351
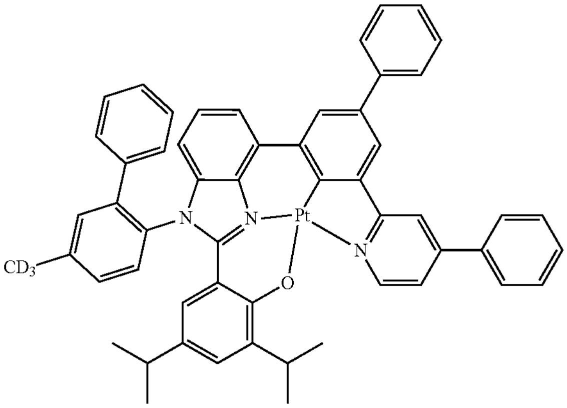
2352
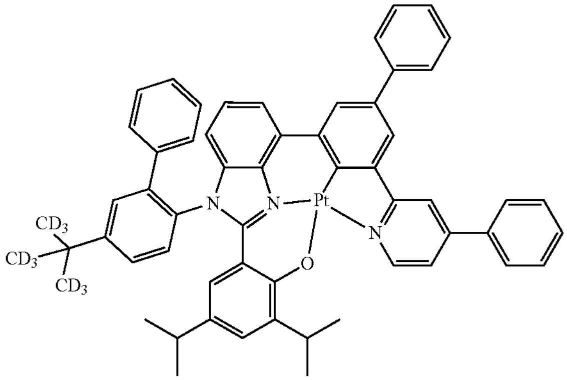
2353
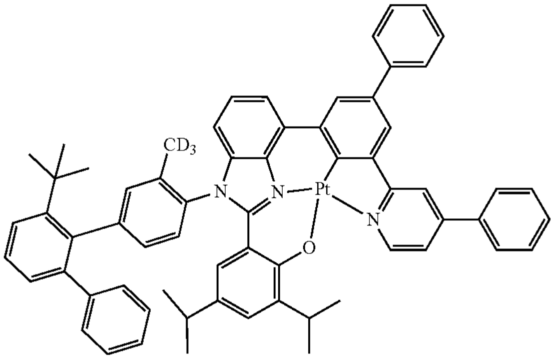
2354
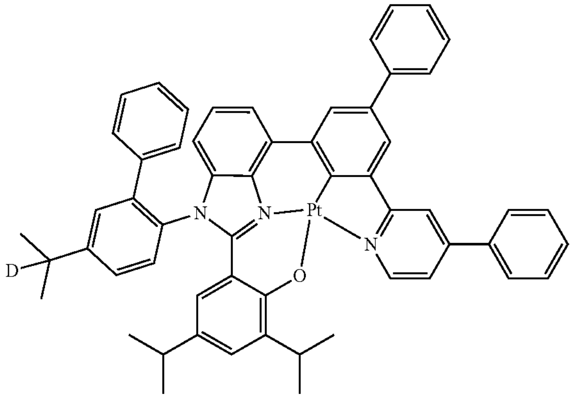
2355
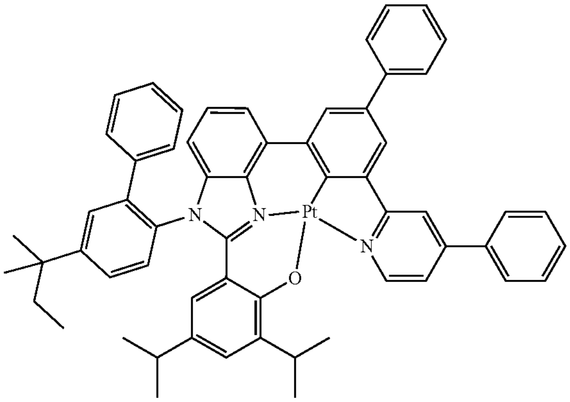
2356
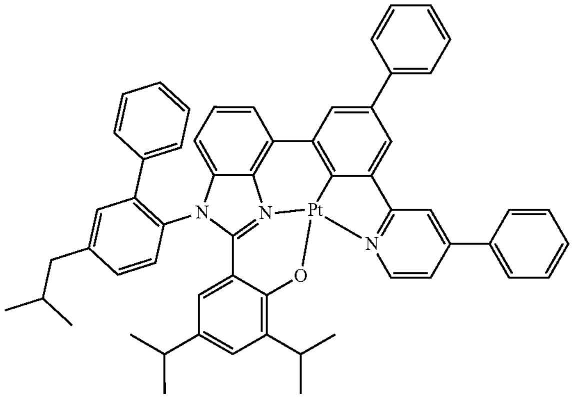

-continued
2357
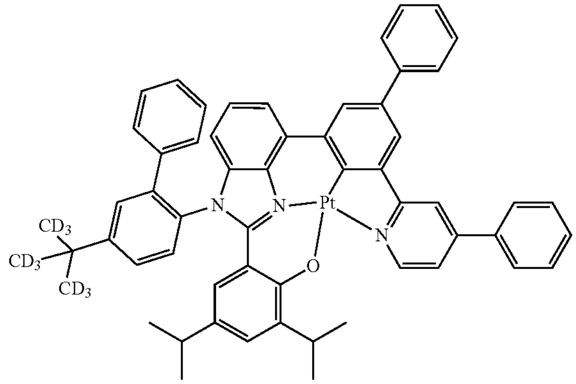
2358
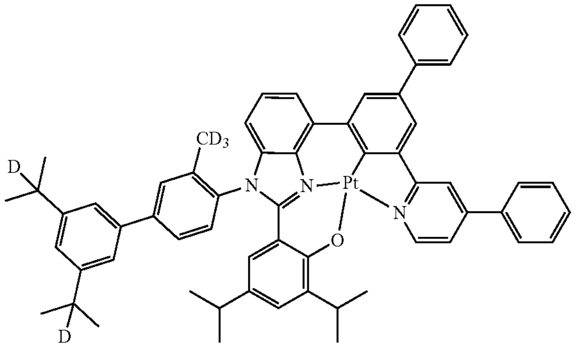
2359
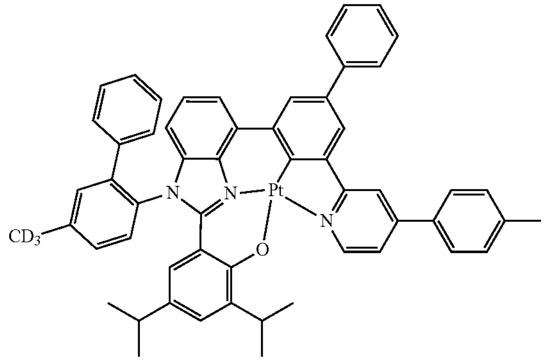
2360
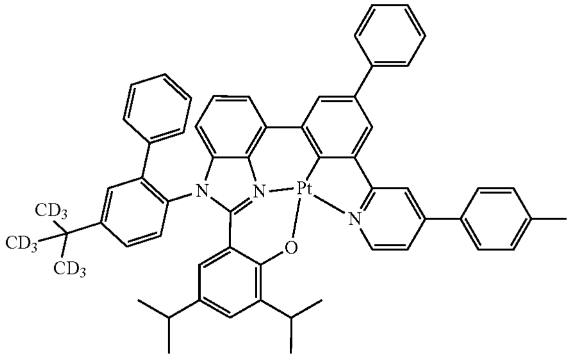
2361
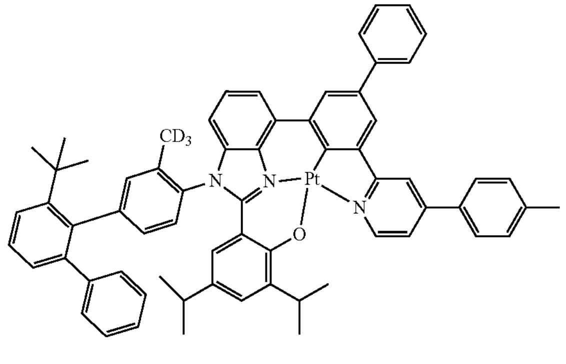
2362
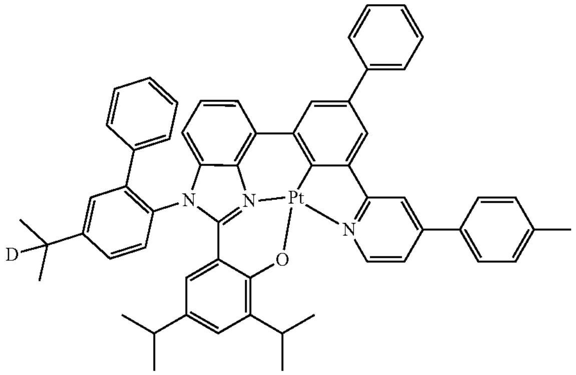
2363
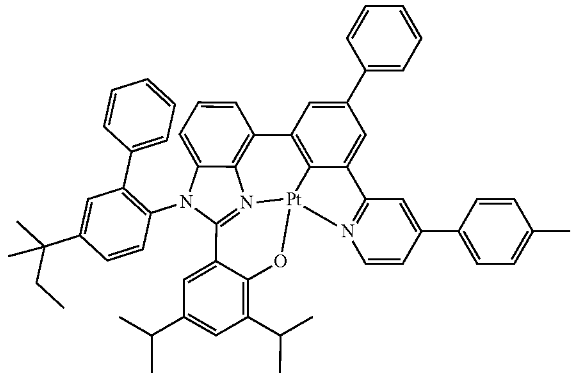
2364
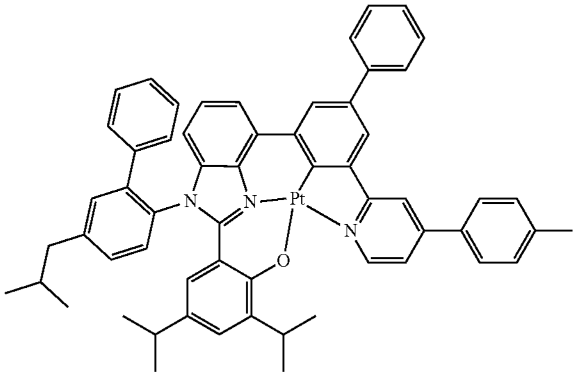

-continued
2365
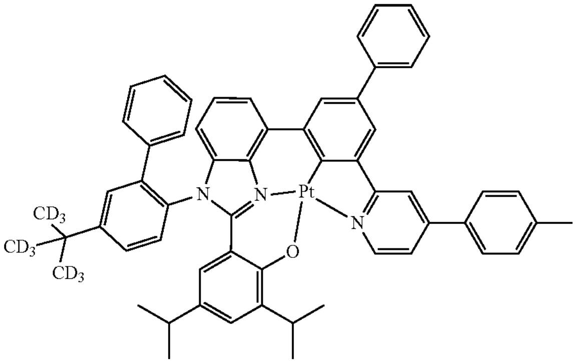
2366
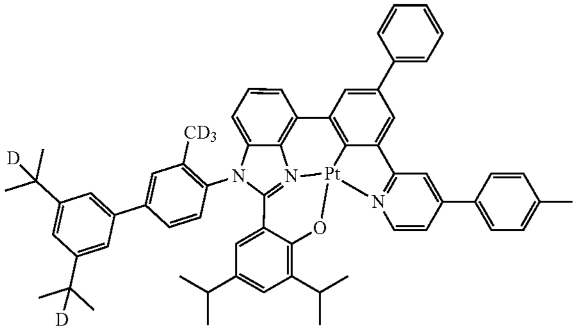
2367
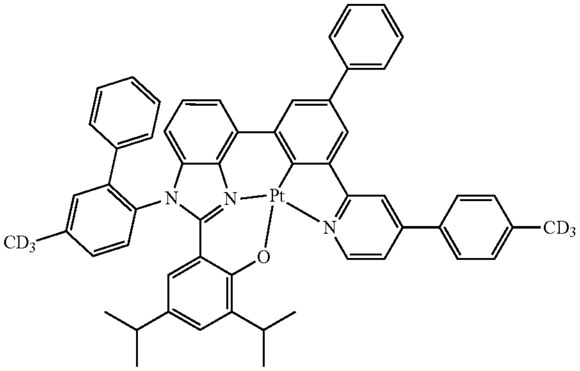
2368
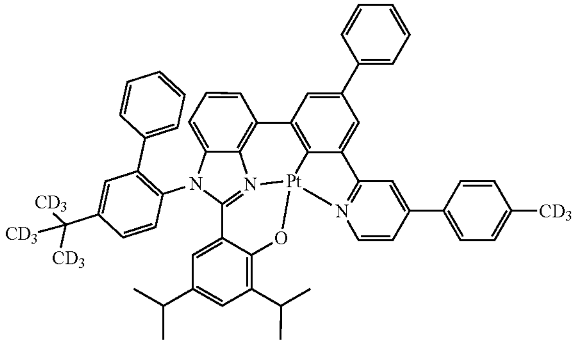
2369
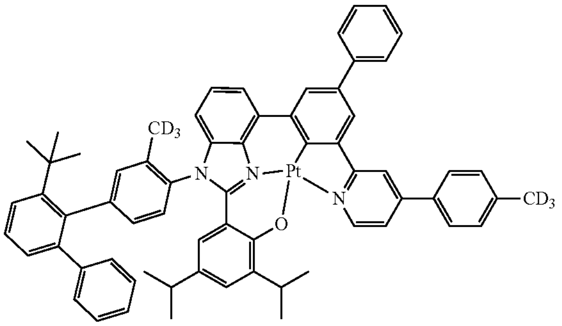
2370
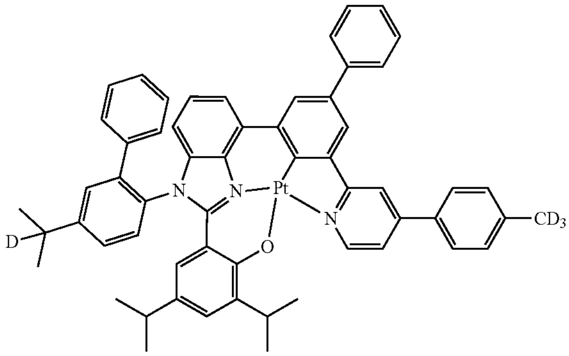
2371
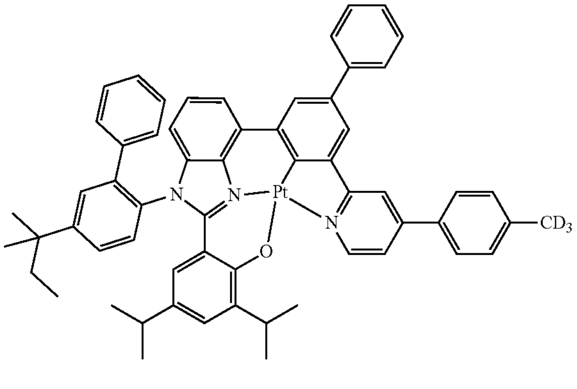
2372
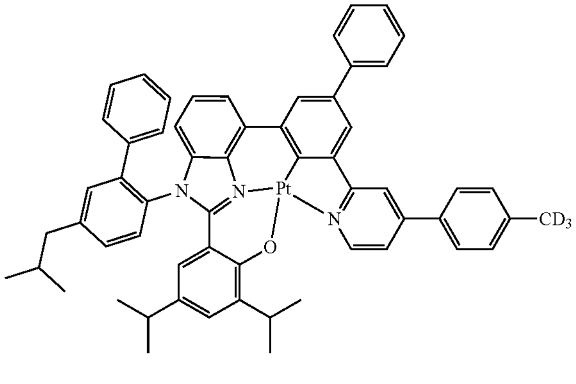

-continued
2373
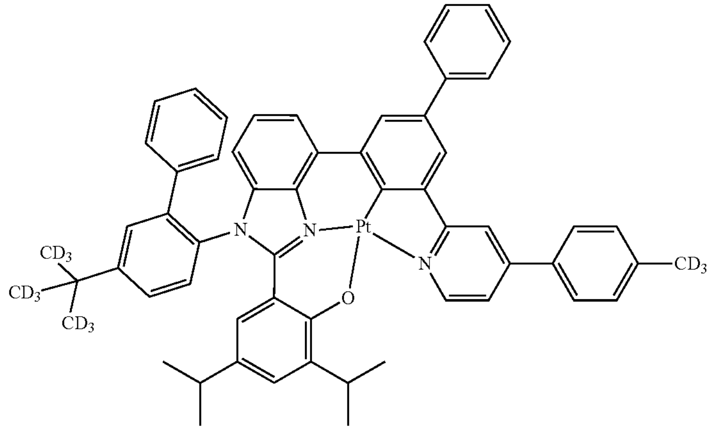
2374
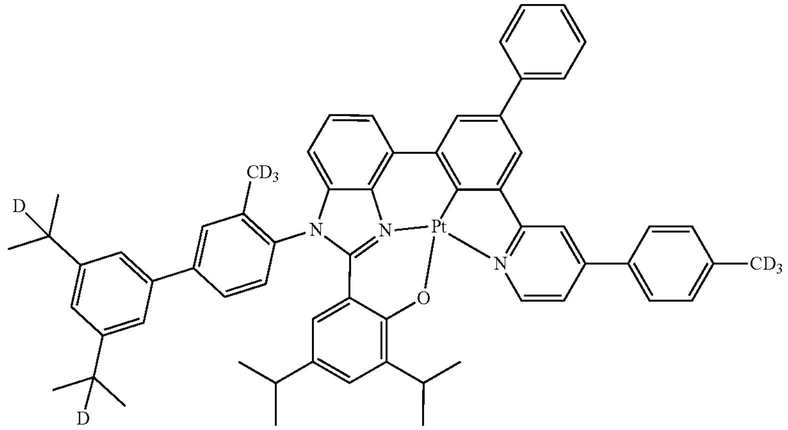
2375
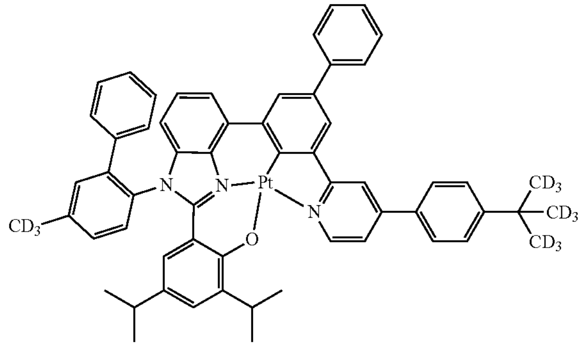
2376
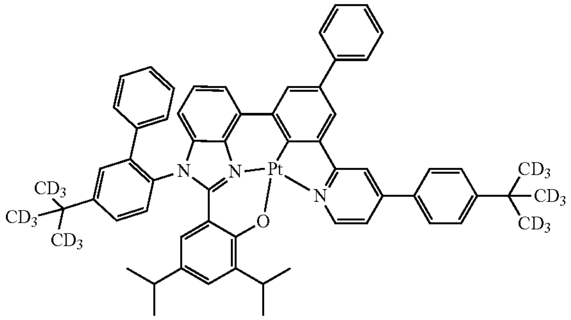

-continued
2377
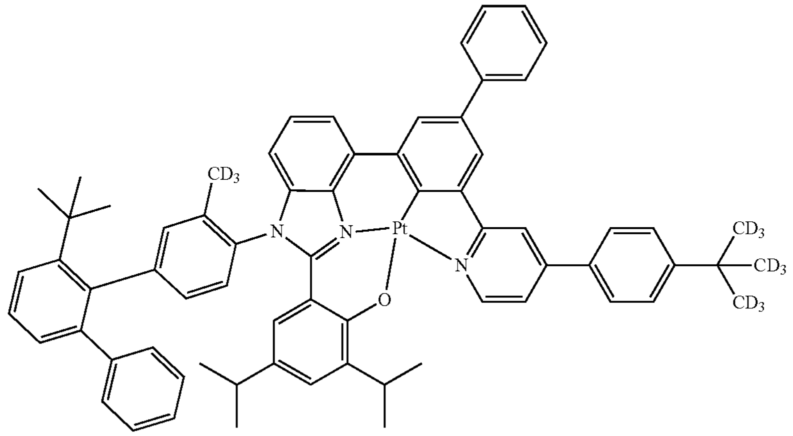
2378
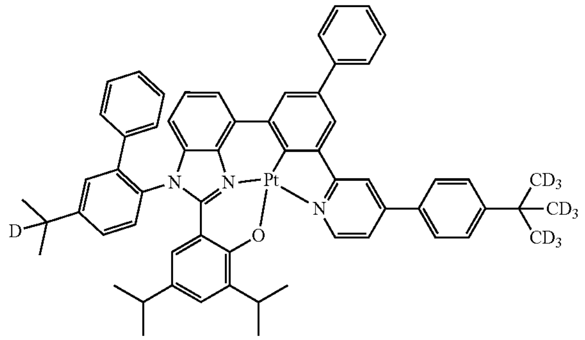
2379
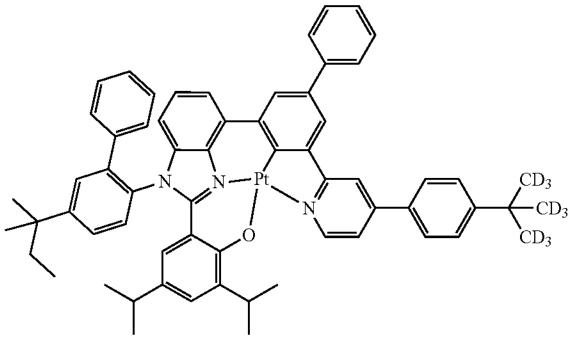
2380
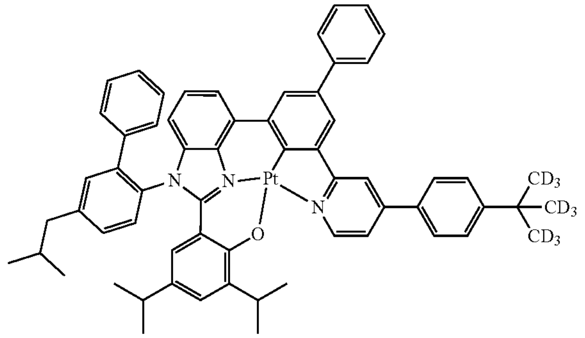
2381
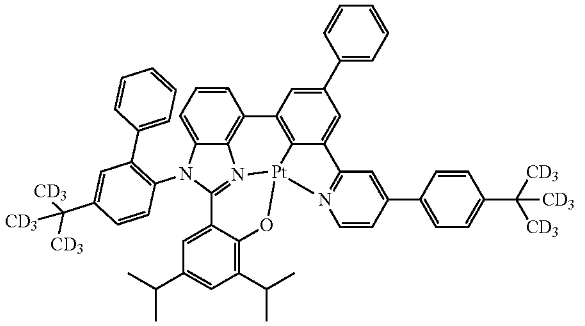
2382
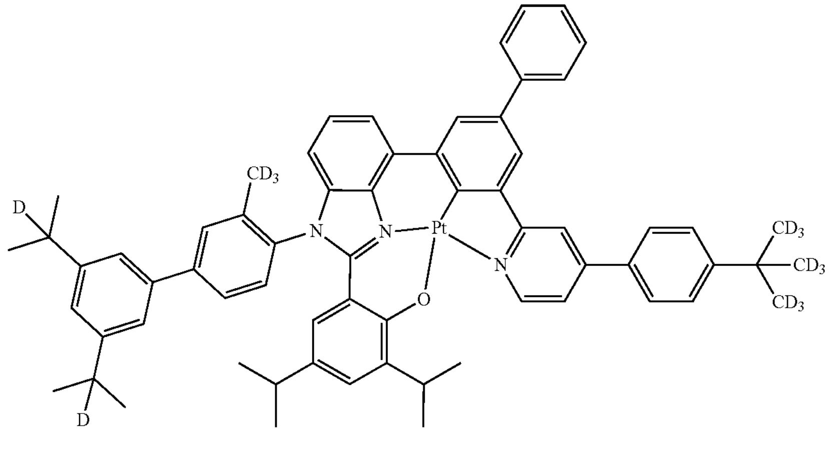

-continued
2383
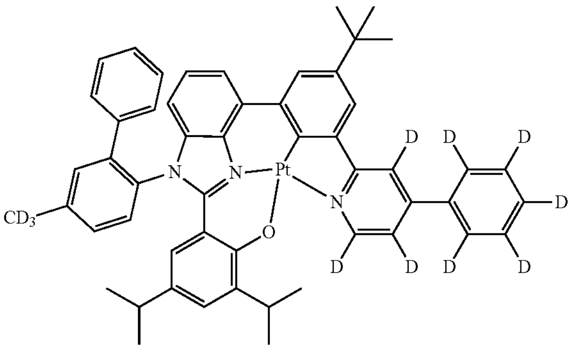
2384
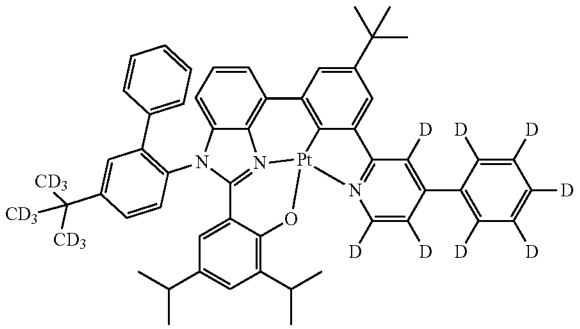
2385
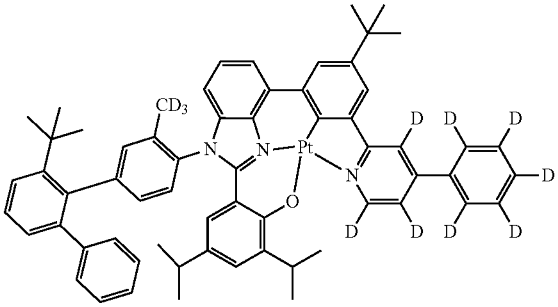
2386
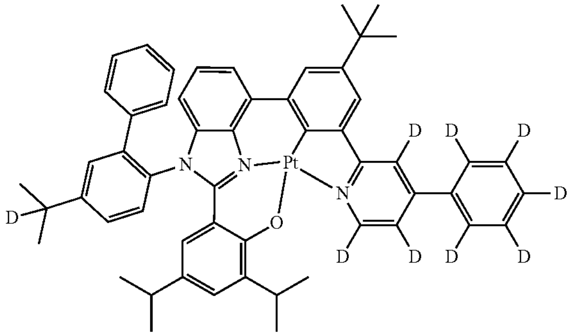
2387
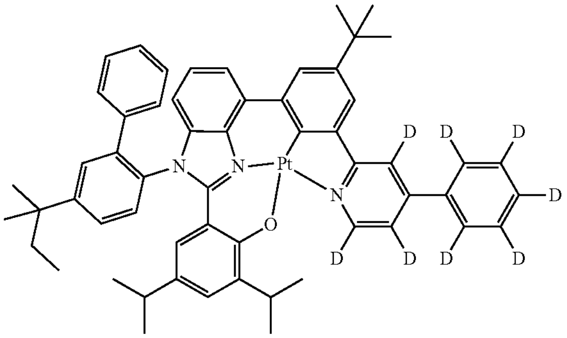
2388
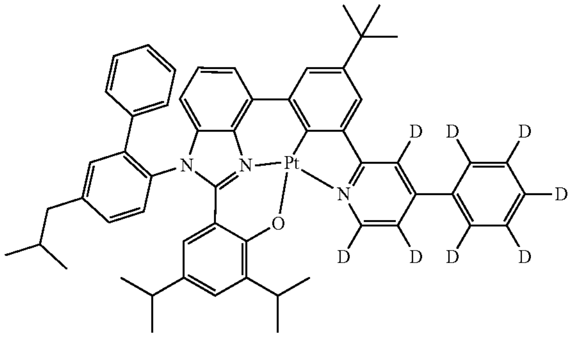
2389
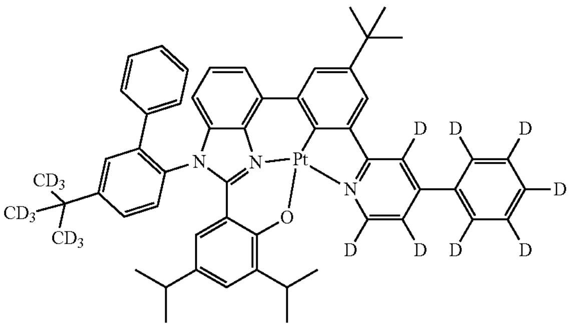
2390
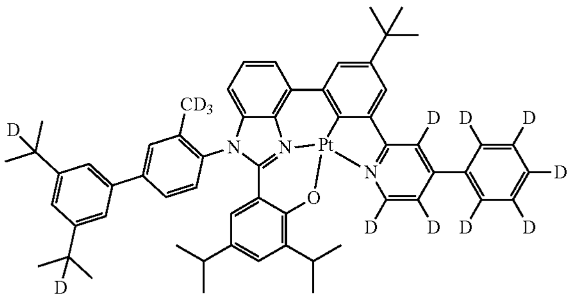

-continued
2391
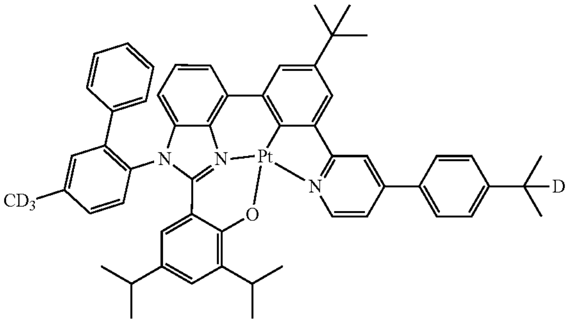
2392
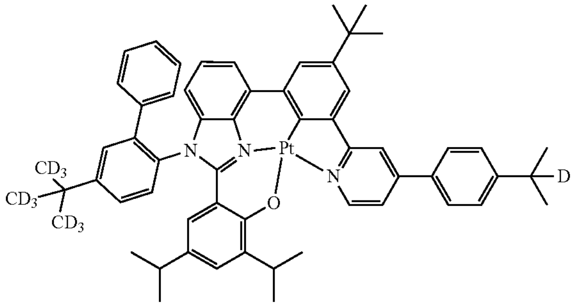
2393
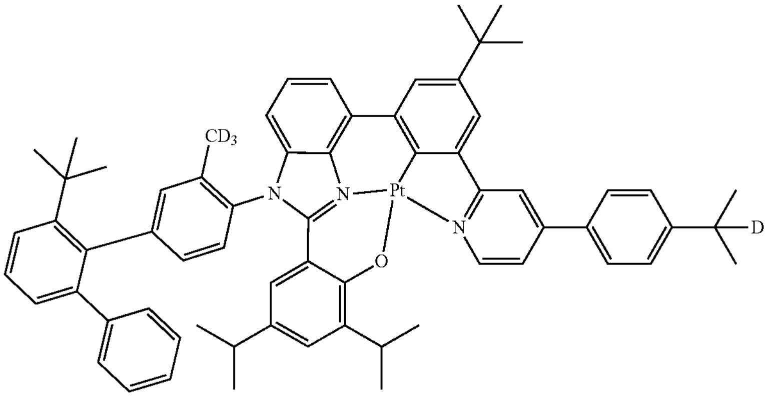
2394
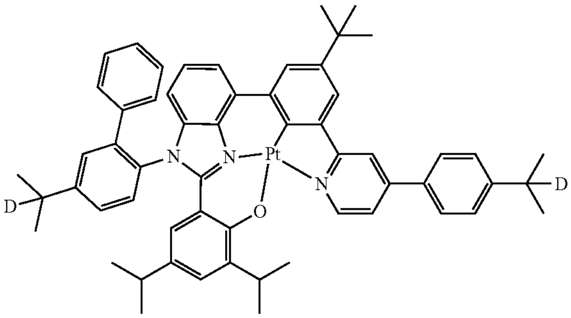
2395
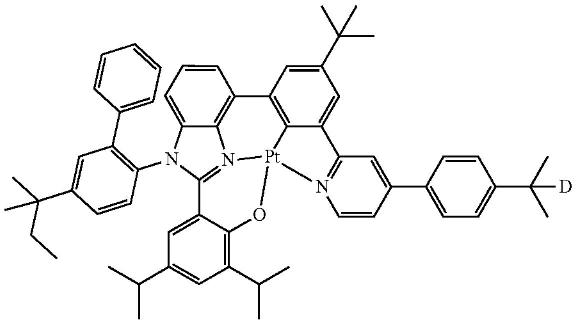
2396
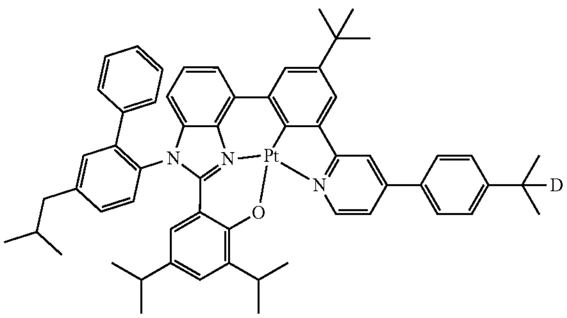
2397
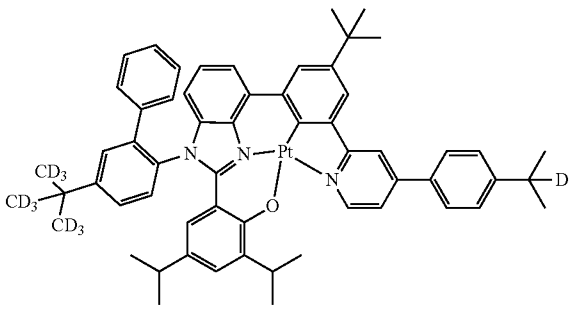

-continued
2398
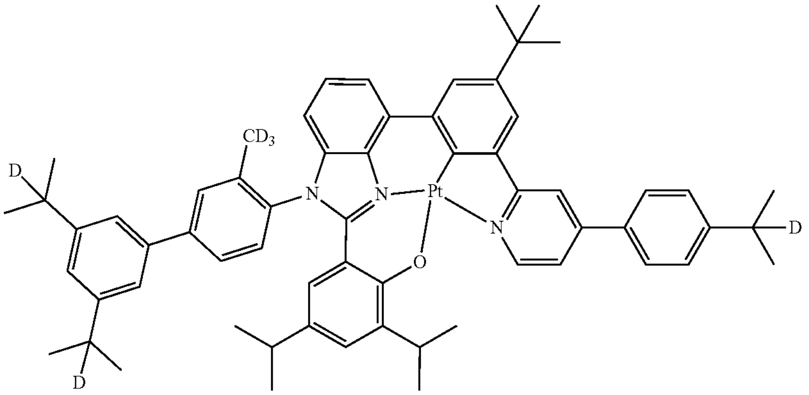
2399
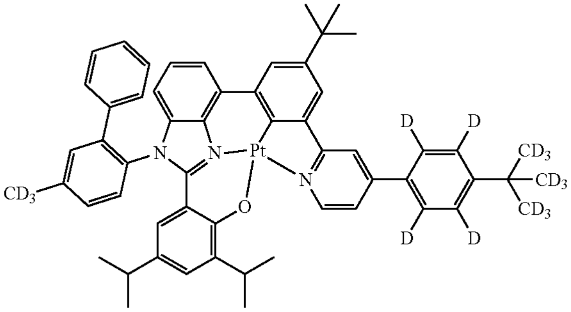
2400
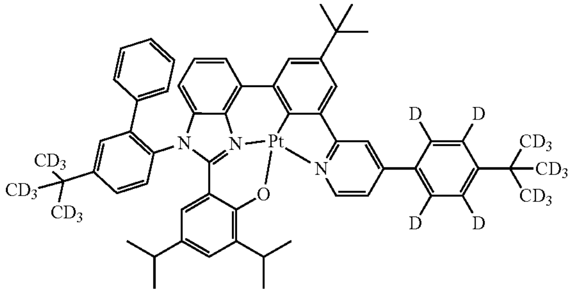
2401
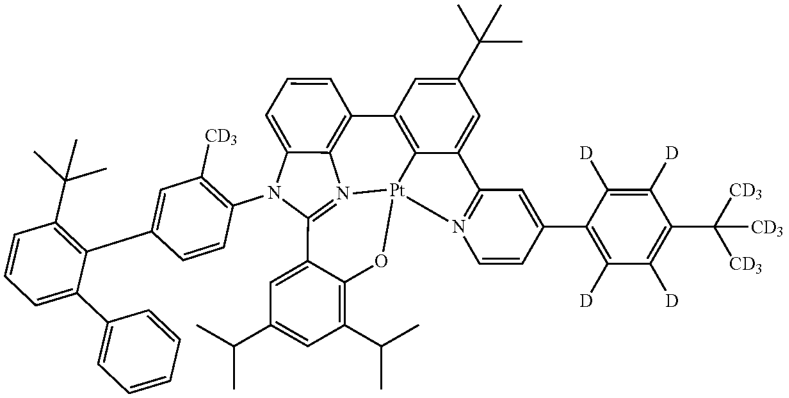
2402
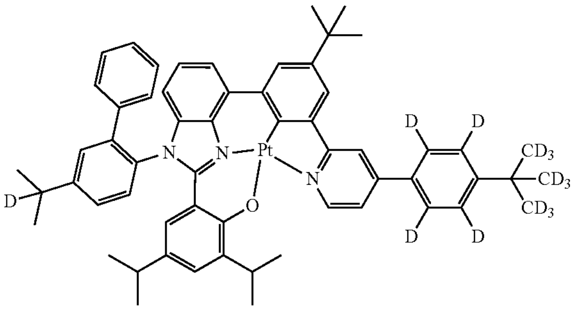
2403
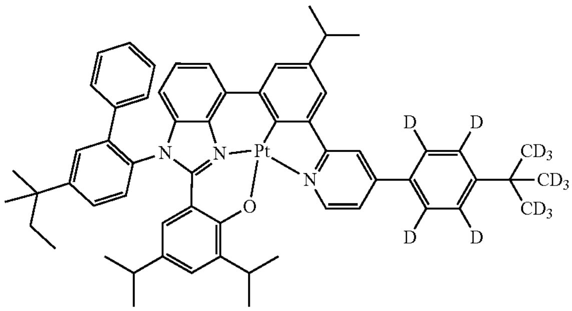

-continued
2404
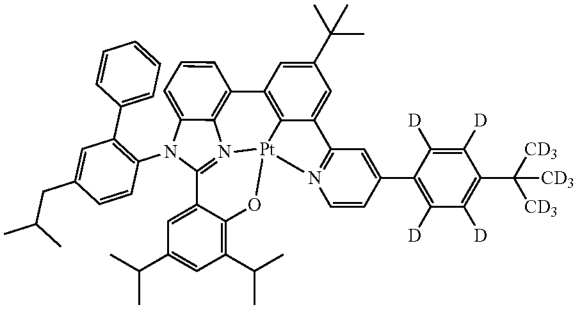
2405
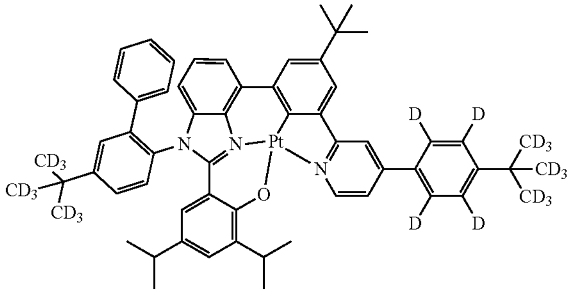
2406
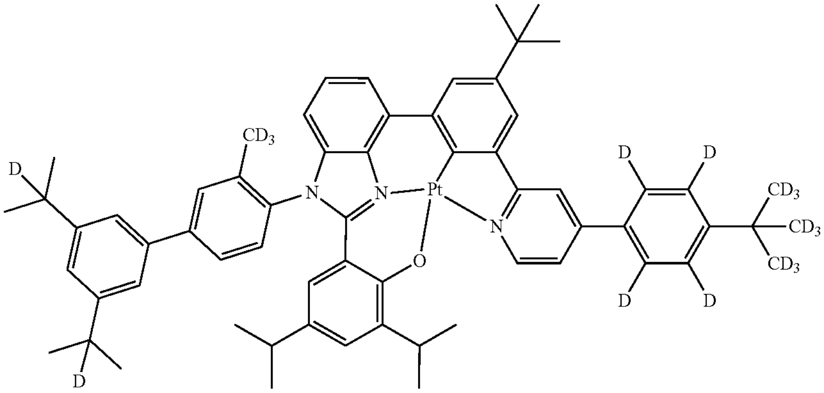
2407
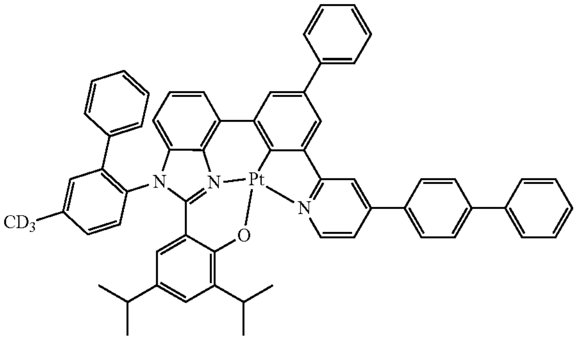
2408
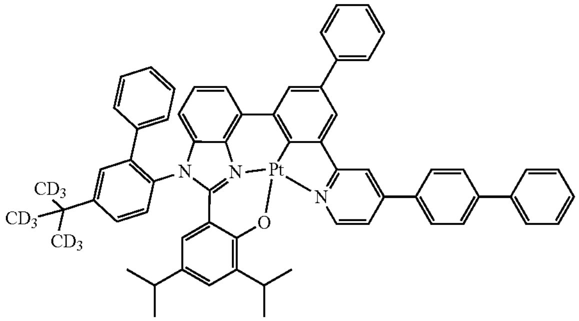
2409
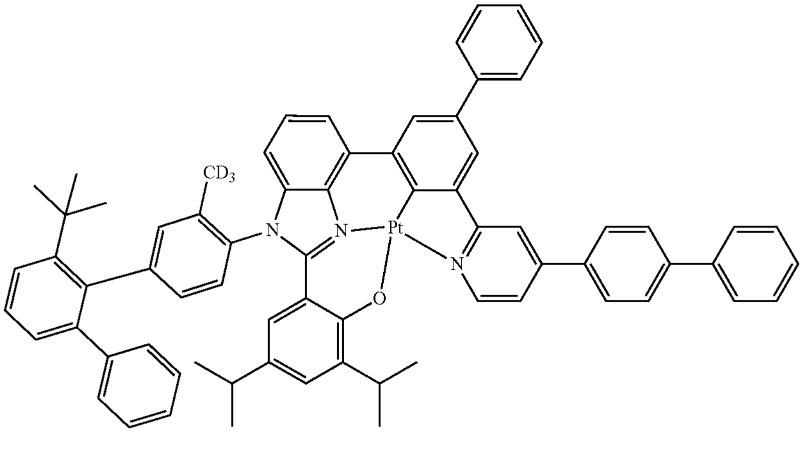

-continued
2410
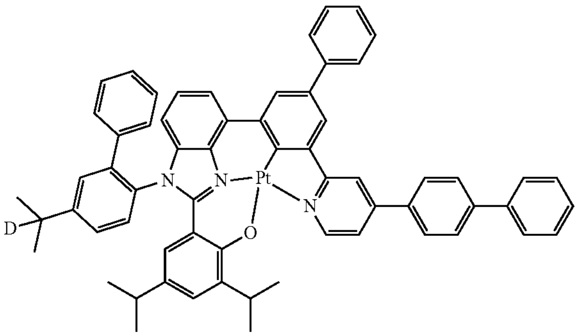
2411
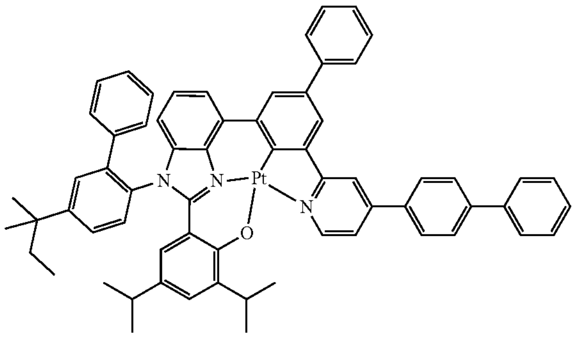
2412
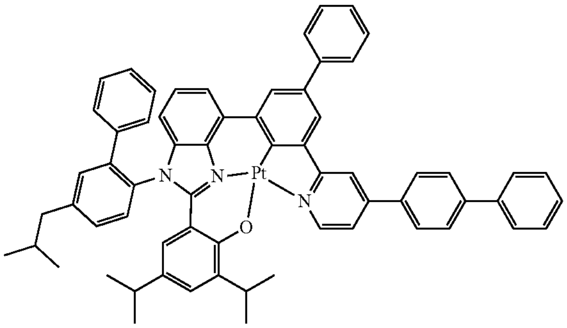
2413
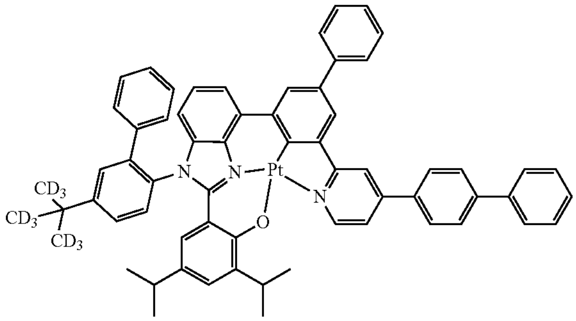
2414
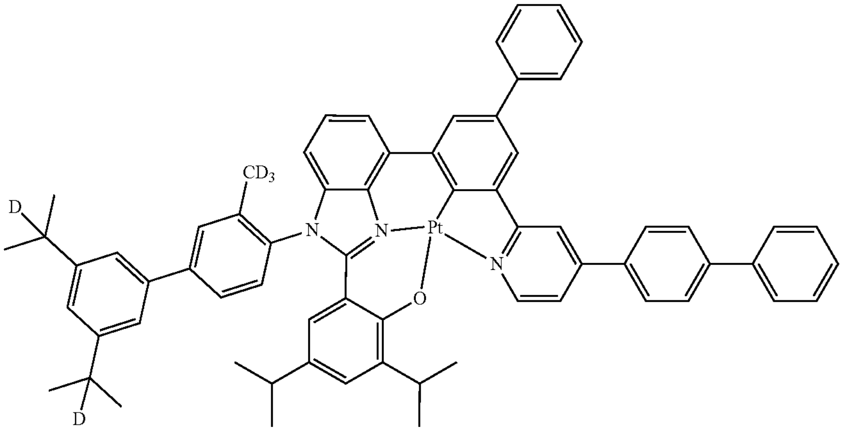
2415
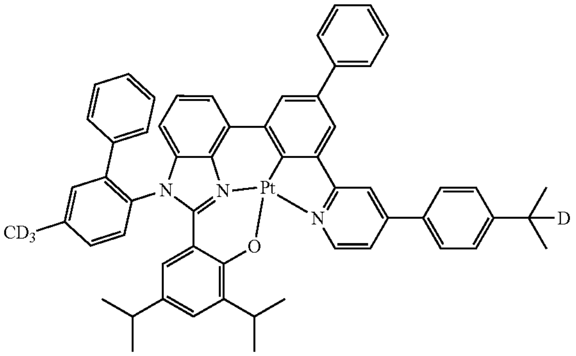
2416
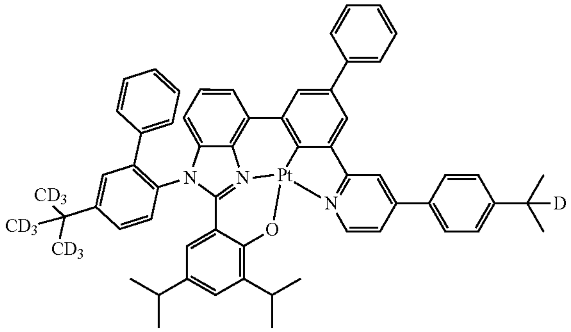

-continued
2417
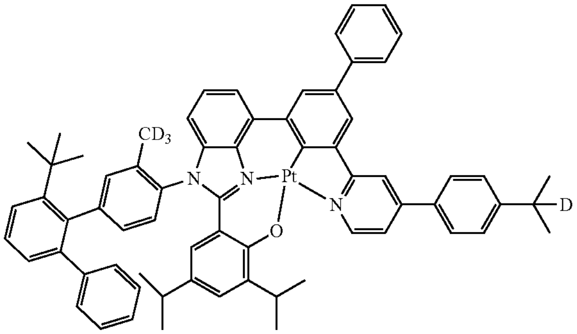
2418
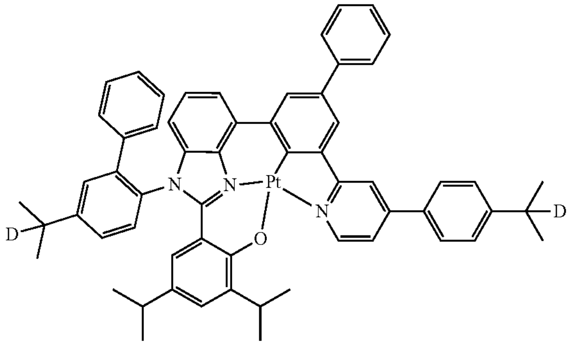
2419
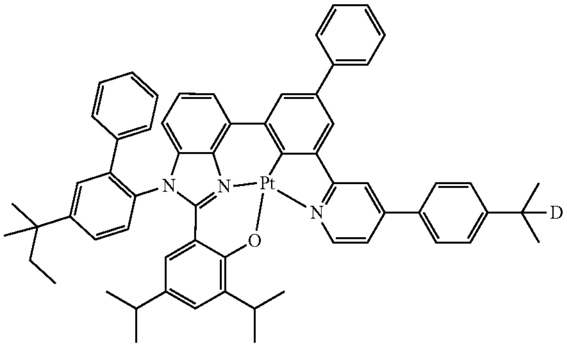
2420
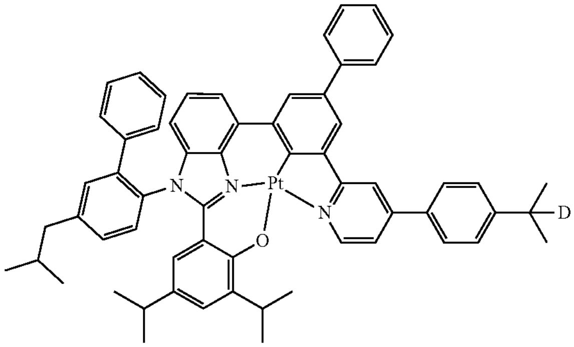
2421
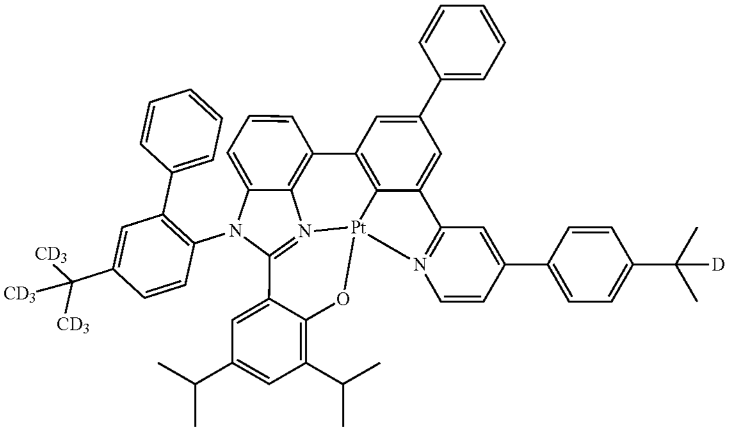
2422
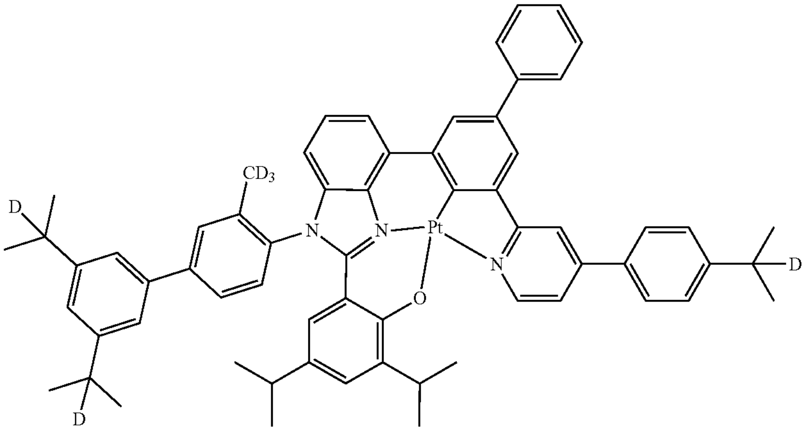

-continued
2423
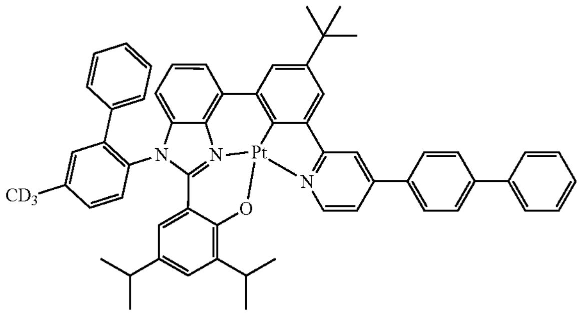
2424
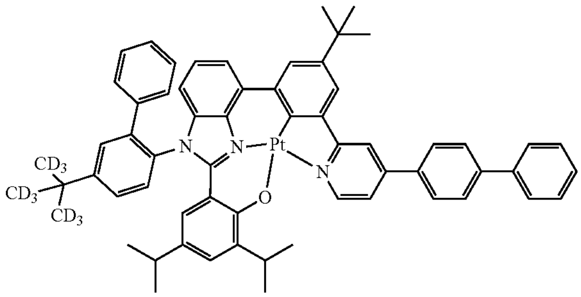
2425
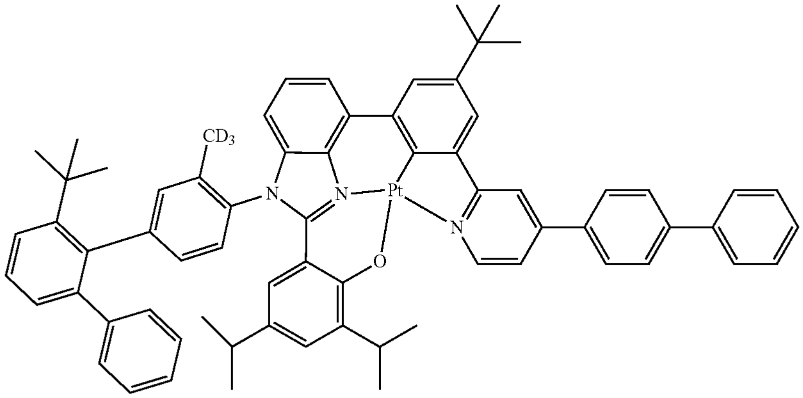
2426
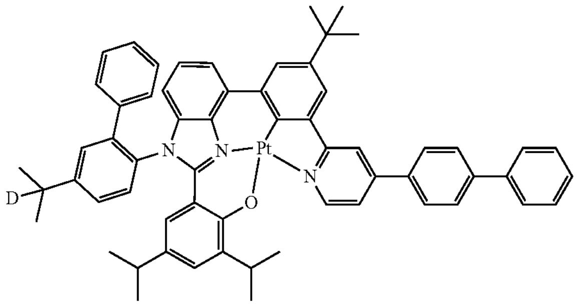
2427
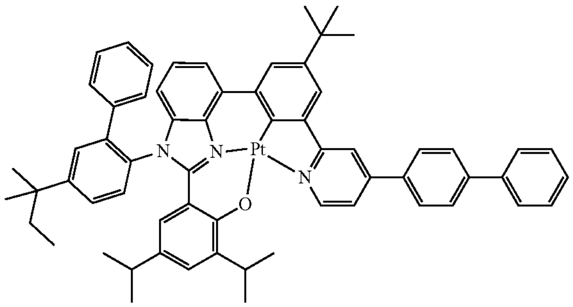
2428
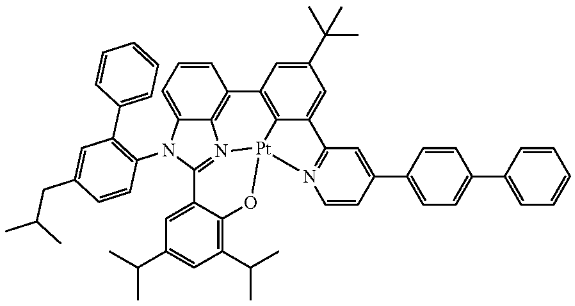
2429
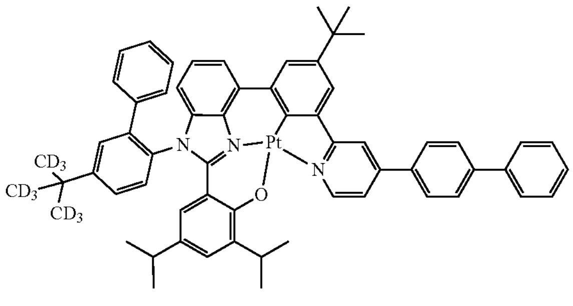

-continued
2430
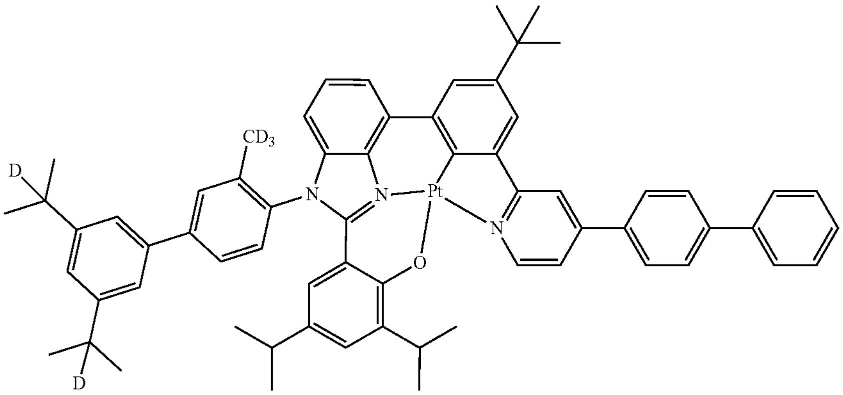
2431
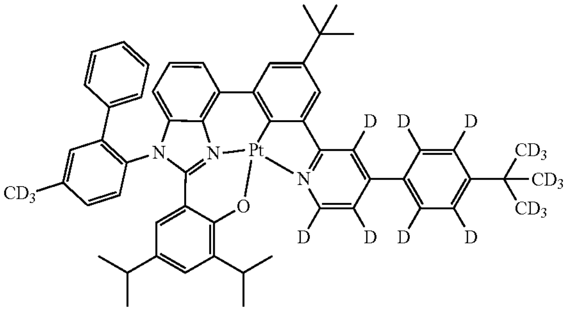
2432
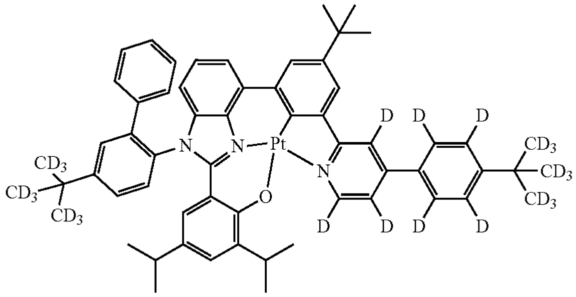
2433
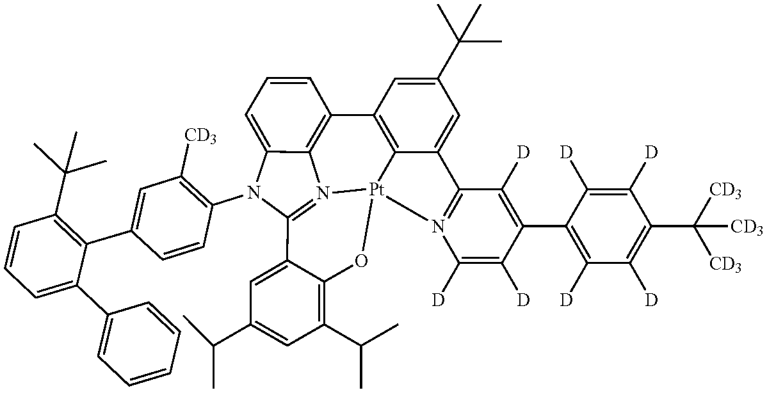
2434
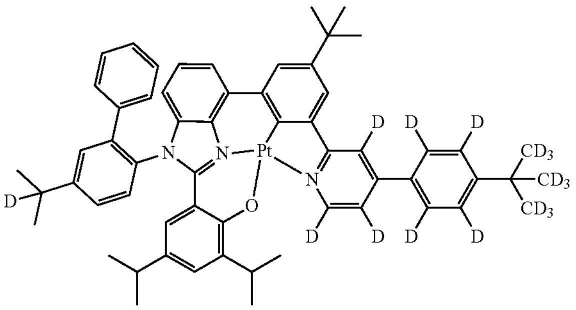
2435
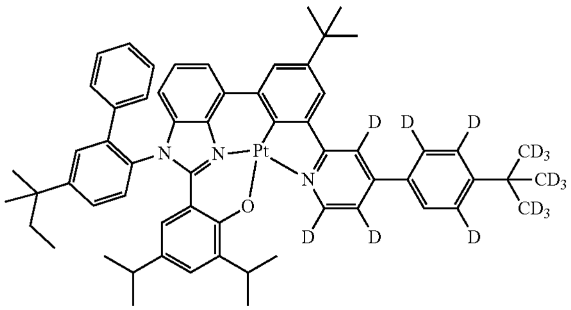

-continued
2436
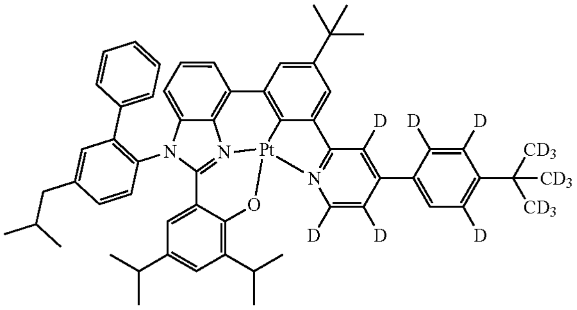
2437
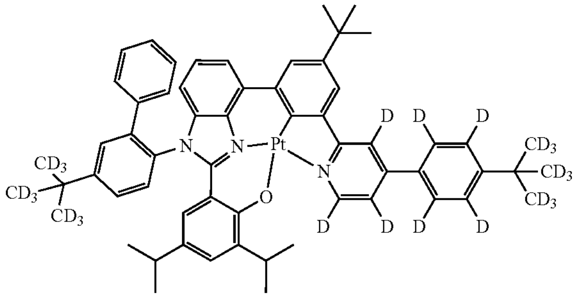
2438
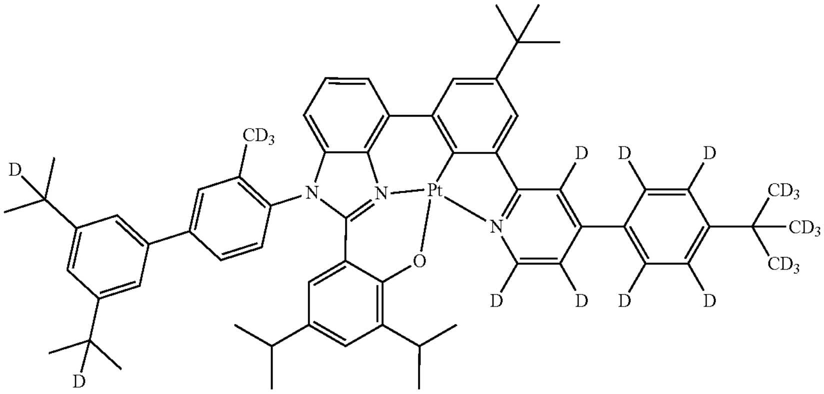
2439
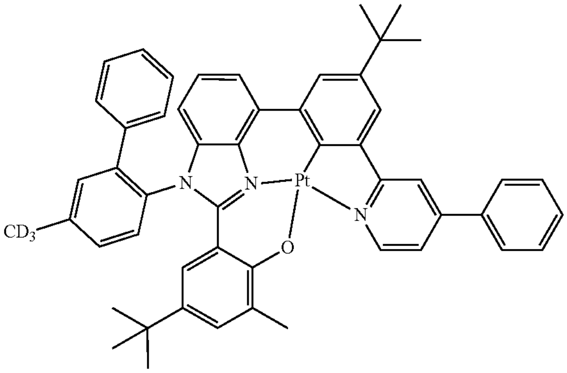
2440
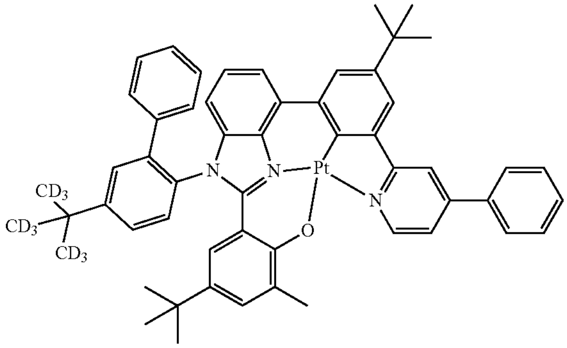
2441
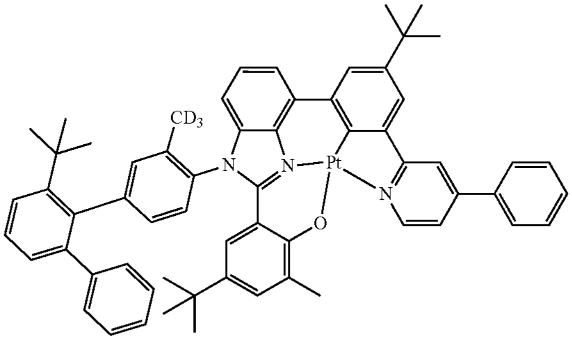
2442
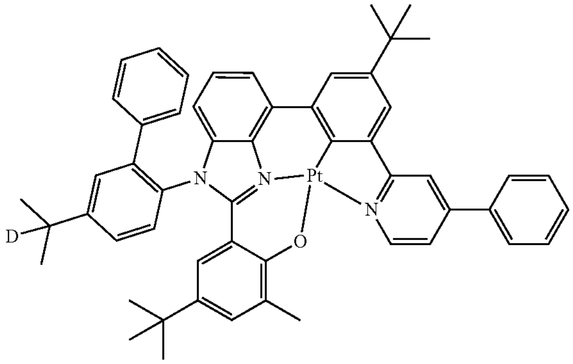

-continued
2443
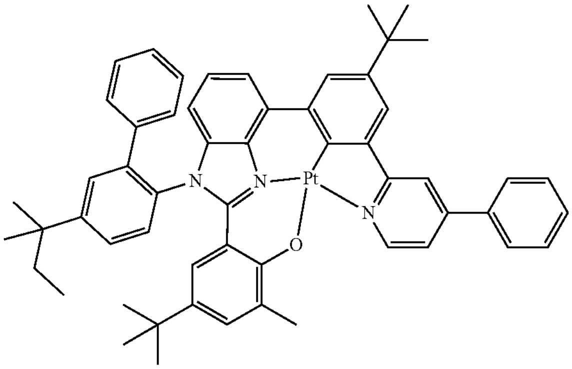
2444
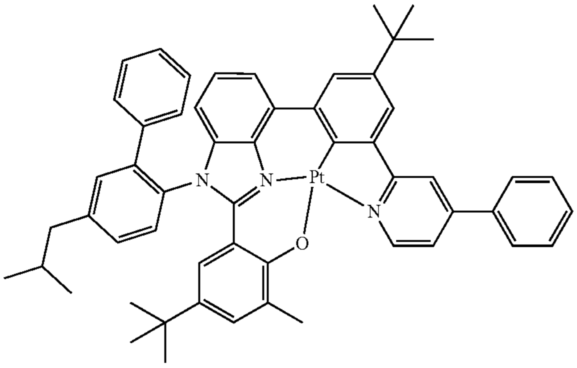
2445
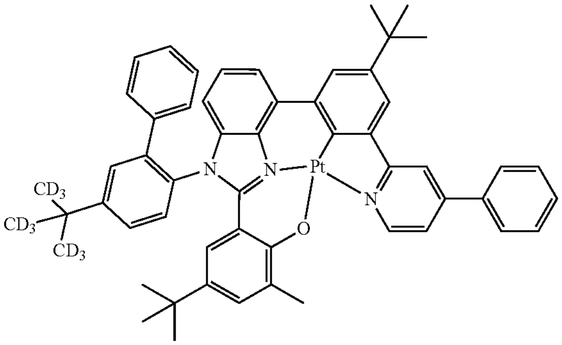
2446
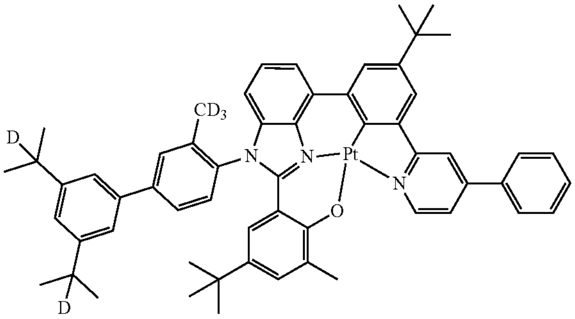
2447
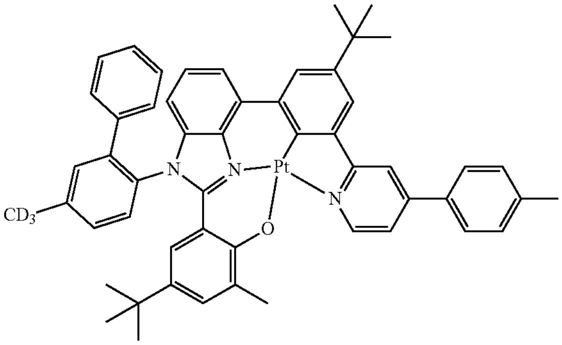
2448
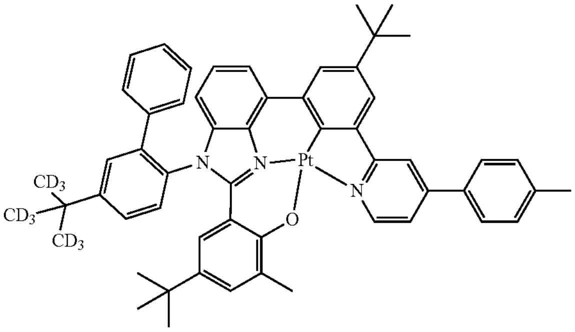
2449
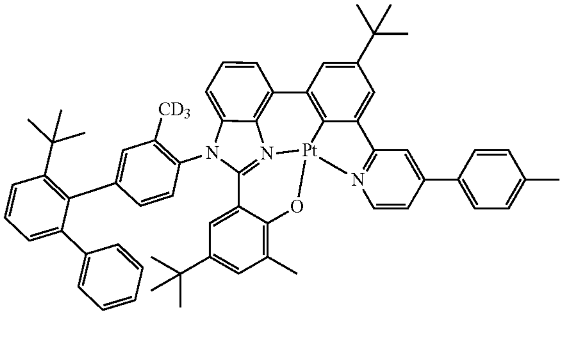
2450
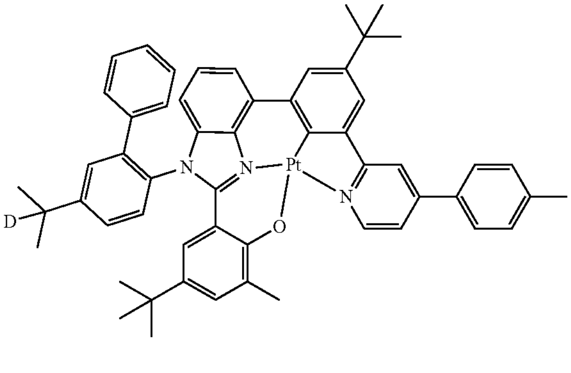

-continued
2451
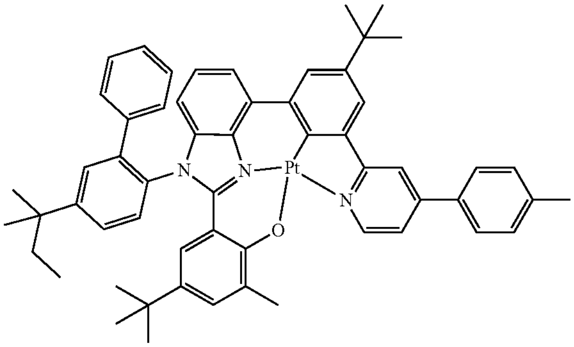
2452
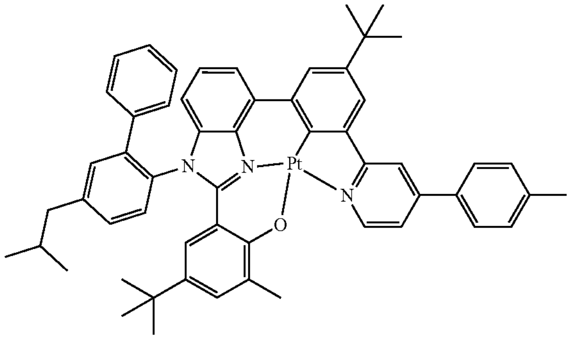
2453
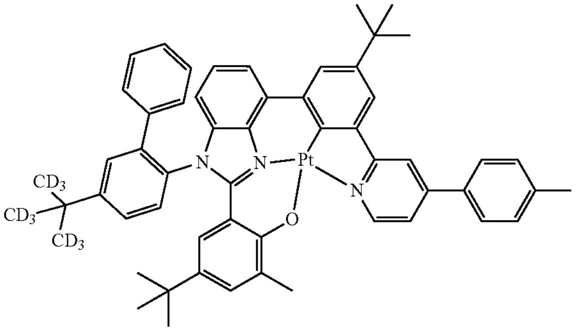
2454
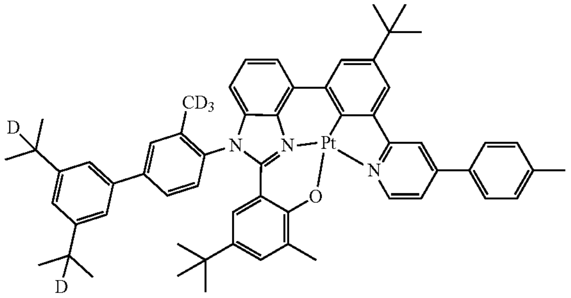
2455
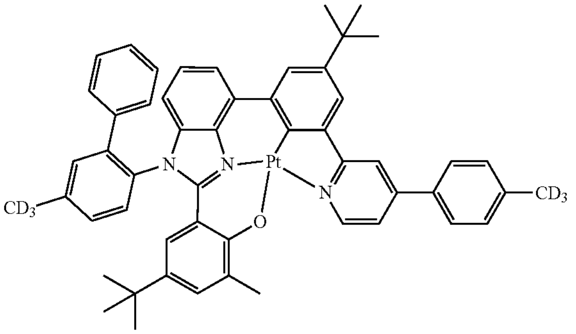
2456
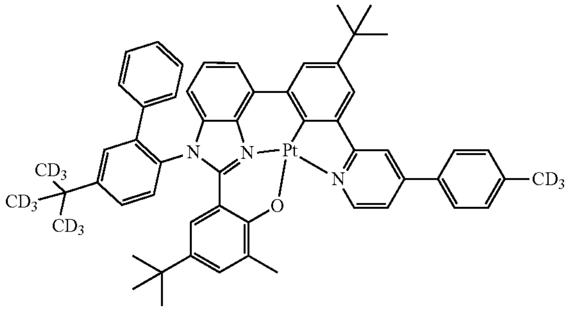
2457
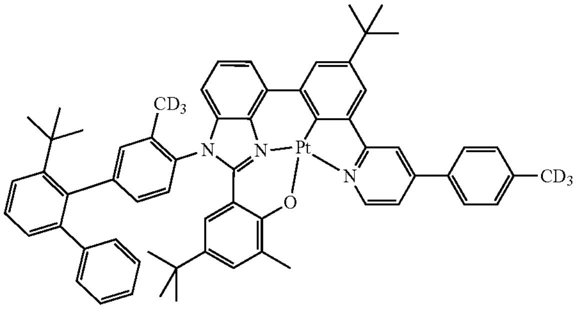
2458
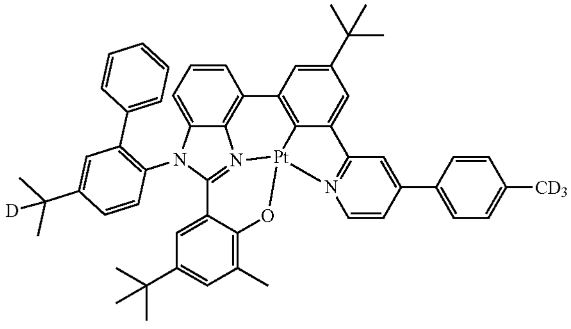

-continued
2459
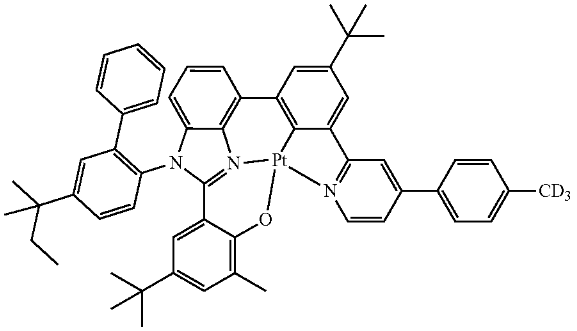
2460
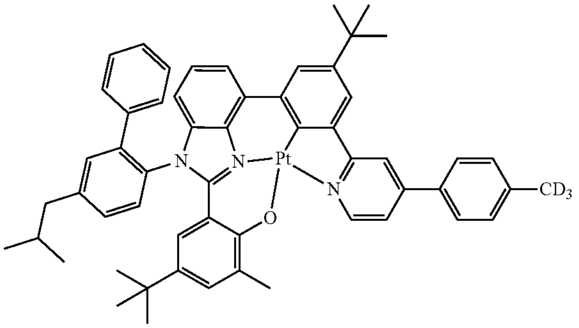
2461
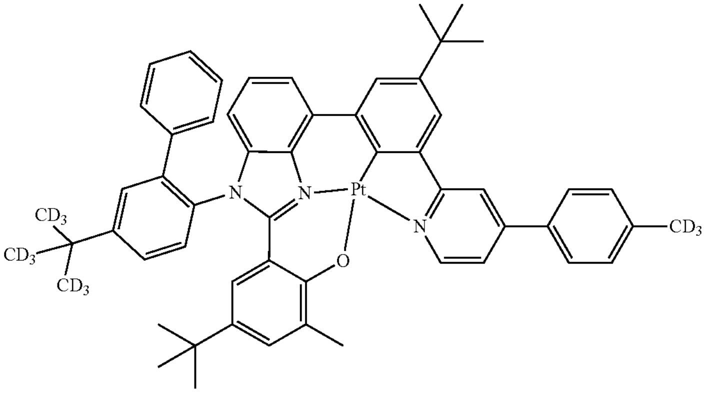
2462
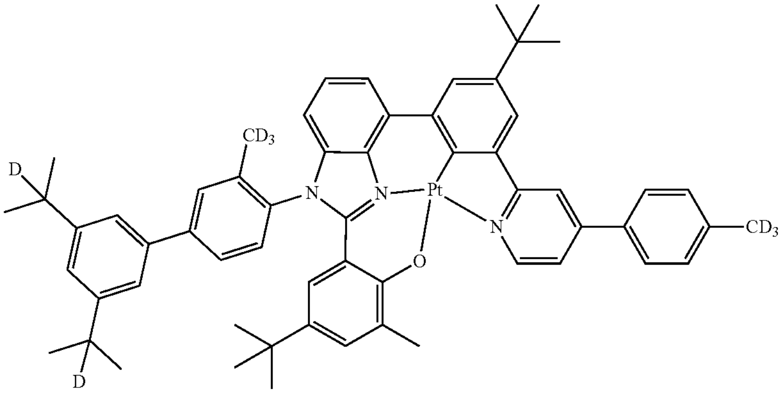
2463
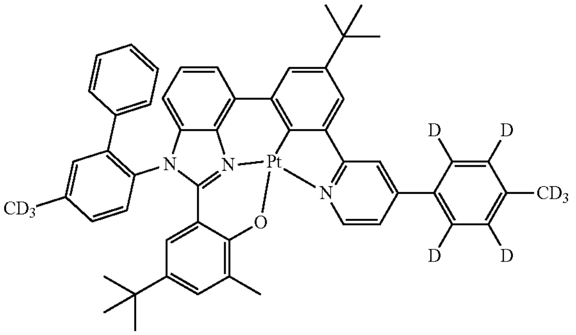
2464
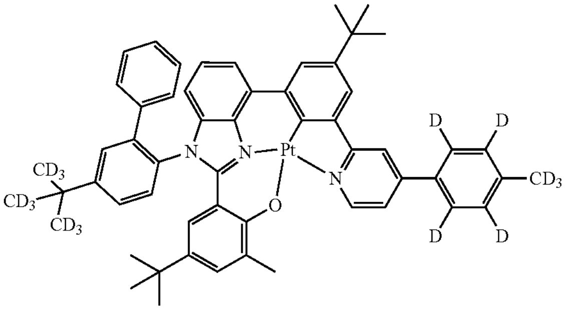

-continued
2465
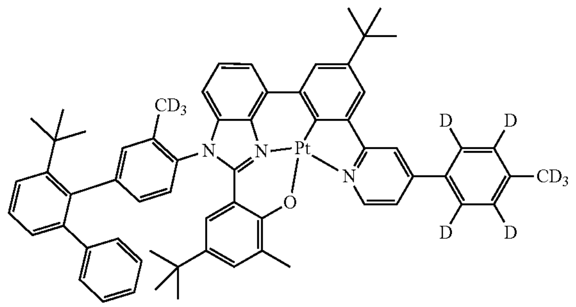
2466
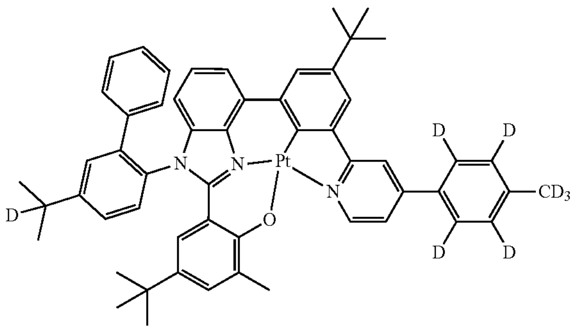
2467
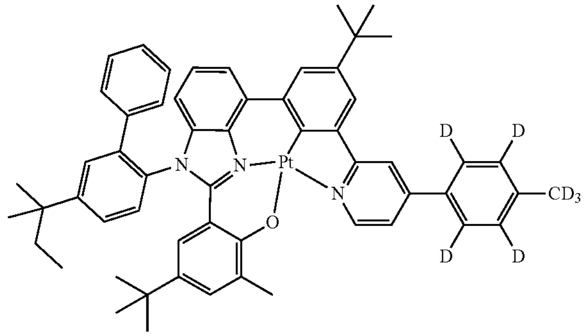
2468
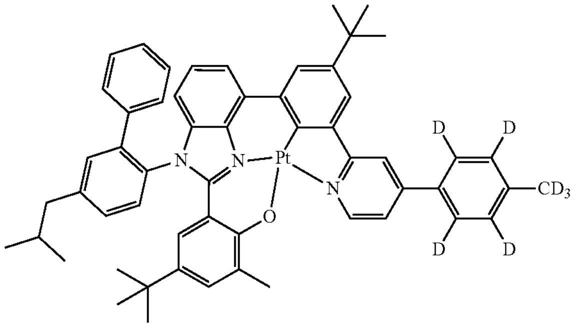
2469
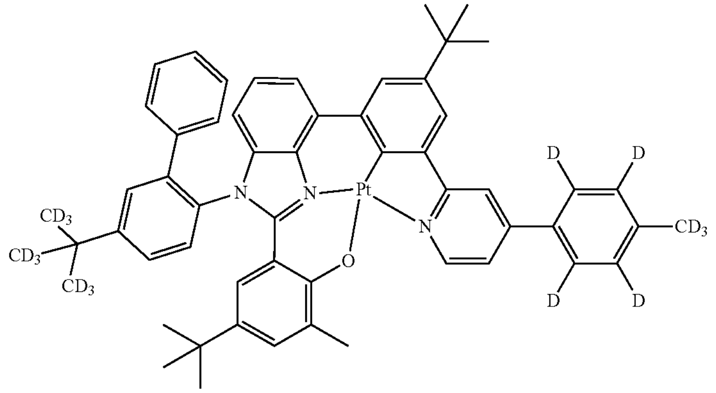
2470
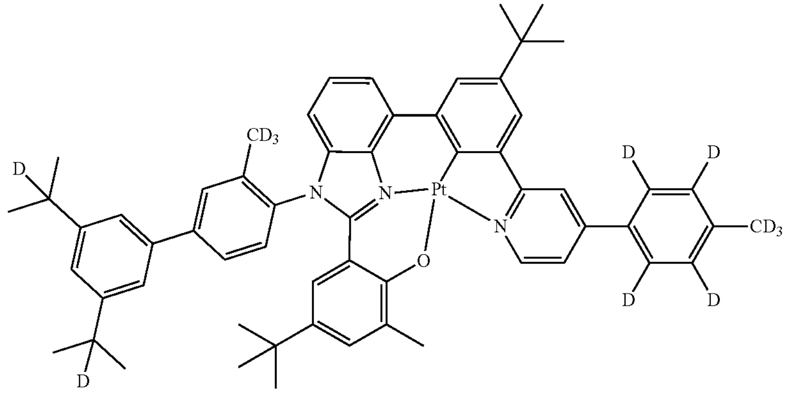

-continued
2471
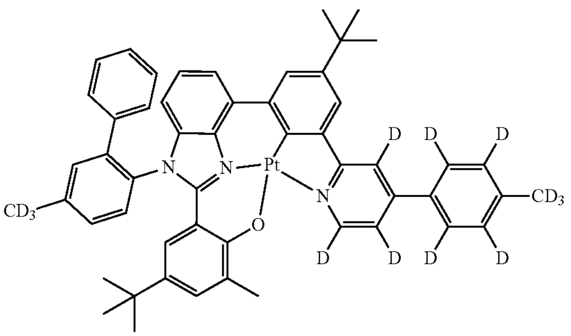
2472
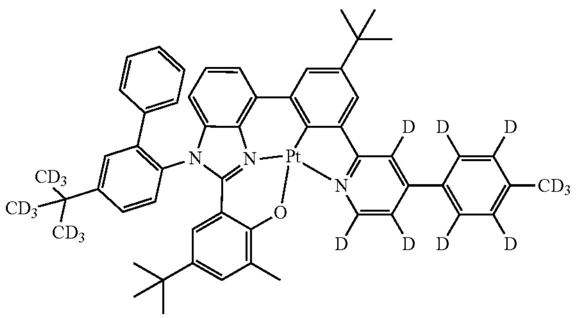
2473
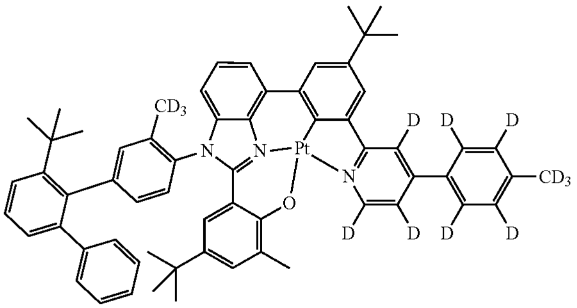
2474
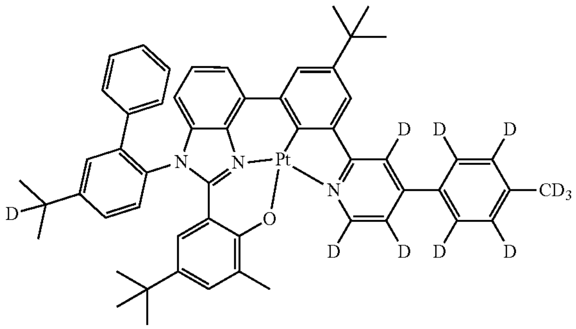
2475
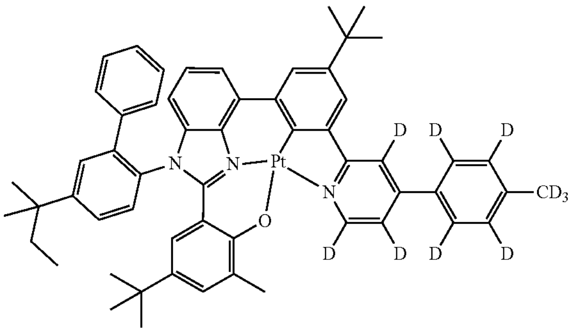
2476
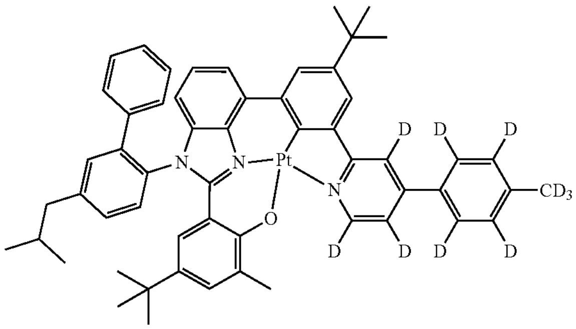
2477
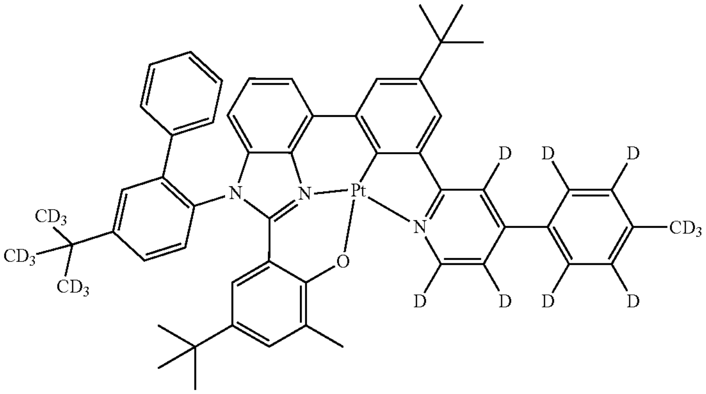

-continued
2478
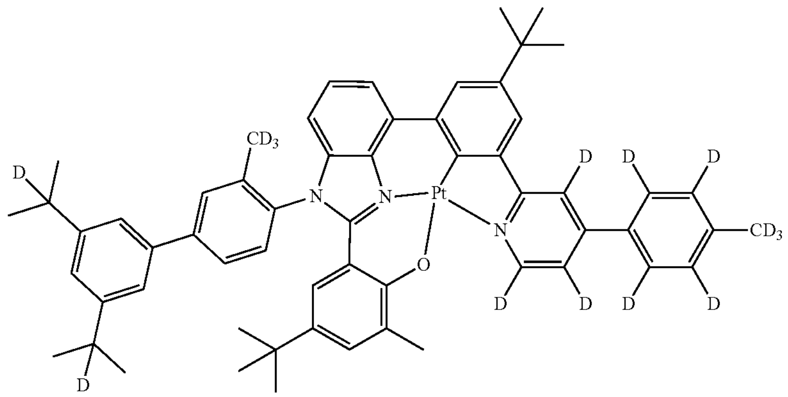
2479
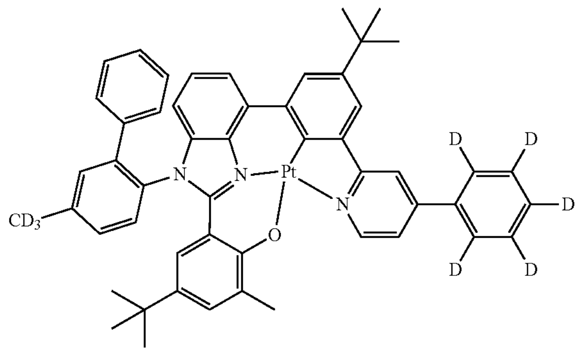
2480
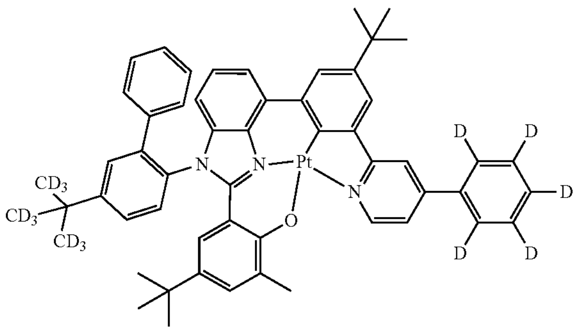
2481
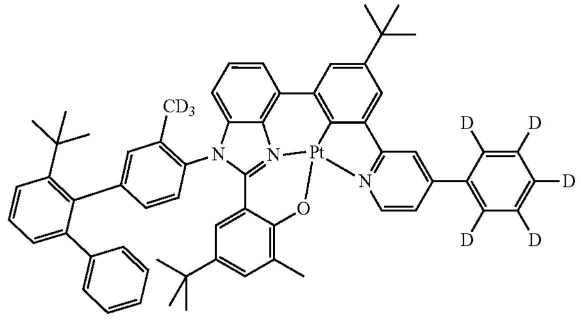
2482
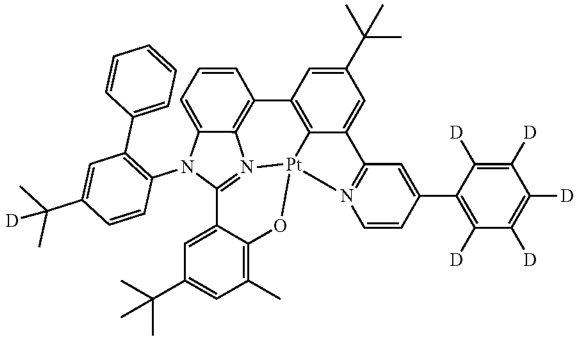
2483
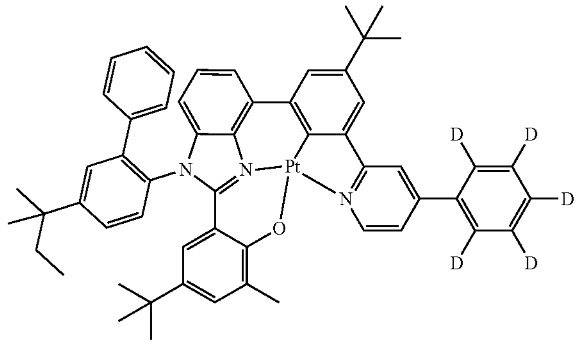
2484
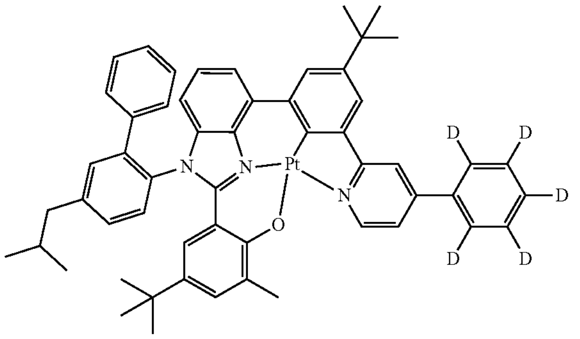

-continued
2485
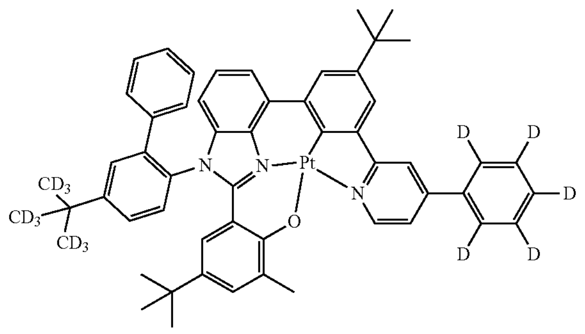
2486
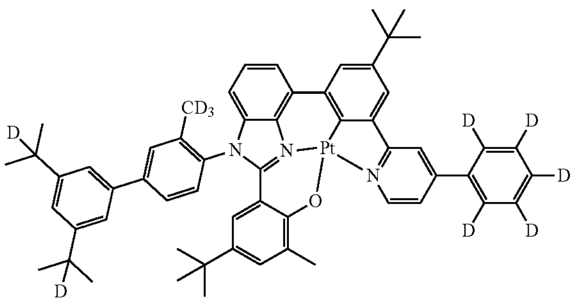
2487
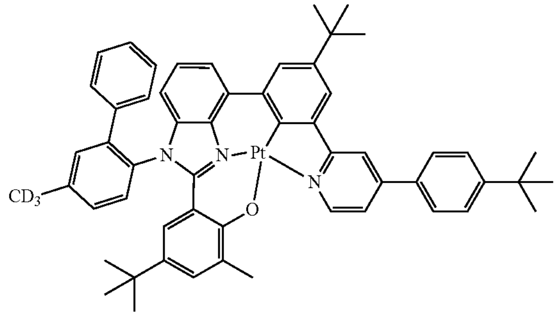
2488
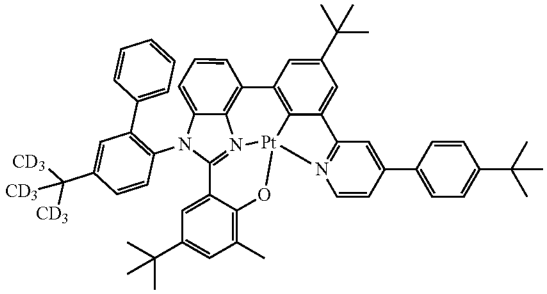
2489
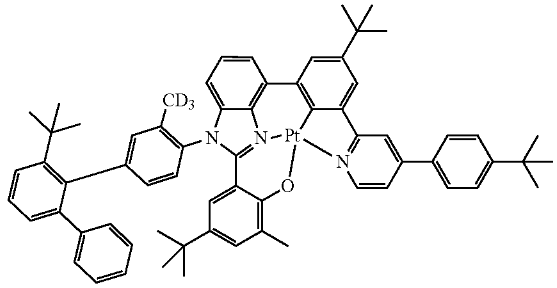
2490
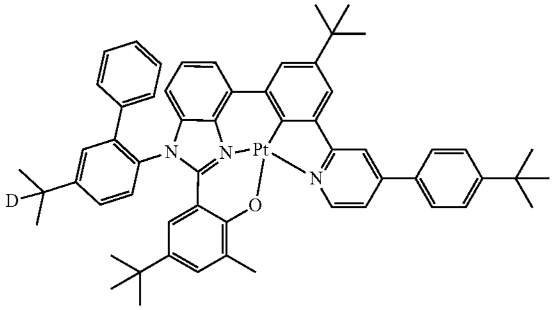
2491
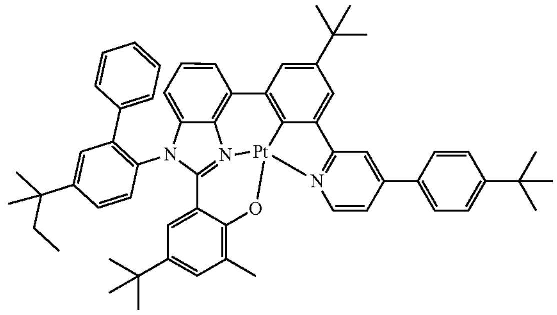
2492
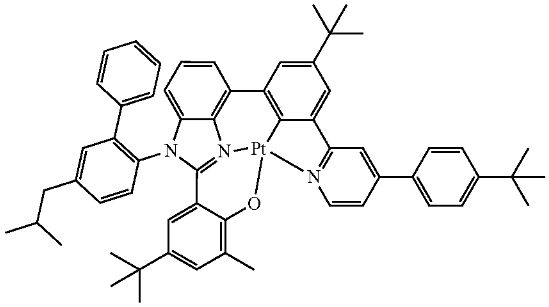

-continued
2493
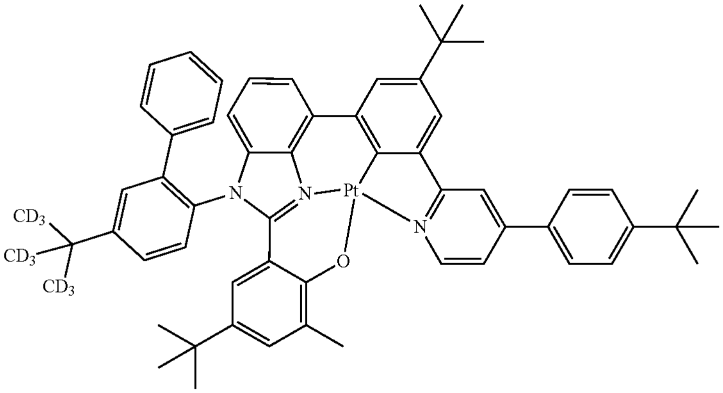
2494
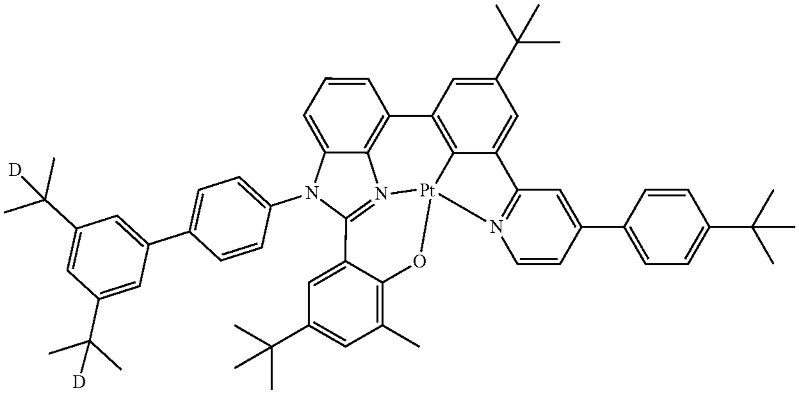
2495
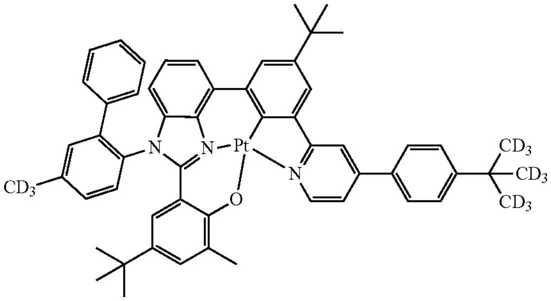
2496
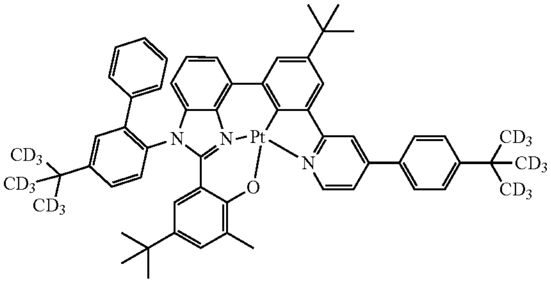
2497
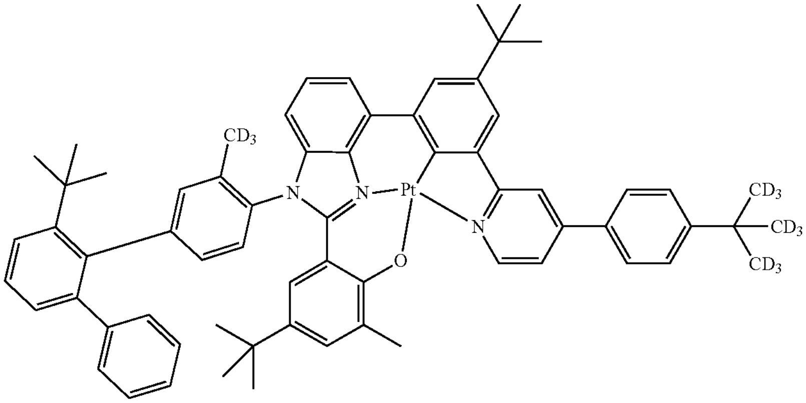

-continued
2498
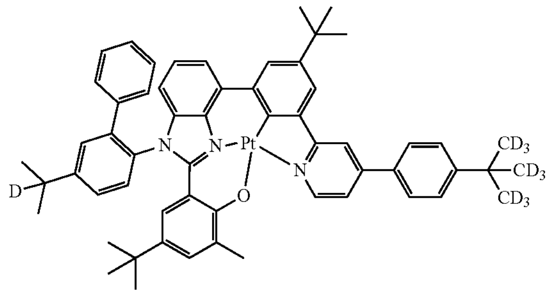
2499
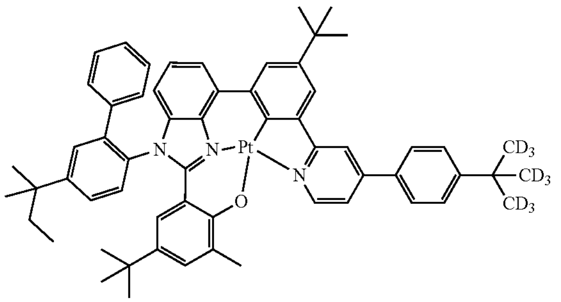
2500
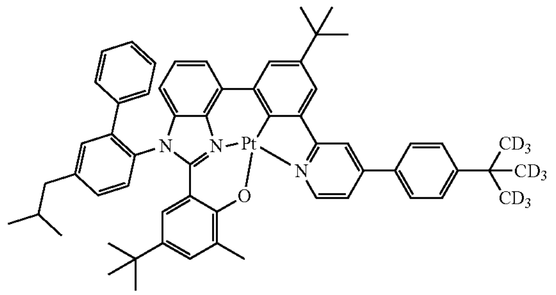
2501
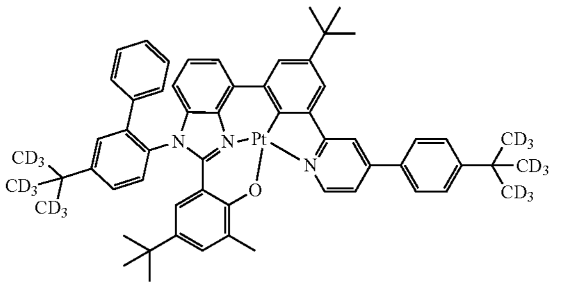
2502
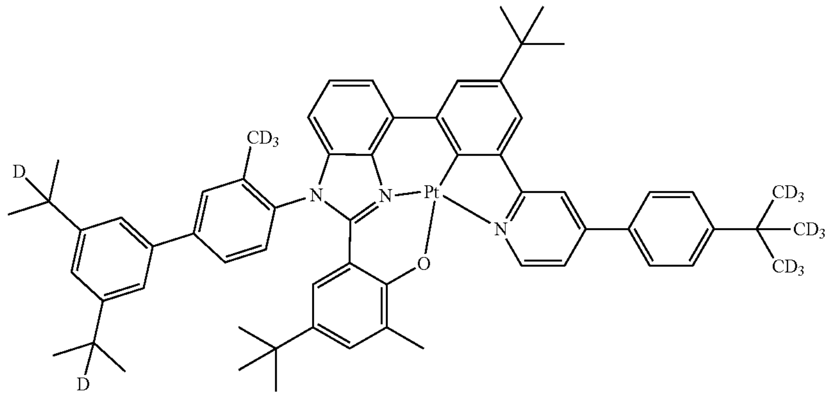
2503
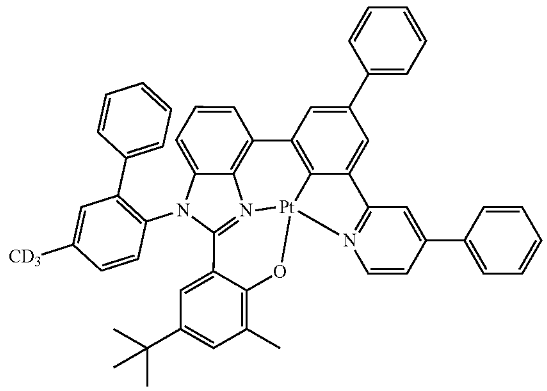
2504
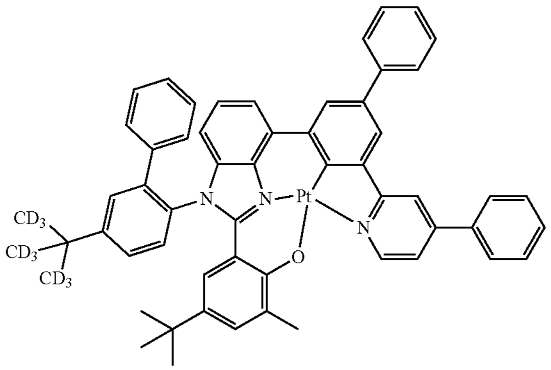

-continued
2505
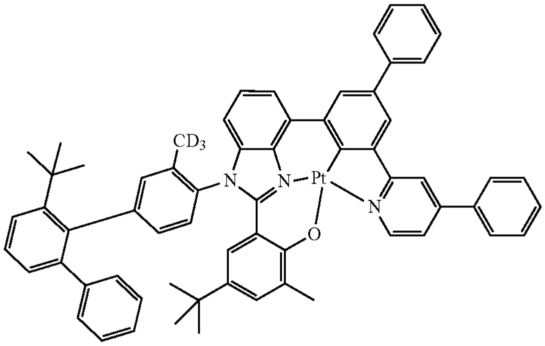
2506
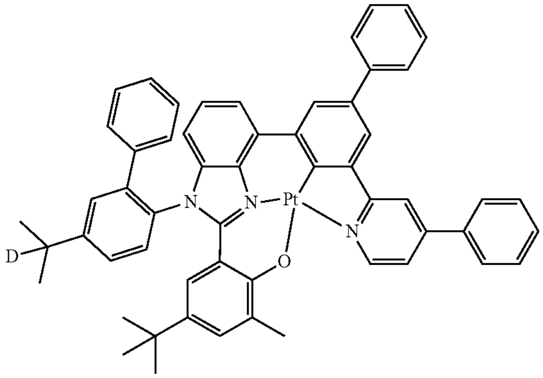
2507
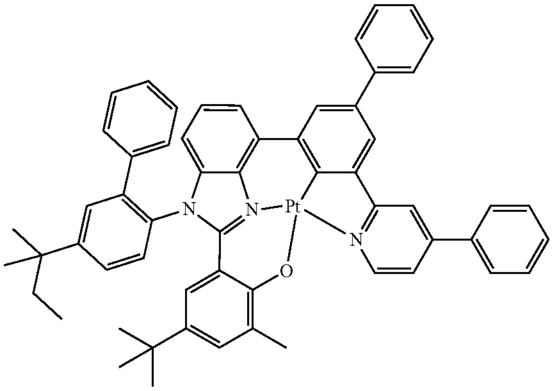
2508
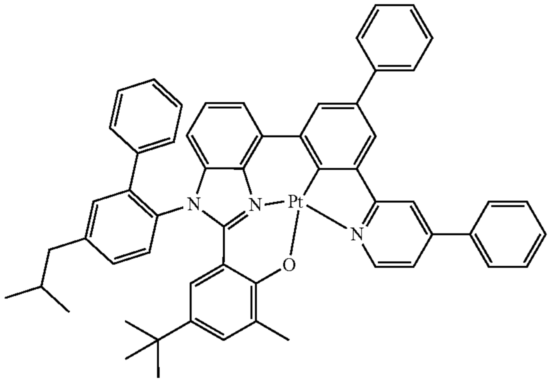
2509
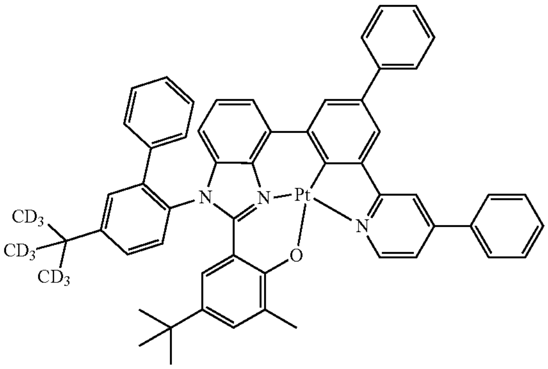
2510
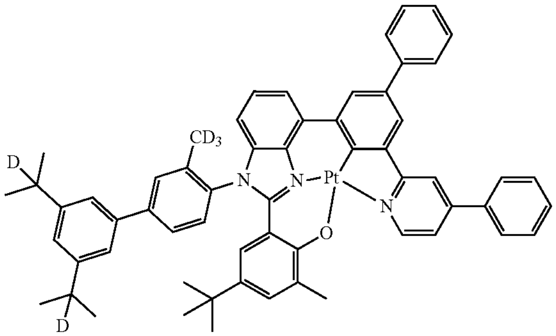
2511
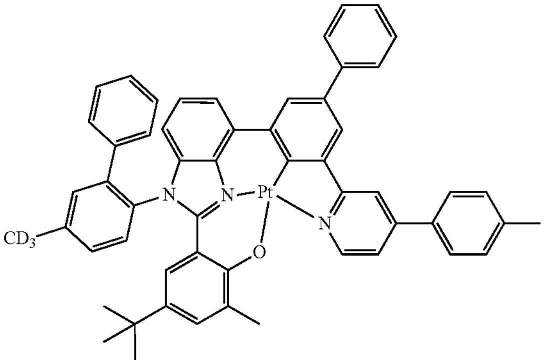
2512
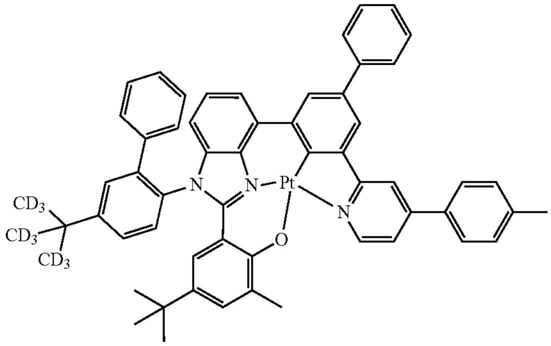

-continued
2513
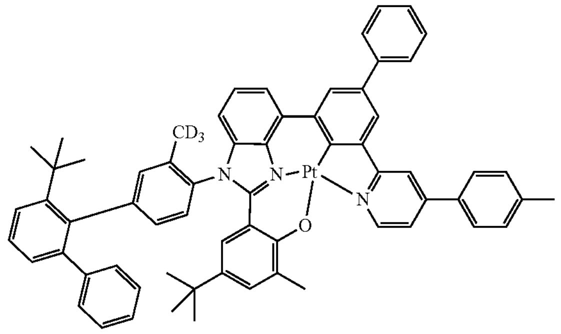
2514
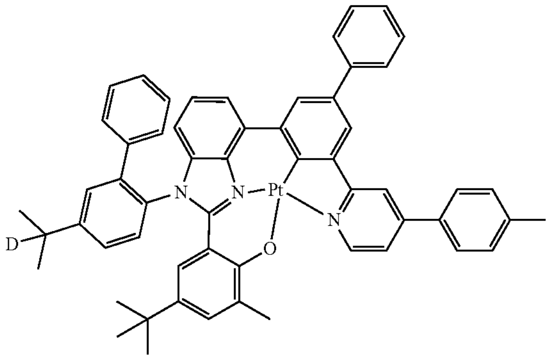
2515
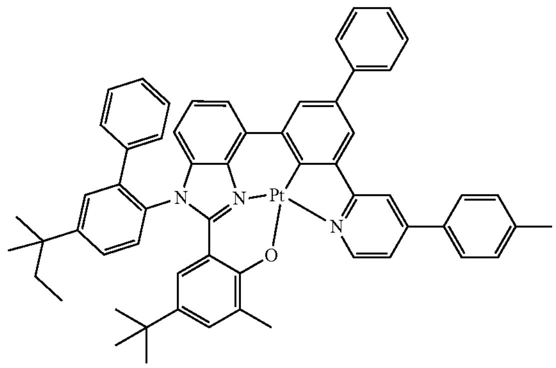
2516
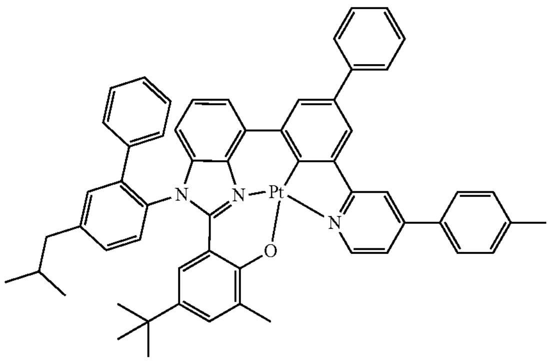
2517
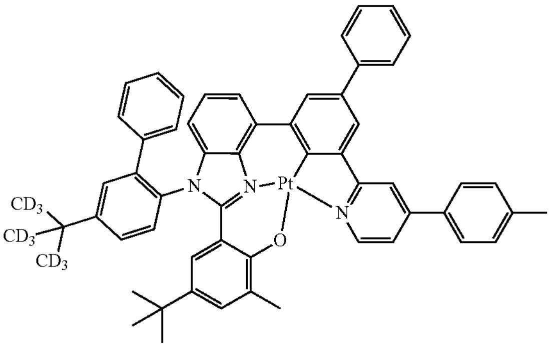
2518
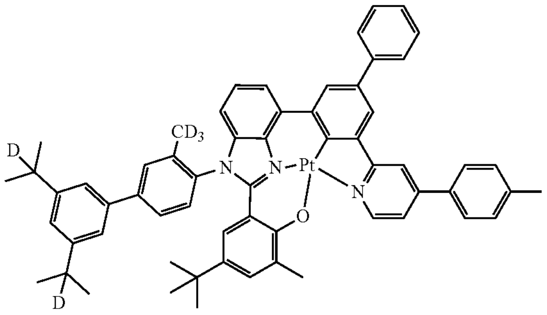
2519
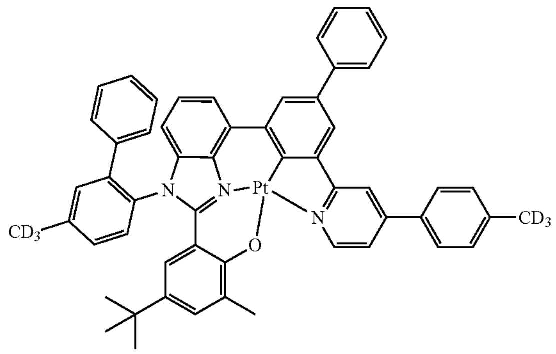
2520
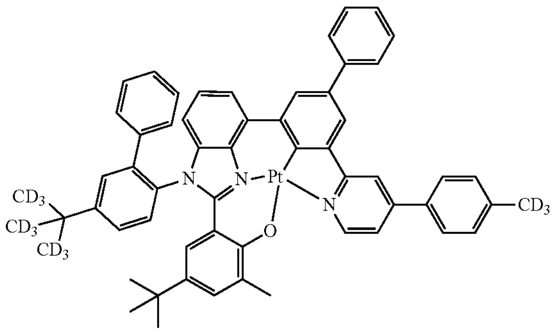

-continued
2521
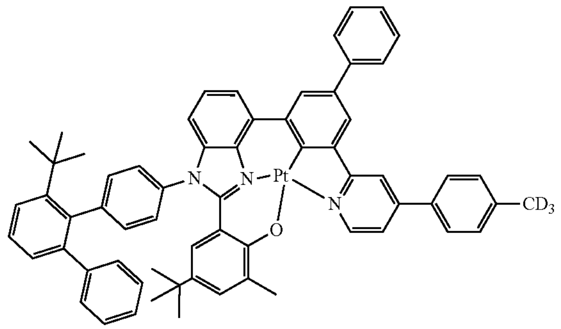
2522
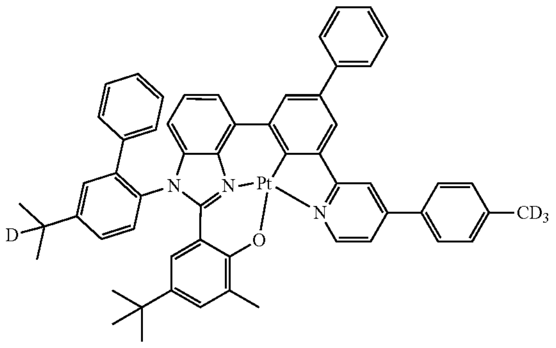
2523
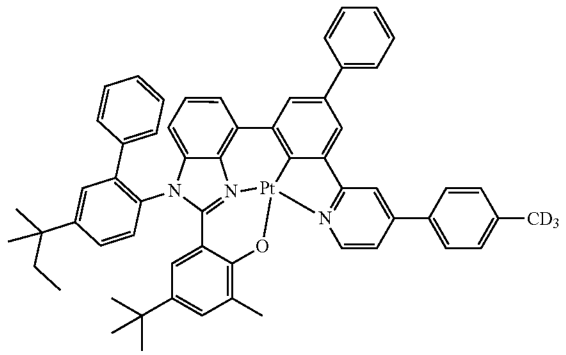
2524
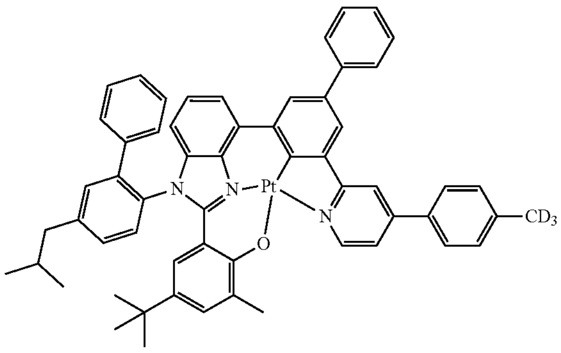
2525
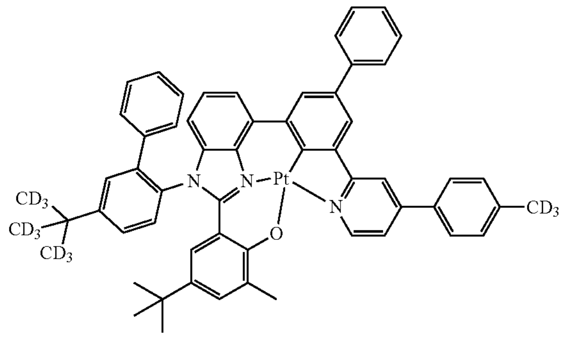
2526
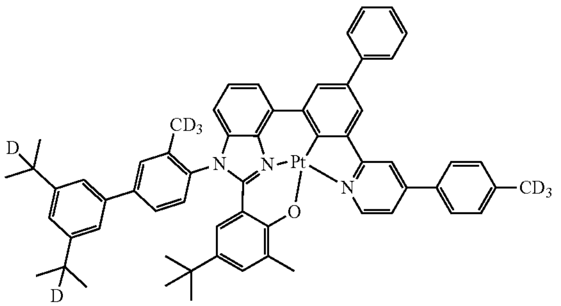
2527
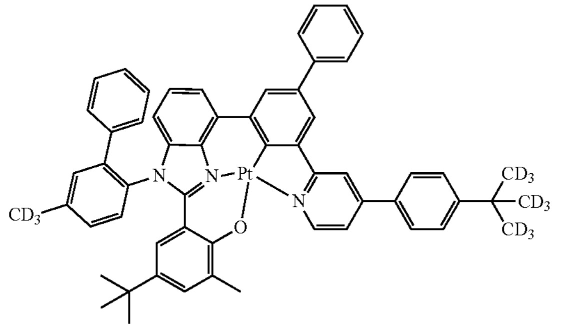
2528
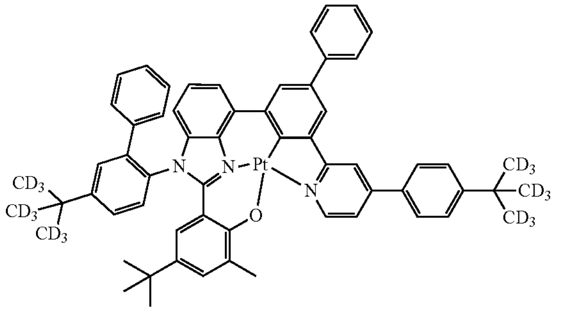

-continued
2529
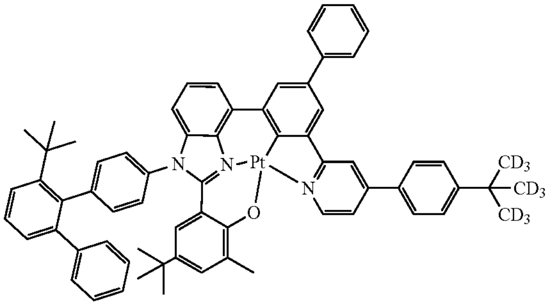
2530
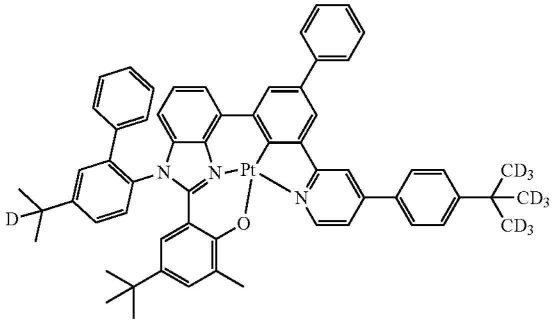
2531
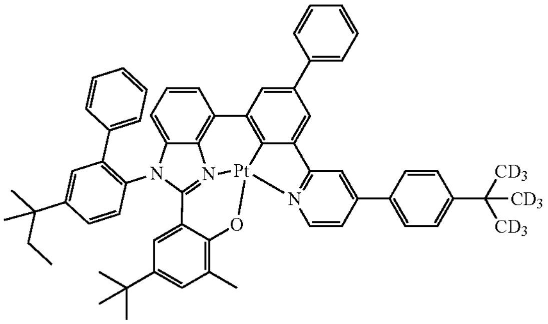
2532
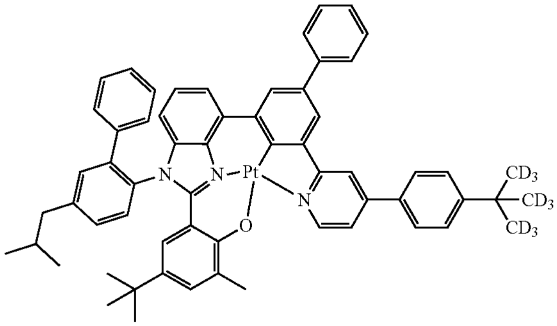
2533
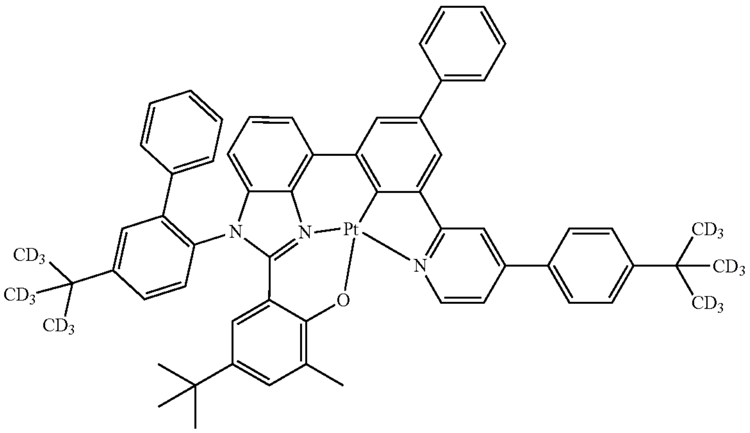
2534
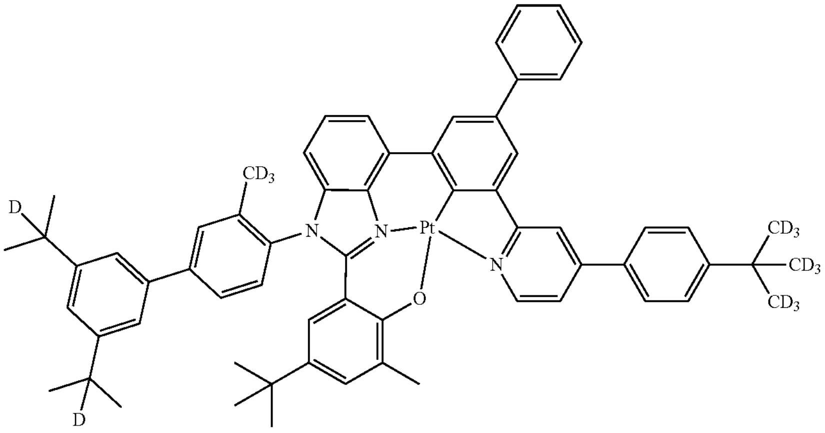

-continued
2535
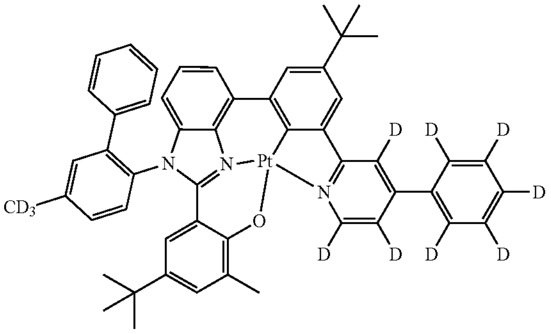
2536
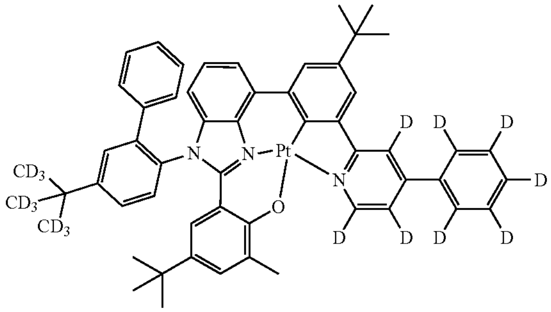
2537
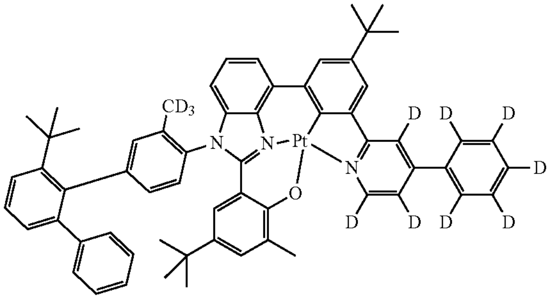
2538
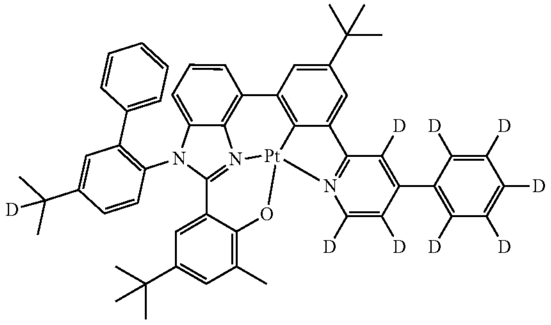
2539
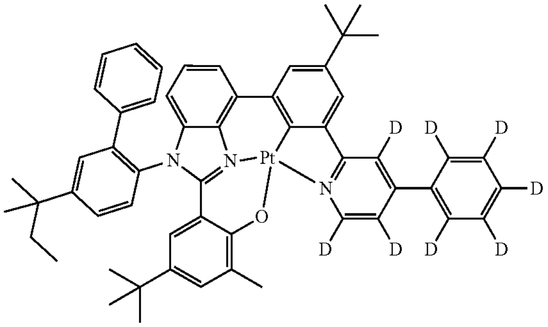
2540
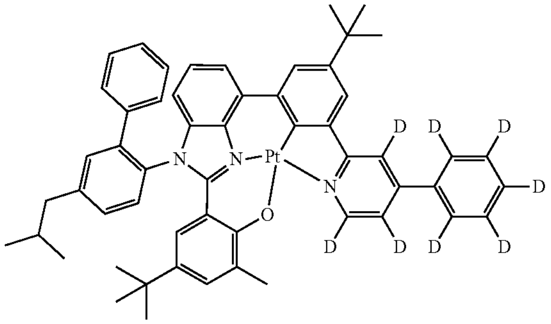
2541
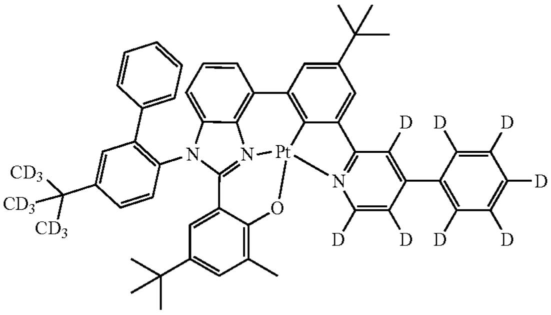
2542
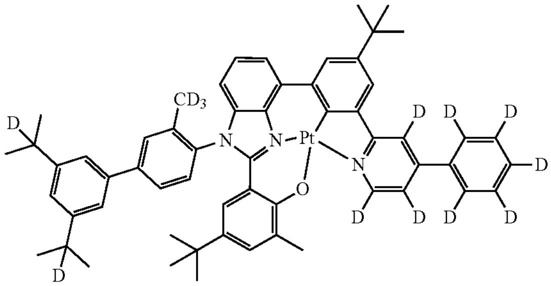

-continued
2543
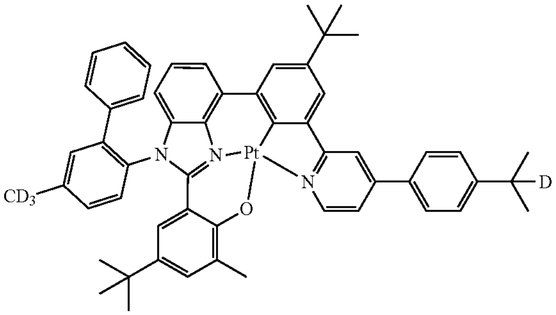
2544
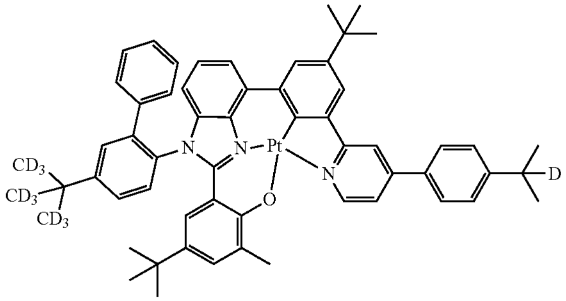
2545
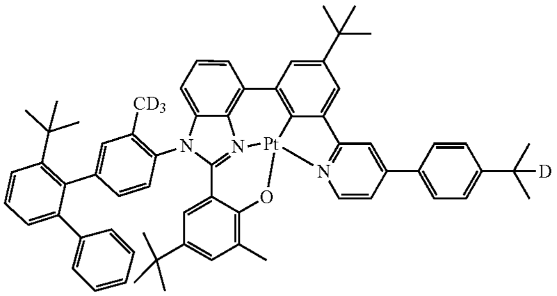
2546
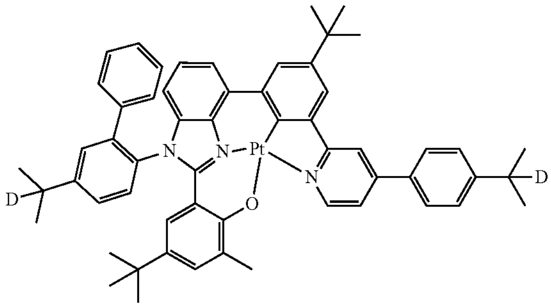
2547
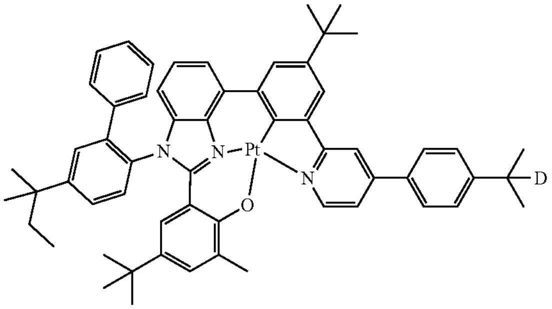
2548
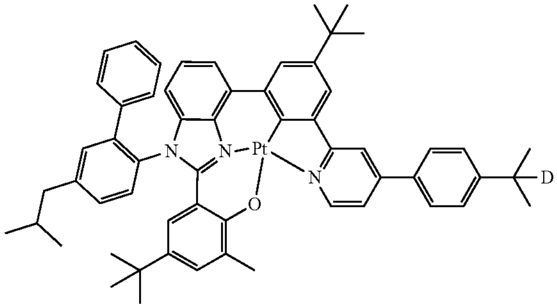
2549
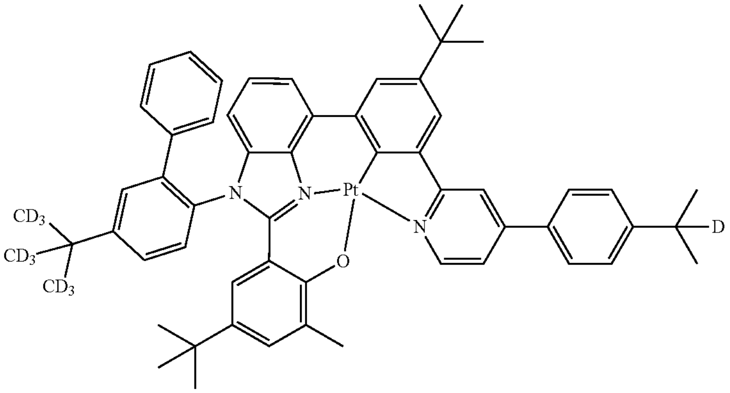

-continued
2550
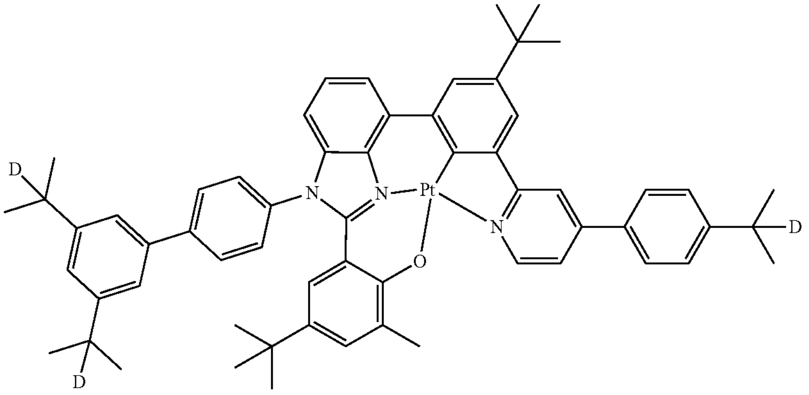
2551
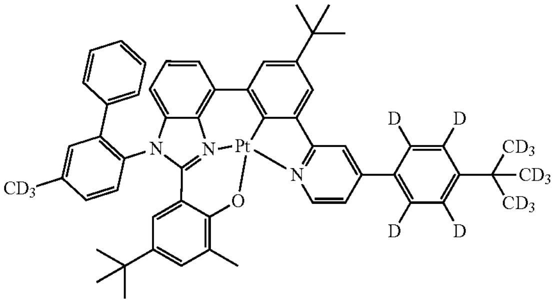
2552
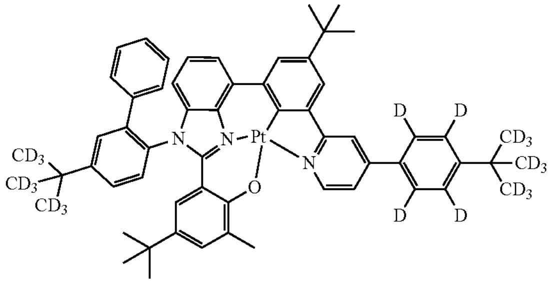
2553
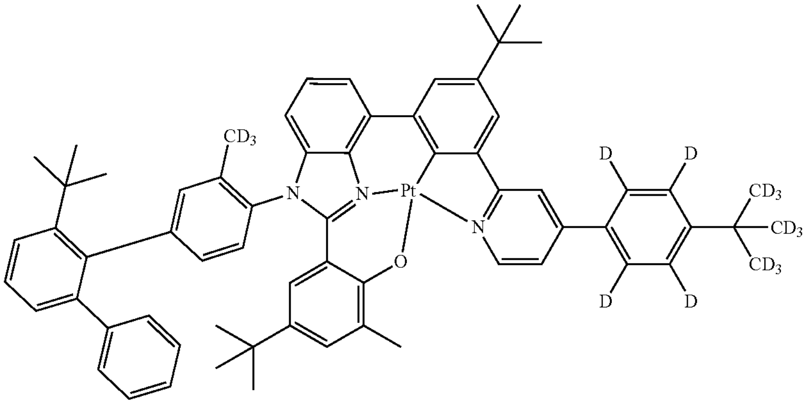
2554
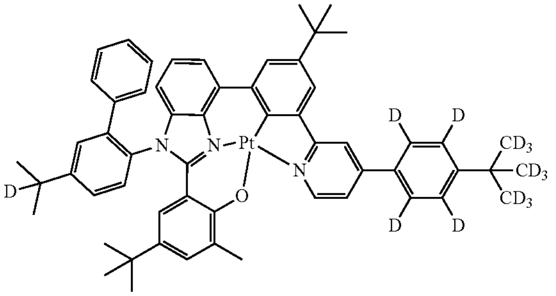
2555
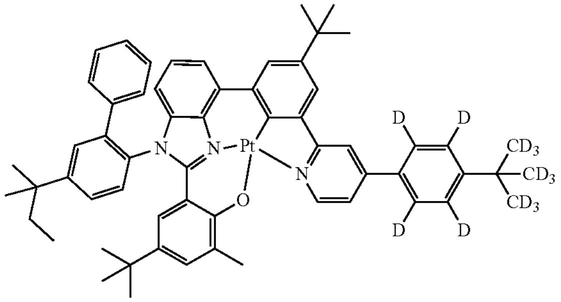

-continued
2556
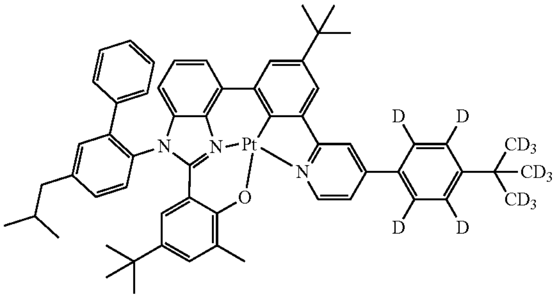
2557
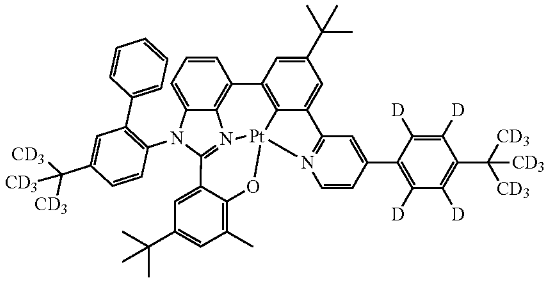
2558
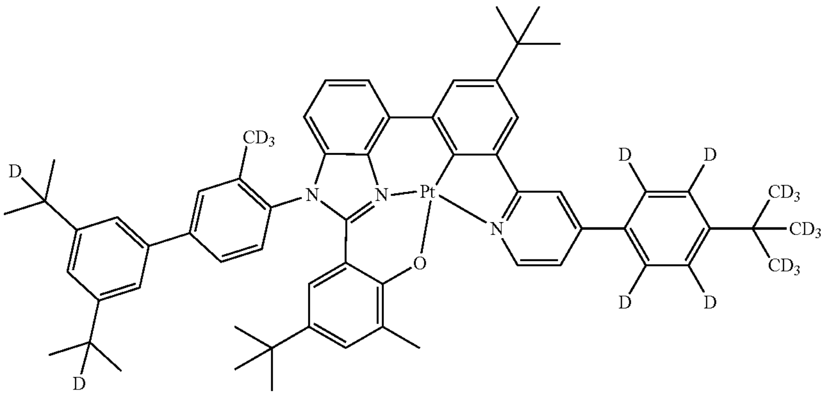
2559
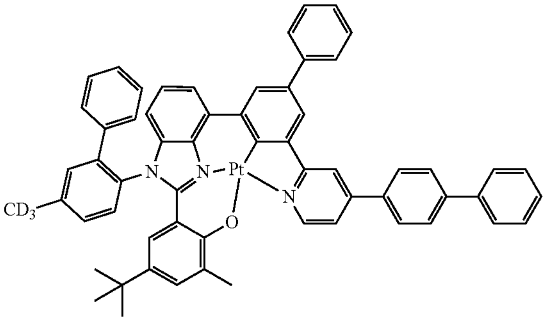
2560
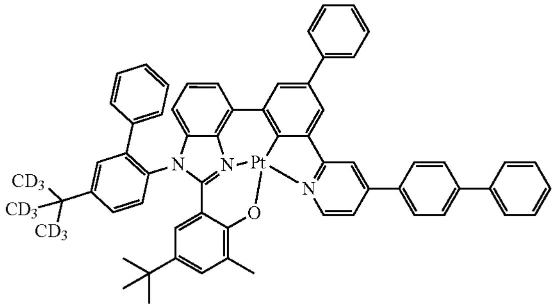
2561
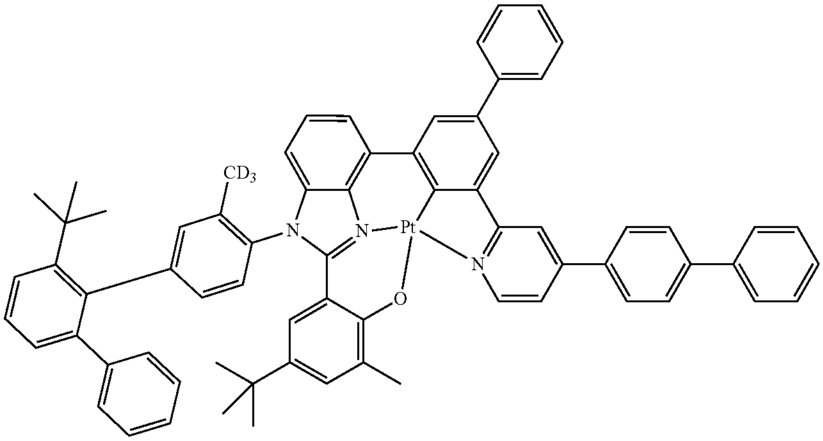

-continued
2562
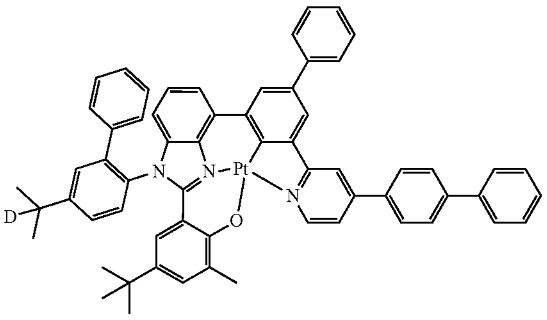
2563
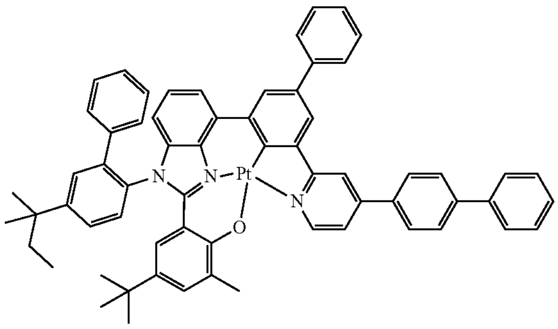
2564
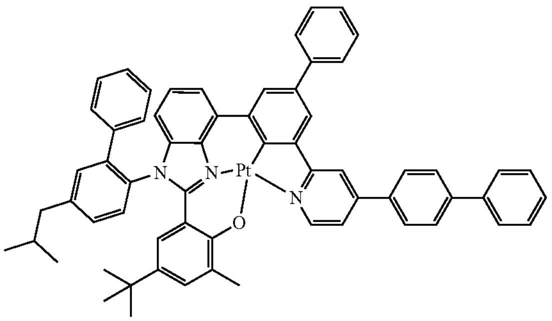
2565
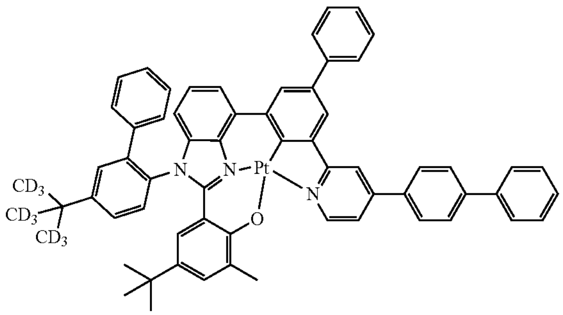
2566
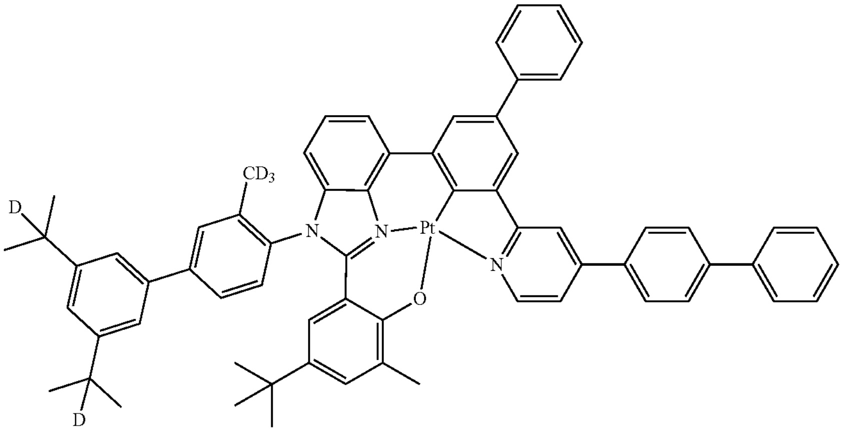
2567
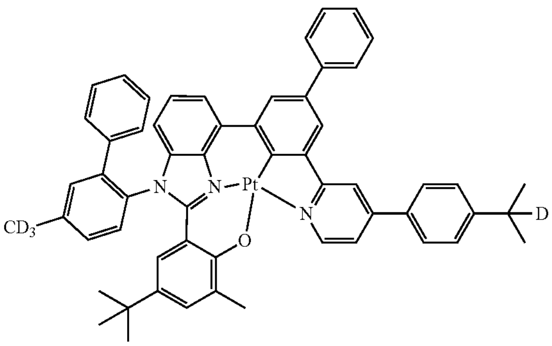
2568
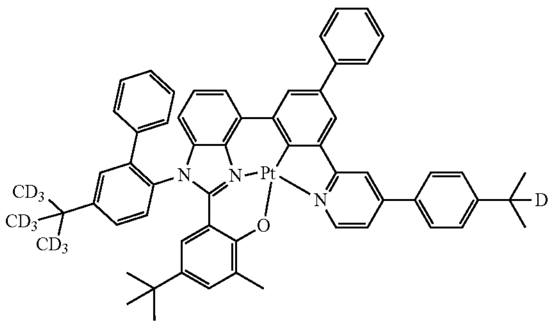

-continued
2569
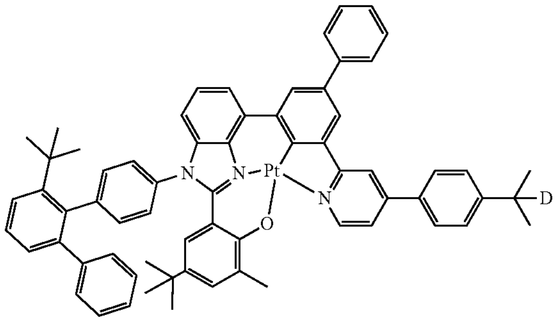
2570
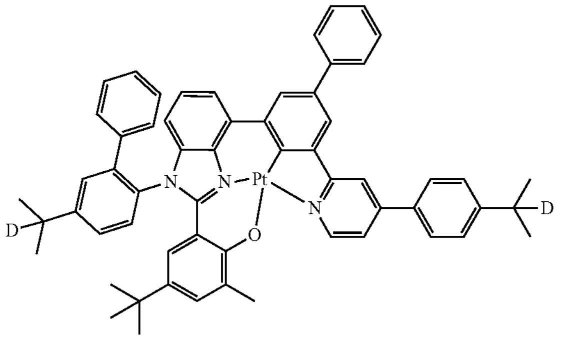
2571
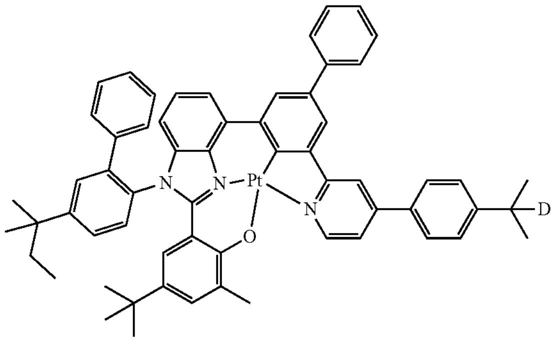
2572
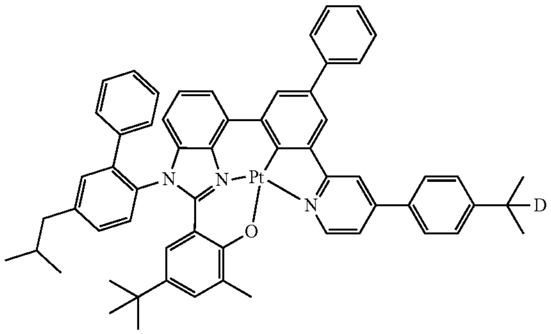
2573
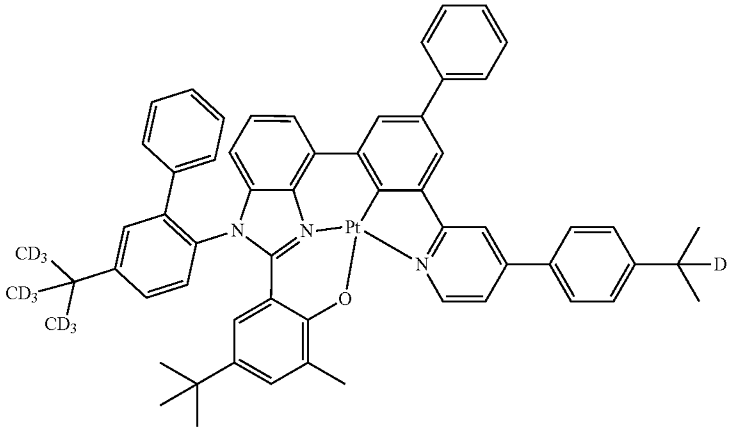
2574
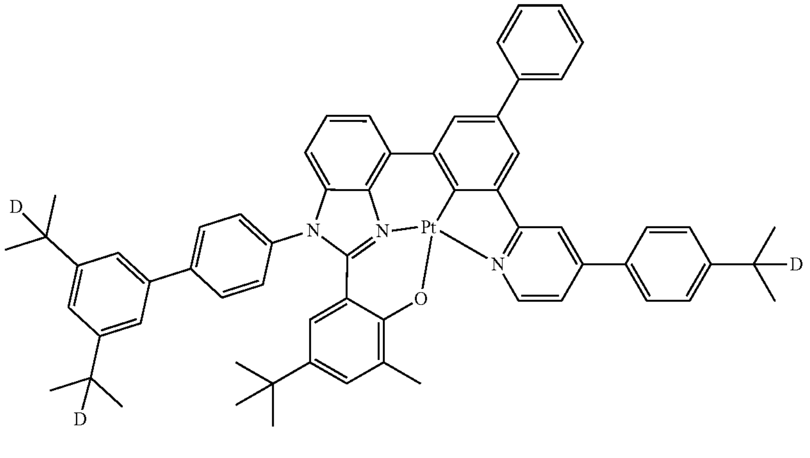

-continued
2575
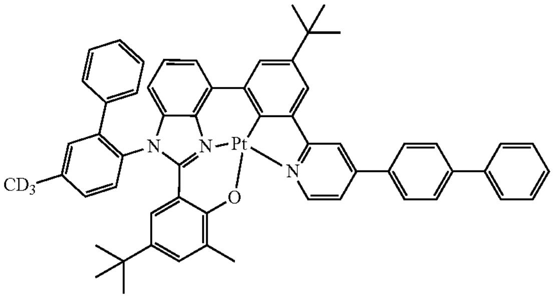
2576
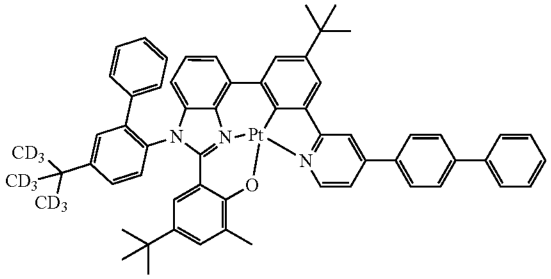
2577
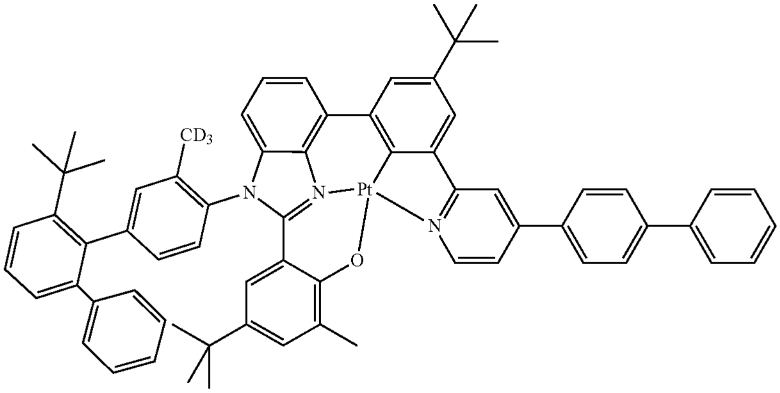
2578
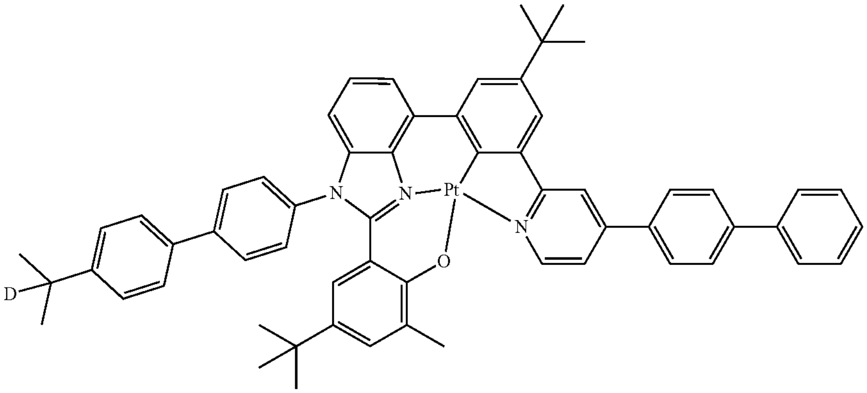
2579
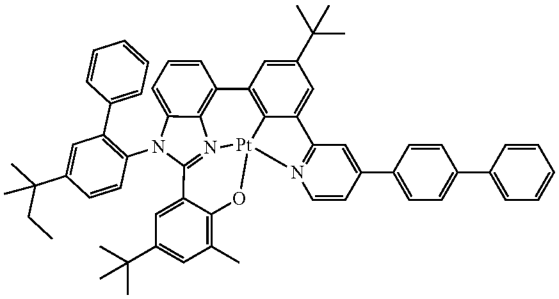
2580
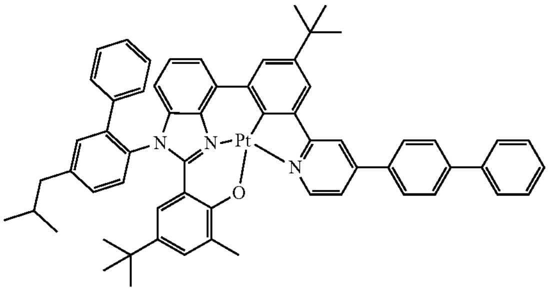

-continued
2581
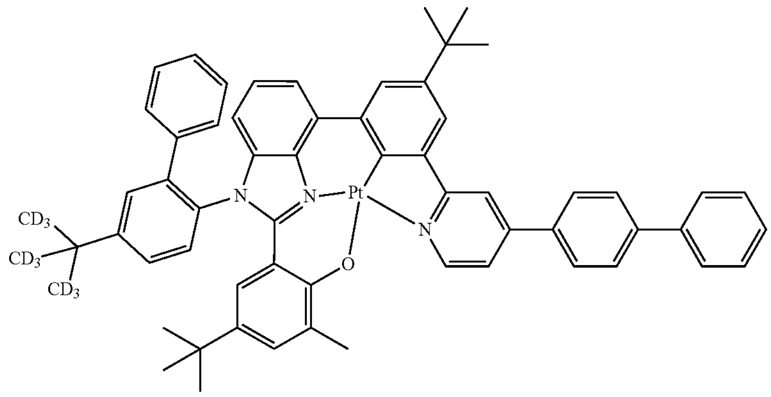
2582
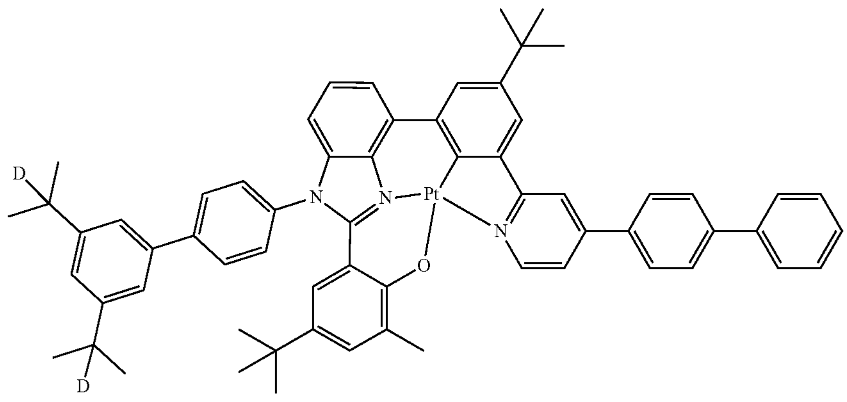
2583
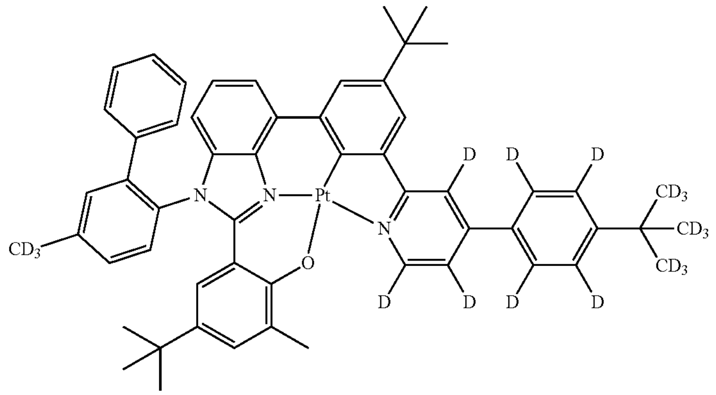

-continued
2584
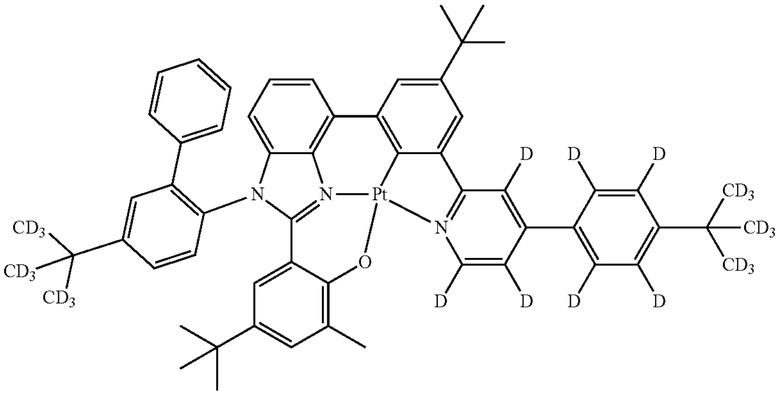
2585
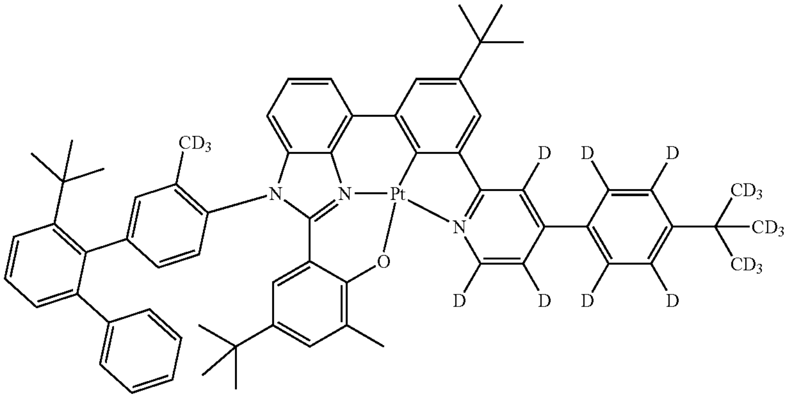
2586
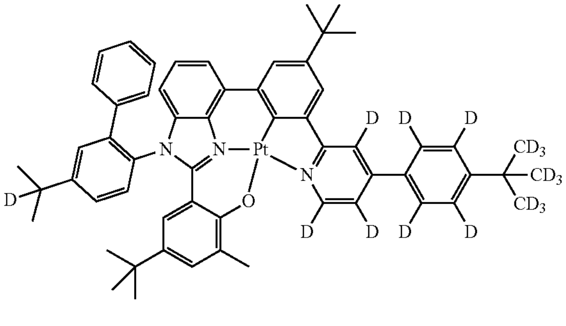
2587
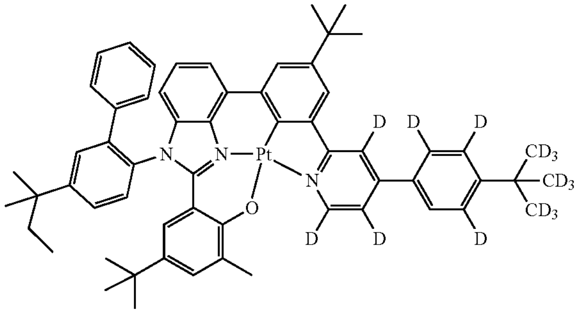
2588
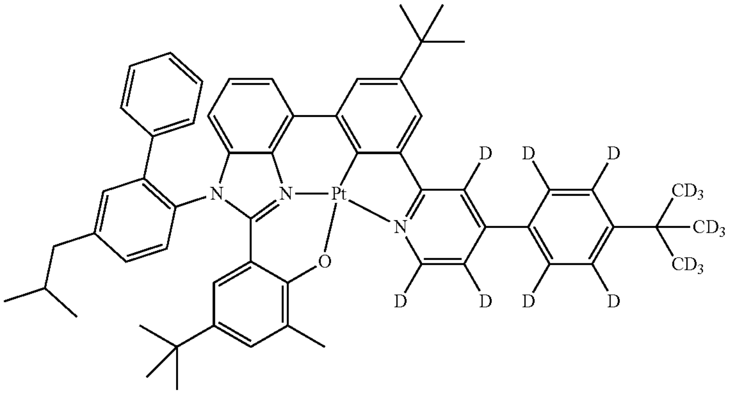

-continued
2589
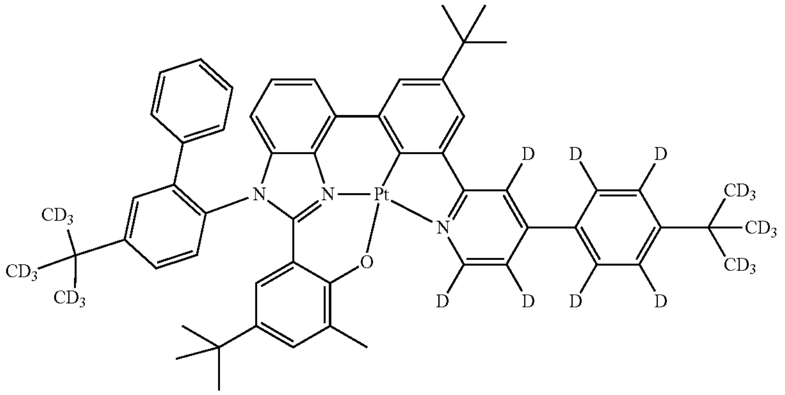
2590
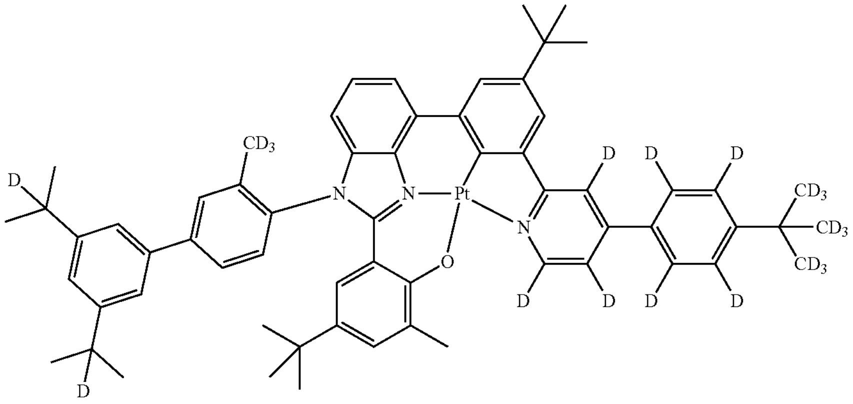
2591
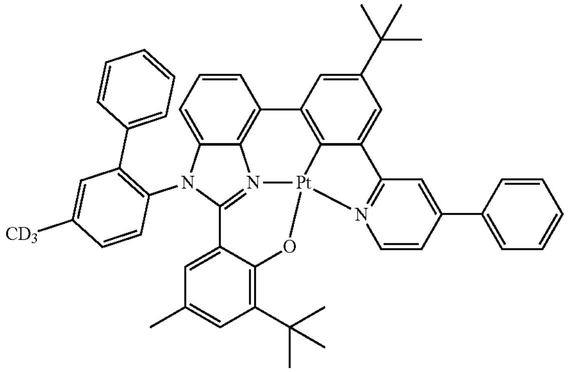
2592
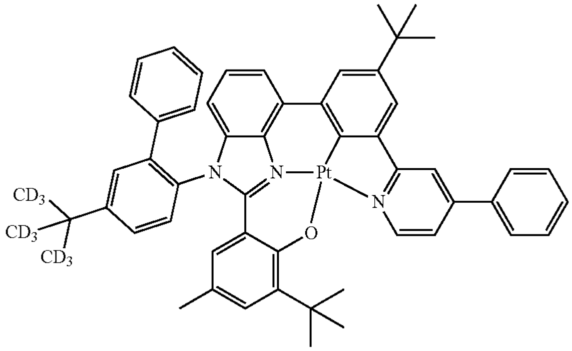
2593
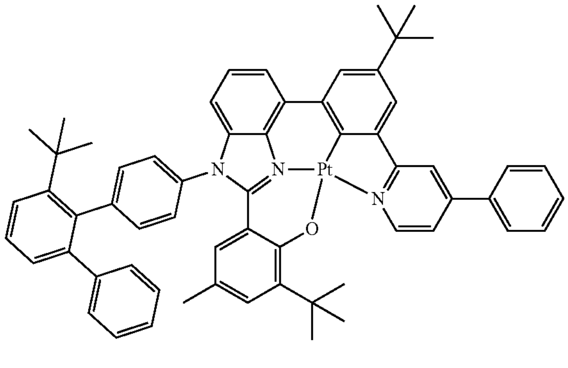
2594
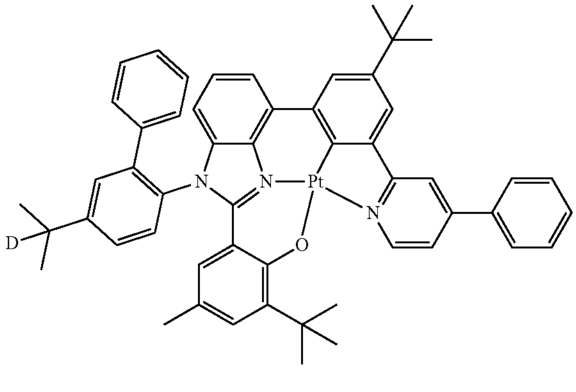

-continued
2595
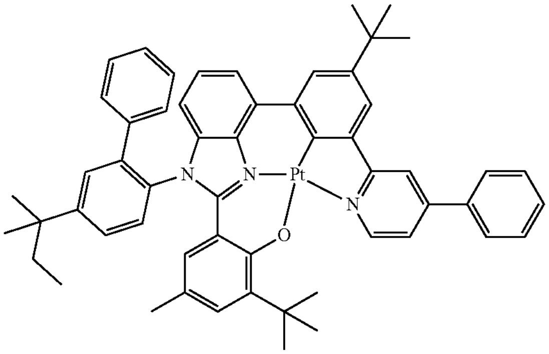
2596
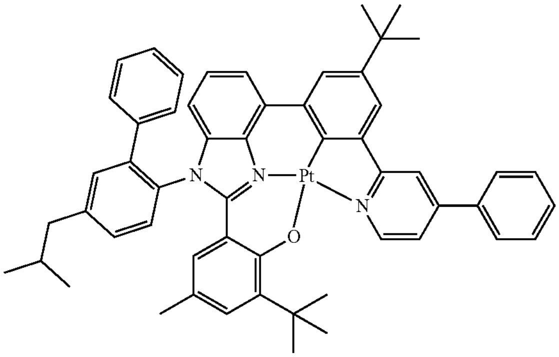
2597
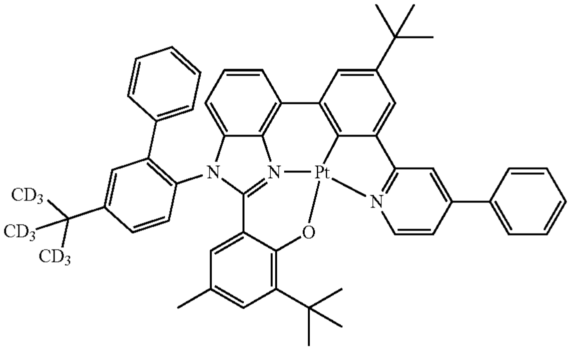
2598
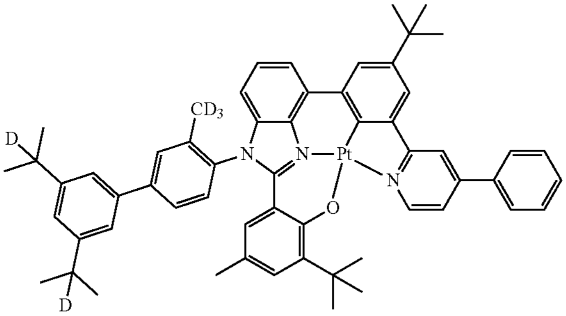
2599
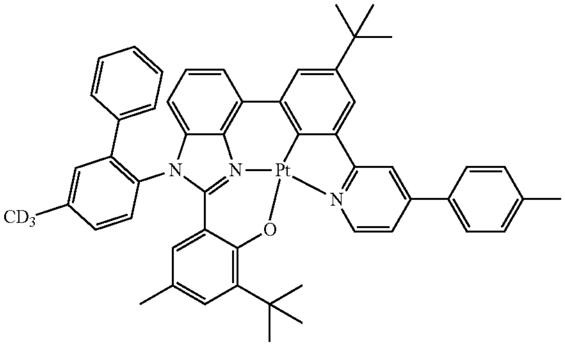
2600
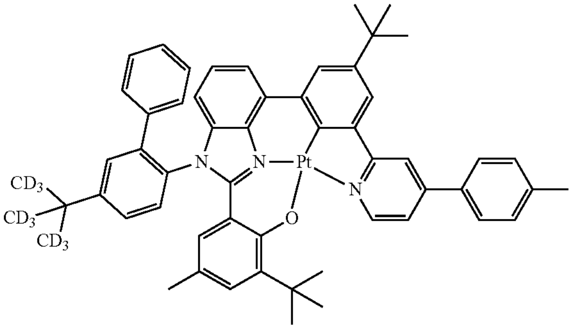
2601
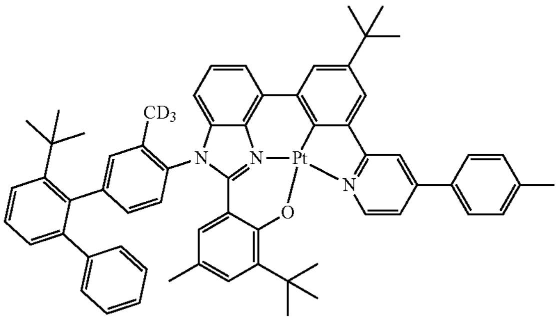
2602
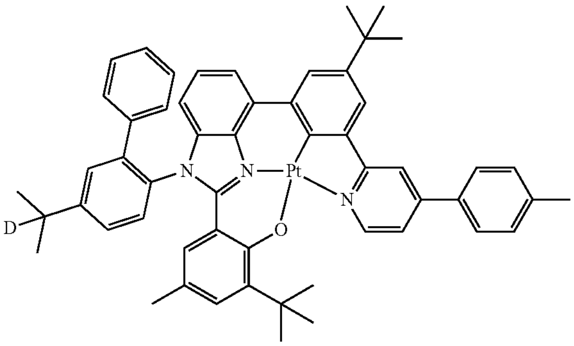

-continued
2603
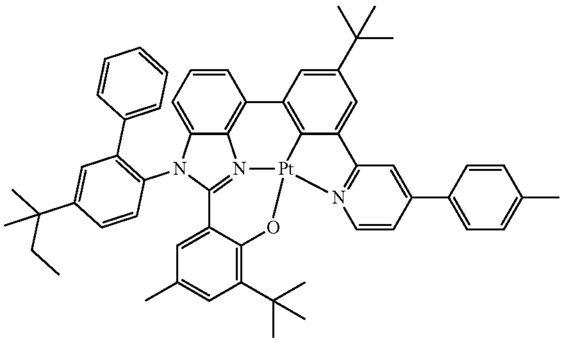
2604
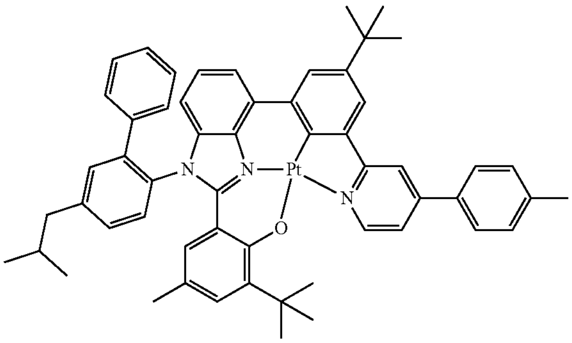
2605
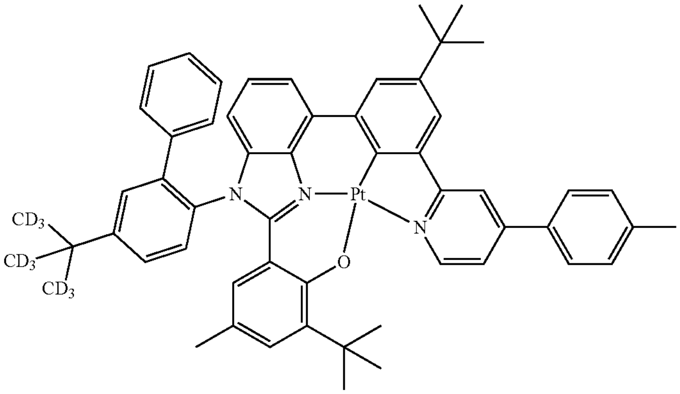
2606
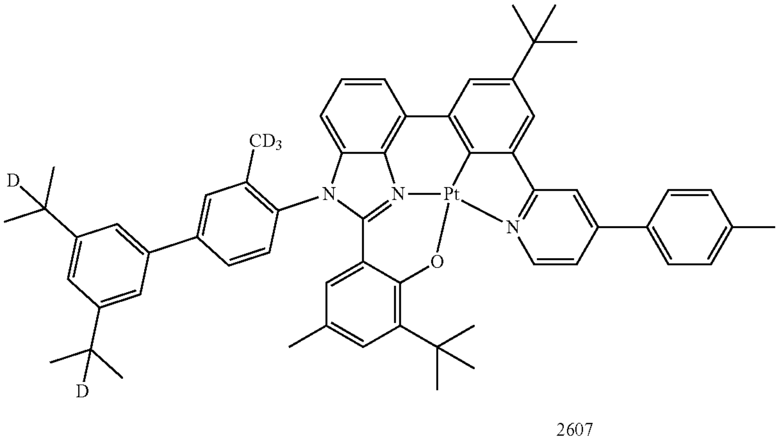
2607
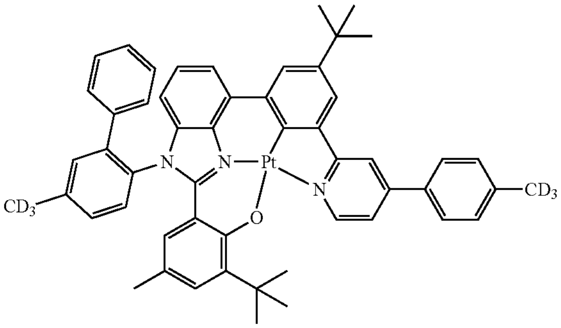
2608
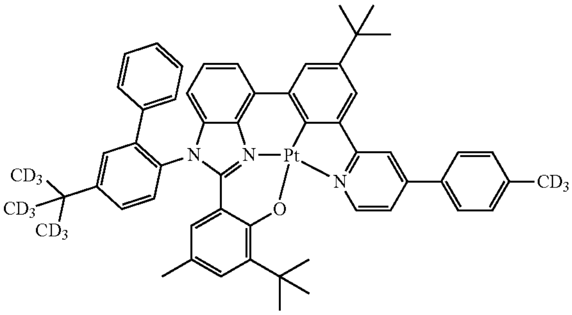

-continued
2609
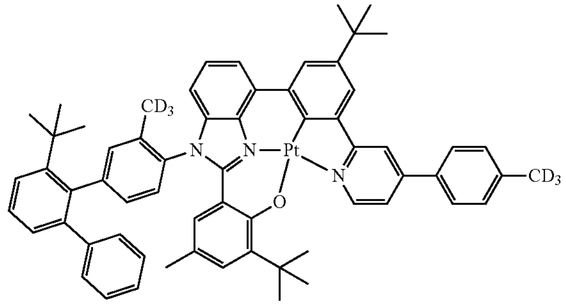
2610
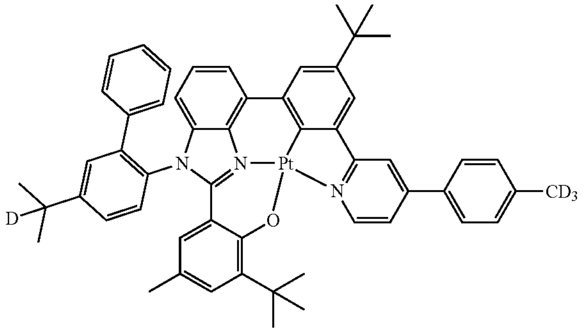
2611
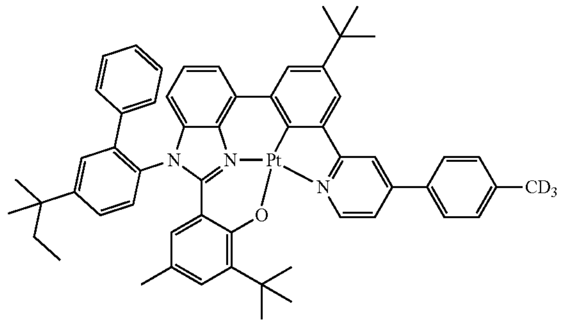
2612
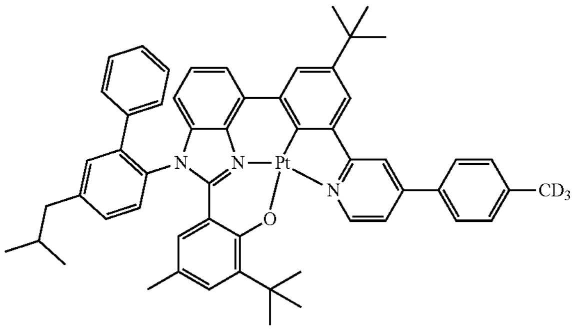
2613
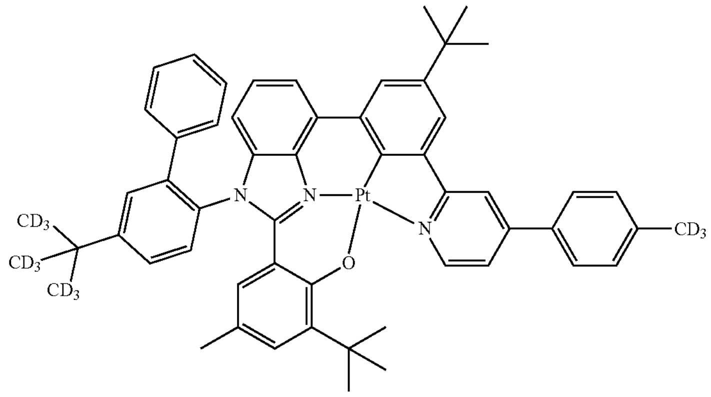
2614
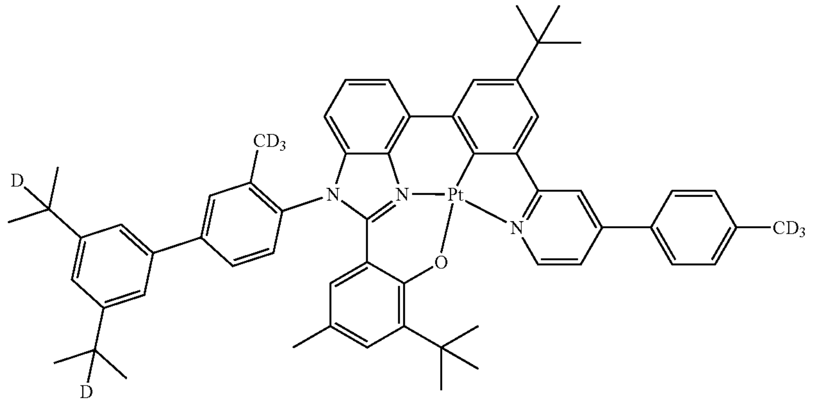

-continued
2615
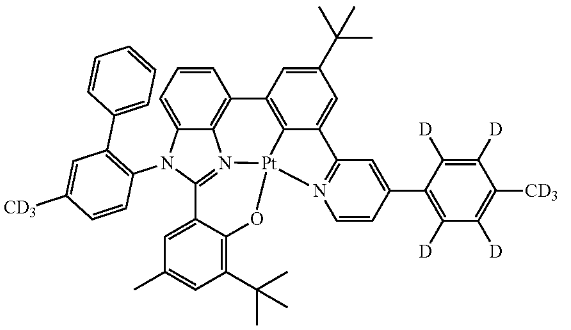
2616
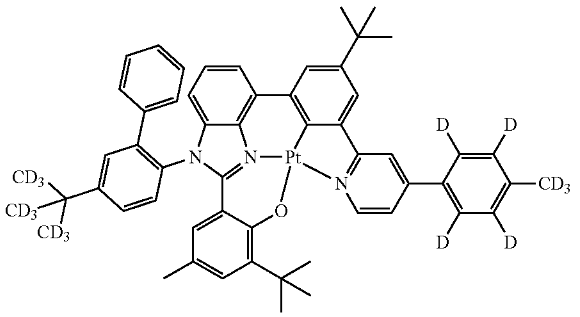
2617
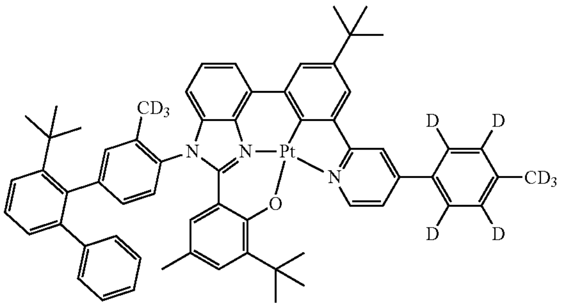
2618
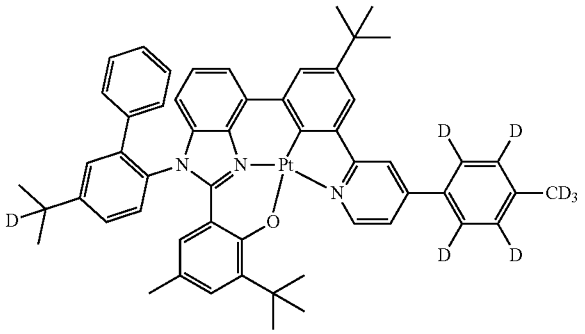
2619
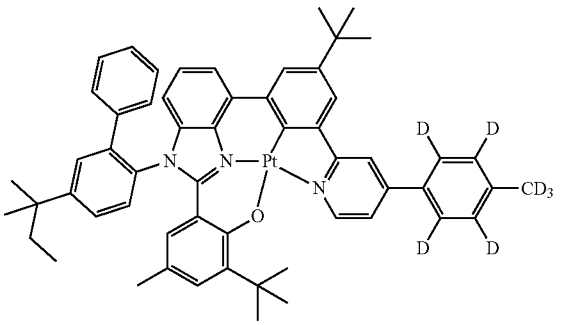
2620
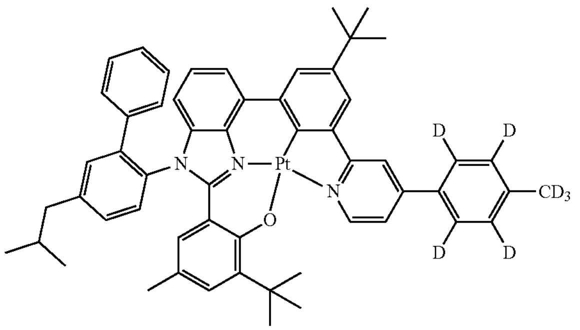
2621
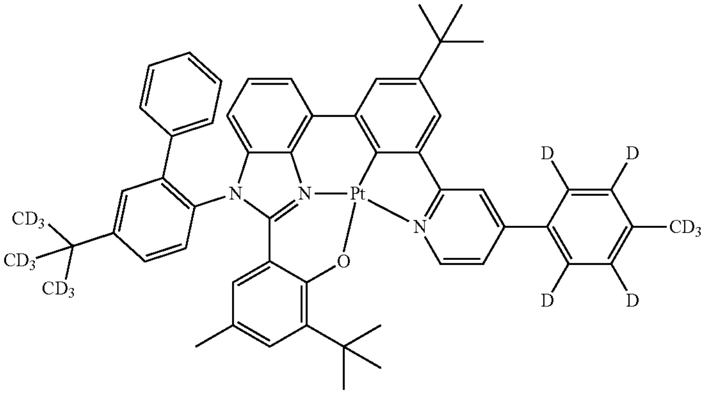

-continued
2622
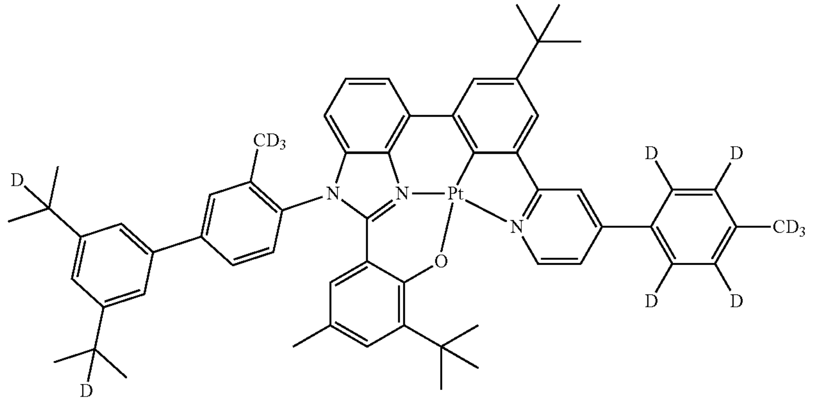
2623
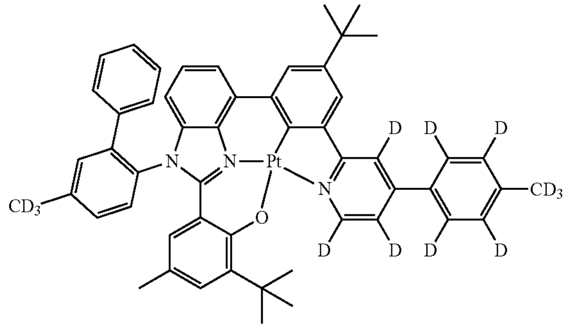
2624
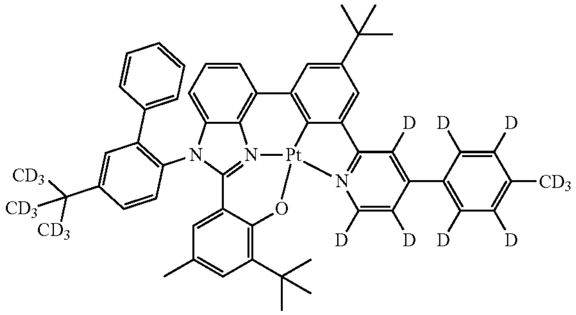
2625
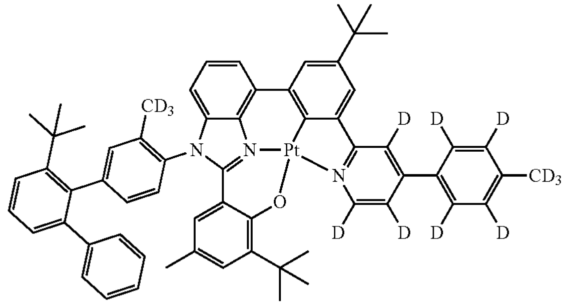
2626
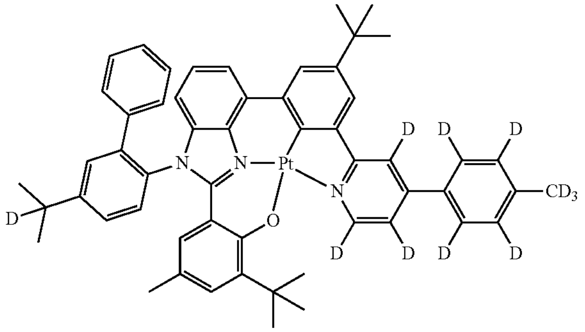
2627
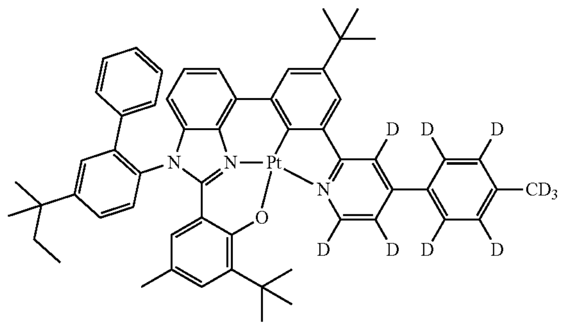
2628
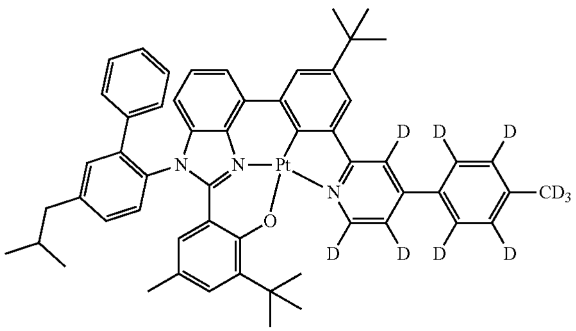

-continued
2629
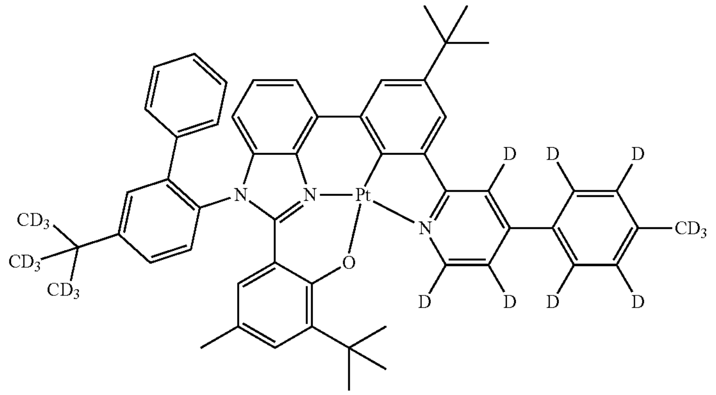
2630
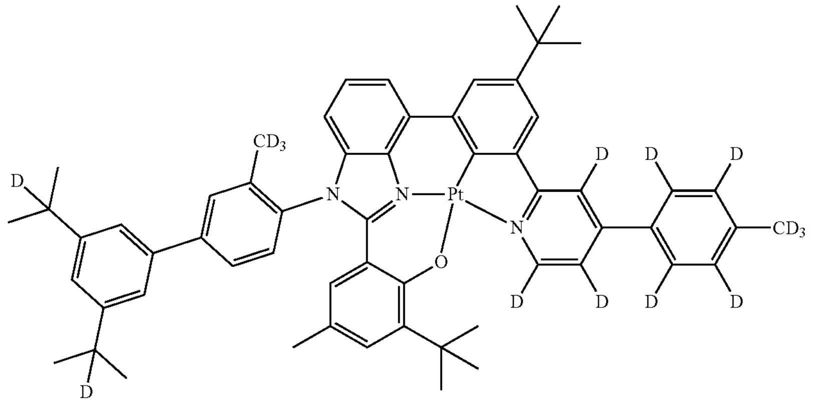
2631
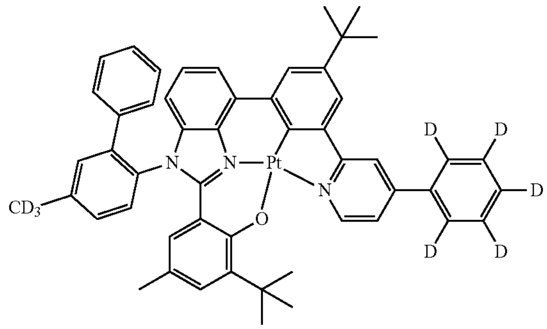
2632
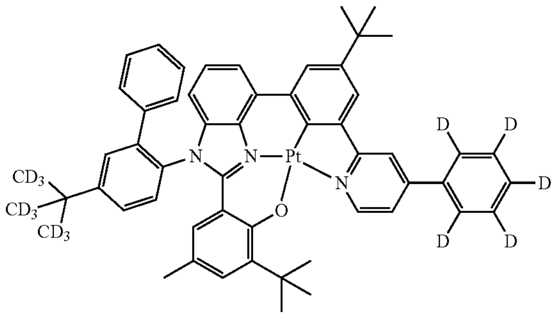
2633
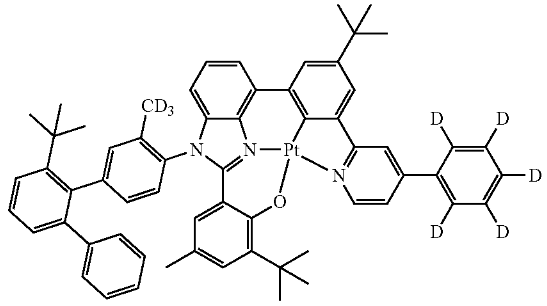
2634
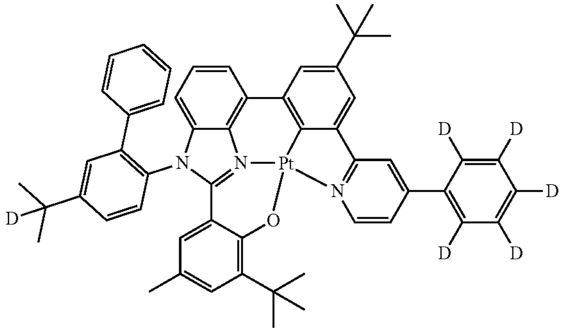

-continued
2635
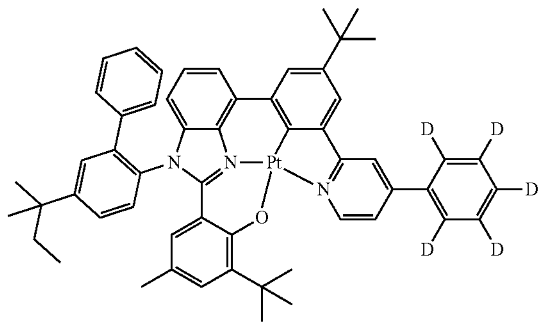
2636
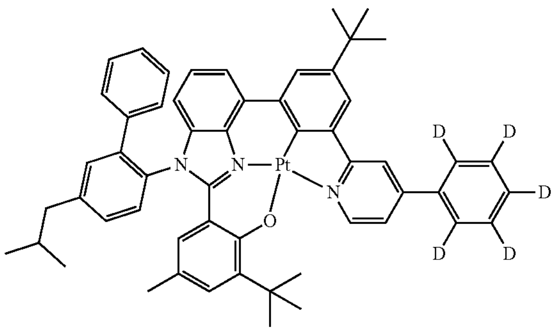
2637
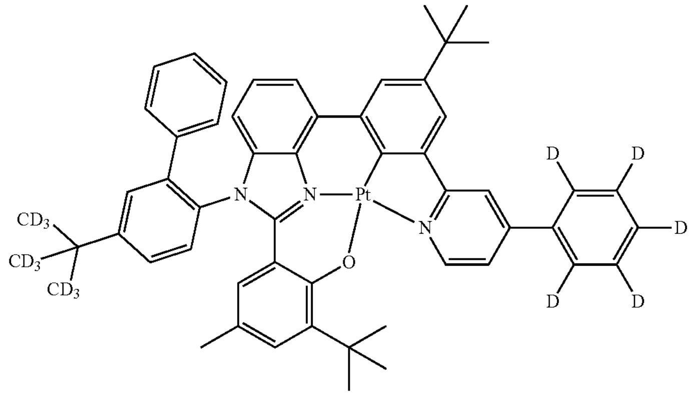
2638
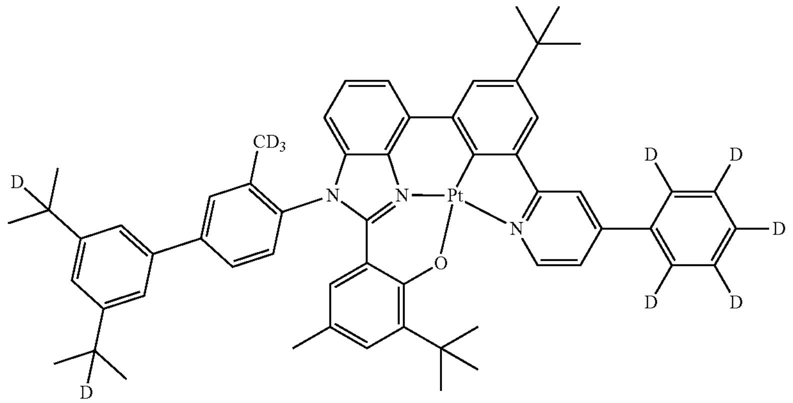
2639
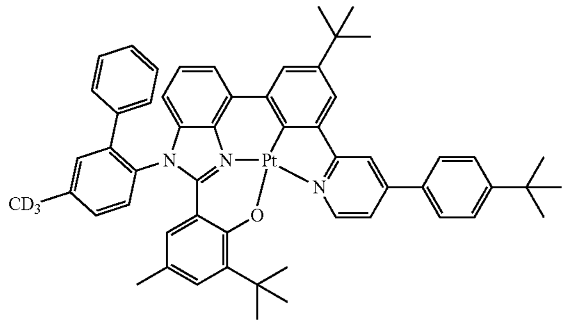
2640
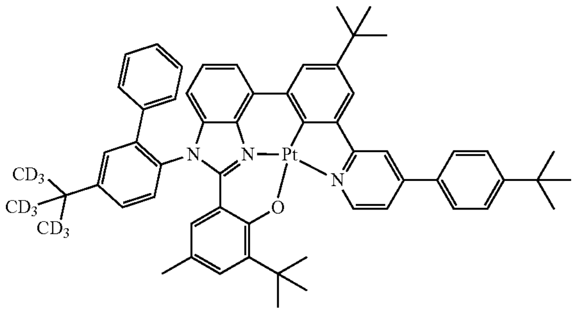

-continued
2641
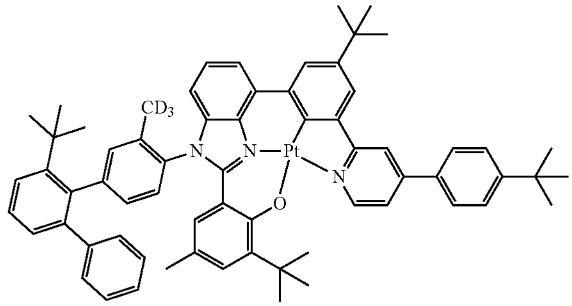
2642
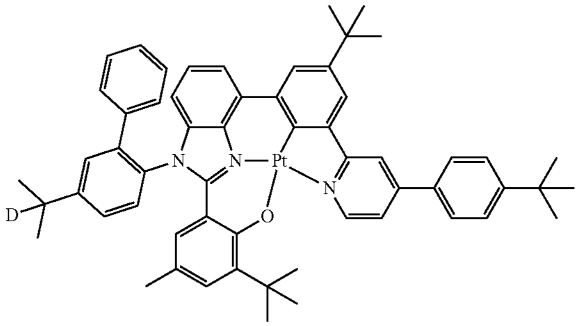
2643
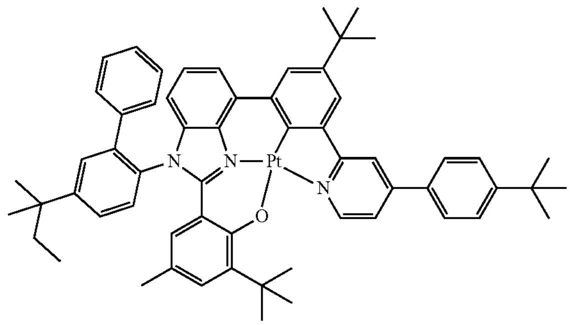
2644
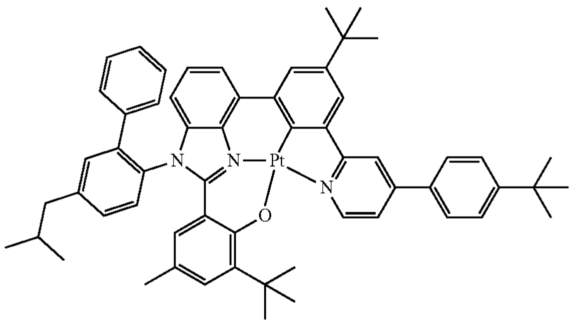
2645
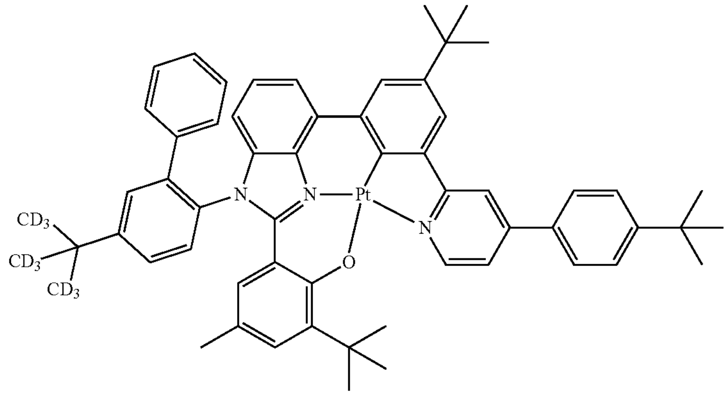
2646
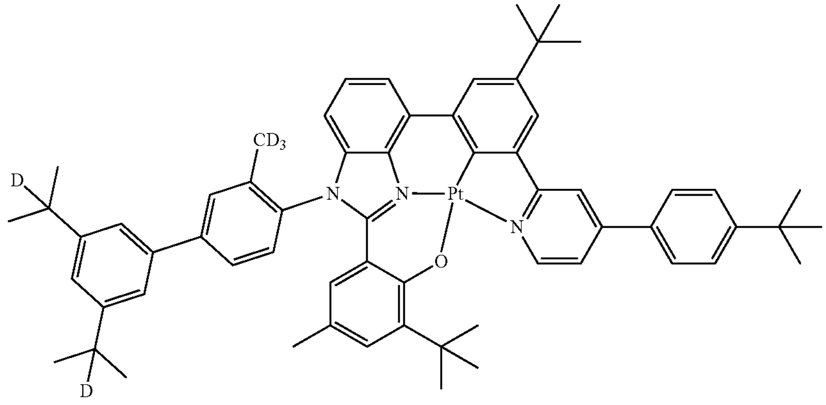

-continued
2647
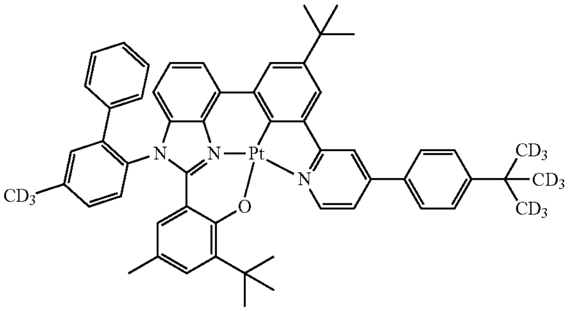
2648
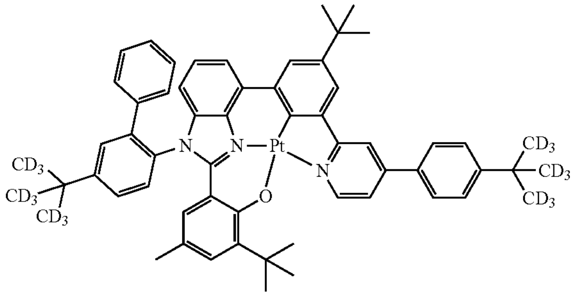
2649
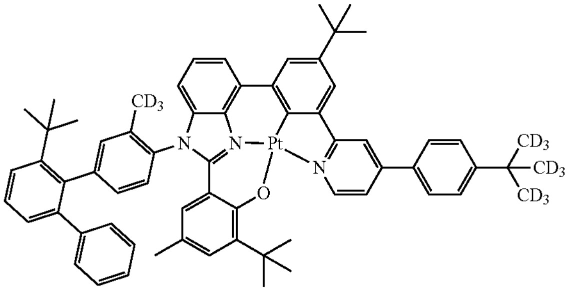
2650
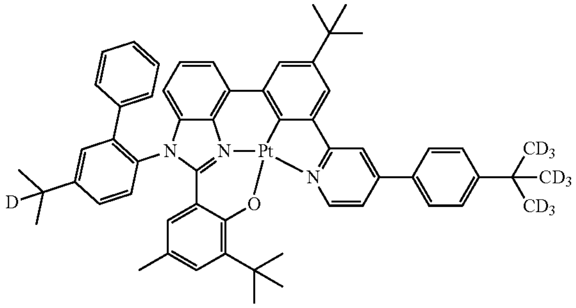
2651
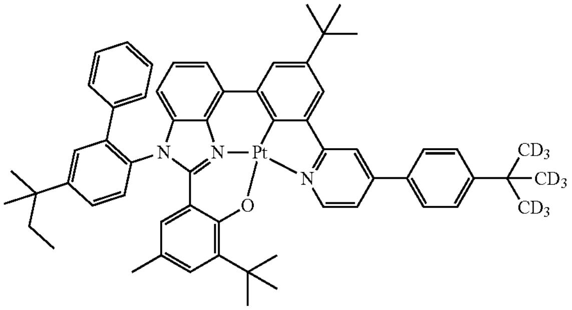
2652
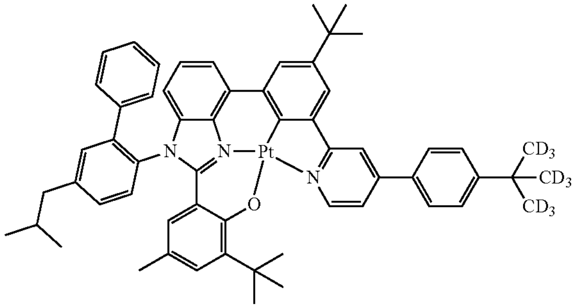
2653
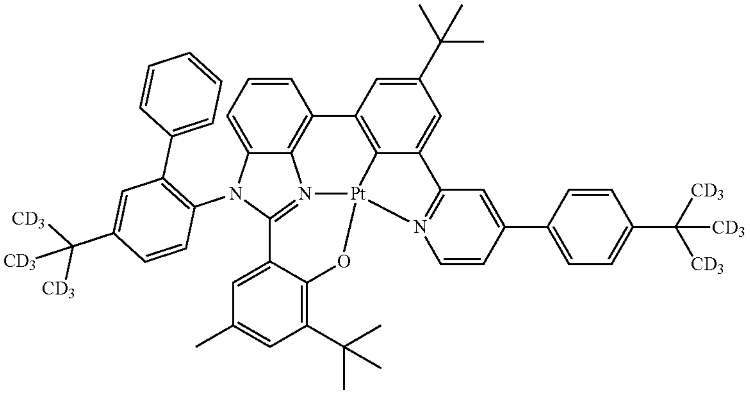

-continued
2654
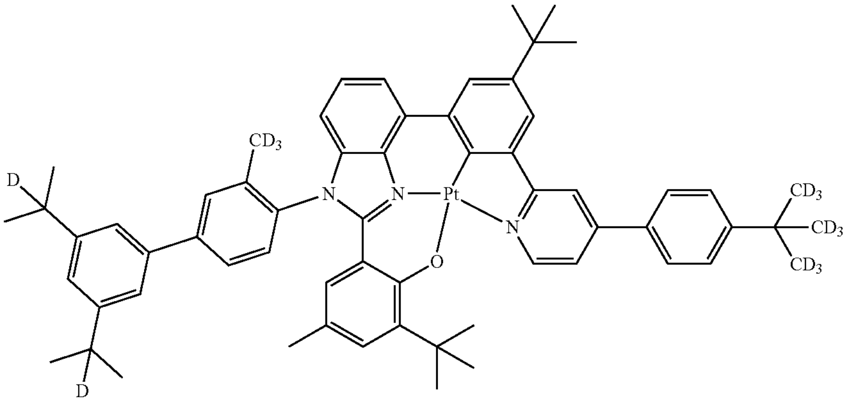
2655
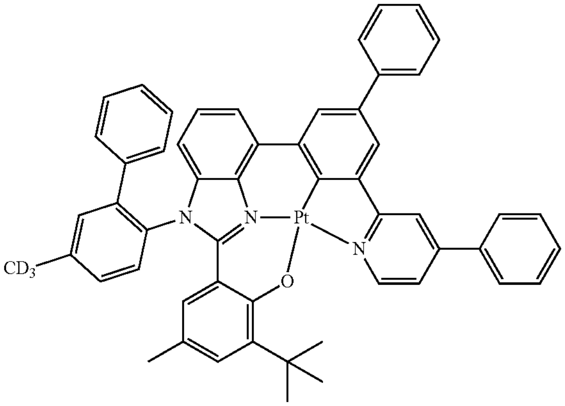
2656
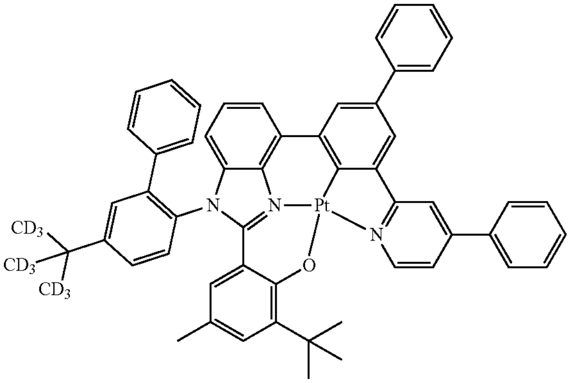
2657
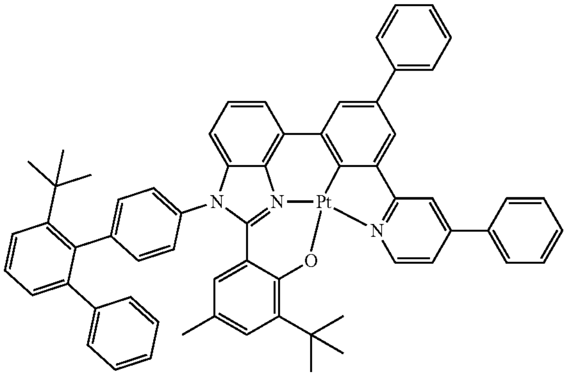
2658
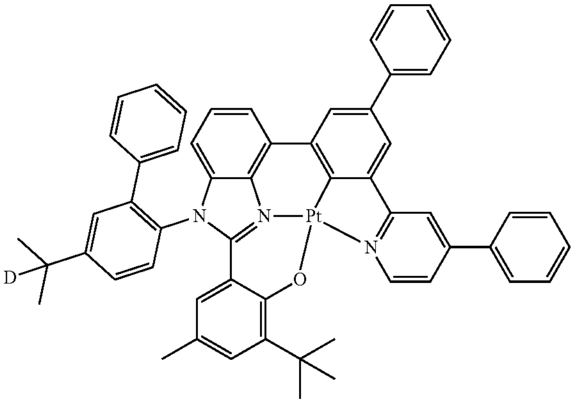

-continued
2659
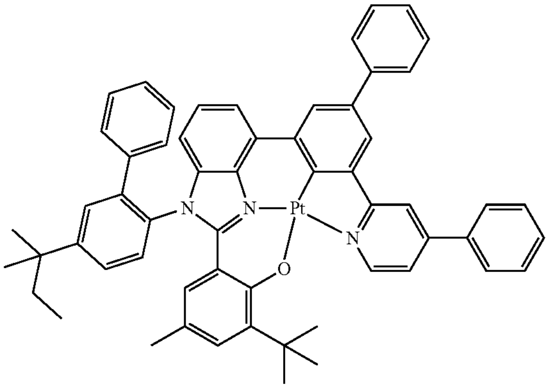
2660
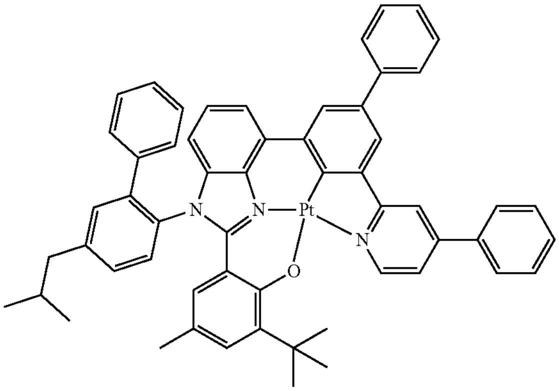
2661
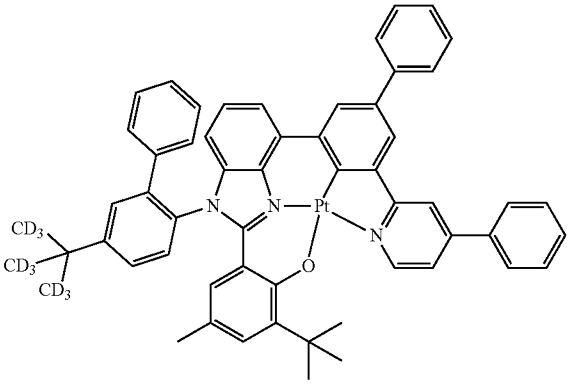
2662
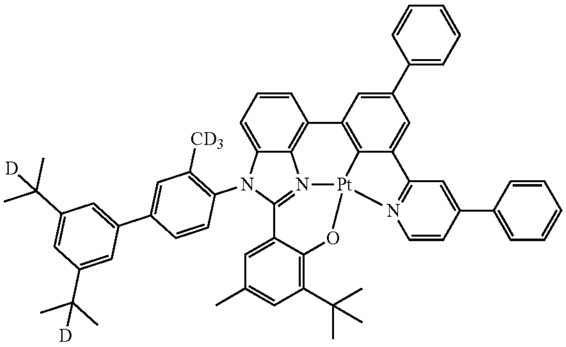
2663
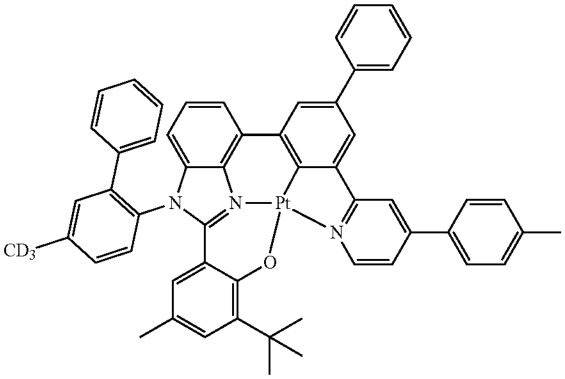
2664
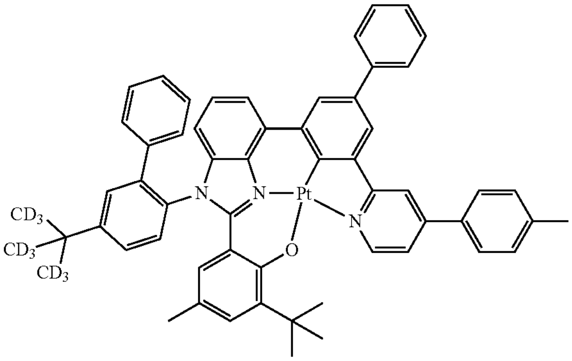
2665
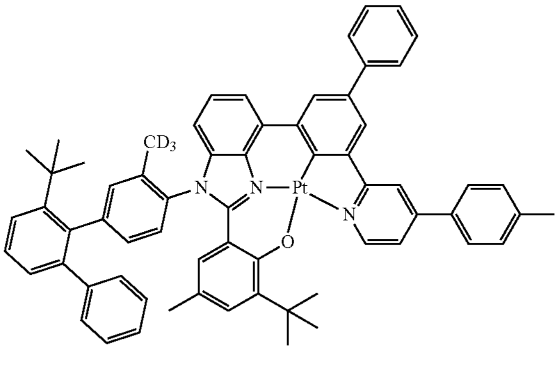
2666
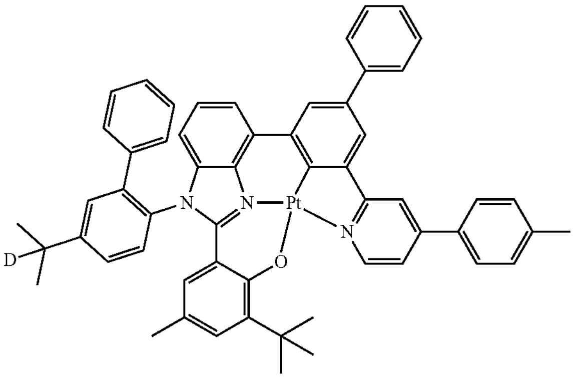

-continued
2667
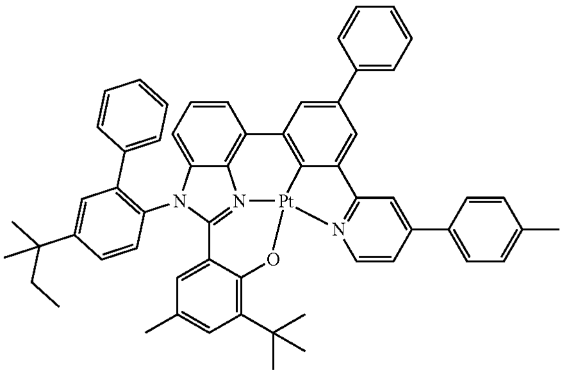
2668
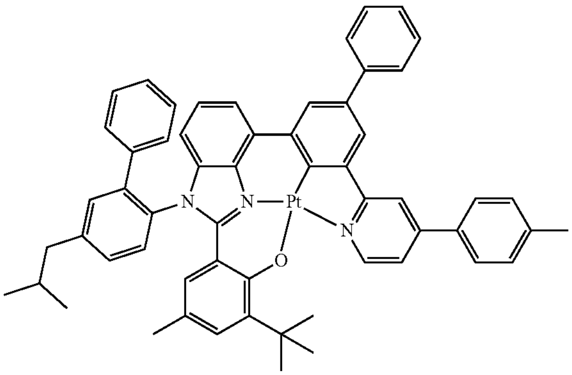
2669
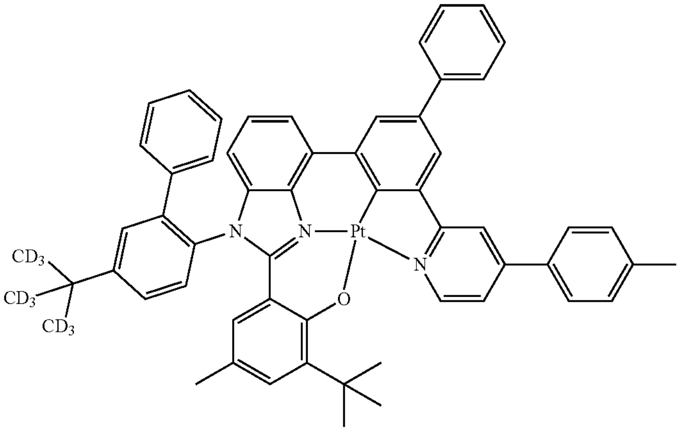
2670
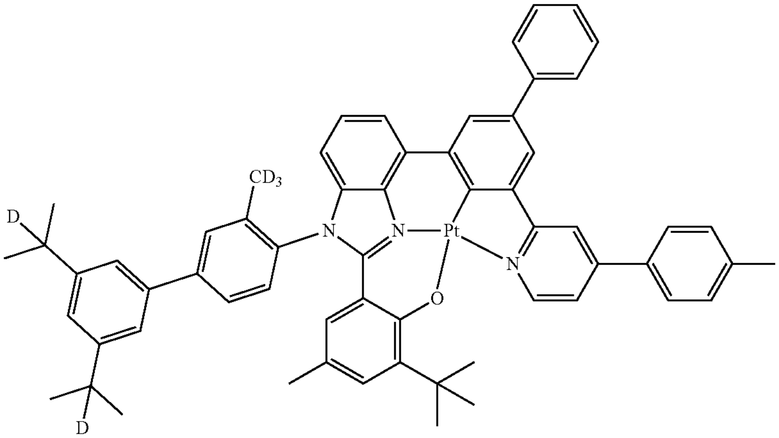
2671
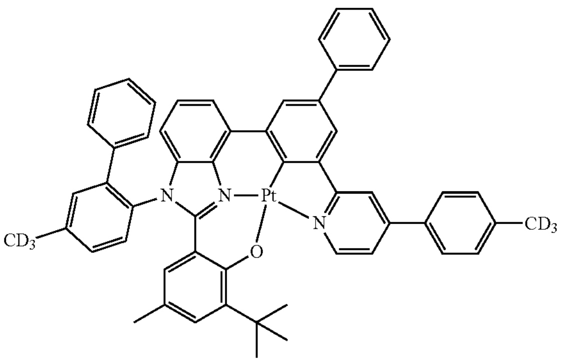
2672
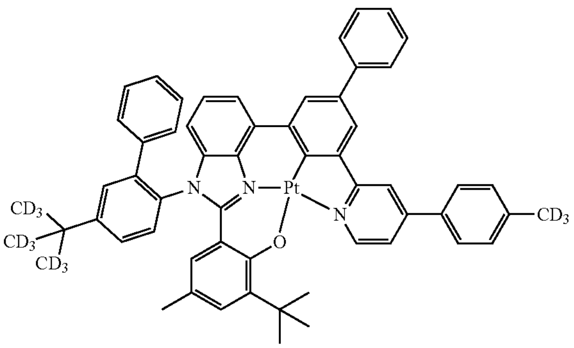

-continued
2673
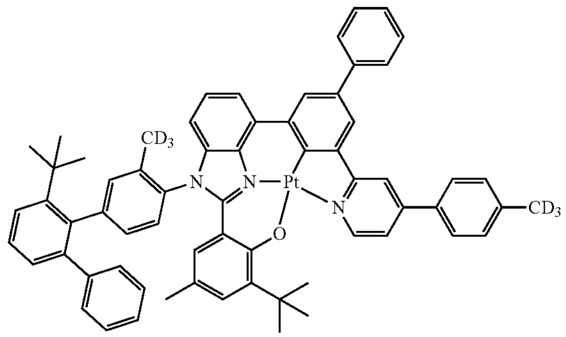
2674
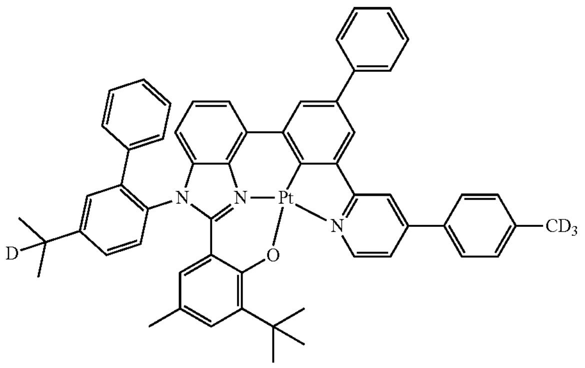
2675
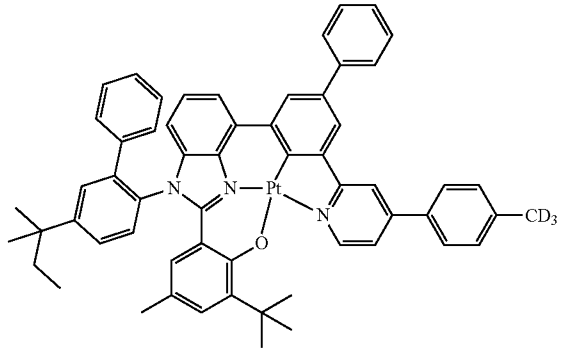
2676
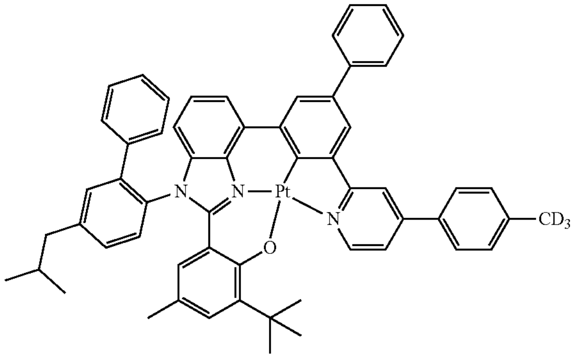
2677
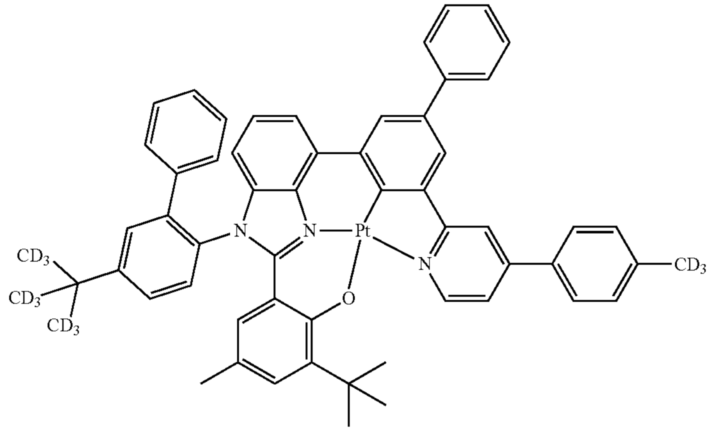
2678
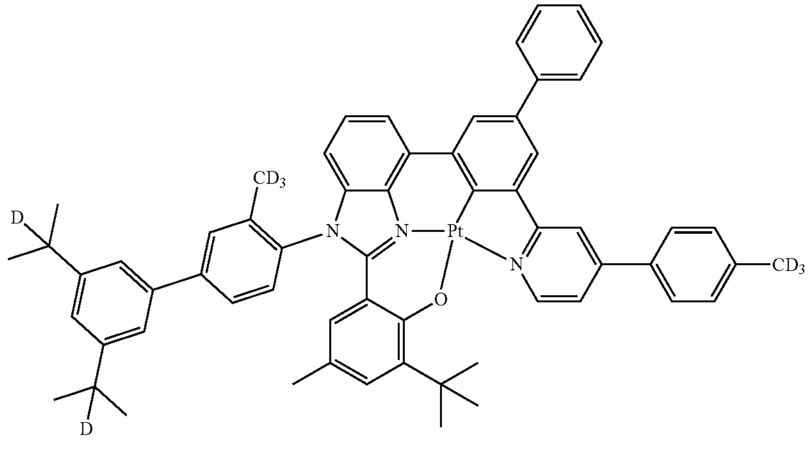

-continued
2679
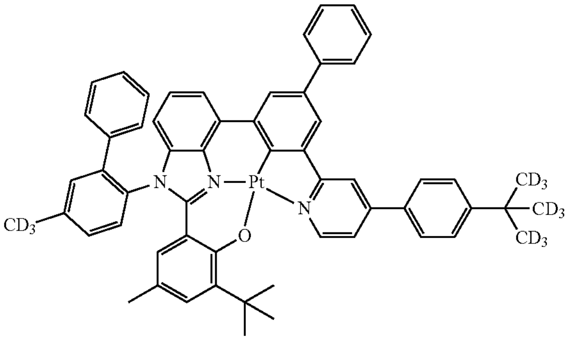
2680
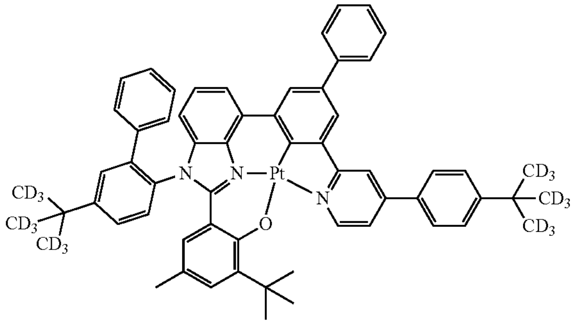
2681
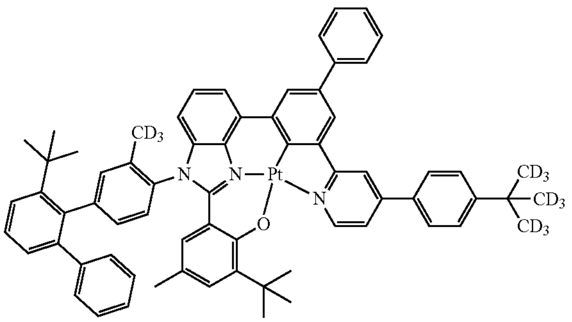
2682
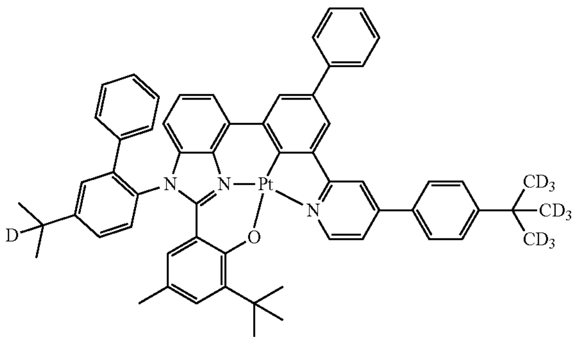
2683
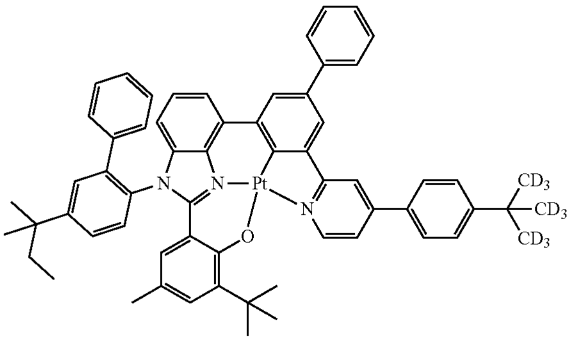
2684
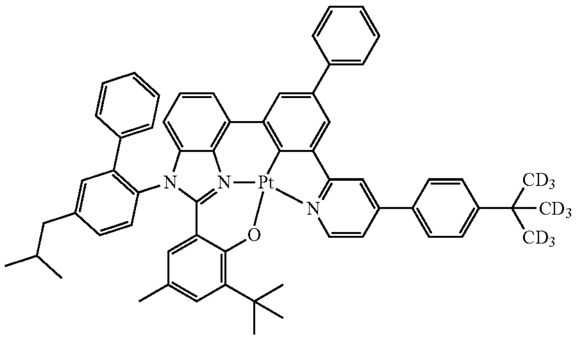
2685
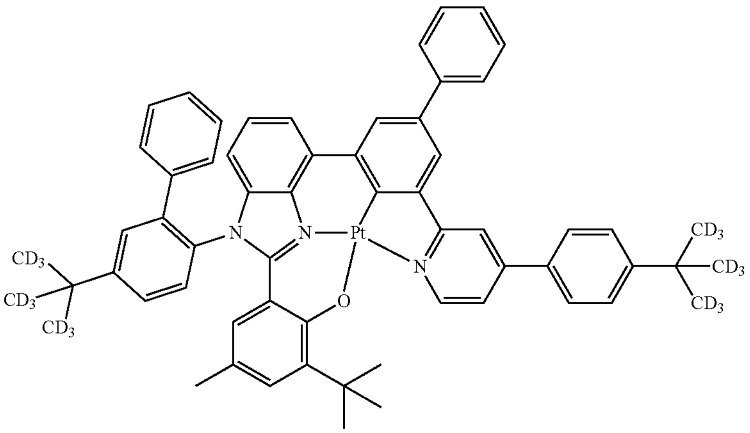

-continued
2686
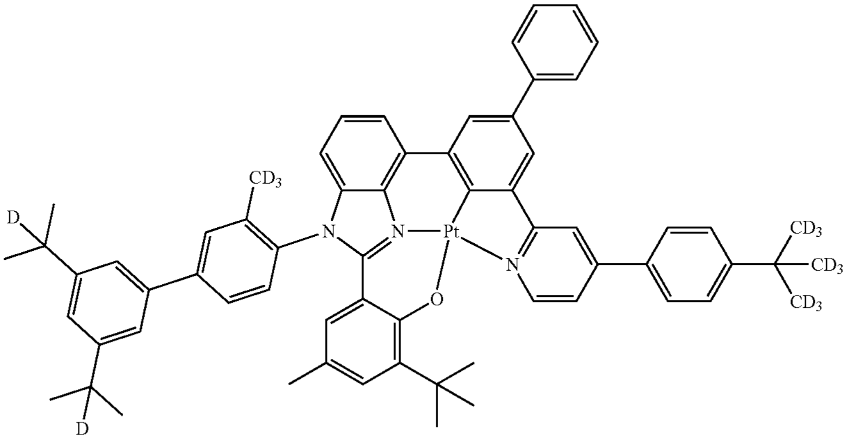
2687
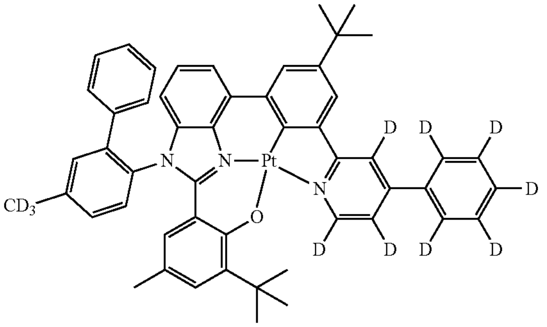
2688
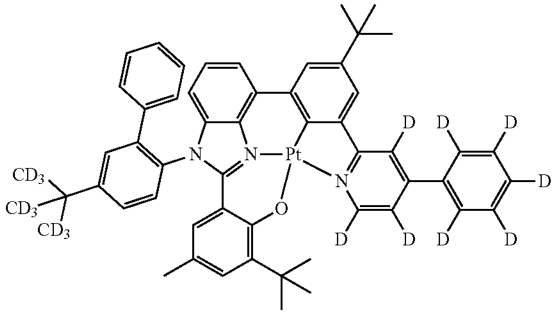
2689
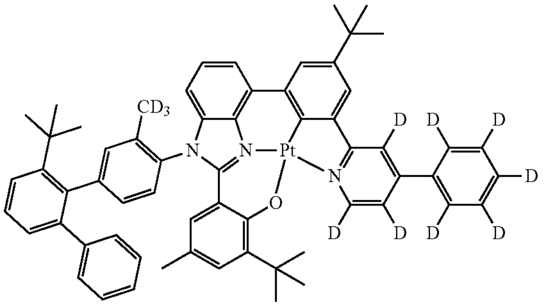
2690
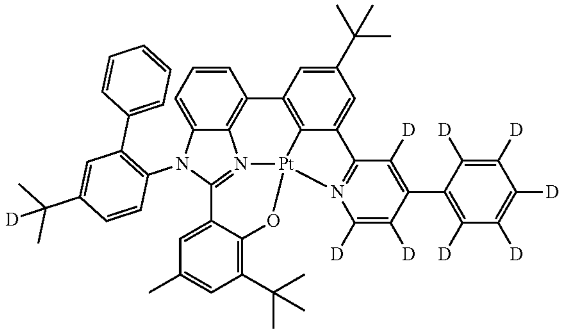
2691
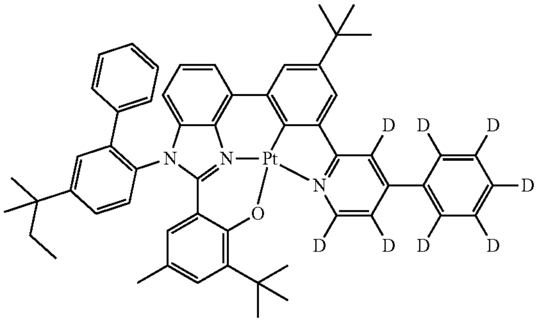
2692
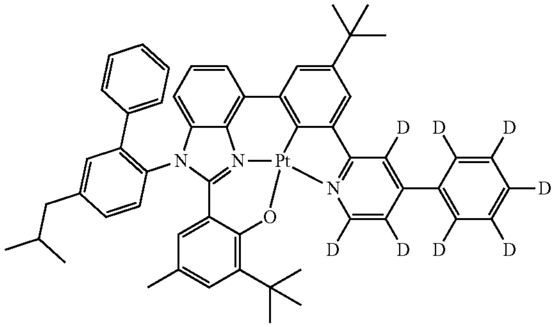

-continued
2693
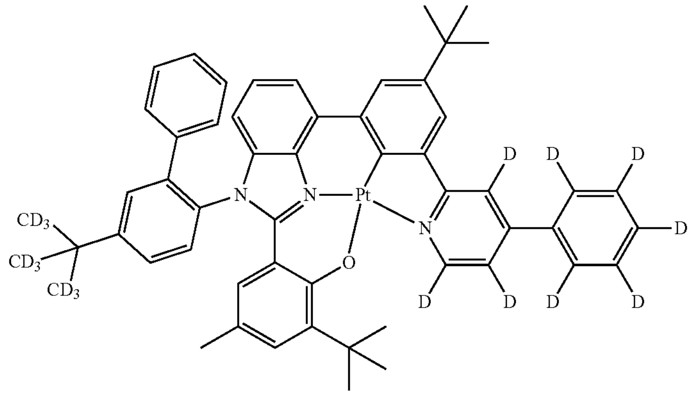
2694
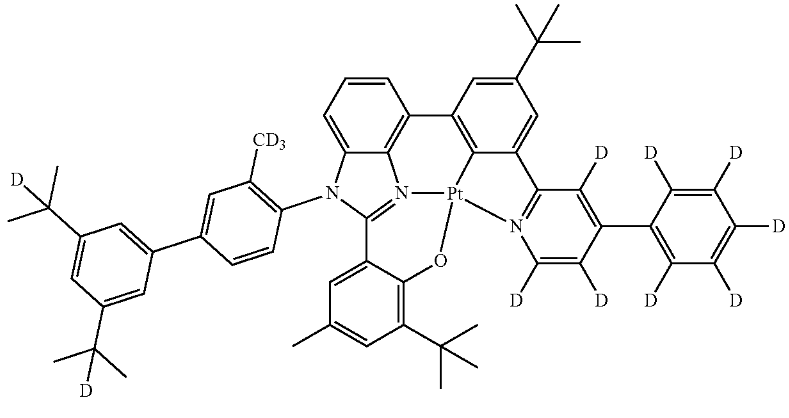
2695
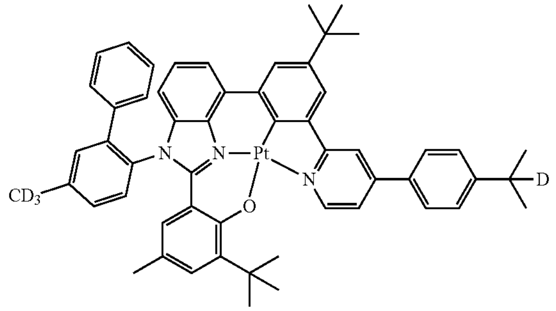
2696
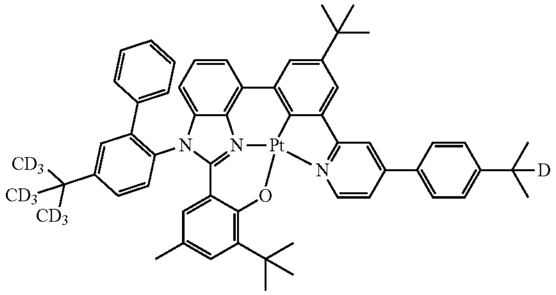
2697
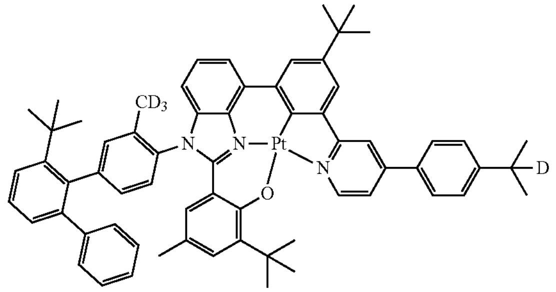
2698
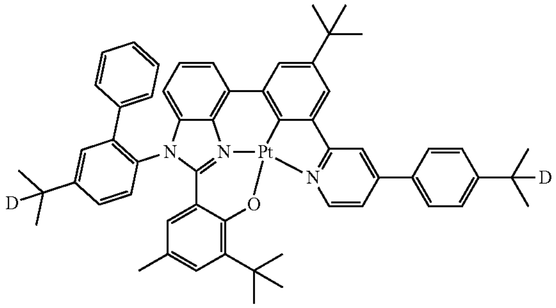

-continued
2699
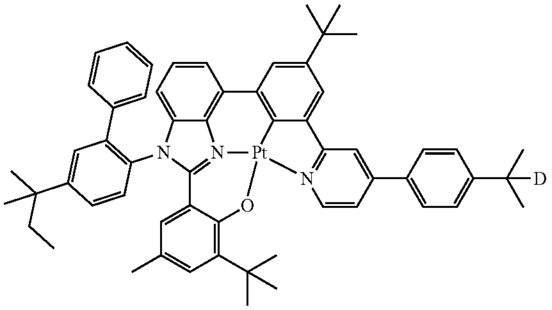
2700
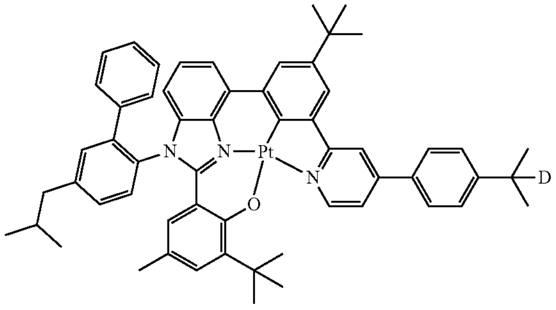
2701
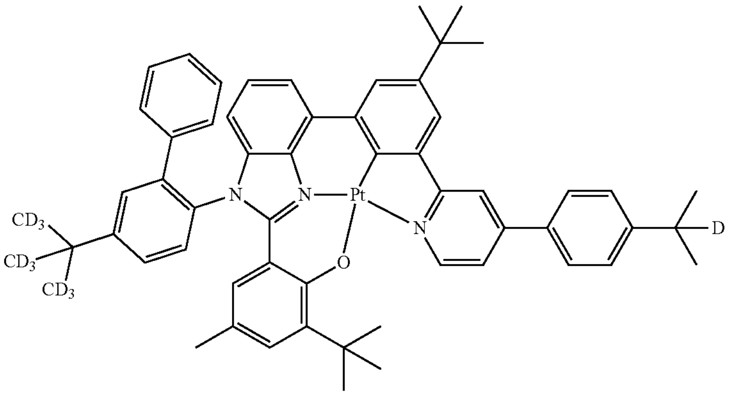
2702
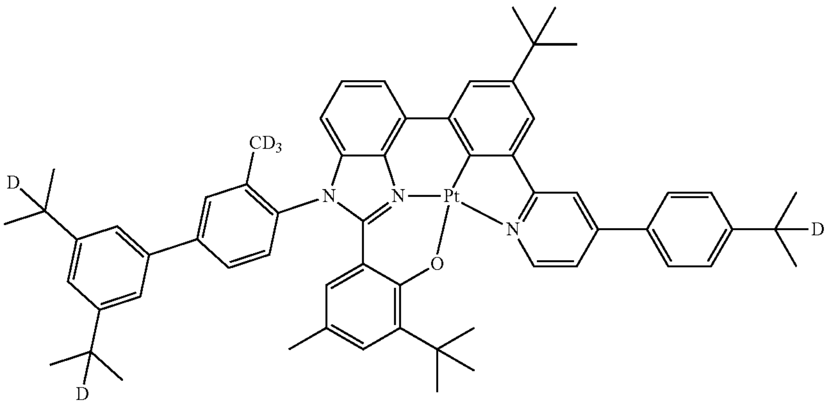
2703
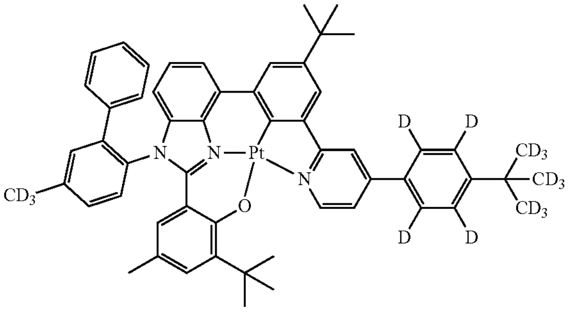
2704
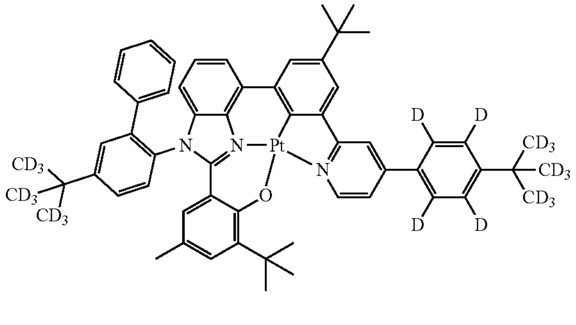

-continued
2705
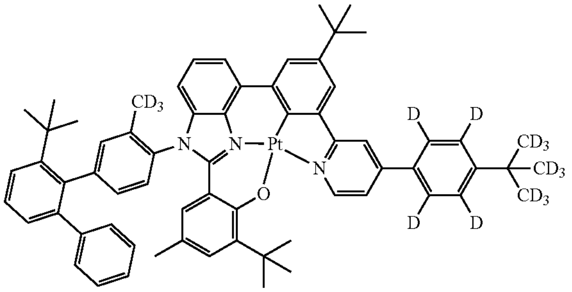
2706
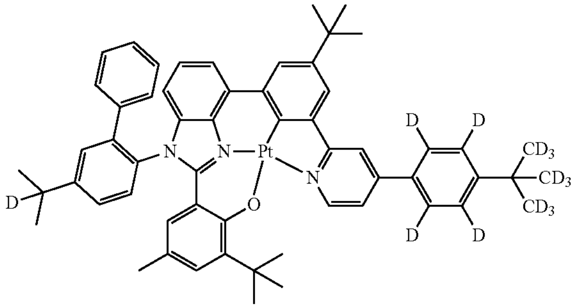
2707
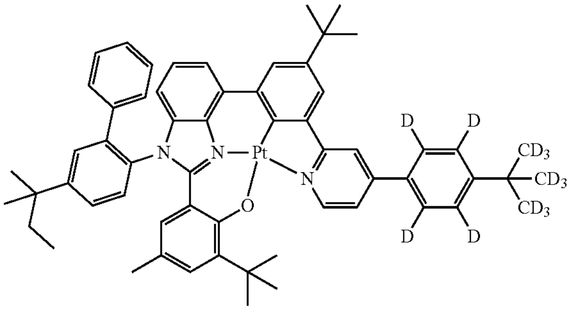
2708
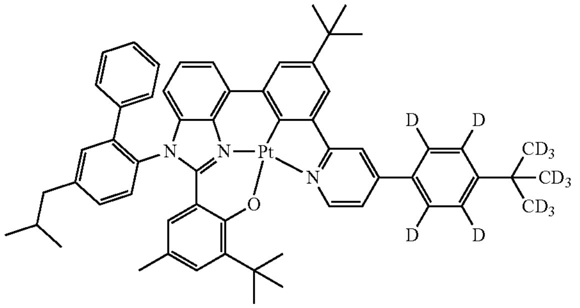
2709
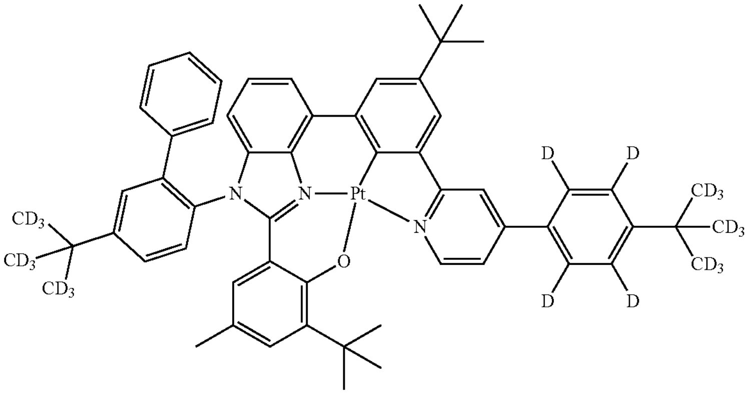
2710
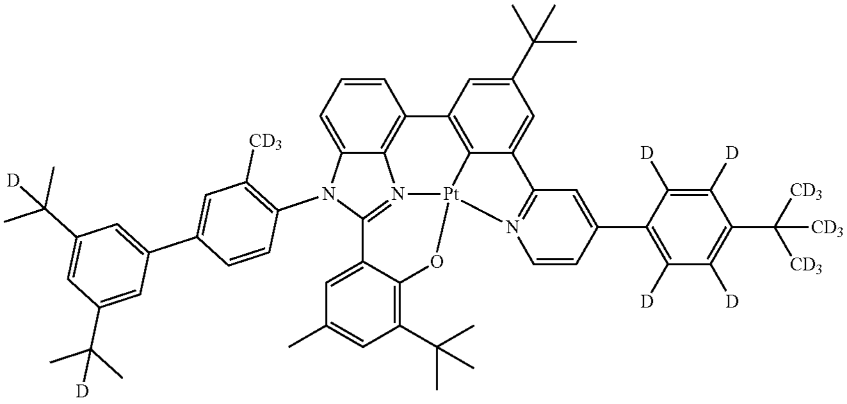

-continued
2711
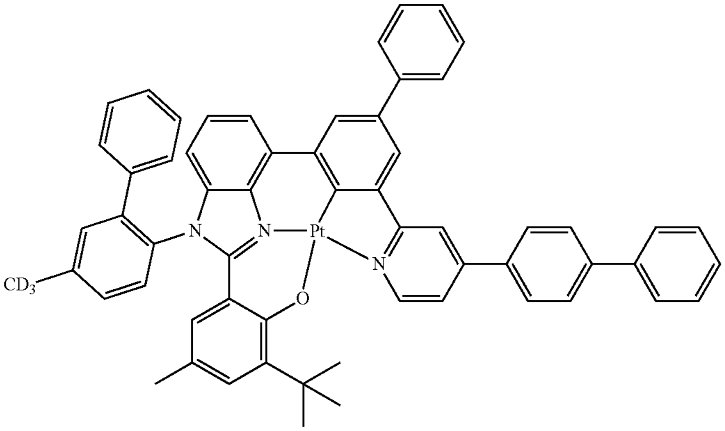
2712
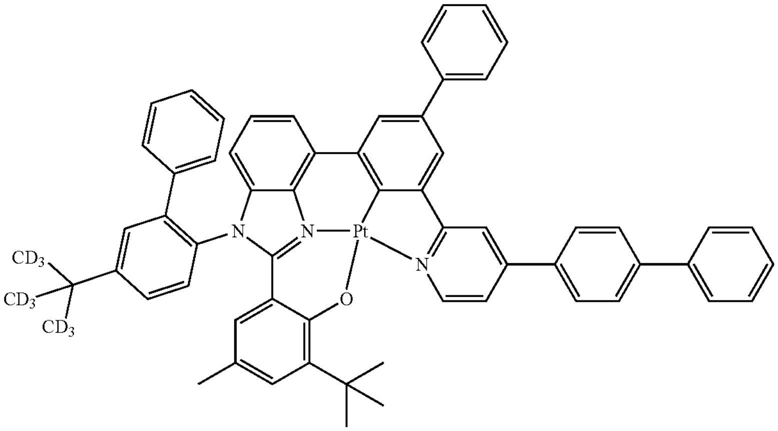
2713
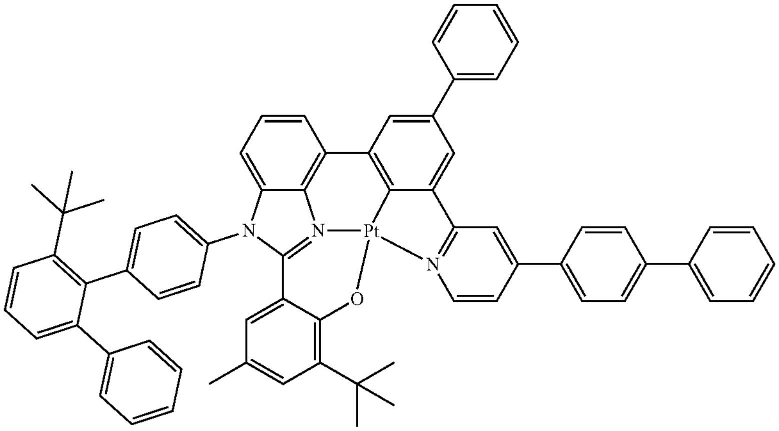
2714
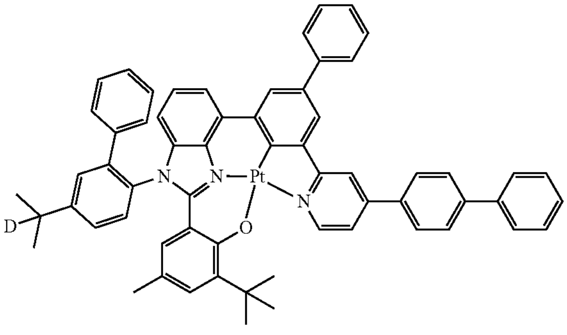
2715
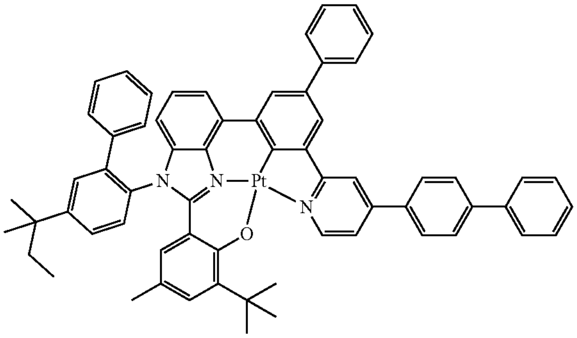

-continued
2716
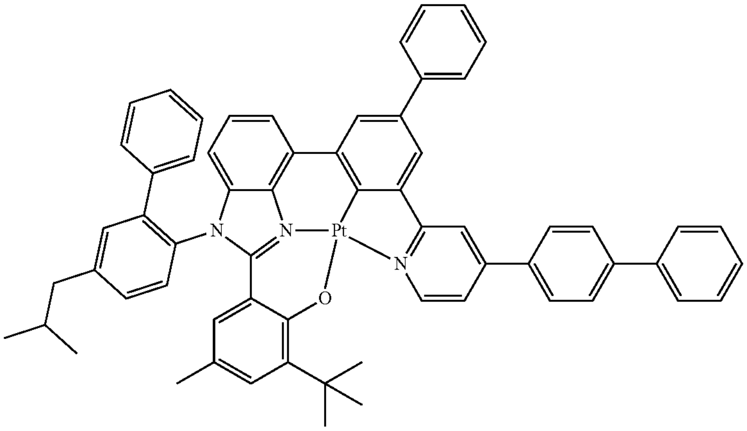
2717
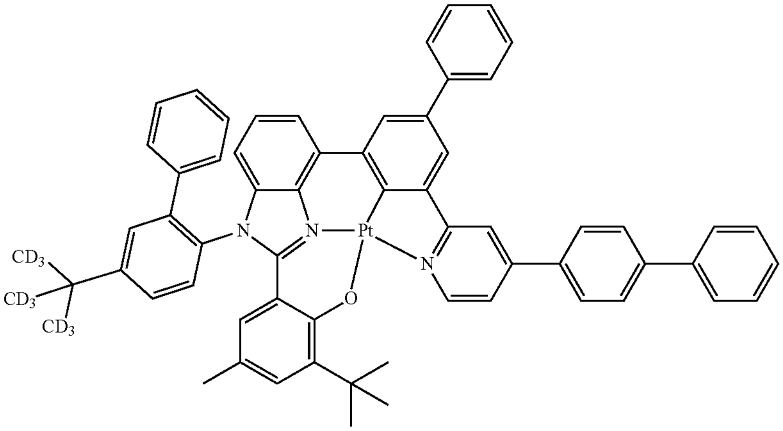
2718
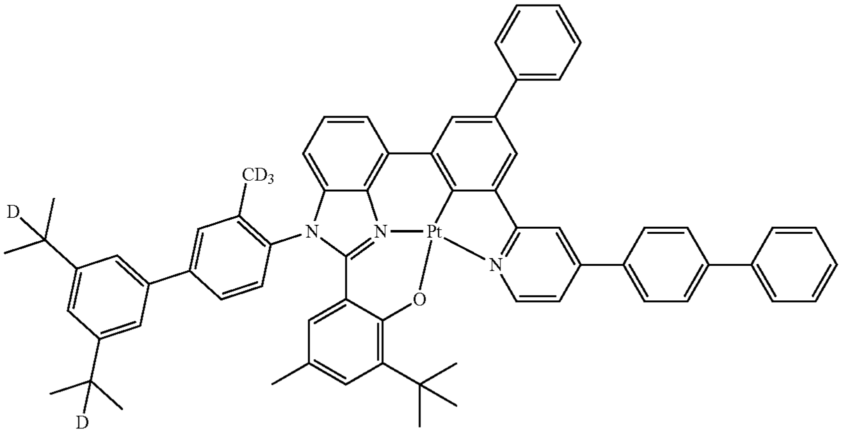

-continued
2719
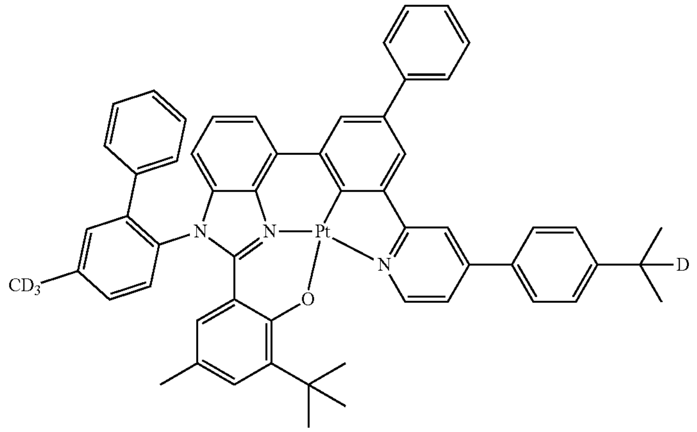
2720
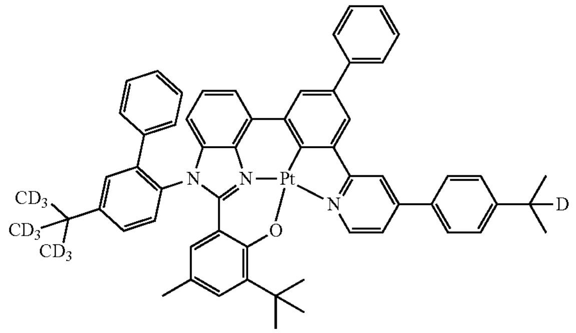
2721
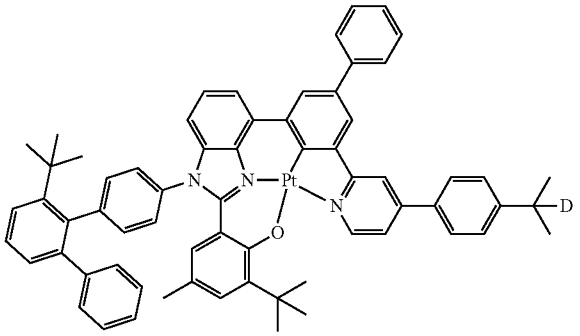
2722
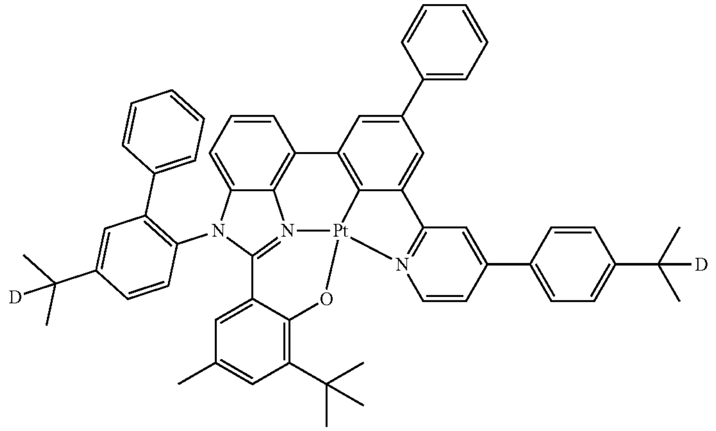

2723
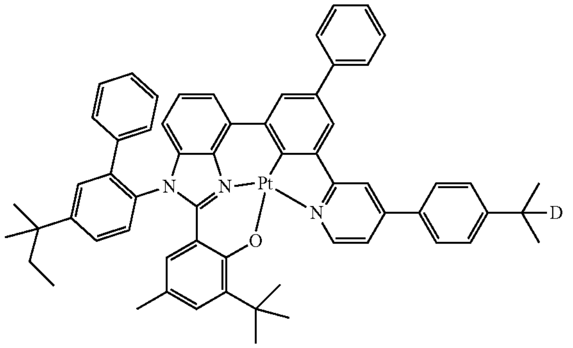
2724
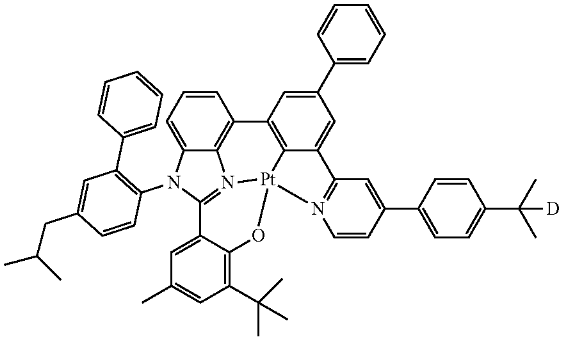
2725
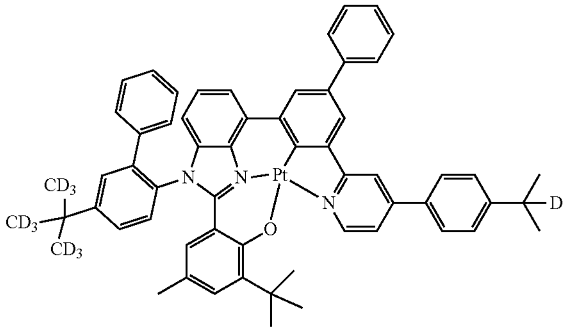
2726
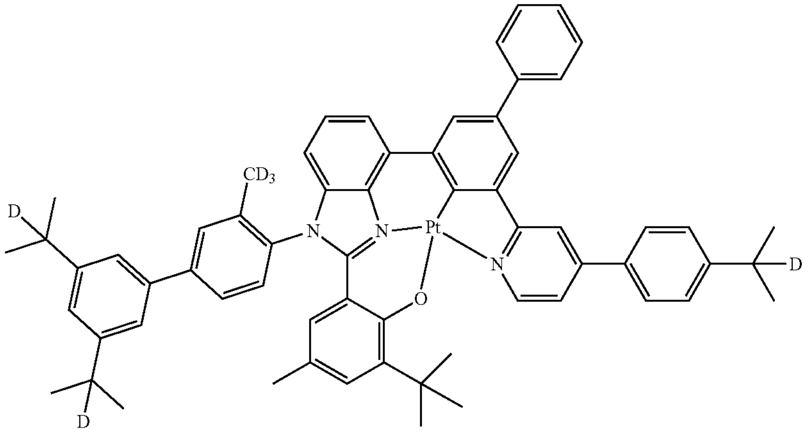
2727
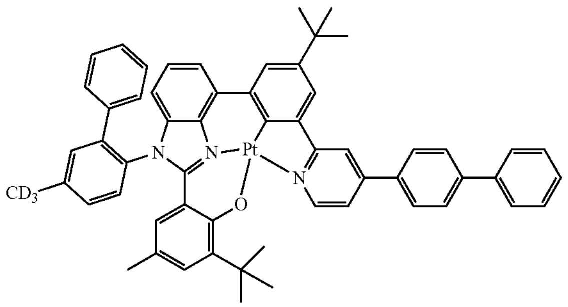
2728
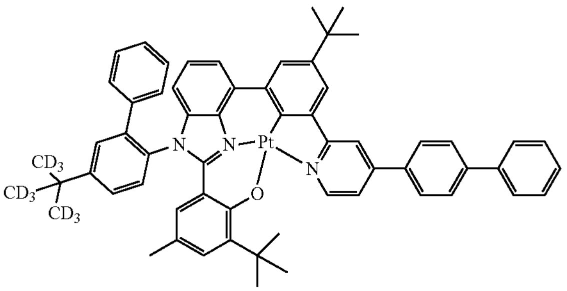

-continued
2729
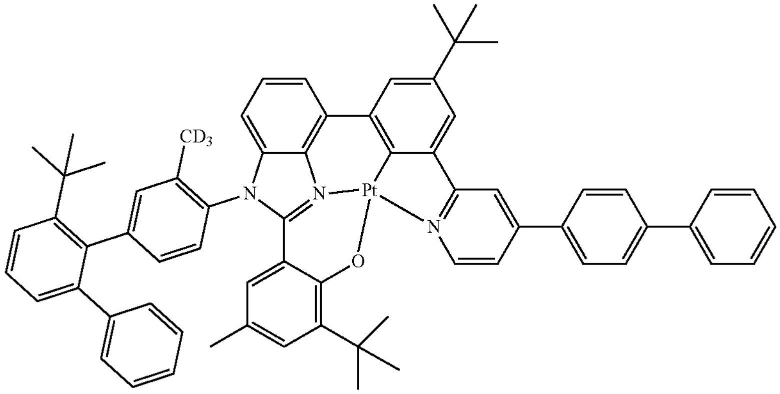
2730
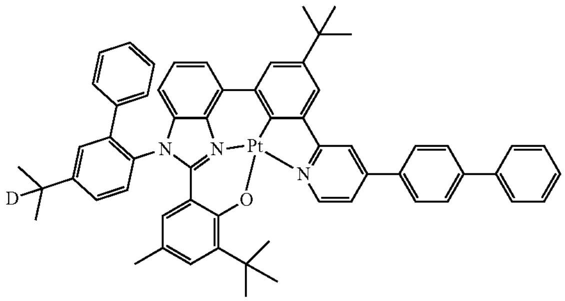
2731
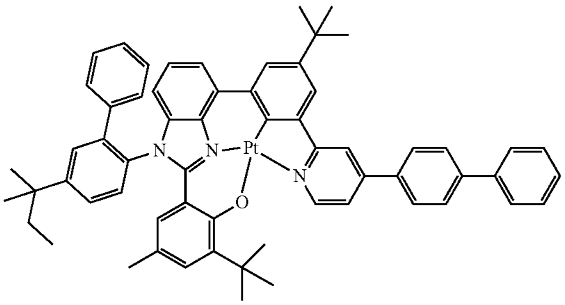
2732
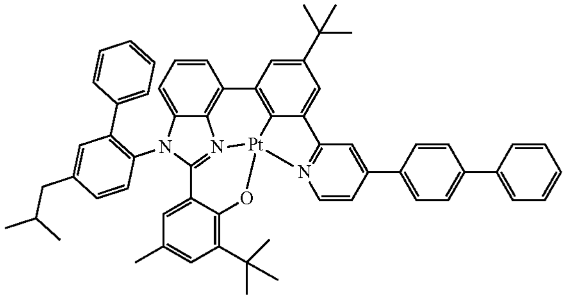
2733
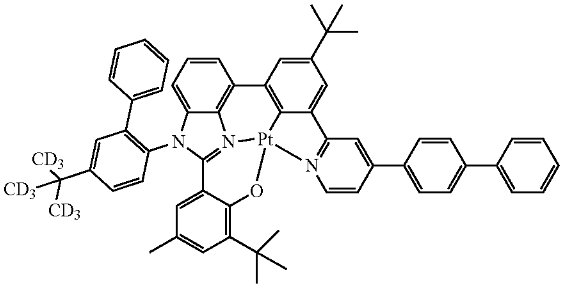
2734
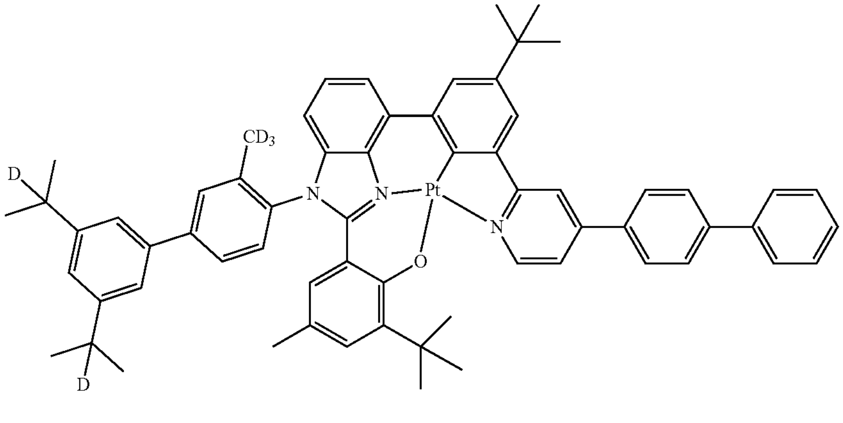

-continued
2735
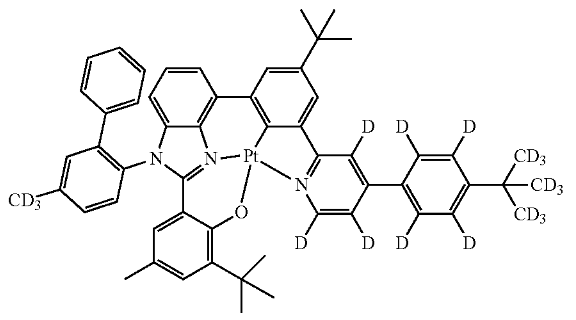
2736
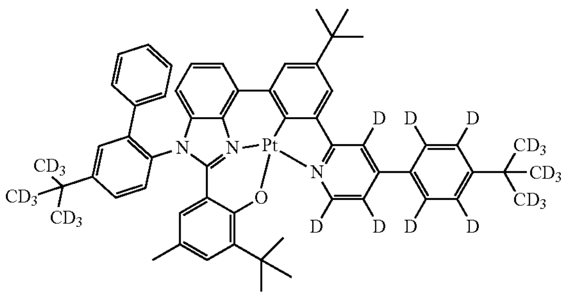
2737
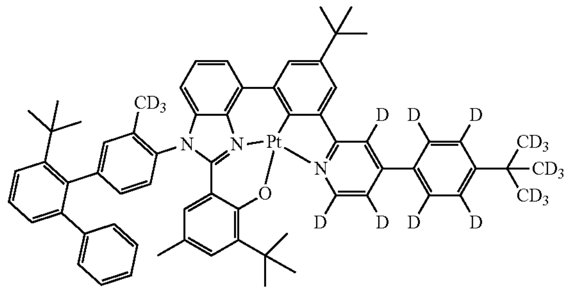
2738
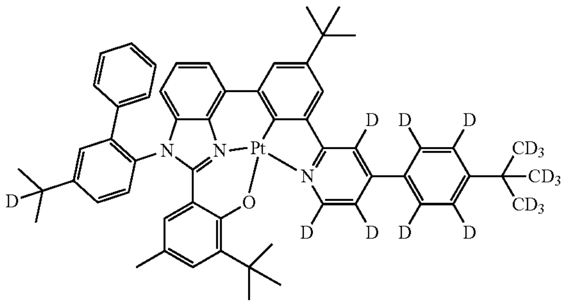
2739
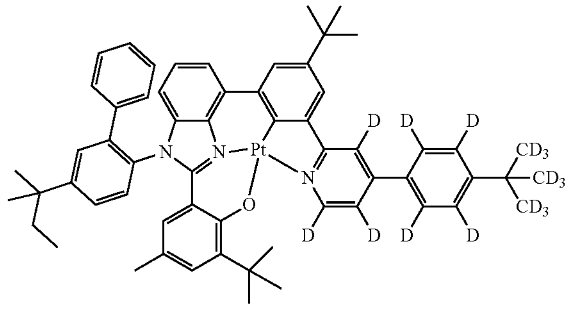
2740
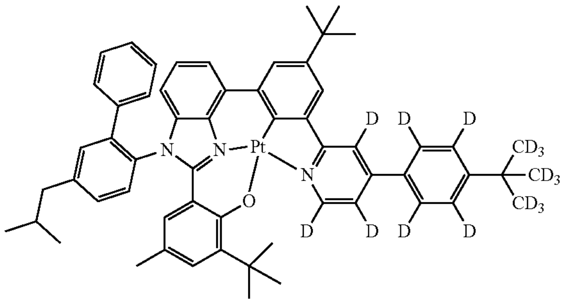
2741
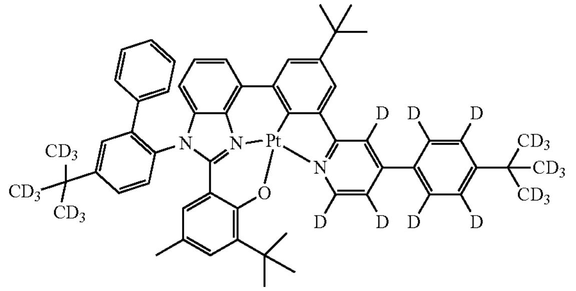

-continued
2742
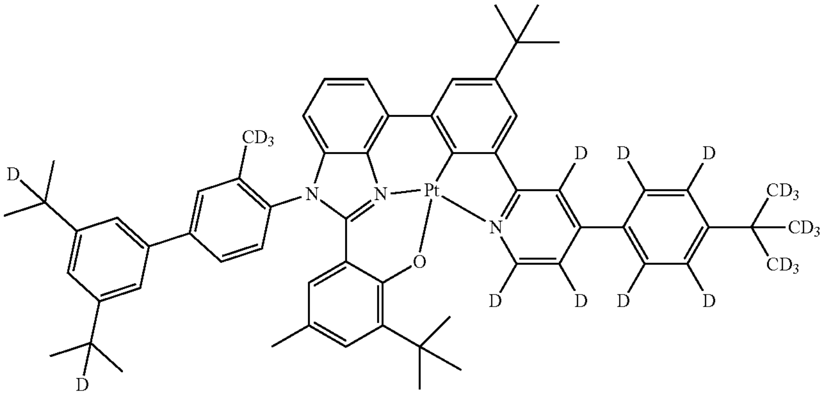
2743
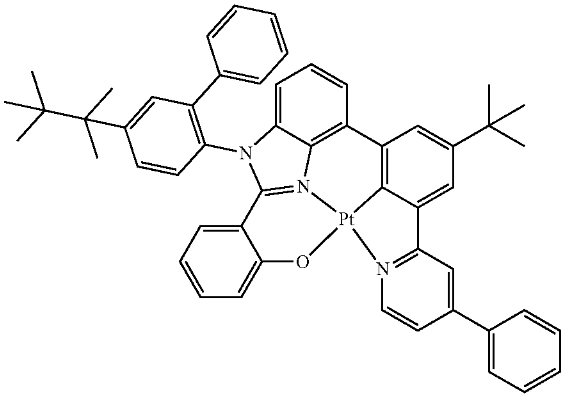
2744
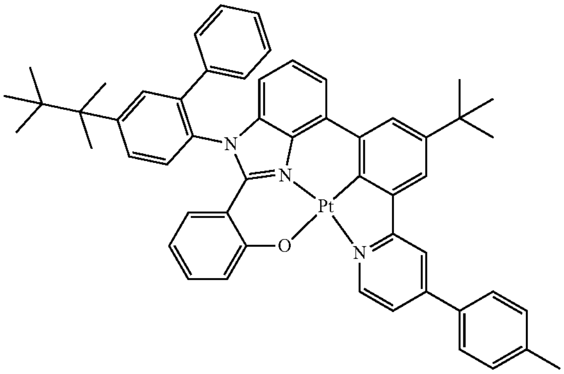
2745
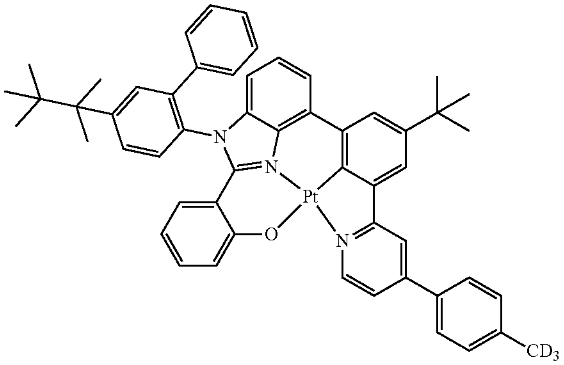
2746
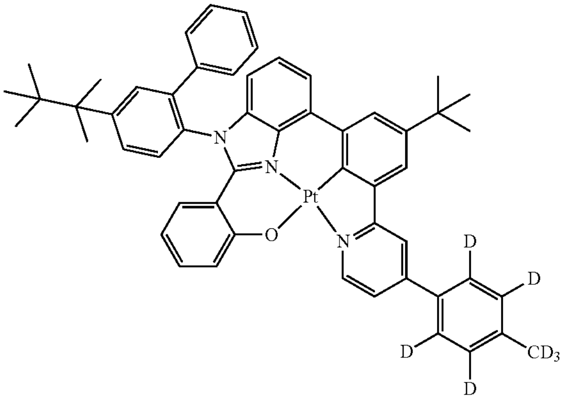

-continued
2747
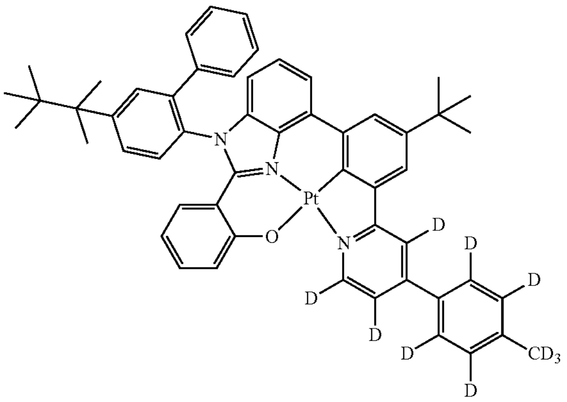
2748
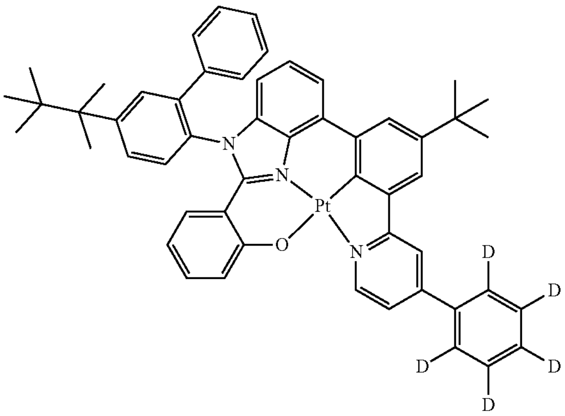
2749
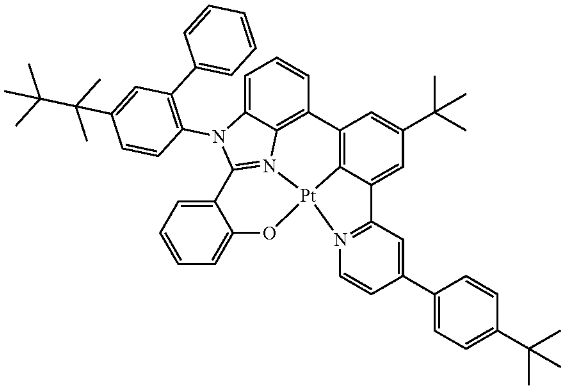
2750
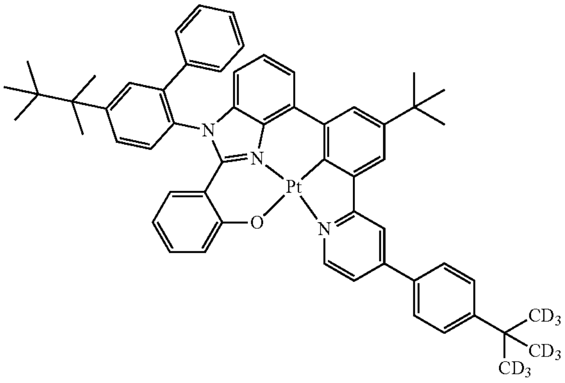
2751
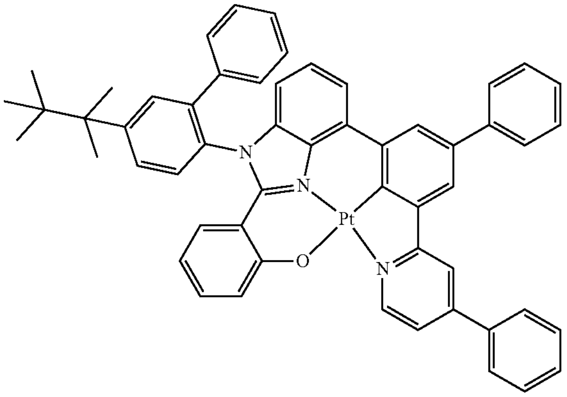
2752
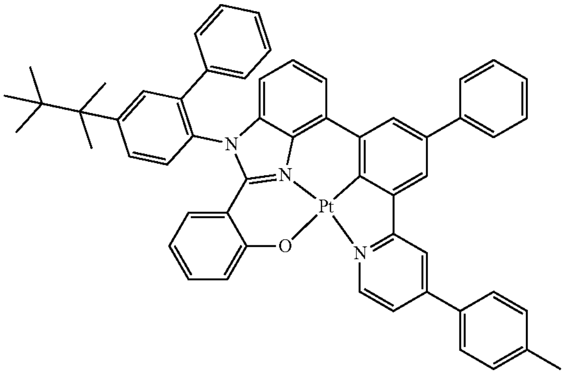

-continued
2753
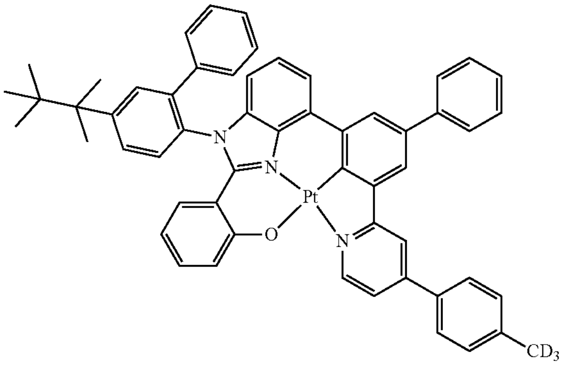
2754
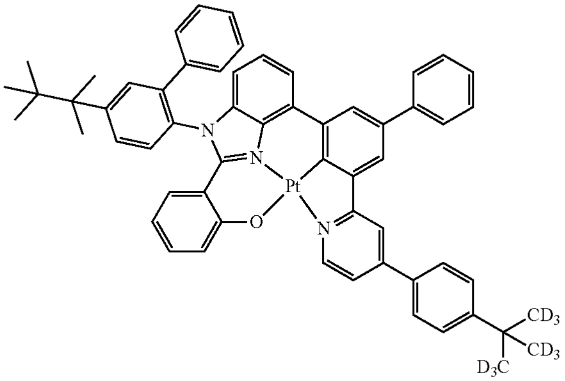
2755
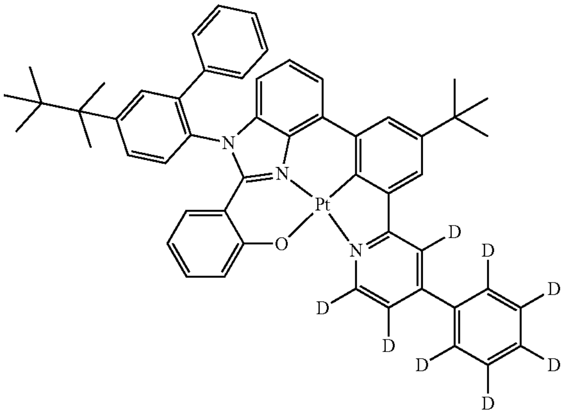
2756
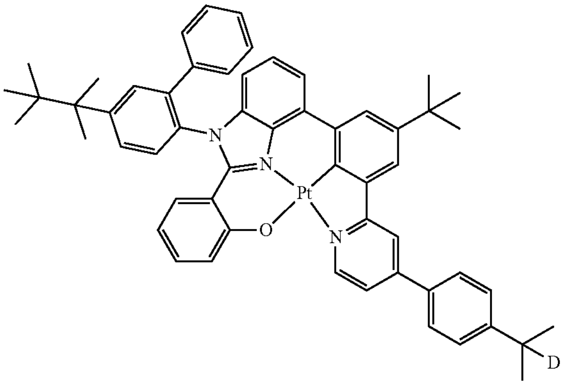
2757
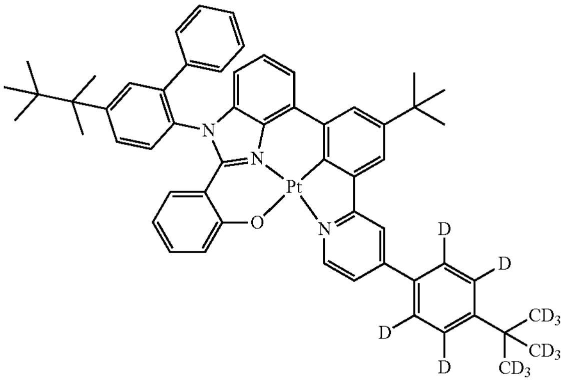
2758
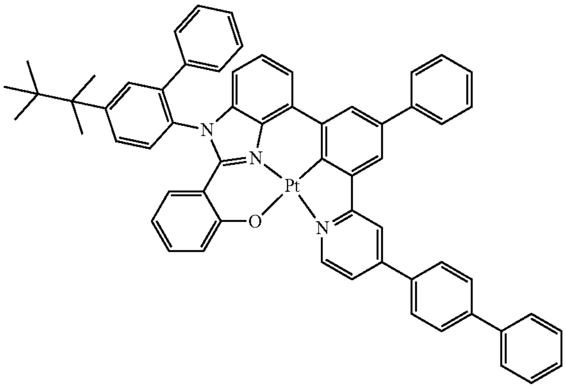

-continued
2759
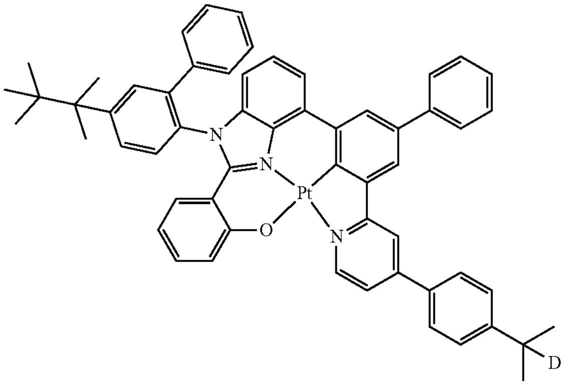
2760
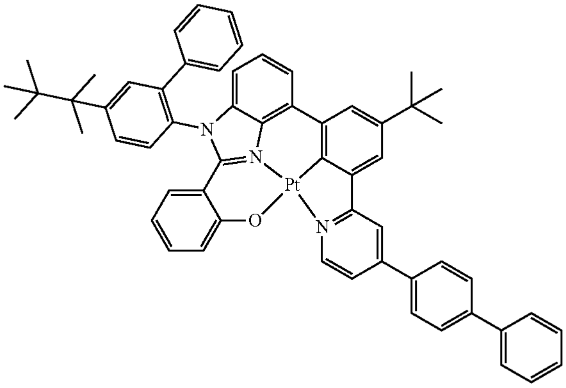
2761
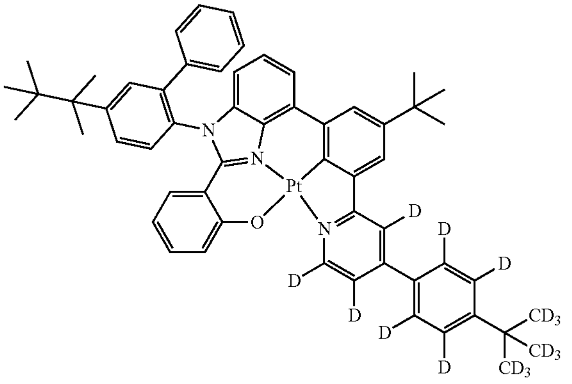
2762
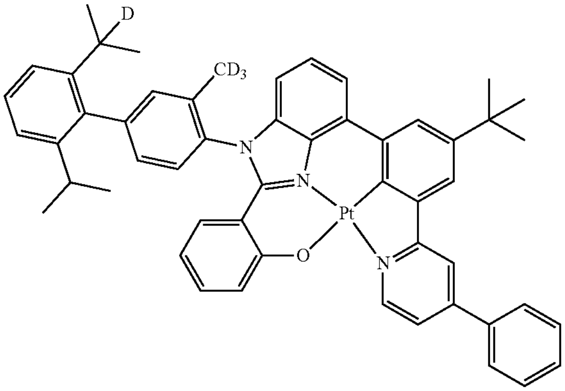
2763
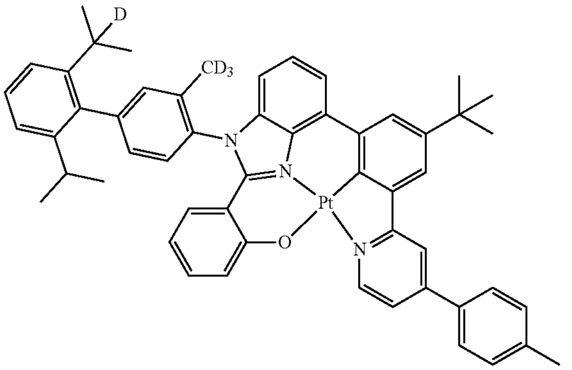
2764
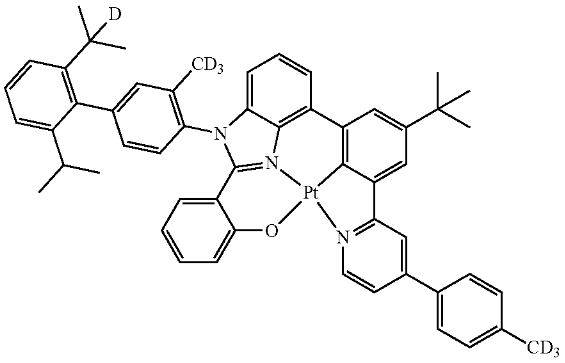
2765
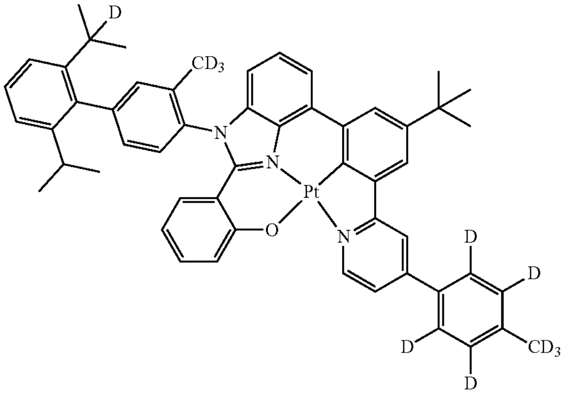
2766
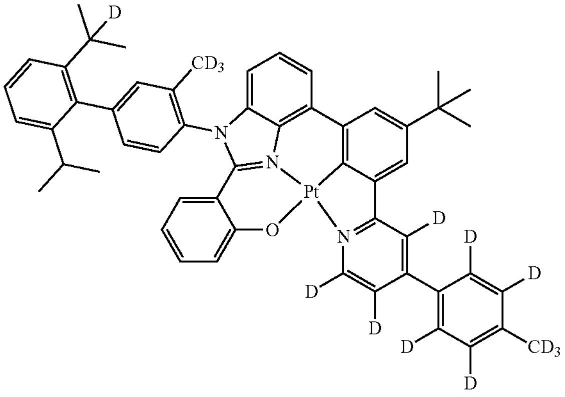

-continued
2767
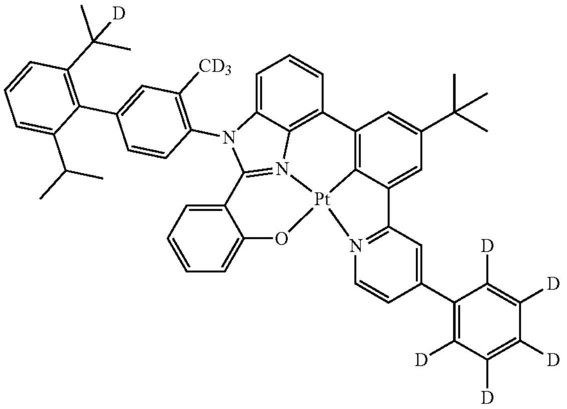
2768
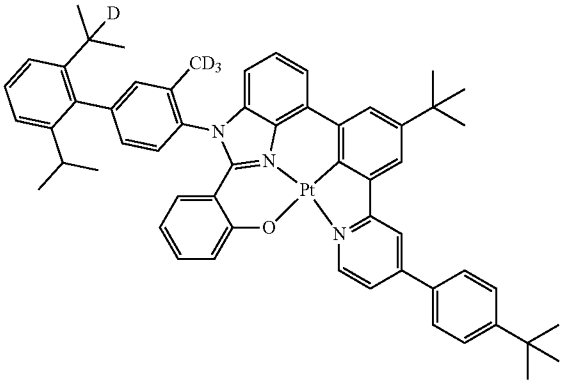
2769
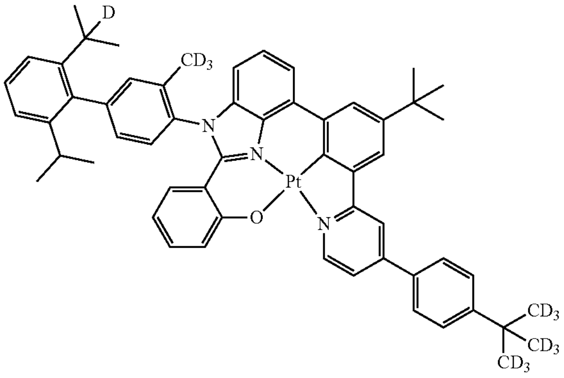
2770
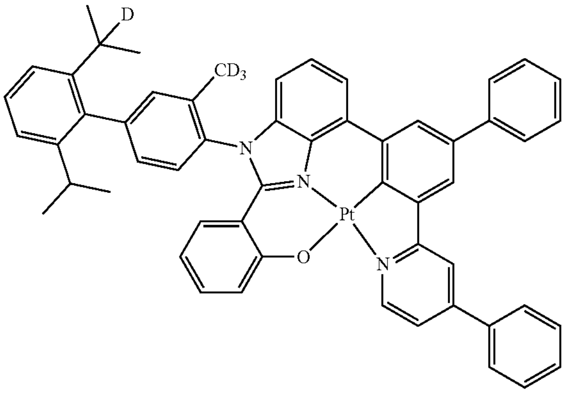
2771
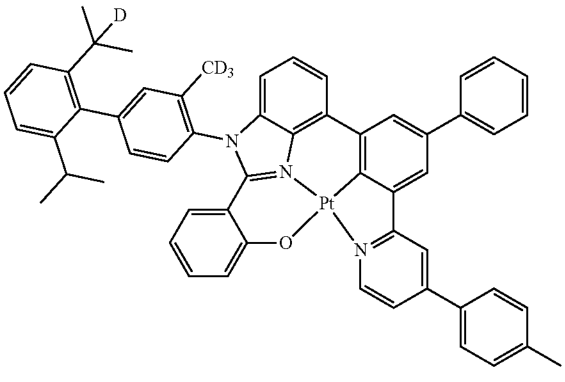
2772
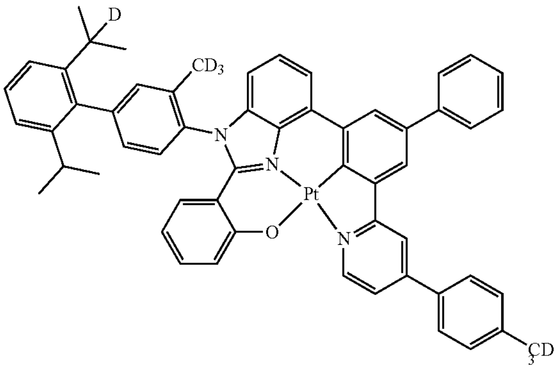

-continued
2773
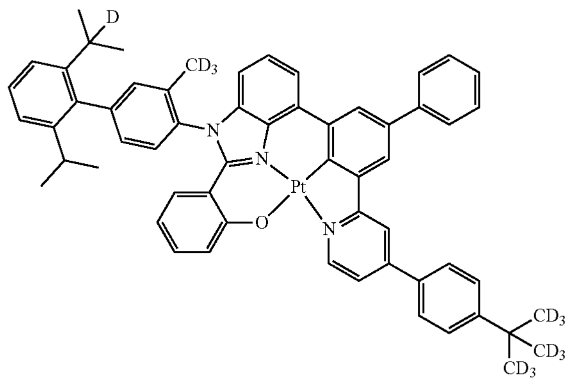
2774
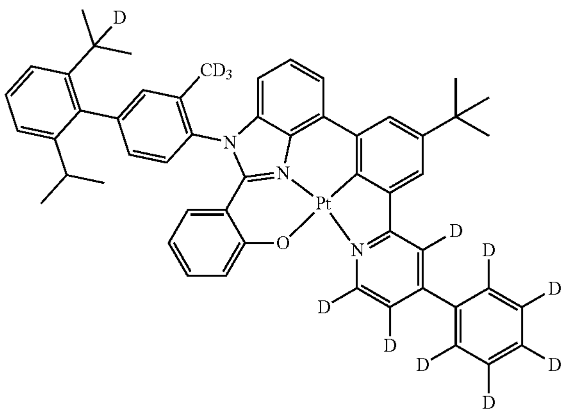
2775
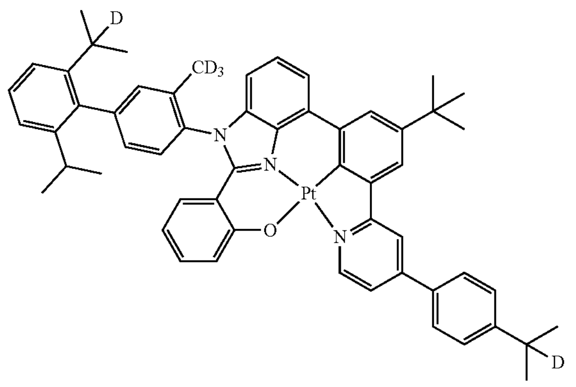
2776
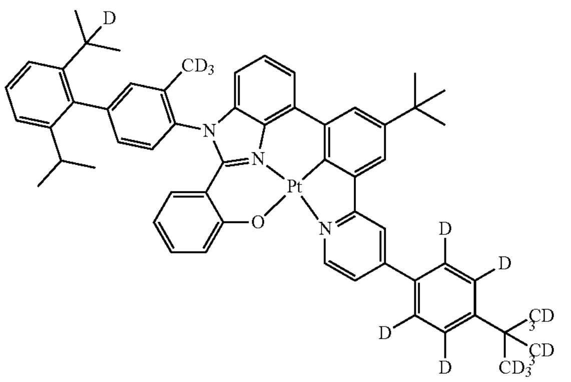
2777
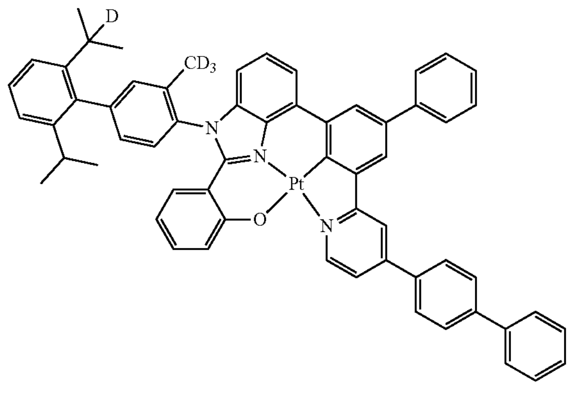
2778
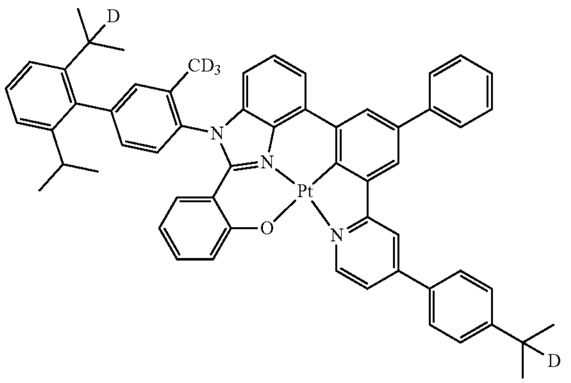

-continued
2779
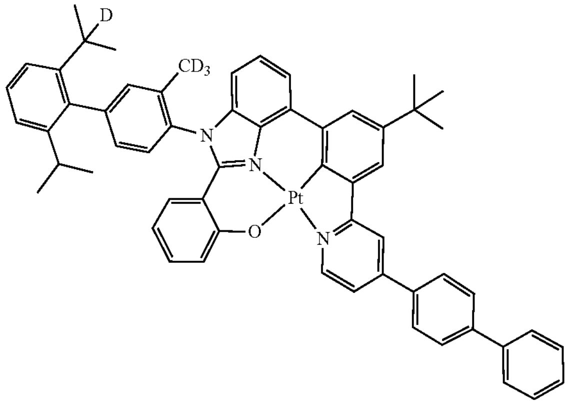
2780
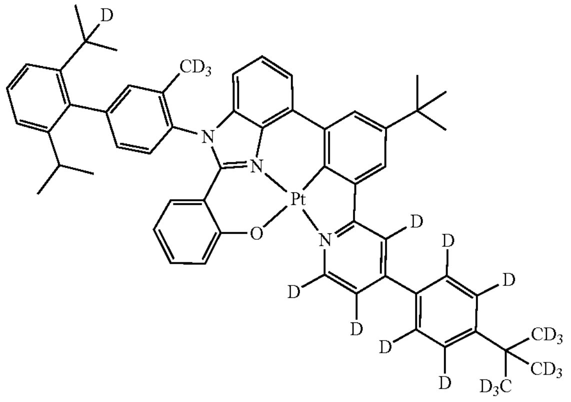
2781
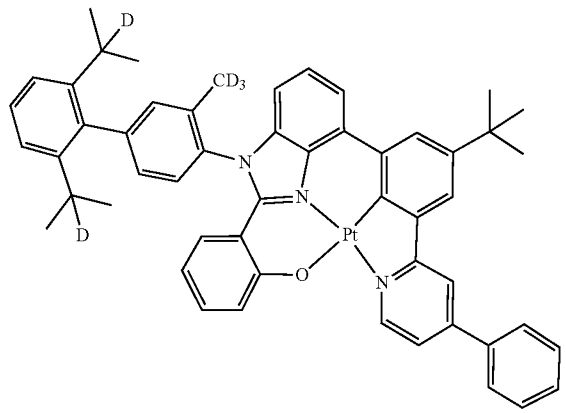
2782
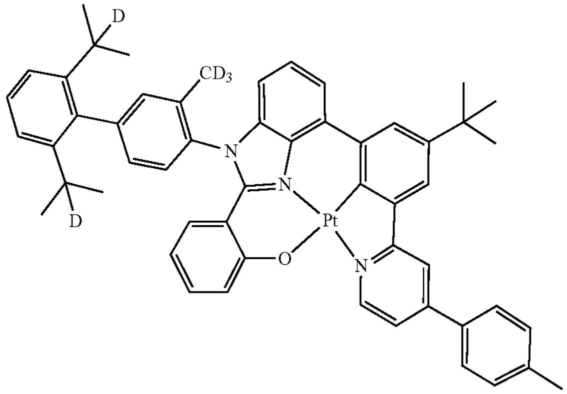
2783
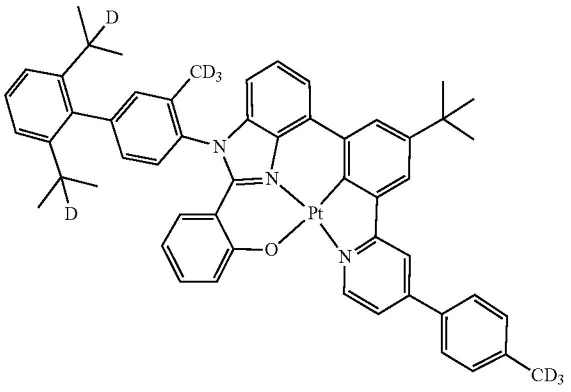
2784
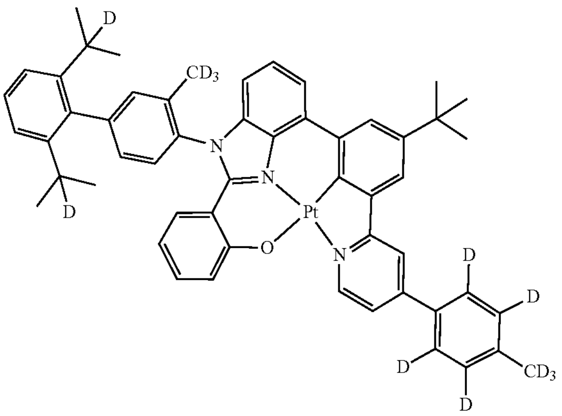

-continued
2785
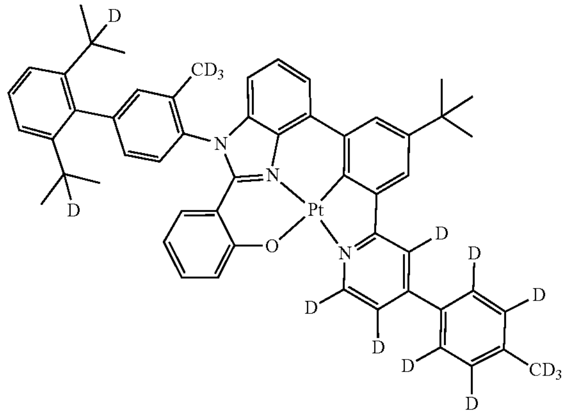
2786
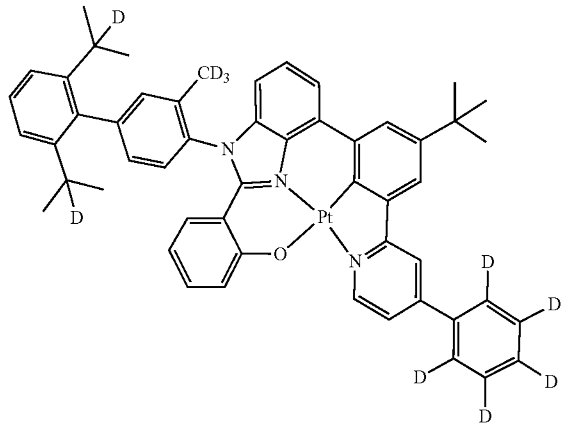
2787
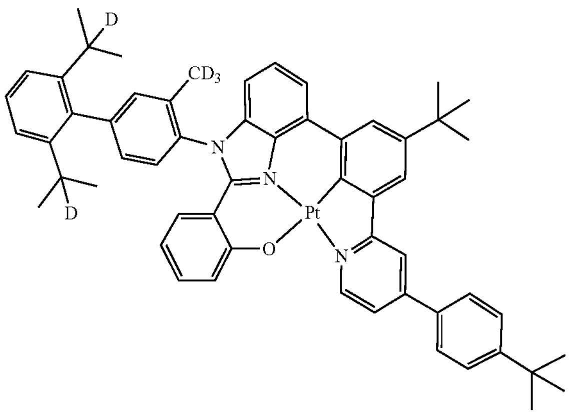
-continued
2788
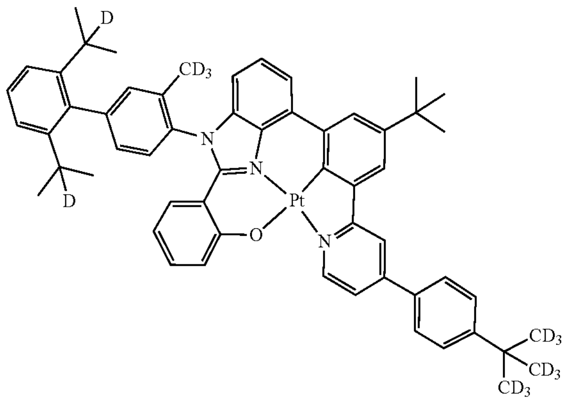
2789
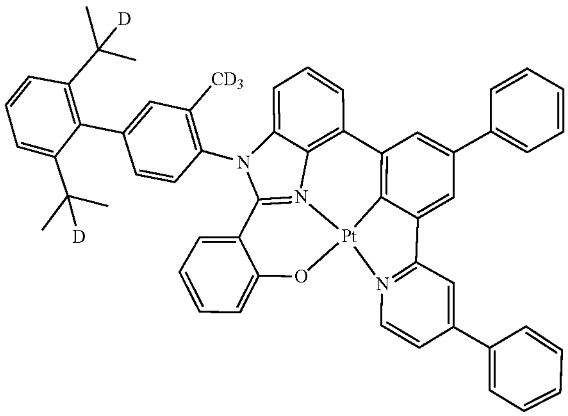
2790
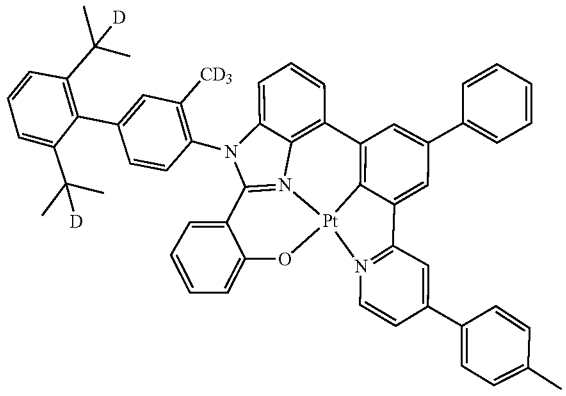

-continued
2791
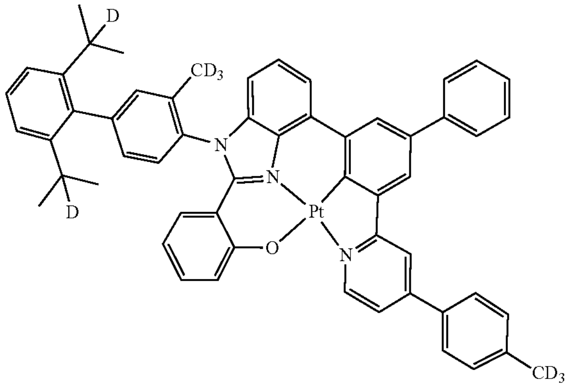
2792
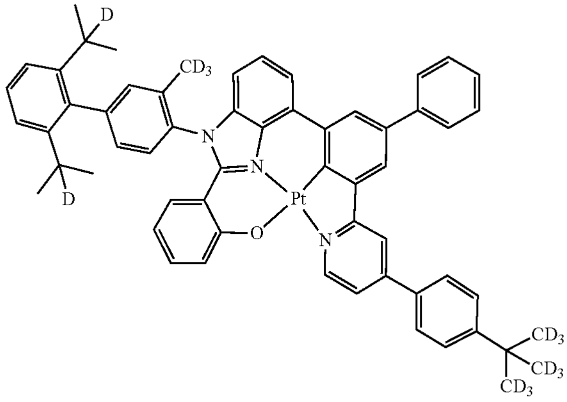
2793
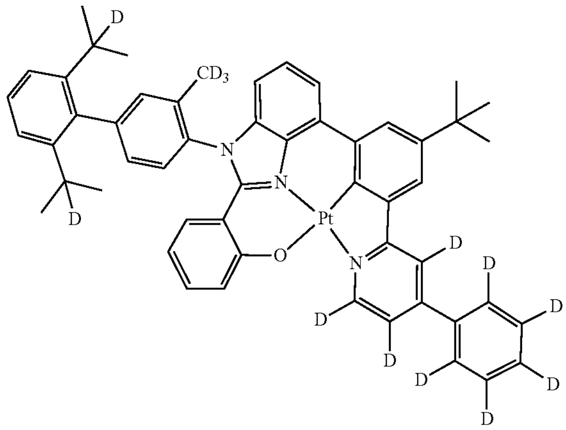
-continued
2794
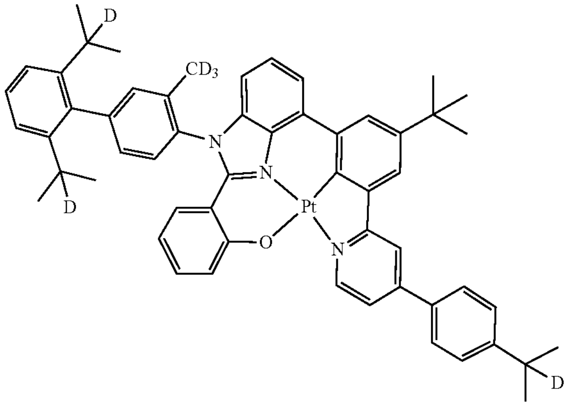
2795
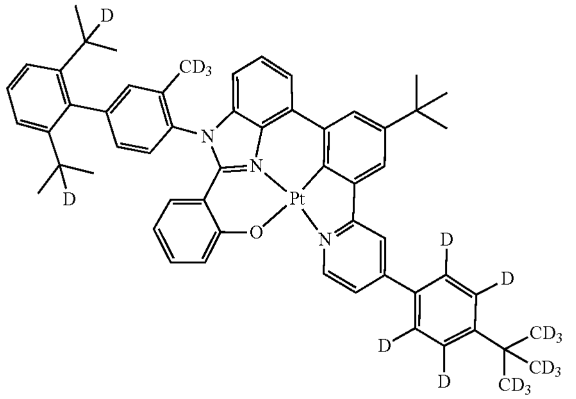
2796
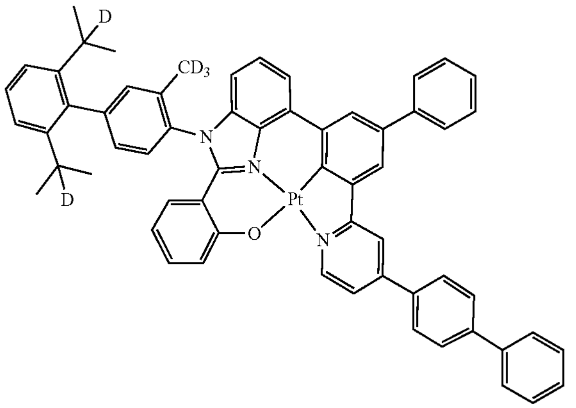

-continued
2797
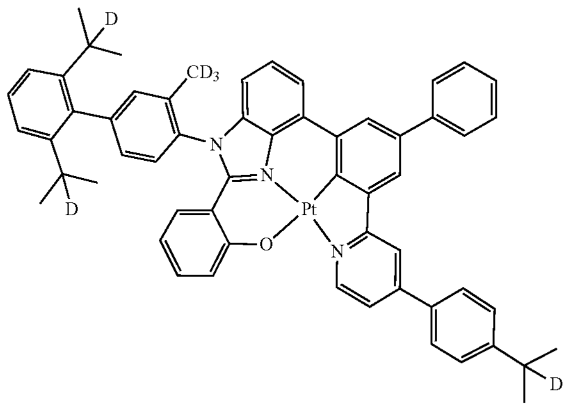
2798
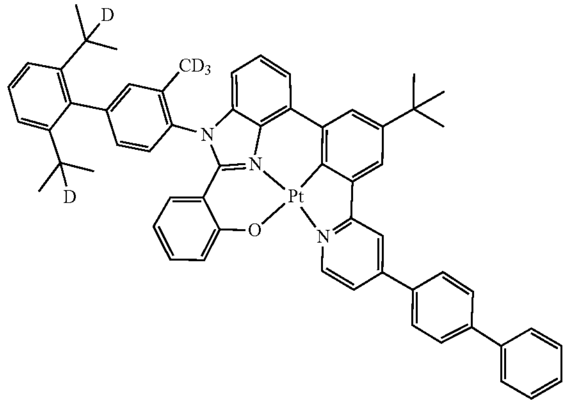
2799
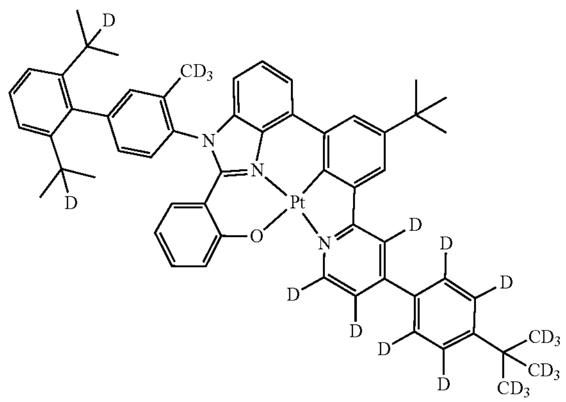
-continued
2800
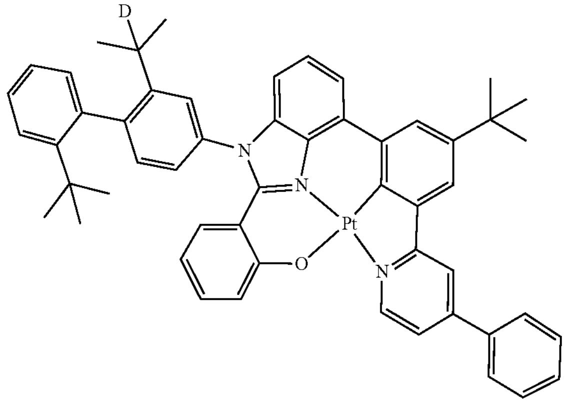
2801
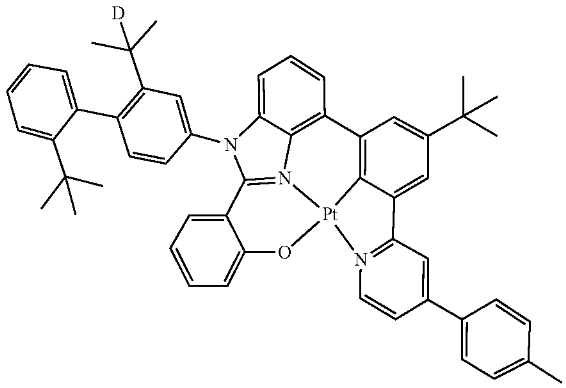
2802
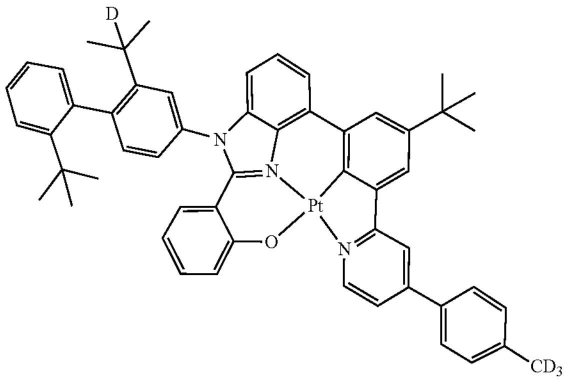

-continued
2803
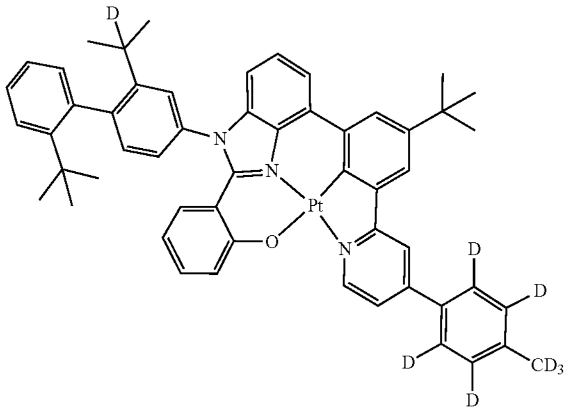
2804
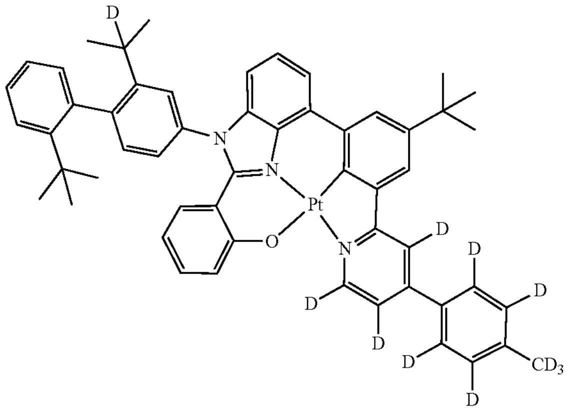
2805
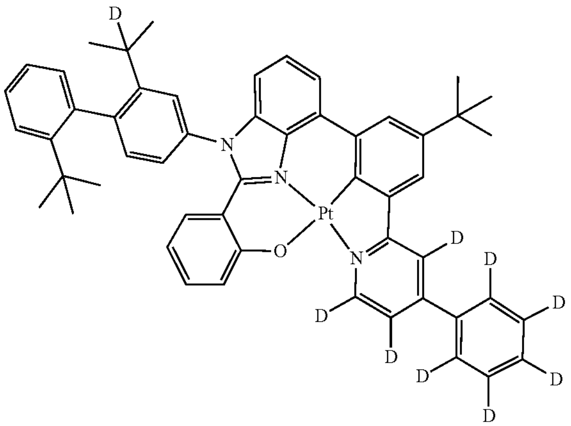
-continued
2806
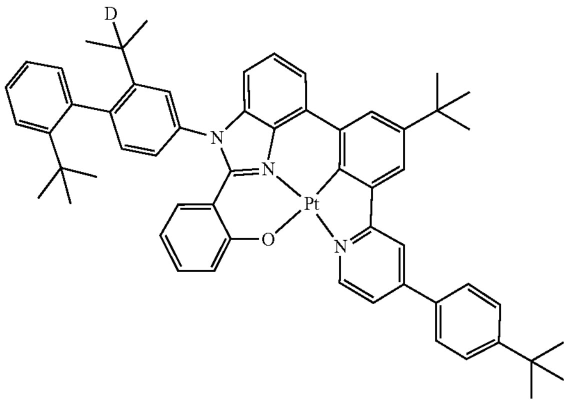
2807
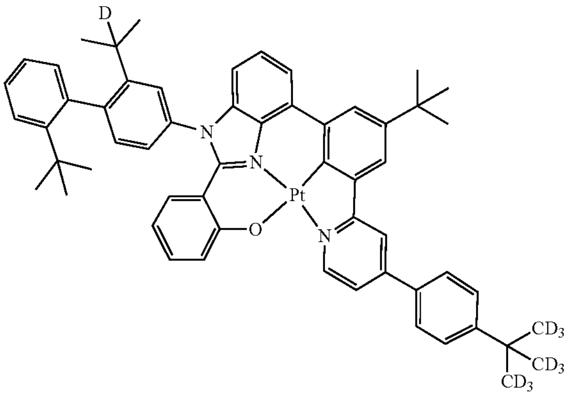
2808
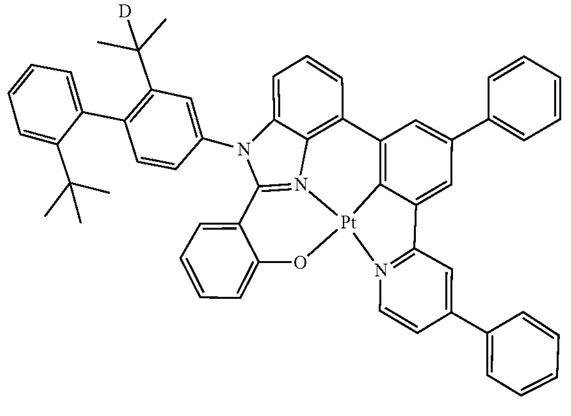

-continued
2809
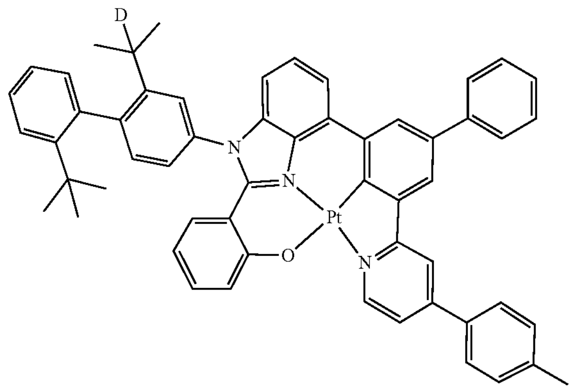
2810
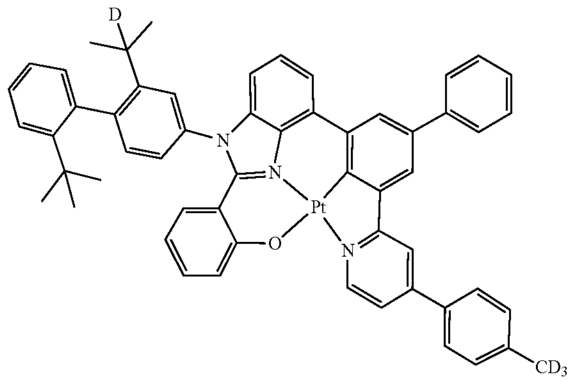
2811
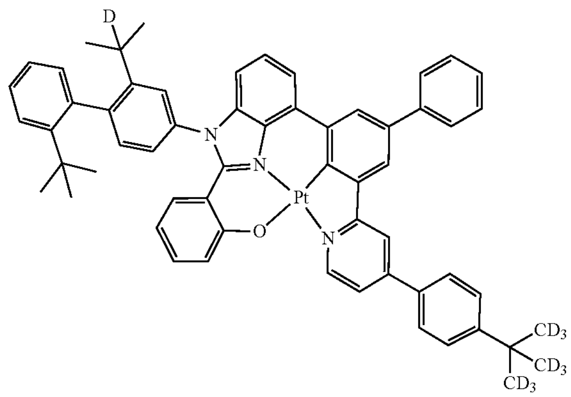
-continued
2812
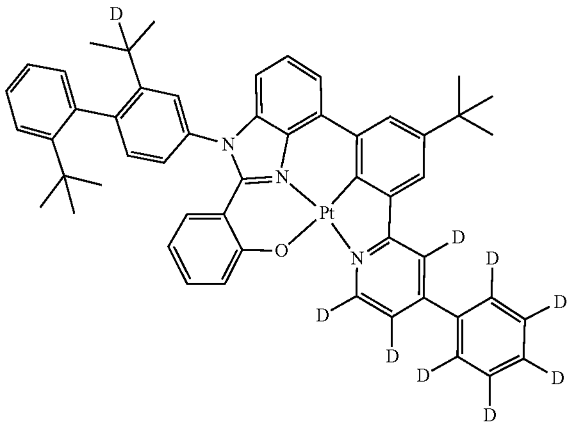
2813
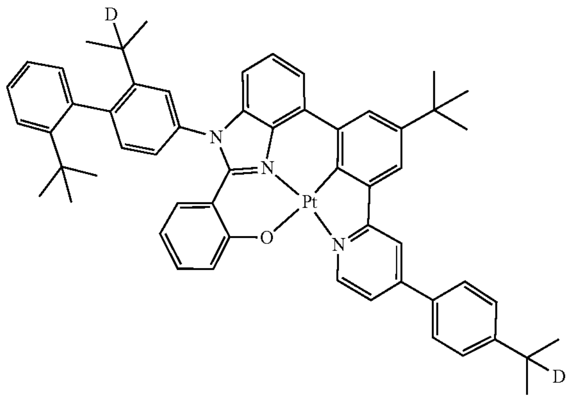
2814
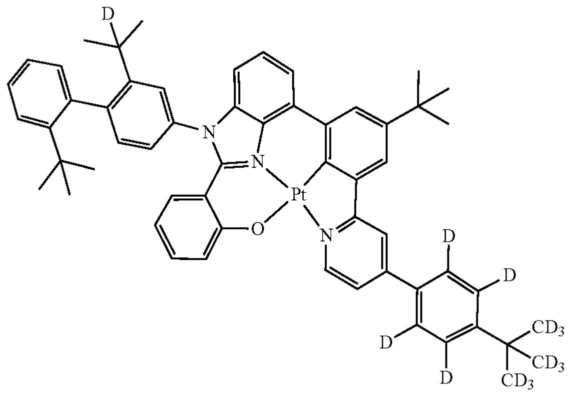

2815
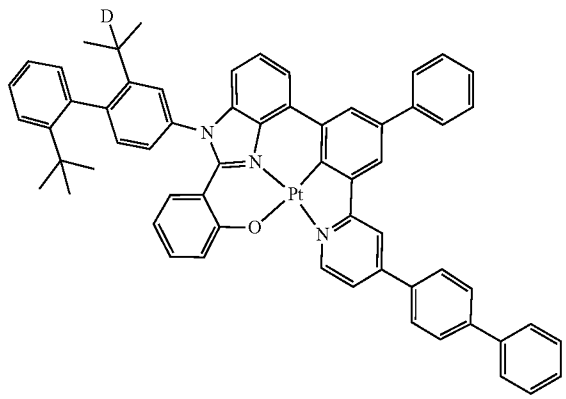
2816
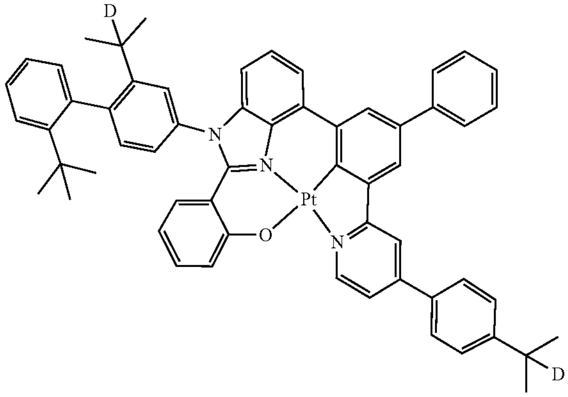
2817
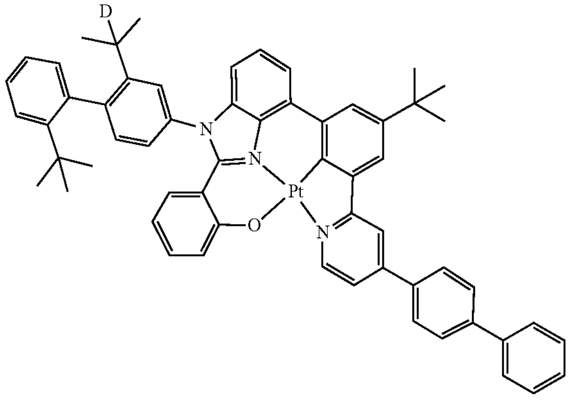
2818
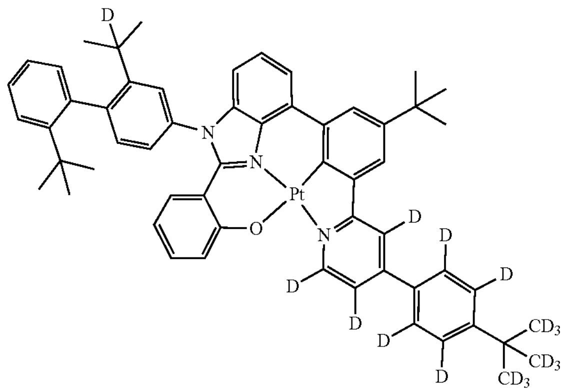
2819
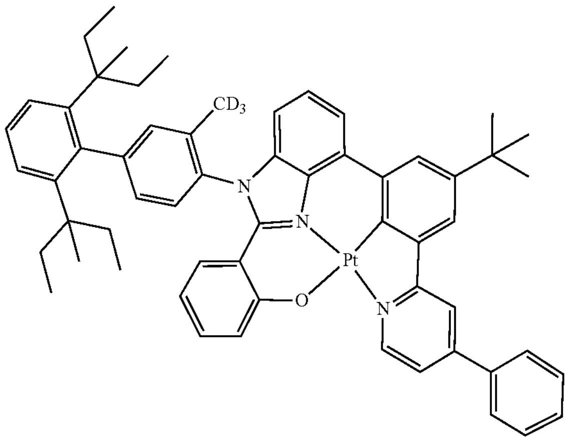
2820
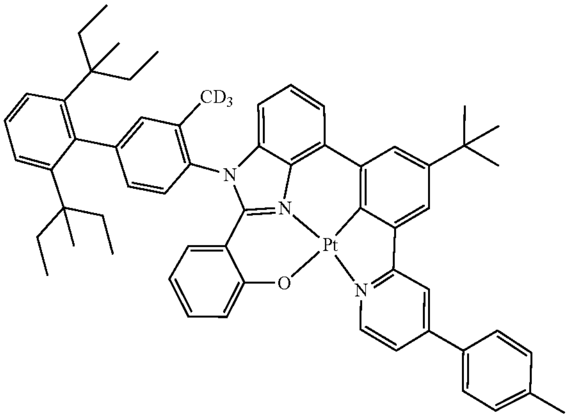

-continued
2821
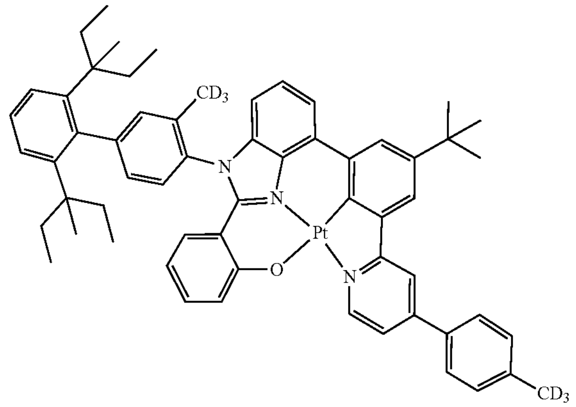
2822
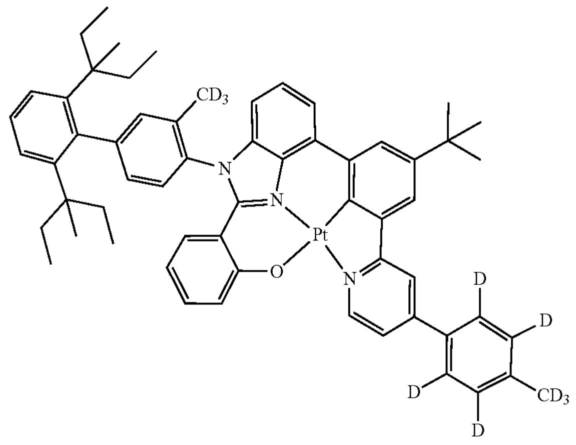
2823
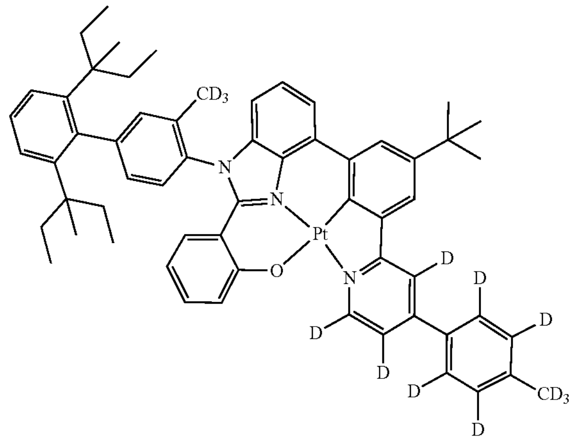
-continued
2824
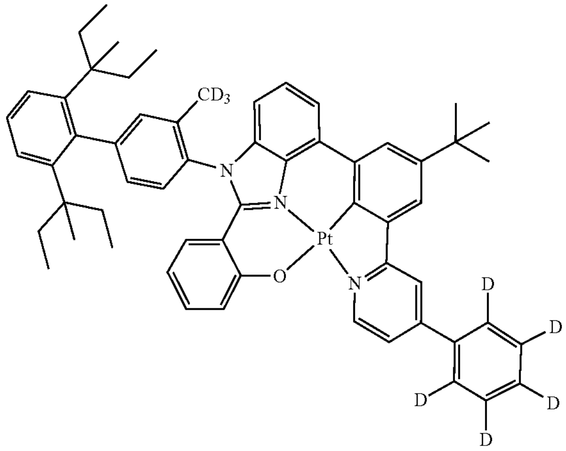
2825
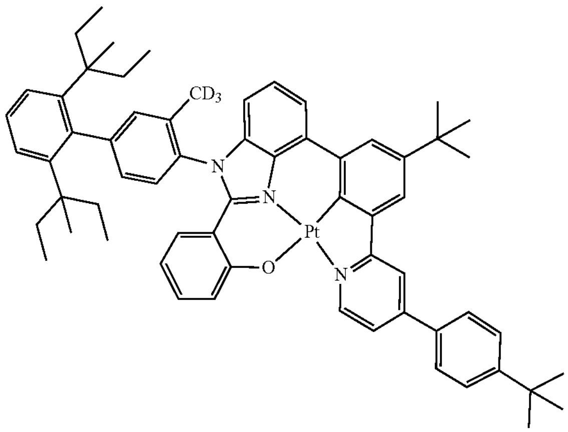
2826
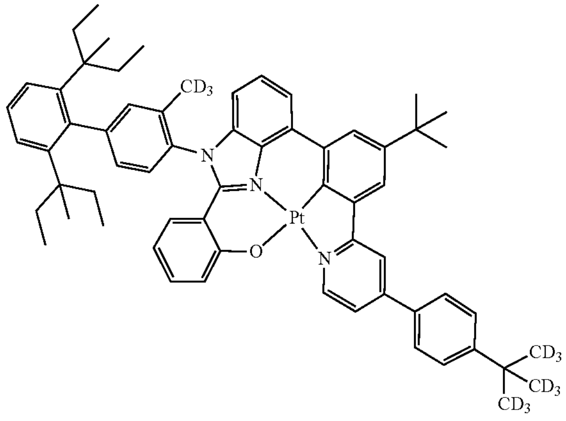

-continued
2827
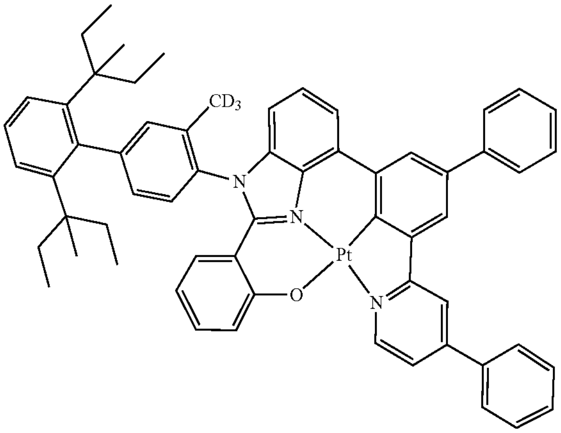
2828
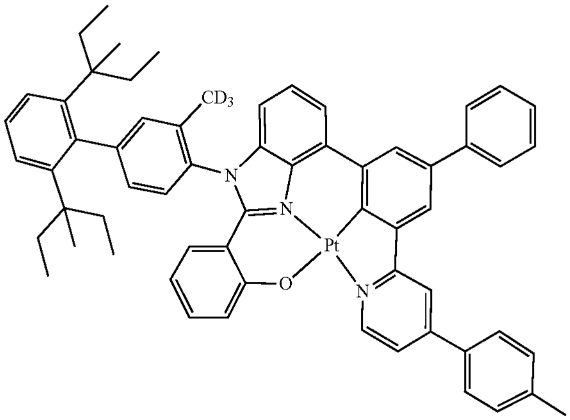
2829
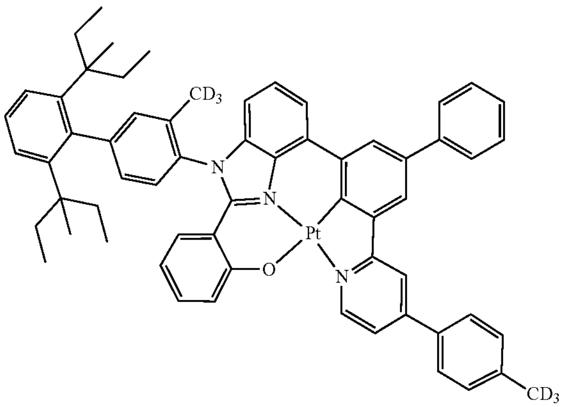
2830
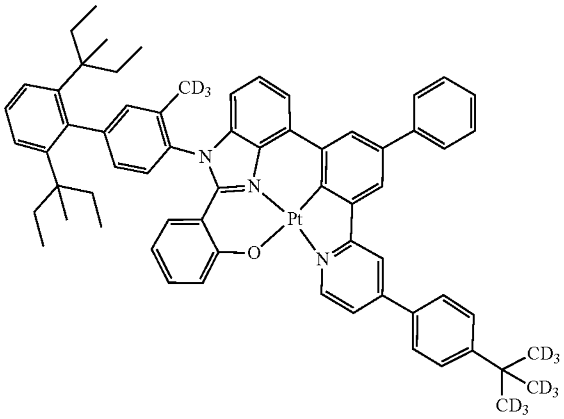
2831
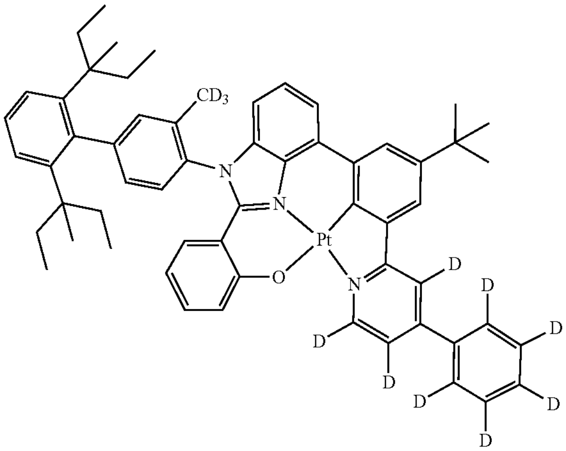
2832
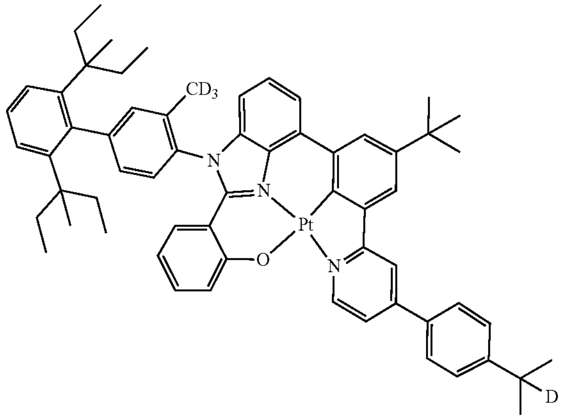

-continued
2833
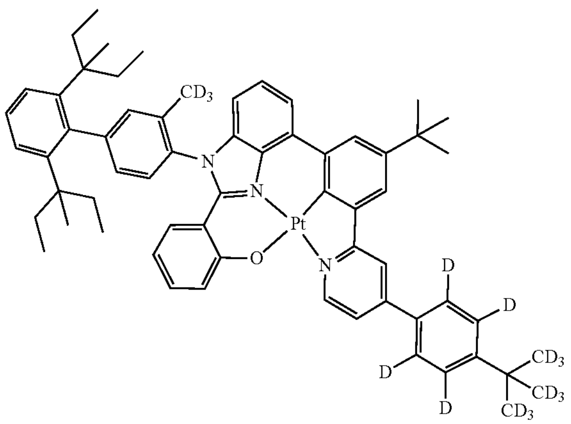
2834
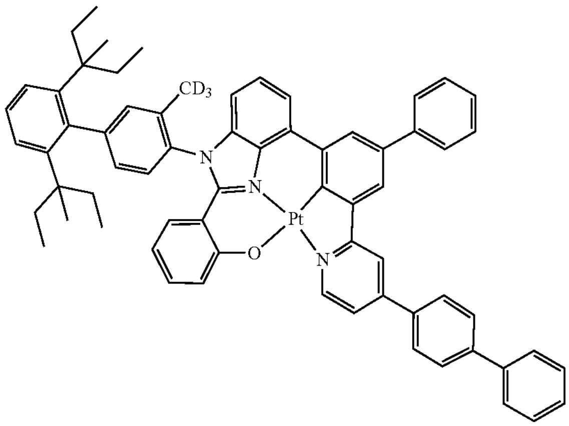
2835
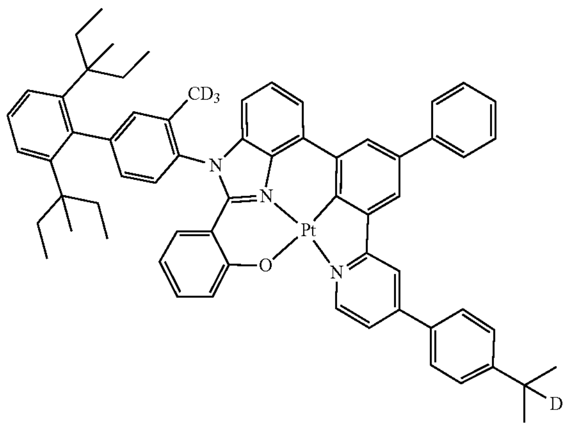
-continued
2836
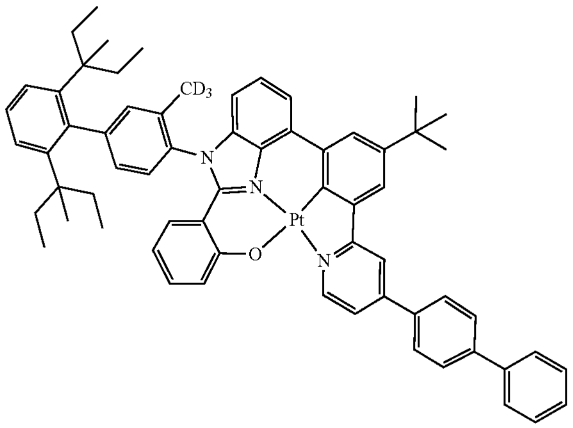
2837
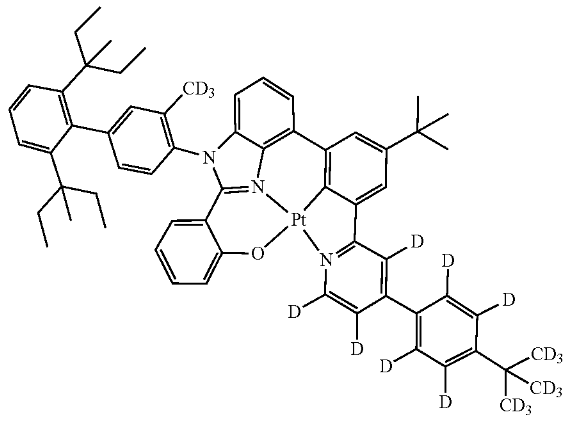
2838
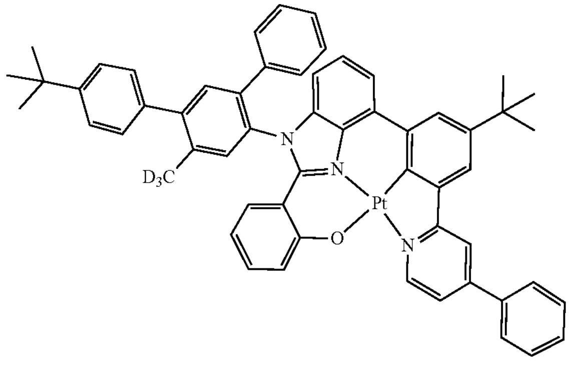
2839
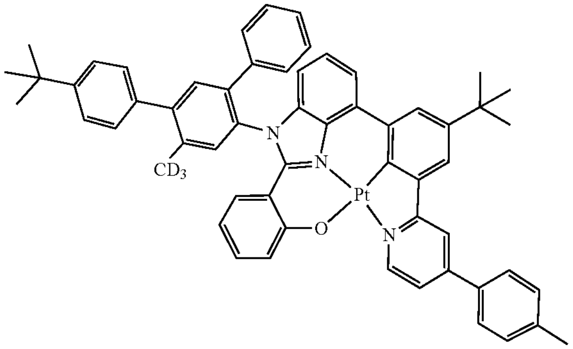

-continued
2840
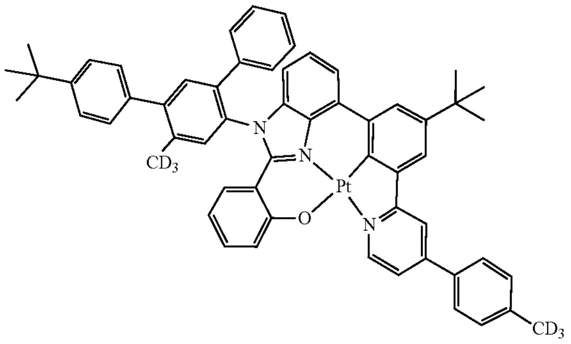
2841
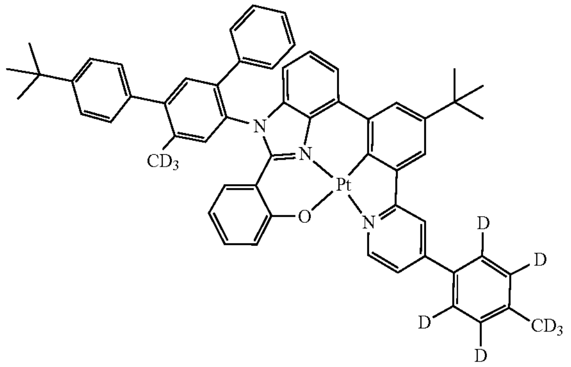
2842
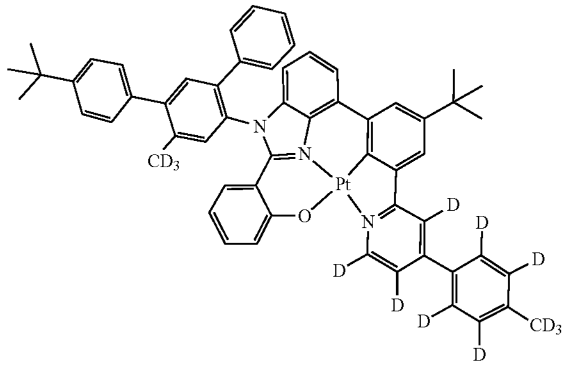
2843
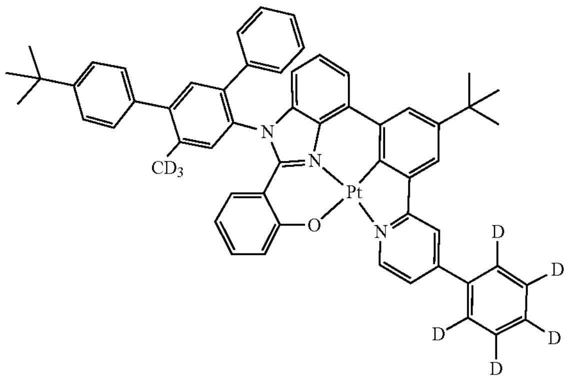
-continued
2844
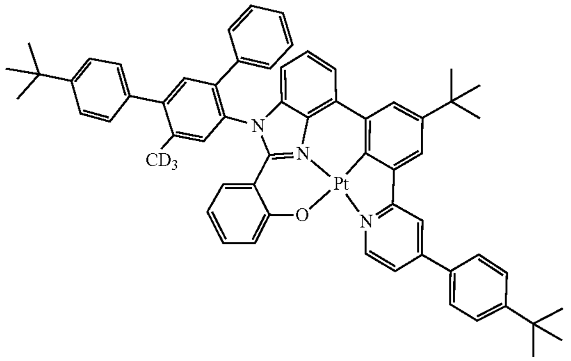
2845
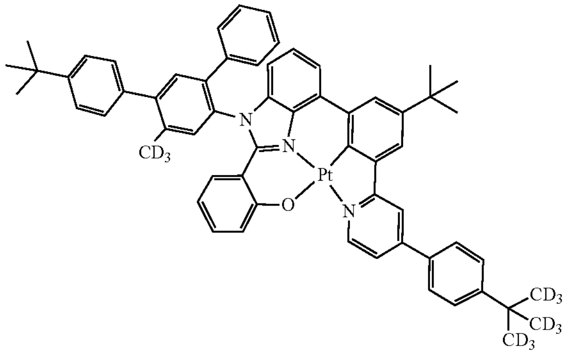
2846
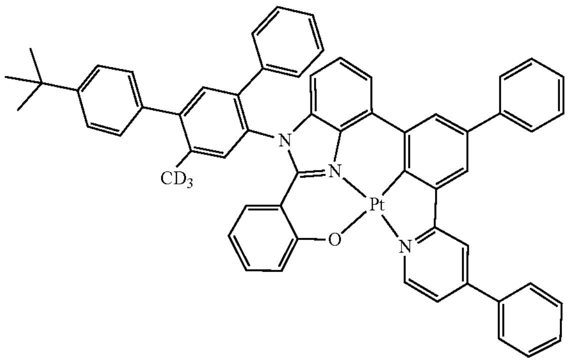
2847
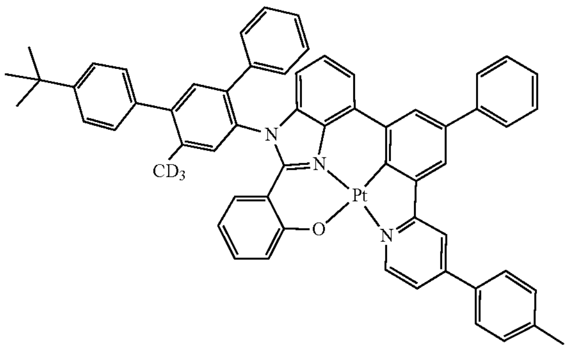

-continued
2848
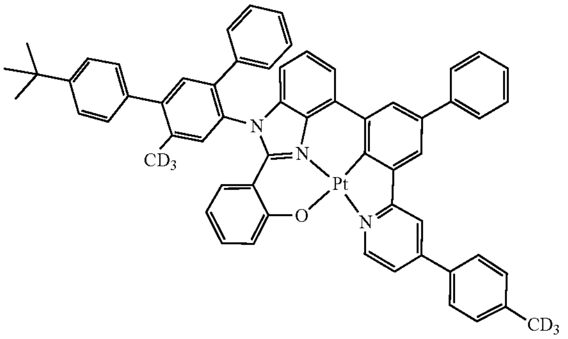
2849
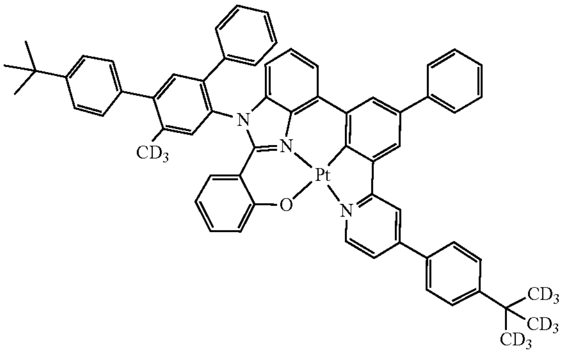
2850
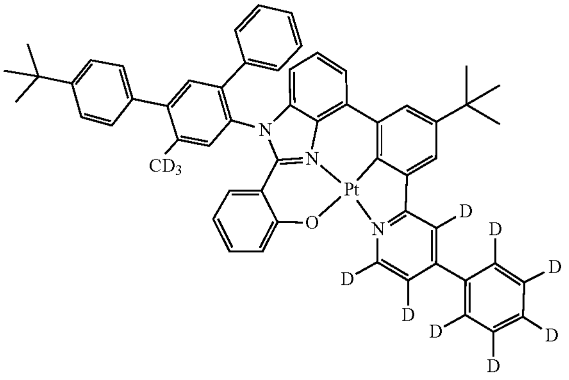
2851
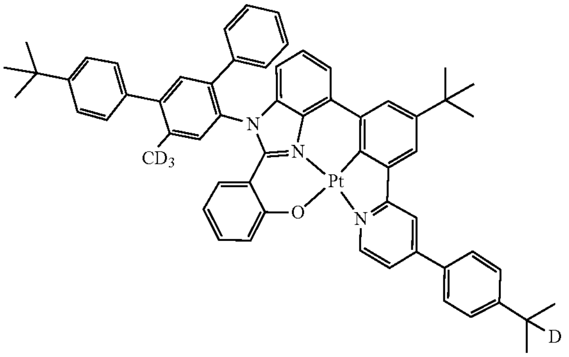
-continued
2852
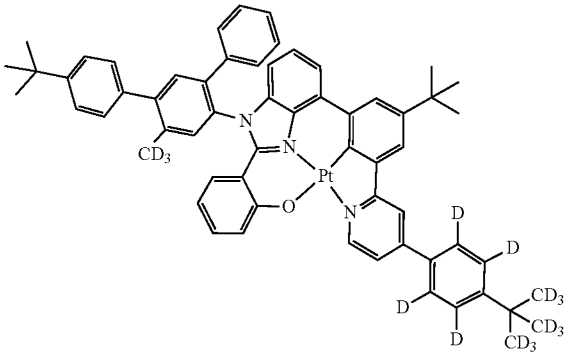
2853
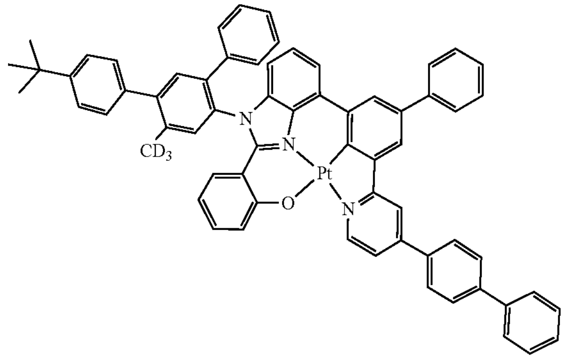
2854
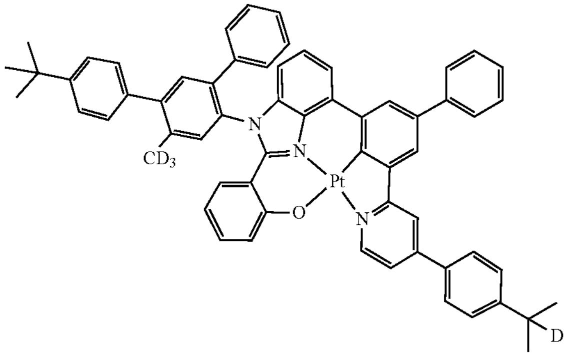
2855
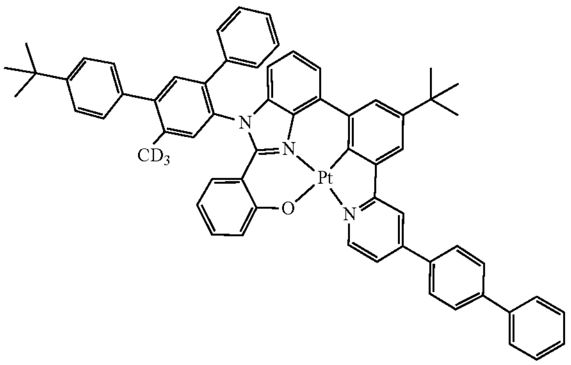

2856
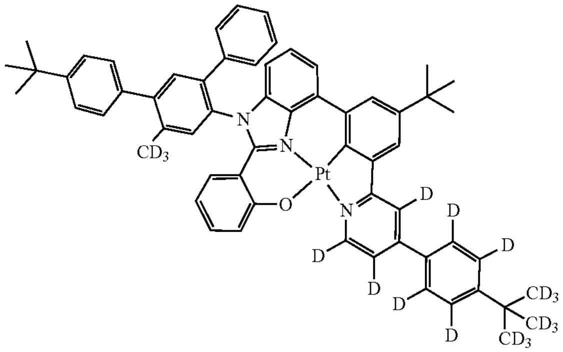
2857
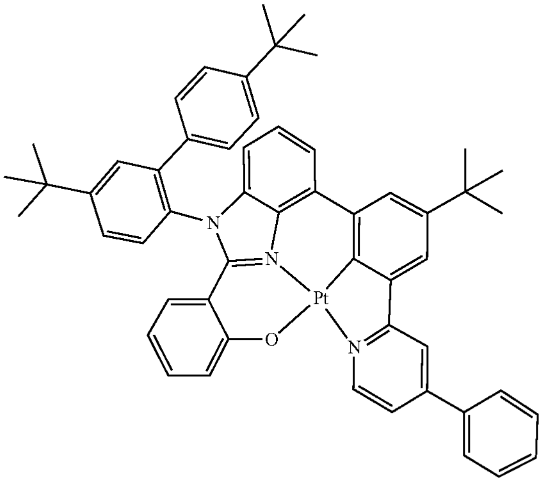
2858
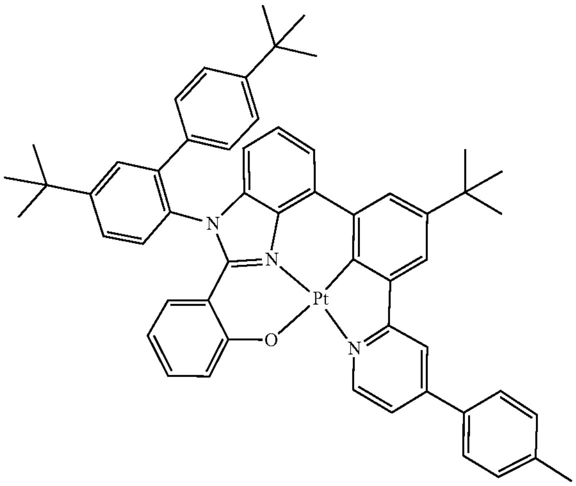
2859
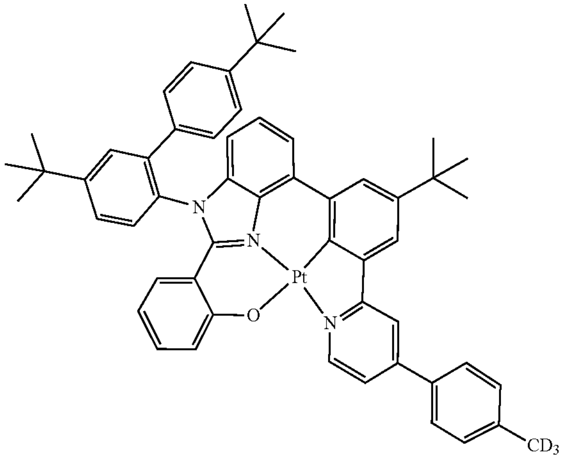
2860
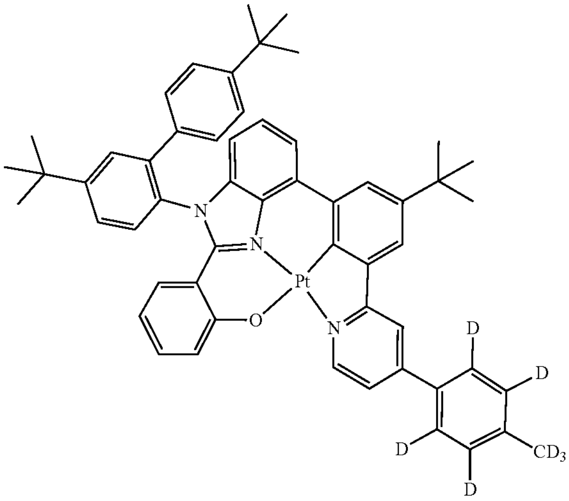
2861
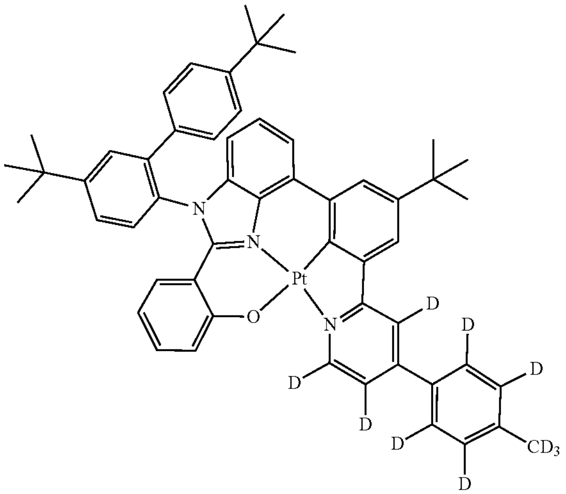

-continued
2862
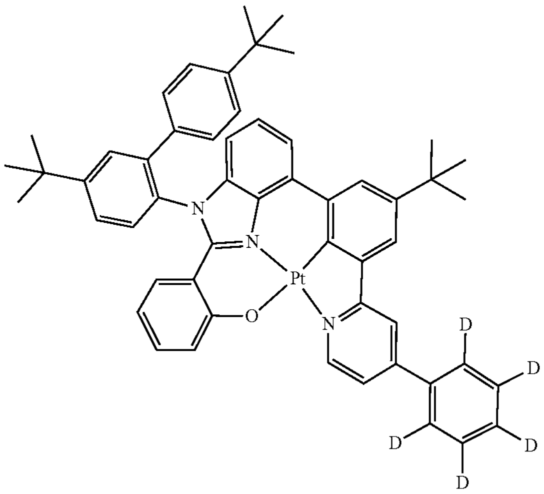
2863
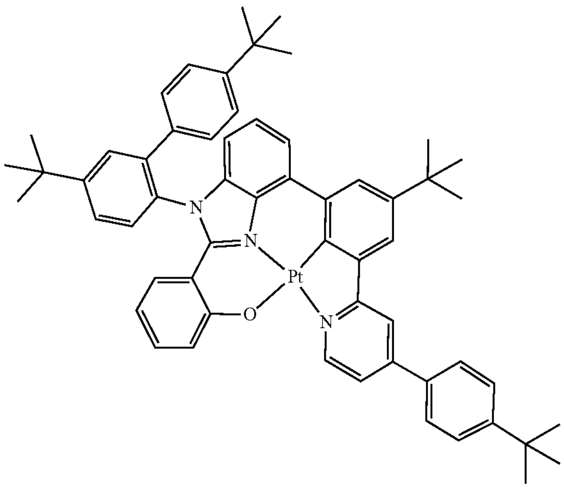
2864
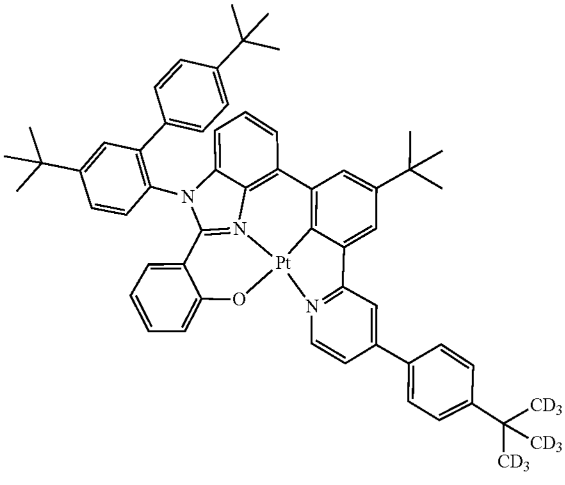
-continued
2865
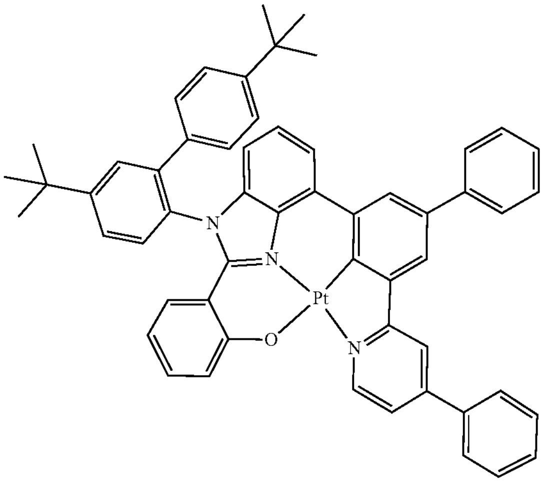
2866
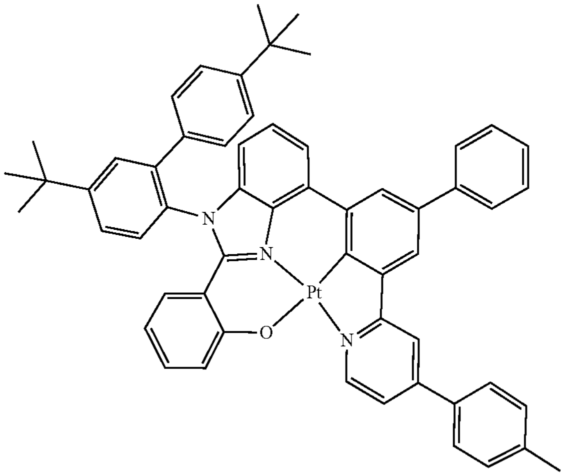
2867
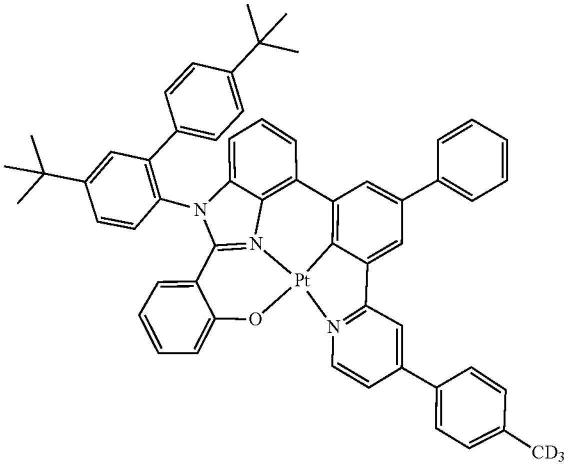

-continued
2868
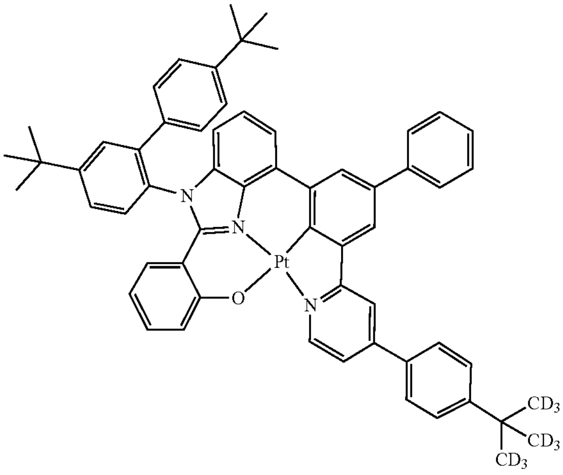
2869
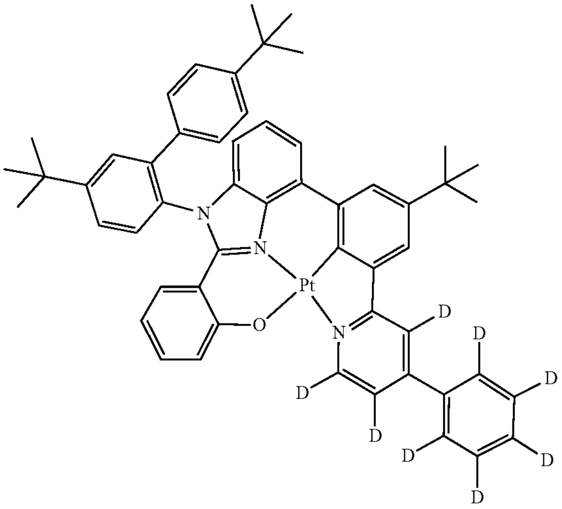
2870
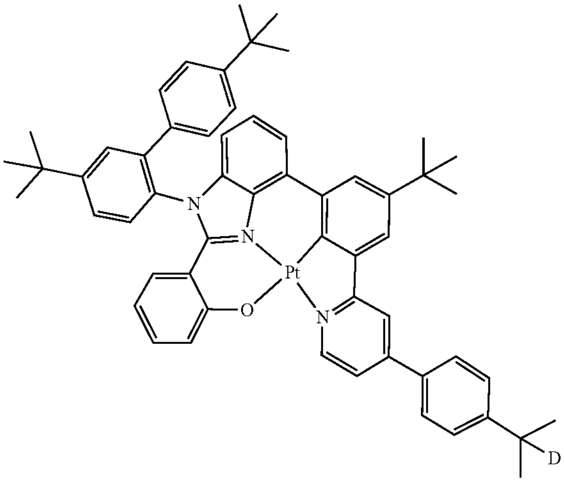
2871
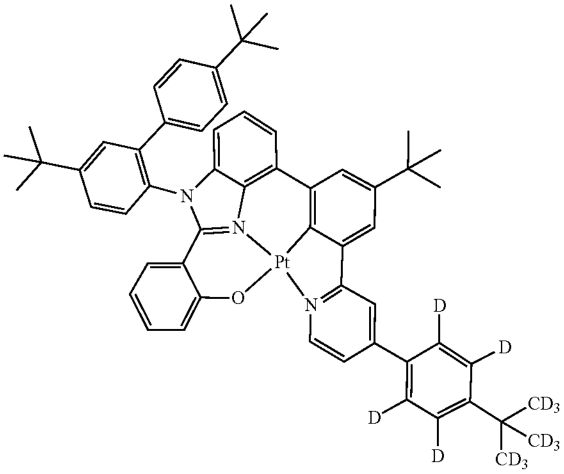
2872
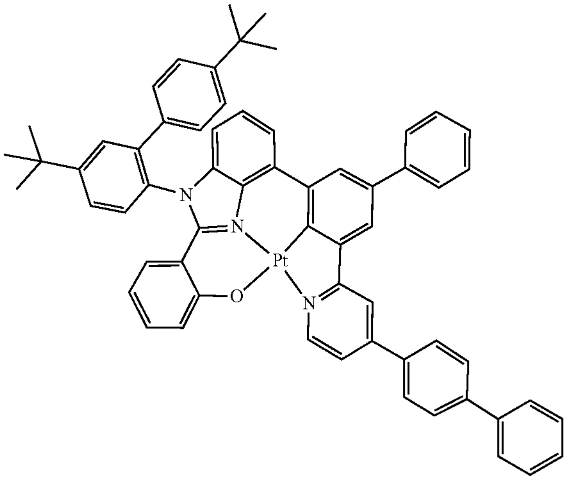
2873
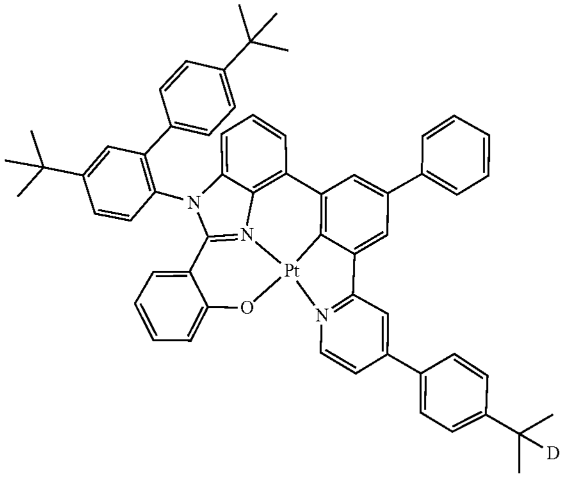

-continued
2874
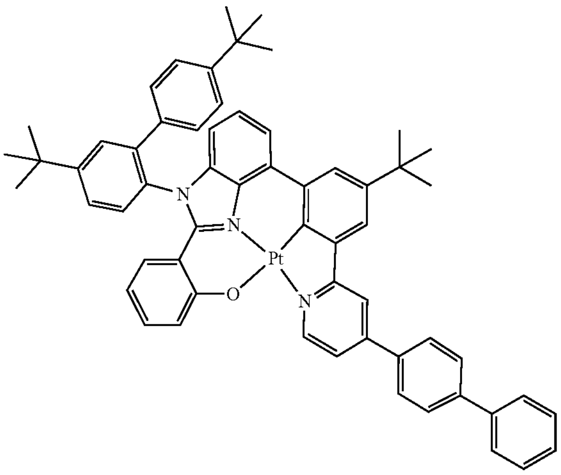
2875
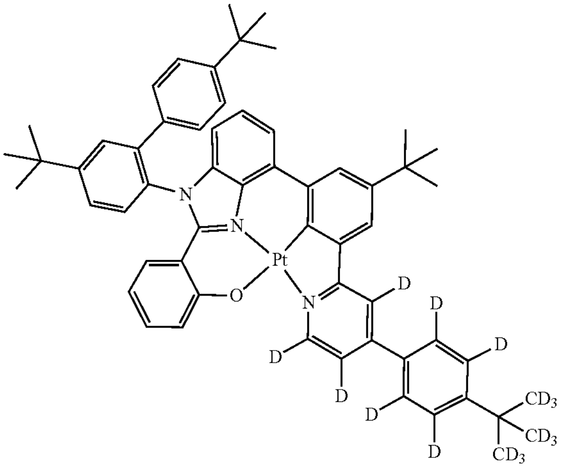
2876
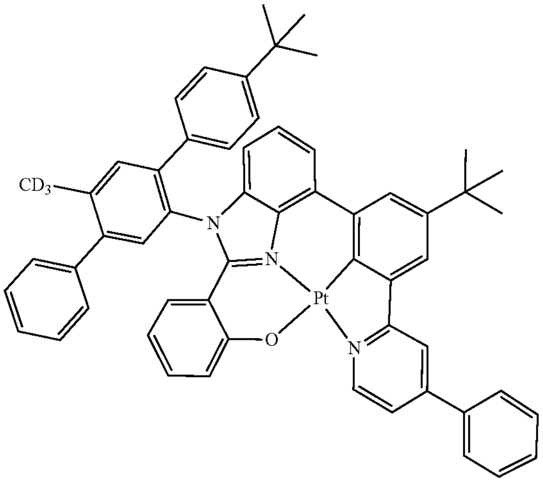
-continued
2877
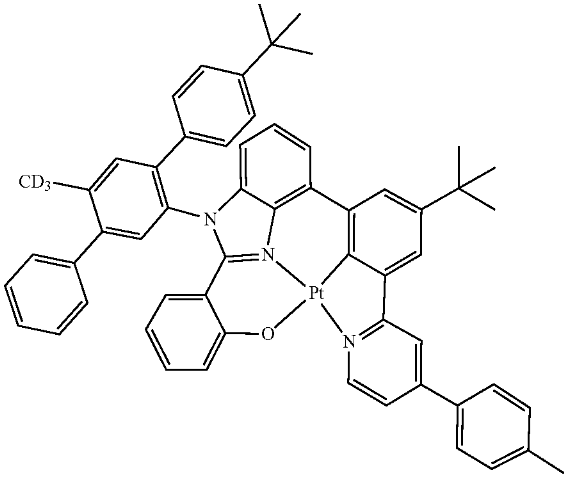
2878
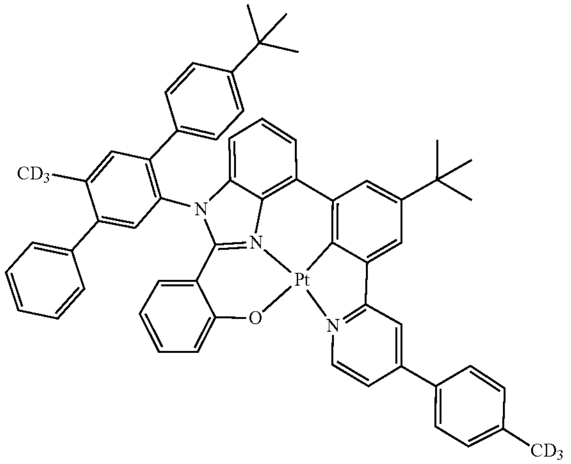
2879
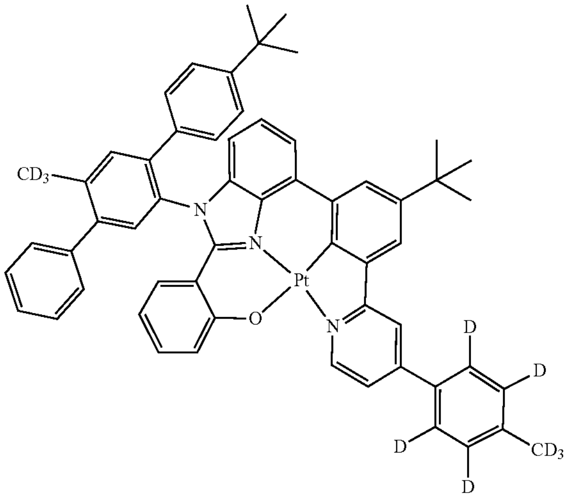

-continued
2880
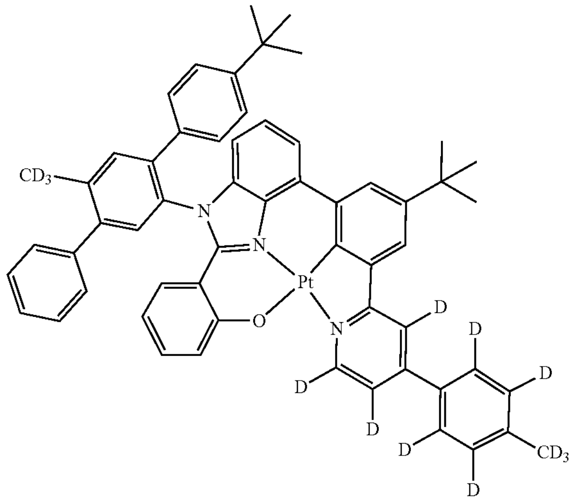
2881
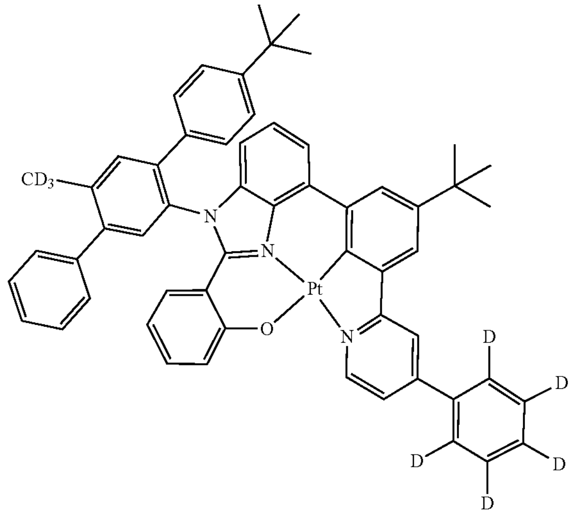
2882
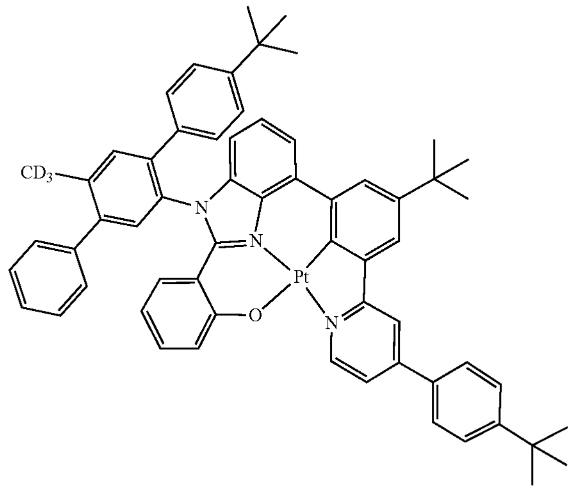
-continued
2883
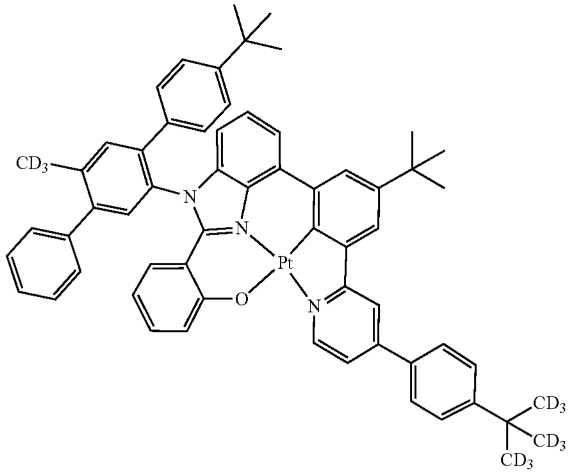
2884
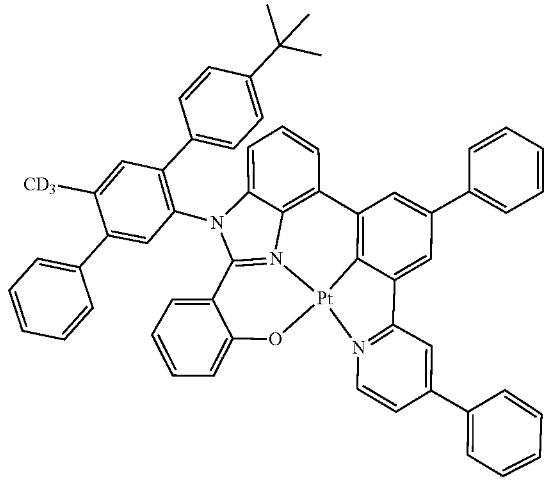
2885
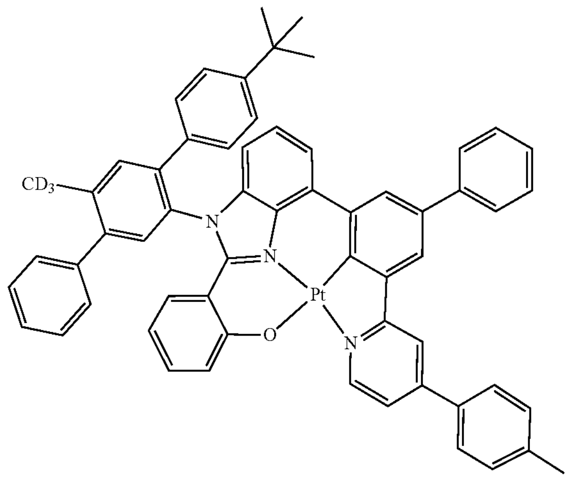

-continued
2886
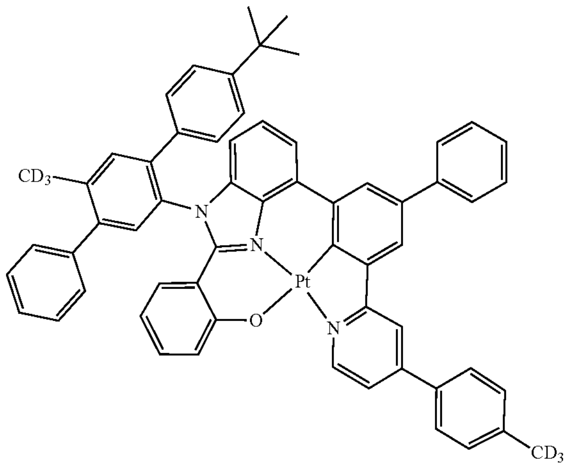
2887
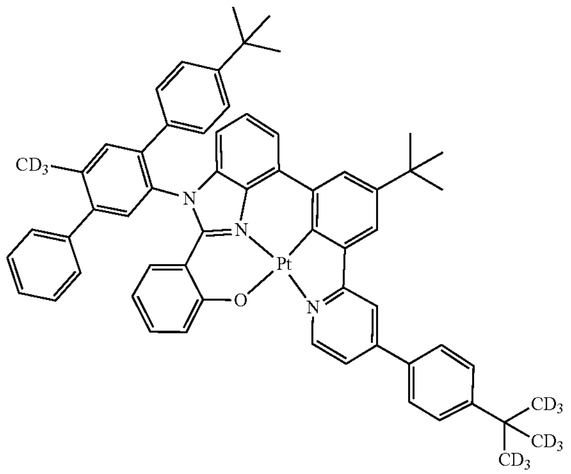
2888
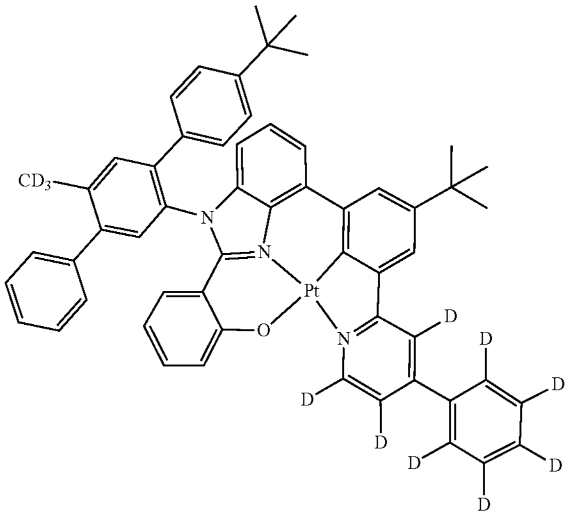
-continued
2889
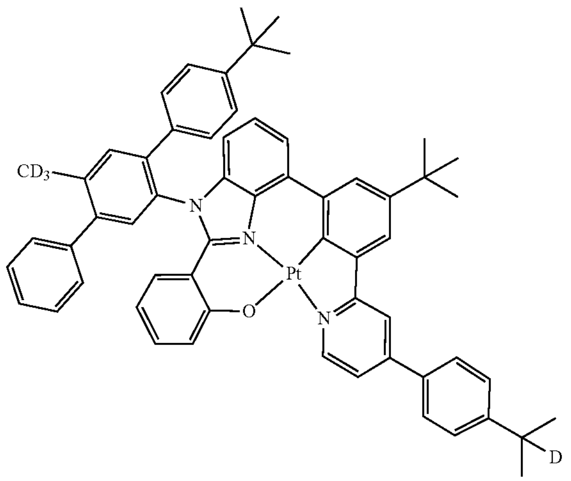
2890
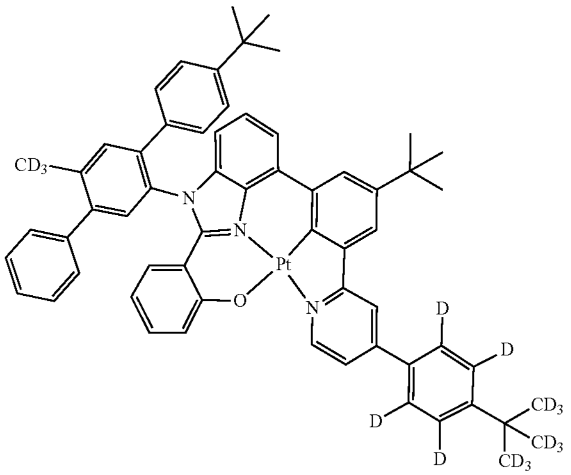
2891
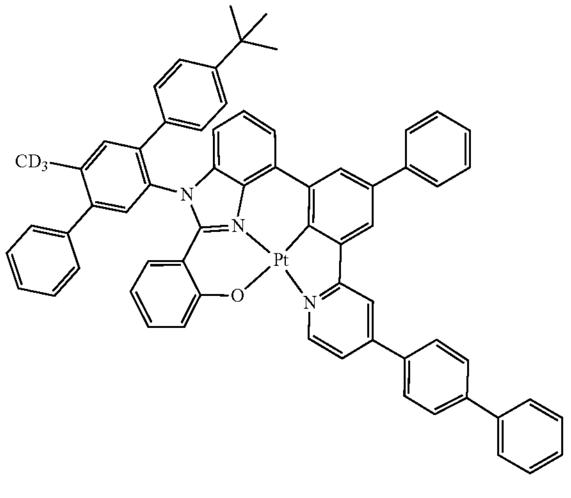

-continued
2892
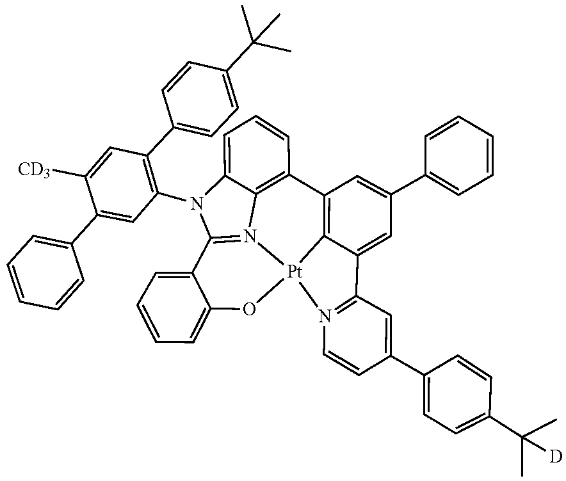
2893
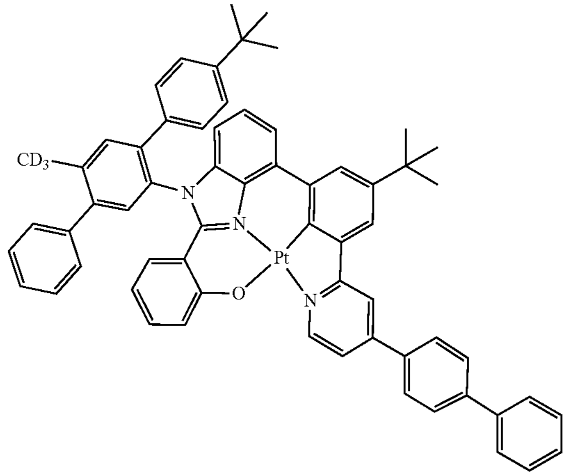
2894
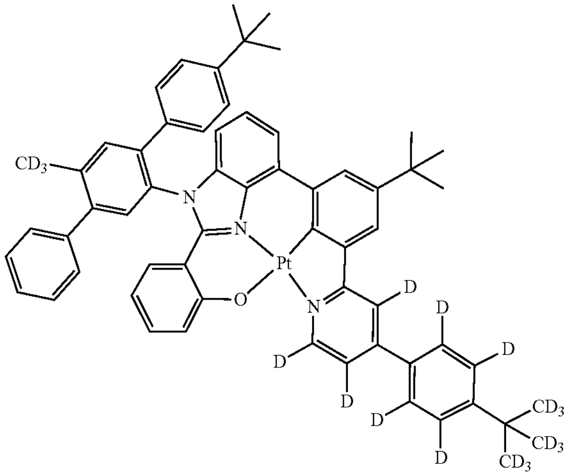
2895
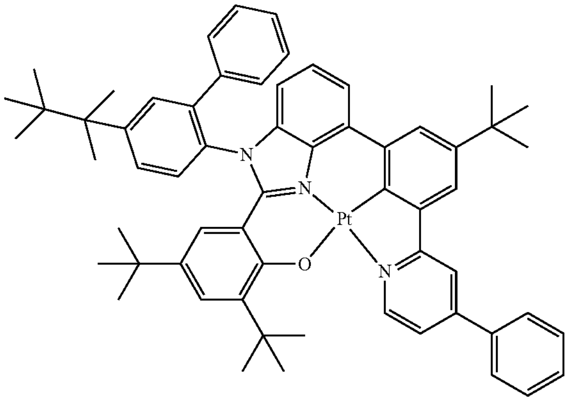
2896
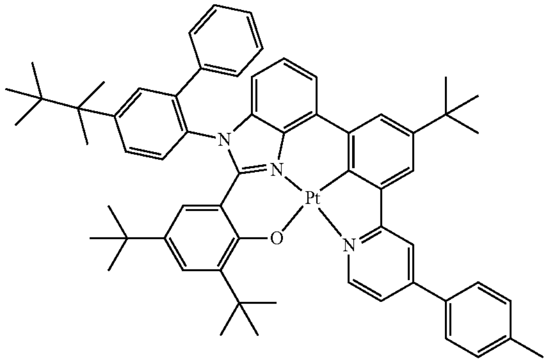
2897
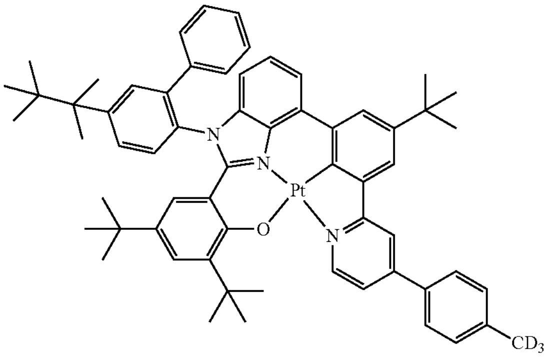
2898
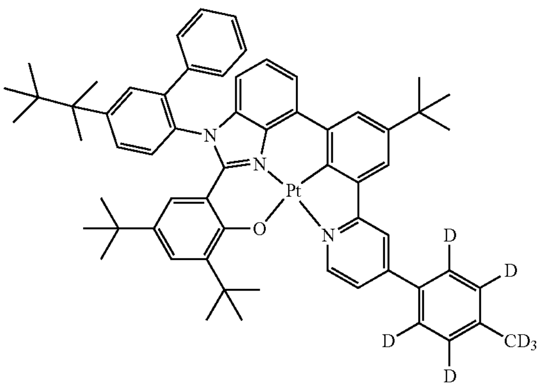

-continued
2899
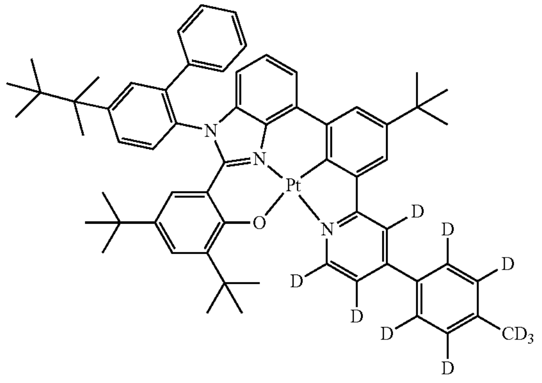
2900
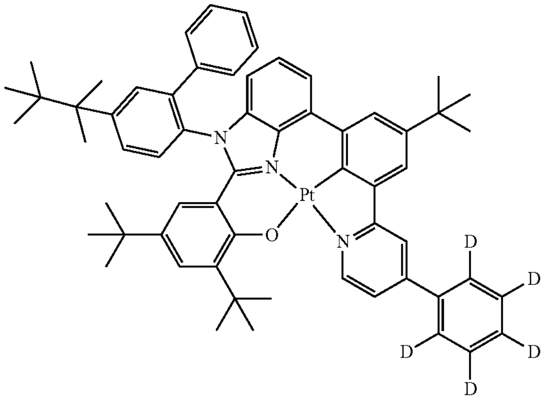
2901
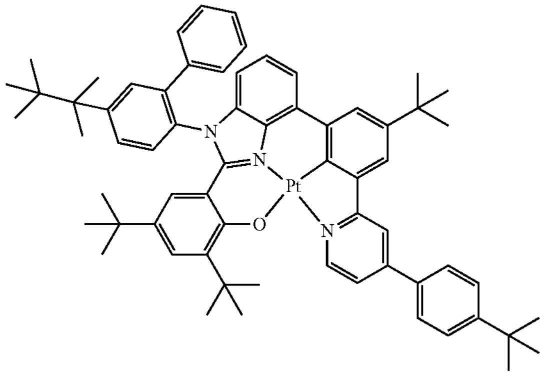
2902
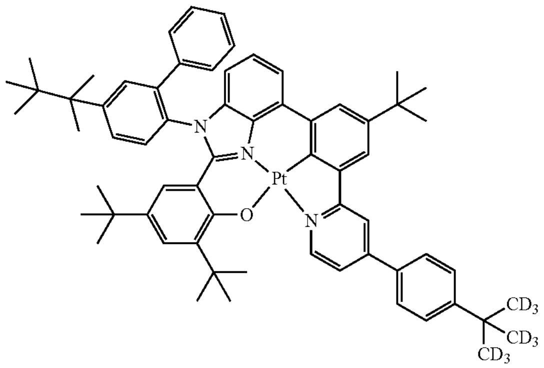
-continued
2903
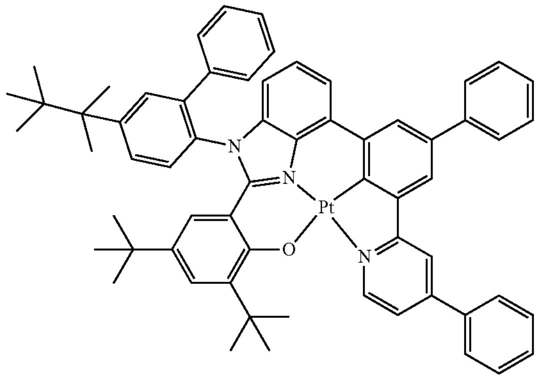
2904
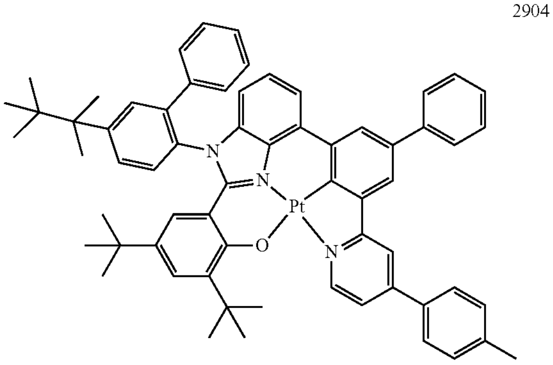
2905
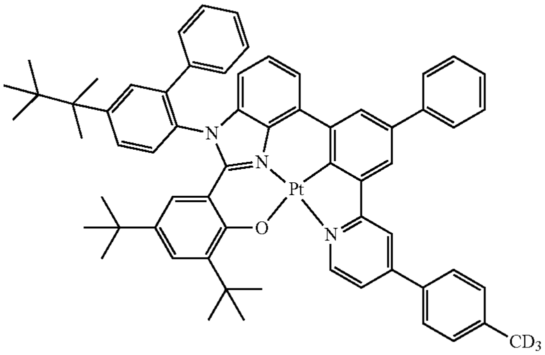
2906
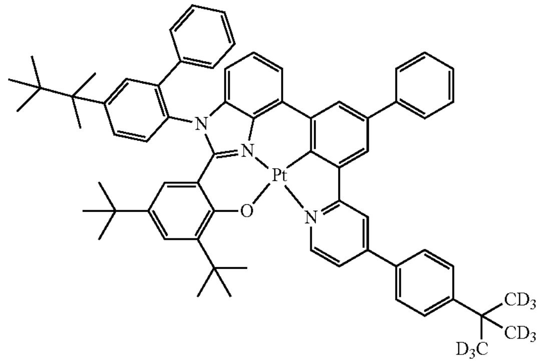

-continued
2907
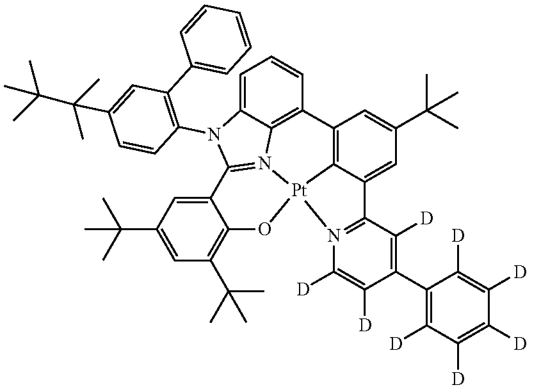
2908
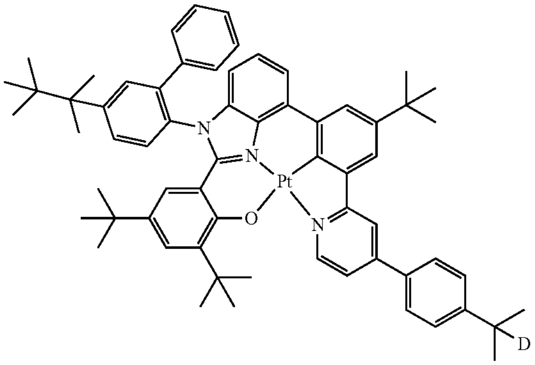
2909
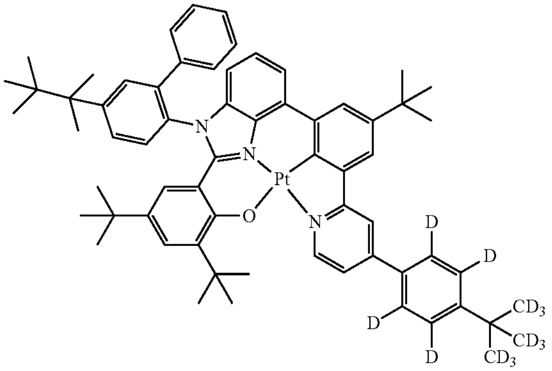
2910
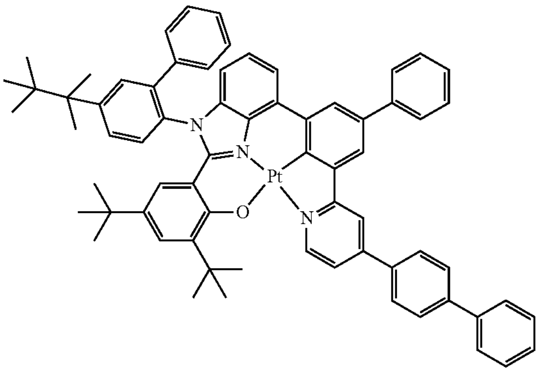
-continued
2911
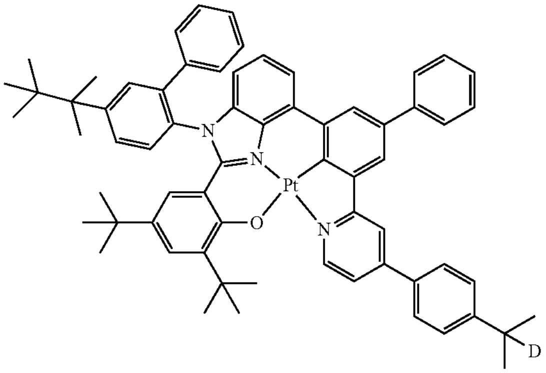
2912
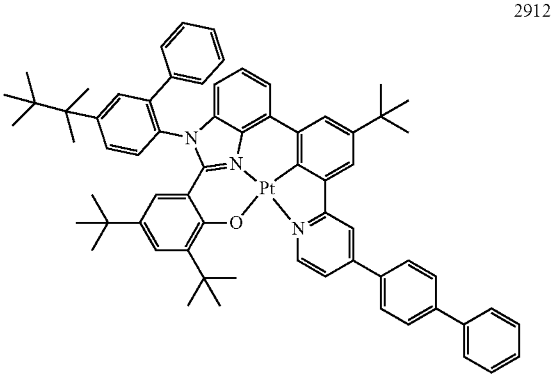
2913
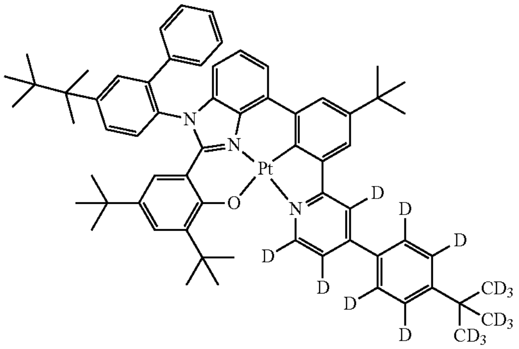
2914
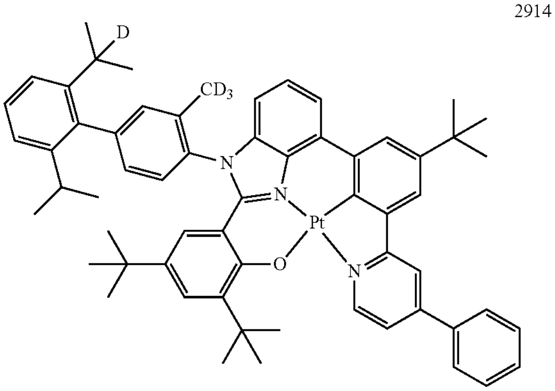

-continued
2915
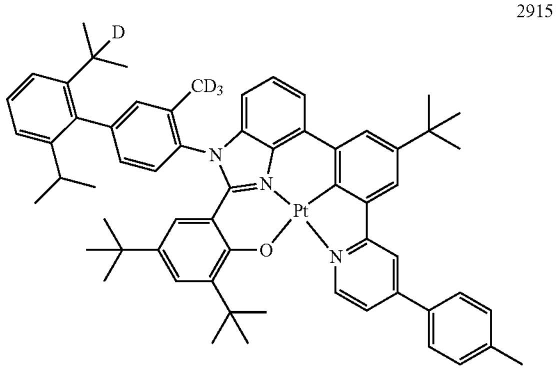
2916
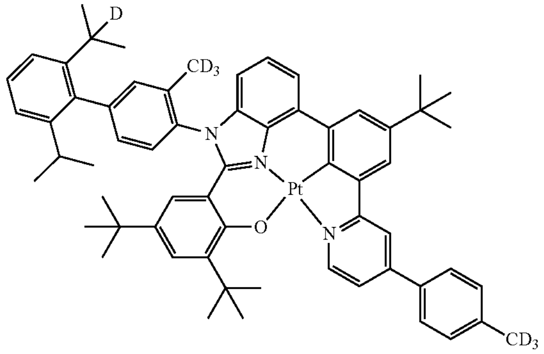
2917
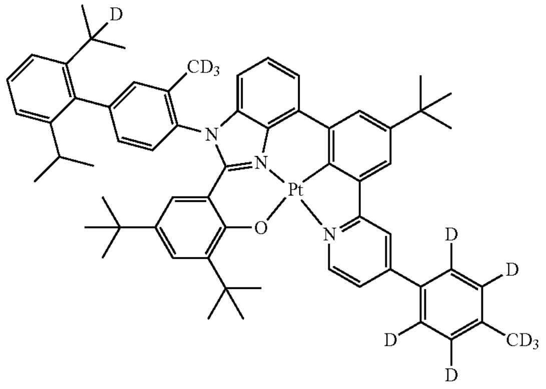
2918
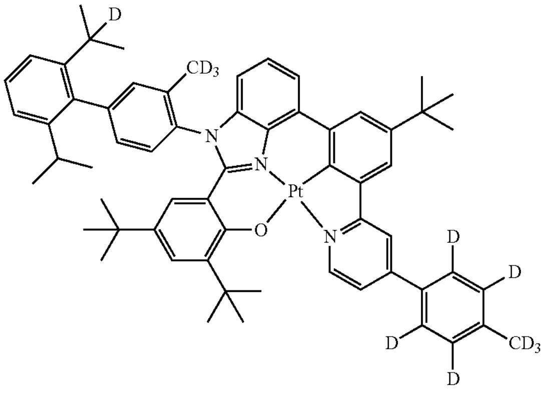
-continued
2919
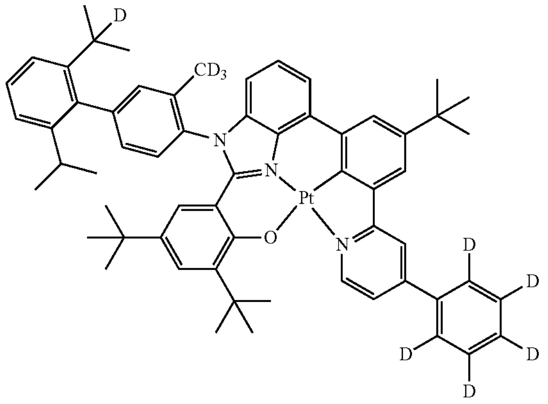
2920
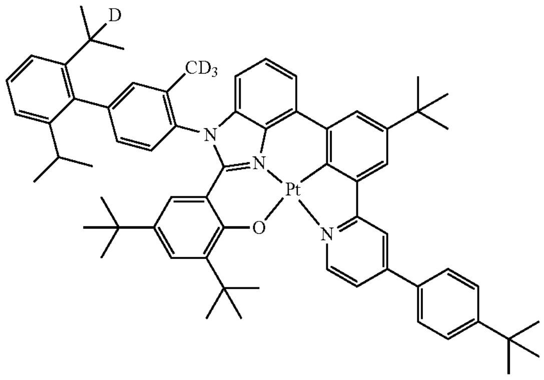
2921
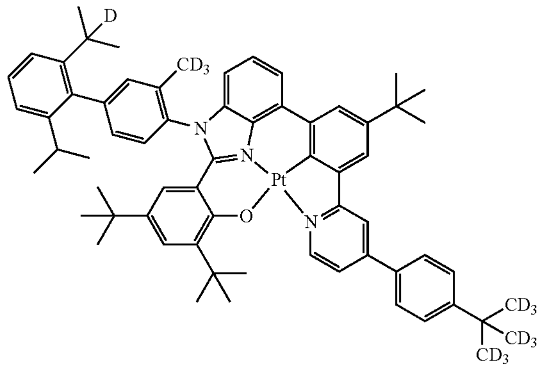
2922
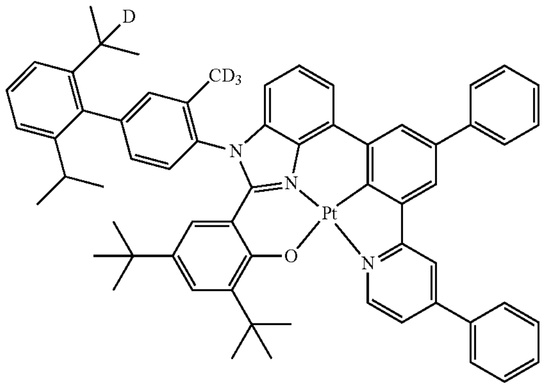

2923
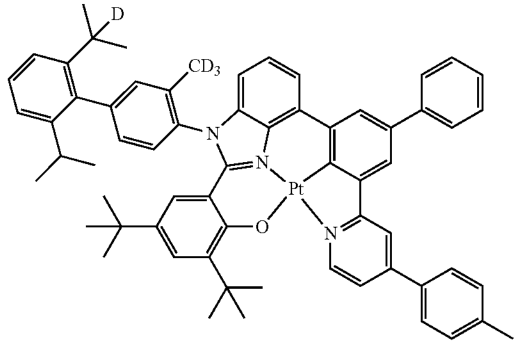
2924
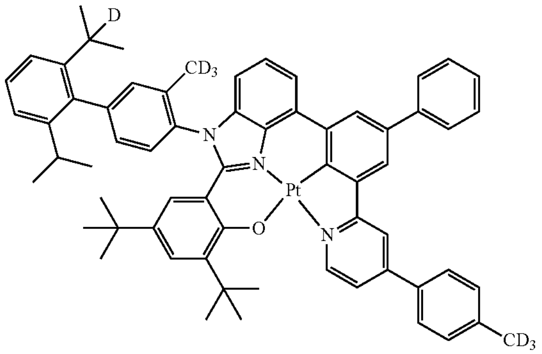
2925
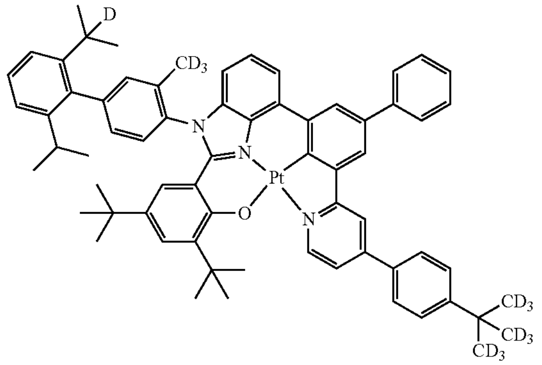
2926
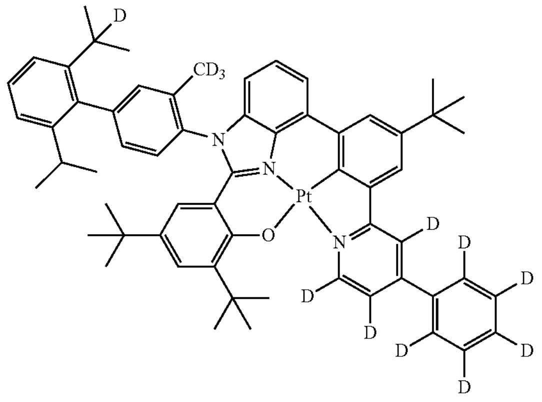
2927
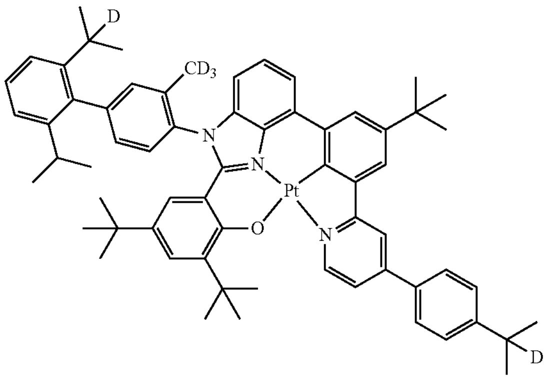
2928
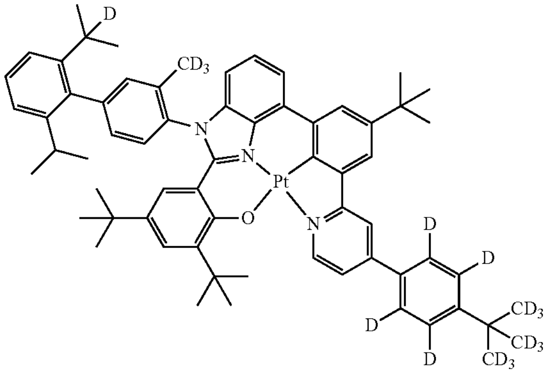
2929
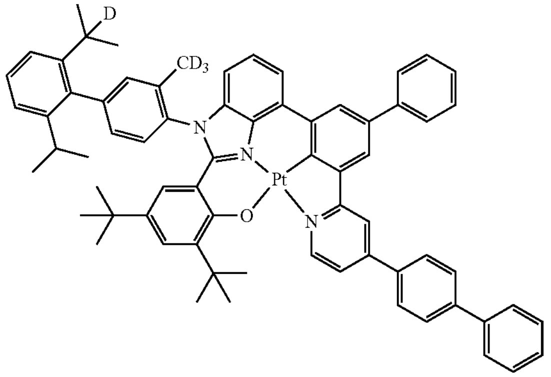
2930
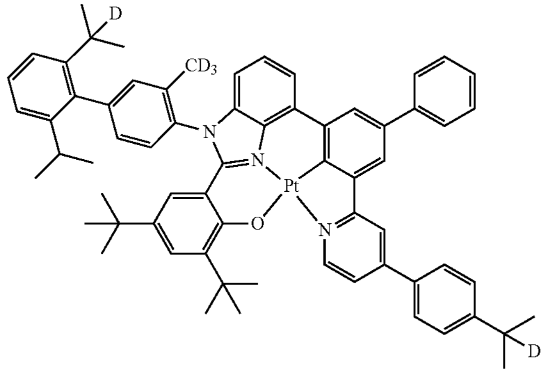

-continued
2931
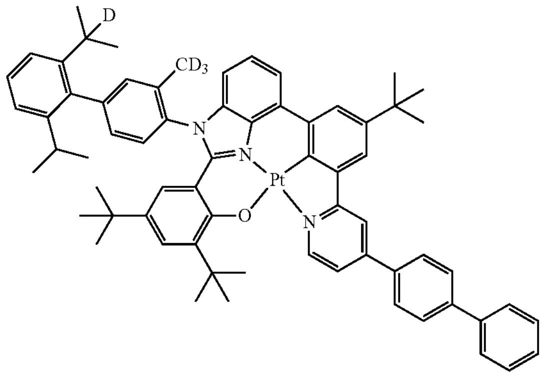
2932
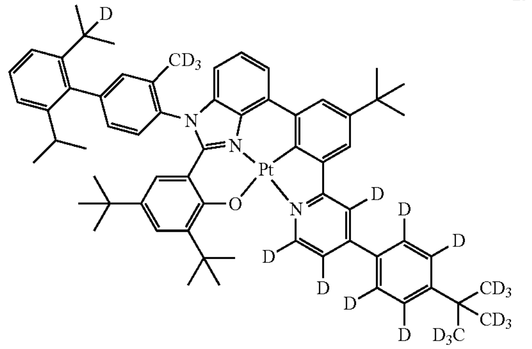
2933
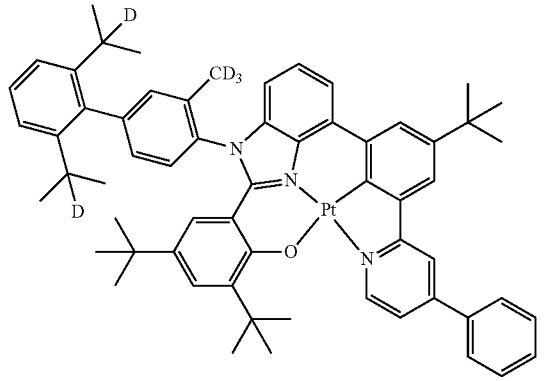
2934
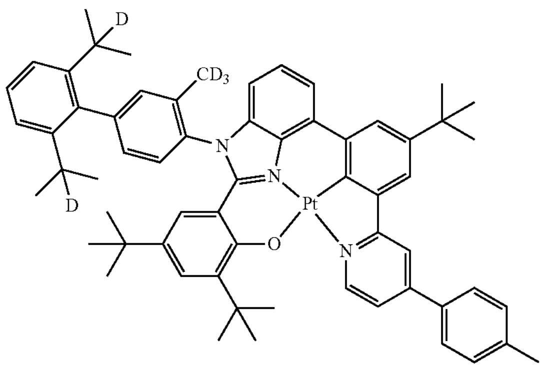
-continued
2935
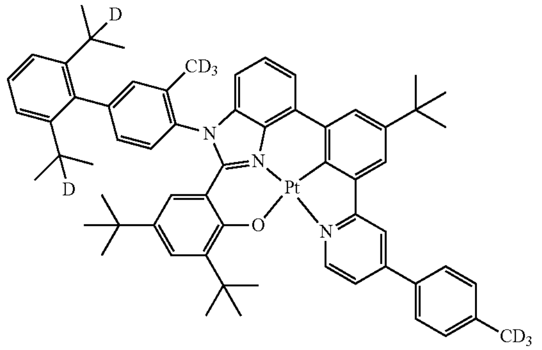
2936
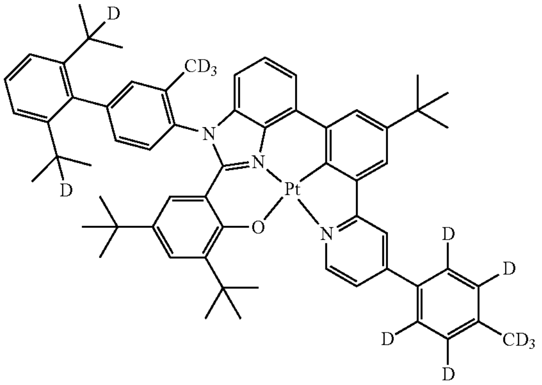
2937
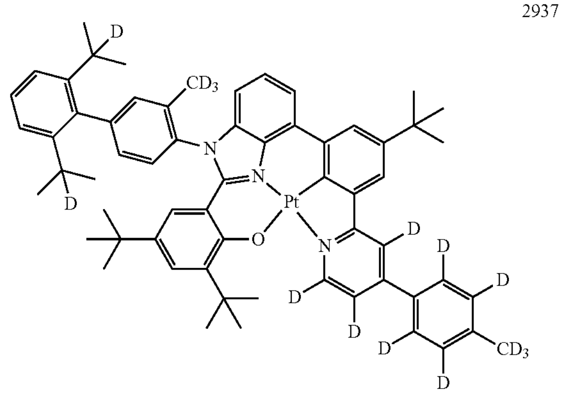
2938
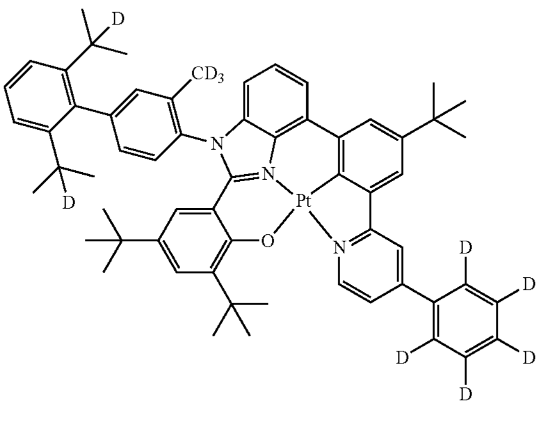

-continued
2939
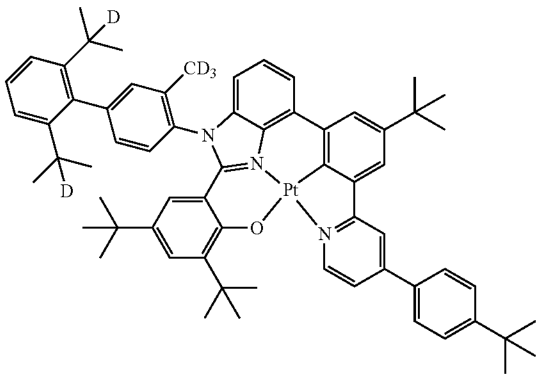
2940
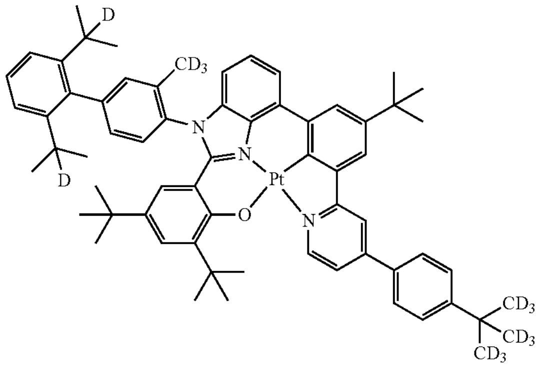
2941
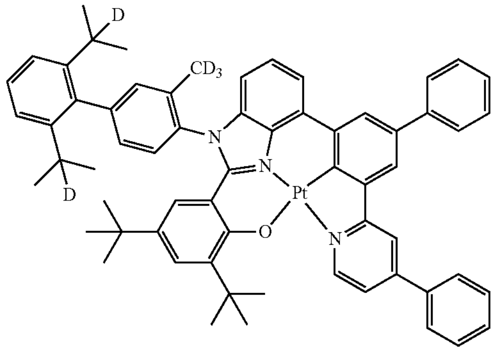
2942
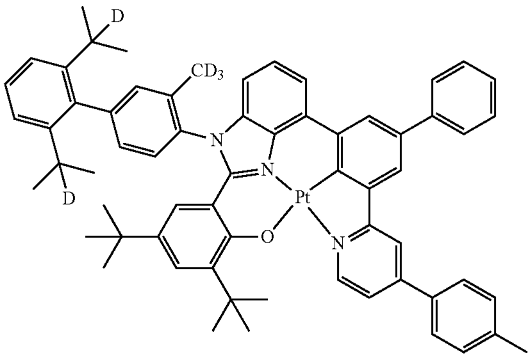
2943
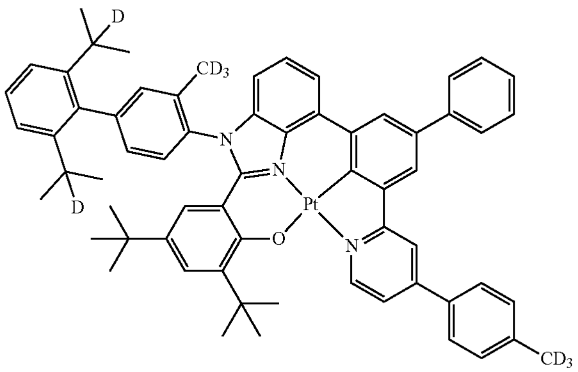
2944
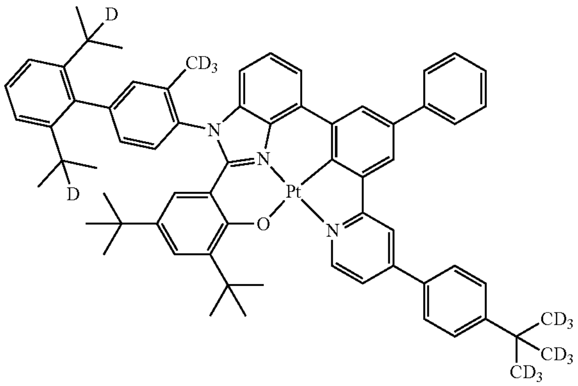
2945
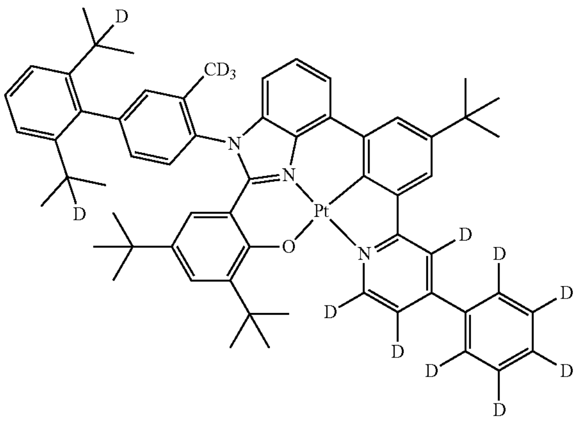
2946
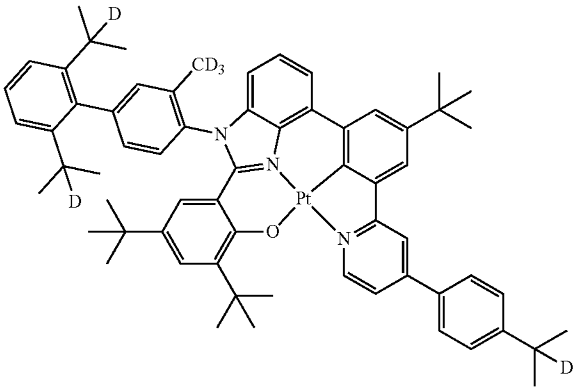

-continued
2947
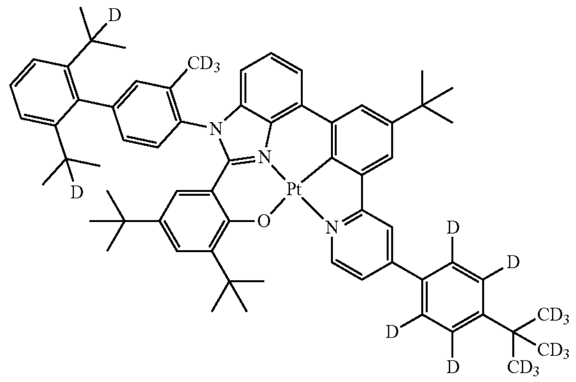
2948
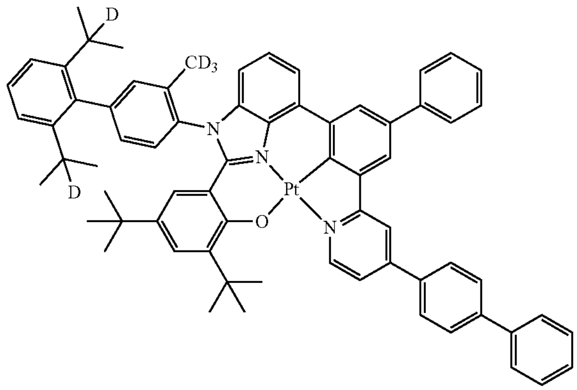
2949
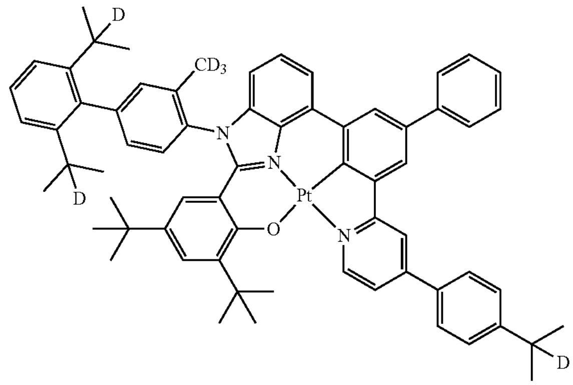
2950
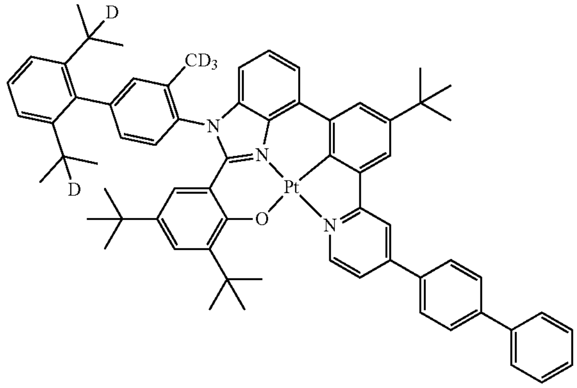
-continued
2951
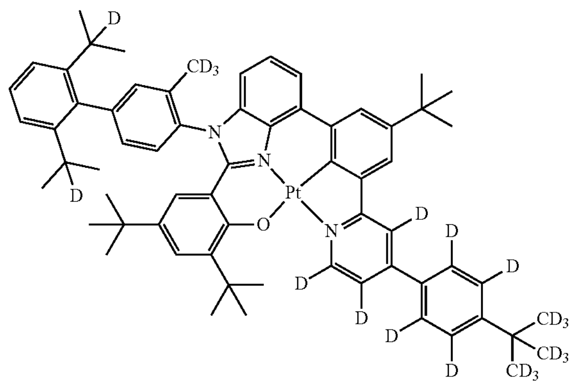
2952
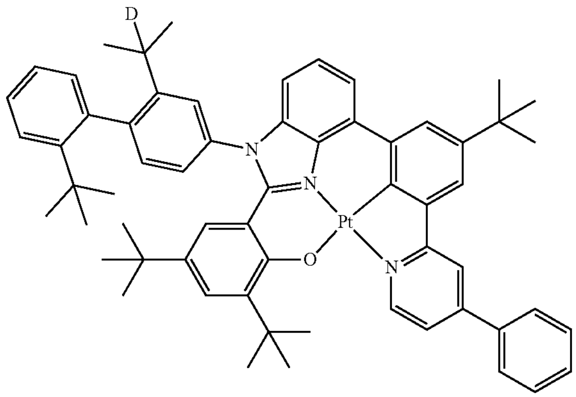
2953
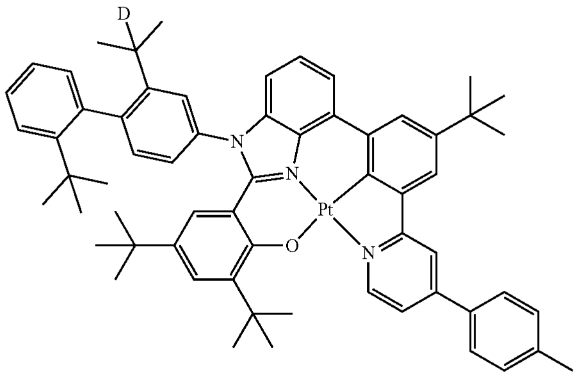
2954
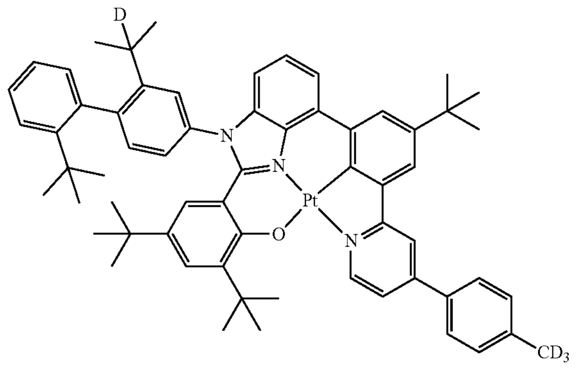

-continued
2955
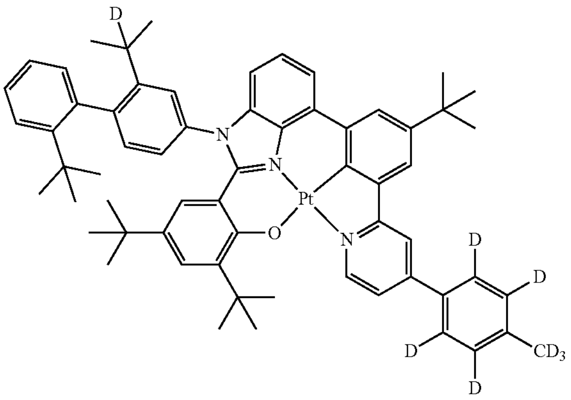
2956
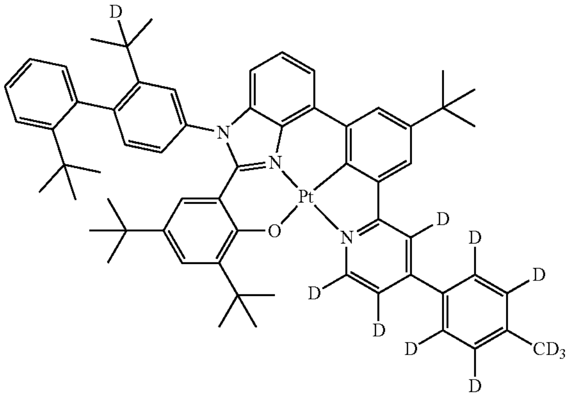
2957
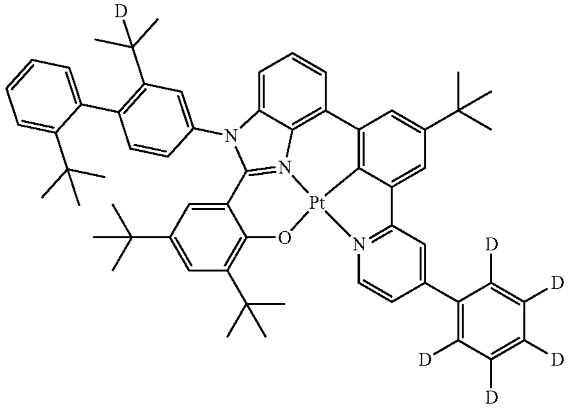
-continued
2958
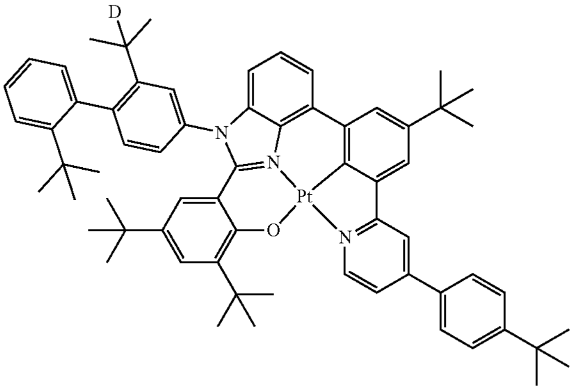
2959
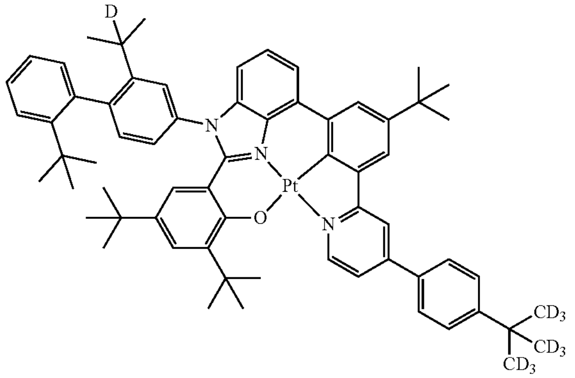
2960
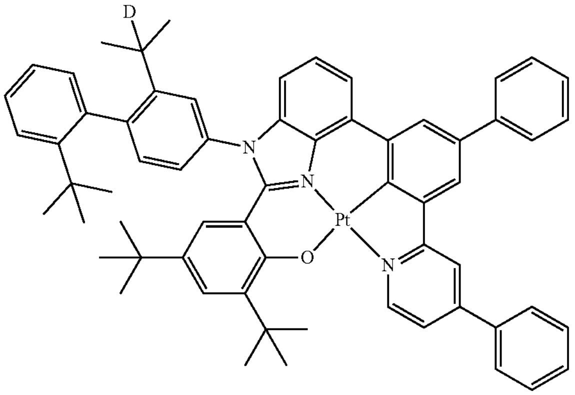
2961
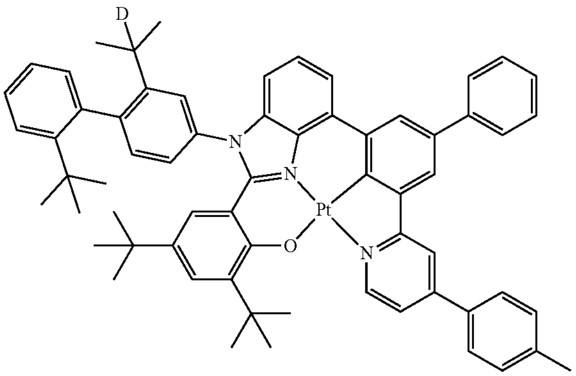

-continued
2962
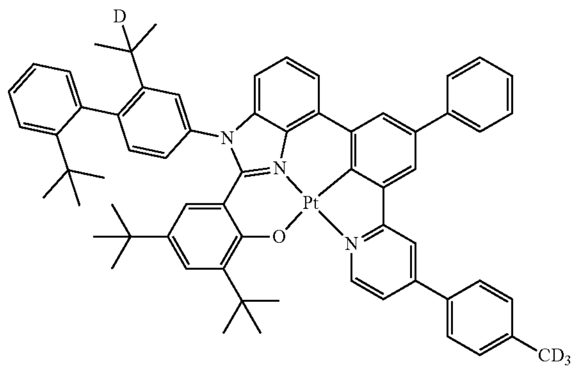
2963
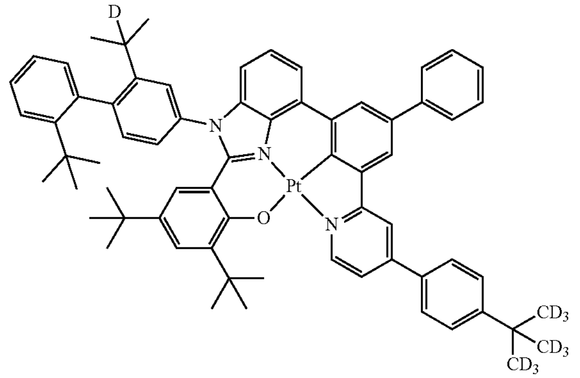
2964
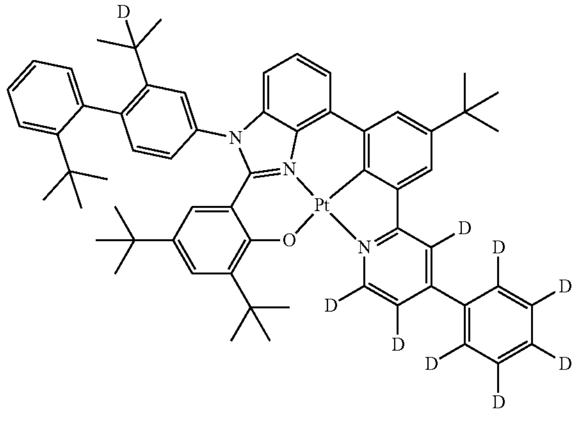
2965
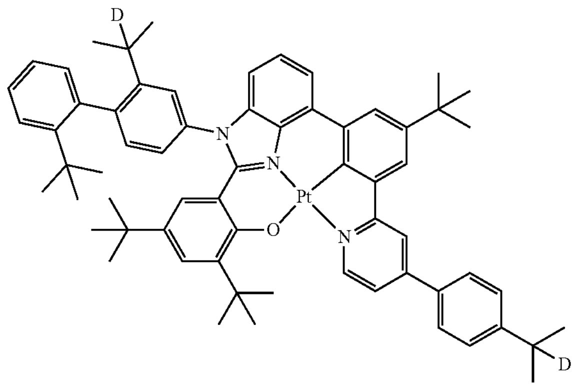
-continued
2966
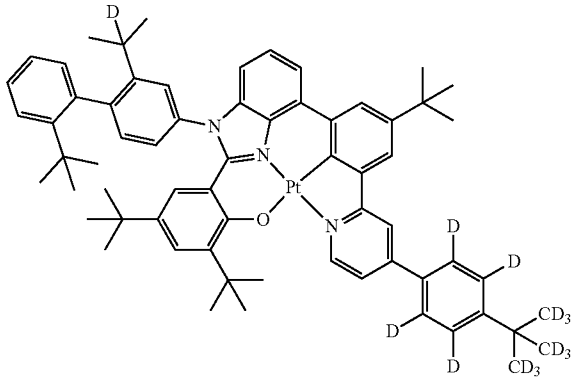
2967
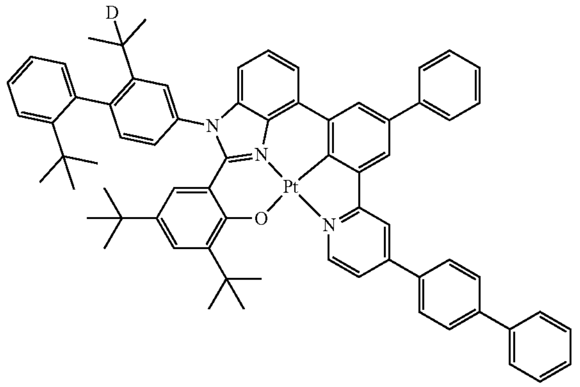
2968
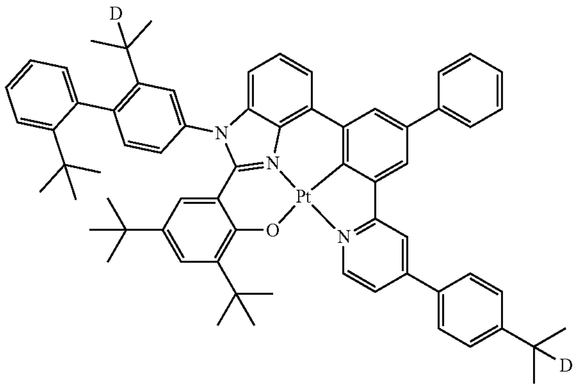
2969
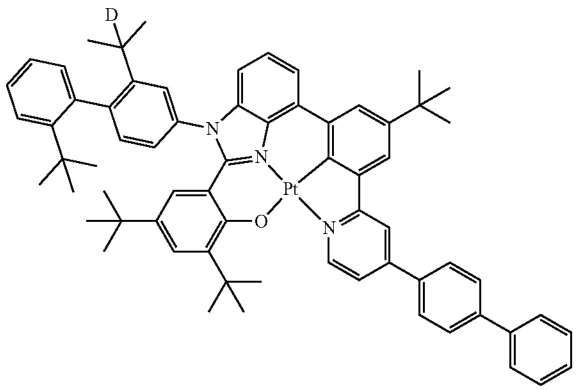

-continued
2970
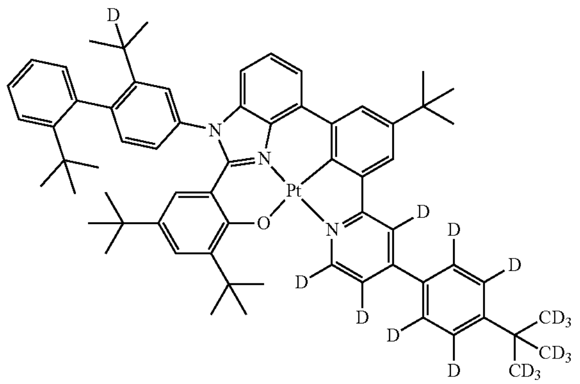
2971
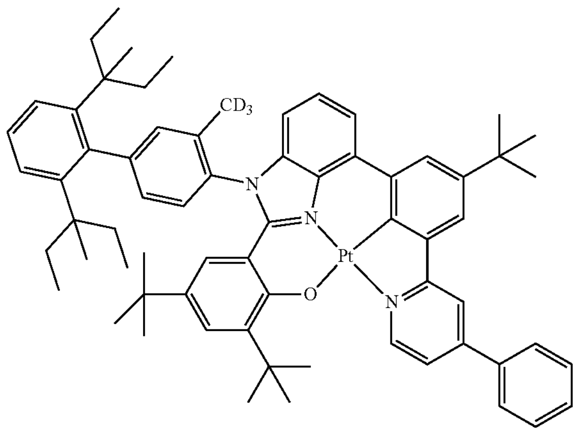
2972
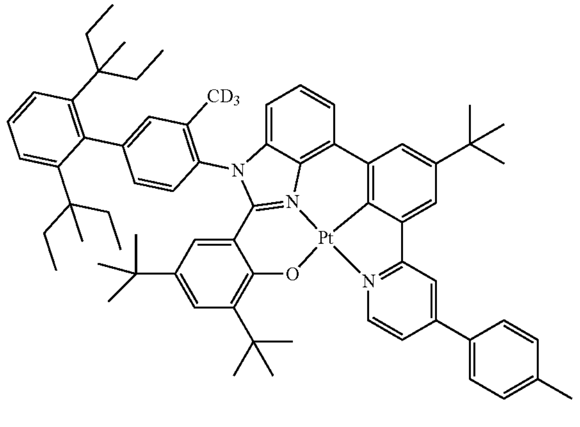
-continued
2973
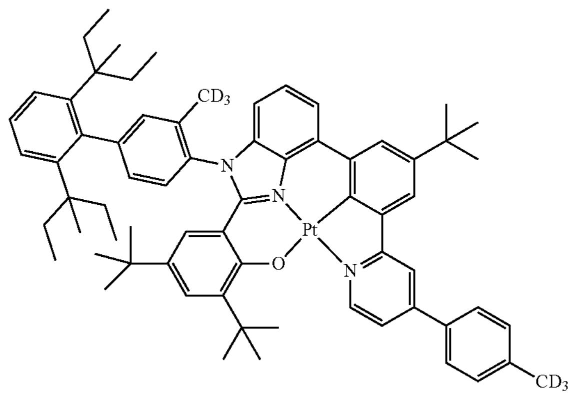
2974
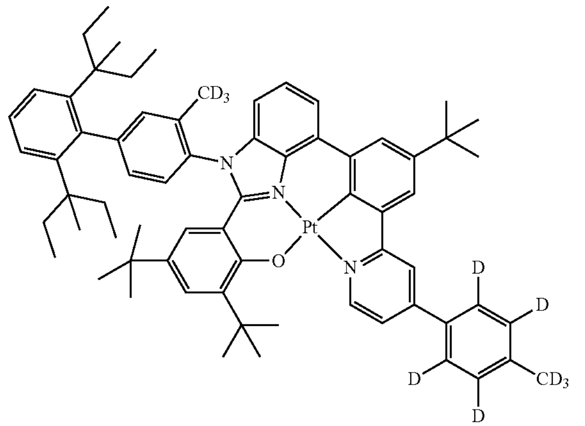
2975
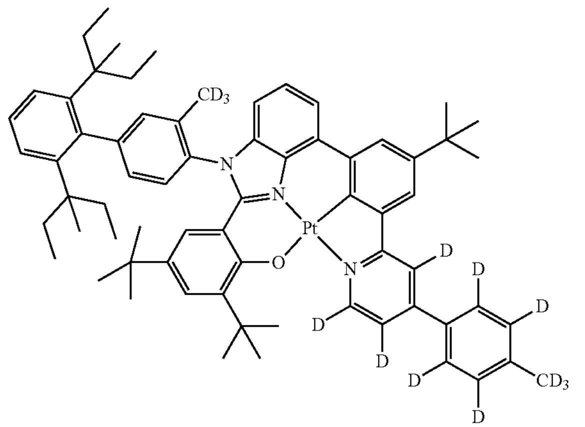

-continued
2976
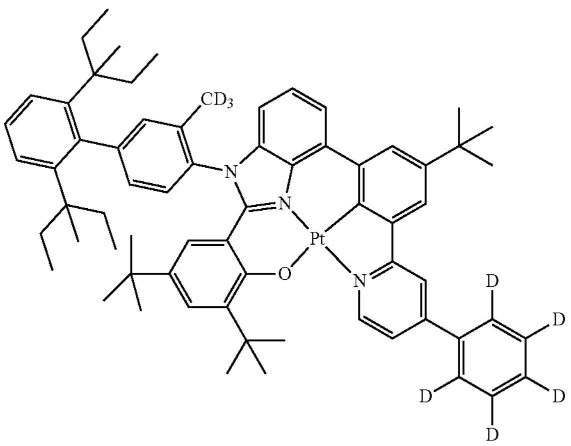
2977
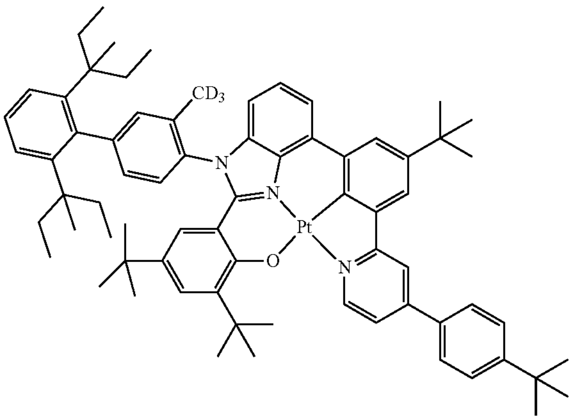
2978
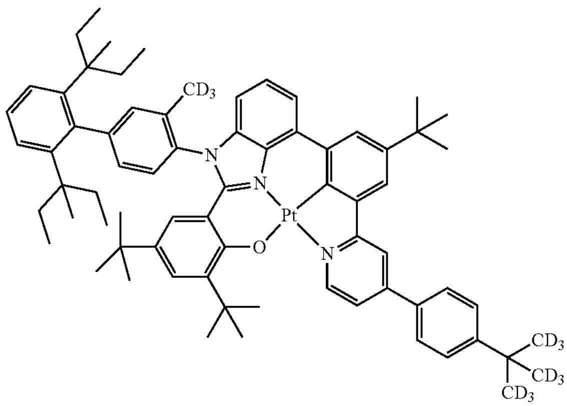
-continued
2979
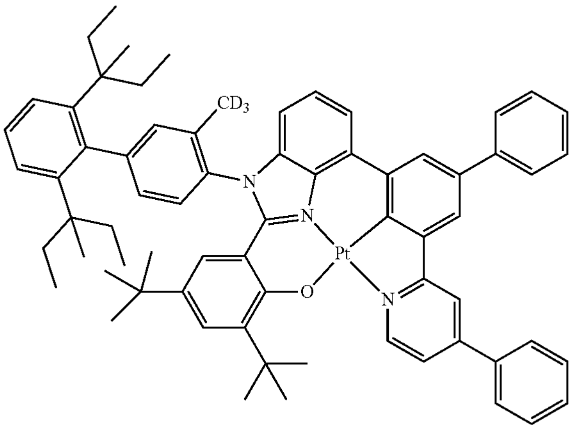
2980
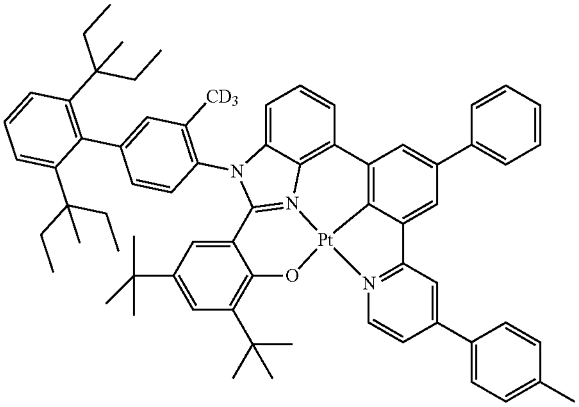
2981
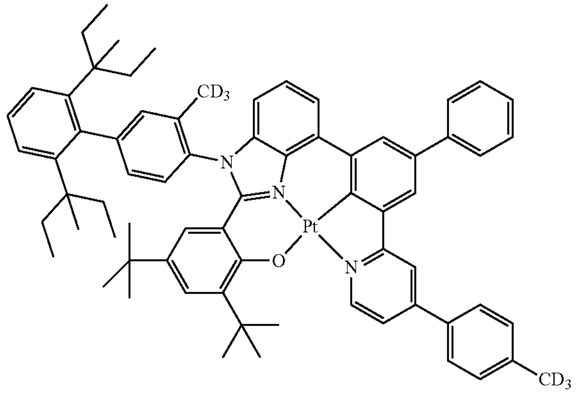

-continued
2982
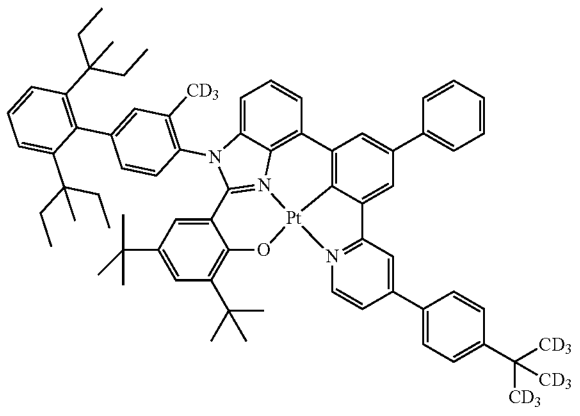
2983
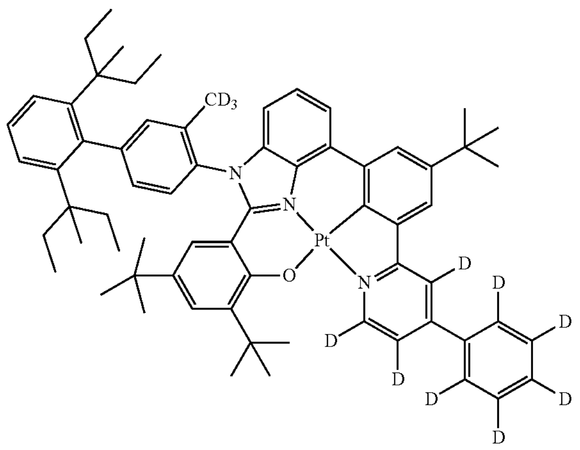
2984
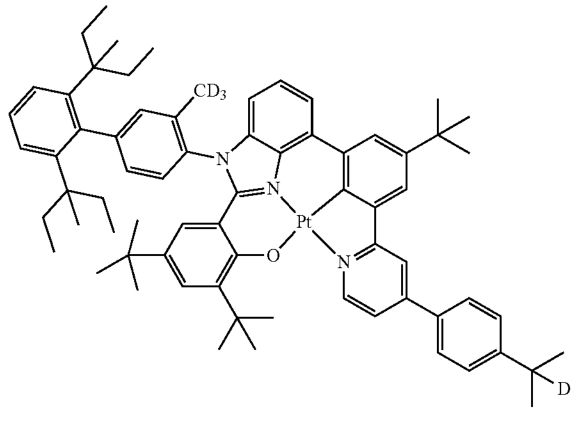
-continued
2985
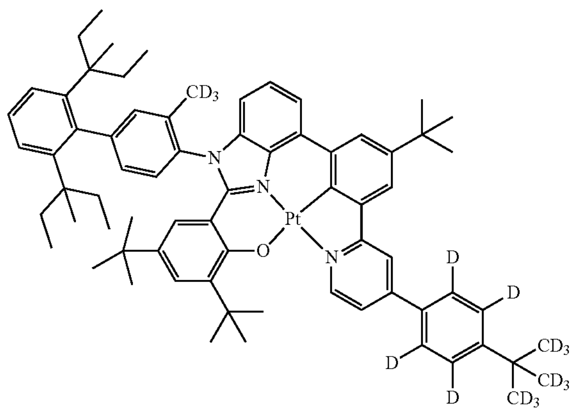
2986
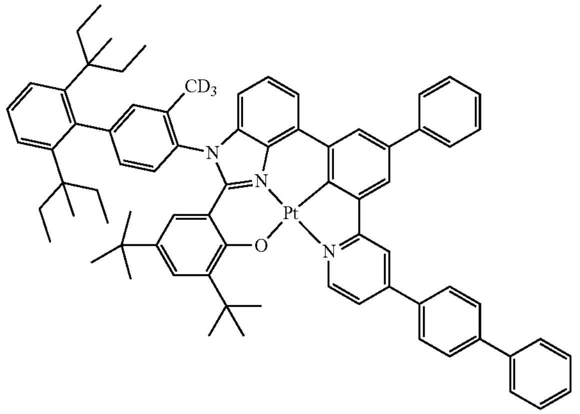
2987
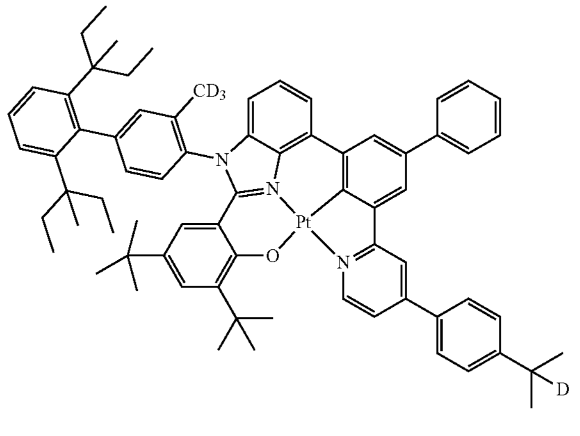

-continued
2988
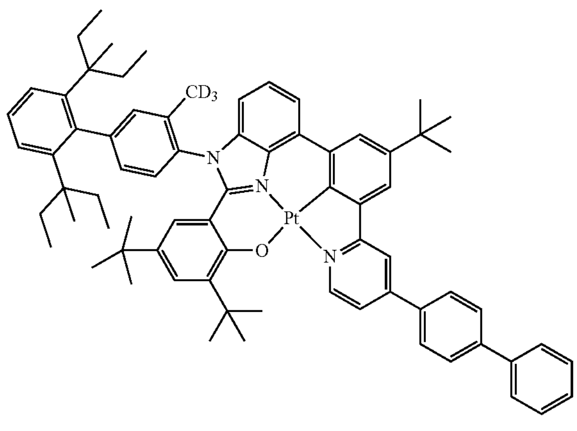
2989
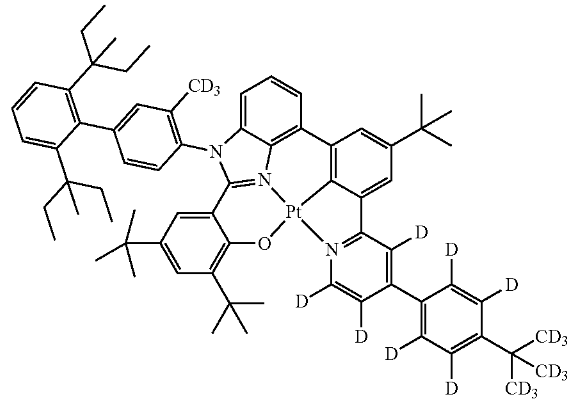
2990
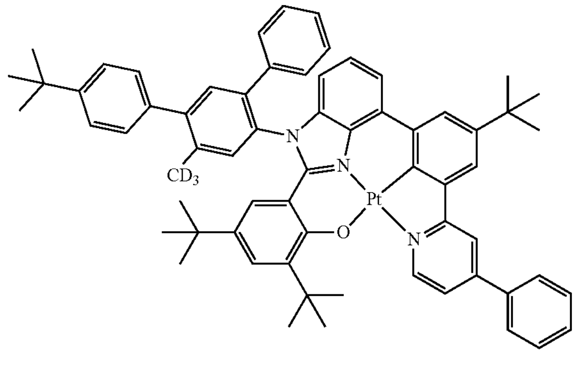
2991
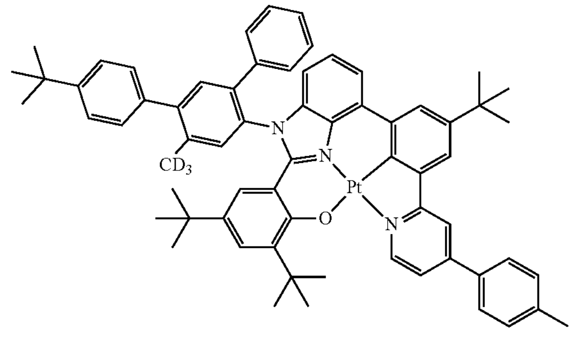
-continued
2992
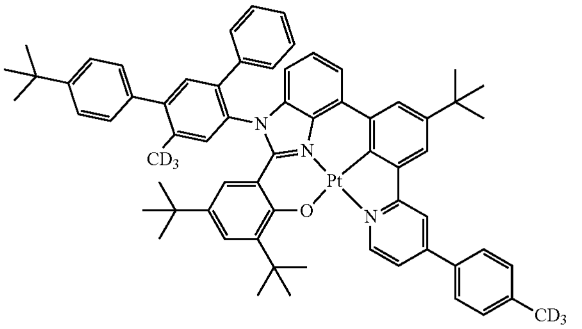
2993
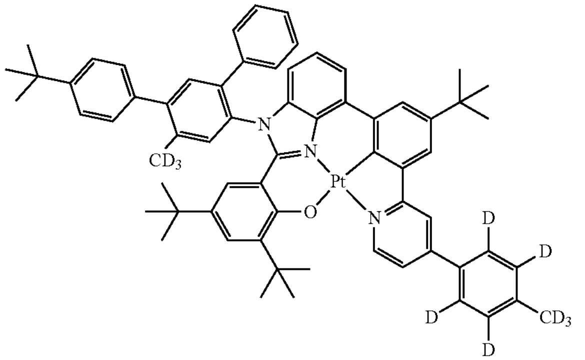
2994
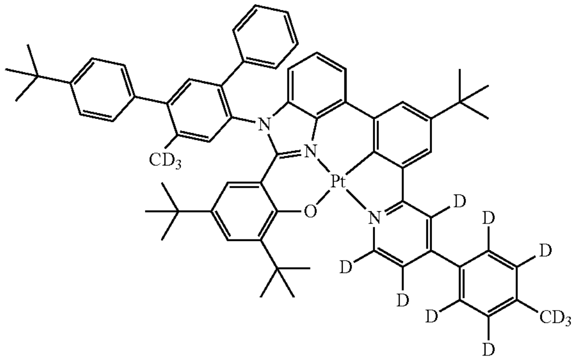
2995
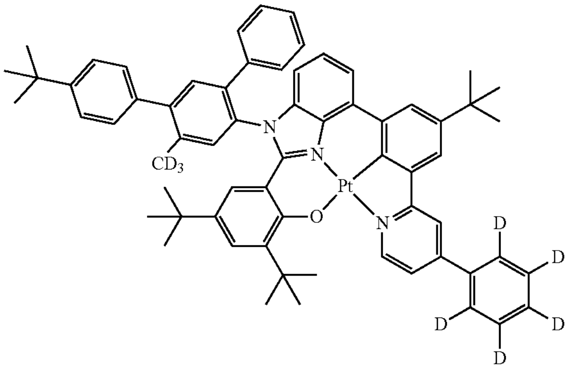

-continued
2996
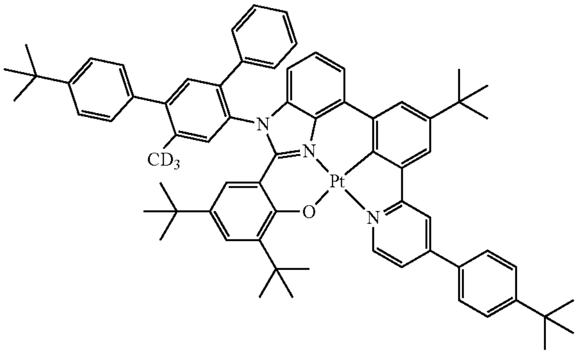
2997
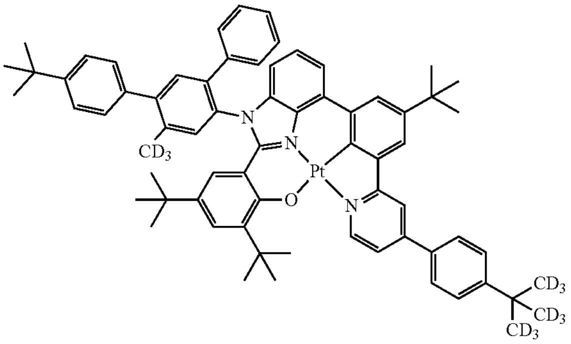
2998
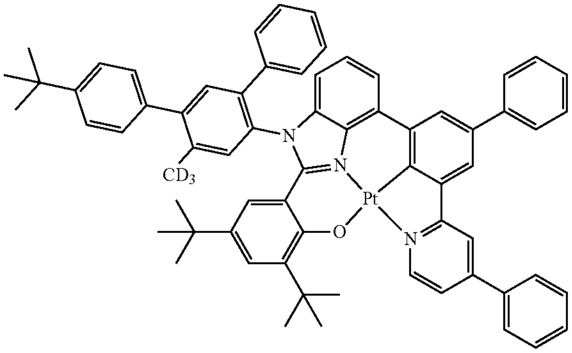
2999
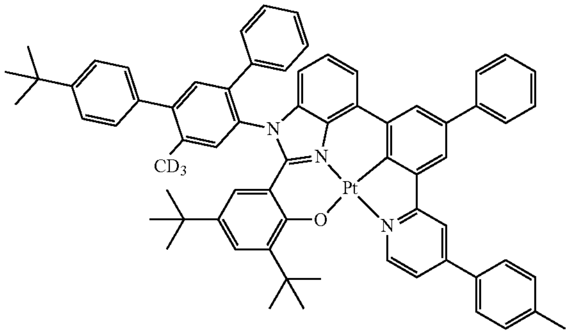
-continued
3000
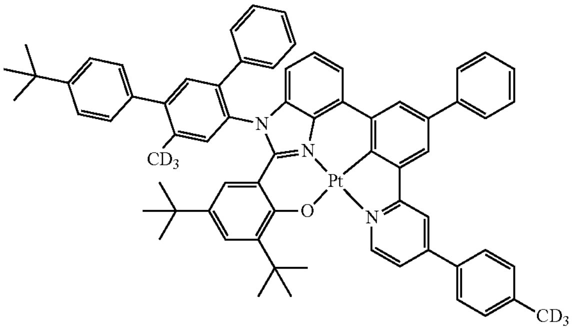
3001
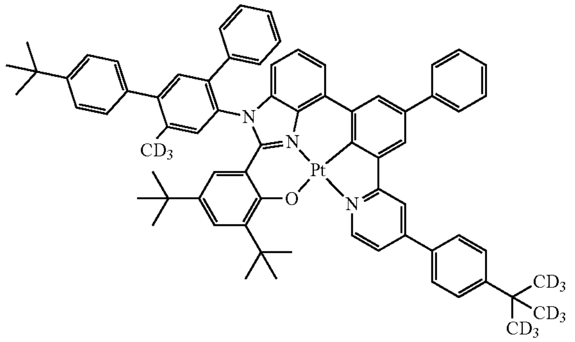
3002
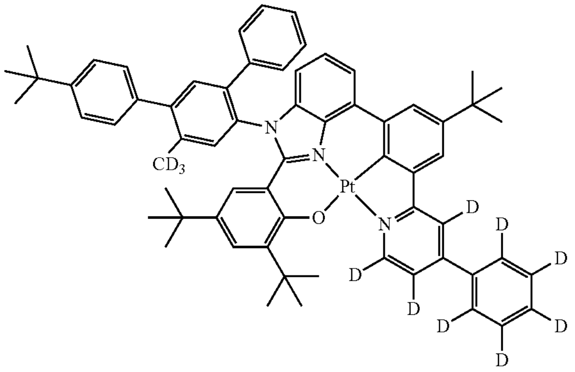
3003
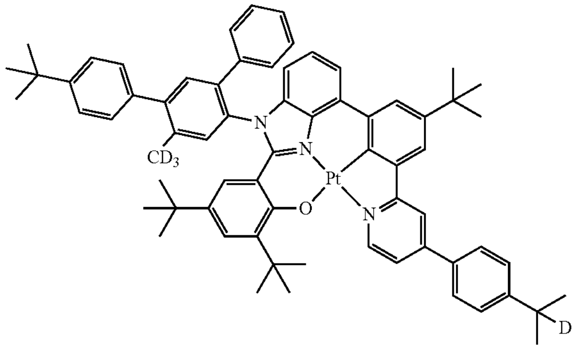

-continued
3004
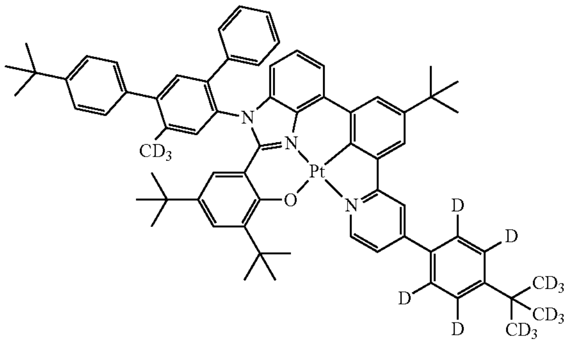
3005
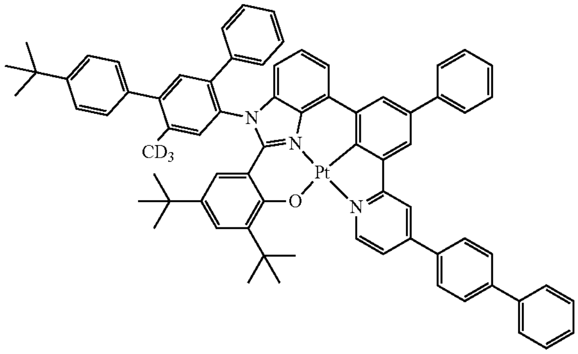
3006
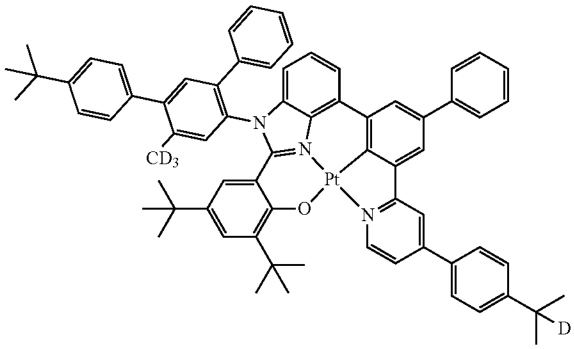
3007
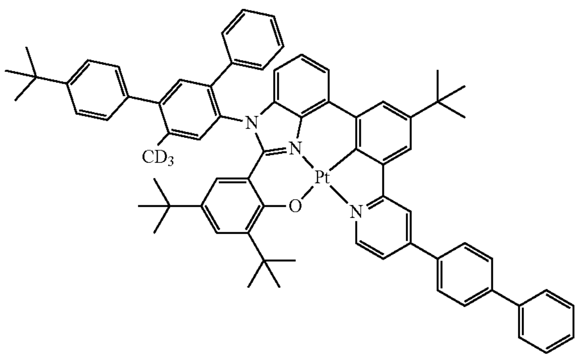
-continued
3008
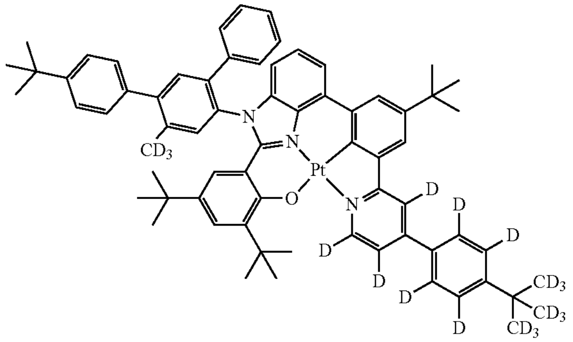
3009
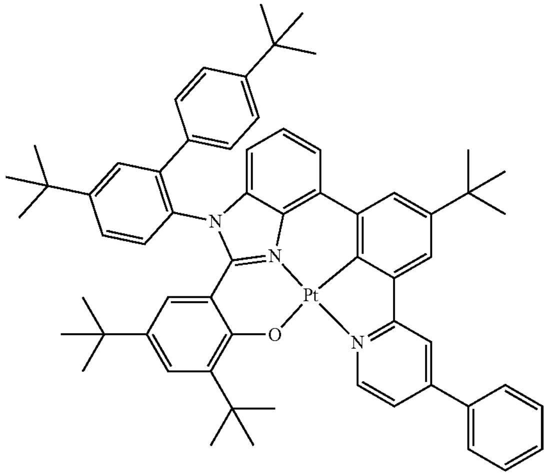
3010
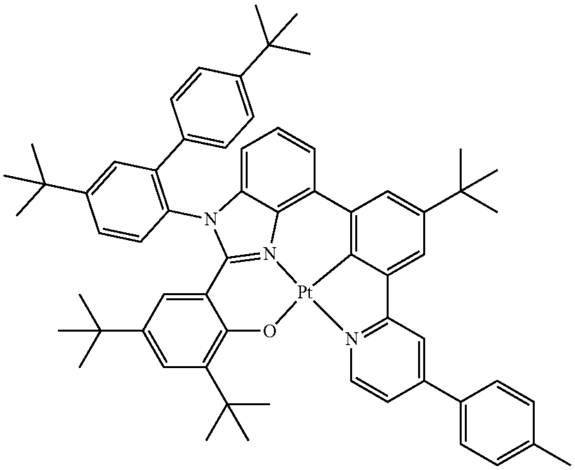

-continued
3011
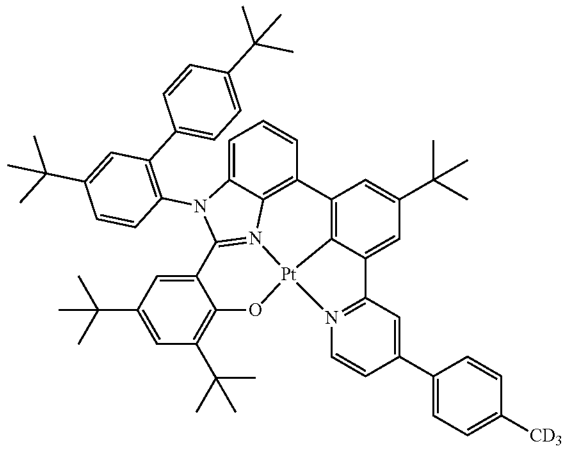
3012
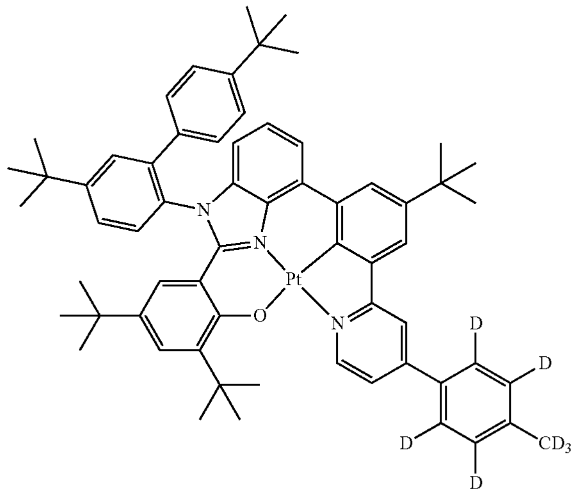
3013
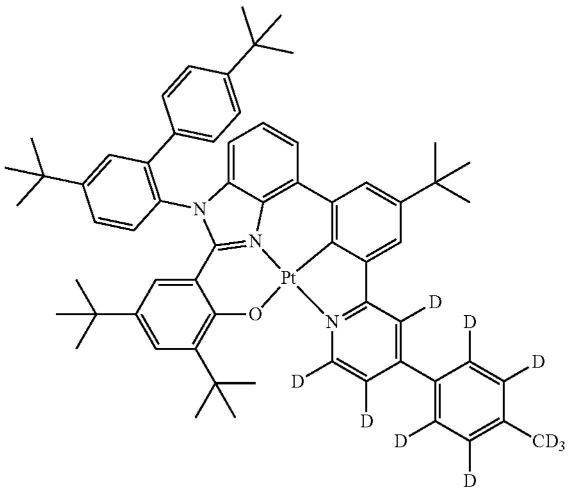
-continued
3014
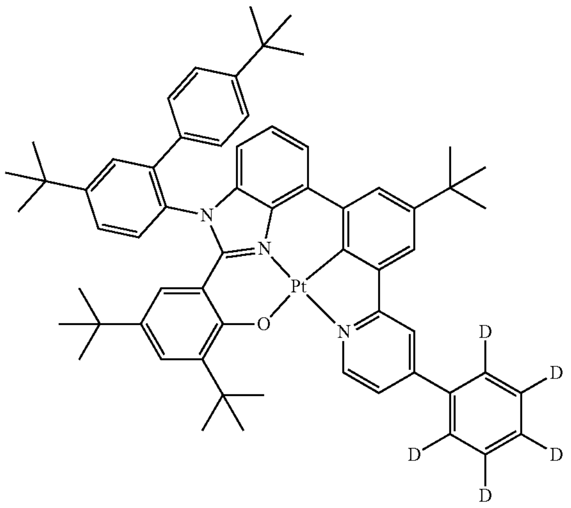
3015
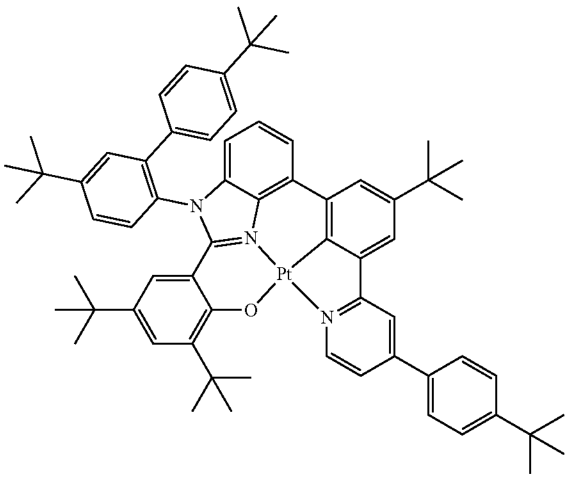
3016
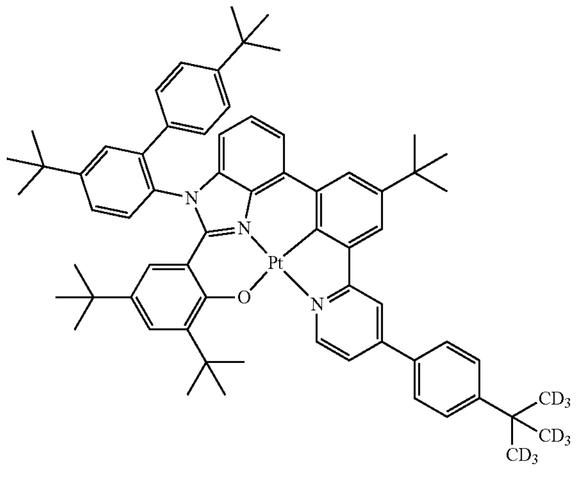

3017
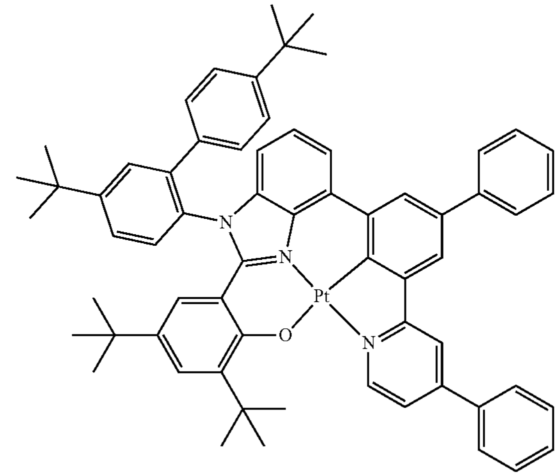
3018
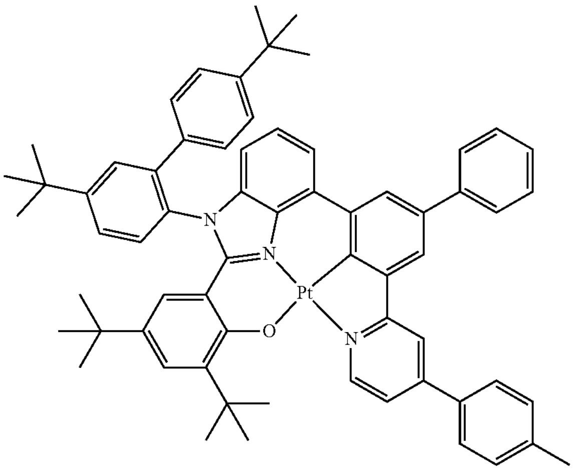
3019
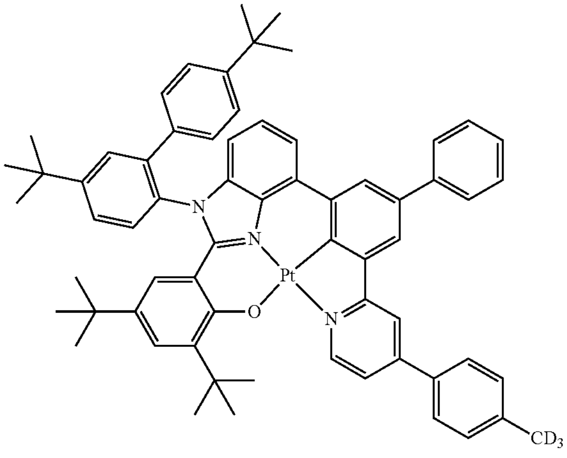
3020
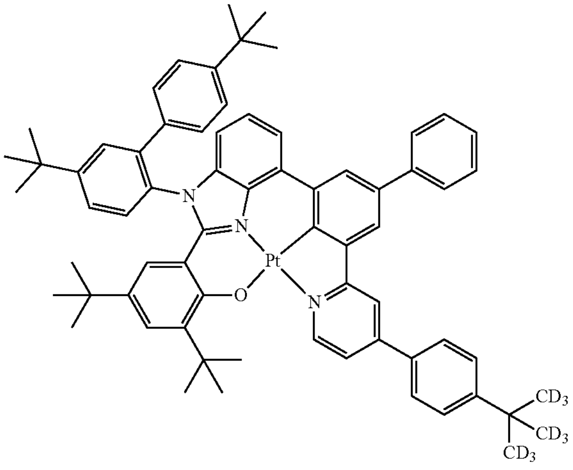
3021
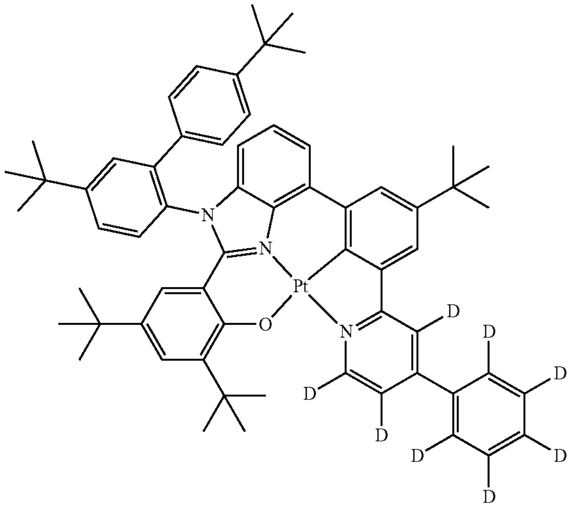
3022
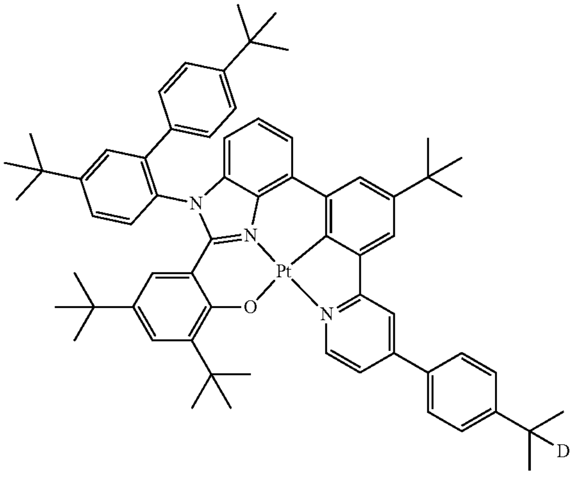

-continued
3023
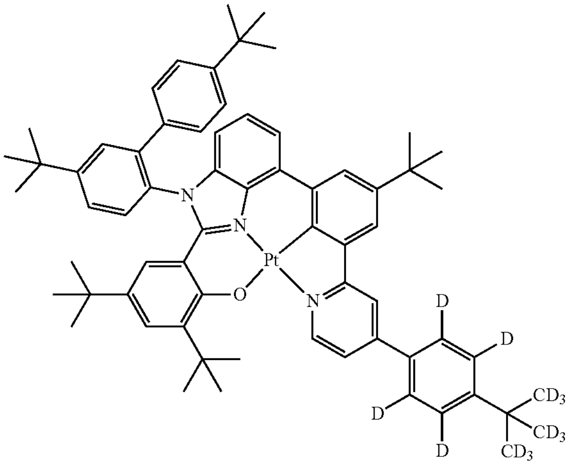
3024
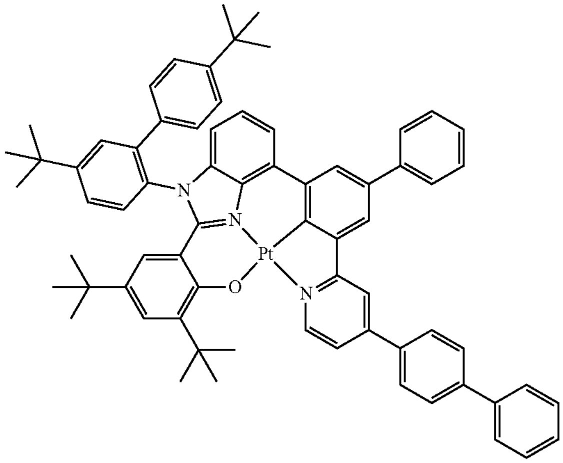
3025
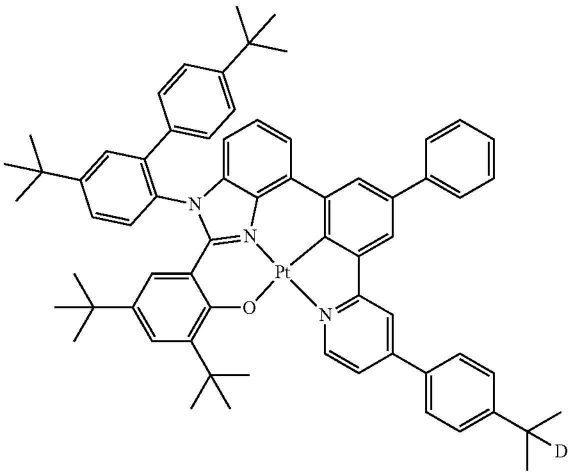
-continued
3026
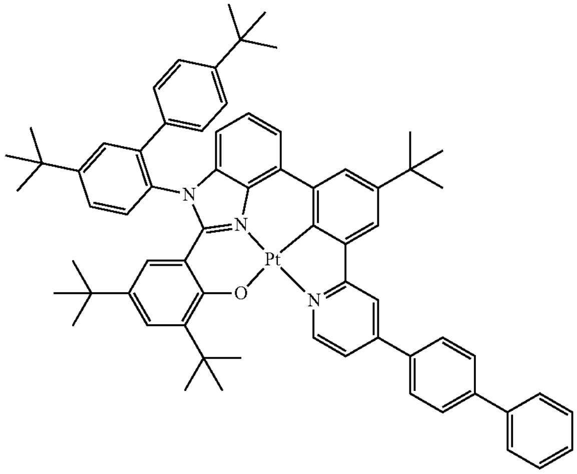
3027
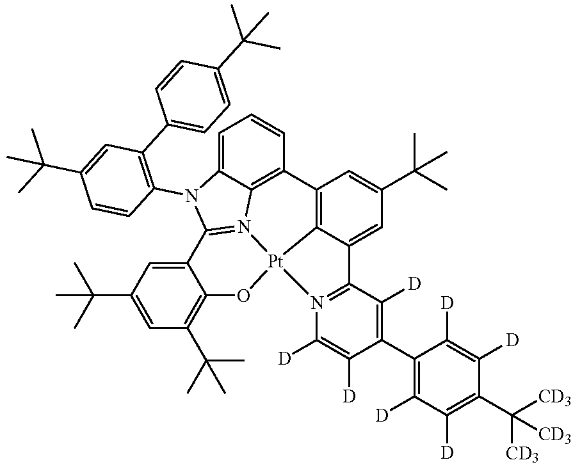
3028
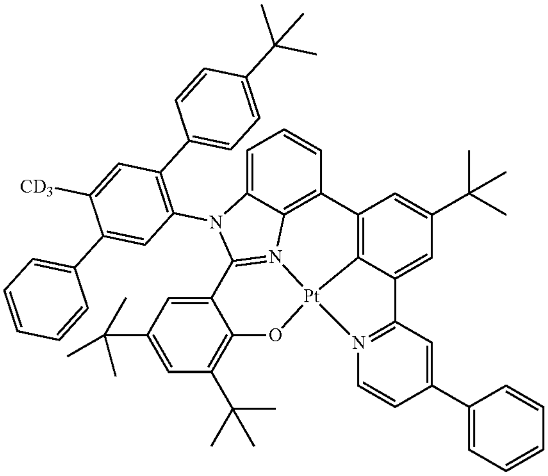

-continued
3029
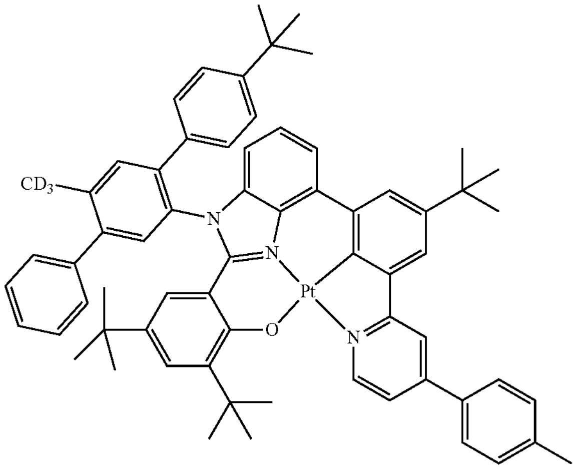
3030
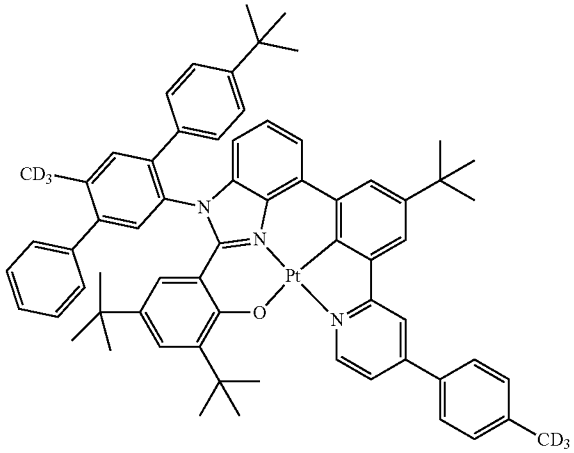
3031
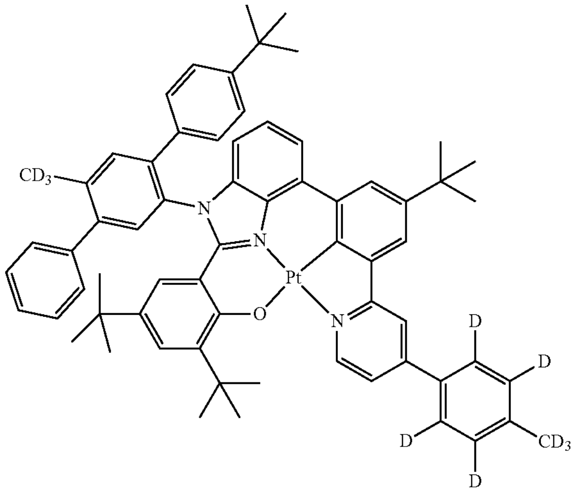
-continued
3032
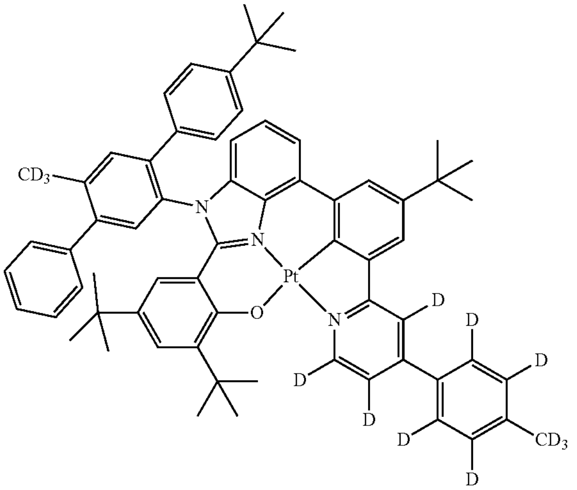
3033
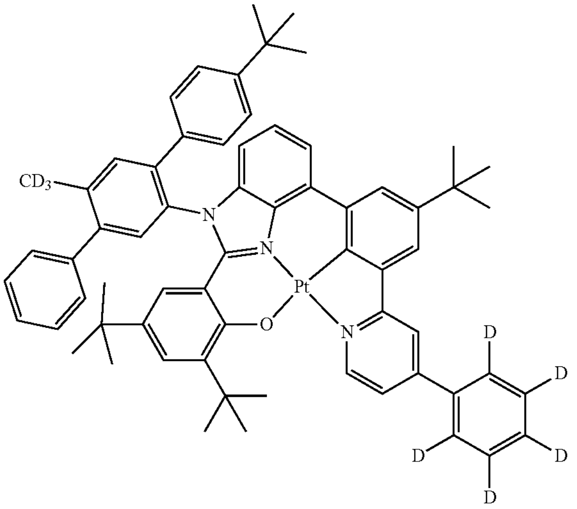
3034
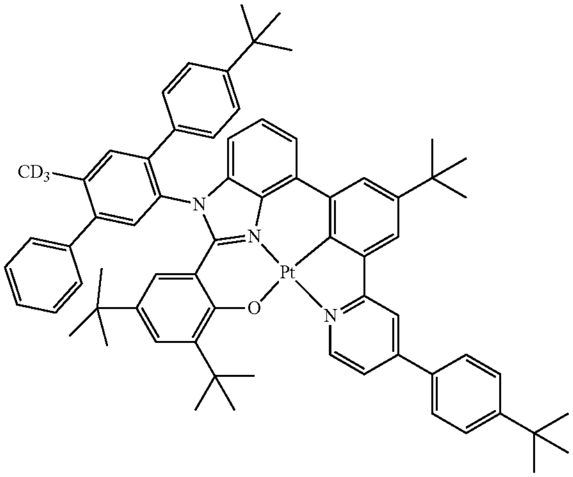

-continued
3035
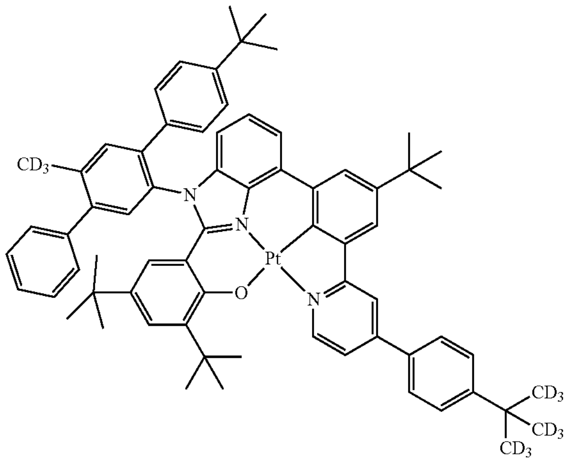
3036
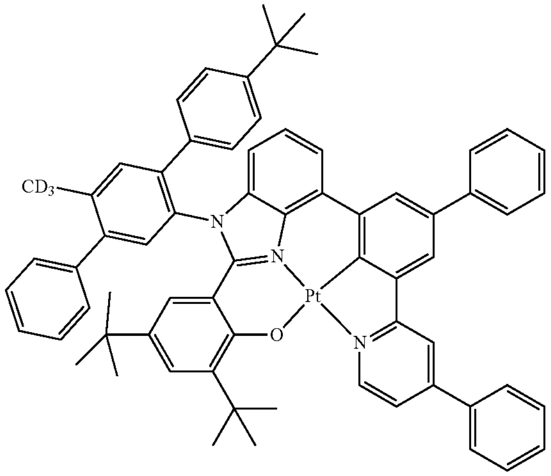
3037
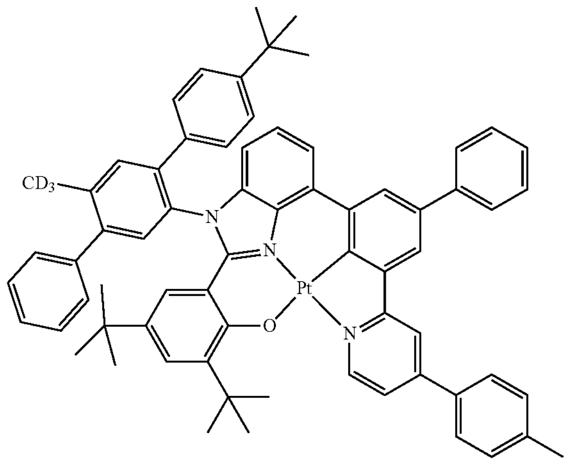
-continued
3038
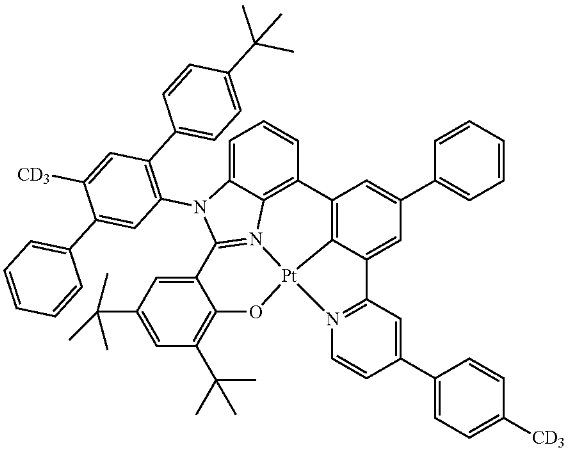
3039
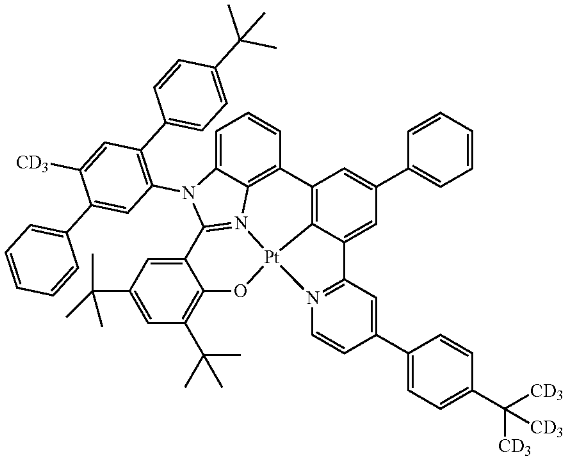
3040
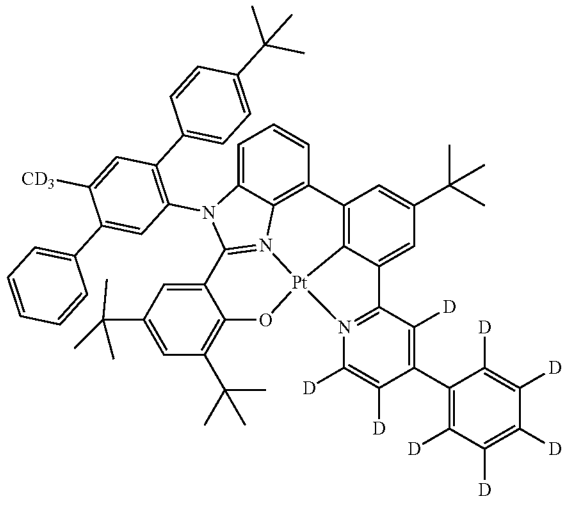

-continued
3041
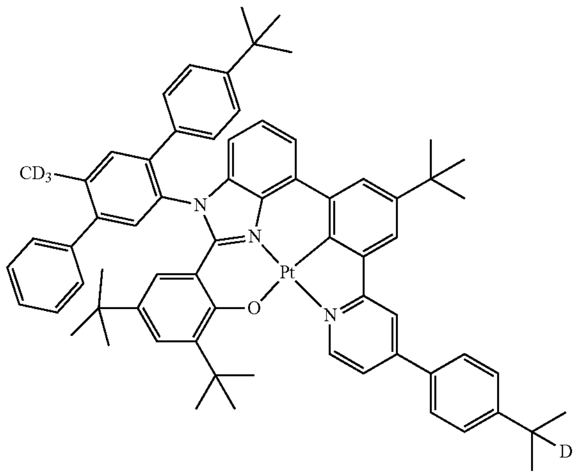
3042
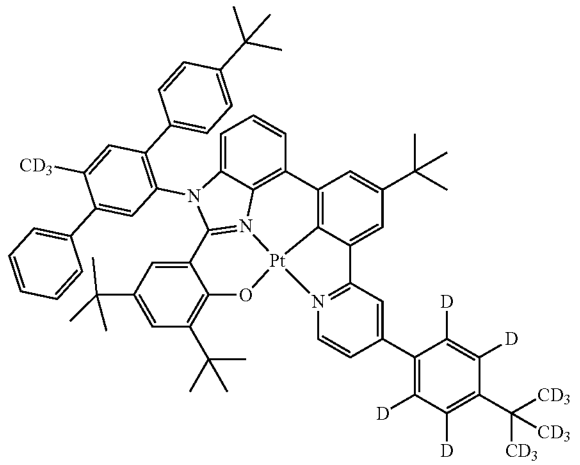
3043
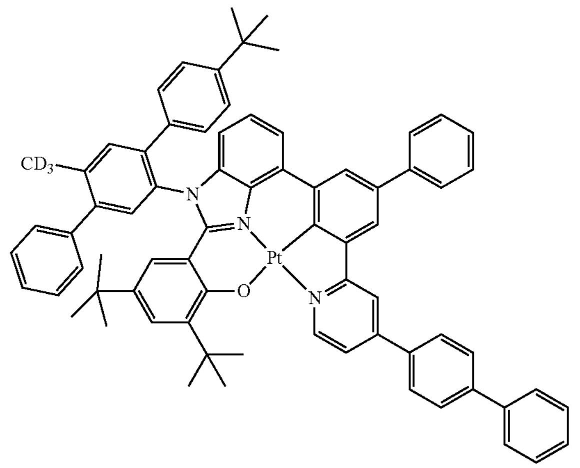
-continued
3044
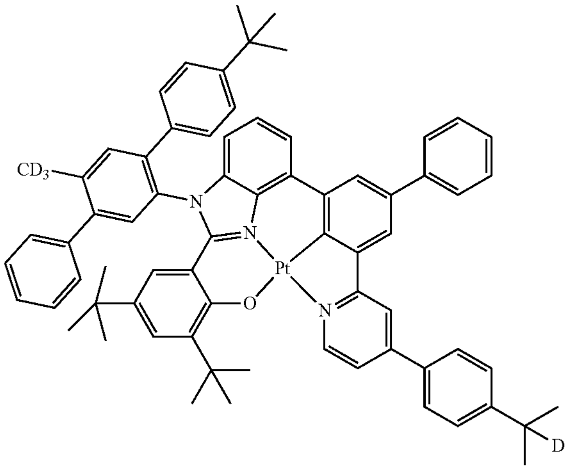
3045
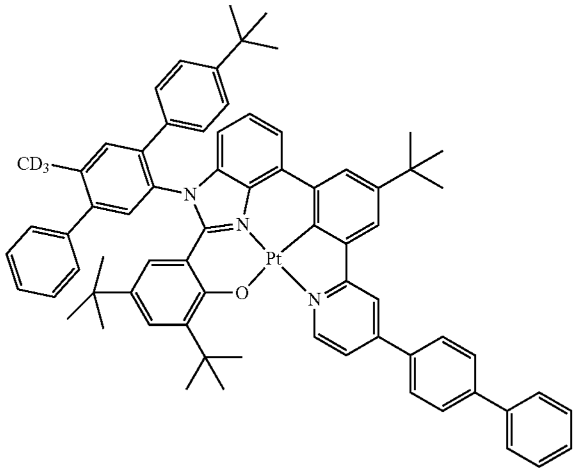
3046
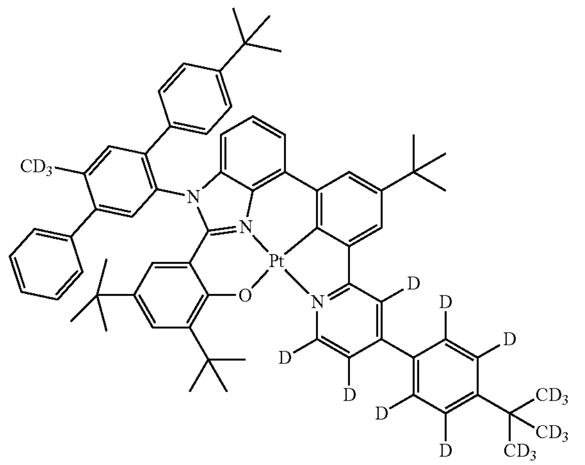

3047
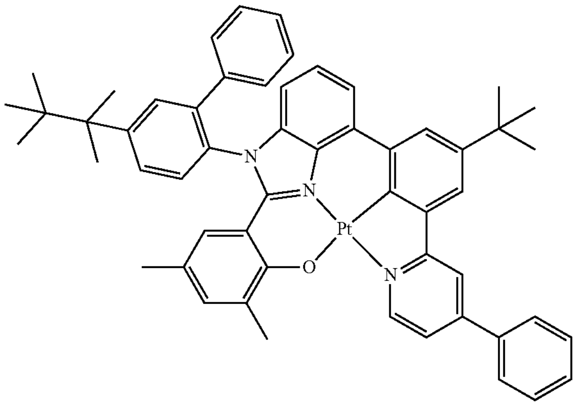
3048
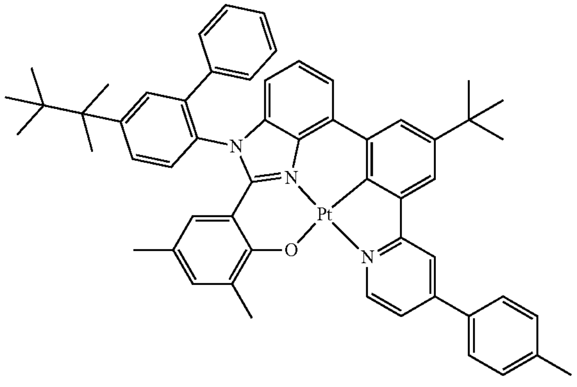
3049
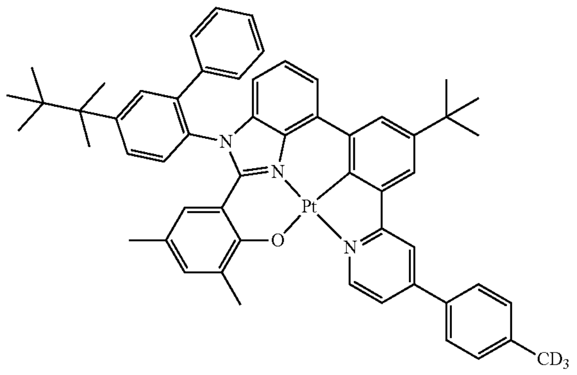
3050
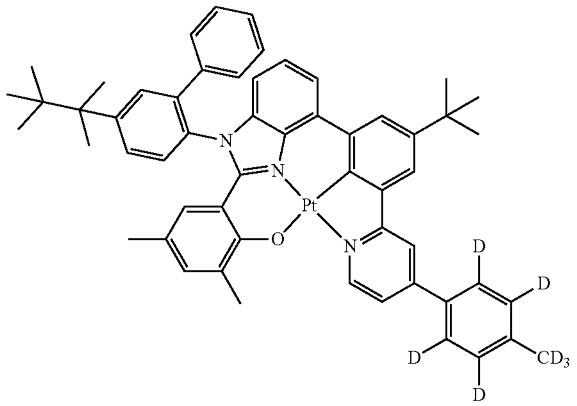
3051
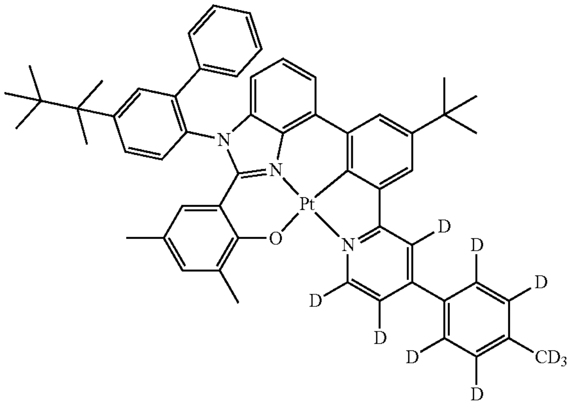
3052
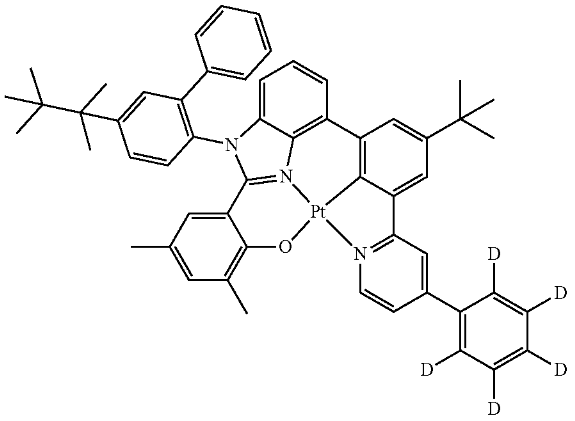
3053
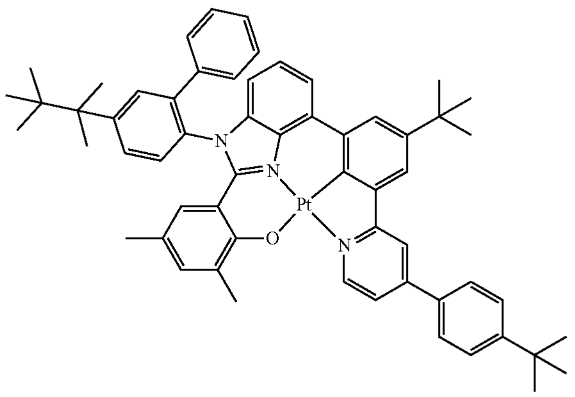

-continued
3054
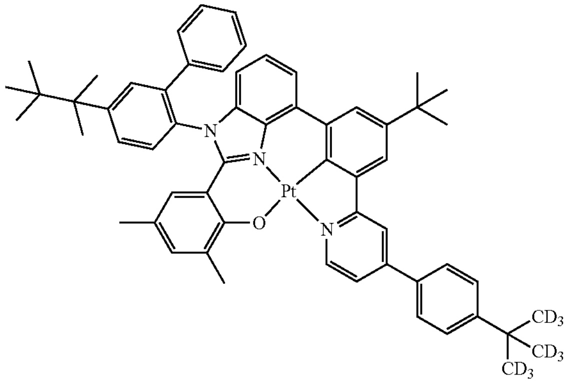
3055
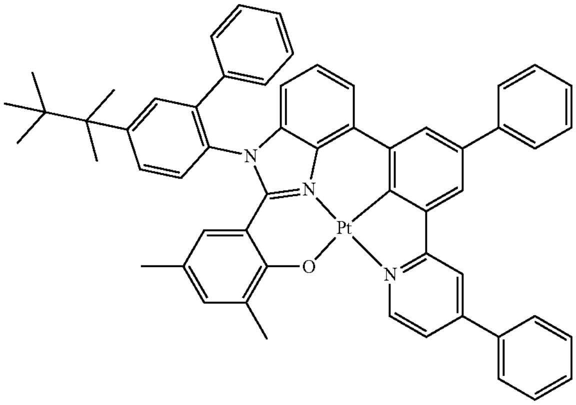
3056
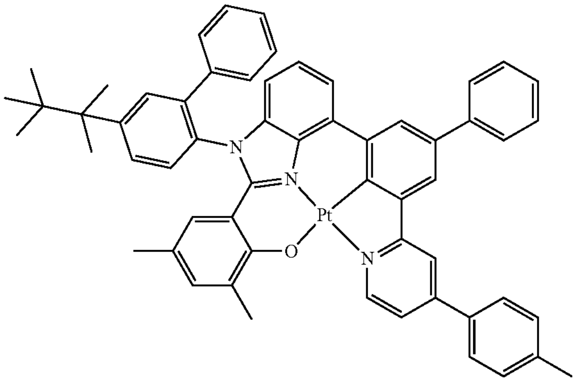
3057
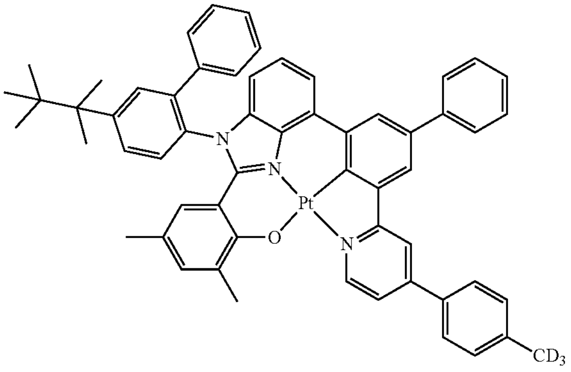
-continued
3058
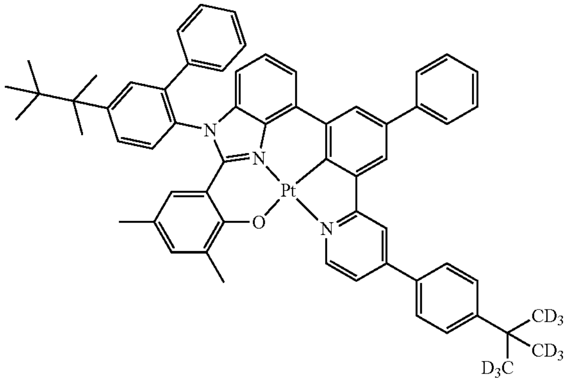
3059
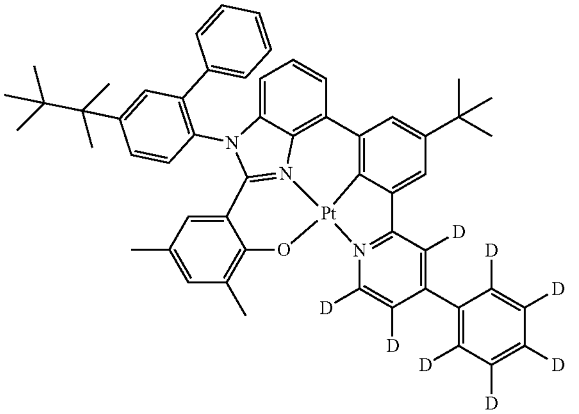
3060
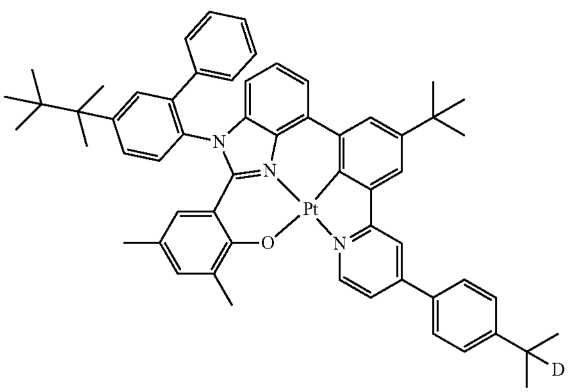

-continued
3061
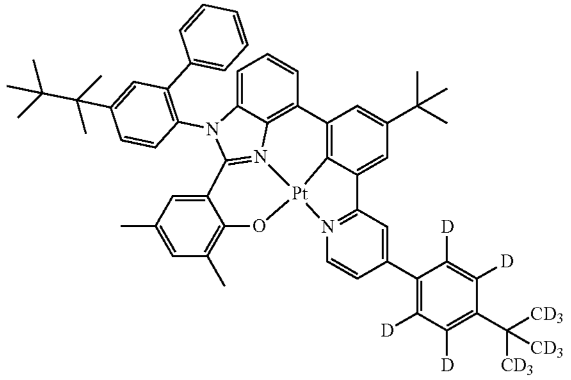
3062
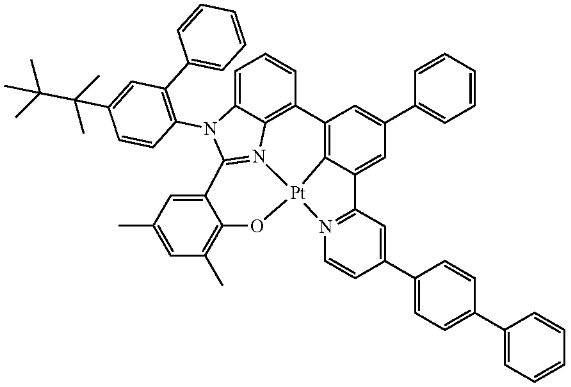
3063
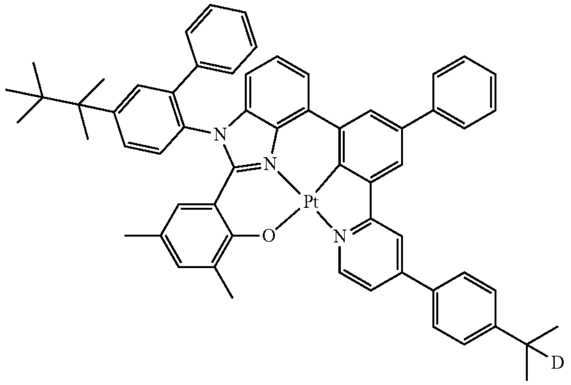
3064
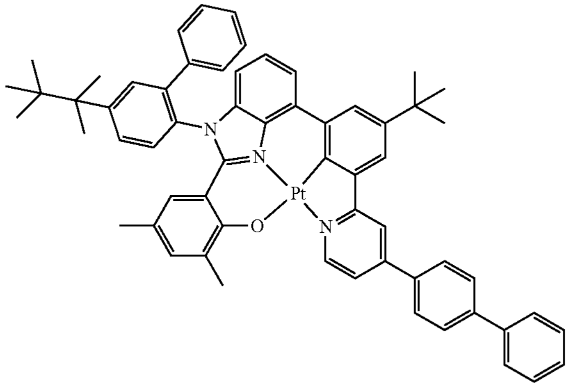
-continued
3065
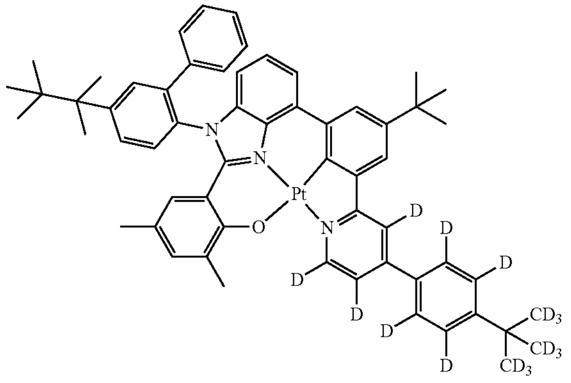
3066
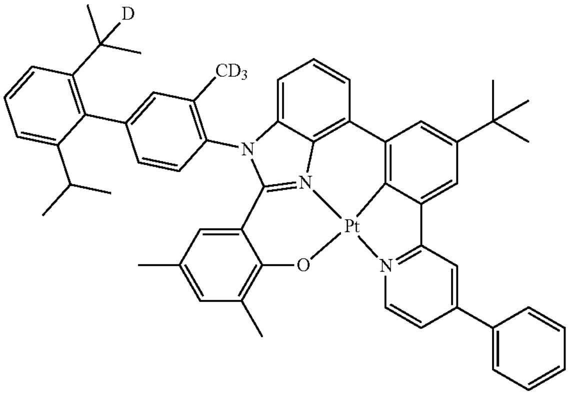
3067
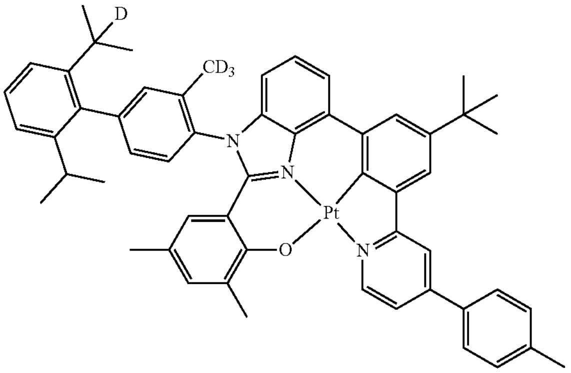
3068
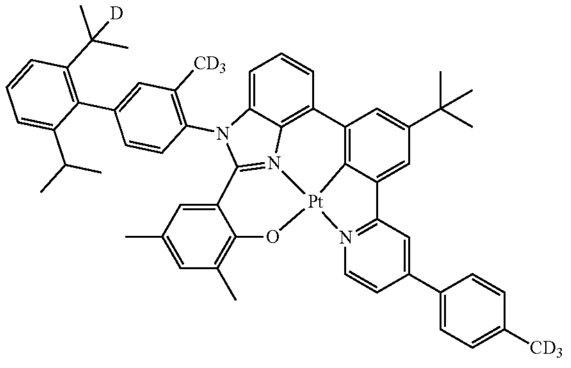

-continued
3069
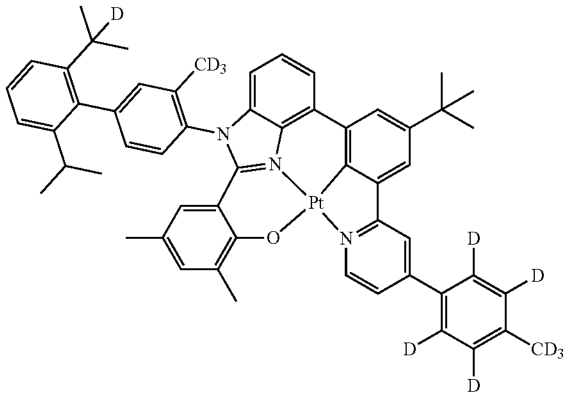
3070
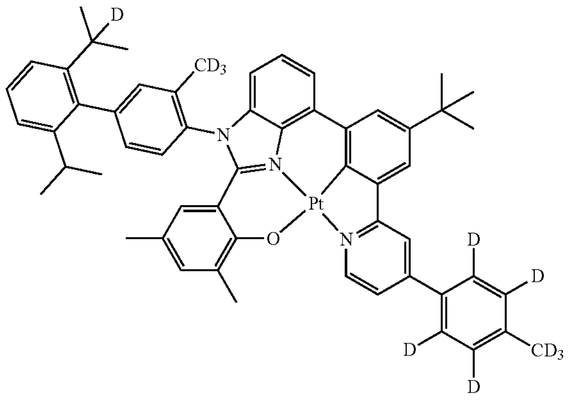
3071
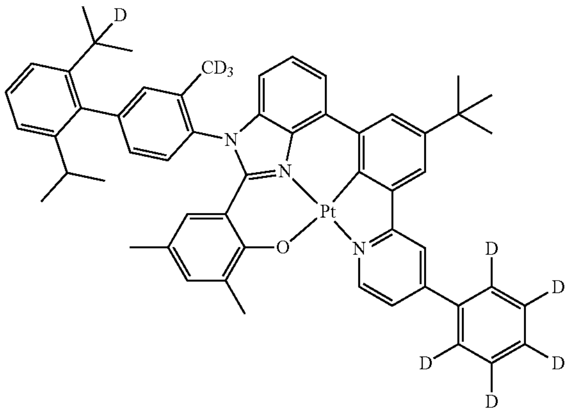
-continued
3072
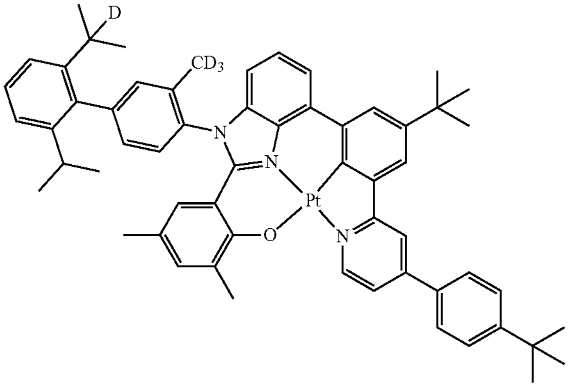
3073
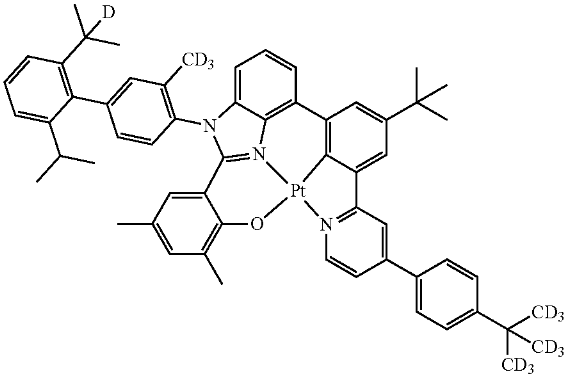
3074
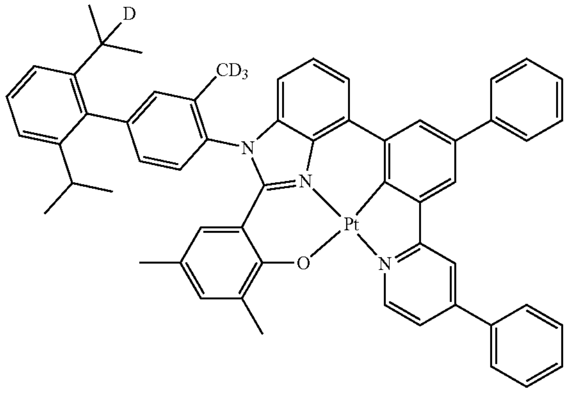
3075
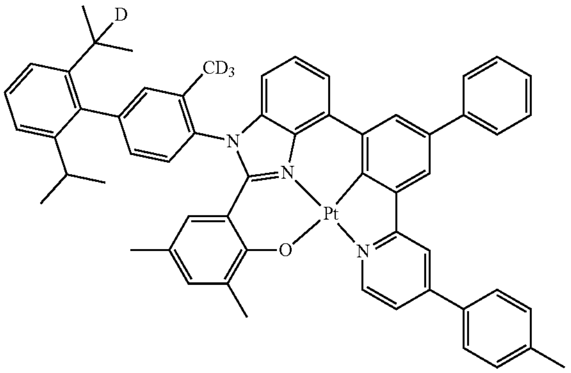

3076
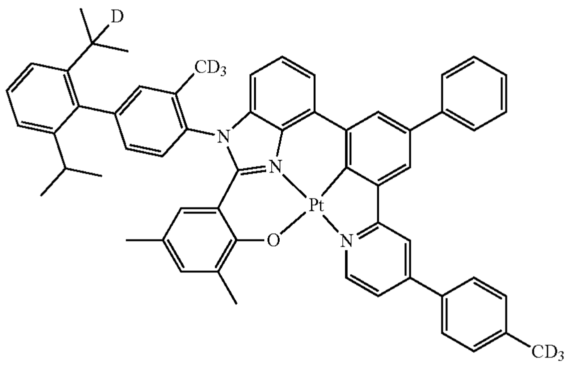
3077
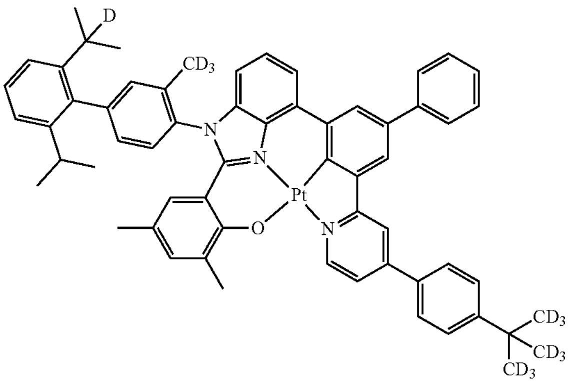
3078
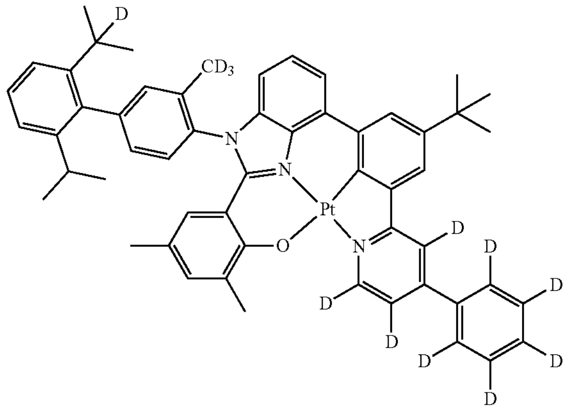
3079
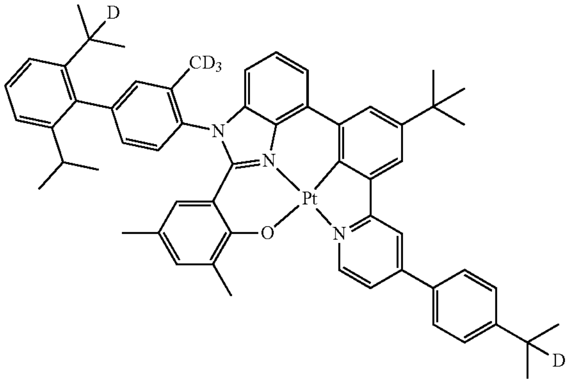
3080
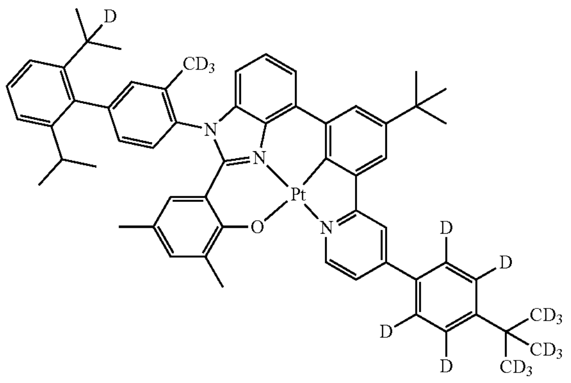
3081
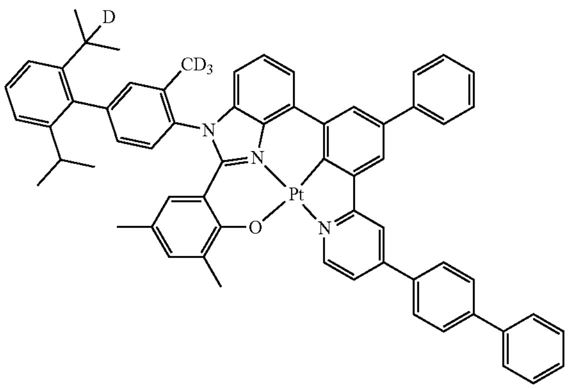
3082
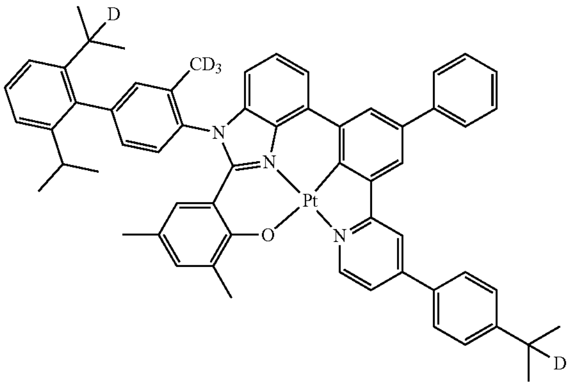
3083
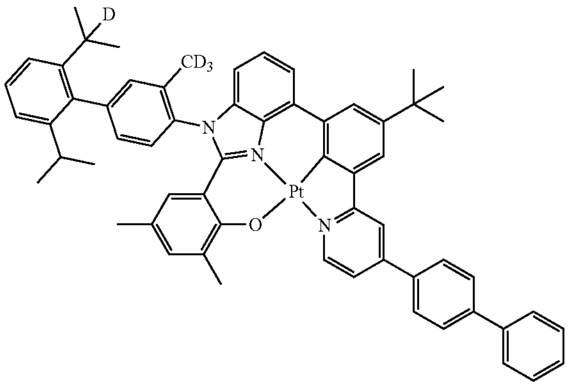

3084
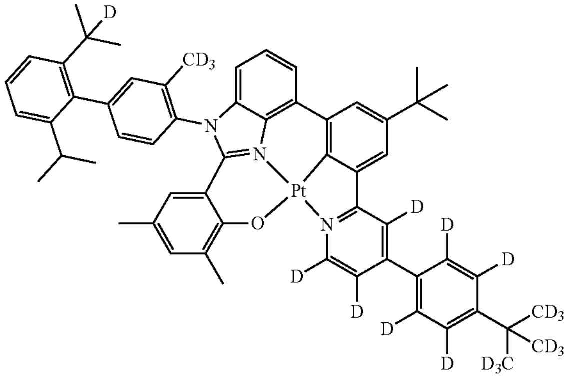
3085
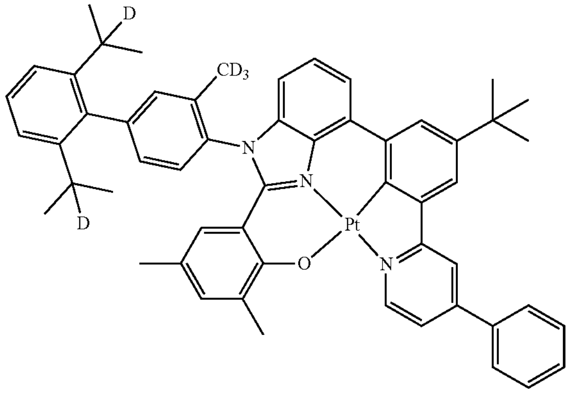
3086
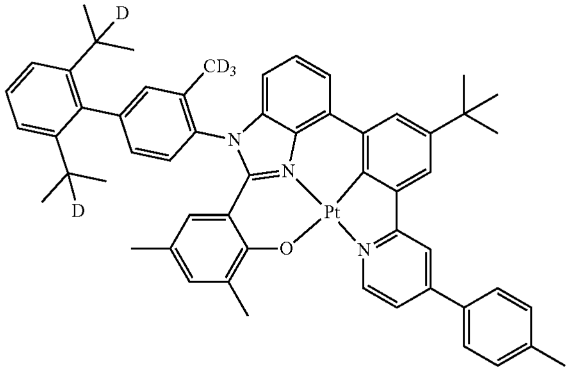
3087
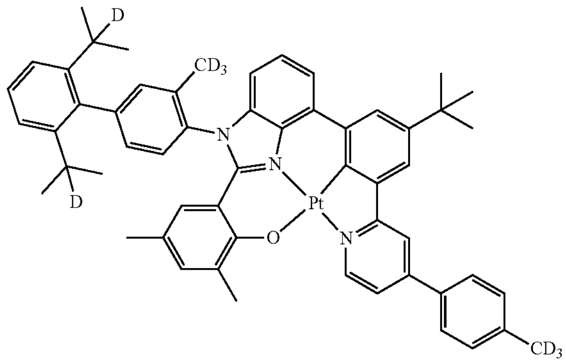
3088
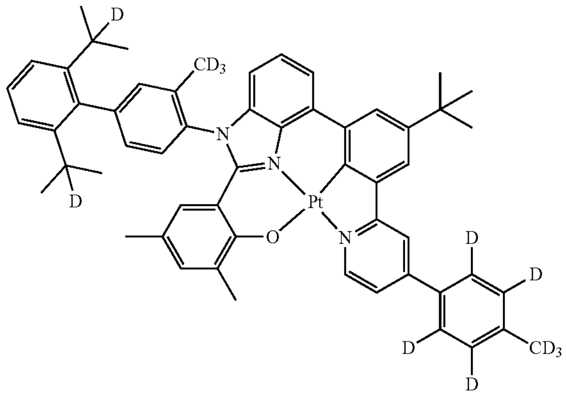
3089
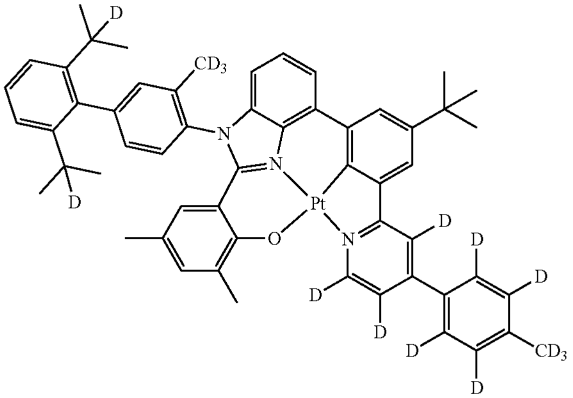
3090
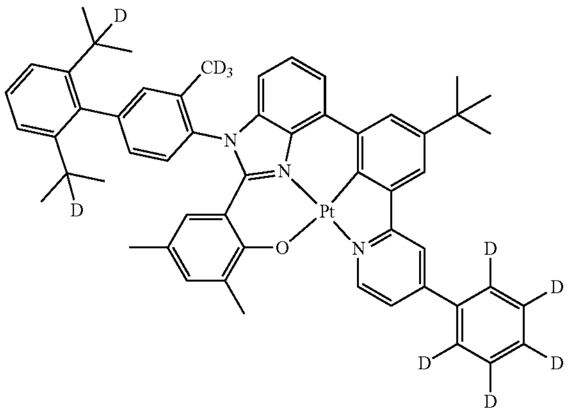

-continued
3091
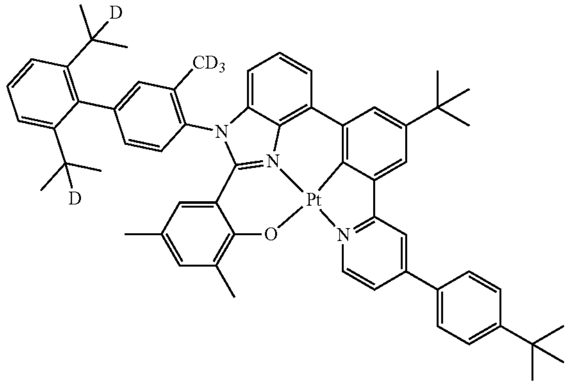
3092
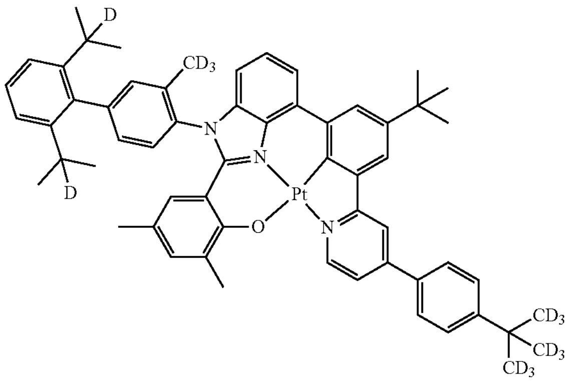
3093
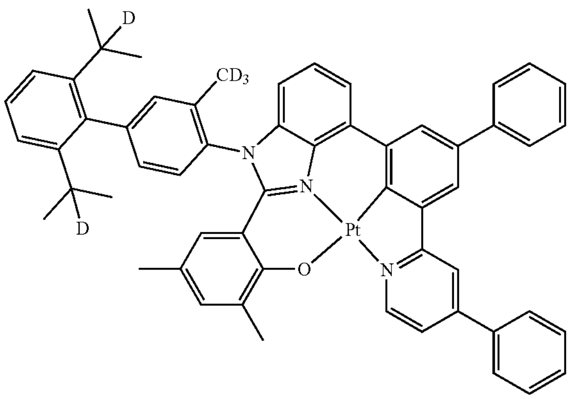
3094
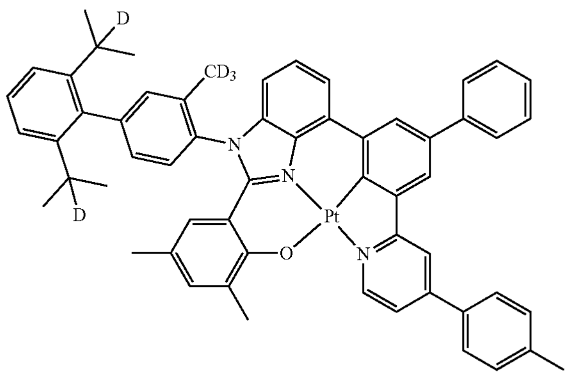
-continued
3095
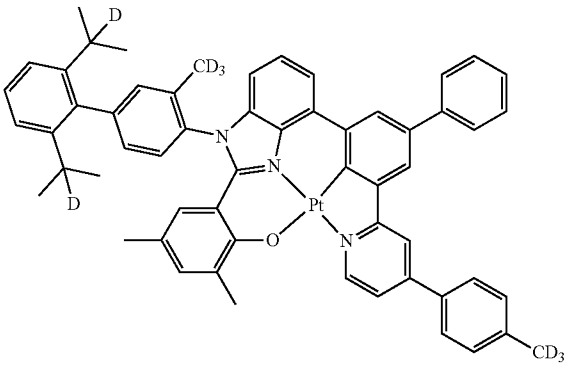
3096
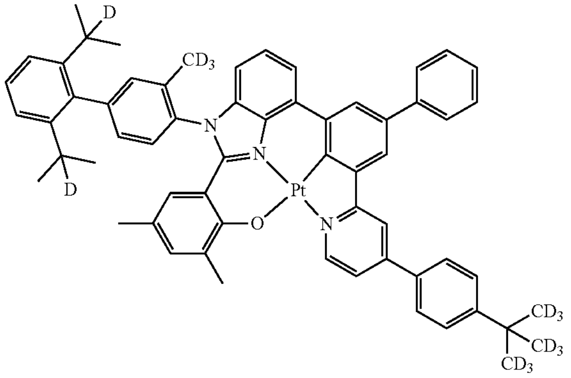
3097
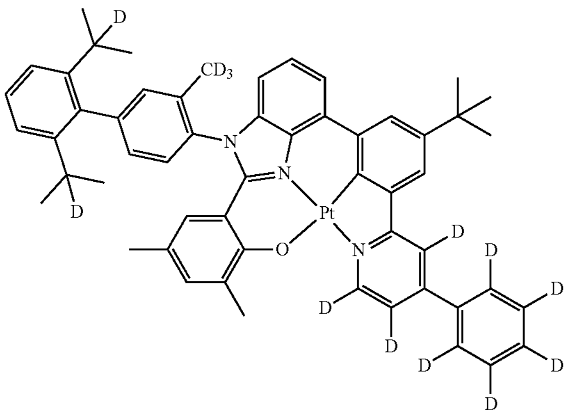
3098
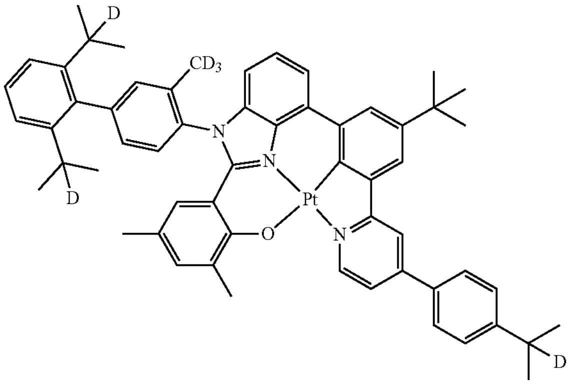

-continued
3099
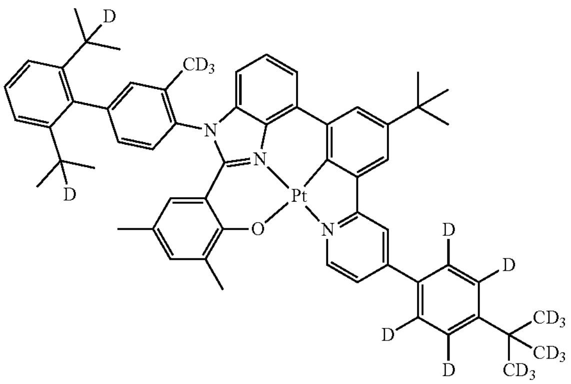
3100
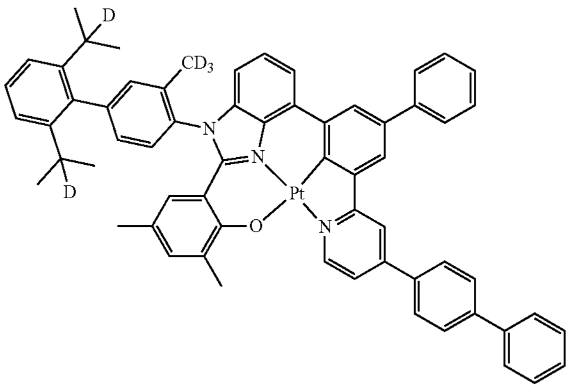
3101
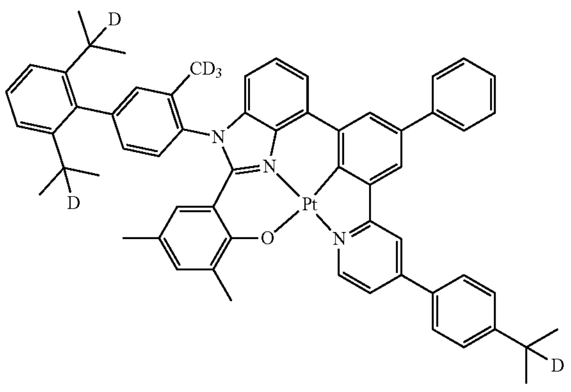
3102
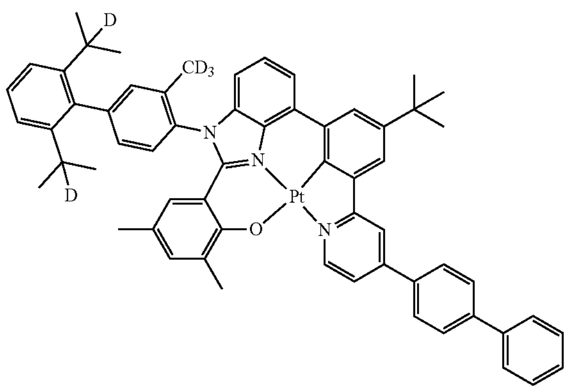
-continued
3103
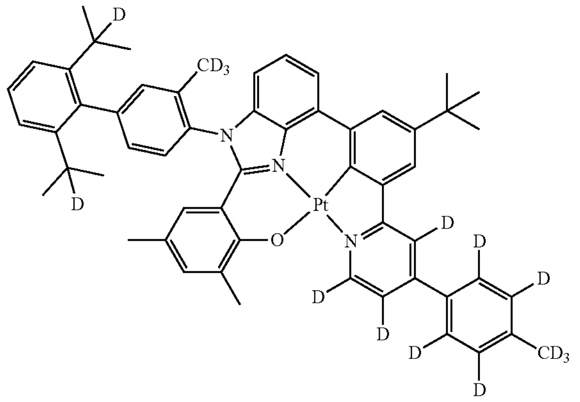
3104
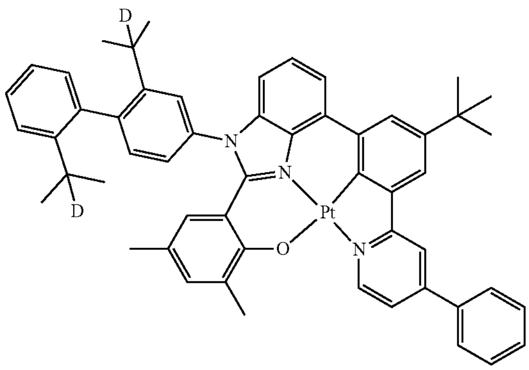
3105
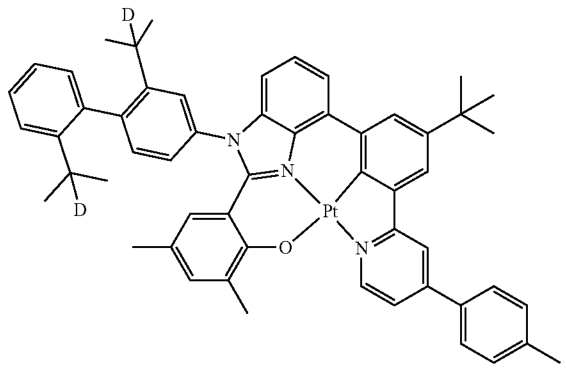
3106
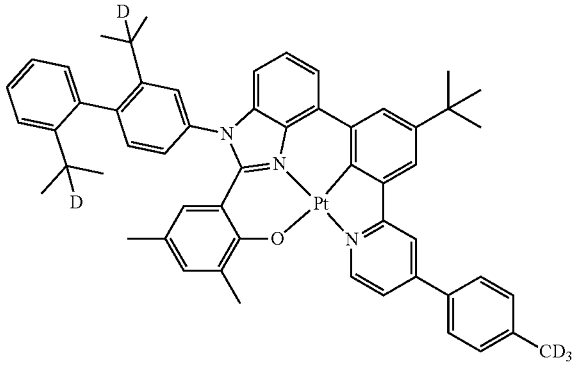

3107
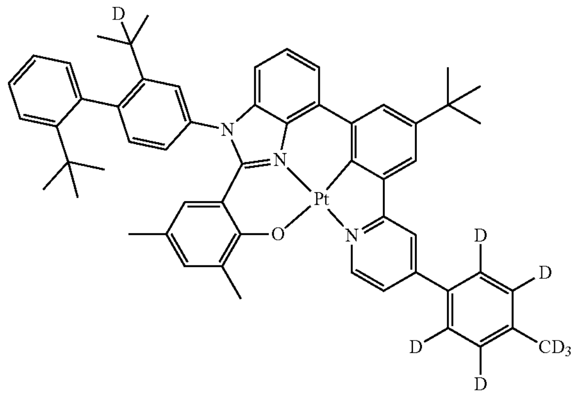
3108
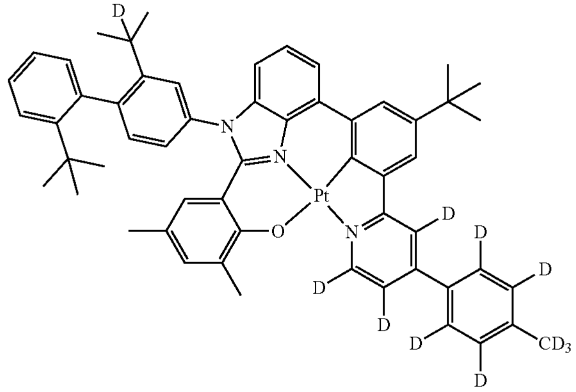
3109
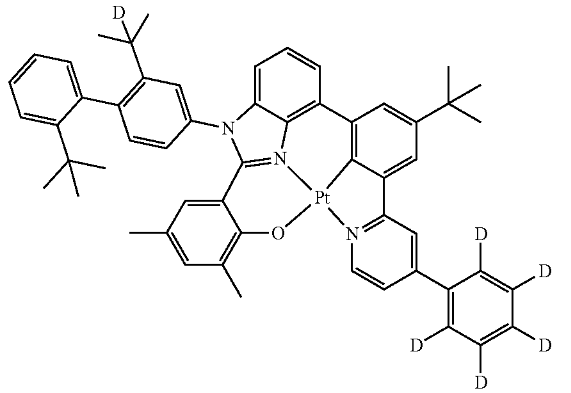
3110
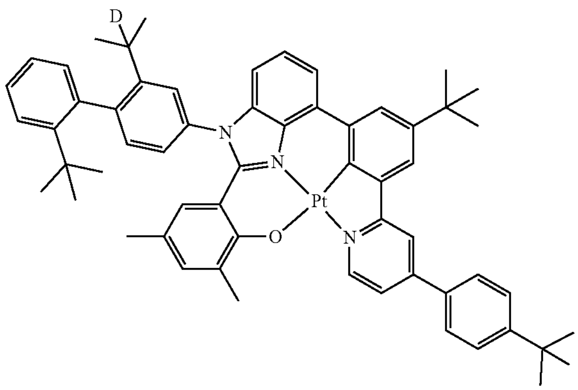
3111
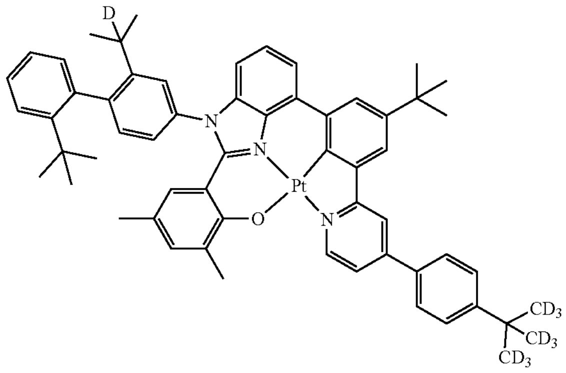
3112
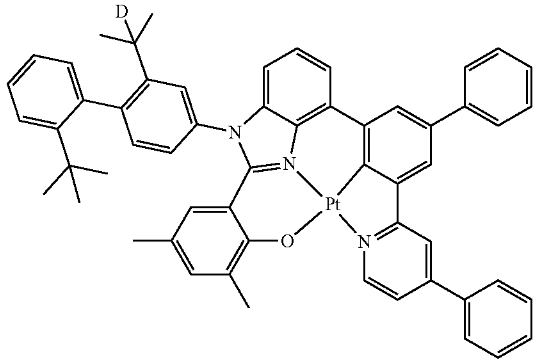
3113
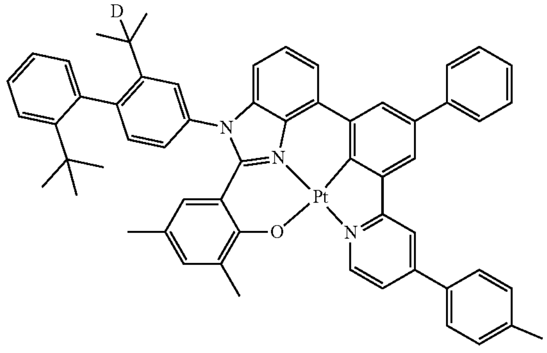
3114
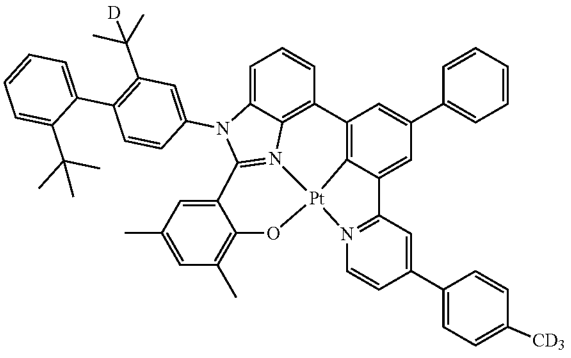

-continued
3115
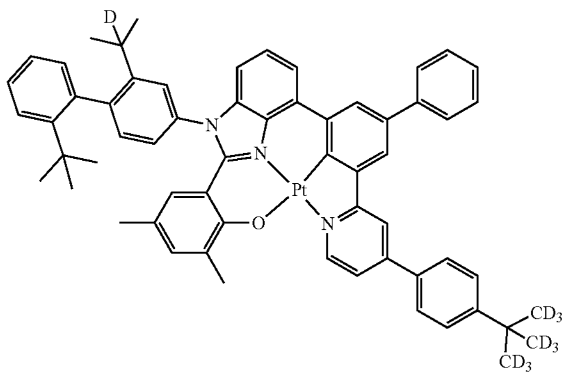
3116
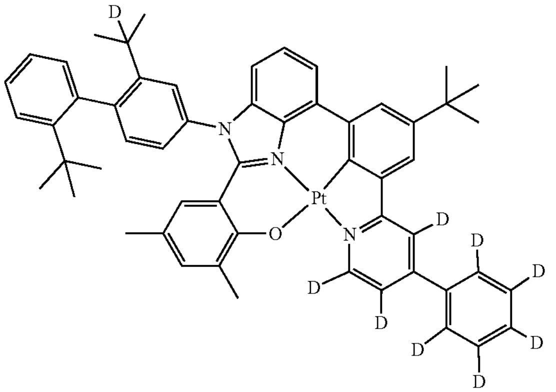
3117
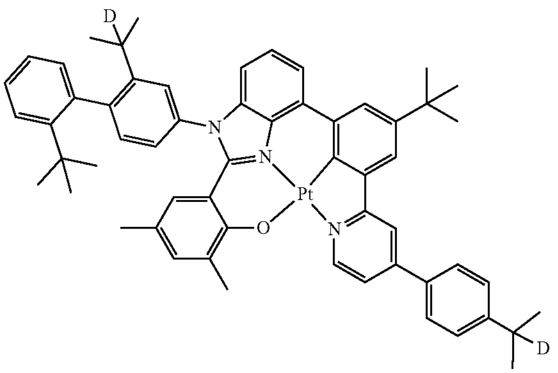
3118
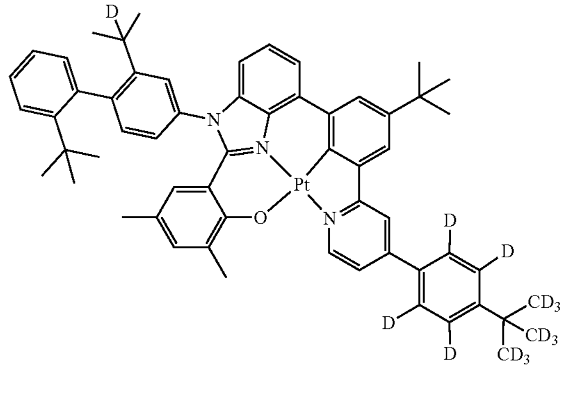
-continued
3119
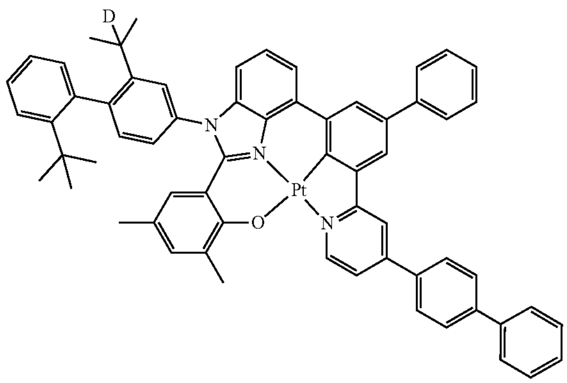
3120
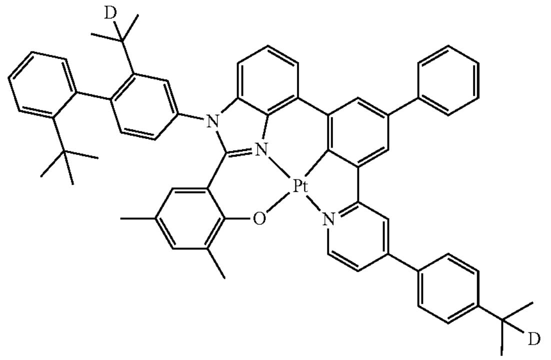
3121
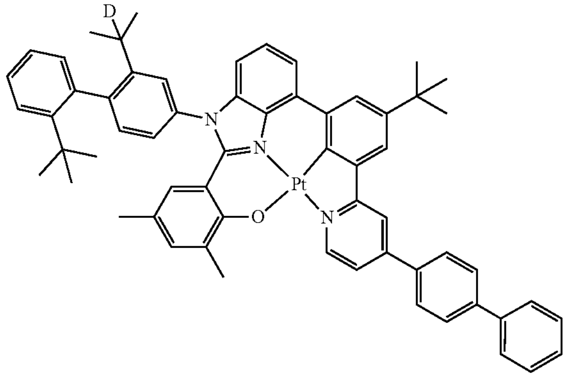
3122
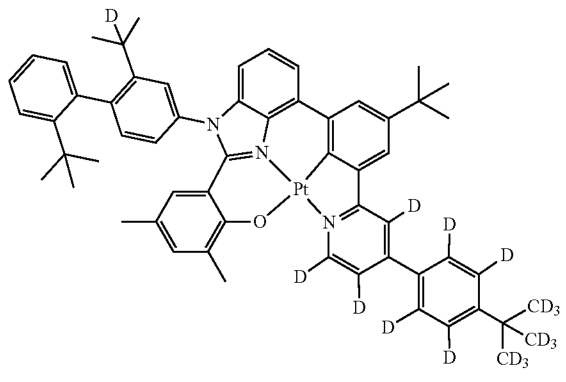

-continued
3123
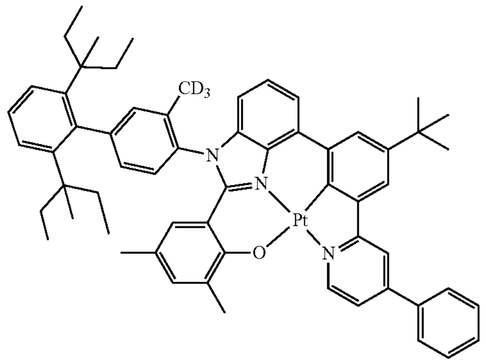
3124
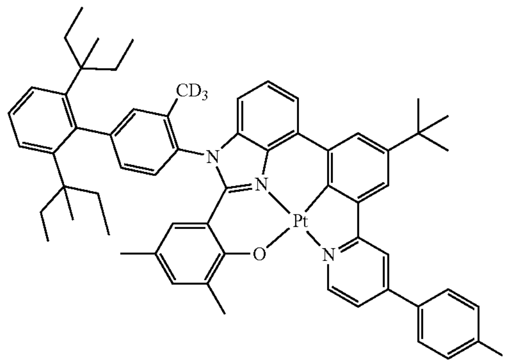
3125
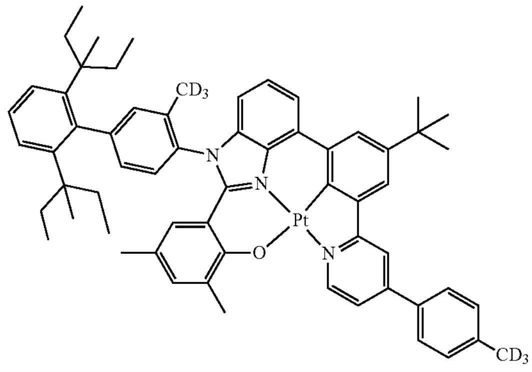
3126
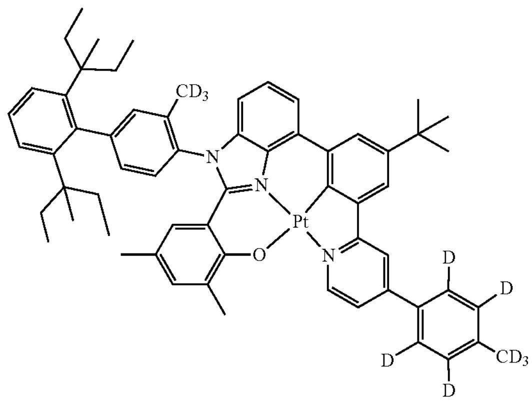
-continued
3127
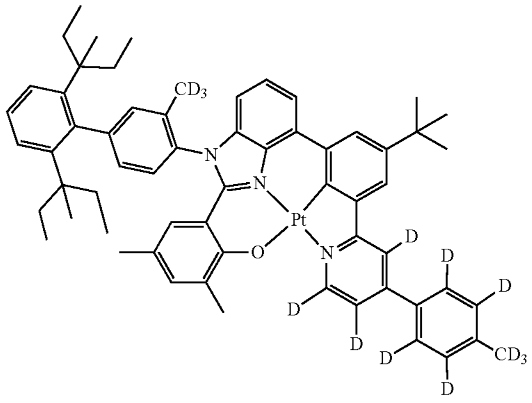
3128
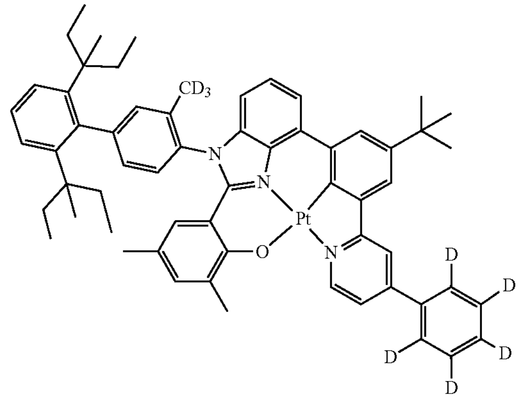
3129
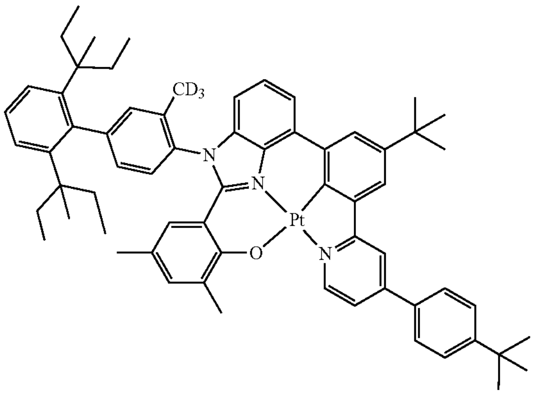

-continued
3130
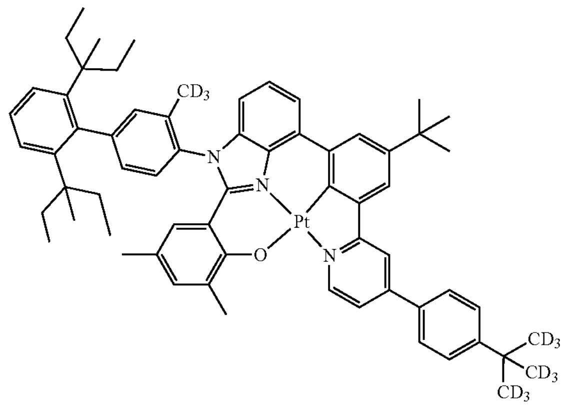
3131
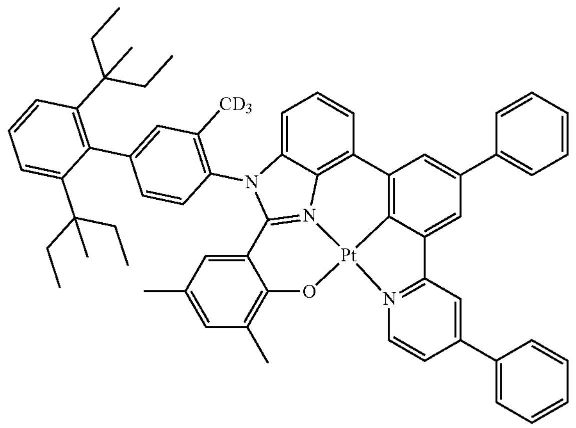
3132
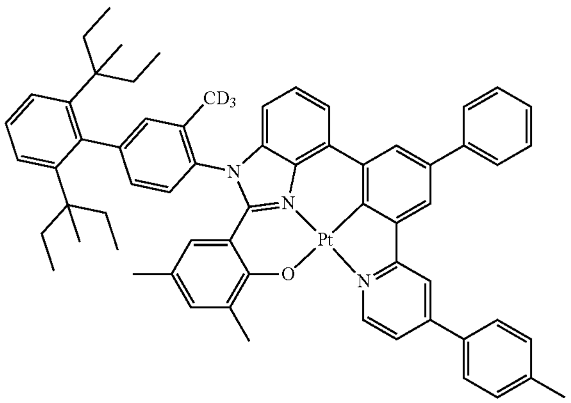
3133
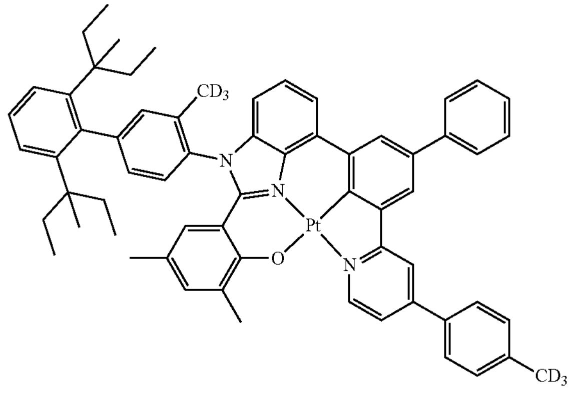
3134
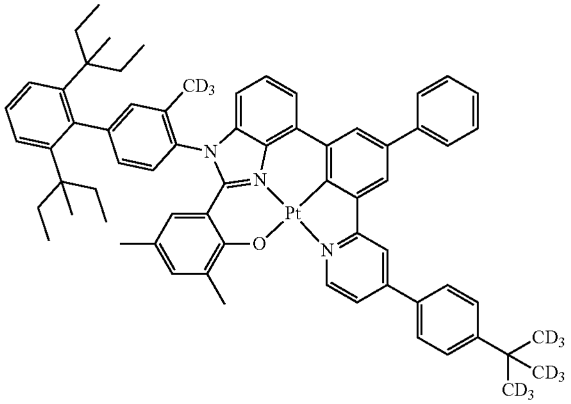

-continued
3135
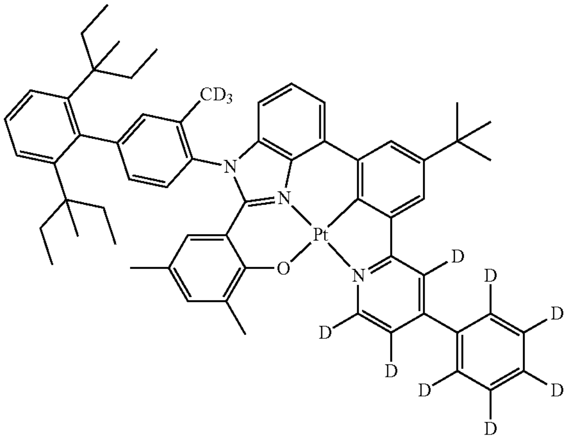
3136
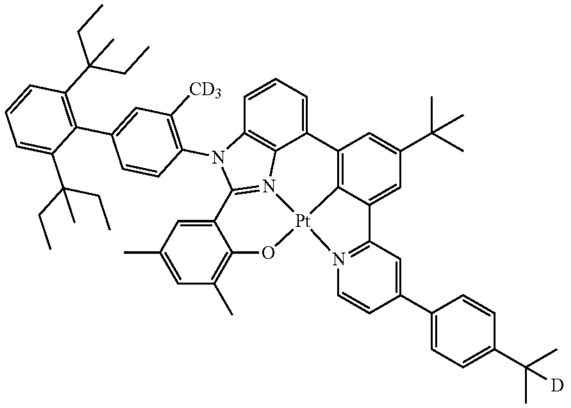
3137
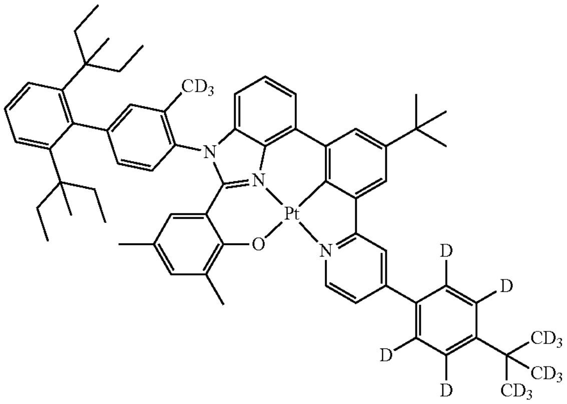
3138
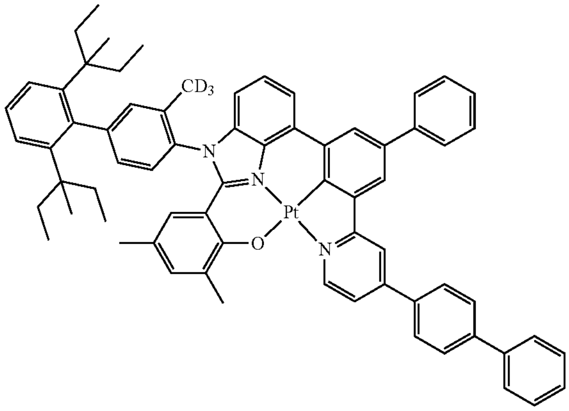
3139
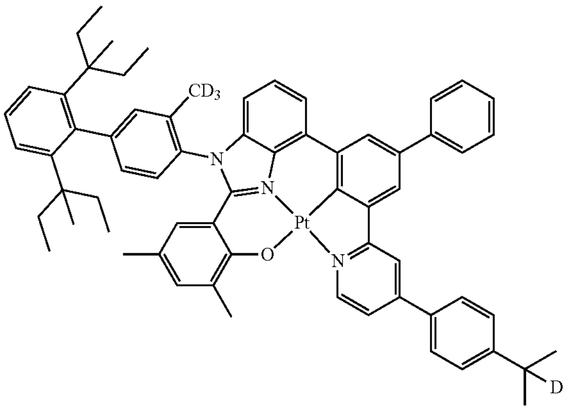
3140
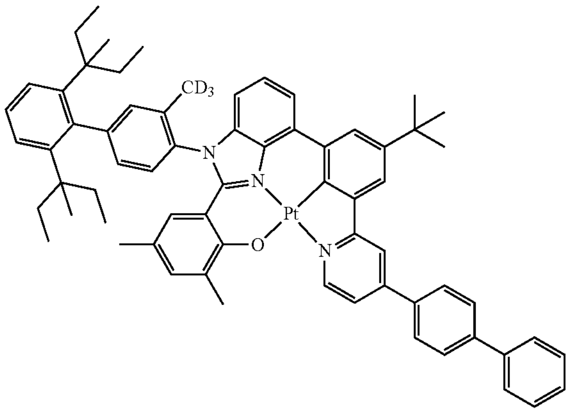

-continued
3141
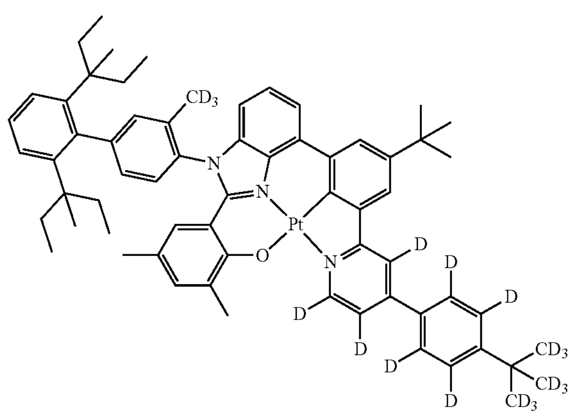
3142
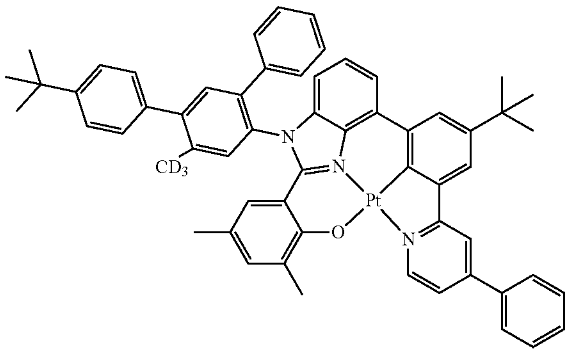
3143
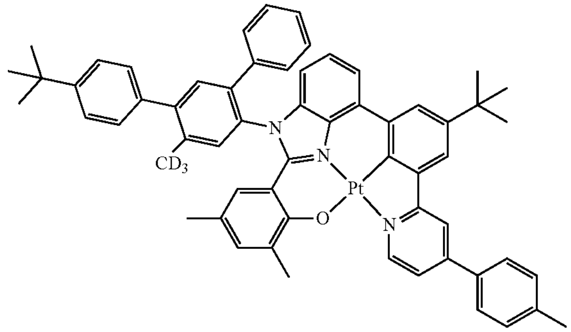
3144
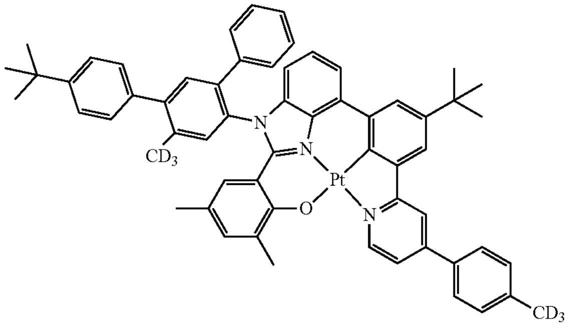
3145
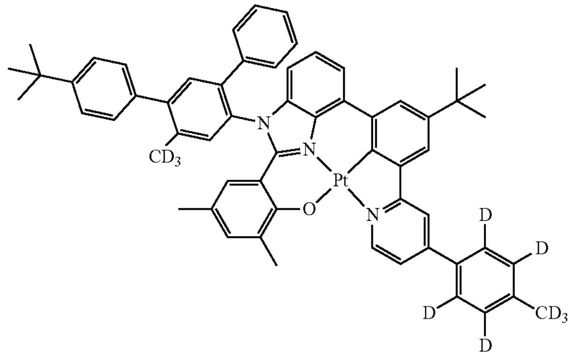
3146
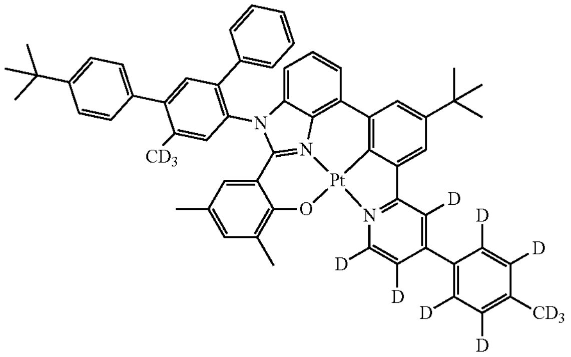
3147
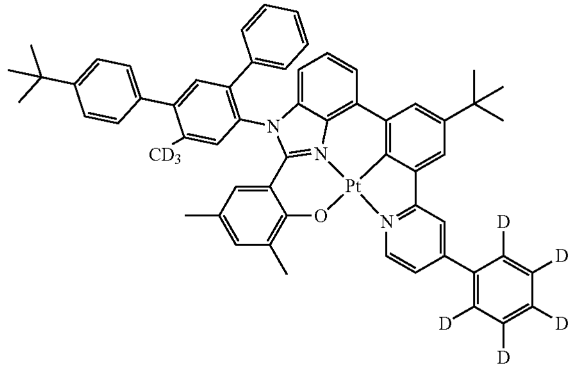
3148
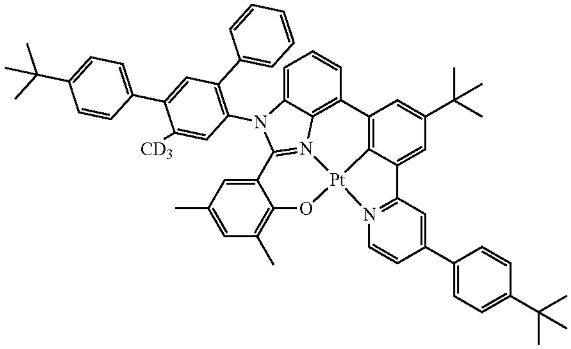

-continued
3149
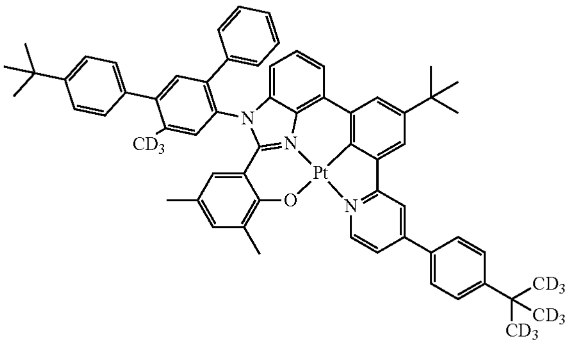
3150
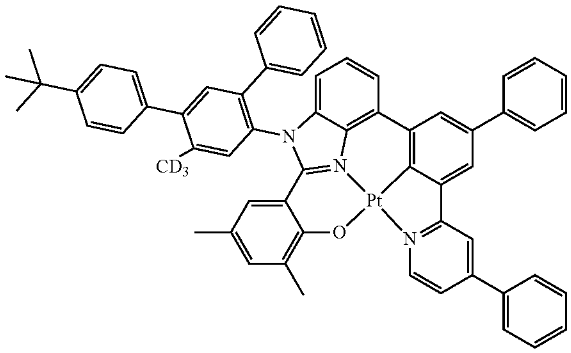
3151
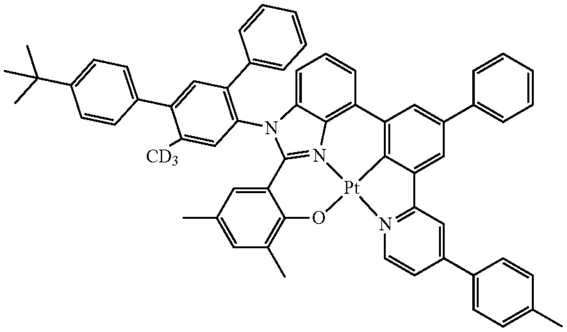
3152
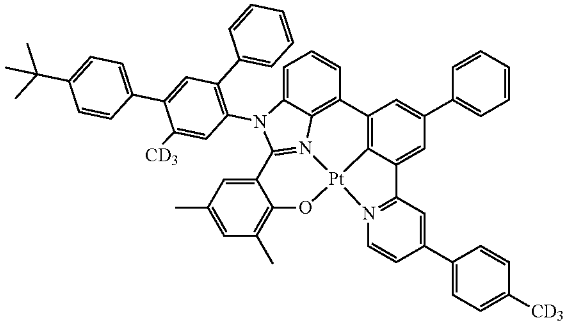
3153
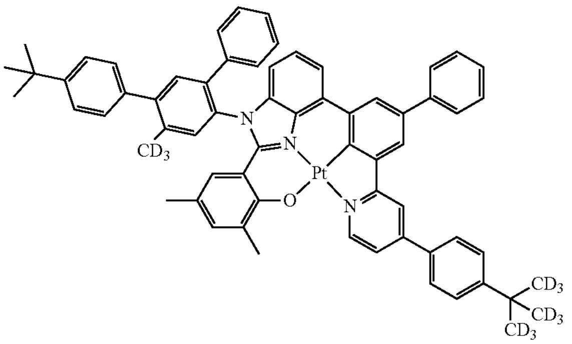
3154
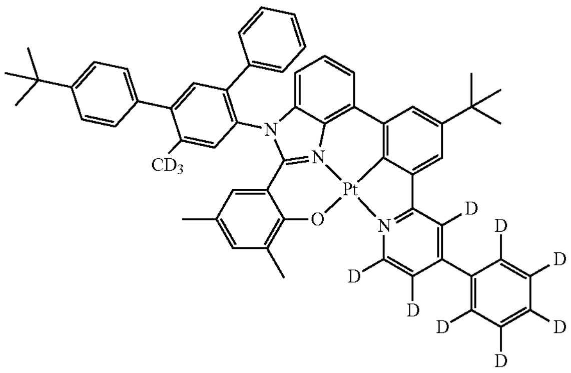
3155
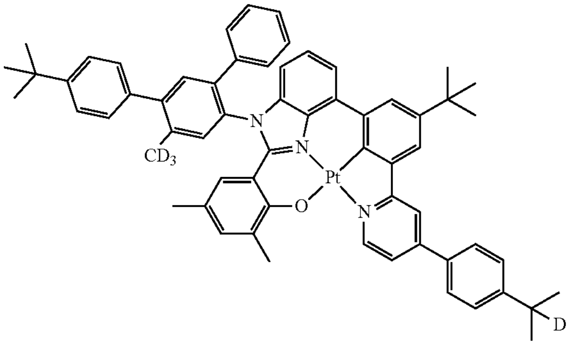
3156
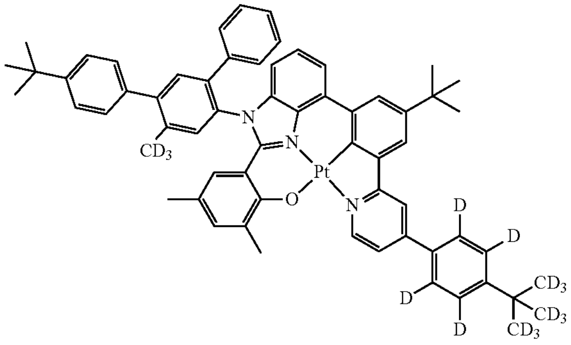

-continued
3157
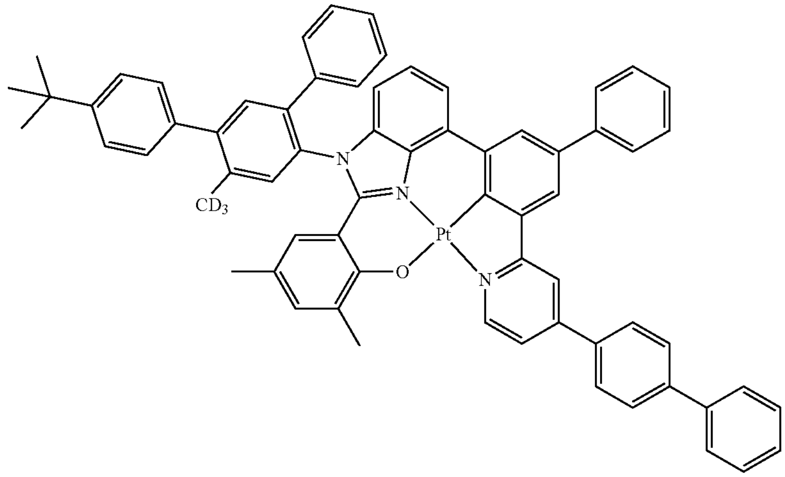
3158
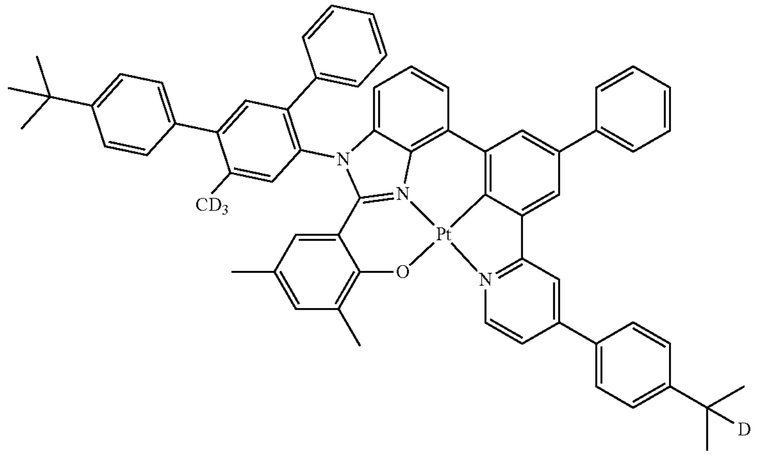
3159
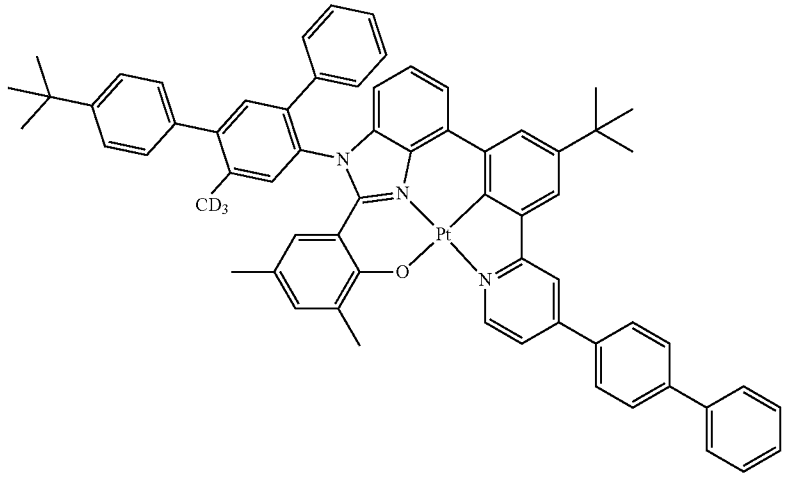

-continued
3160
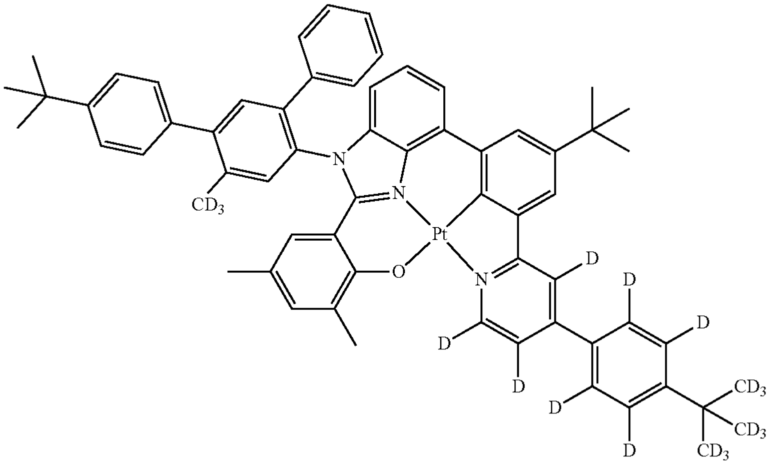
3161
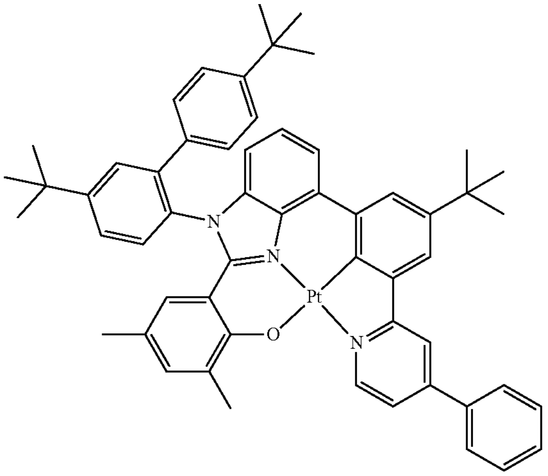
3162
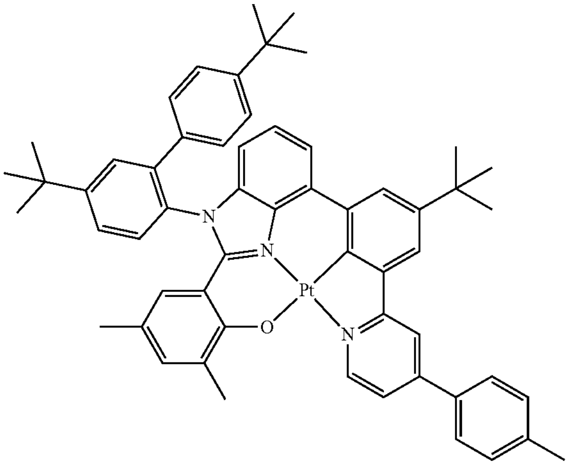
3163
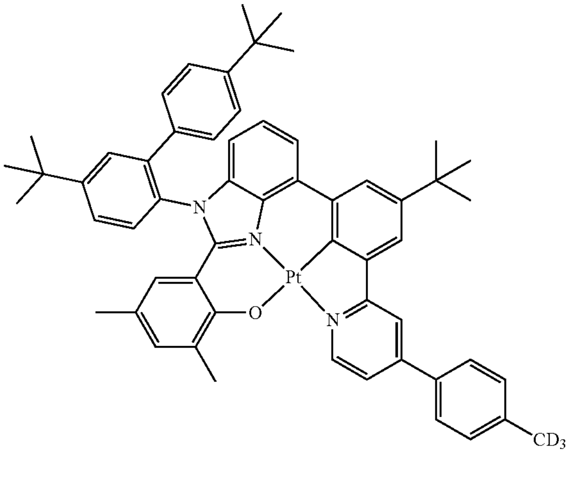
3164
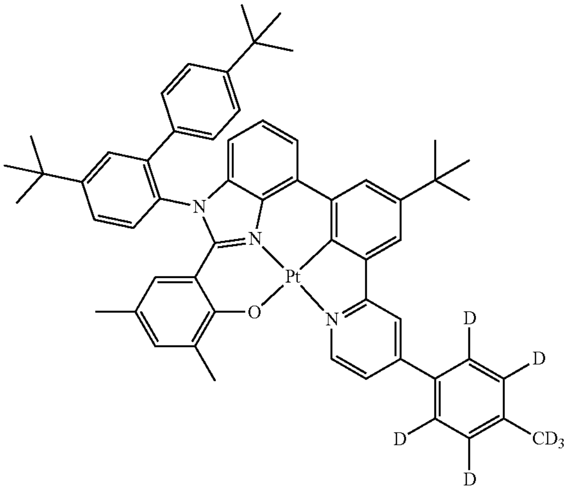

-continued
3165
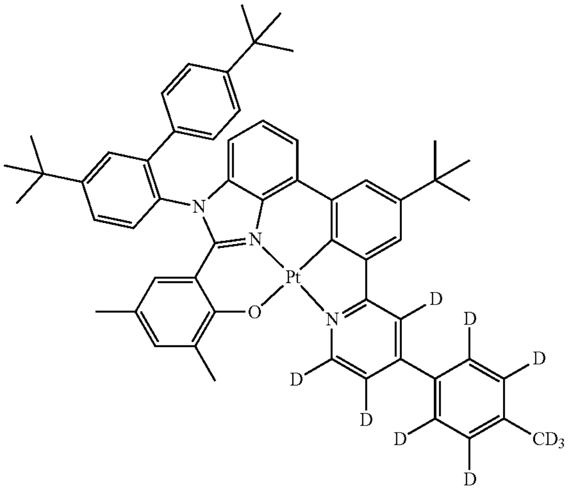
3166
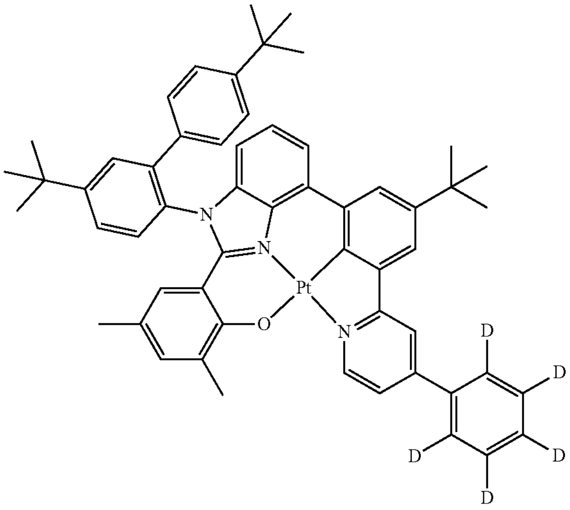
3167
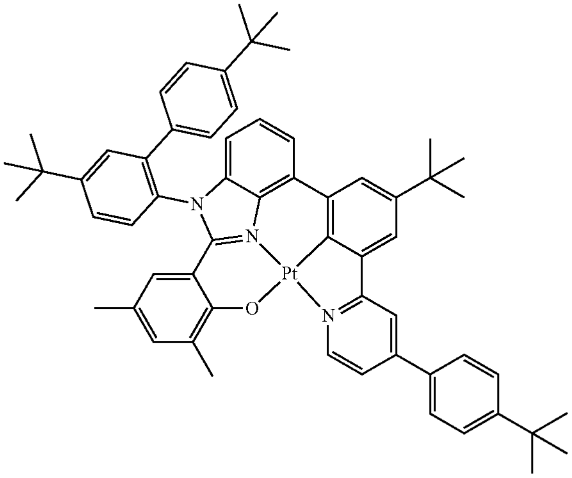
3168
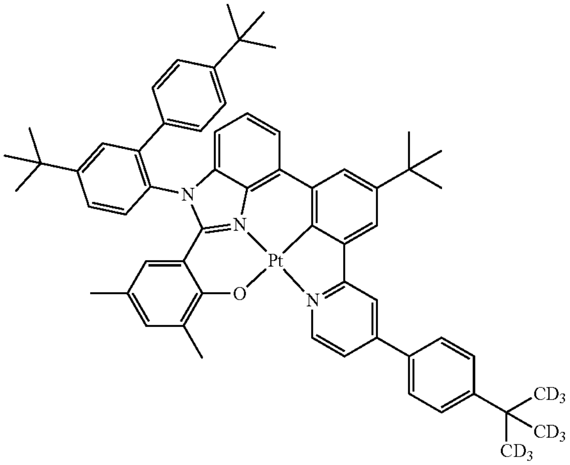
3169
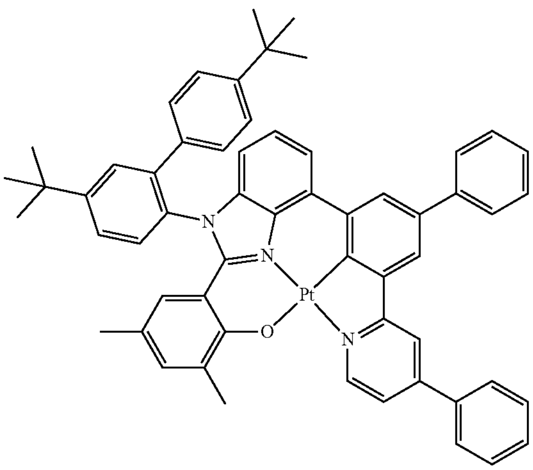
3170
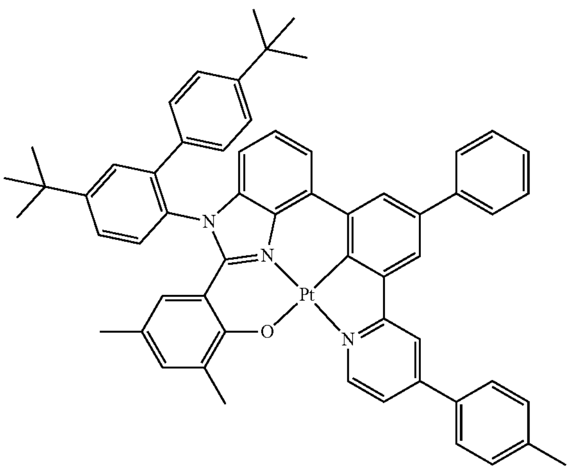

-continued
3171
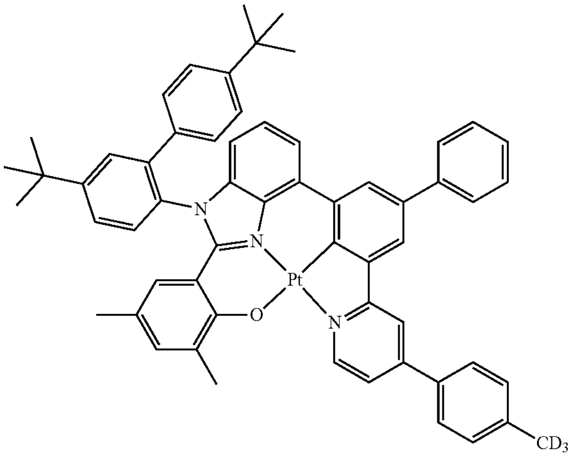
3172
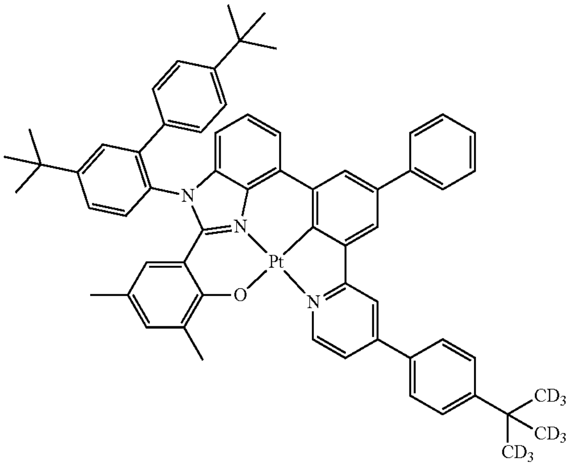
3173
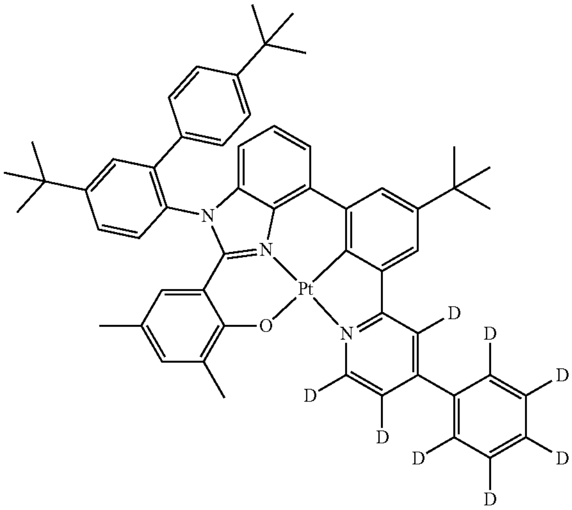
3174
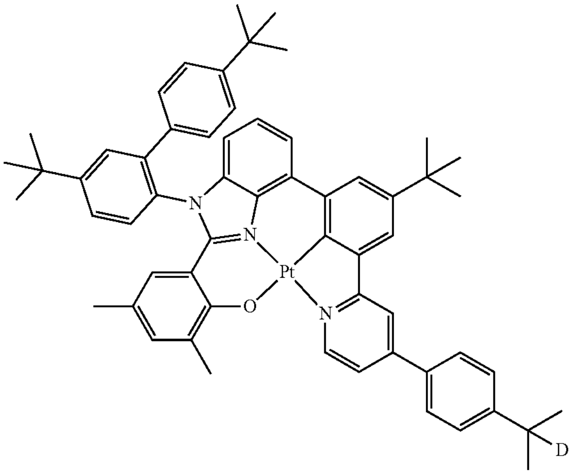
3175
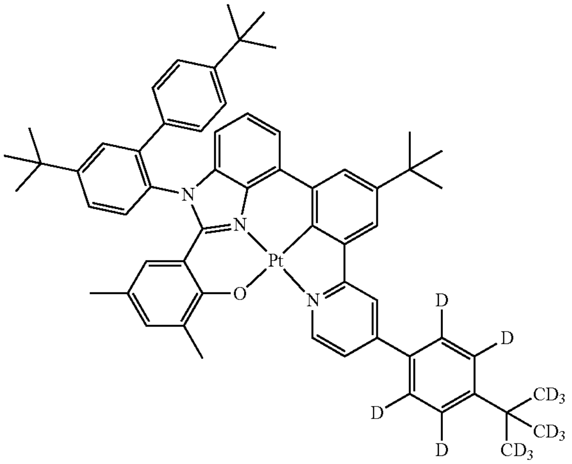
3176
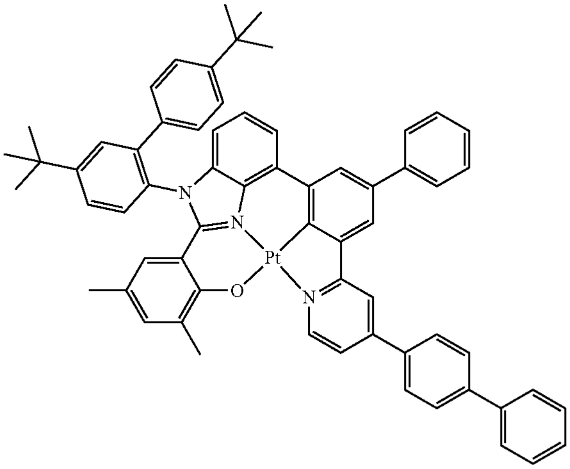

-continued
3177
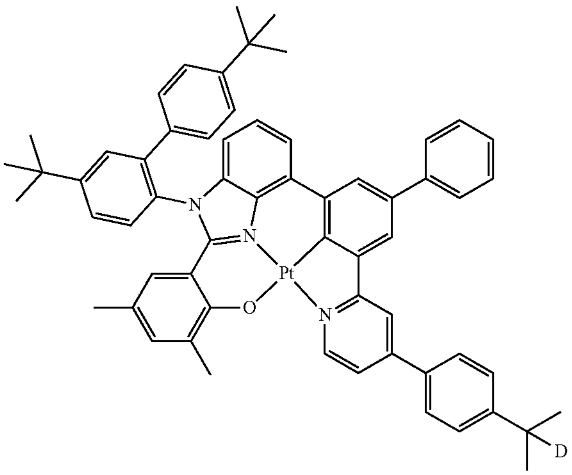
3178
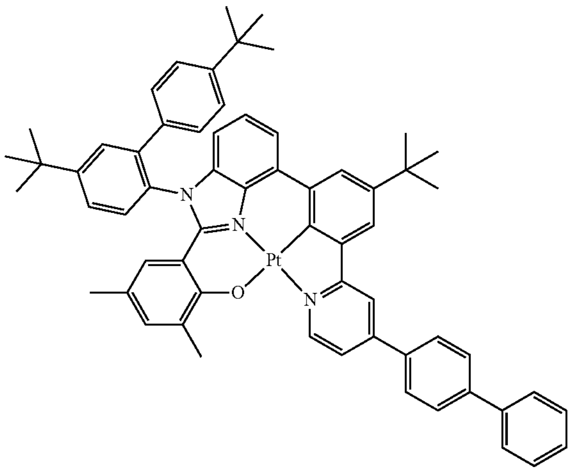
3179
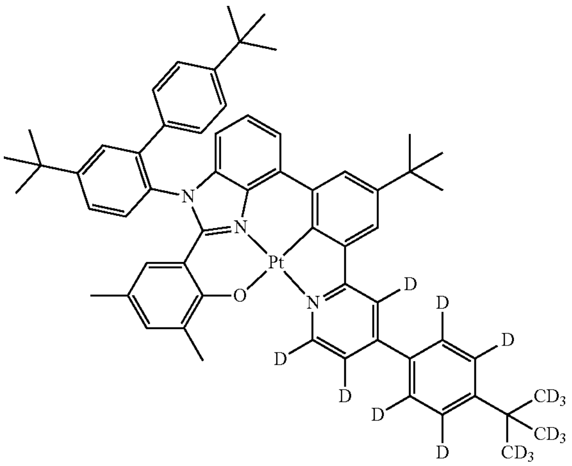
3180
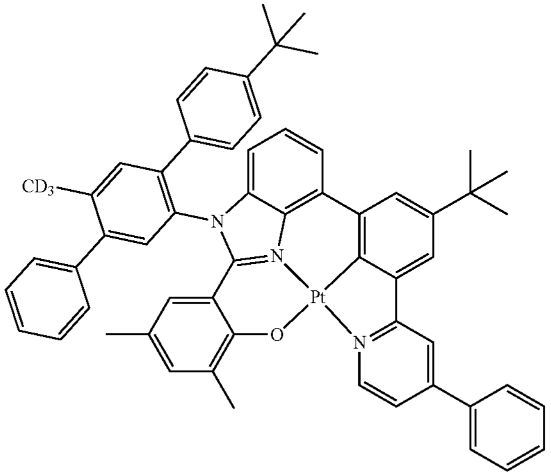
3181
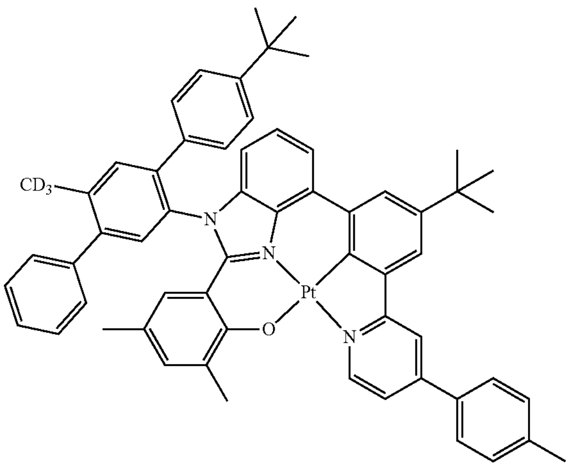
3182
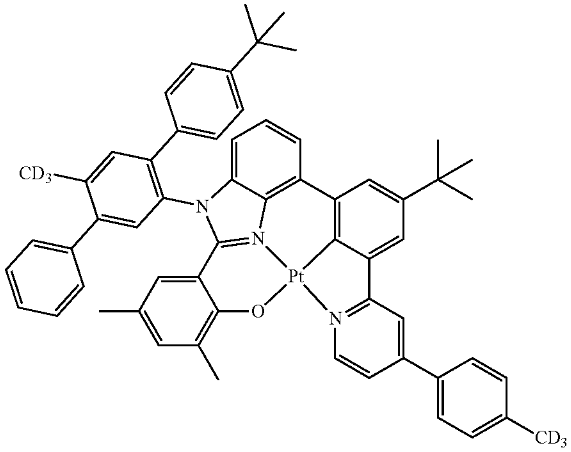

-continued
3183
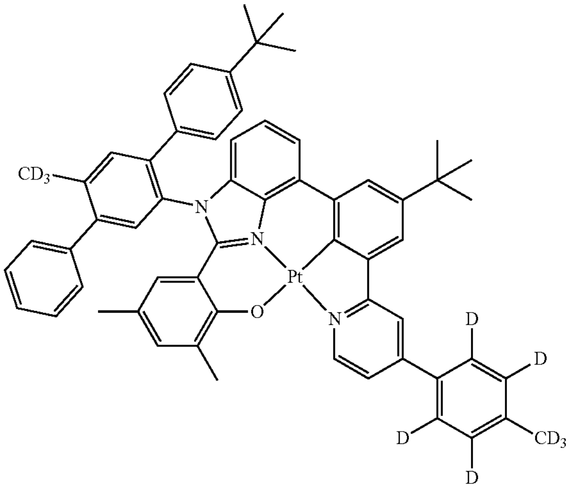
3184
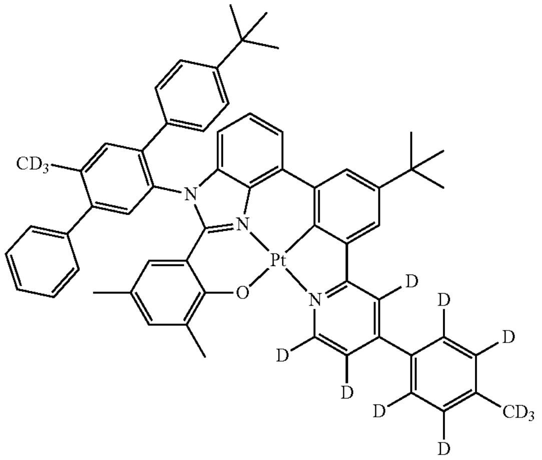
3185
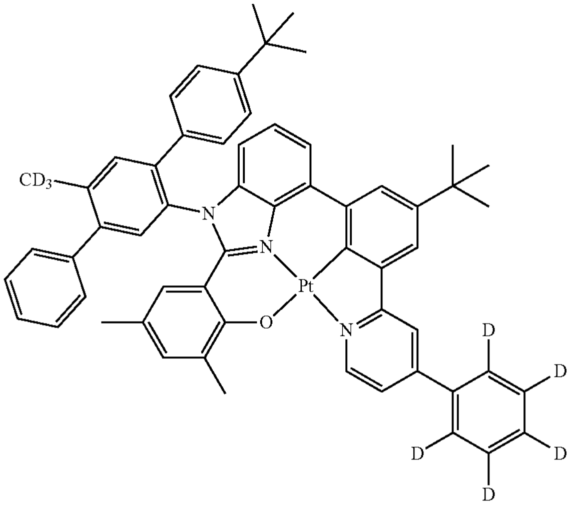
3186
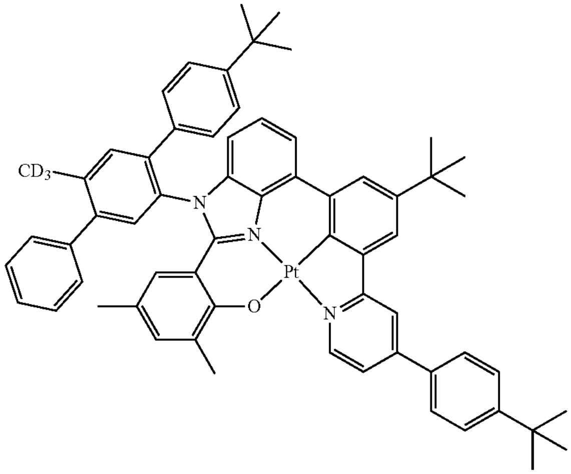
3187
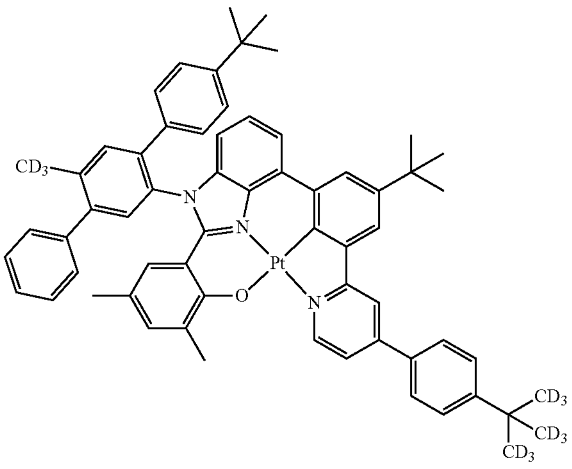
3188
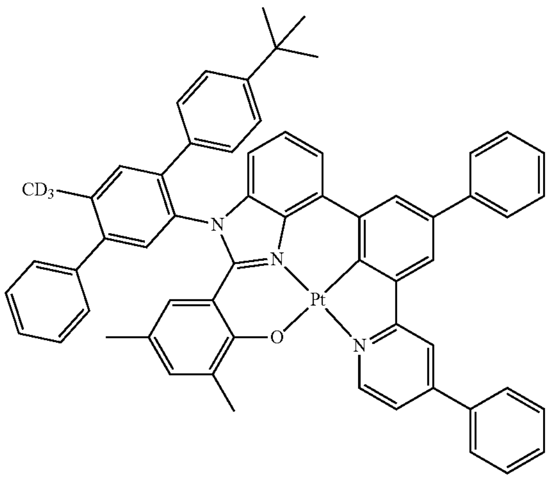

-continued
3189
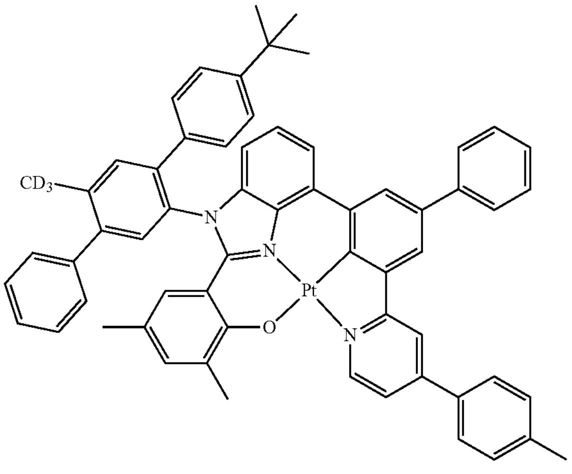
3190
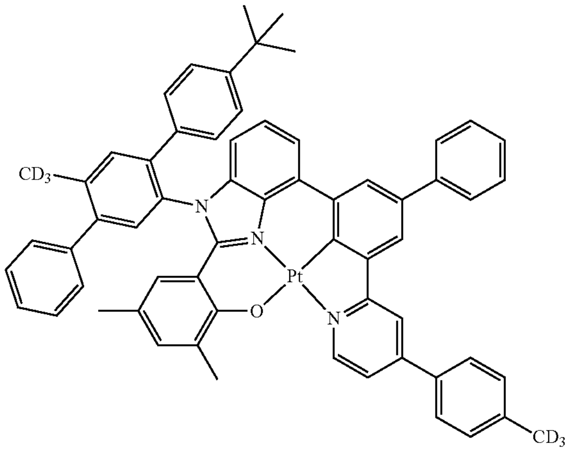
3191
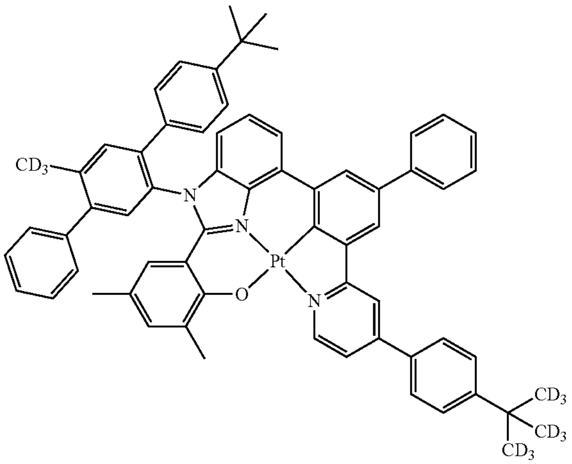
3192
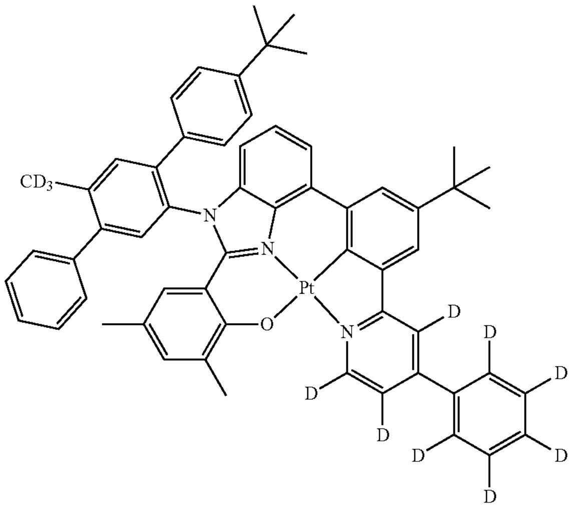
3193
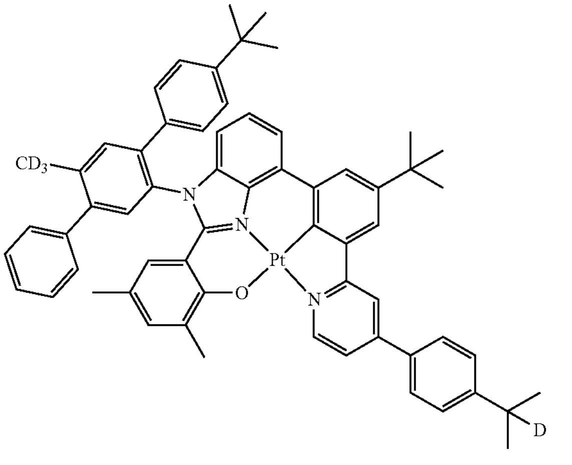
3194
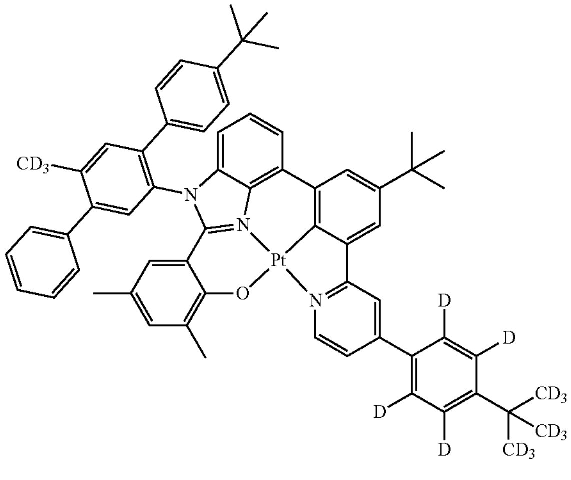

-continued
3195
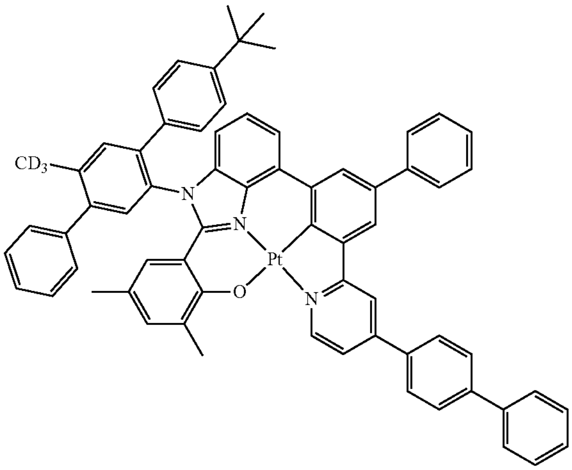
3196
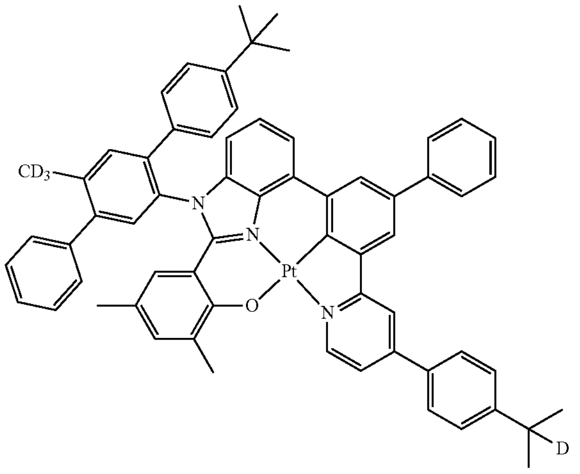
3197
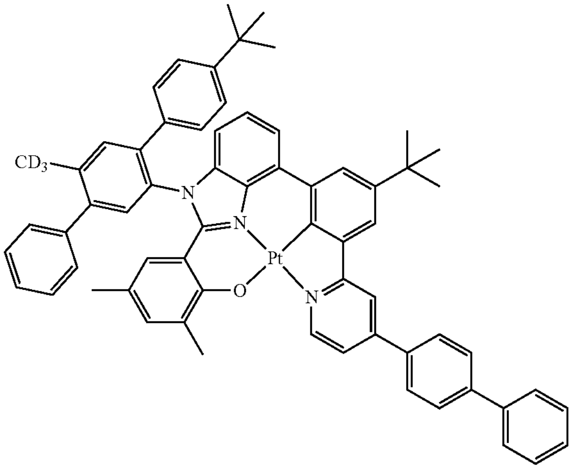
3198
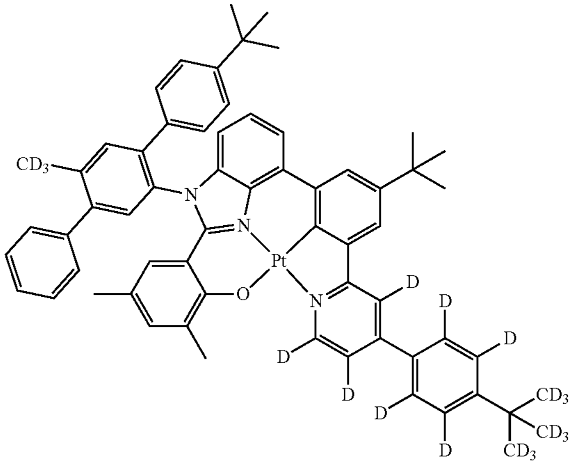
3199
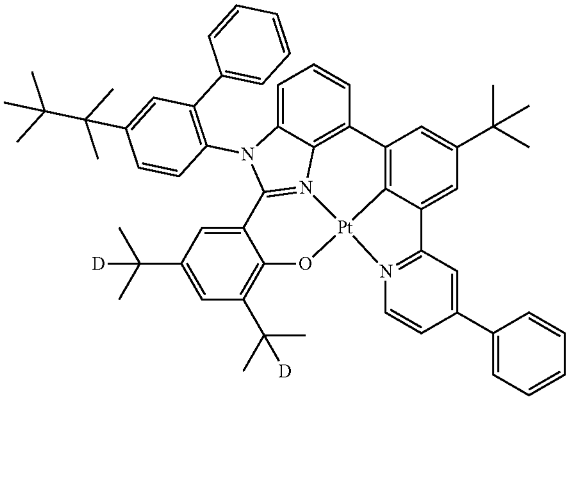
3200
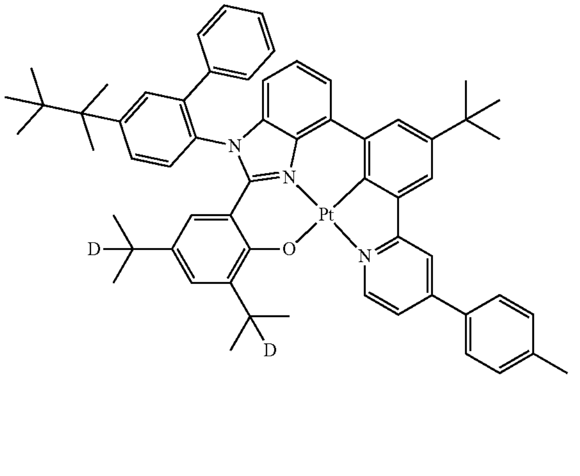

-continued
3201
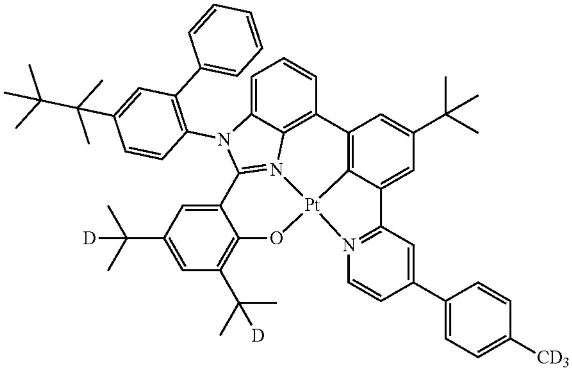
3202
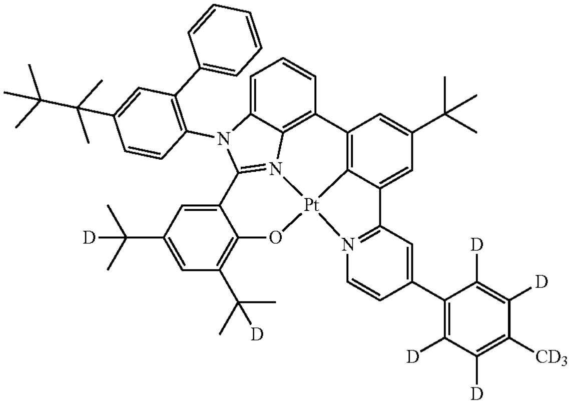
3203
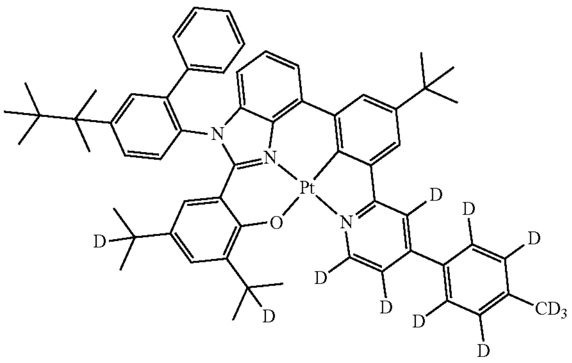
3204
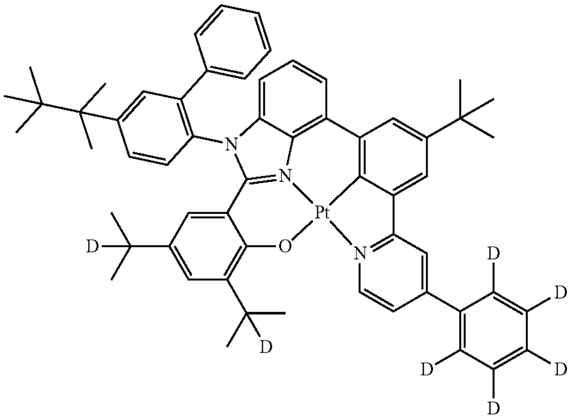
3205
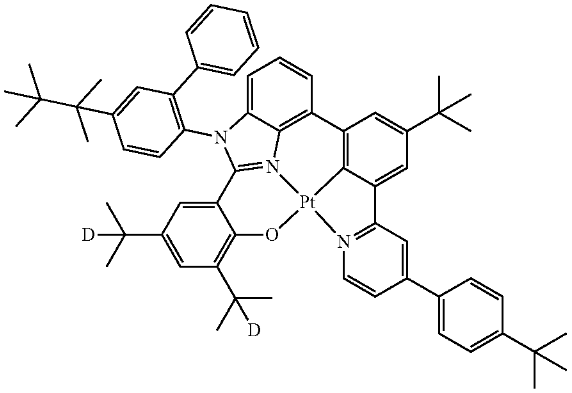
3206
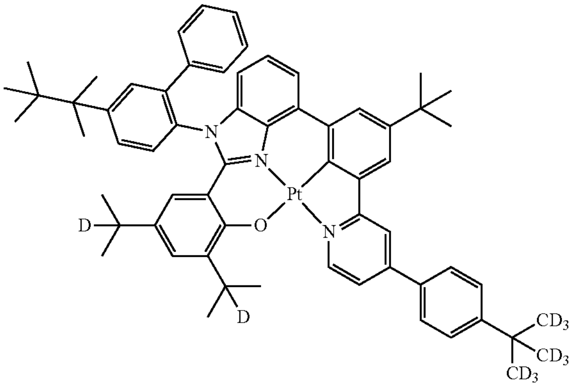

-continued
3207
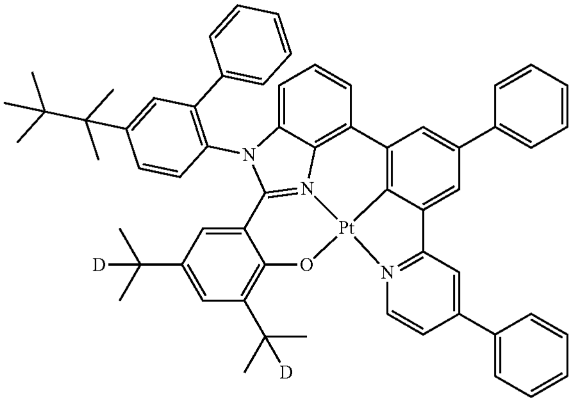
3208
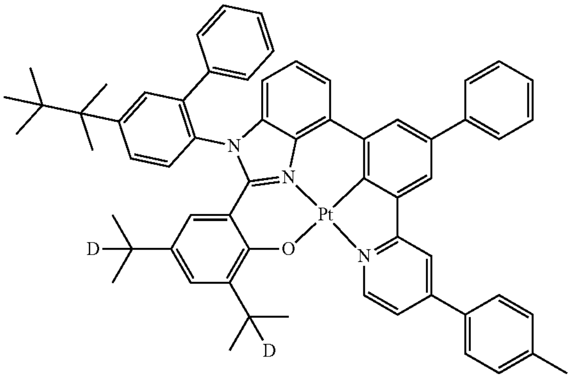
3209
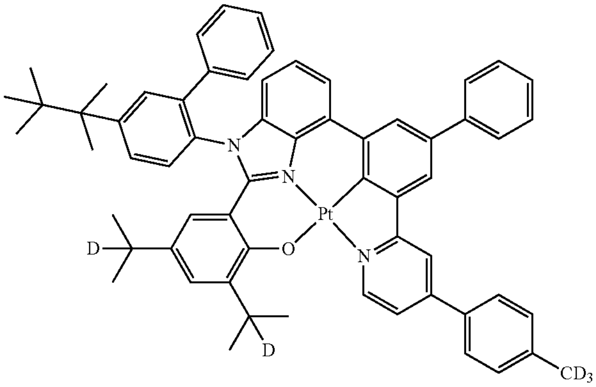
3210
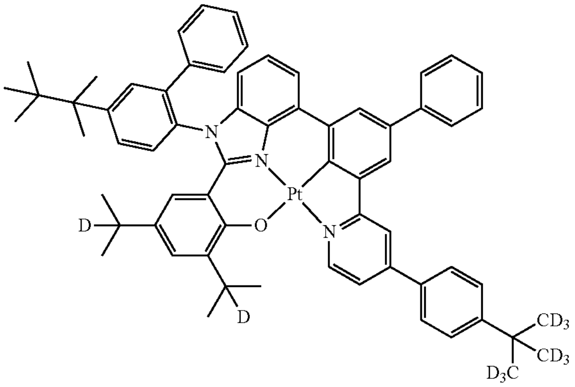
3211
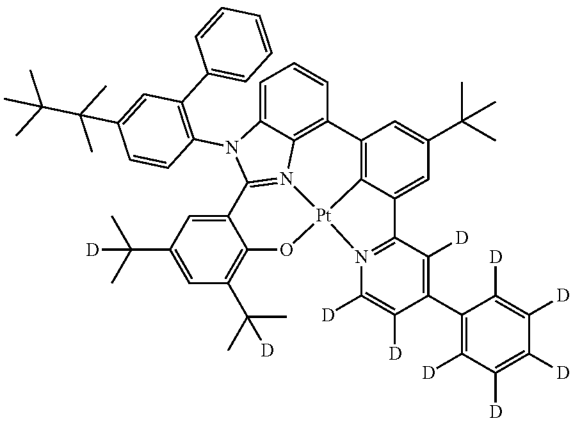
3212
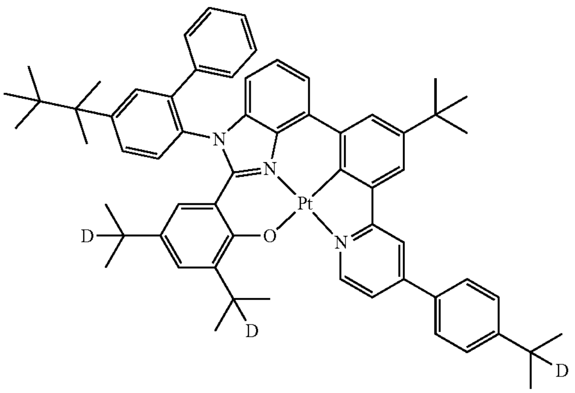

-continued
3213
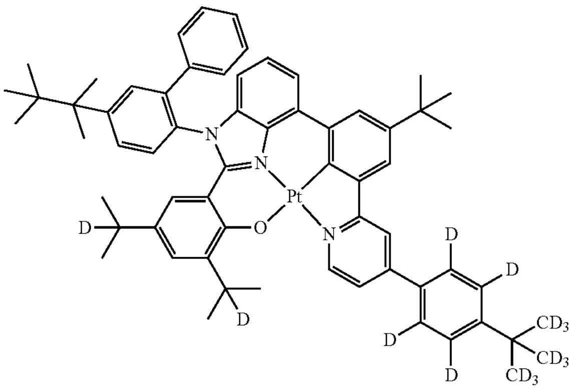
3214
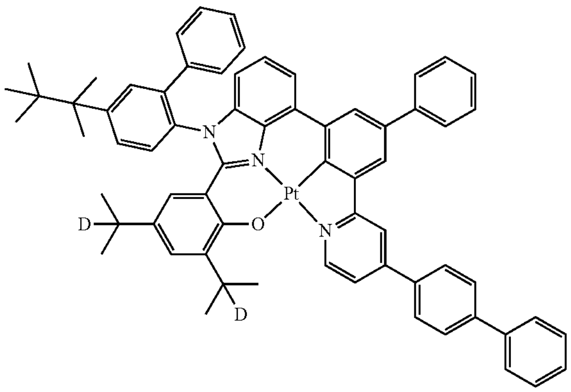
3215
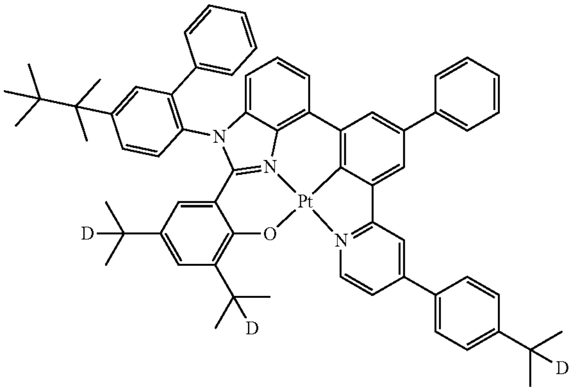
3216
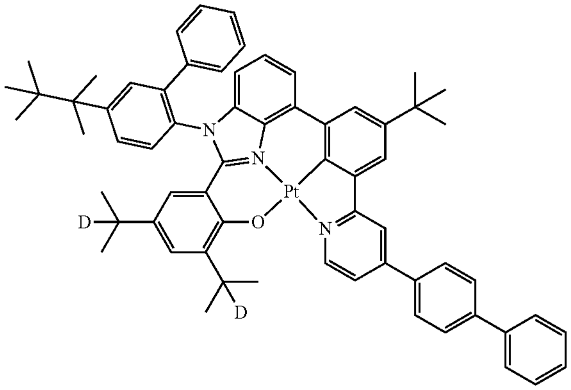
3217
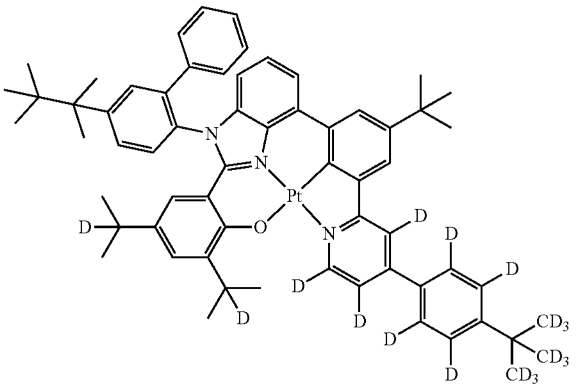
3218
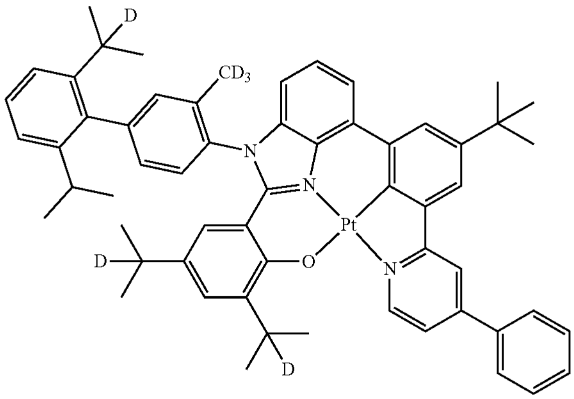
3219
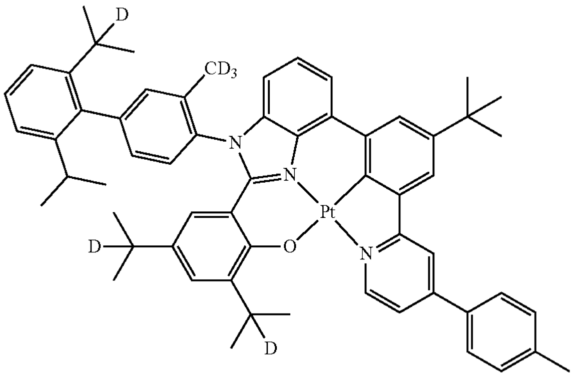
3220
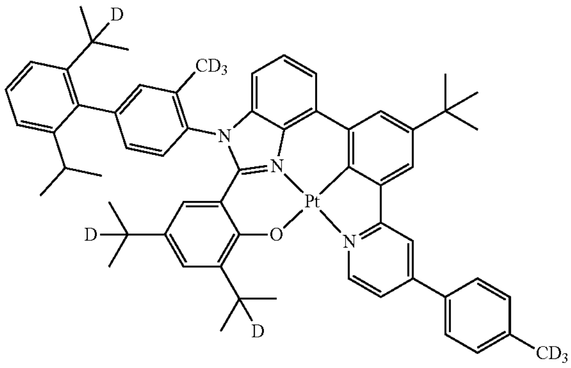

-continued
3221
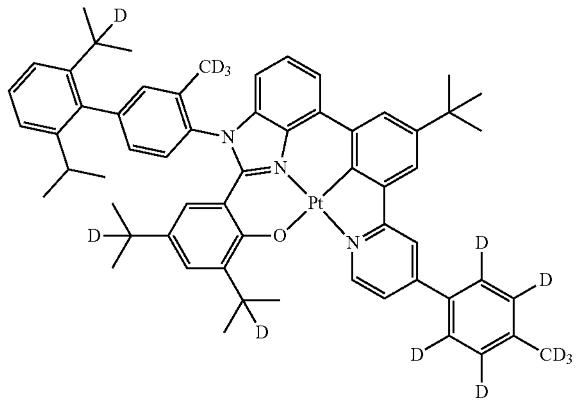
3222
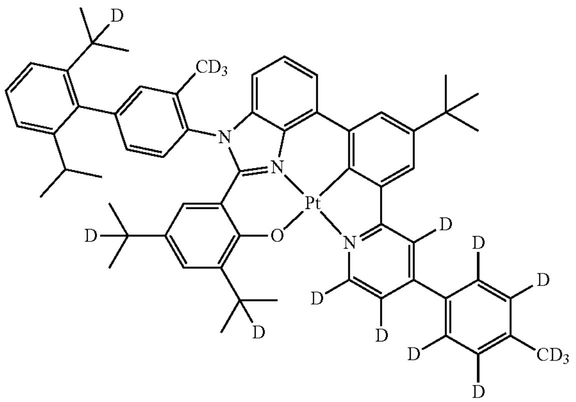
3223
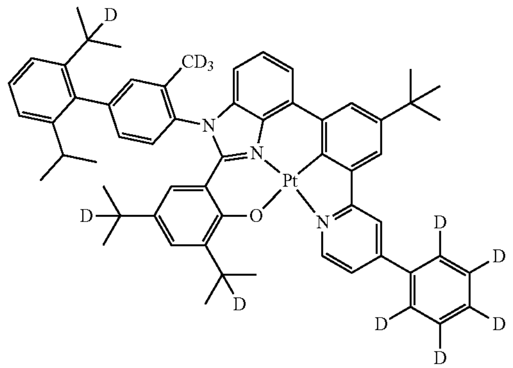
3224
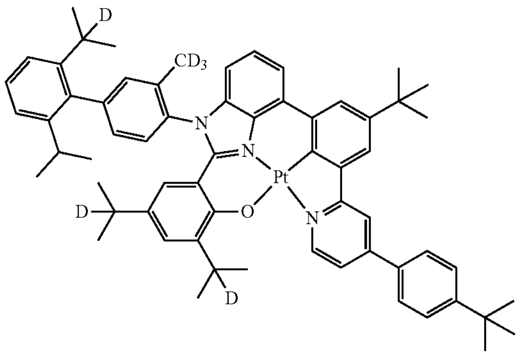
3225
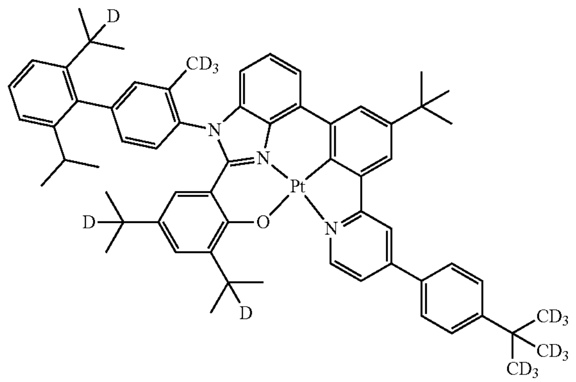
3226
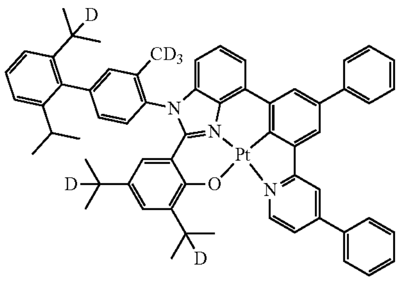
3327
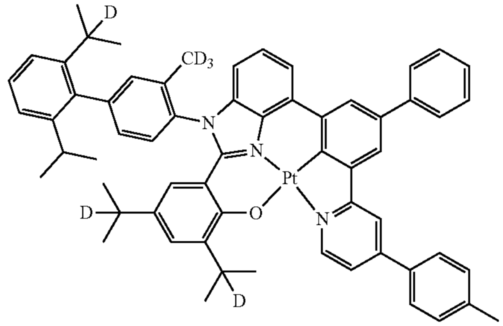
3328
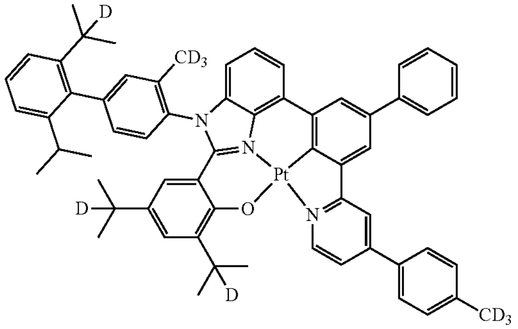

-continued
3229
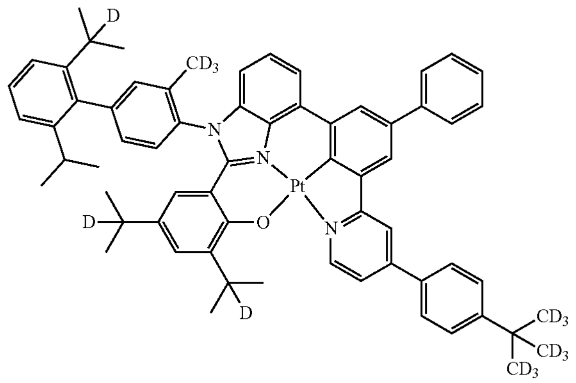
3230
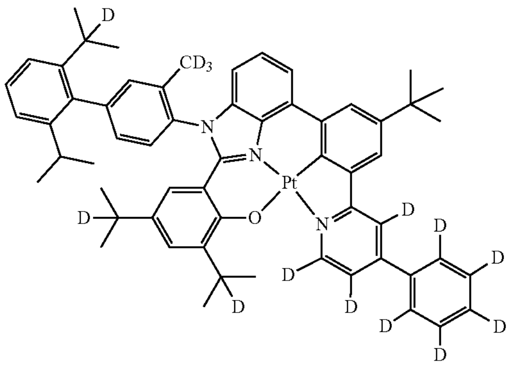
3231
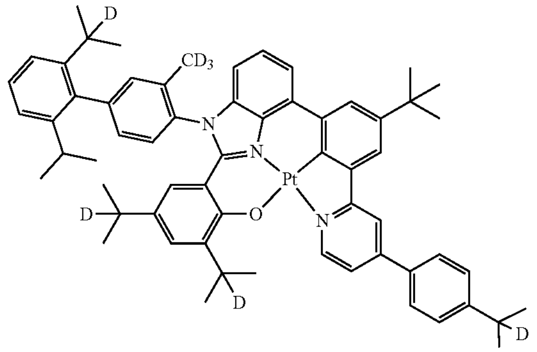
3232
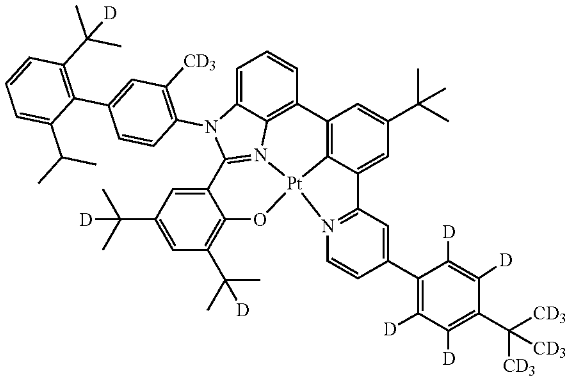
3233
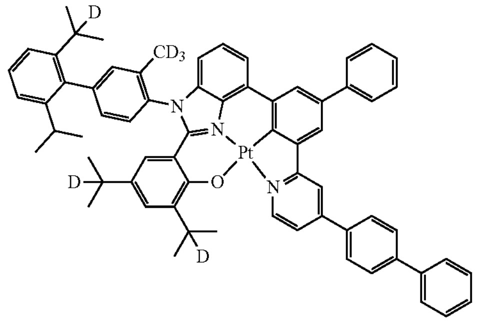
3234
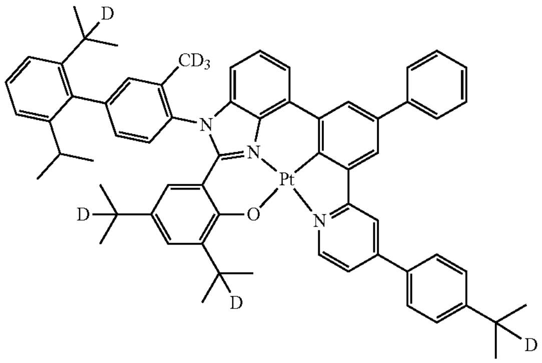
3235
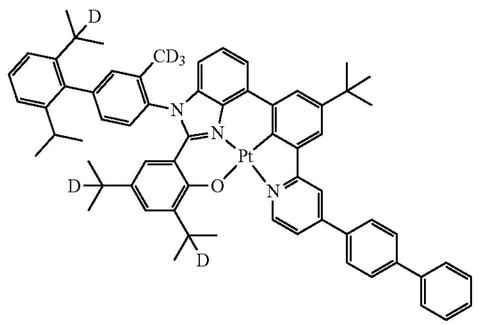
3236
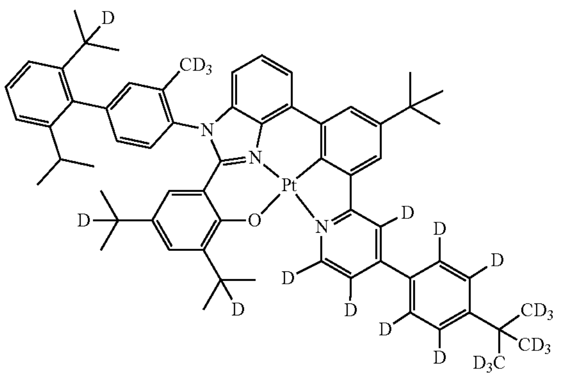

-continued
3237
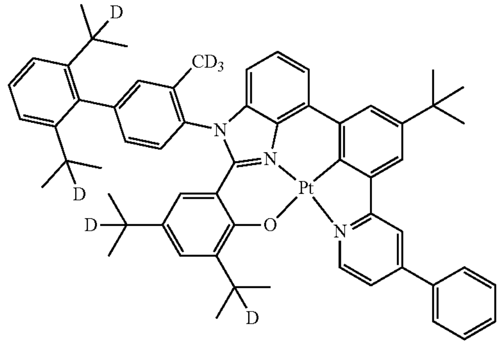
3238
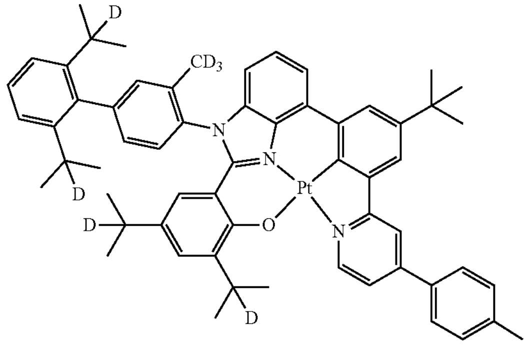
3239
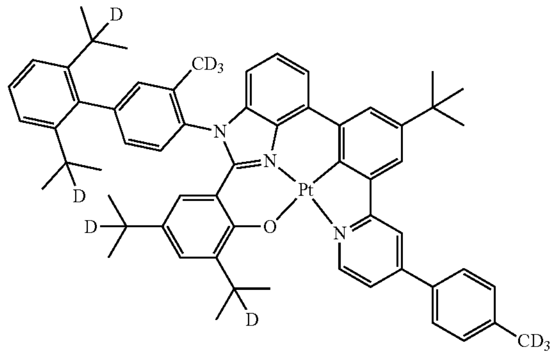
3240
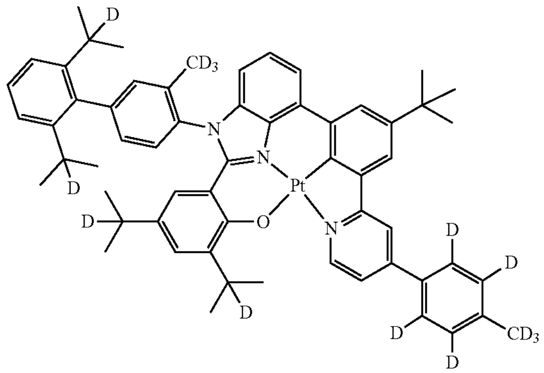
3241
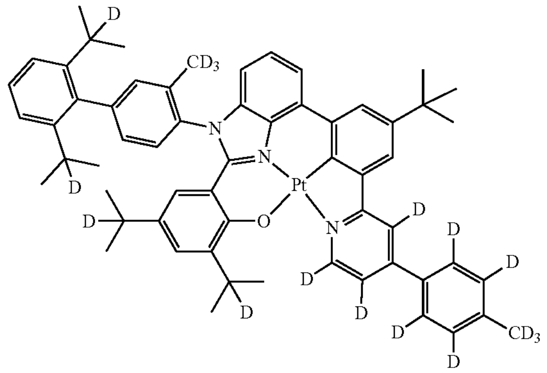
3242
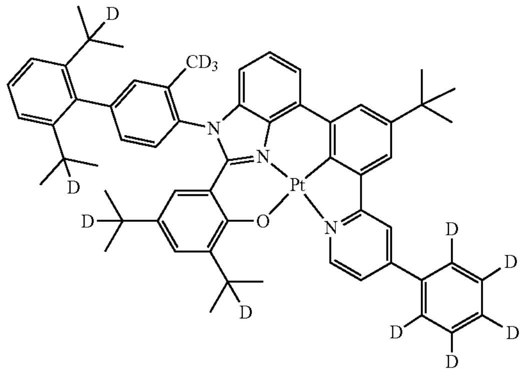
3243
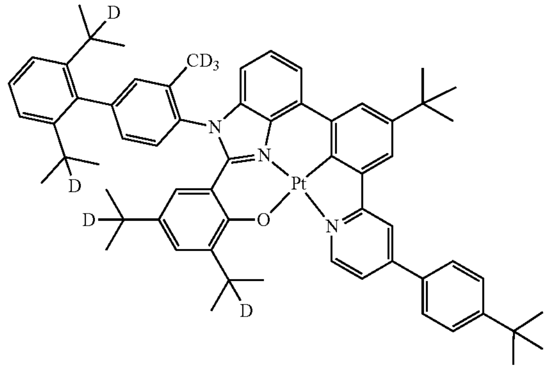
244
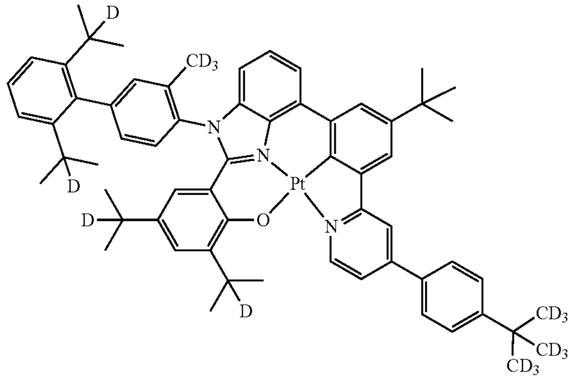

-continued
3245
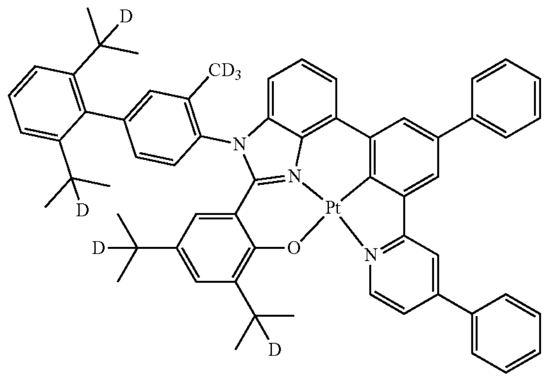
3246
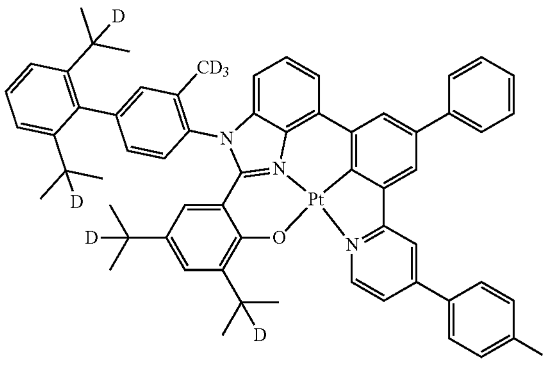
3247
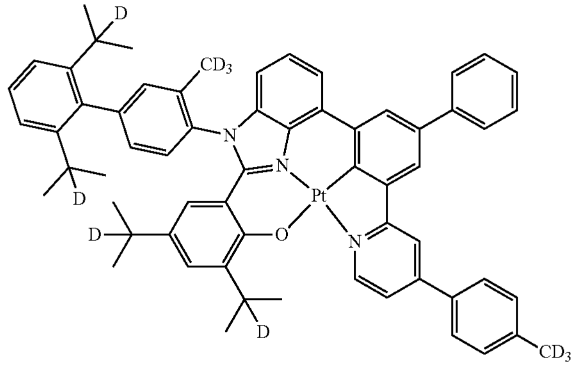
3248
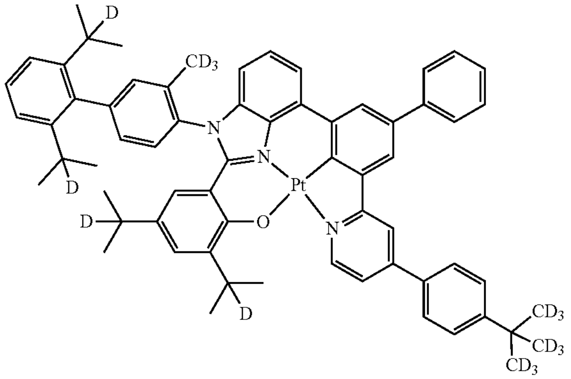
3249
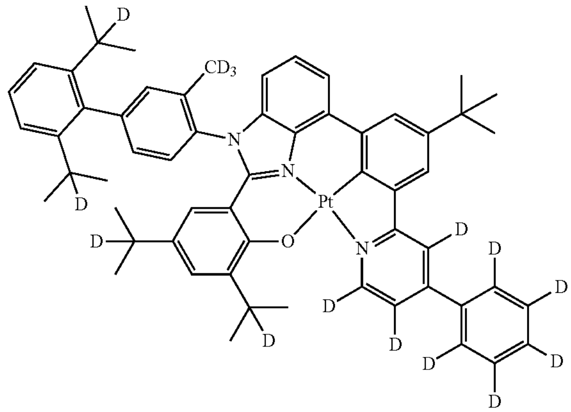
3250
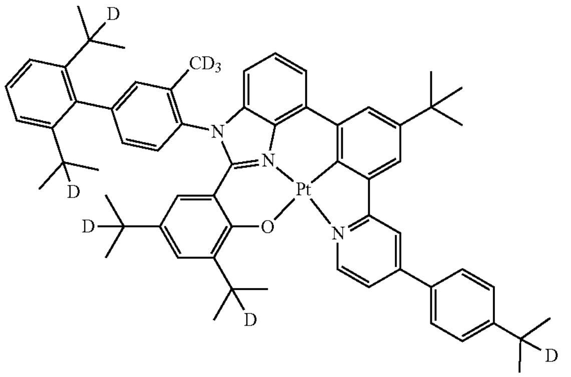
3251
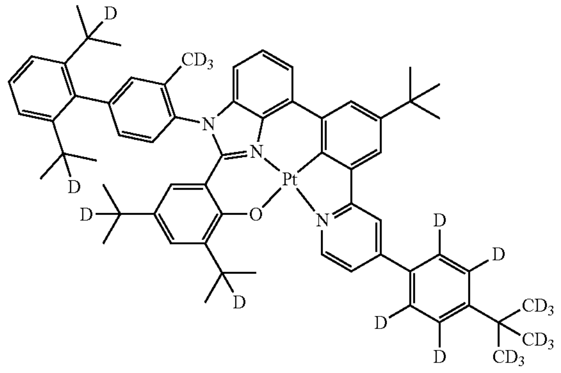
3252
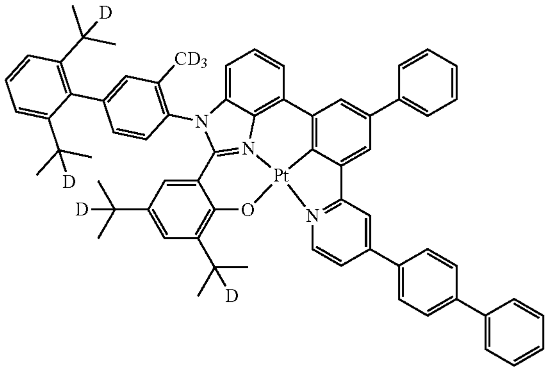

-continued
3253
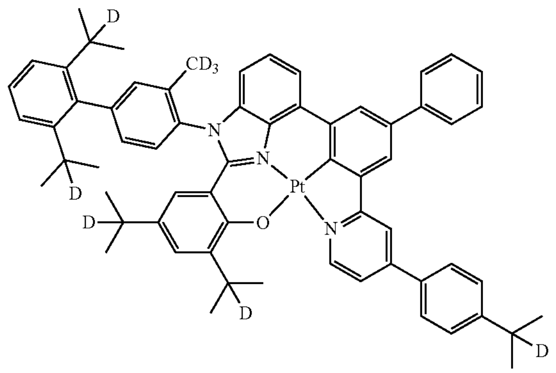
3254
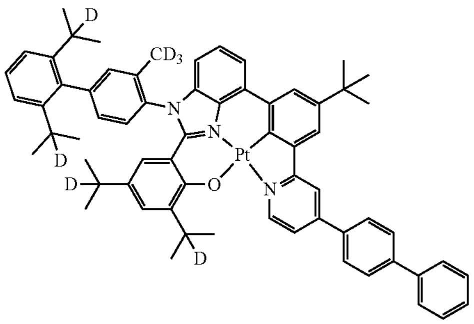
3255
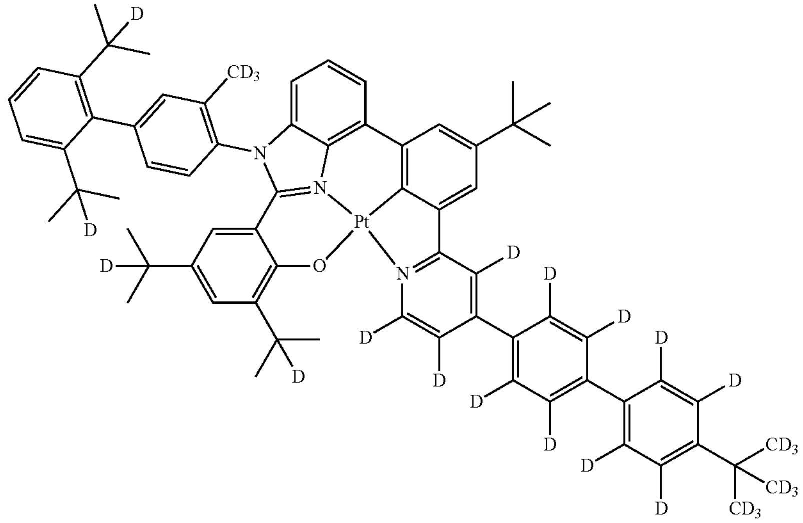
3256
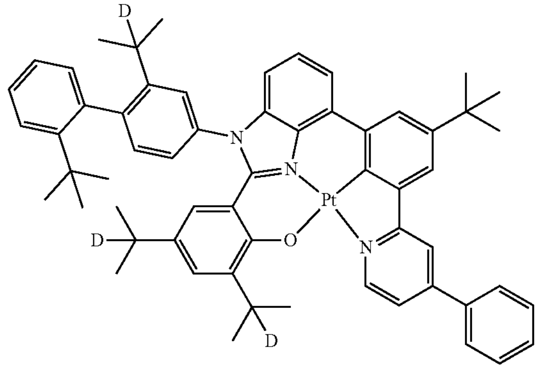
3257
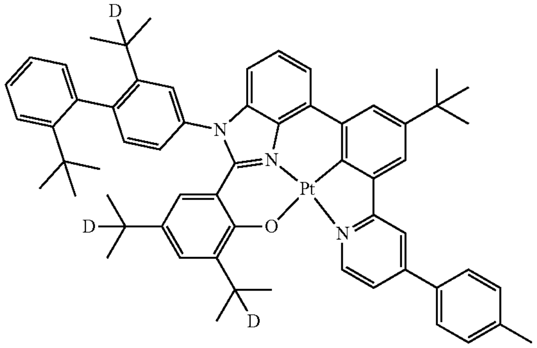

-continued
3258
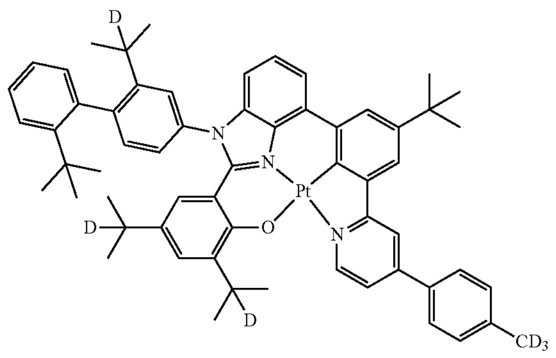
3259
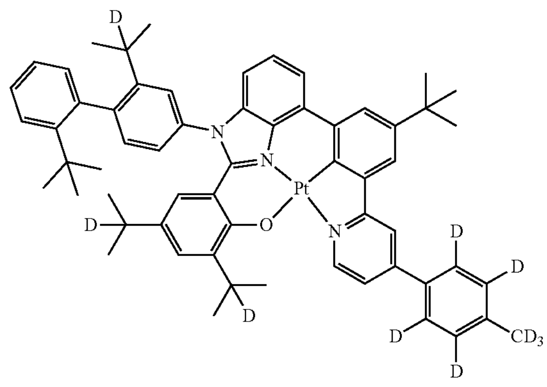
3260
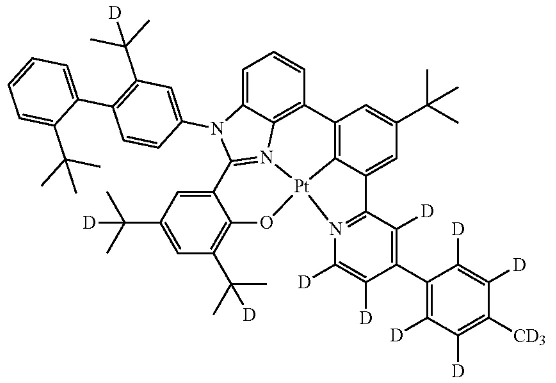
3261
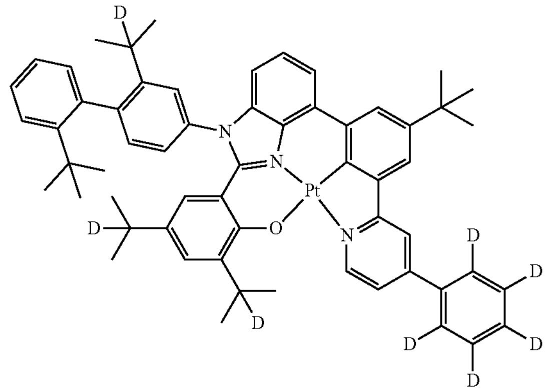
3262
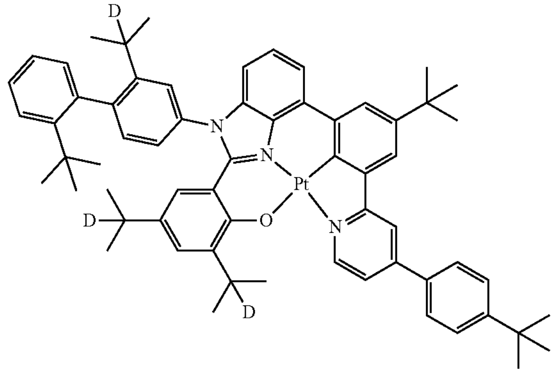
3263
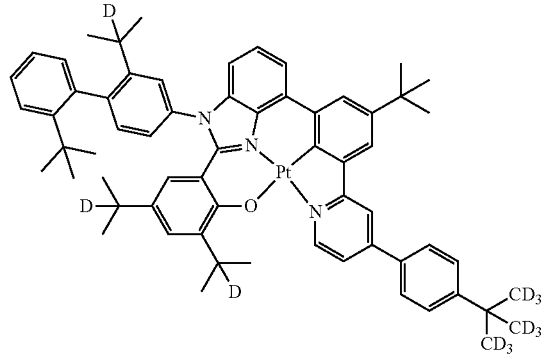
3264
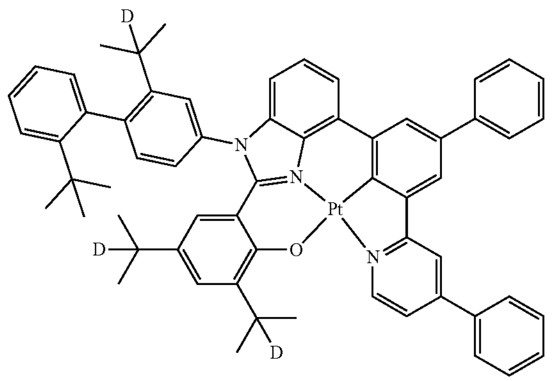
3265
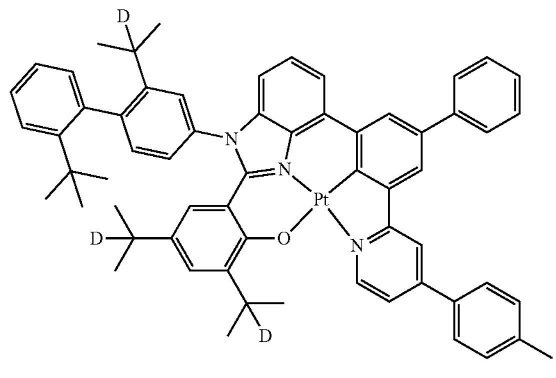

-continued
3266
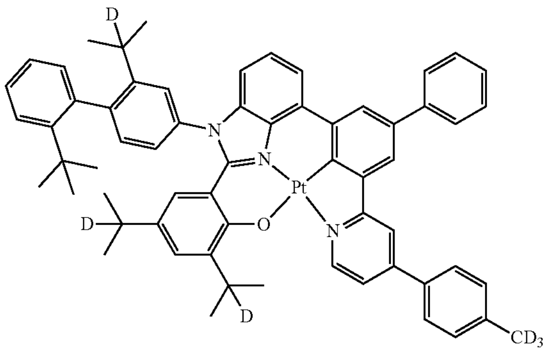
3267
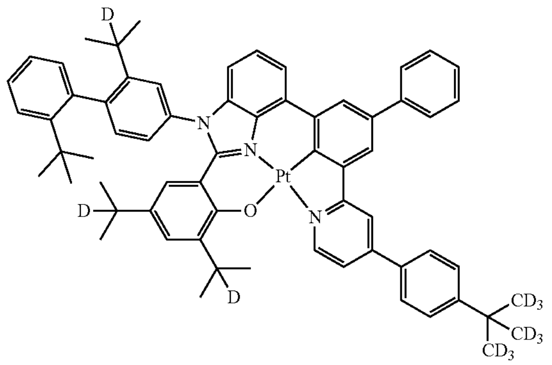
3268
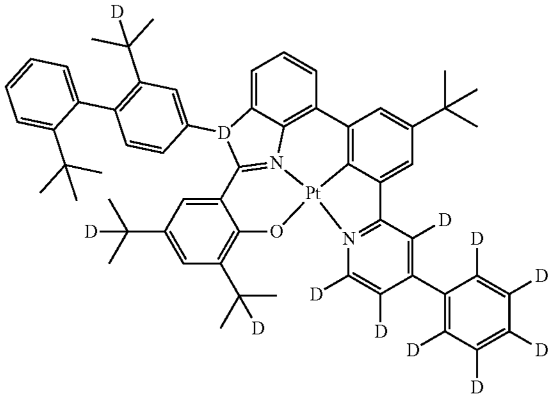
3269
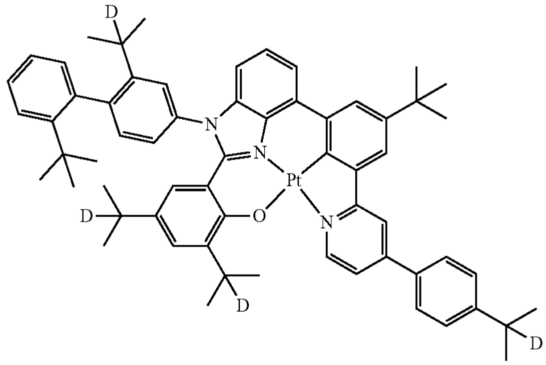
3270
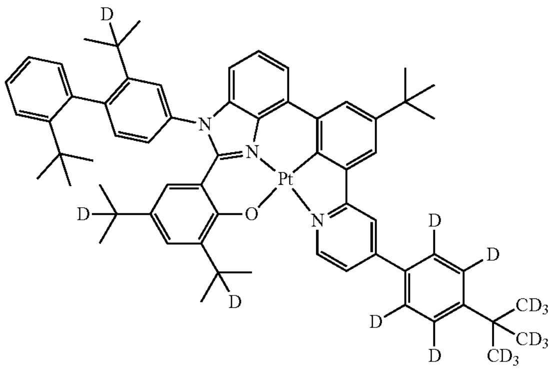
3271
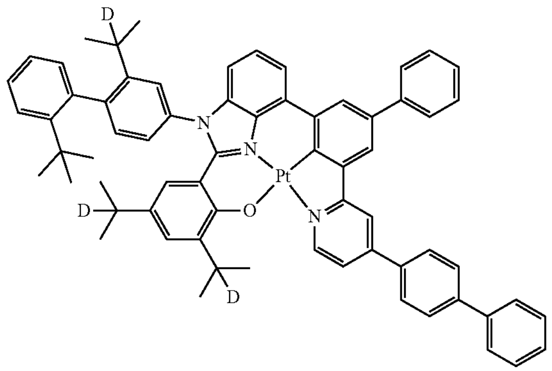
3272
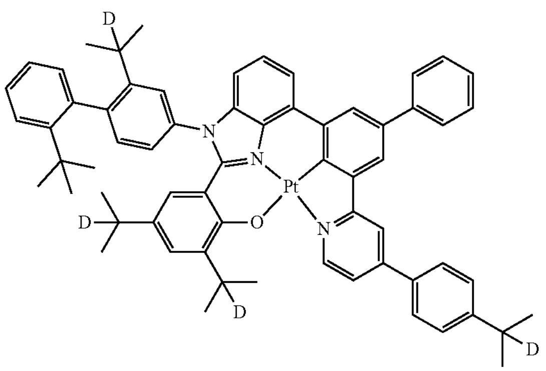
3273
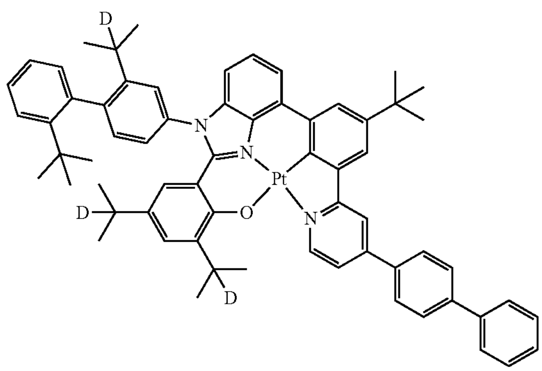

-continued
3274
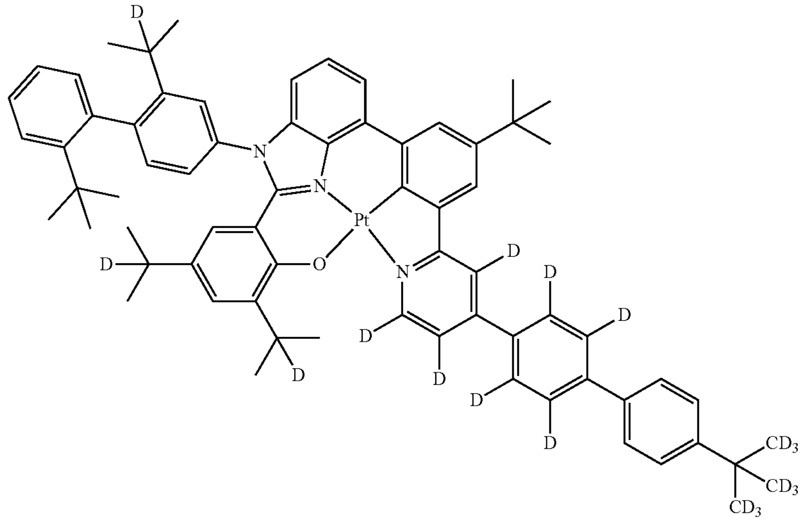
3275
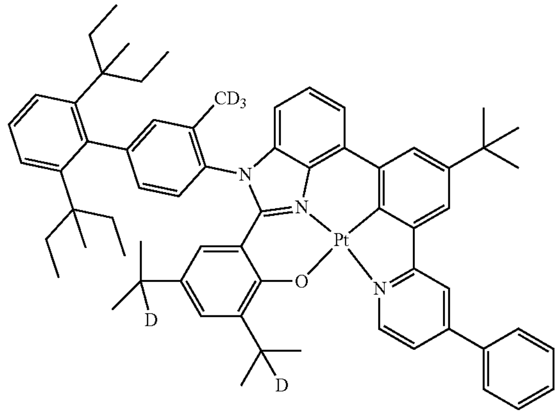
3276
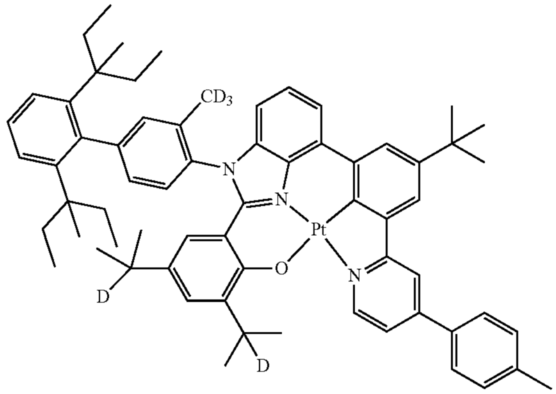
3277
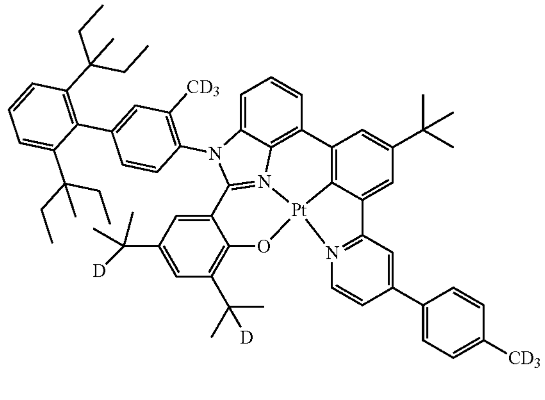
3278
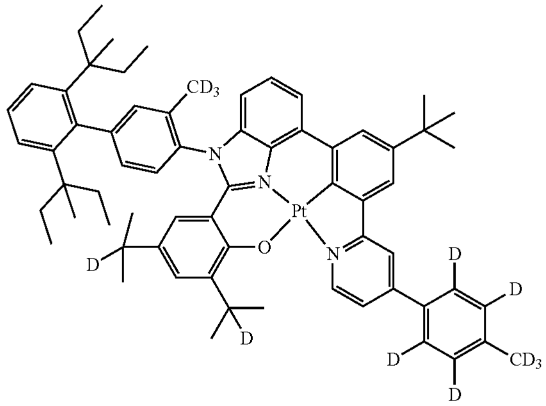

-continued
3279
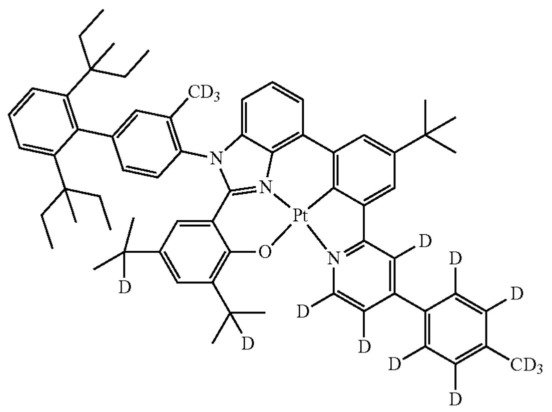
3280
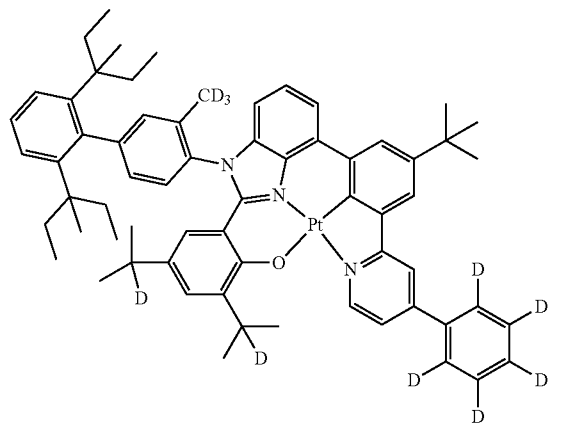
3281
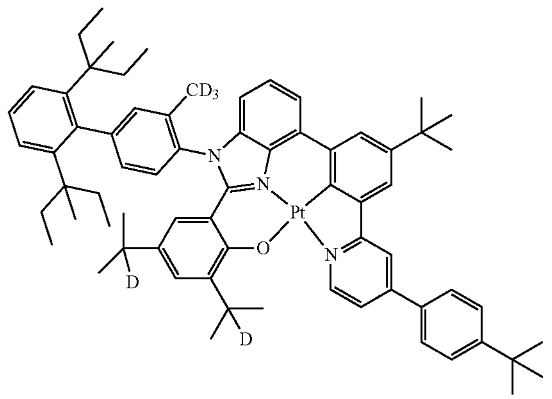
3282
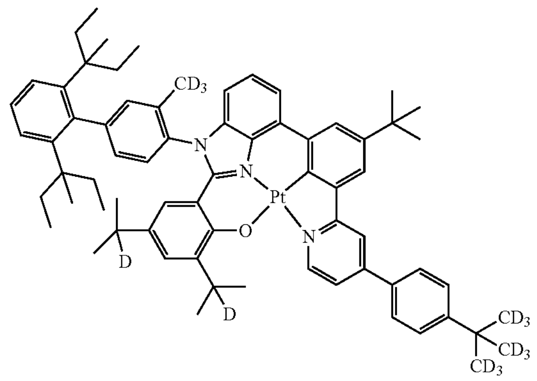
3283
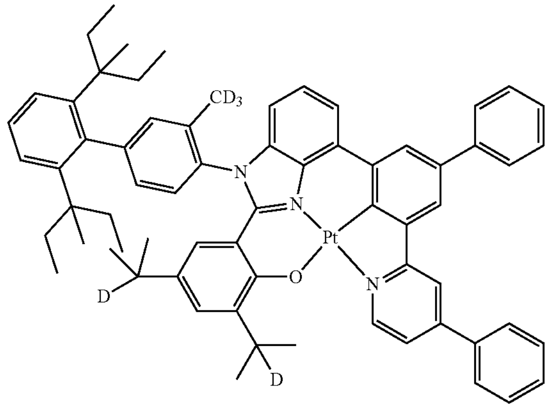
3284
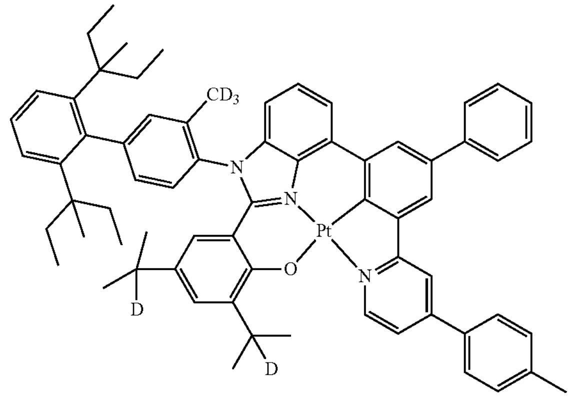

-continued
3285
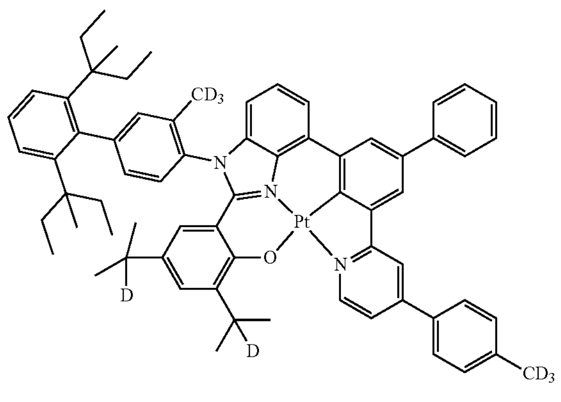
3286
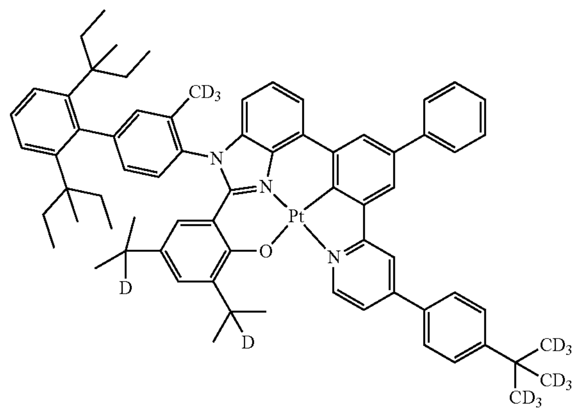
3287
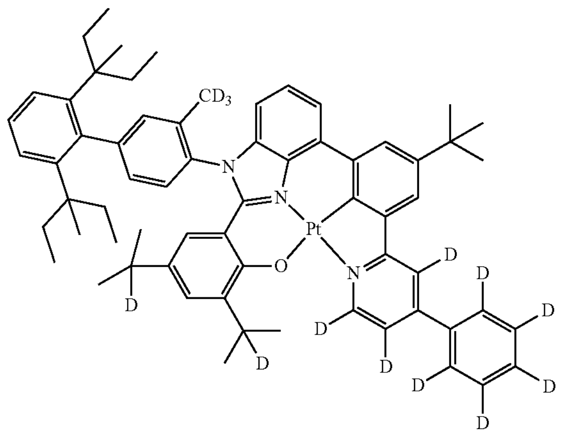
3288
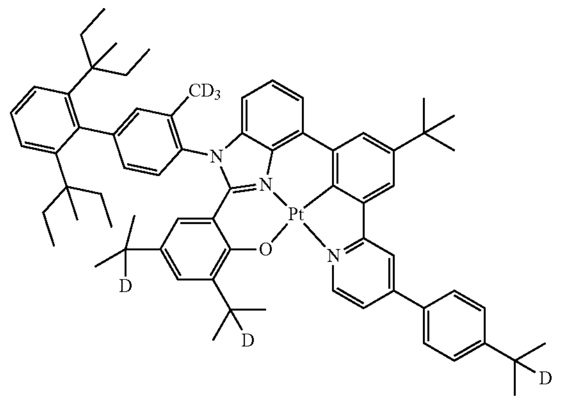
3289
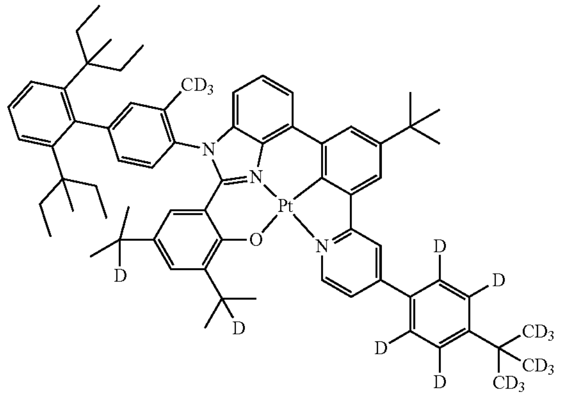
3290
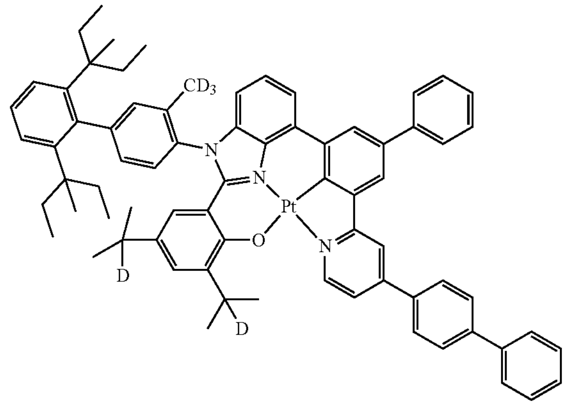

-continued
3291
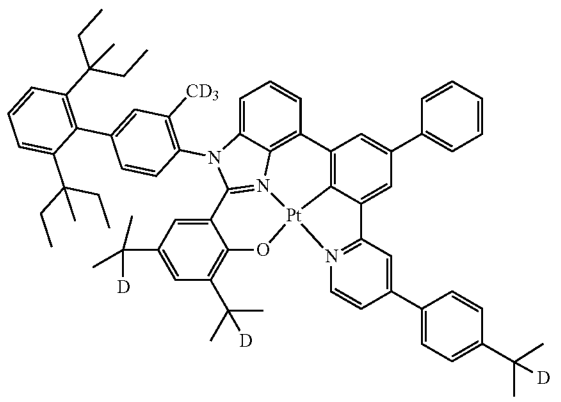
3292
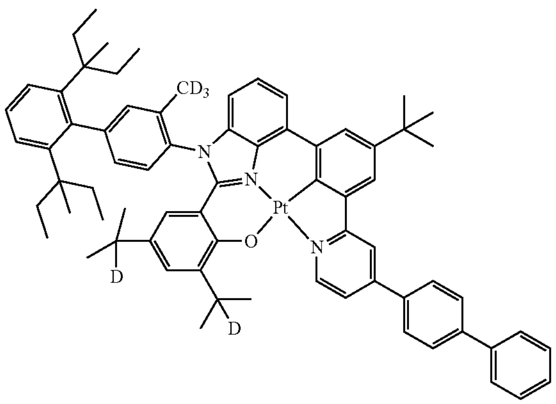
3293
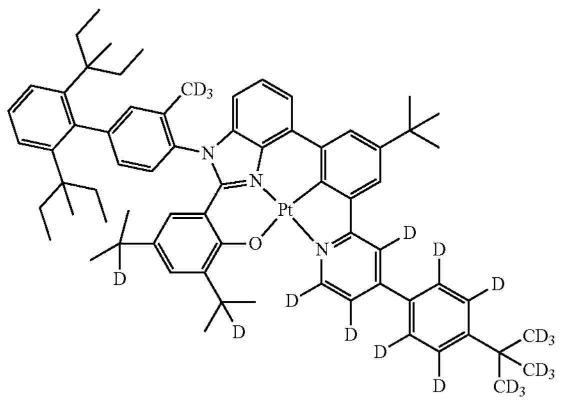
3294
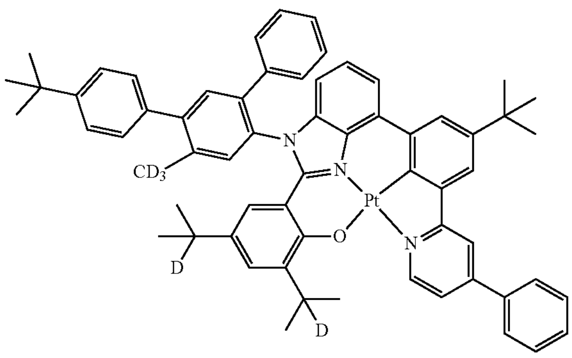
3295
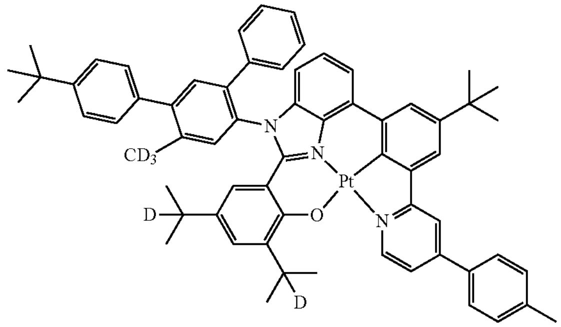
3296
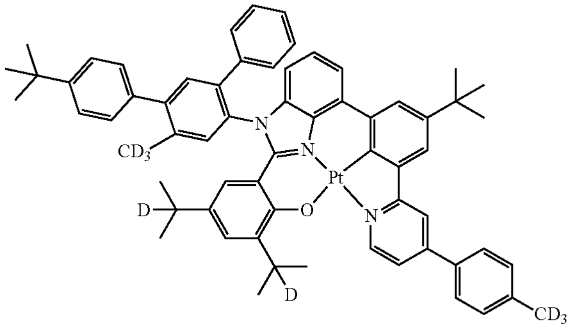
3297
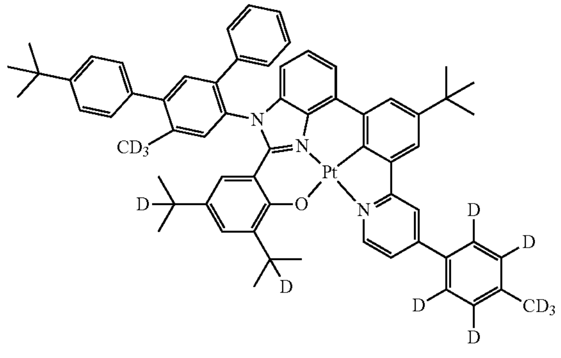
3298
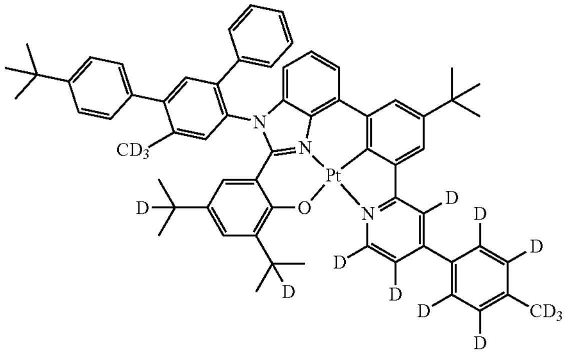

-continued
3299
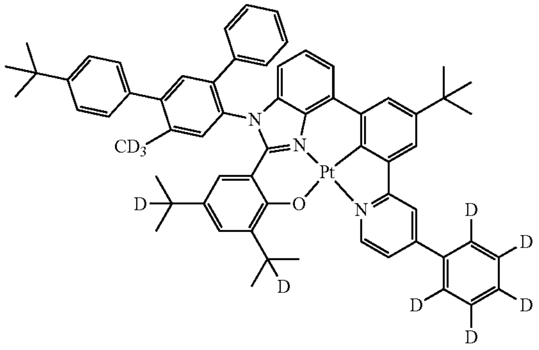
3300
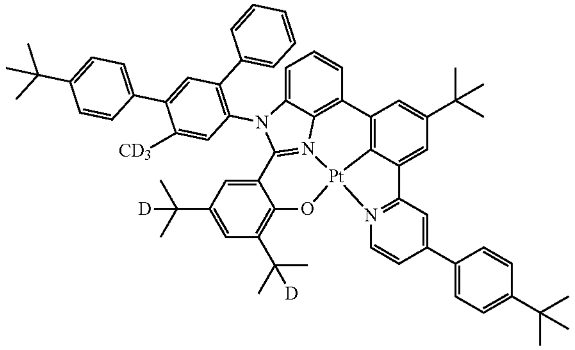
3301
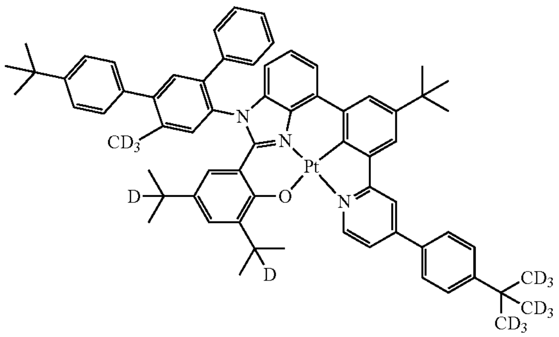
3302
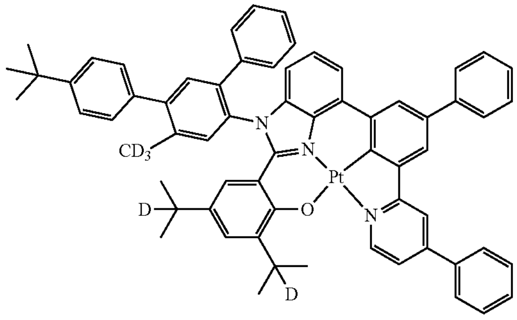
3303
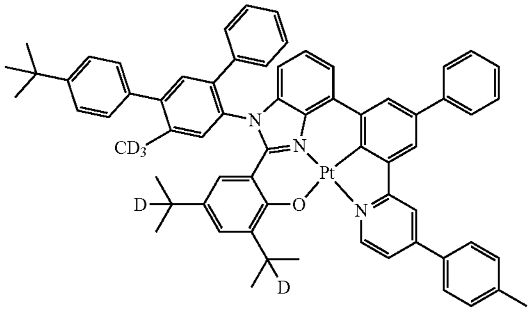
3304
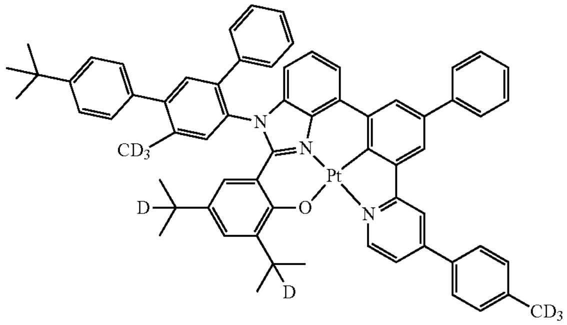
3305
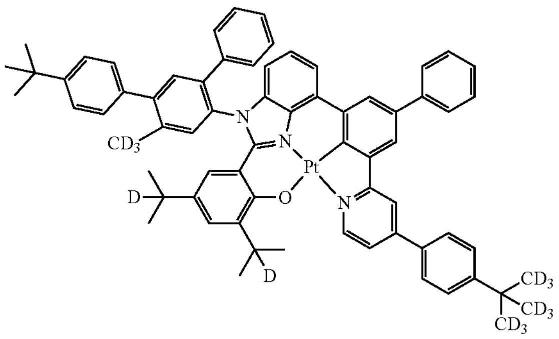
3306
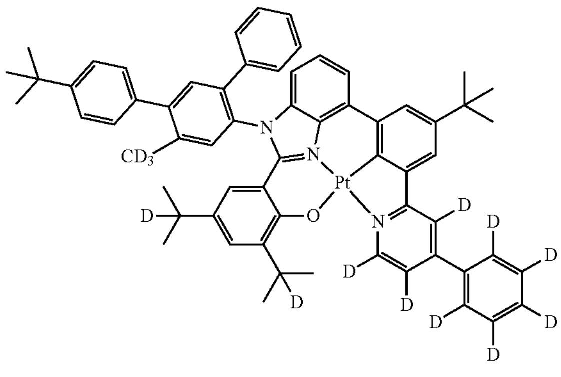

-continued
3307
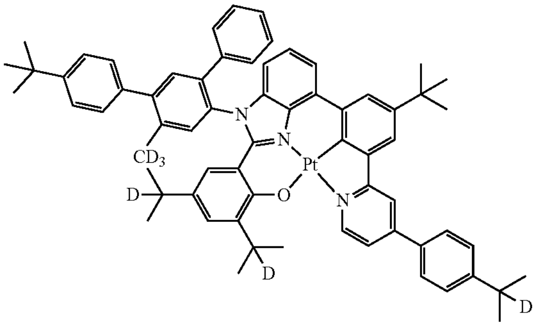
3308
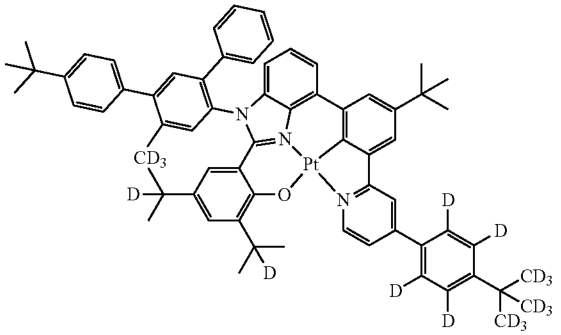
3309
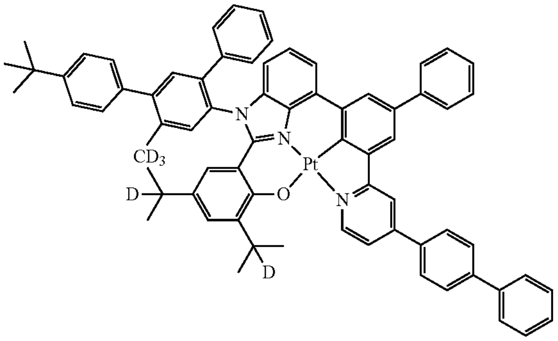
3310
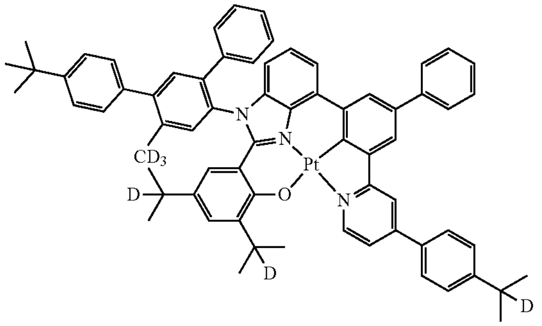
3311
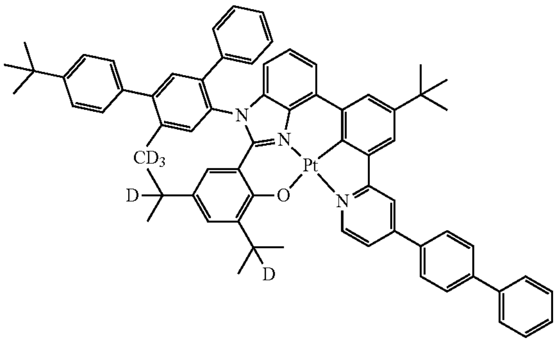
3312
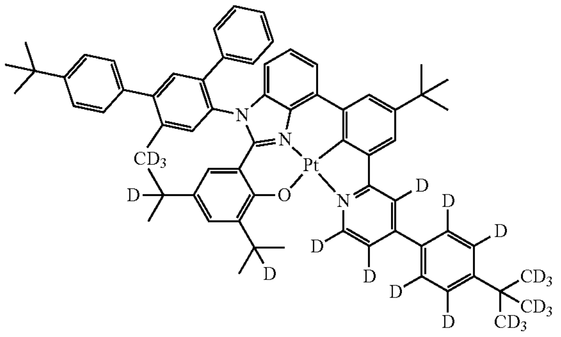
3313
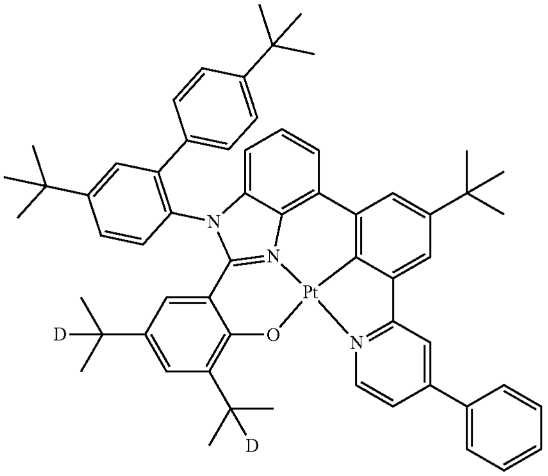
3314
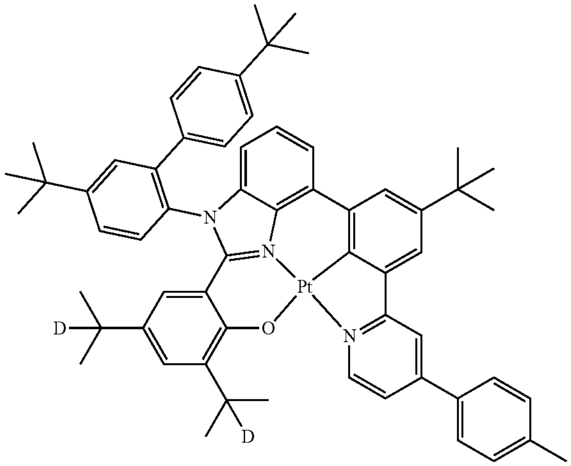

-continued
3315
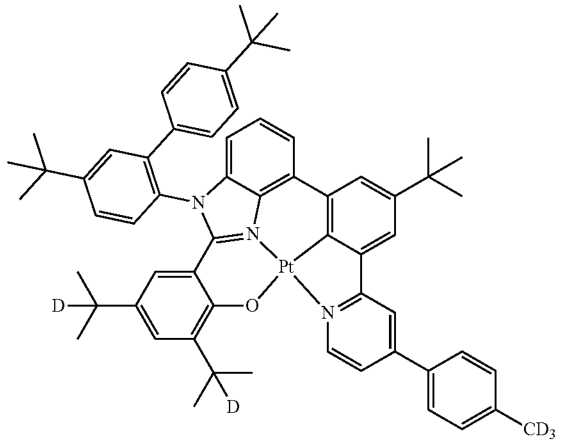
3316
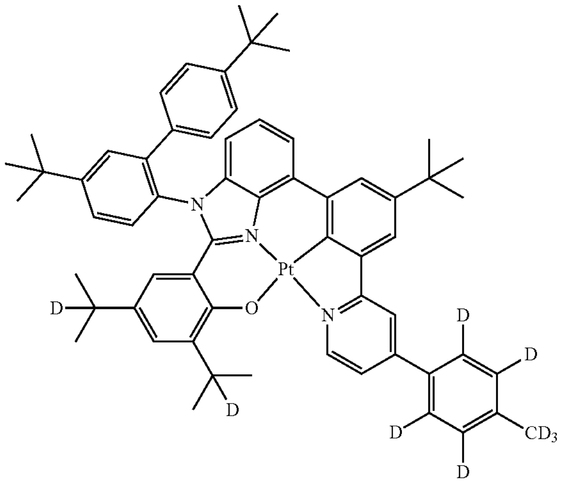
3317
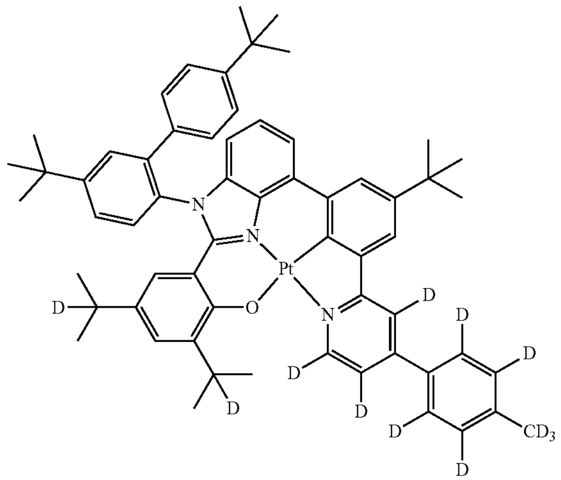
3318
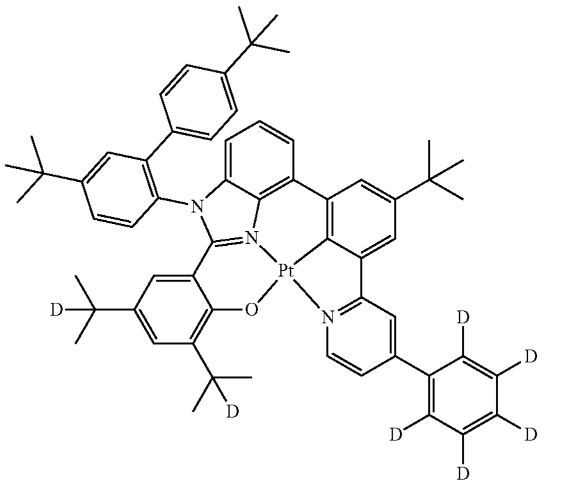
3319
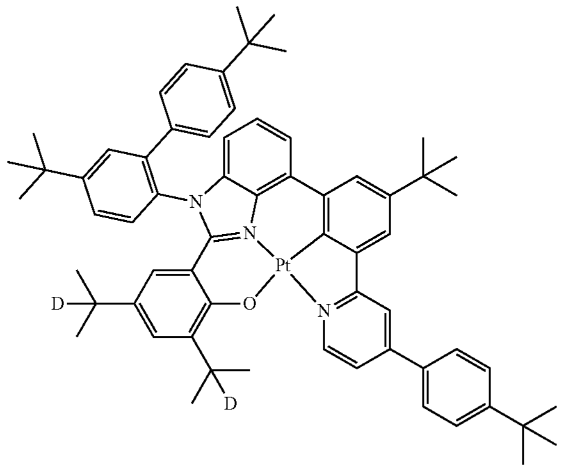
3320
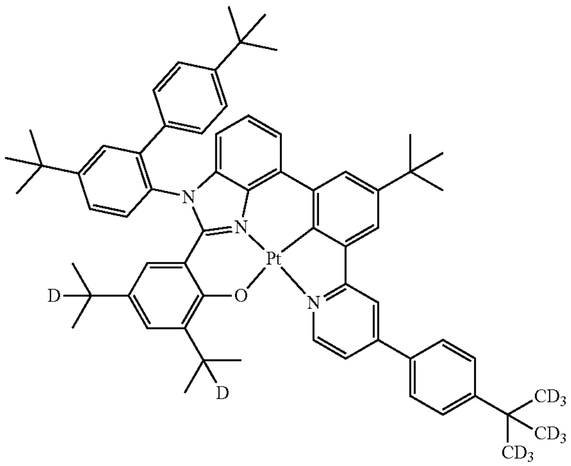

-continued
3321
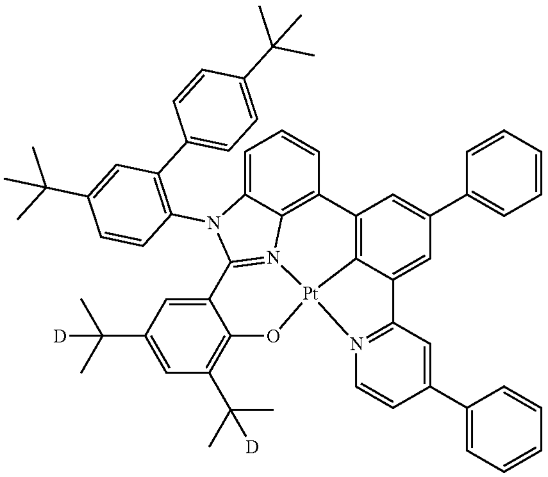
3322
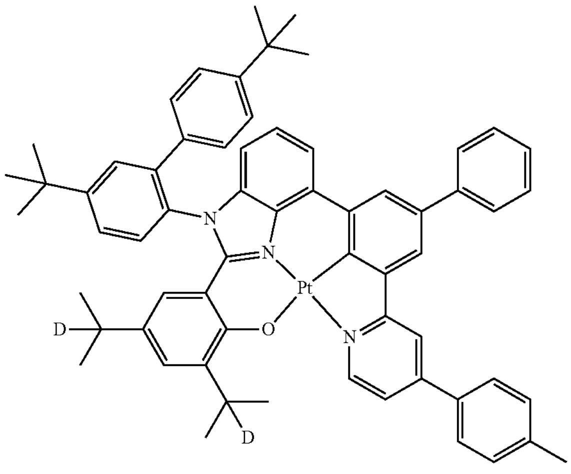
3323
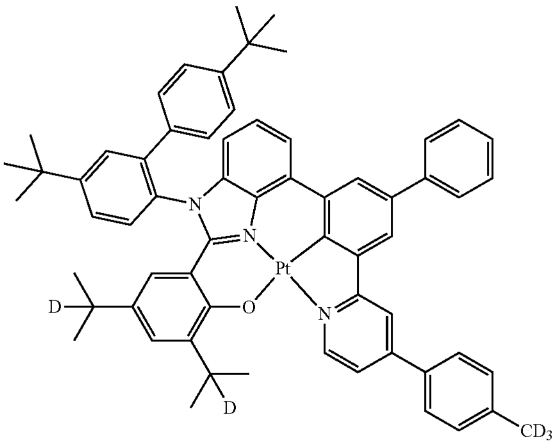
3324
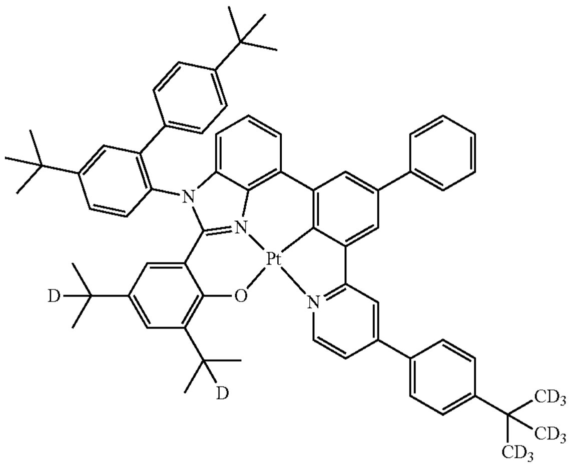
3325
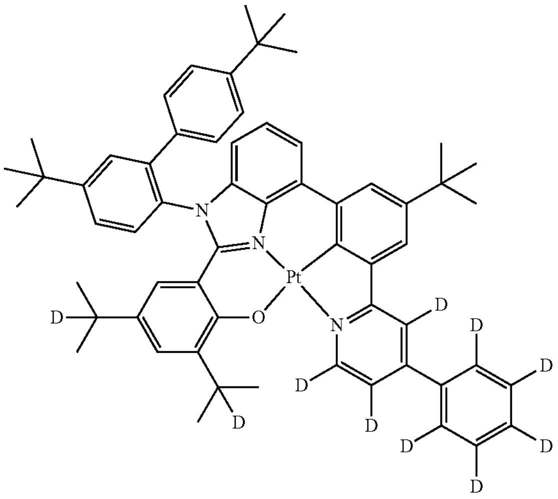
3326
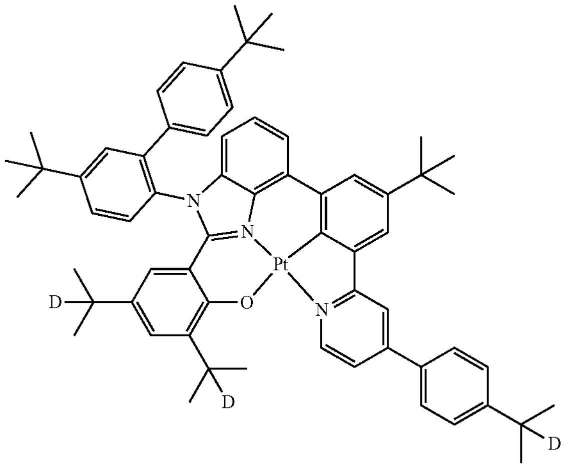

-continued
3327
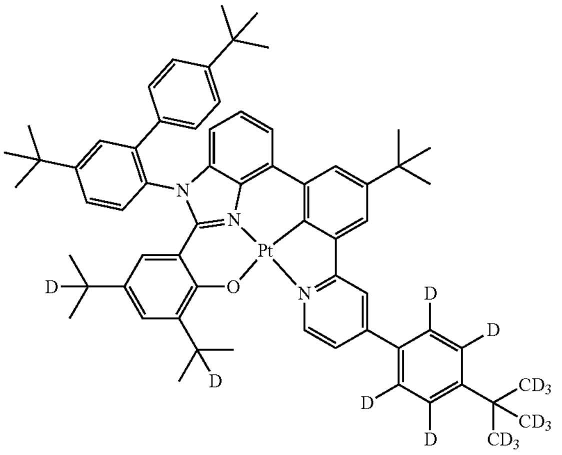
3328
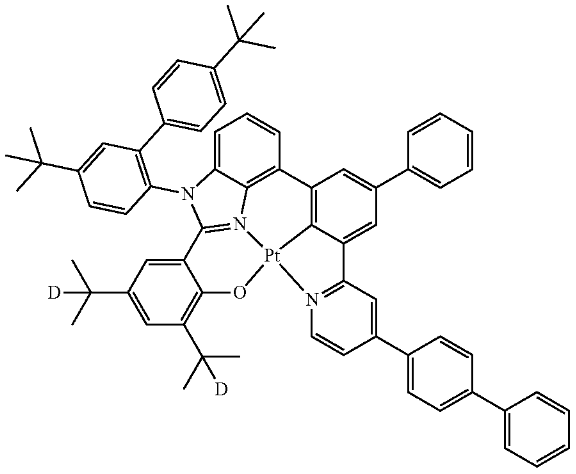
3329
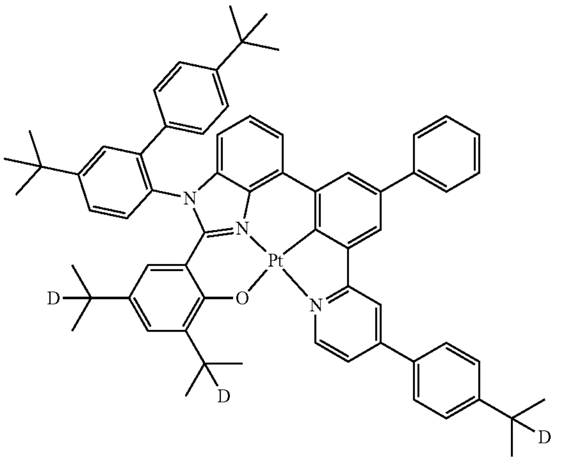
3330
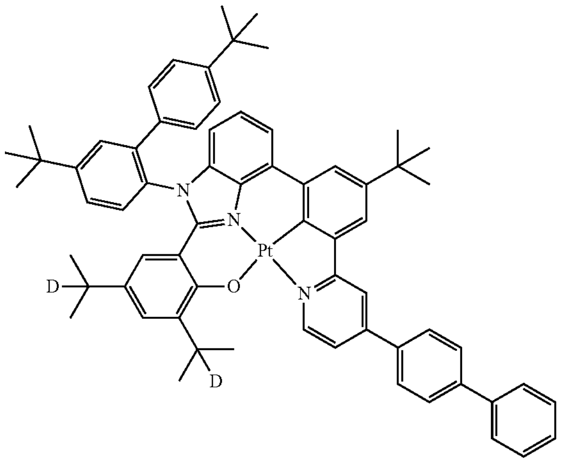
3331
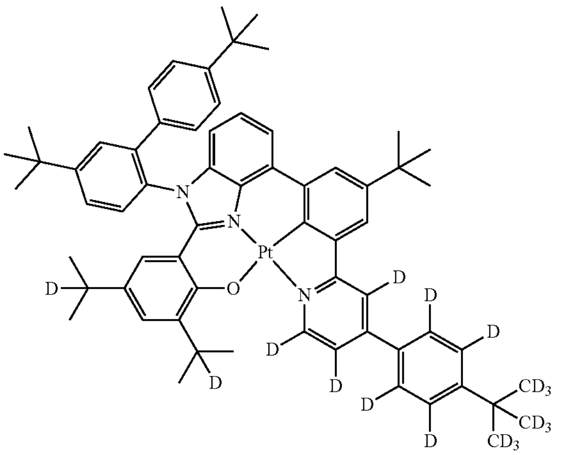
3332
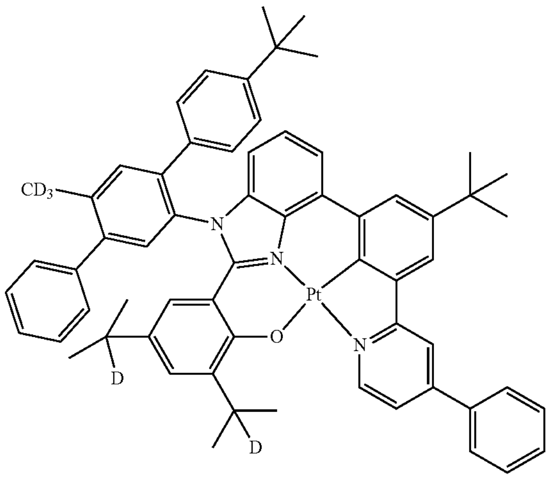

-continued
3333
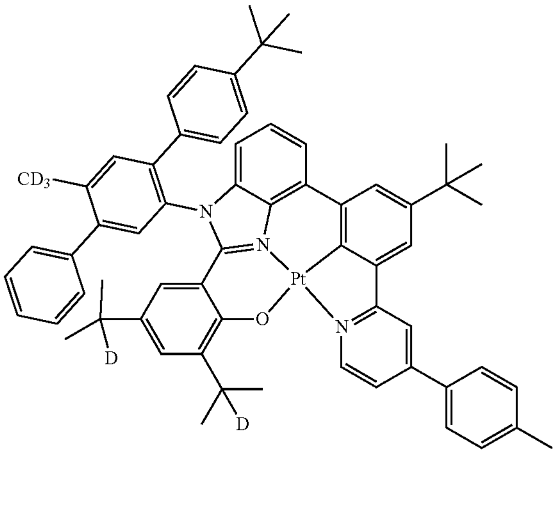
3334
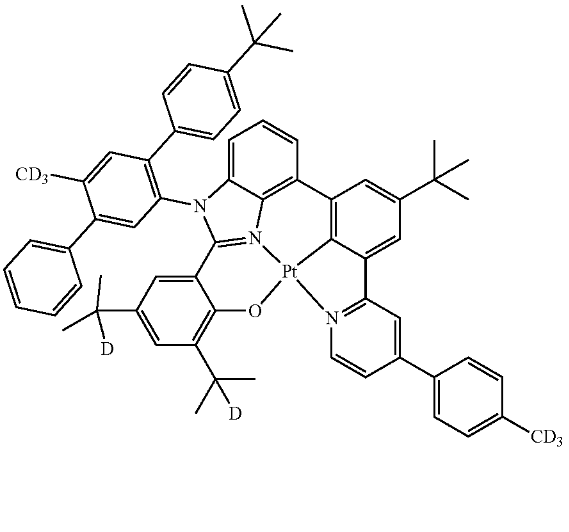
3335
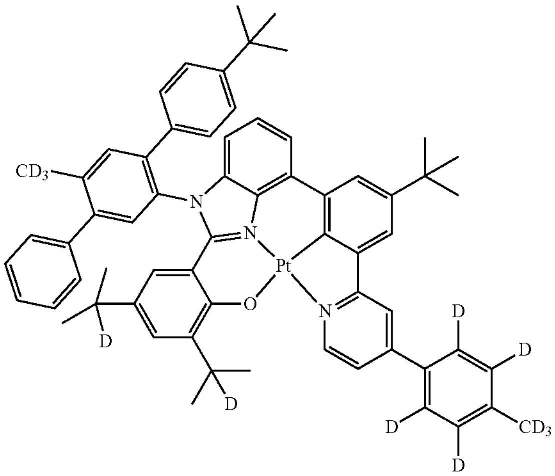
3336
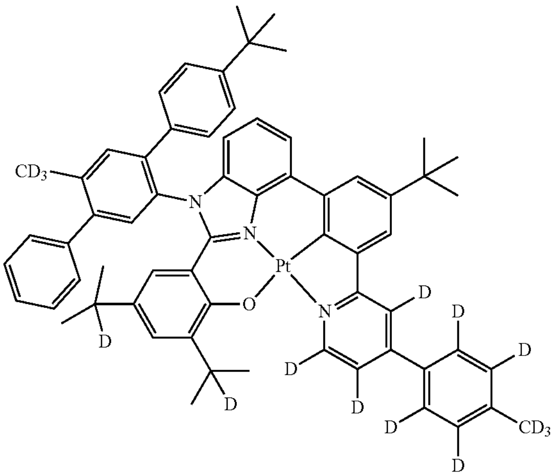
3337
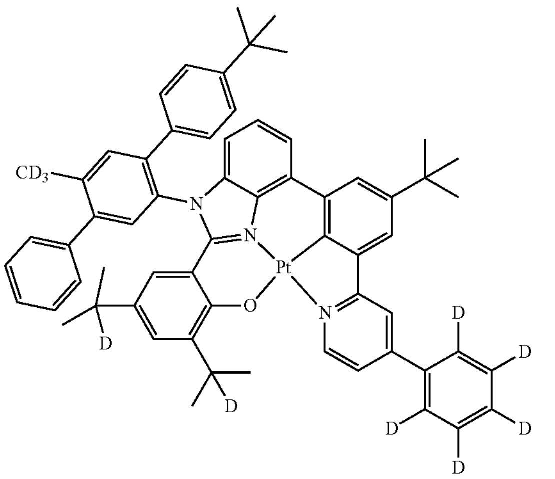
3338
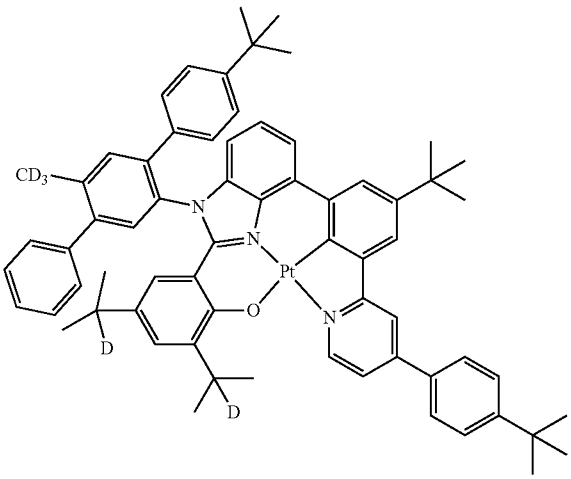

-continued
3339
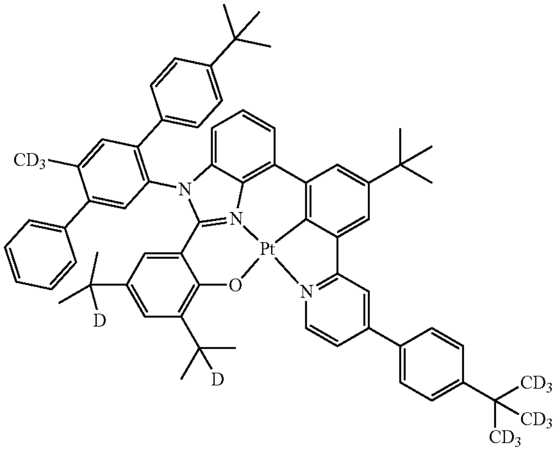
3340
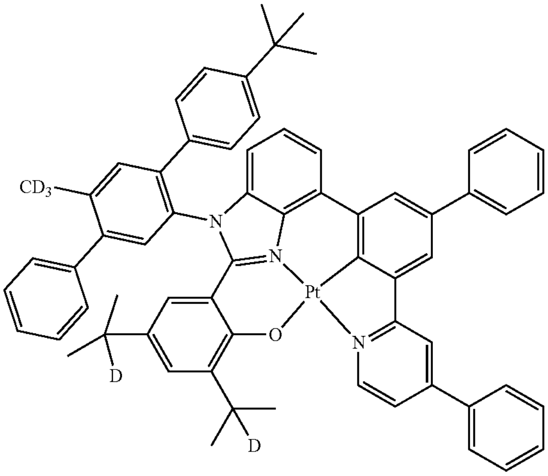
3341
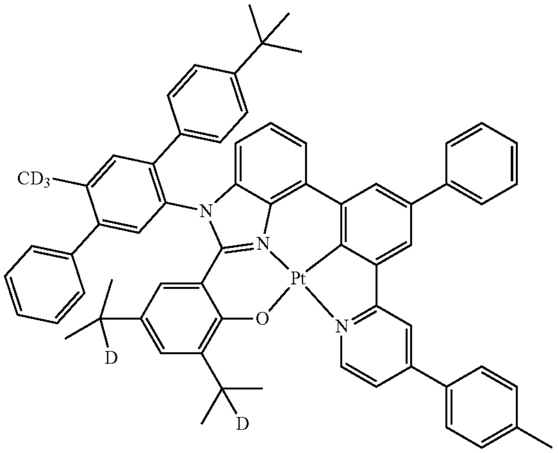
3342
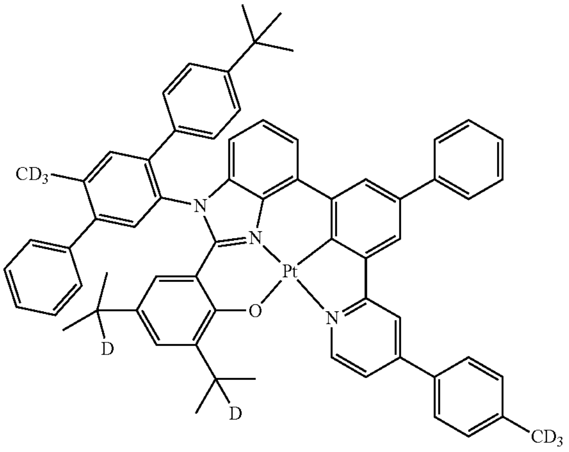
3343
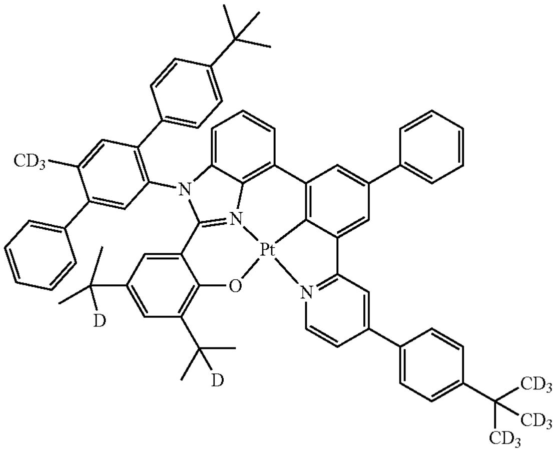
3344
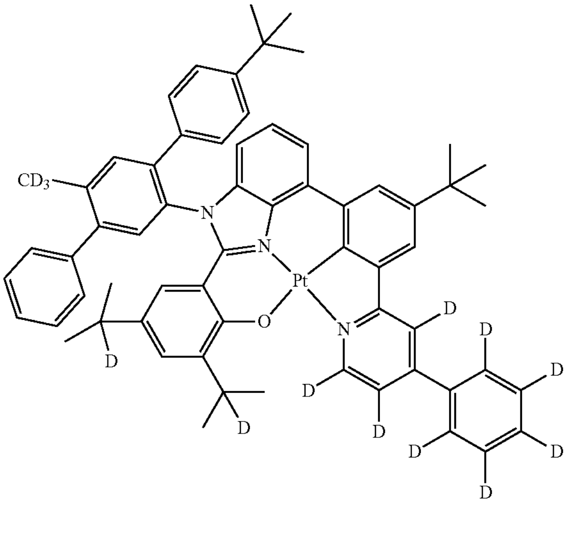

-continued
3345
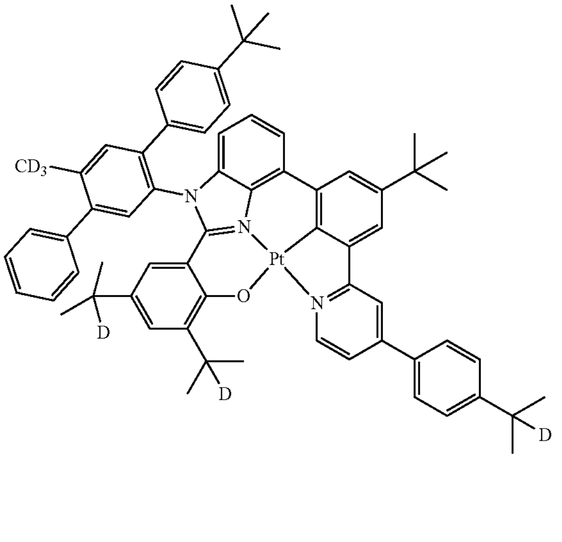
3346
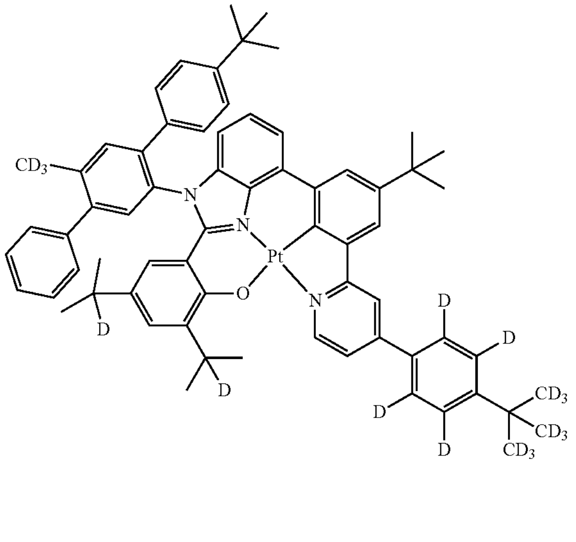
3347
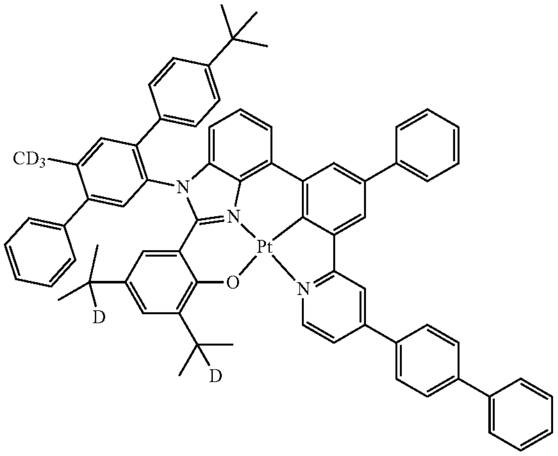
3348
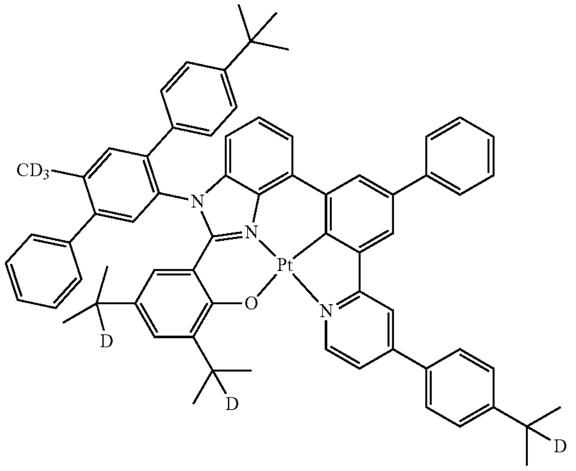
3349
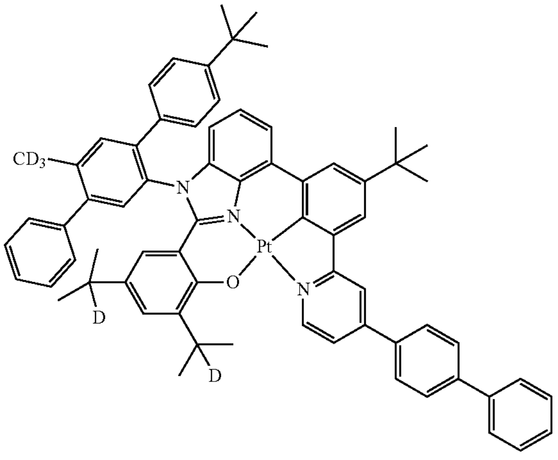
3350
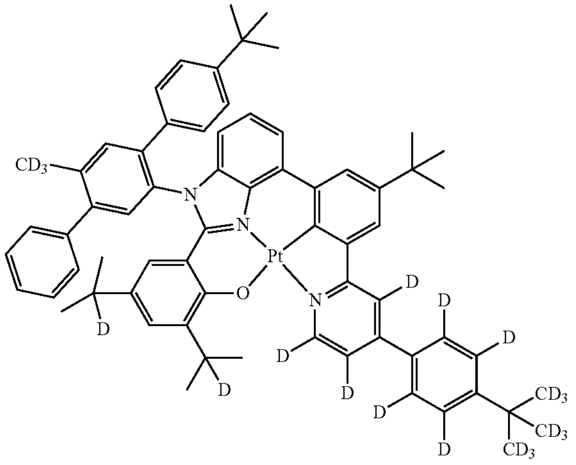

-continued
3351
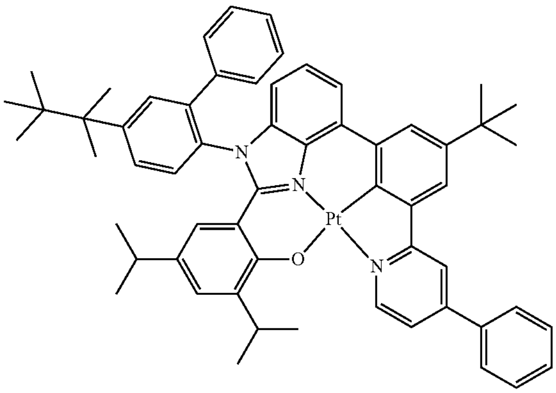
3352
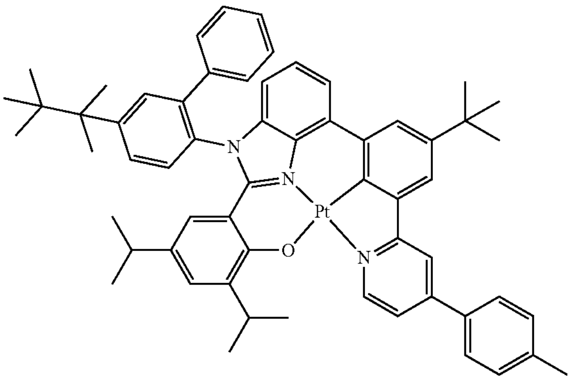
3353
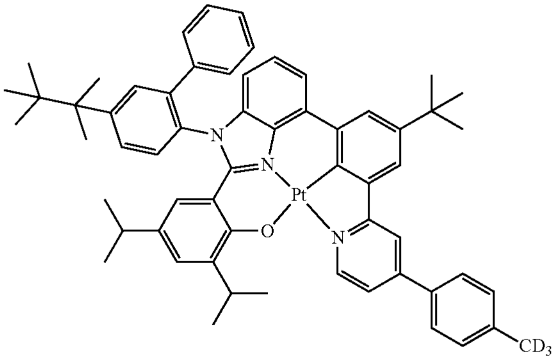
3354
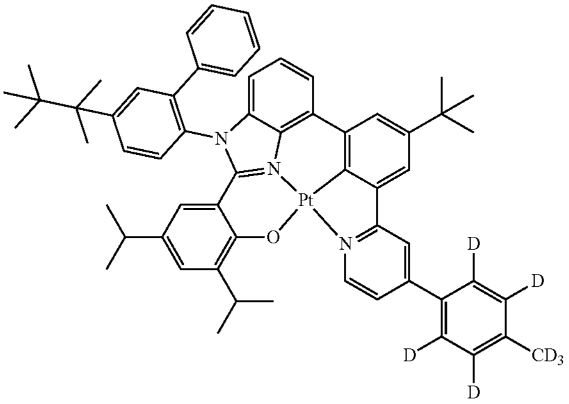
3355
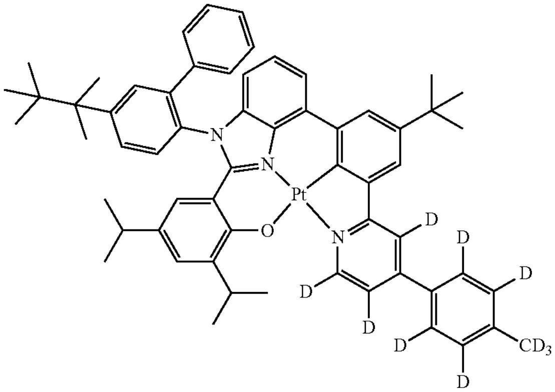
3356
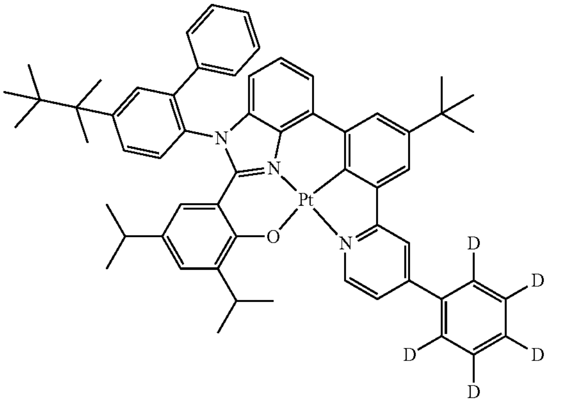

-continued
3357
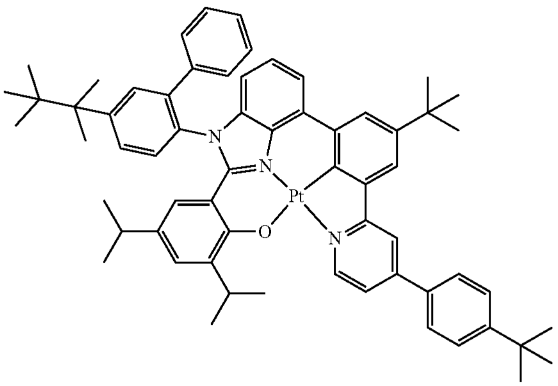
3358
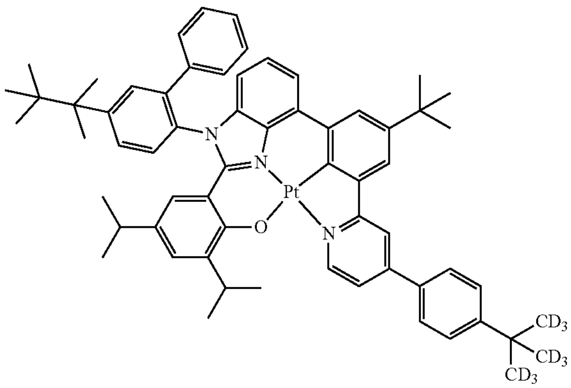
3359
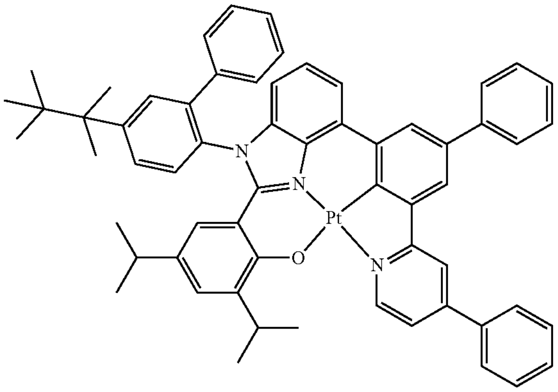
3360
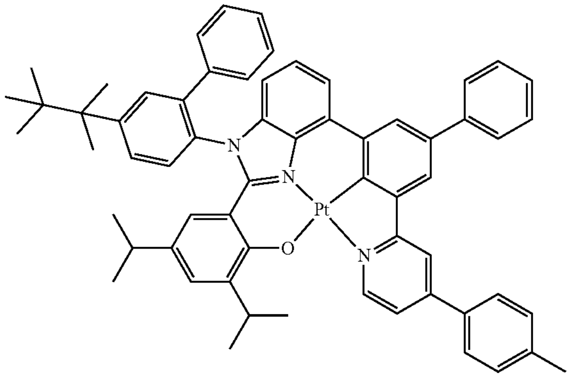
3361
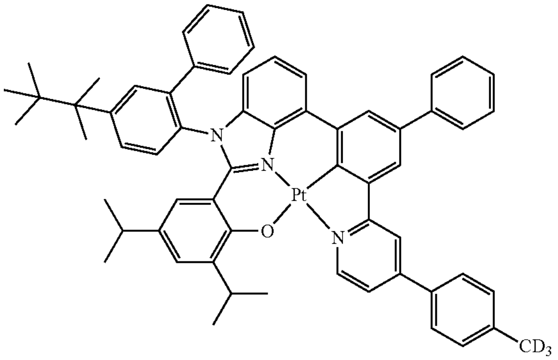
3362
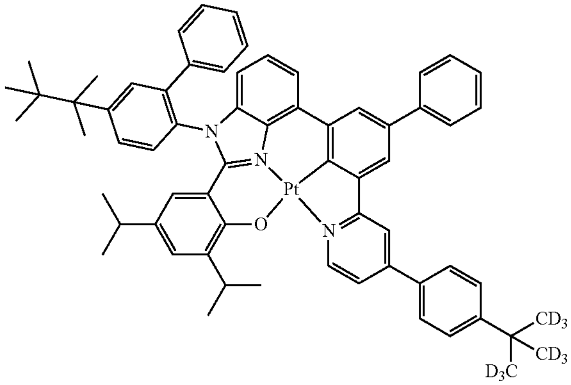
3363
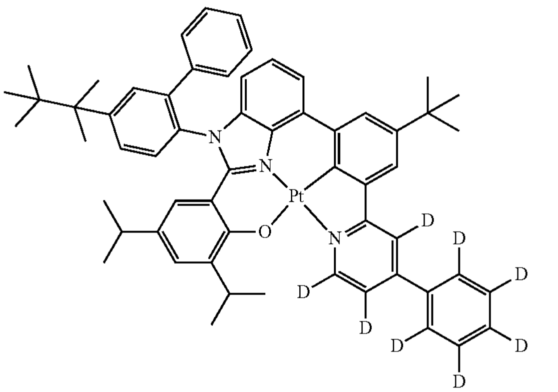
3364
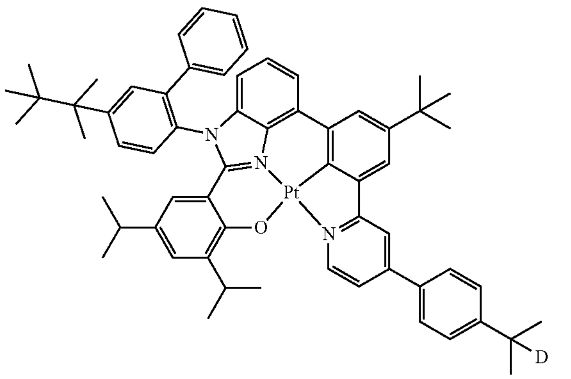

-continued
3365
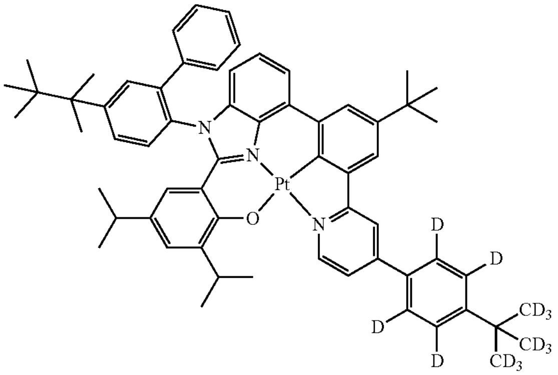
3366
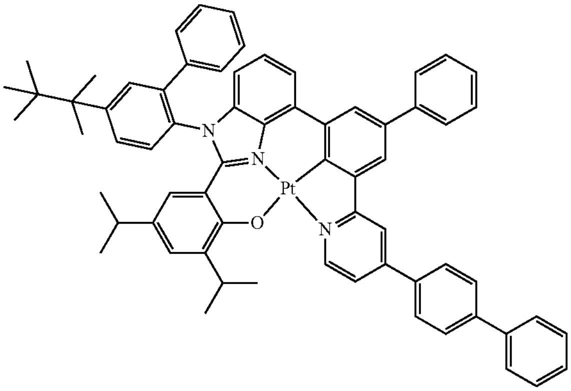
3367
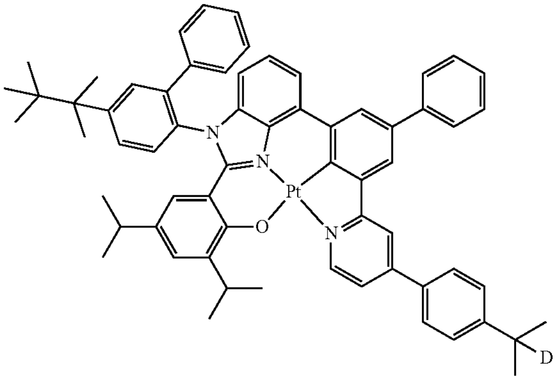
3368
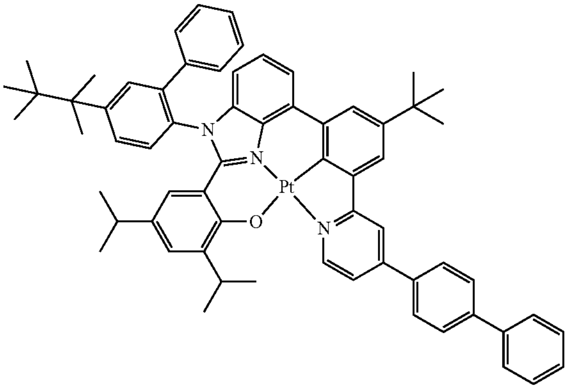
3369
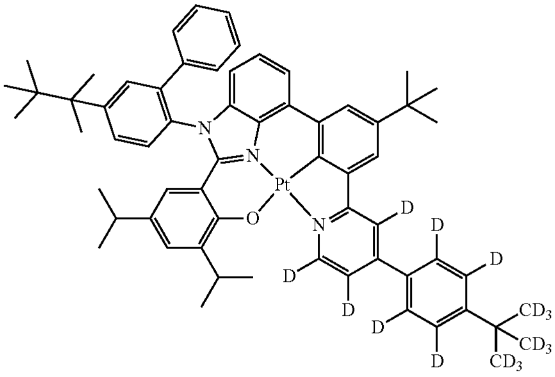
3370
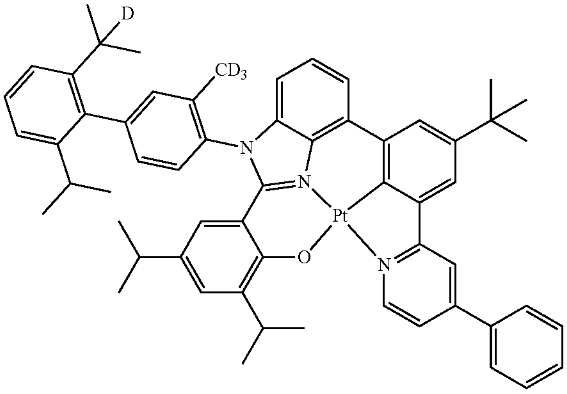
3371
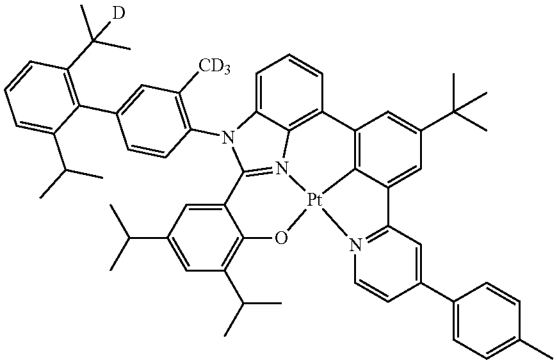
3372
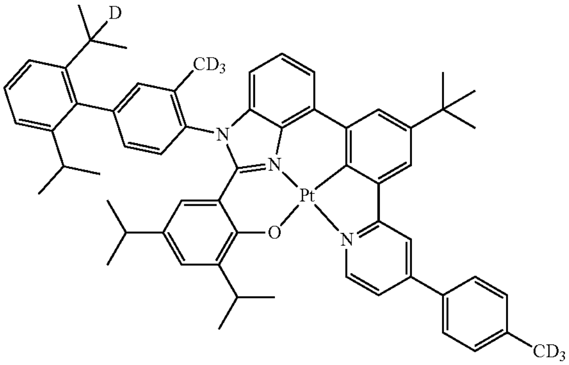

-continued
3373
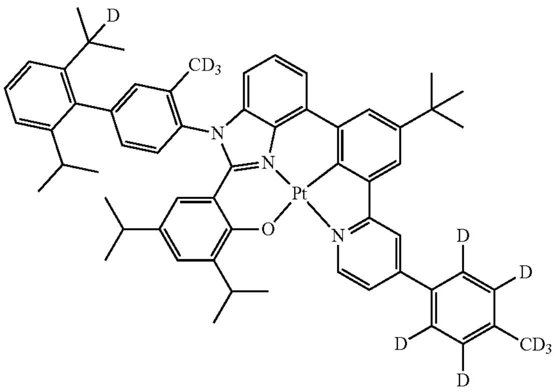
3374
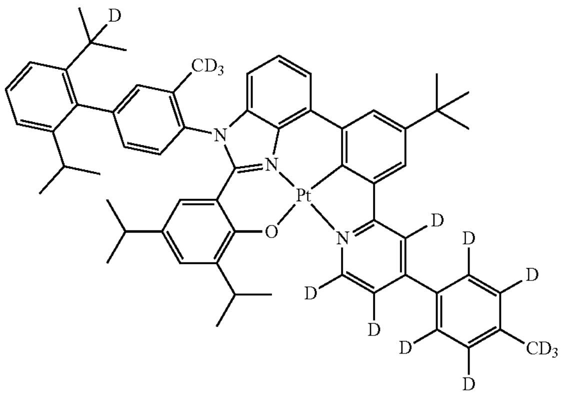
3375
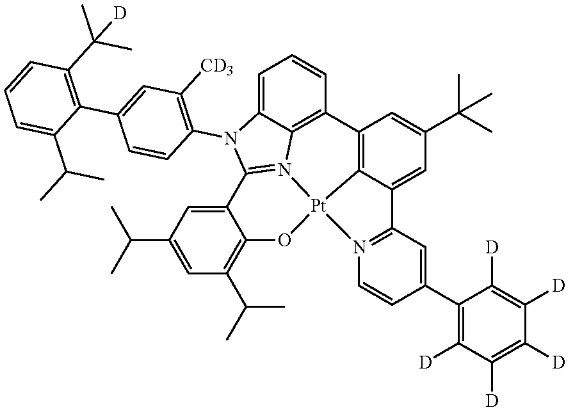
-continued
3377
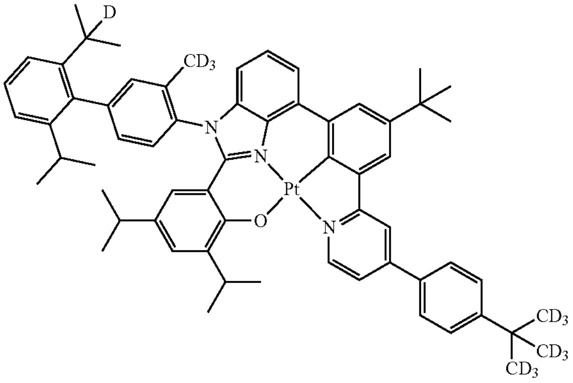
3376
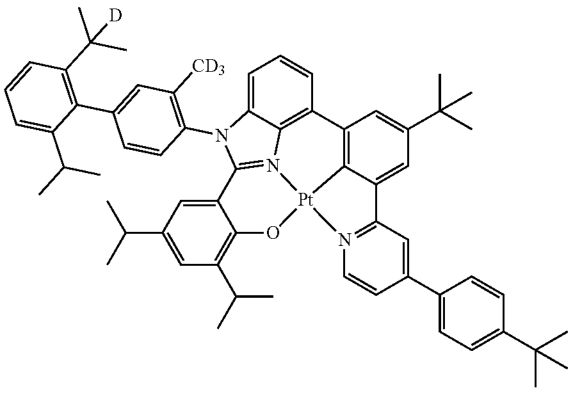
3378
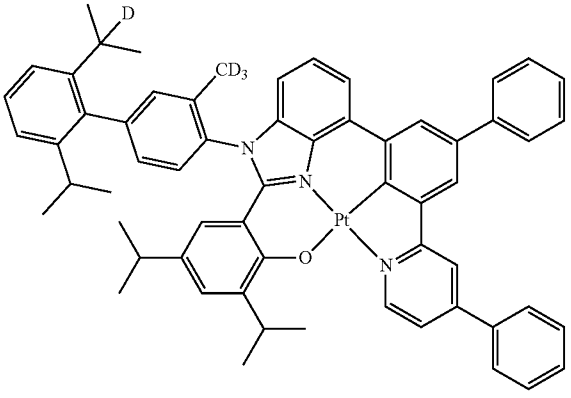

-continued
3379
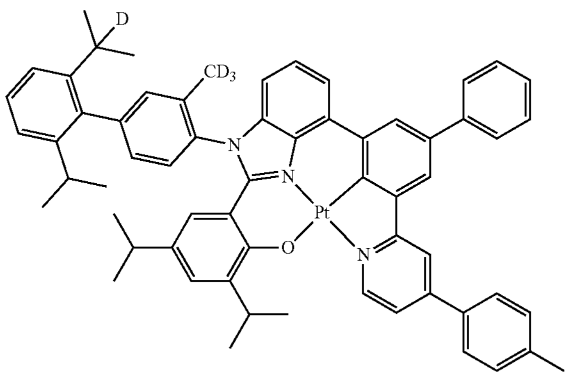
3380
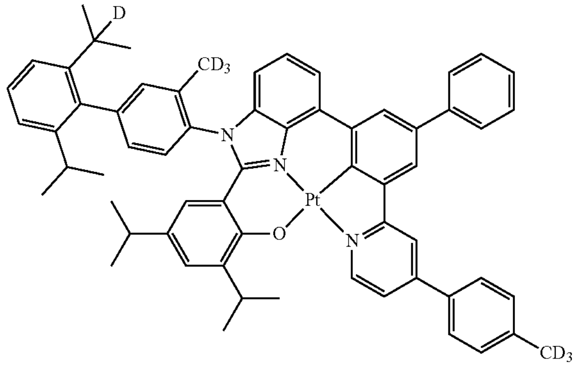
3381
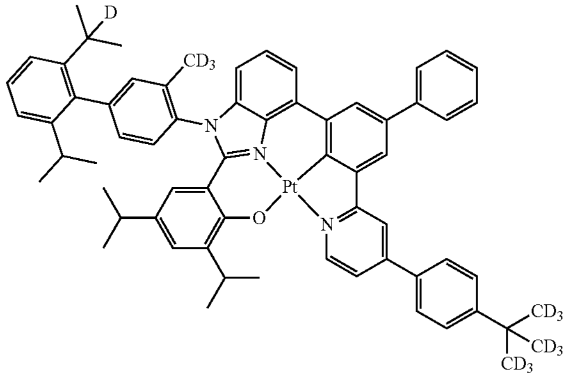
3382
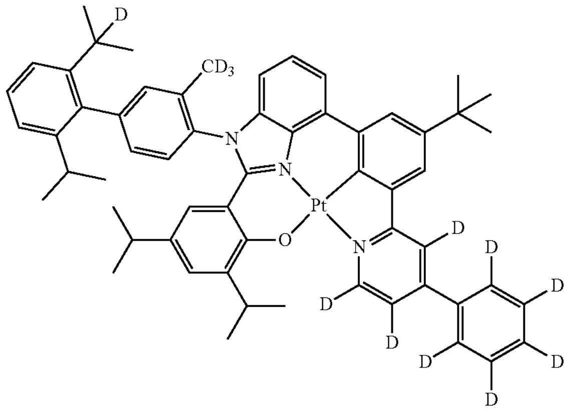
-continued
3383
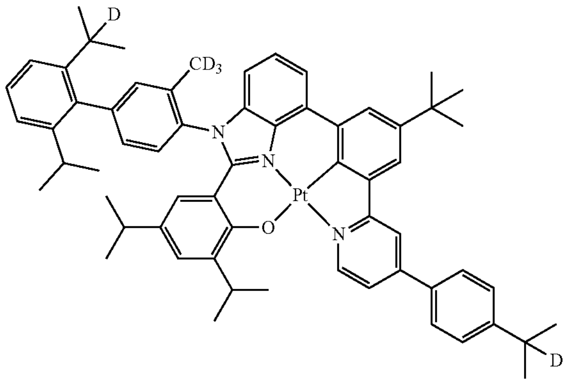
3384
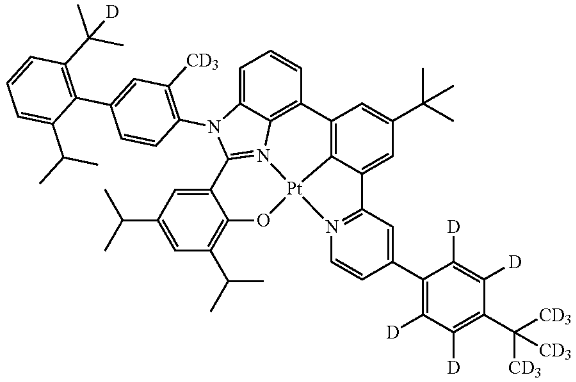
3385
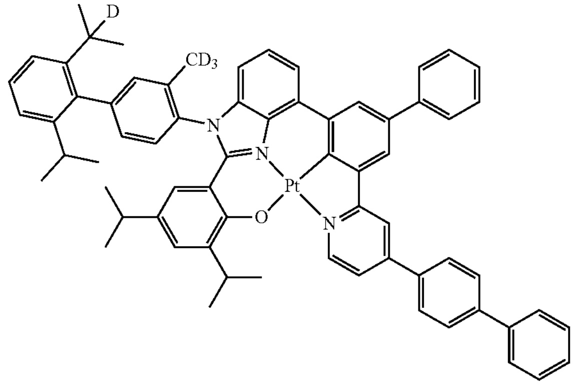
3386
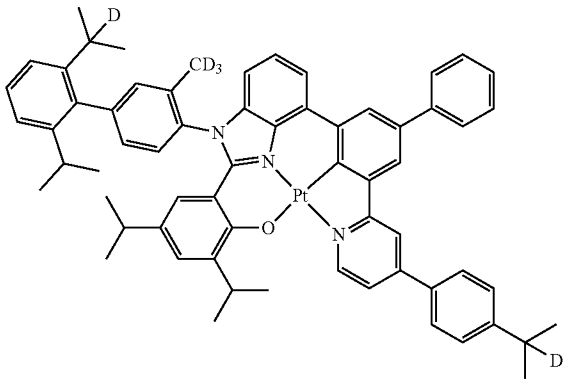

-continued
3387
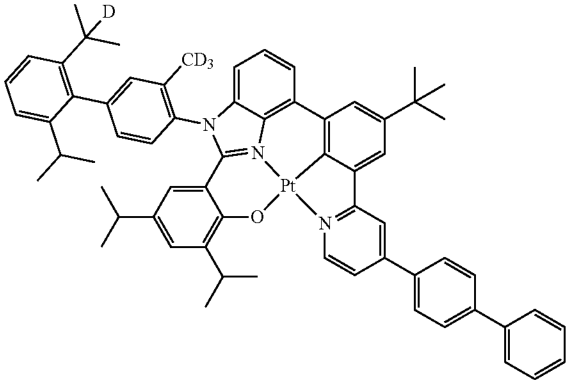
3388
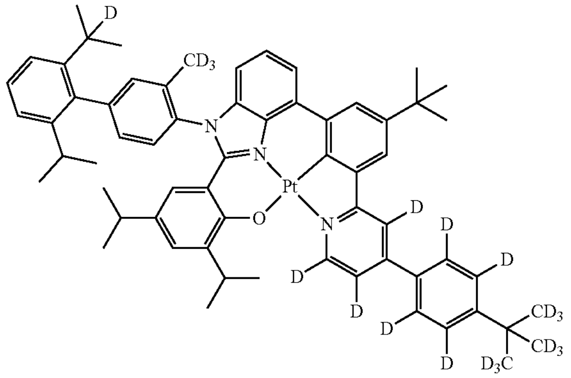
3389
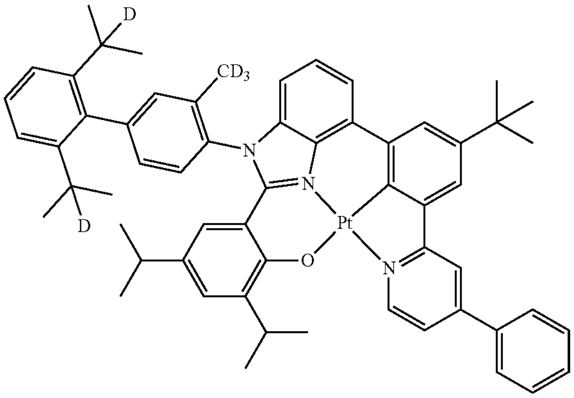
3390
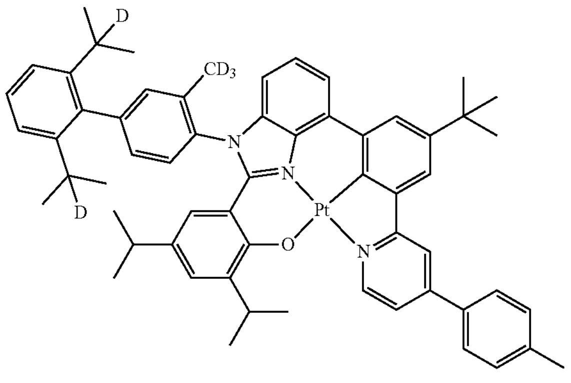
-continued
3391
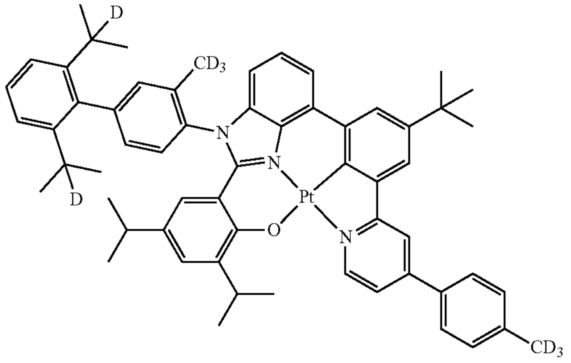
3392
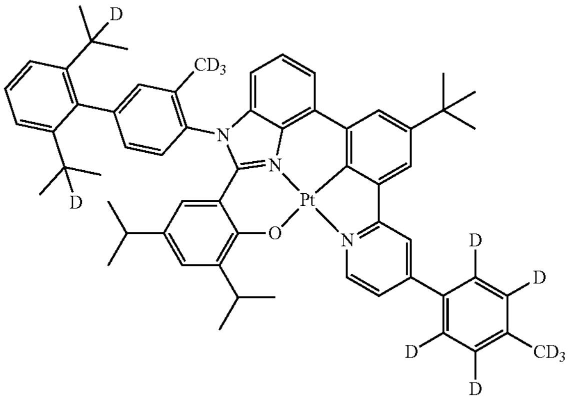
3393
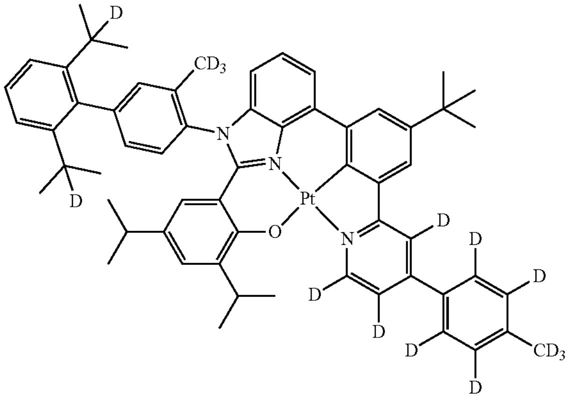

-continued
3394
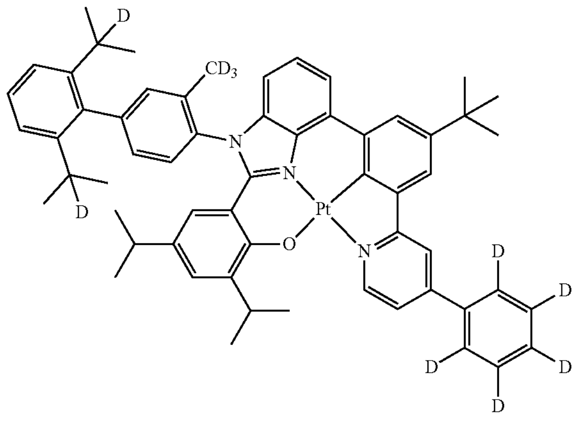
3395
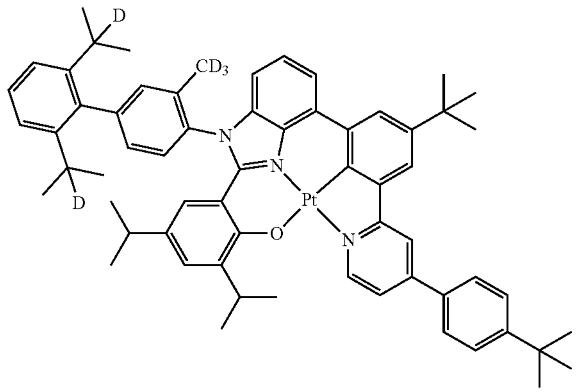
3396
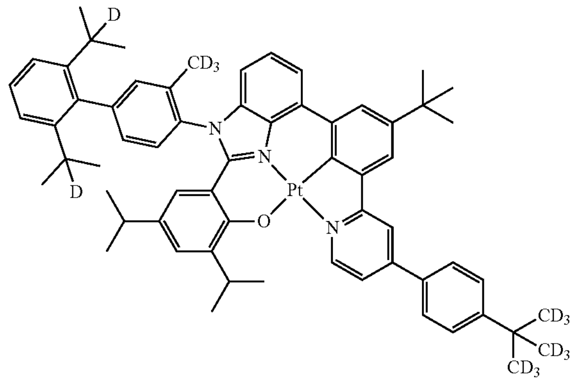
-continued
3397
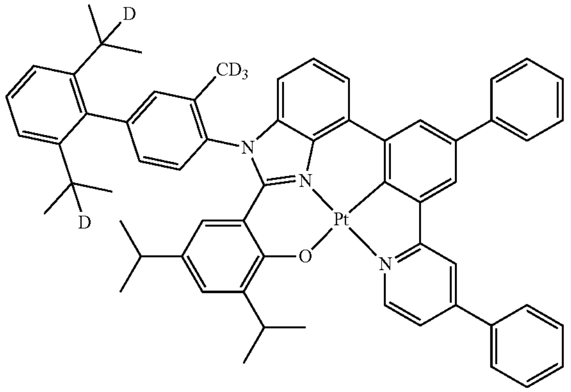
3398
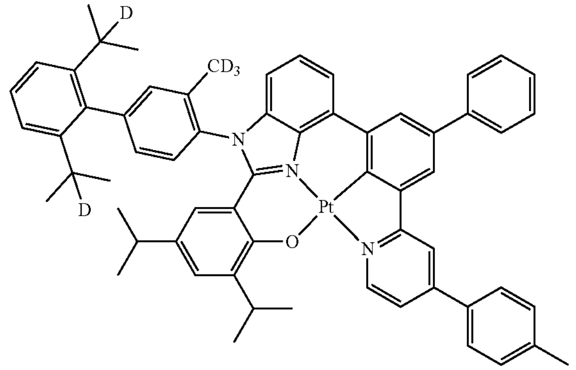
3399
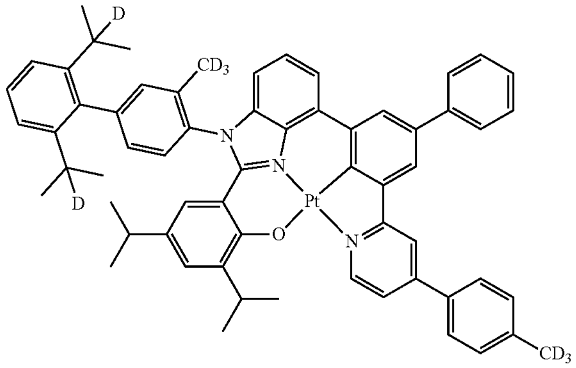
3400
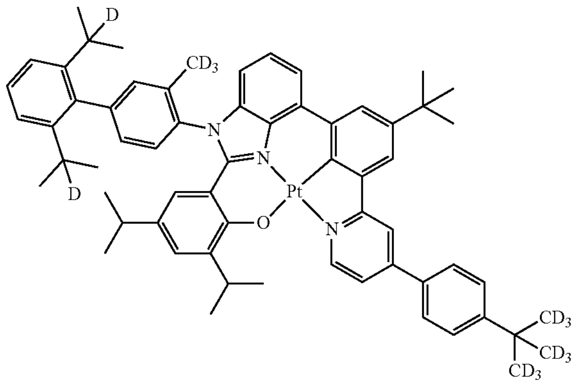

-continued
3401
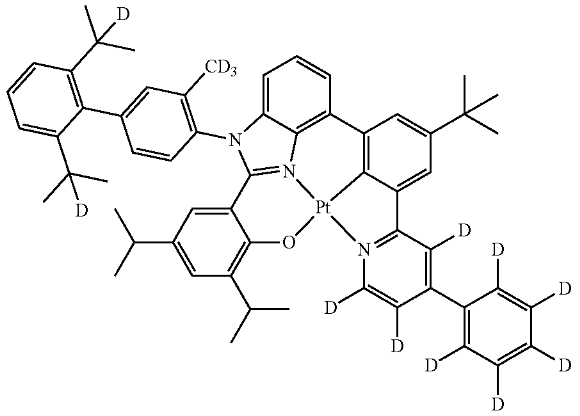
3402
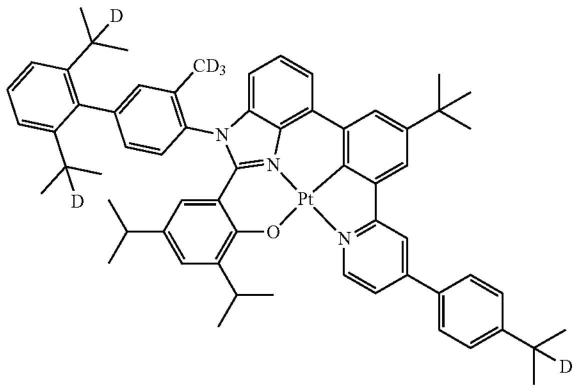
3403
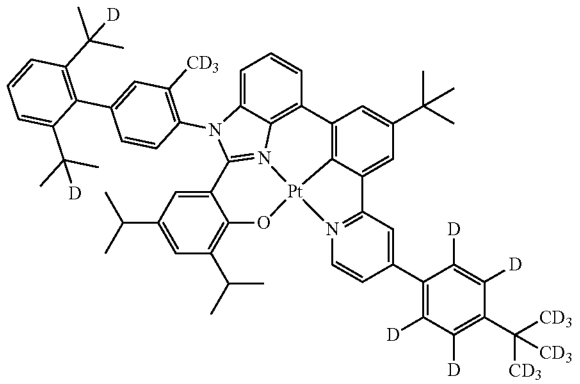
3404
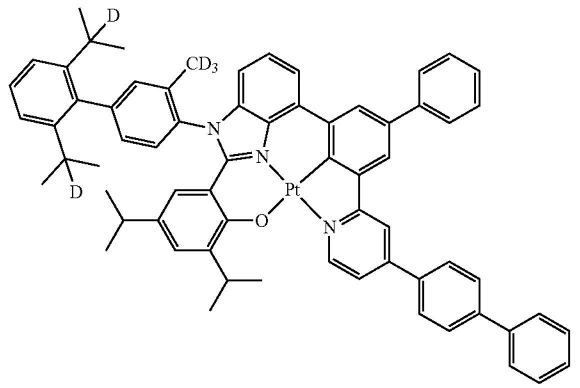
-continued
3405
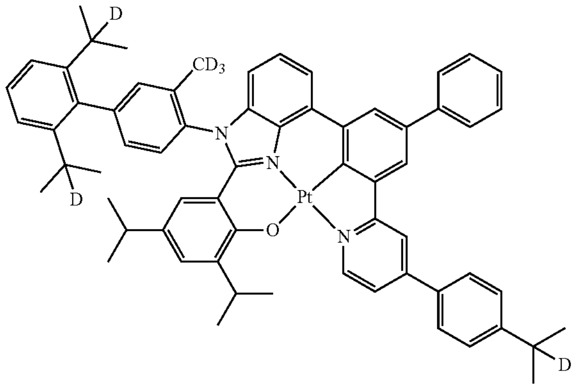
3406
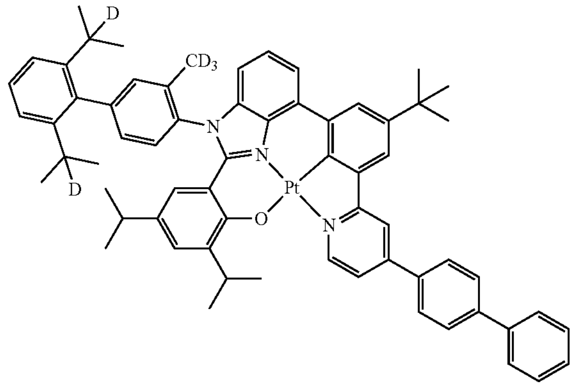
3407
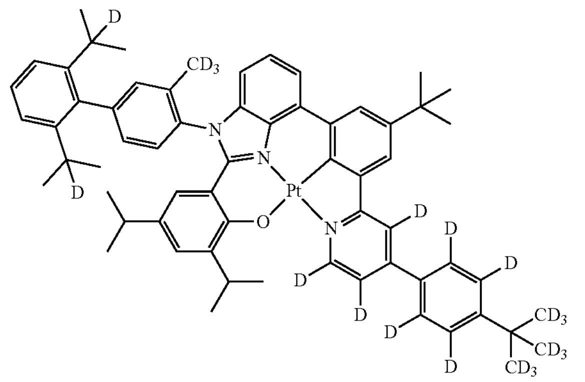
3408
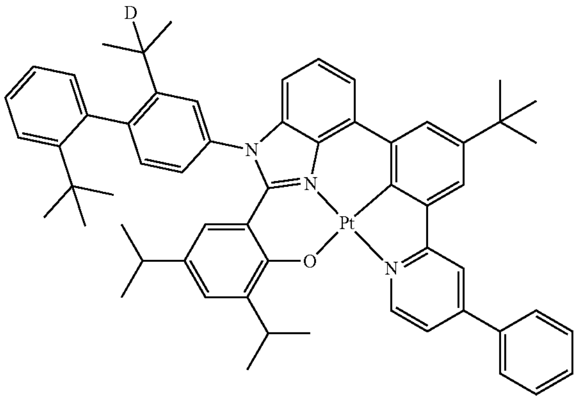

-continued
3409
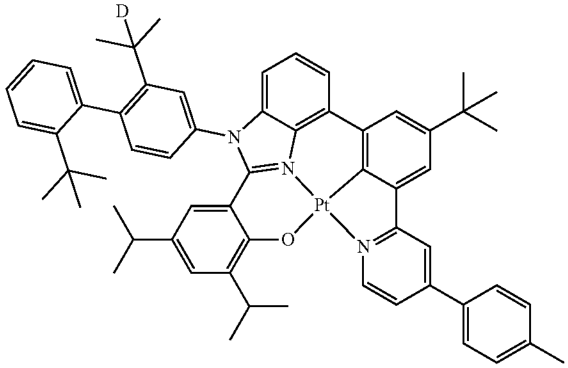
3410
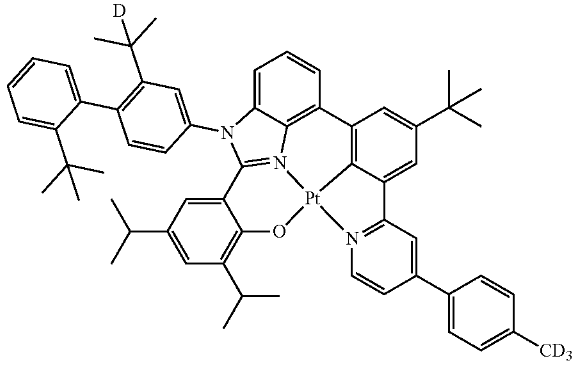
3411
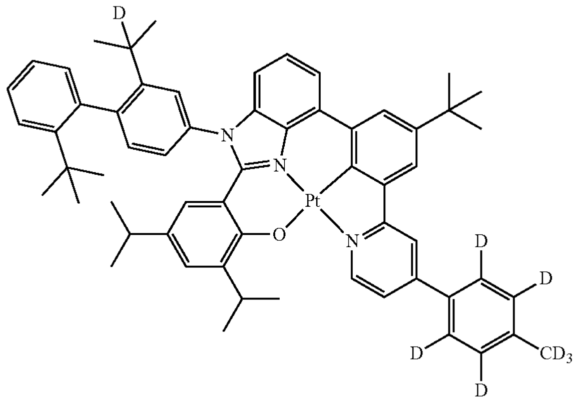
3412
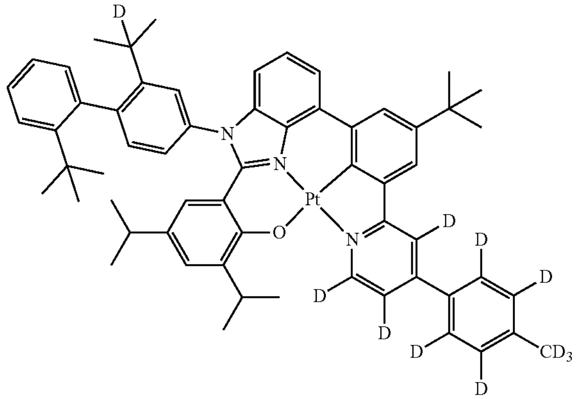
-continued
3413
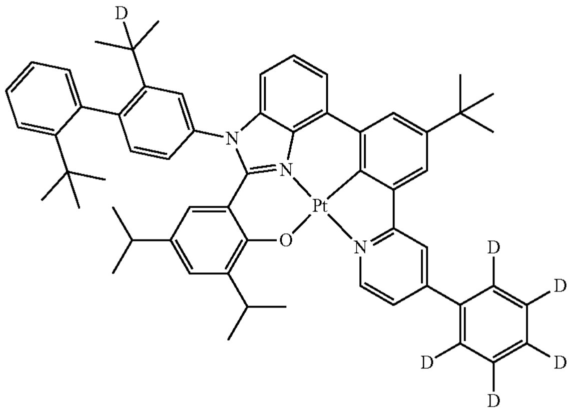
3414
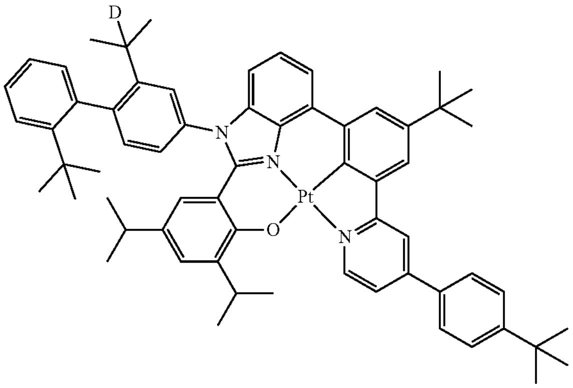
3415
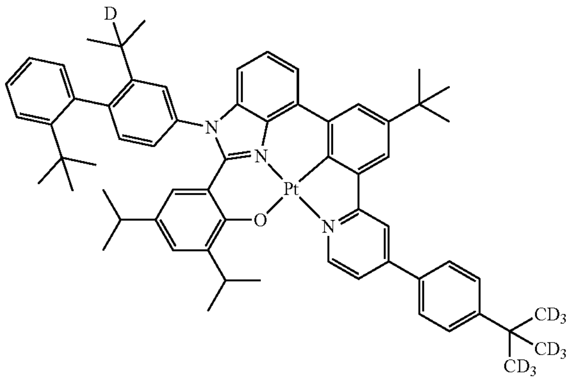

-continued
3416
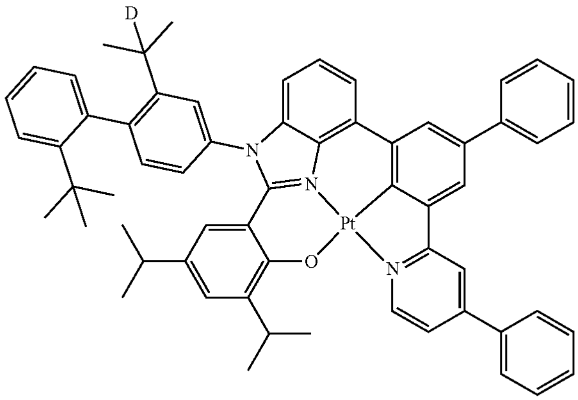
3417
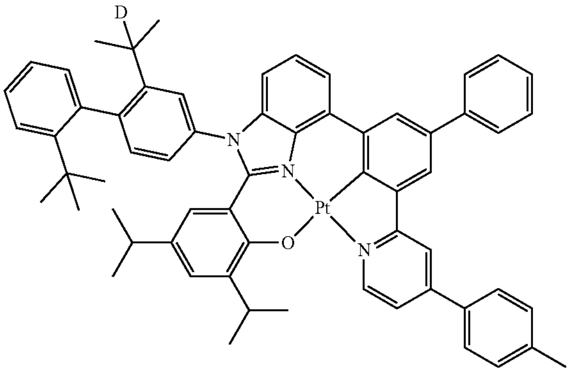
3418
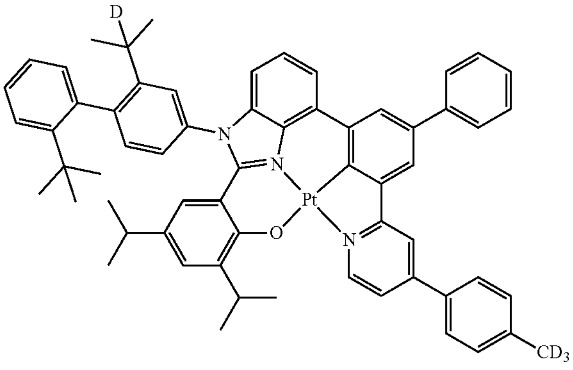
3419
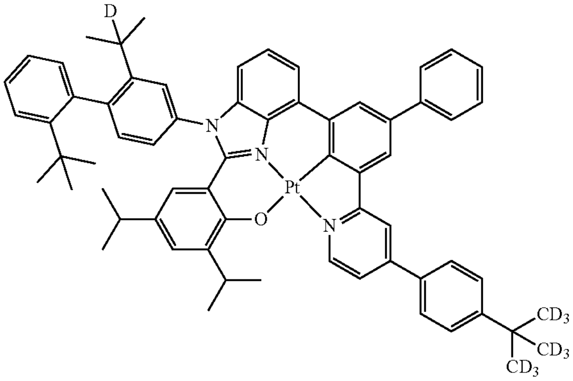
-continued
3420
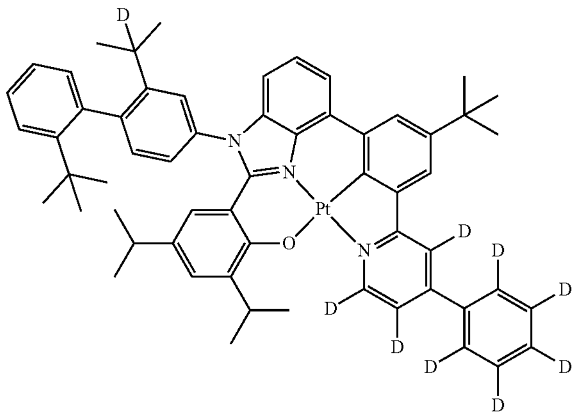
3421
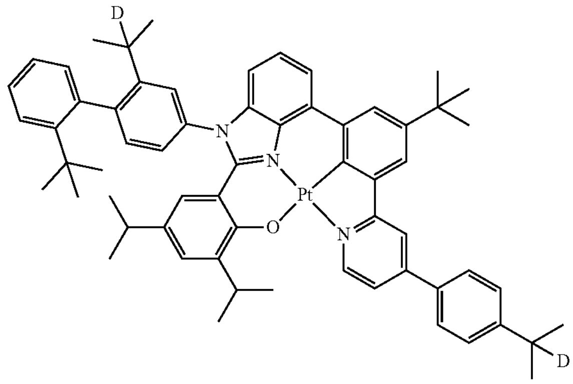
3422
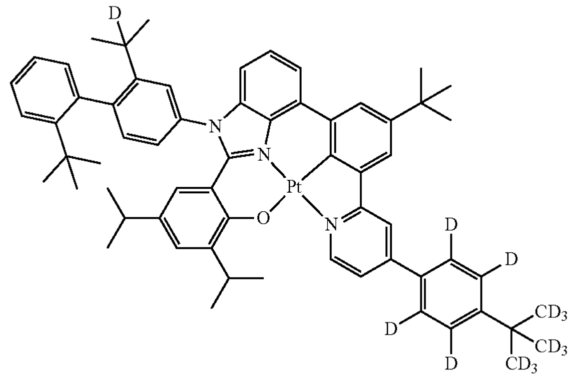
3423
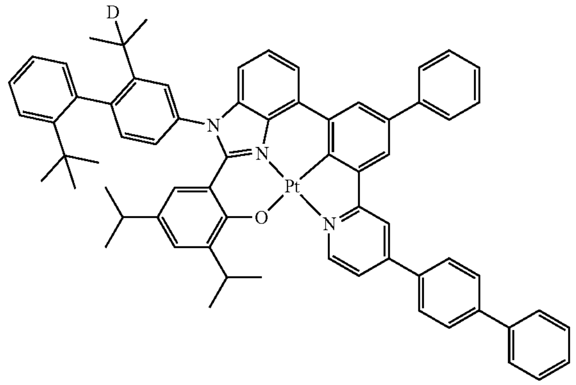

-continued
3424
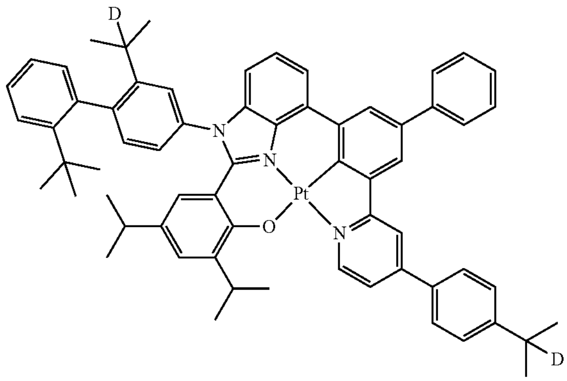
3425
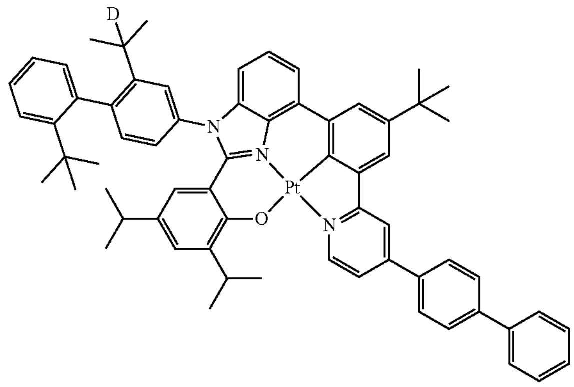
3426
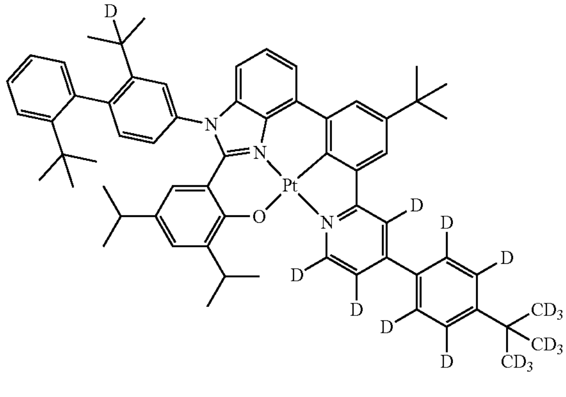
-continued
3427
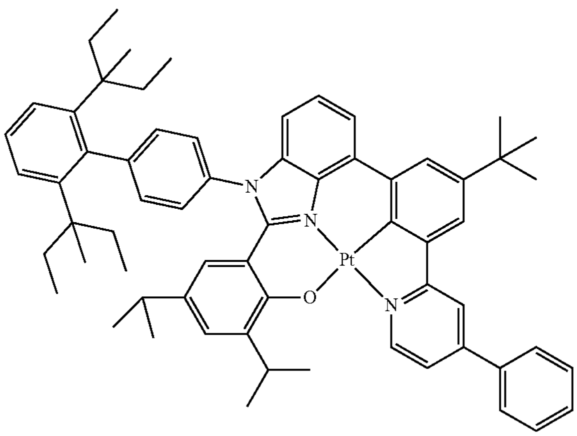
3428
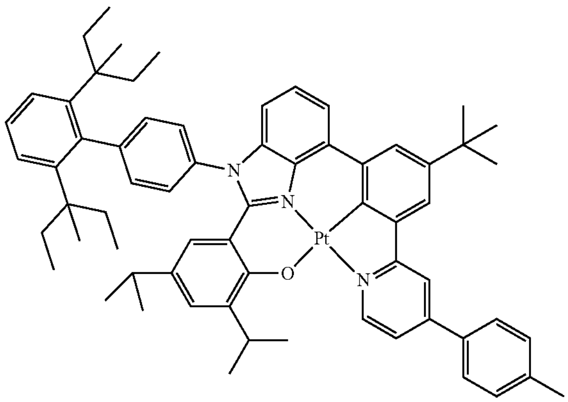
3429
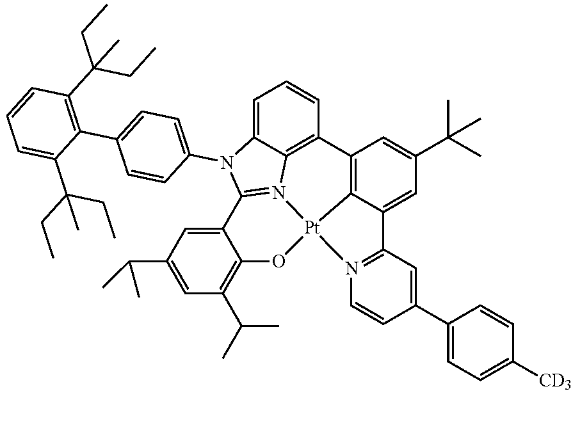

-continued
3430
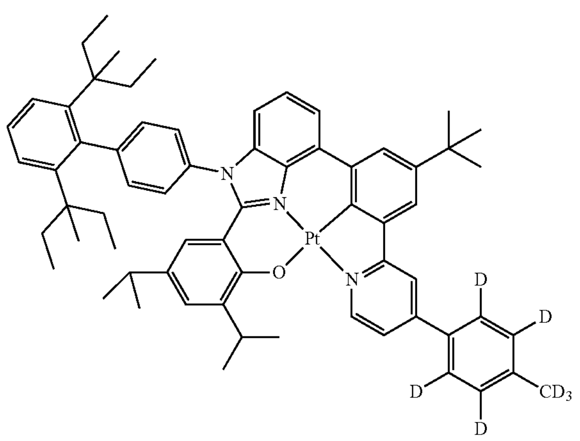
3431
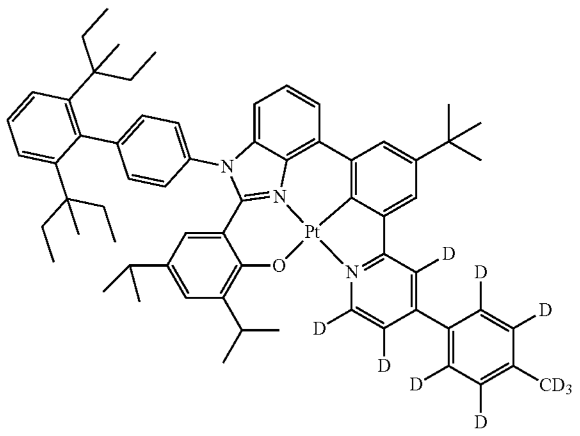
3432
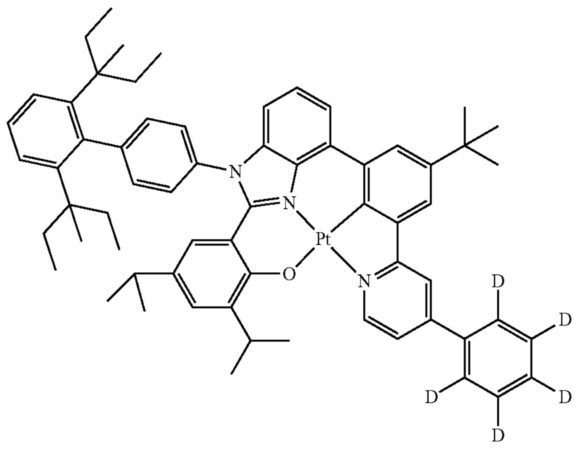
-continued
3433
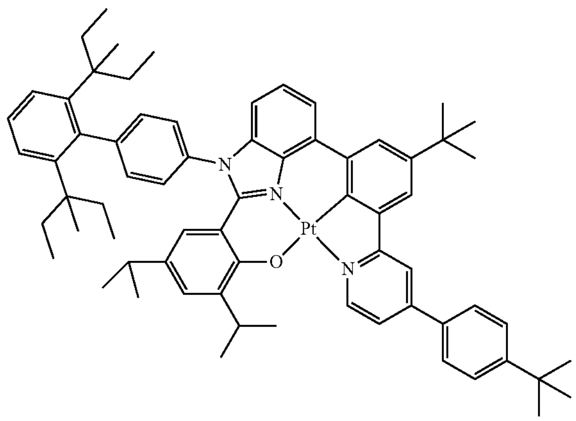
3434
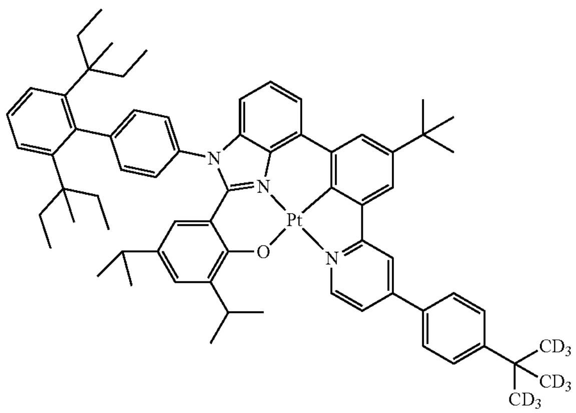
3435
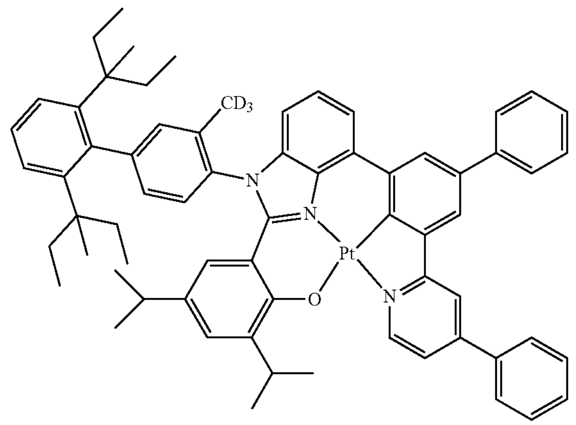

-continued
3436
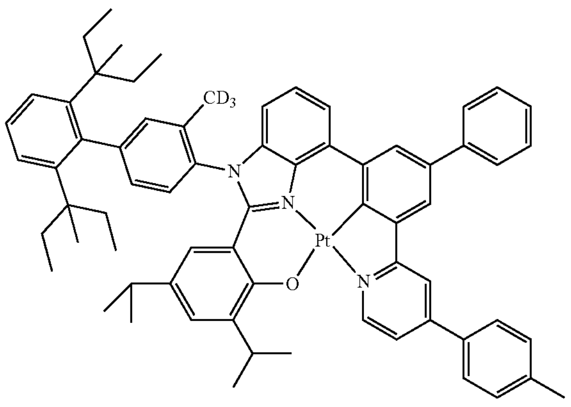
3437
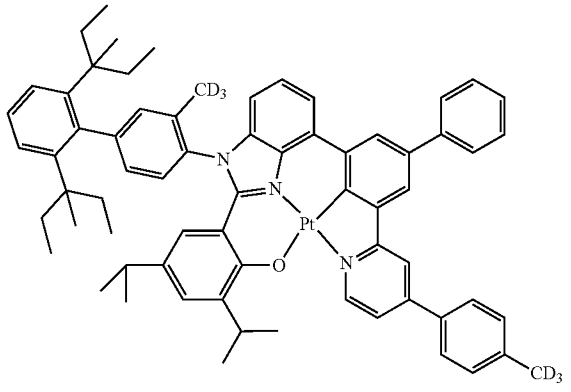
3438
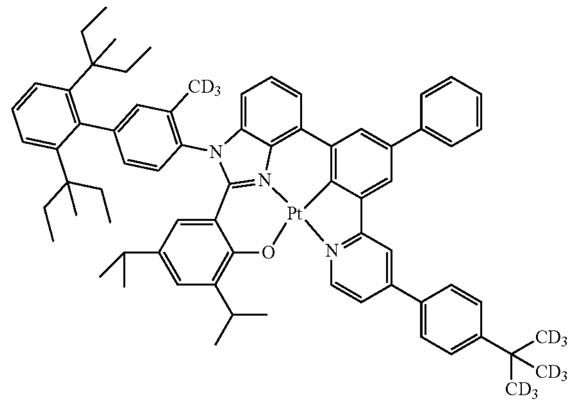
-continued
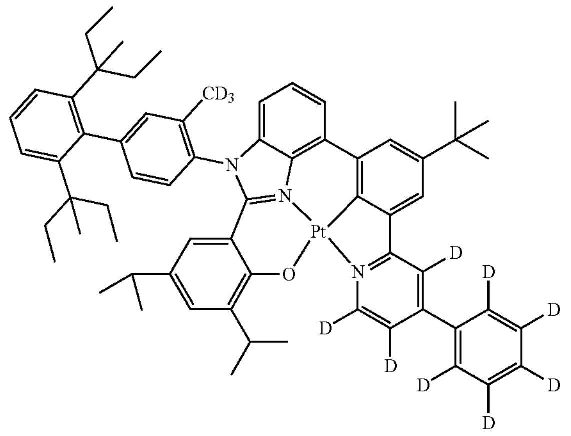
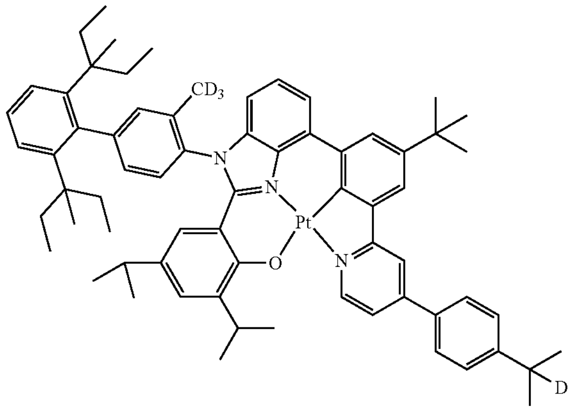
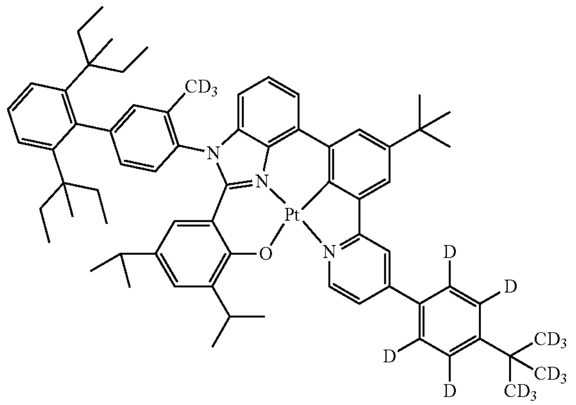
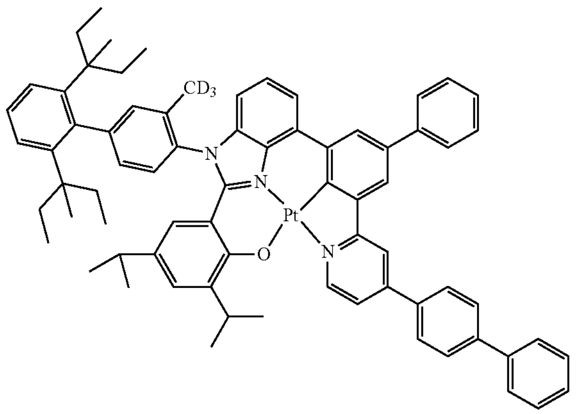

-continued
3443
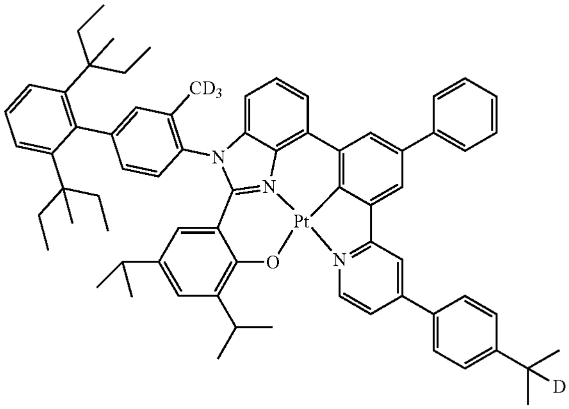
3444
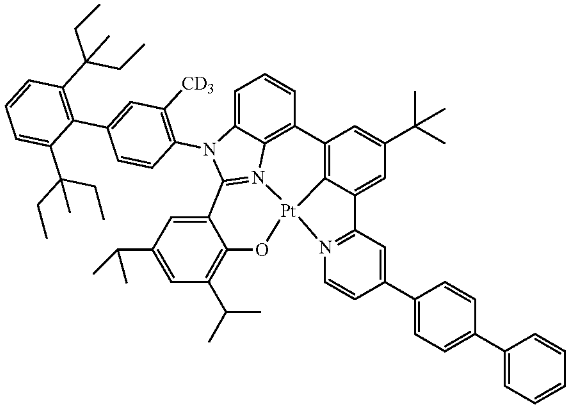
3445
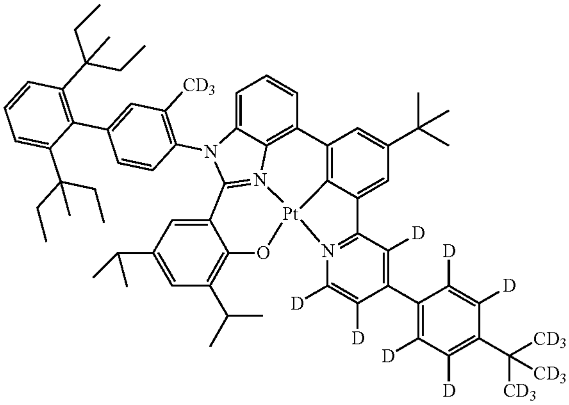
-continued
3446
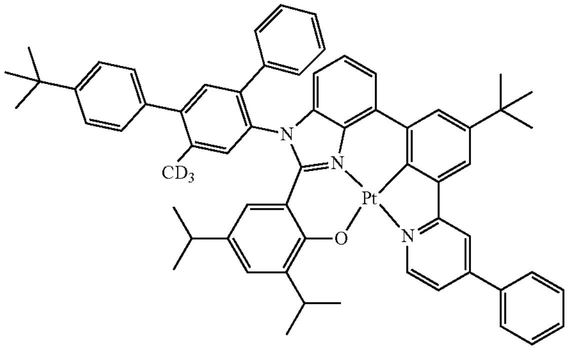
3447
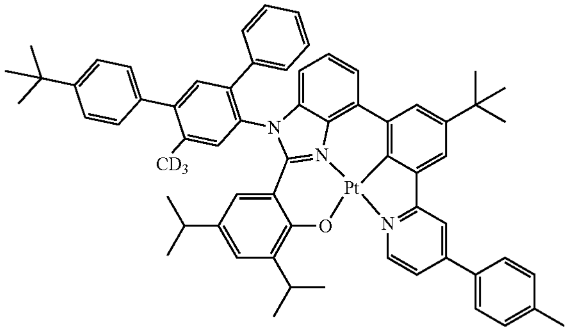
3448
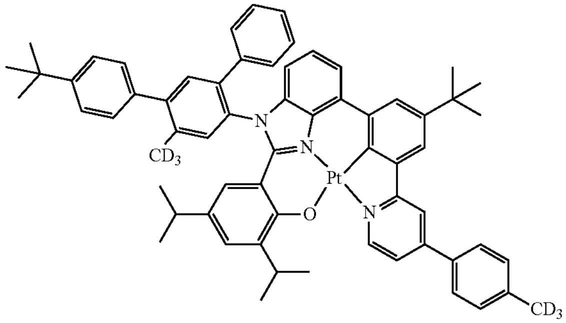
3449
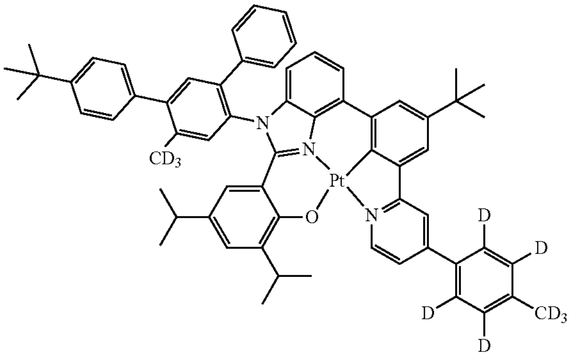

-continued
3450
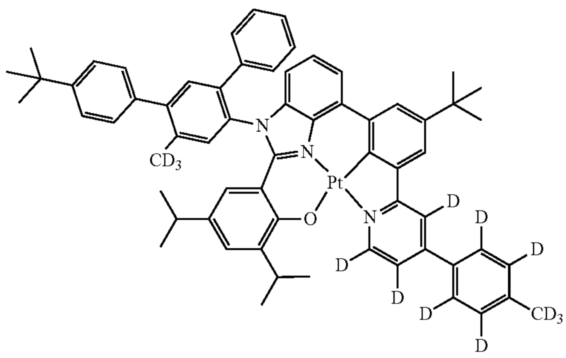
3451
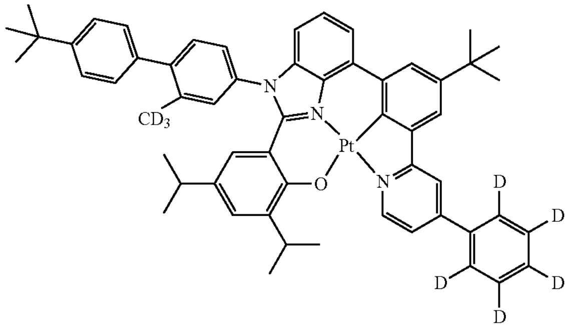
3452
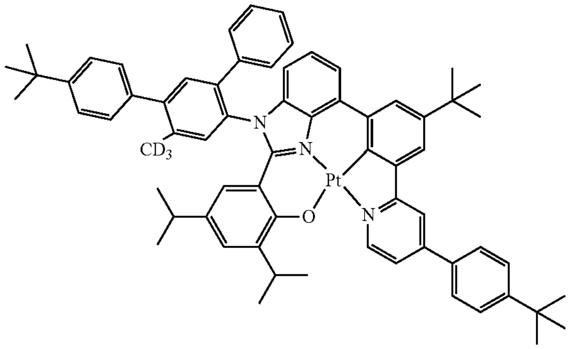
3453
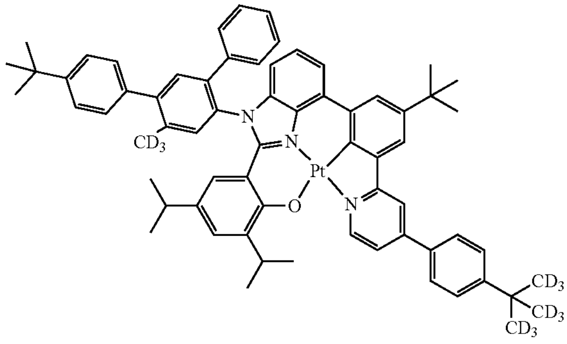
-continued
3454
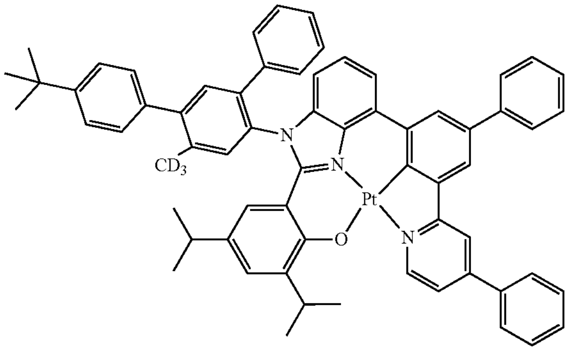
3455
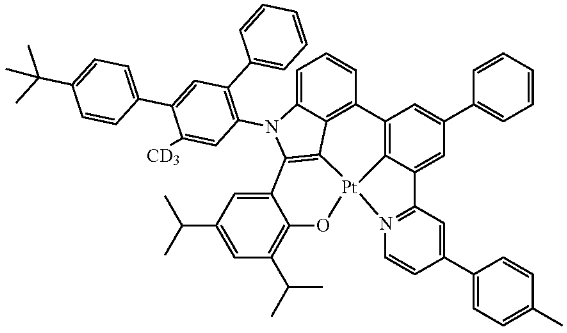
3456
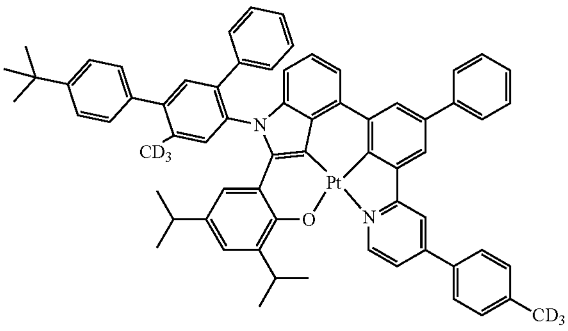
3457
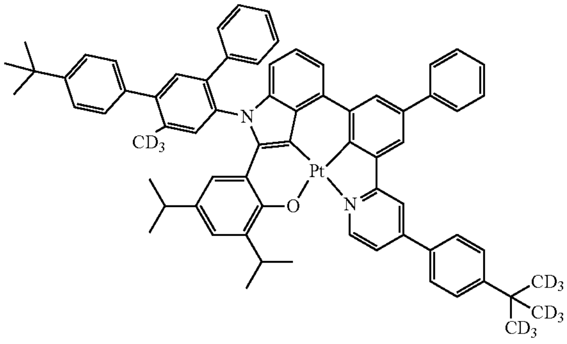

-continued
3458
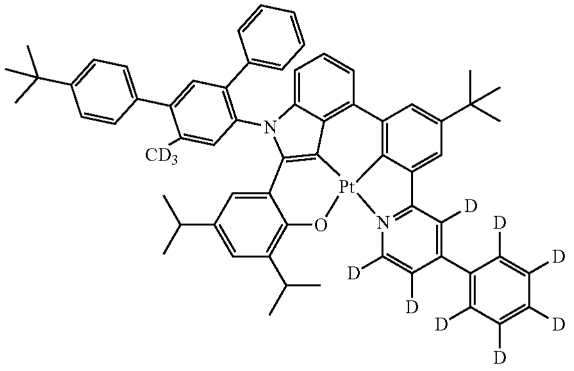
3459
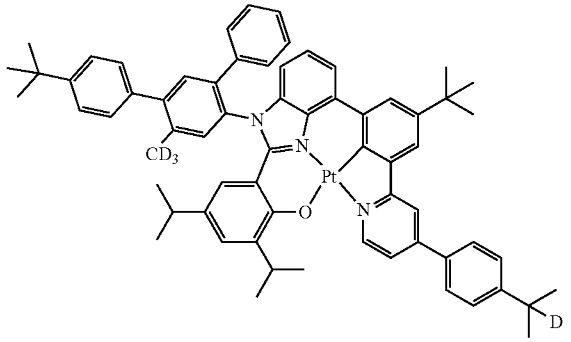
3460
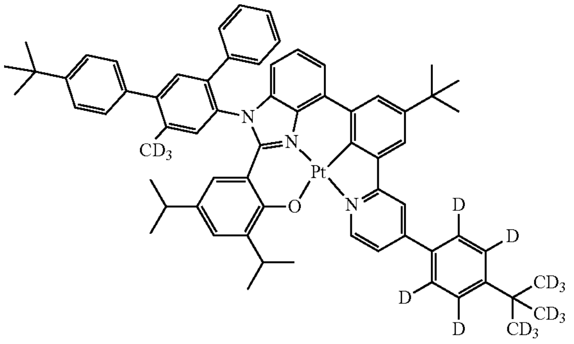
3461
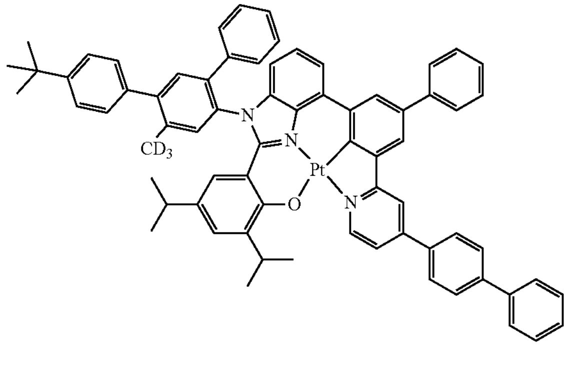
-continued
3462
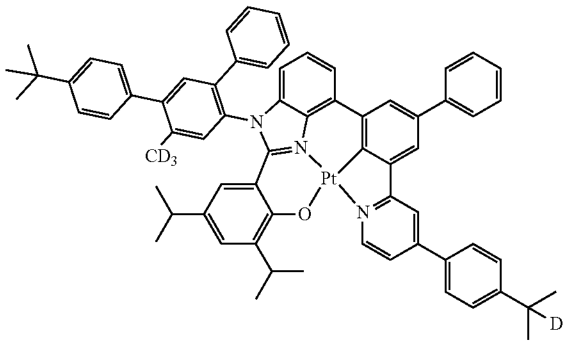
3463
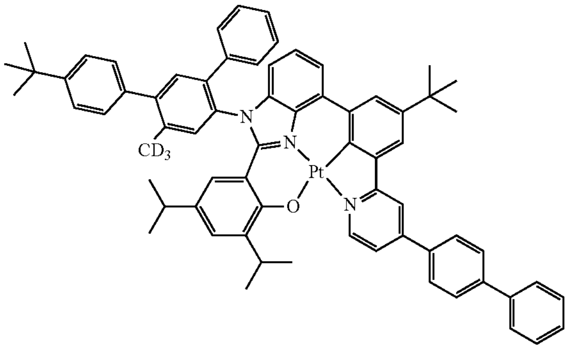
3464
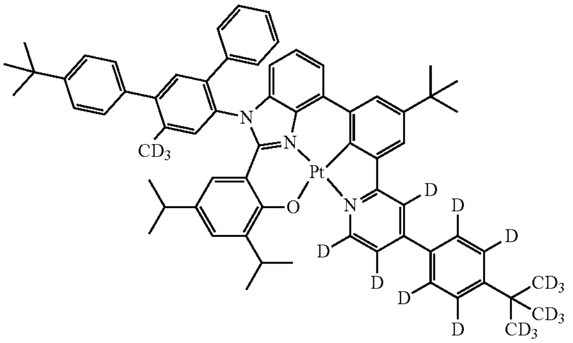
3465
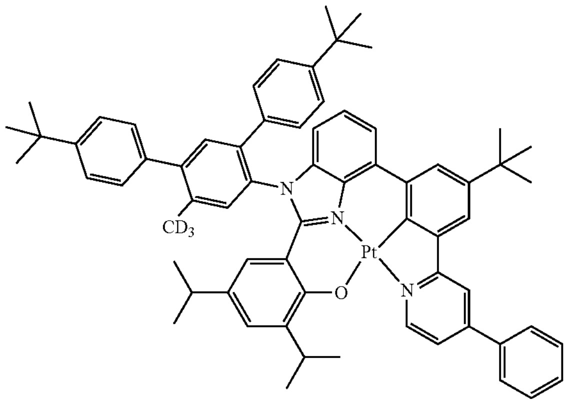

3466
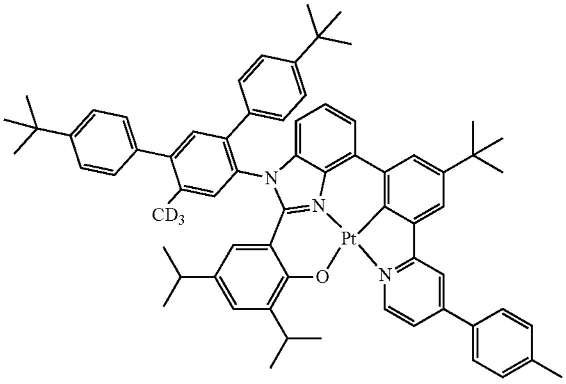
3467
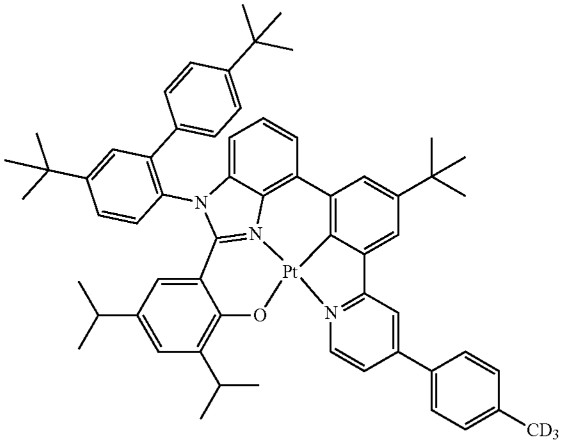
3468
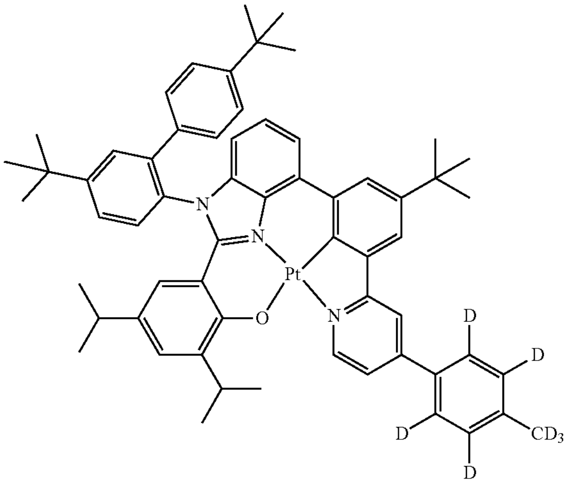
3469
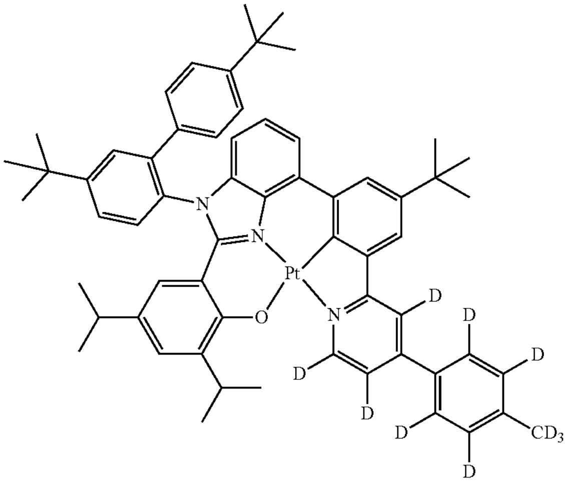
3470
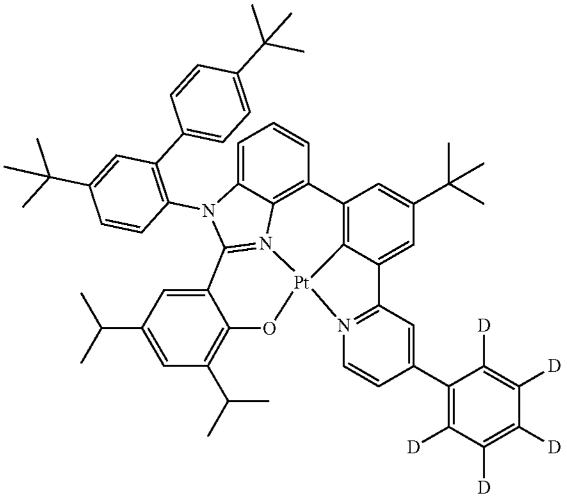
3471
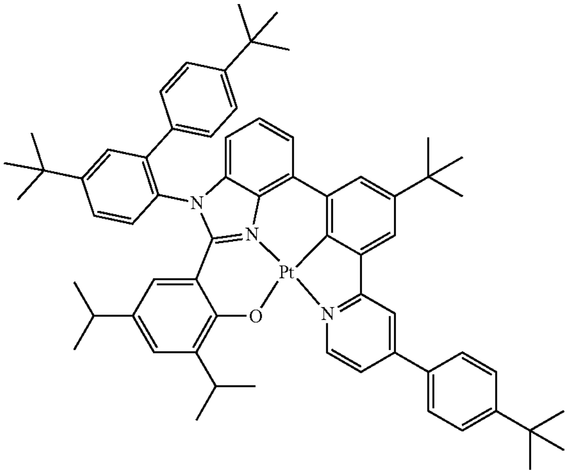

-continued
3472
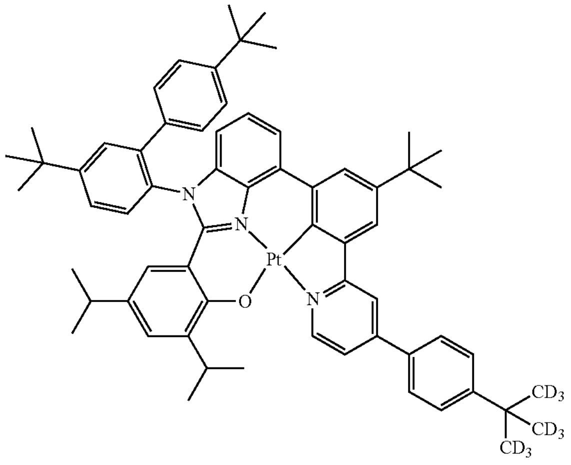
3473
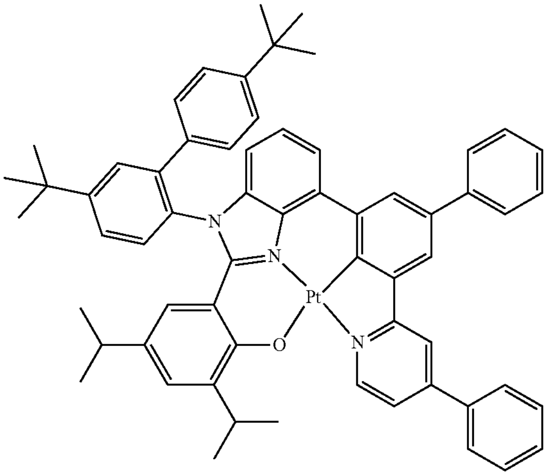
3474
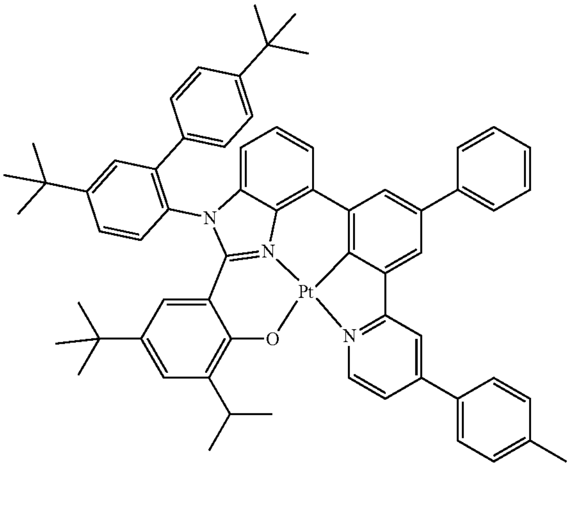
-continued
3475
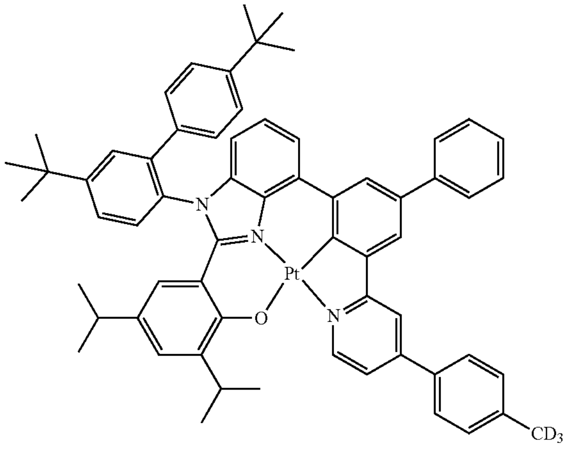
3476
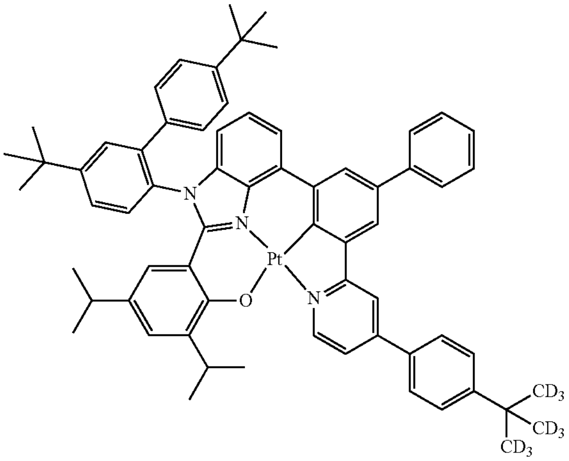
3477
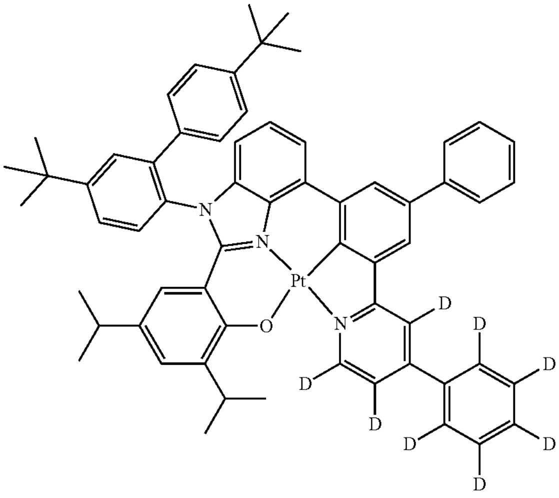

-continued
3478
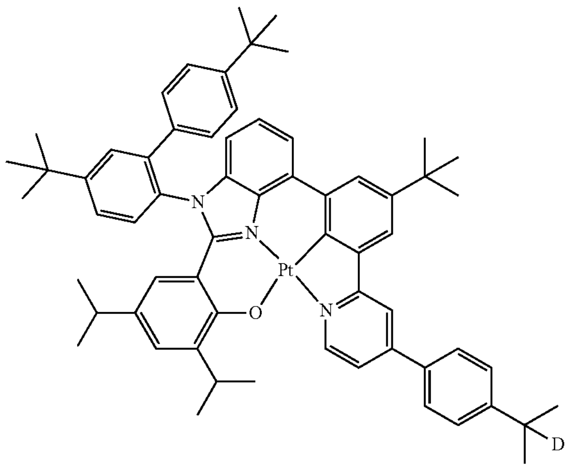
3479
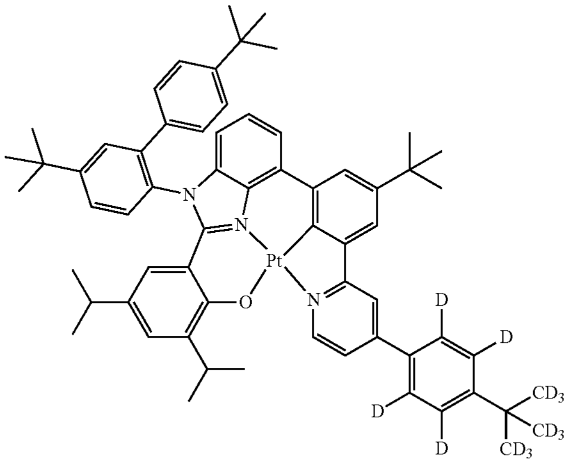
3480
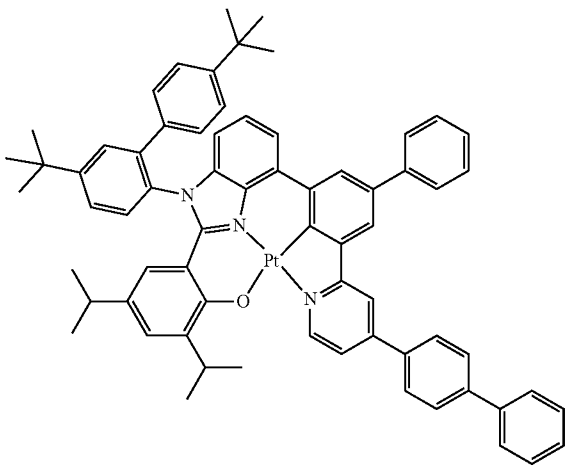
-continued
3481
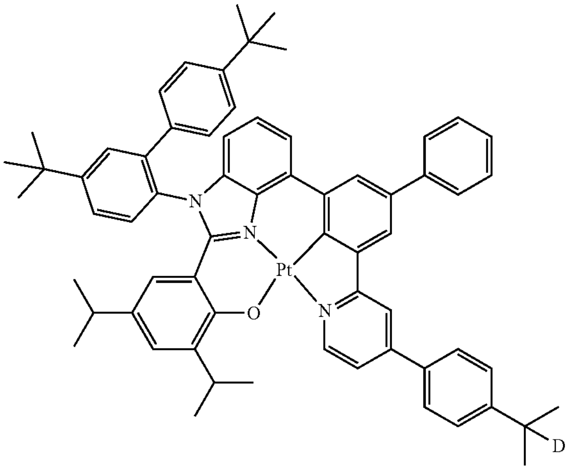
3482
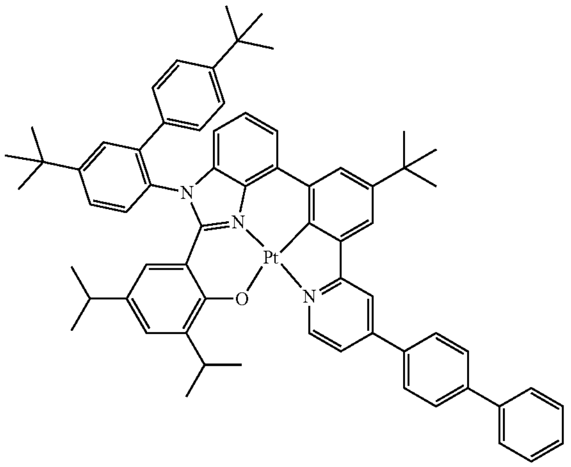
3483
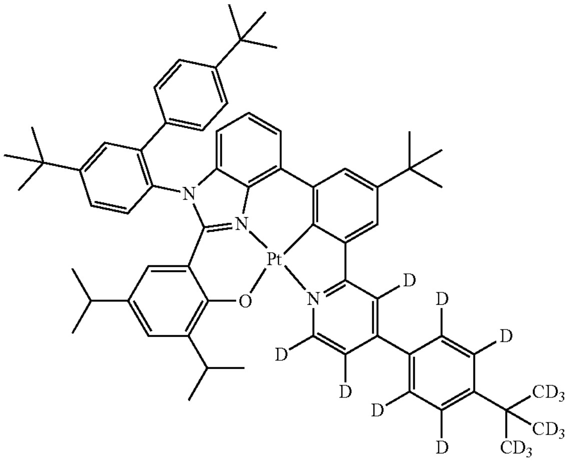

-continued
3484
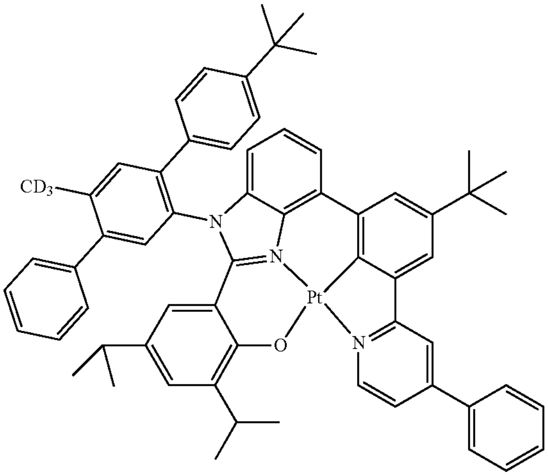
3485
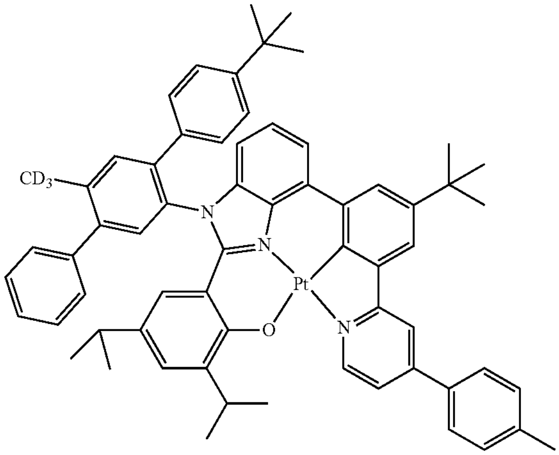
3486
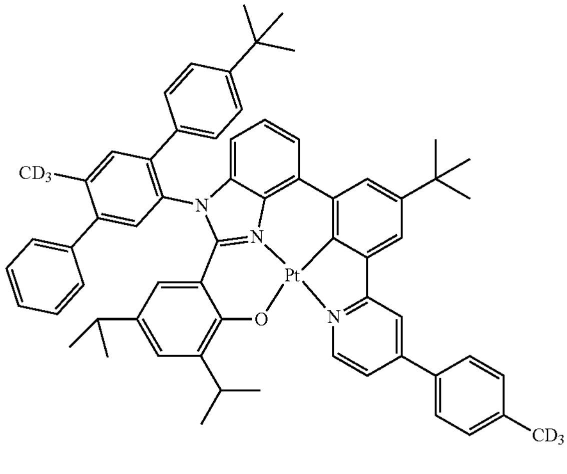
-continued
3487
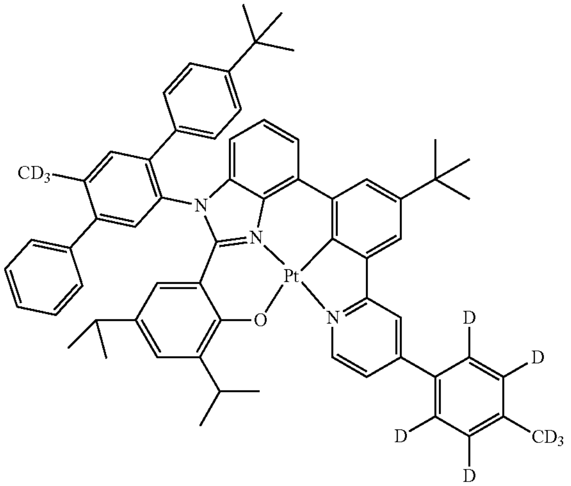
3488
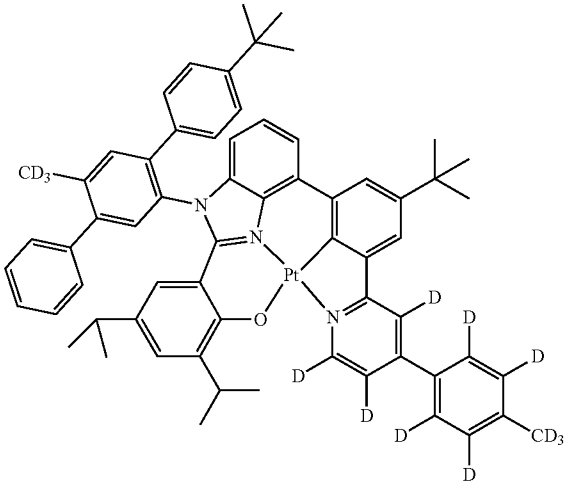
3489
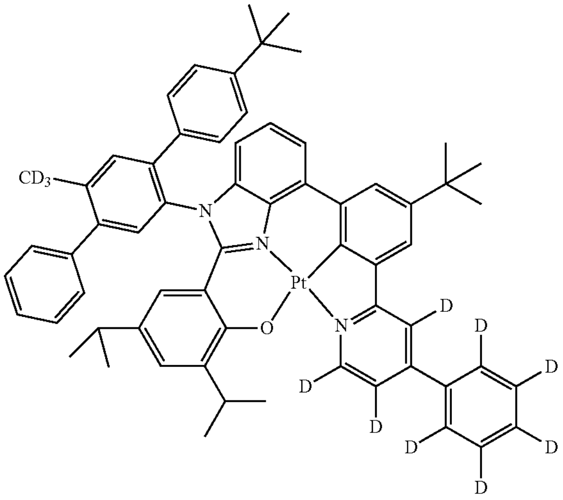

-continued
3490
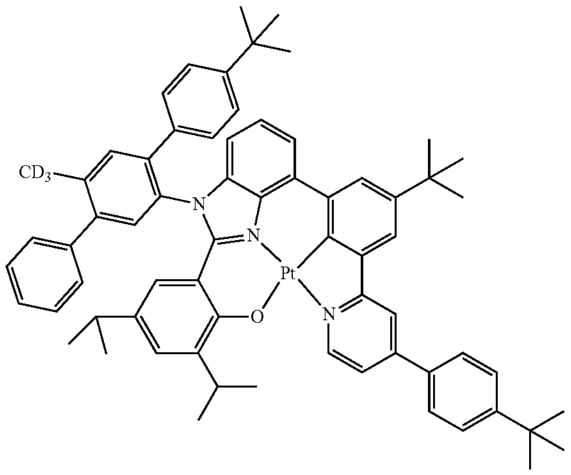
3491
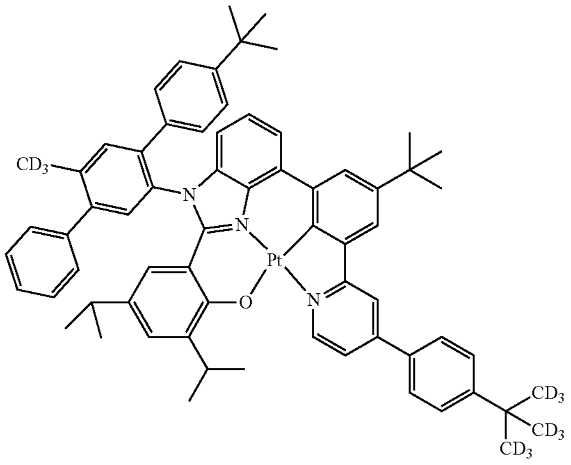
3492
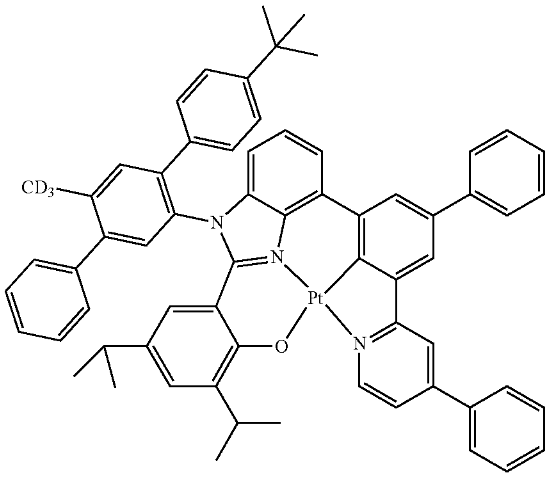
-continued
3493
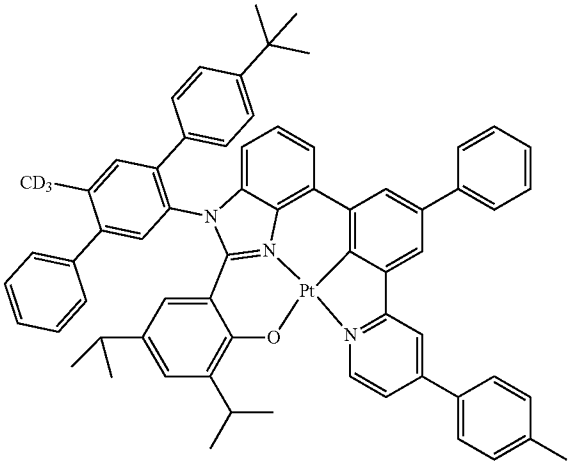
3494
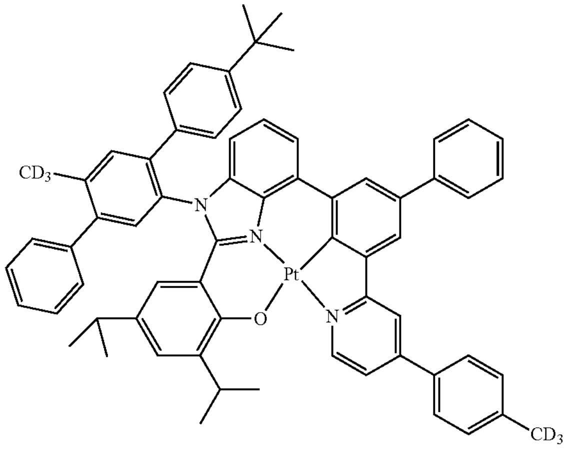
3495
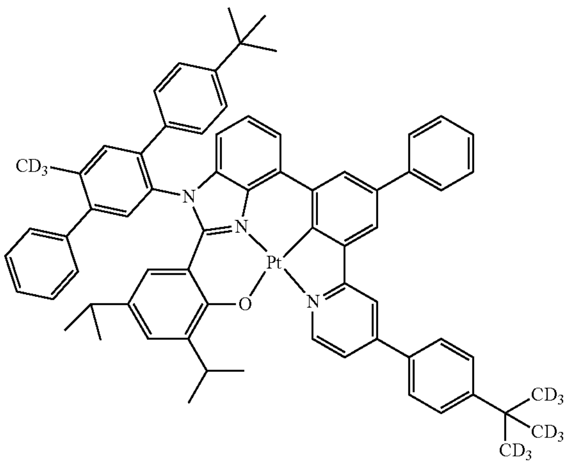

-continued
3496
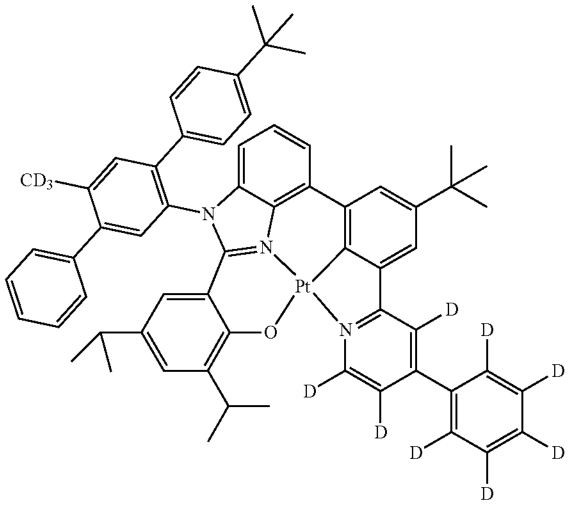
3497
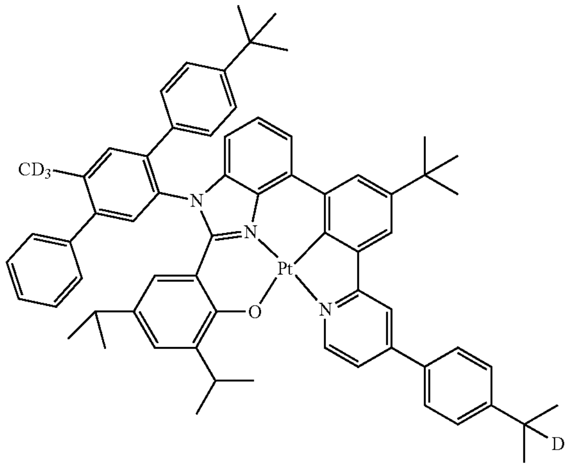
3498
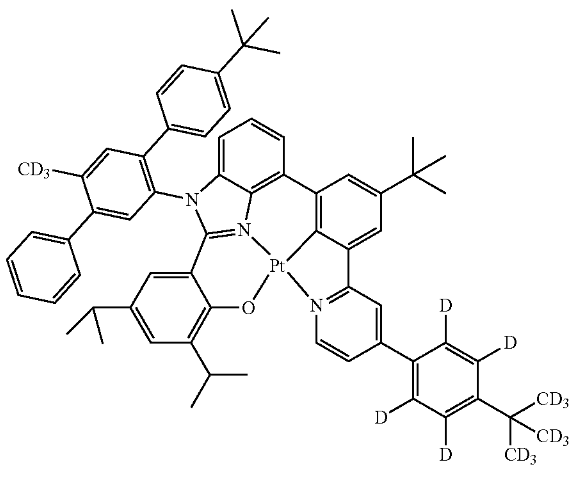
-continued
3499
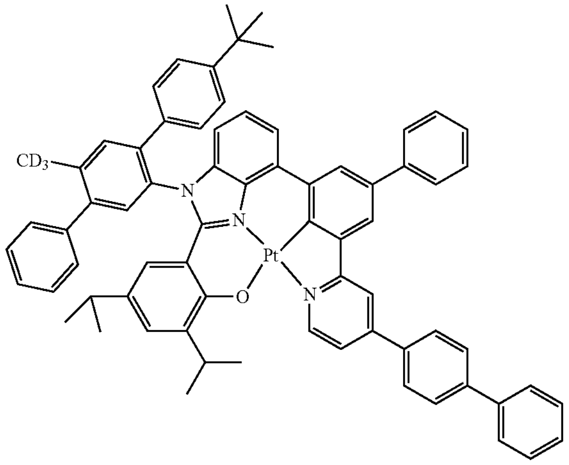
3500
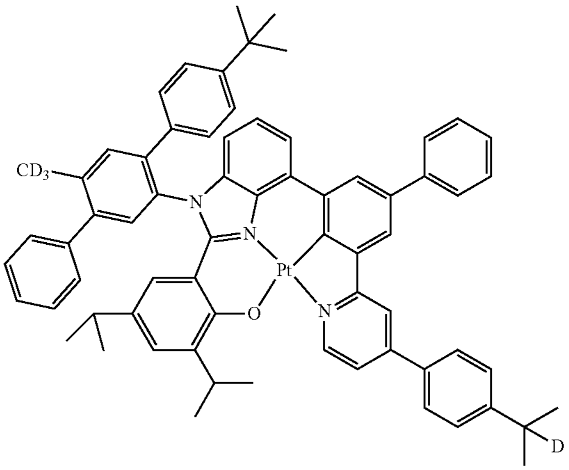
3501
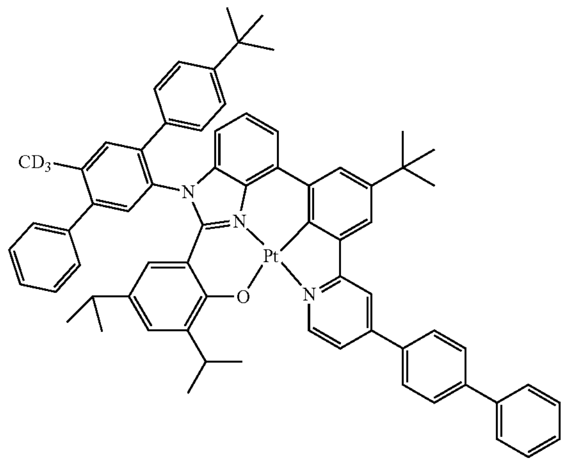

-continued
3502
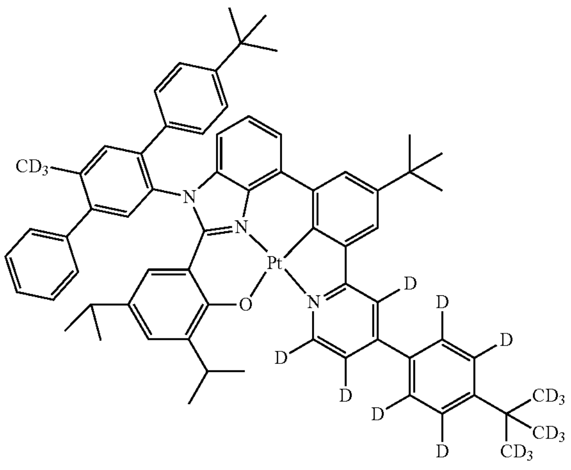
3503
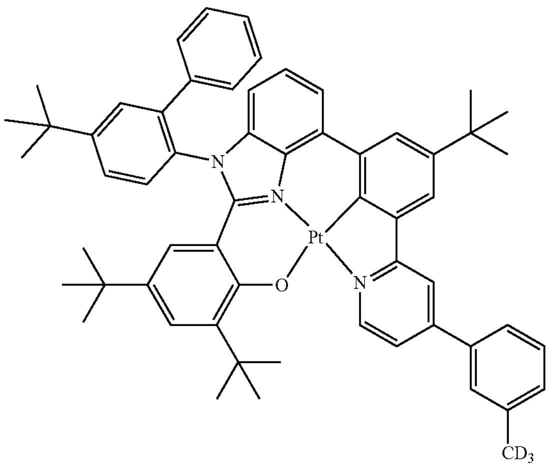
3504
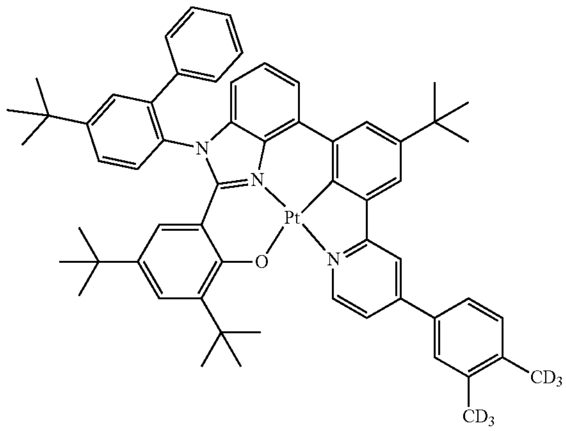
-continued
3505
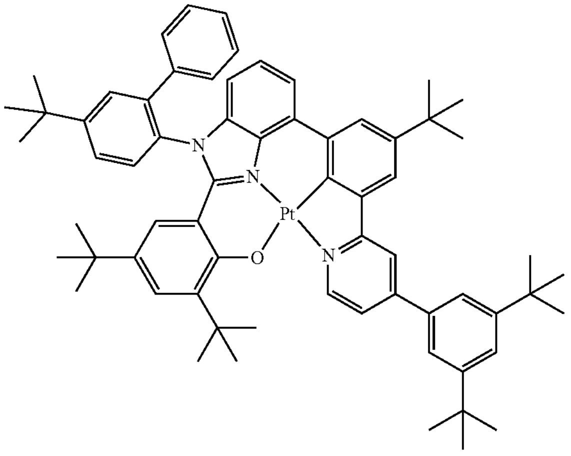
3506
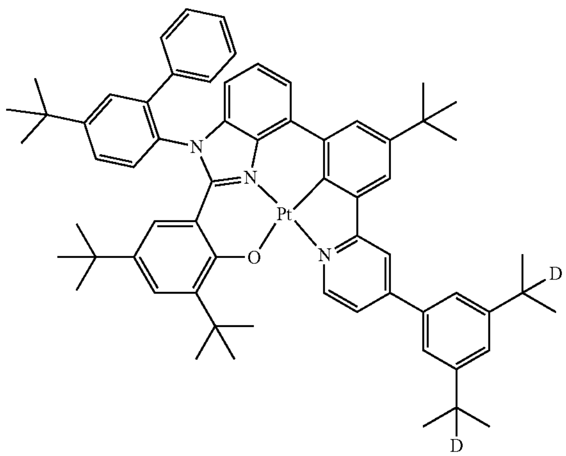
3507
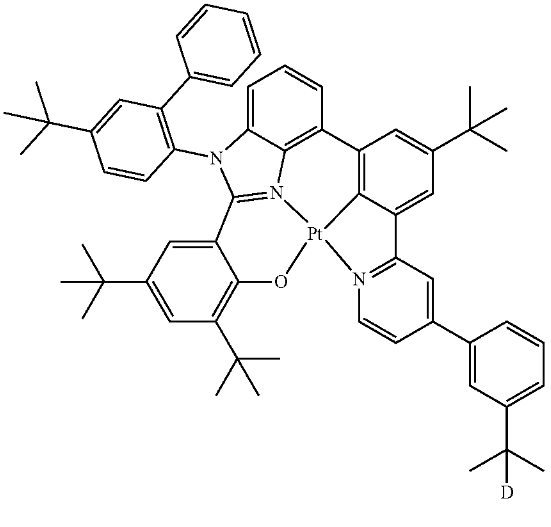

-continued
3508
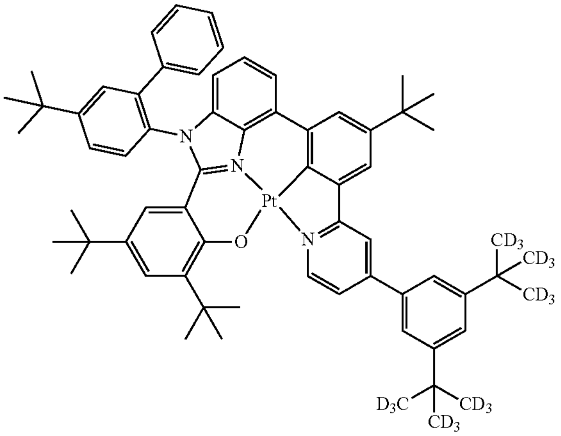
3509
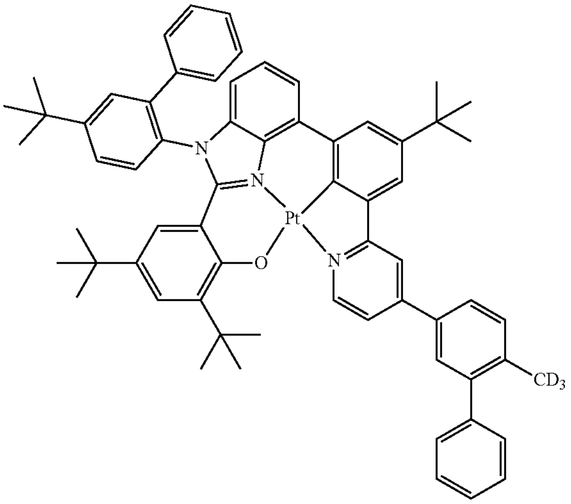
3510
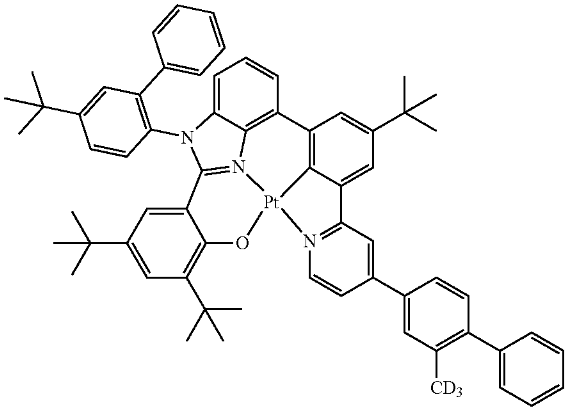
-continued
3511
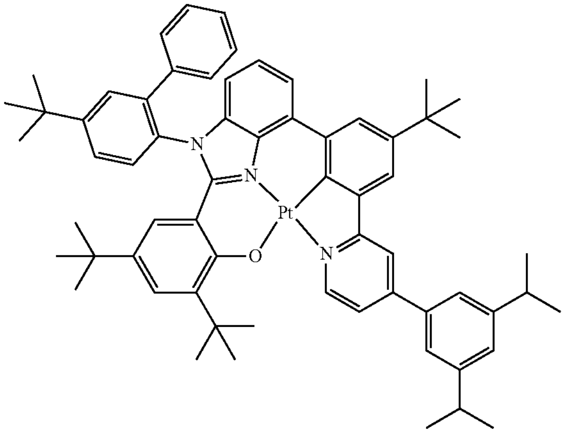
3512
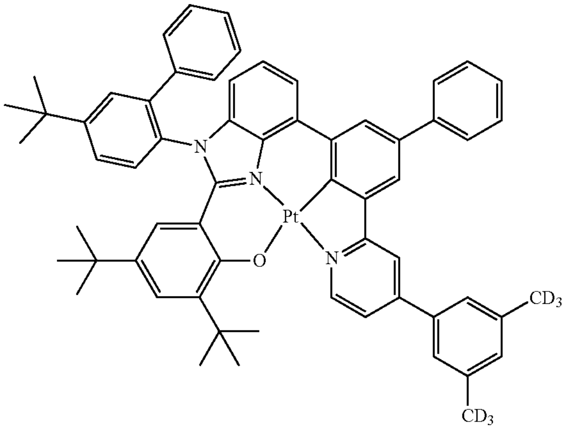
3513
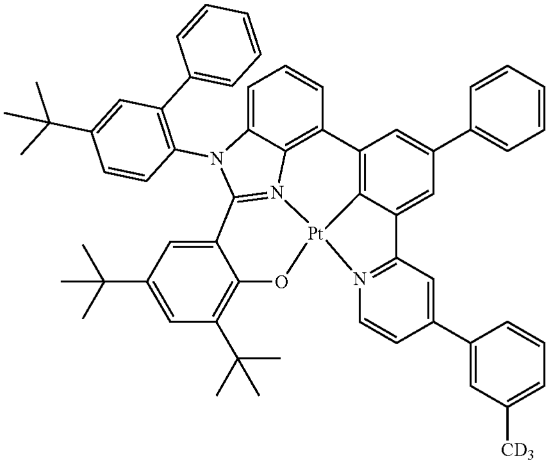

-continued
3514
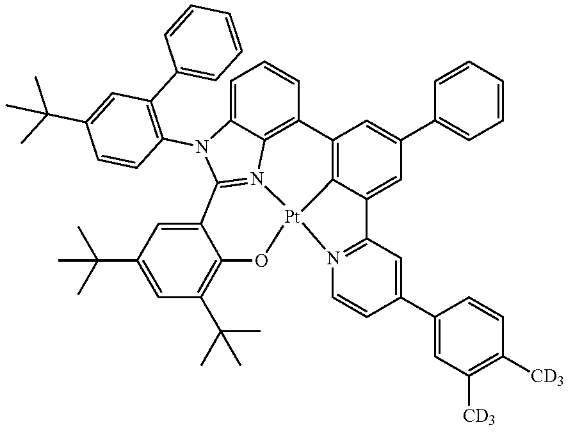
3515
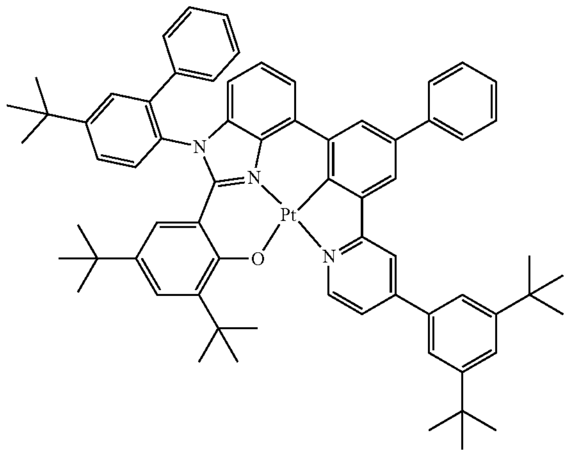
3516
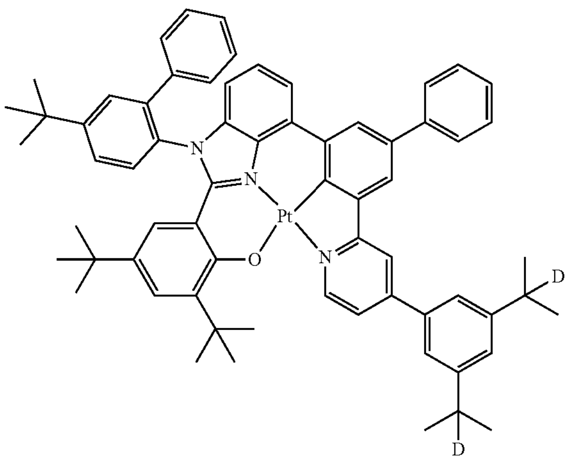
-continued
3517
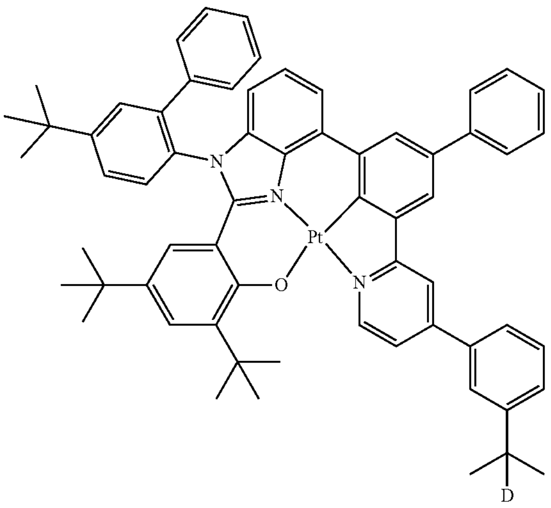
3518
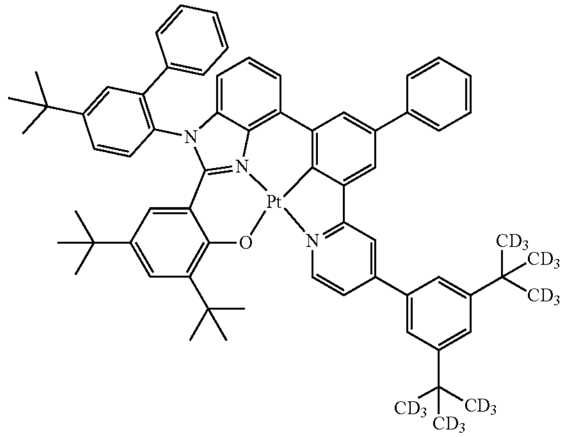
3519
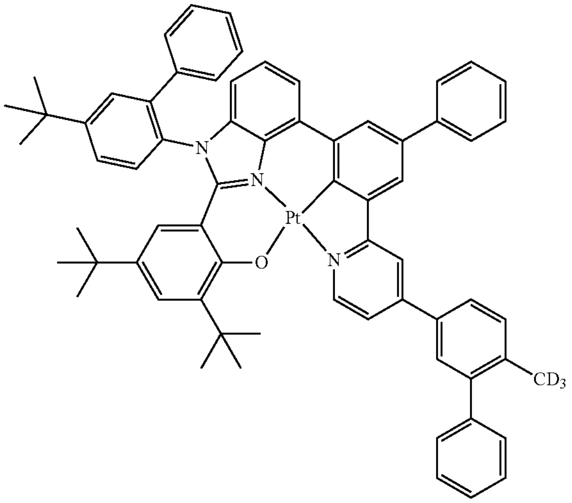

-continued
3520
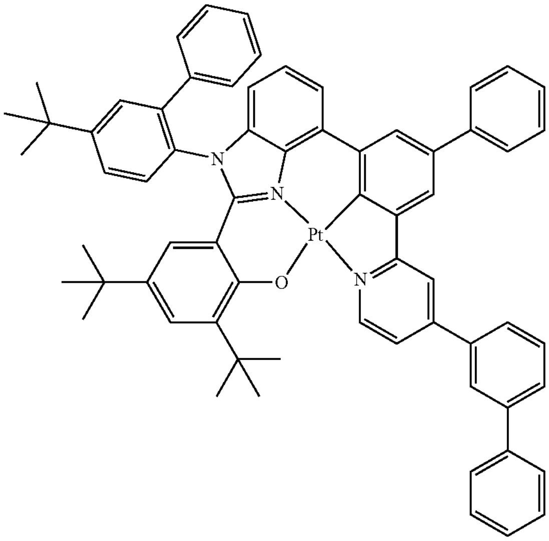
3521
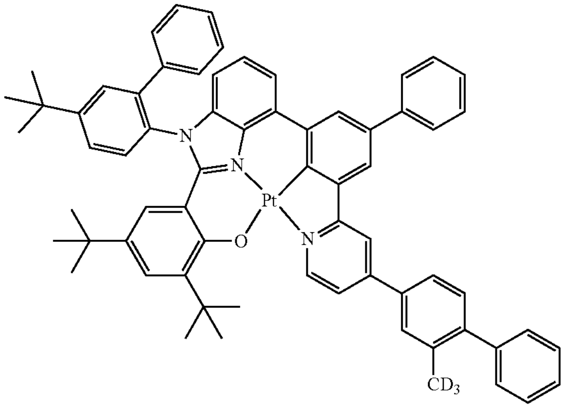
3522
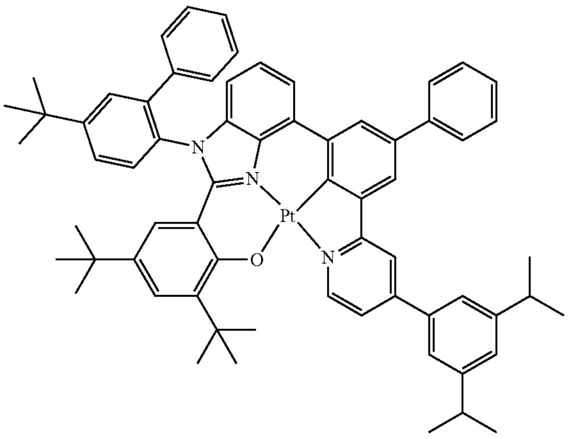
-continued
3523
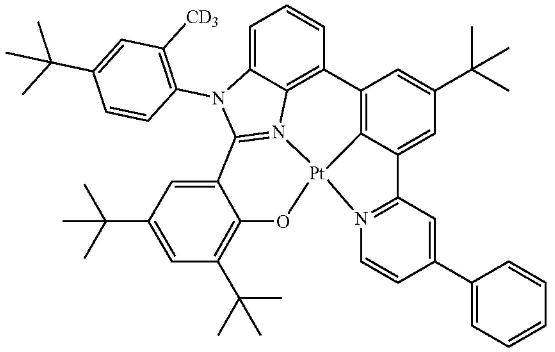
3524
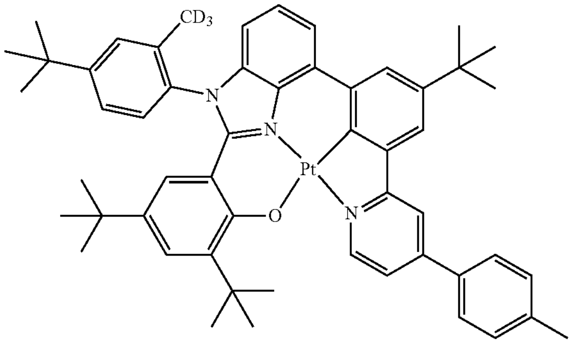
3525
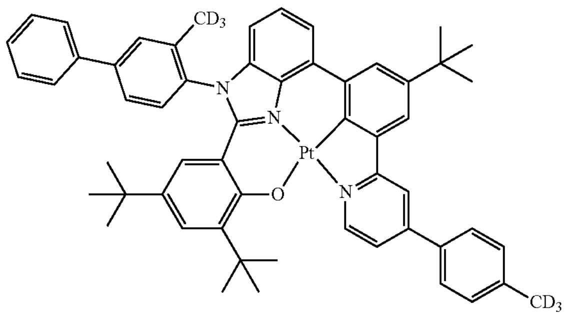
3526
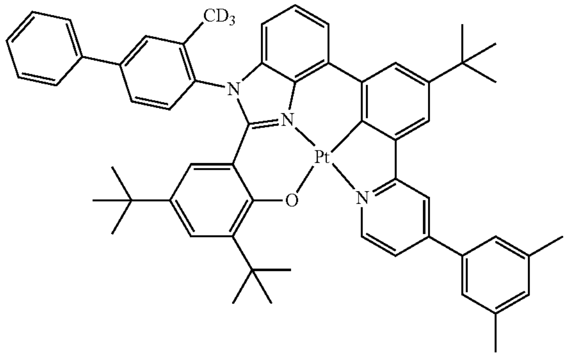

-continued
3527
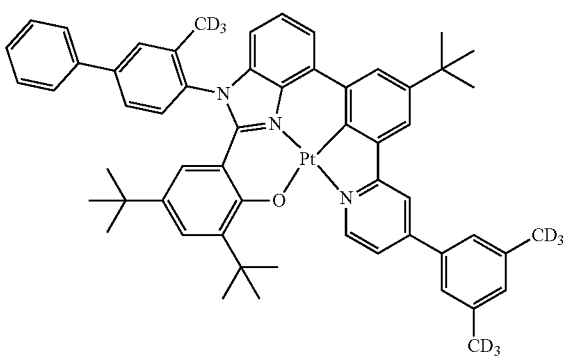
3528
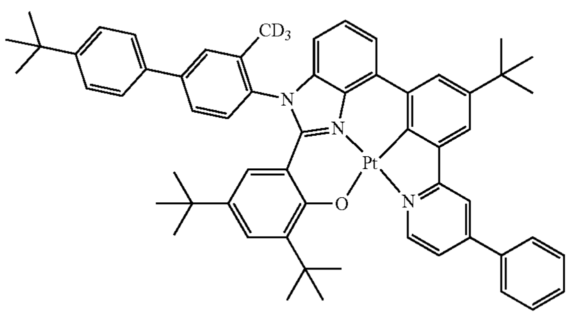
3529
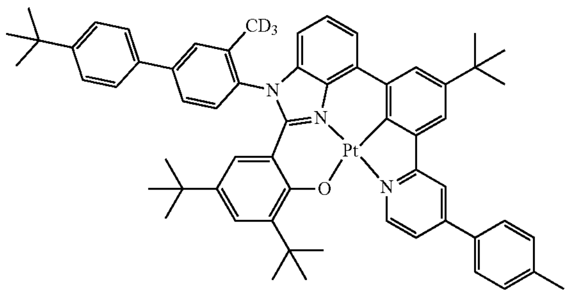
3530
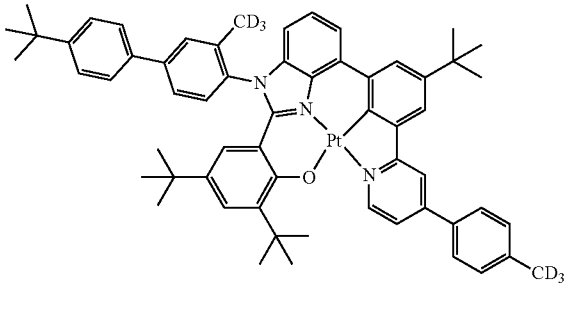
-continued
3531
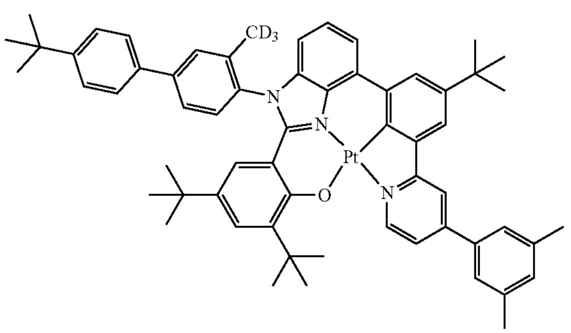
3532
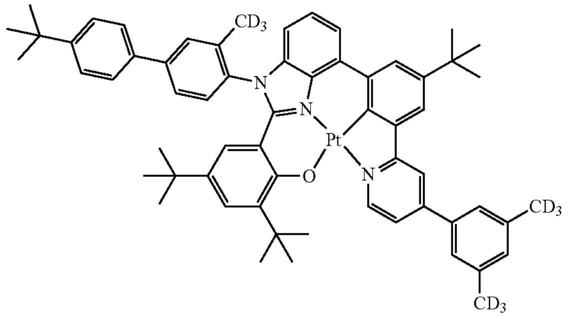
3533
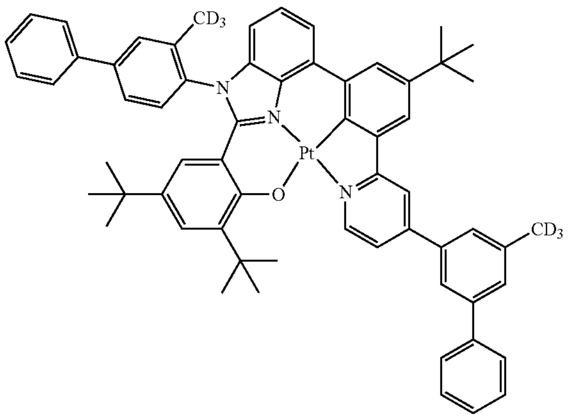
3534
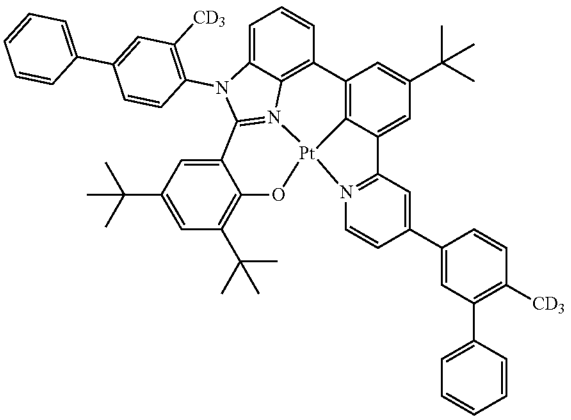

-continued
3535
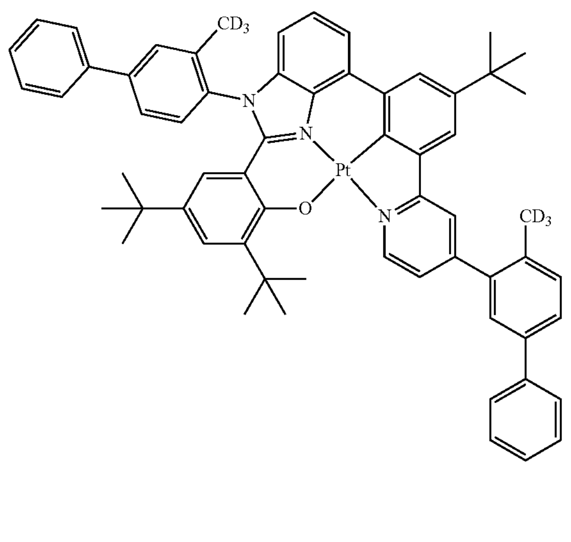
3536
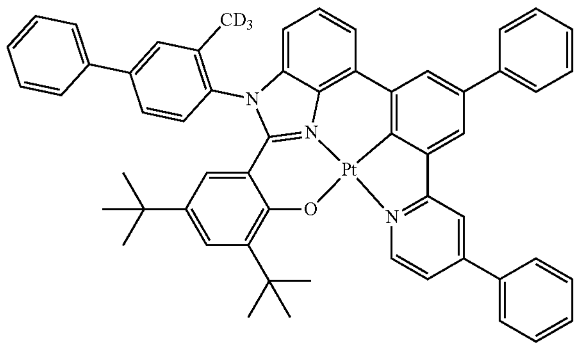
3537
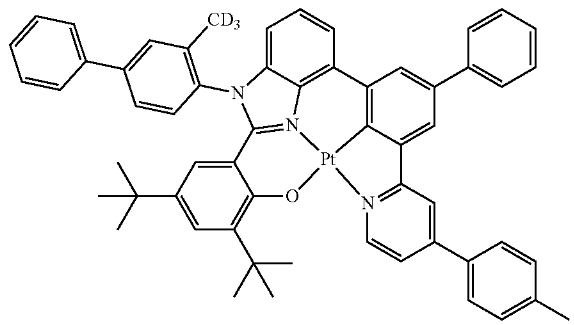
3538
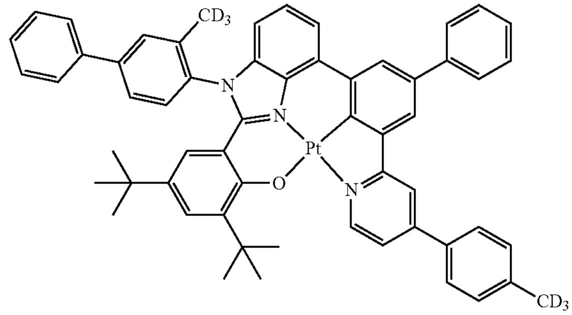
3539
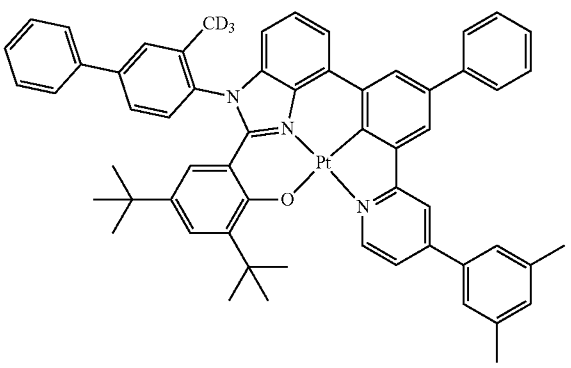
3540
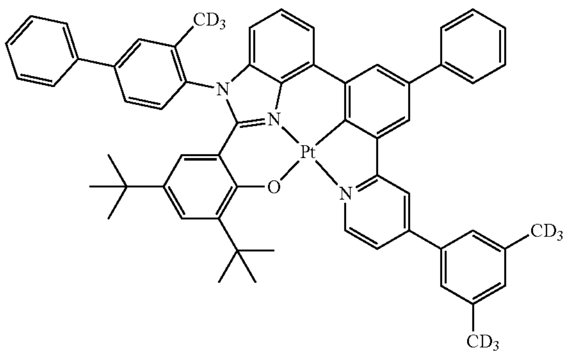
3541
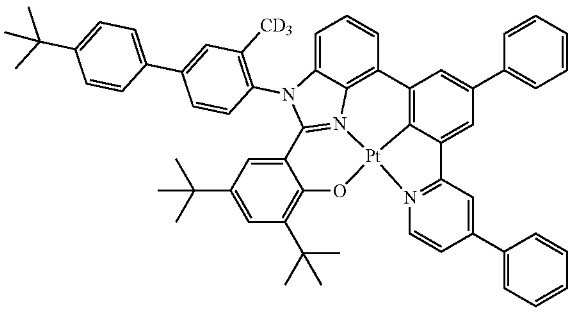
3542
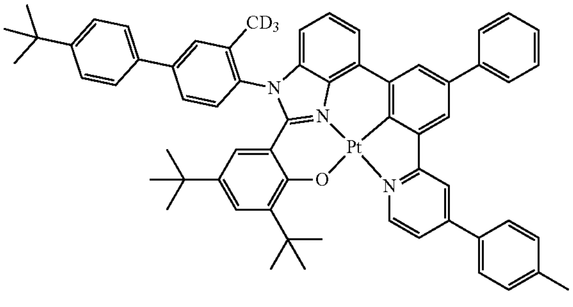

-continued
3543
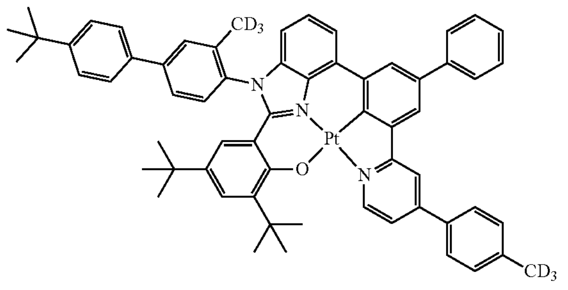
3544
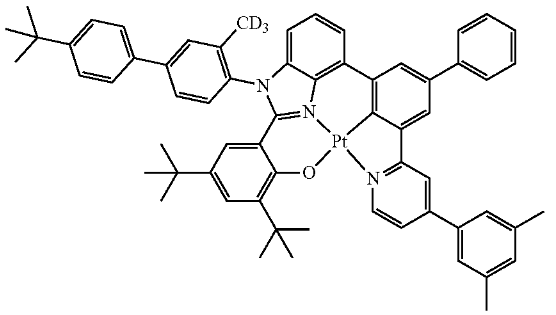
3545
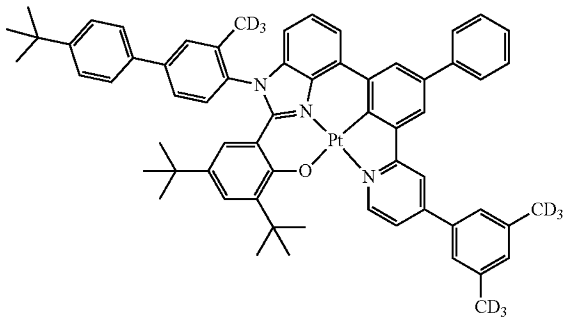
3546
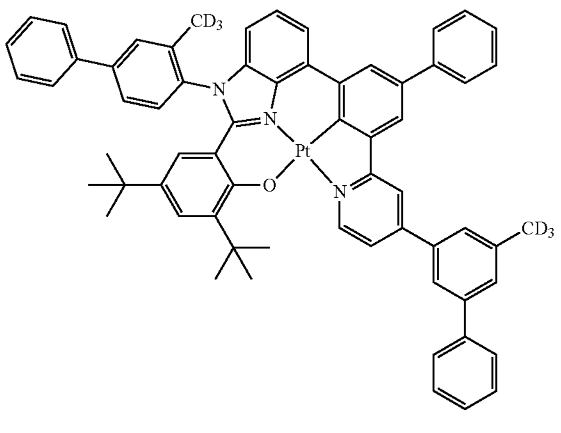
-continued
3547
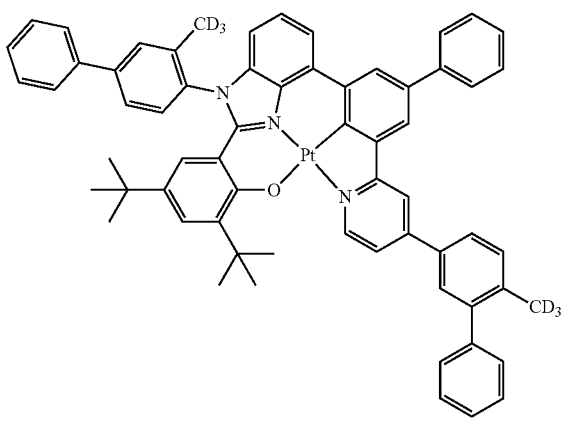
3548
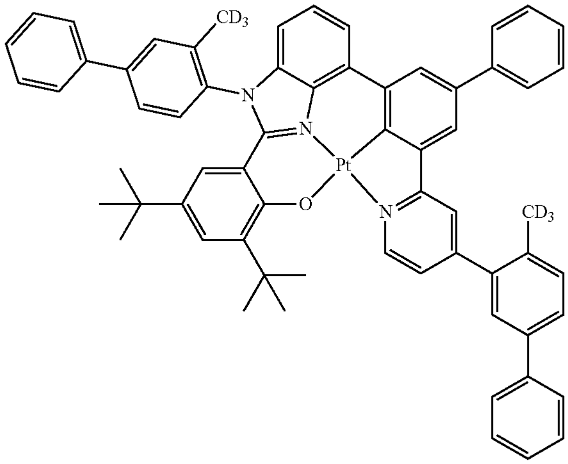
3549
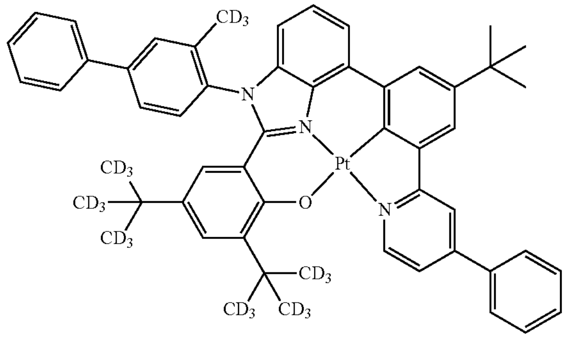
3550
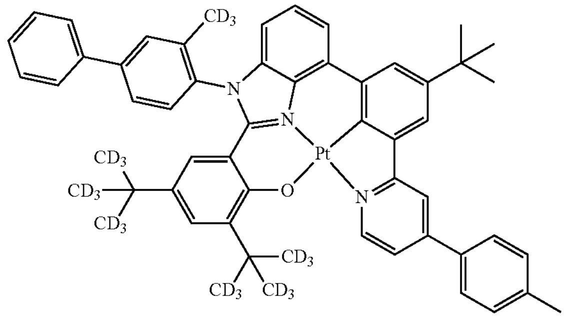

3551
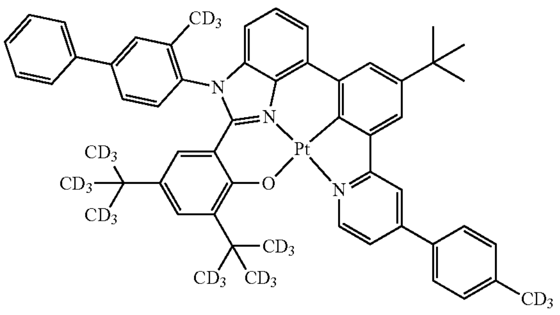
3552
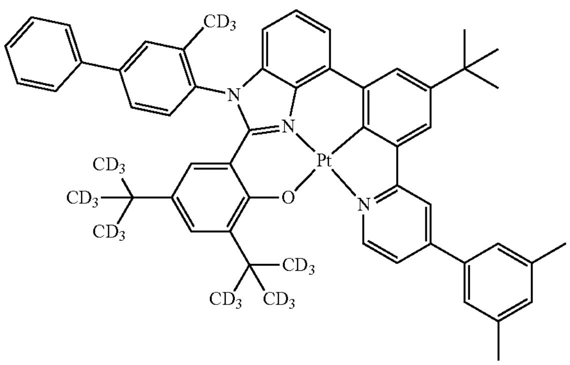
3553
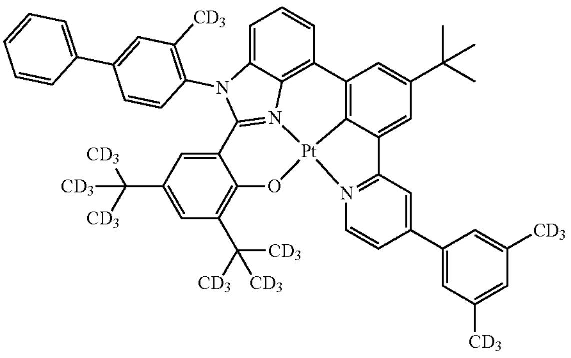
3554
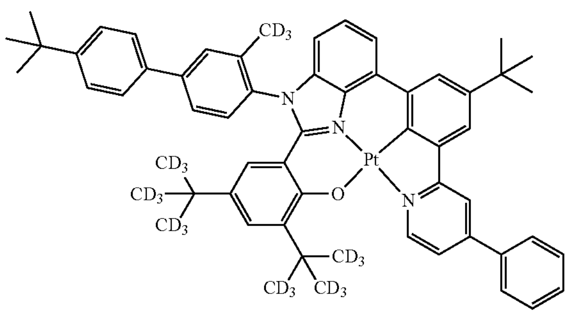
3555
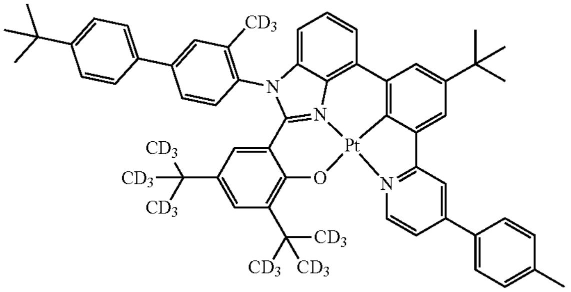
3556
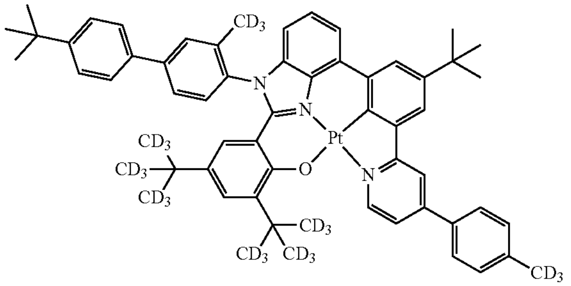
3557
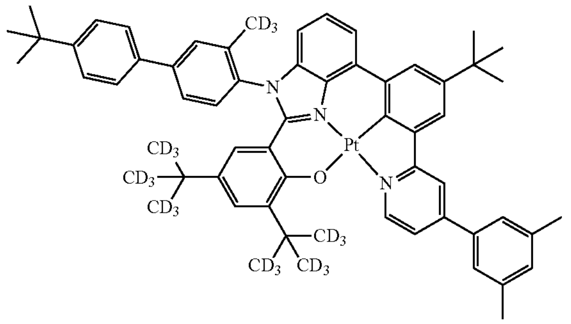
3558
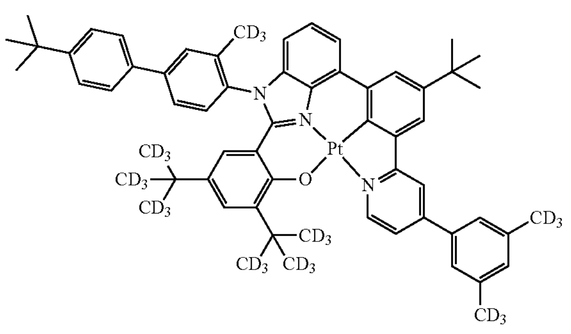

-continued
3559
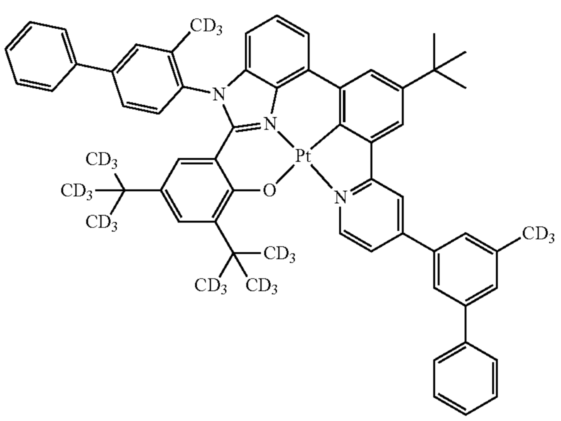
3560
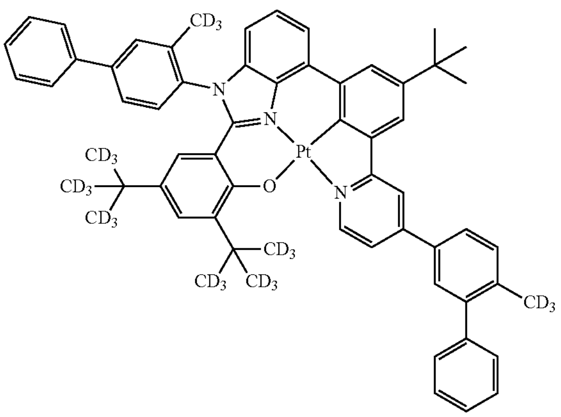
3561
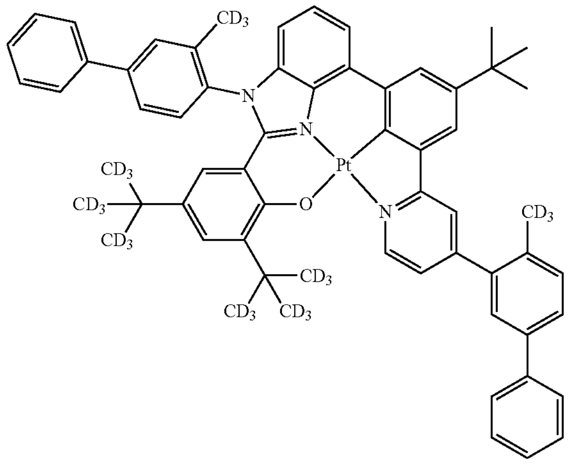
-continued
3562
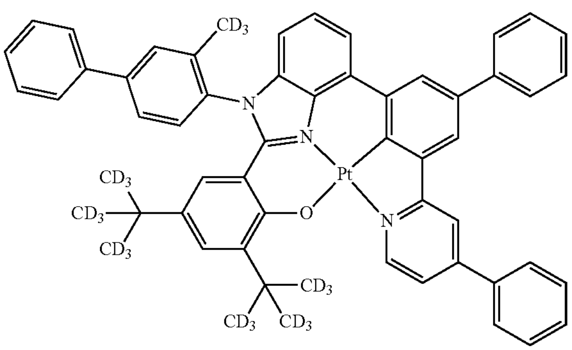
3563
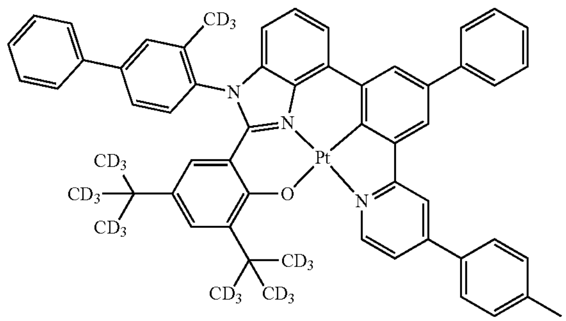
3564
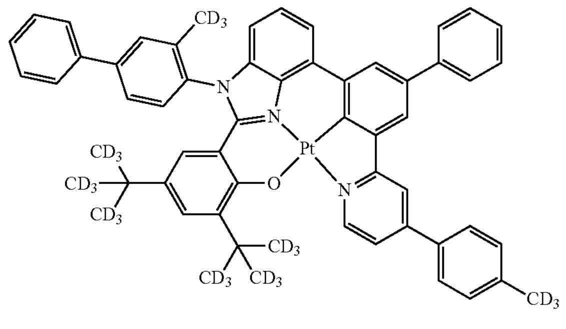
3565
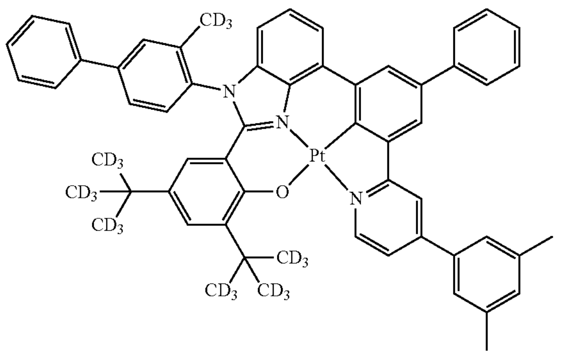

-continued
3566
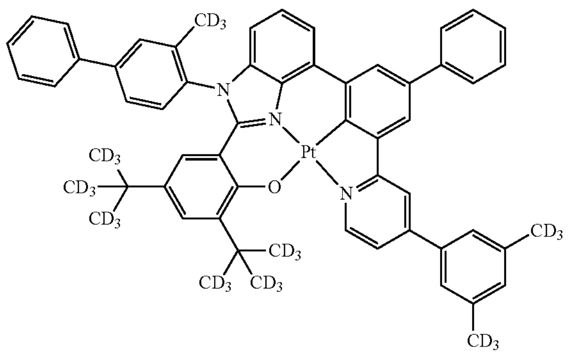
3567
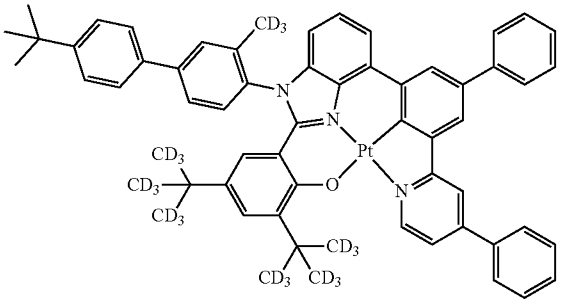
3568
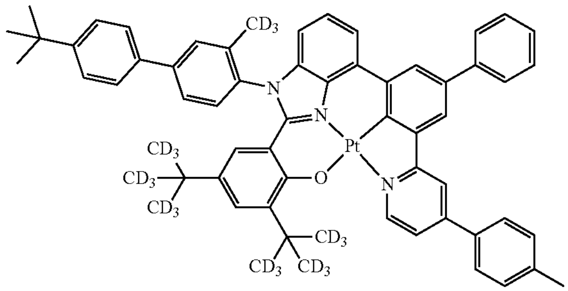
3569
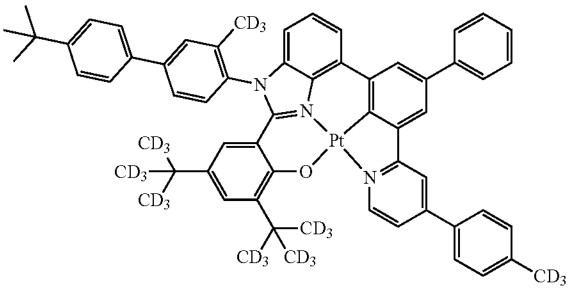
-continued
3570
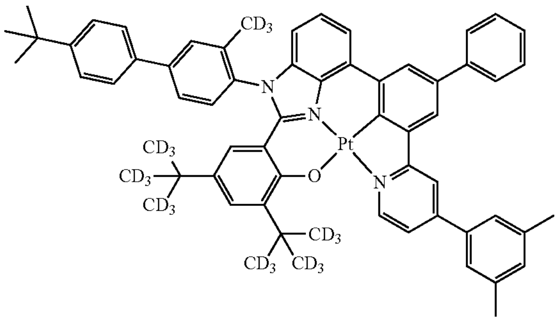
3571
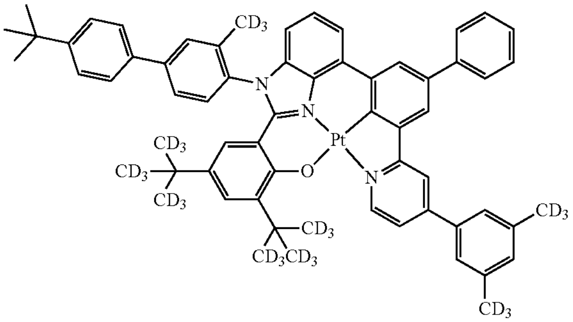
3572
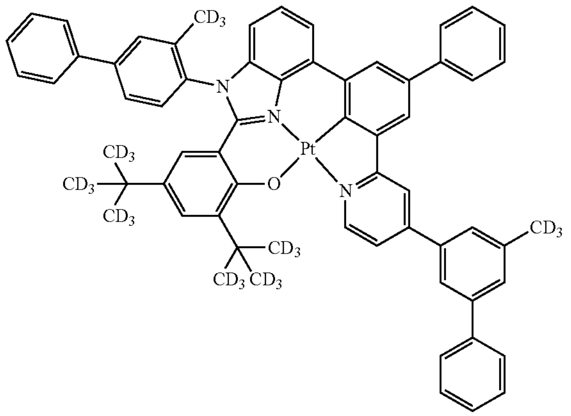
3573
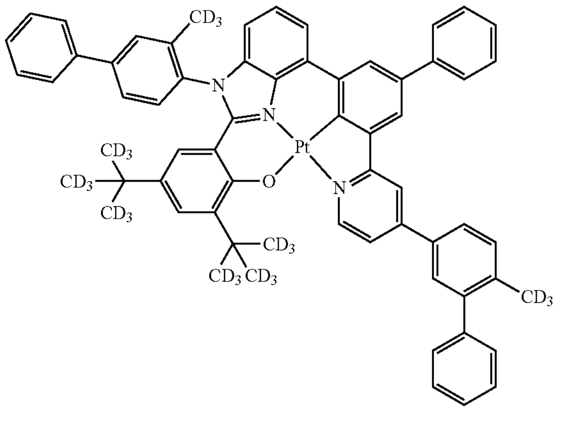

-continued
3574
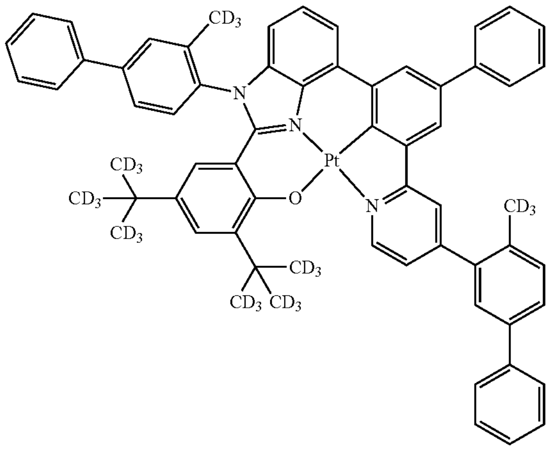
3575
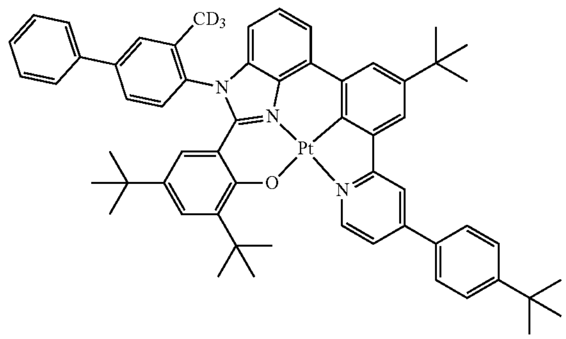
3576
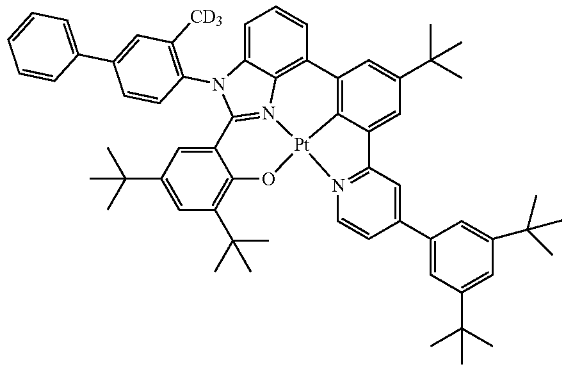
3577
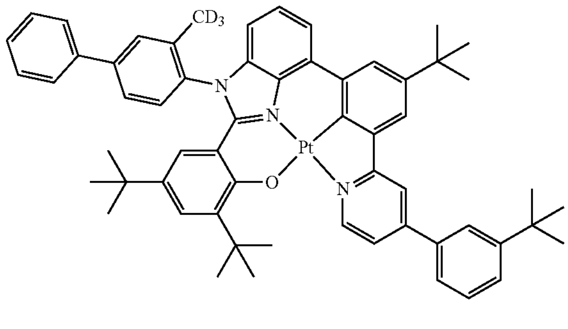
-continued
3578
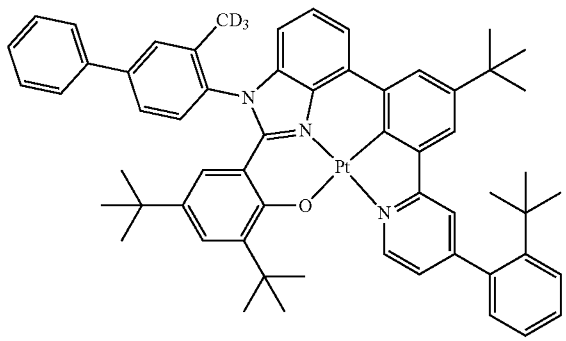
3579
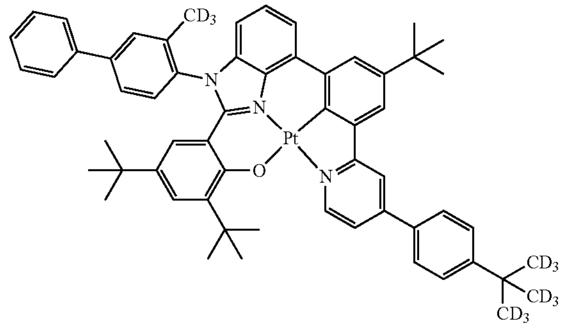
3580
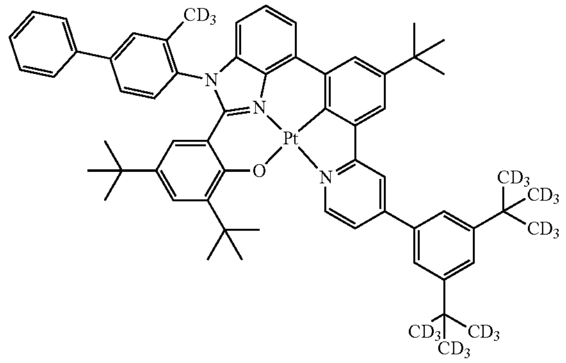
3581
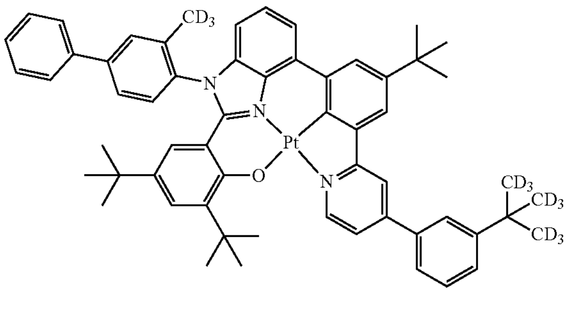

-continued
3582
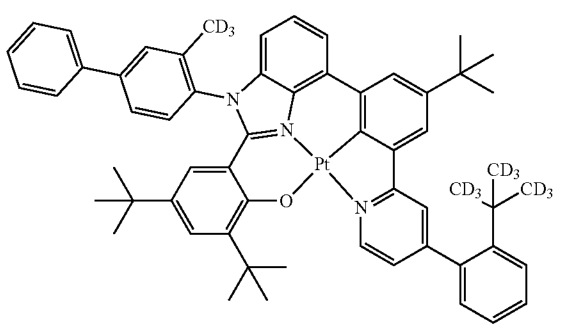
3583
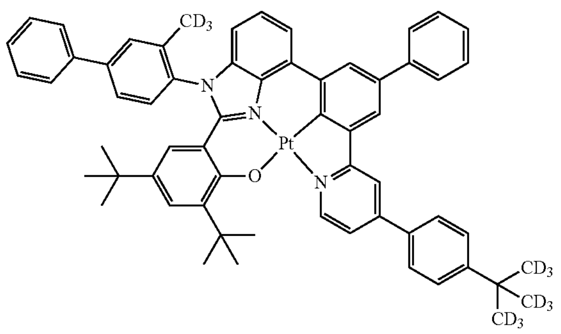
3584
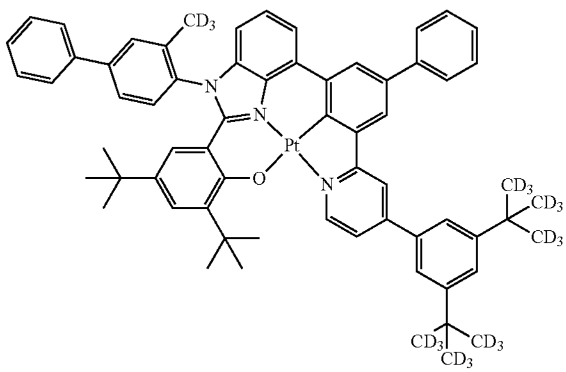
3585
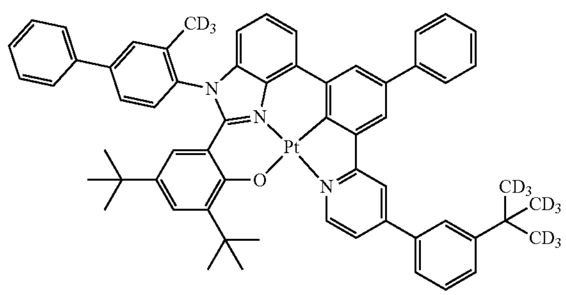
-continued
3586
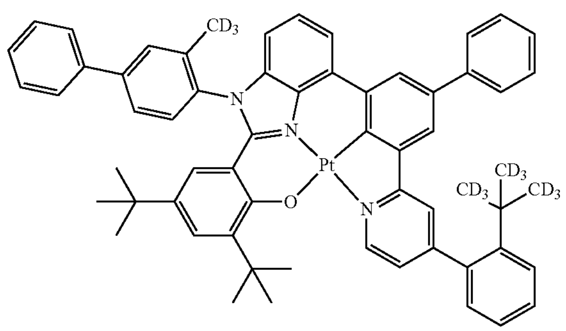
3587
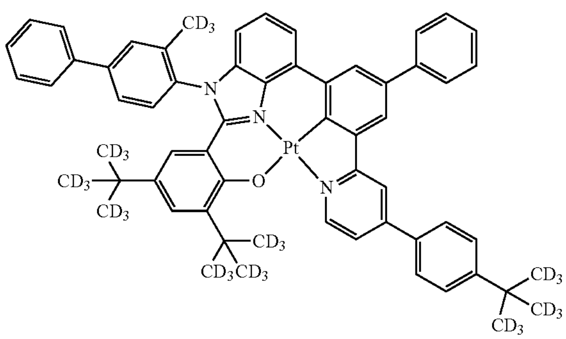
3588
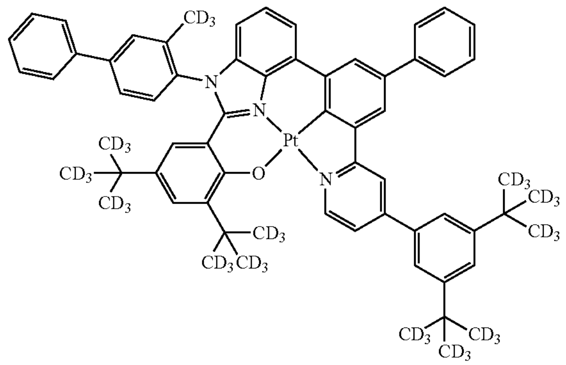
3589
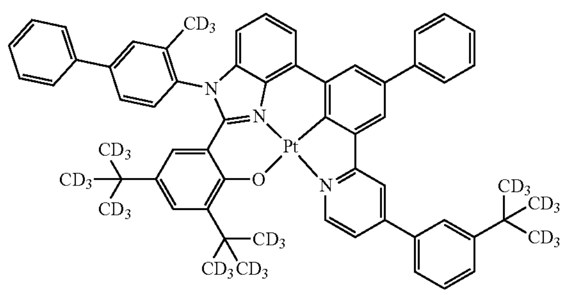

-continued
3590
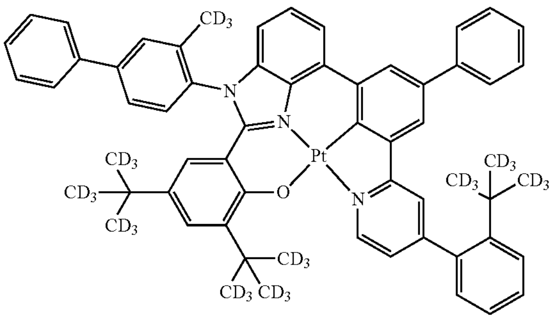
3591
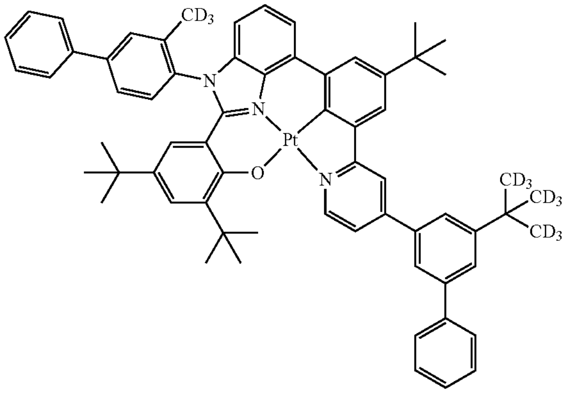
3592
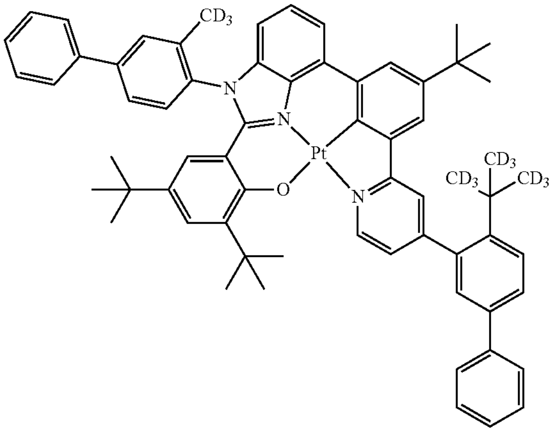
3593
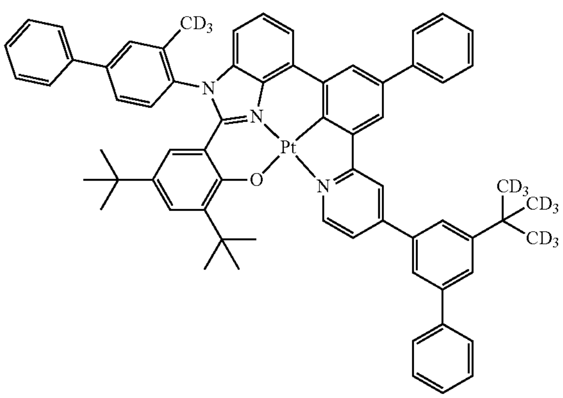
-continued
3594
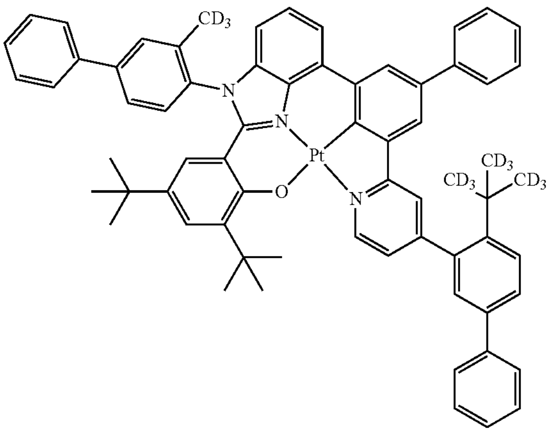
3595
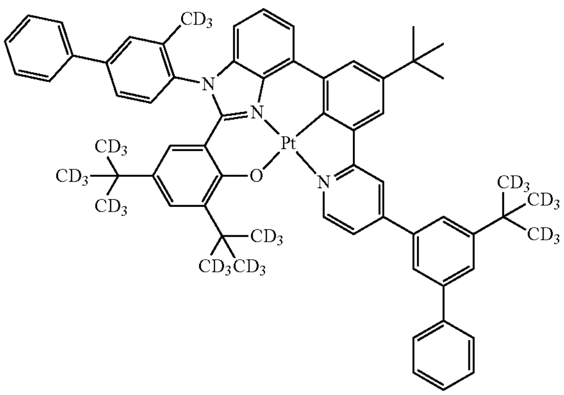
3596
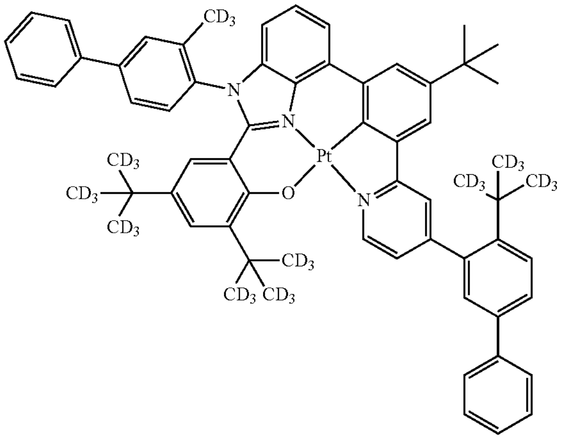

-continued
3597
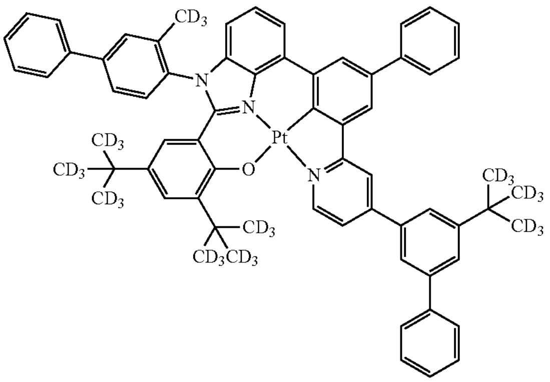
3598
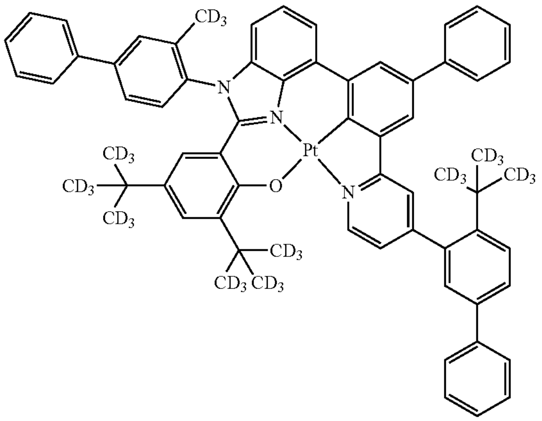
3599
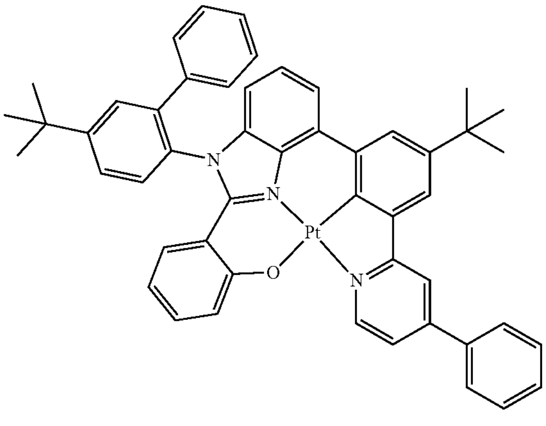
Group 1-3
1
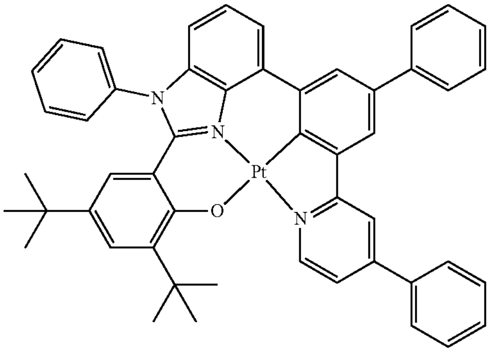
2
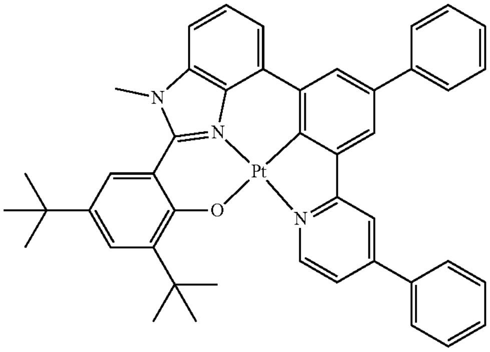
3
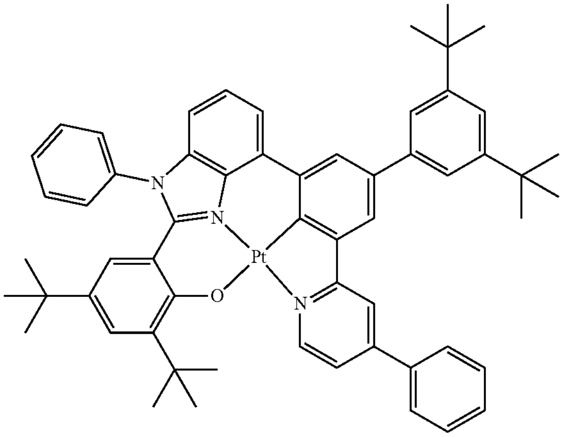
4
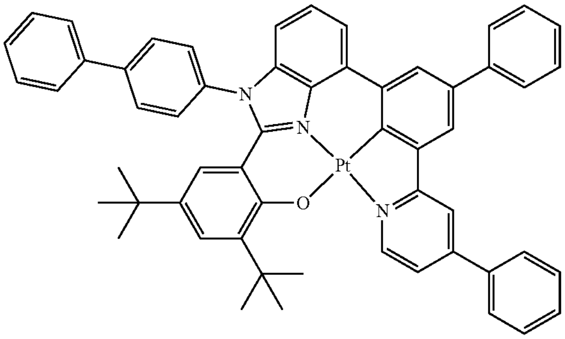

-continued
5
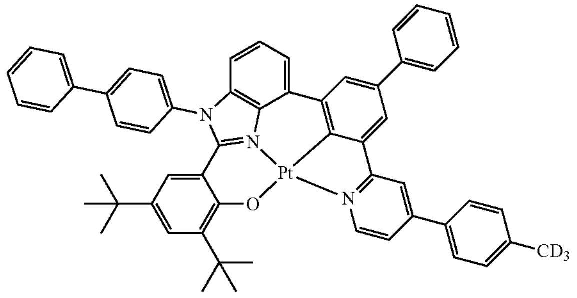
6
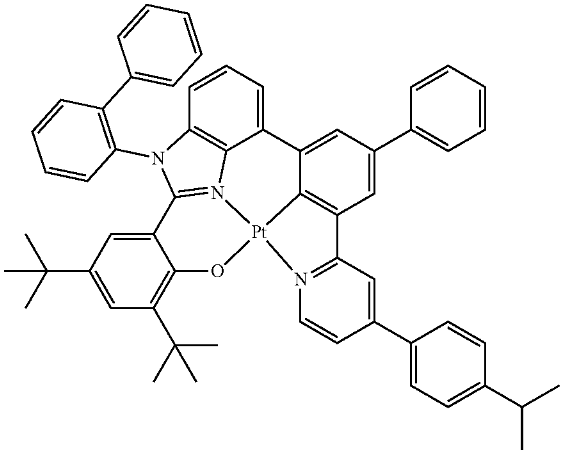
7
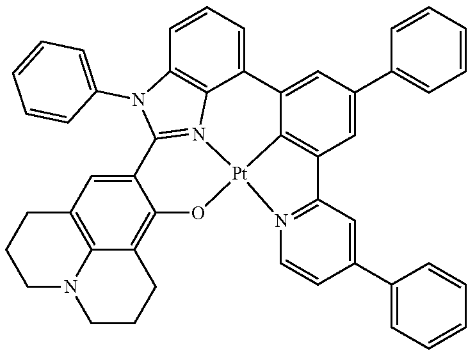
8
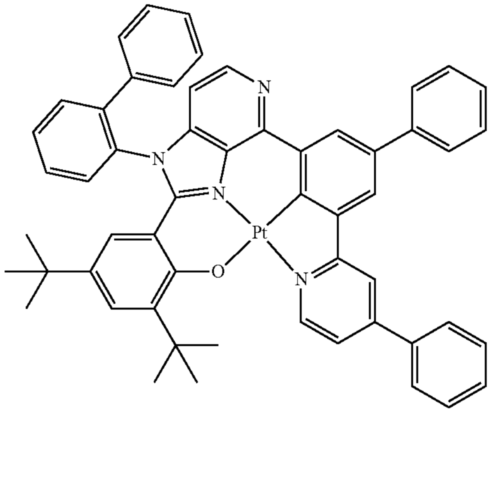
-continued
9
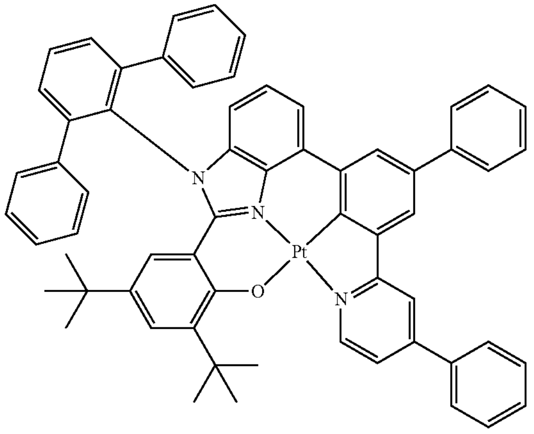
10
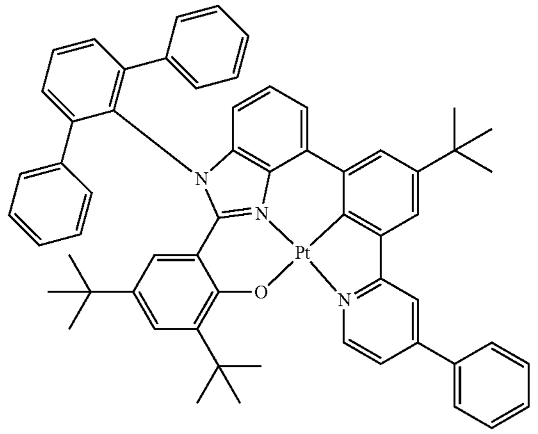
11
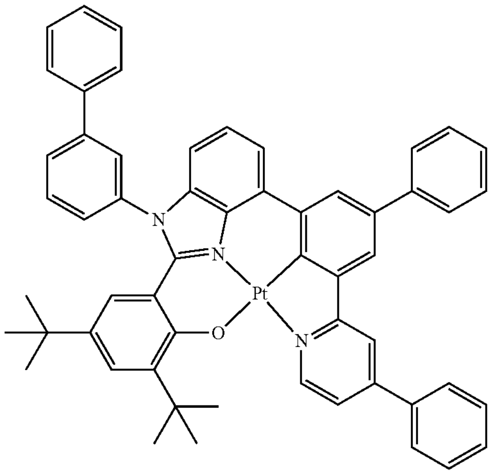

-continued
12
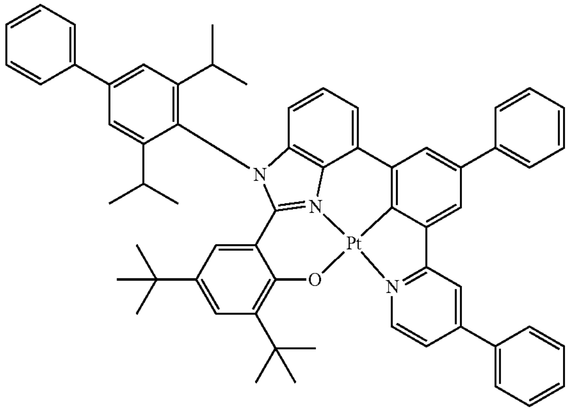
13
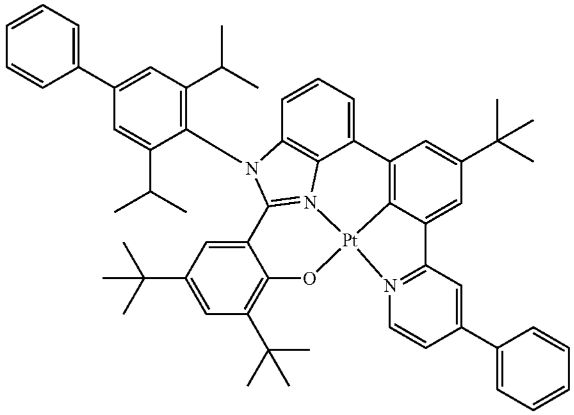
14
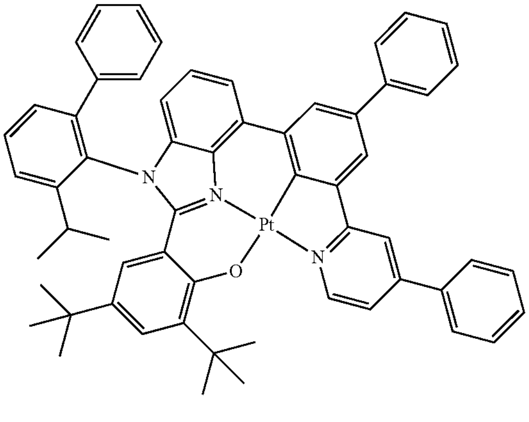
-continued
15
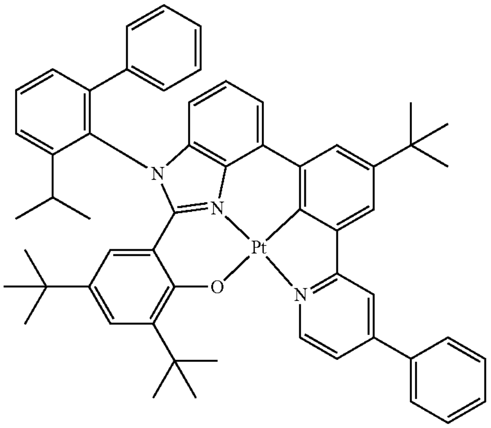
16
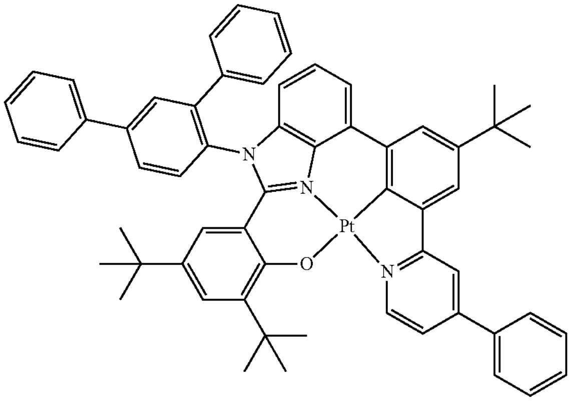
17
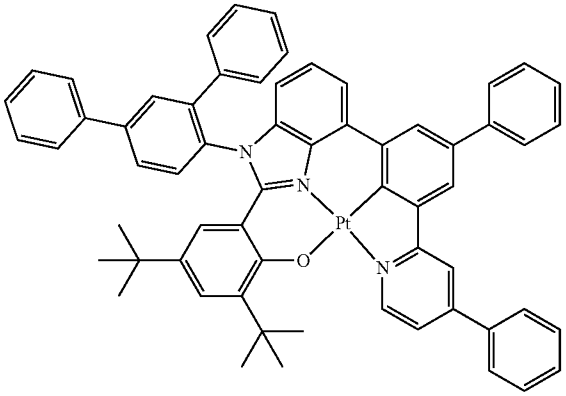

-continued
18
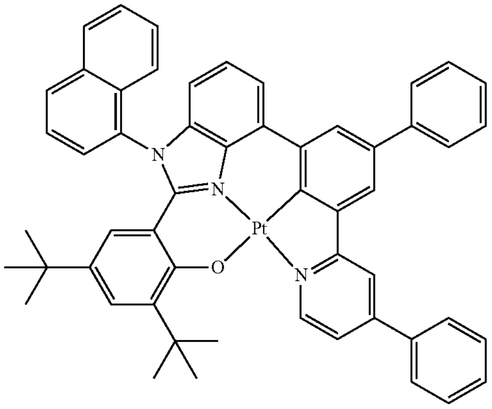
19
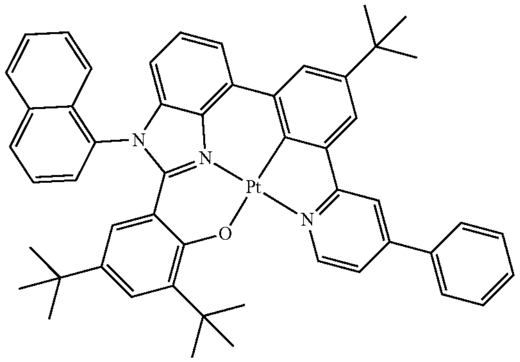
20
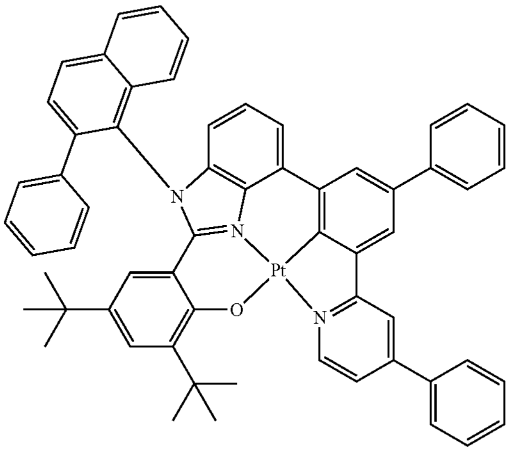
-continued
21
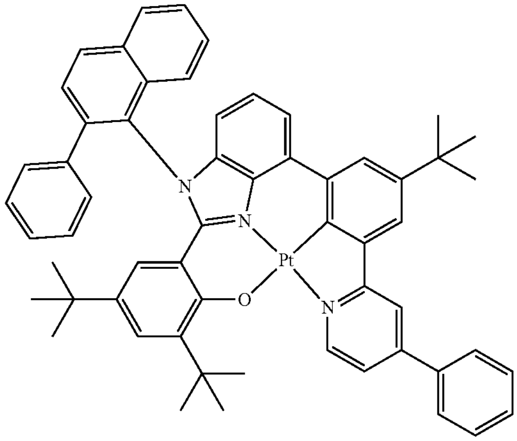
22
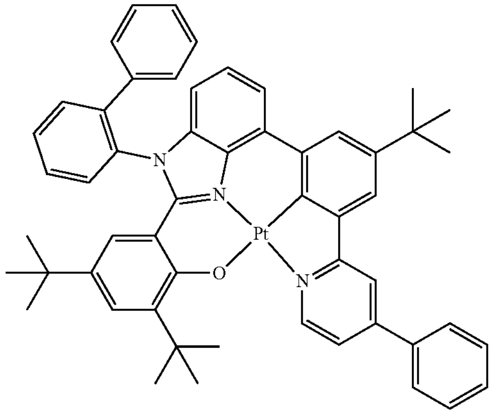
23
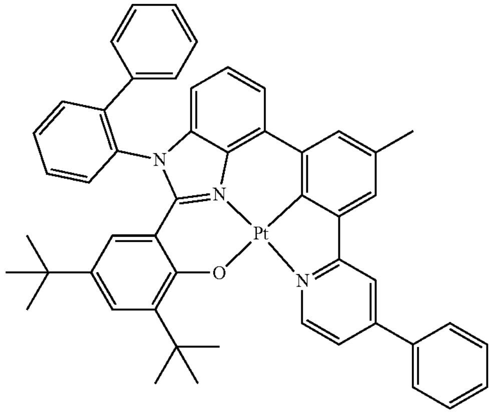

-continued
24
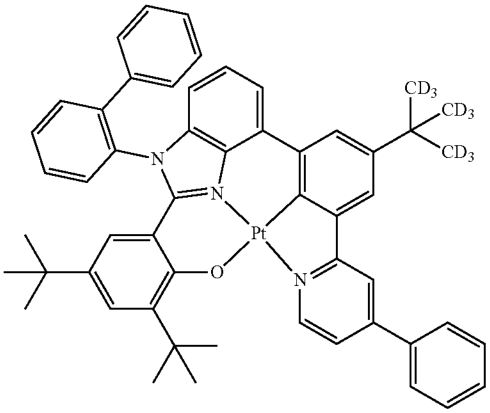
25
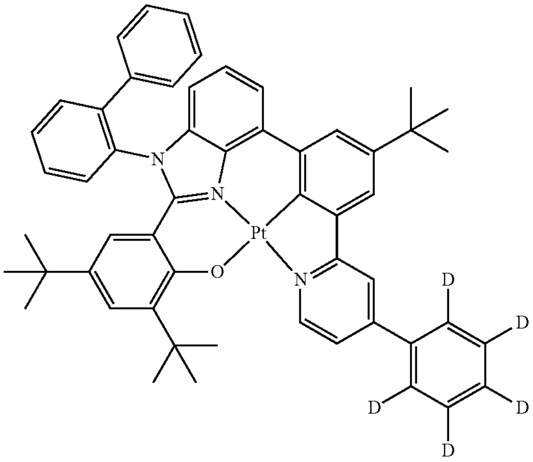
26
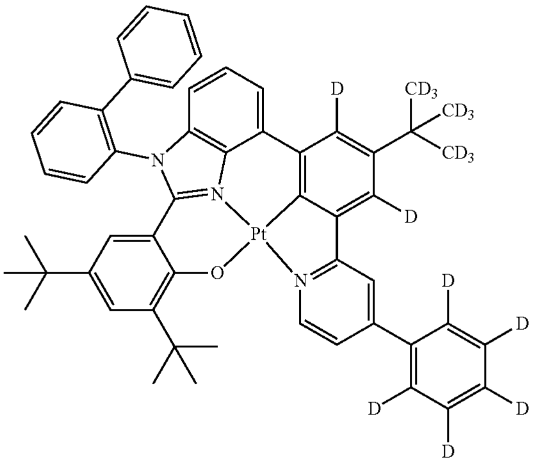
-continued
27
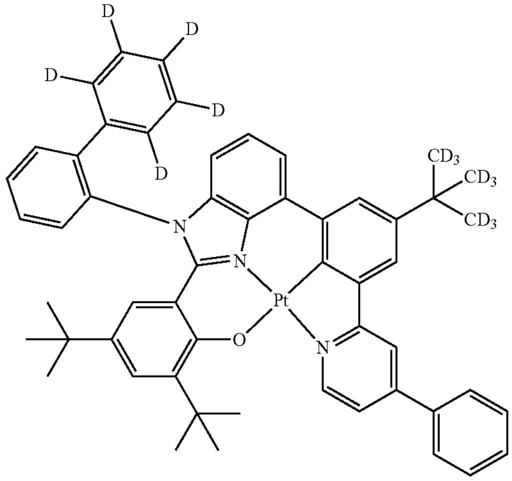
28
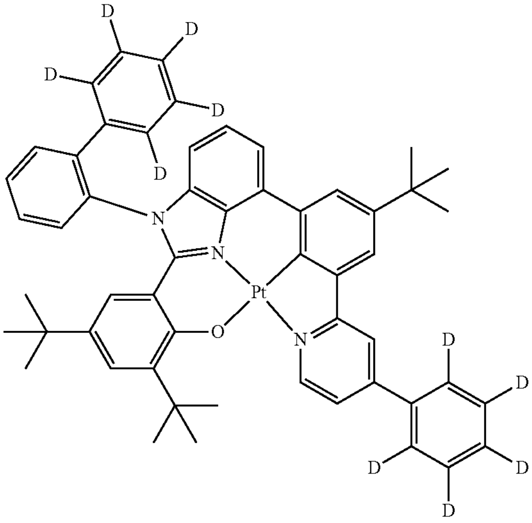
29
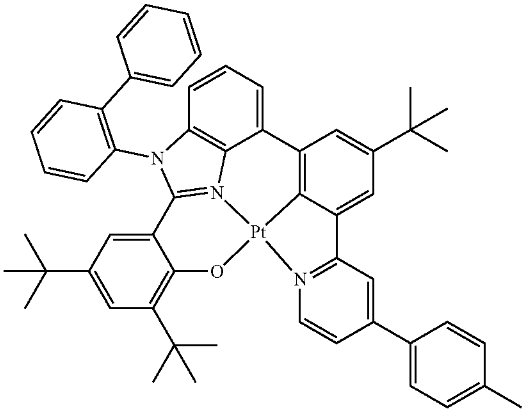

30
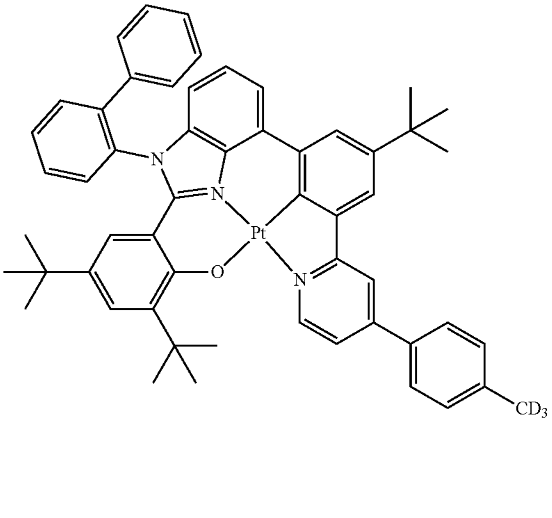
31
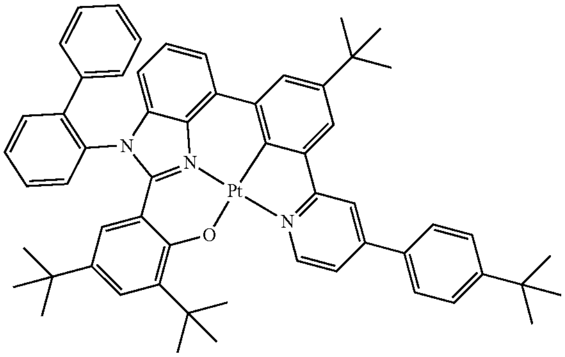
32
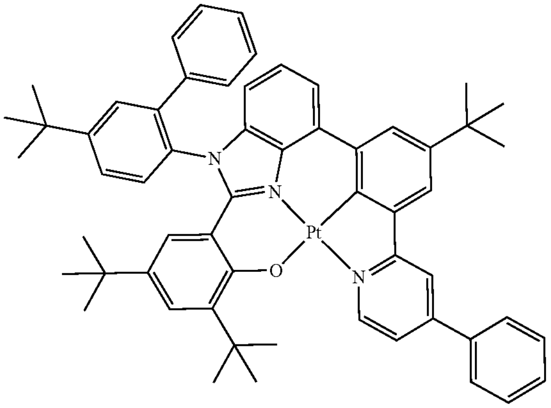
33
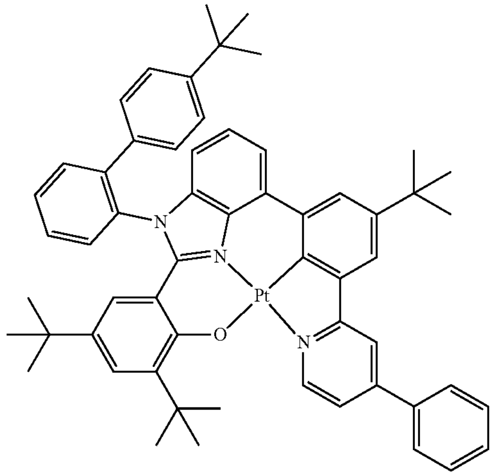
34
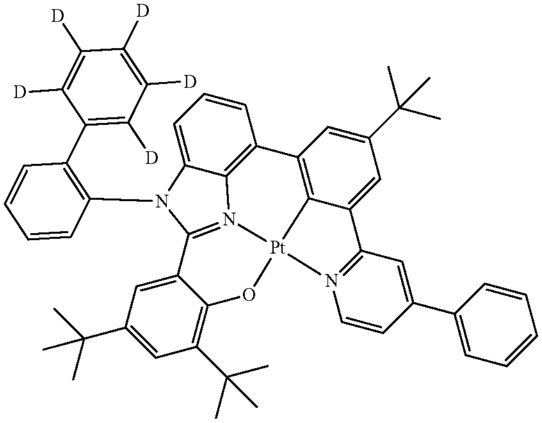
35
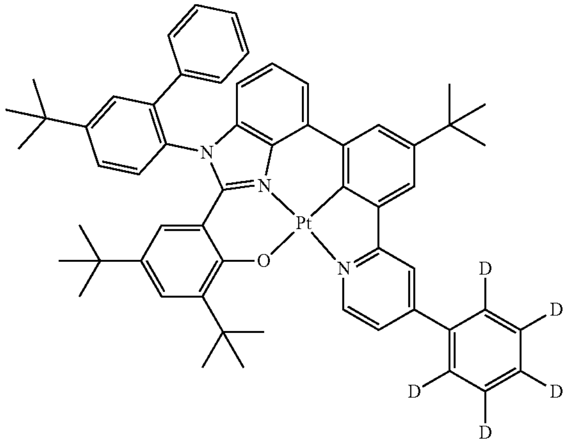

-continued
36
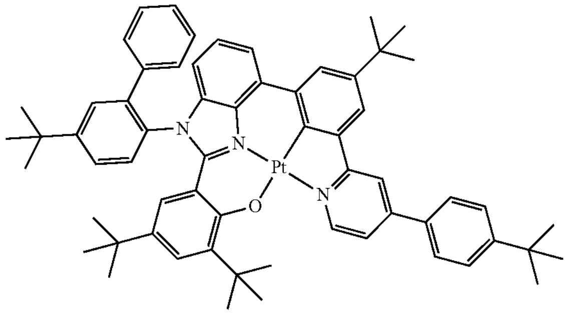
37
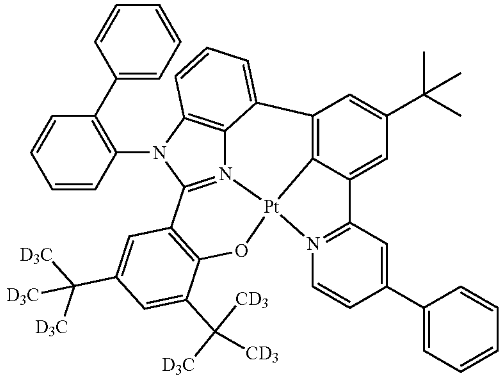
38
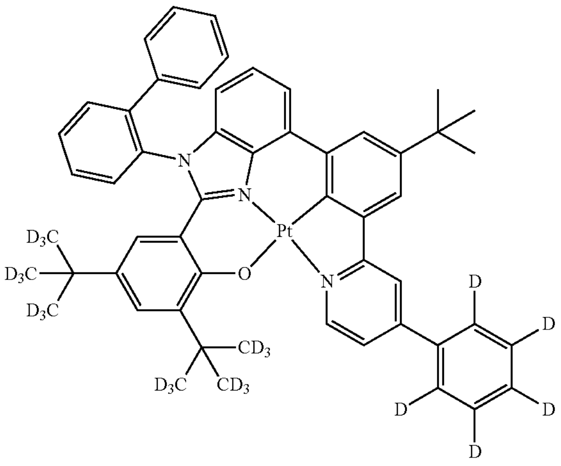
-continued
39
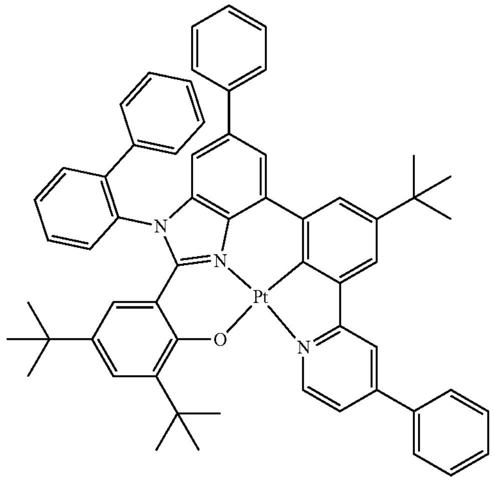
40
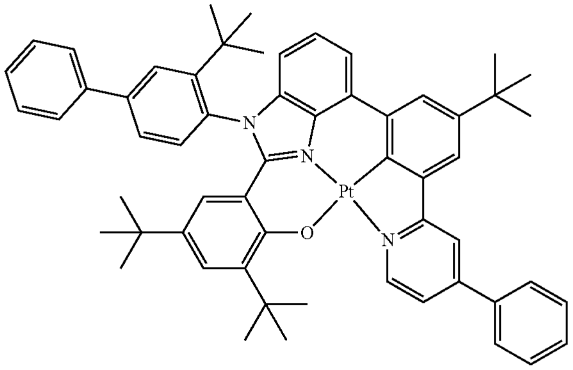
41
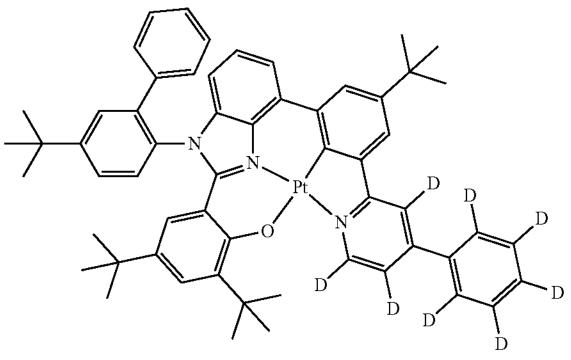

-continued
42
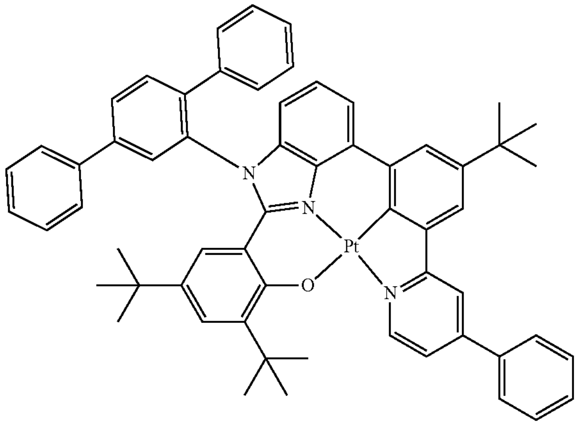
43
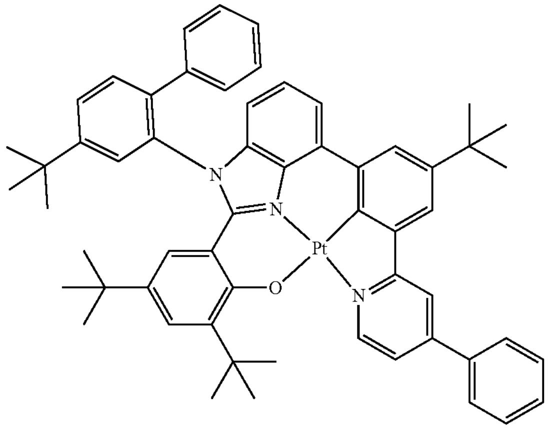
44
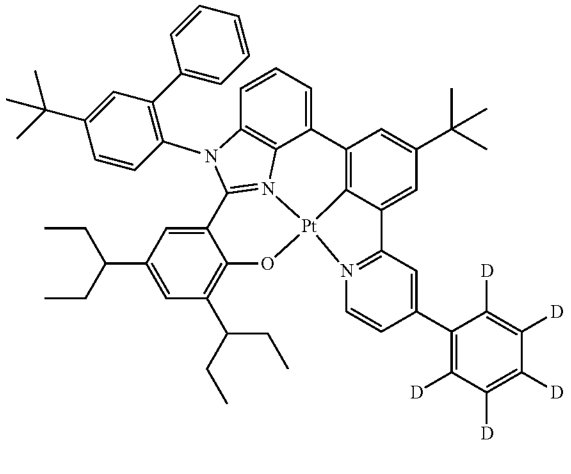
45
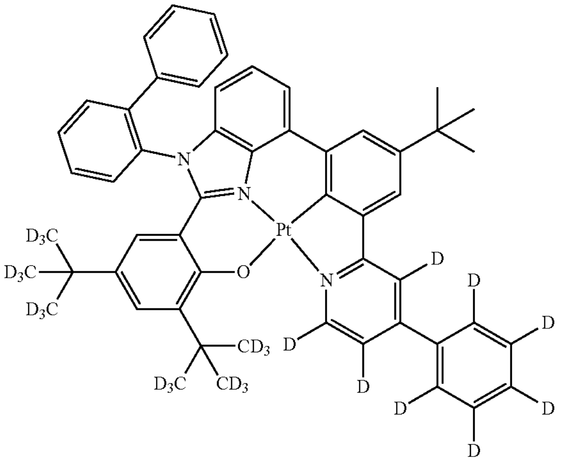
46
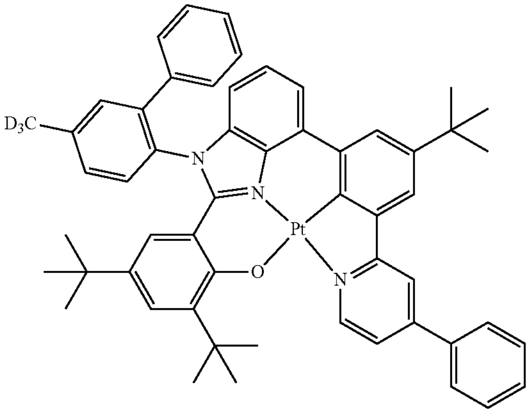
47
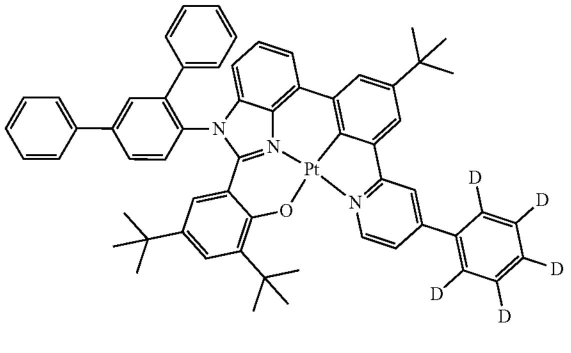

-continued
48
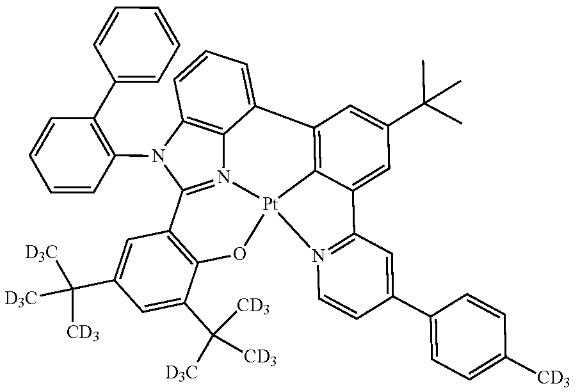
49
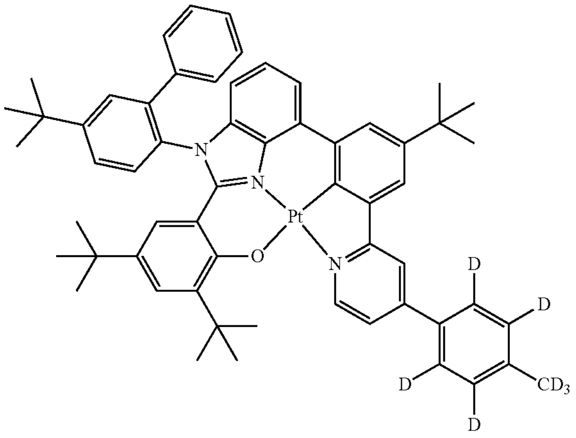
50
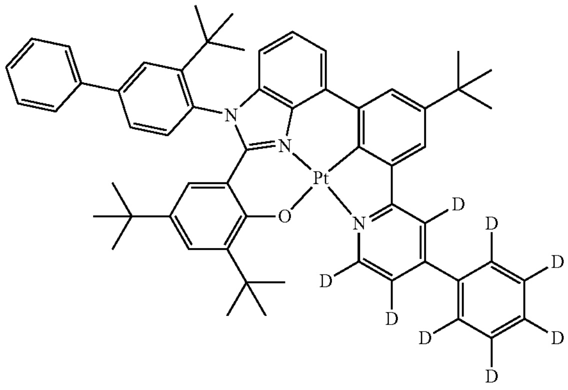
-continued
51
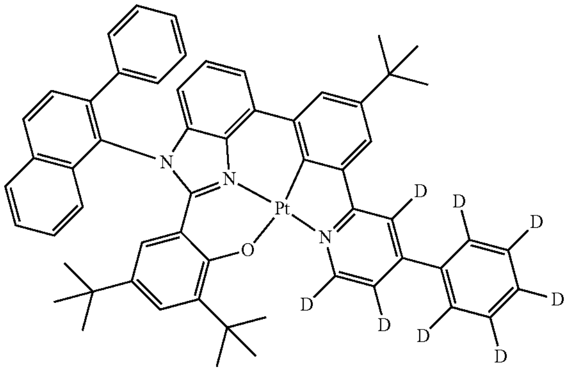
52
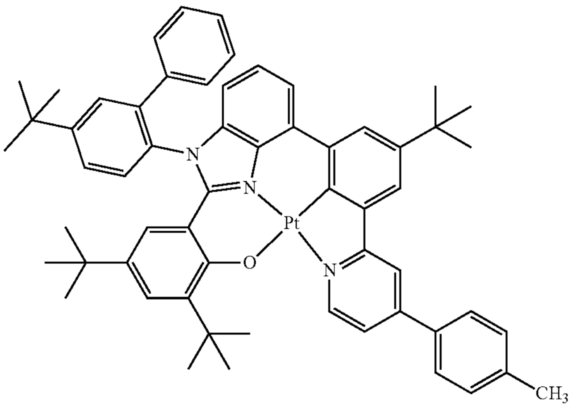
53
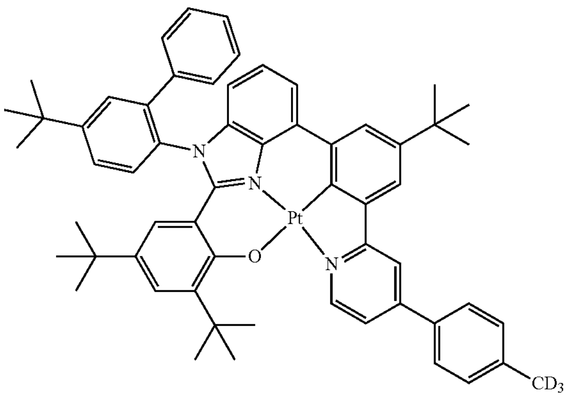

-continued
54
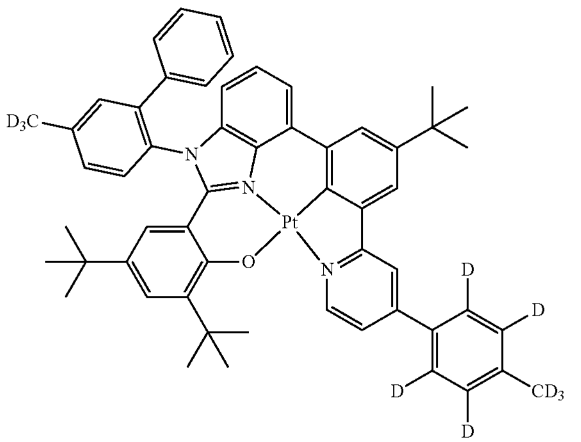
55
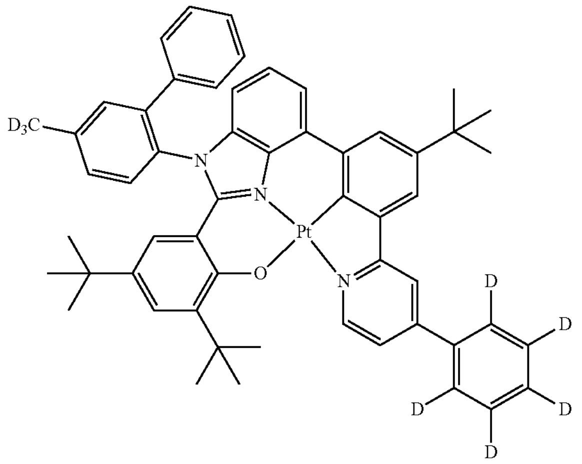
56
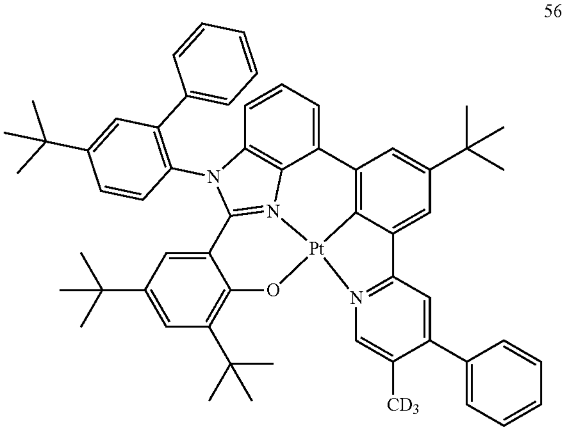
-continued
57
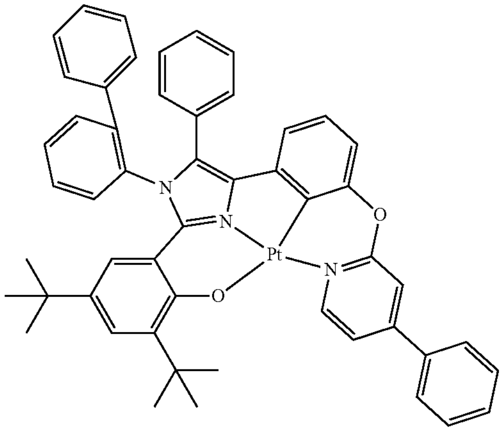
58
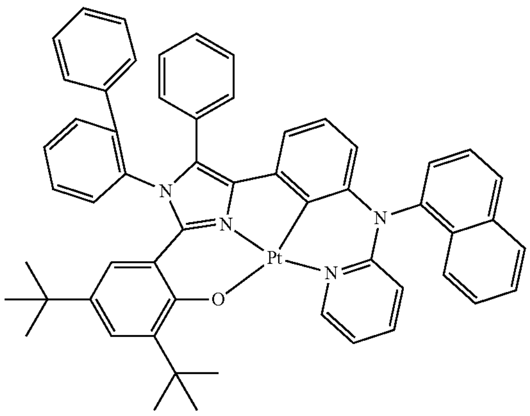
59
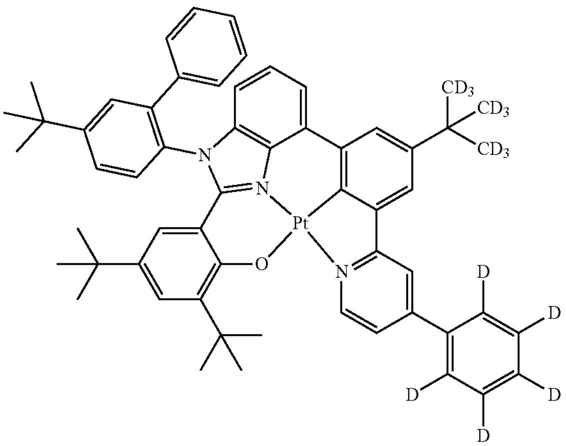

-continued
60
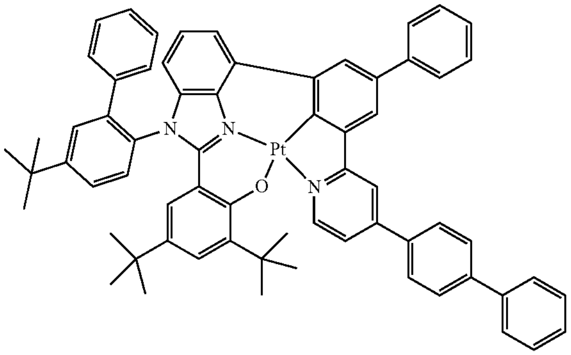
61
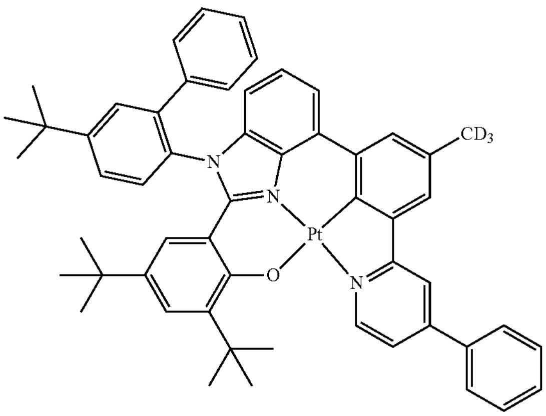
62
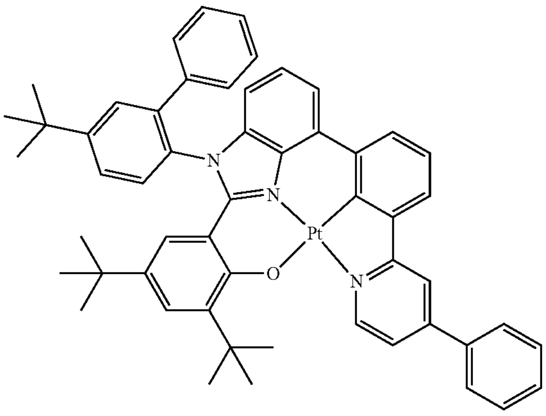
-continued
63
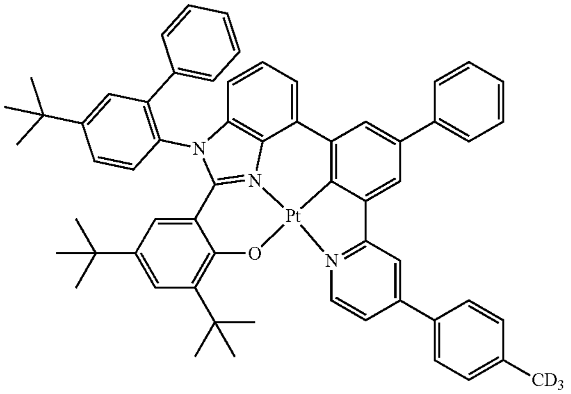
64
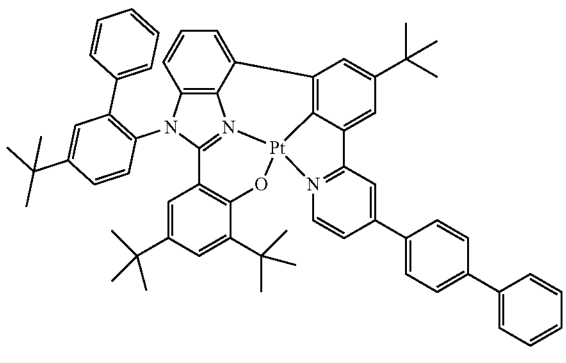
65
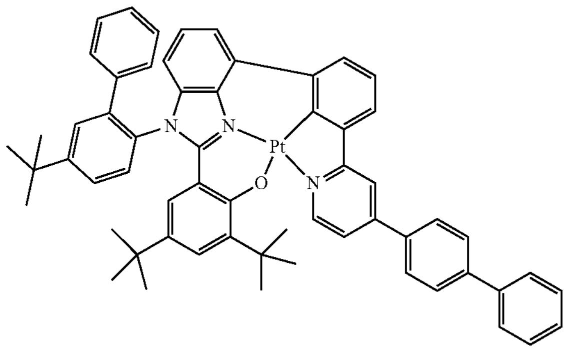
66
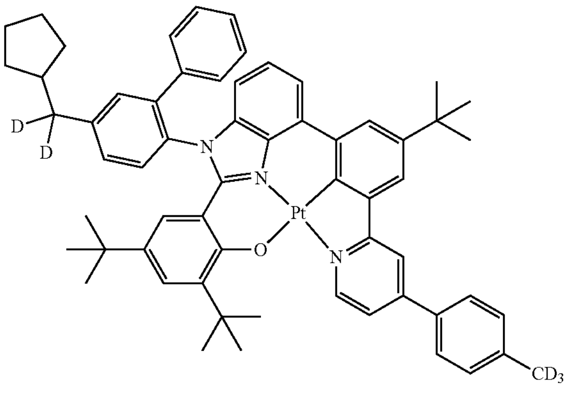

-continued
67
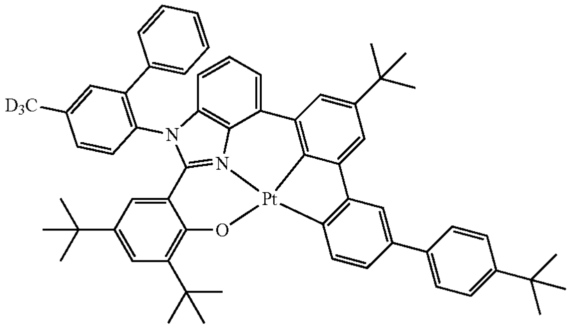
68
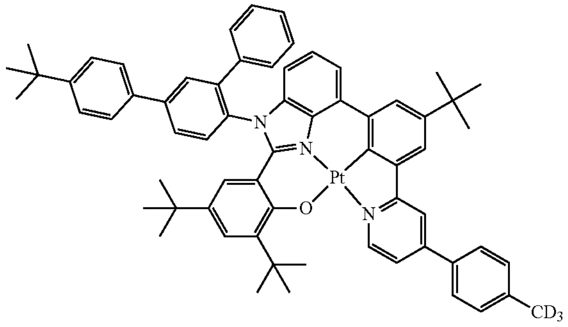
69
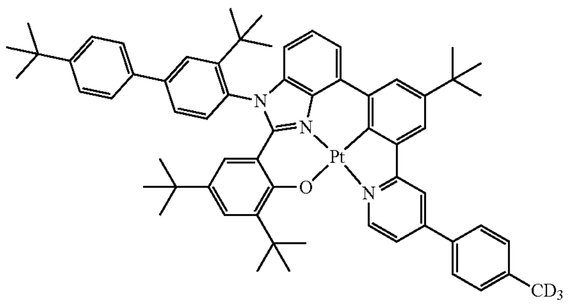
70
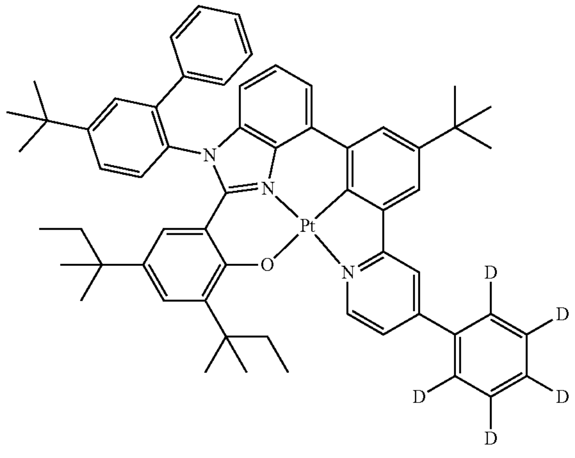
-continued
71
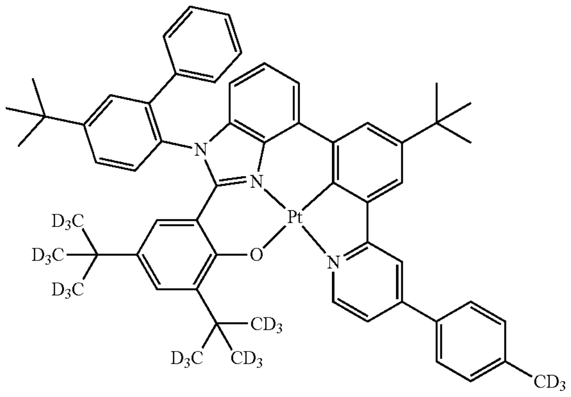
72
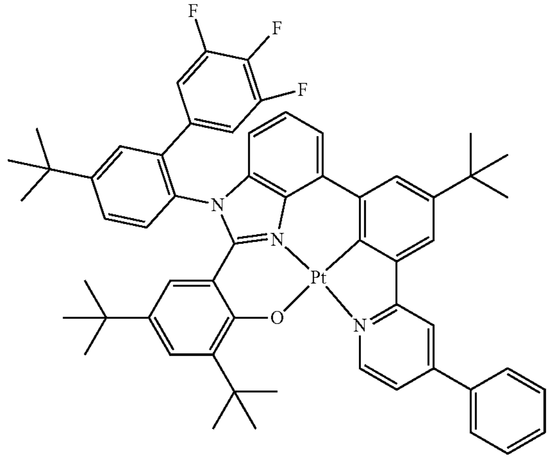
73
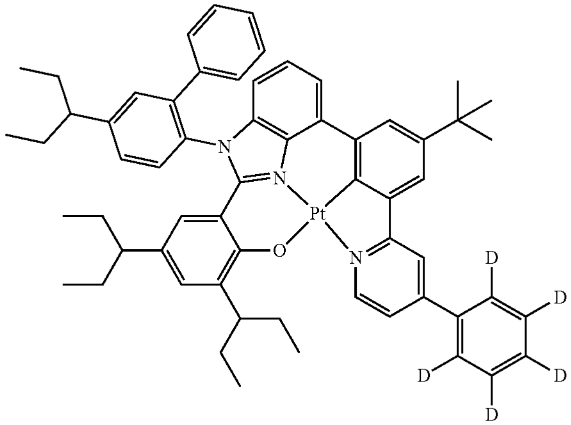
74
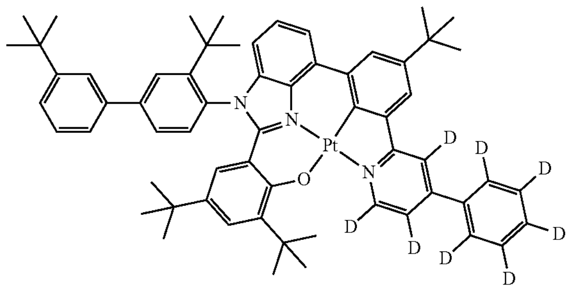

-continued
75
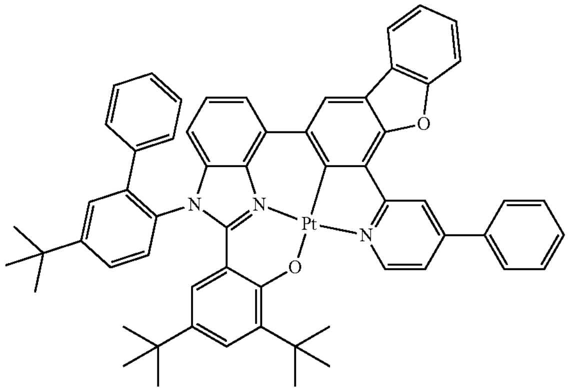
76
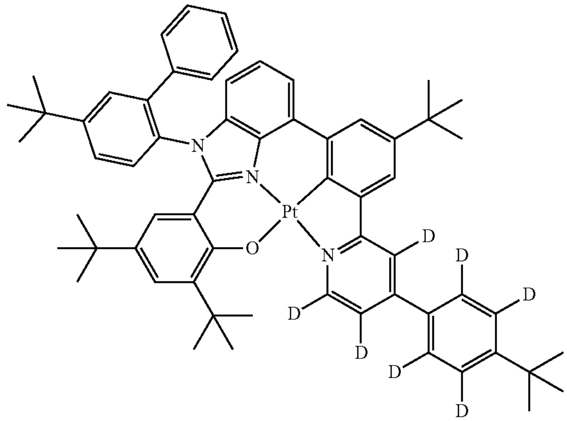
77
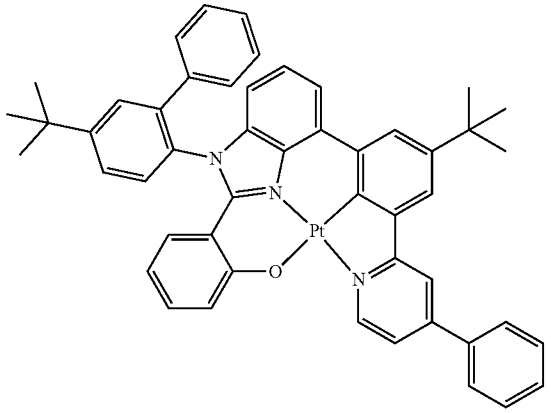
-continued
78
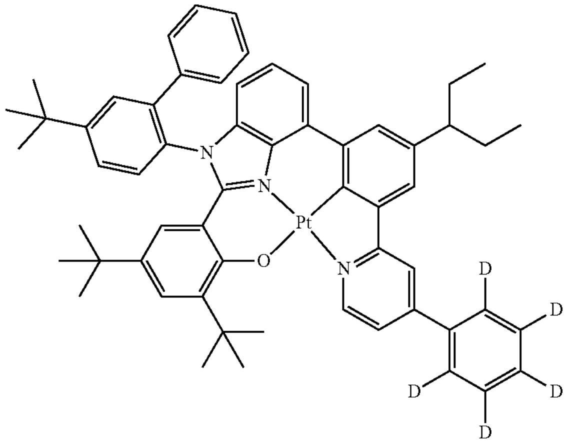
79
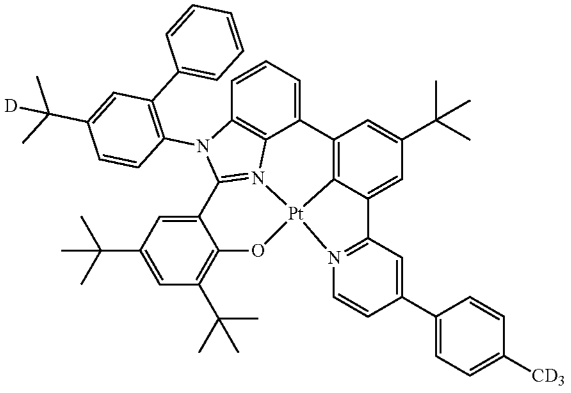
80
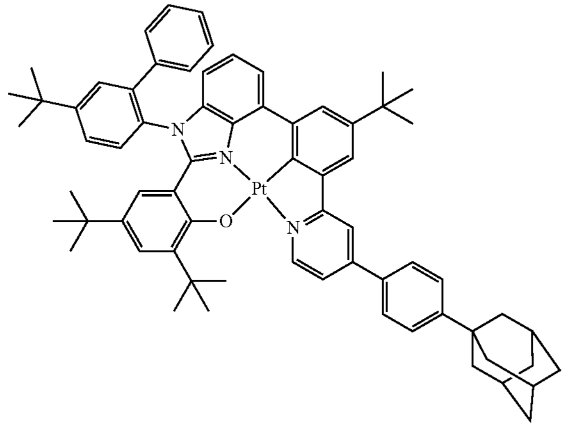

-continued
81
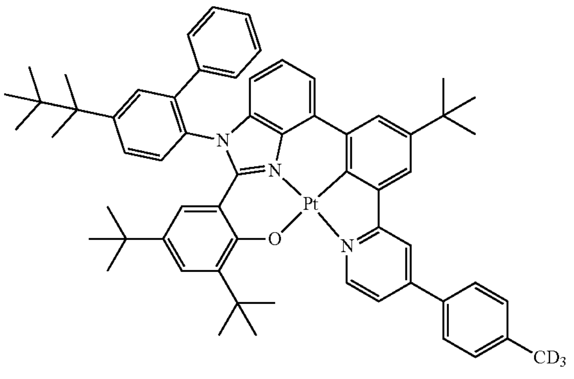
82
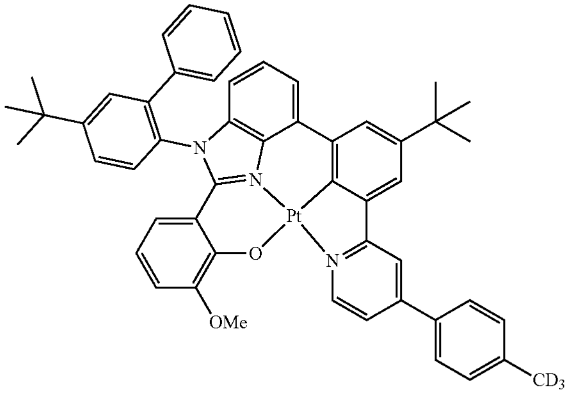
83
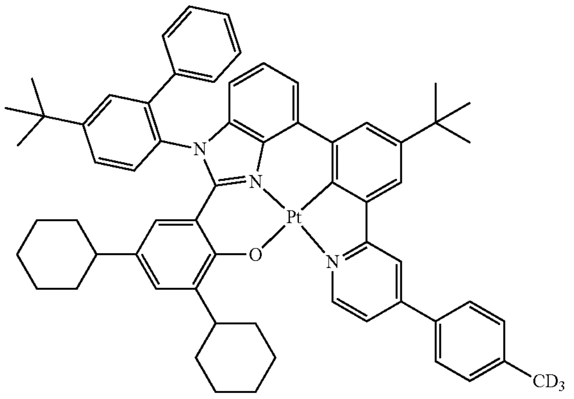
84
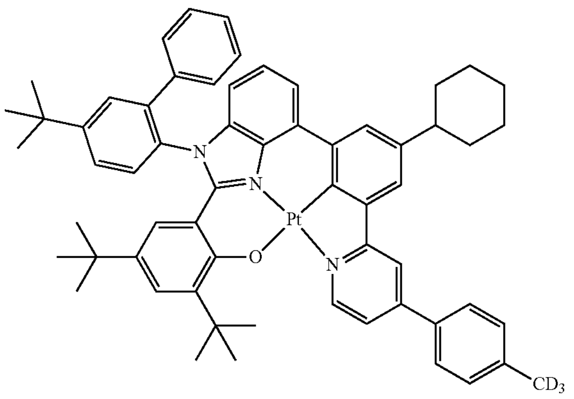
-continued
85
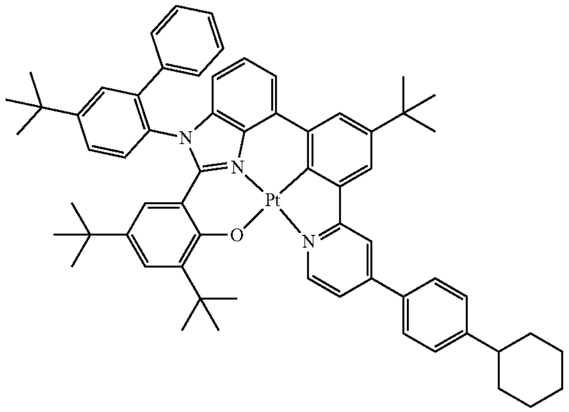
86
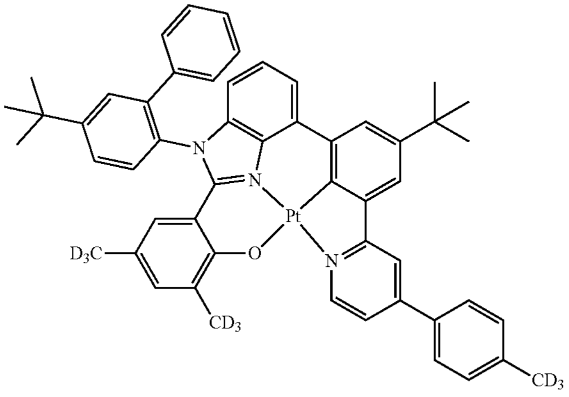
87
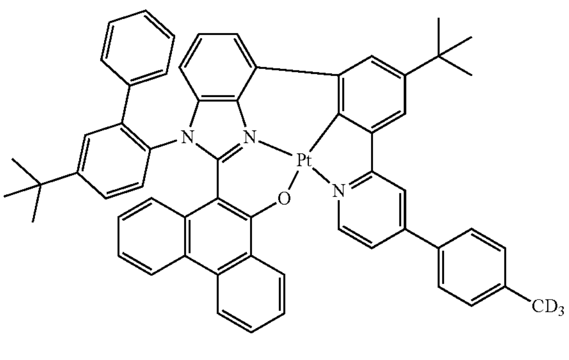

-continued
88
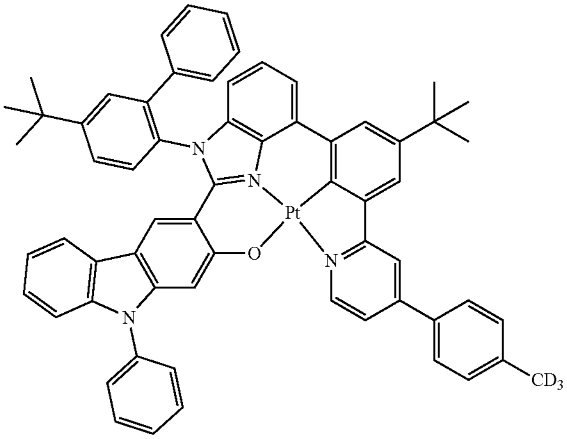
89
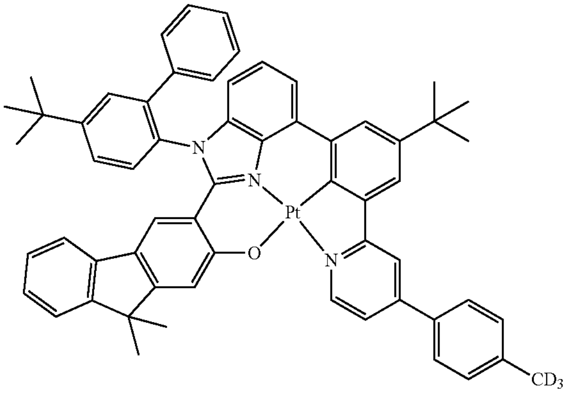
90
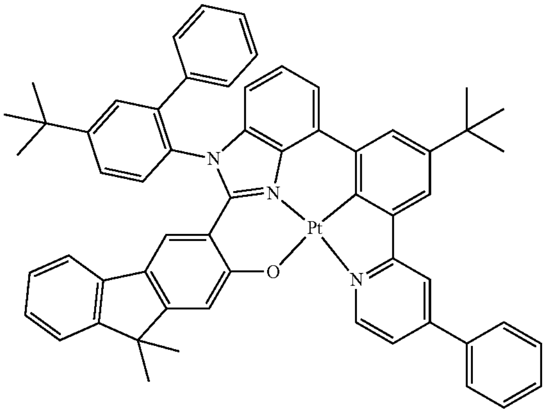
-continued
91
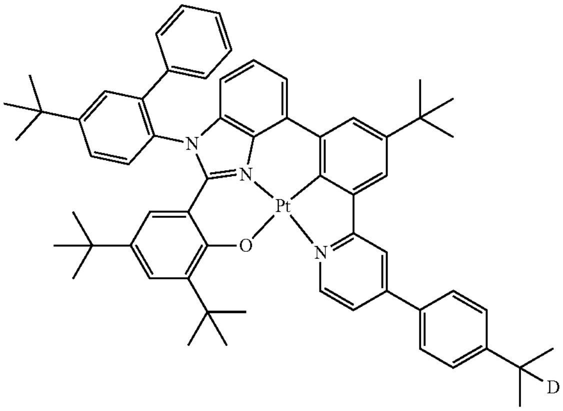
92
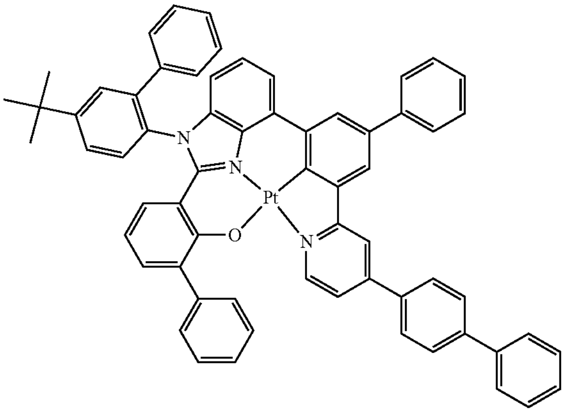
93
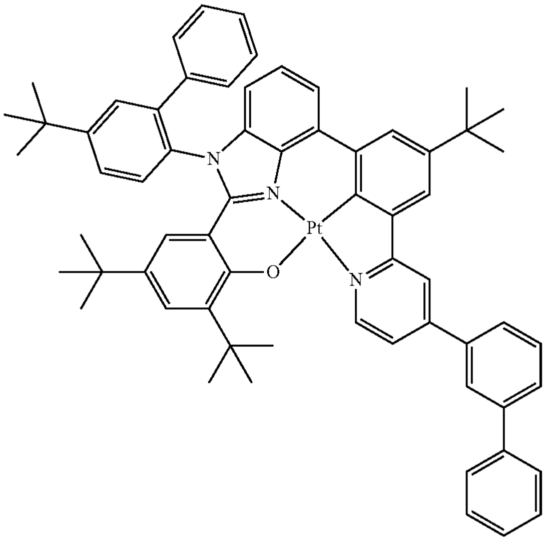

-continued
94
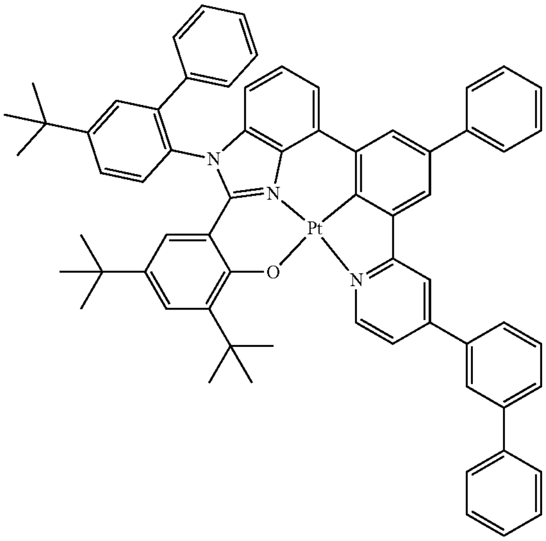
97
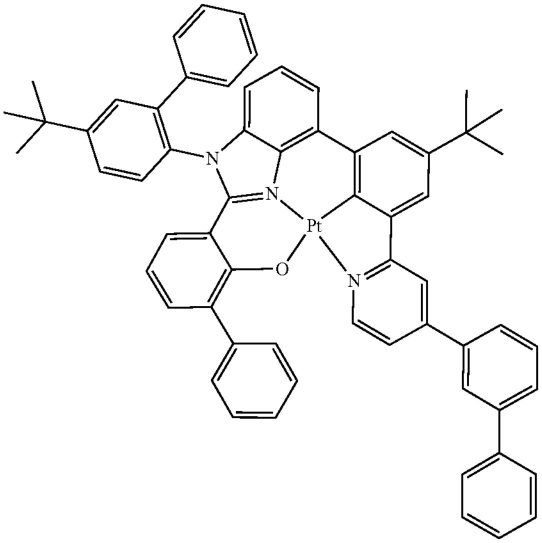
95
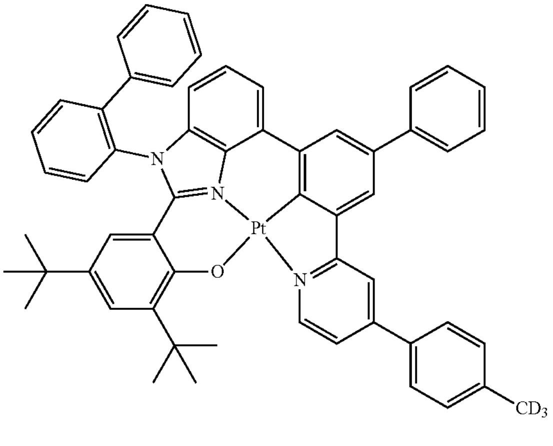
98
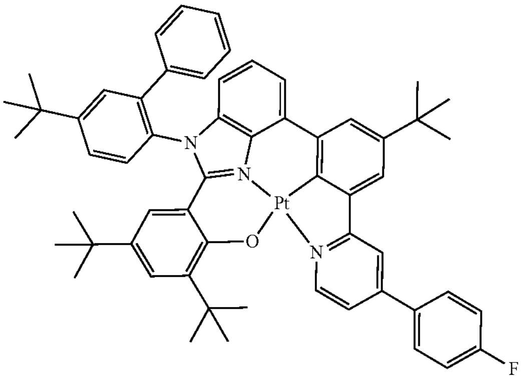
96
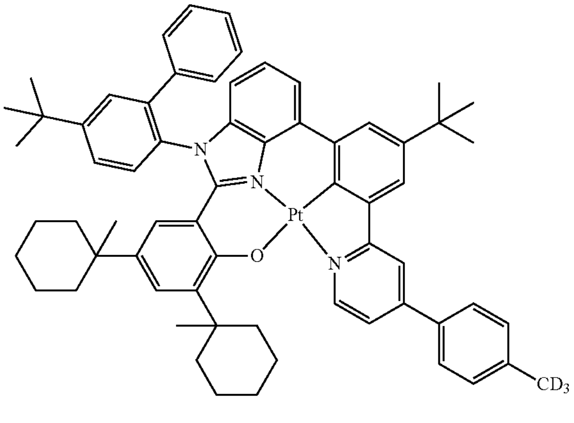
99
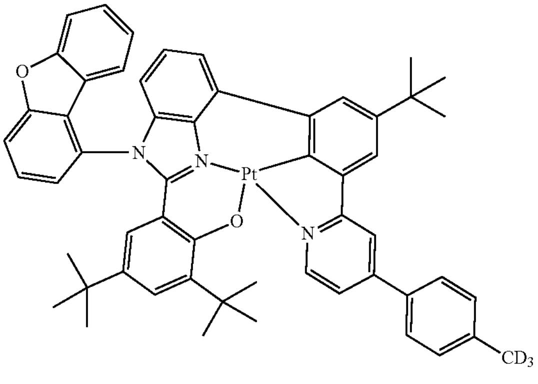

-continued
100
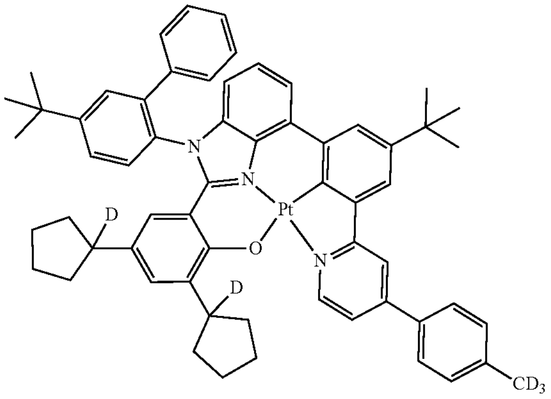
101
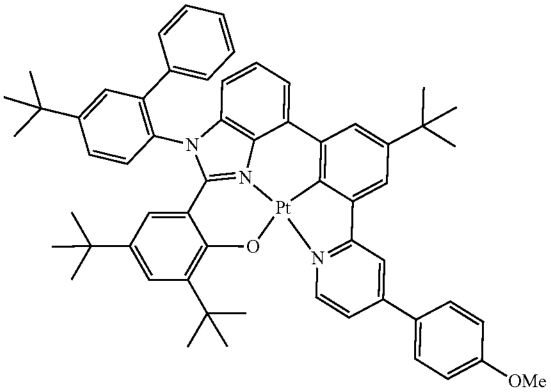
102
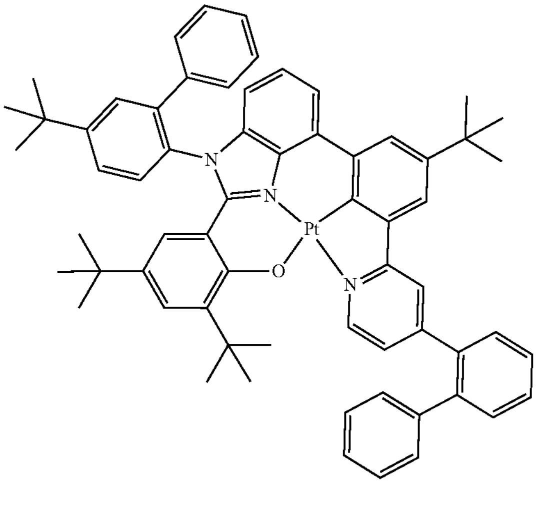
-continued
103
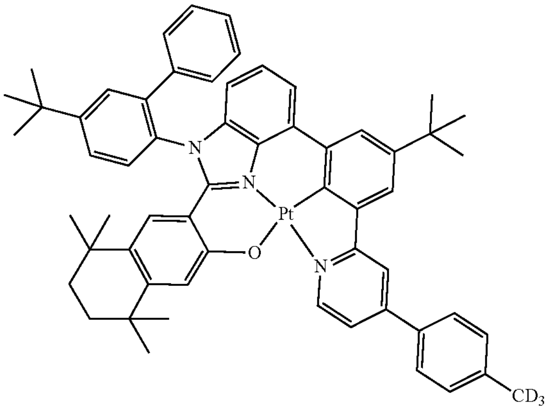
104
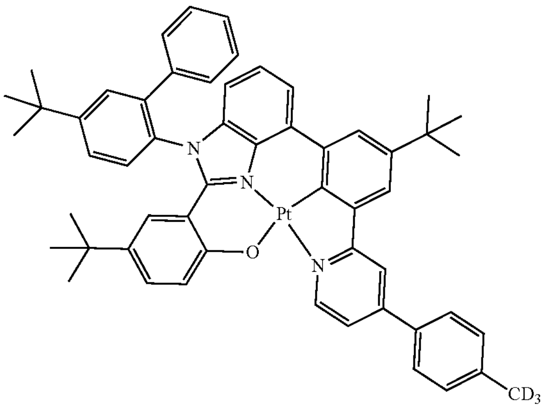
105
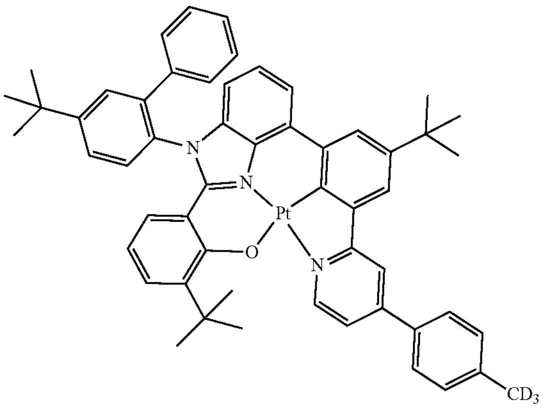

-continued
106
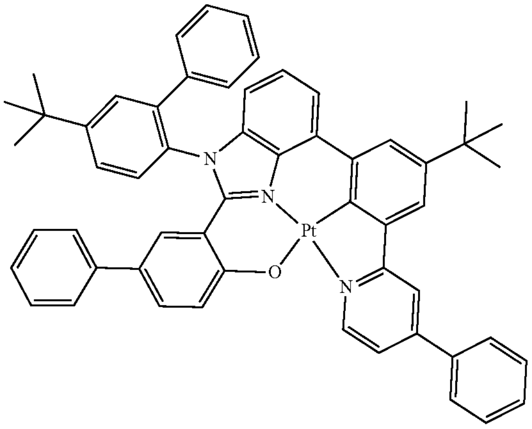
107
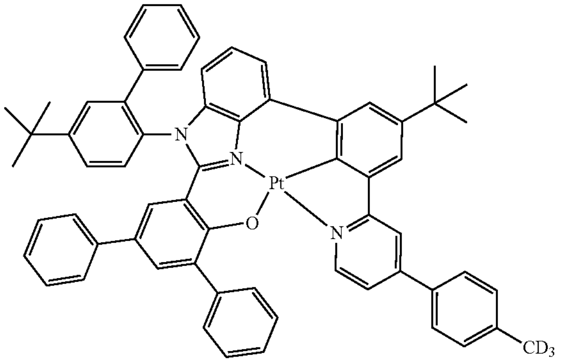
108
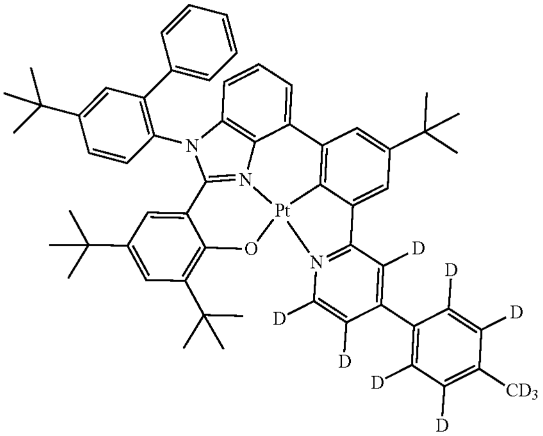
-continued
109
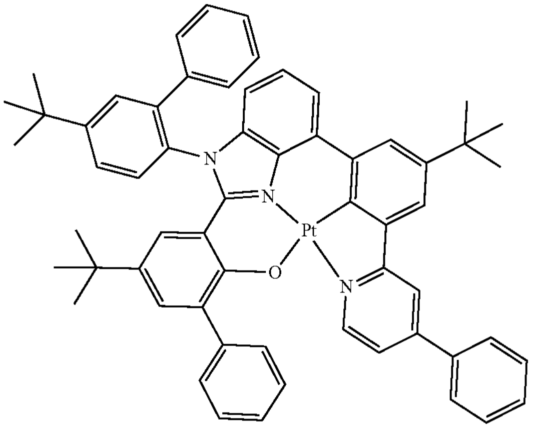
110
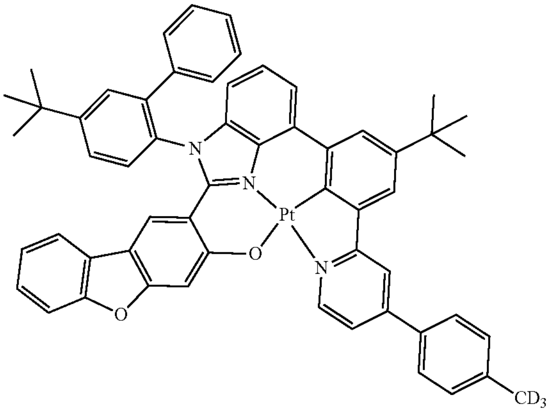
111
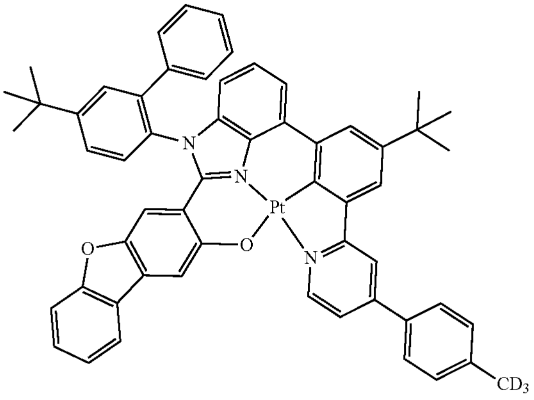

-continued
112
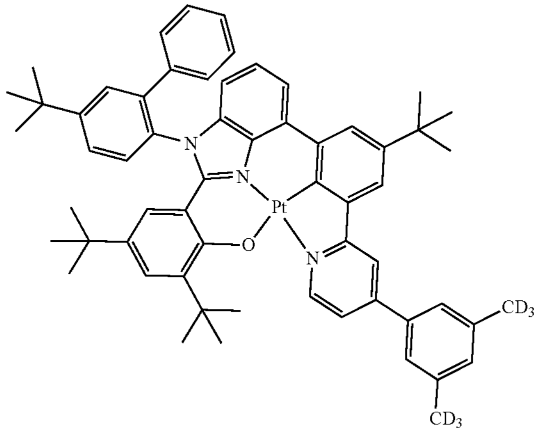
113
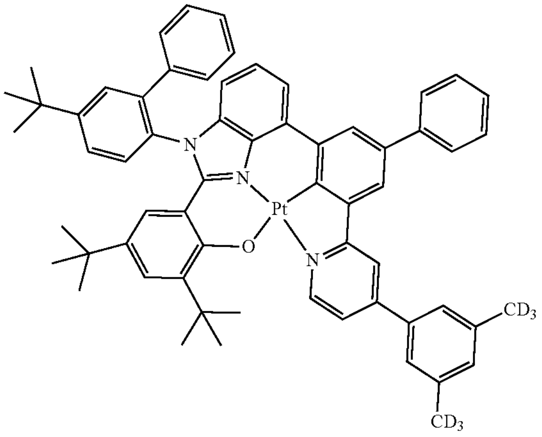
114
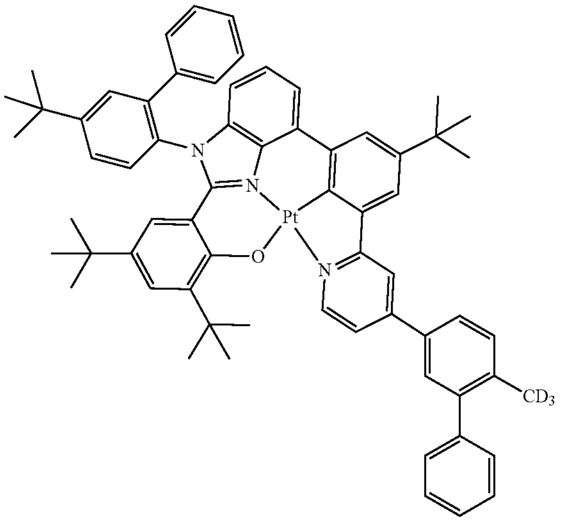
-continued
115
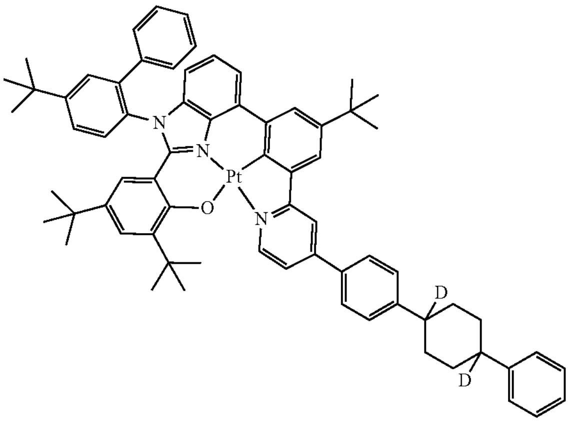
116
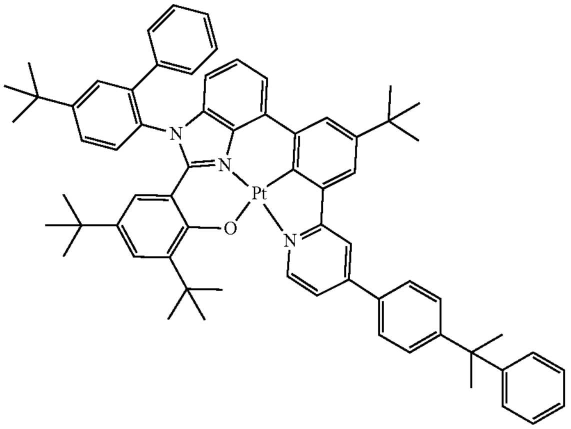
117
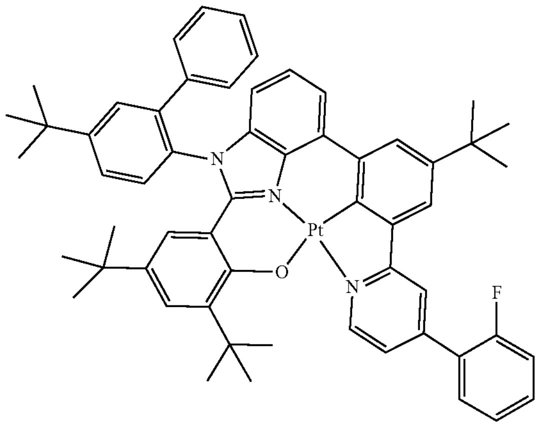

-continued
118
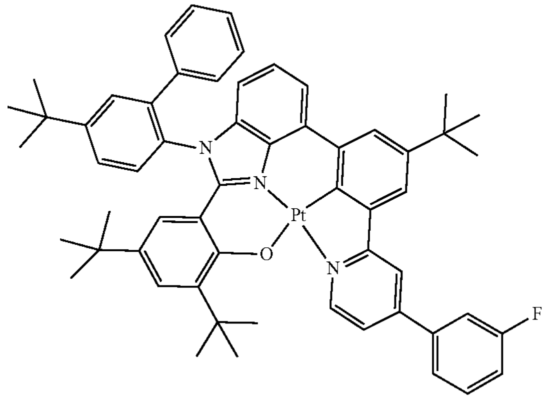
119
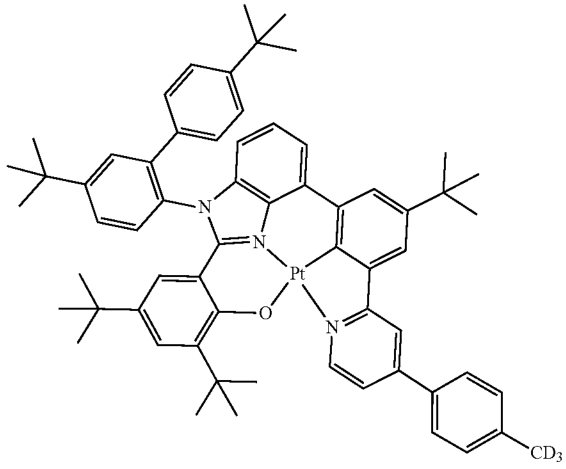
120
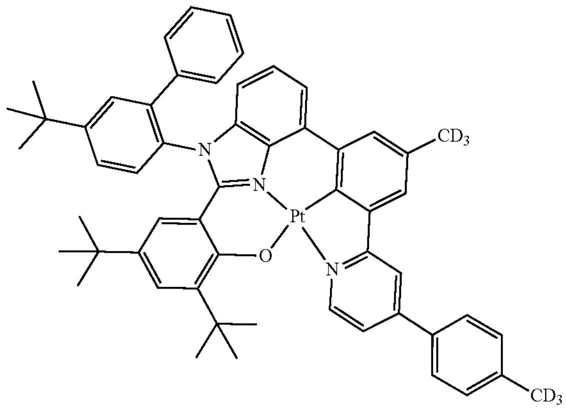
-continued
121
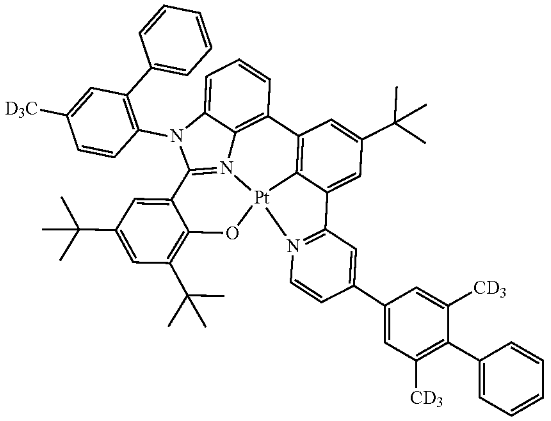
122
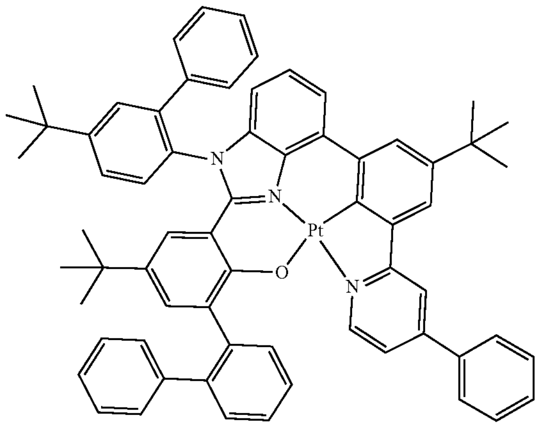
123
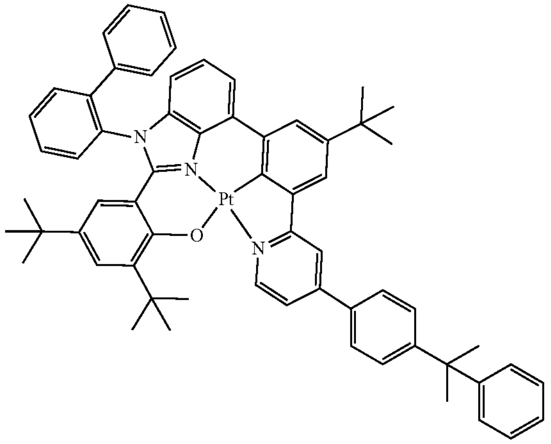

124
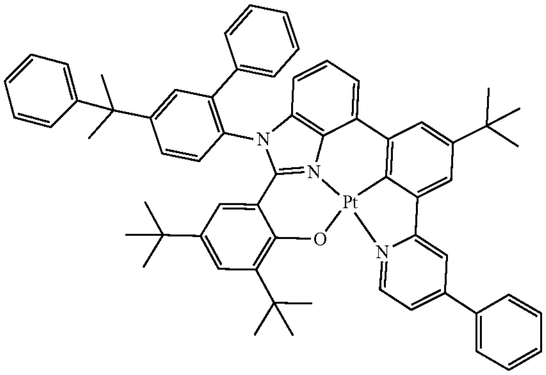
125
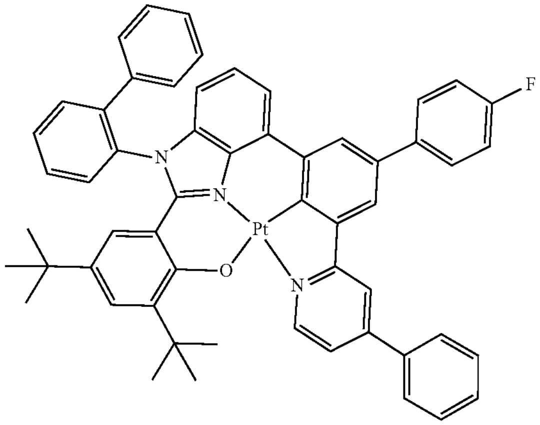
126
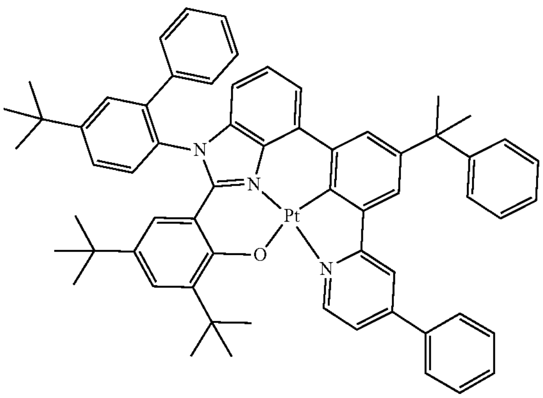
-continued
127
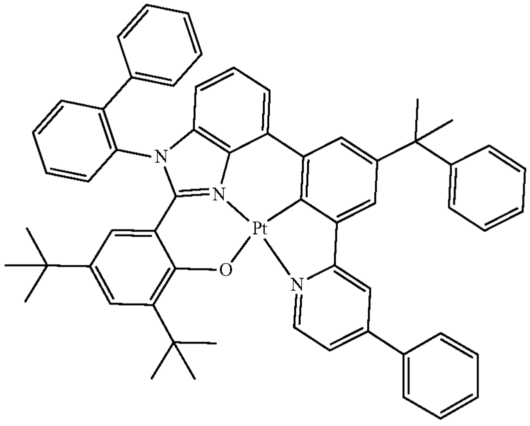
128
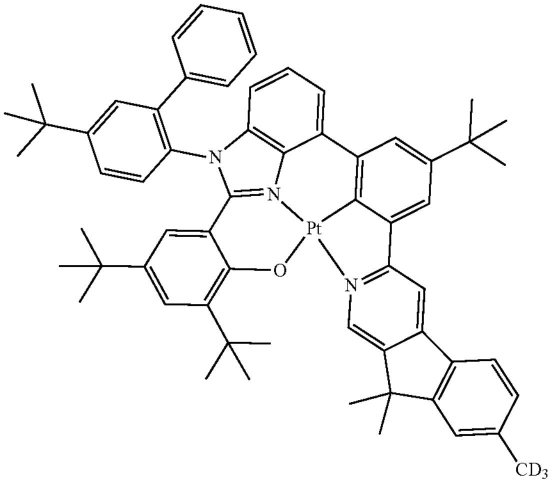
129
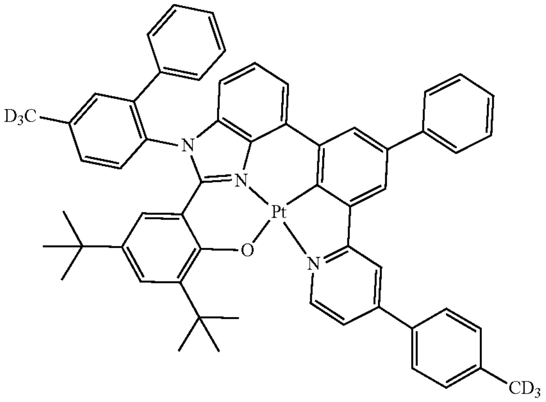

130
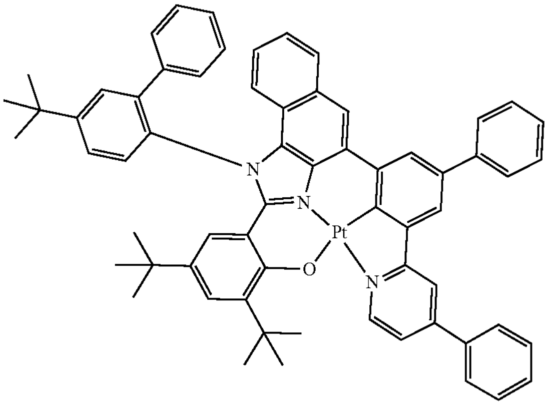
131
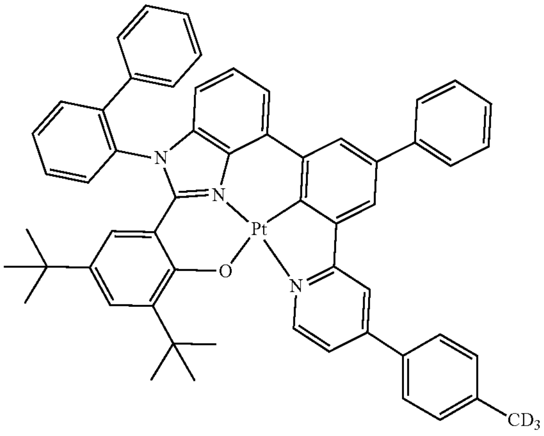
132
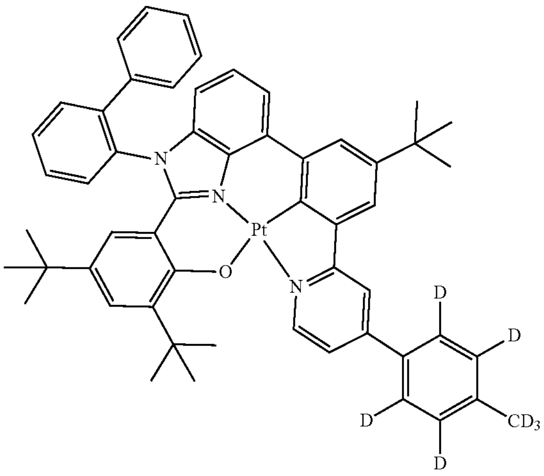
Group 1-4
1
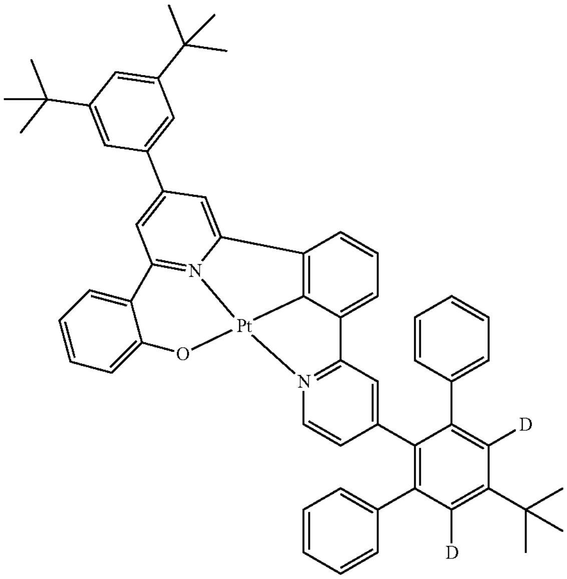
2
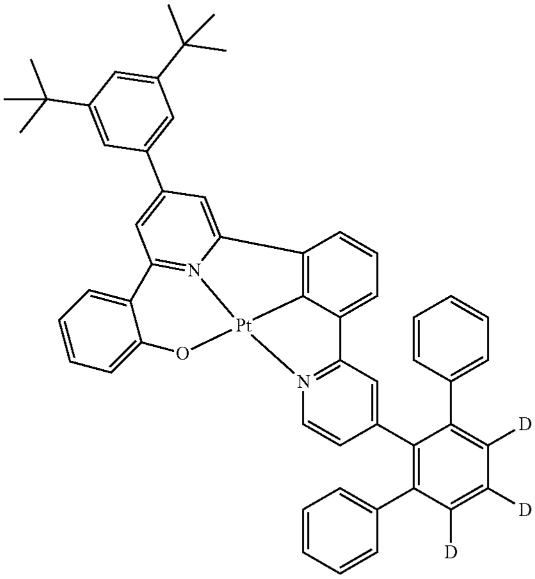

-continued
3
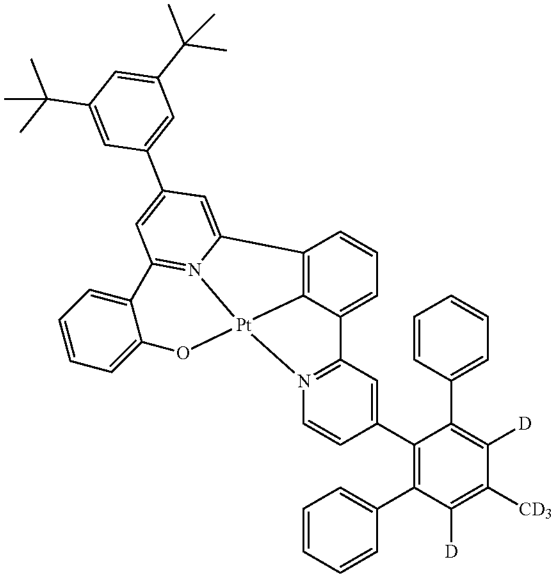
Group 2-1
1
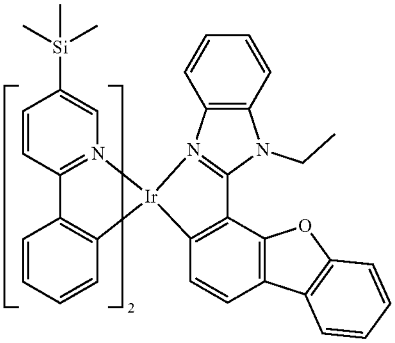
2
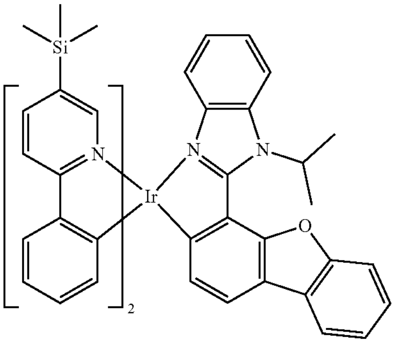
-continued
3
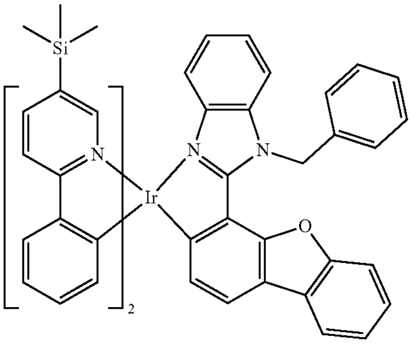
4
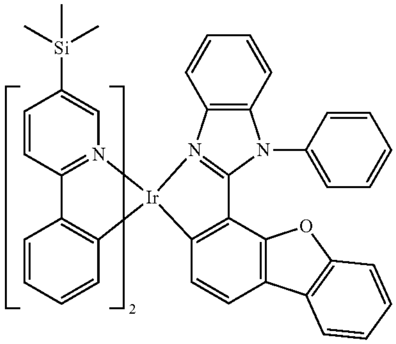
5
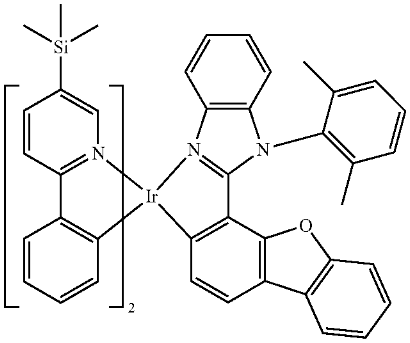
6
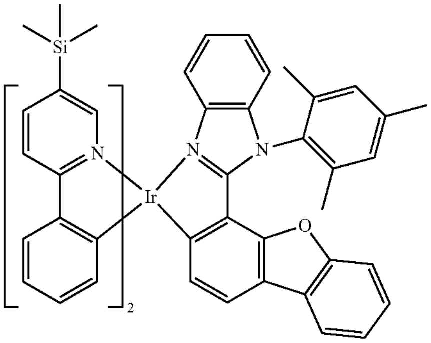

-continued
7
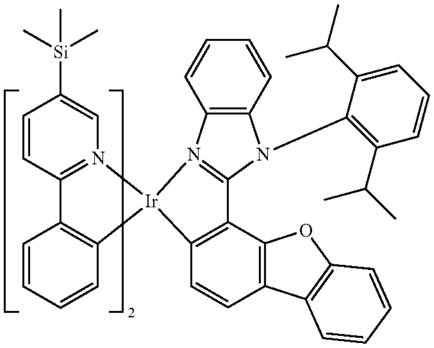
8
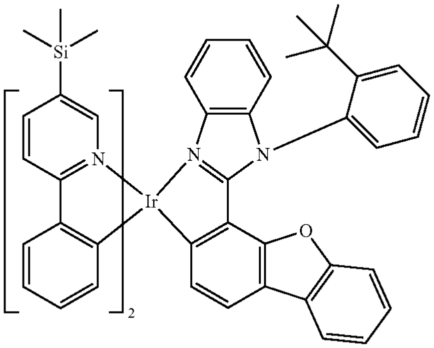
9
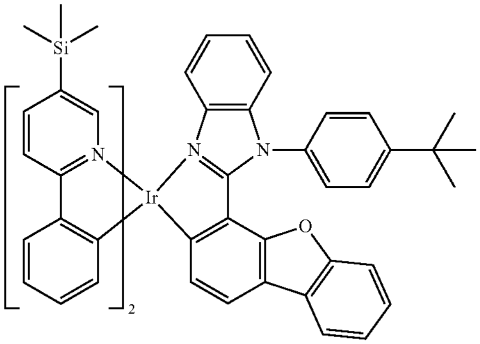
10
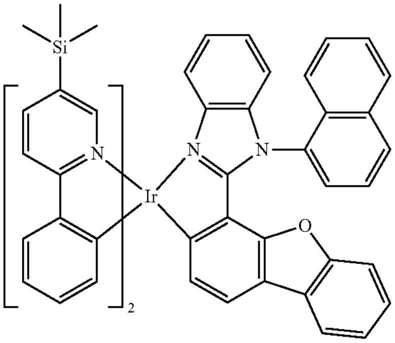
-continued
11
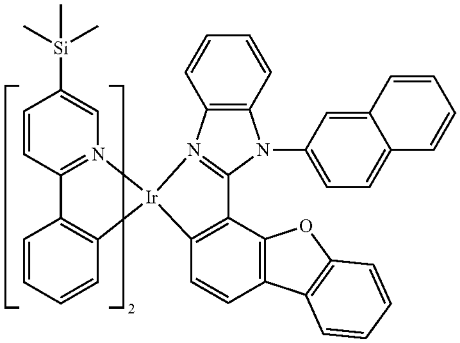
12
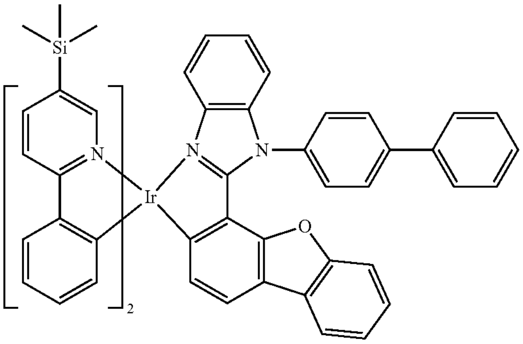
13
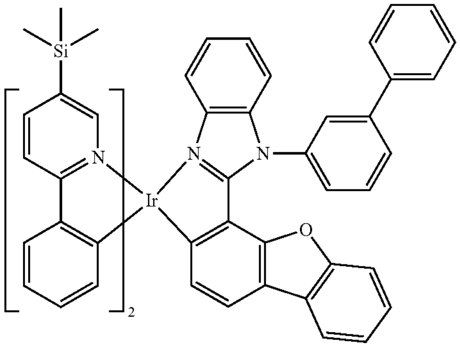
14
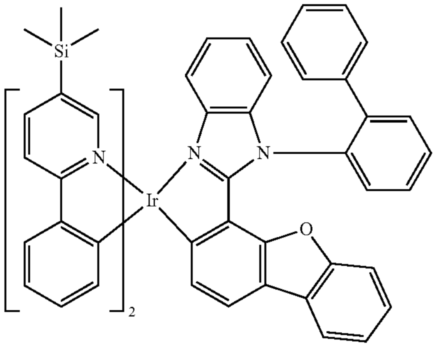

-continued
15
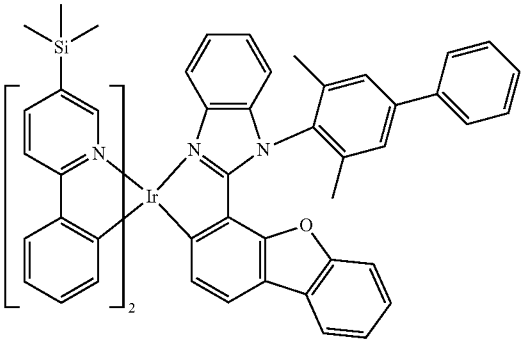
16
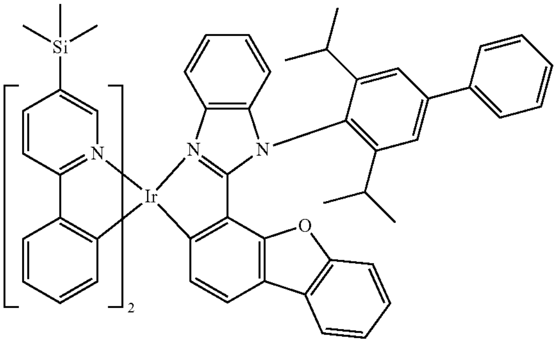
17
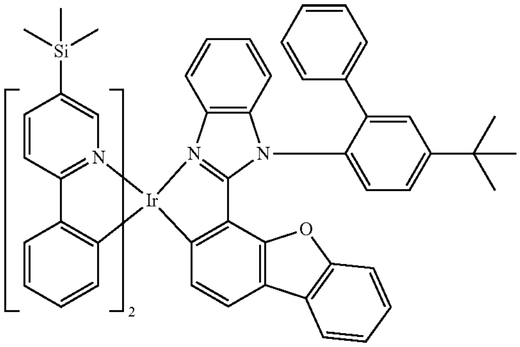
18
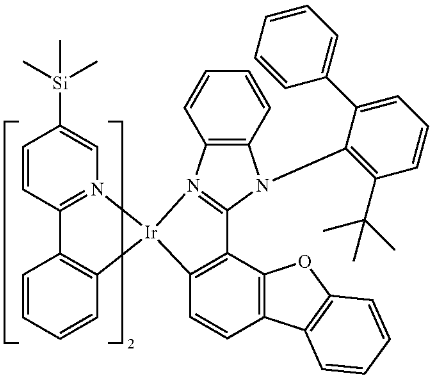
-continued
19
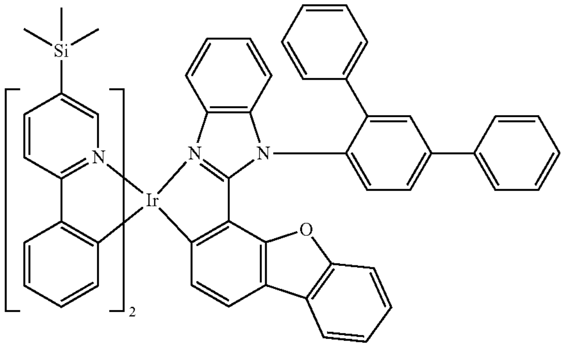
20
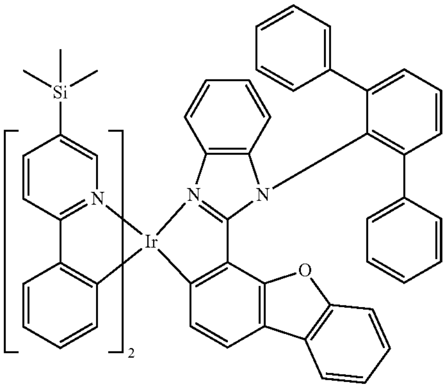
21
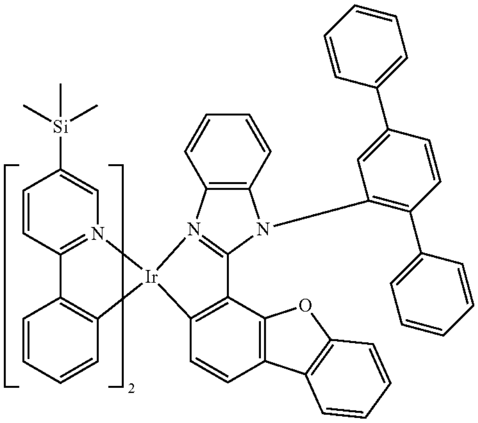
22
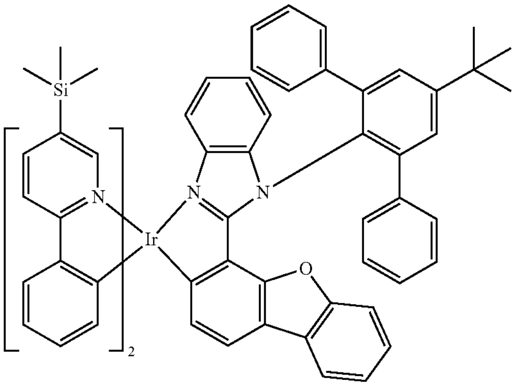

-continued
23
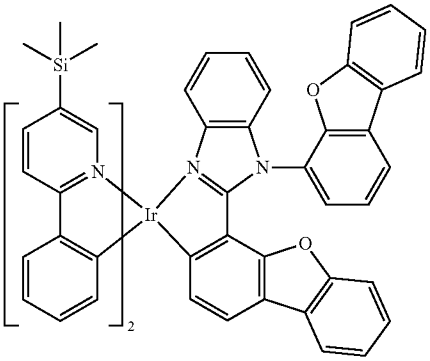
24
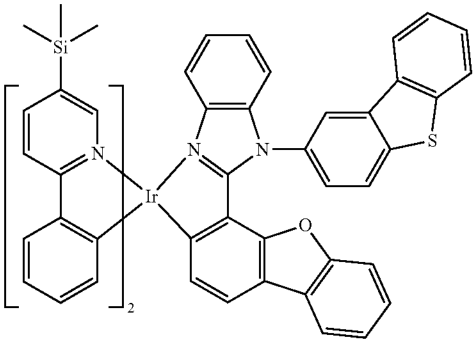
25
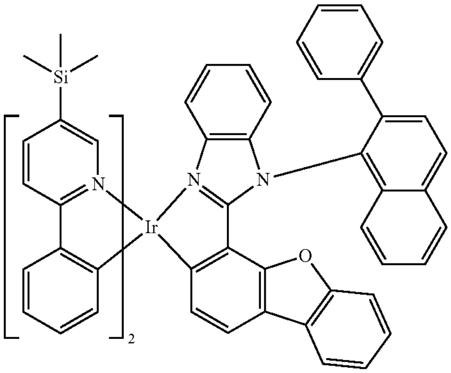
26
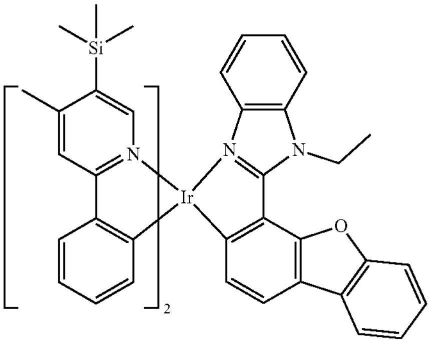
-continued
27
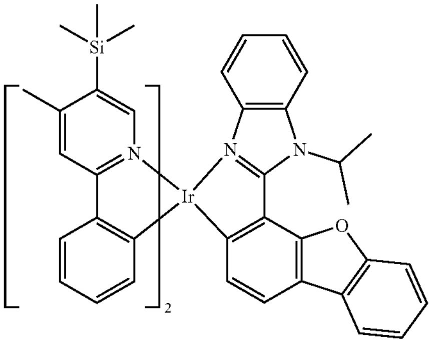
28
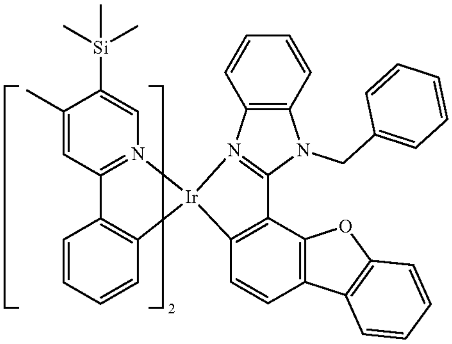
29
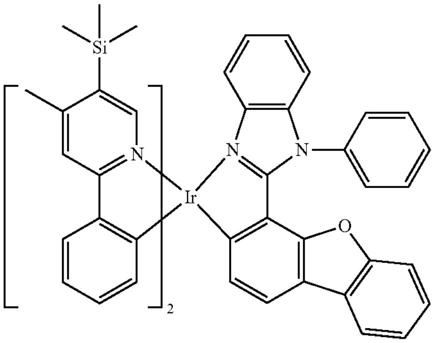
30
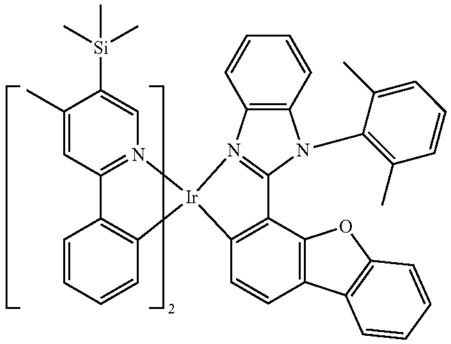

-continued
31
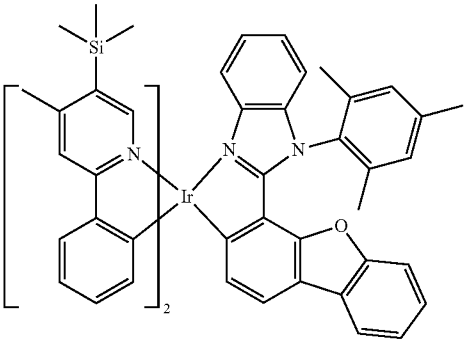
32
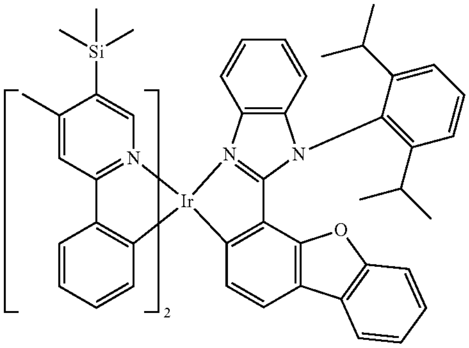
33
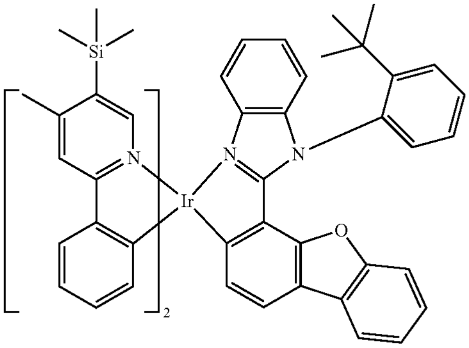
34
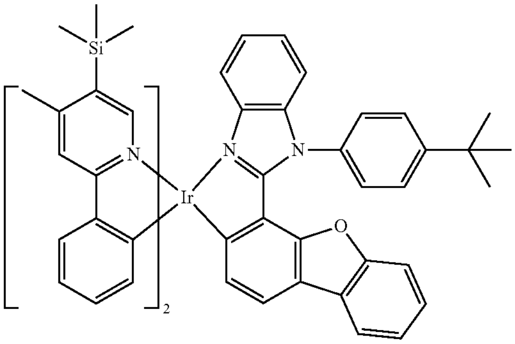
-continued
35
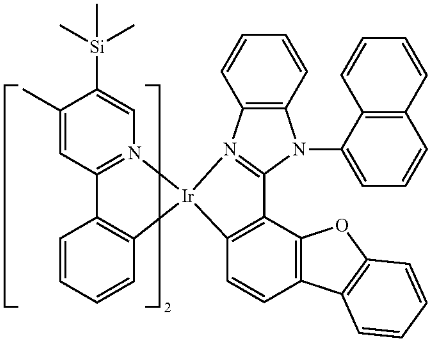
36
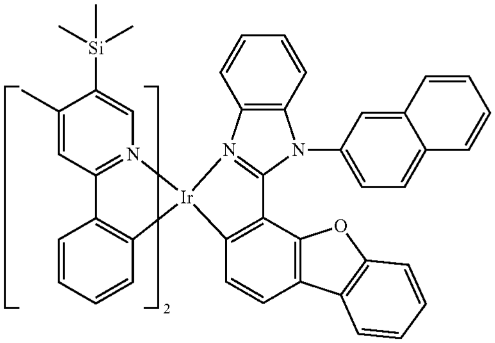
37
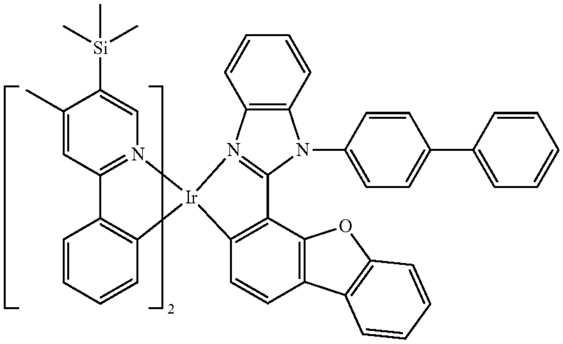
38
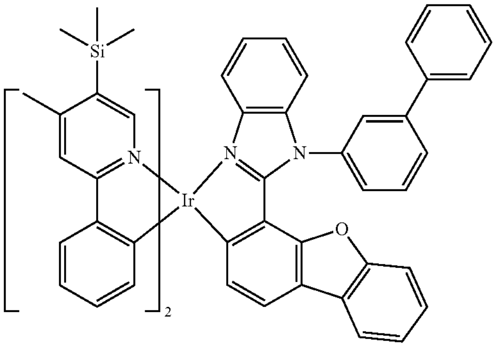

-continued
39
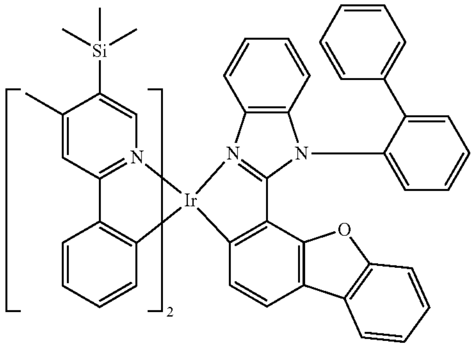
40
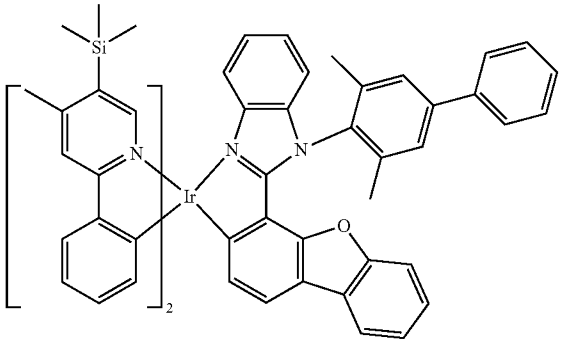
41
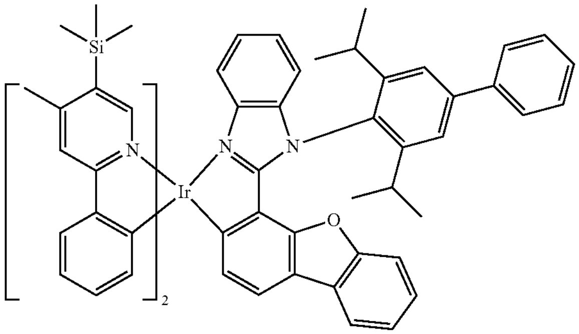
42
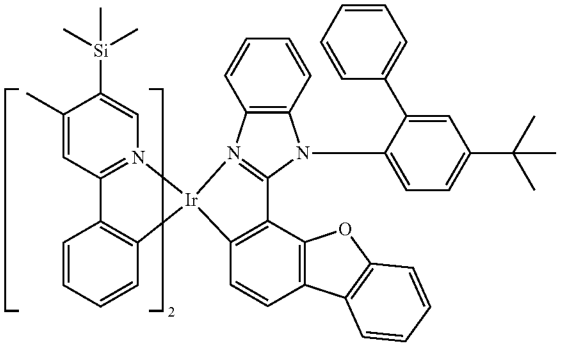
-continued
43
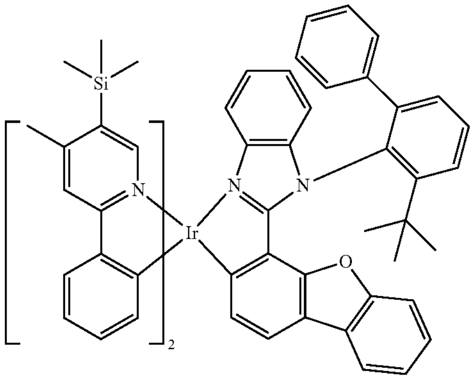
44
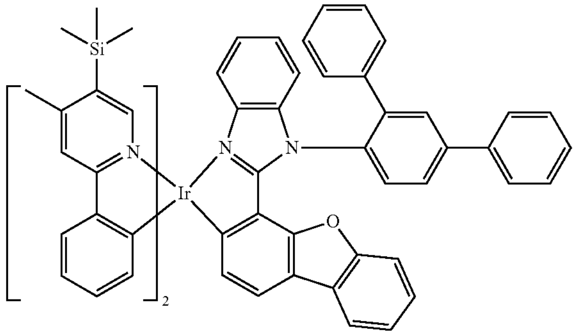
45
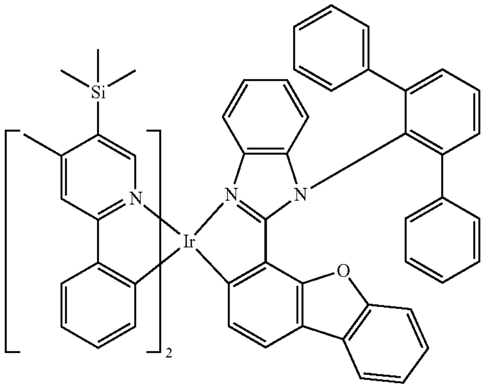
46
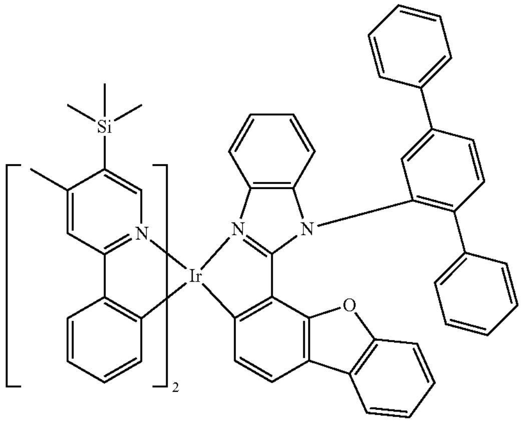

-continued
47
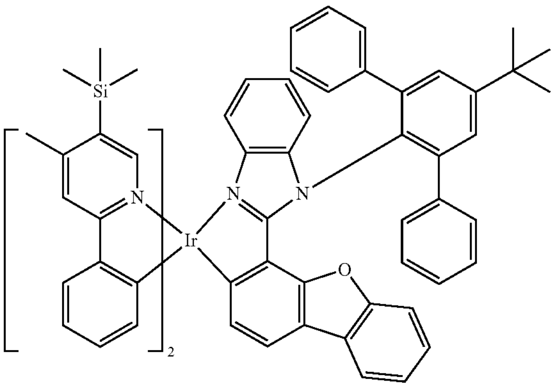
48
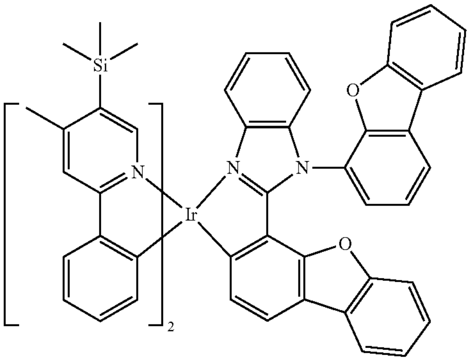
49
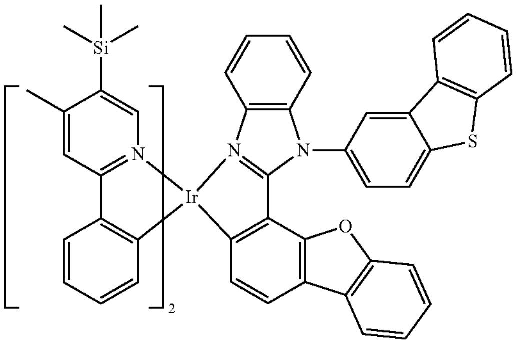
50
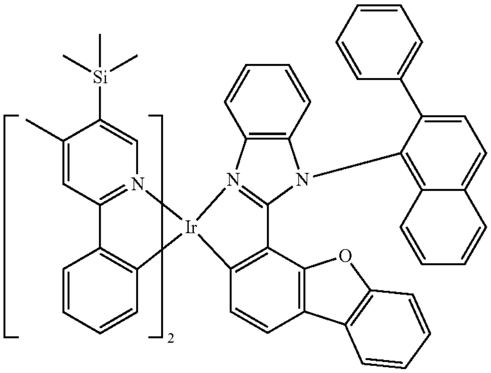
-continued
51
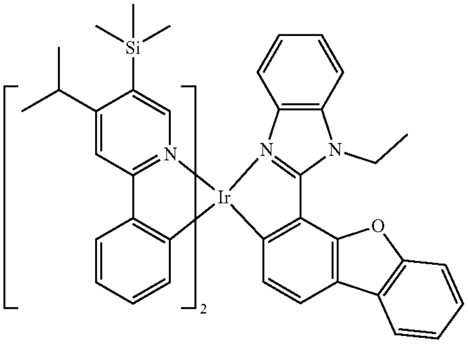
52
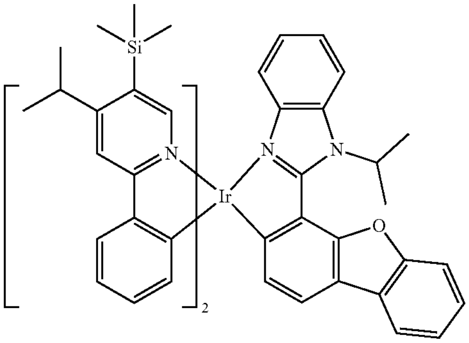
53
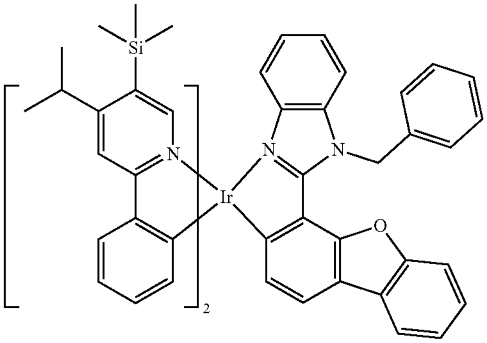
54
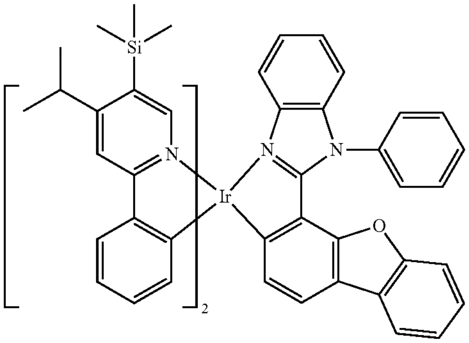

-continued
55
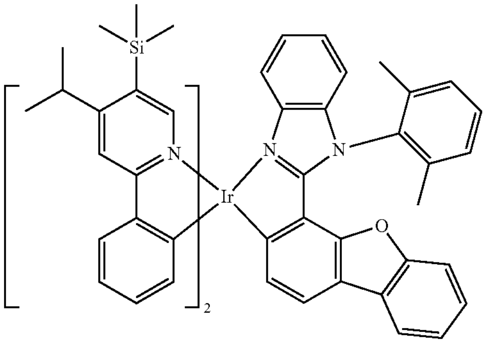
56
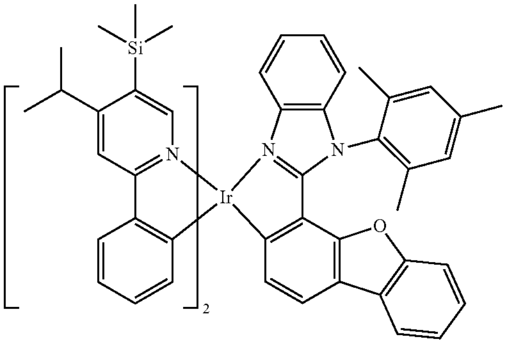
57
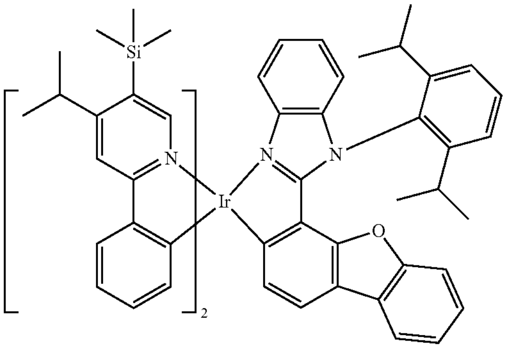
58
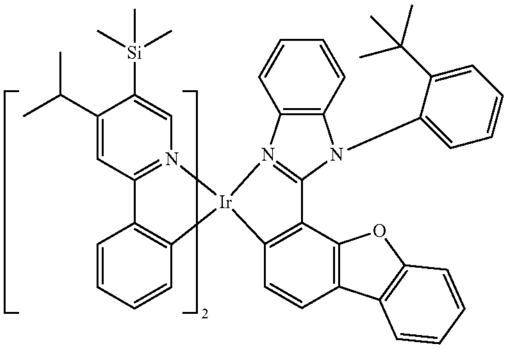
-continued
59
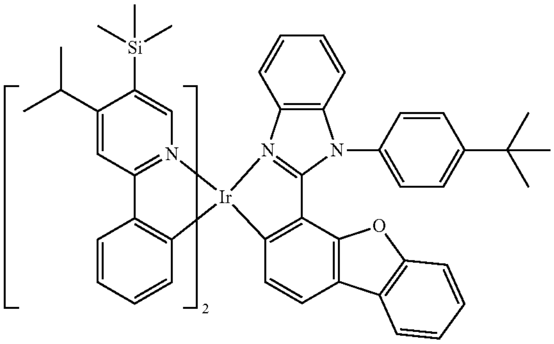
60
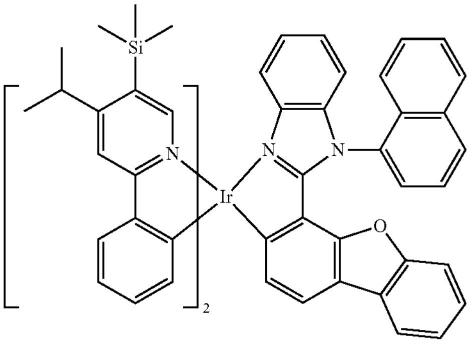
61
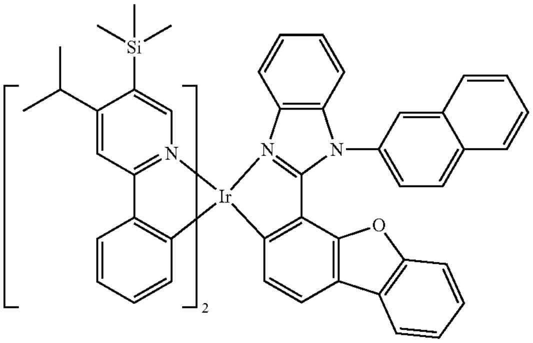
62
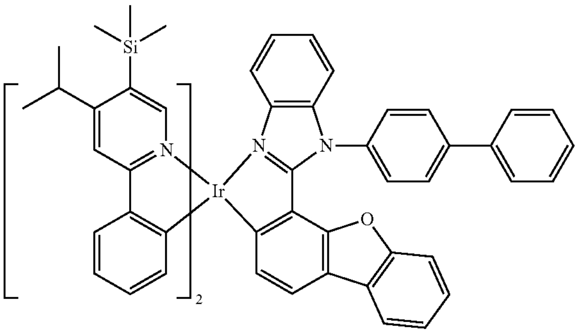

63
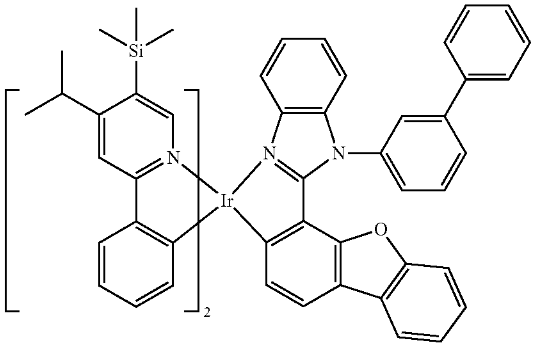
64
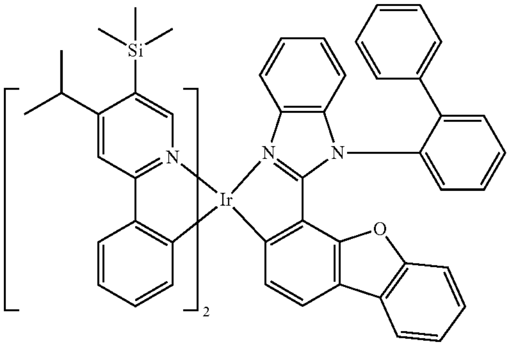
65
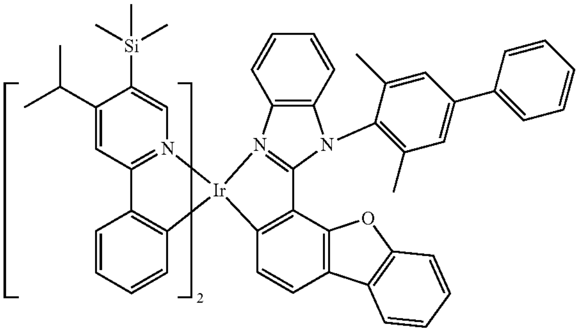
66
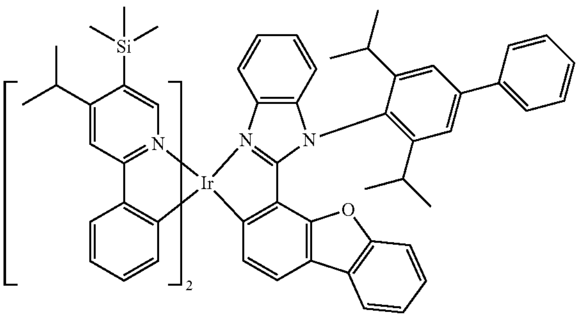
67
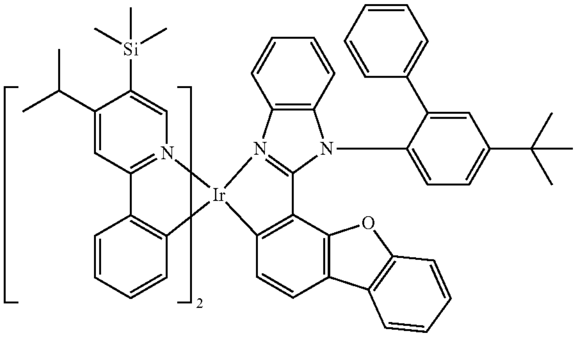
68
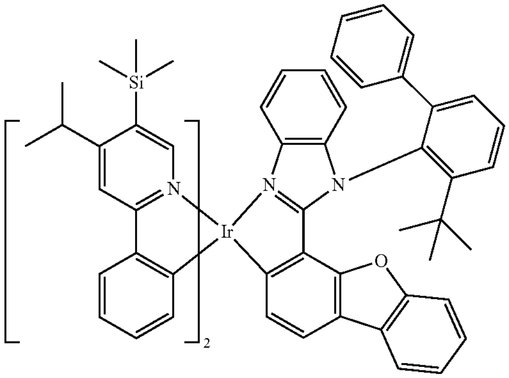
69
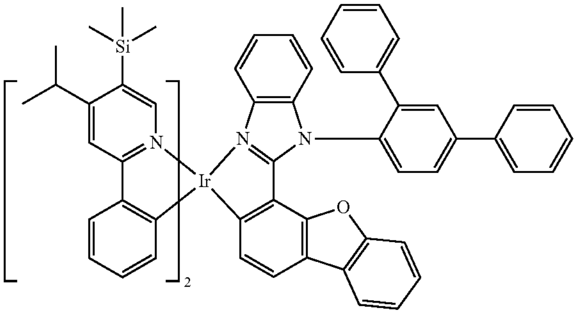
70
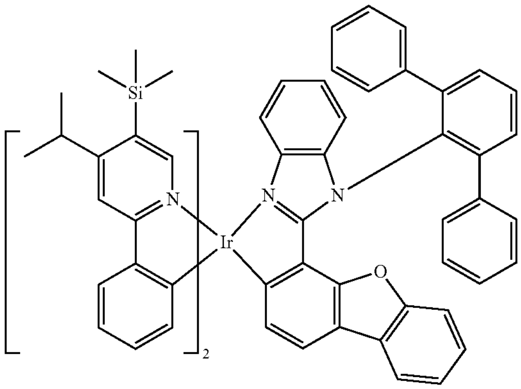

-continued
71
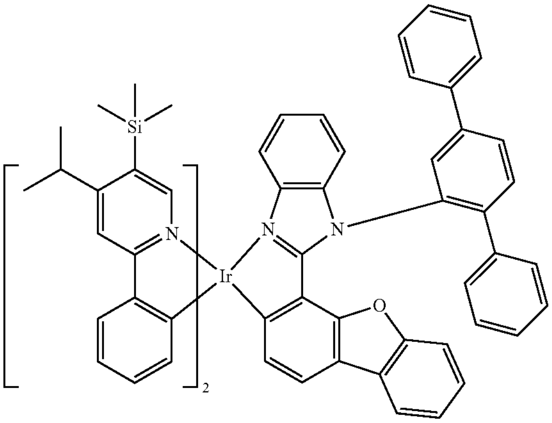
72
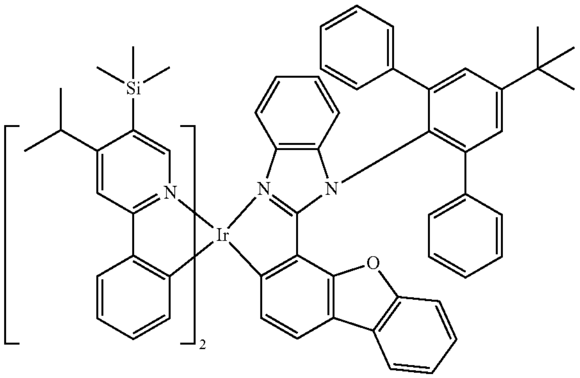
73
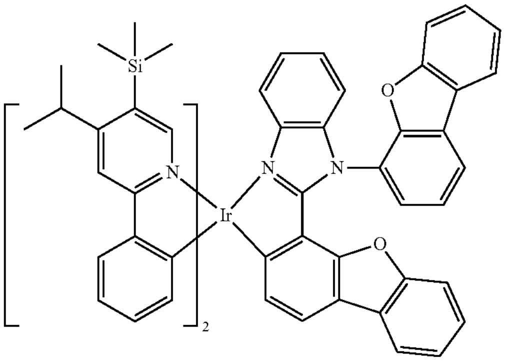
74
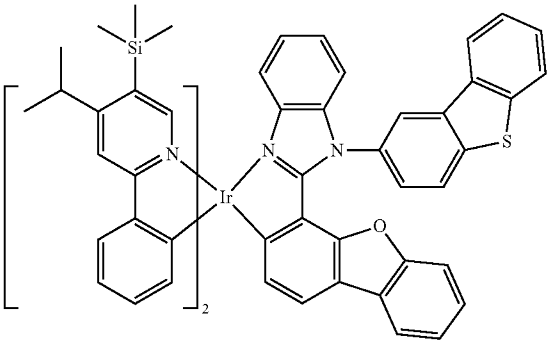
-continued
75
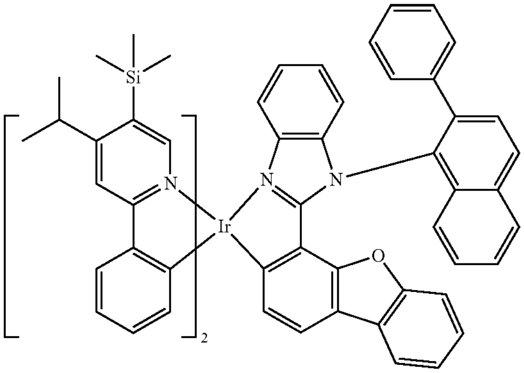
76
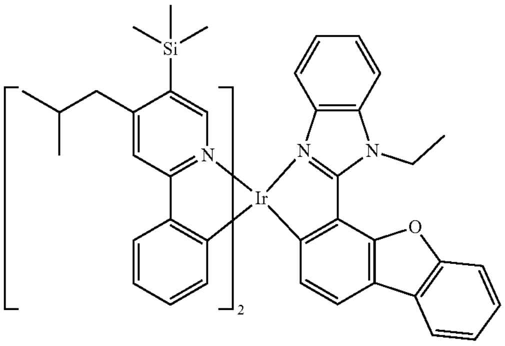
77
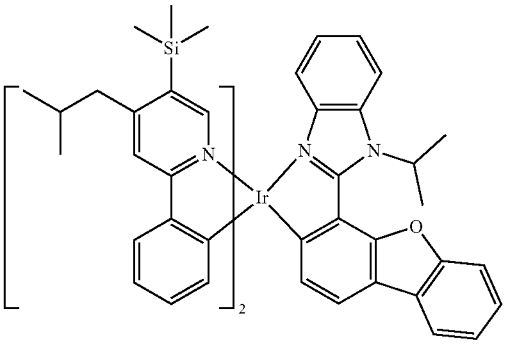
78
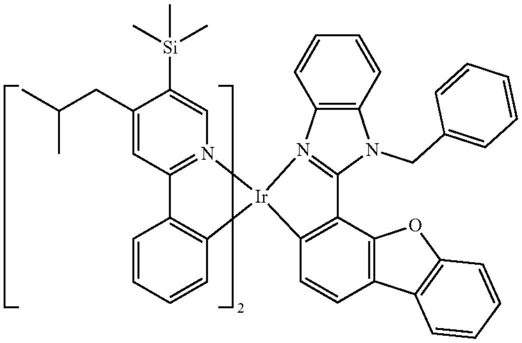

-continued
79
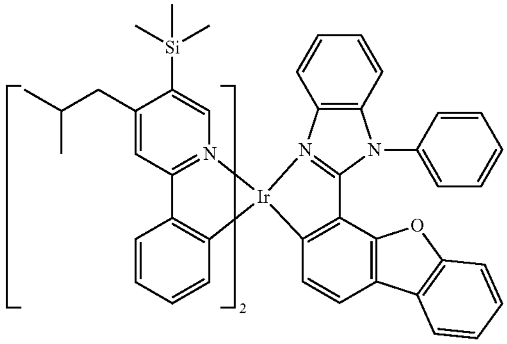
80
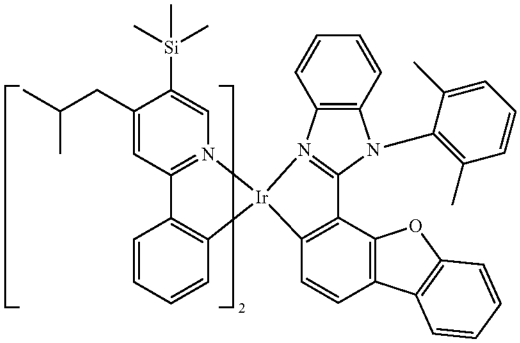
81
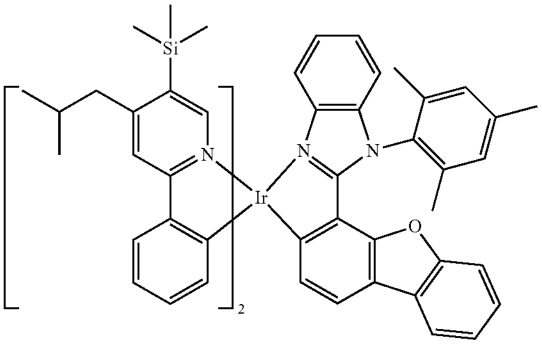
82
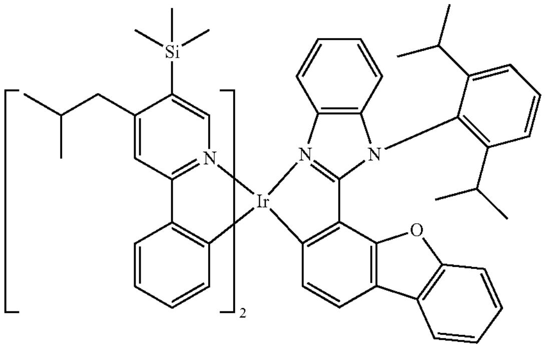
-continued
83
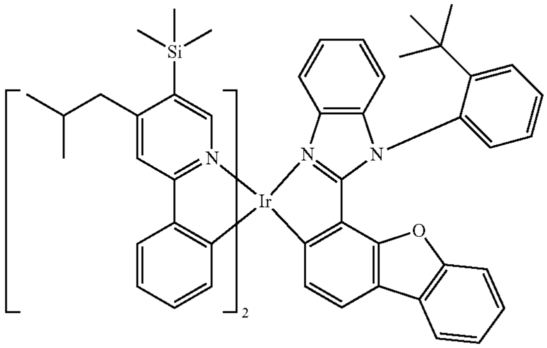
84
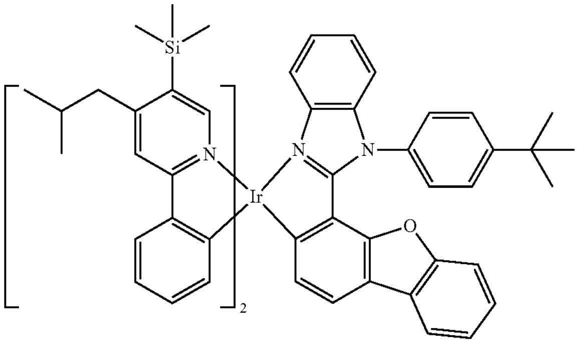
85
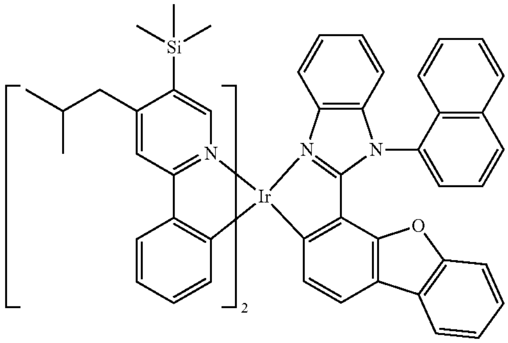
86
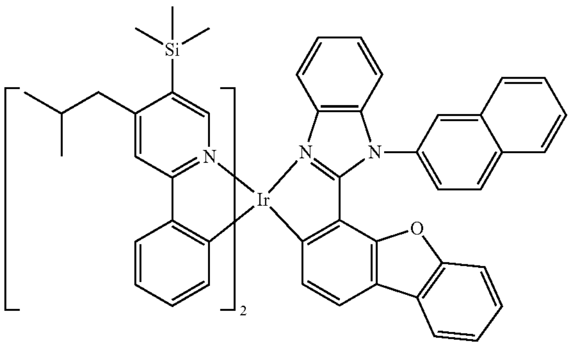

-continued
87
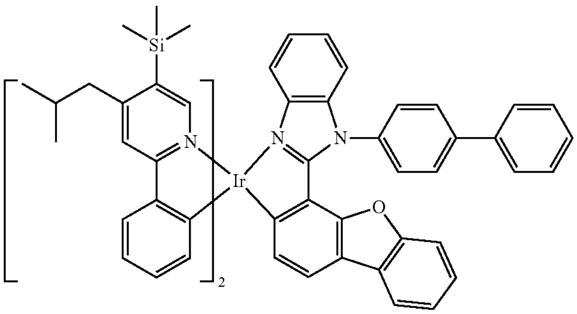
88
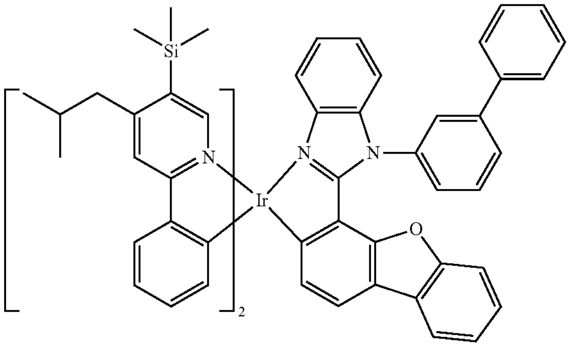
89
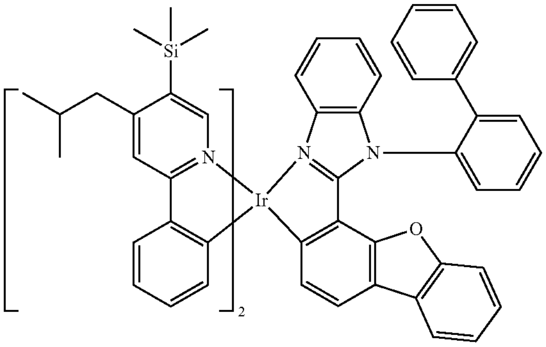
90
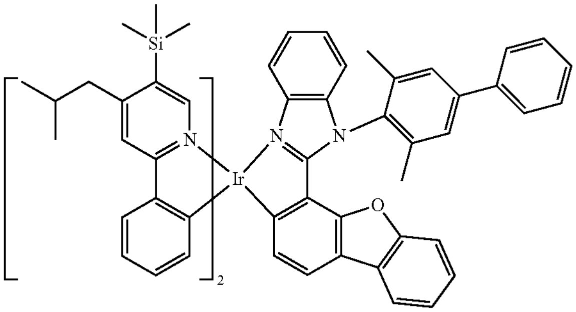
-continued
91
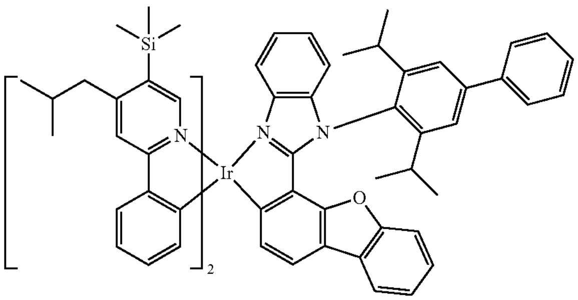
92
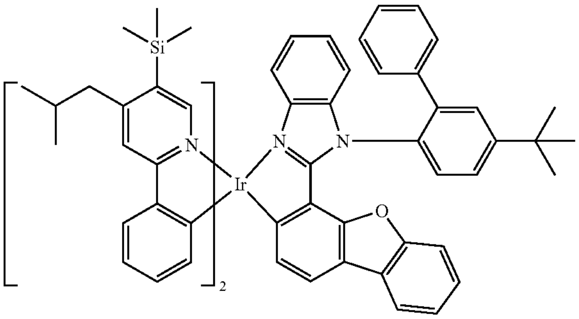
93
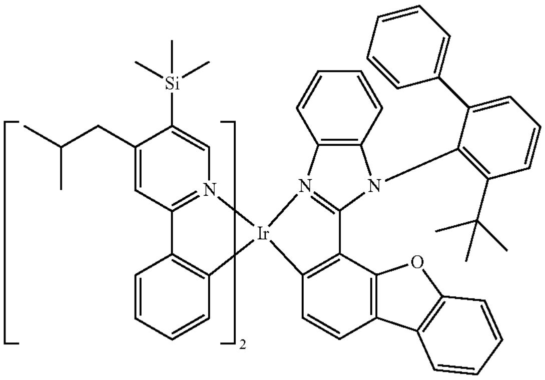
94
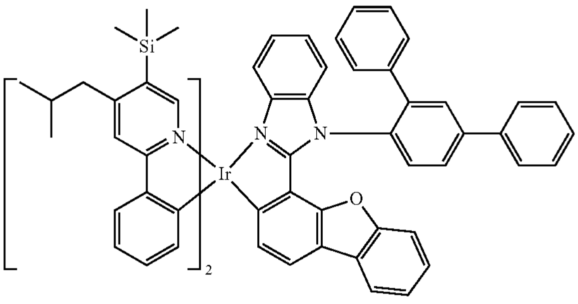

-continued
95
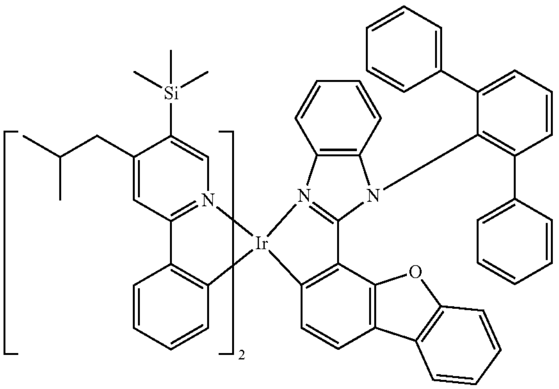
96
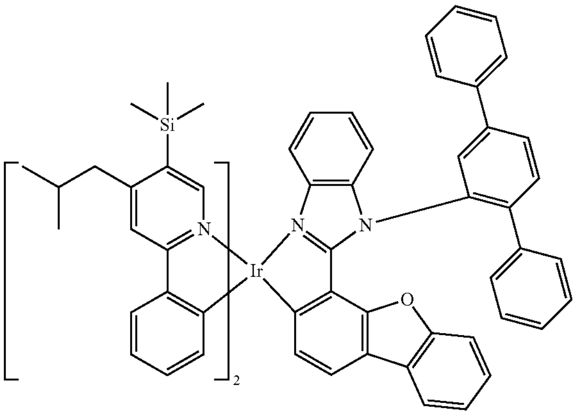
97
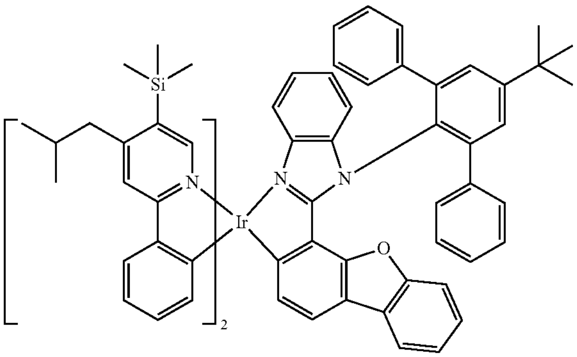
98
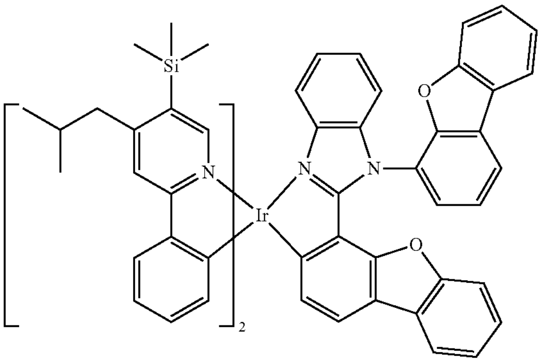
-continued
99
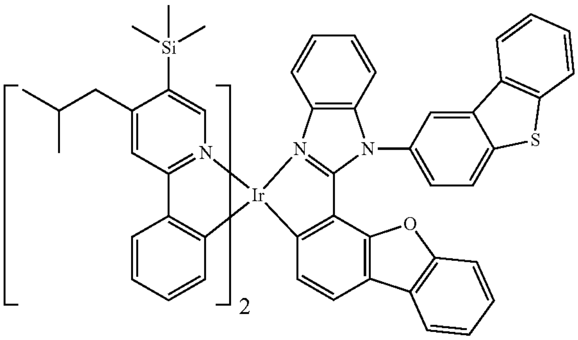
100
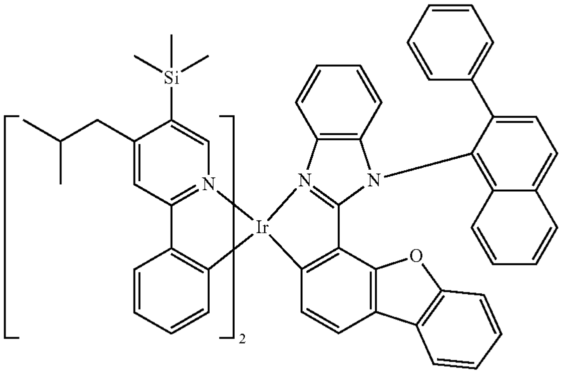
101
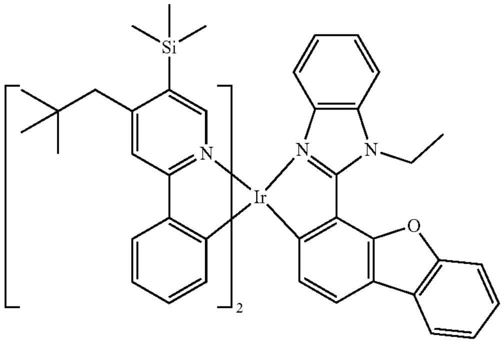
102
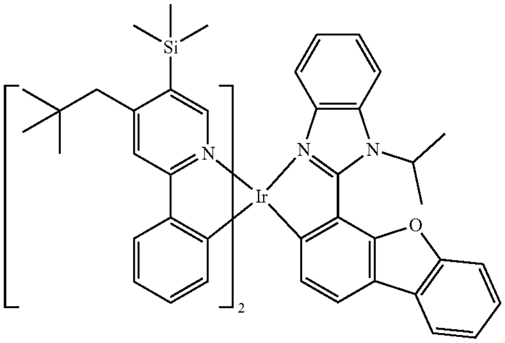

-continued
103
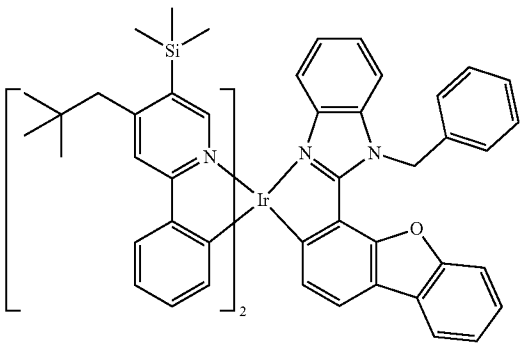
104
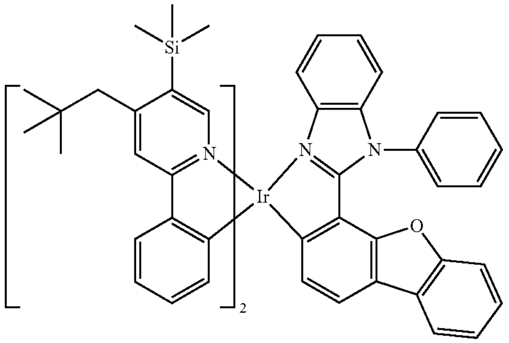
105
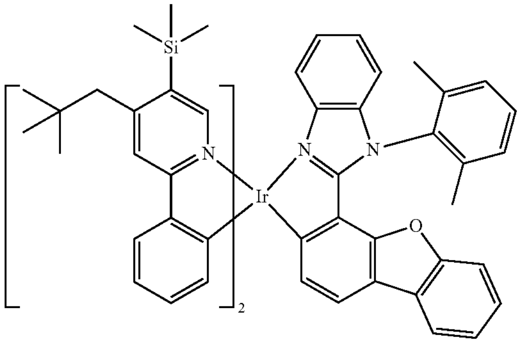
106
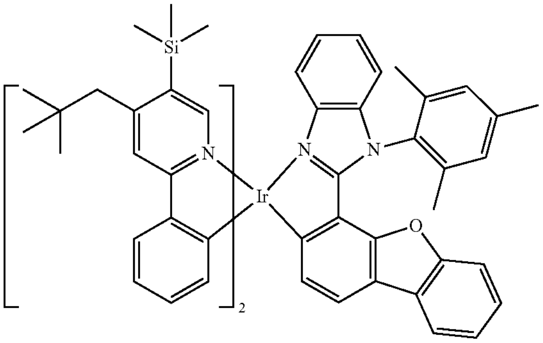
-continued
107
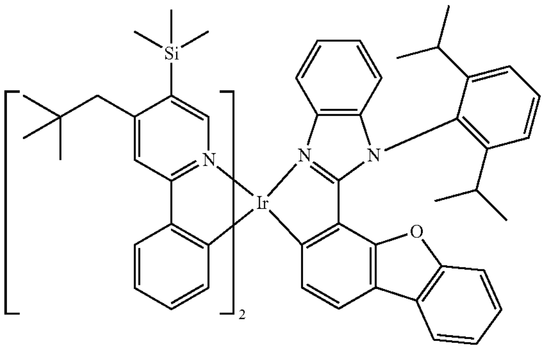
108
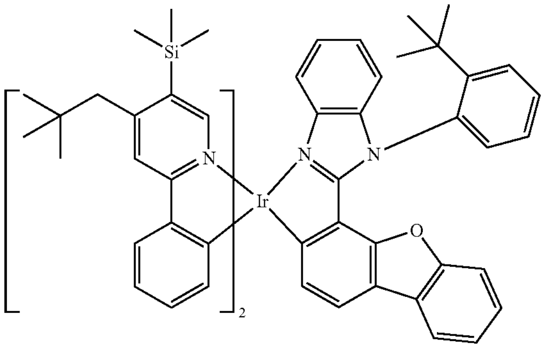
109
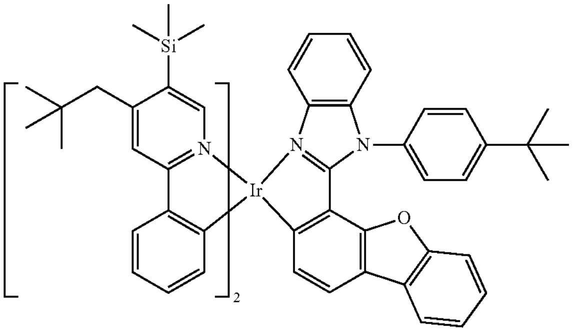
110
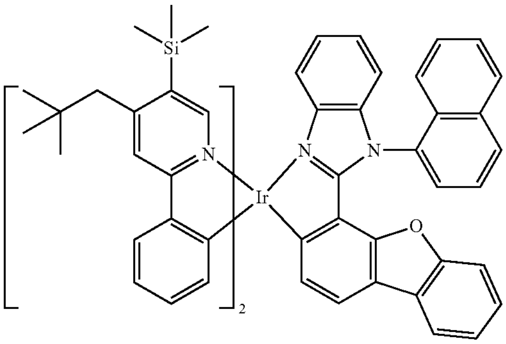

-continued
111
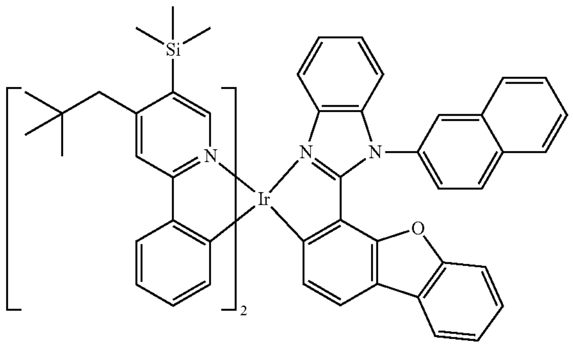
112
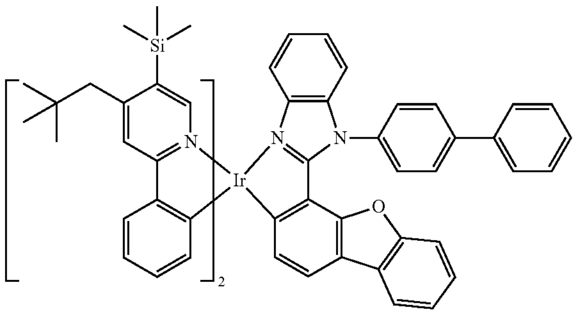
113
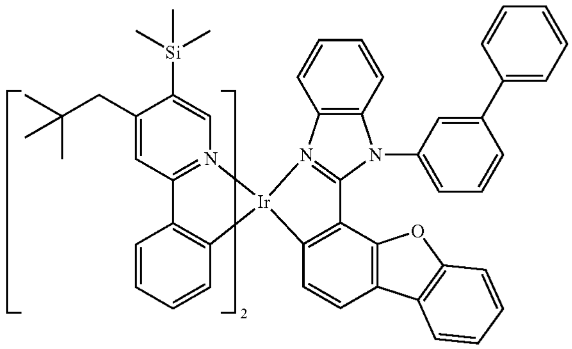
114
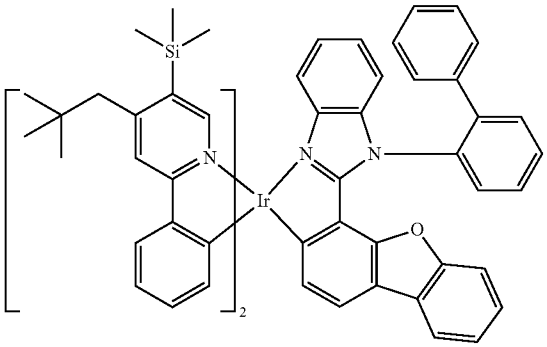
-continued
115
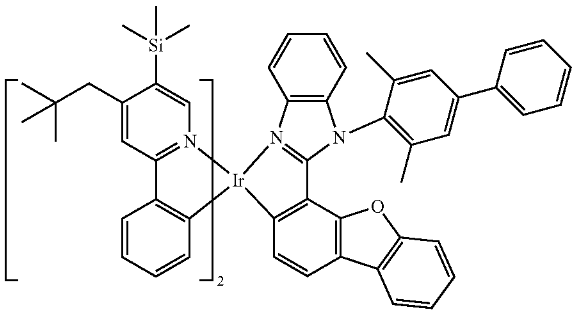
116
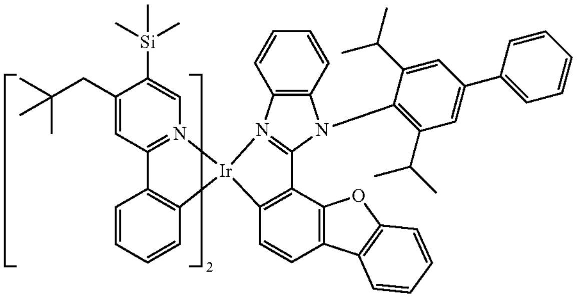
117
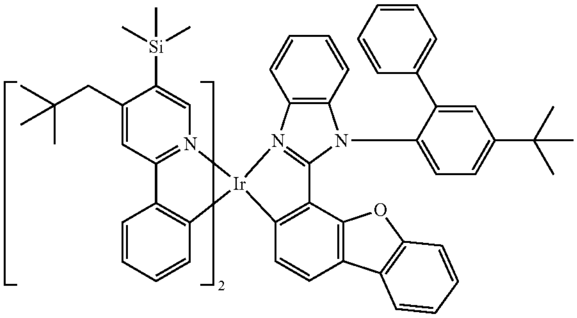
118
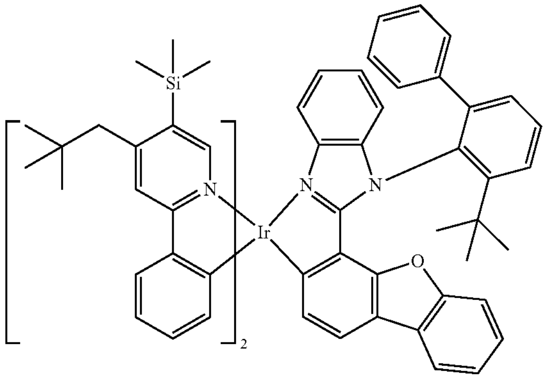

-continued
119
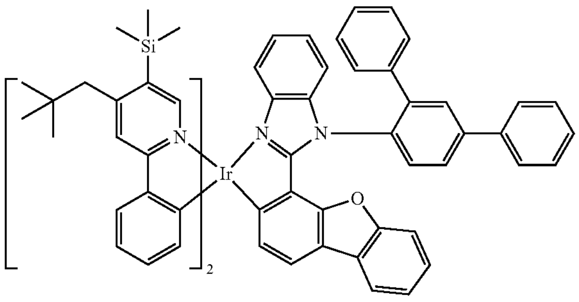
120
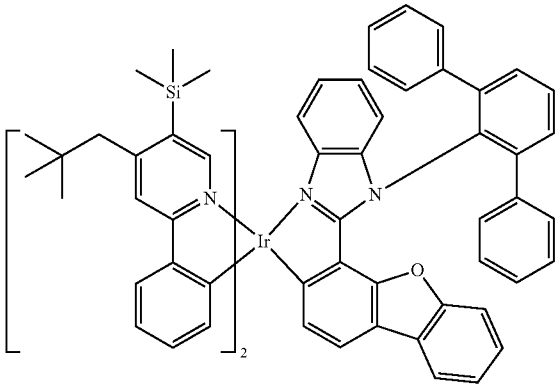
121
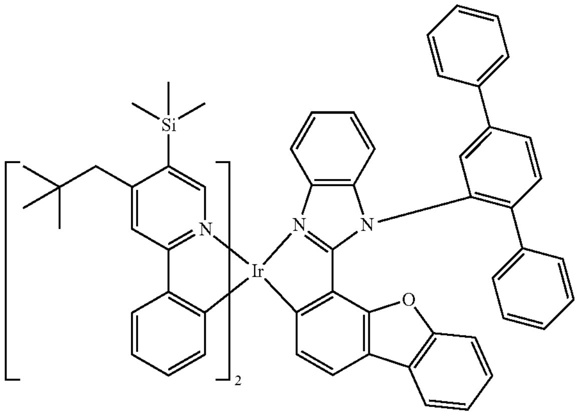
122
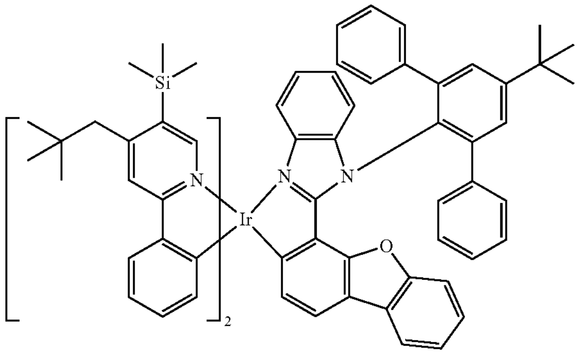
-continued
123
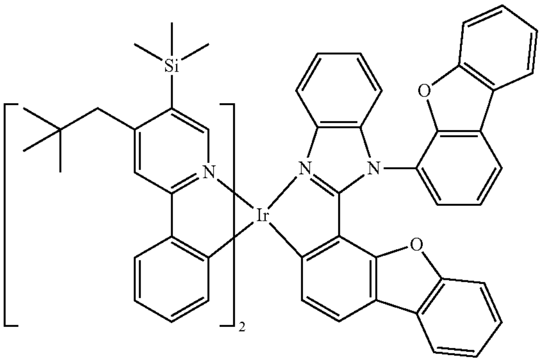
124
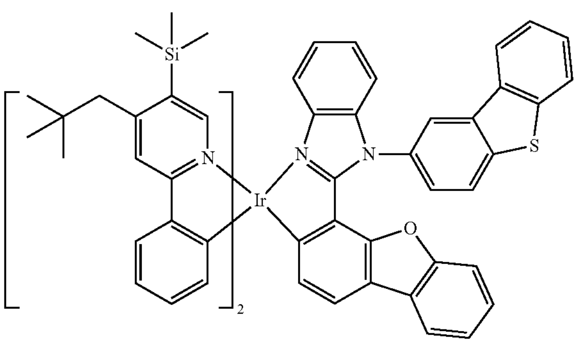
125
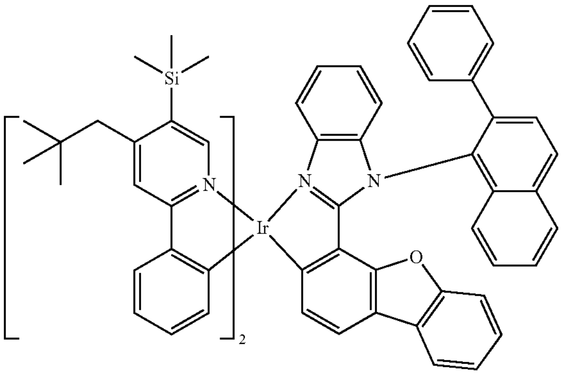
126
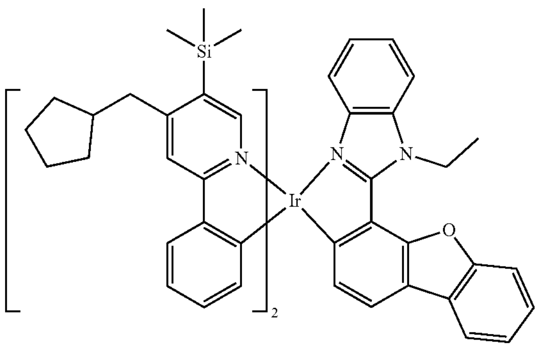

-continued
127
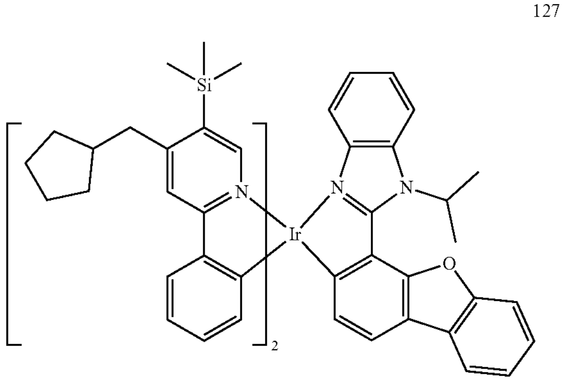
128
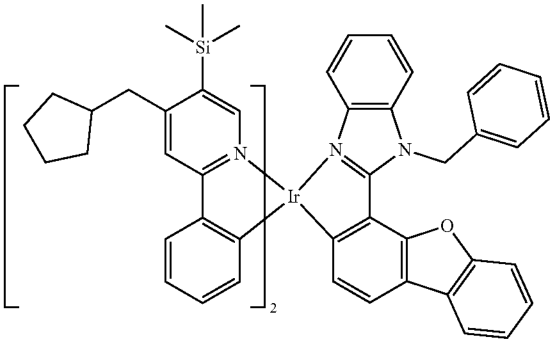
129
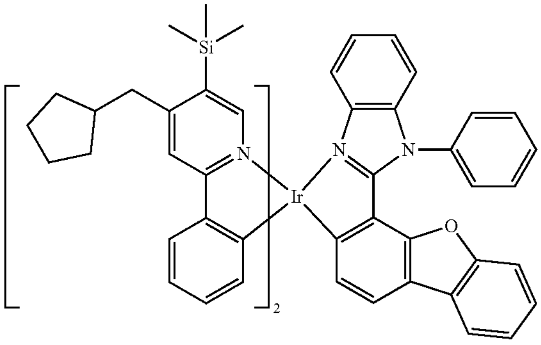
130
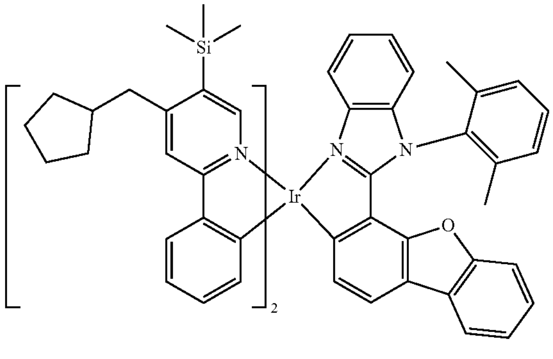
-continued
131
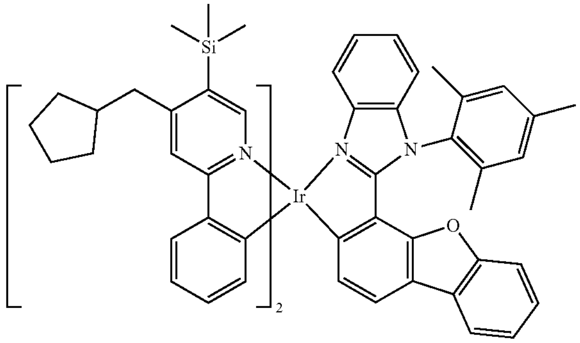
132
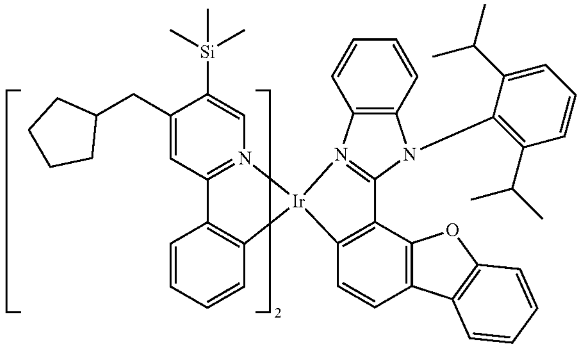
133
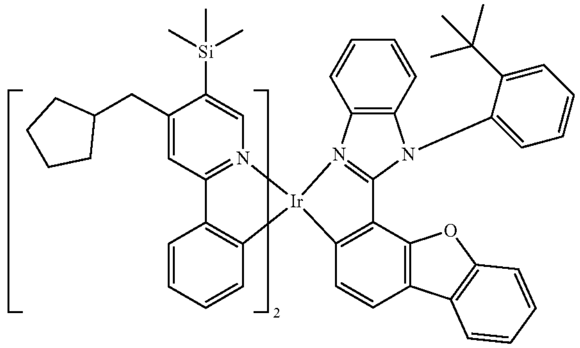
134
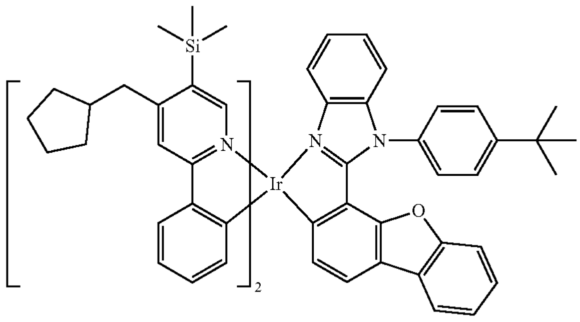

-continued
135
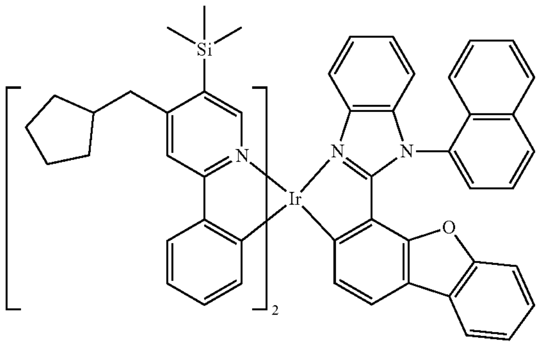
136
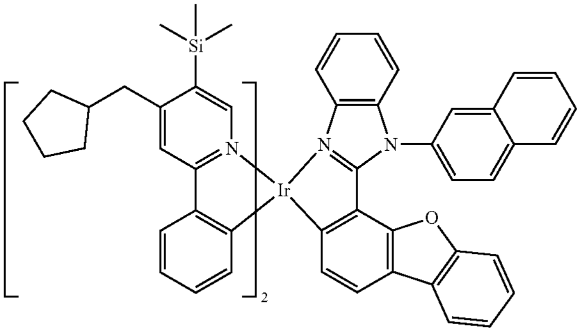
137
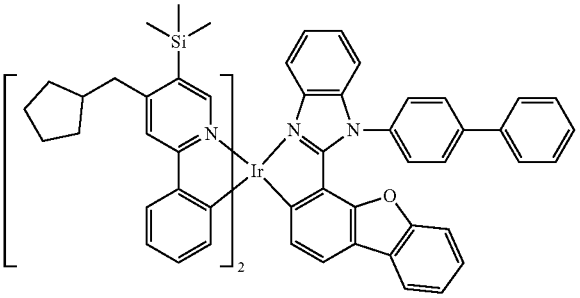
138
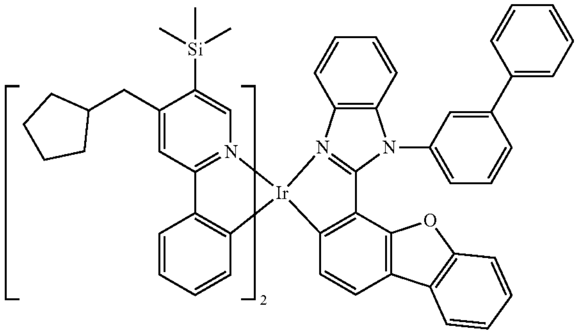
-continued
139
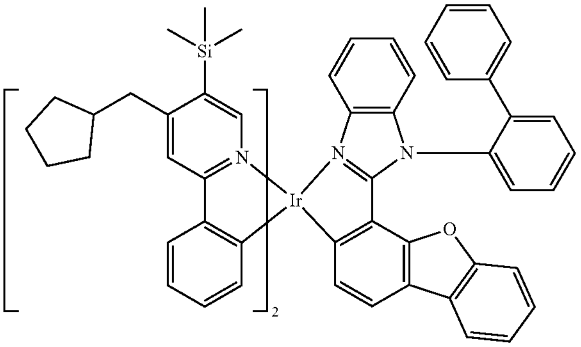
140
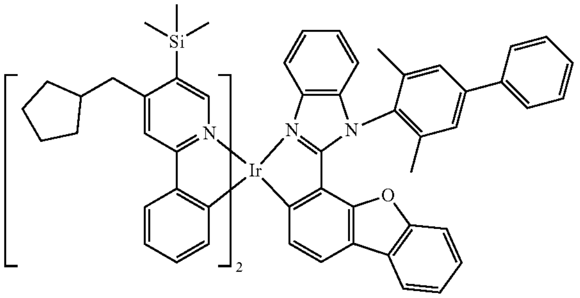
141
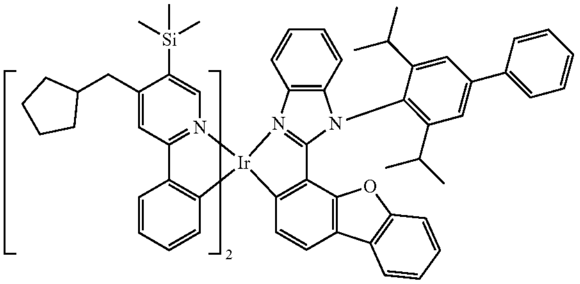
142
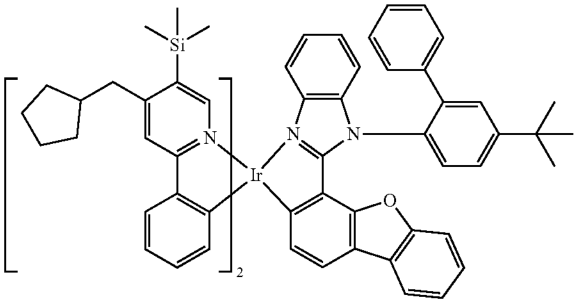

-continued
143
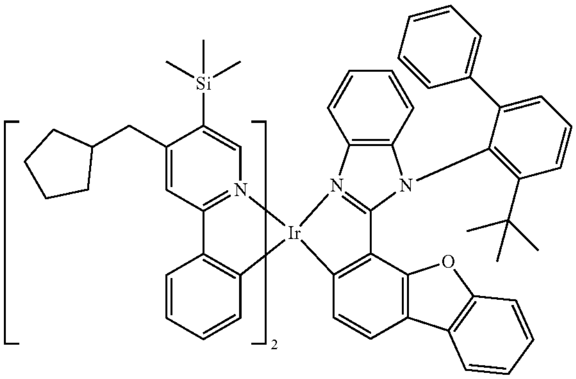
144
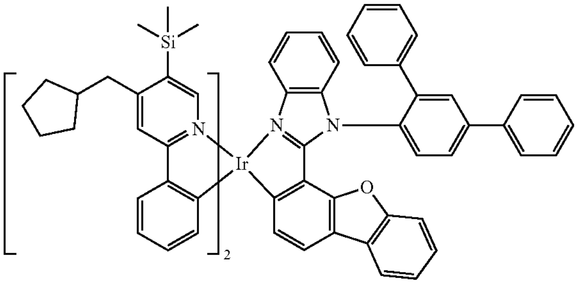
145
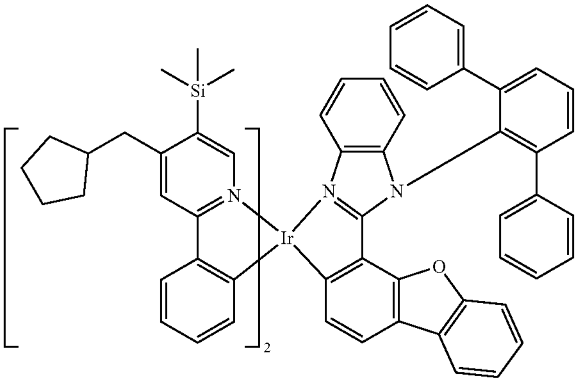
146
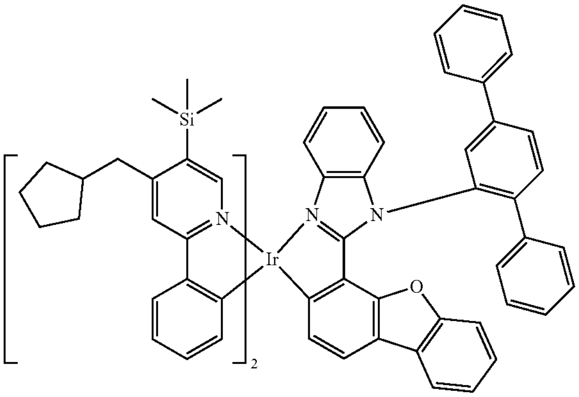
-continued
147
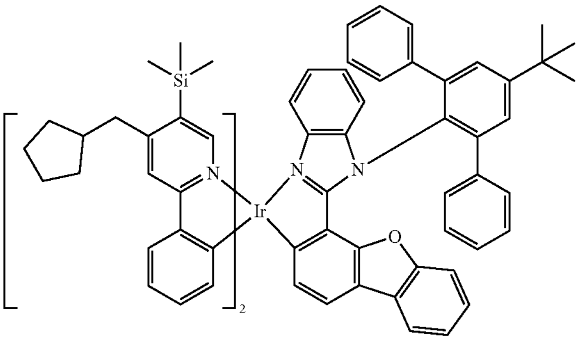
148
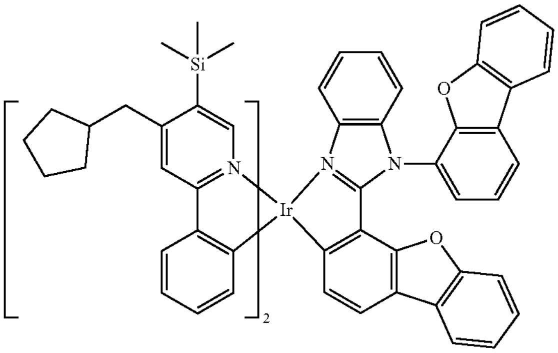
149
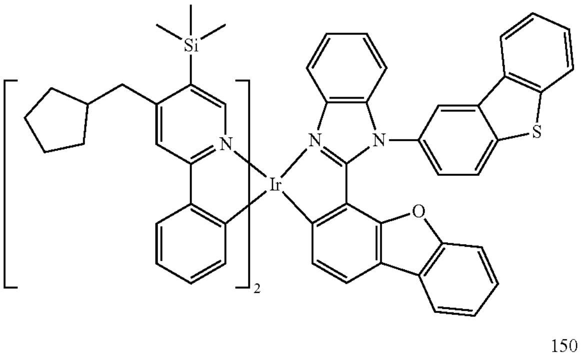
150
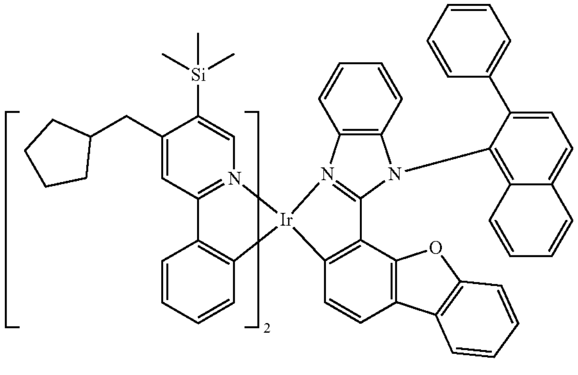

-continued
151
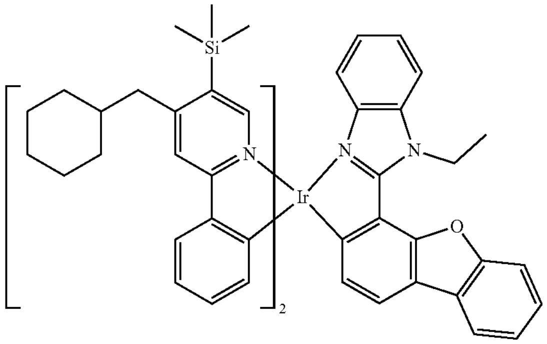
152
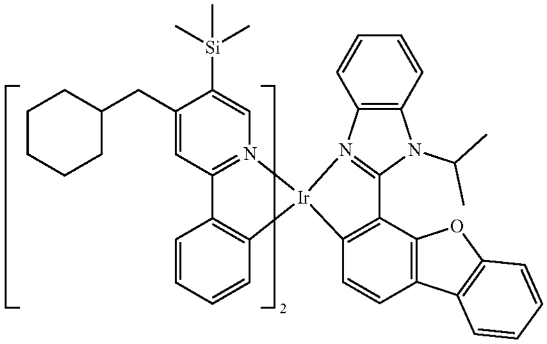
153
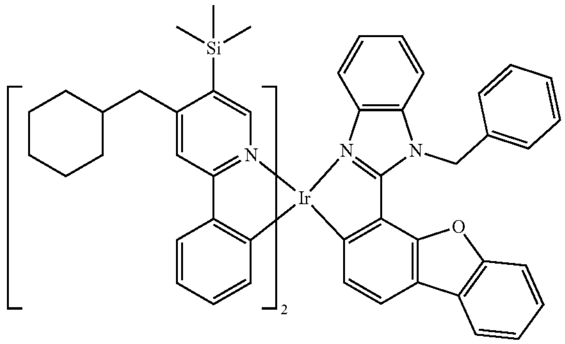
154
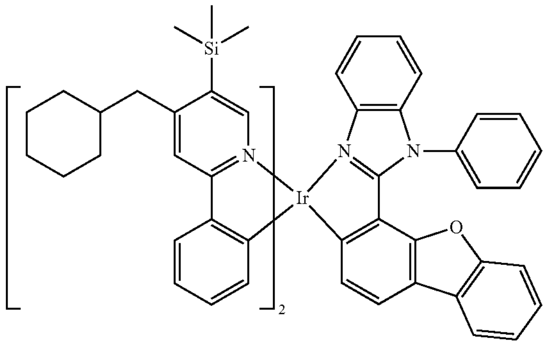
-continued
155
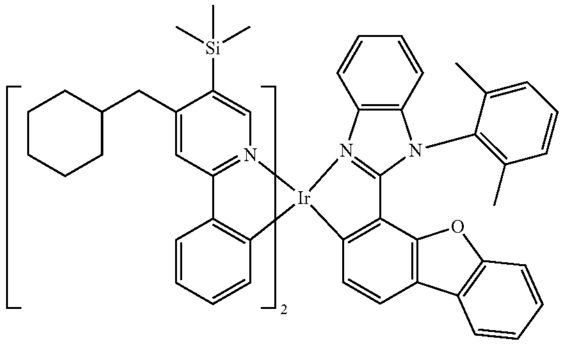
156
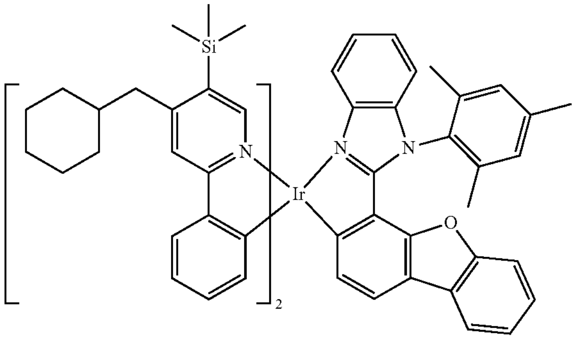
157
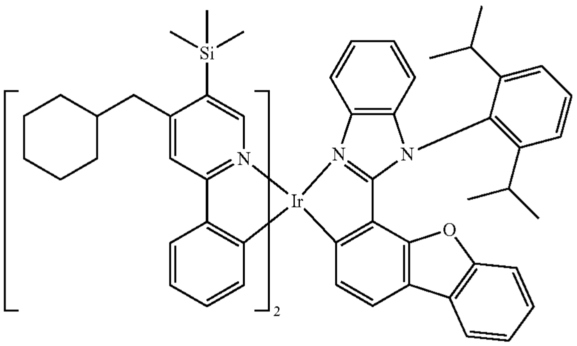
158
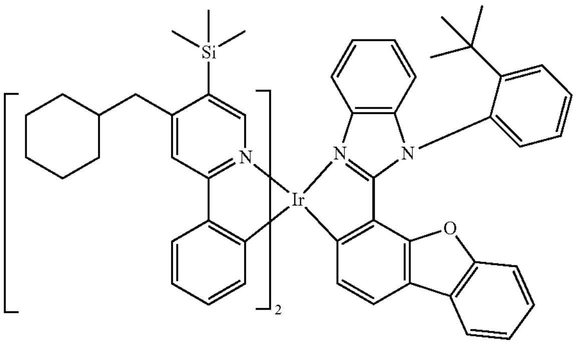

-continued
159
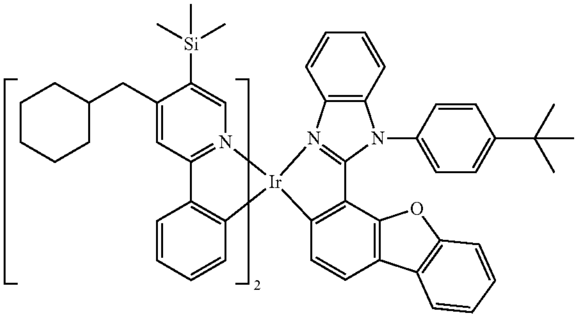
160
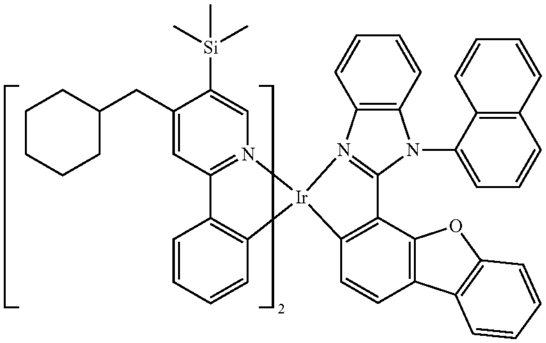
161
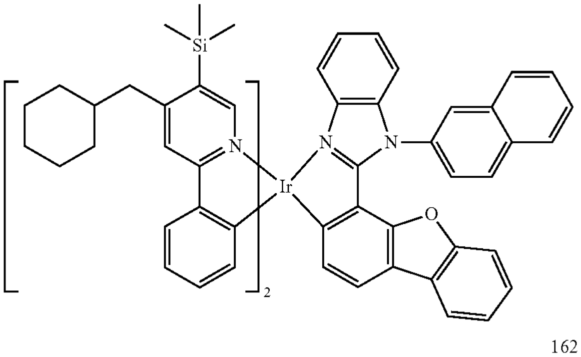
162
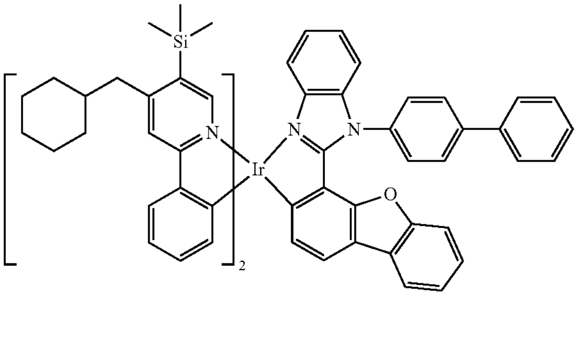
-continued
163
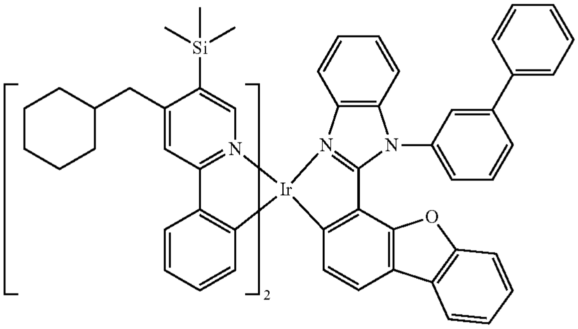
164
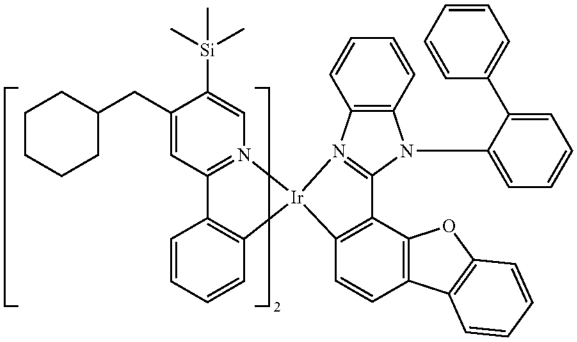
165
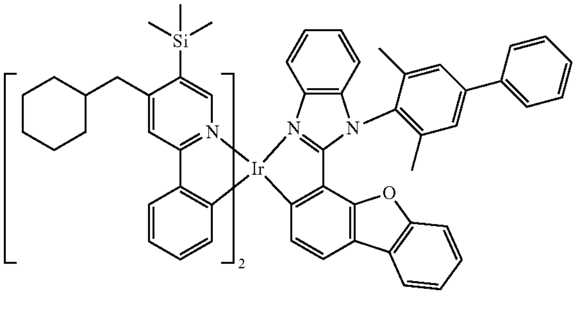
166
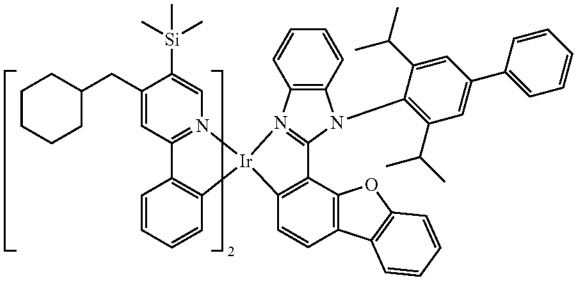

167
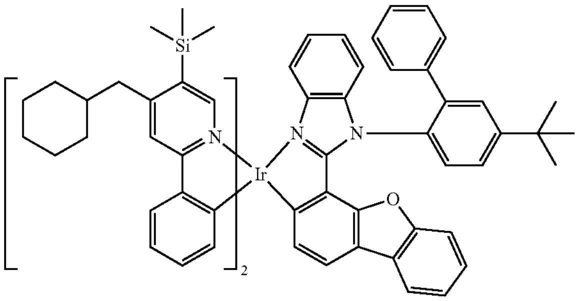
168
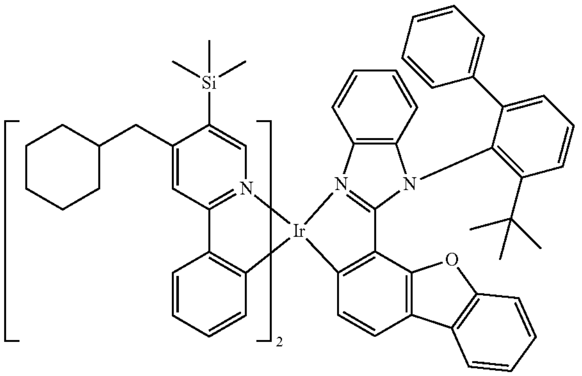
169
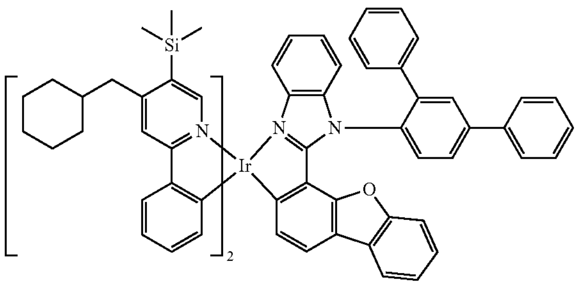
170
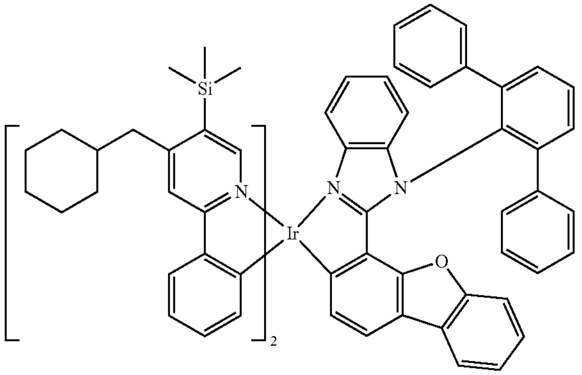
171
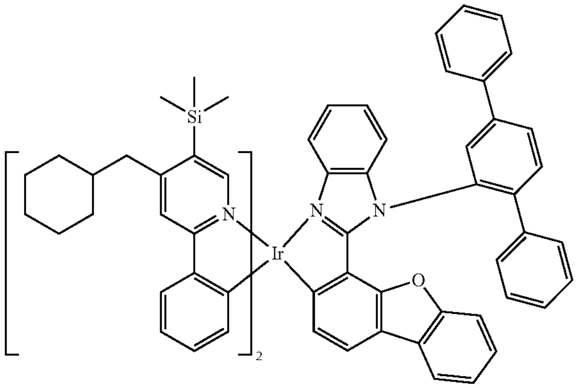
172
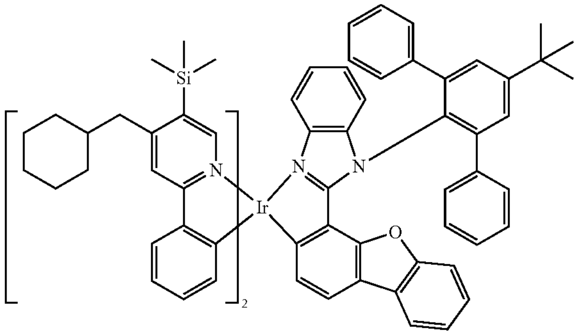
173
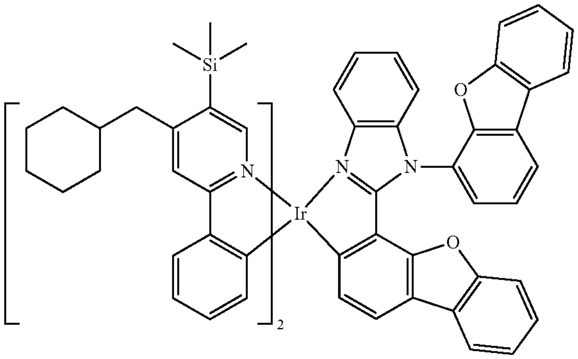
174
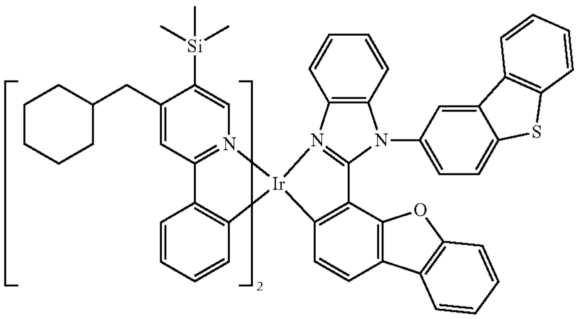

-continued
175
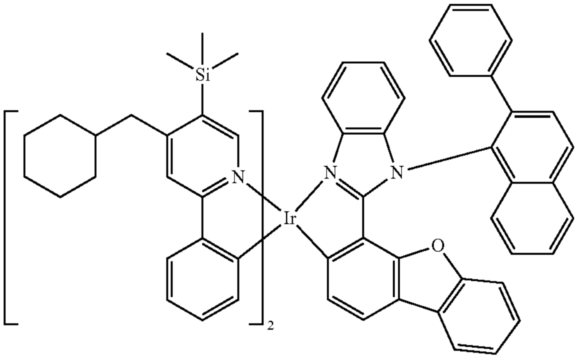
176
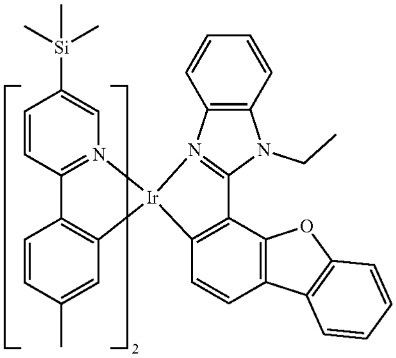
177
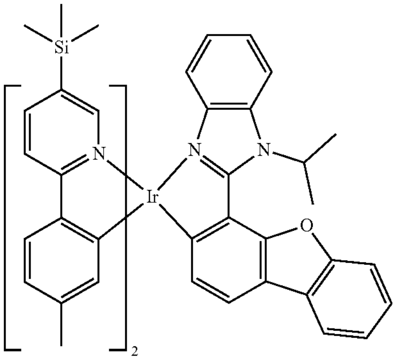
178
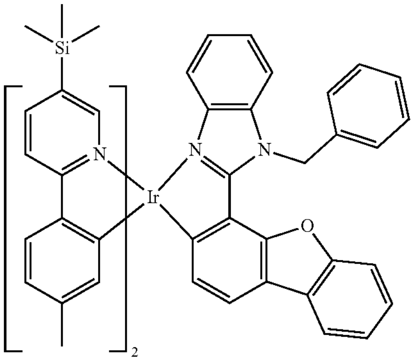
-continued
179
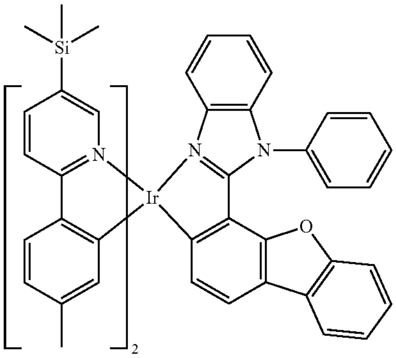
180
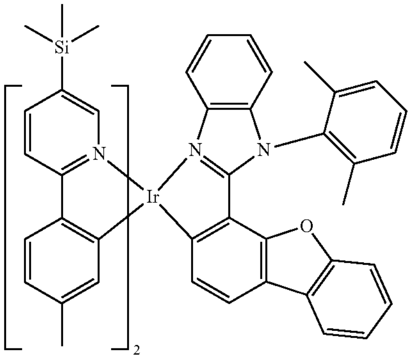
181
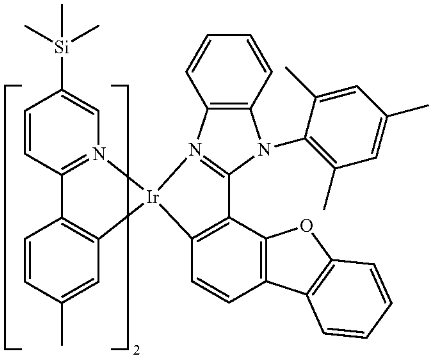
182
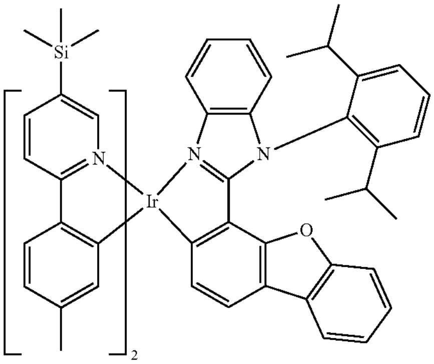

-continued
183
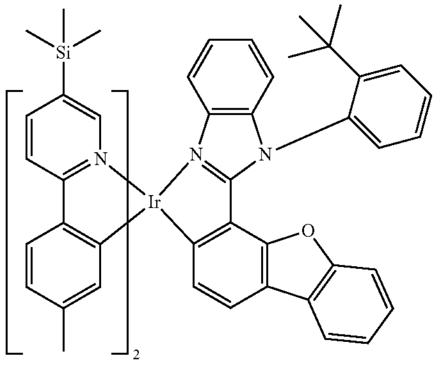
184
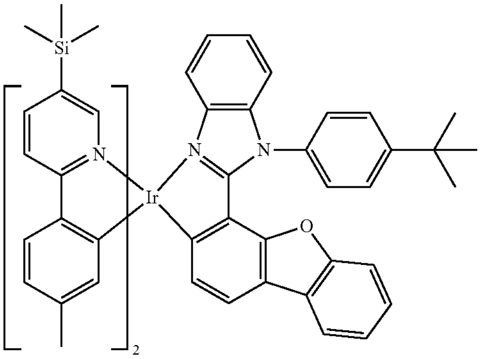
185
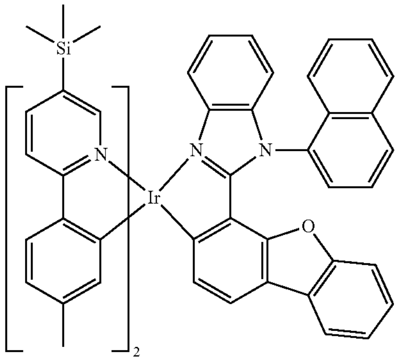
186
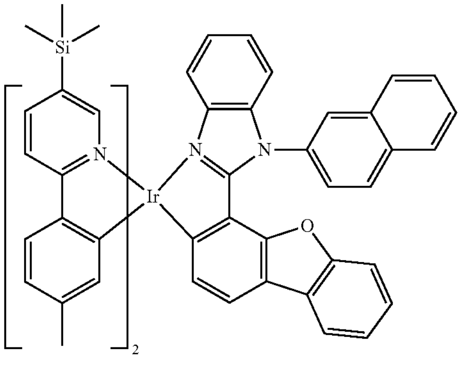
-continued
187
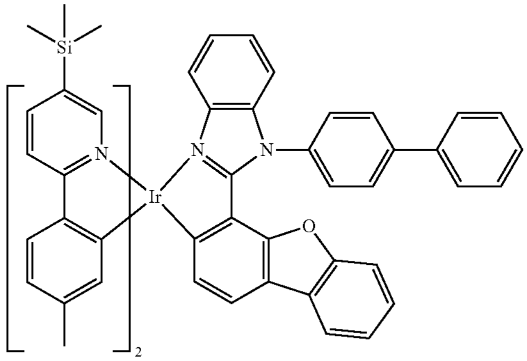
188
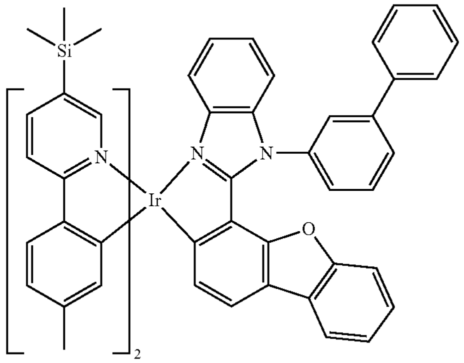
189
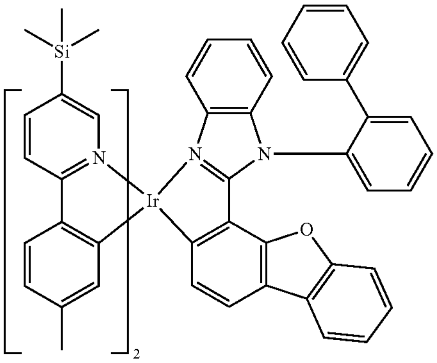
190
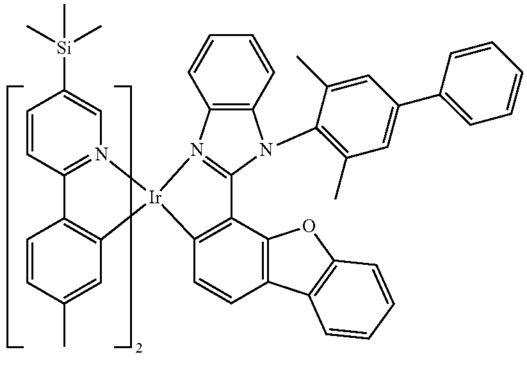

-continued
191
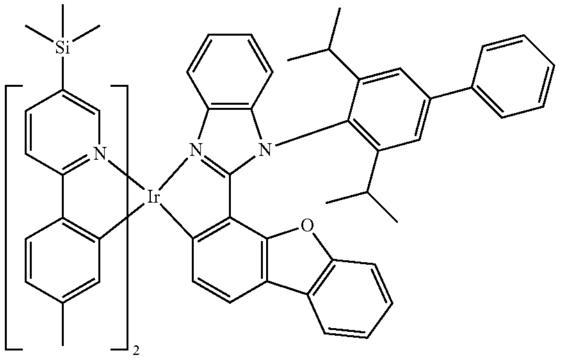
192
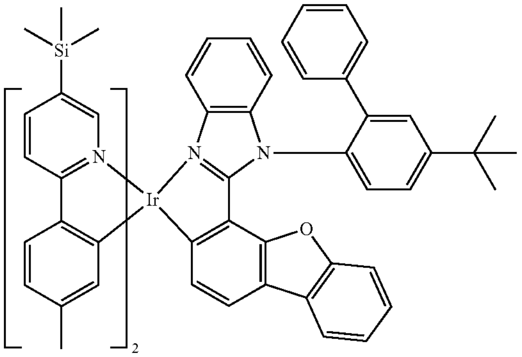
193
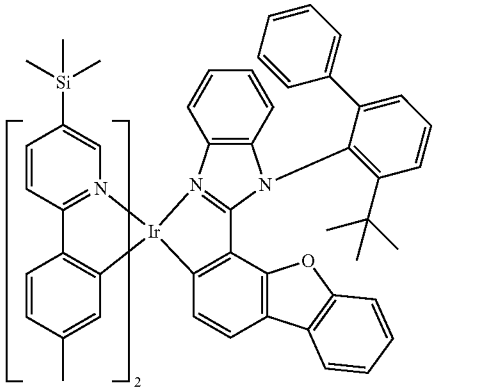
194
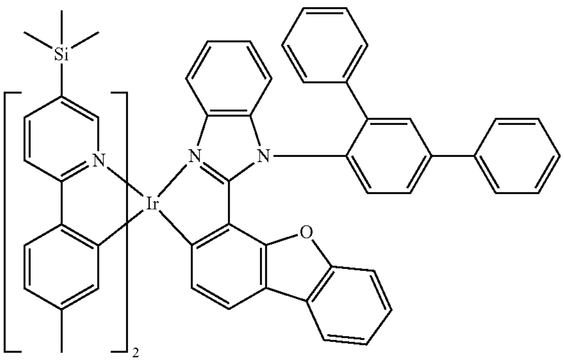
-continued
195
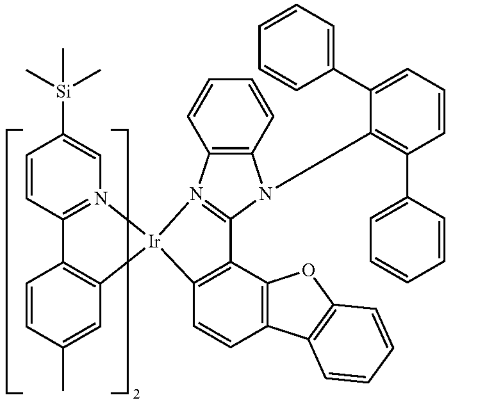
196
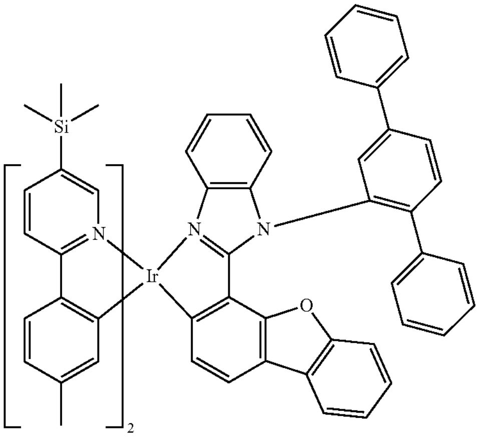
197
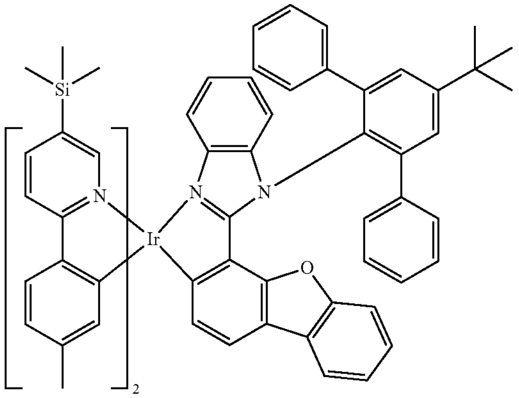
198
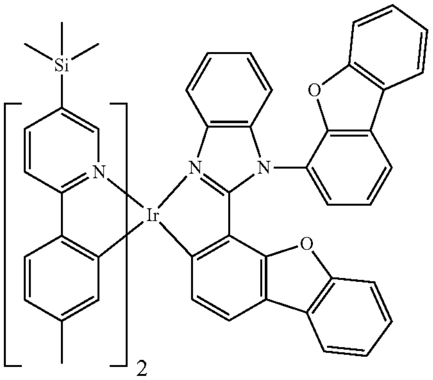

199
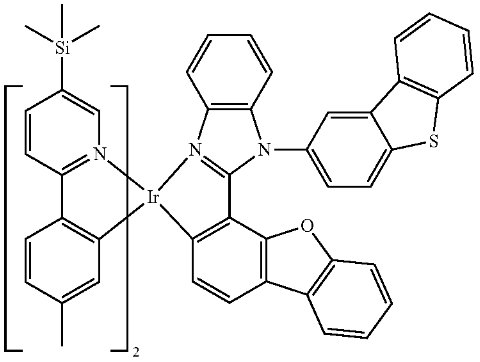
200
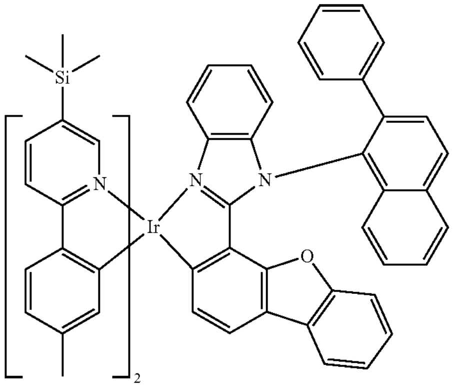
201
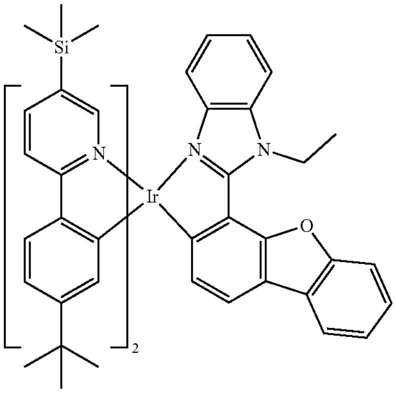
202
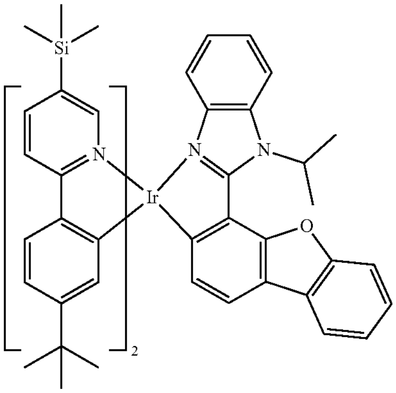
203
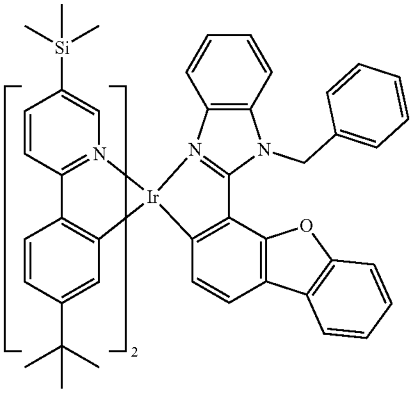
204
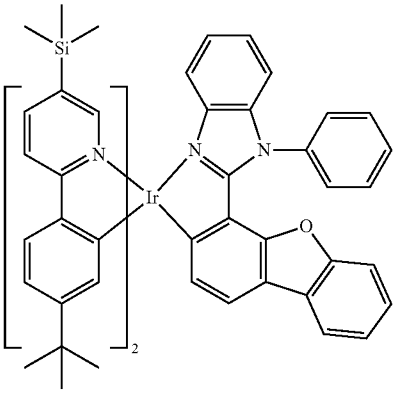
205
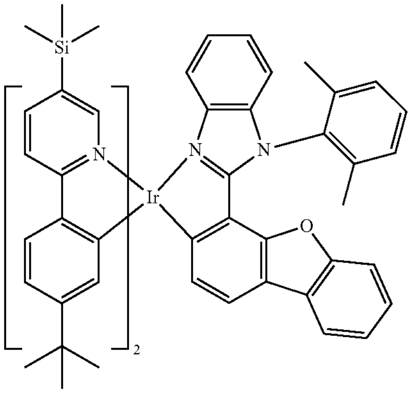
206
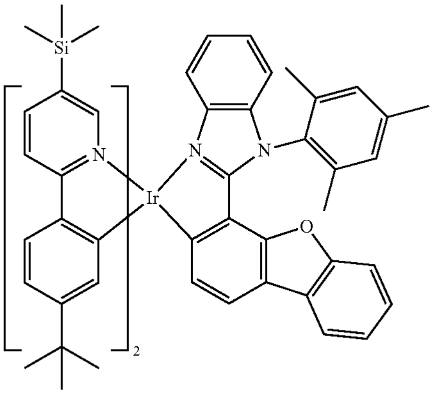

-continued
207
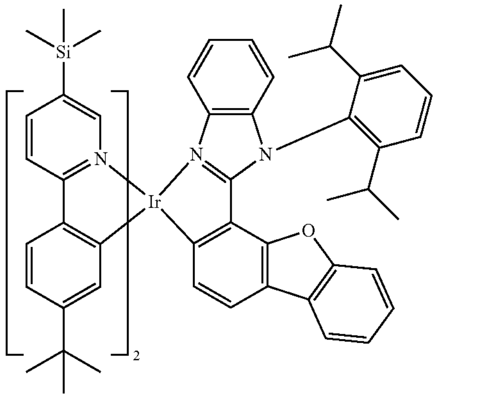
208
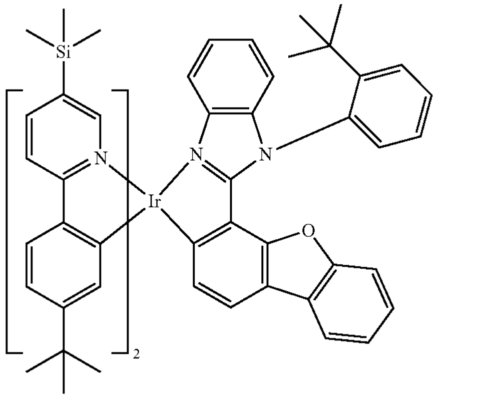
209
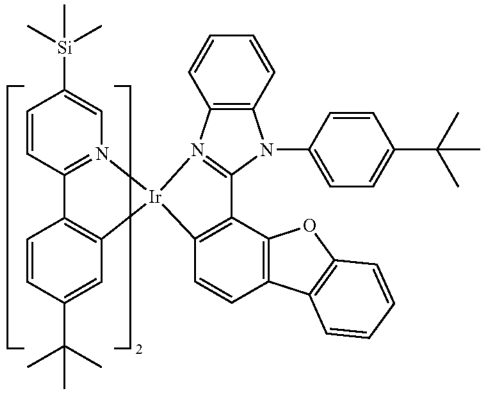
210
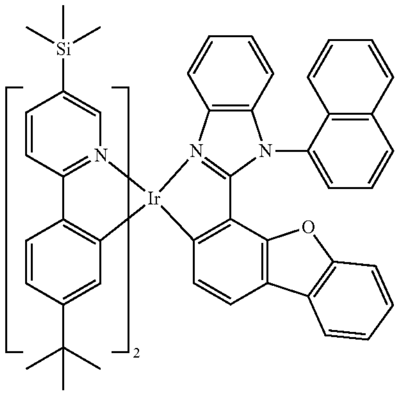
-continued
211
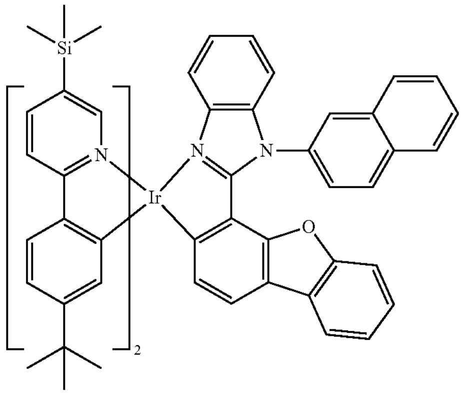
212
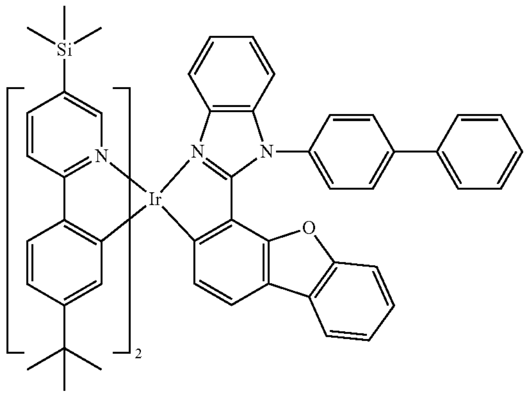
213
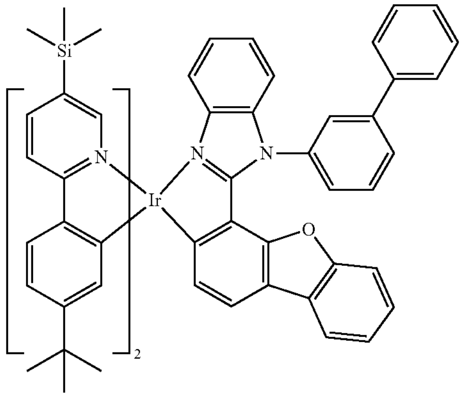
214
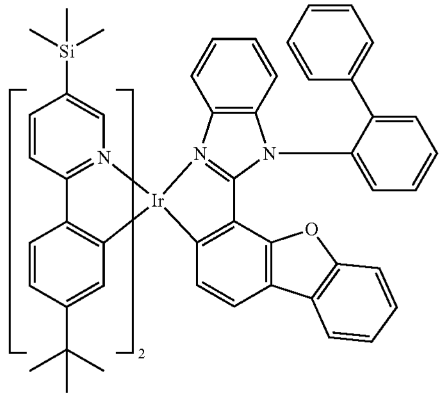

-continued
215
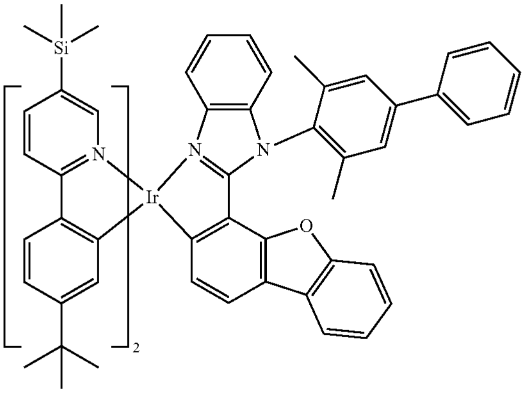
216
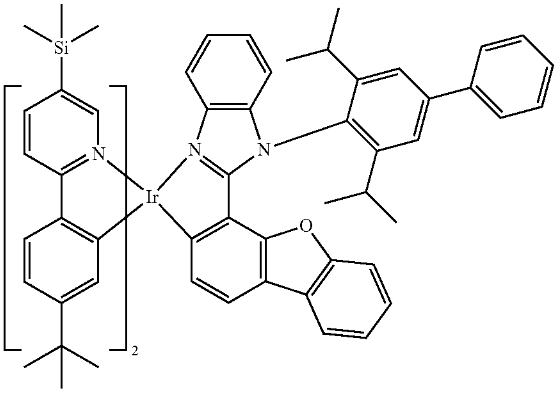
217
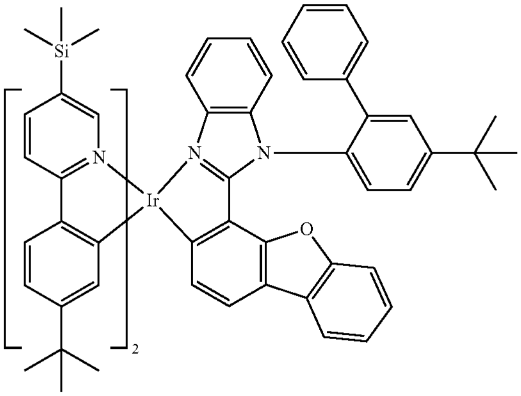
-continued
218
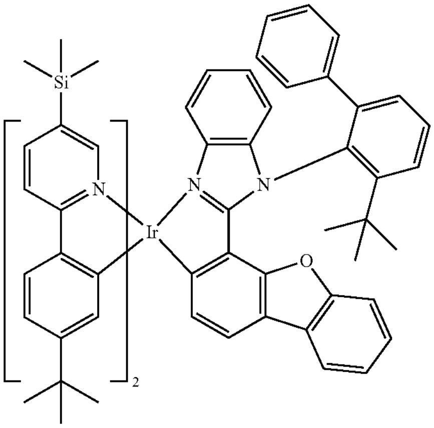
219
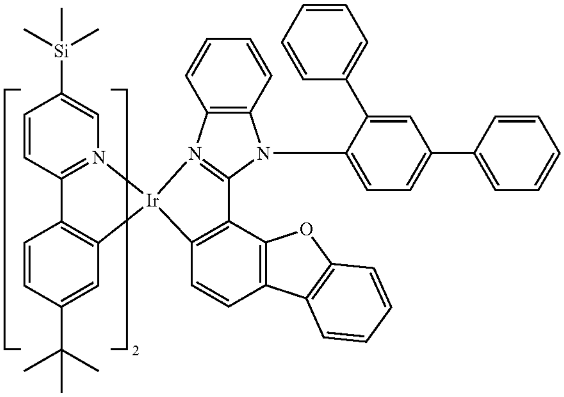
220
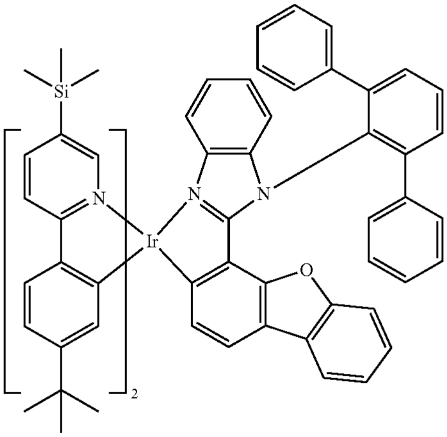

-continued
221
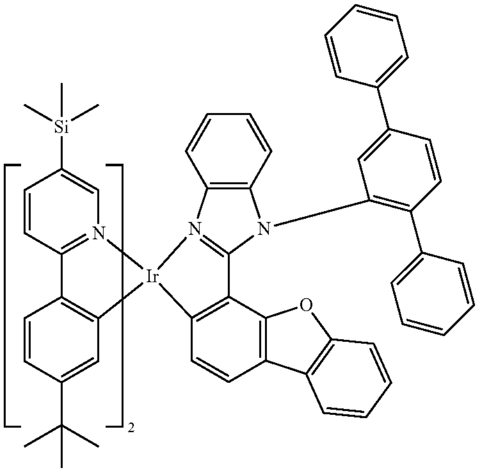
222
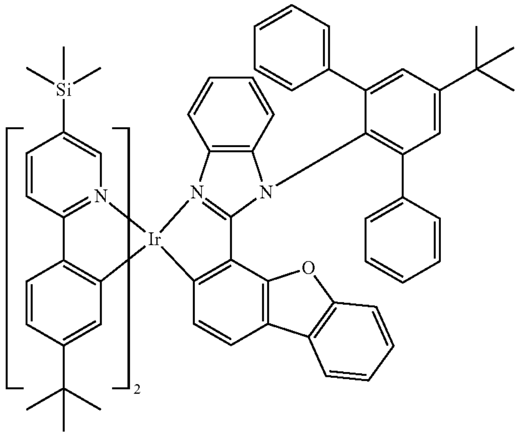
223
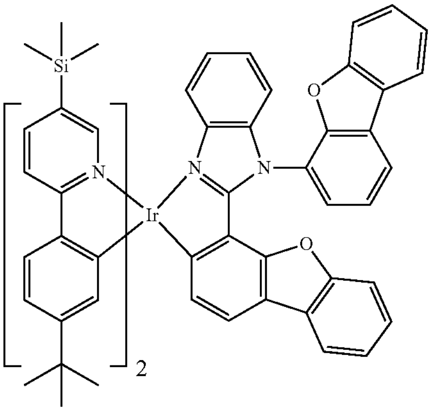
-continued
224
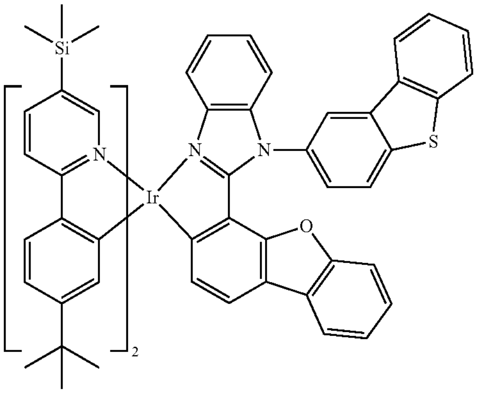
225
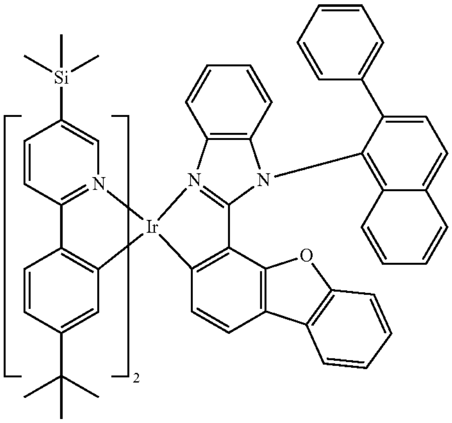
226
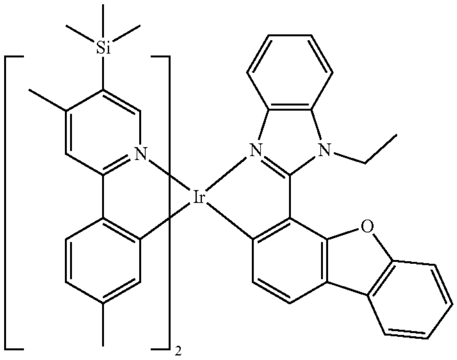
227
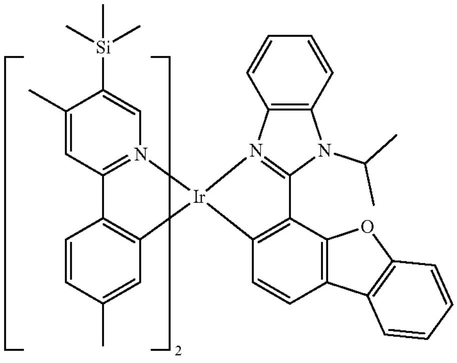

-continued
228
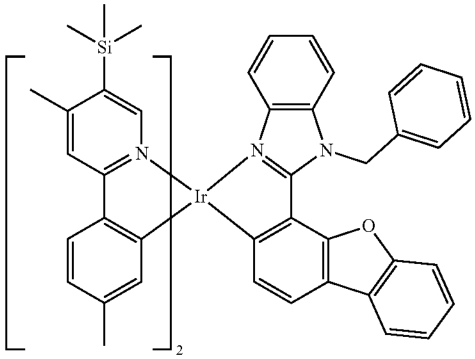
229
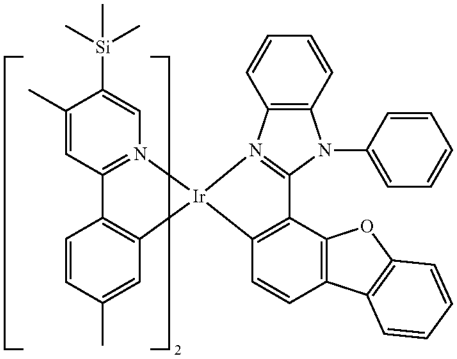
230
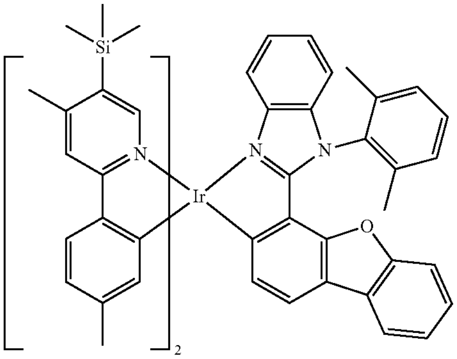
231
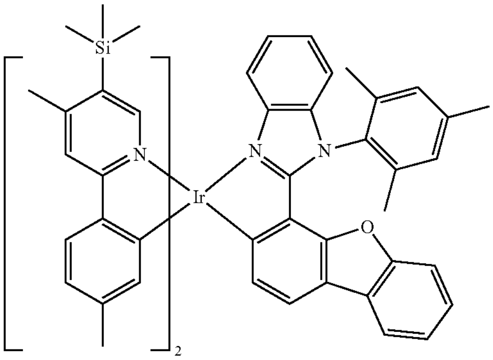
-continued
232
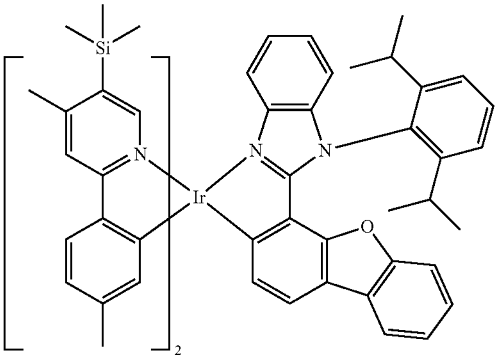
233
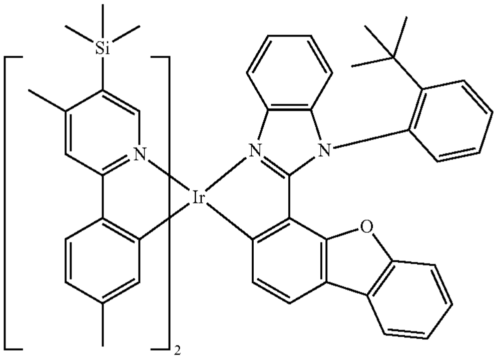
234
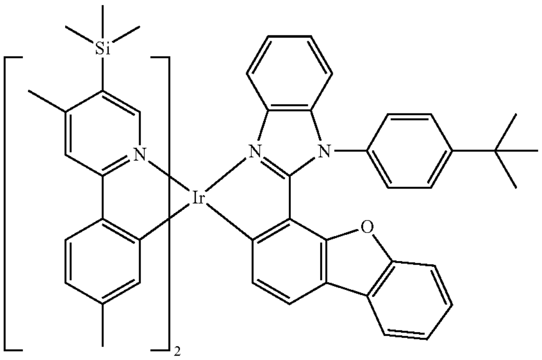
235
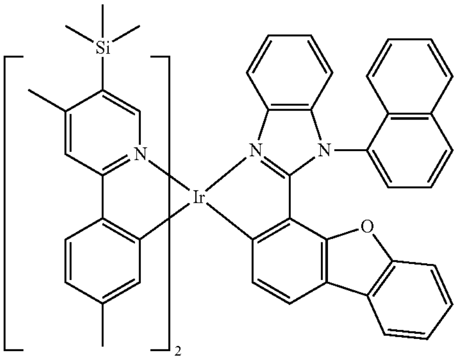

236
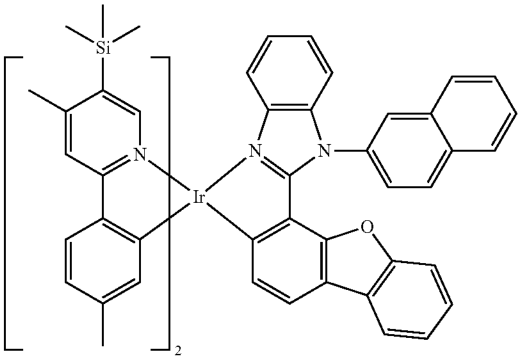
237
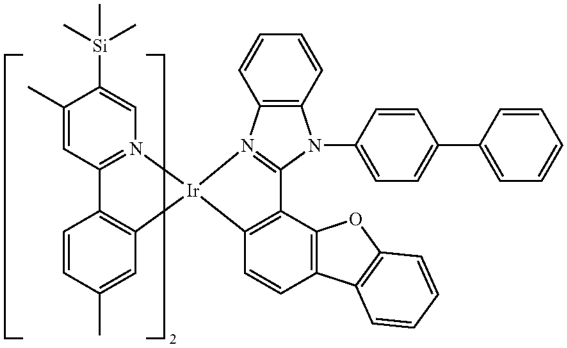
238
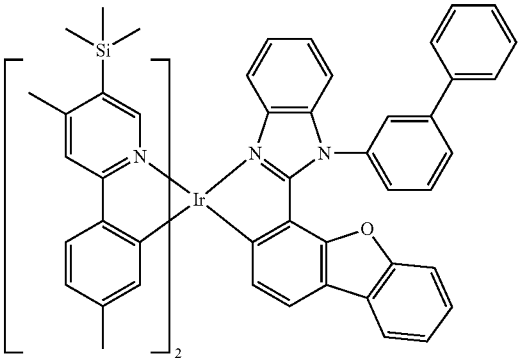
239
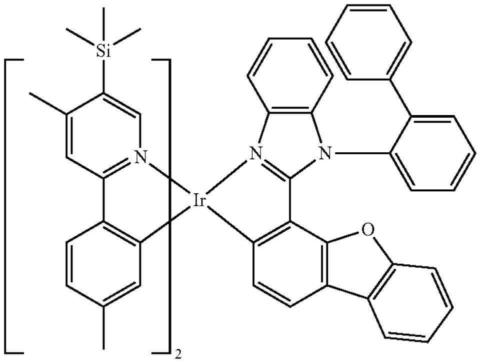
240
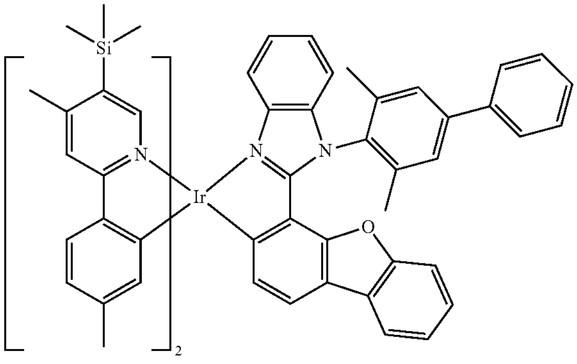
241
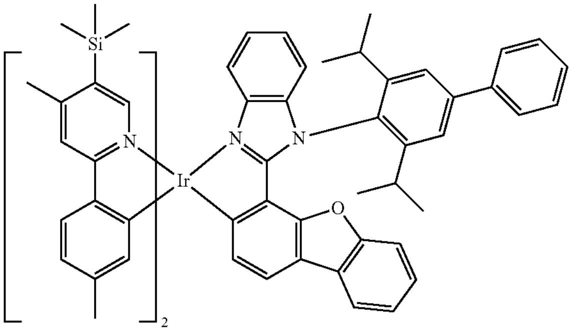
242
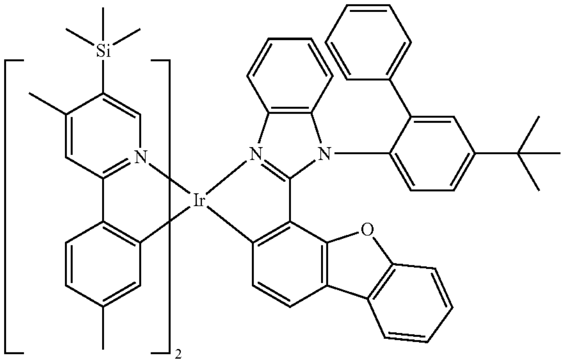
243
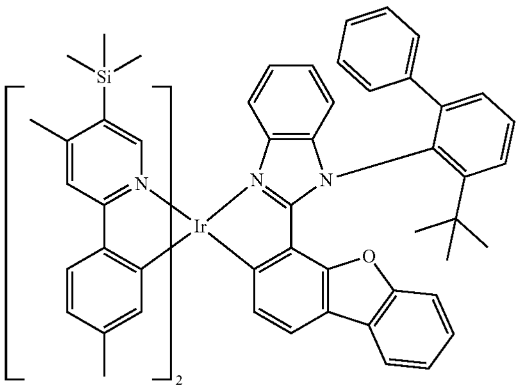

-continued
244
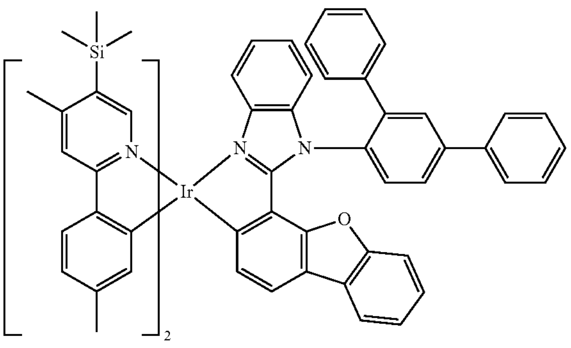
245
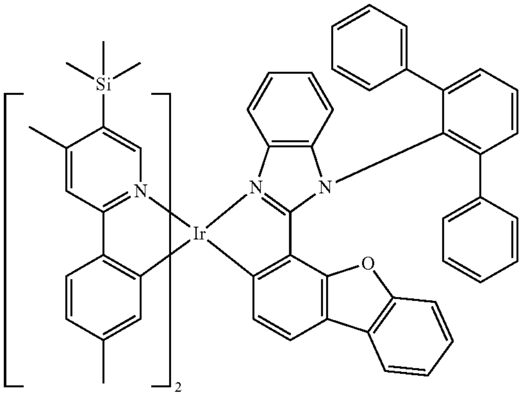
246
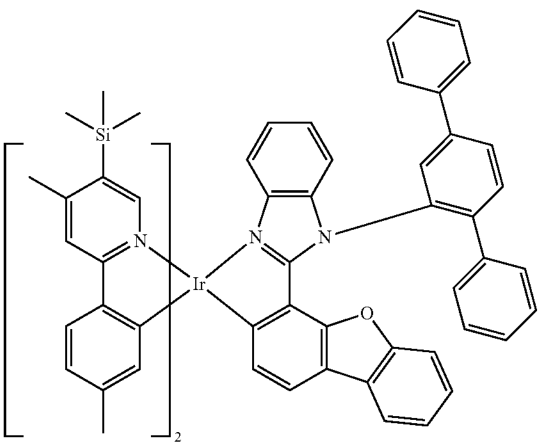
247
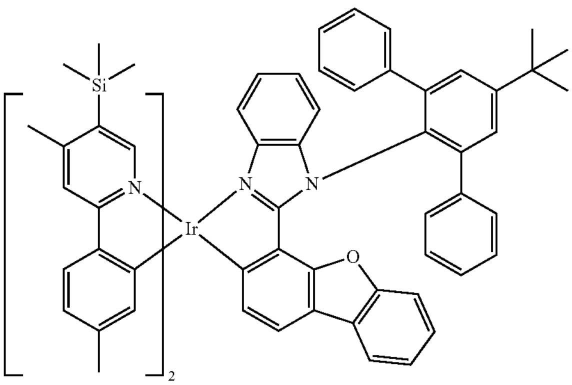
-continued
248
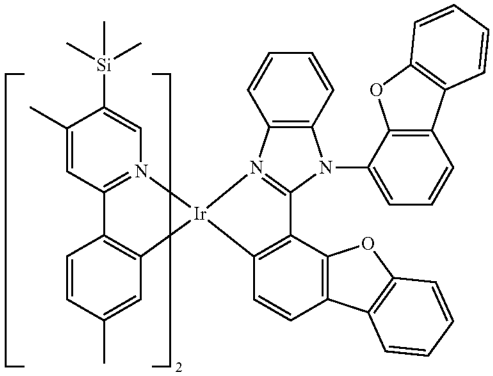
249
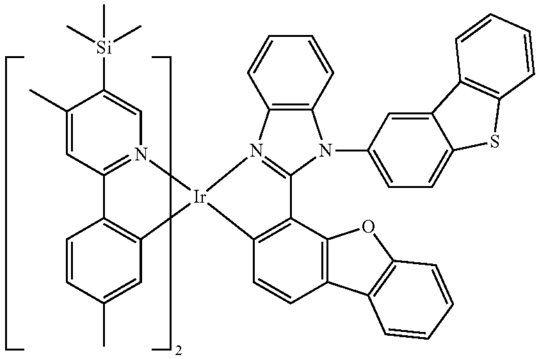
250
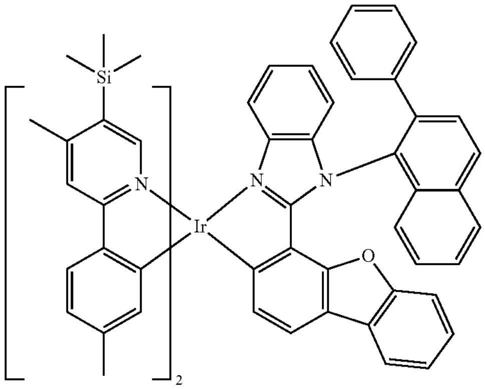
251
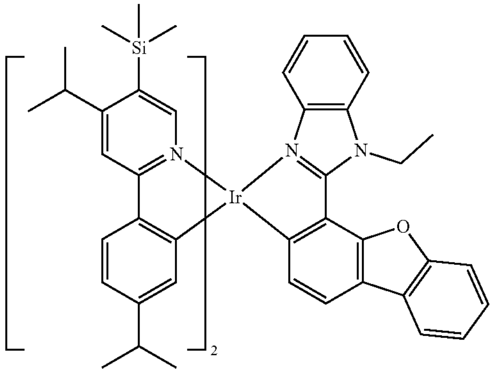

-continued
252
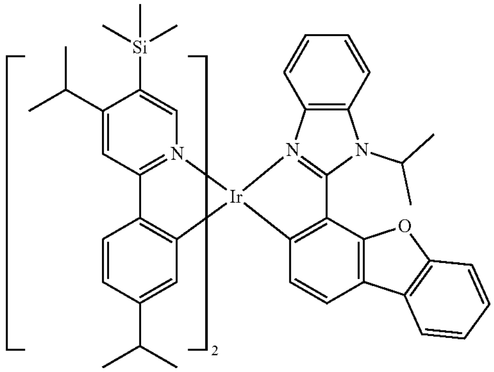
253
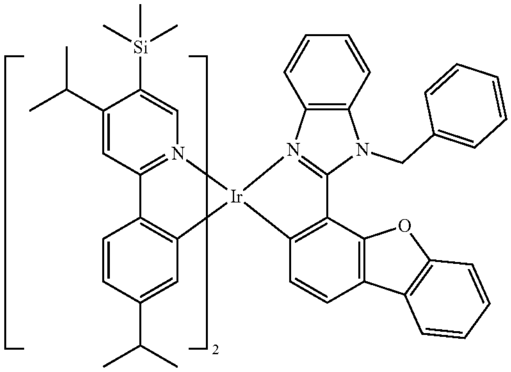
254
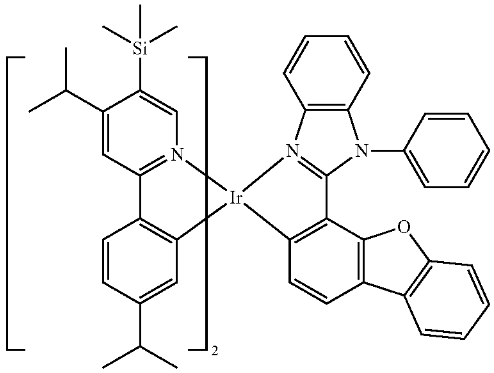
255
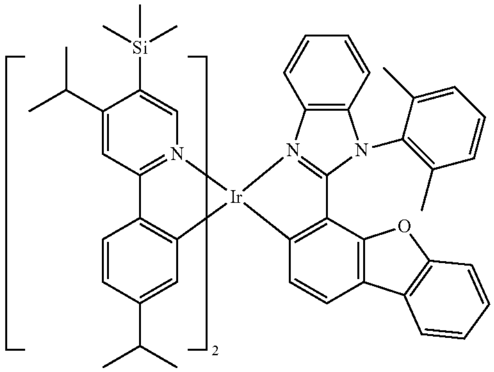
-continued
256
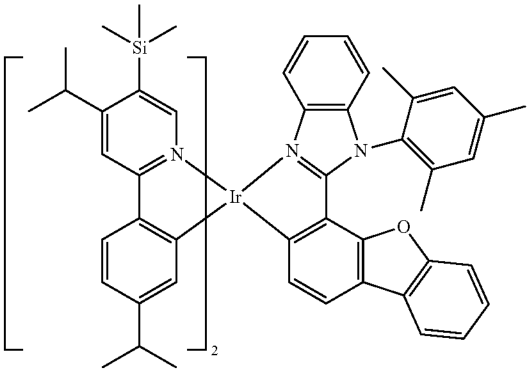
257
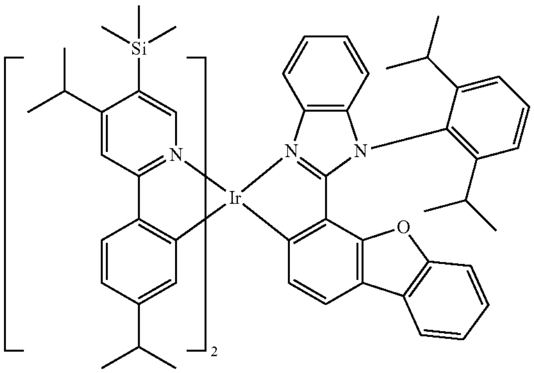
258
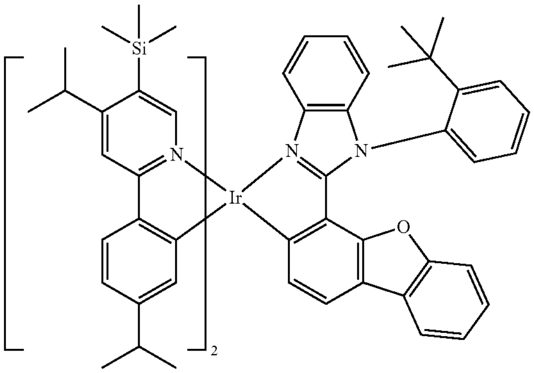
259
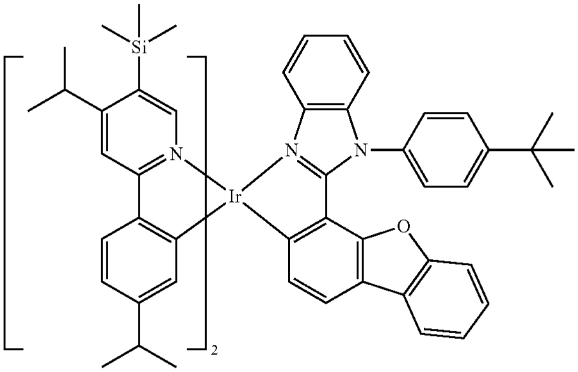

-continued
260
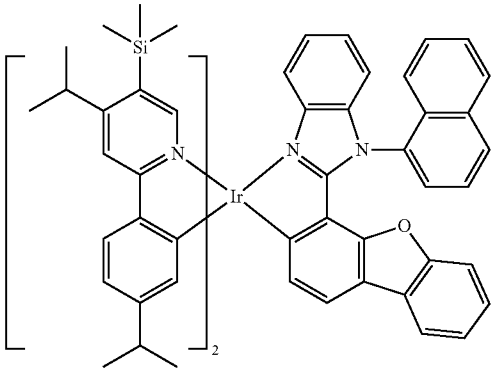
261
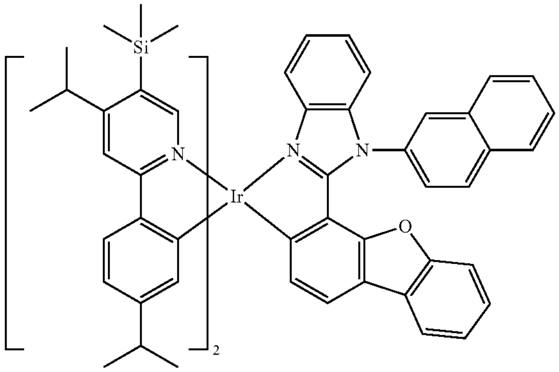
262
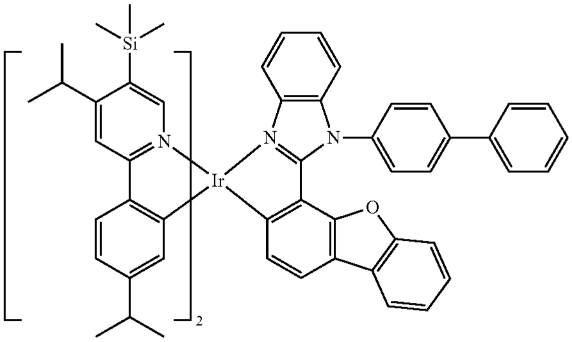
263
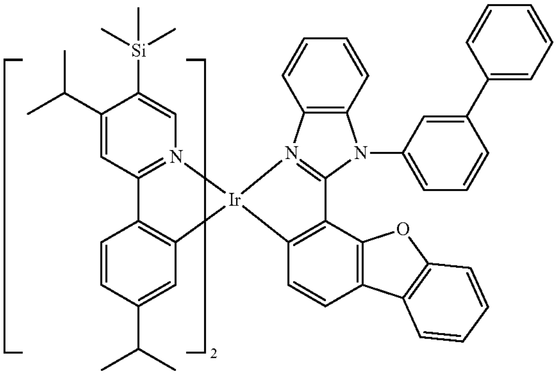
-continued
264
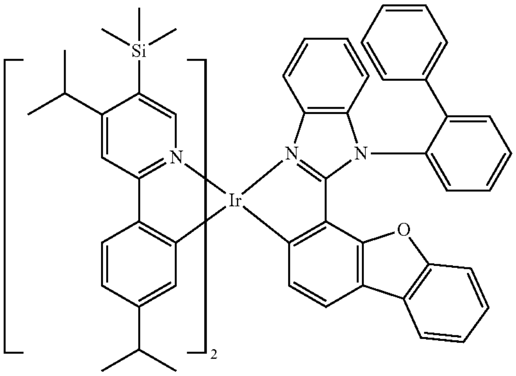
265
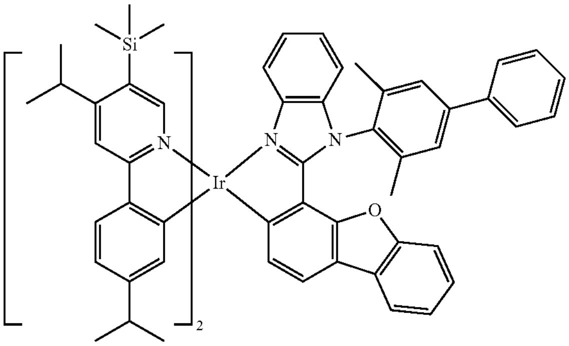
266
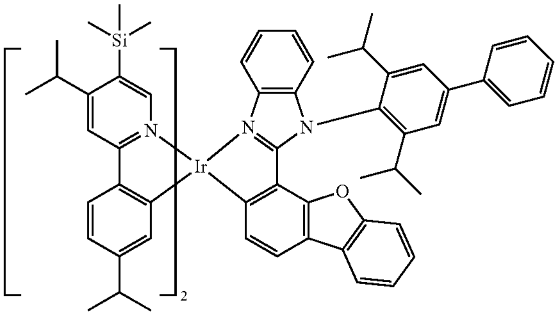
267
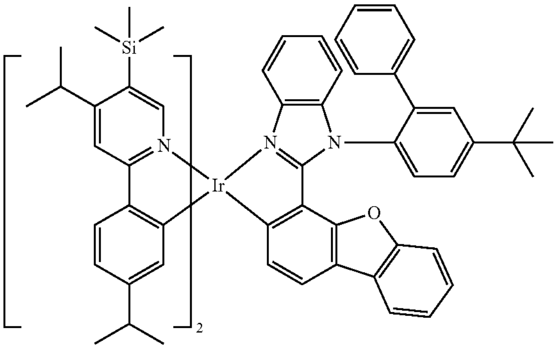

-continued
268
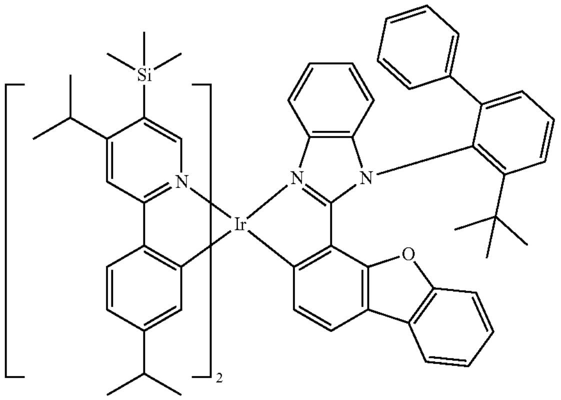
269
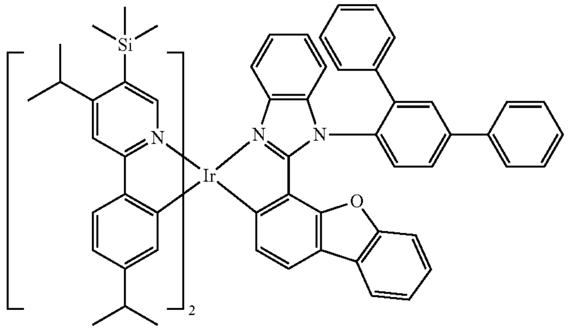
270
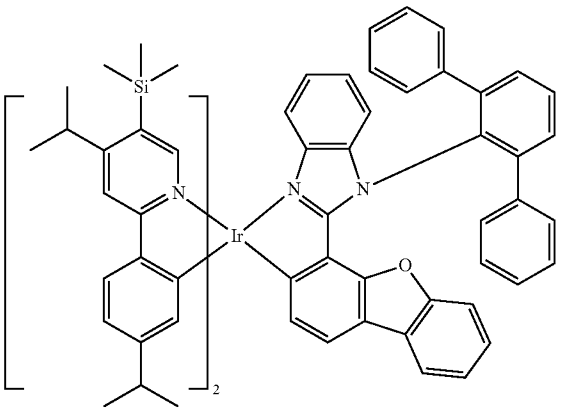
-continued
271
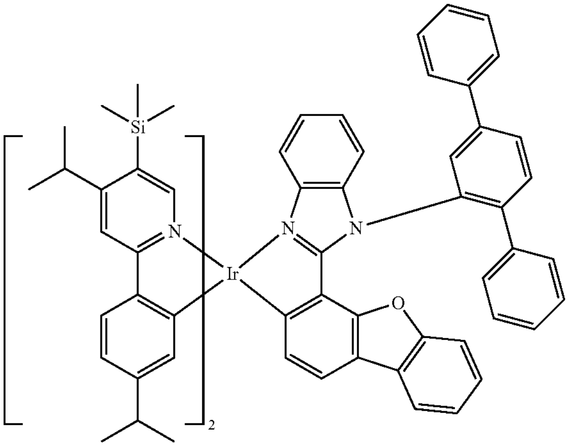
272
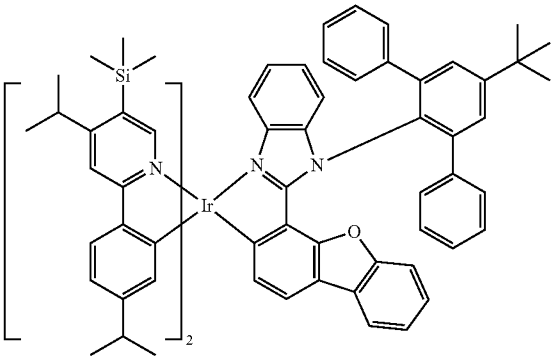
273
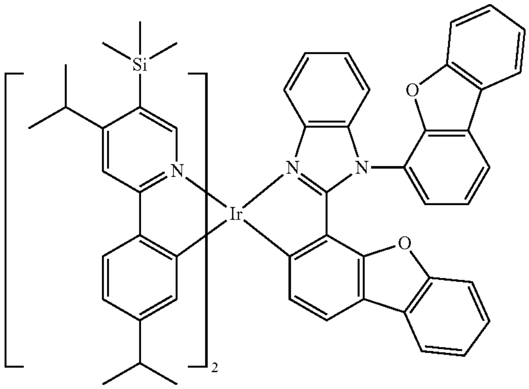

-continued
274
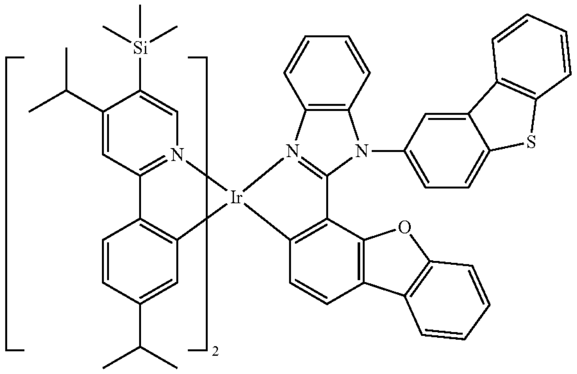
275
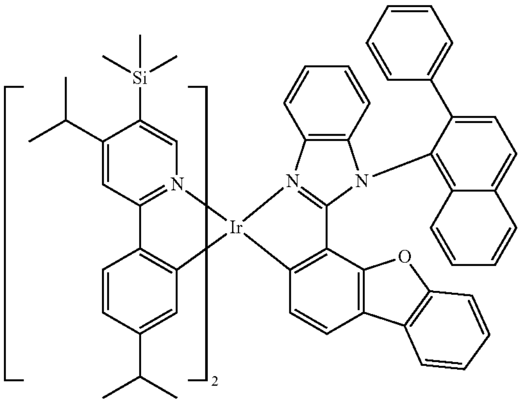
276
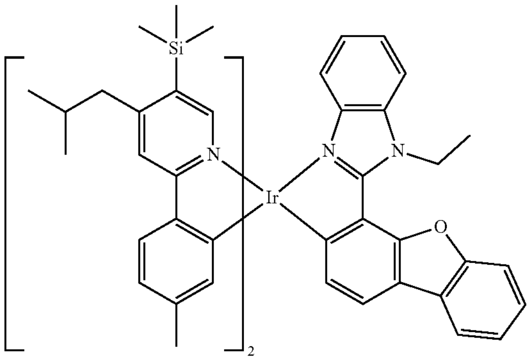
277
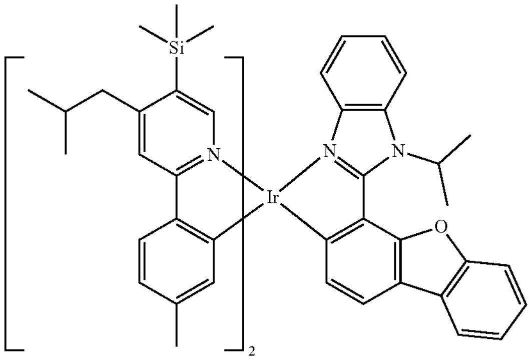
-continued
278
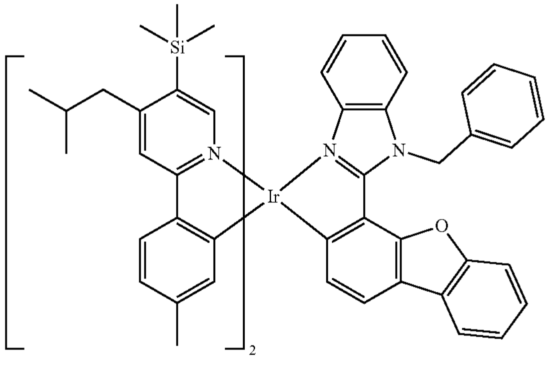
279
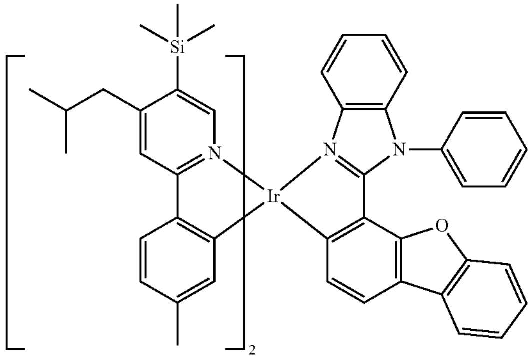
280
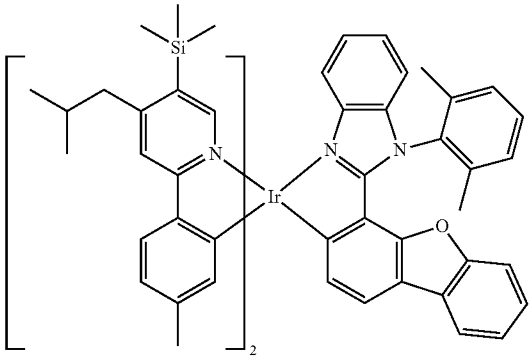
281
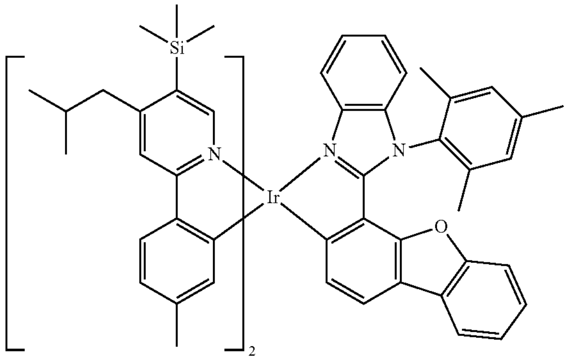

282
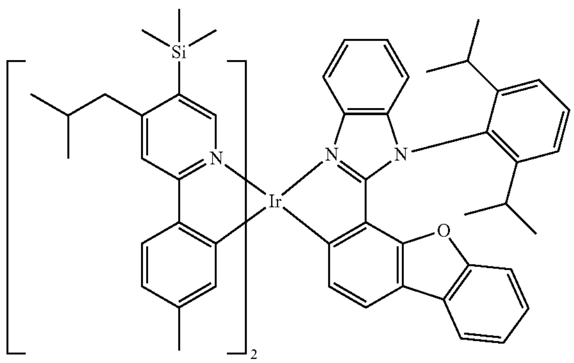
283
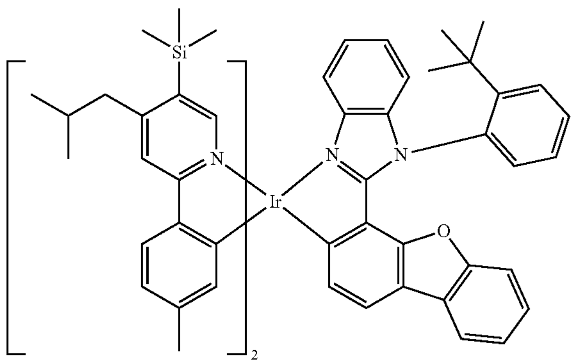
284
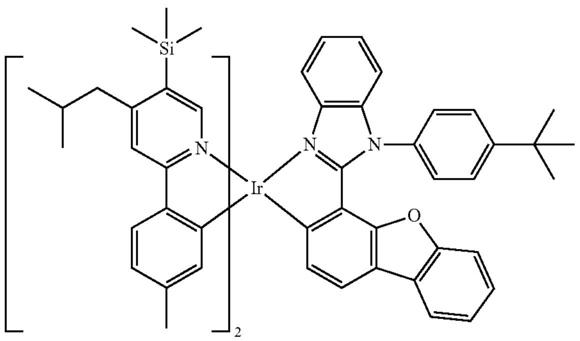
285
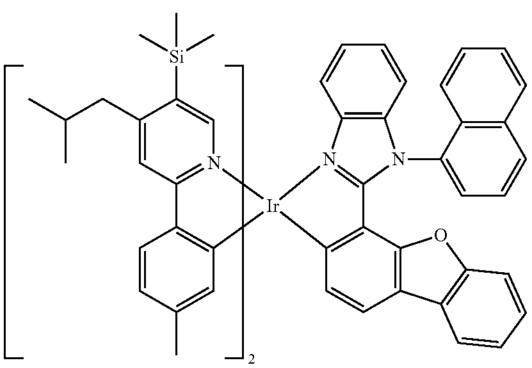
286
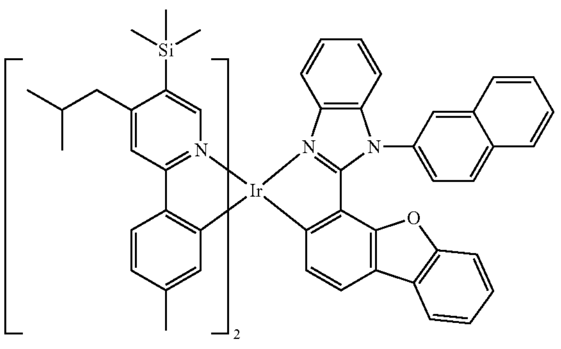
287
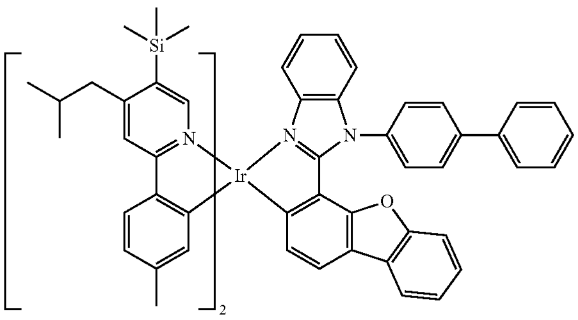
288
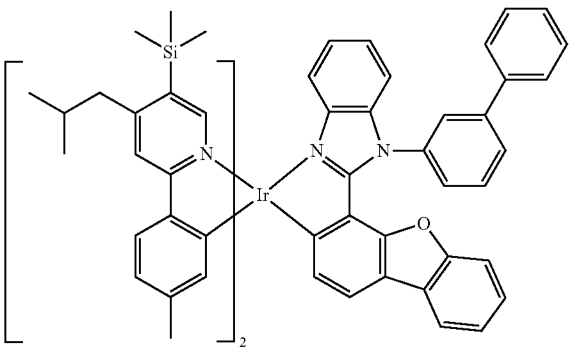
289
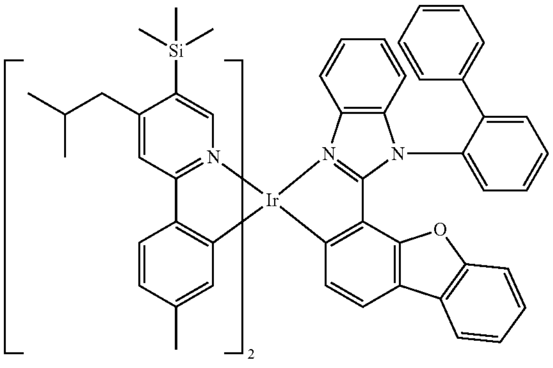

-continued
290
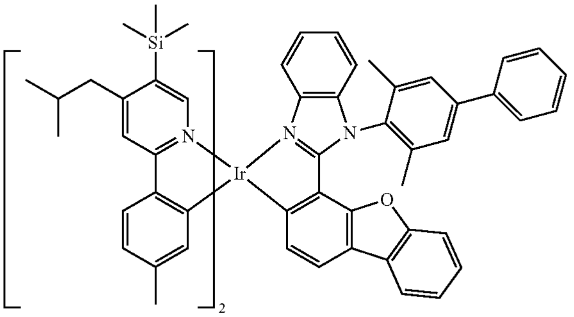
291
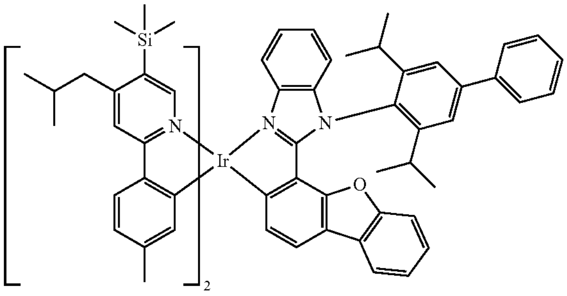
292
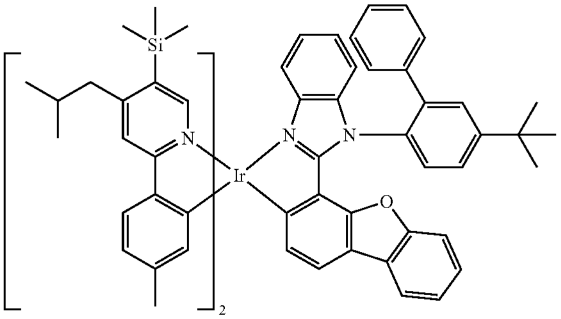
293
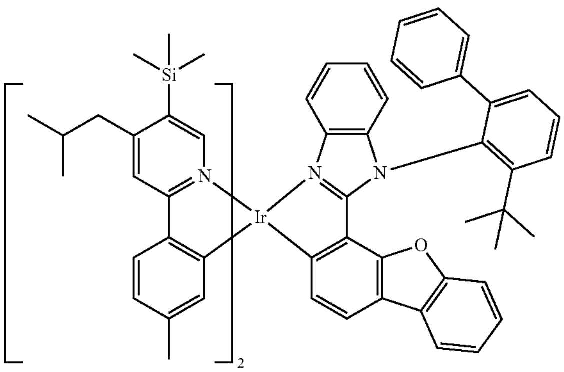
-continued
294
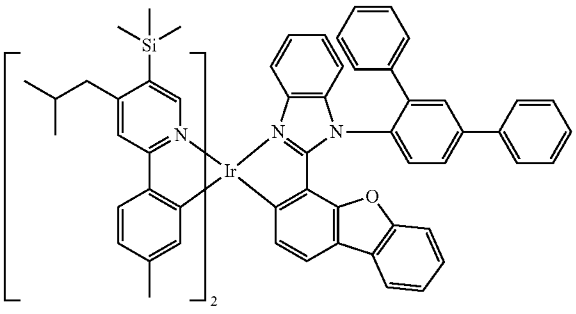
295
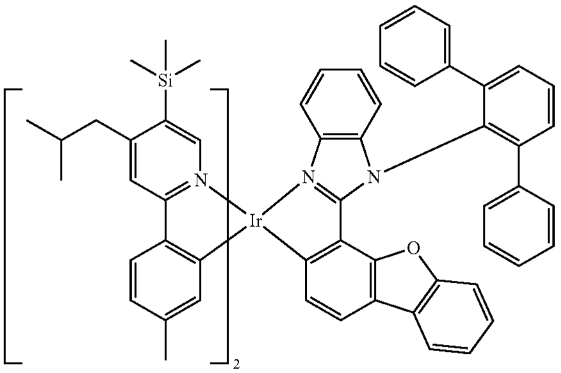
296
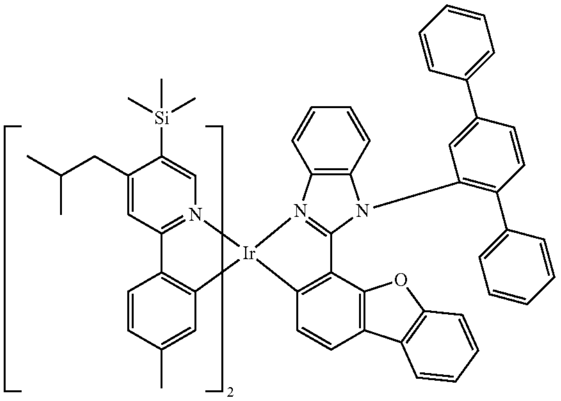
297
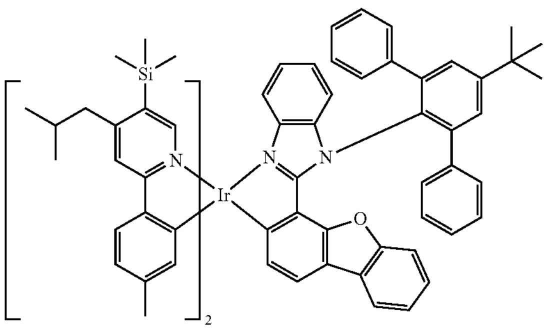

298
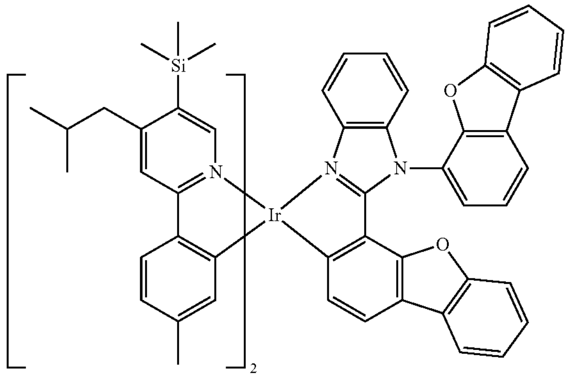
299
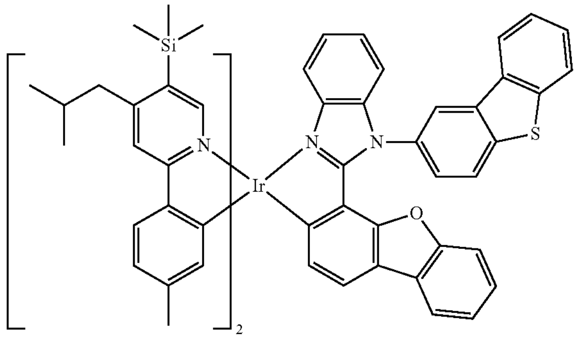
300
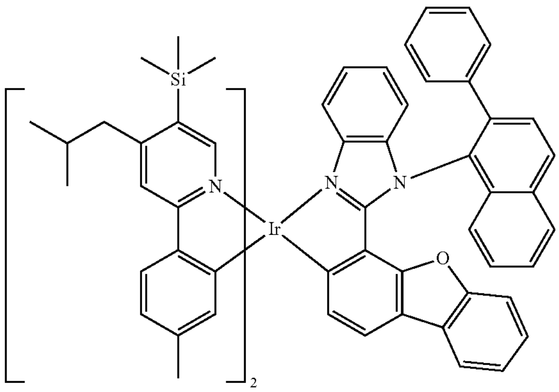
301
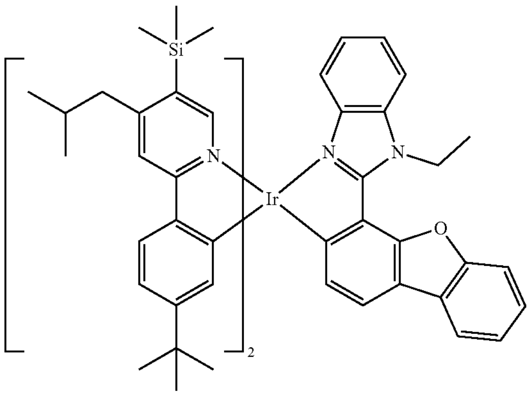
302
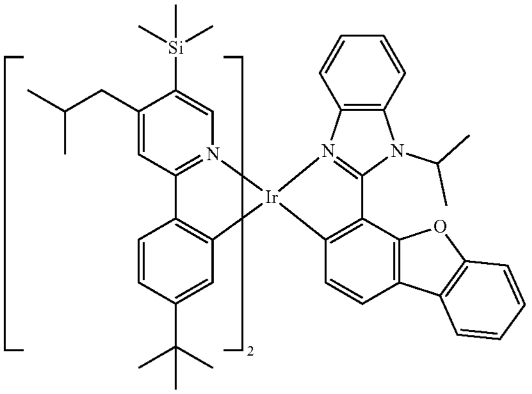
303
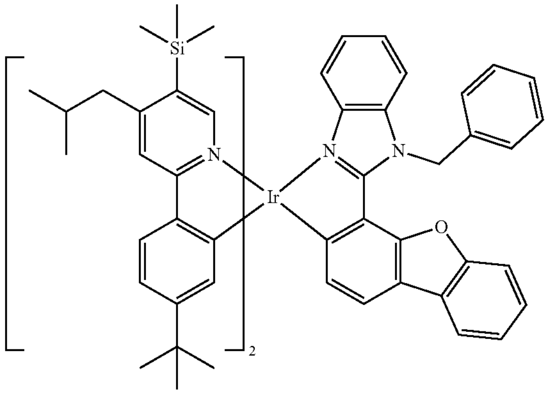
304
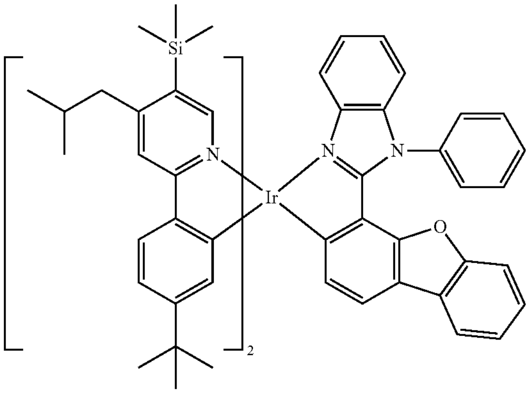

-continued
305
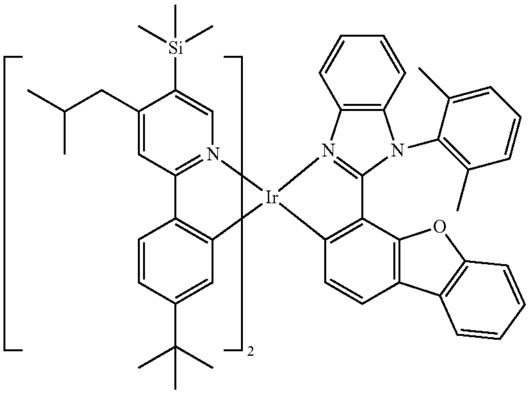
306
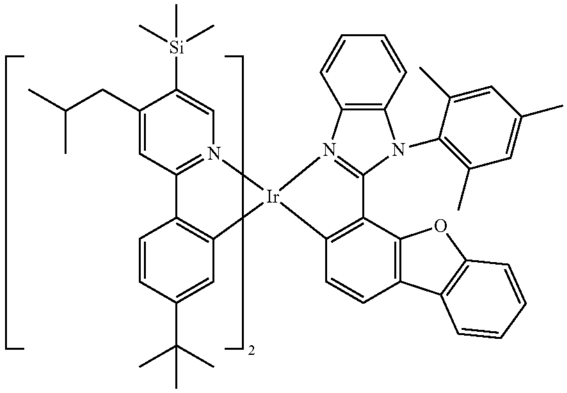
307
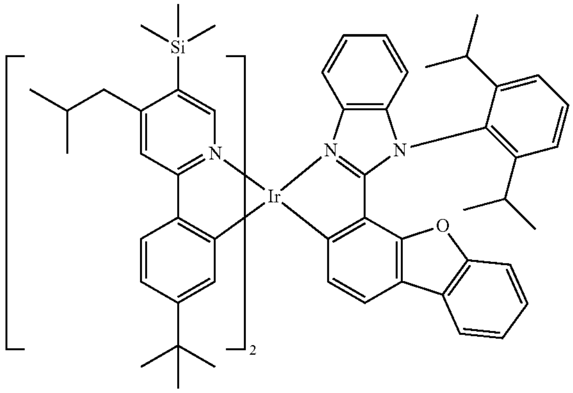
-continued
308
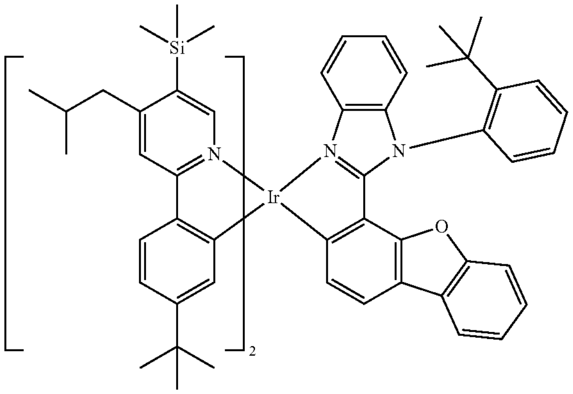
309
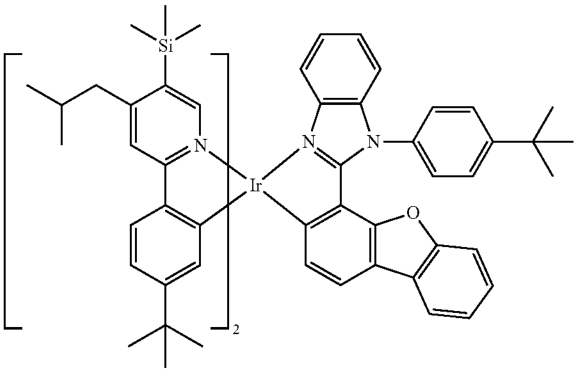
310
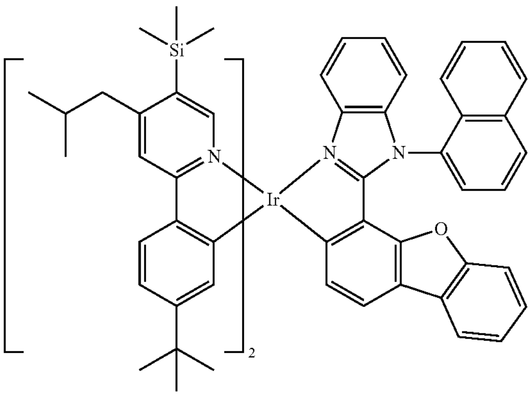
311
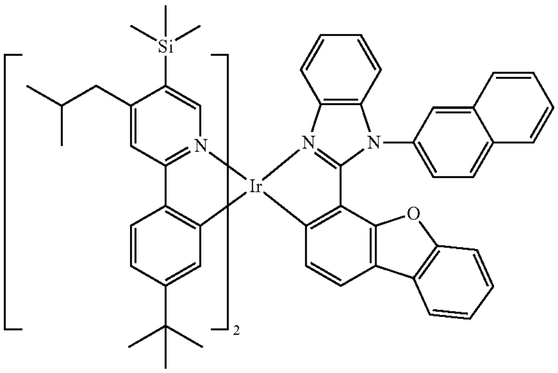

-continued
312
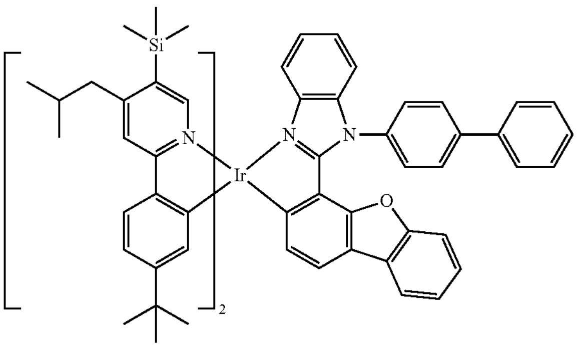
313
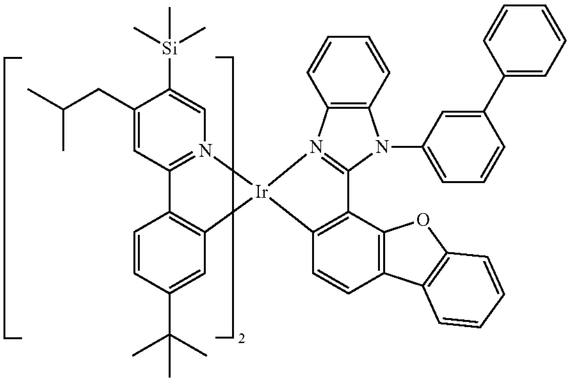
314
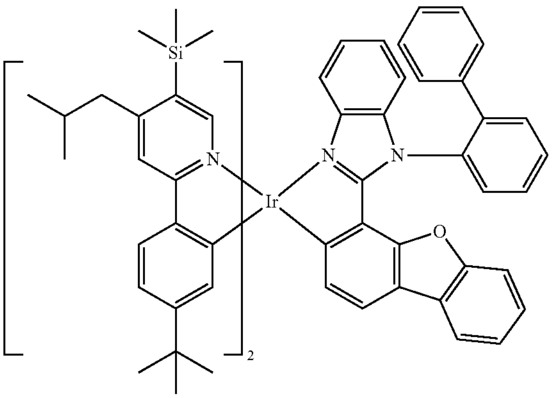
315
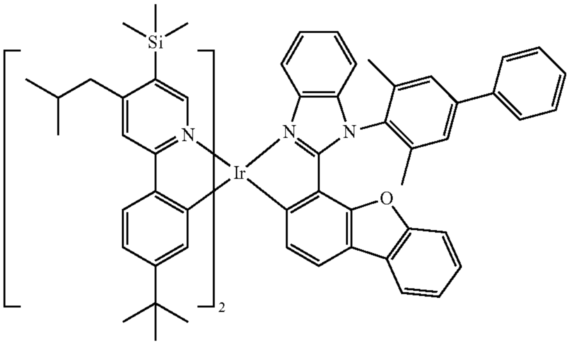
-continued
316
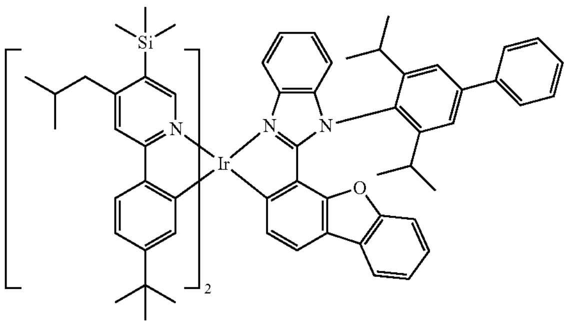
317
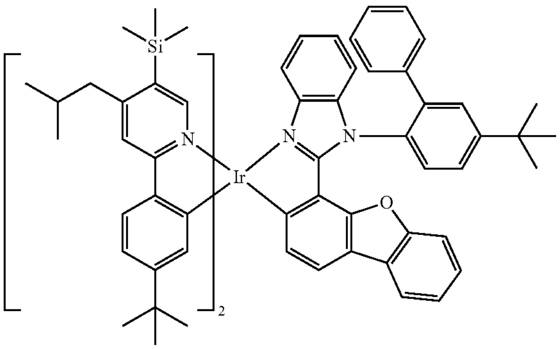
318
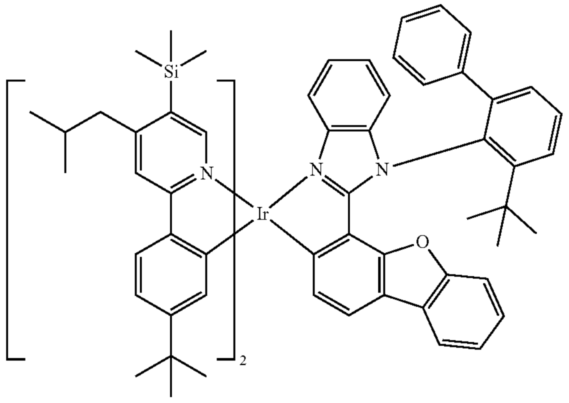
319
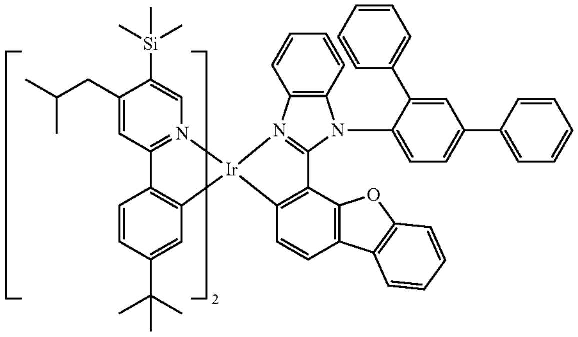

-continued
320
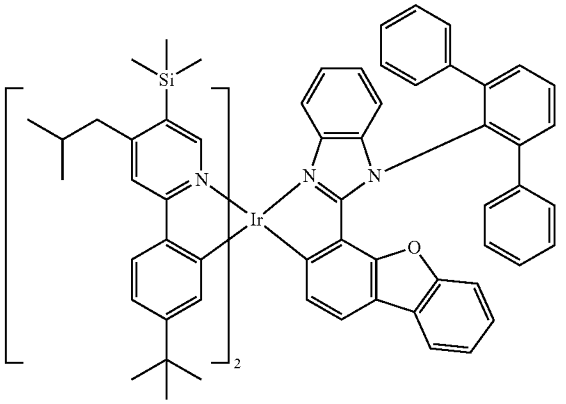
321
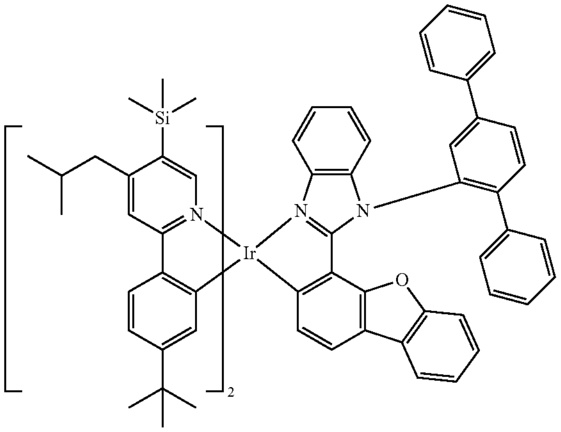
322
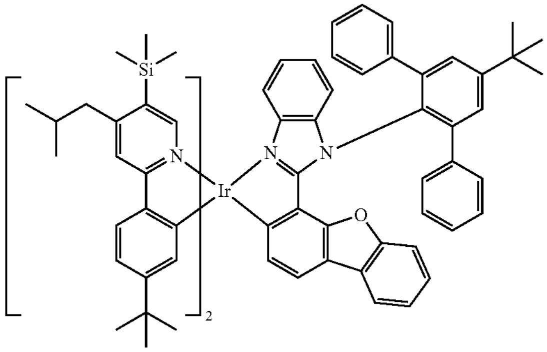
-continued
323
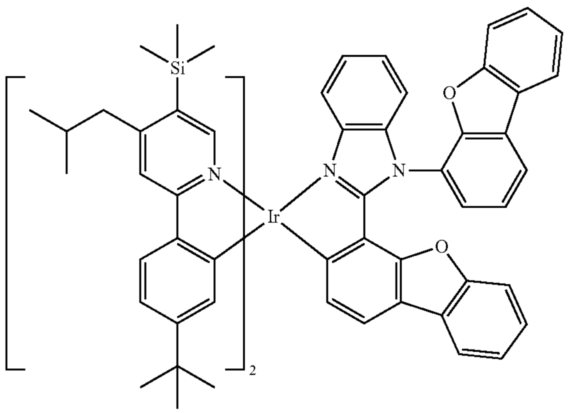
324
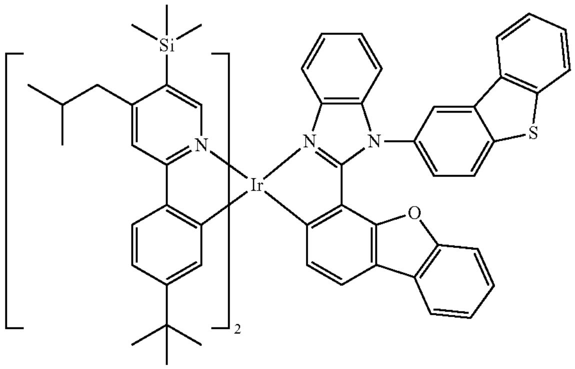
325
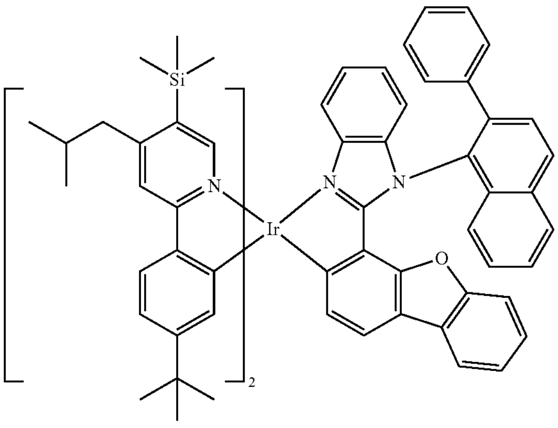
326
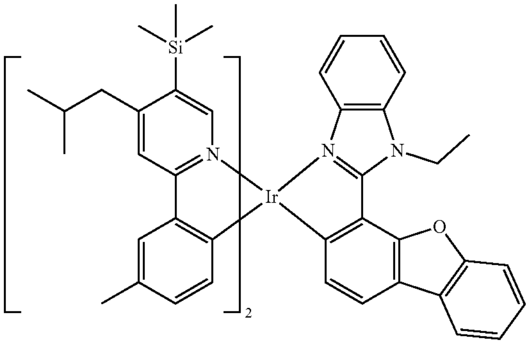

327
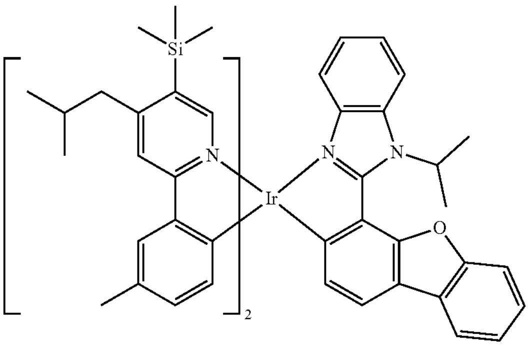
328
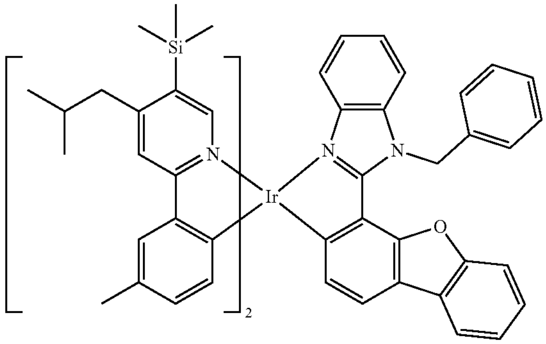
329
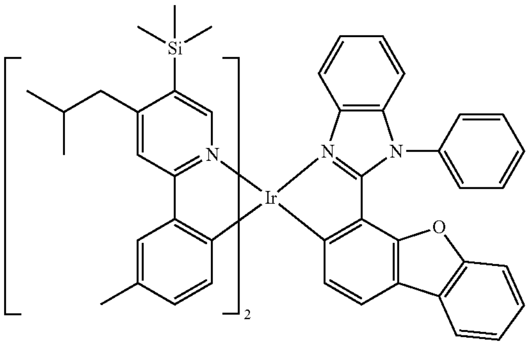
330
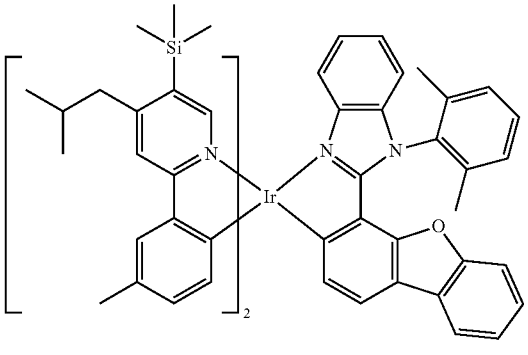
331
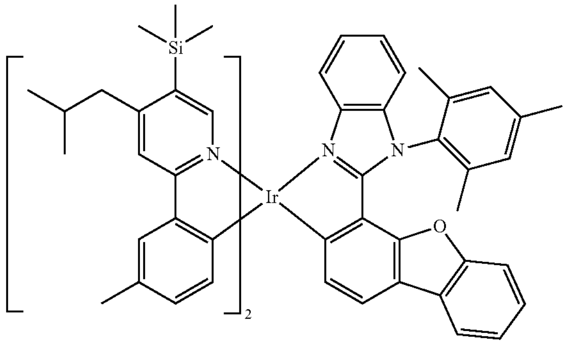
332
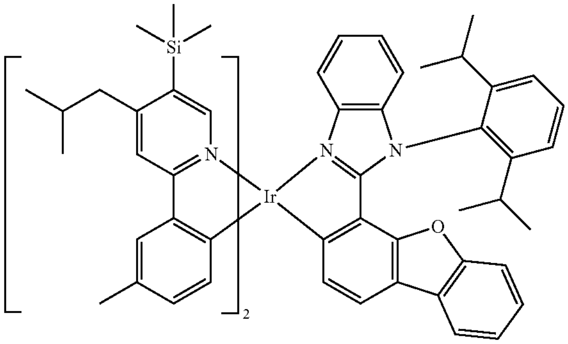
333
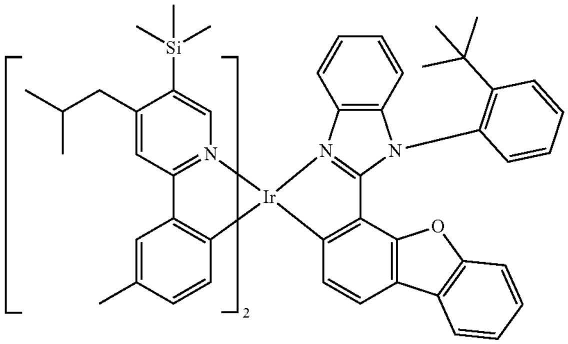
334
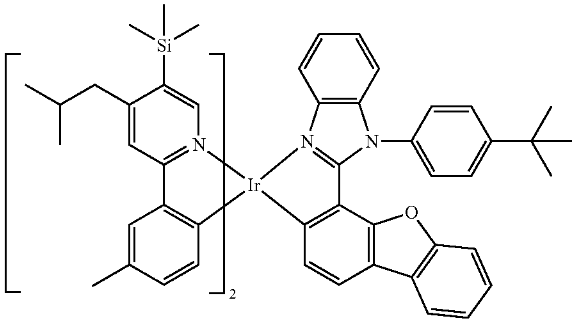

335
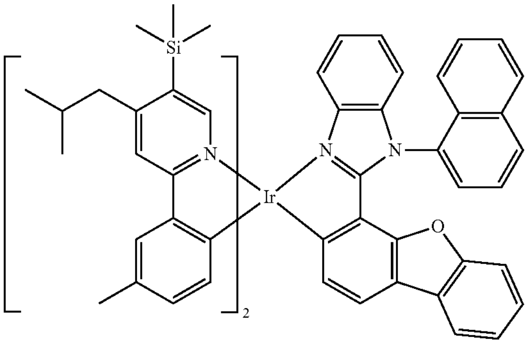
336
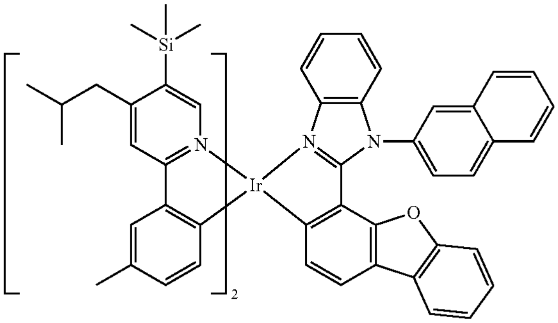
337
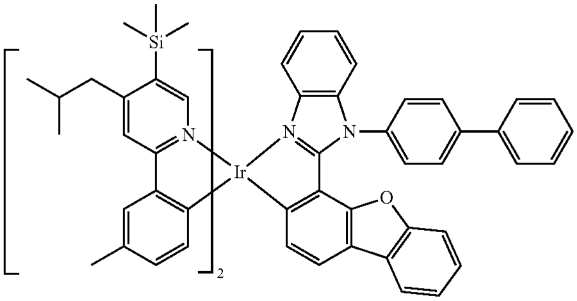
338
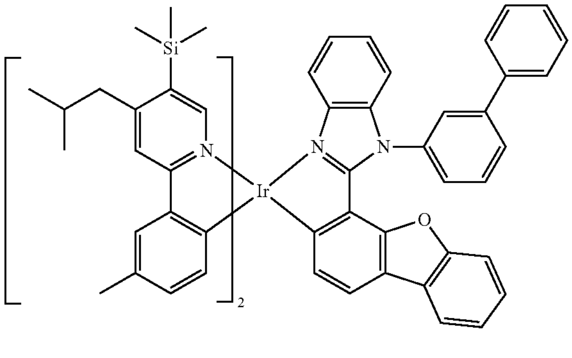
339
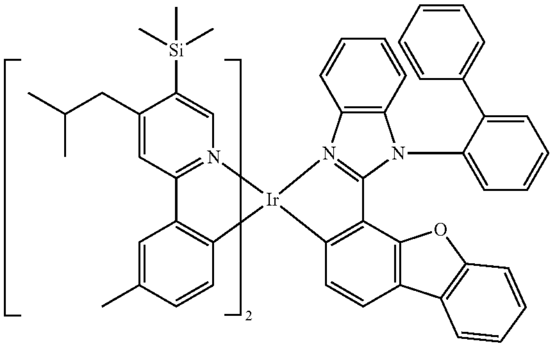
340
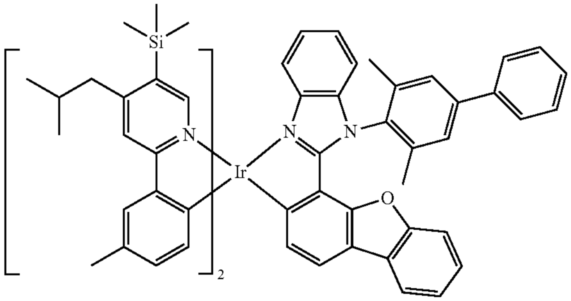
341
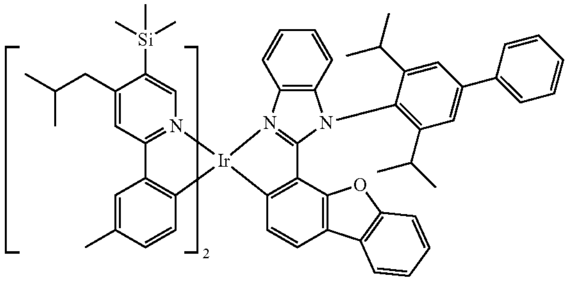
342
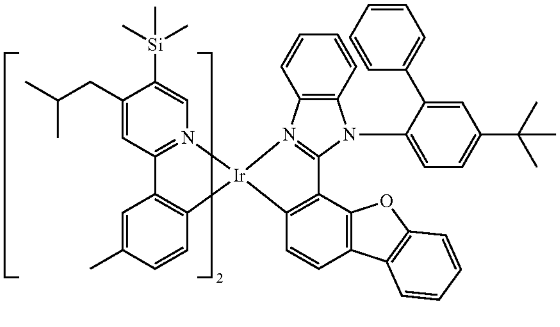

-continued
343
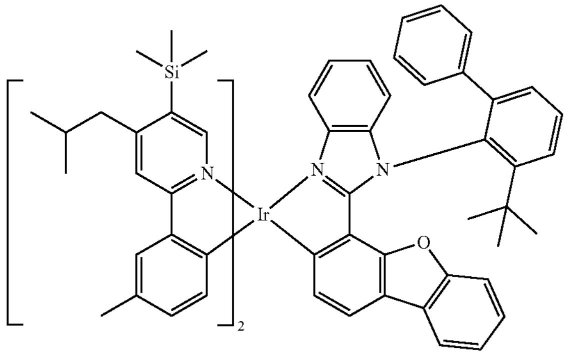
344
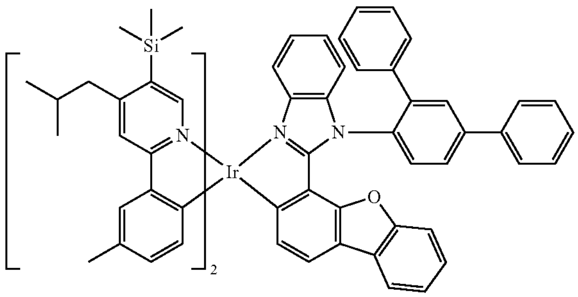
345
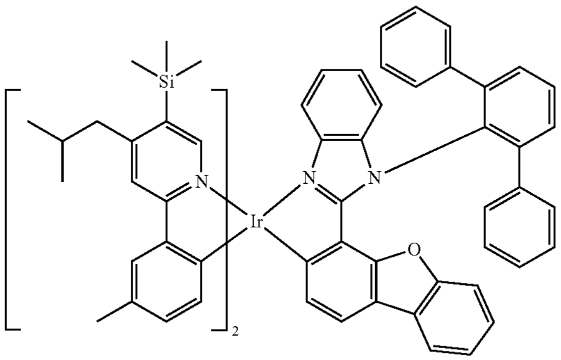
346
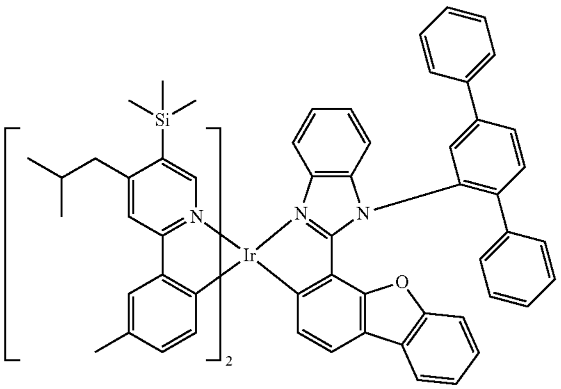
-continued
347
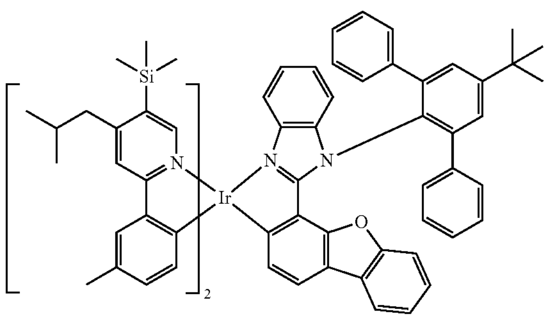
348
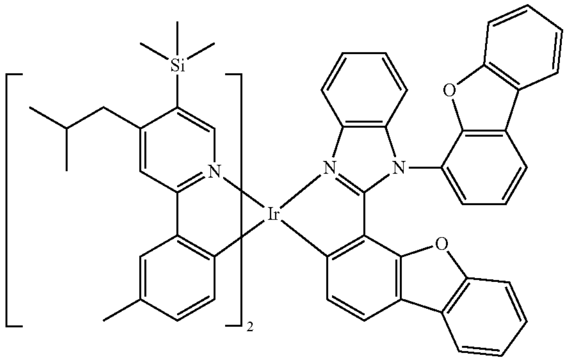
349
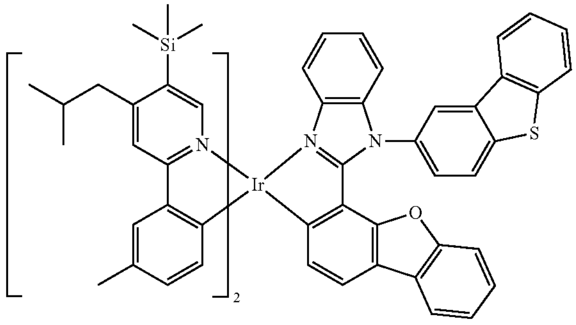
350
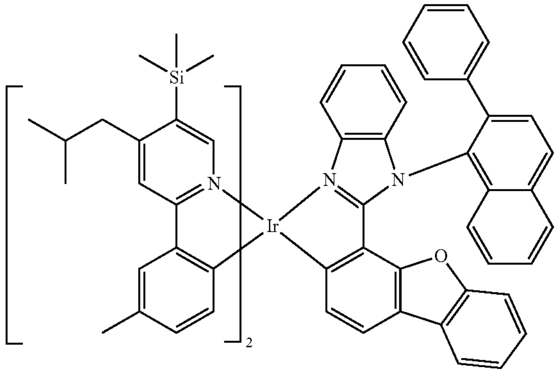

-continued
351
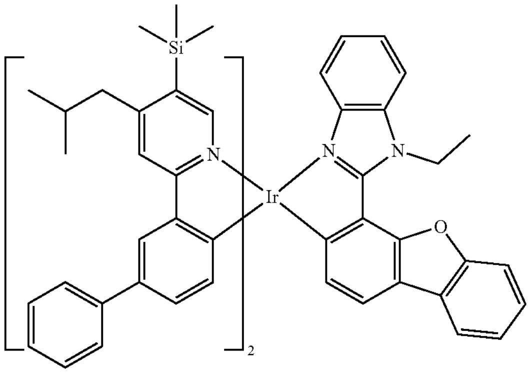
352
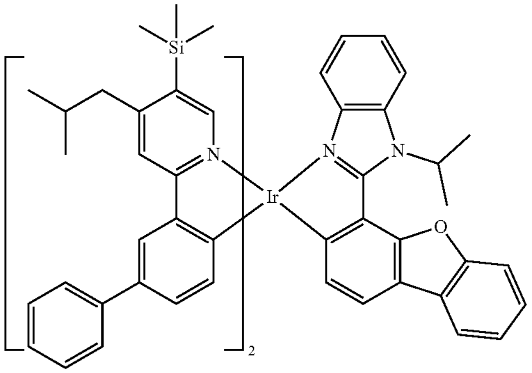
353
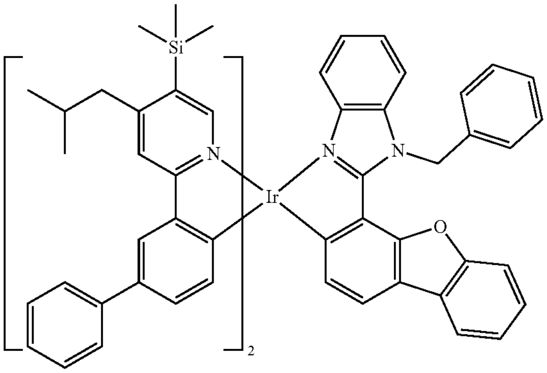
354
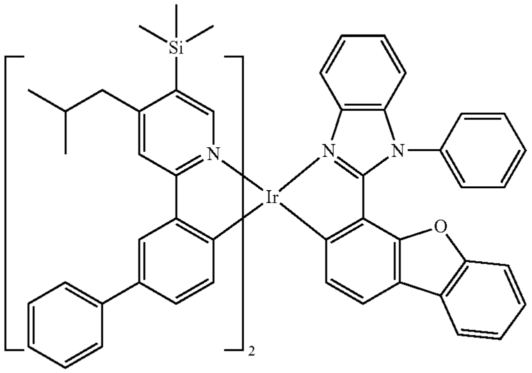
-continued
355
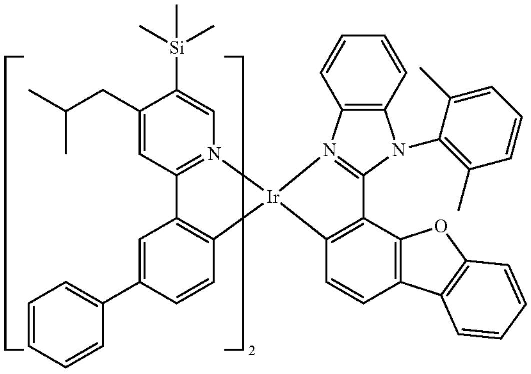
356
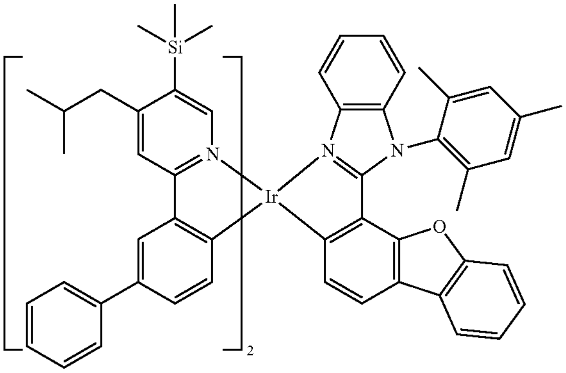
357
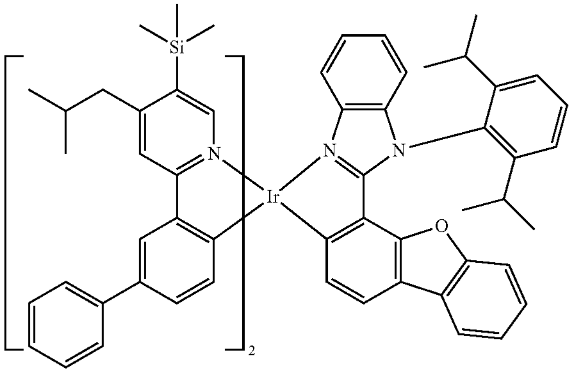
358
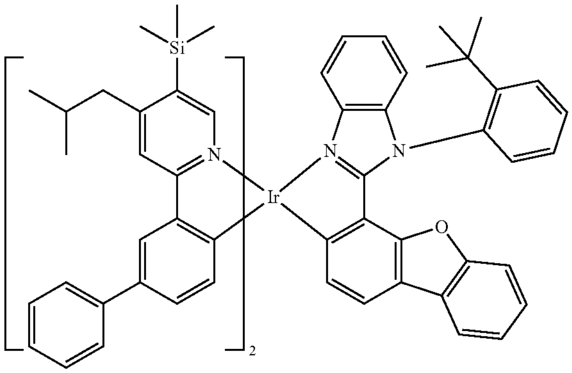

-continued
359
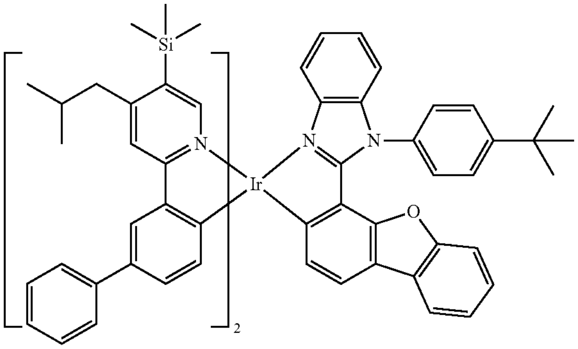
360
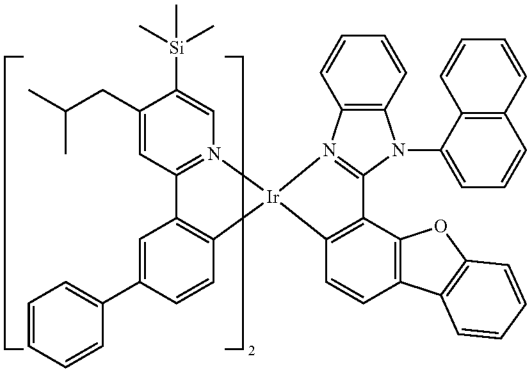
361
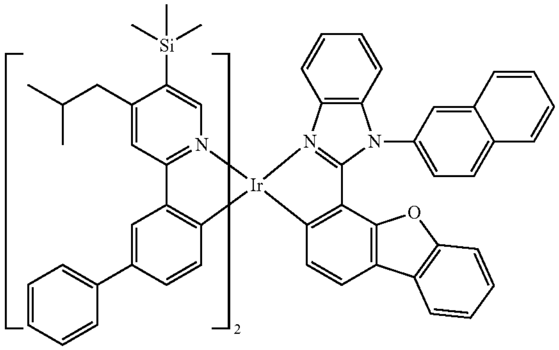
362
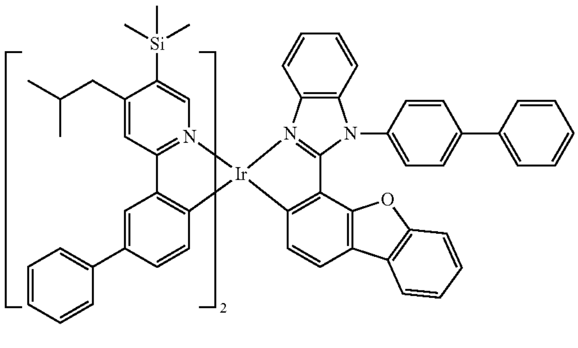
-continued
363
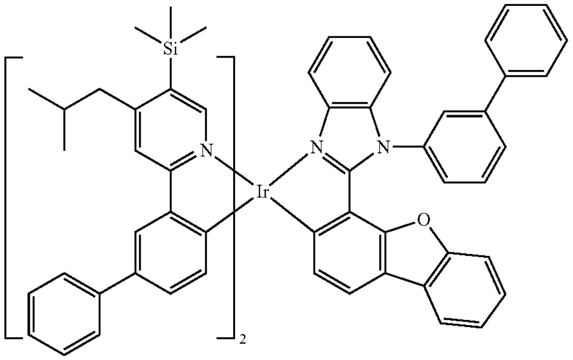
364
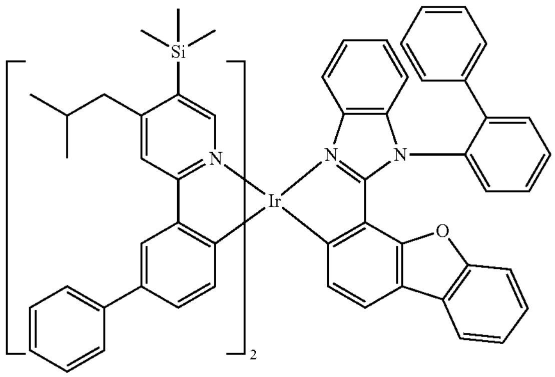
365
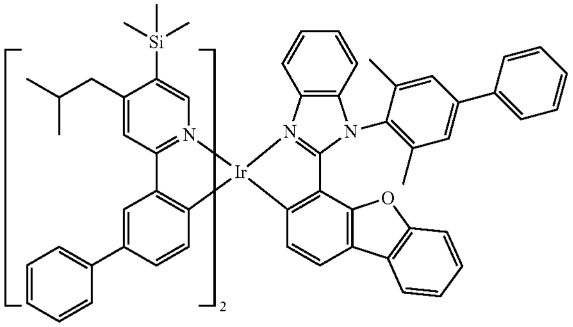
366
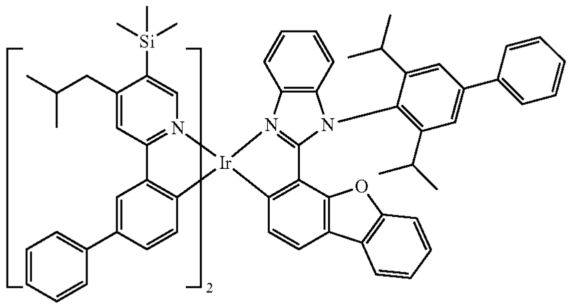

367
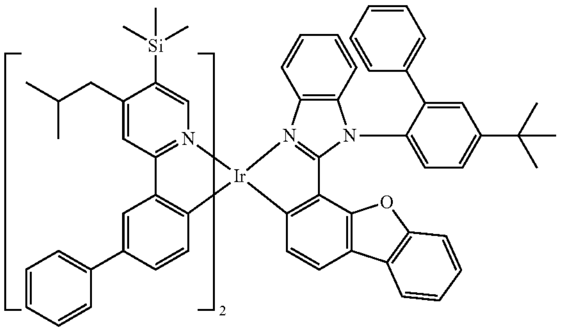
368
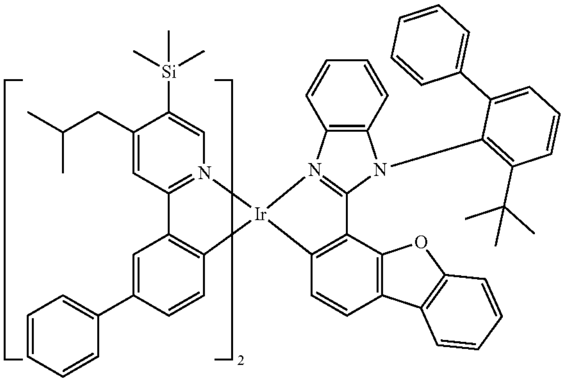
369
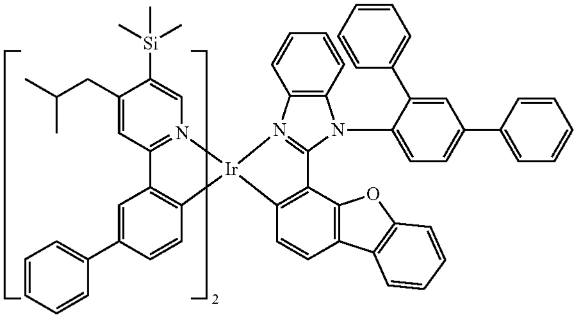
370
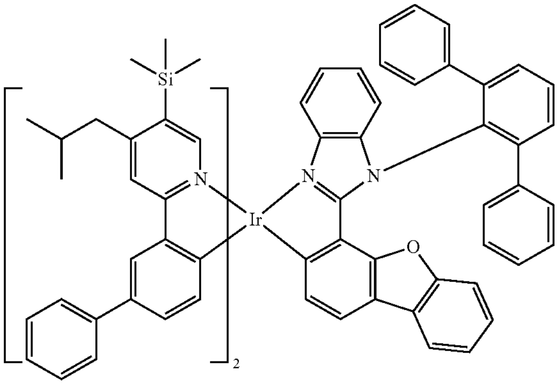
371
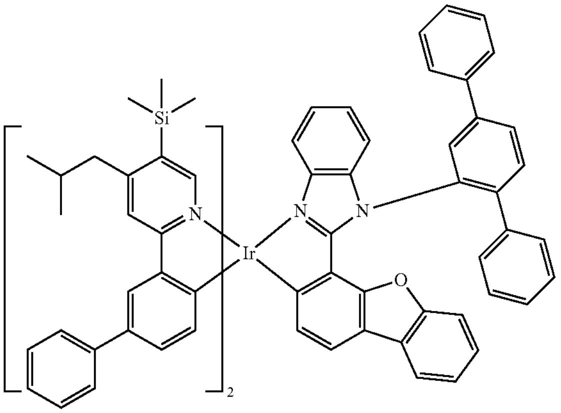
372
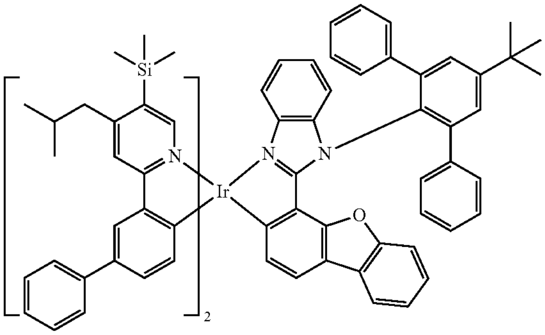
373
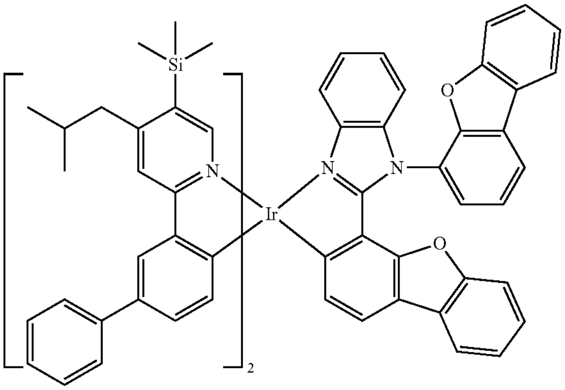
374
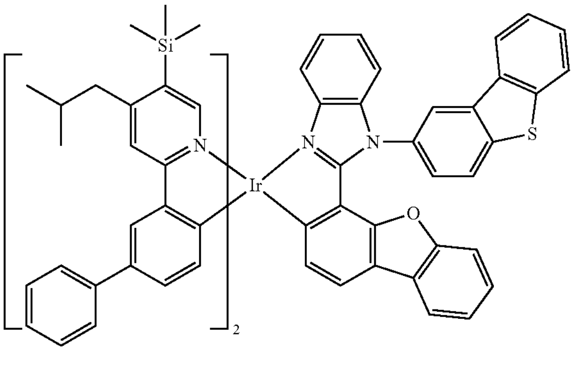

-continued
375
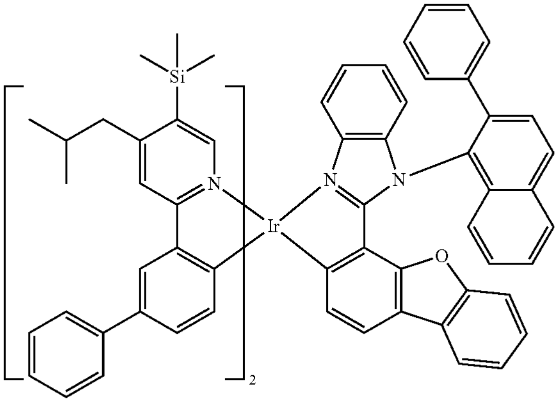
376
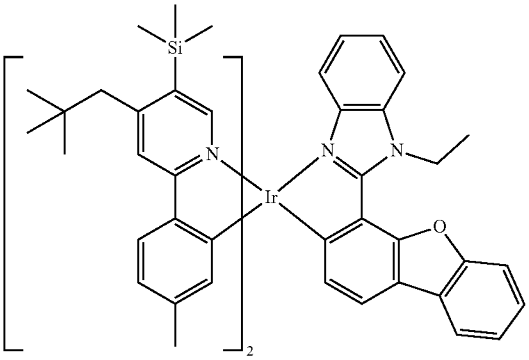
377
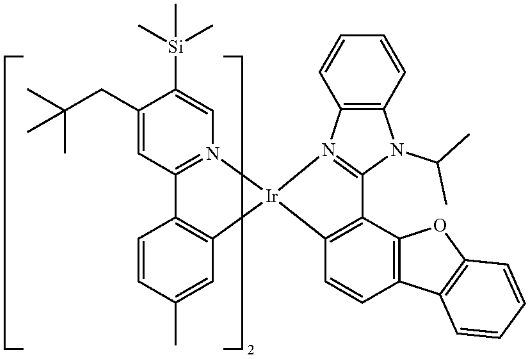
378
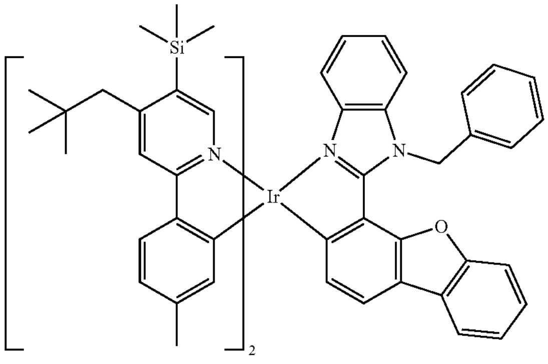
-continued
379
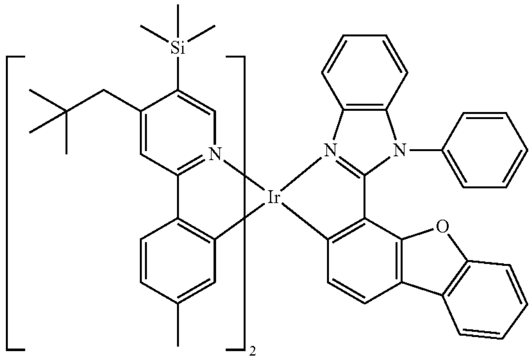
380
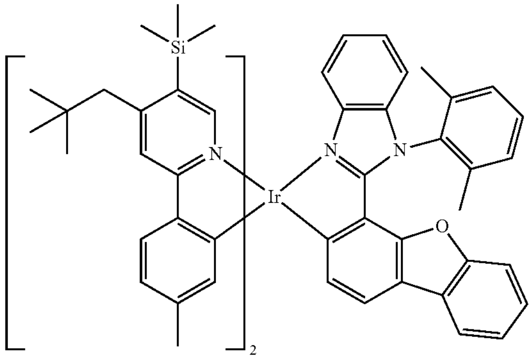
381
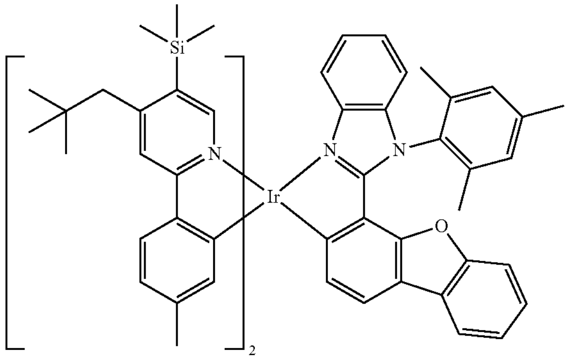
382
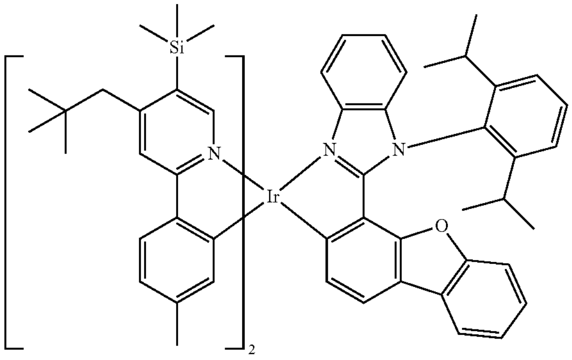

-continued
383
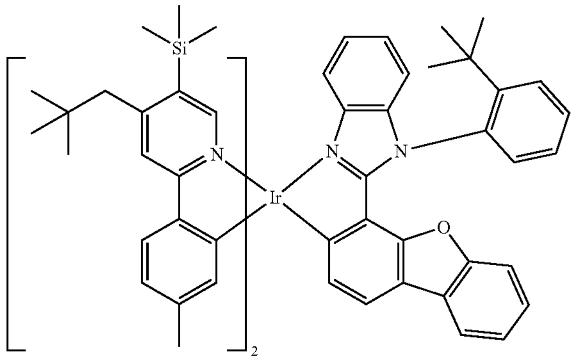
384
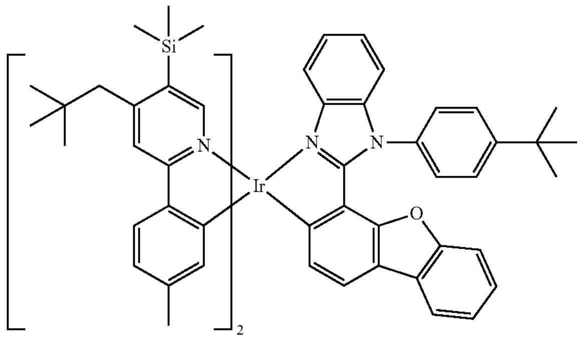
385
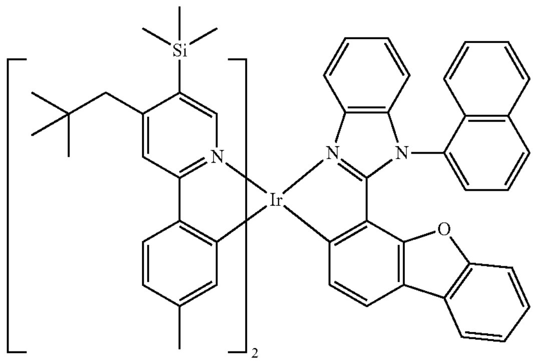
386
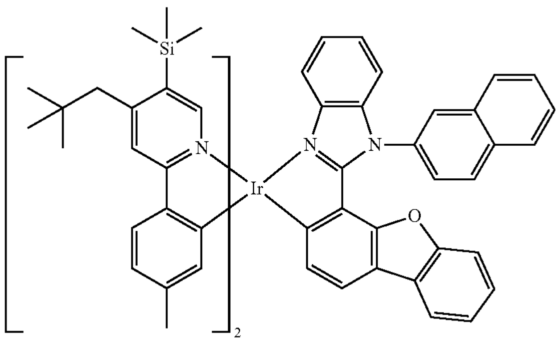
-continued
387
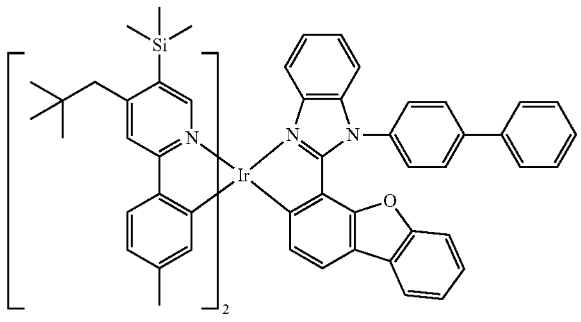
388
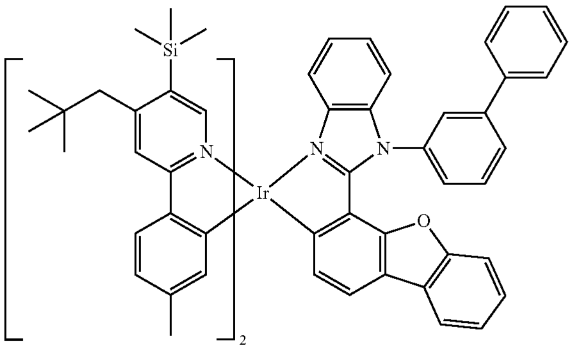
389
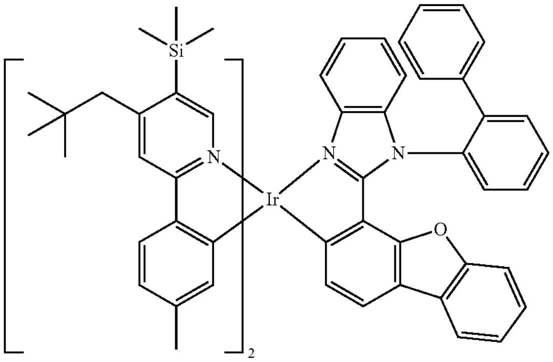
390
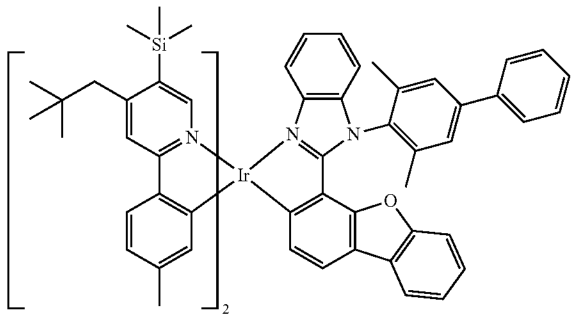

-continued
391
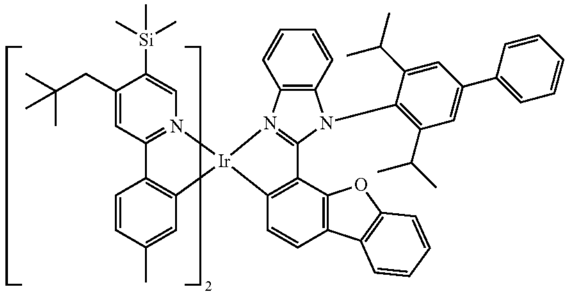
392
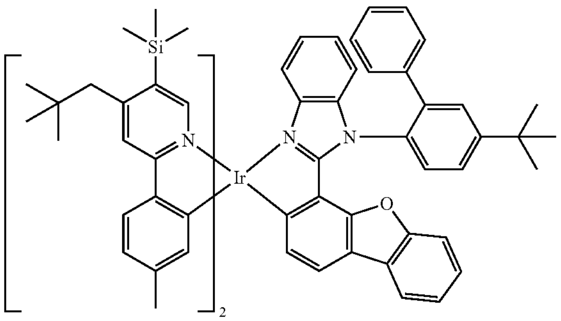
393
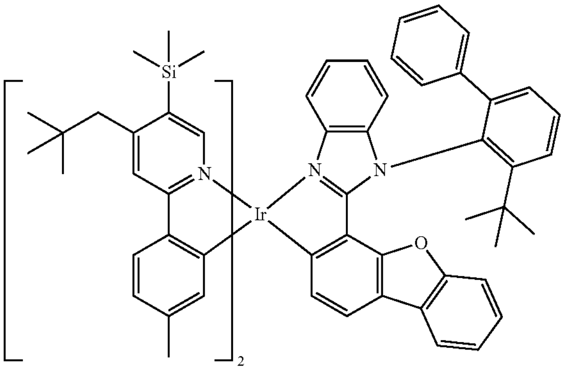
394
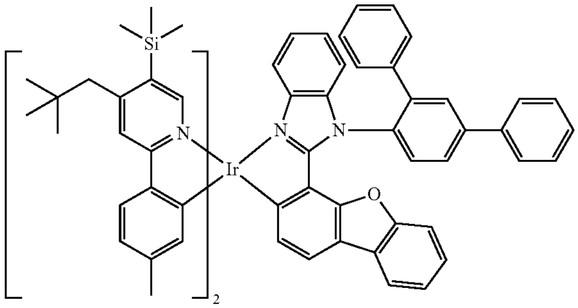
-continued
395
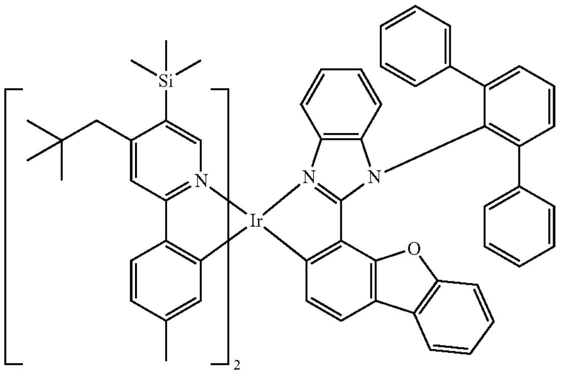
396
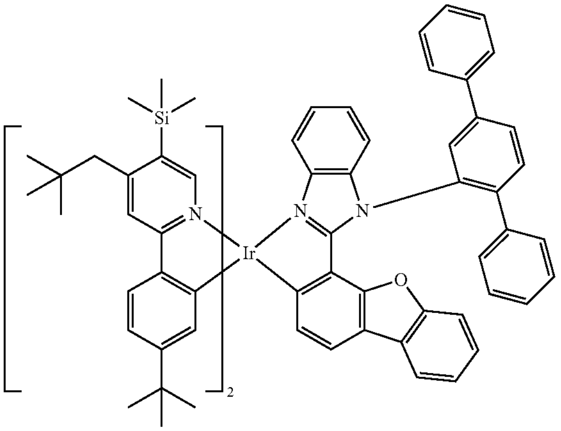
397
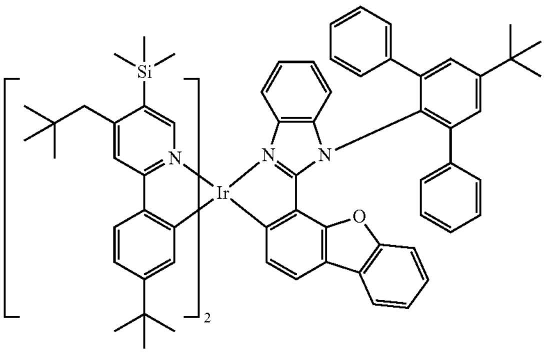
398
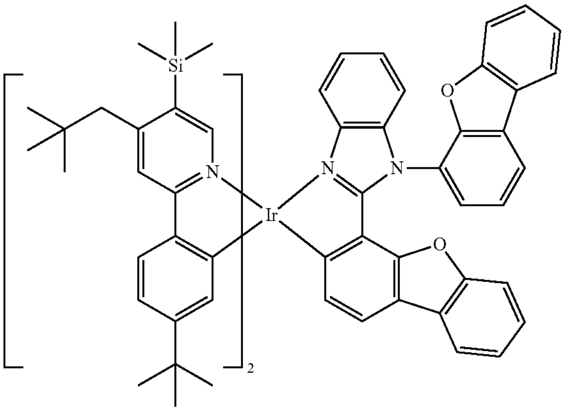

-continued
399
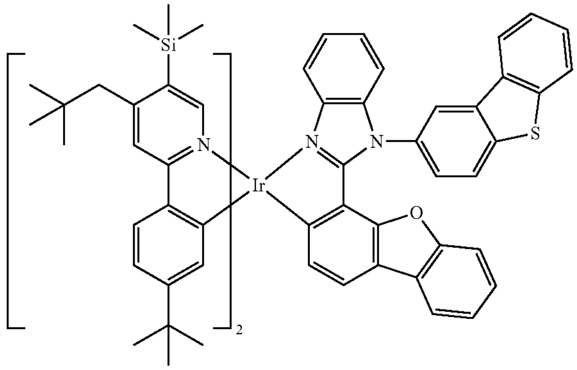
400
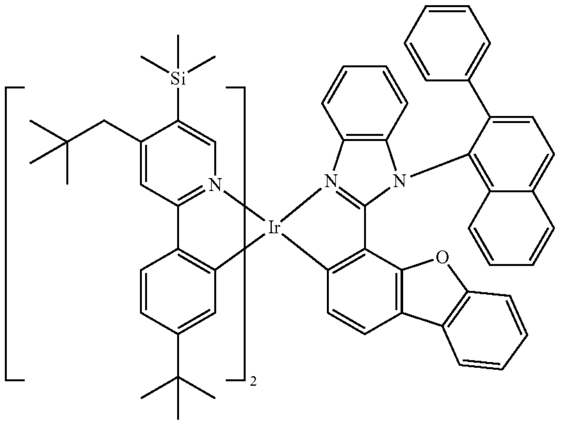
401
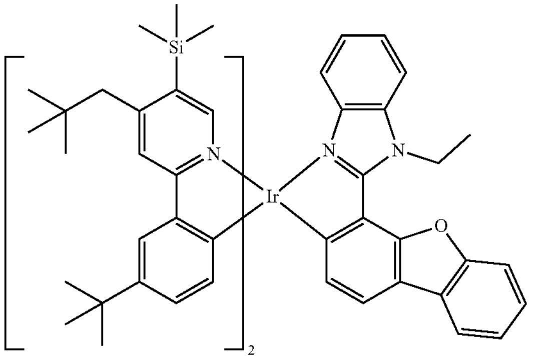
402
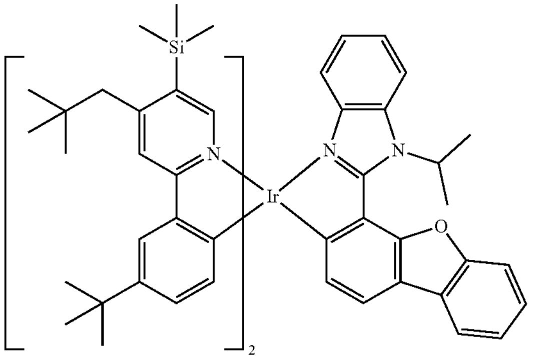
-continued
403
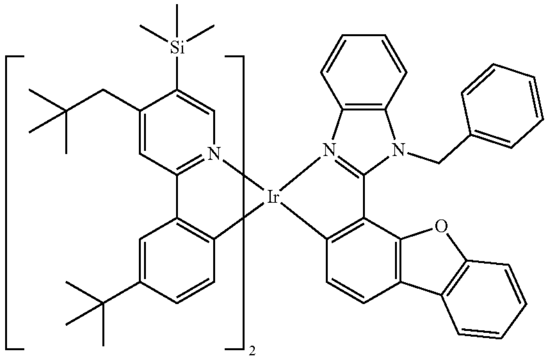
404
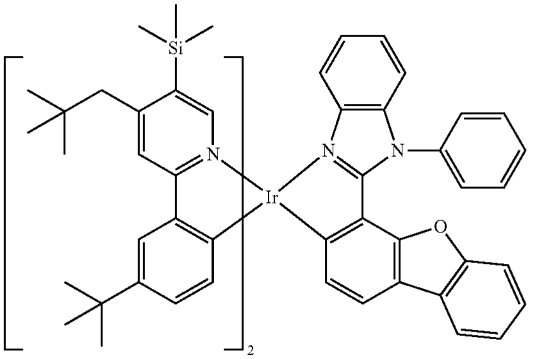
405
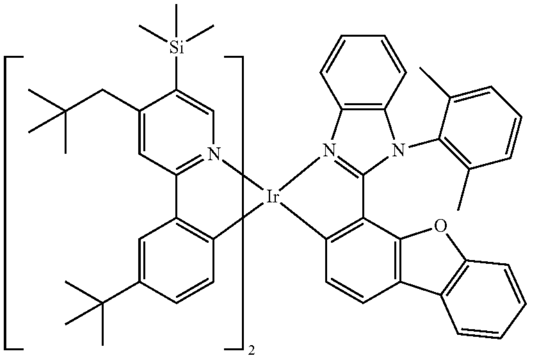
406
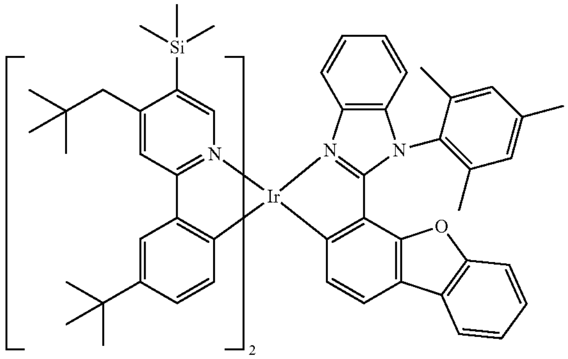

-continued
407
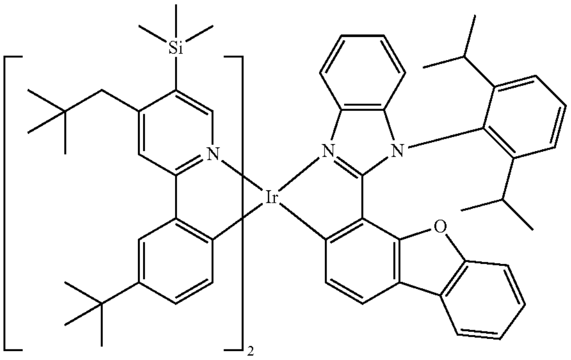
408
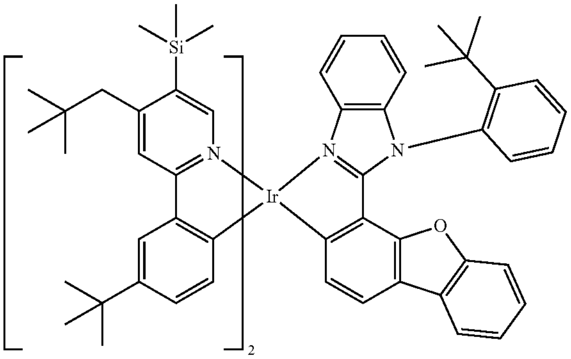
409
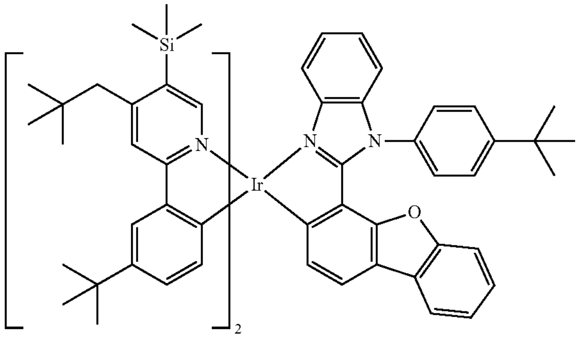
410
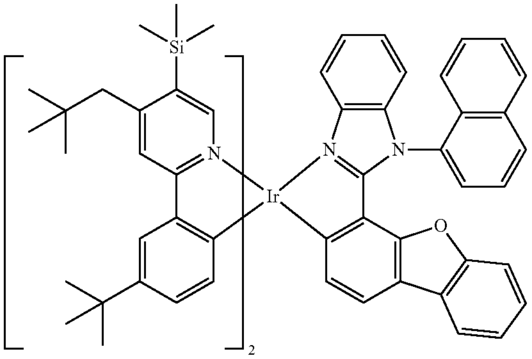
-continued
411
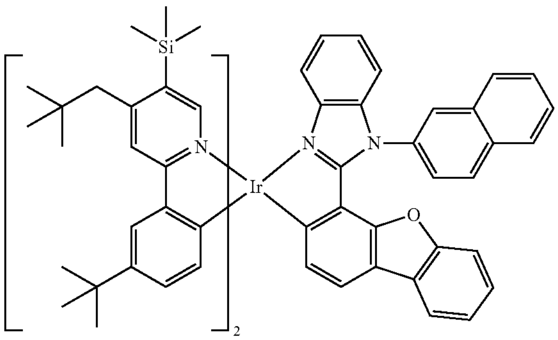
412
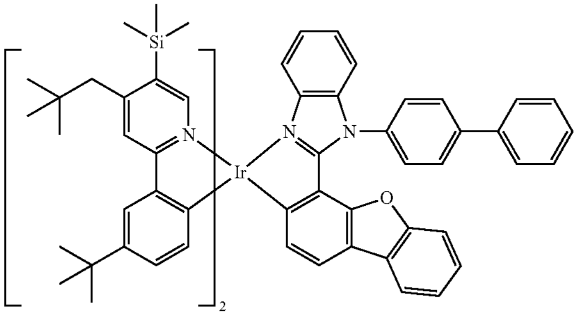
413
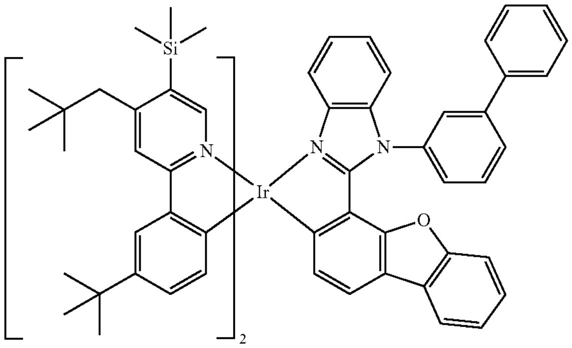
414
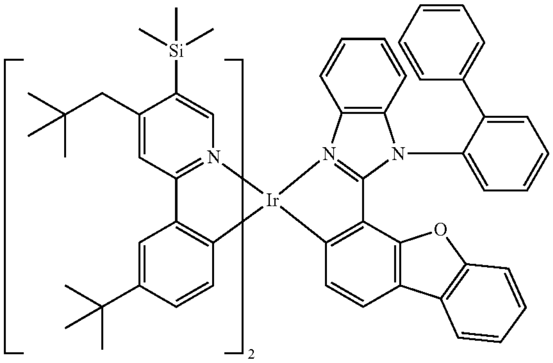

-continued
415
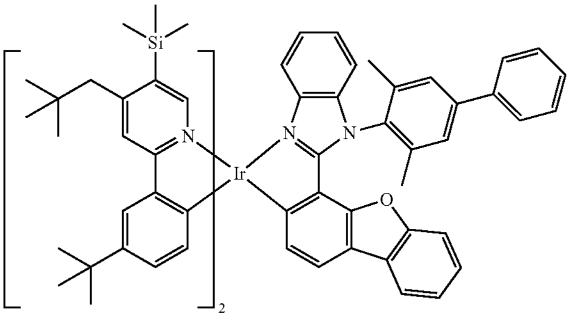
416
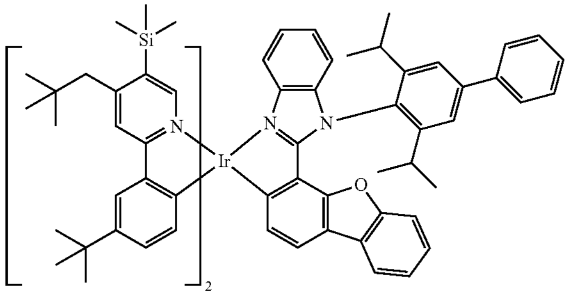
417
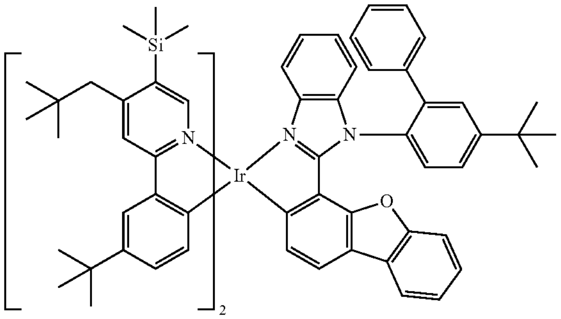
418
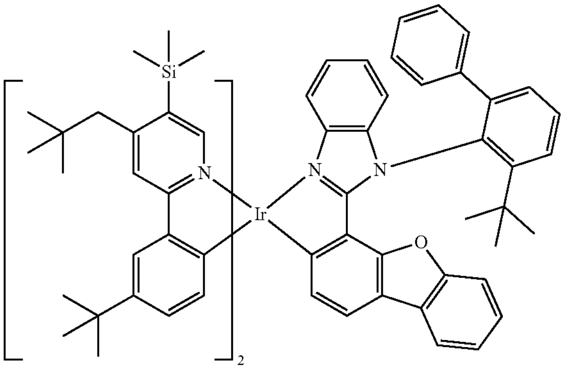
-continued
419
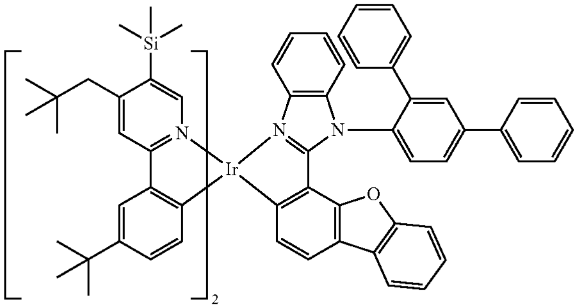
420
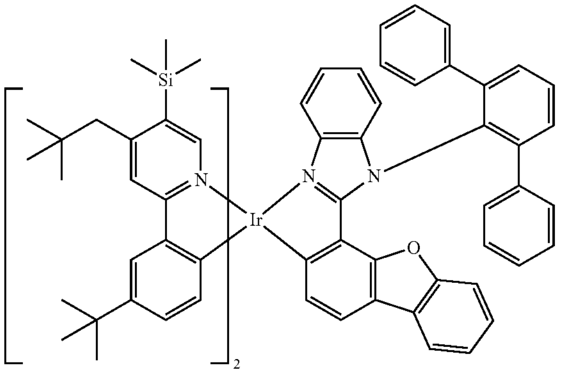
421
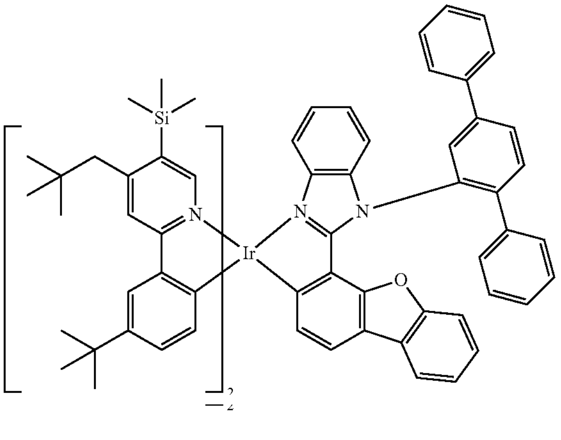
422
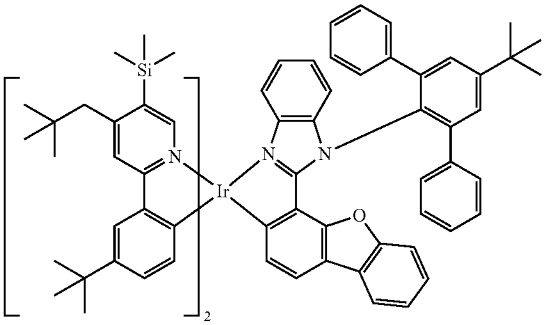

-continued
423
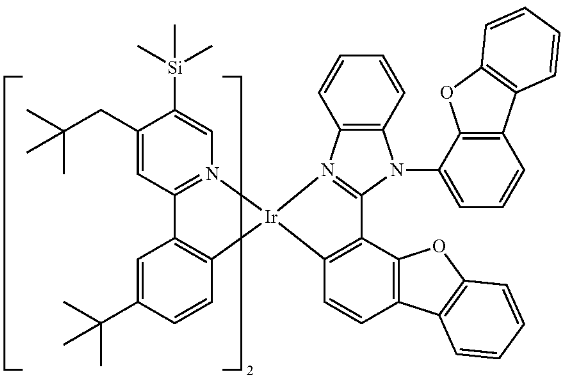
424
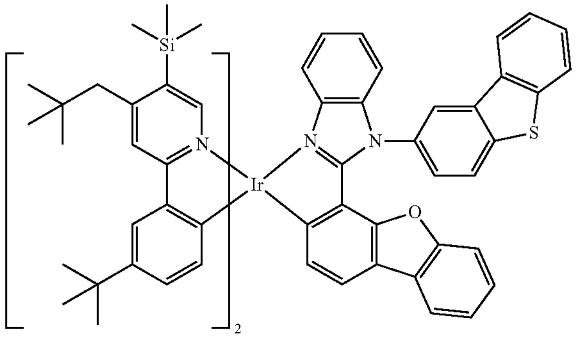
425
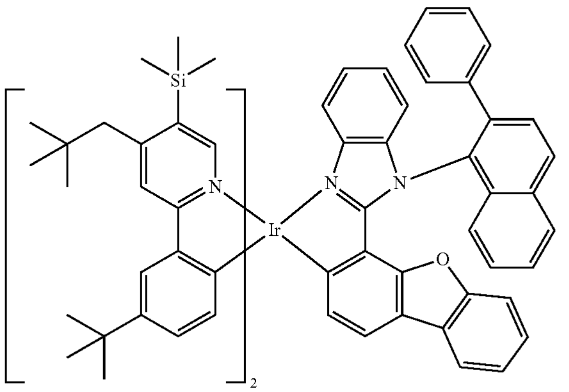
426
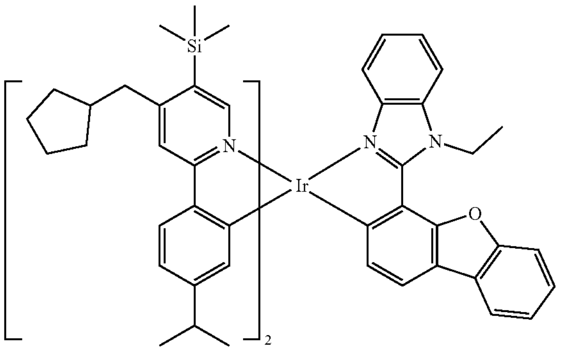
-continued
427
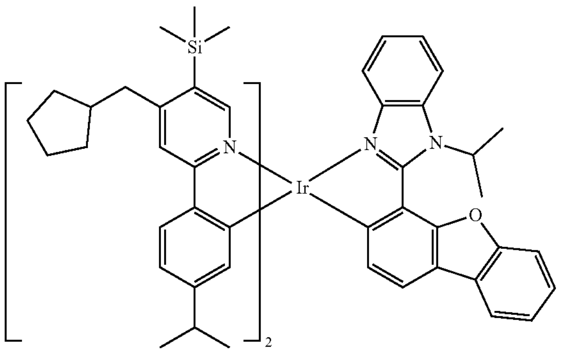
428
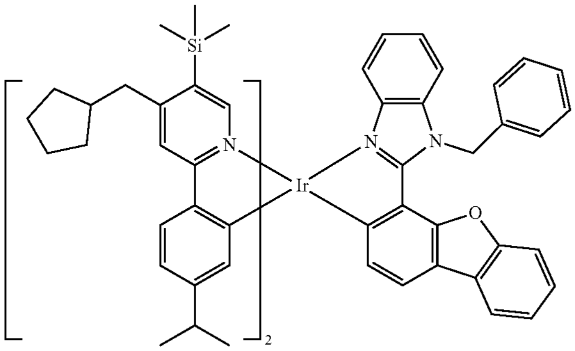
429
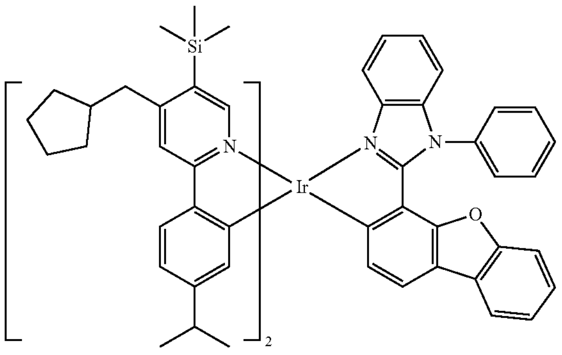
430
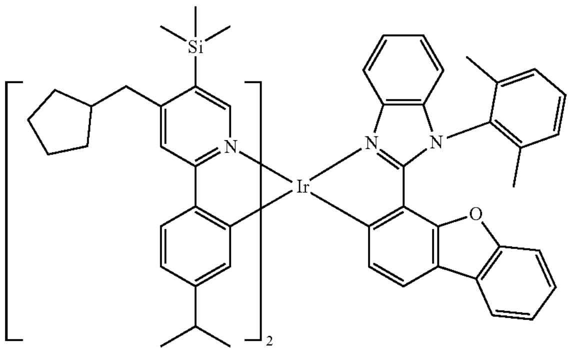

-continued
431
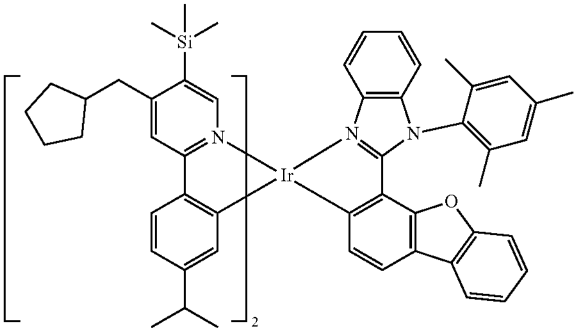
432
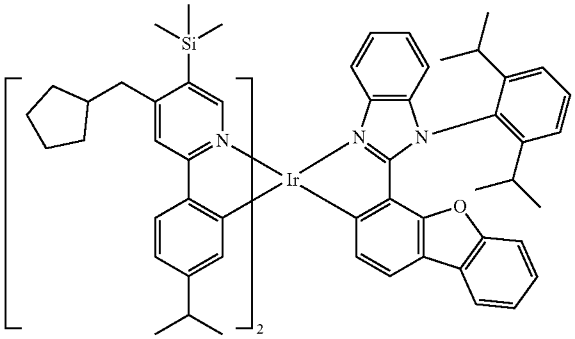
433
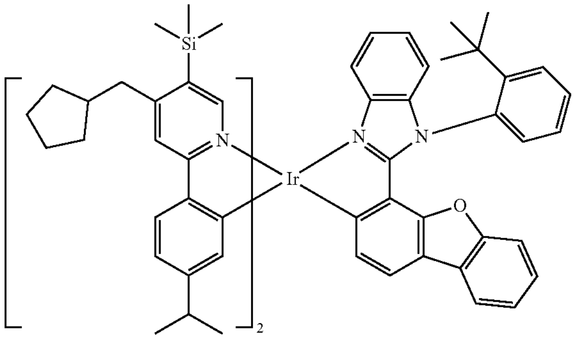
434
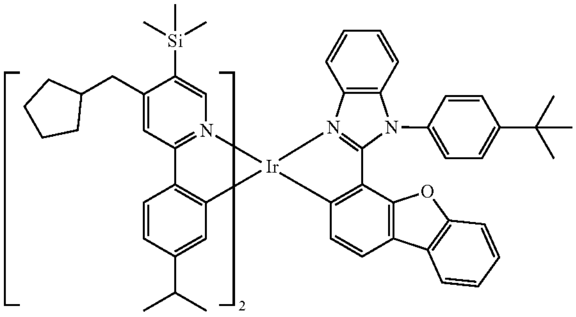
-continued
435
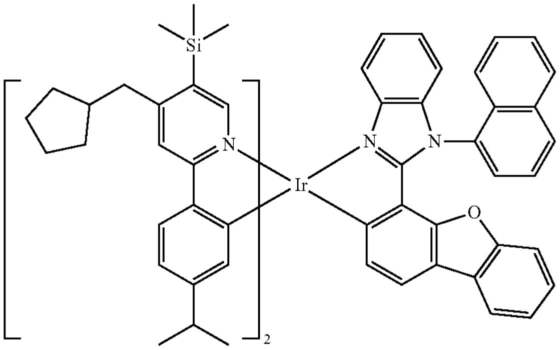
436
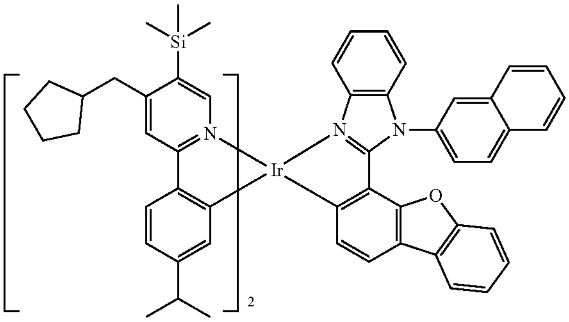
437
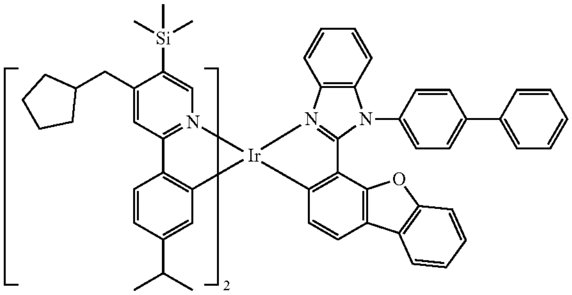
438
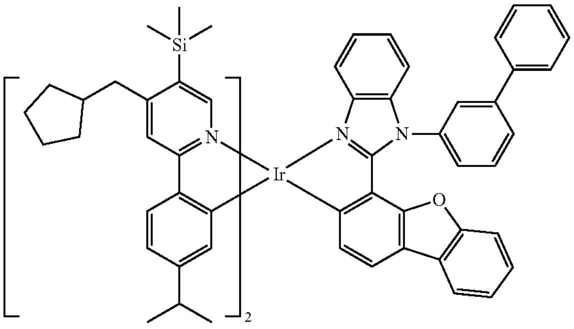

-continued
439
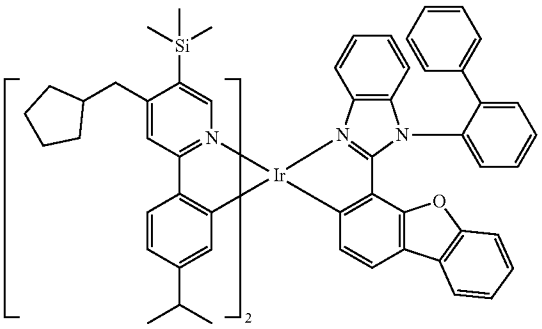
440
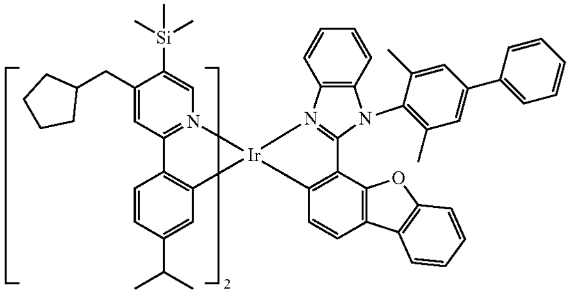
441
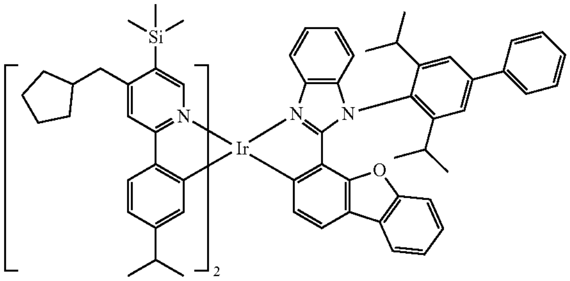
442
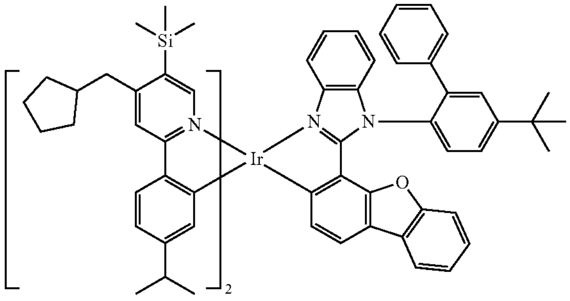
-continued
443
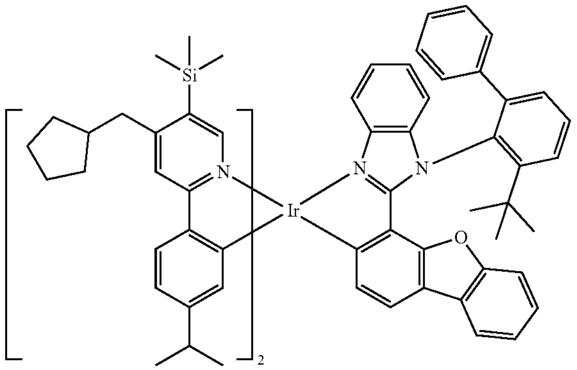
444
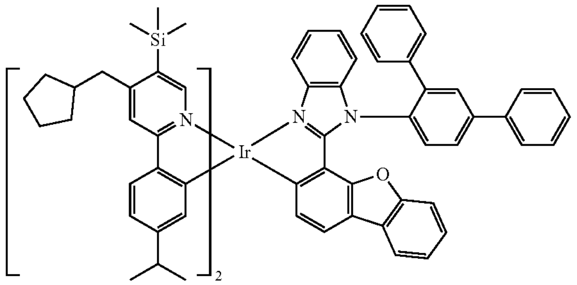
445
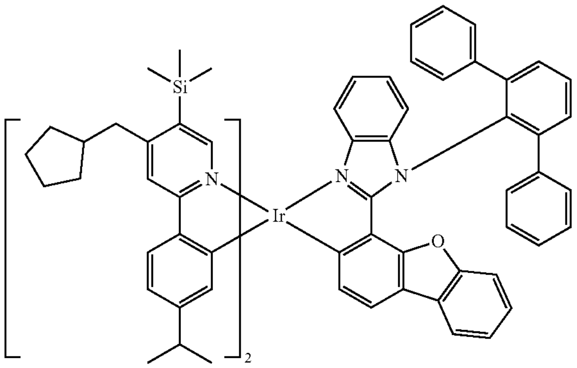
446
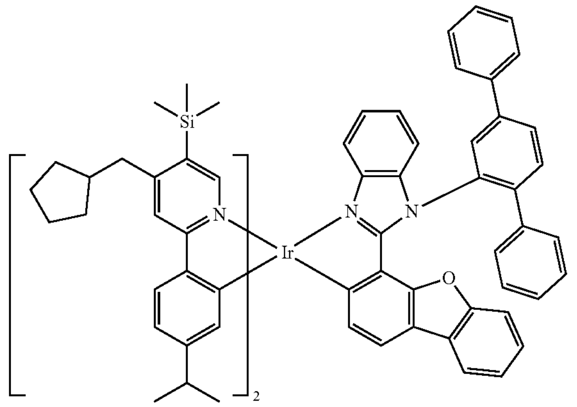

-continued
447
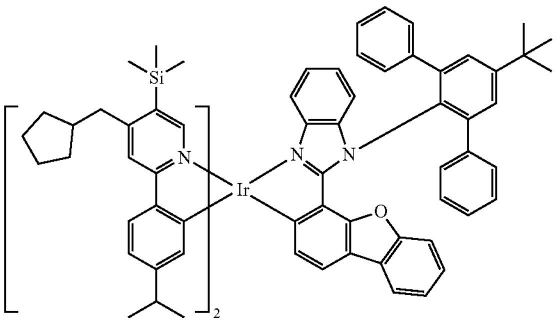
448
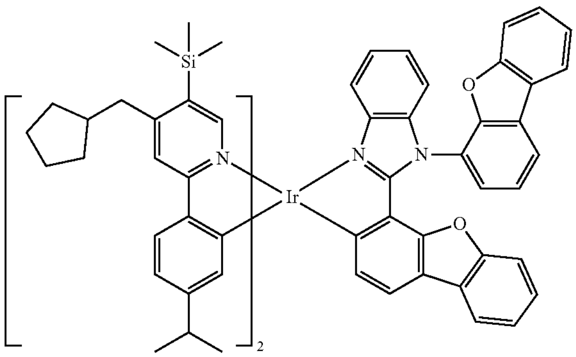
449
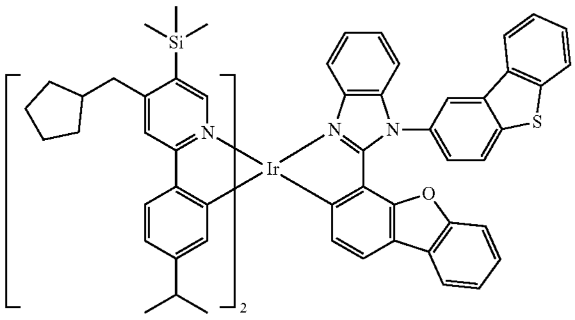
450
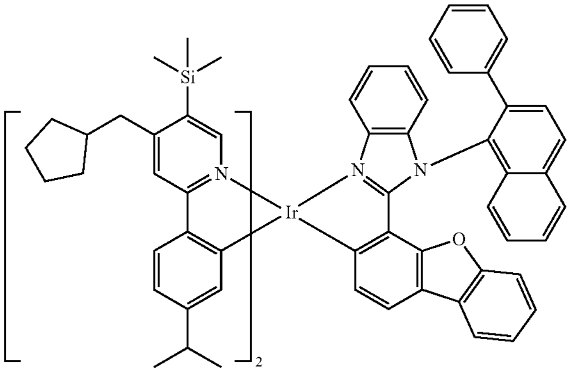
-continued
451
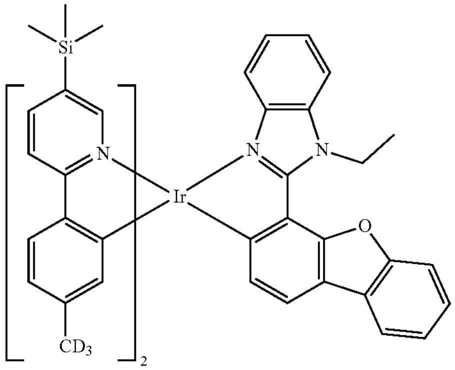
452
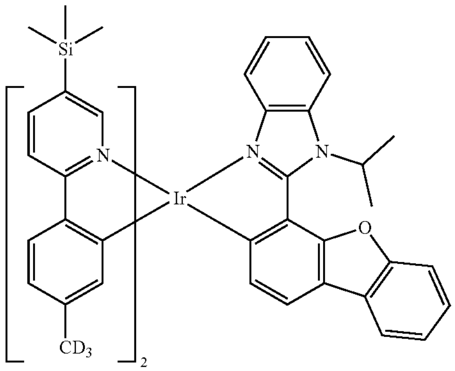
453
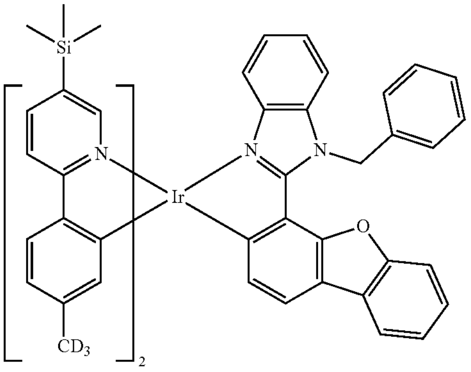
454
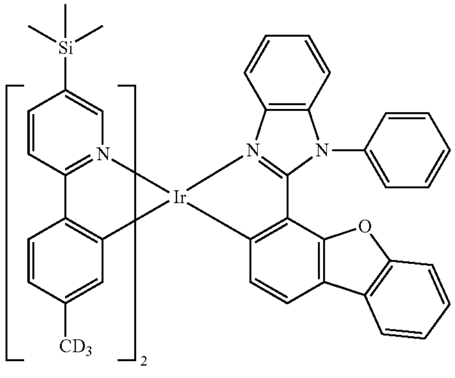

-continued
455
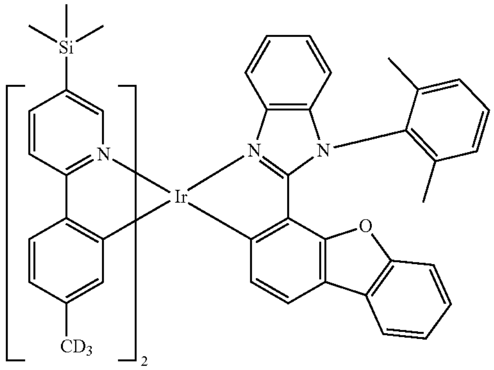
456
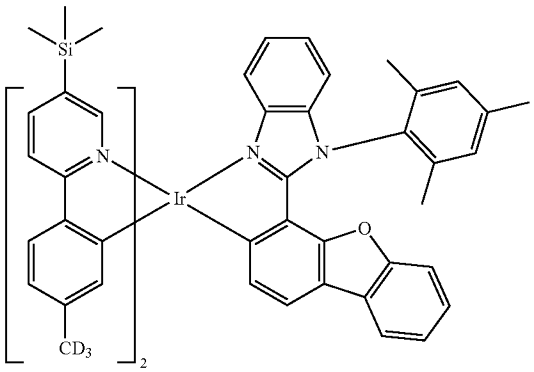
457
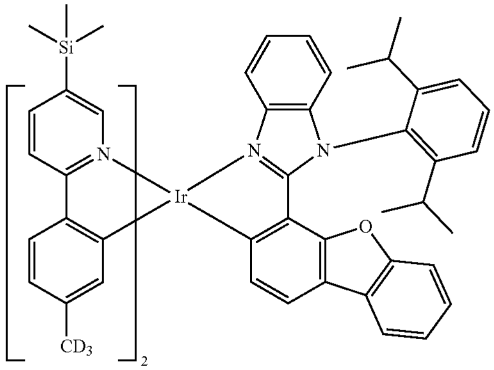
458
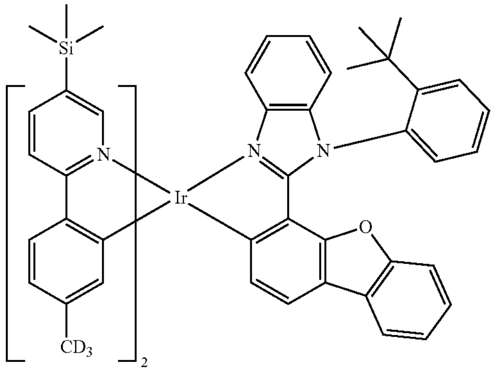
-continued
459
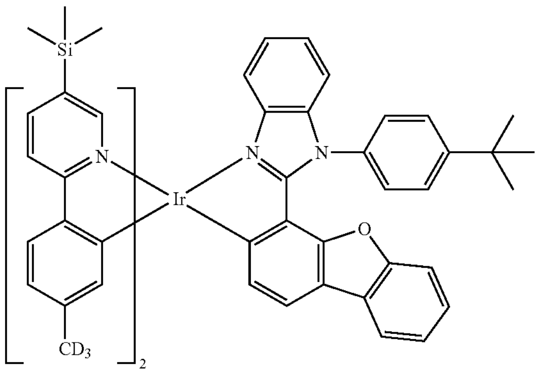
460
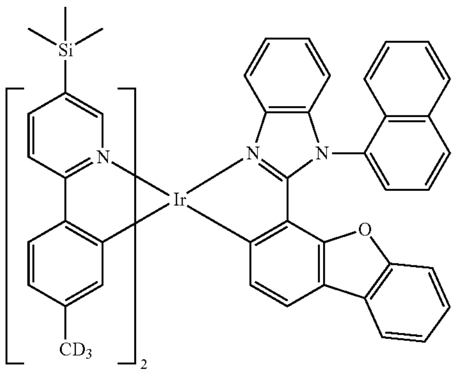
461
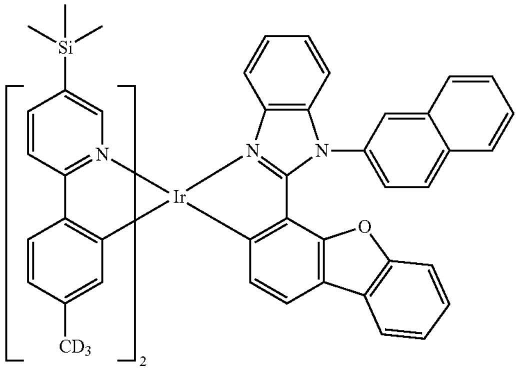
462
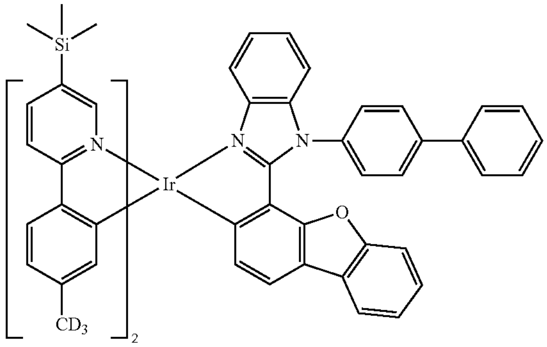

463
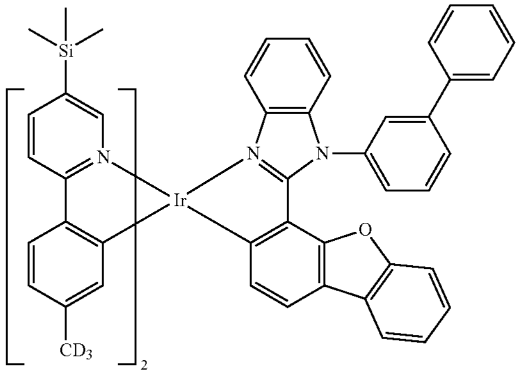
464
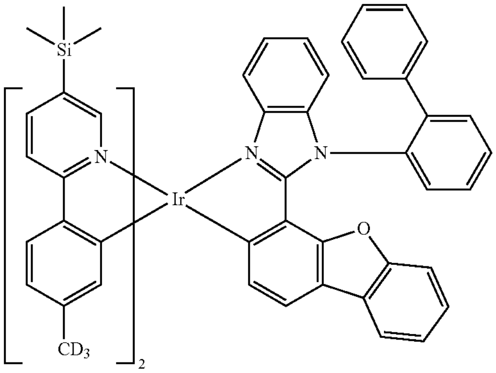
465
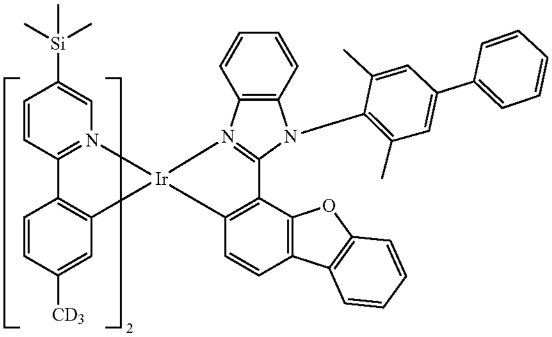
466
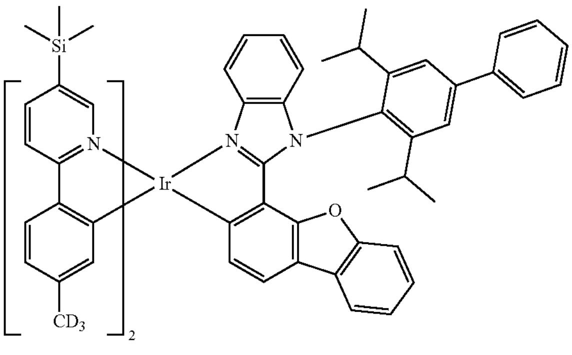
467
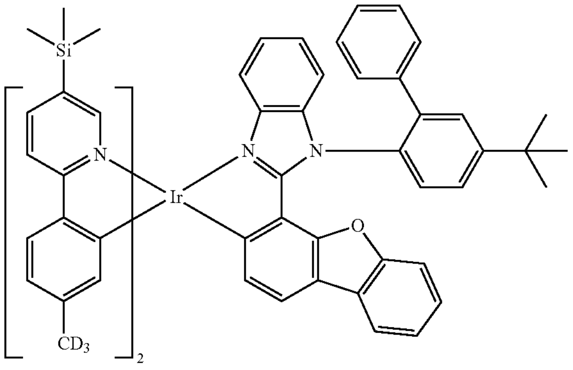
468
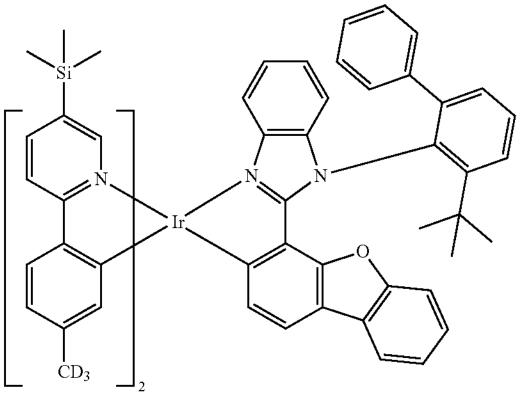
469
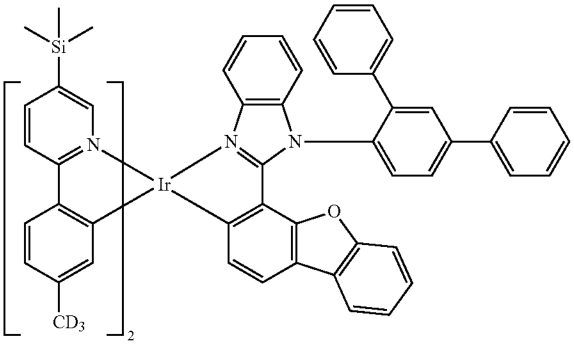
470
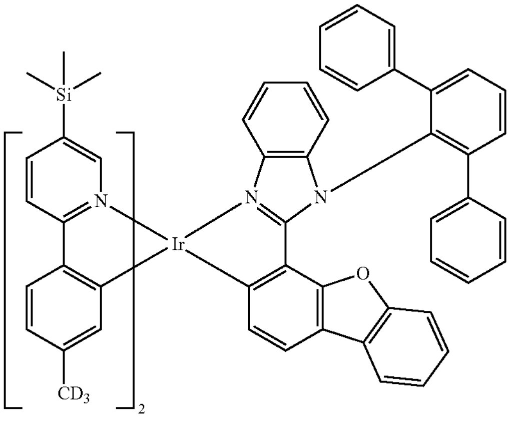

471
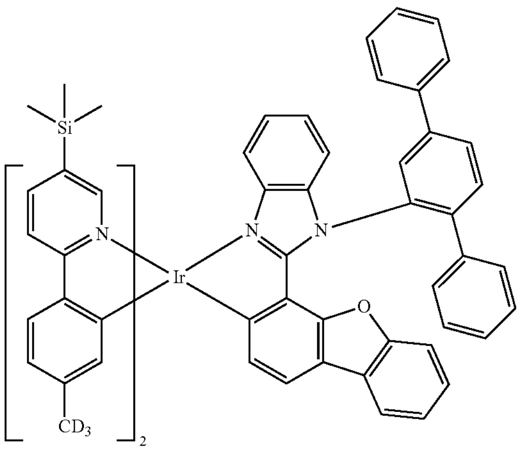
472
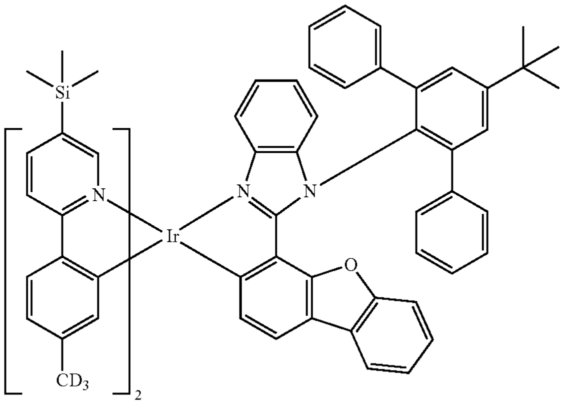
473
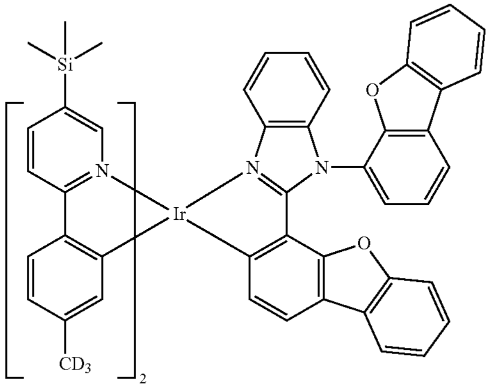
474
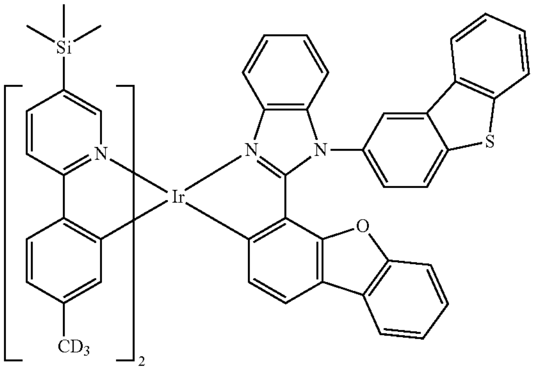
475
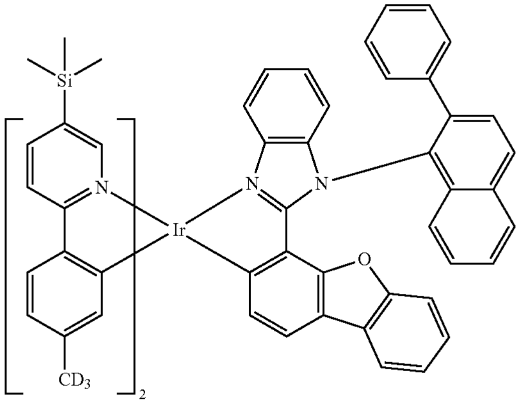
476
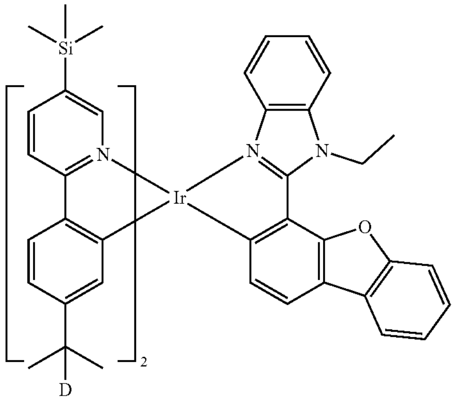
477
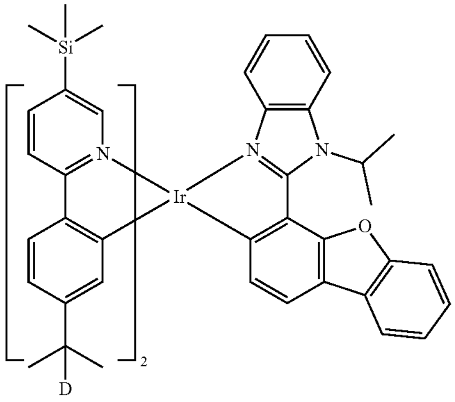

-continued
478
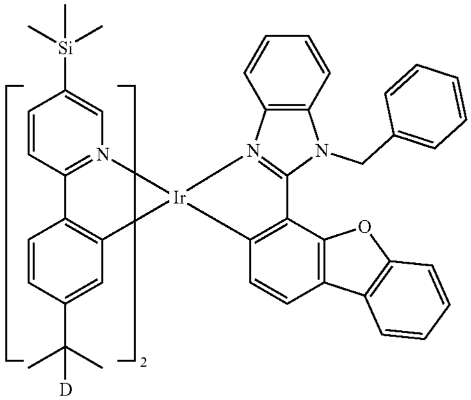
479
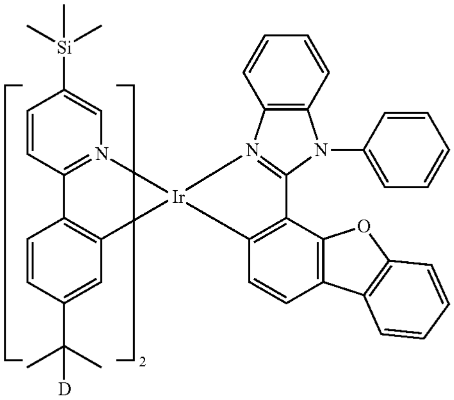
480
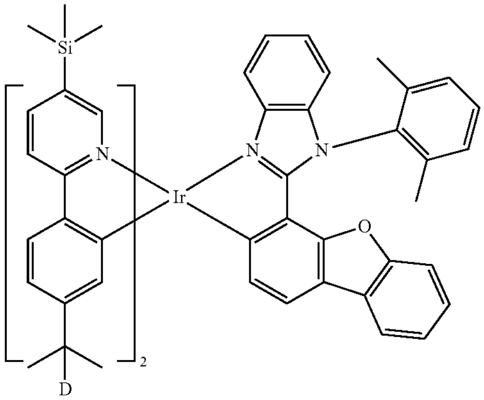
481
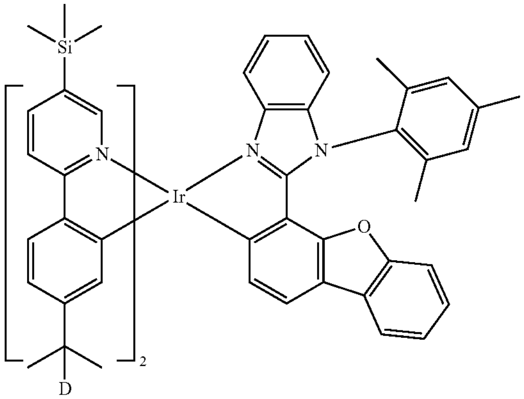
-continued
482
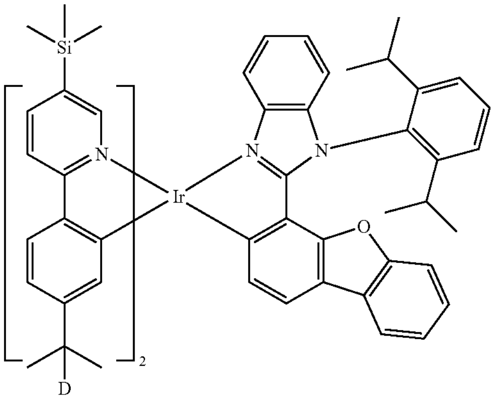
483
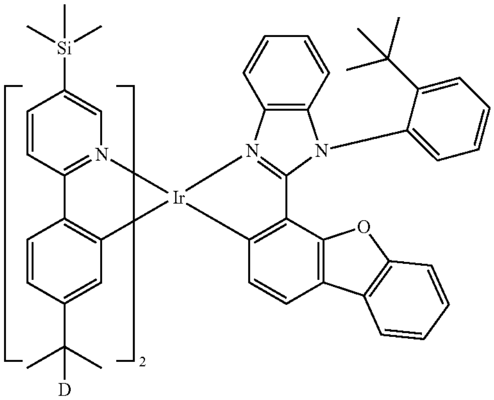
484
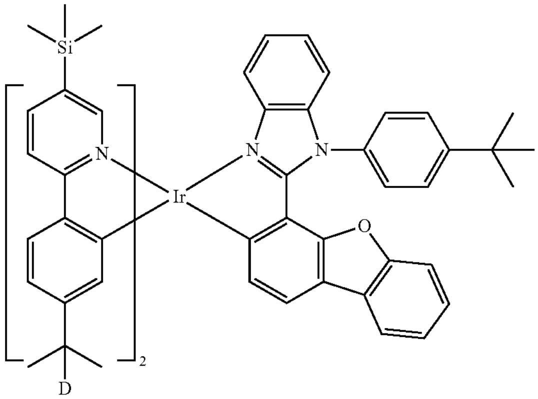
485
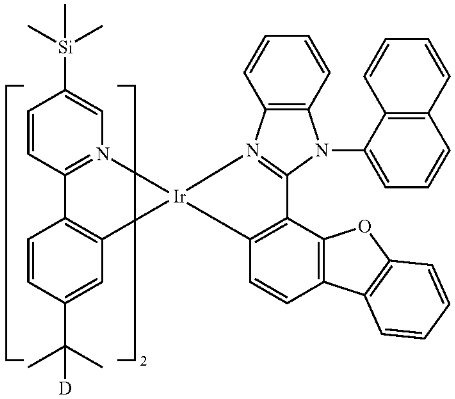

-continued
486
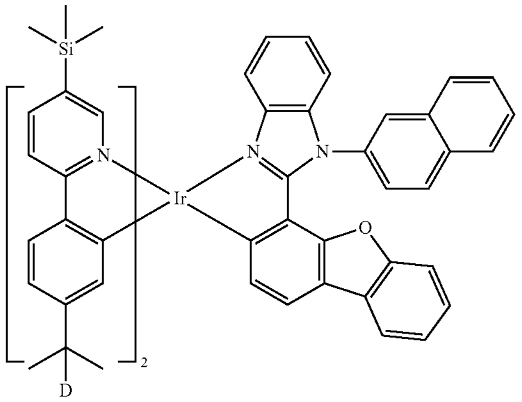
487
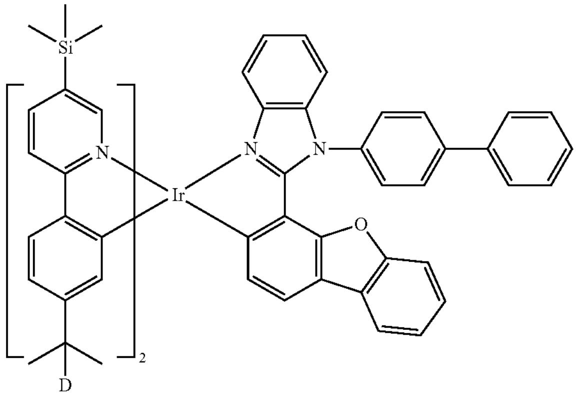
488
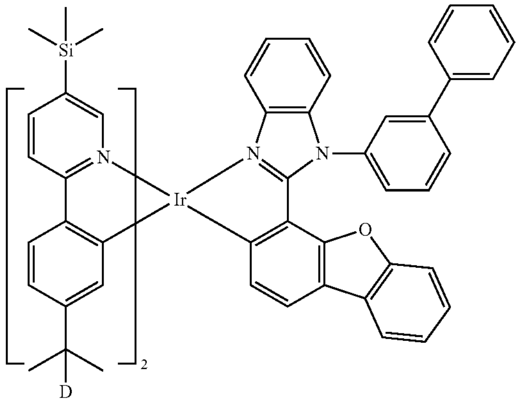
-continued
489
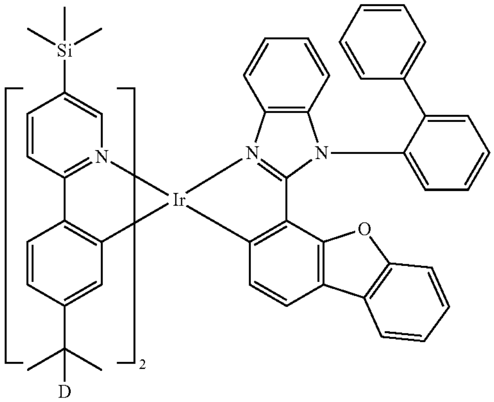
490
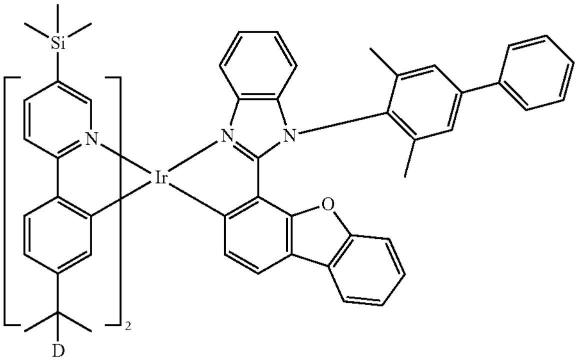
491
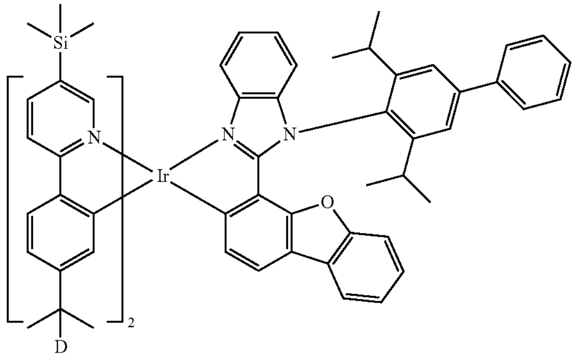
492
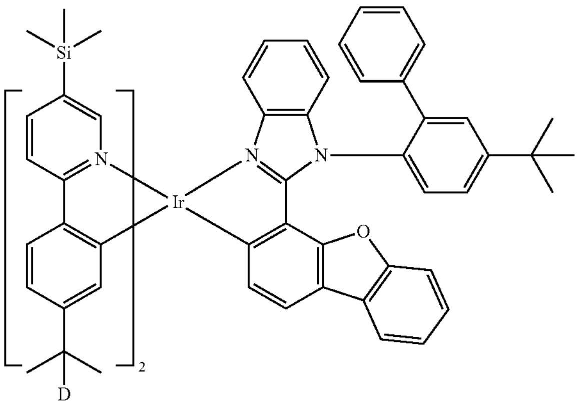

493
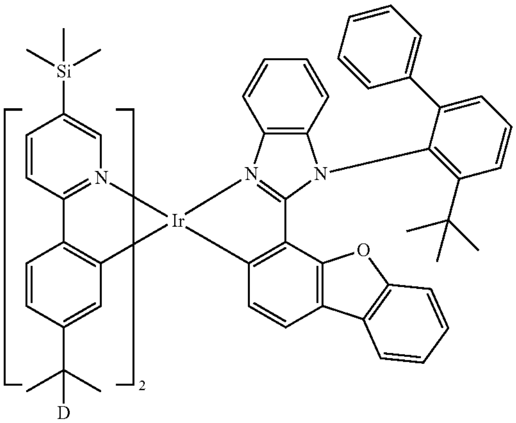
494
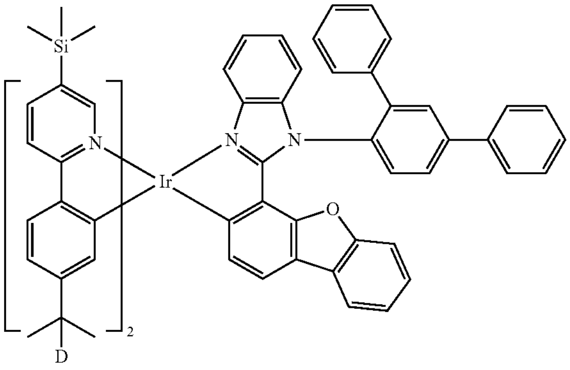
495
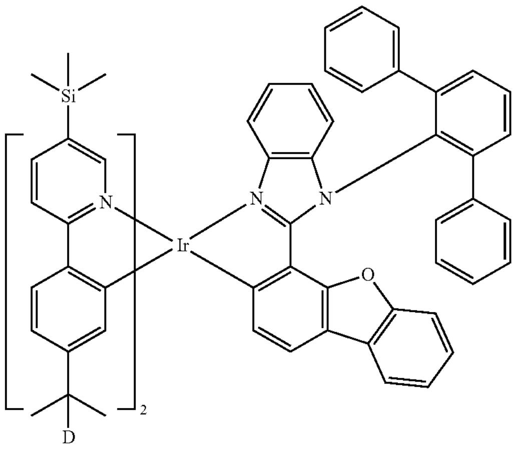
496
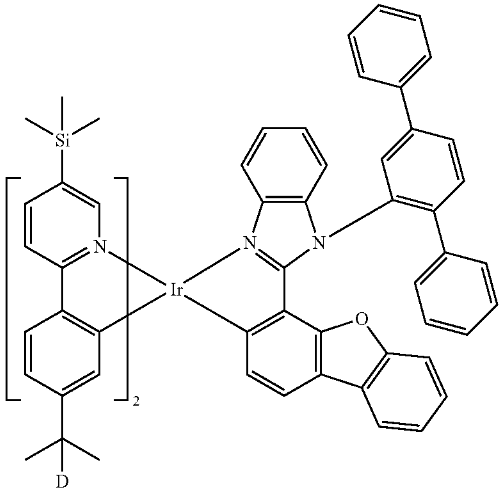
497
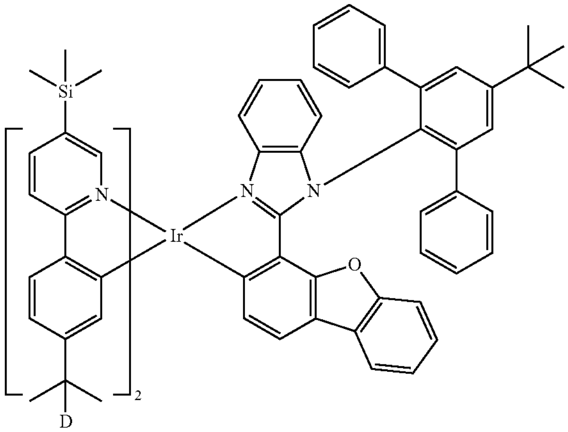
498
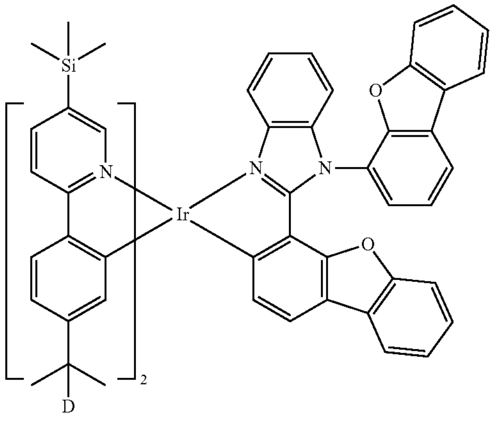

-continued
499
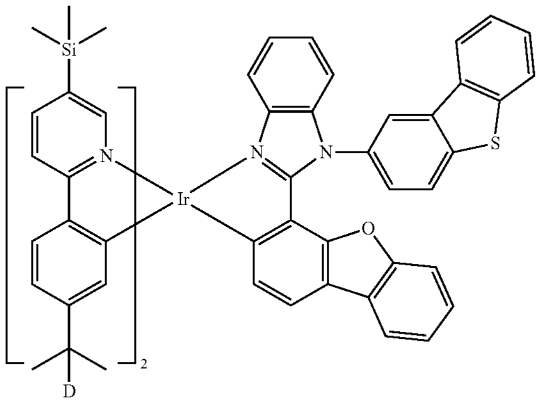
500
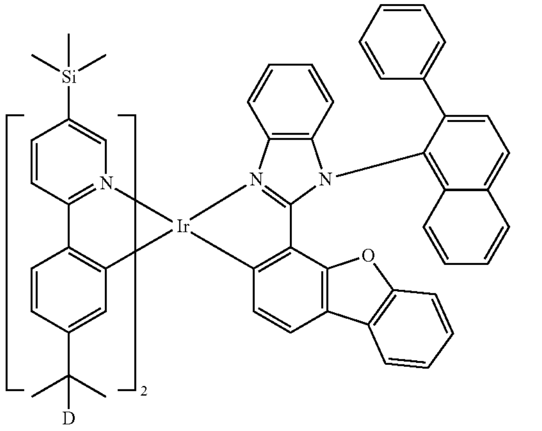
501
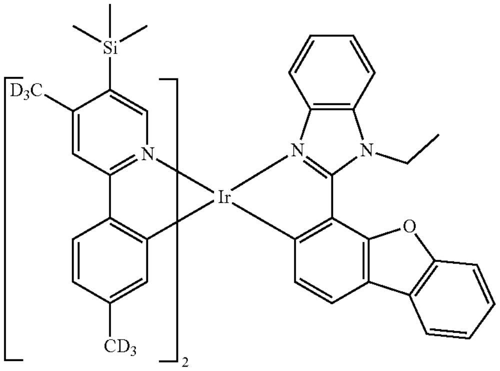
502
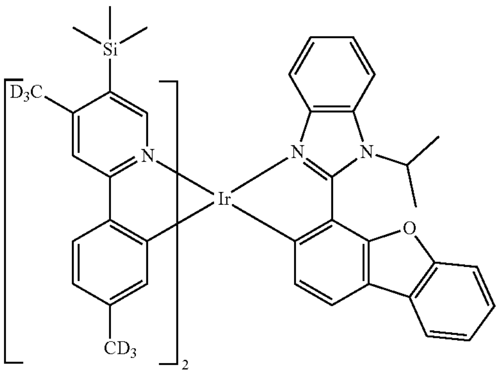
-continued
503
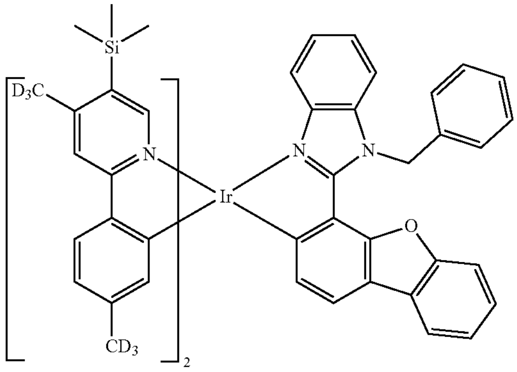
504
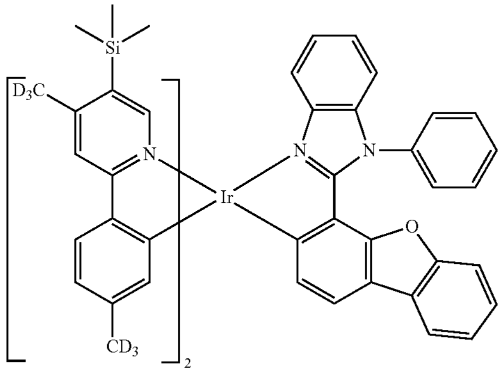
505
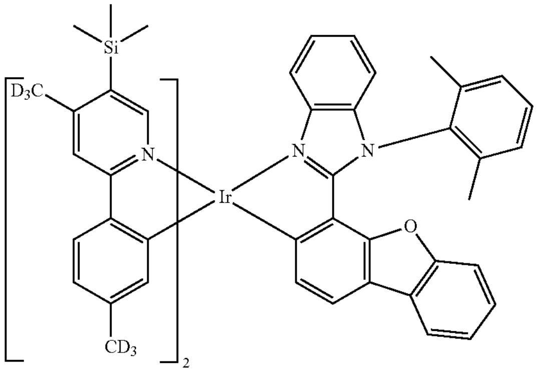
506
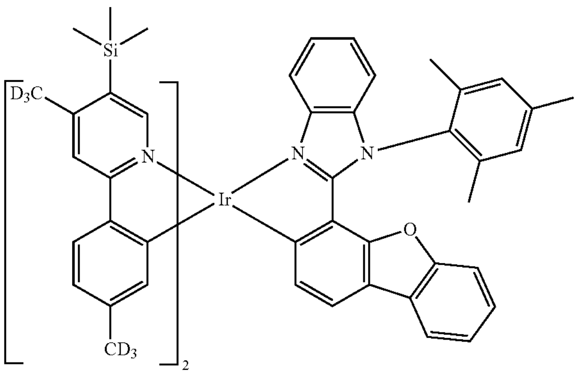

-continued
507
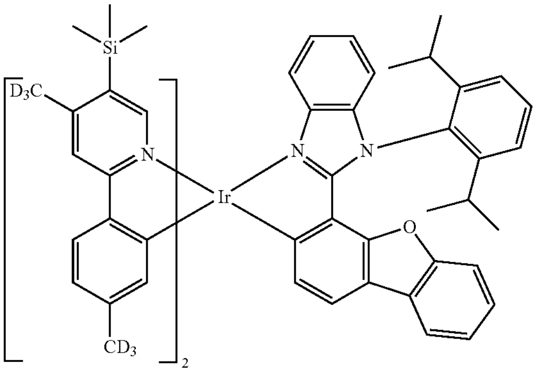
508
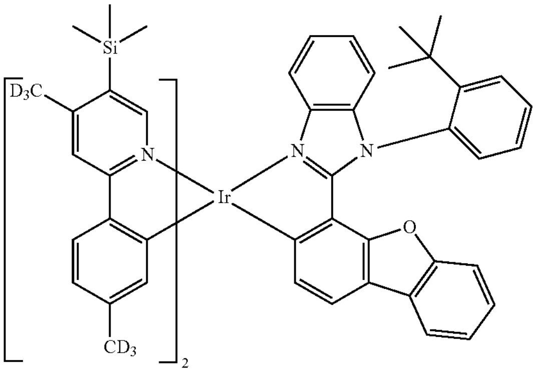
509
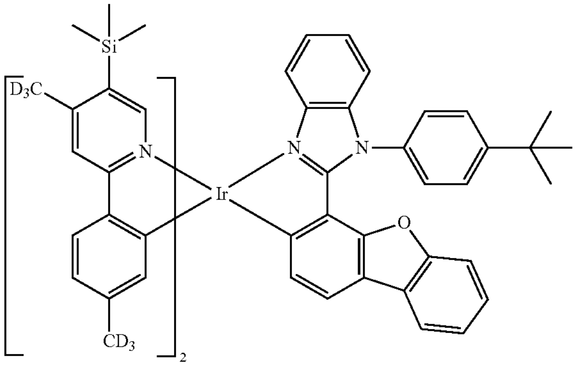
510
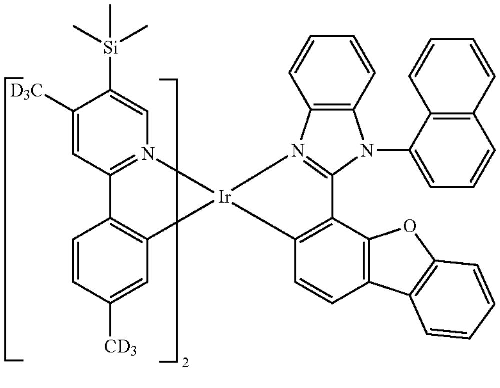
-continued
511
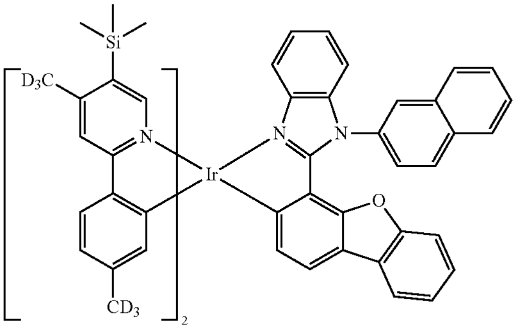
512
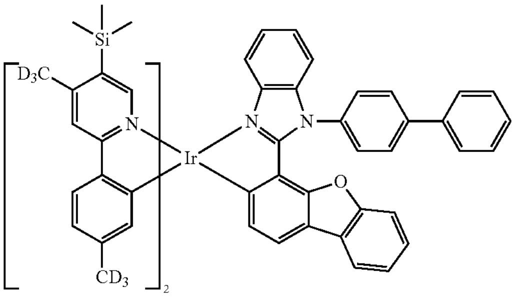
513
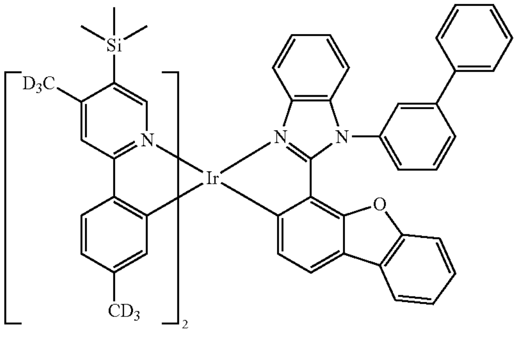
514
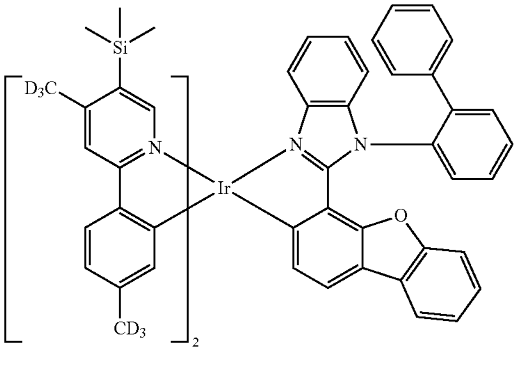

-continued
515
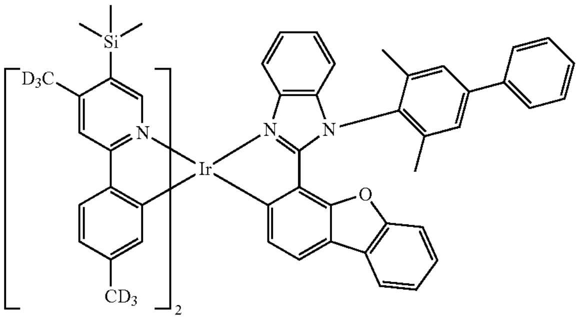
516
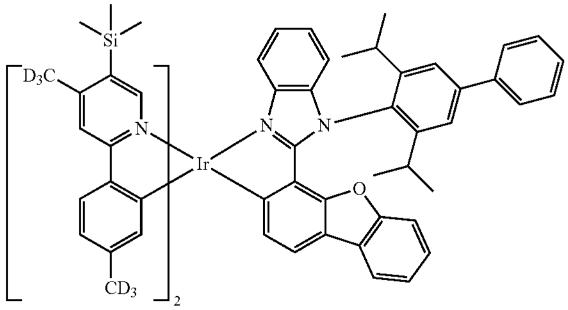
517
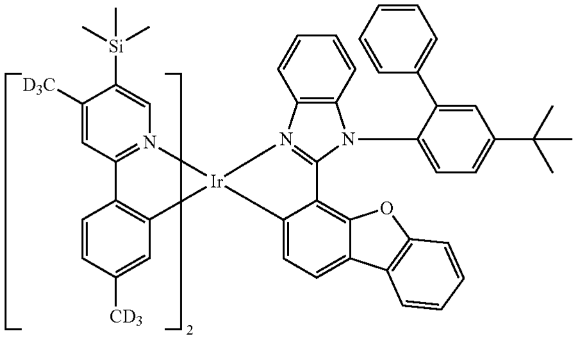
518
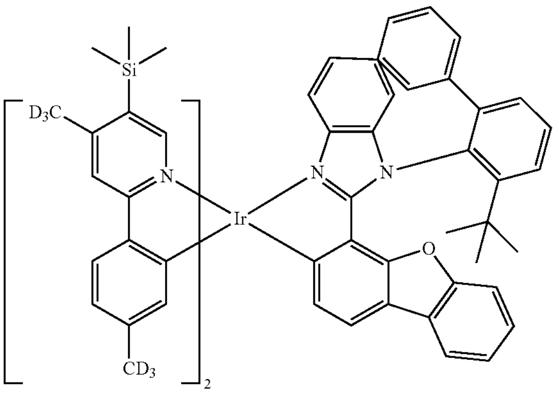
-continued
519
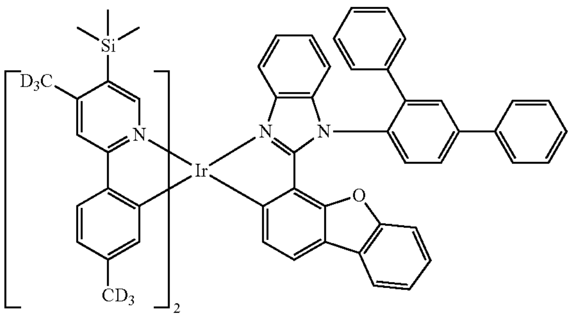
520
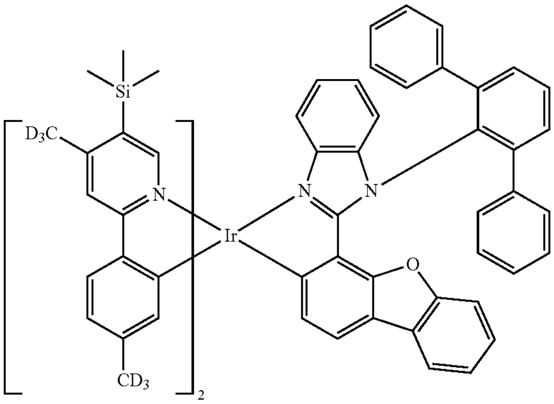
521
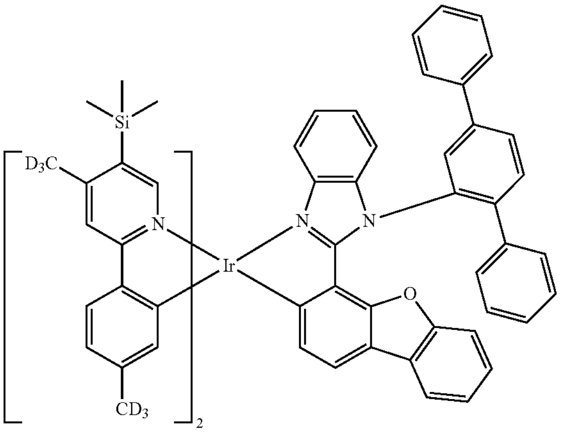
522
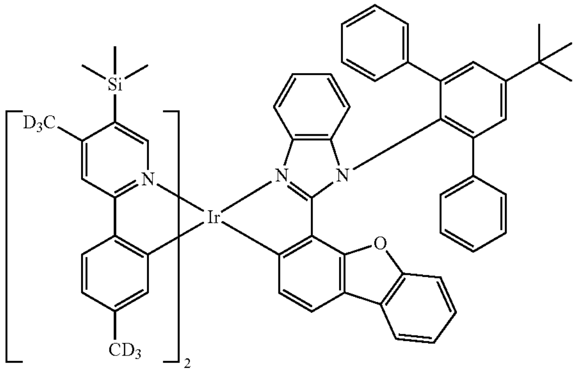

-continued
523
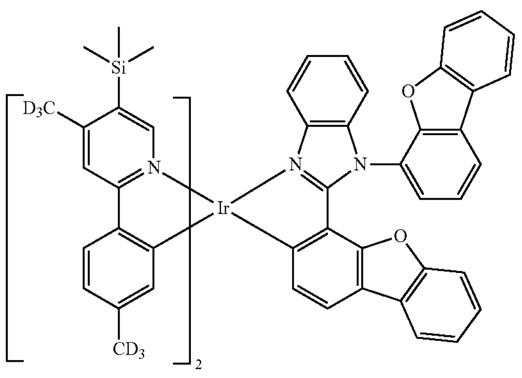
524
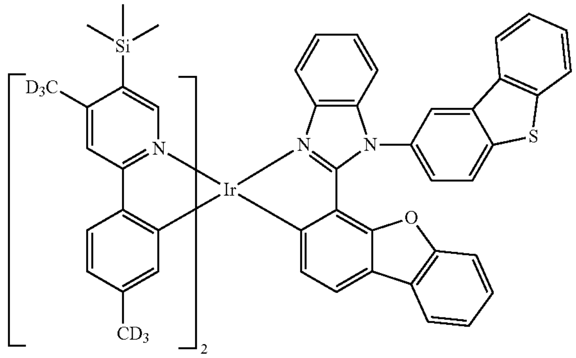
525
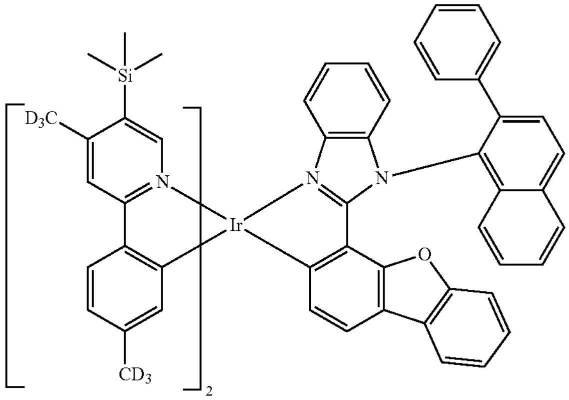
526
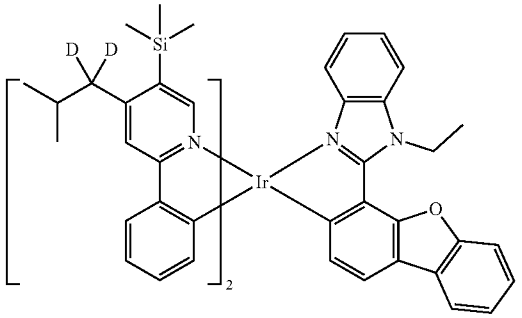
-continued
527
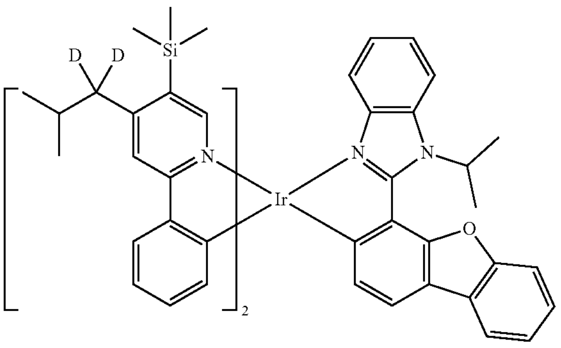
528
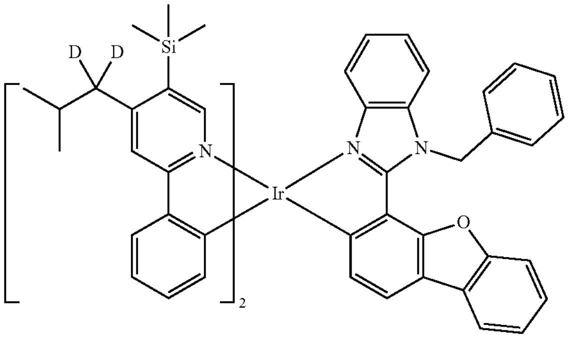
529
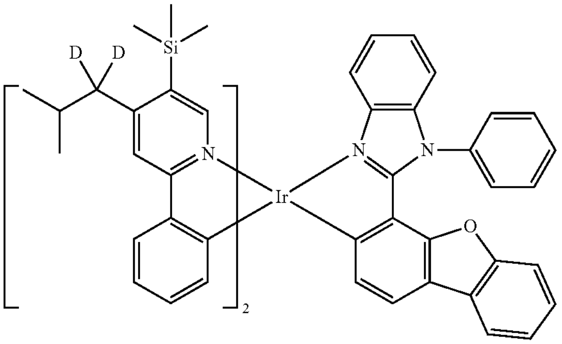
530
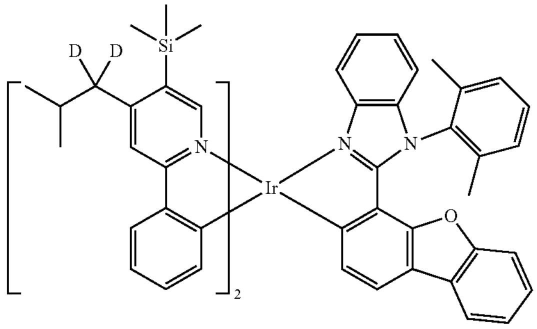

-continued
531
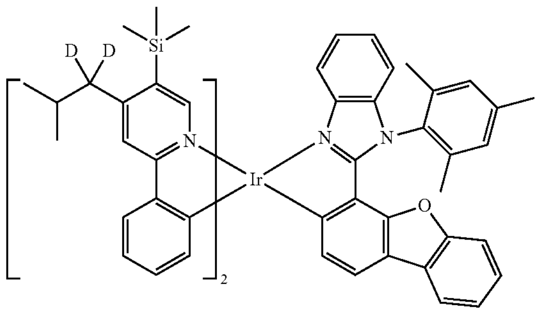
532
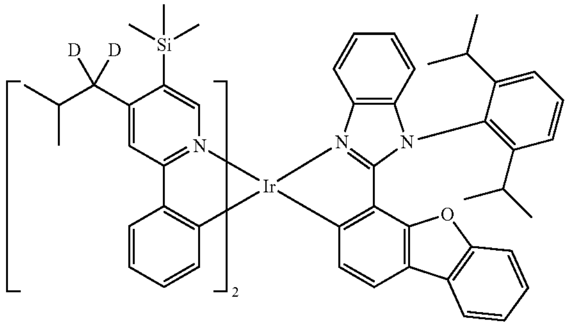
533
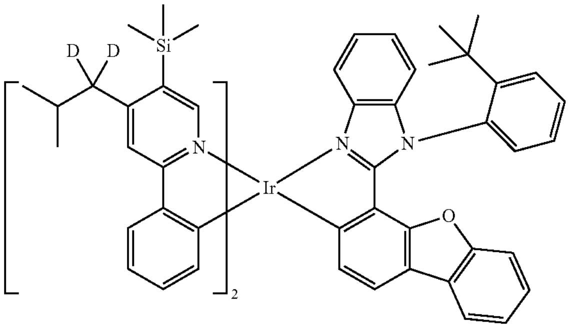
534
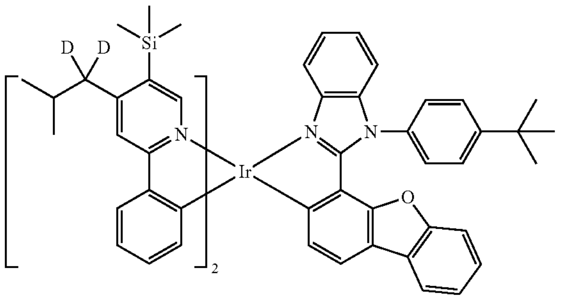
-continued
535
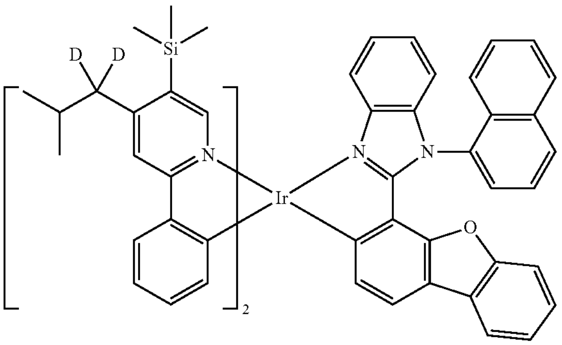
536
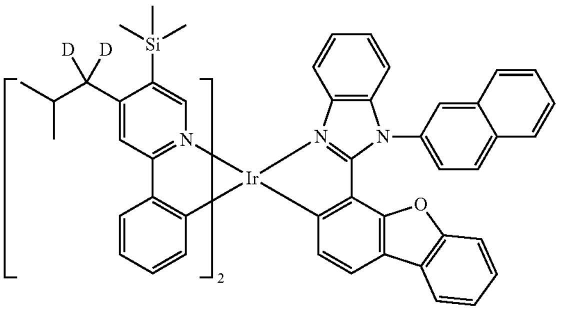
537
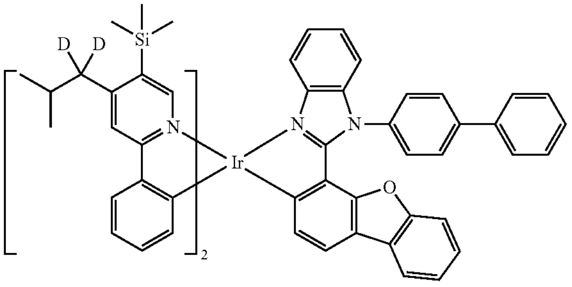
538
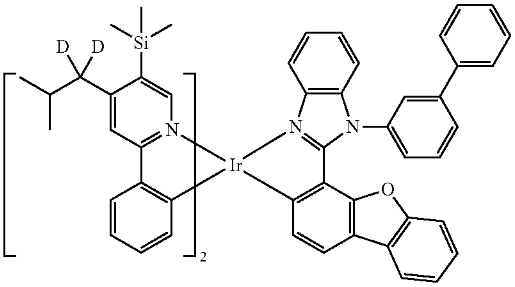
539
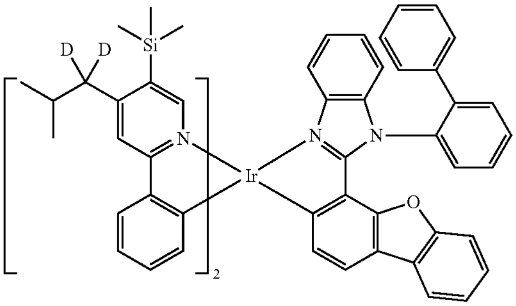

-continued
540
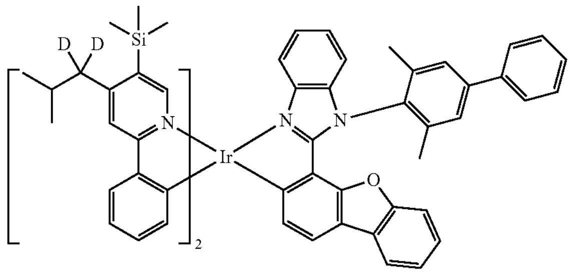
541
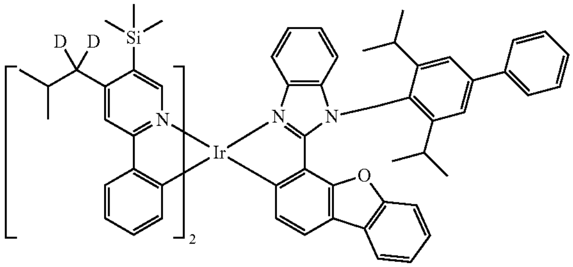
542
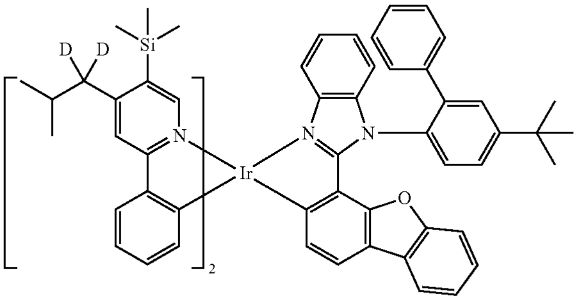
543
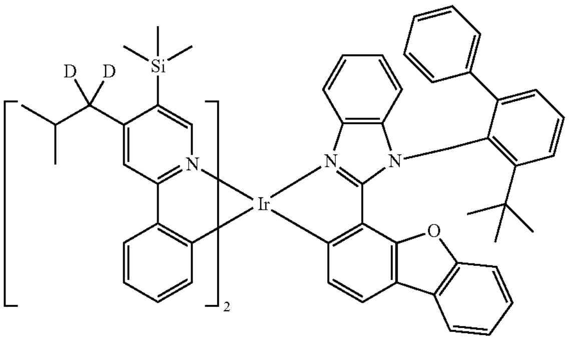
544
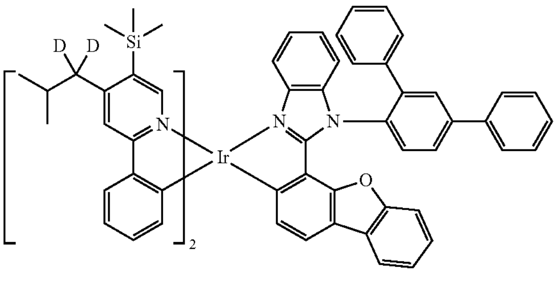
-continued
545
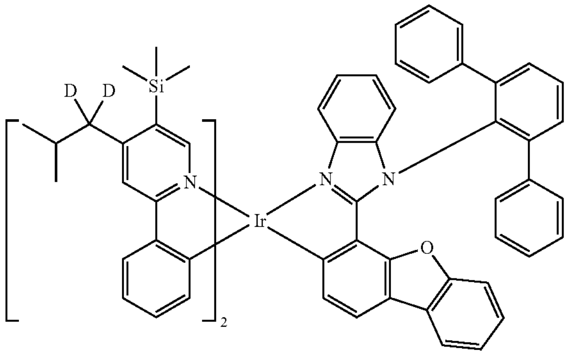
546
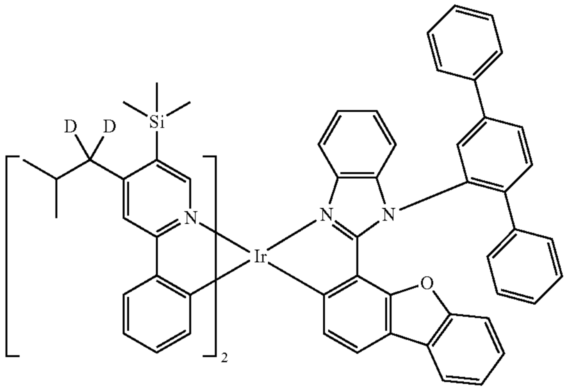
547
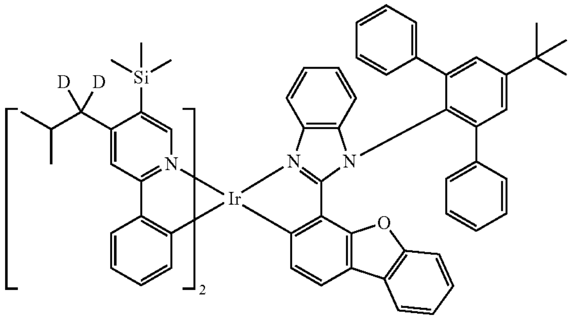
548
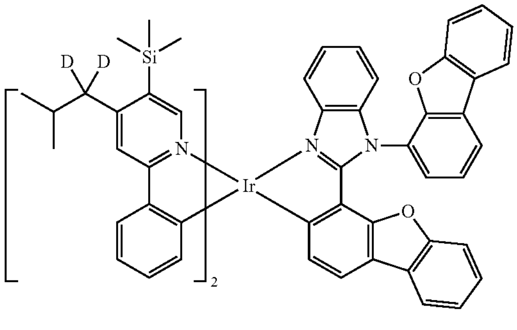

-continued
549
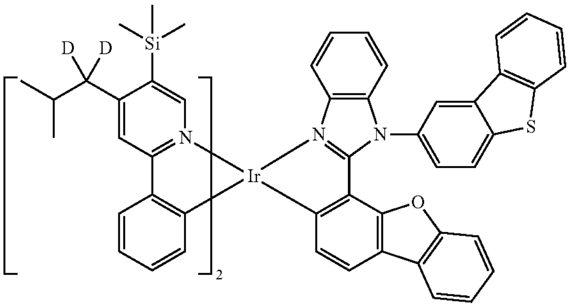
550
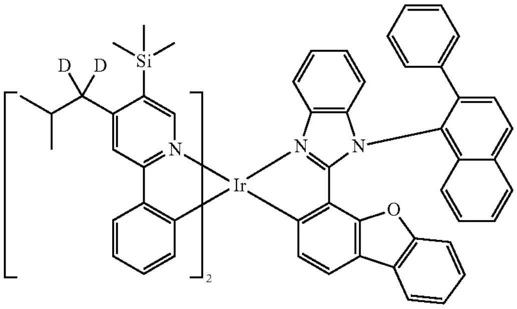
551
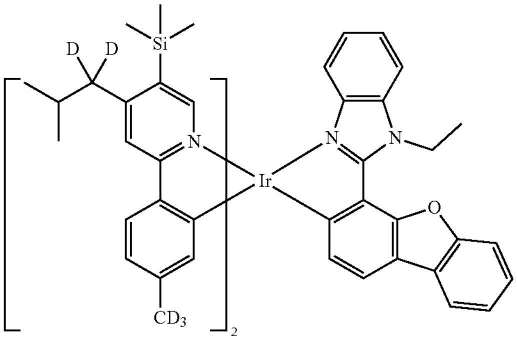
552
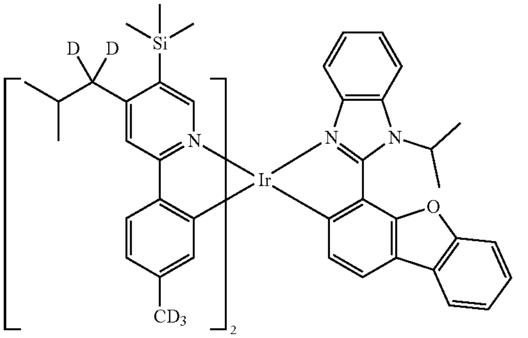
-continued
553
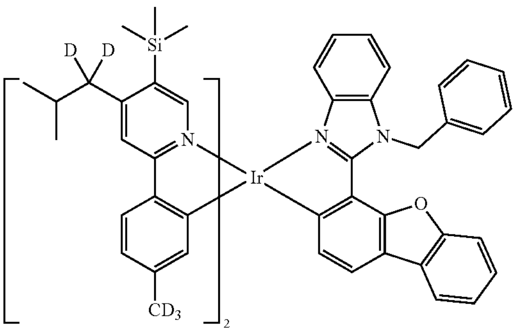
554
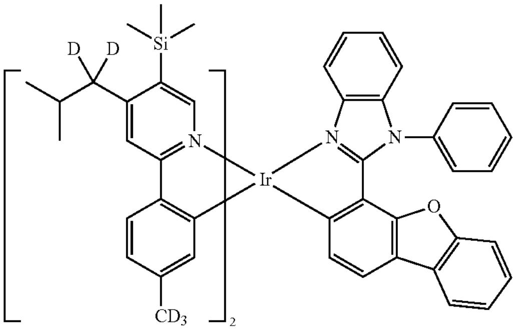
555
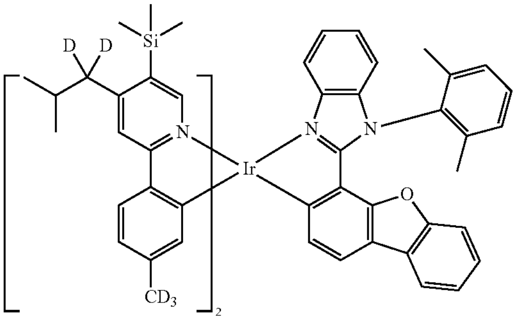
556
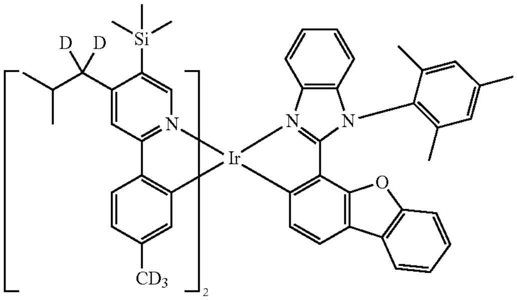

-continued
557
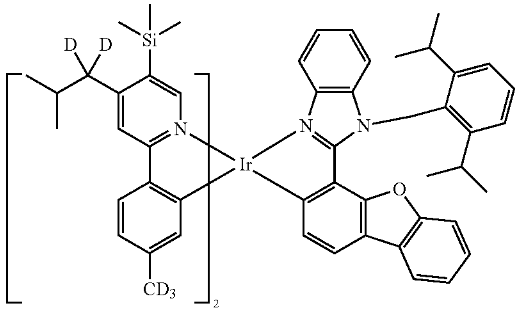
558
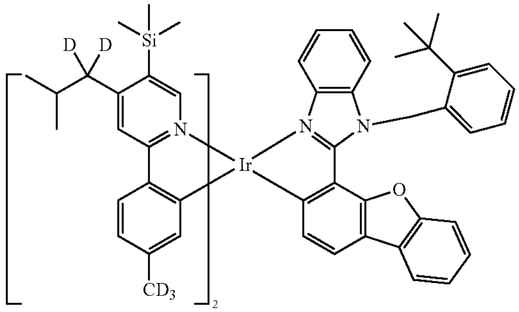
559
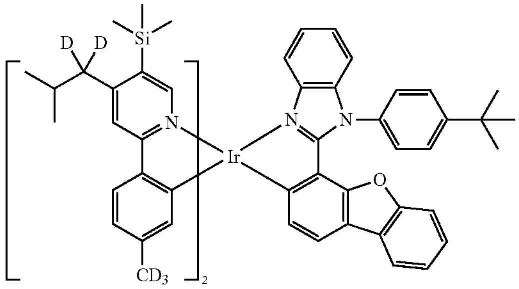
560
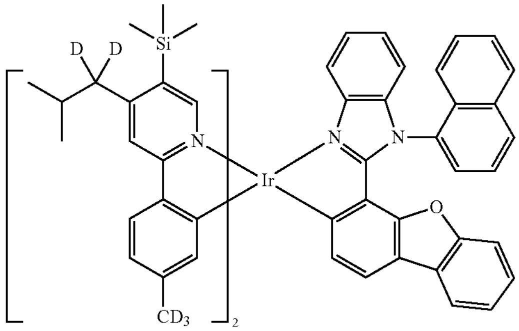
561
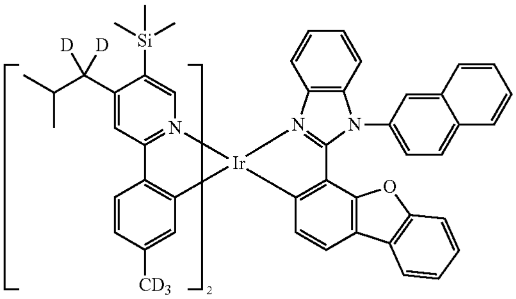
-continued
562
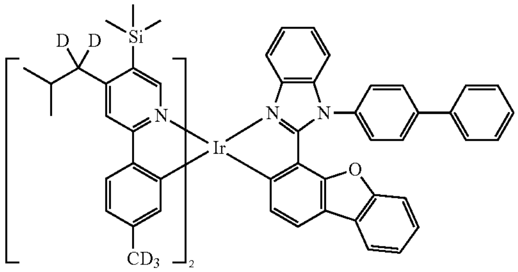
563
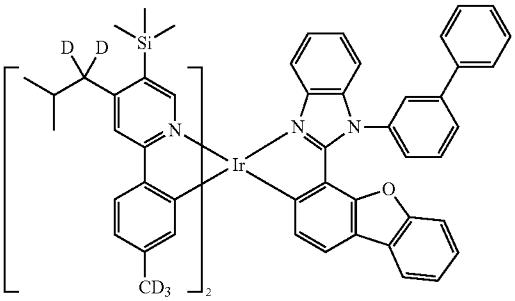
564
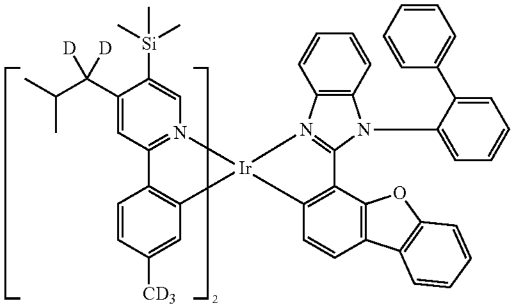
565
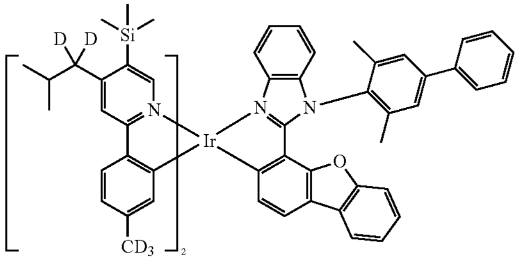
566
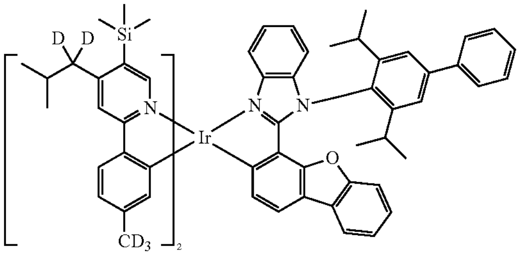

-continued
567
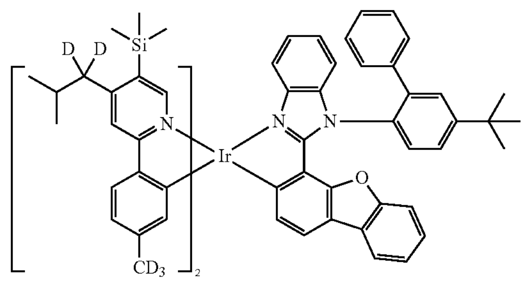
568
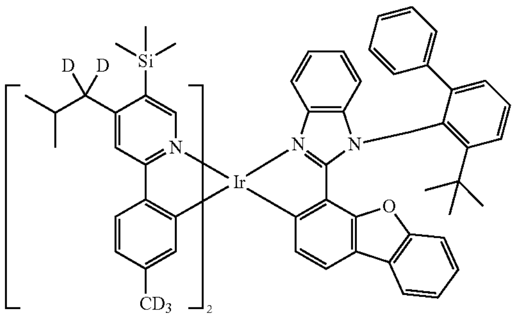
569
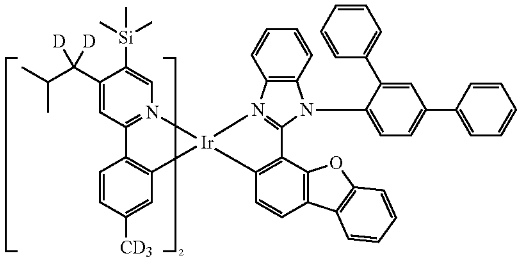
570
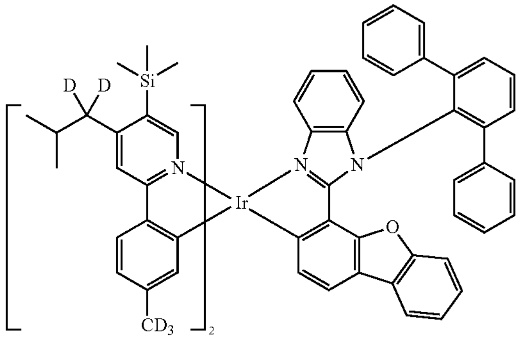
571
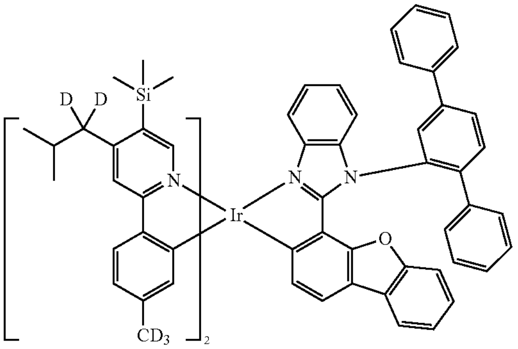
-continued
572
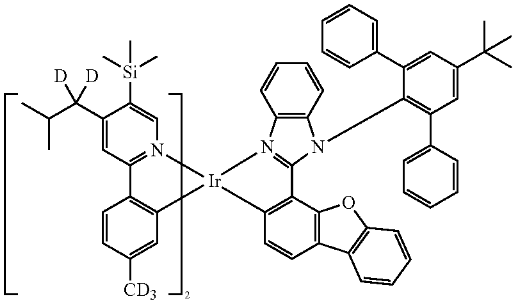
573
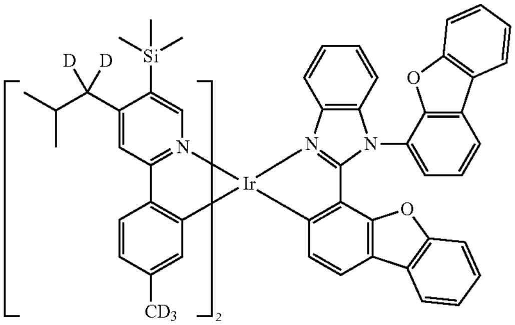
574
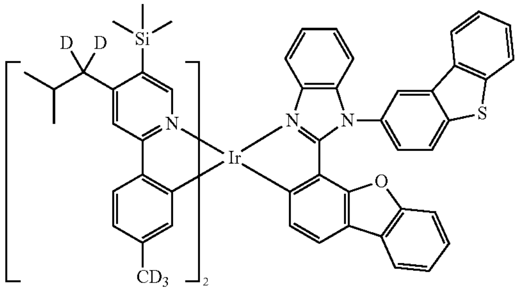
575
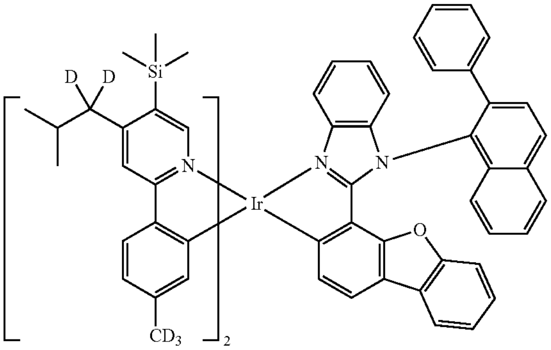

-continued
576
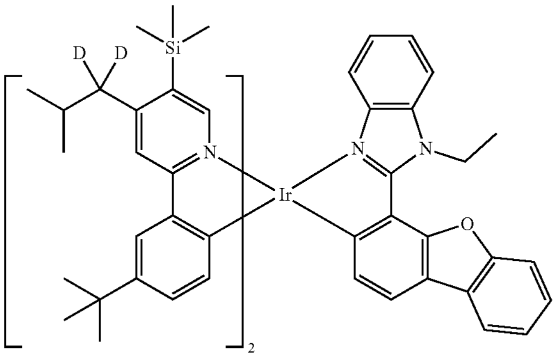
577
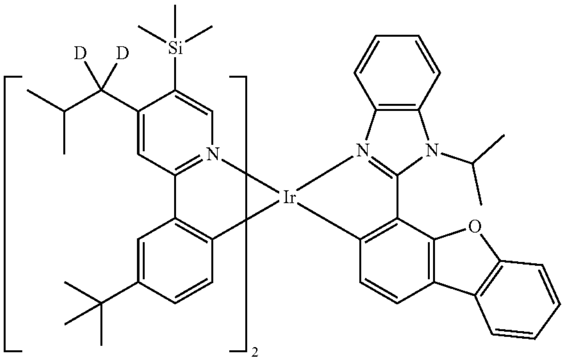
578
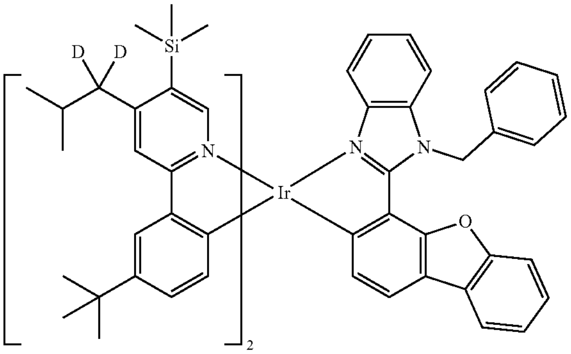
579
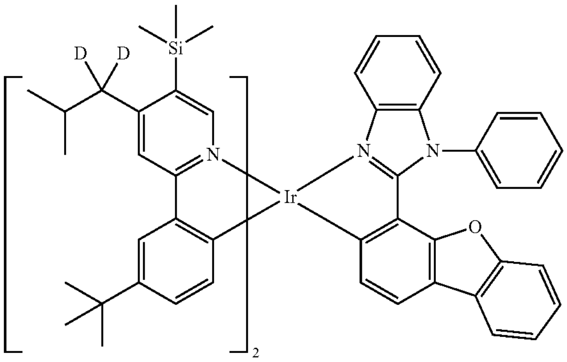
-continued
580
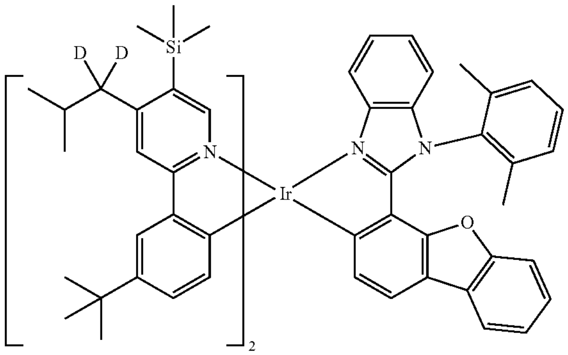
581
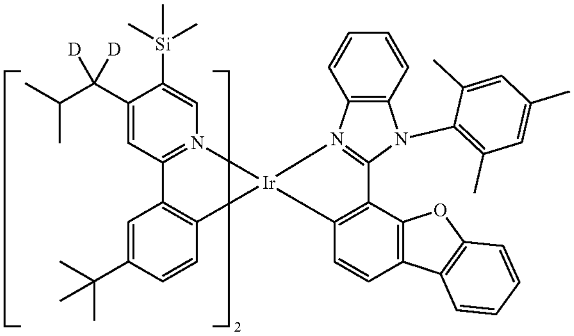
582
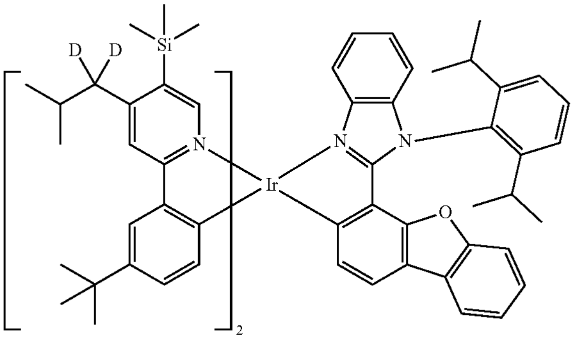
583
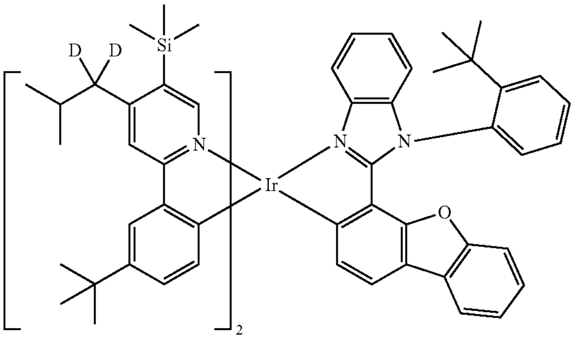

-continued
584
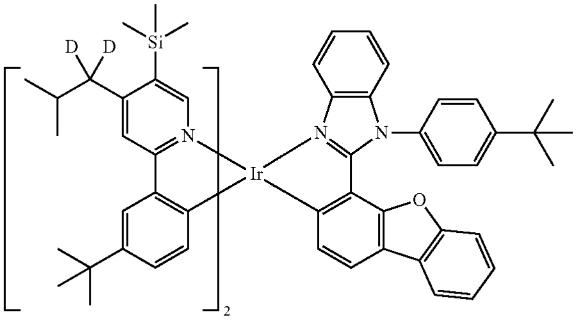
585
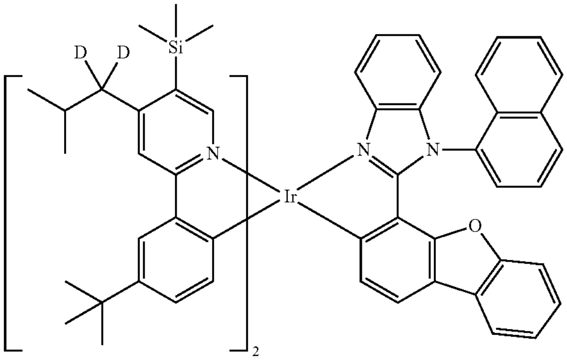
586
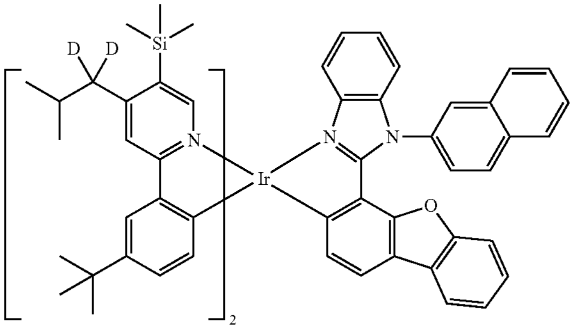
587
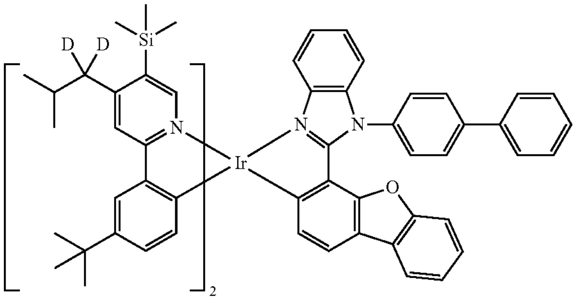
-continued
588
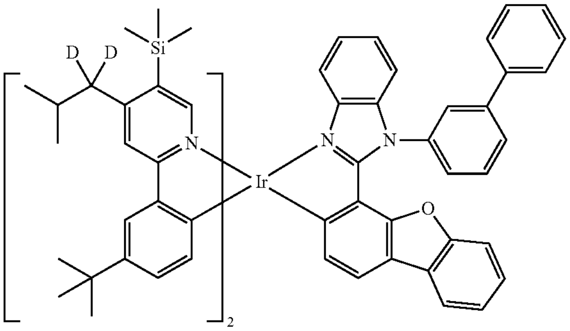
589
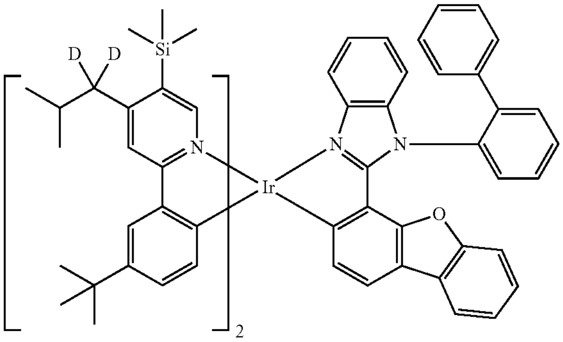
590
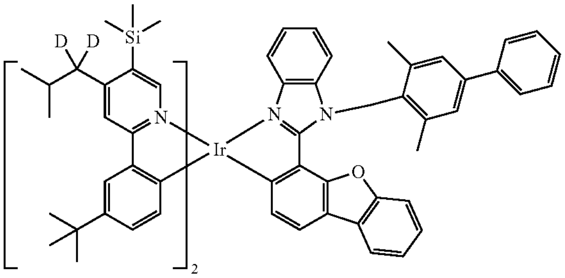
591
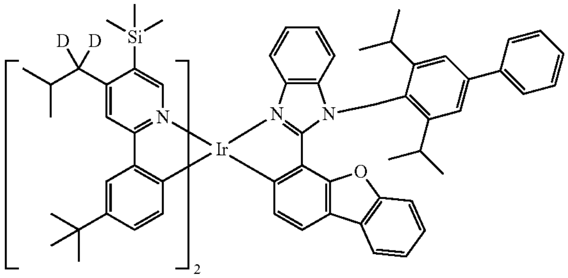

-continued
592
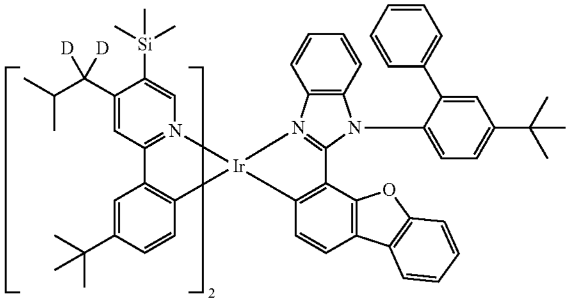
593
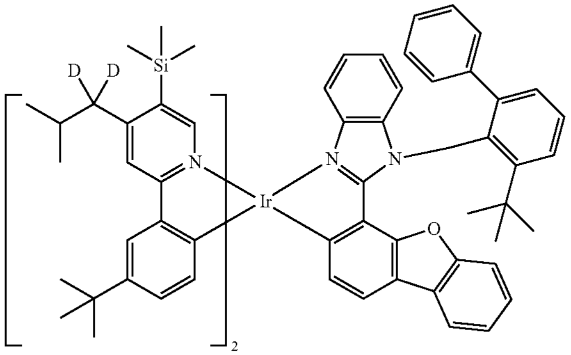
594
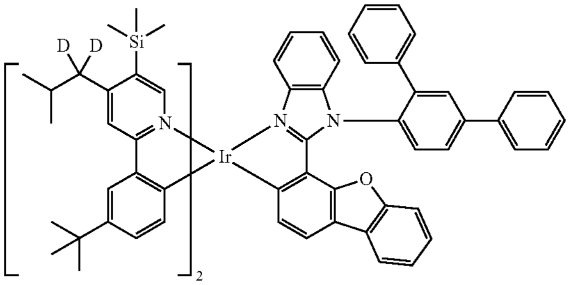
595
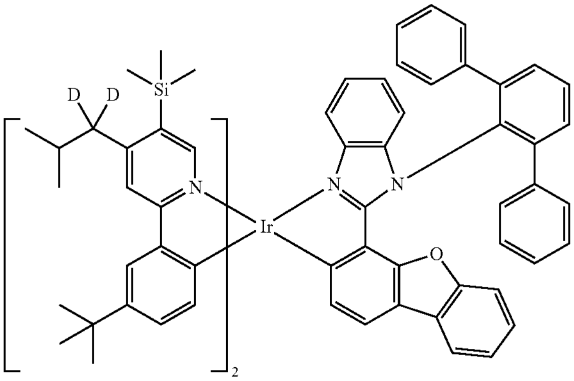
-continued
596
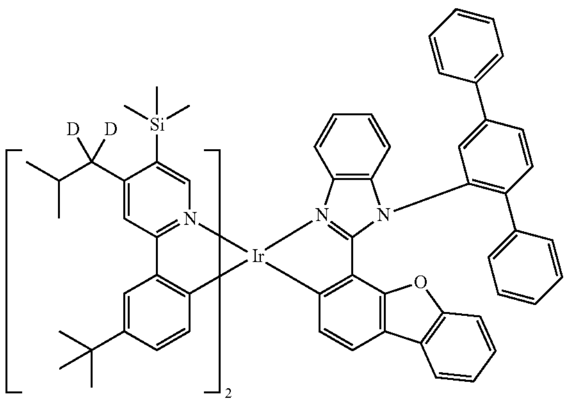
597
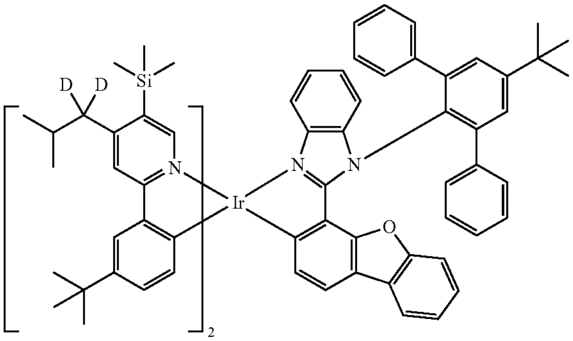
598
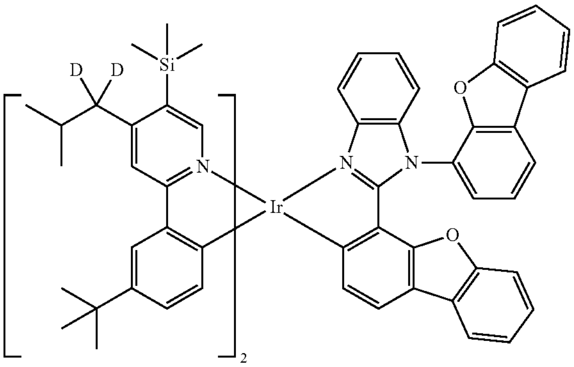
599
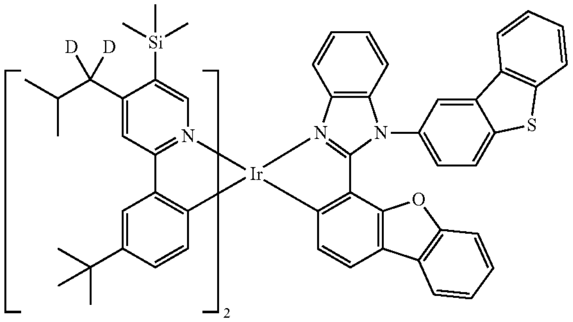

-continued
600
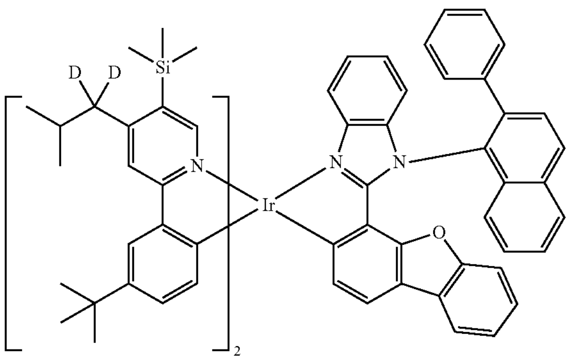
601
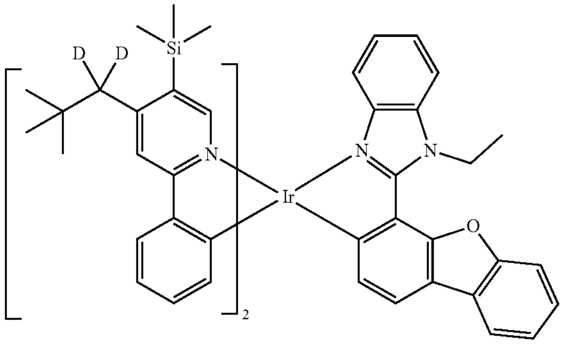
602
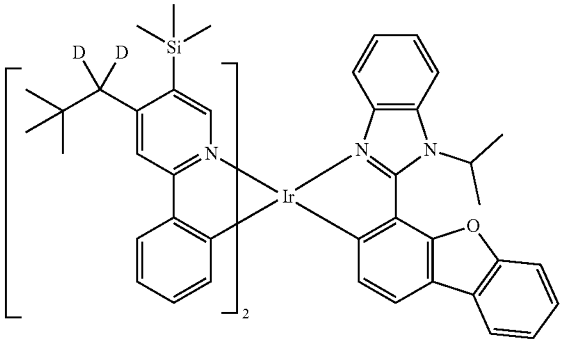
603
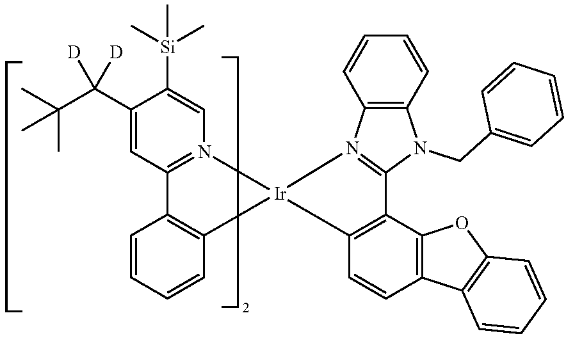
-continued
604
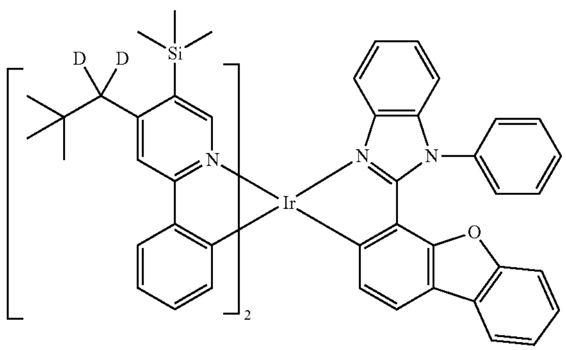
605
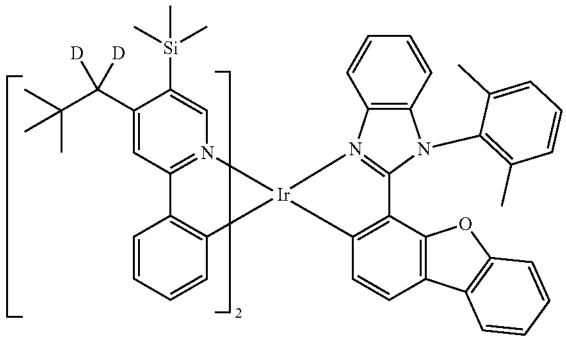
606
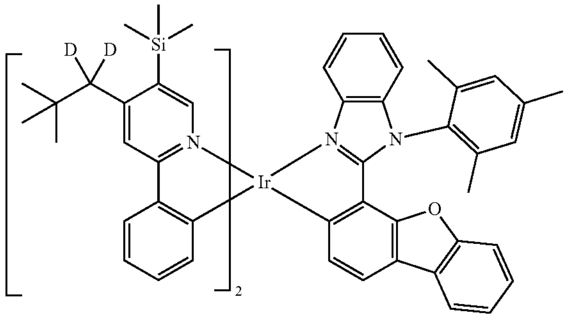
607
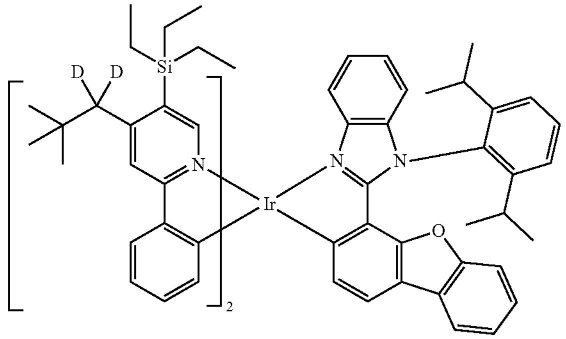

-continued
608
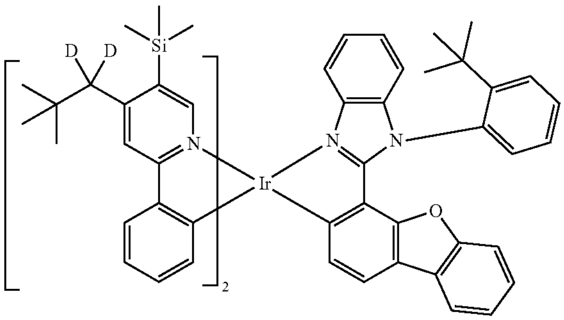
609
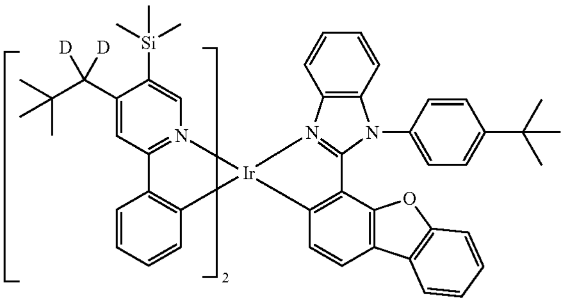
610
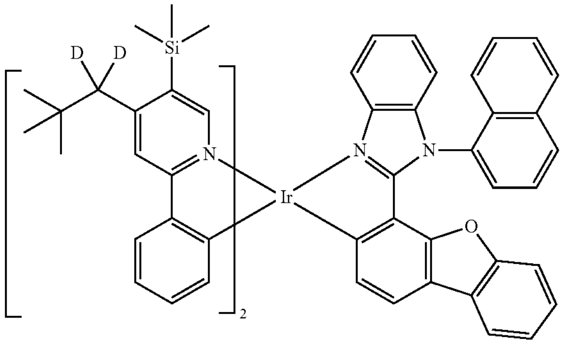
611
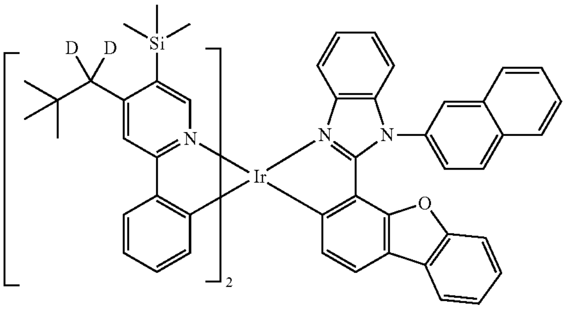
-continued
612
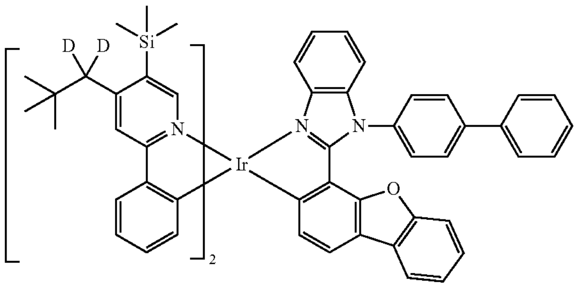
613
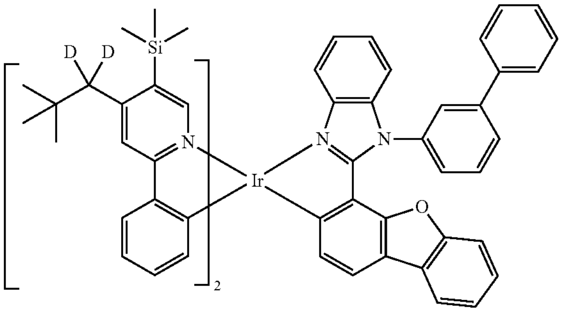
614
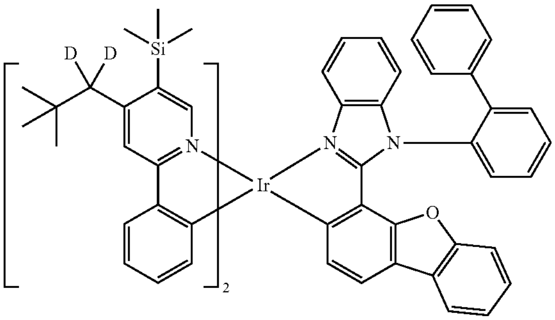
615
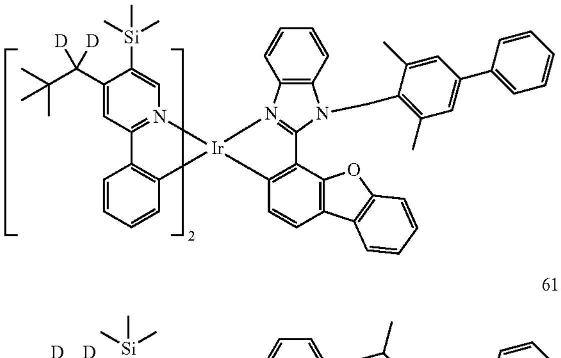
616
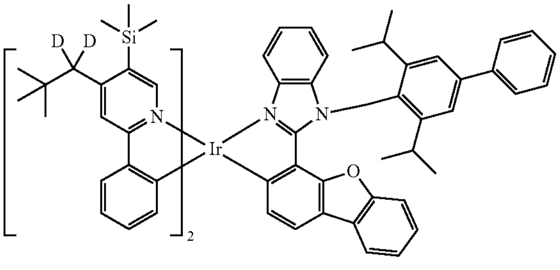

-continued
617
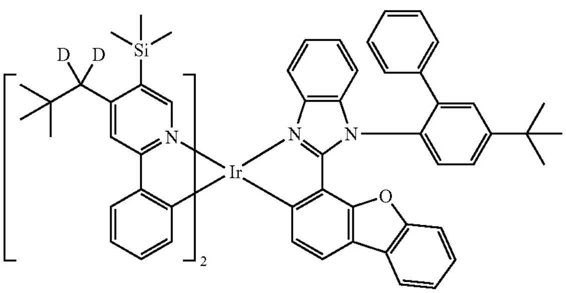
618
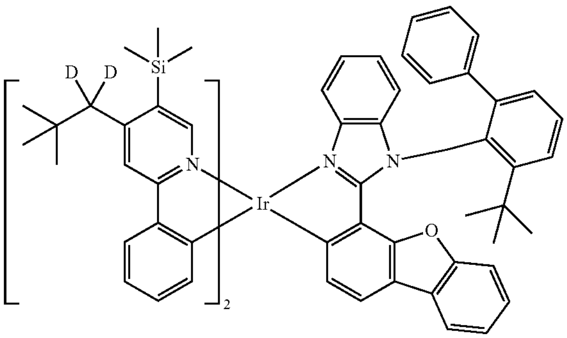
619
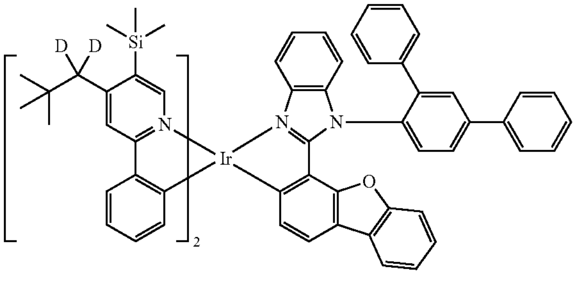
620
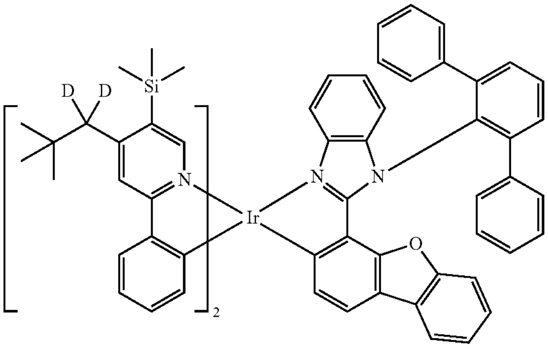
-continued
621
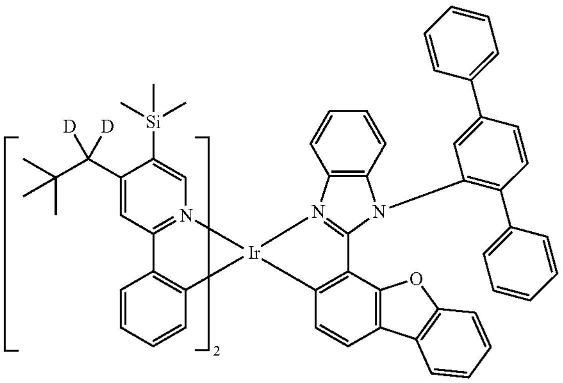
622
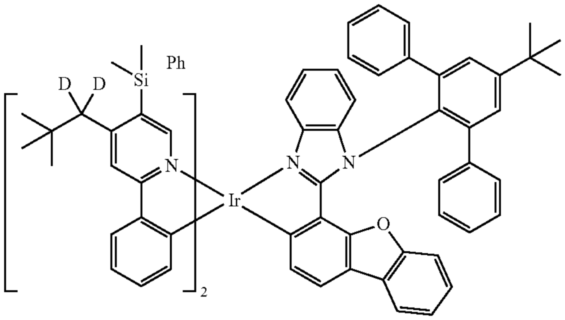
623
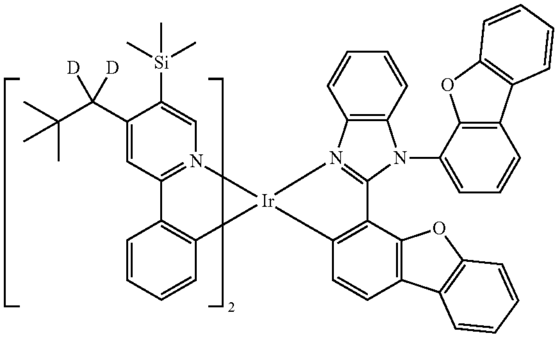
624
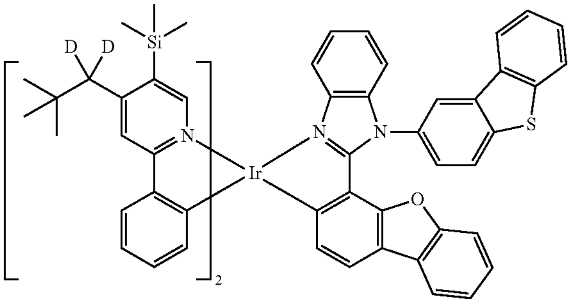

-continued
625
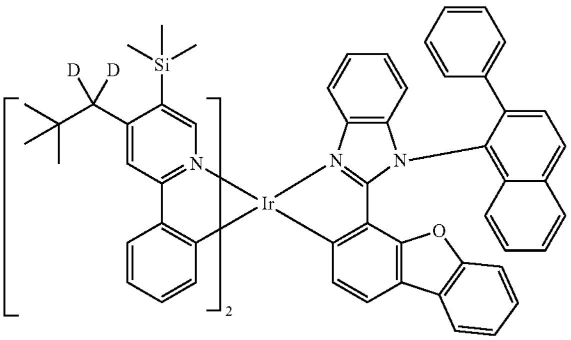
626
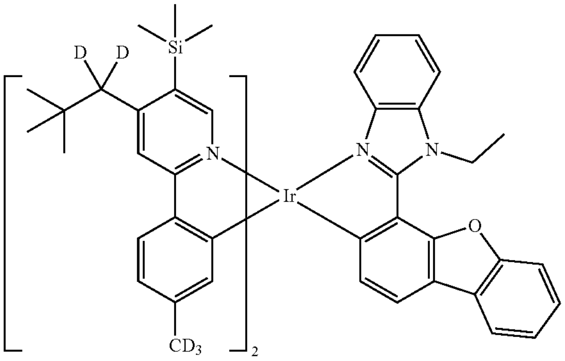
627
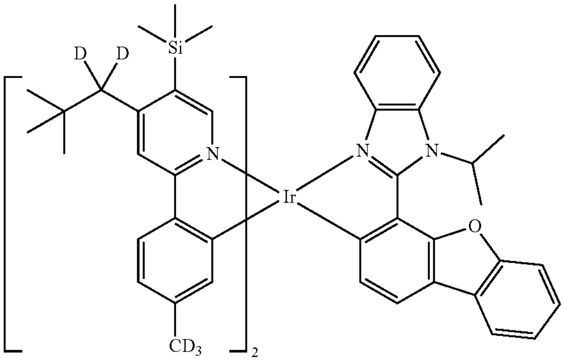
628
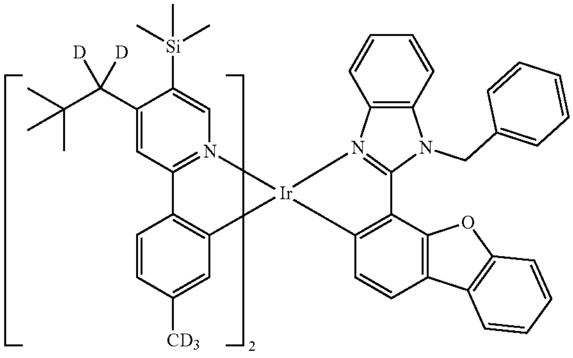
-continued
629
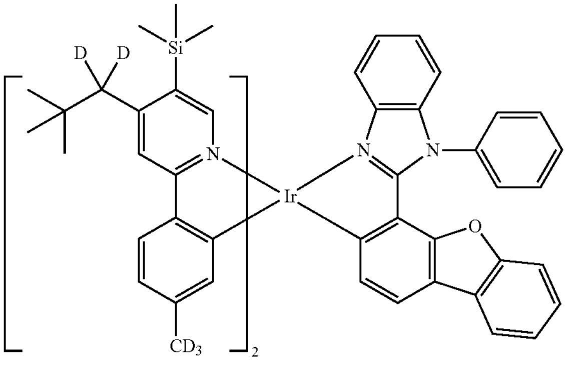
630
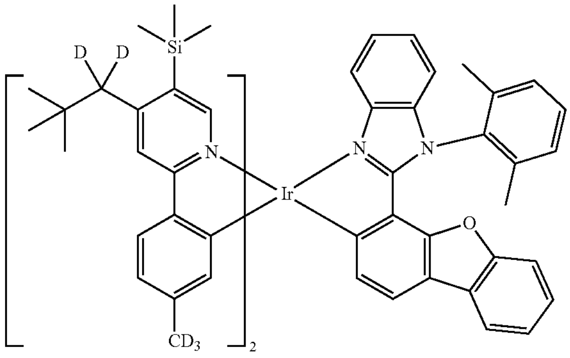
631
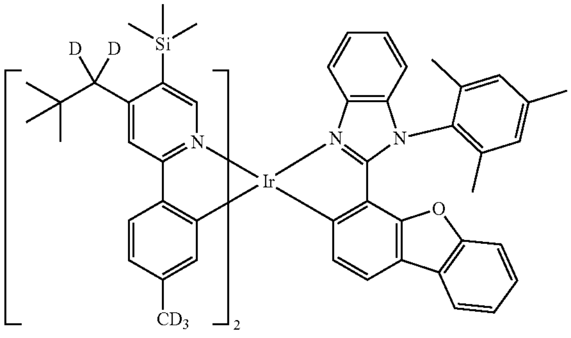
632
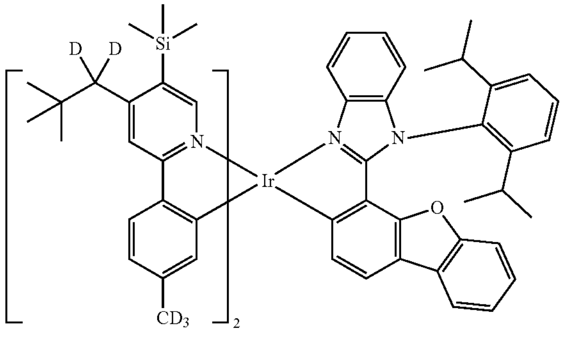

-continued
633
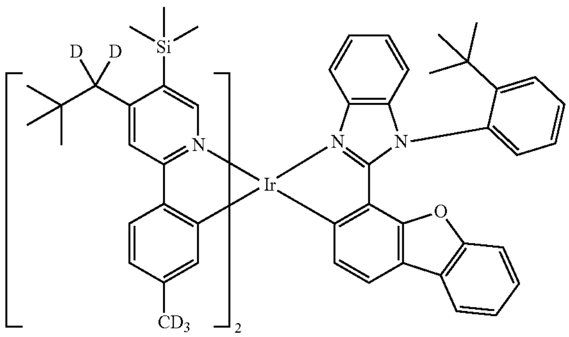
634
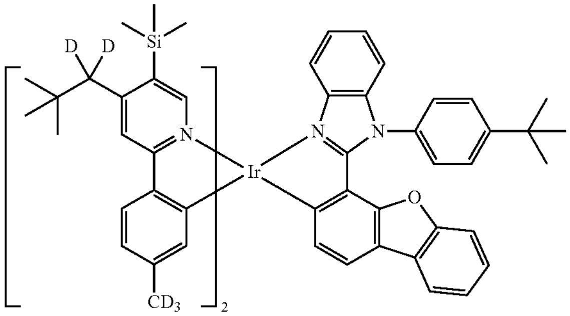
635
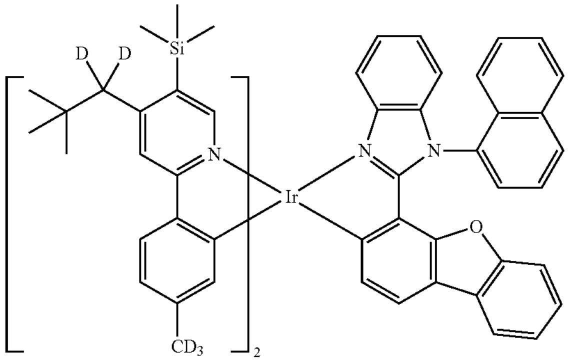
636
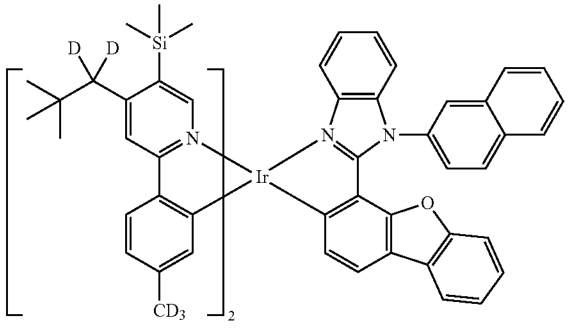
-continued
637
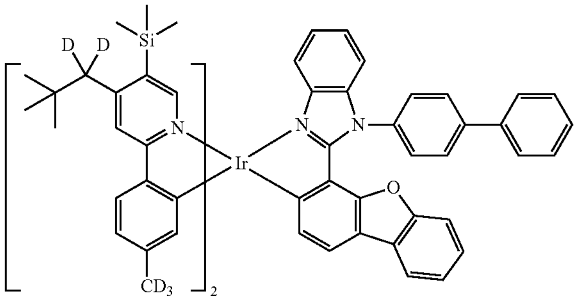
638
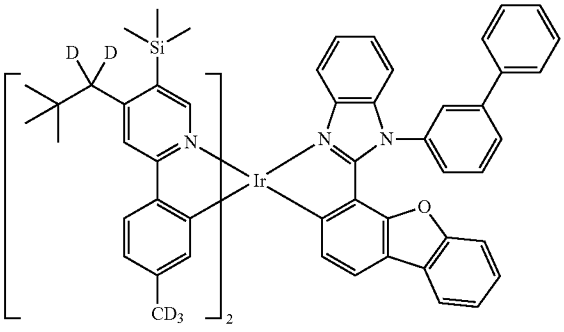
639
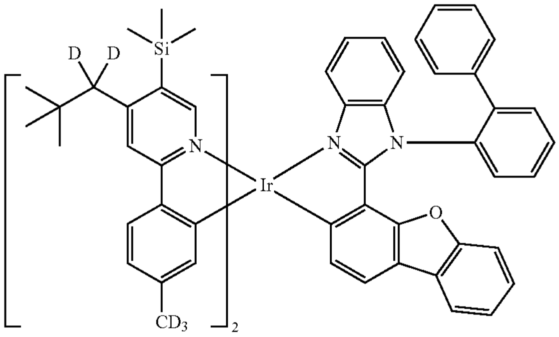
640
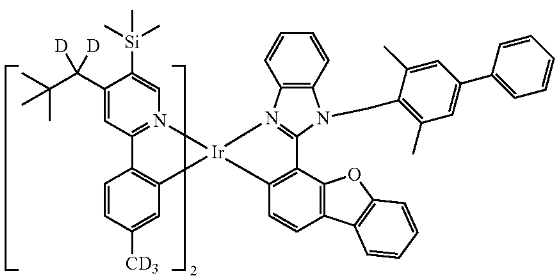
641
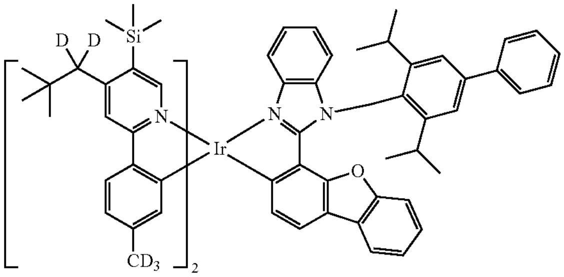

-continued
642
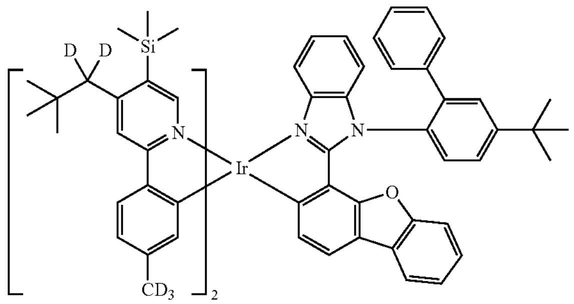
643
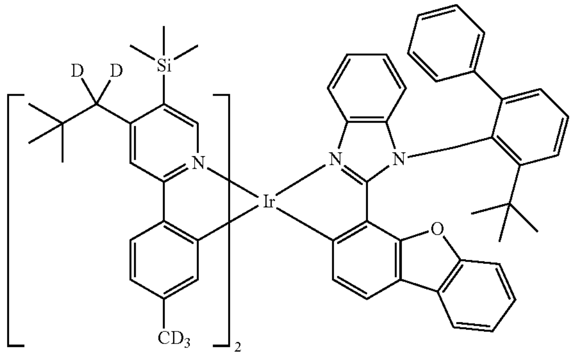
644
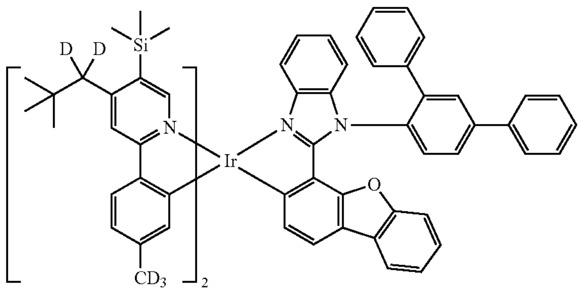
645
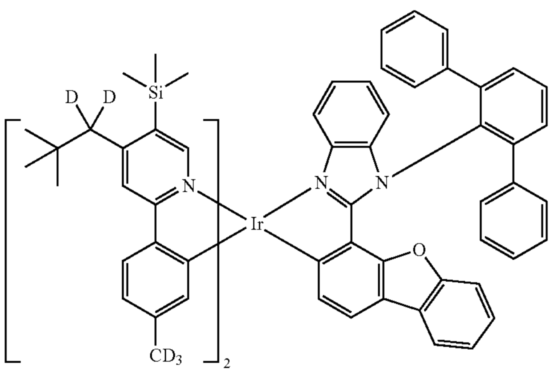
-continued
646
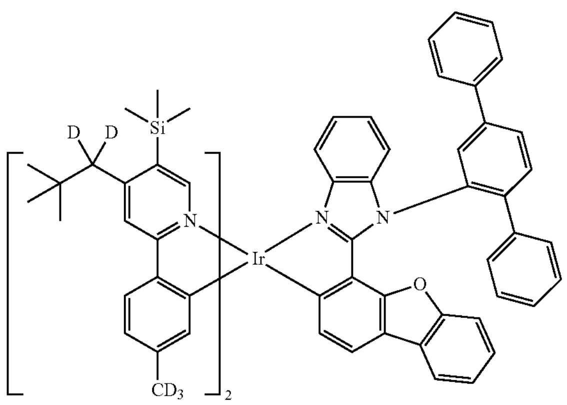
647
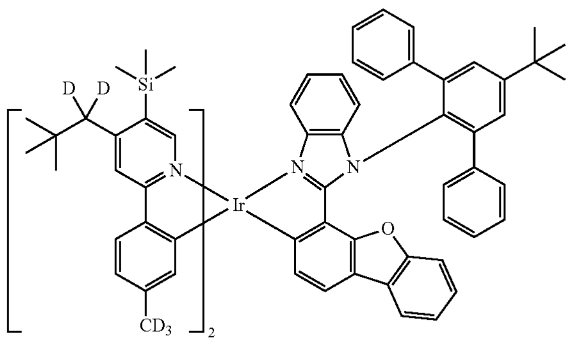
648
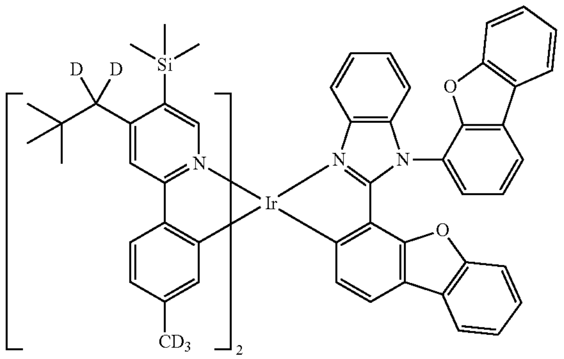
649
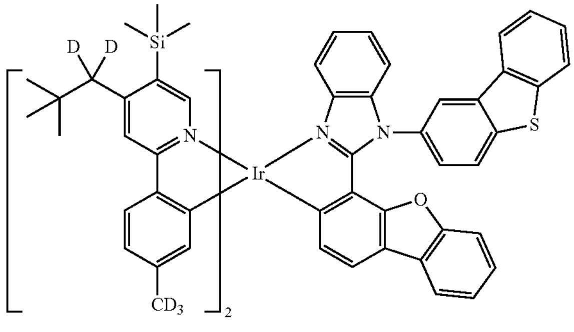

-continued
650
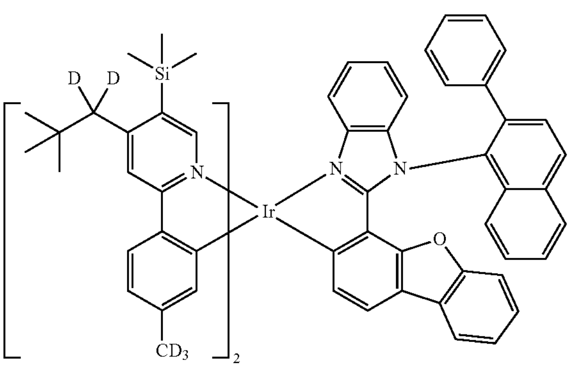
651
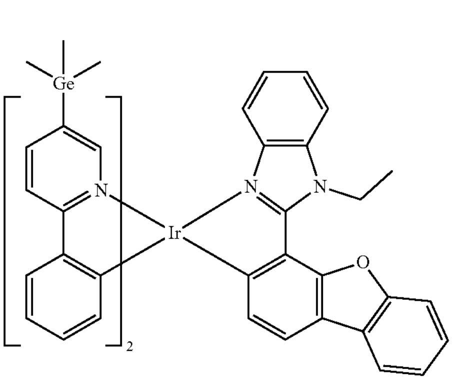
652
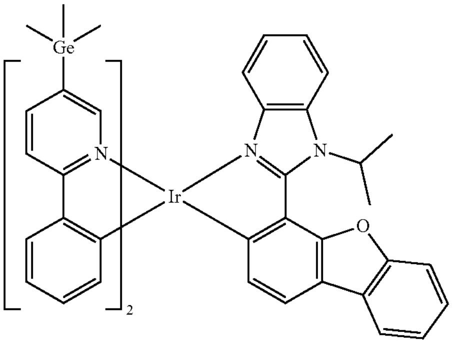
653
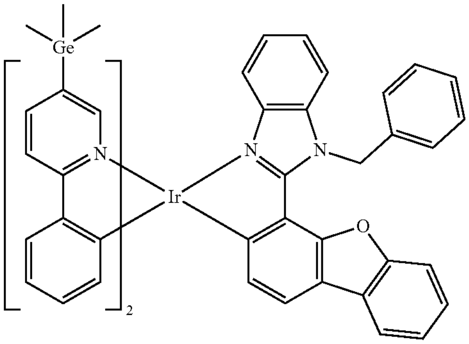
-continued
654
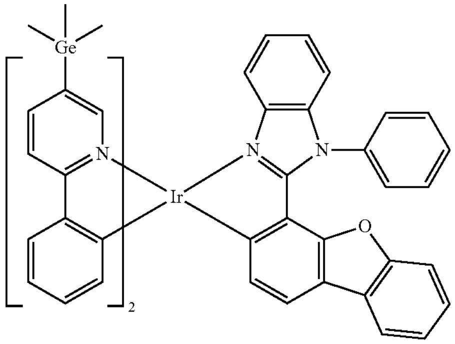
655
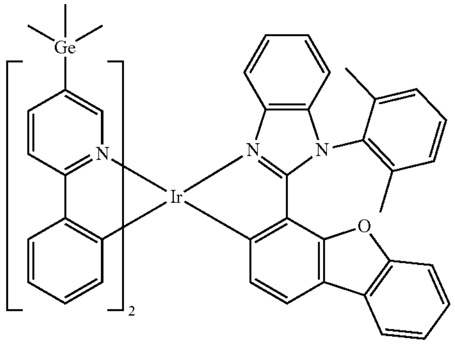
656
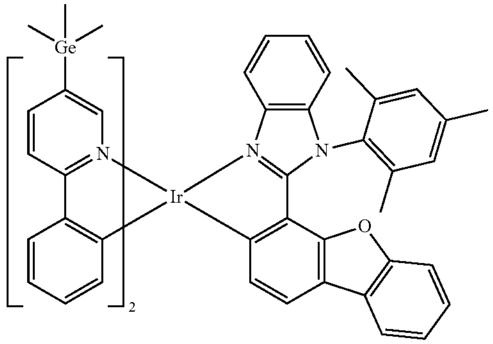
657
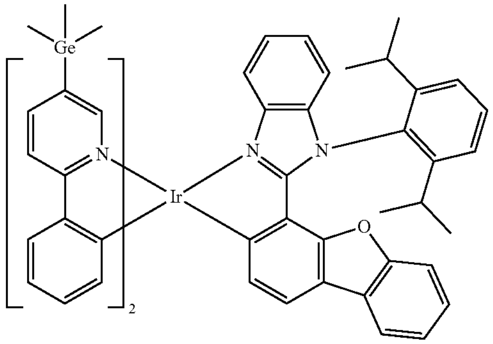

658
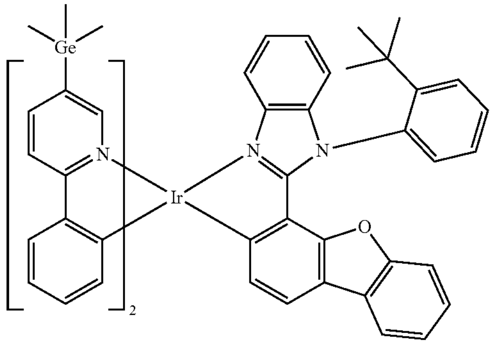
659
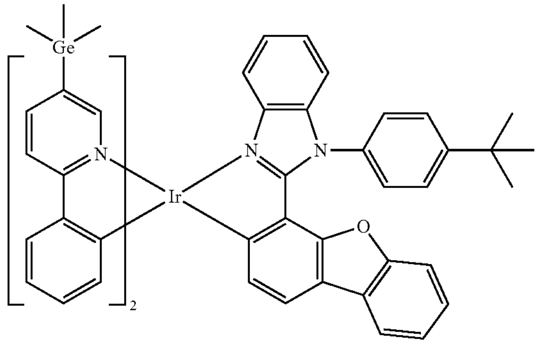
660
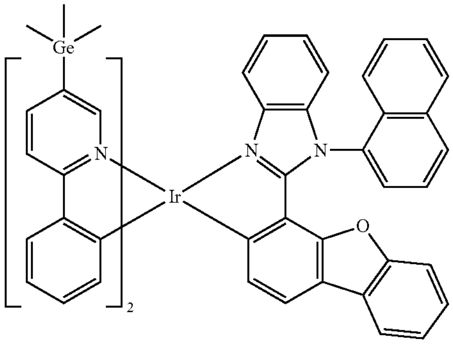
661
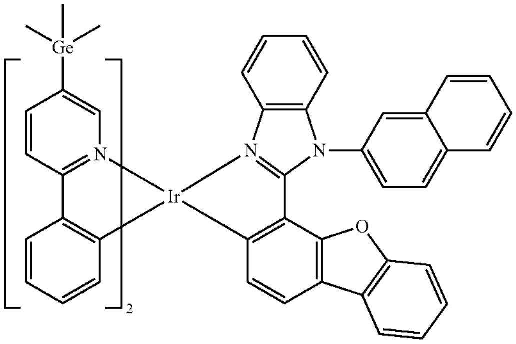
662
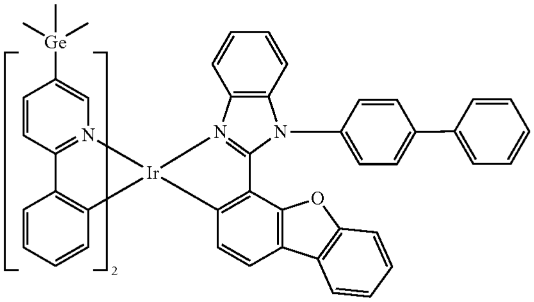
663
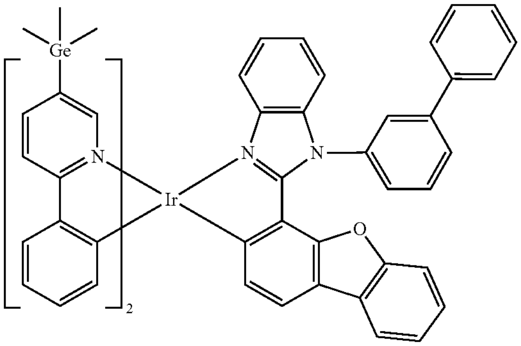
664
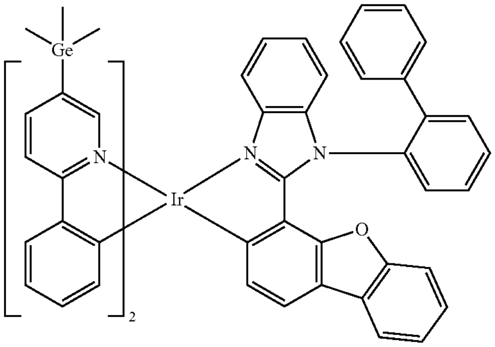
665
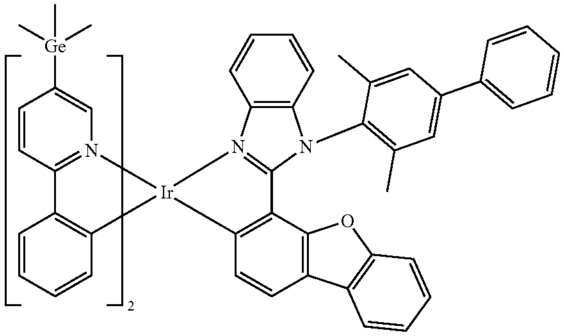

-continued
666
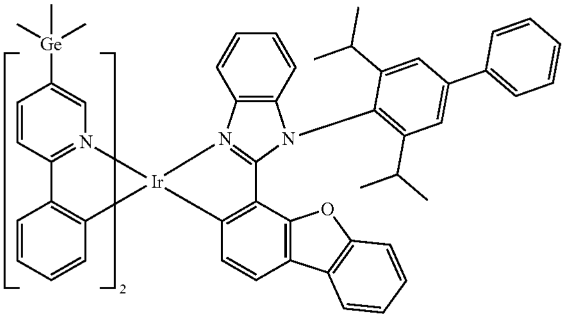
667
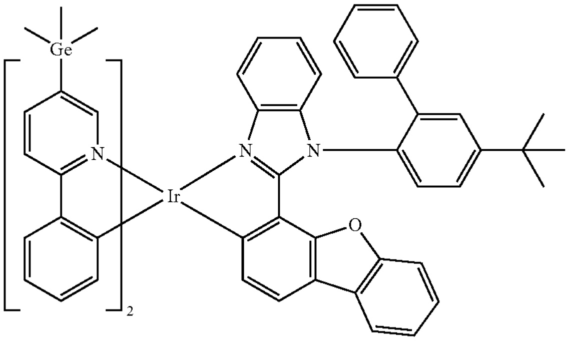
668
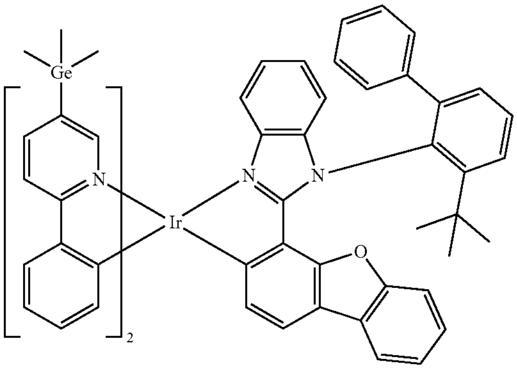
669
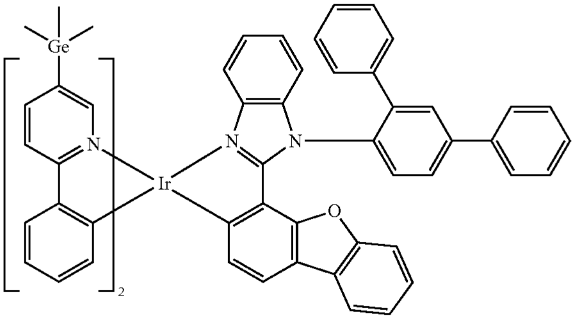
-continued
670
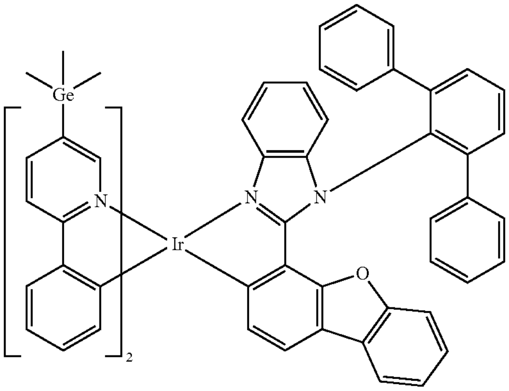
671
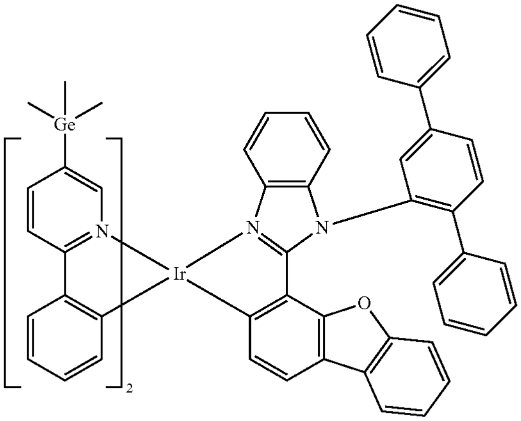
672
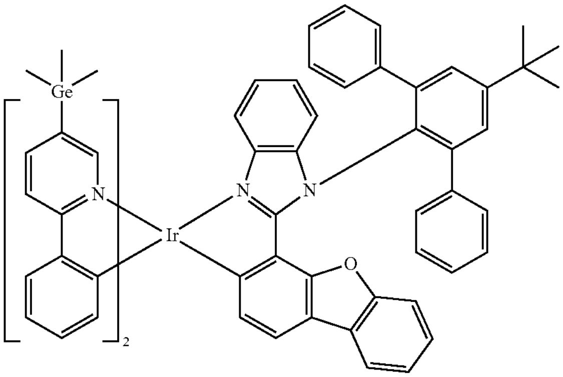
673
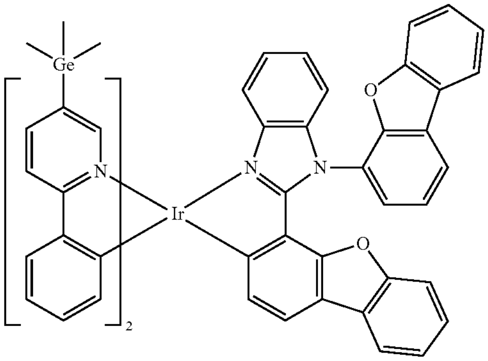

674
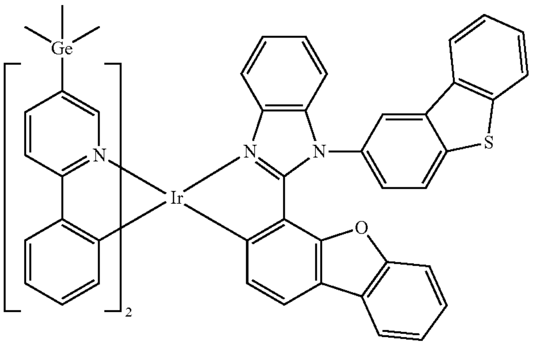
675
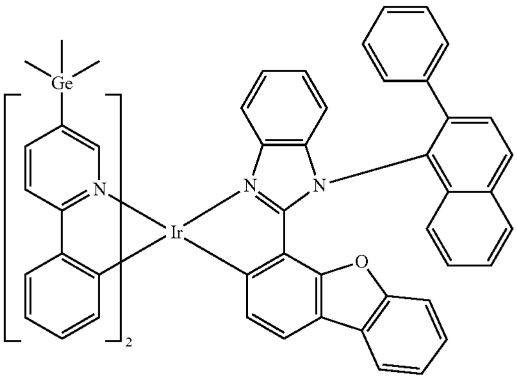
676
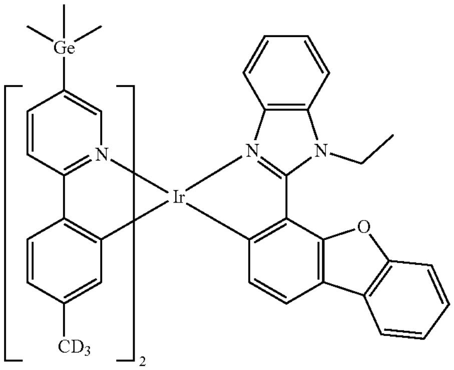
677
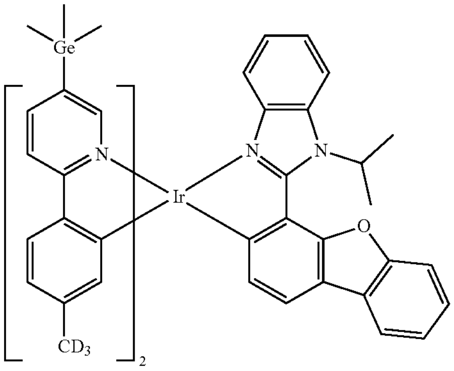
678
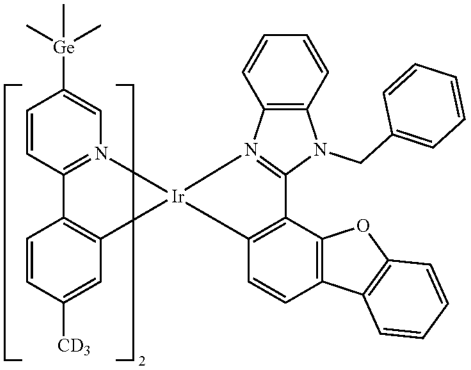
679
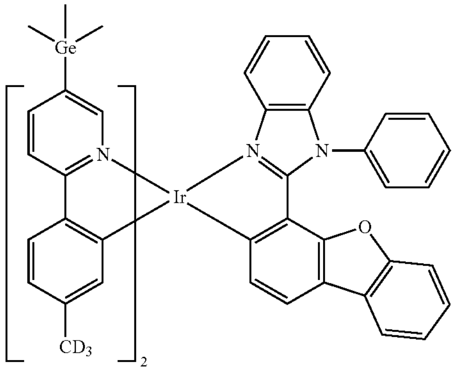
680
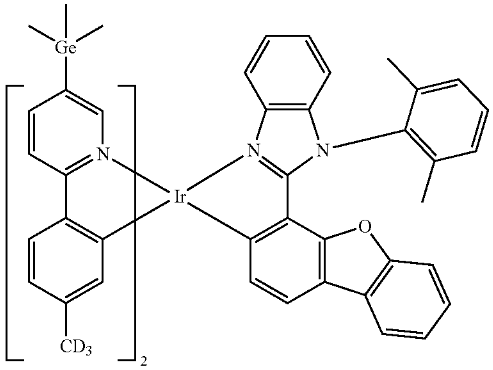
681
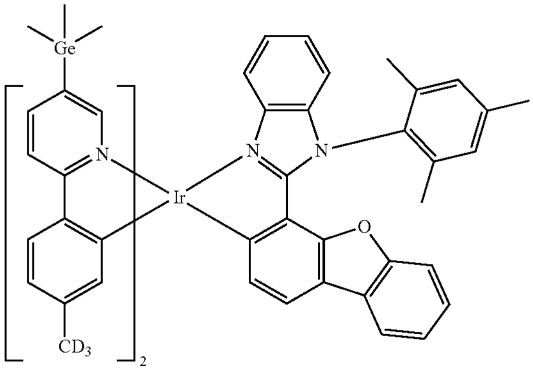

-continued
682
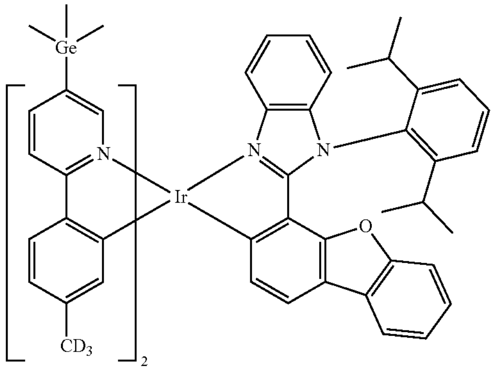
683
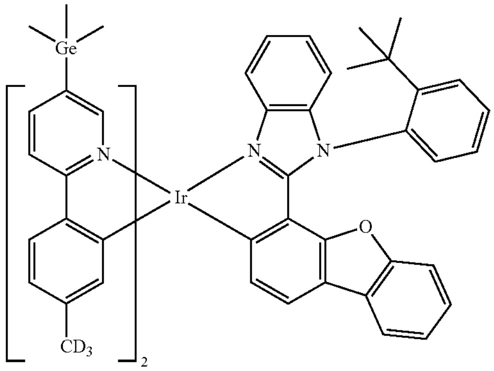
684
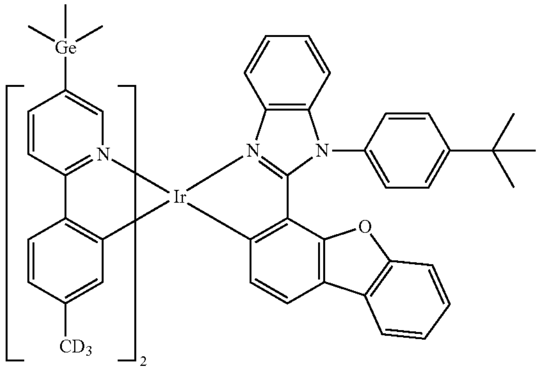
685
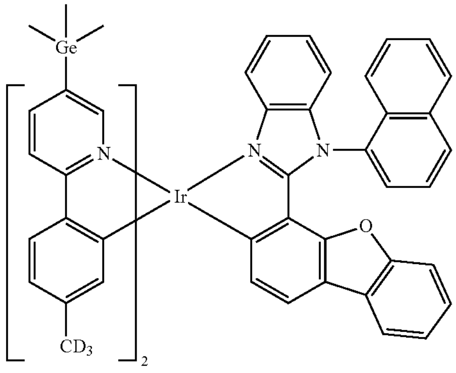
-continued
686
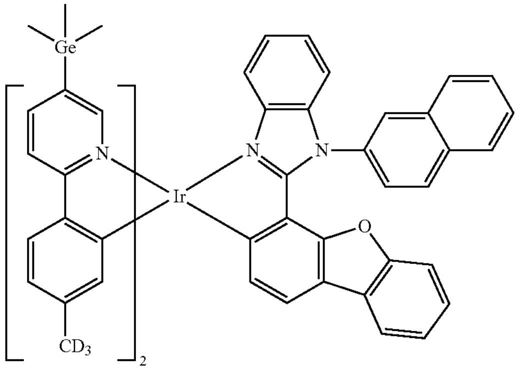
687
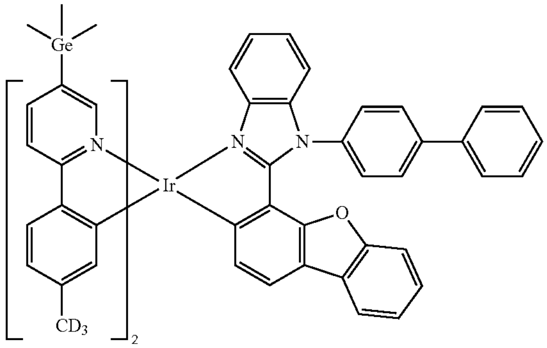
688
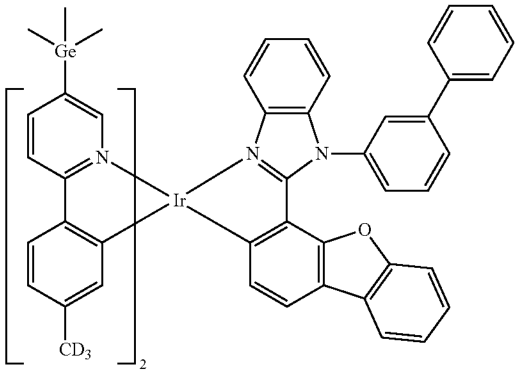
689
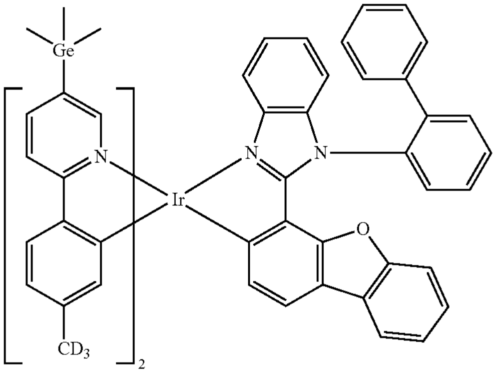

-continued
690
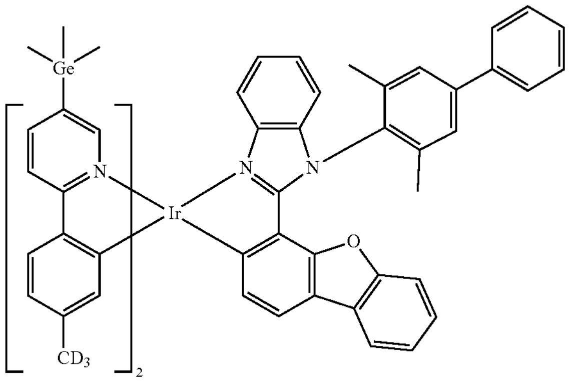
691
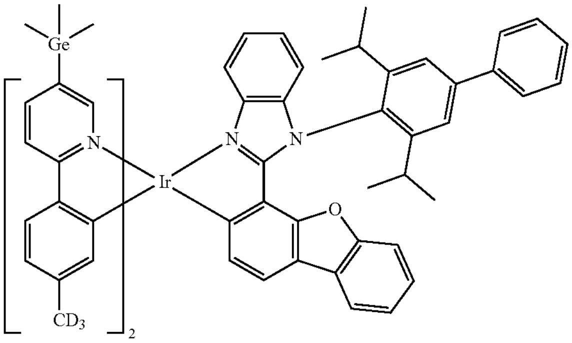
692
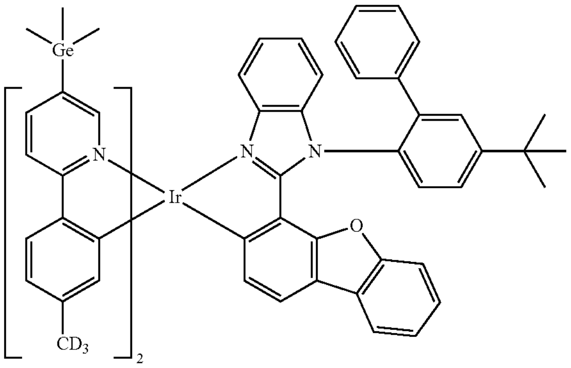
693
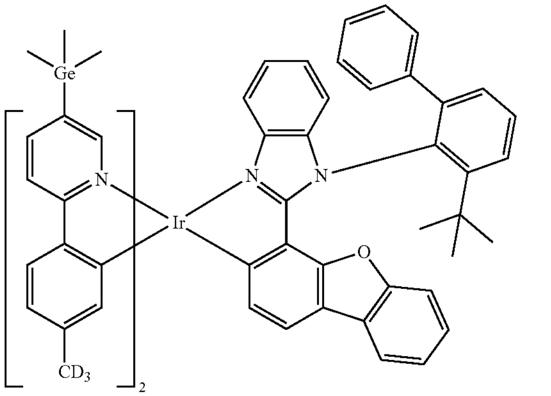
-continued
694
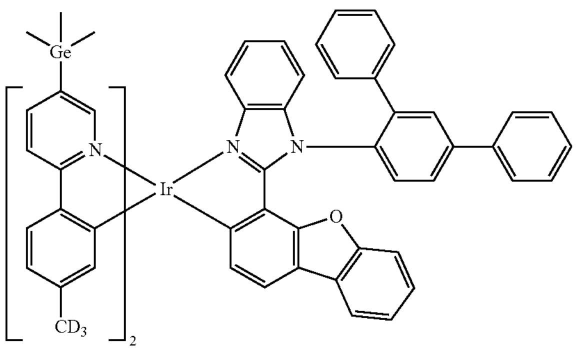
695
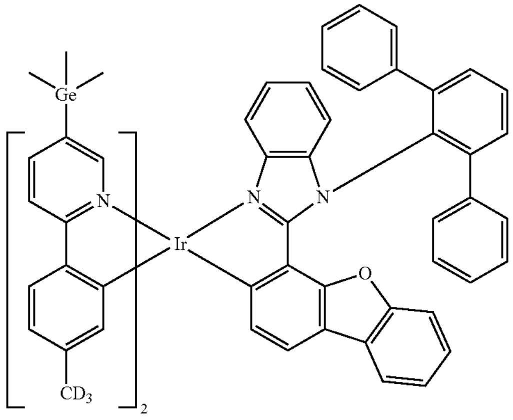
696
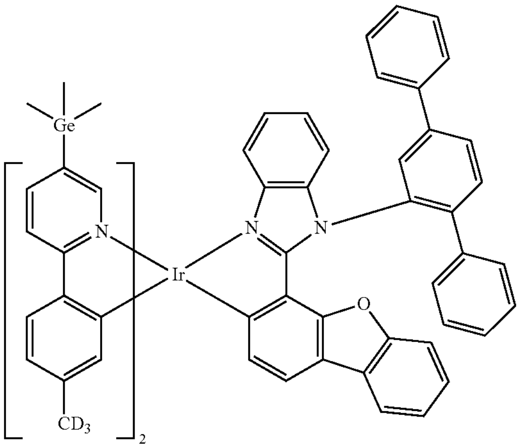

-continued
697
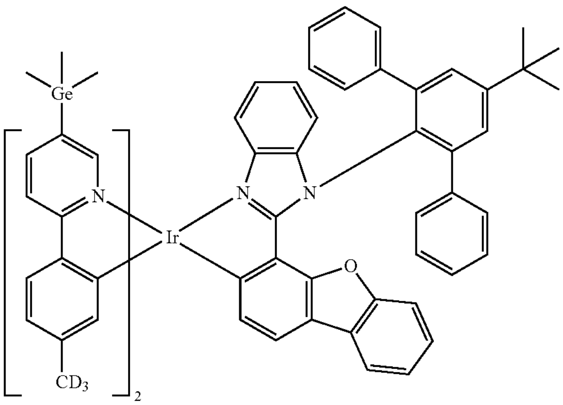
698
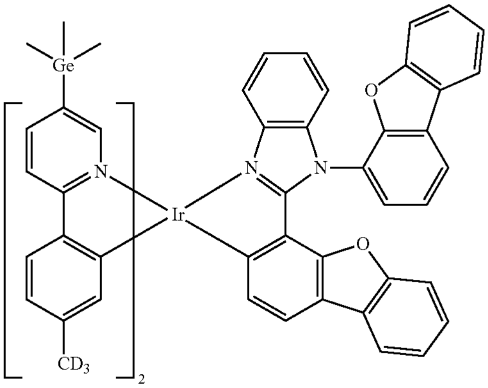
699
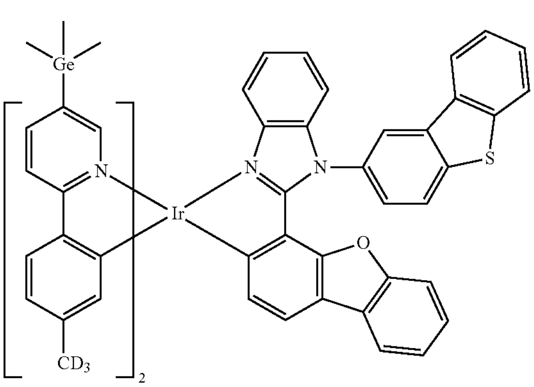
700
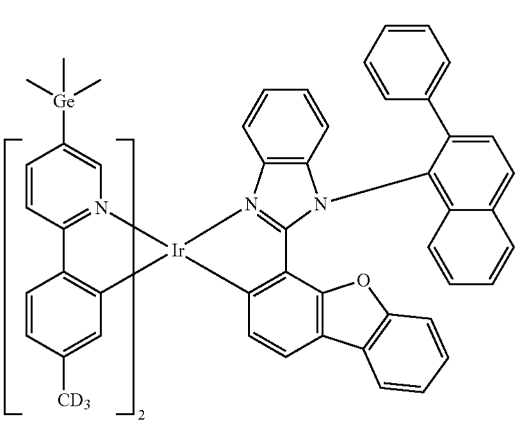
-continued
701
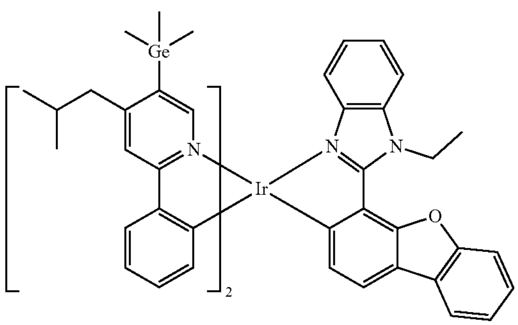
702
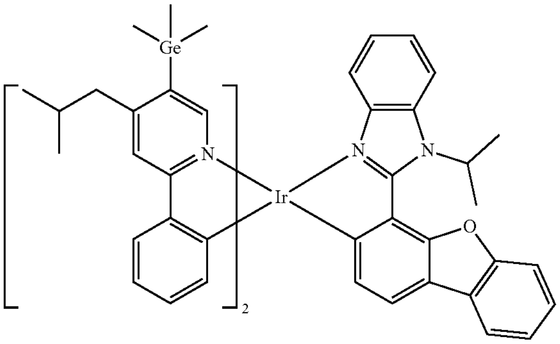
703
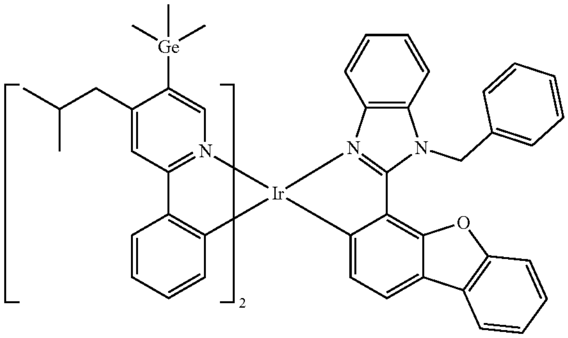
704
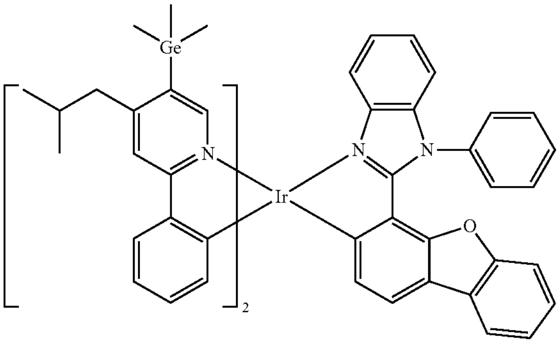

-continued
705
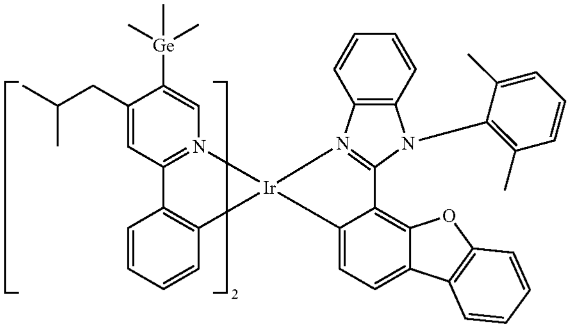
706
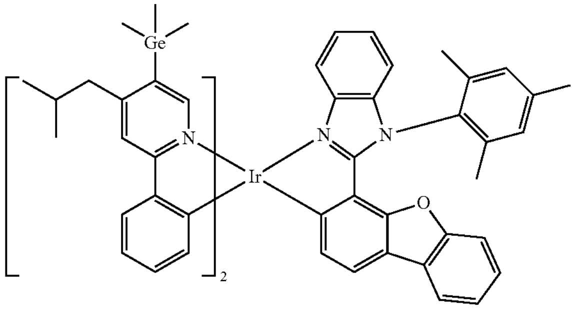
707
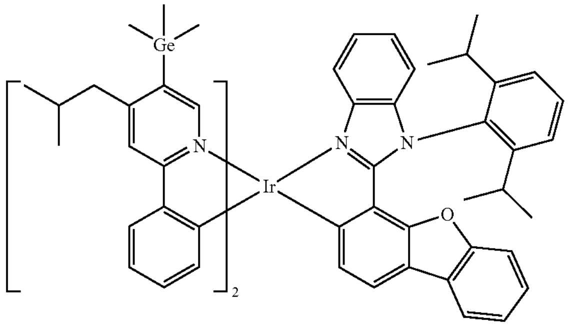
708
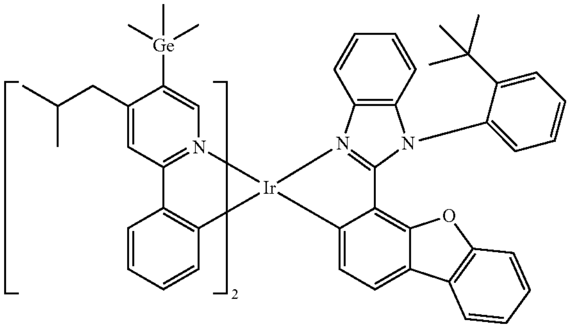
-continued
709
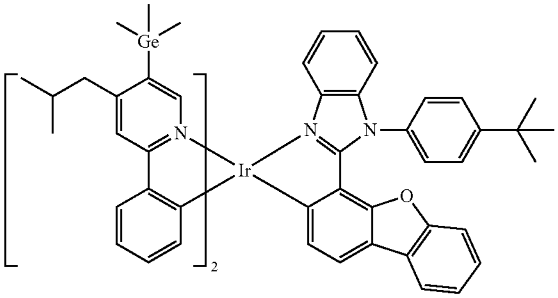
710
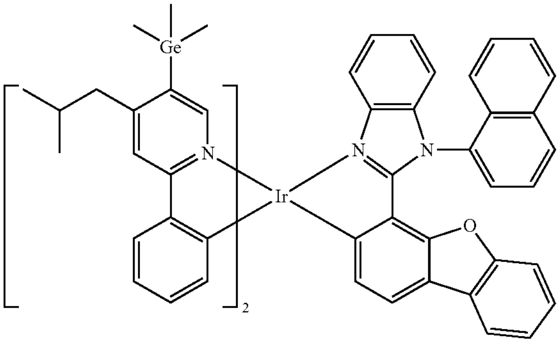
711
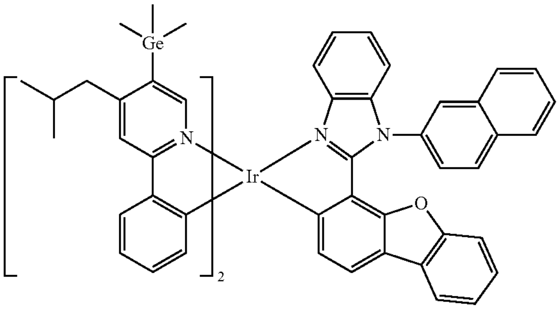
712
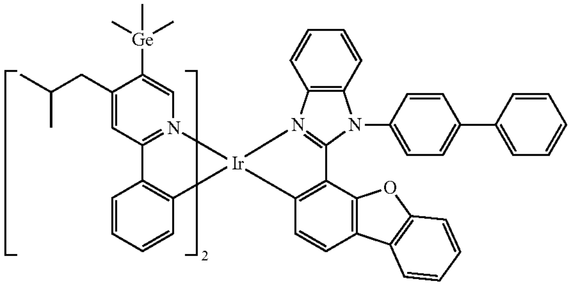
713
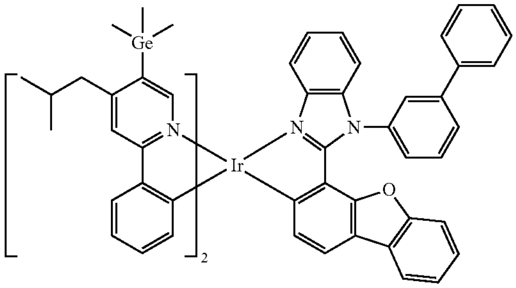

-continued
714
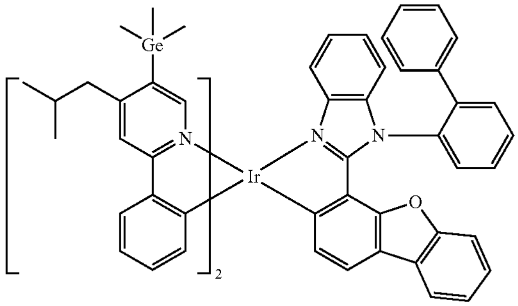
715
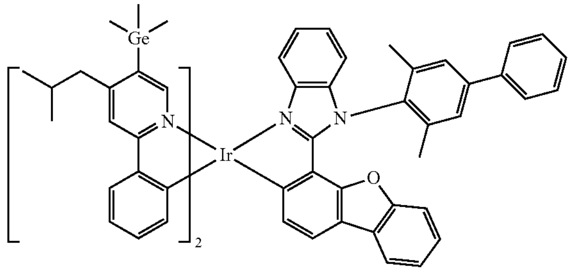
716
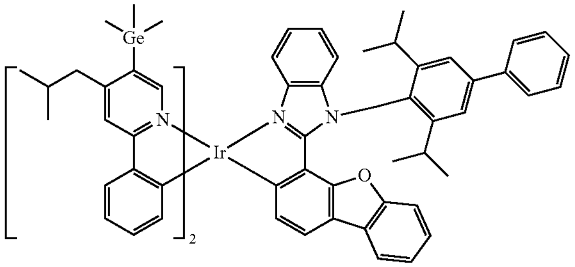
717
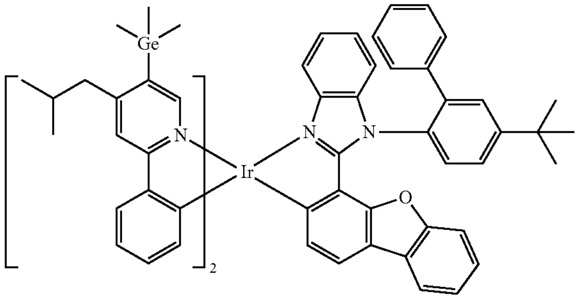
718
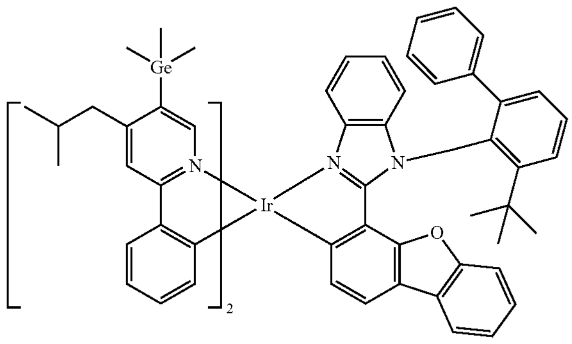
-continued
719
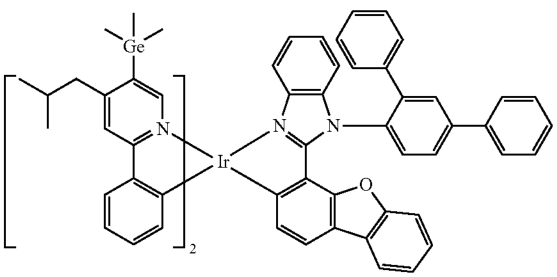
720
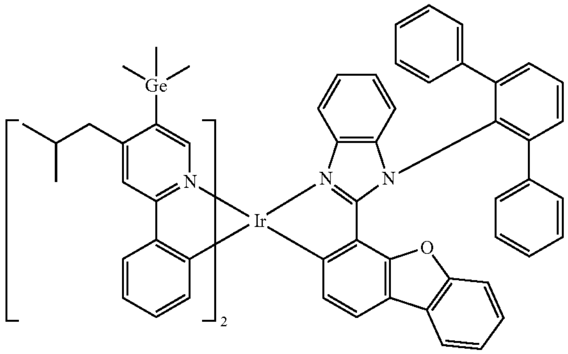
721
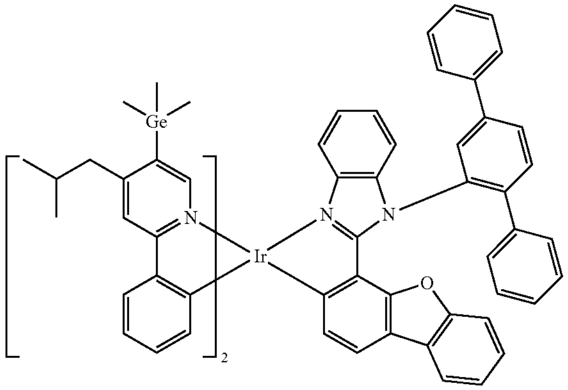
722
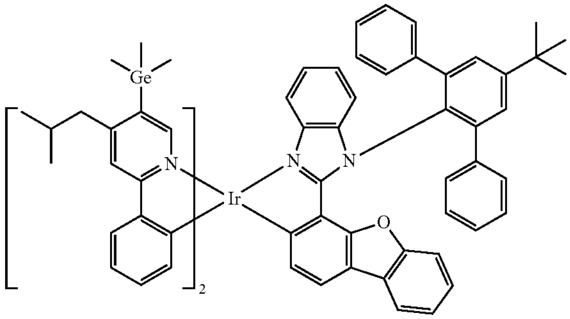

-continued
723
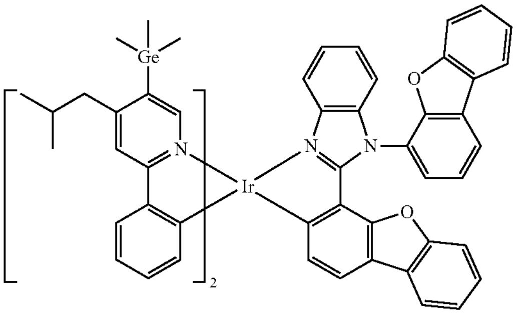
724
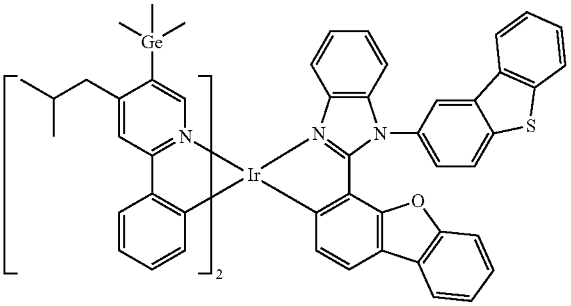
725
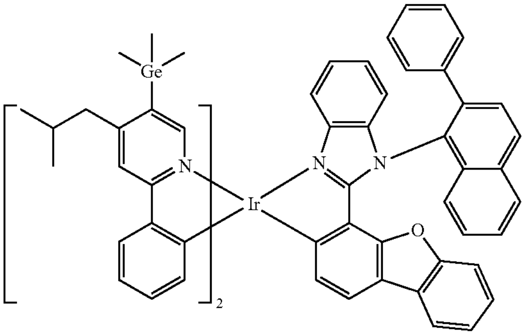
726
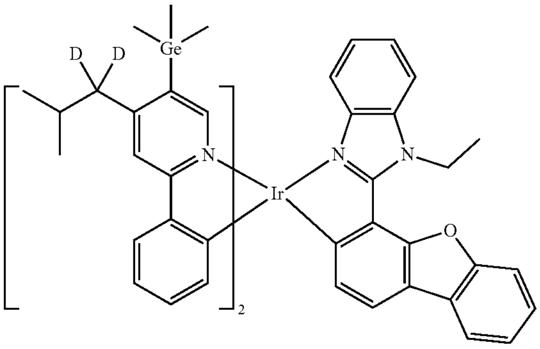
-continued
727
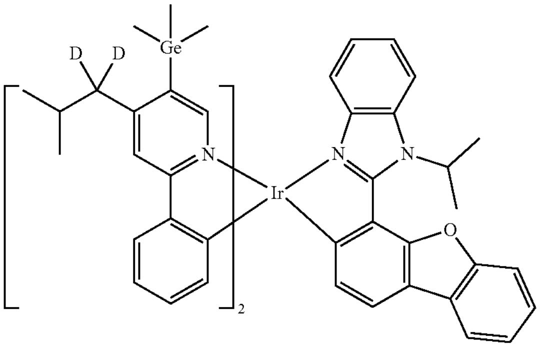
728
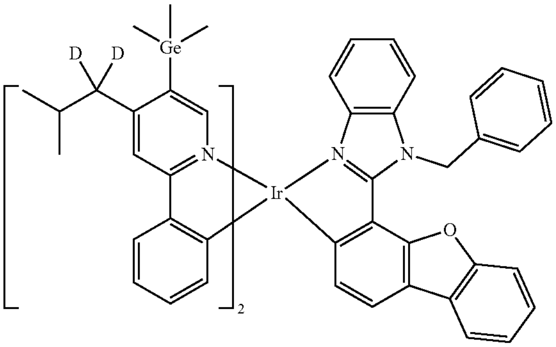
729
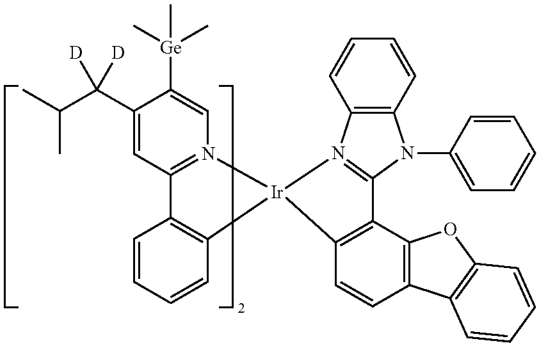
730
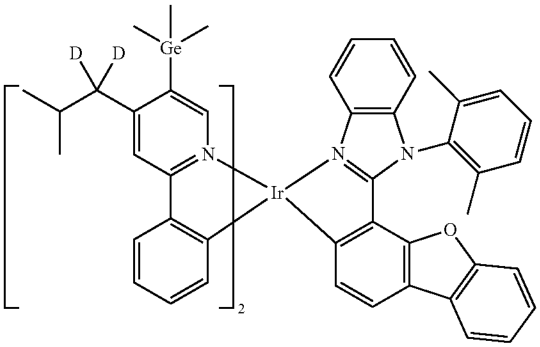

731
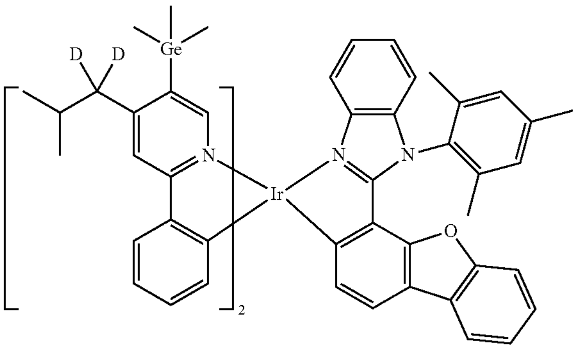
732
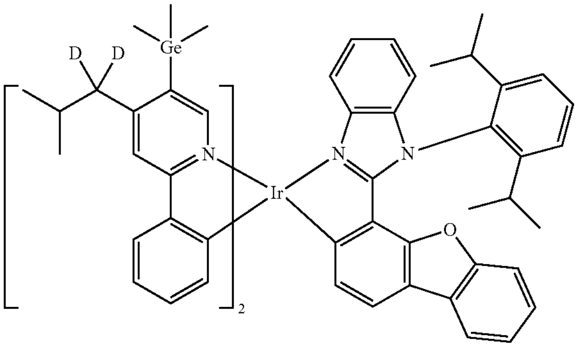
733
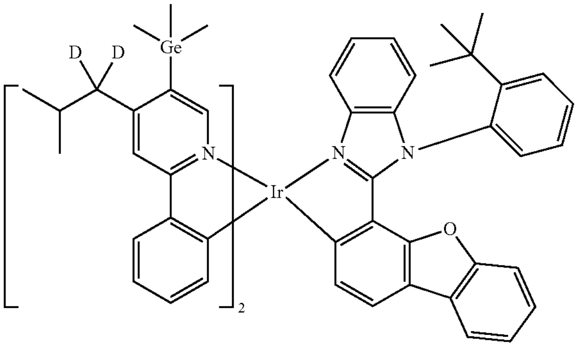
734
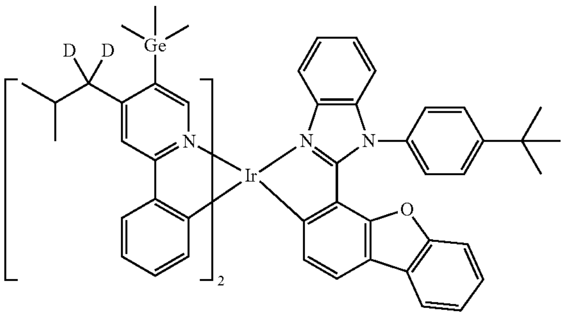
735
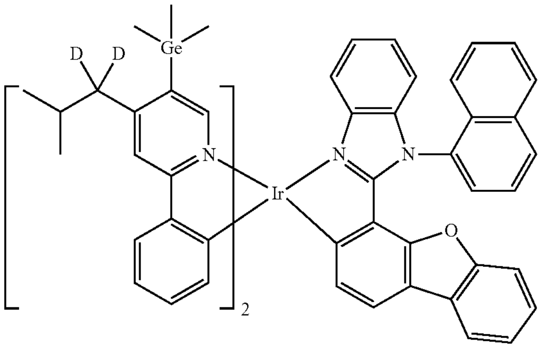
736
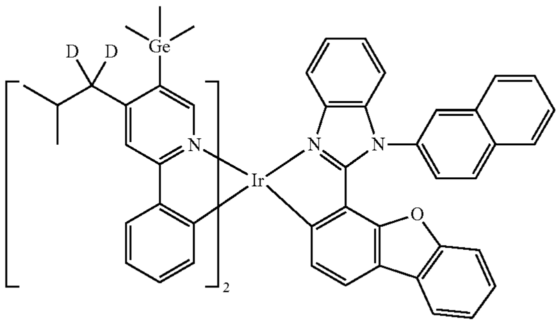
737
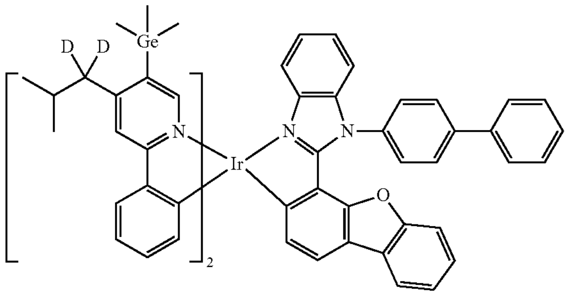
738
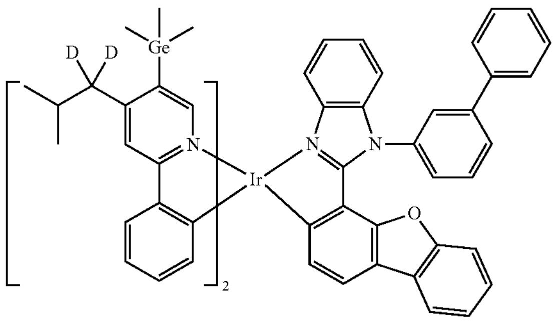

-continued
739
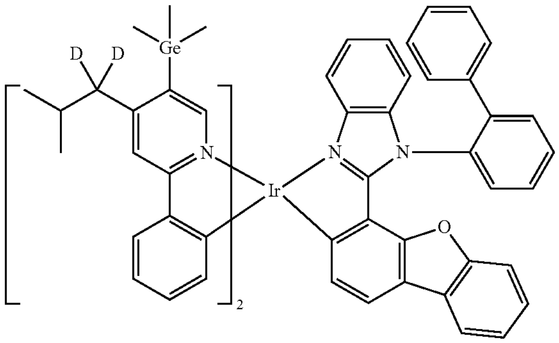
740
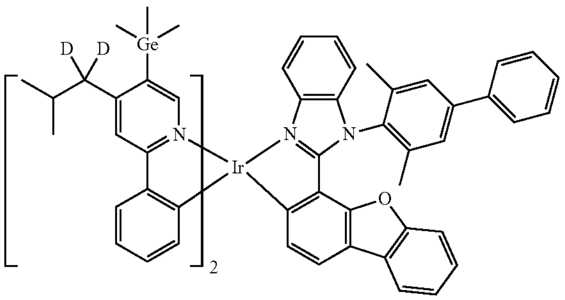
741
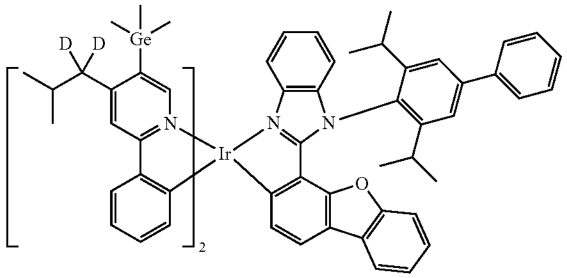
742
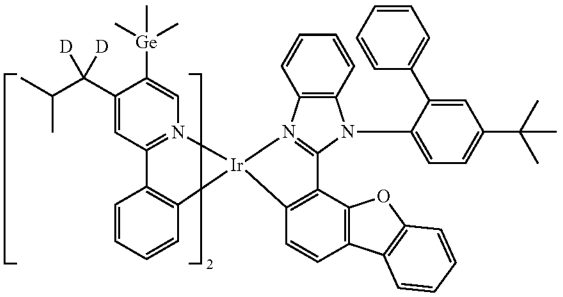
-continued
743
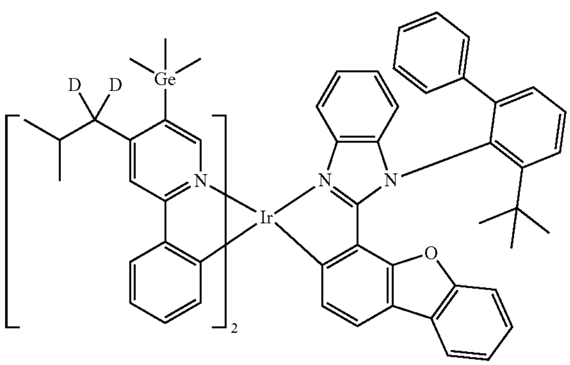
744
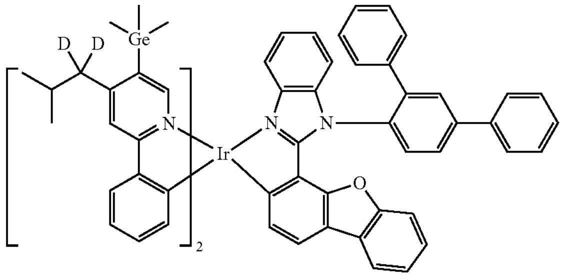
745
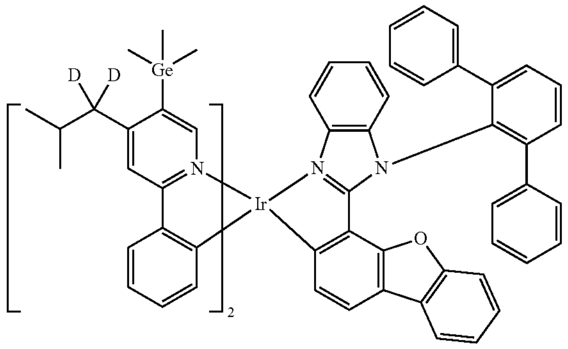
746
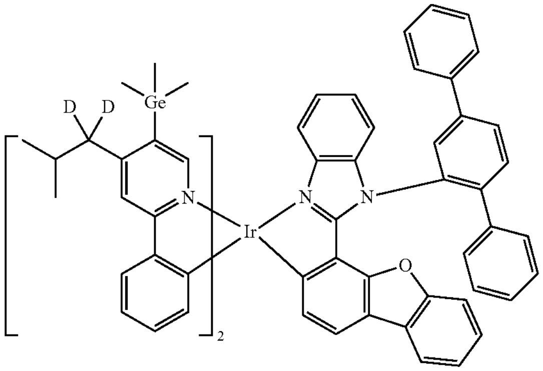

-continued
747
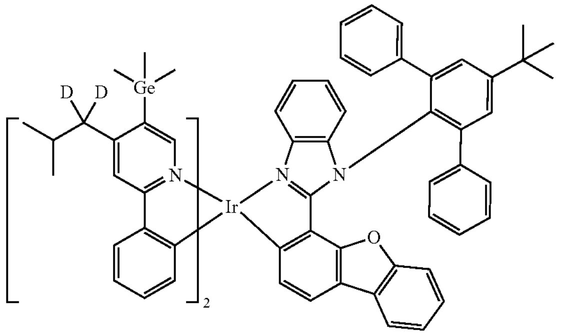
748
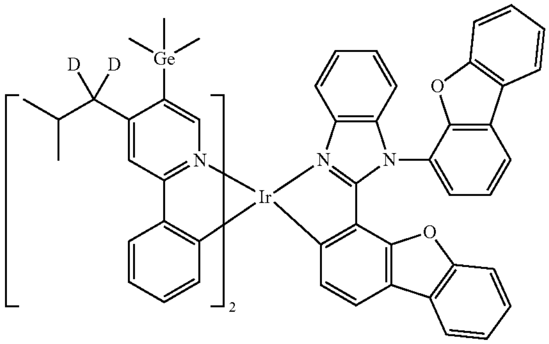
749
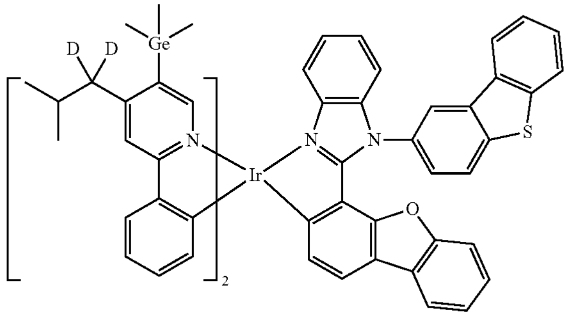
750
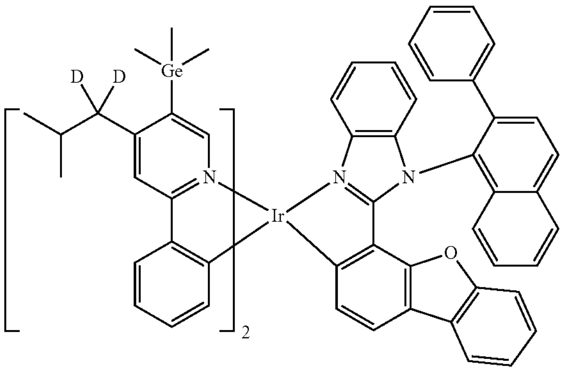
-continued
751
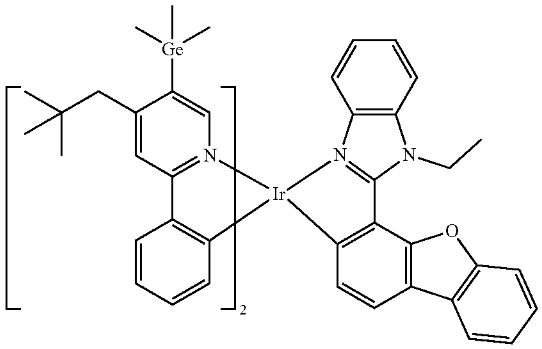
752
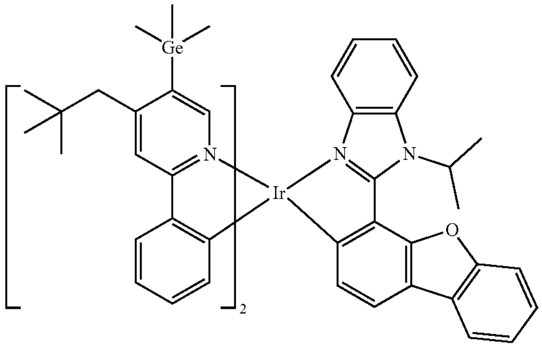
753
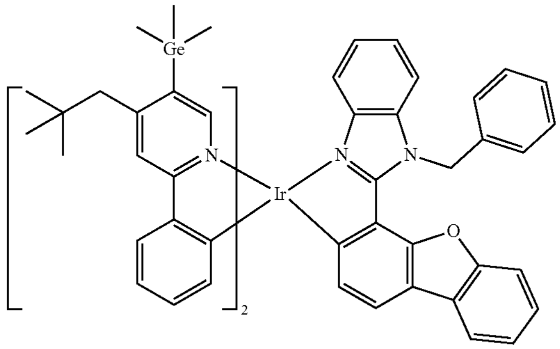
754
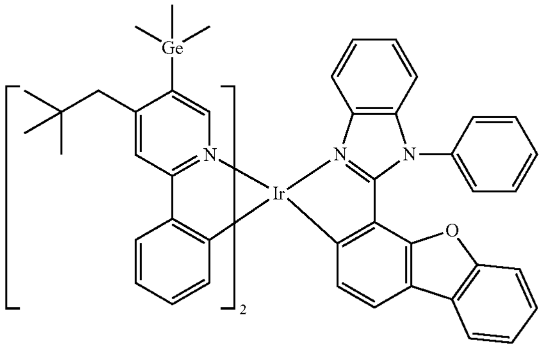

-continued
755
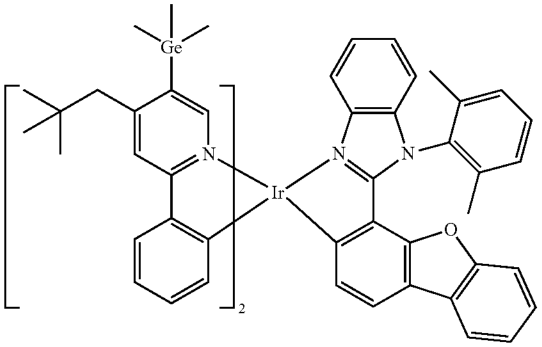
756
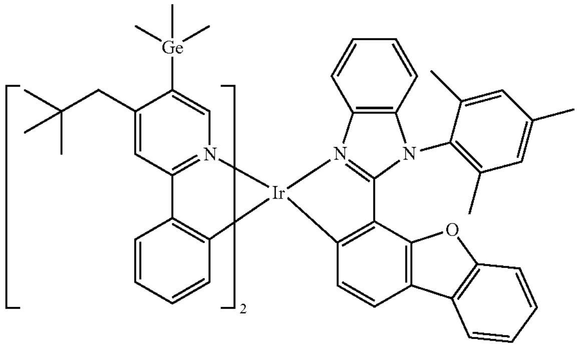
757
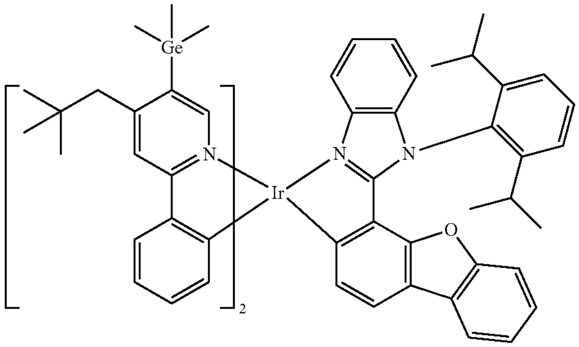
758
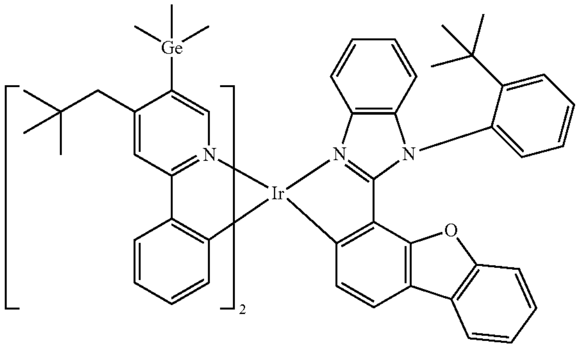
-continued
759
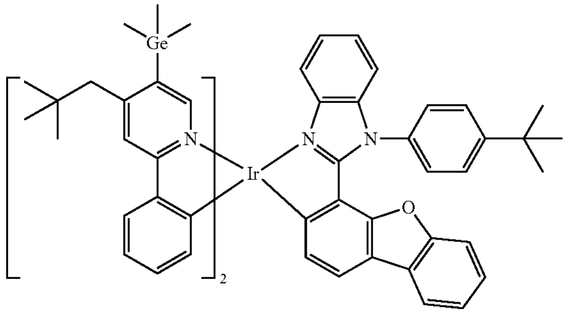
760
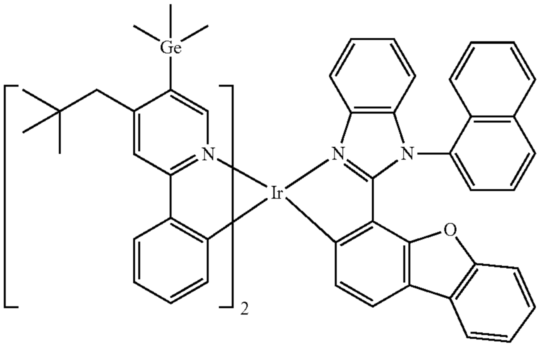
761
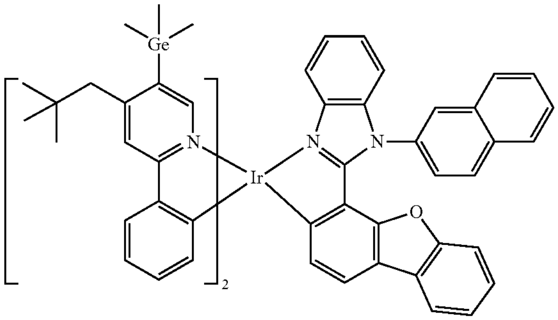
762
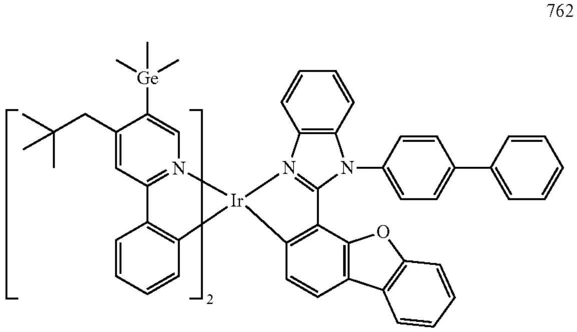

-continued
763
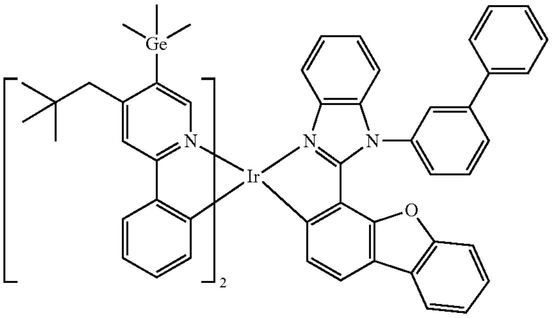
764
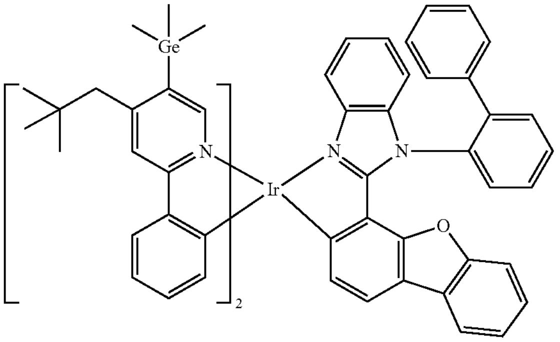
765
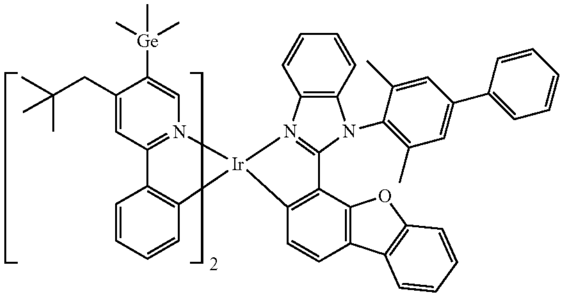
766
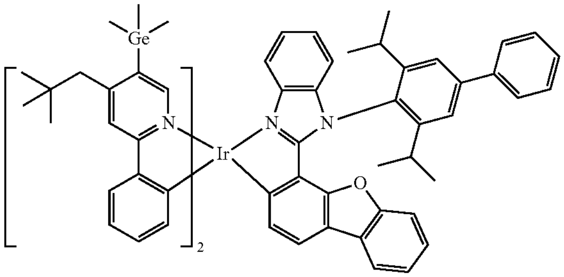
-continued
767
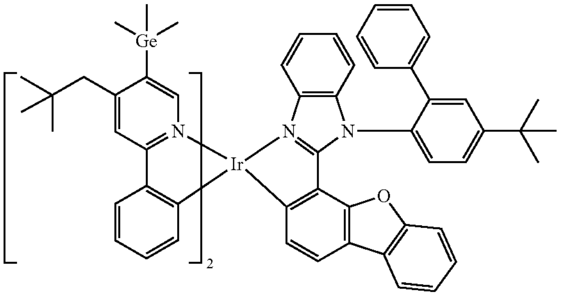
768
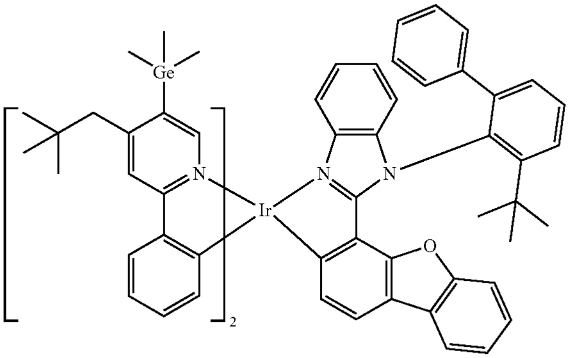
769
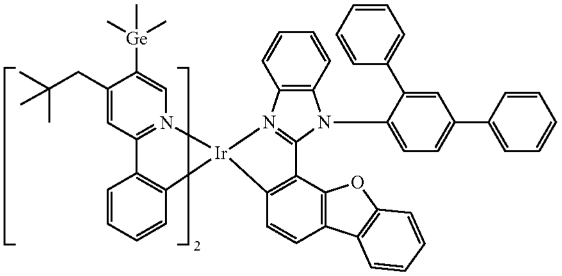
770
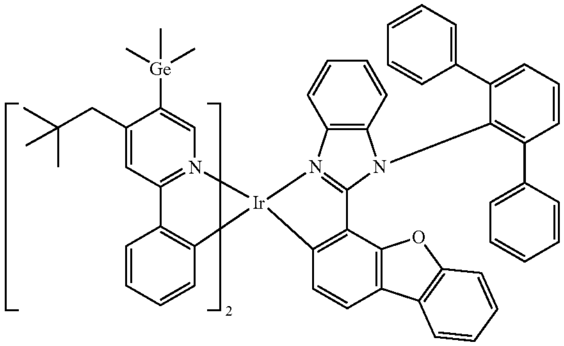

-continued
771
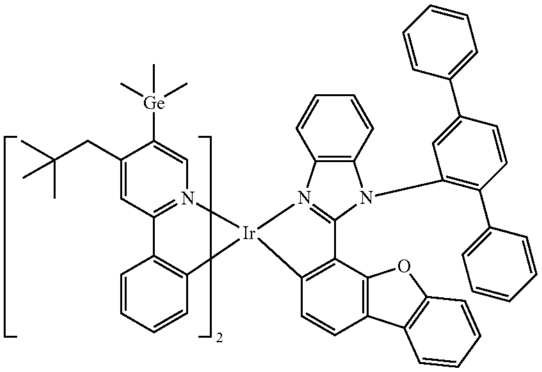
772
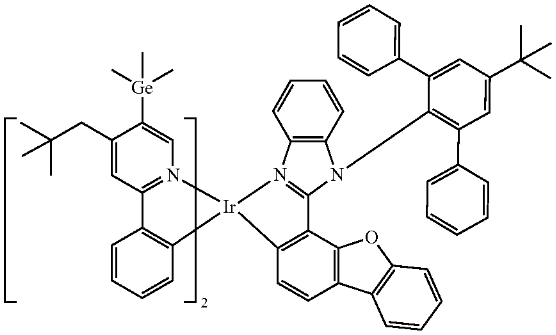
773
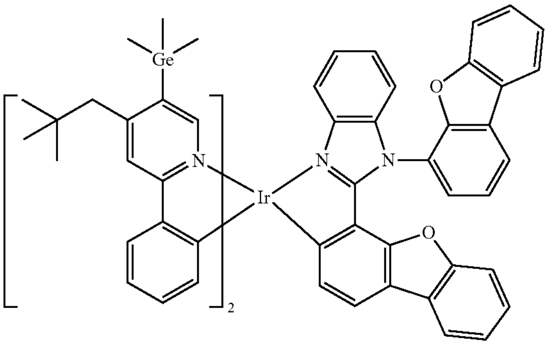
774
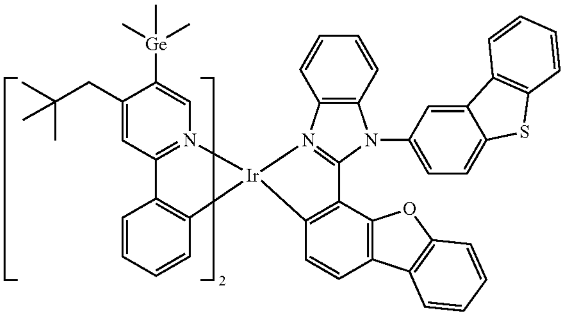
-continued
775
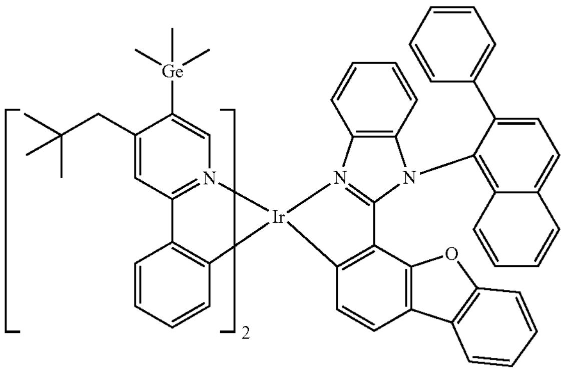
776
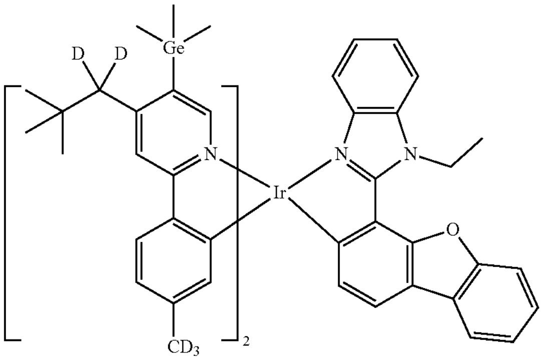
777
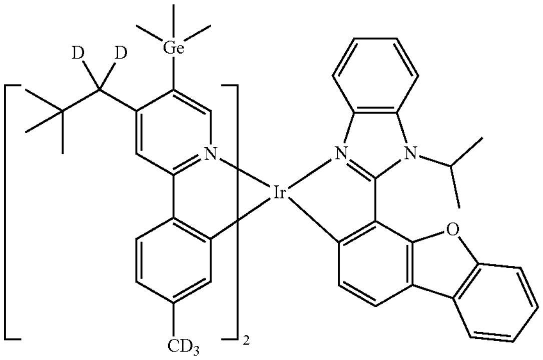
778
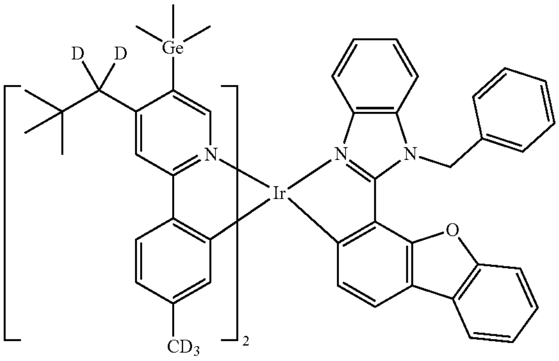

-continued
779
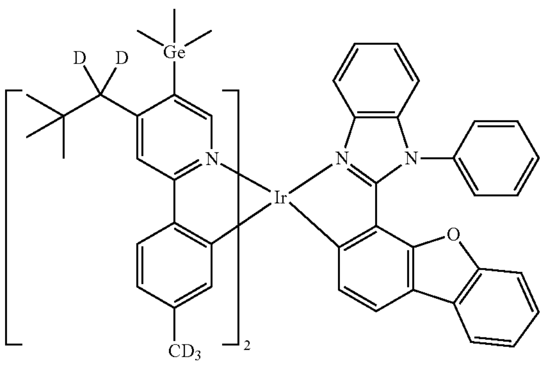
780
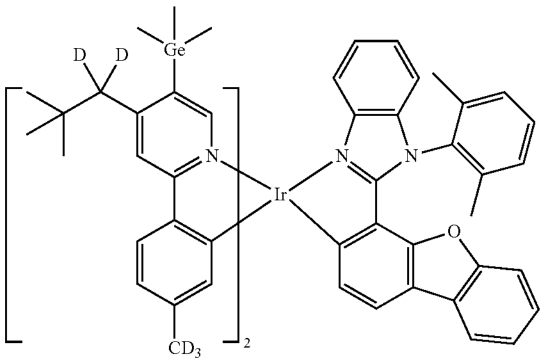
781
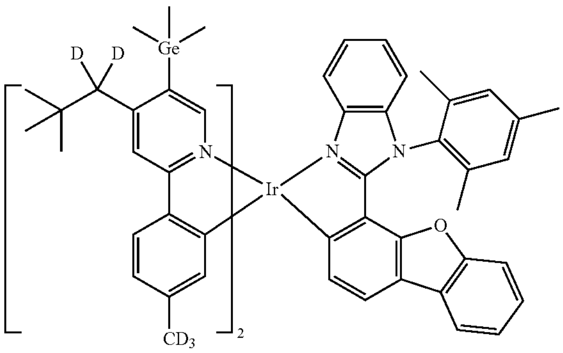
782
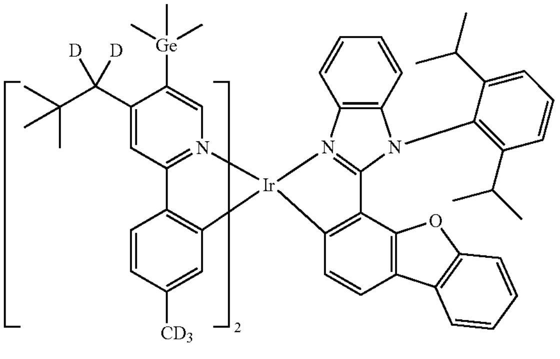
-continued
783
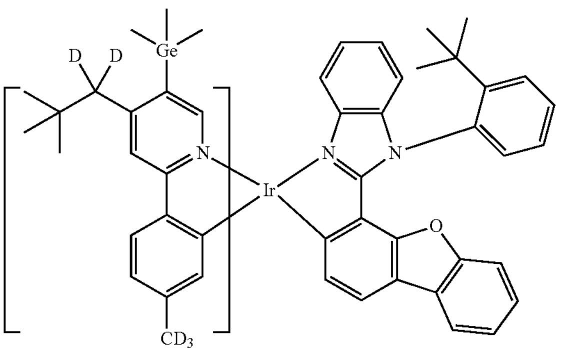
784
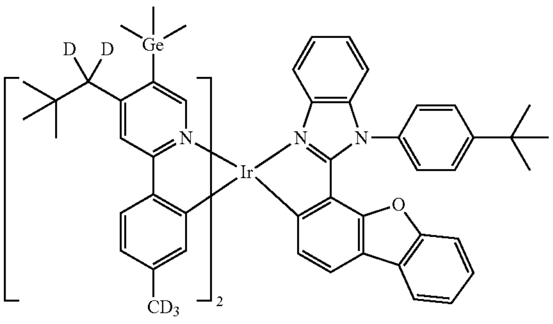
785
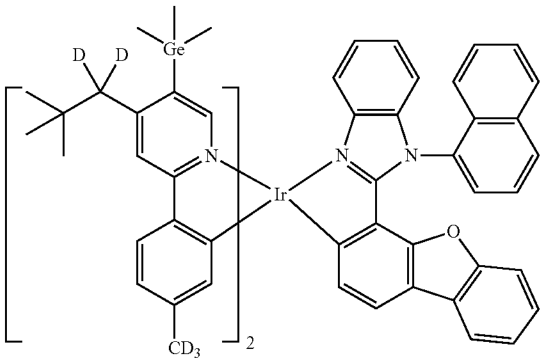
786
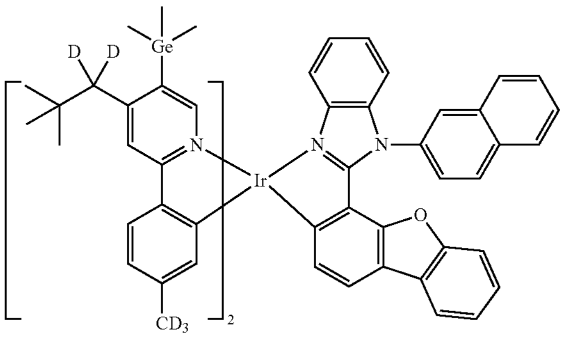

787
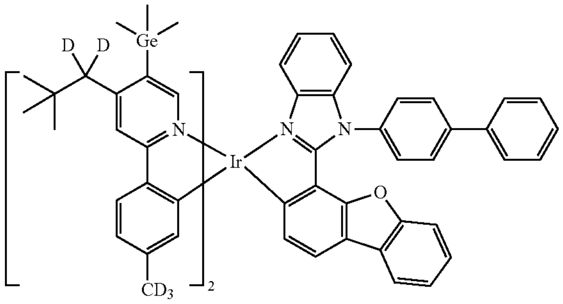
788
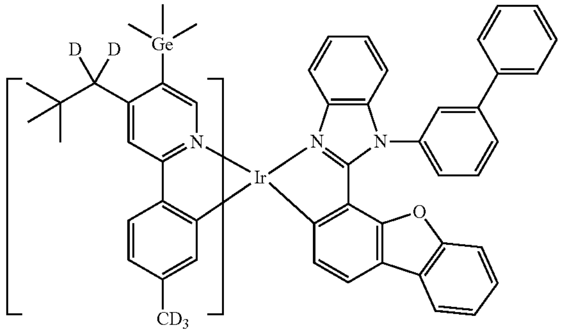
789
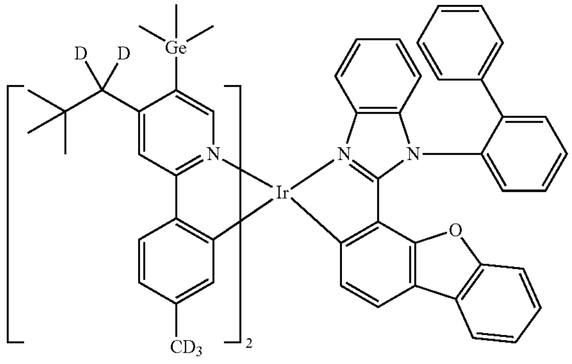
790
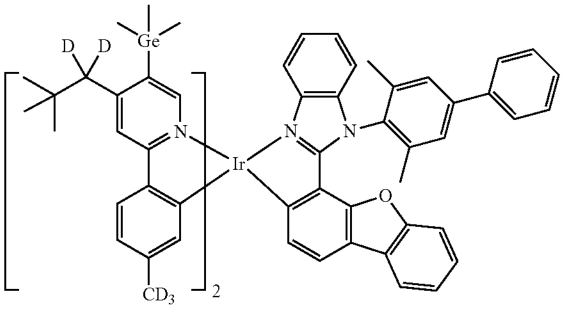
791
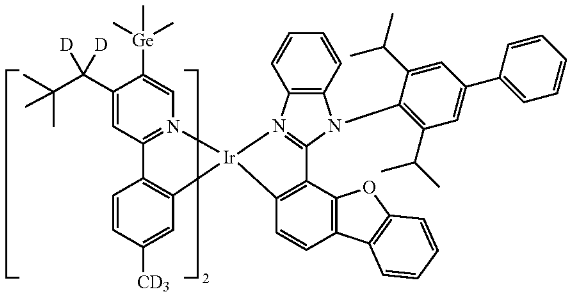
792
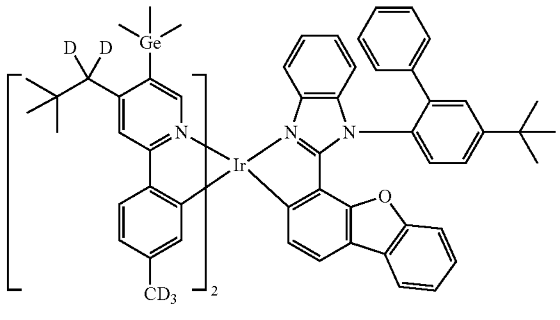
793
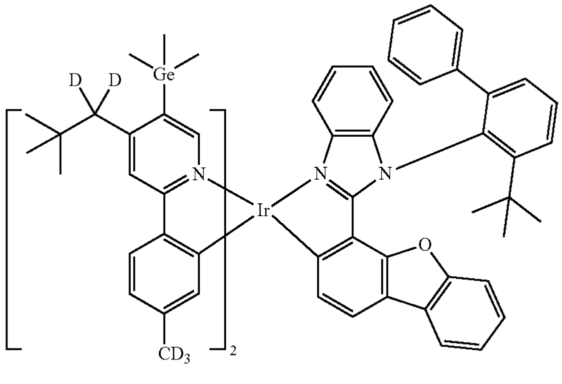
794
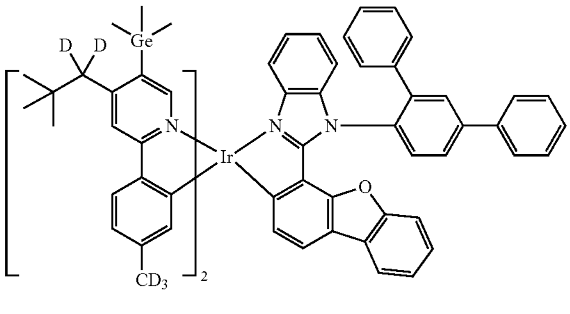

-continued
795
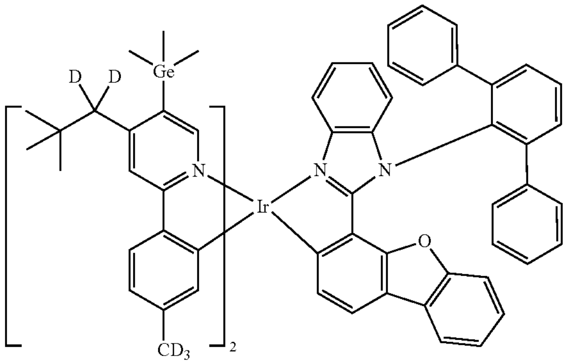
796
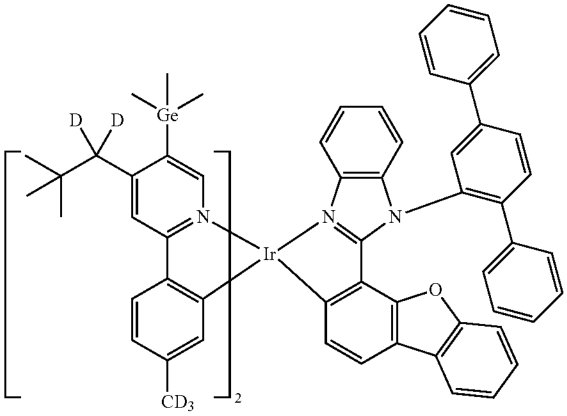
797
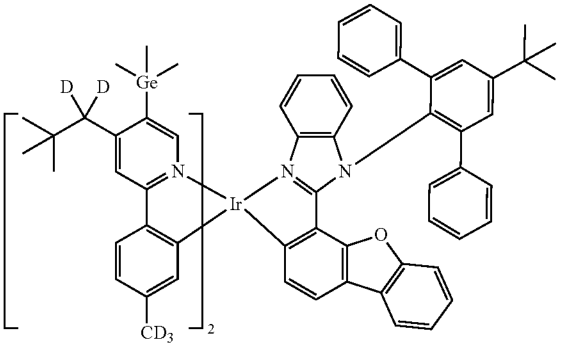
798
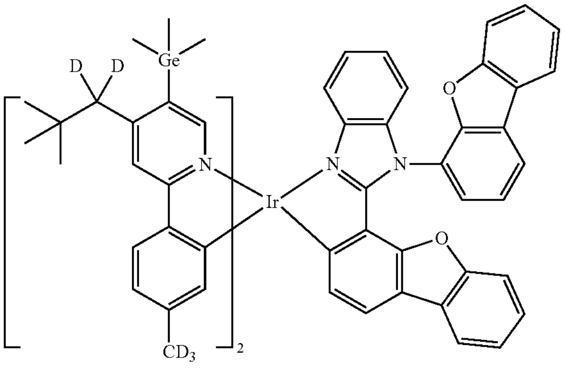
-continued
799
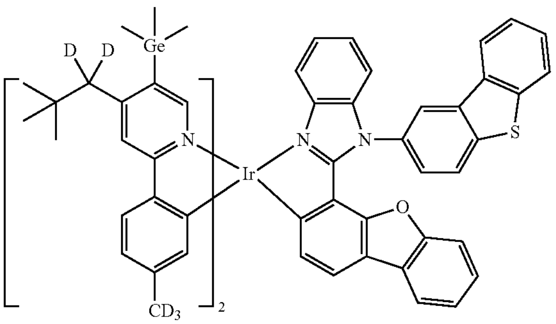
800
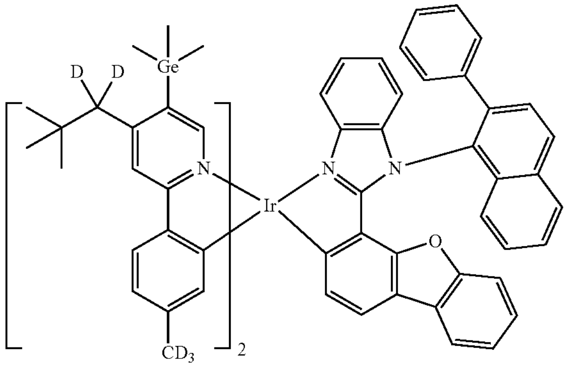
801
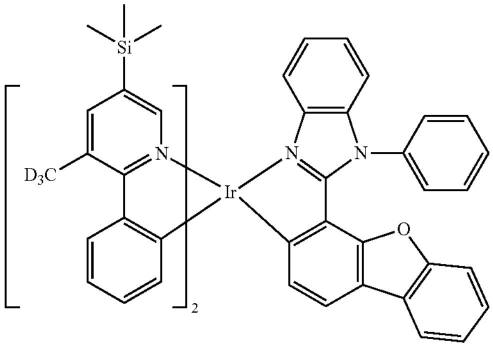
802
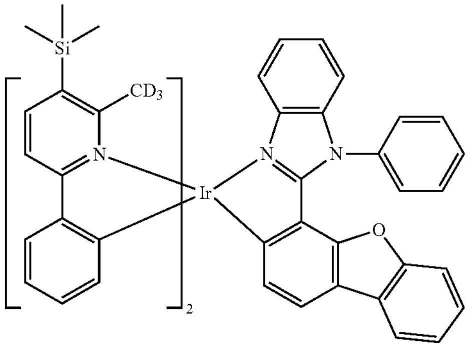

-continued
803
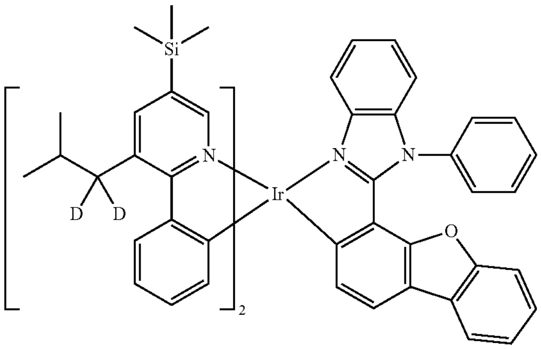
804
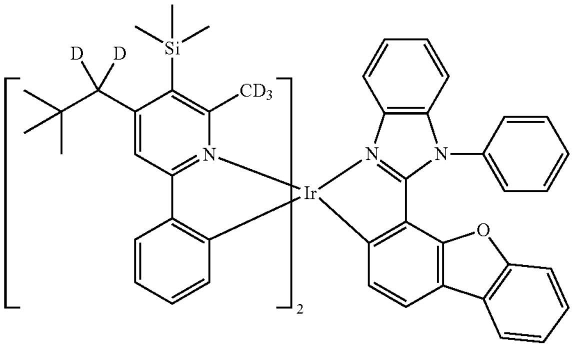
805
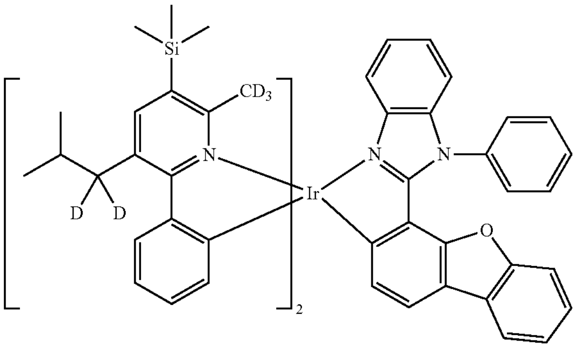
806
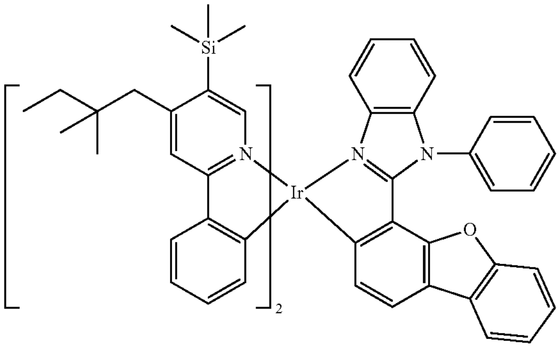
-continued
807
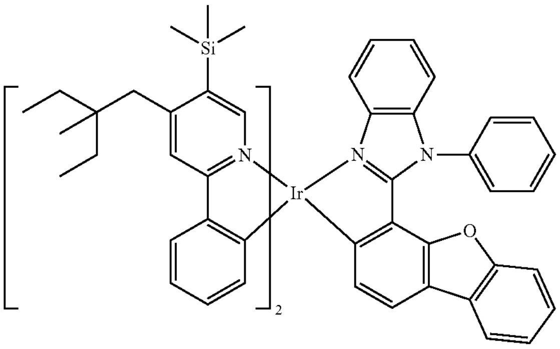
808
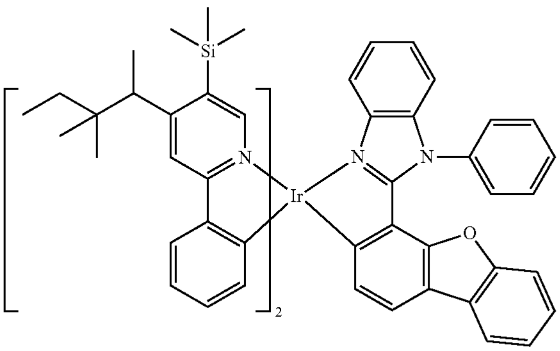
809
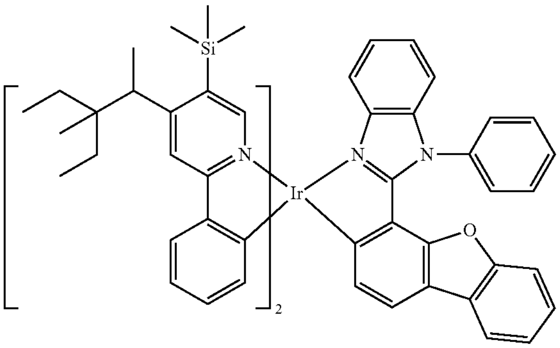
810
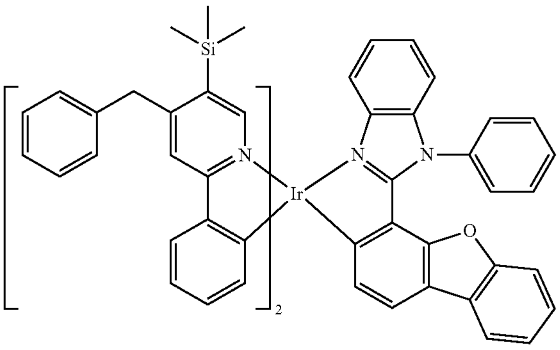

-continued
811
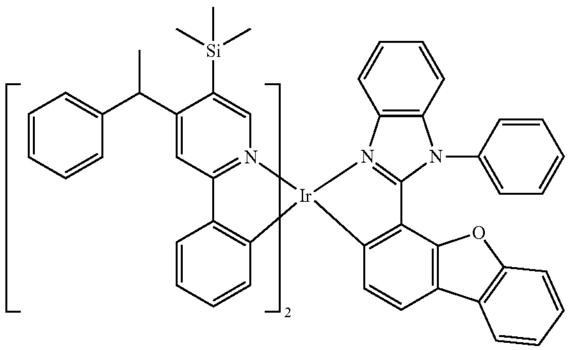
812
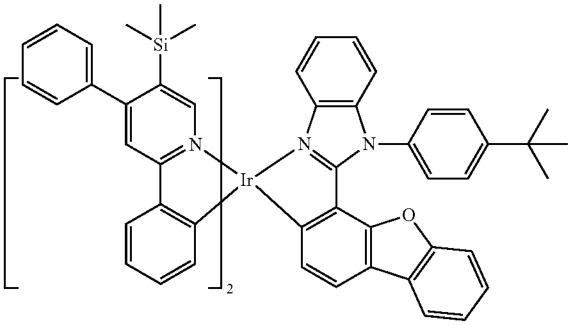
813
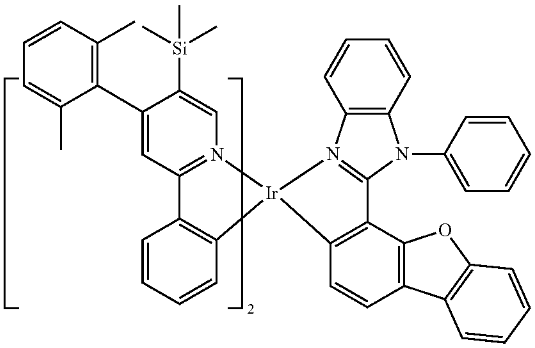
814
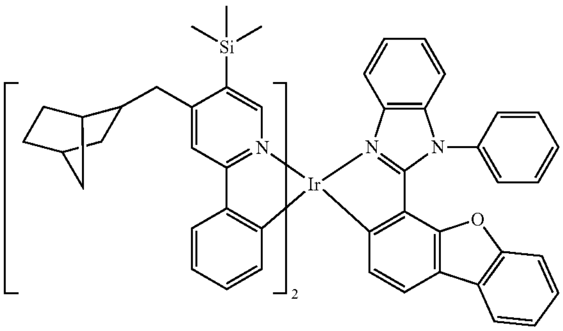
-continued
815
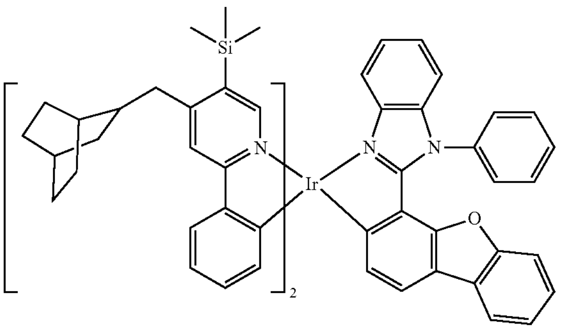
816
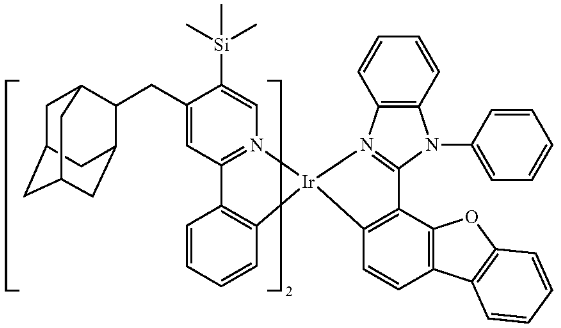
817
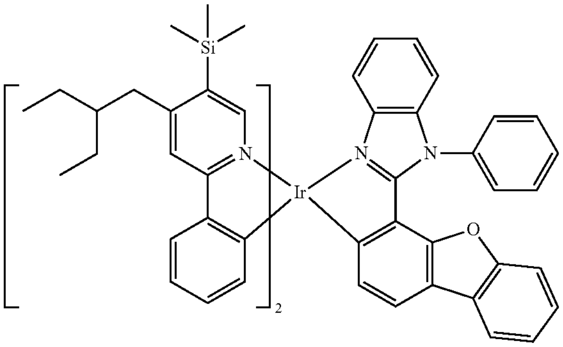
818
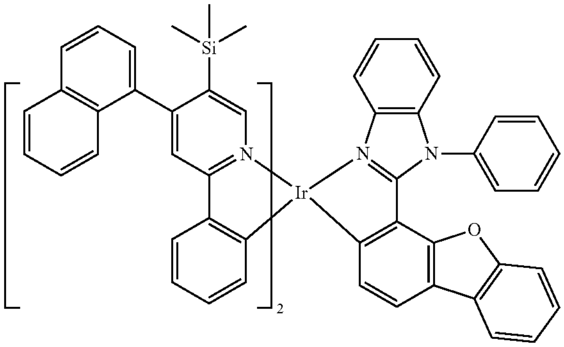

-continued
819
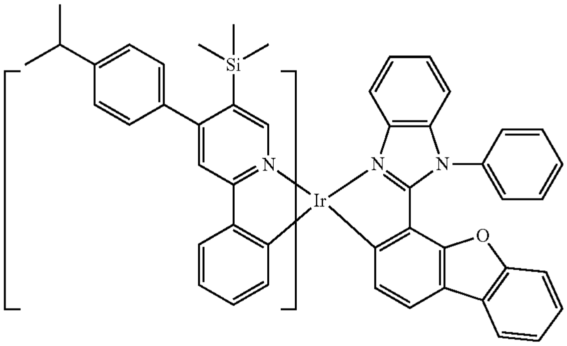
820
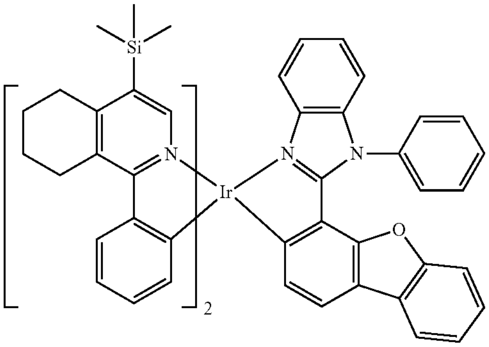
821
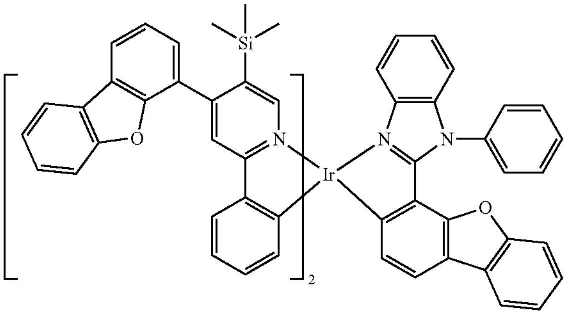
822
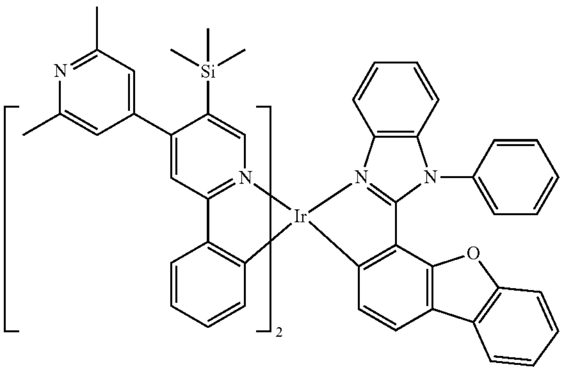
-continued
823
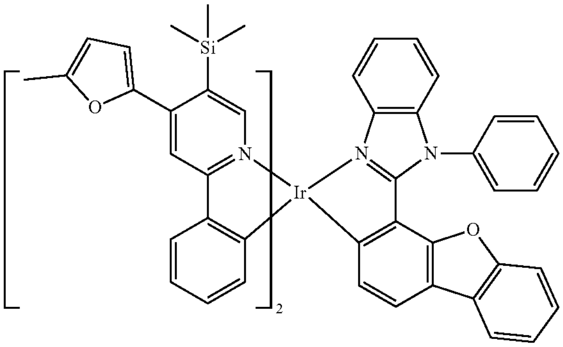
824
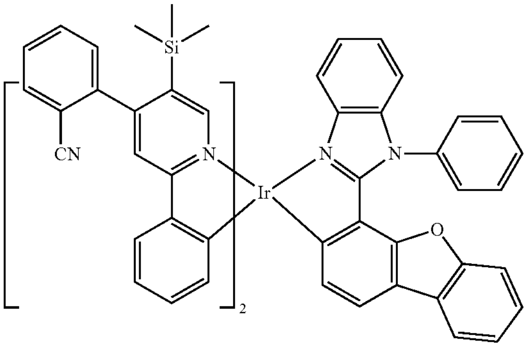
825
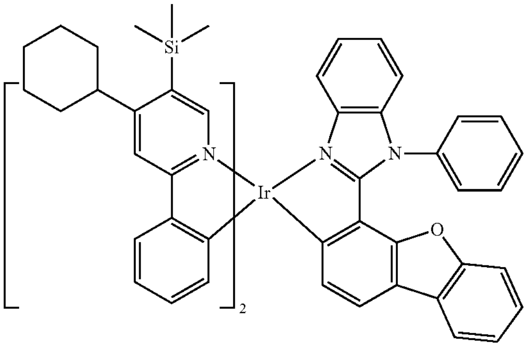
826
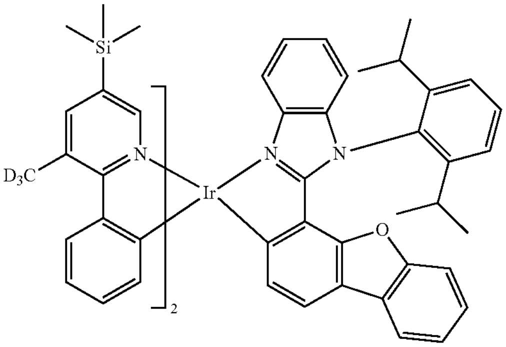

-continued
827
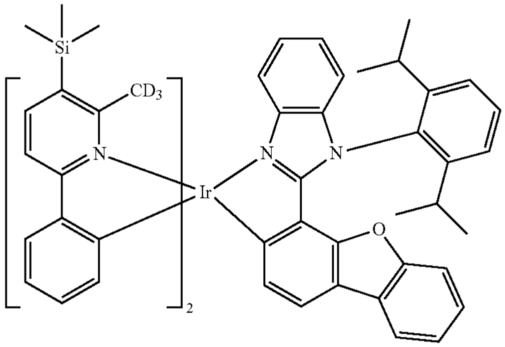
828
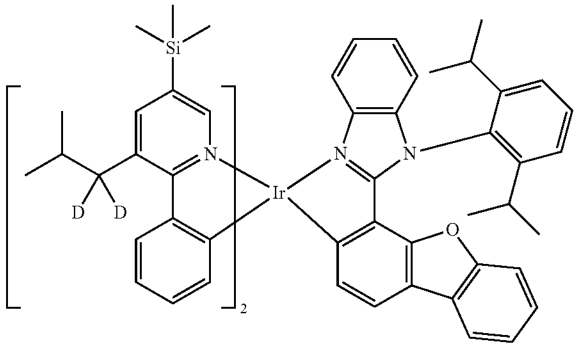
829
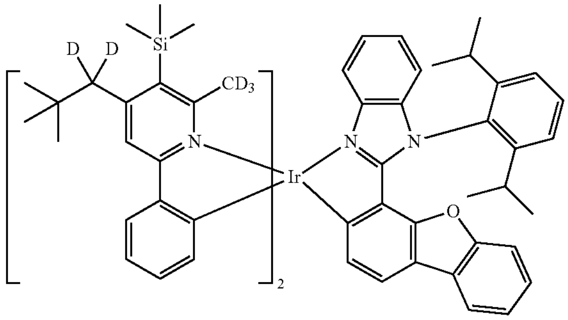
830
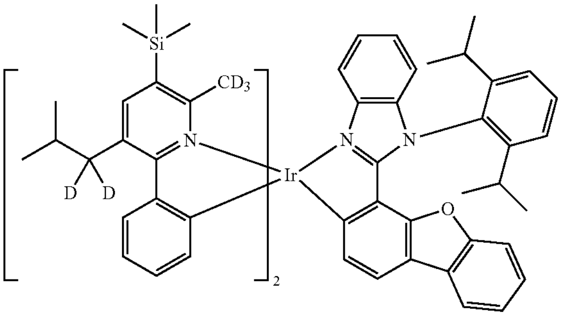
-continued
831
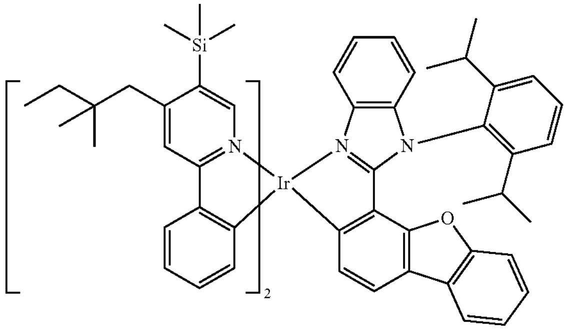
832
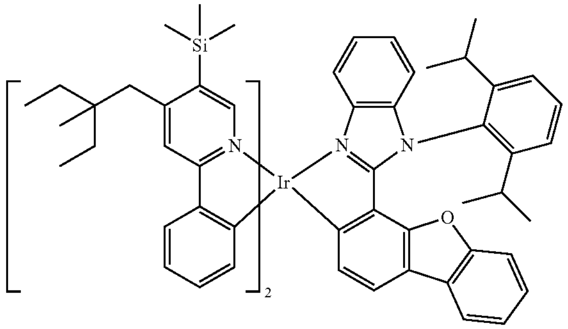
833
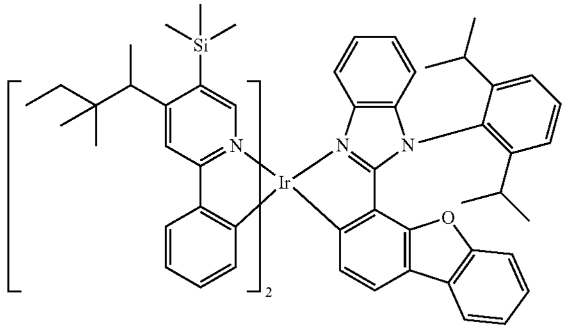
834
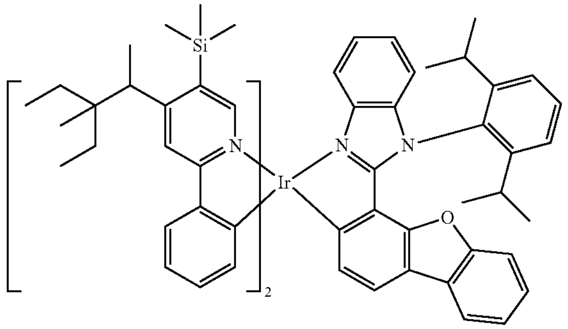

-continued
835
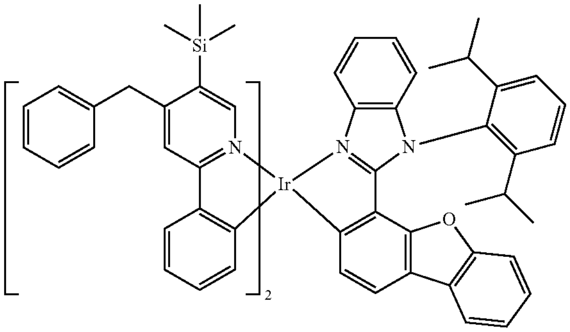
836
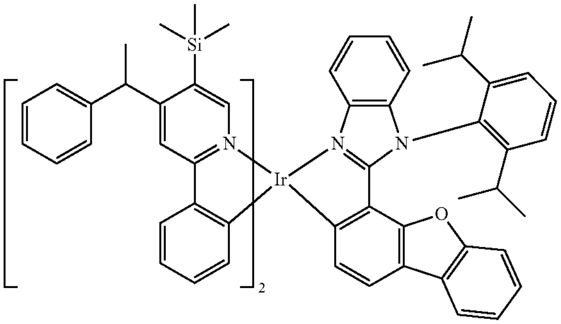
837
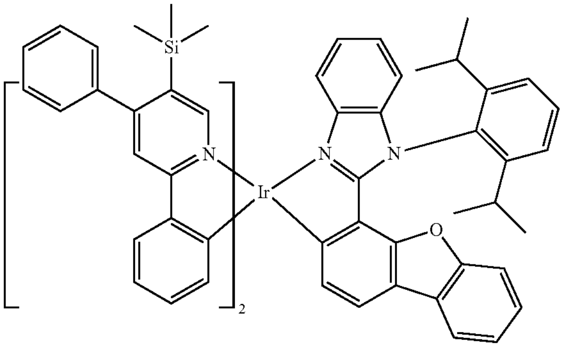
838
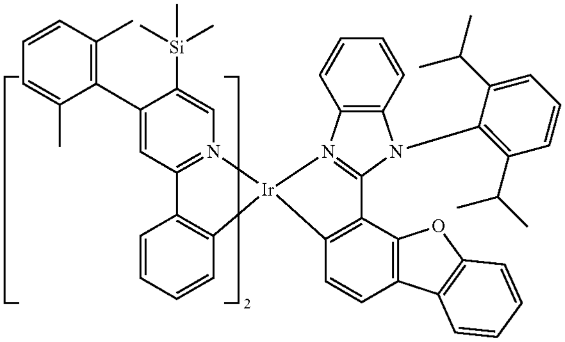
-continued
839
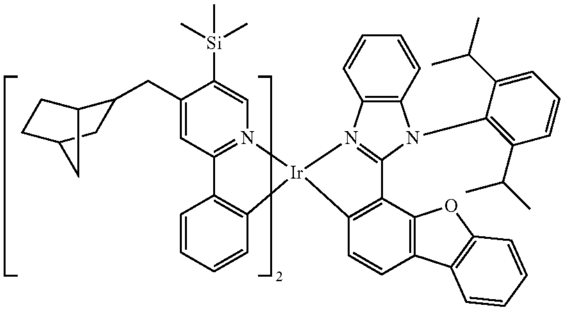
840
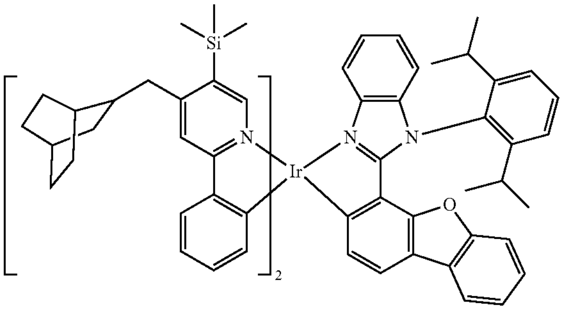
841
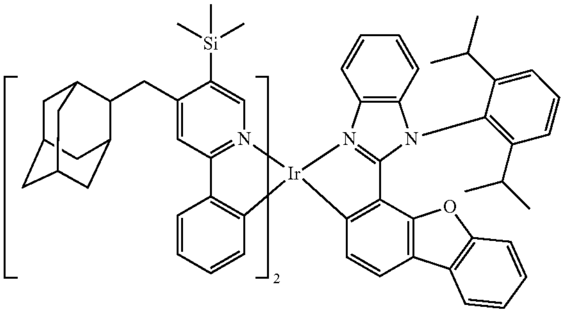
842
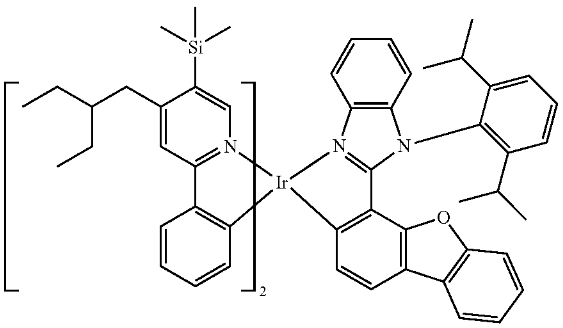

-continued
843
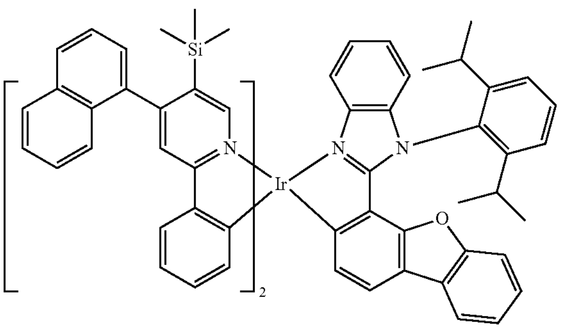
844
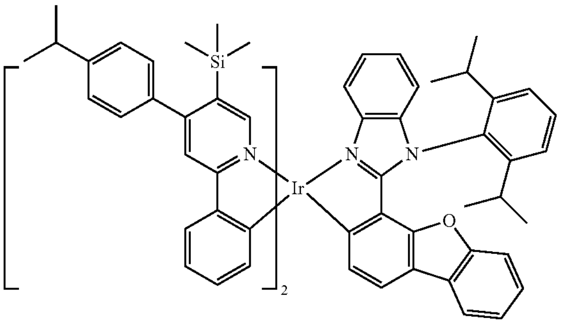
845
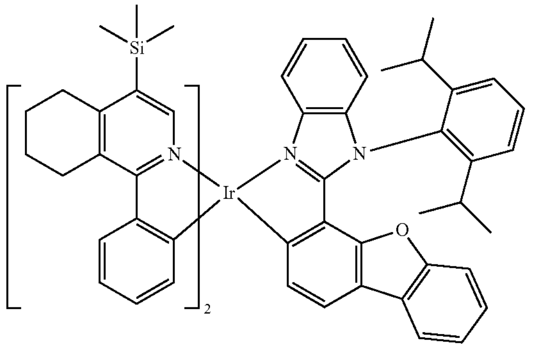
846
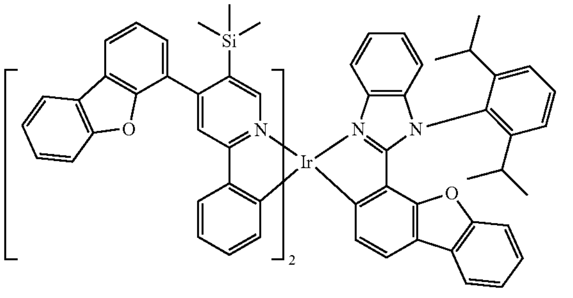
-continued
847
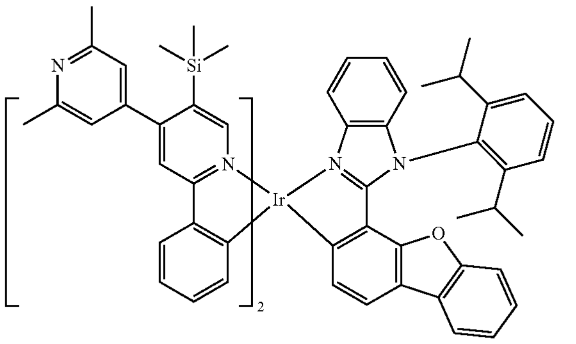
848
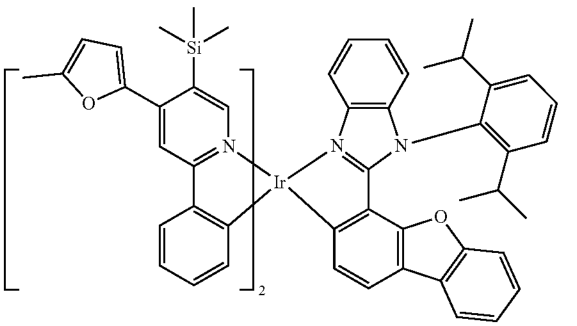
849
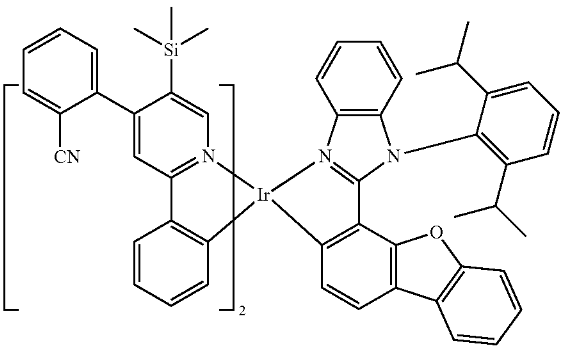
850
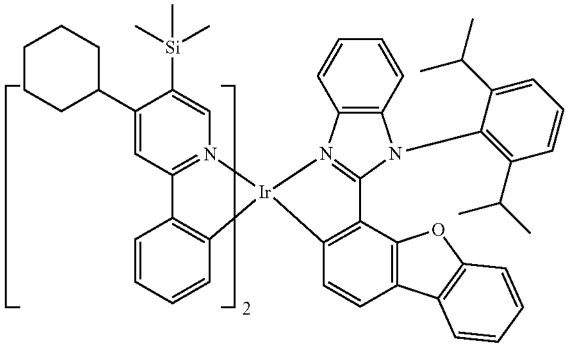

-continued
851
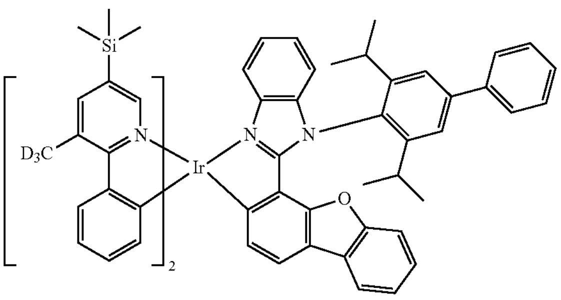
852
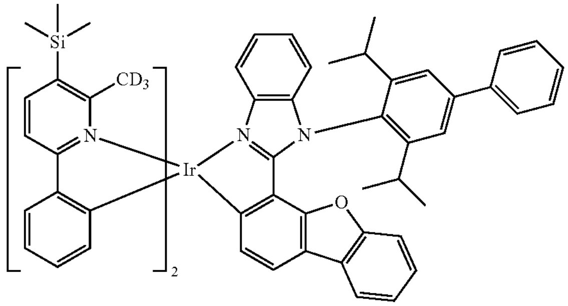
853
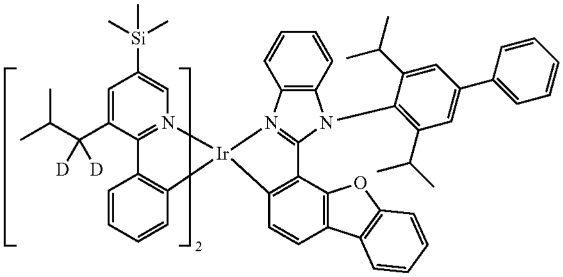
854
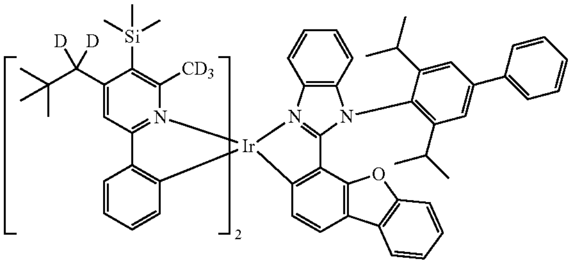
855
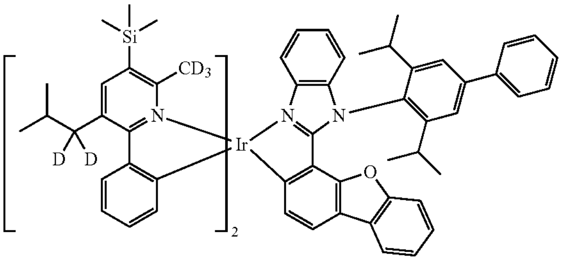
-continued
856
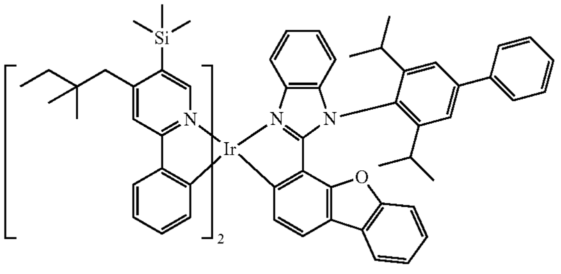
857
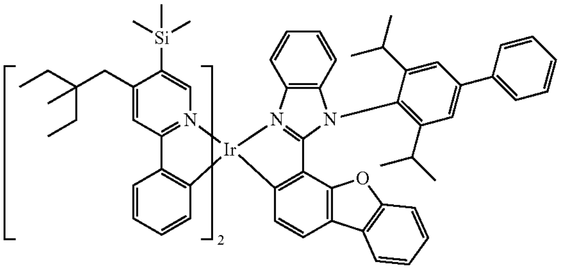
858
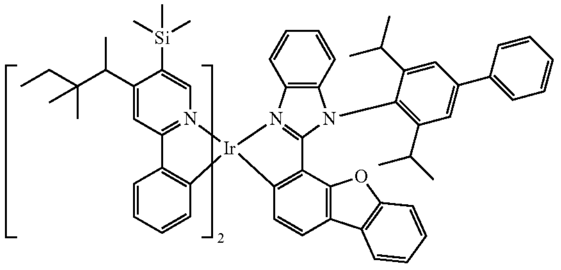
859
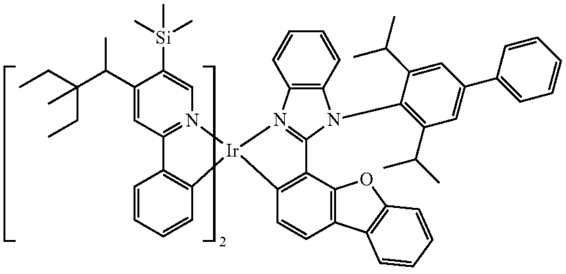
860
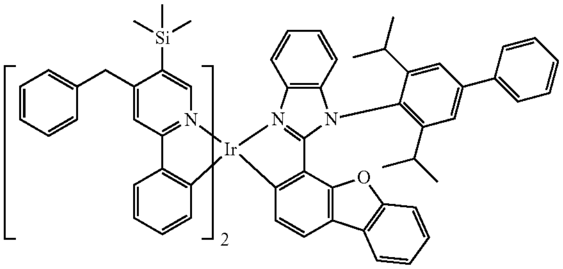

-continued
861
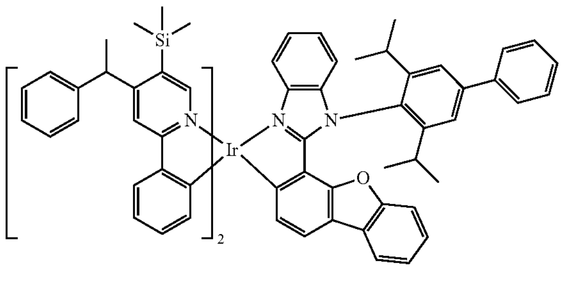
862
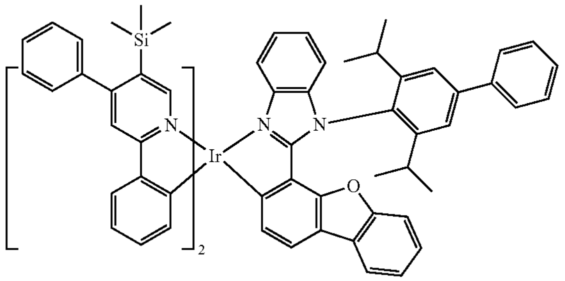
863
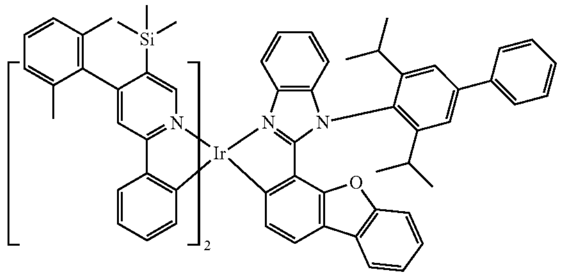
864
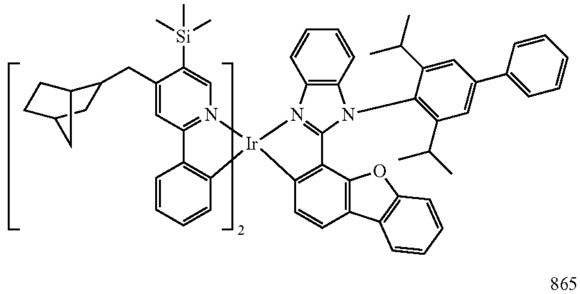
865
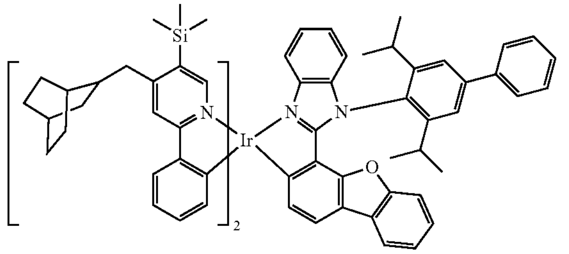
-continued
866
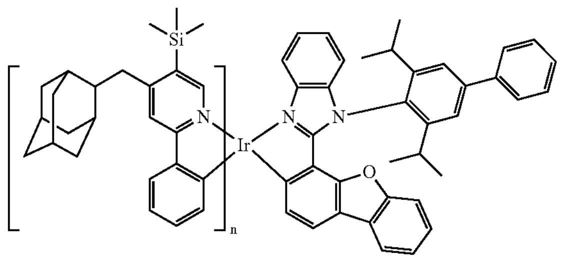
867
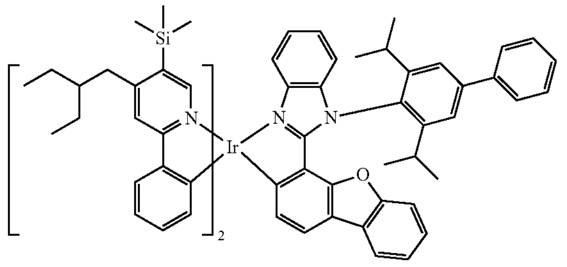
868
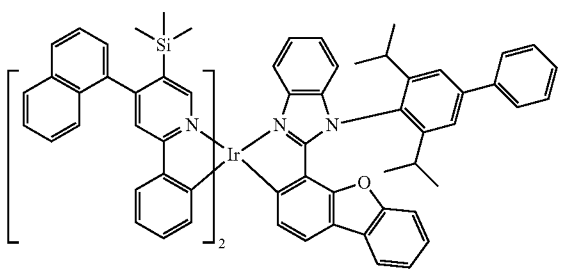
869
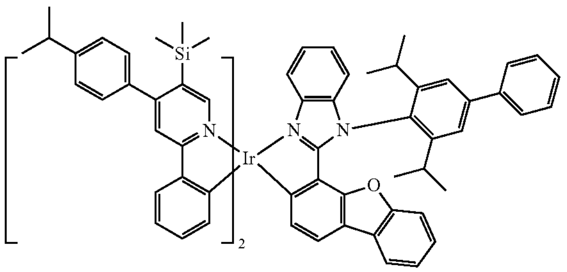
870
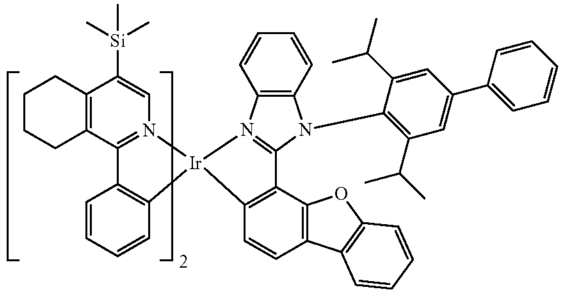

-continued
871
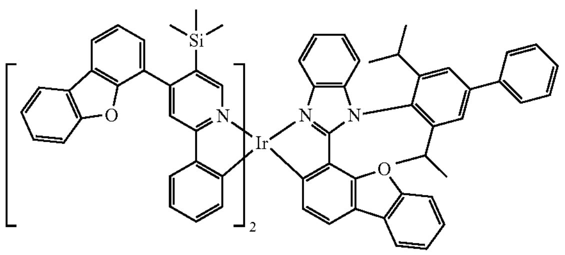
872
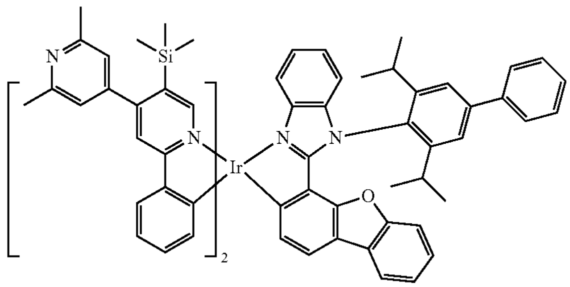
873
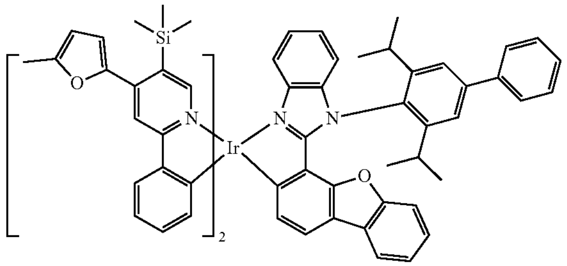
874
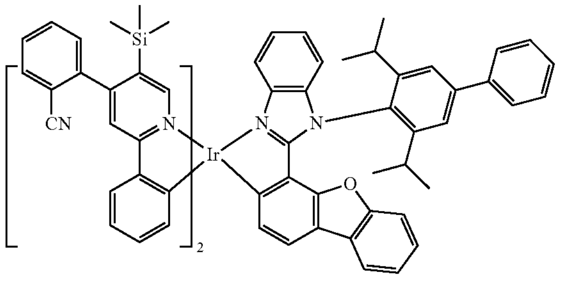
875
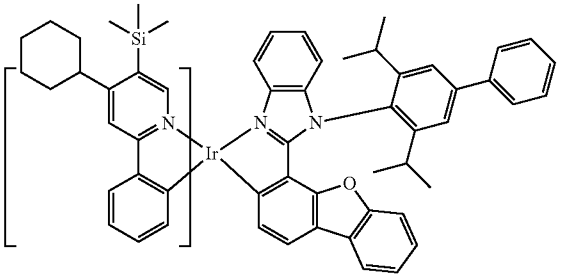
-continued
876
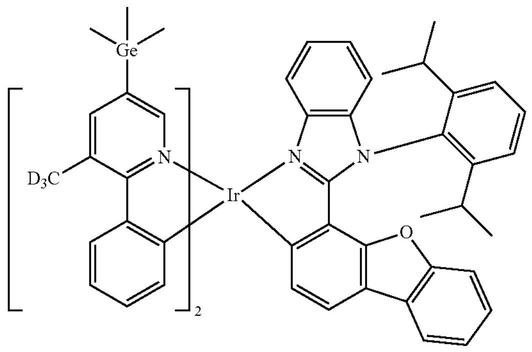
877
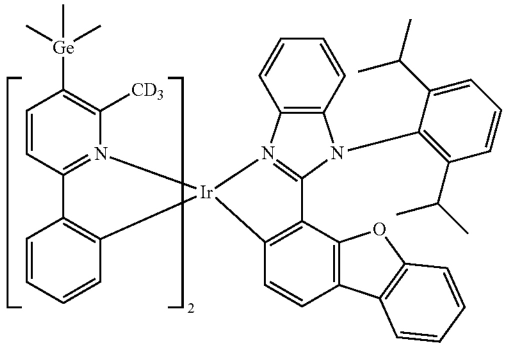
878
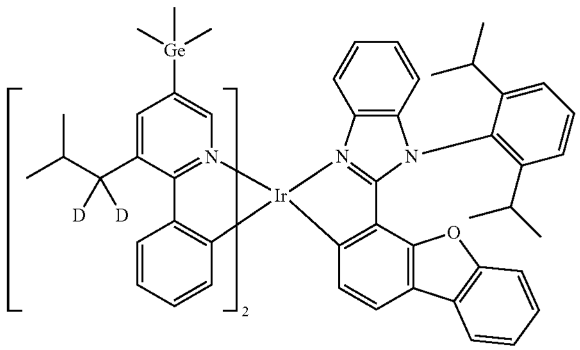
879
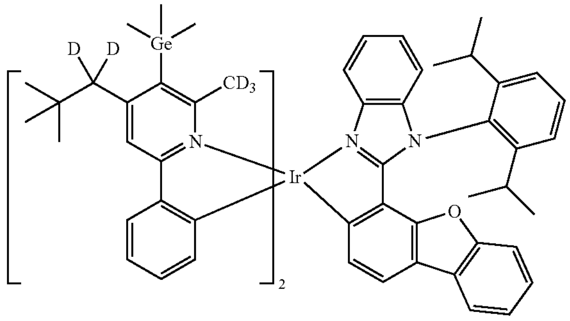

-continued
880
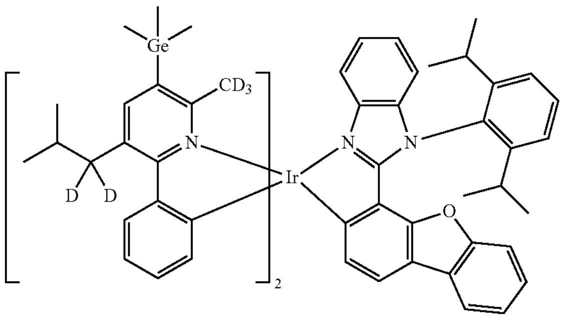
881
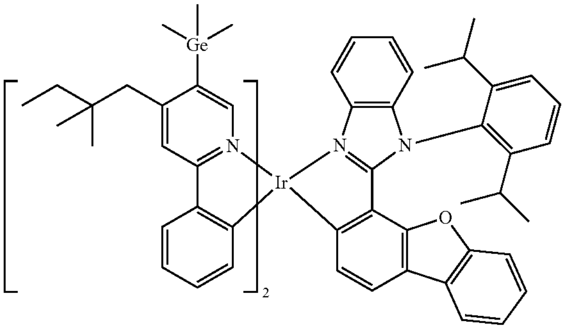
882
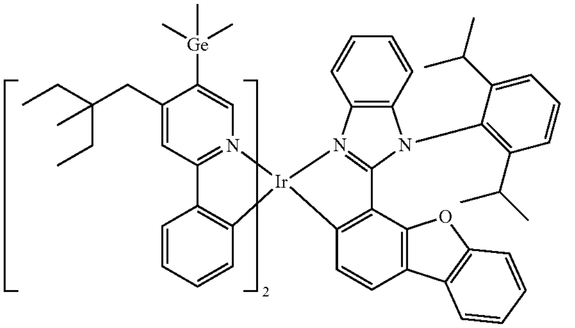
883
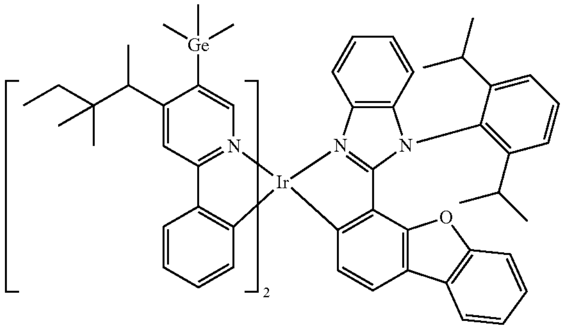
-continued
884
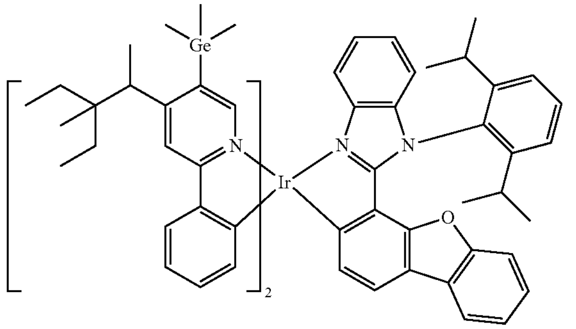
885
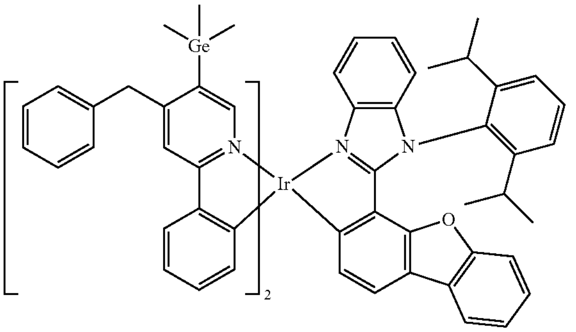
886
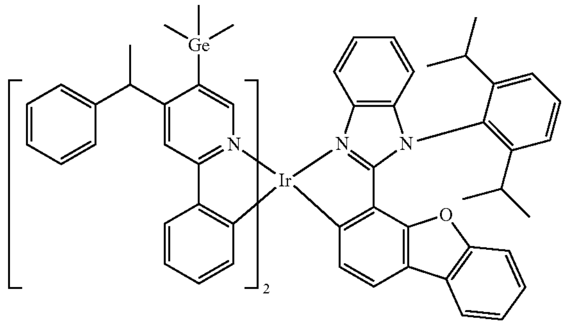
887
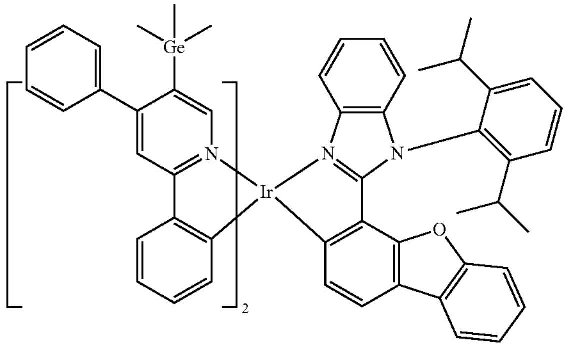

-continued
888
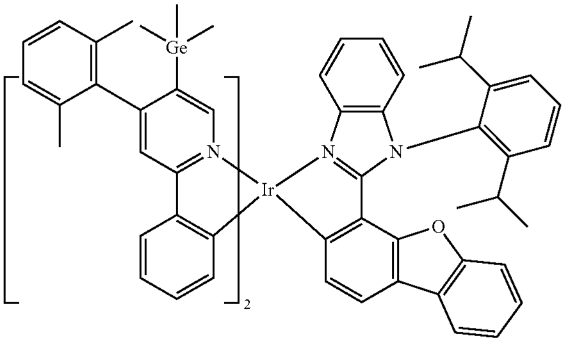
889
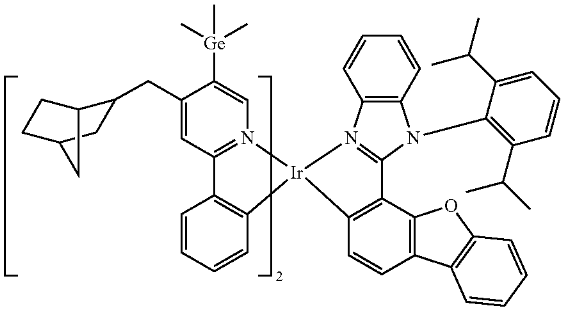
890
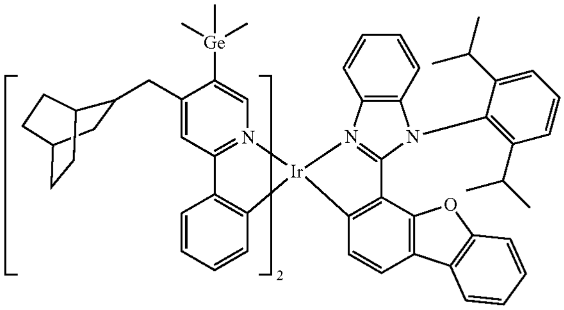
891
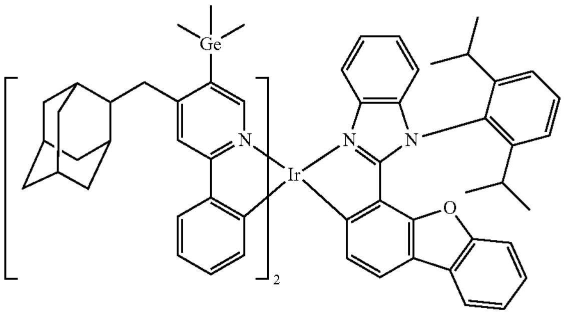
-continued
892
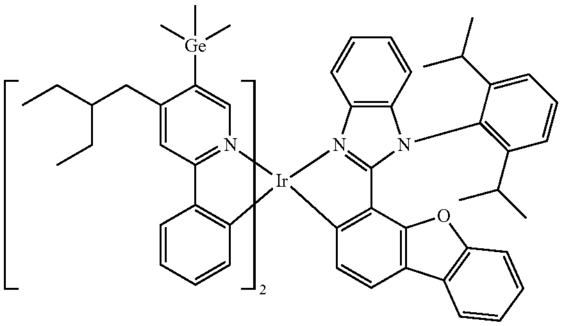
893
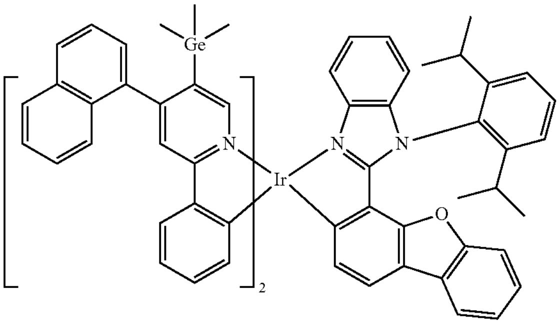
894
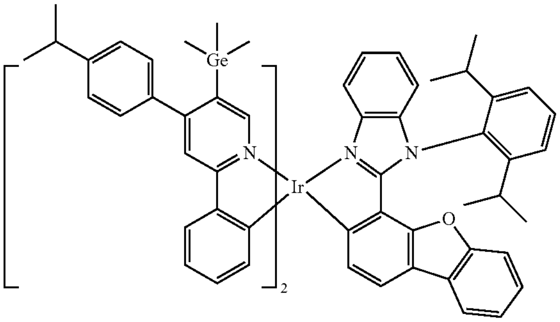
895
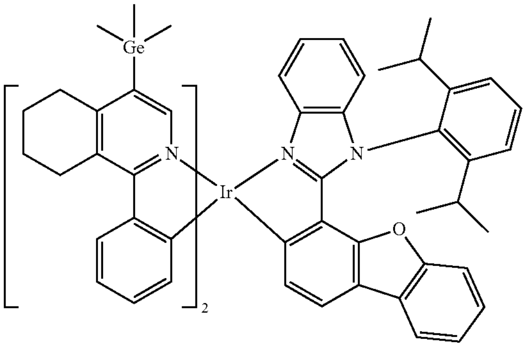

-continued
896
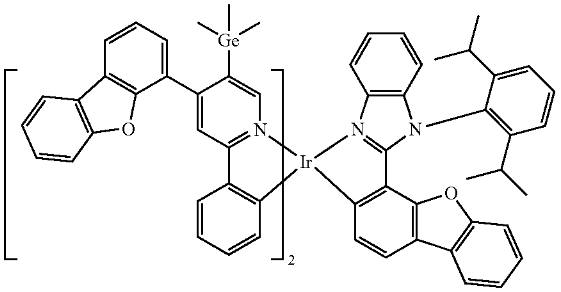
897
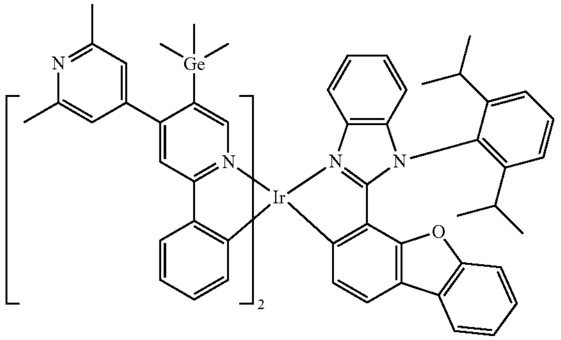
898
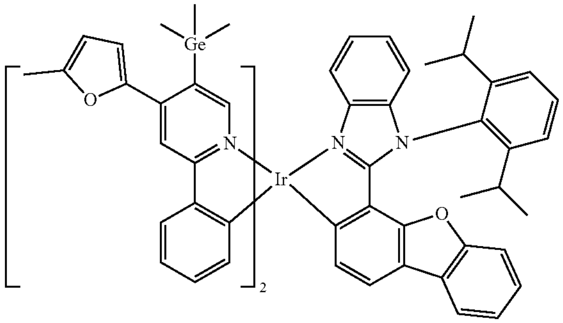
899
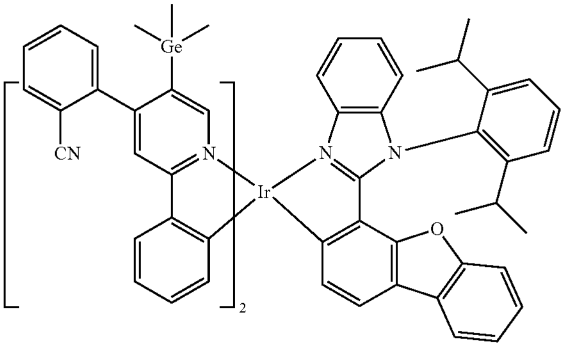
-continued
900
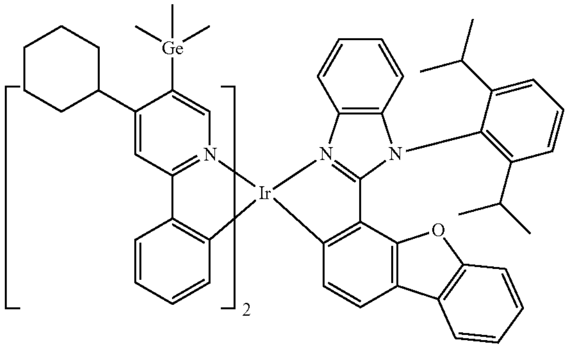
901
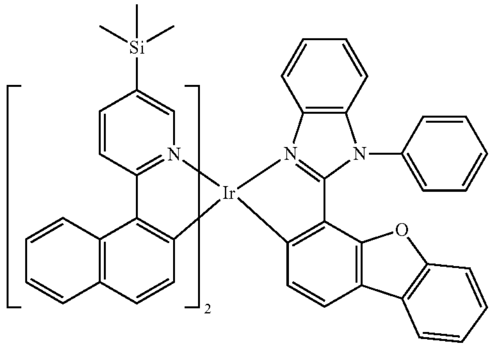
902
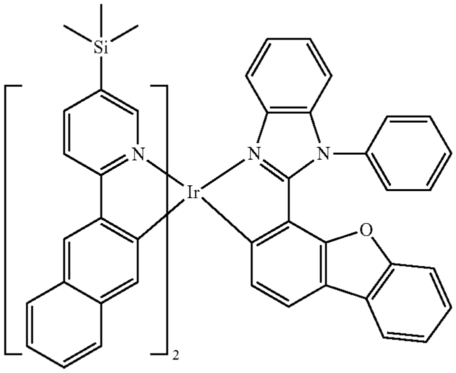
903
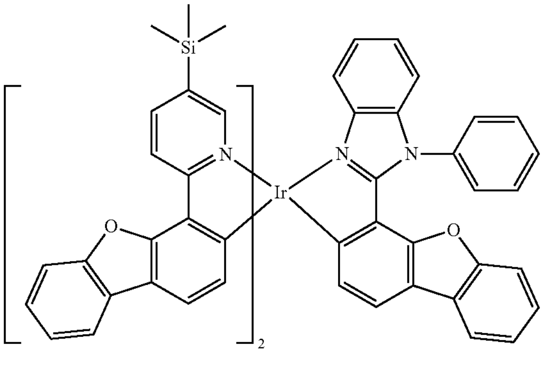

-continued
904
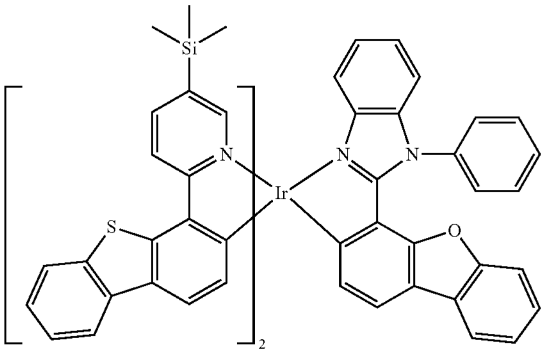
905
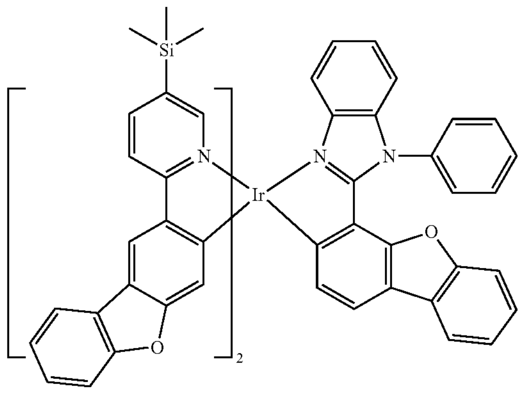
906
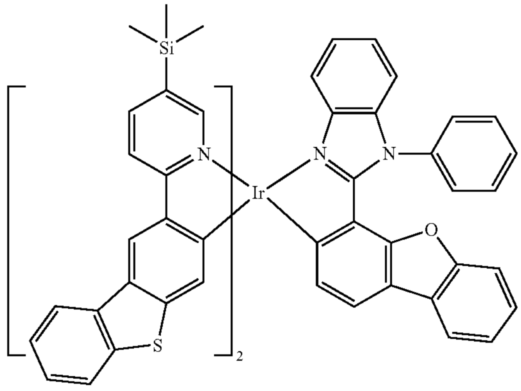
907
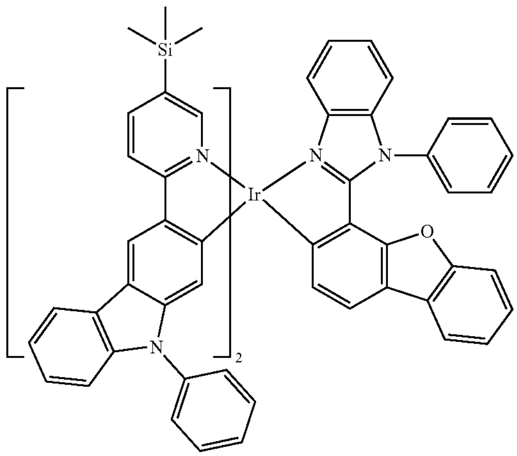
-continued
908
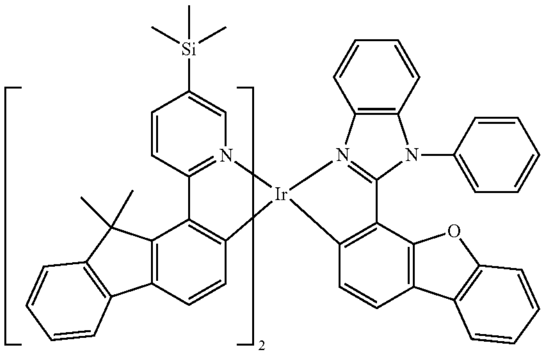
909
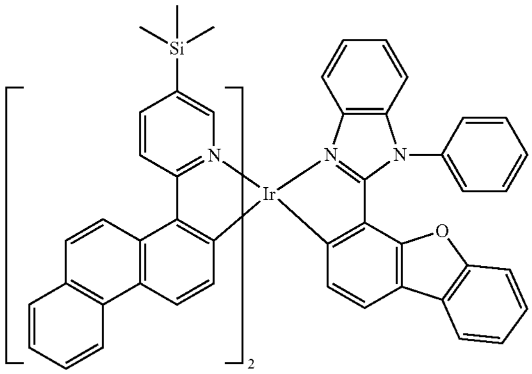
910
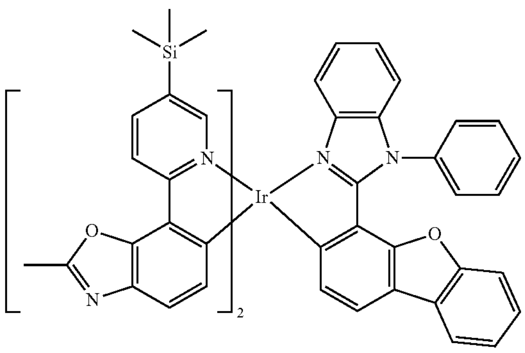
911
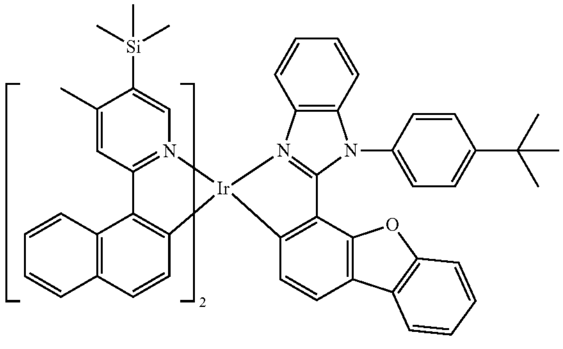

-continued
912
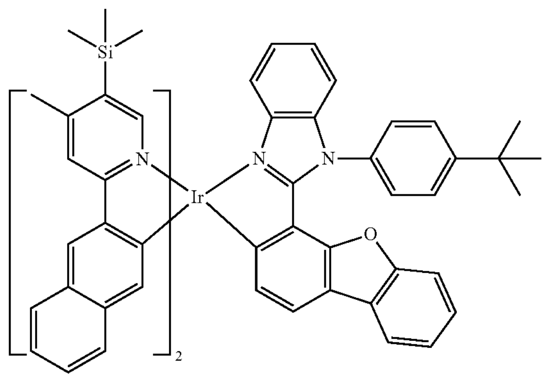
913
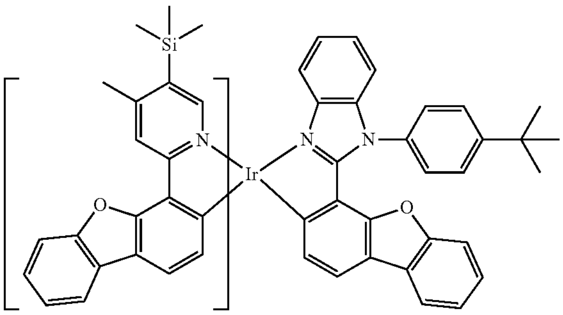
914
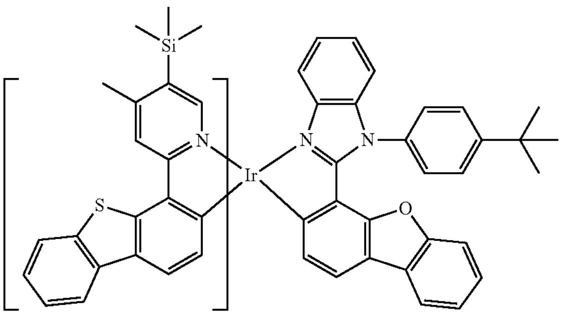
915
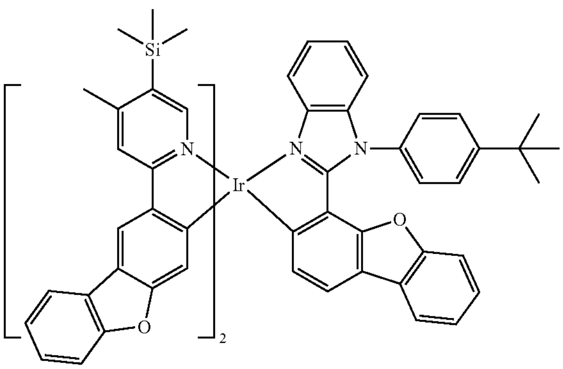
-continued
916
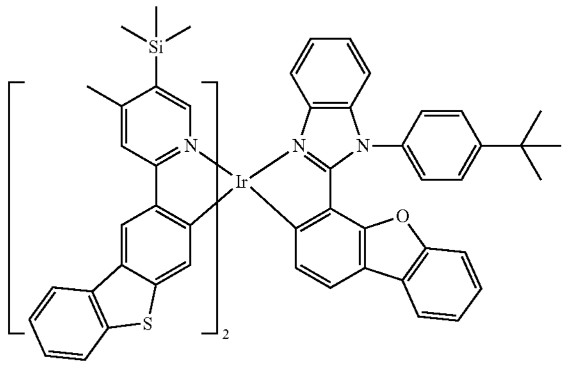
917
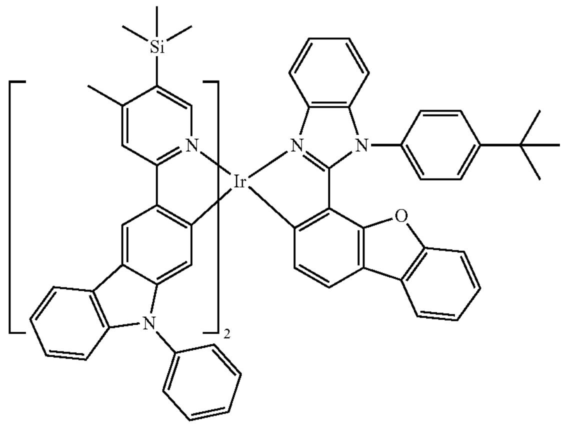
918
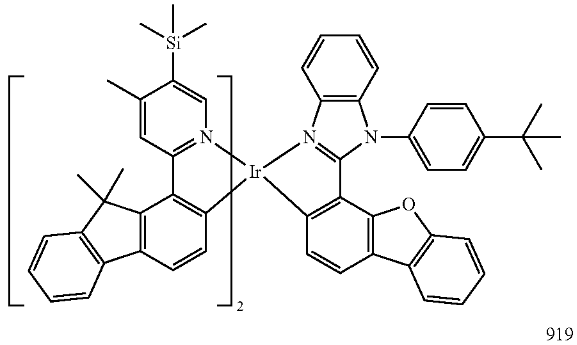
919
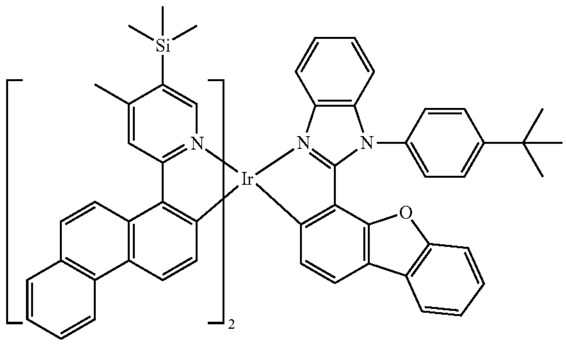

-continued
920
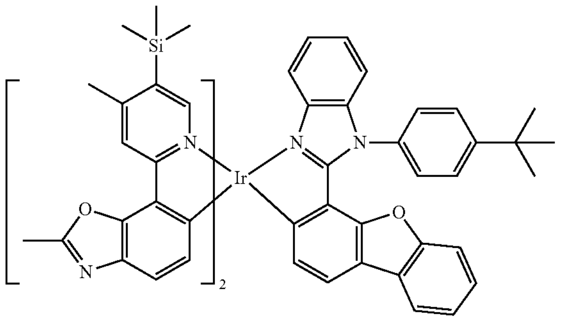
921
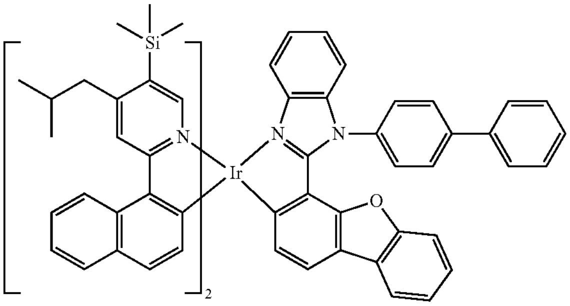
922
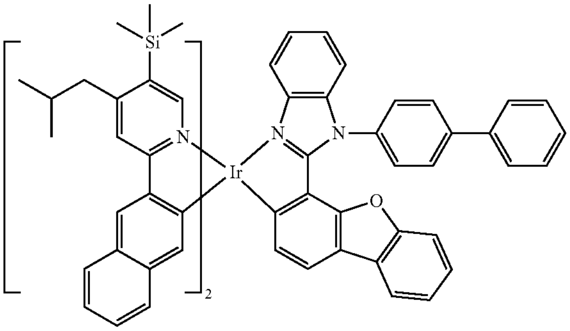
923
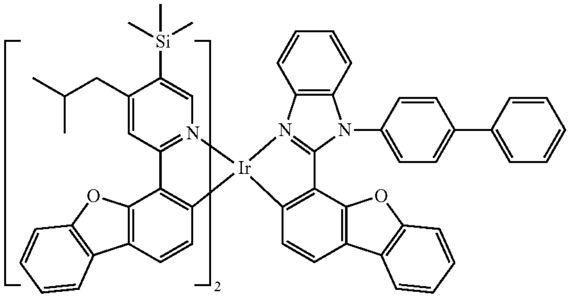
-continued
924
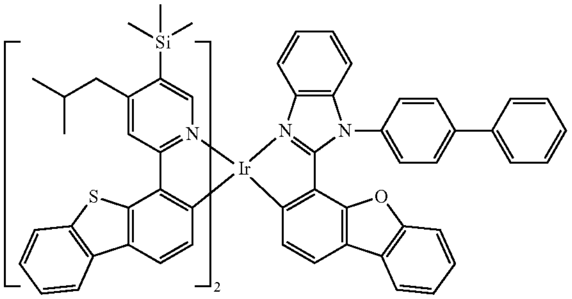
925
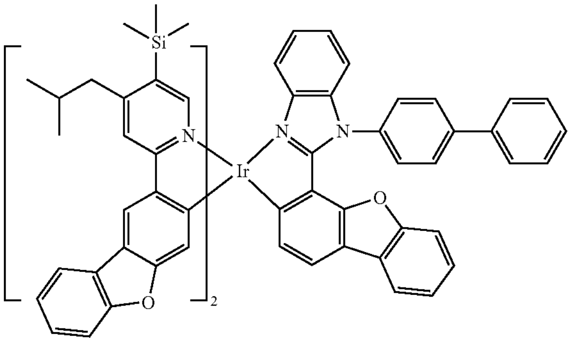
926
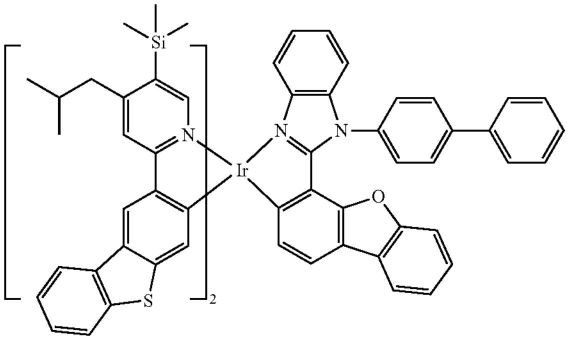
927
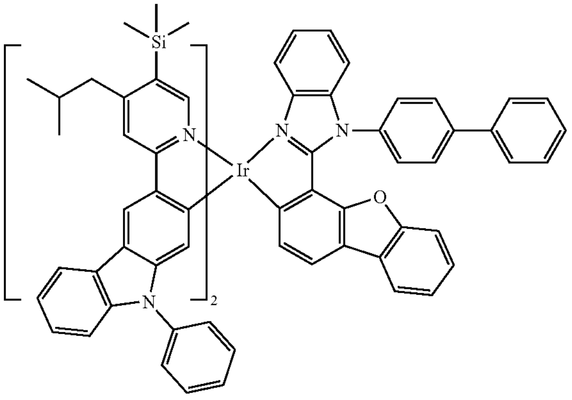

-continued
928
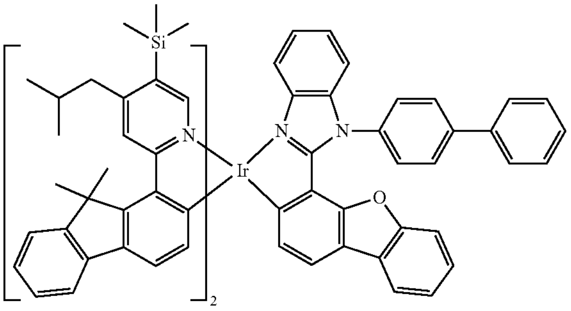
929
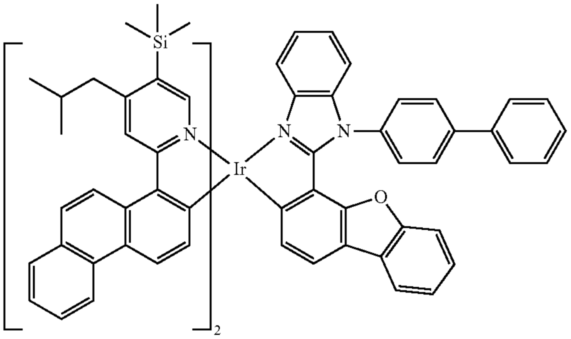
930
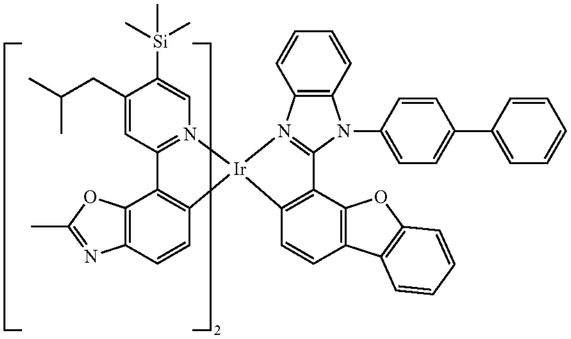
931
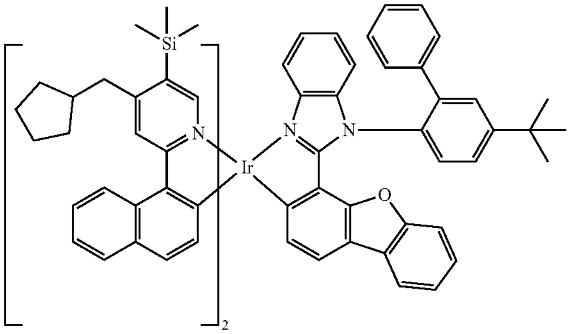
-continued
932
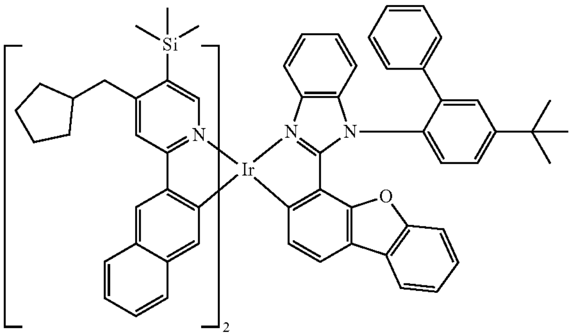
933
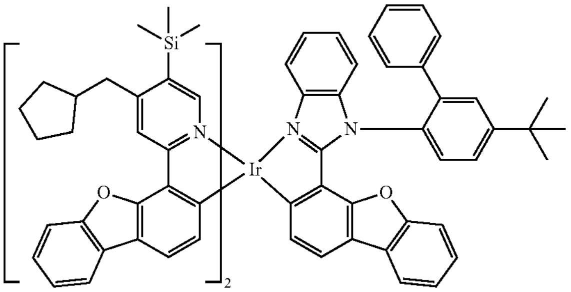
934
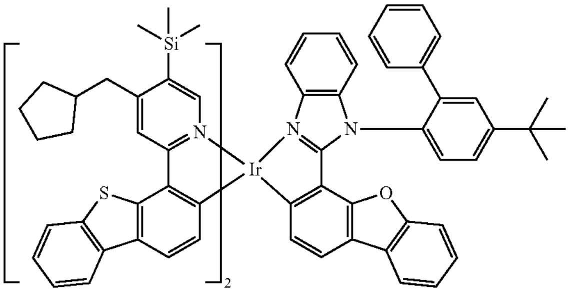
935
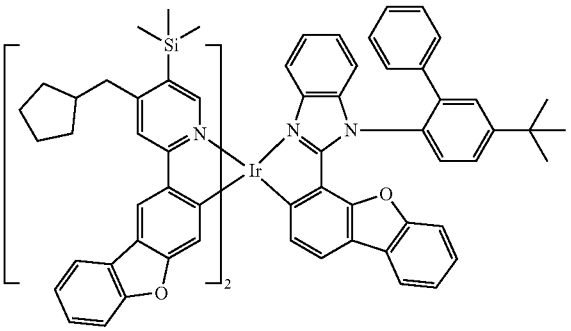

-continued
936
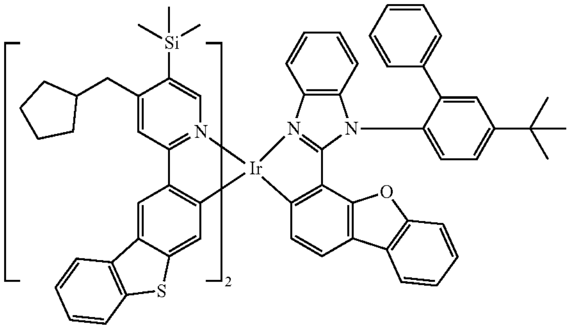
937
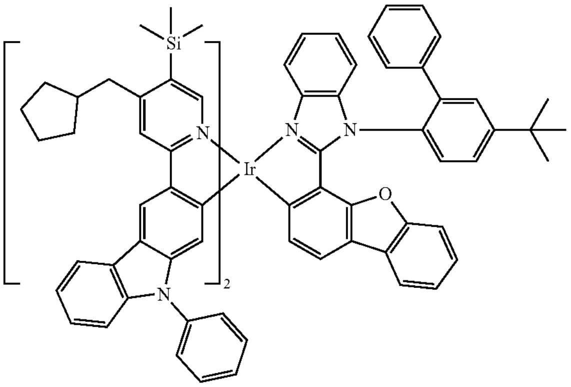
938
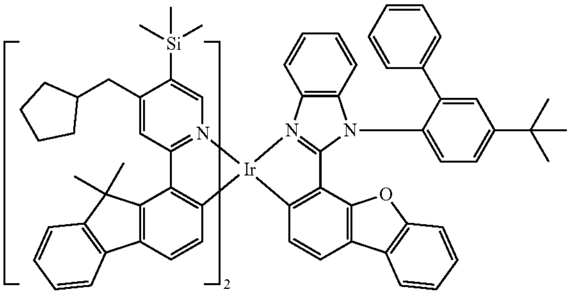
939
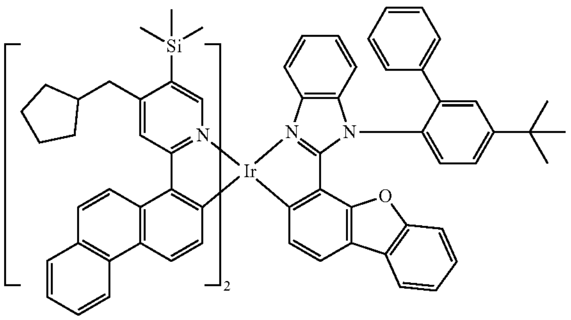
-continued
940
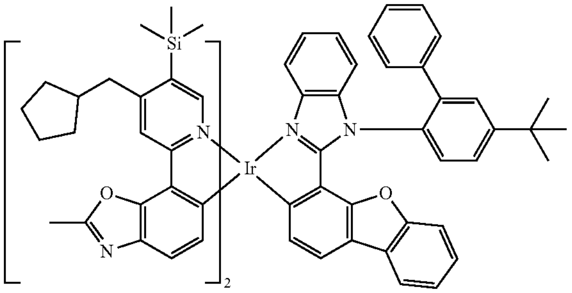
941
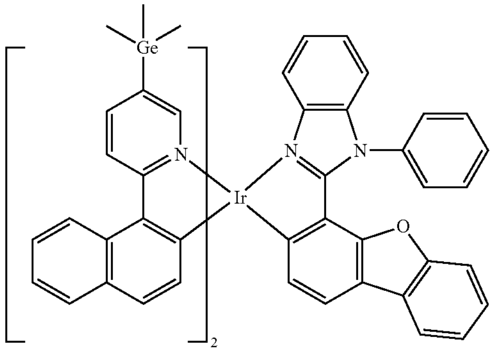
942
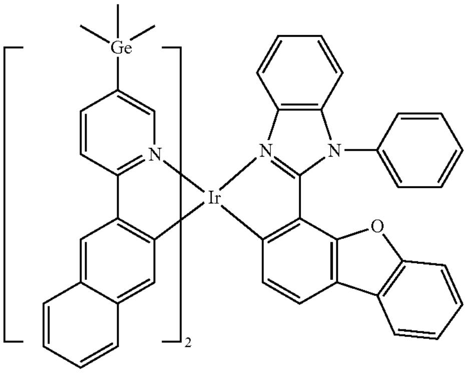
943
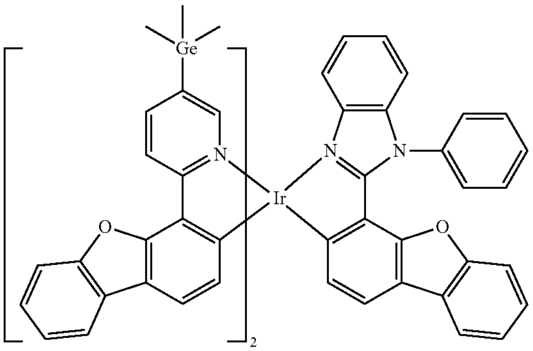

-continued
944
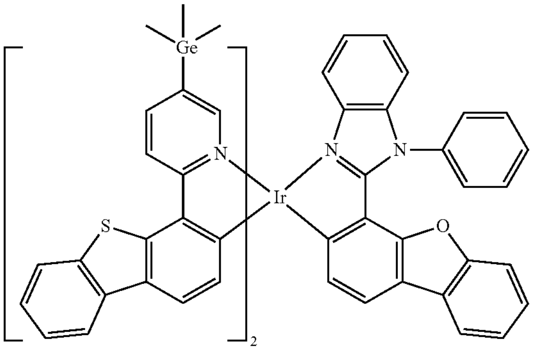
945
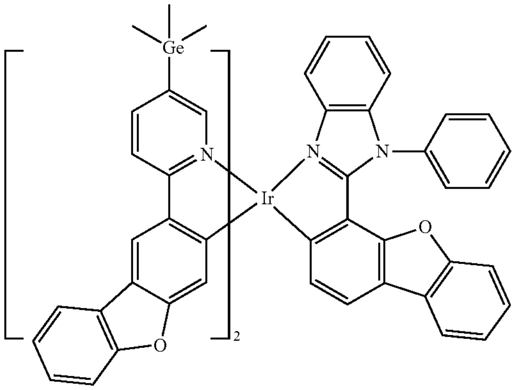
946
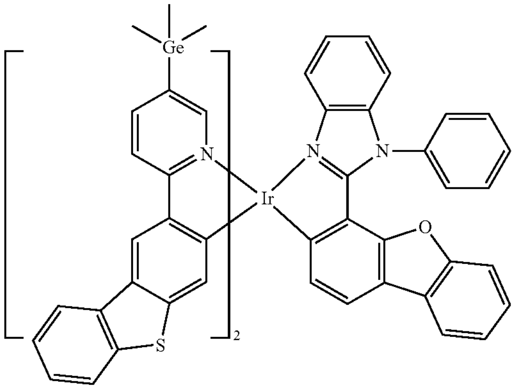
-continued
947
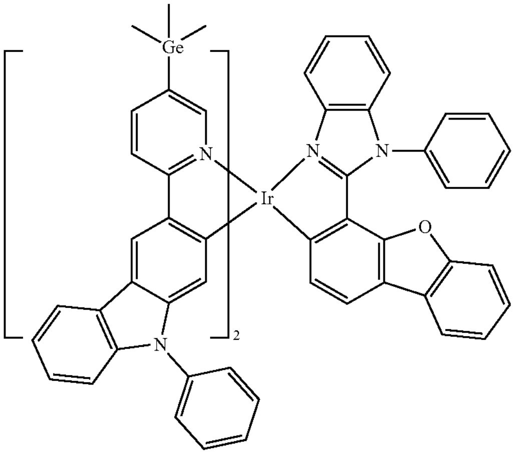
948
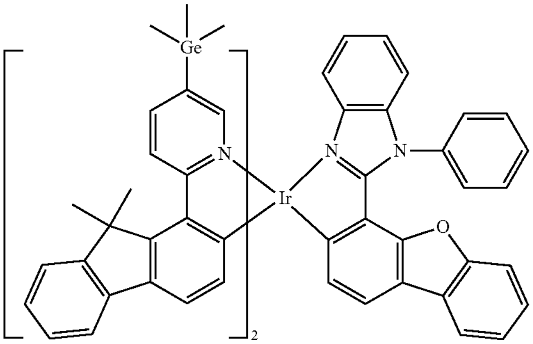
949
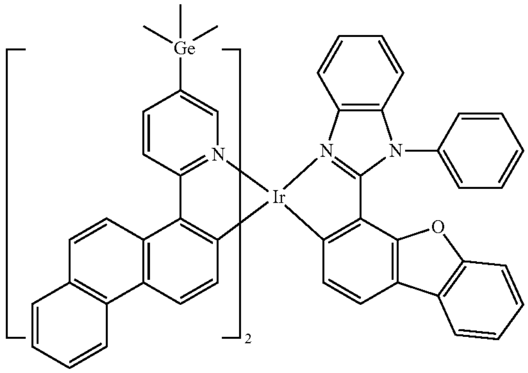
950
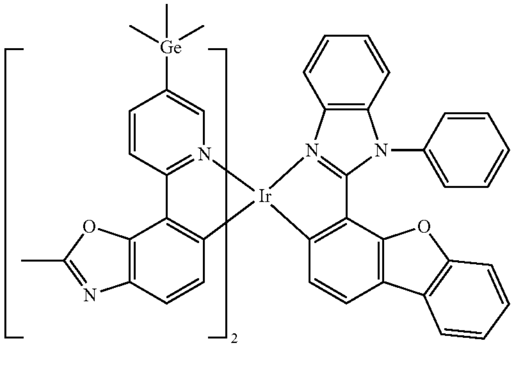

-continued
951
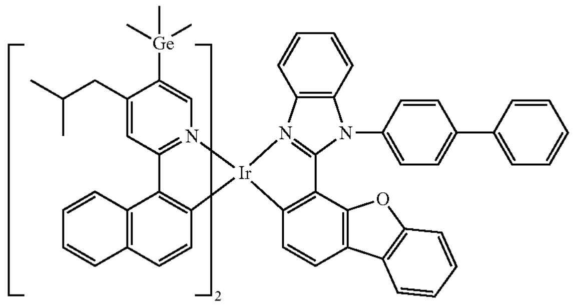
952
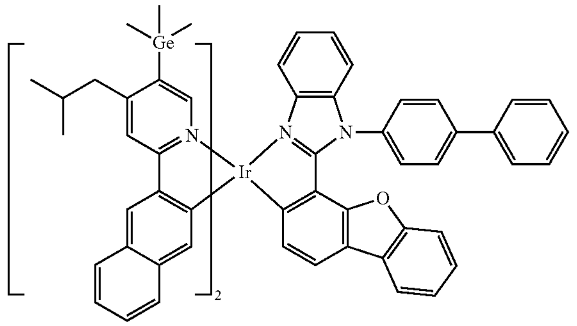
953
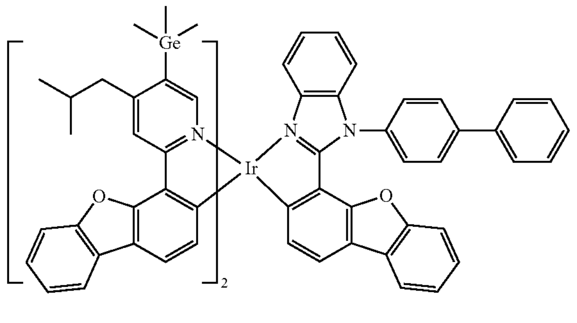
954
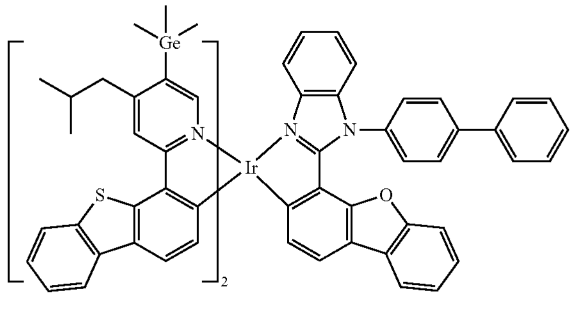
-continued
955
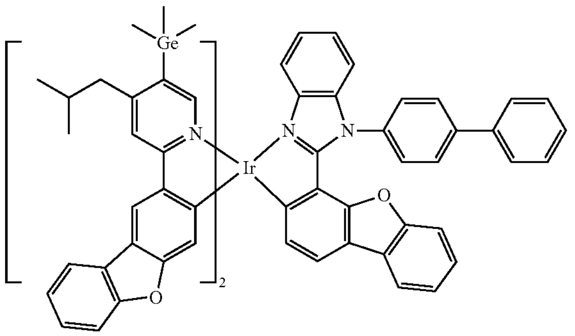
956
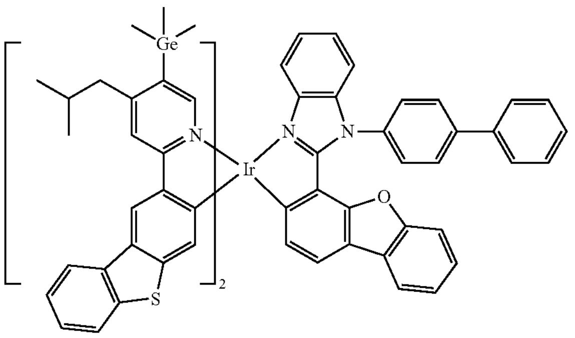
957
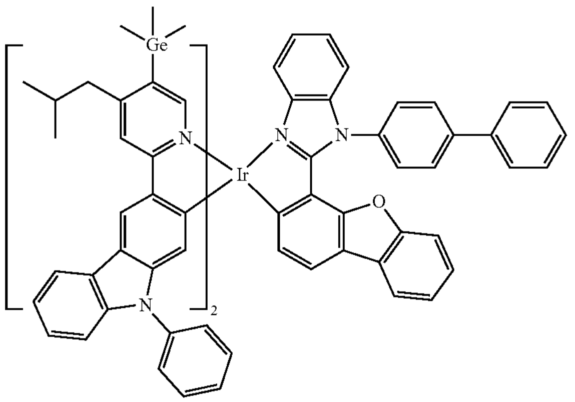
958
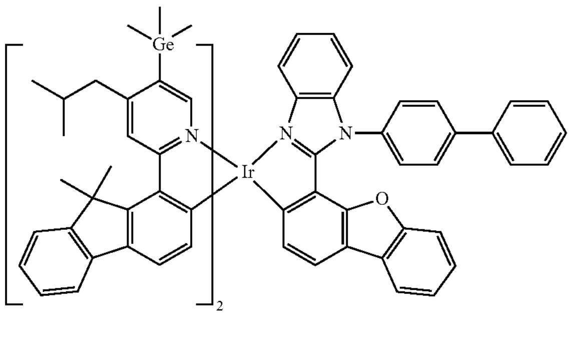

-continued
959
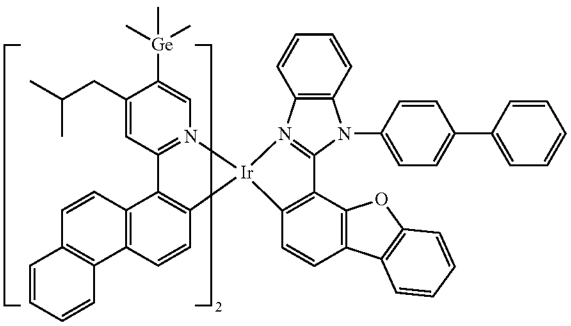
960
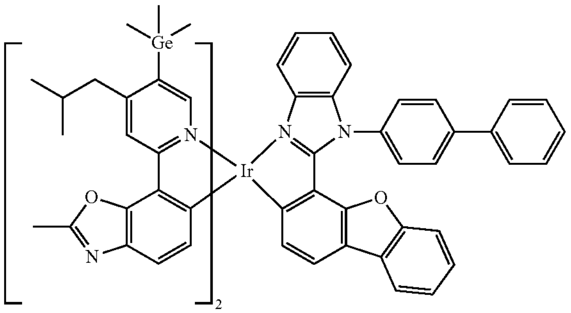
961
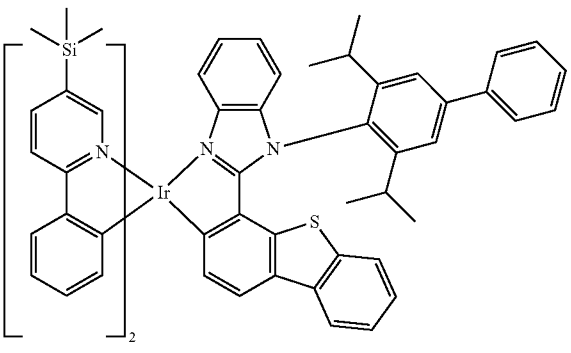
962
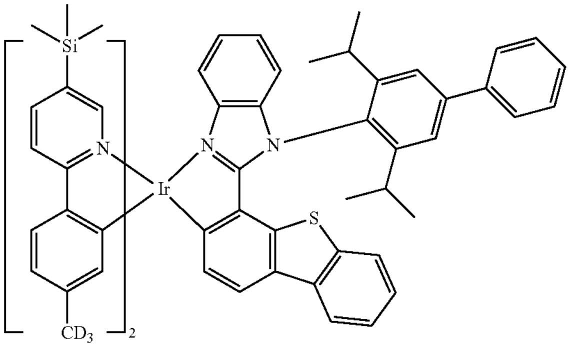
-continued
963
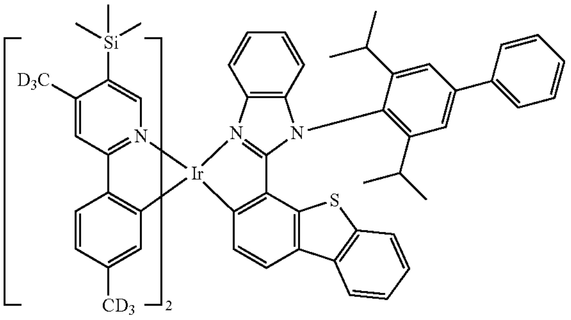
964
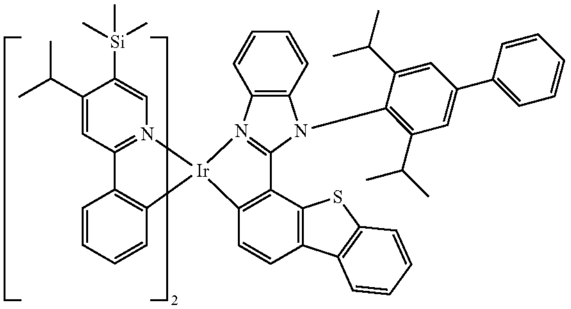
965
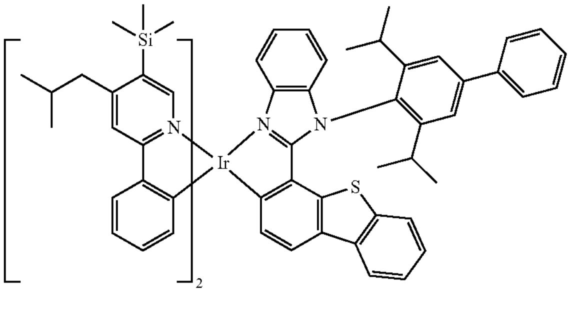
966
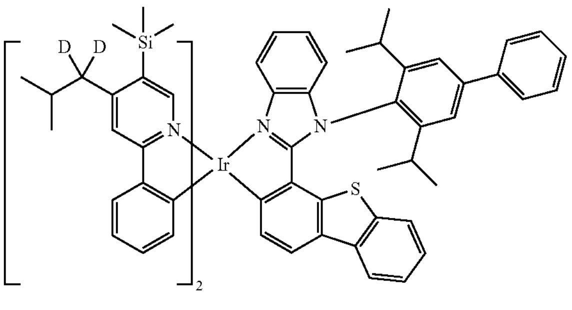

-continued
967
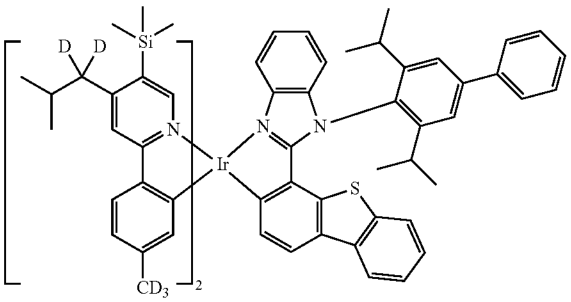
968
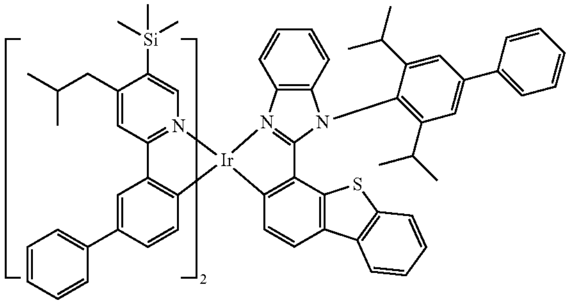
969
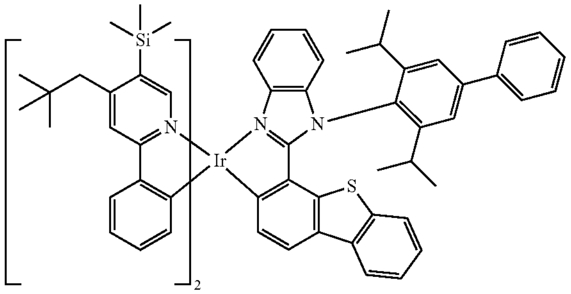
970
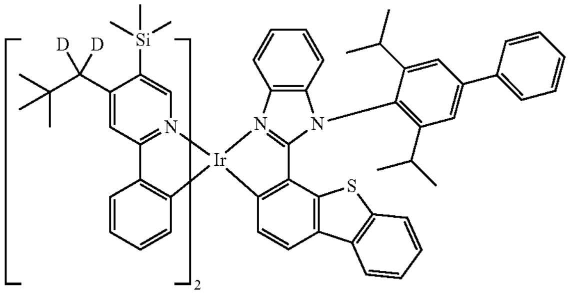
971
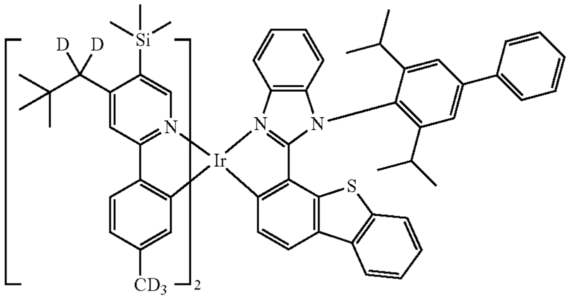
-continued
972
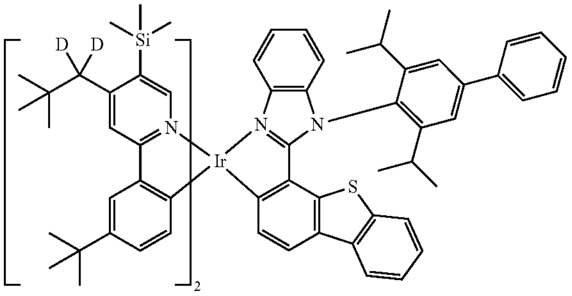
973
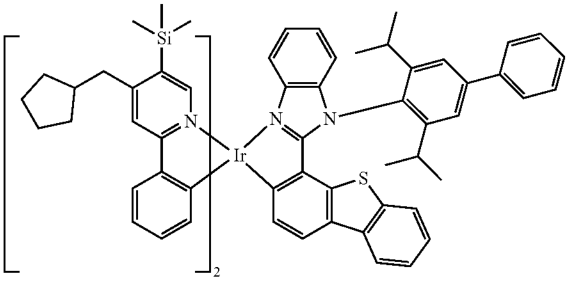
974
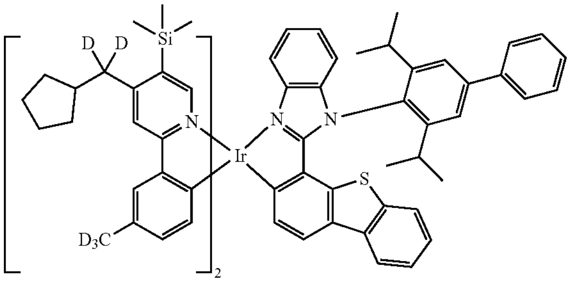
975
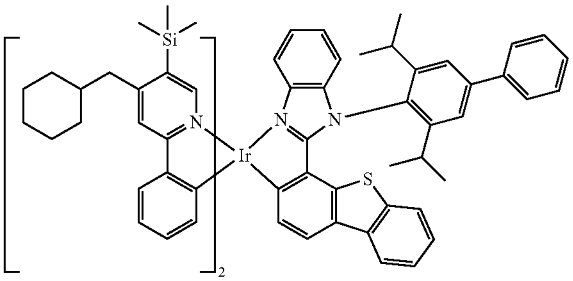
976
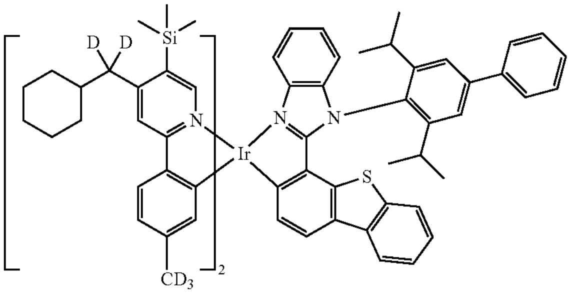

-continued
977
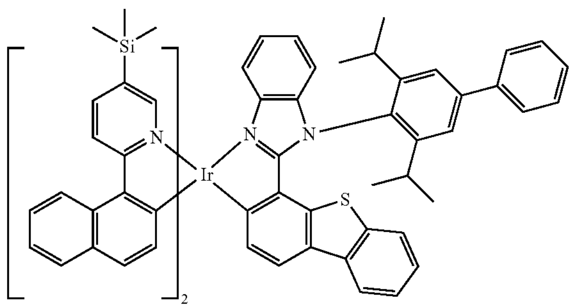
978
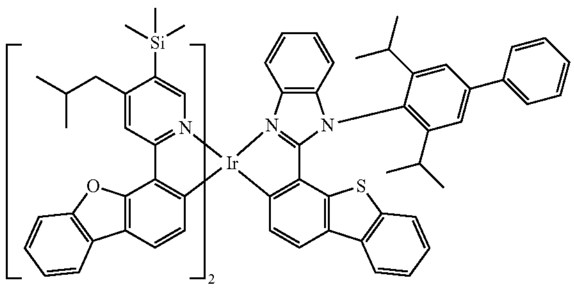
979
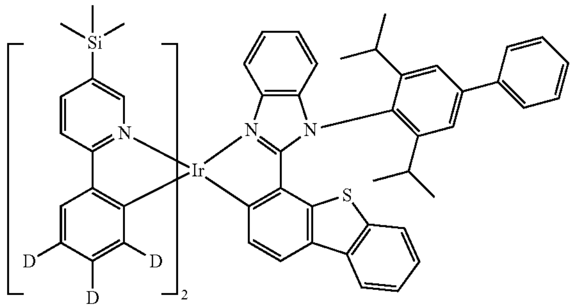
980
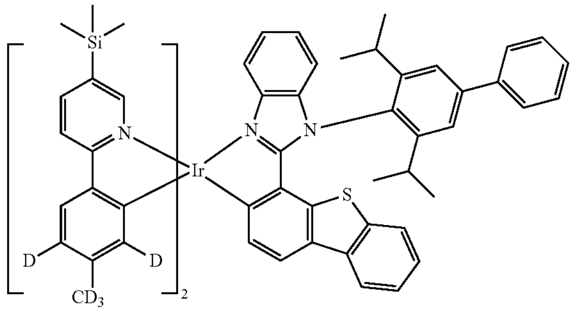
981
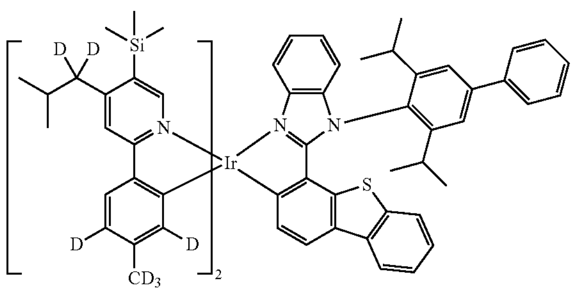
-continued
982
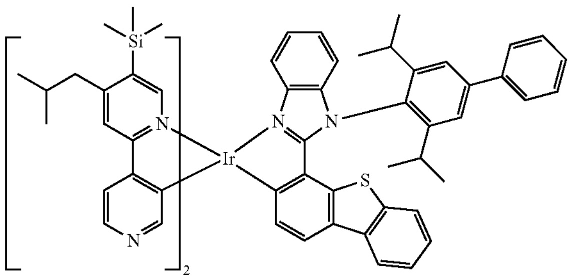
983
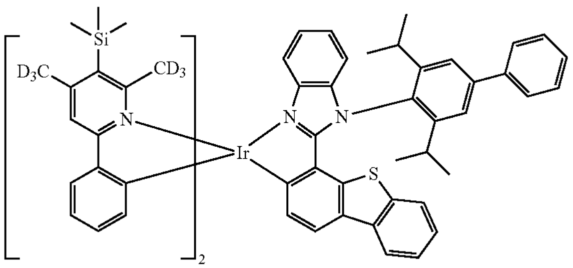
984
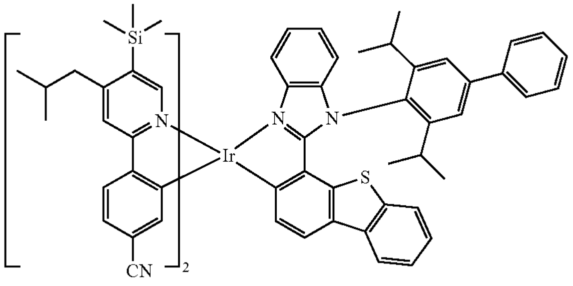
985
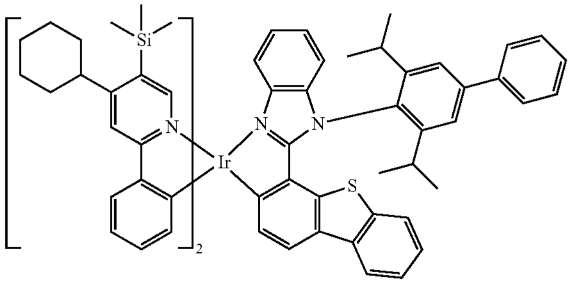
986
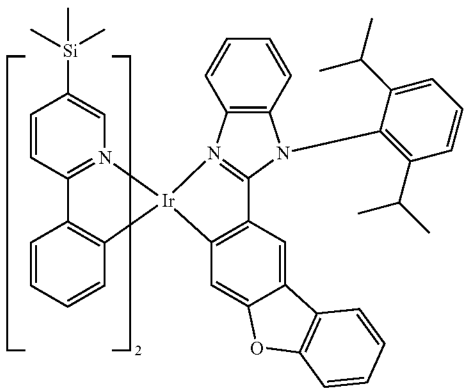

-continued
987
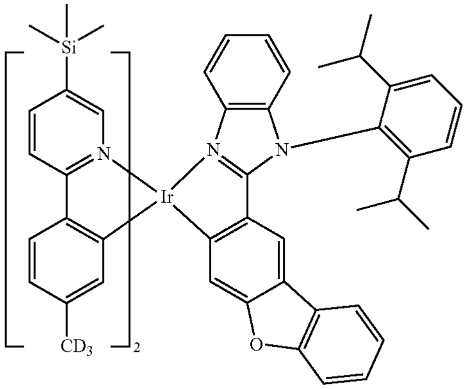
988
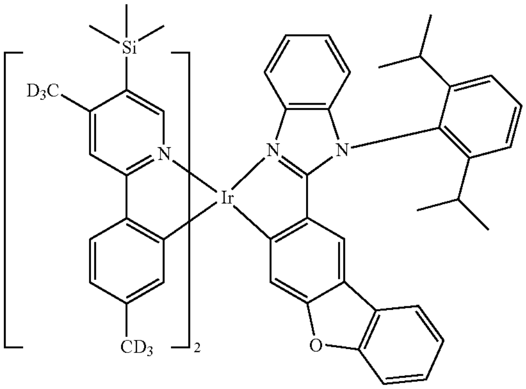
989
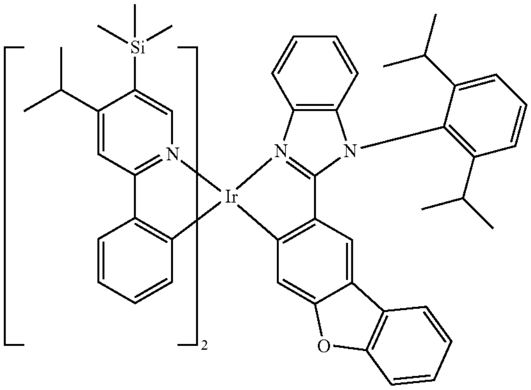
990
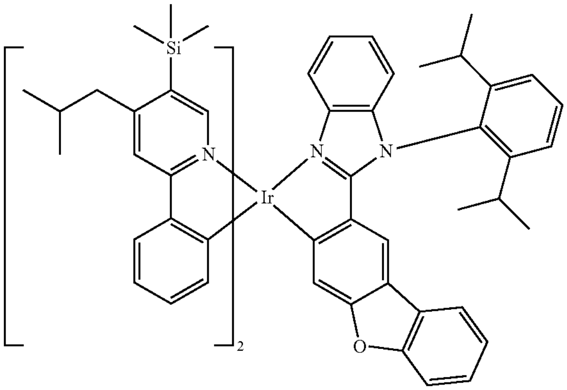
-continued
991
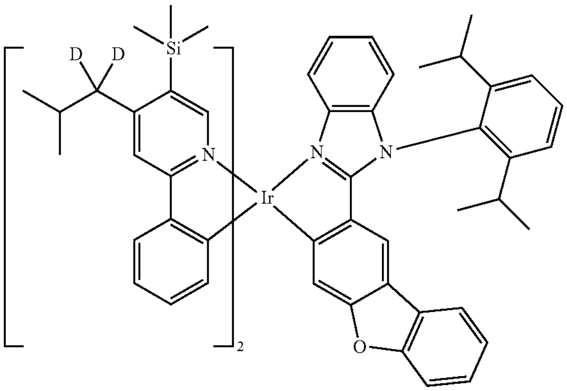
992
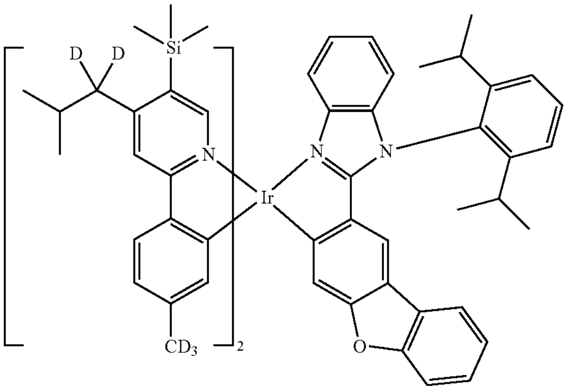
993
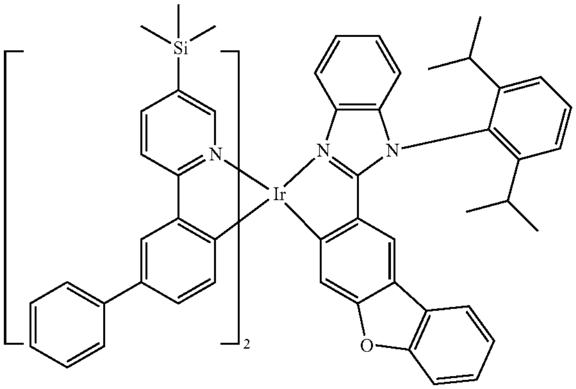
994
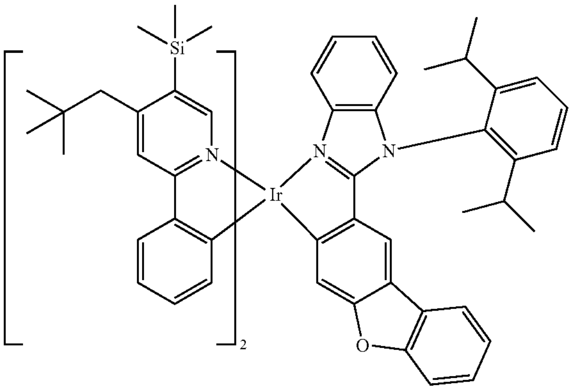

-continued
995
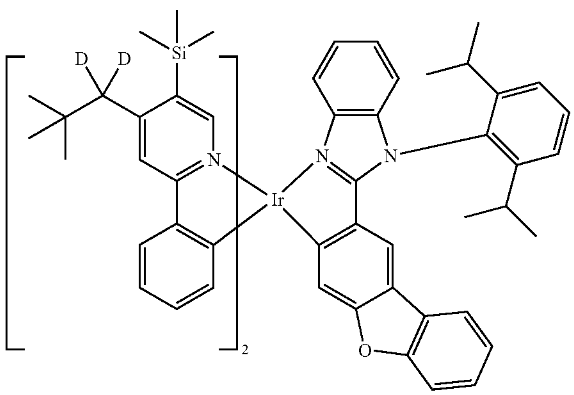
996
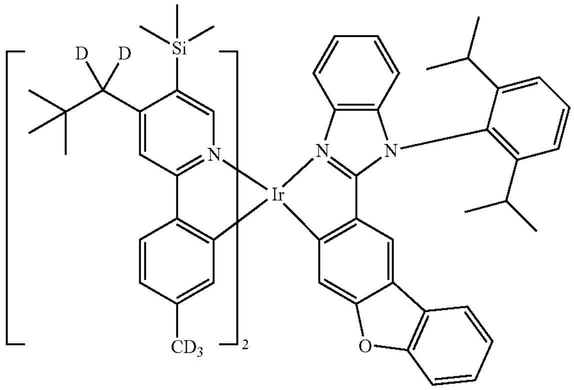
997
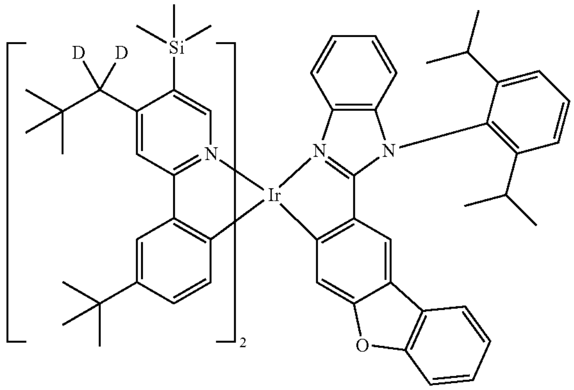
998
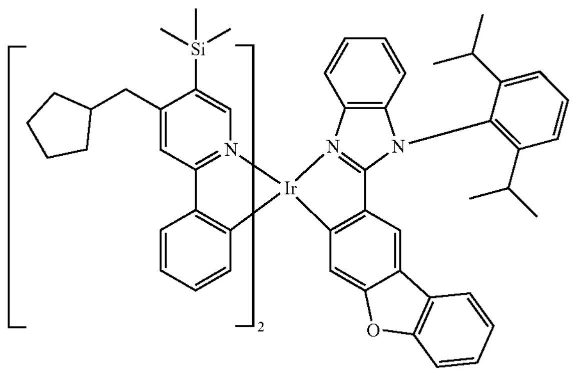
-continued
999
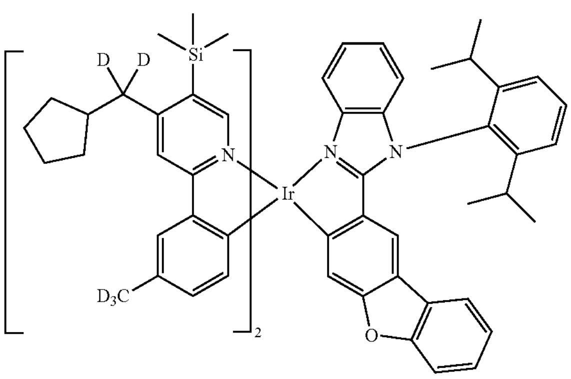
1000
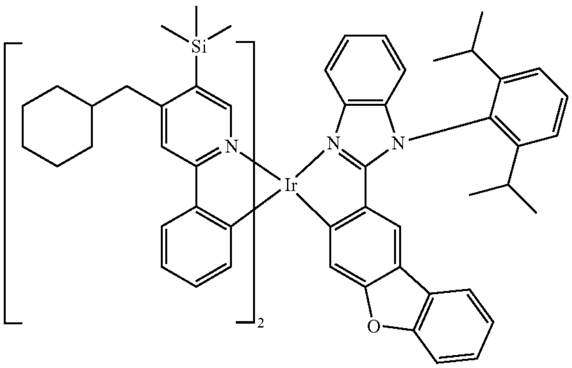
1001
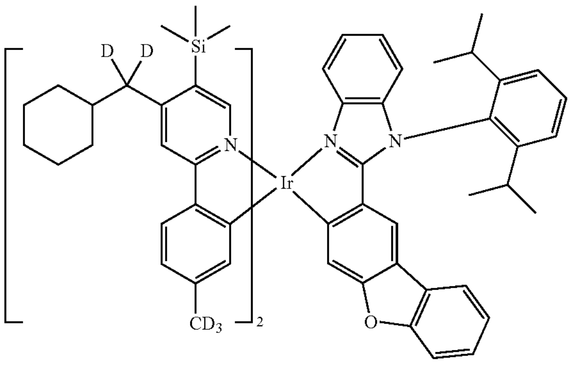
1002
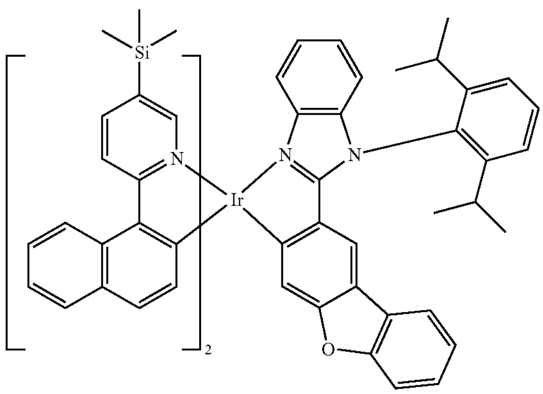

-continued
1003
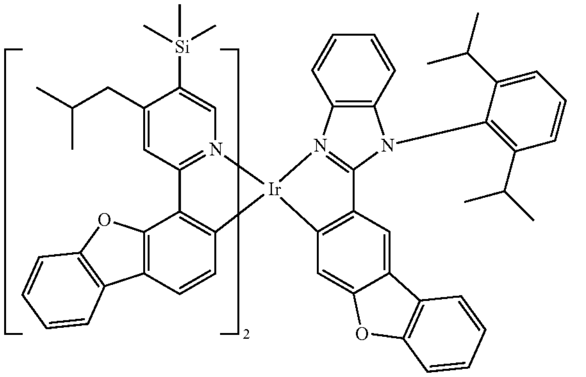
1004
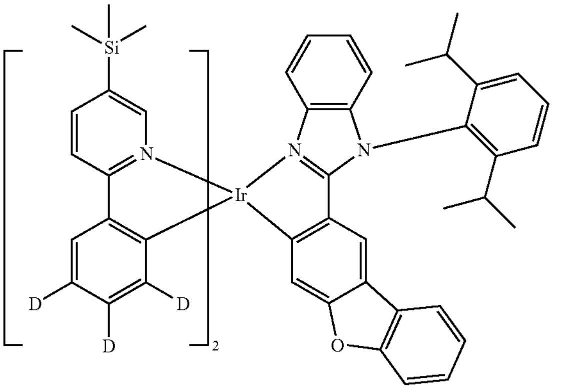
1005
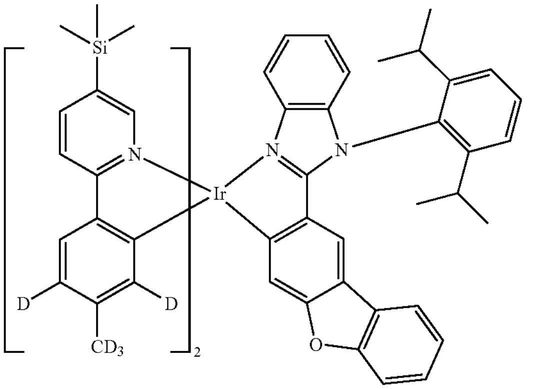
1006
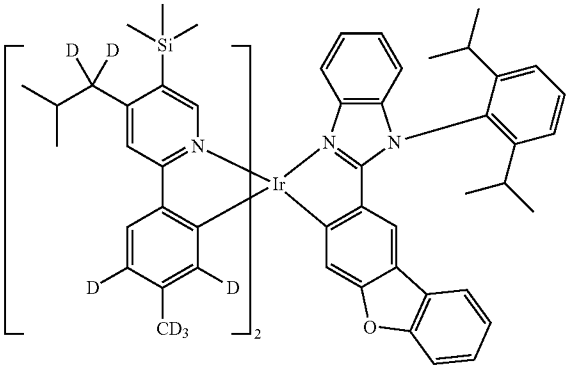
-continued
1007
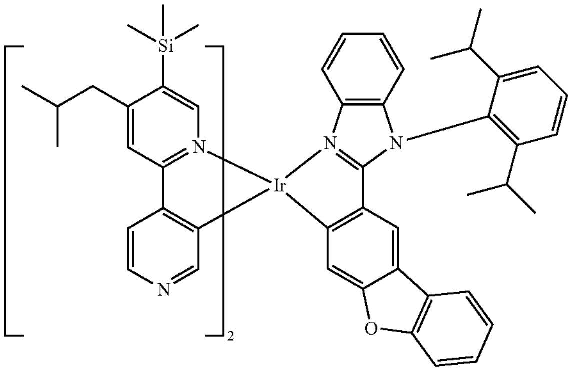
1008
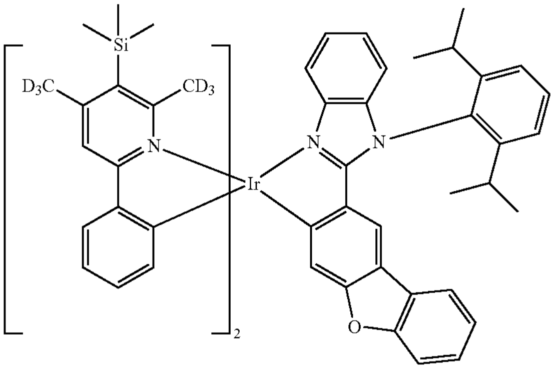
1009
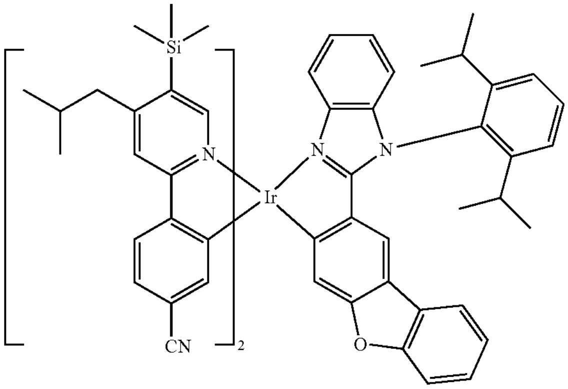
1010
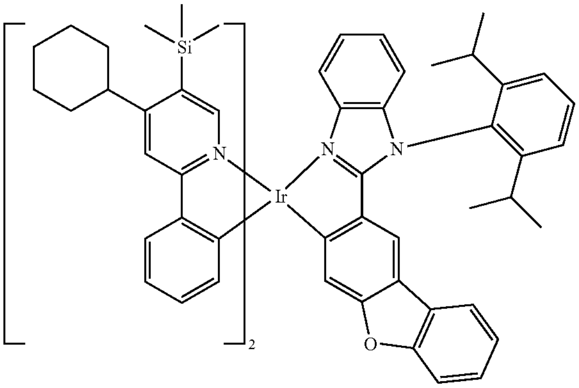

-continued
1011
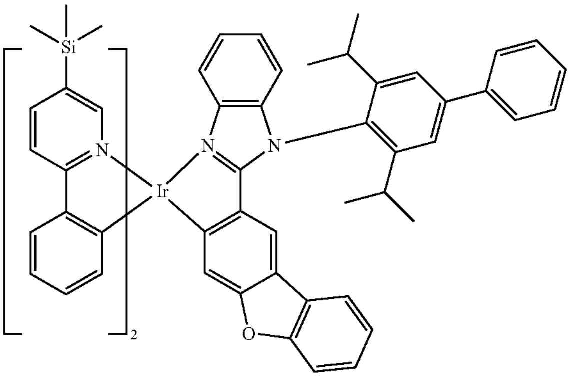
1012
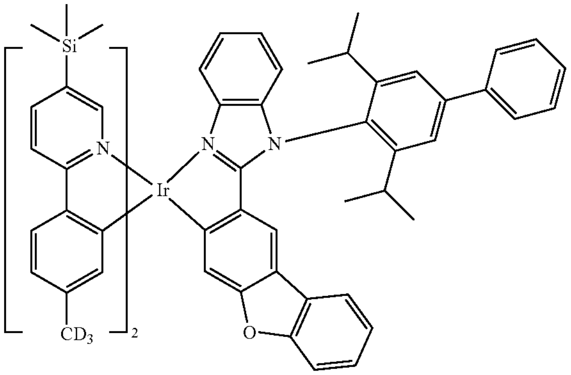
1013
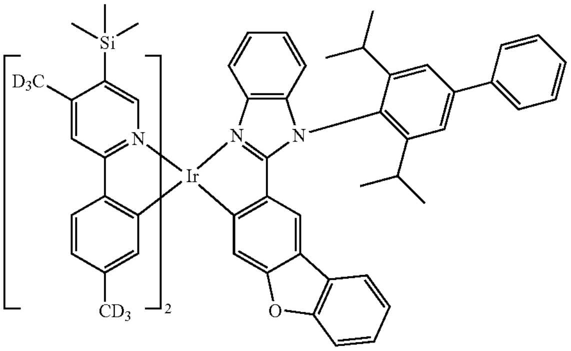
1014
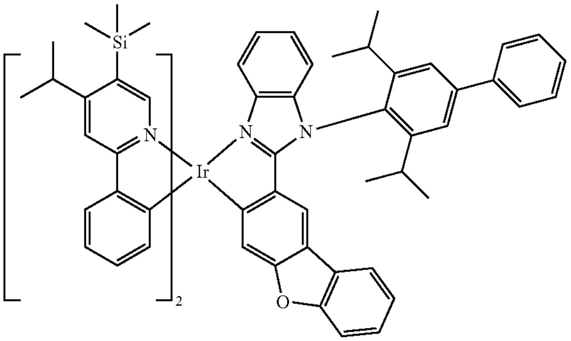
-continued
1015
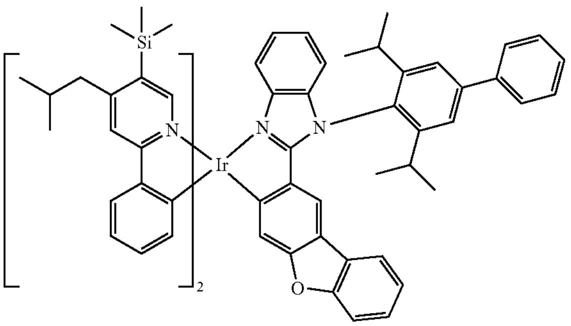
1016
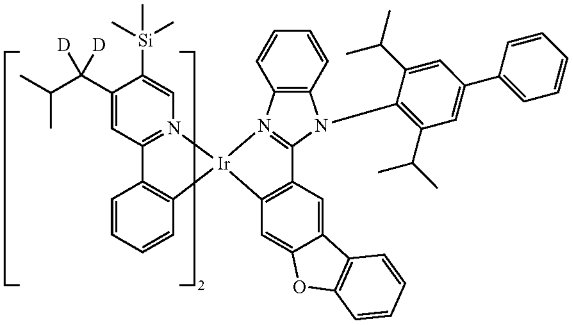
1017
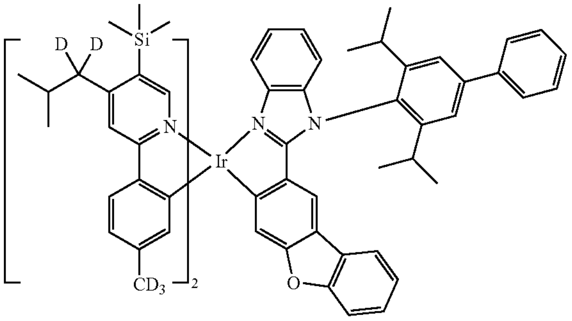
1018
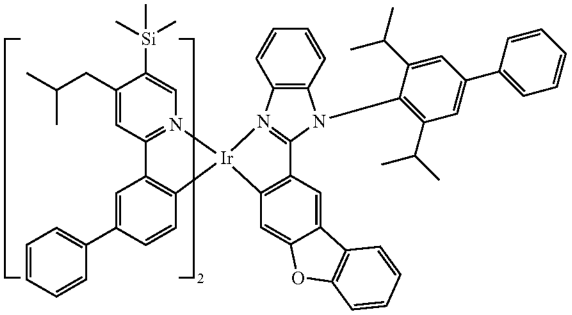

-continued
1019
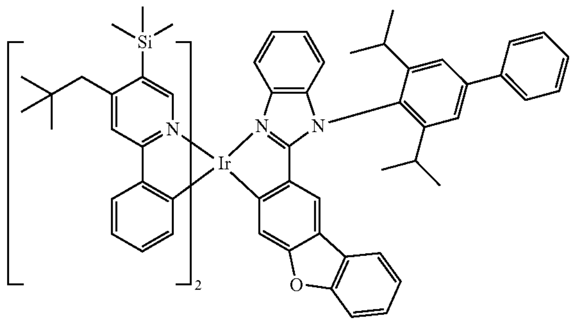
1020
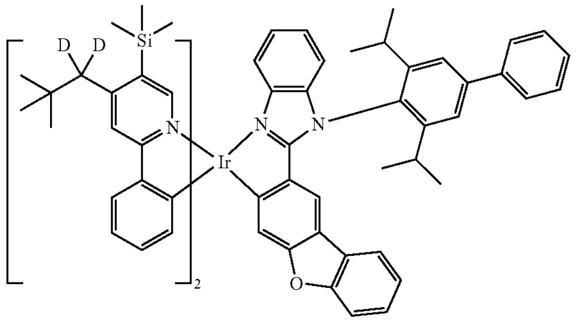
1021
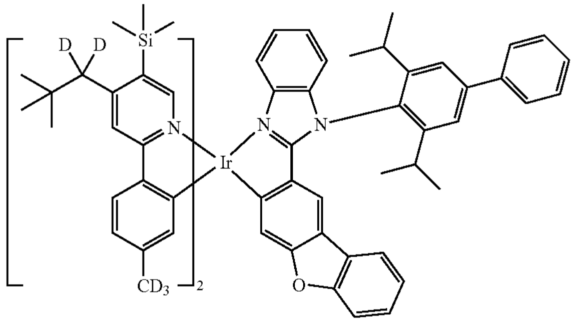
1022
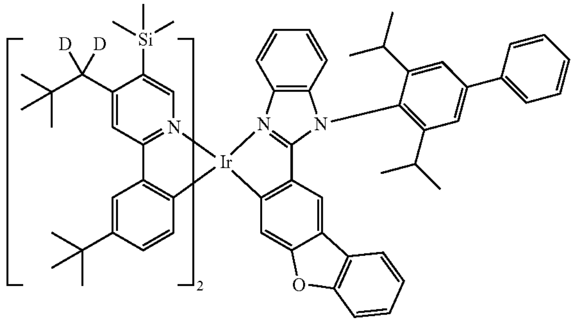
-continued
1023
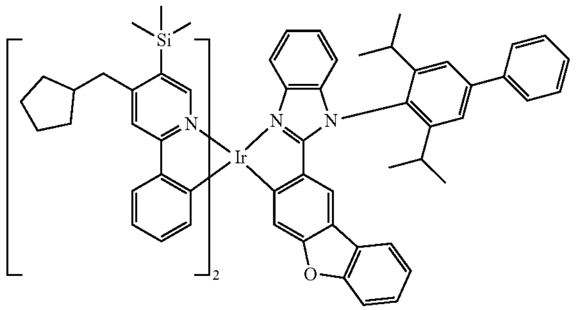
1024
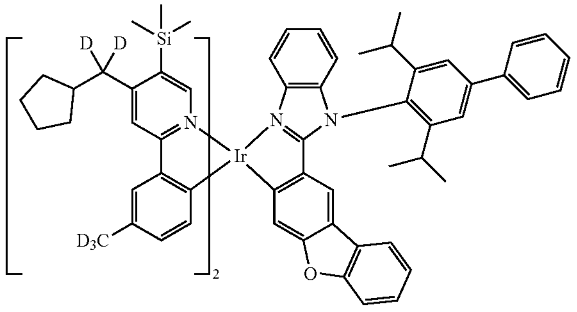
1025
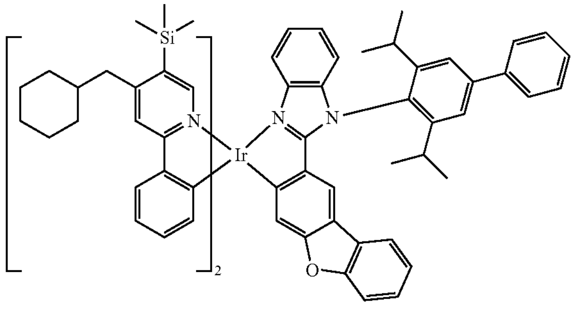
1026
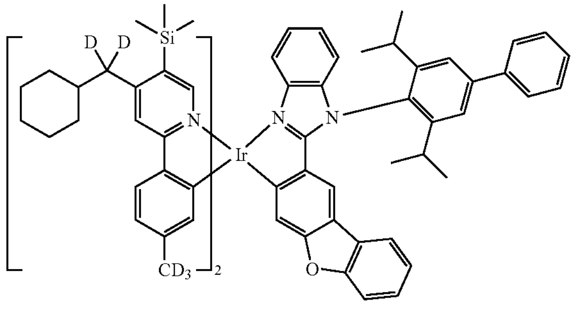

-continued
1027
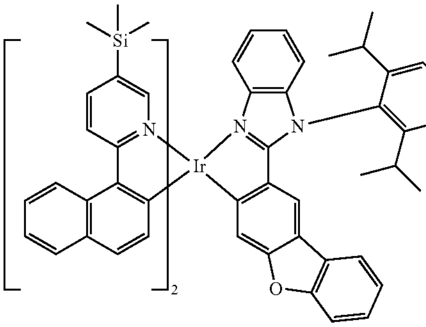
1028
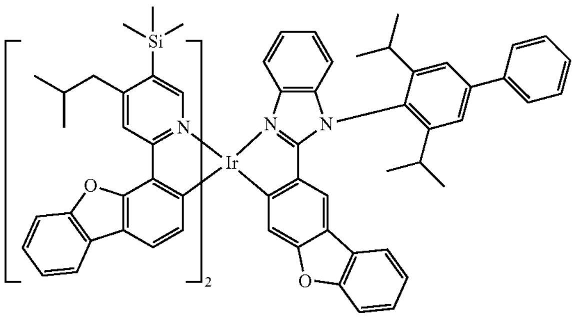
1029
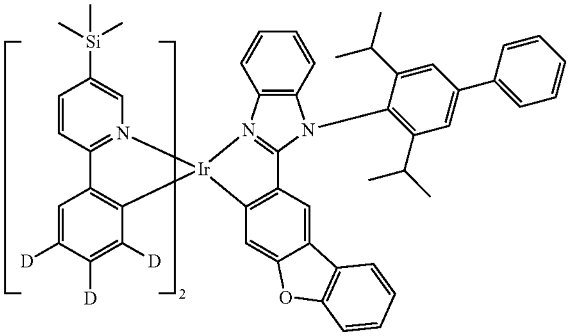
1030
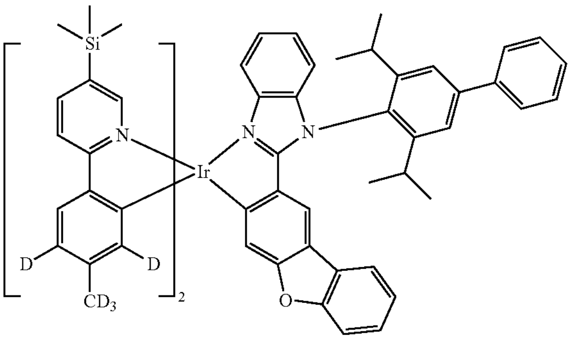
-continued
1031
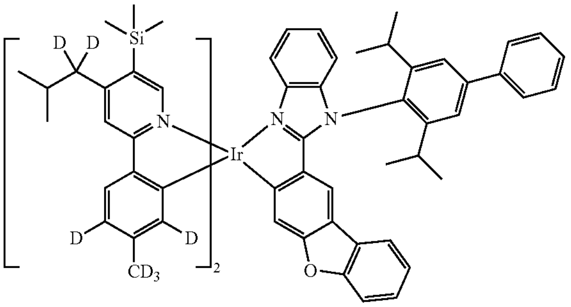
1032
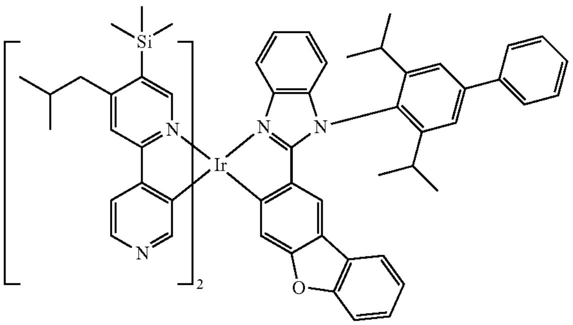
1033
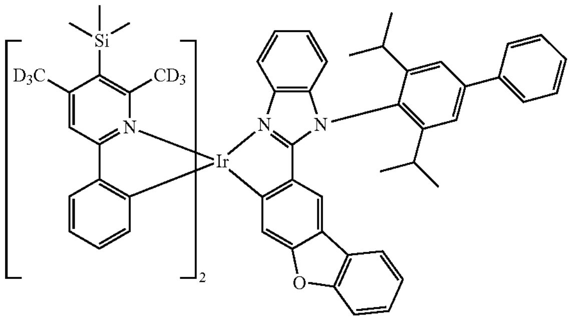
1034
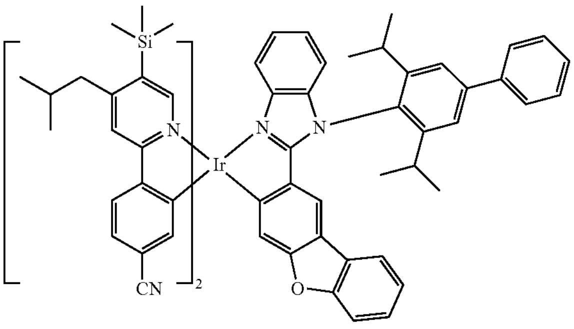

-continued
1035
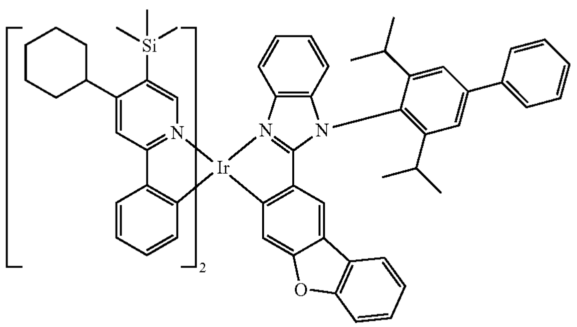
1036
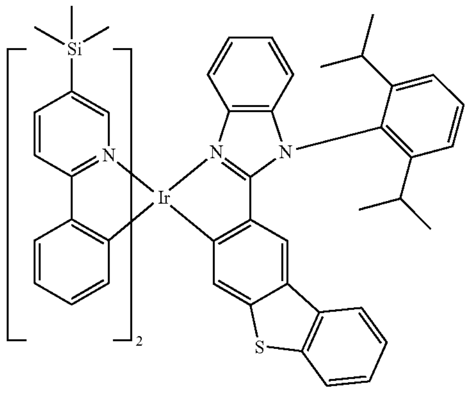
1037
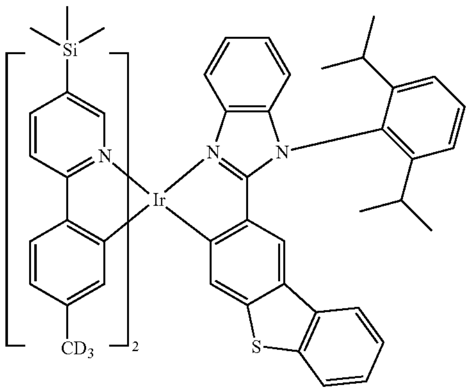
1038
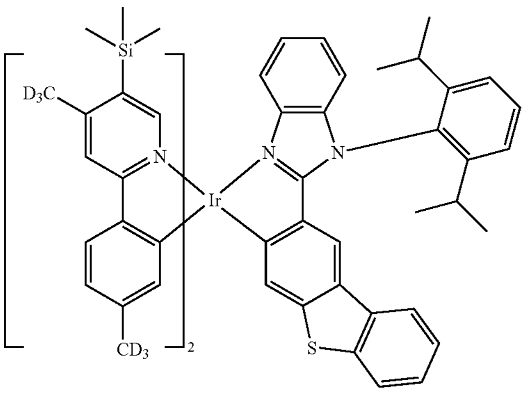
-continued
1039
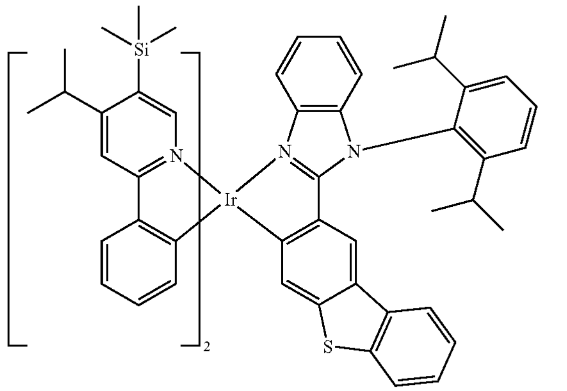
1040
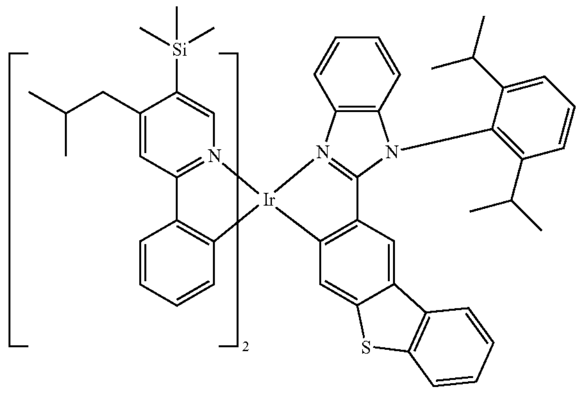
1041
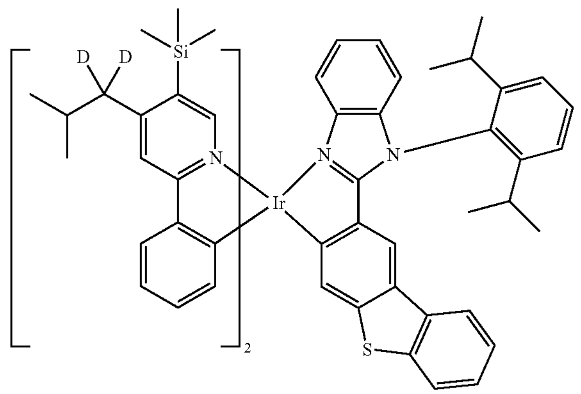
1042
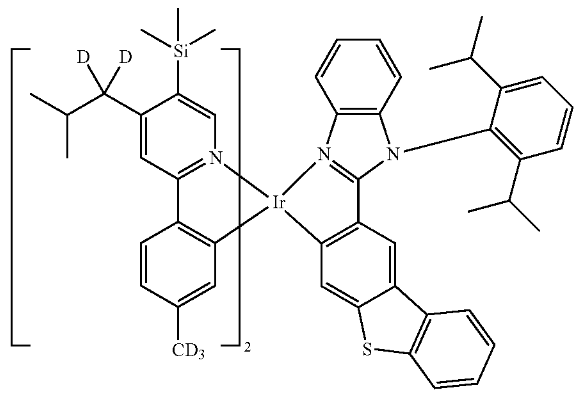

-continued
1043
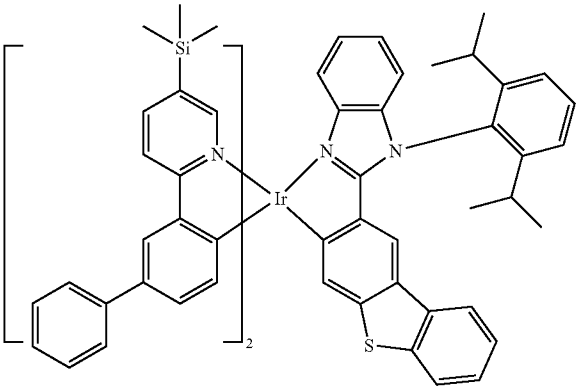
1044
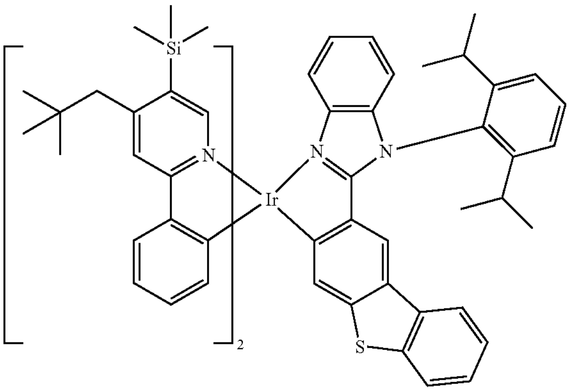
1045
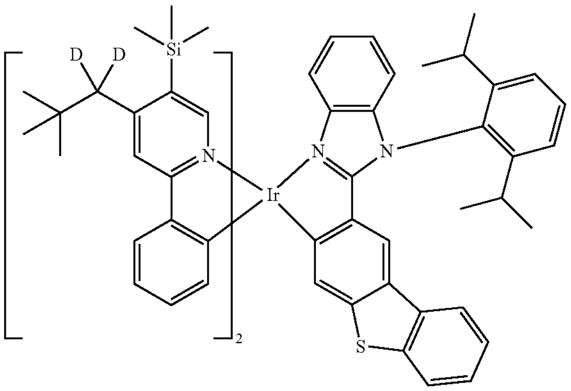
1046
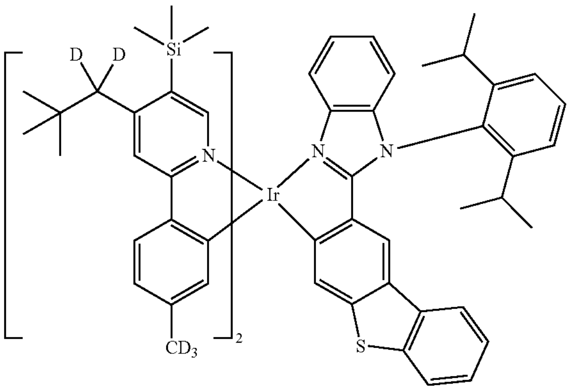
-continued
1047
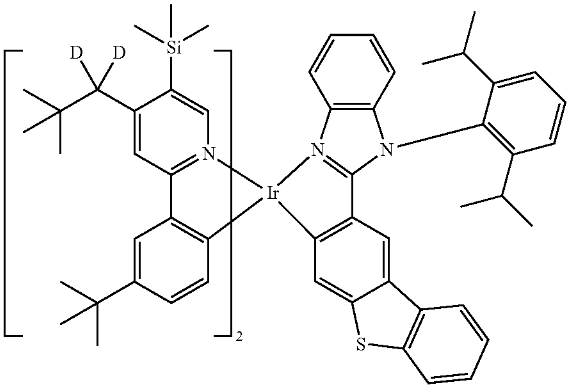
1048
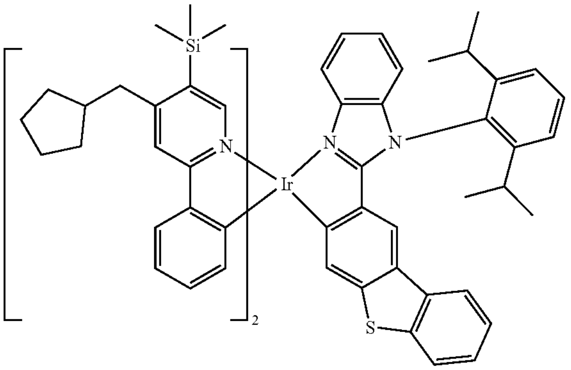
1049
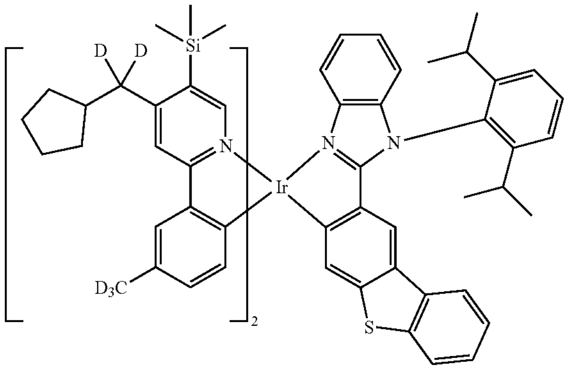
1050
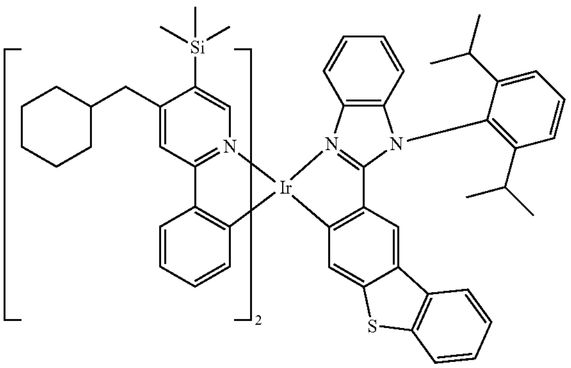

-continued
1051
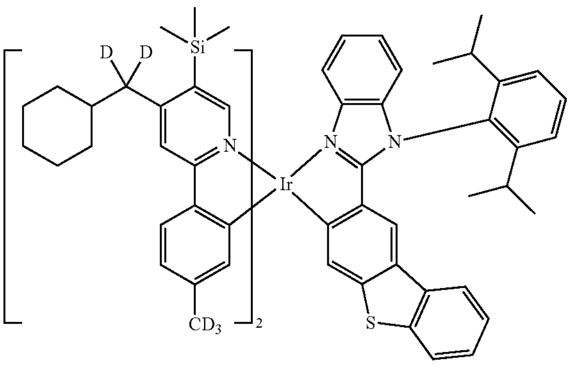
1052
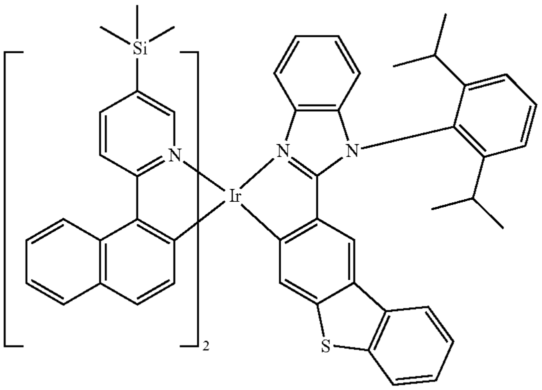
1053
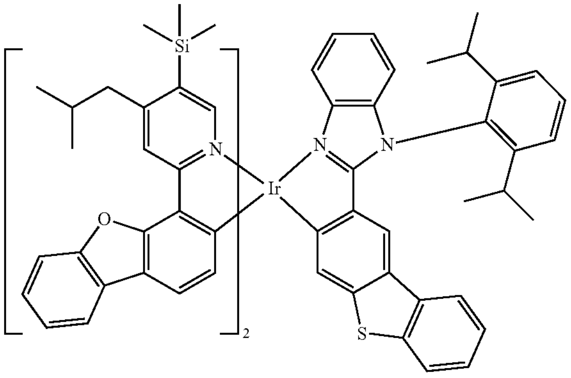
1054
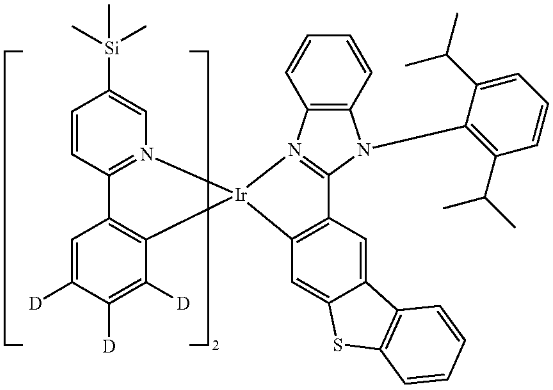
-continued
1055
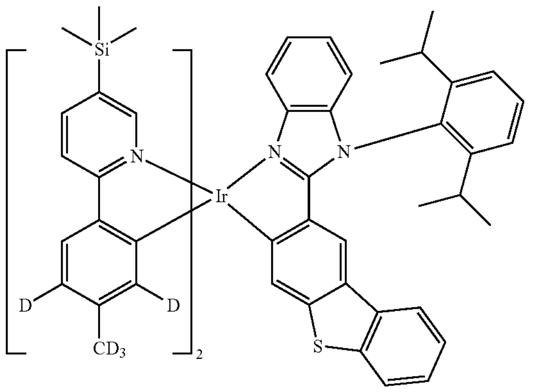
1056
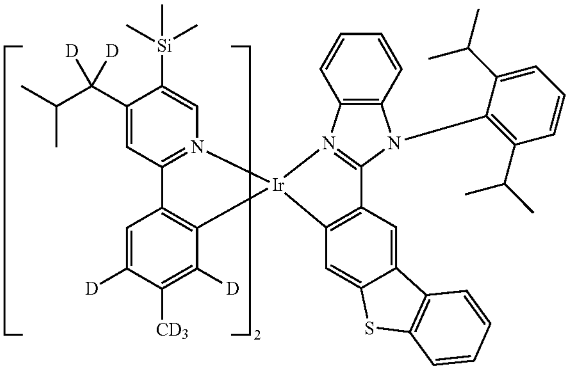
1057
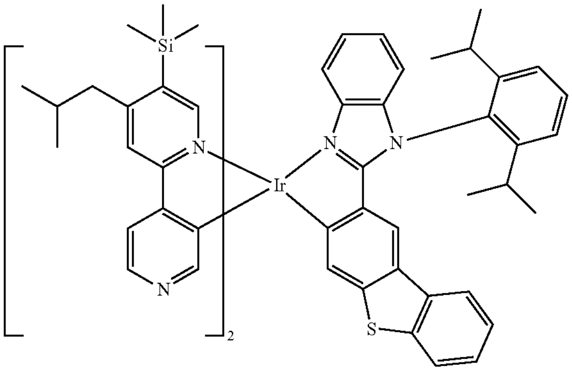
1058
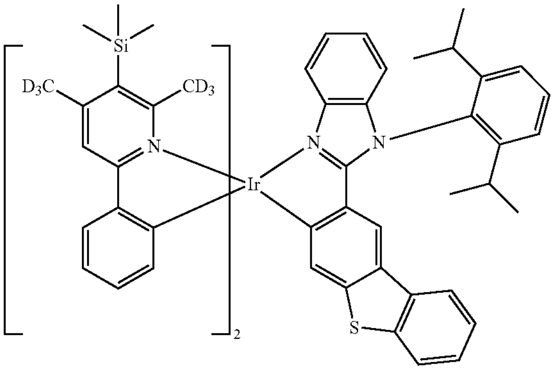

-continued
1059
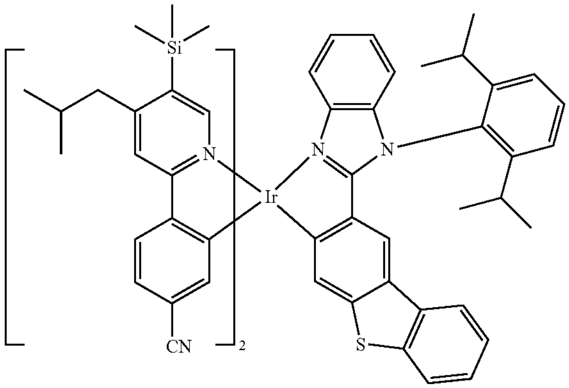
1060
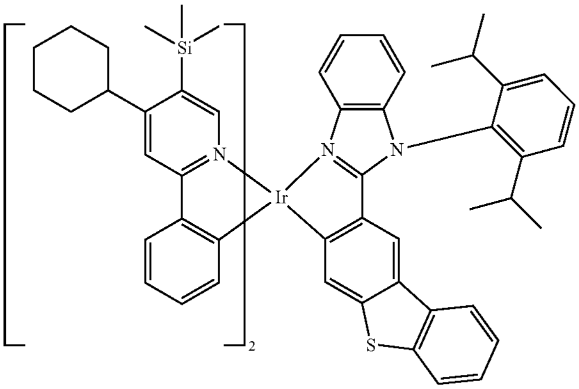
1061
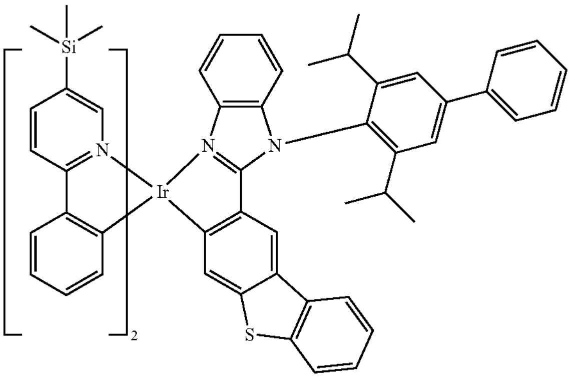
1062
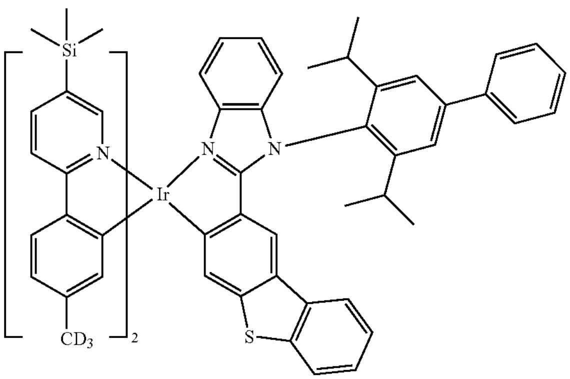
-continued
1063
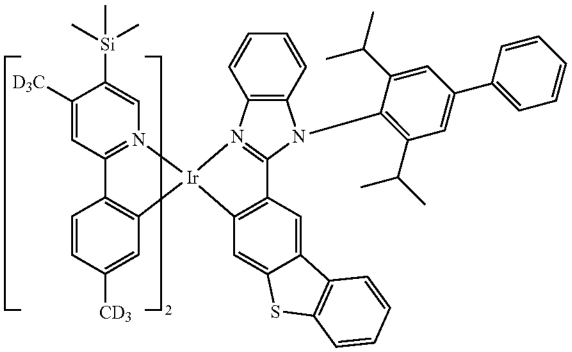
1064
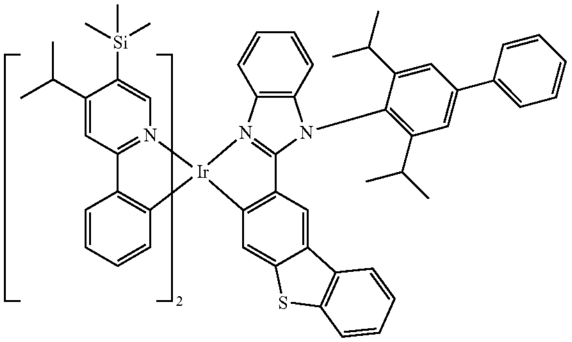
1065
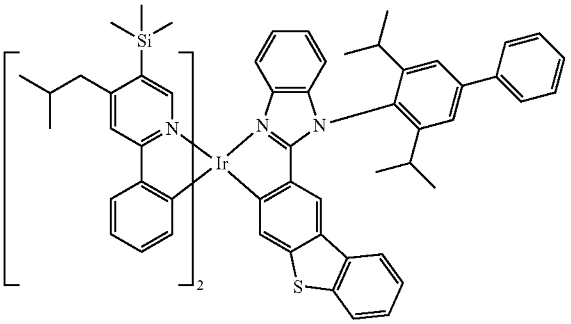
1066
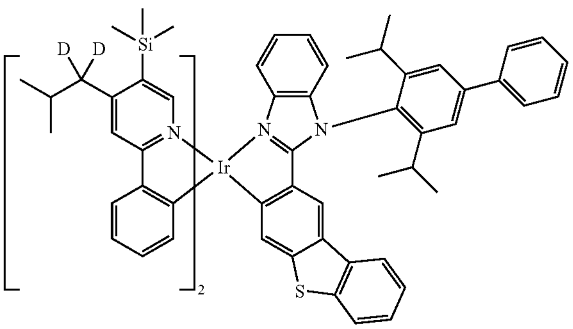

-continued
1067
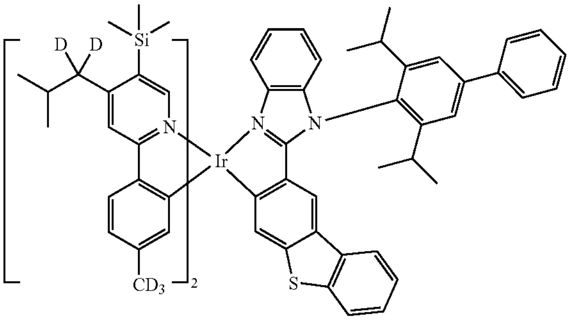
1068
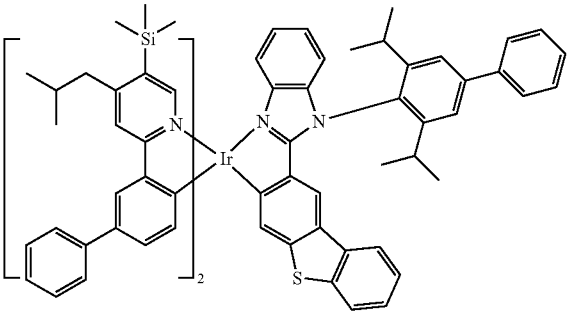
1069
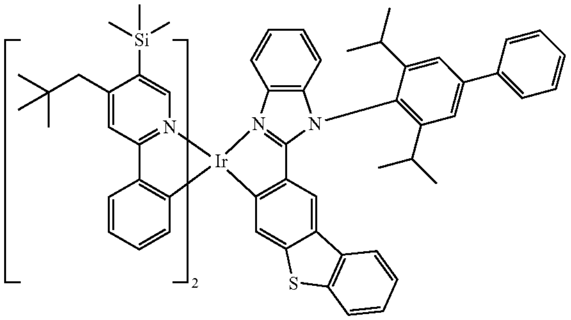
1070
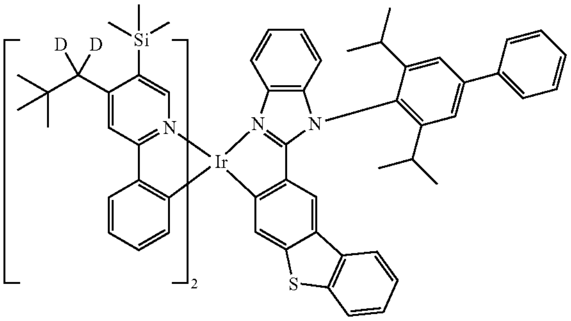
-continued
1071
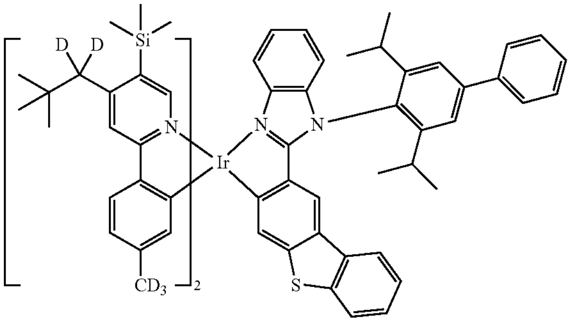
1072
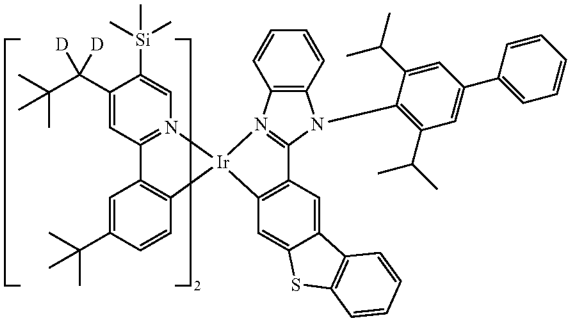
1073
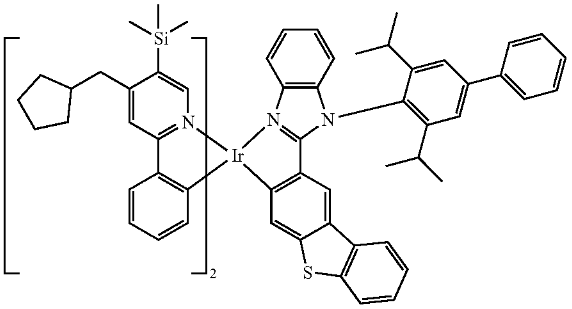
1074
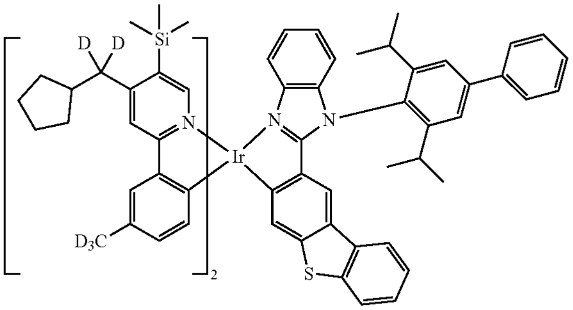

1075
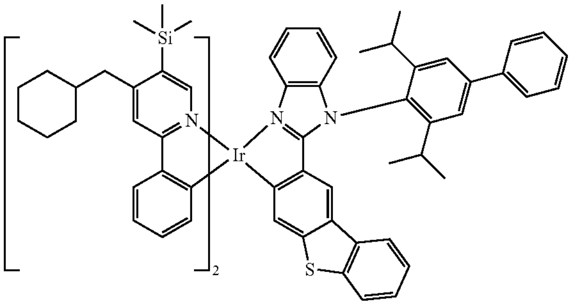
1076
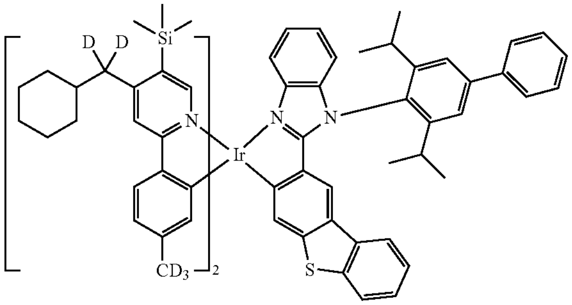
1077
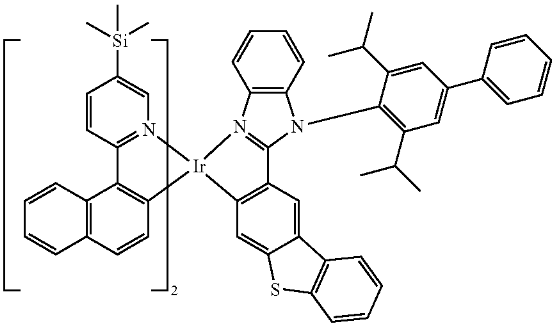
1078
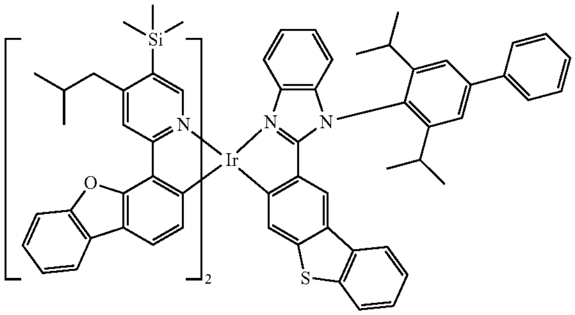
1079
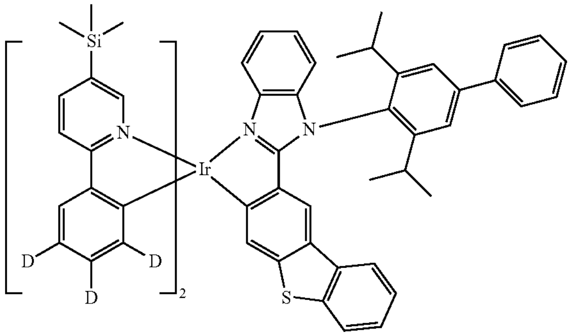
1080
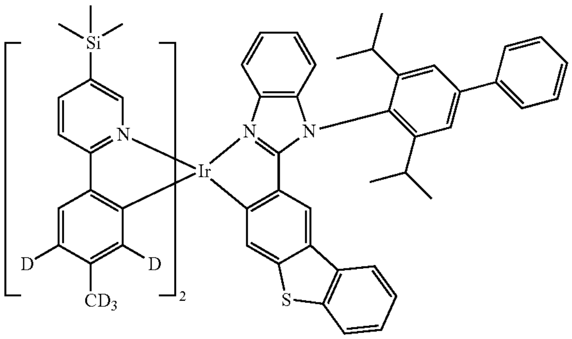
1081
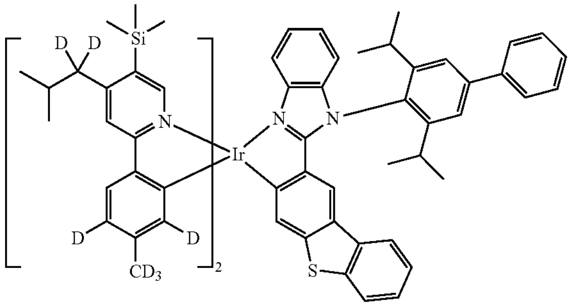
1082
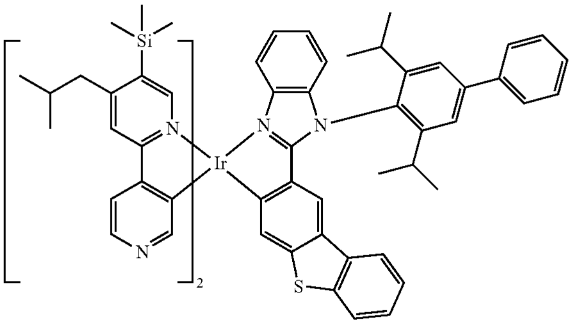

-continued
1083
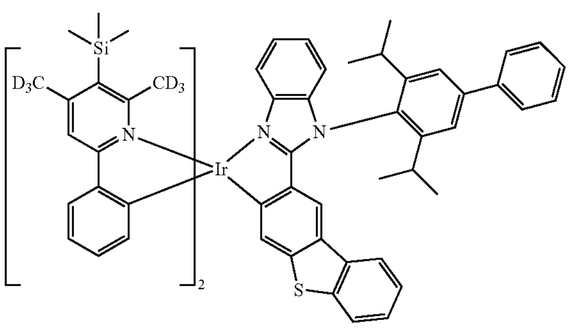
1084
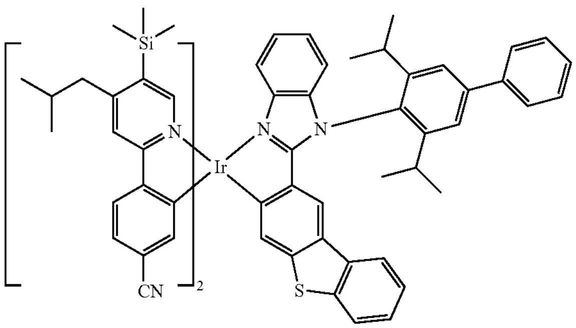
1085
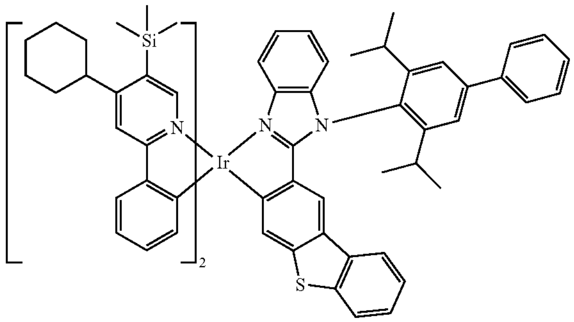
1086
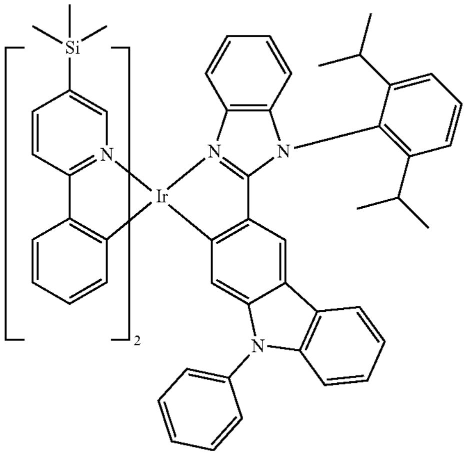
-continued
1087
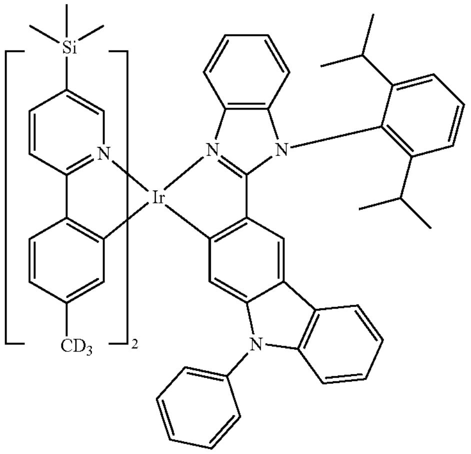
1088
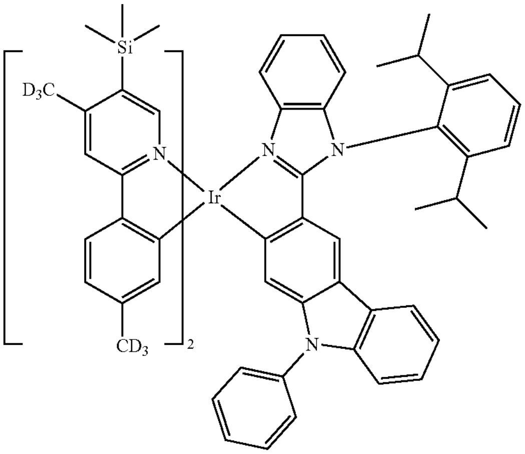
1089
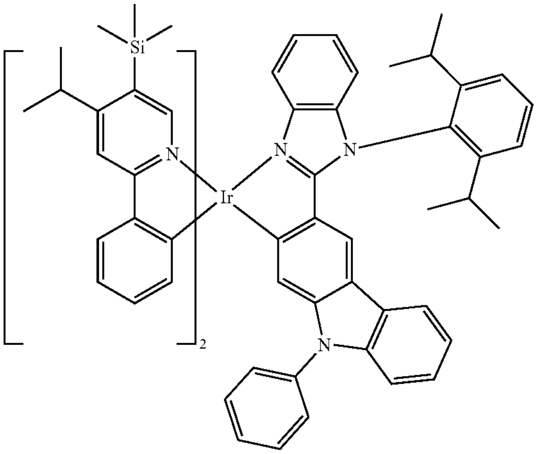

-continued
1090
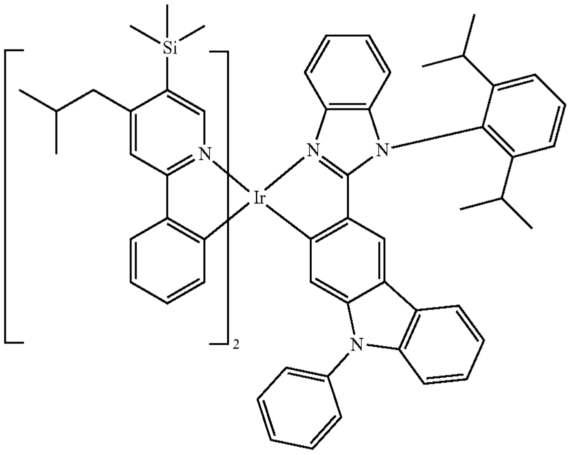
1091
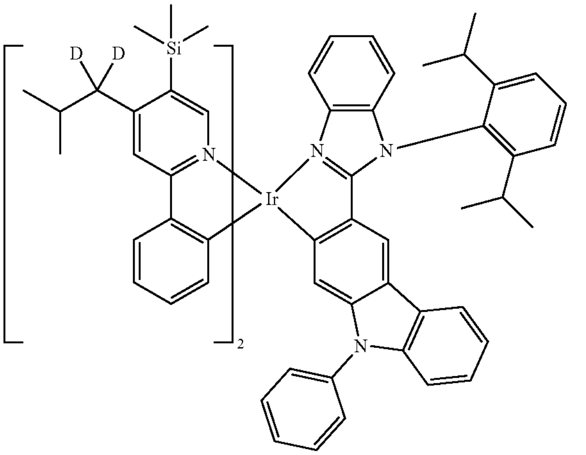
1092
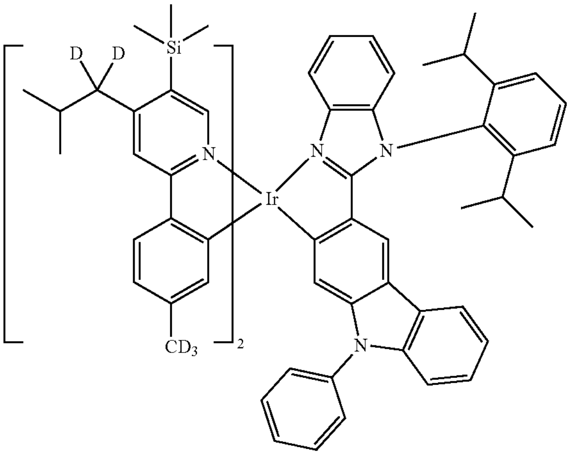
-continued
1093
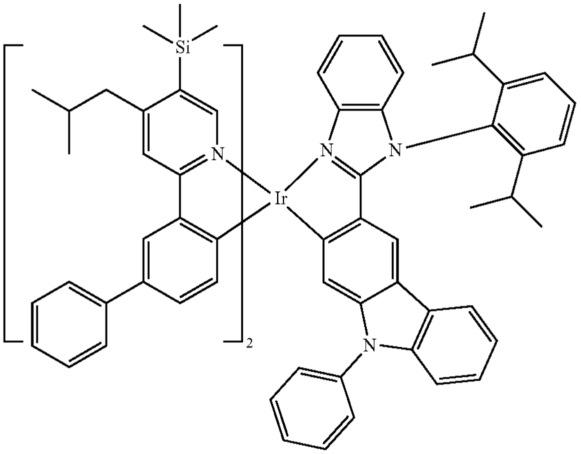
1094
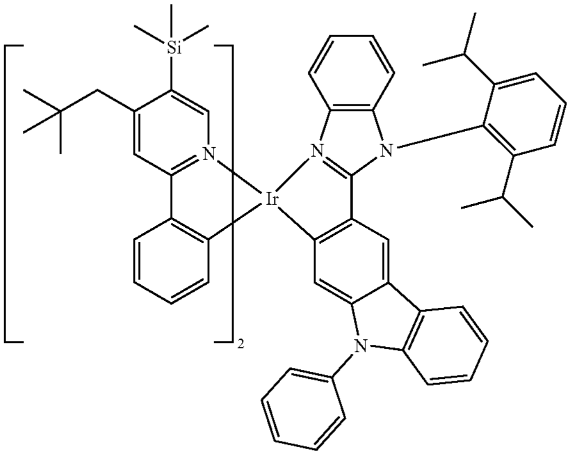
1095
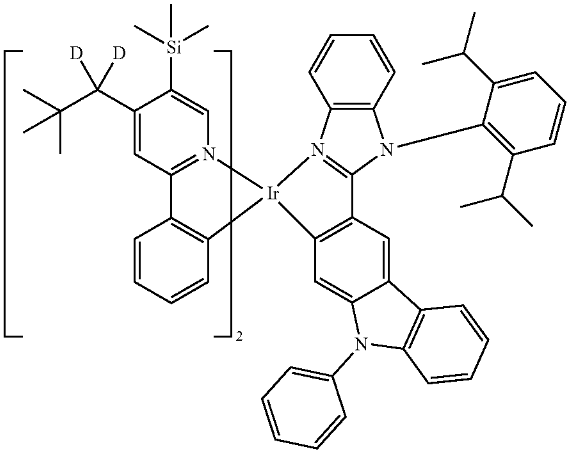

-continued
1096
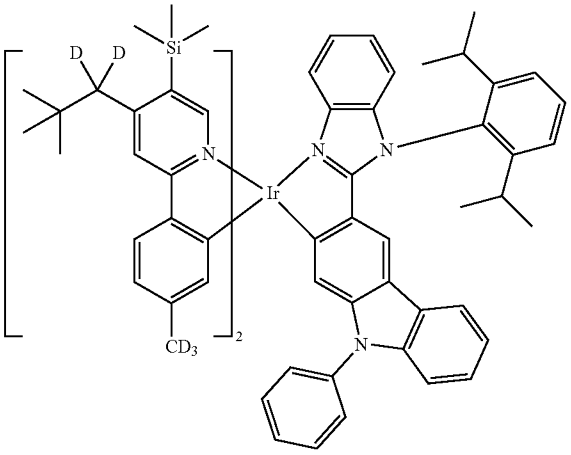
1097
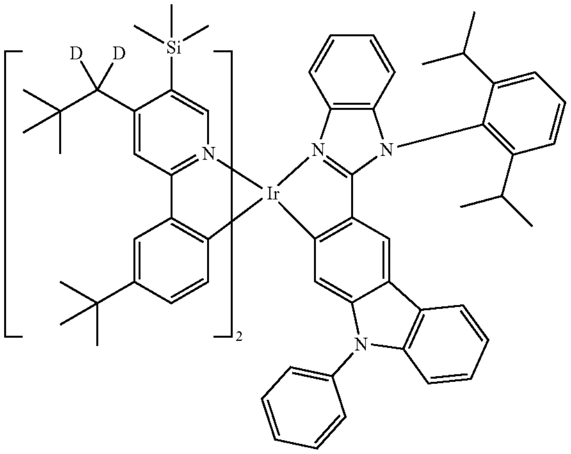
1098
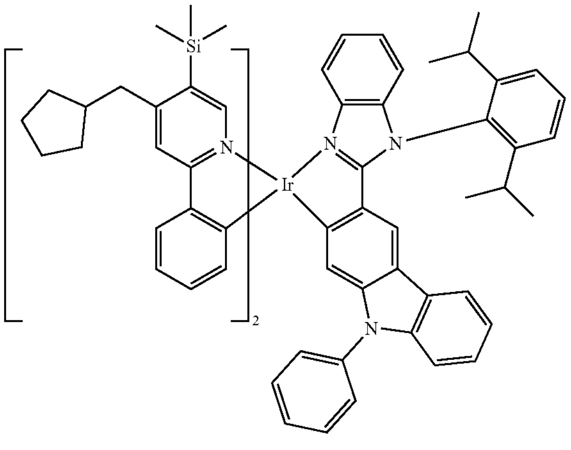
-continued
1099
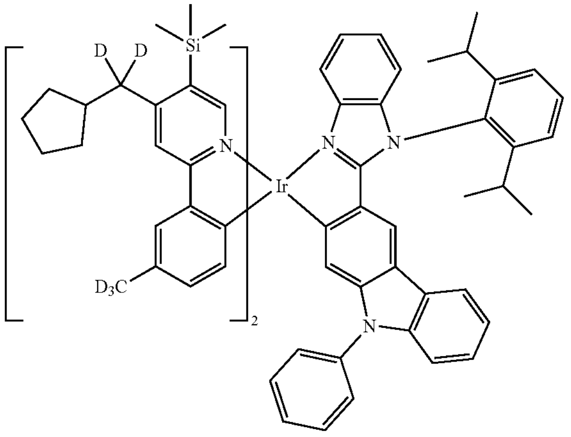
1100
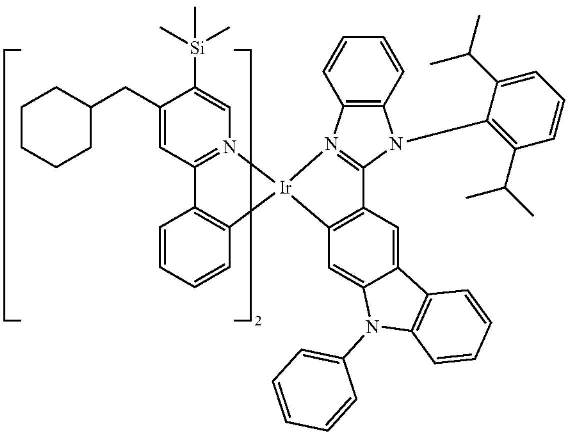
1101
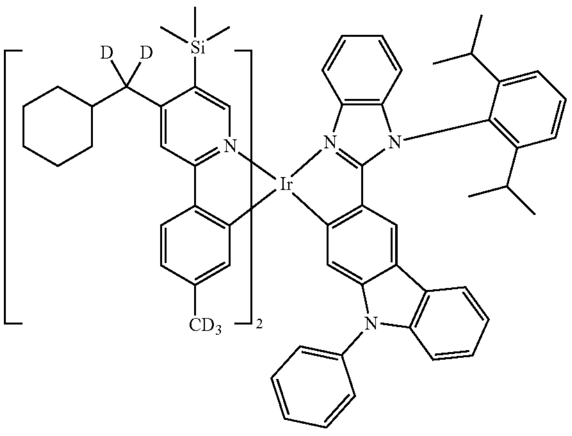

-continued
1102
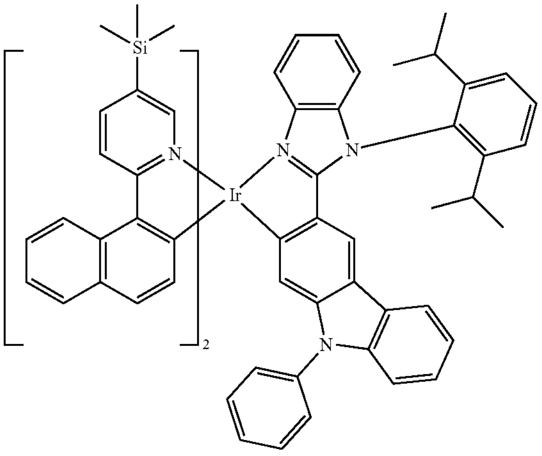
1103
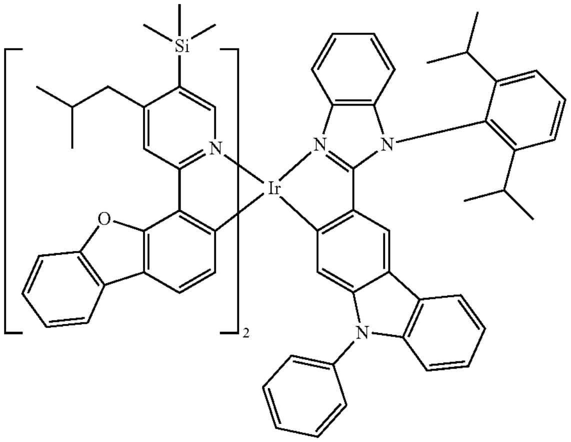
1104
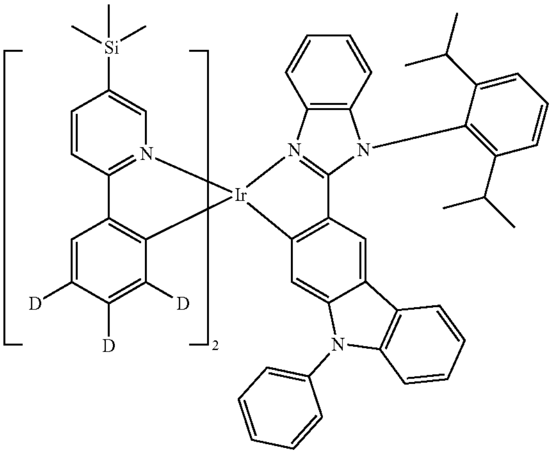
-continued
1105
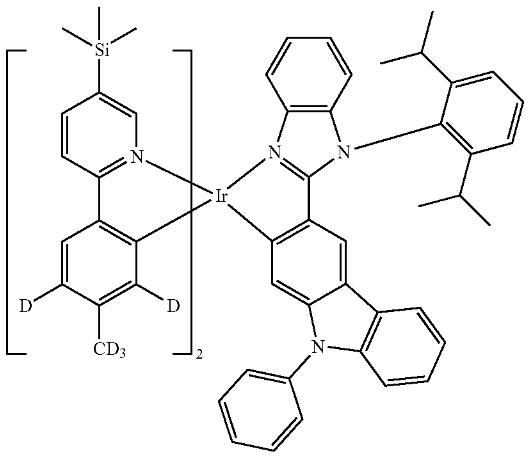
1106
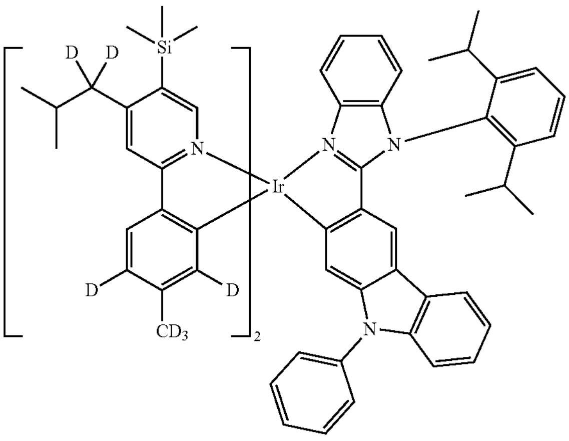
1107
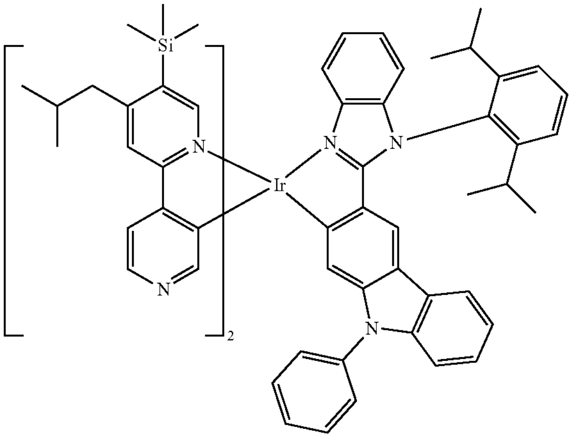

-continued
1108
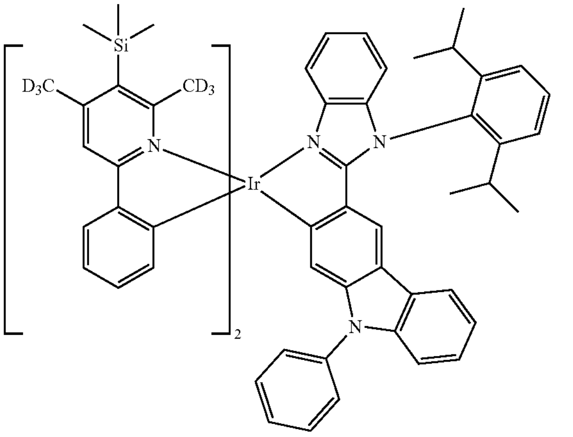
1109
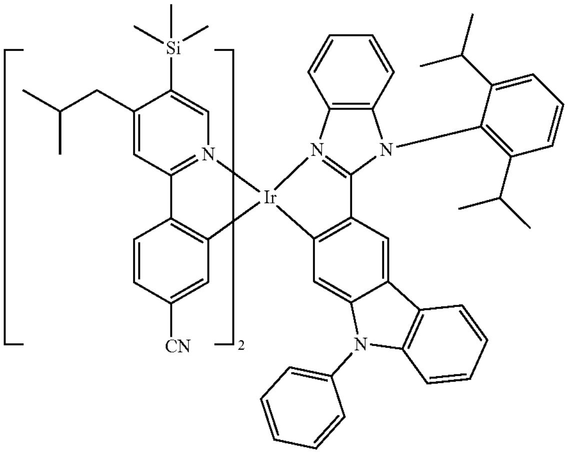
1110
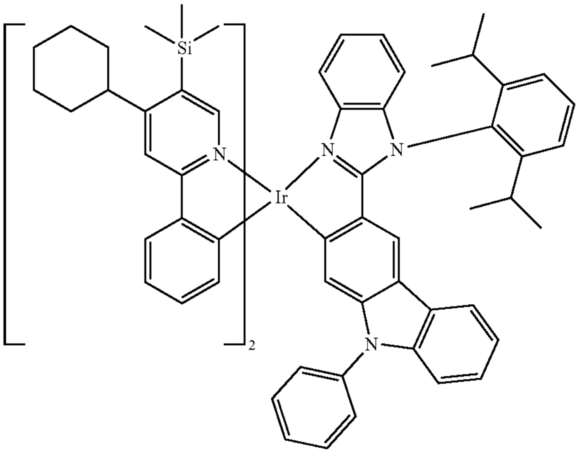
-continued
1111
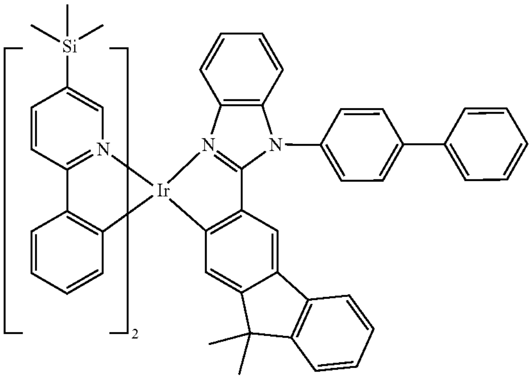
1112
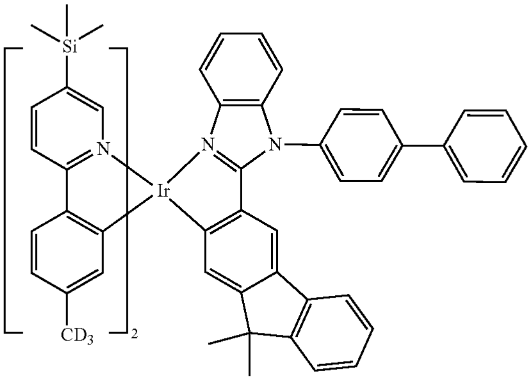
1113
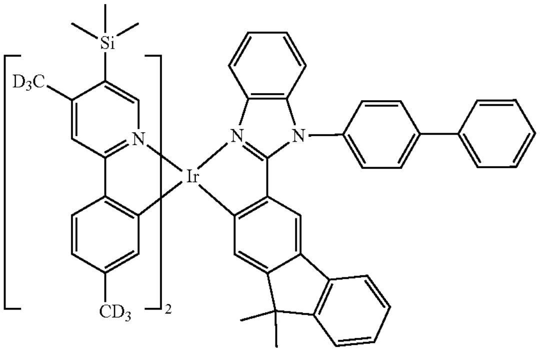
1114
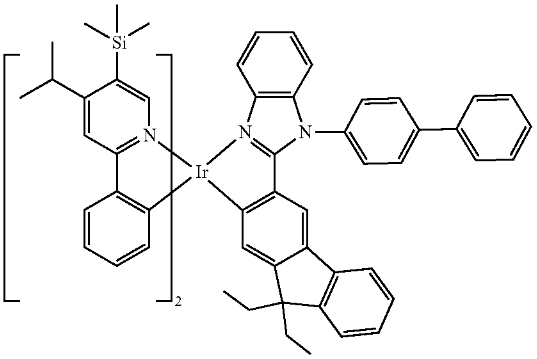

-continued
1115
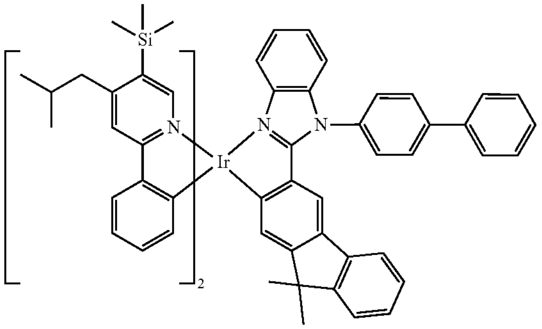
1116
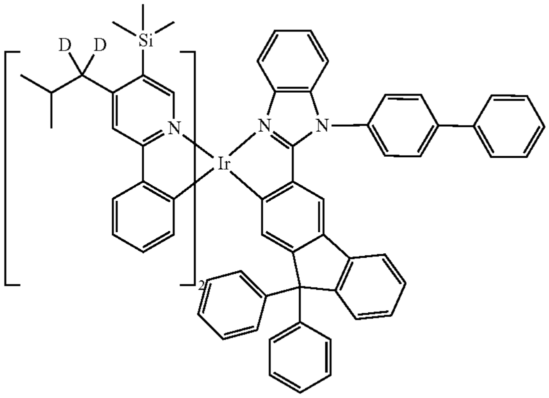
1117
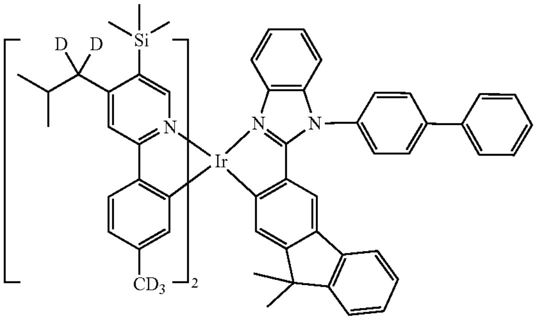
1118
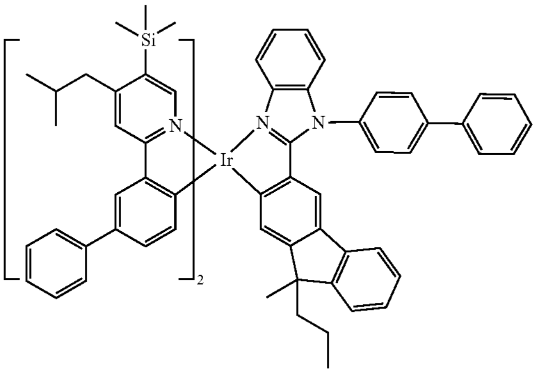
-continued
1119
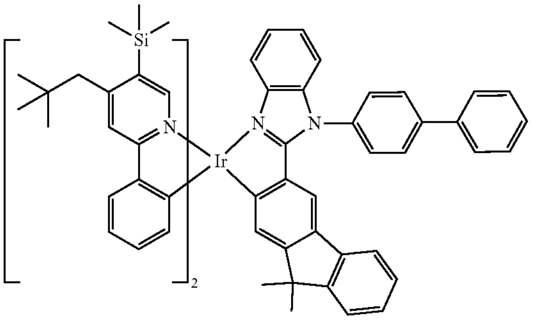
1120
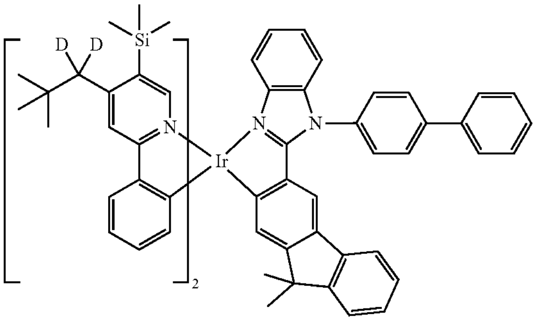
1121
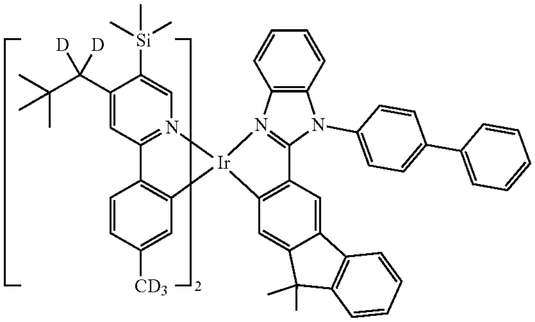
1122
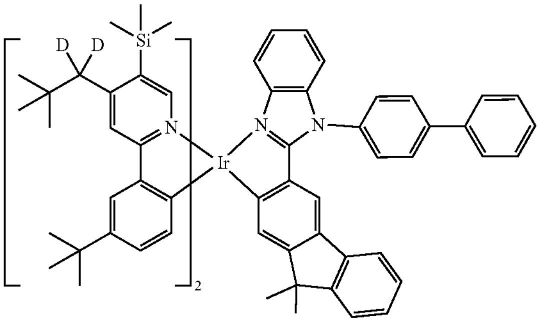

-continued
1123
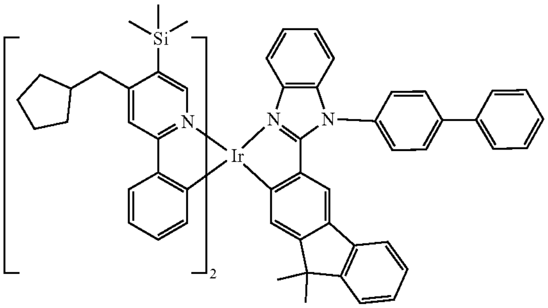
1124
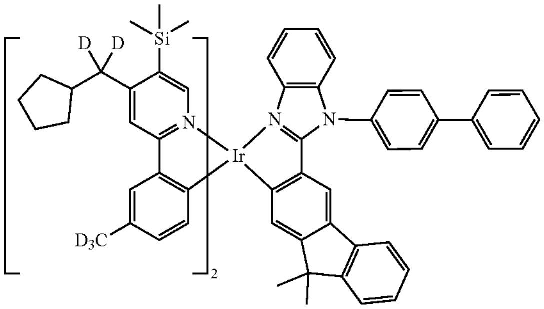
1125
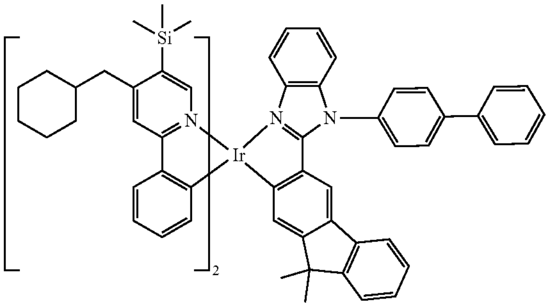
1126
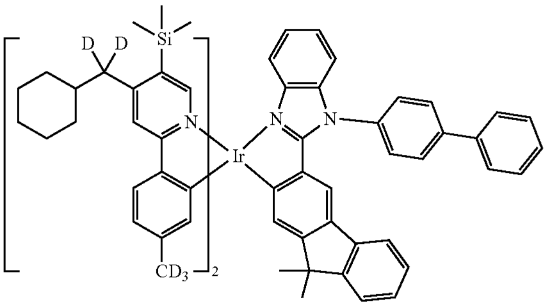
-continued
1127
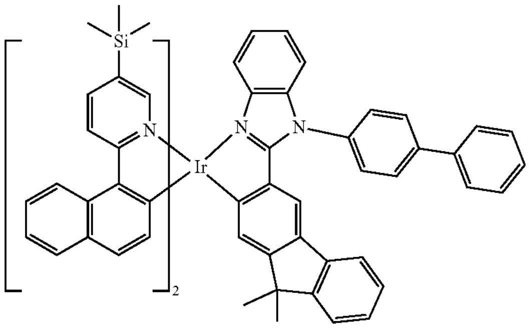
1128
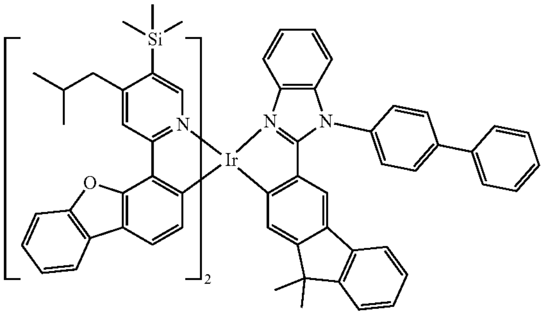
1129
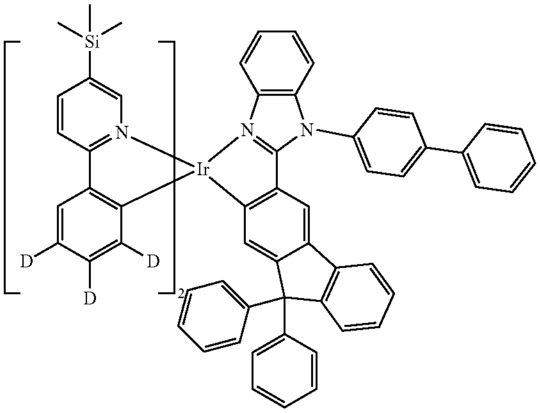
1130
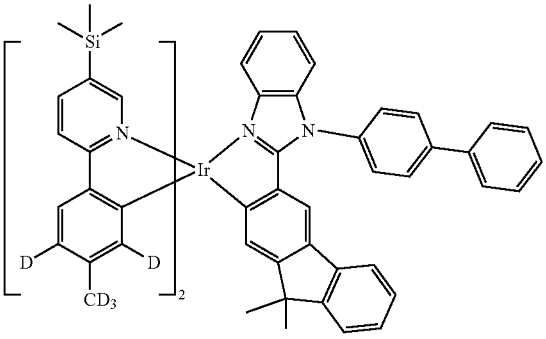

-continued
1131
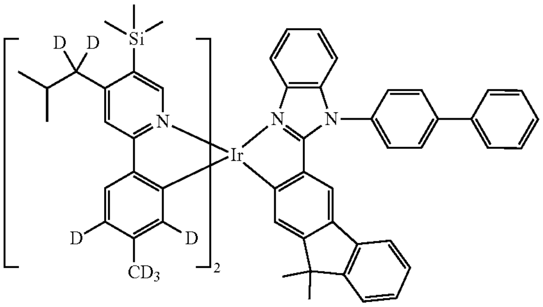
1132
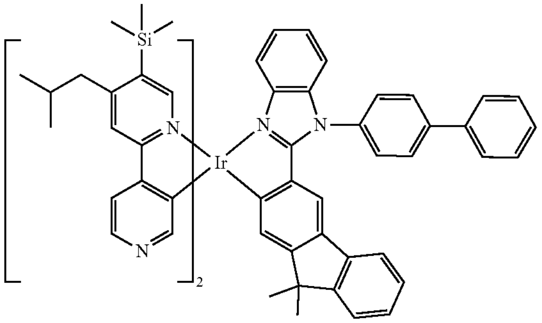
1133
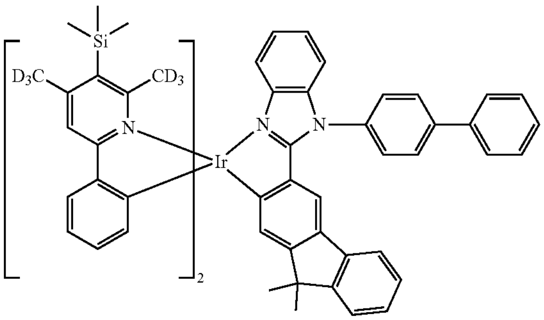
1134
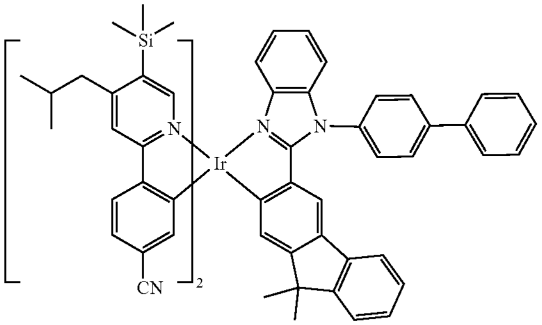
-continued
1135
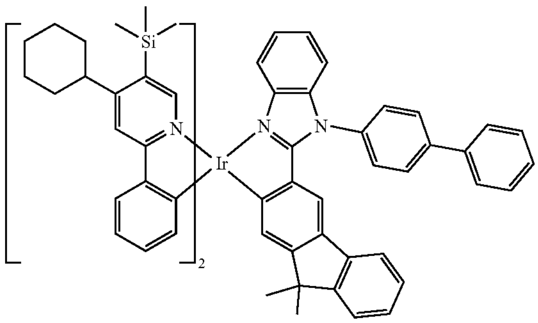
1136
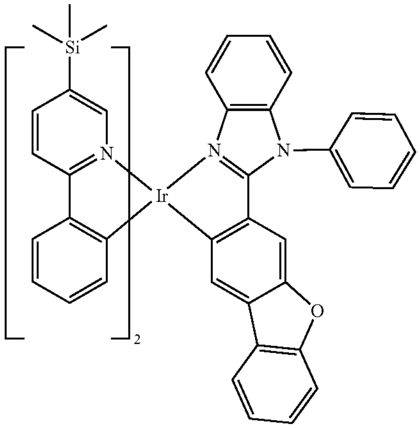
1137
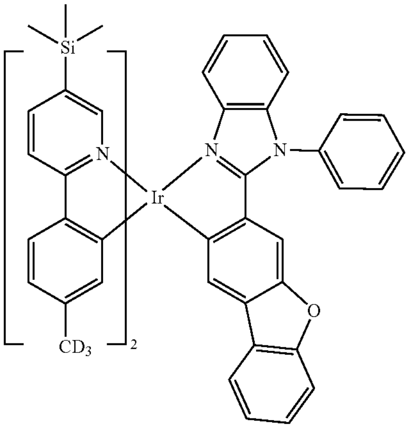
1138
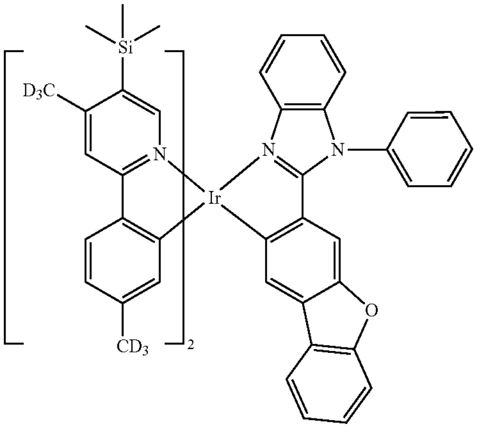

-continued
1139
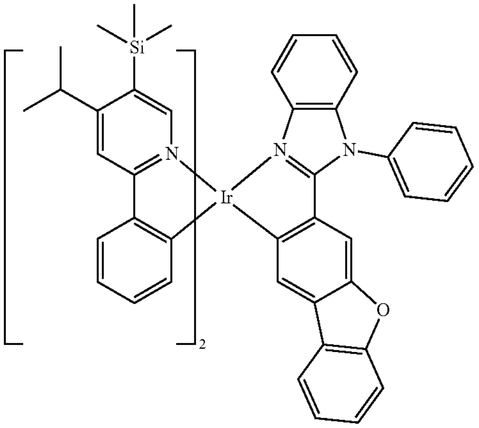
1140
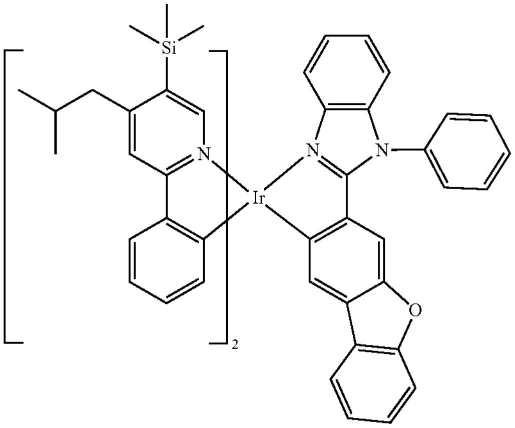
1141
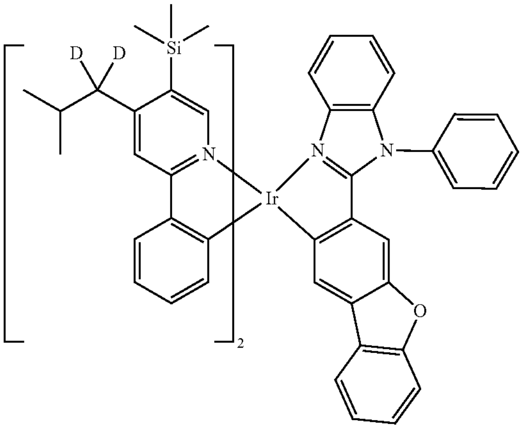
-continued
1142
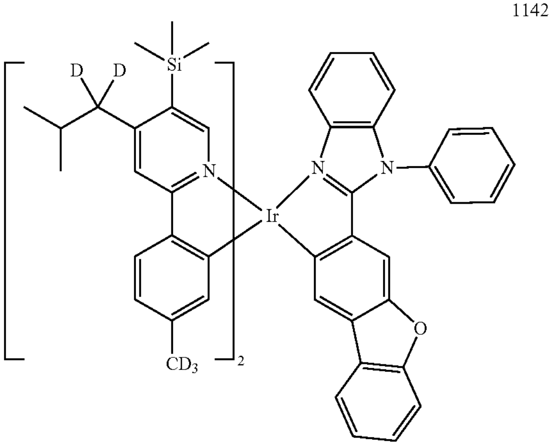
1143
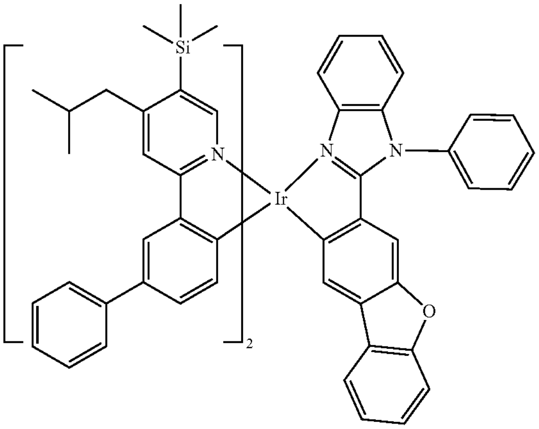
1144
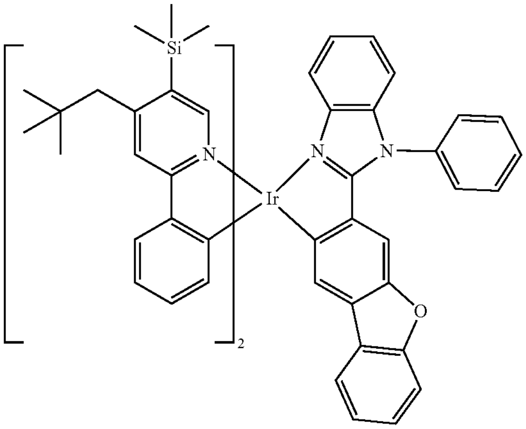

-continued
1145
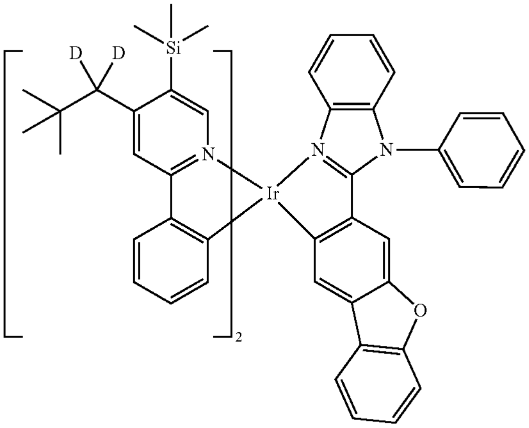
1146
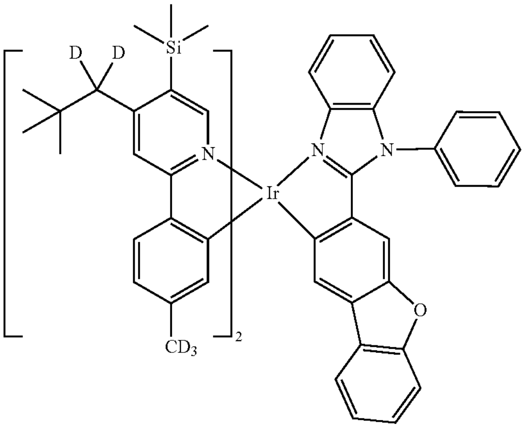
1147
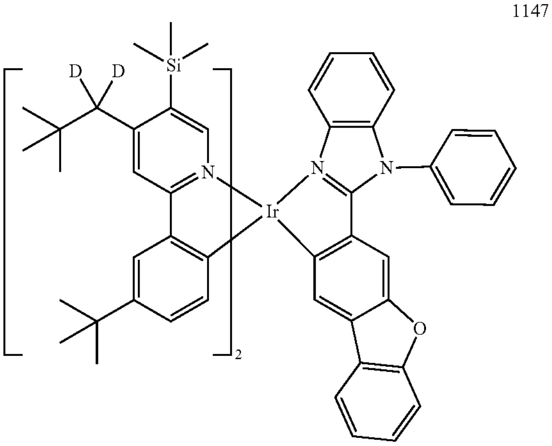
-continued
1148
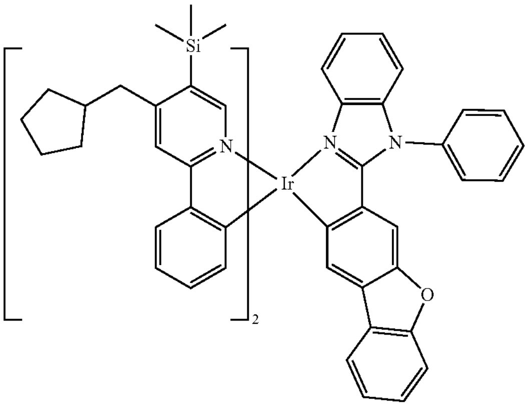
1149
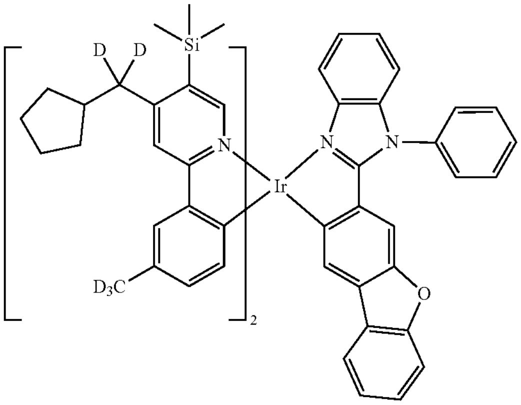
1150
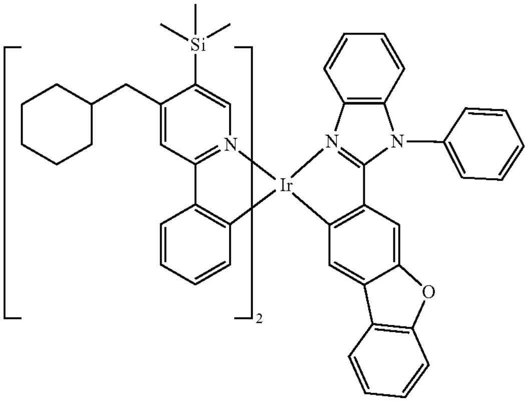

-continued
1151
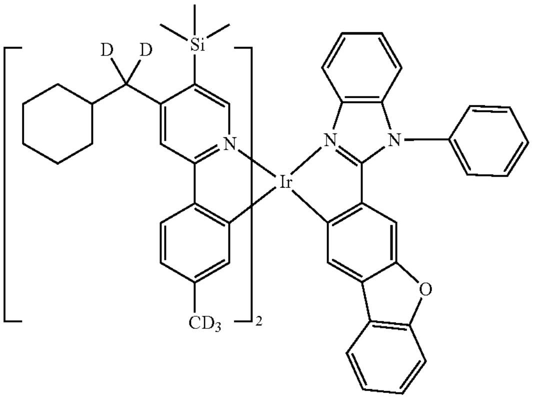
1152
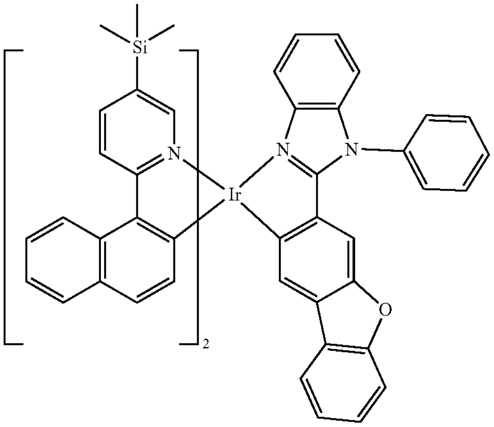
1153
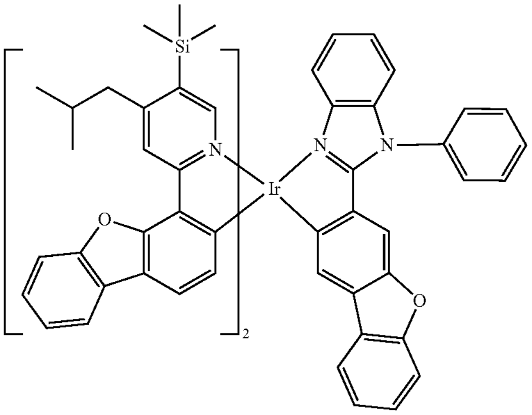
-continued
1154
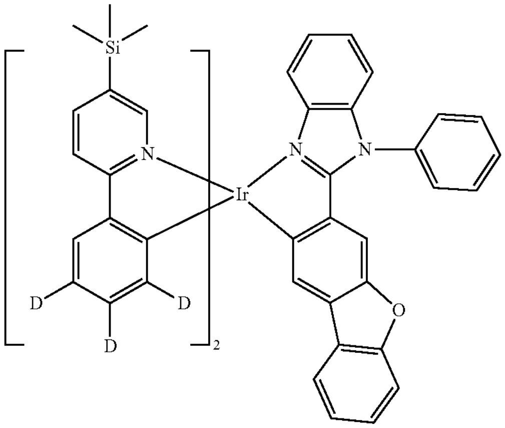
1155
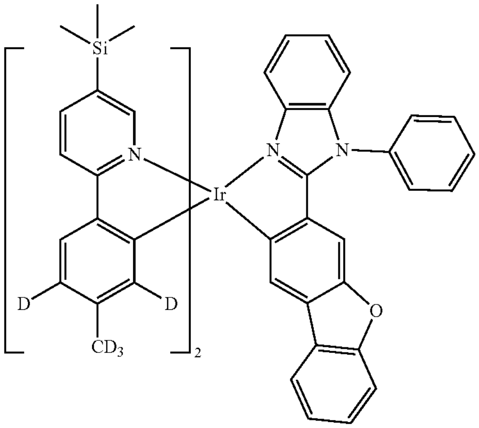
1156
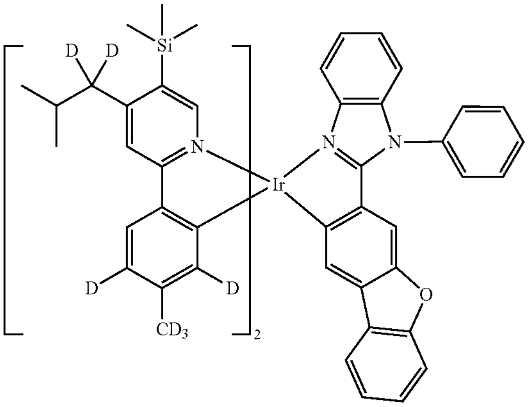

-continued
1157
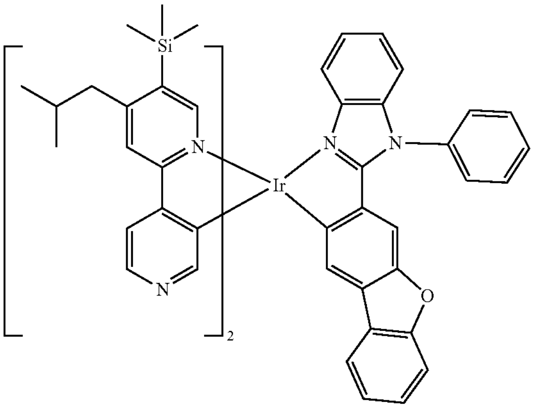
1158
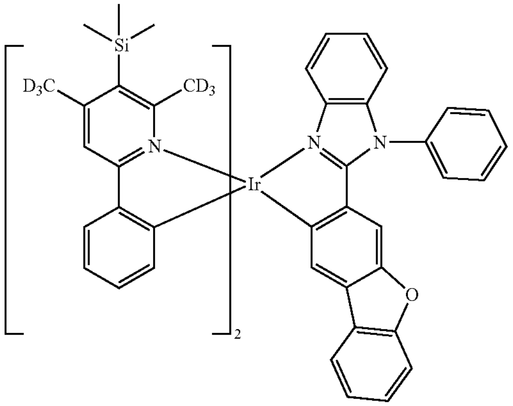
1159
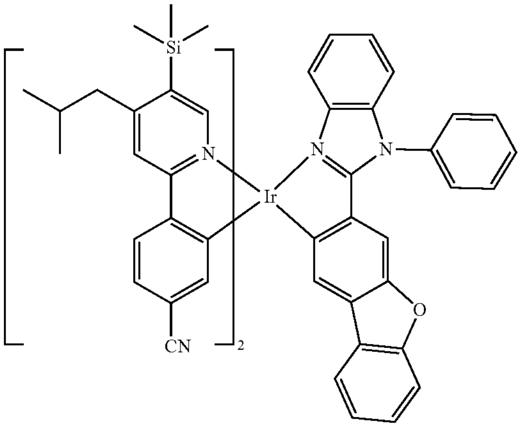
-continued
1160
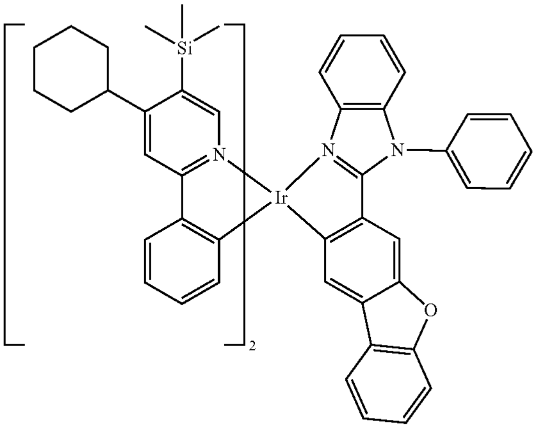
1161
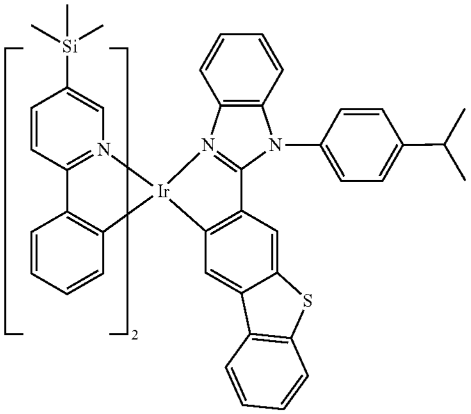
1162
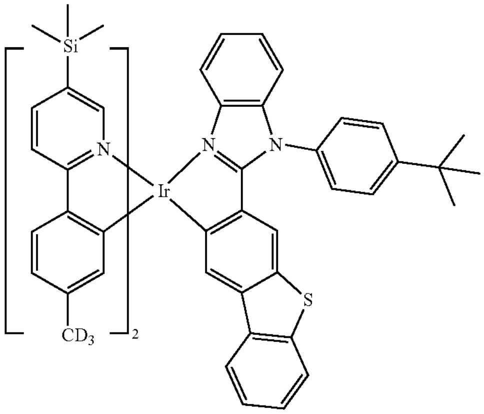

-continued
1163
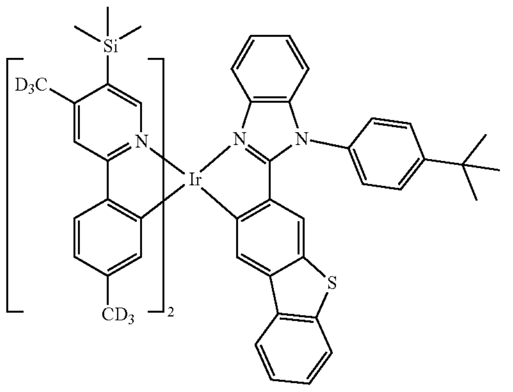
1164
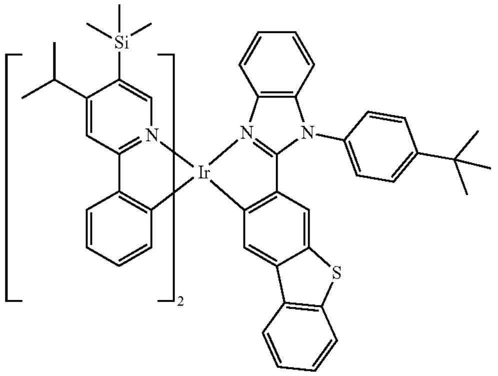
1165
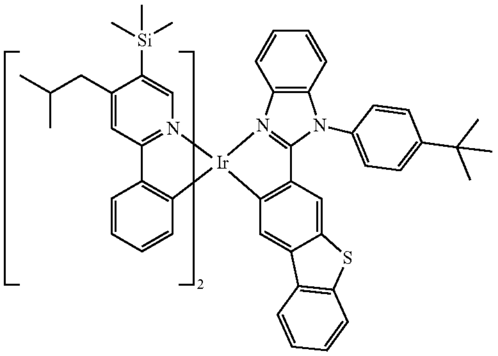
1166
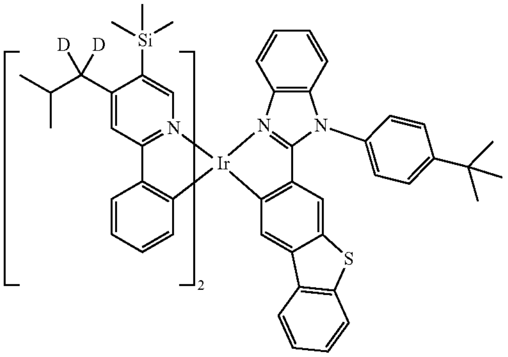
-continued
1167
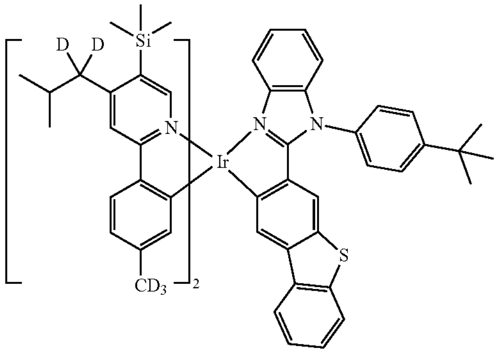
1168
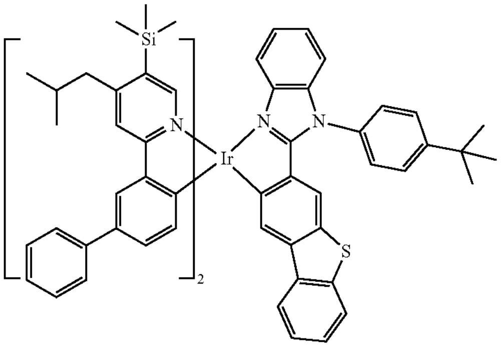
1169
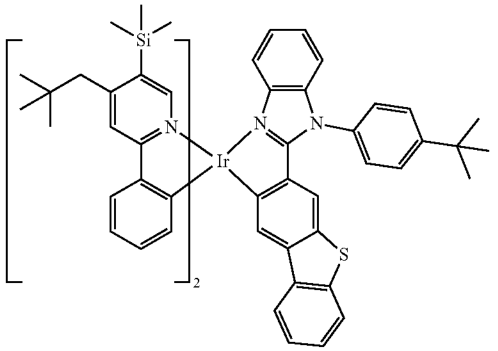
1170
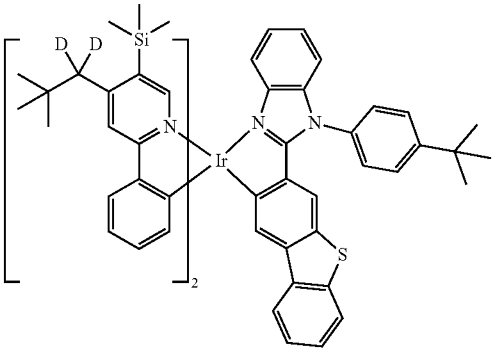

-continued
1171
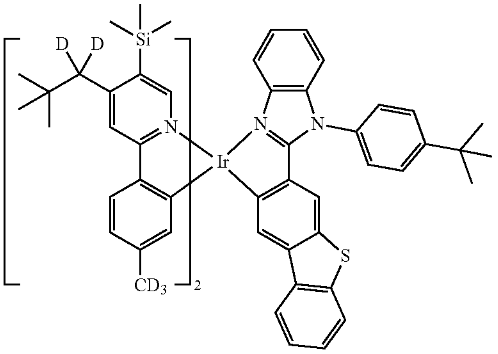
1172
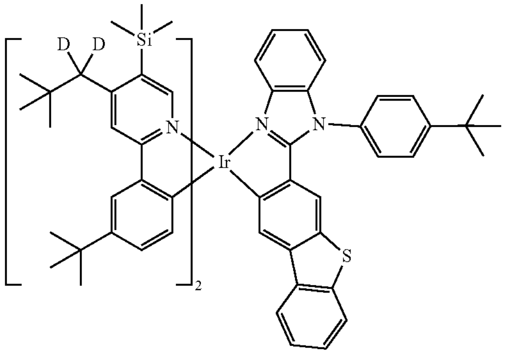
1173
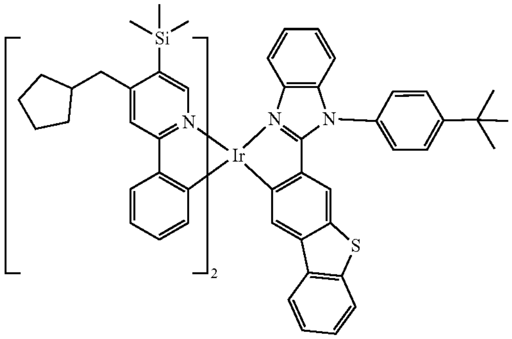
1174
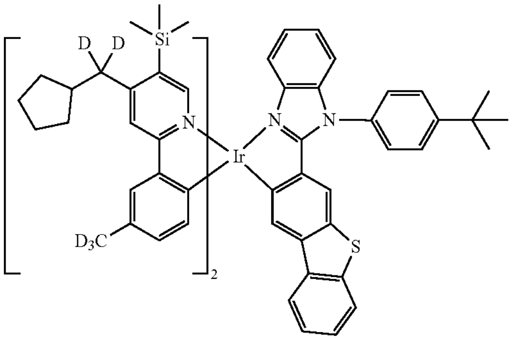
-continued
1175
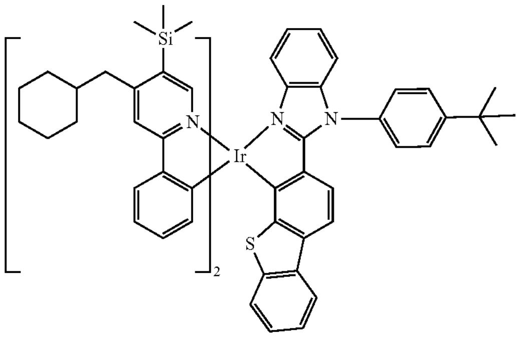
1176
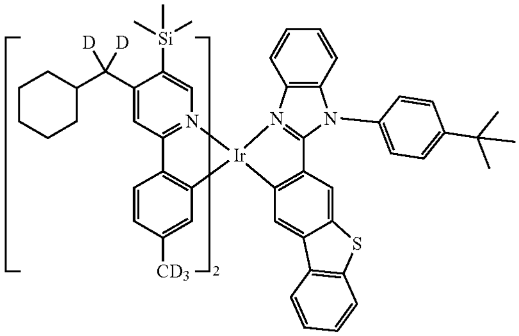
1177
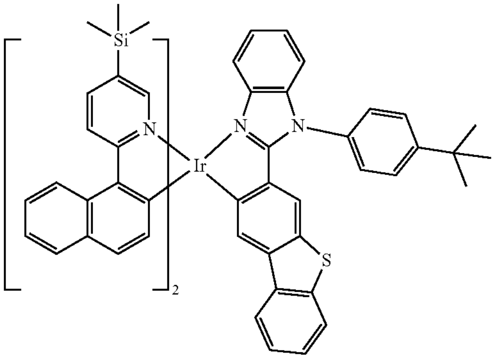
1178
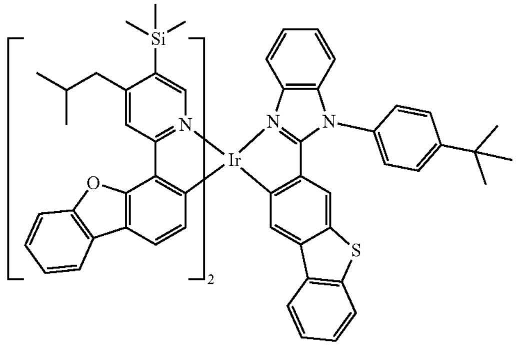

-continued
1179
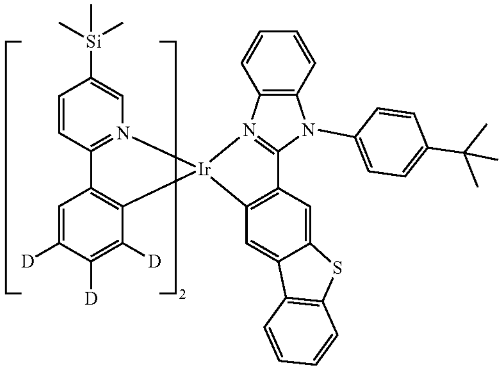
1180
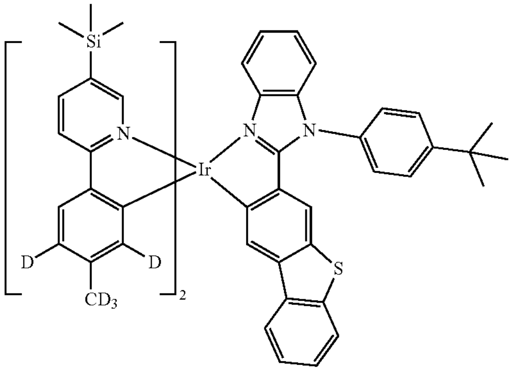
1181
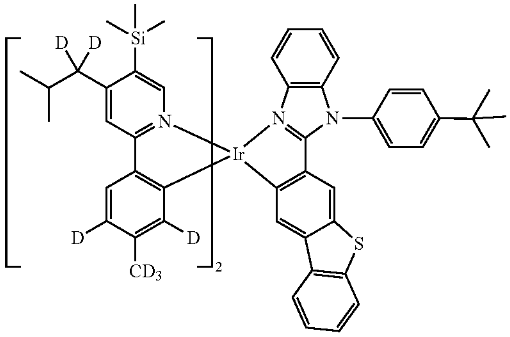
1182
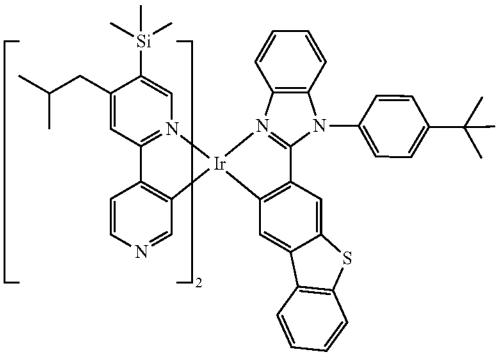
-continued
1183
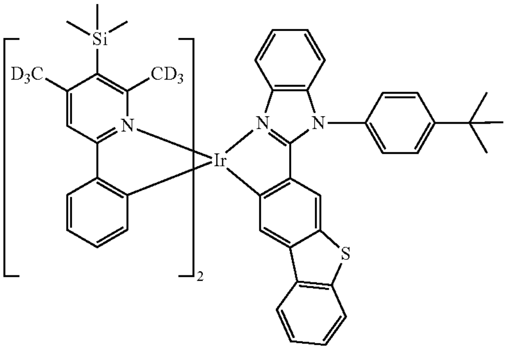
1184
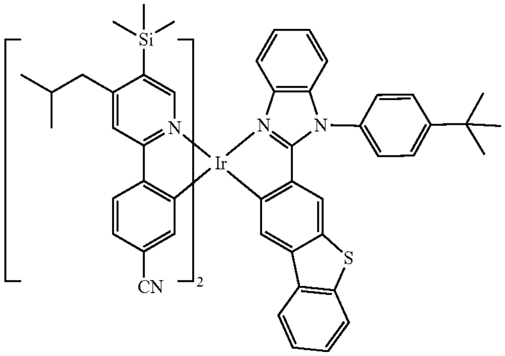
1185
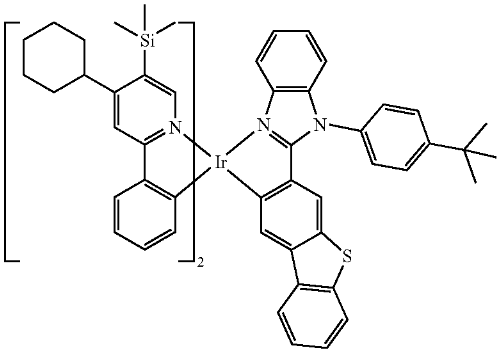
1186
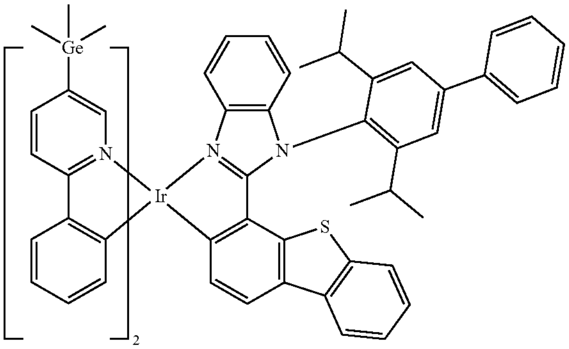

1187
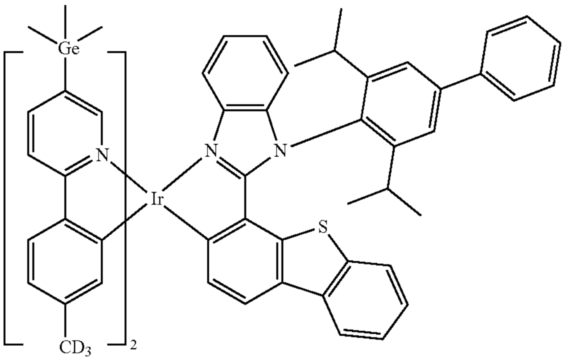
1188
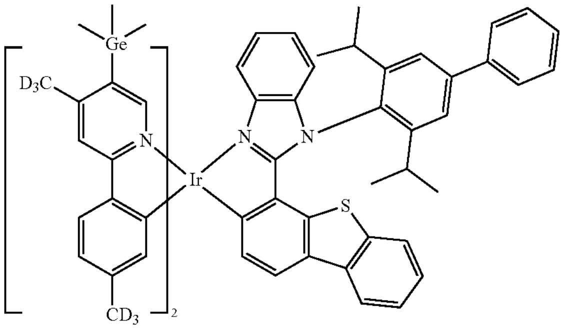
1189
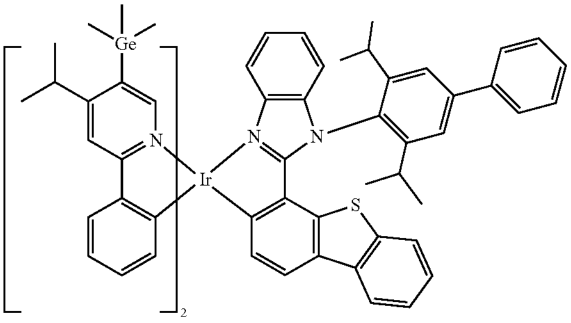
1190
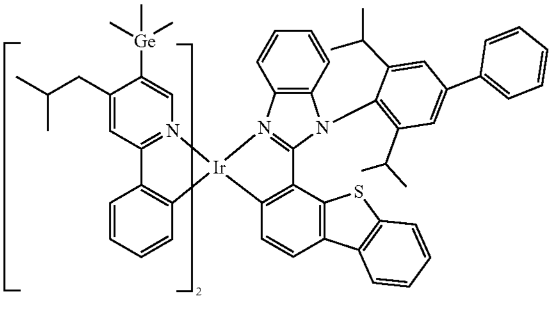
1191
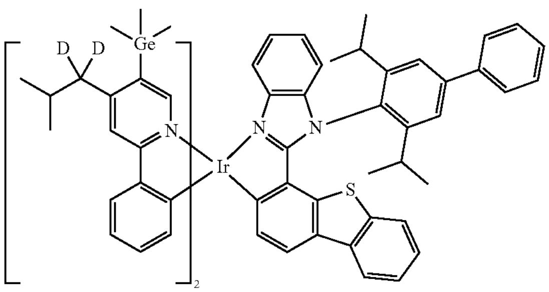
1192
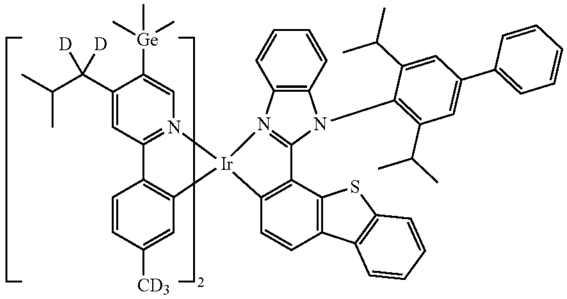
1193
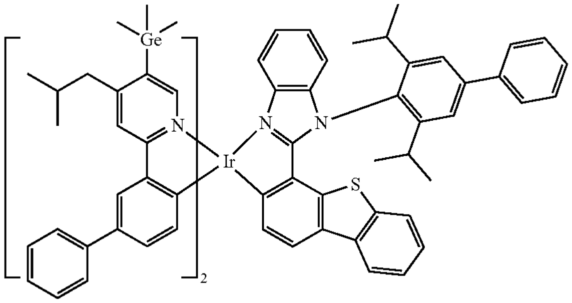
1194
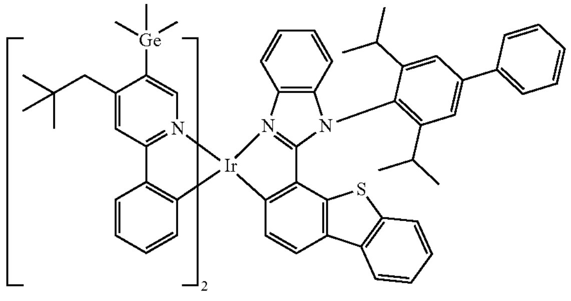
1195
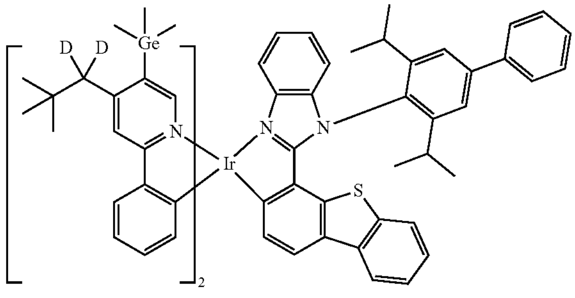

-continued
1196
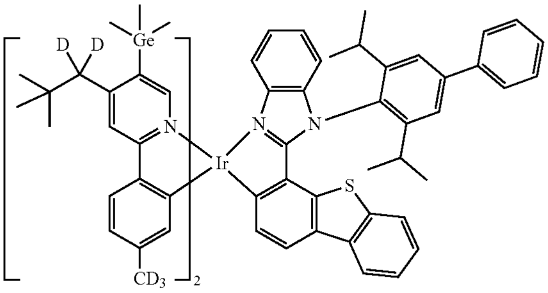
1197
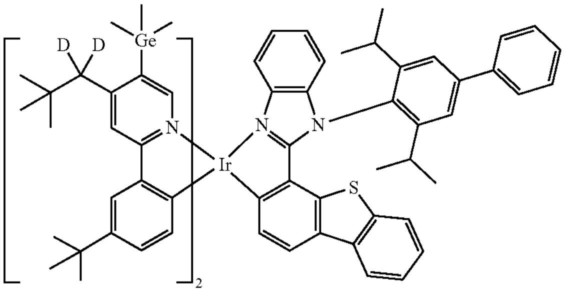
1198
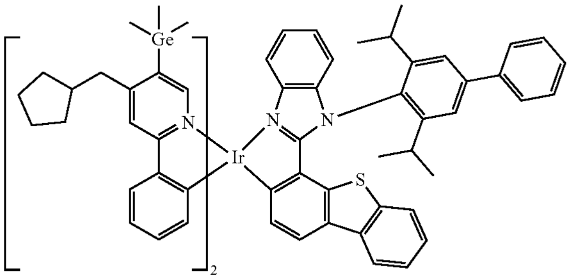
1199
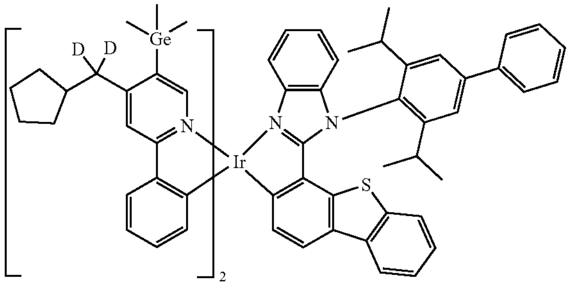
1200
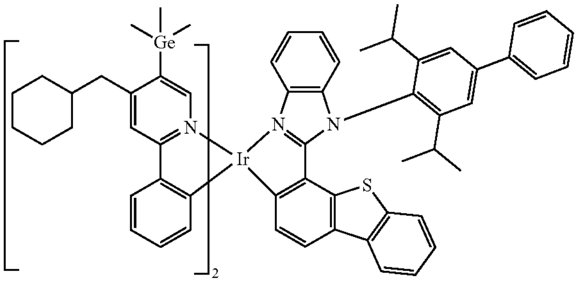
-continued
1201
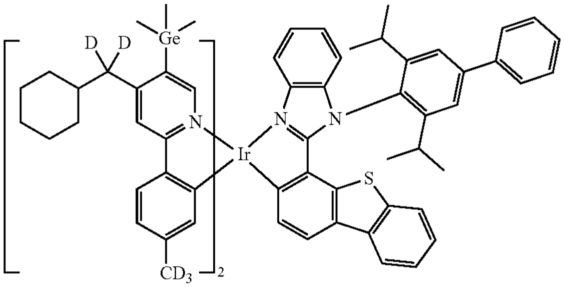
1202
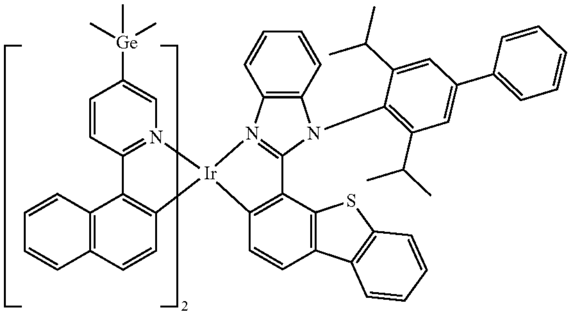
1203
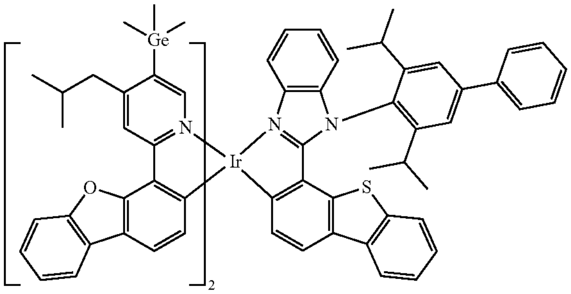
1204
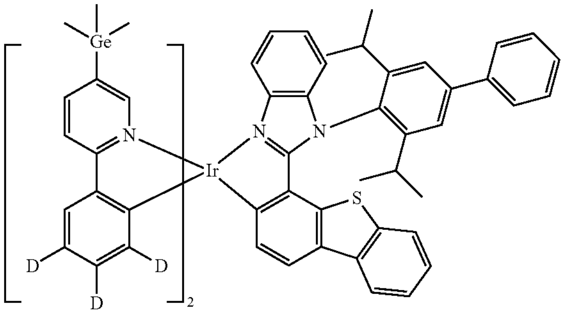

-continued
1205
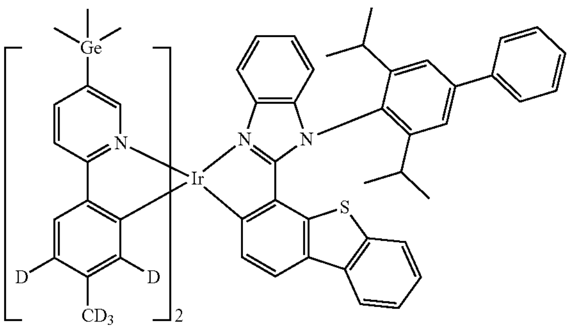
1206
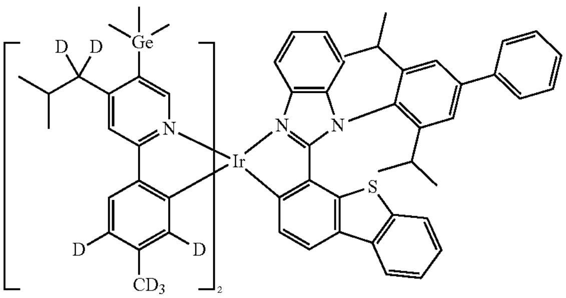
1207
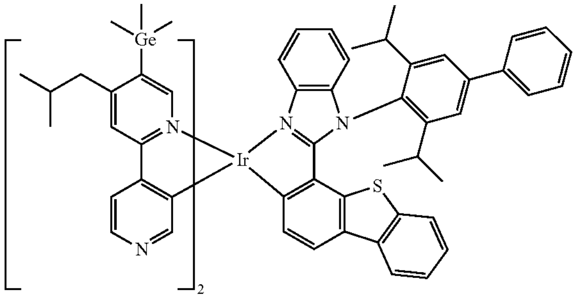
1208
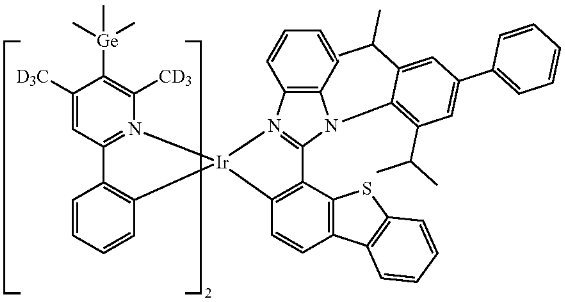
-continued
1209
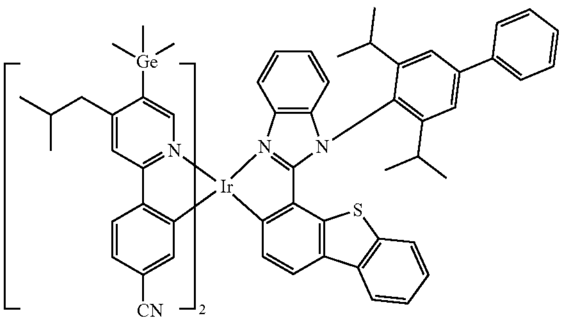
1210
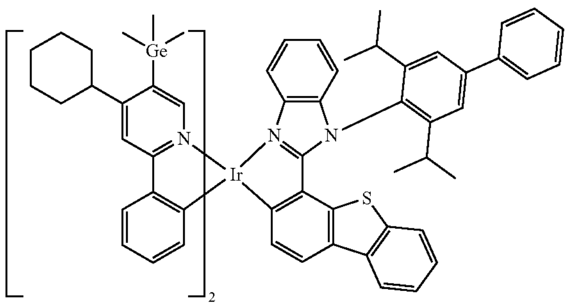
1211
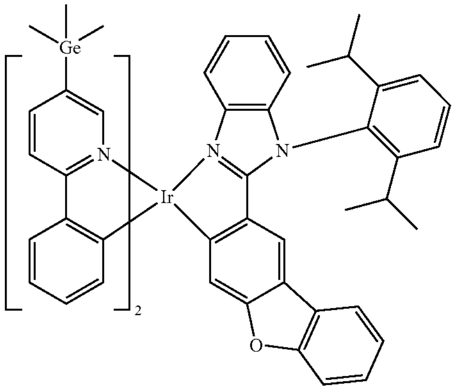
1212
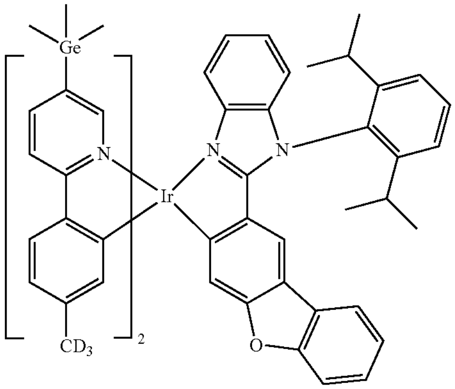

-continued
1213
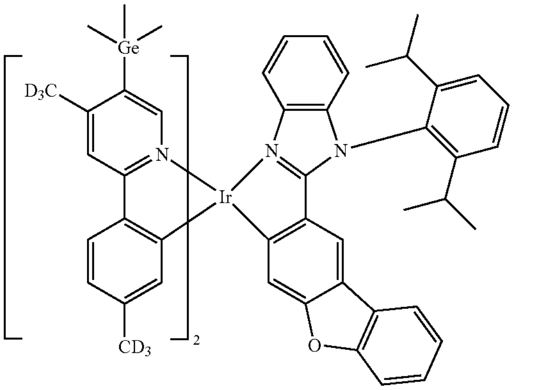
1214
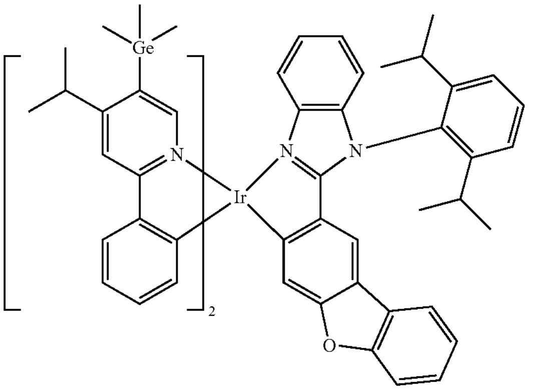
1215
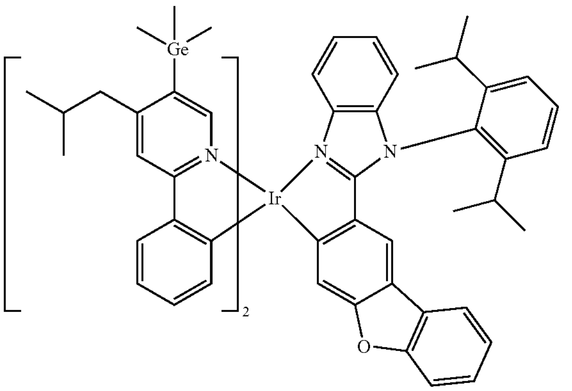
1216
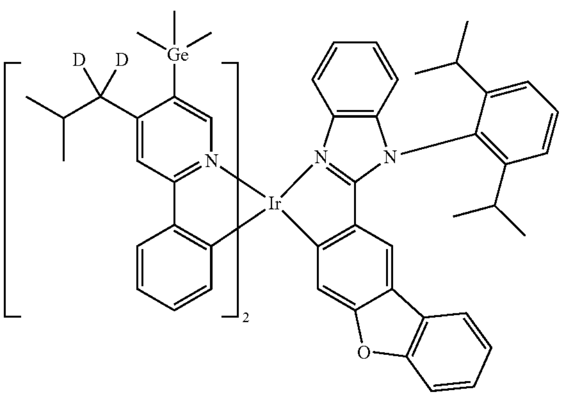
-continued
1217
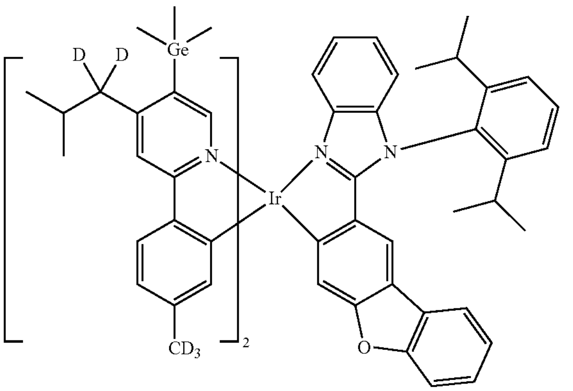
1218
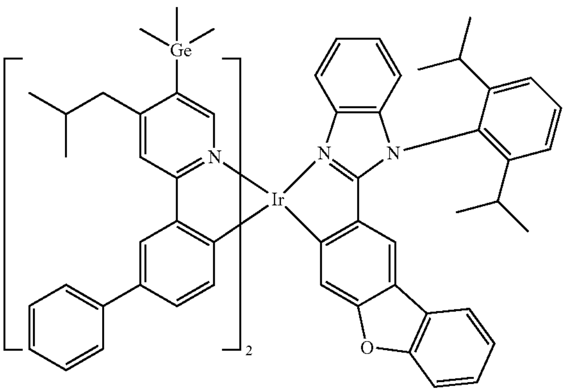
1219
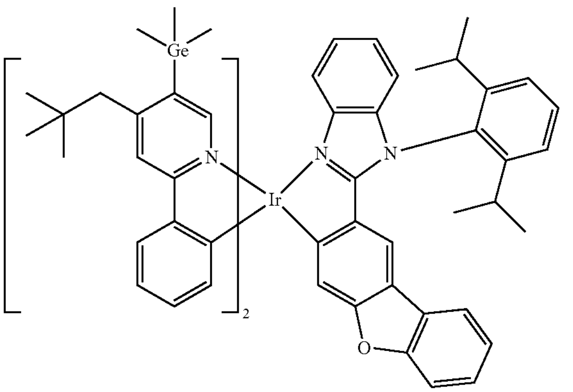
1220
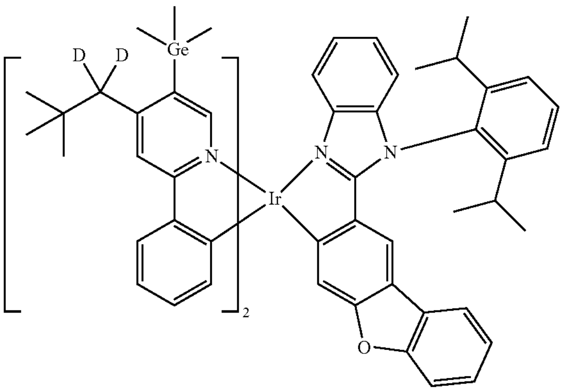

1221
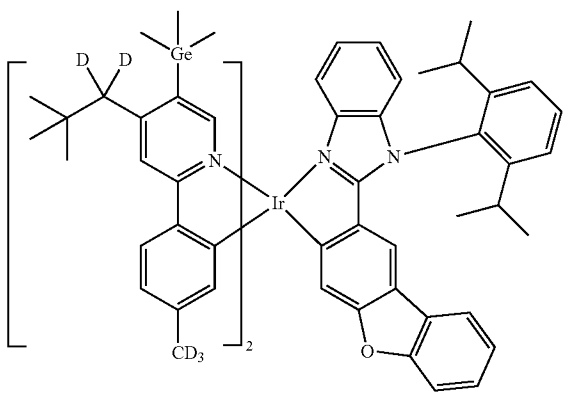
1222
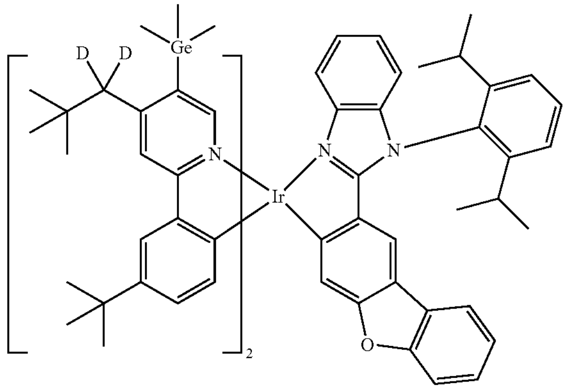
1223
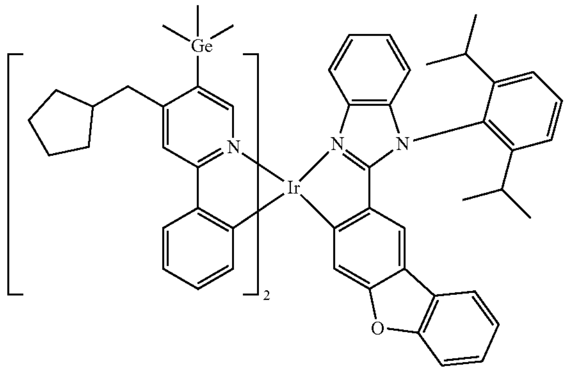
1224
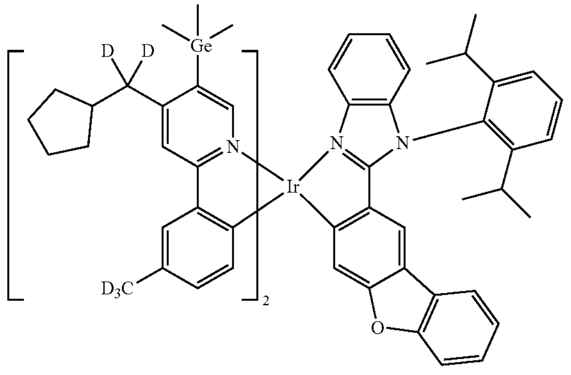
1225
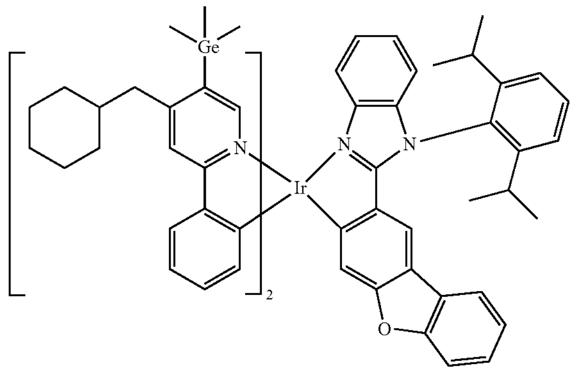
1226
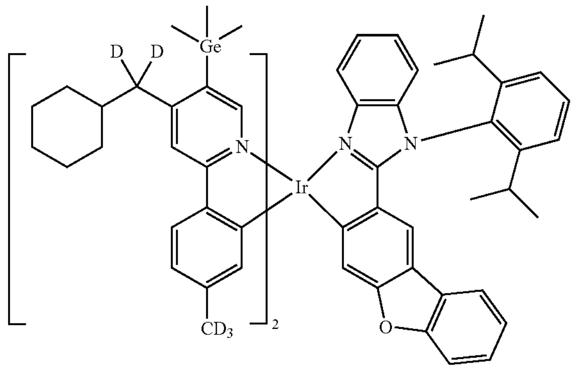
1227
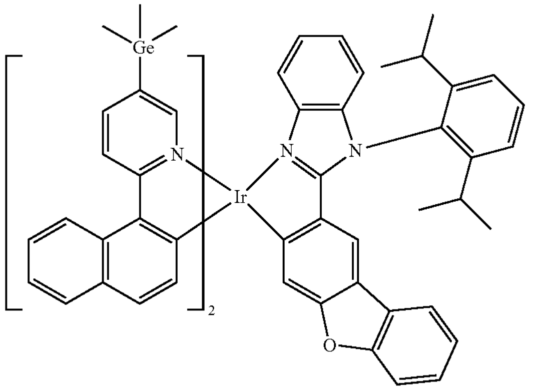
1228
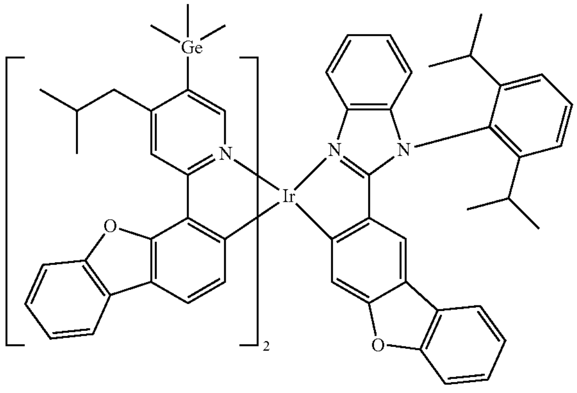

1229
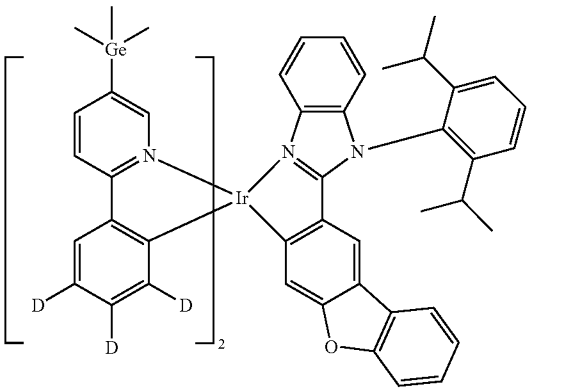
1230
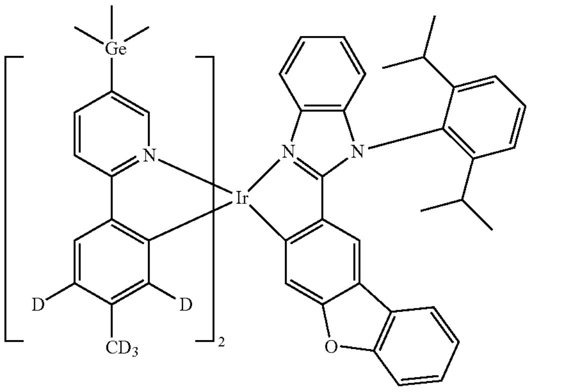
1231
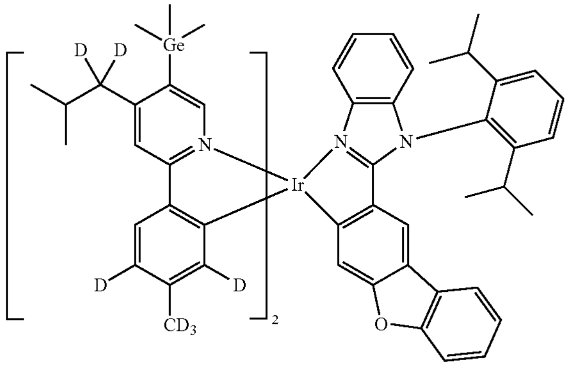
1232
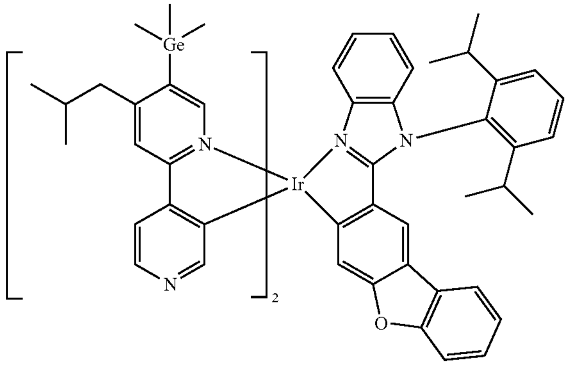
1233
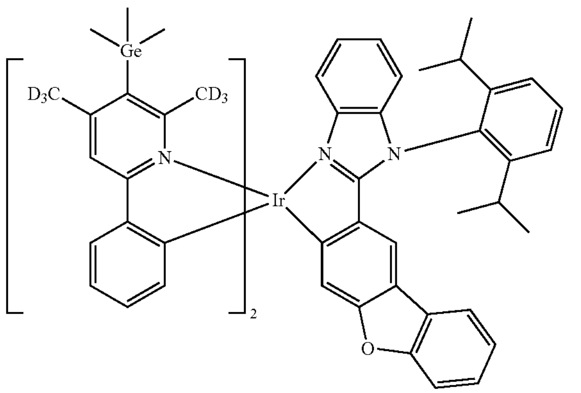
1234
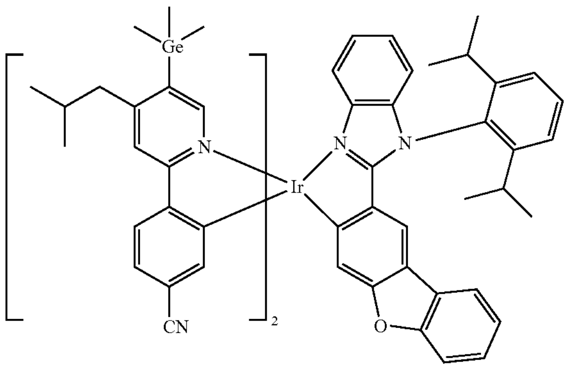
1235
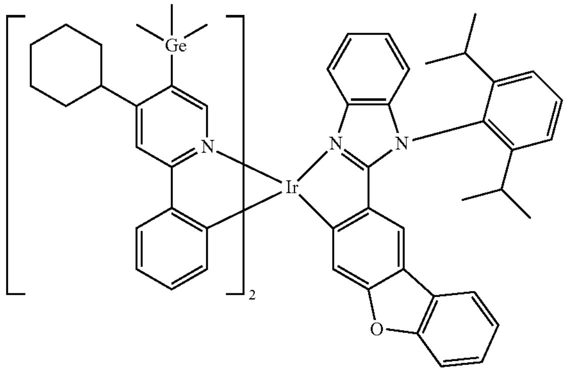
1236
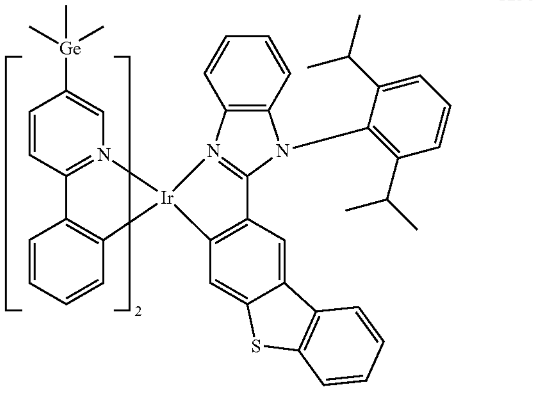

1237
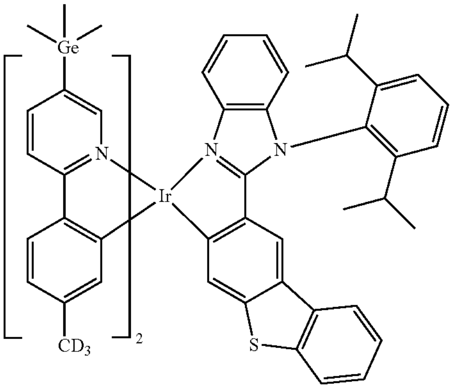
1238
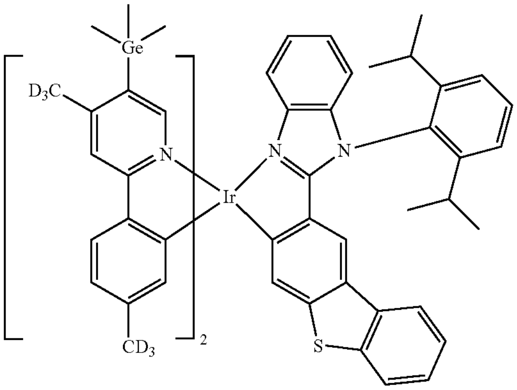
1239
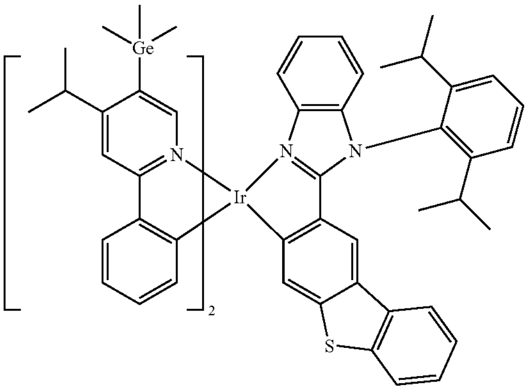
1240
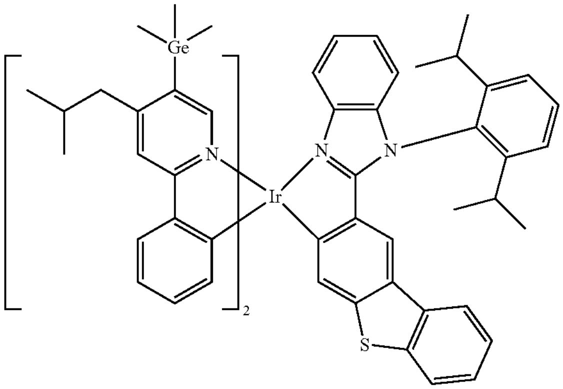
1241
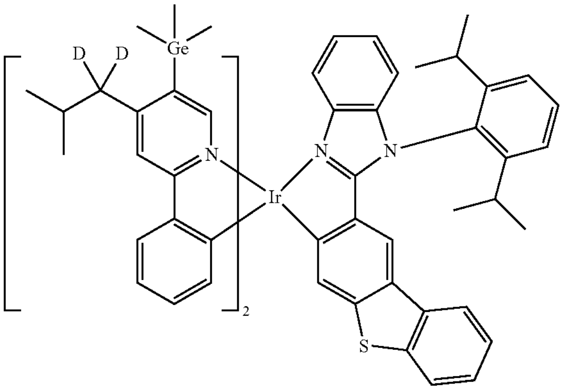
1242
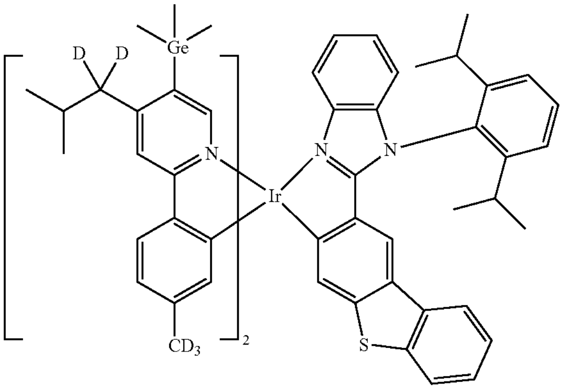
1243
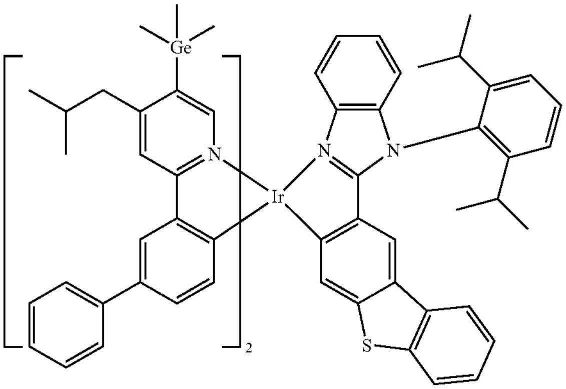
1244
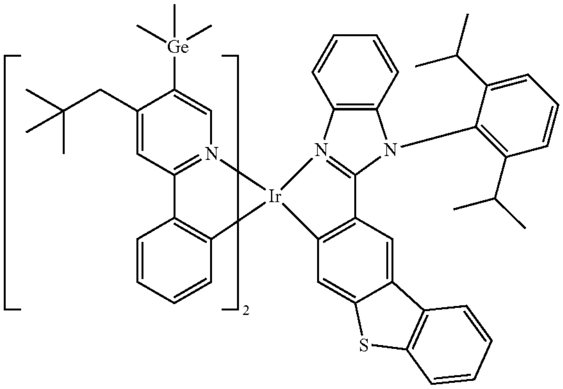

-continued
1245
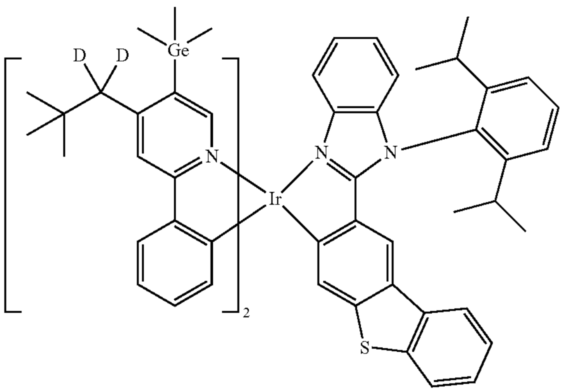
1246
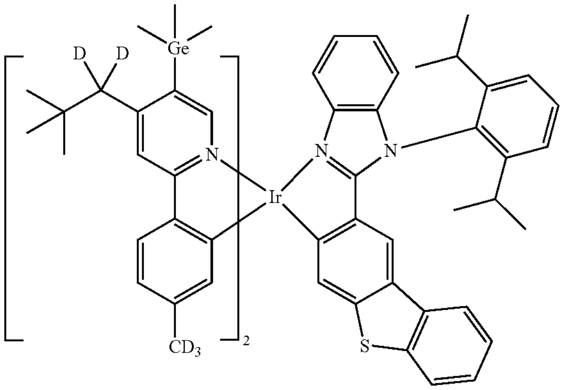
1247
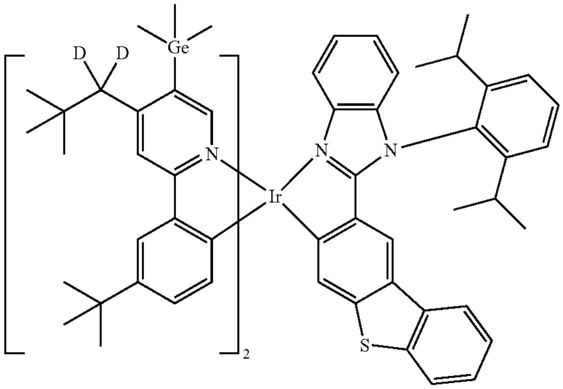
1248
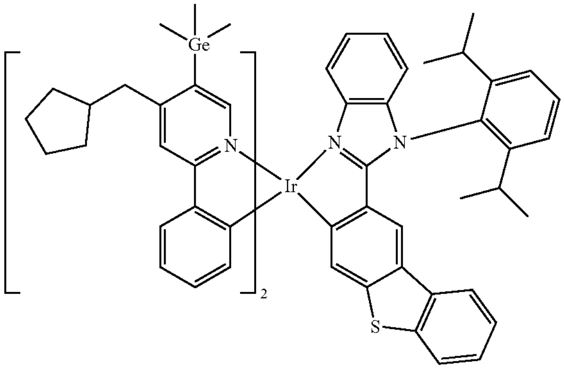
-continued
1249
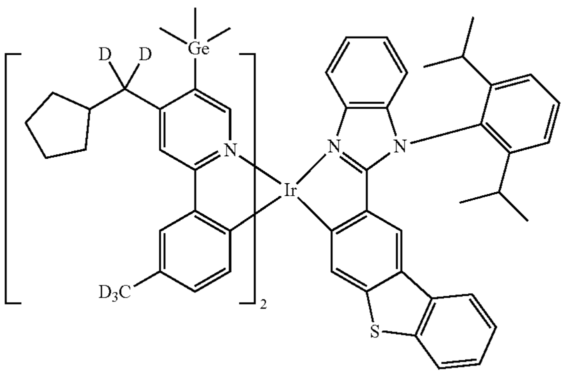
1250
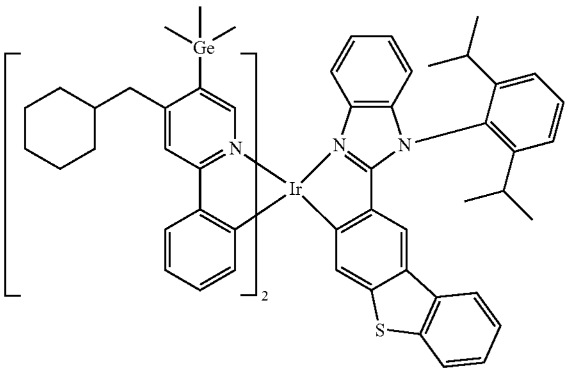
1251
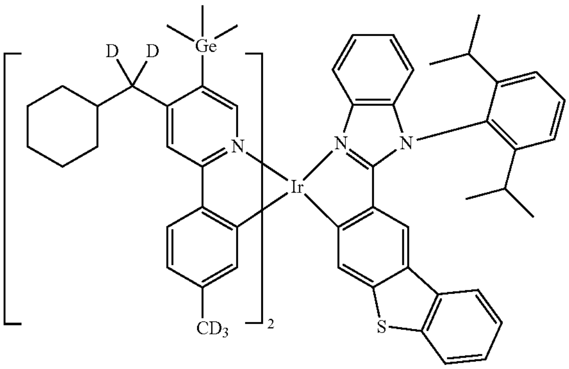
1252
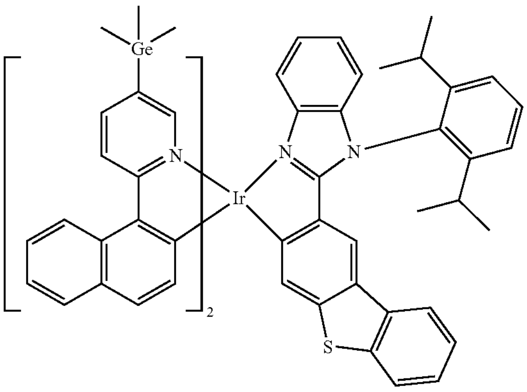

-continued
1253
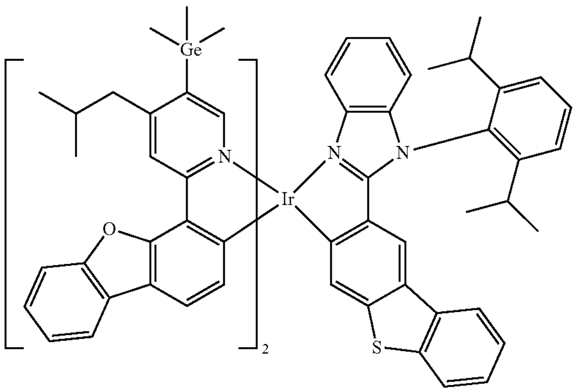
1254
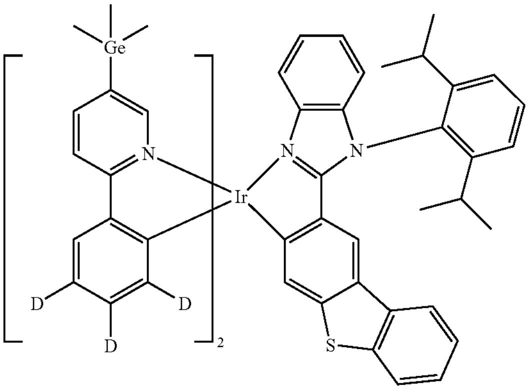
1255
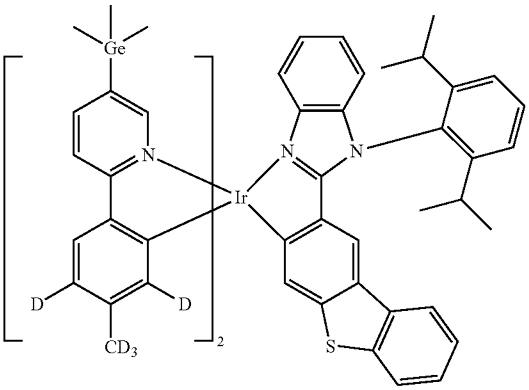
1256
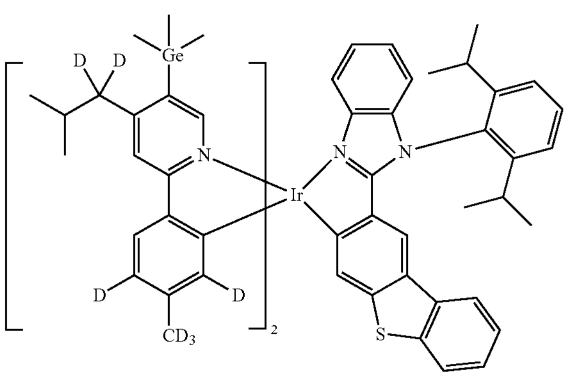
-continued
1257
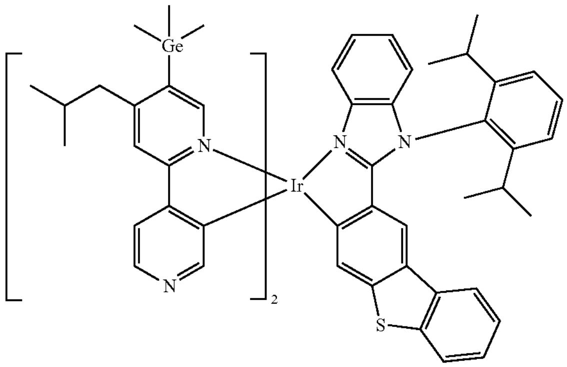
1258
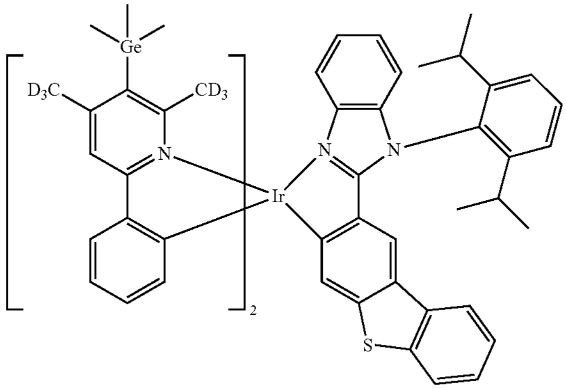
1259
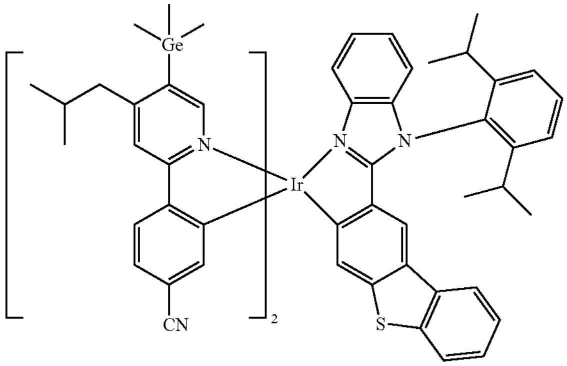
1260
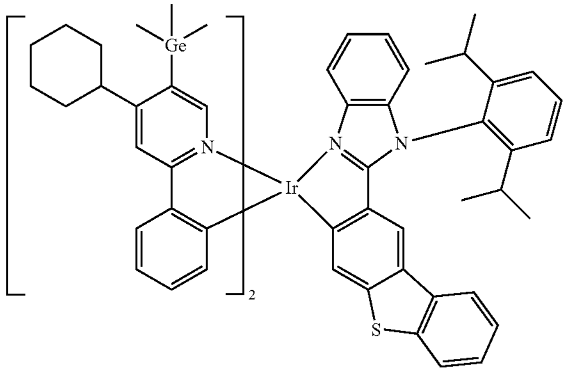

-continued
1261
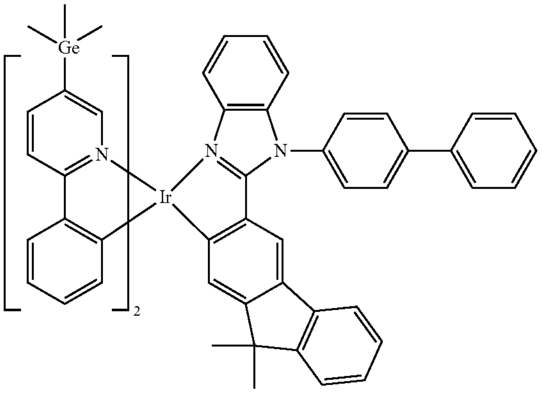
1262
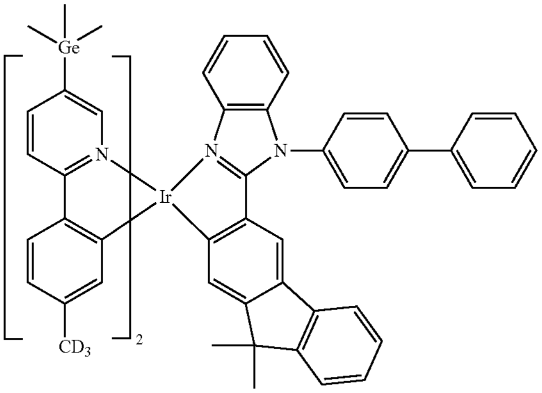
1263
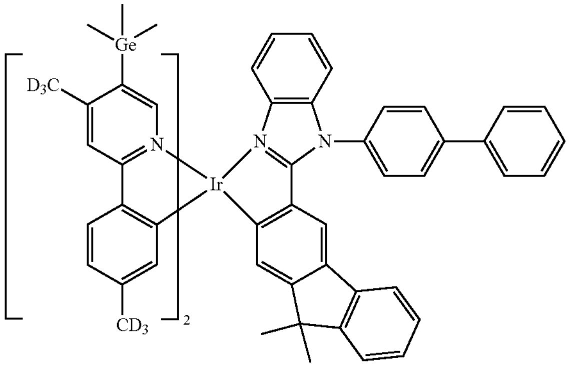
1264
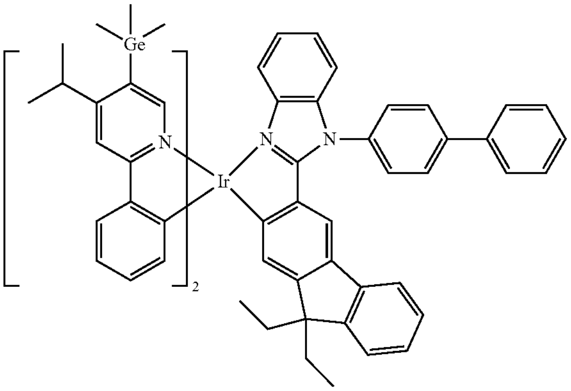
-continued
1265
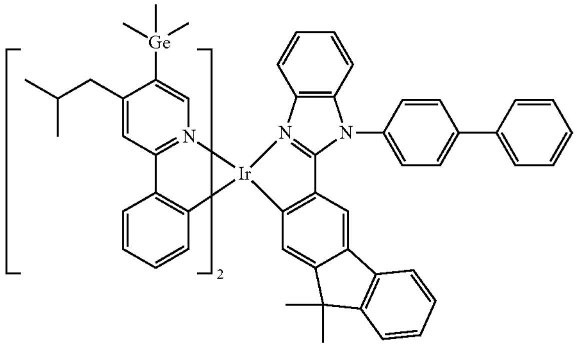
1266
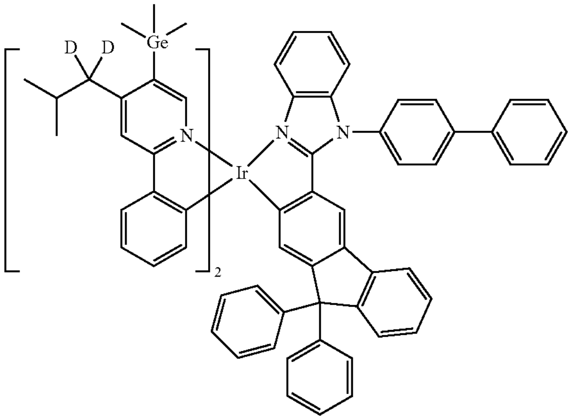
1267
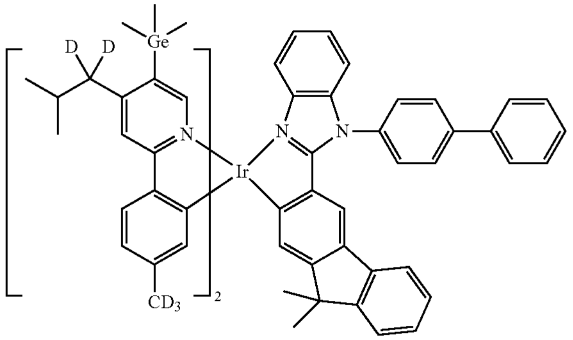
1268
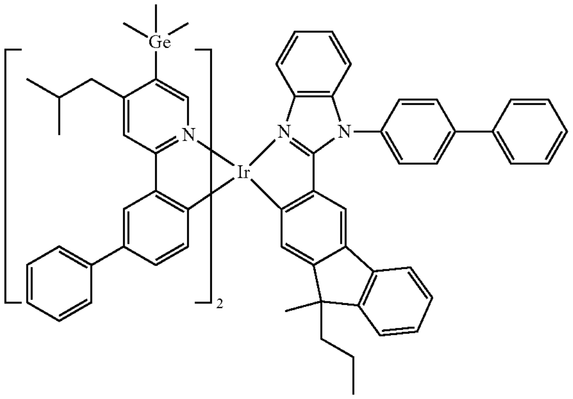

-continued
1269
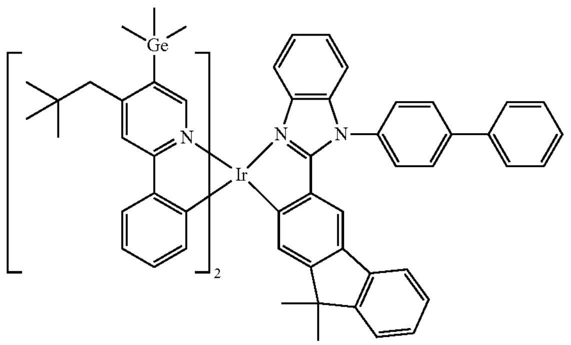
1270
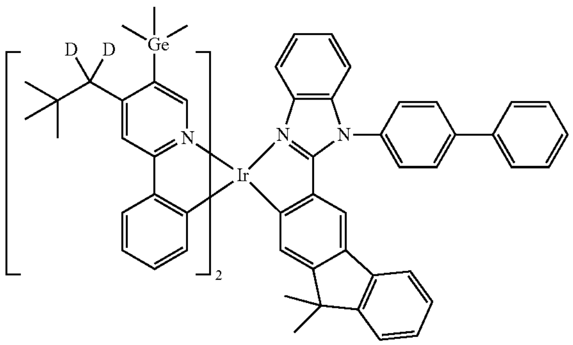
1271
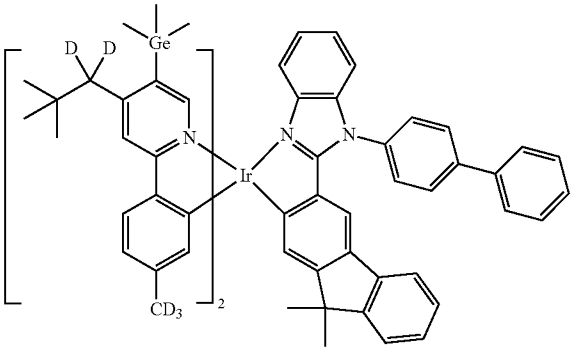
1272
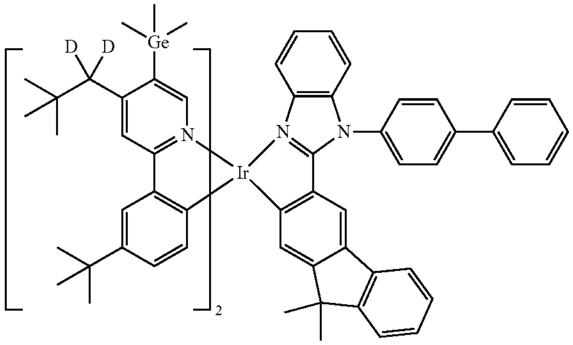
-continued
1273
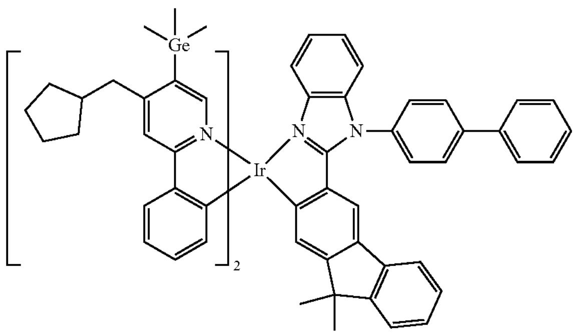
1274
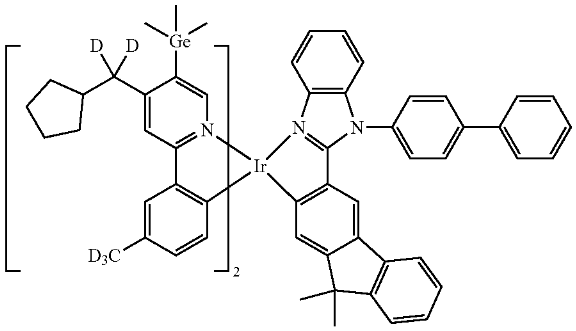
1275
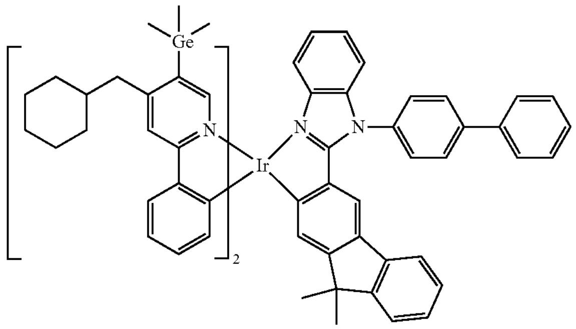
1276
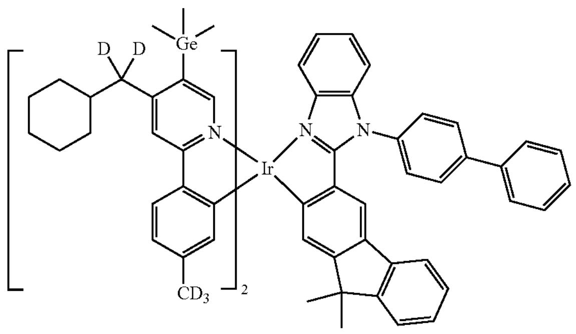

-continued
1277
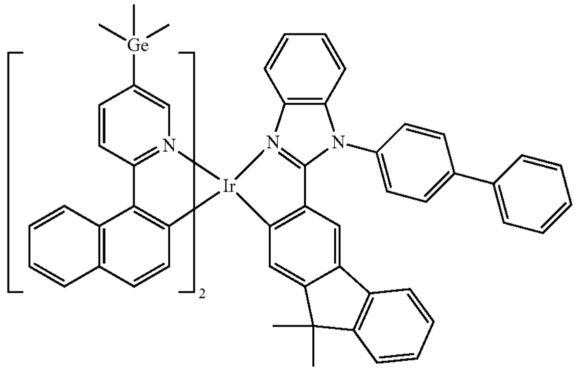
1278
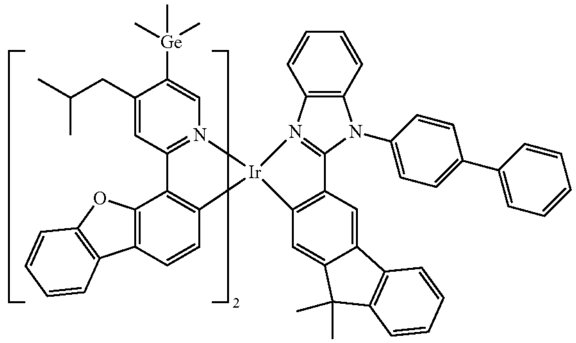
1279
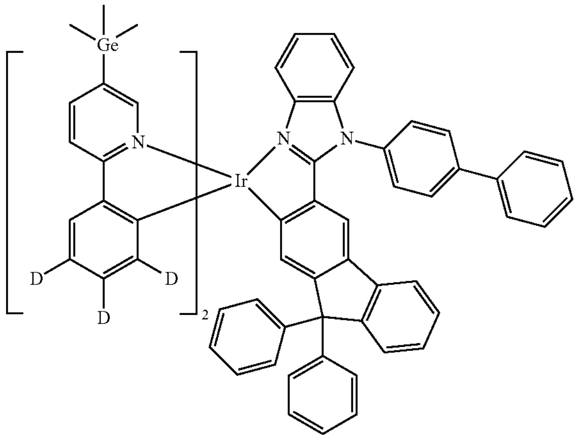
1280
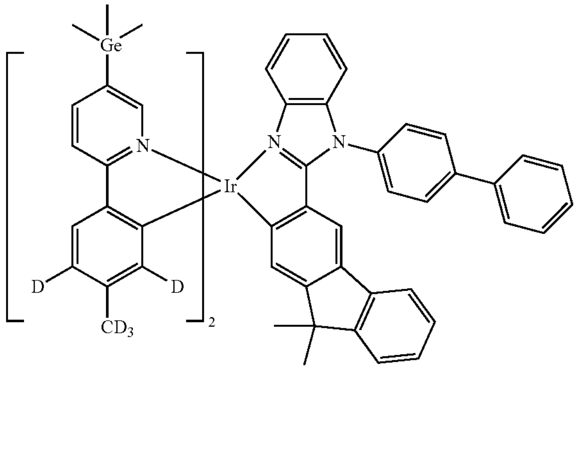
-continued
1281
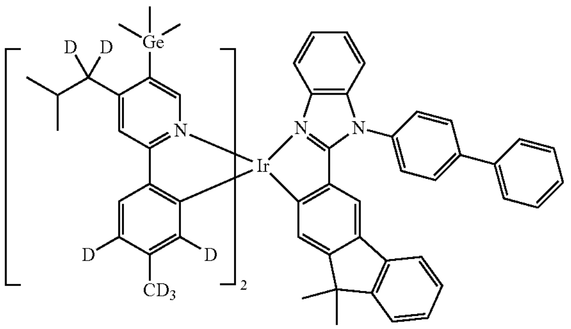
1282
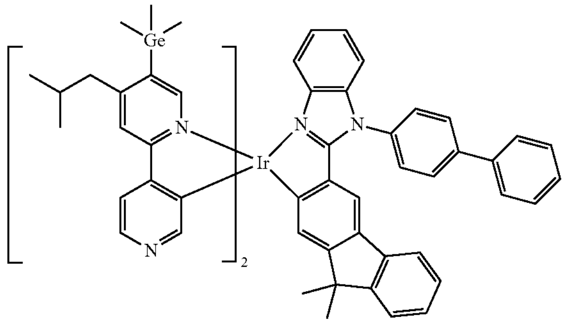
1283
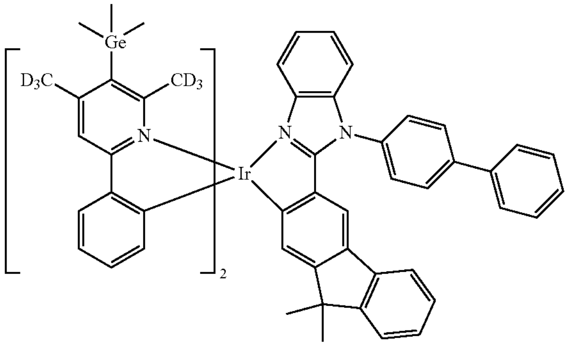
1284
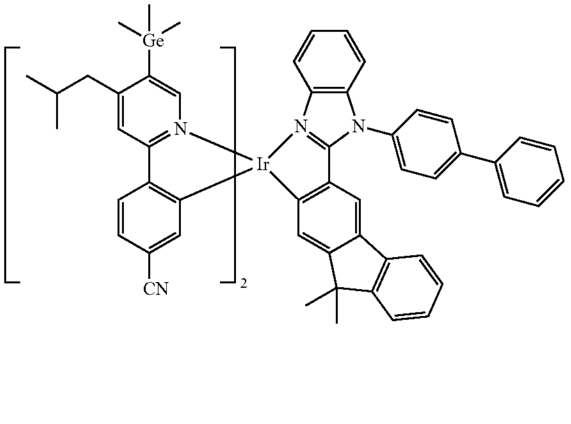

1285
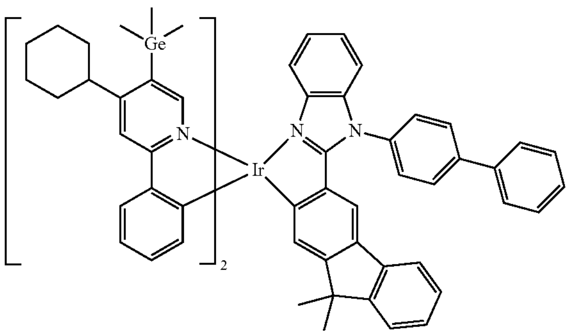
1286
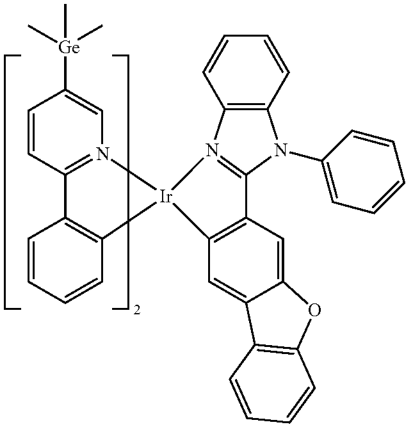
1287
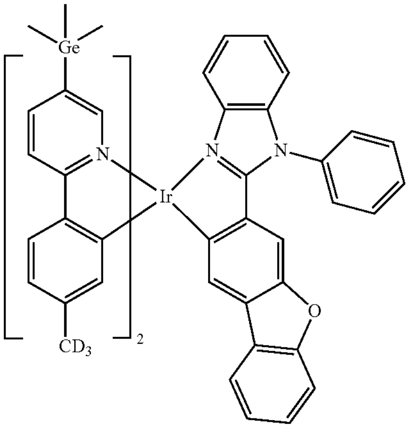
1288
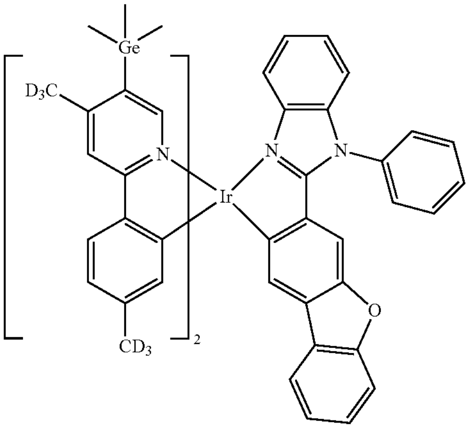
1289
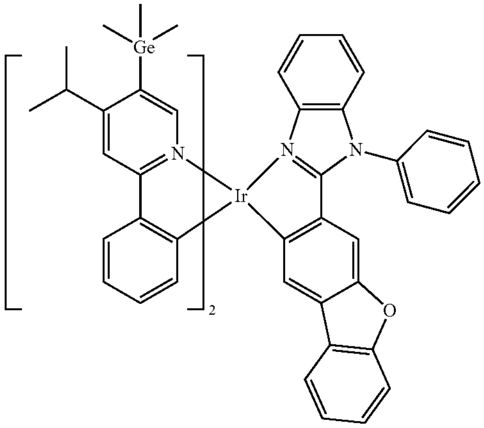
1290
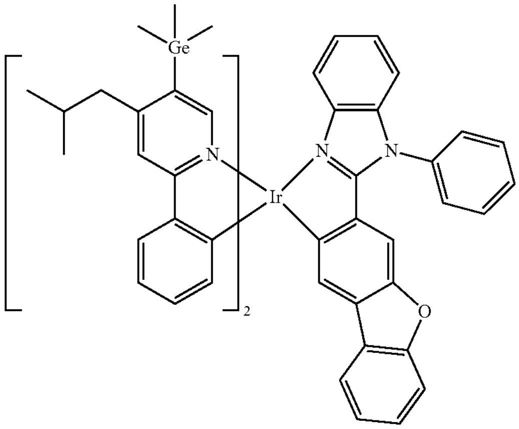
1291
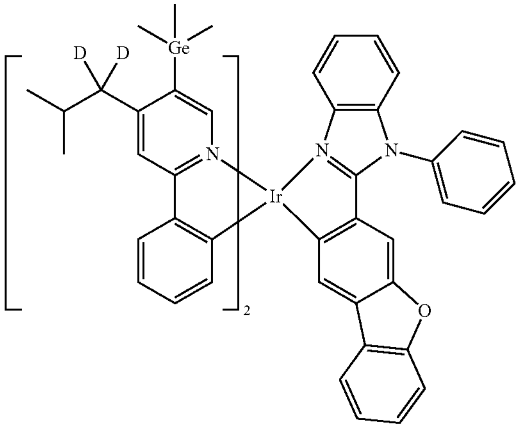

-continued
1292
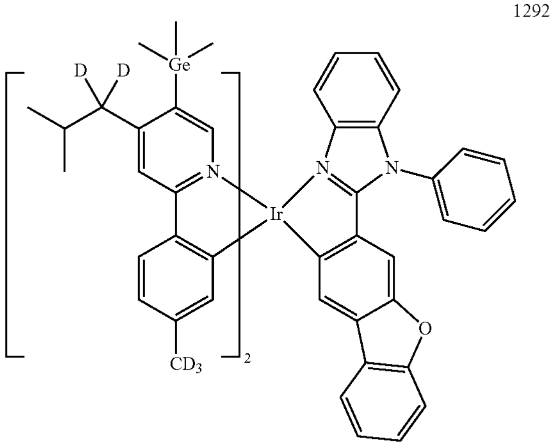
1293
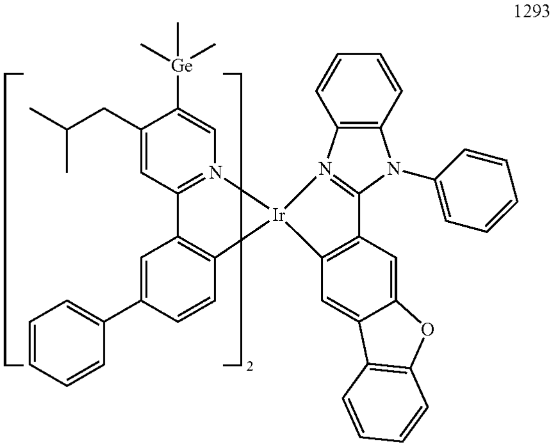
1294
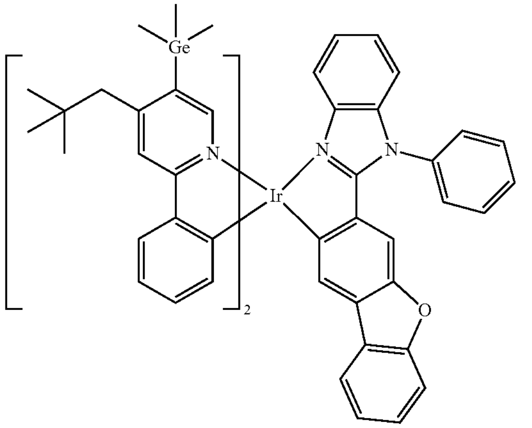
-continued
1295
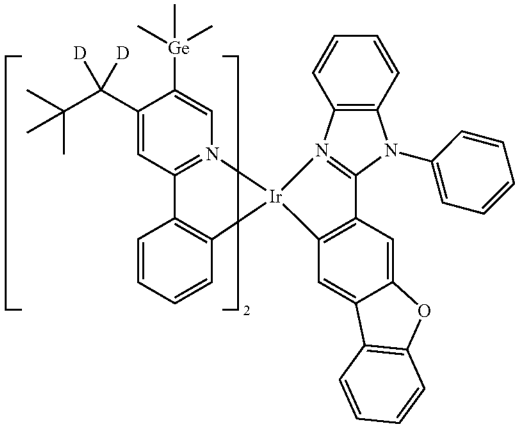
1296
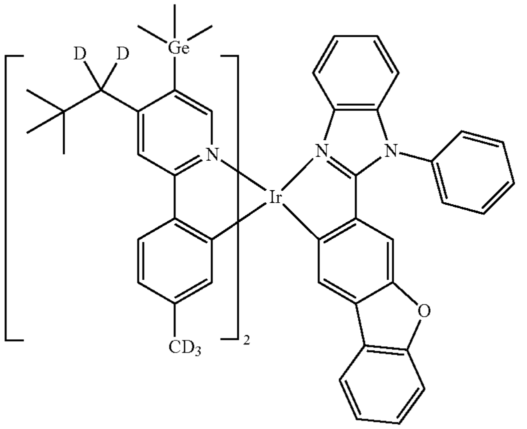
1297
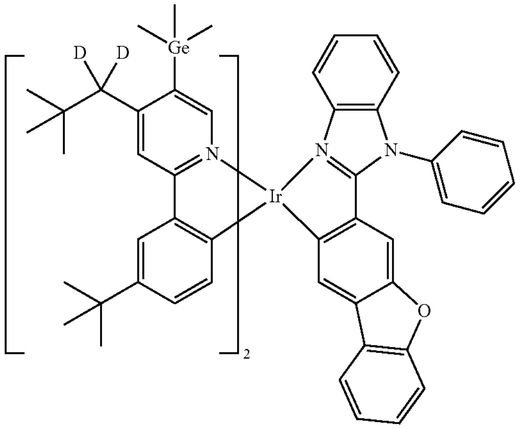

-continued
1298
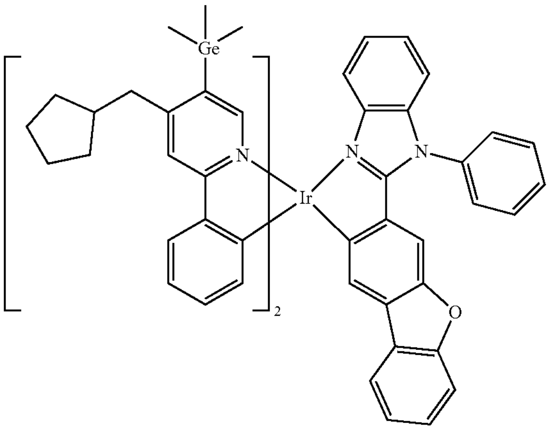
1299
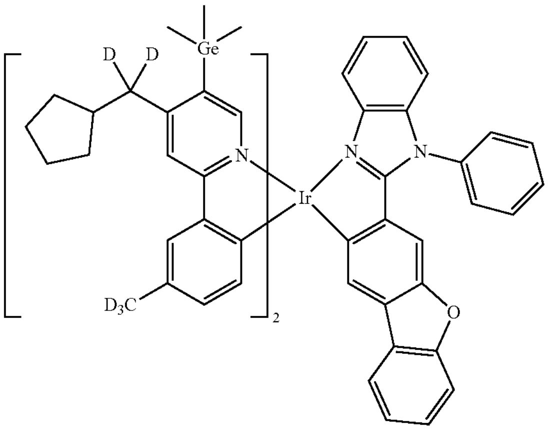
1300
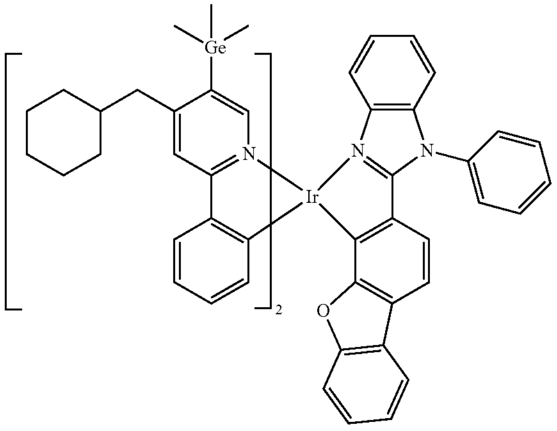
-continued
1301
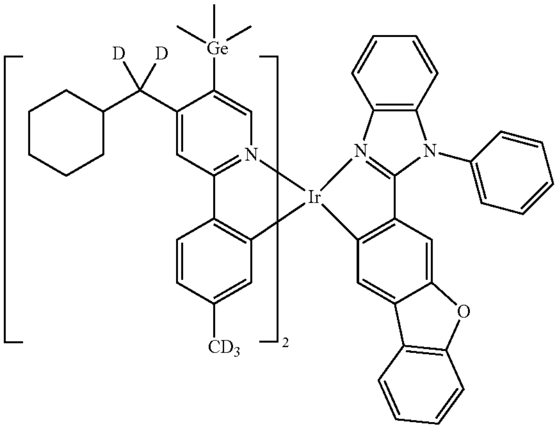
1302
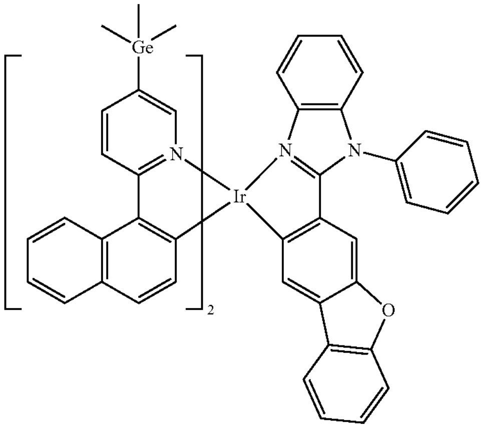
1303
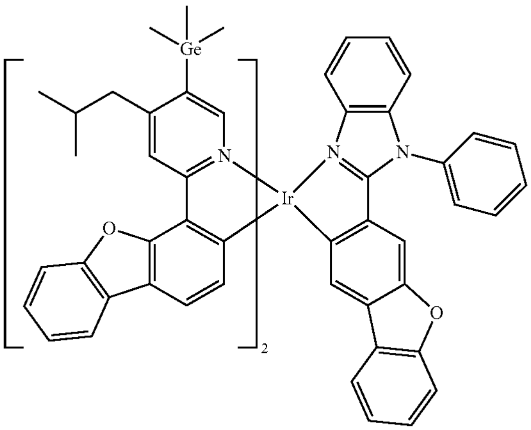

-continued
1304
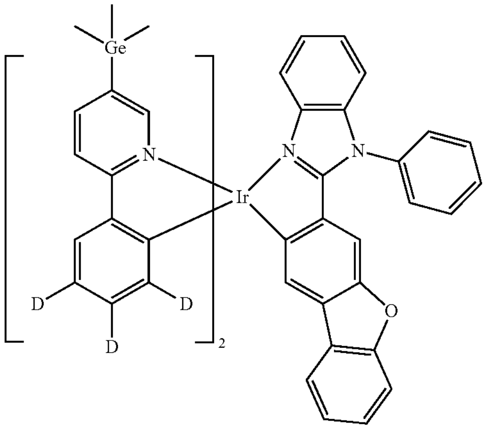
1305
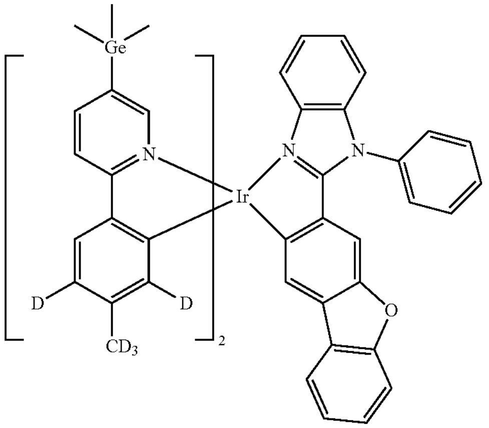
1306
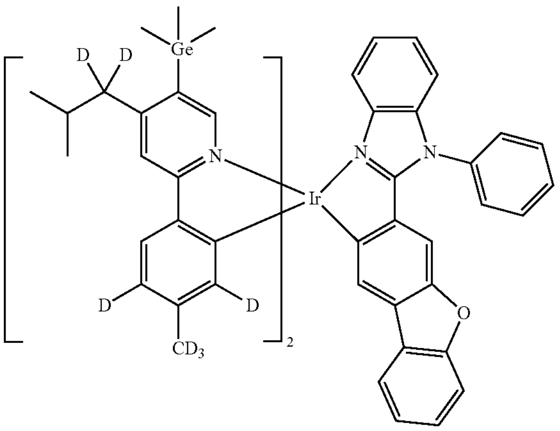
-continued
1307
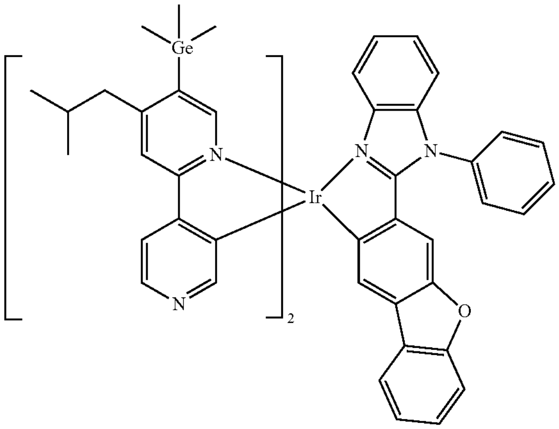
1308
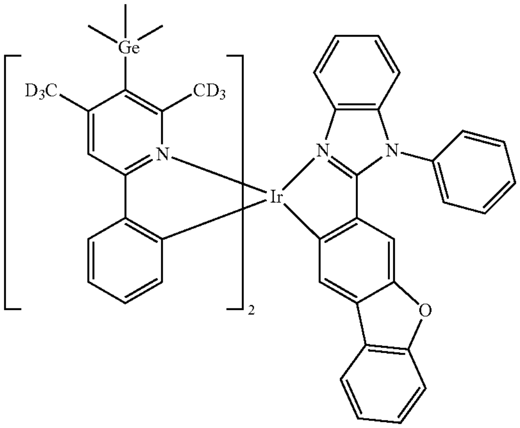
1309
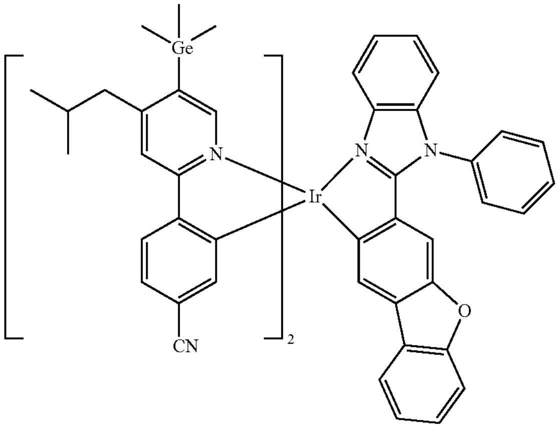

-continued
1310
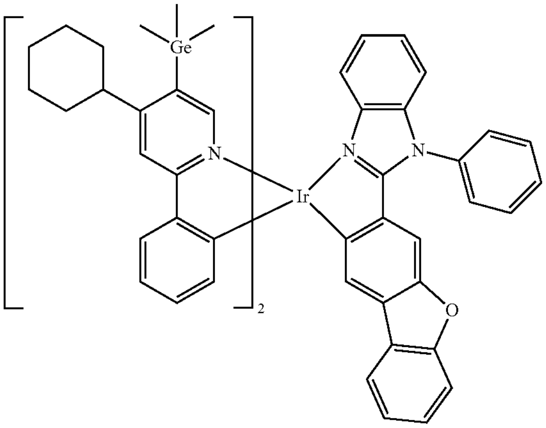
1311
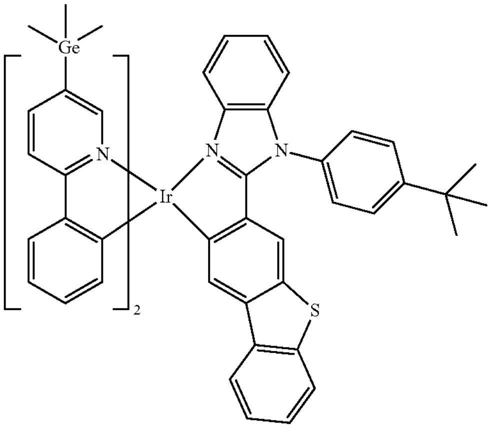
1312
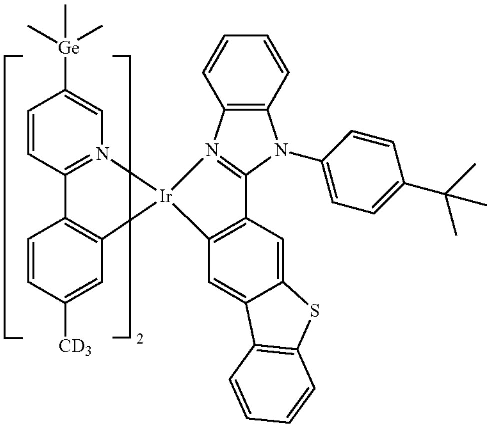
-continued
1313
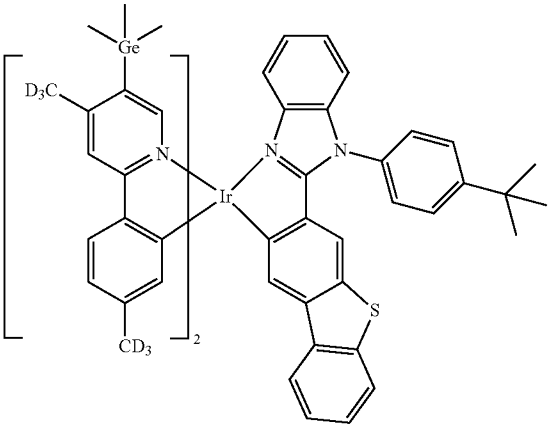
1314
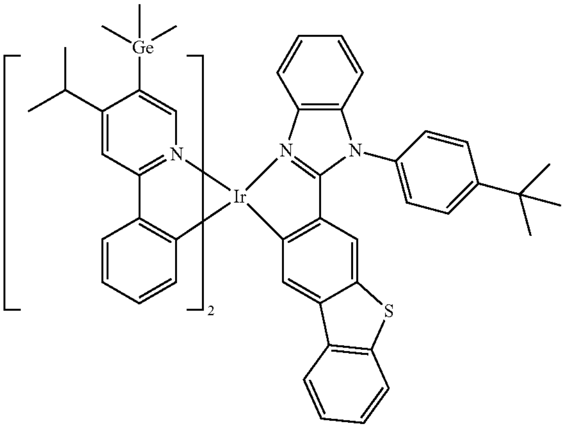
1315
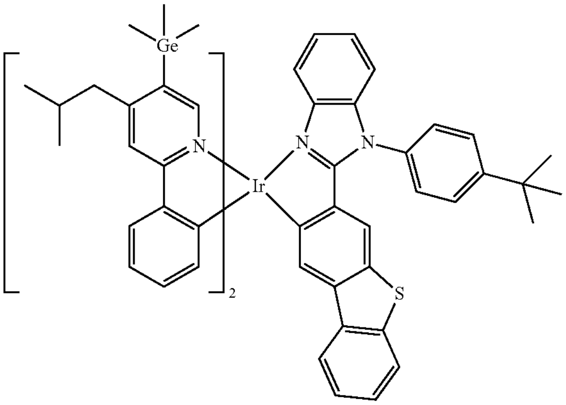

-continued
1316
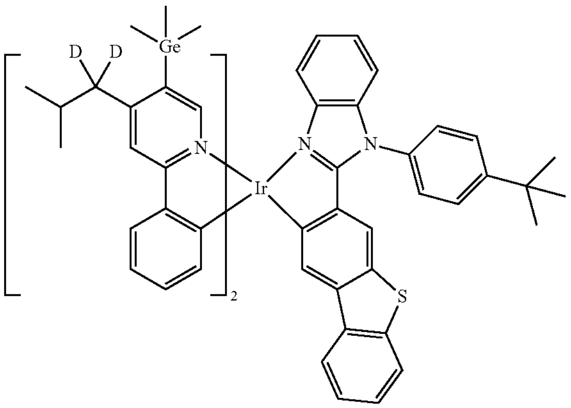
1317
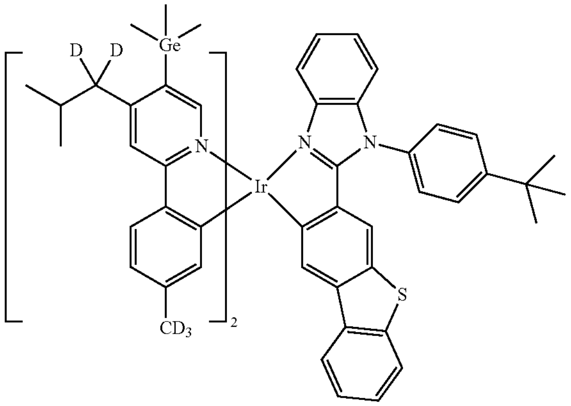
1318
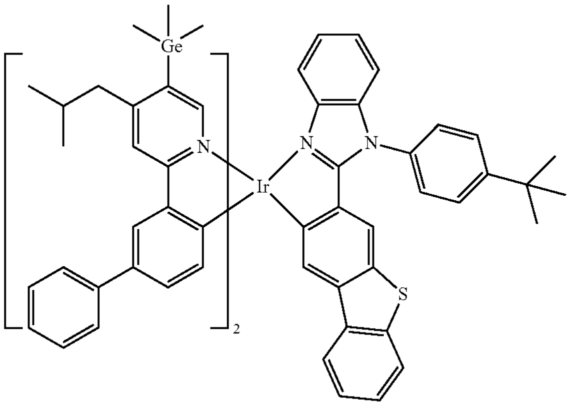
-continued
1319
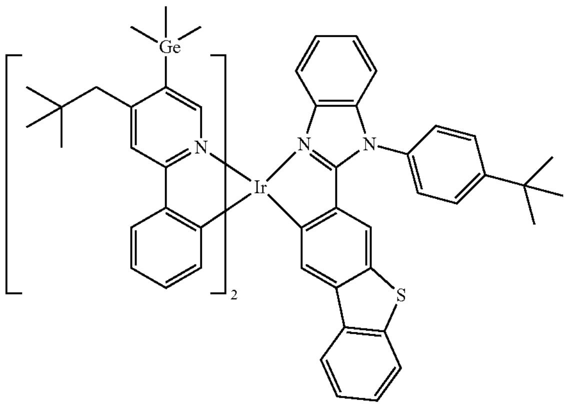
1320
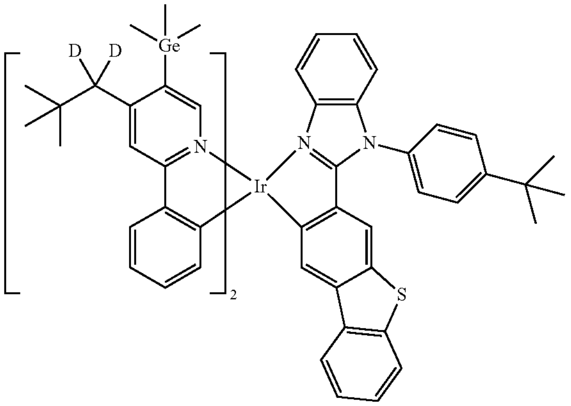
1321
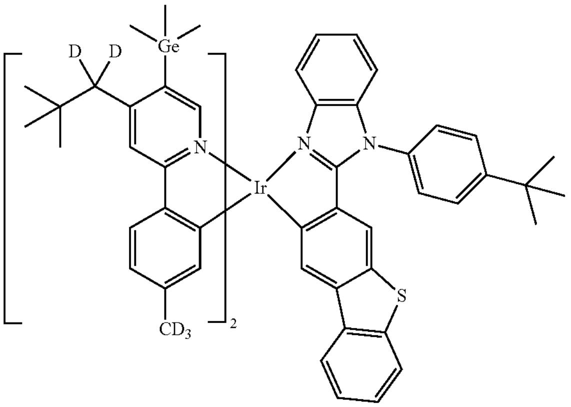

-continued
1322
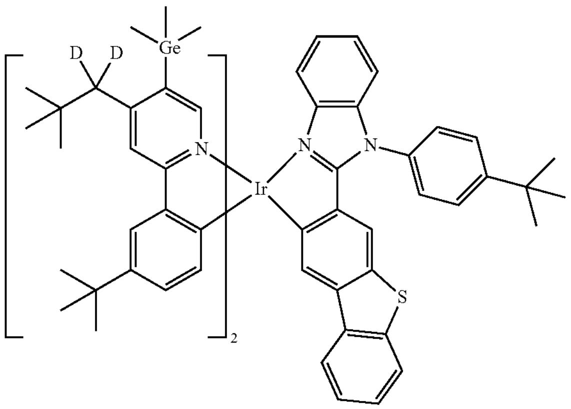
1323
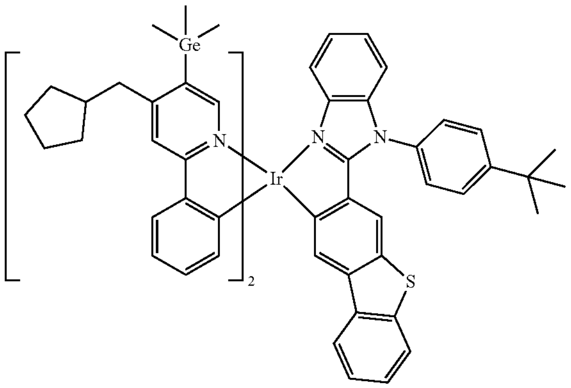
1324
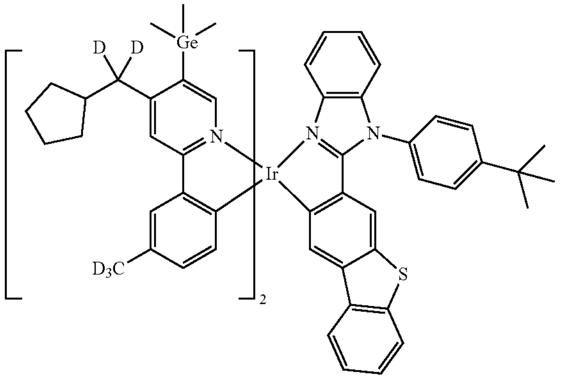
1325
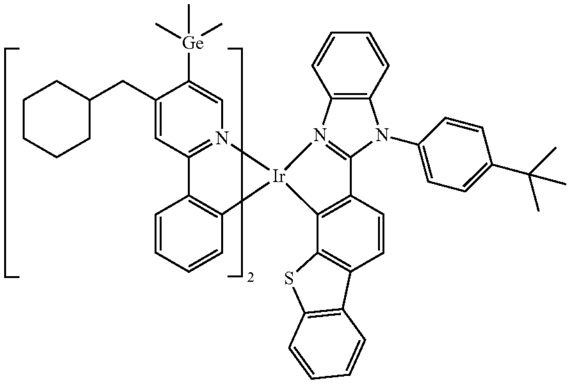
-continued
1326
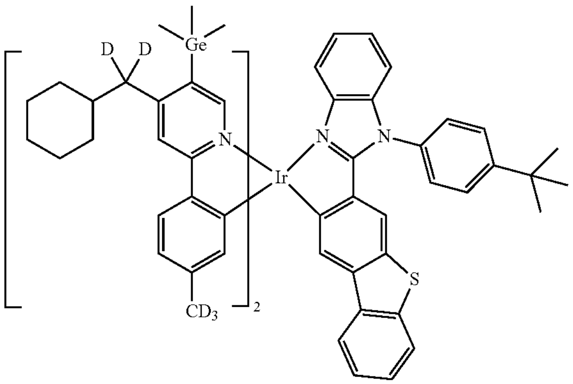
1327
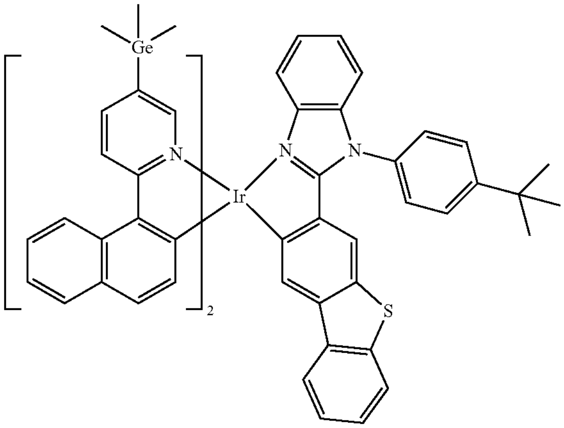
1328
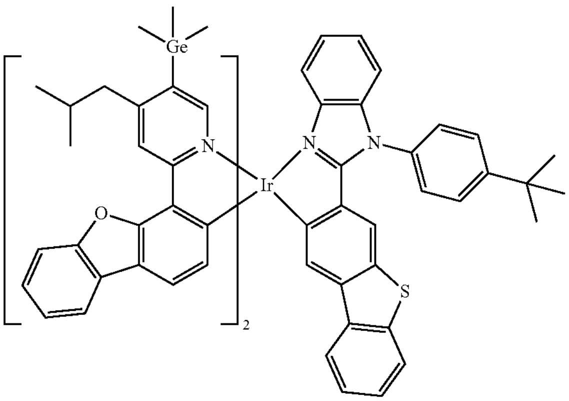

-continued
1329
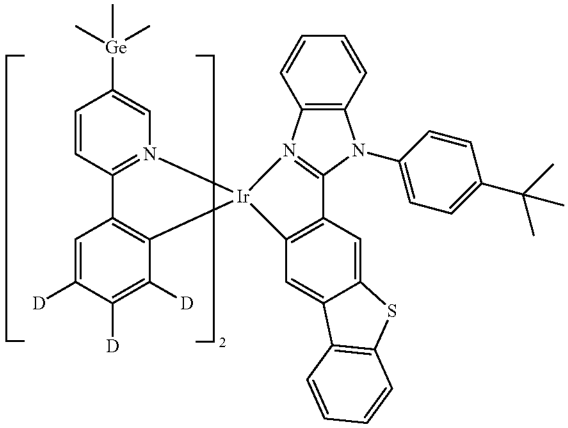
1330
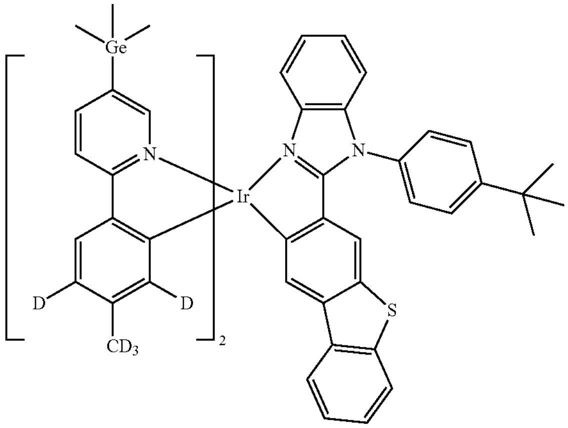
1331
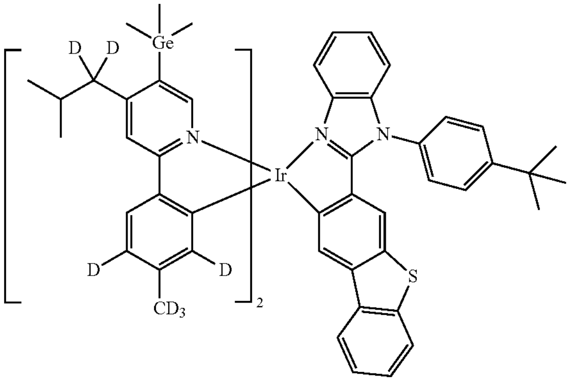
-continued
1332
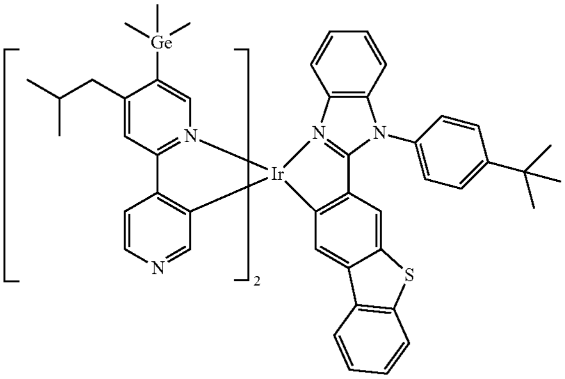
1333
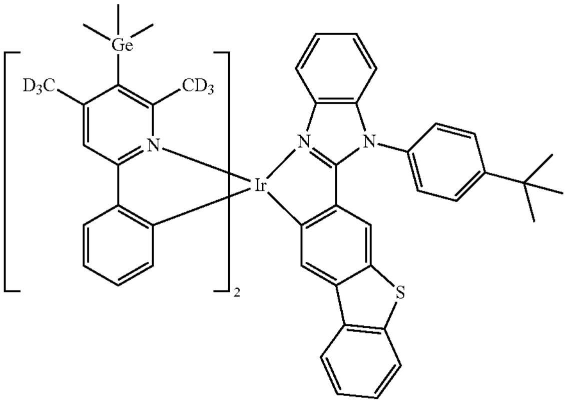
1334
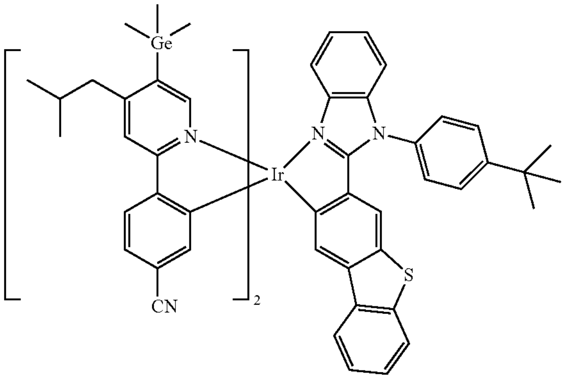
1335
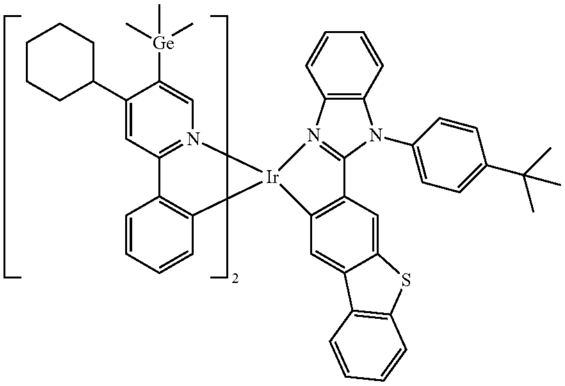

-continued
1336
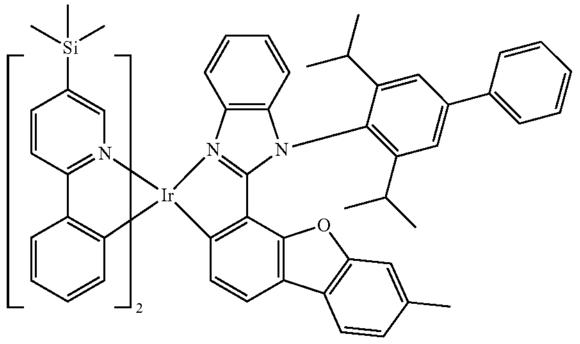
1337
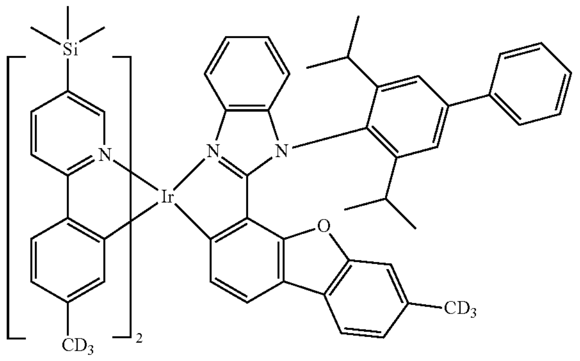
1338
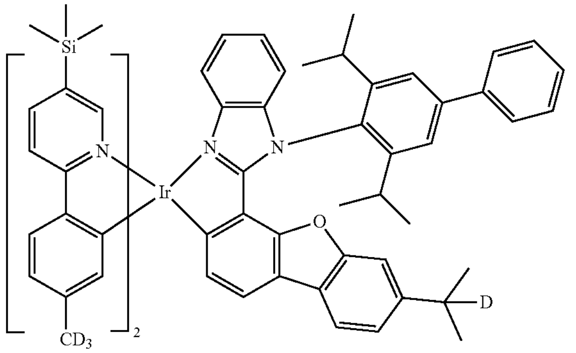
1339
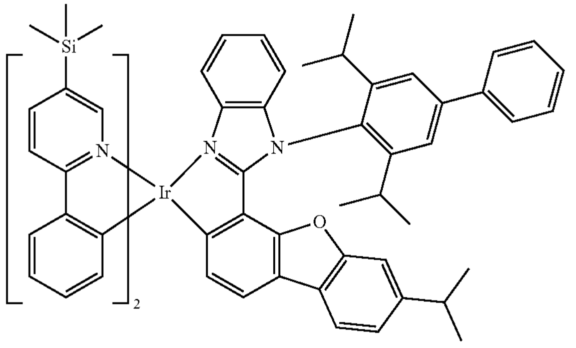
-continued
1340
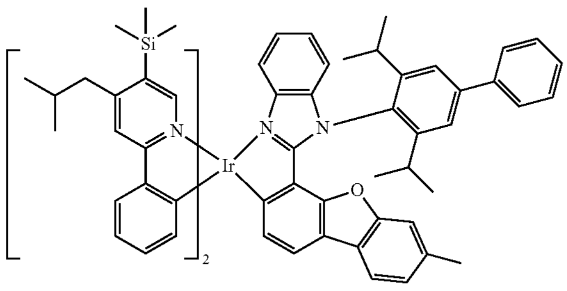
1341
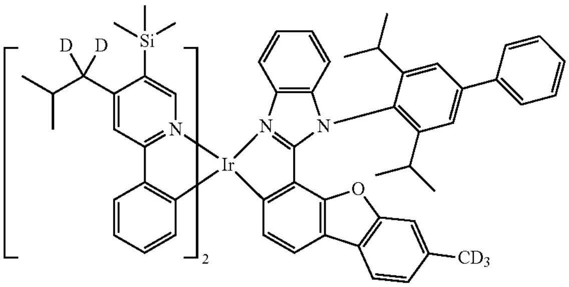
1342
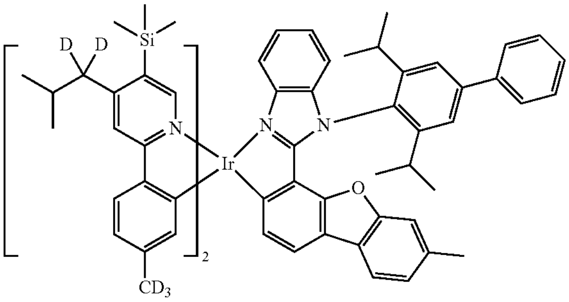
1343
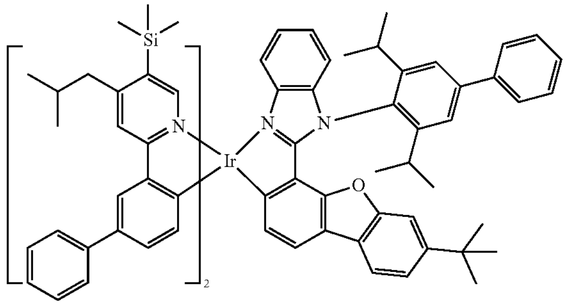
1344
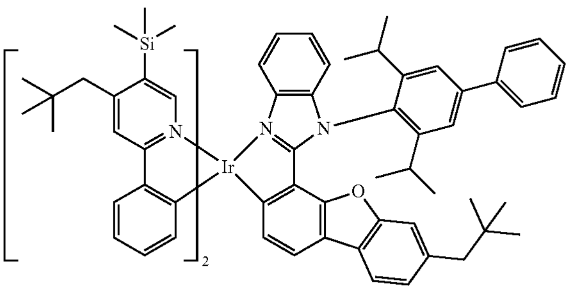

-continued
1345
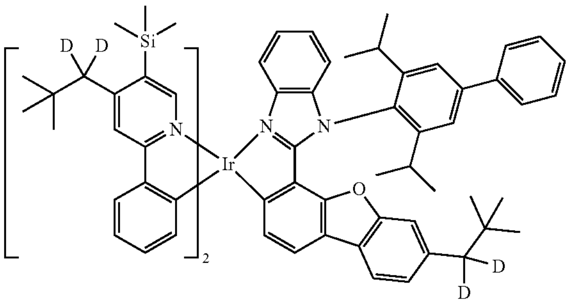
1346
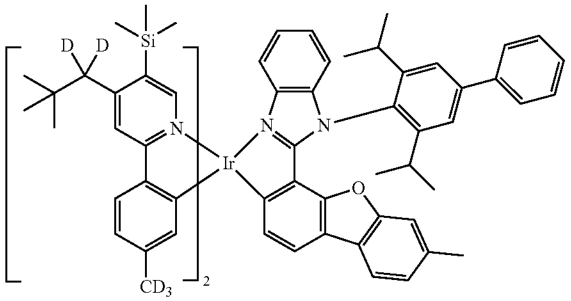
1347
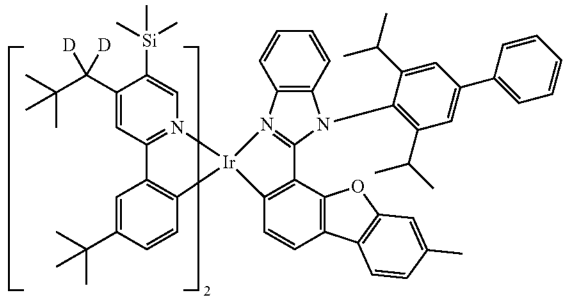
1348
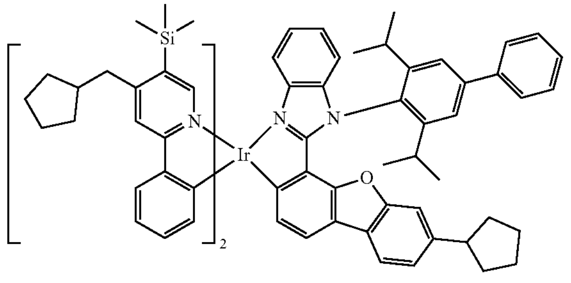
1349
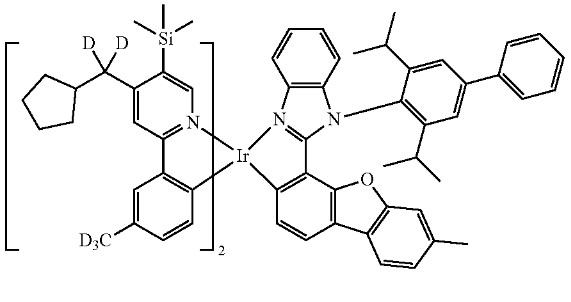
-continued
1350
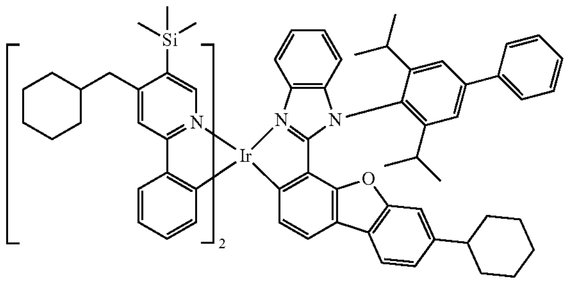
1351
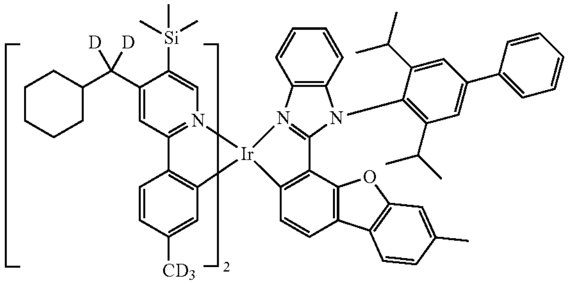
1352
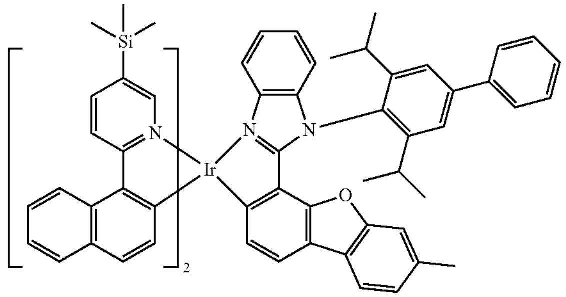
1353
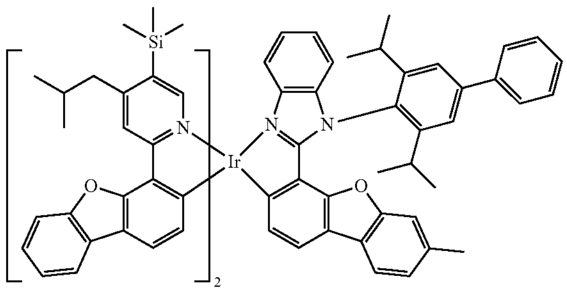
1354
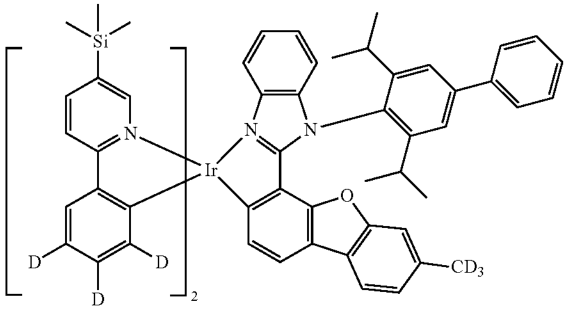

-continued
1355
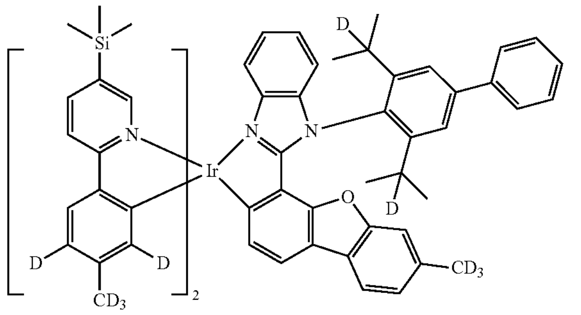
1356
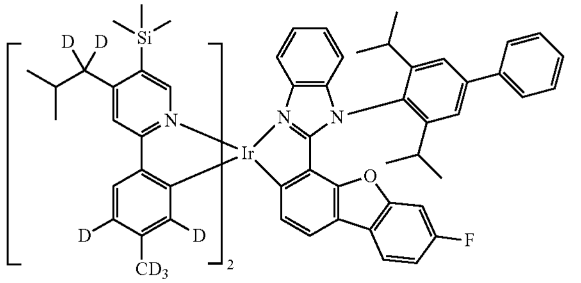
1357
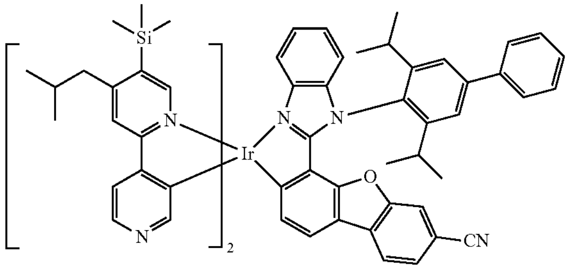
1358
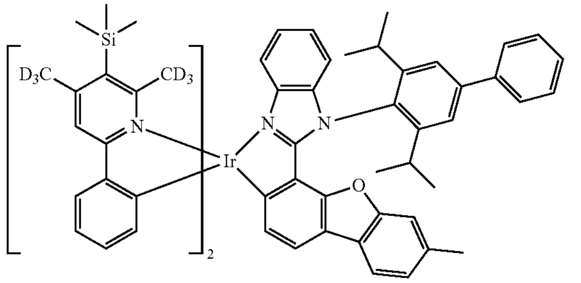
1359
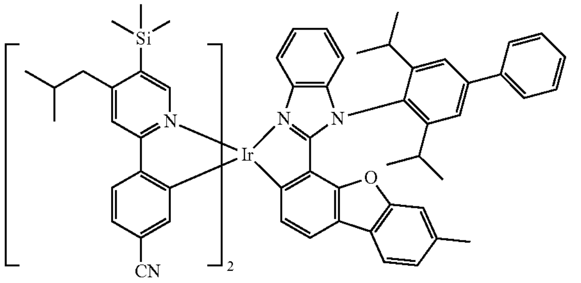
-continued
1360
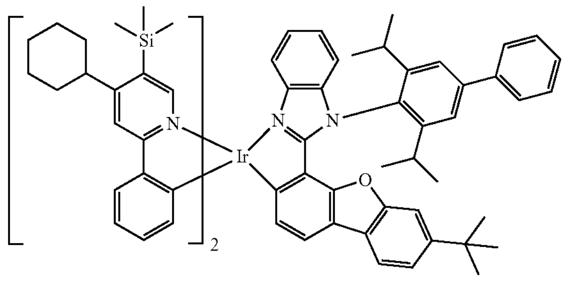
1361
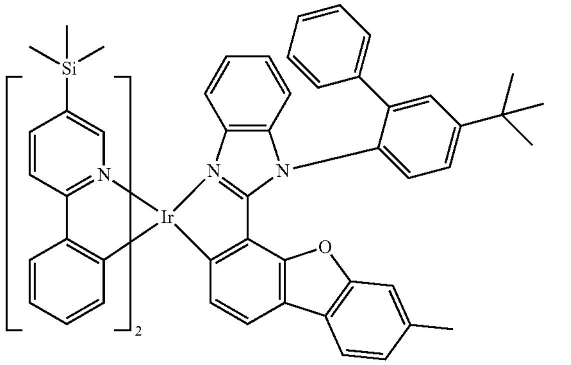
1362
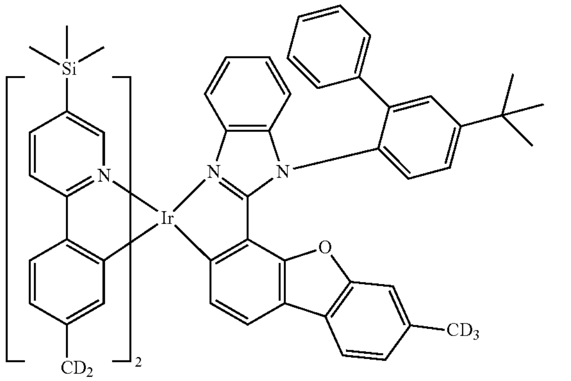
1363
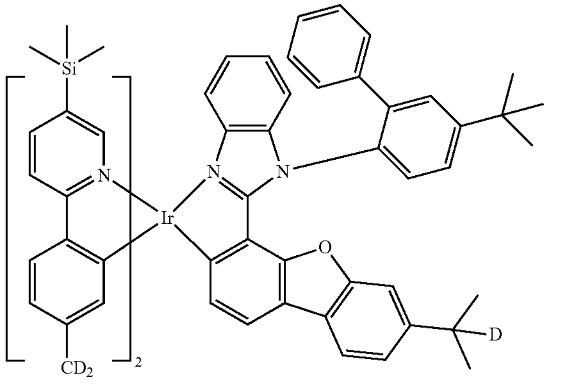

-continued
1364
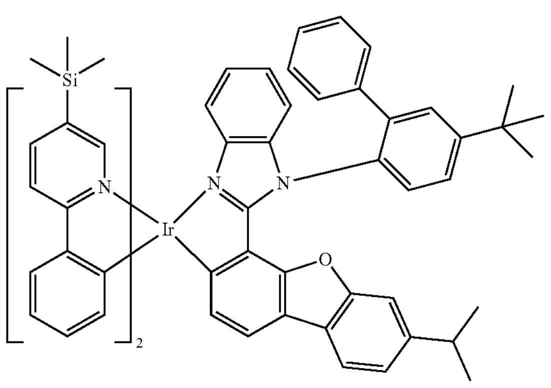
1365
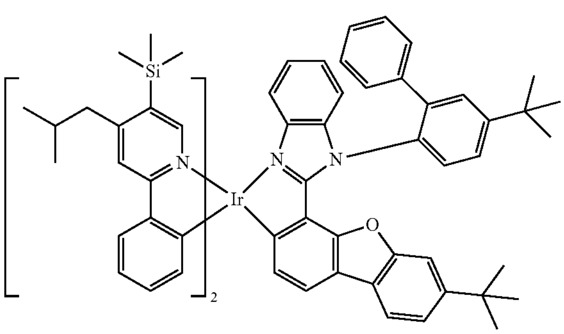
1366
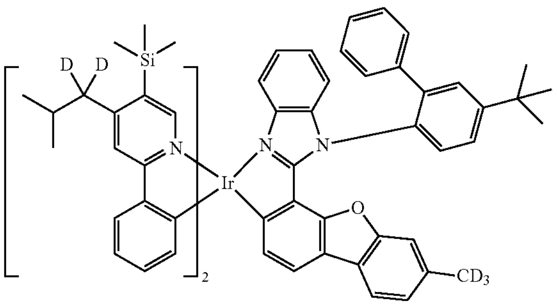
1367
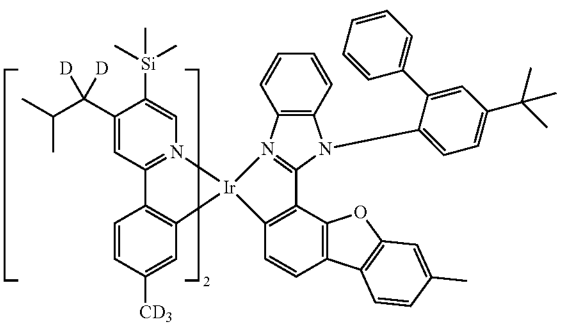
-continued
1368
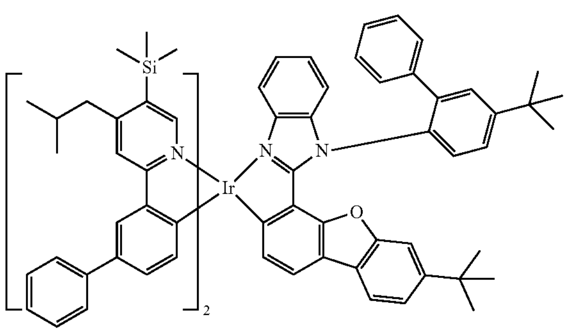
1369
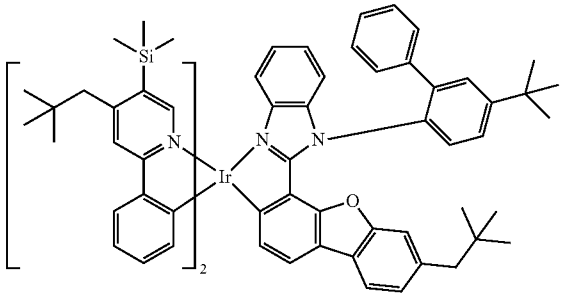
1370
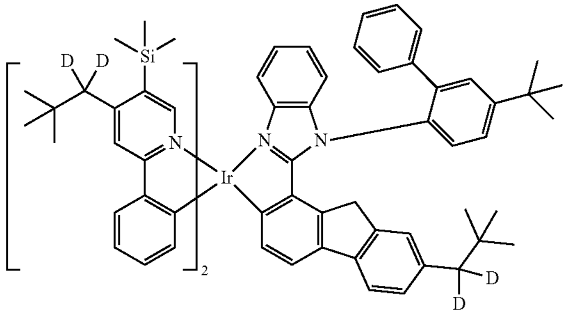
1371
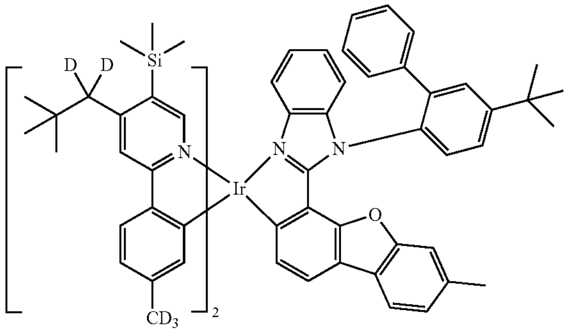

-continued
1372
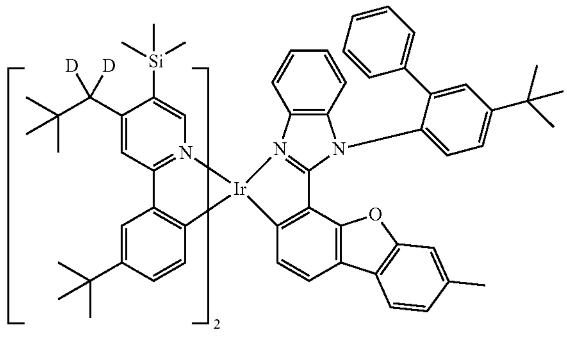
1373
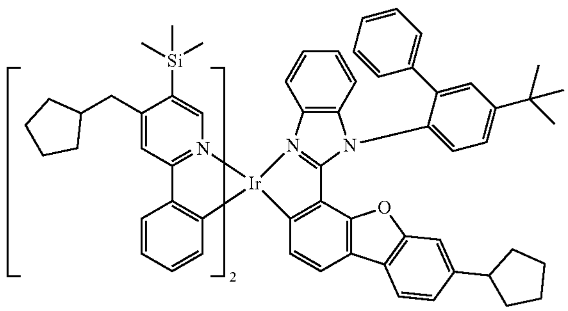
1374
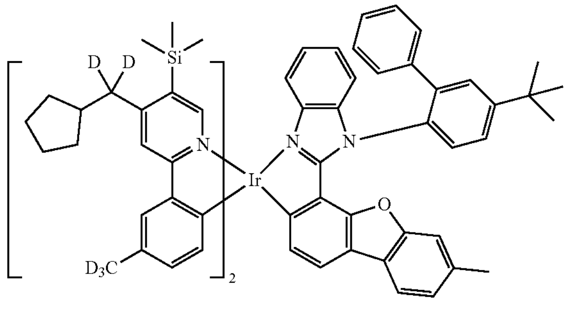
1375
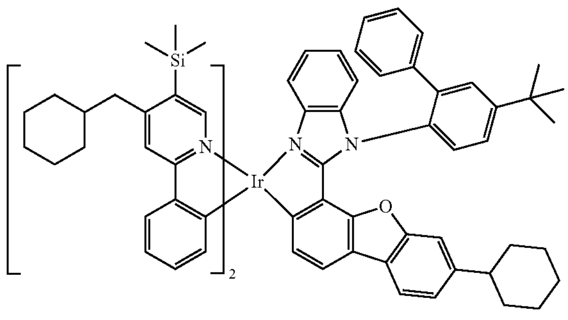
-continued
1376
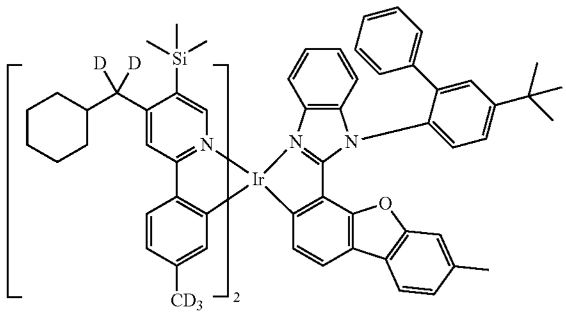
1377
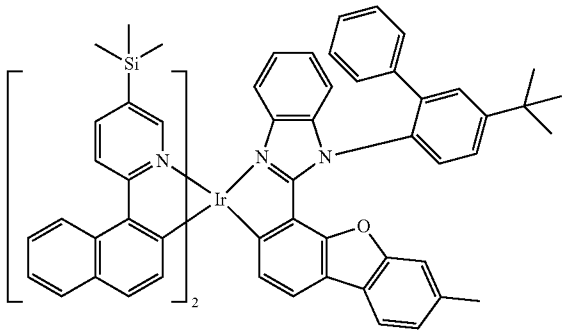
1378
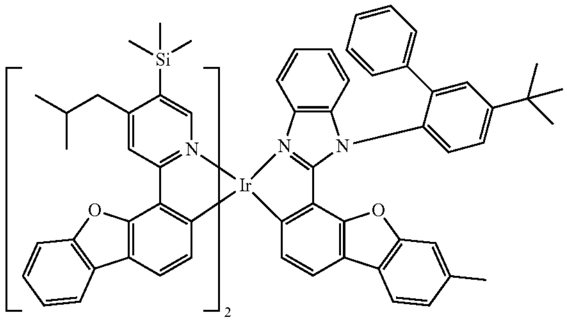
1379
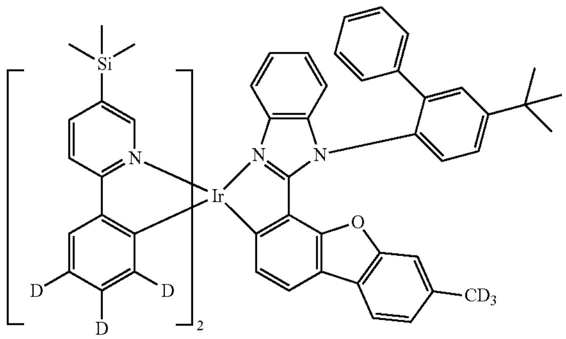

-continued
1380
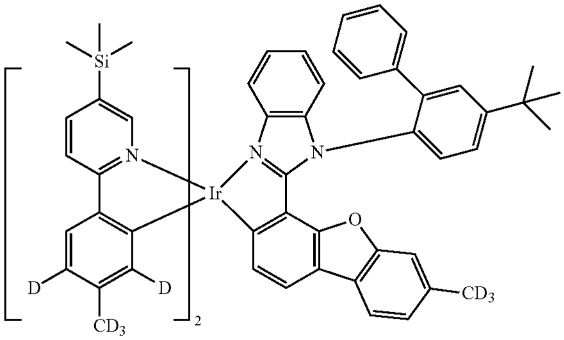
1381
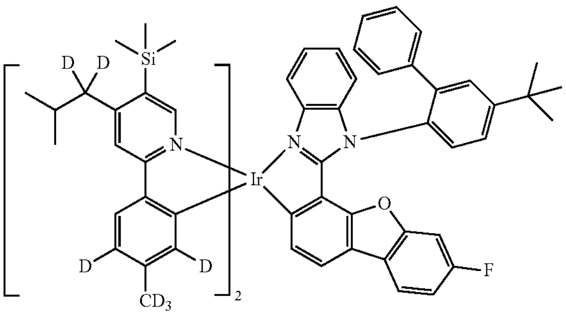
1382
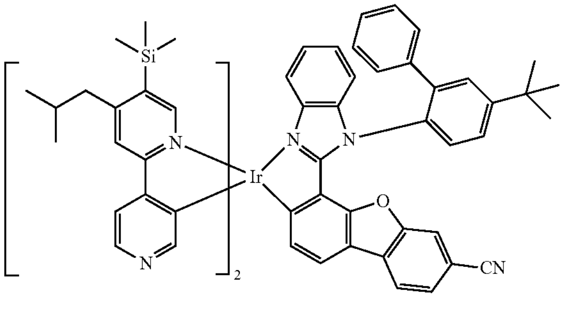
1383
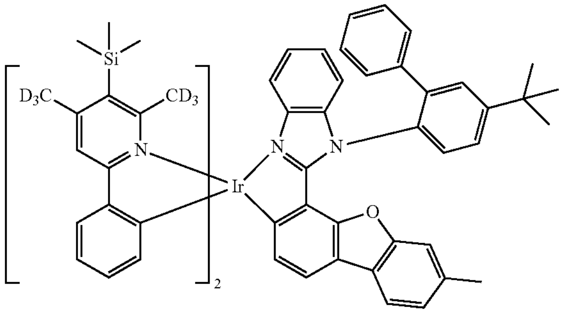
-continued
1384
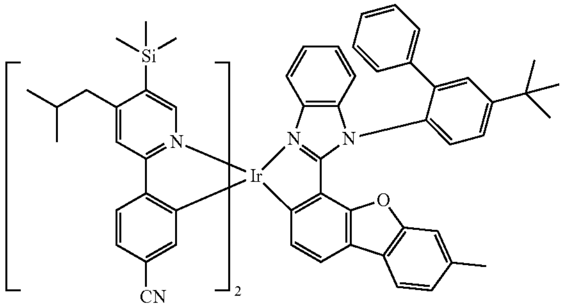
1385
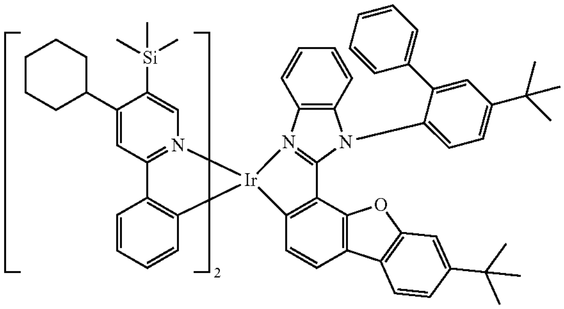
1386
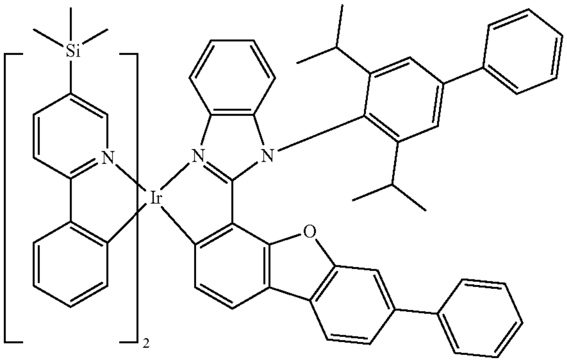
1387
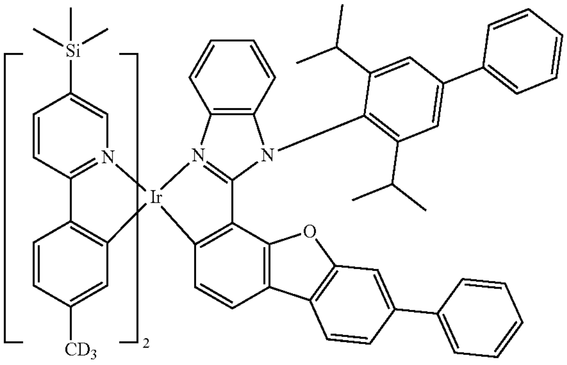

-continued
1388
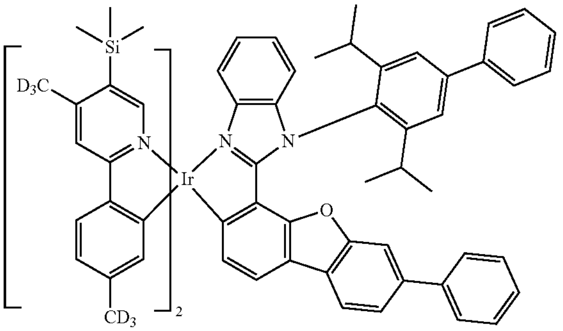
1389
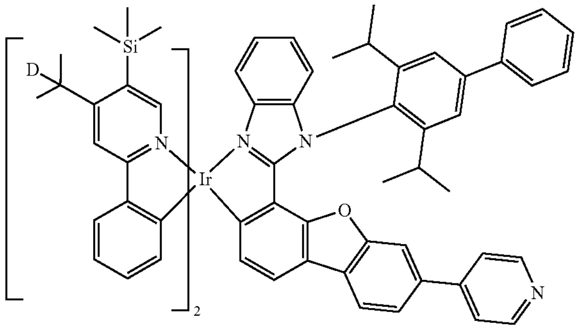
1390
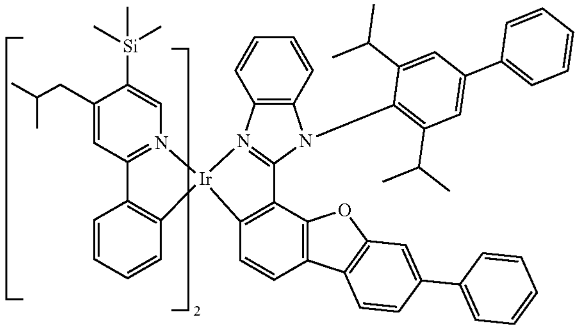
1391
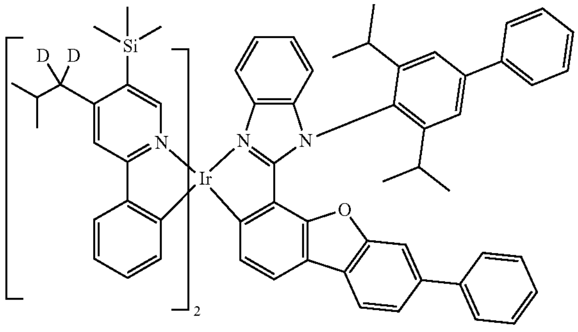
-continued
1392
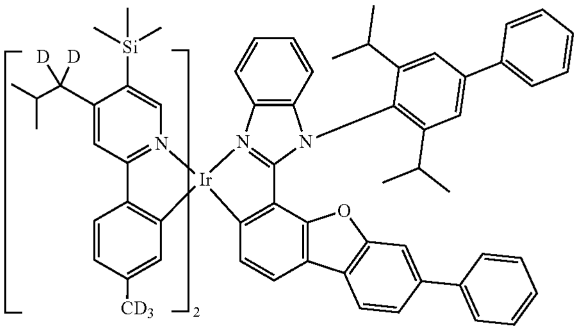
1393
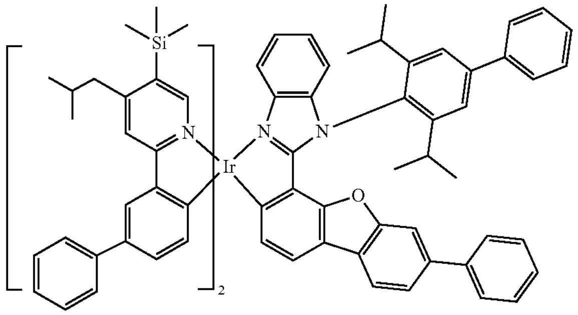
1394
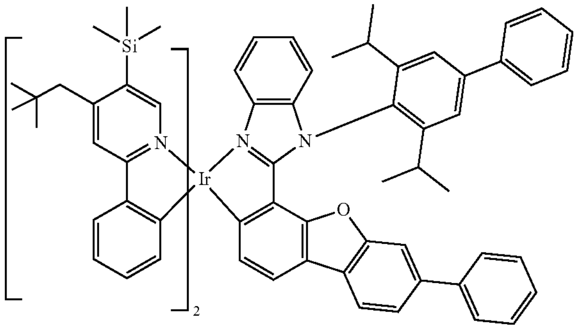
1395
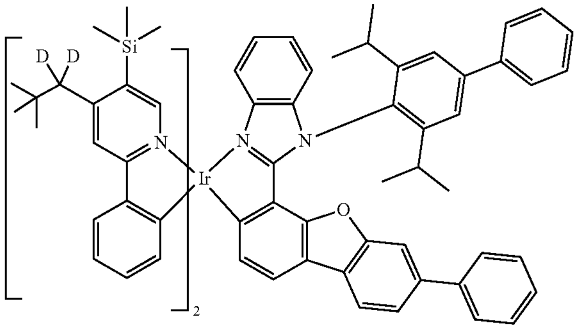

-continued
1396
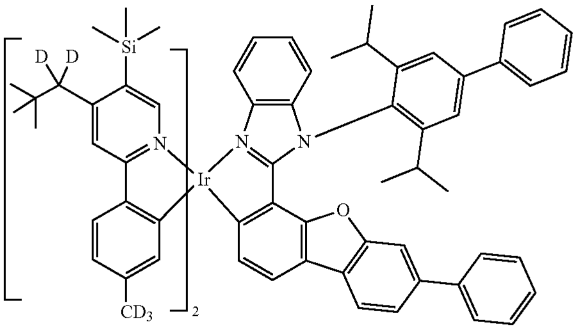
1397
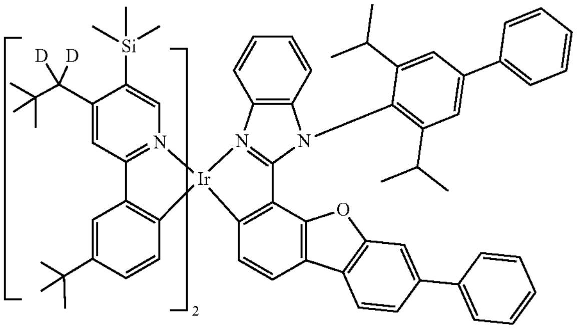
1398
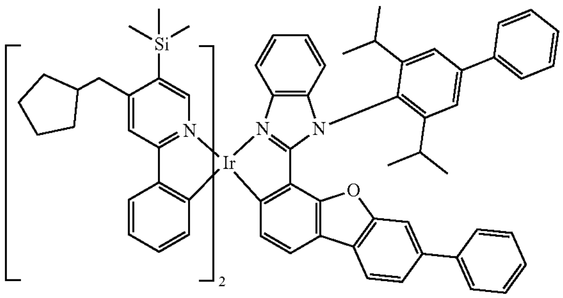
1399
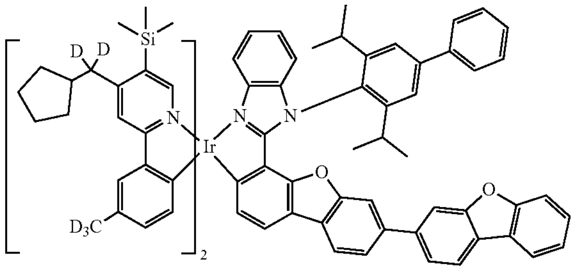
1400
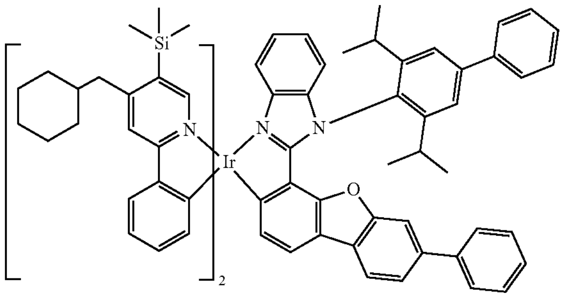
-continued
1401
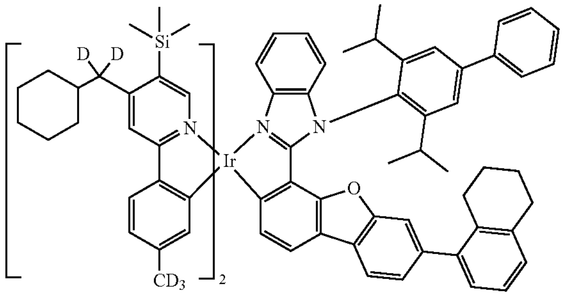
1402
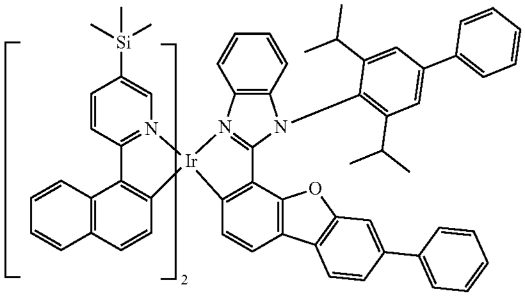
1403
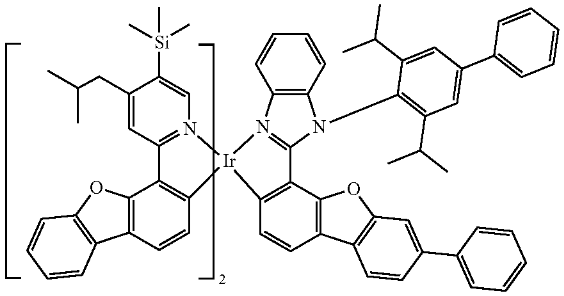
1404
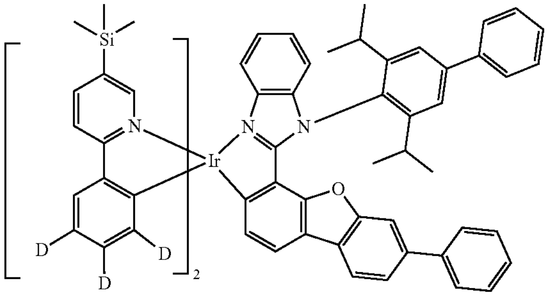
1405
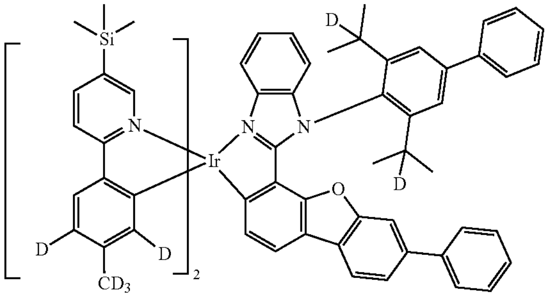

-continued
1406
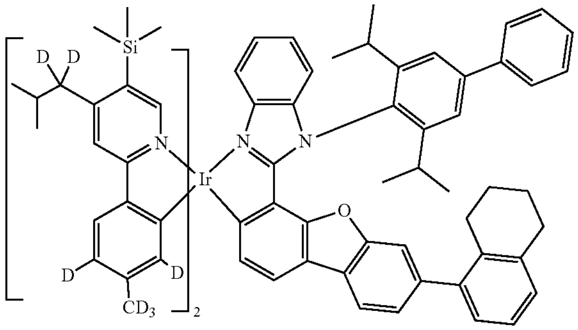
1407
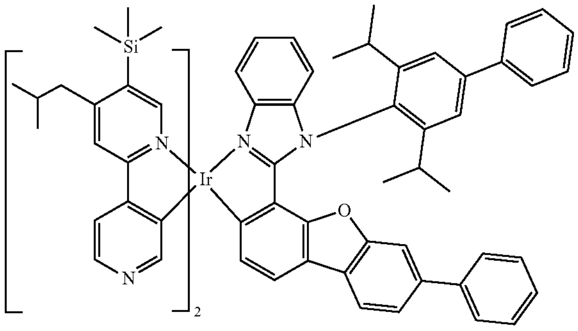
1408
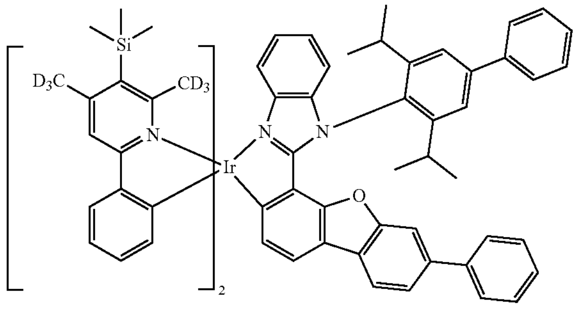
1409
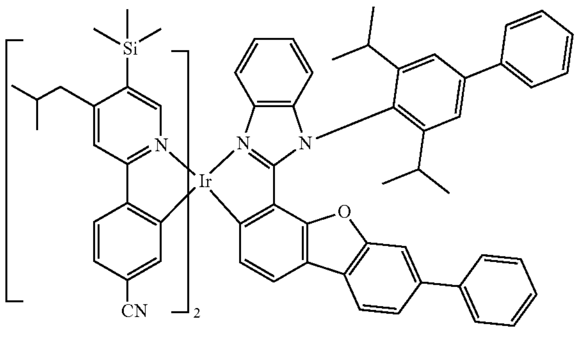
-continued
1410
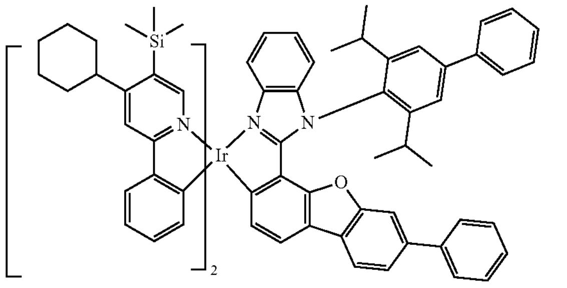
1411
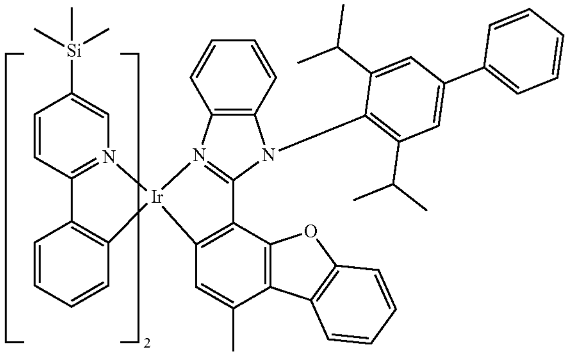
1412
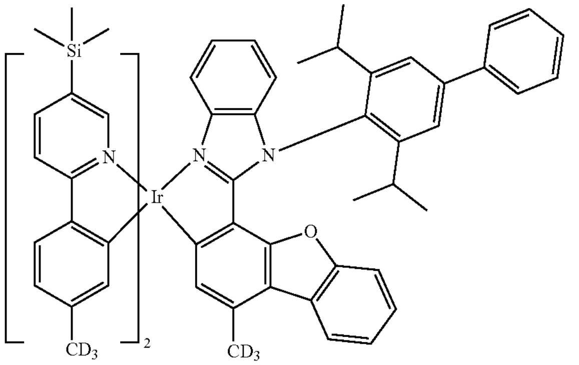
1413
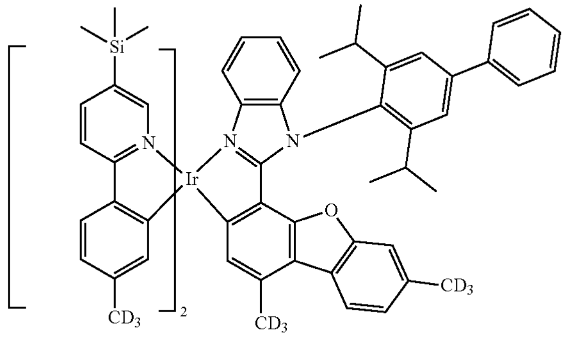

-continued
1414
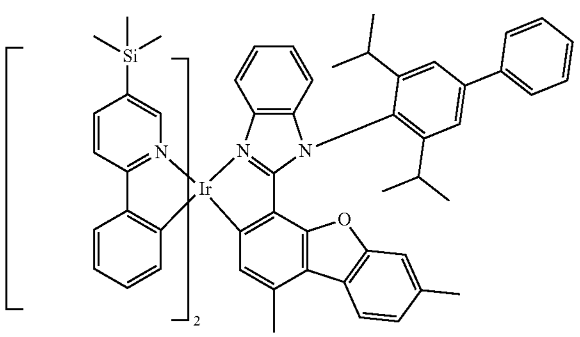
1415
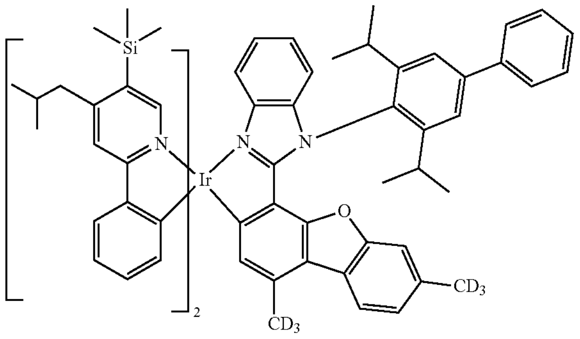
1416
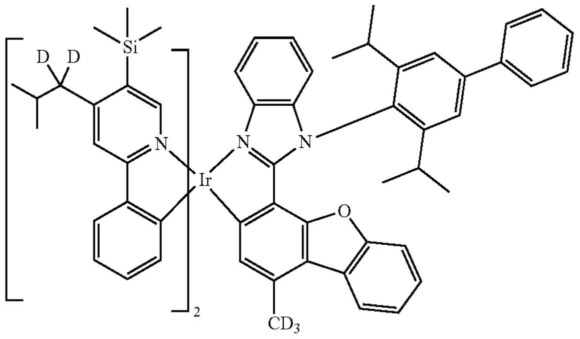
1417
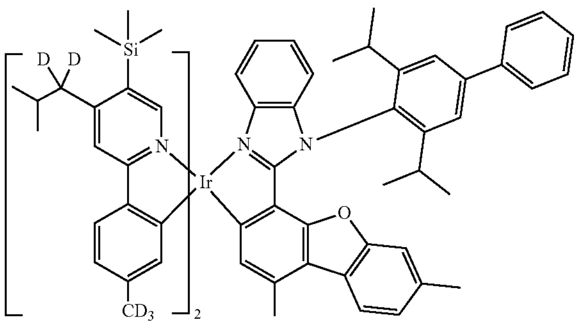
-continued
1418
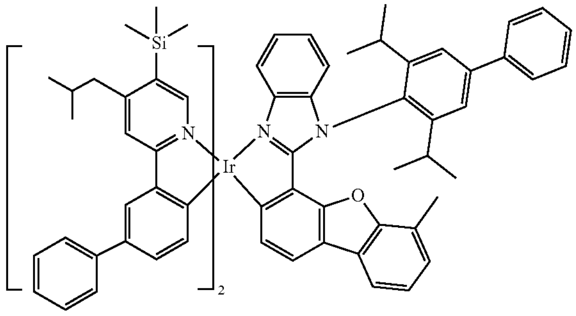
1419
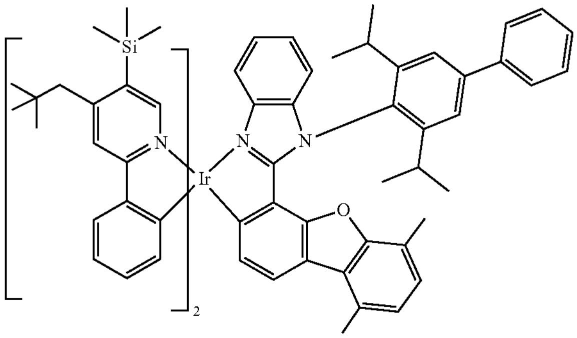
1420
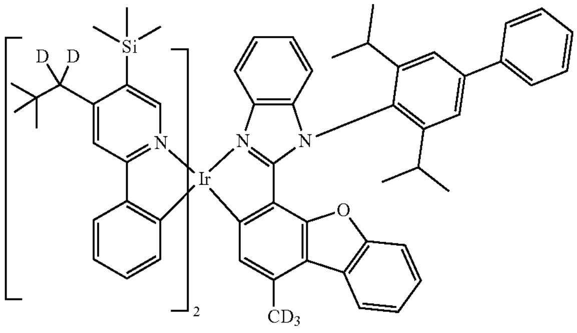
1421
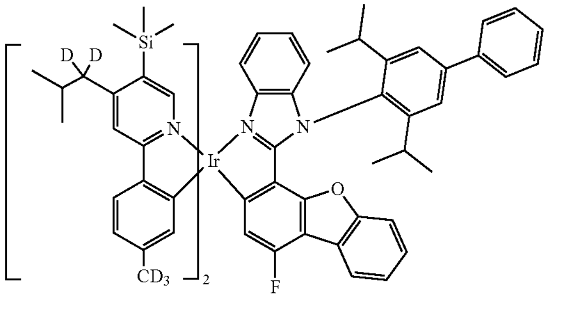

-continued
1422
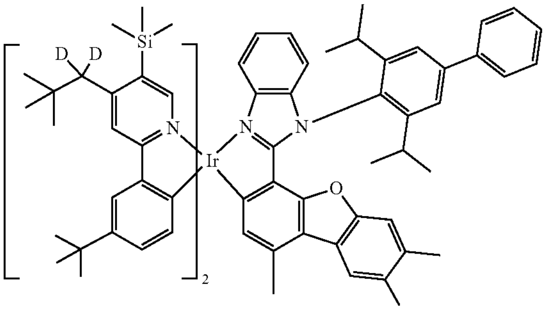
1423
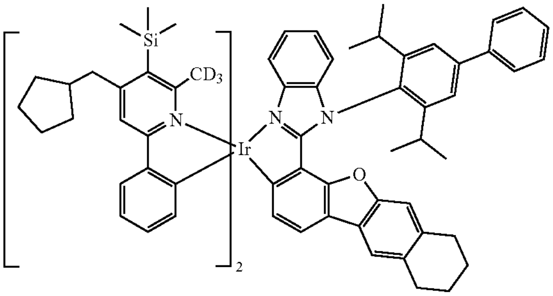
1424
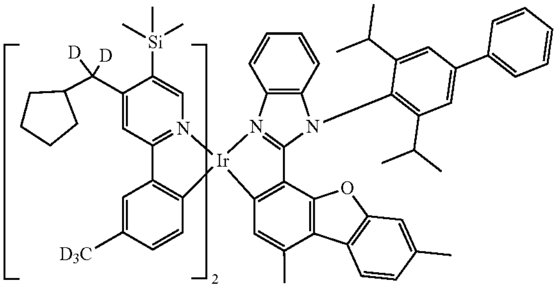
1425
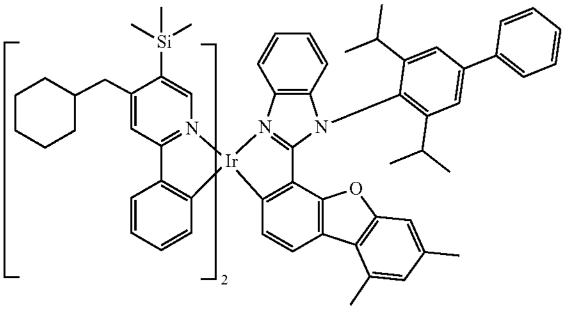
1426
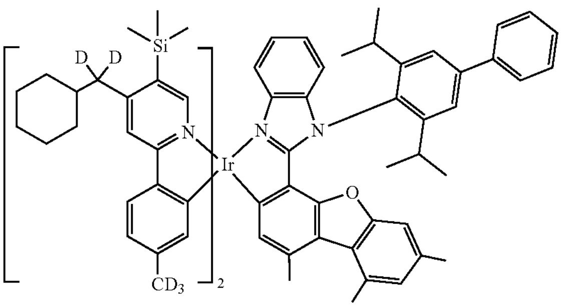
-continued
1427
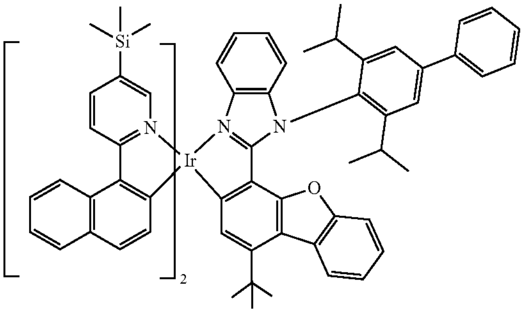
1428
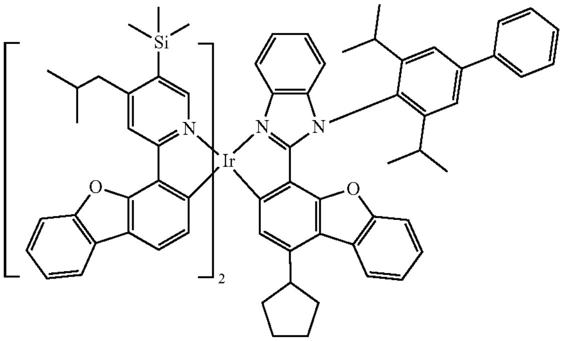
1429
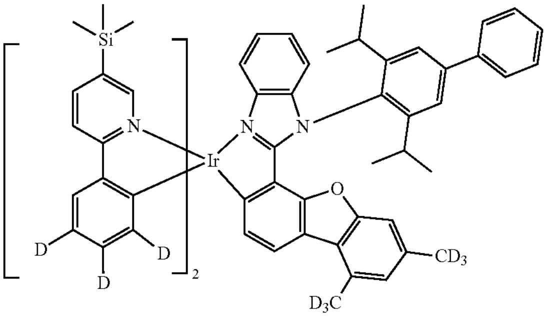
1430
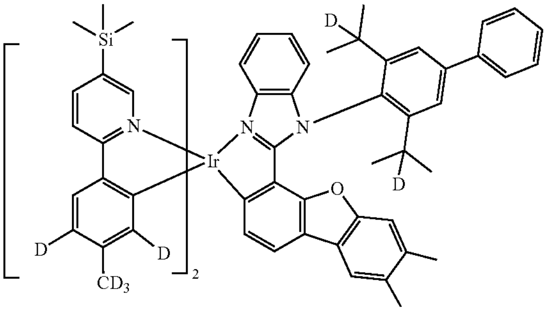

1431
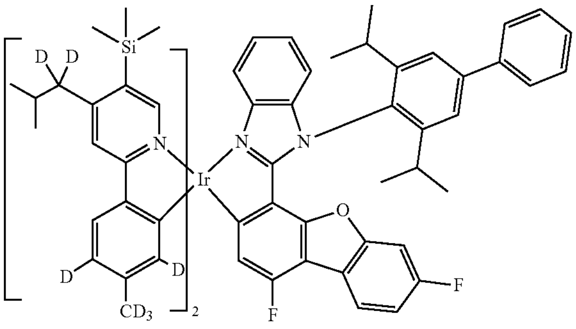
1432
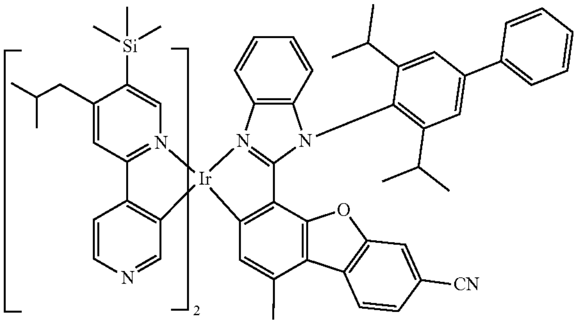
1433
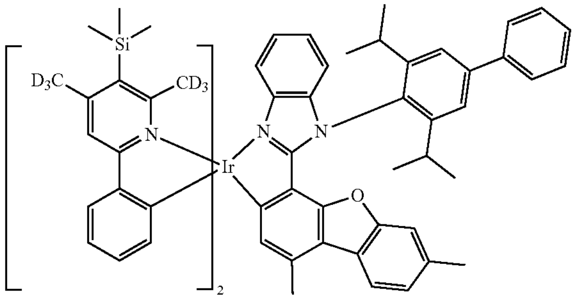
1434
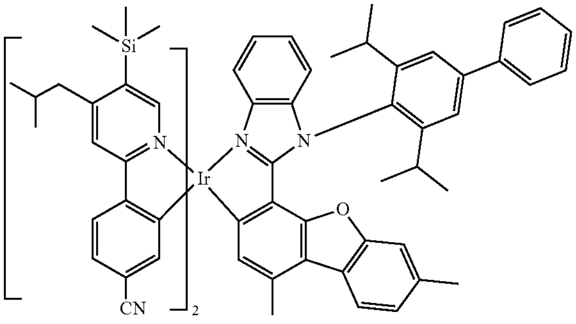
1435
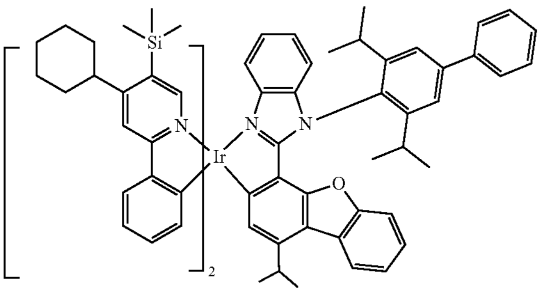
1436
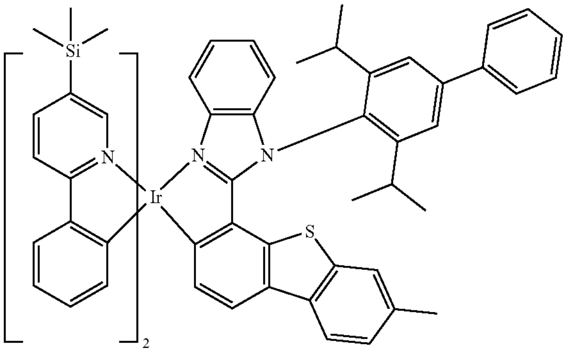
1437
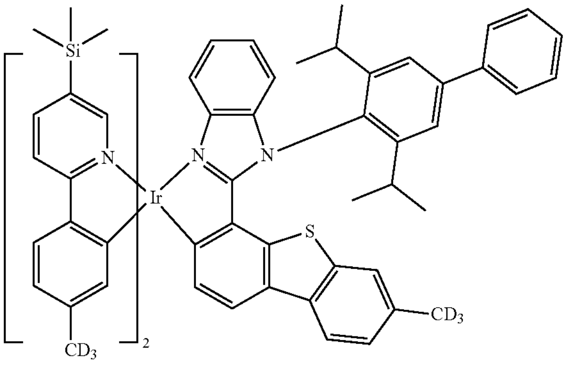
1438
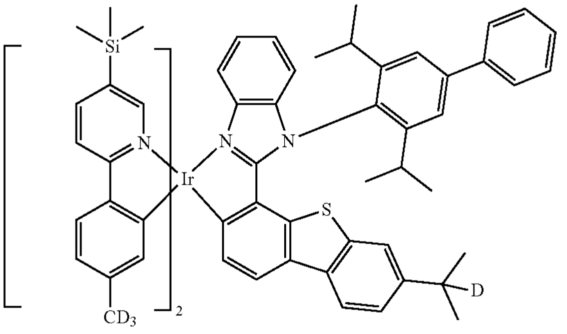

-continued
1439
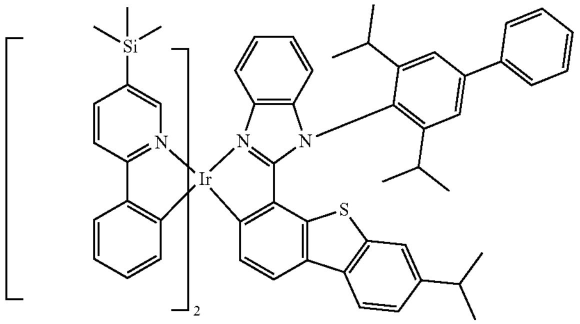
1440
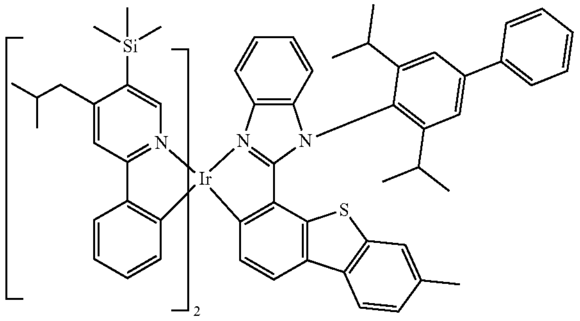
1441
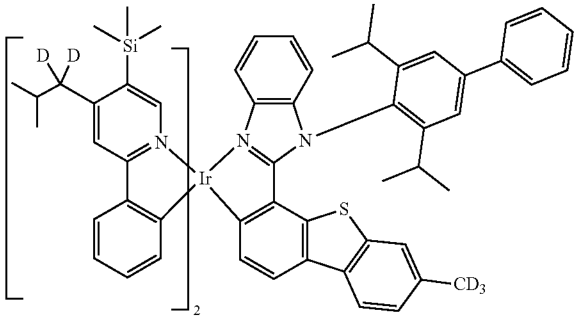
1442
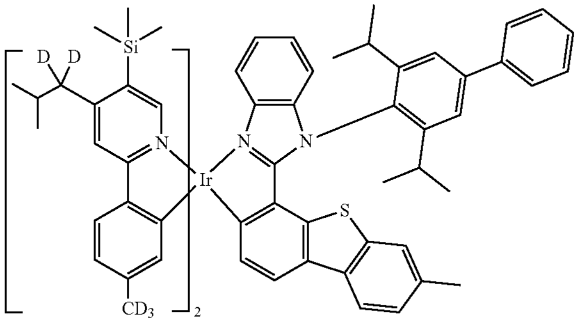
-continued
1443
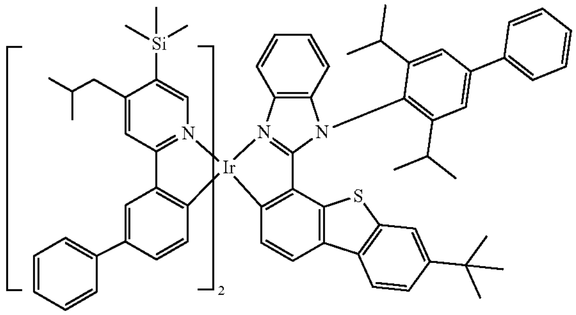
1444
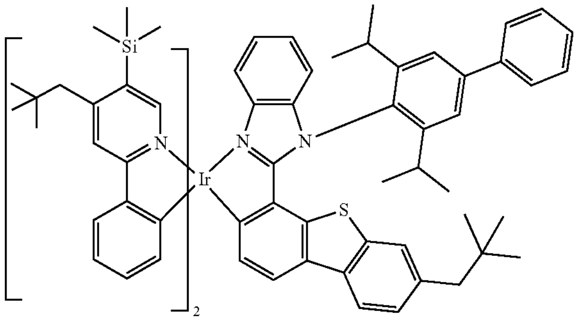
1445
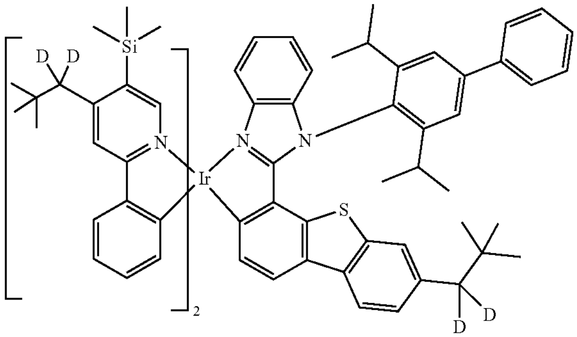
1446
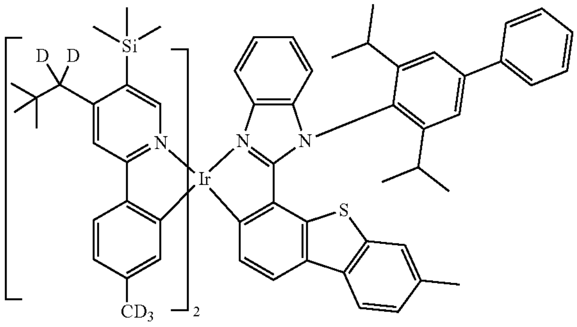

-continued
1447
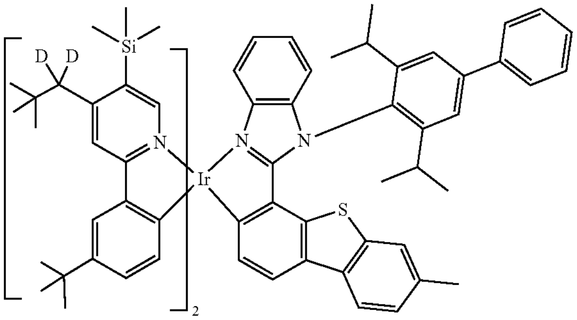
1448
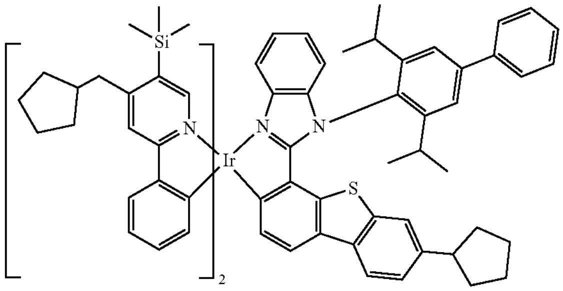
1449
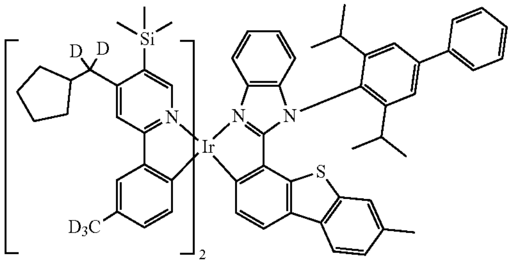
1450
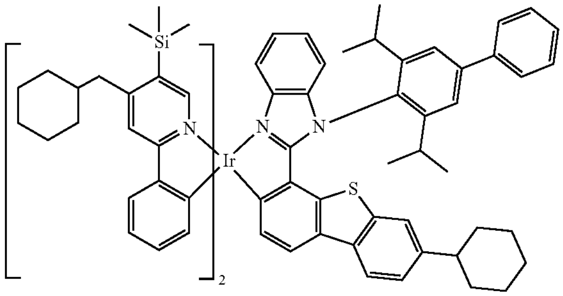
1451
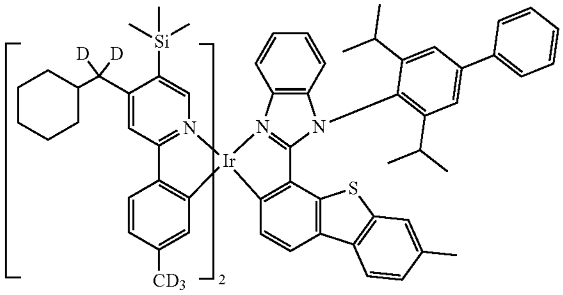
-continued
1452
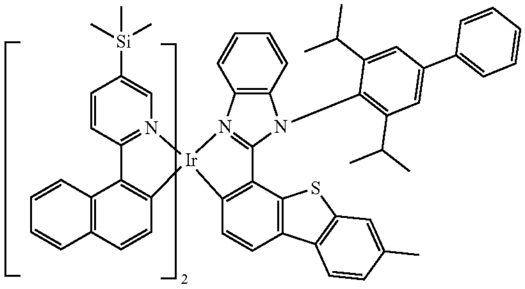
1453
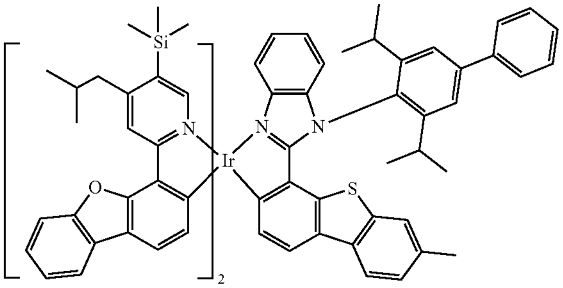
1454
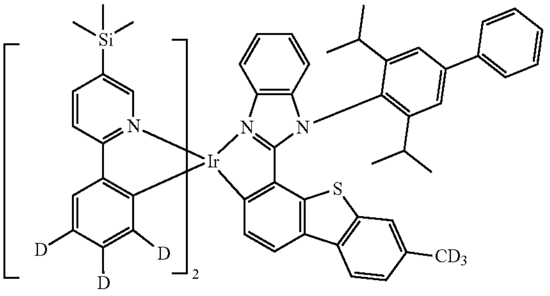
1455
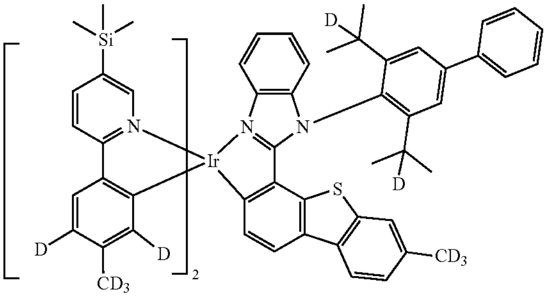
1456
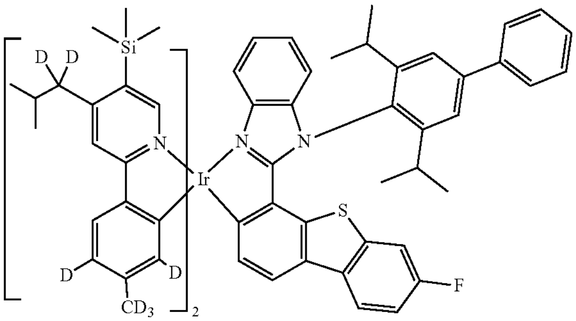

-continued
1457
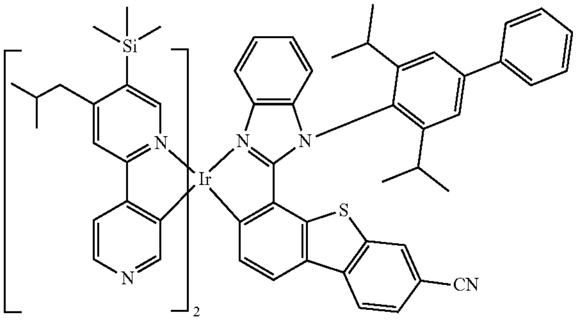
1458
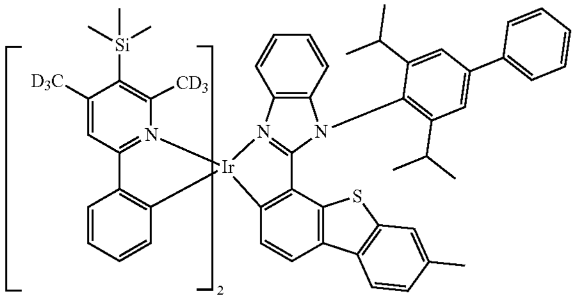
1459
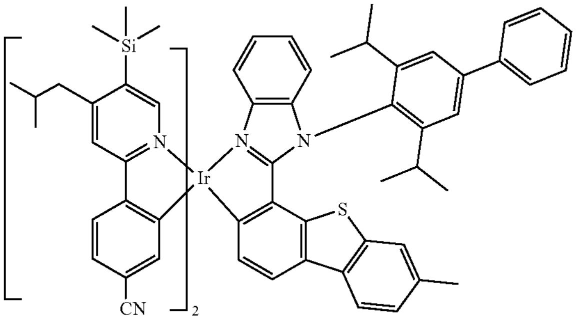
1460
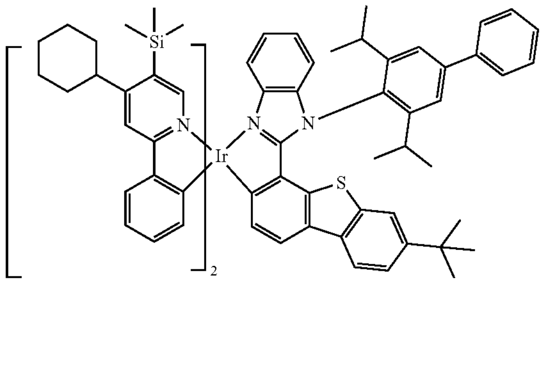
-continued
1461
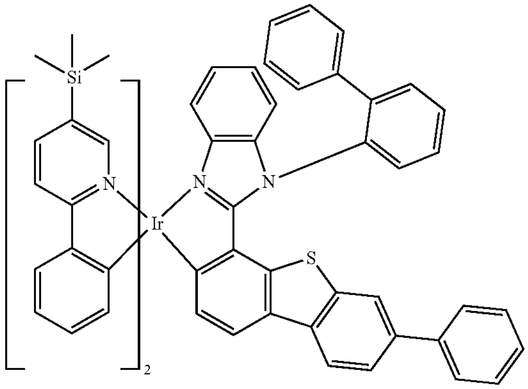
1462
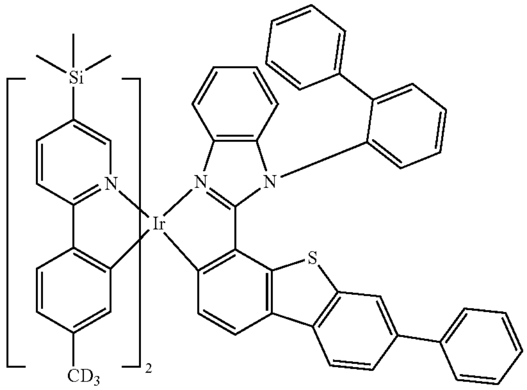
1463
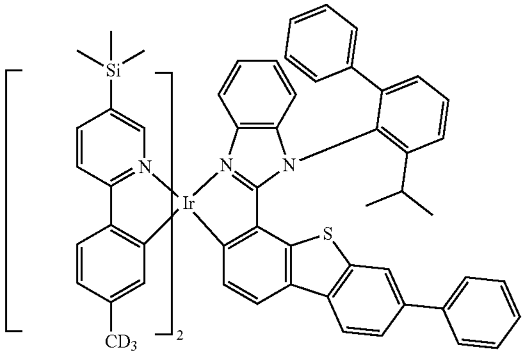
1464
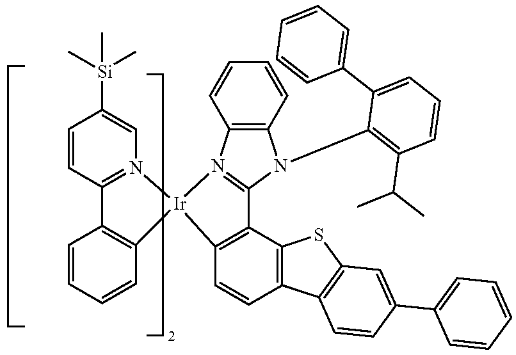

1465
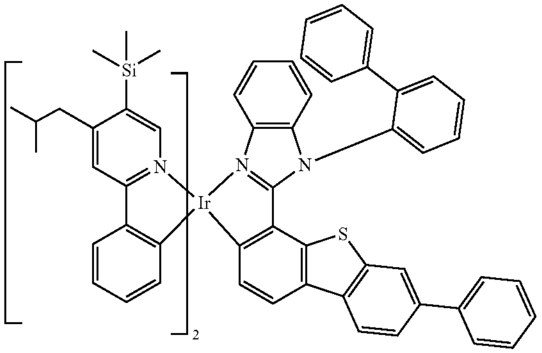
1466
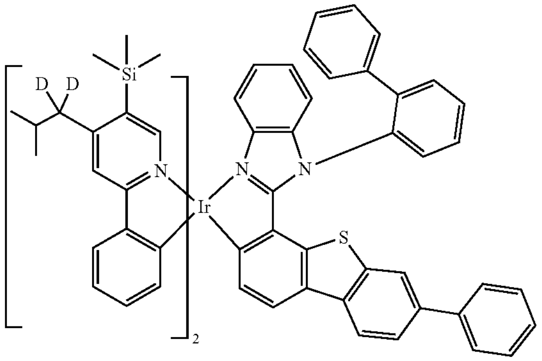
1467
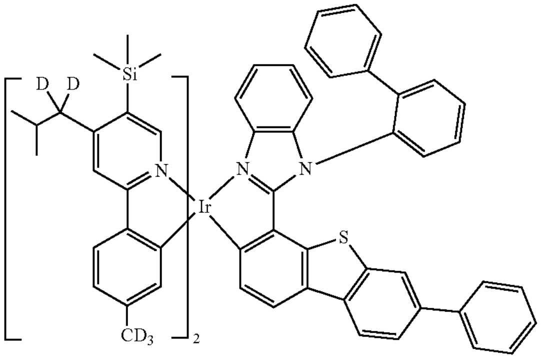
1468
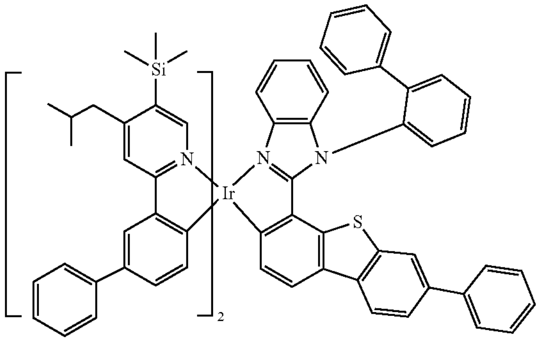
1469
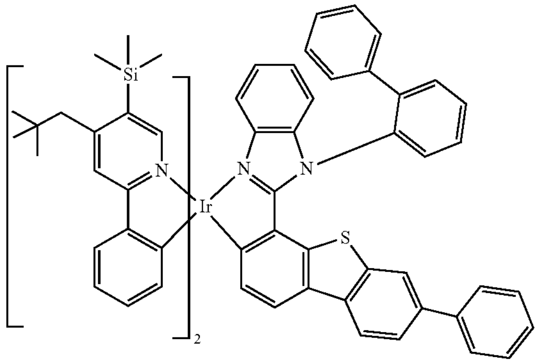
1470
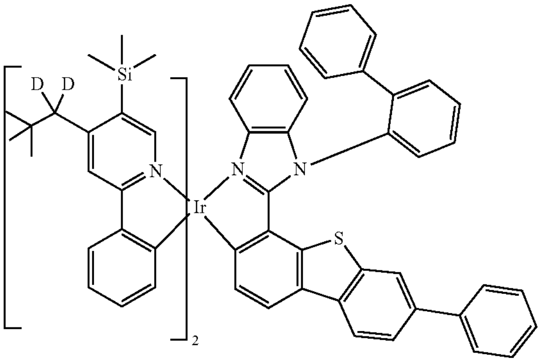
1471
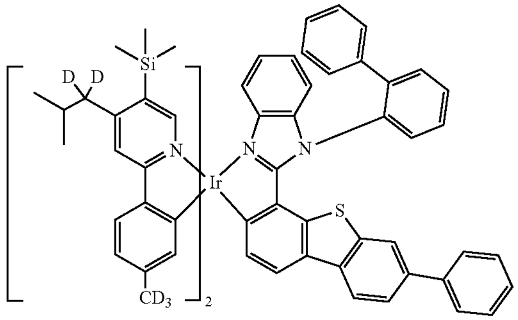
1472
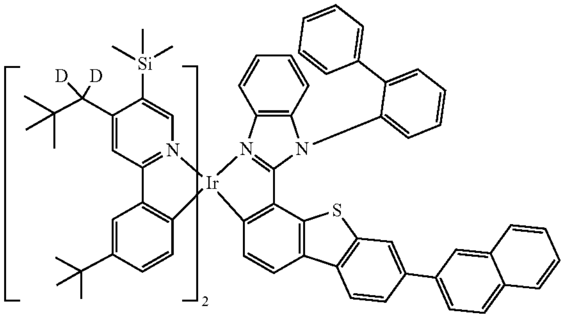

1473
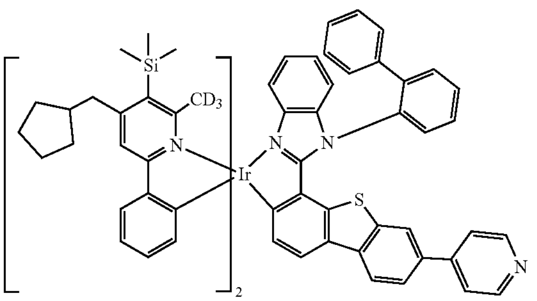
1474
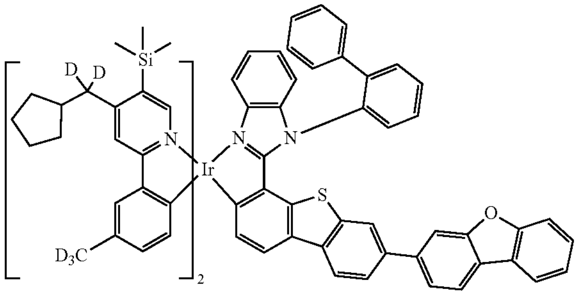
1475
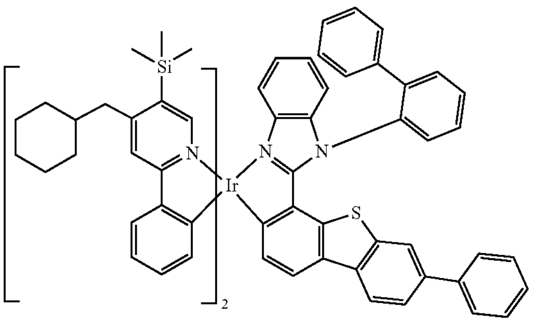
1476
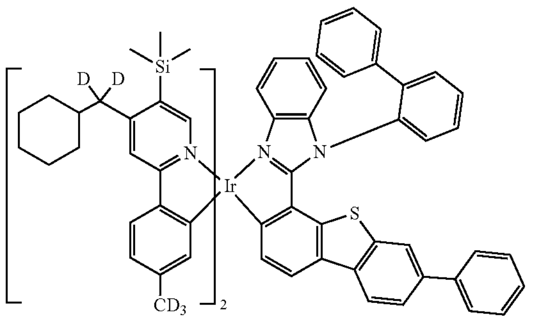
1477
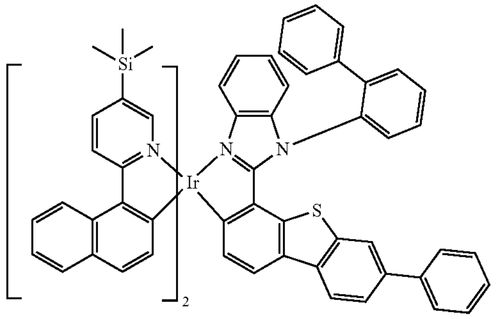
1478
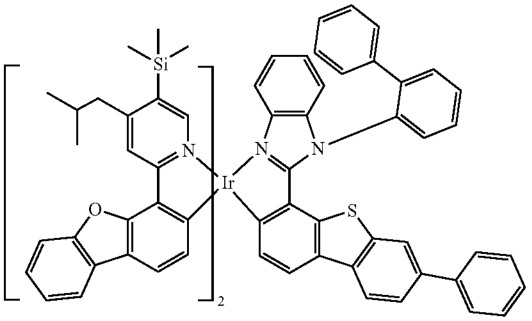
1479
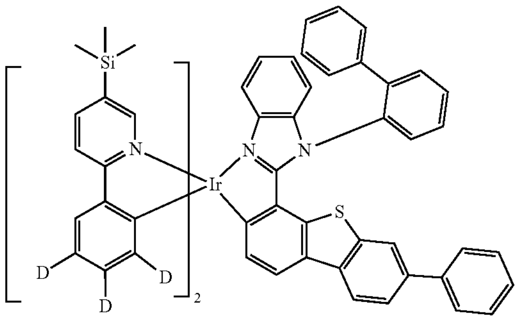
1480
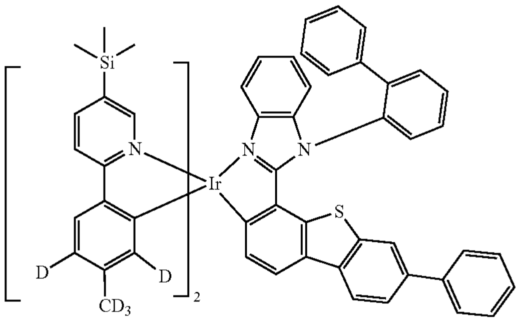
1481
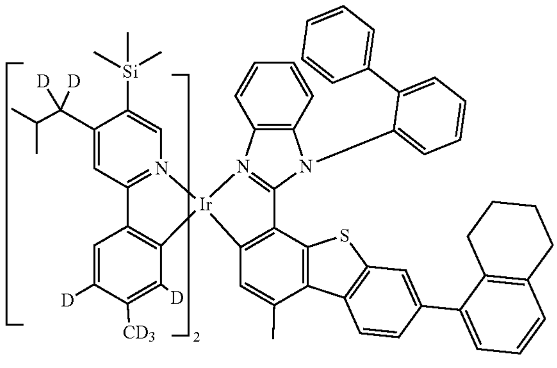

1482
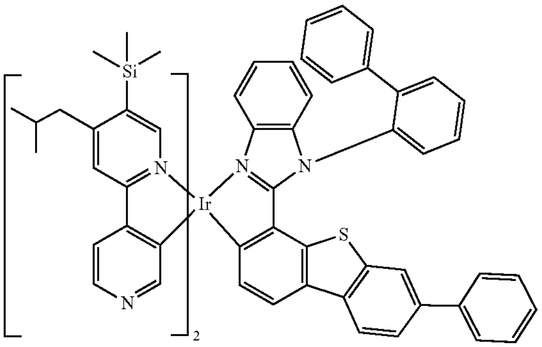
1483
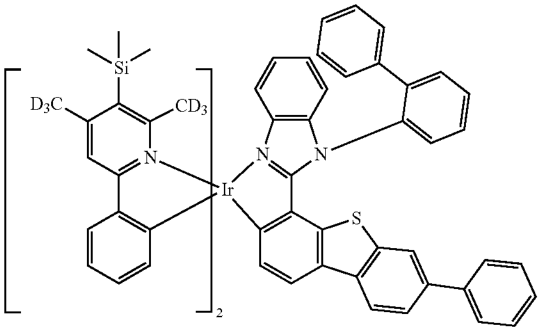
1484
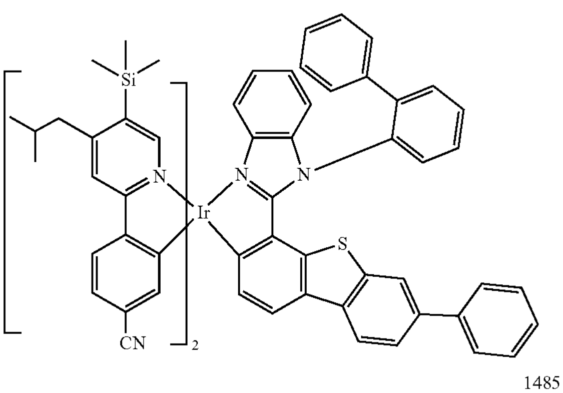
1485
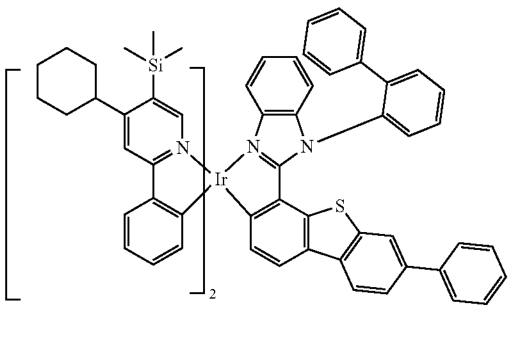
1486
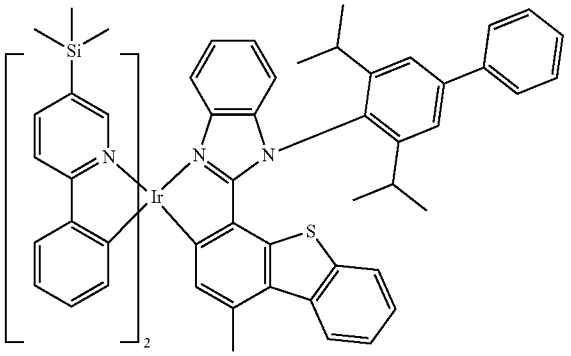
1487
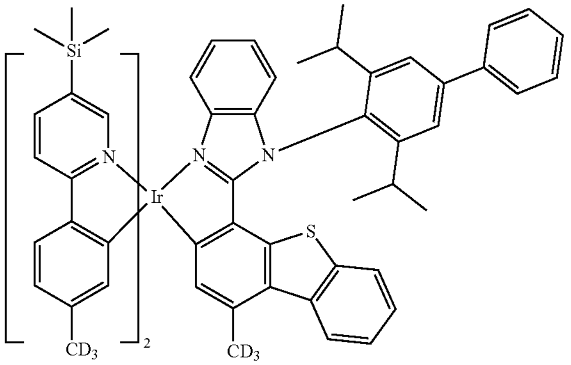
1488
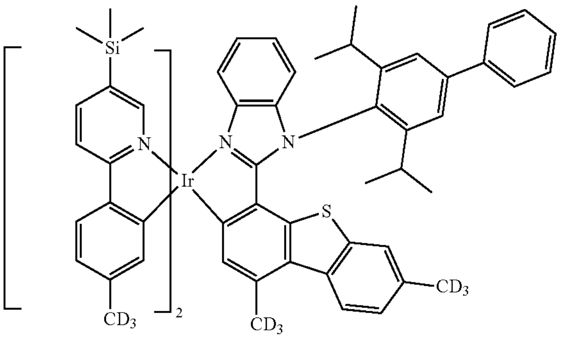
1489
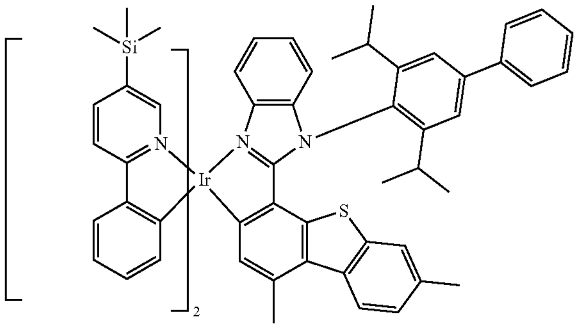

-continued
1490
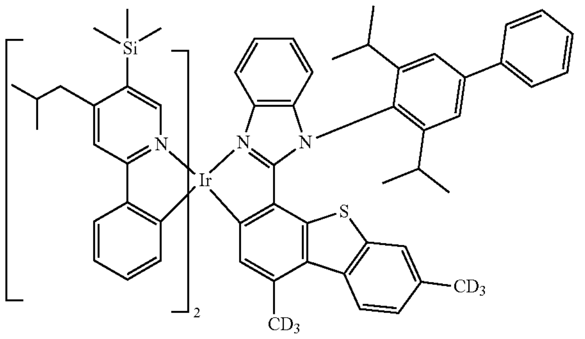
1491
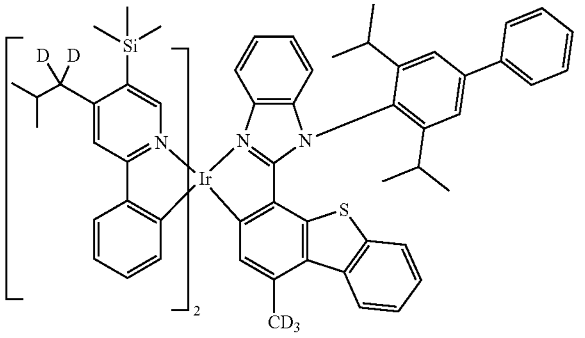
1492
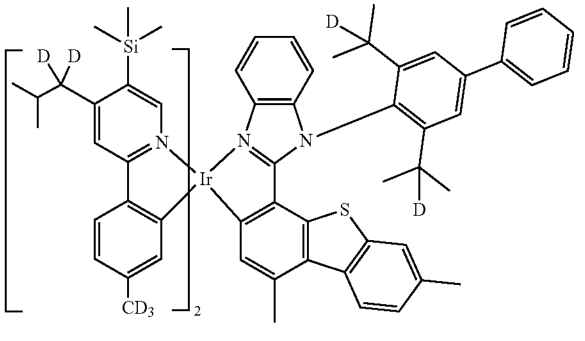
1493
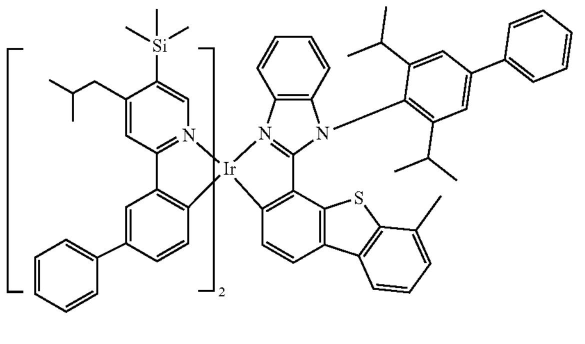
-continued
1494
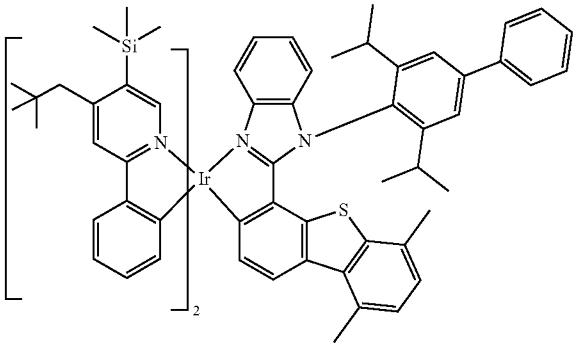
1495
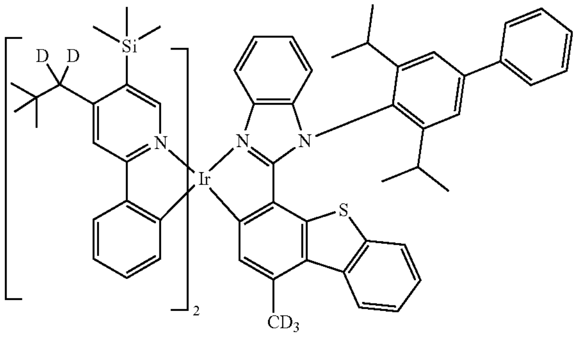
1496
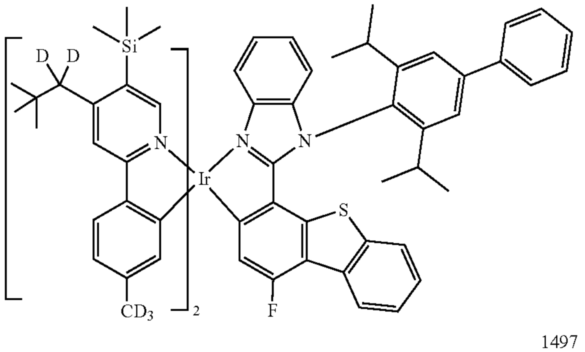
1497
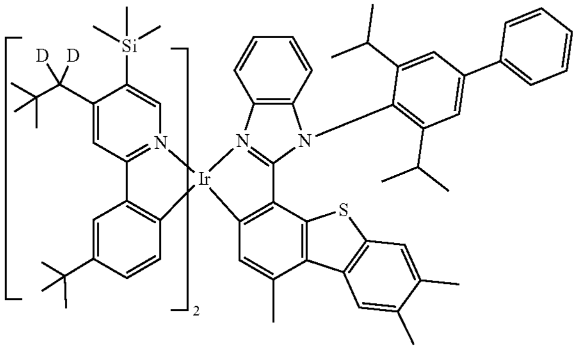

-continued
1498
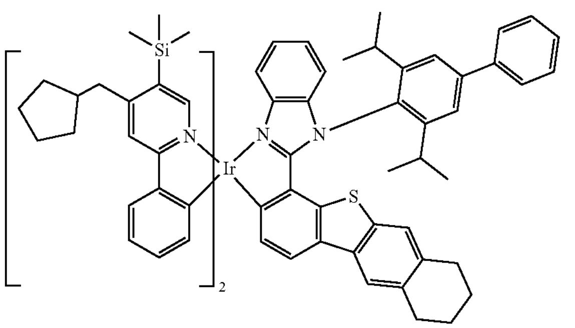
1499
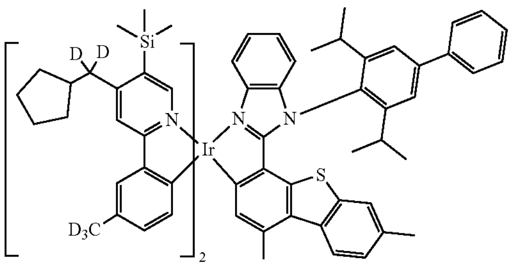
1500
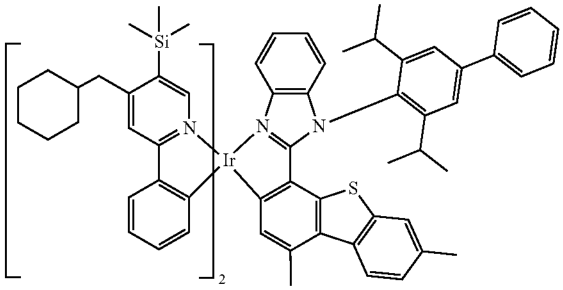
1501
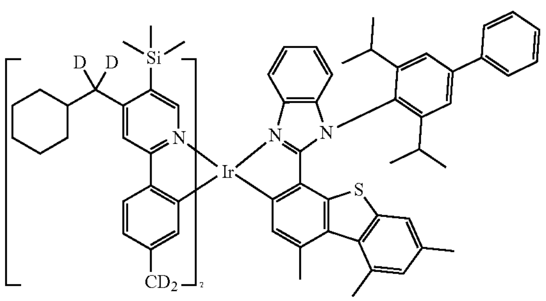
1502
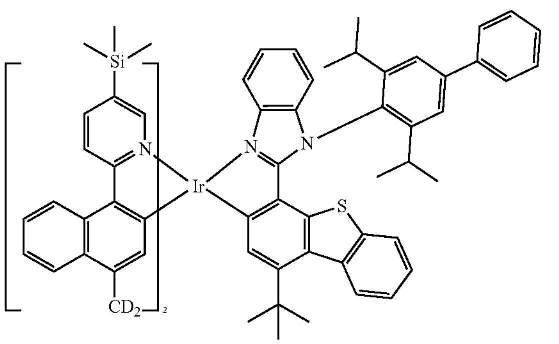
-continued
1503
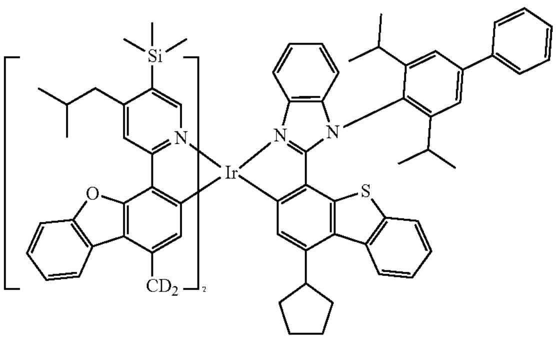
1504
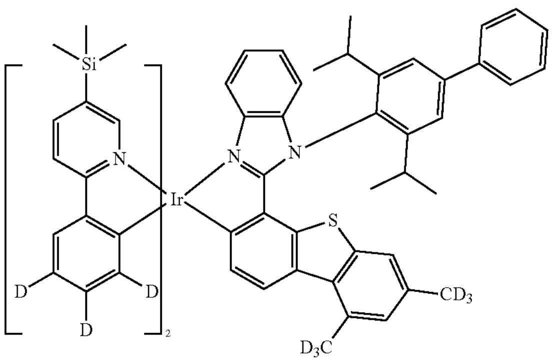
1505
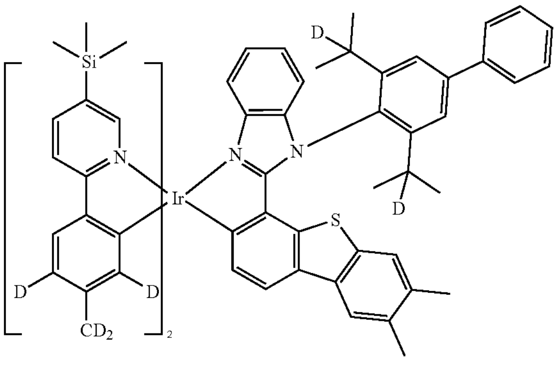
1506
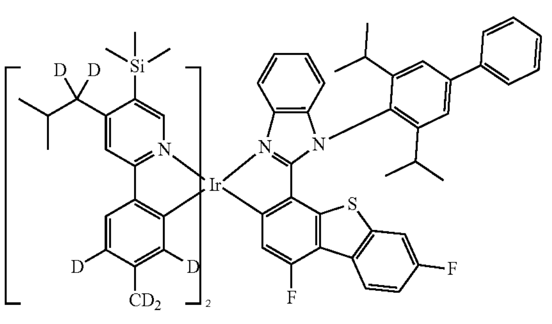

-continued
1507
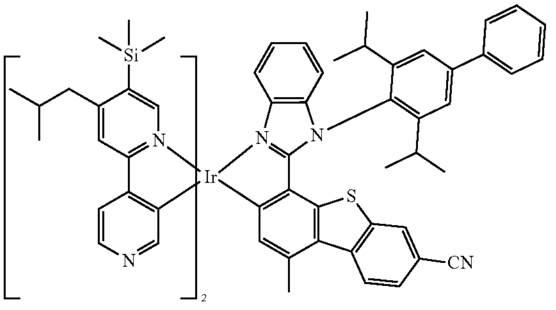
1508
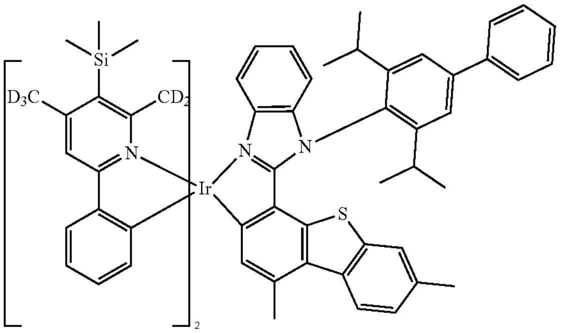
1509
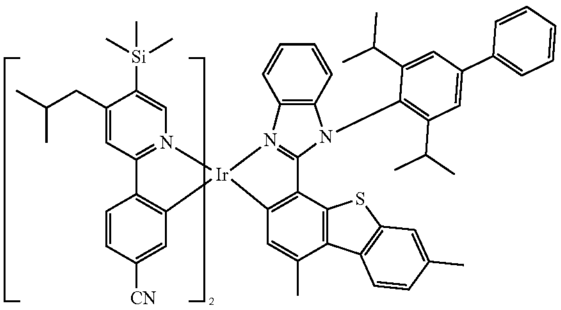
1510
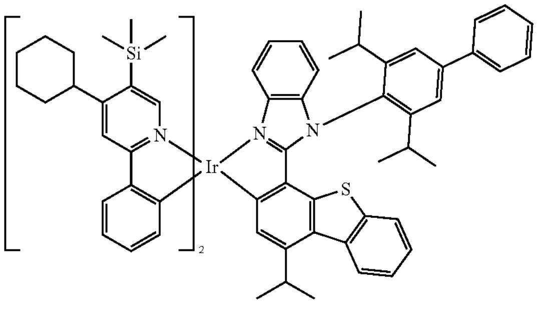
-continued
1511
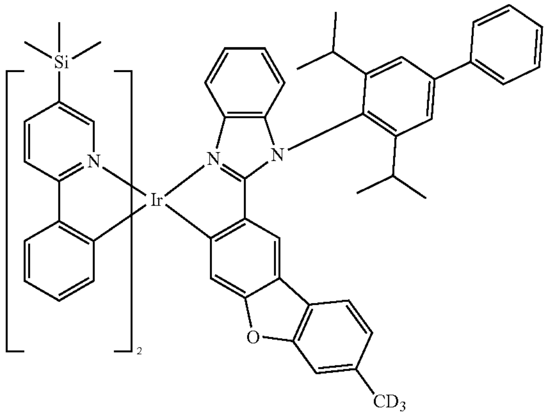
1512
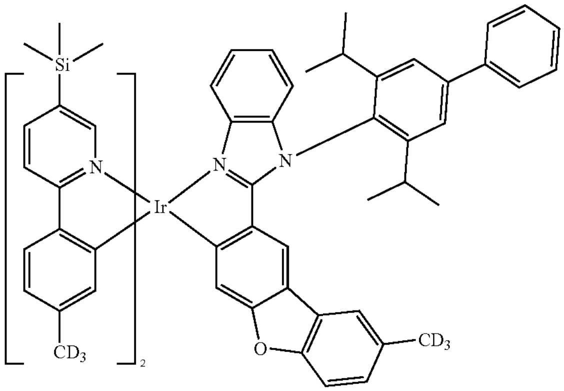
1513
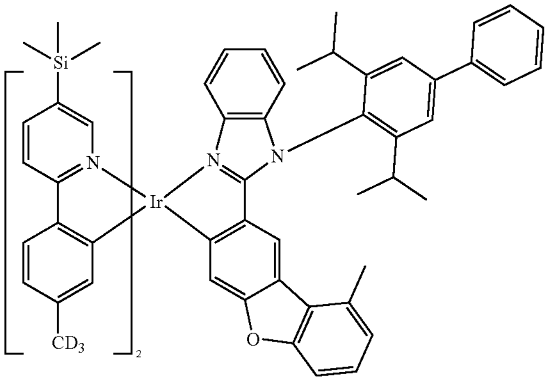

-continued
1514
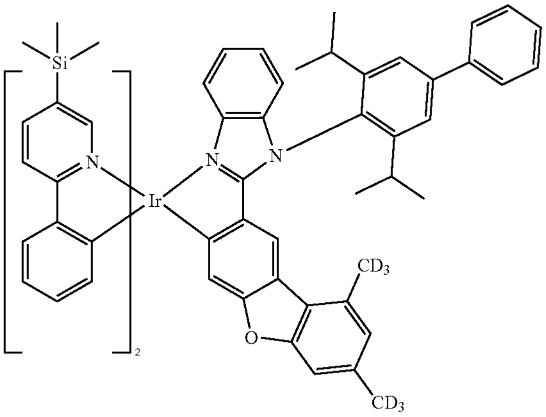
1515
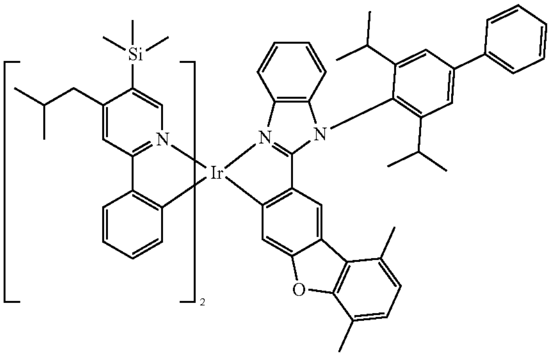
1516
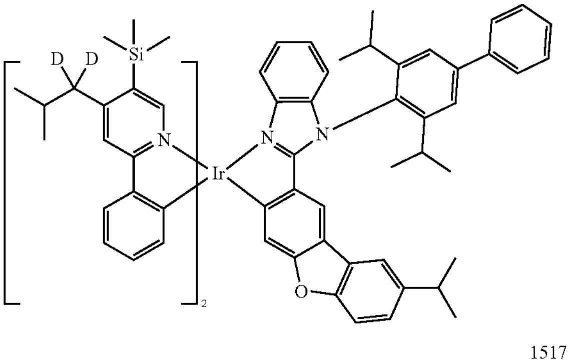
1517
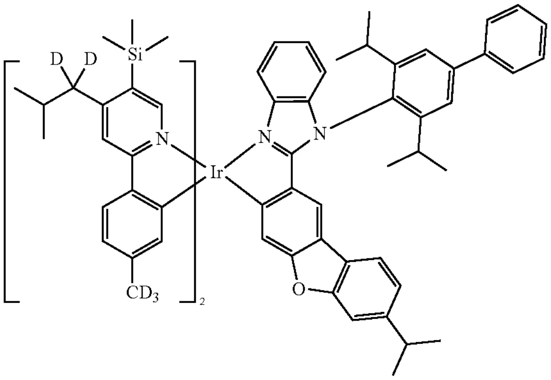
-continued
1518
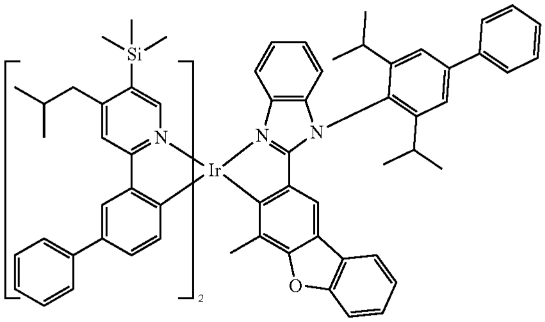
1519
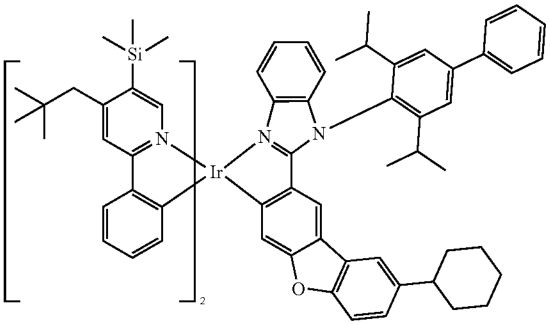
1520
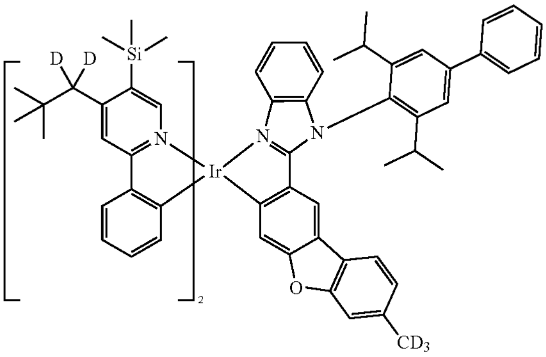
1521
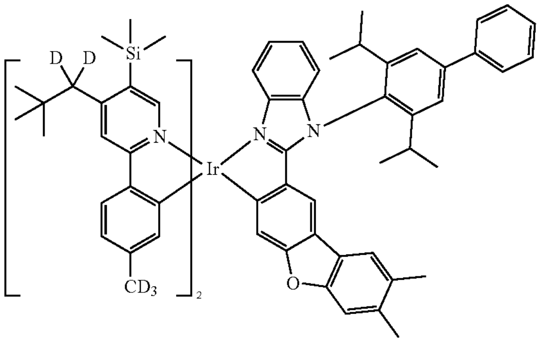

-continued
1522
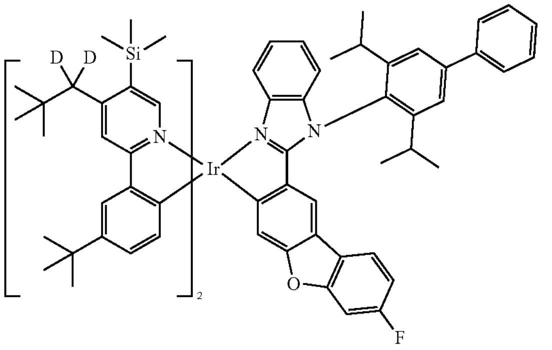
1523
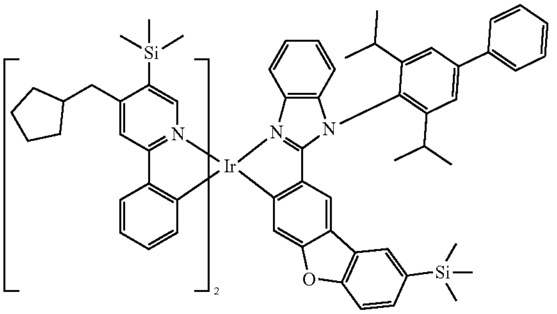
1524
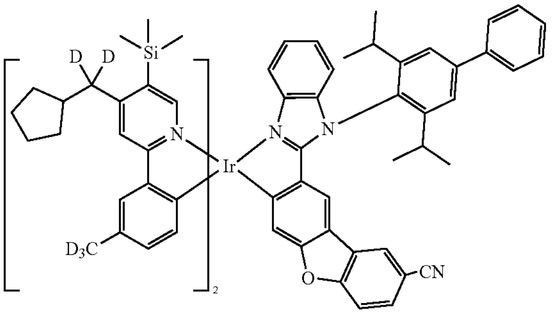
1525
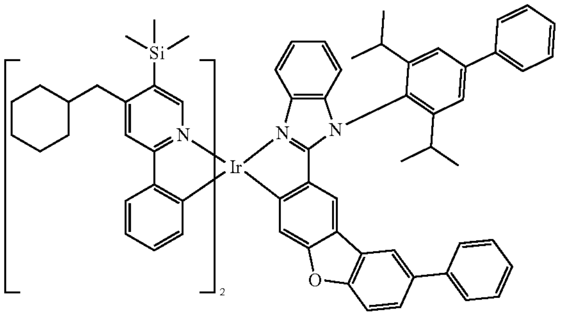
-continued
1526
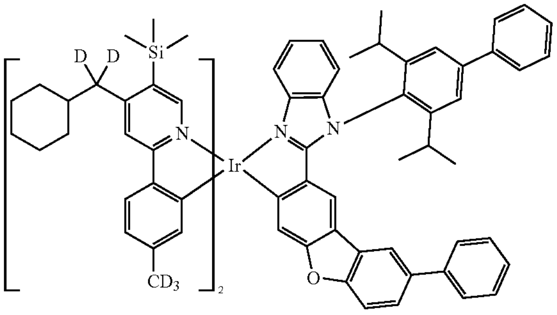
1527
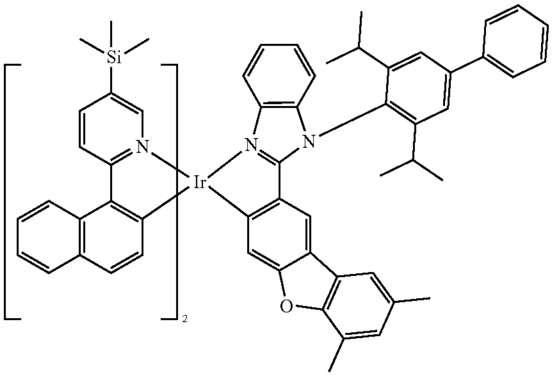
1528
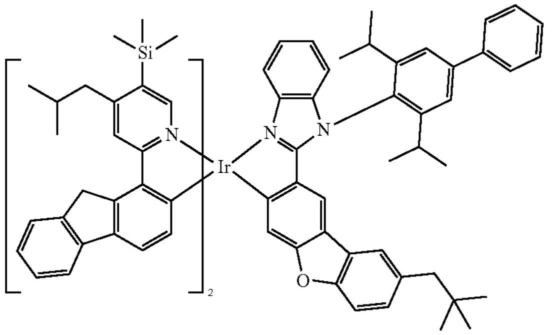
1529
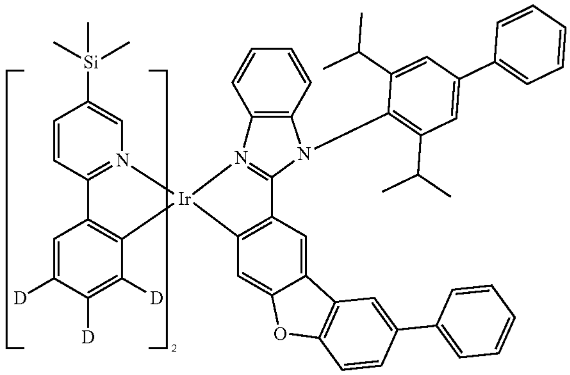

-continued
1530
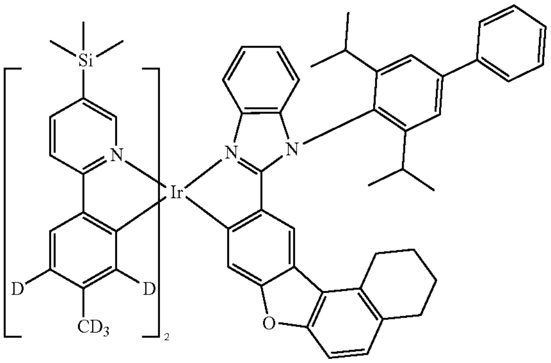
1531
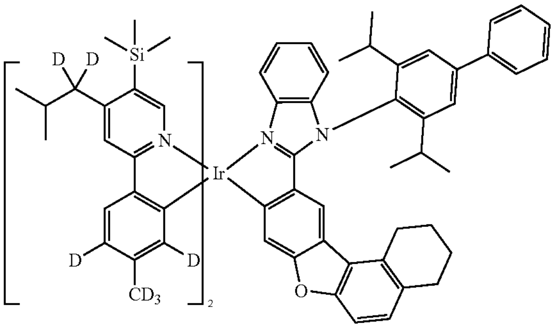
1532
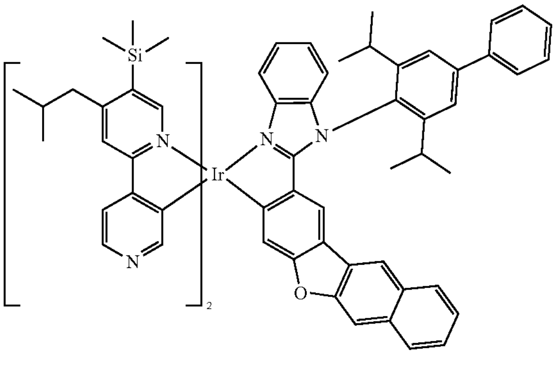
1533
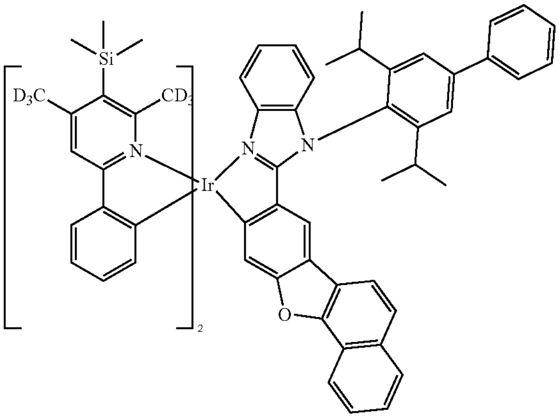
-continued
1534
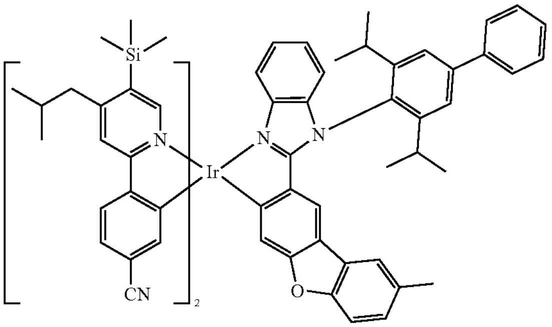
1535
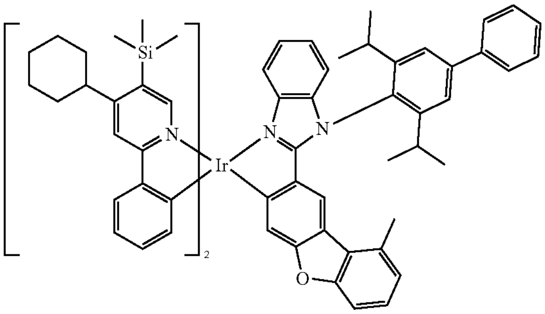
1536
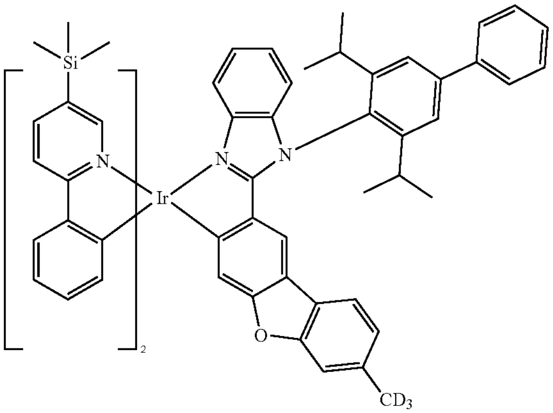
1537
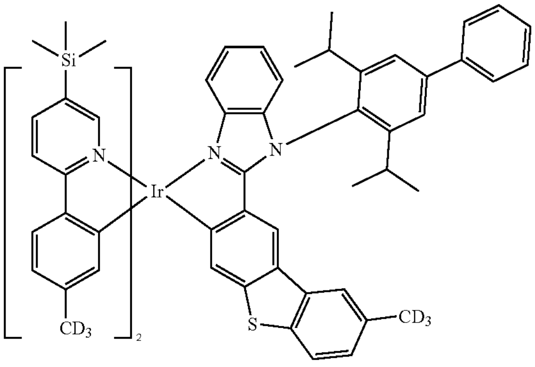

-continued
1538
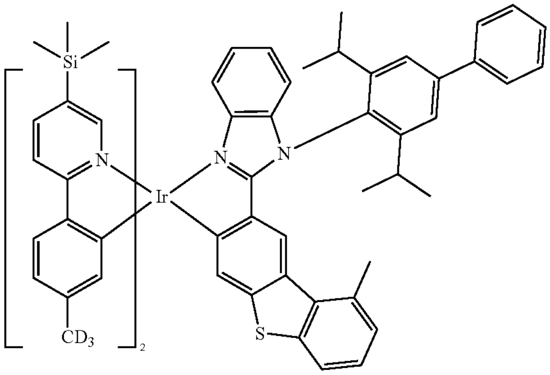
1539
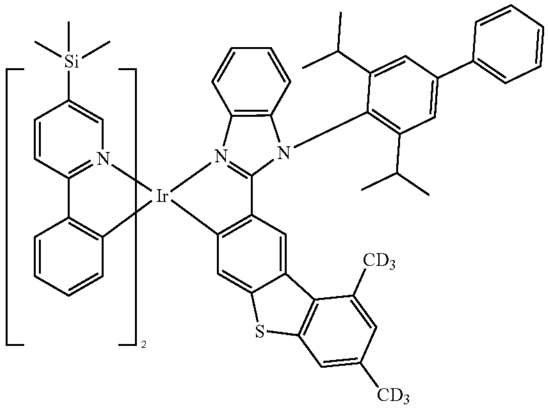
1540
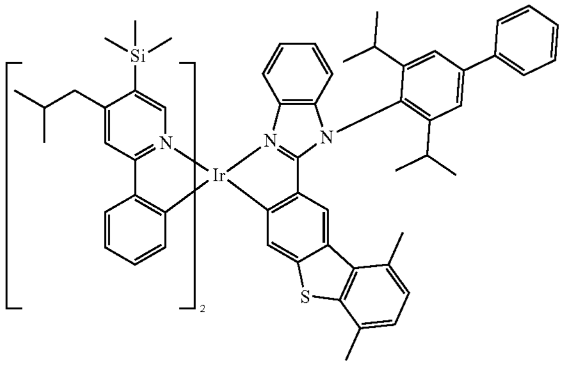
1541
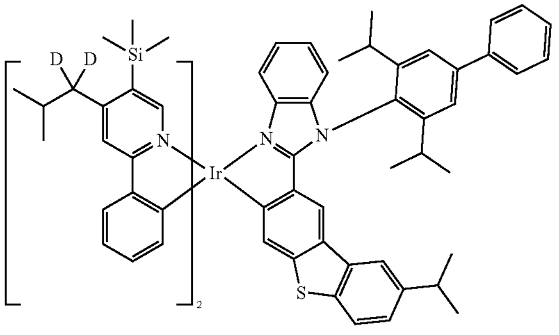
-continued
1542
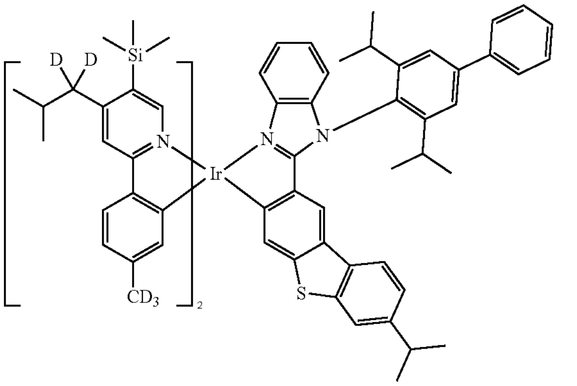
1543
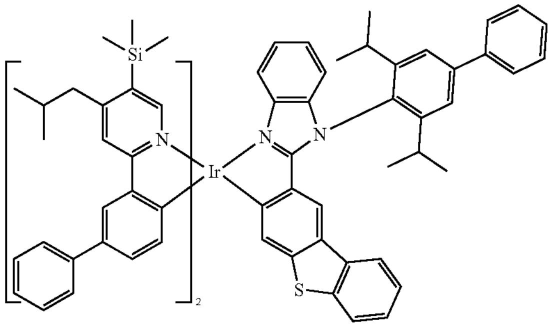
1544
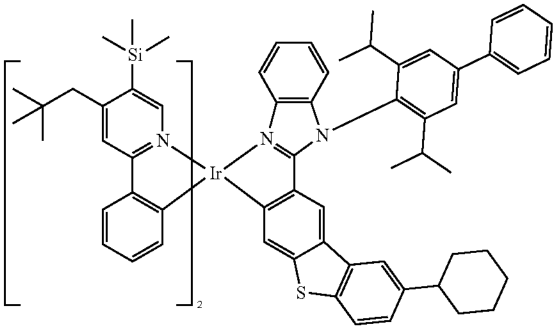
1545
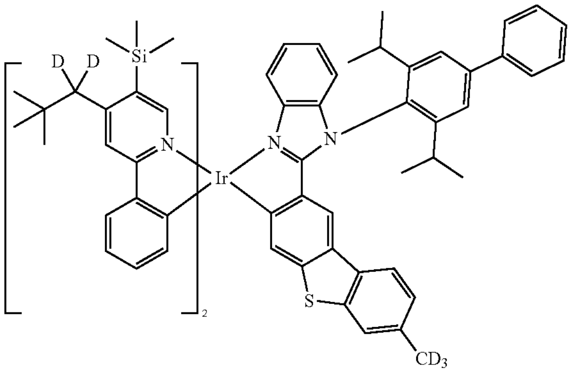

-continued
1546
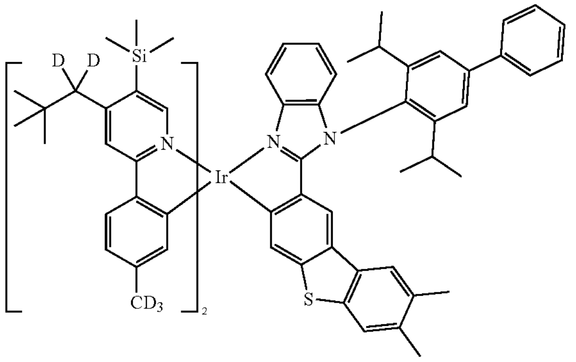
1547
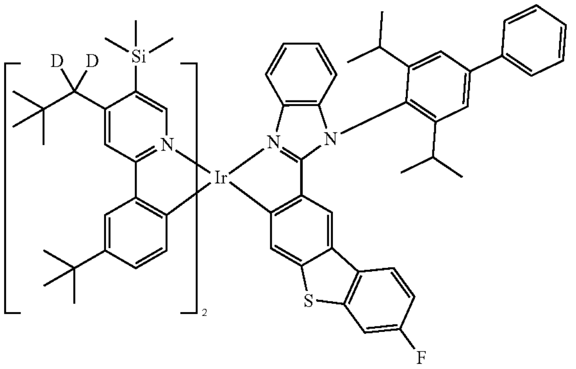
1548
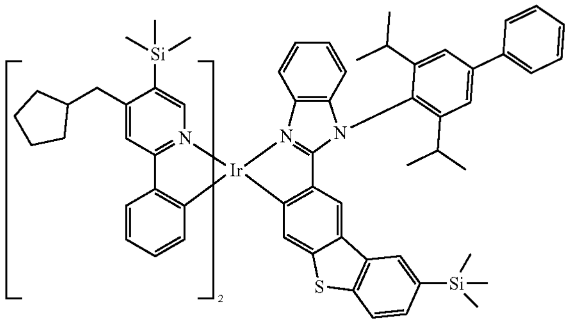
1549
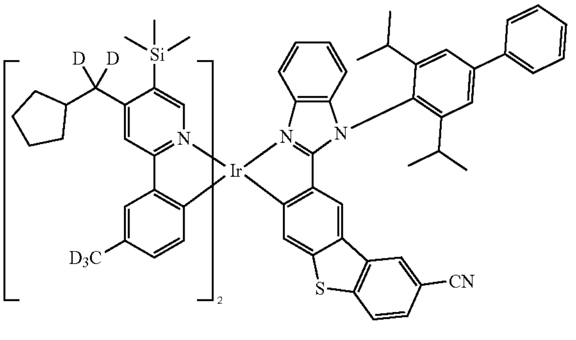
-continued
1550
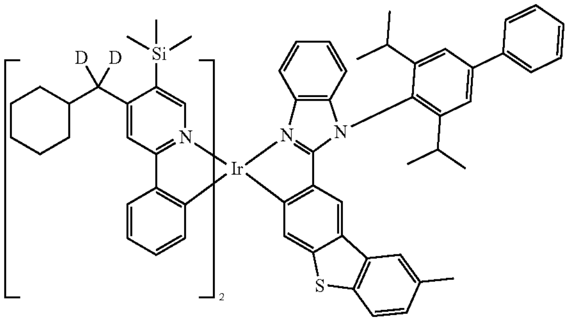
1551
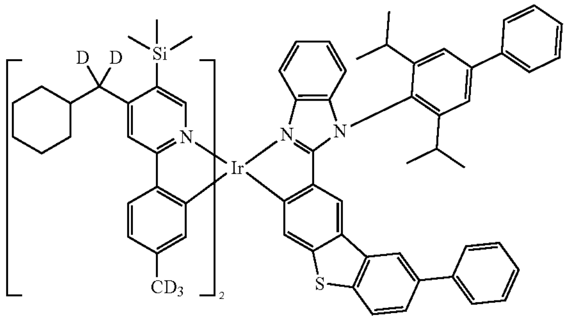
1552
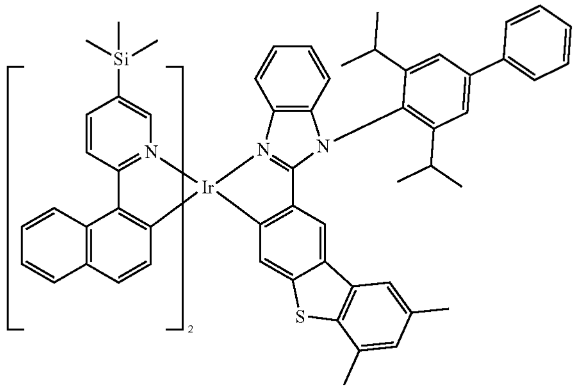
1553
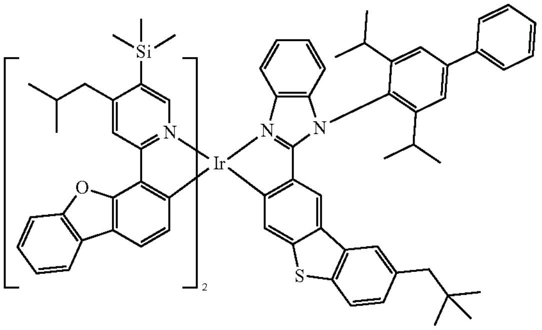

-continued
1554
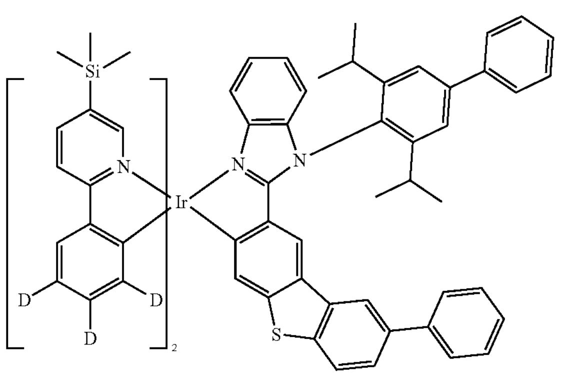
1555
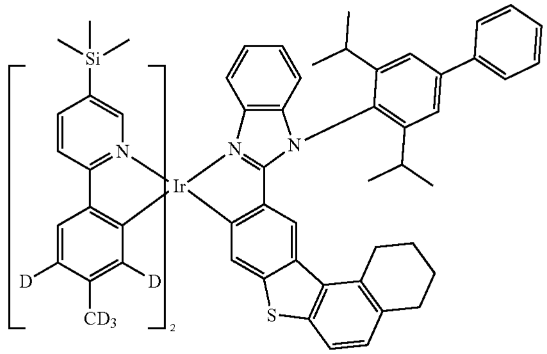
1556
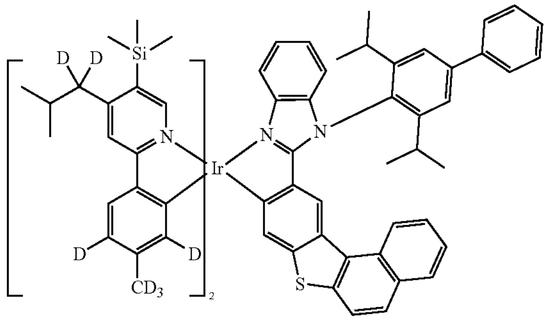
1557
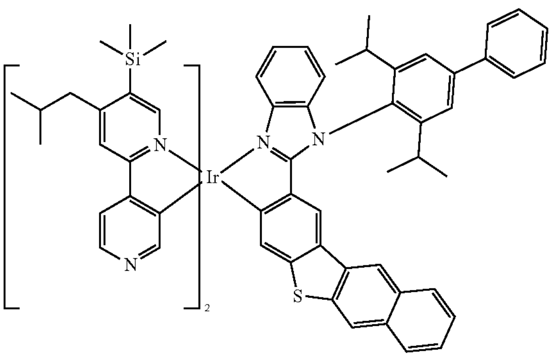
-continued
1558
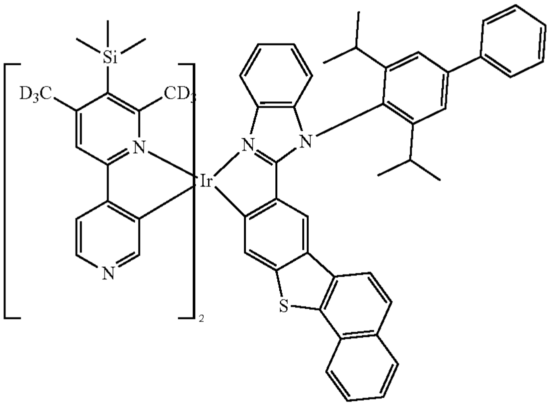
1559
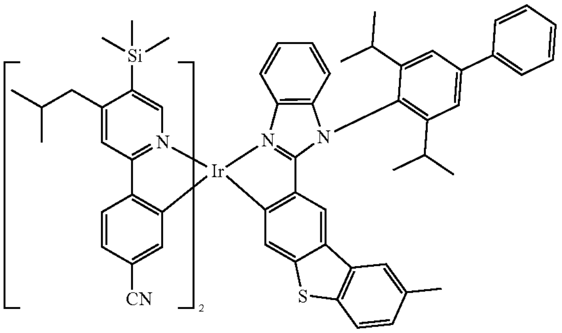
1560
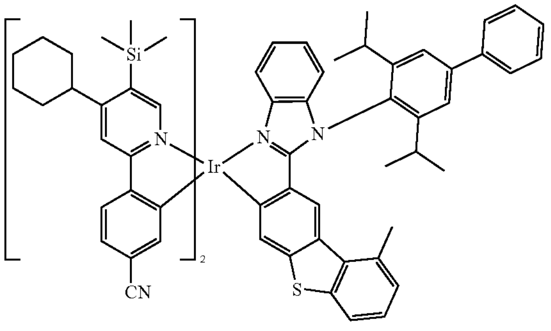
1561
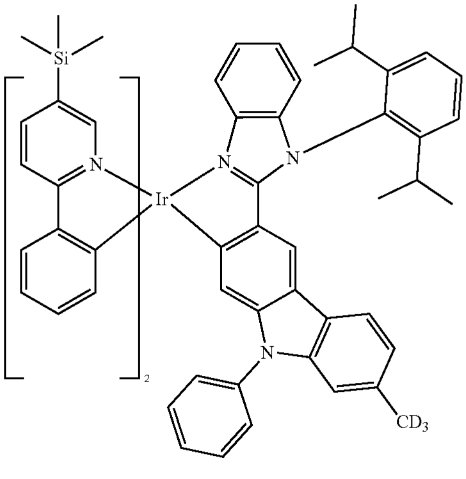

1562
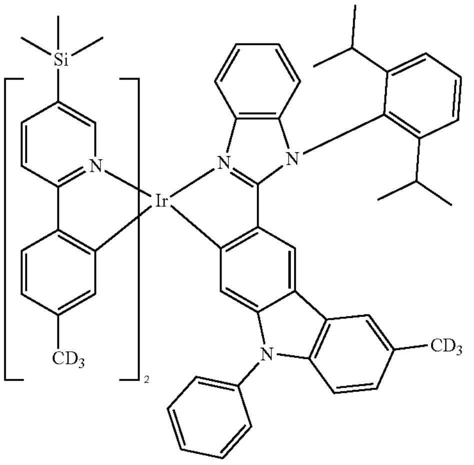
1563
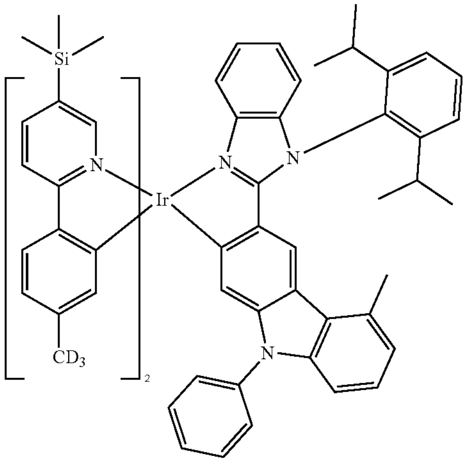
1564
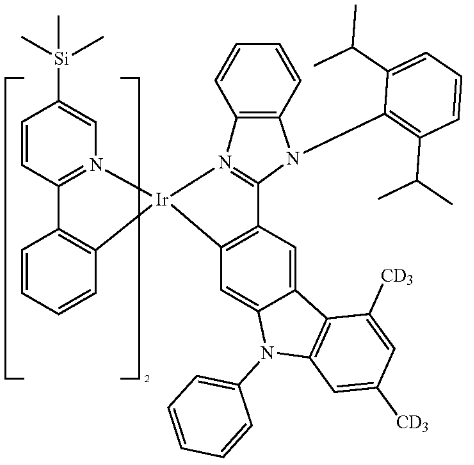
1565
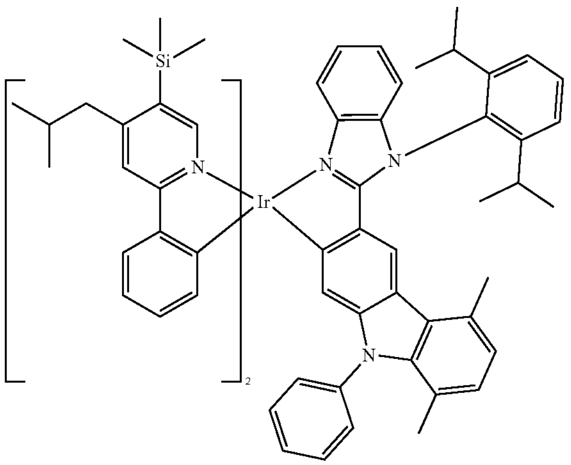
1566
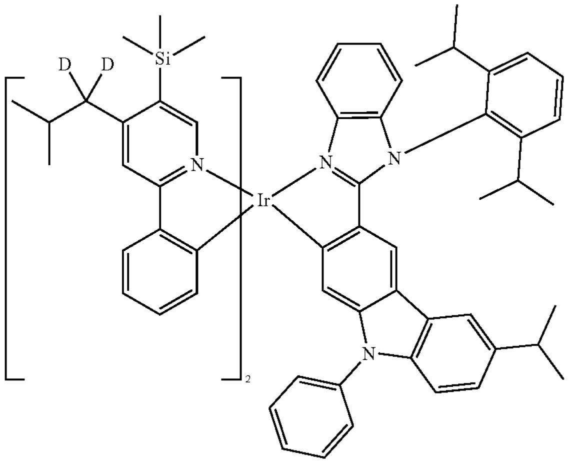
1567
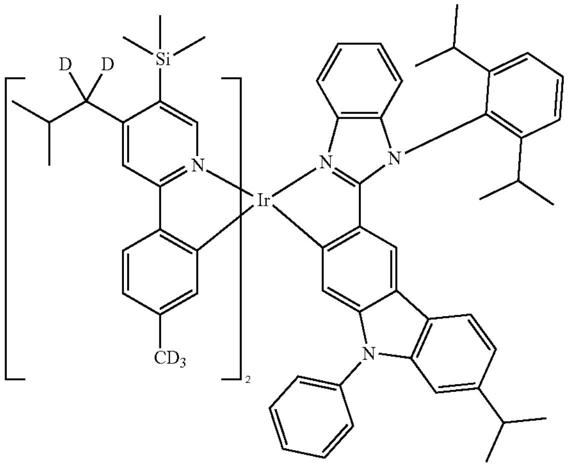

-continued
1568
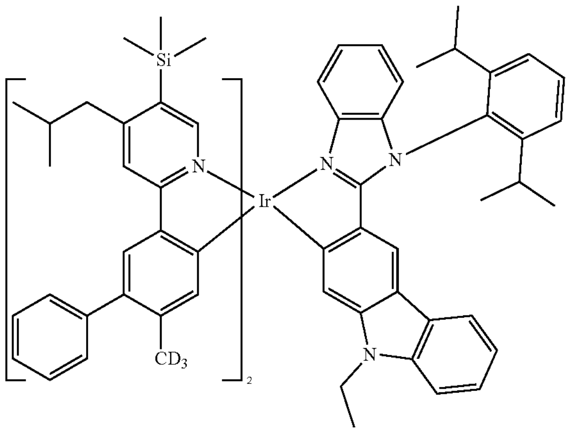
1569
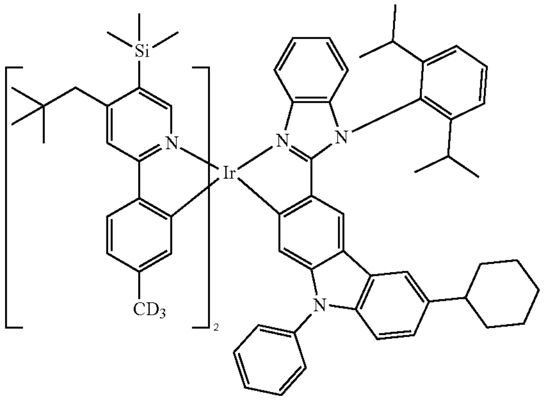
1570
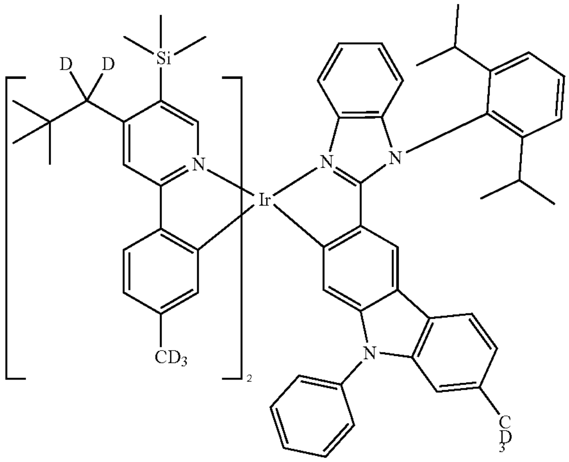
-continued
1571
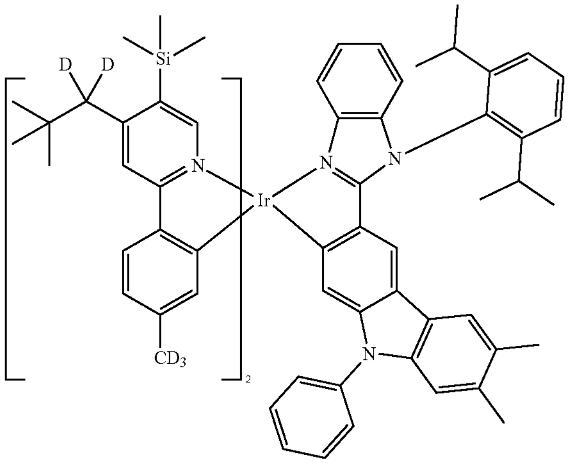
1572
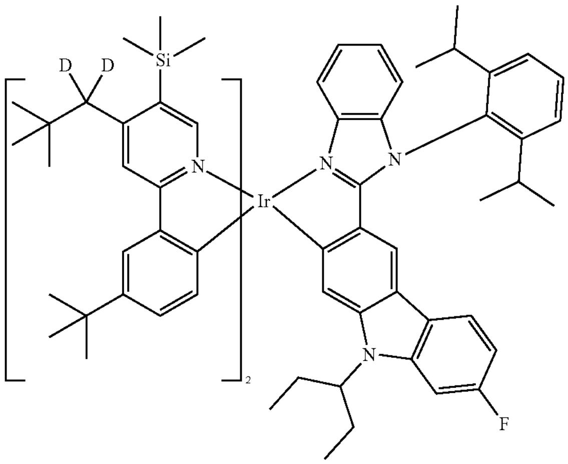
1573
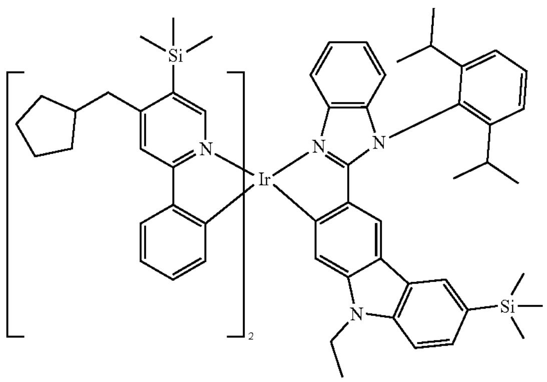

-continued
1574
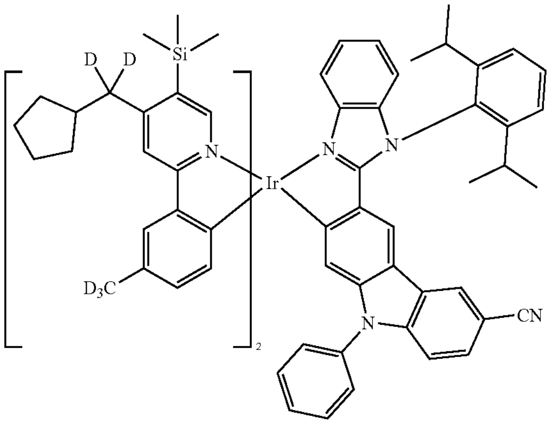
1575
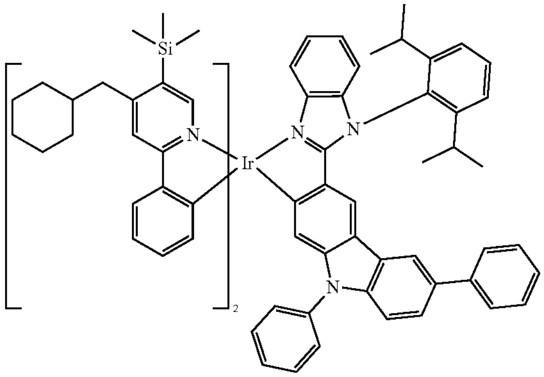
1576
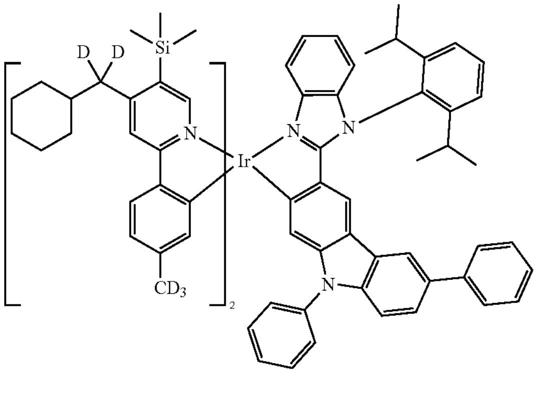
-continued
1577
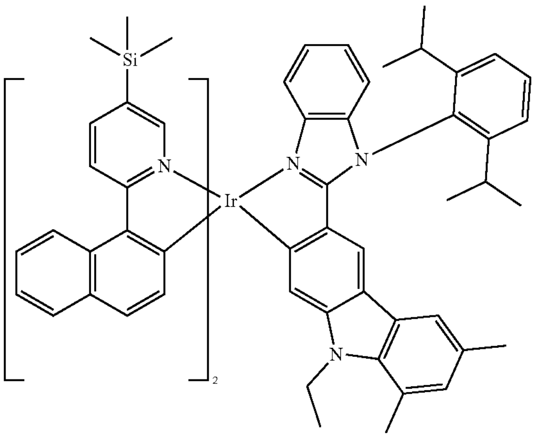
1578
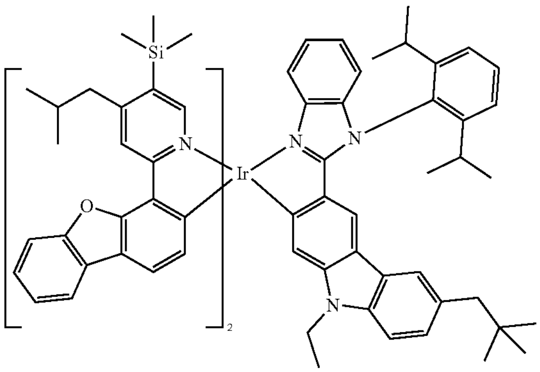
1579
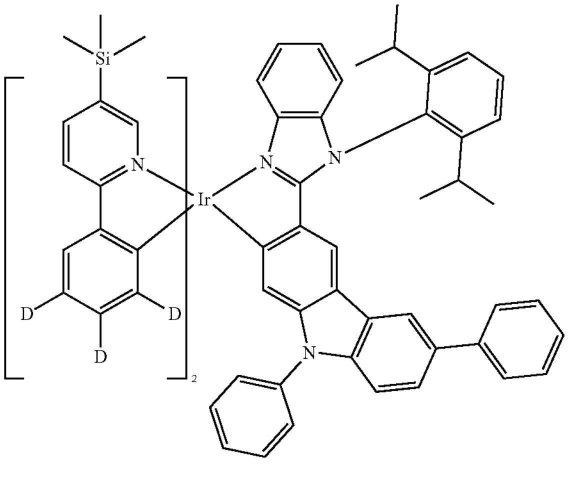

-continued
1580
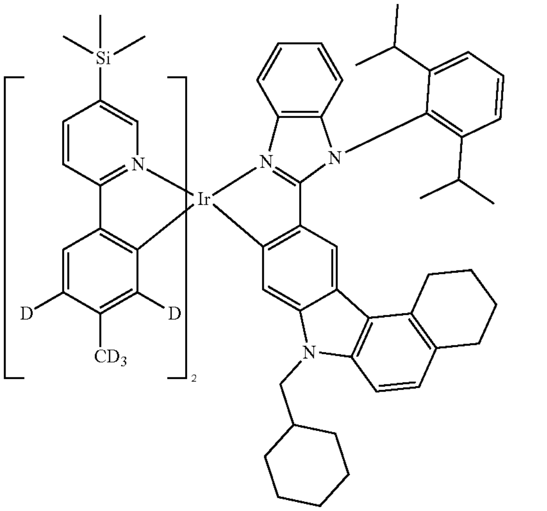
1581
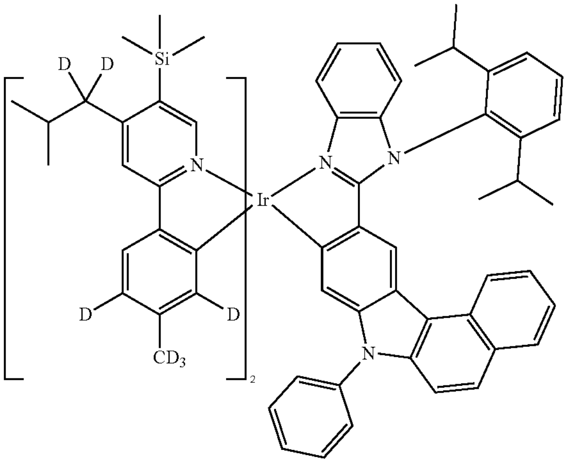
1582
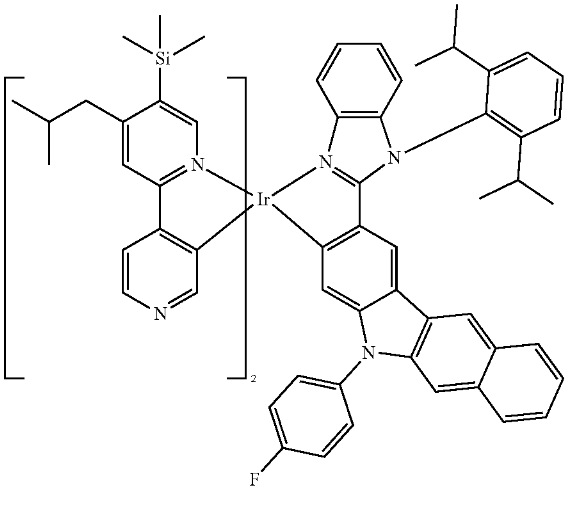
-continued
1583
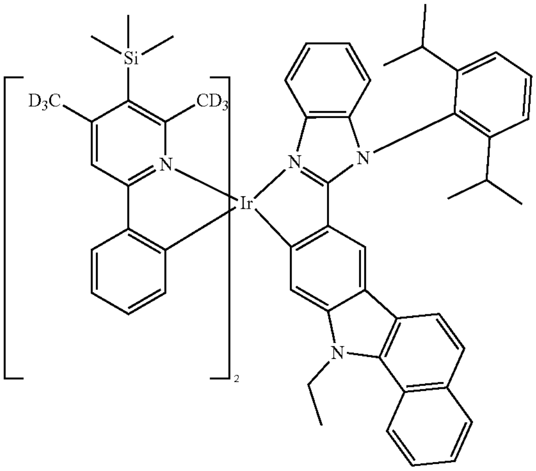
1584
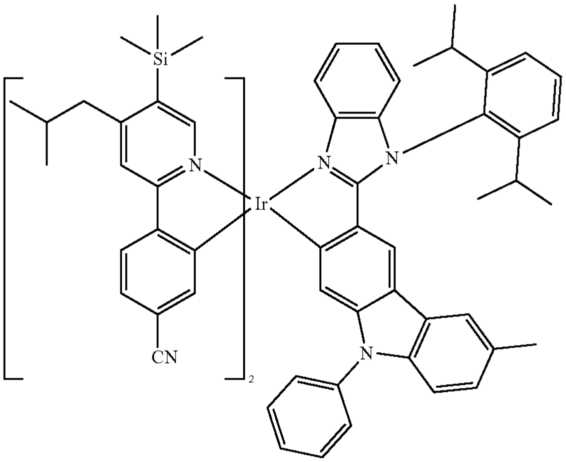
1585
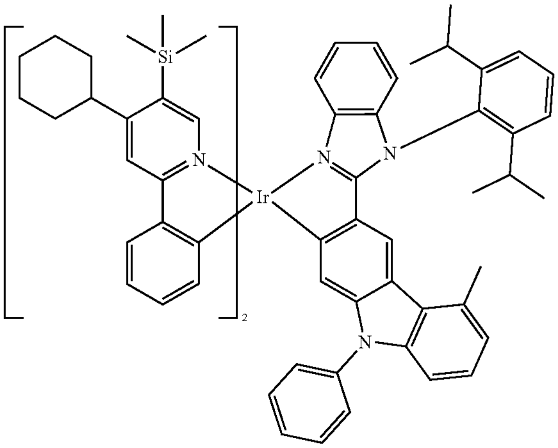

1586
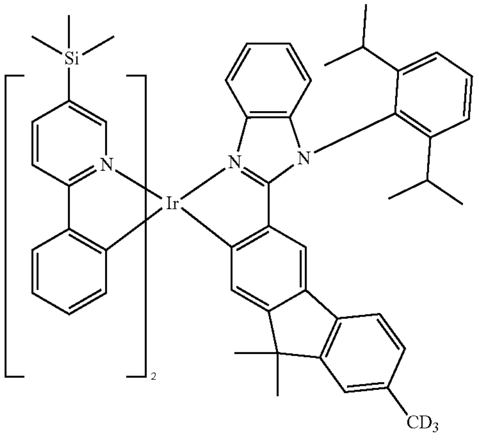
1587
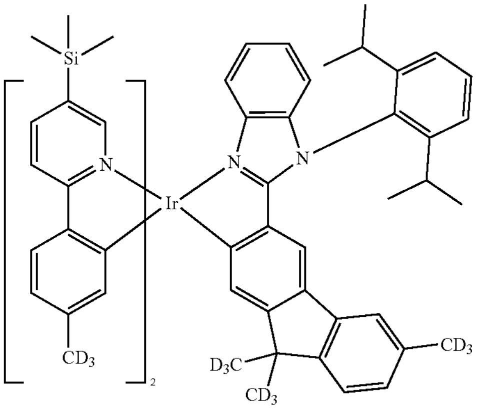
1588
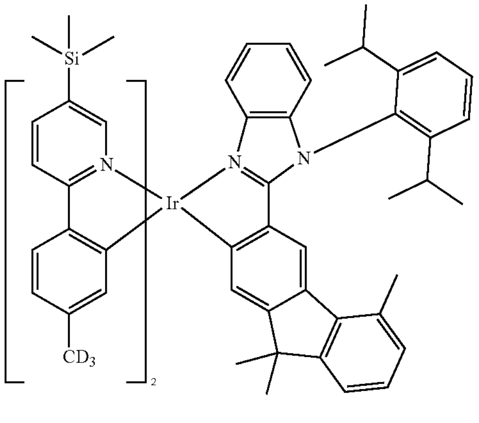
1589
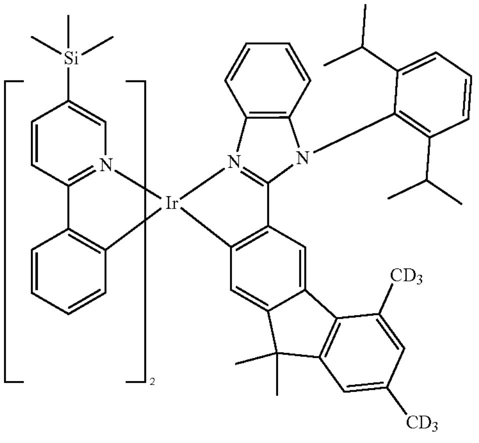
1590
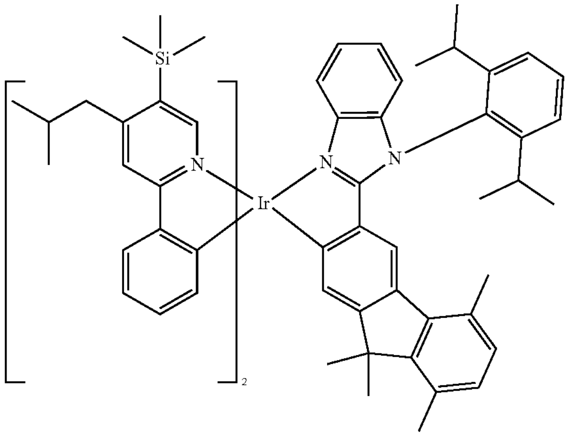
1591
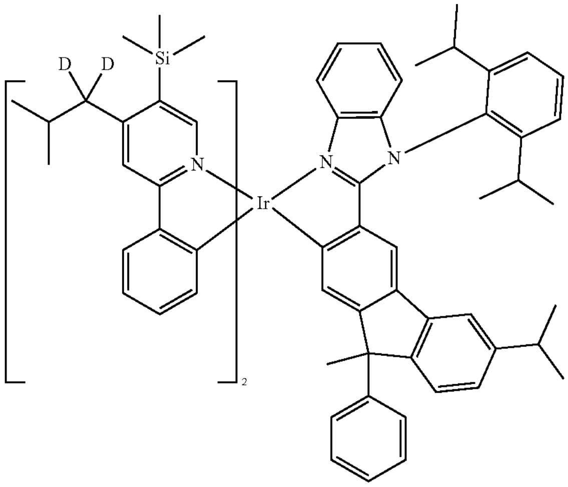

-continued
1592
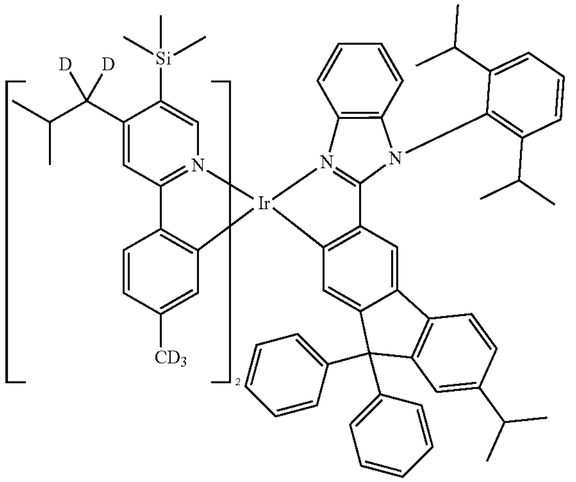
1593
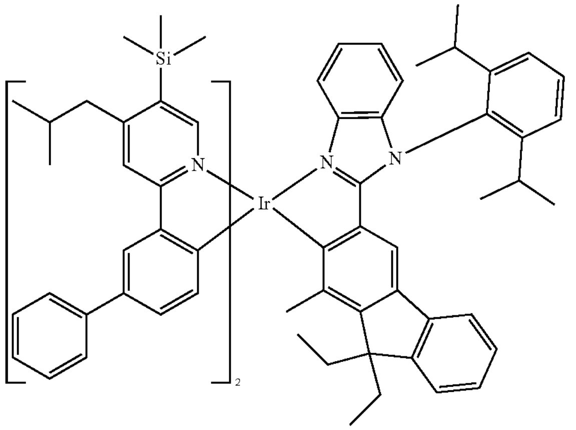
1594
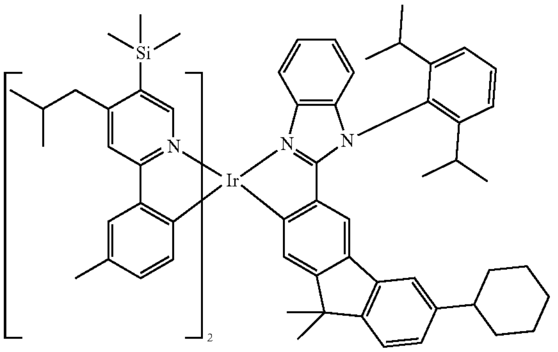
-continued
1595
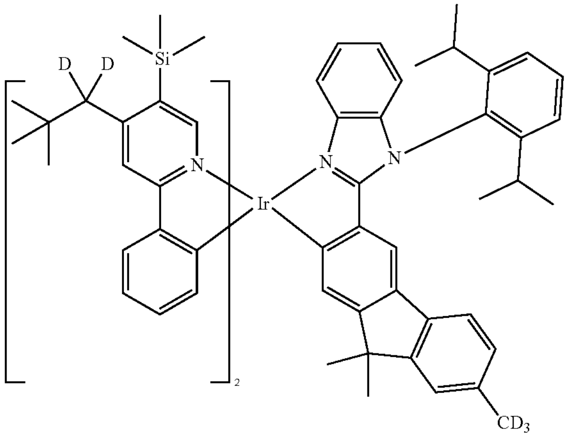
1596
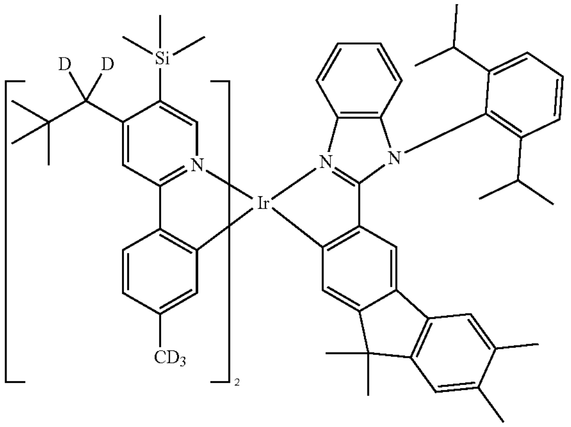
1597
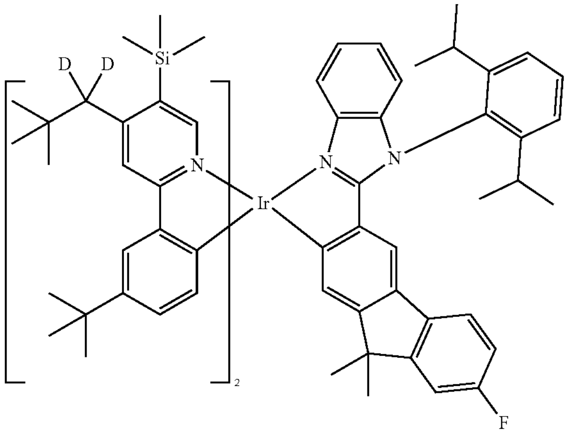

-continued
1598
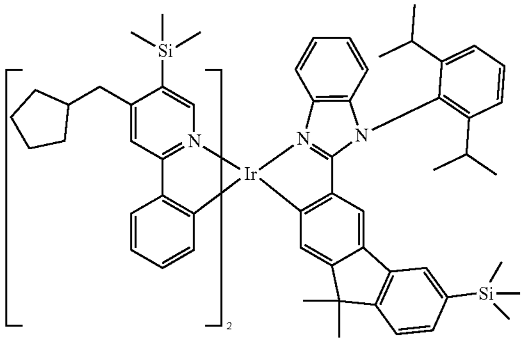
199
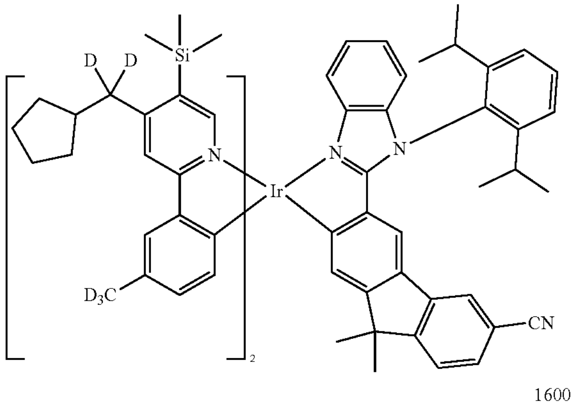
1600
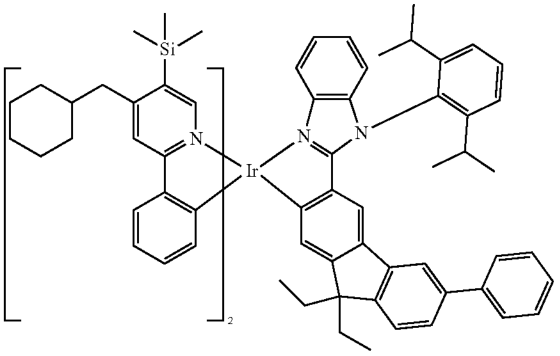
1601
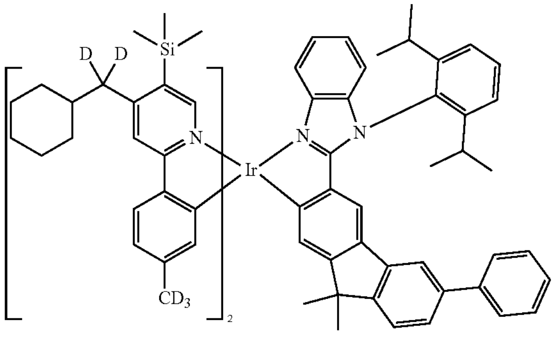
-continued
1602
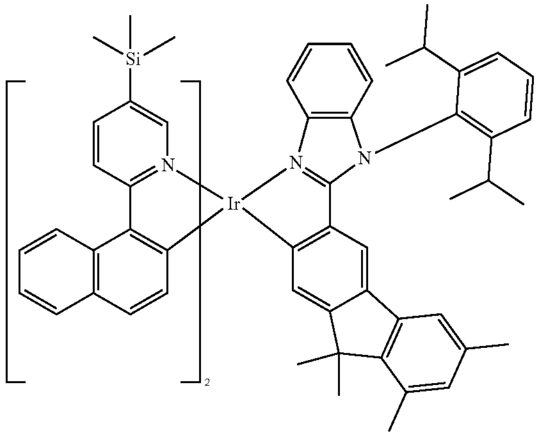
1603
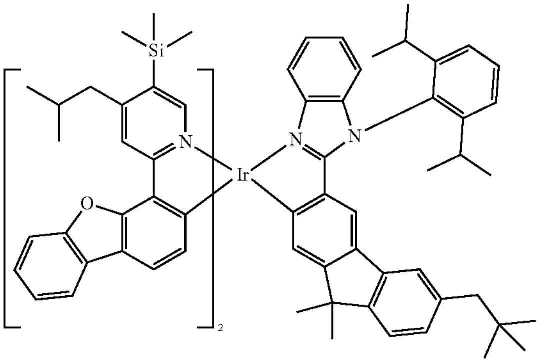
1604
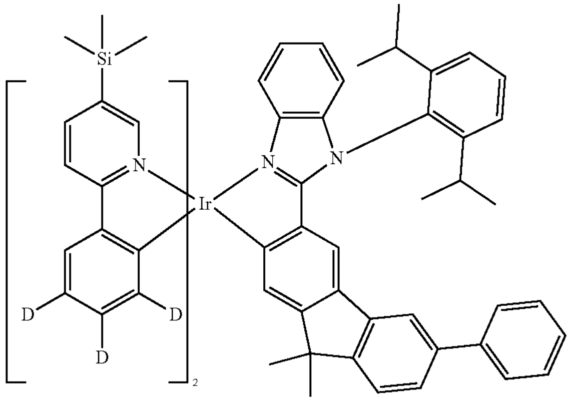

-continued
1605
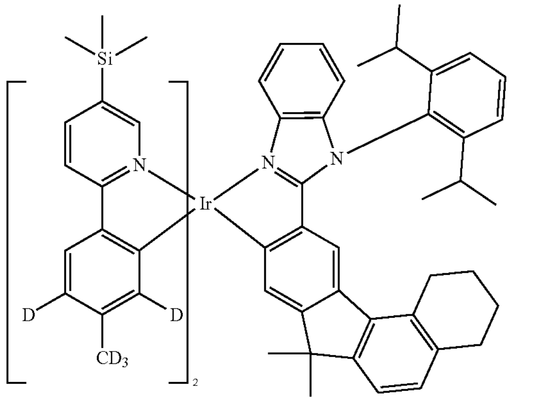
1606
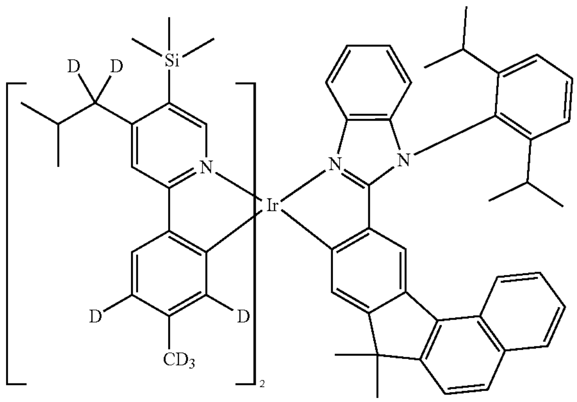
1607
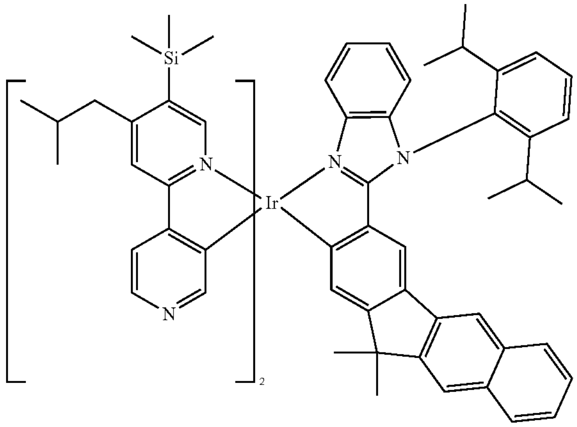
-continued
1608
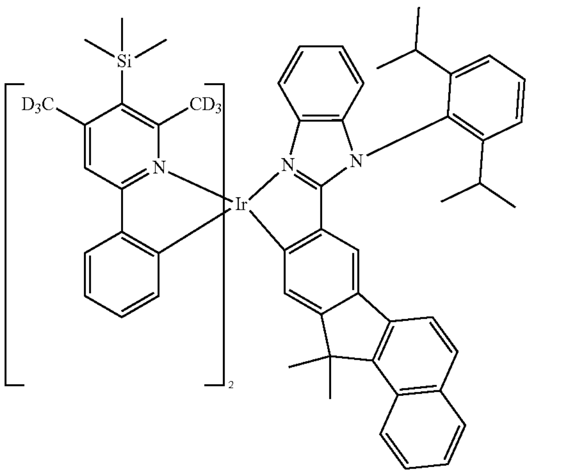
1609
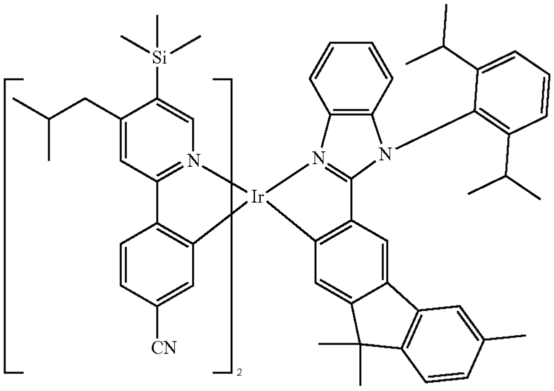
1610
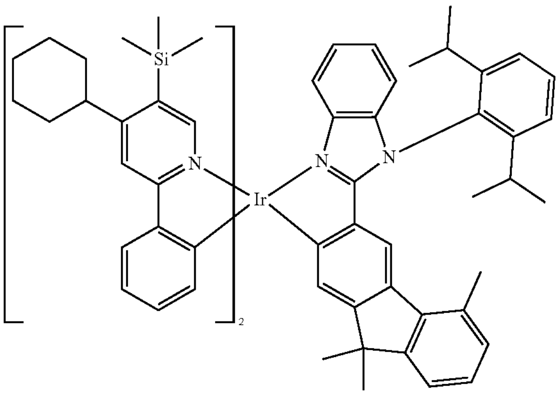

-continued
1611
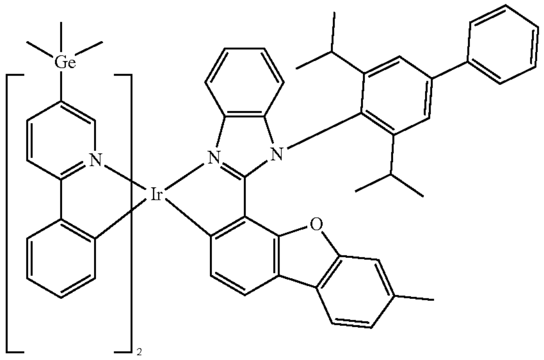
1612
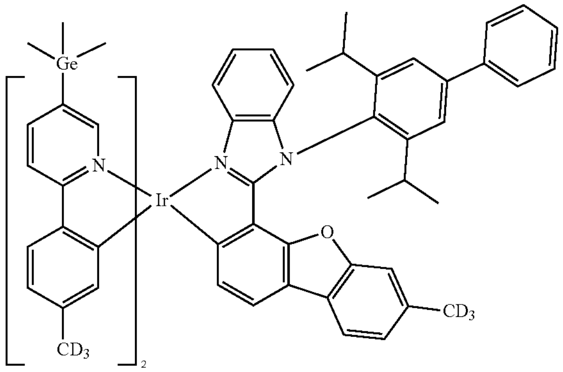
1613
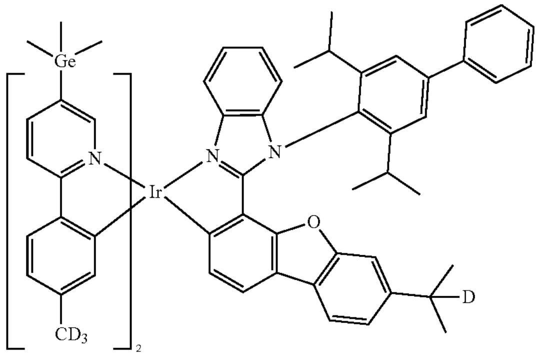
1614
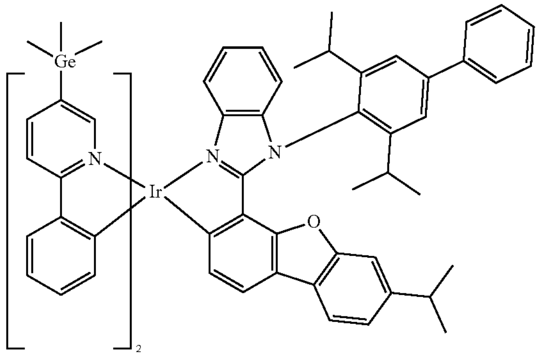
-continued
1615
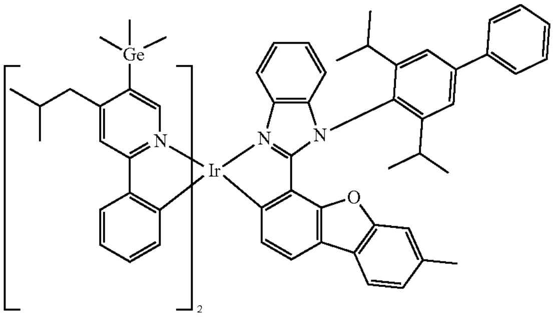
1616
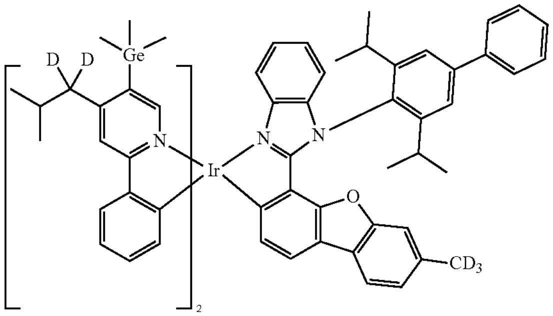
1617
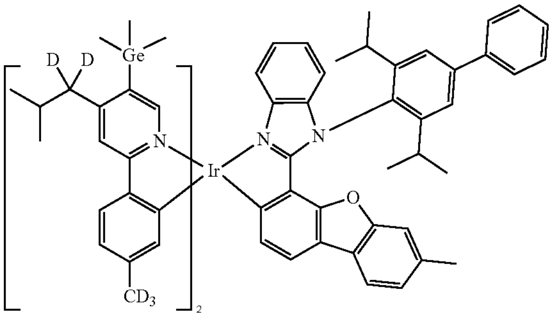
1618
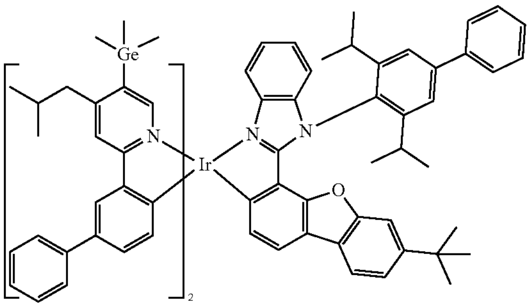

-continued
1619
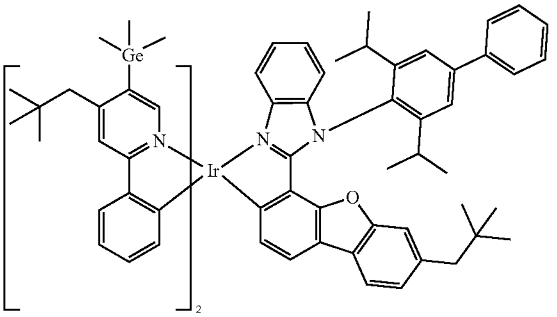
1620
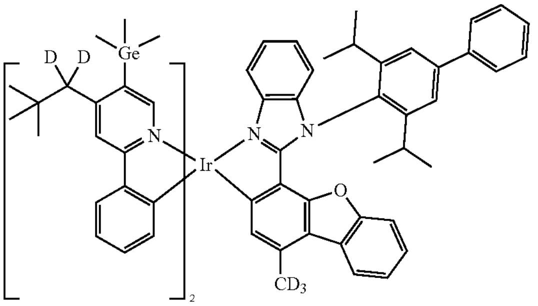
1621
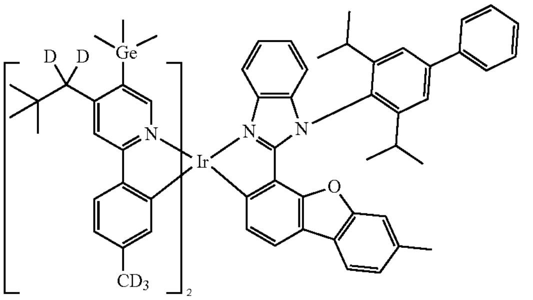
1622
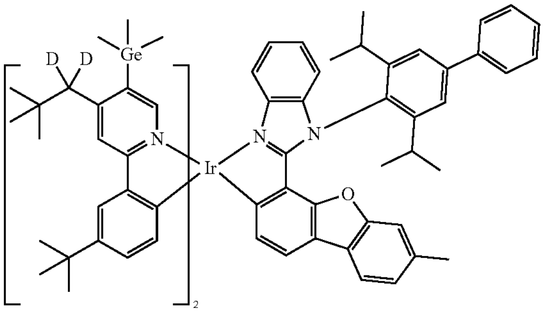
-continued
1623
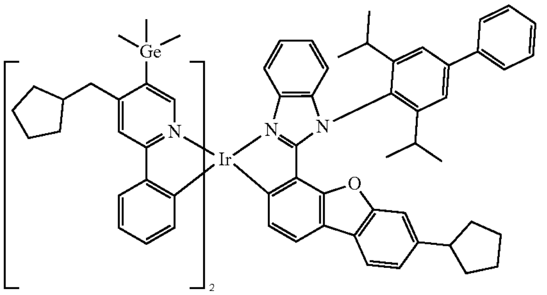
1624
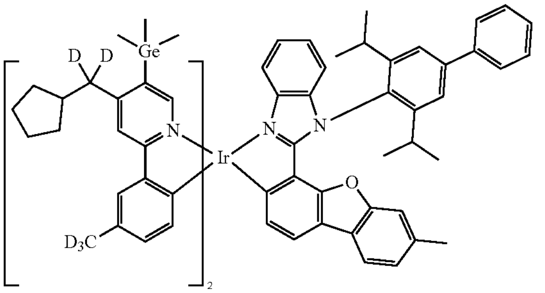
1625
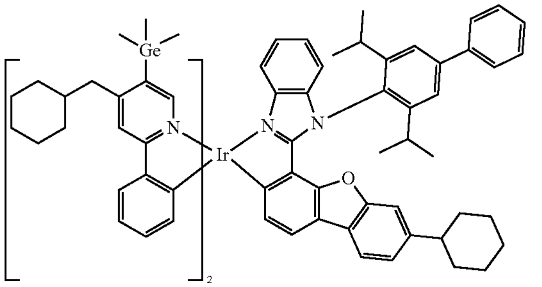
1626
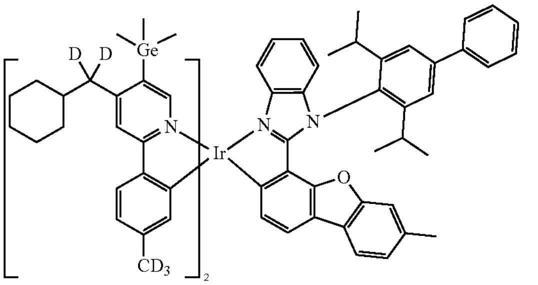
1627
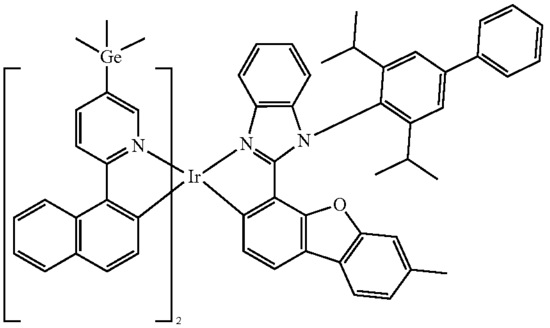

-continued
1628
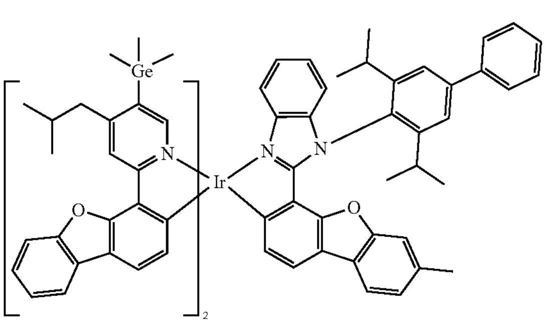
1629
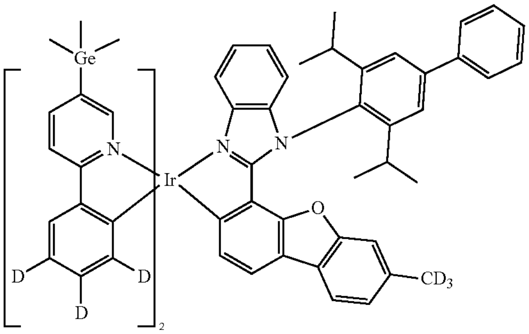
1630
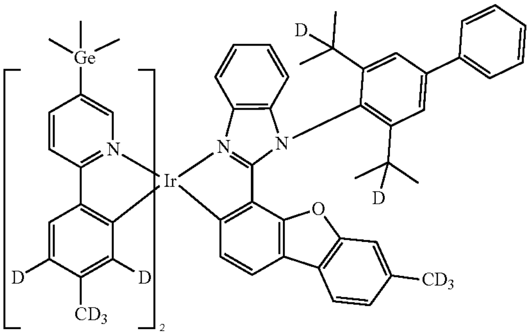
1631
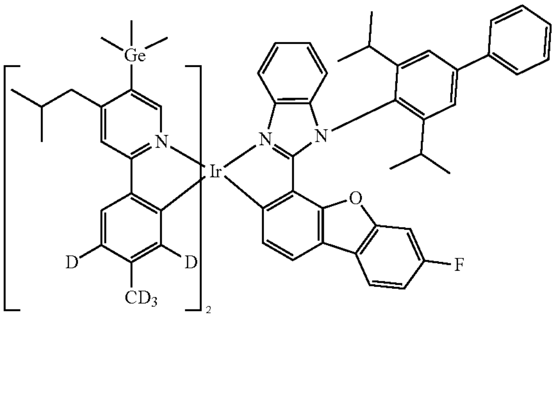
-continued
1632
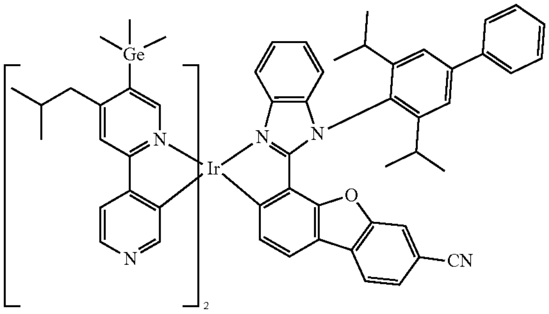
1633
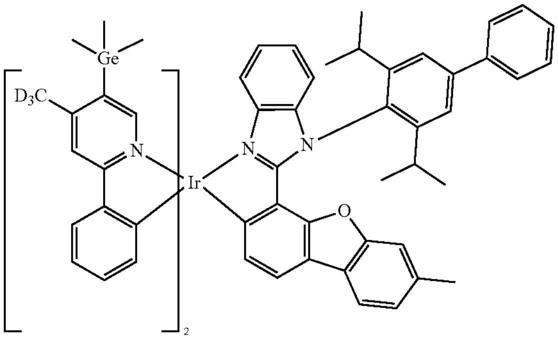
1634
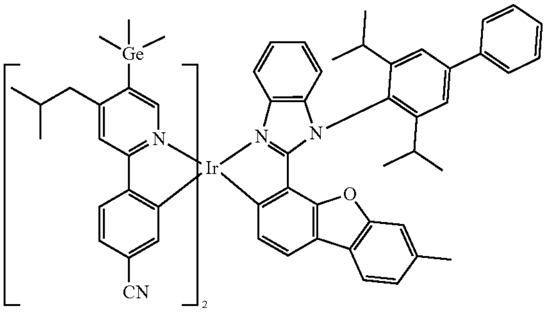
1635
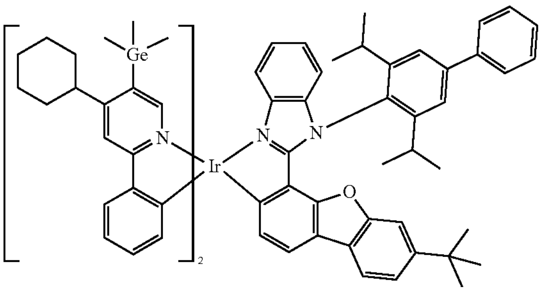

1636
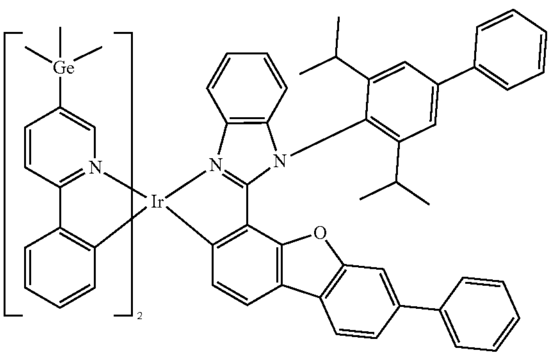
1637
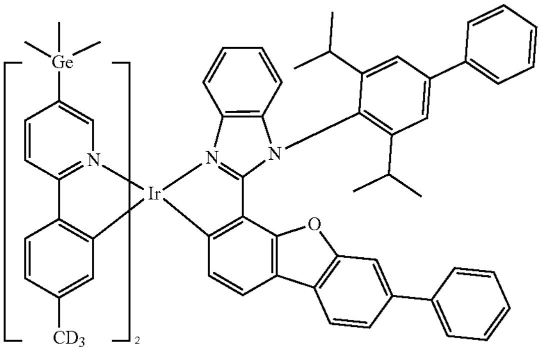
1638
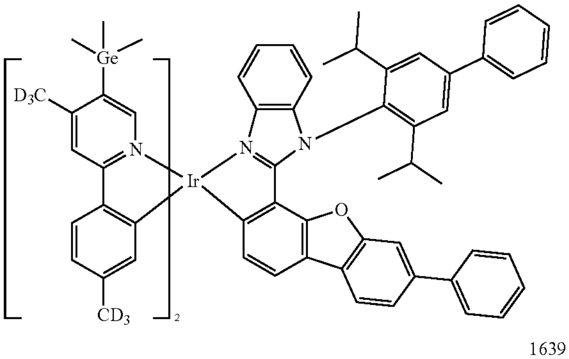
1639
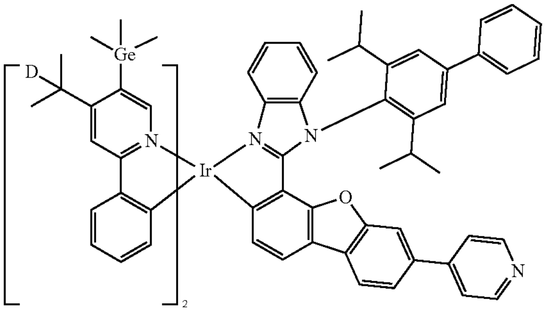
1640
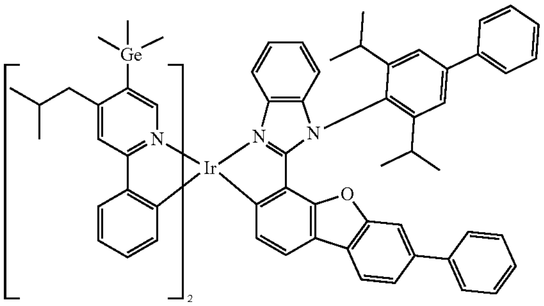
1641
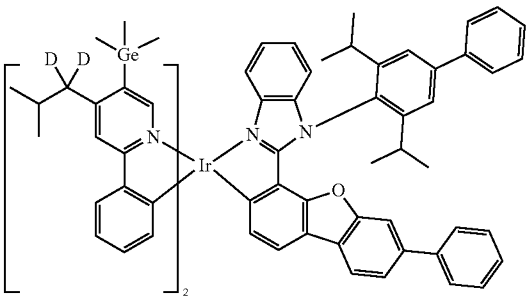
1642
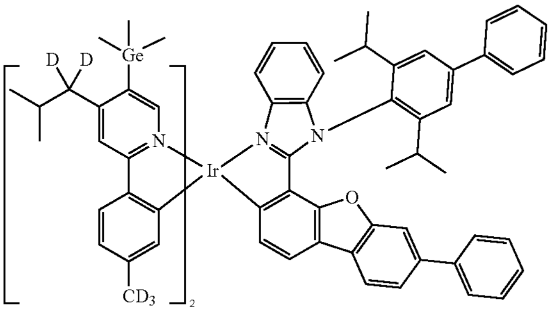
1643
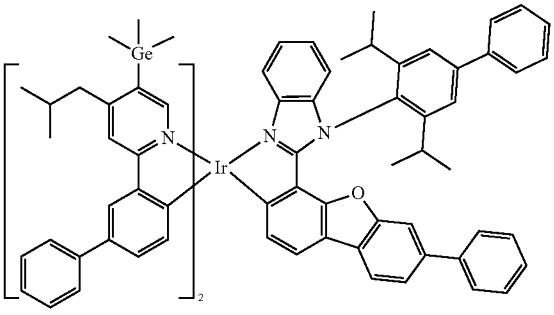

1644
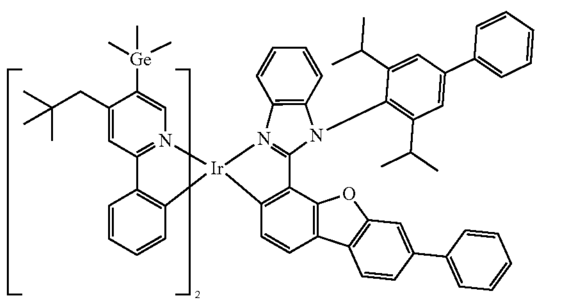
1645
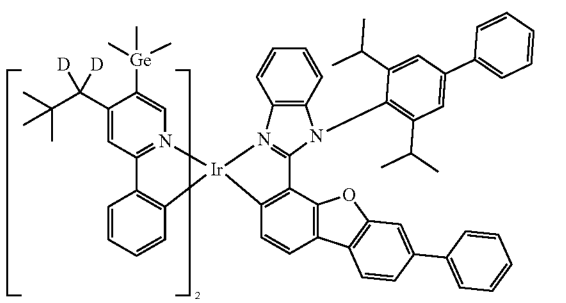
1646
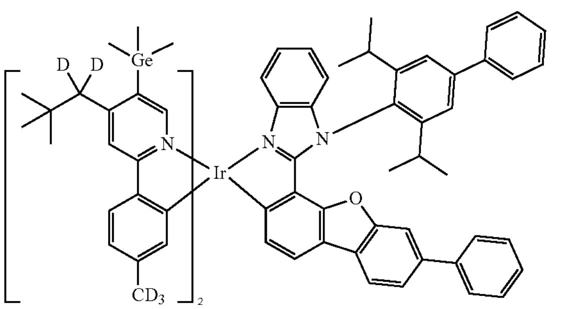
1647
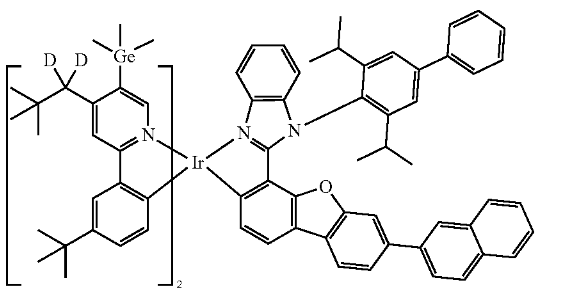
1648
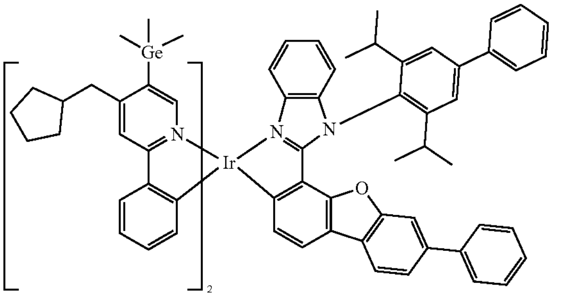
1649
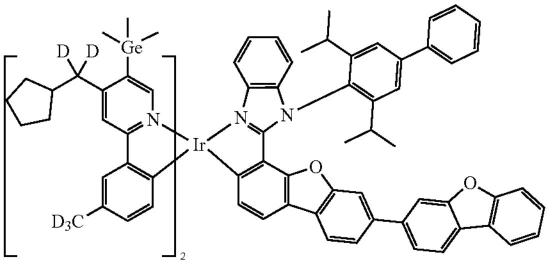
1650
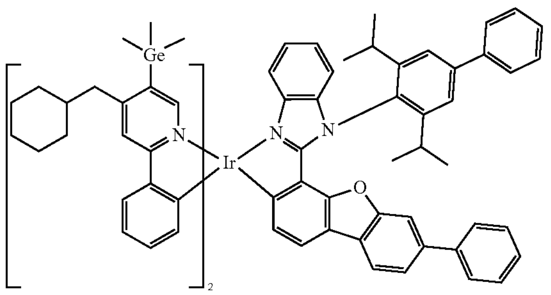
1651
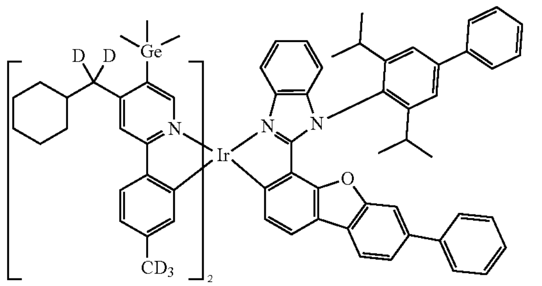
1652
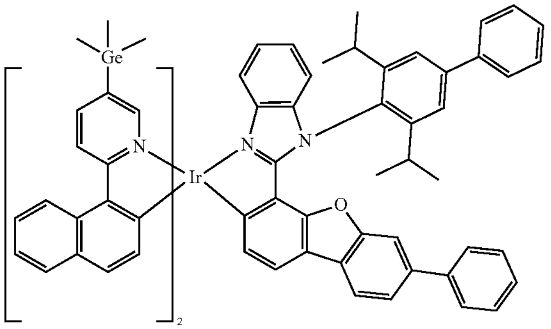
1653
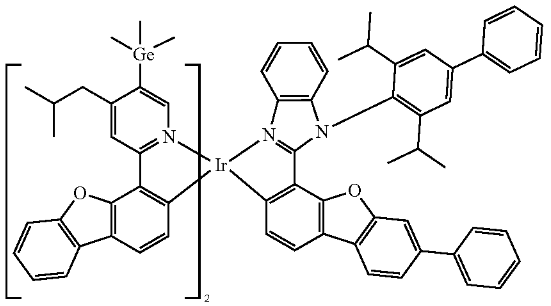

1654
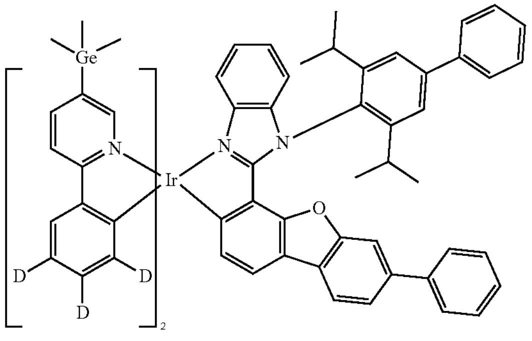
1655
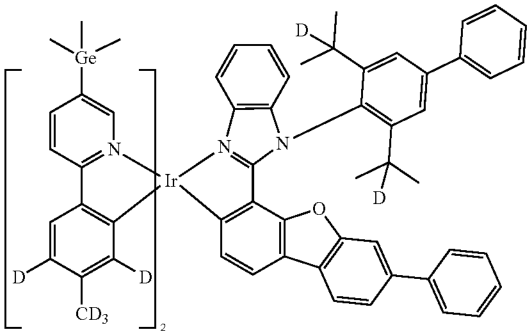
1656
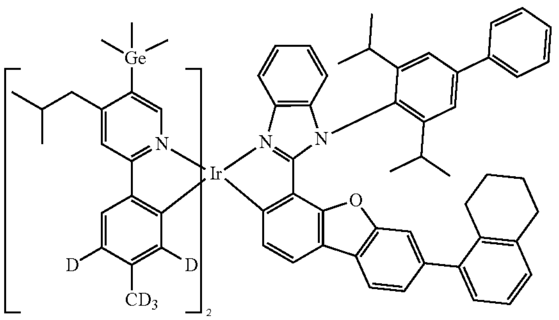
1657
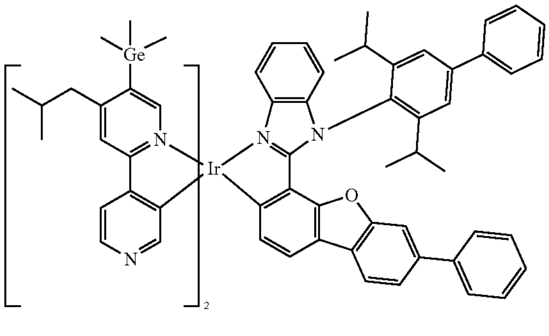
1658
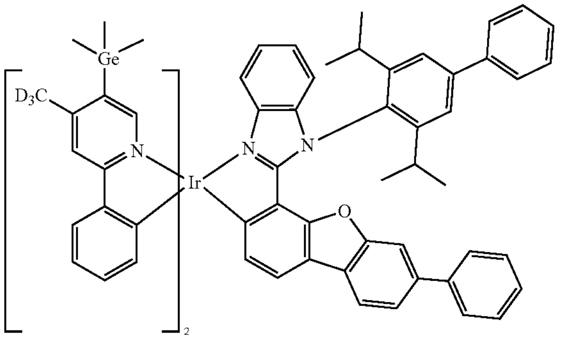
1659
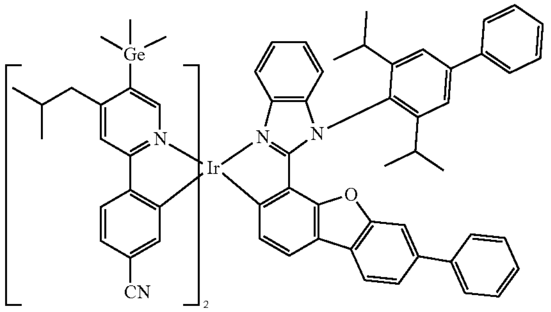
1660
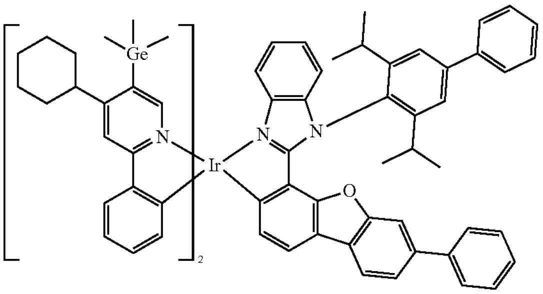
1661
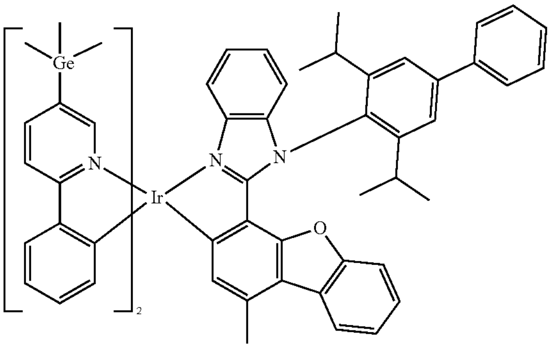

-continued
1662
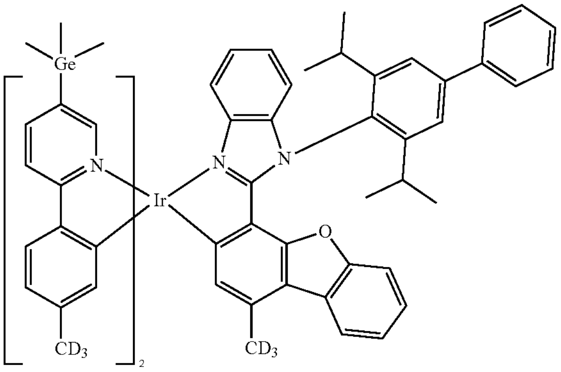
1663
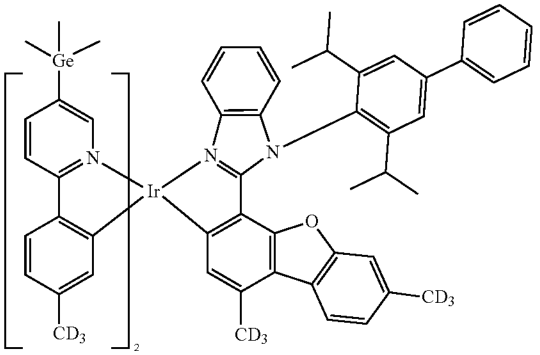
1664
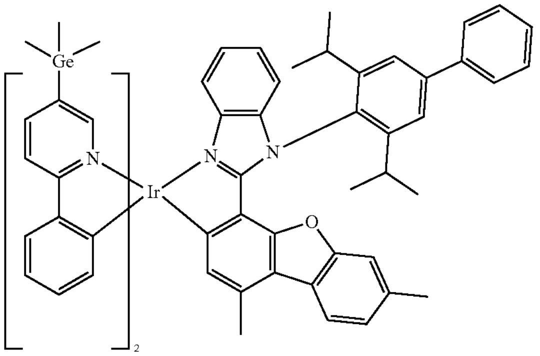
1665
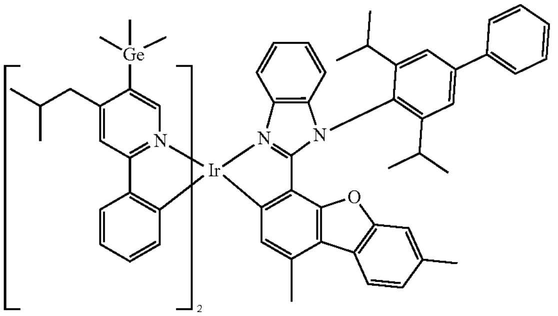
-continued
1666
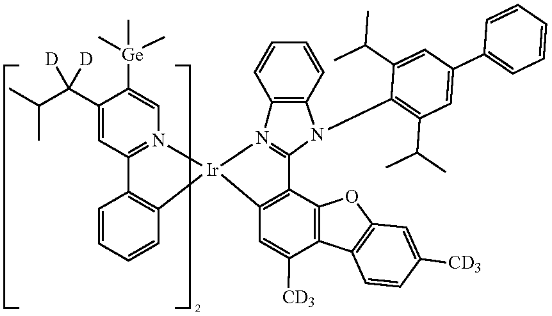
1667
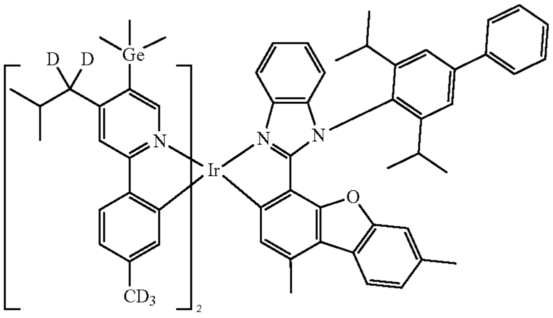
1668
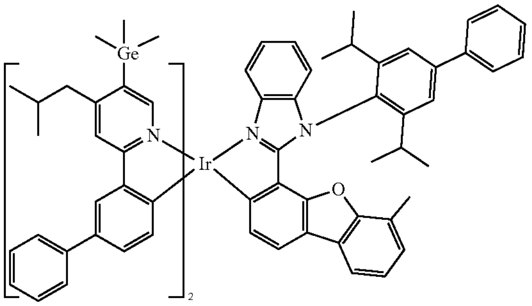
1669
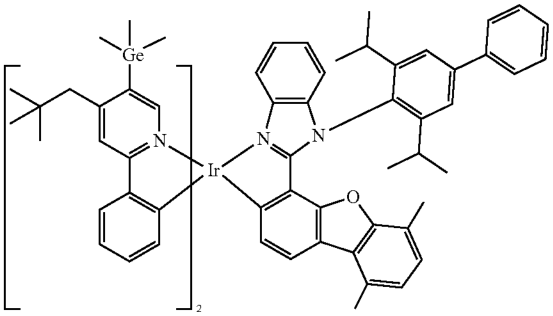

-continued
1670
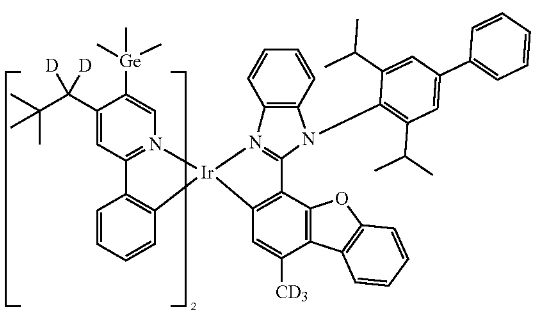
1671
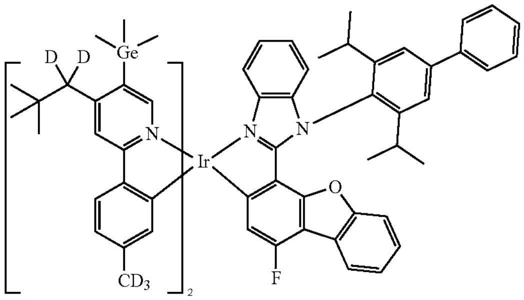
1672
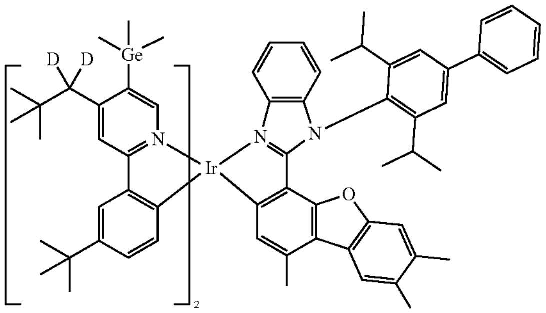
1673
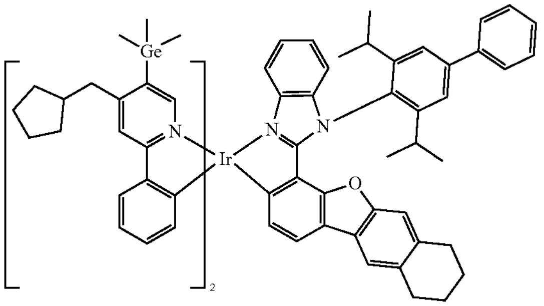
1674
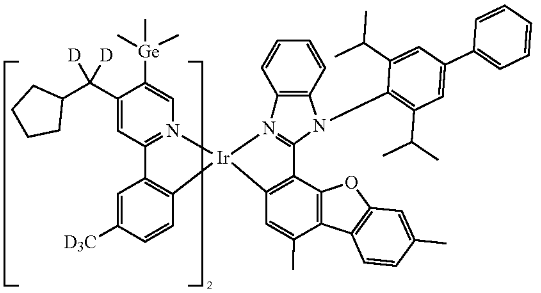
-continued
1675
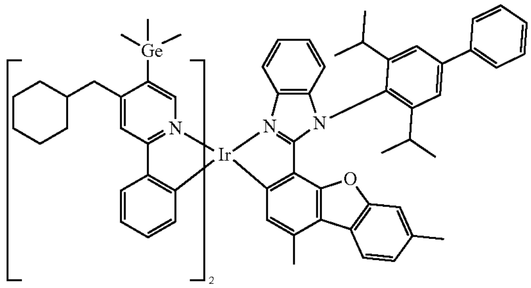
1676
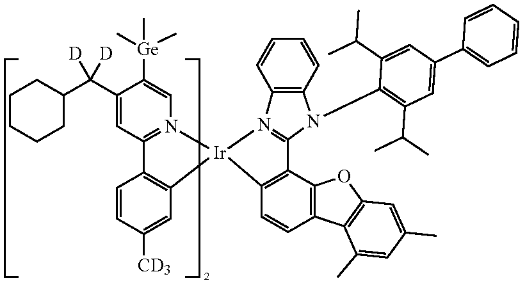
1677
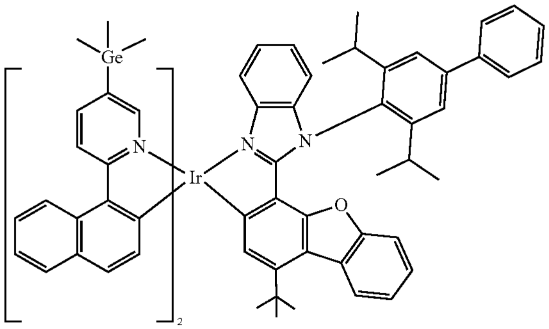
1678
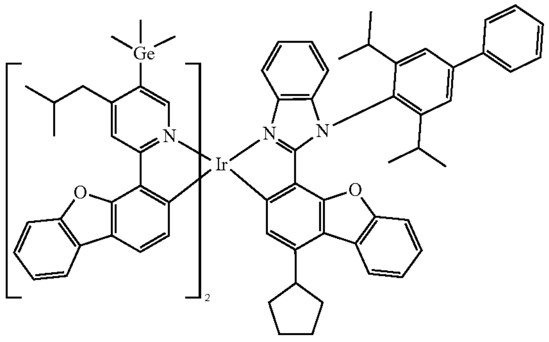

-continued
1679
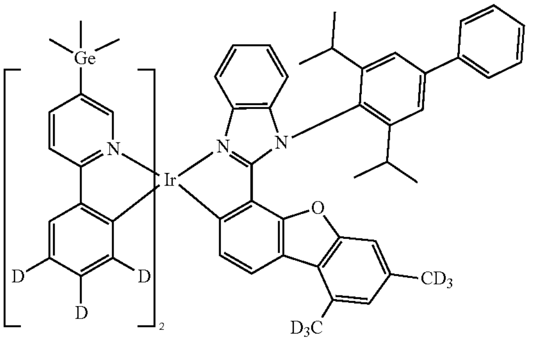
1680
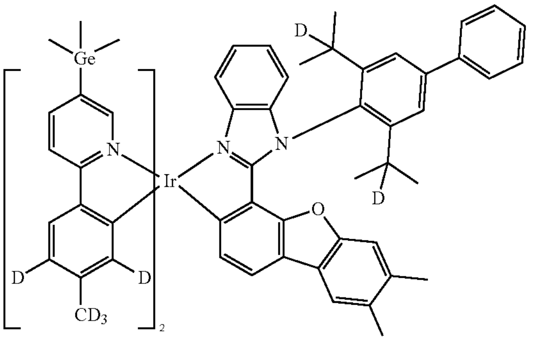
1681
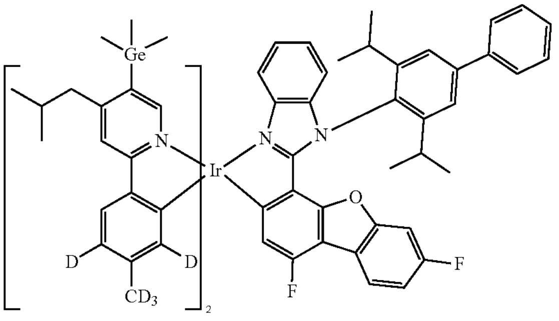
1682
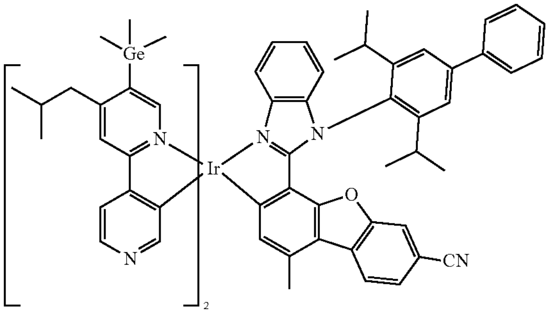
-continued
1681
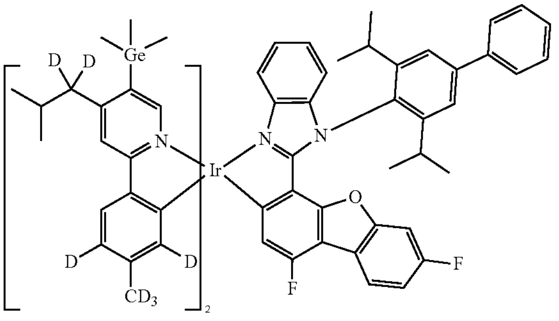
1682
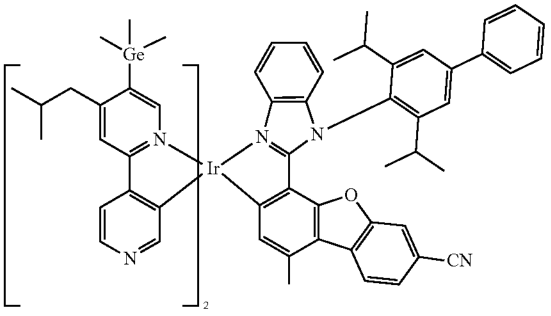
1683
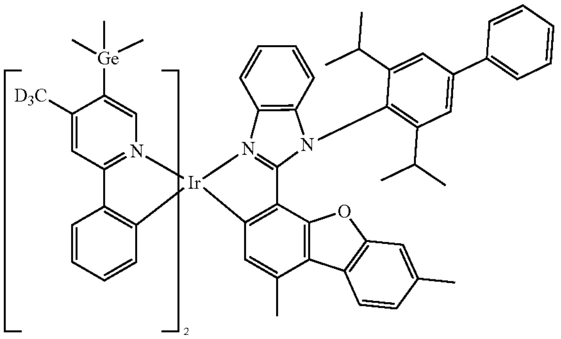
1684
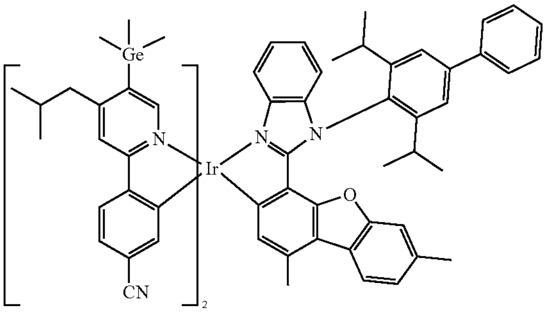

-continued
1685
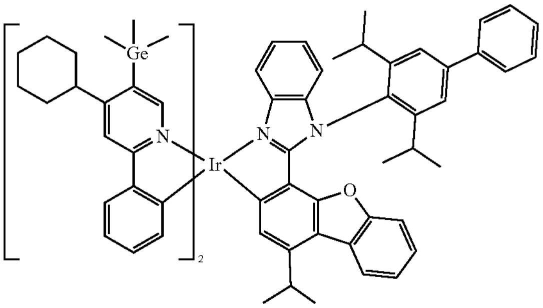
1686
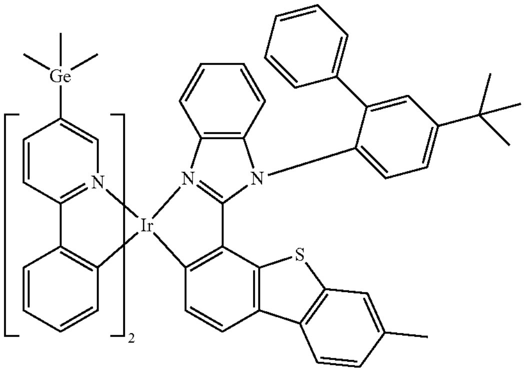
1687
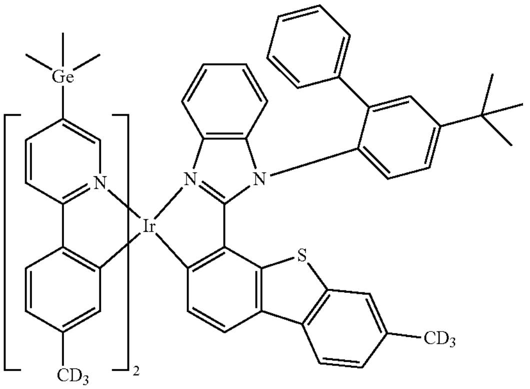
1688
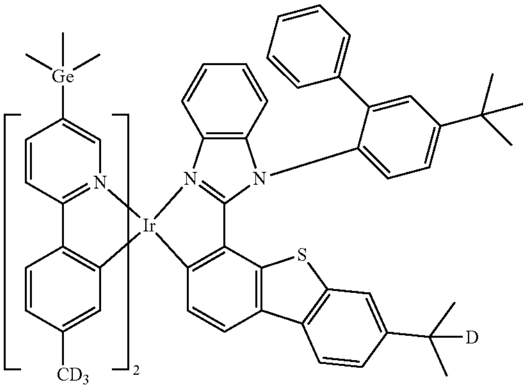
-continued
1689
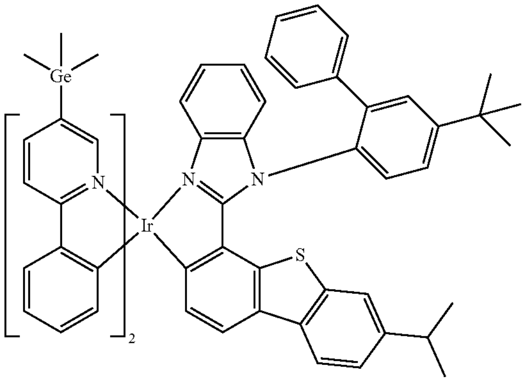
1690
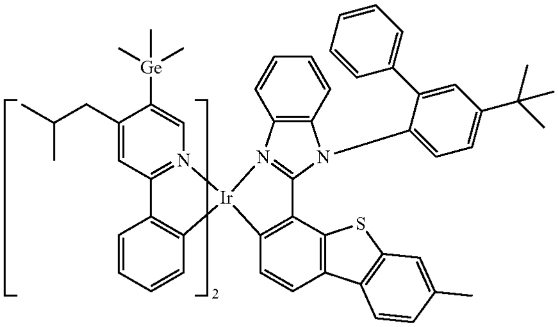
1691
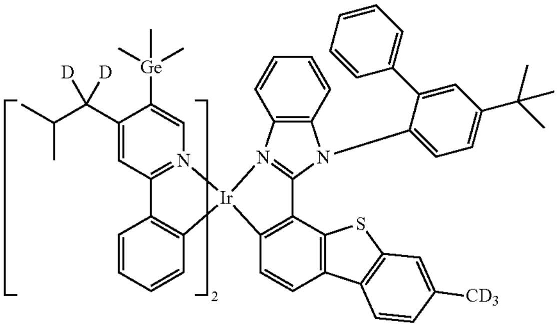
1692
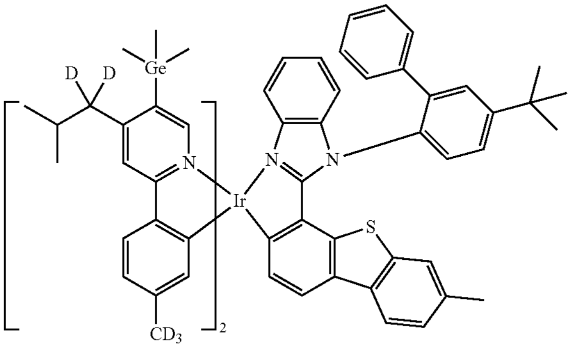

-continued
1693
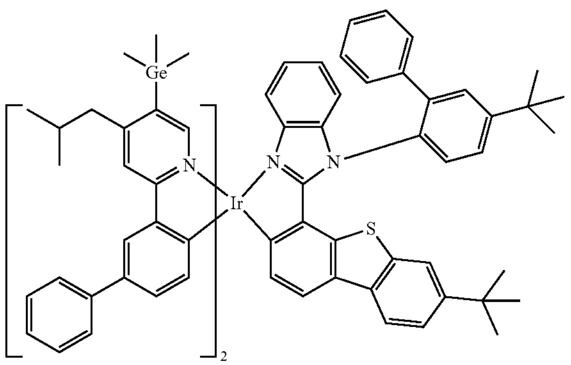
1694
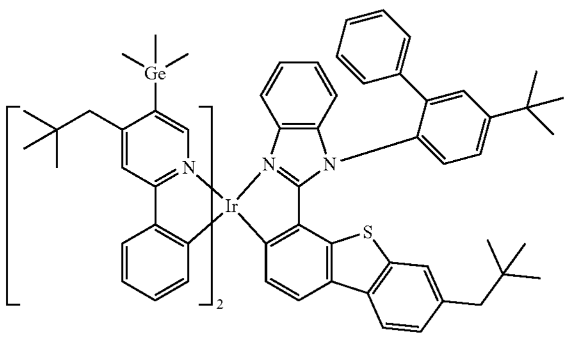
1695
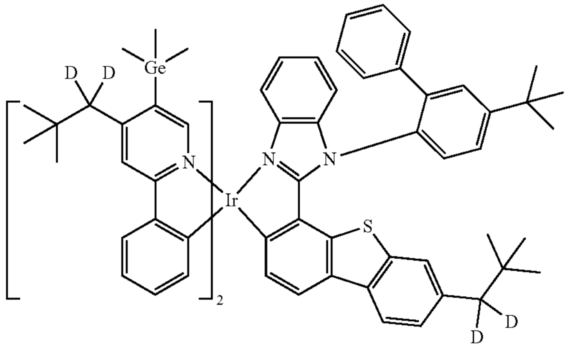
1696
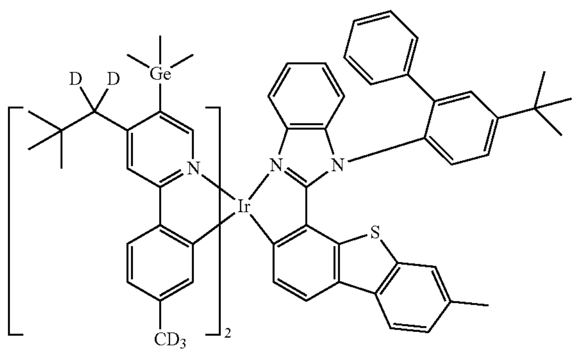
-continued
1697
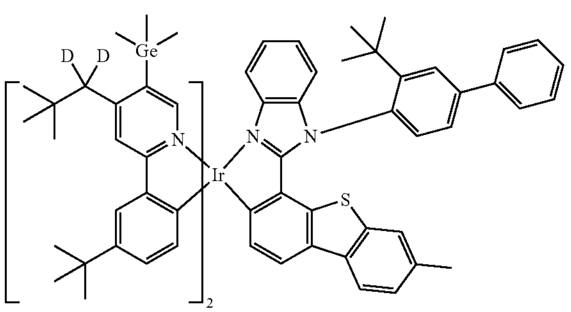
1698
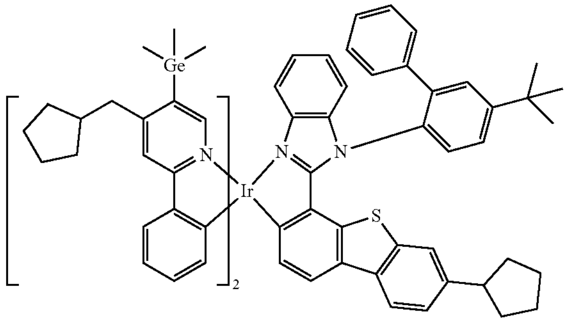
1699
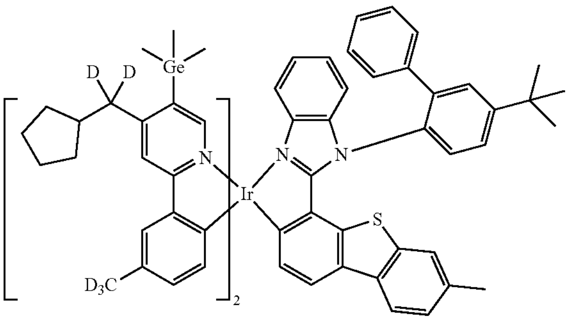
1700
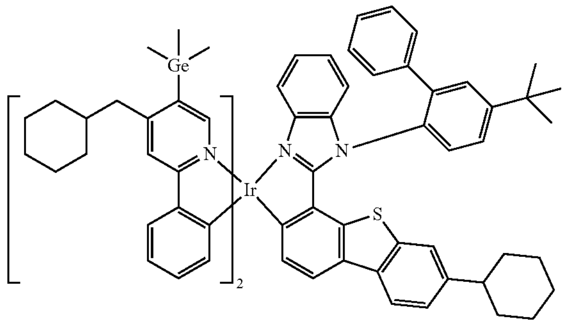

-continued
1701
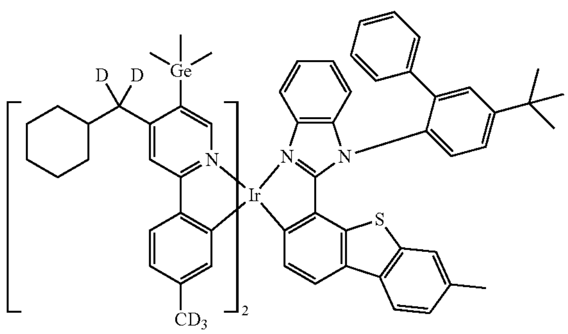
1702
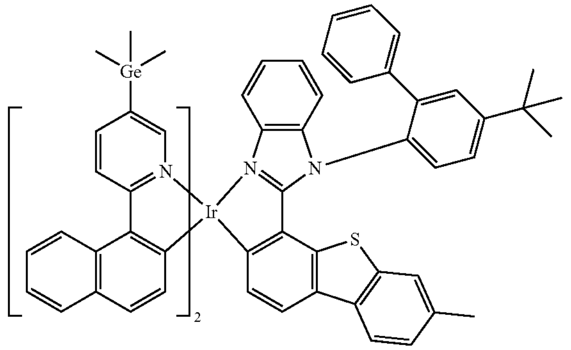
1703
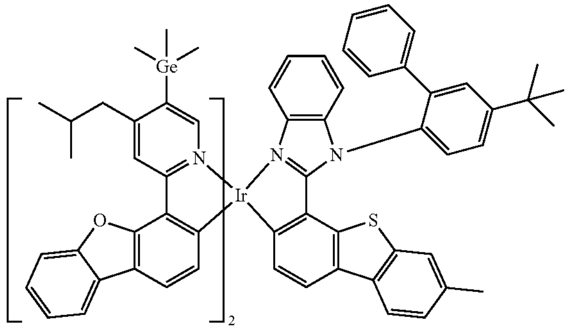
1704
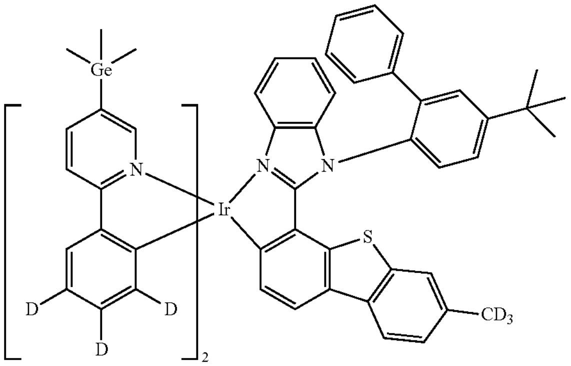
-continued
1705
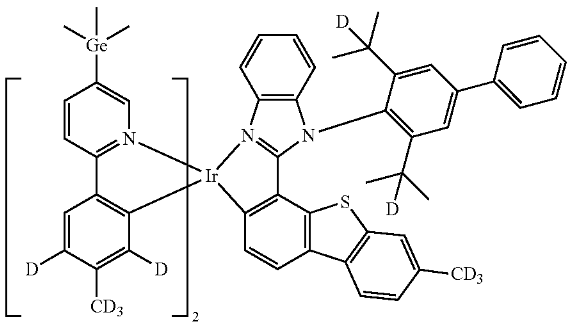
1706
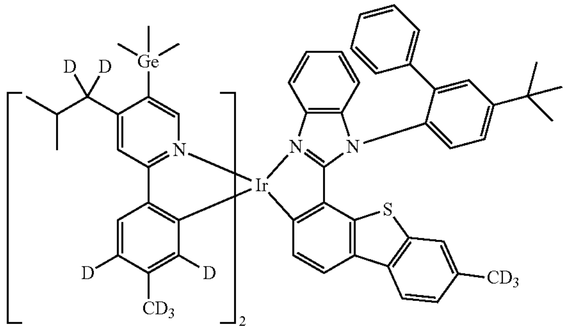
1707
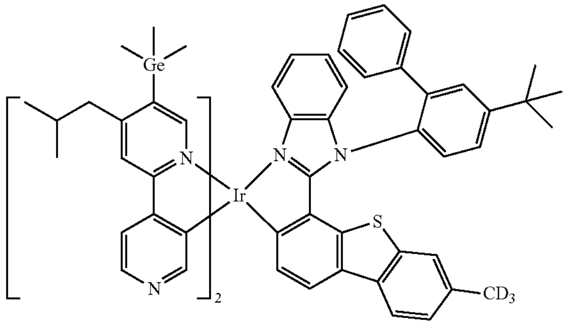
1708
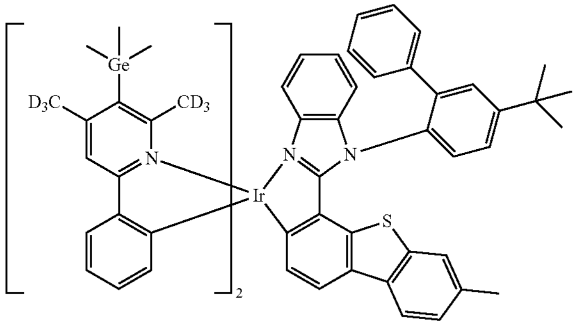

-continued
1709
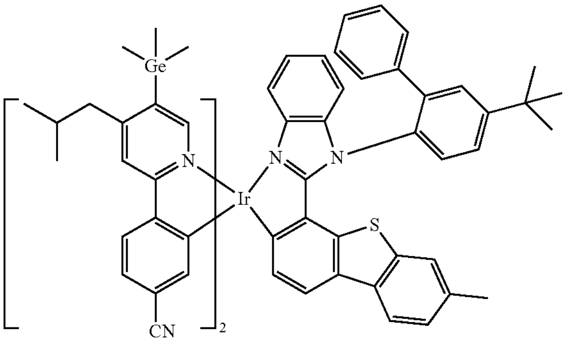
1710
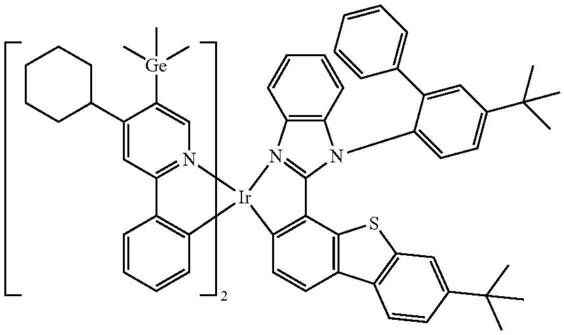
1711
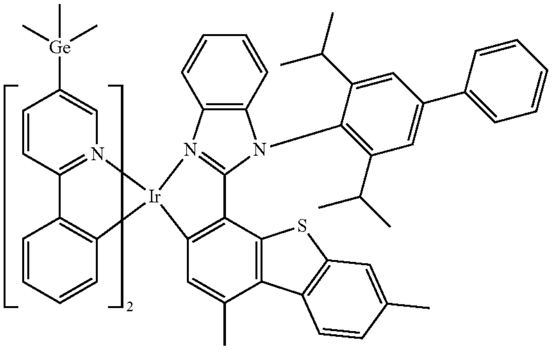
1712
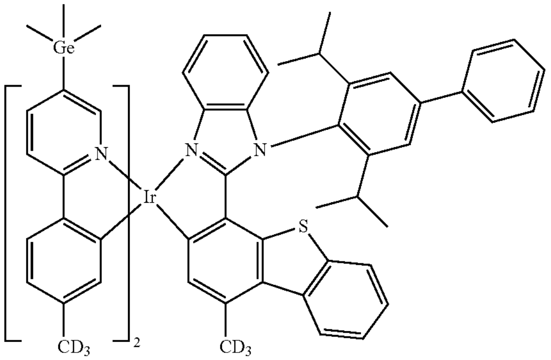
-continued
1713
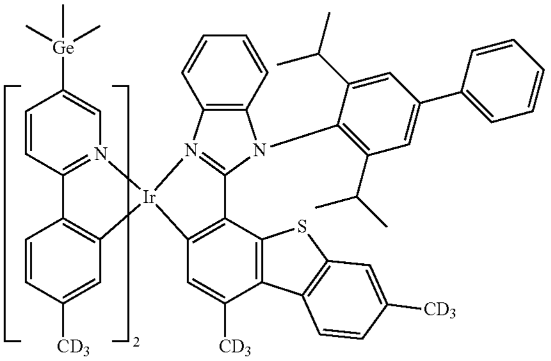
1714
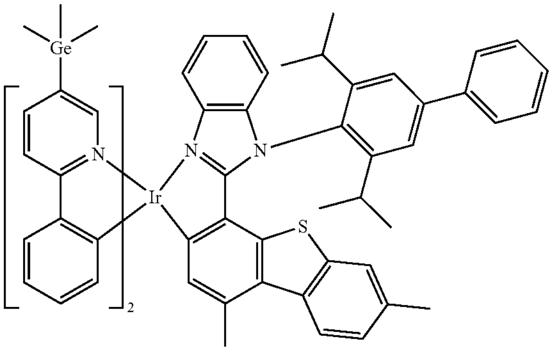
1715
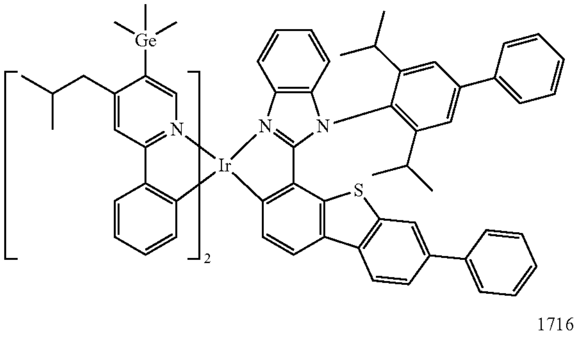
1716
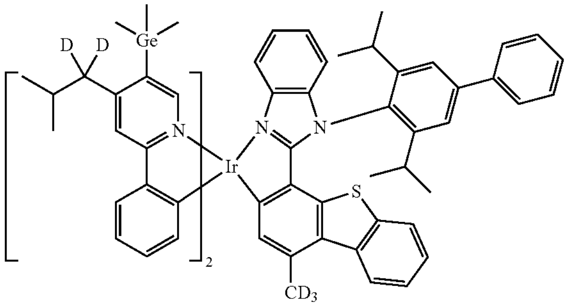

-continued
1717
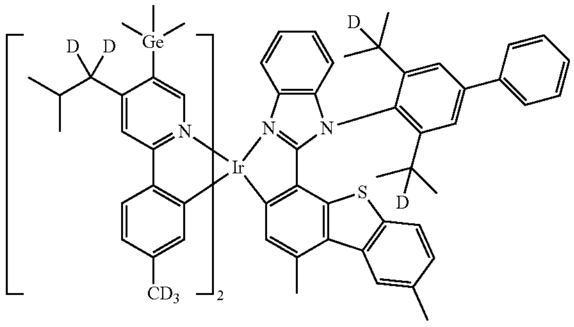
1718
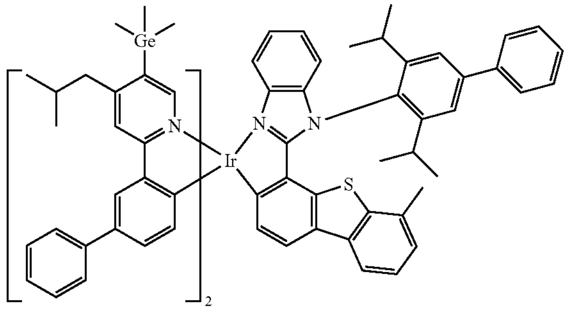
1719
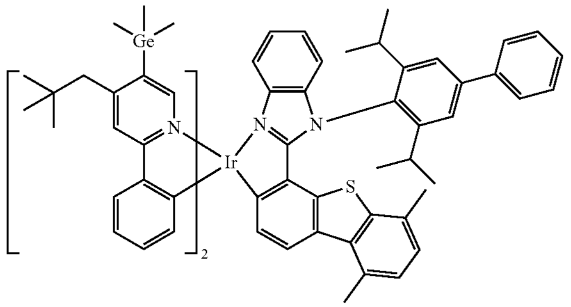
1720
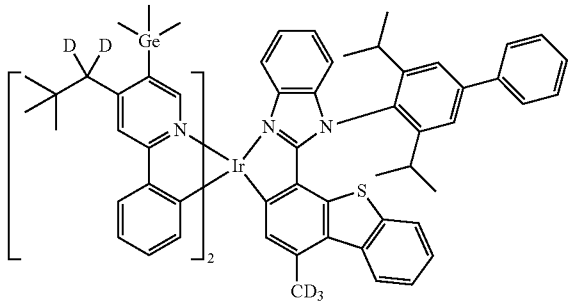
-continued
1721
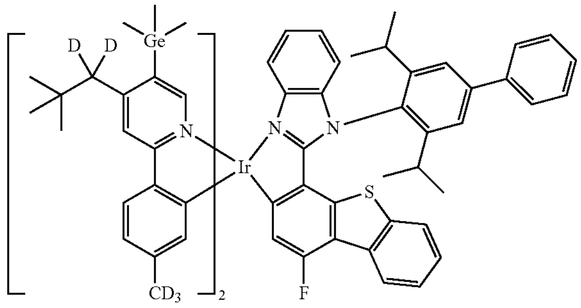
1722
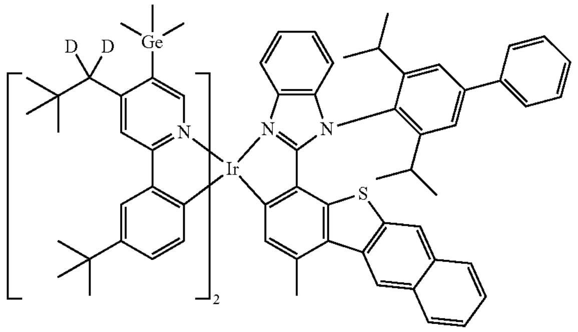
1723
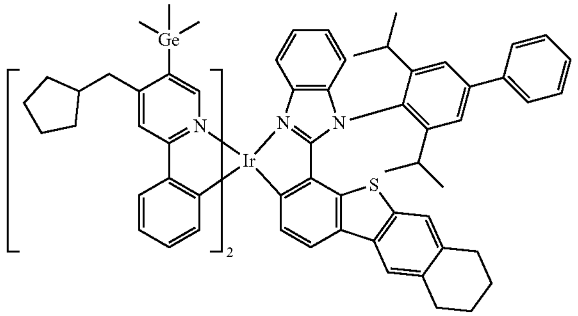
1724
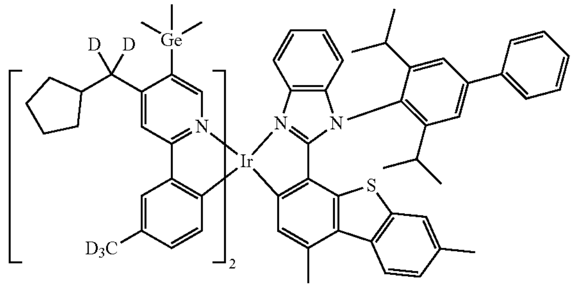
1725
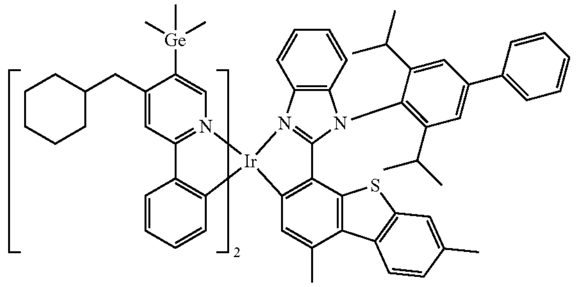

-continued
1726
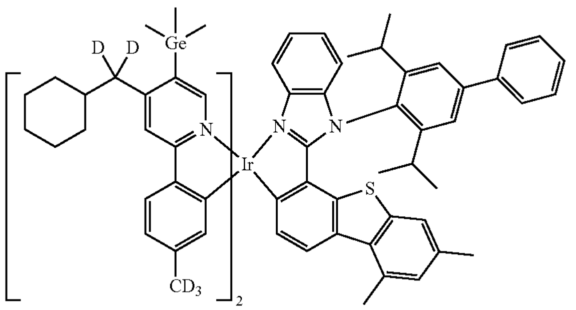
1727
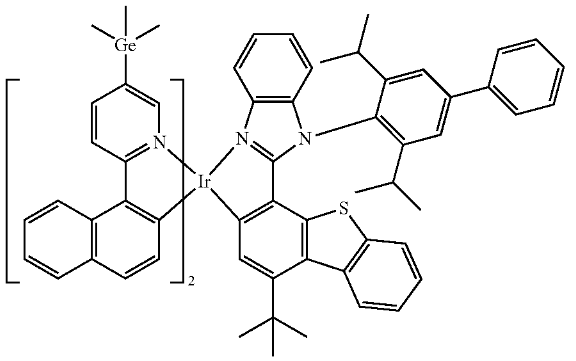
1728
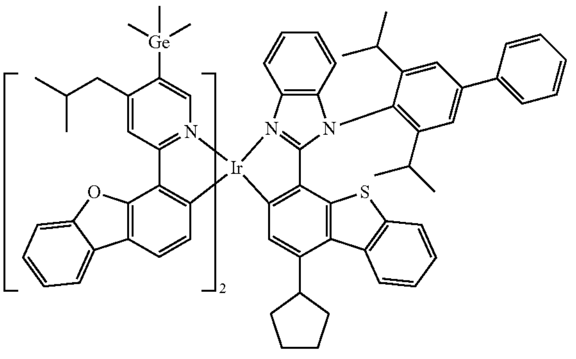
1729
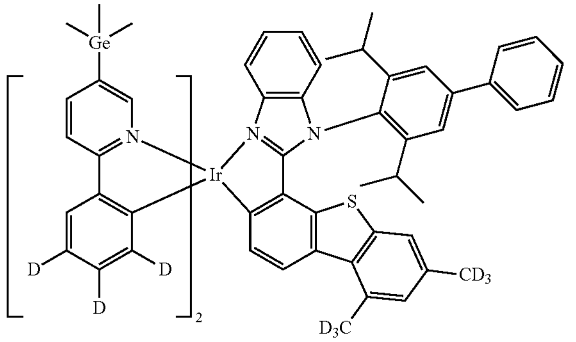
-continued
1730
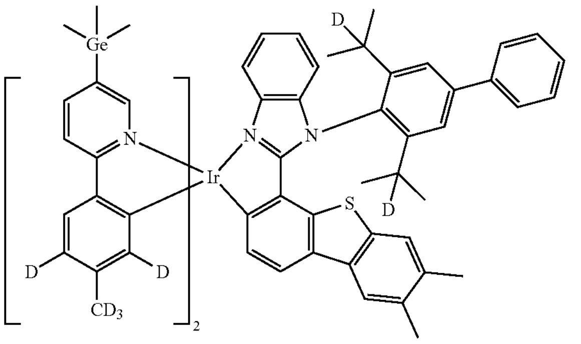
1731
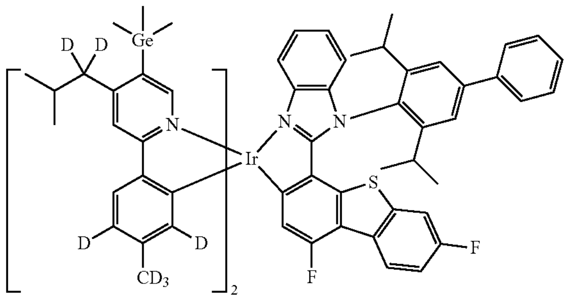
1732
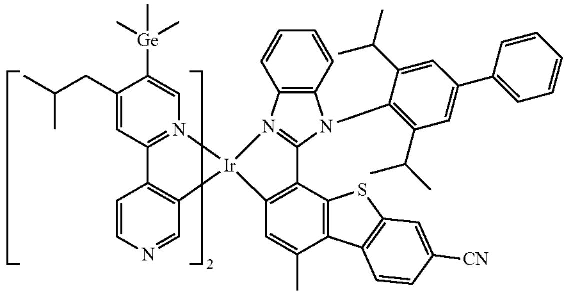
1733
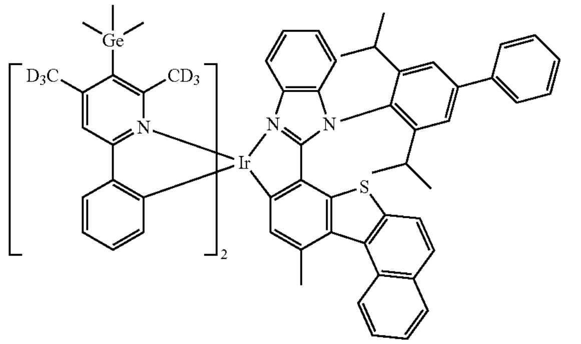

1734
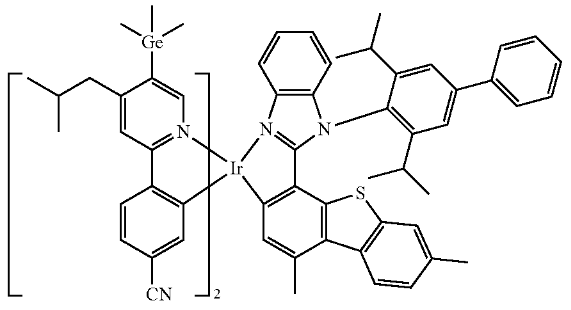
1735
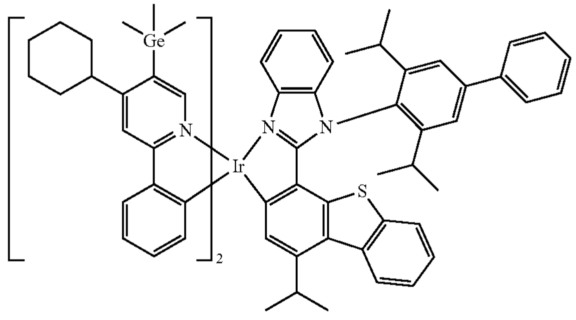
1736
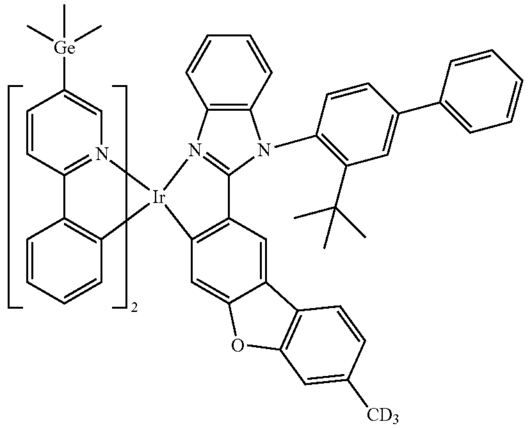
1737
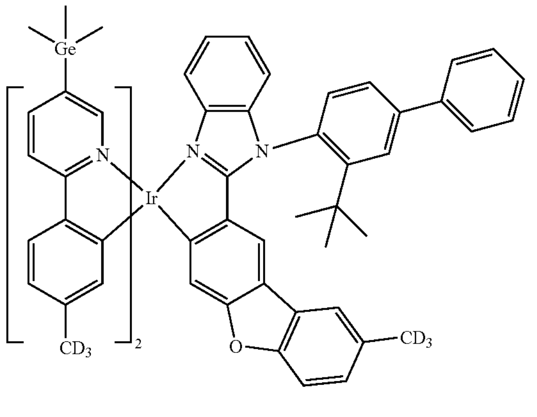
1738
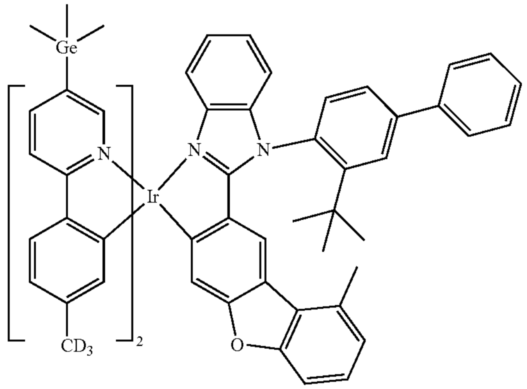
1739
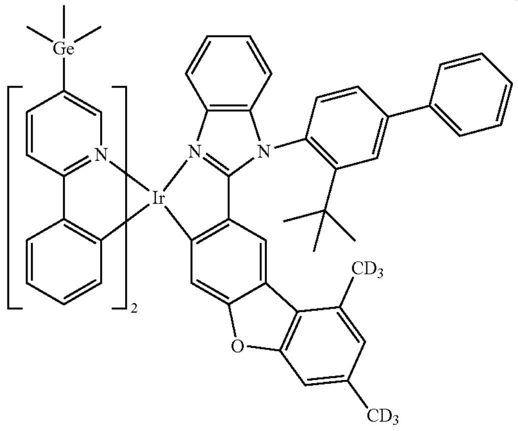
1740
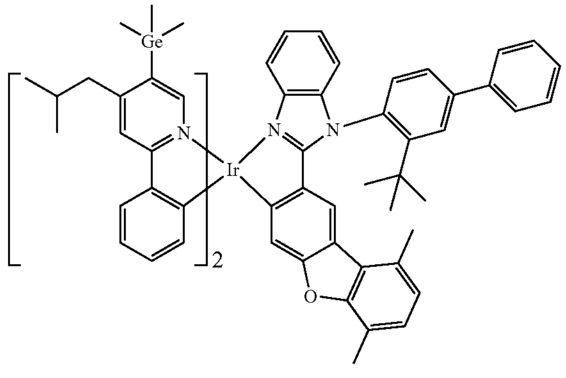
1741
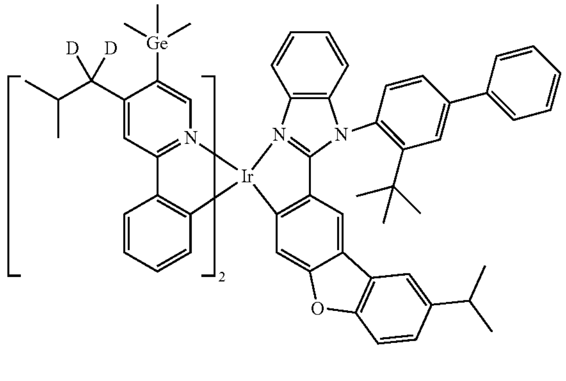

1742
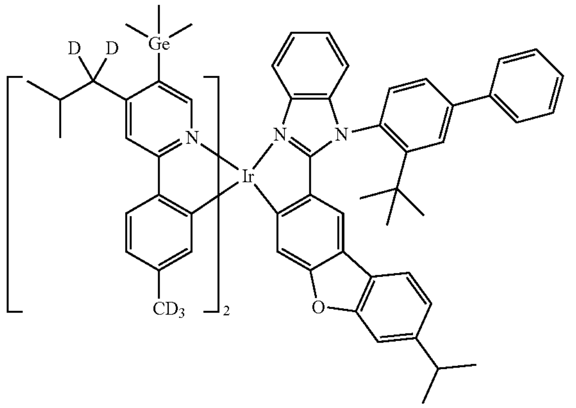
1743
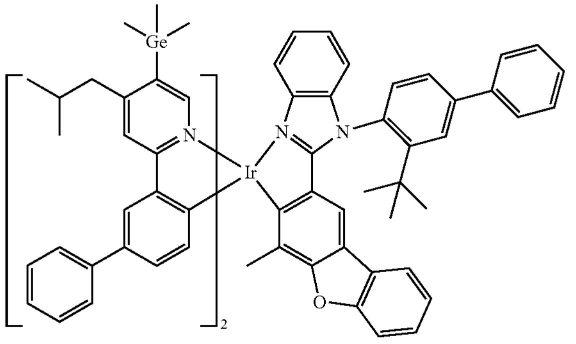
1744
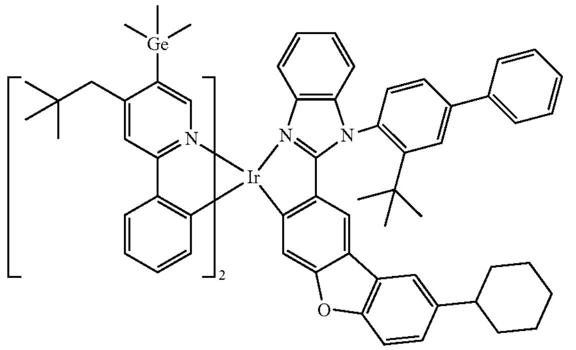
1745
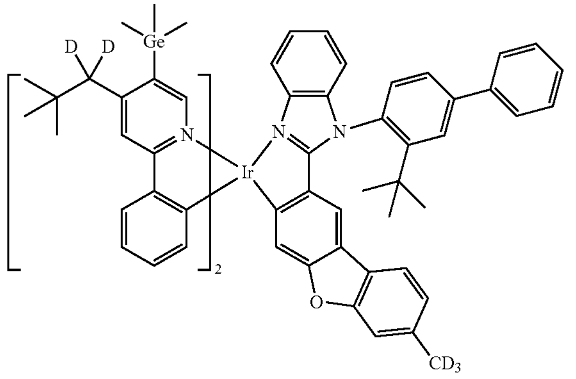
1746
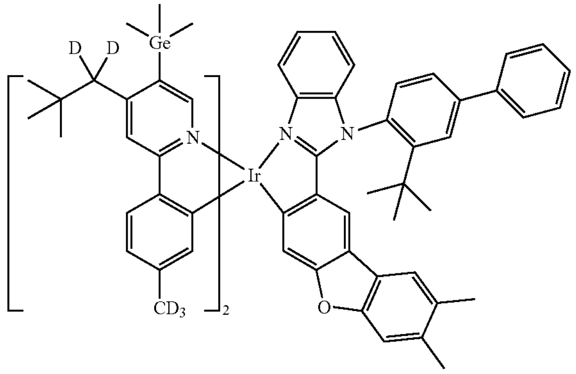
1747
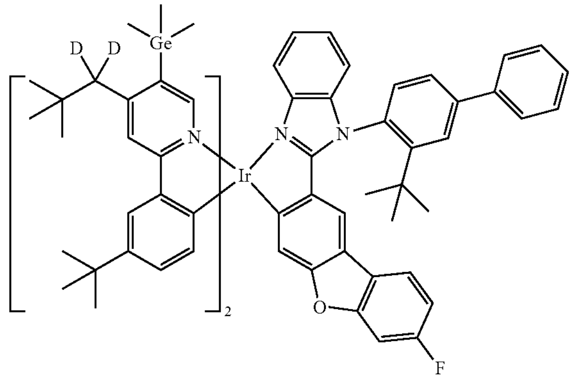
1748
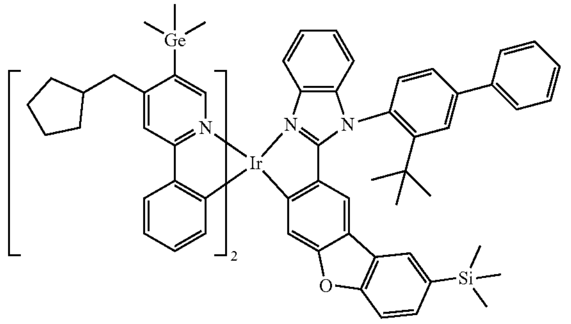
1749
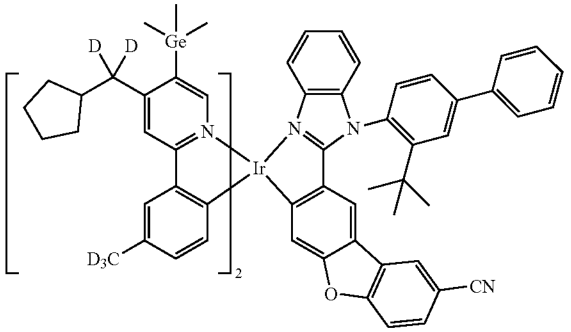

-continued
1750
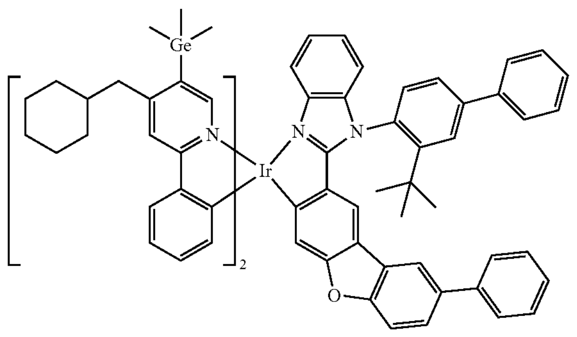
1751
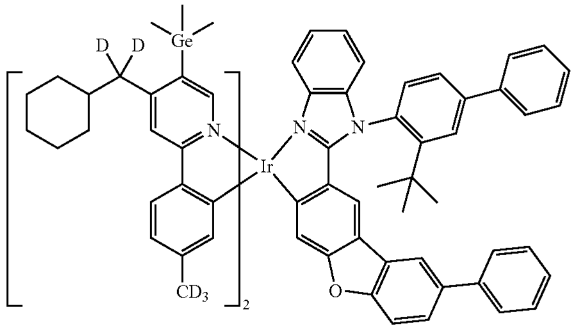
1752
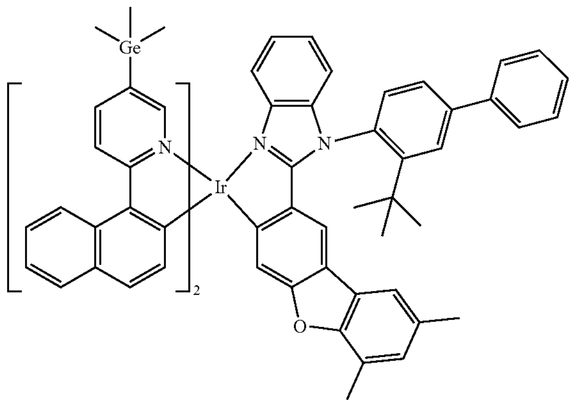
1753
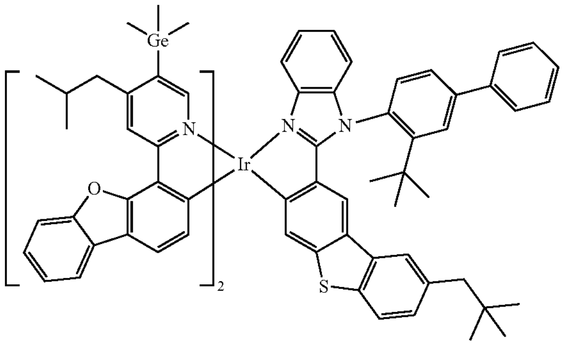
-continued
1754
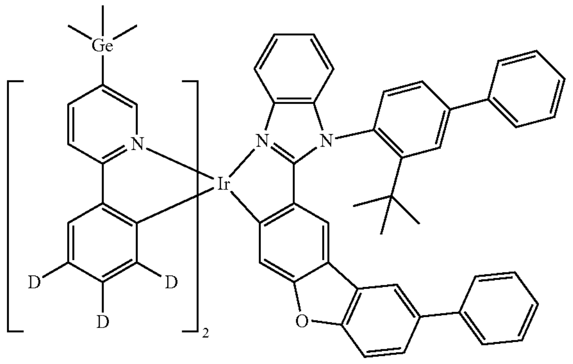
1755
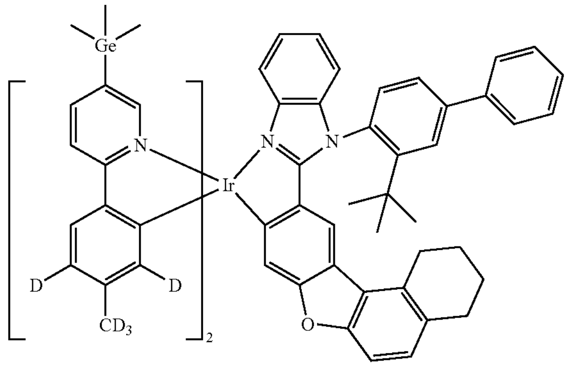
1756
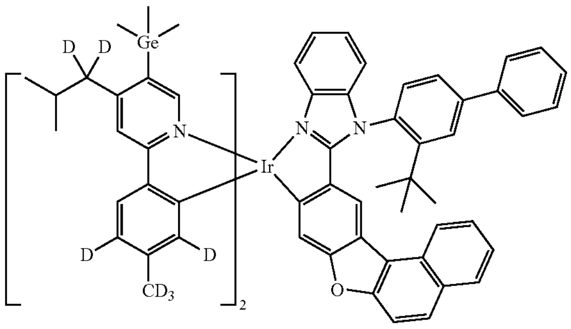
1757
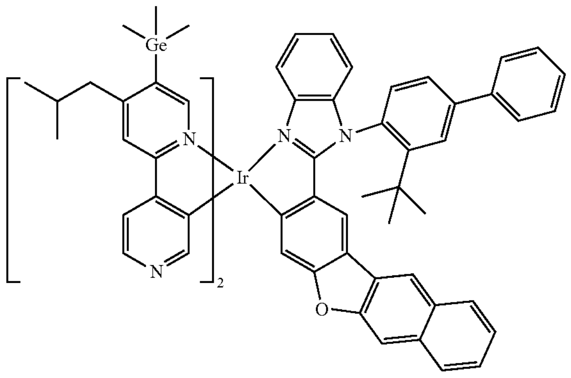

-continued
1758
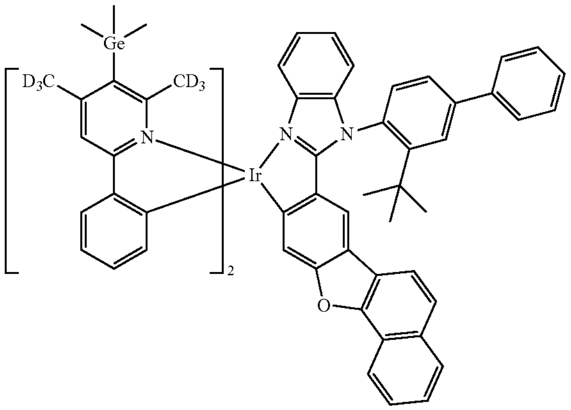
1759
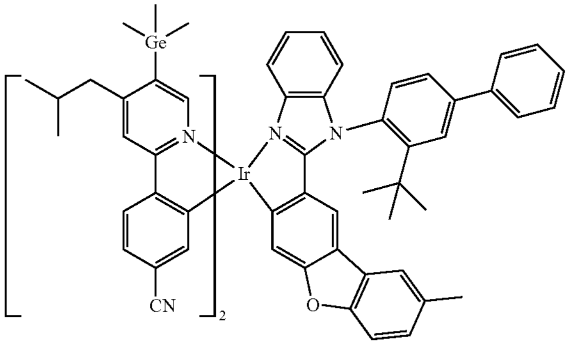
1760
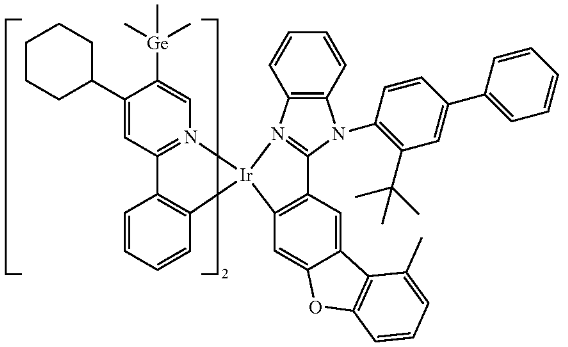
1761
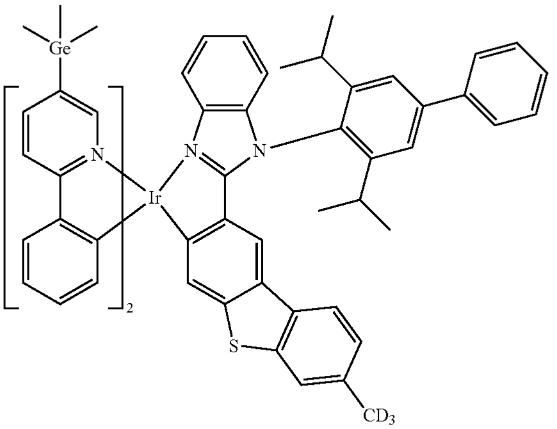
1762
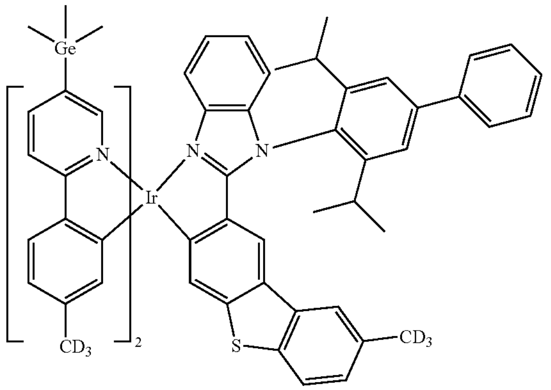
1763
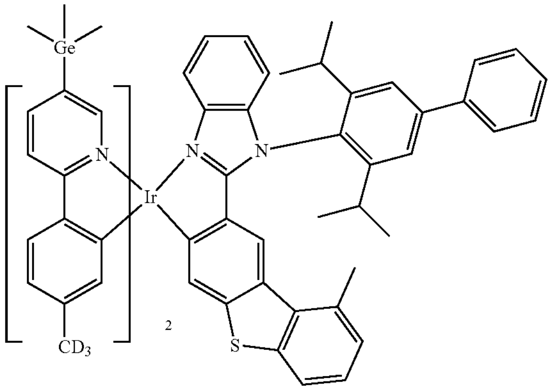
1764
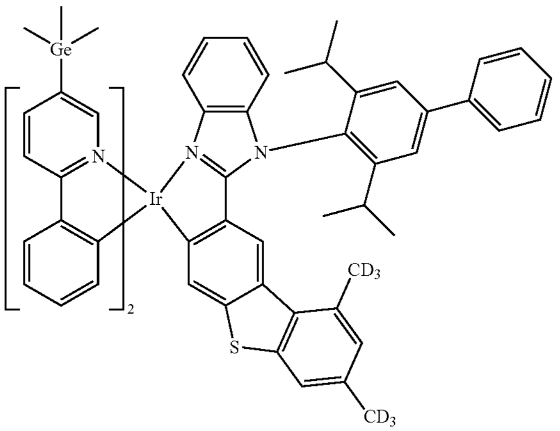

-continued
1765
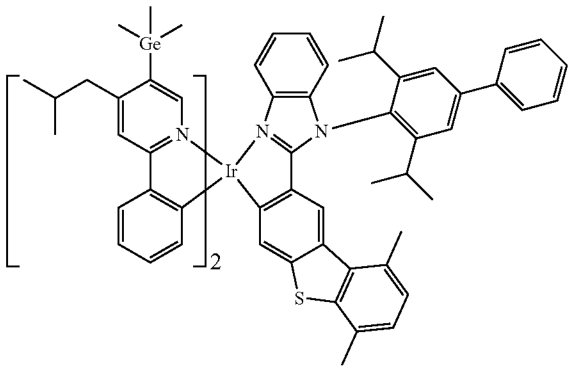
1766
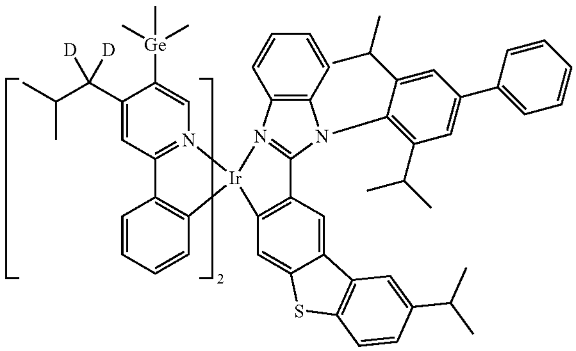
1767
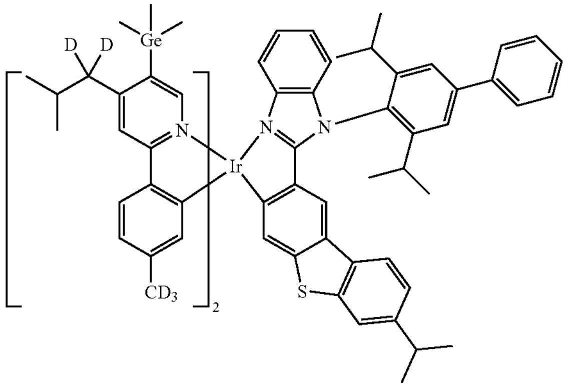
1768
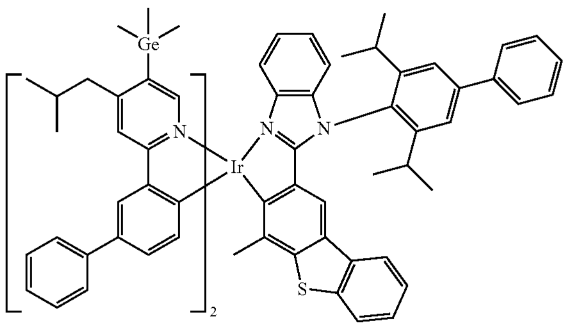
-continued
1769
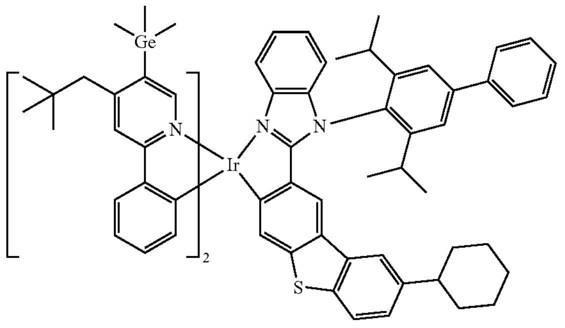
1770
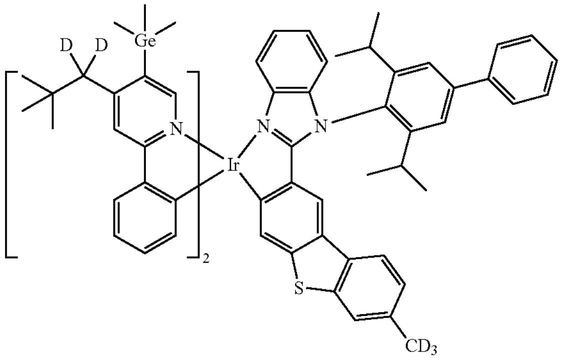
1771
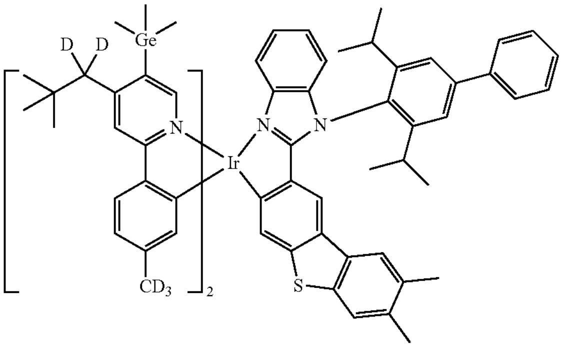
1772
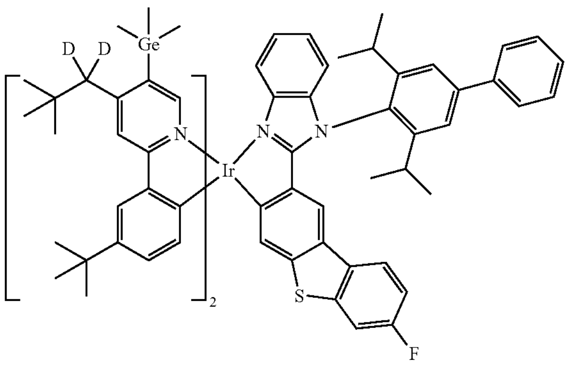

-continued
1773
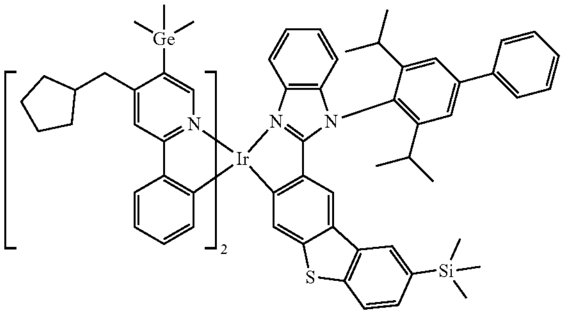
1774
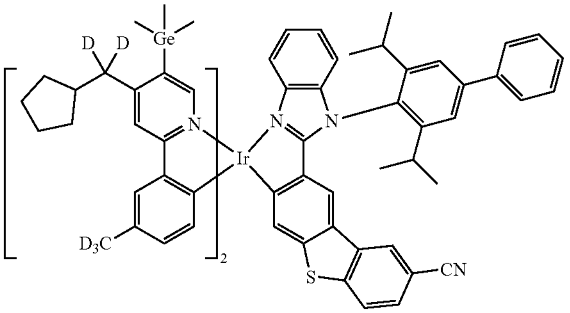
1775
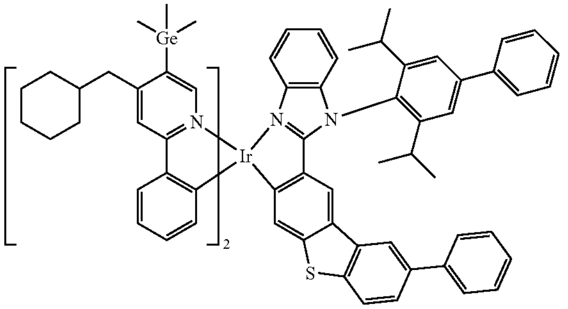
1776
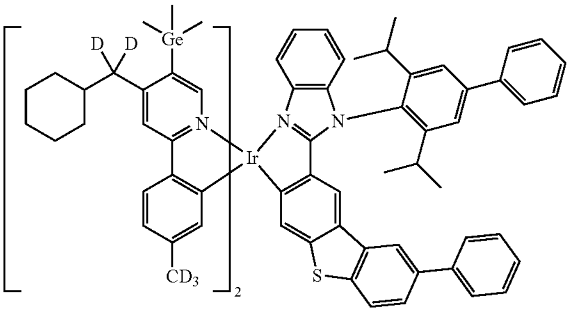
-continued
1777
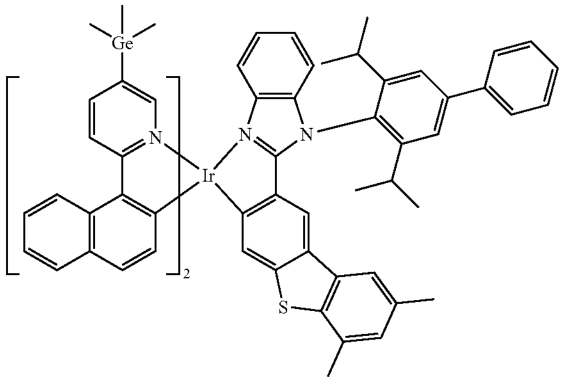
1778
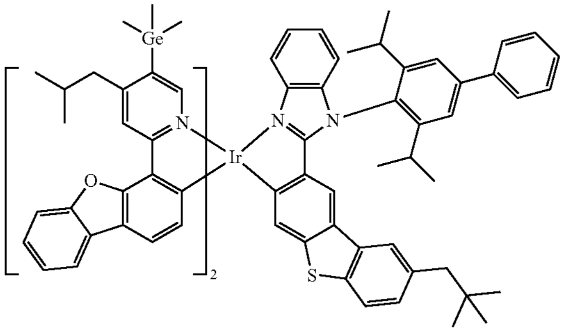
1779
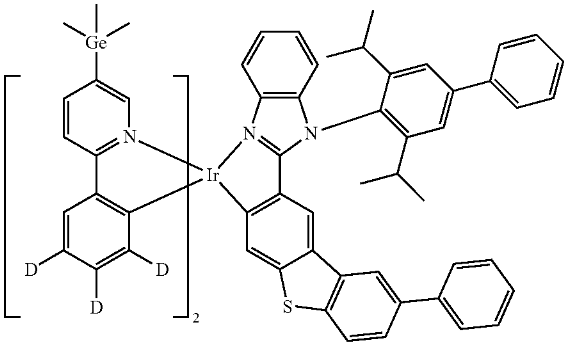
1780
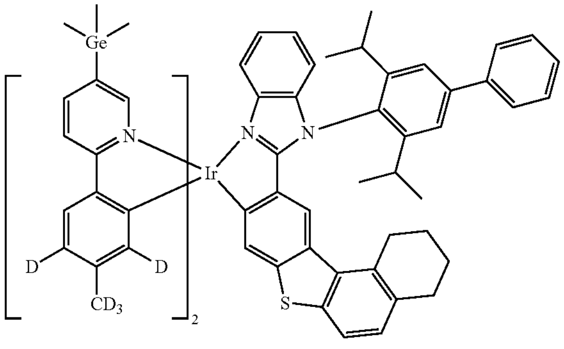

-continued
1781
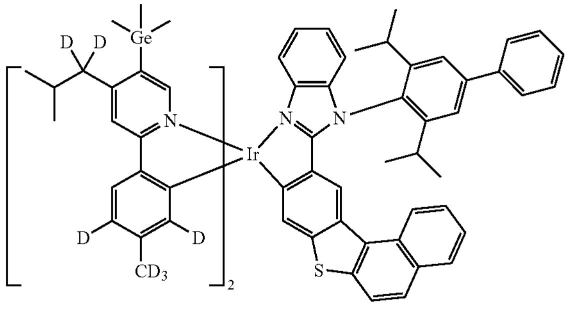
1782
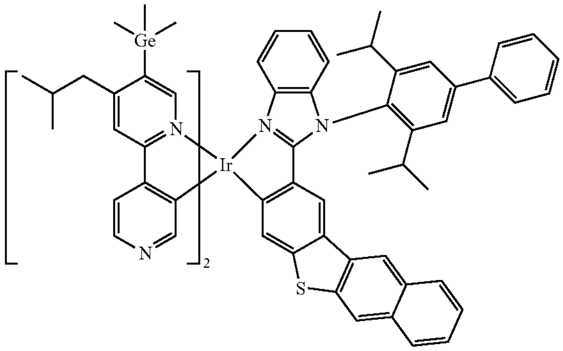
1783
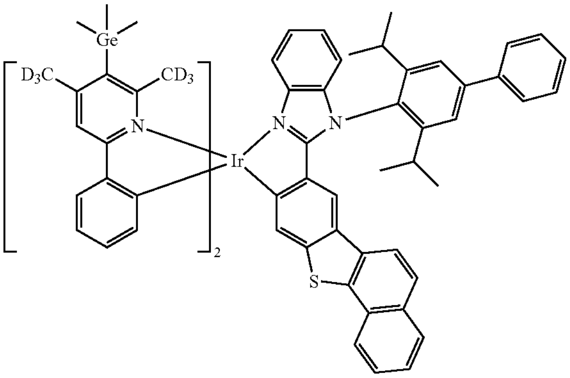
1784
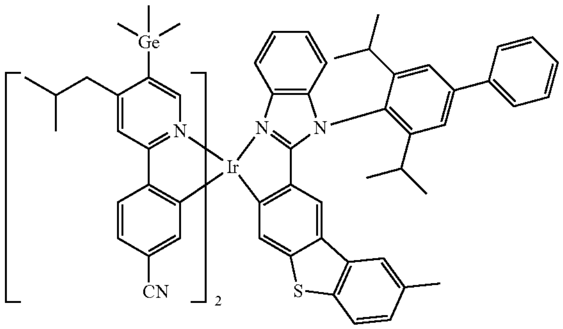
-continued
1785
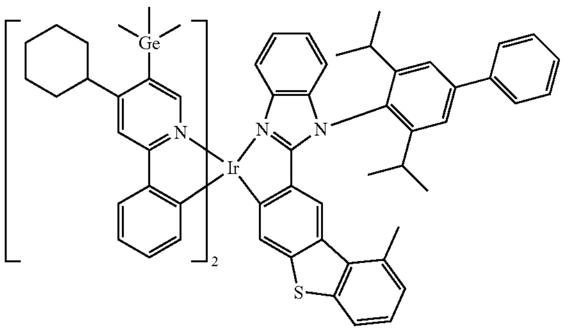
1786
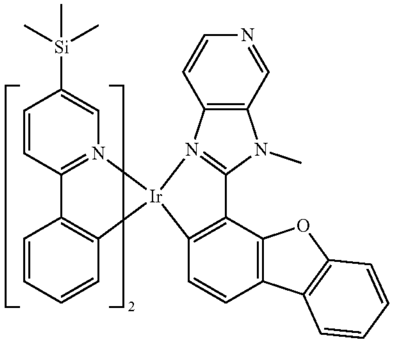
1787
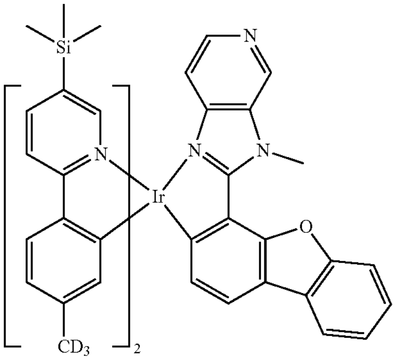
1788
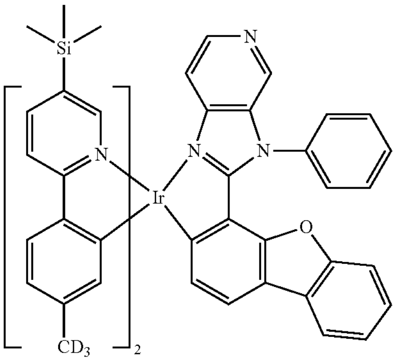

-continued
1789
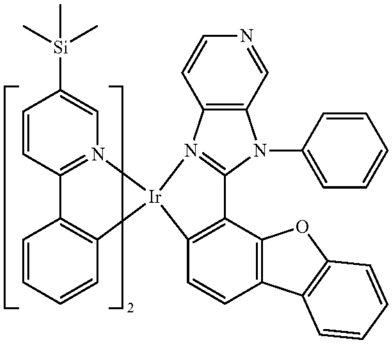
1790
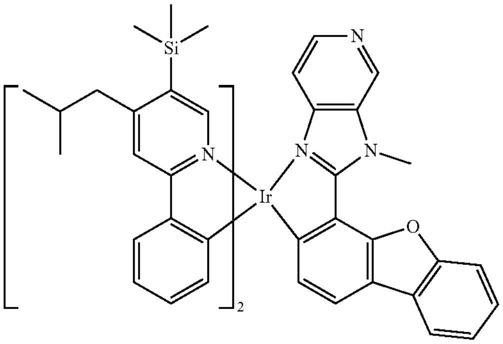
1791
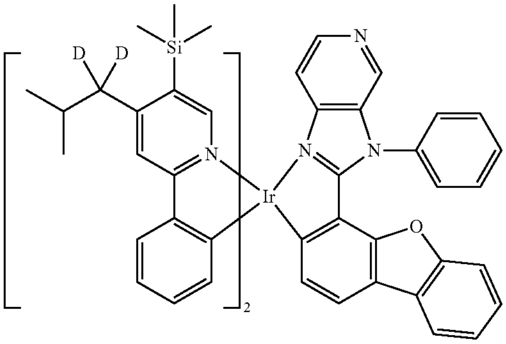
1792
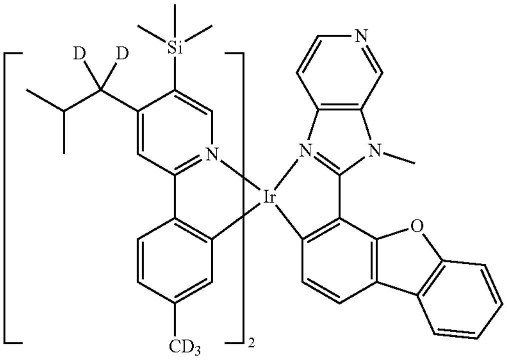
-continued
1793
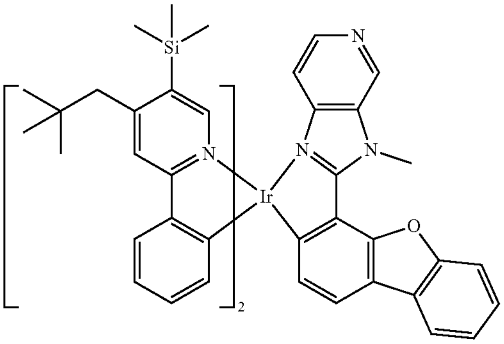
1794
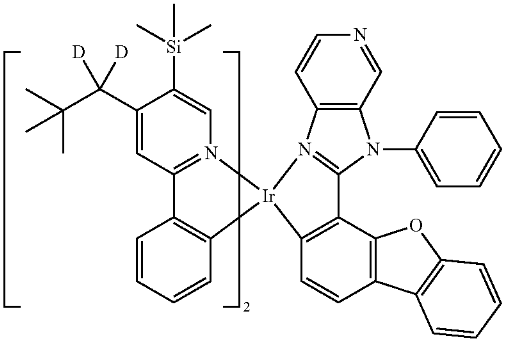
1795
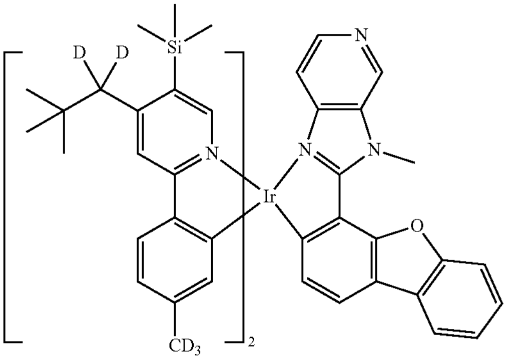
1796
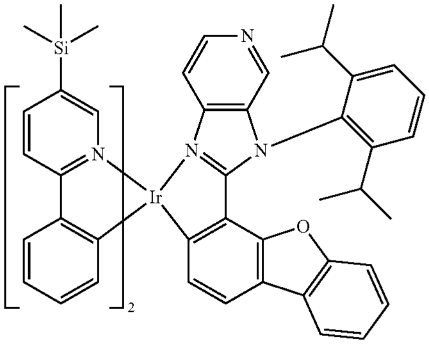

-continued
1797
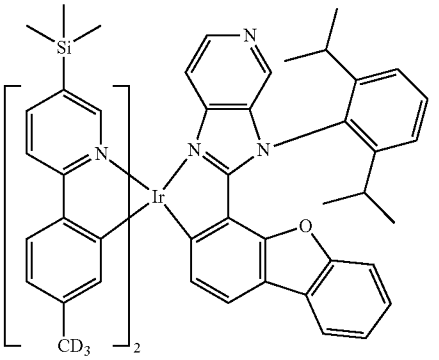
1798
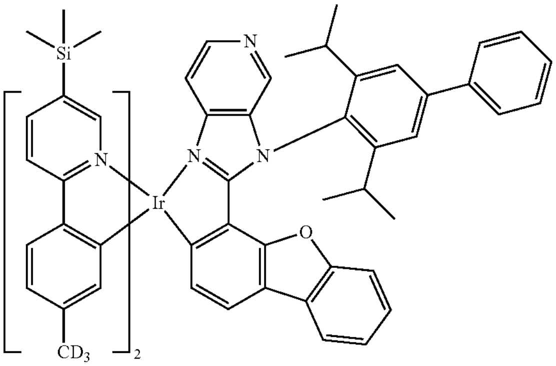
1799
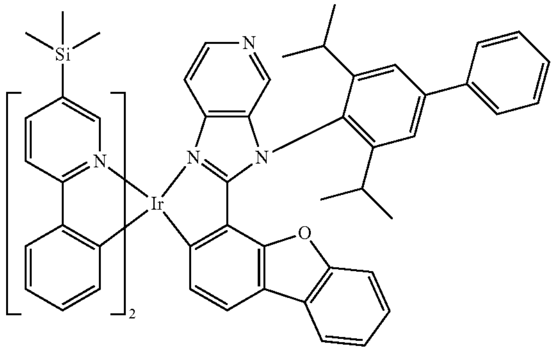
1800
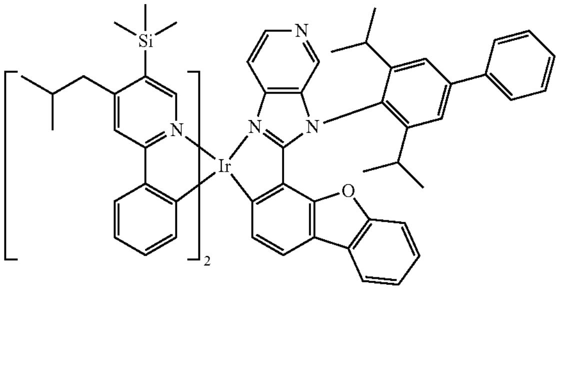
-continued
1801
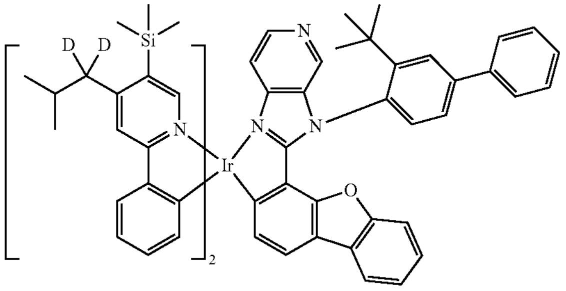
1802
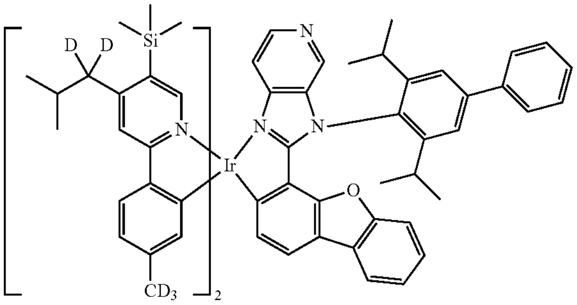
1803
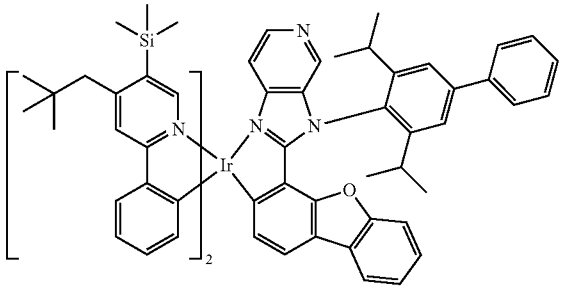
1804
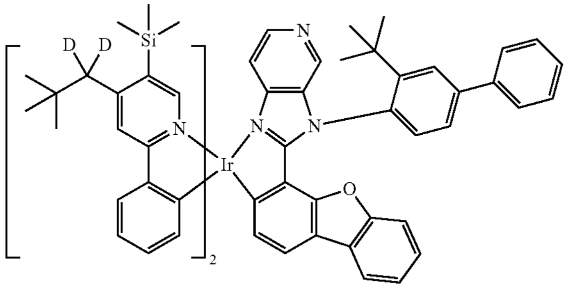
1805
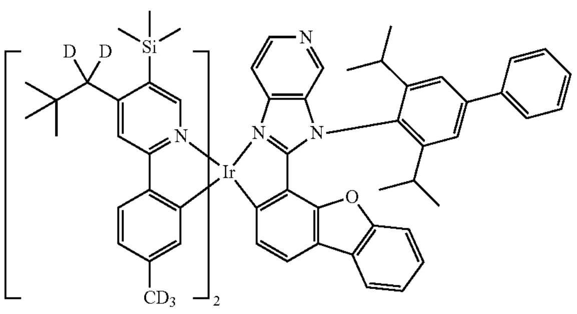

-continued
1806
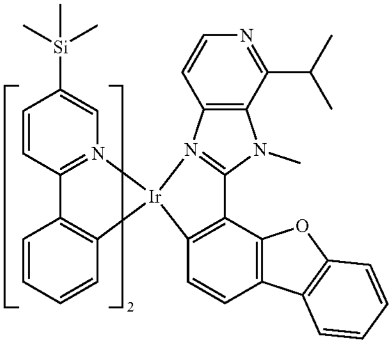
1807
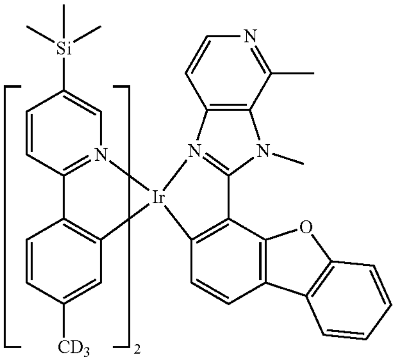
1808
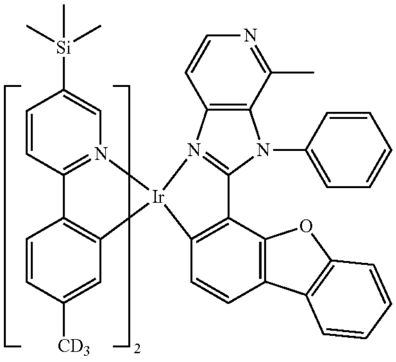
1809
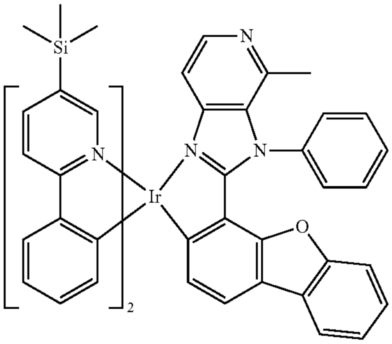
-continued
1810
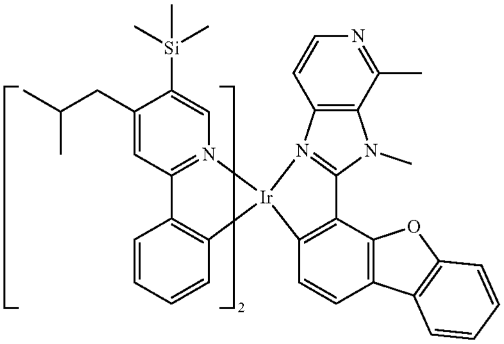
1811
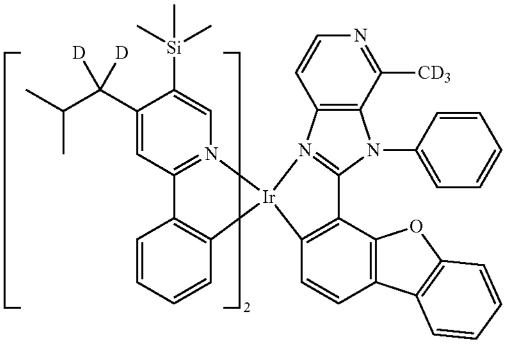
1812
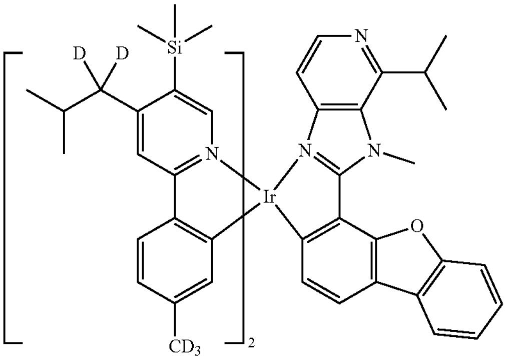
1813
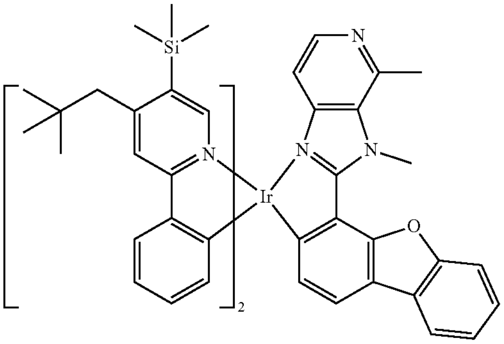

-continued
1814
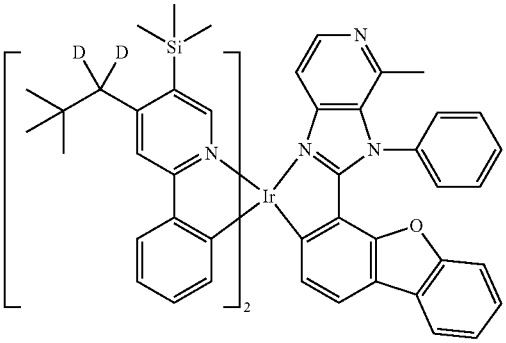
1815
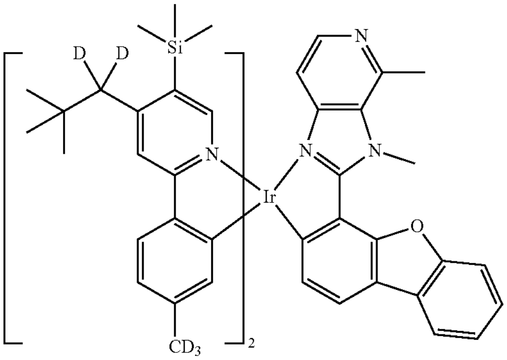
1816
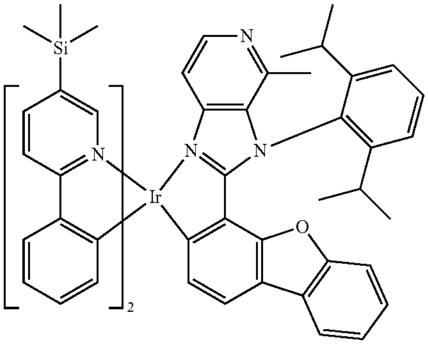
1817
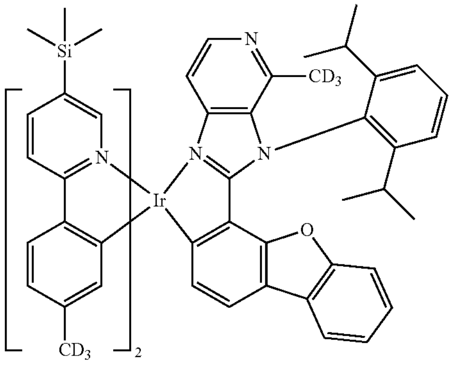
-continued
1818
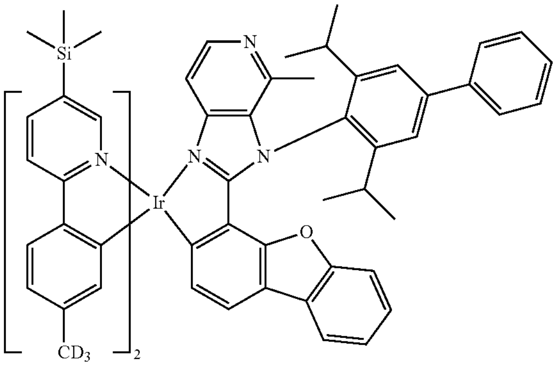
1819
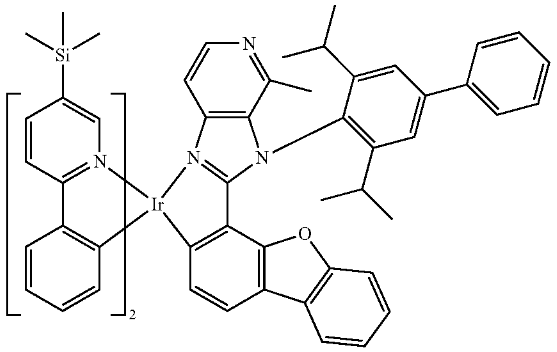
1820
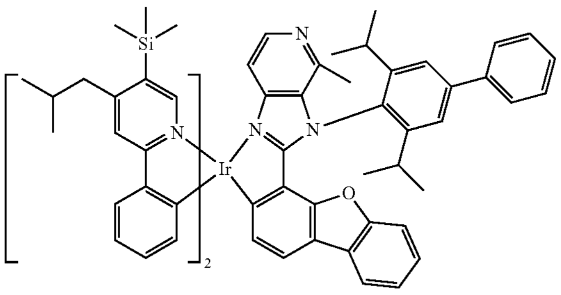
1821
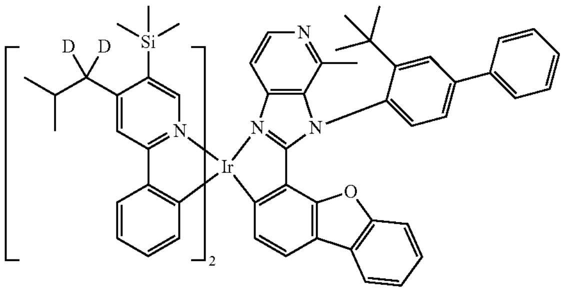

-continued
1822
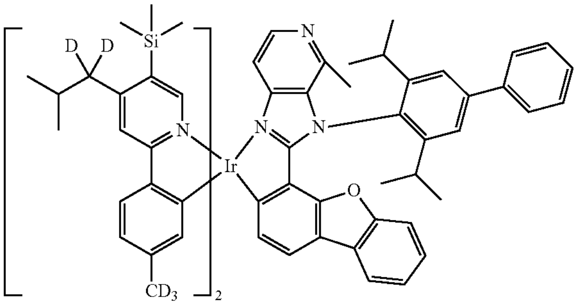
1823
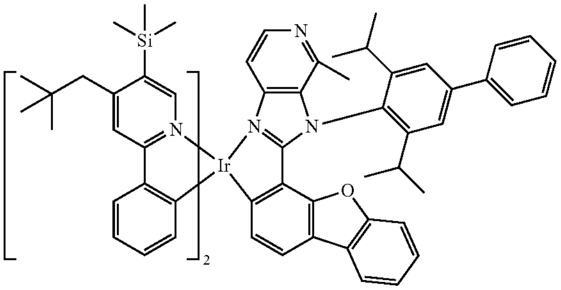
1824
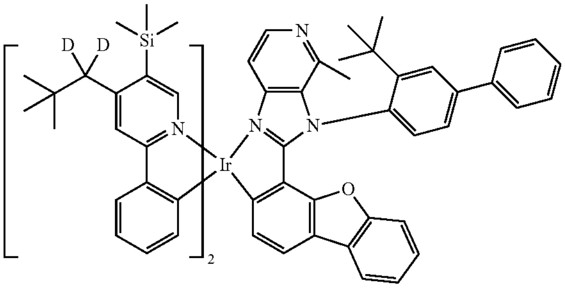
1825
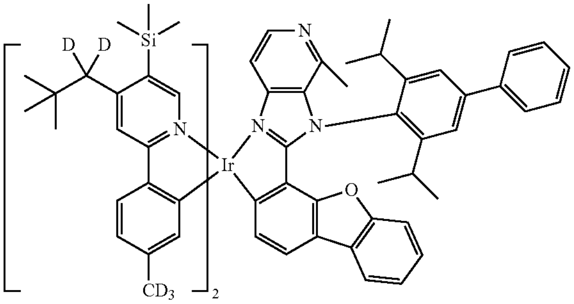
1826
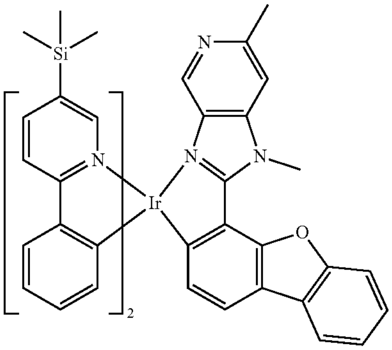
-continued
1827
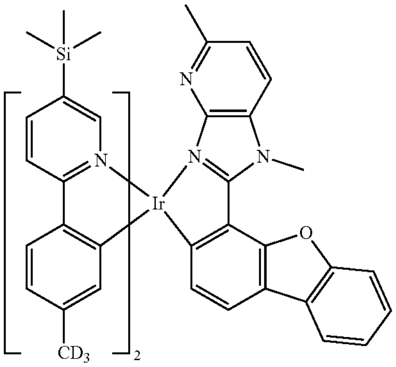
1828
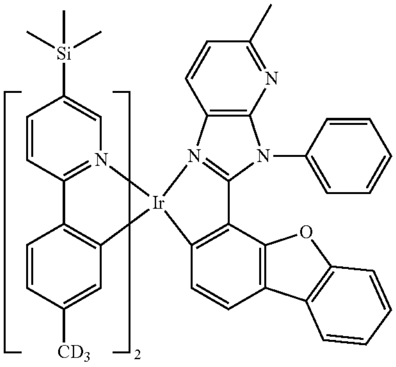
1829
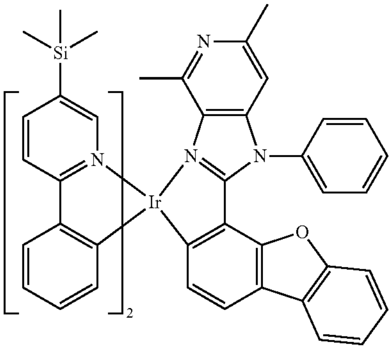
1830
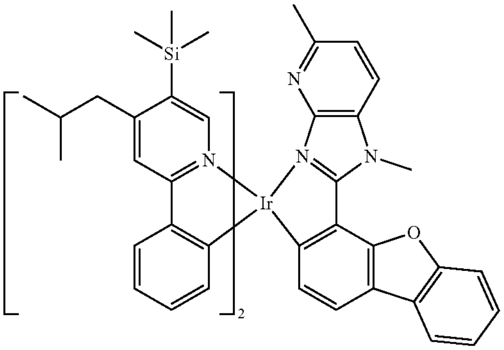

-continued
1831
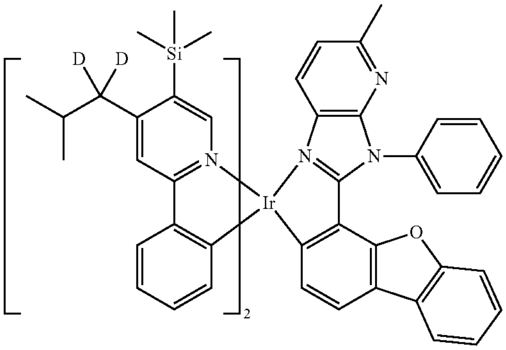
1832
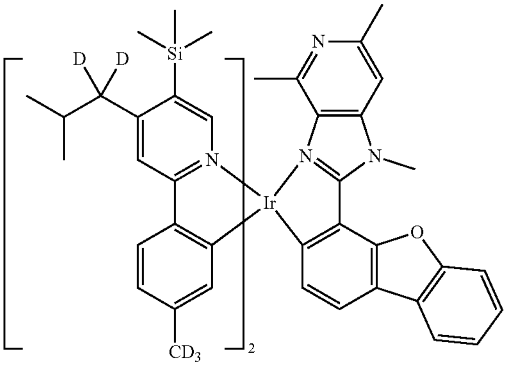
1833
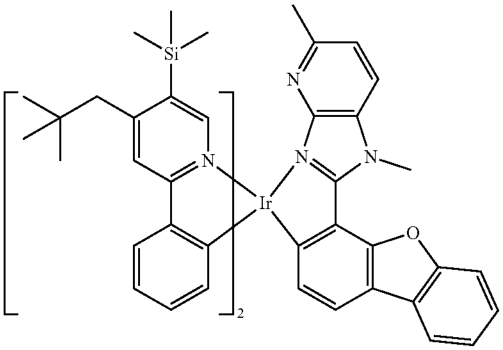
1834
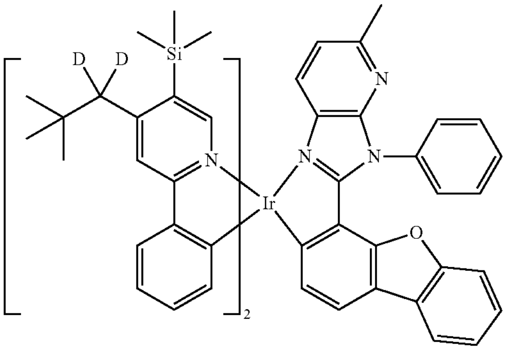
-continued
1835
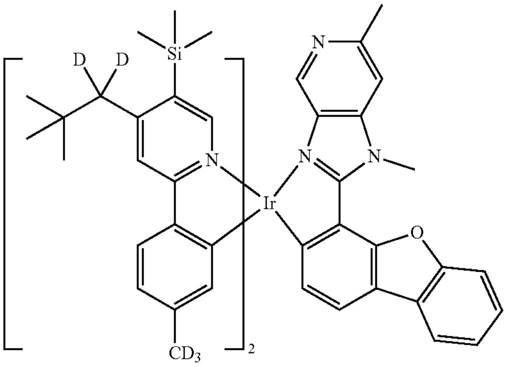
1836
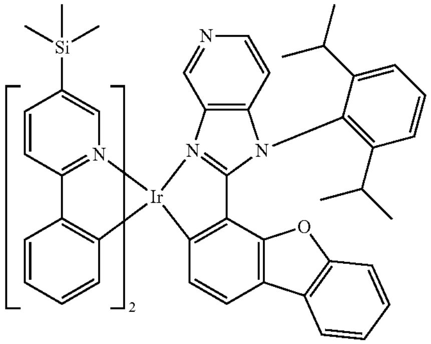
1837
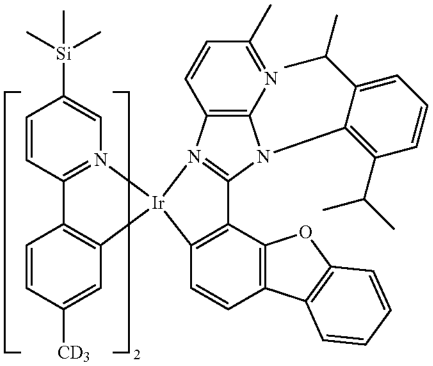
1838
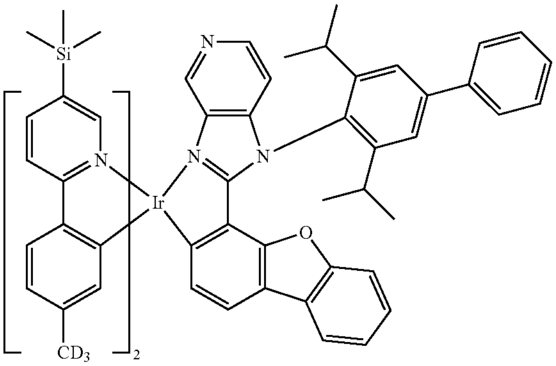

-continued
1839
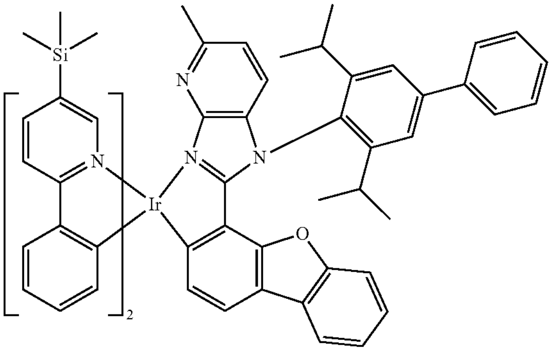
1840
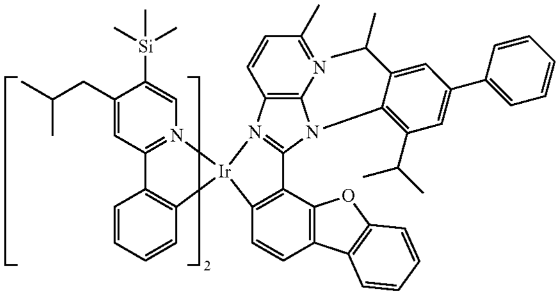
1841
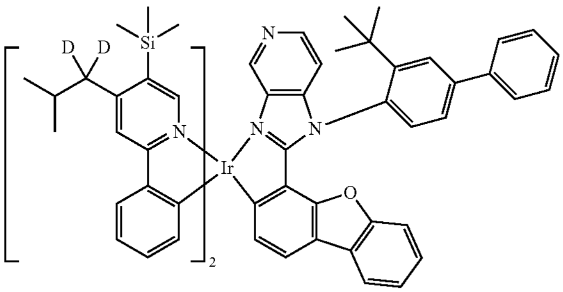
1842
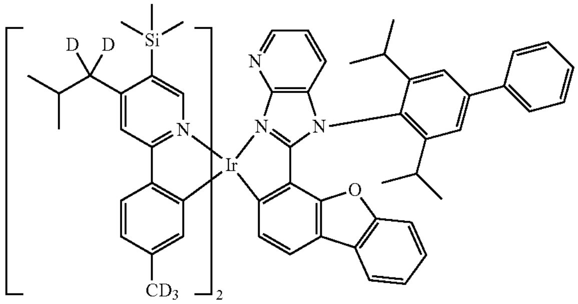
-continued
1843
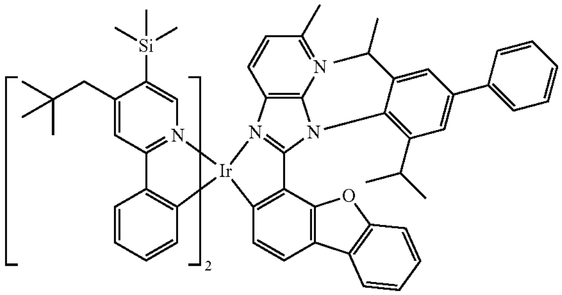
1844
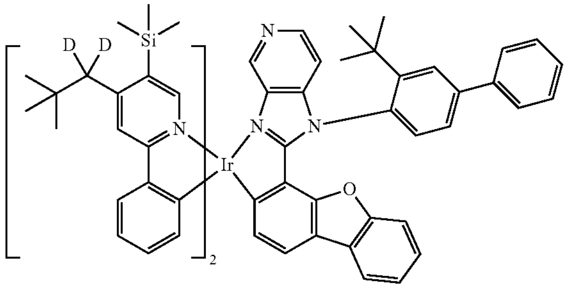
1845
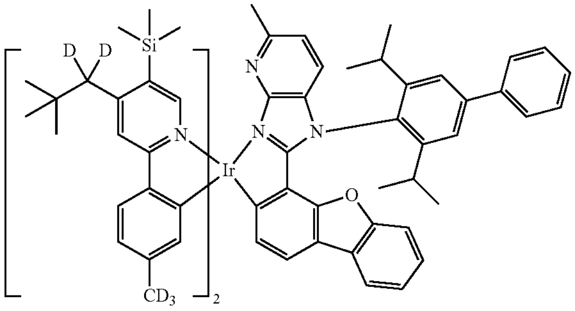
1846
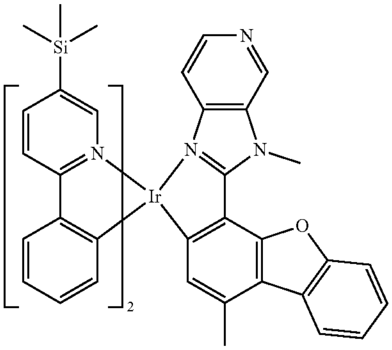

-continued
1847
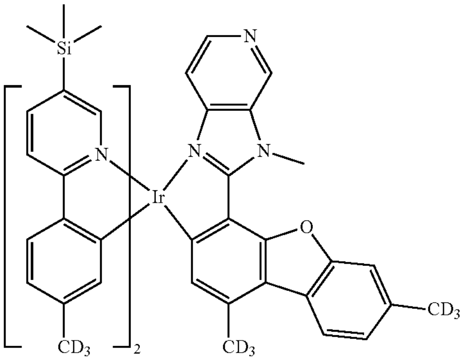
1848
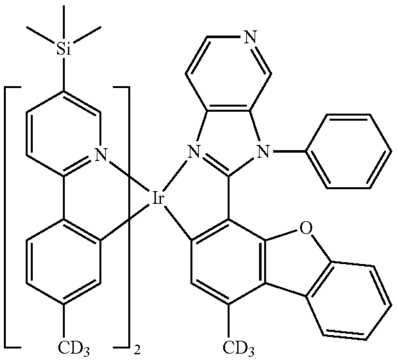
1849
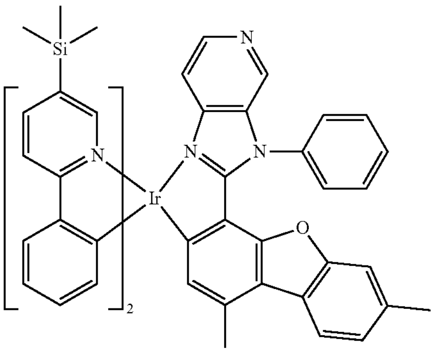
1850
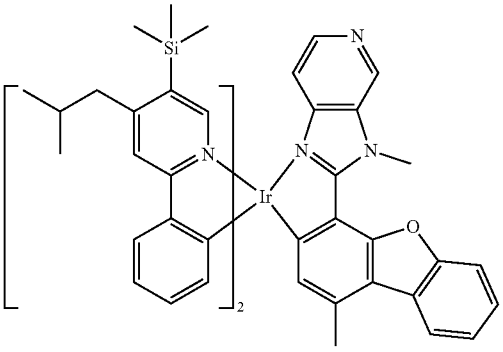
-continued
1851
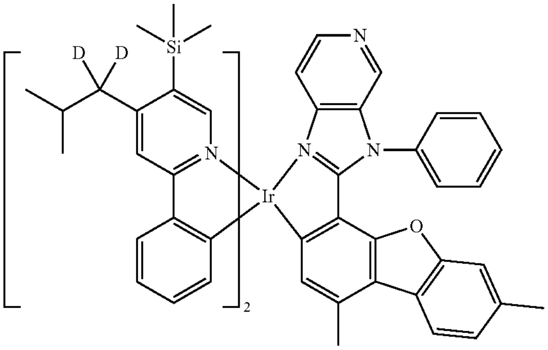
1852
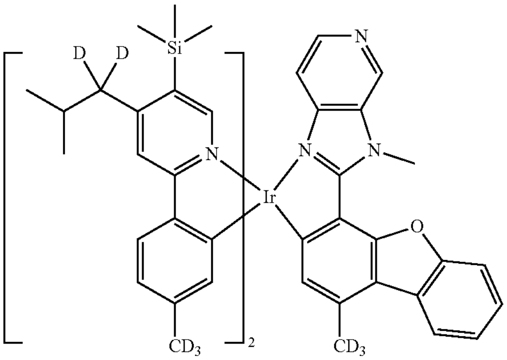
1853
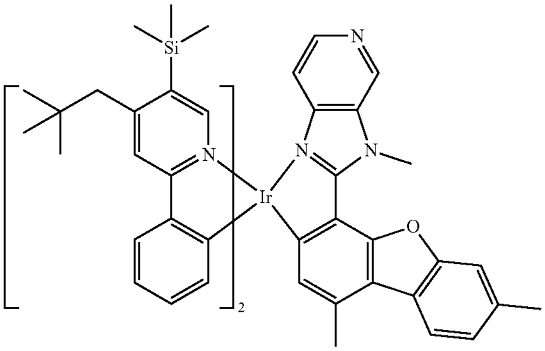
1854
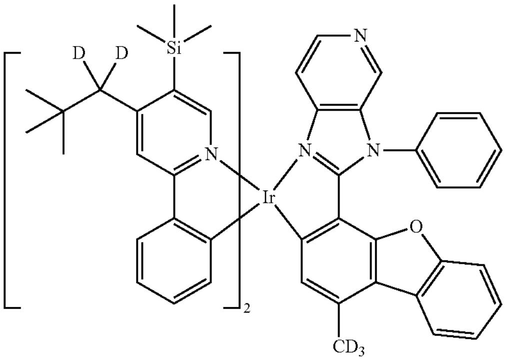

-continued
1855
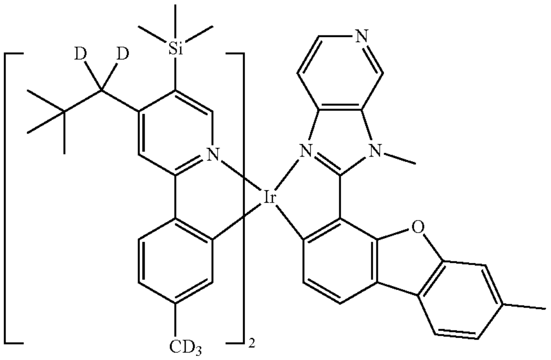
1856
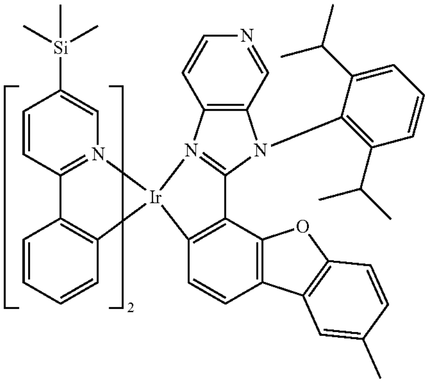
1857
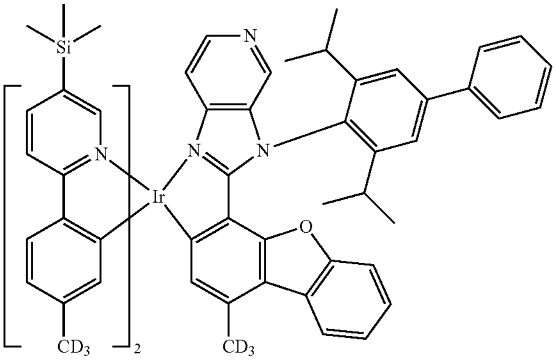
1858
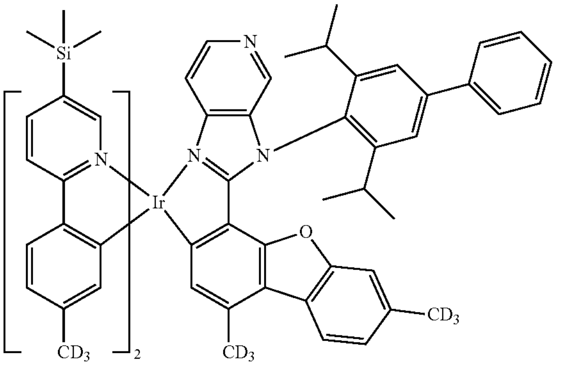
-continued
1859
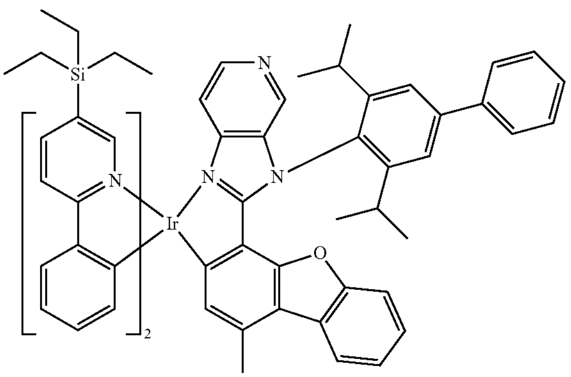
1860
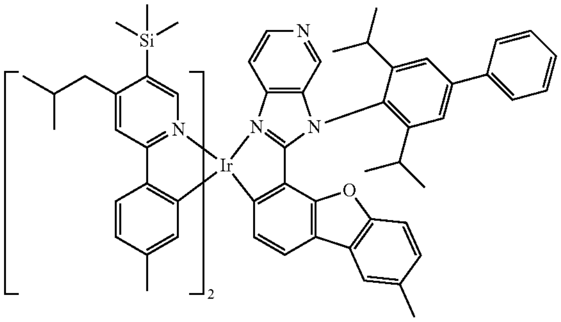
1861
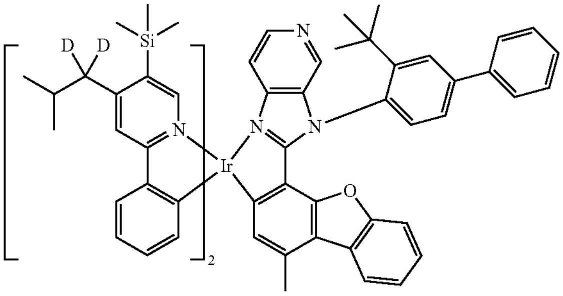
1862
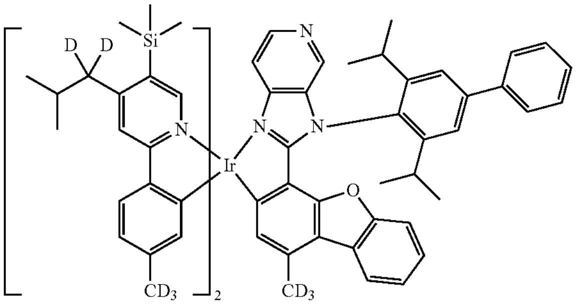

-continued
1863
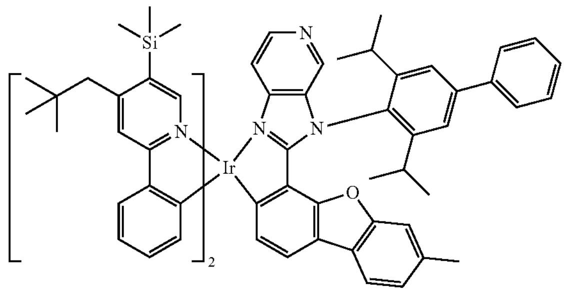
1864
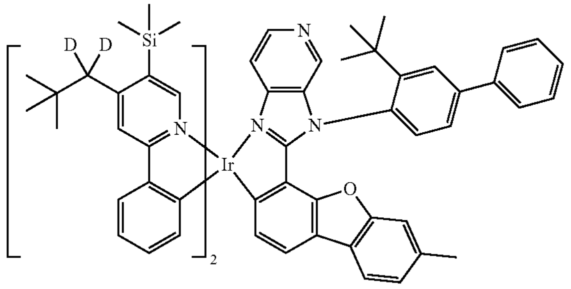
1865
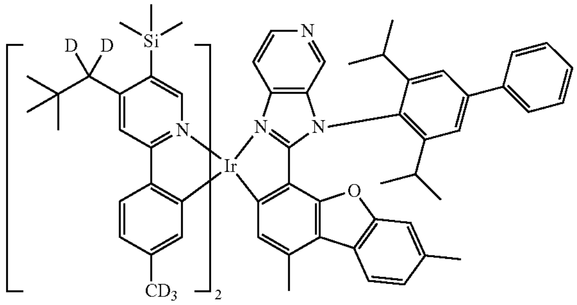
1866
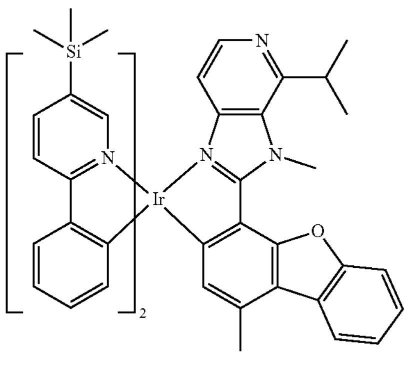
-continued
1867
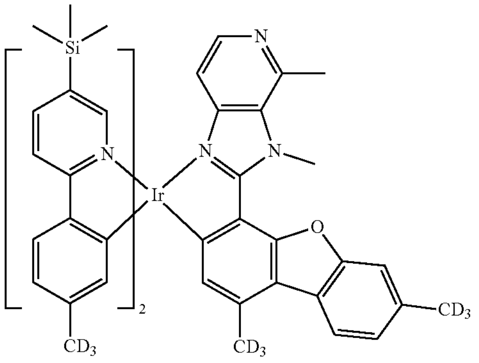
1868
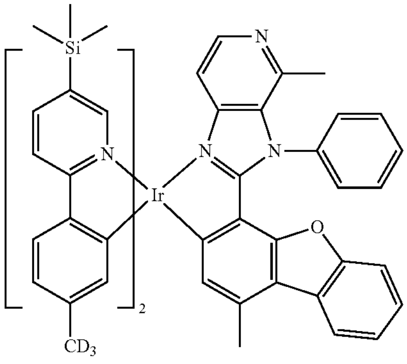
1869
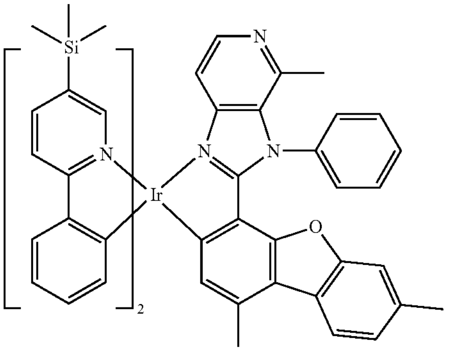
1870
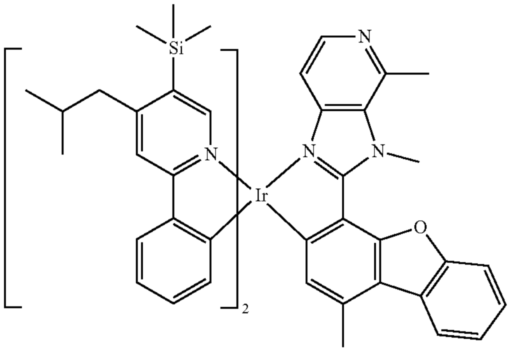

1871
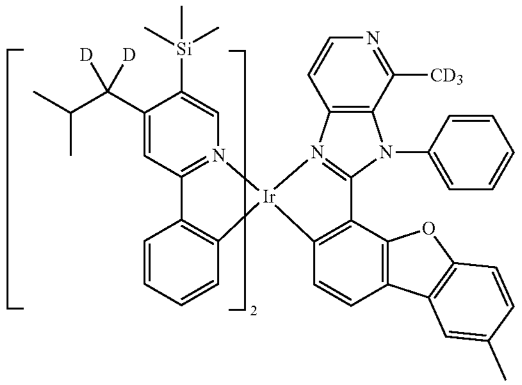
1872
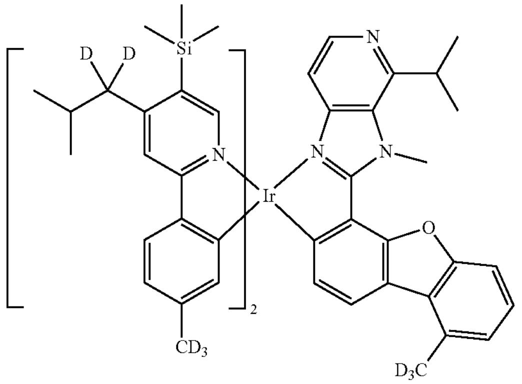
1873
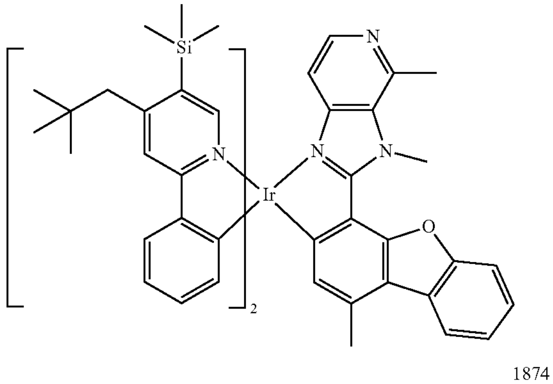
1874
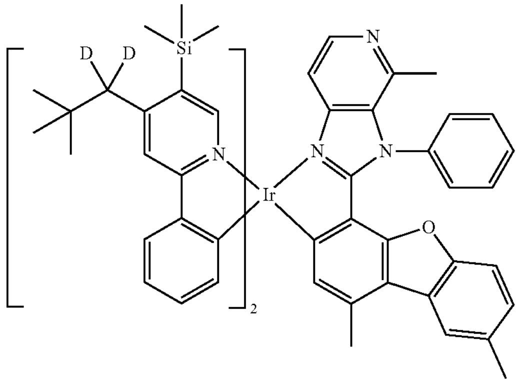
1875
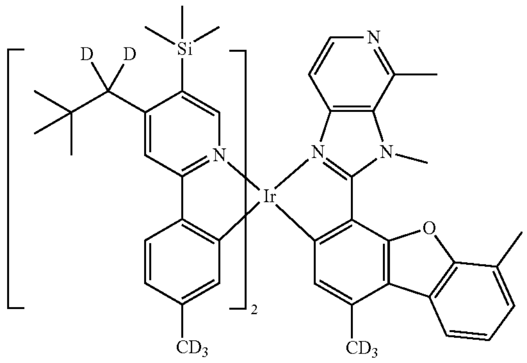
1876
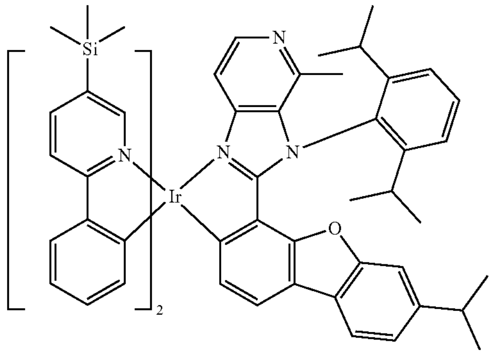
1877
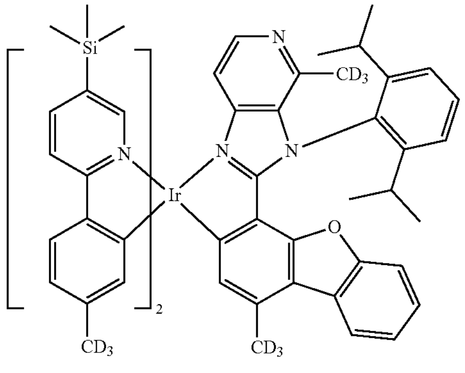
1878
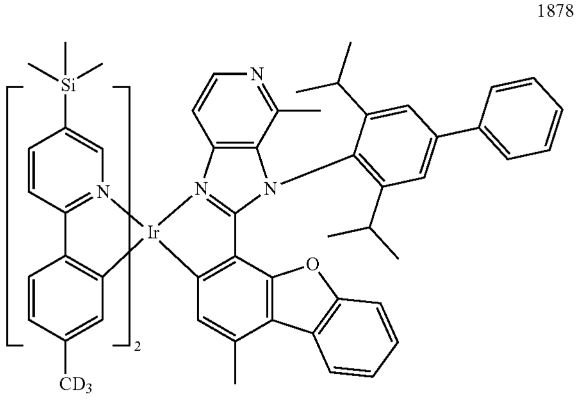

-continued
1879
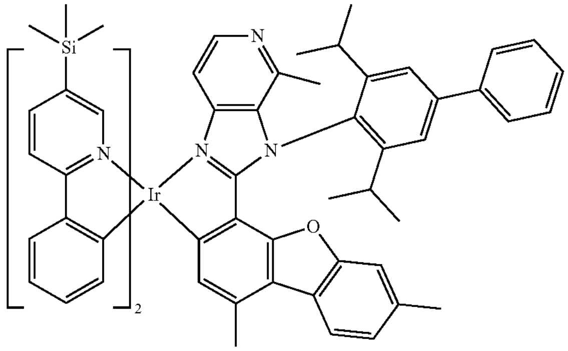
1880
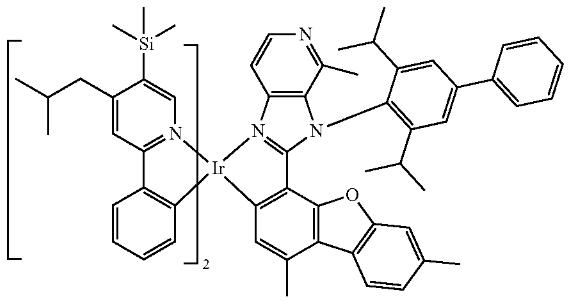
1881
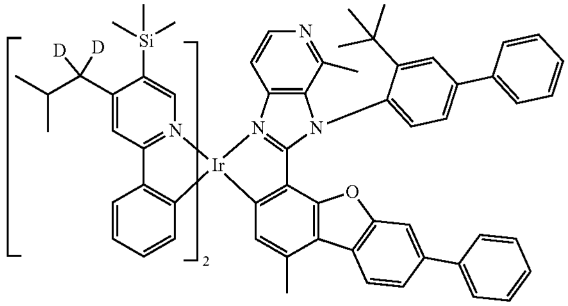
1882
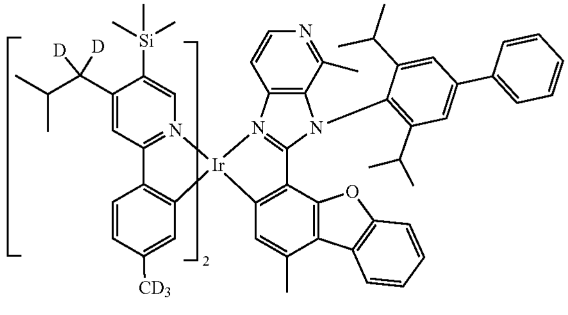
-continued
1883
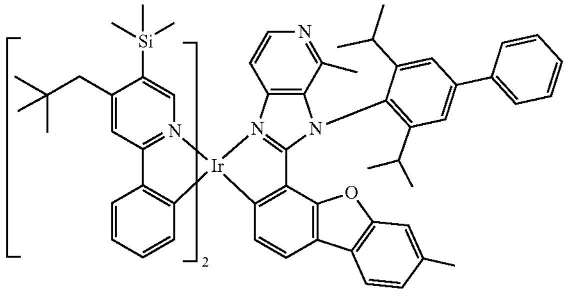
1884
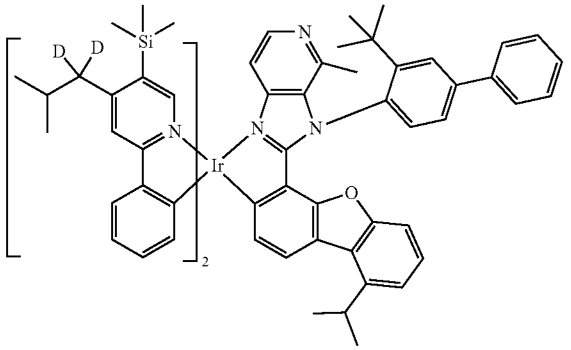
1885
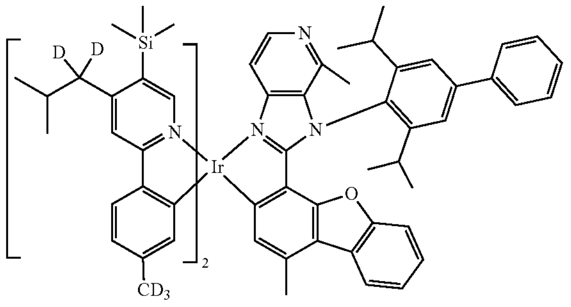
1886
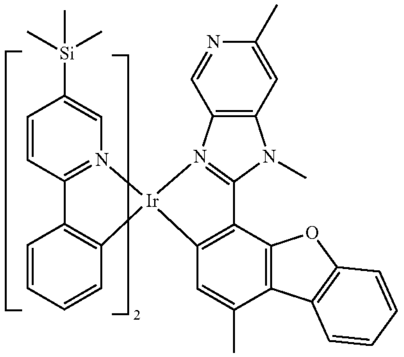

-continued
1887
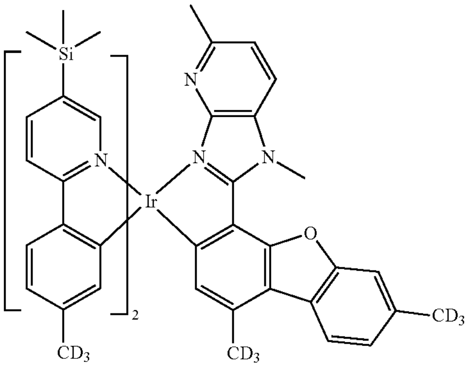
1888
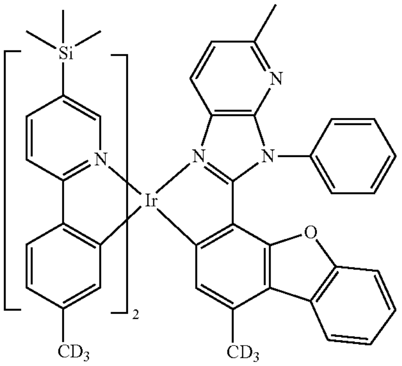
1889
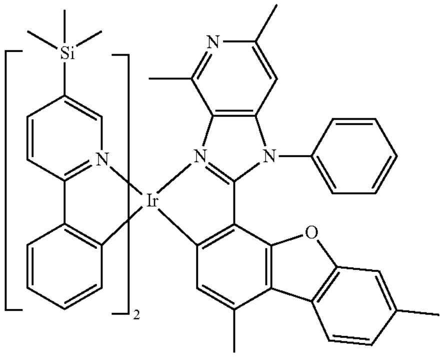
1890
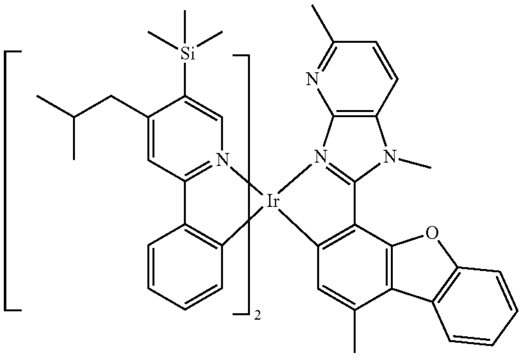
-continued
1891
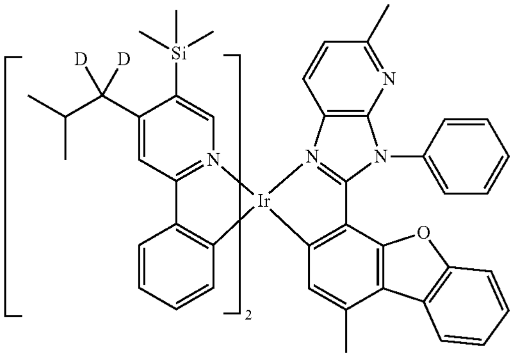
1892
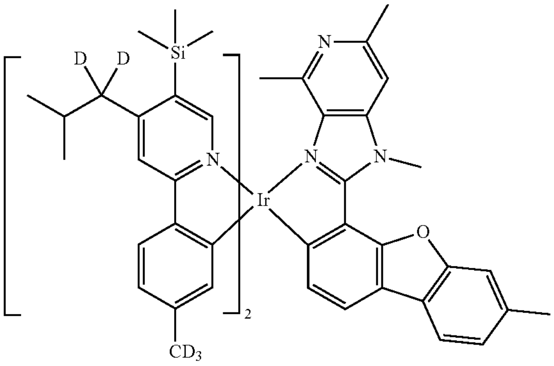
1893
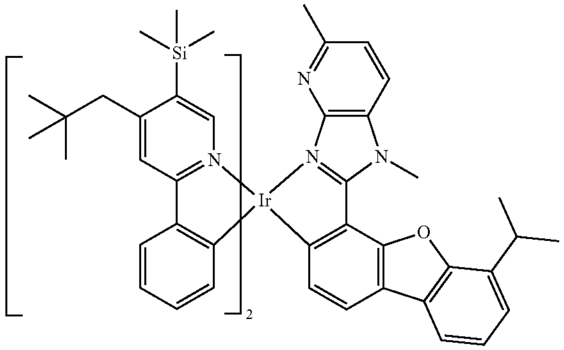
1894
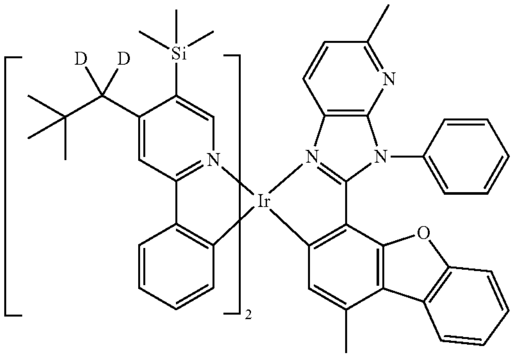

1895
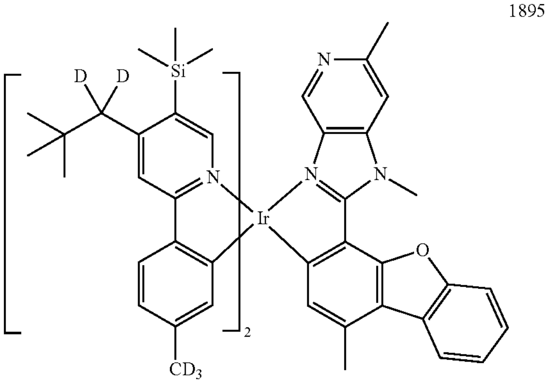
1896
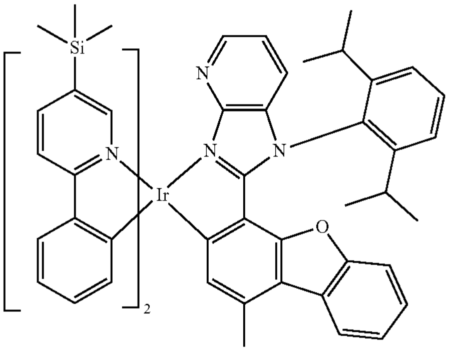
1897
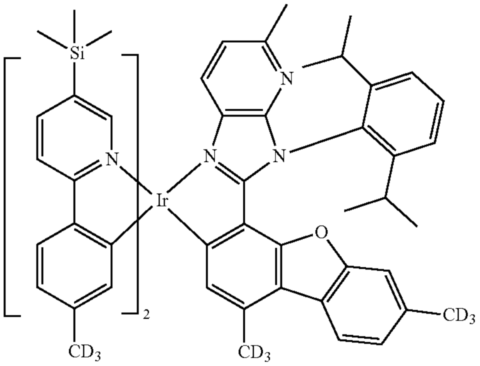
1898
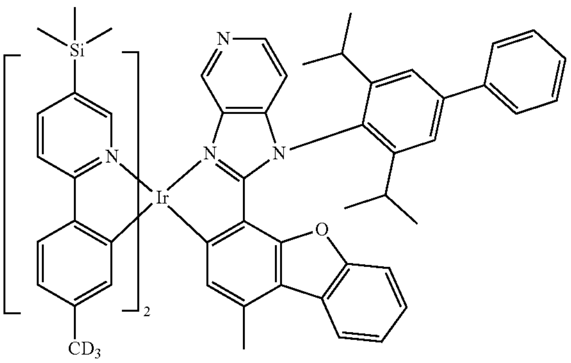
1899
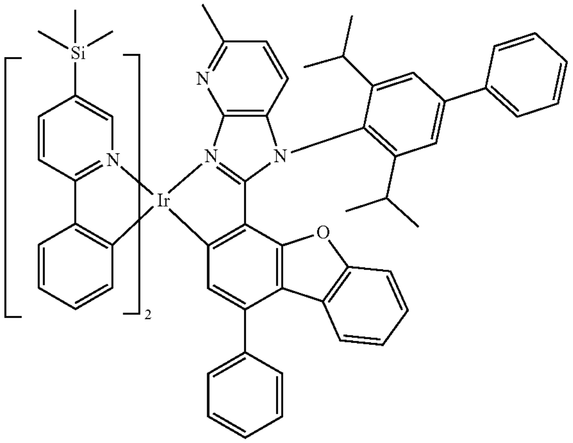
1900
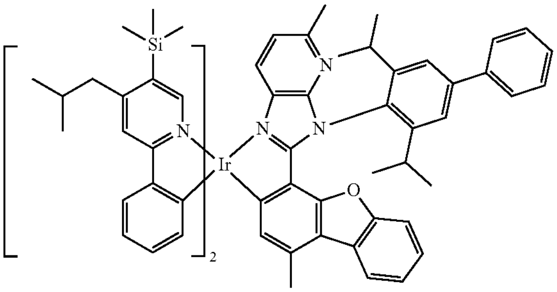
1901
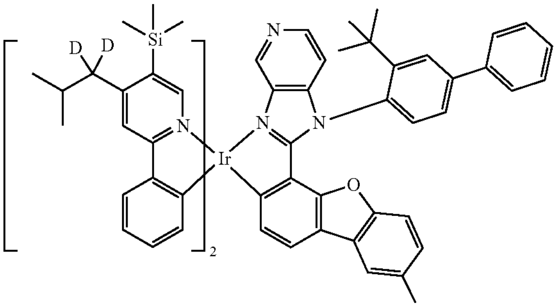
1902
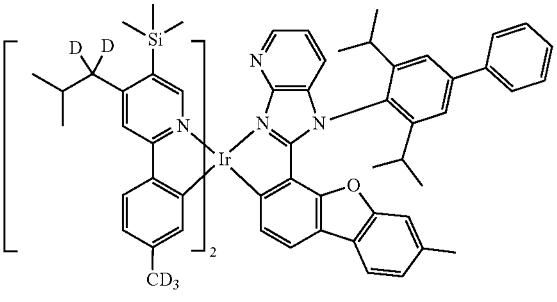

-continued
1903
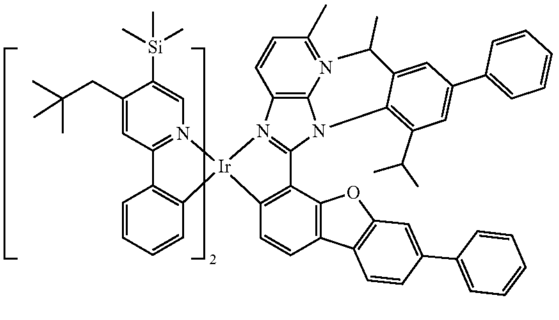
1904
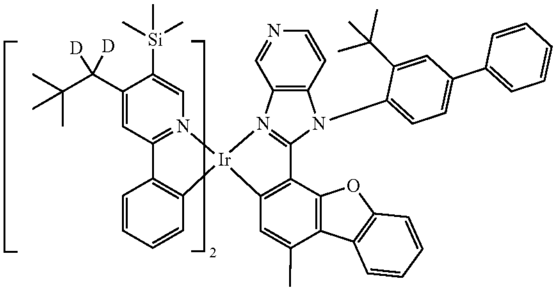
1905
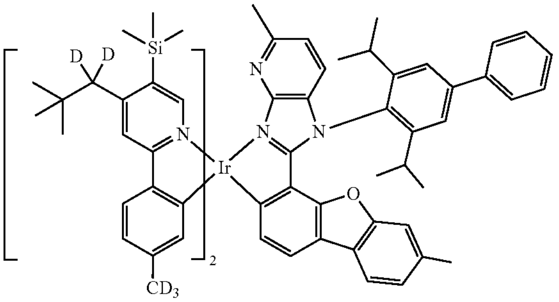
1906
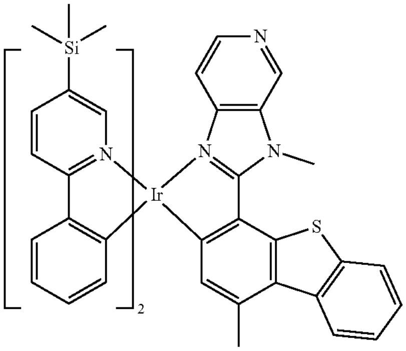
-continued
1907
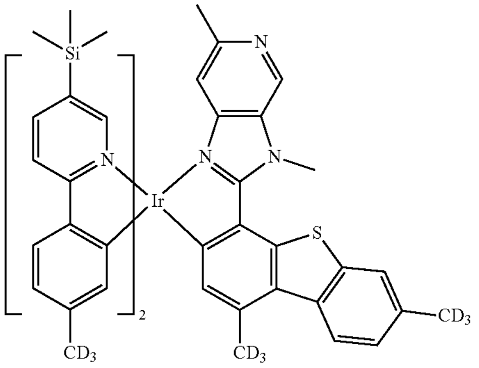
1908
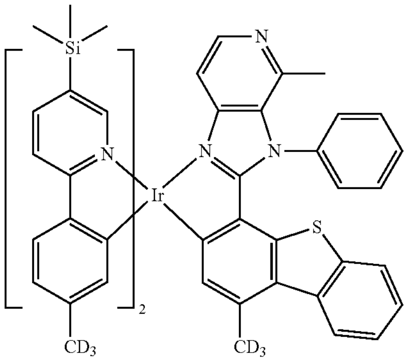
1909
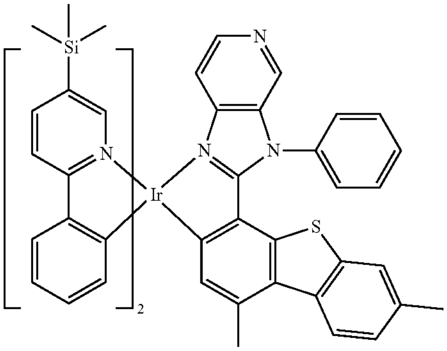
1910
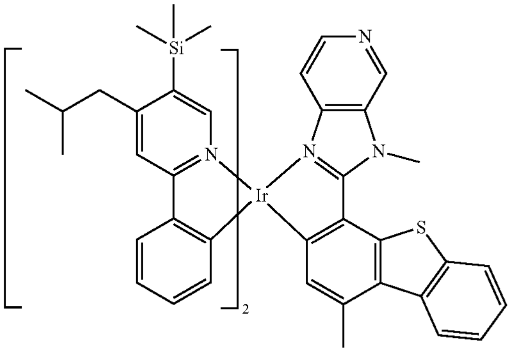

-continued
1911
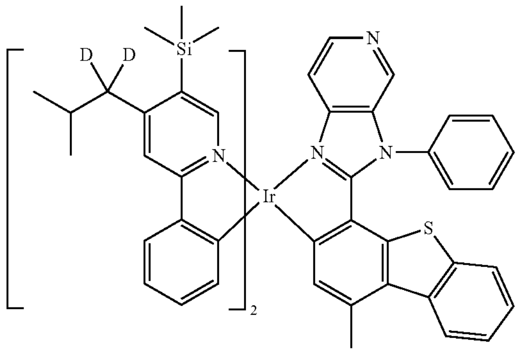
1912
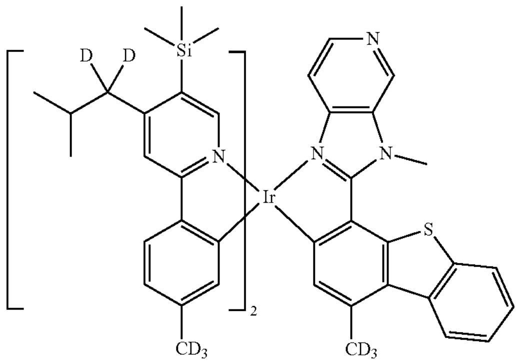
1913
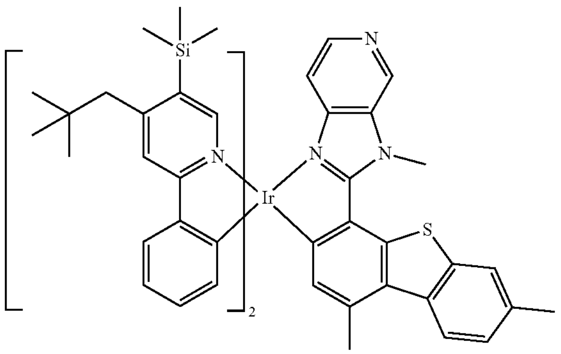
1914
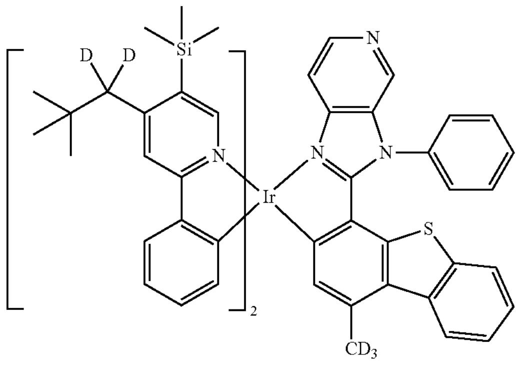
-continued
1915
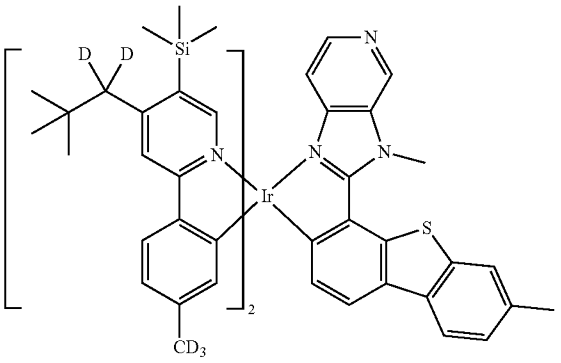
1916
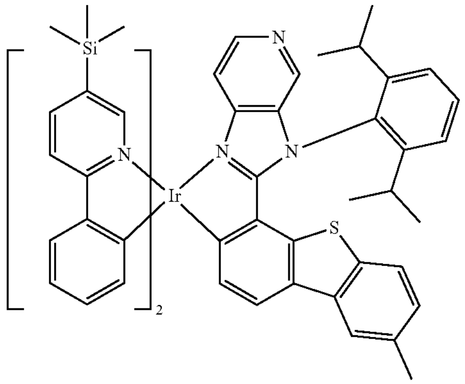
1917
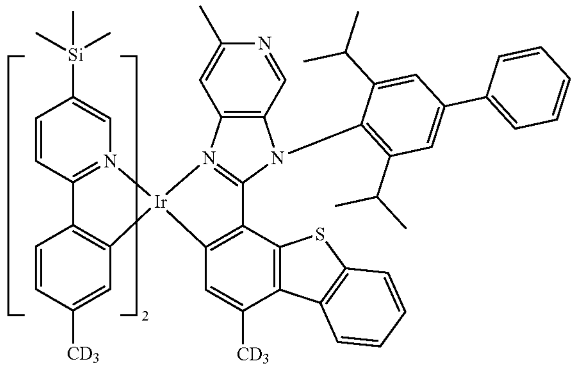
1918
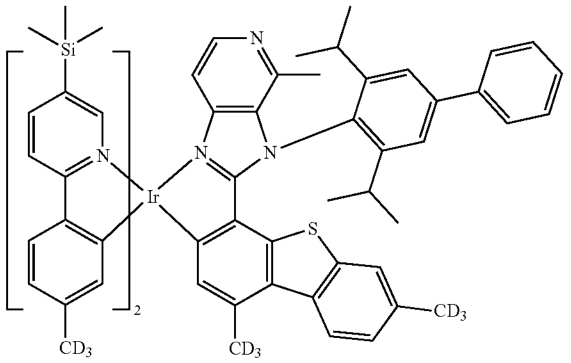

1919
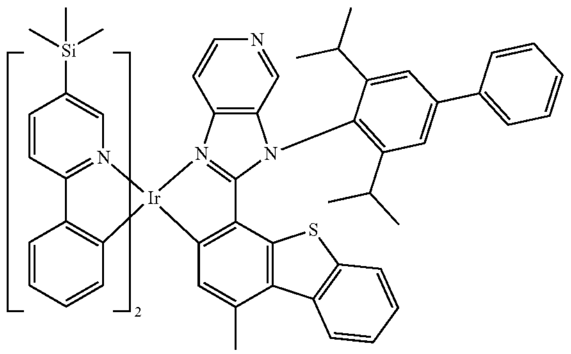
1920
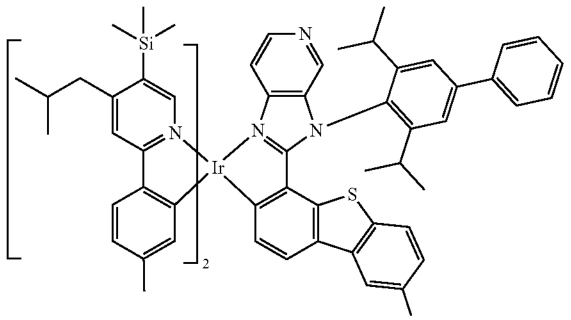
1921
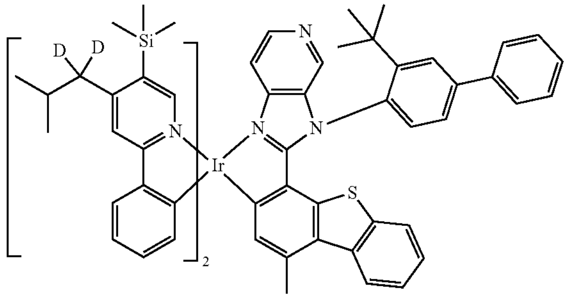
1922
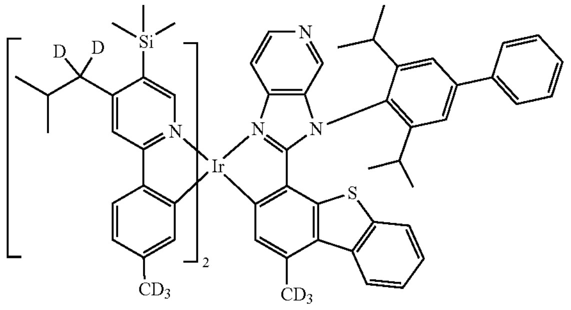
1923
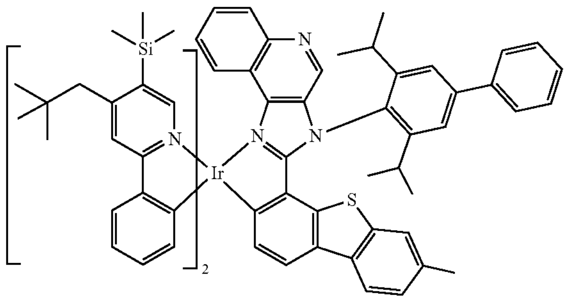
1924
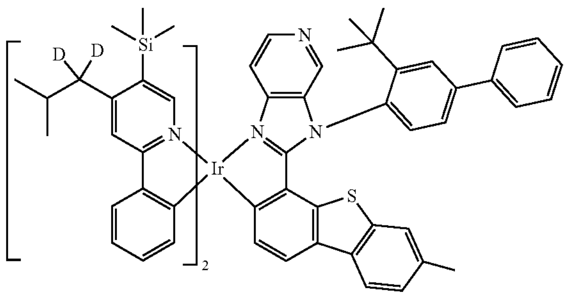
1925
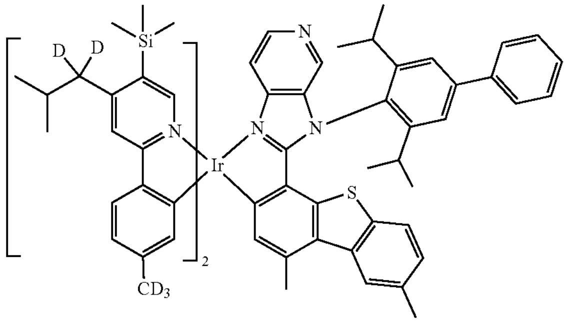
1926
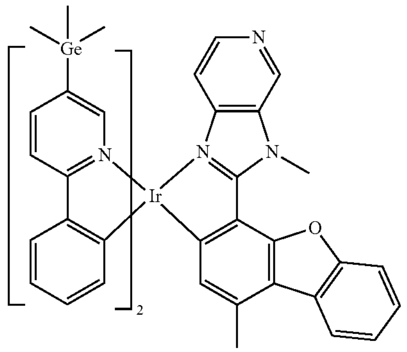

-continued
1927
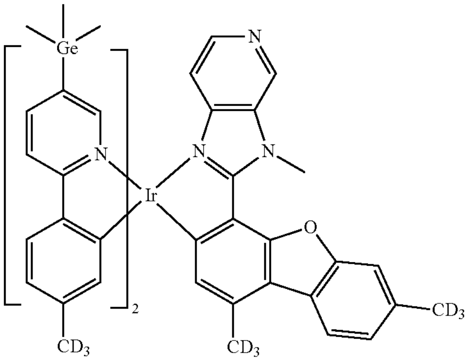
1928
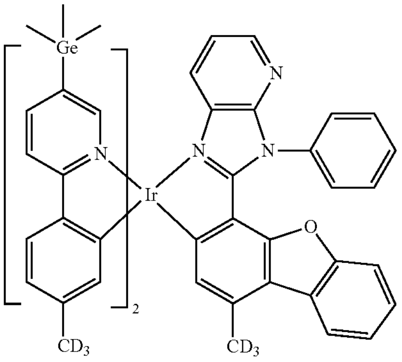
1929
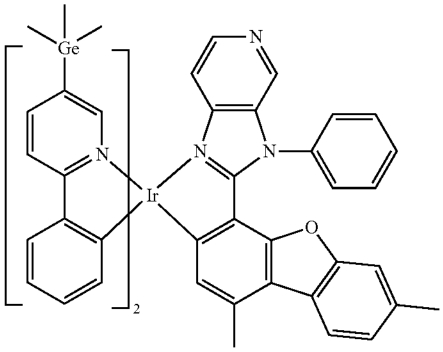
1930
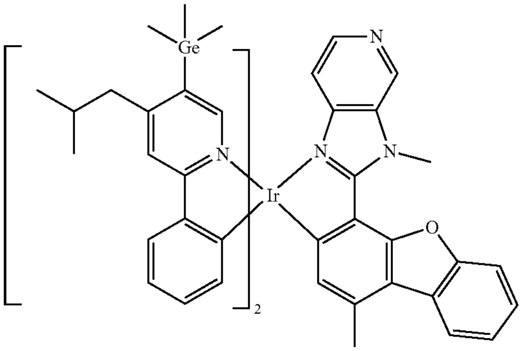
-continued
1931
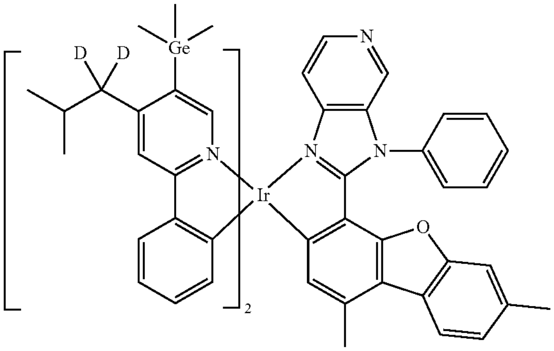
1932
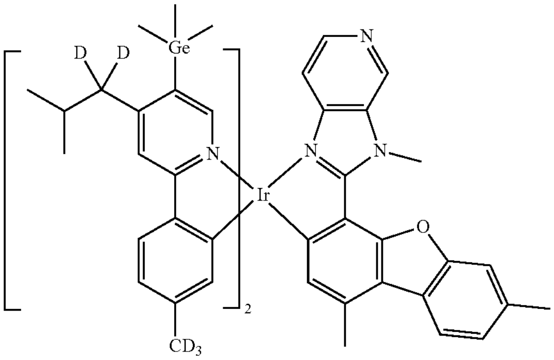
1933
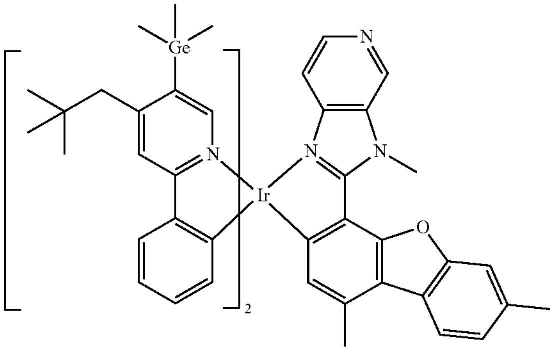
1934
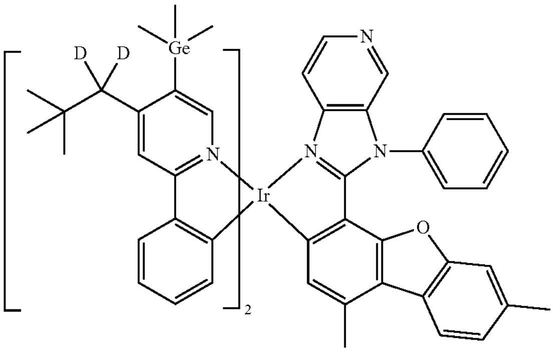

1935
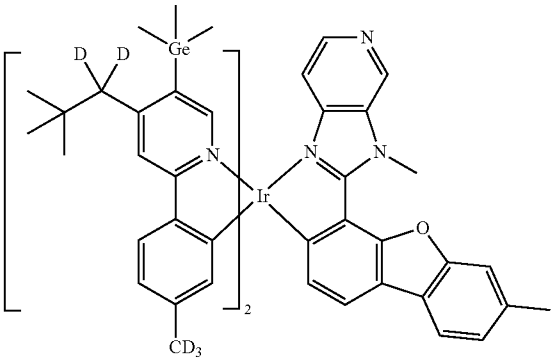
1936
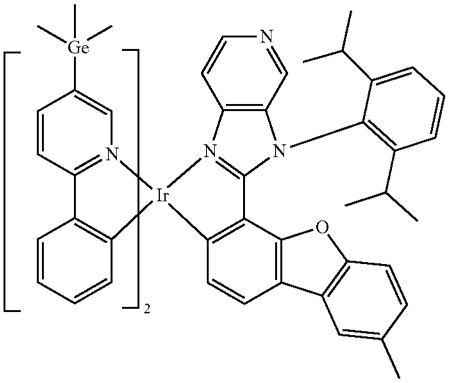
1937
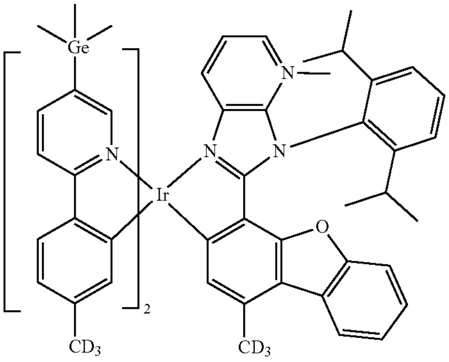
1938
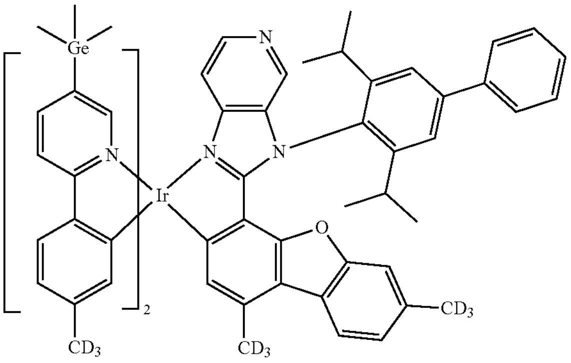
1939
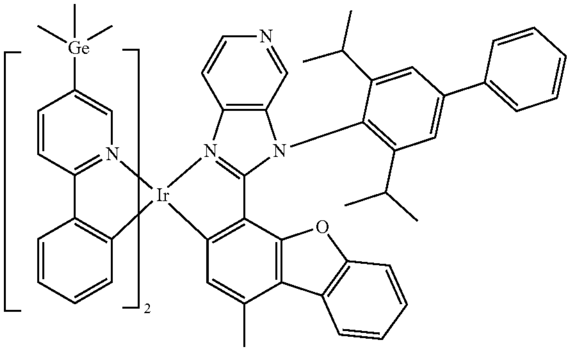
1940
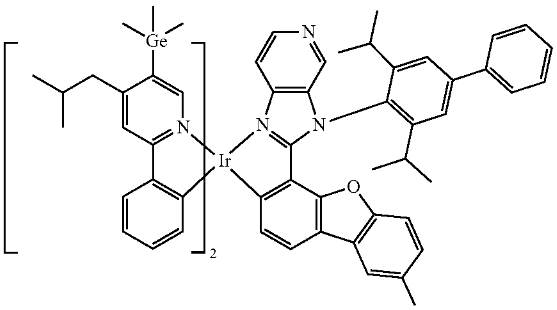
1941
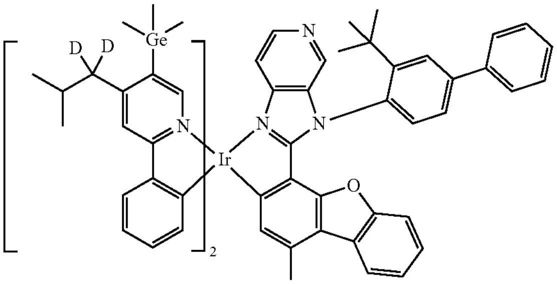
1942
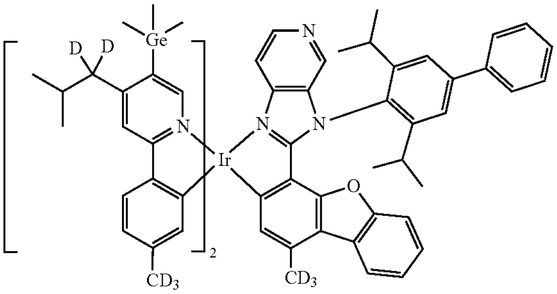
1943
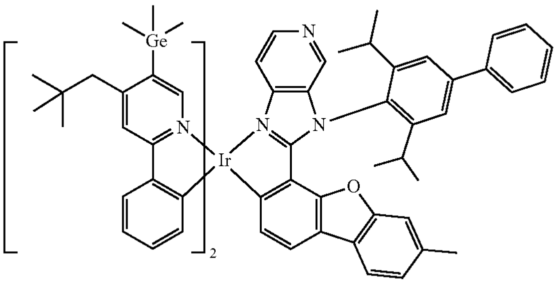

-continued
1944
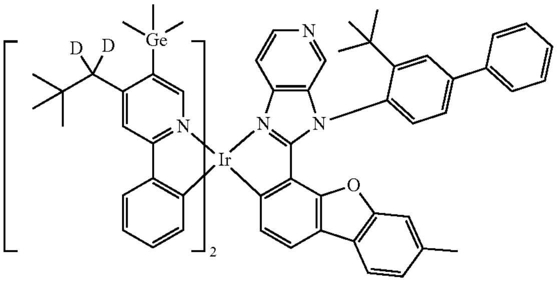
1945
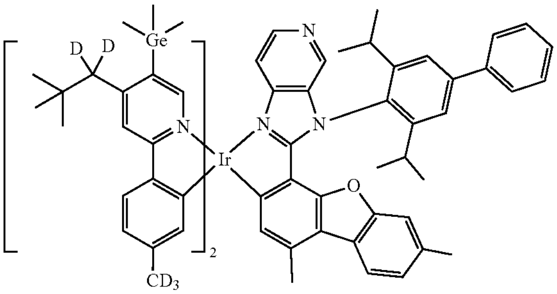
1946
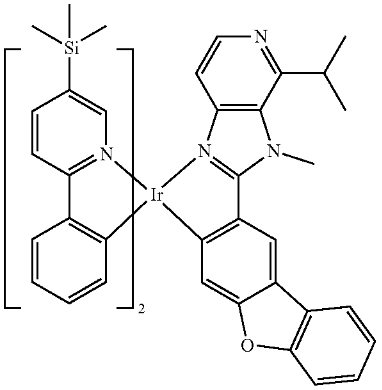
1947
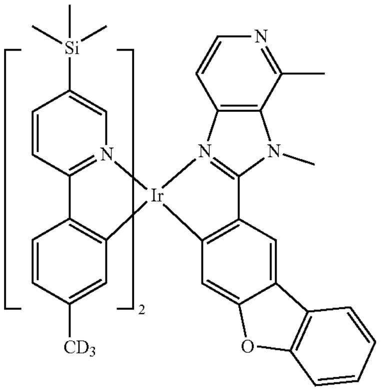
-continued
1948
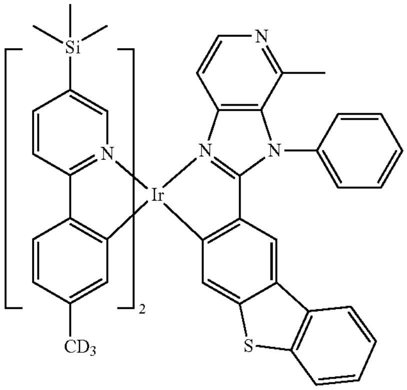
1949
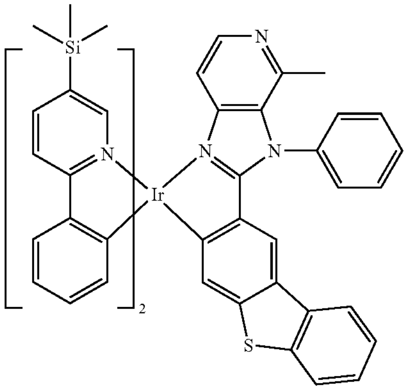
1950
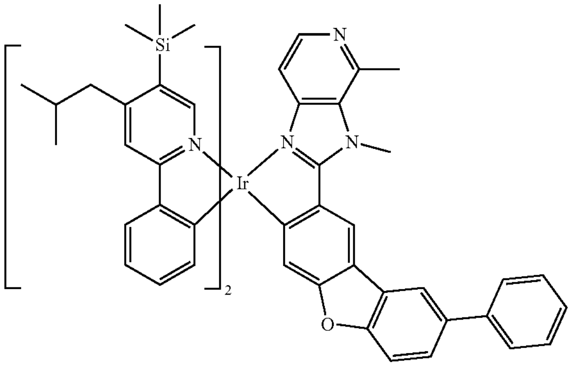
1951
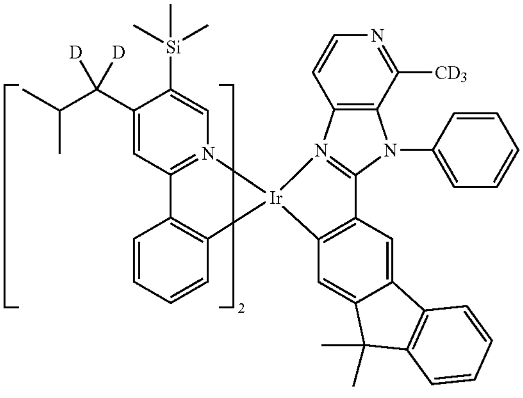

1952
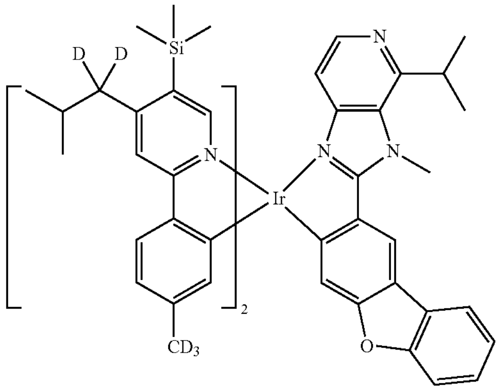
1953
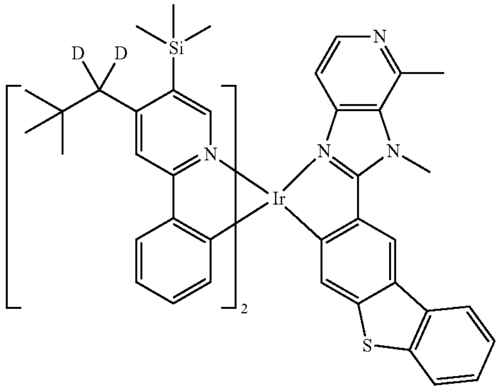
1954
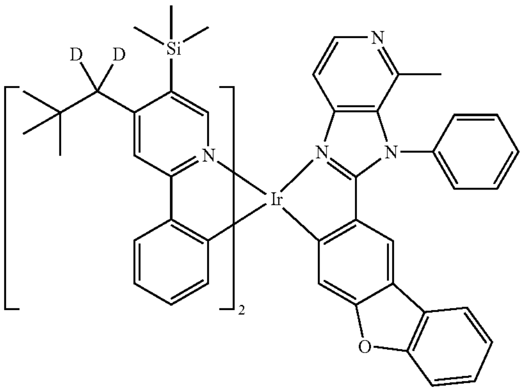
1955
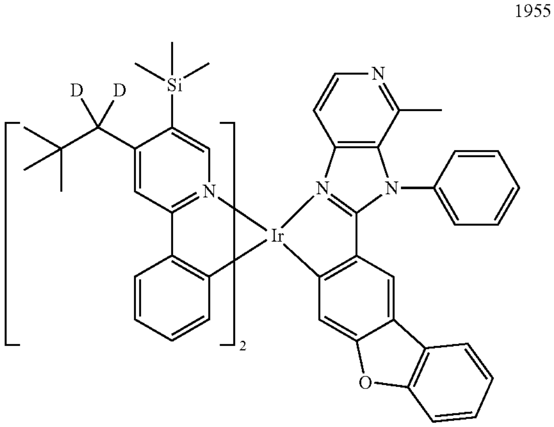
1956
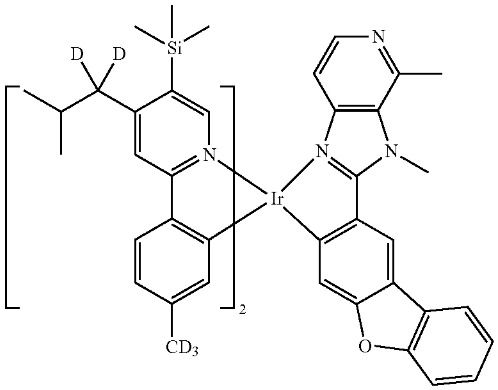
1957
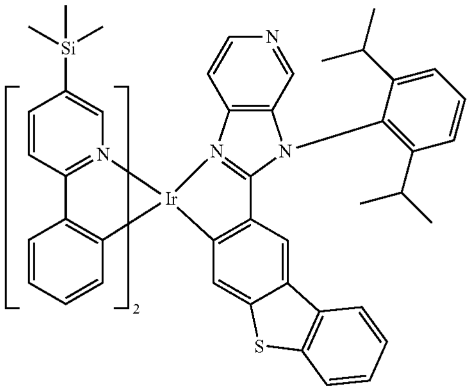
1958
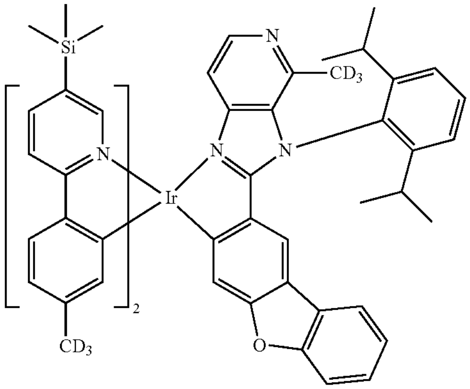
1959
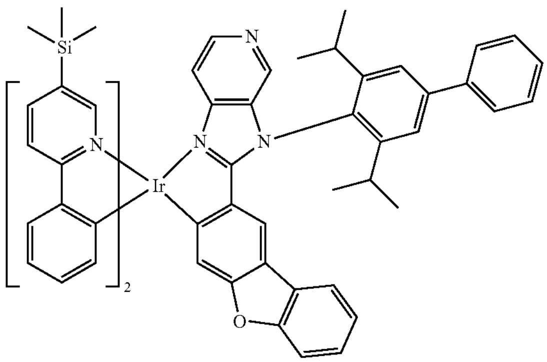

-continued
1960
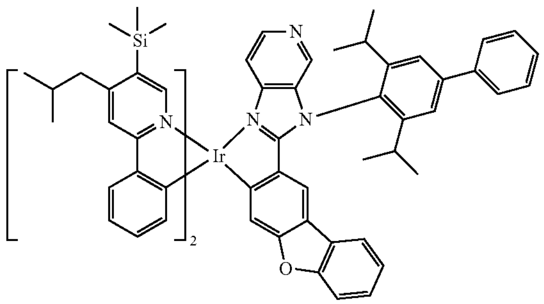
1961
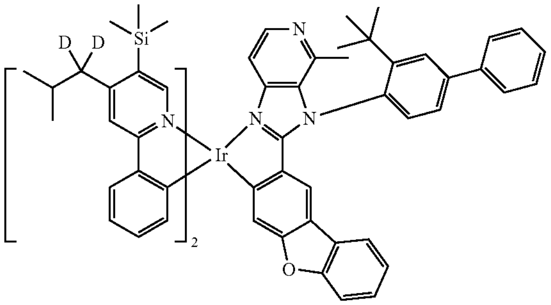
1962
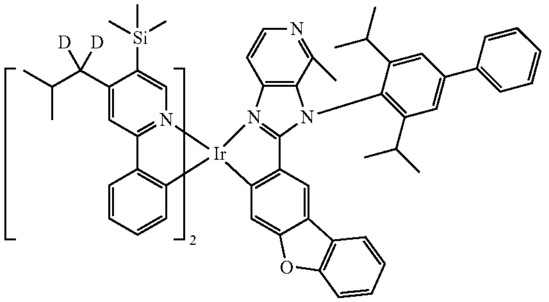
1963
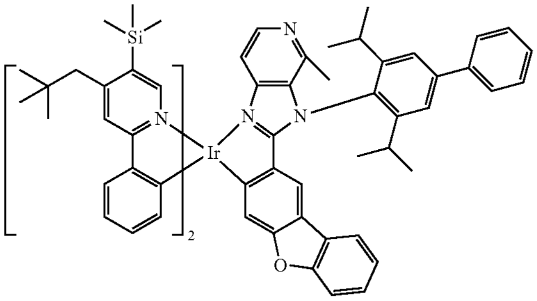
1964
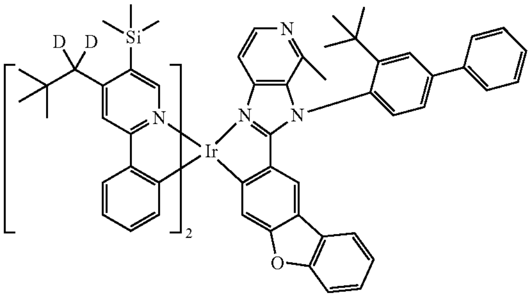
-continued
1965
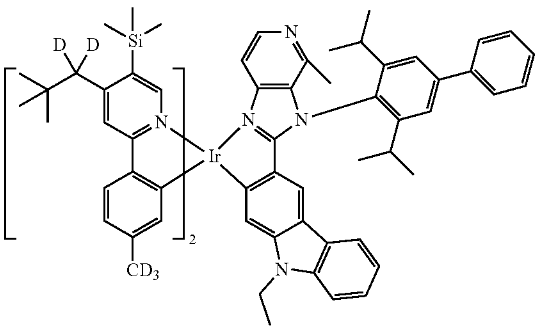
1966
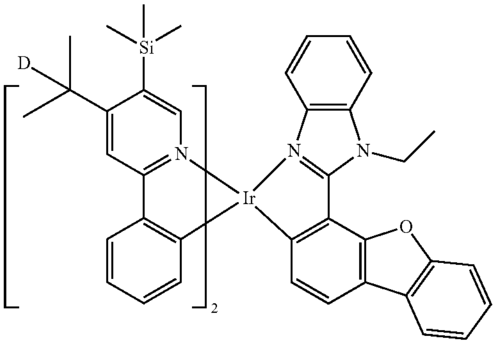
1967
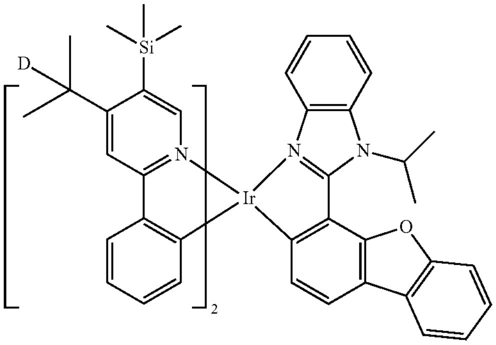
1968
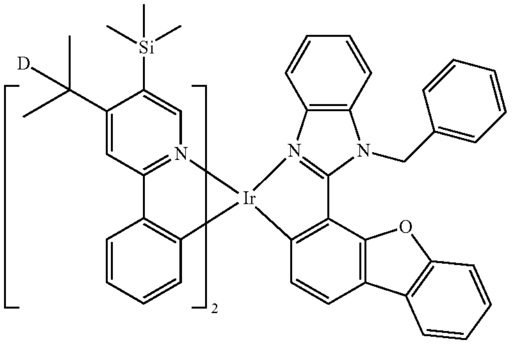

-continued
1969
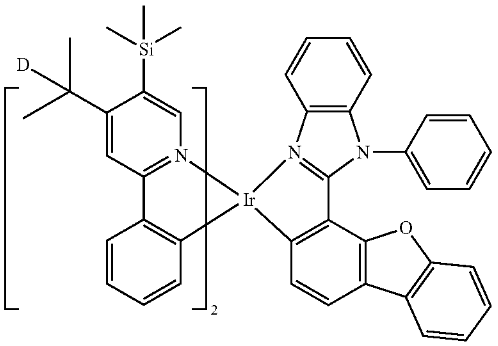
1970
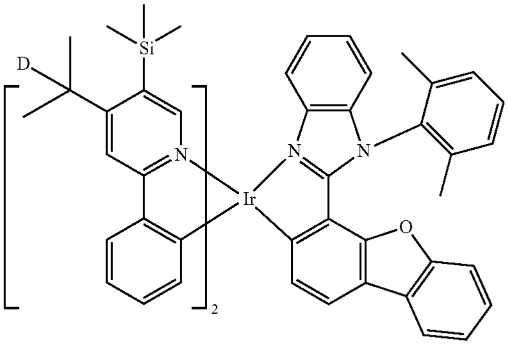
1971
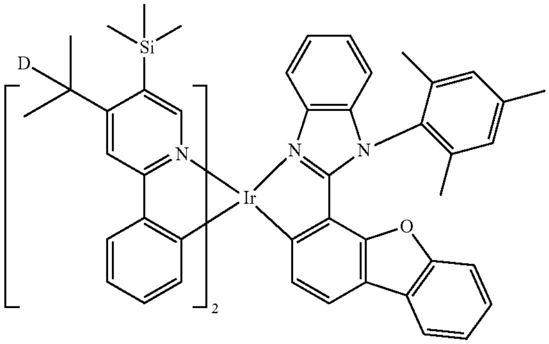
1972
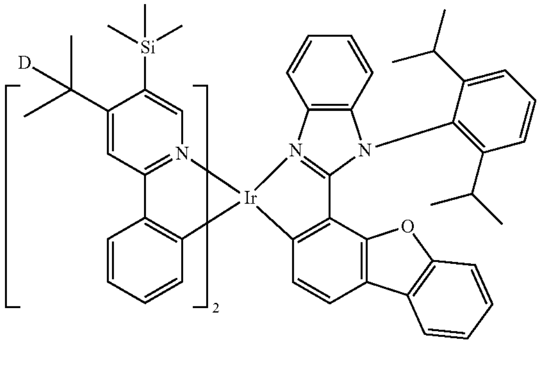
-continued
1973
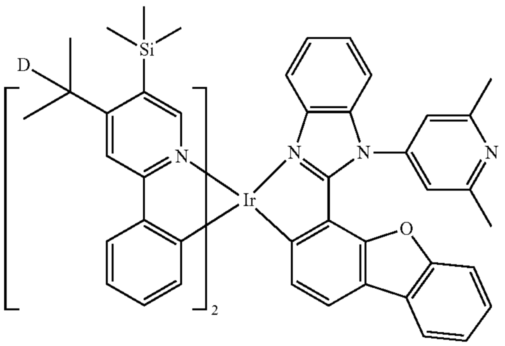
1974
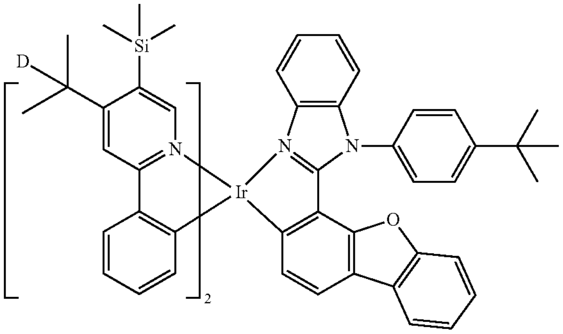
1975
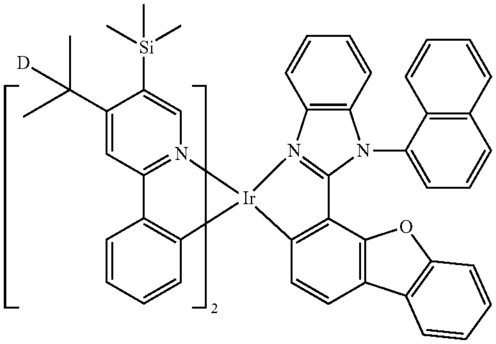
1976
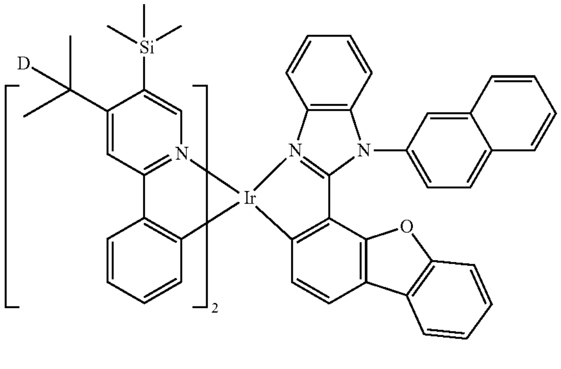

-continued
1977
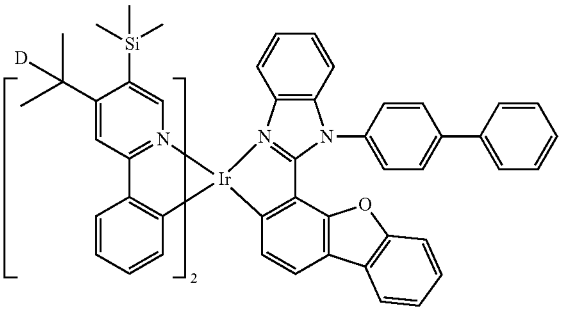
1978
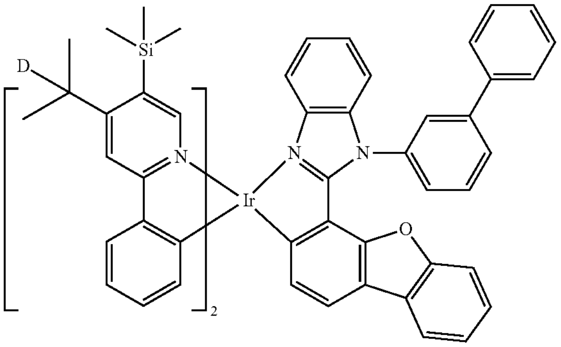
1979
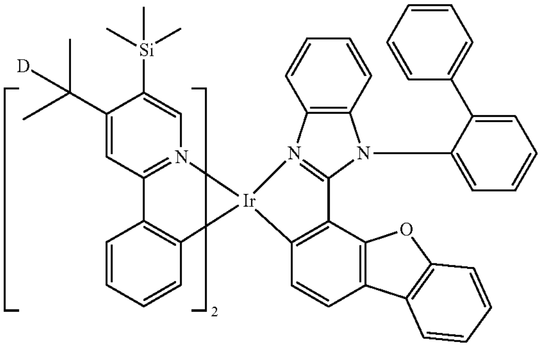
1980
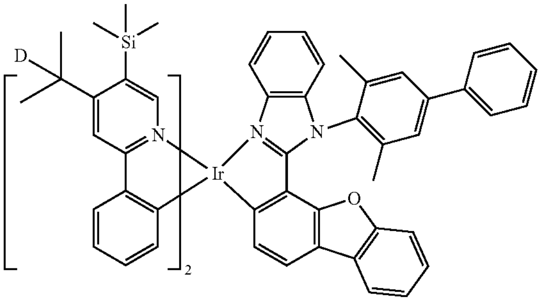
-continued
1981
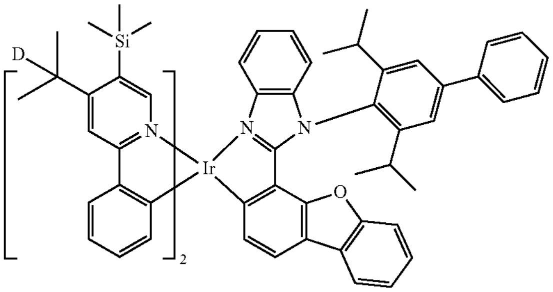
1982
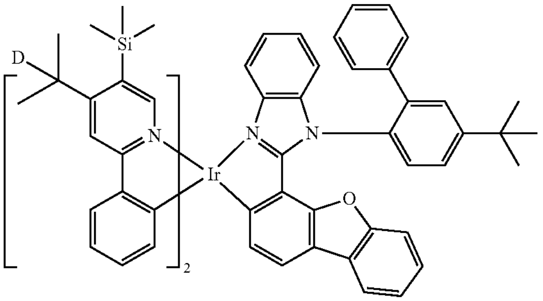
1983
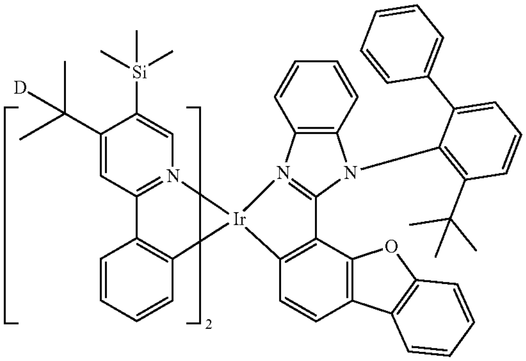
1984
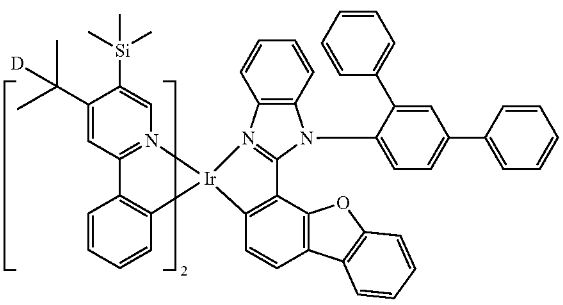

-continued
1985
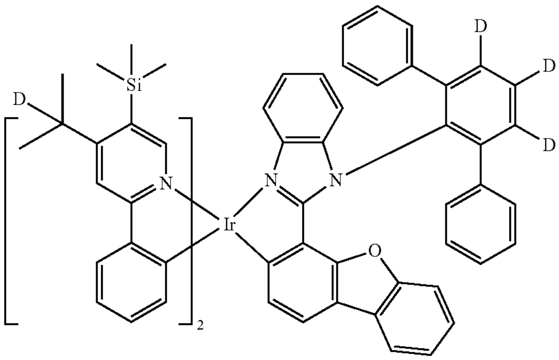
1986
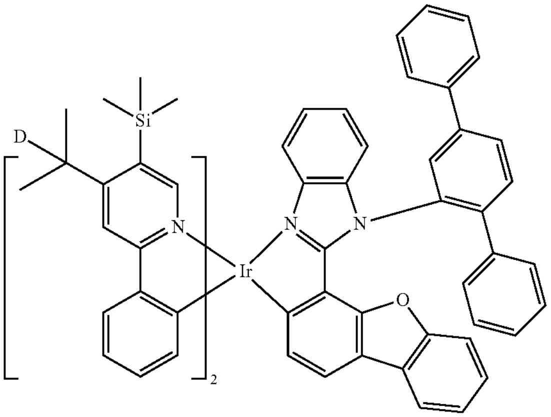
1987
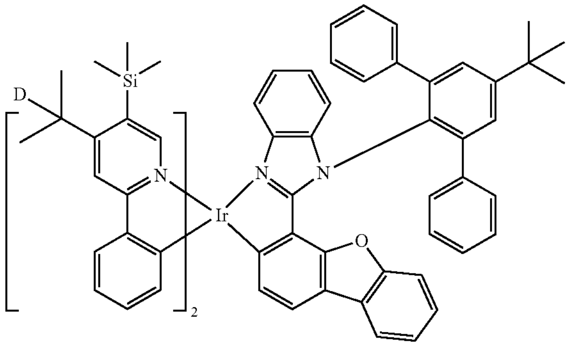
1988
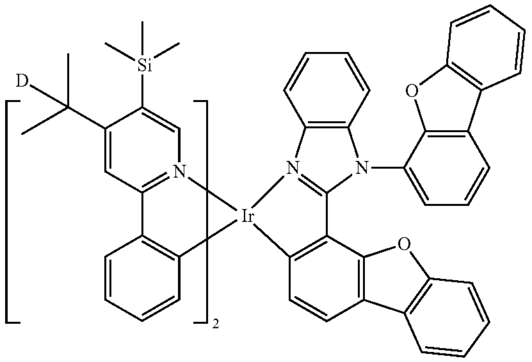
-continued
1989
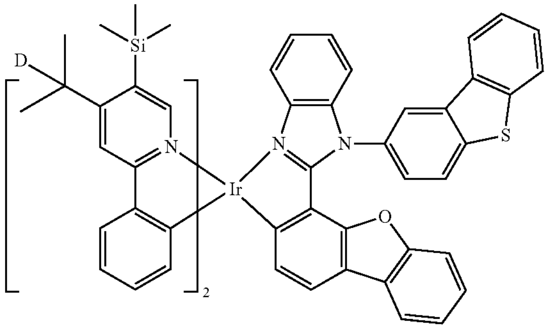
1990
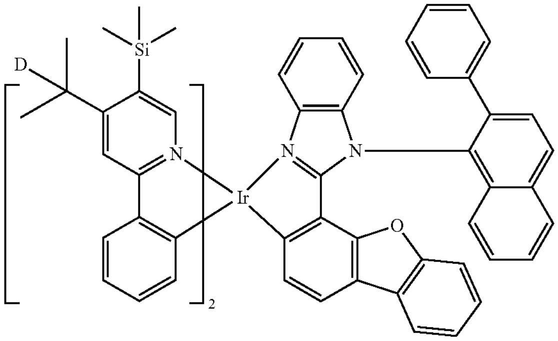
1991
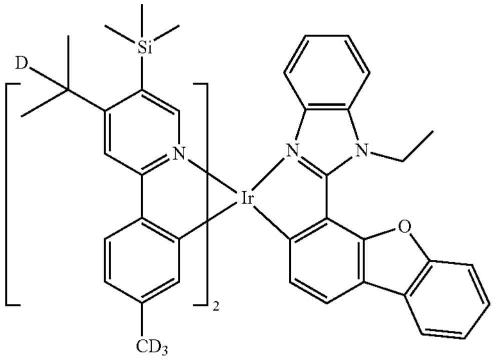
1991
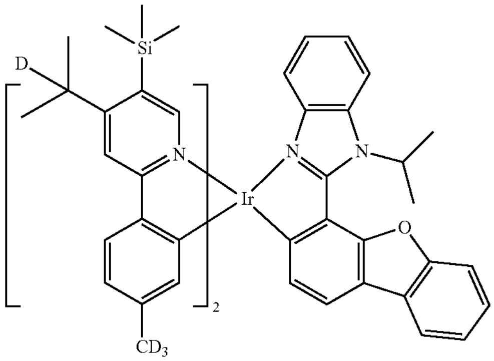

-continued
1992
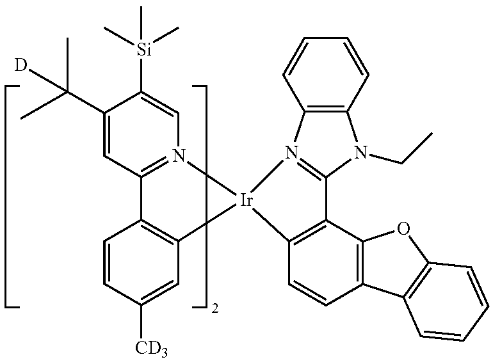
1996
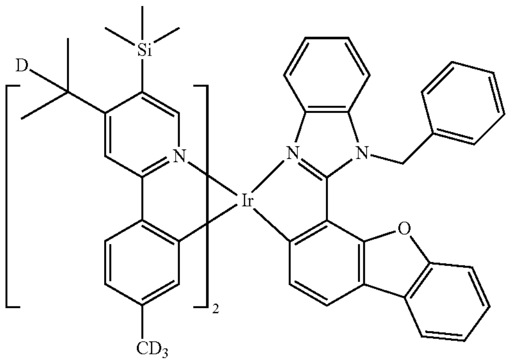
1994
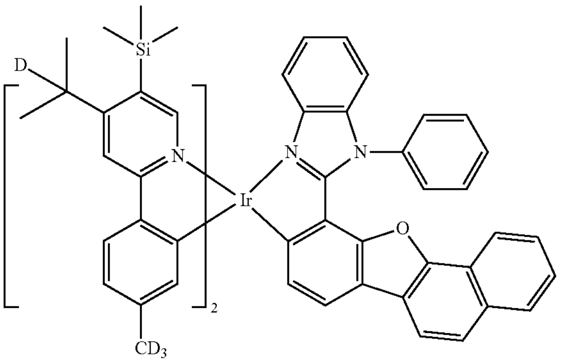
1995
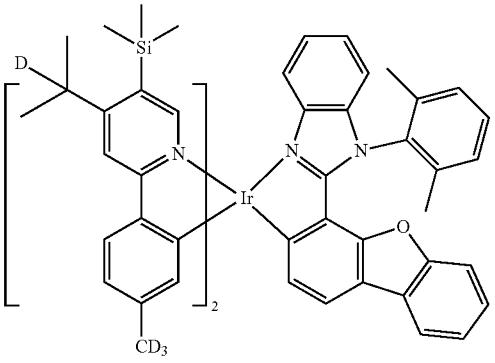
-continued
1996
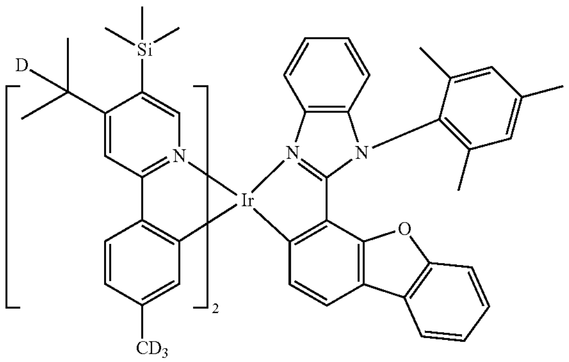
1997
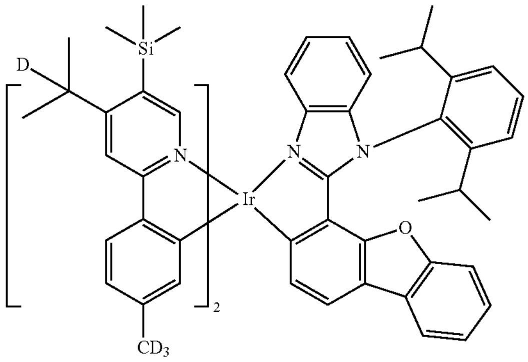
1998
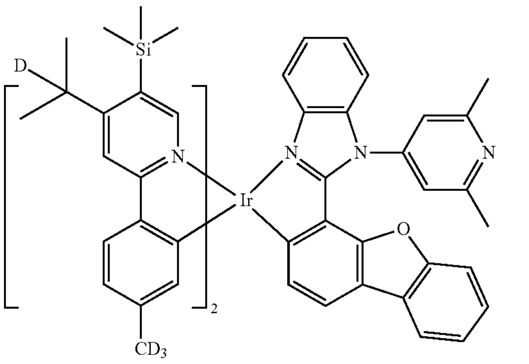
2000
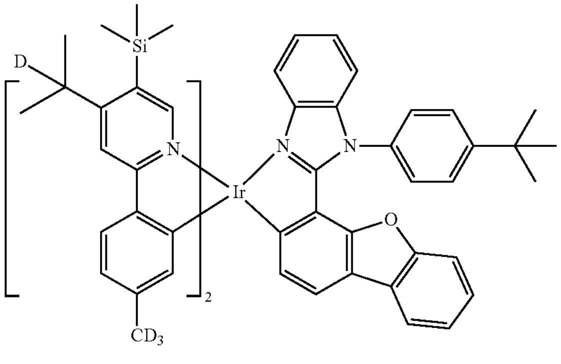

2001
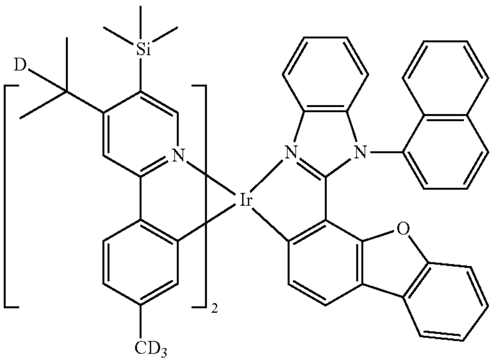
2002
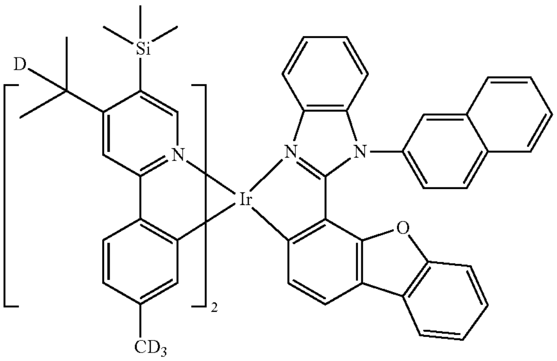
2003
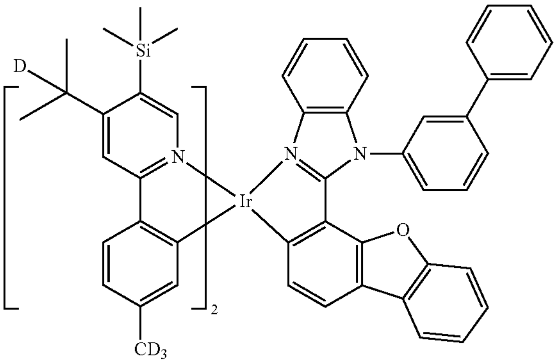
2004
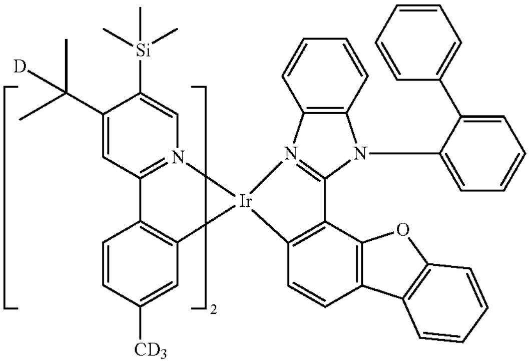
2005
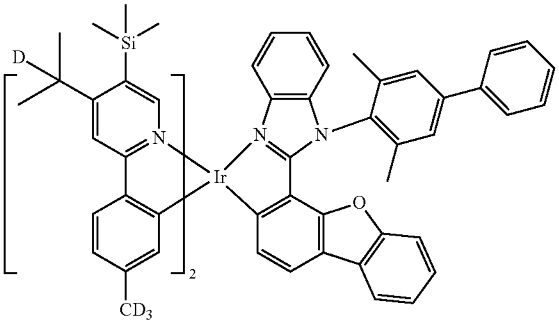
2006
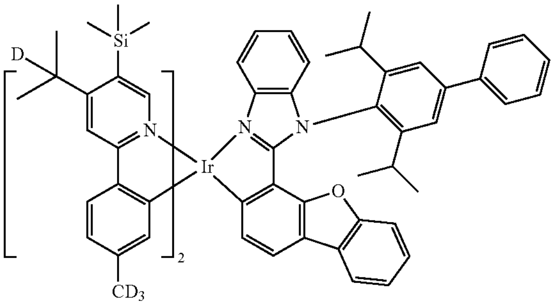
2007
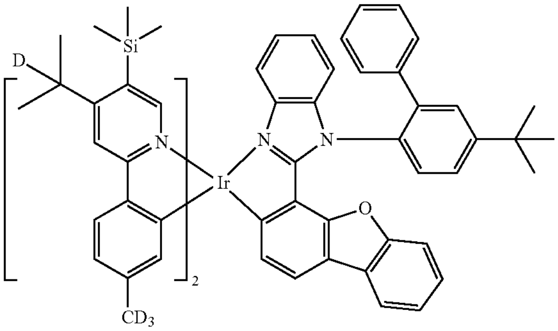
2008
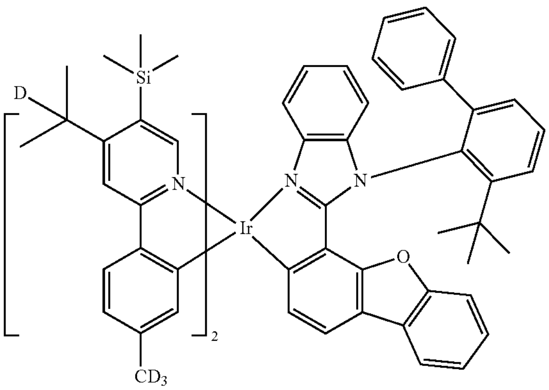

-continued
2009
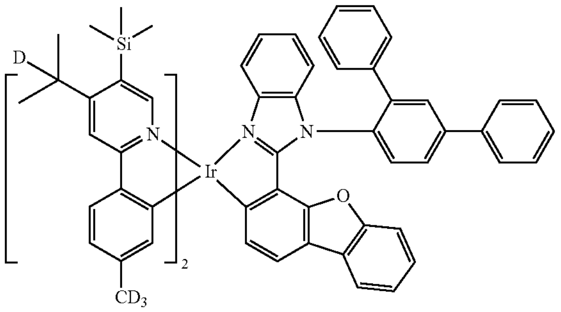
2010
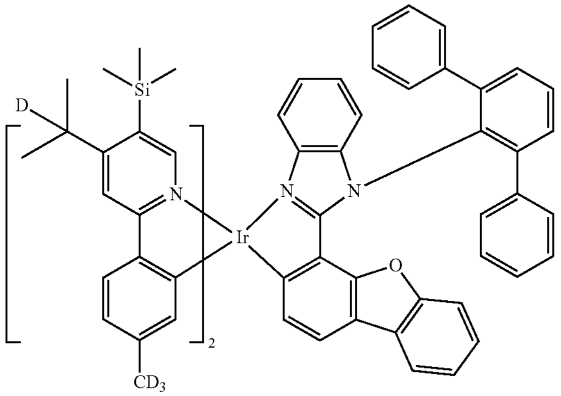
2011
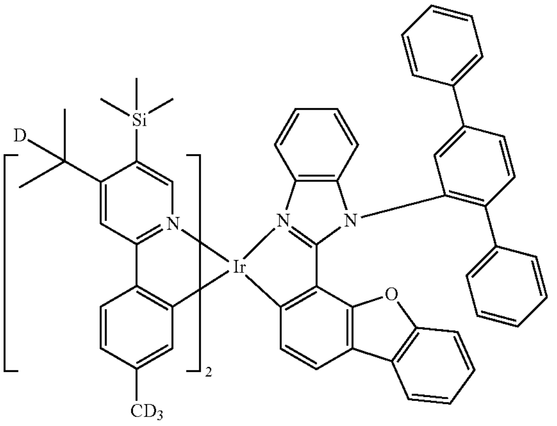
2012
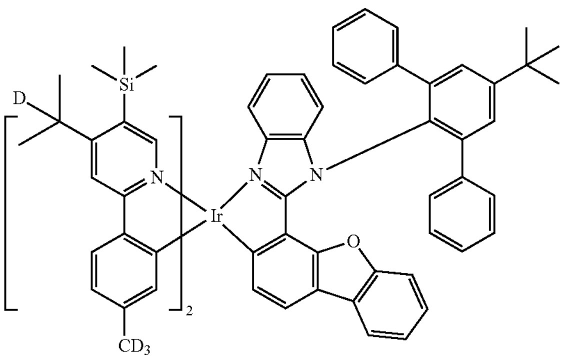
-continued
2013
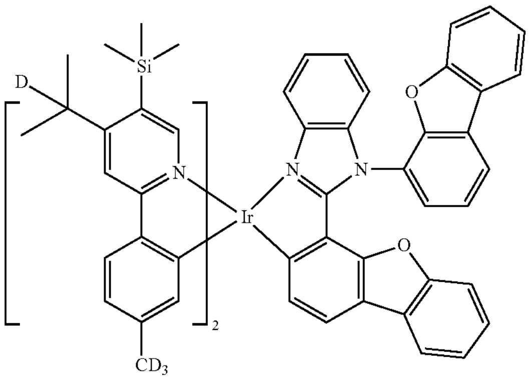
2014
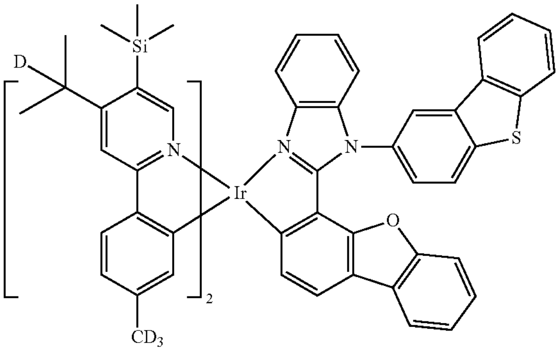
2015
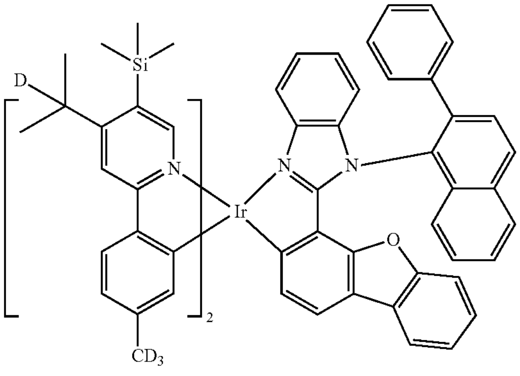
2016
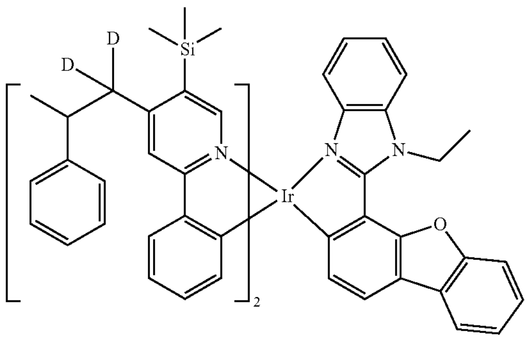

2017
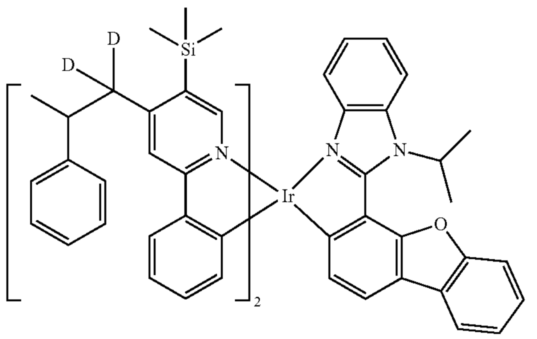
2018
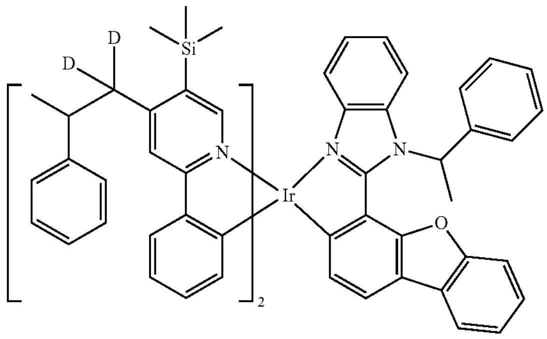
2019
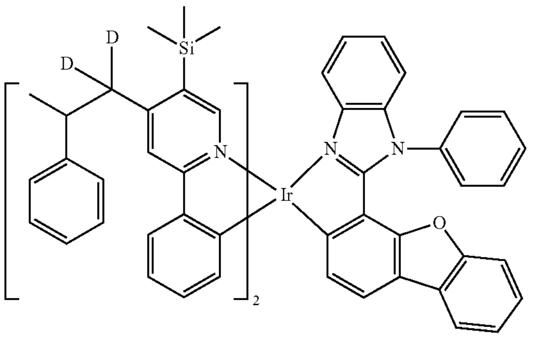
2020
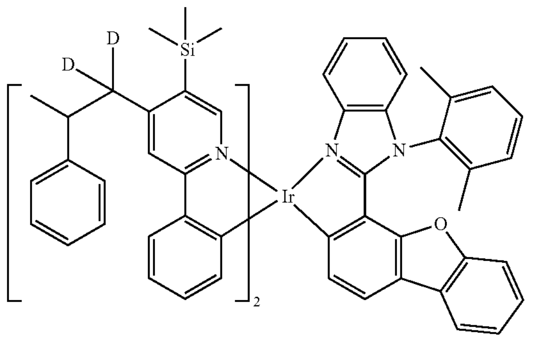
2021
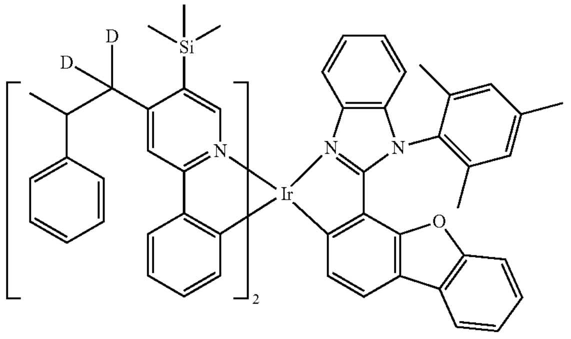
2022
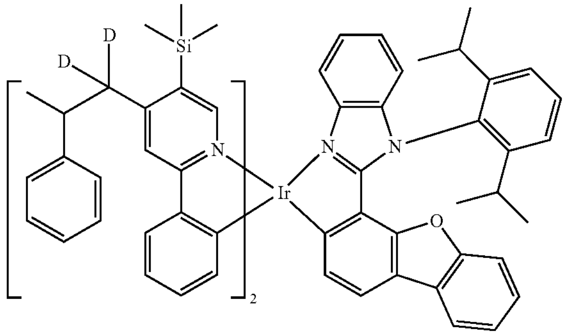
2023
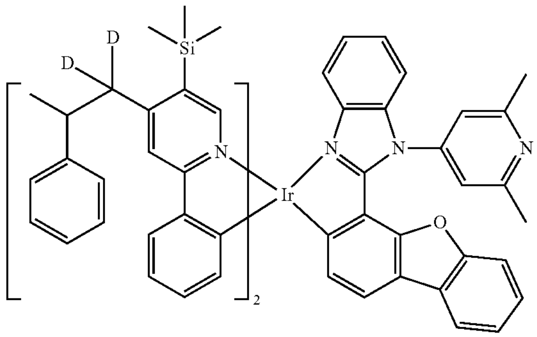
2024
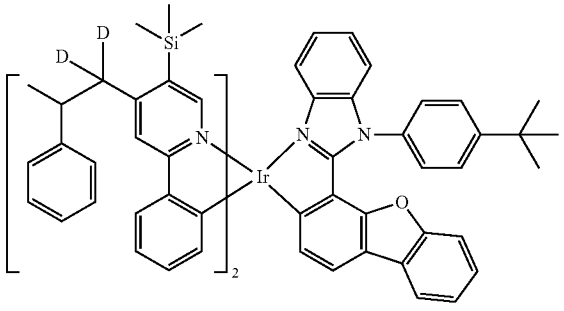

-continued
2025
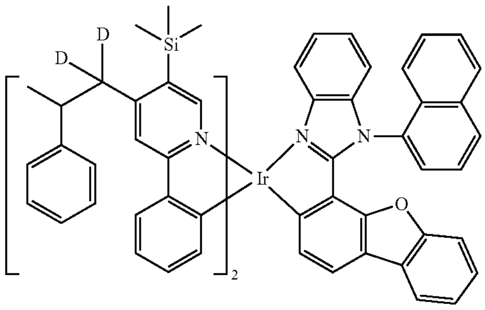
2026
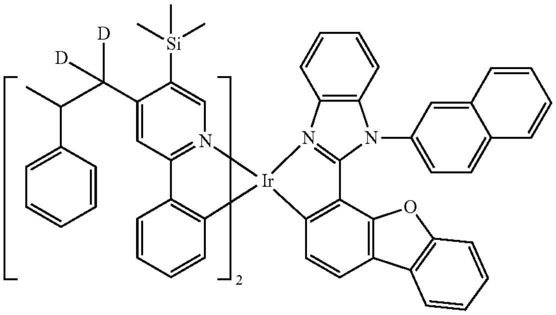
2027
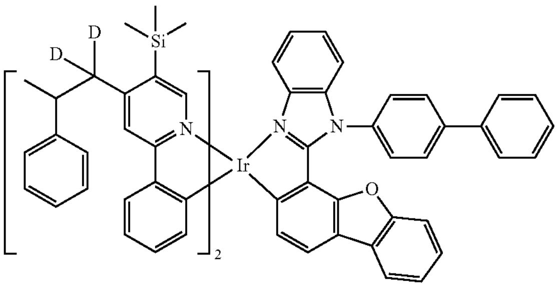
2028
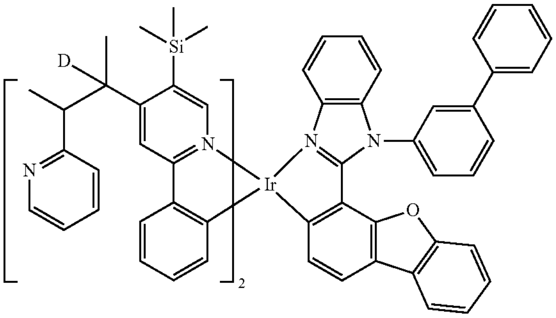
-continued
2029
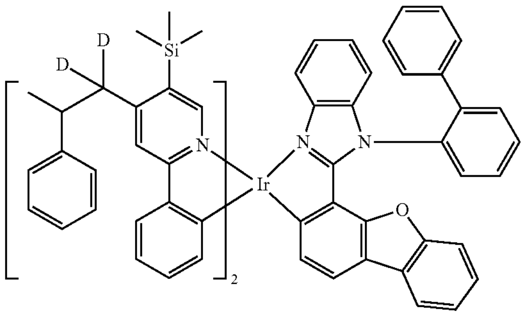
2030
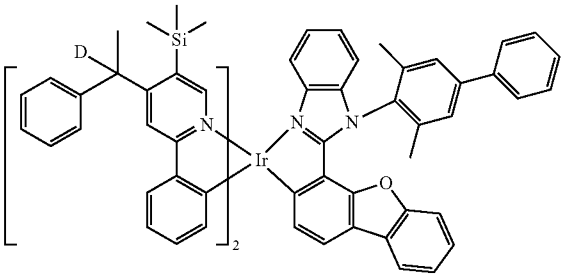
2031
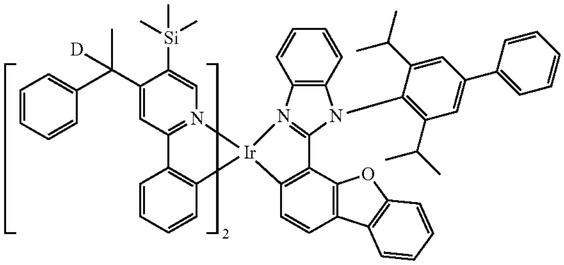
2032
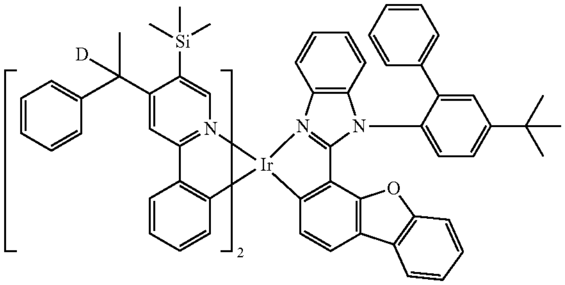
2033
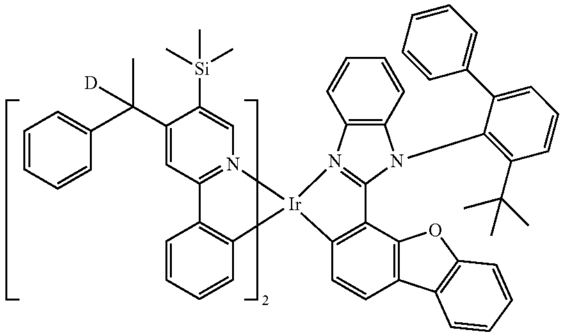

2034
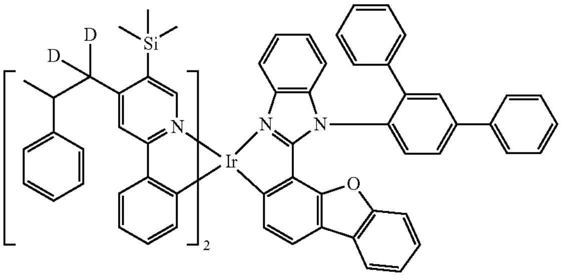
2035
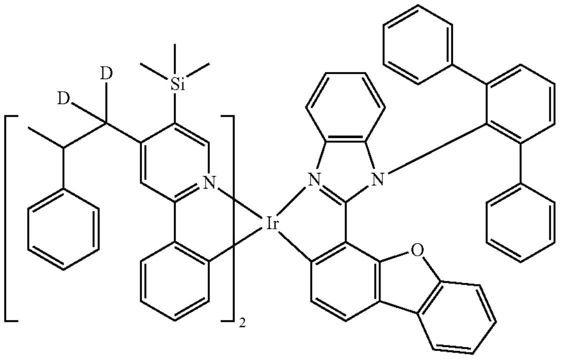
2036
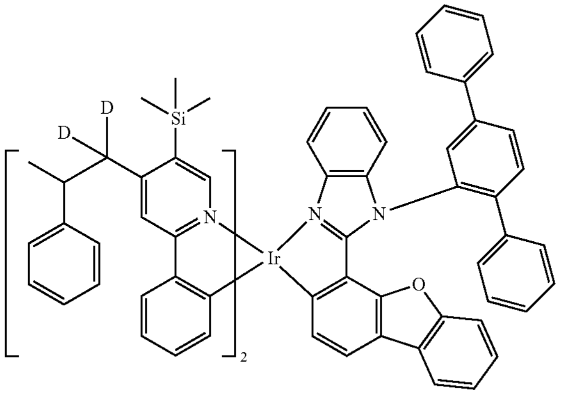
2037
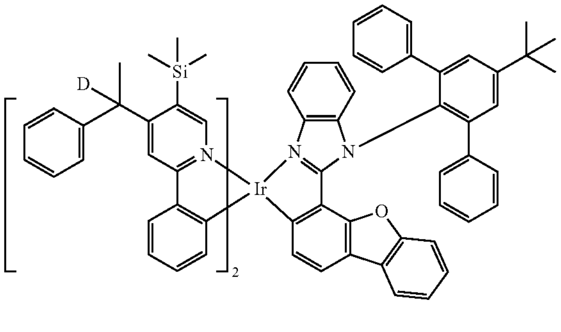
2038
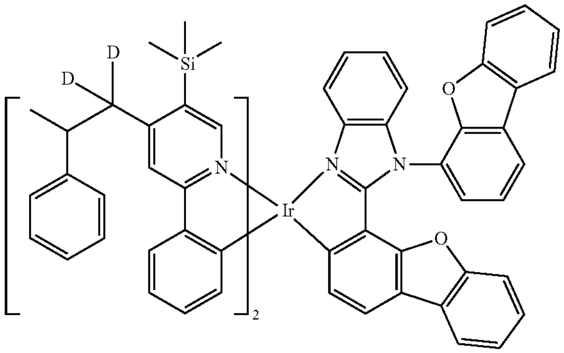
2039
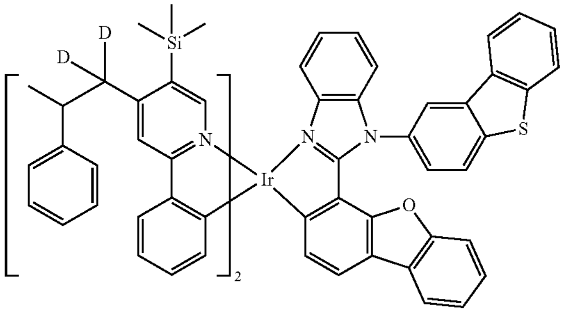
2040
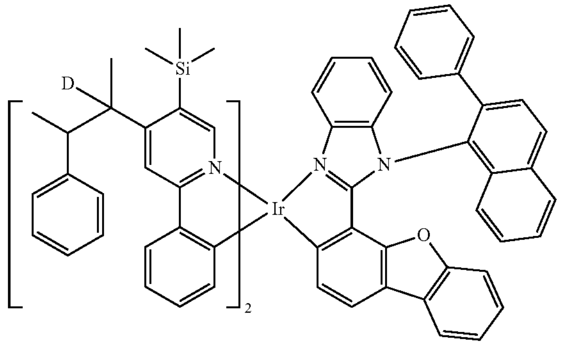
2041
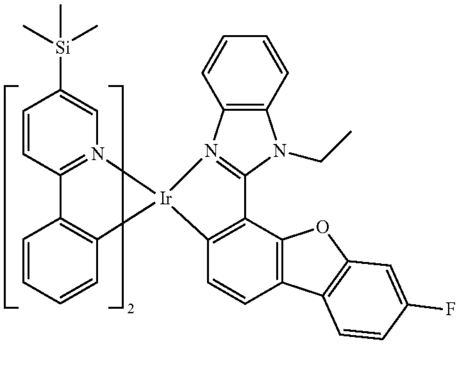

-continued
2042
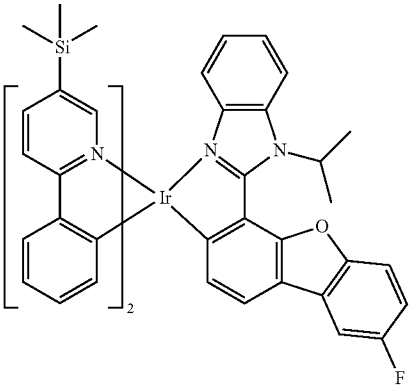
2043
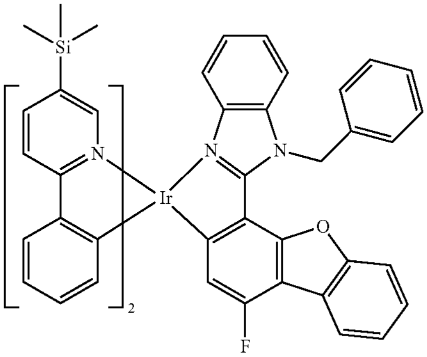
2044
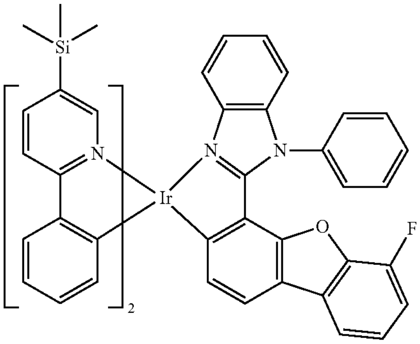
2045
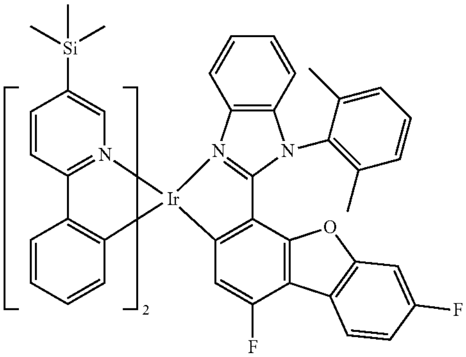
-continued
2046
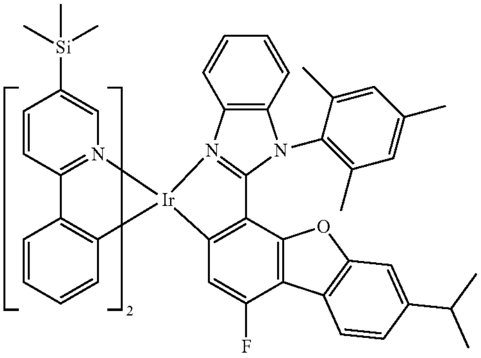
2047
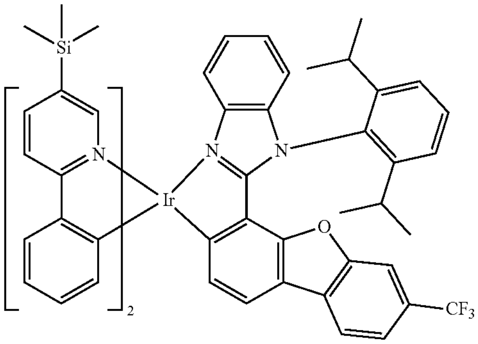
2048
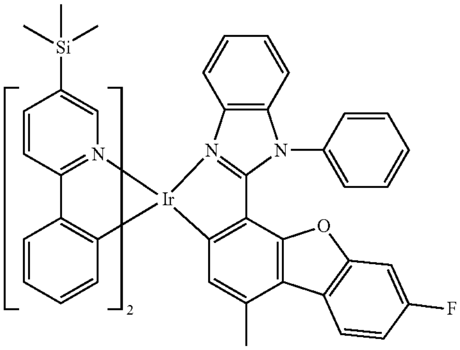
2049
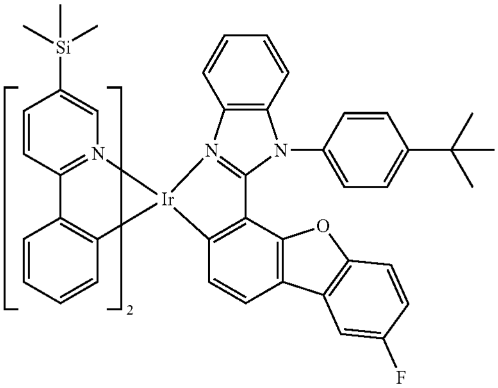

-continued
2050
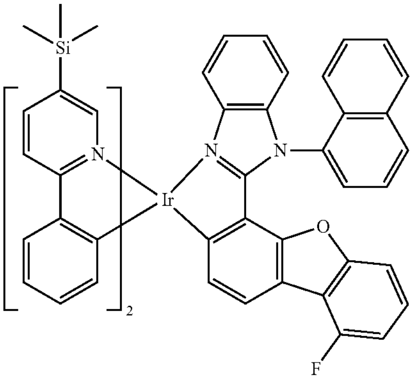
2051
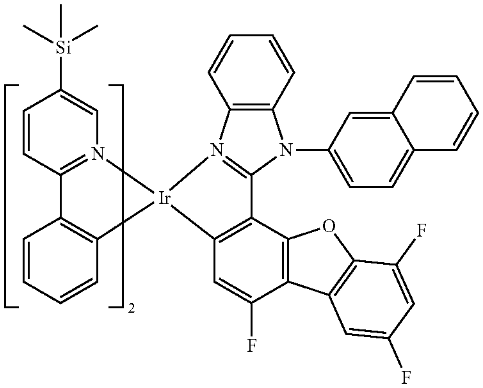
2052
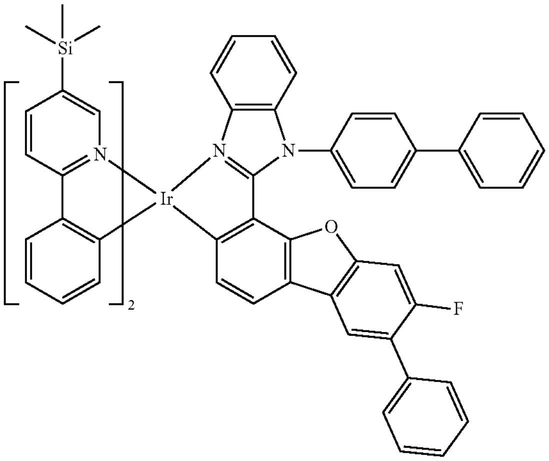
-continued
2053
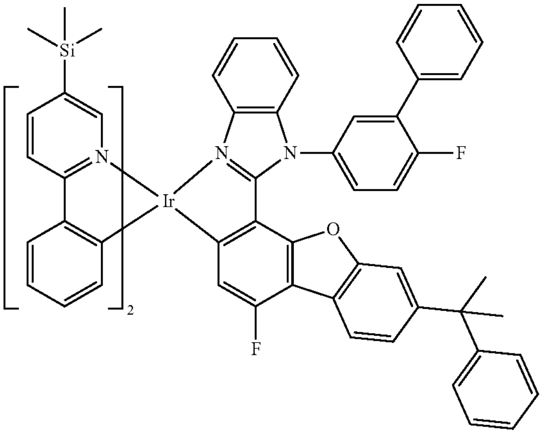
2054
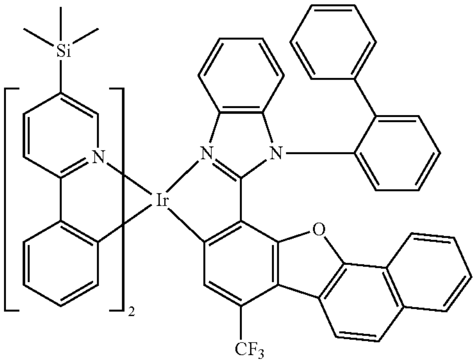
2055
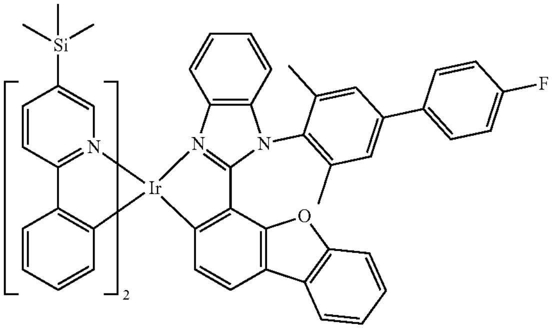
2056
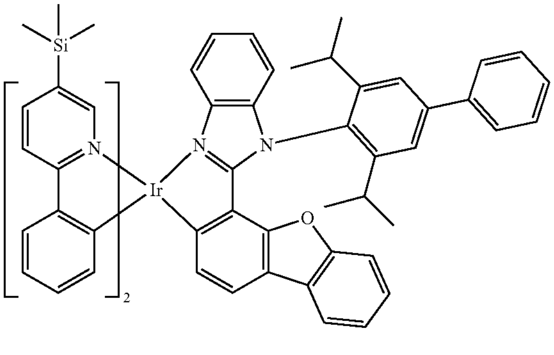

-continued
2057
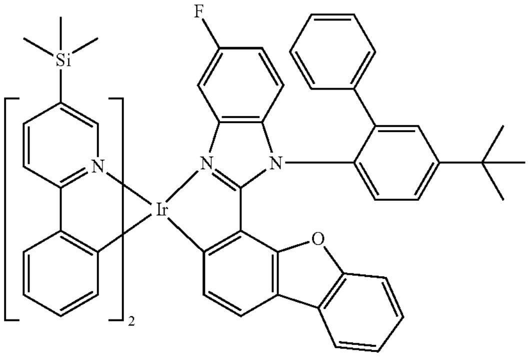
2058
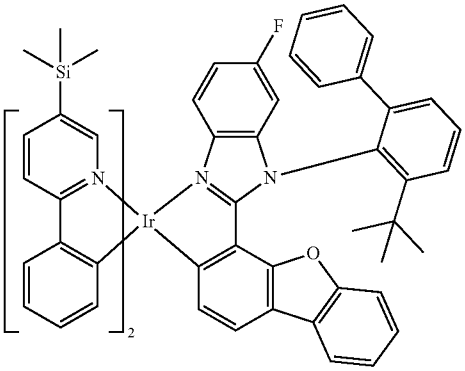
2059
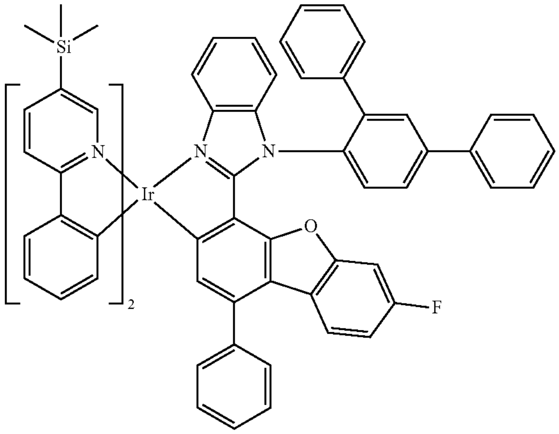
2060
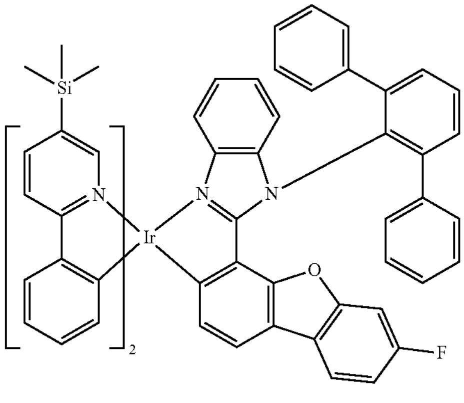
-continued
2061
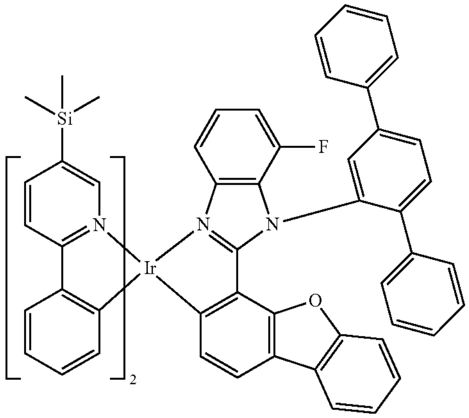
2062
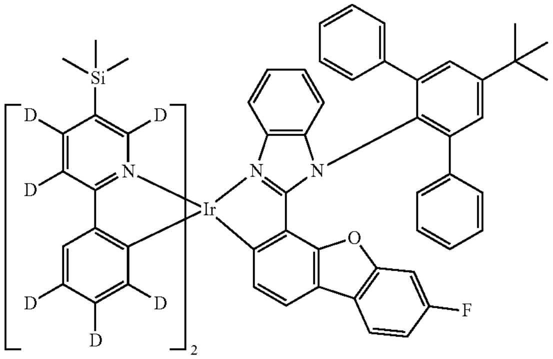
2063
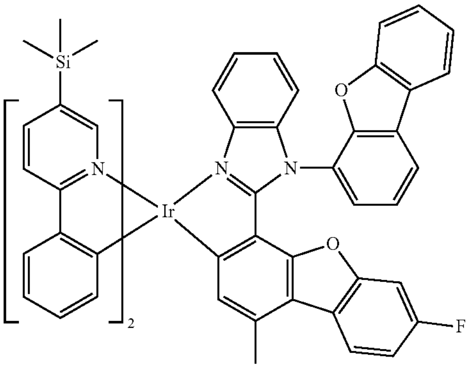
2064
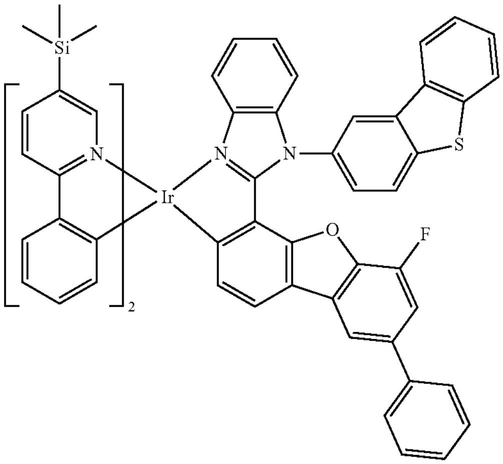

-continued
2065
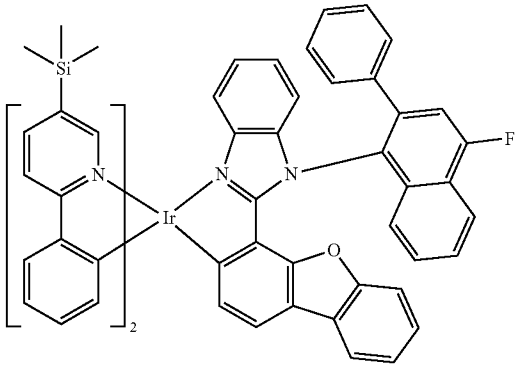
2066
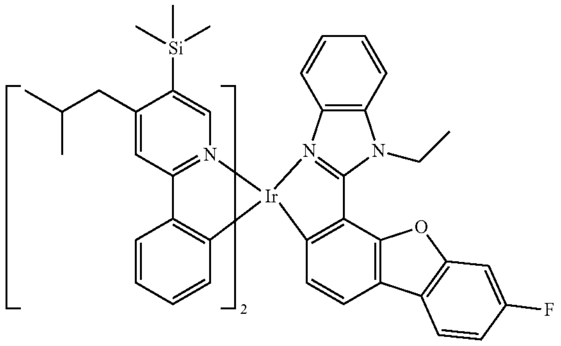
2067
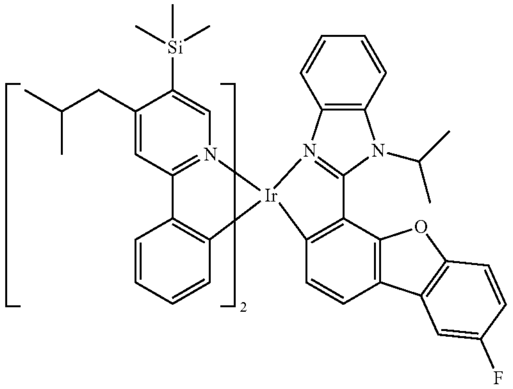
2068
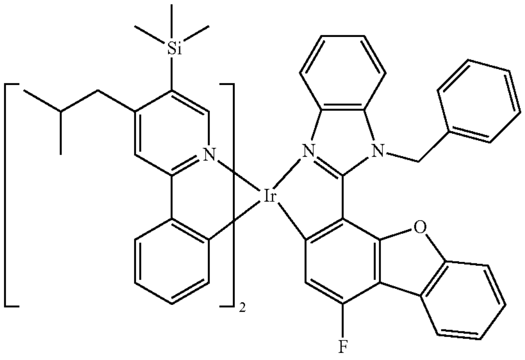
-continued
2069
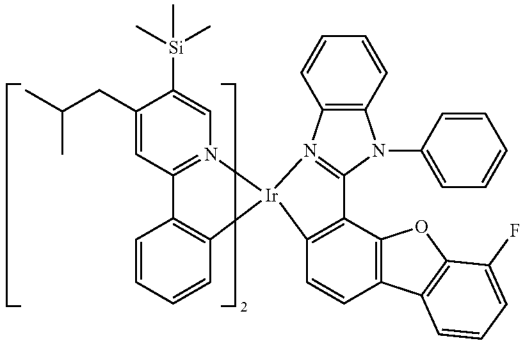
2070
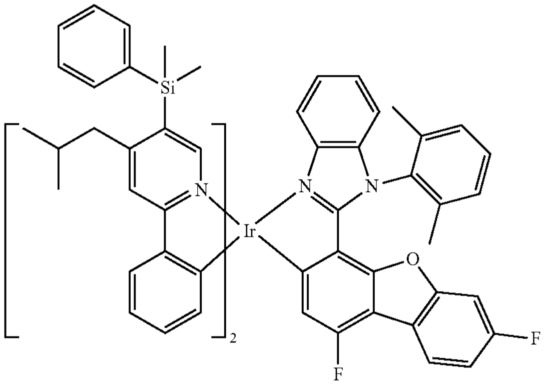
2071
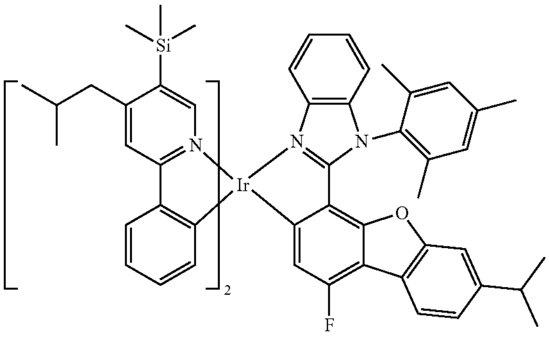
2072
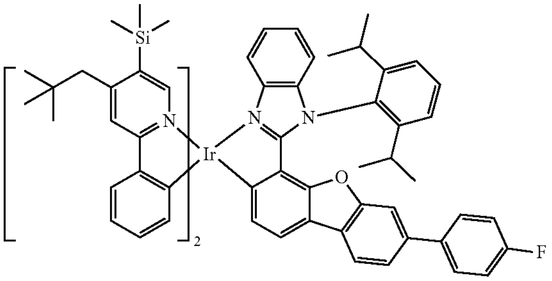

-continued
2073
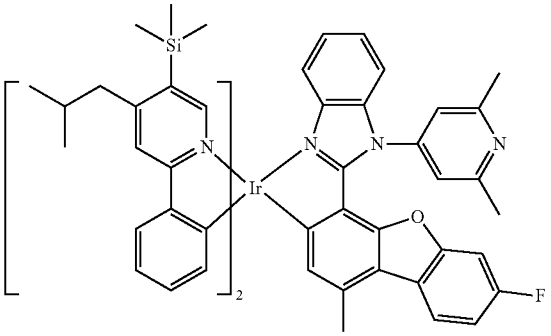
2074
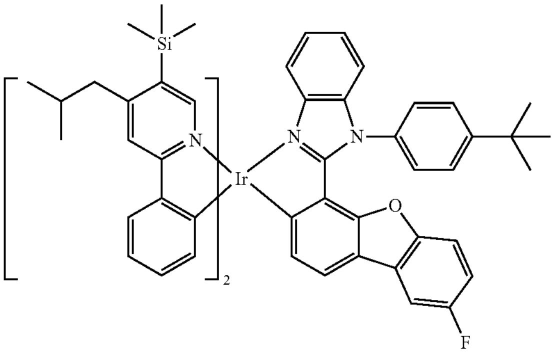
2075
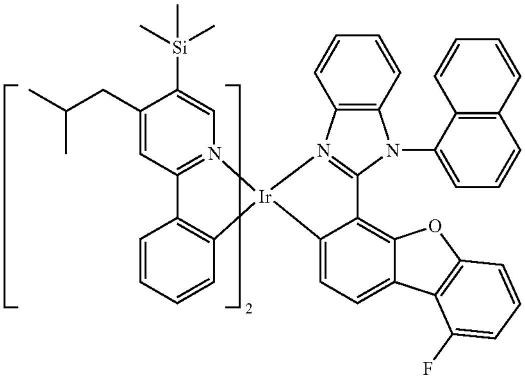
2076
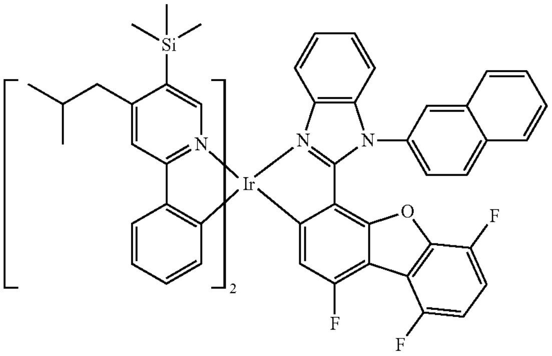
-continued
2077
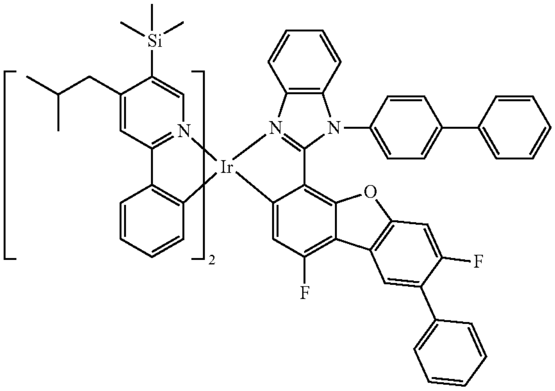
2078
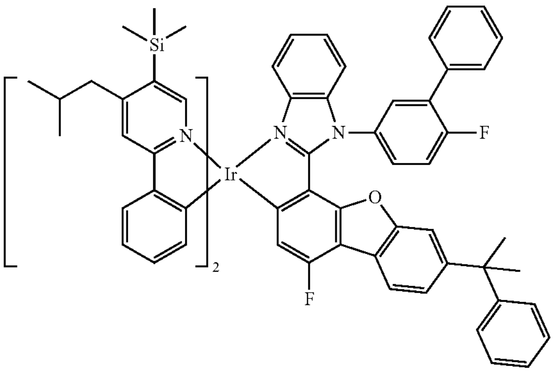
2079
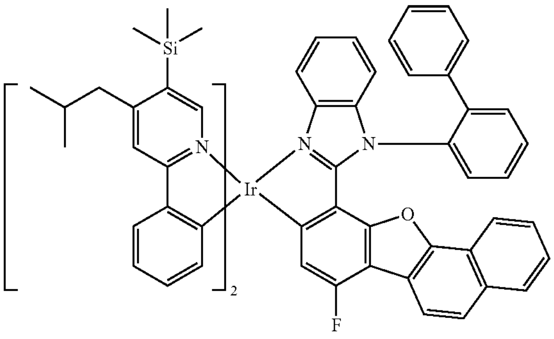
2080
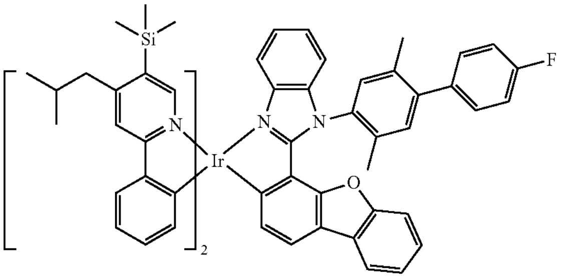

-continued
2081
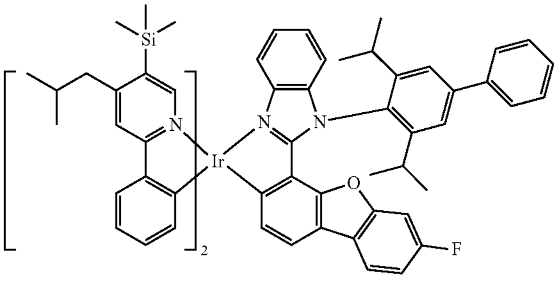
2082
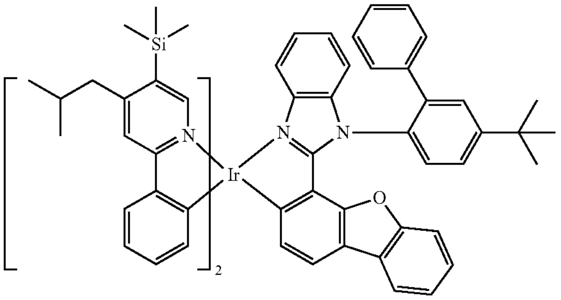
2084
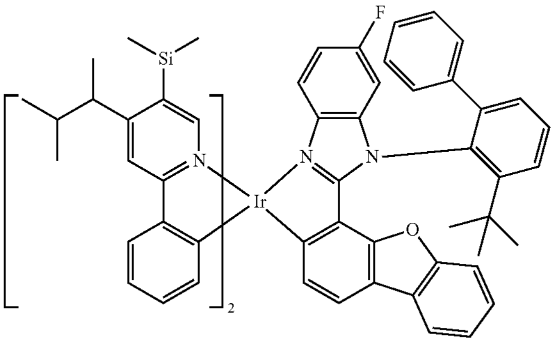
2085
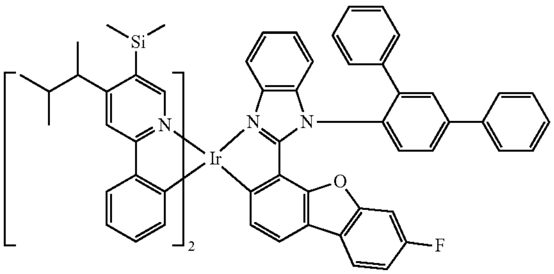
2086
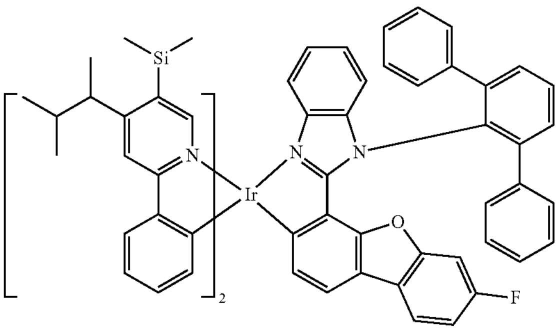
-continued
2087
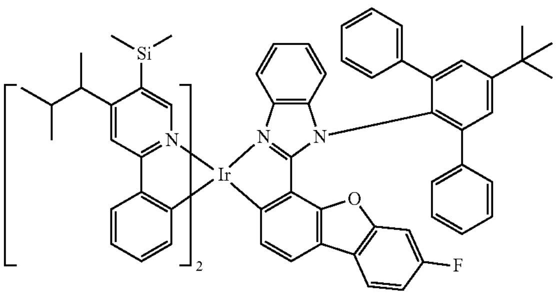
2088
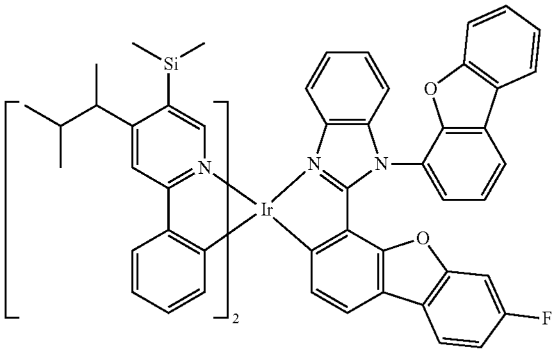
2089
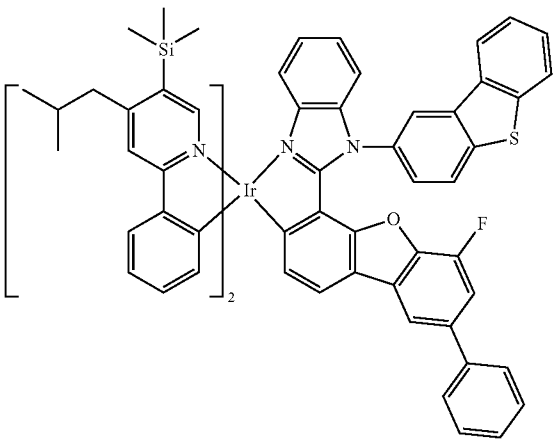
2090
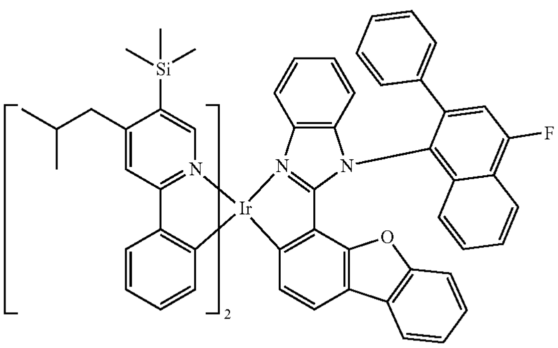

2091
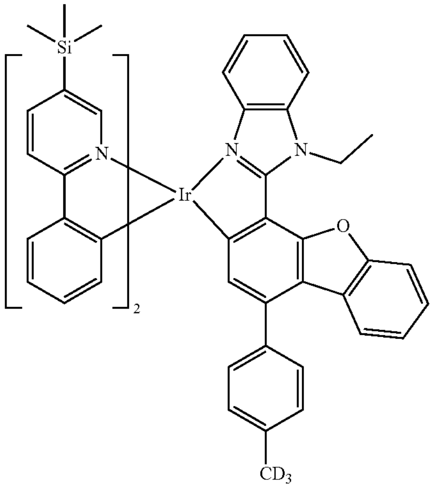
2092
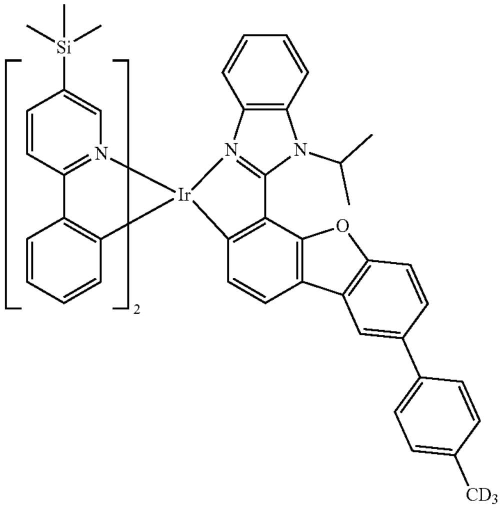
2093
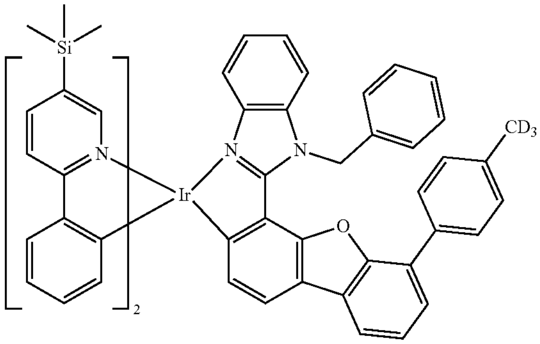
2094
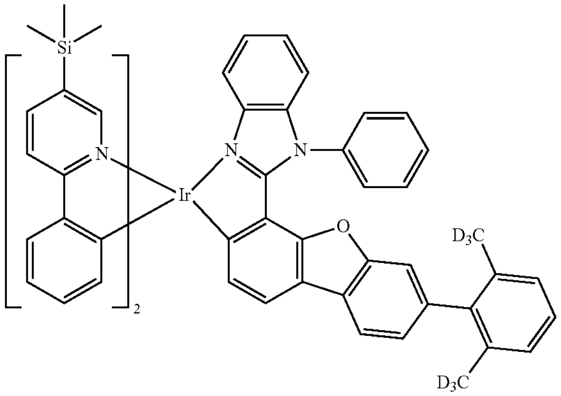
2095
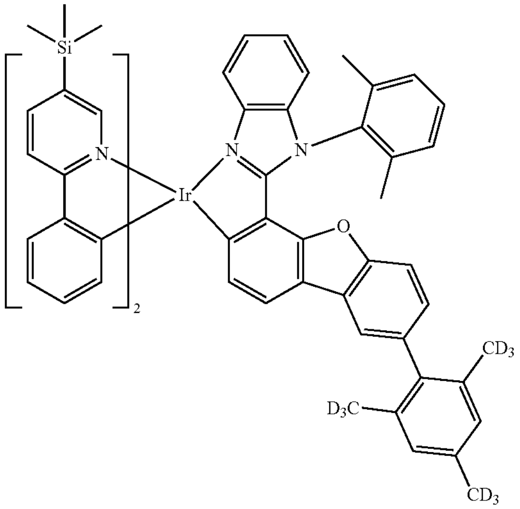
2096
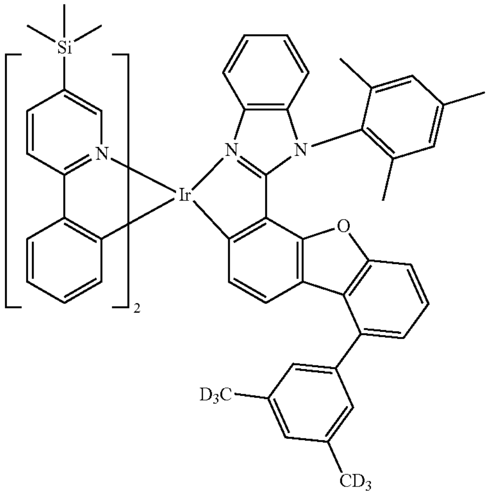

-continued
2097
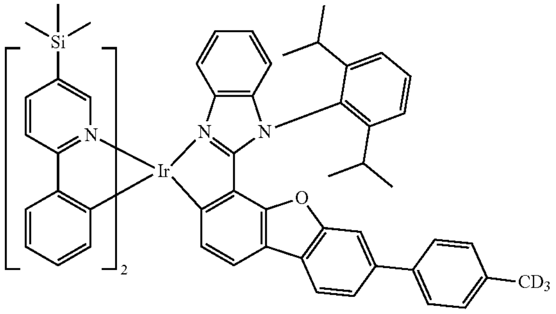
2098
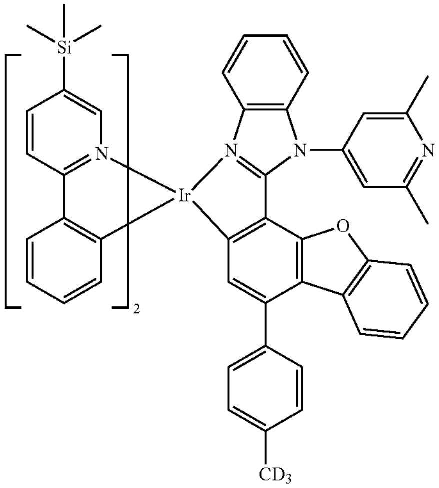
2099
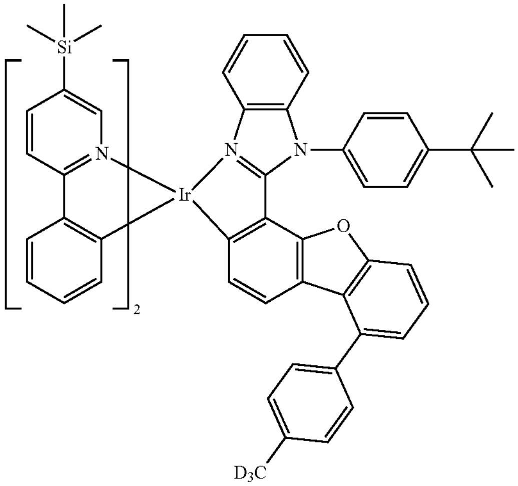
2100
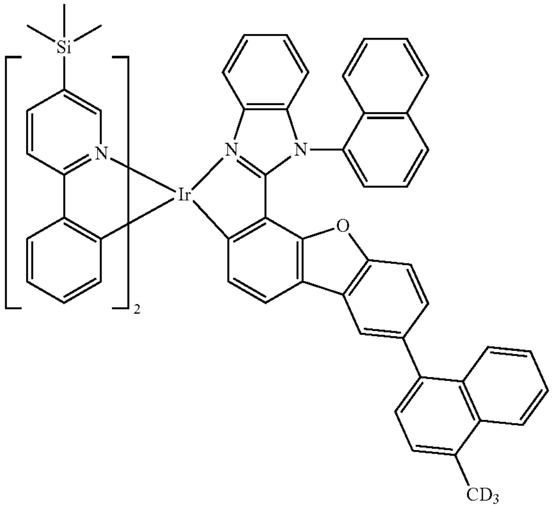
2101
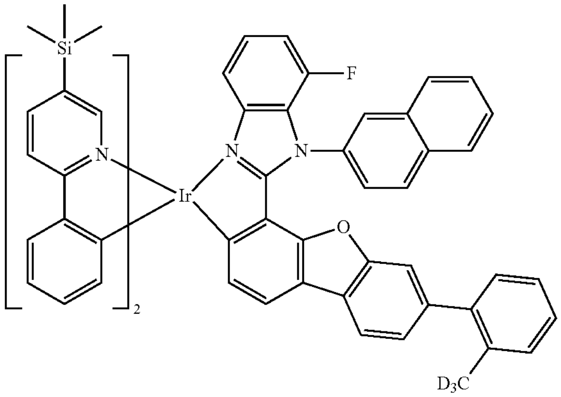
2102
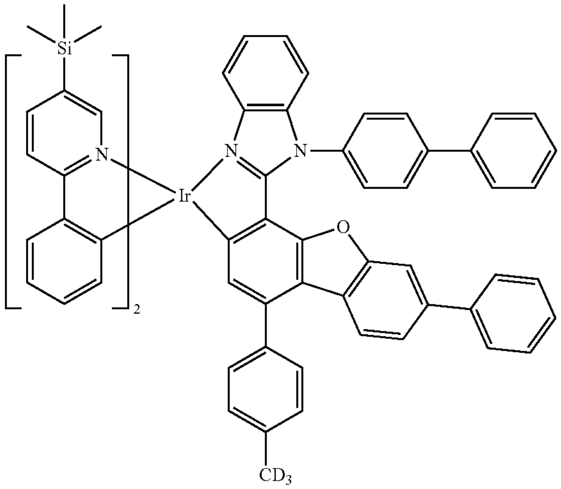

-continued
2103
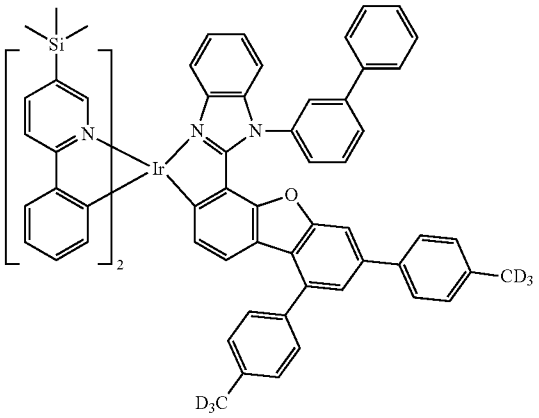
2104
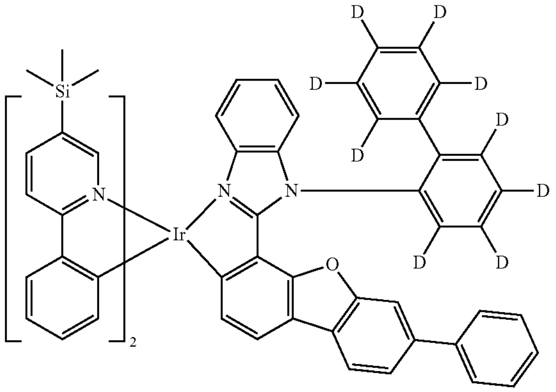
2105
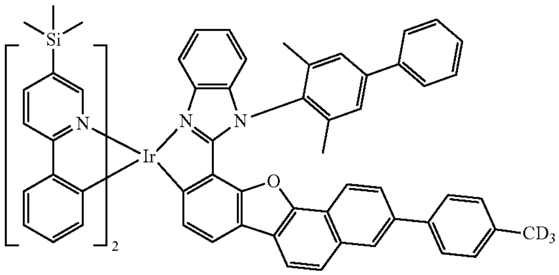
2106
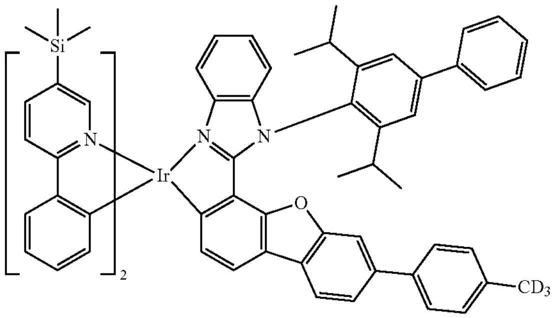
2107
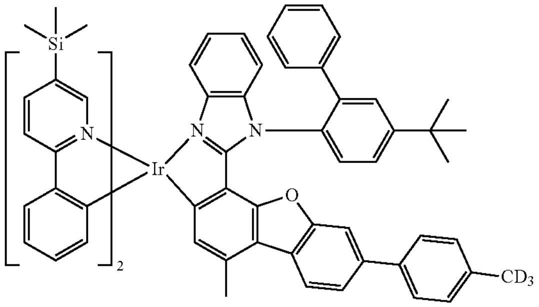
2108
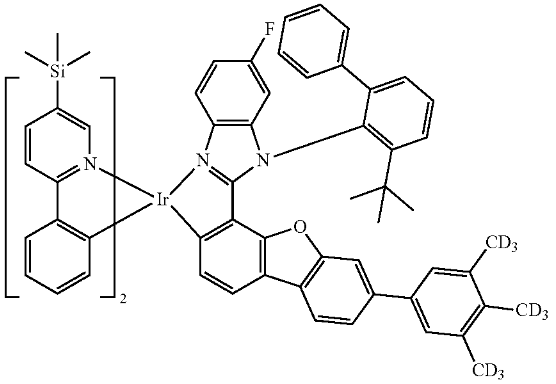
2109
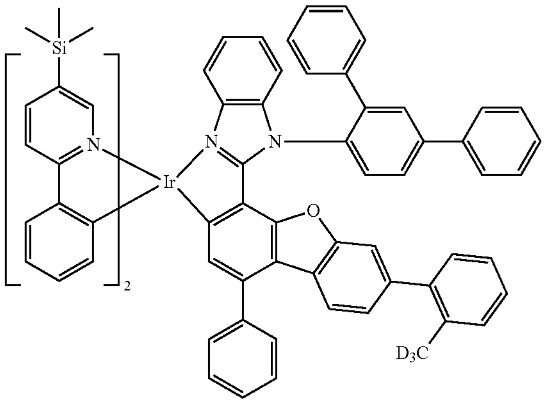
2110
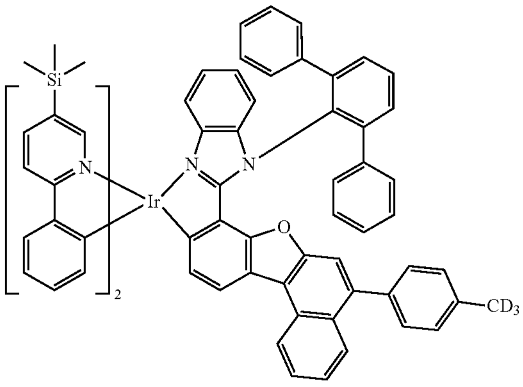

-continued
2111
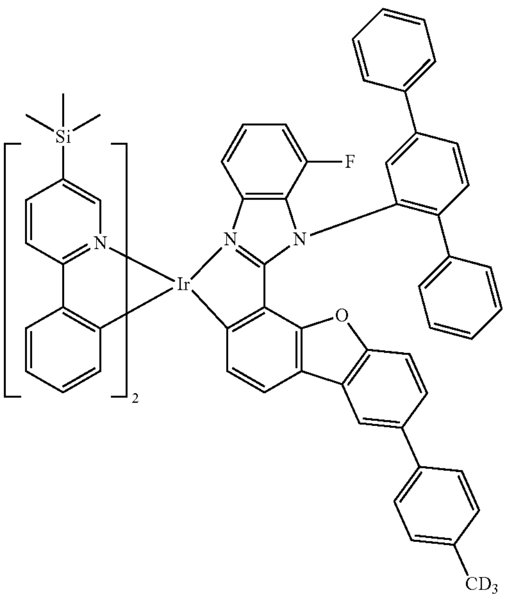
2112
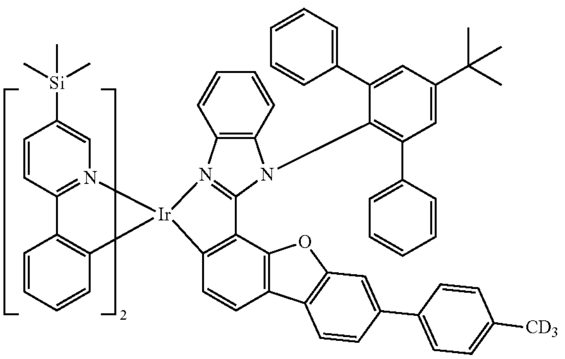
2113
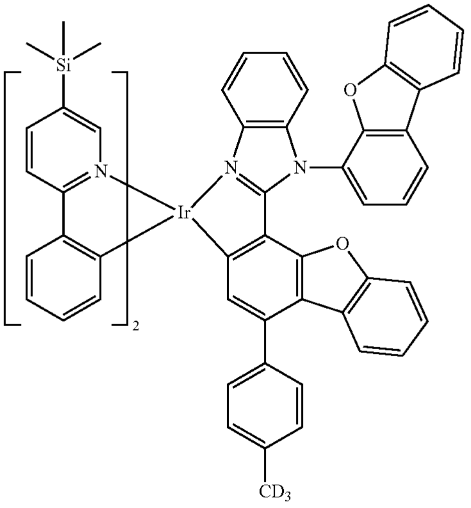
2114
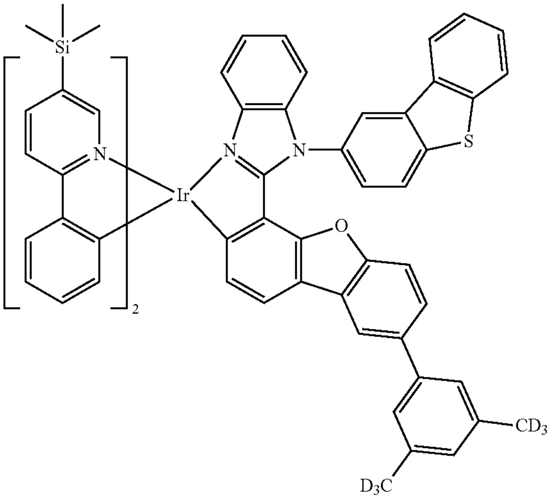
2115
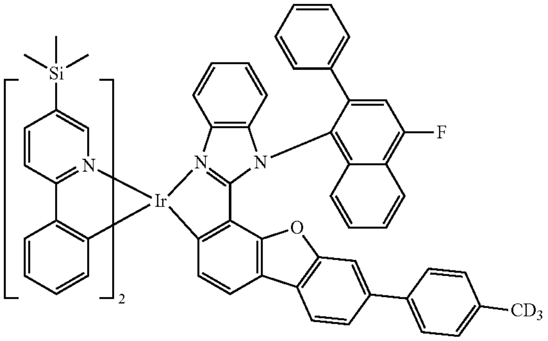
2116
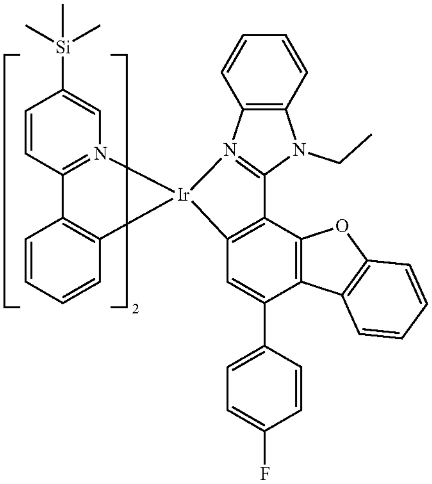

-continued
2117
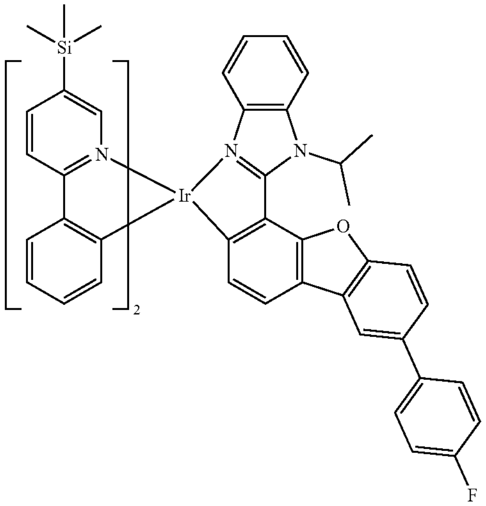
2118
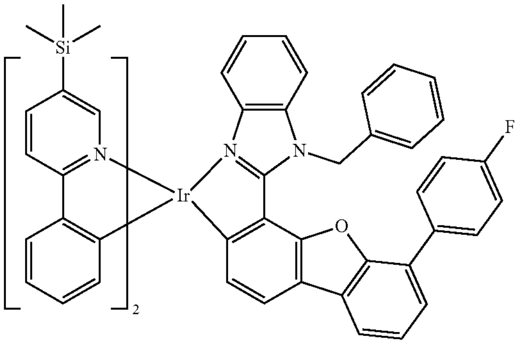
2119
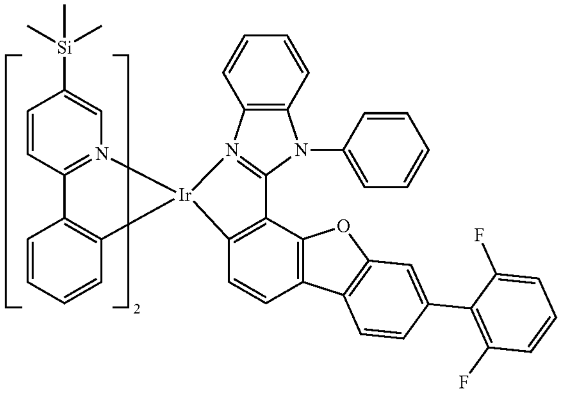
2120
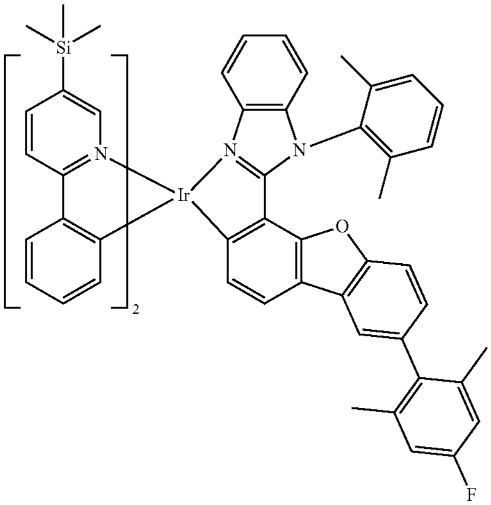
2121
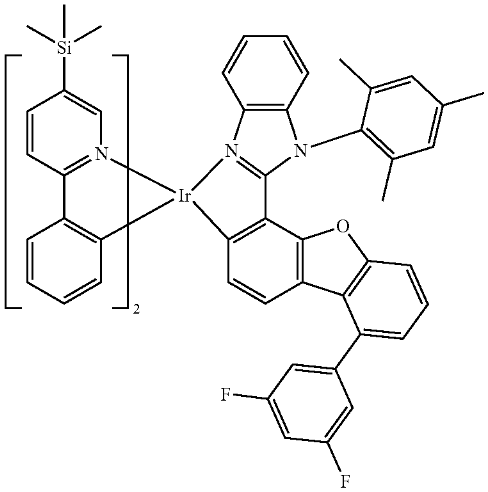
2122
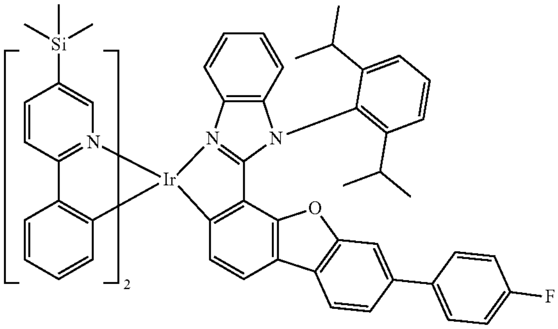

-continued
2123
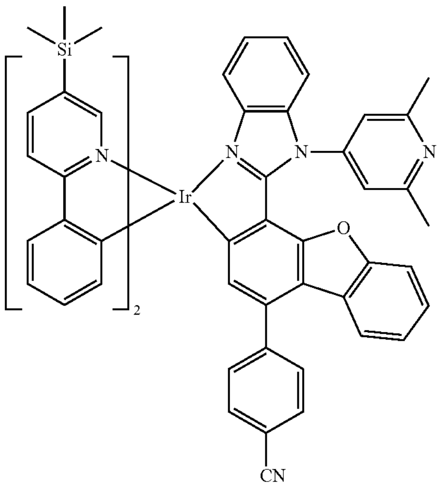
2124
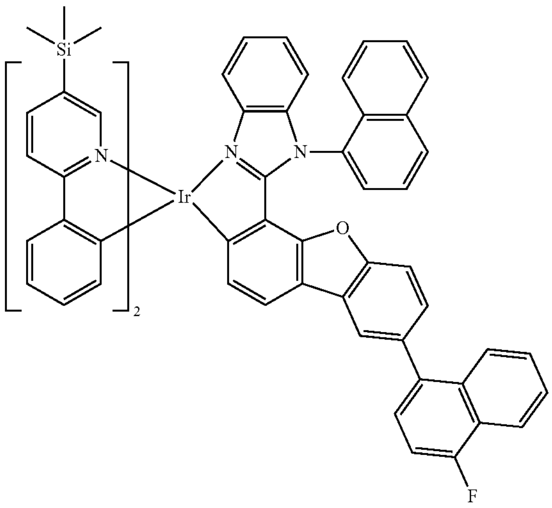
2126
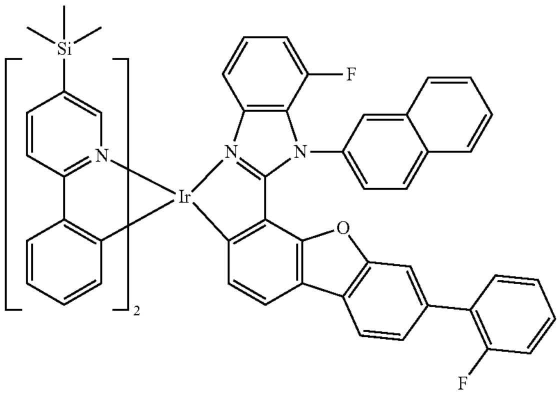
2127
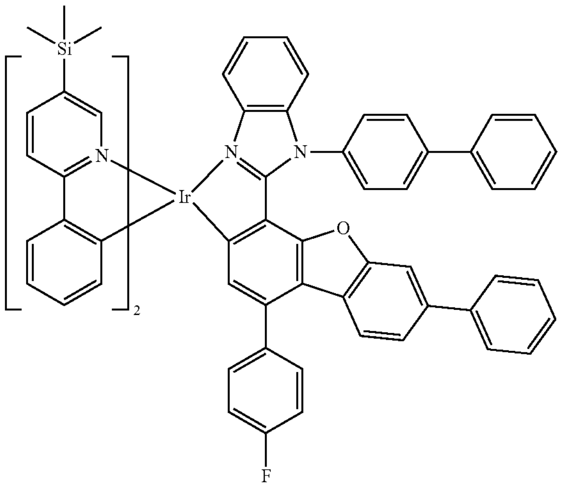
2128
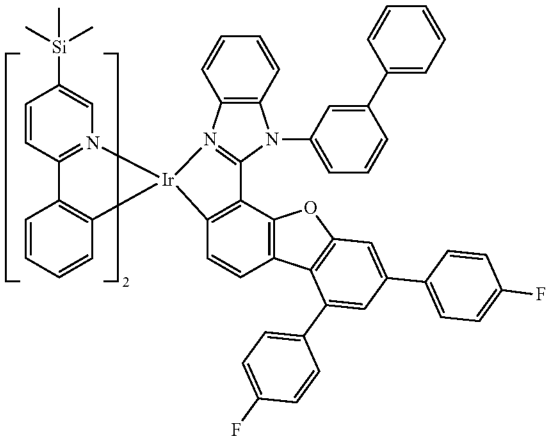
2129
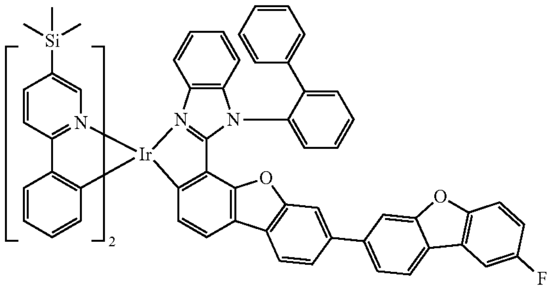

-continued
2130
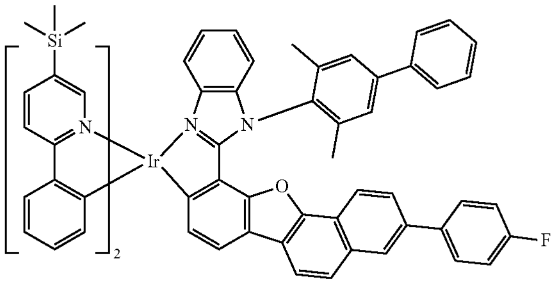
2131
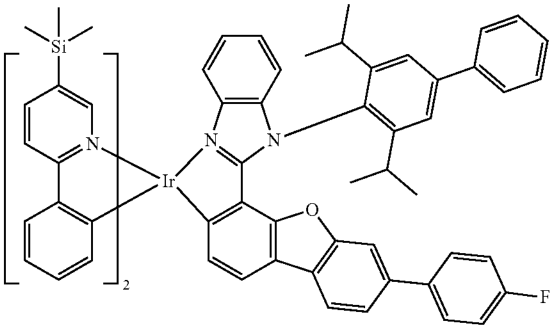
2132
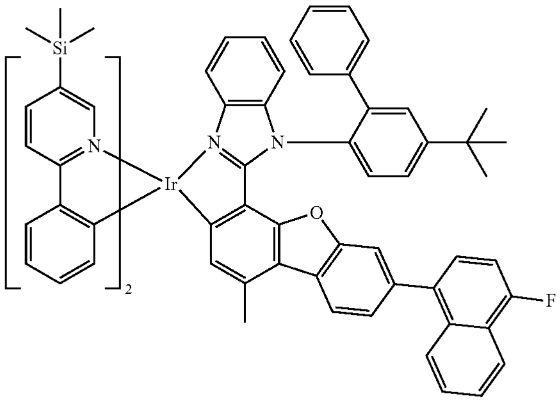
2133
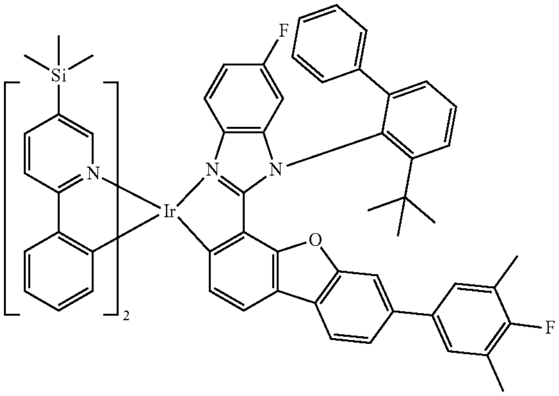
2134
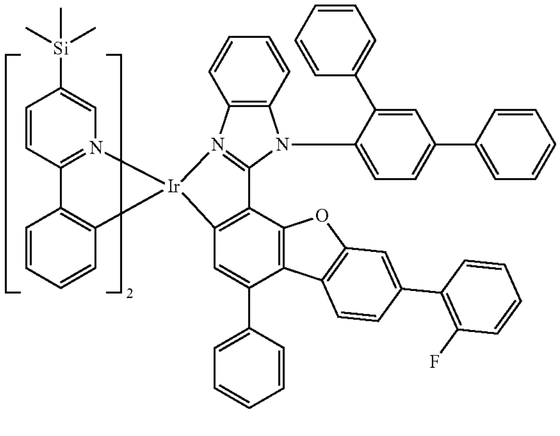
2135
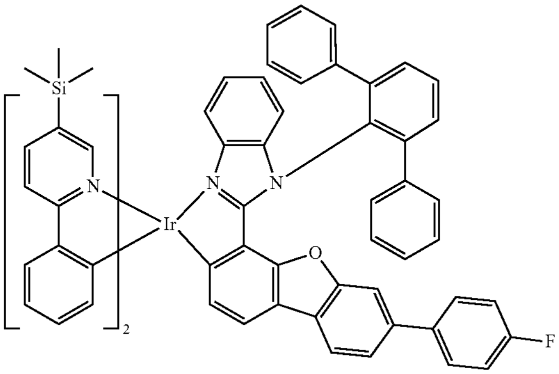

-continued
2136
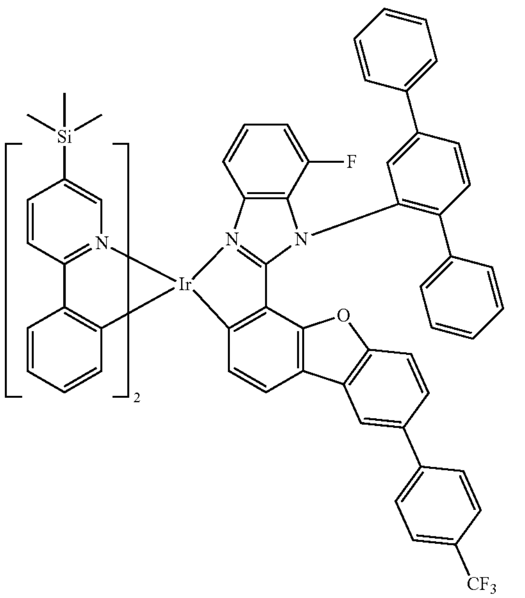
2137
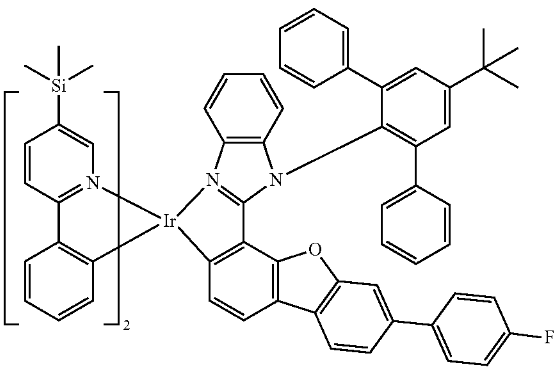
2138
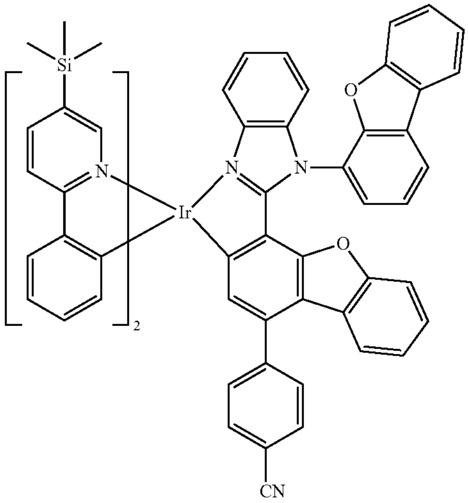
2139
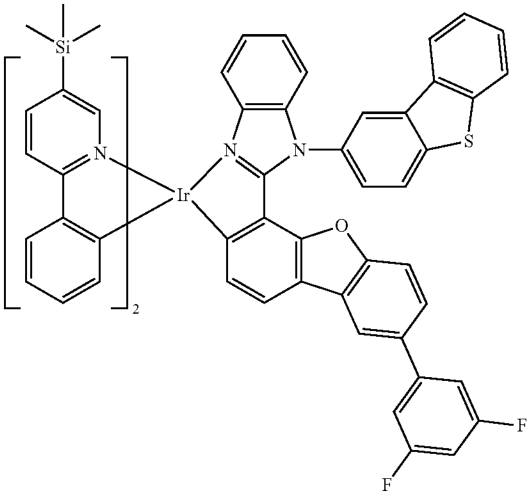
2140
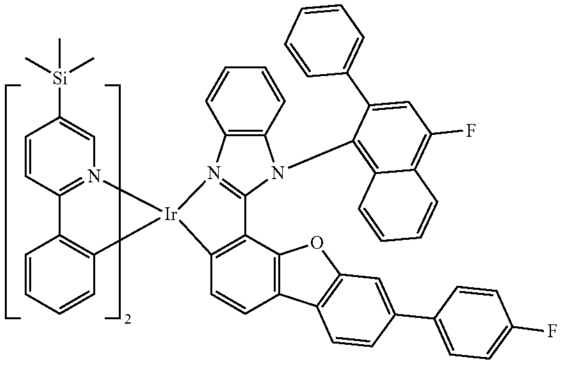
2141
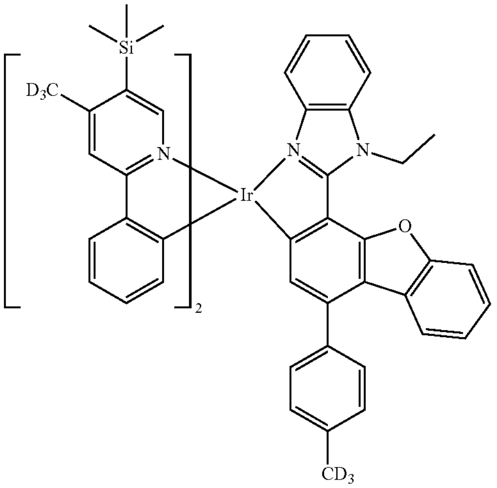

-continued
2142
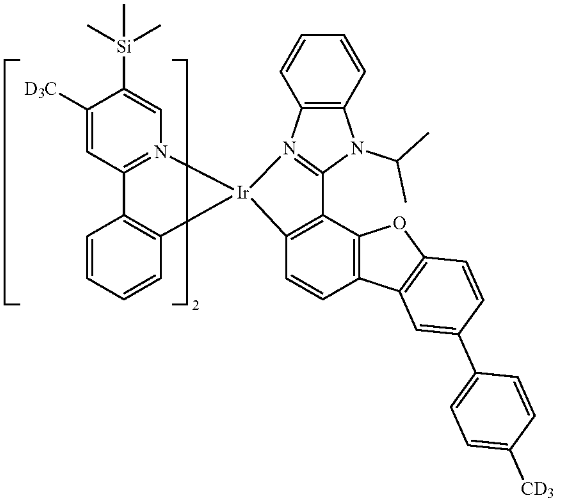
2143
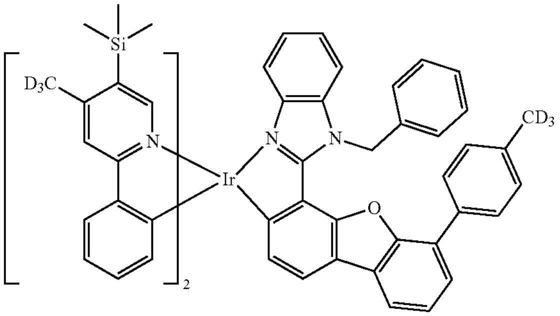
2144
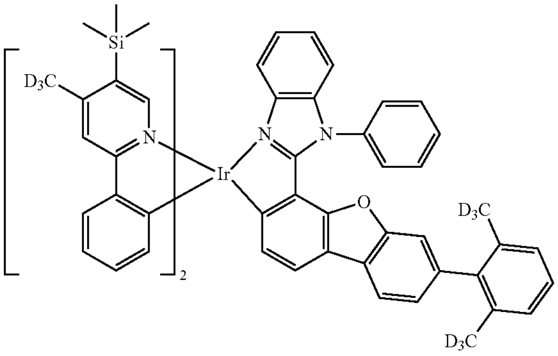
2145
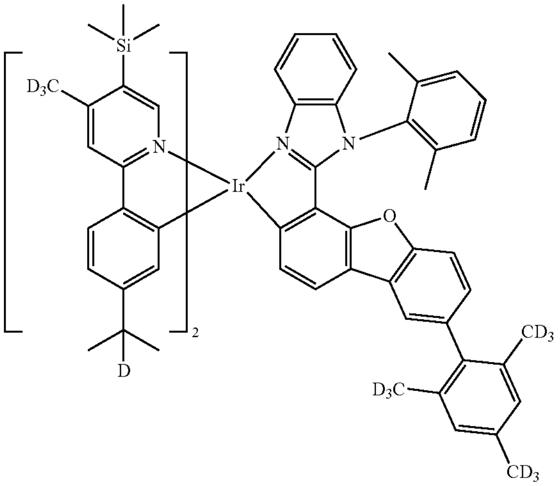
2146
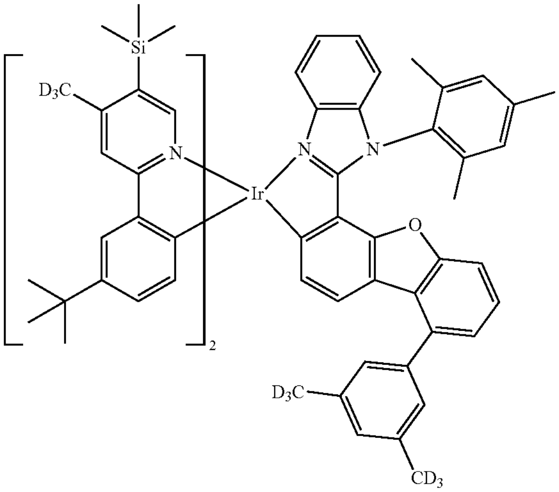
2147
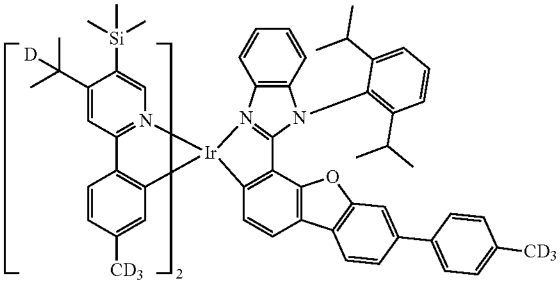

-continued
2148
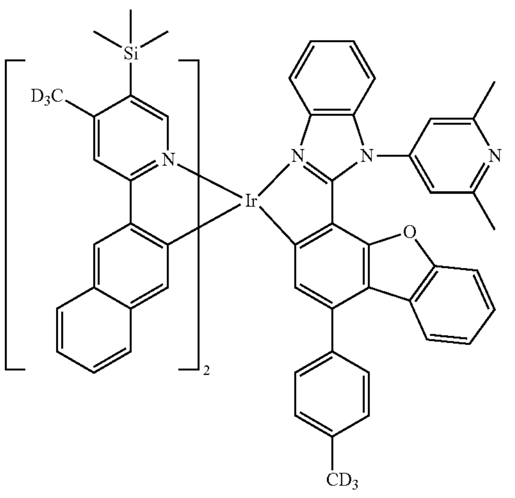
2149
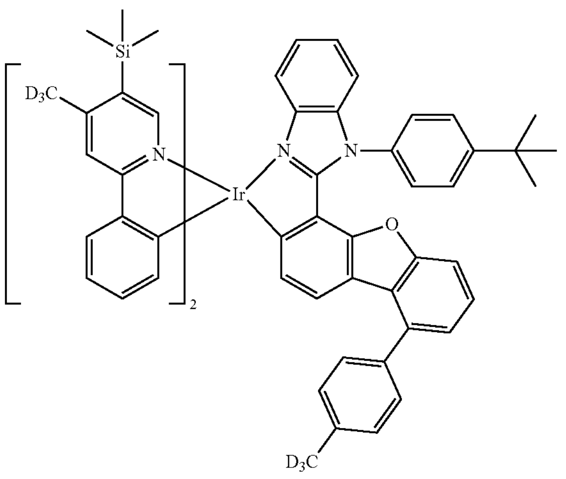
2150
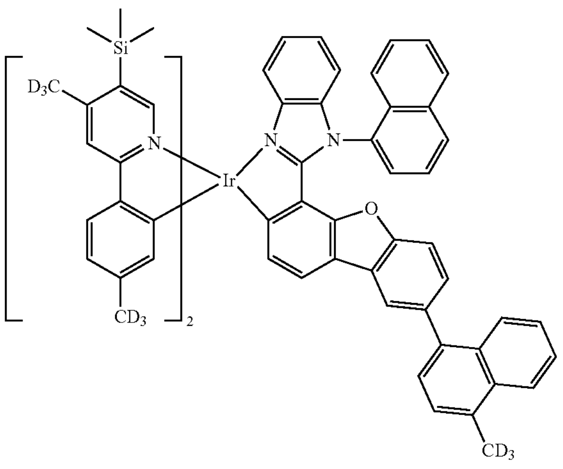
2151
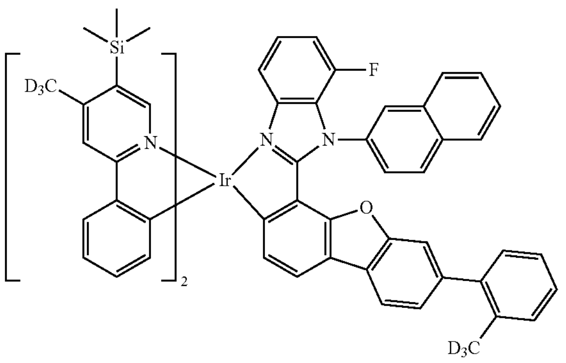
2152
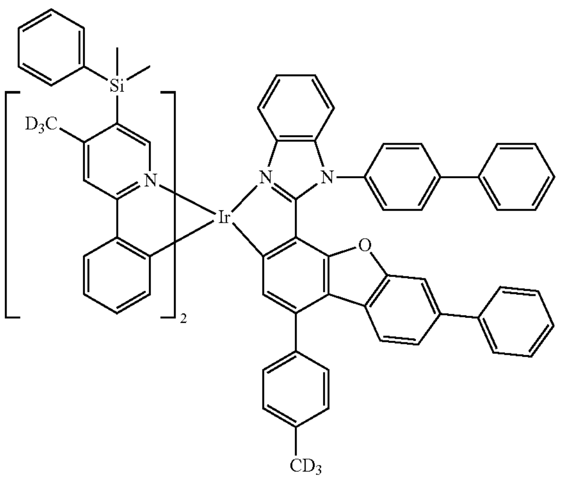
2153
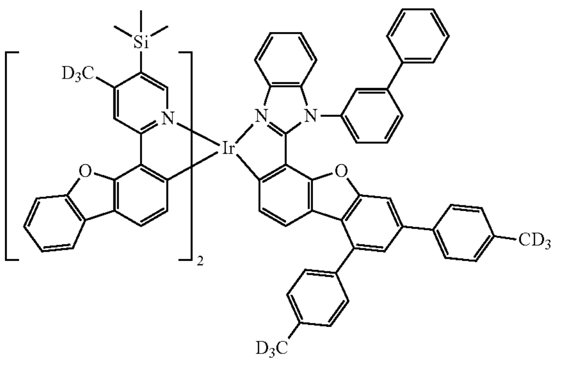

-continued
2154
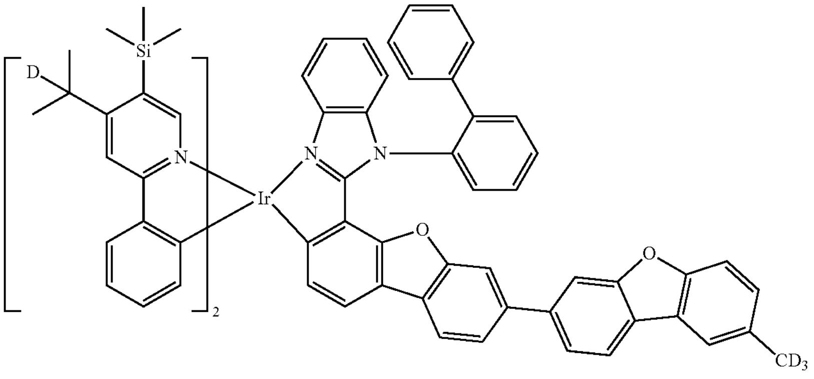
2155
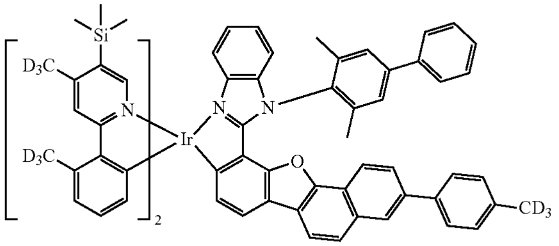
2156
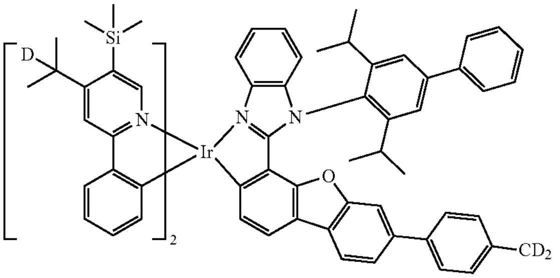
2157
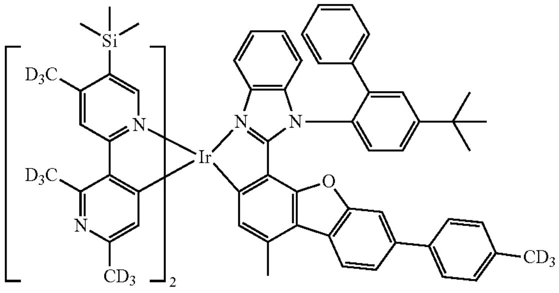
2158
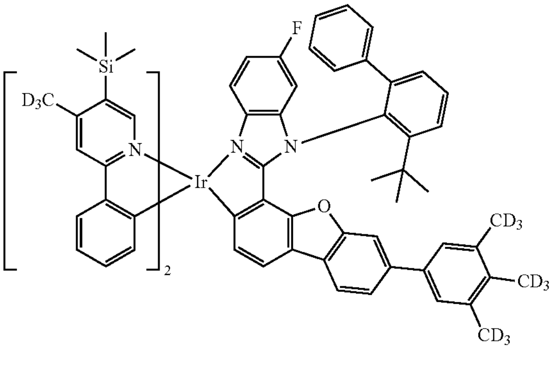
2159
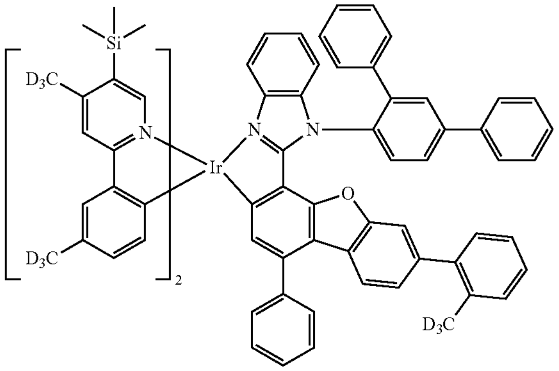
2160
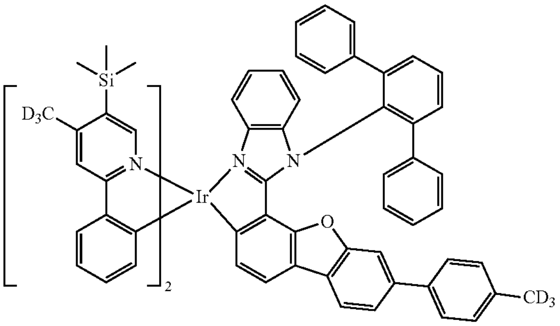

-continued
2161
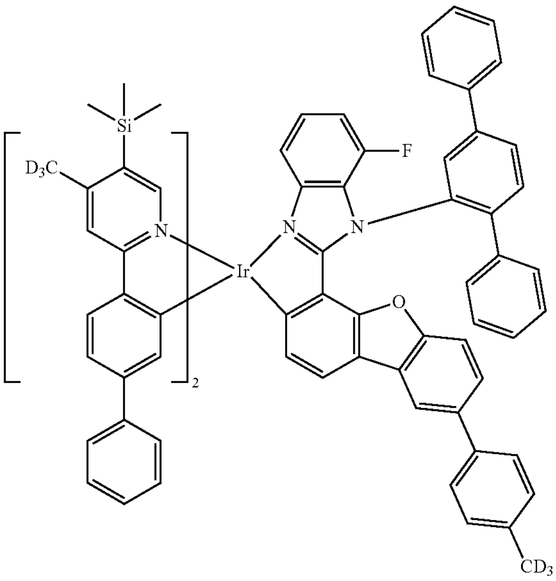
2162
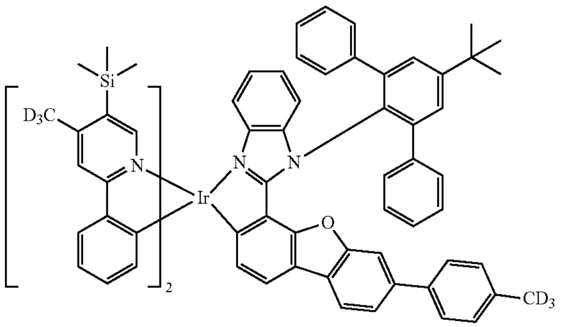
2163
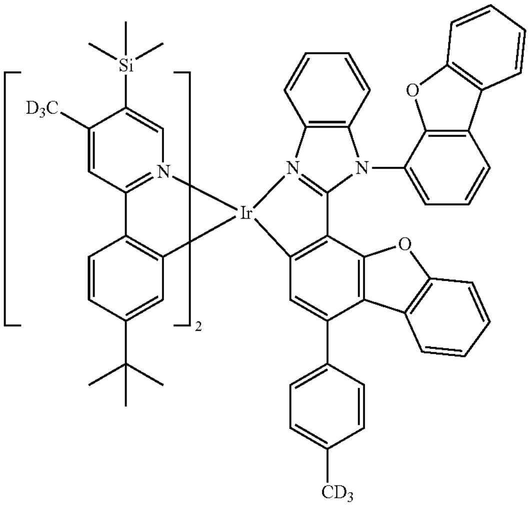
2164
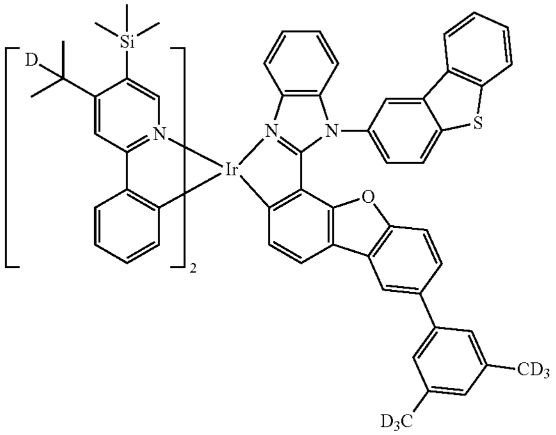
2165
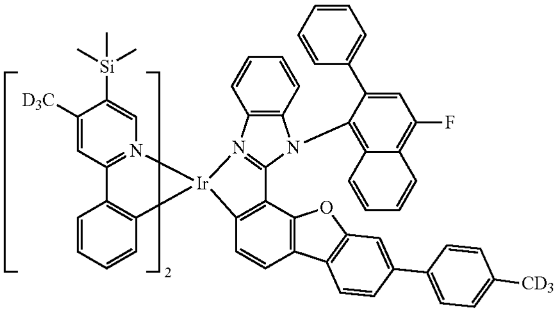
2166
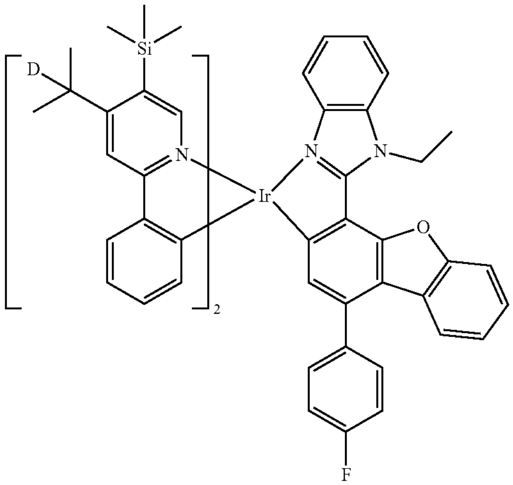

-continued
2167
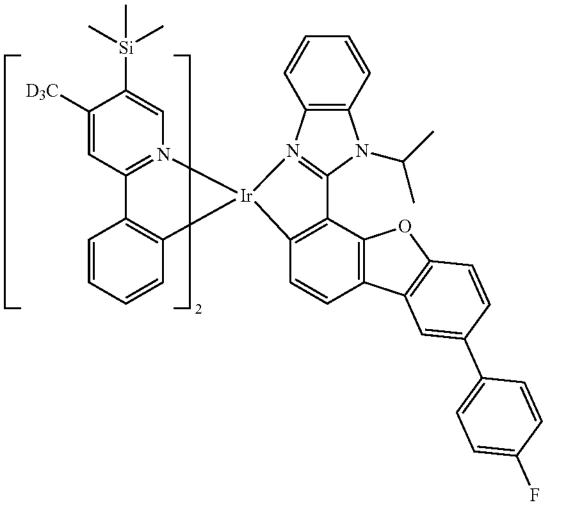
2168
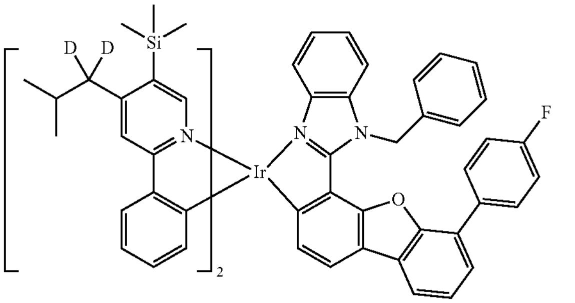
2169
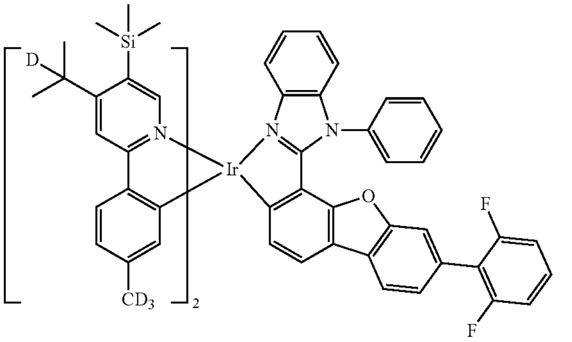
2170
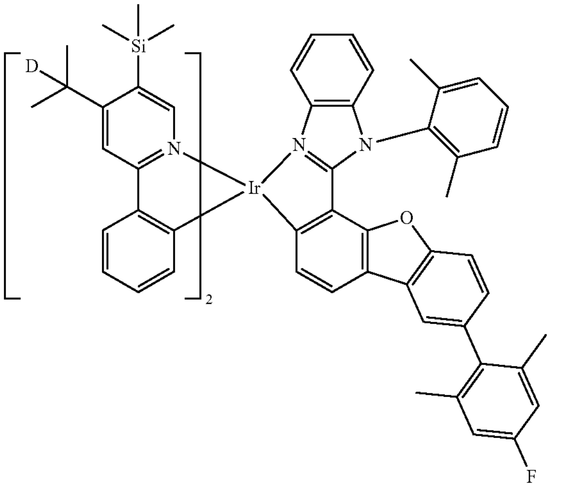
2171
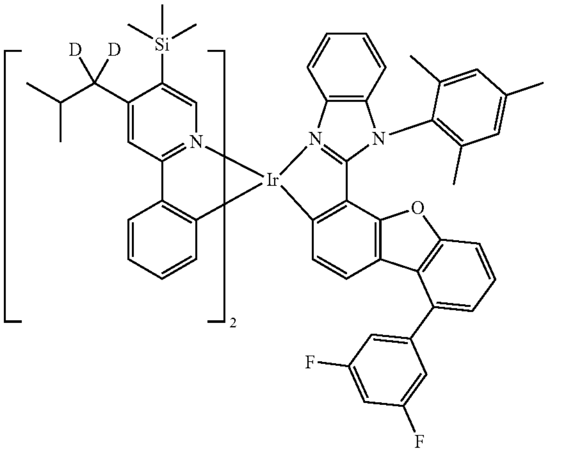
2172
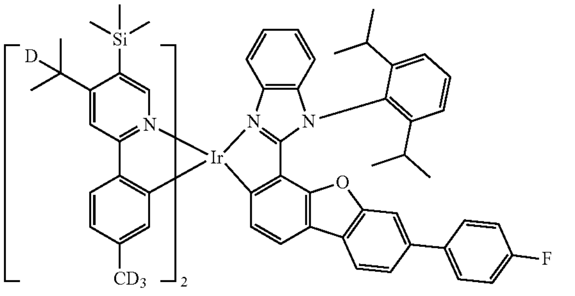

-continued
2173
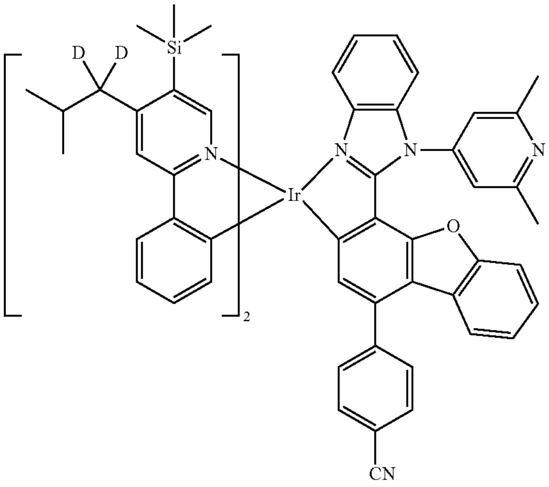
2174
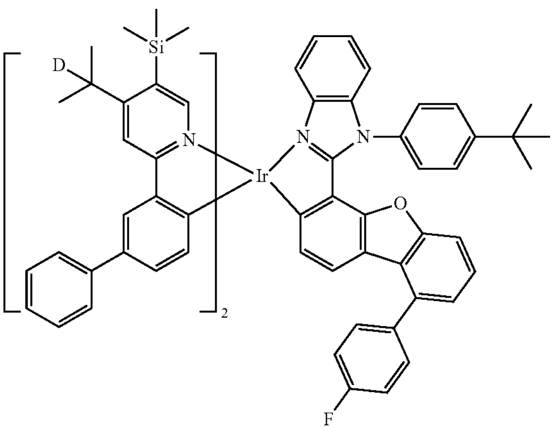
2175
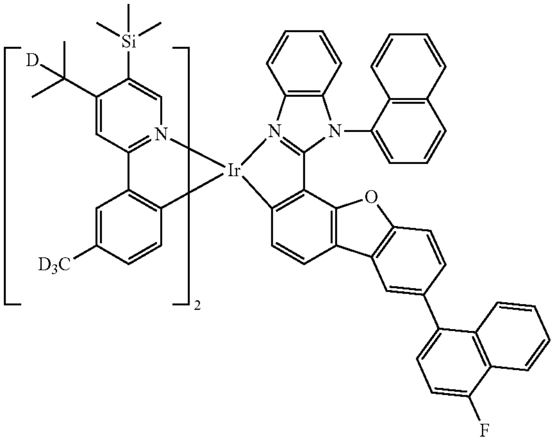
2176
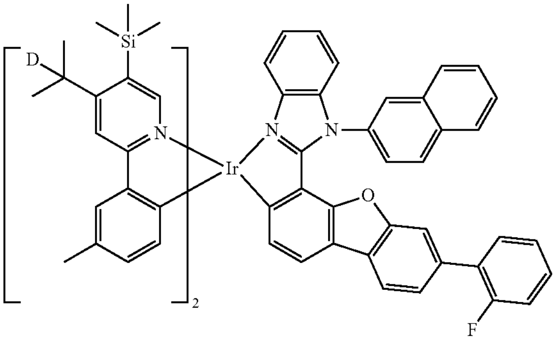
2177
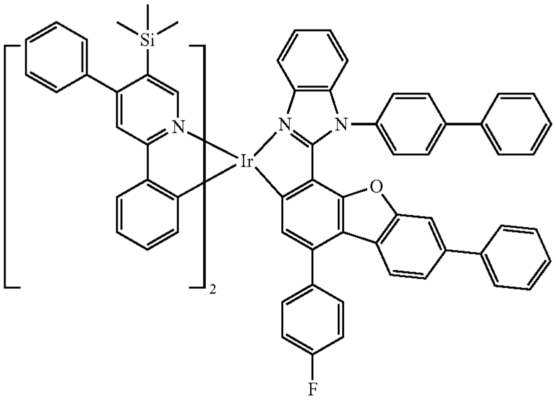
2178
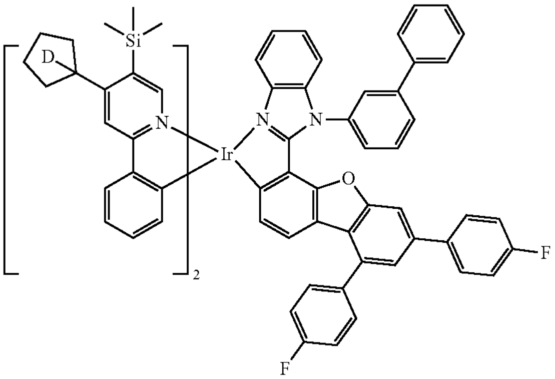

-continued
2179
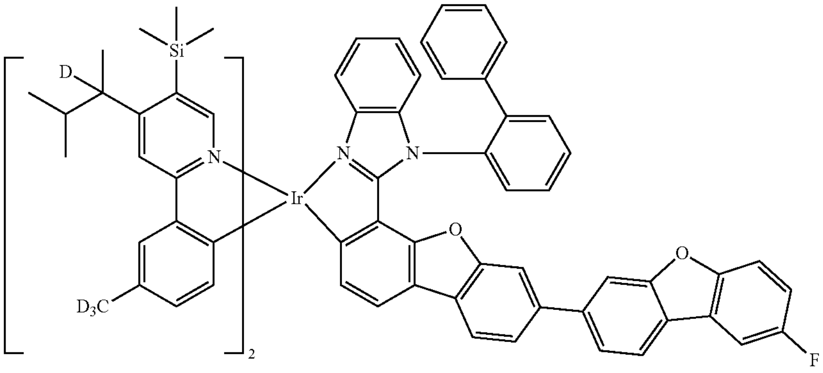
2180
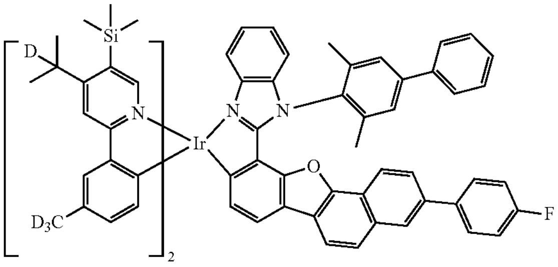
2181
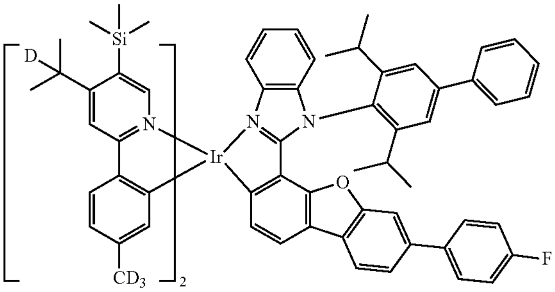
2182
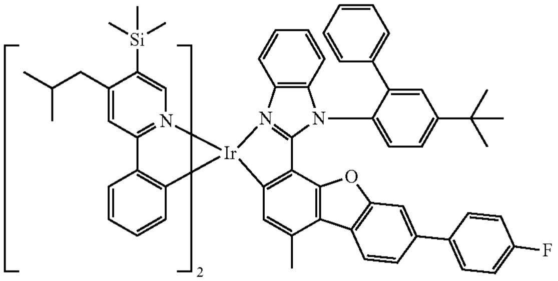
2183
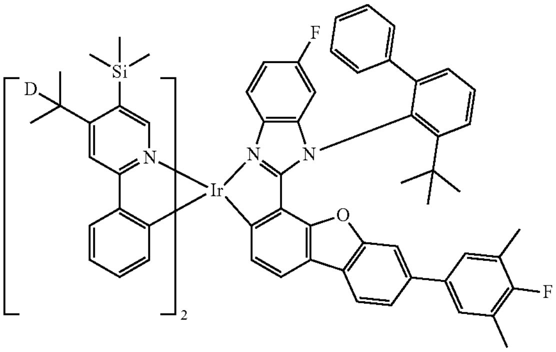
2184
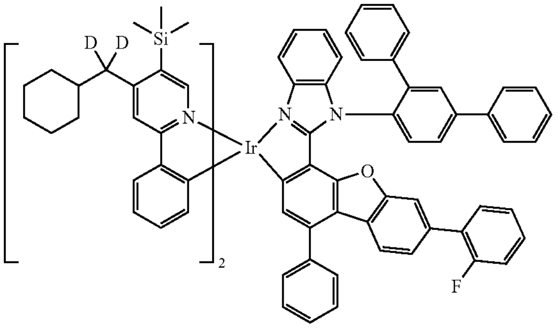
2185
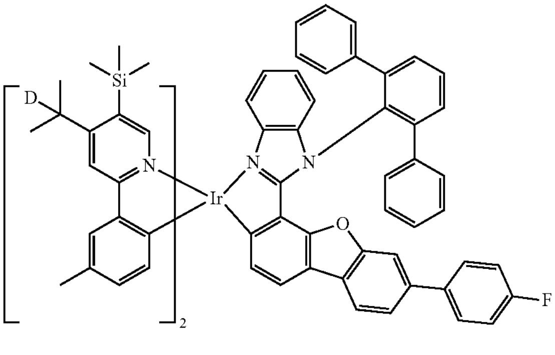

-continued
2186
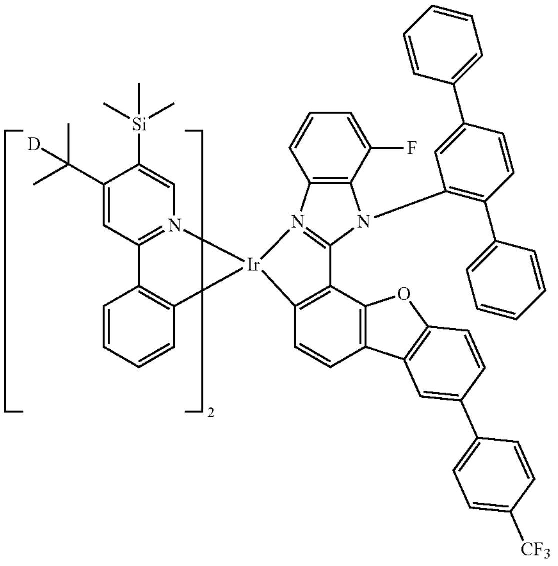
2187
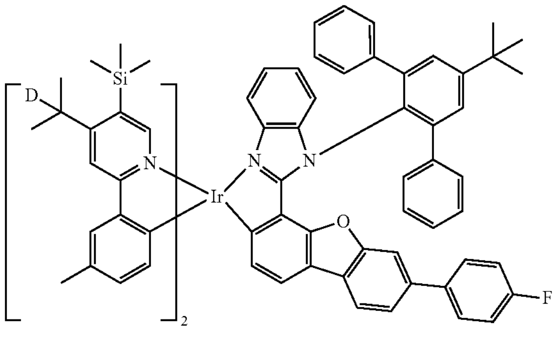
2188
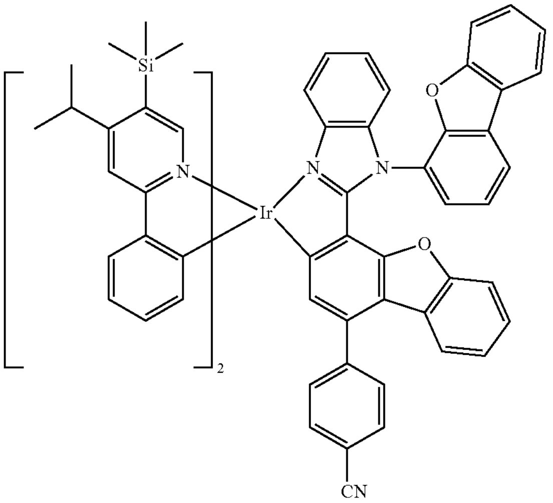
2189
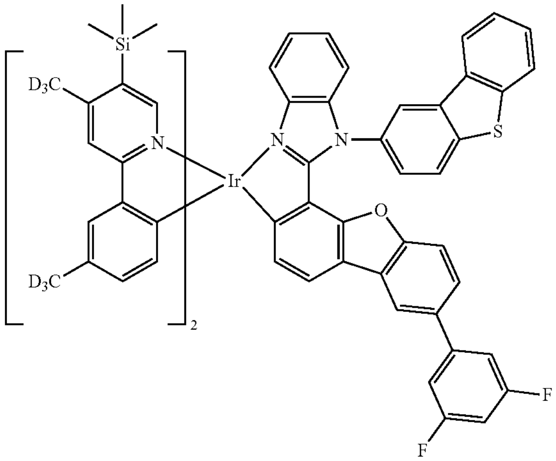
2190
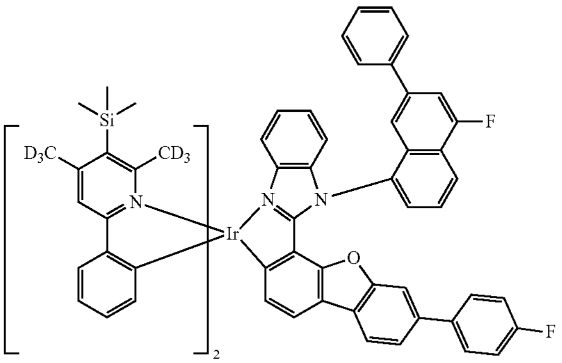
2191
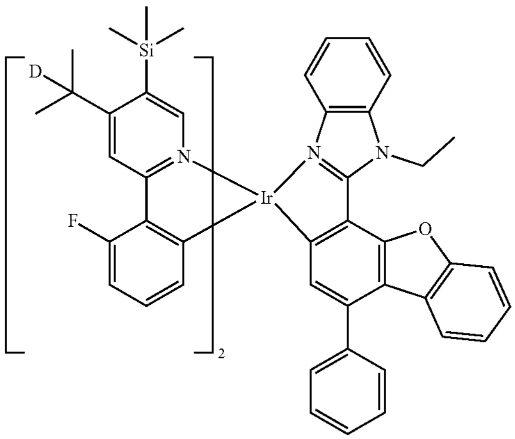

-continued
2192
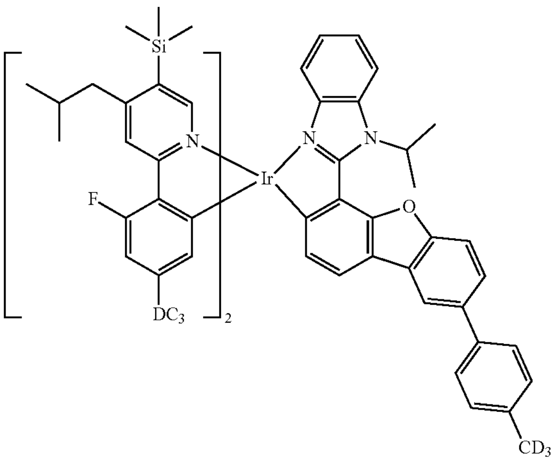
2193
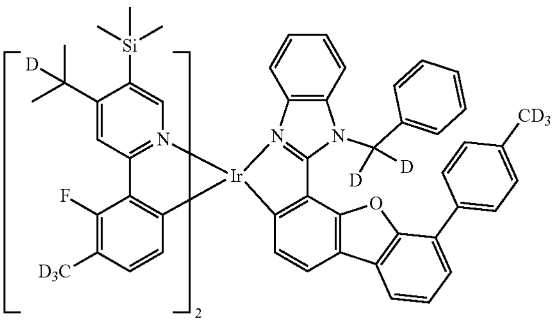
2194
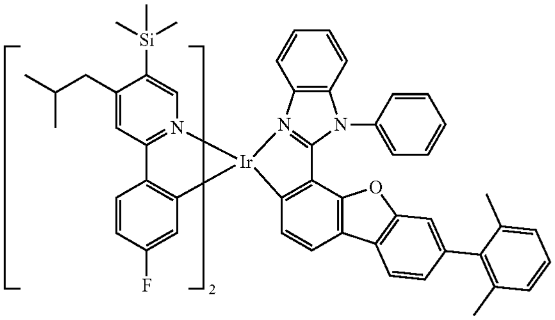
2195
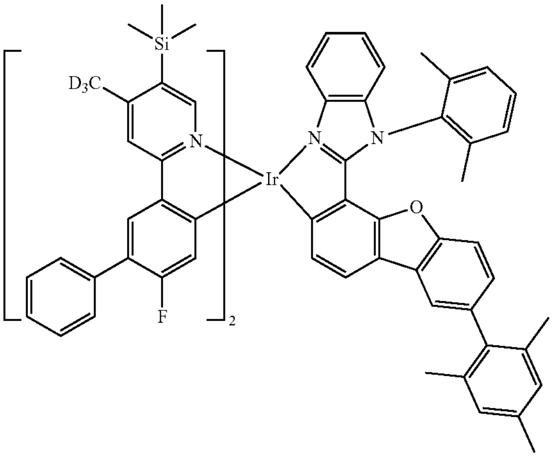
2196
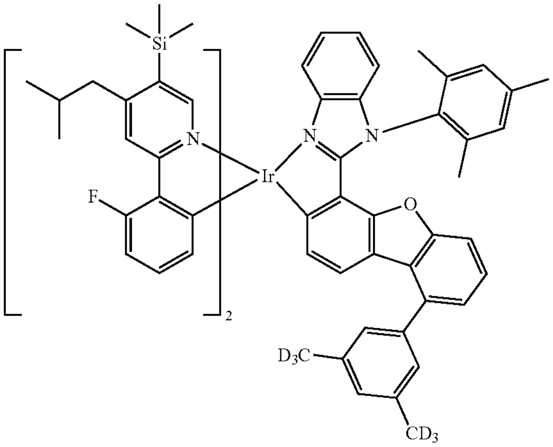
2197
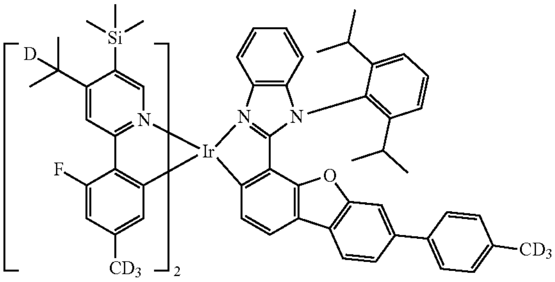

-continued
2198
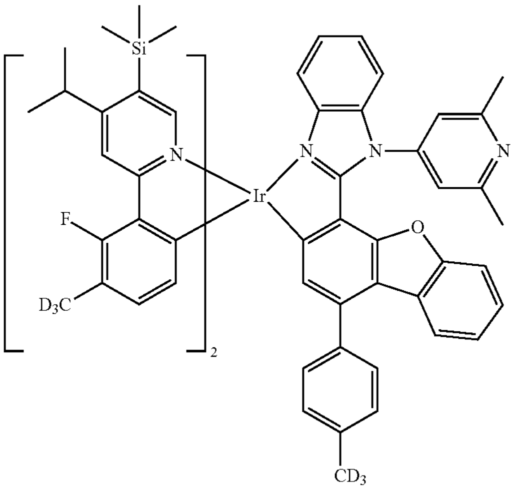
2199
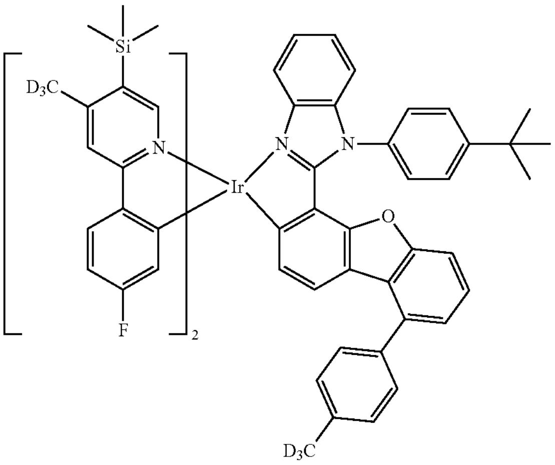
2200
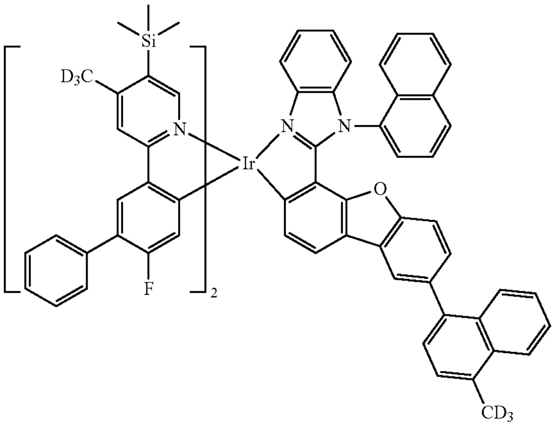
2201
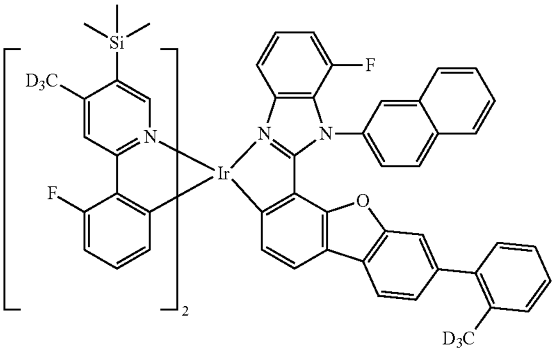
2202
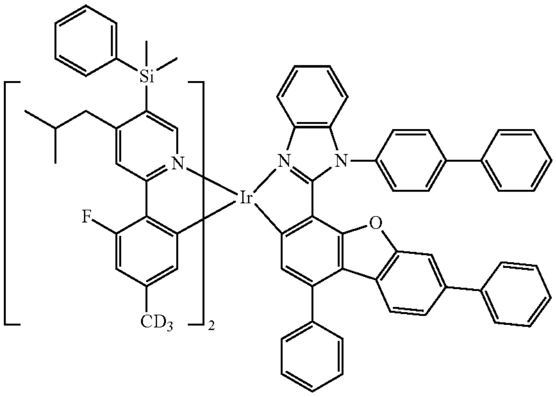
2203
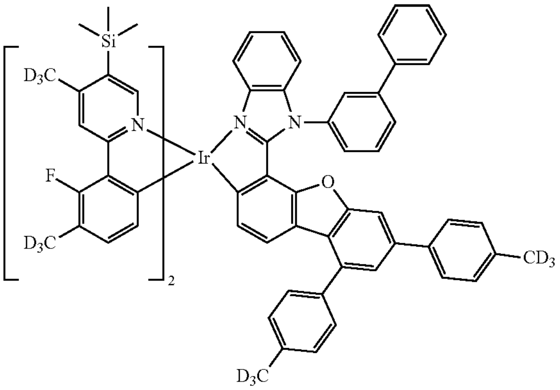

-continued
2204
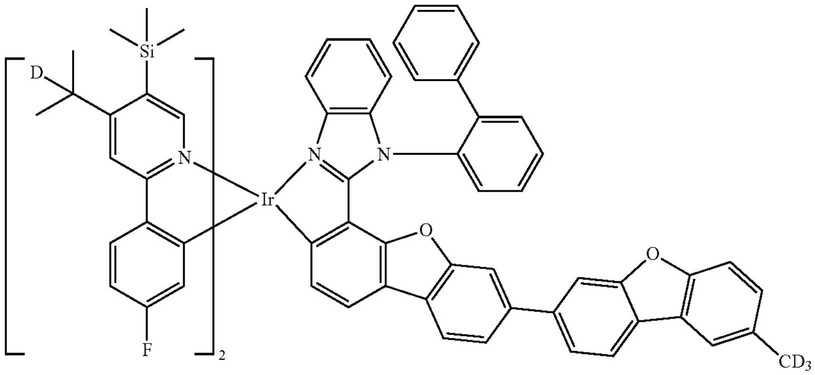
2205
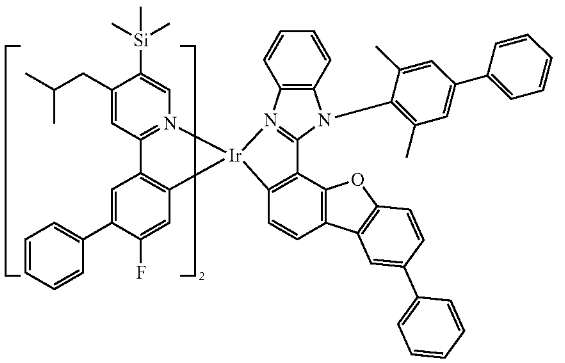
2206
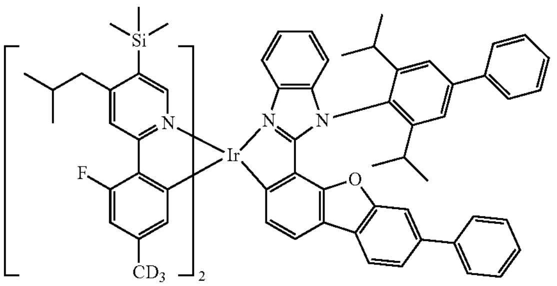
2207
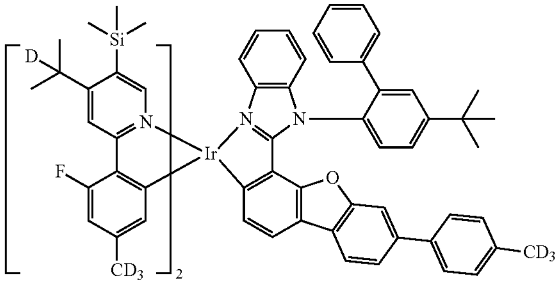
2208
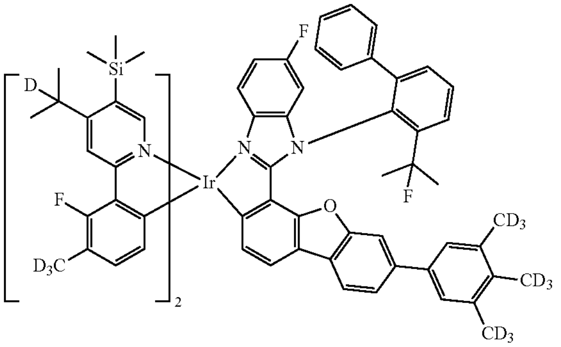
2209
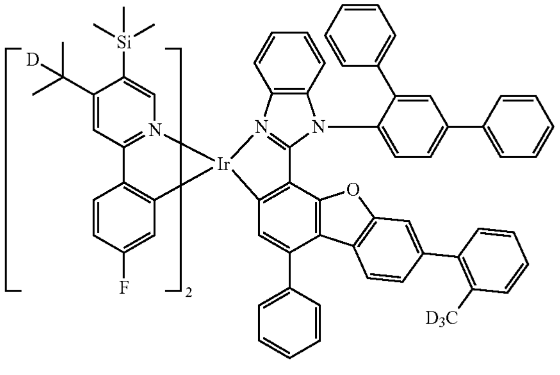
2210
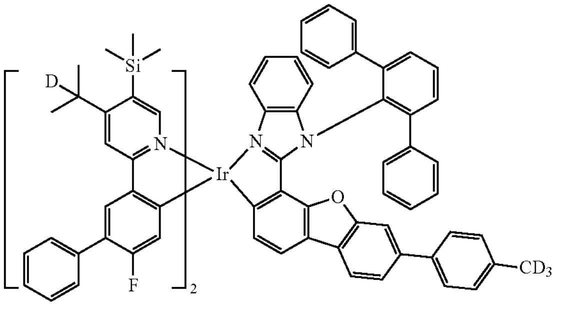

-continued
2211
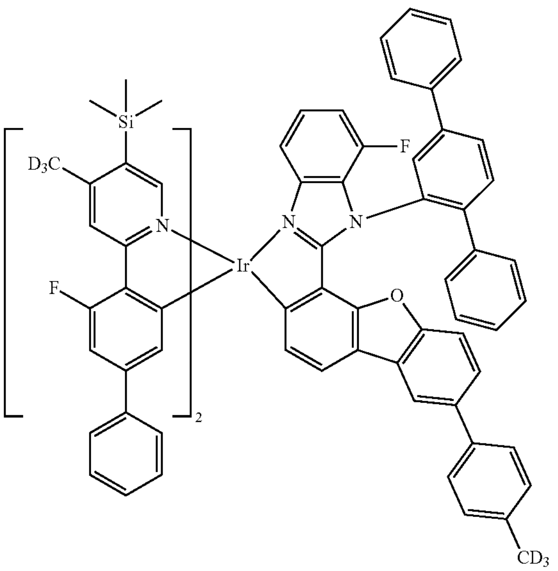
2212
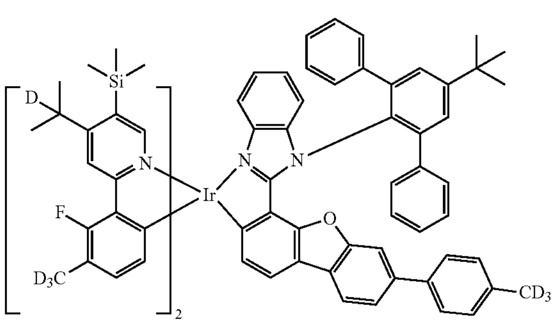
2213
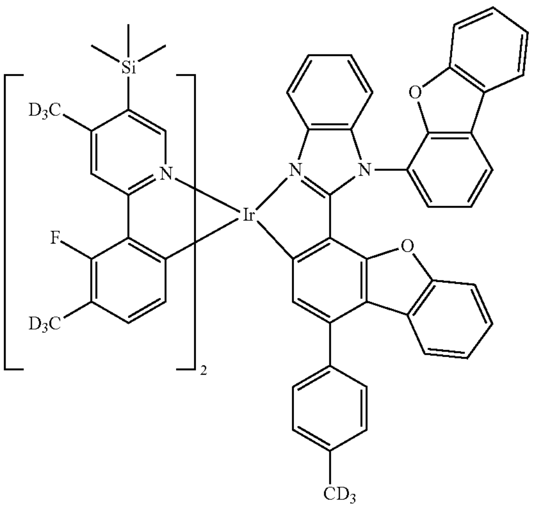
2214
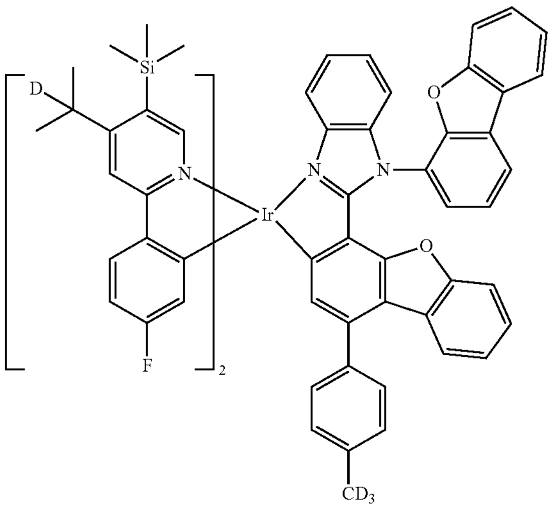
2215
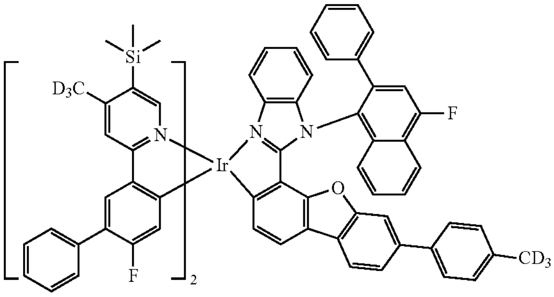

-continued
2216
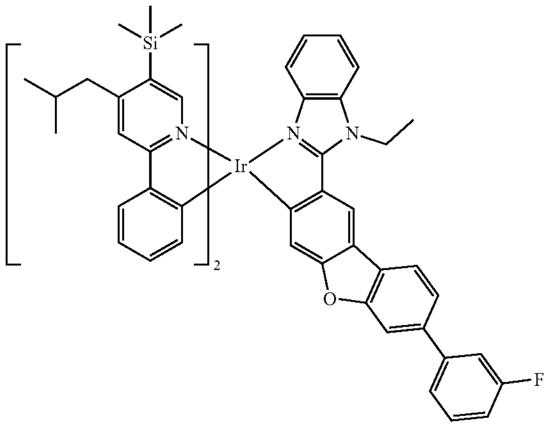
2217
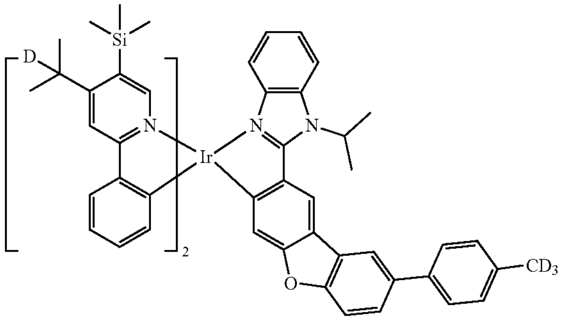
2218
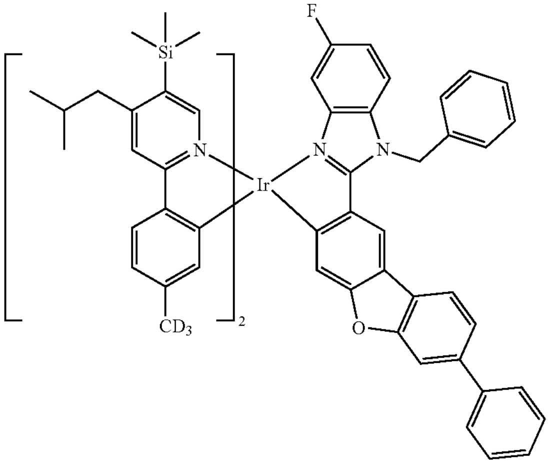
2219
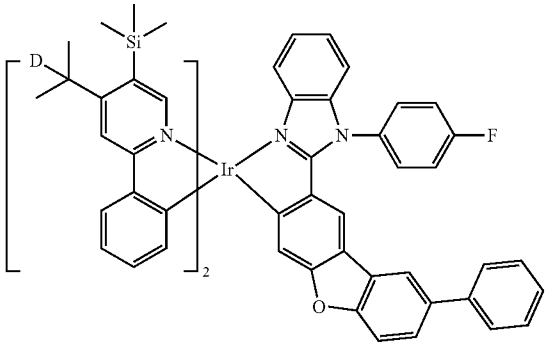
2220
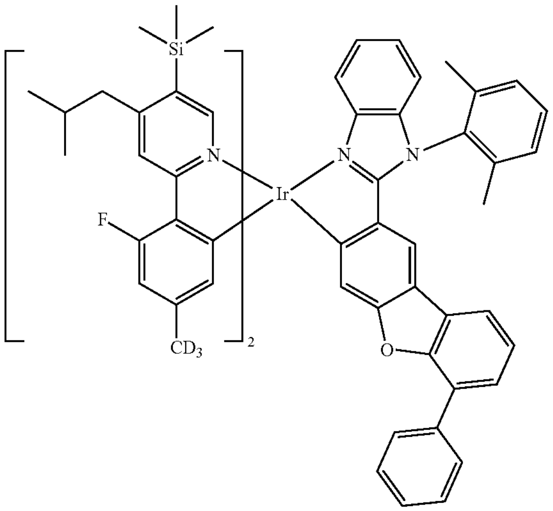
2221
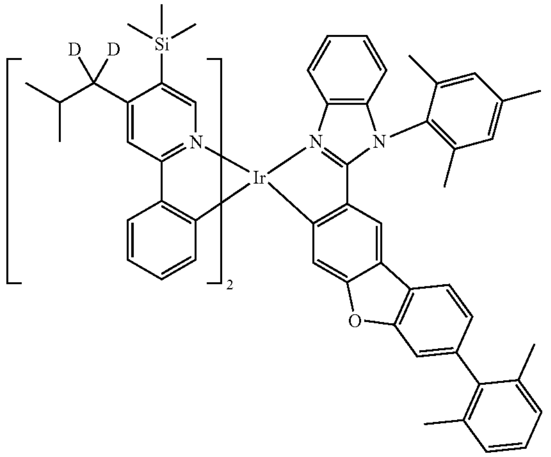
2222
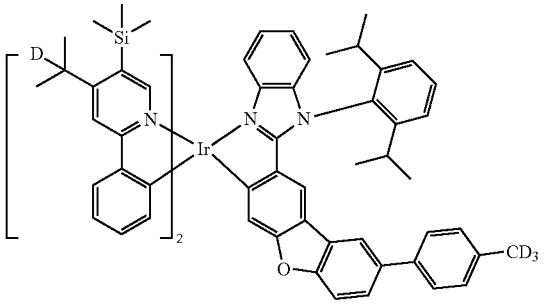

-continued
2223
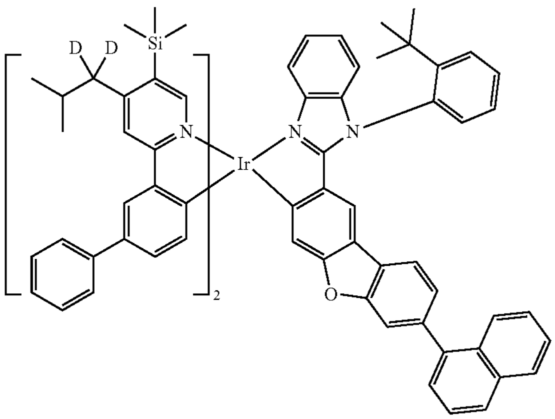
2224
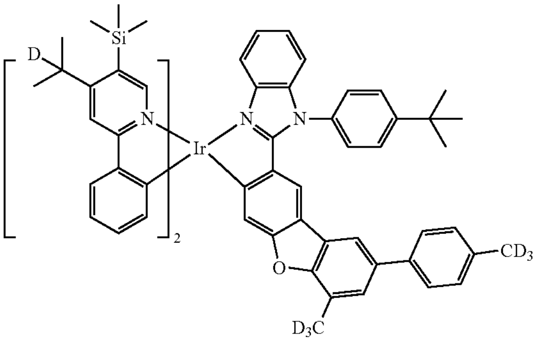
2225
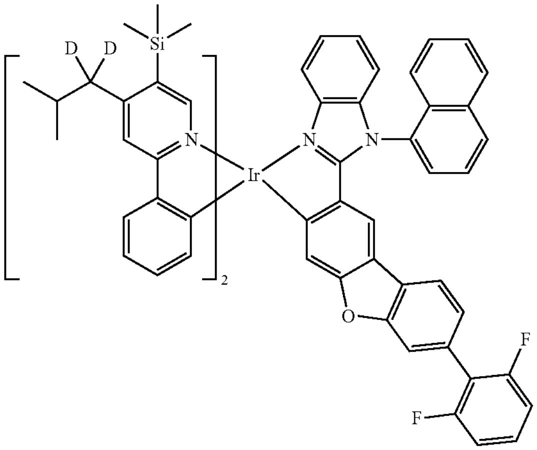
-continued
2226
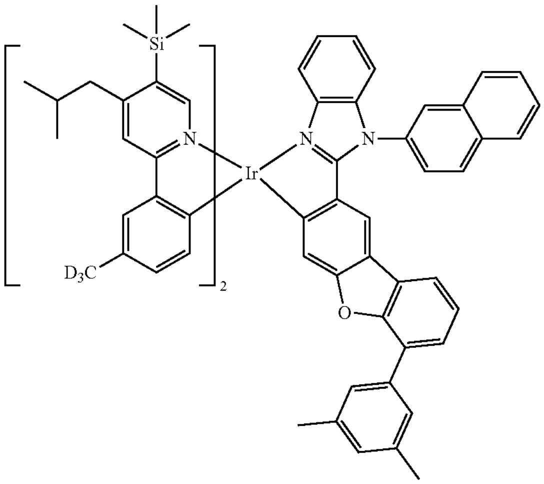
2227
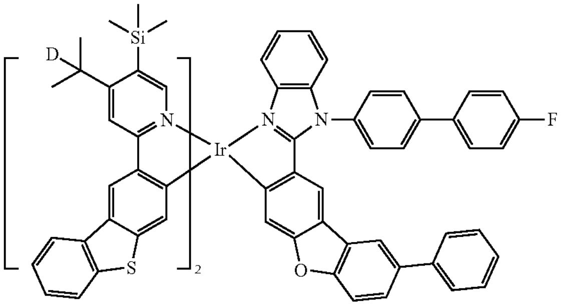
2228
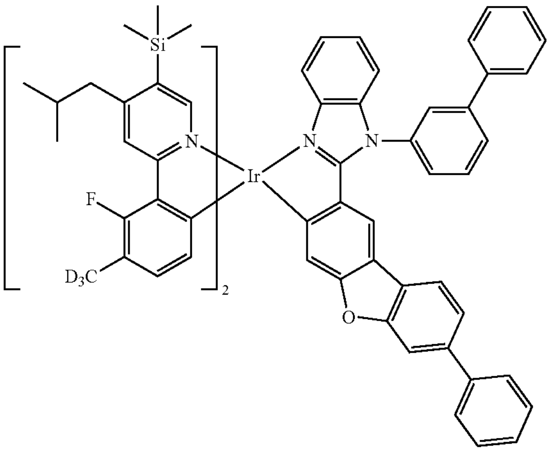
2229
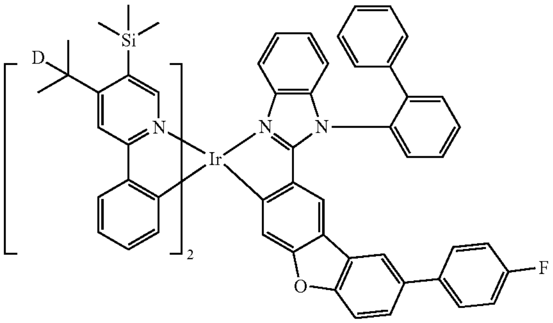

-continued
2230
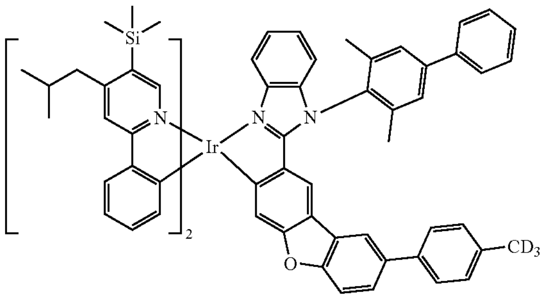
2231
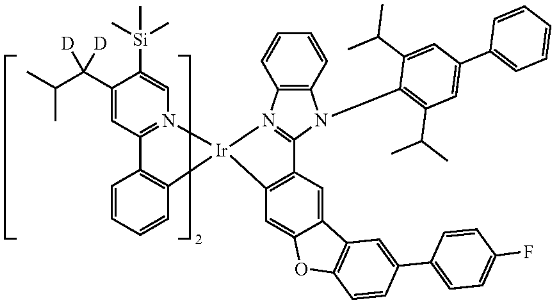
2232
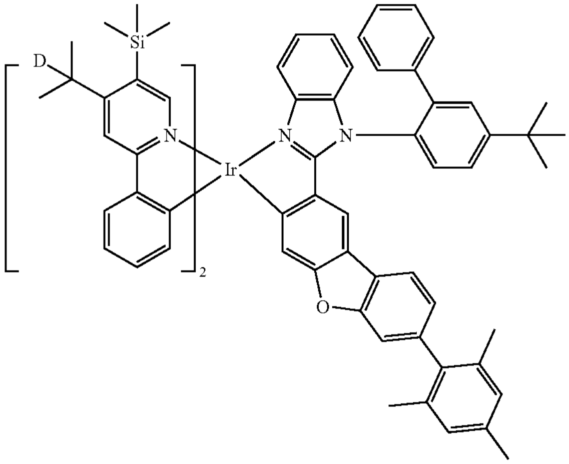
2233
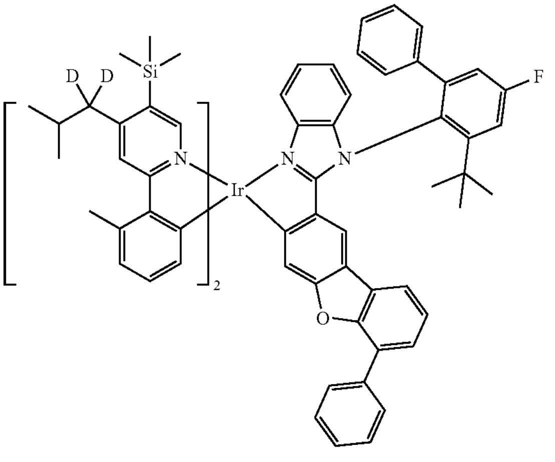
-continued
2234
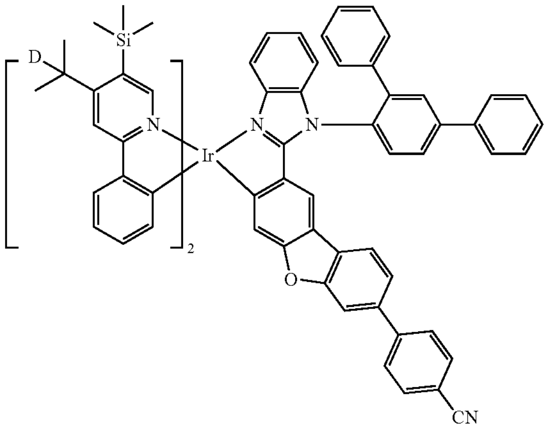
2235
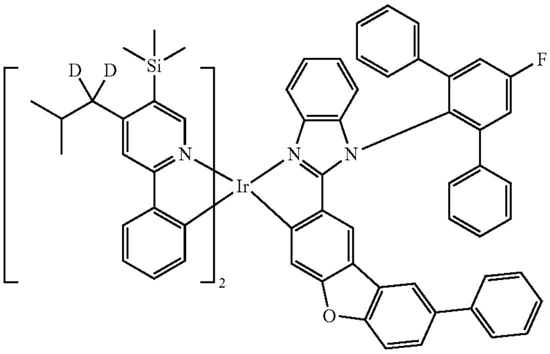
2236
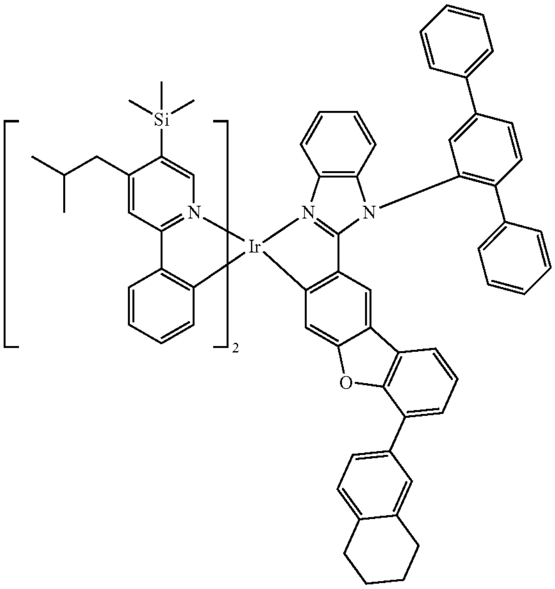

-continued
2237
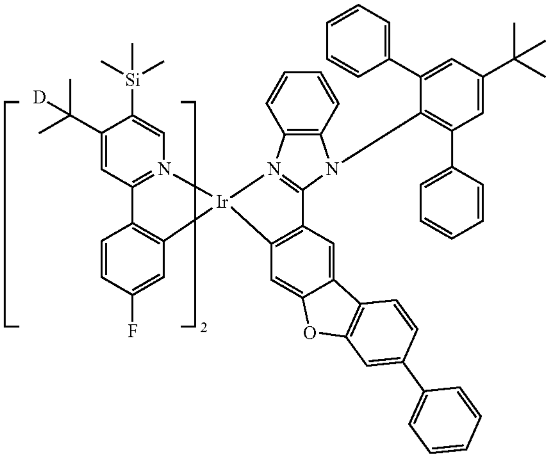
2238
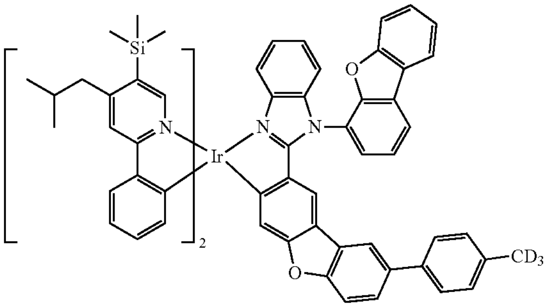
2239
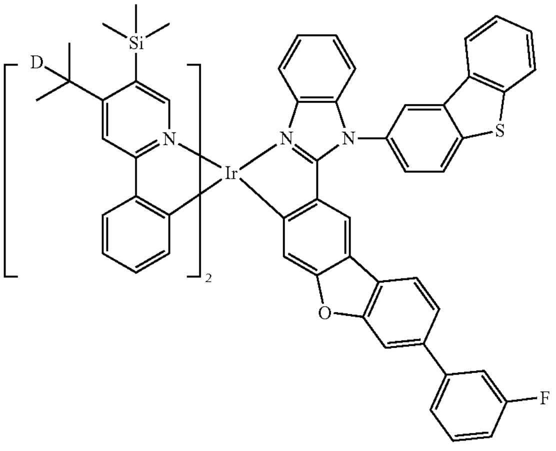
-continued
2240
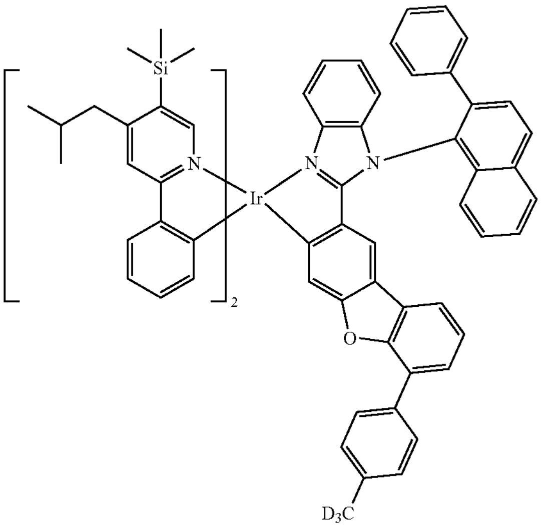
2241
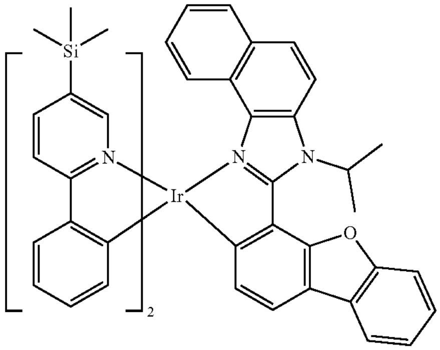
2242
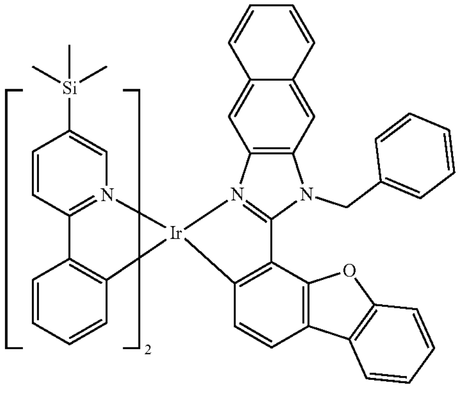
2243
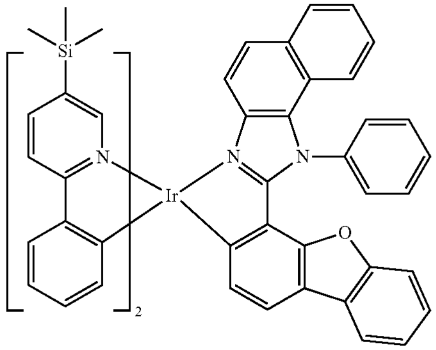

-continued
2244
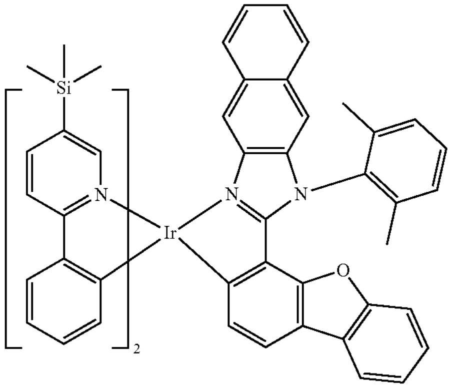
2245
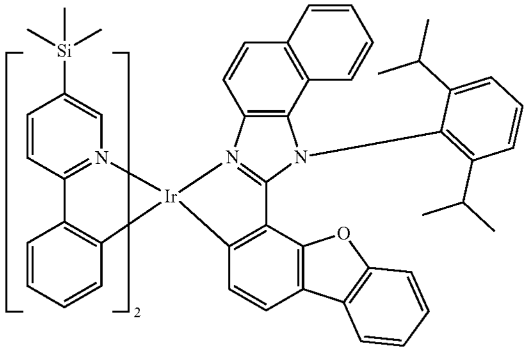
2246
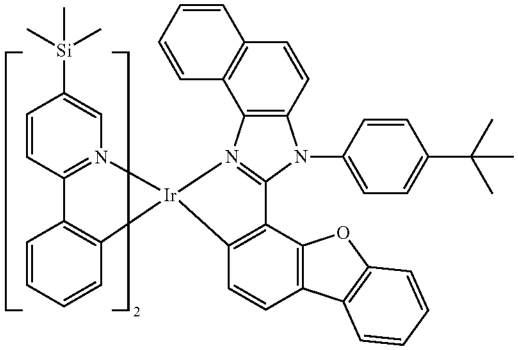
2247
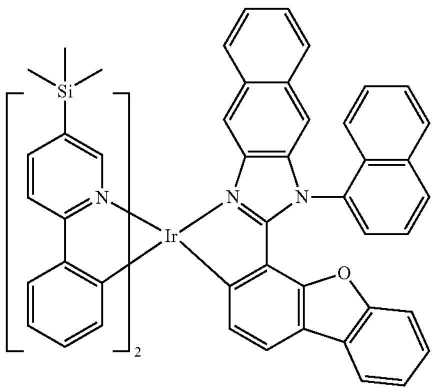
-continued
2248
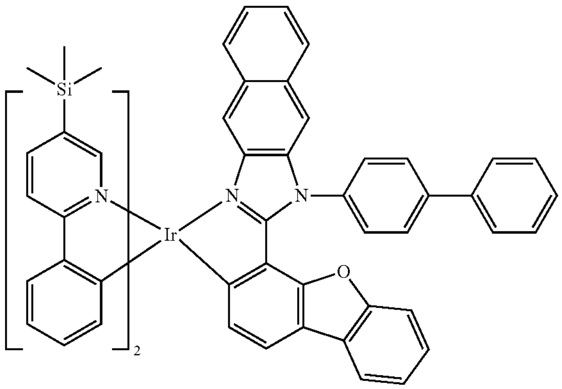
2249
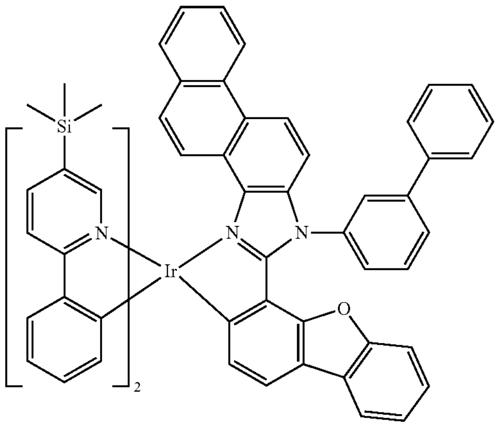
2250
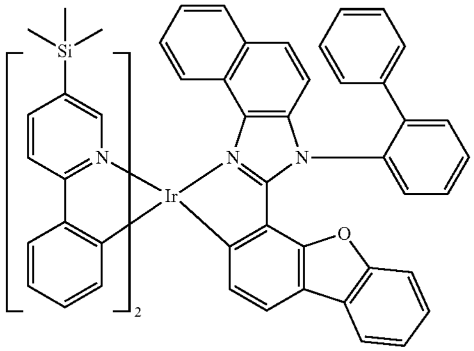
2251
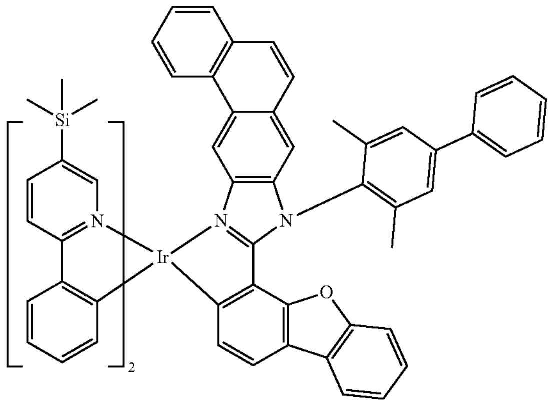

2252
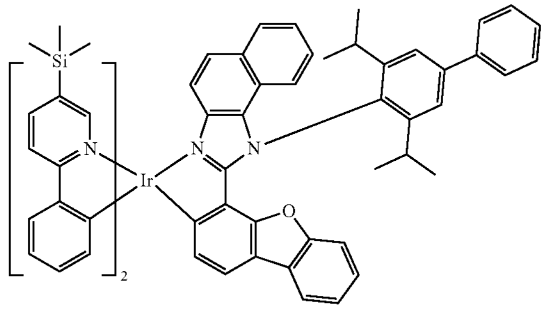
2253
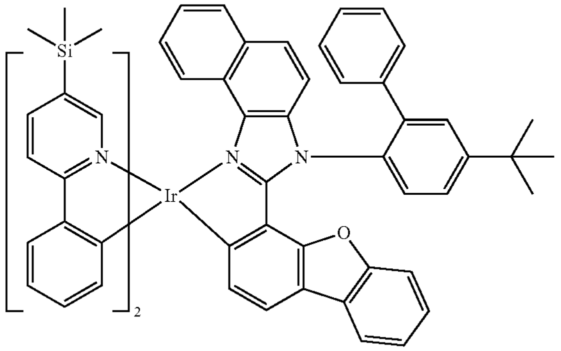
2254
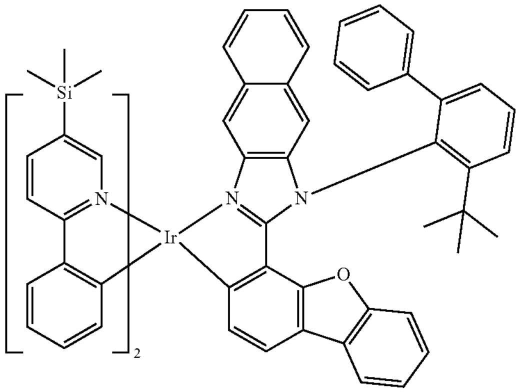
2255
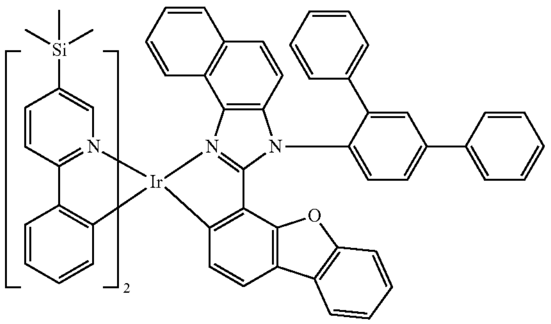
2256
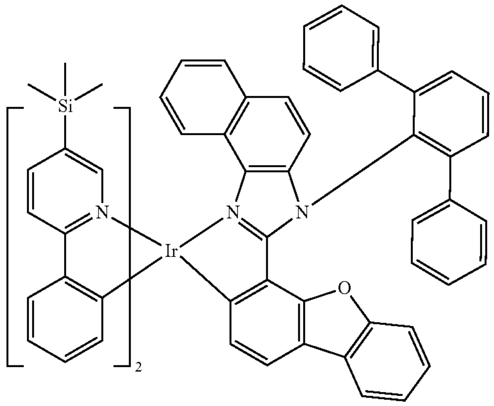
2257
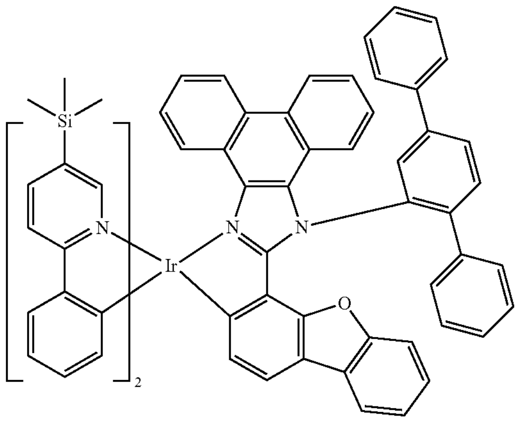
2258
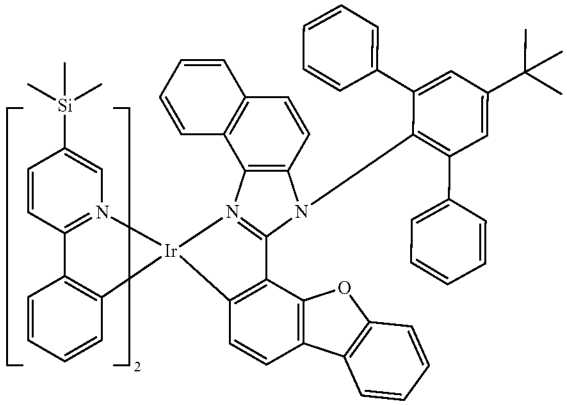

2259
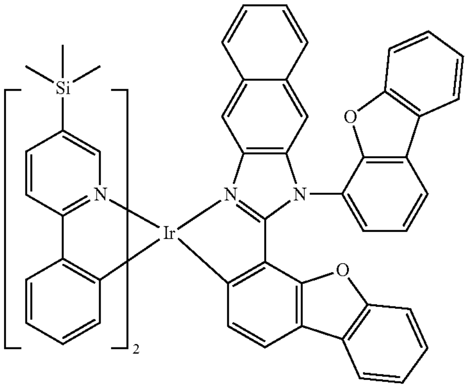
2260
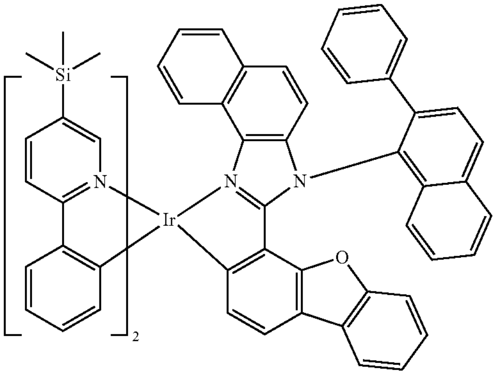
2261
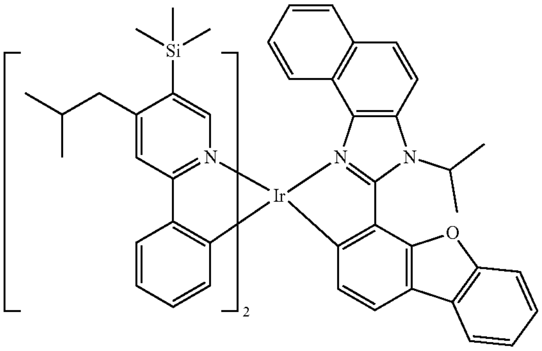
2262
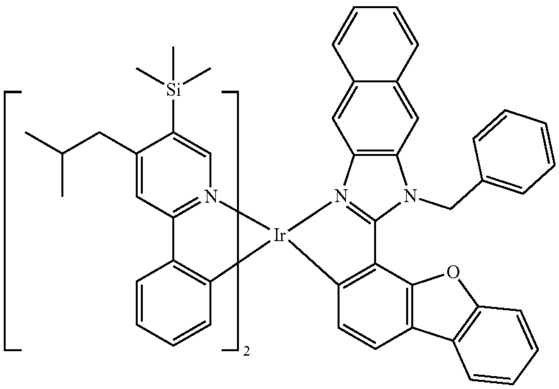
2263
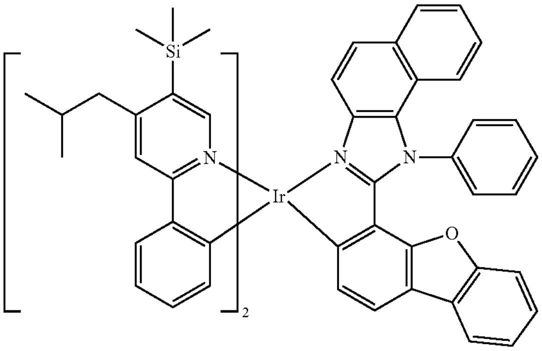
2264
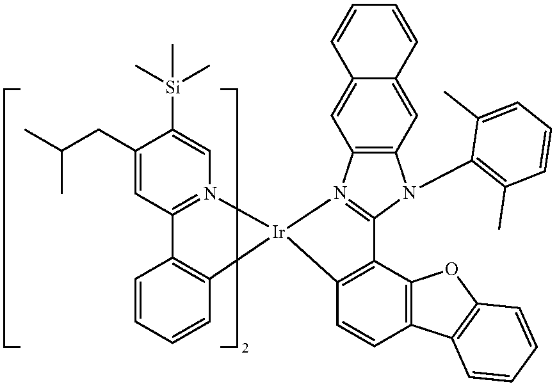
2265
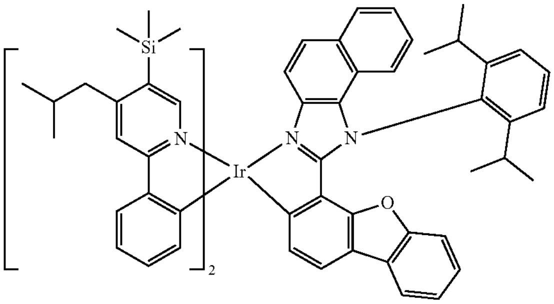
2266
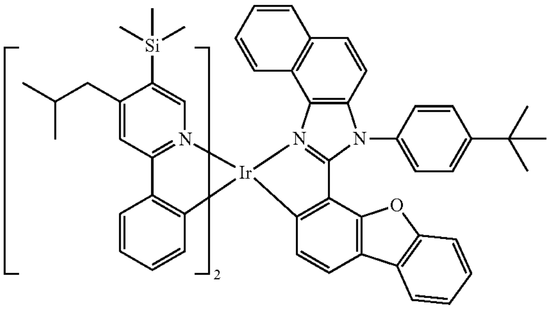

-continued
2267
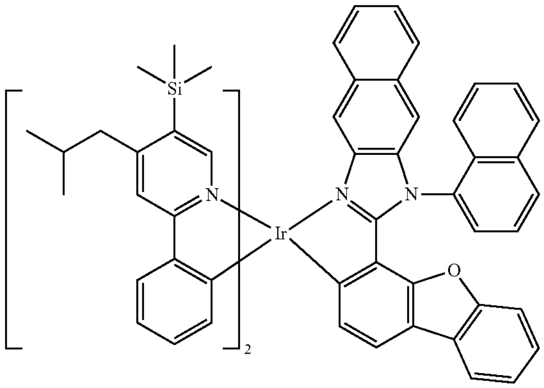
2268
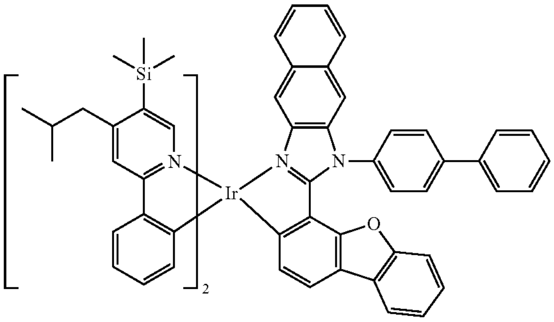
2269
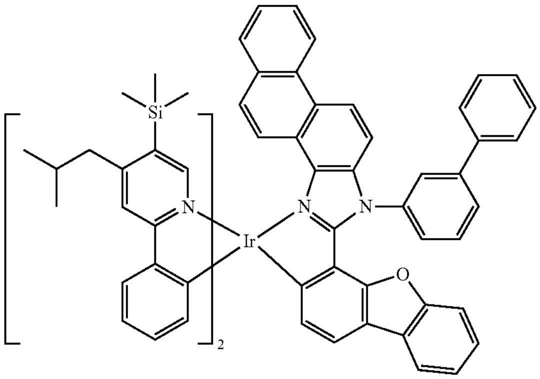
2270
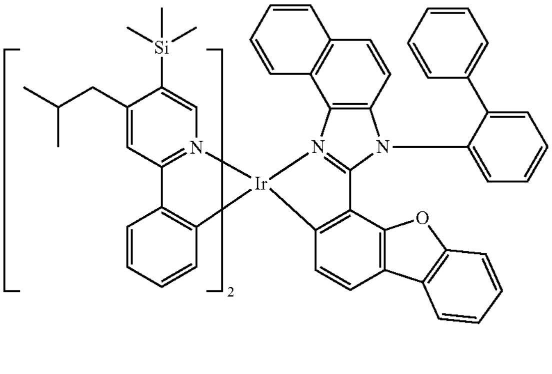
-continued
2271
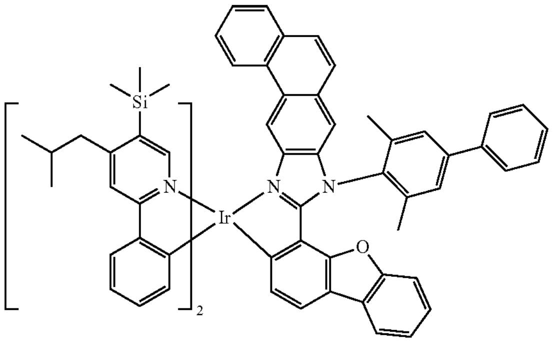
2272
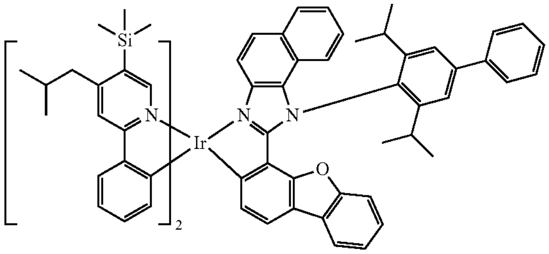
2273
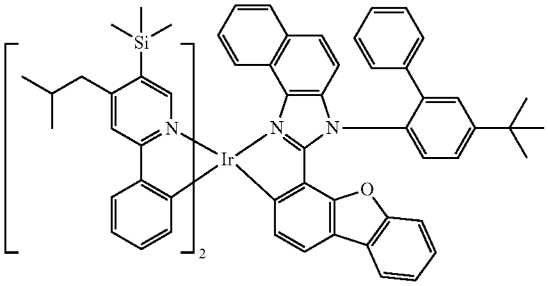
2274
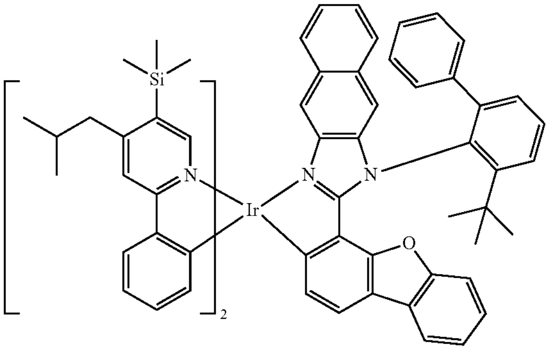
2275
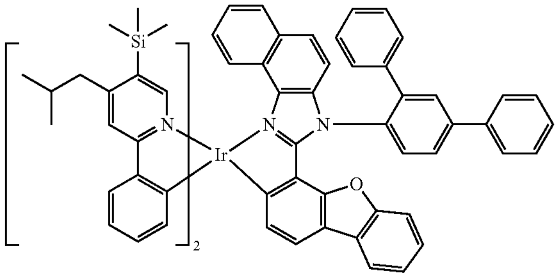

-continued
2276
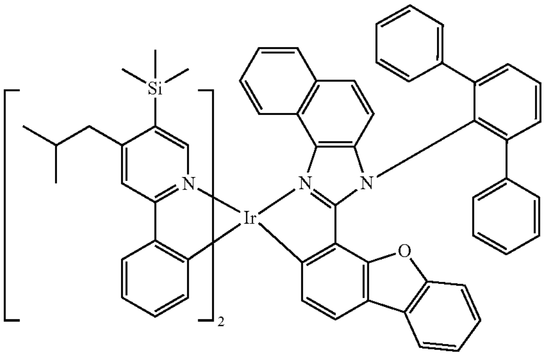
2277
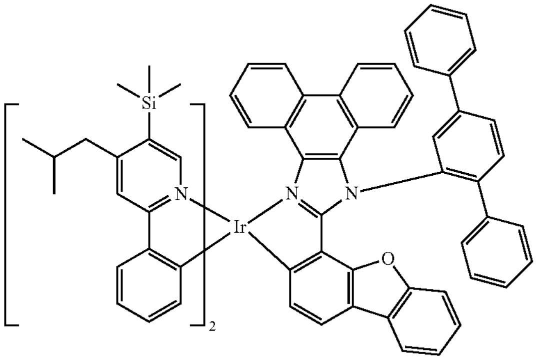
2278
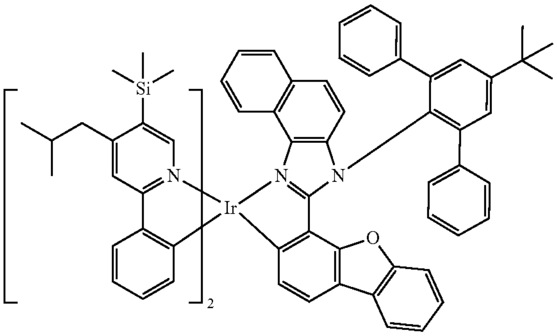
2279
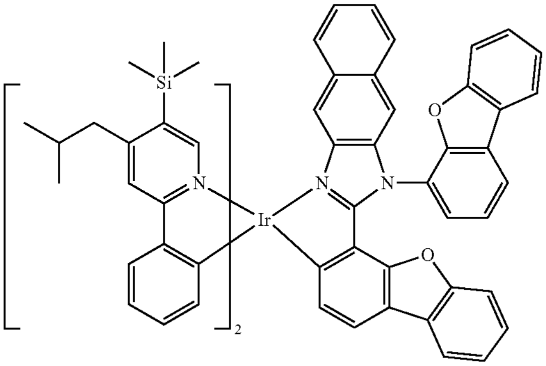
-continued
2280
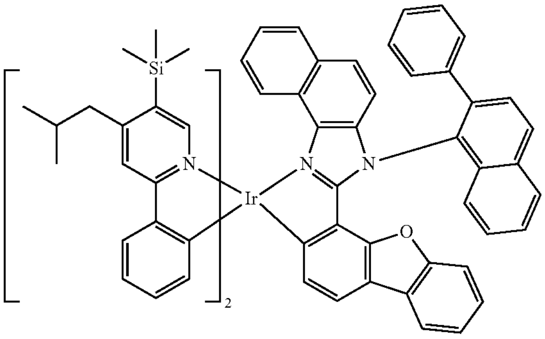
2281
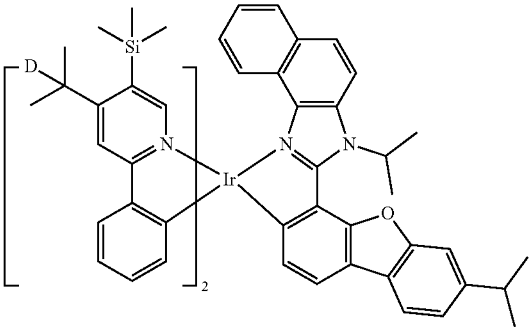
2282
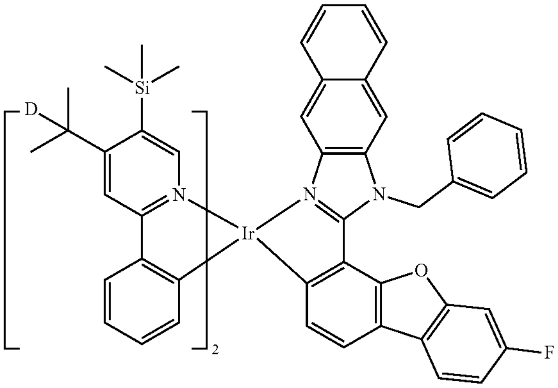
2283
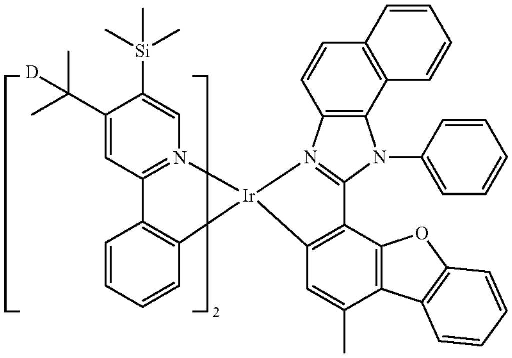

-continued
2284
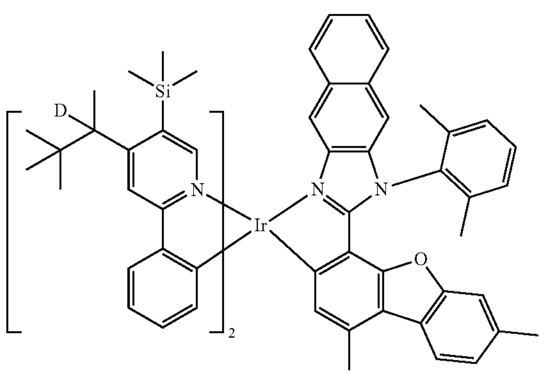
2285
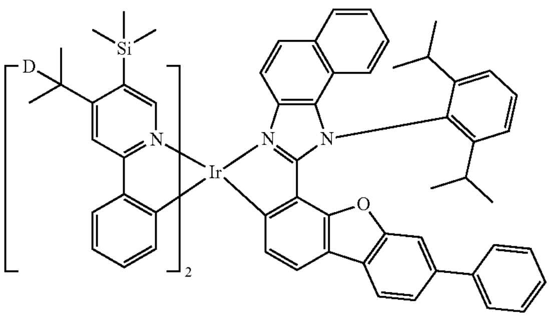
2286
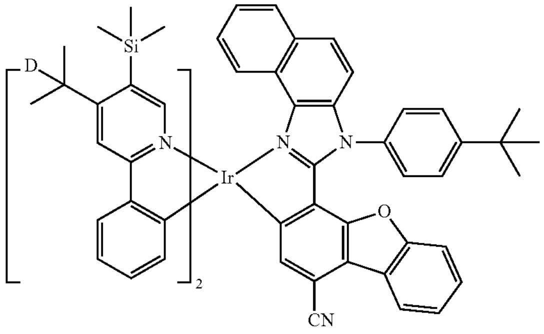
2287
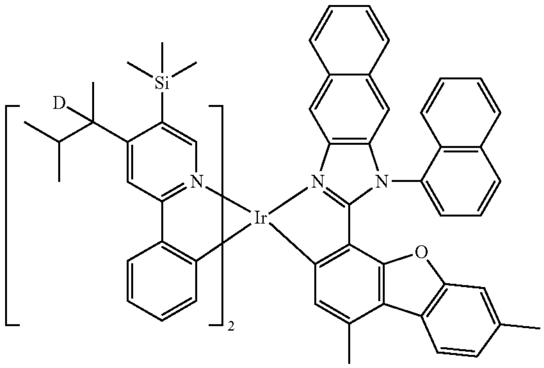
-continued
2288
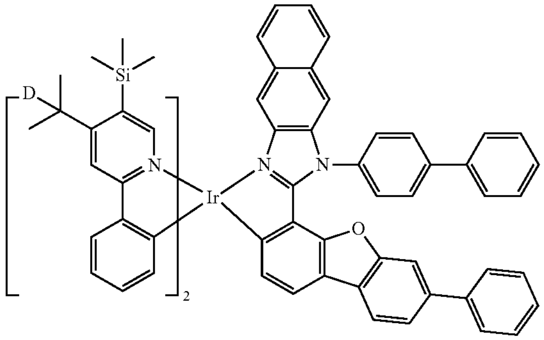
2289
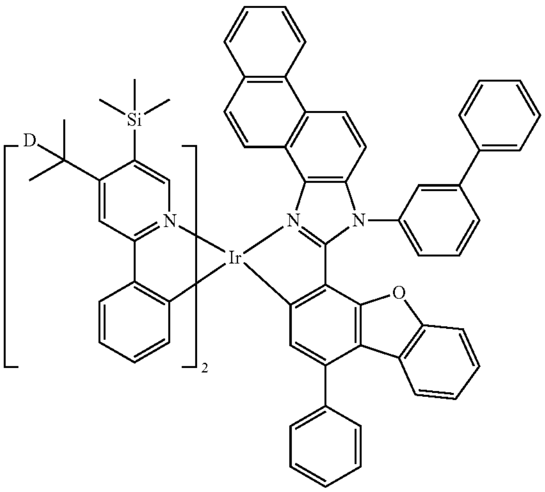
2290
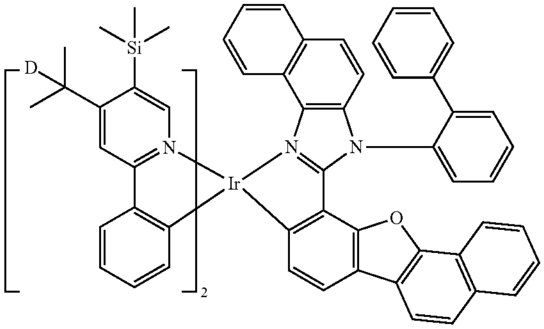
2291
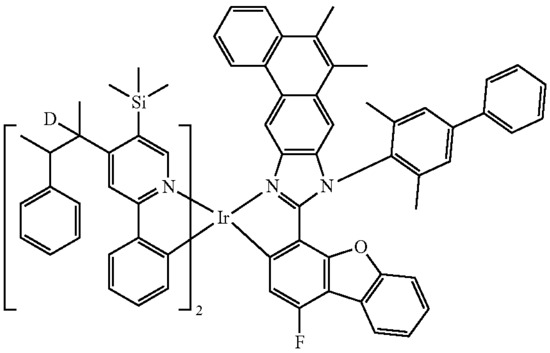

-continued
2292
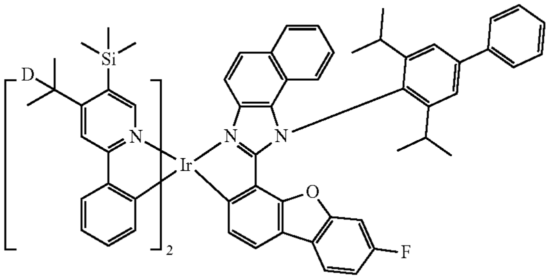
2293
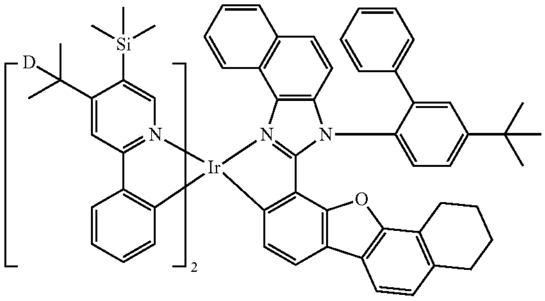
2294
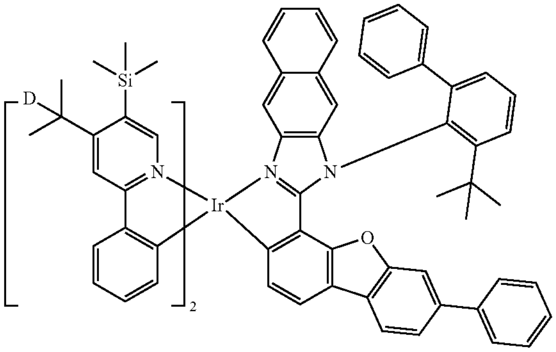
2295
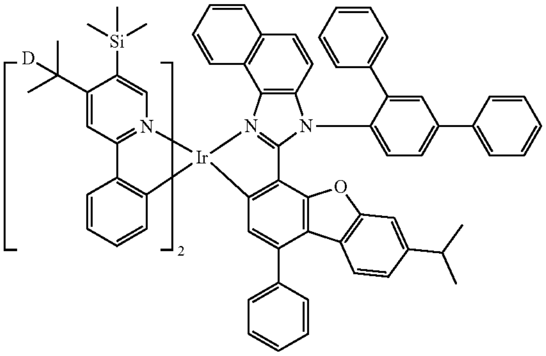
-continued
2296
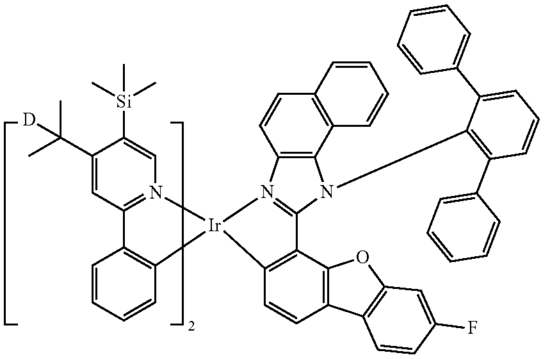
2297
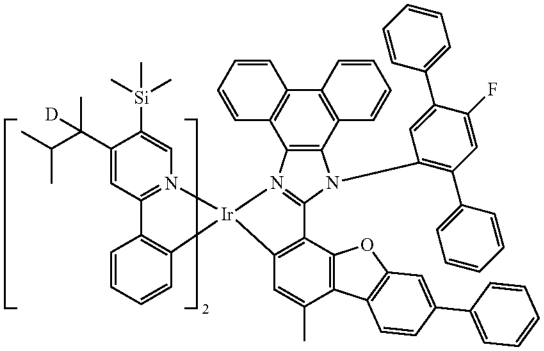
2298
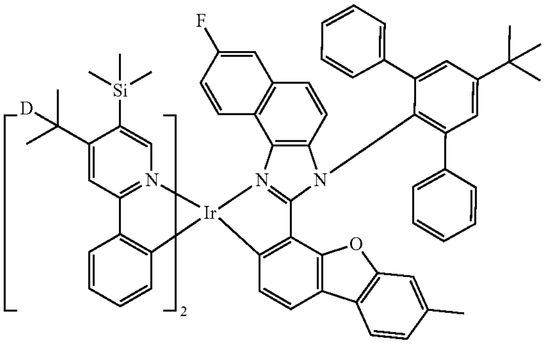
2299
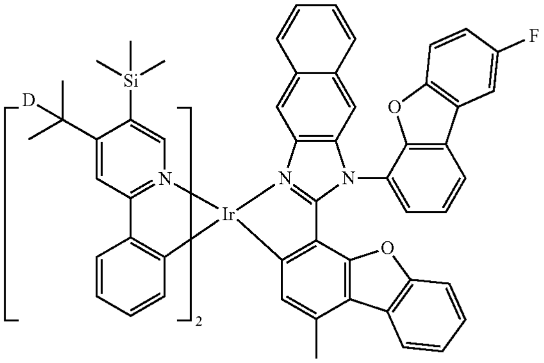

-continued
2300
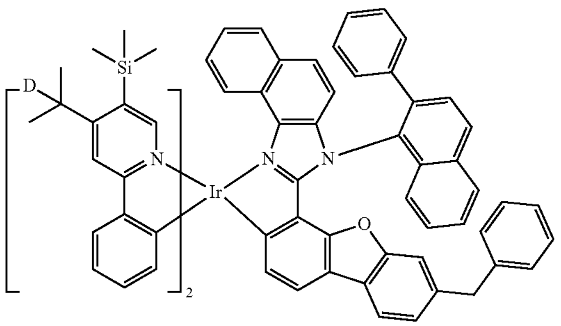
2301
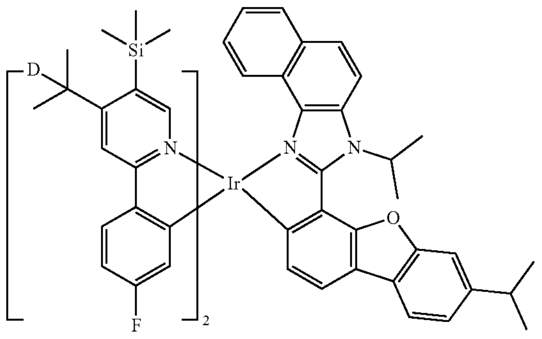
2302
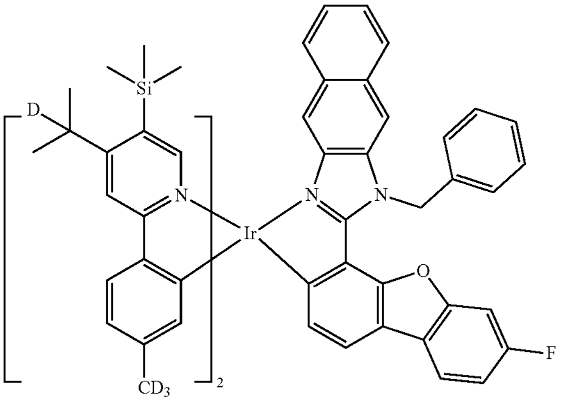
2303
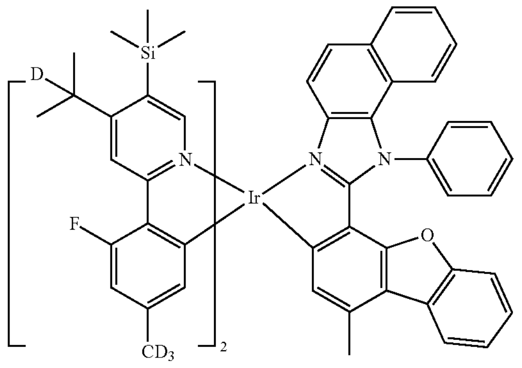
-continued
2304
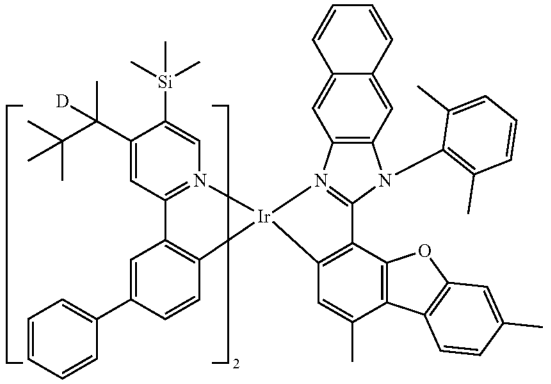
2305
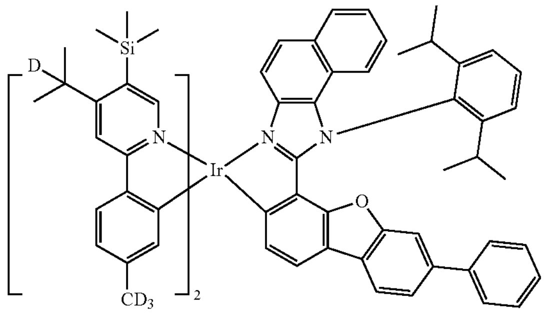
2306
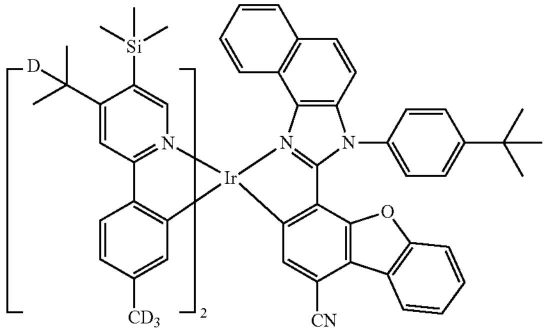
2307
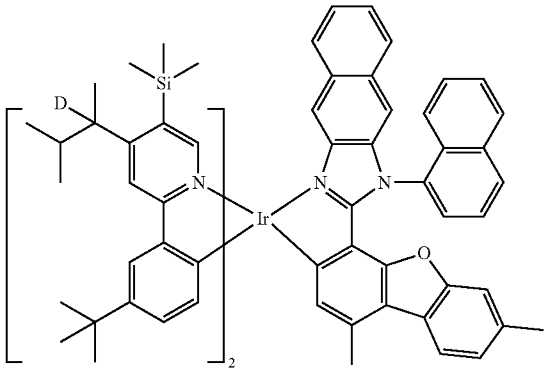

-continued
2308
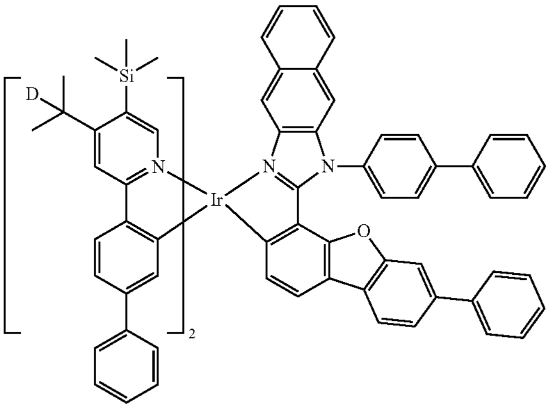
2309
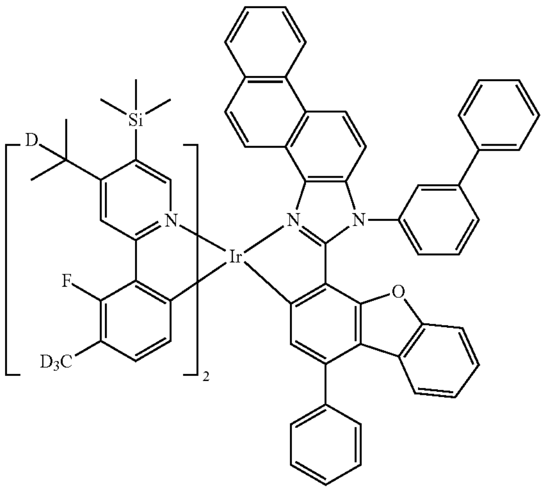
2310
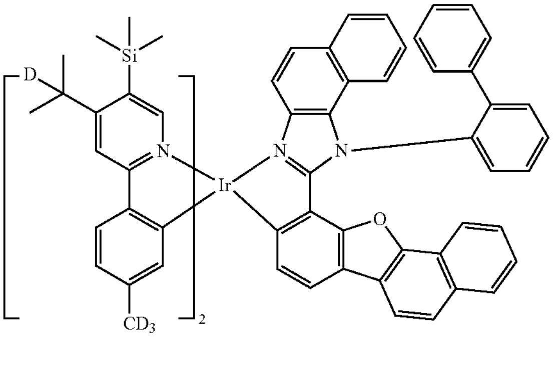
-continued
2311
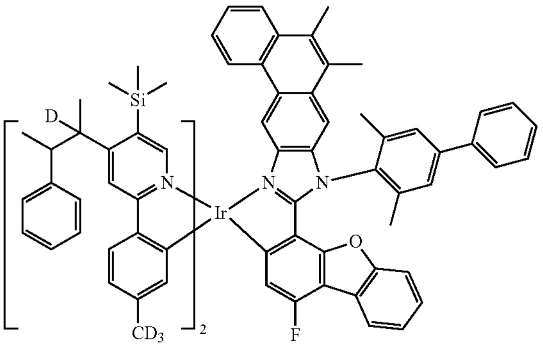
2312
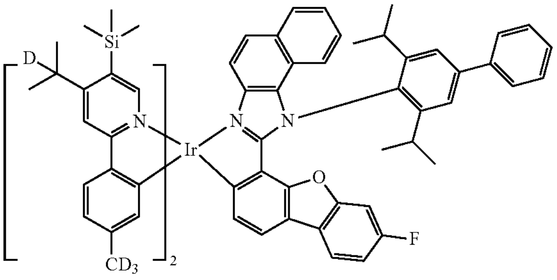
2313
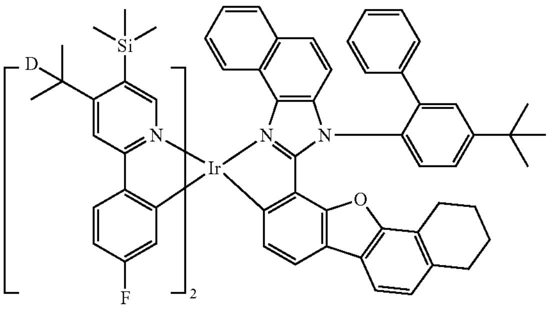
2314
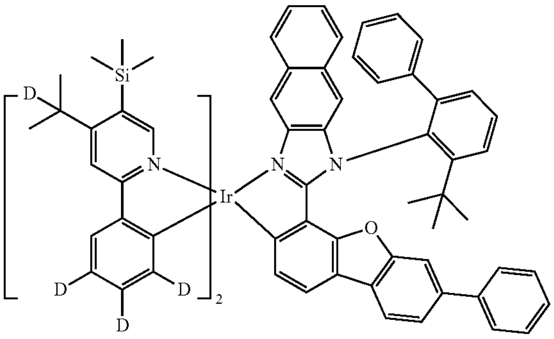

-continued
2315
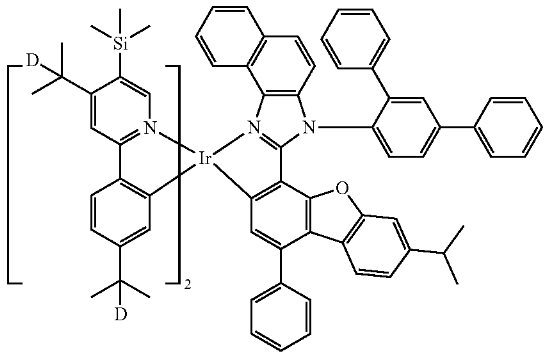
2316
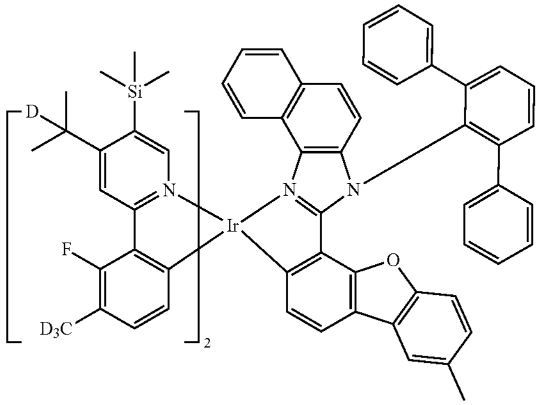
2317
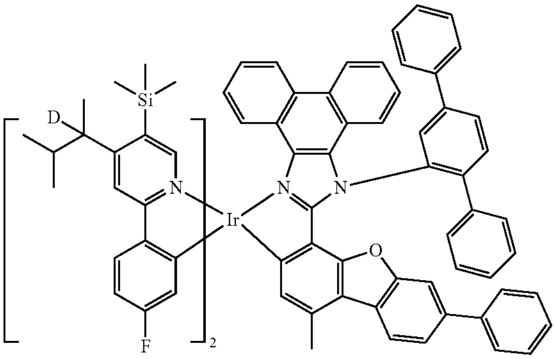
2318
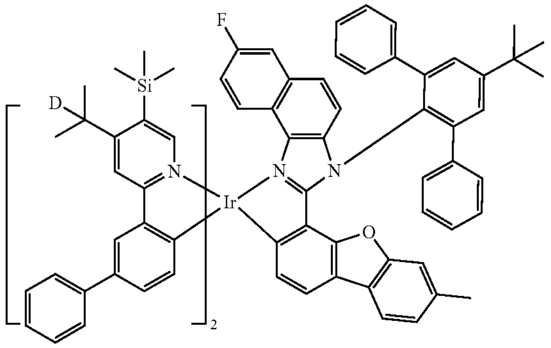
-continued
2319
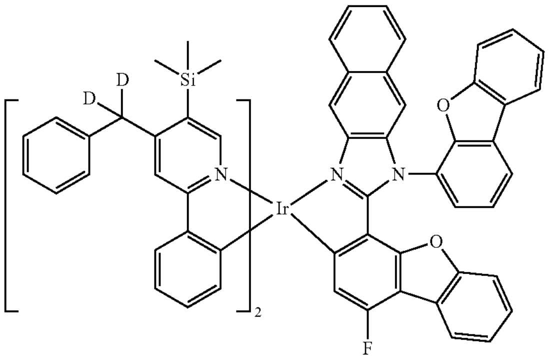
2320
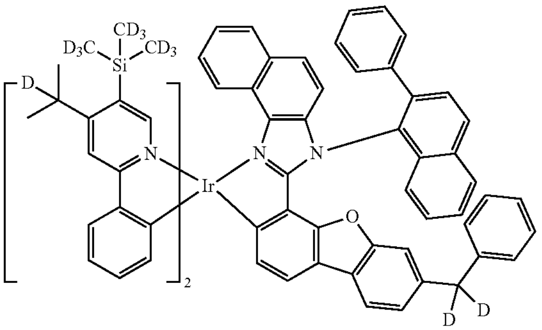
2321
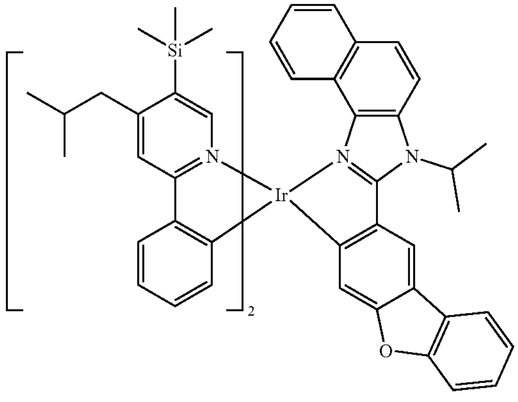

-continued
2322
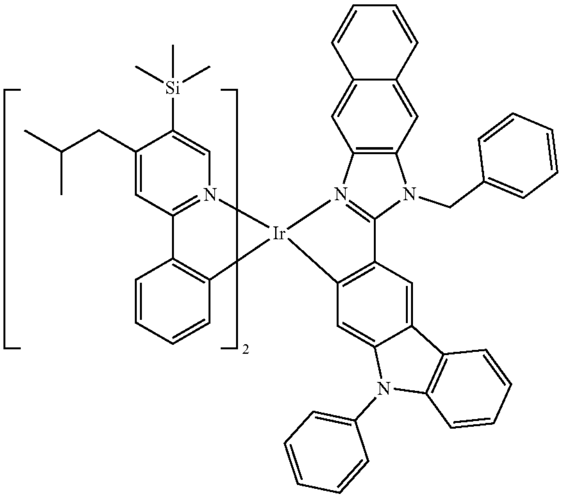
2323
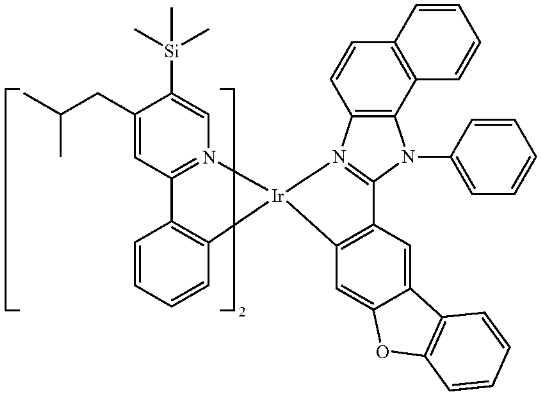
2324
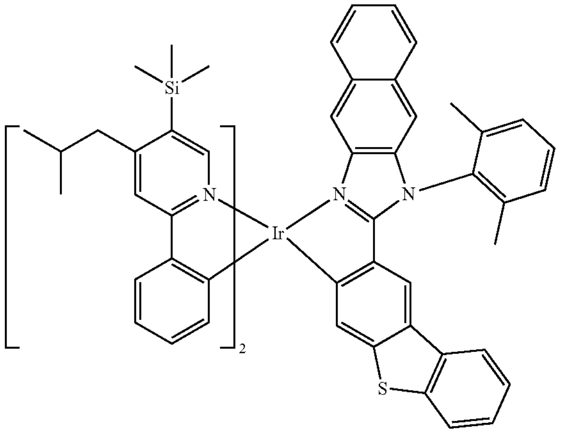
-continued
2325
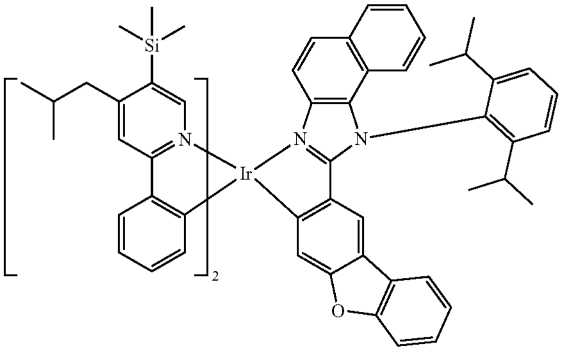
2326
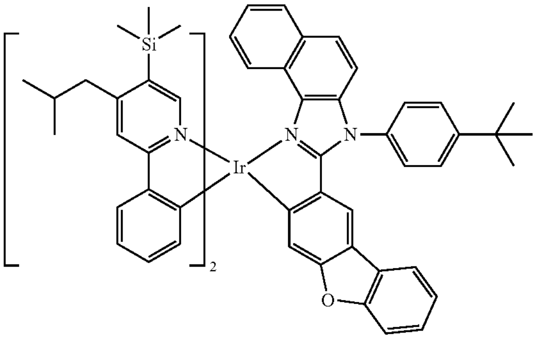
2327
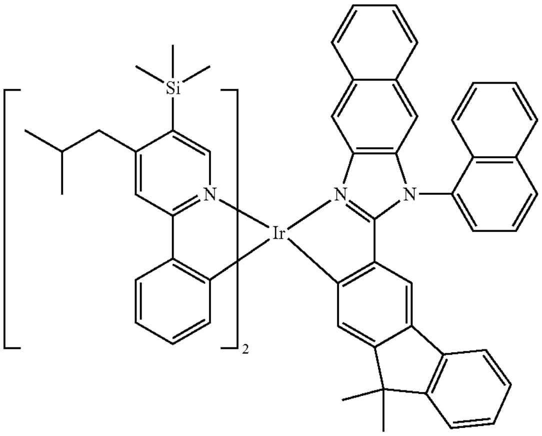
2328
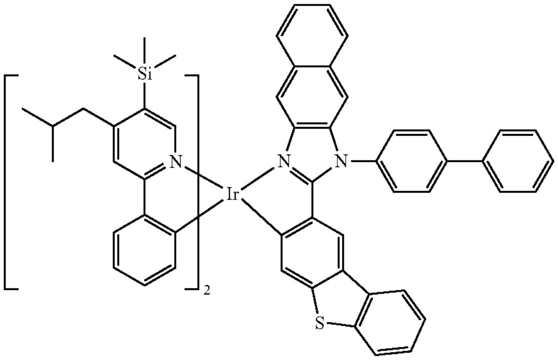

-continued
2329
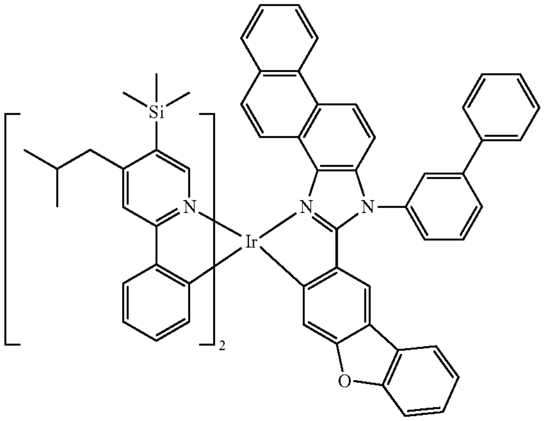
2330
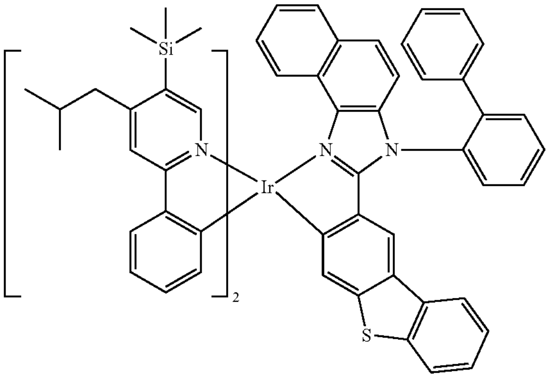
2331
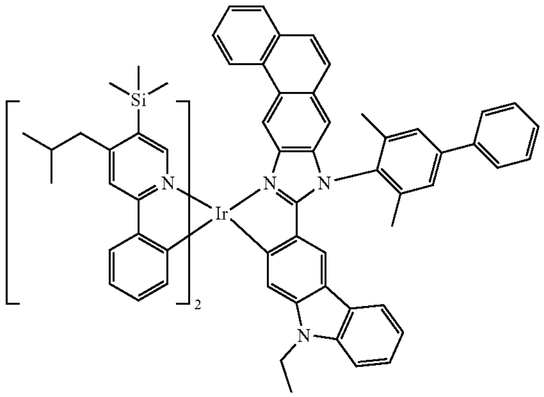
2332
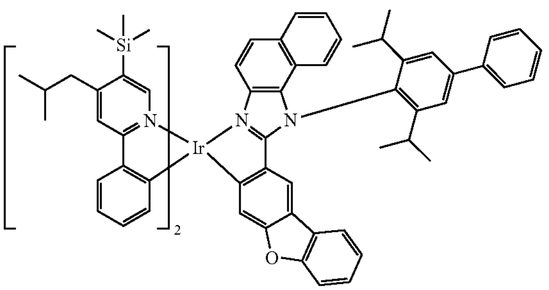
-continued
2333
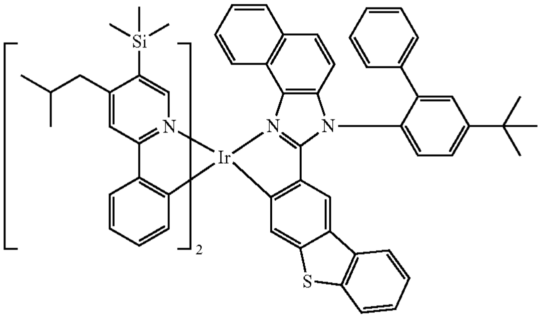
2334
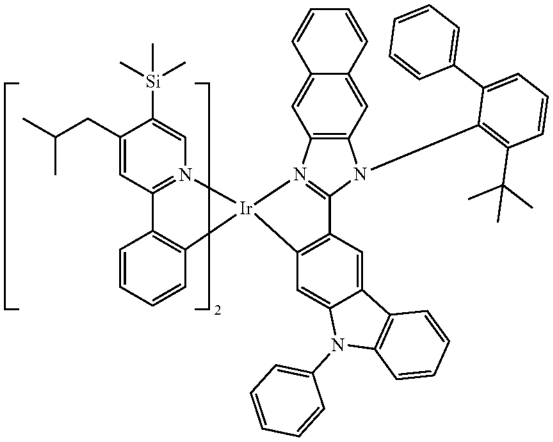
2335
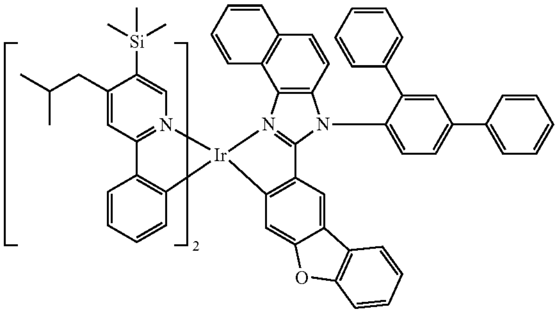
2336
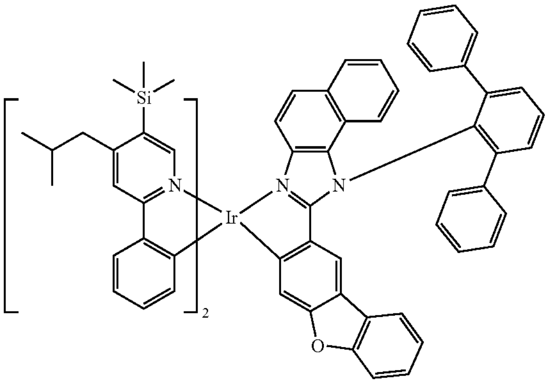

-continued
2337
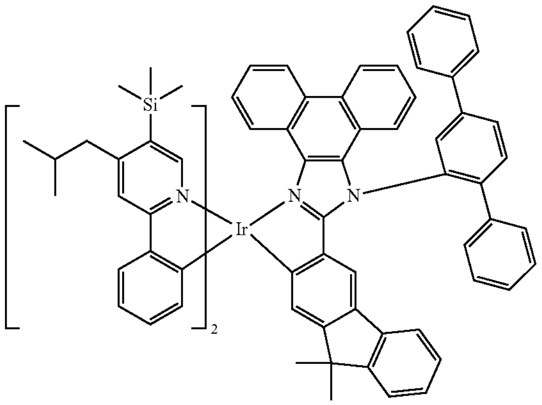
2338
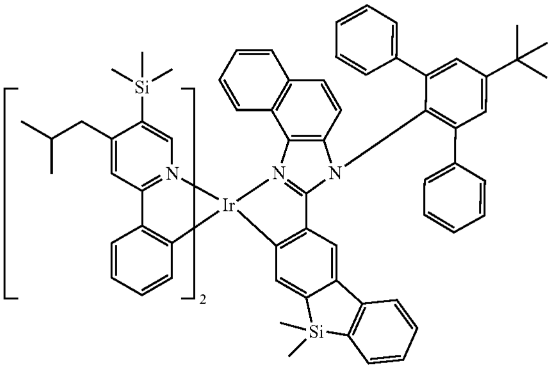
2339
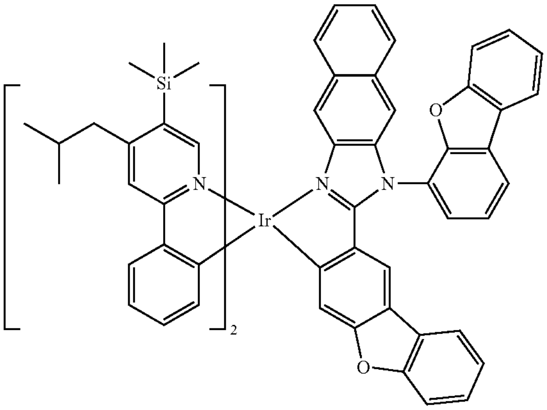
2340
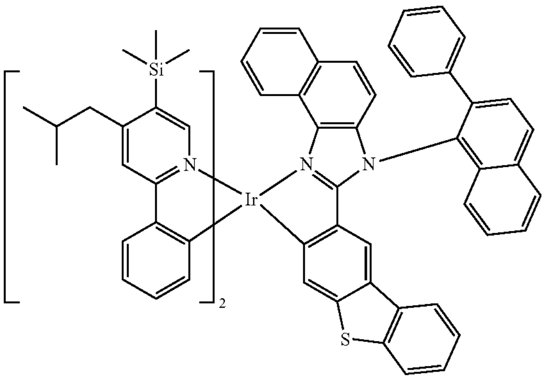
-continued
2341
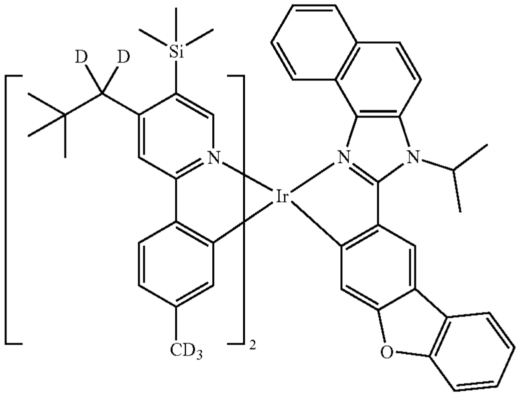
2342
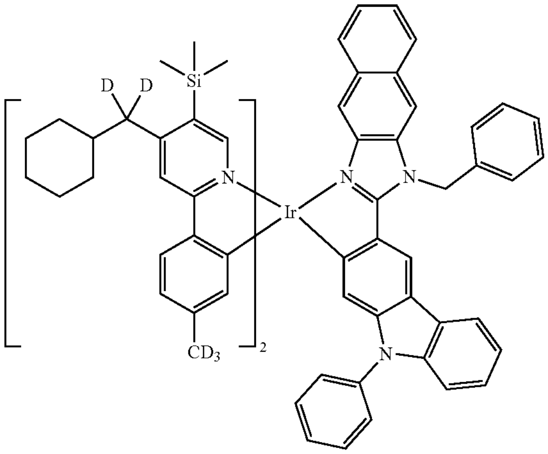
2343
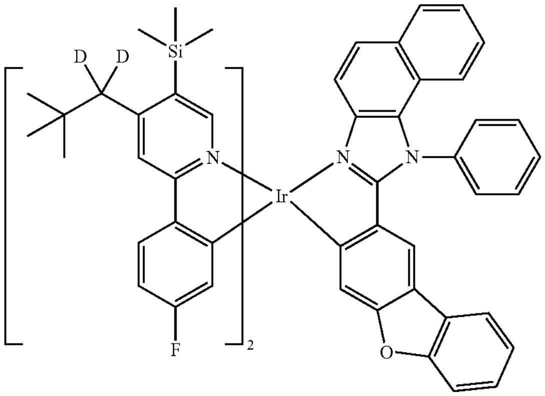

-continued
2344
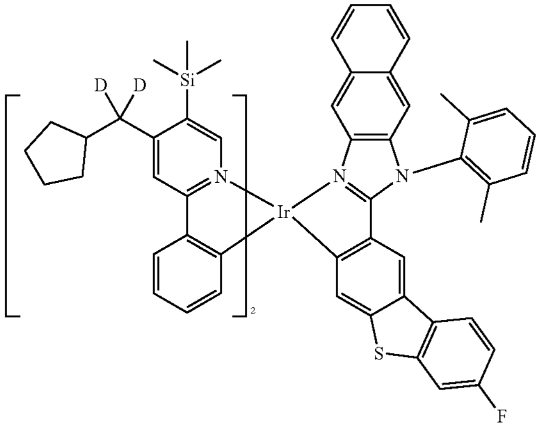
2345
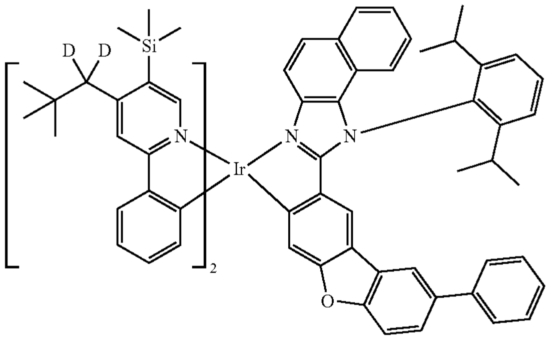
2346
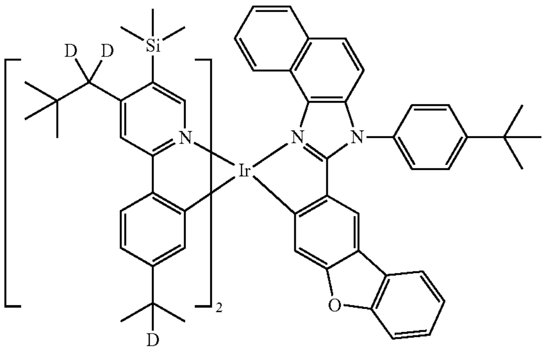
2347
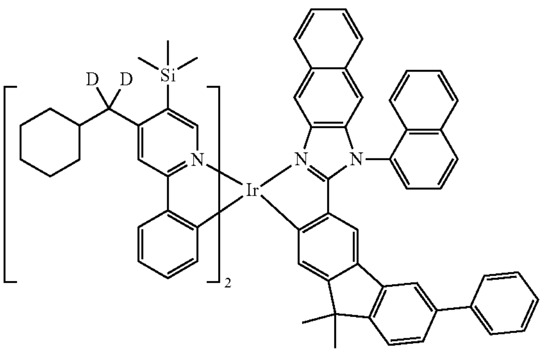
-continued
2348
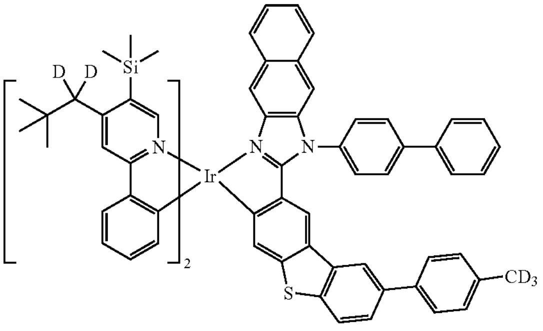
2349
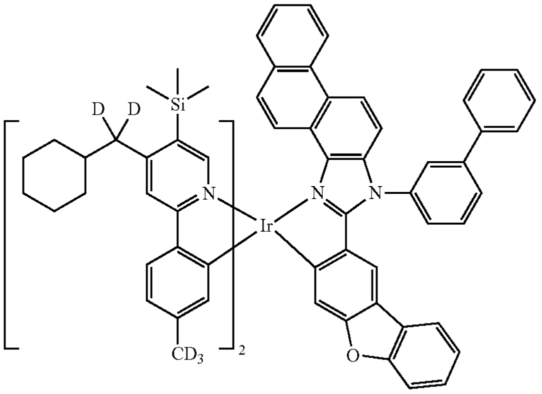
2350
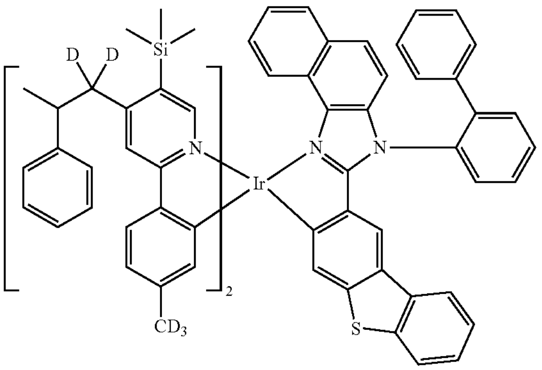
2351
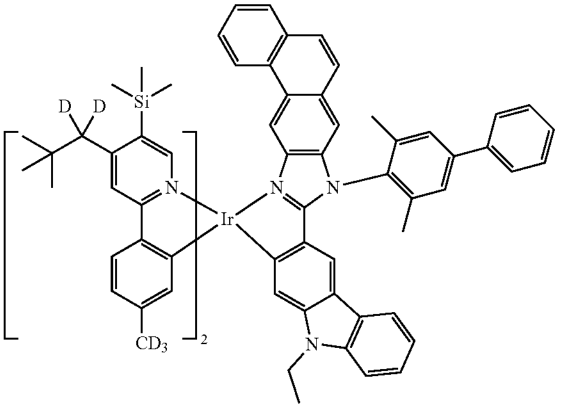

-continued
2352
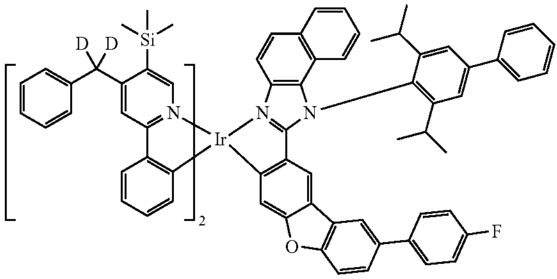
2353
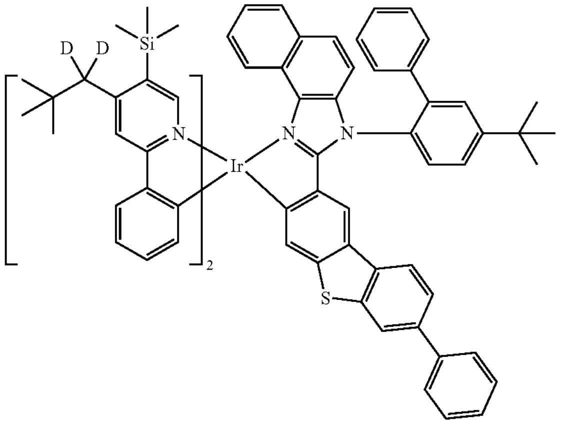
2354
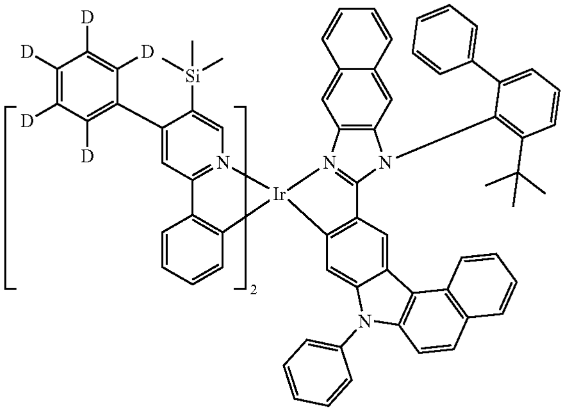
2355
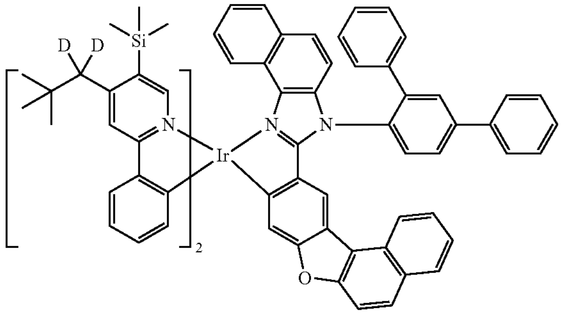
-continued
2356
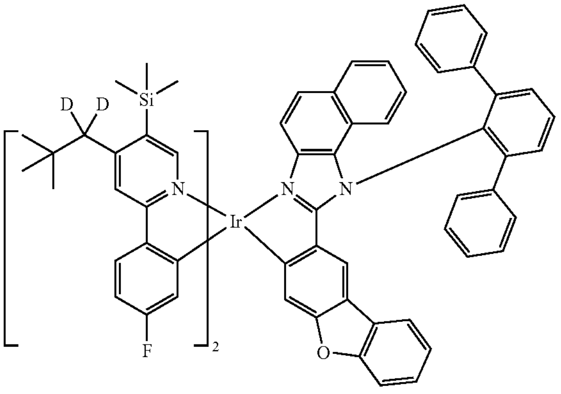
2357
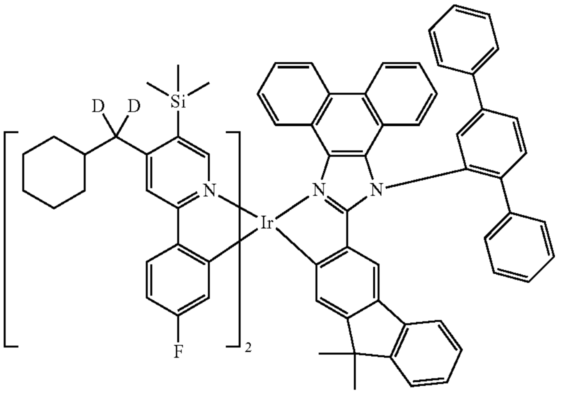
2358
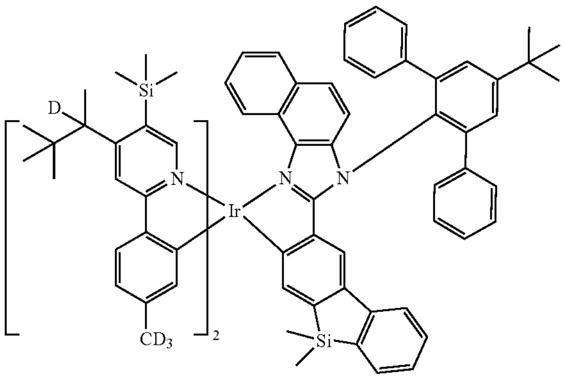
2359
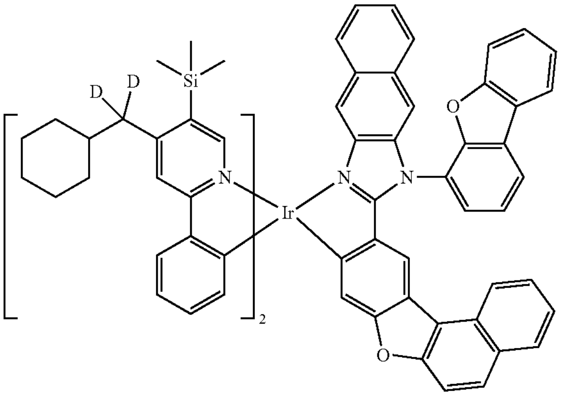

-continued
2360
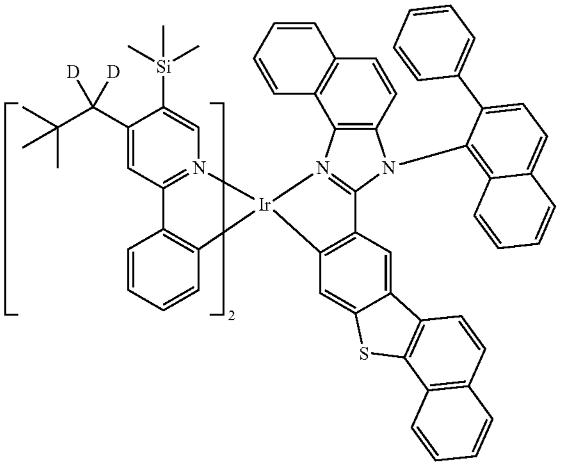
2361
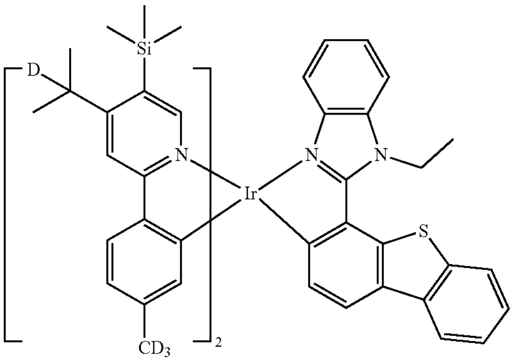
2362
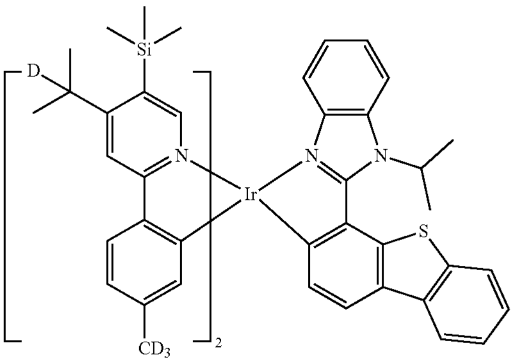
2363
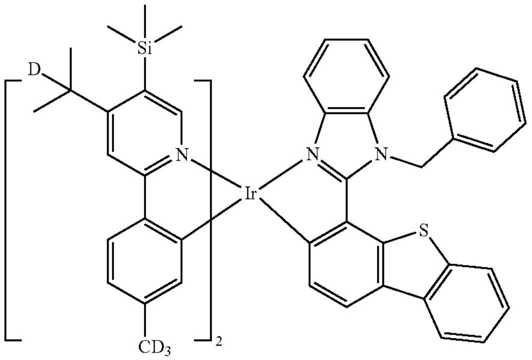
-continued
2364
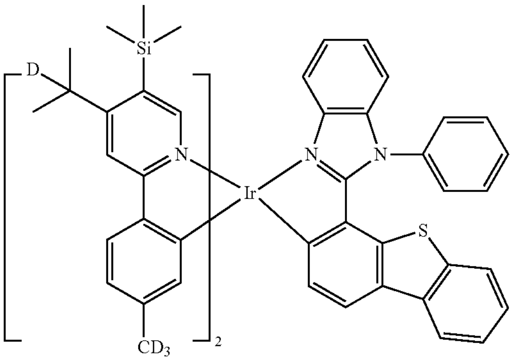
2365
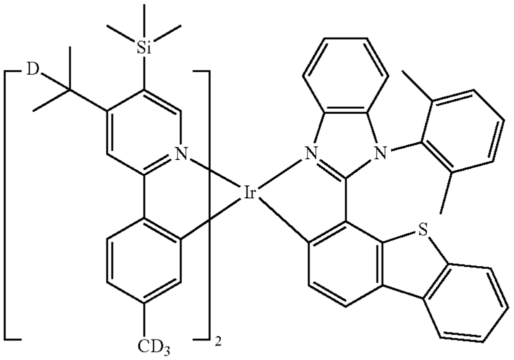
2366
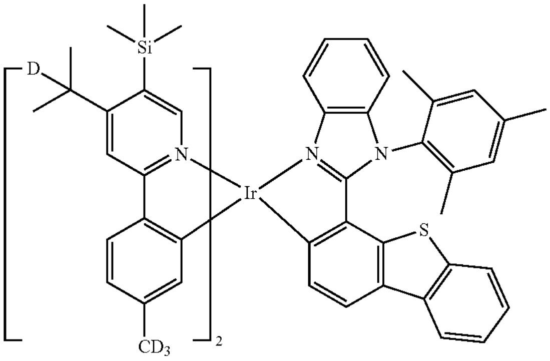
2367
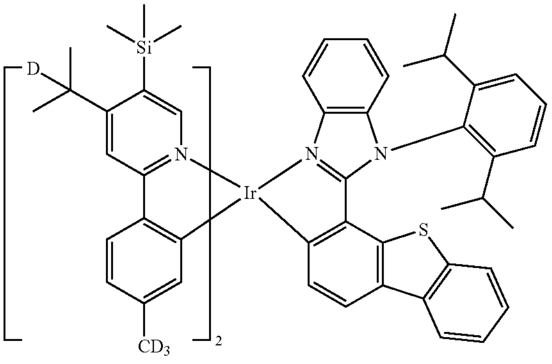

-continued
2368
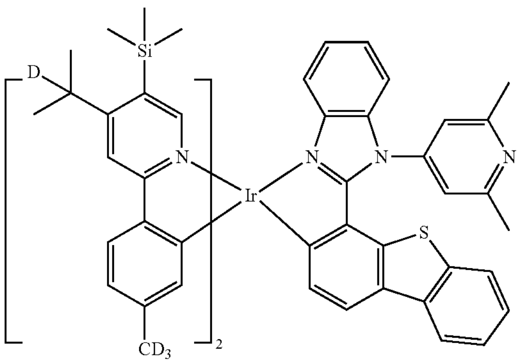
2369
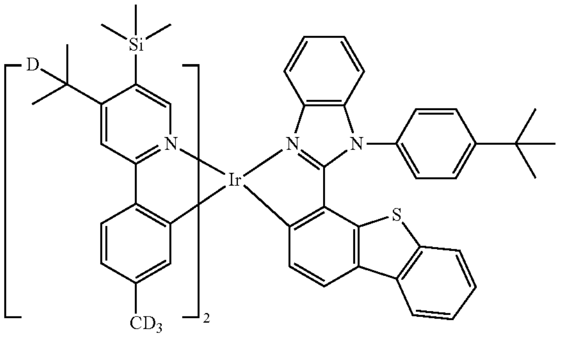
2370
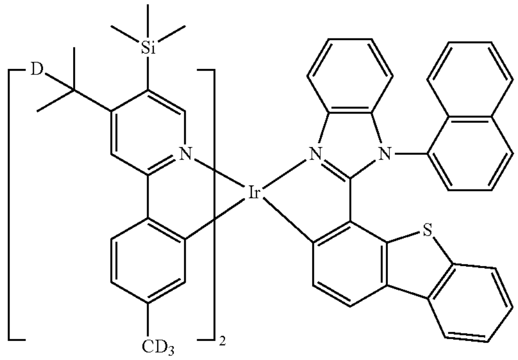
2371
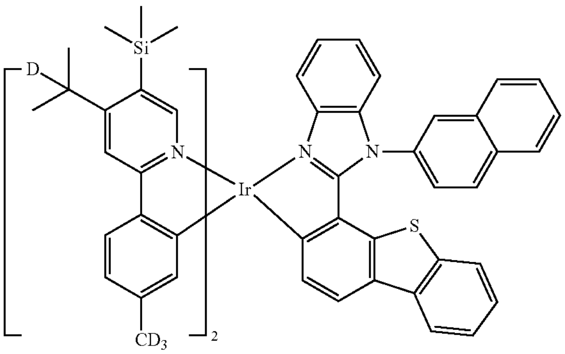
-continued
2372
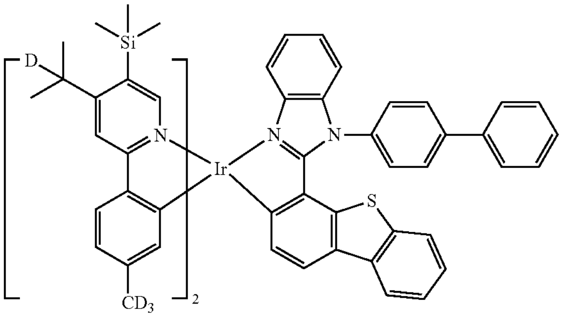
2373
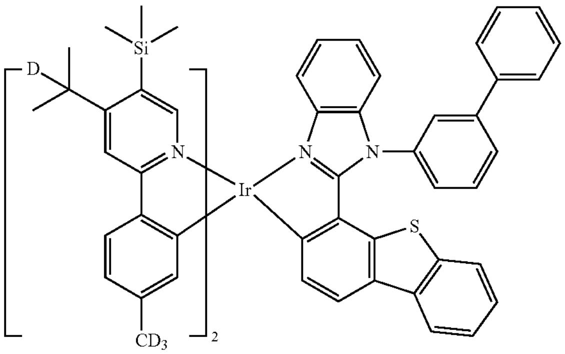
2374
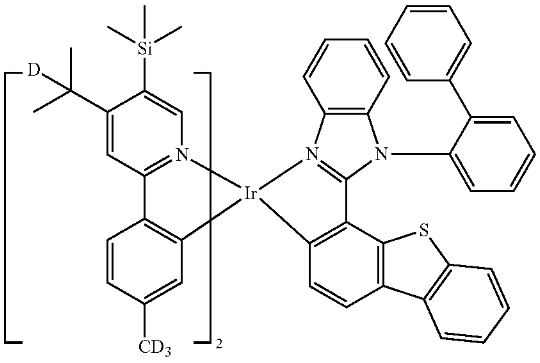
2375
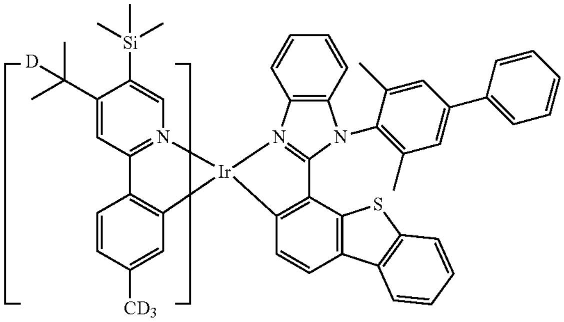

-continued
2376
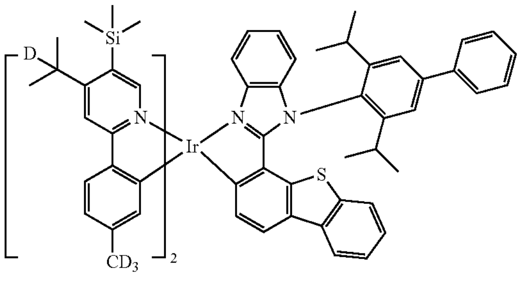
2377
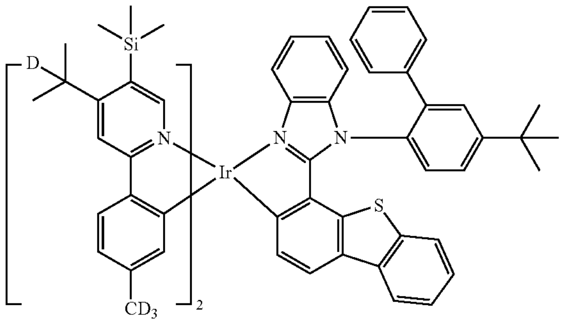
2378
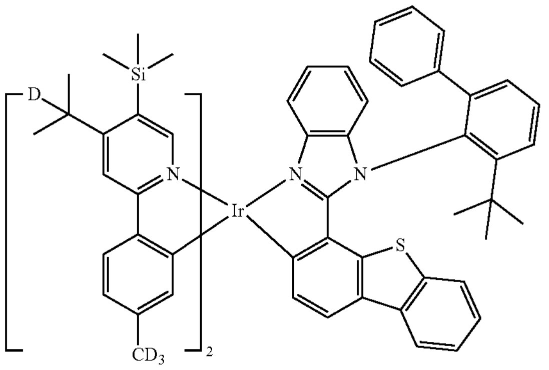
2379
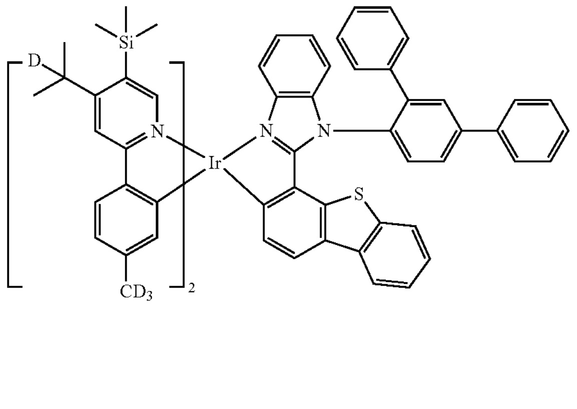
-continued
2380
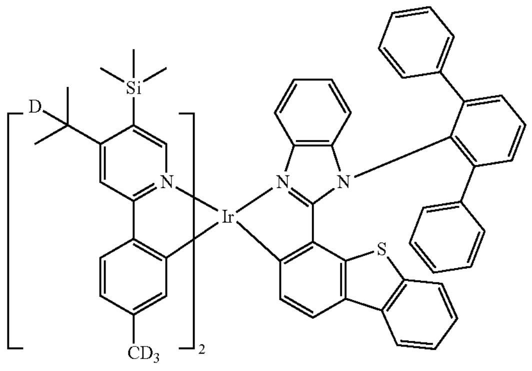
2381
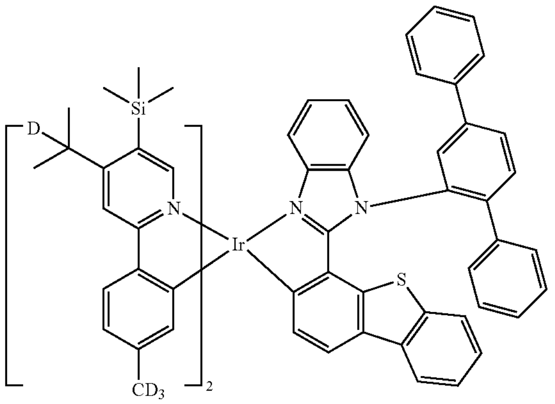
2382
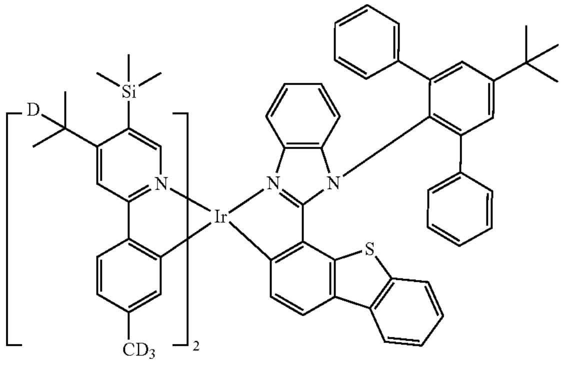
2383
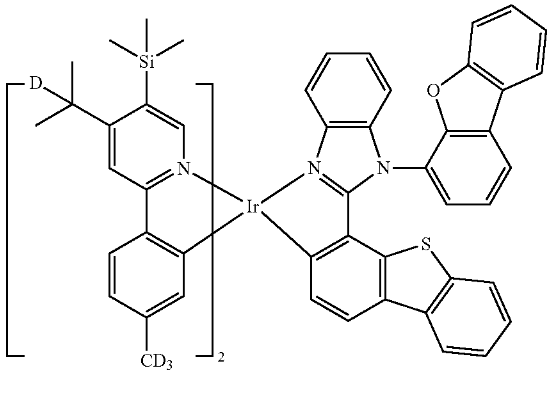

-continued
2384
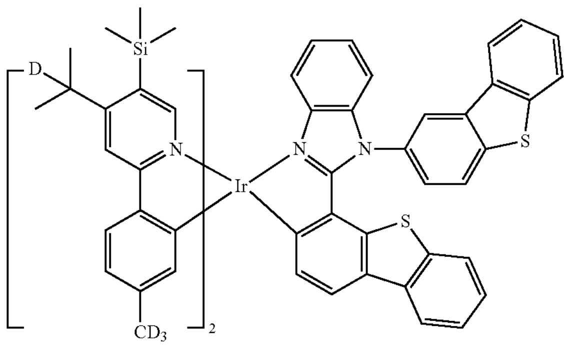
2385
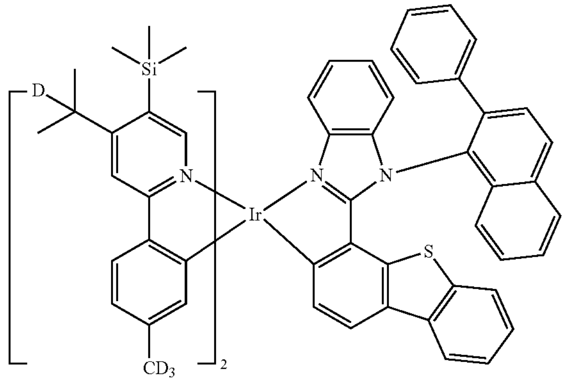
2386
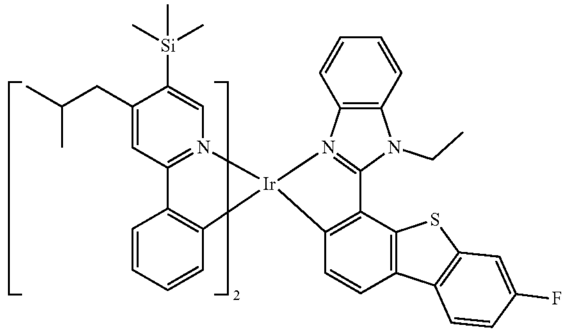
2387
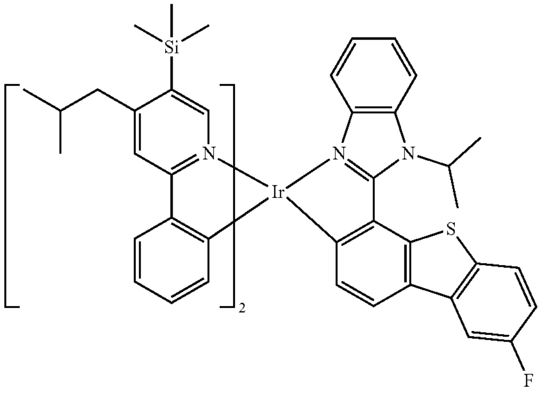
-continued
2388
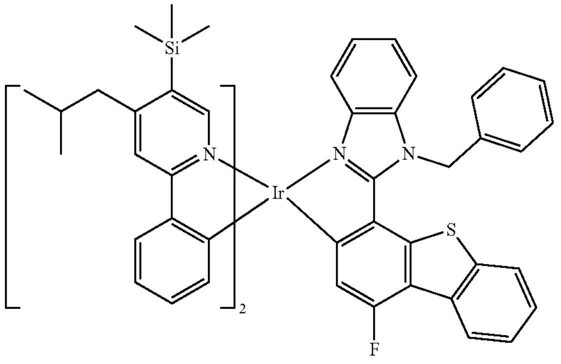
2389
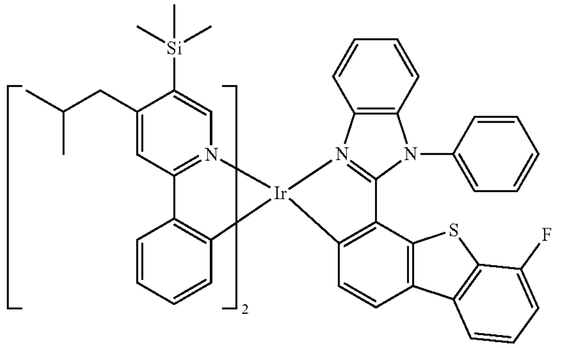
2390
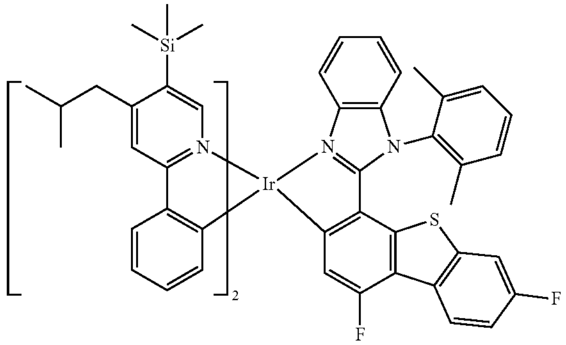
2391
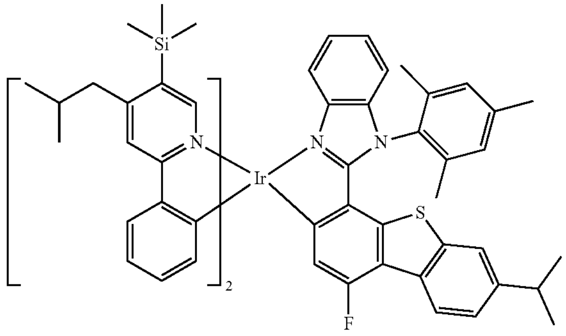

-continued
2392
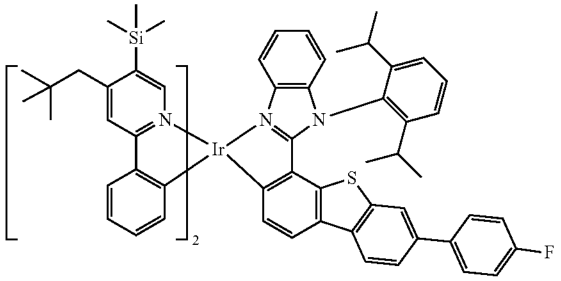
2393
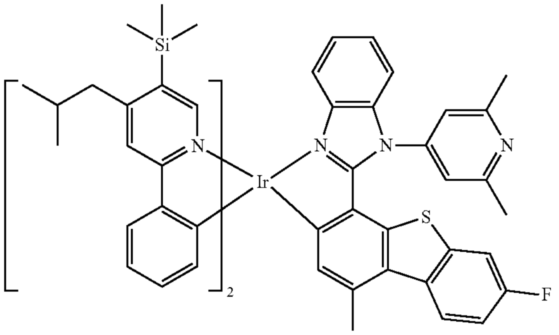
2394
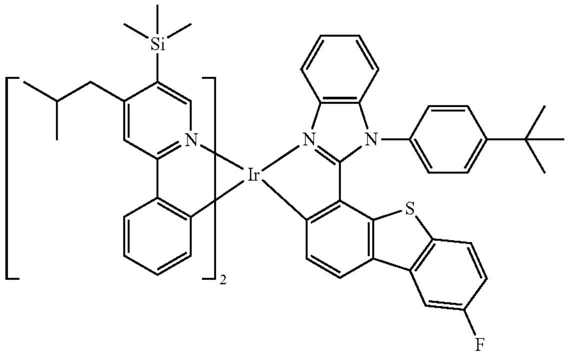
2395
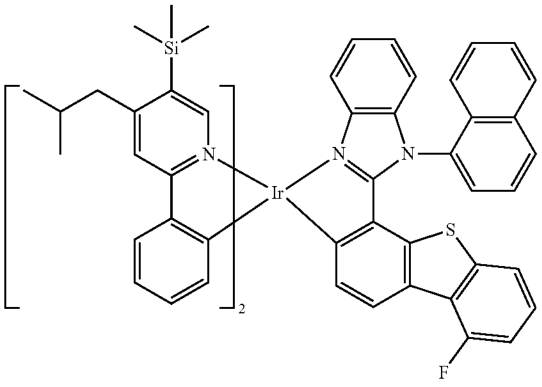
-continued
2396
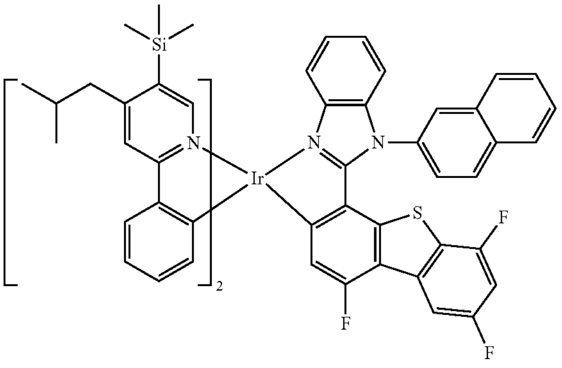
2397
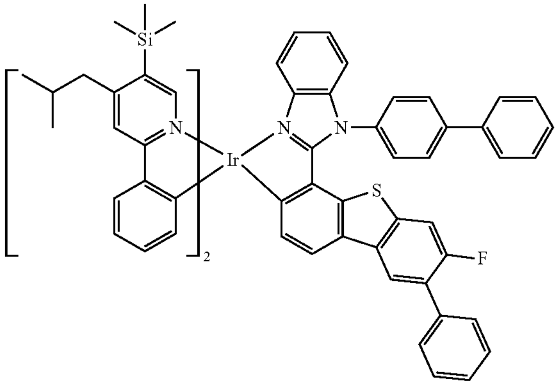
2398
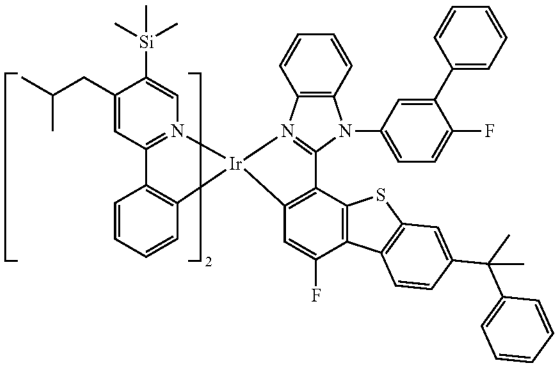
2399
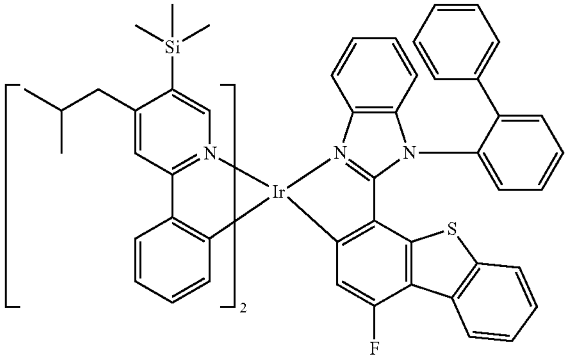

-continued
2400
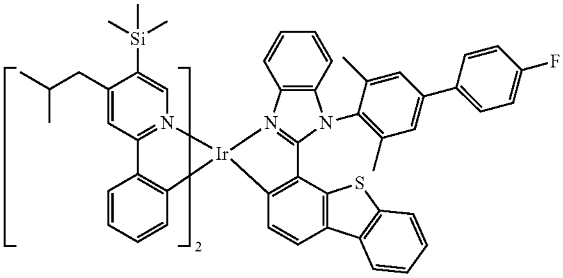
2401
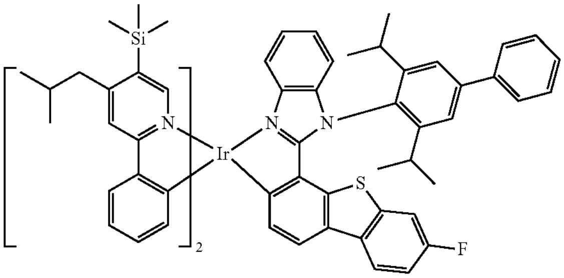
2402
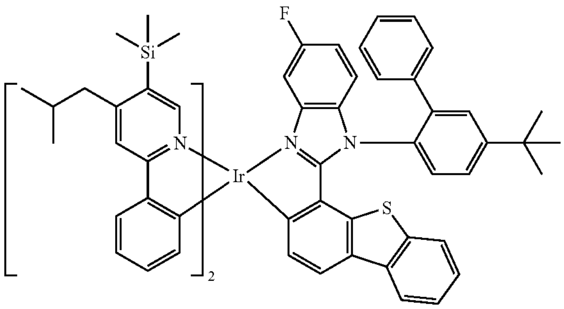
2403
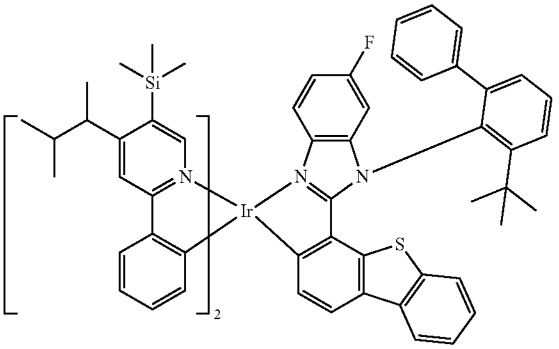
-continued
2404
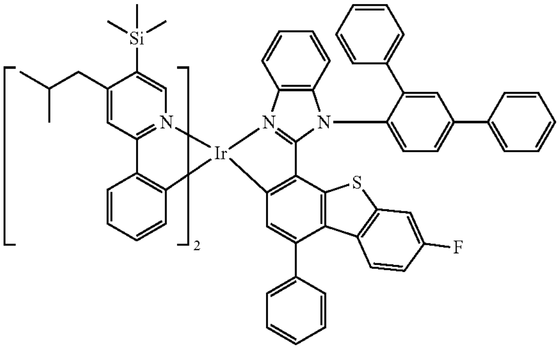
2405
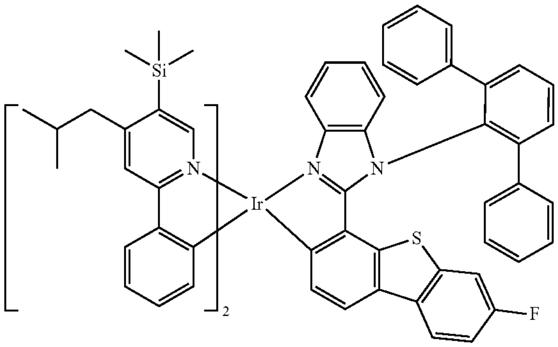
2406
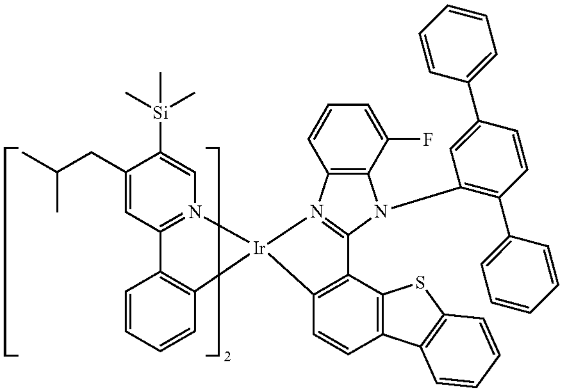
2407
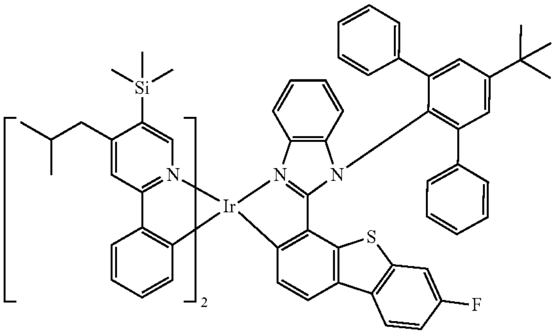

-continued
2408
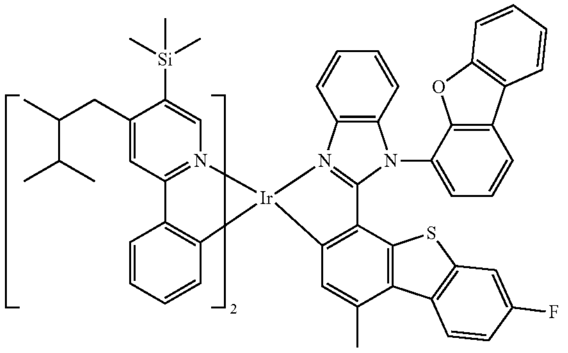
2409
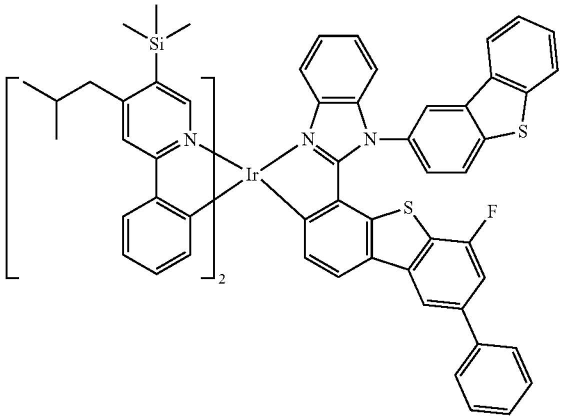
2410
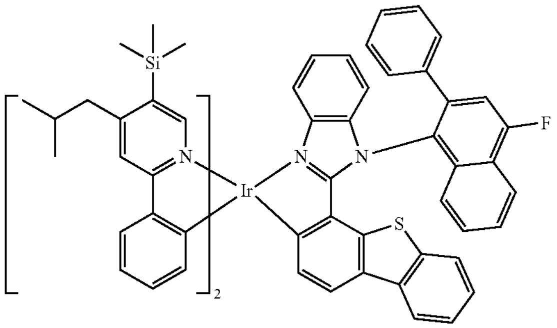
2411
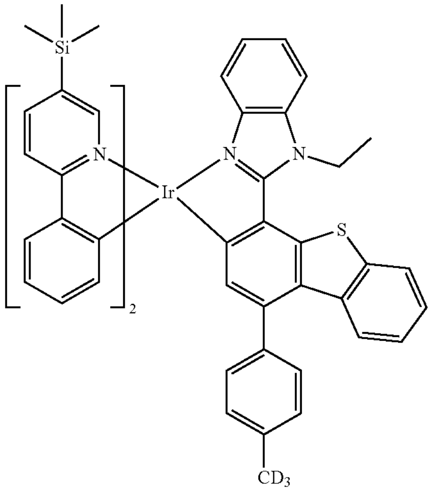
-continued
2412
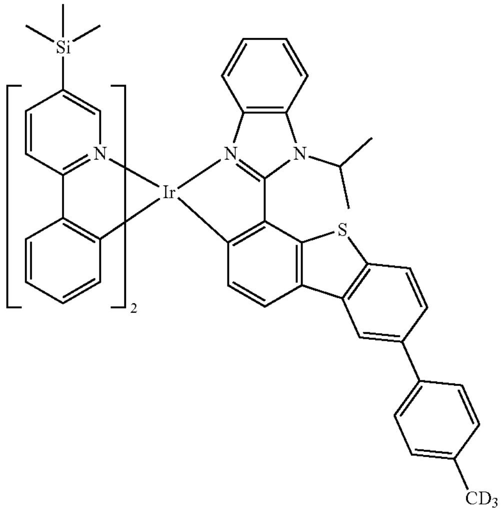
2413
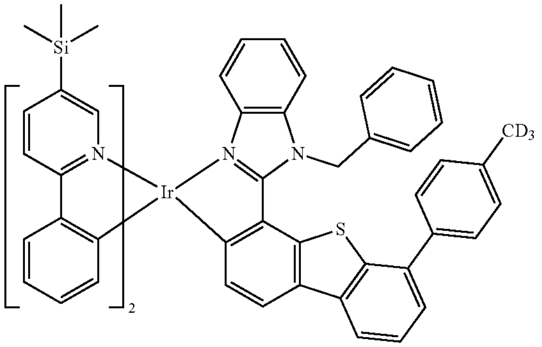
2414
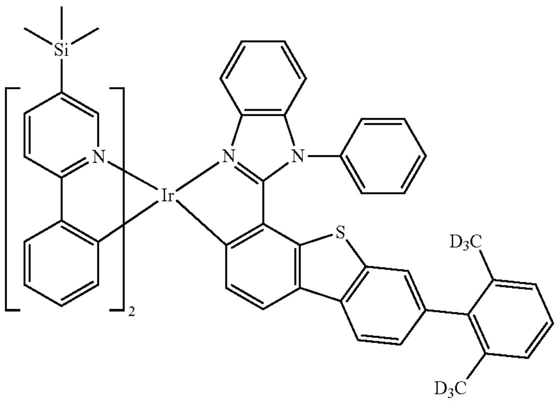

-continued
2415
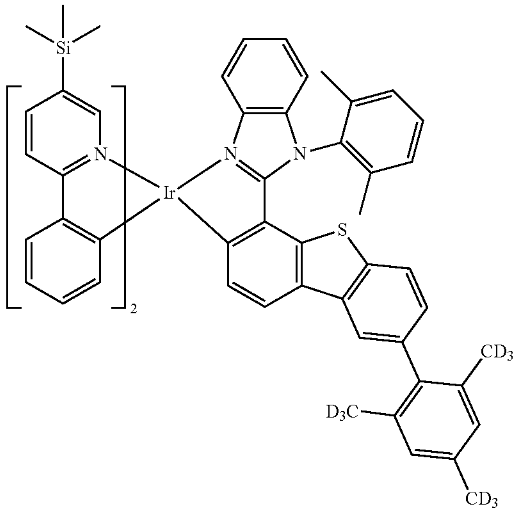
2416
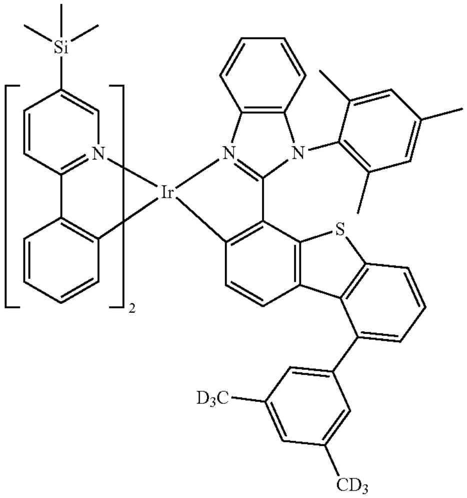
2417
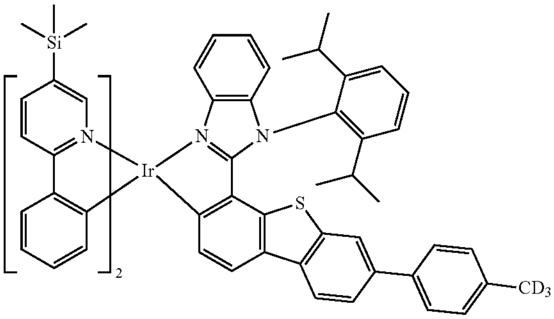
-continued
2418
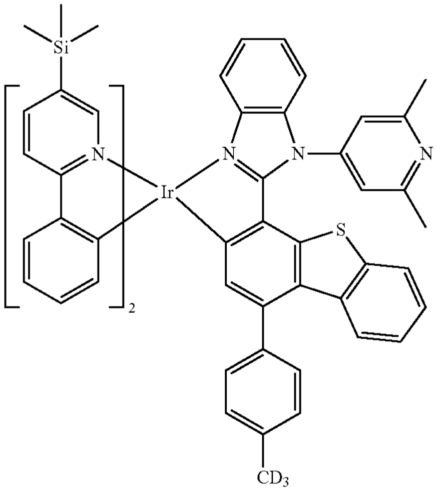
2419
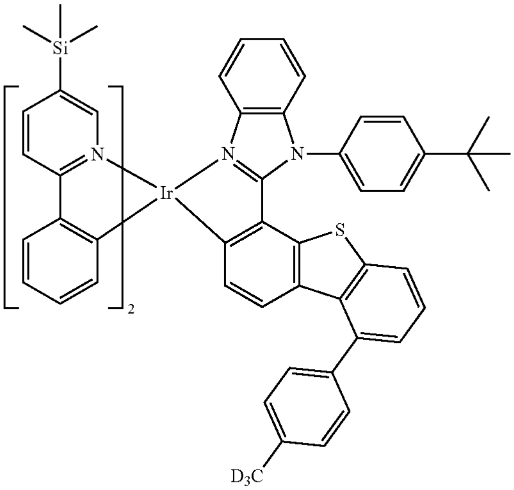
2420
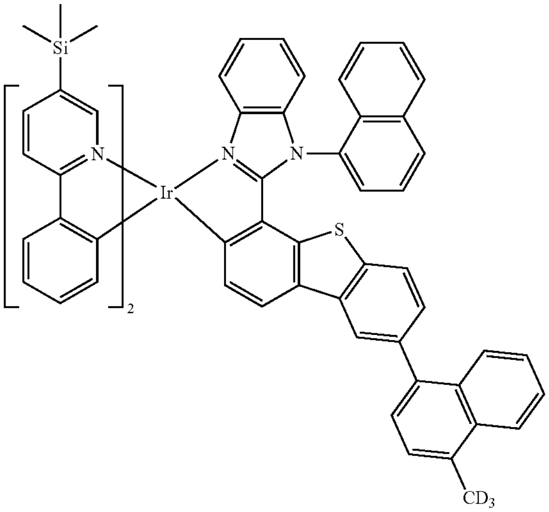

2421
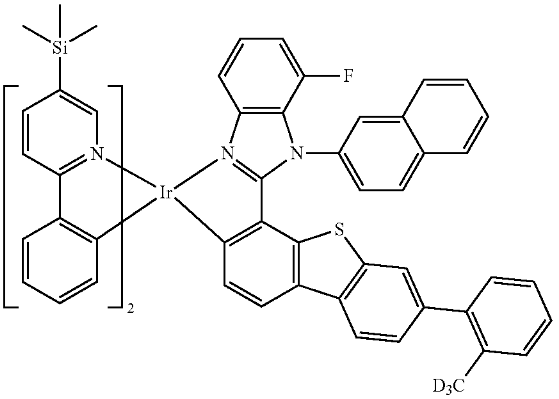
2422
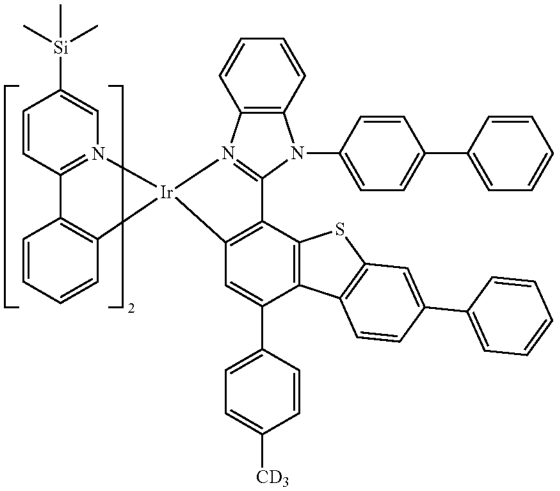
2423
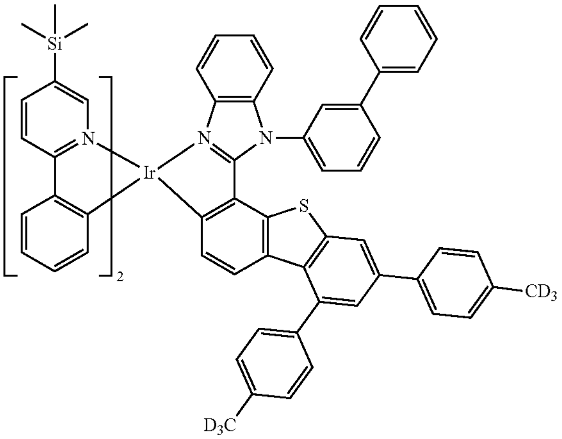
2424
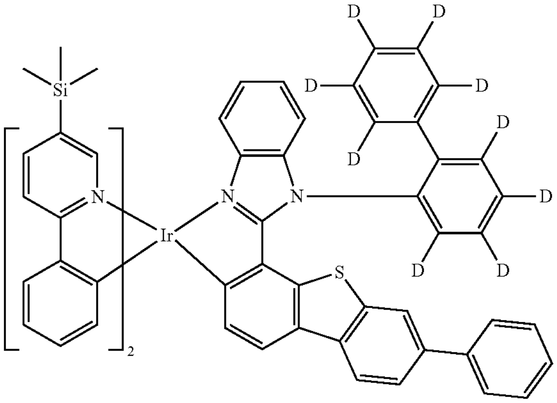
2425
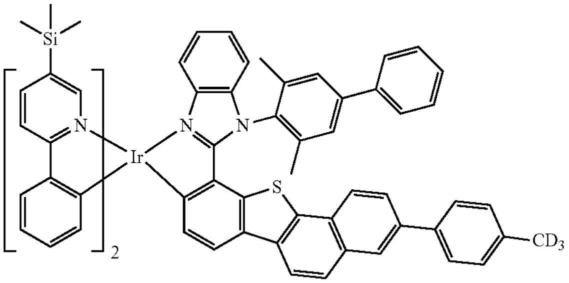
2426
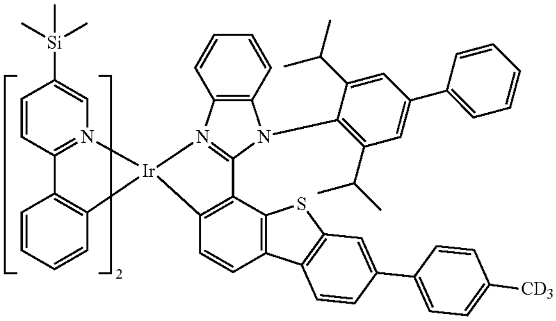
2427
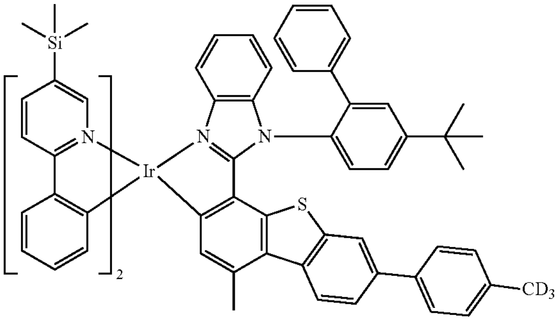

-continued
2428
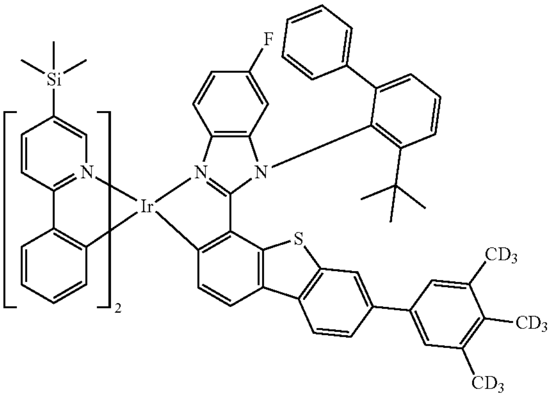
2429
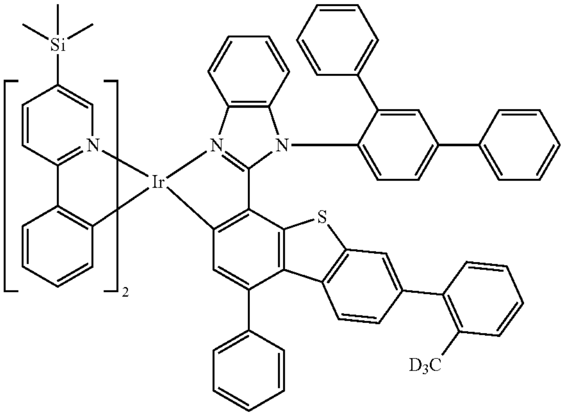
2430
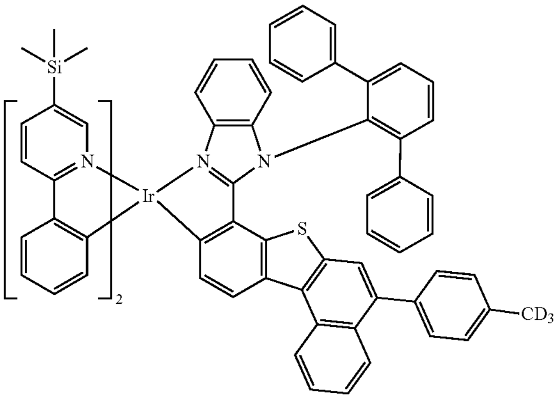
-continued
2431
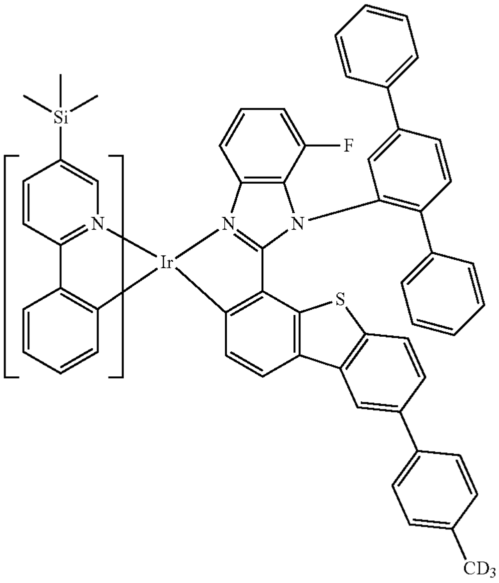
2432
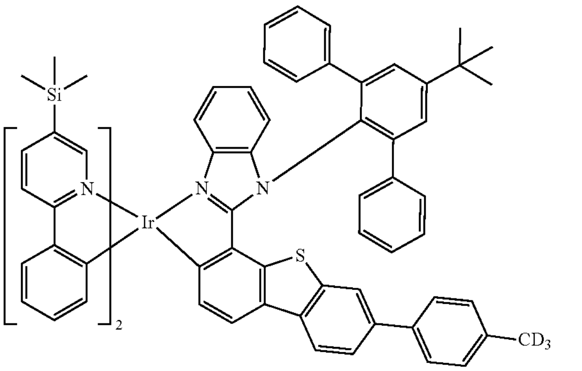
2433
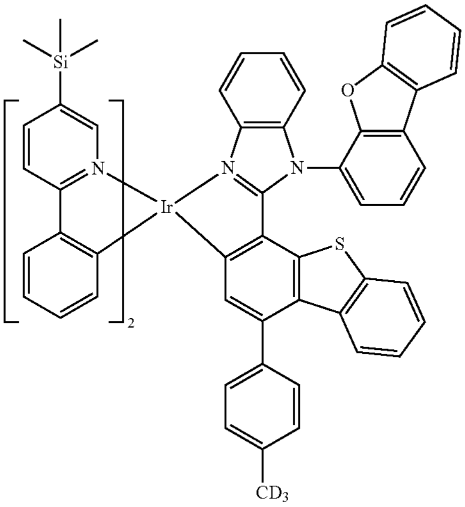

-continued
2434
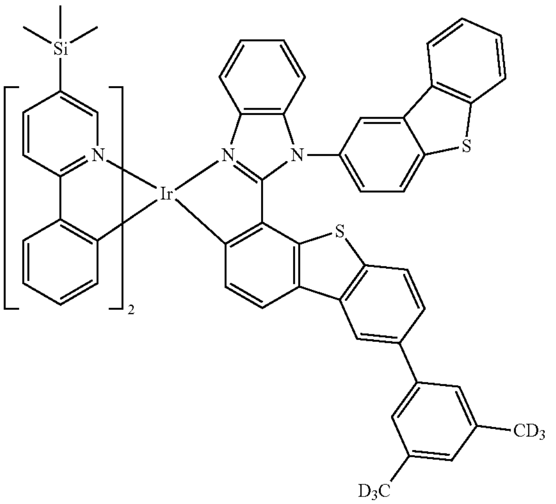
-continued
2435
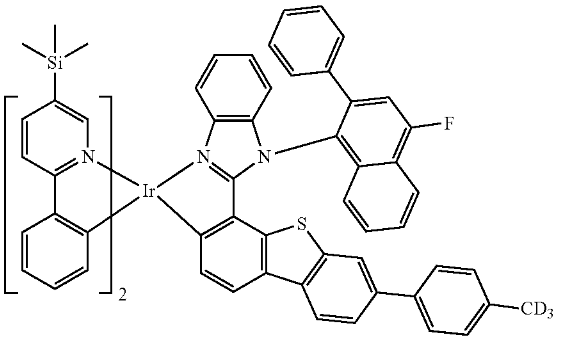
2436
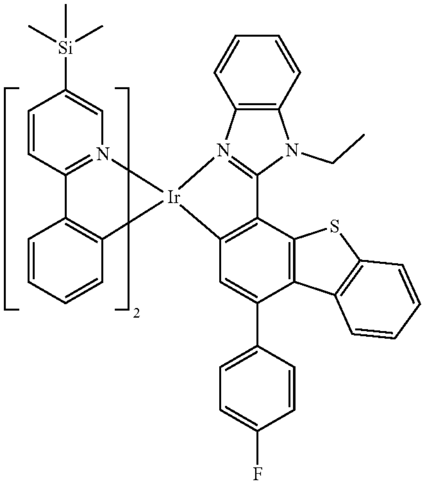
2437
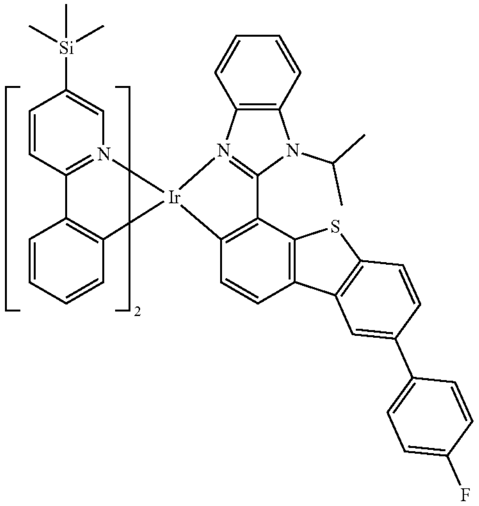
2438
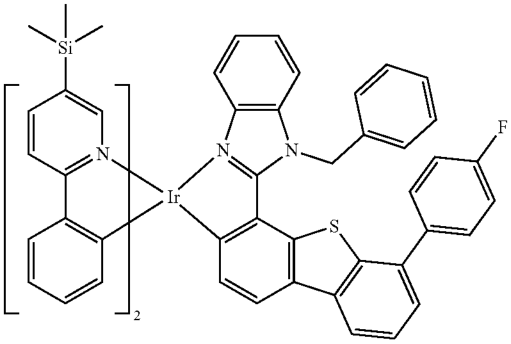
2439
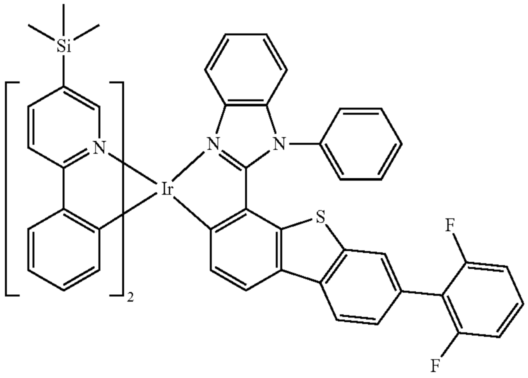

-continued
2440
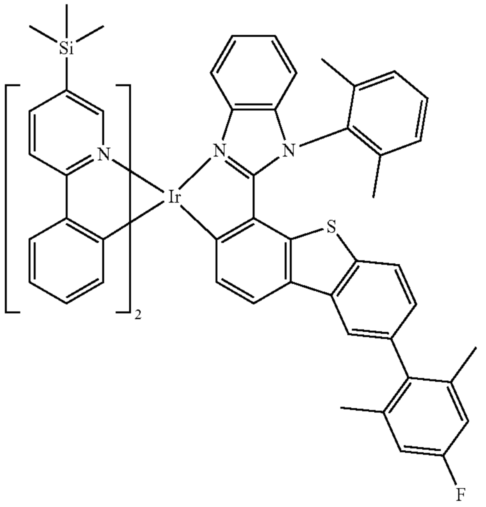
2441
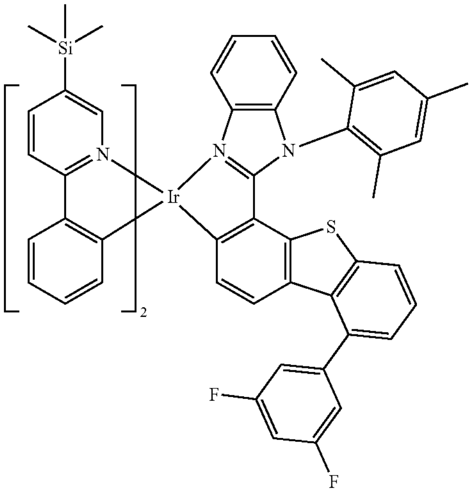
2442
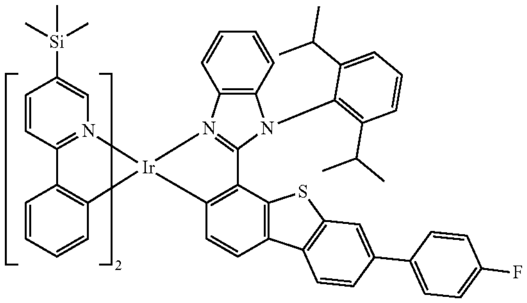
2443
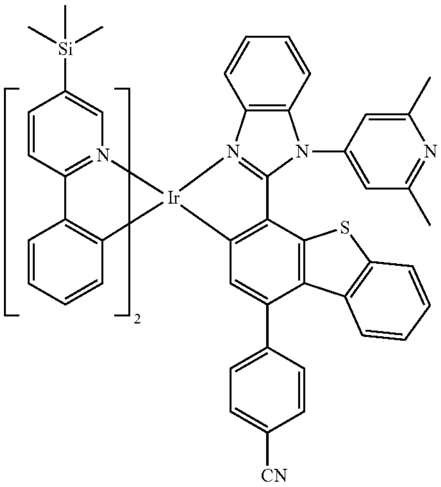
2444
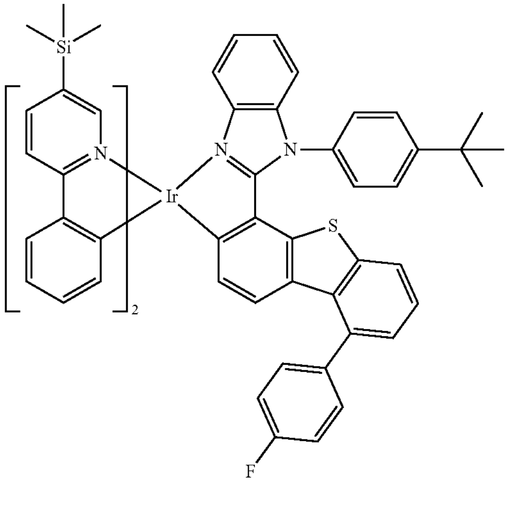
2445
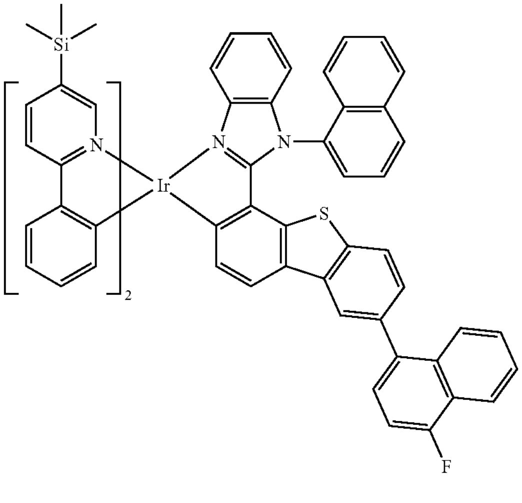

-continued
2446
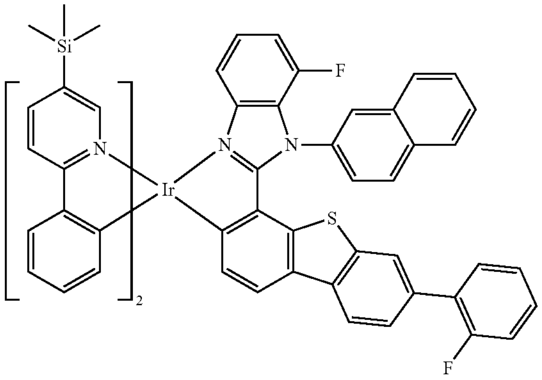
2447
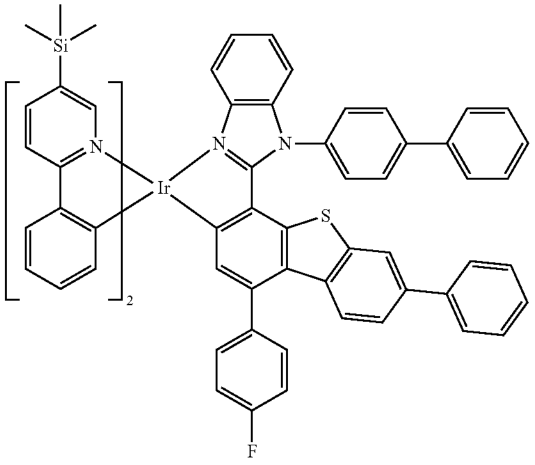
2448
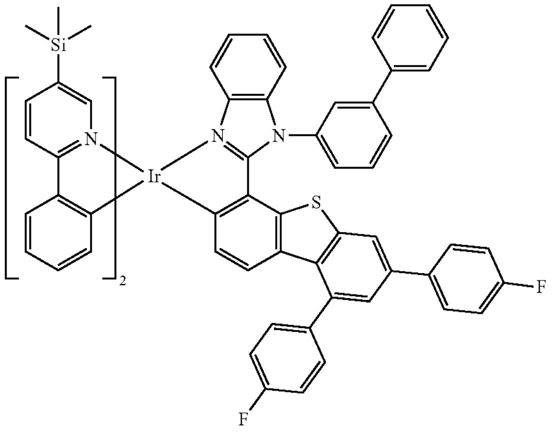
2449
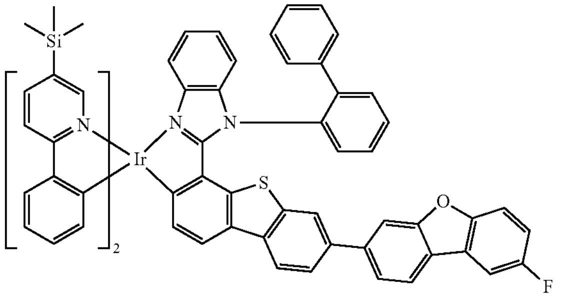
2450
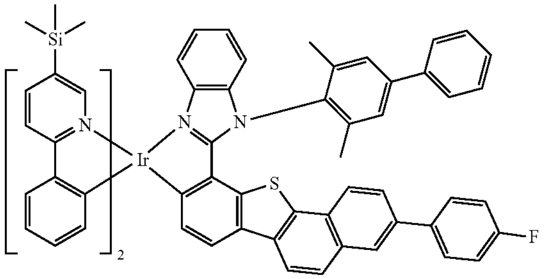
2451
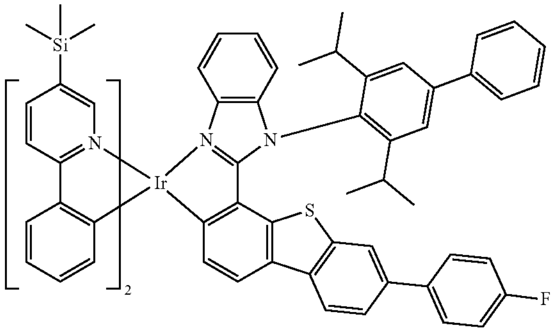

-continued
2452
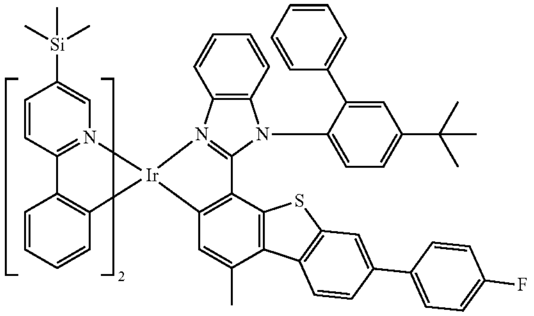
2453
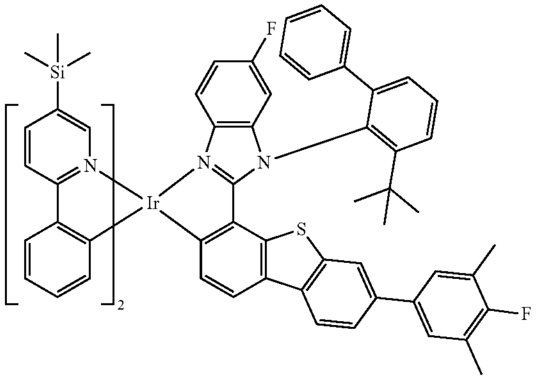
2454
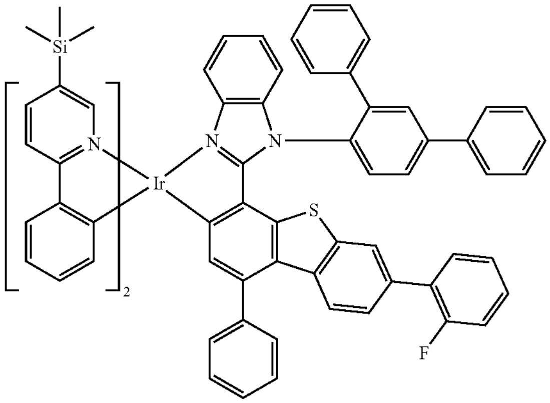
2455
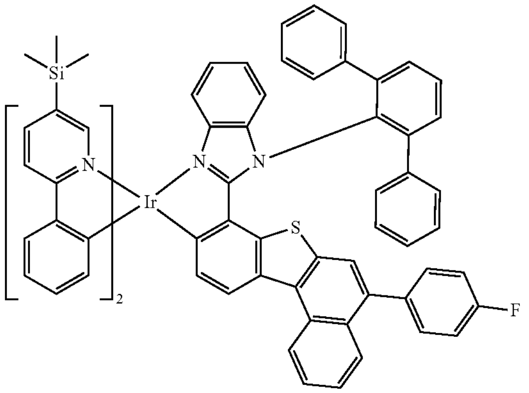
2456
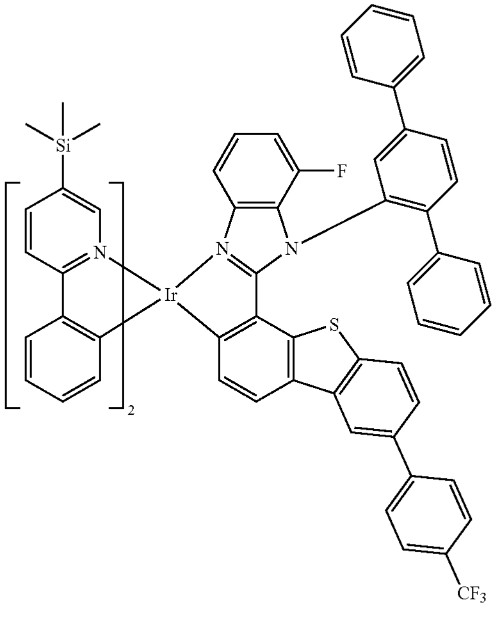
2457
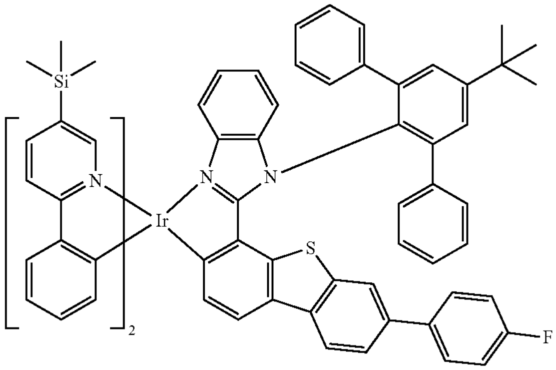

-continued
2458
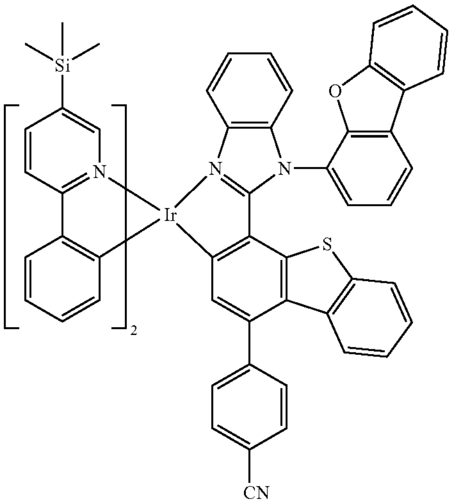
2459
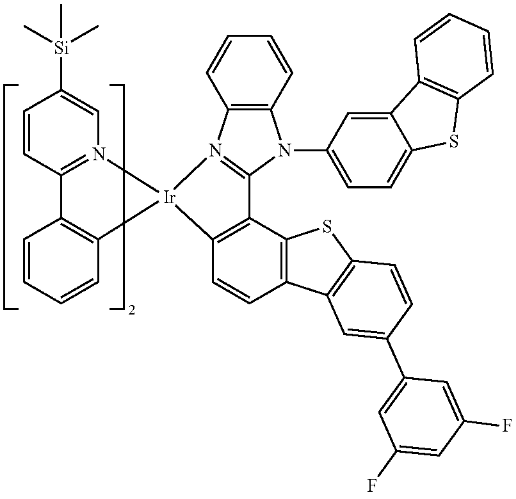
2460
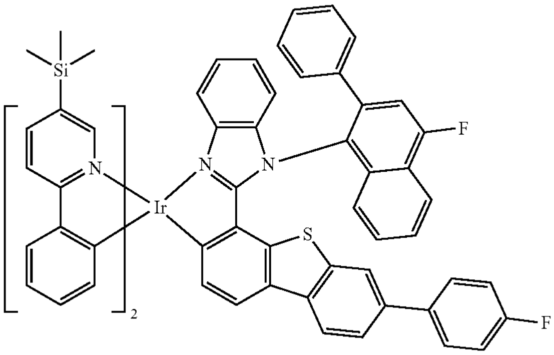
2461
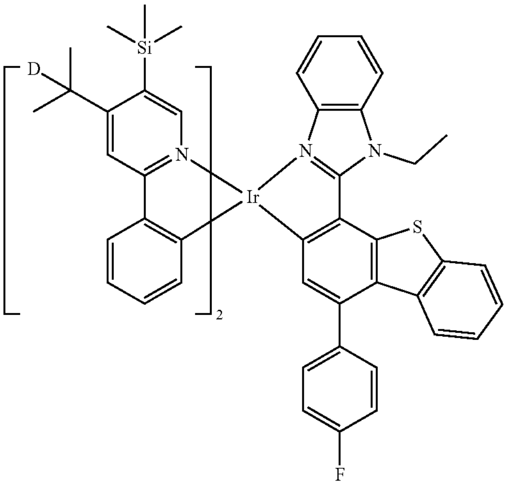
2462
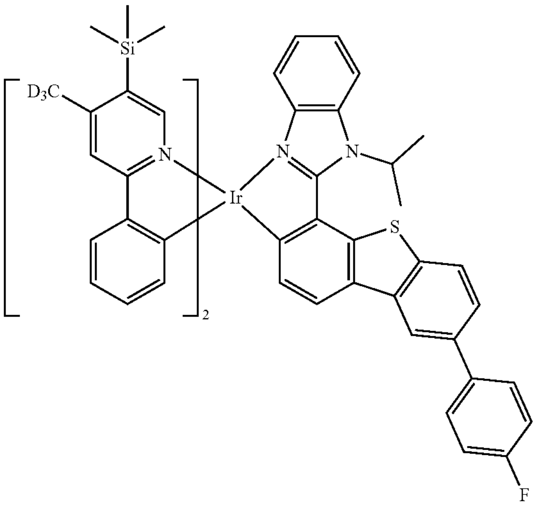
2463
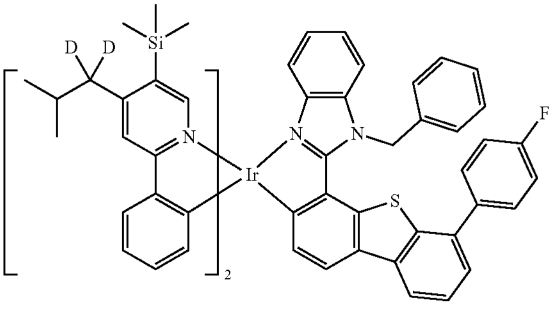

-continued
2464
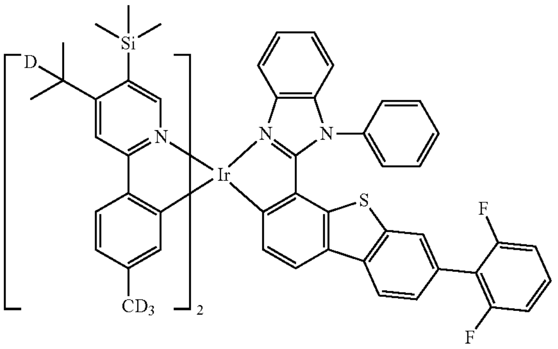
2465
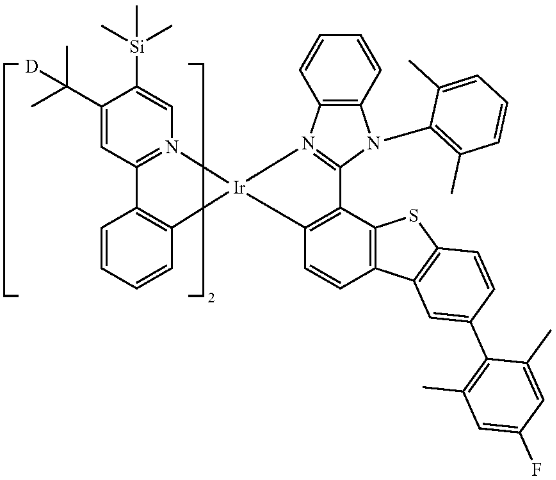
2466
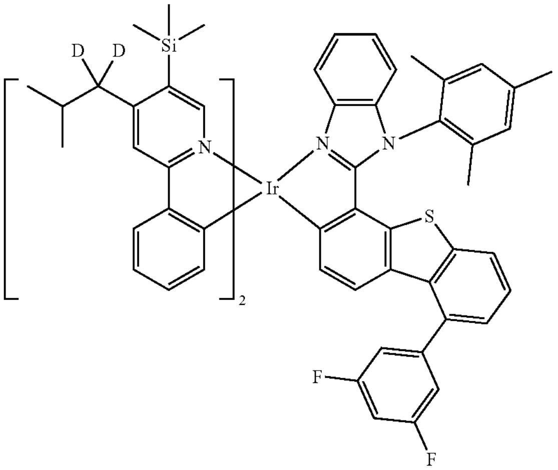
2467
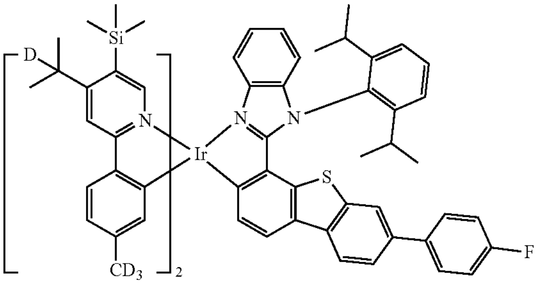
2468
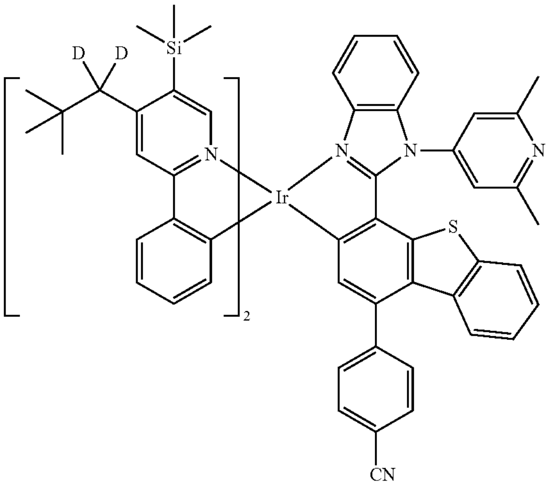
2469
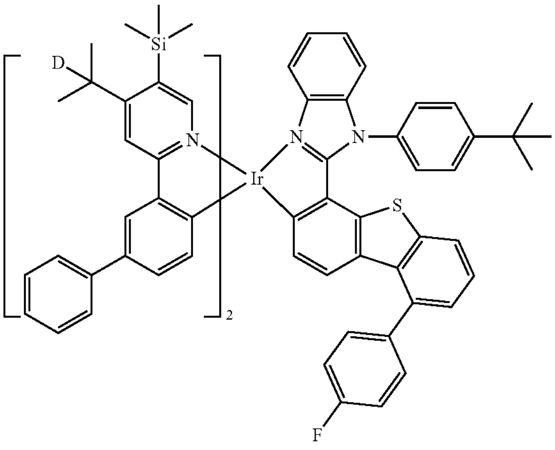

-continued
2470
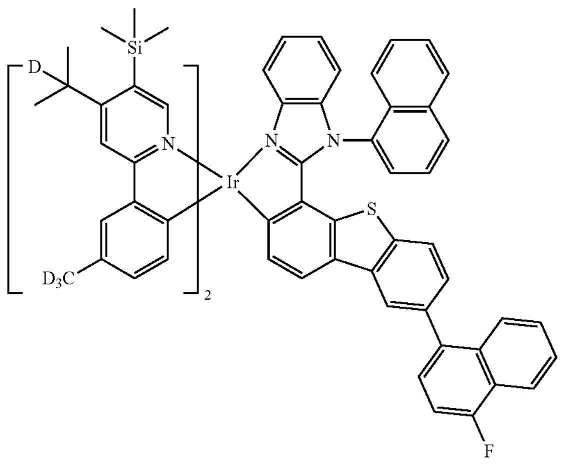
2471
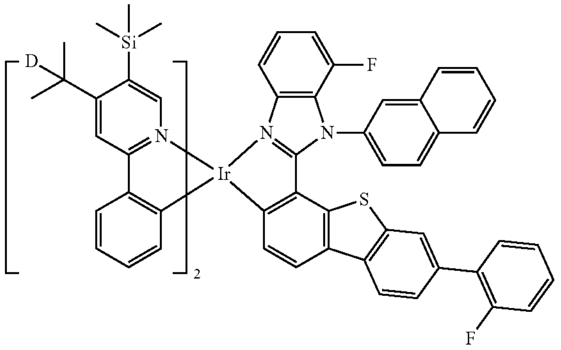
2472
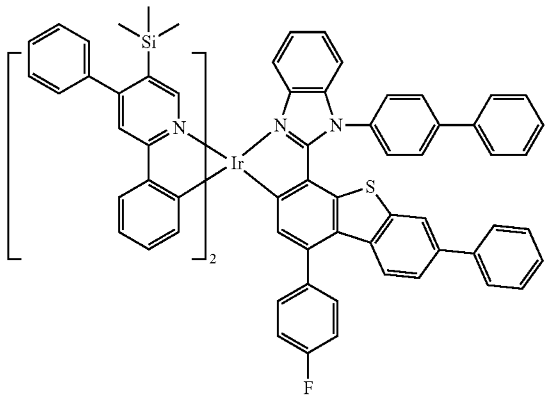
2473
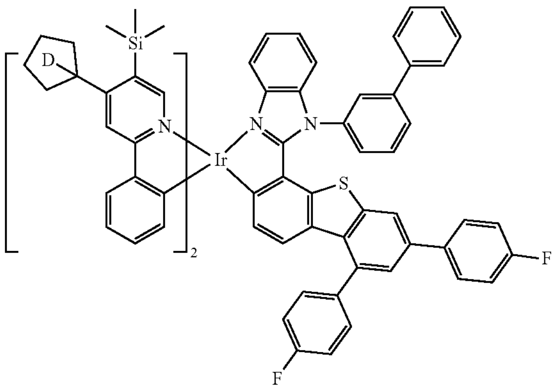
2474
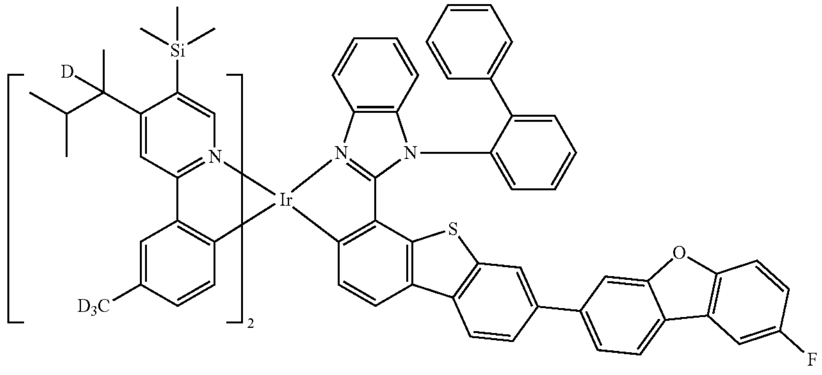
2475
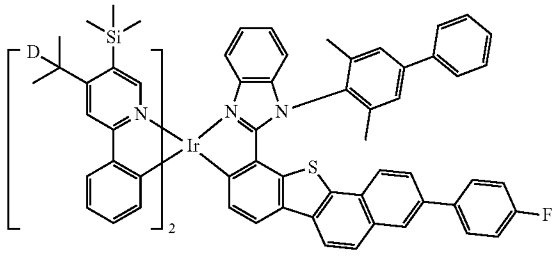
2476
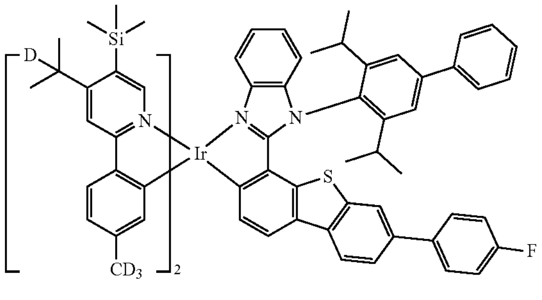

-continued
2477
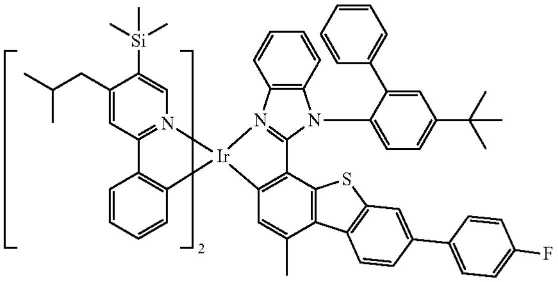
2478
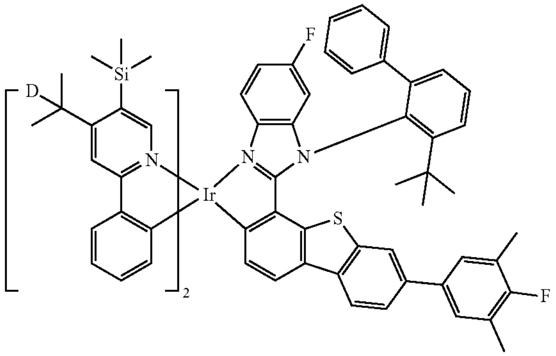
2479
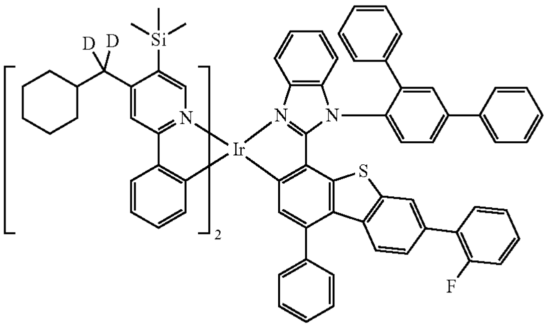
2480
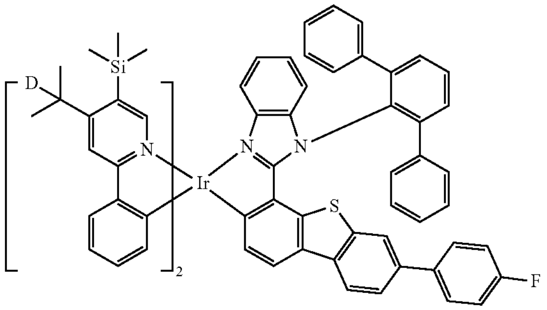
2481
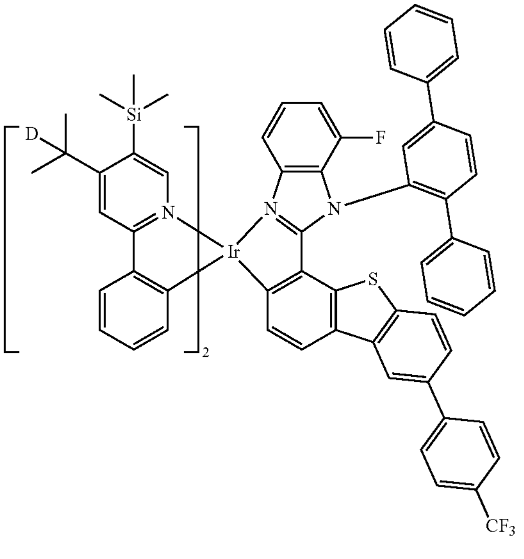
2482
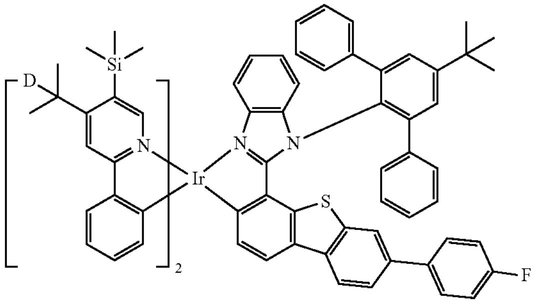

-continued
2483
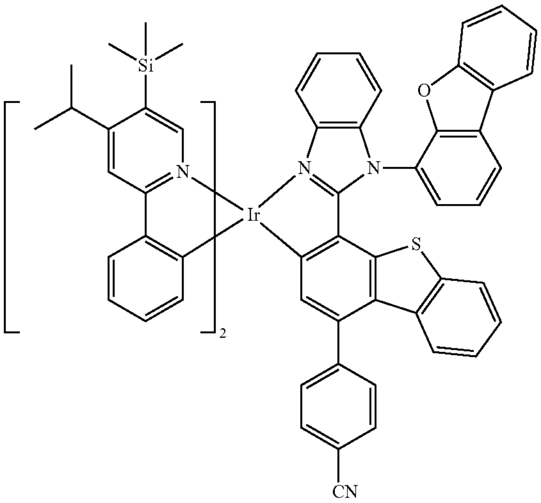
2484
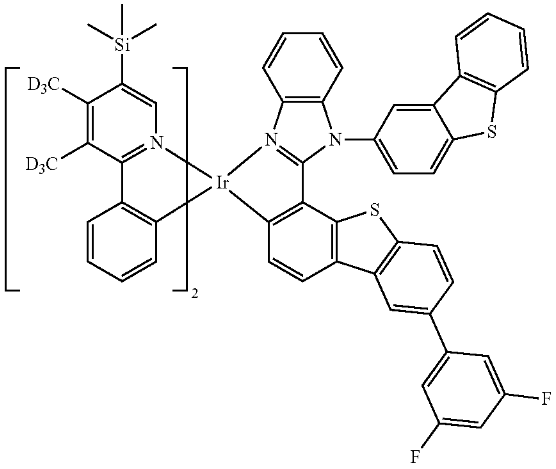
2485
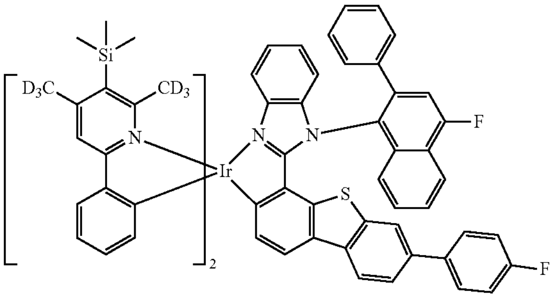
2486
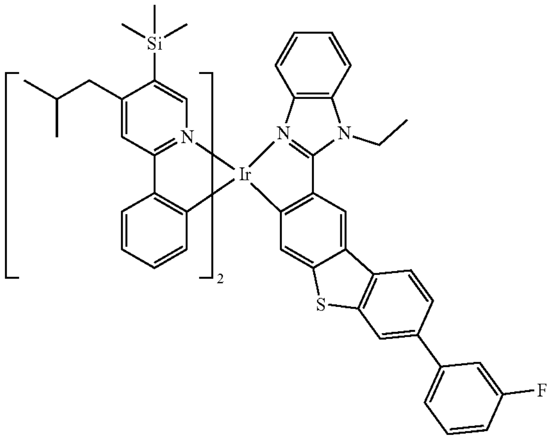
2487
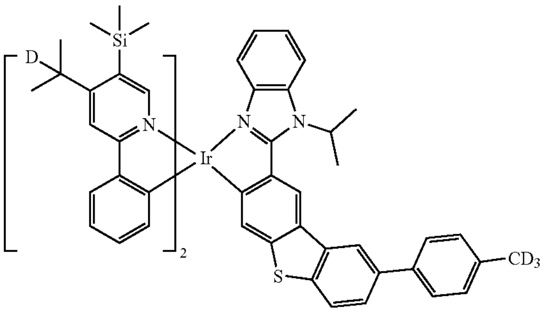
2488
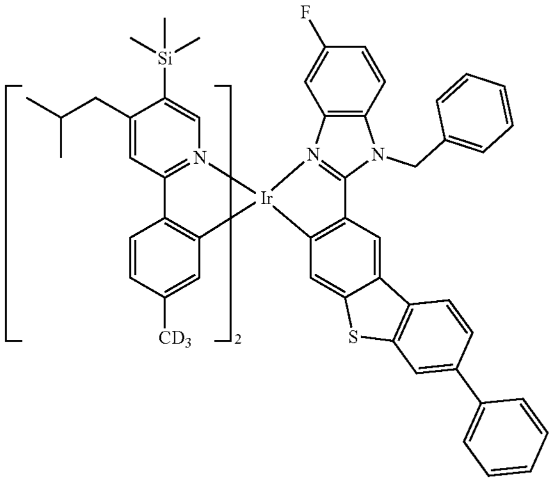

-continued
2489
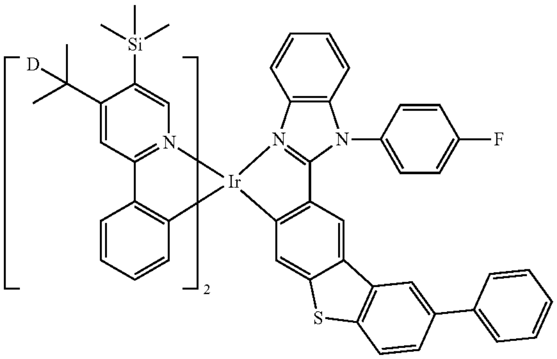
2490
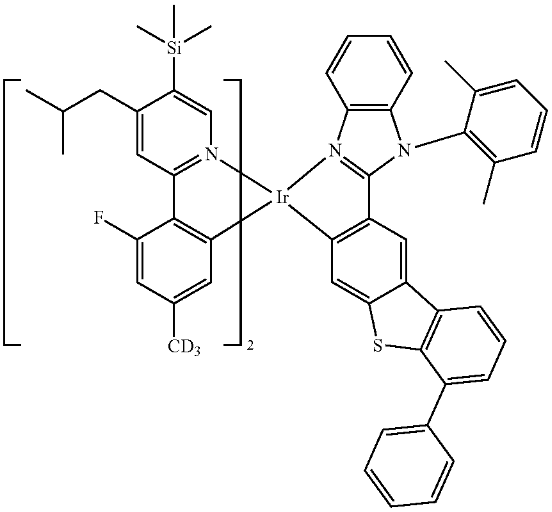
2491
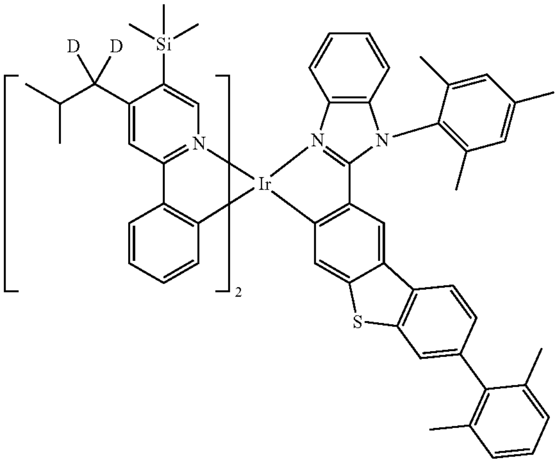
2492
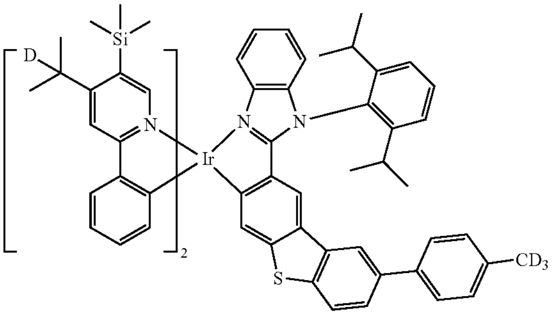
2493
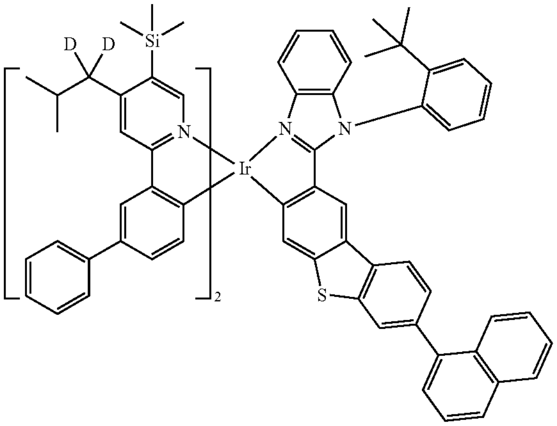
2494
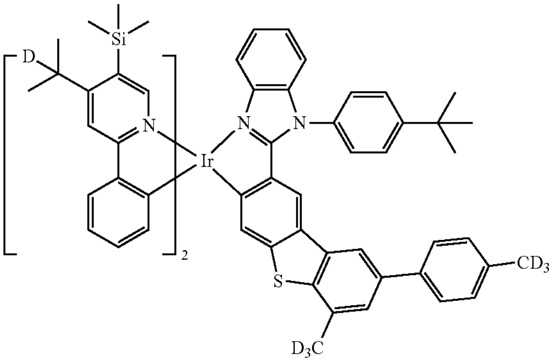

-continued
2495
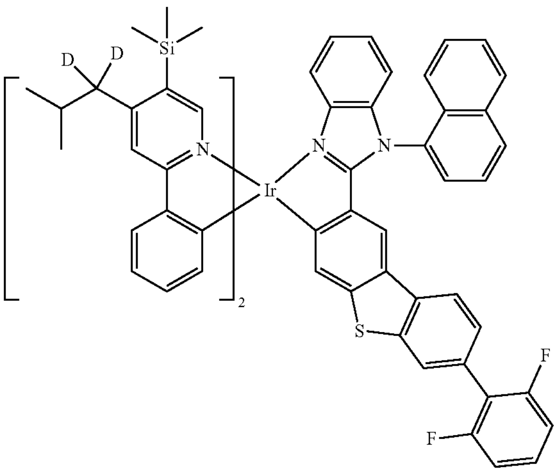
2496
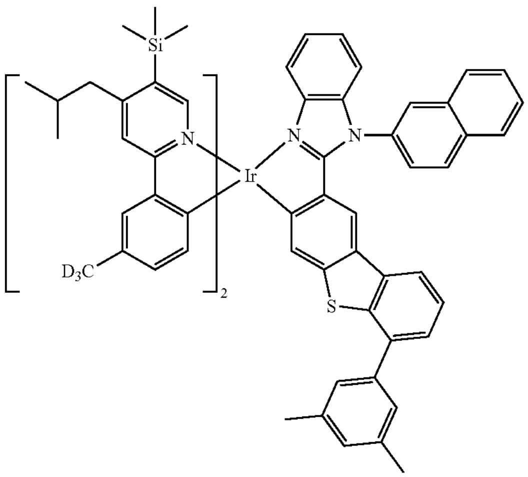
2497
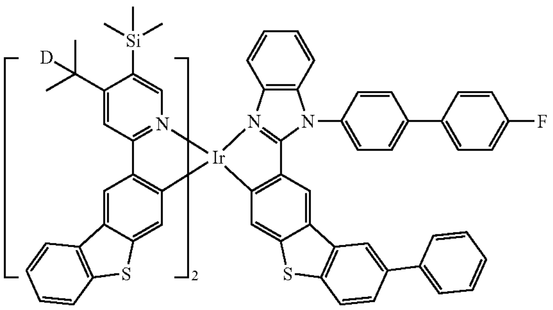
2498
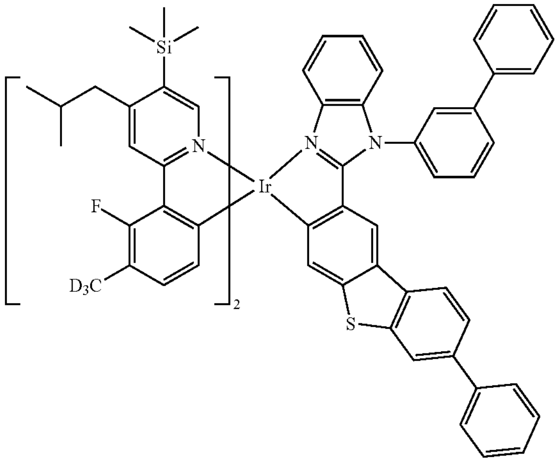
2499
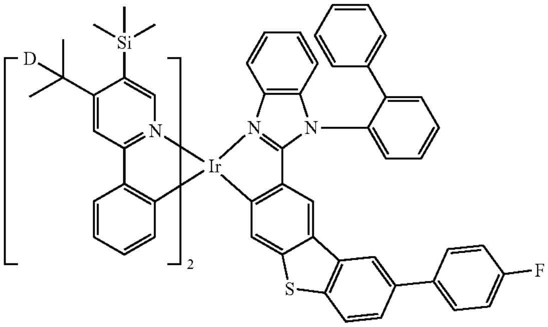
2500
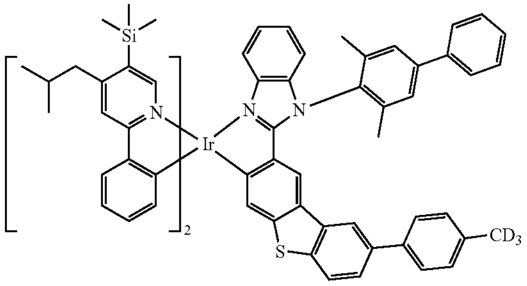

-continued
2501
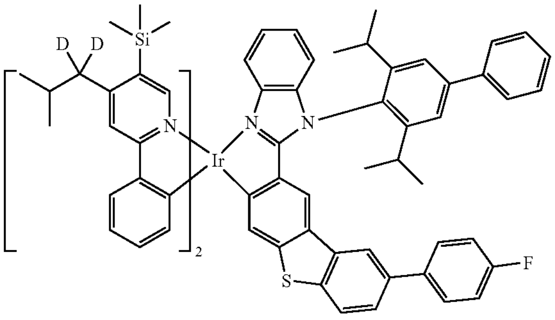
2502
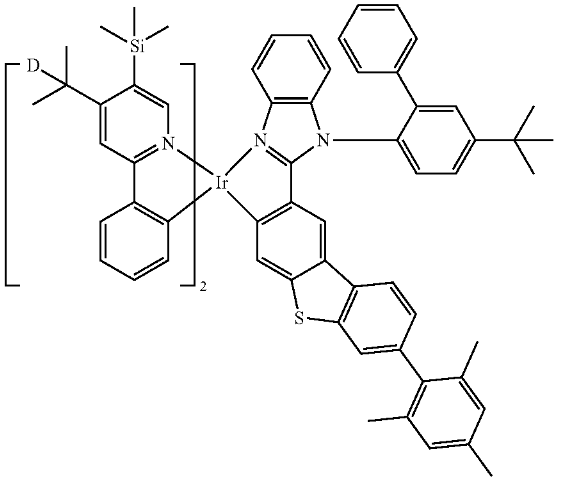
2503
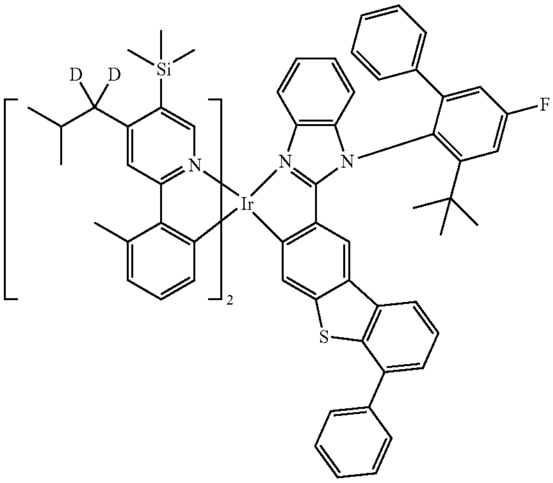
2504
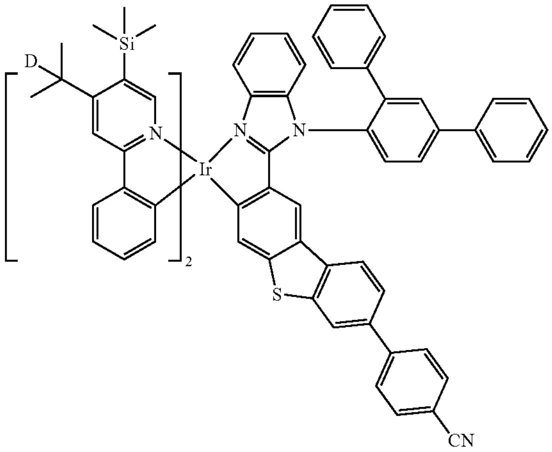
2505
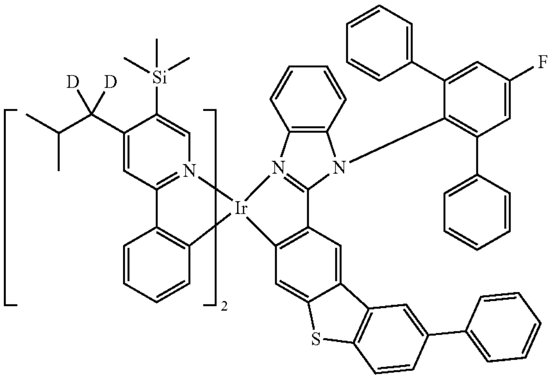
2506
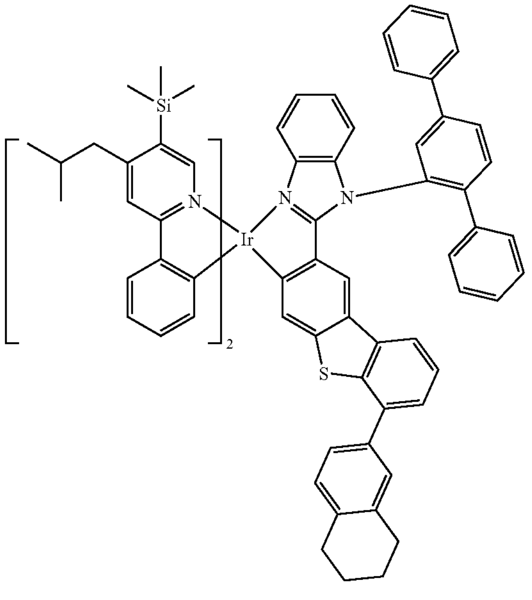

-continued
2507
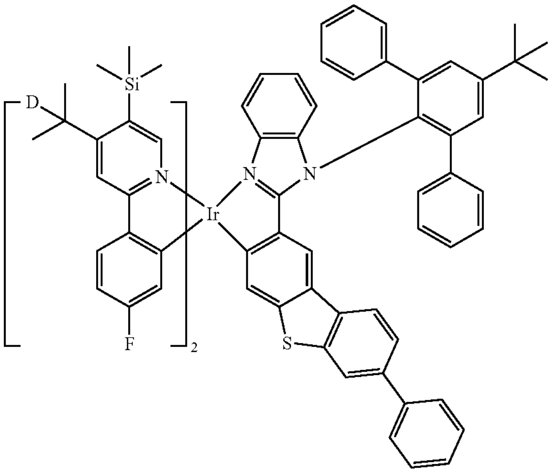
2508
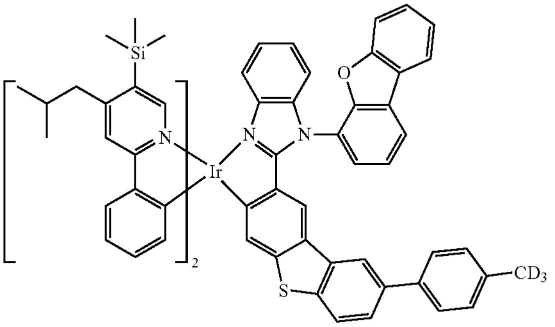
2509
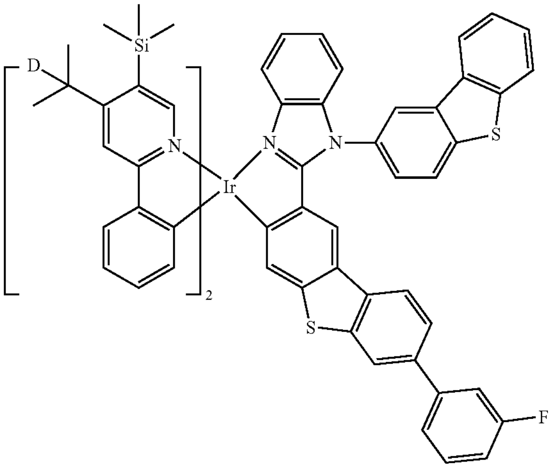
2510
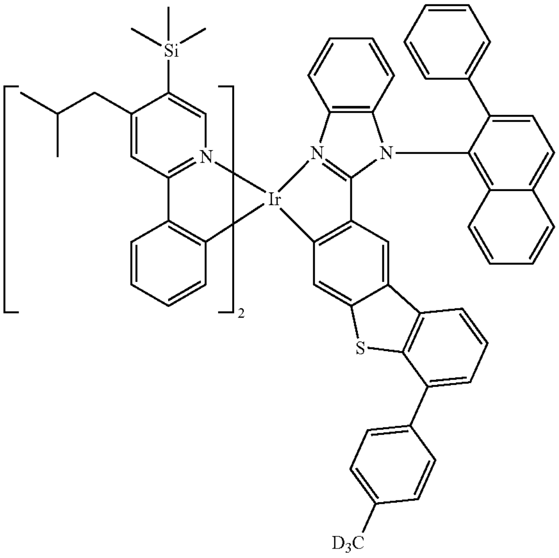
2511
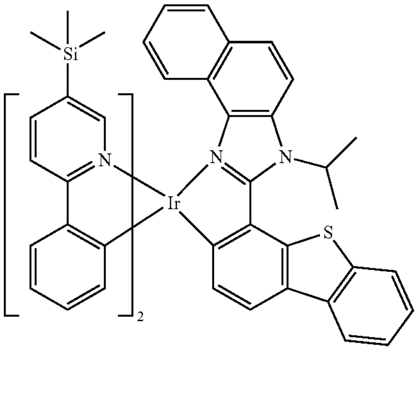
2512
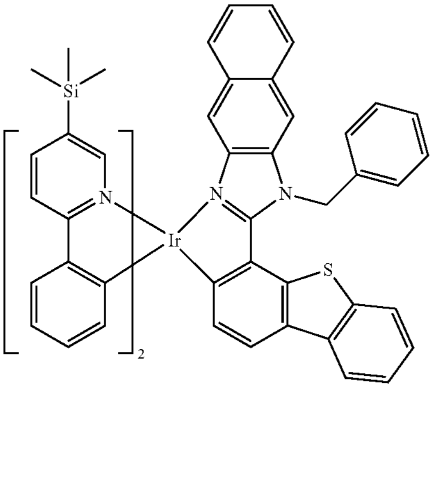

-continued
2513
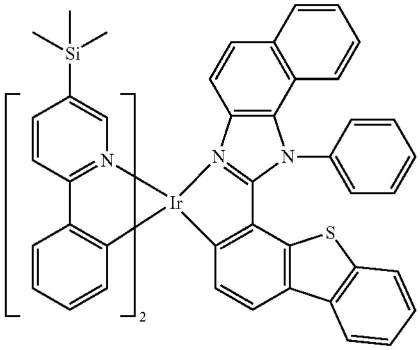
2514
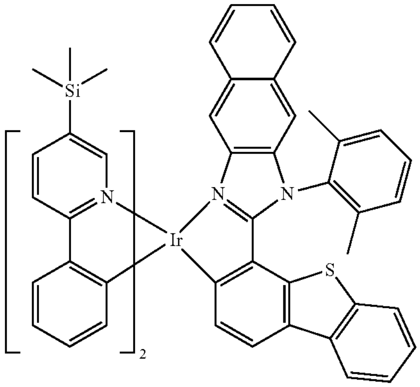
2515
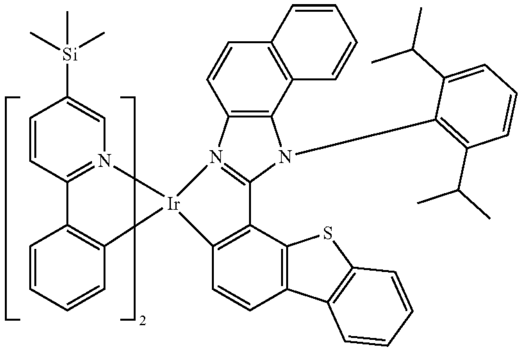
2516
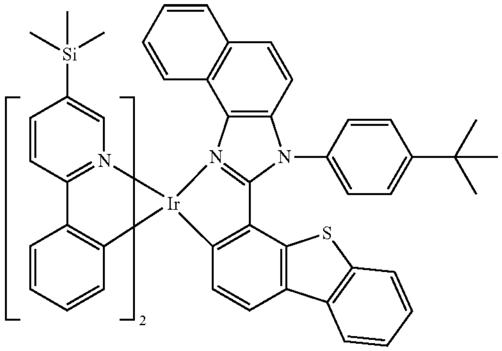
2517
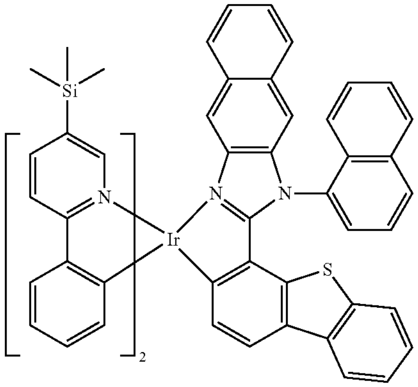
2518
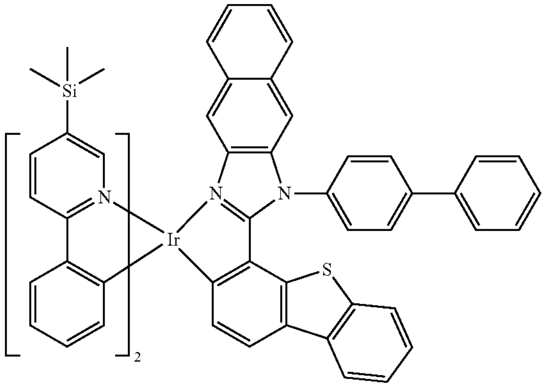
2519
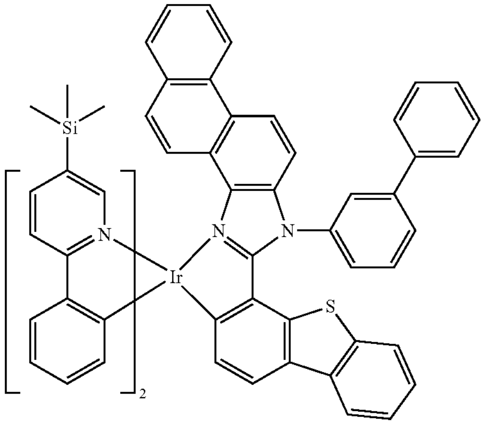
2520
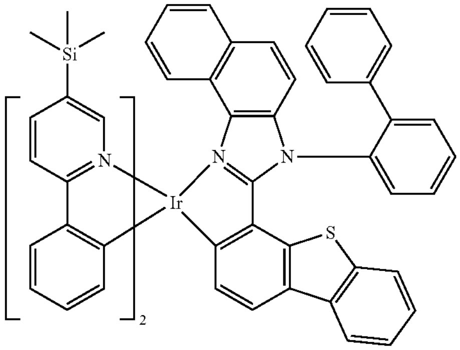

-continued
2521
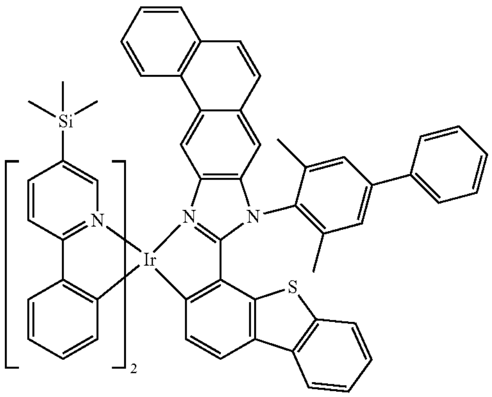
2522
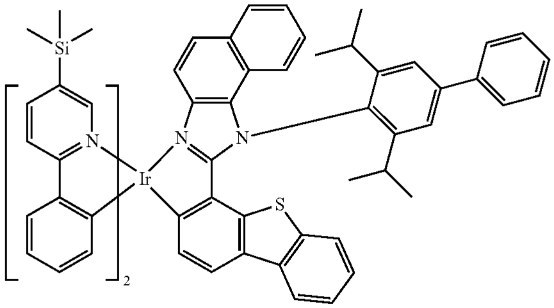
2523
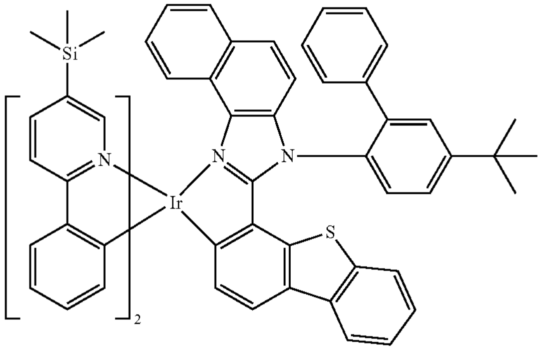
2524
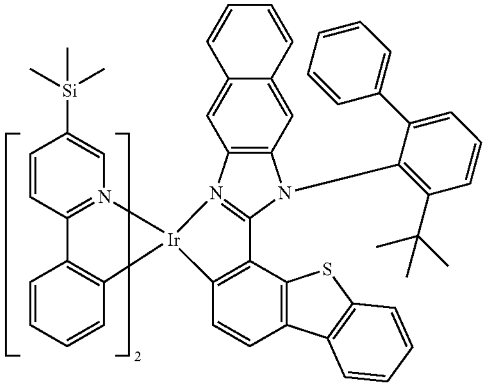
2525
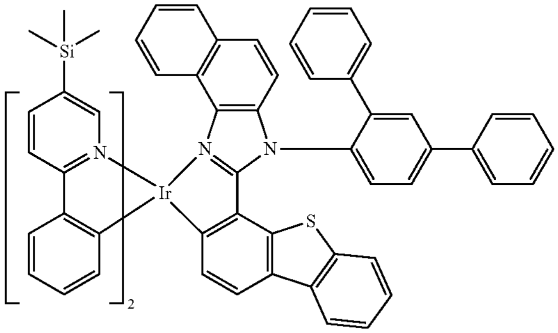
2526
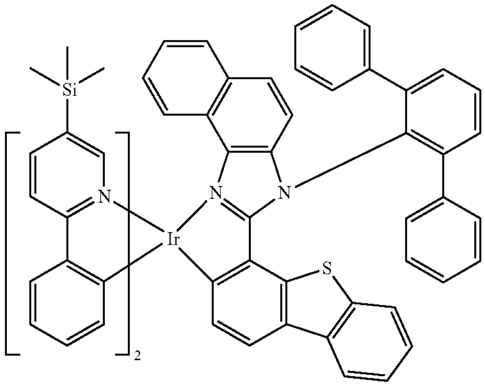

-continued
2527
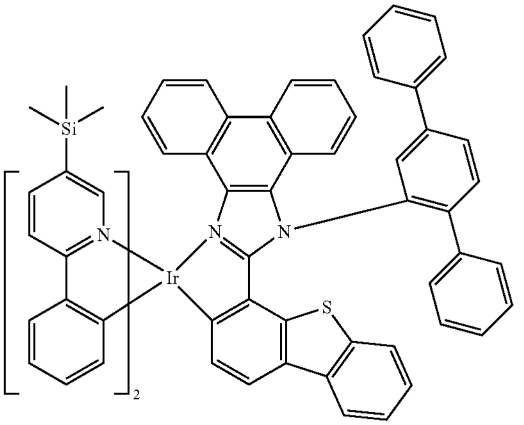
2528
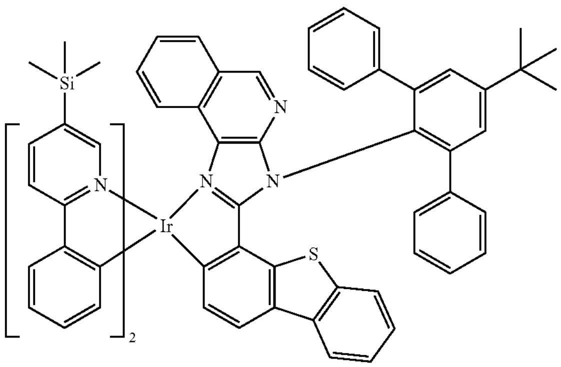
2529
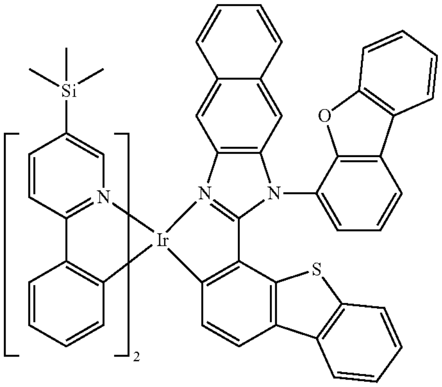
2530
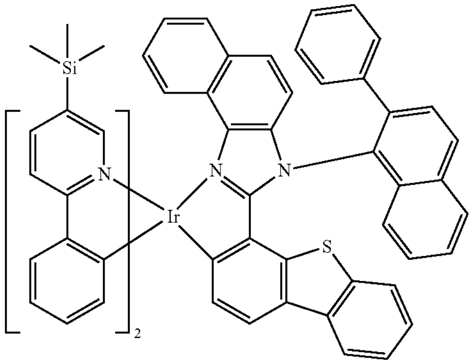
2531
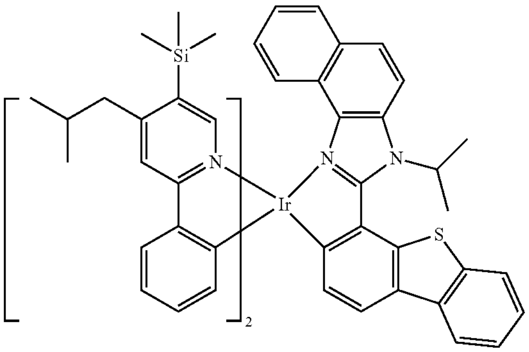
2532
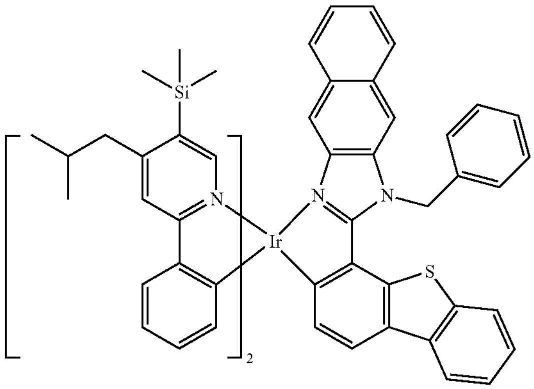
2533
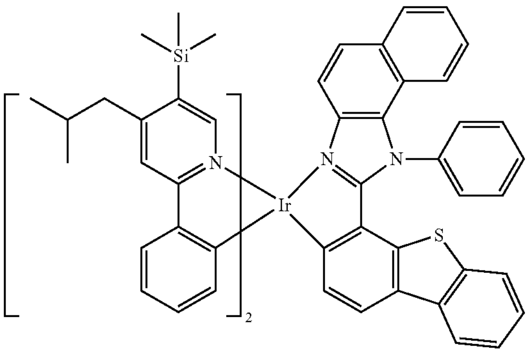
2534
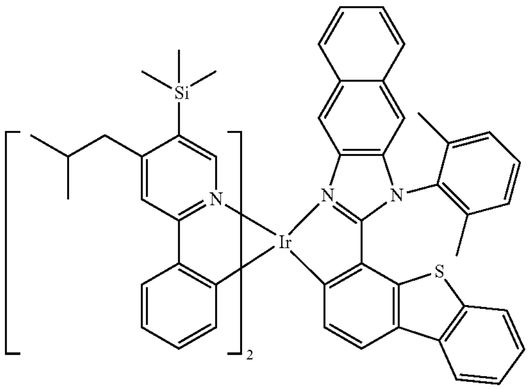

-continued
2535
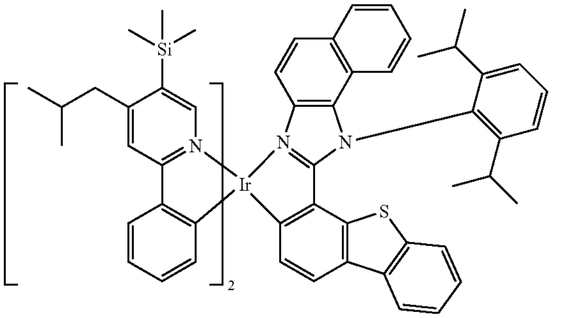
2536
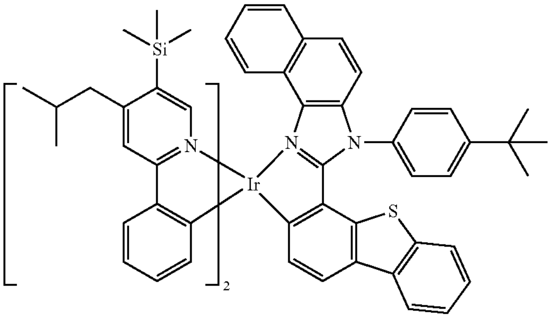
2537
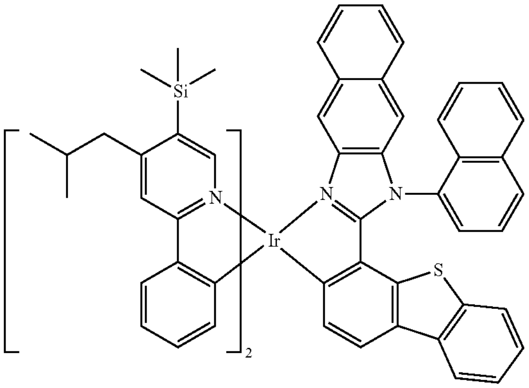
2538
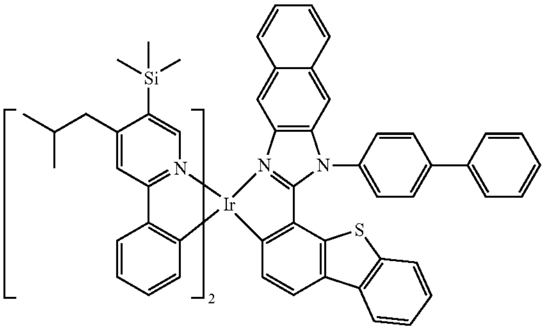
2539
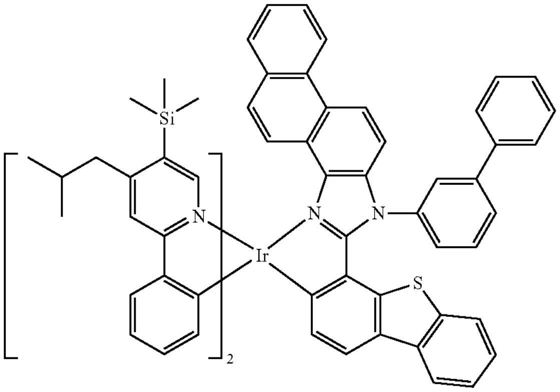
2540
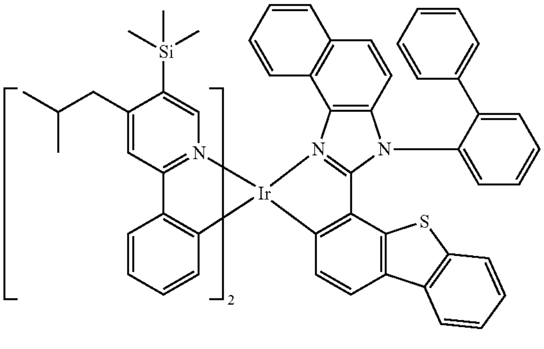
2541
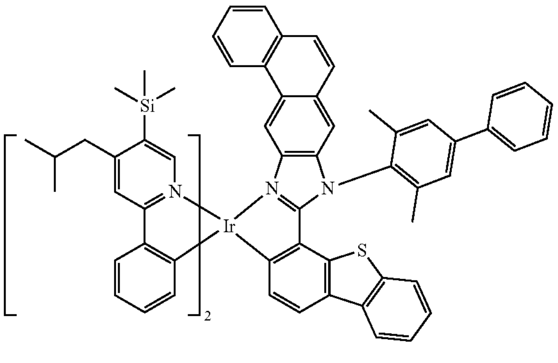
2542
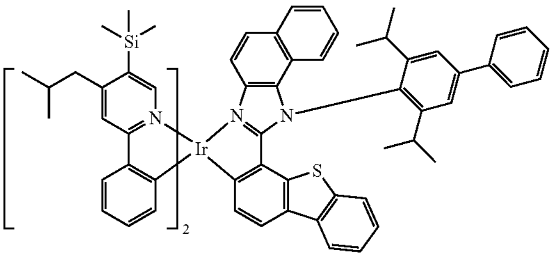

-continued
2543
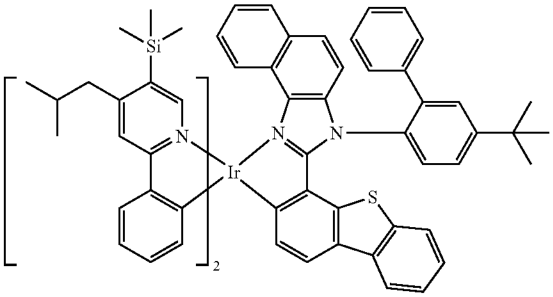
2544
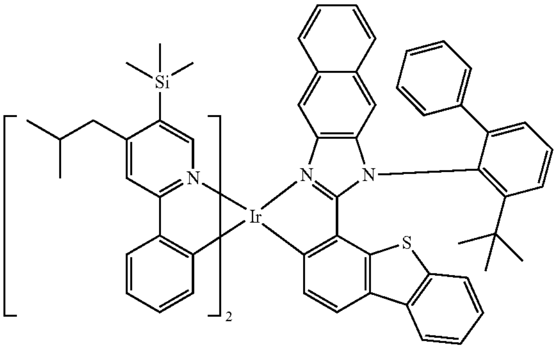
2545
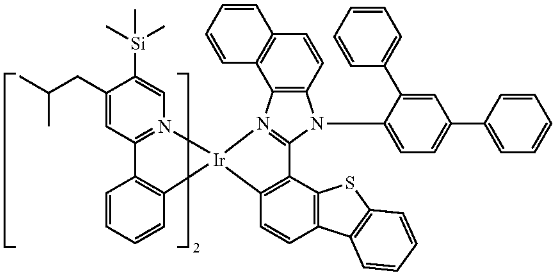
2546
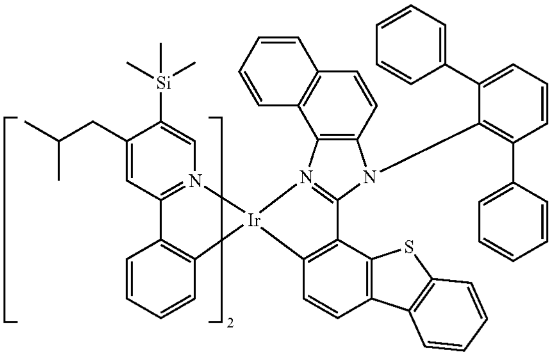
2547
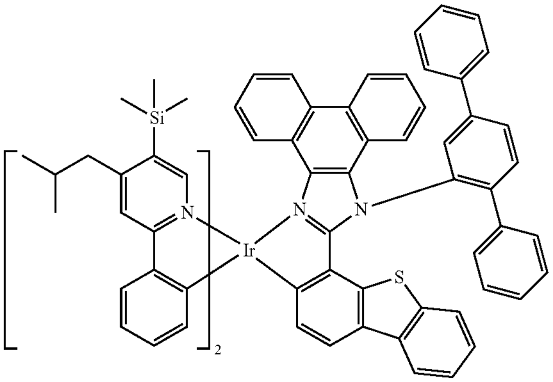
2548
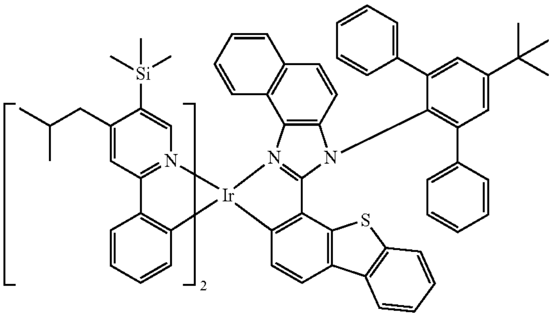
2549
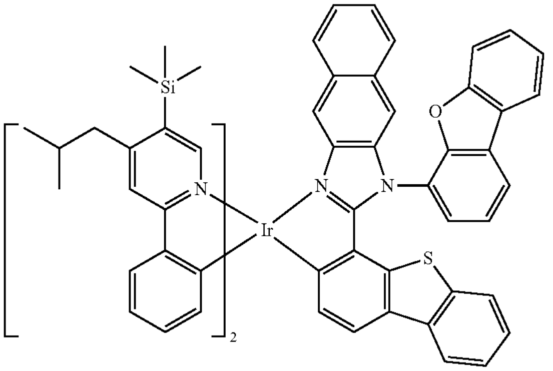
2550
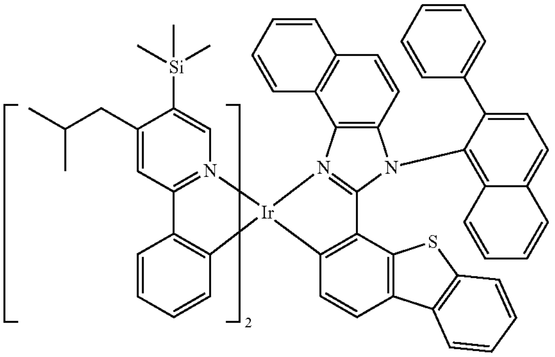

-continued
2551
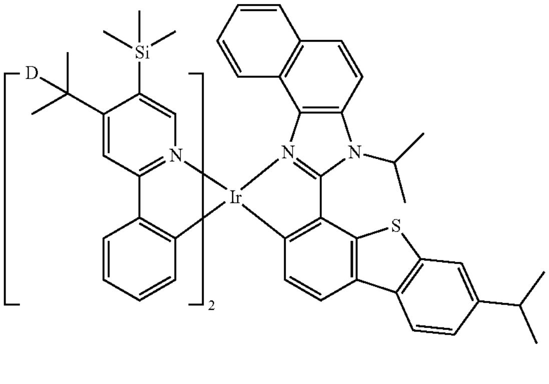
2552
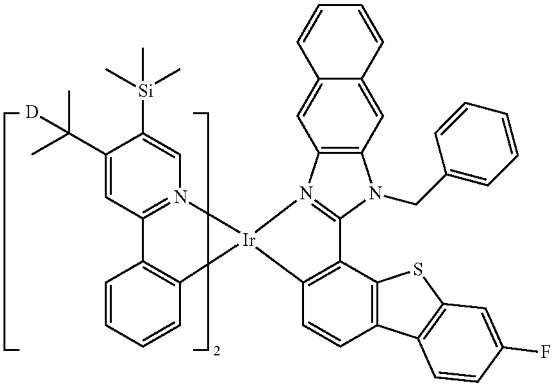
2553
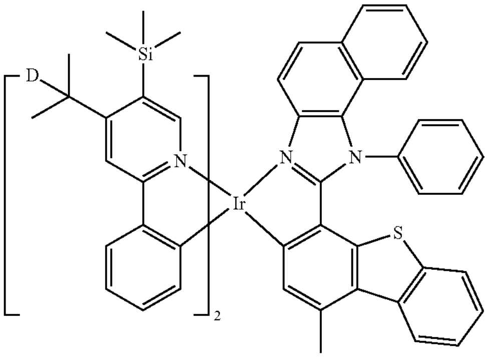
2554
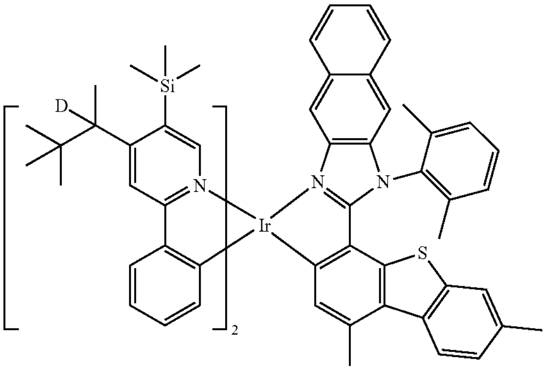
2555
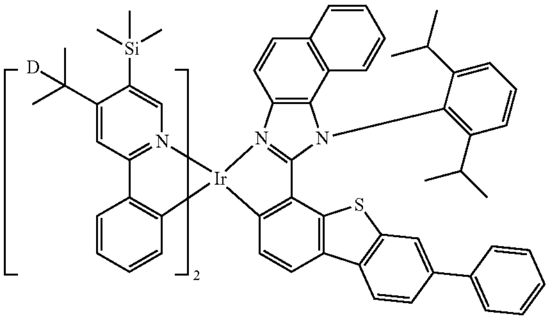
2556
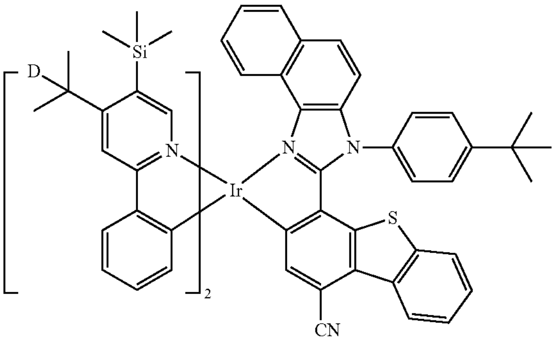
2557
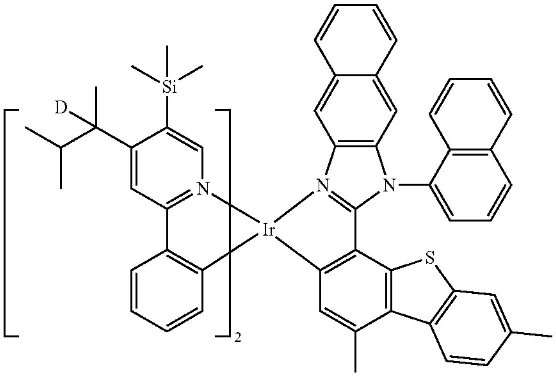
2558
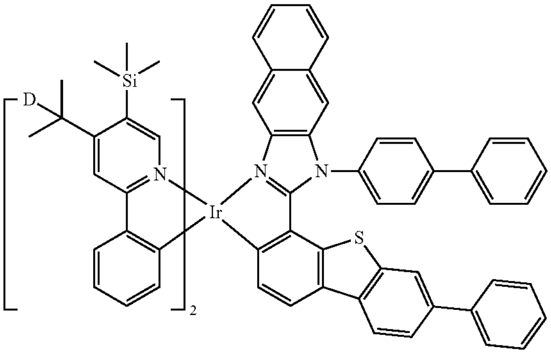

-continued
2559
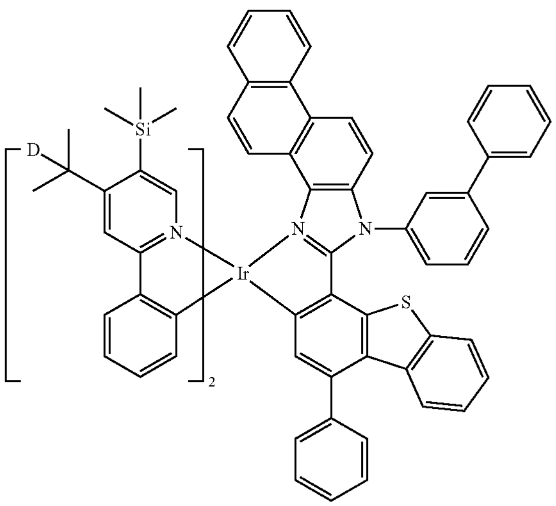
2560
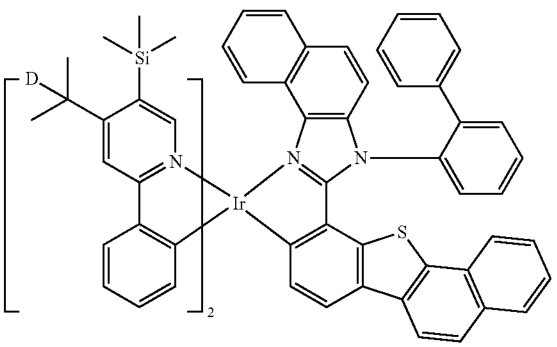
2561
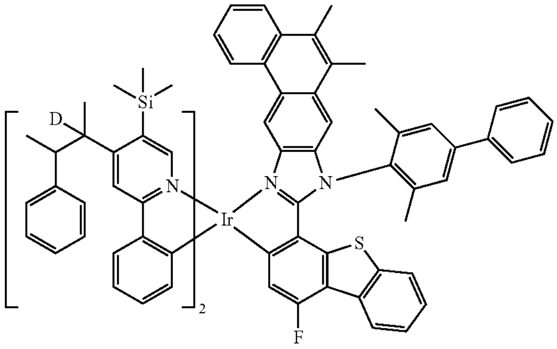
2562
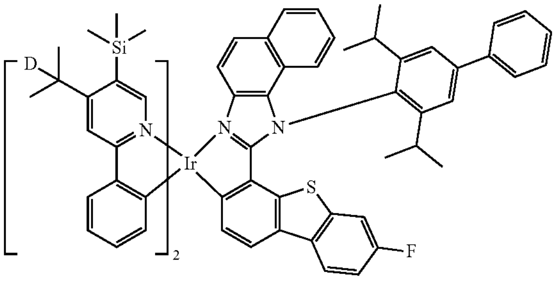
2563
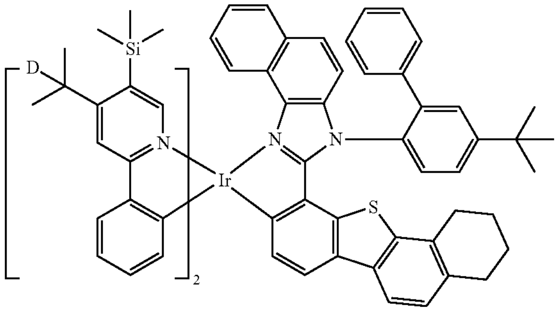
2564
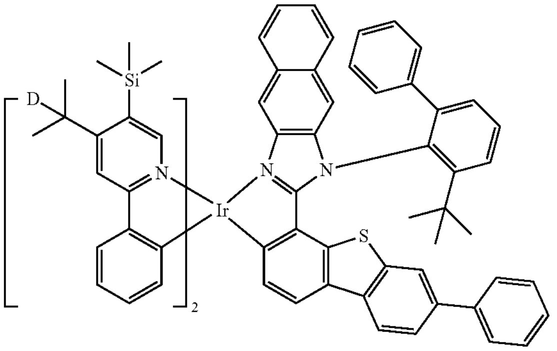
2565
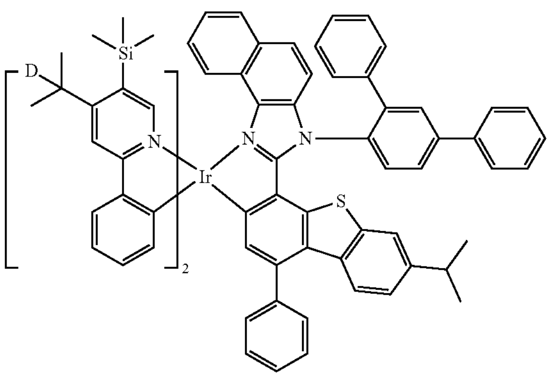
2566
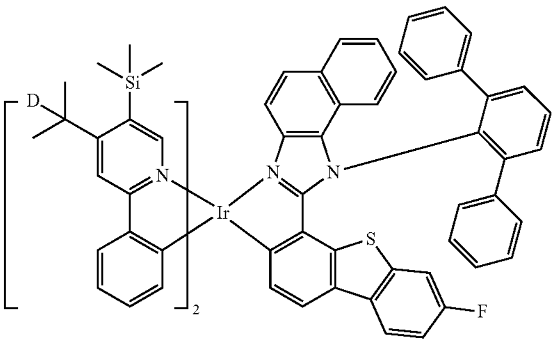

-continued
2567
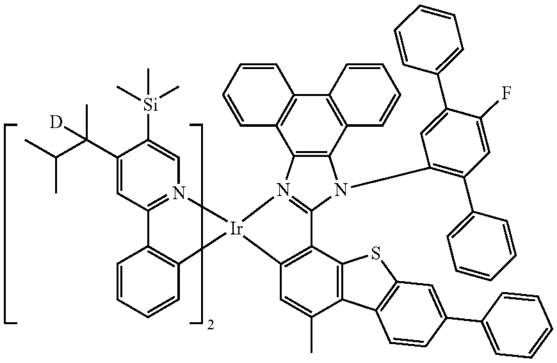
2568
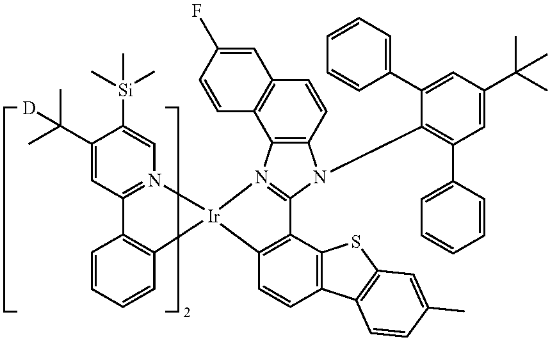
2569
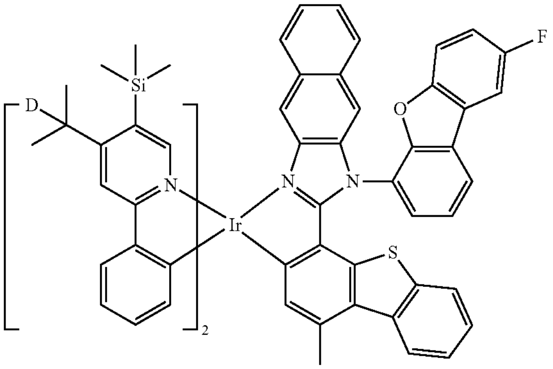
2570
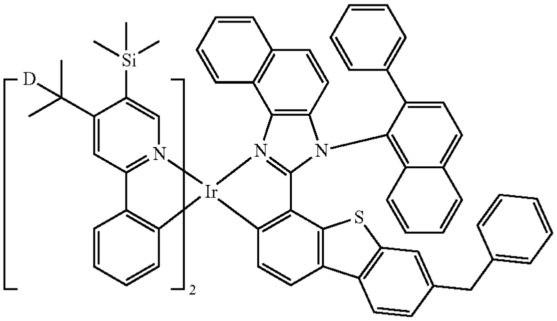
2571
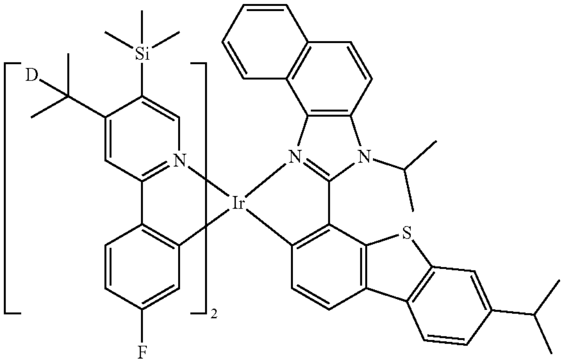
2572
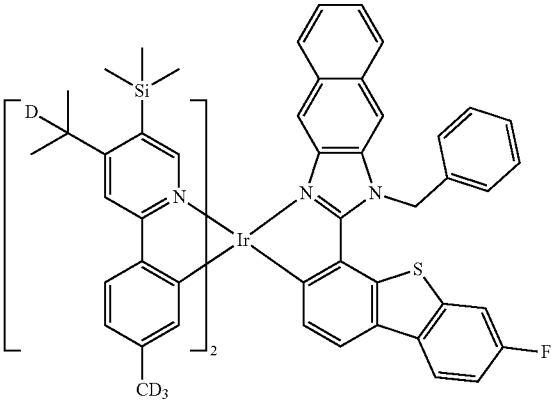

-continued
2573
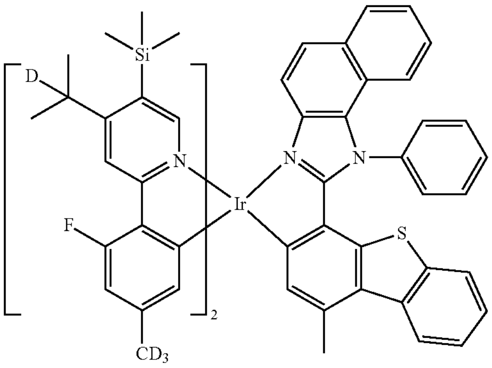
2574
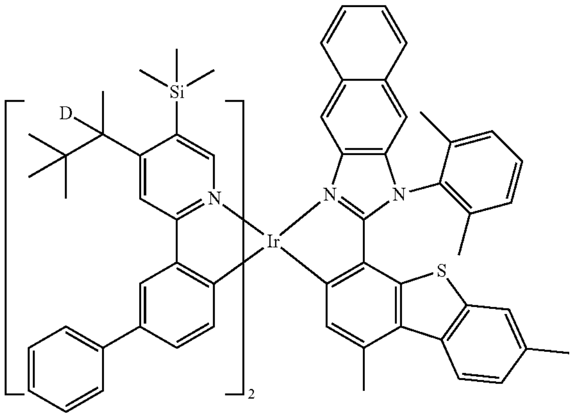
2575
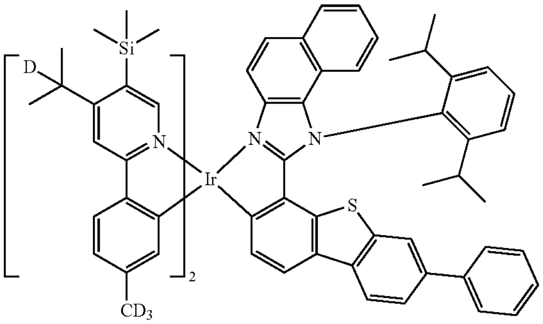
2576
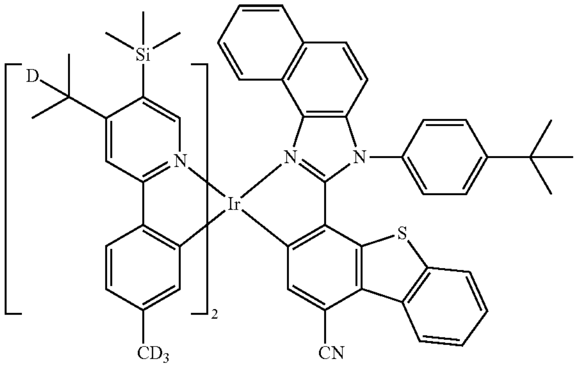
2577
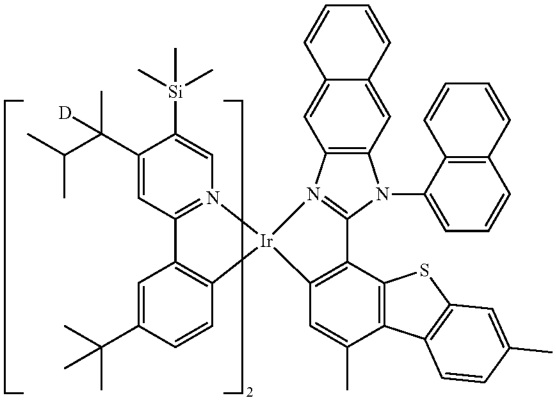
2578
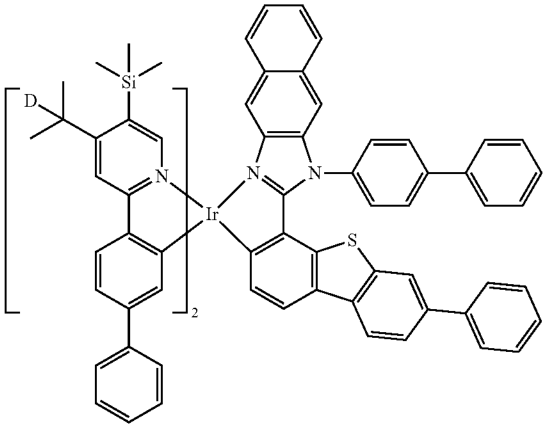

-continued
2579
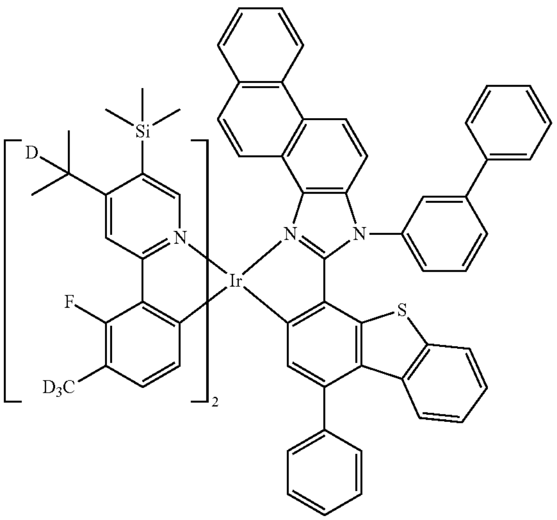
2580
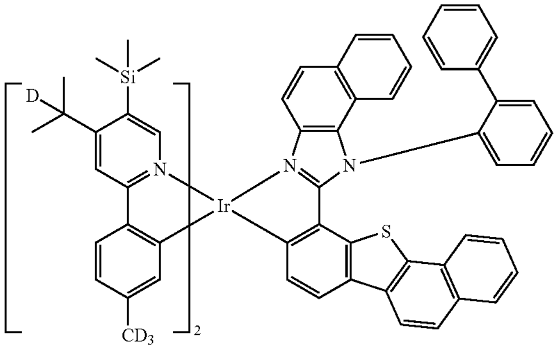
2581
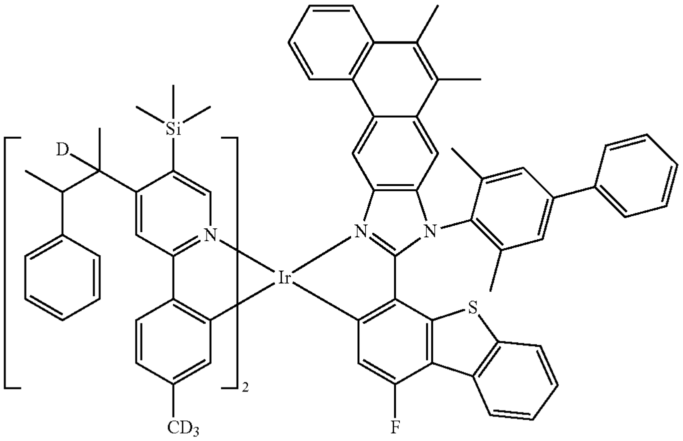
2582
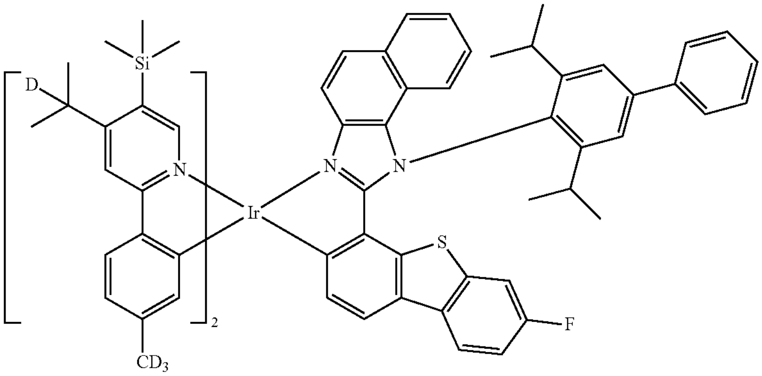

-continued
2583
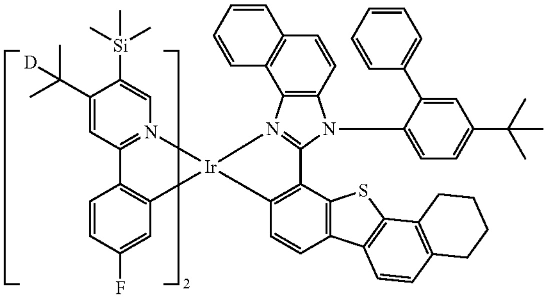
2584
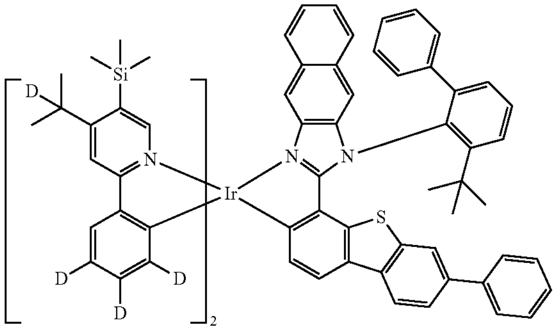
2585
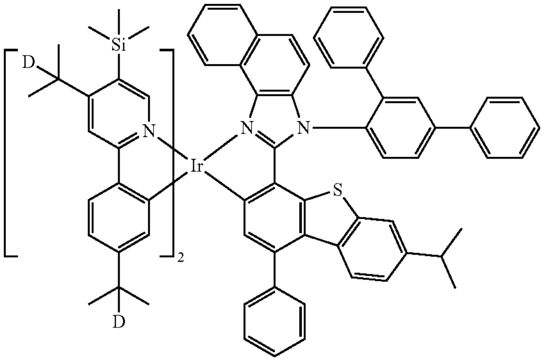
2586
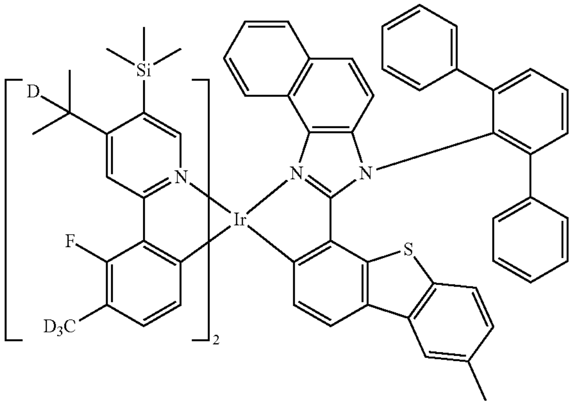
2587
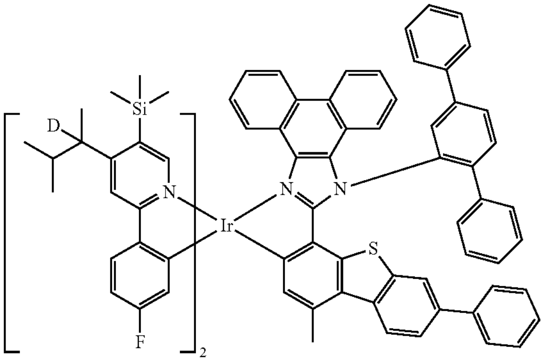
2588
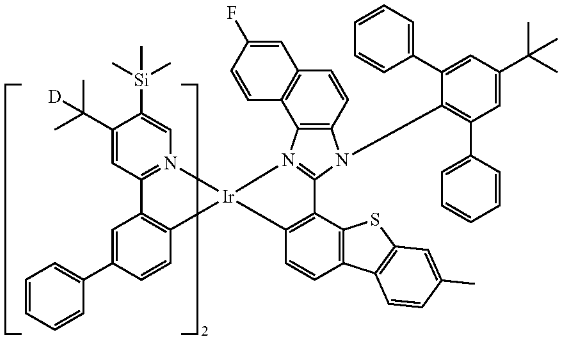
2589
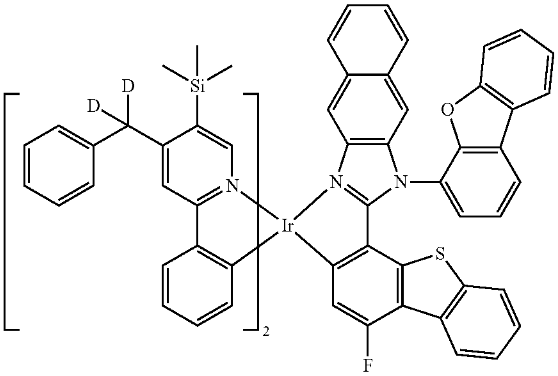
2590
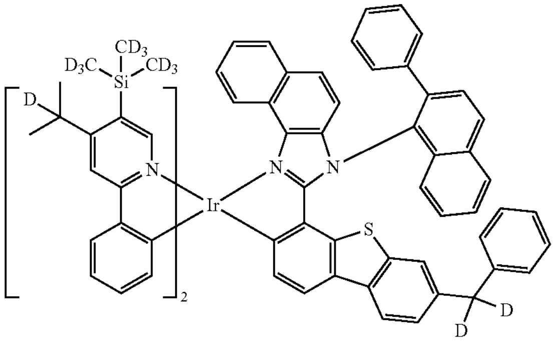

-continued
2591
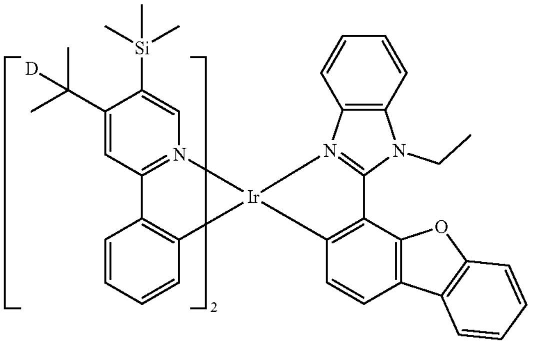
2592
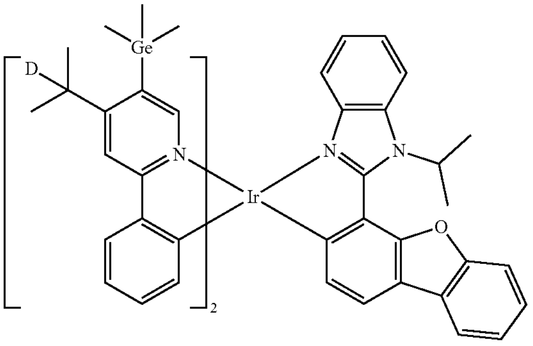
2593
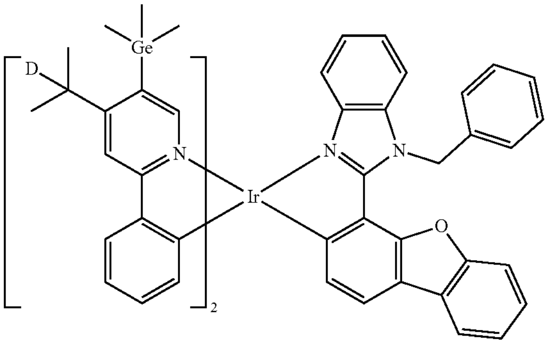
2594
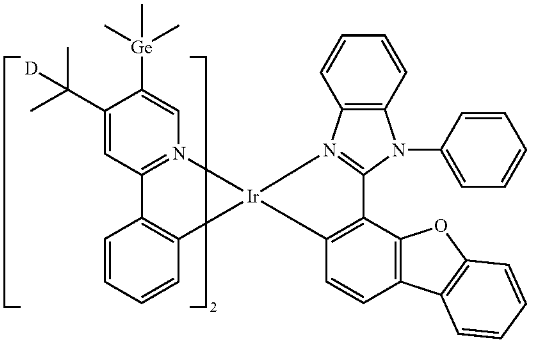
2595
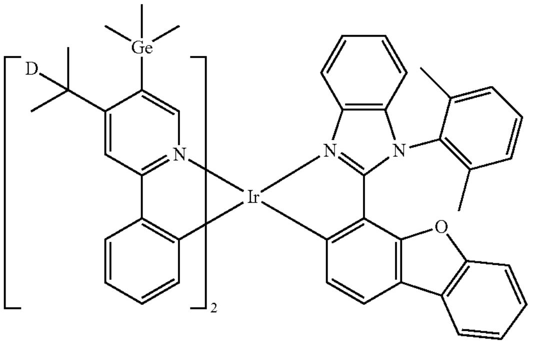
2596
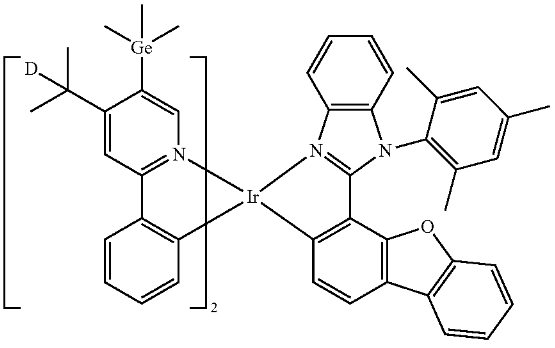
2597
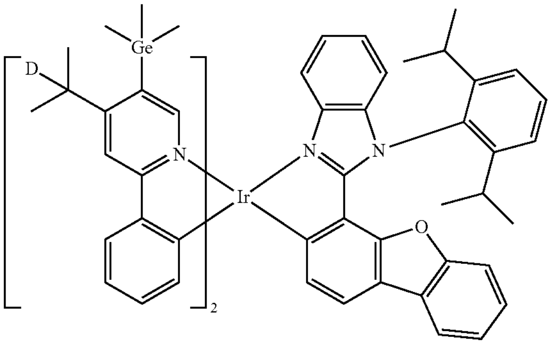
2598
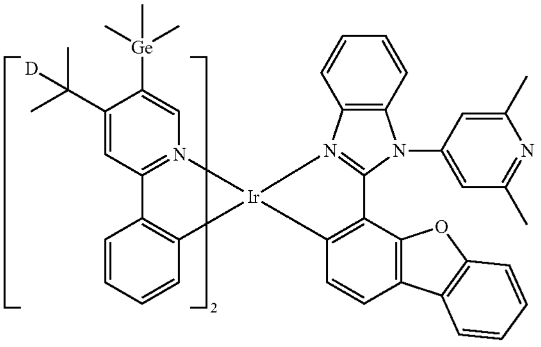

-continued
2599
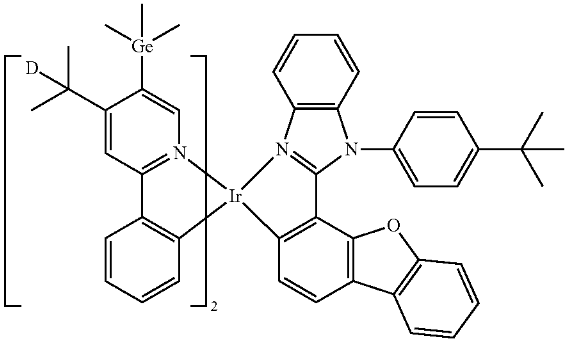
2600
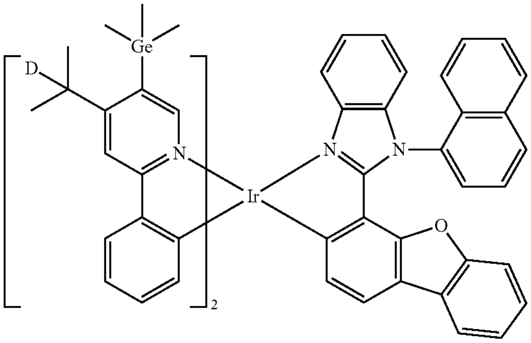
2601
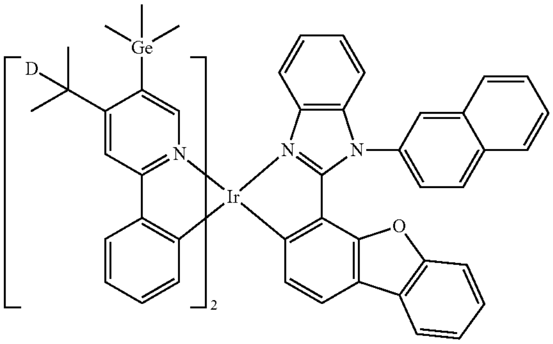
2602
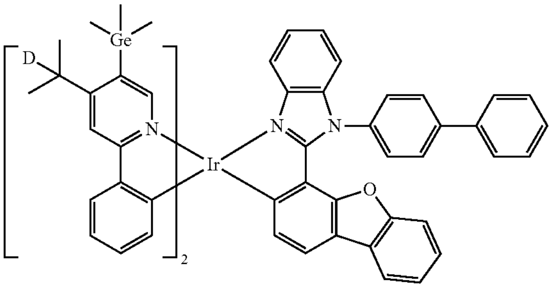
2603
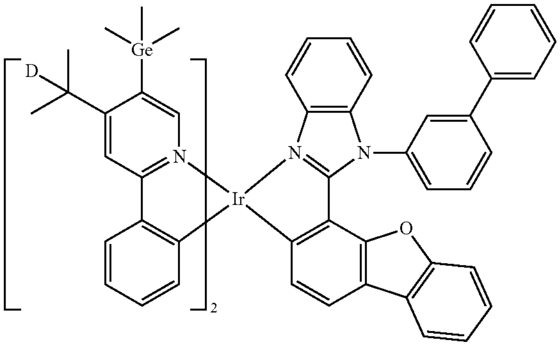
2604
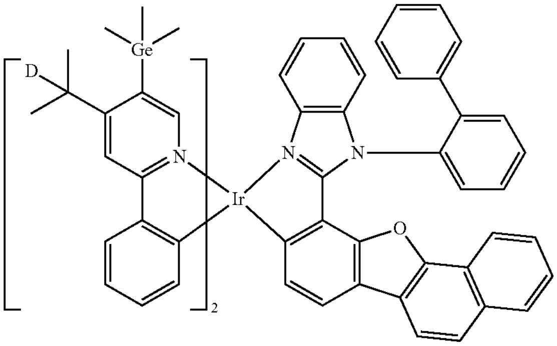
2605
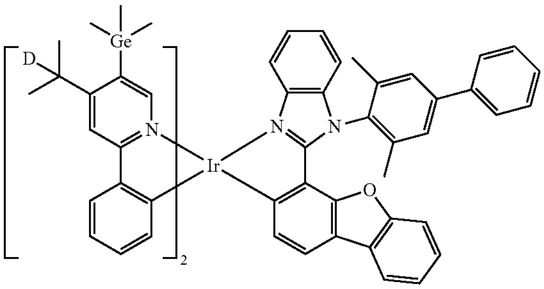
2606
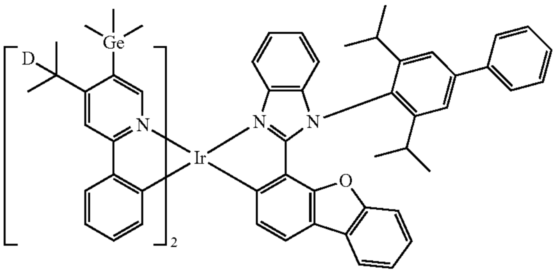

-continued
2607
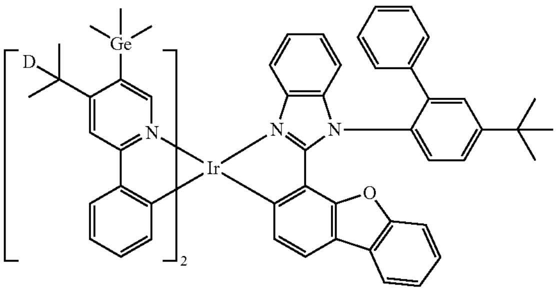
2608
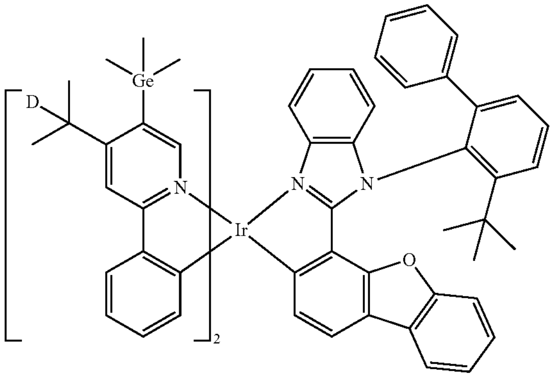
2609
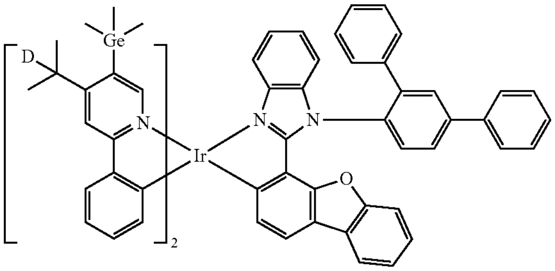
2610
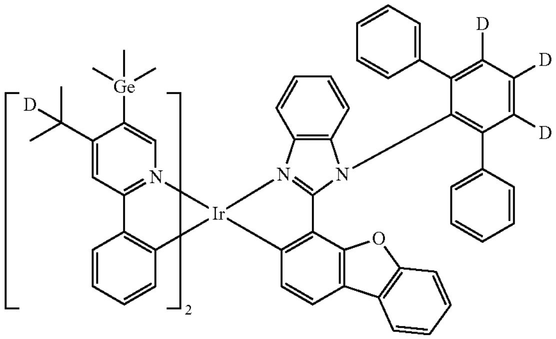
2611
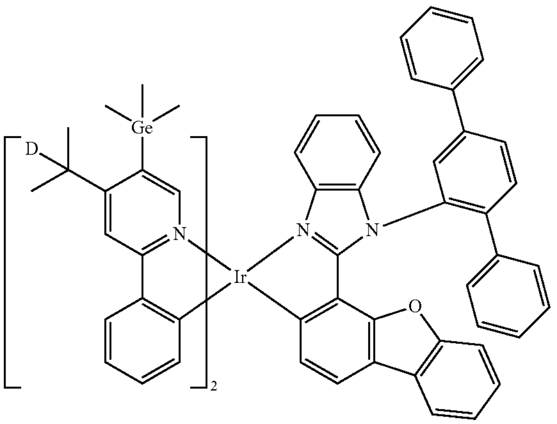
2612
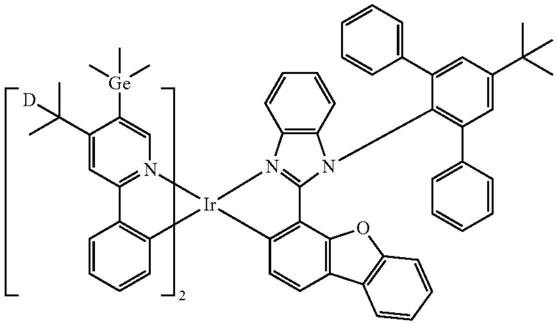
2613
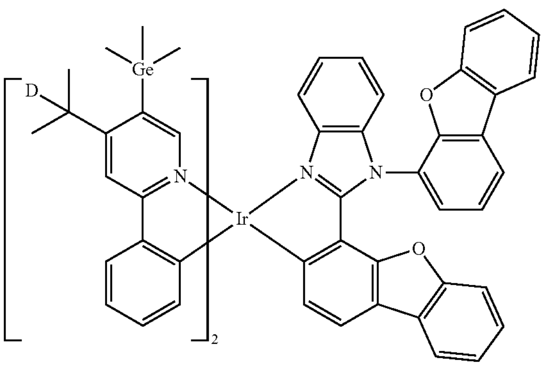
2614
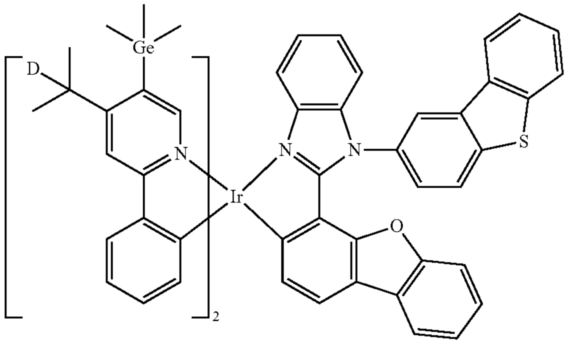

-continued
2615
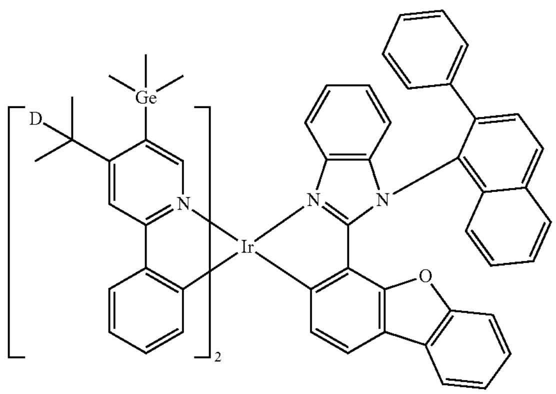
2616
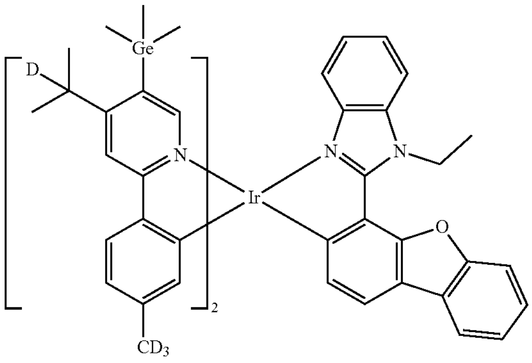
2617
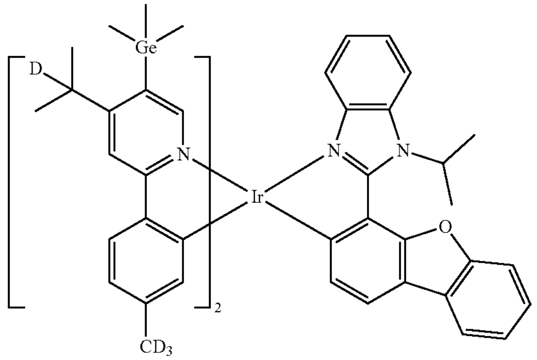
2618
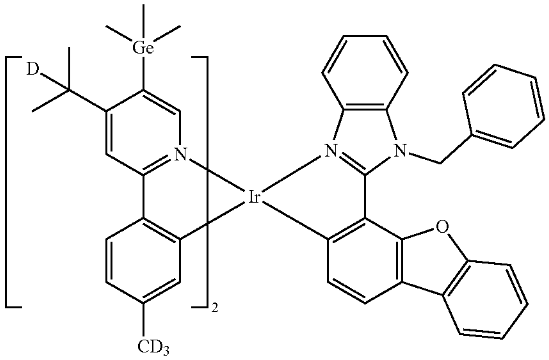
2619
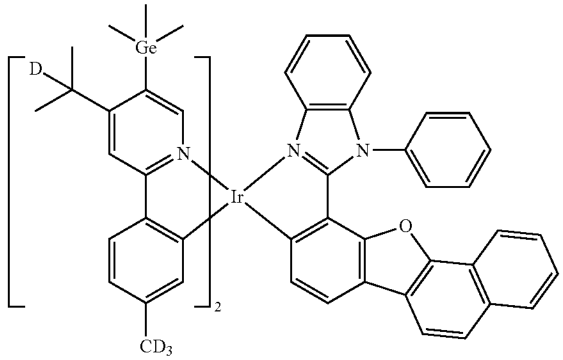
2620
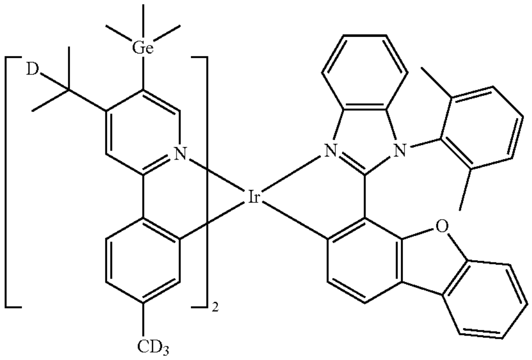
2621
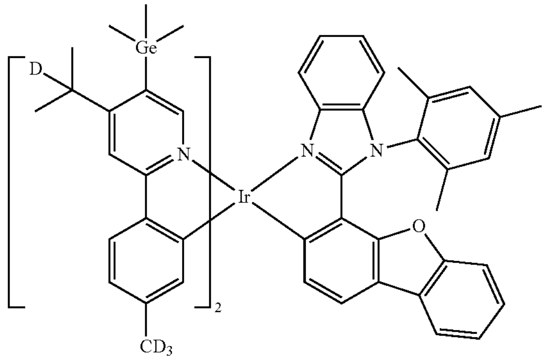
2622
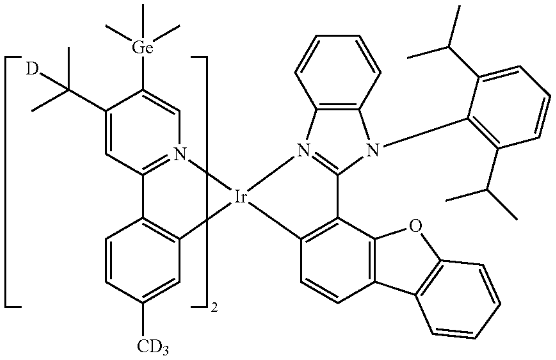

-continued
2623
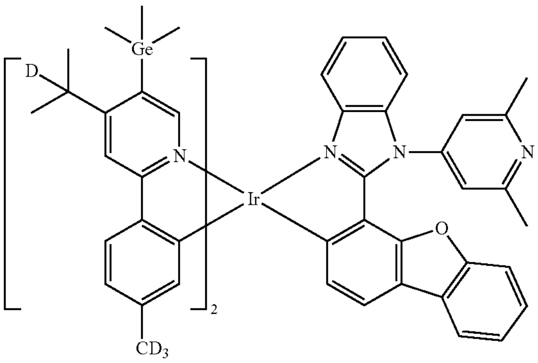
2624
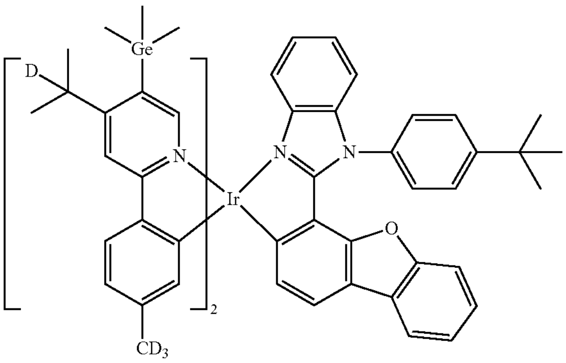
2625
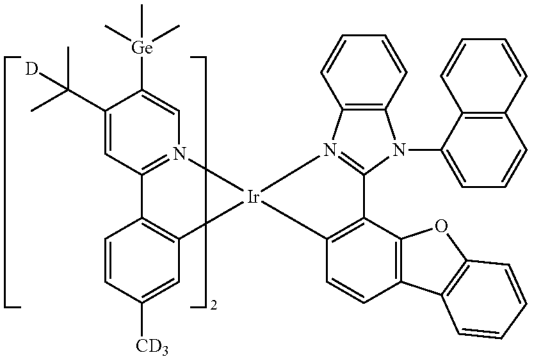
2626
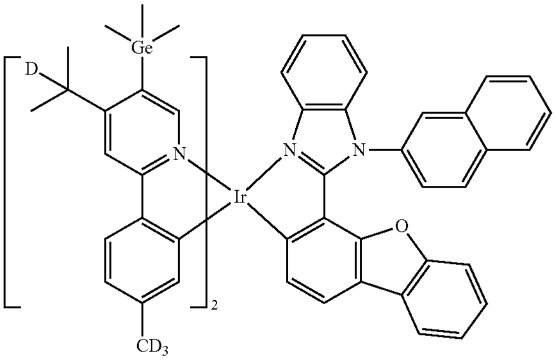
2627
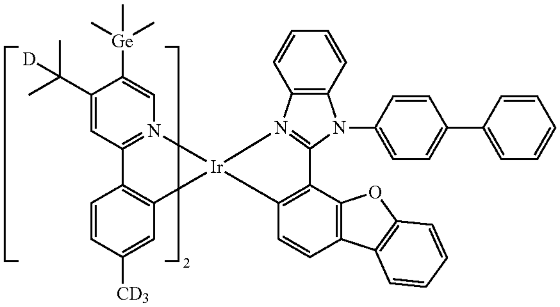
2628
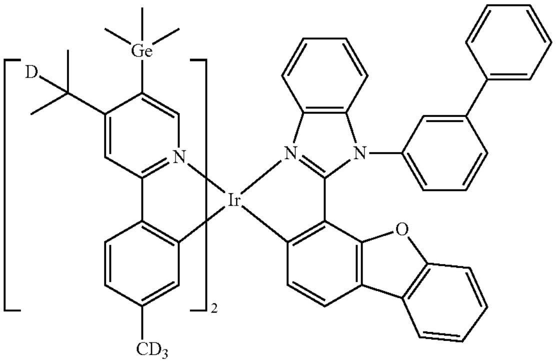
2629
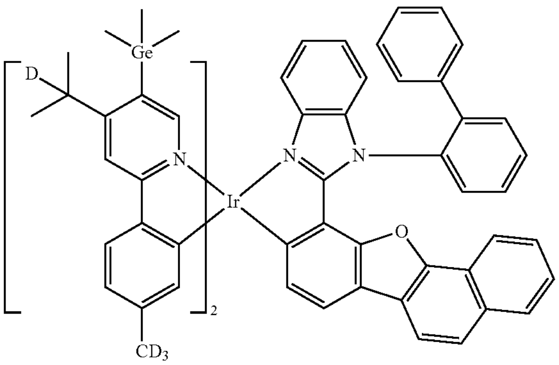
2630
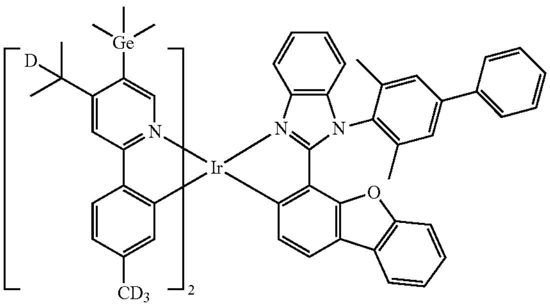

-continued
2631
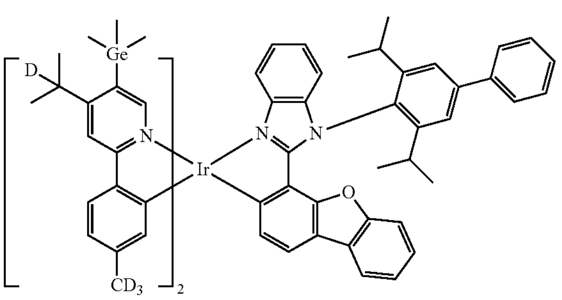
2632
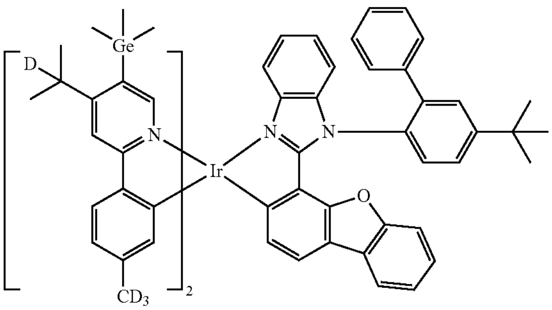
2633
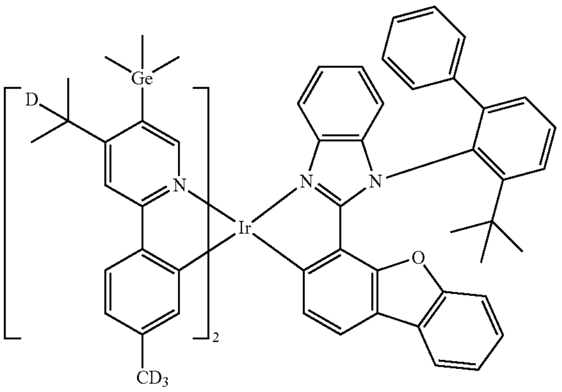
2634
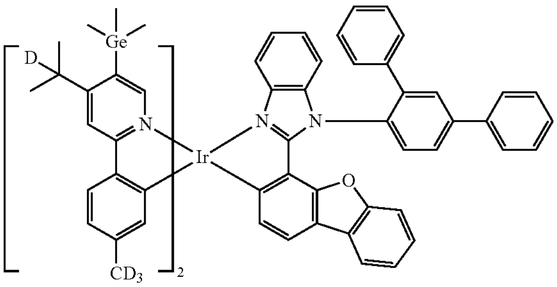
2635
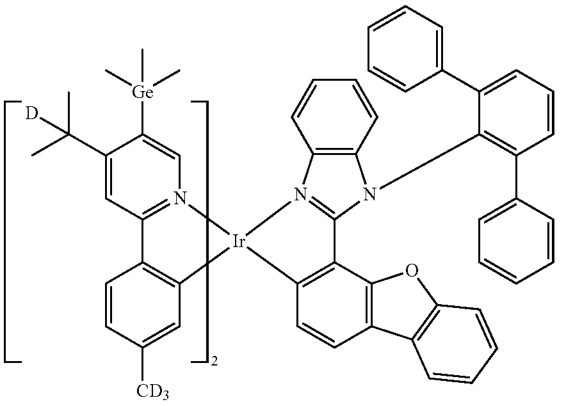
2636
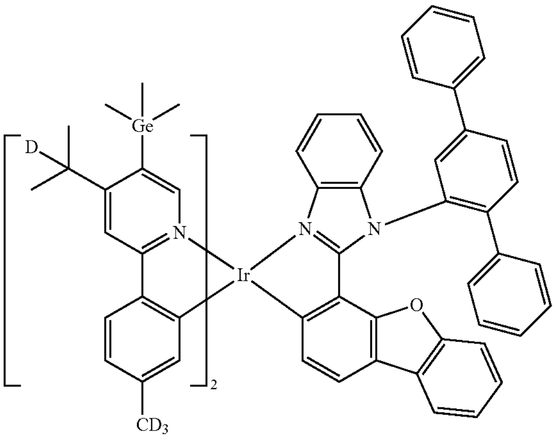
2637
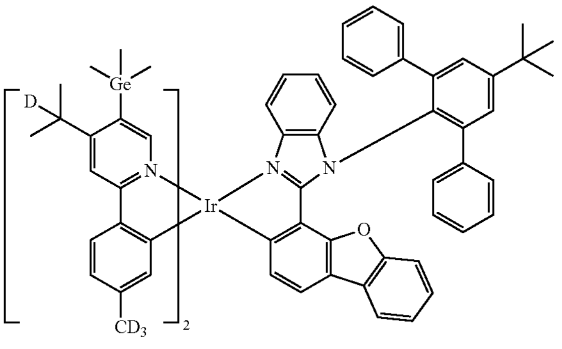
2638
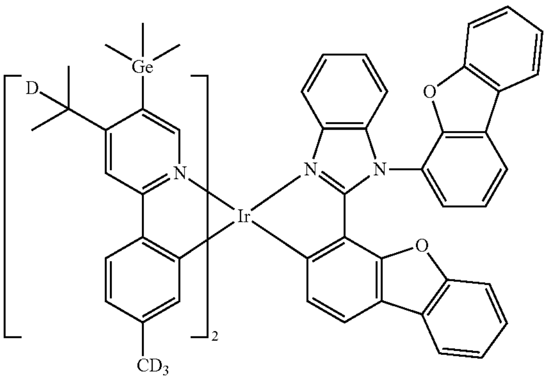

-continued
2639
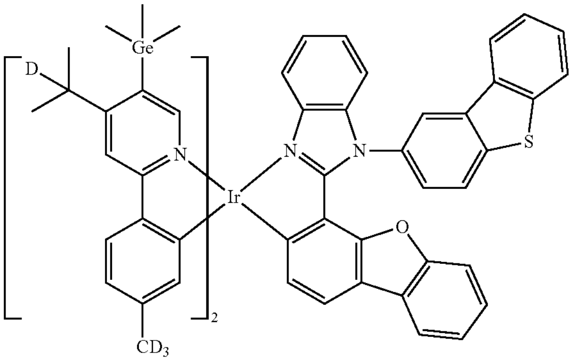
2640
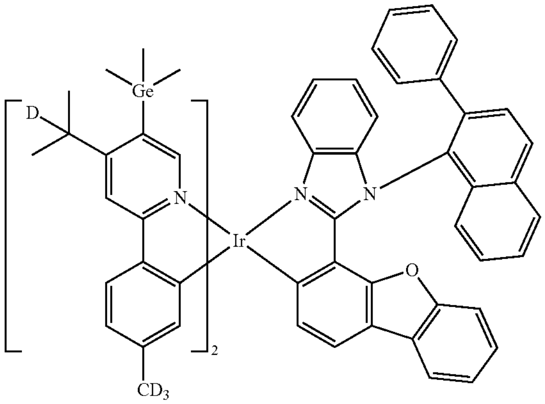
2641
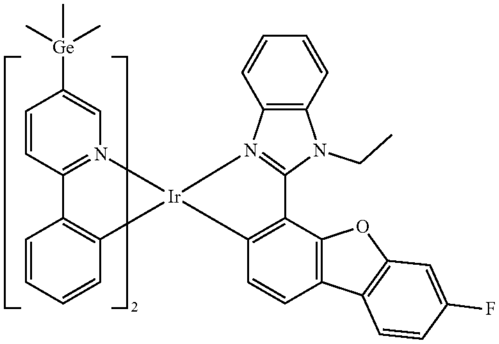
2642
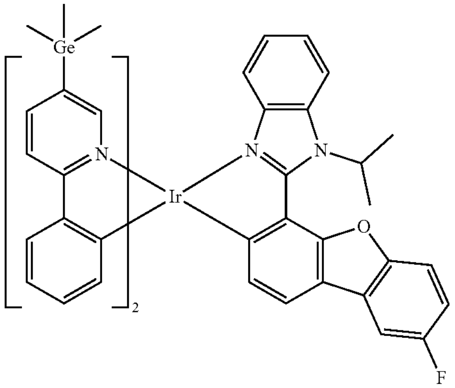
2643
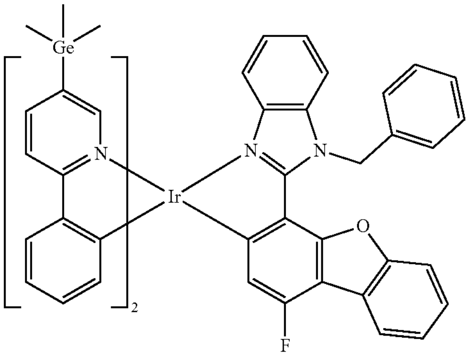
2644
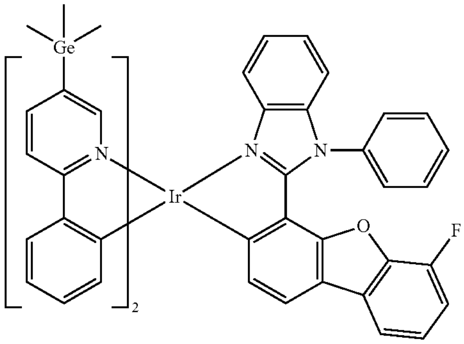
2645
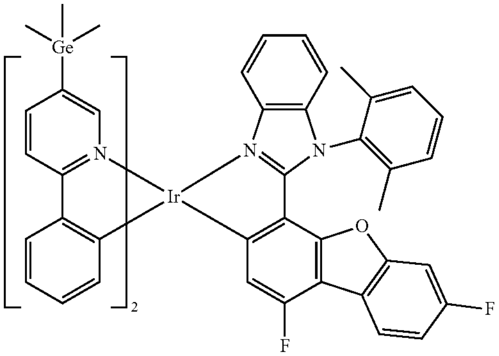
2646
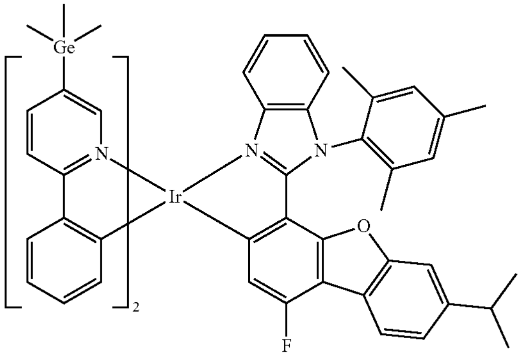

-continued
2647
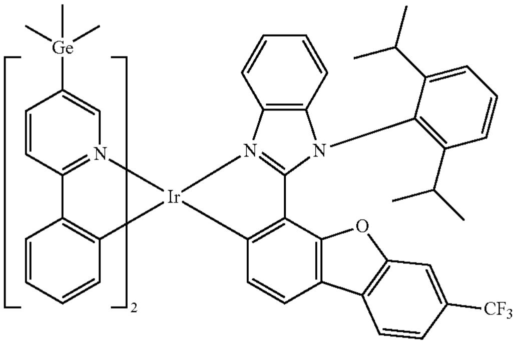
2648
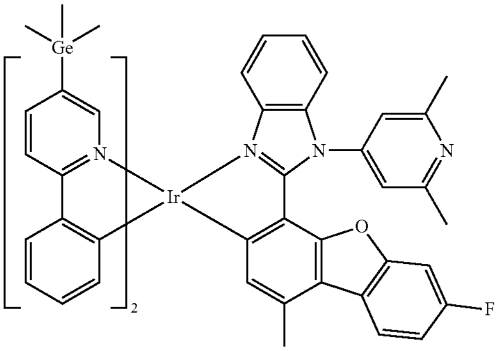
2649
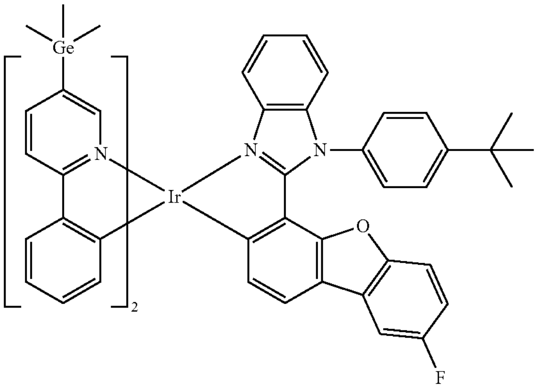
2650
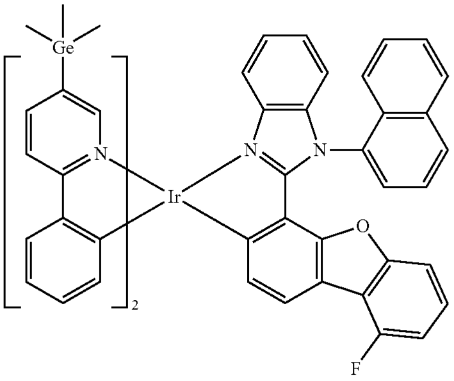
2651
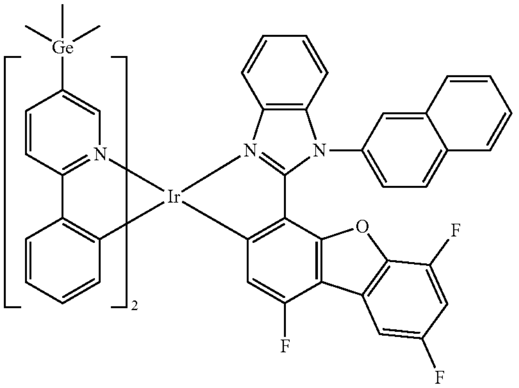
2652
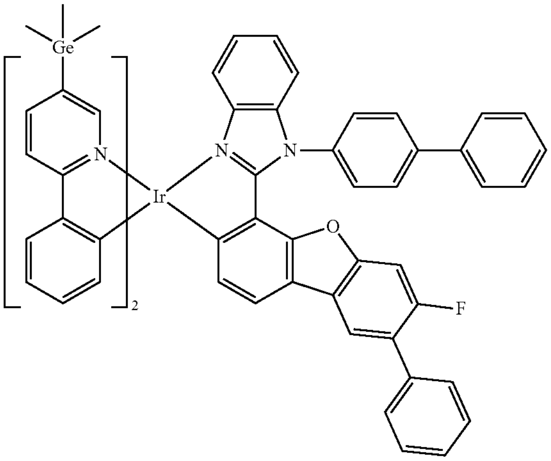

-continued
2653
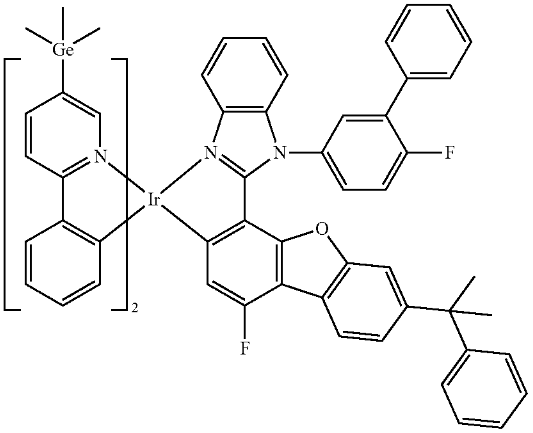
2654
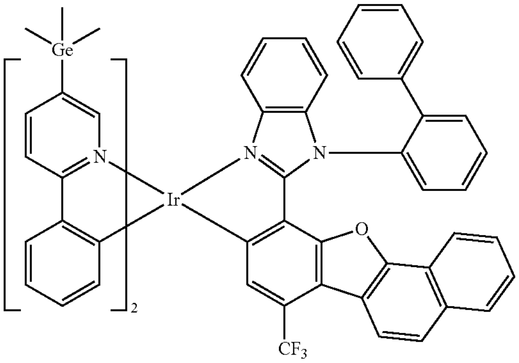
2655
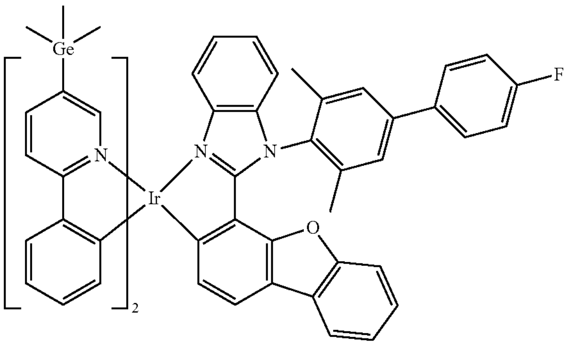
2656
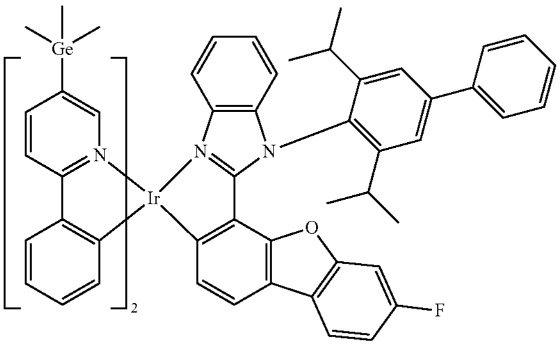
2657
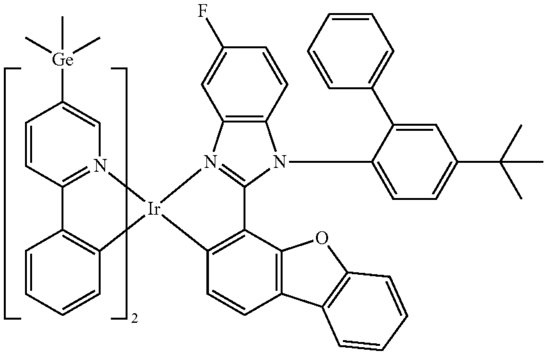
2658
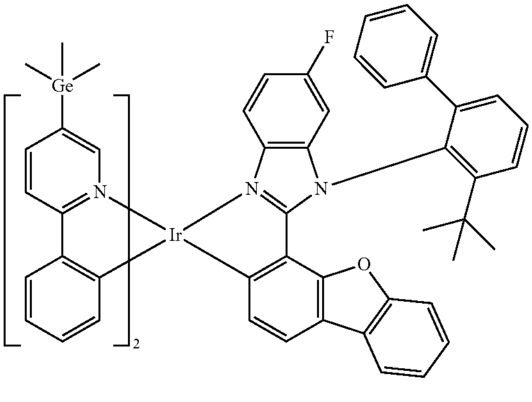

-continued
2659
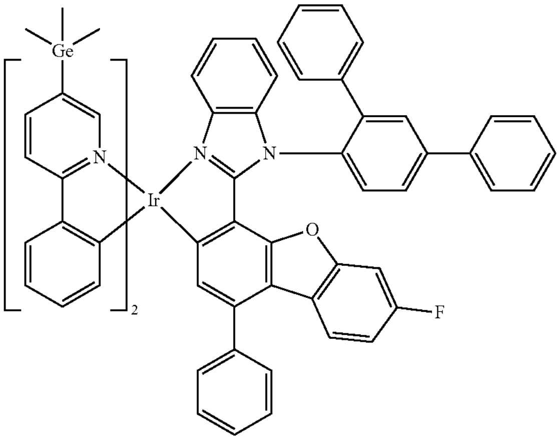
2660
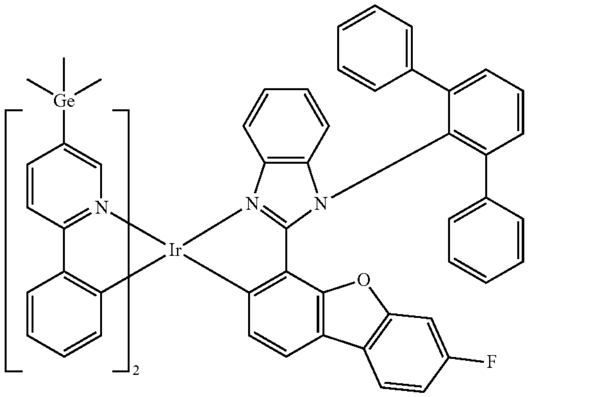
2661
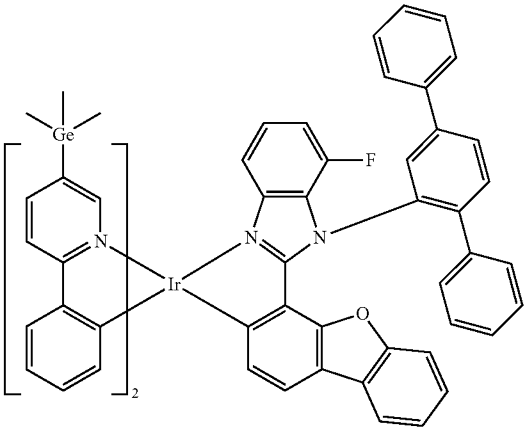
2662
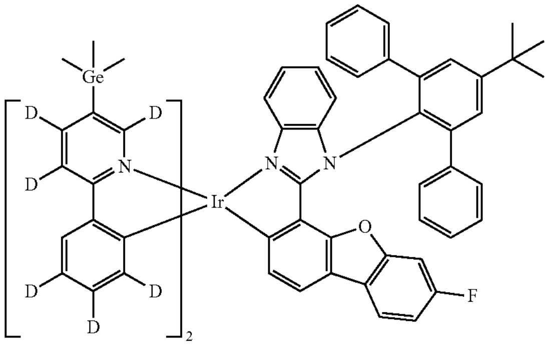
2663
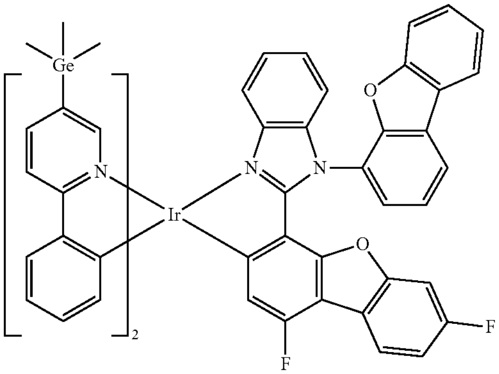
2664
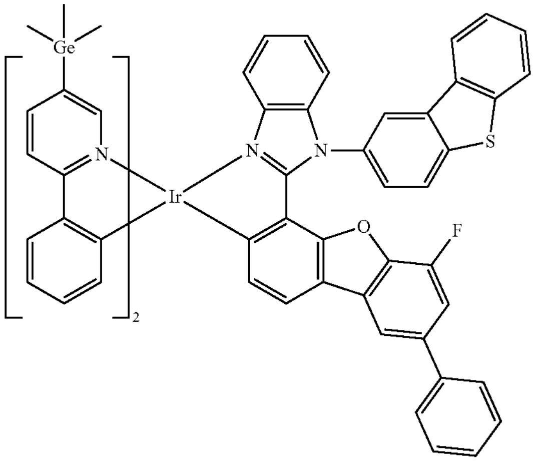

-continued
2665
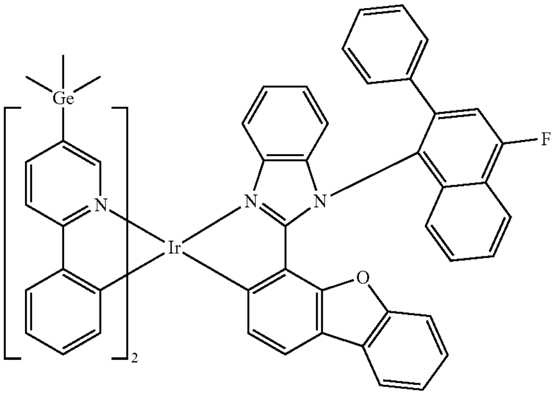
2666
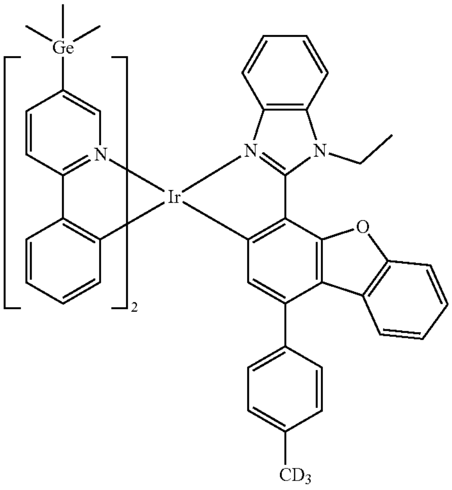
2667
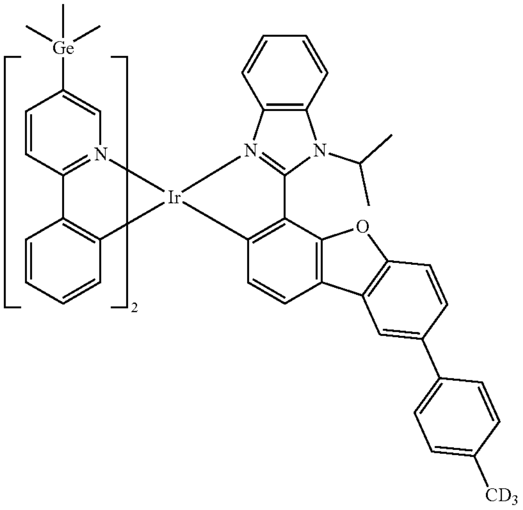
2668
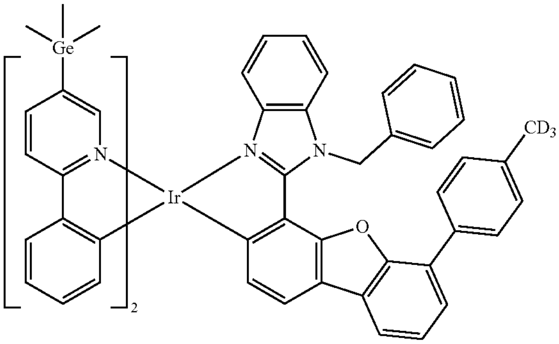
2669
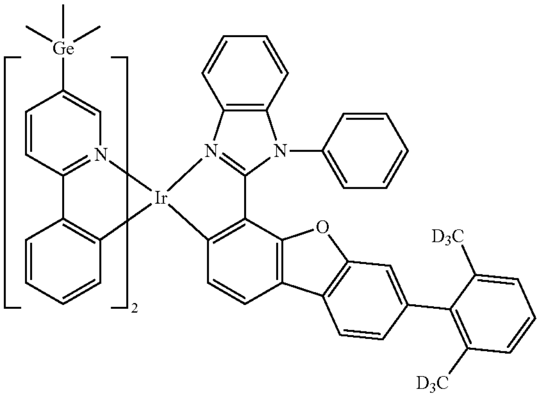
2670
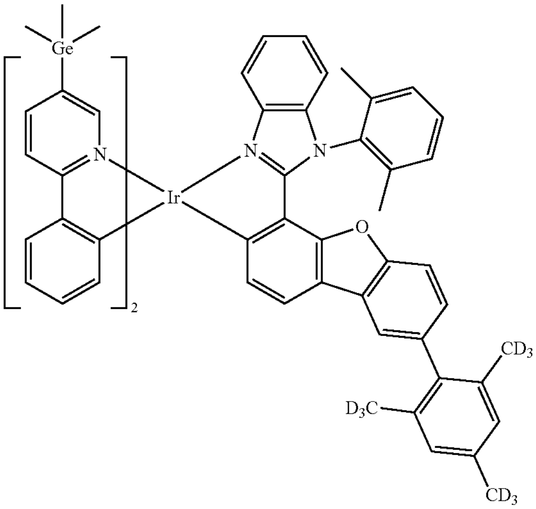

-continued
2671
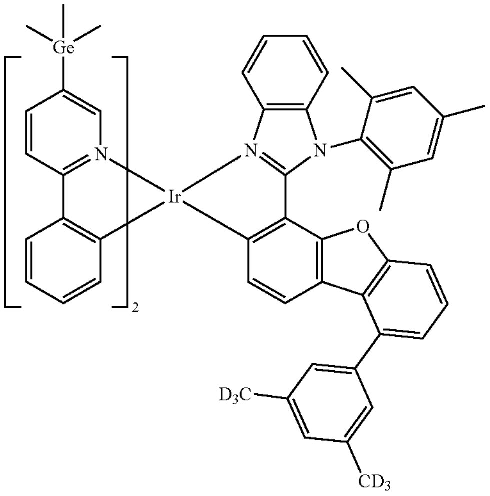
2672
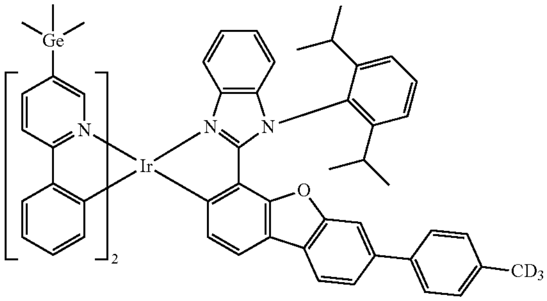
2673
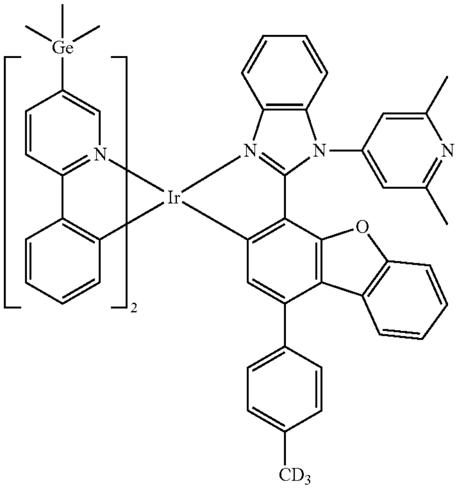
2674
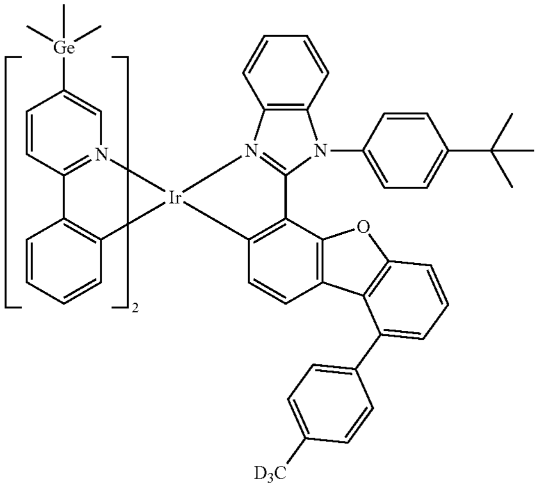
2675
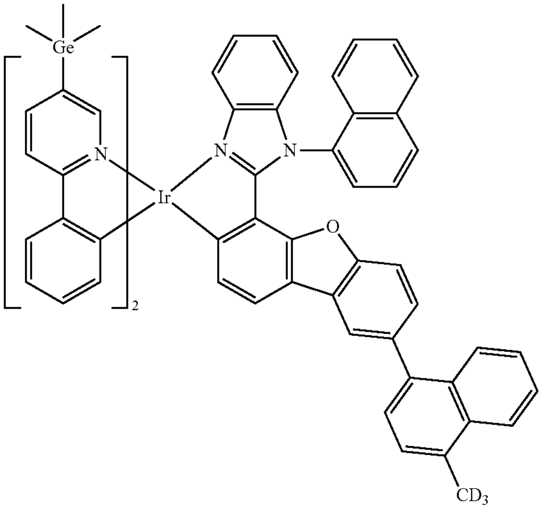
2676
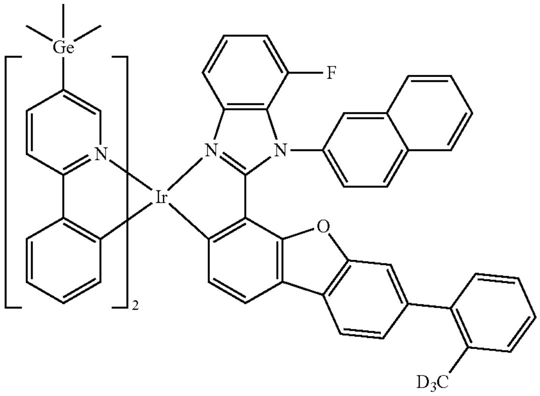

-continued
2677
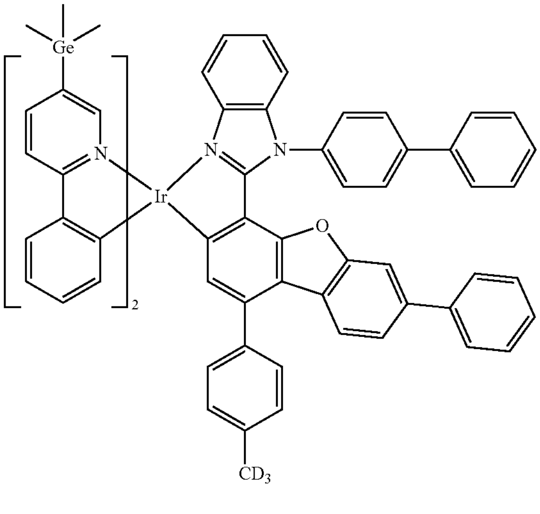
2678
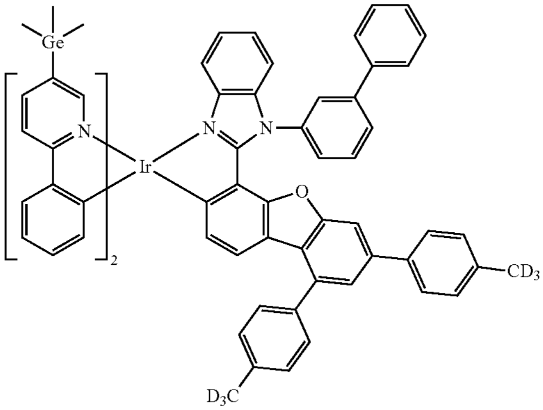
2679
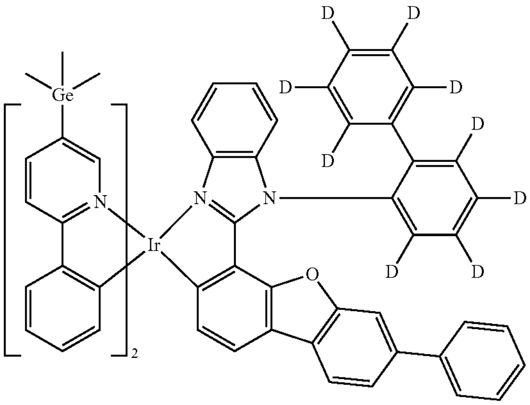
2680
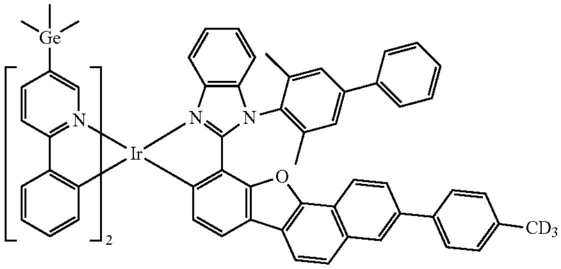
2681
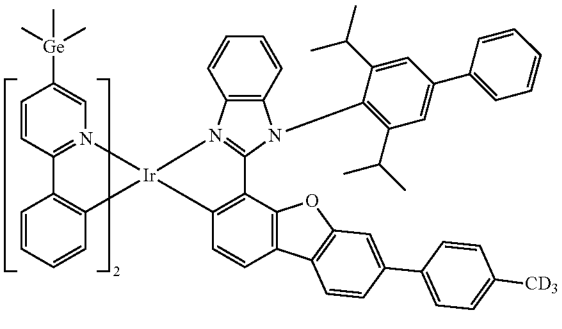
2682
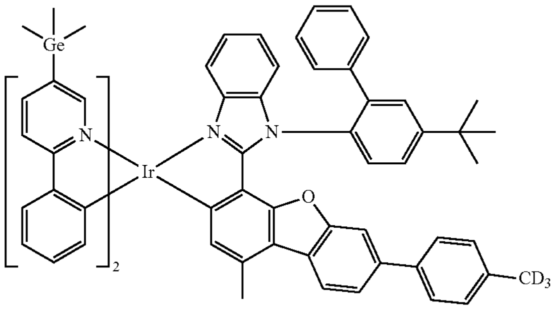

-continued
2683
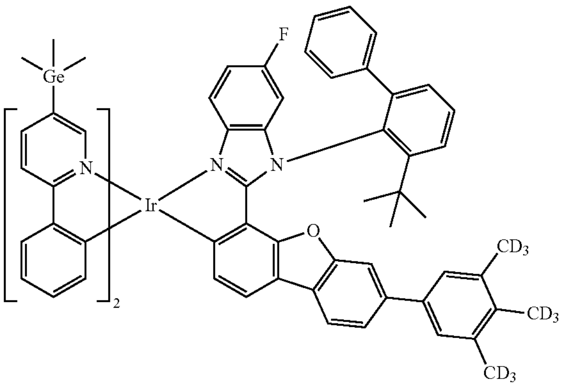
2684
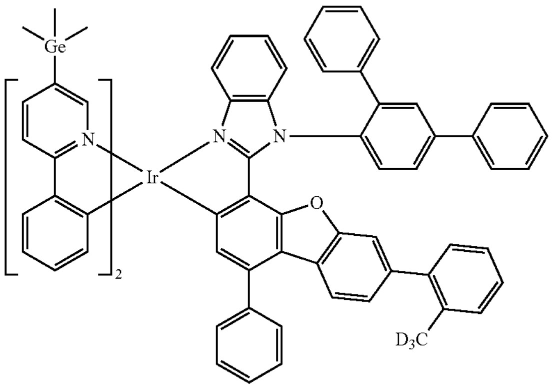
2685
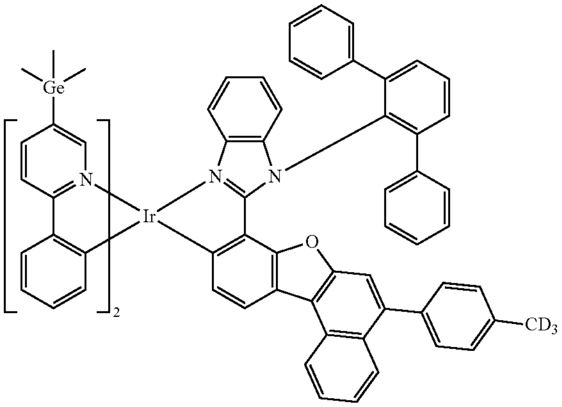
2686
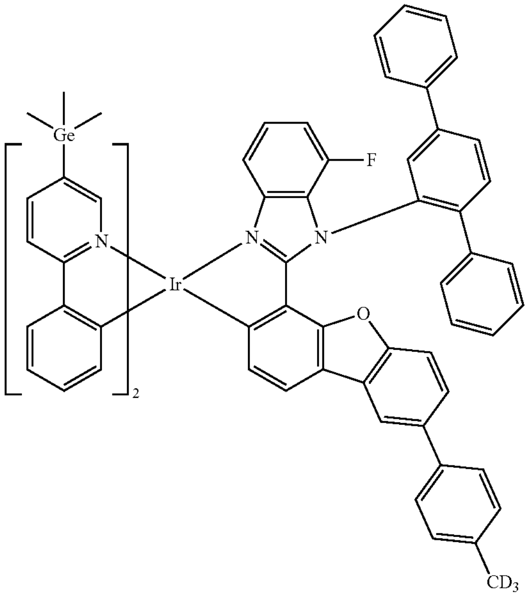
2687
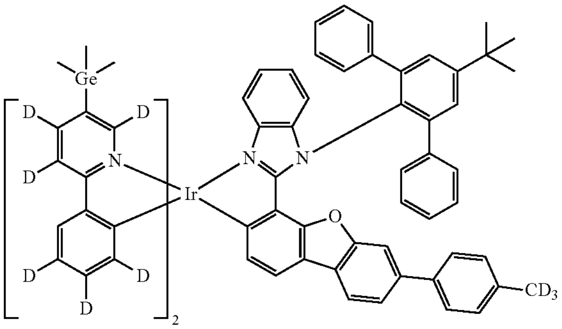
2688
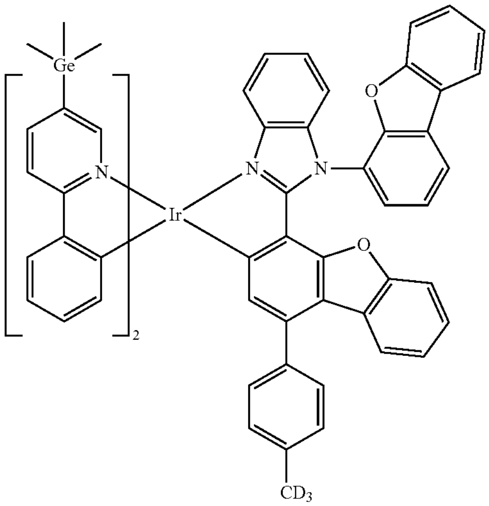

-continued
2689
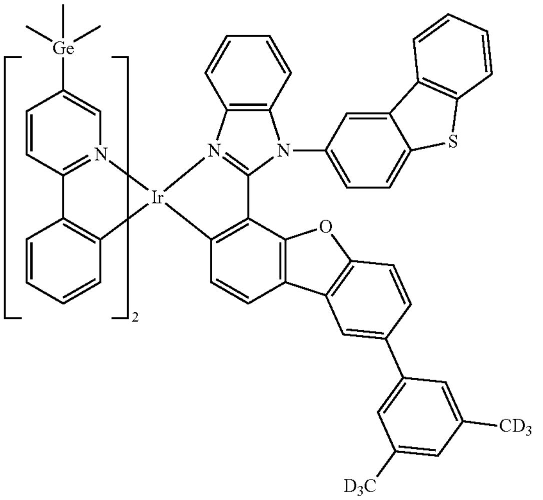
2690
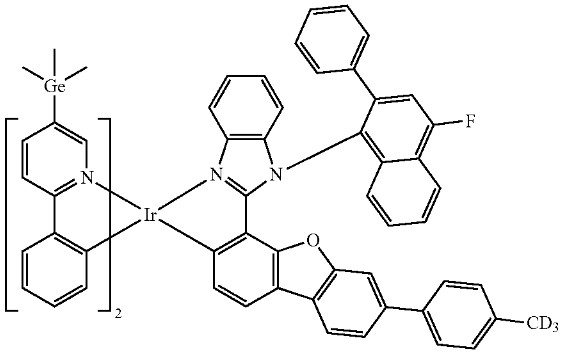
2691
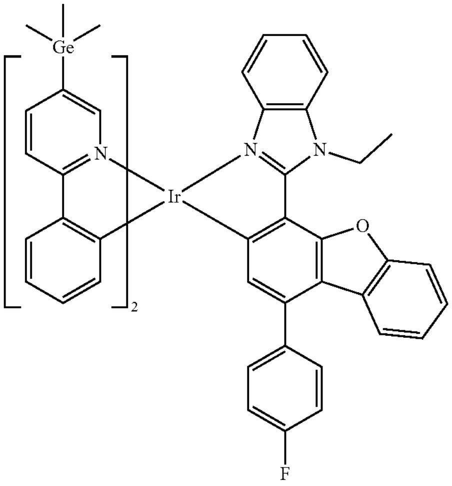
2692
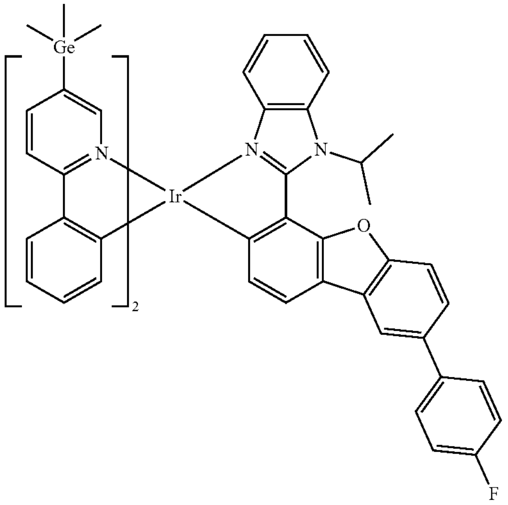
2693
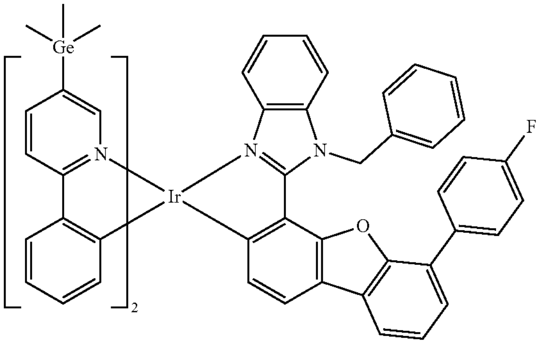
2694
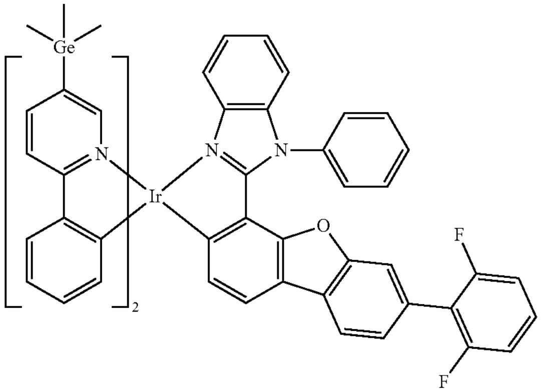

-continued
2695
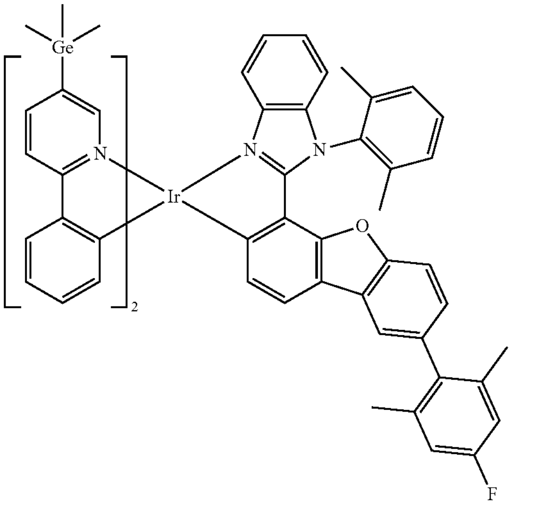
2696
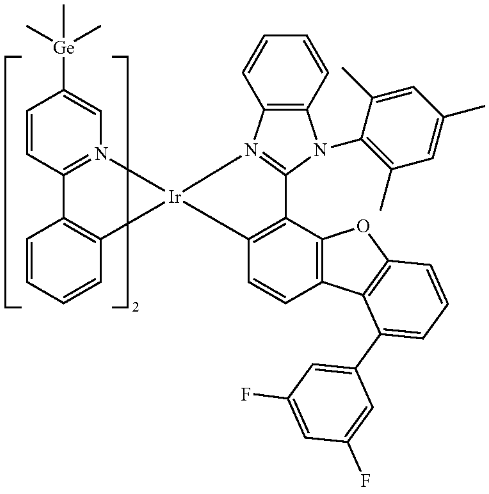
2697
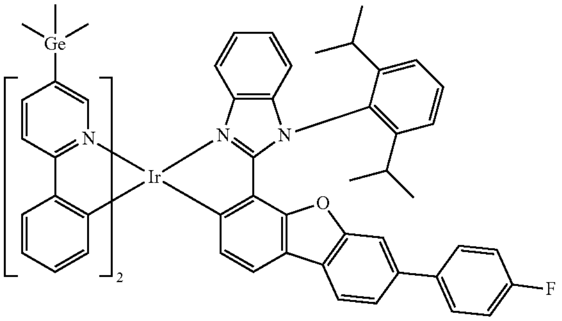
2698
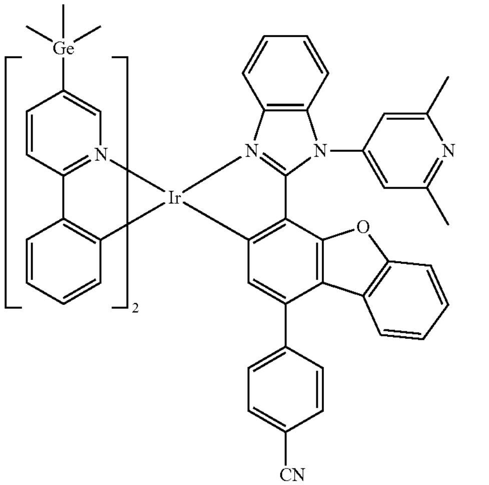
2699
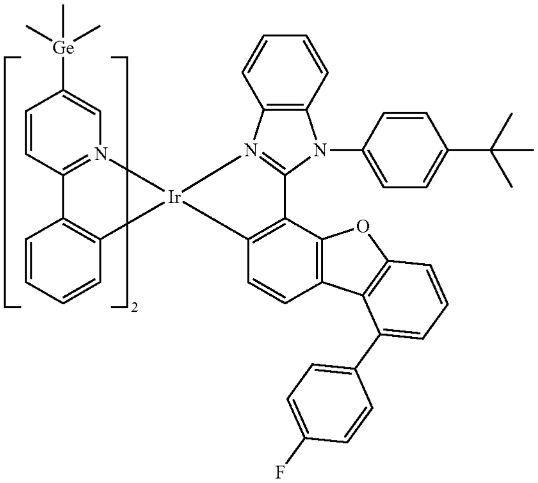
2700
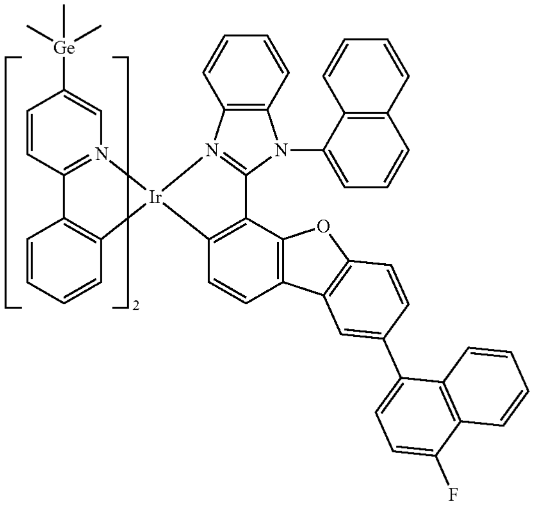

-continued
2701
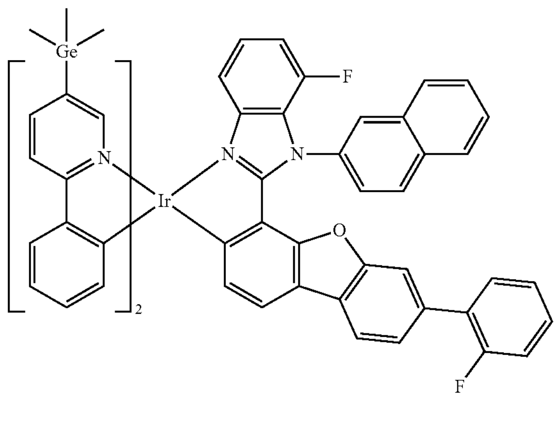
2702
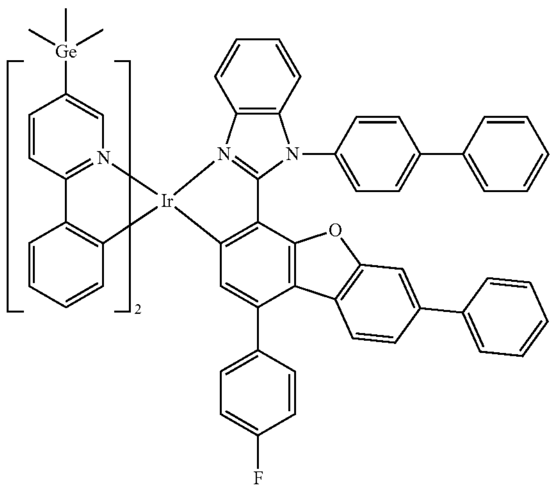
2703
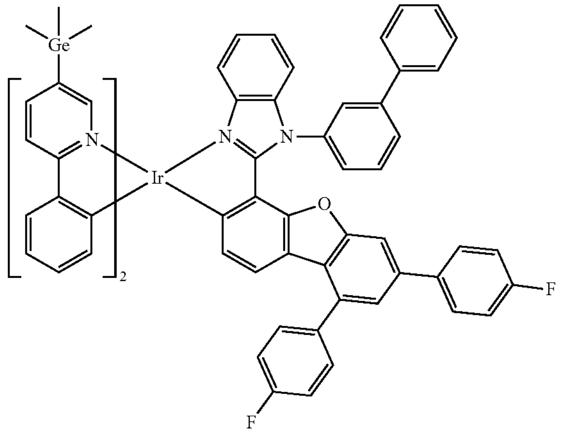
2704
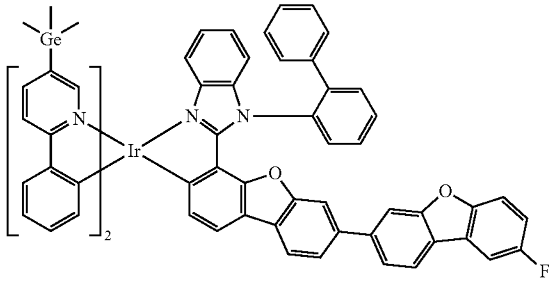
2705
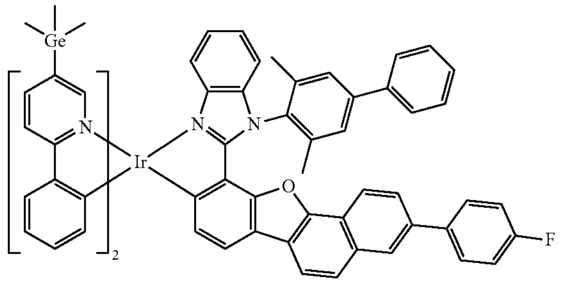
2706
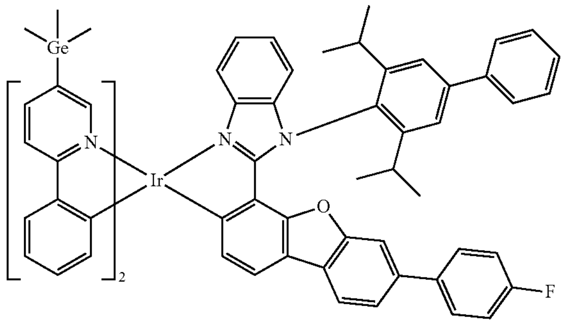

-continued
2707
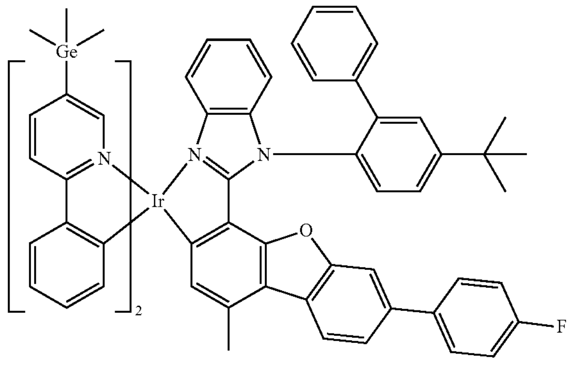
2708
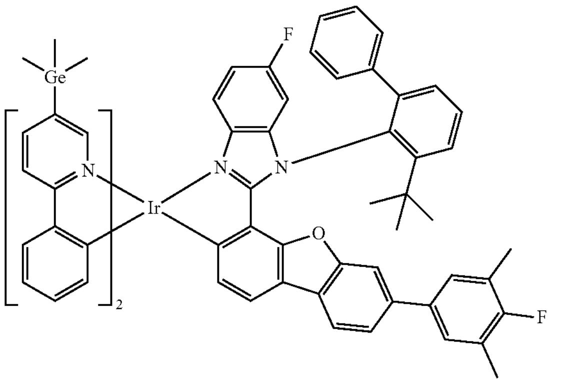
2709
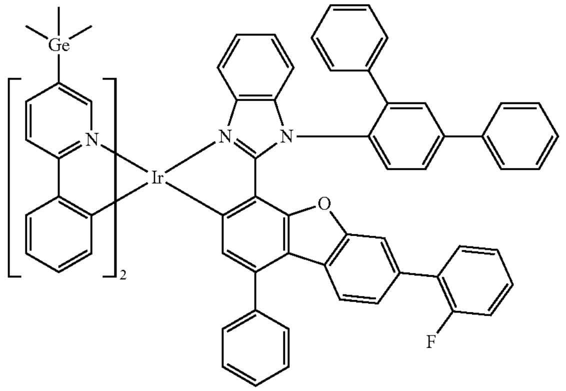
2710
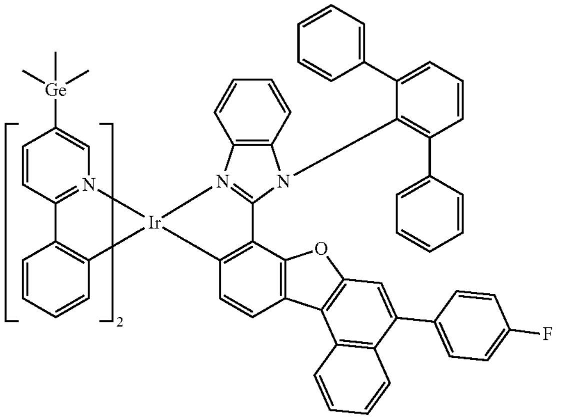
2711
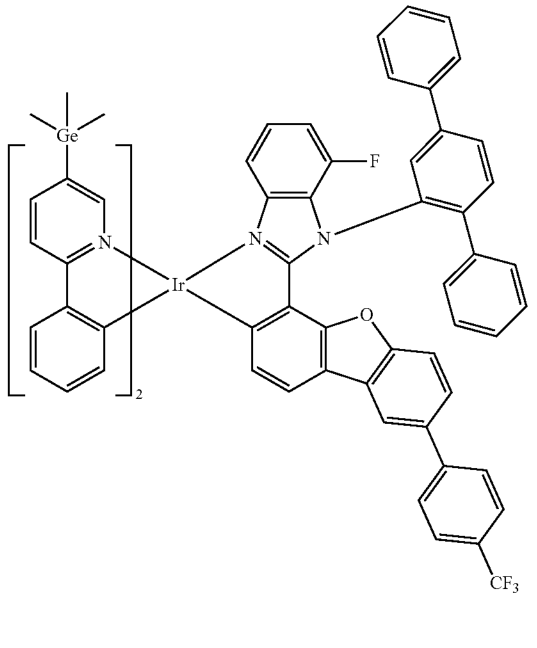
2712
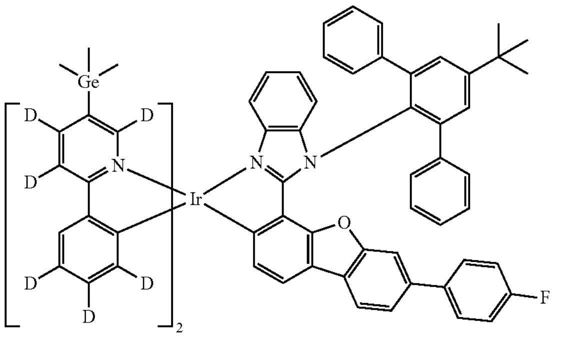

-continued
2713
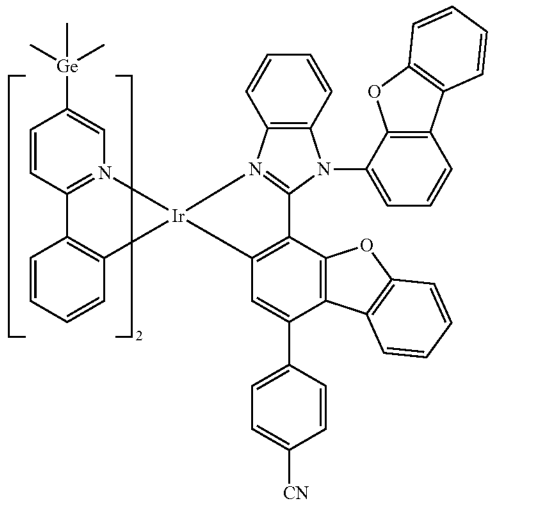
2715
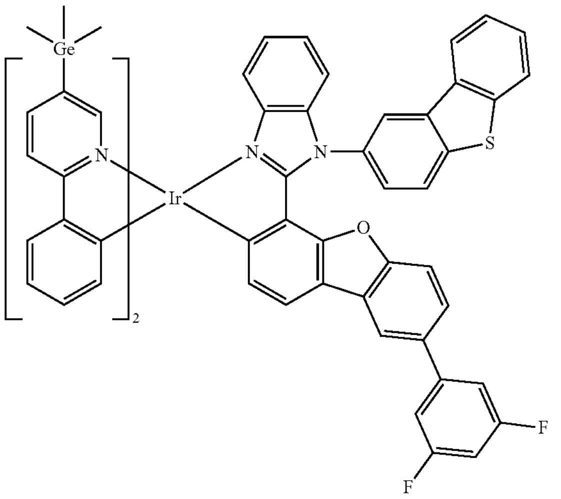
2715
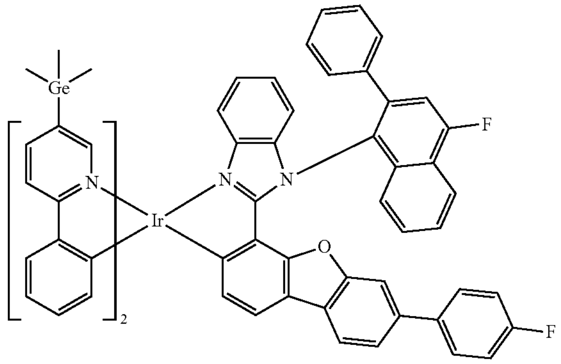
2716
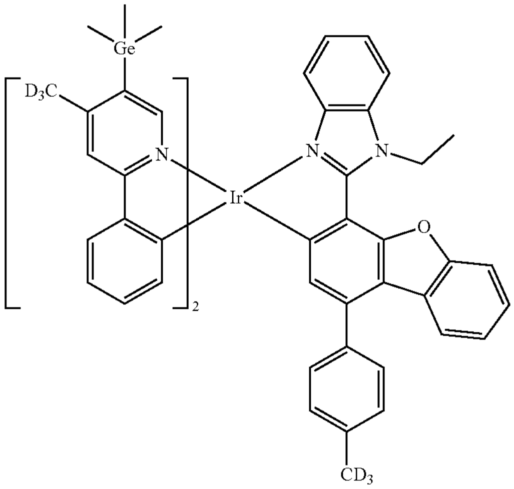
2717
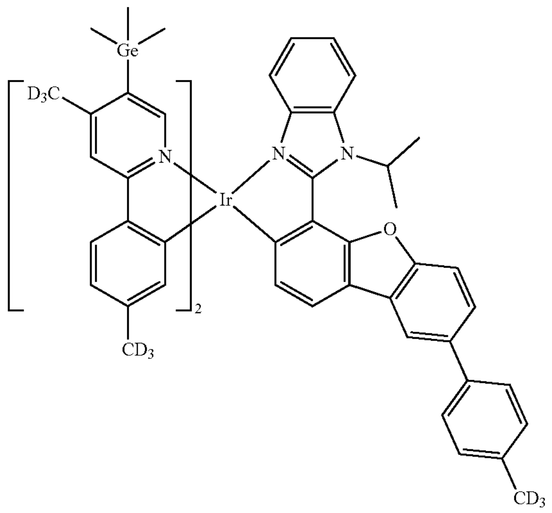
2718
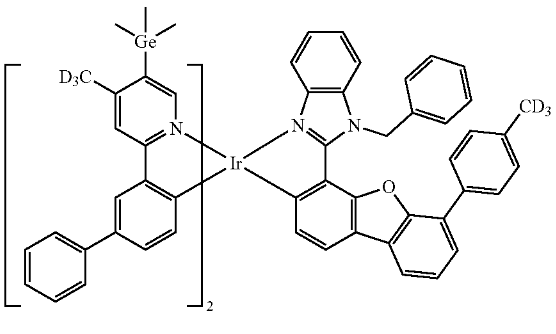

-continued
2719
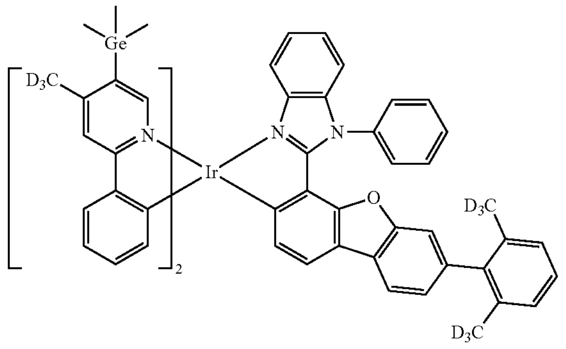
2720
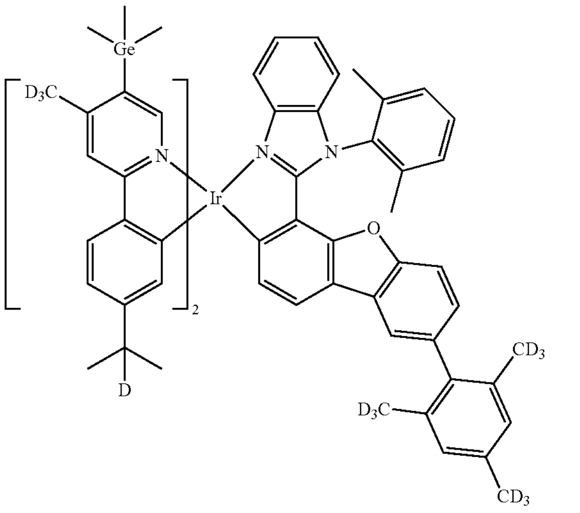
2721
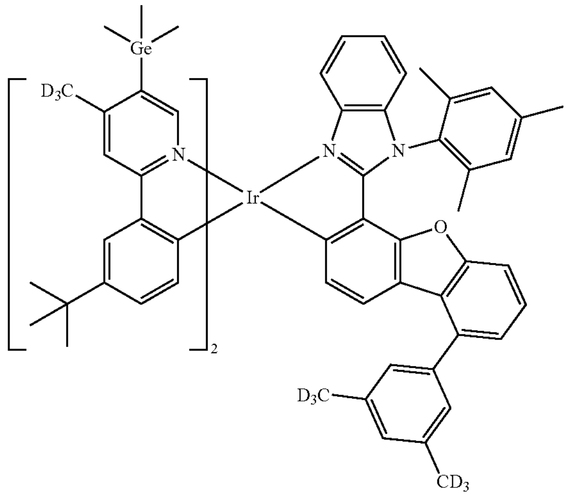
2722
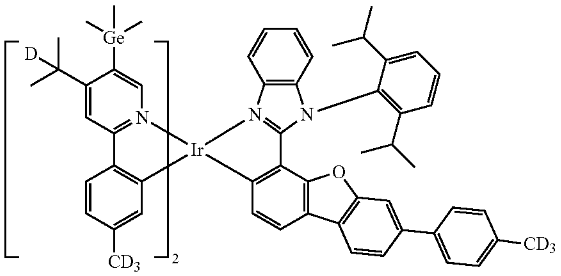
2723
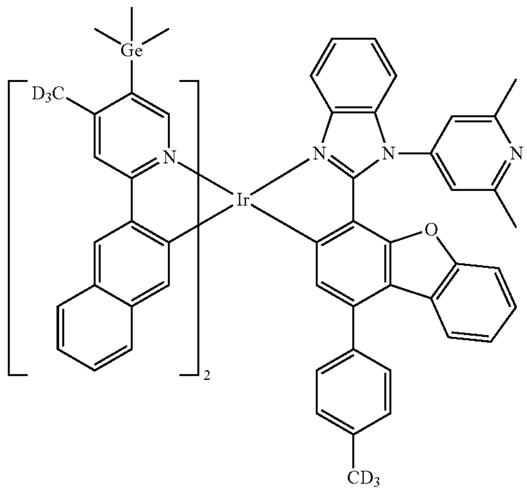
2724
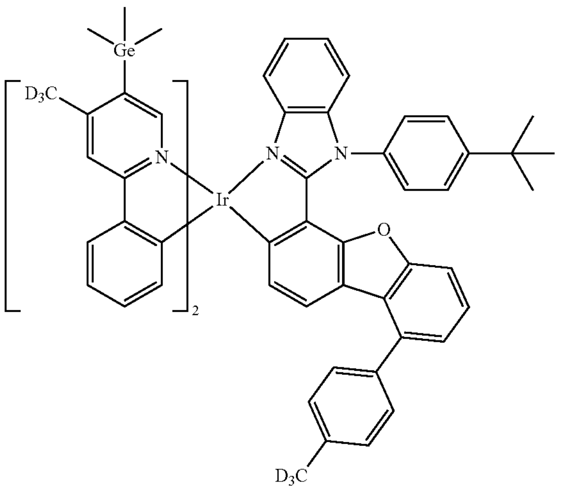

-continued
2725
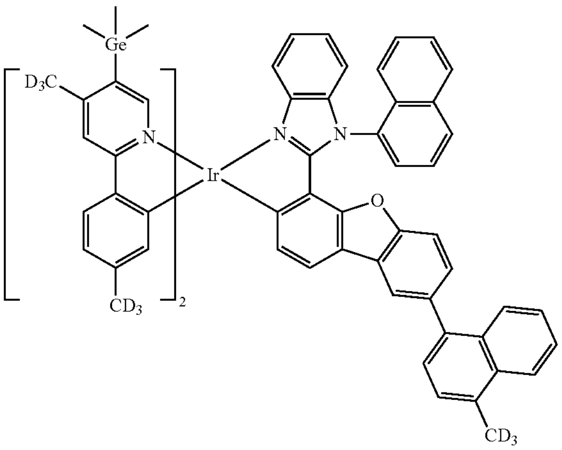
2726
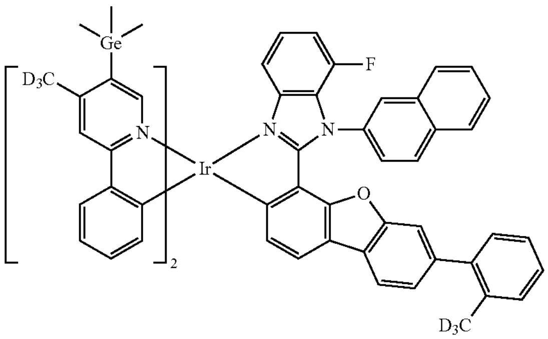
2727
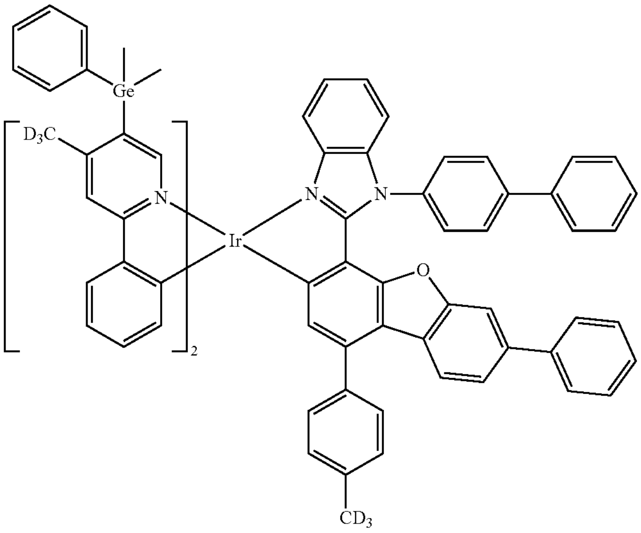
2728
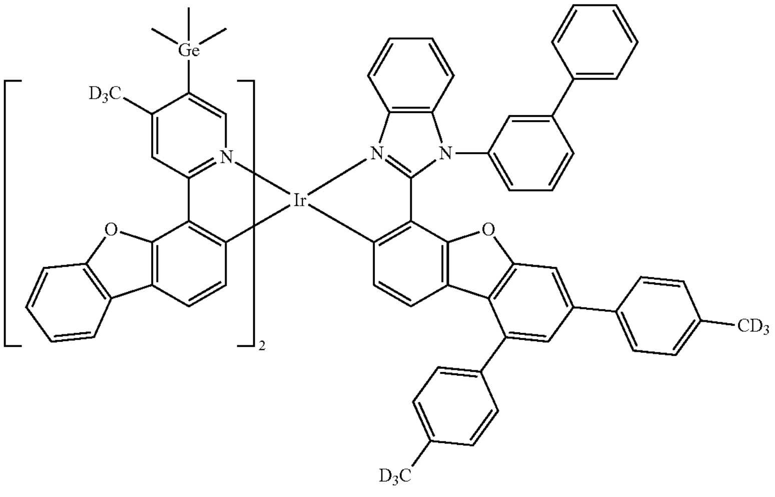

-continued
2729
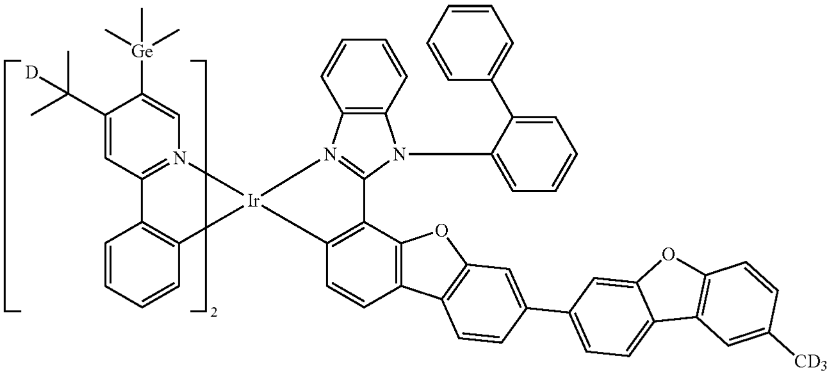
2730
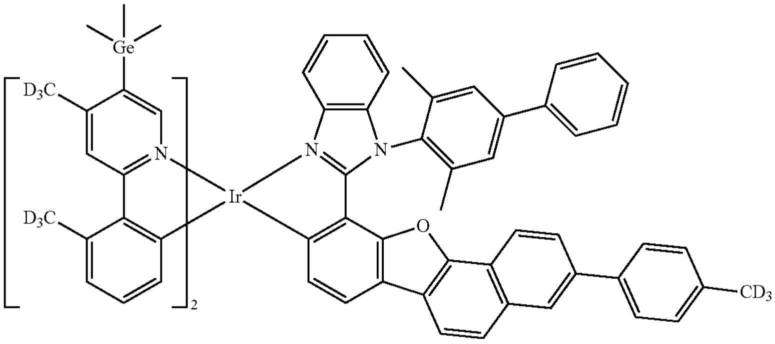
2731
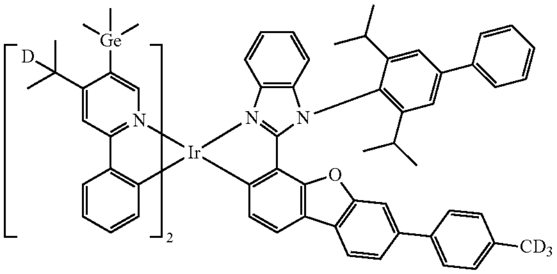
2732
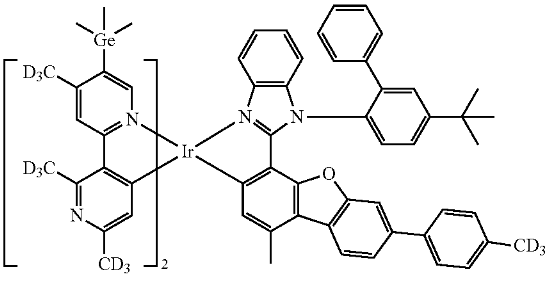
2733
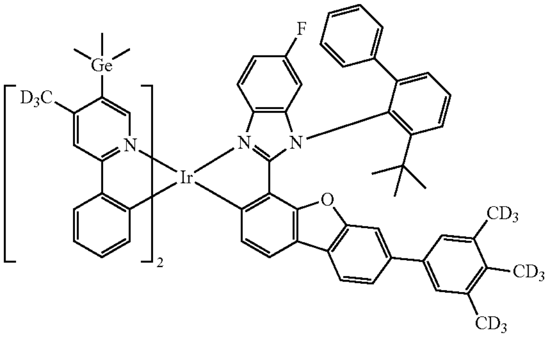
2734
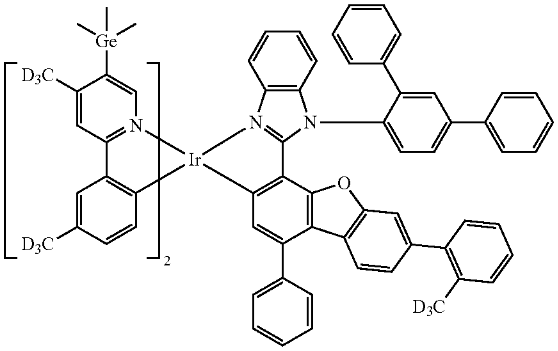

-continued
2735
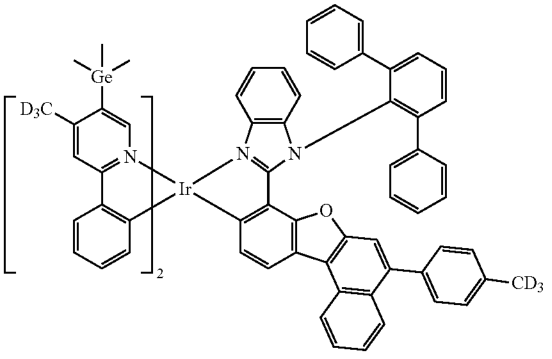
2736
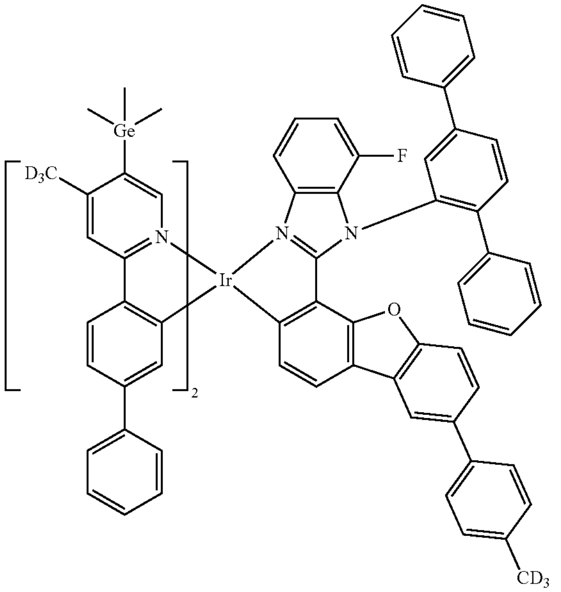
2737
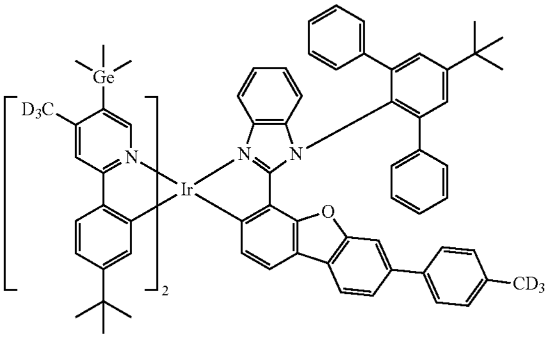
2738
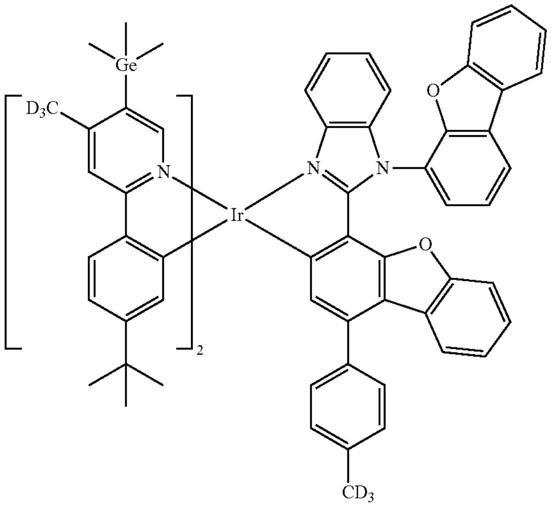
2739
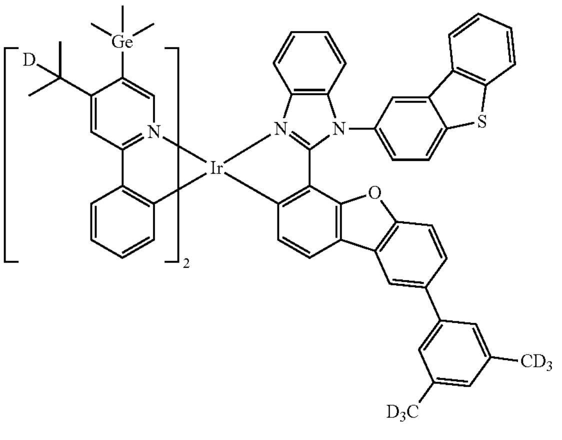
2740
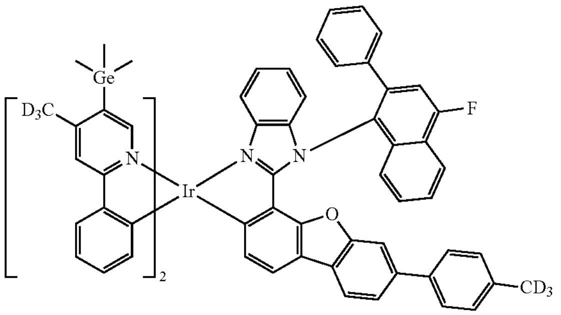

-continued
2741
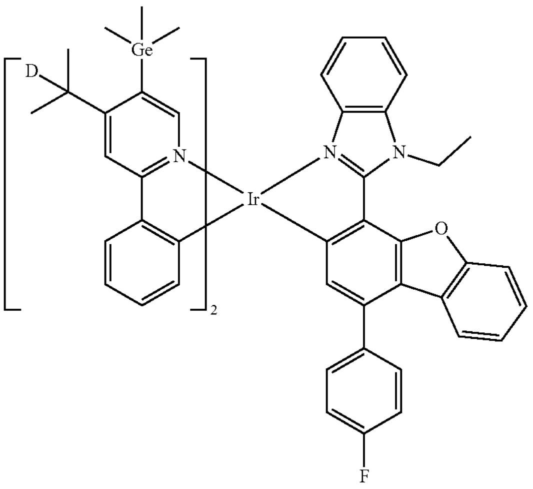
2742
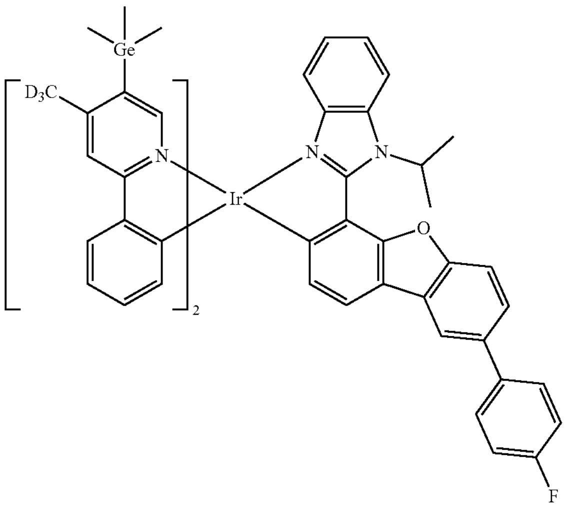
2743
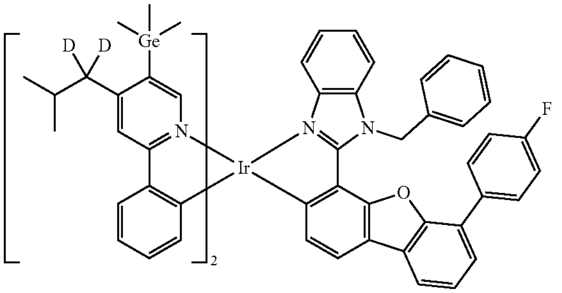
2744
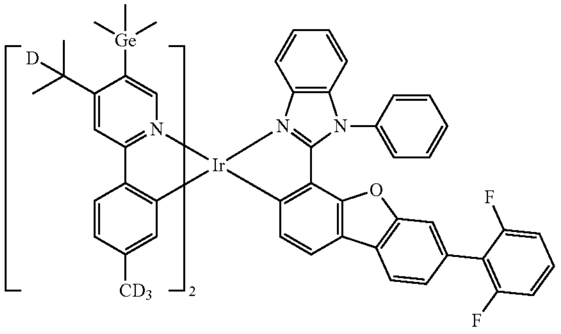
2745
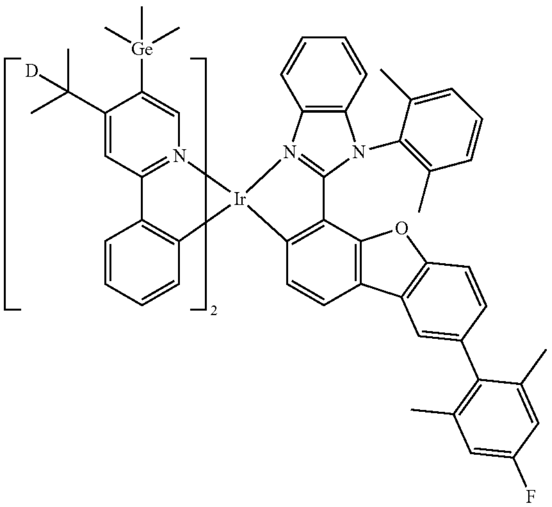
2746
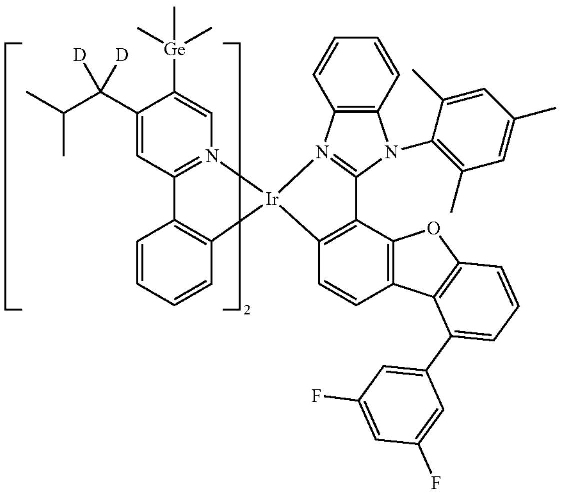

-continued
2747
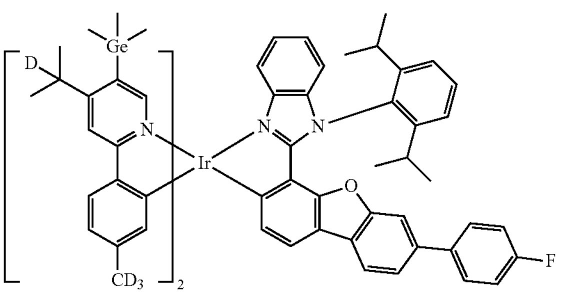
2748
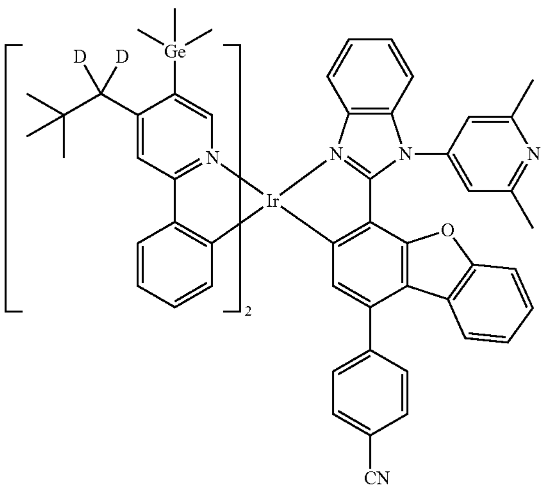
2749
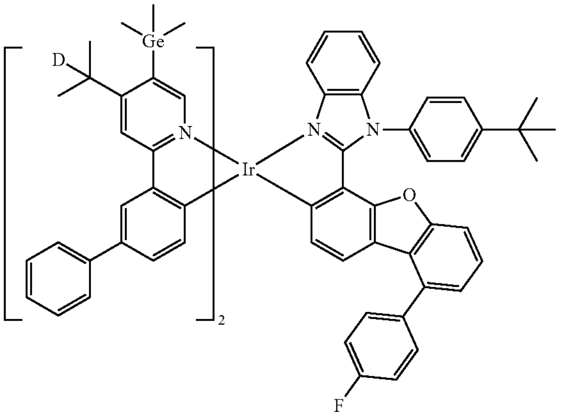
2750
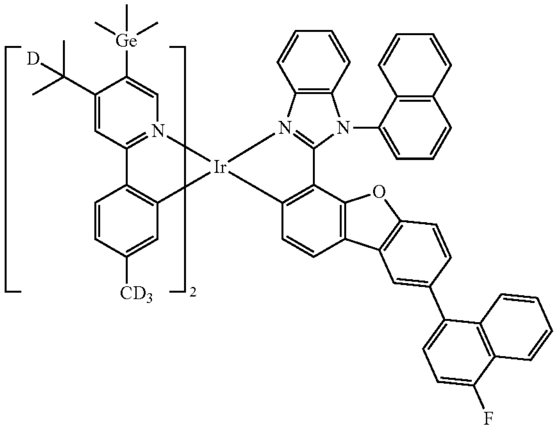
2751
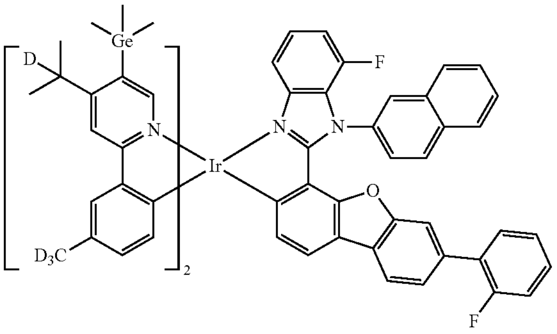
2752
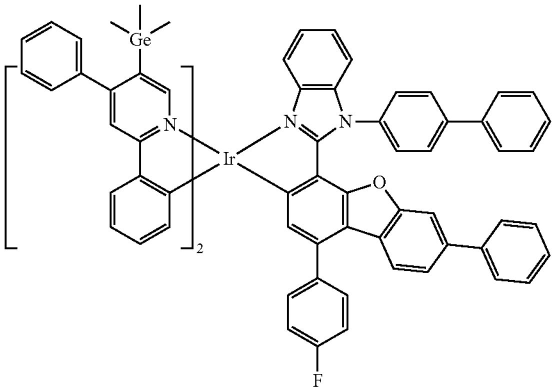

-continued
2753
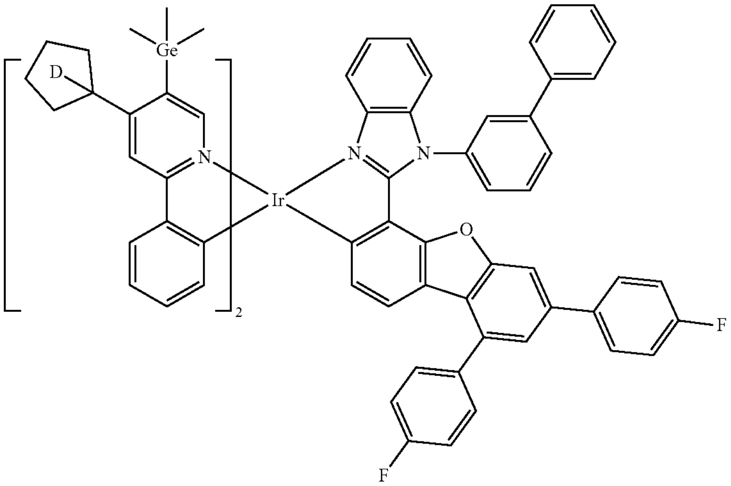
2754
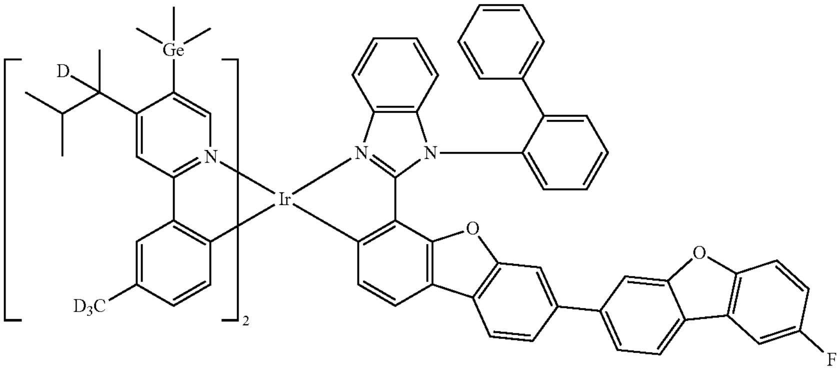
2755
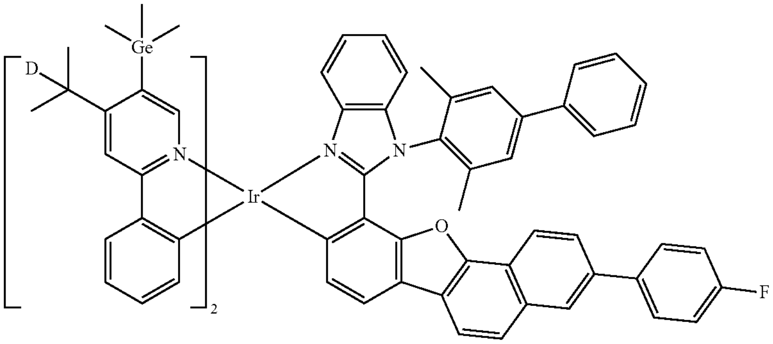
2756
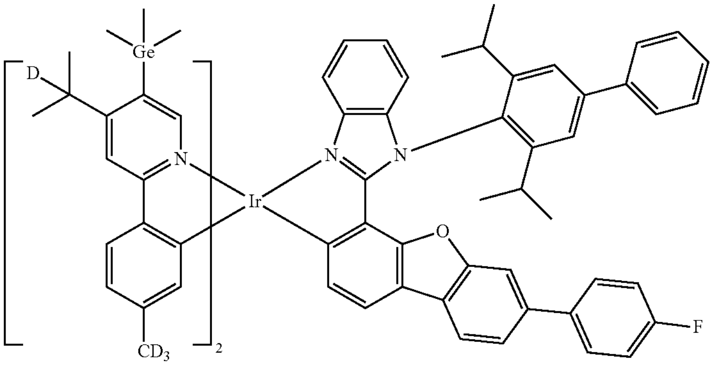

-continued
2757
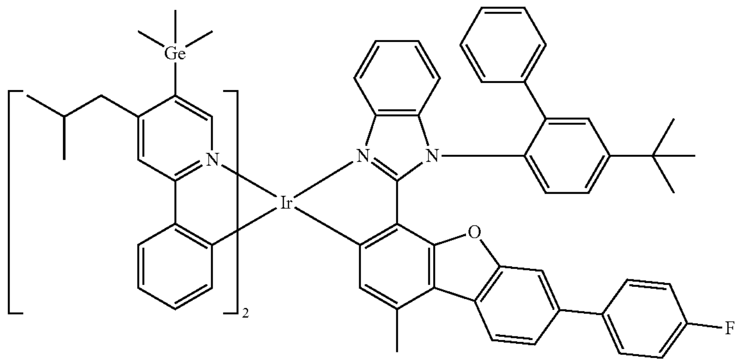
2758
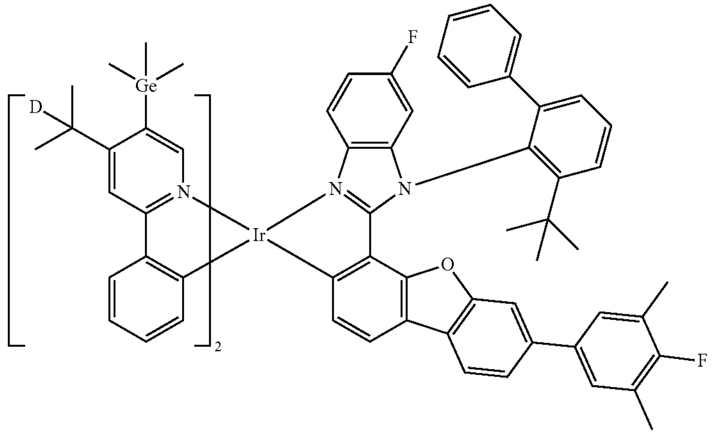
2759
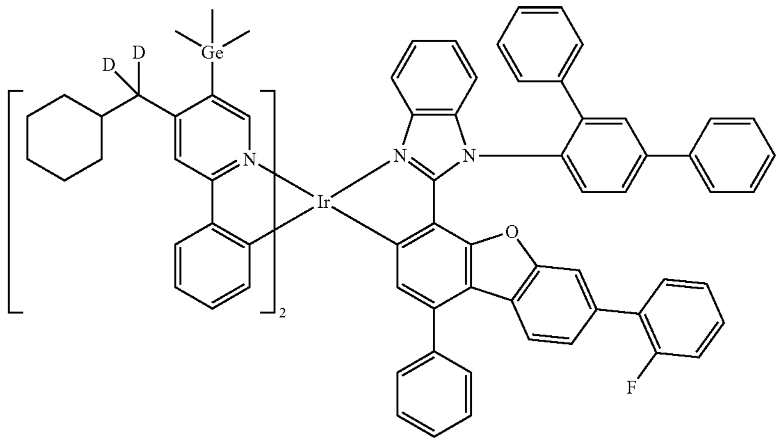

-continued
2760
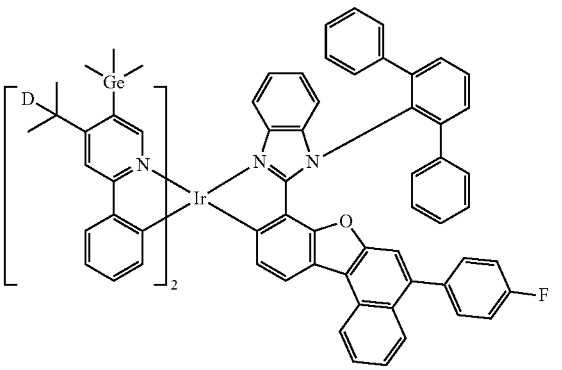
2761
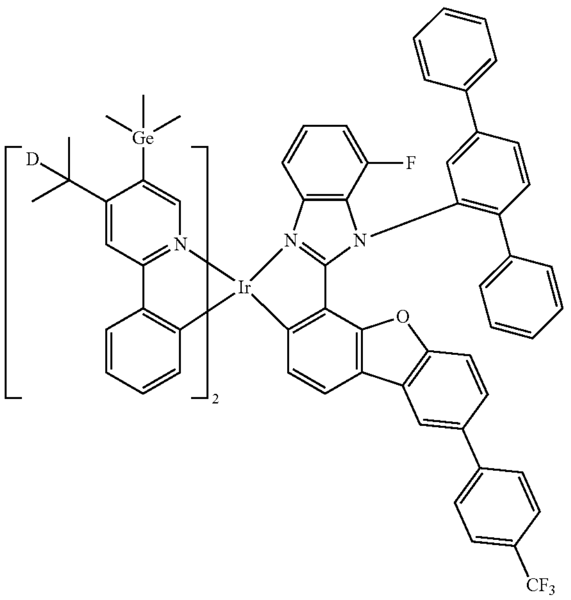
2762
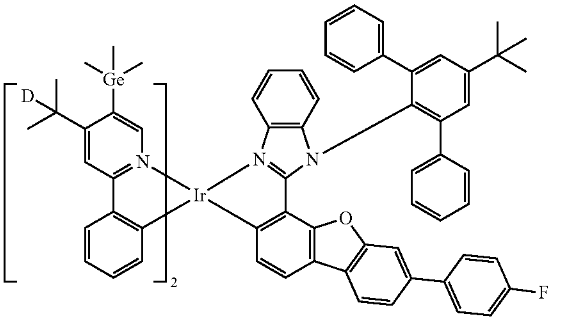
2763
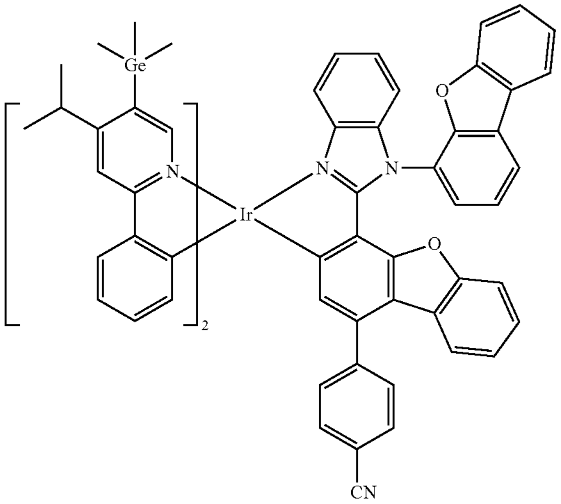
2764
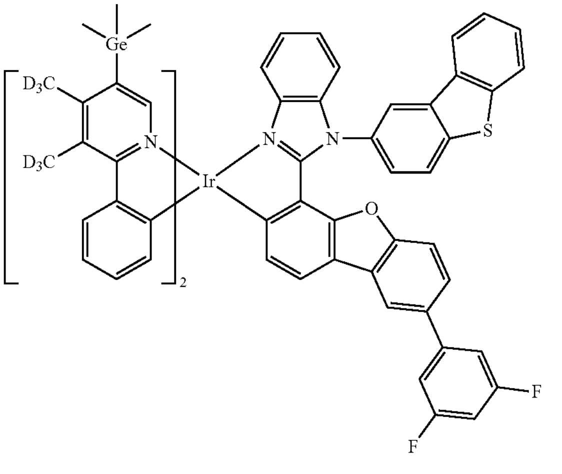
2765
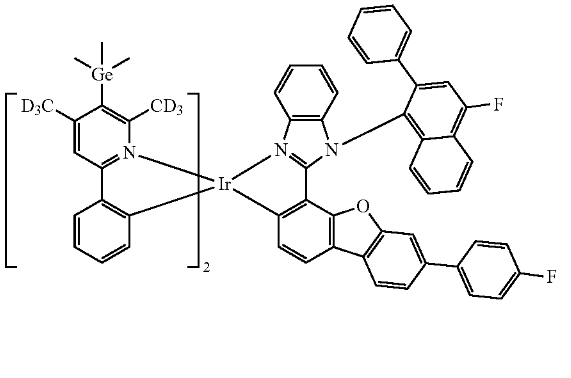

-continued
2766
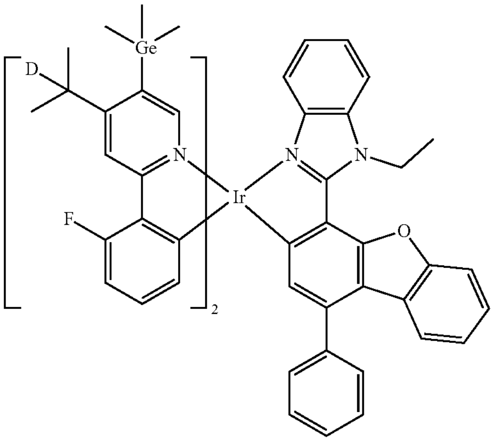
2767
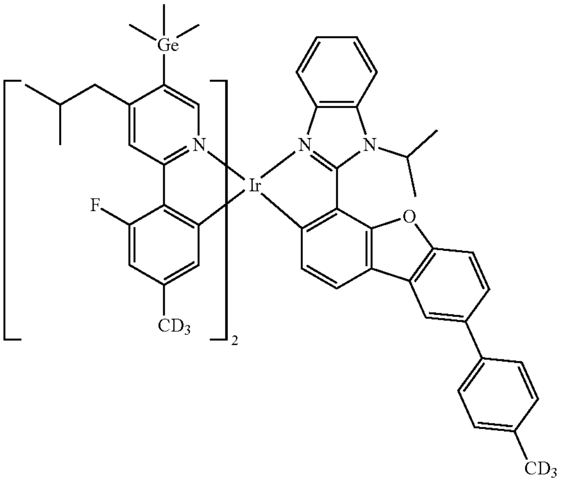
2768
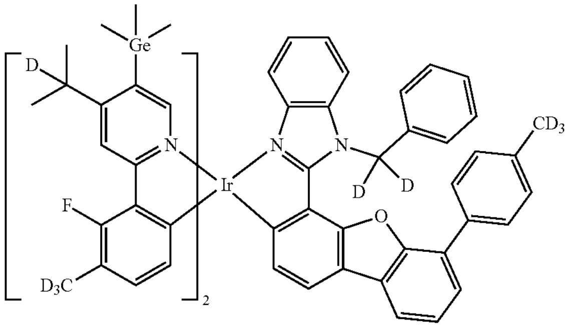
2769
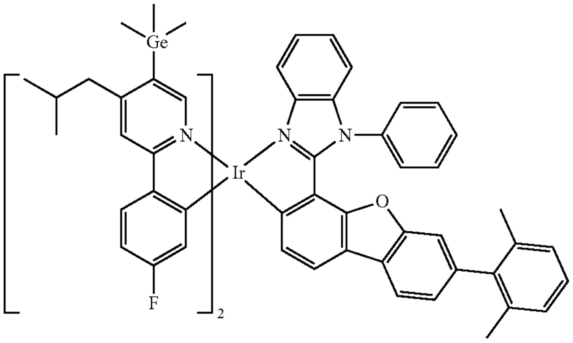
2770
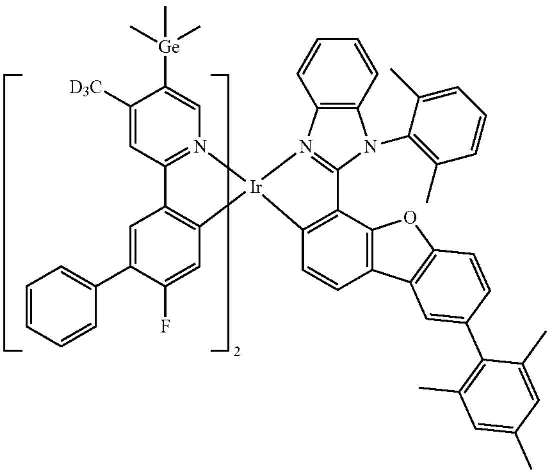
2771
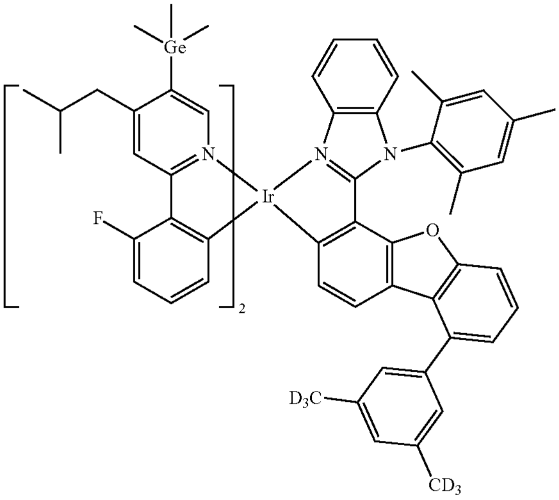

-continued
2772
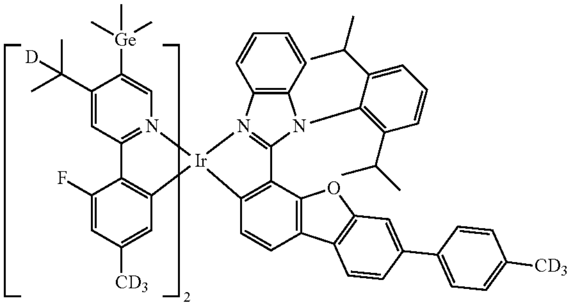
2773
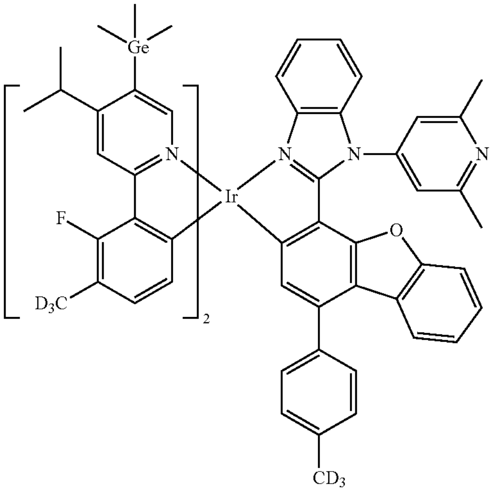
2774
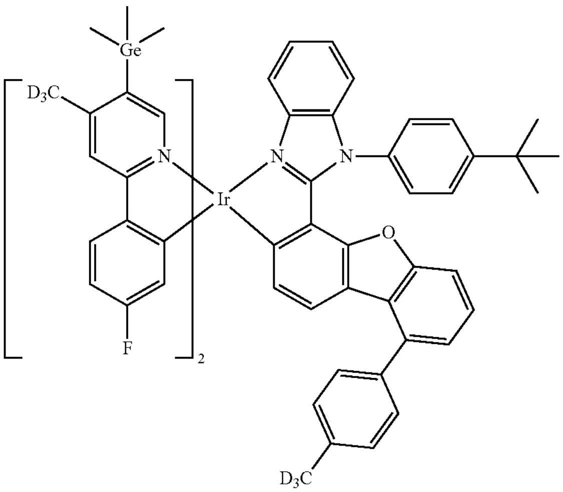
-continued
2775
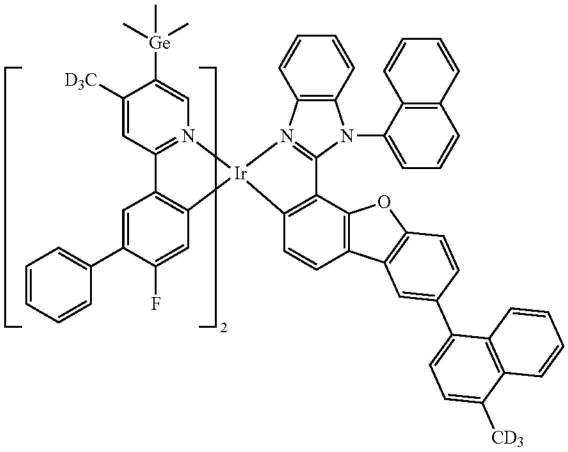
2776
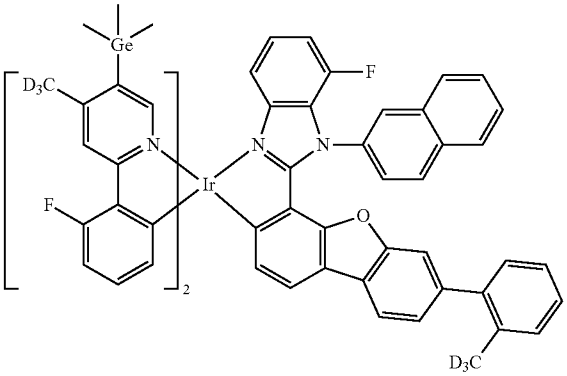
2777
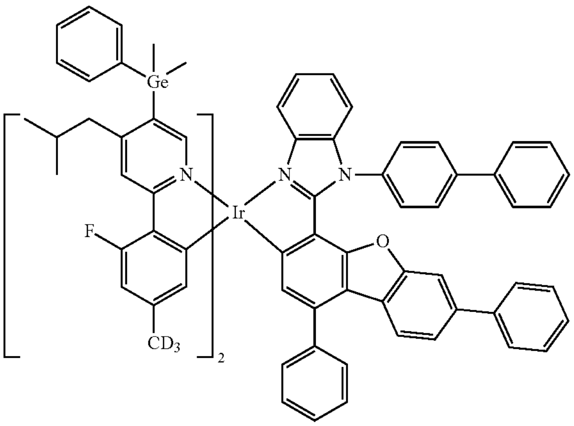

-continued
2778
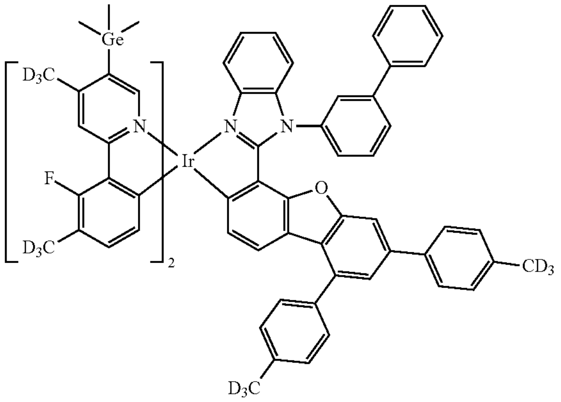
2779
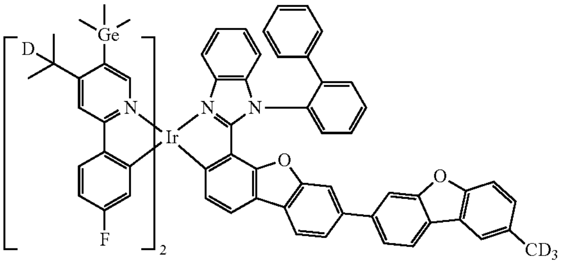
2780
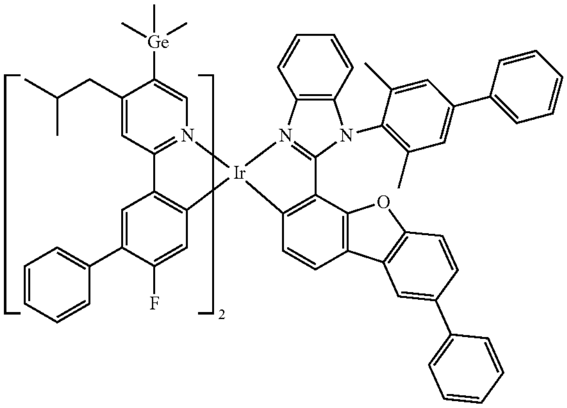
2781
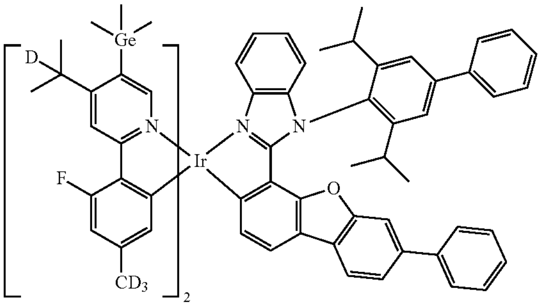
-continued
2782
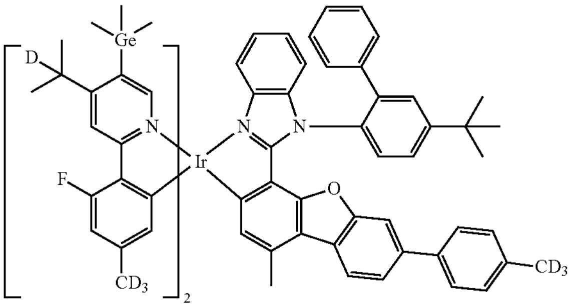
2783
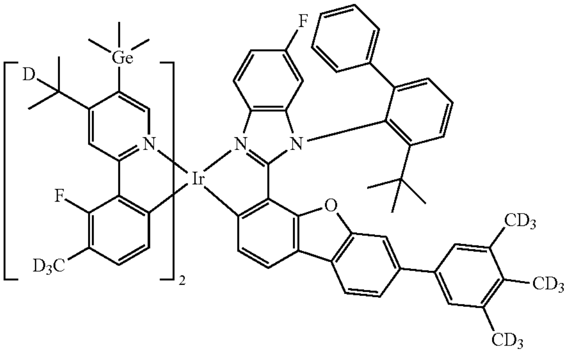
2784
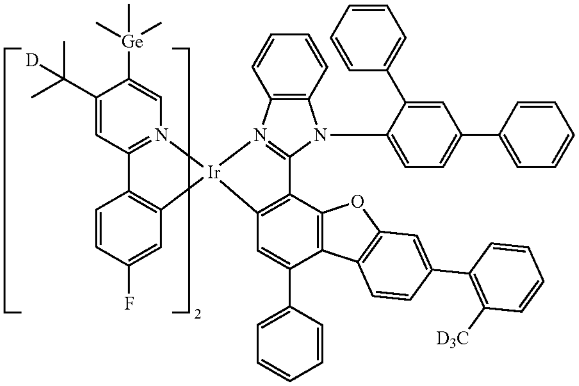
2785
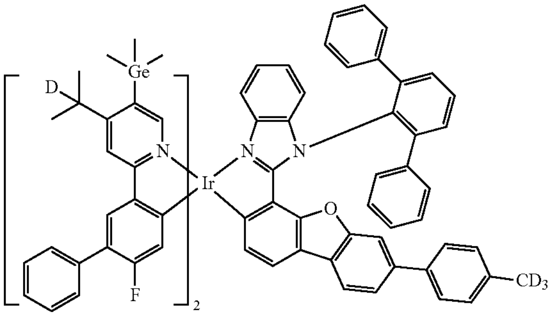

-continued
2786
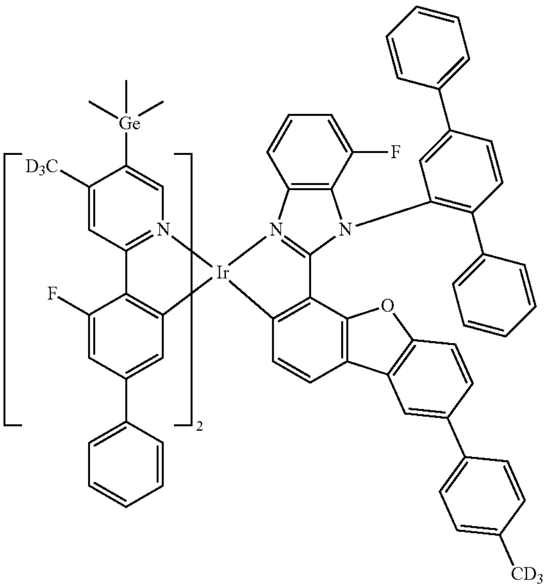
2787
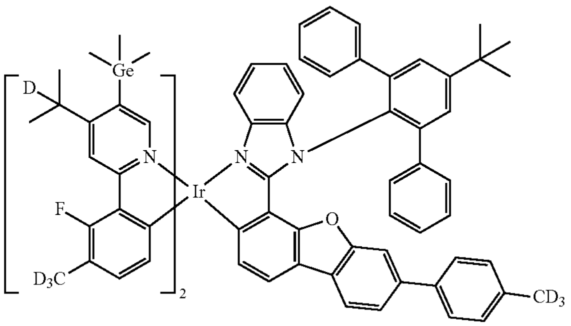
2788
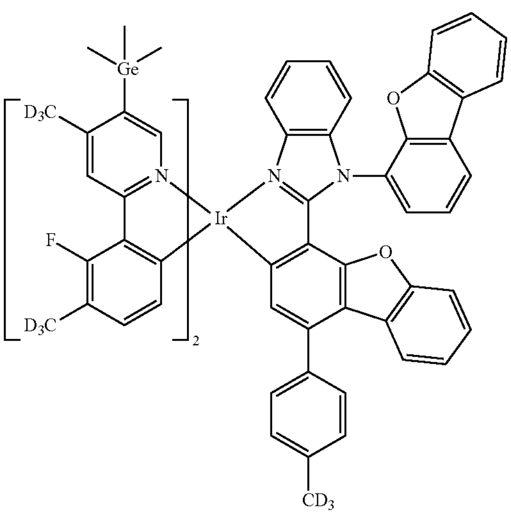
-continued
2789
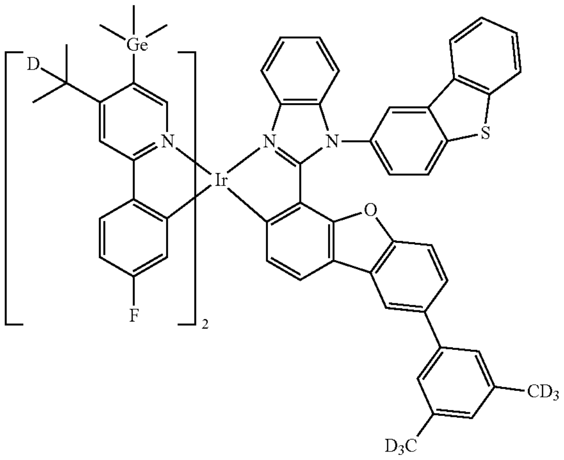
2790
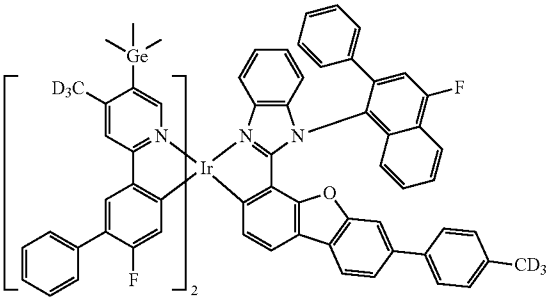
2791
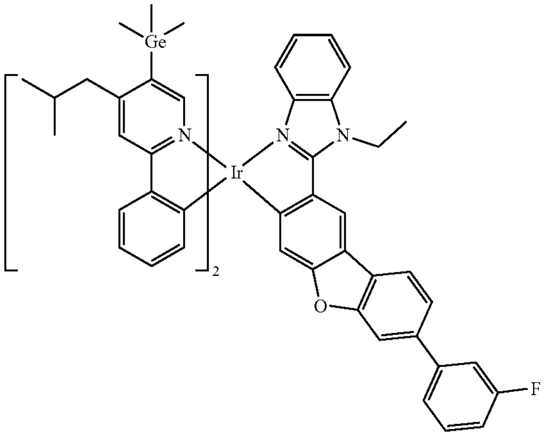
2792
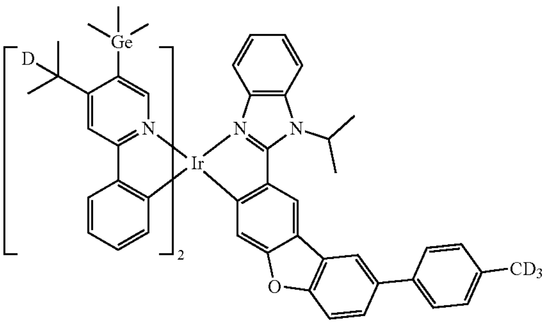

-continued
2793
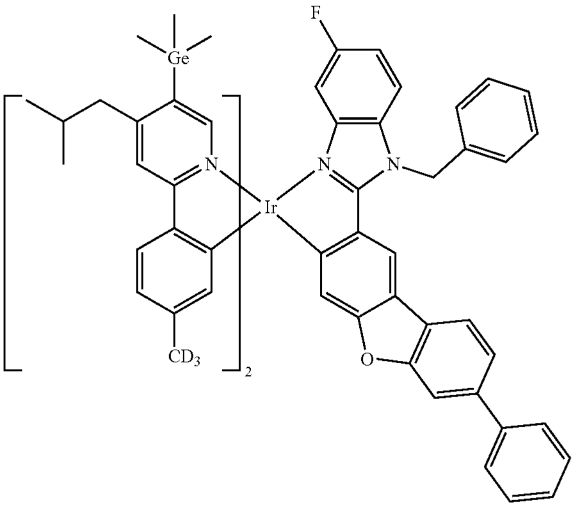
2794
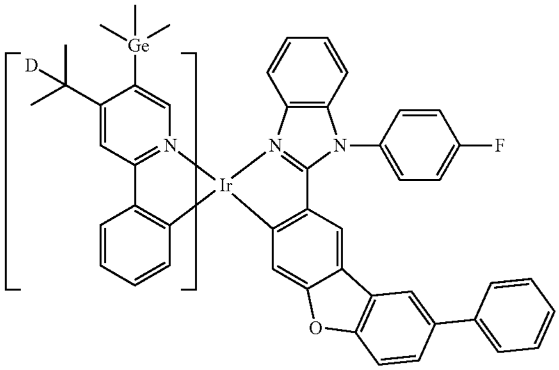
2795
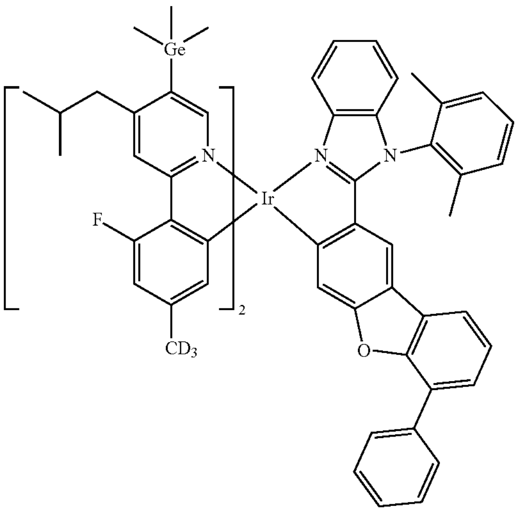
-continued
2796
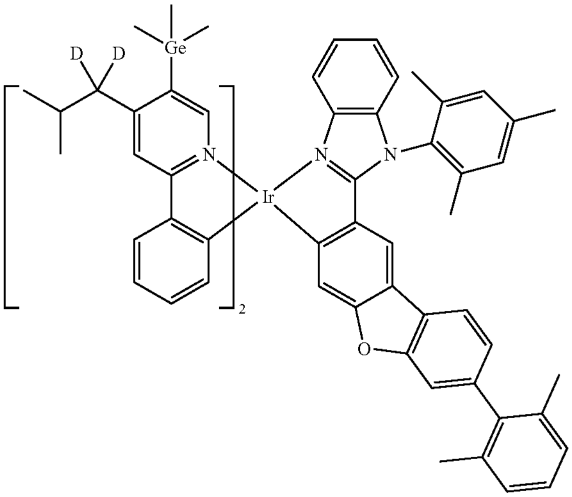
2797
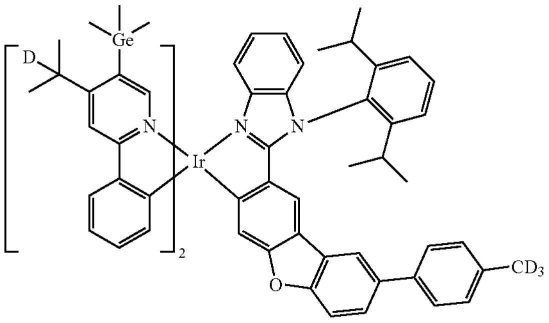
2798
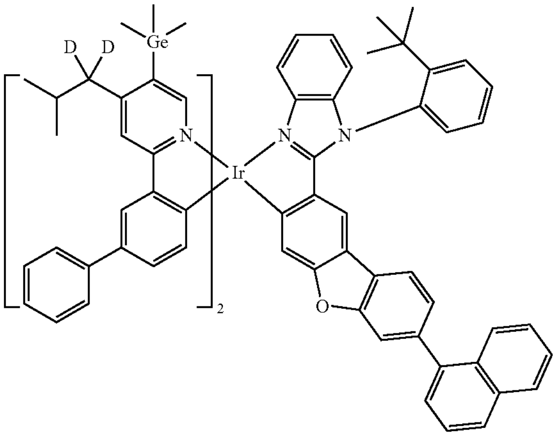

-continued
2799
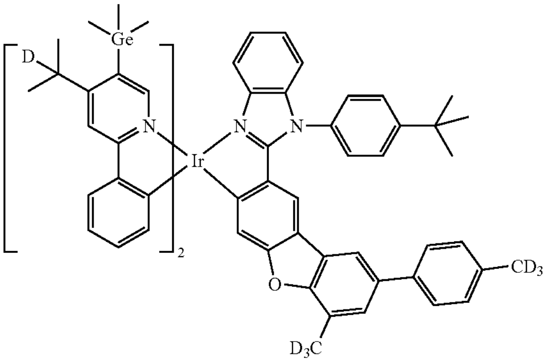
2800
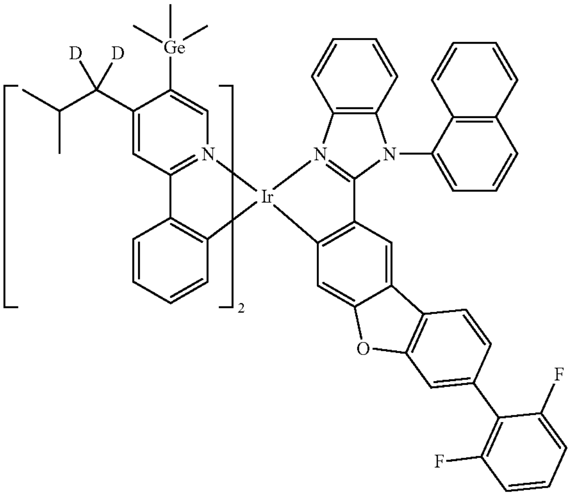
2801
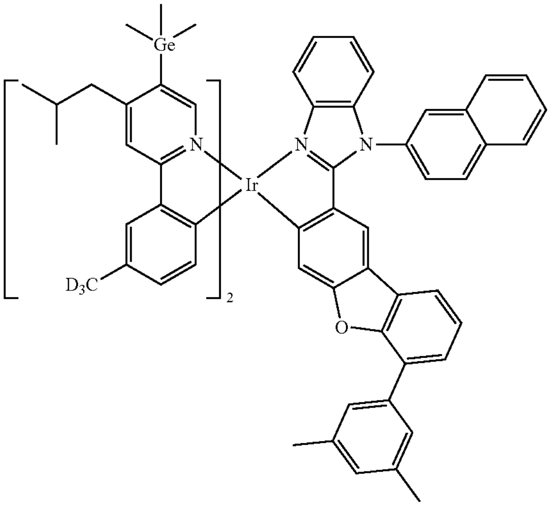
-continued
2802
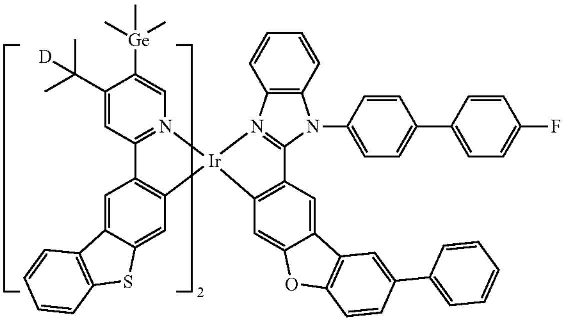
2803
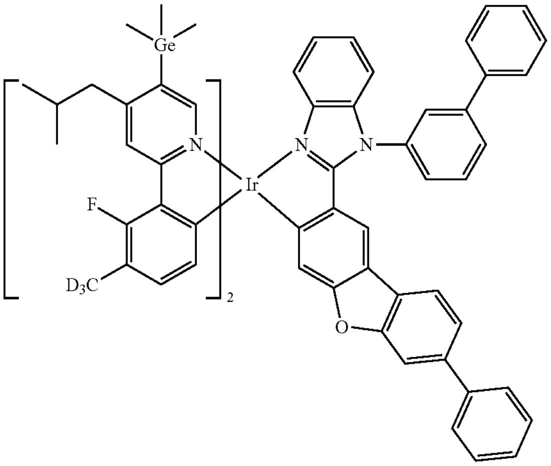
2804
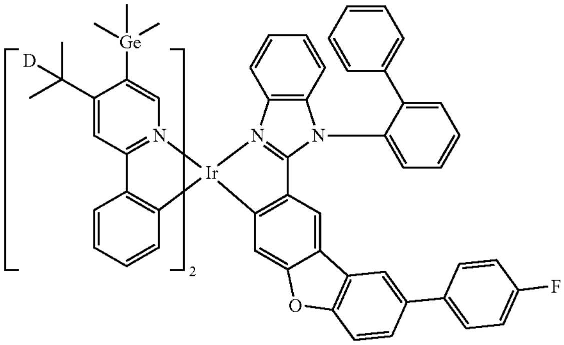
2805
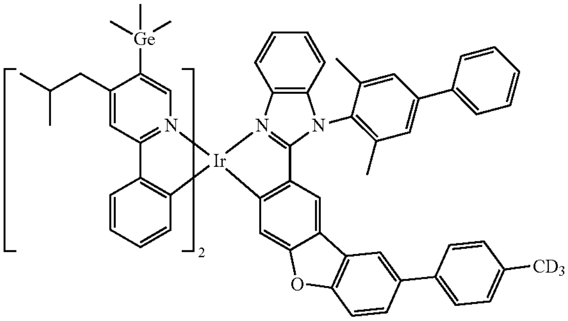

2806
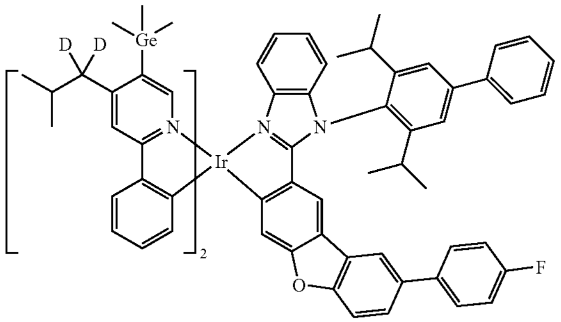
2807
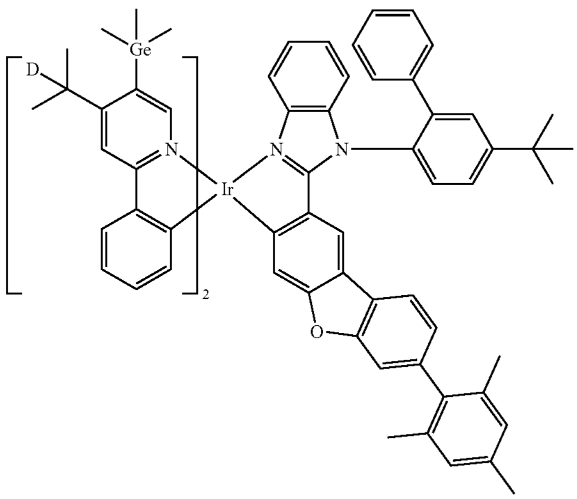
2808
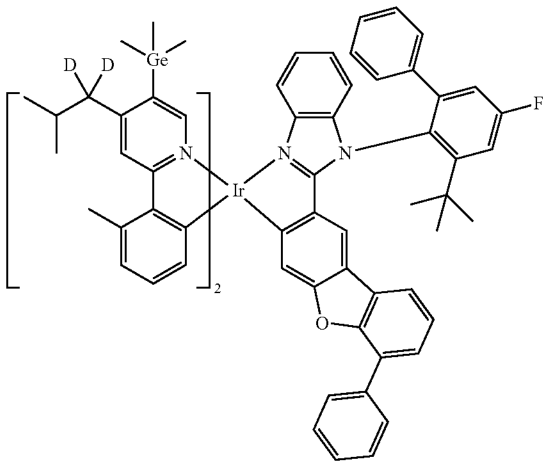
2809
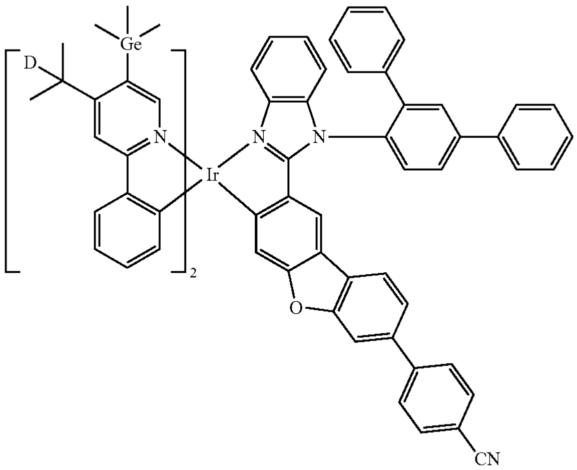
2810
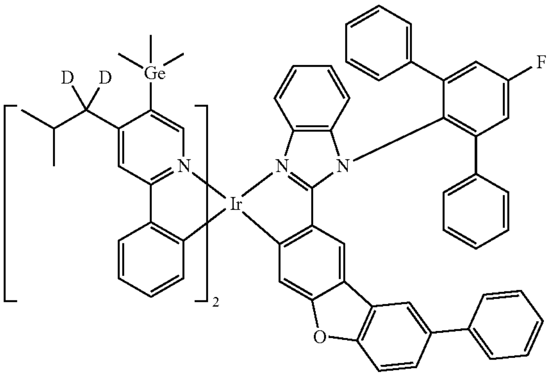
2811
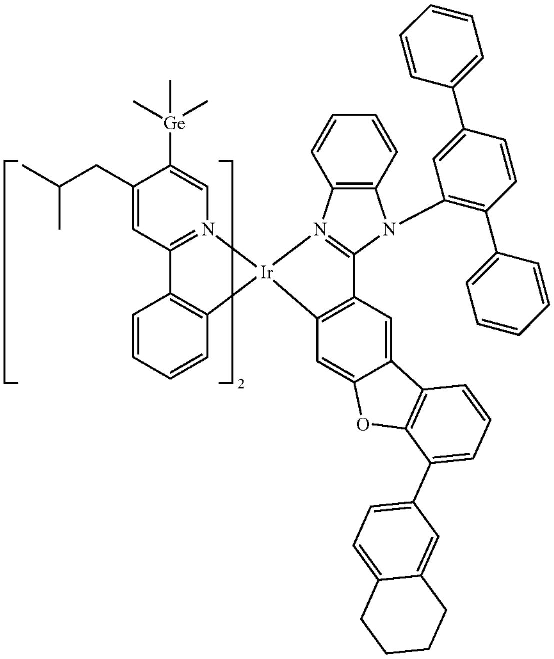

-continued
2812
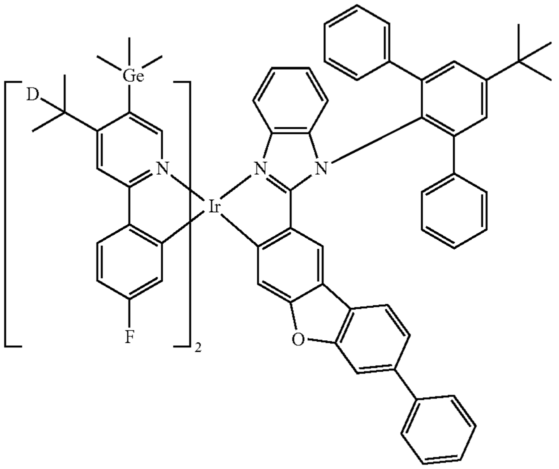
2813
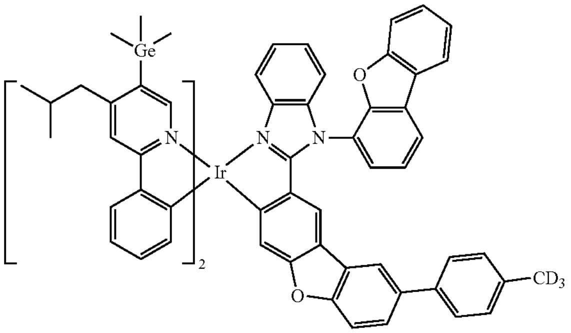
2814
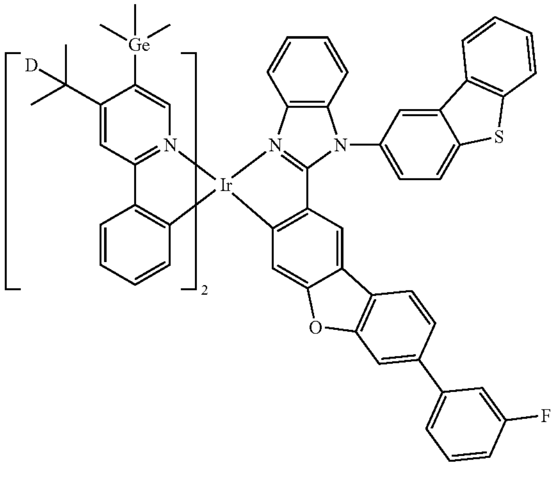
-continued
2815
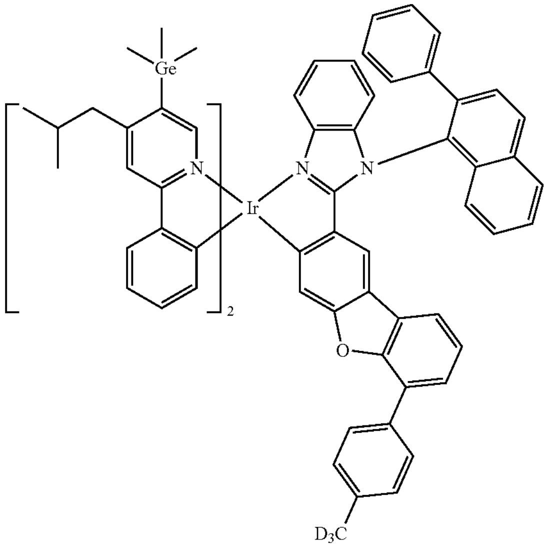
2816
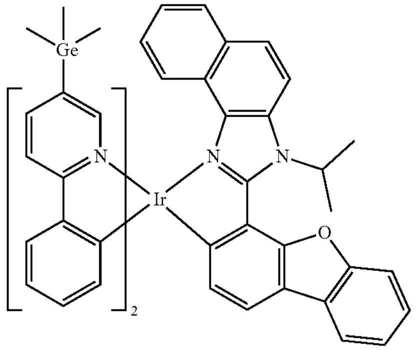
2817
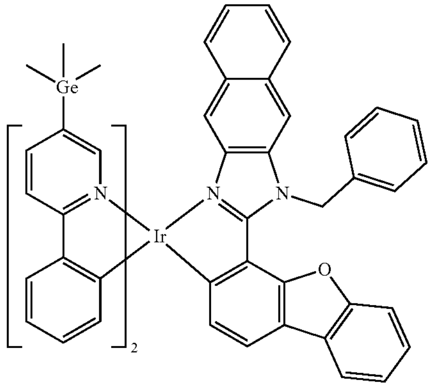

-continued
2818
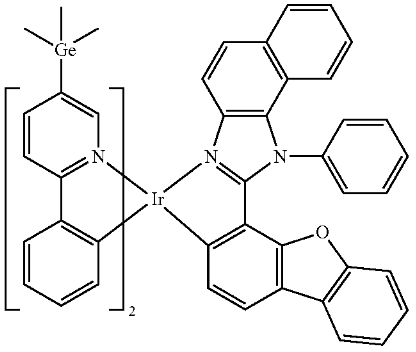
2819
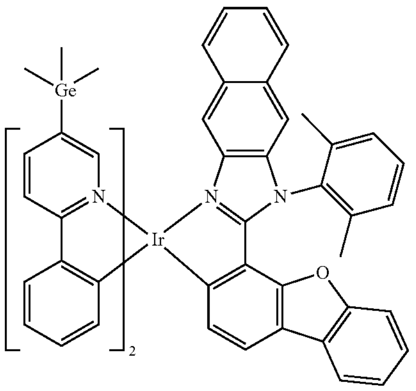
2820
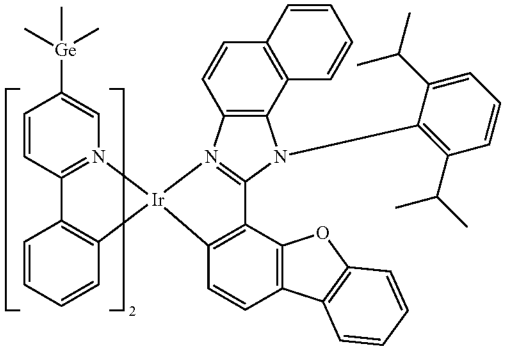
2821
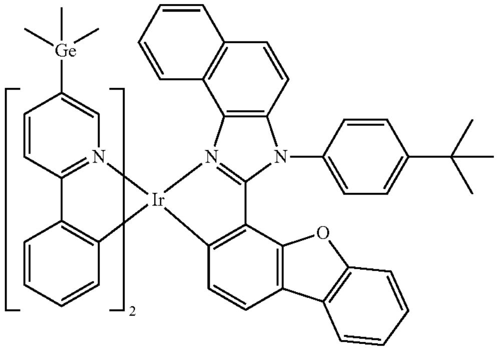
-continued
2822
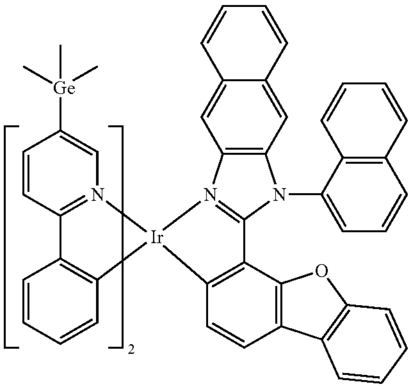
2823
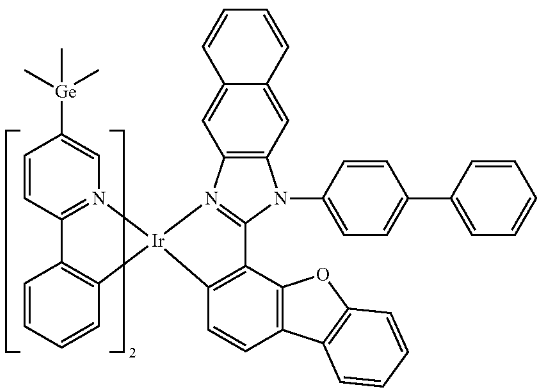
2824
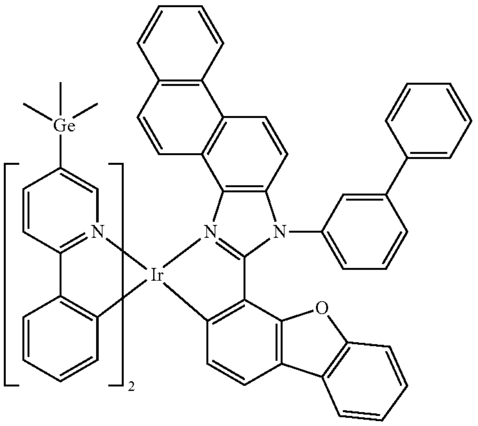
2825
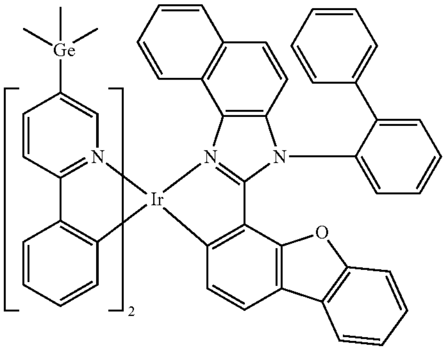

-continued
2826
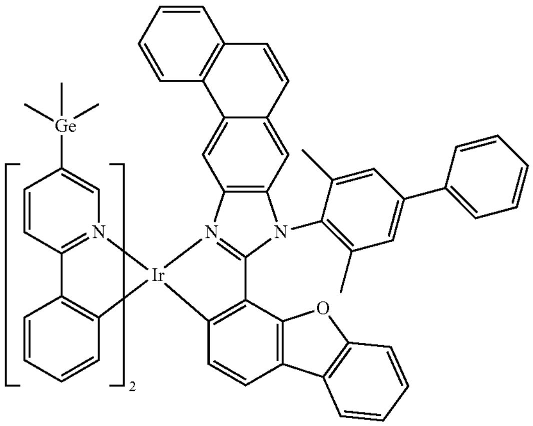
2827
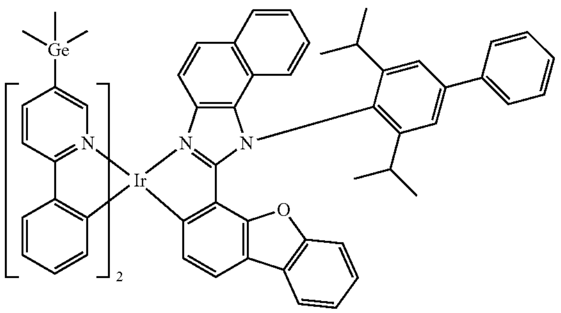
2828
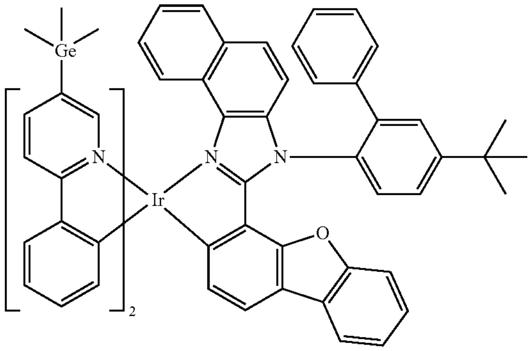
2829
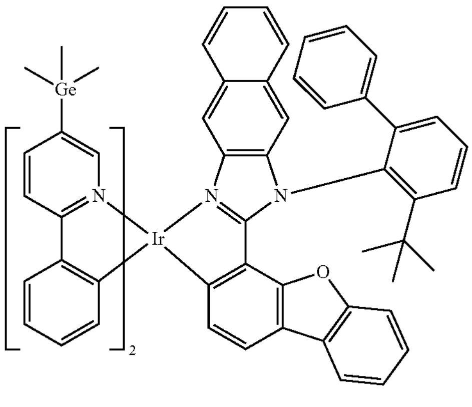
-continued
2830
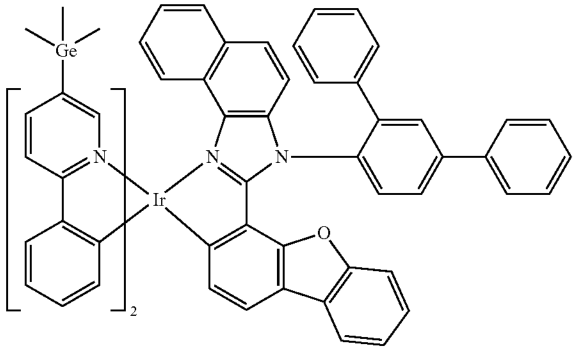
2831
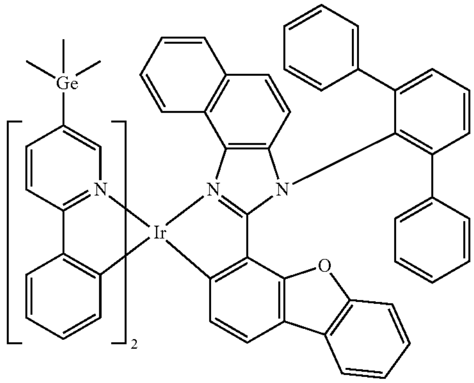
2832
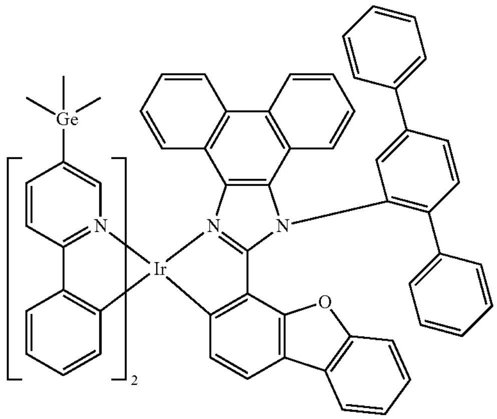
2833
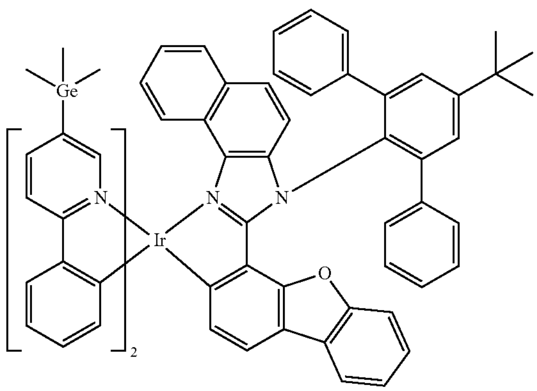

-continued
2834
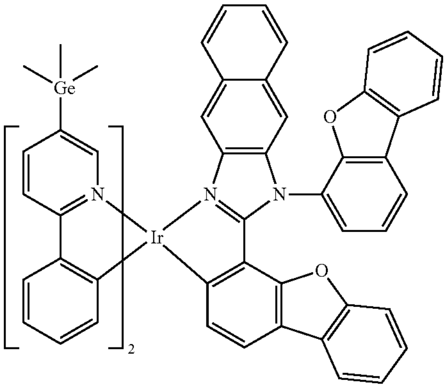
2835
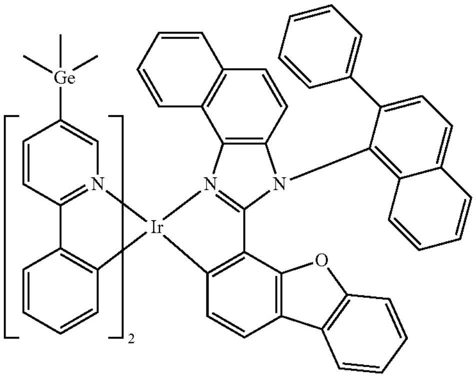
2836
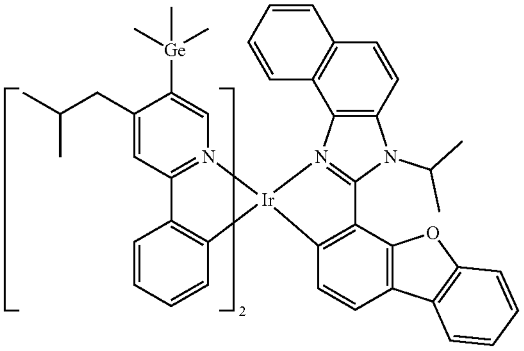
2837
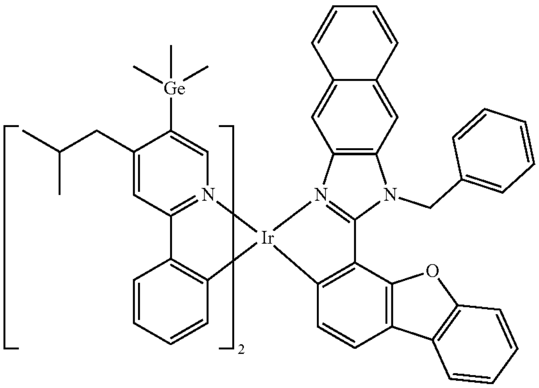
-continued
2838
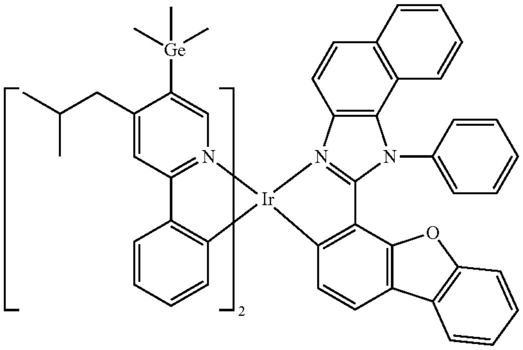
2839
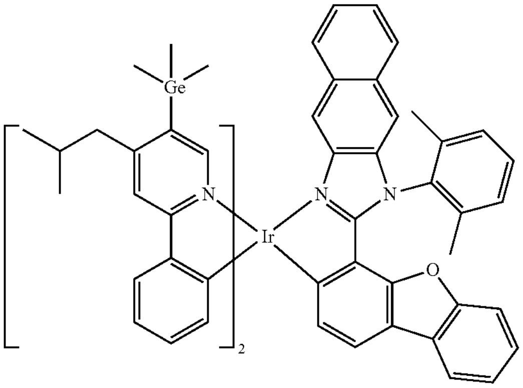
2840
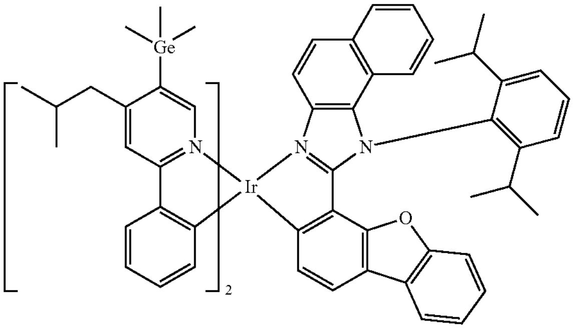
2841
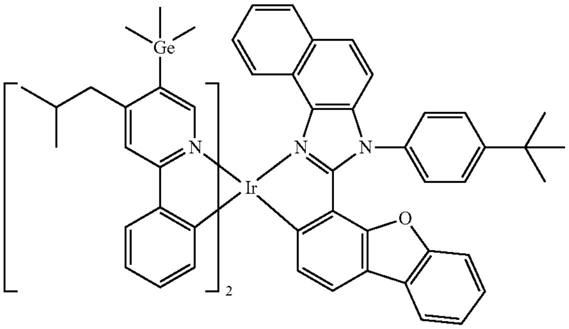

-continued
2842
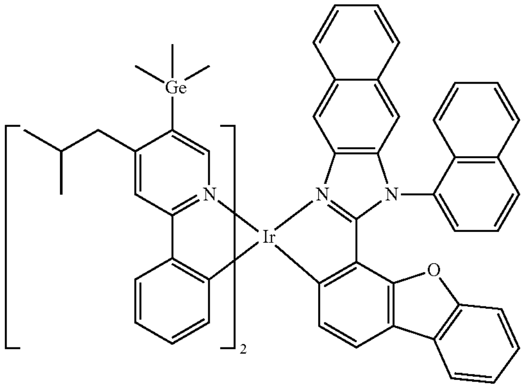
2843
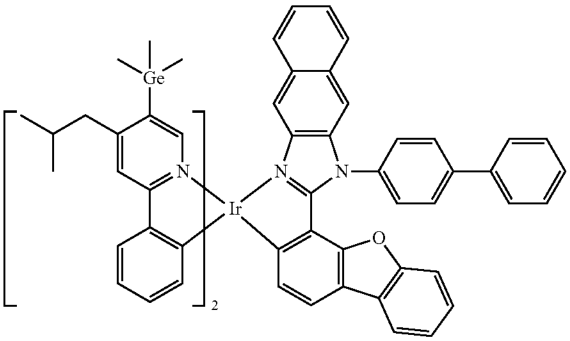
2844
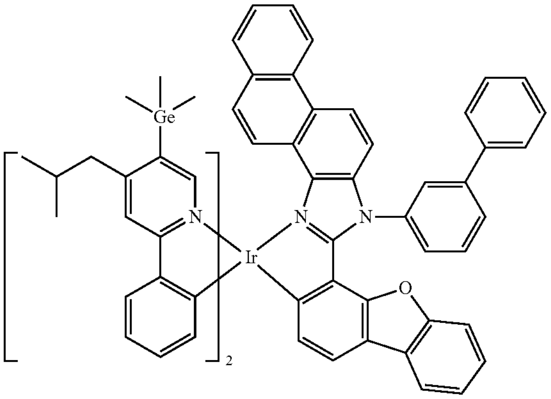
2845
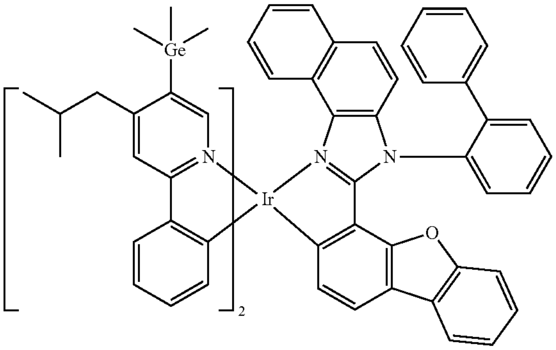
-continued
2846
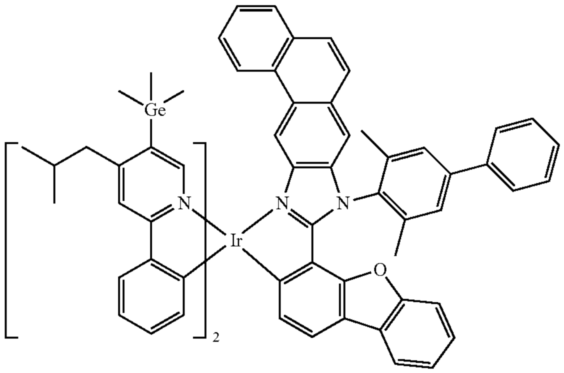
2847
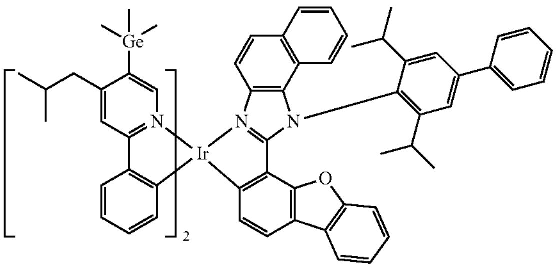
2848
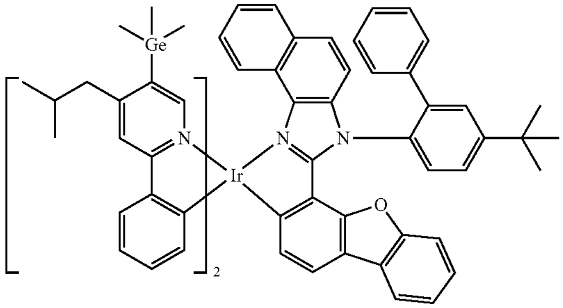
2849
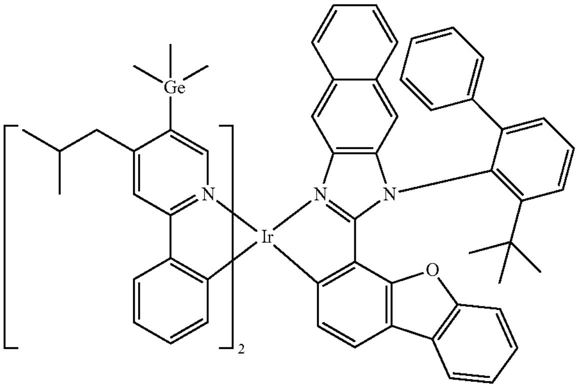

-continued
2850
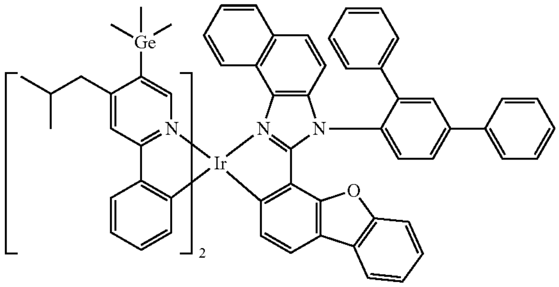
2851
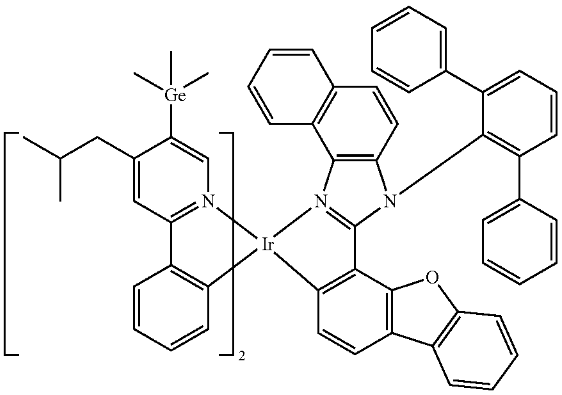
2852
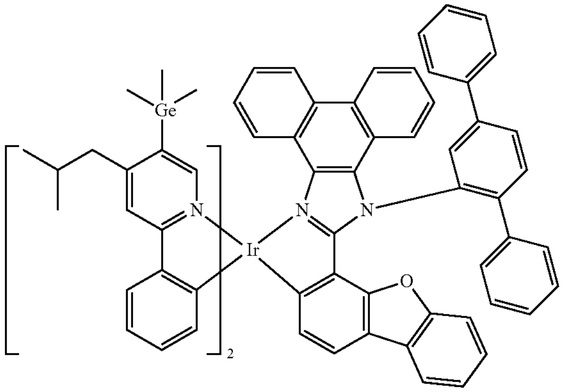
2853
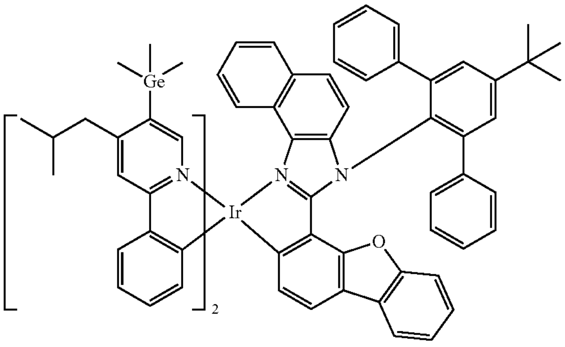
-continued
2854
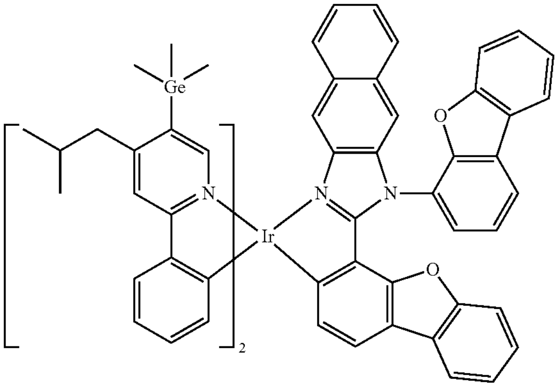
2855
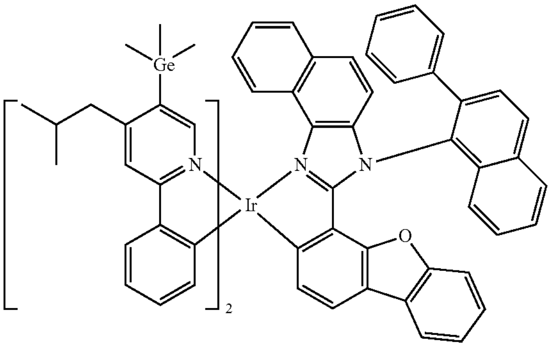
2856
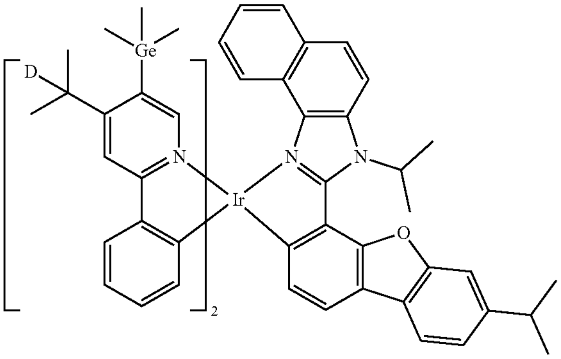
2857
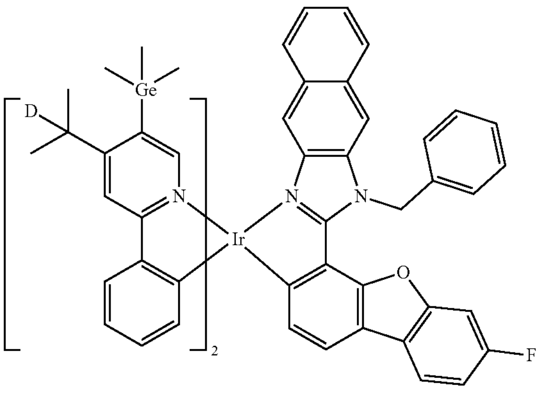

-continued
2858
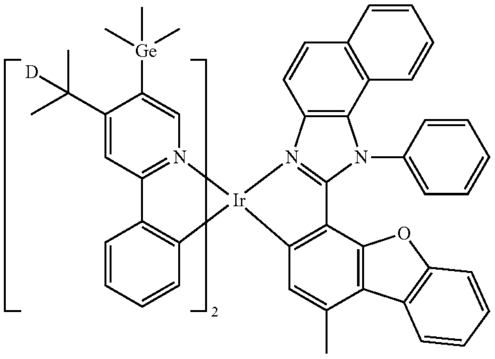
2859
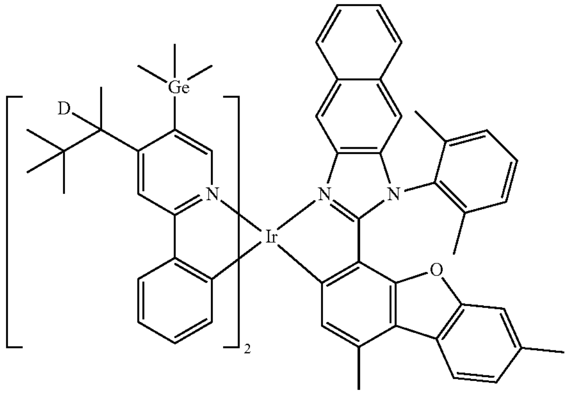
2860
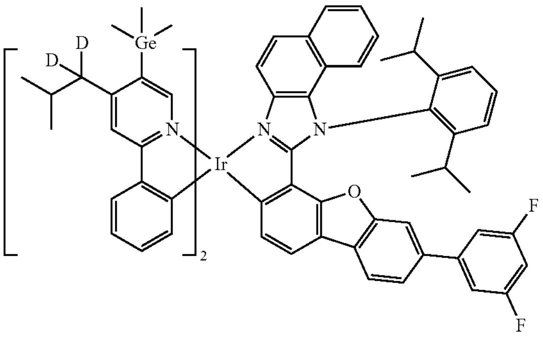
2861
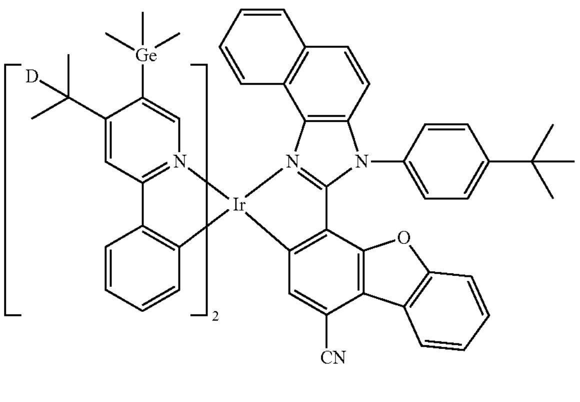
-continued
2862
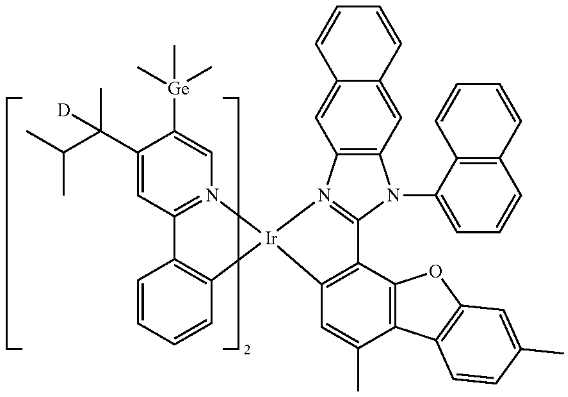
2863
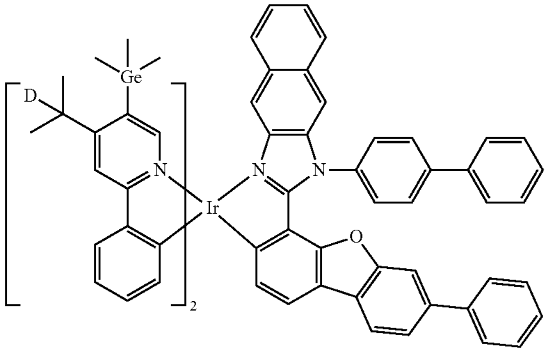
2864
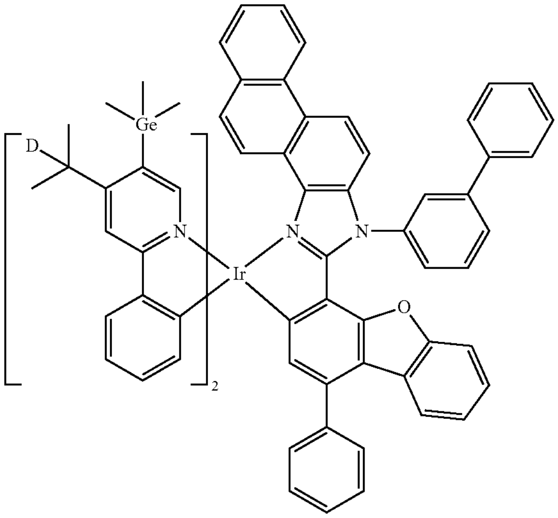

-continued
2865
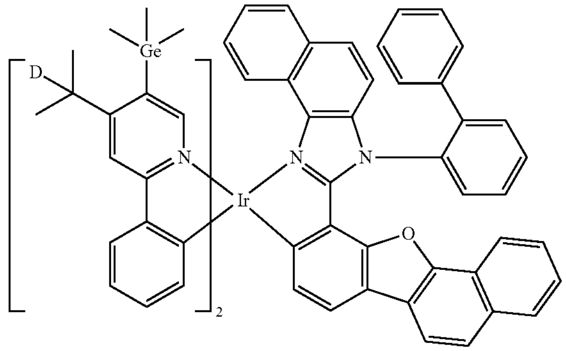
2866
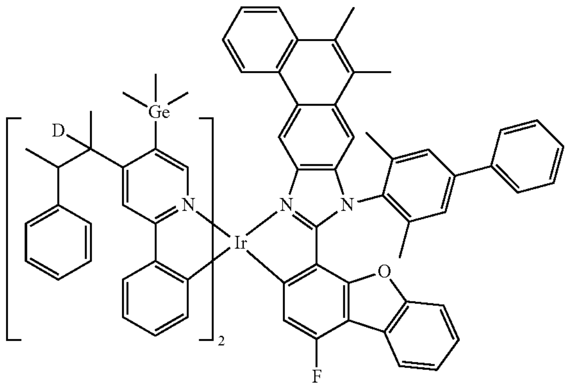
2867
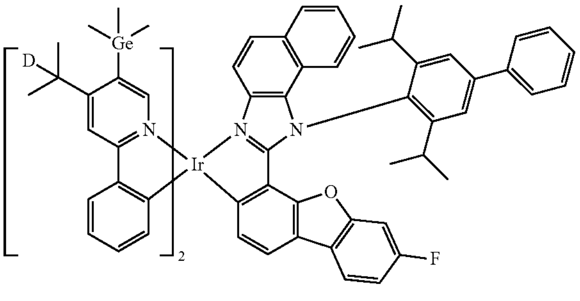
2868
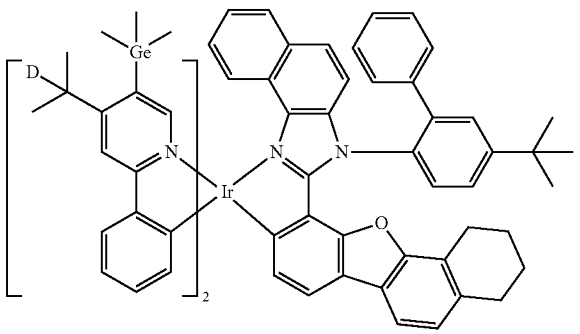
-continued
2869
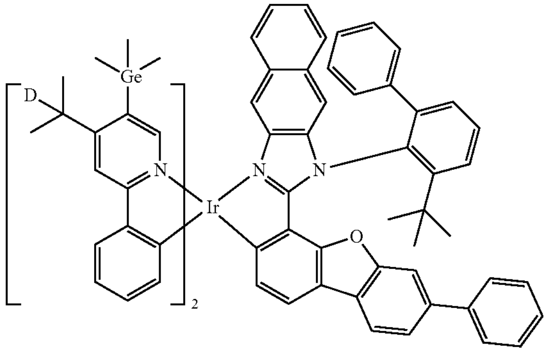
2870
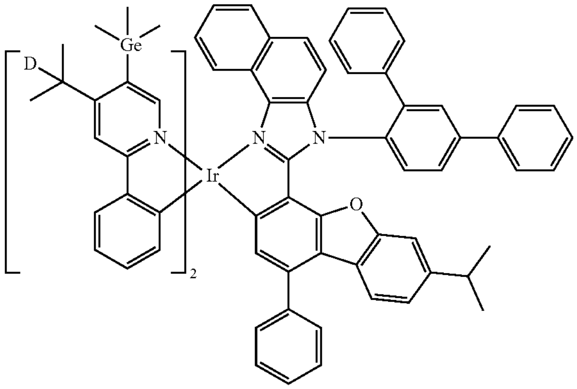
2871
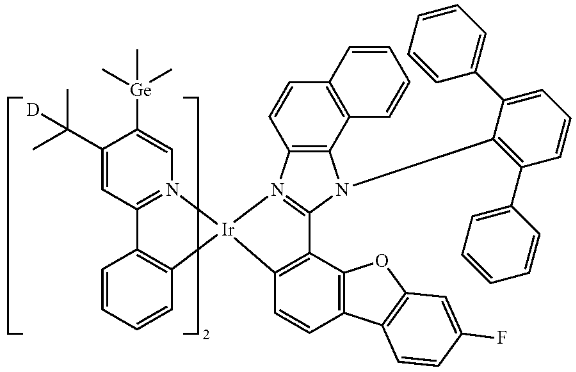
2872
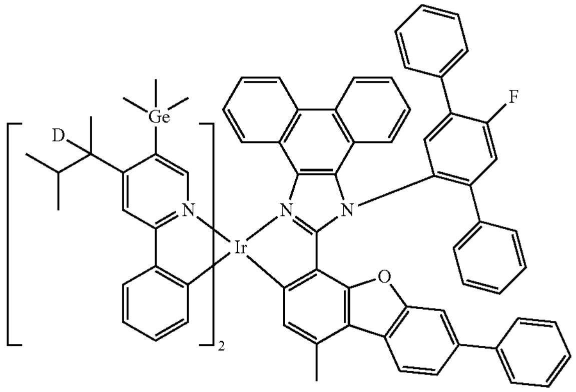

-continued
2873
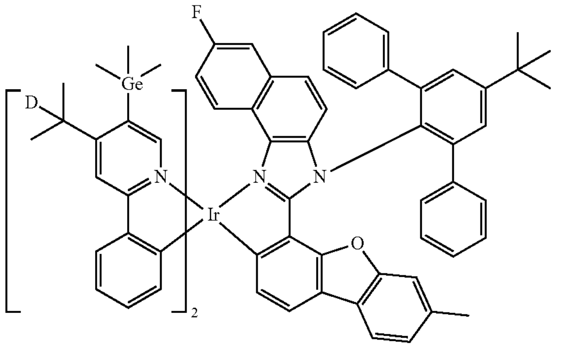
2874
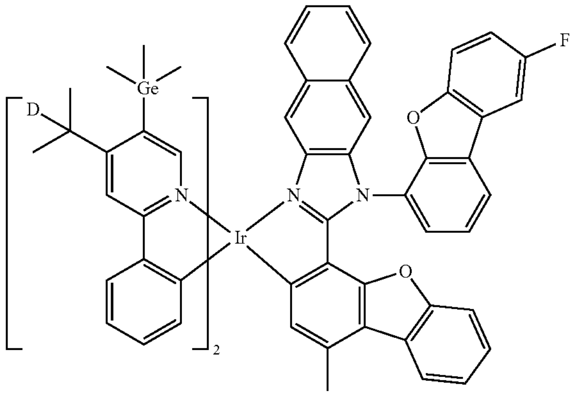
2875
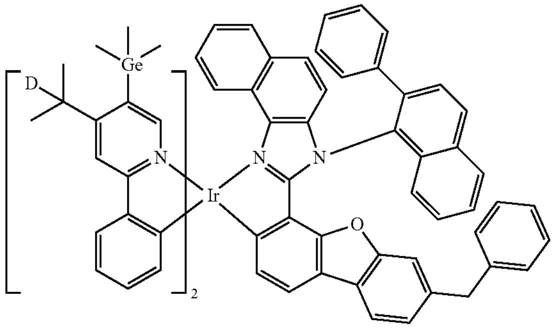
2876
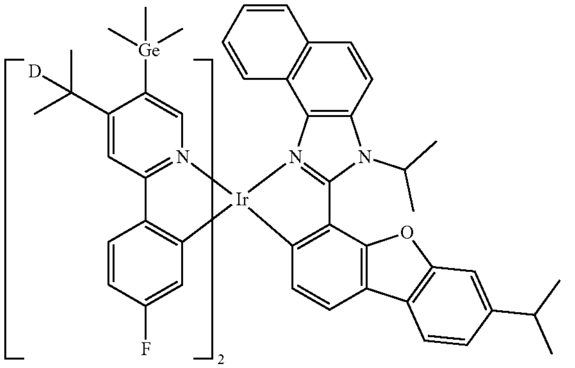
-continued
2877
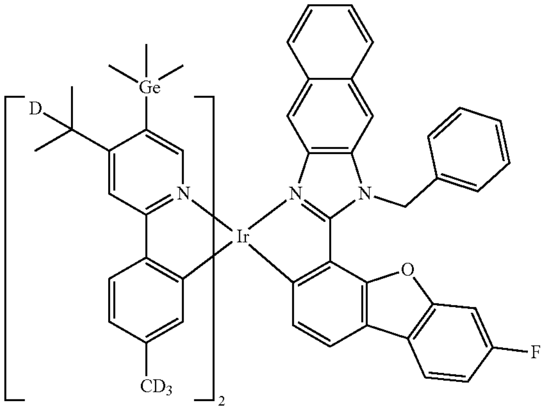
2878
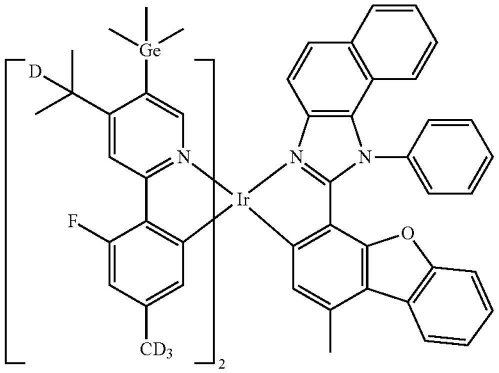
2879
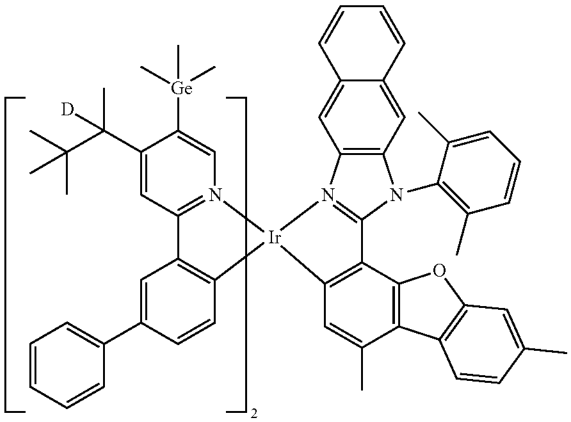
2880
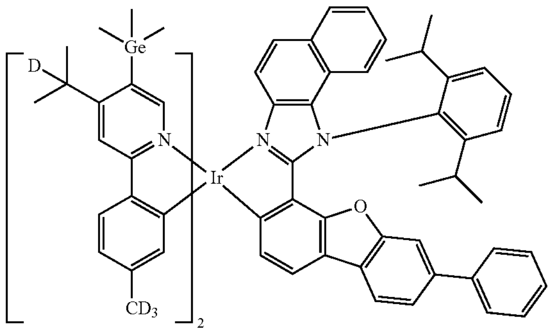

-continued
2881
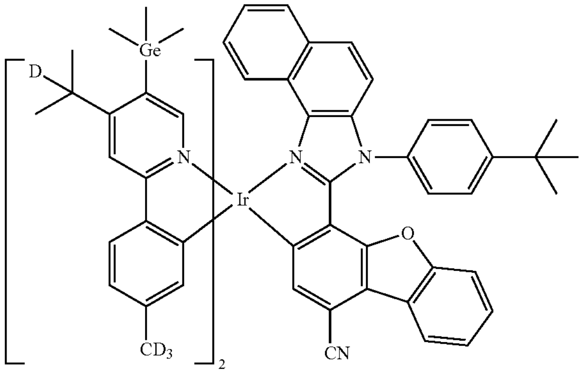
2882
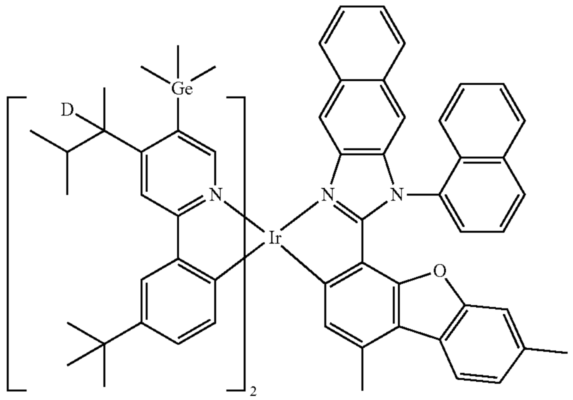
2883
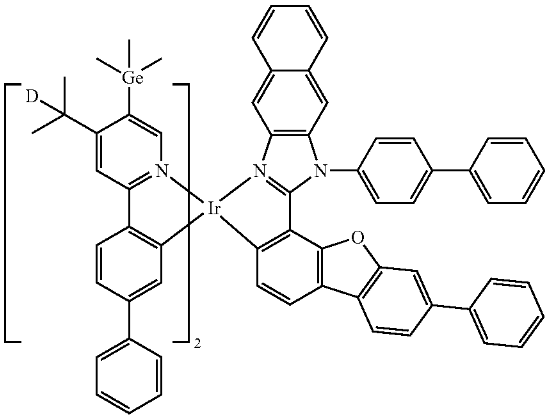
-continued
2884
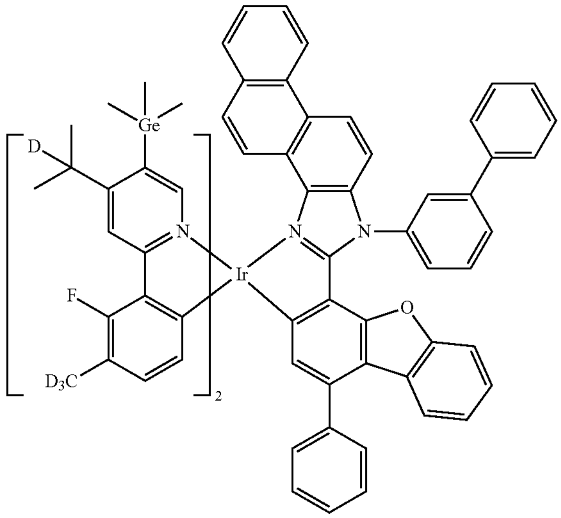
2885
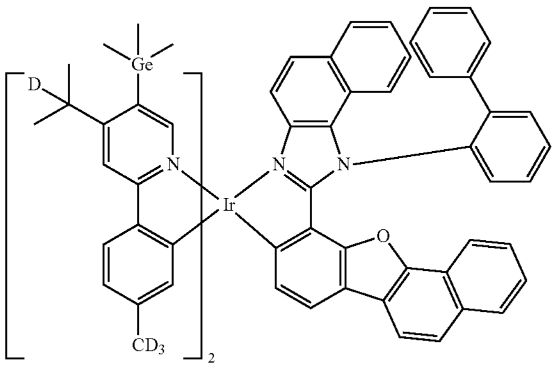
2886
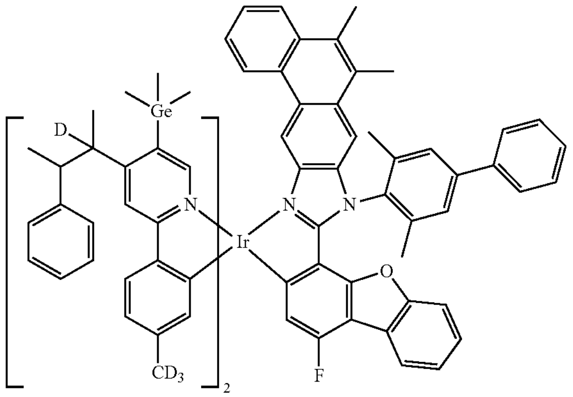
2887
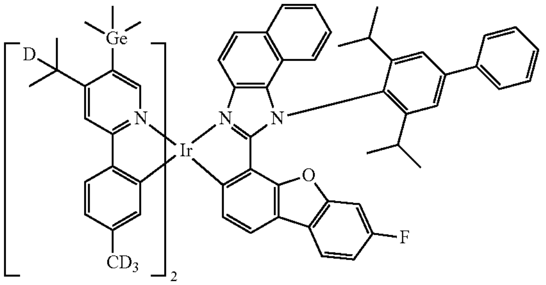

-continued
2888
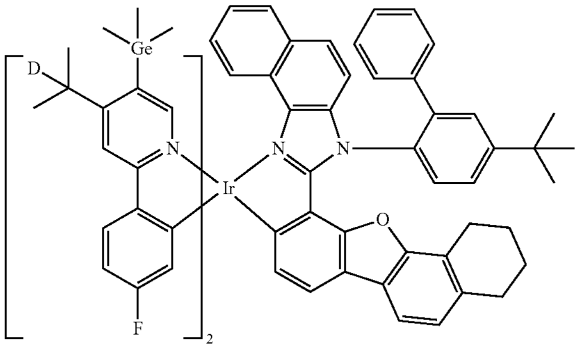
2889
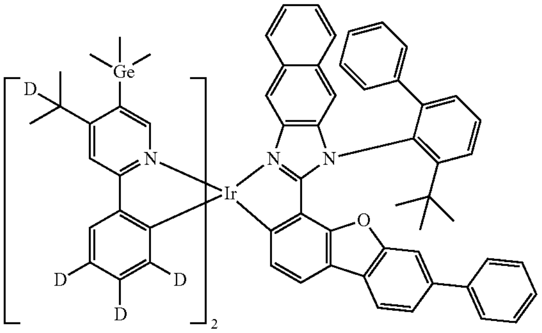
2890
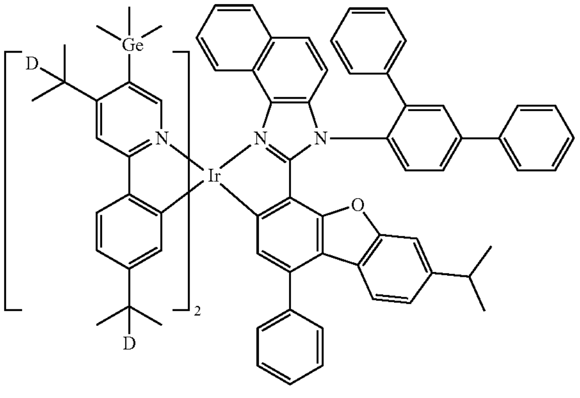
2891
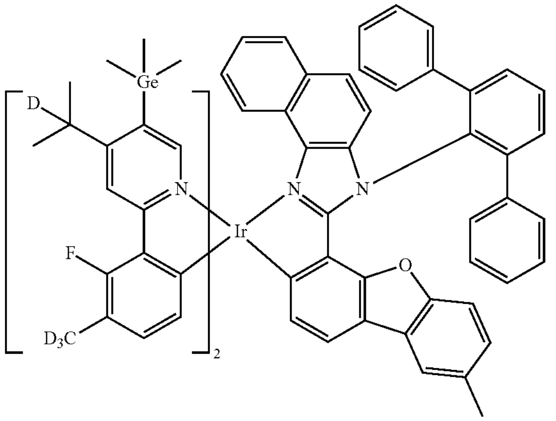
-continued
2892
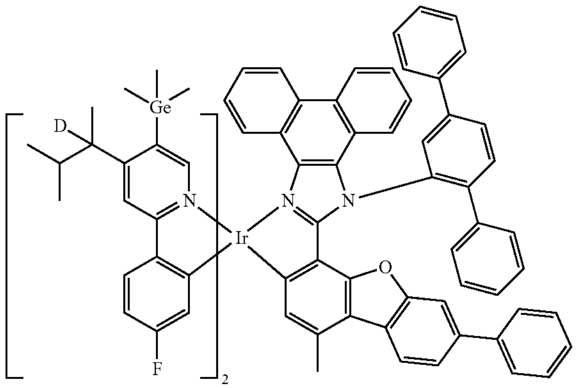
2893
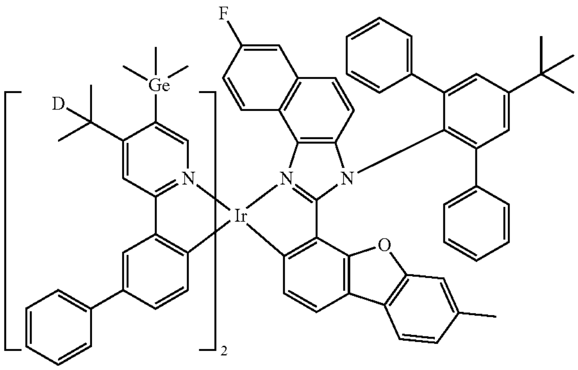
2894
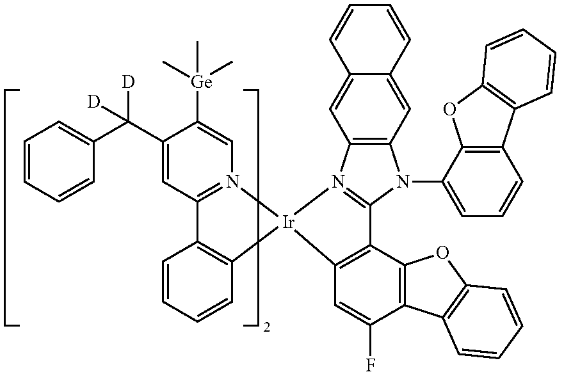
2895
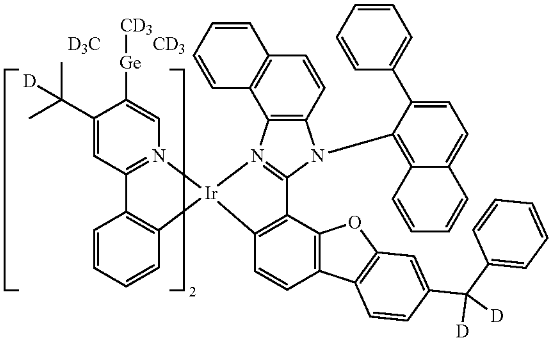

-continued
2896
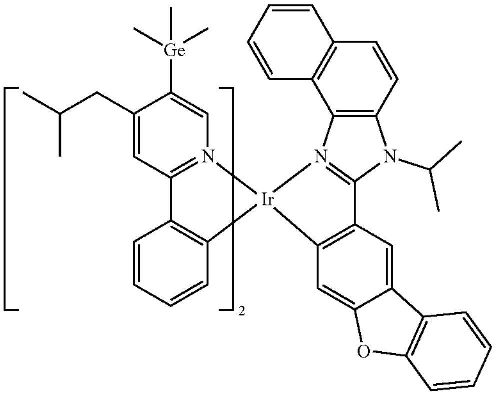
2897
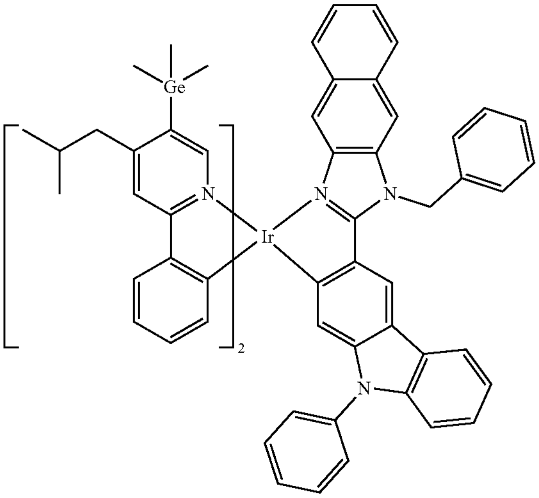
2898
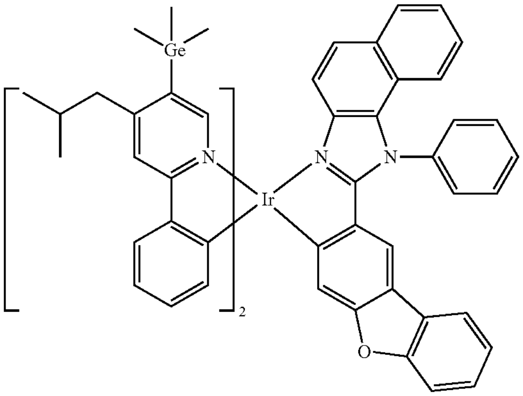
-continued
2899
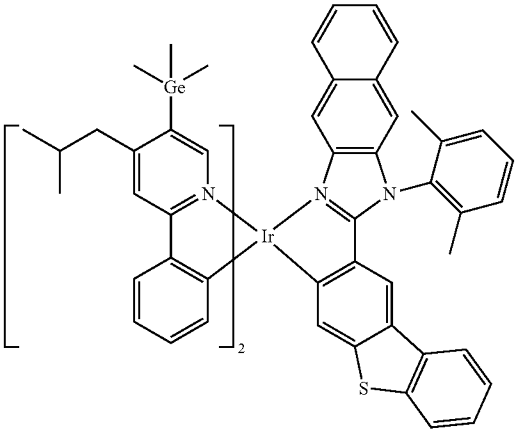
2900
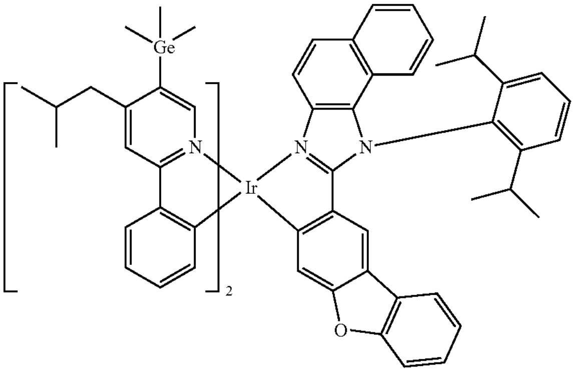
2901
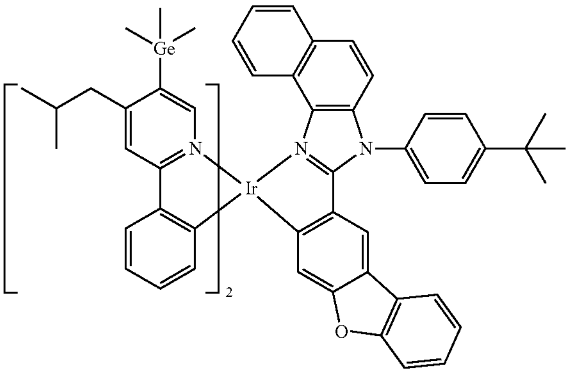

-continued
2902
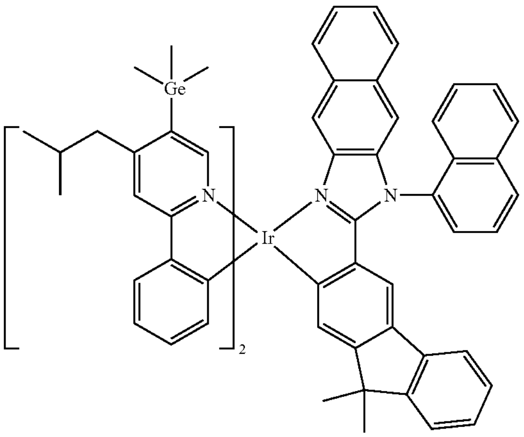
2903
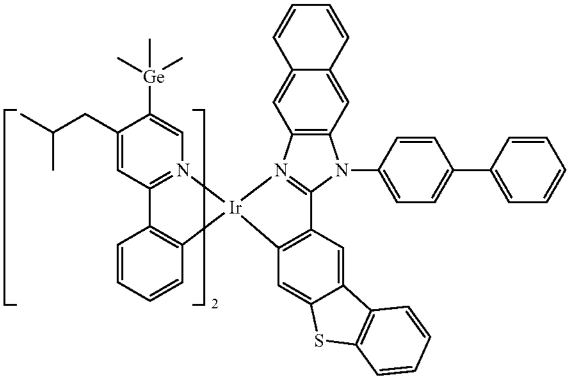
2904
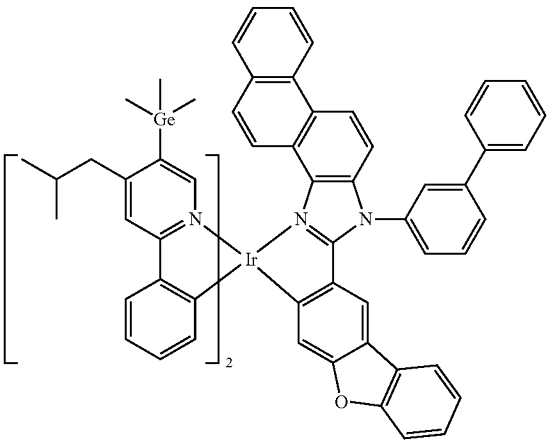
-continued
2905
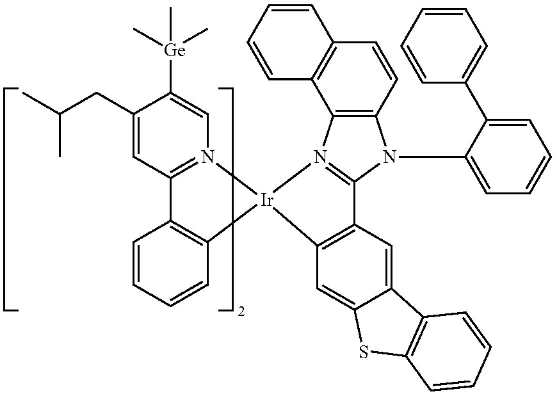
2906
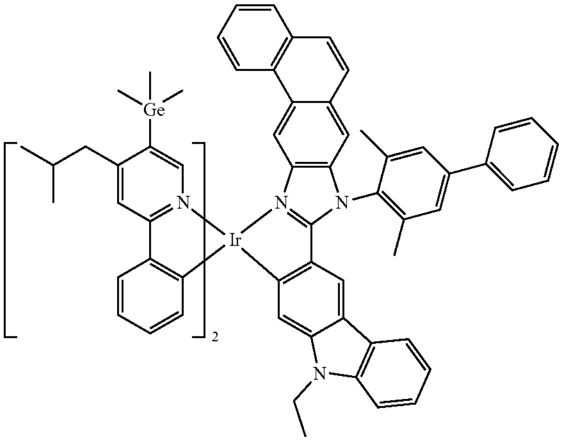
2907
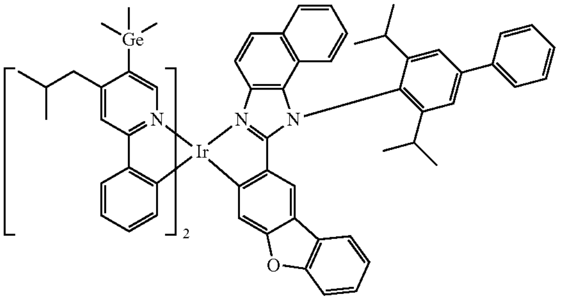
2908
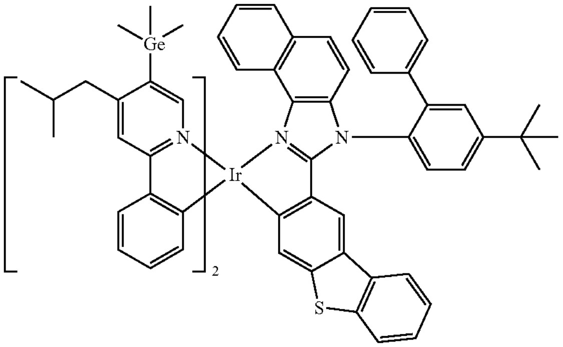

2909
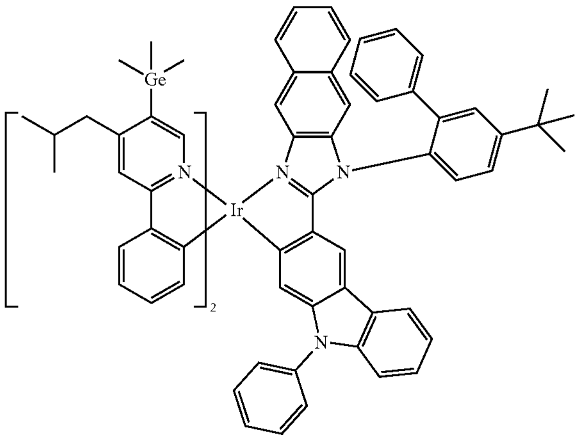
2910
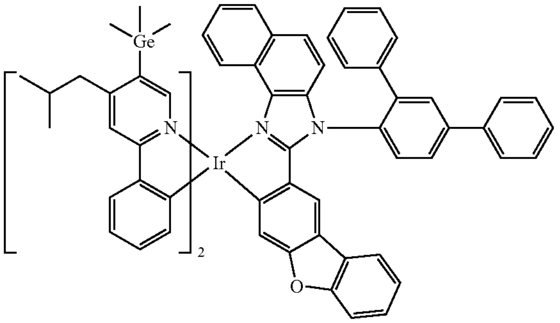
2911
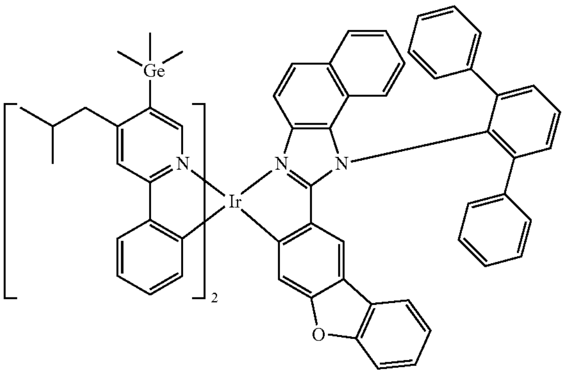
2912
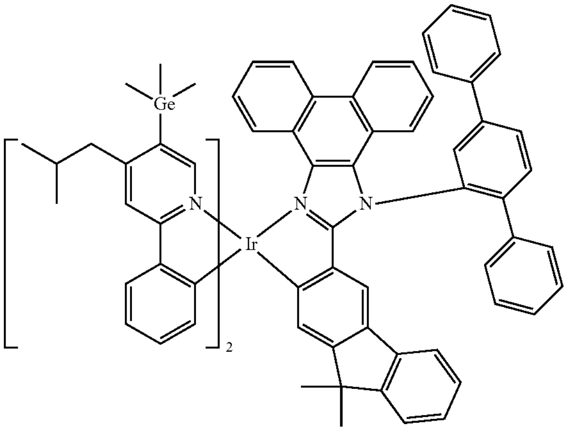
2913
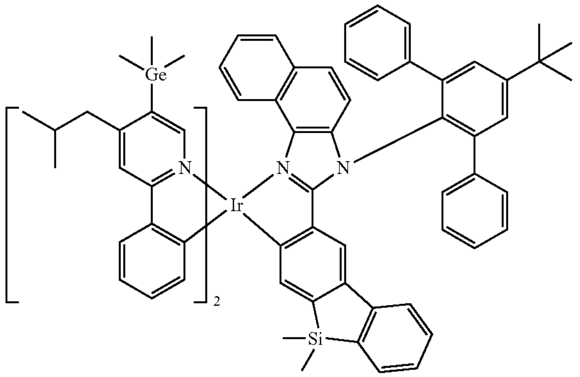
2914
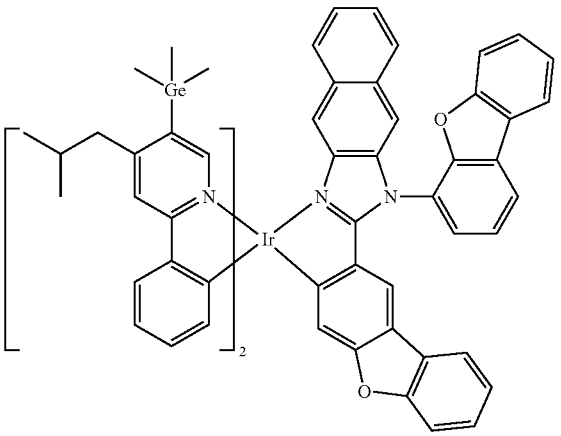
2915
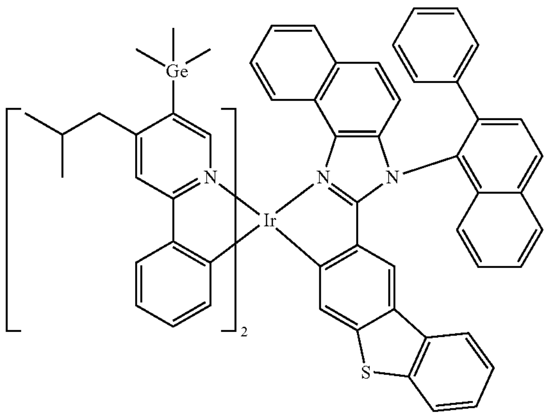

-continued
2916
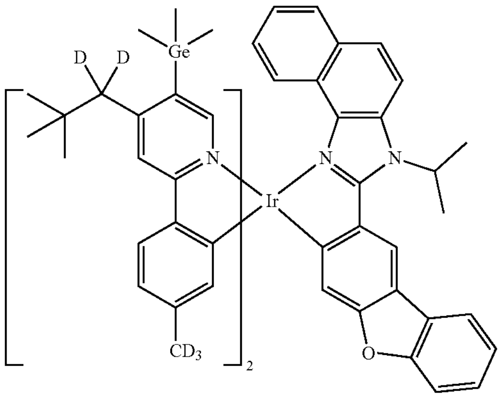
2917
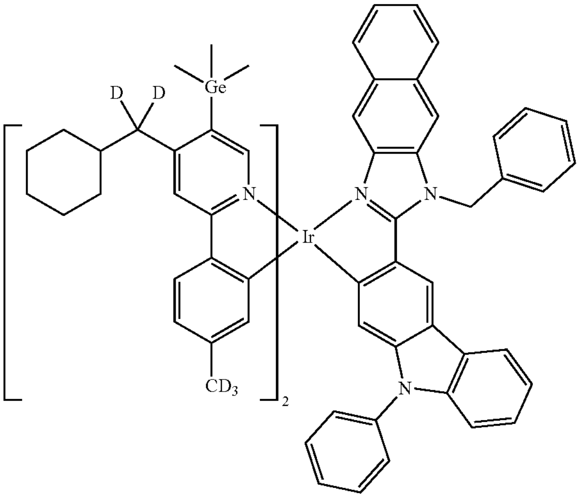
2918
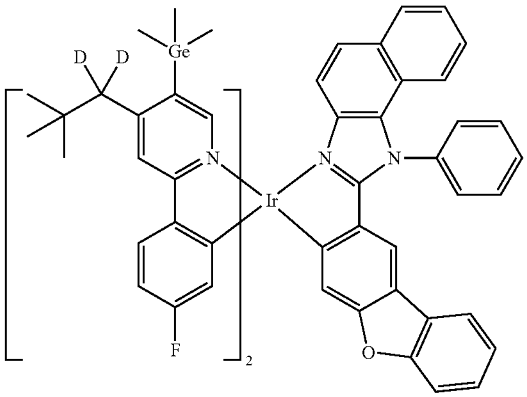
-continued
2919
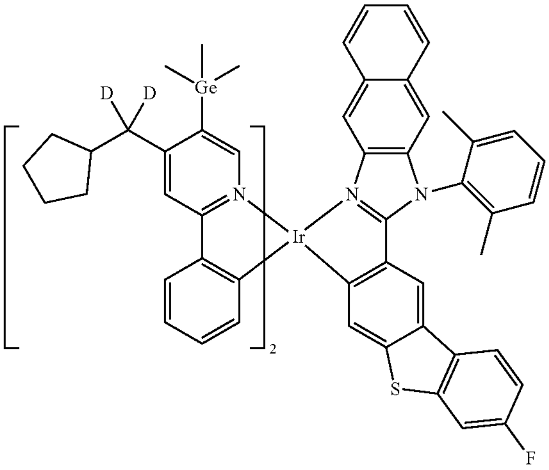
2920
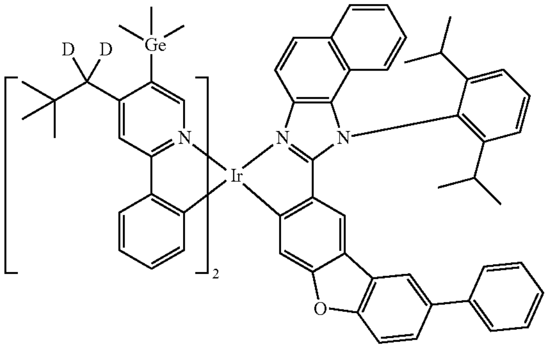
2921
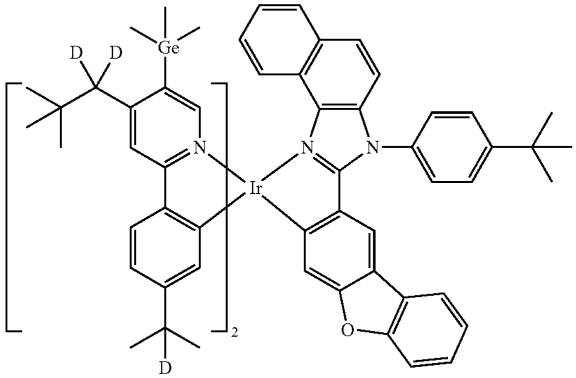
2922
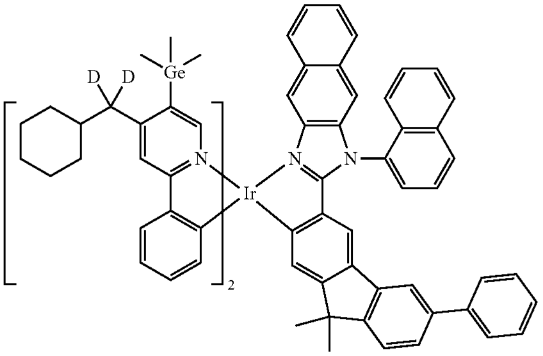

-continued
2923
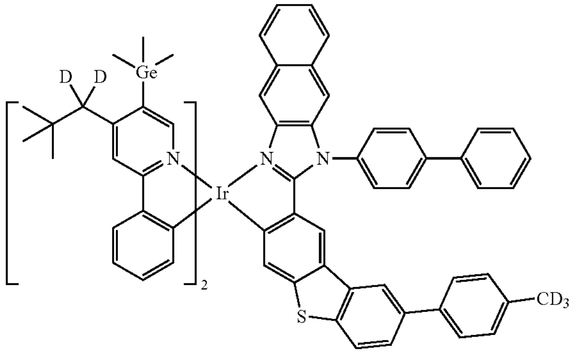
2924
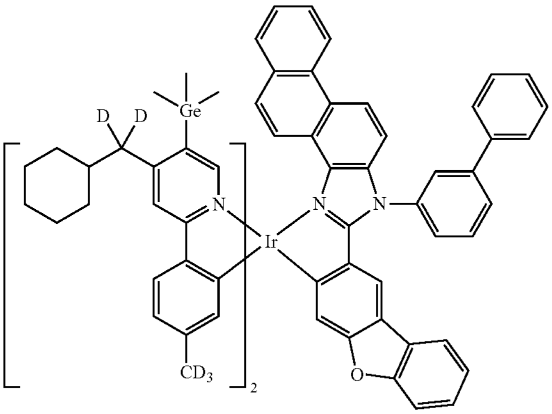
2925
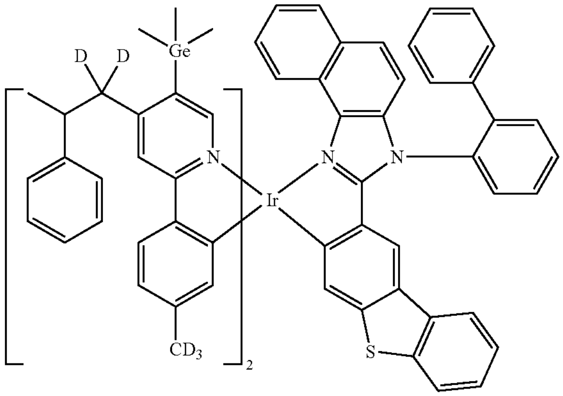
-continued
2926
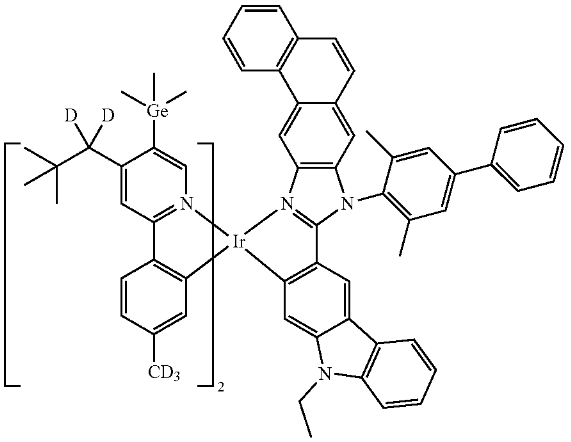
2927
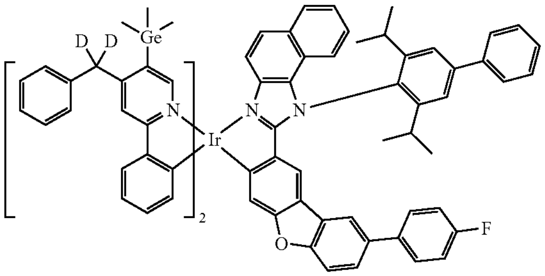
2928
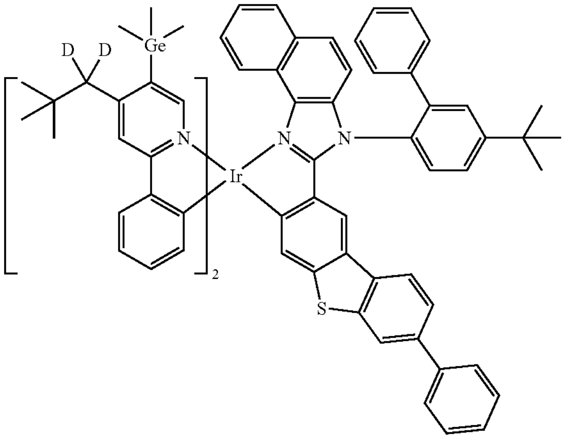

-continued
2929
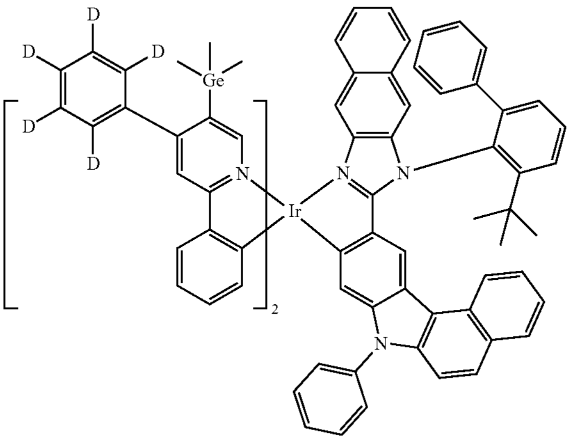
2930
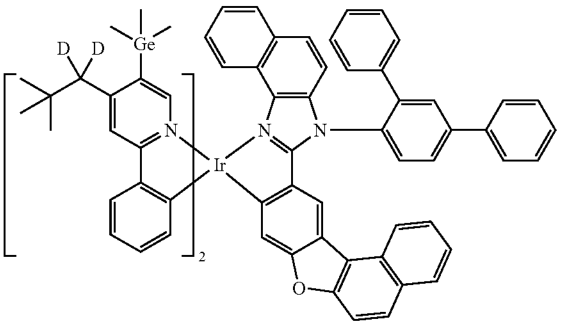
2931
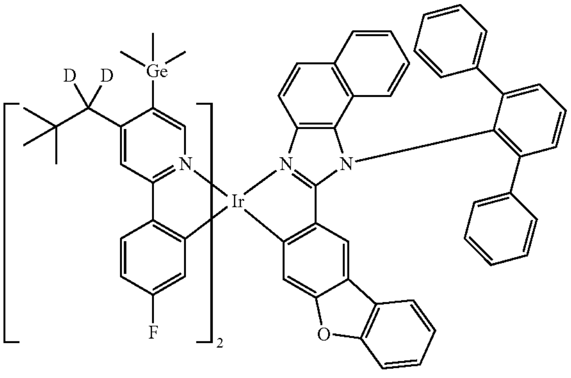
2932
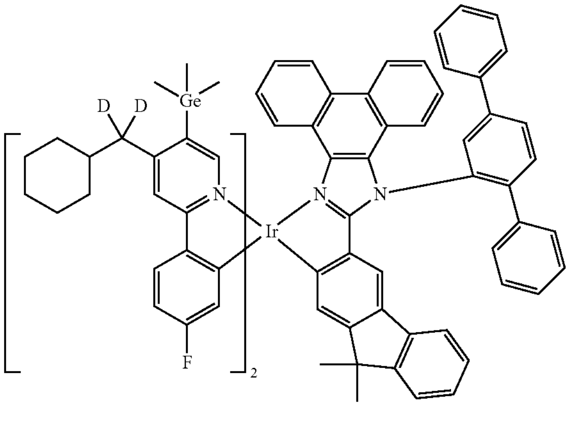
-continued
2933
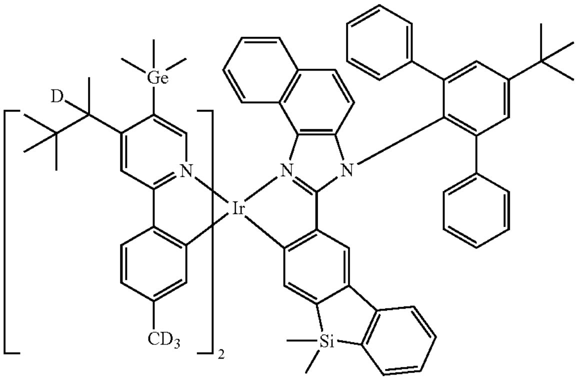
2934
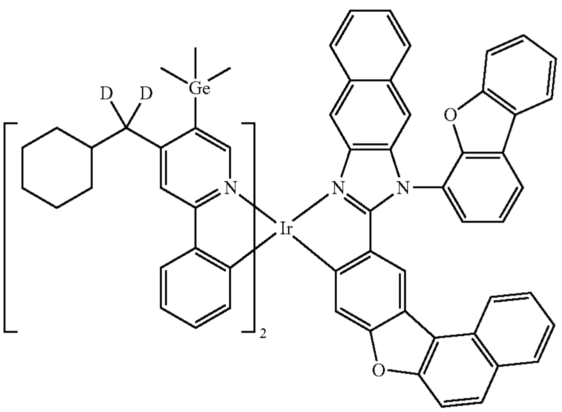
2935
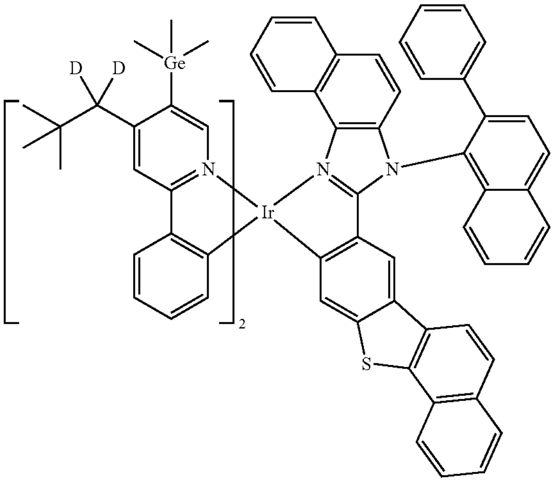

-continued
2936
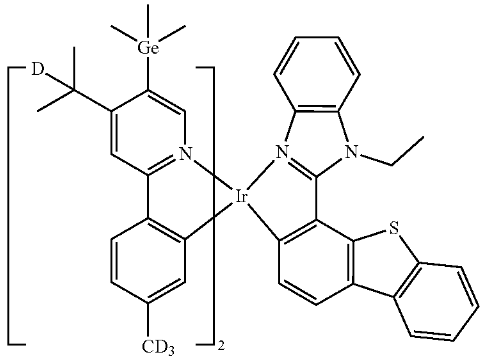
2937
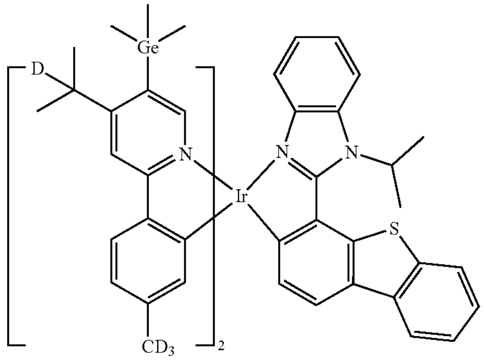
2938
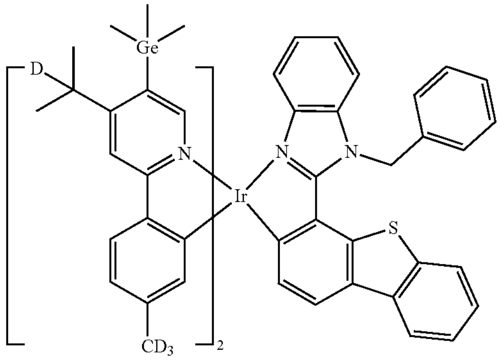
2939
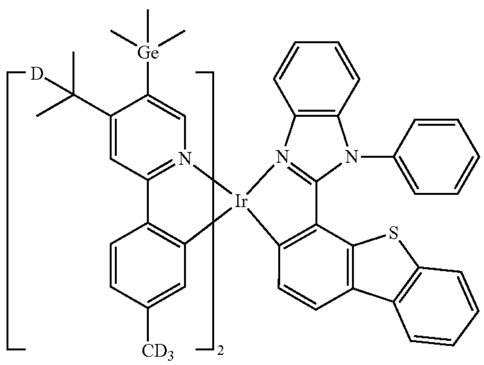
2940
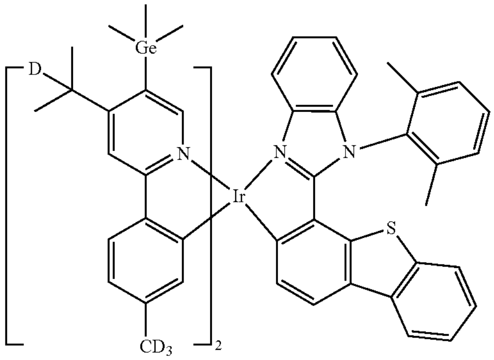
2941
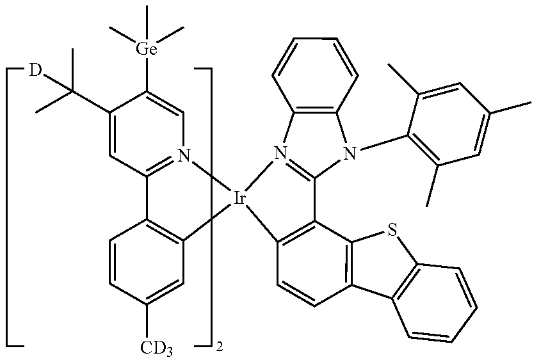
2942
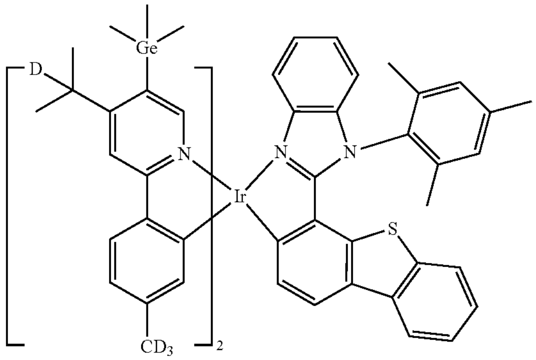
2943
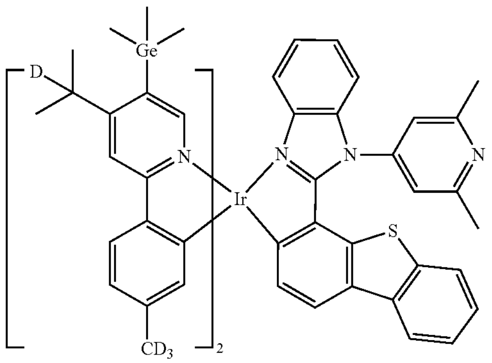

-continued
2944
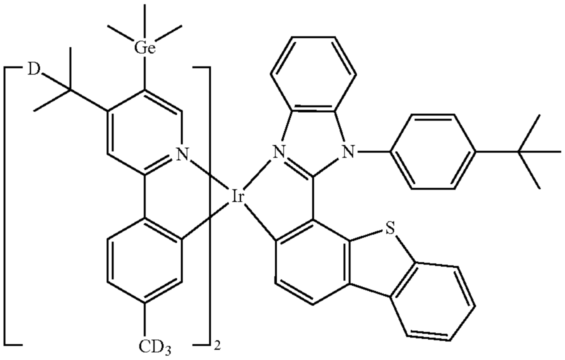
2945
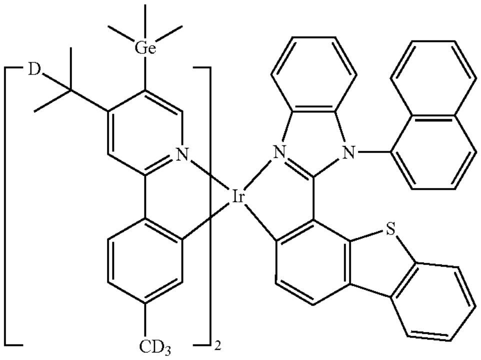
2946
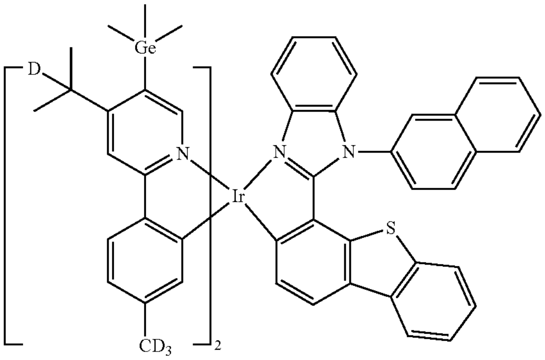
2947
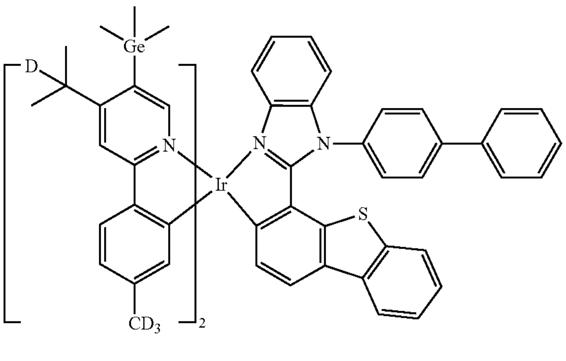
-continued
2948
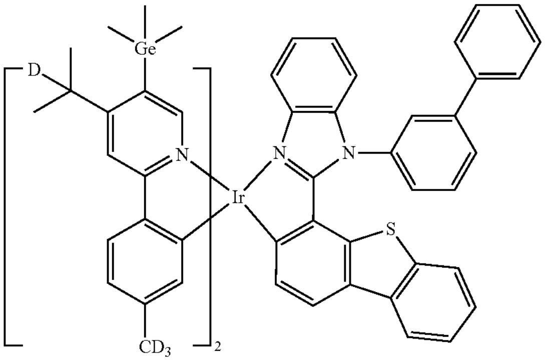
2949
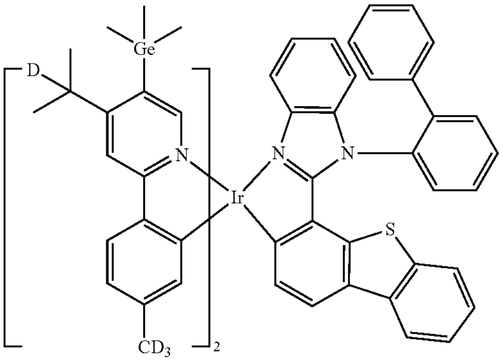
2950
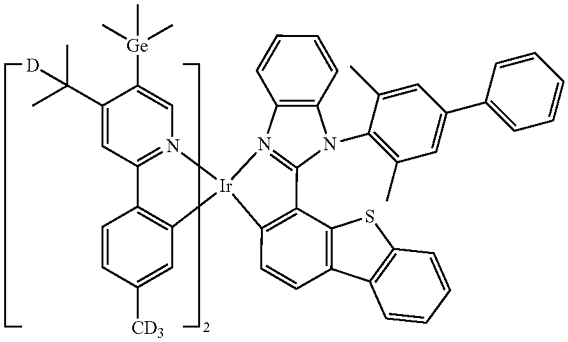
2951
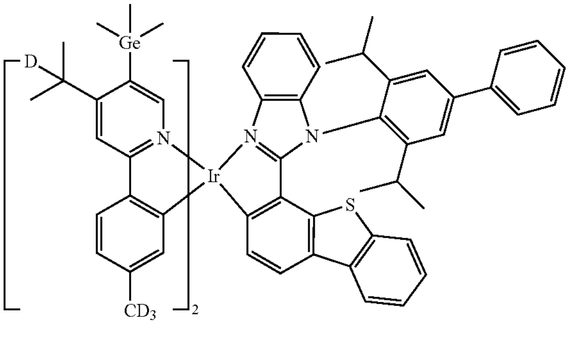

-continued
2952
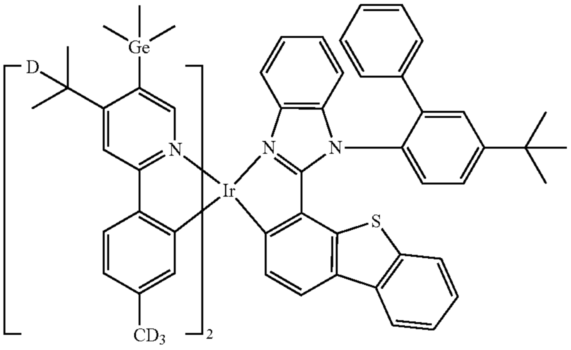
2953
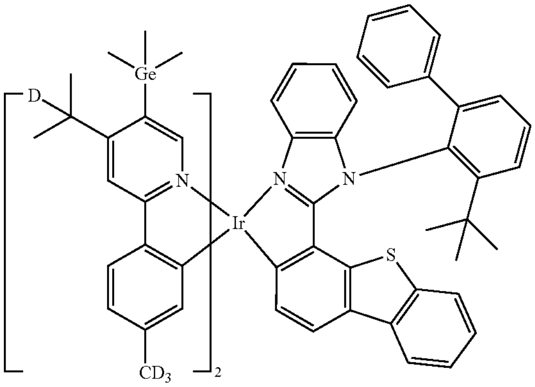
2954
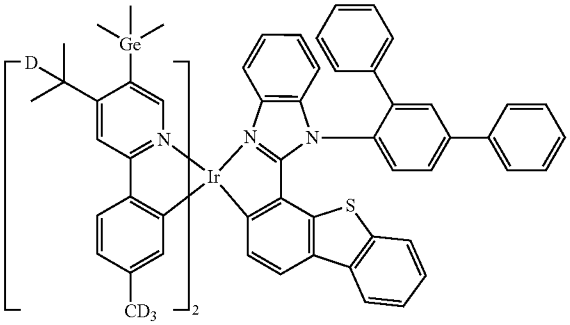
2955
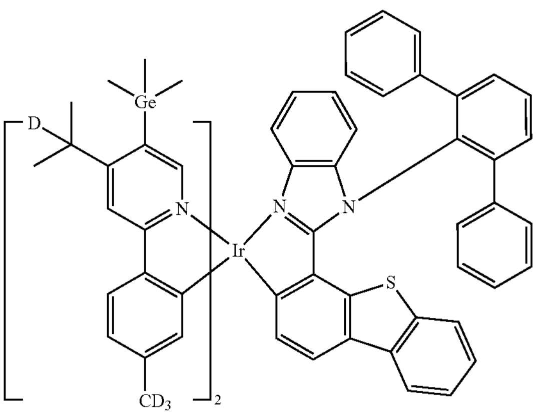
-continued
2956
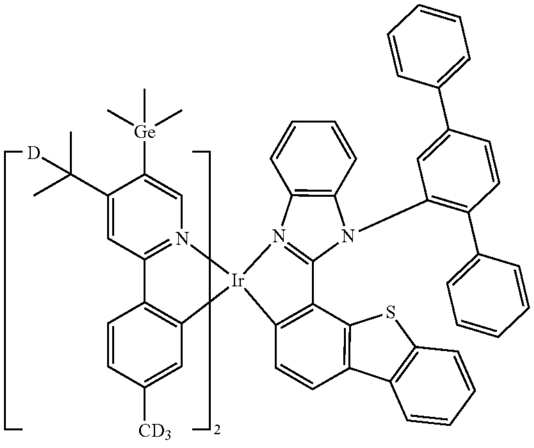
2957
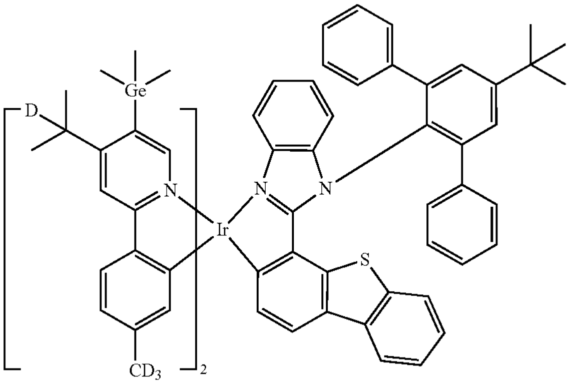
2958
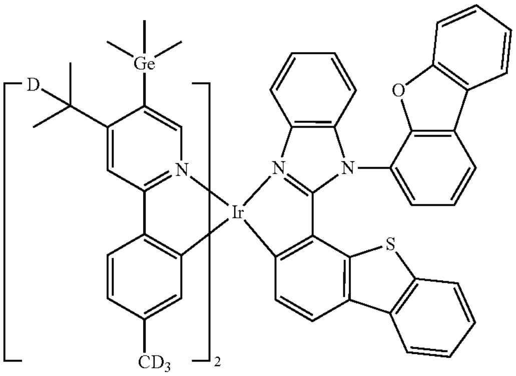
2959
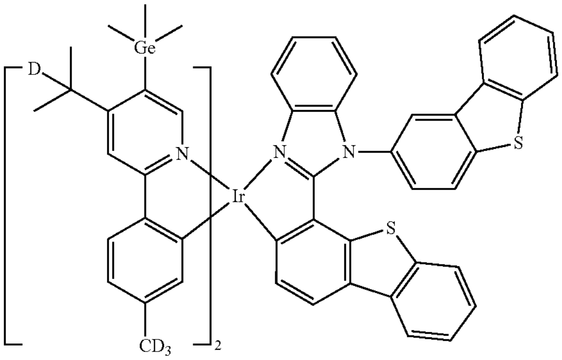

-continued
2960
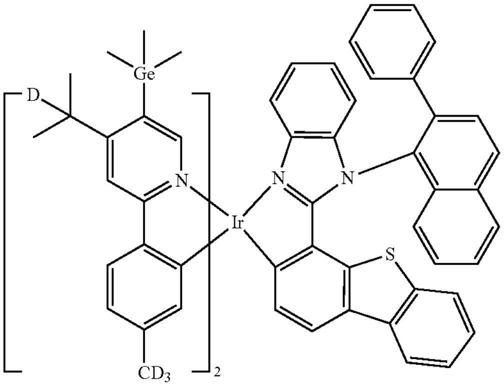
2961
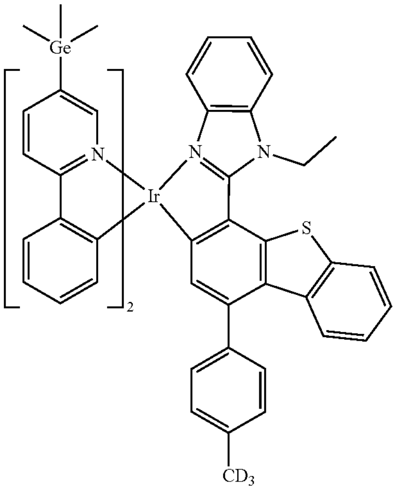
2962
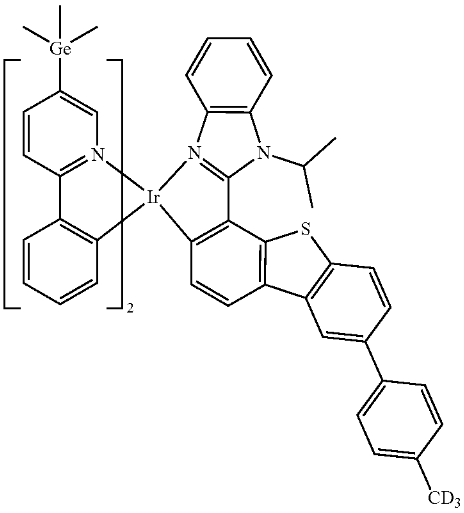
-continued
2963
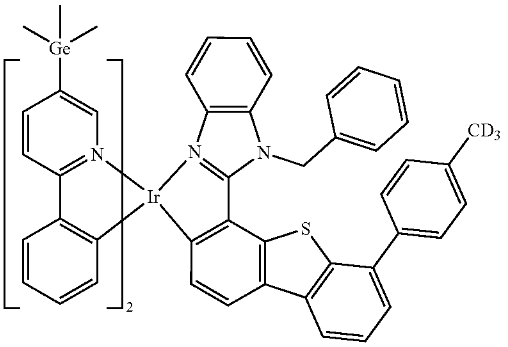
2964
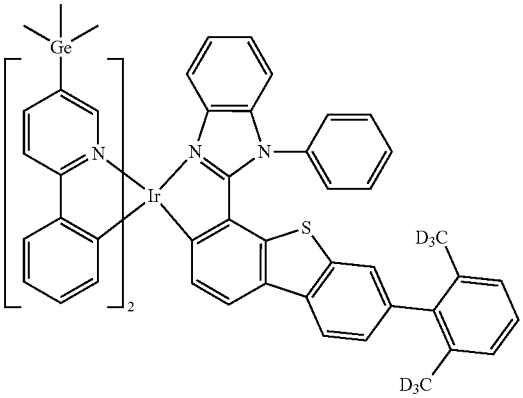
2965
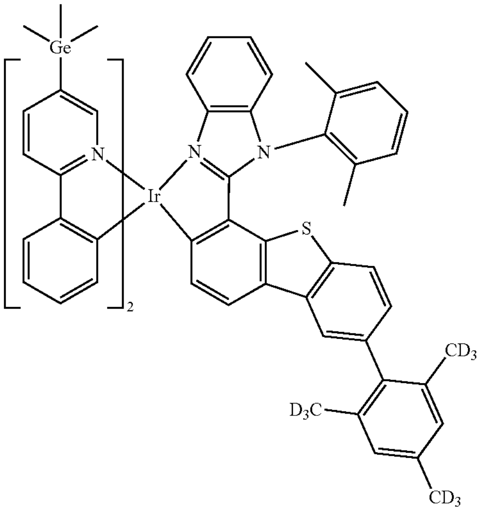

-continued
2966
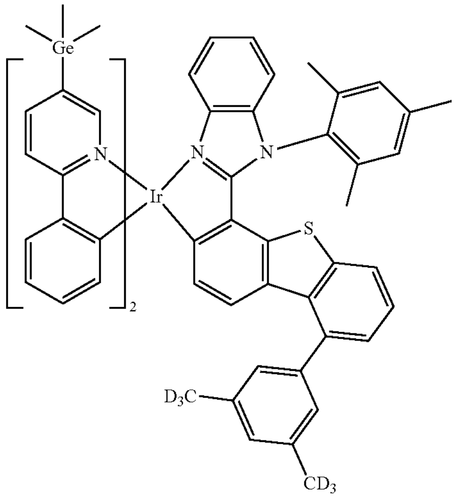
2967
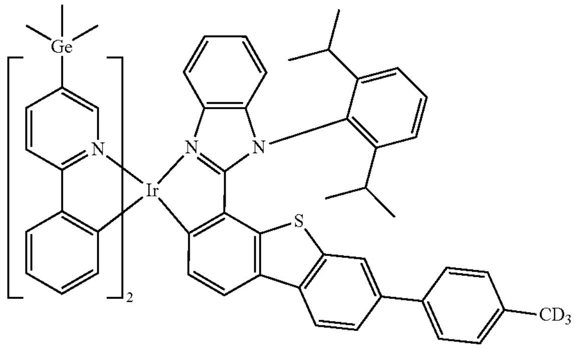
2968
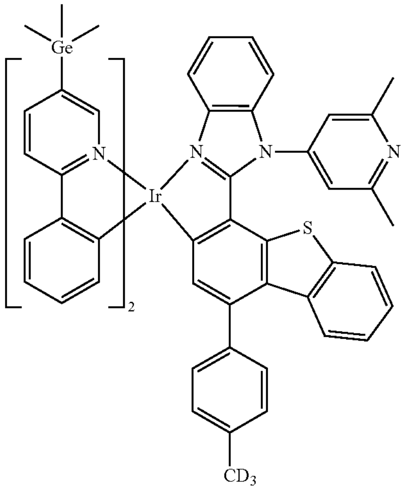
-continued
2969
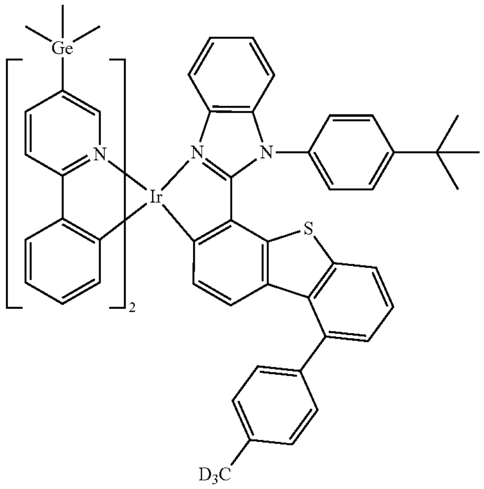
2970
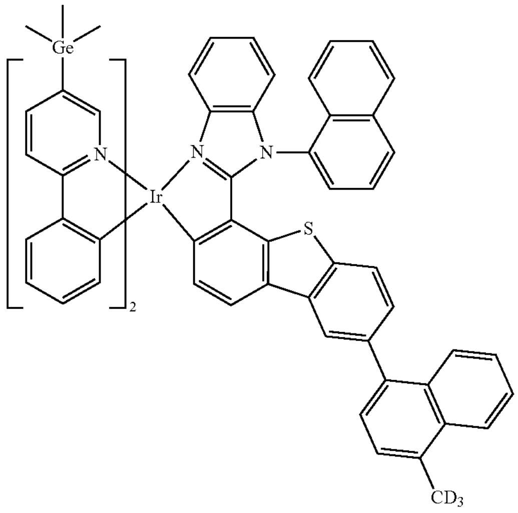
2971
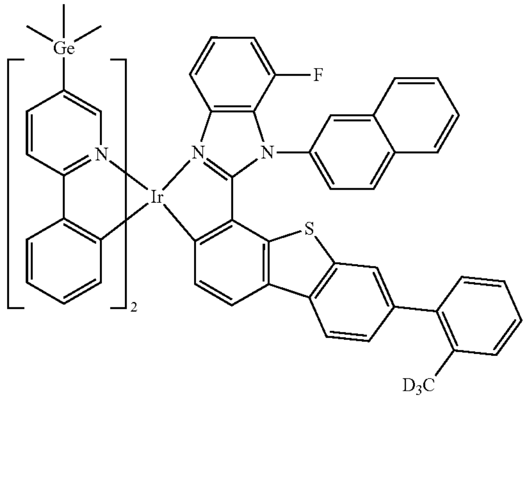

-continued
2972
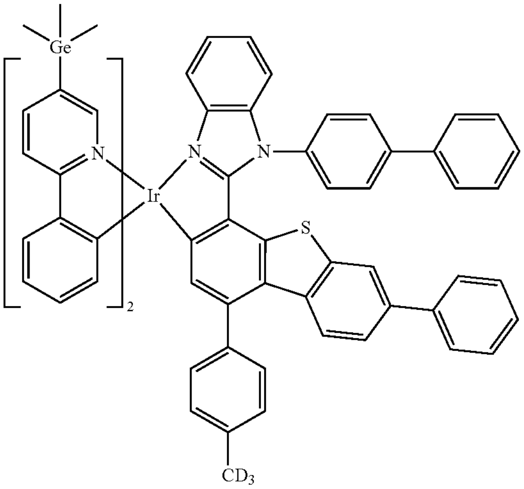
2973
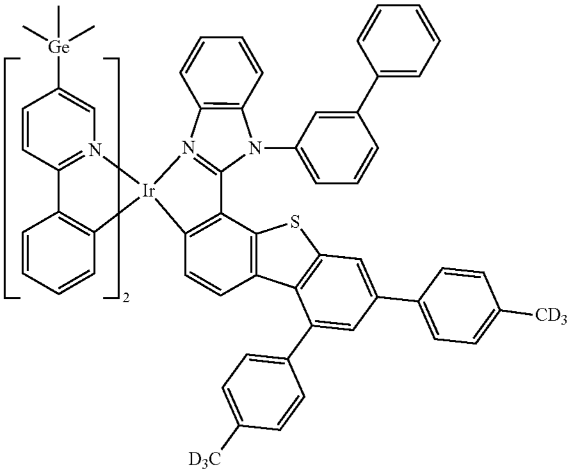
2974
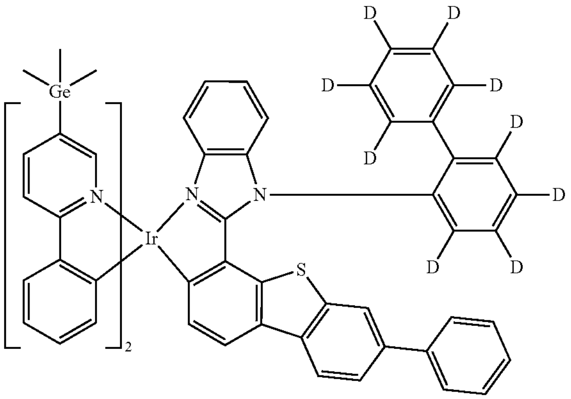
-continued
2975
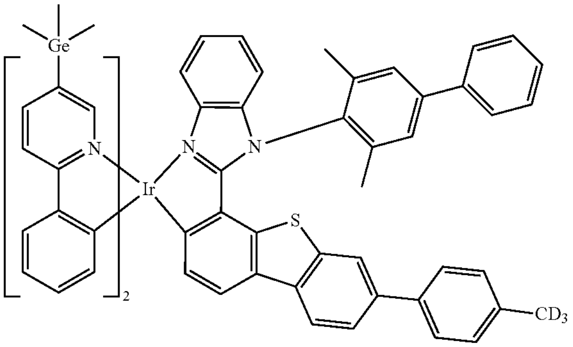
2976
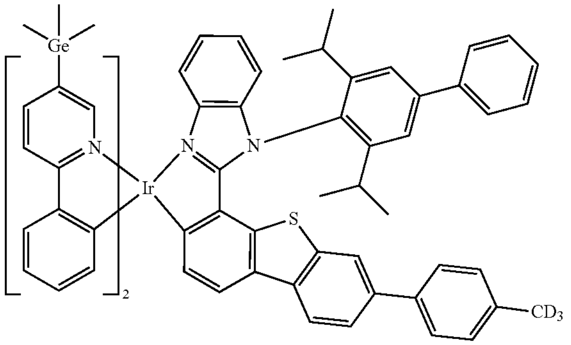
2977
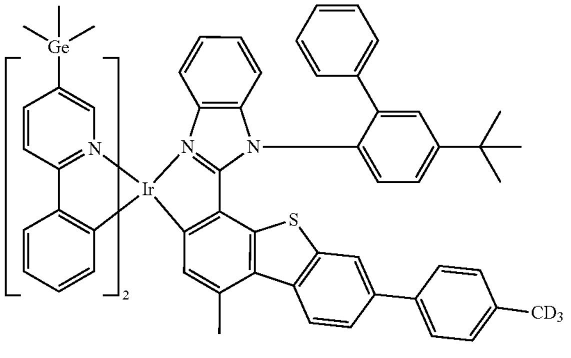
2978
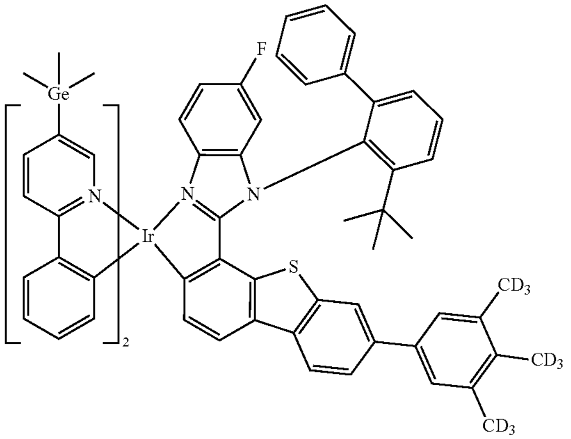

-continued
2979
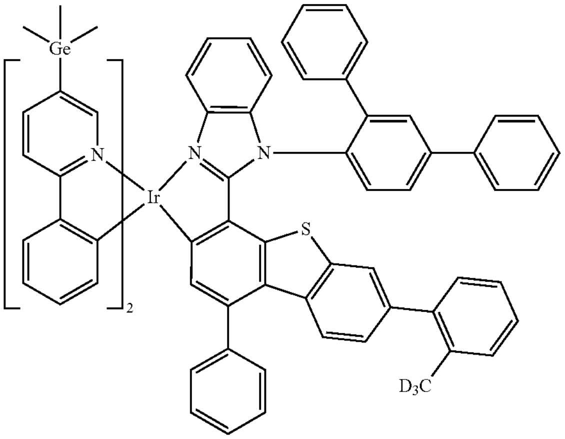
2980
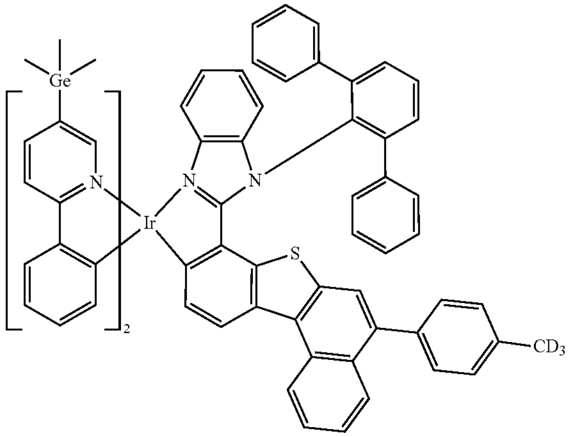
2981
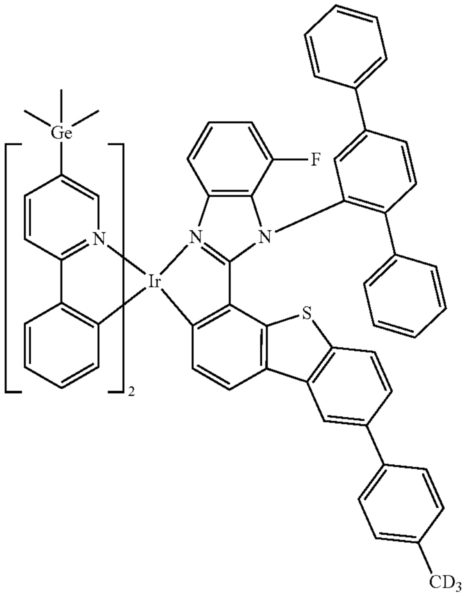
-continued
2982
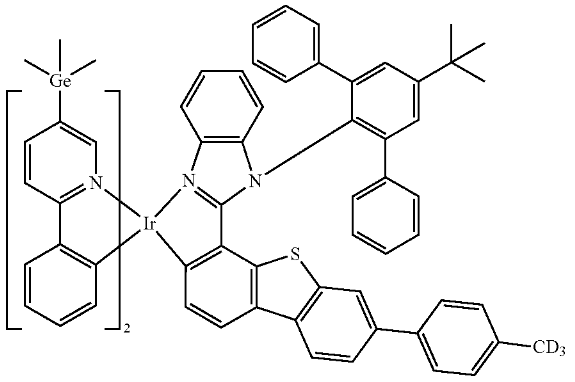
2983
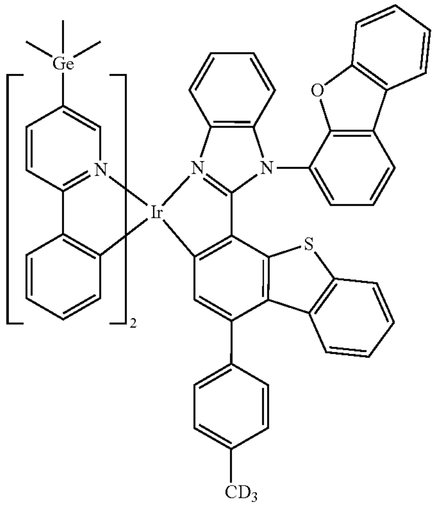
2984
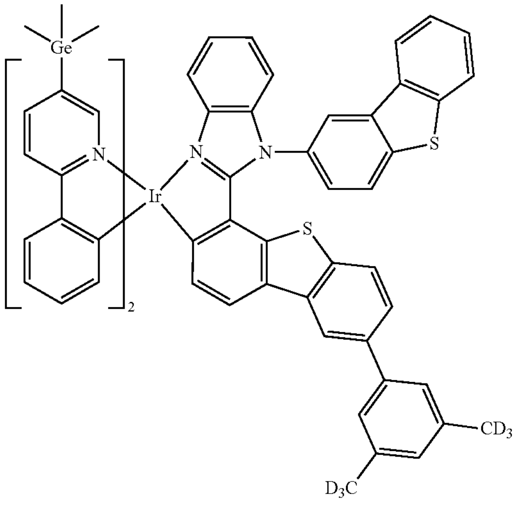

-continued
2985
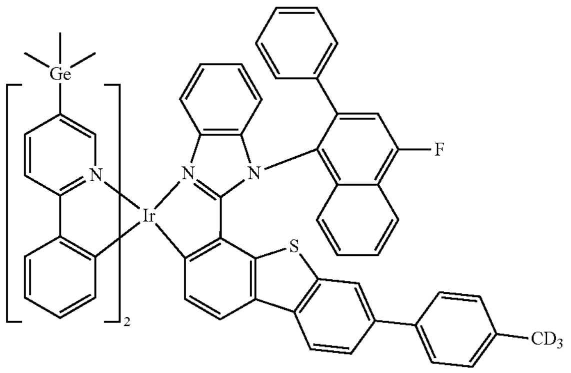
2986
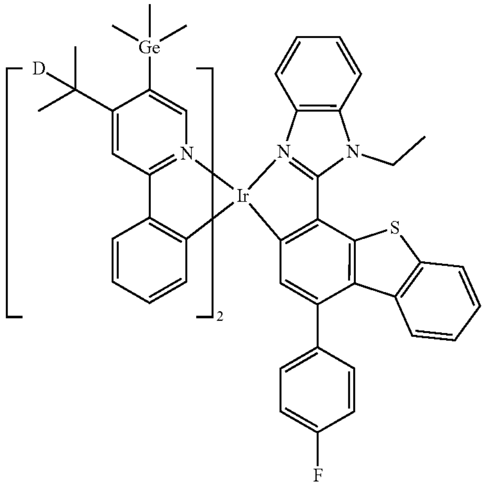
2987
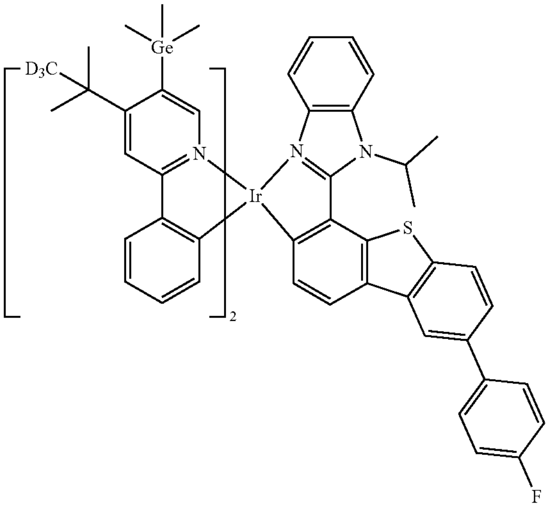
2988
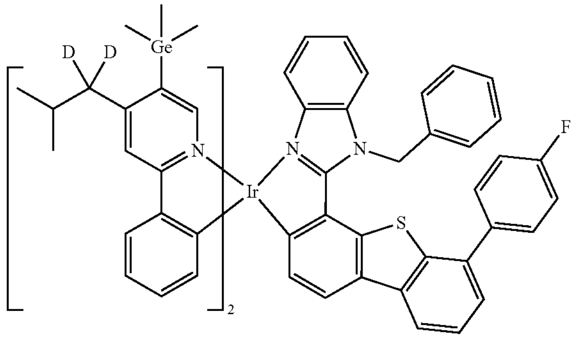
2989
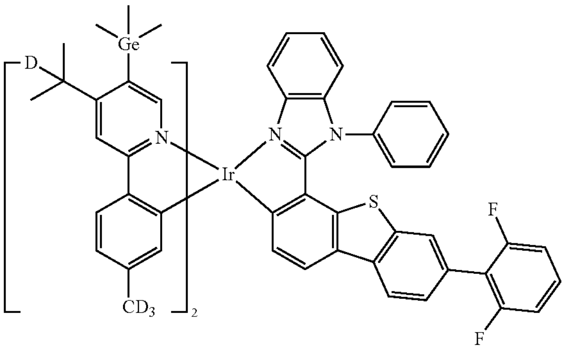
2990
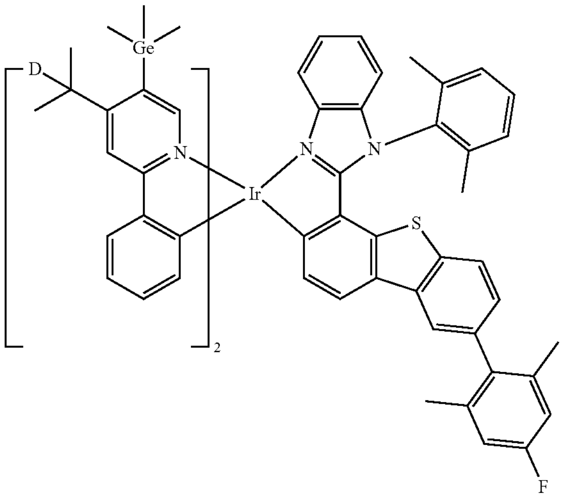

-continued
2991
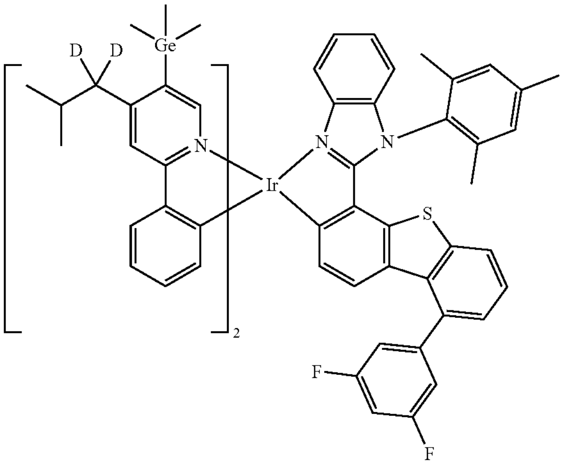
2992
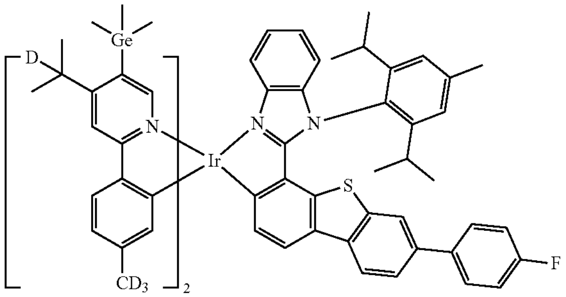
2993
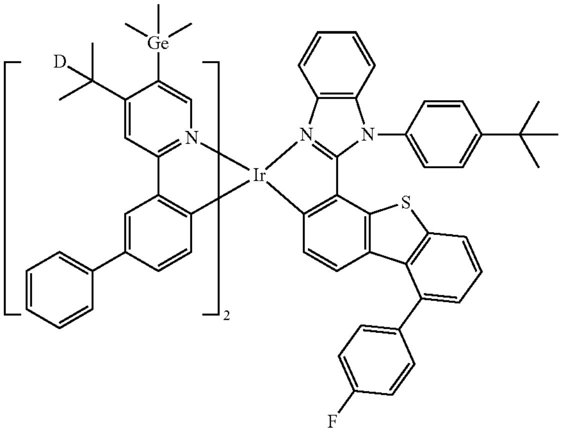
2994
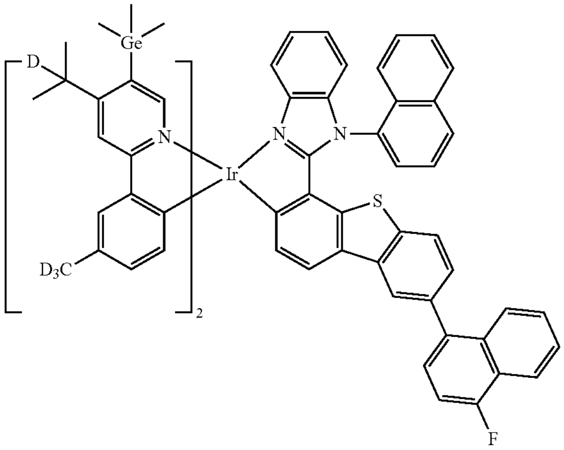
2995
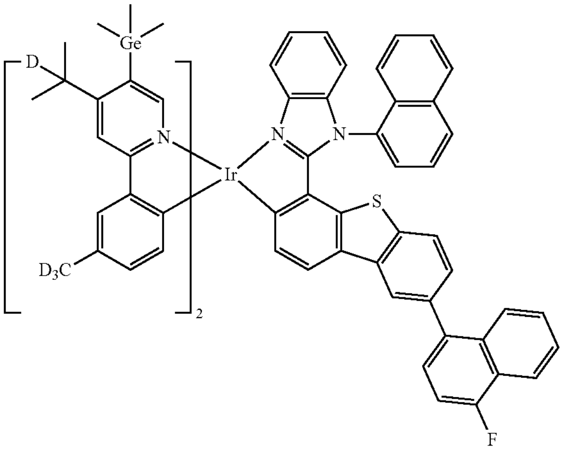
2996
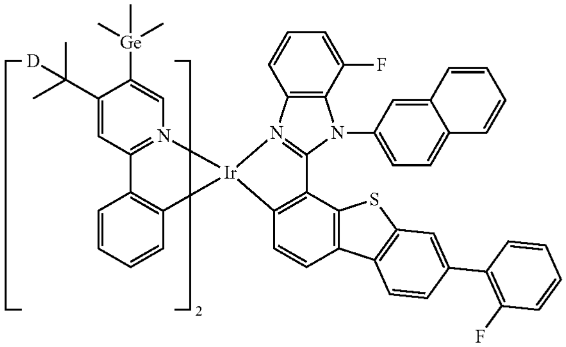

-continued
2997
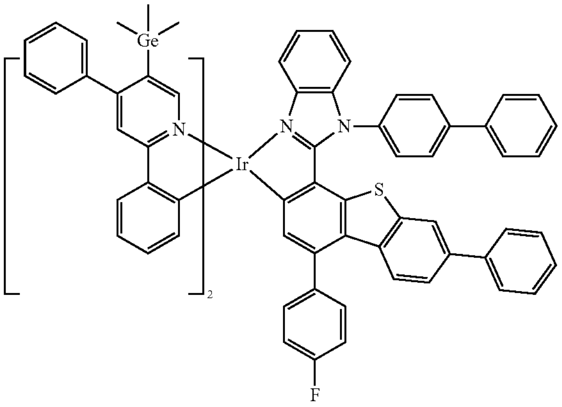
2998
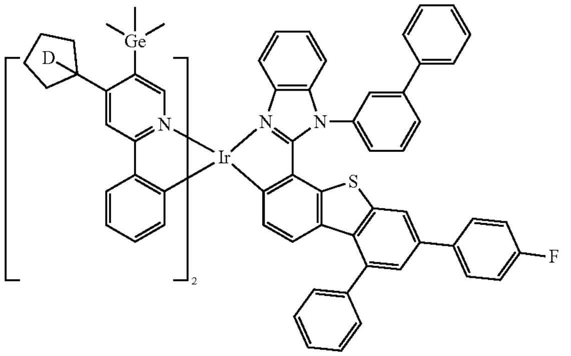
2999
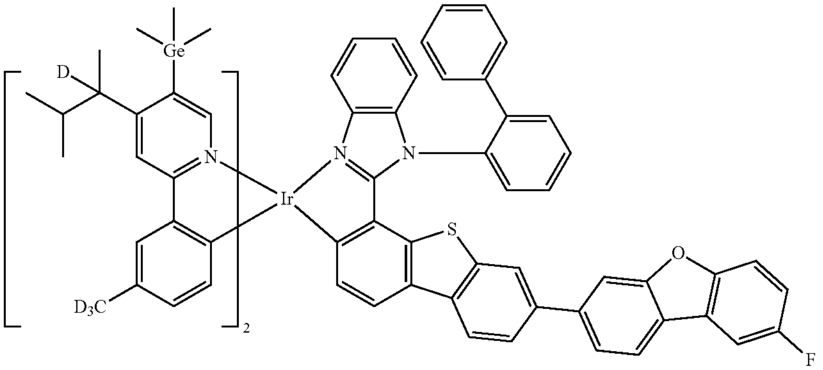
3000
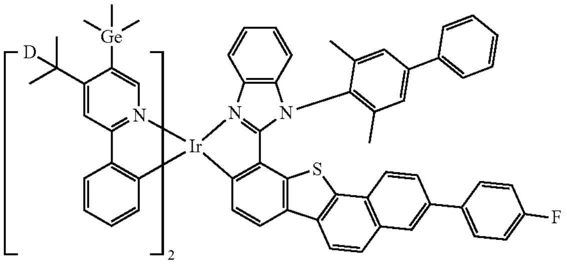
3001
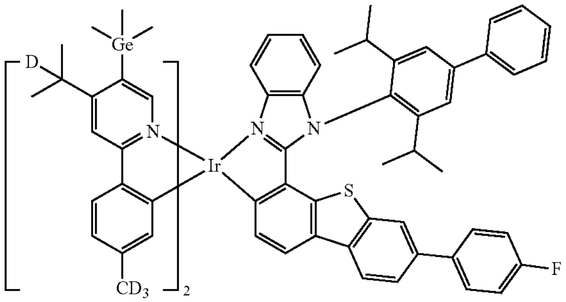
3002
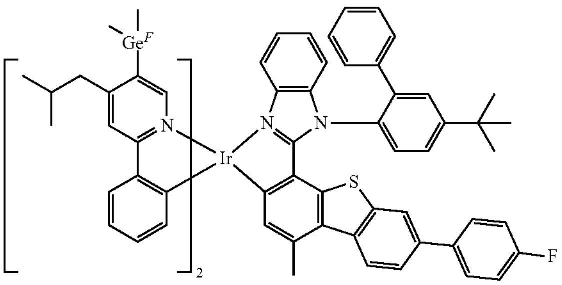
3003
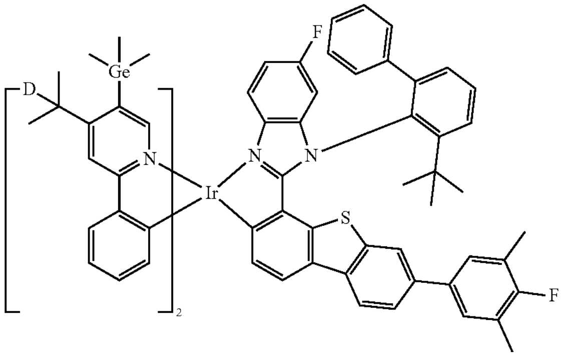

-continued
3004
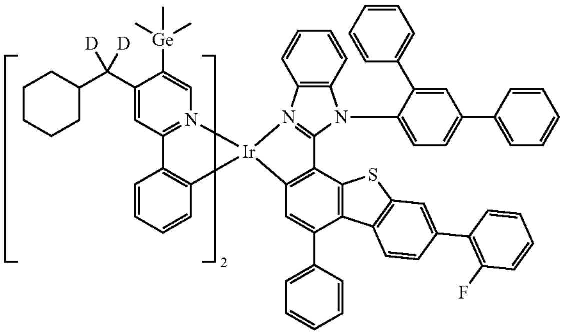
3005
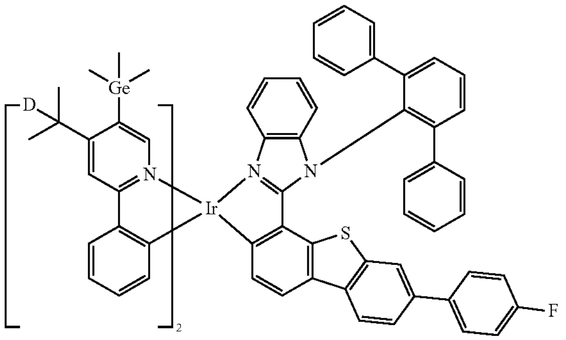
3006
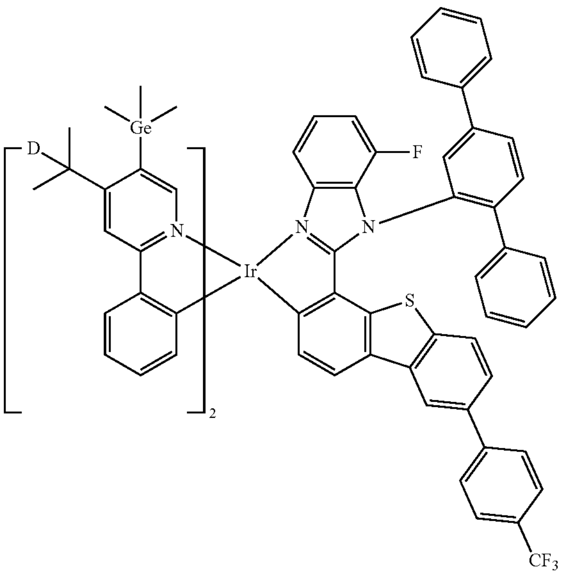
3007
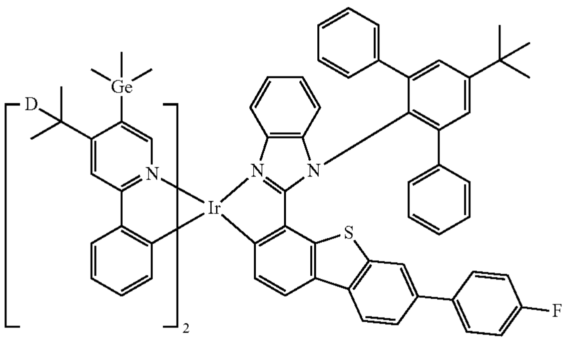
3008
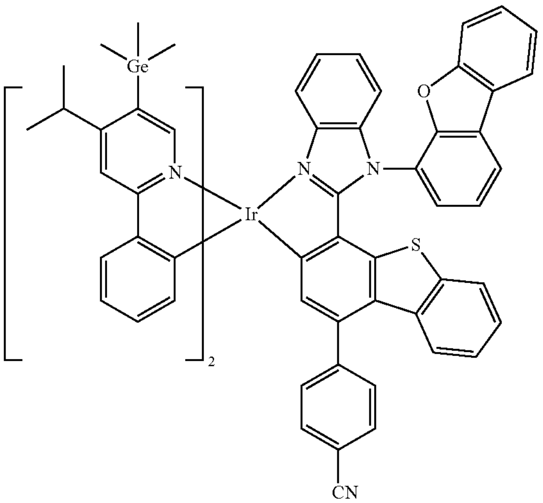
3009
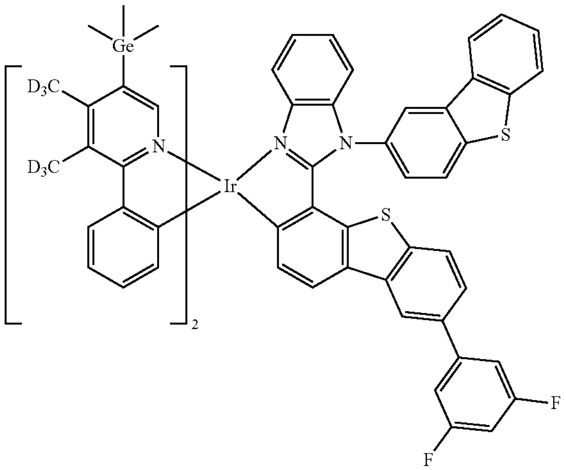

-continued
3010
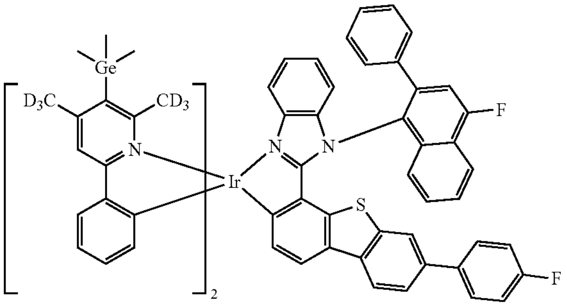
3011
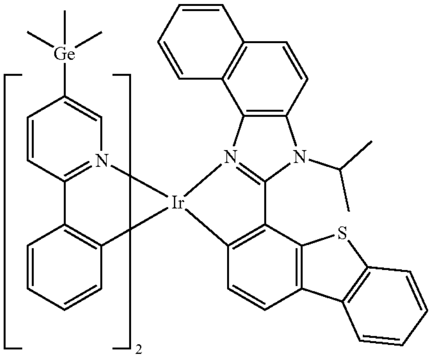
3012
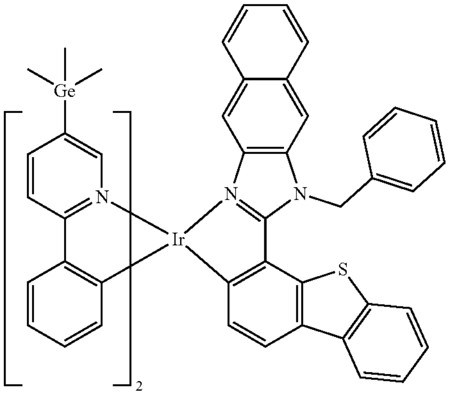
3013
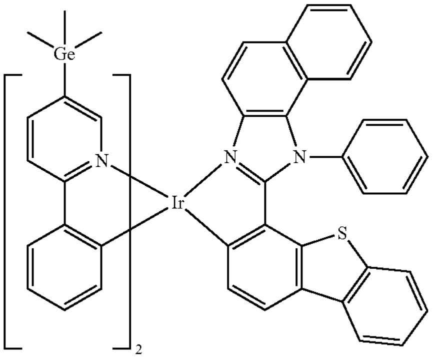
3014
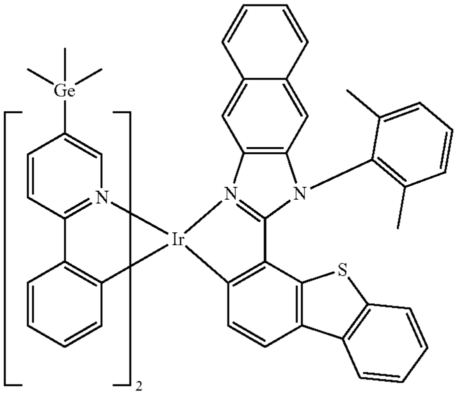
3015
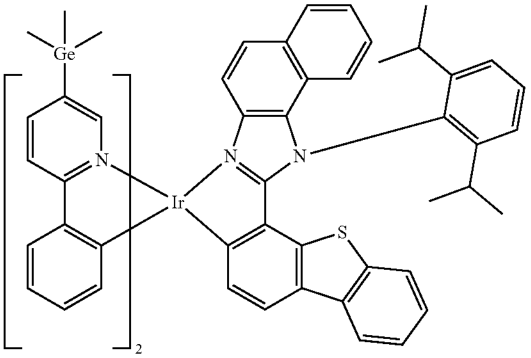
3016
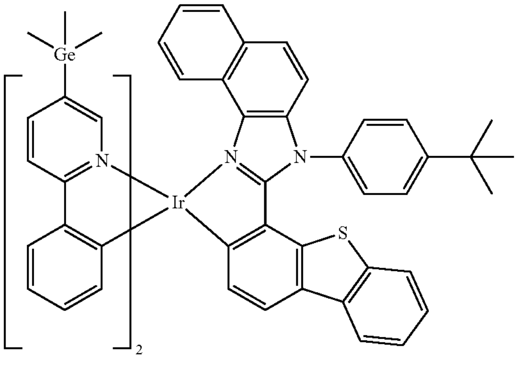
3017
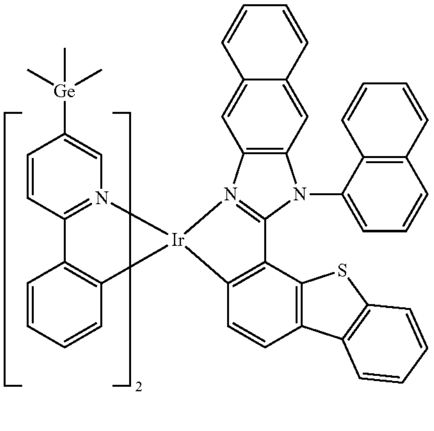

-continued
3018
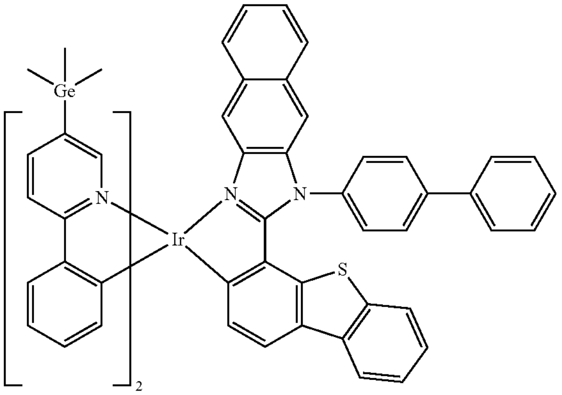
3019
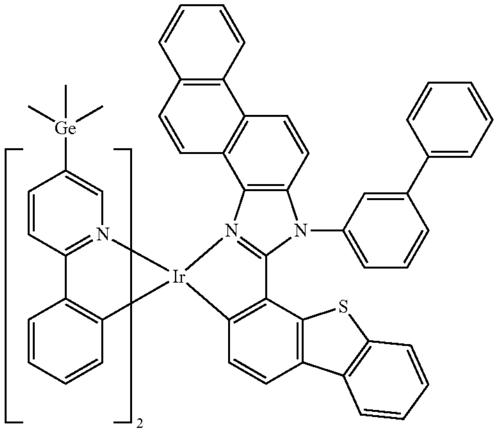
3020
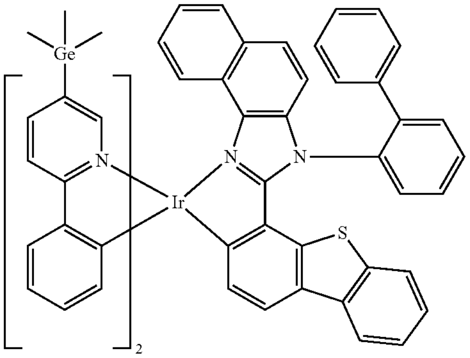
3021
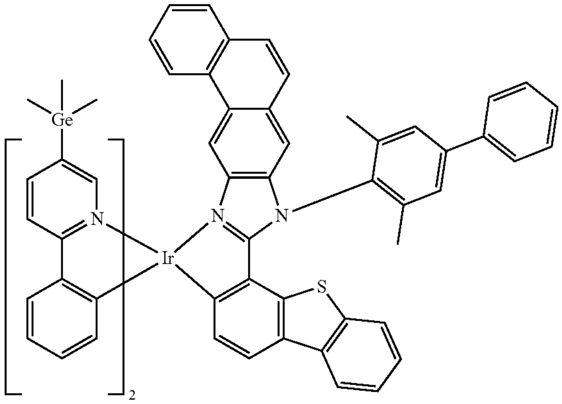
3022
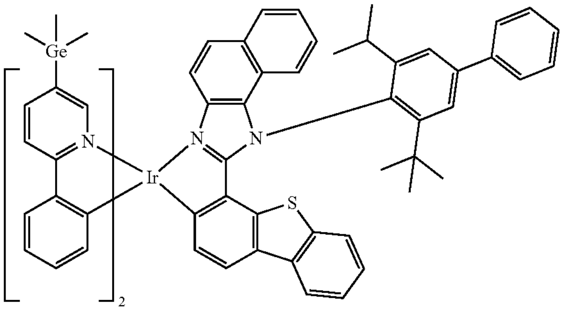
3023
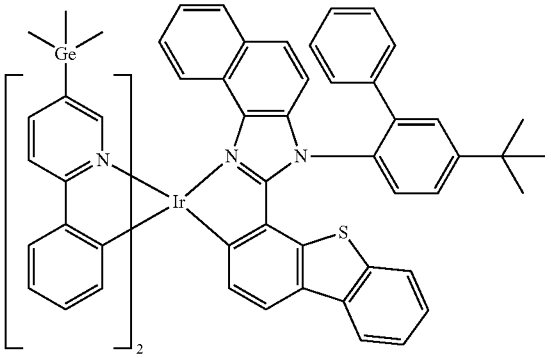

-continued
3024
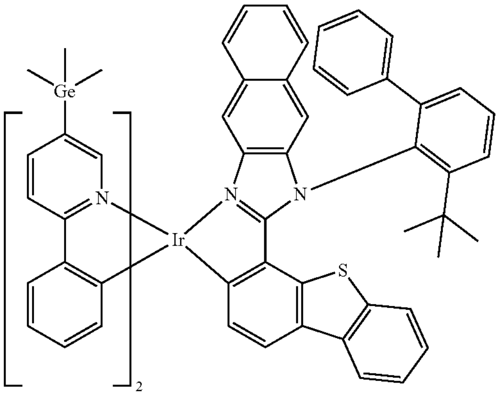
3025
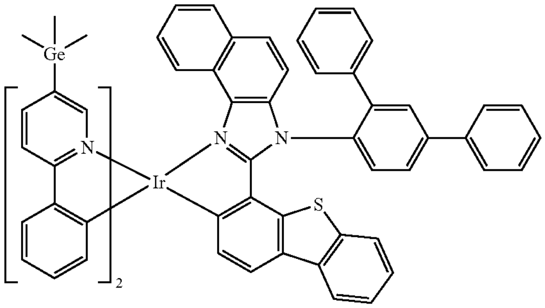
3026
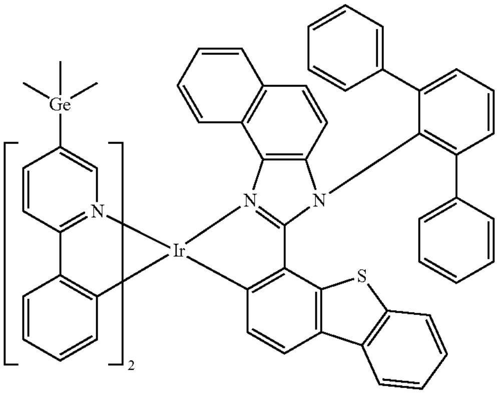
-continued
3027
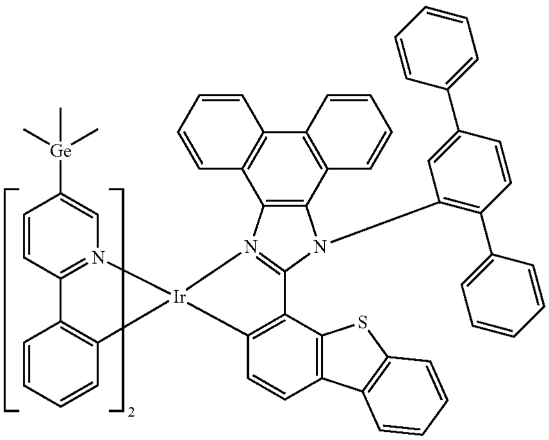
3028
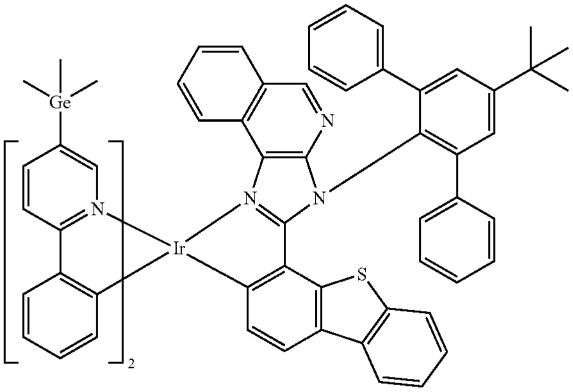

-continued
3029
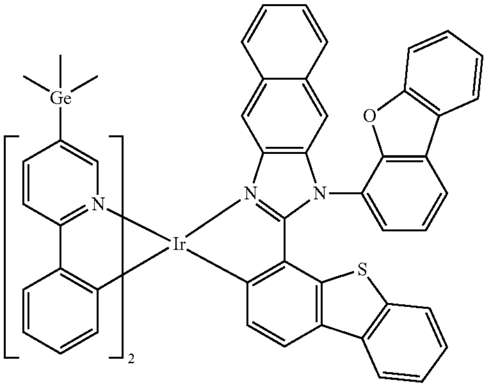
3030
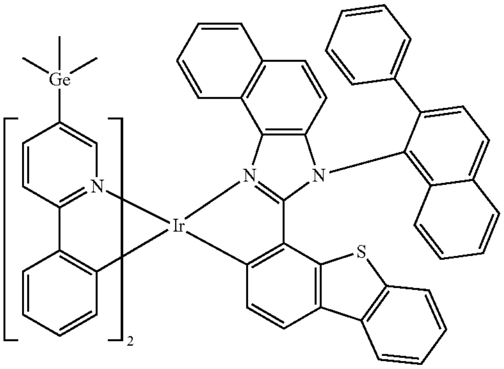
3031
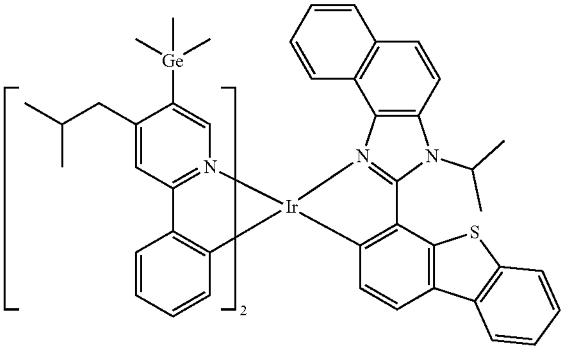
3032
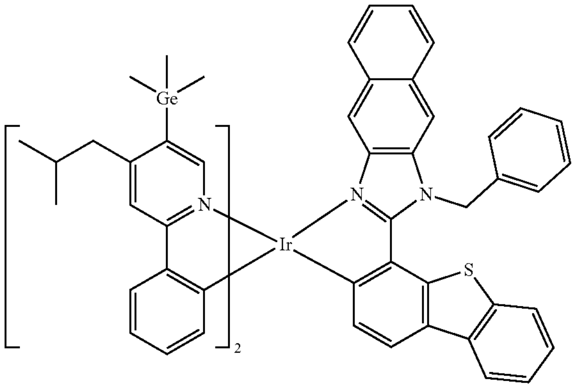
-continued
3033
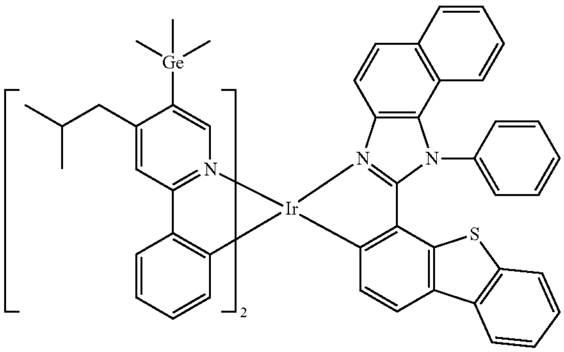
3034
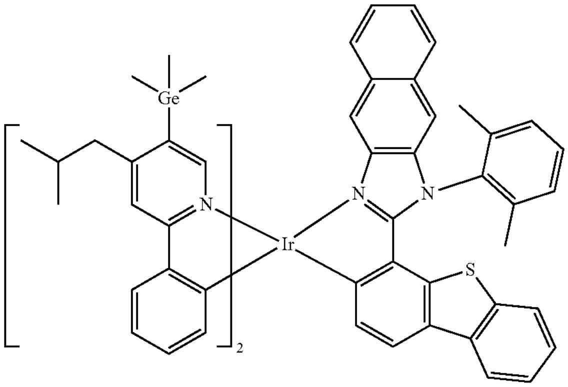
3035
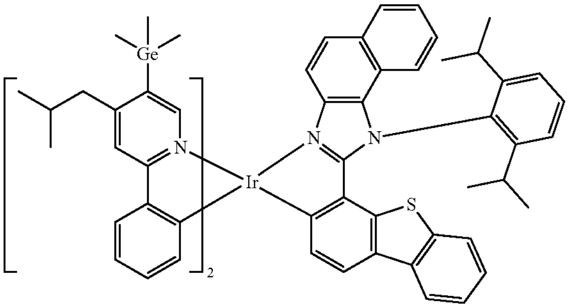
3036
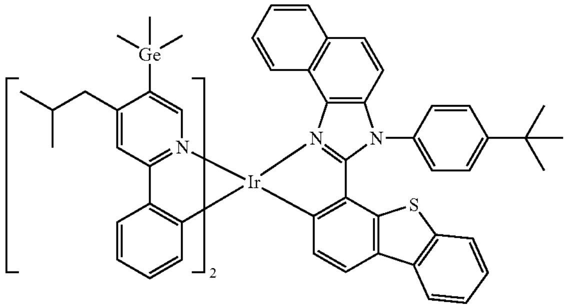

3037
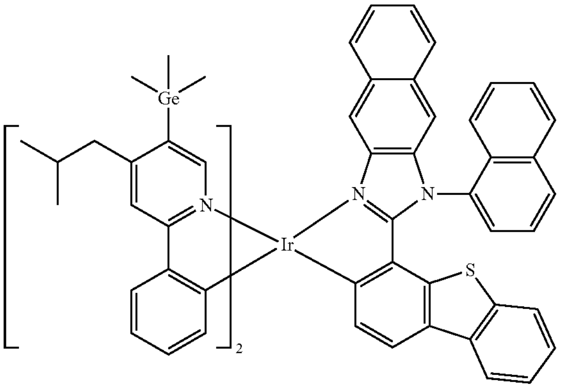
3038
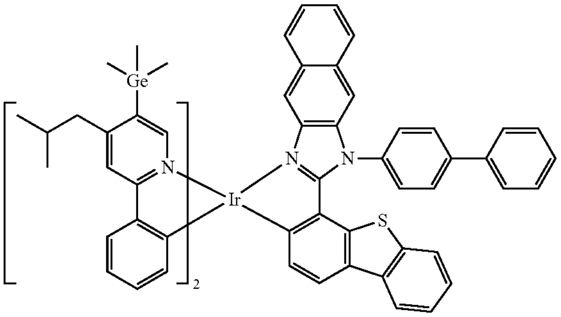
3039
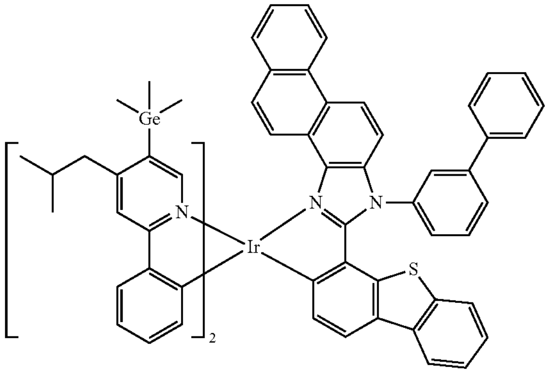
3040
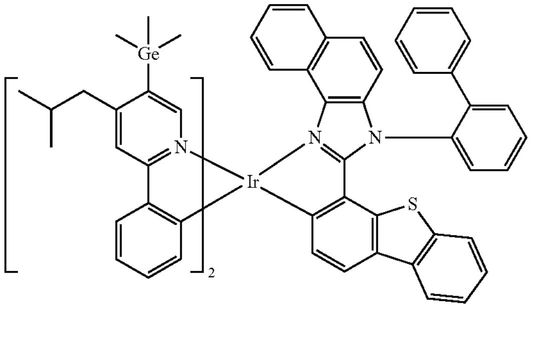
3041
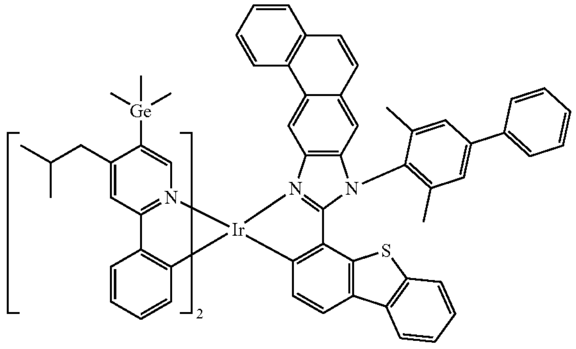
3042
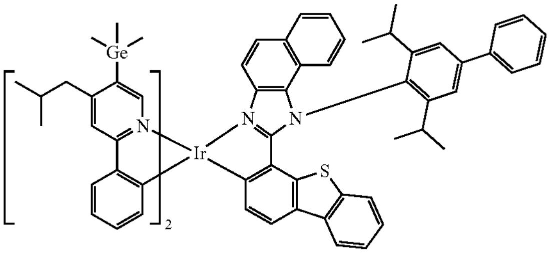
3043
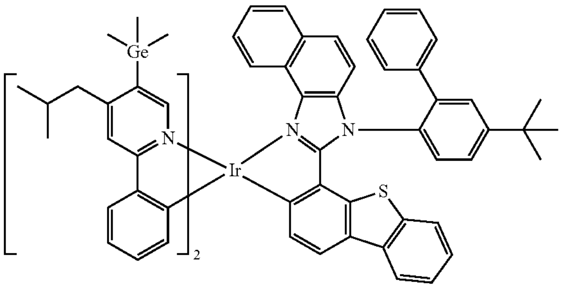
3044
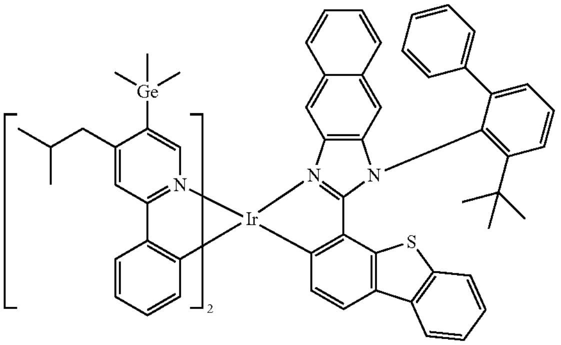
3045
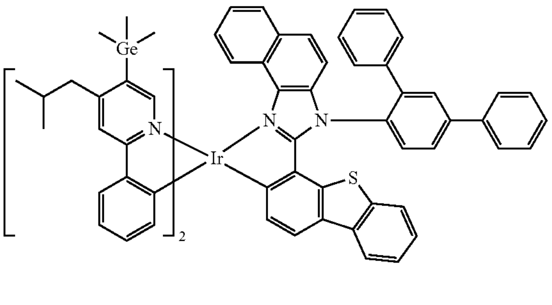

-continued
3046
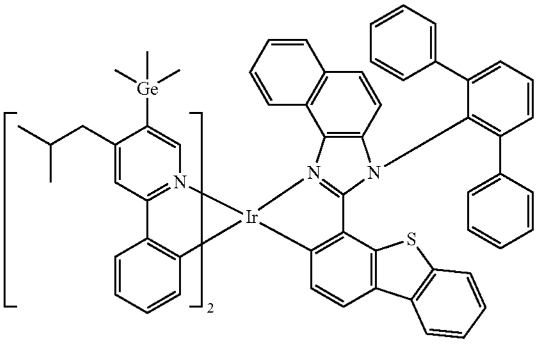
3047
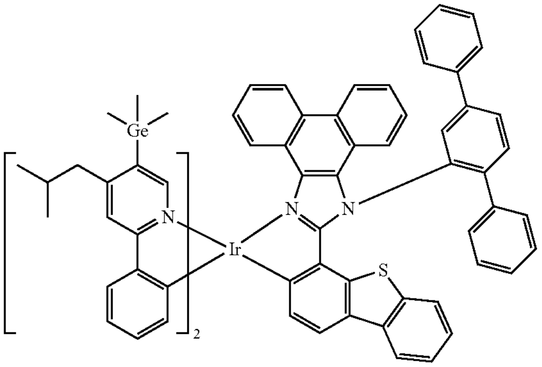
3048
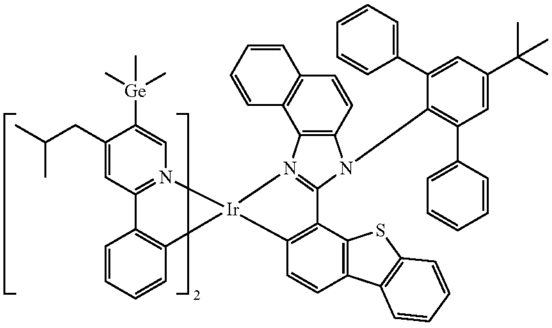
3049
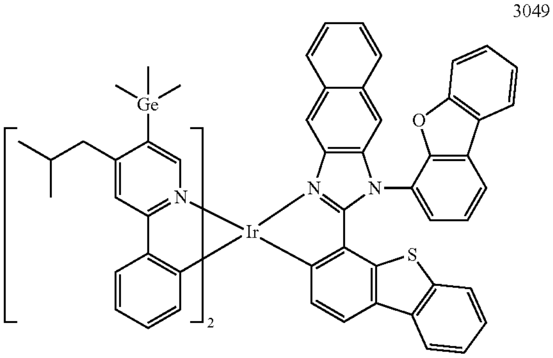
-continued
3050
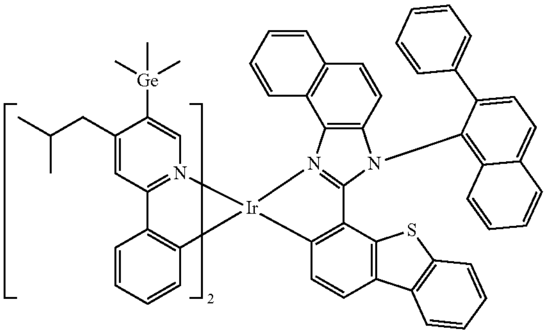
3051
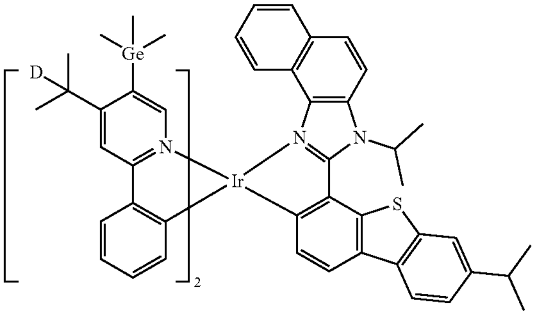
3052
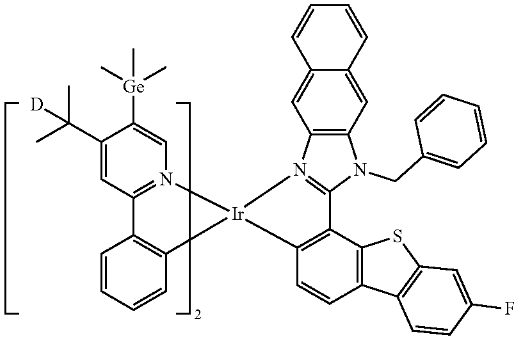
3053
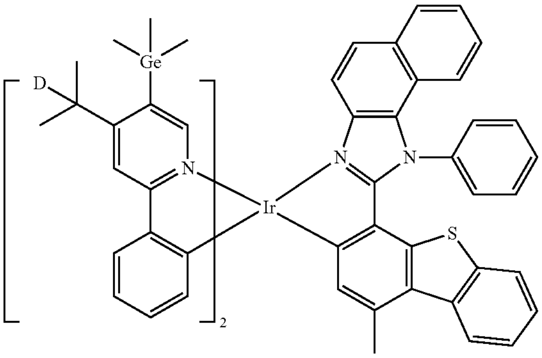

-continued
3054
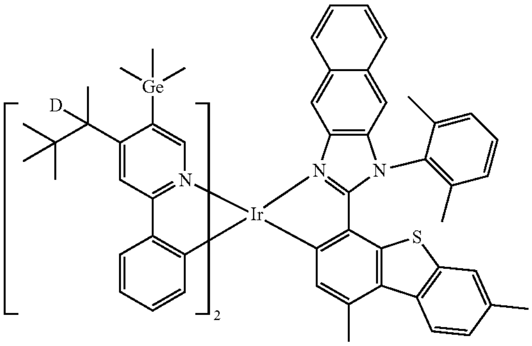
3055
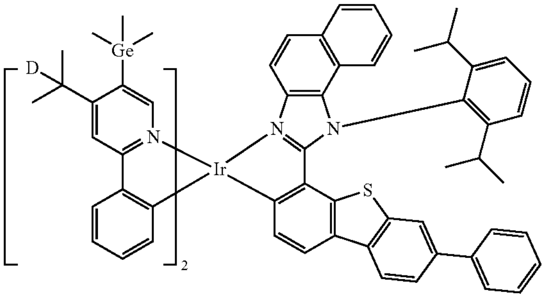
3056
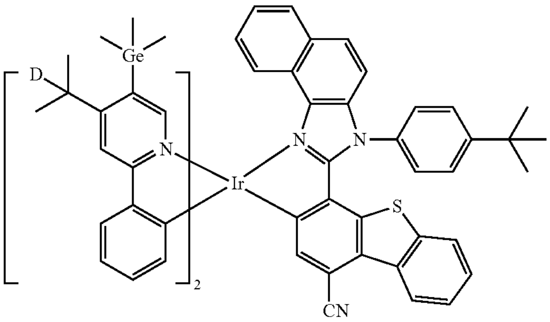
3057
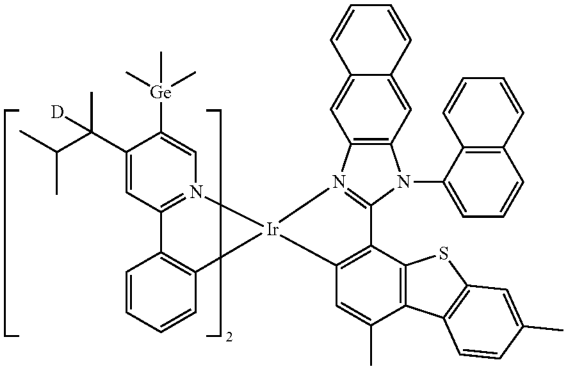
-continued
3058
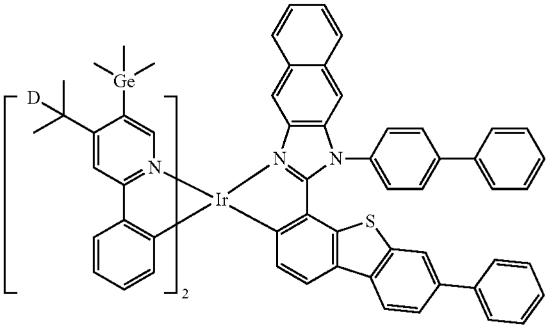
3059
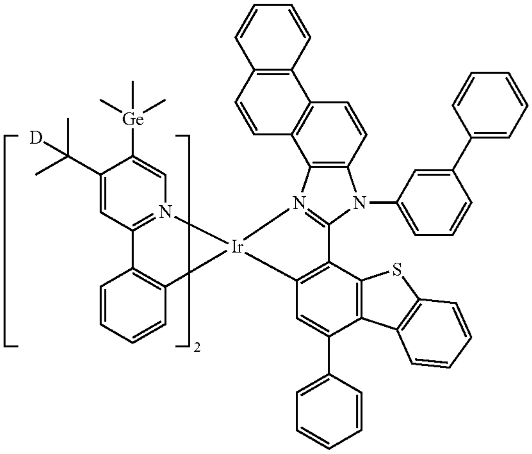
3060
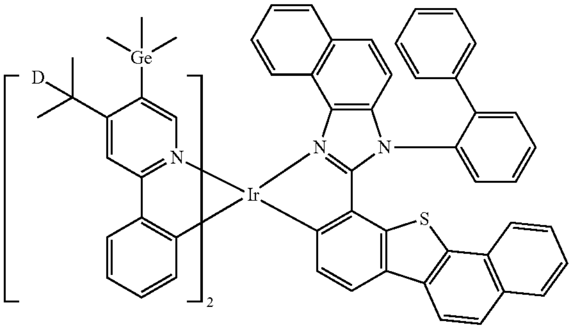
3061
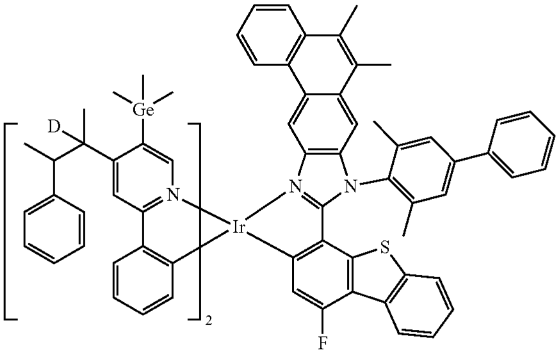

-continued
3062
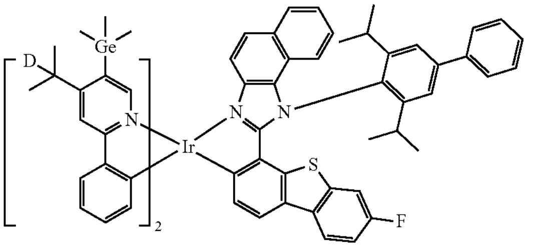
3063
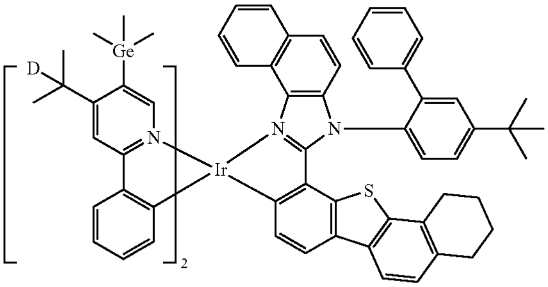
3064
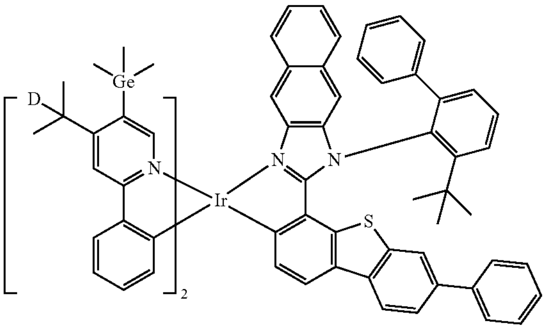
3065
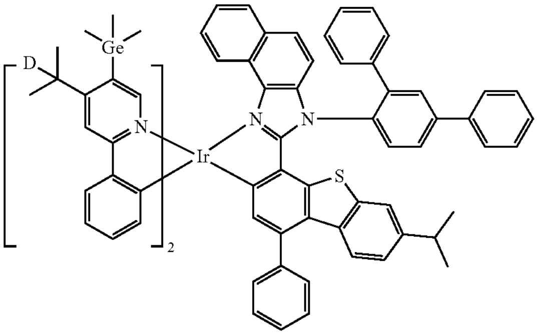
3066
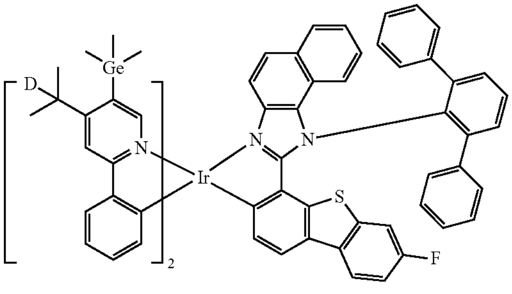
-continued
3067
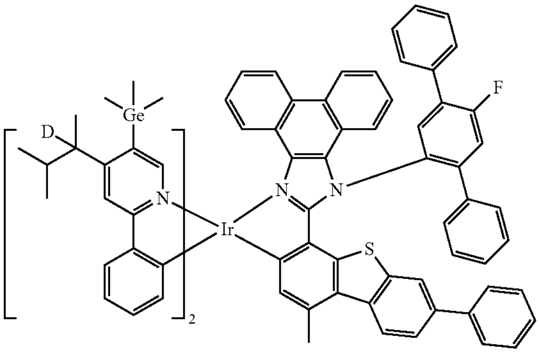
3068
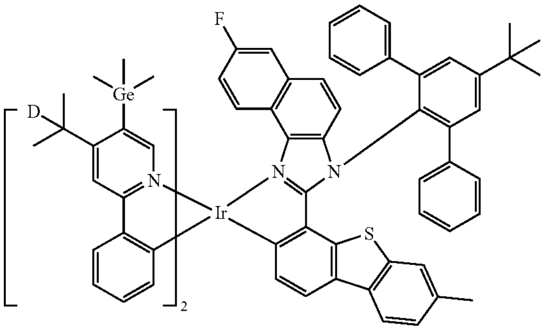
3069
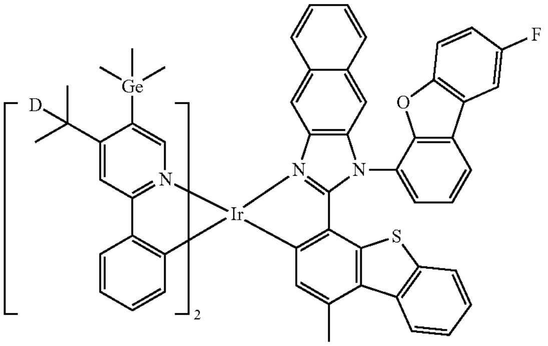
3070
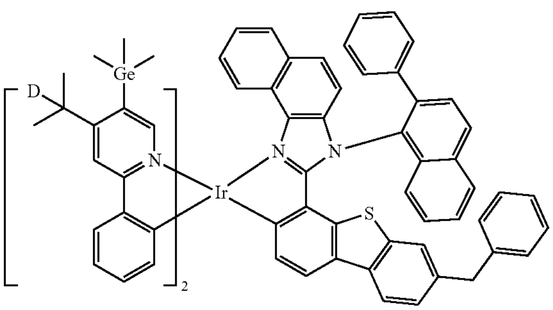

-continued
3071
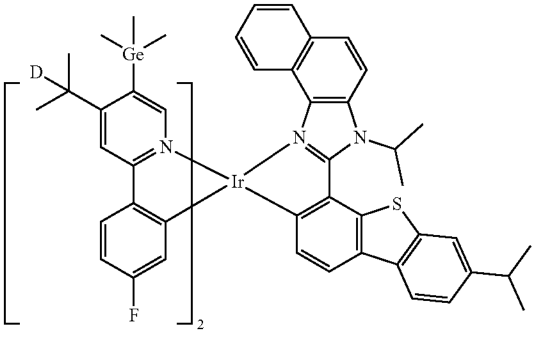
3072
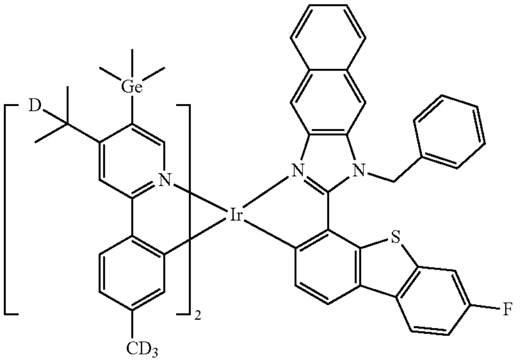
3073
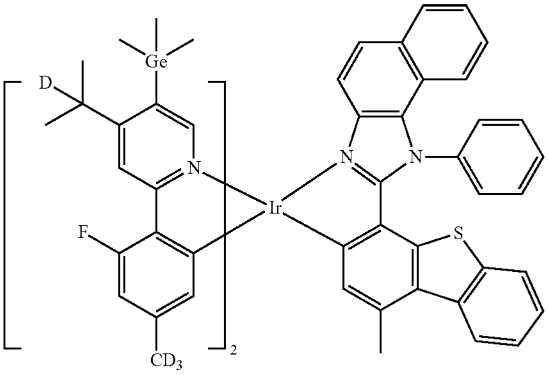
3074
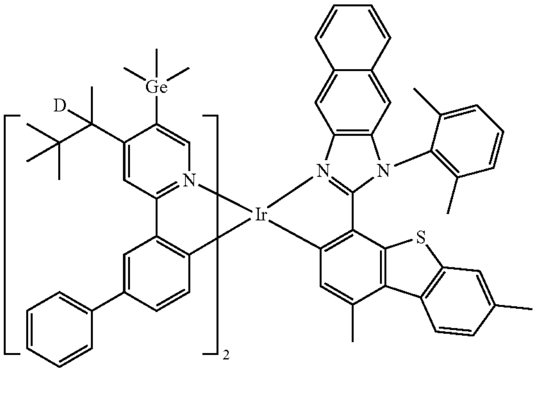
-continued
3075
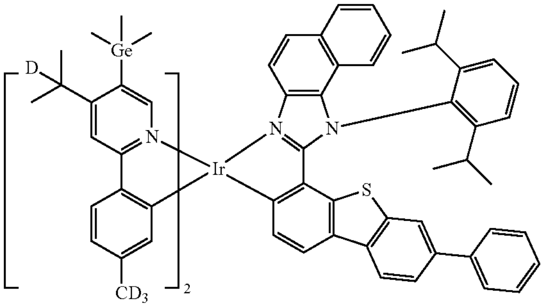
3076
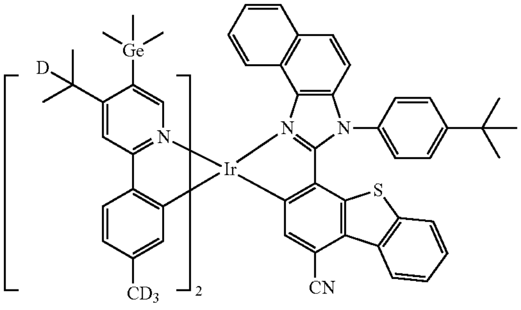
3077
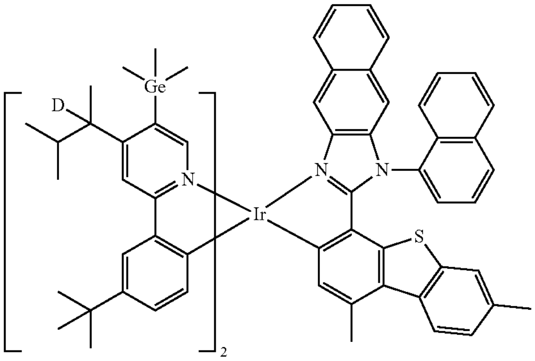
3078
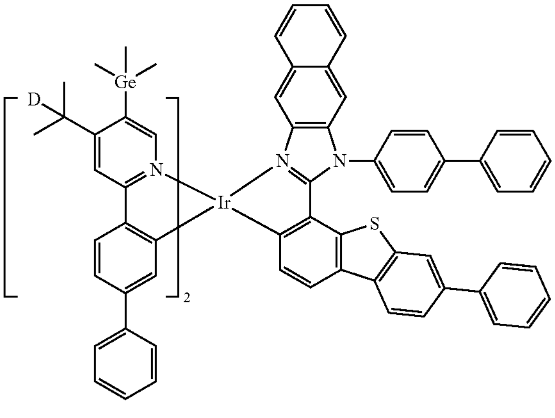

-continued
3079
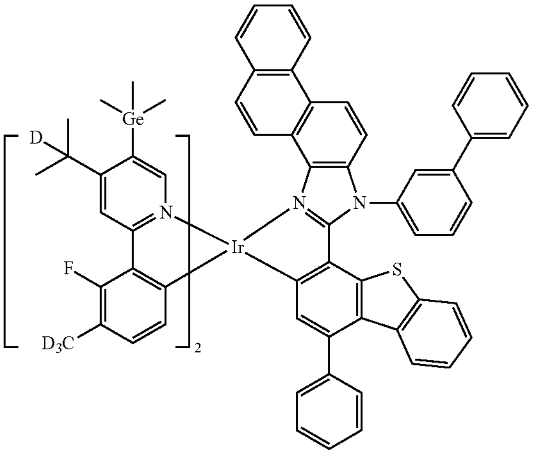
3080
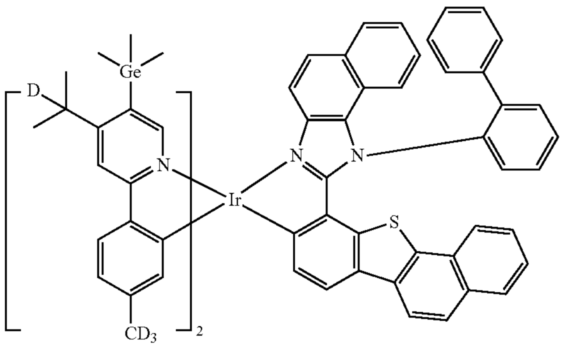
3081
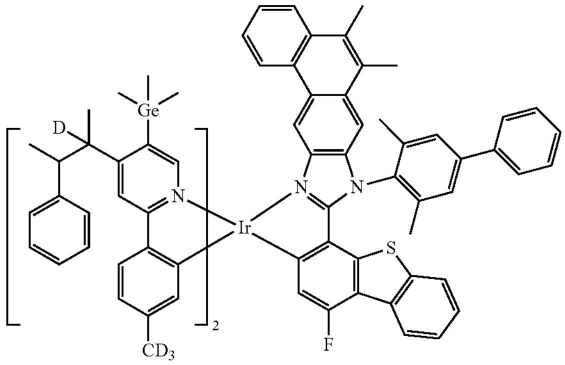
3082
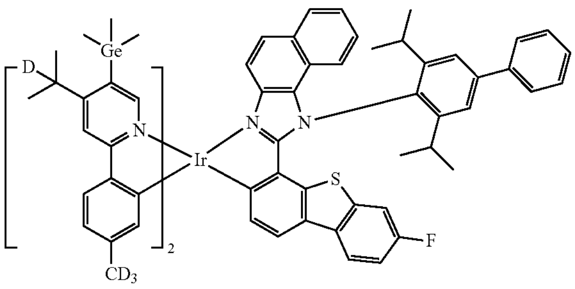
-continued
3083
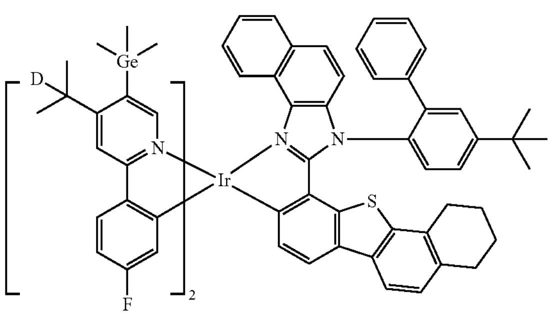
3084
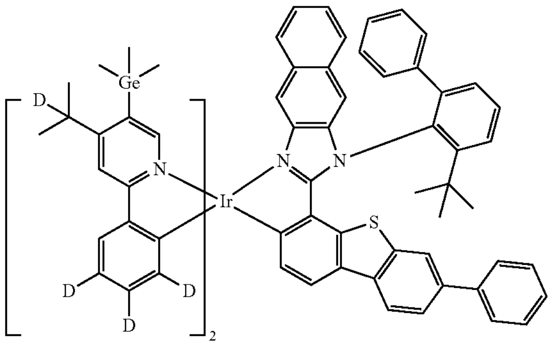
3085
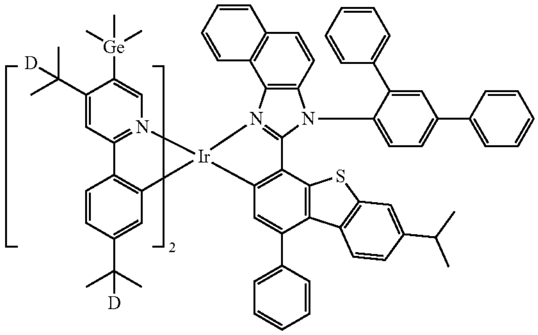
3086
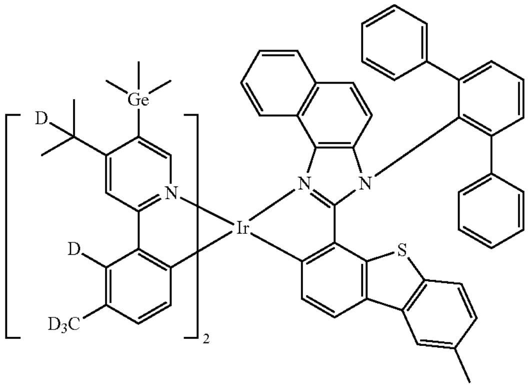

-continued
3087
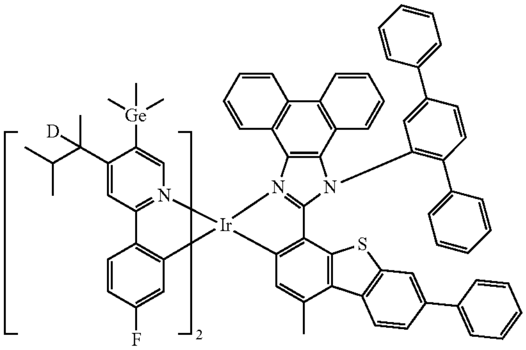
3088
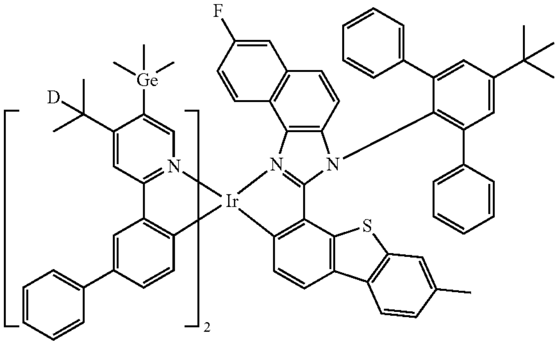
3089
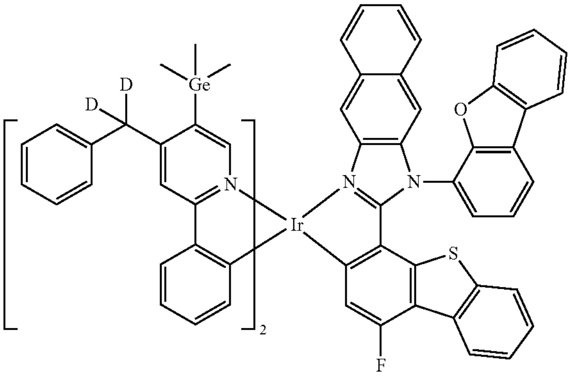
3090
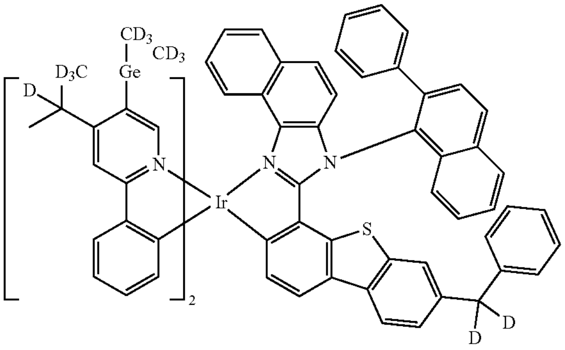
-continued
3091
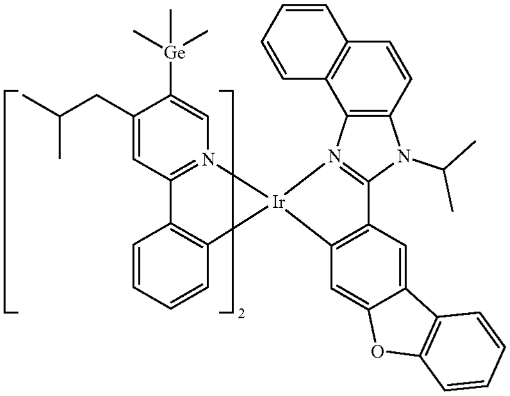
3092
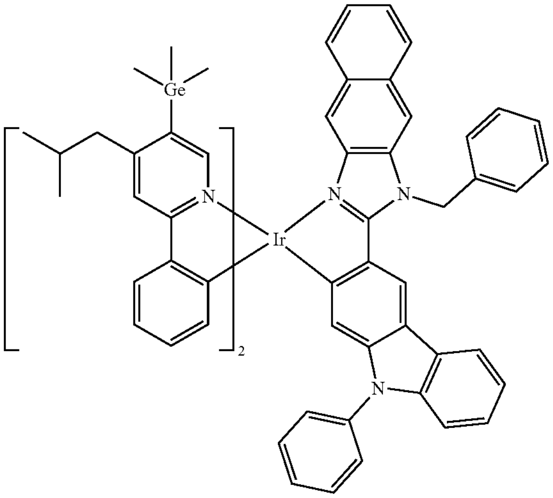
3093
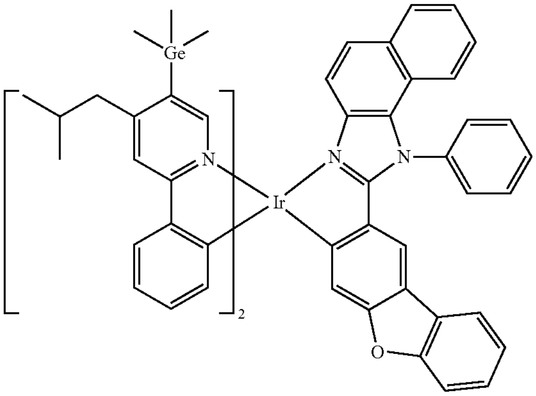

-continued
3094
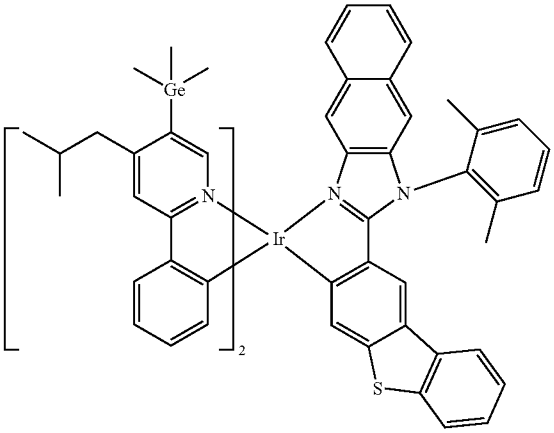
3095
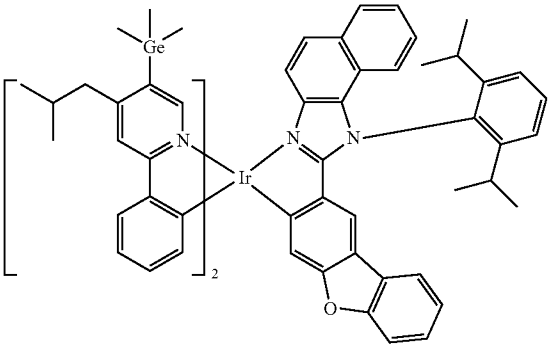
3096
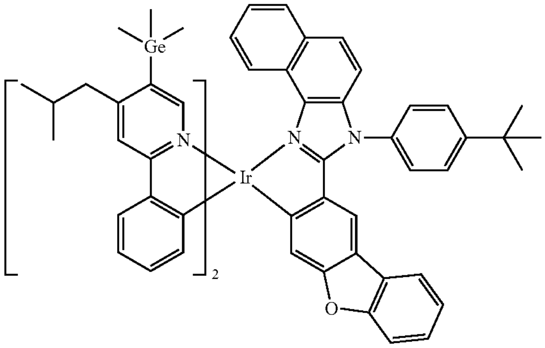
3097
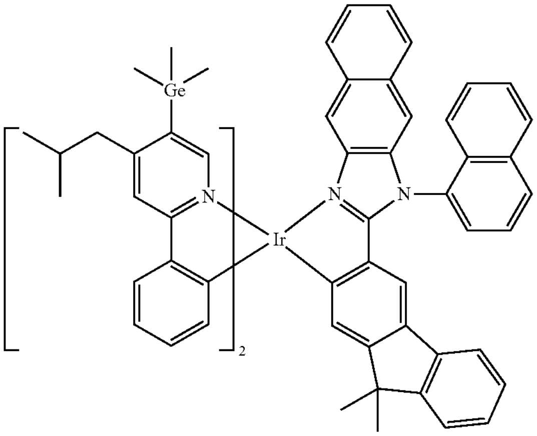
-continued
3098
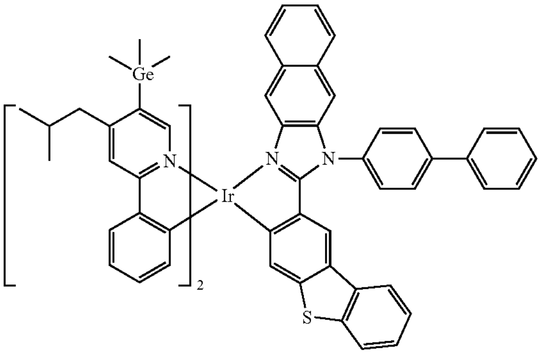
3099
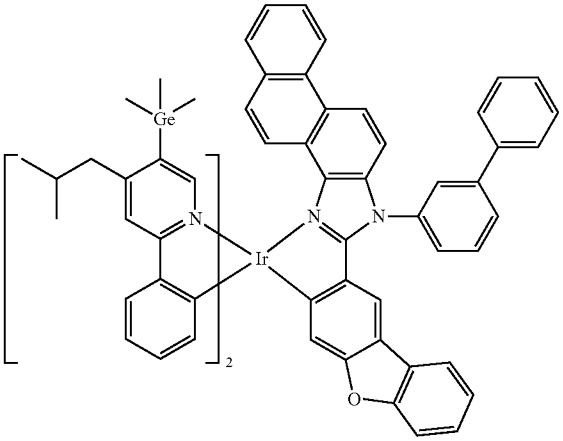
3100
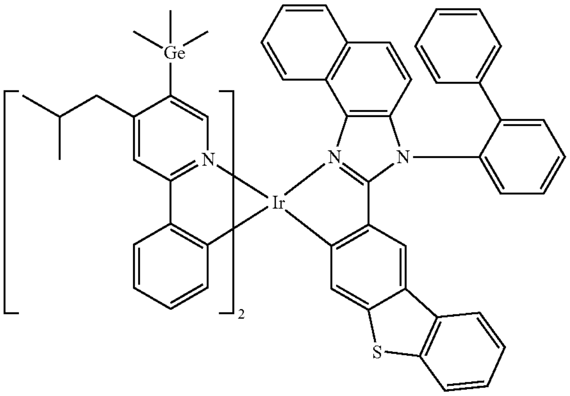

-continued
3101
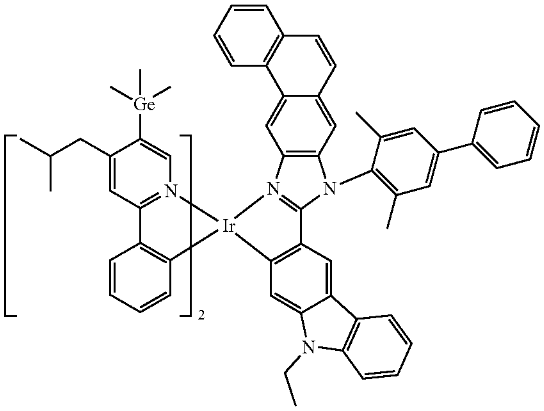
3102
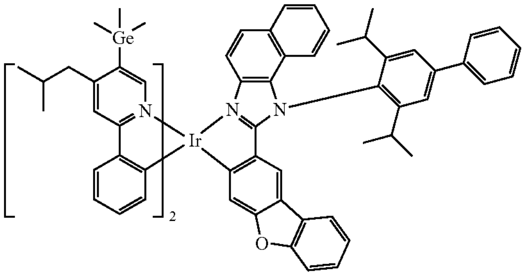
3103
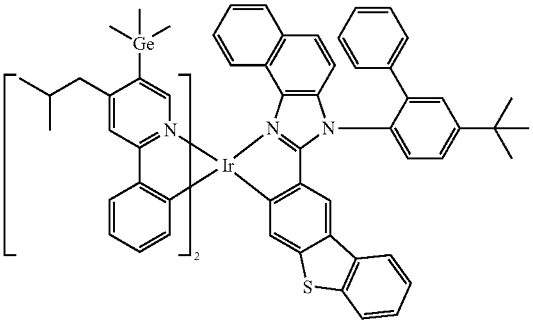
3104
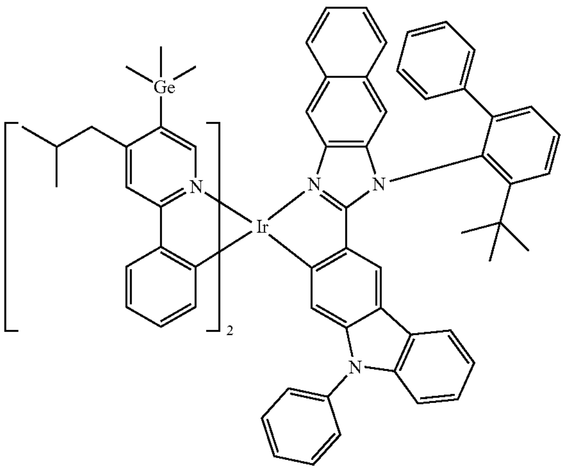
-continued
3105
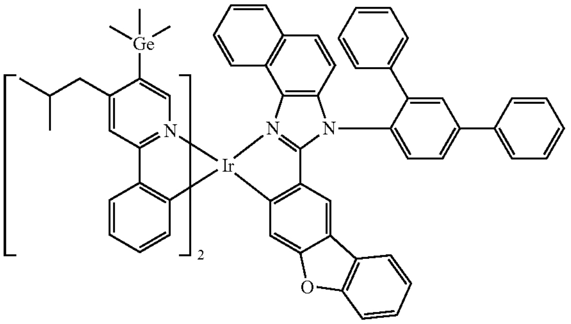
3106
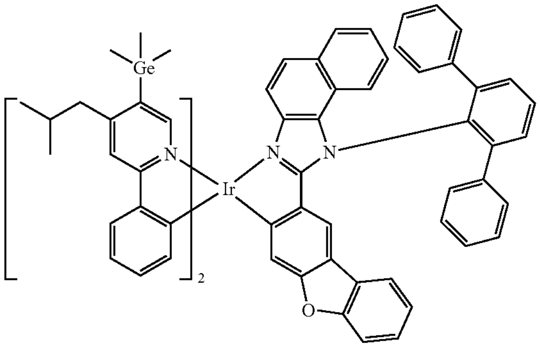
3107
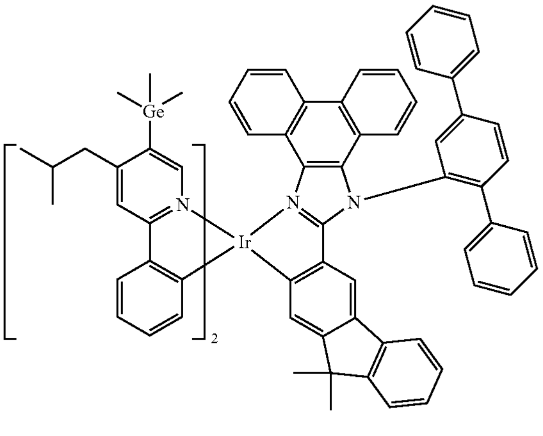
3108
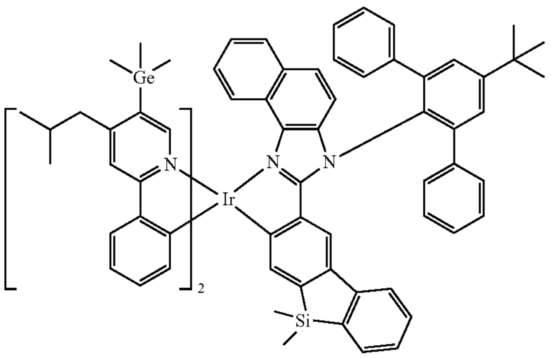

-continued
3109
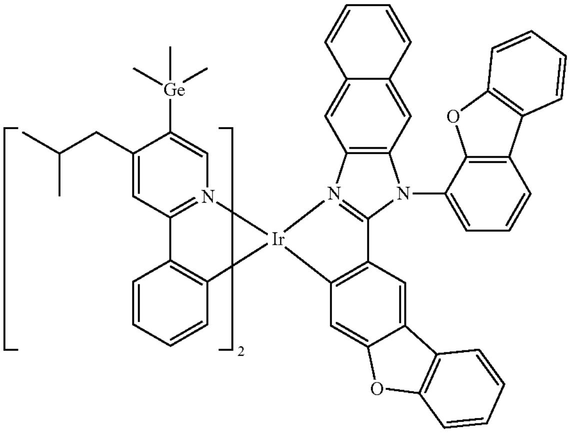
3110
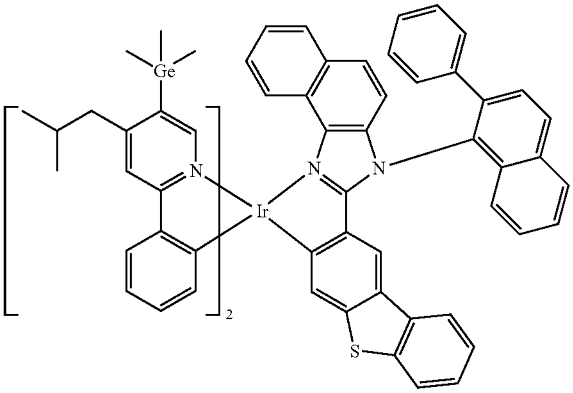
3111
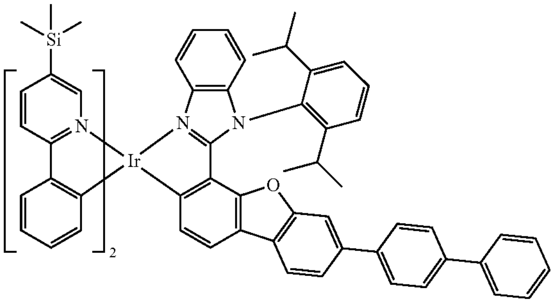
3112
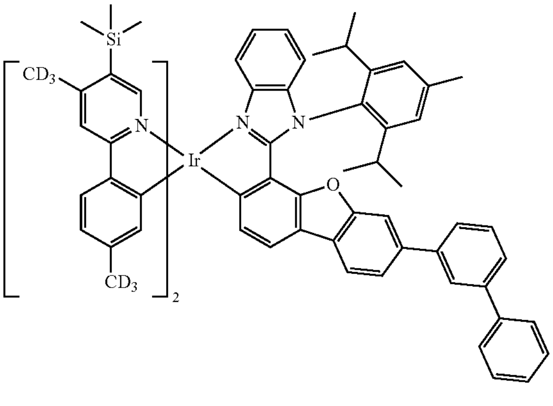
-continued
3113
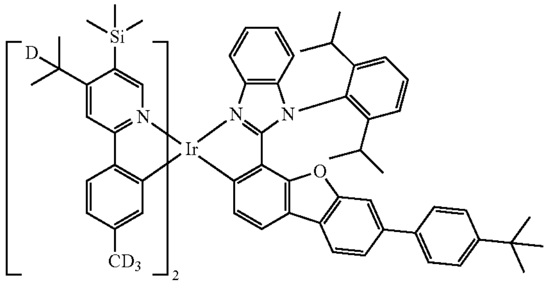
3114
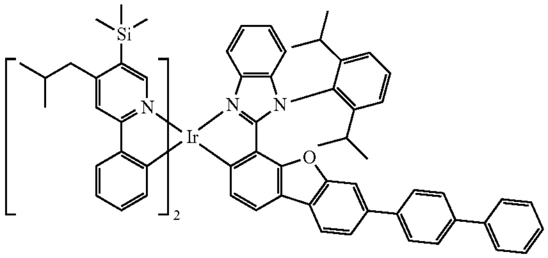
3115
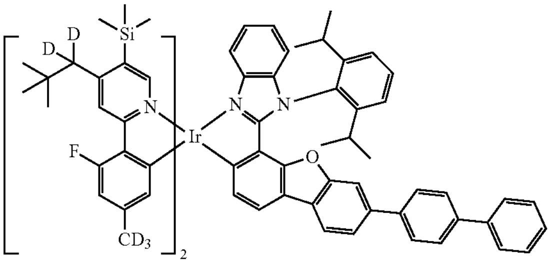
3116
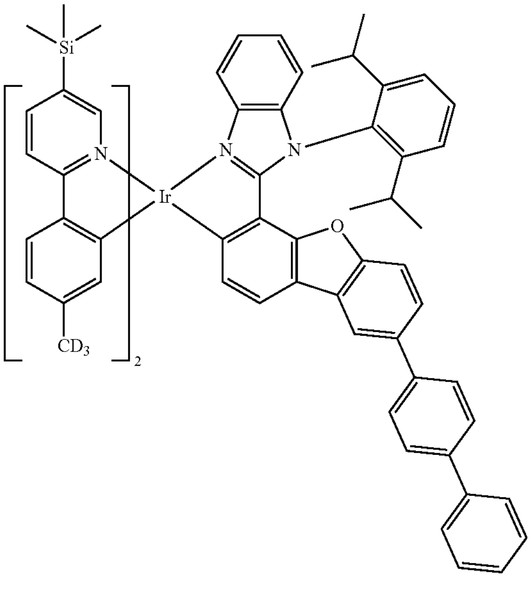

-continued
3117
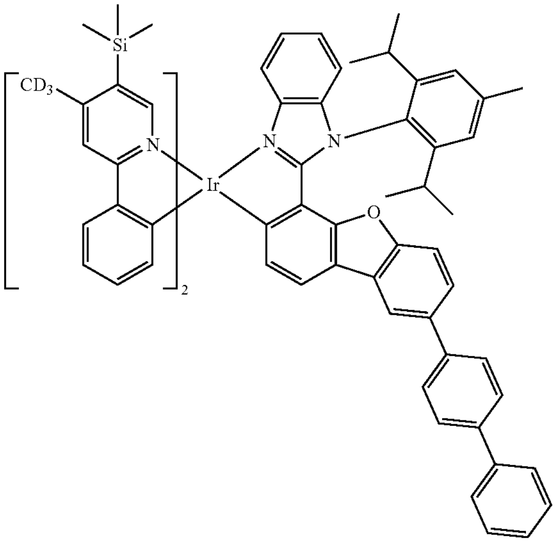
3118
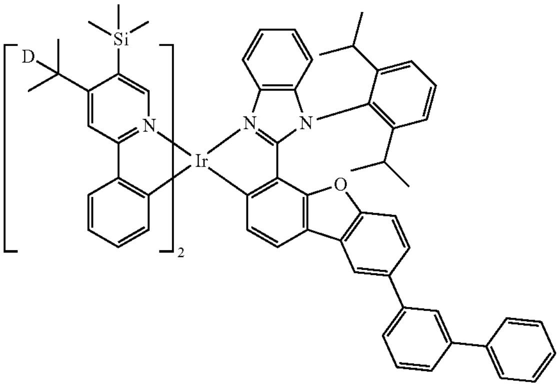
3119
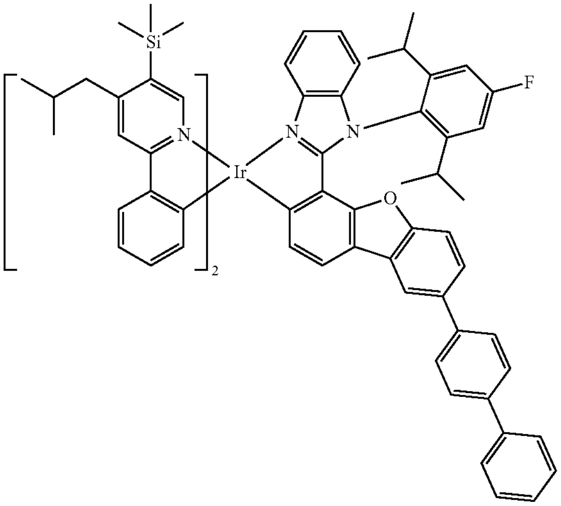
-continued
3120
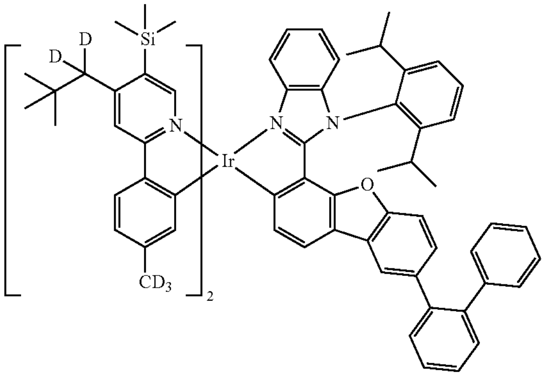
3121
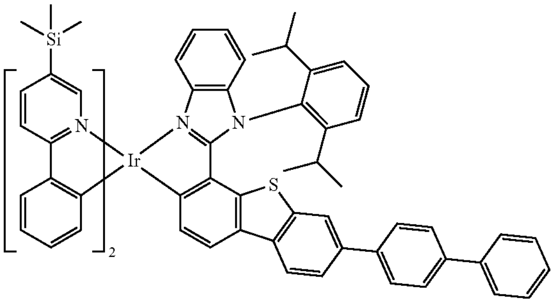
3122
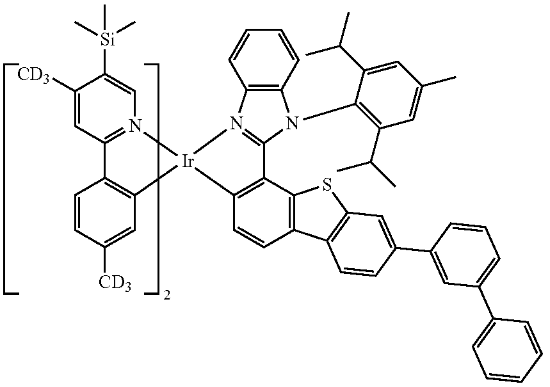
3123
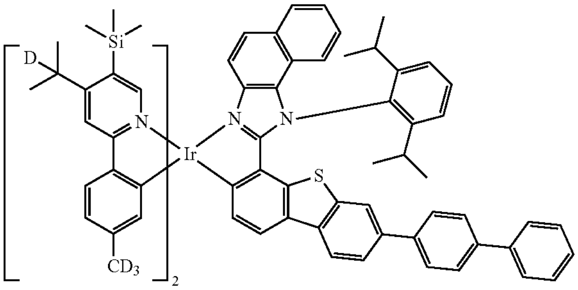

3124
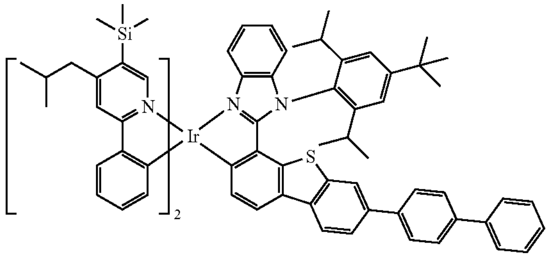
3125
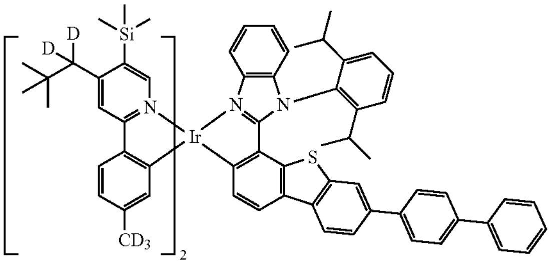
3126
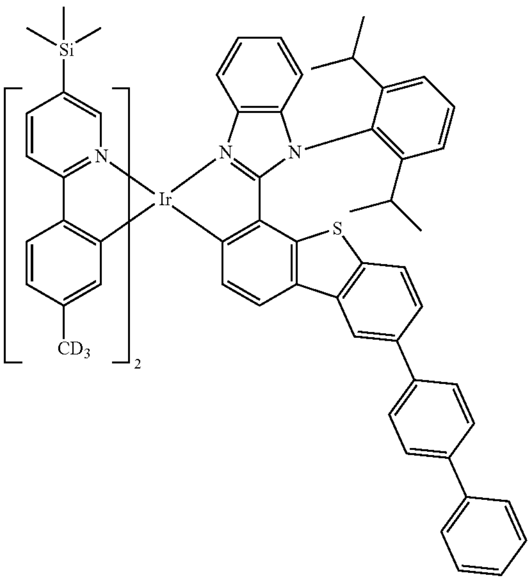
3127
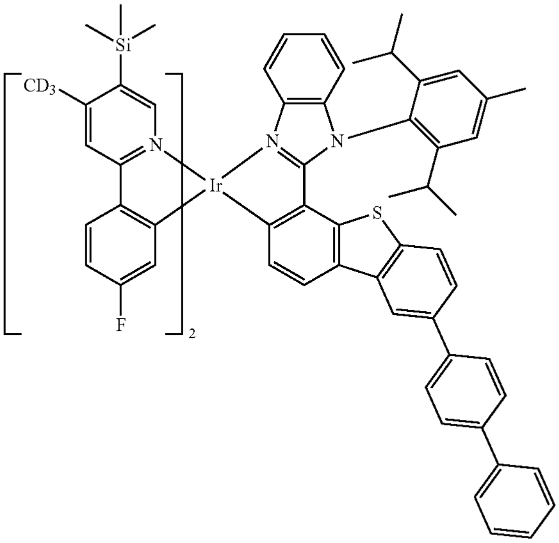
3128
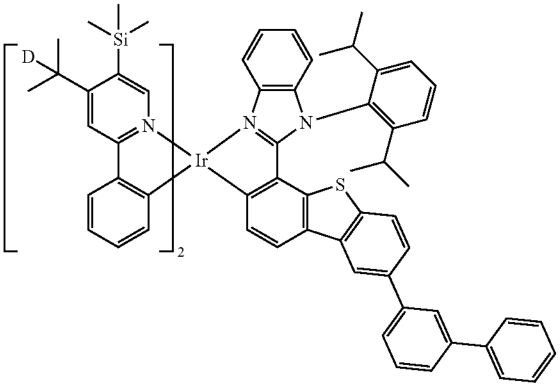
3129
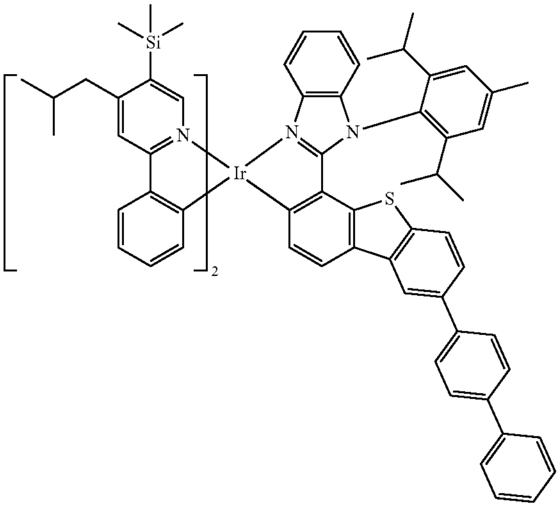

-continued
3130
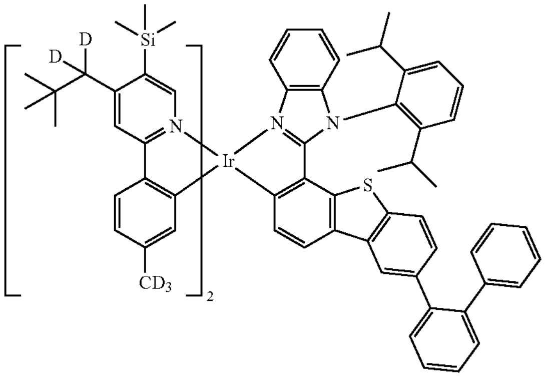
3131
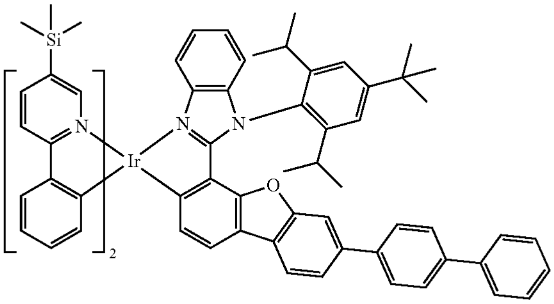
3132
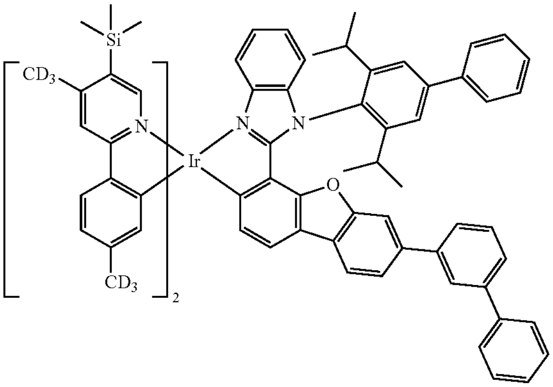
3133
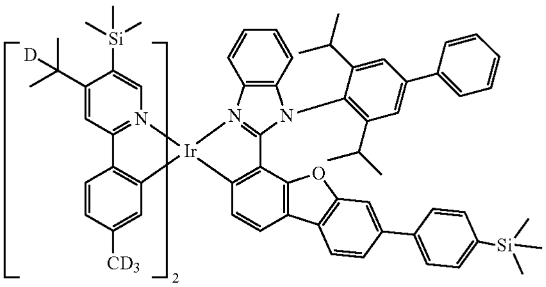
-continued
3134
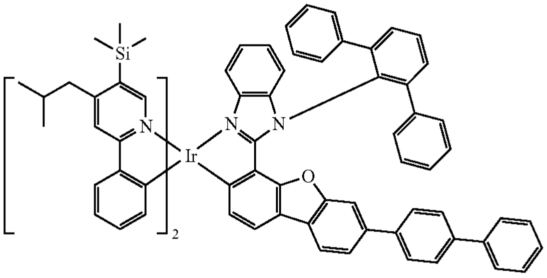
3135
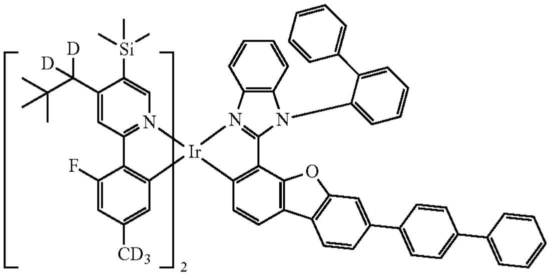
3136
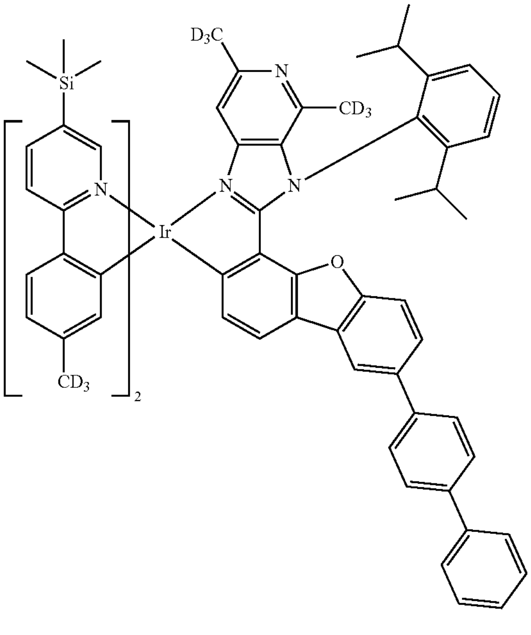

-continued
3137
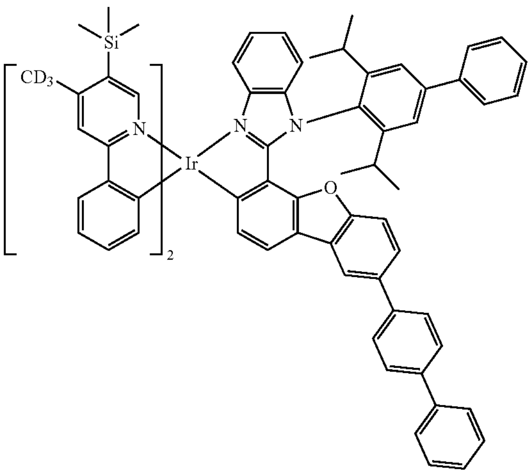
3138
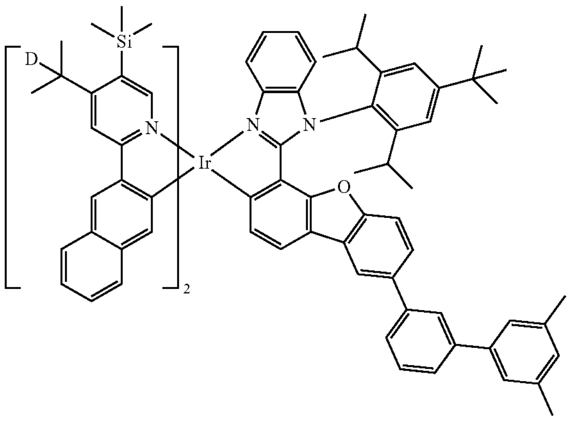
3139
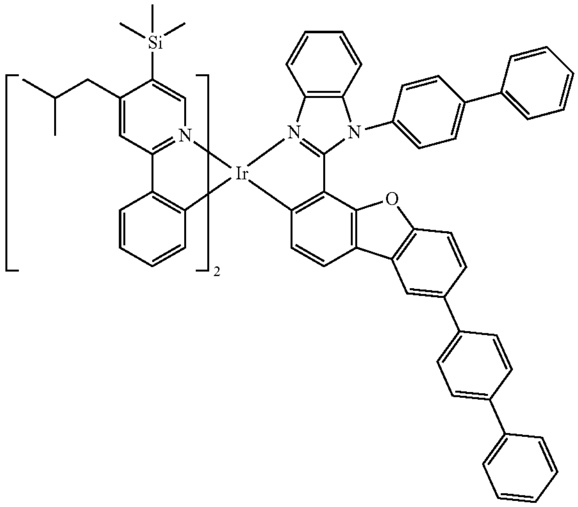
-continued
3140
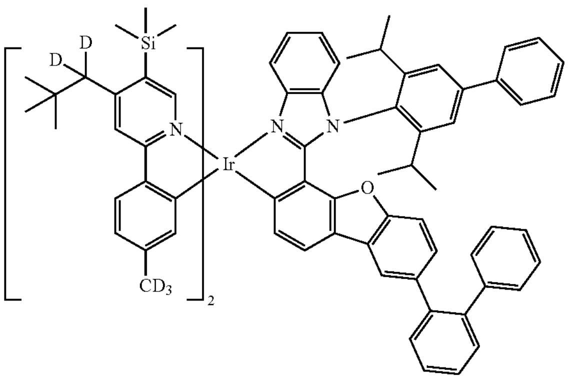
3141
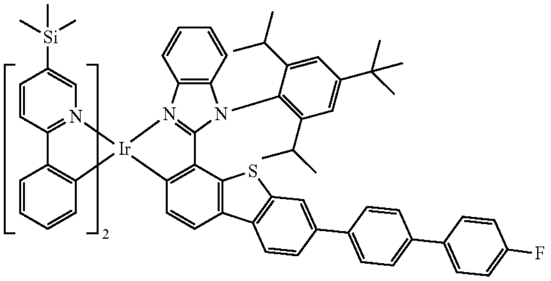
3142
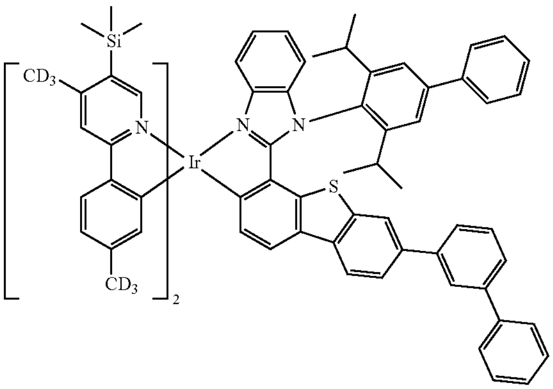
3143
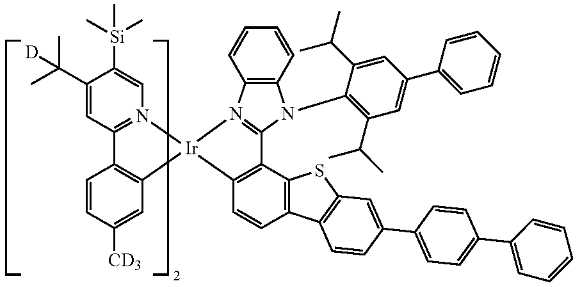

-continued
3144
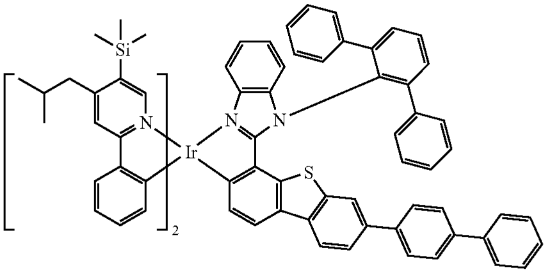
3145
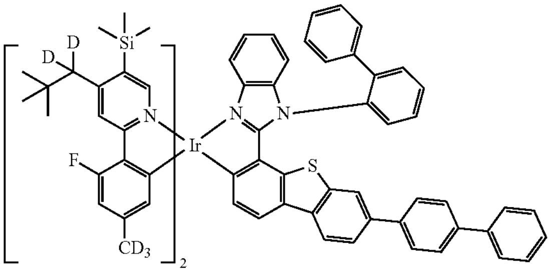
3146
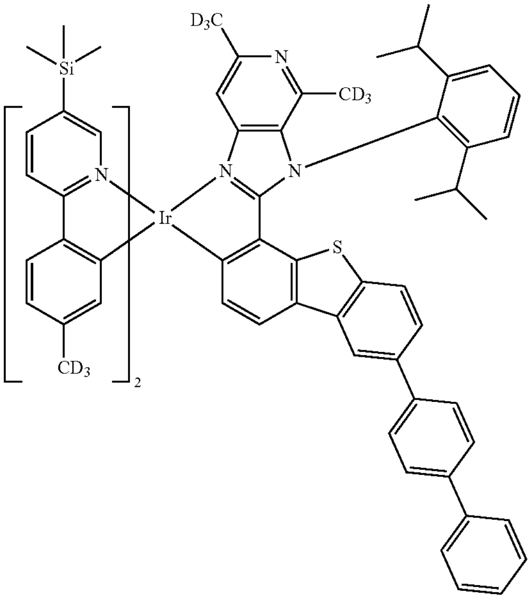
-continued
3147
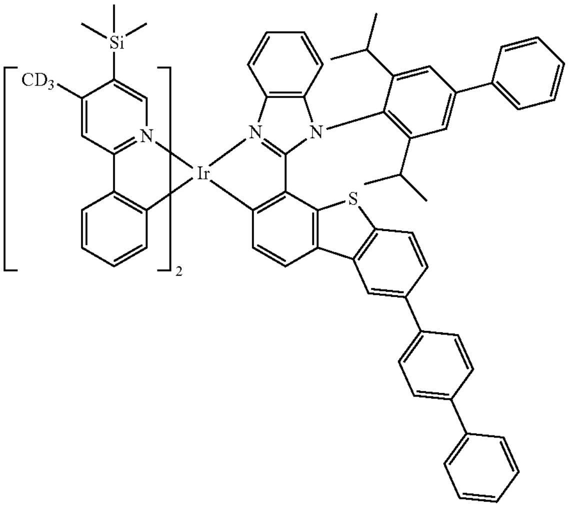
3148
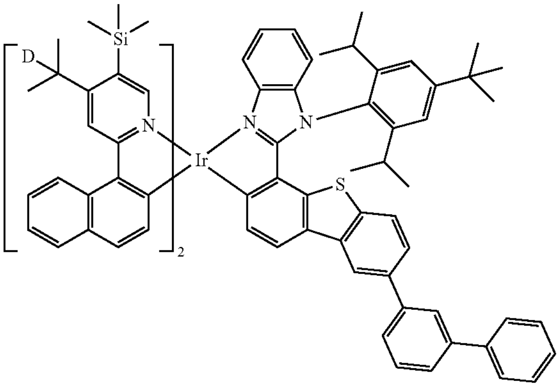
3149
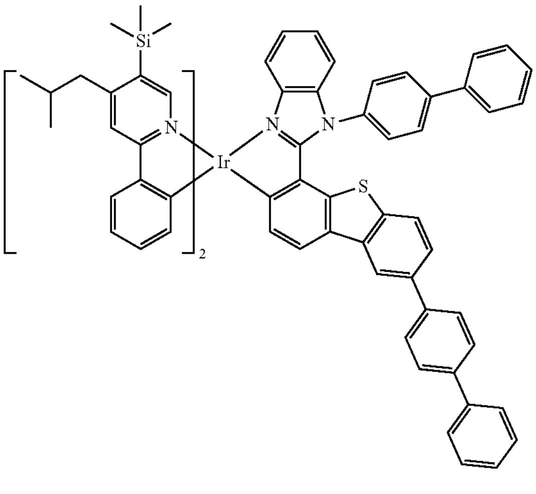

-continued
3150
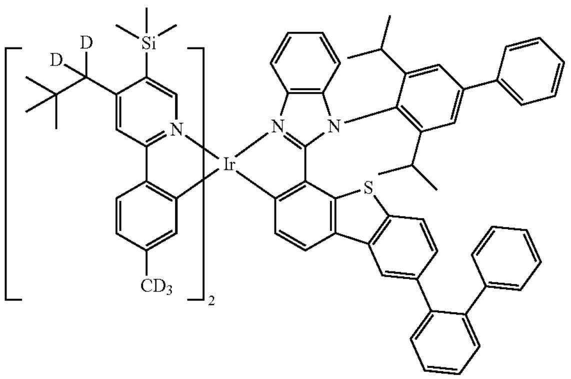
3151
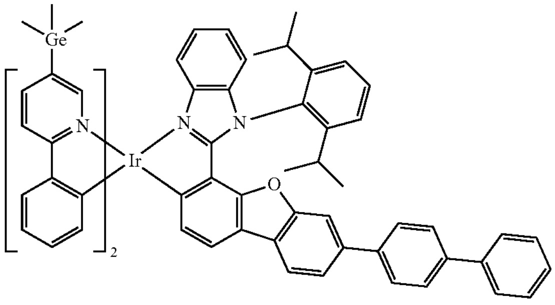
3152
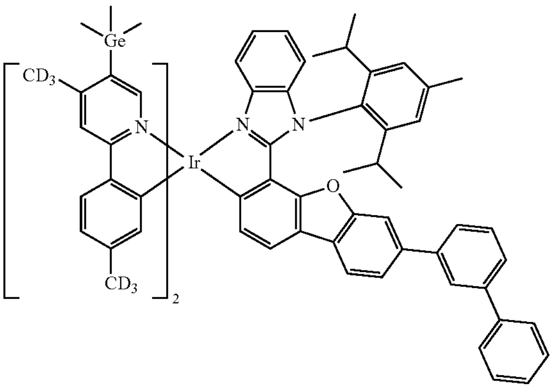
3153
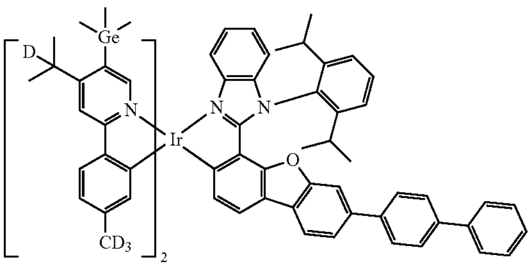
-continued
3154
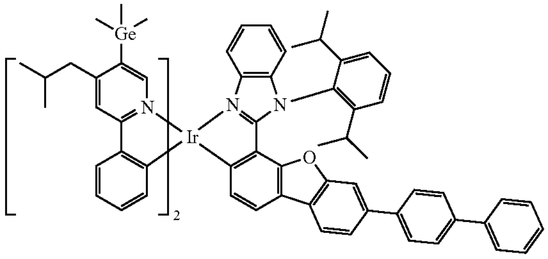
3155
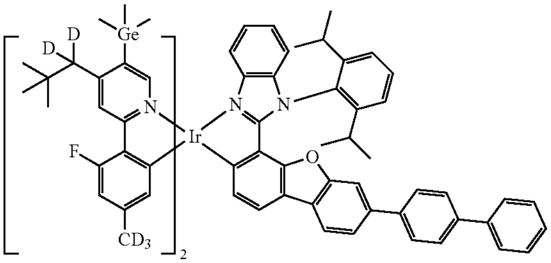
3156
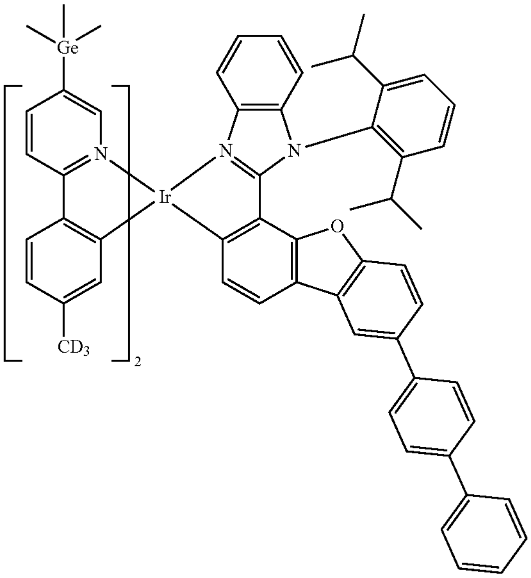

-continued
3157
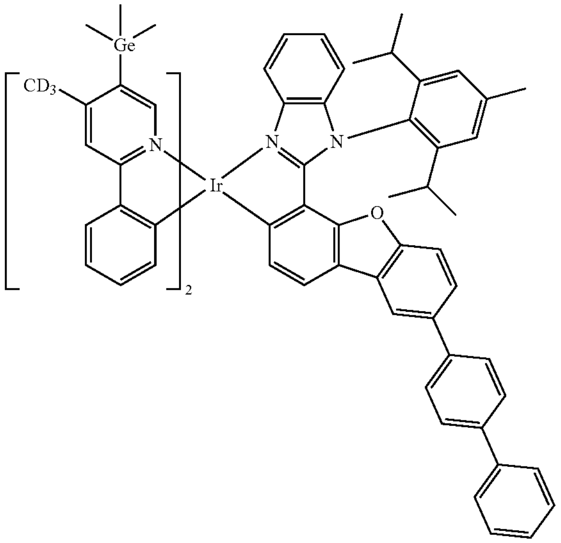
3158
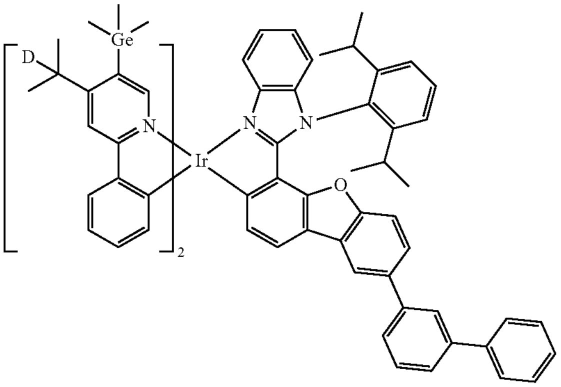
3159
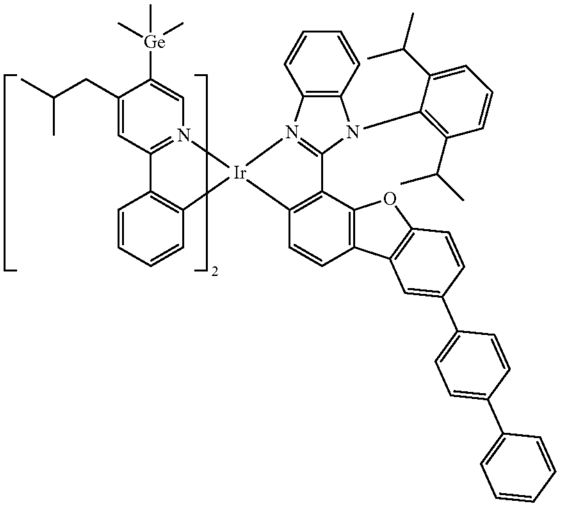
-continued
3160
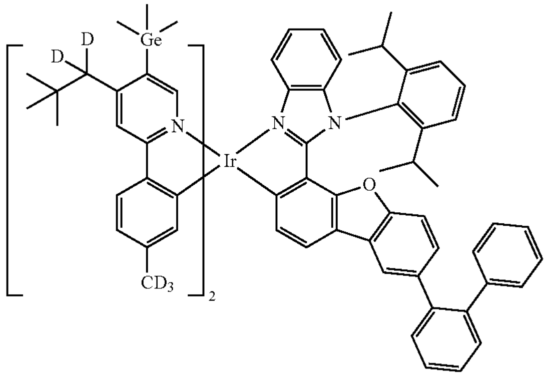
3161
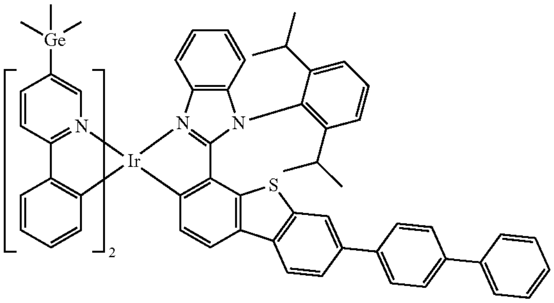
3162
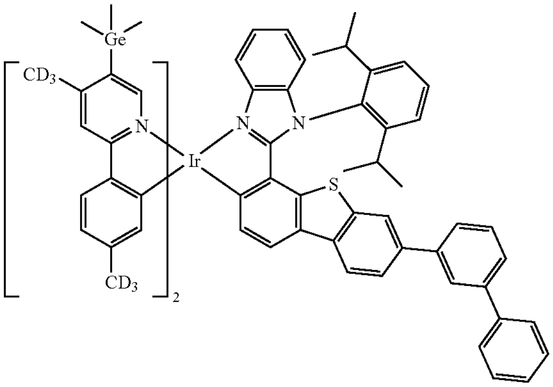
3163
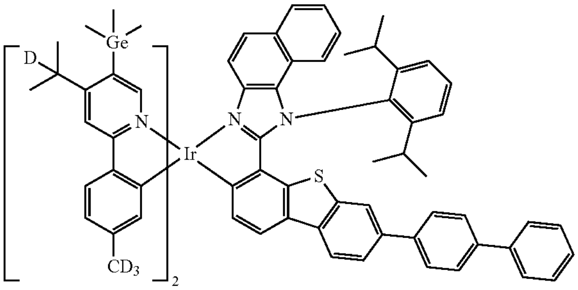

-continued
3164
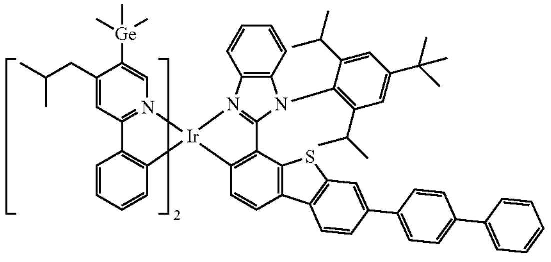
3165
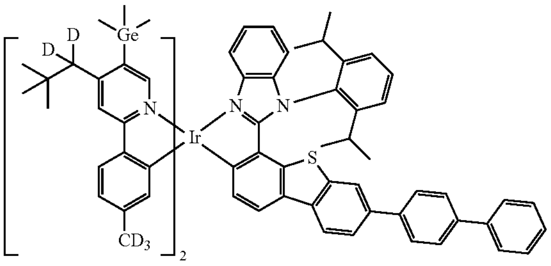
3166
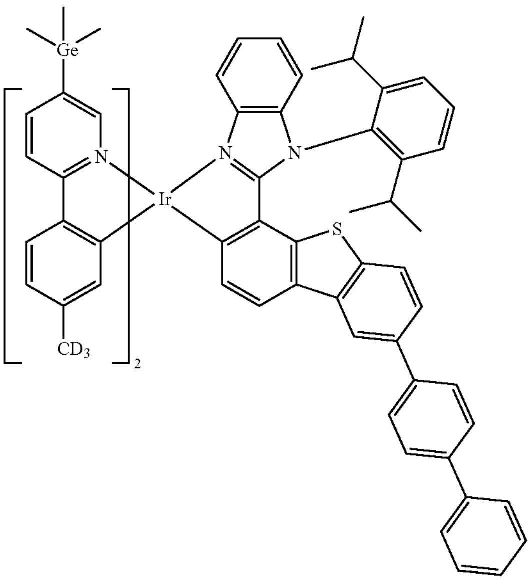
-continued
3167
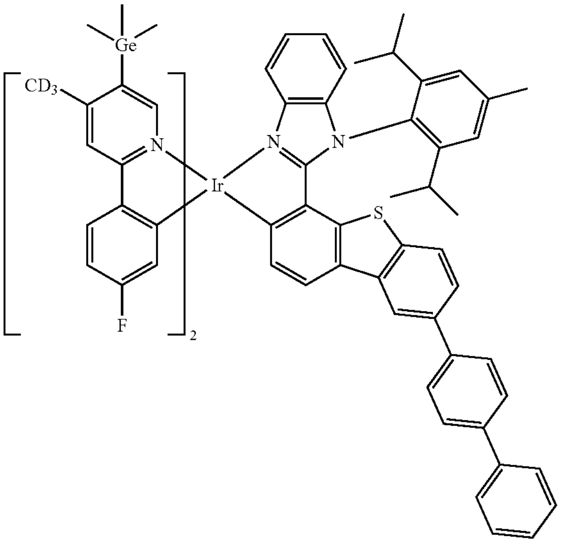
3168
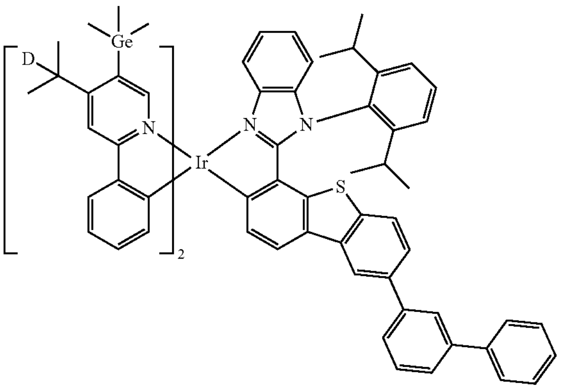
3169
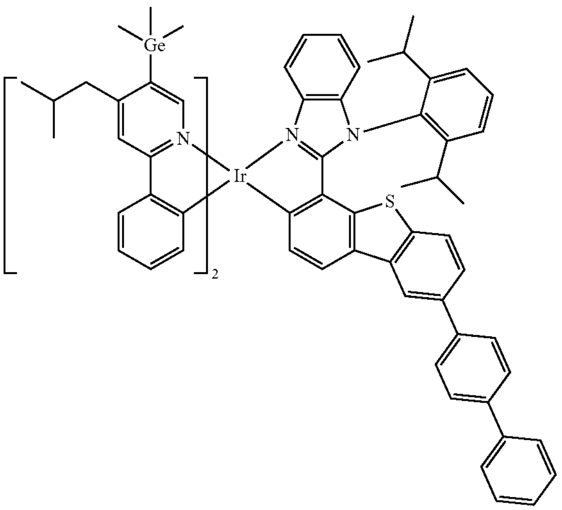

-continued
3170
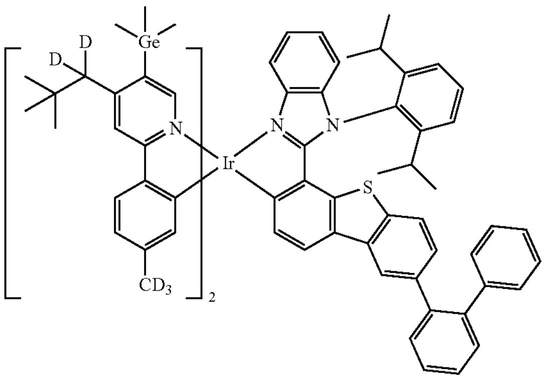
3171
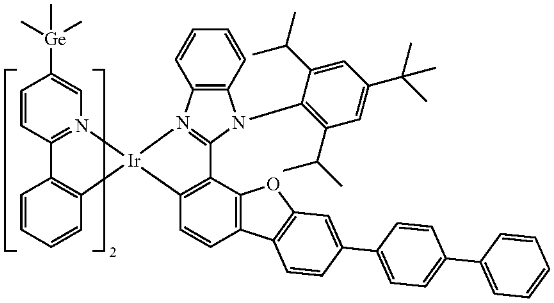
3172
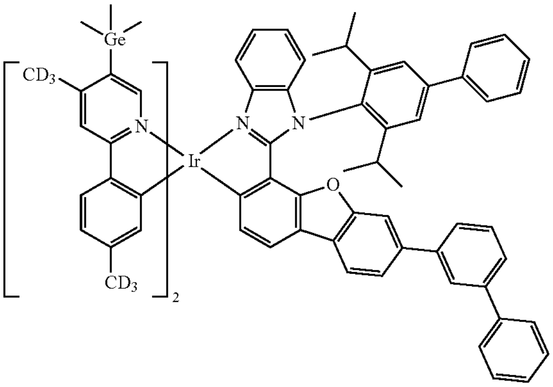
3173
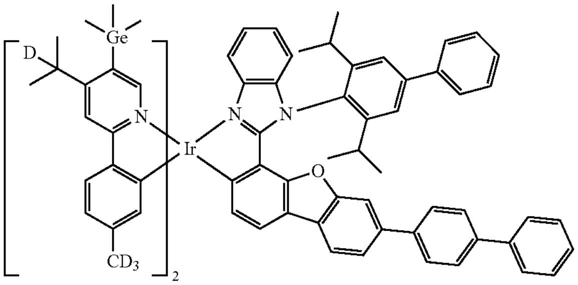
-continued
3174
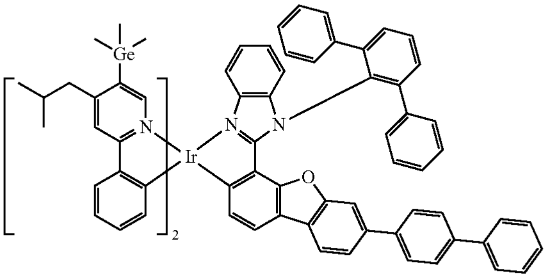
3175
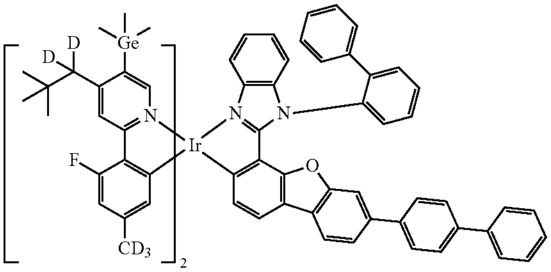
3176
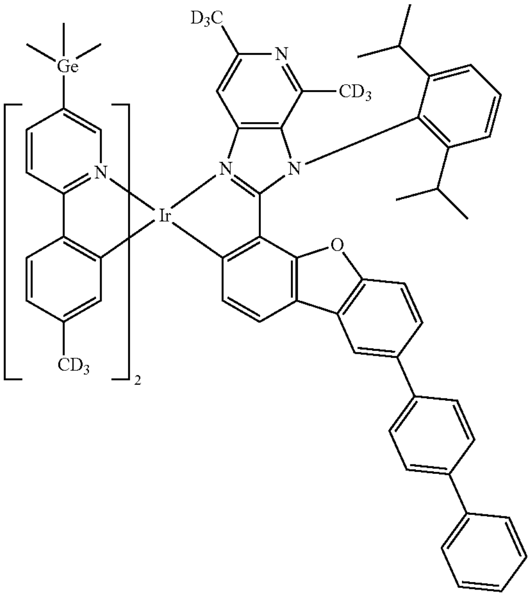

-continued
3177
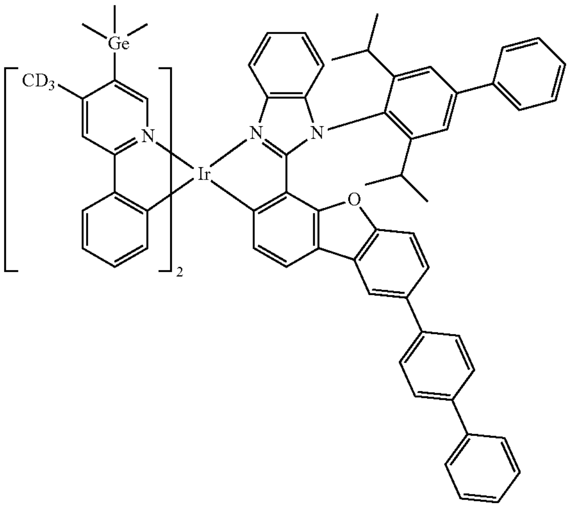
3178
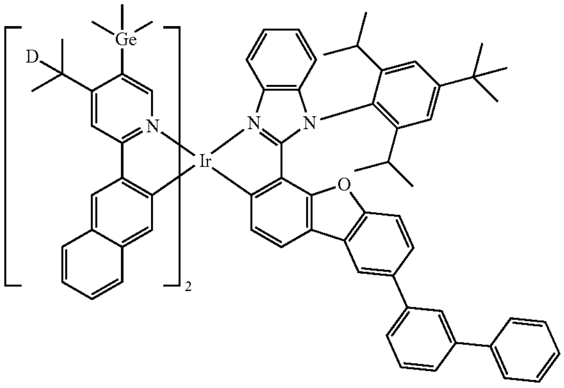
3179
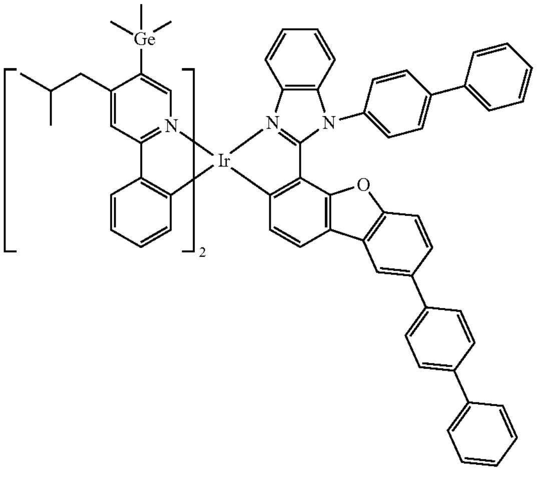
-continued
3180
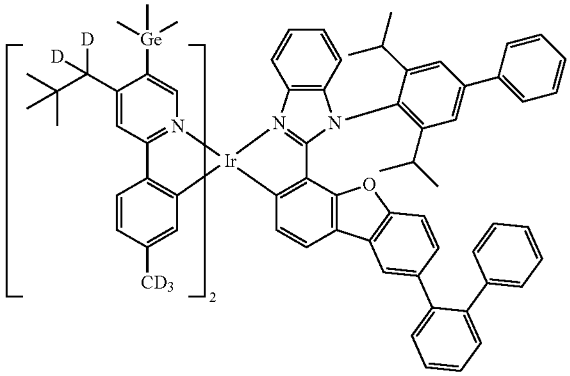
3181
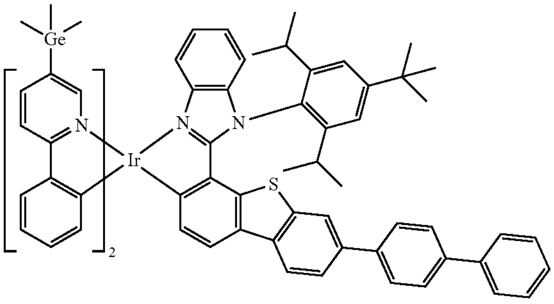
3182
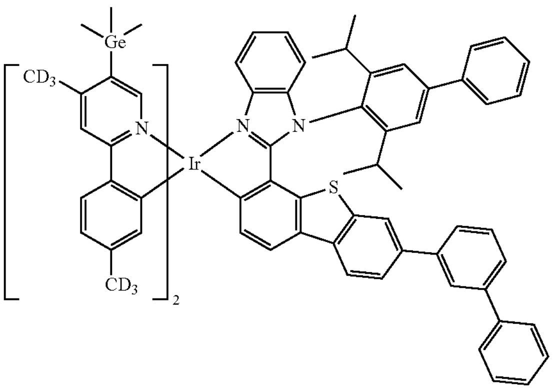
3183
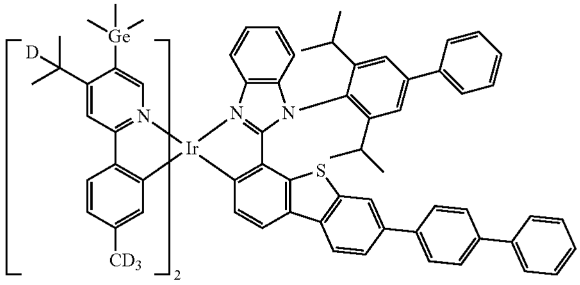

-continued
3184
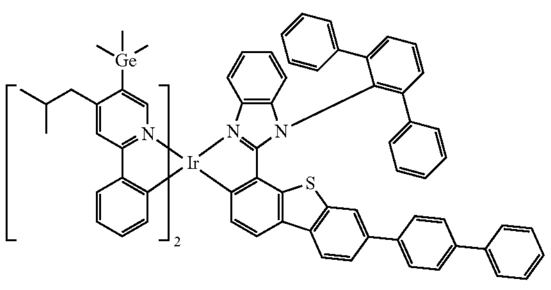
3185
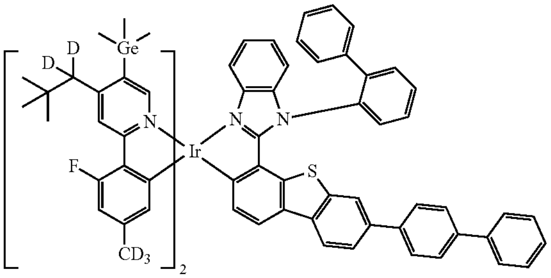
3186
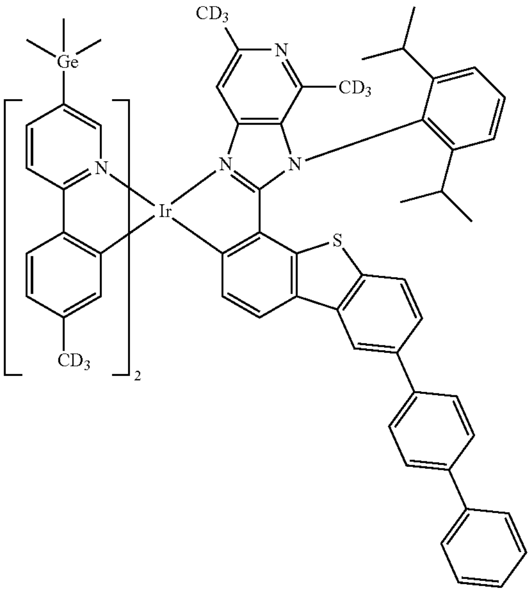
-continued
3187
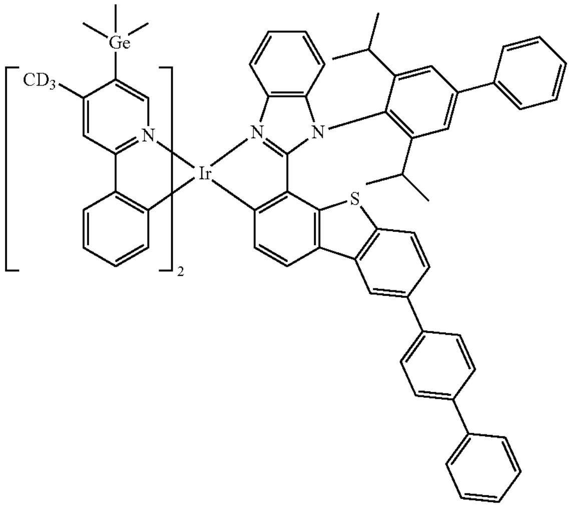
3188
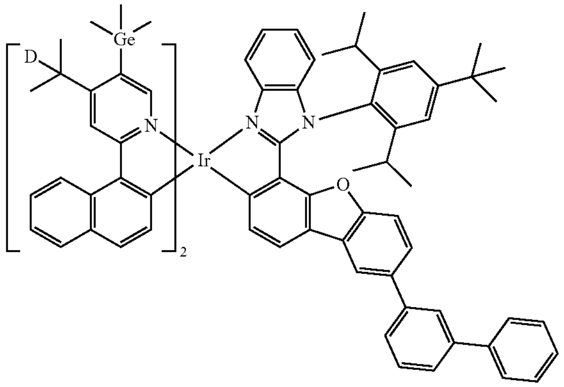
3189
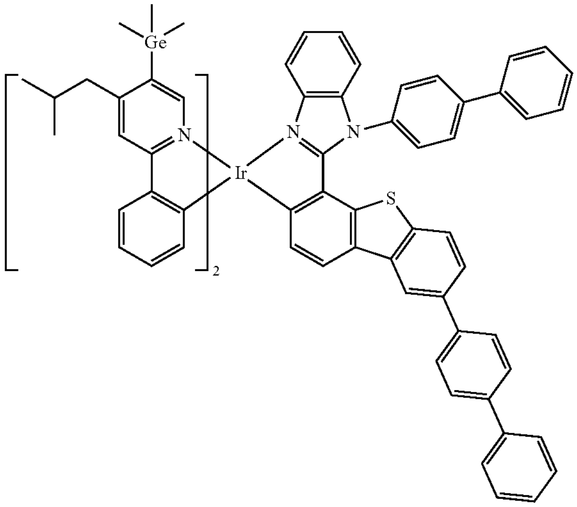

-continued
3190
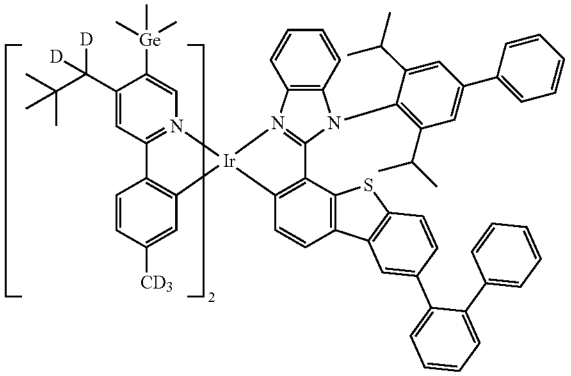
3191
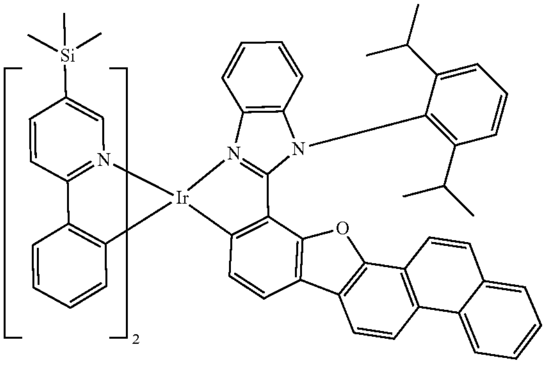
3192
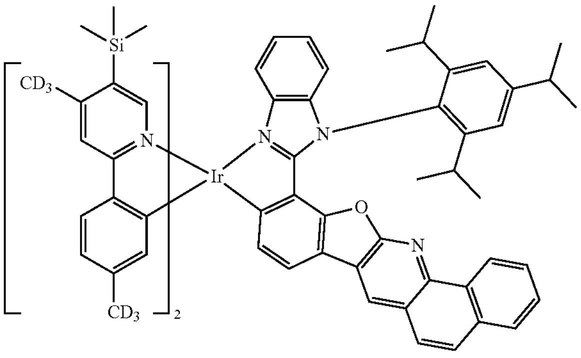
3193
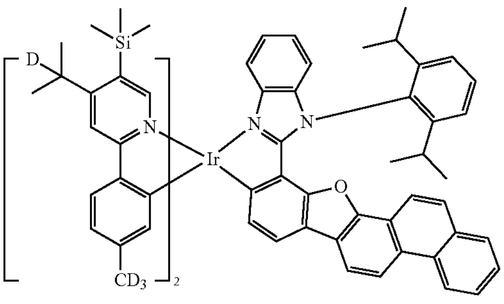
-continued
3194
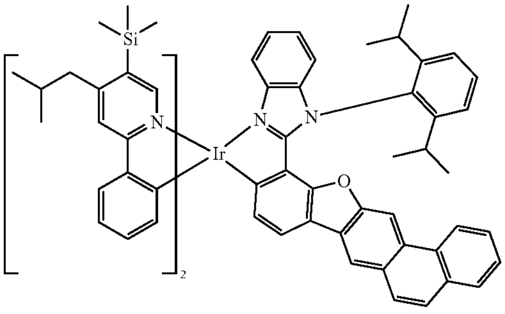
3195
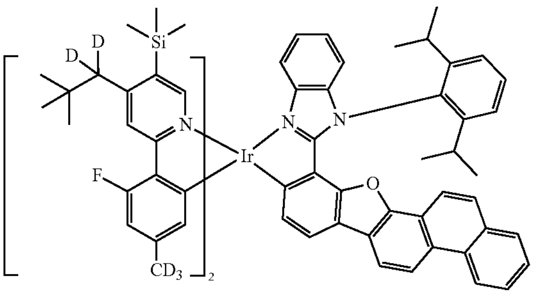
3196
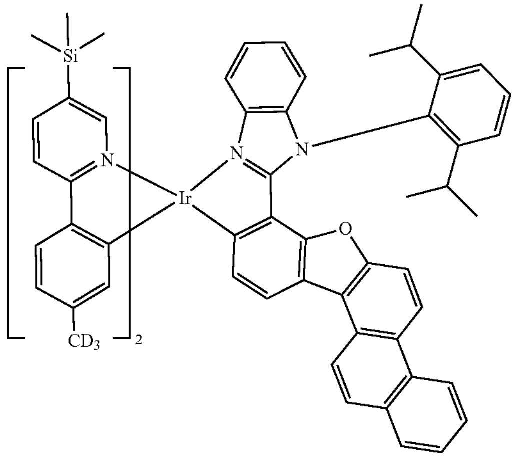
3197
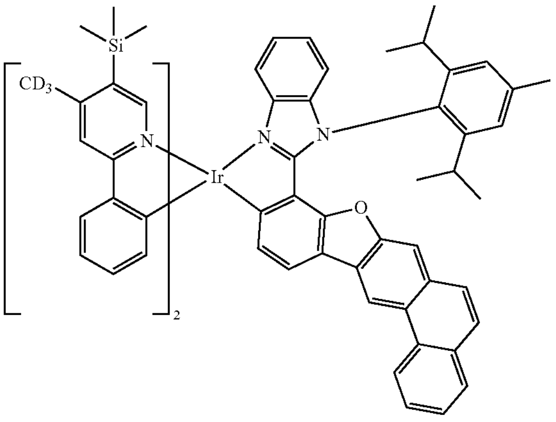

-continued
3198
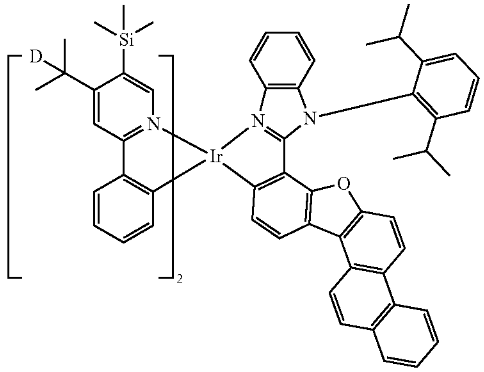
3199
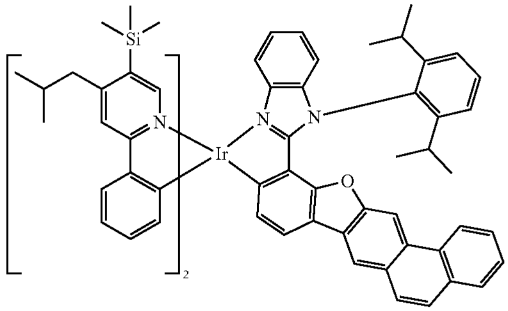
3200
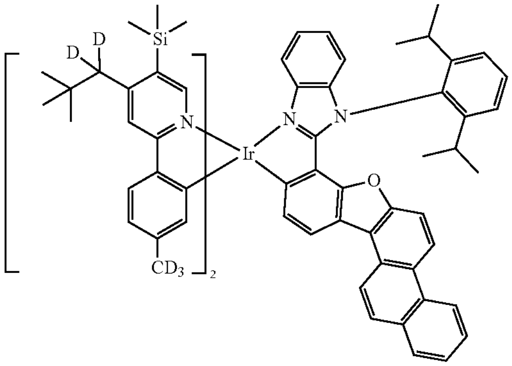
3201
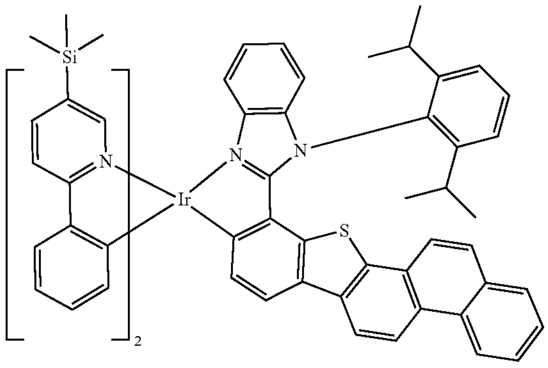
-continued
3202
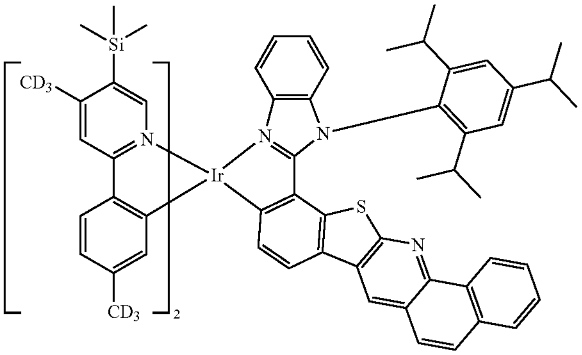
3203
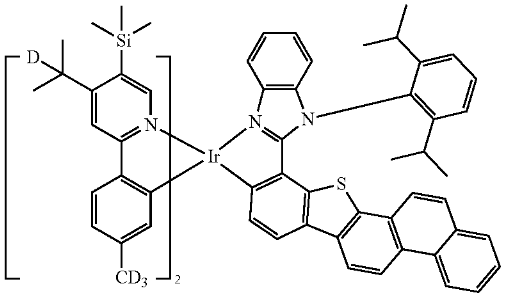
3204
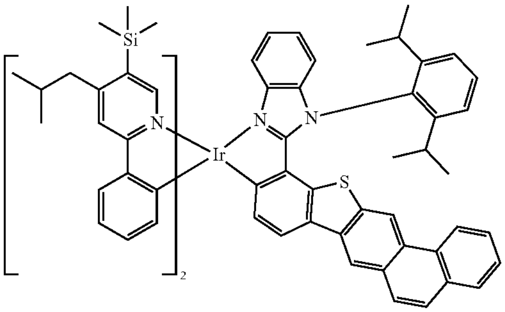
3205
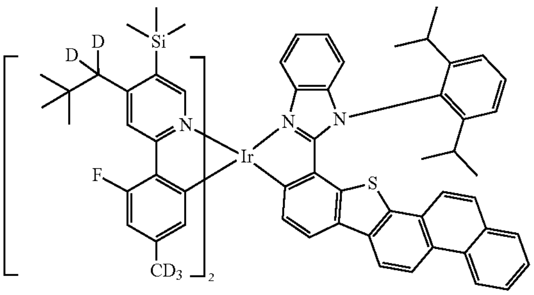

-continued
3206
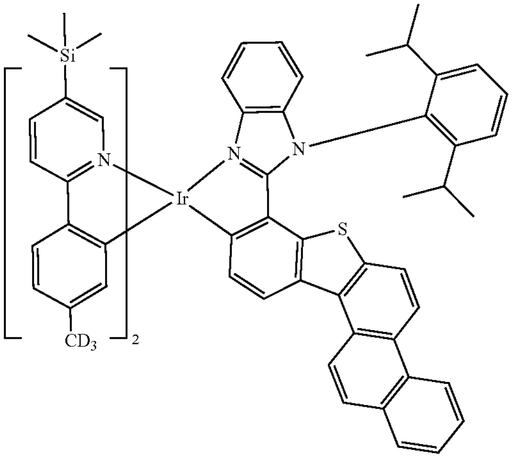
3207
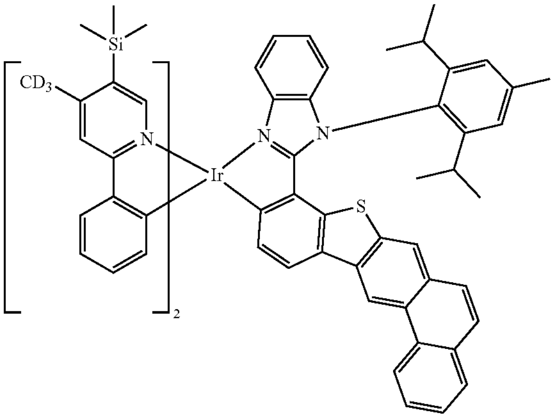
3208
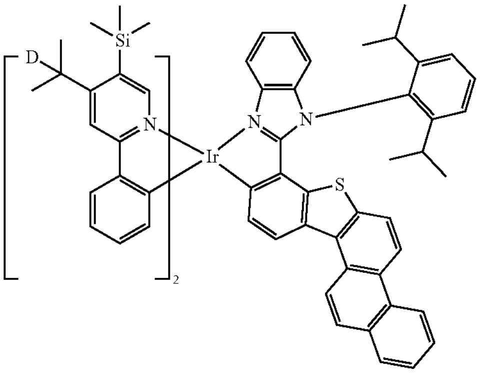
-continued
3211
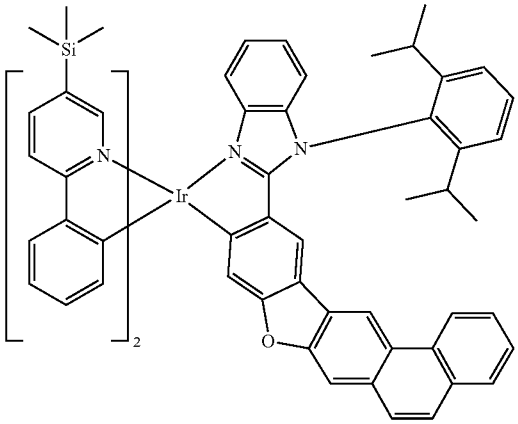
3212
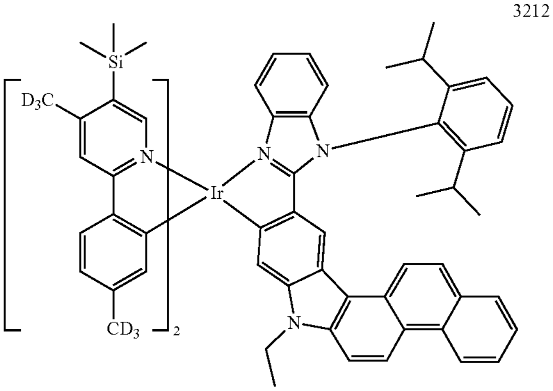
3213
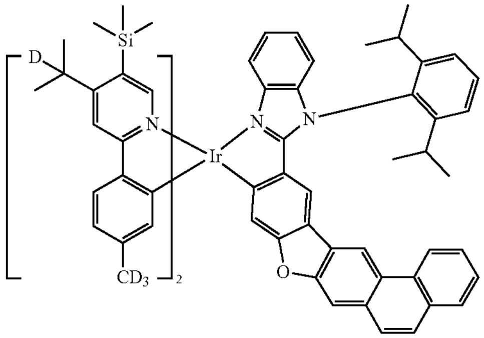
3214
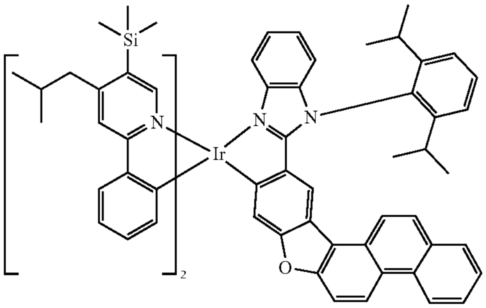

-continued
3215
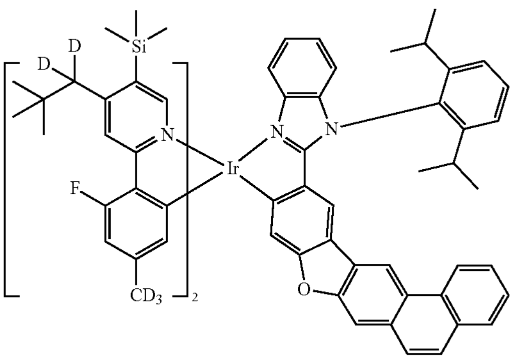
3216
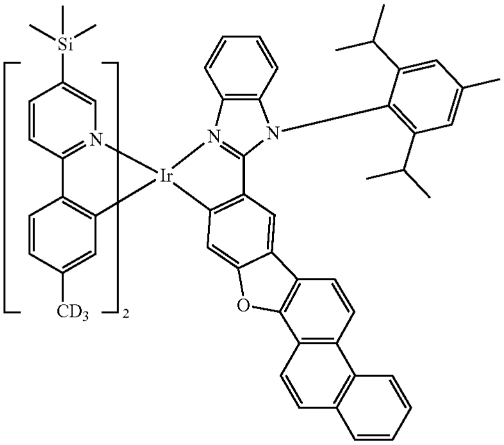
3217
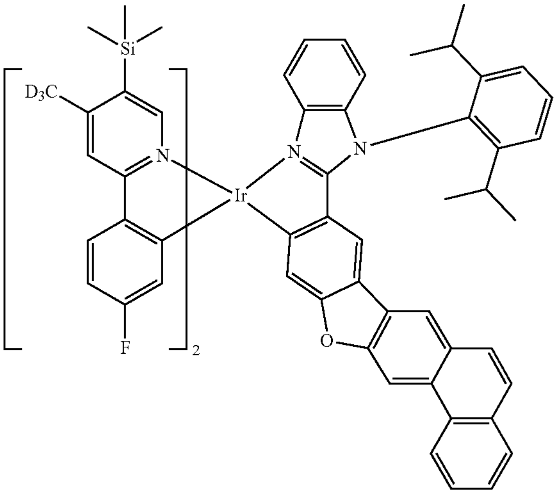
-continued
3218
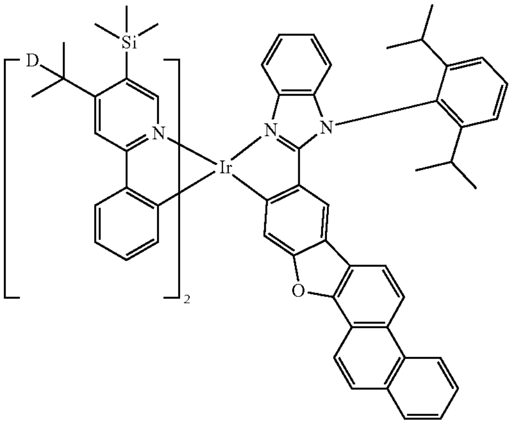
3219
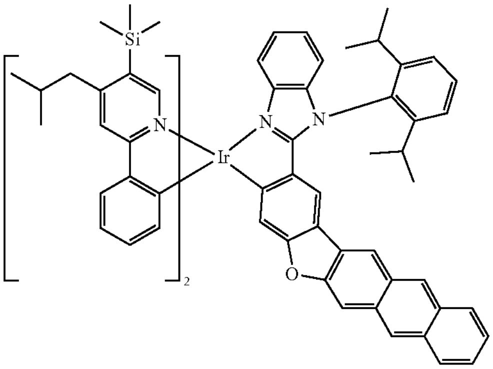
3220
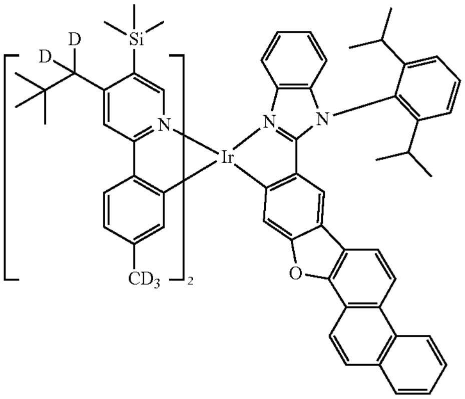

-continued
3221
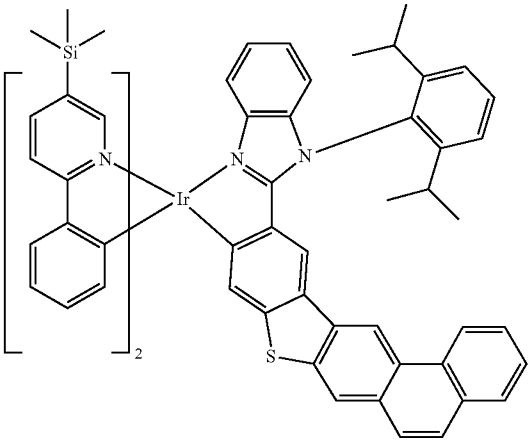
3222
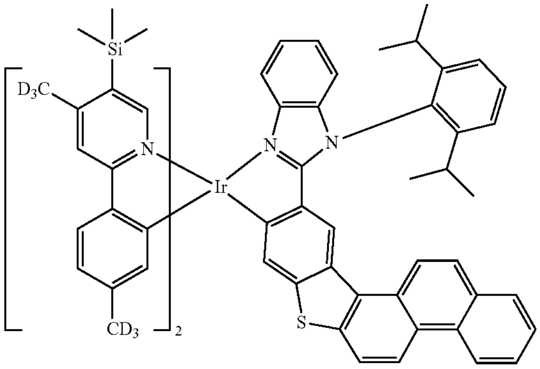
3223
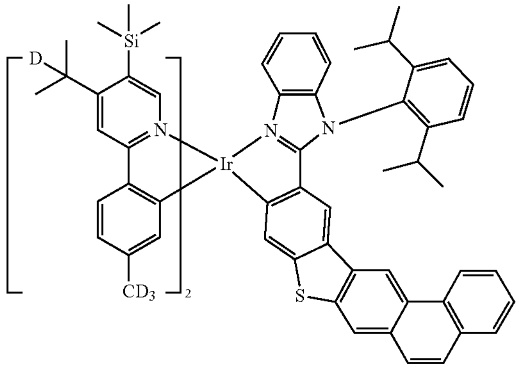
3224
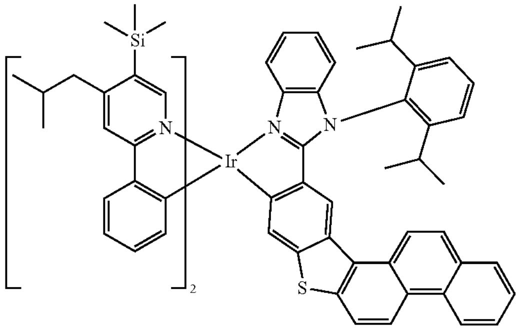
-continued
3225
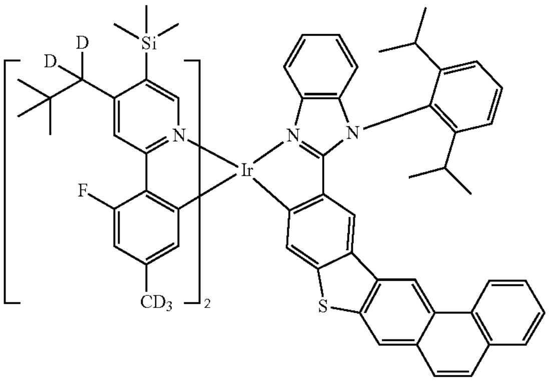
3226
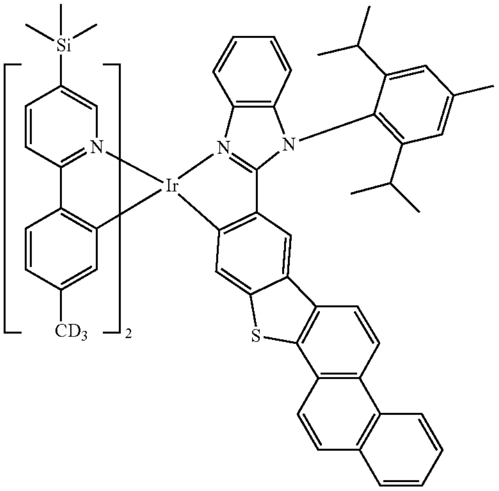
3227
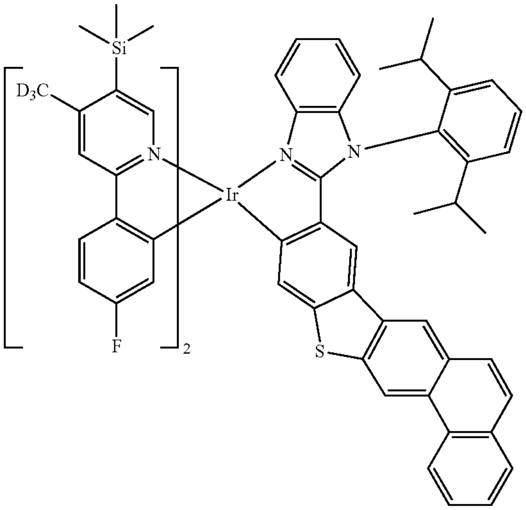

-continued
3228
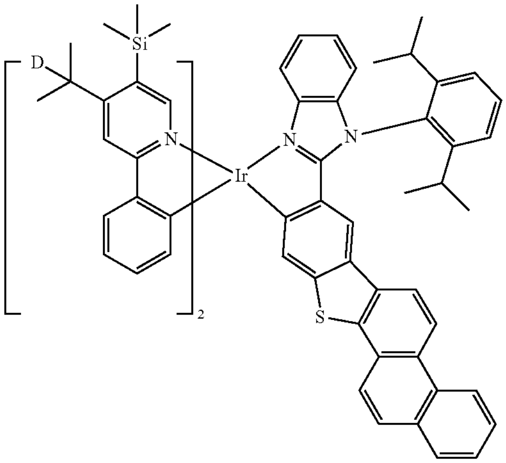
3229
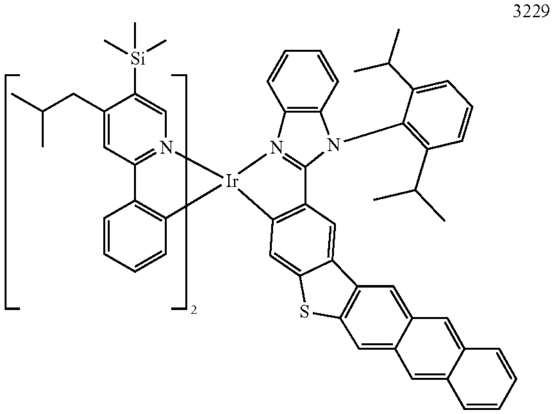
3230
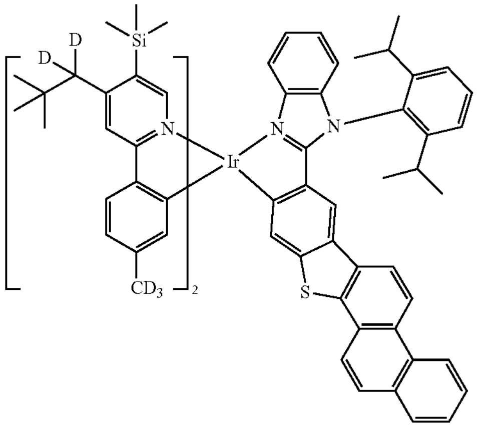
-continued
3231
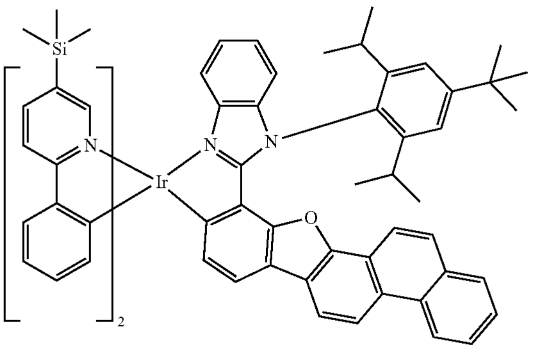
3232
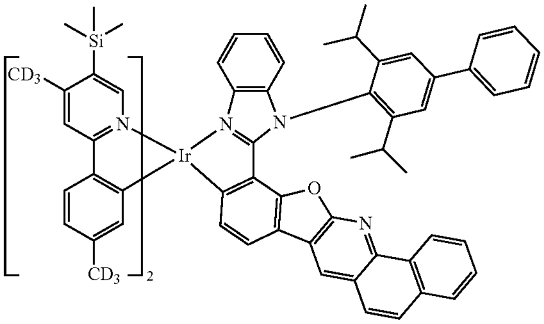
3233
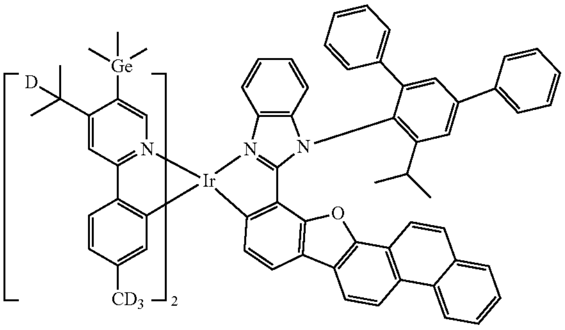
3234
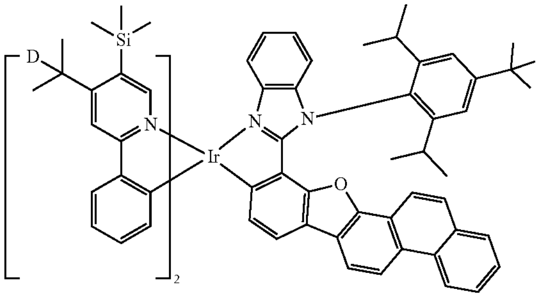

-continued
3235
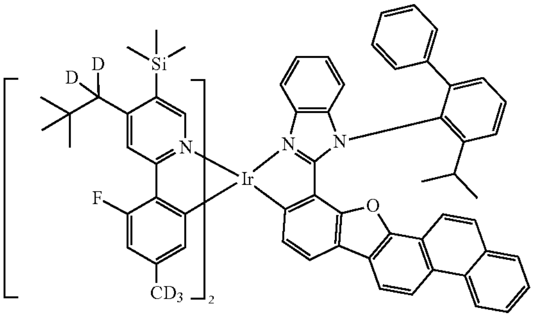
3236
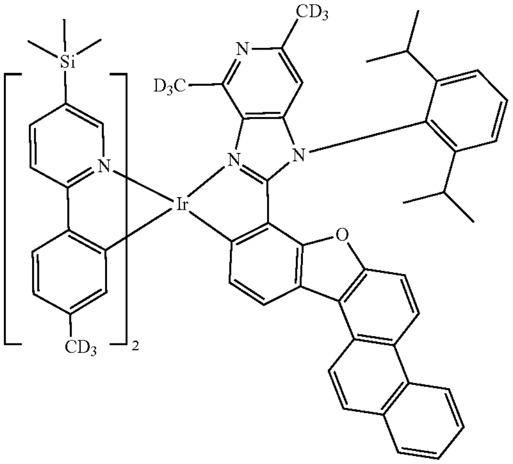
3237
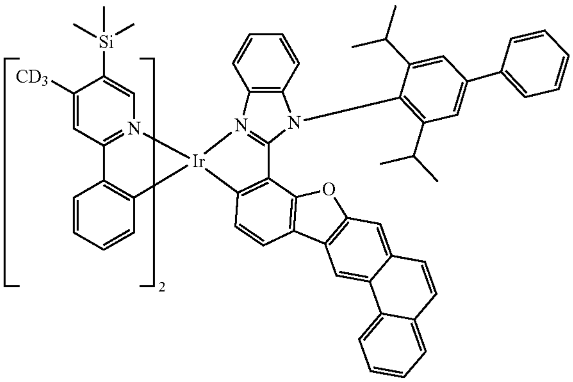
3238
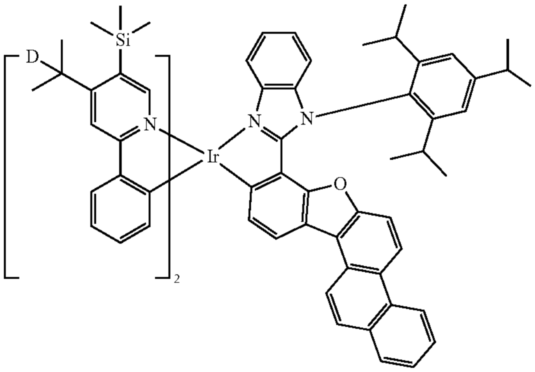
-continued
3239
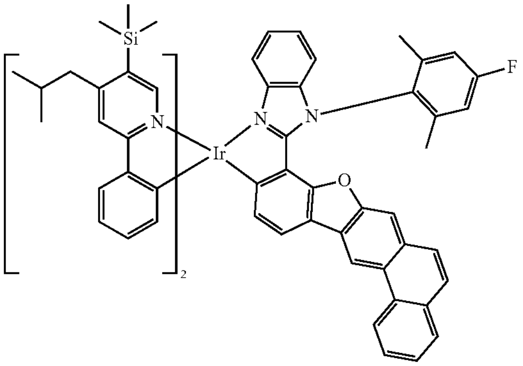
3240
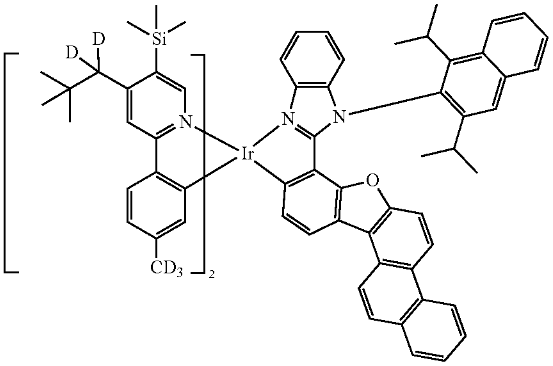
3241
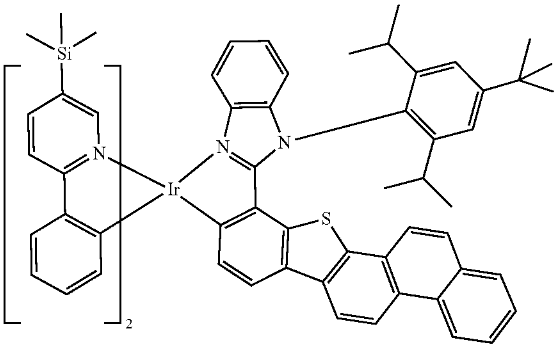
3242
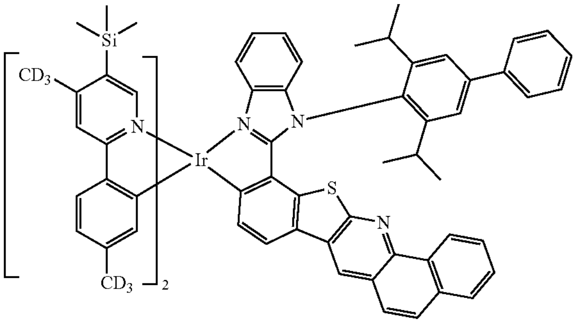

-continued
3243
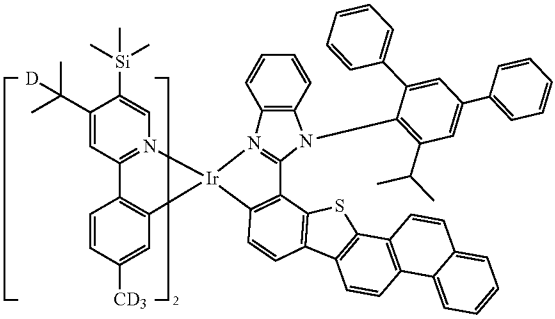
3244
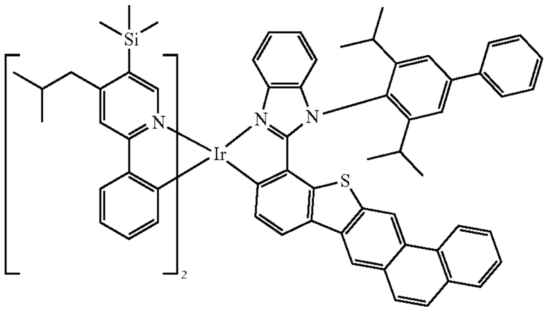
3245
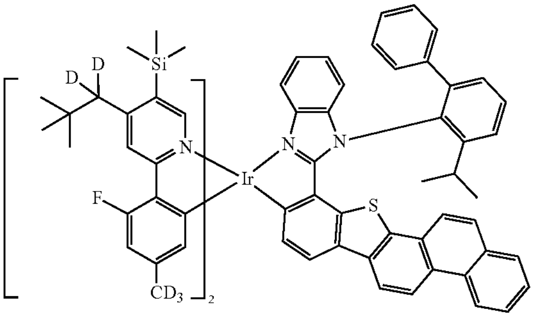
3246
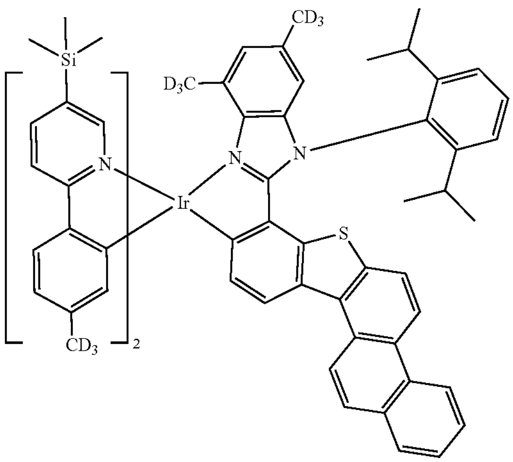
-continued
3247
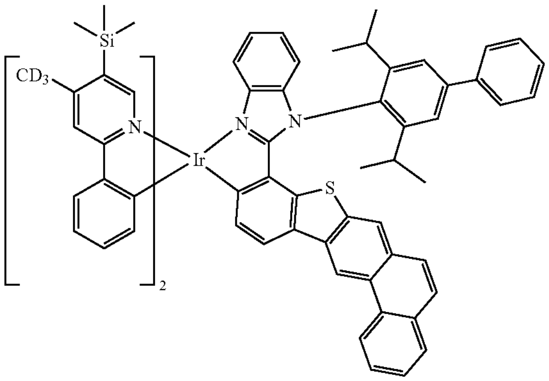
3248
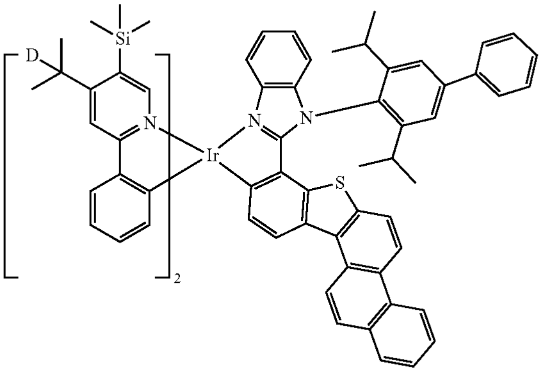
3249
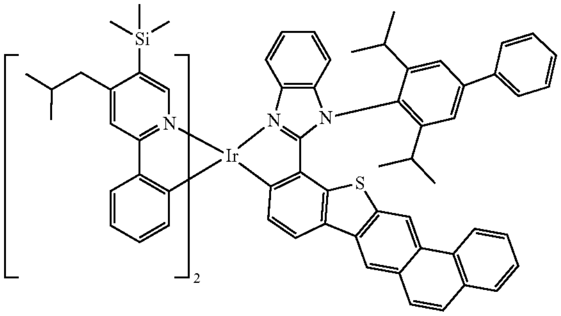
3250
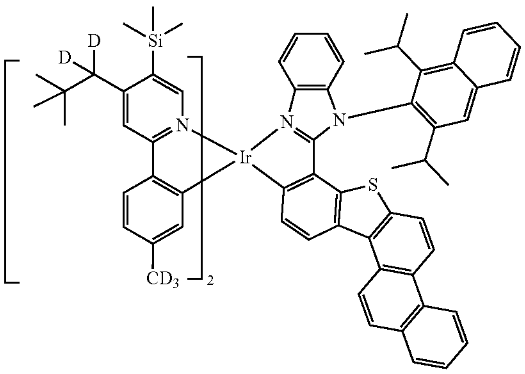

-continued
3251
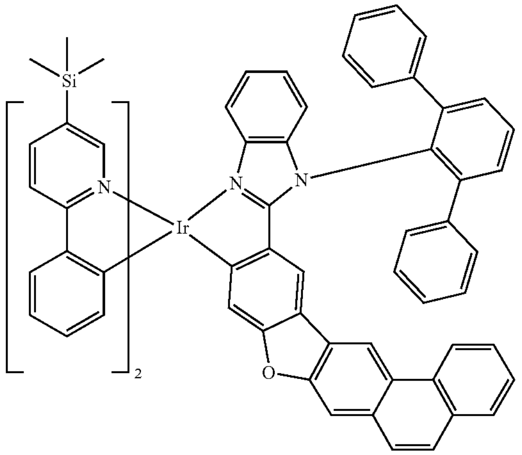
3252
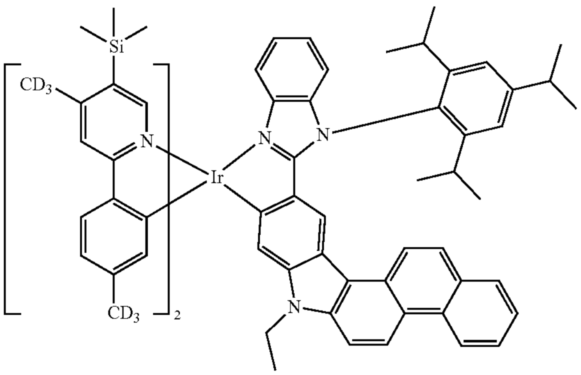
3253
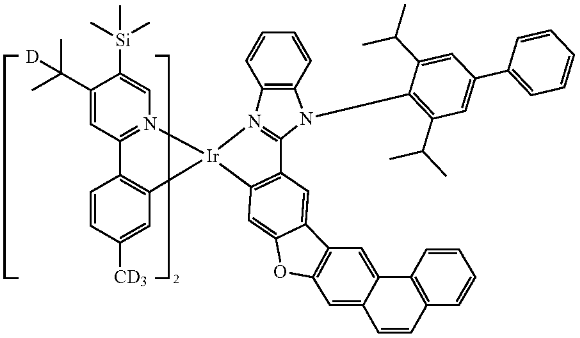
3254
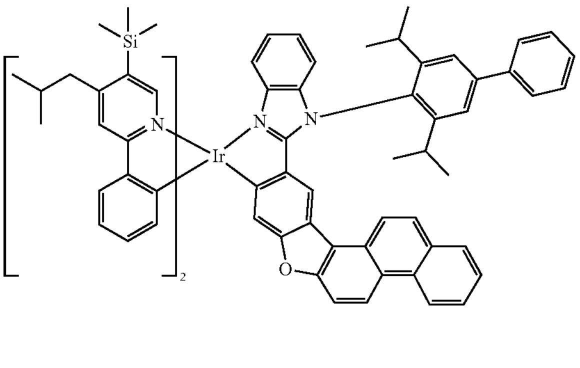
-continued
3255
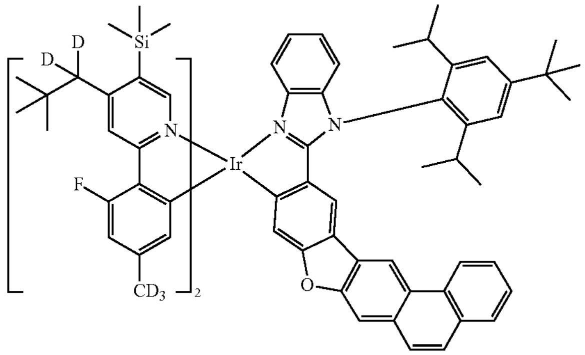
3256
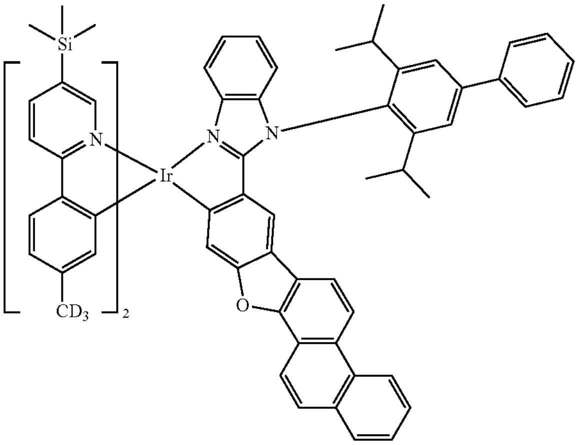
3257
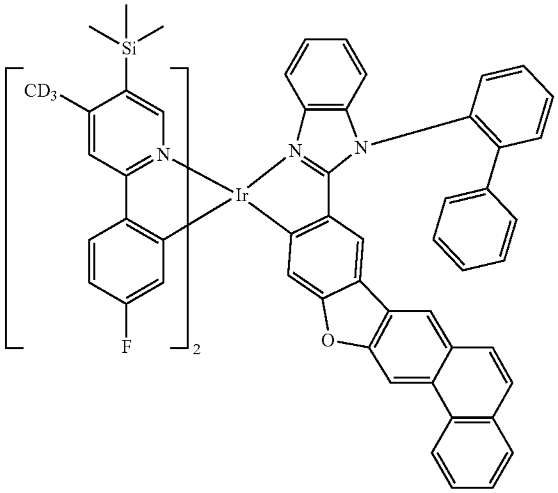

-continued
3258
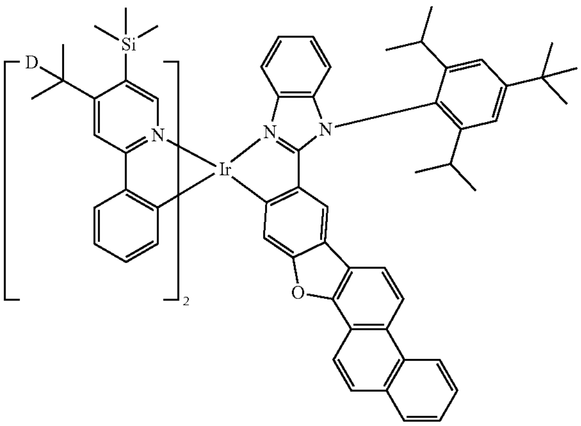
3259
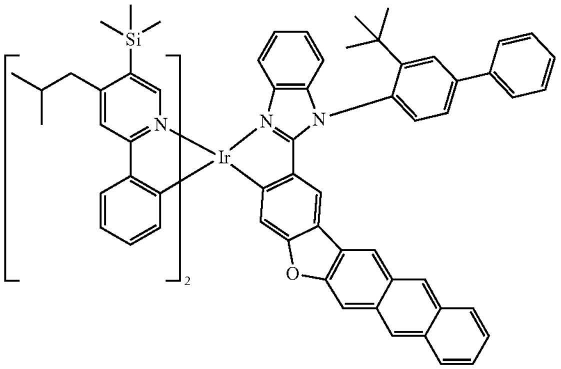
3260
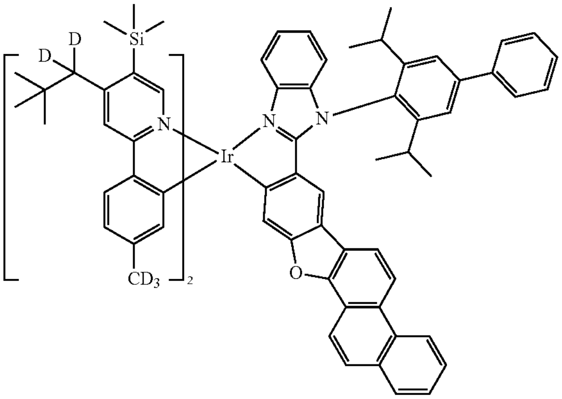
-continued
3261
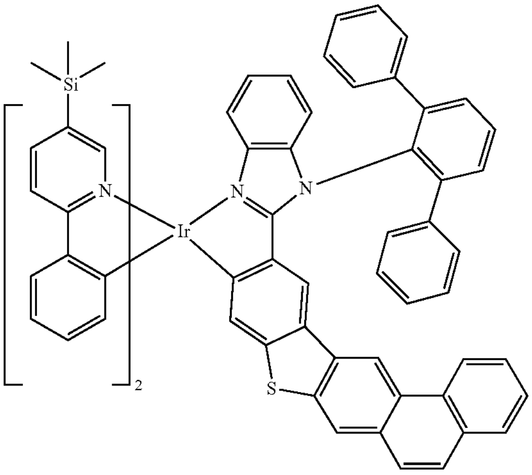
3262
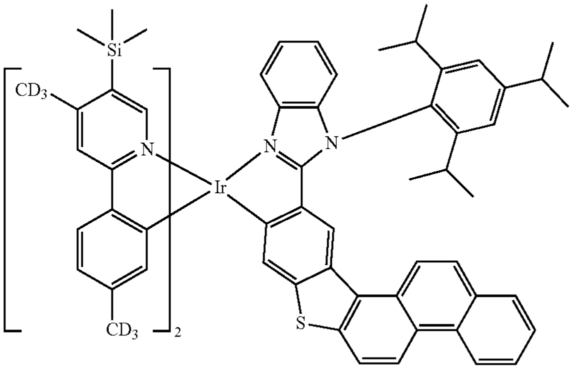
3263
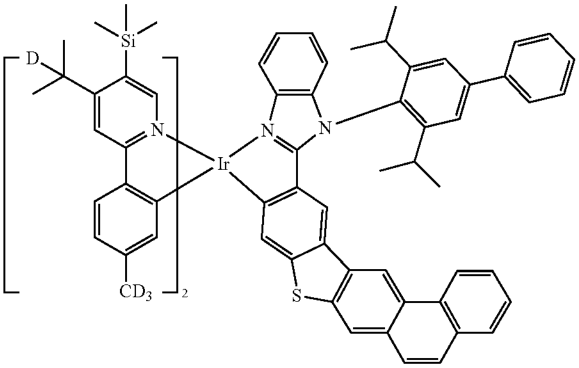
3264
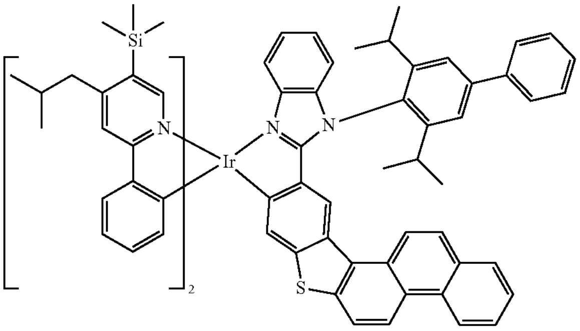

3265
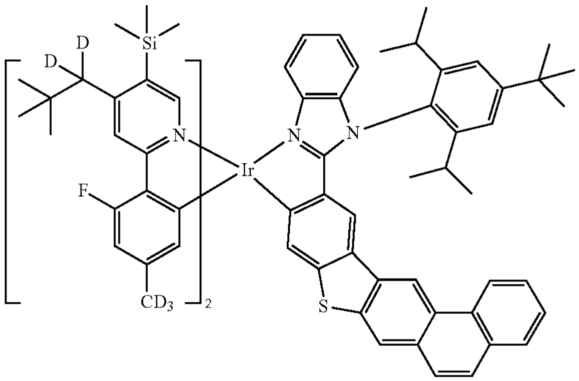
3266
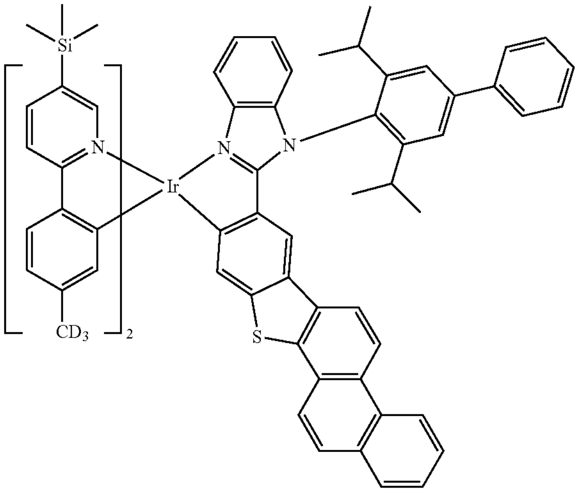
3267
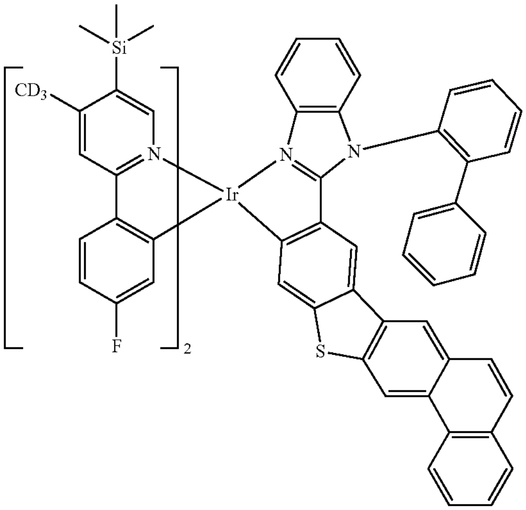
3268
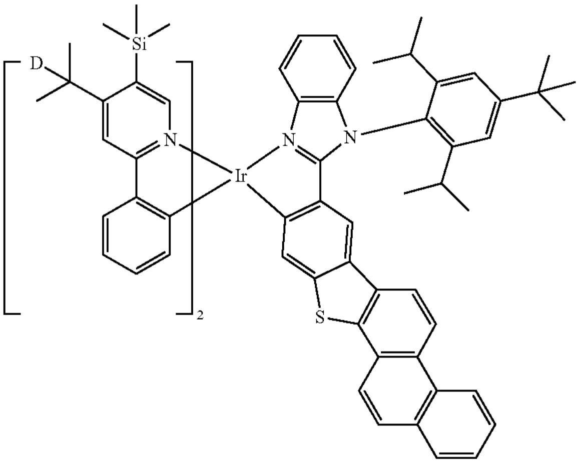
3269
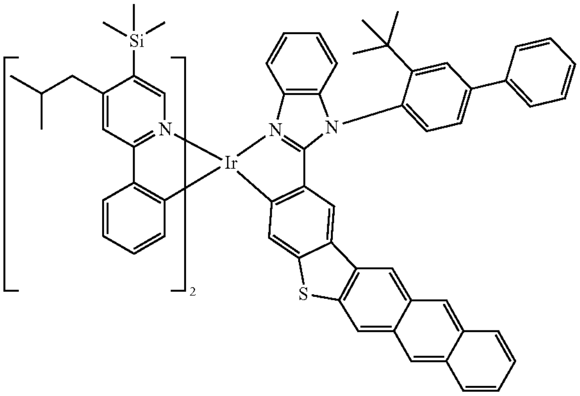
3270
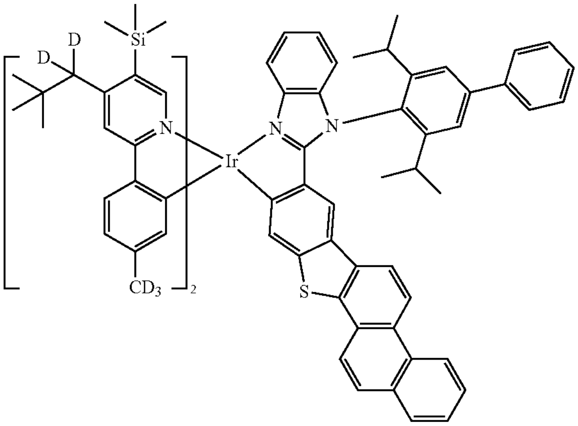

-continued
3271
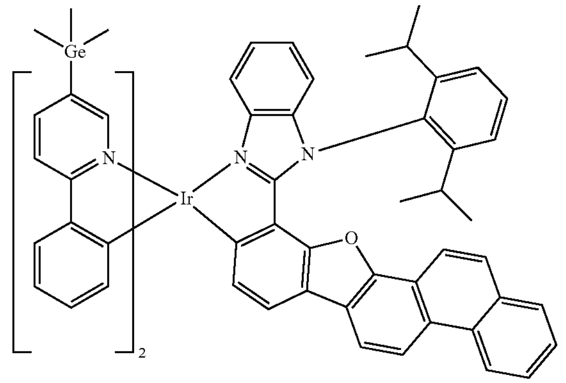
3272
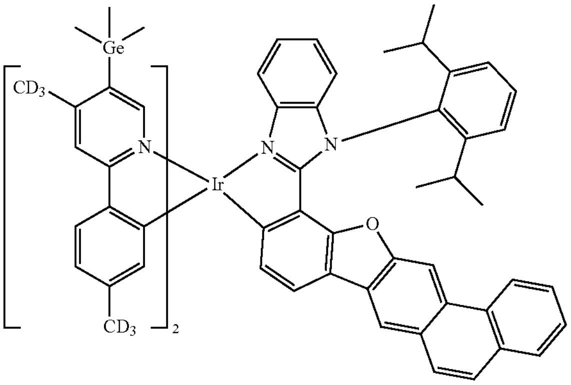
3273
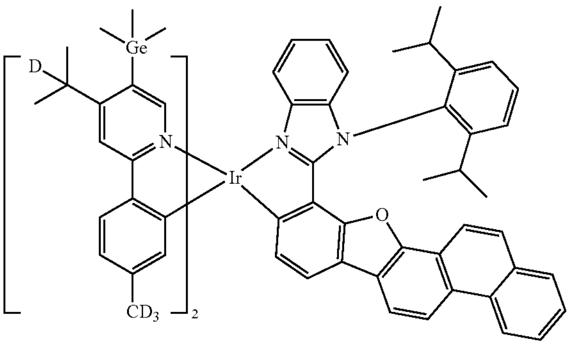
3274
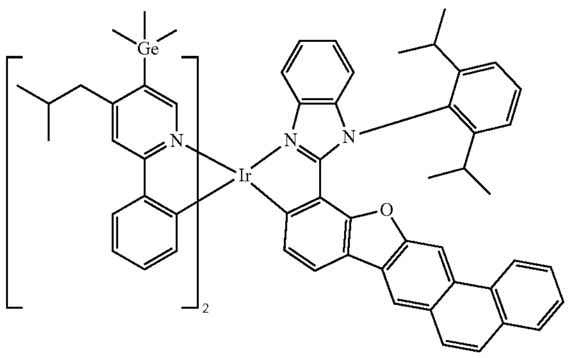
-continued
3275
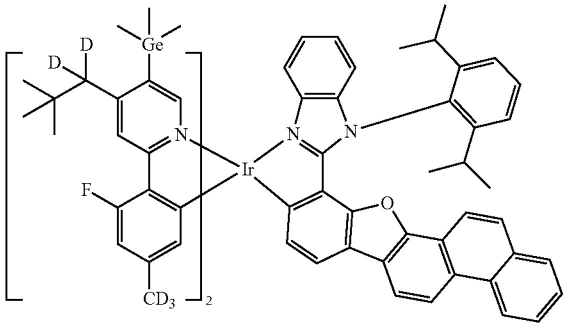
3276
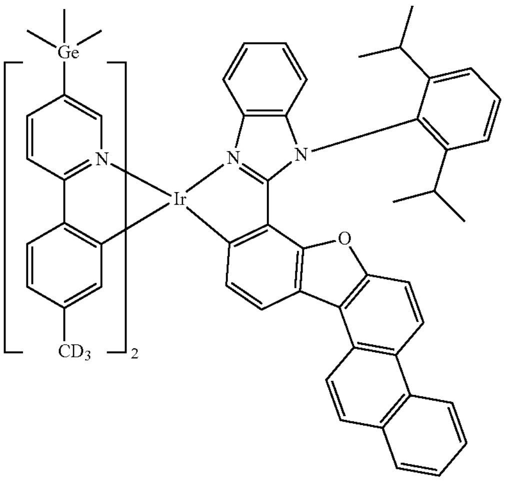
3277
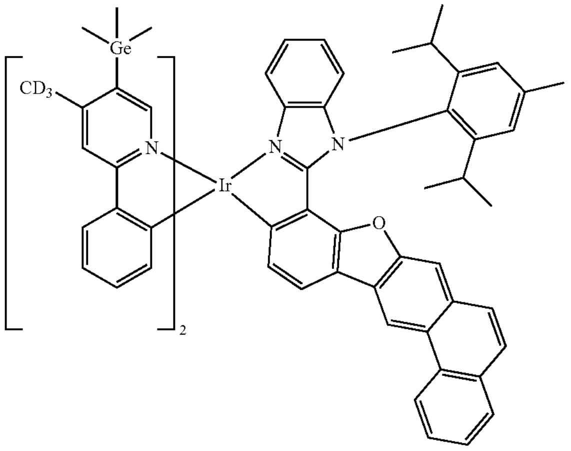

-continued
3278
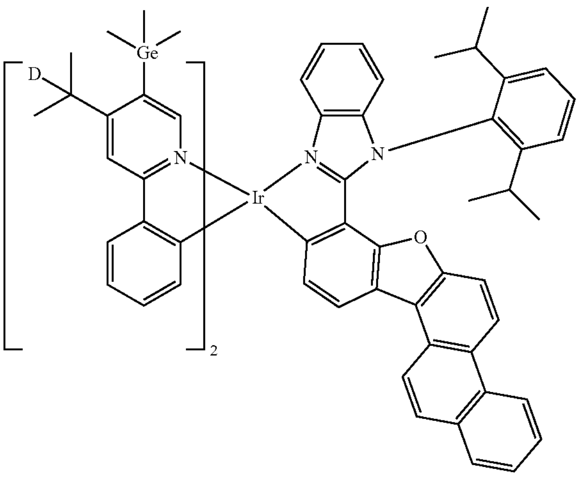
3279
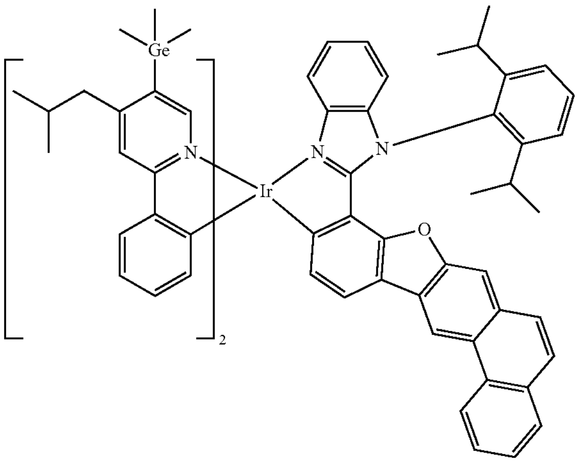
3280
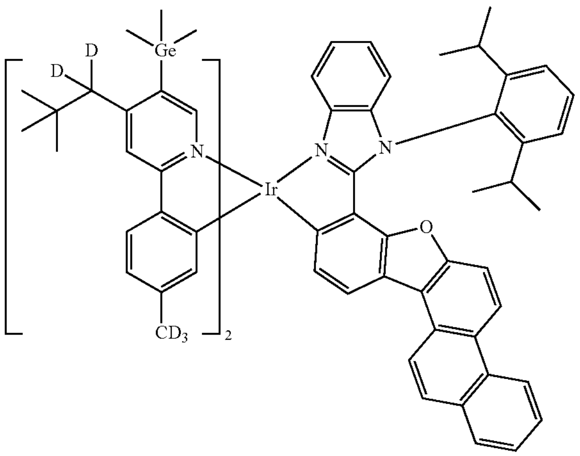
-continued
3281
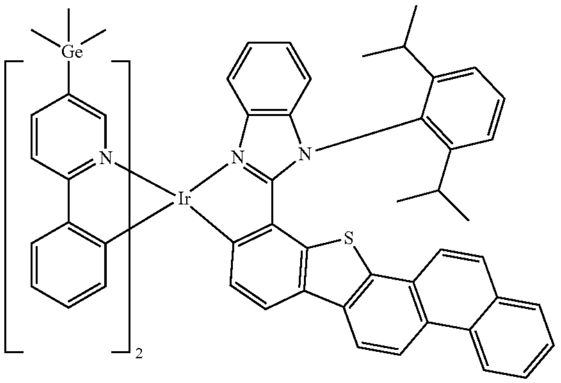
3282
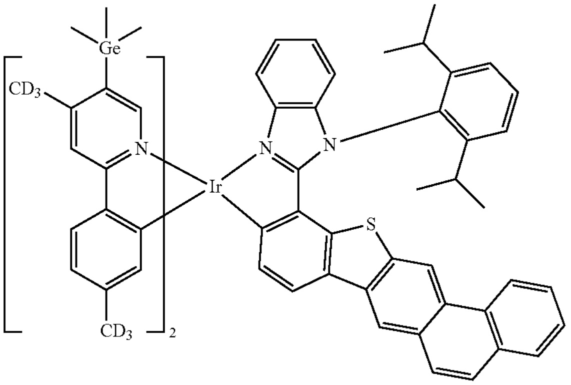
3283
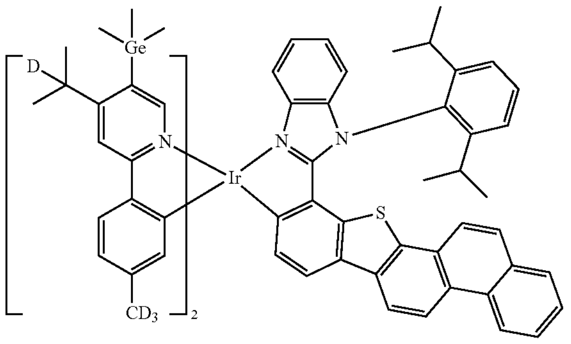
3284
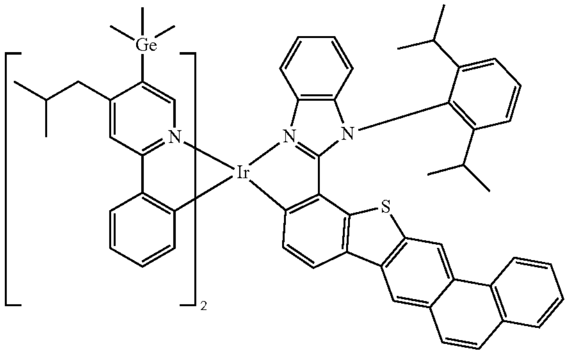

-continued
3285
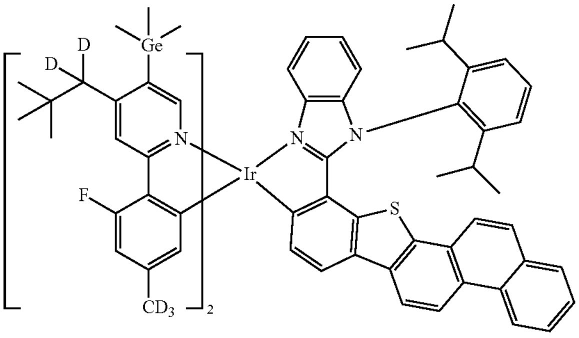
3286
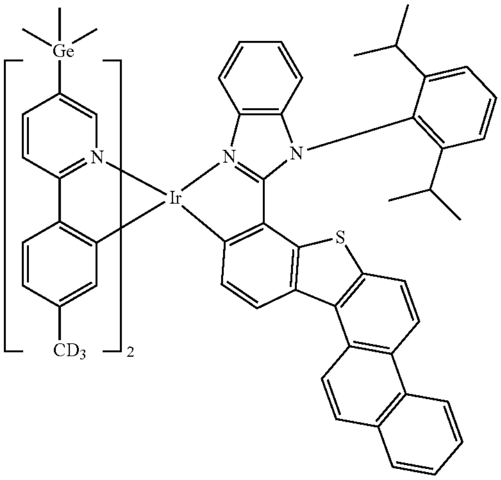
3287
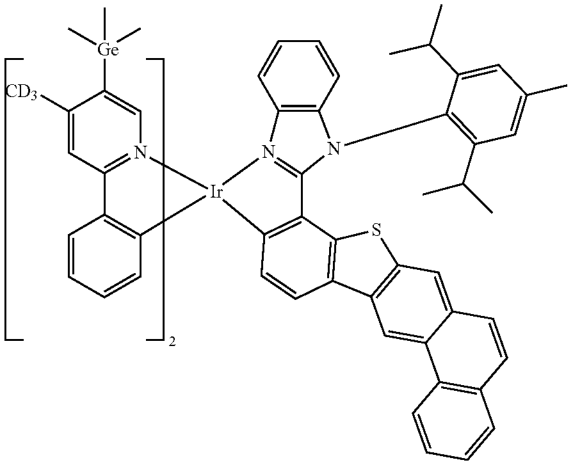
-continued
3288
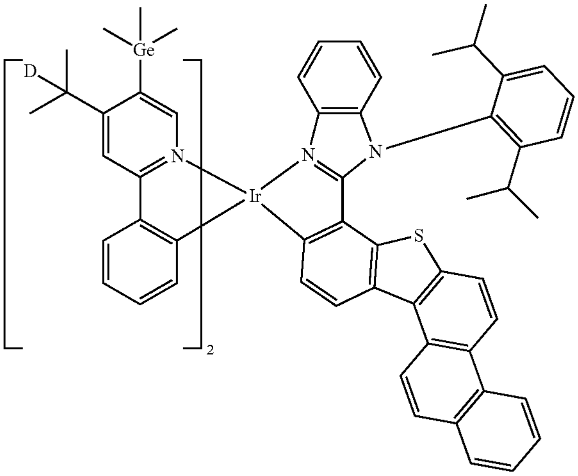
3289
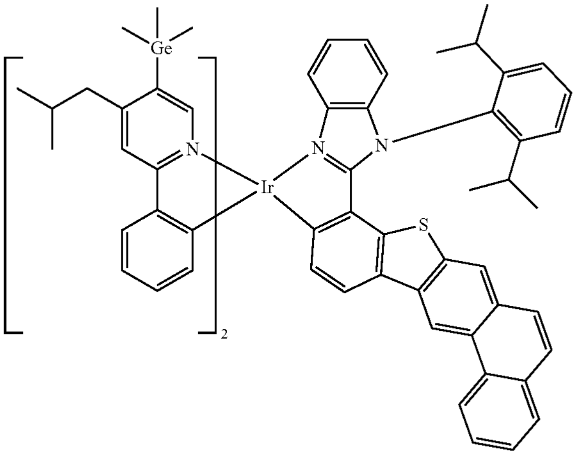
3290
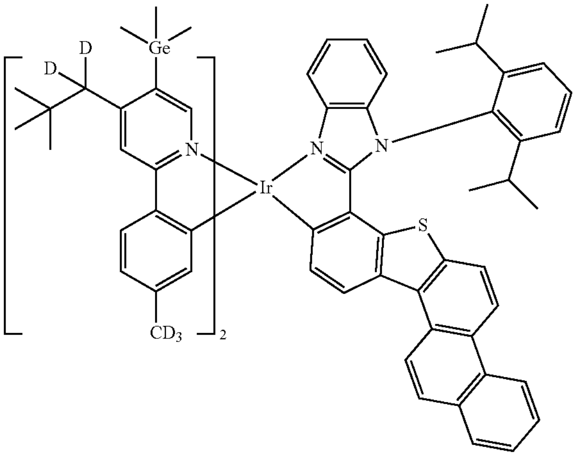

-continued
3291
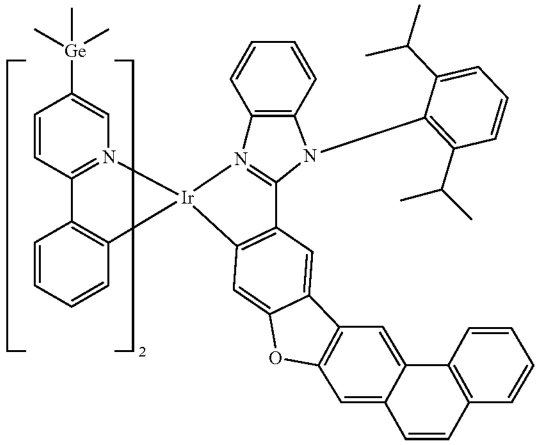
3292
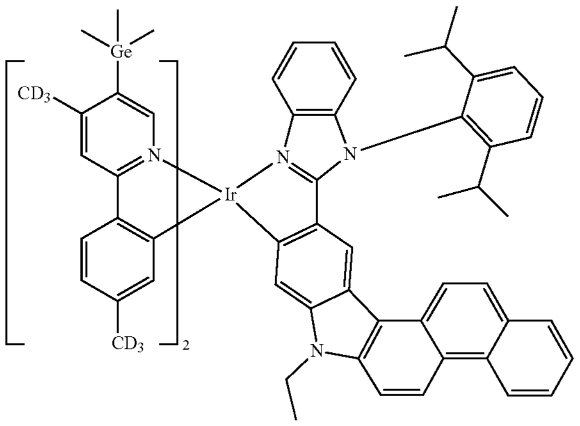
3293
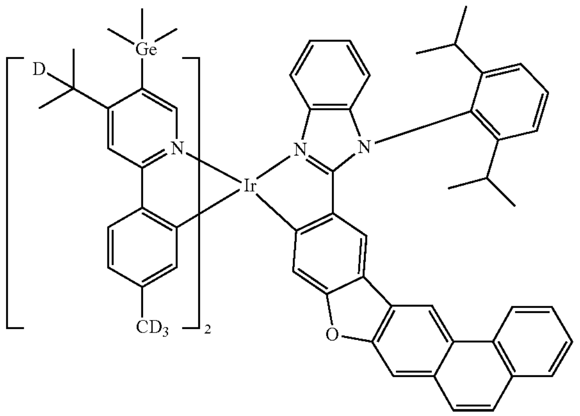
-continued
3294
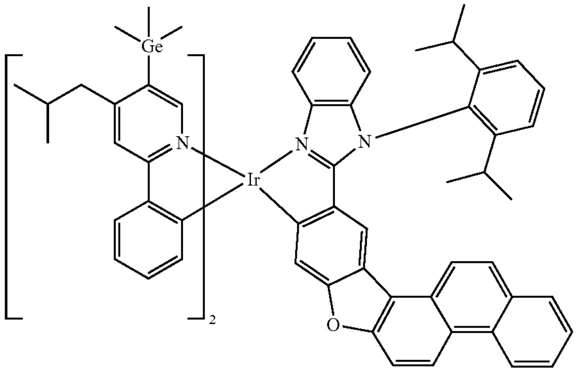
3295
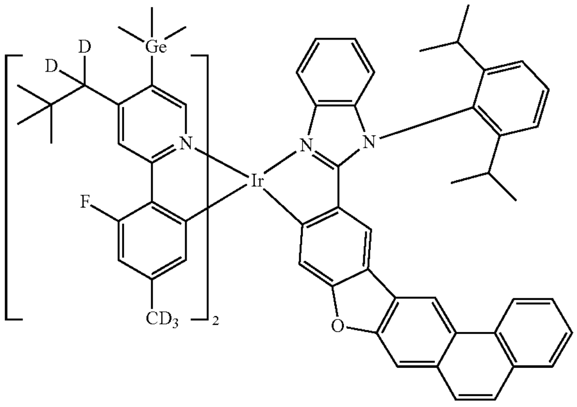
3296
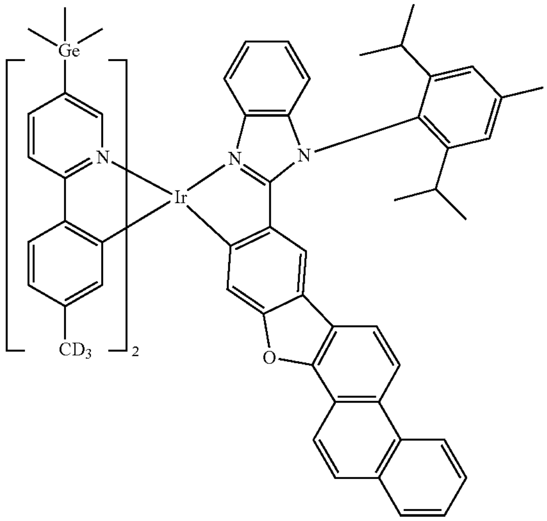

-continued
3297
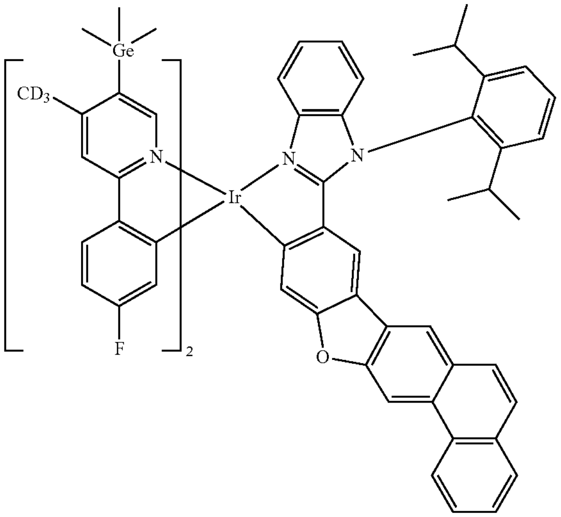
3298
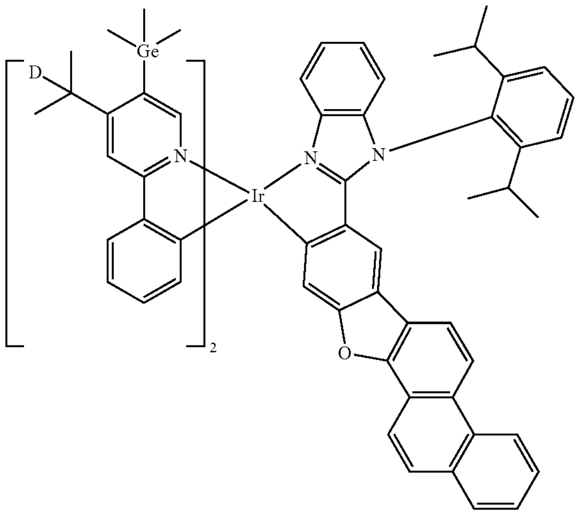
3299
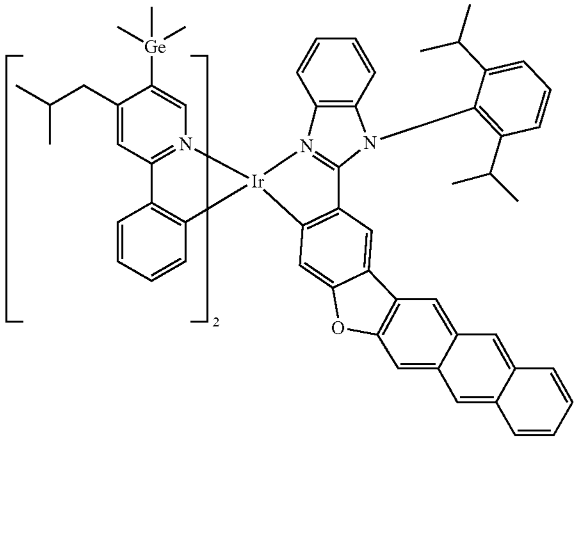
-continued
3300
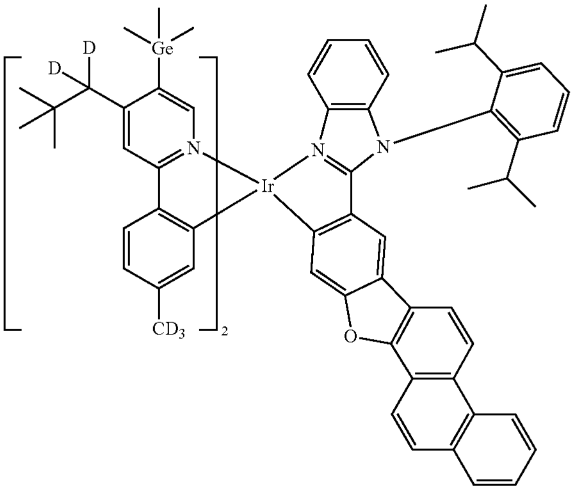
3301
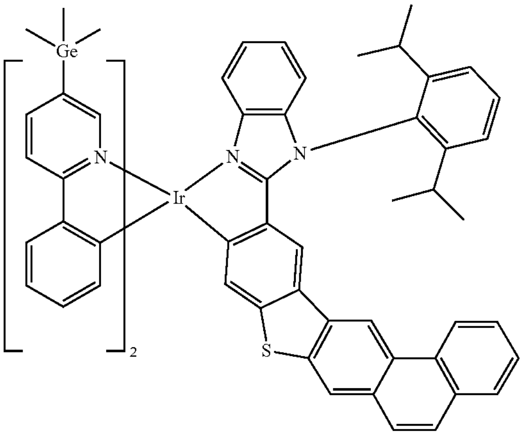
3302
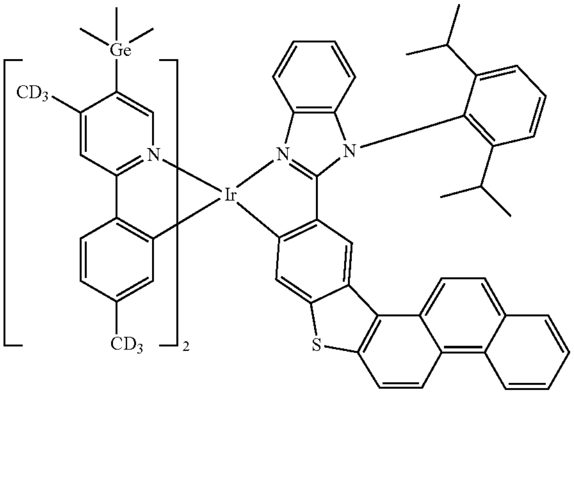

-continued
3303
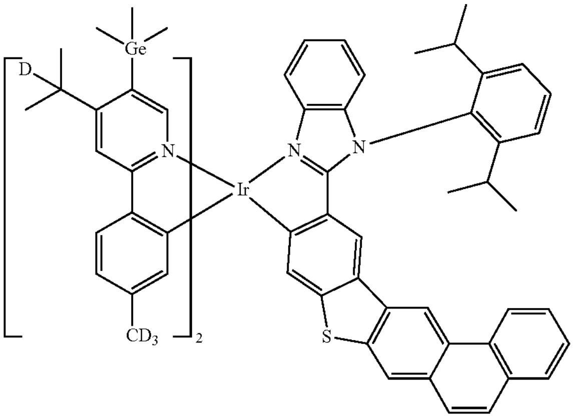
3304
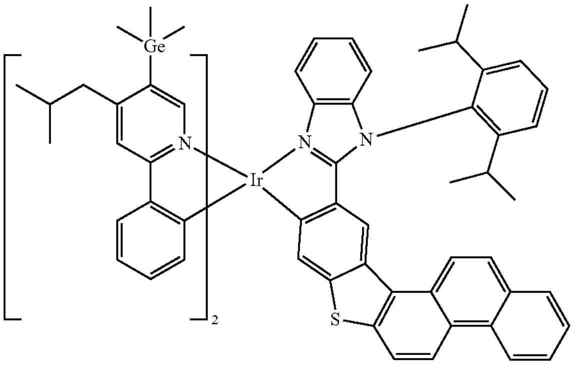
3305
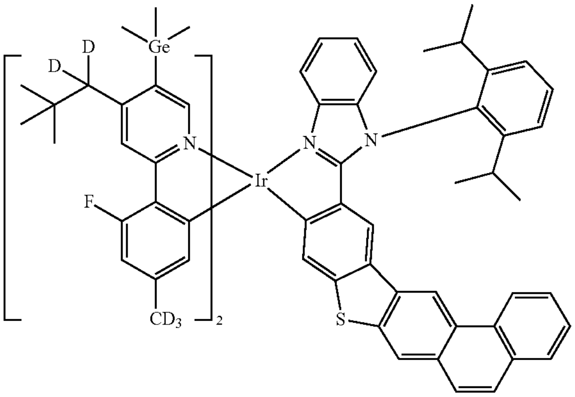
-continued
3306
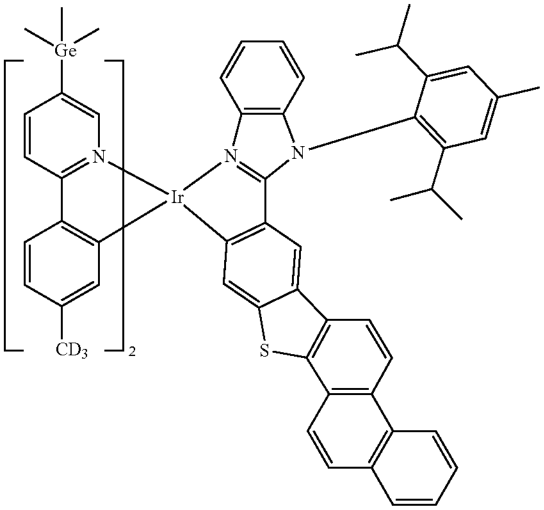
3307
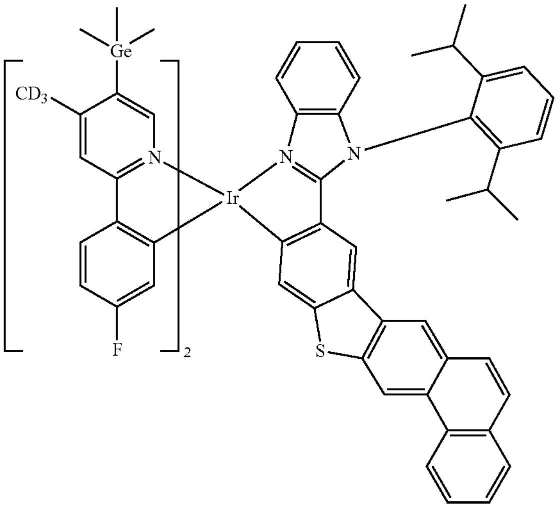
3308
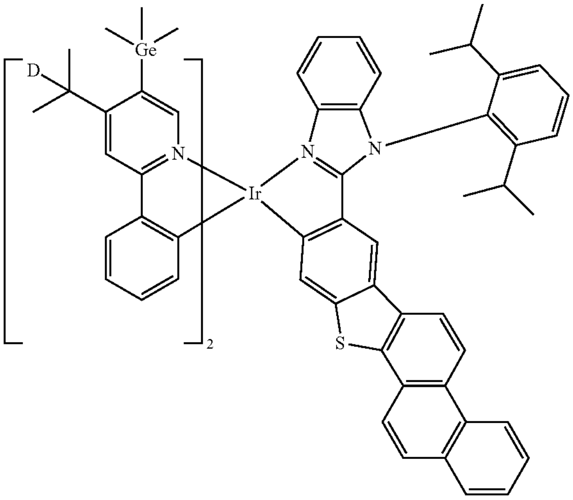

-continued
3309
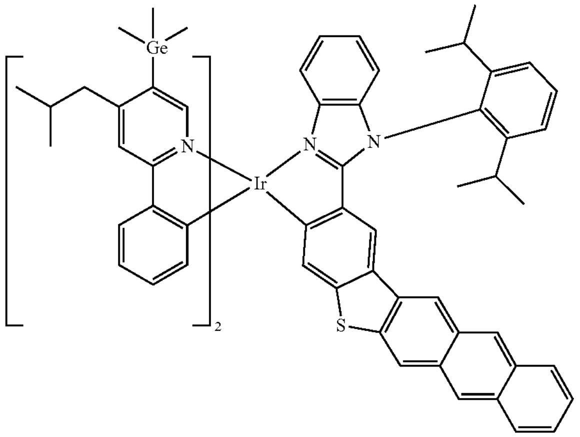
3310
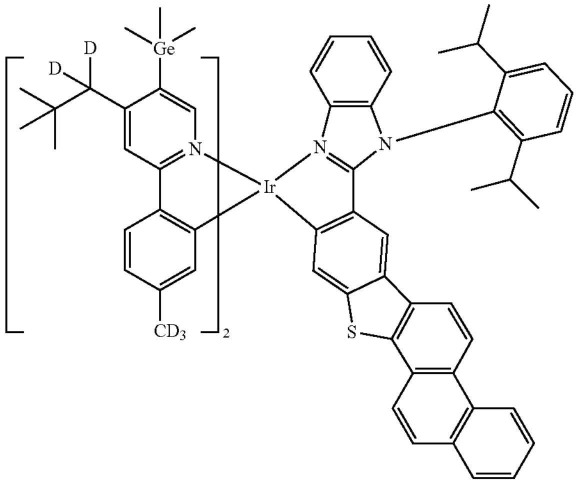
3311
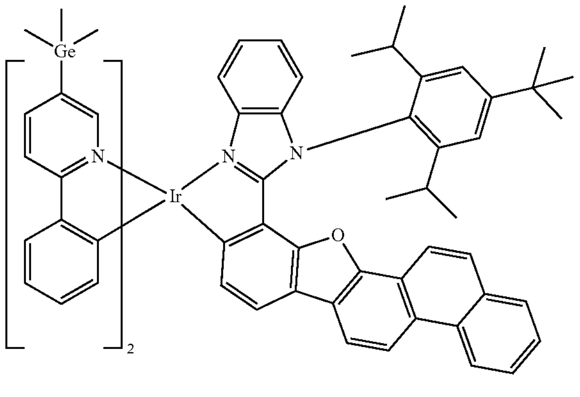
-continued
3312
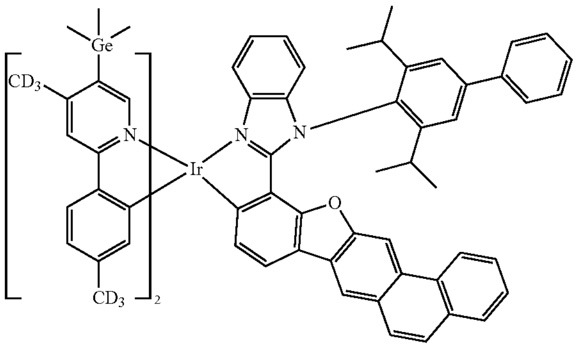
3313
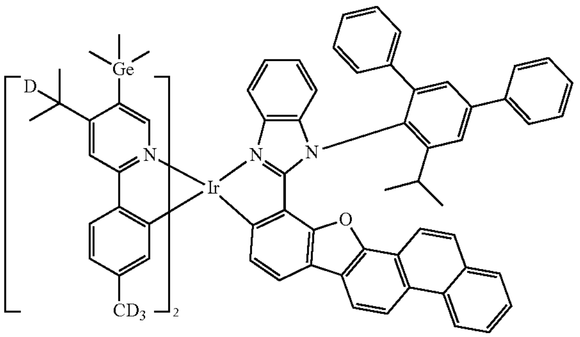
3314
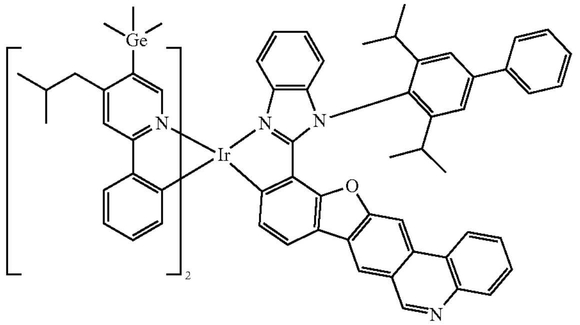
3315
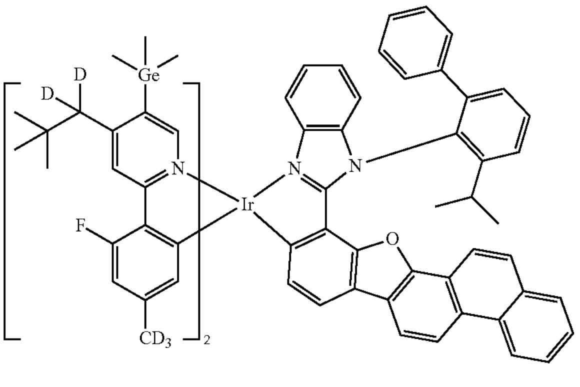

-continued
3316
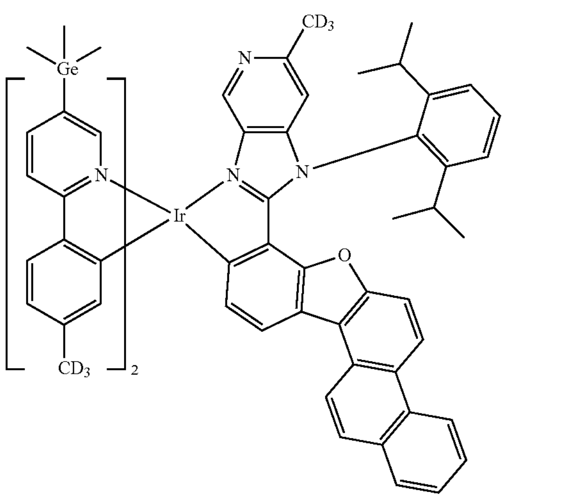
3317
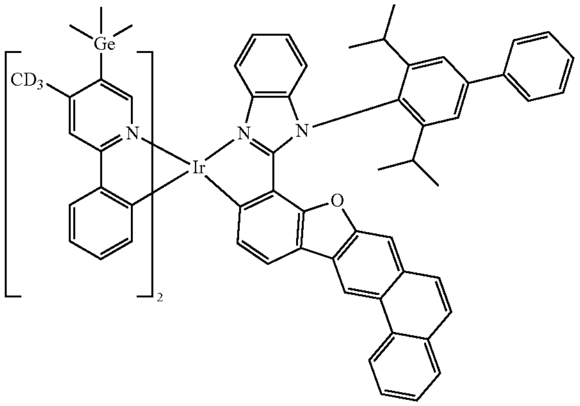
3318
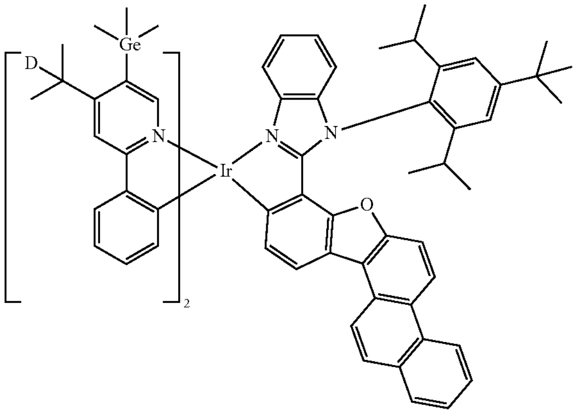
-continued
3319
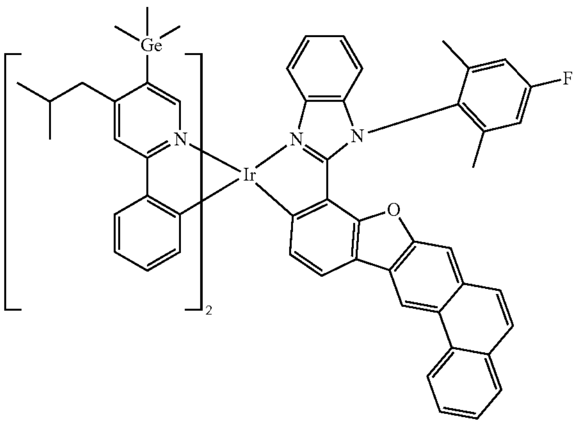
3320
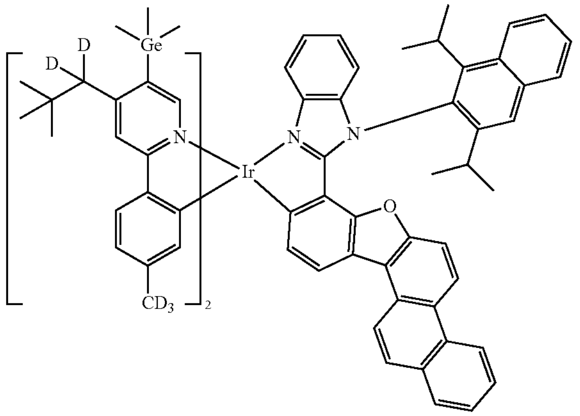
3321
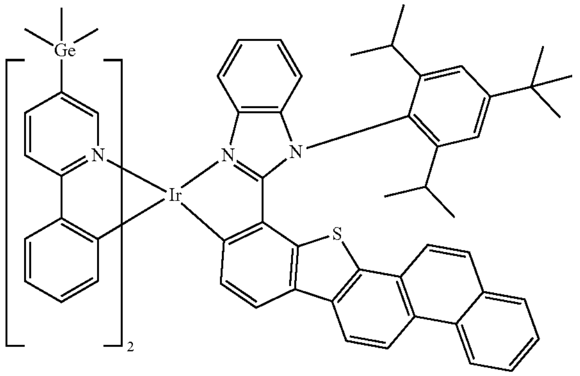
3322
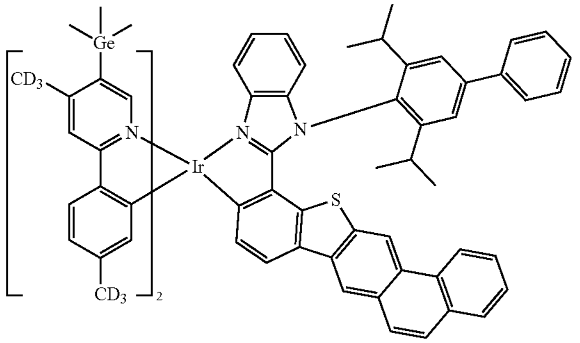

-continued
3323
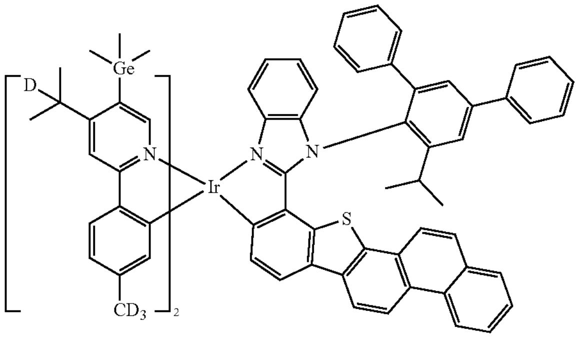
3324
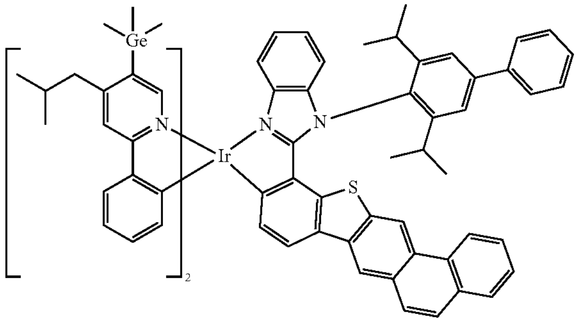
3325
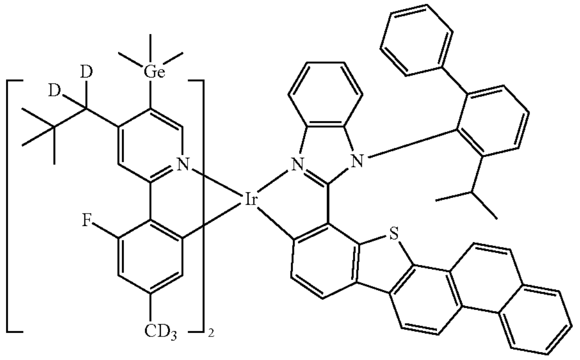
3326
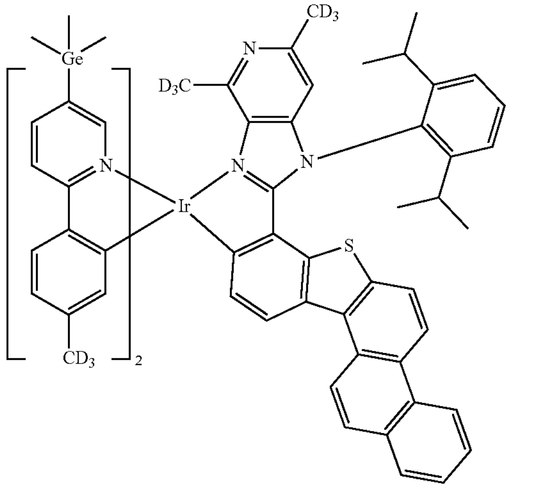
-continued
3327
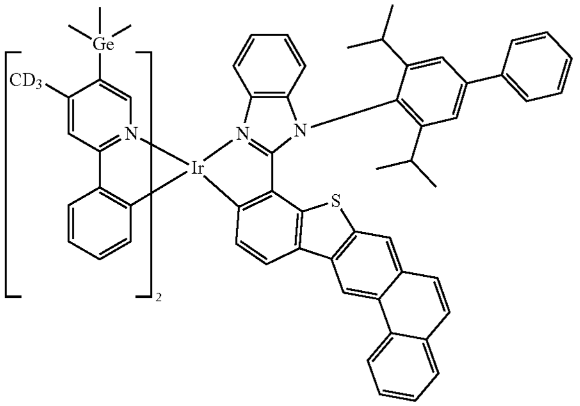
3328
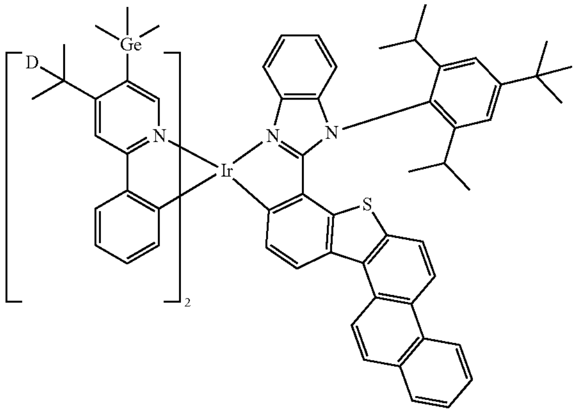
3329
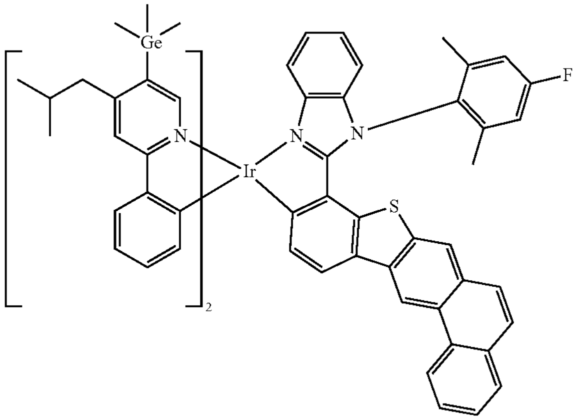

-continued
3330
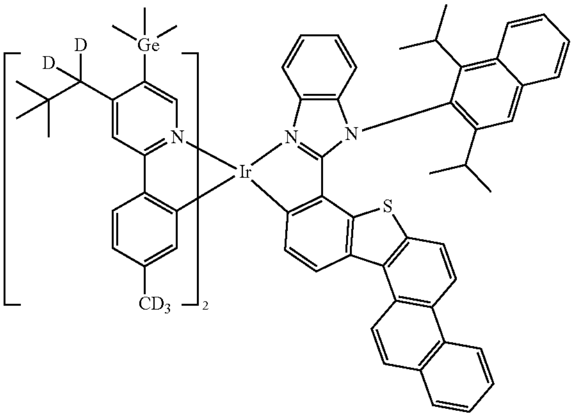
3331
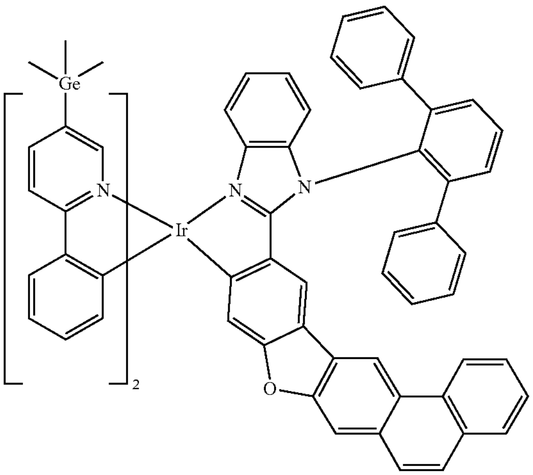
3332
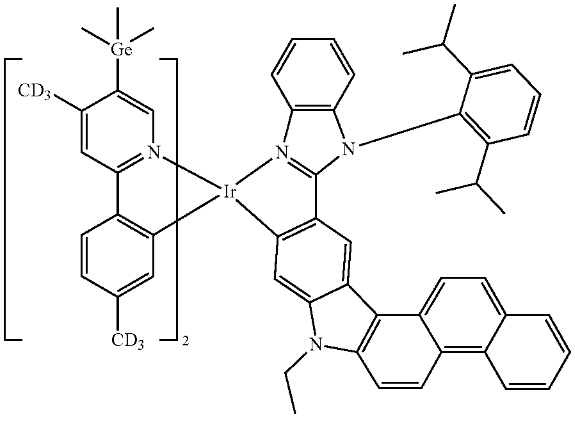
-continued
3333
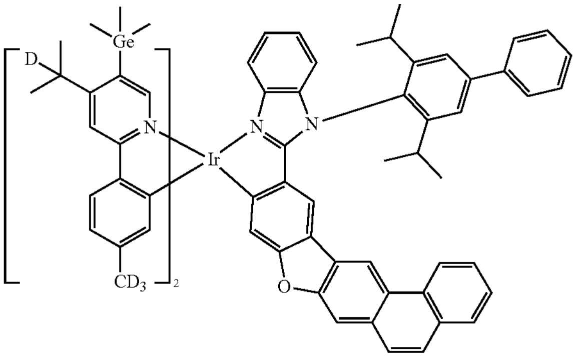
3334
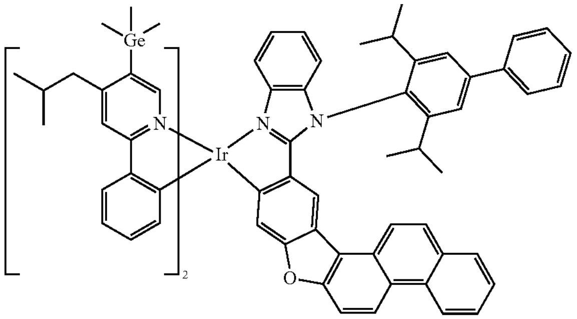
3335
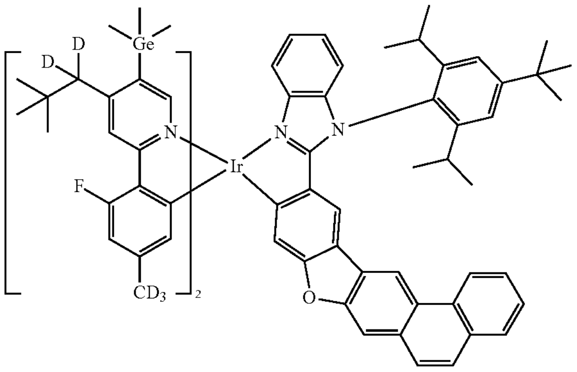
3336
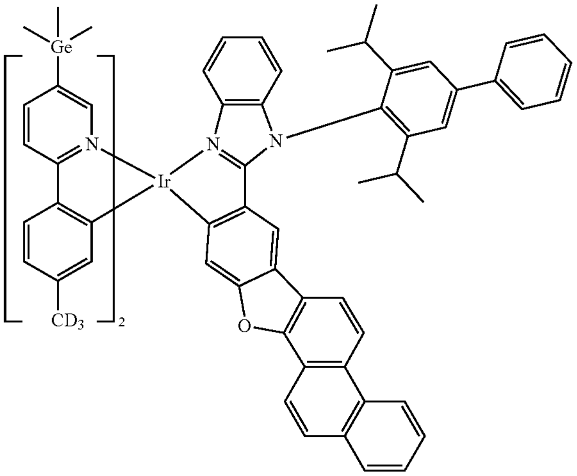

-continued
3337
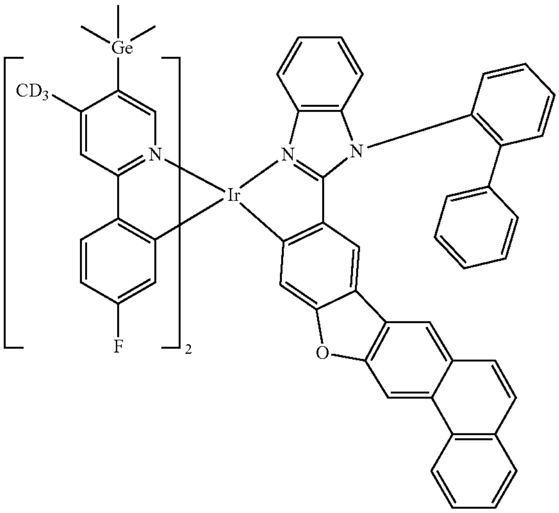
3338
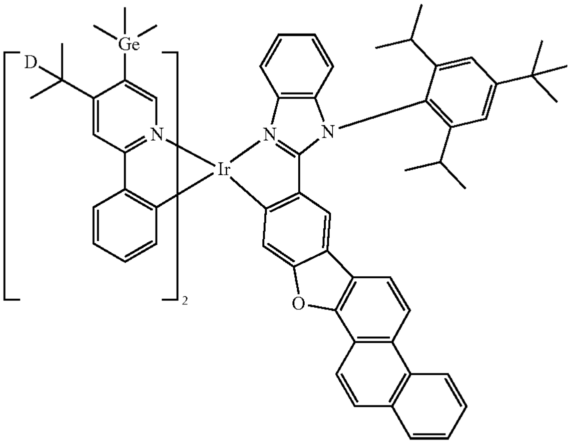
3339
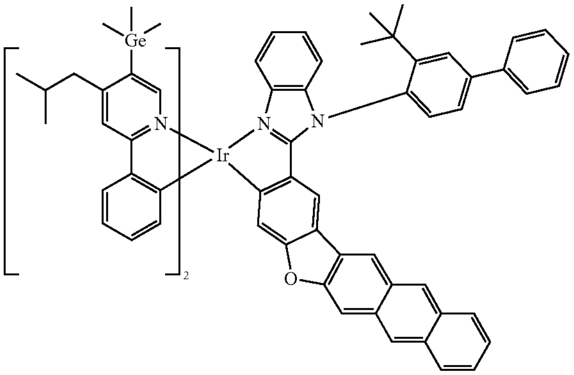
-continued
3340
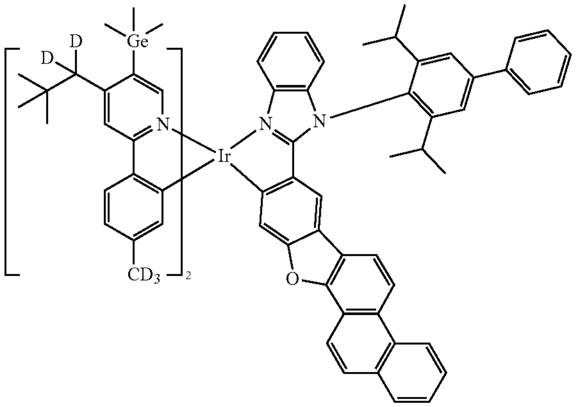
3341
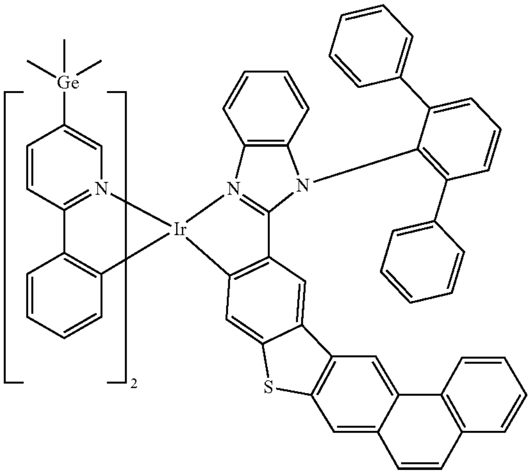
3342
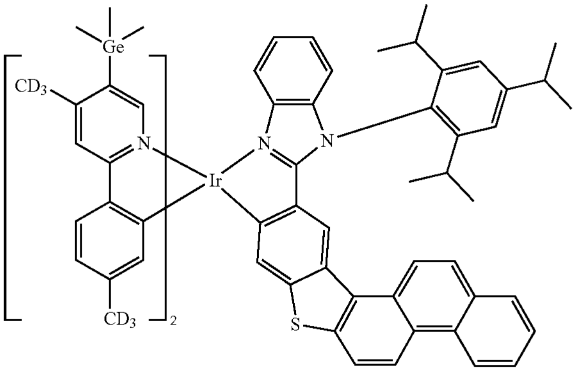

-continued
3343
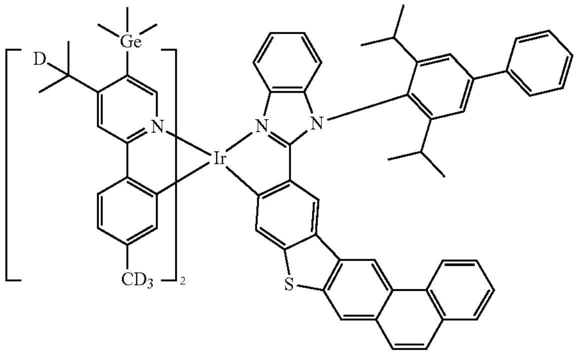
3344
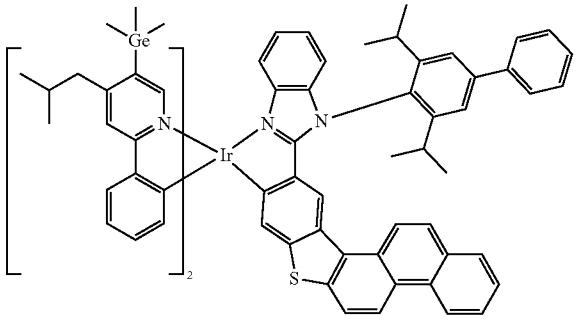
3345
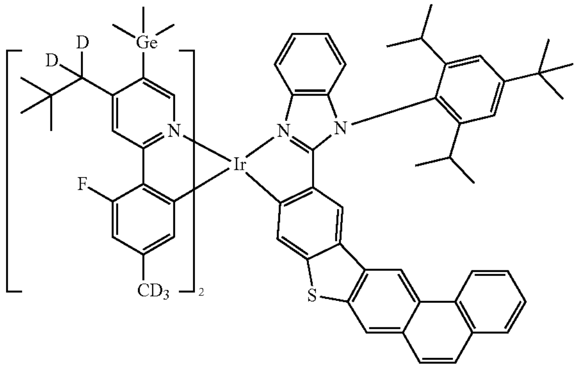
3346
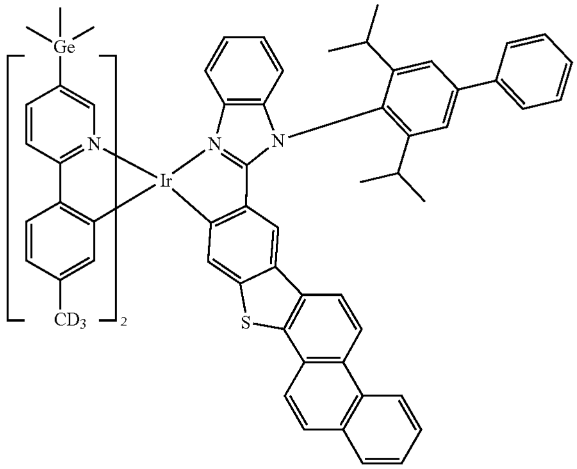
-continued
3347
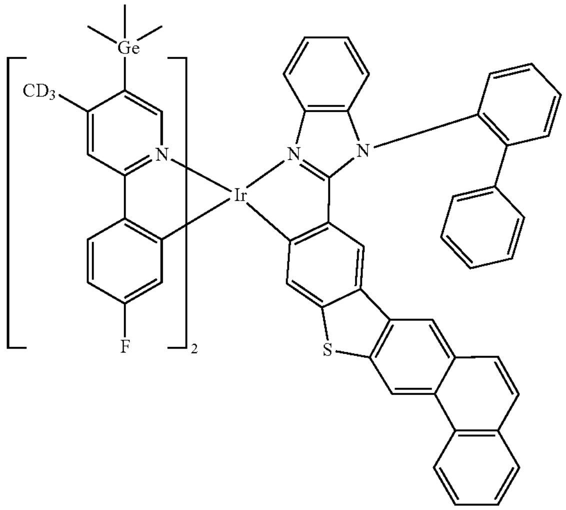
3348
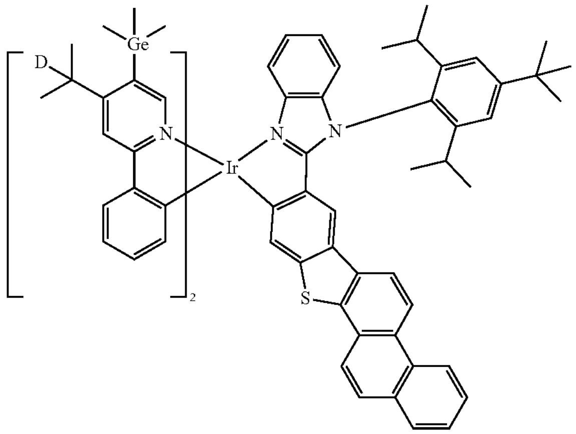
3349
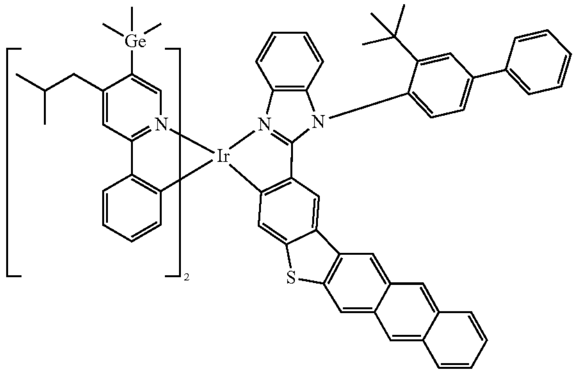

-continued
3350
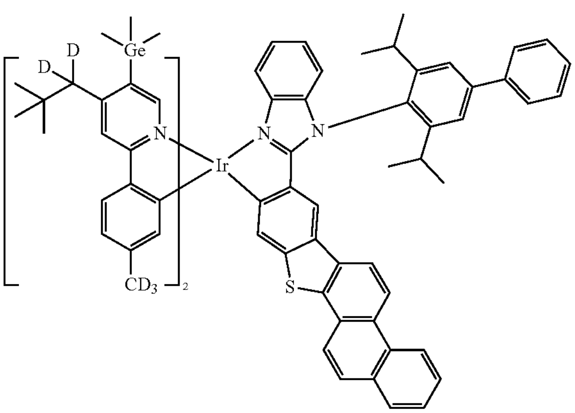
Group 2-2
1
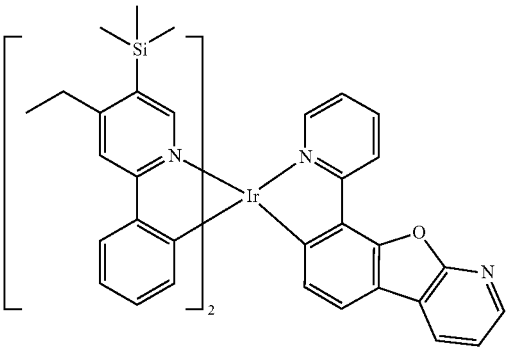
2
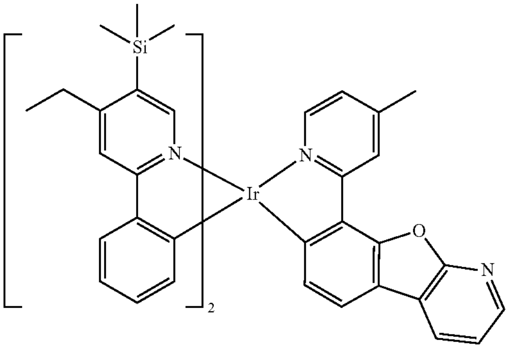
3
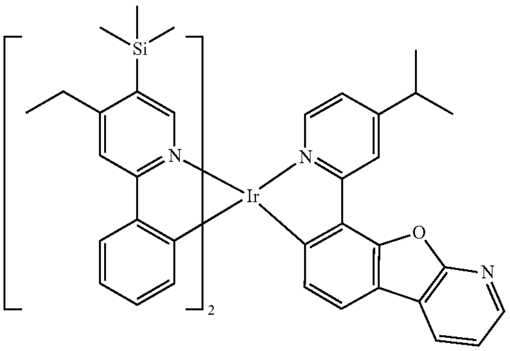
-continued
4
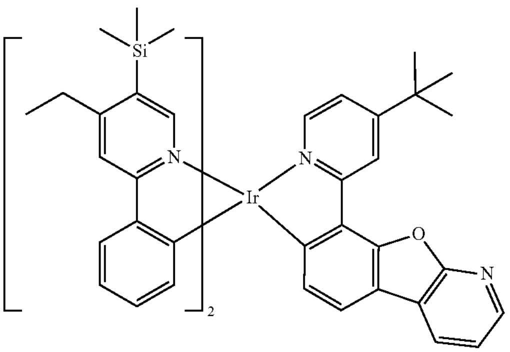
5
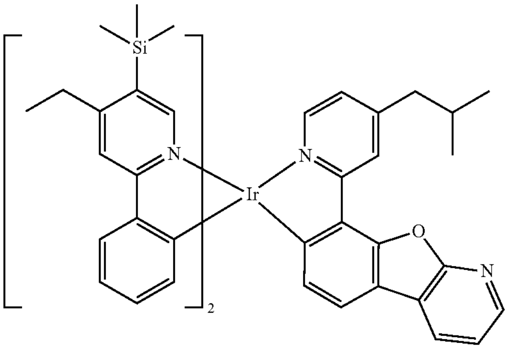
6
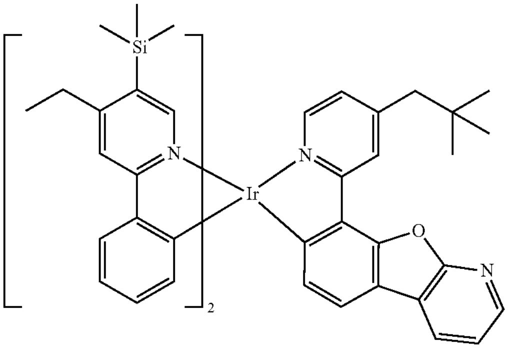
7
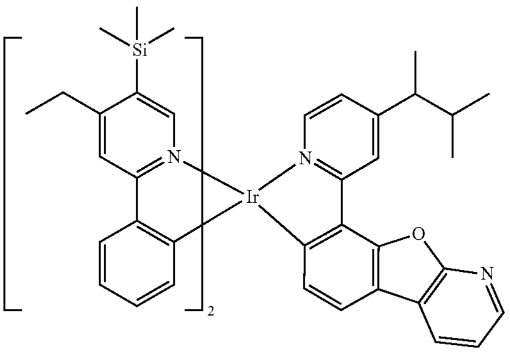

-continued
8
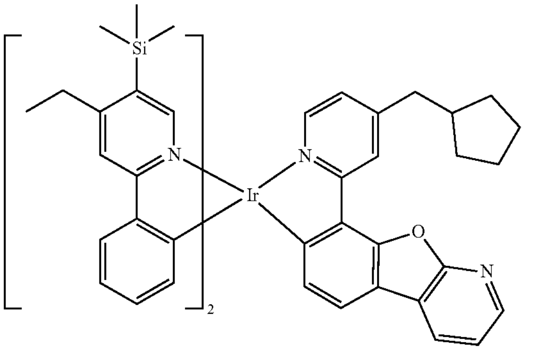
9
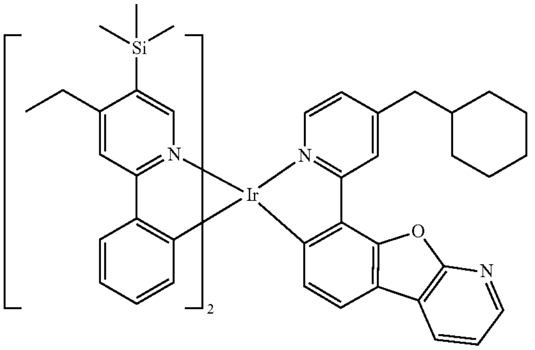
10
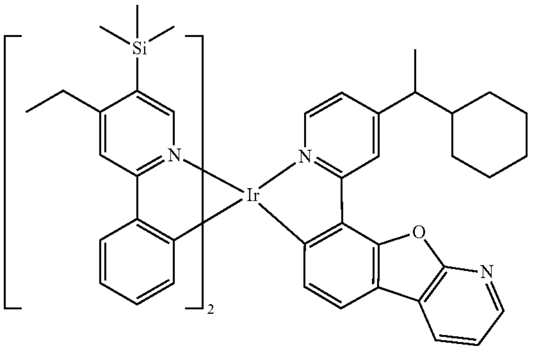
11
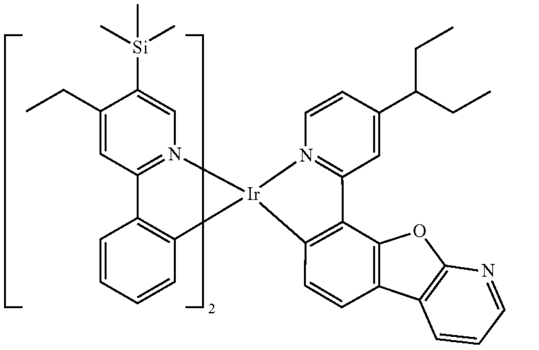
-continued
12
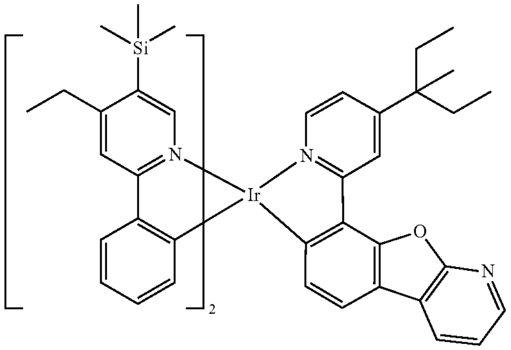
13
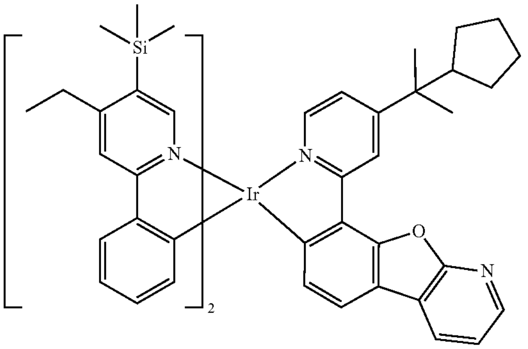
14
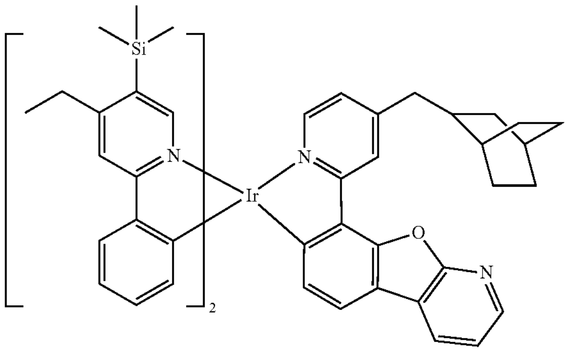
15
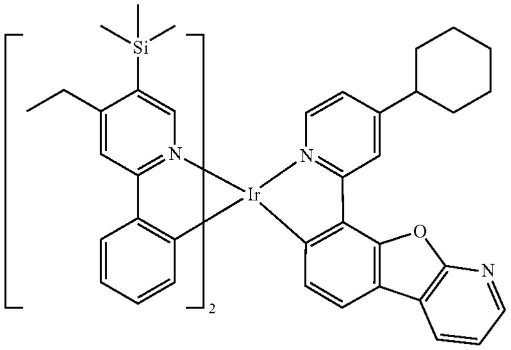

-continued
16
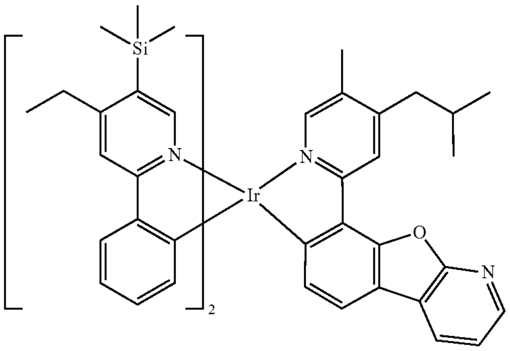
17
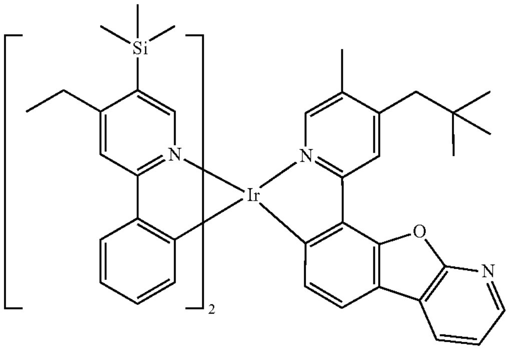
18
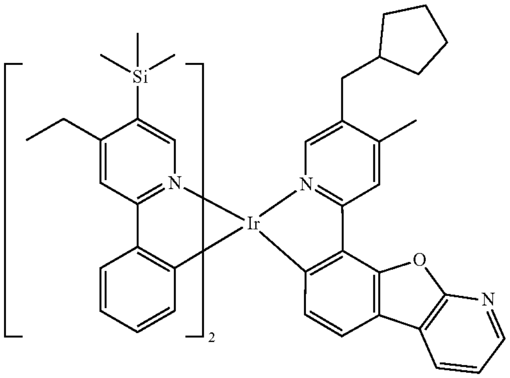
19
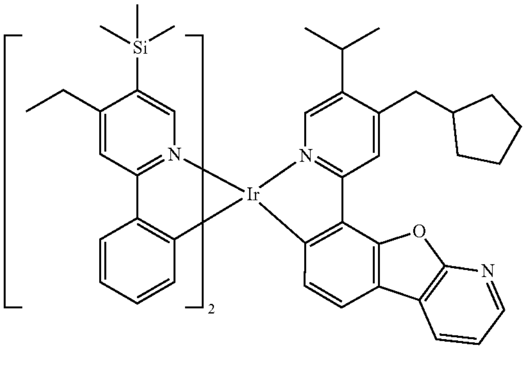
-continued
20
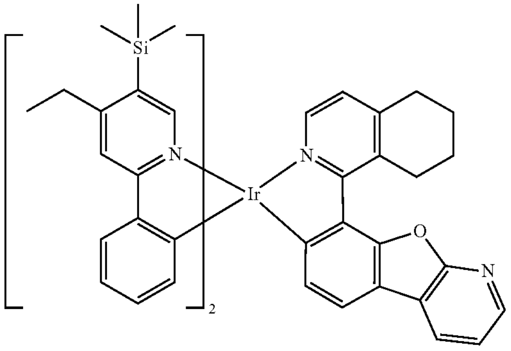
21
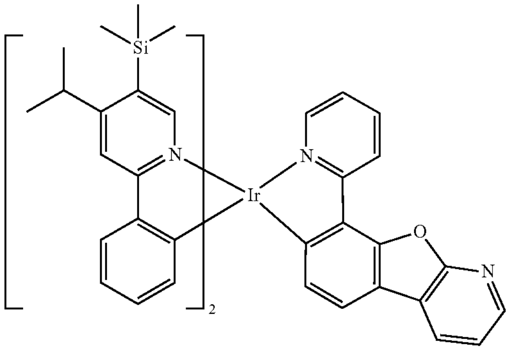
22
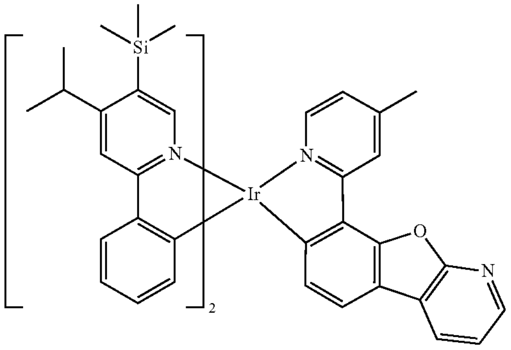
23
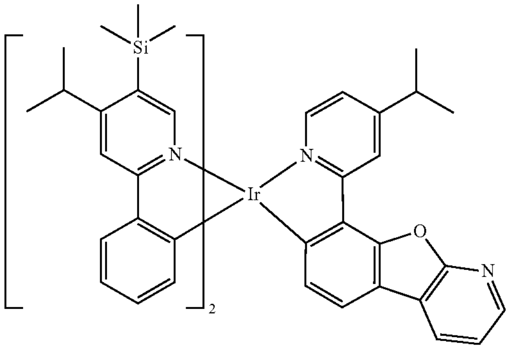

-continued
24
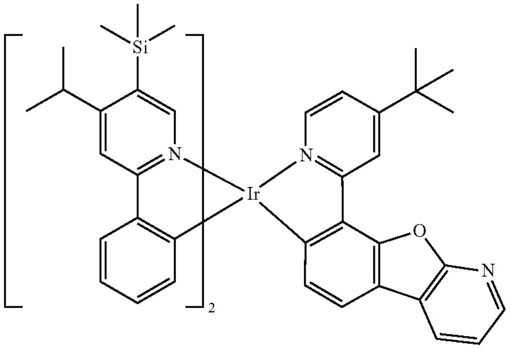
25
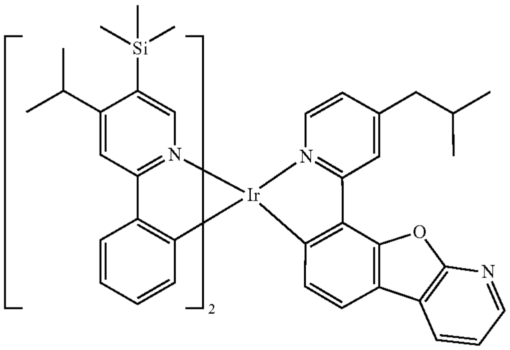
26
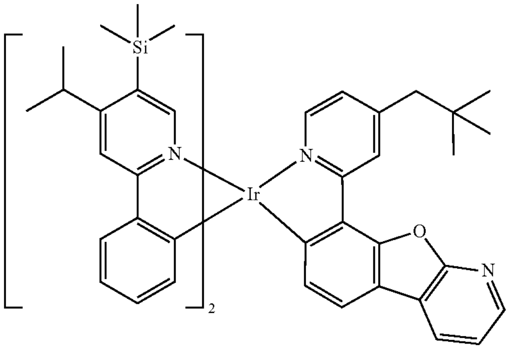
27
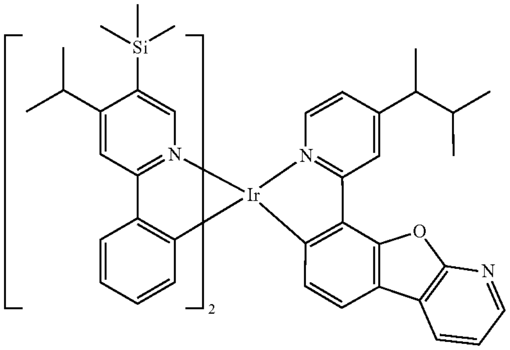
-continued
28
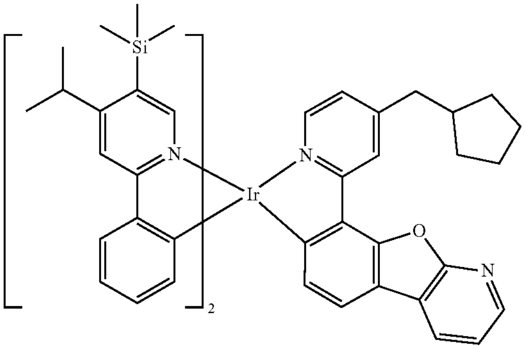
29
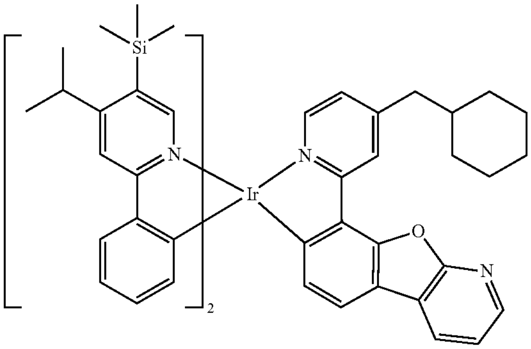
30
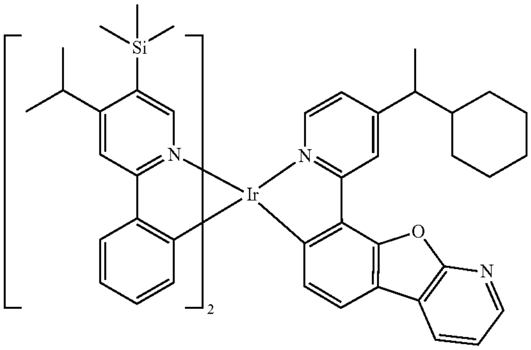
31
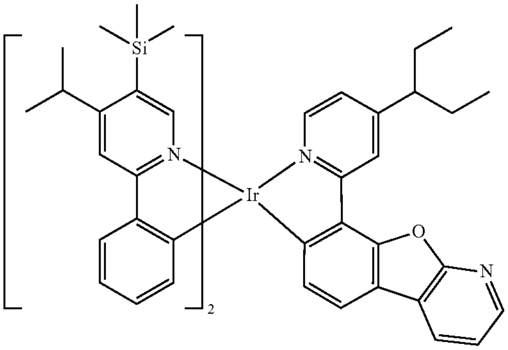

-continued
32
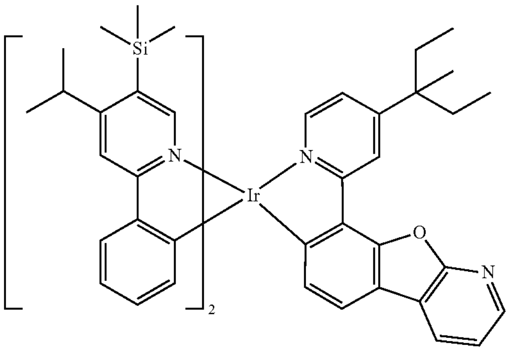
33
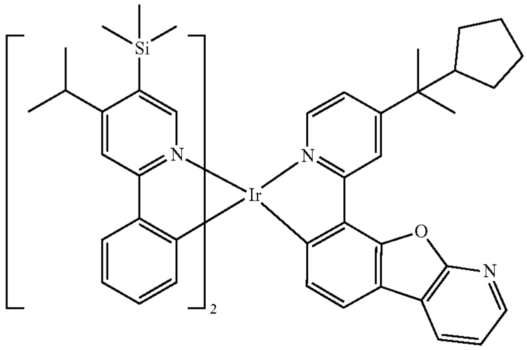
34
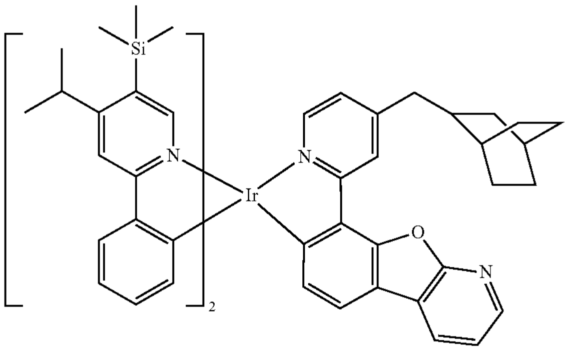
35
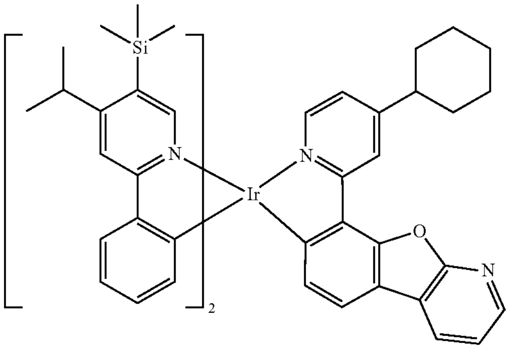
-continued
36
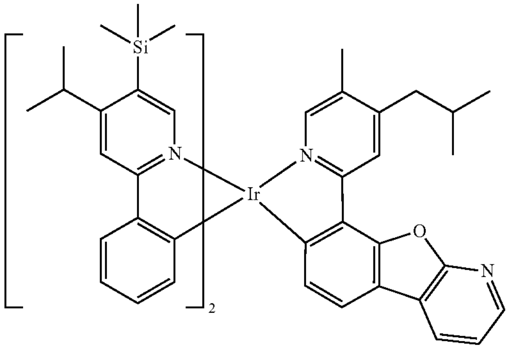
37
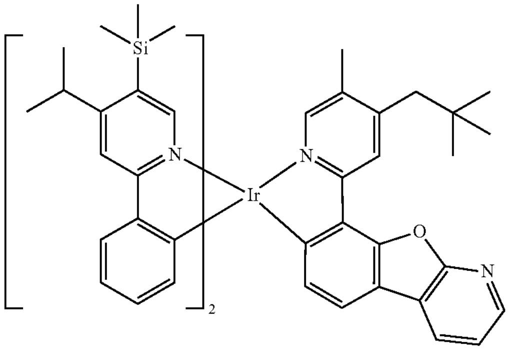
38
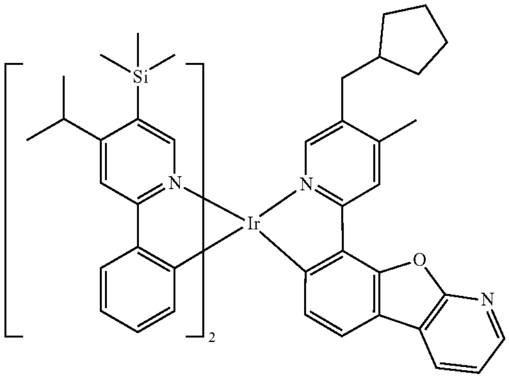
39
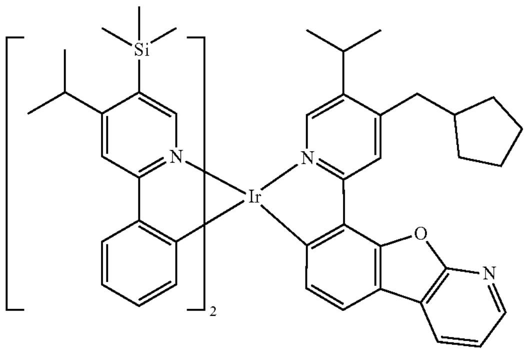

-continued
40
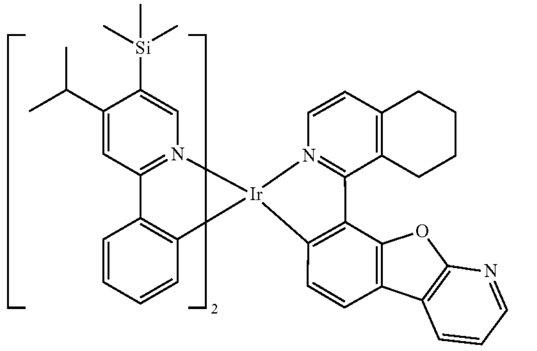
41
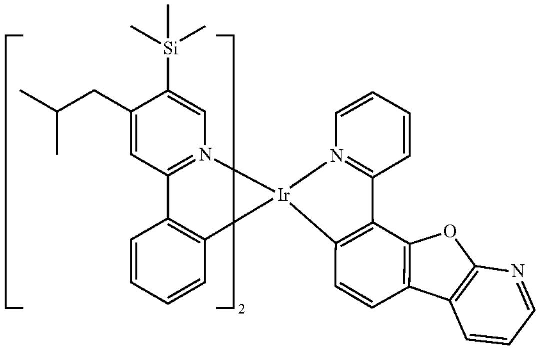
42
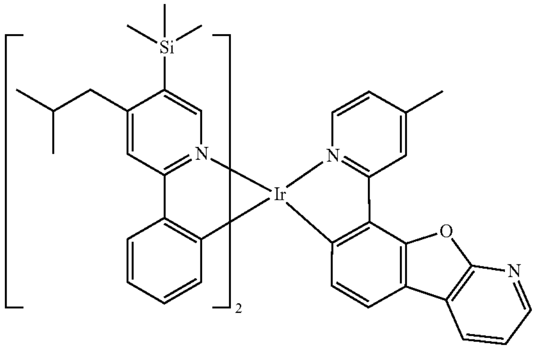
43
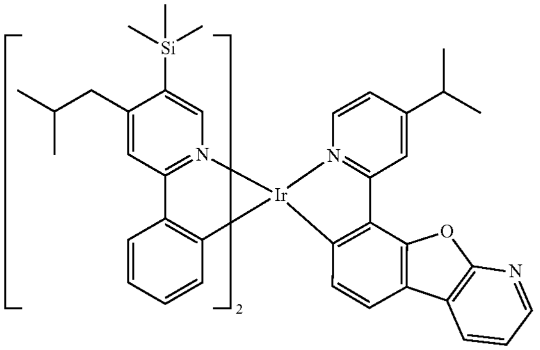
-continued
44
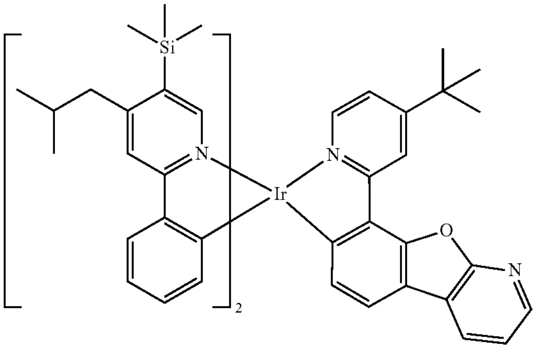
45
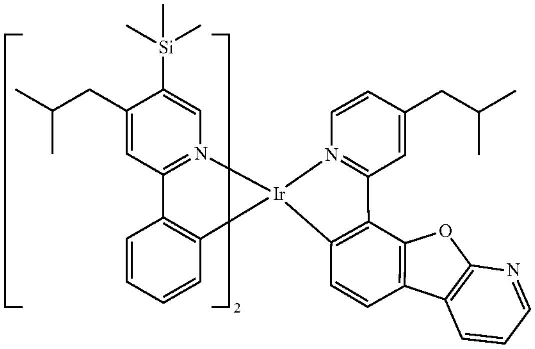
46
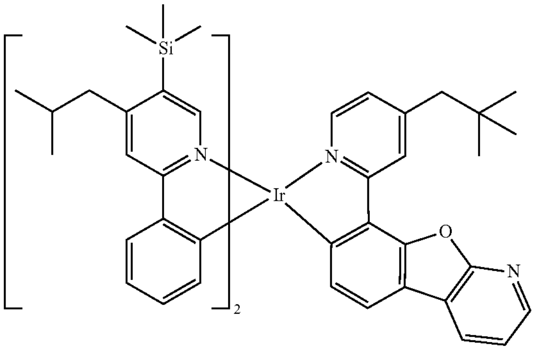
47
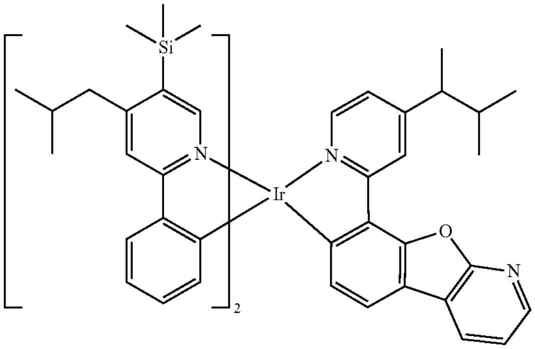

-continued
48
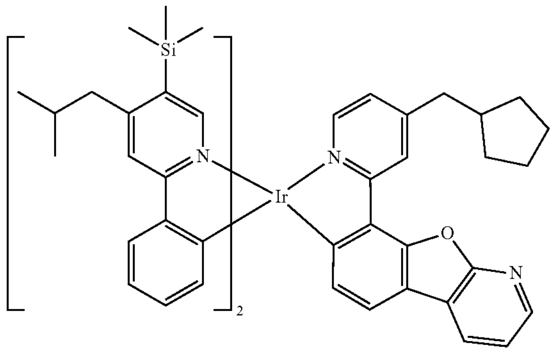
49
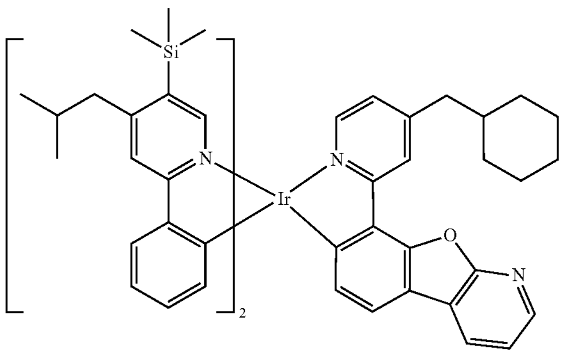
50
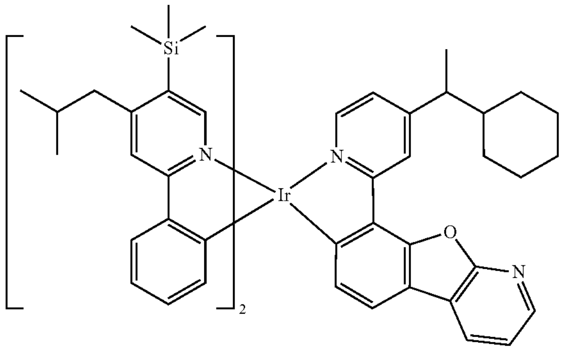
51
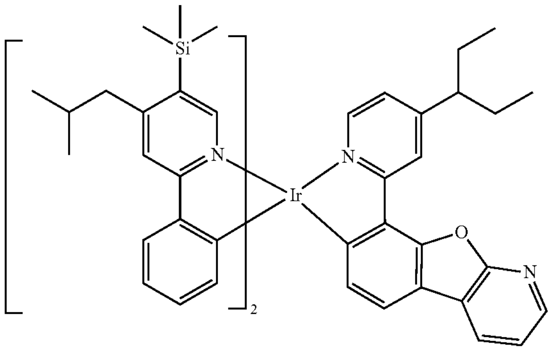
-continued
52
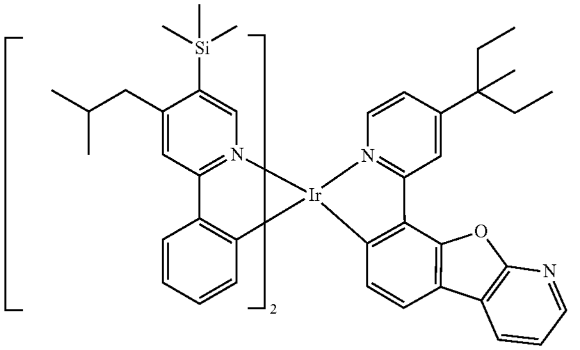
53
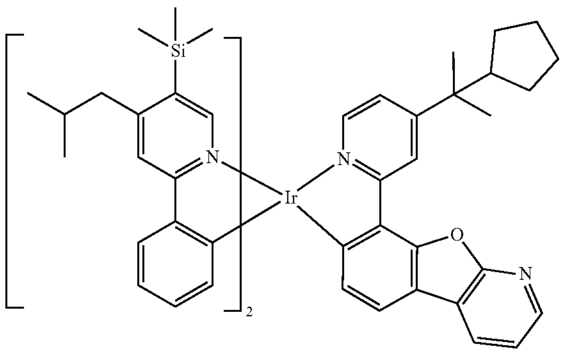
54
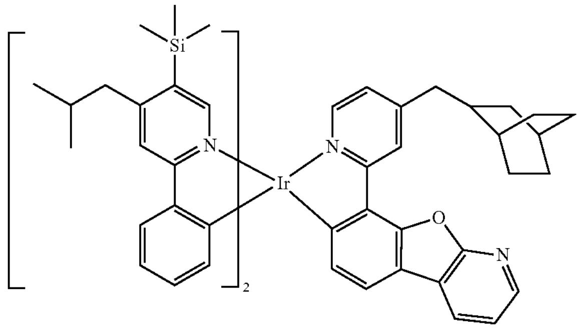
55
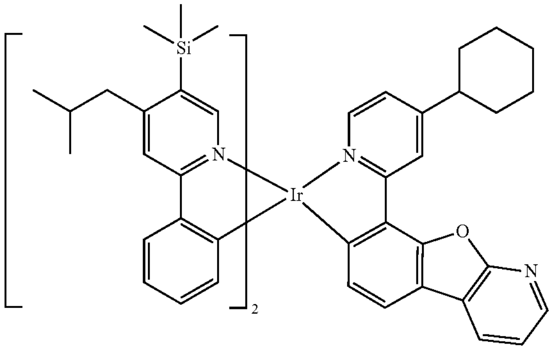

-continued
56
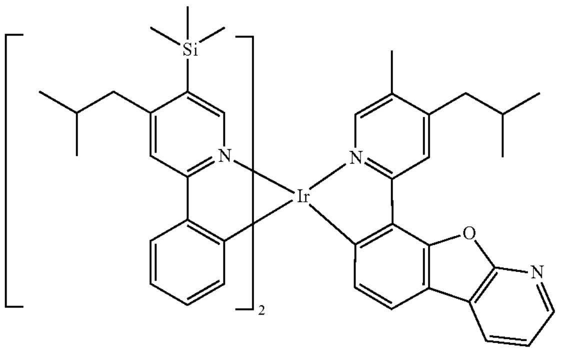
60
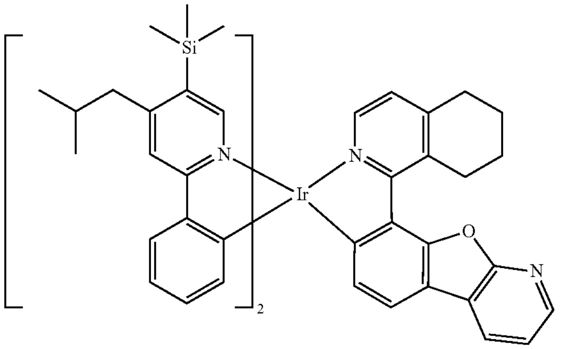
57
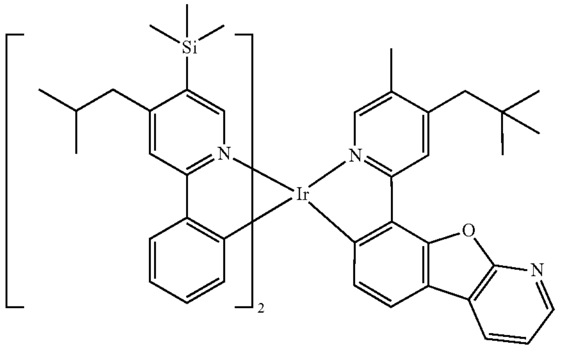
61
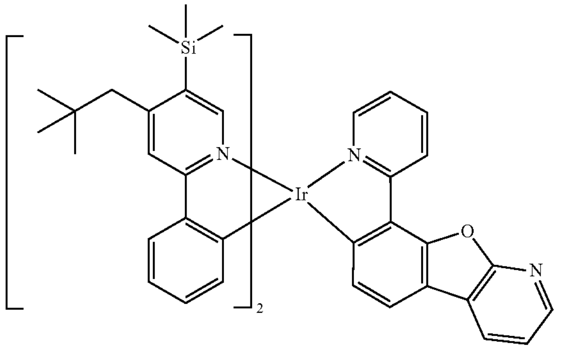
58
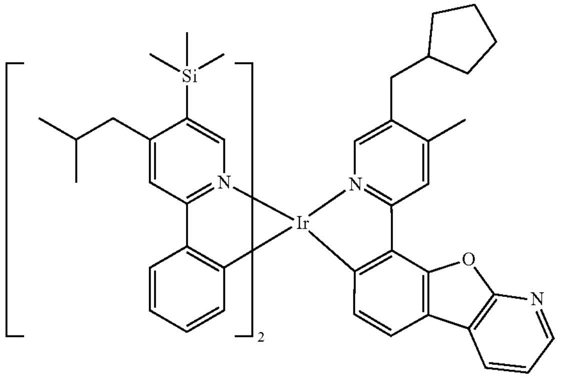
62
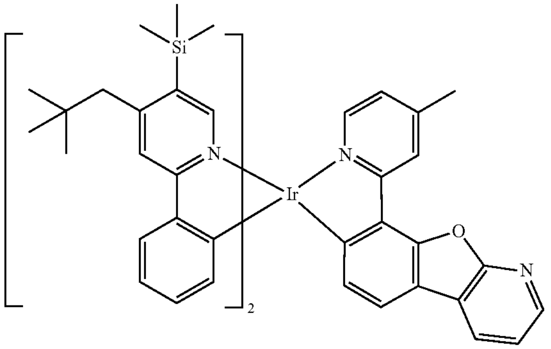
59
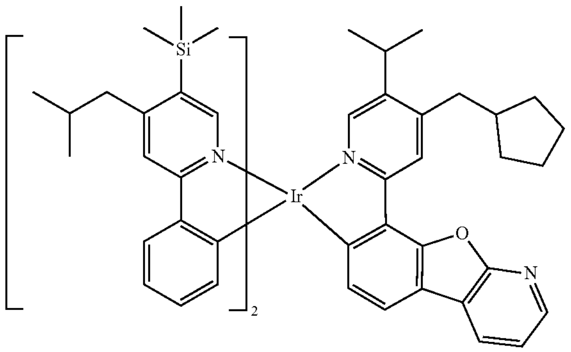
63
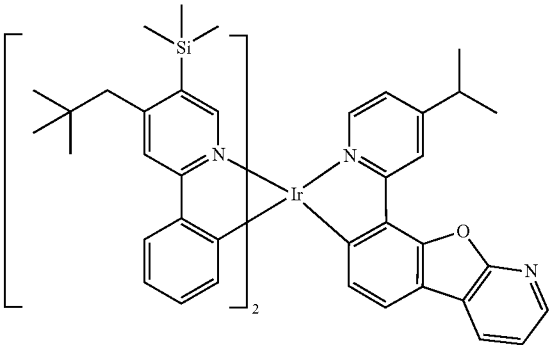

-continued
64
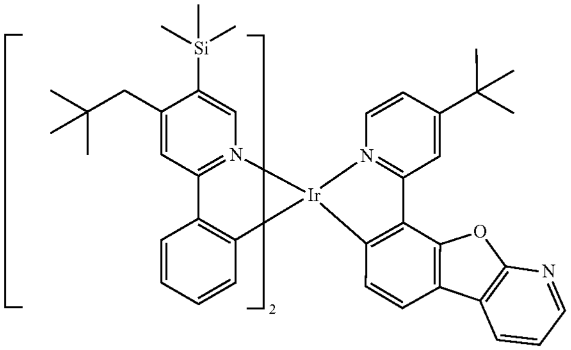
65
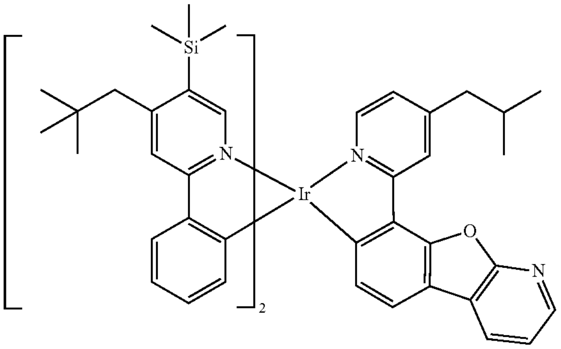
66
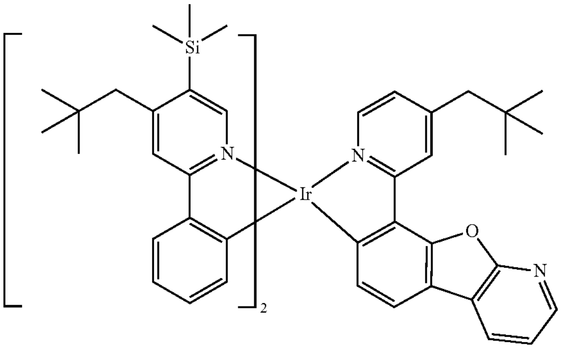
67
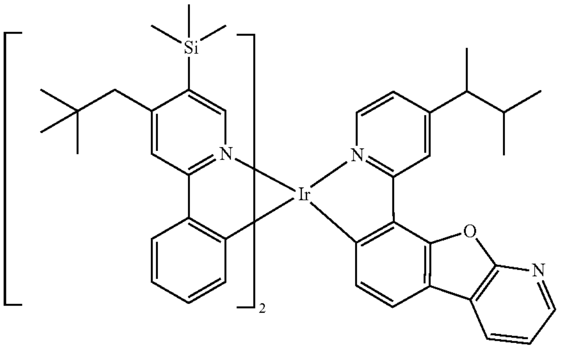
-continued
68
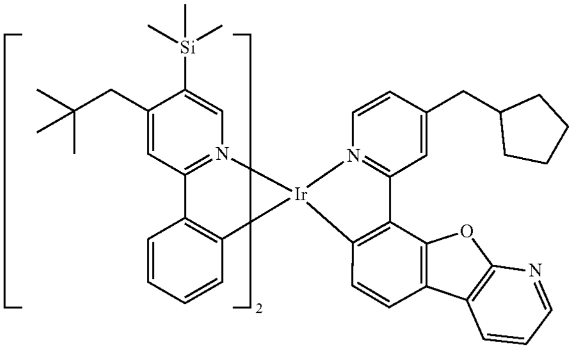
69
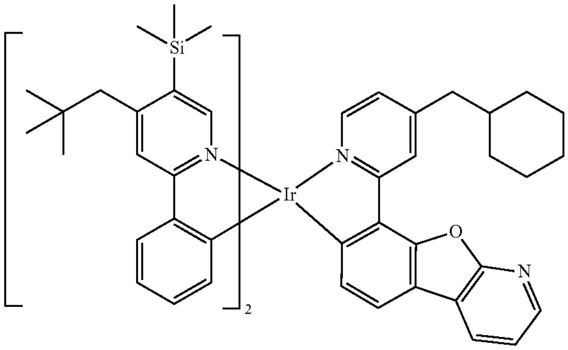
70
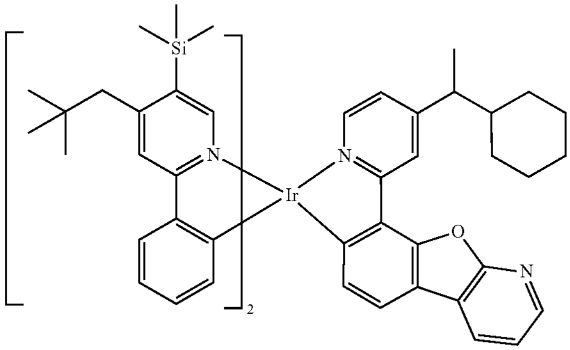
71
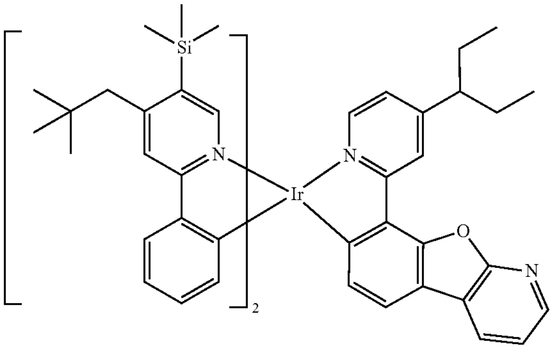

-continued
72
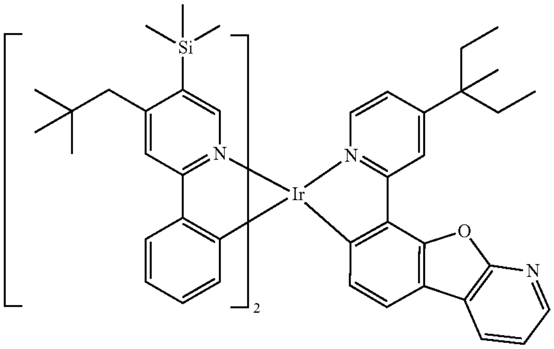
73
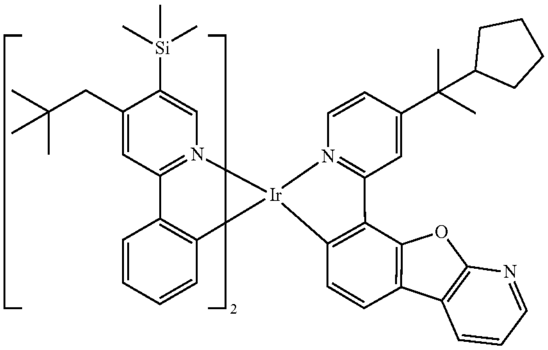
74
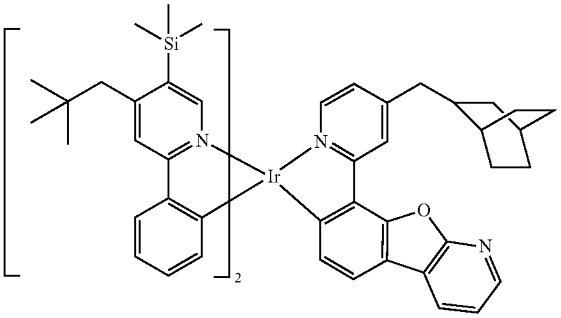
75
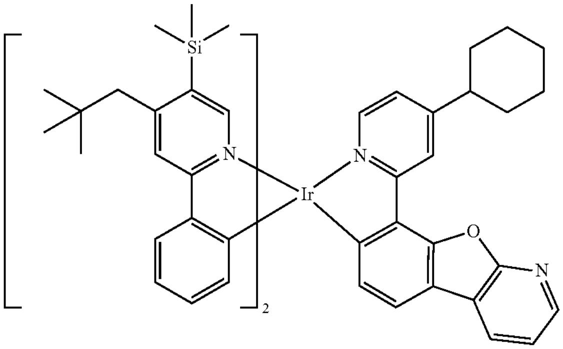
-continued
76
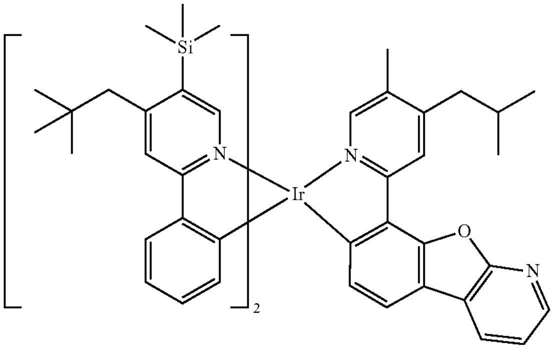
77
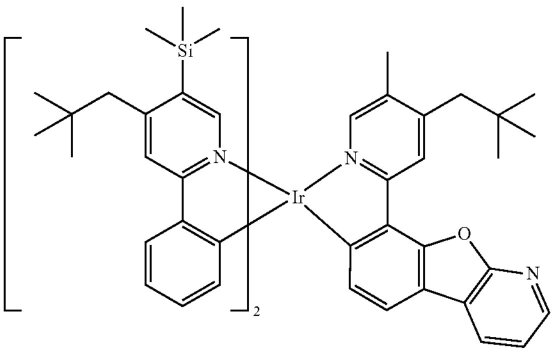
78
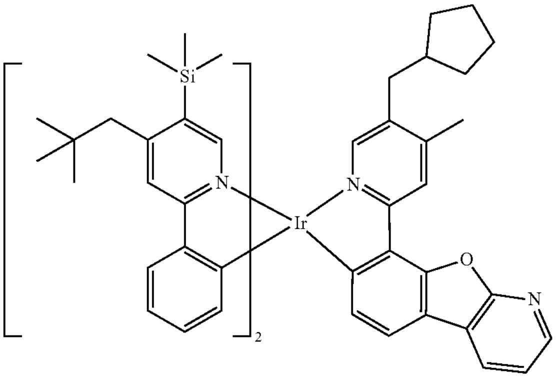
79
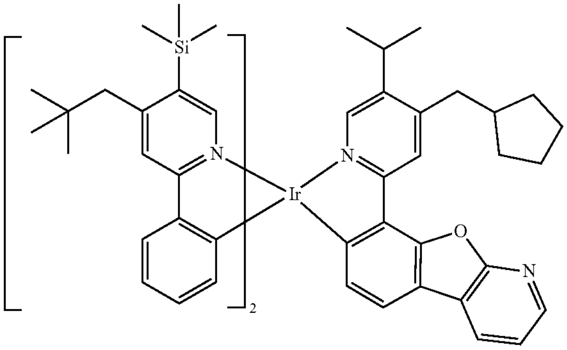

-continued
80
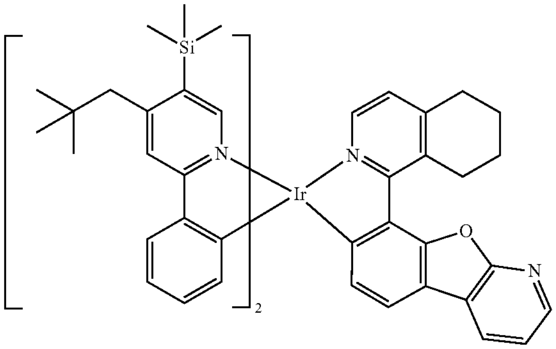
81
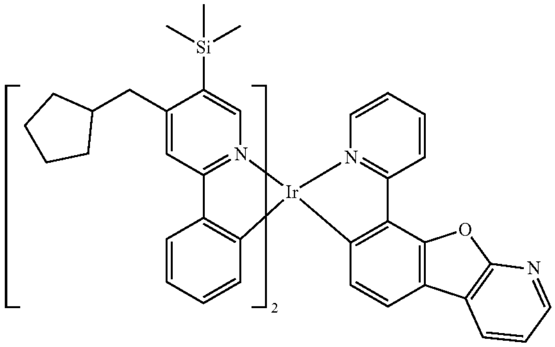
82
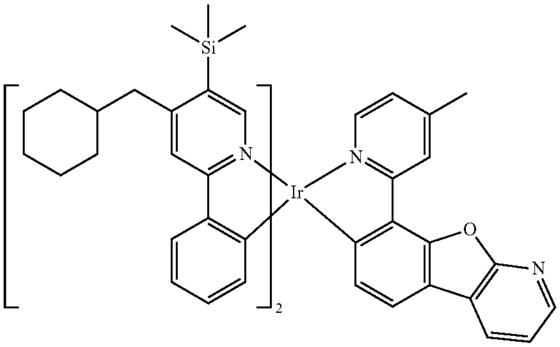
83
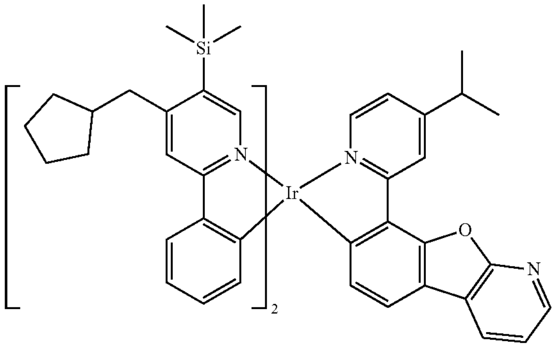
-continued
84
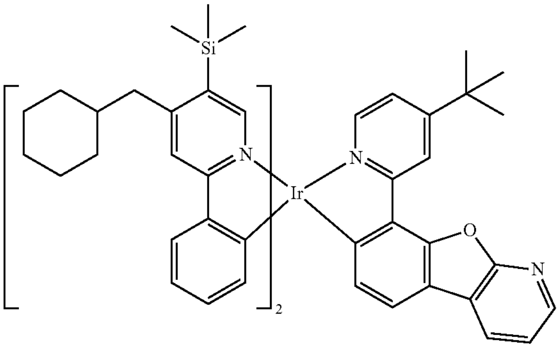
85
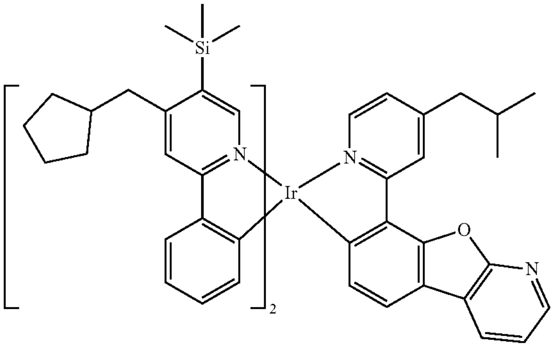
86
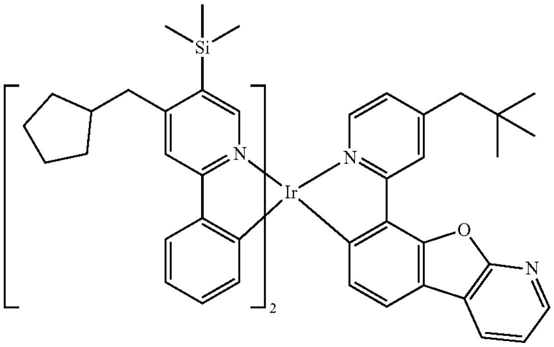
87
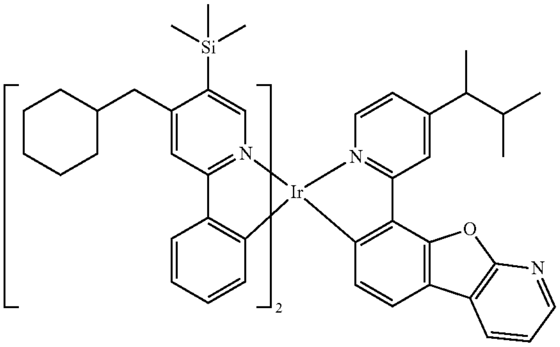

-continued
88
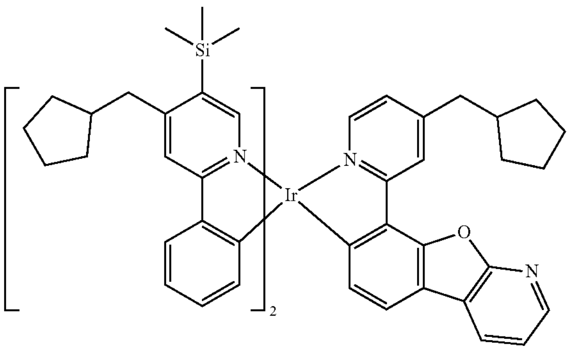
89
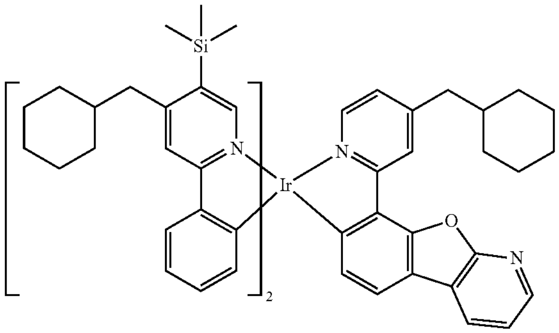
90
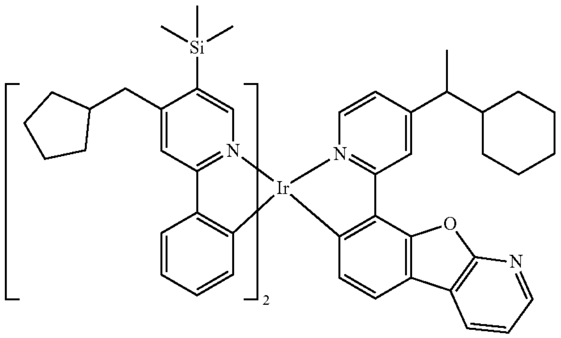
91
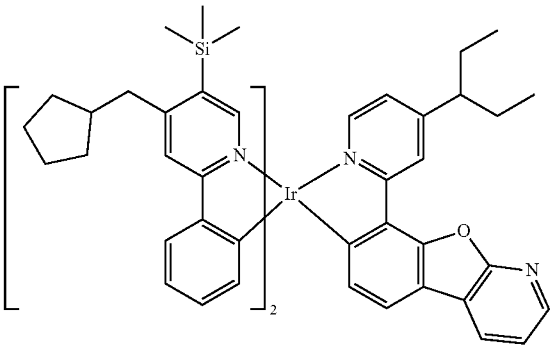
-continued
92
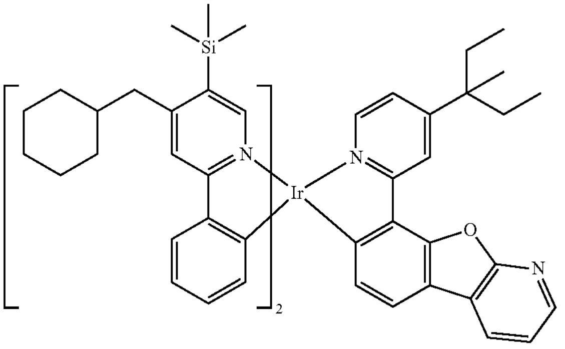
93
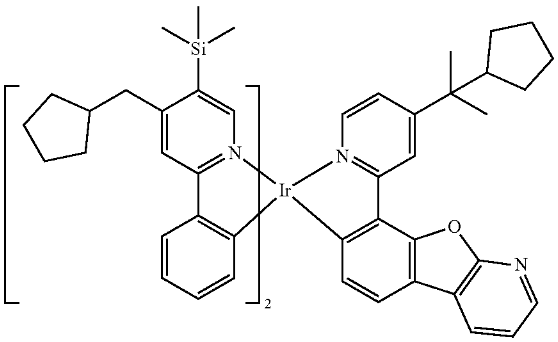
94
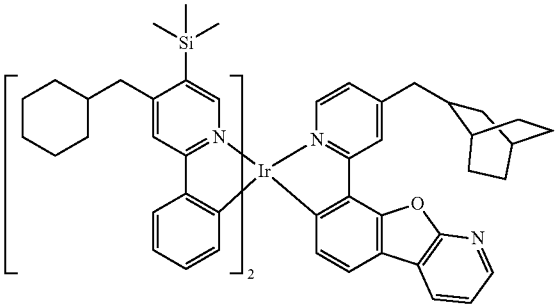
95
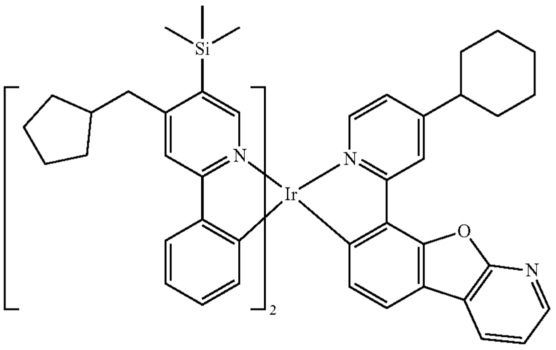

-continued
96
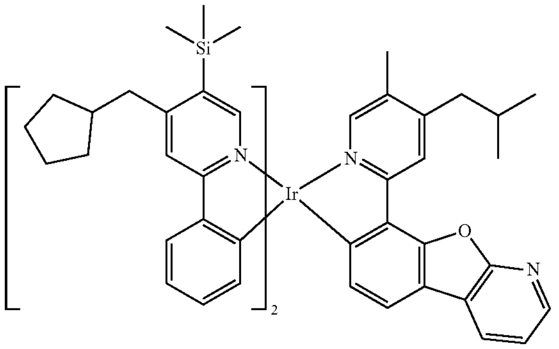
97
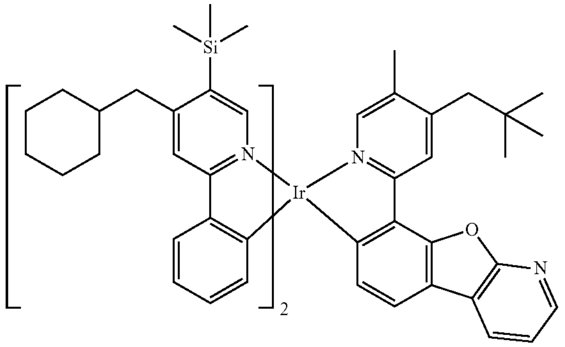
98
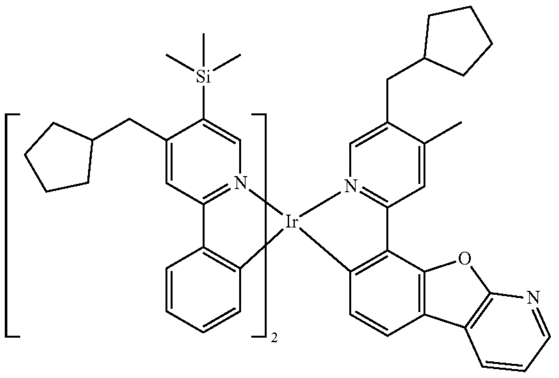
99
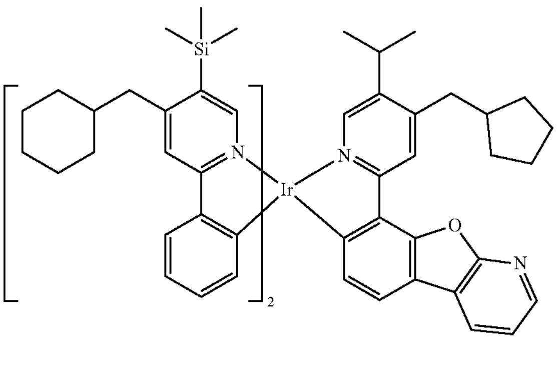
-continued
100
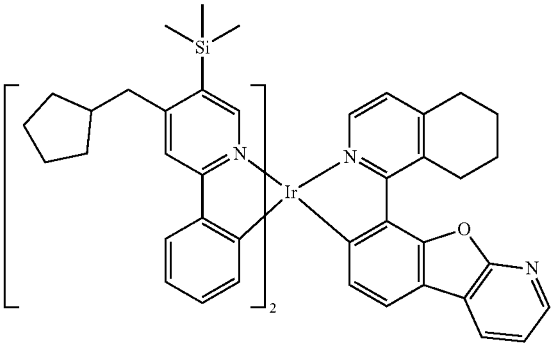
101
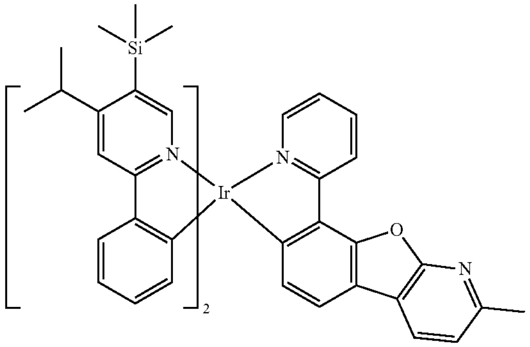
102
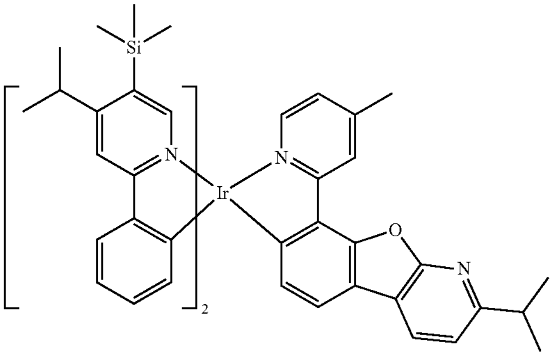
103
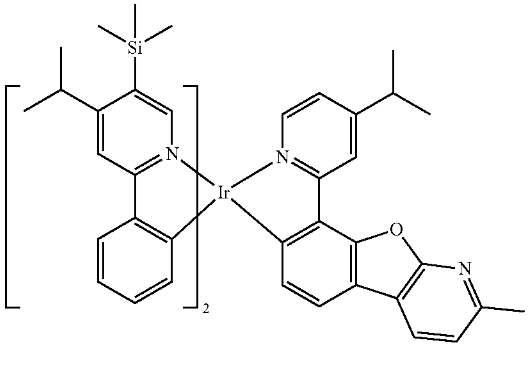

-continued
104
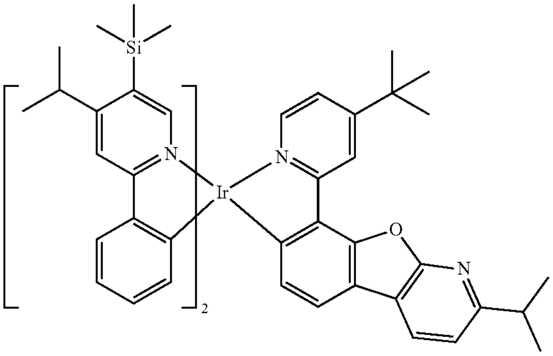
105
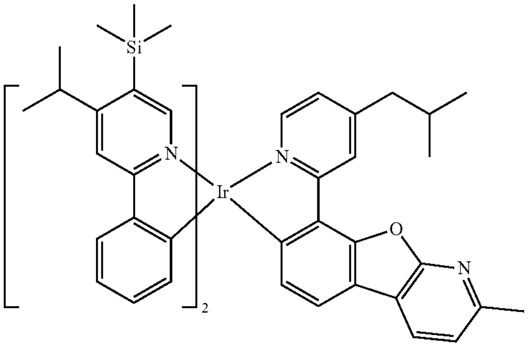
106
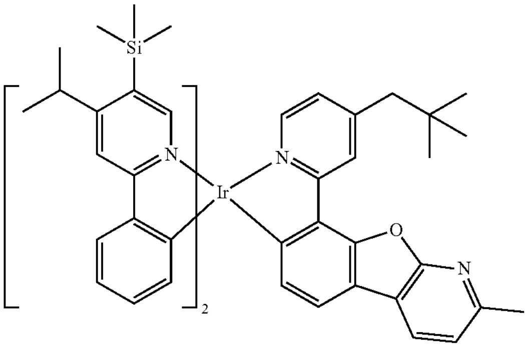
107
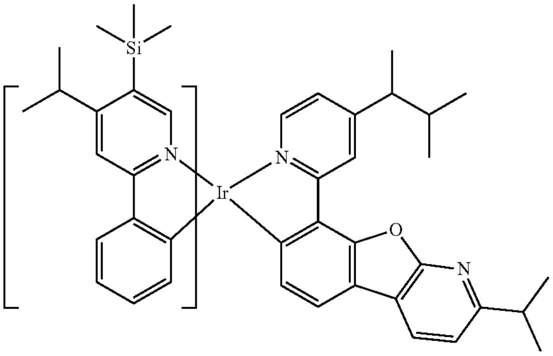
-continued
108
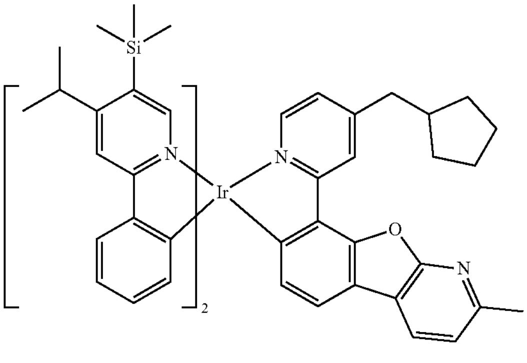
109
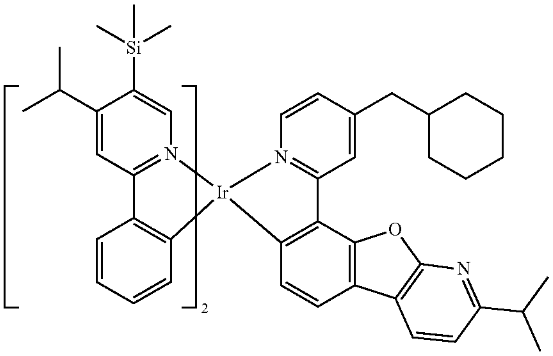
110
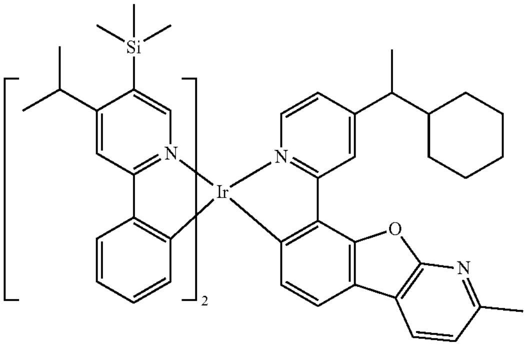
111
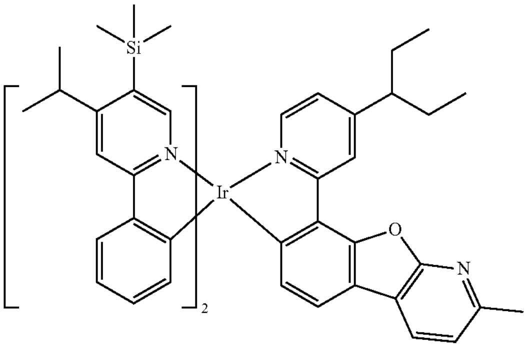

-continued
112
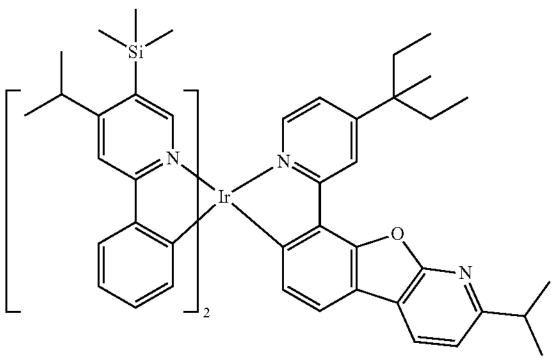
113
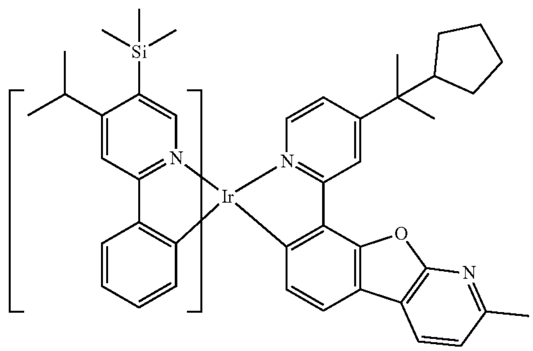
114
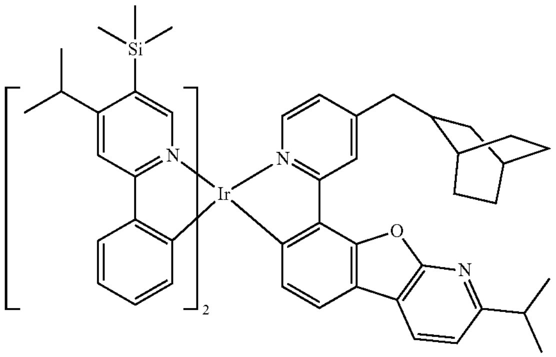
115
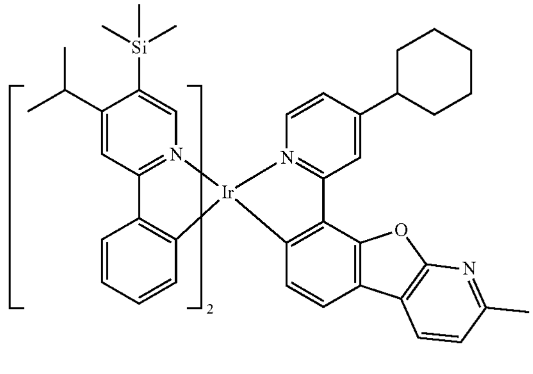
-continued
116
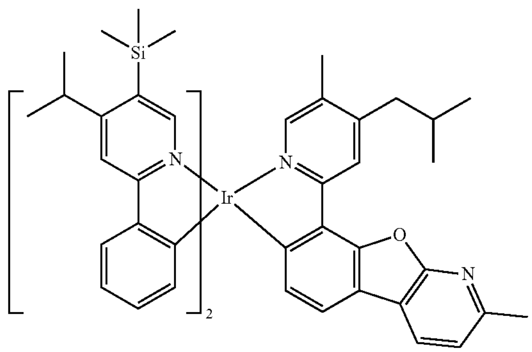
117
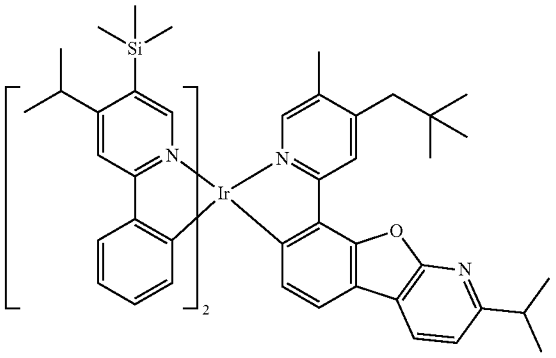
118
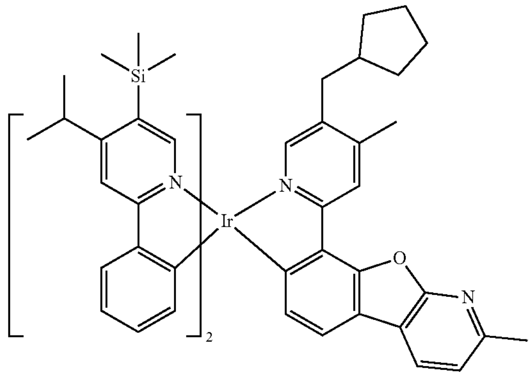
119
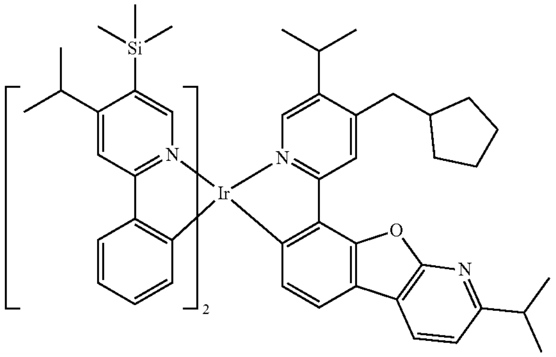

-continued
120
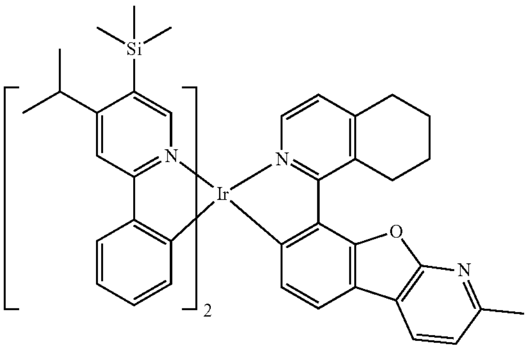
121
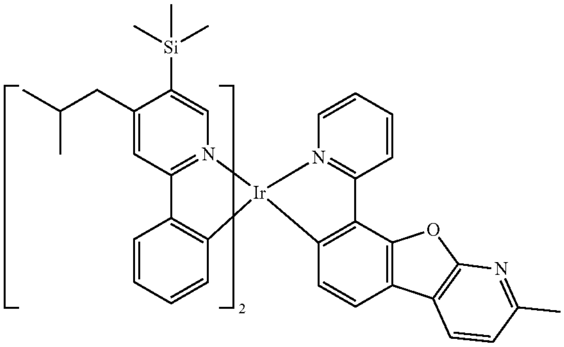
122
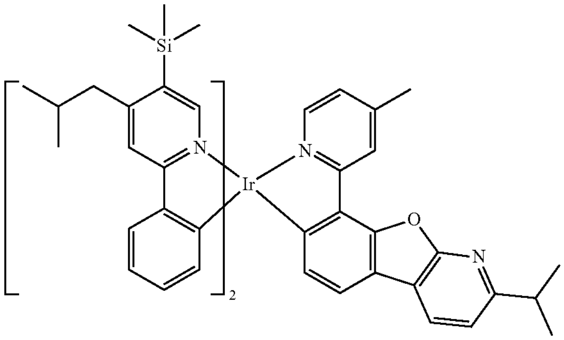
123
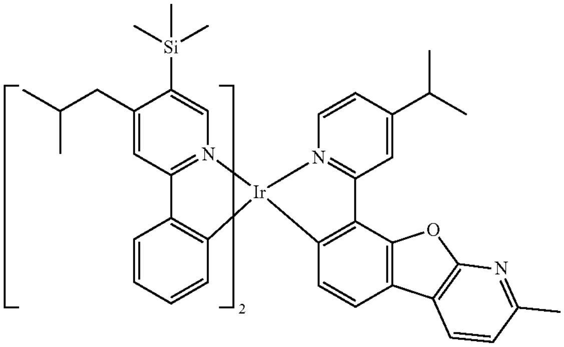
-continued
124
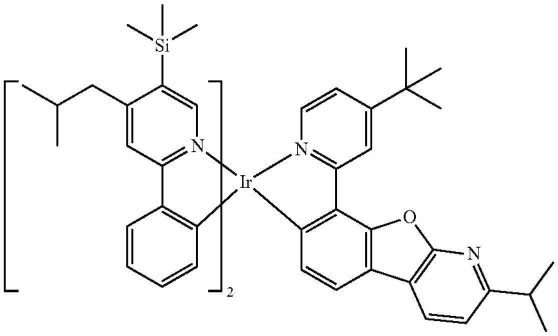
125
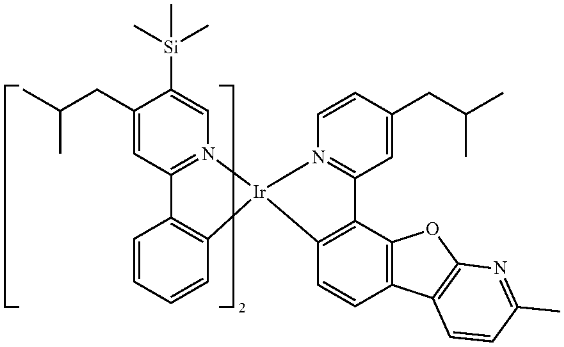
126
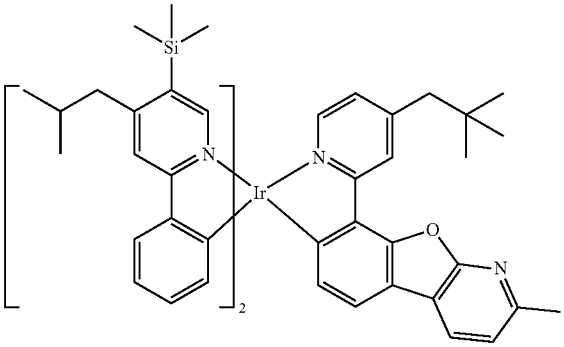
127
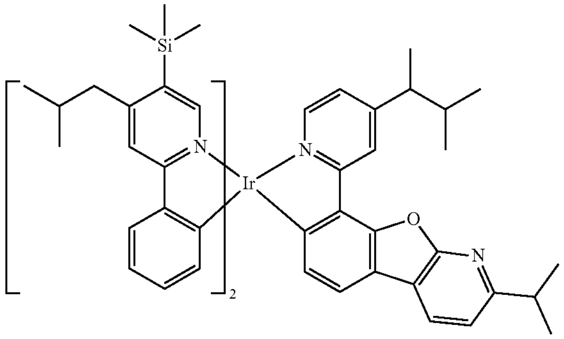

-continued
128
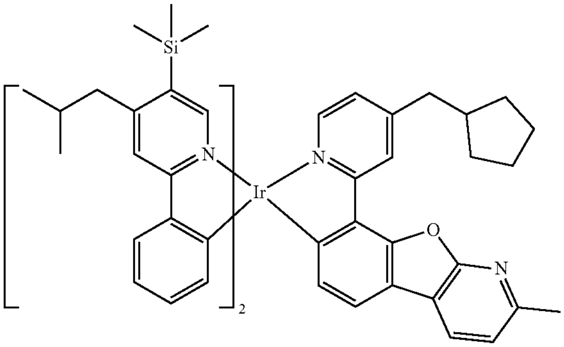
129
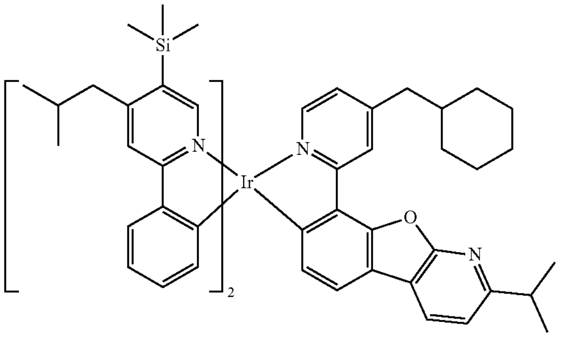
130
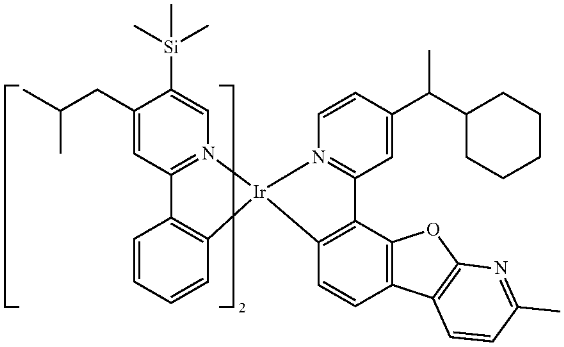
131
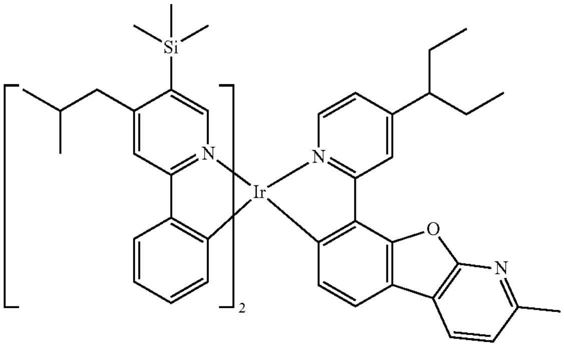
-continued
132
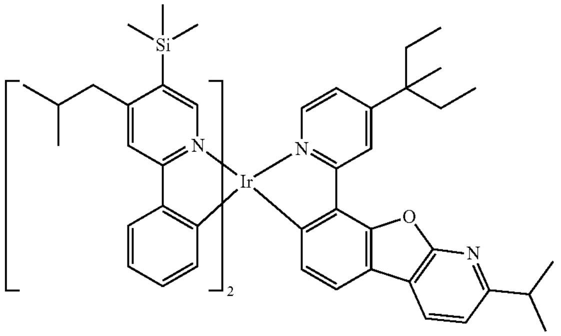
133
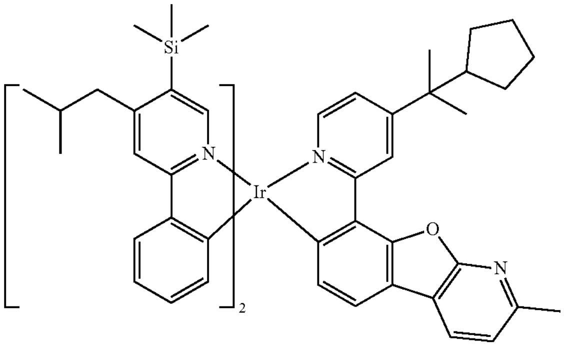
134
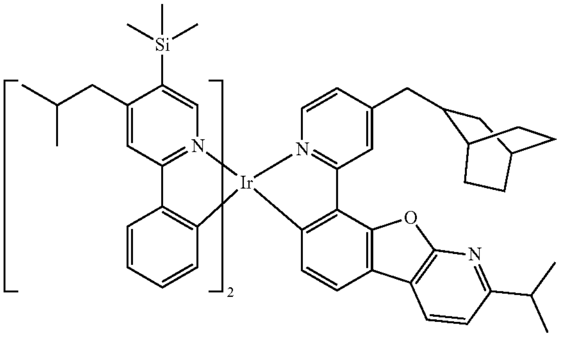
135
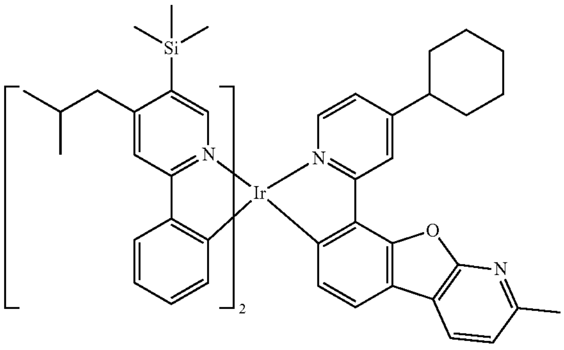

-continued
136
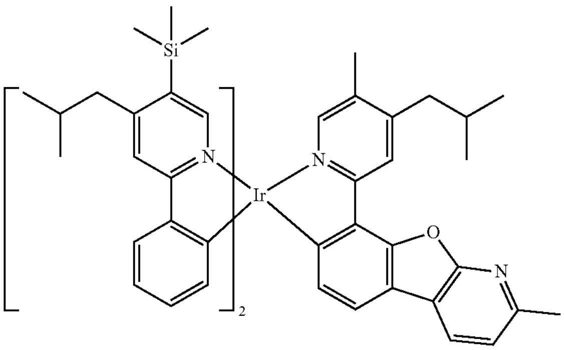
137
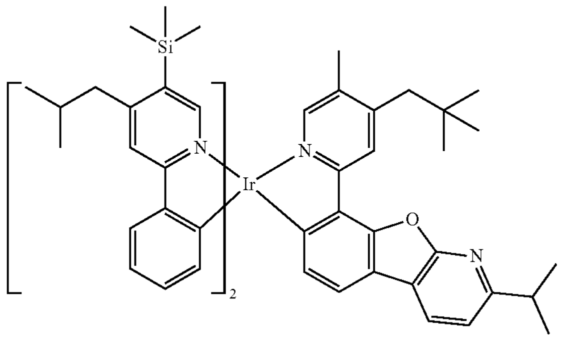
138
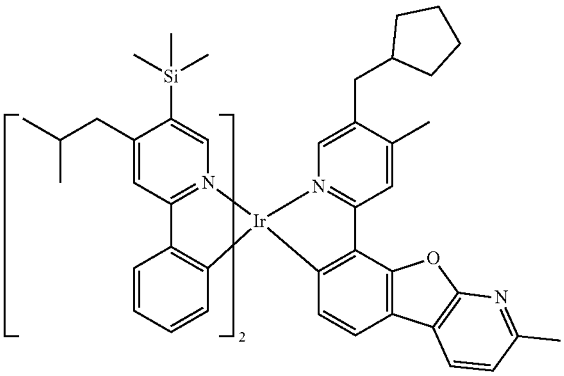
139
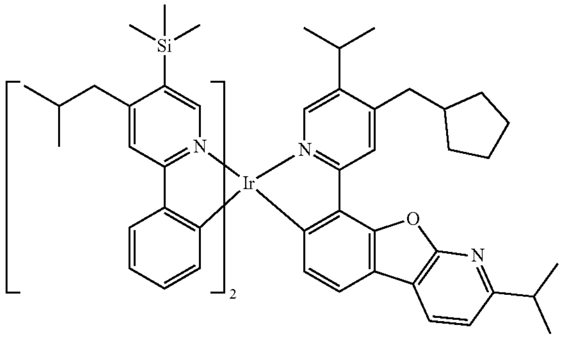
-continued
140
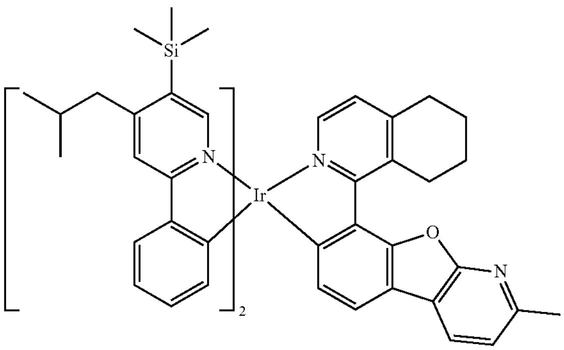
141
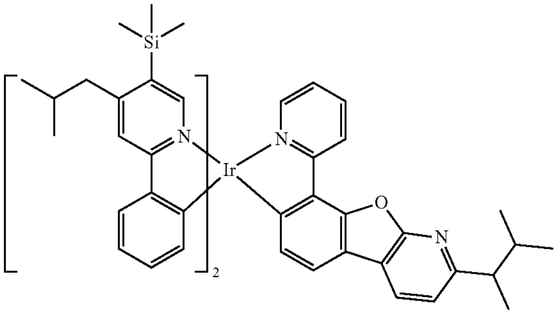
142
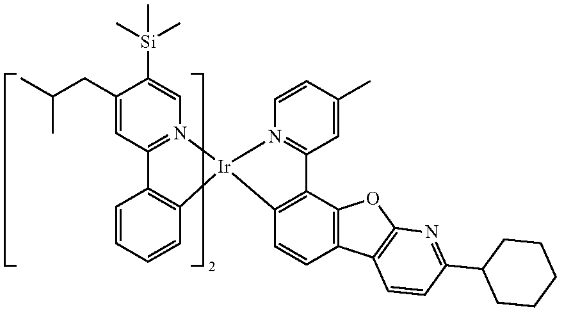
143
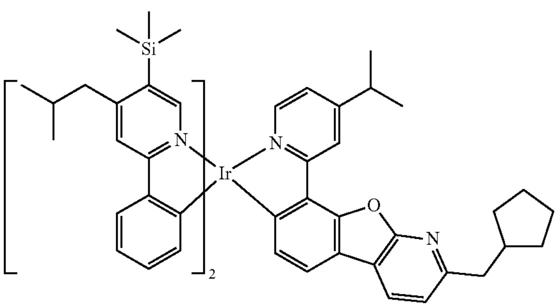

-continued
144
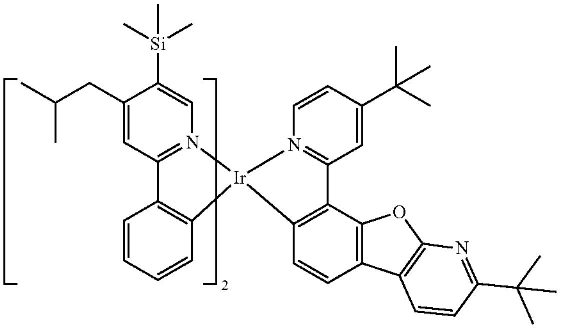
145
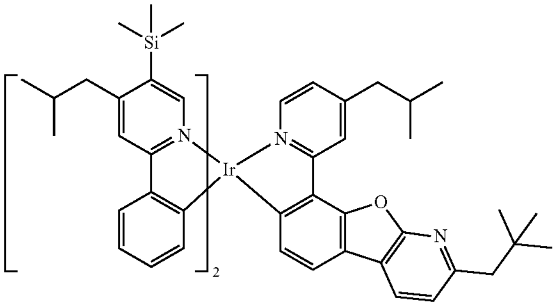
146
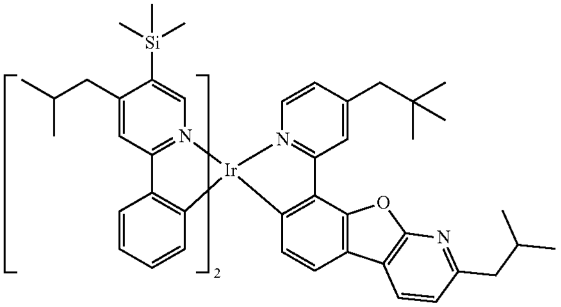
147
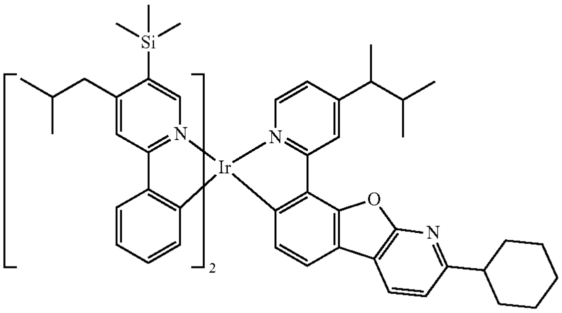
-continued
148
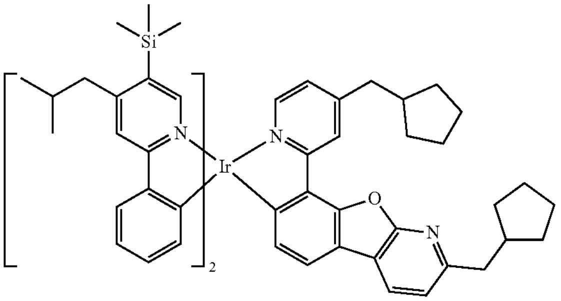
149
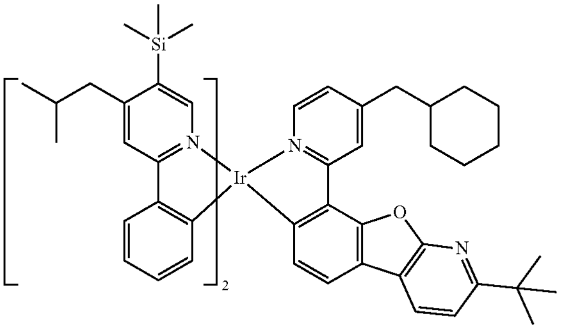
150
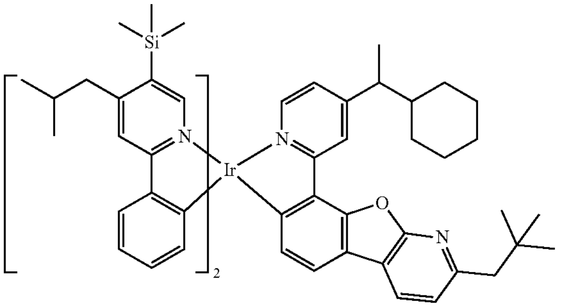
151
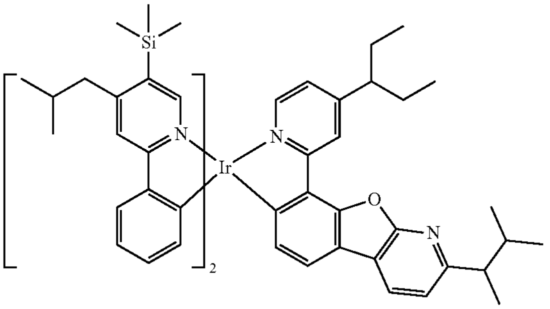

-continued
152
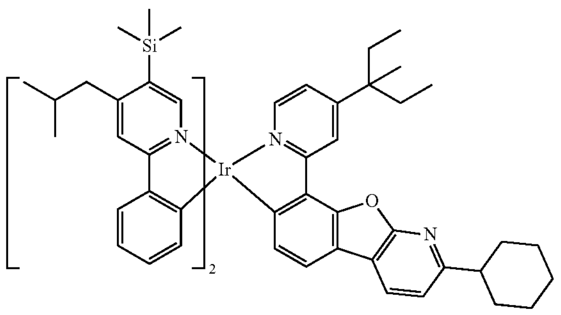
153
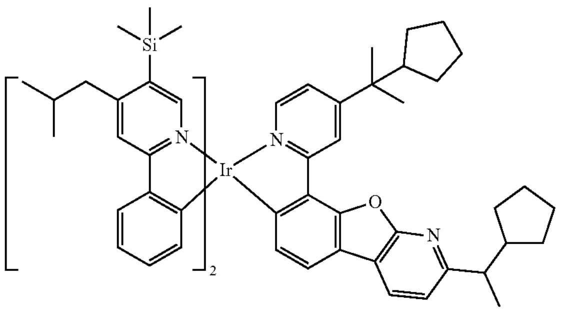
154
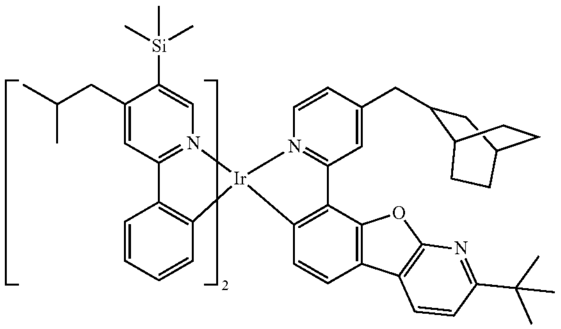
155
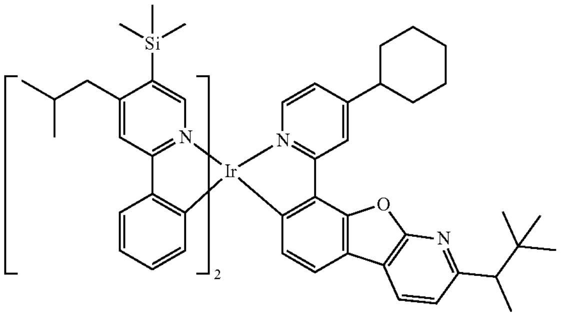
-continued
156
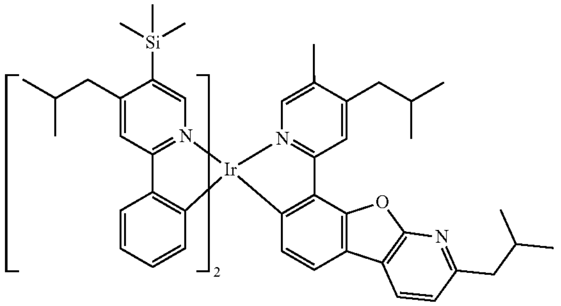
157
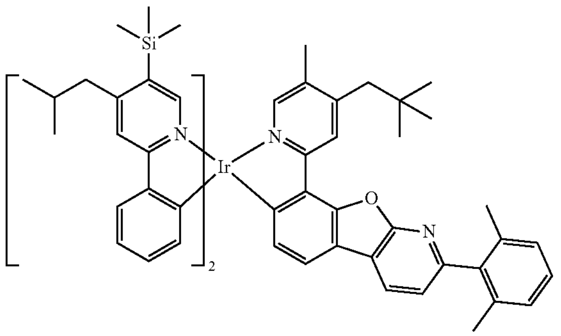
158
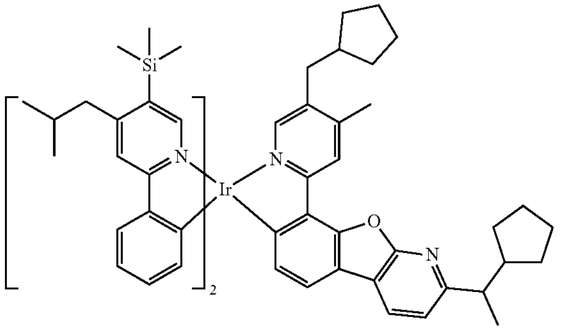
159
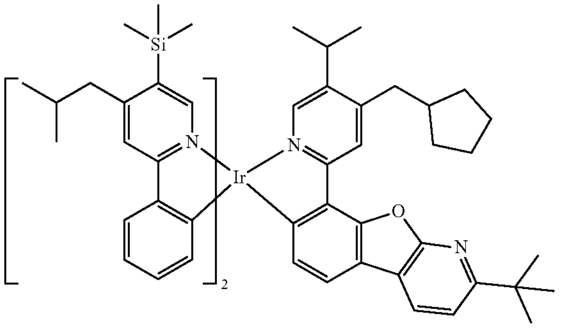

-continued
160
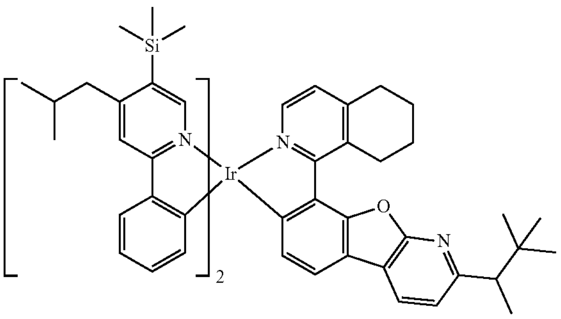
161
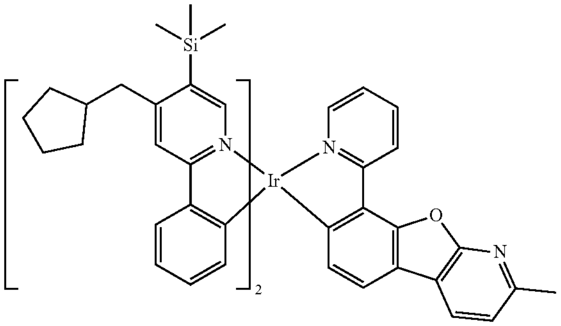
162
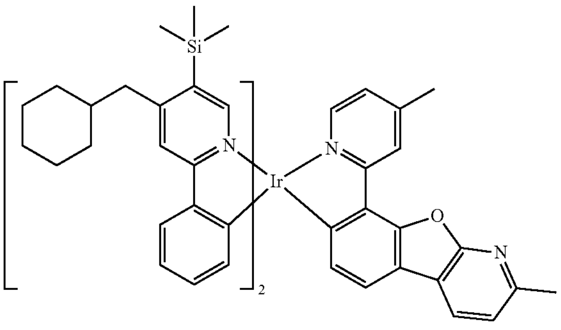
163
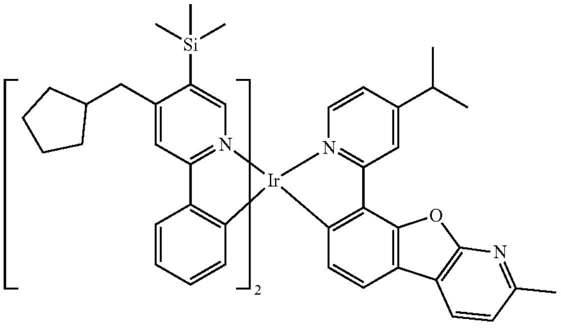
-continued
164
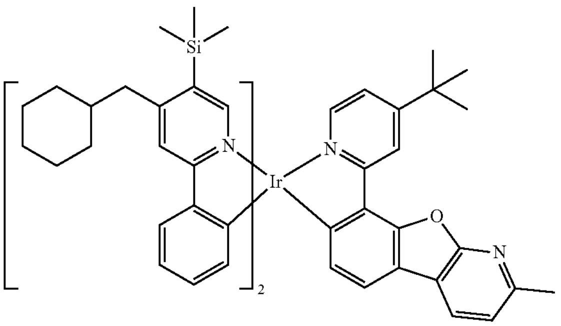
165
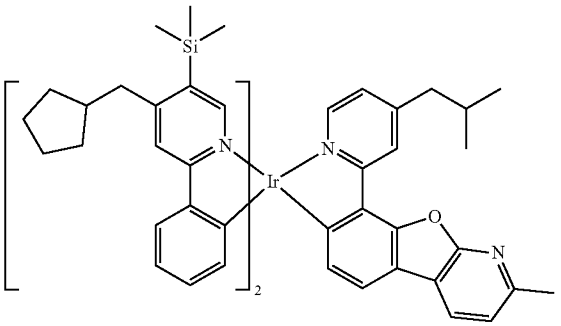
166
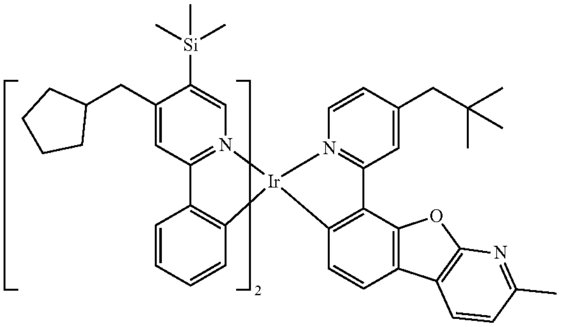
167
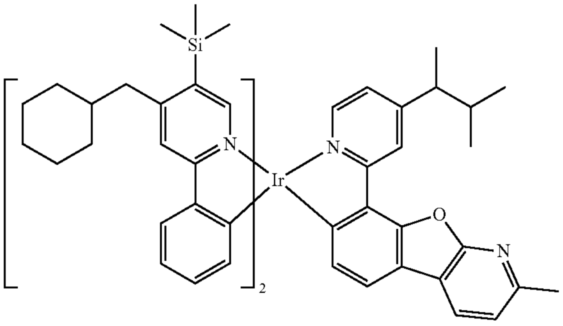

-continued
168
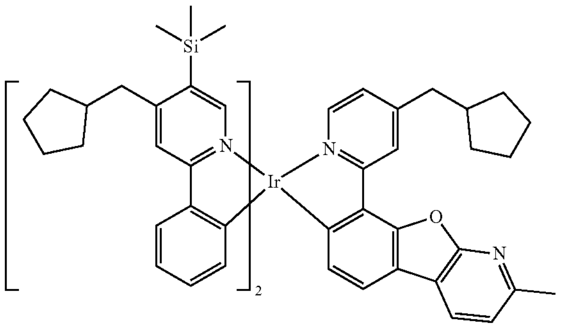
169
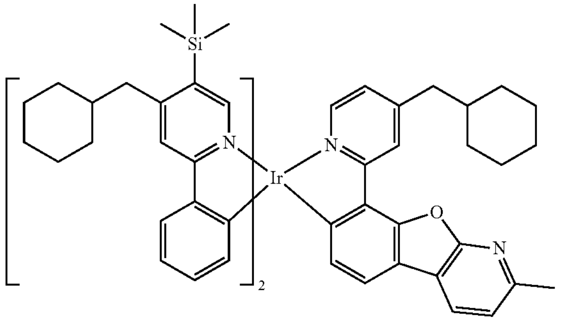
170
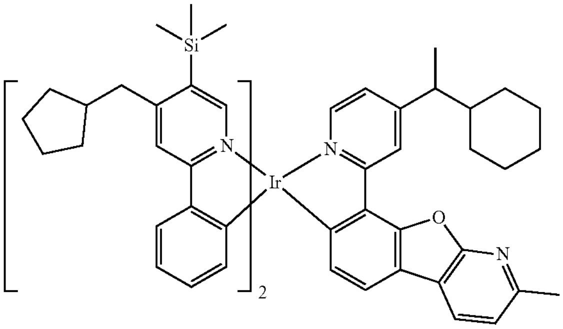
171
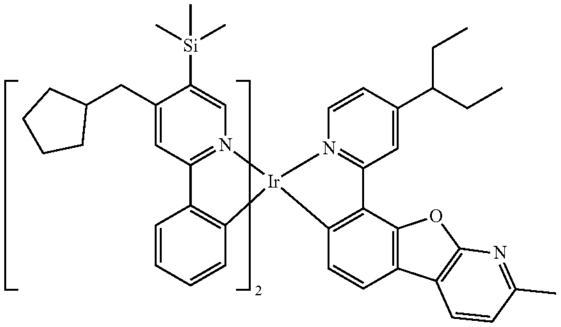
-continued
172
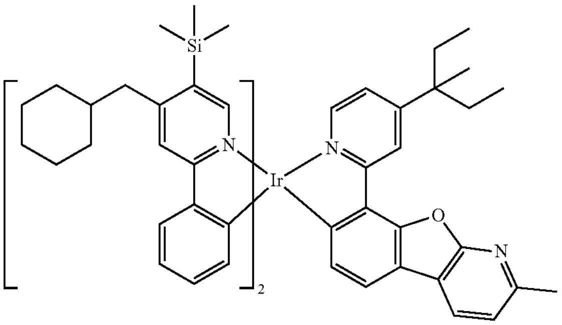
173
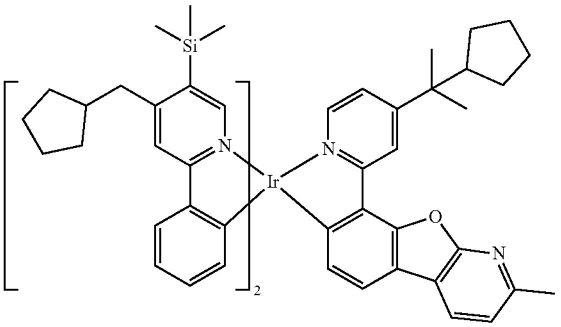
174
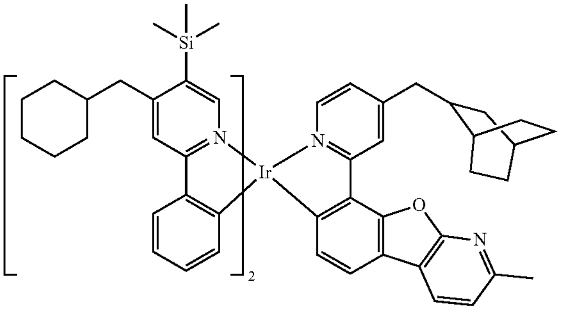
175
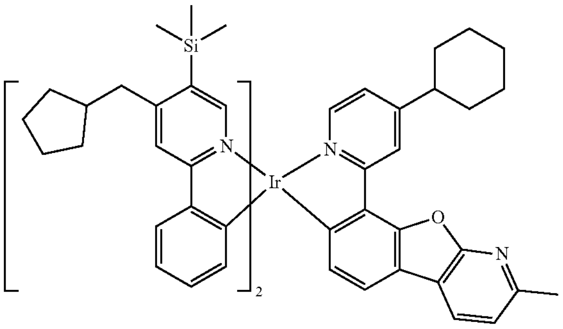

-continued
176
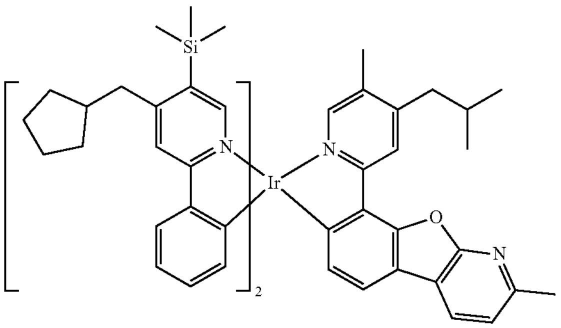
177
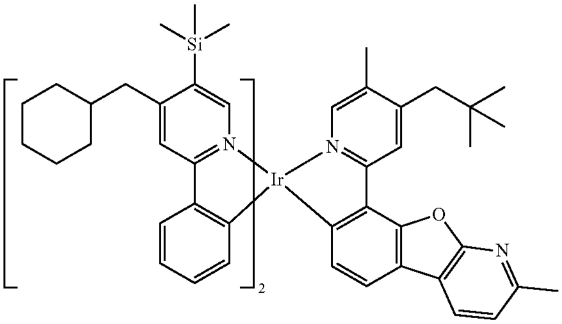
178
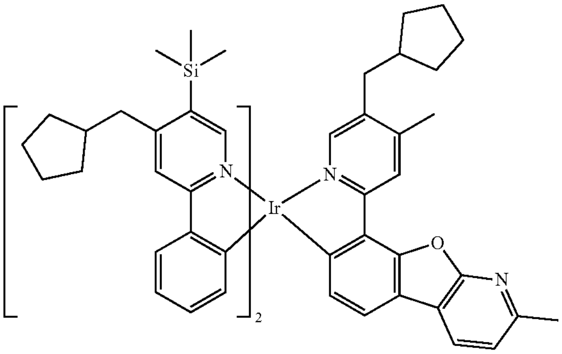
179
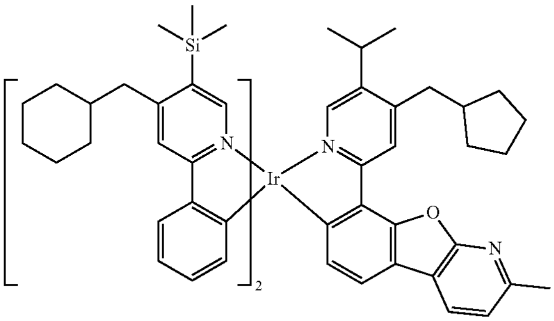
-continued
180
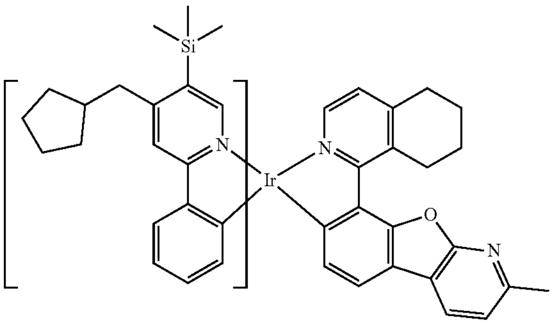
181
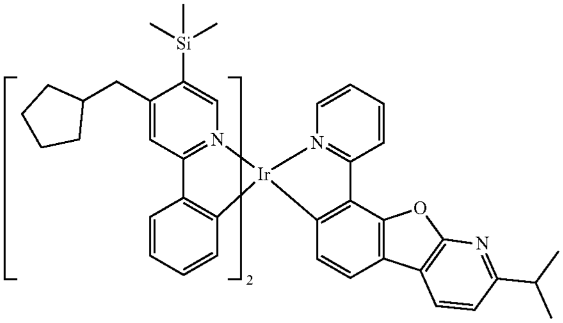
182
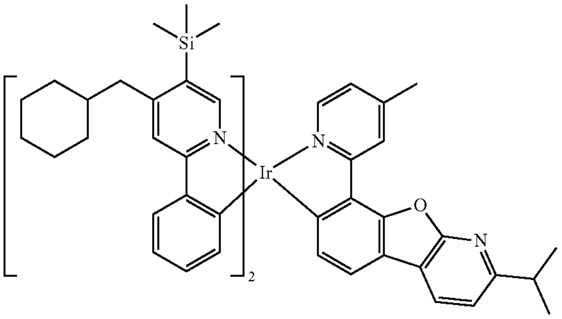
183
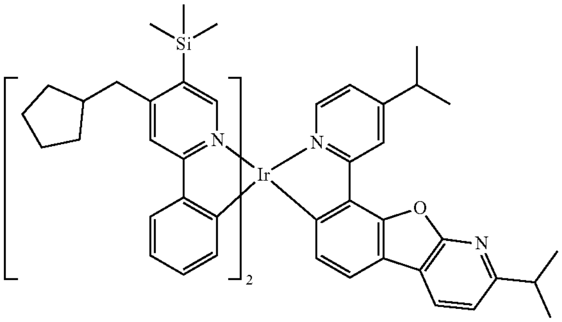

-continued
184
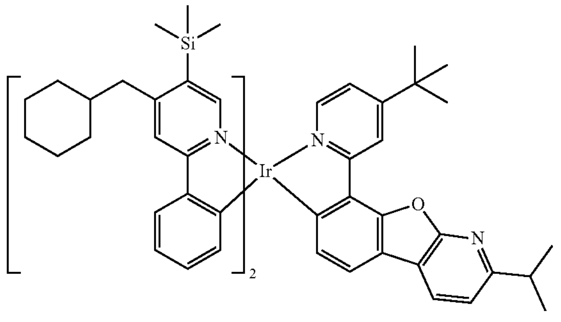
185
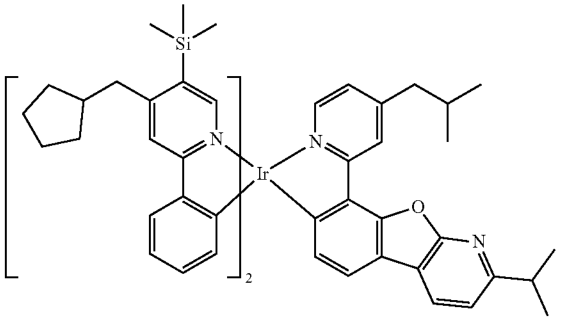
186
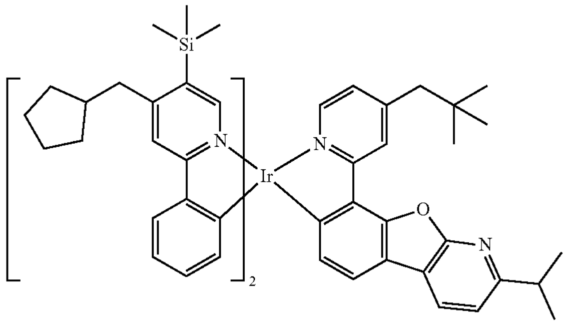
187
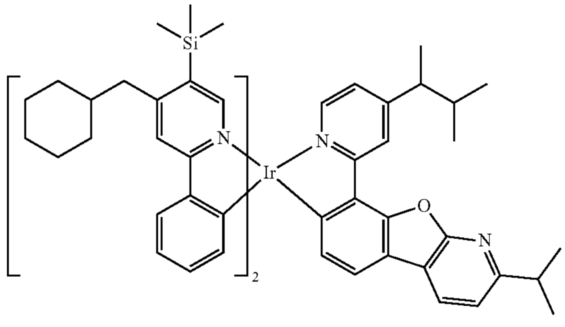
-continued
188
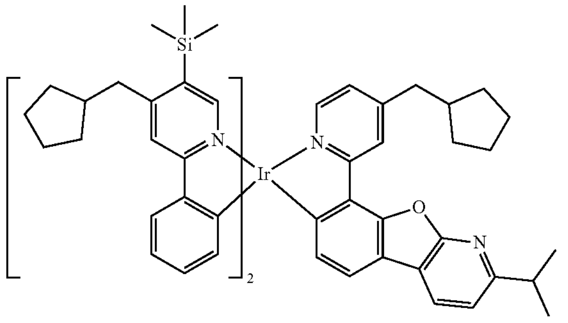
189
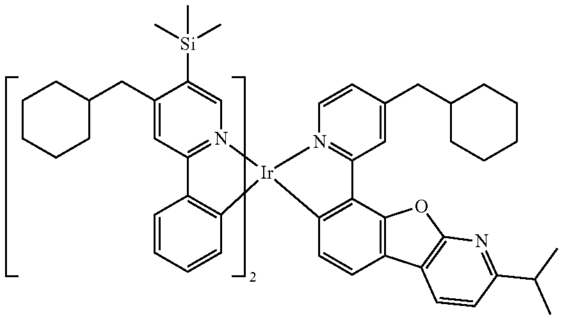
190
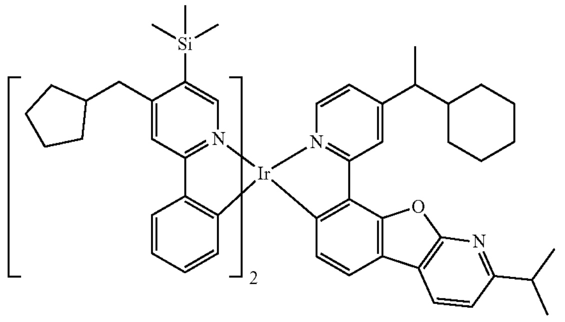
191
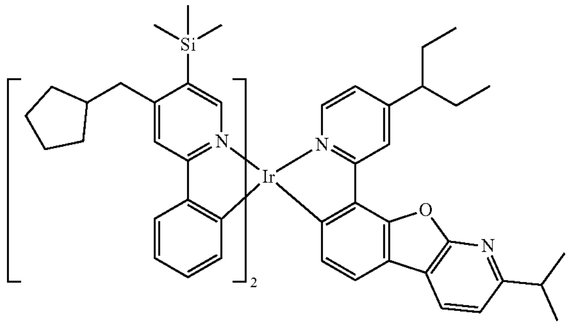

-continued
192
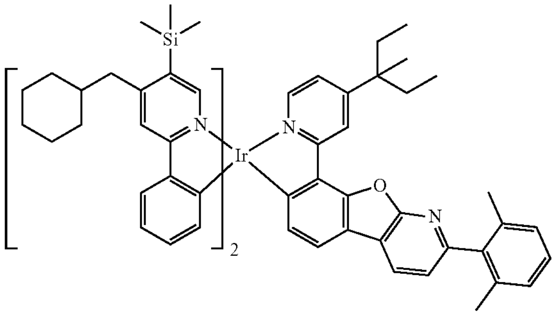
193
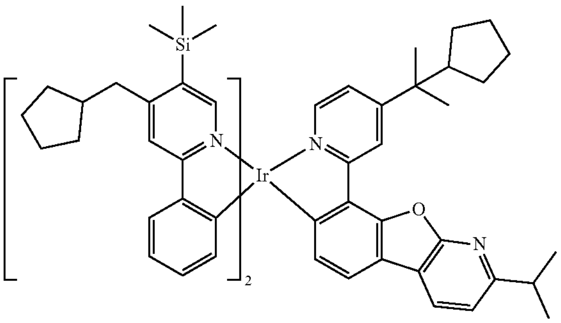
194
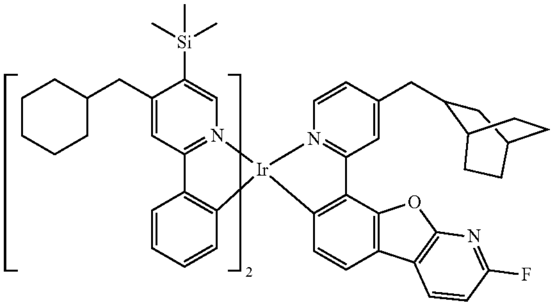
195
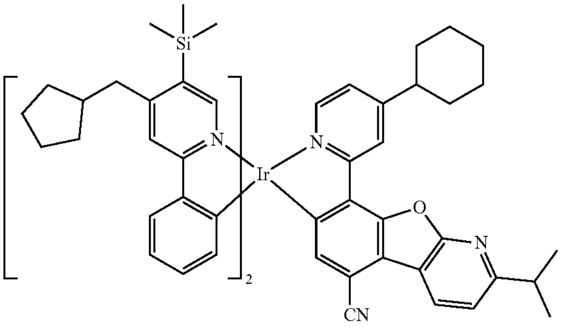
-continued
196
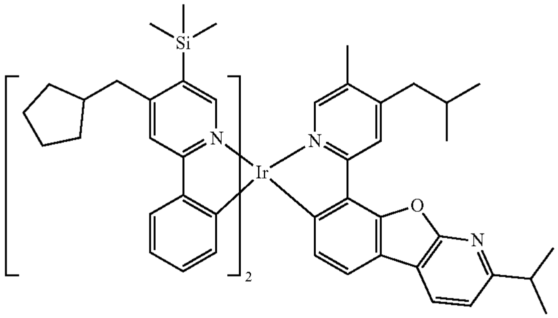
197
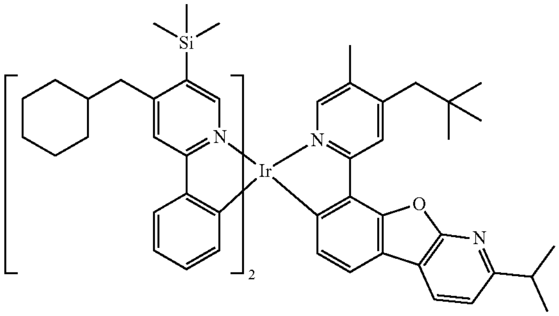
198
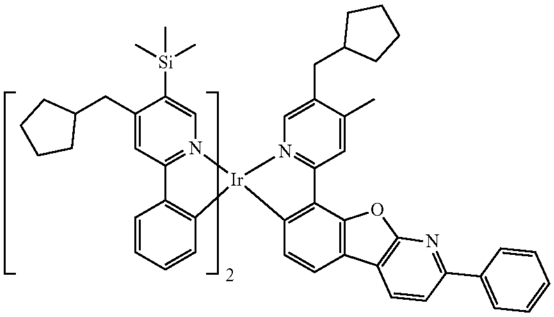
199
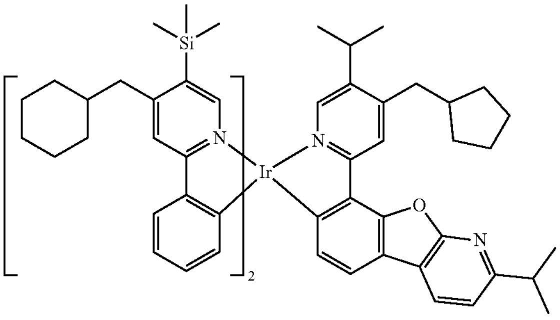

-continued
200
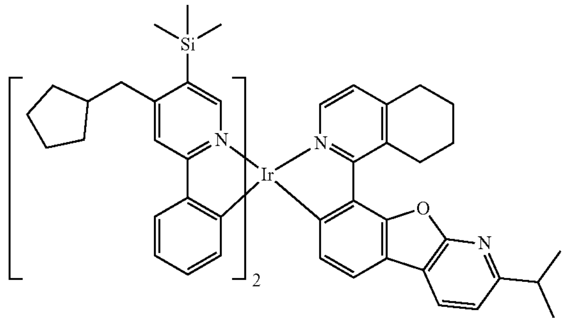
201
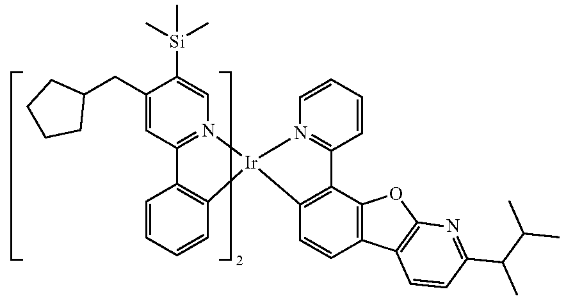
202
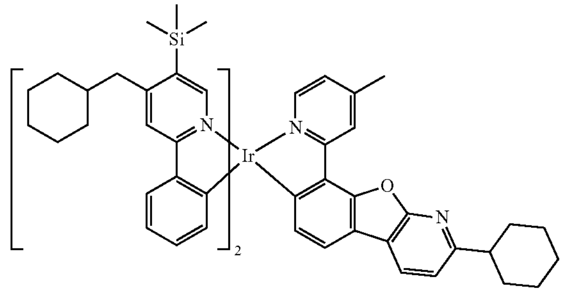
203
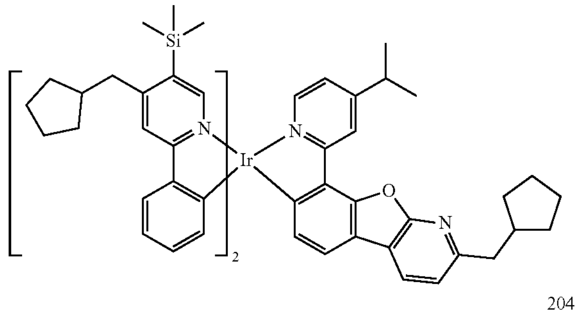
204
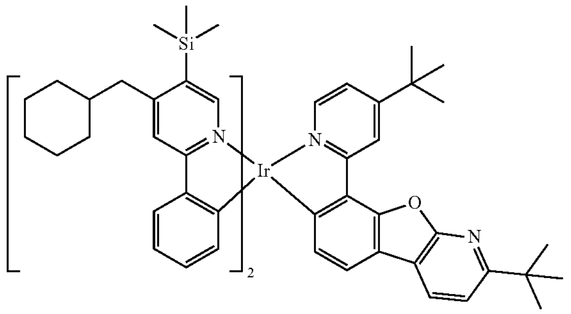
-continued
205
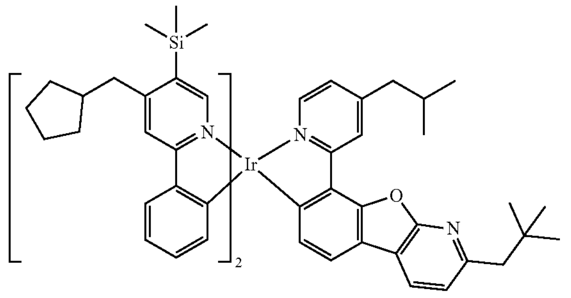
206
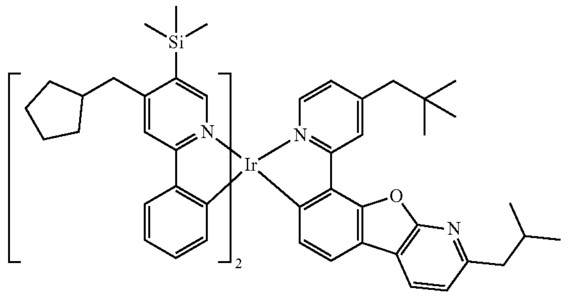
207
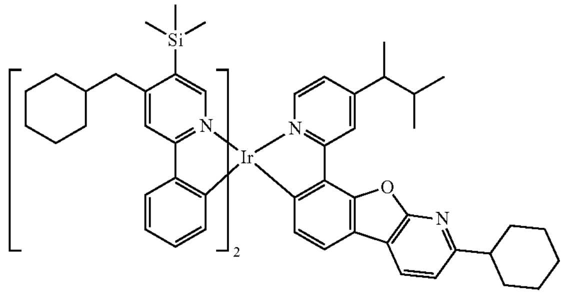
208
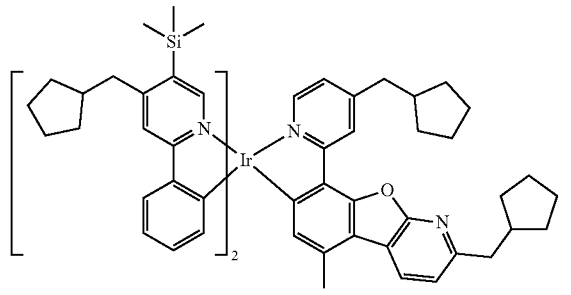
209
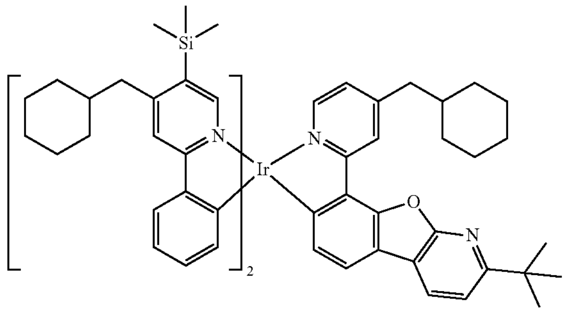

-continued
210
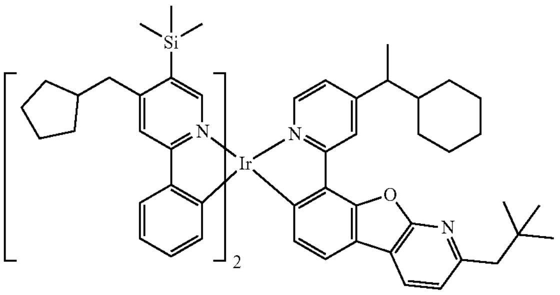
211
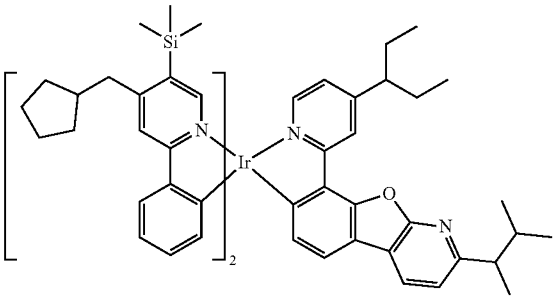
212
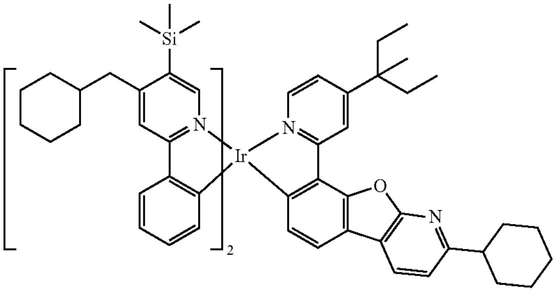
213
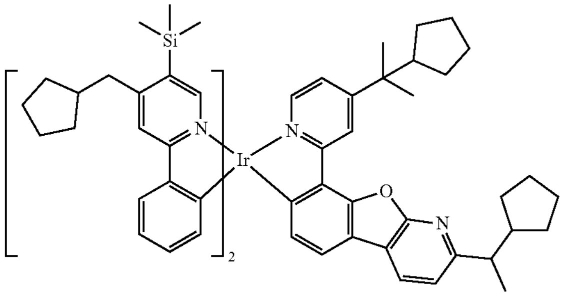
214
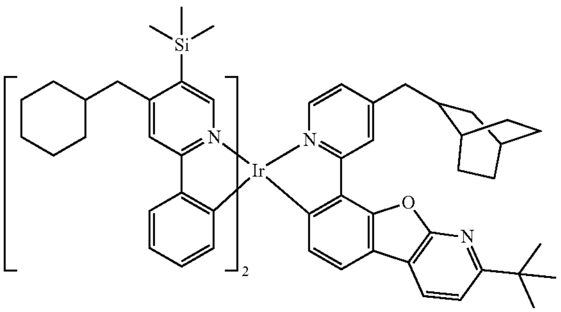
-continued
215
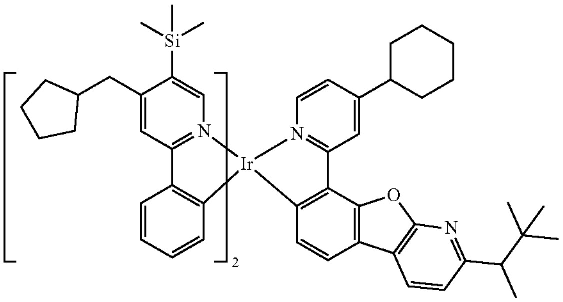
216
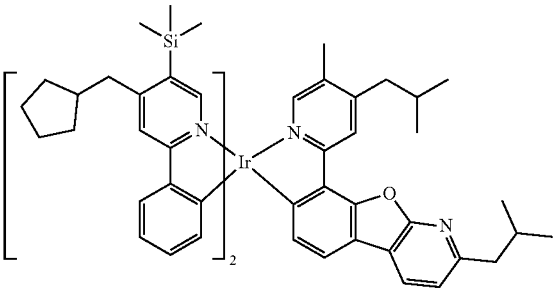
217
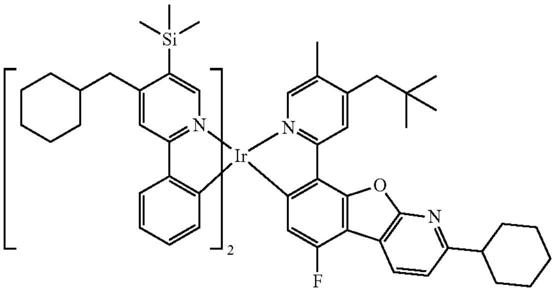
218
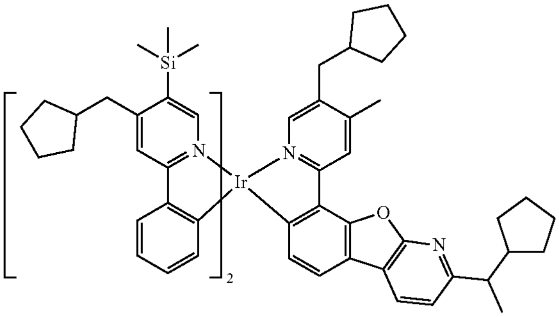
219
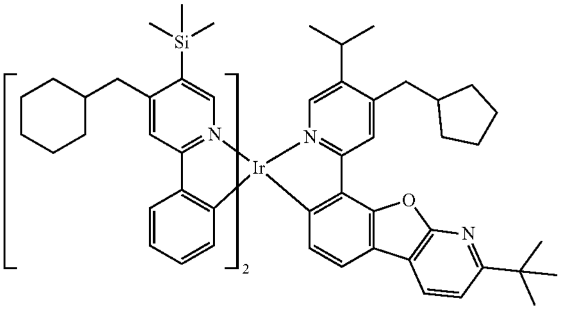

-continued
220
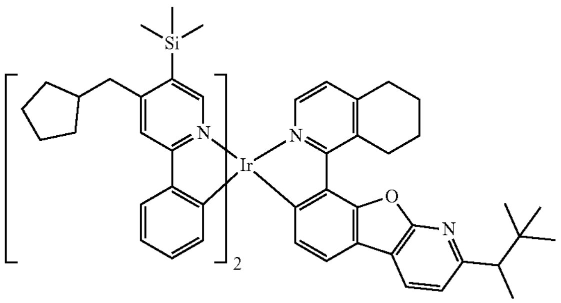
221
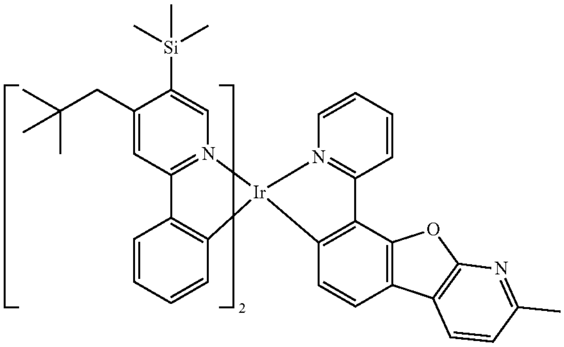
222
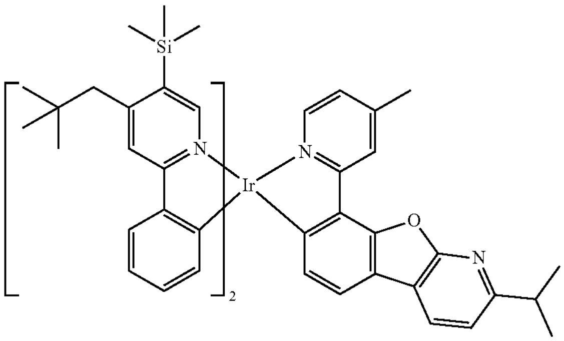
223
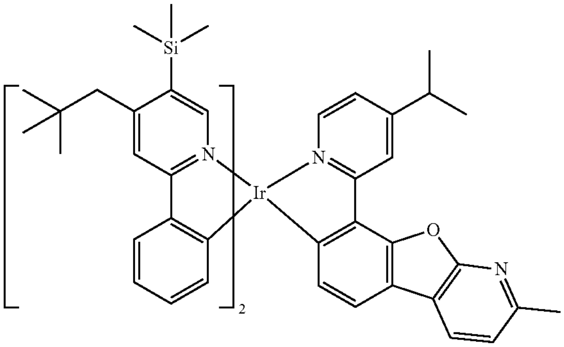
-continued
224
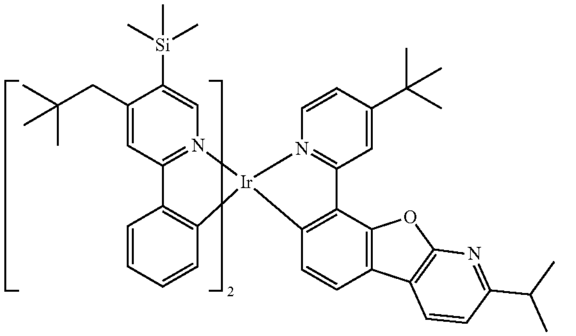
225
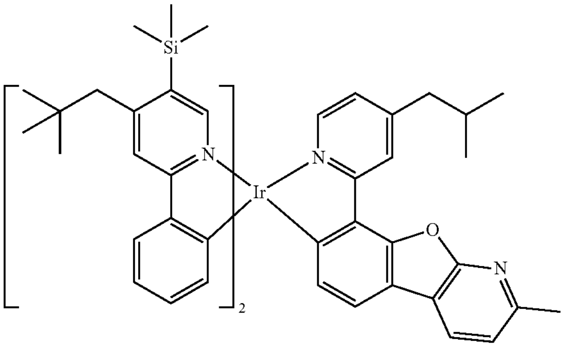
226
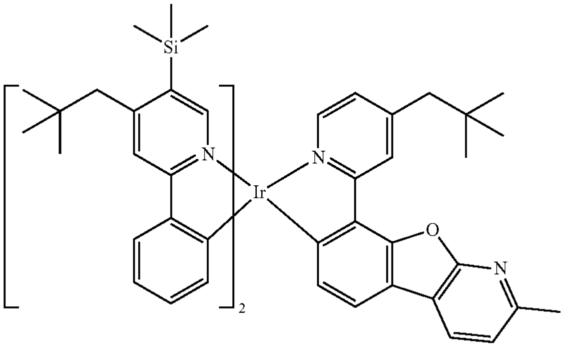
227
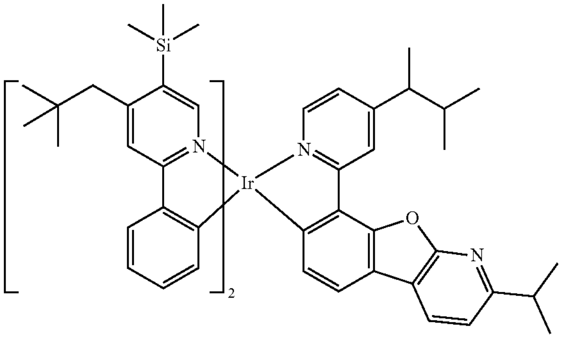

-continued
228
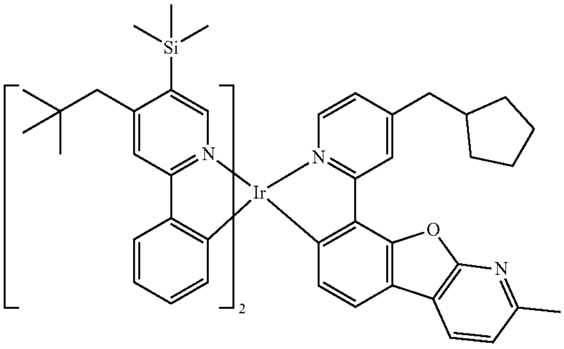
229
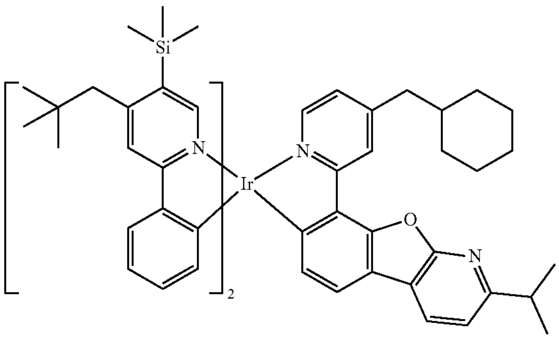
230
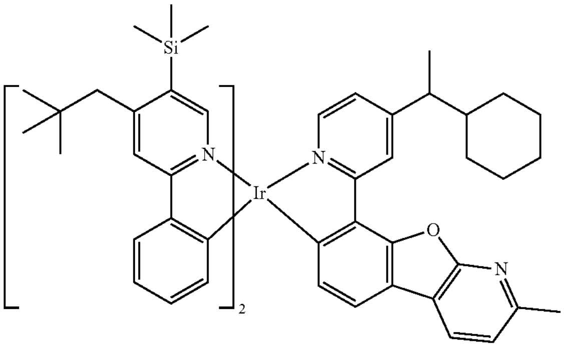
231
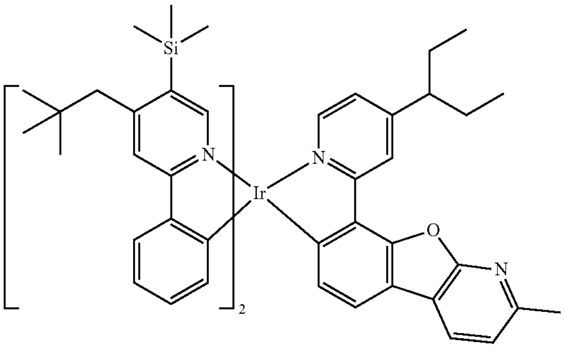
-continued
232
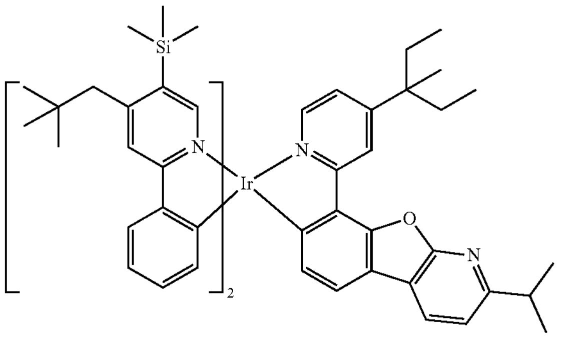
233
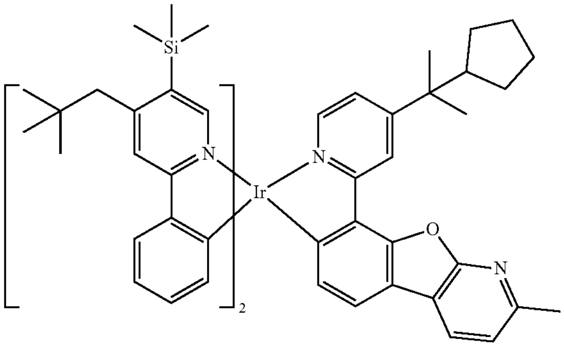
234
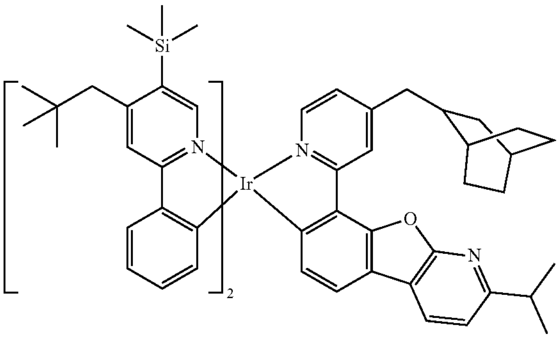
235
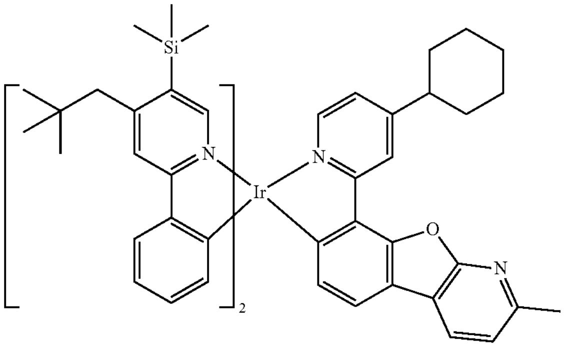

-continued
236
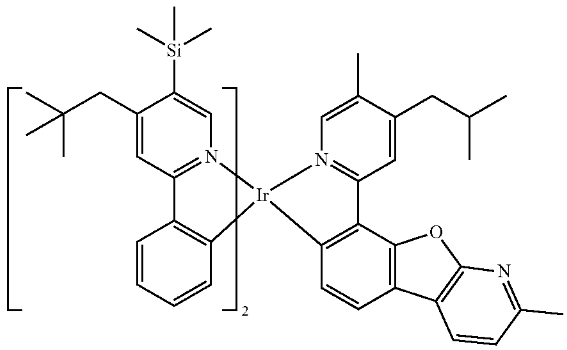
237
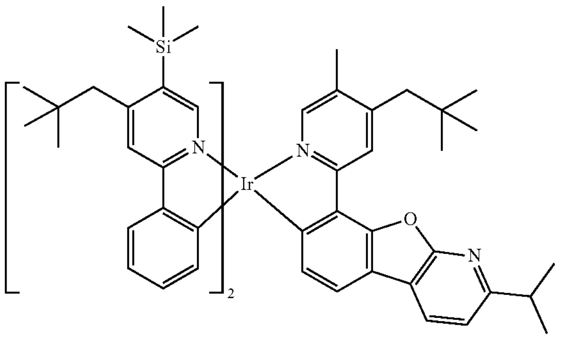
238
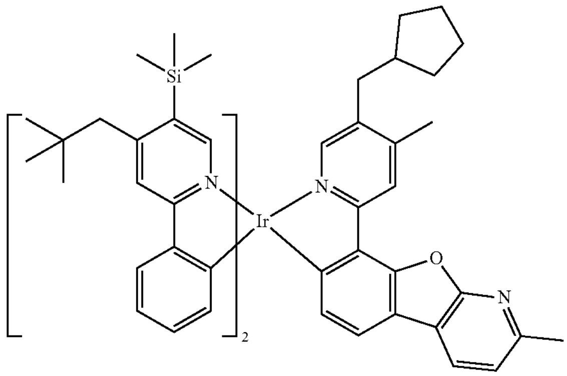
239
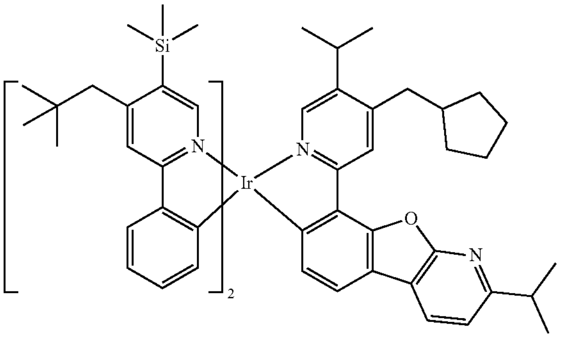
-continued
240
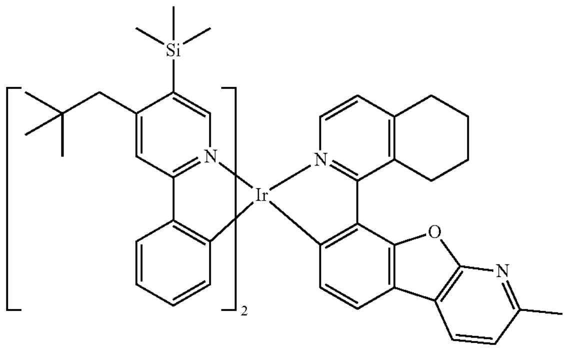
241
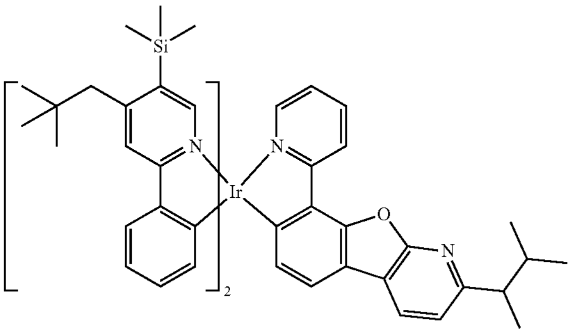
242
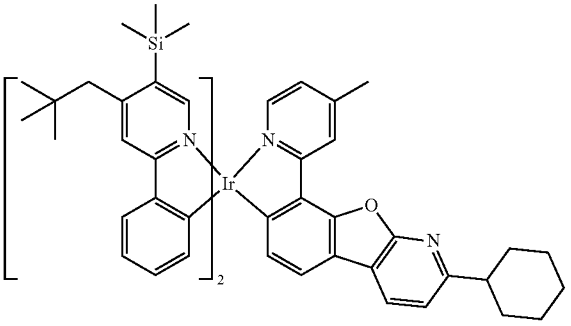
243
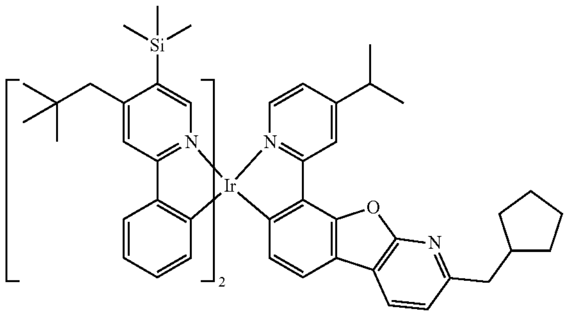

-continued
244
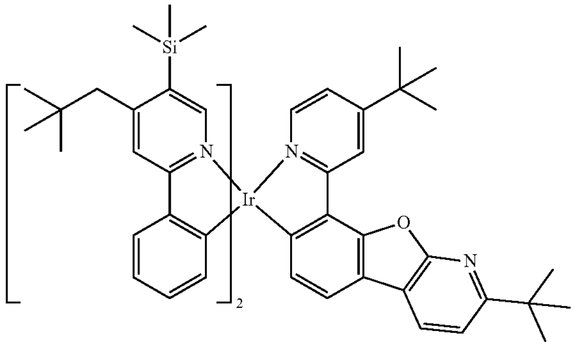
245
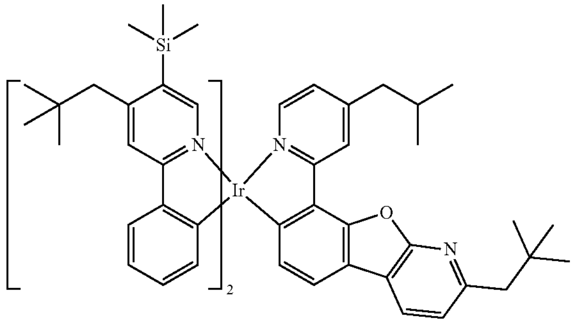
246
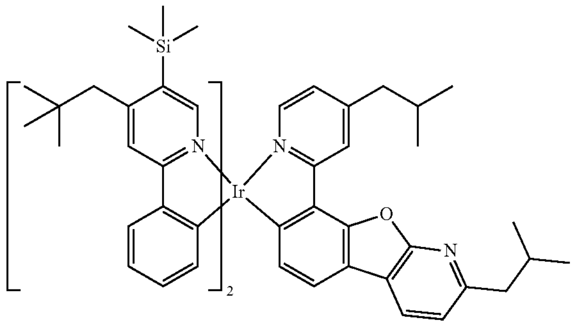
247
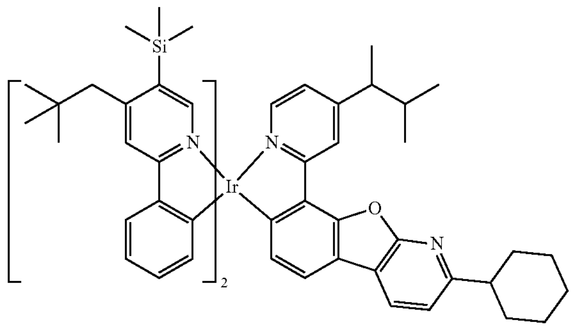
-continued
248
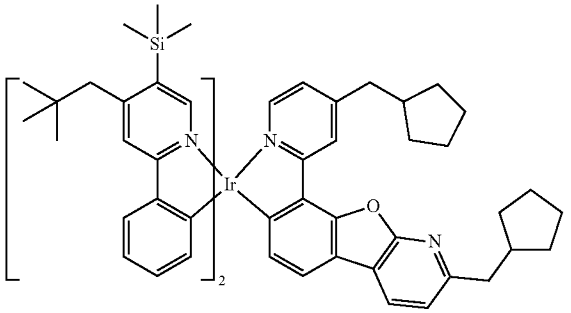
249
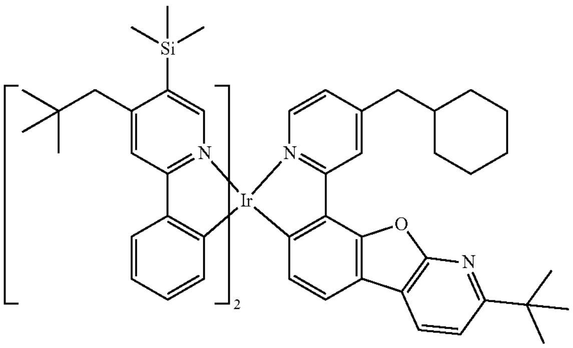
250
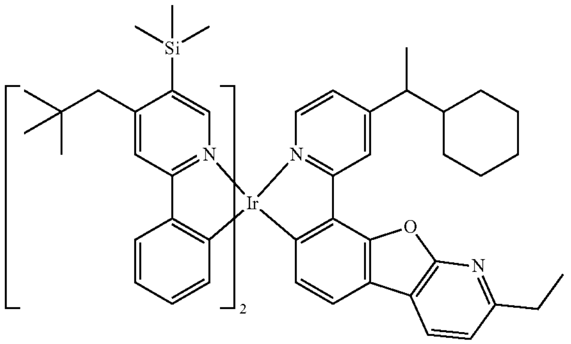
251
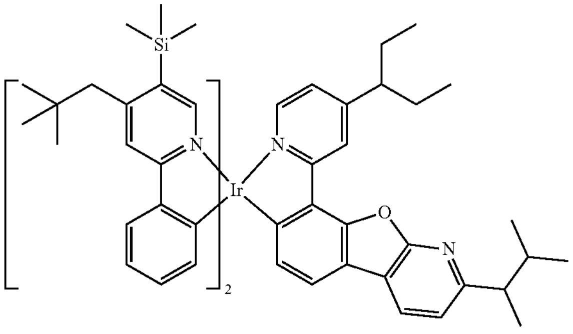

-continued
252
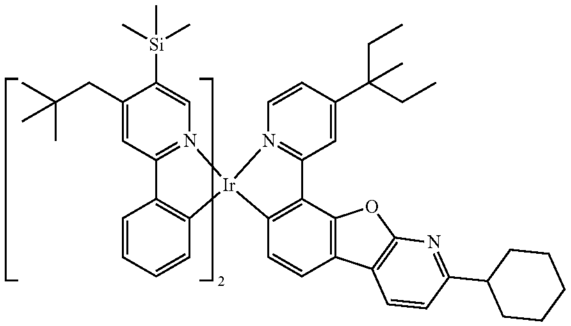
253
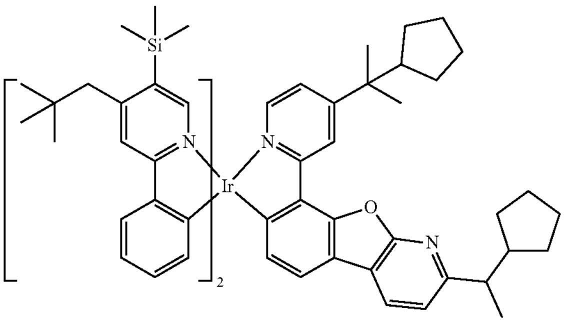
254
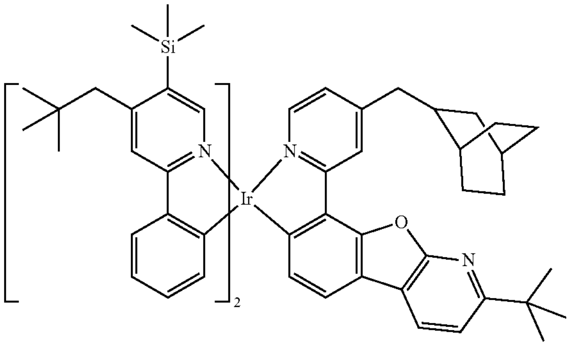
255
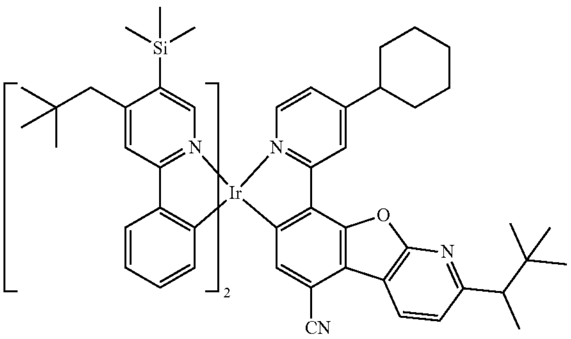
-continued
256
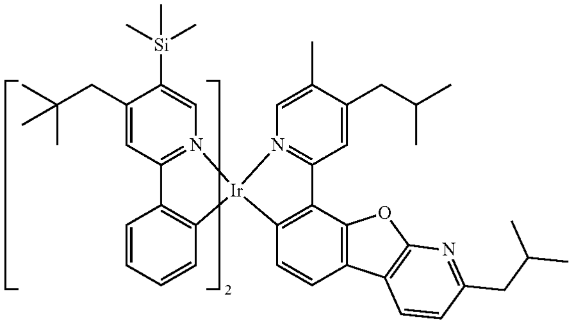
257
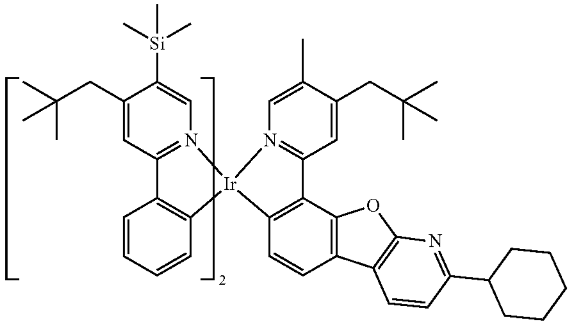
258
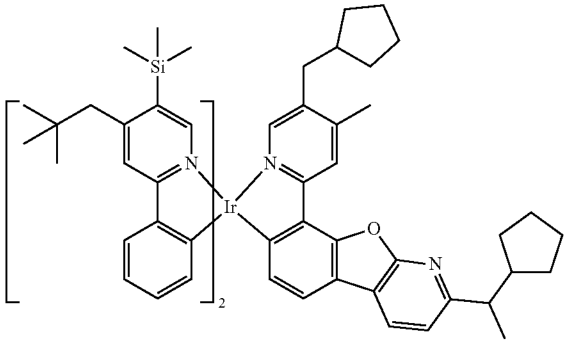
259
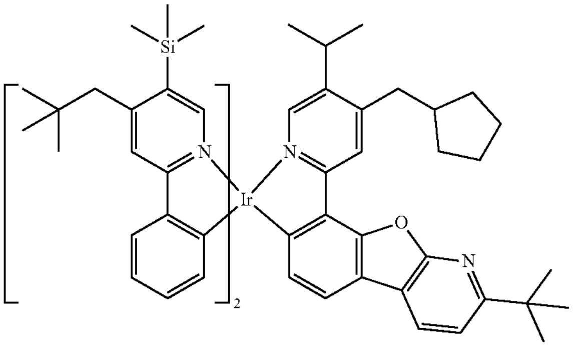

-continued
260
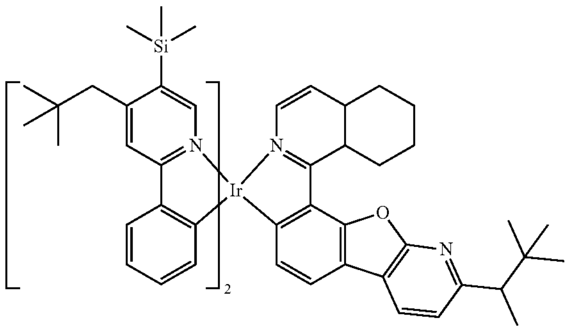
261
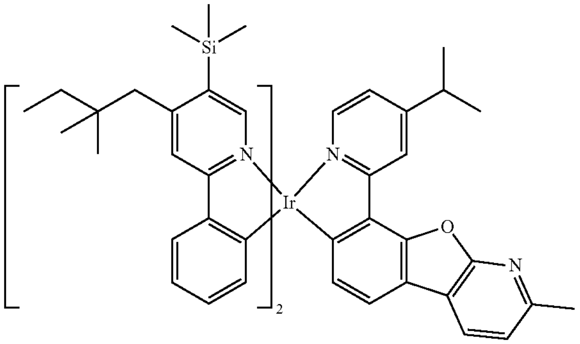
262
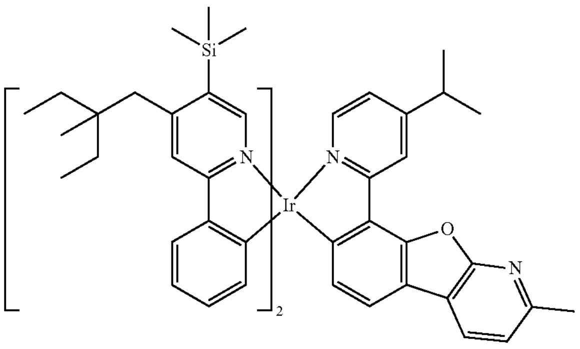
263
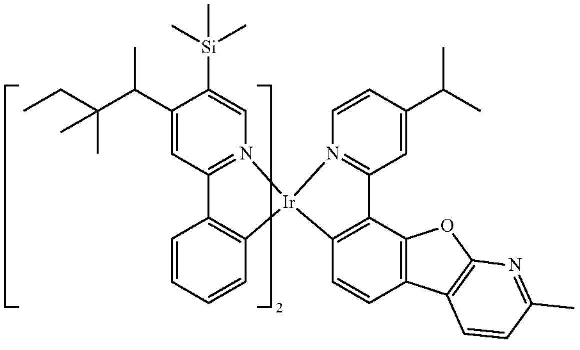
-continued
264
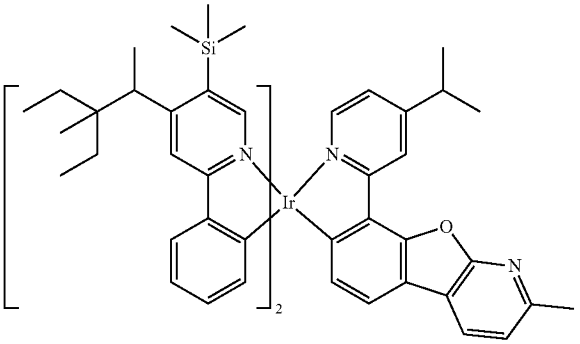
265
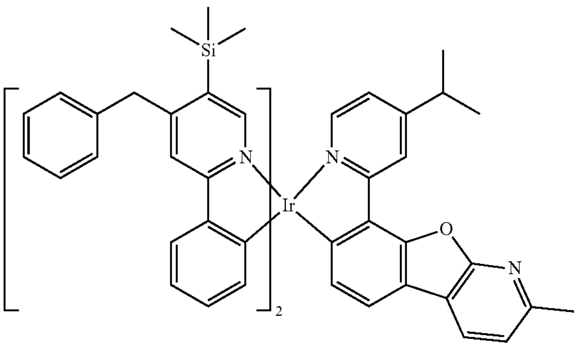
266
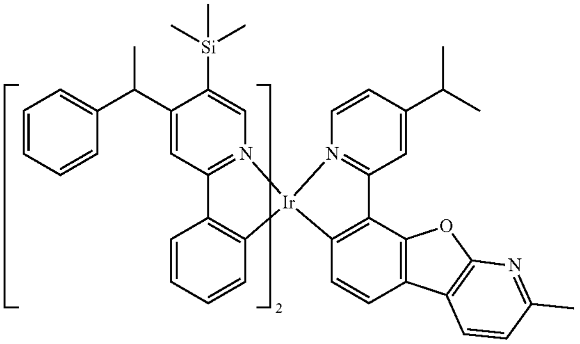
267
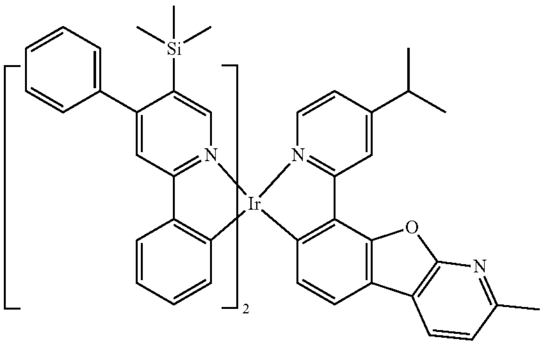

-continued
268
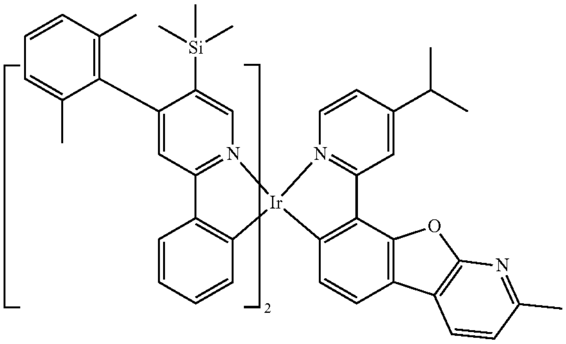
269
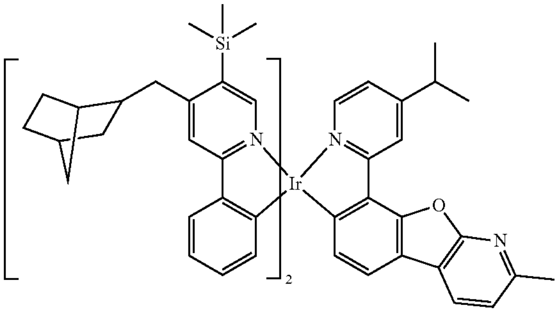
270
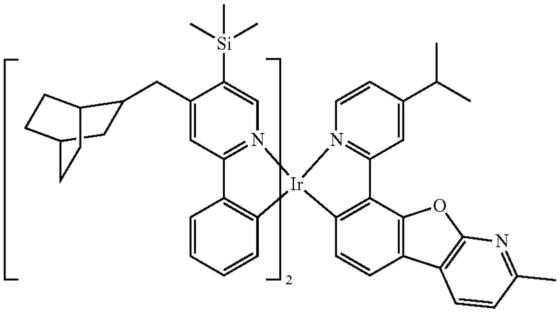
271
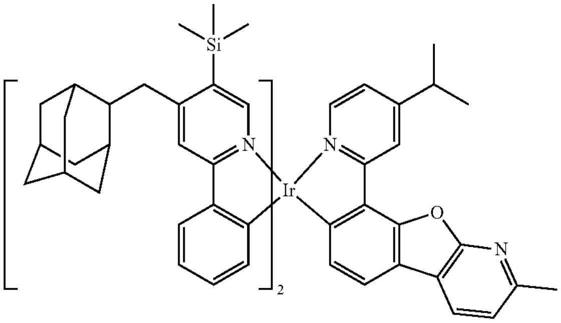
-continued
272
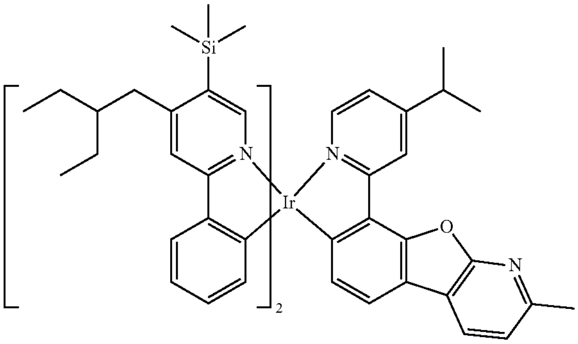
273
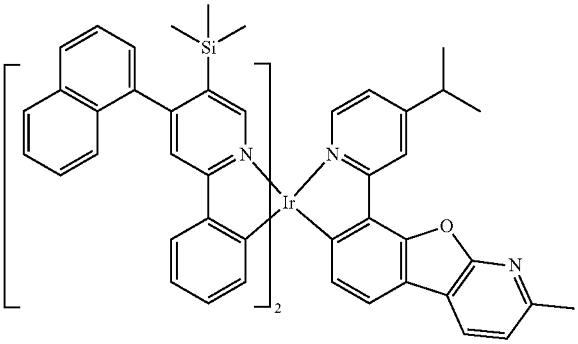
274
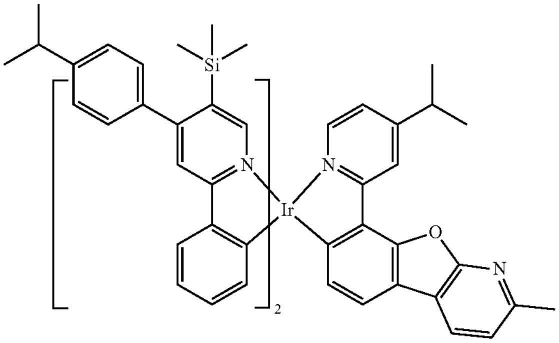
275
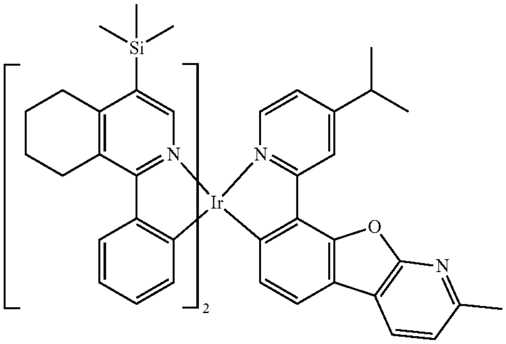

-continued
276
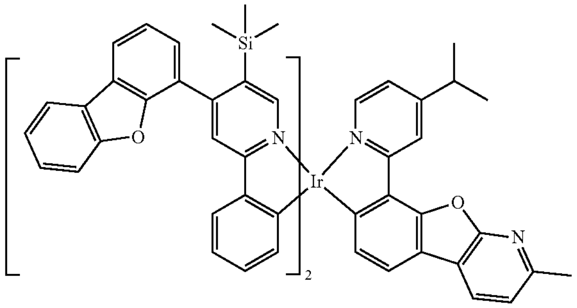
277
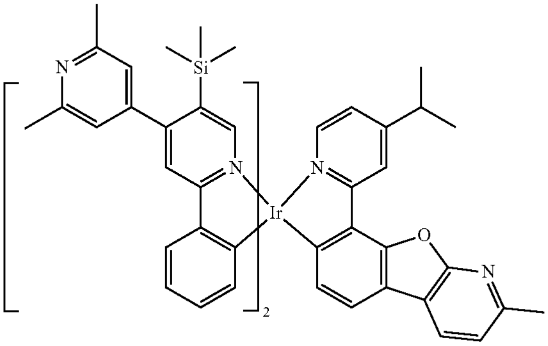
278
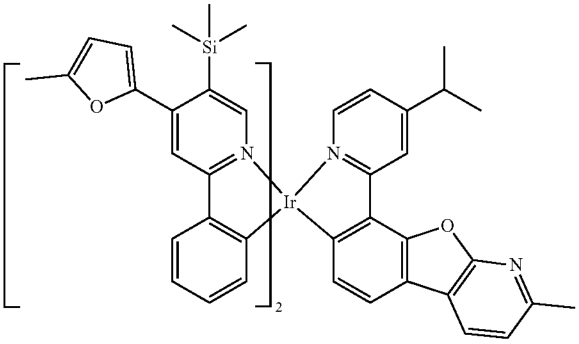
279
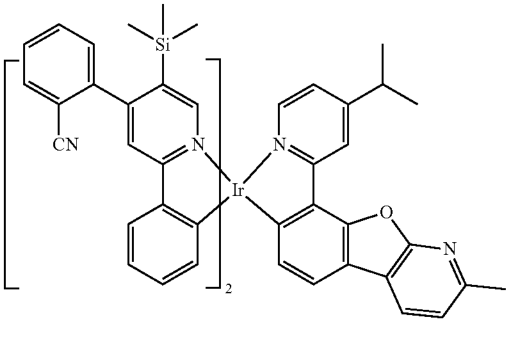
-continued
280
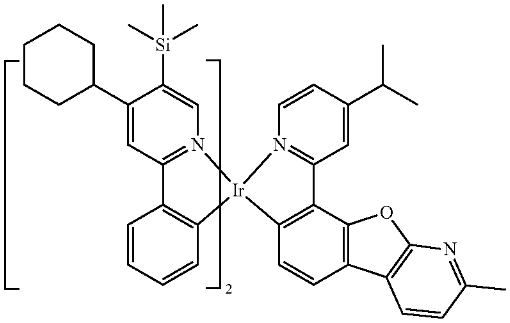
281
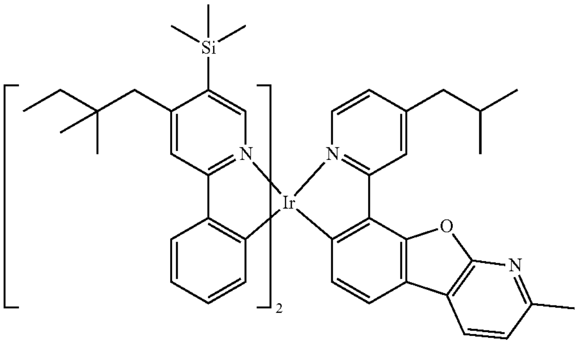
282
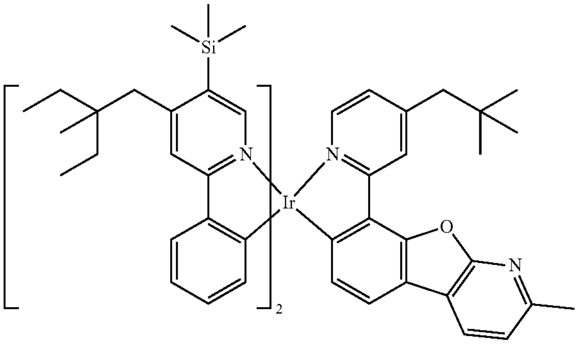
283
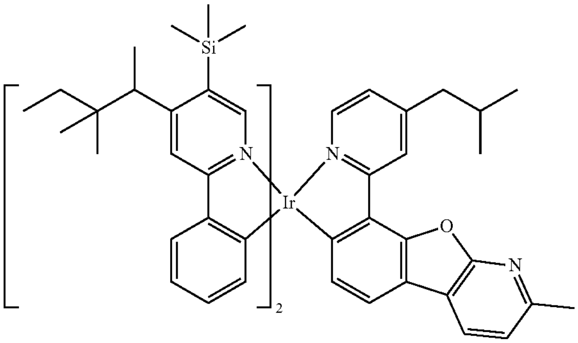

-continued
284
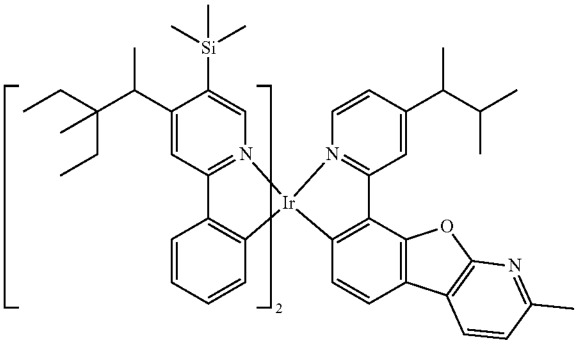
285
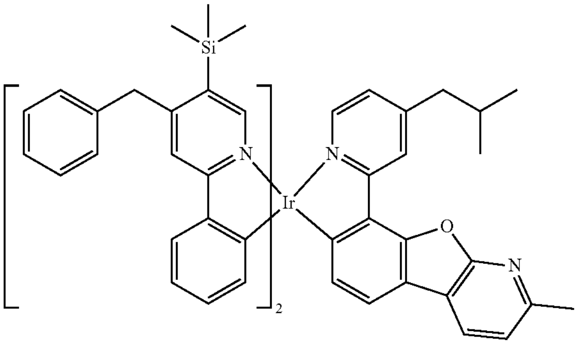
286
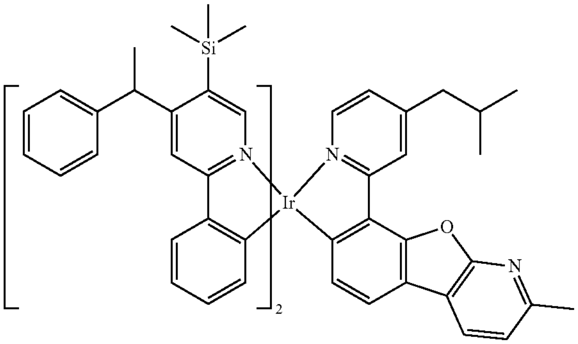
287
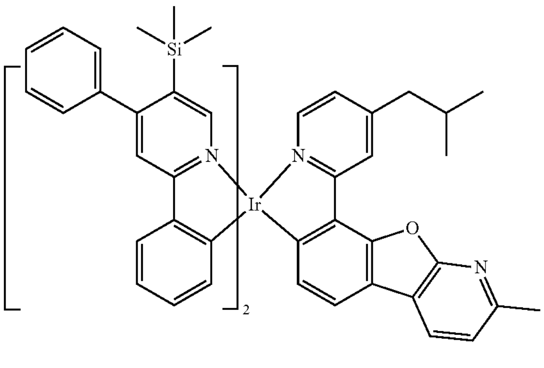
-continued
288
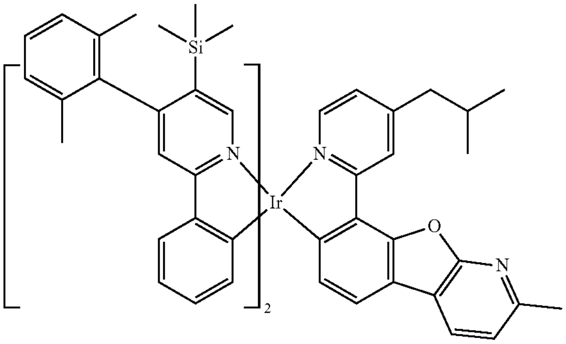
289
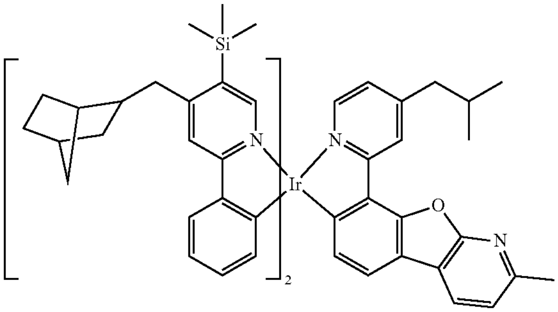
290
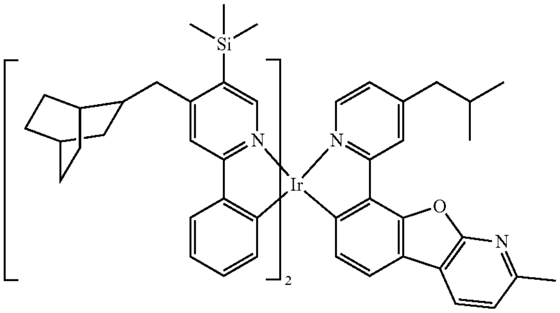
291
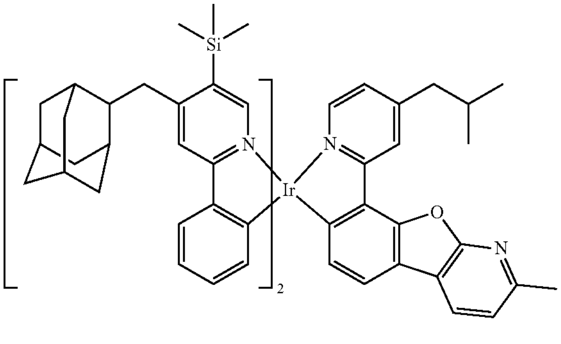

-continued
292
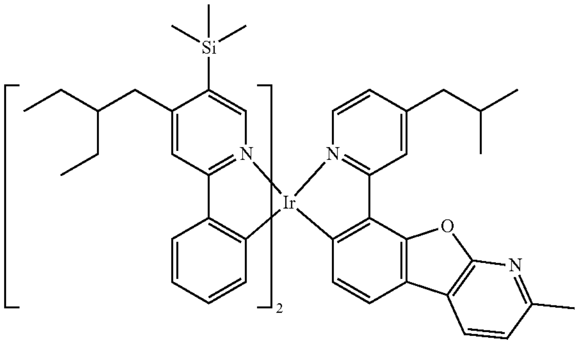
293
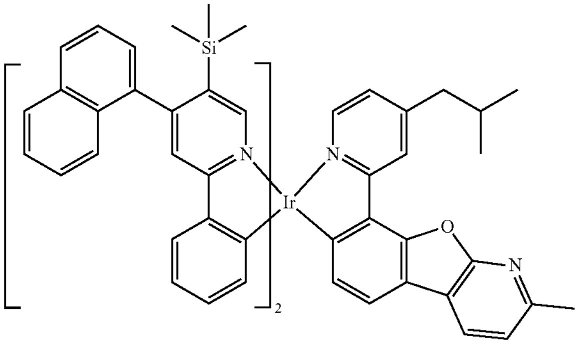
294
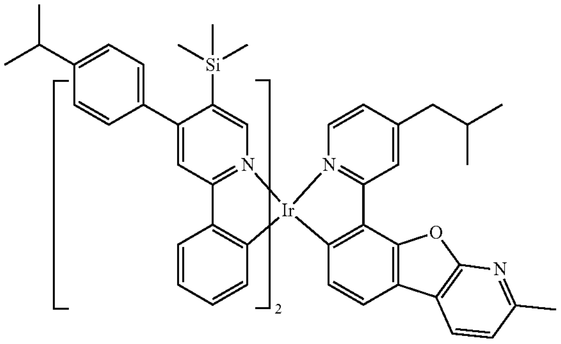
295
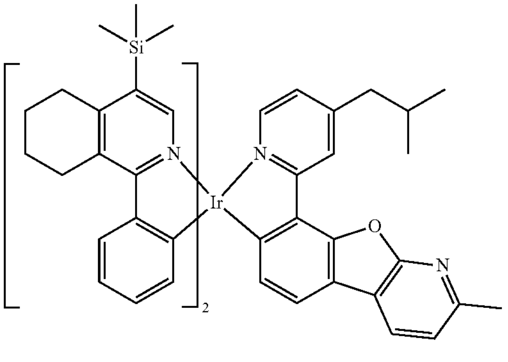
-continued
296
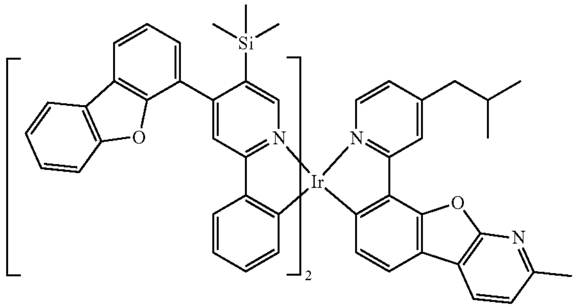
297
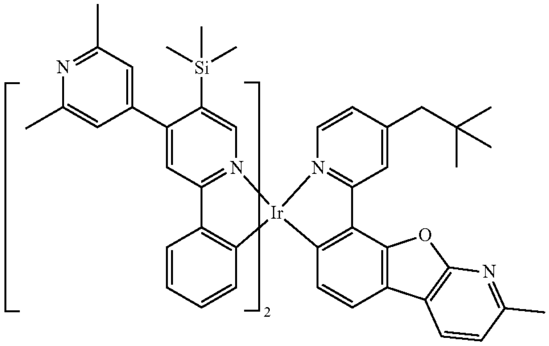
298
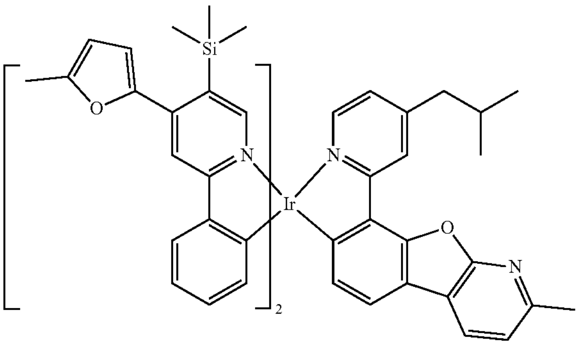
299
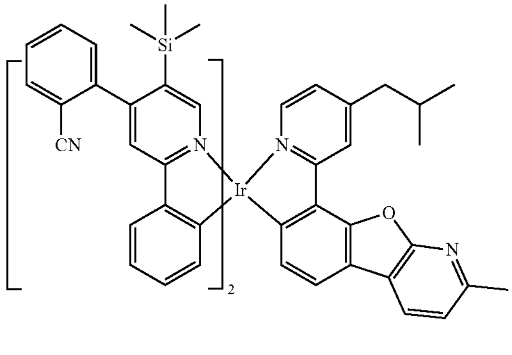

-continued
300
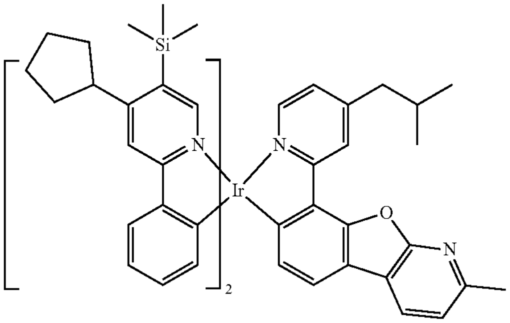
301
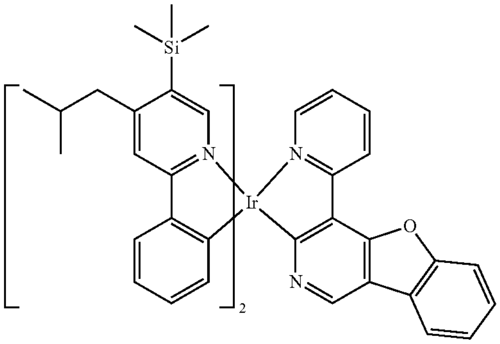
302
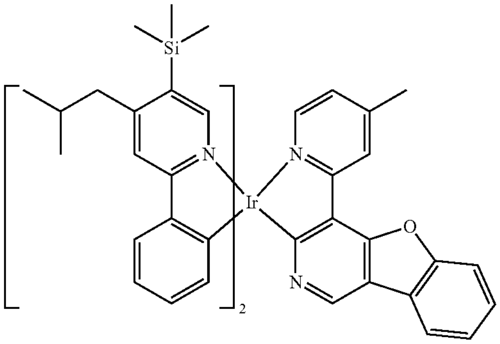
303
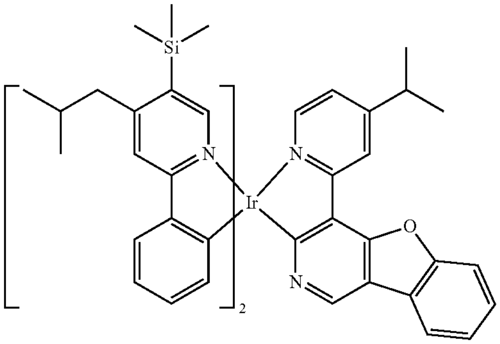
-continued
304
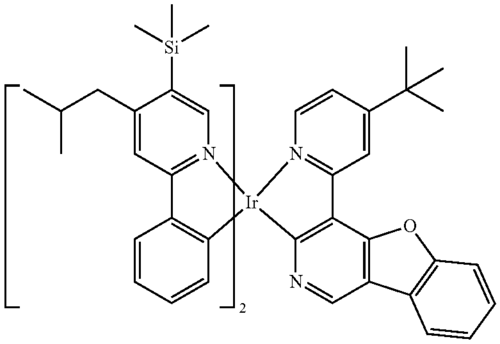
305
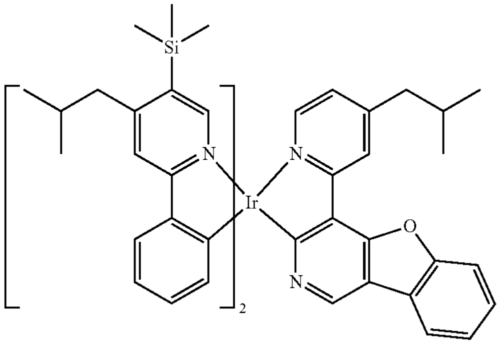
306
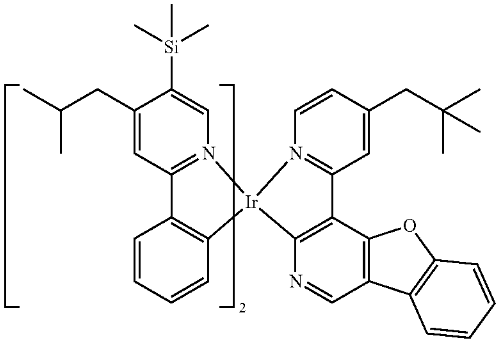
307
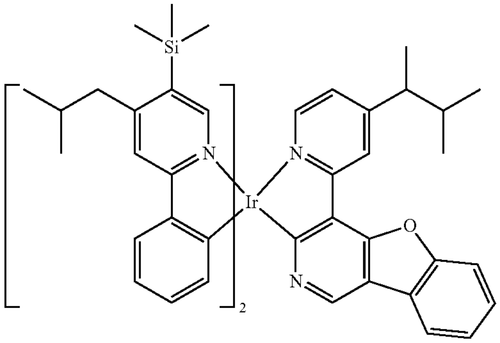

-continued
308
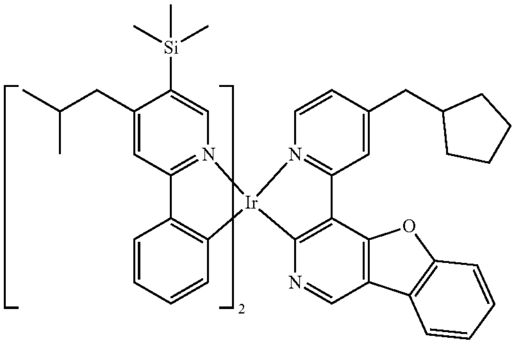
309
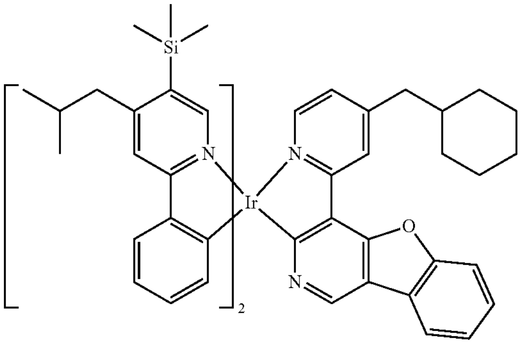
310
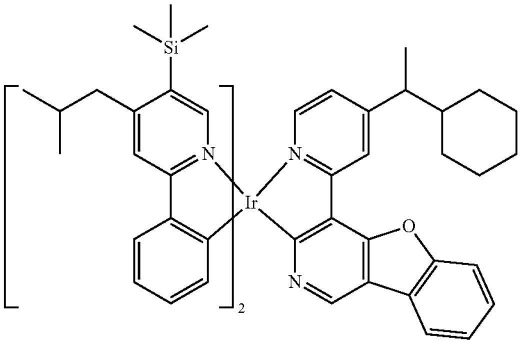
311
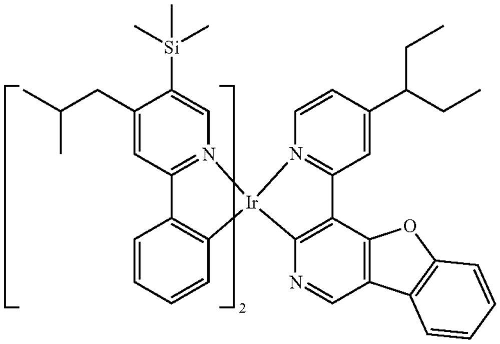
-continued
312
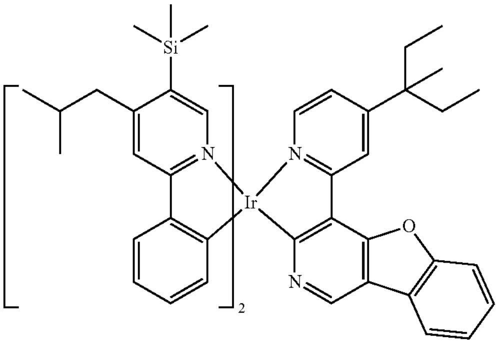
313
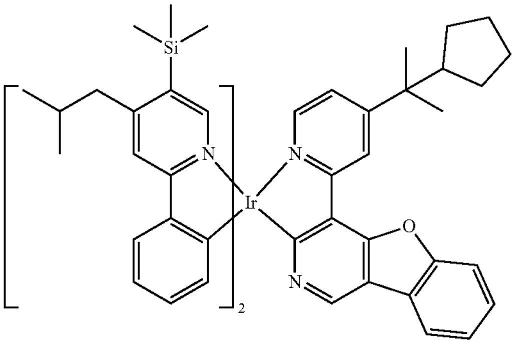
314
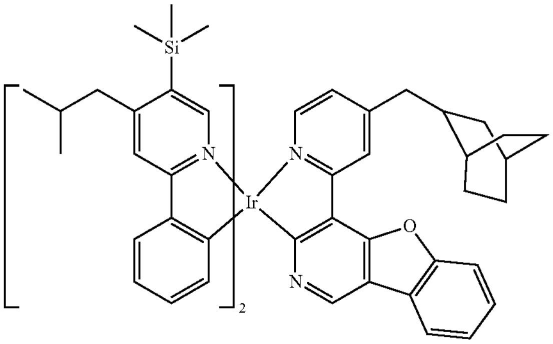
315
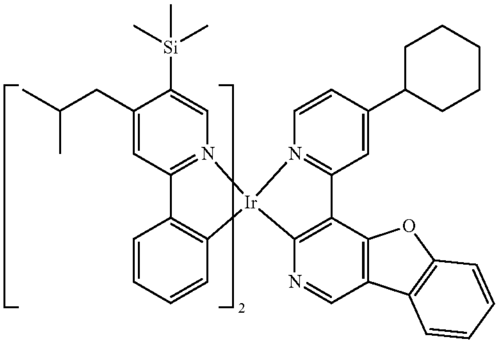

-continued
316
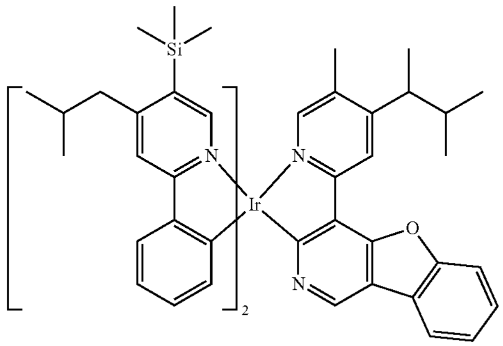
317
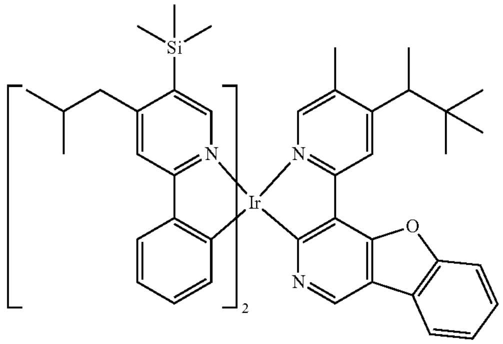
318
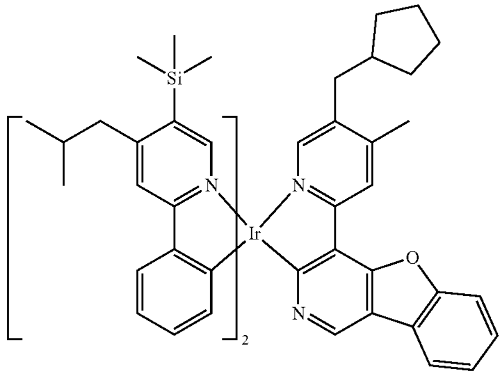
319
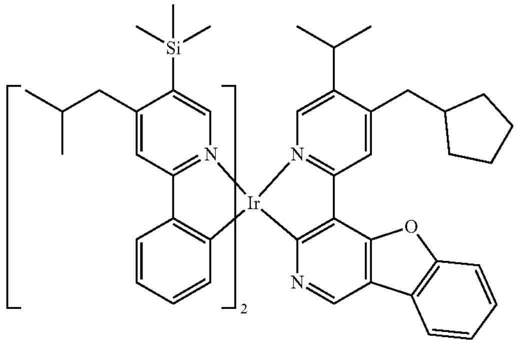
-continued
320
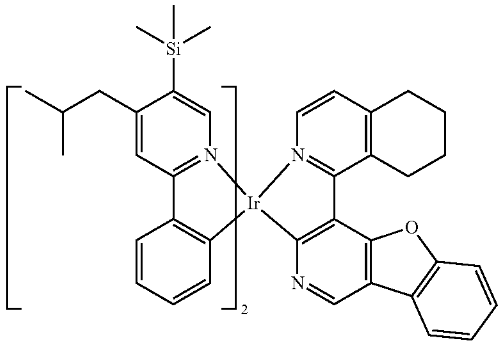
321
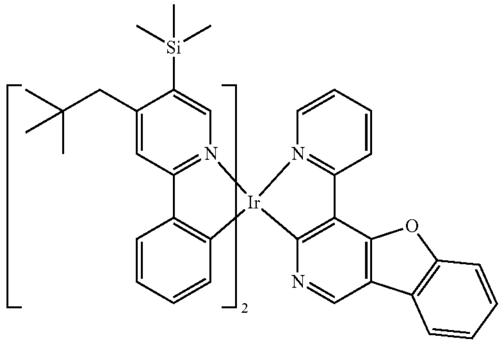
322
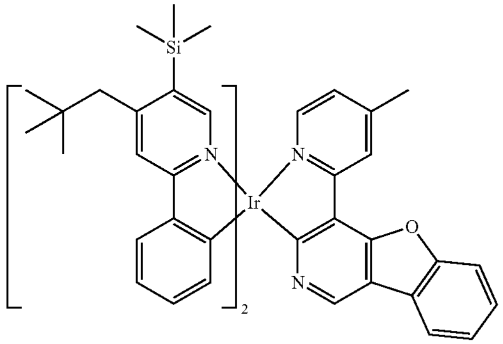
323
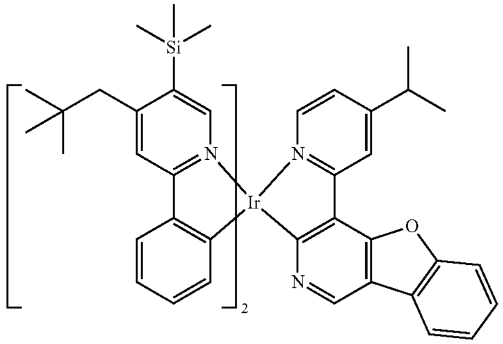

-continued
324
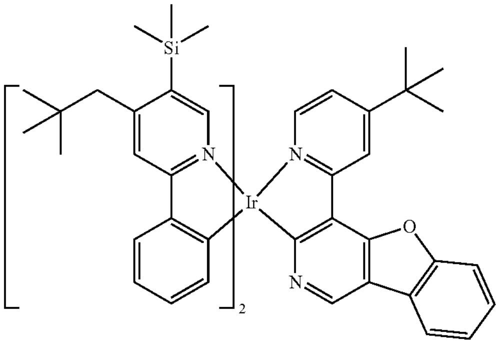
325
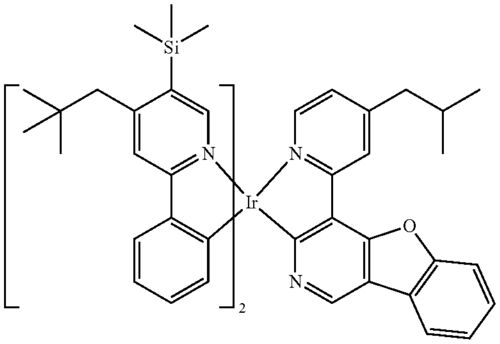
326
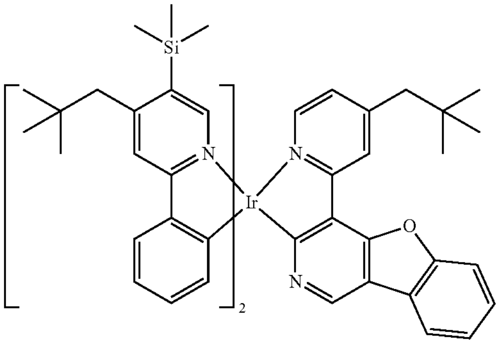
327
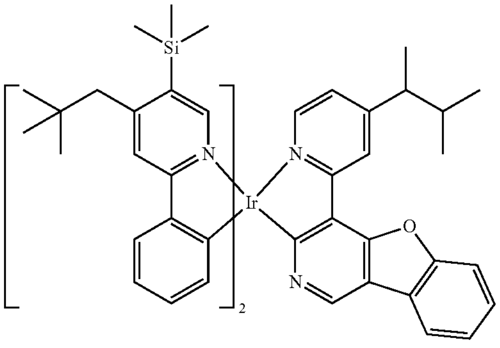
-continued
328
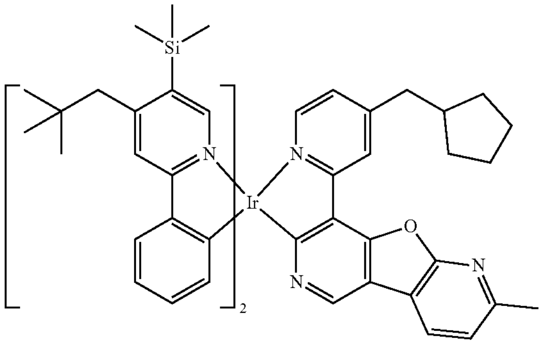
329
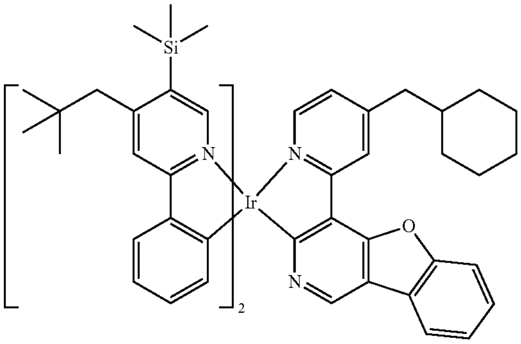
330
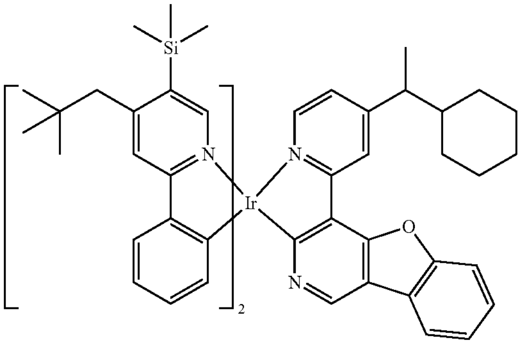
331
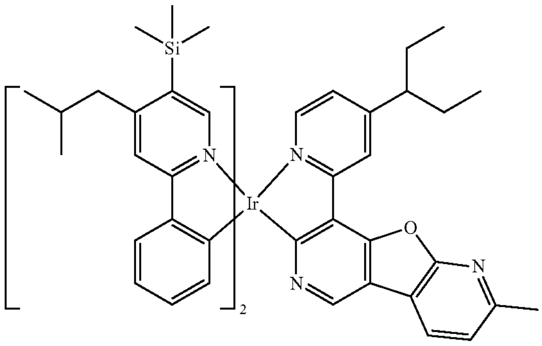

-continued
332
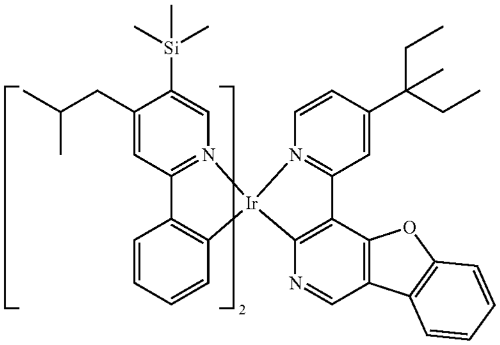
333
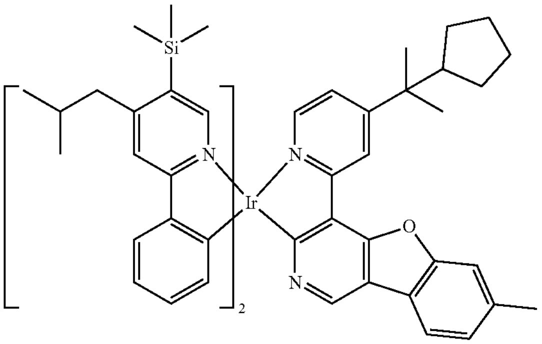
334
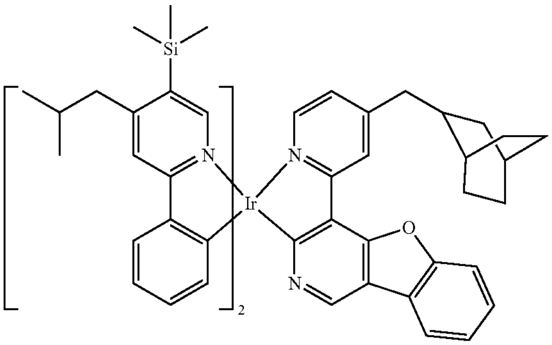
335
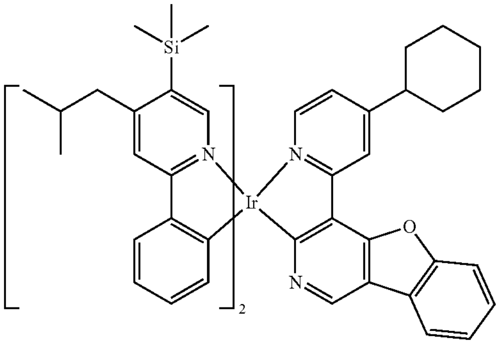
-continued
336
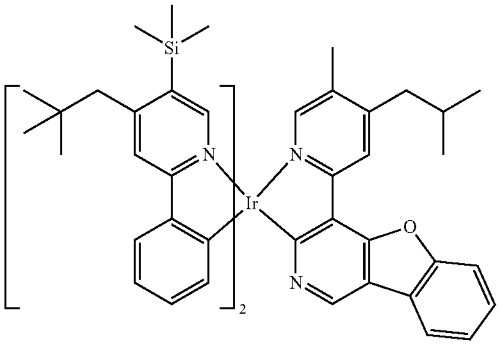
337
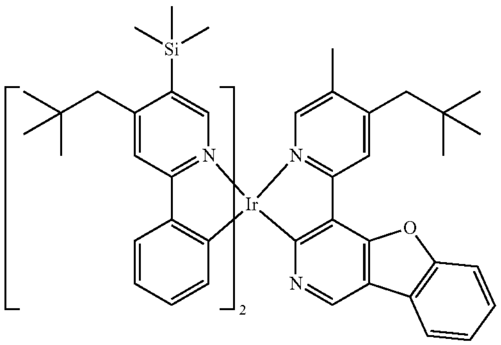
338
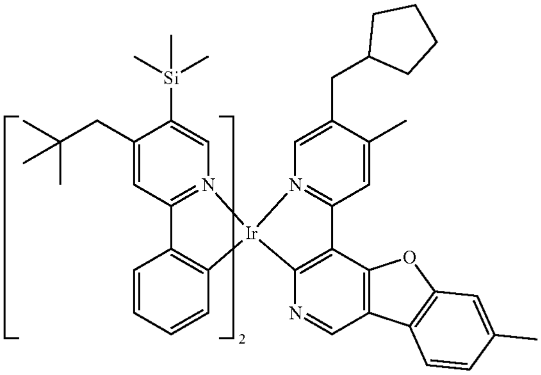
339
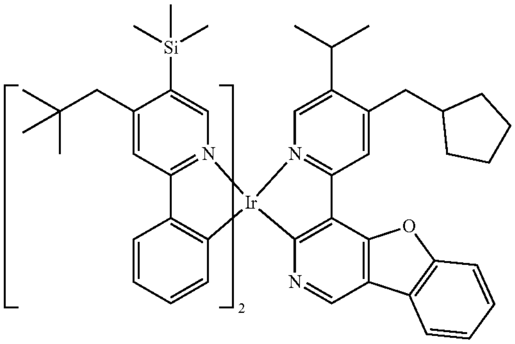

-continued
340
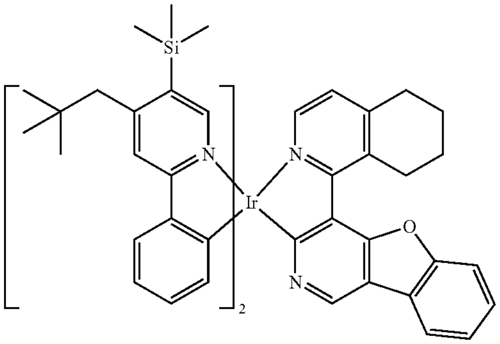
341
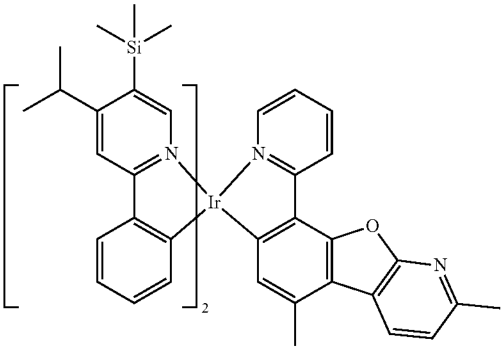
342
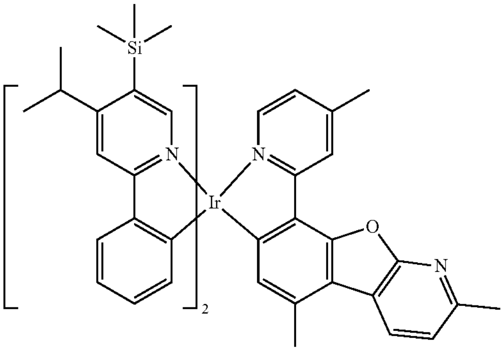
343
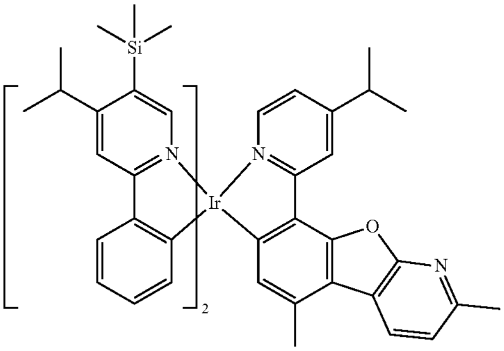
-continued
344
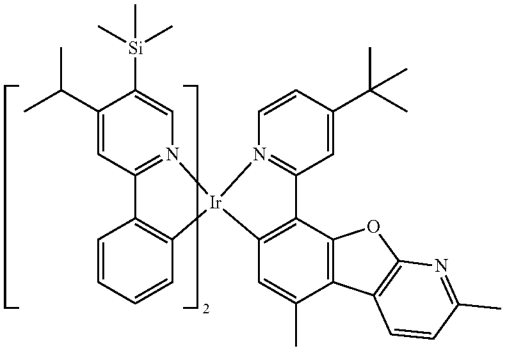
345
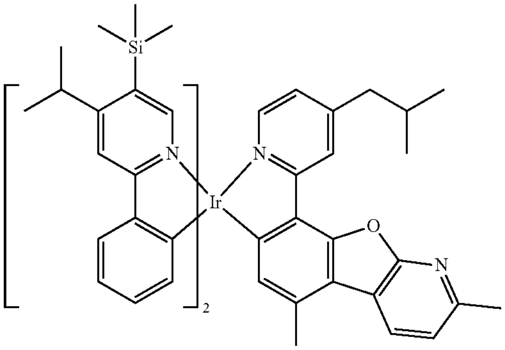
346
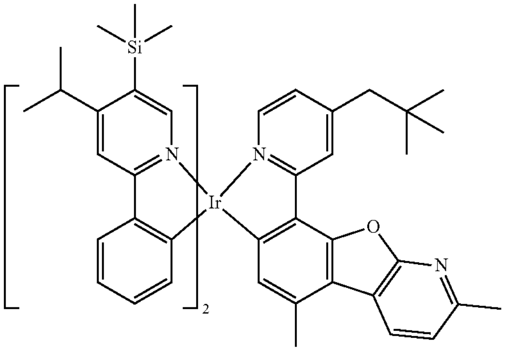
347
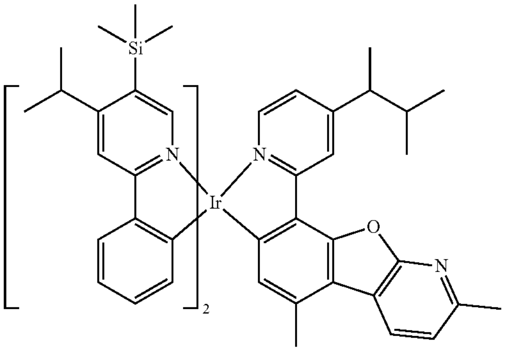

-continued
348
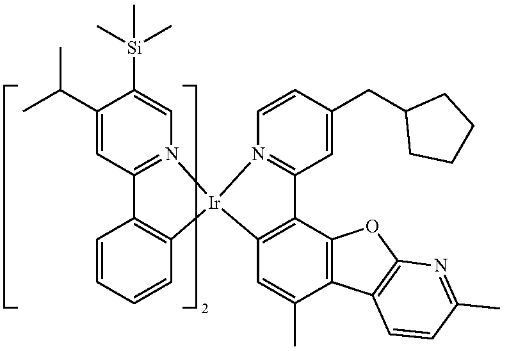
349
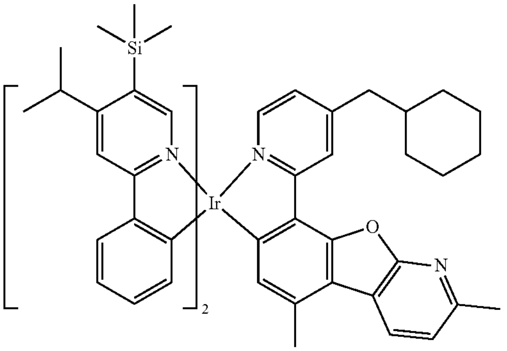
350
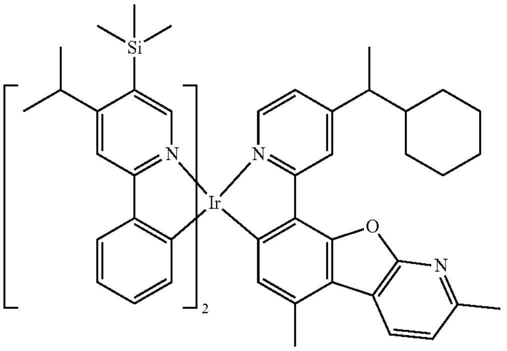
351
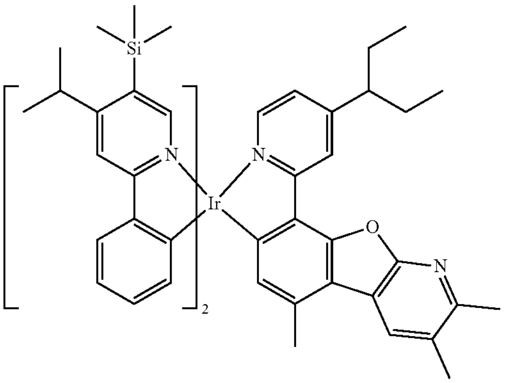
-continued
352
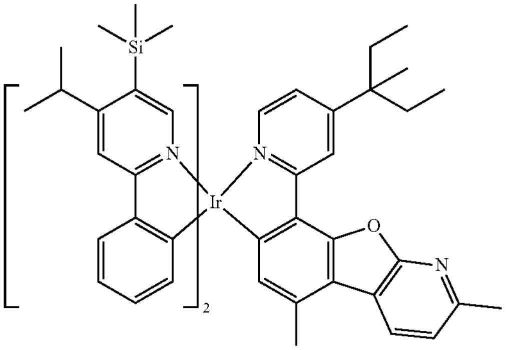
353
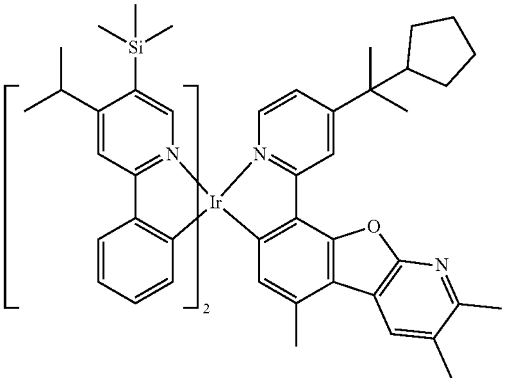
354
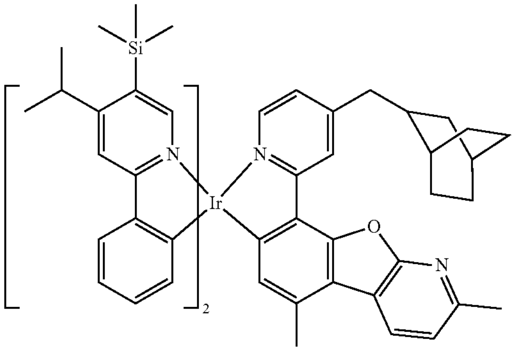
355
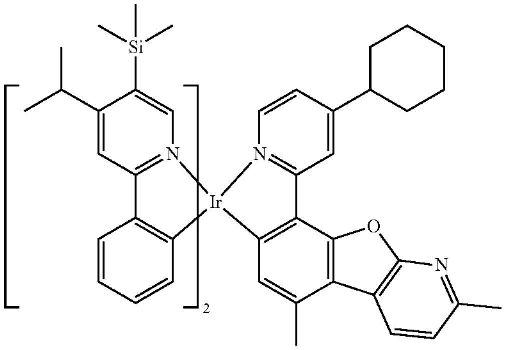

-continued
356
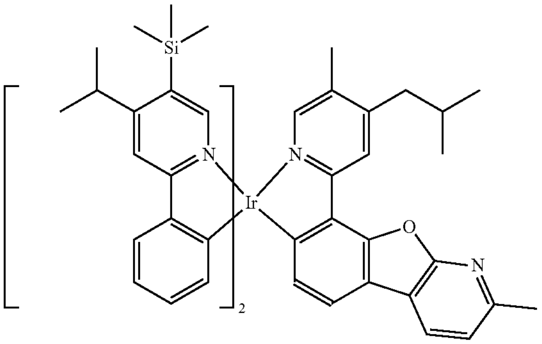
357
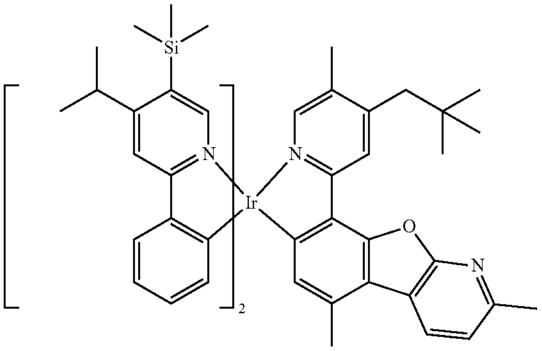
358
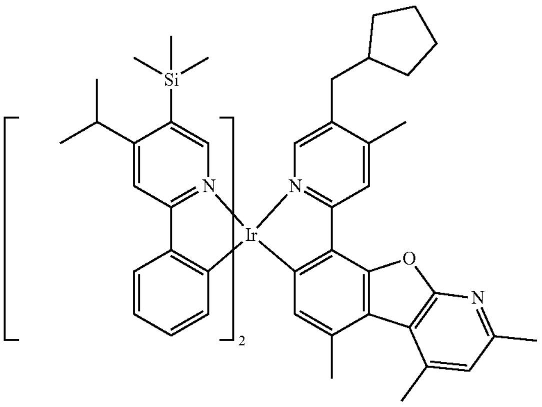
359
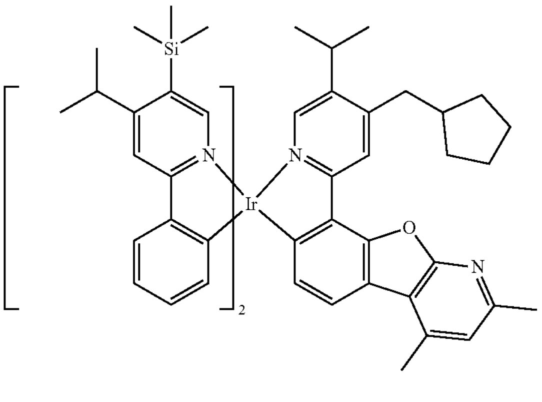
-continued
360
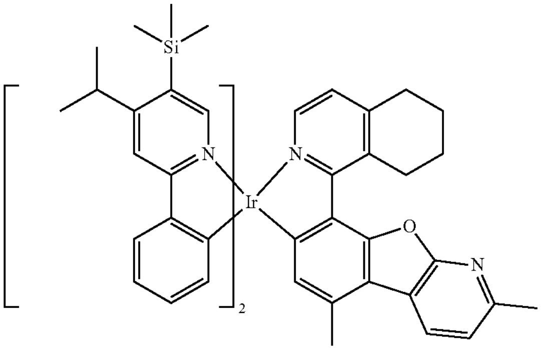
361
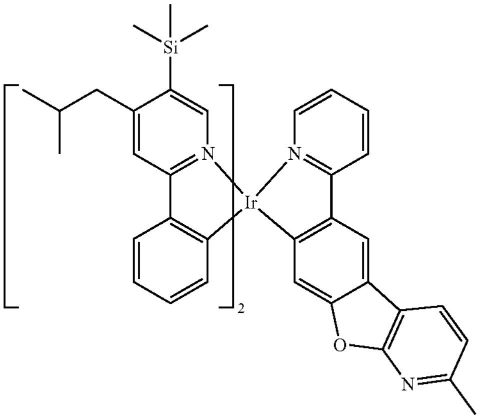
362
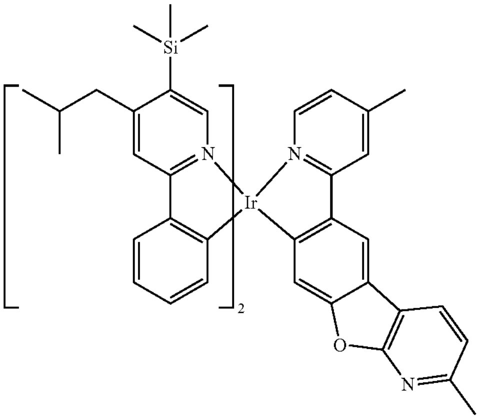

-continued
363
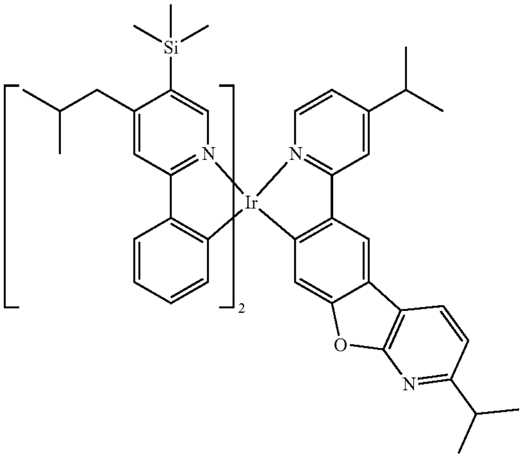
364
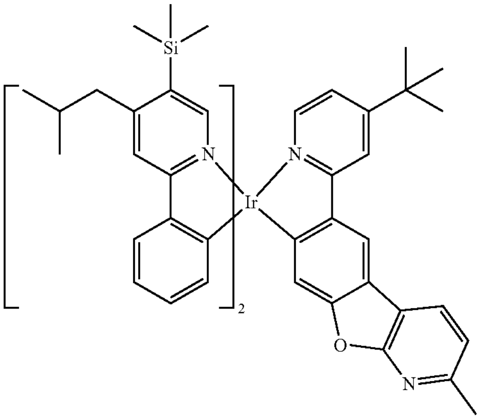
365
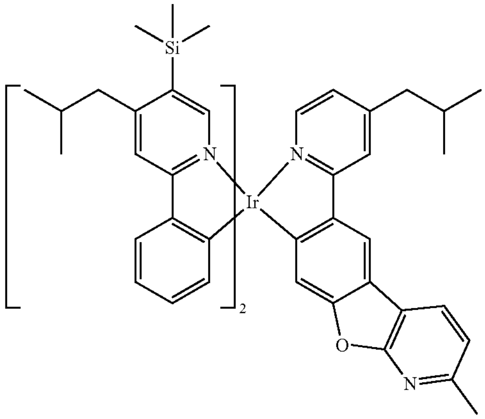
-continued
366
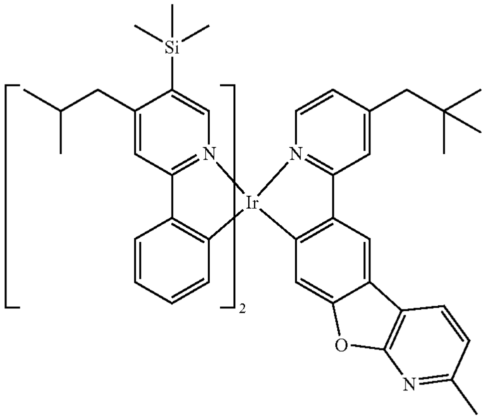
367
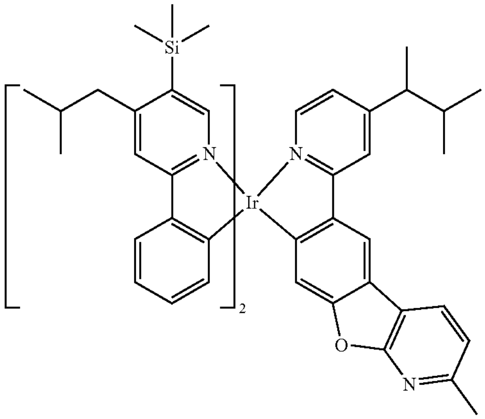
368
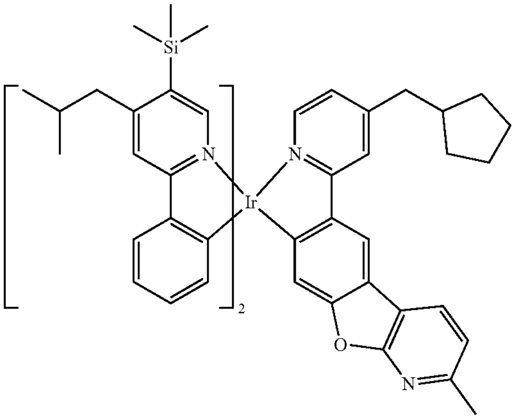

-continued
369
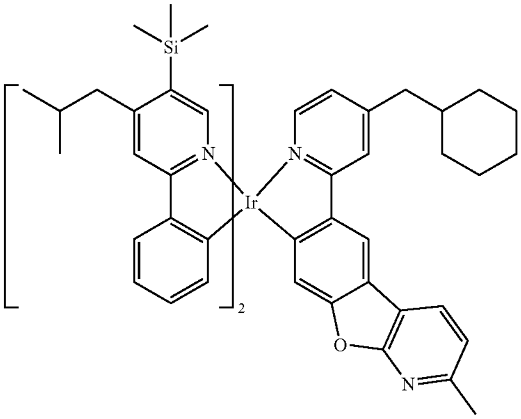
370
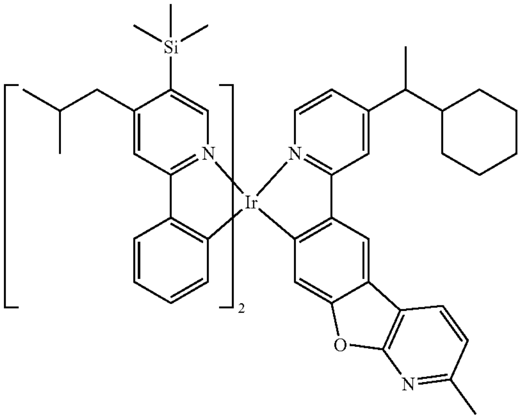
371
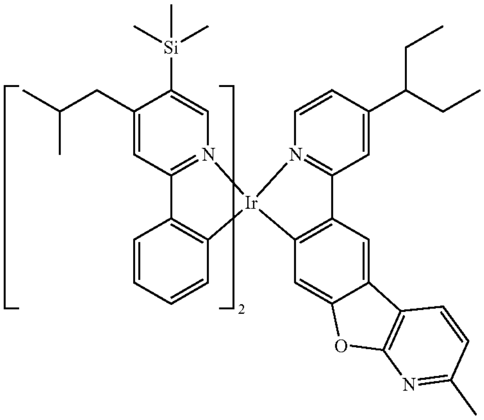
-continued
372
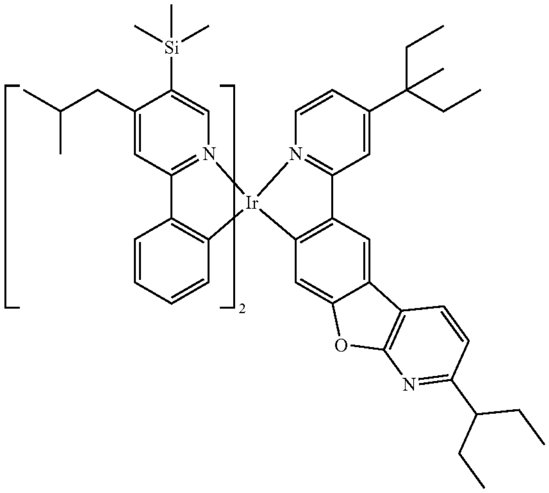
373
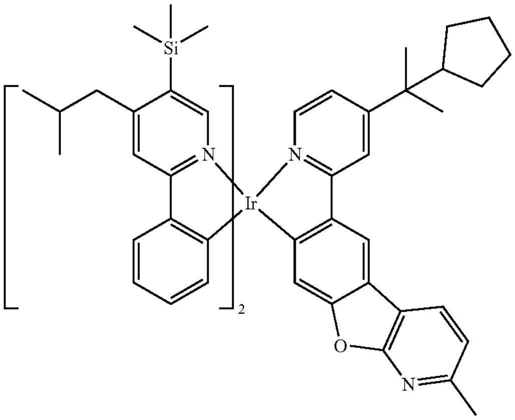
374
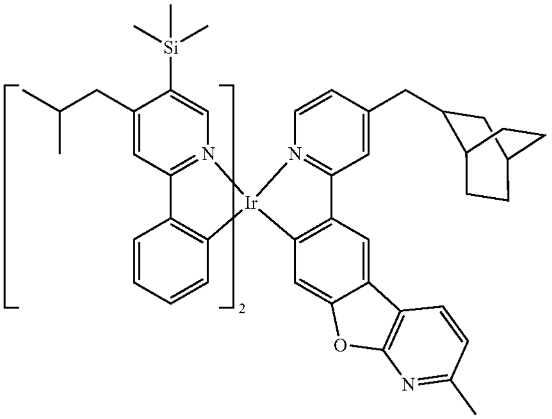

-continued
375
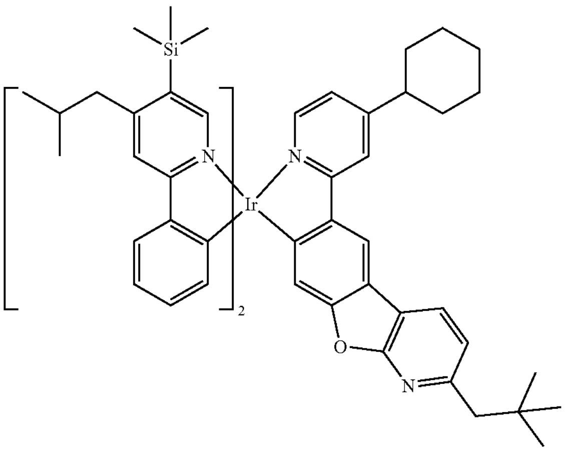
376
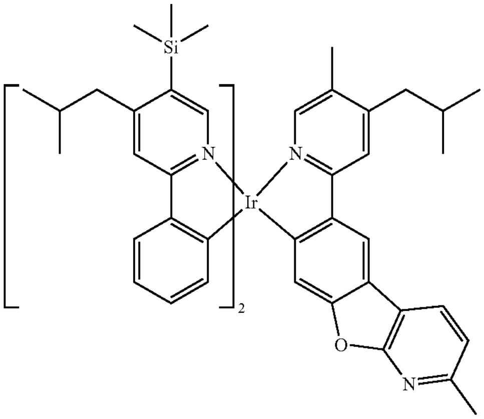
377
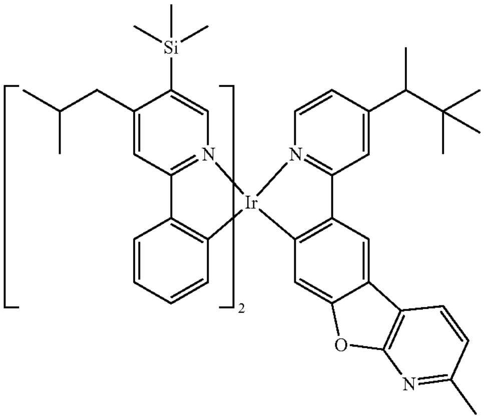
-continued
378
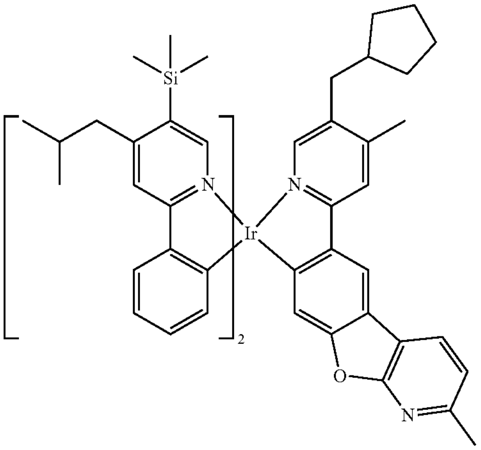
379
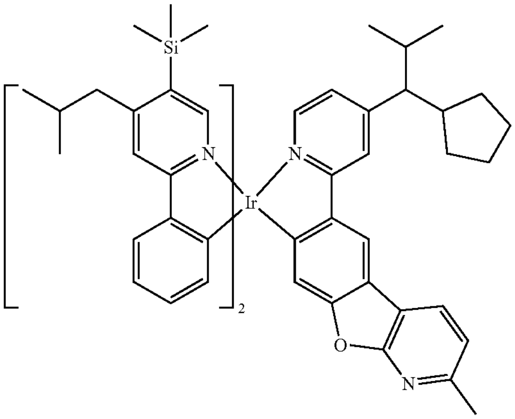
380
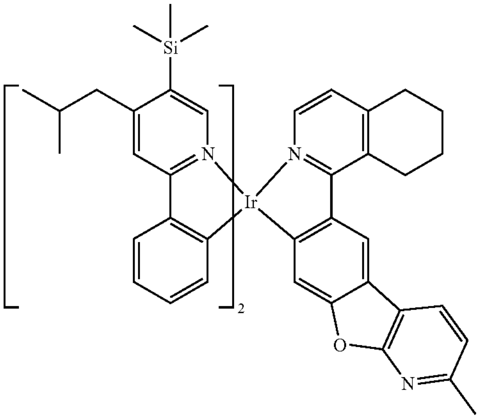

-continued
381
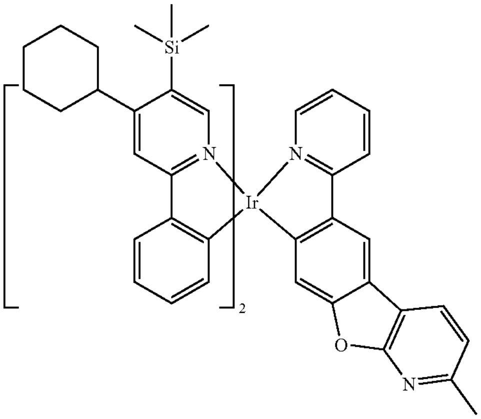
382
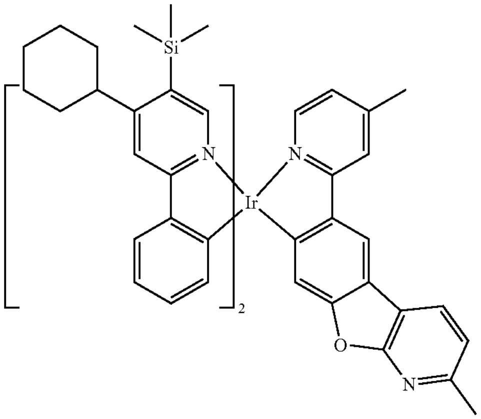
383
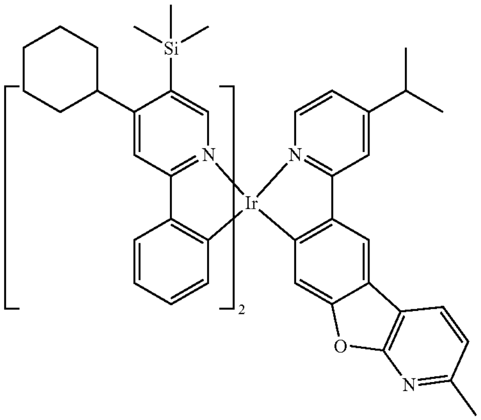
-continued
384
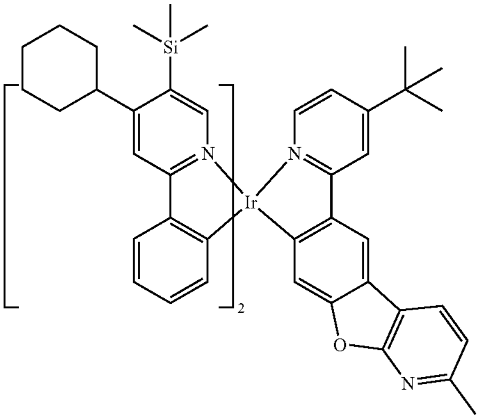
385
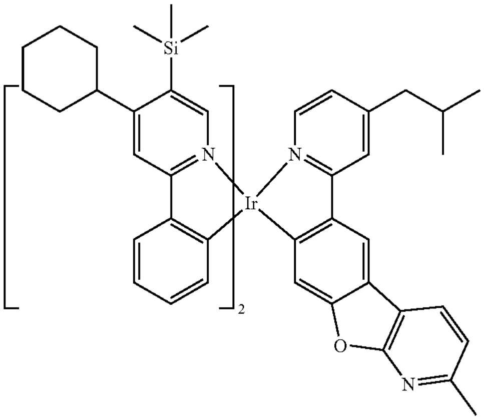
386
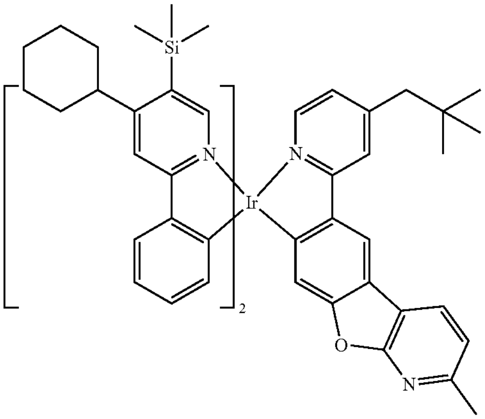

-continued
387
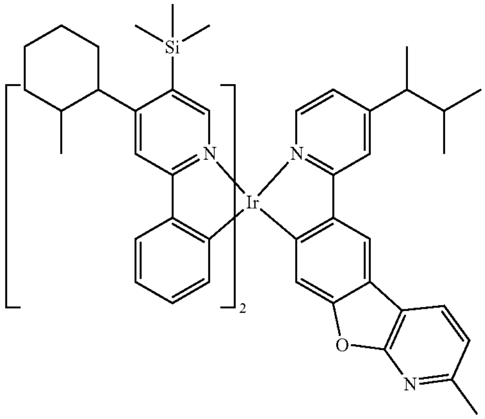
388
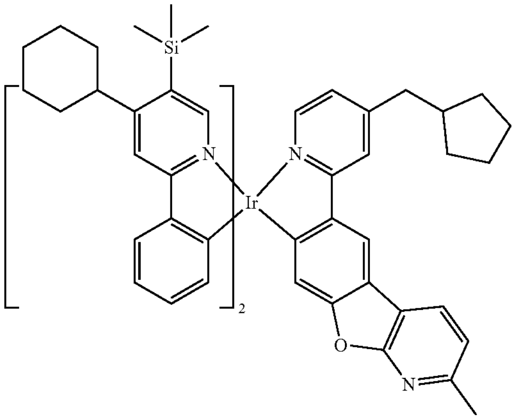
389
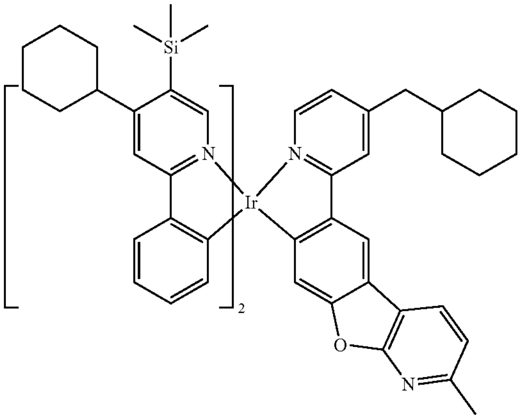
-continued
390
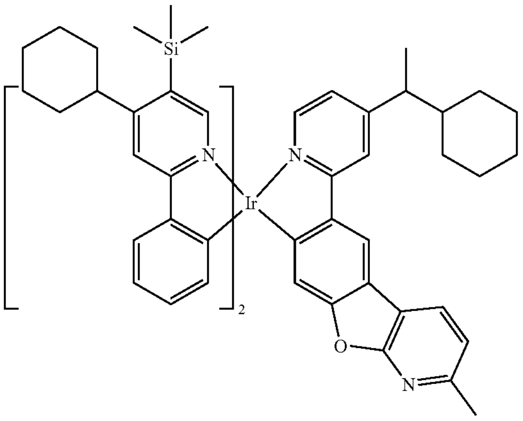
391
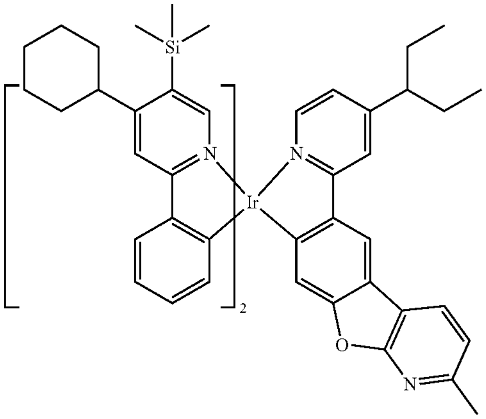
392
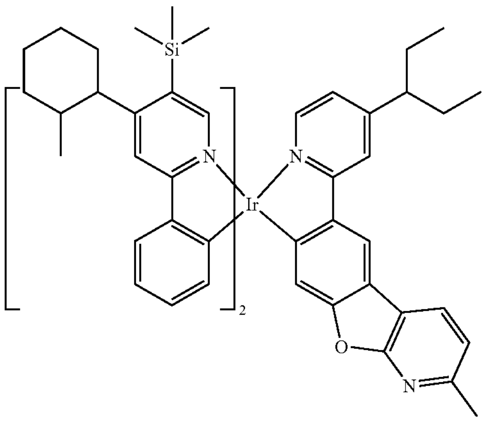

-continued
393
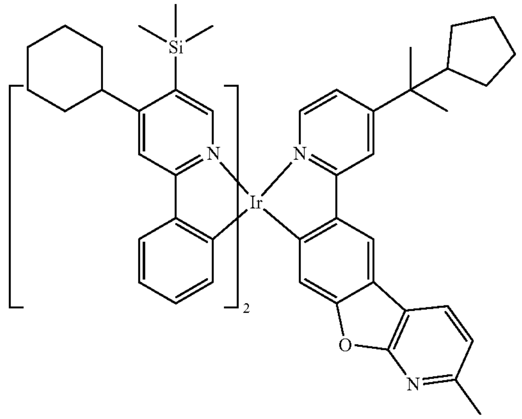
394
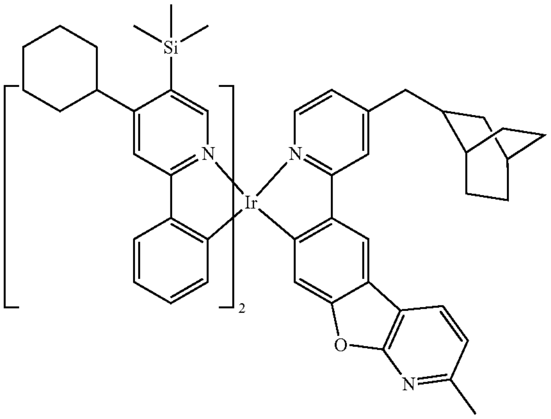
395
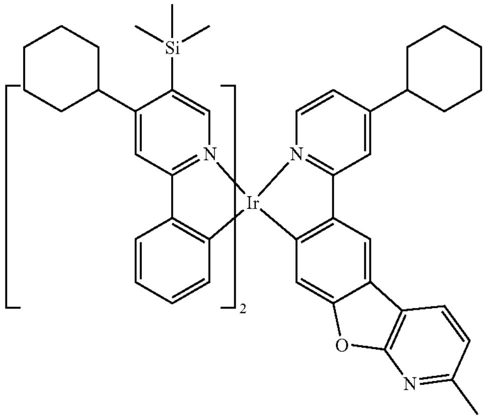
-continued
396
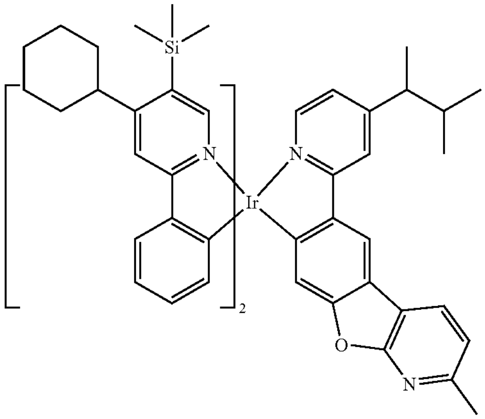
397
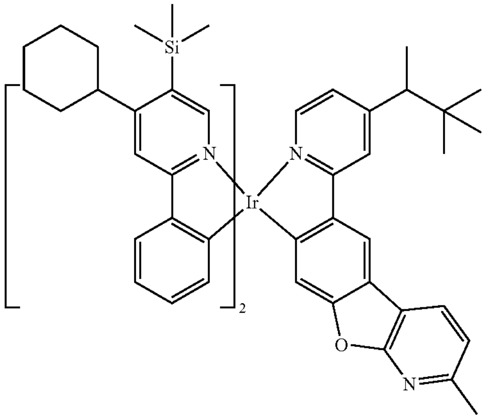
398
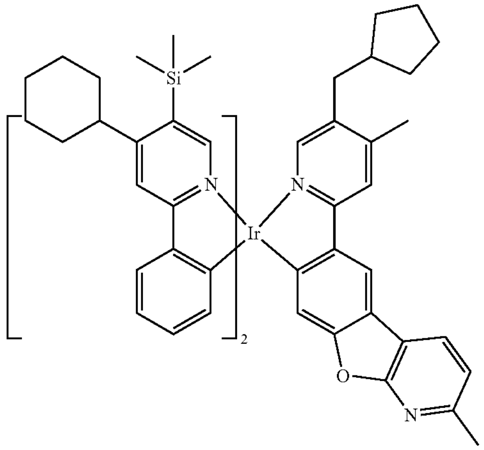

-continued
399
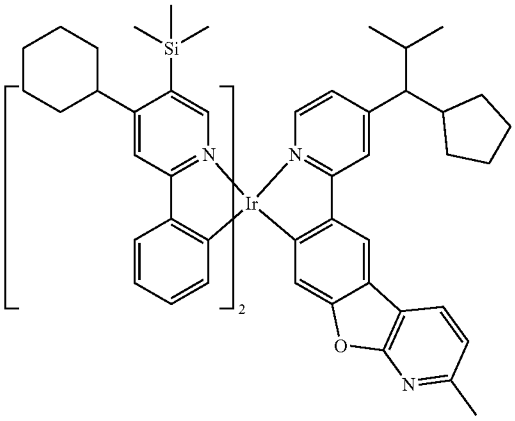
400
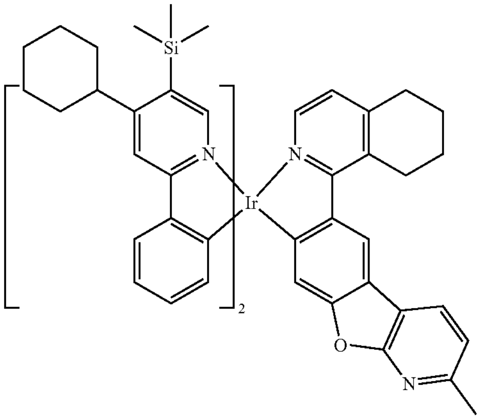
401
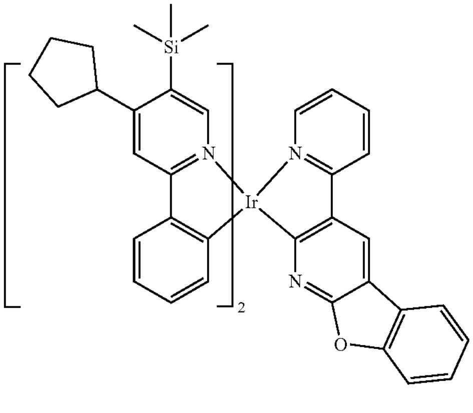
402
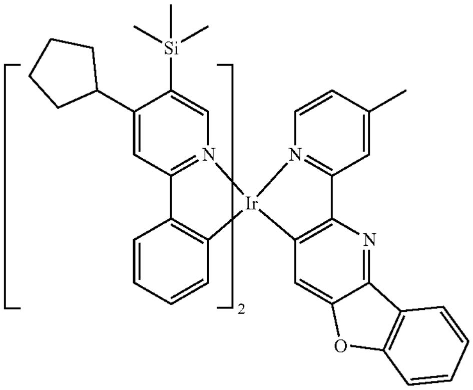
403
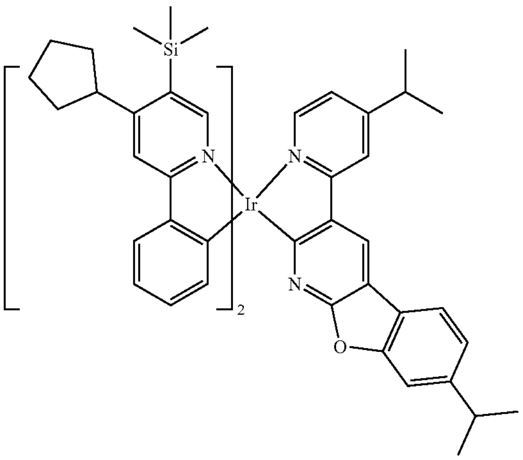
404
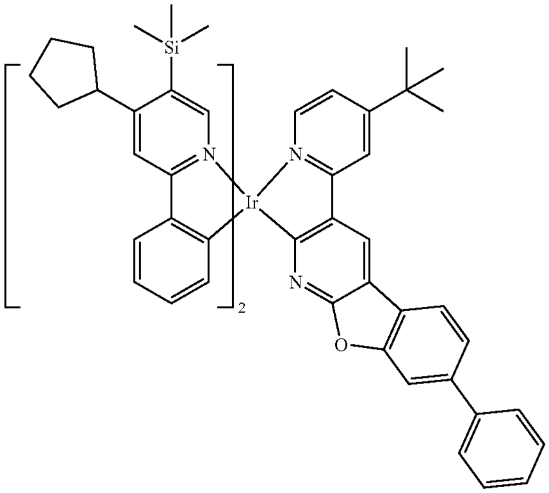
405
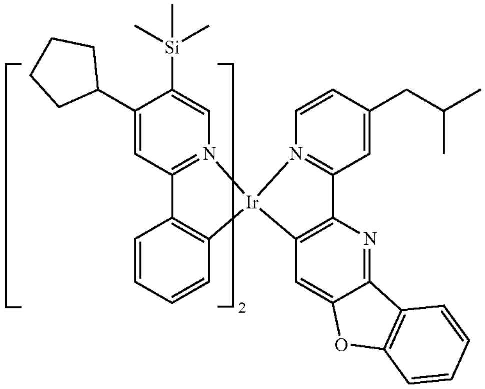

406
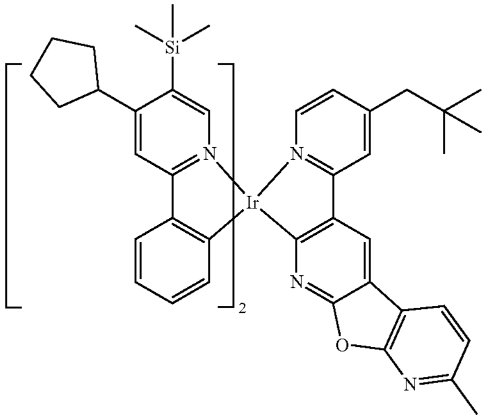
407
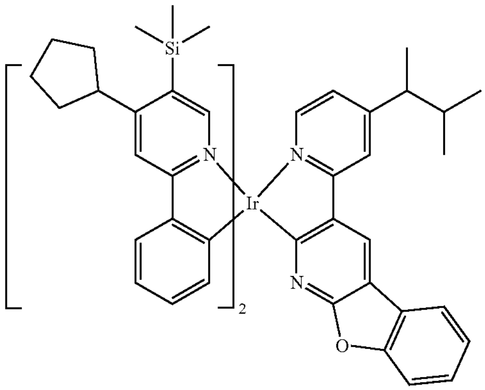
408
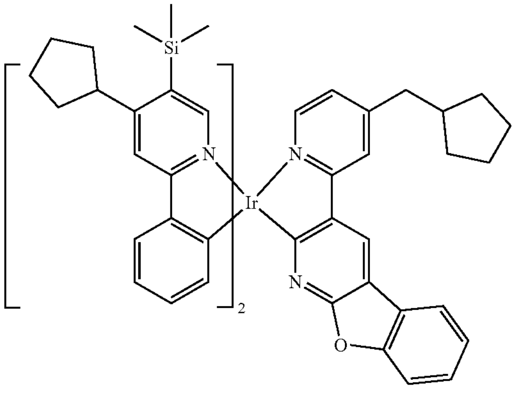
409
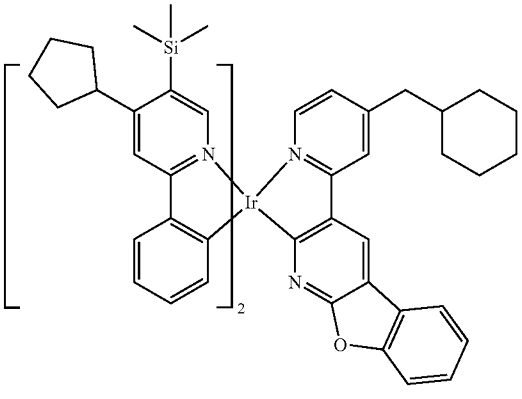
410
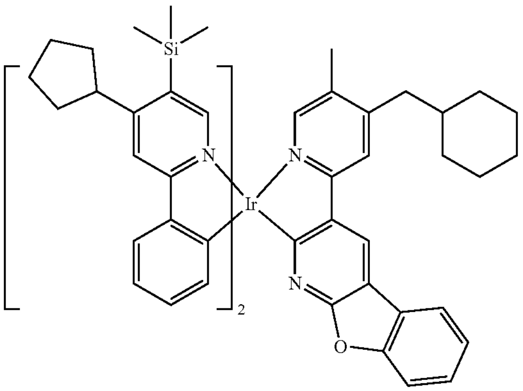
411
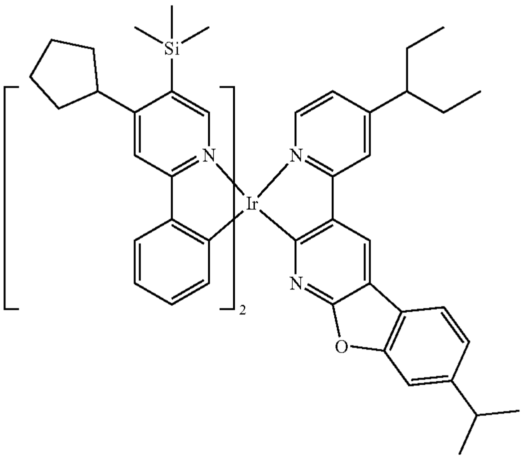
412
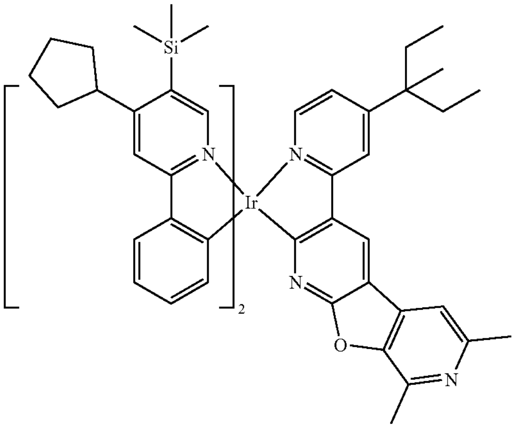

-continued
413
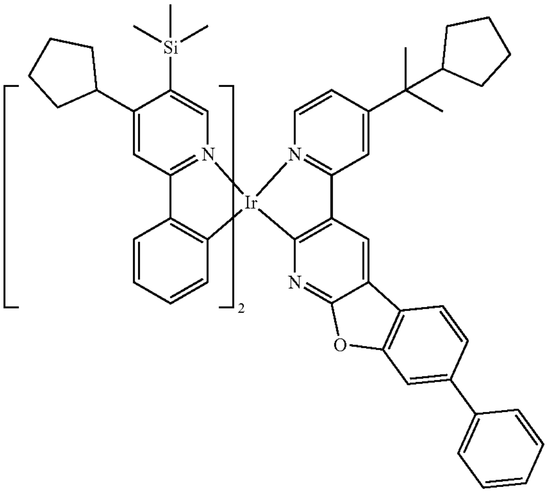
414
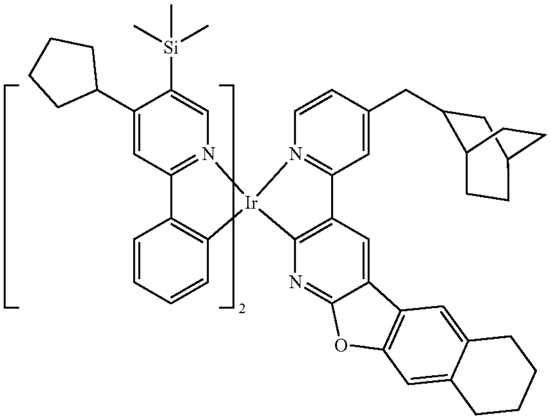
415
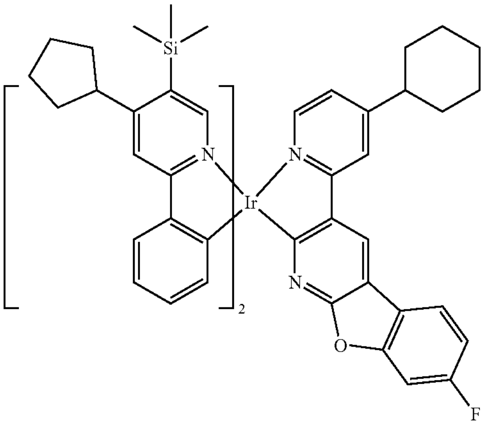
-continued
416
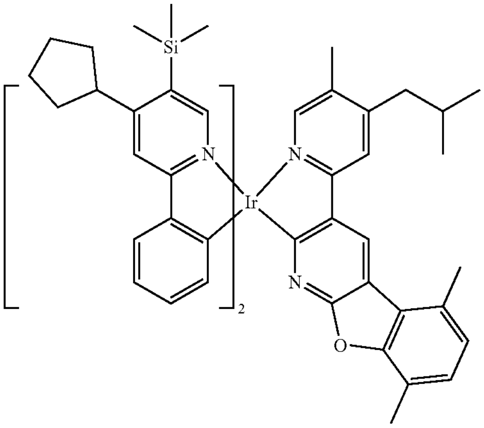
417
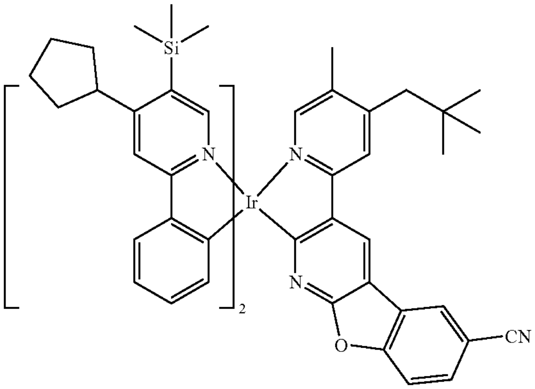
418
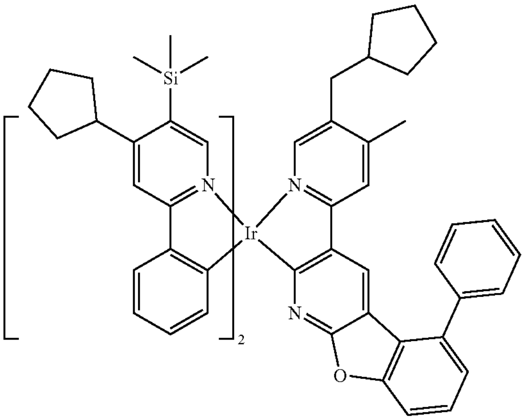

419
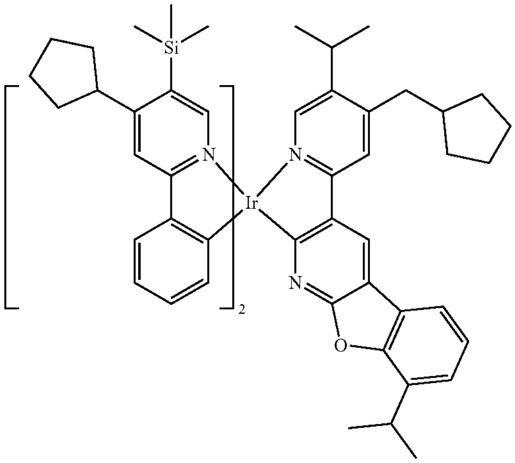
420
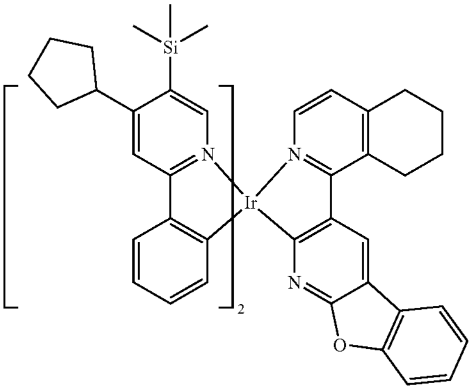
421
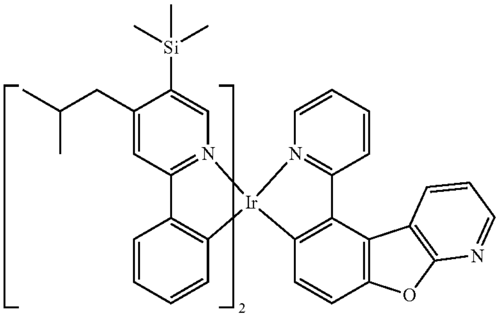
422
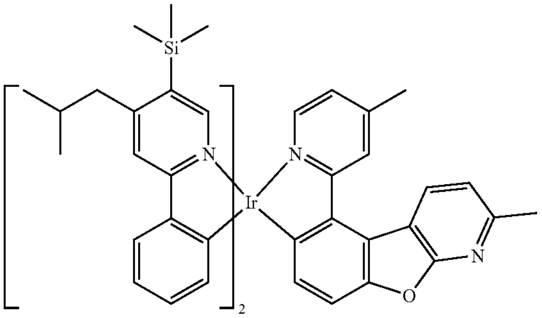
423
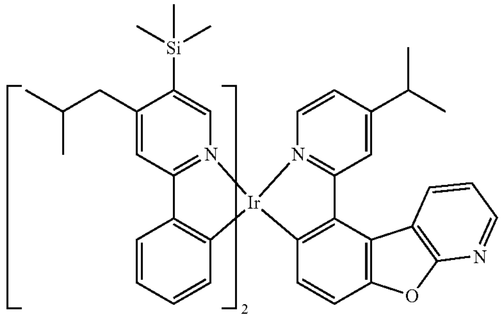
424
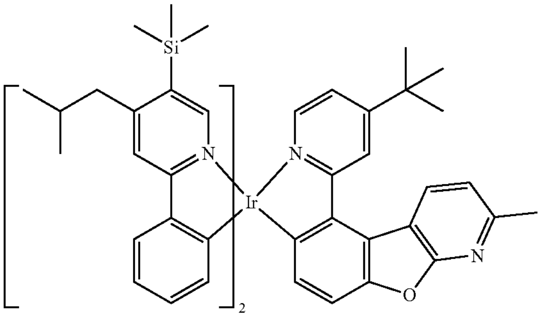
425
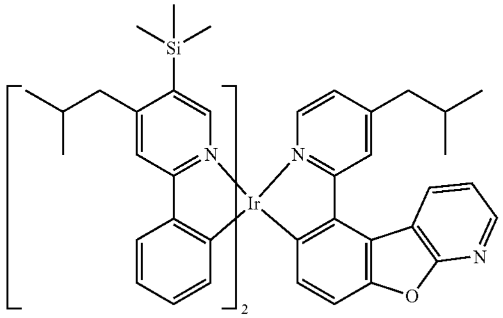
426
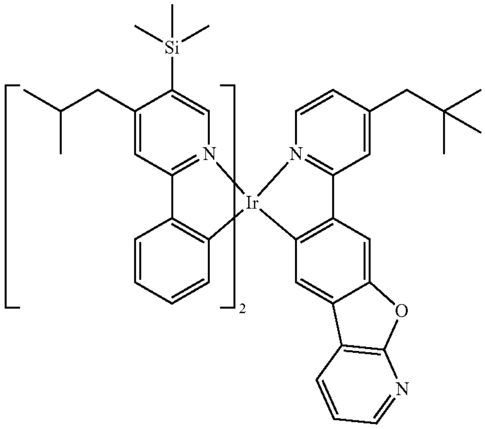

-continued
427
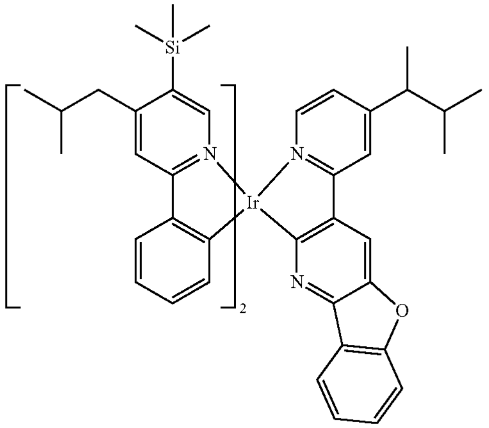
428
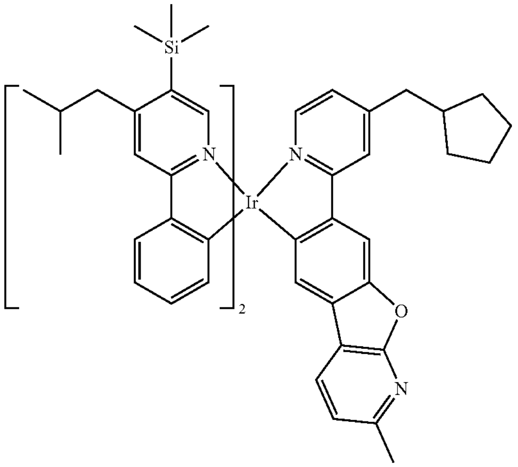
429
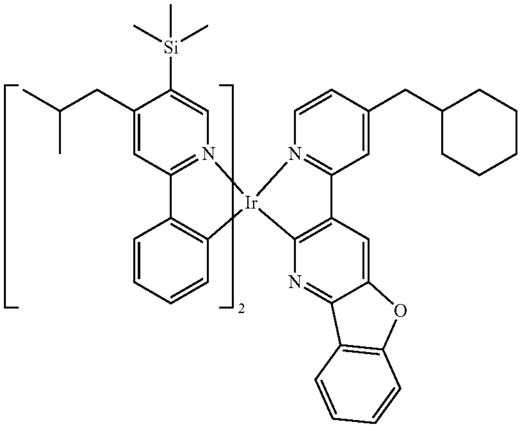
-continued
430
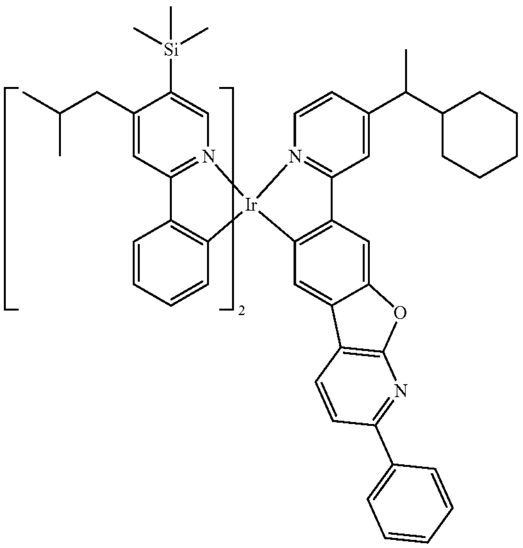
431
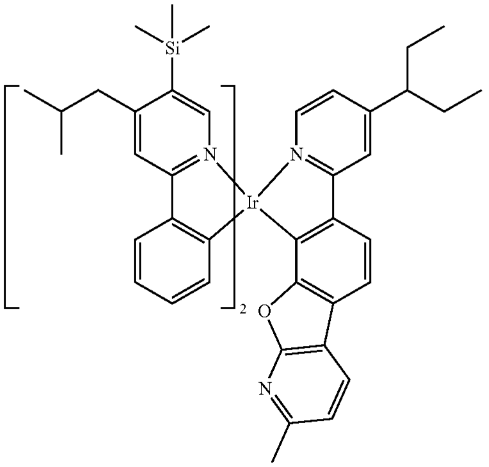
432
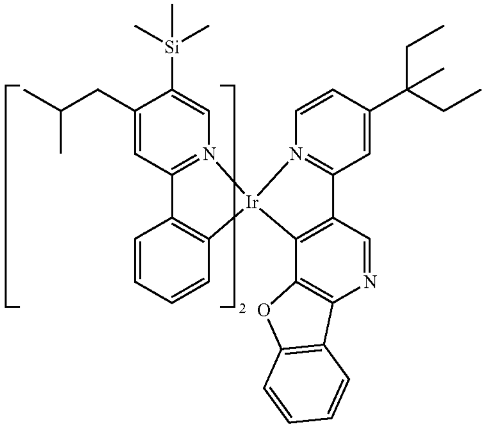

-continued
433
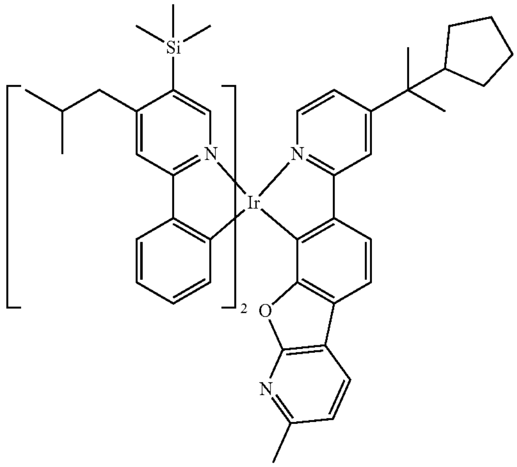
434
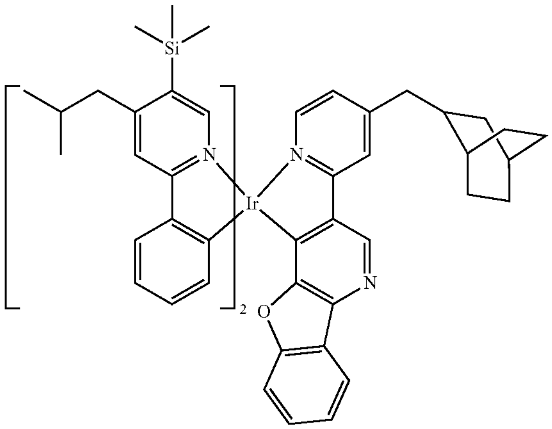
435
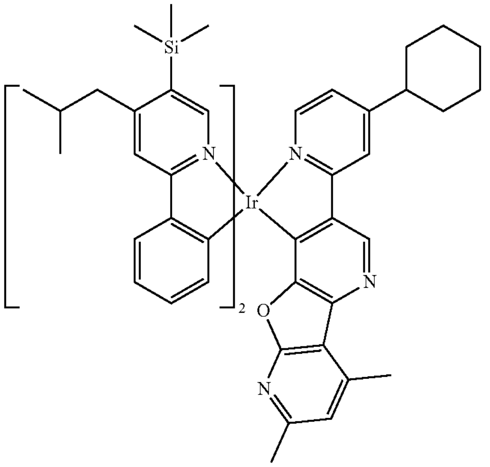
-continued
436
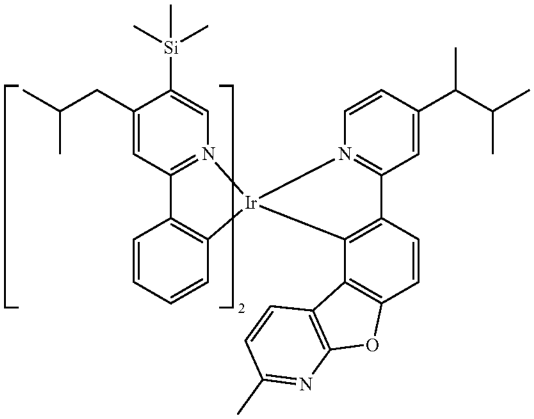
437
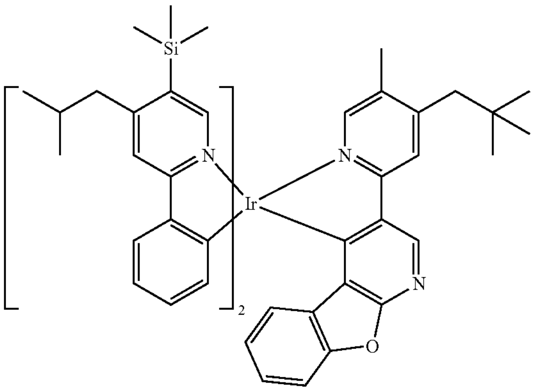
438
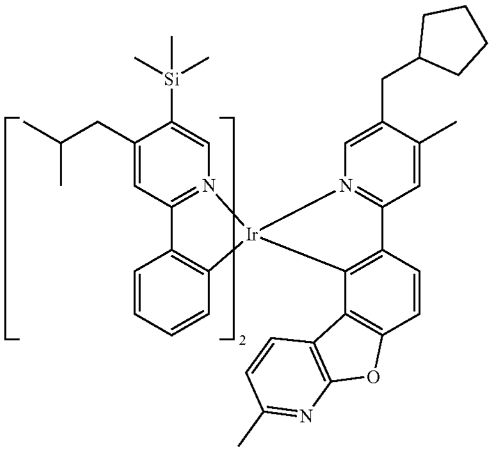

-continued
439
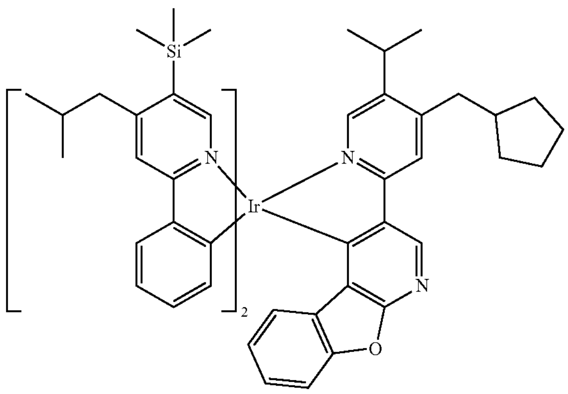
440
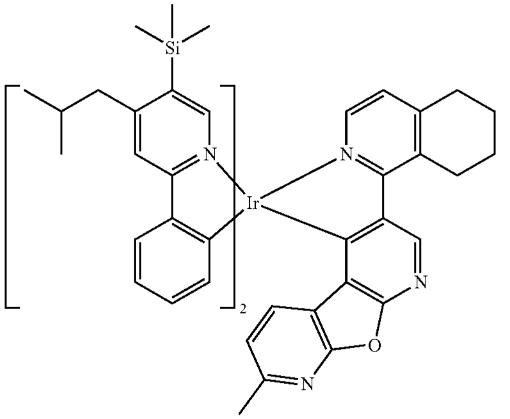
441
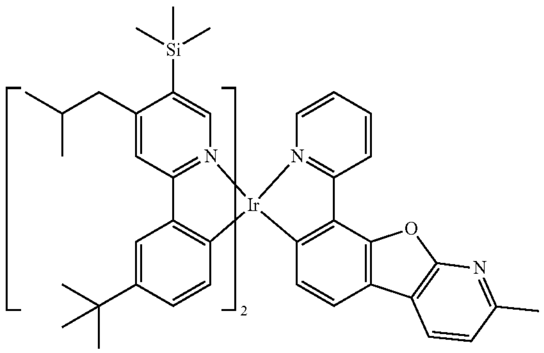
442
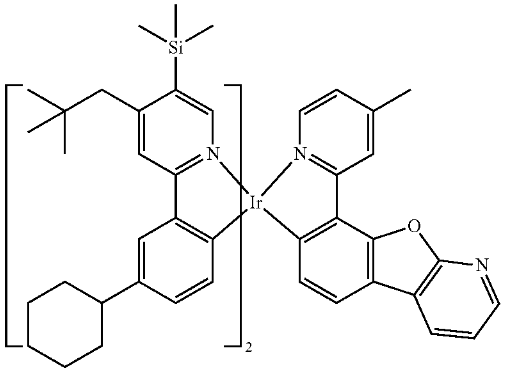
-continued
443
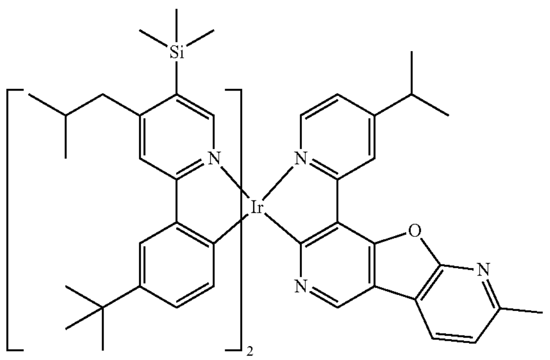
444
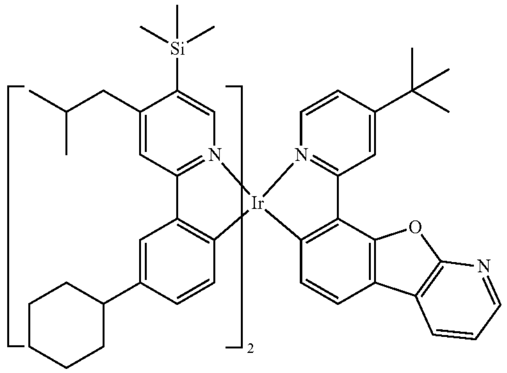
445
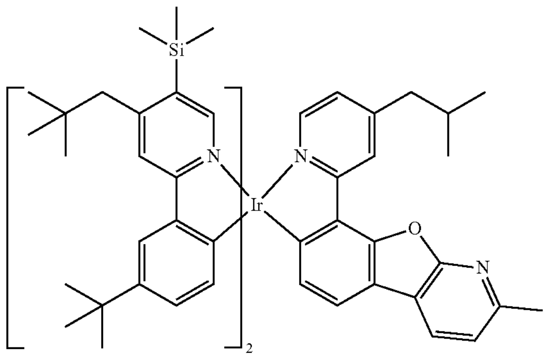
446
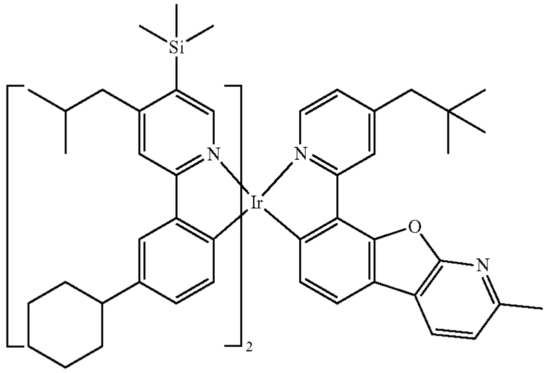

-continued
447
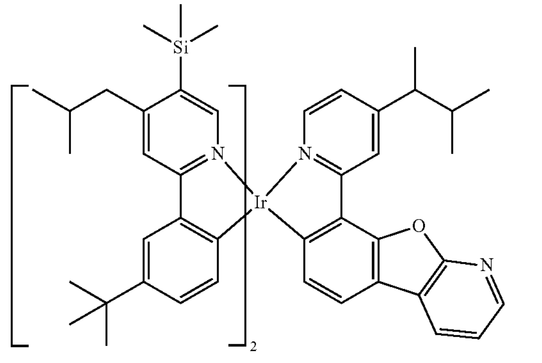
448
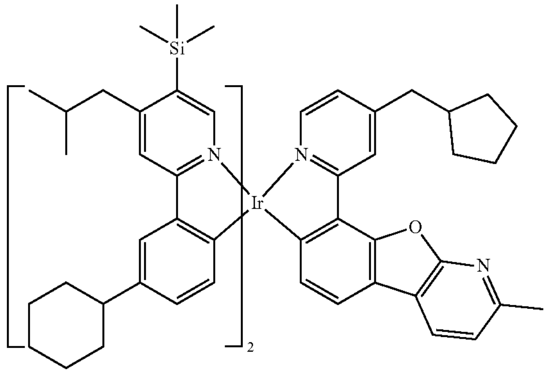
449
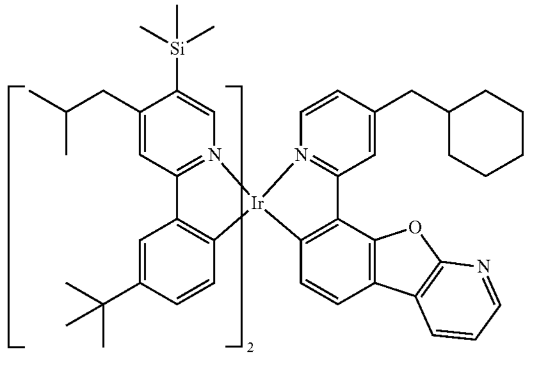
450
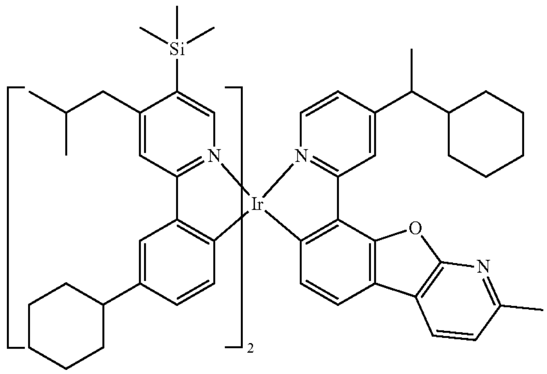
-continued
451
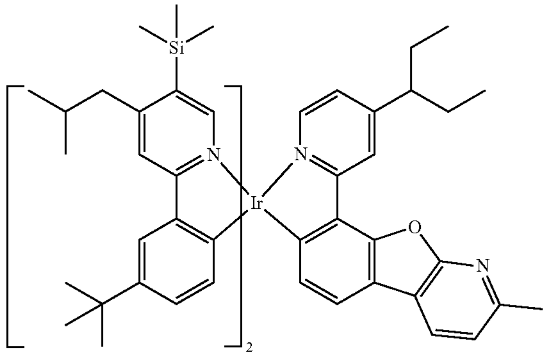
452
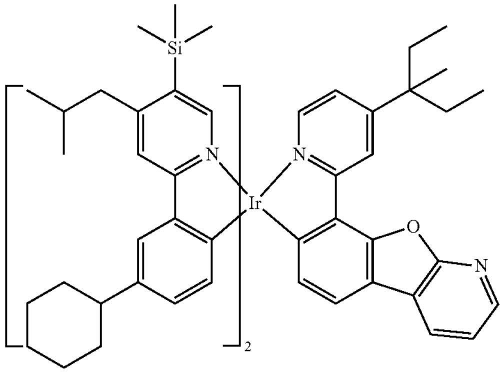
453
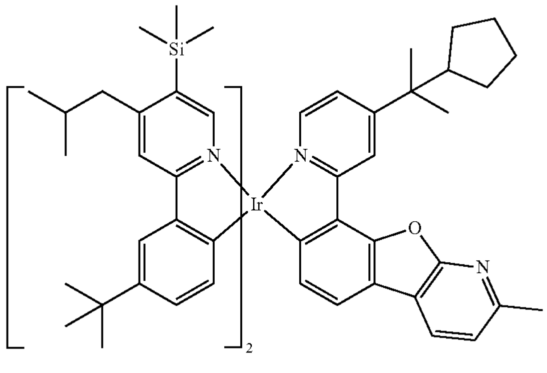
454
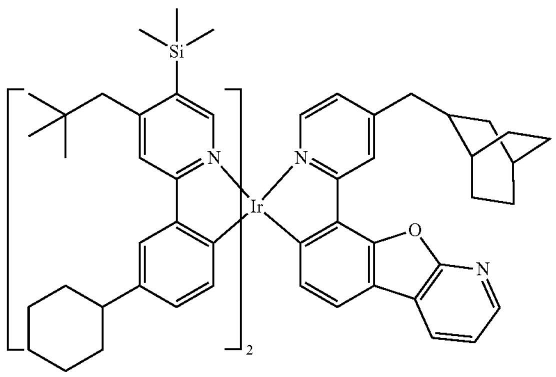

-continued
455
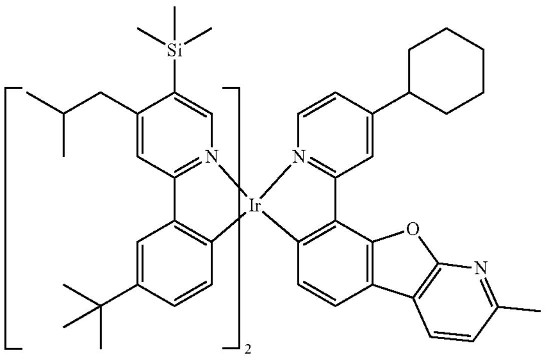
456
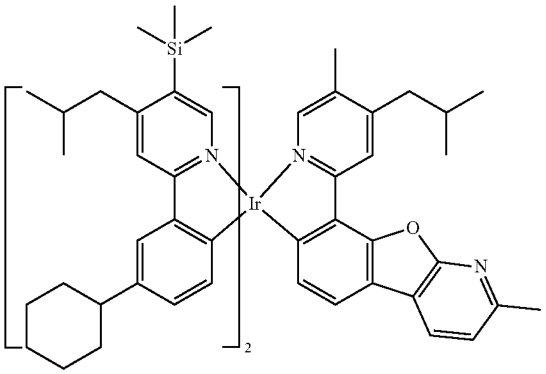
457
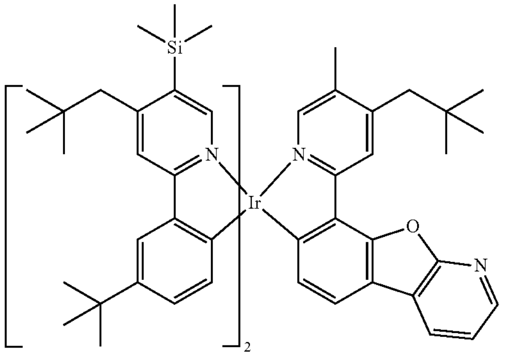
458
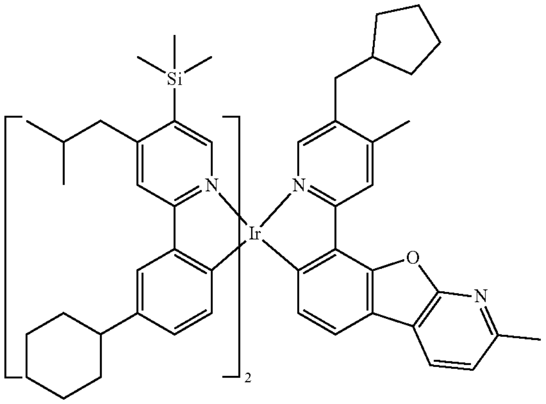
-continued
459
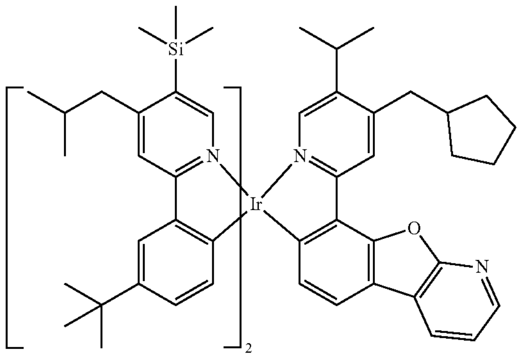
460
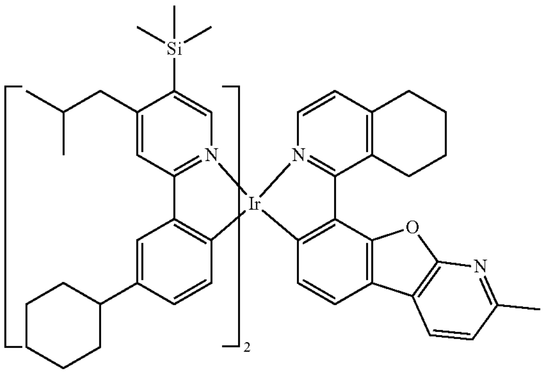
461
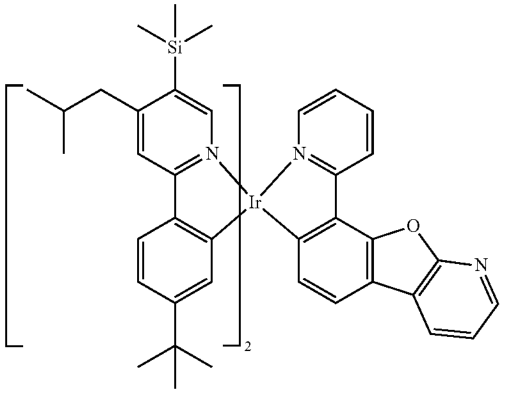
462
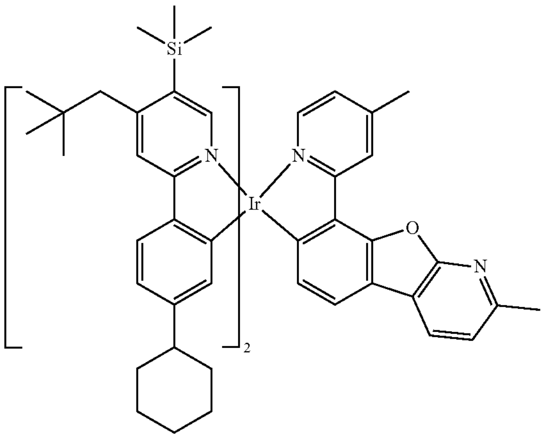

-continued
463
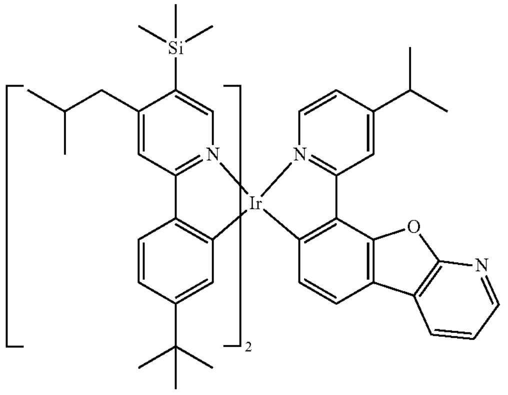
464
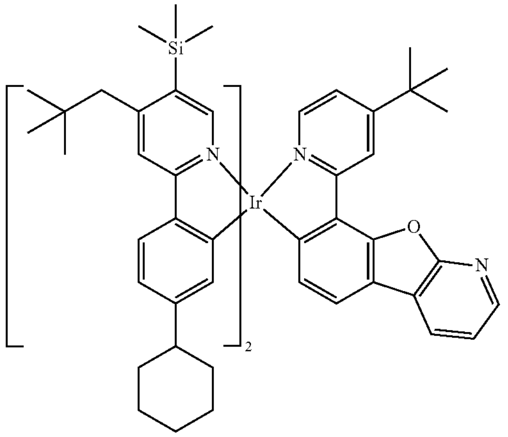
465
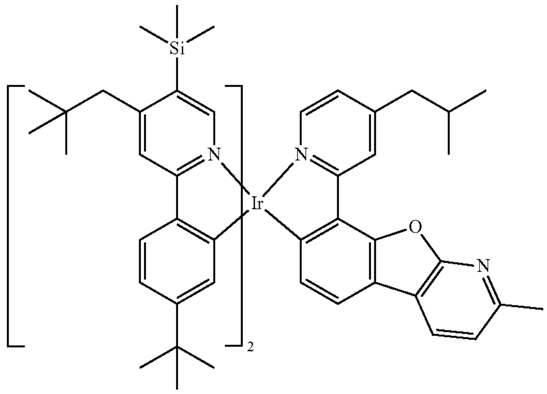
-continued
466
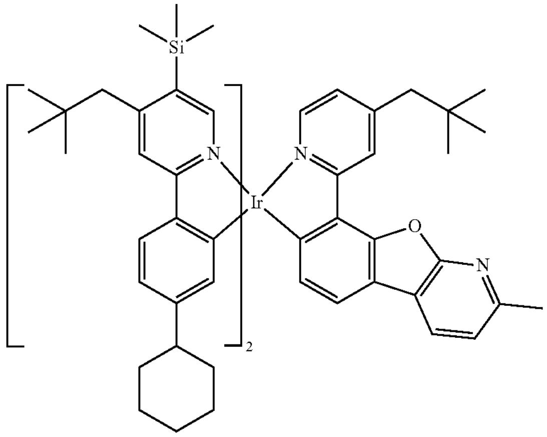
467
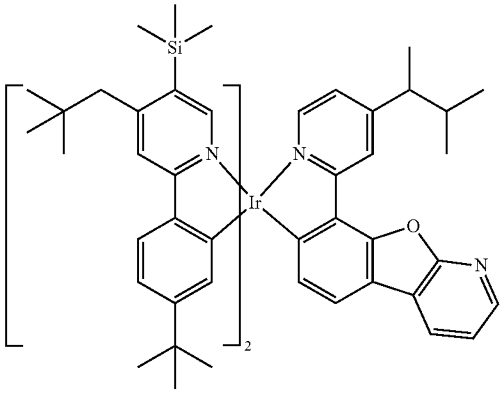
468
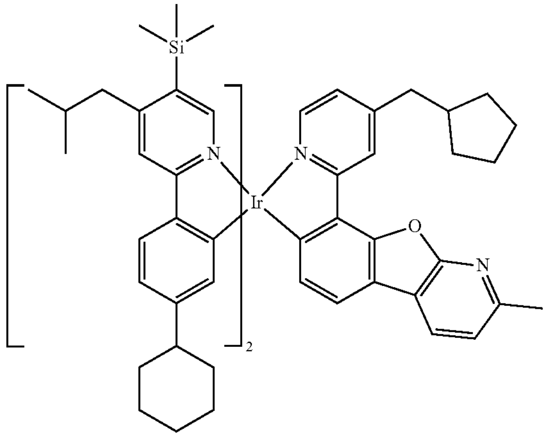

-continued
469
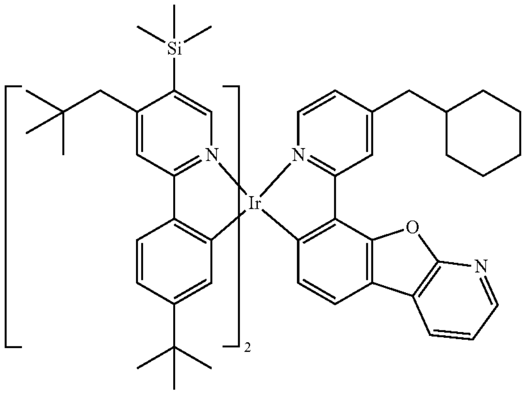
470
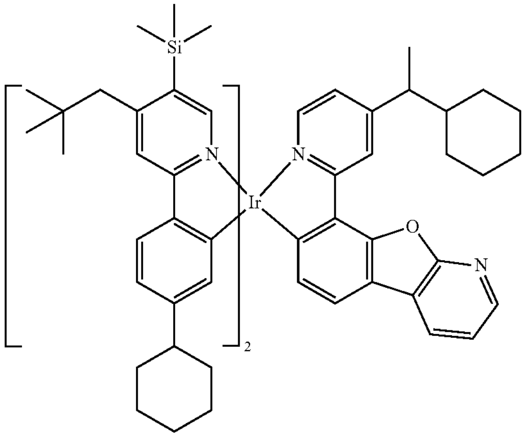
471
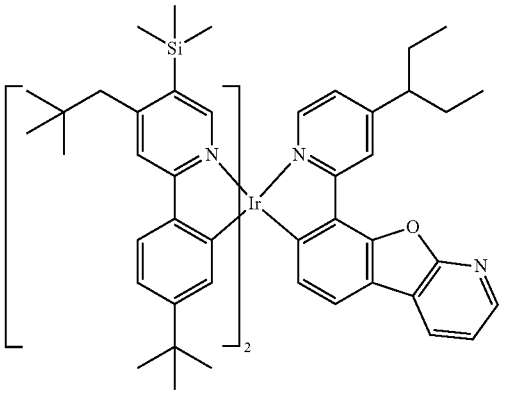
-continued
472
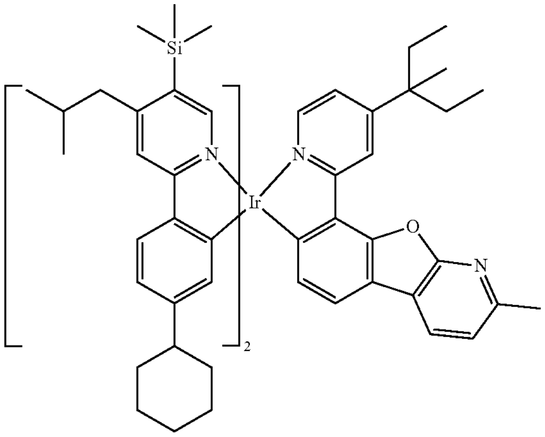
473
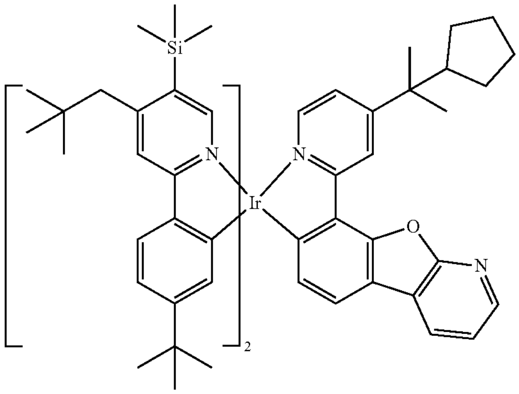
474
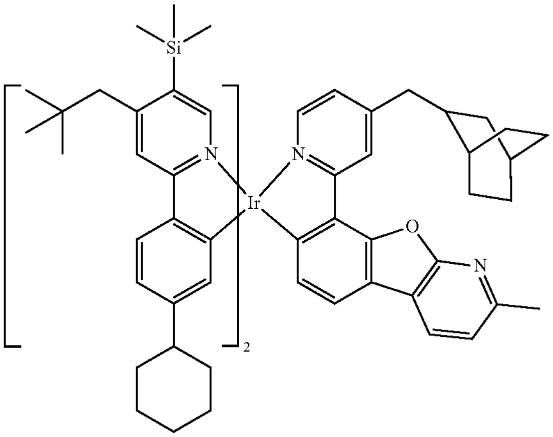

-continued
475
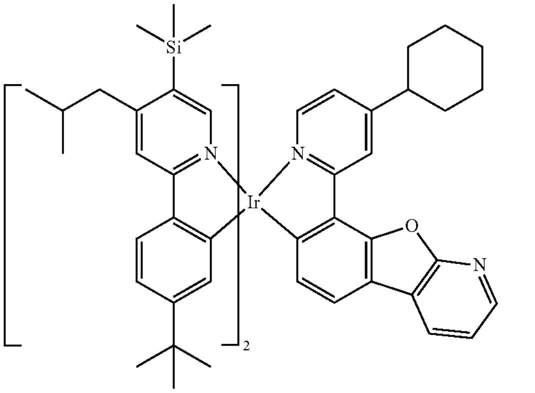
476
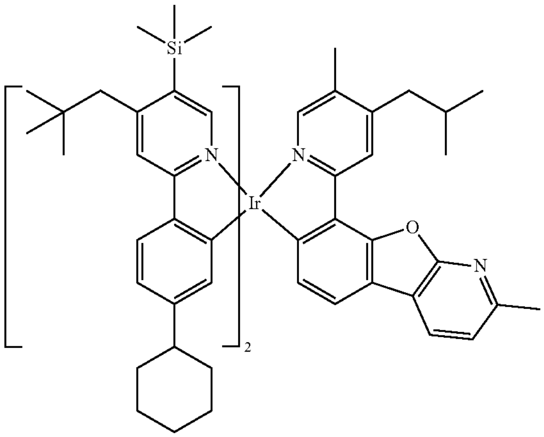
477
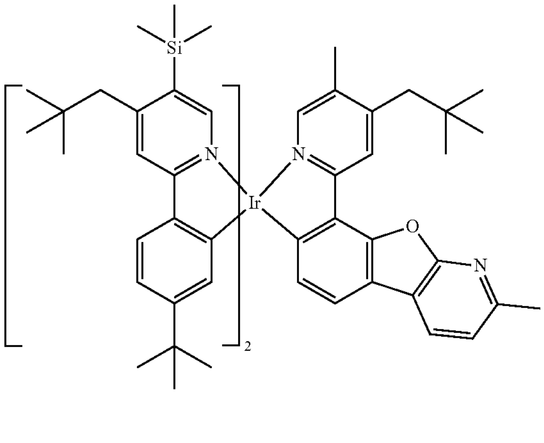
-continued
478
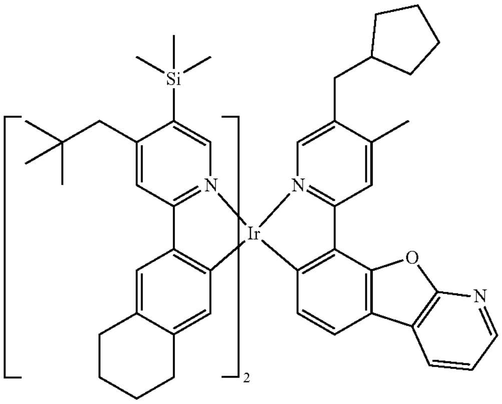
479
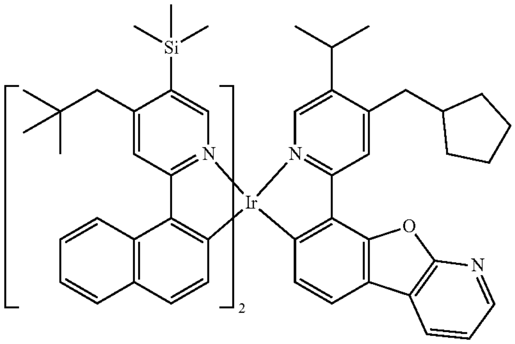
480
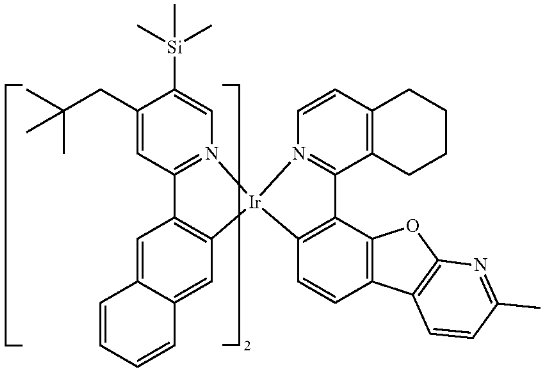
481
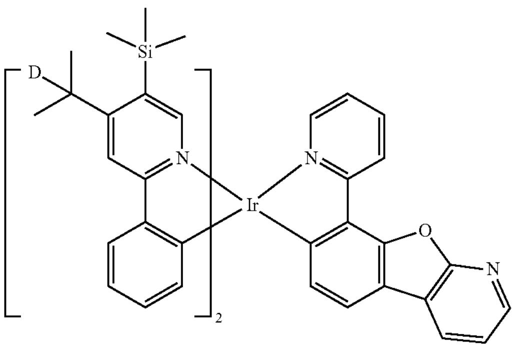

482
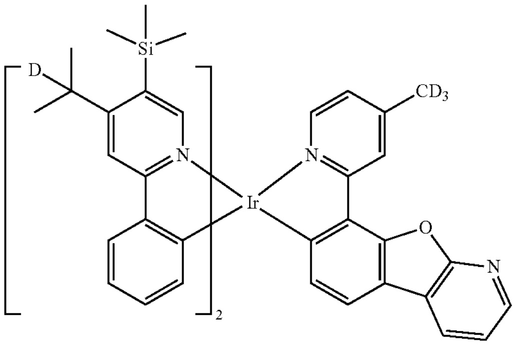
483
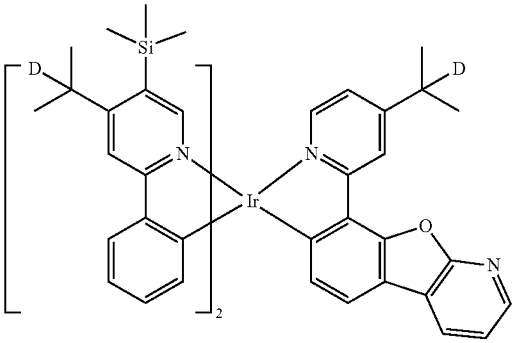
484
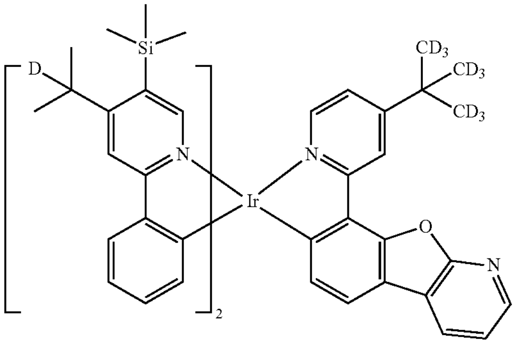
485
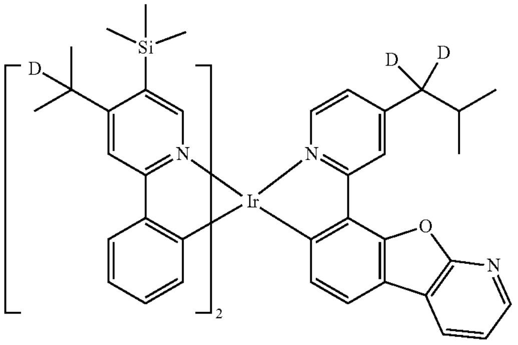
486
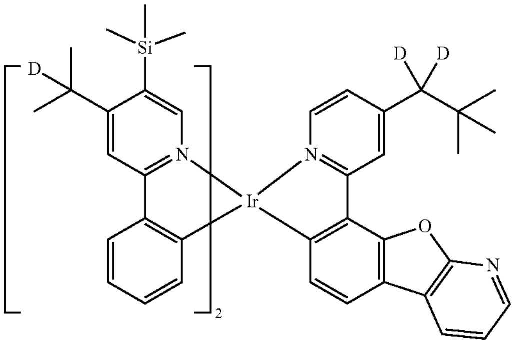
487
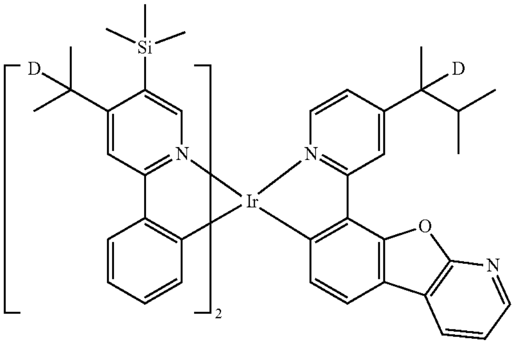
488
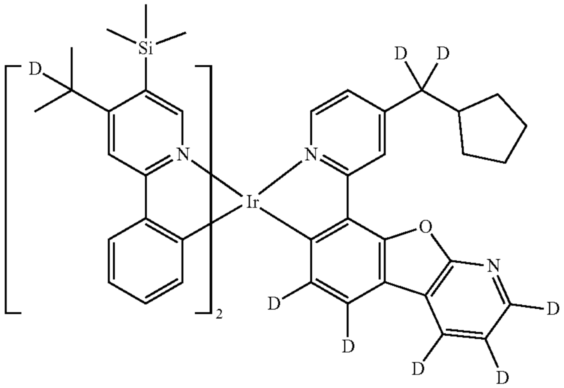
489
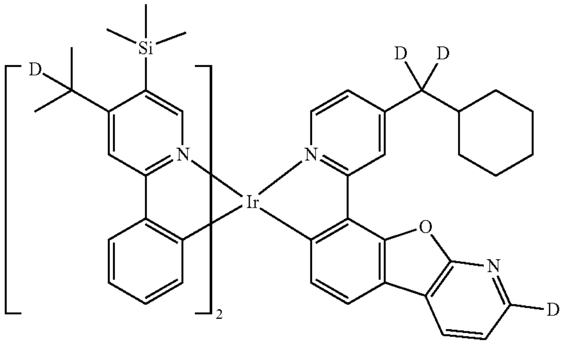

-continued
490
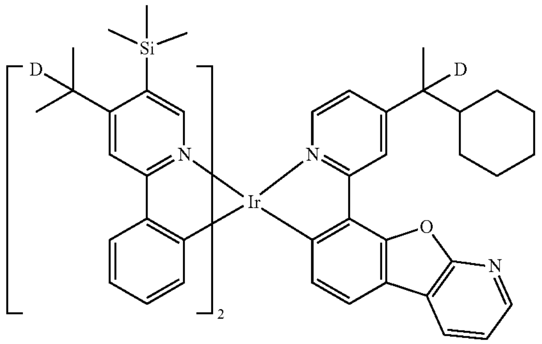
491
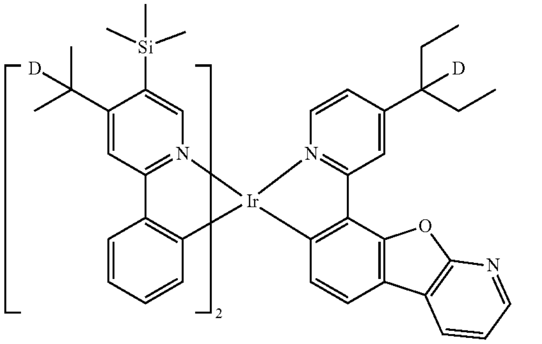
492
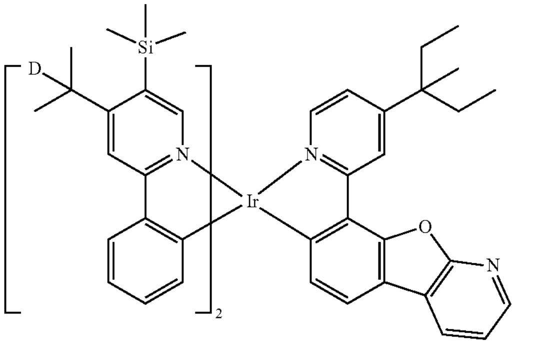
493
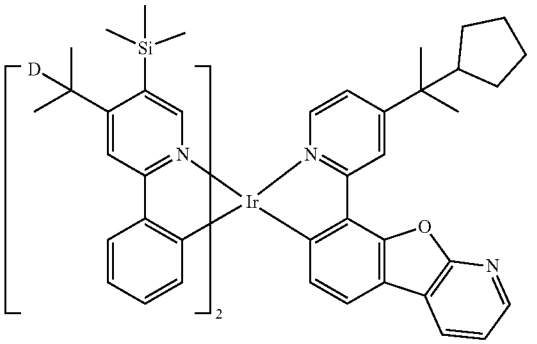
-continued
494
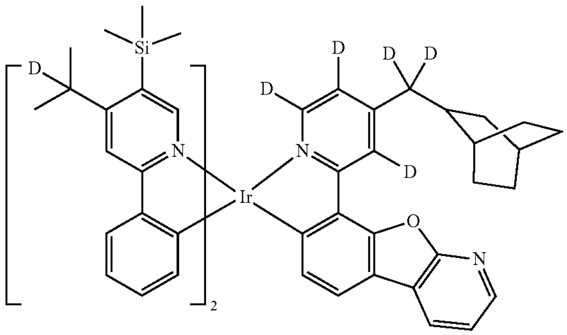
495
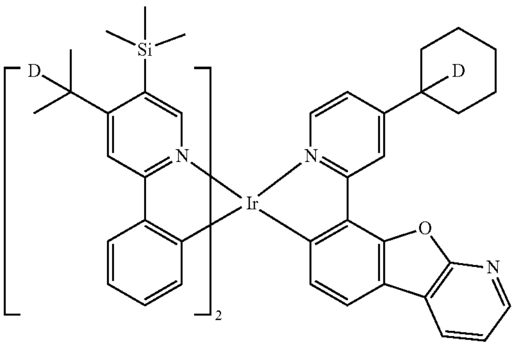
496
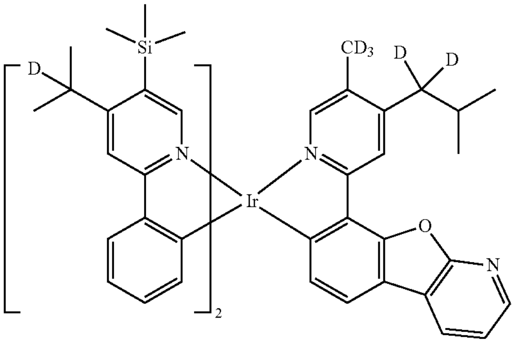
497
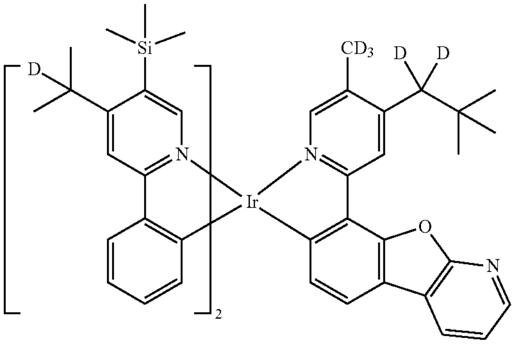

-continued
498
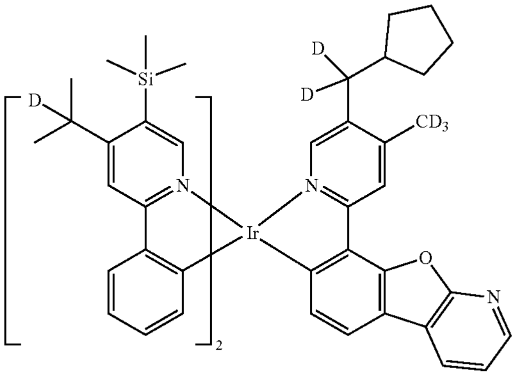
499
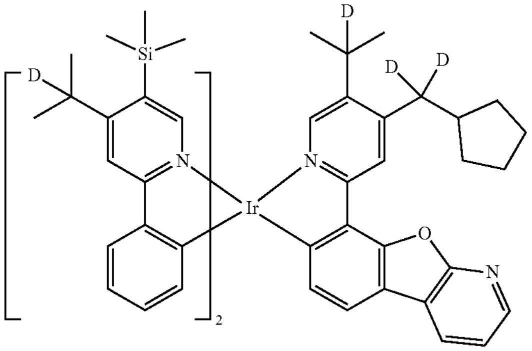
500
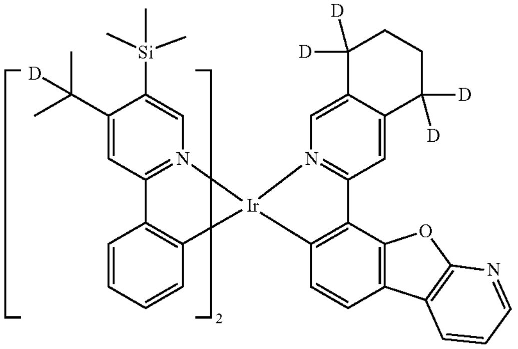
501
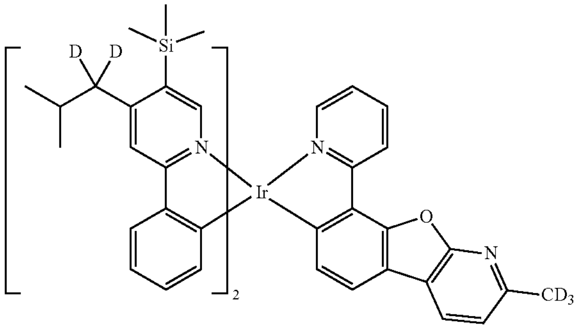
-continued
502
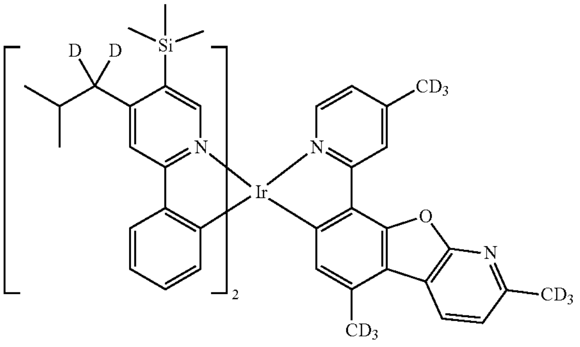
503
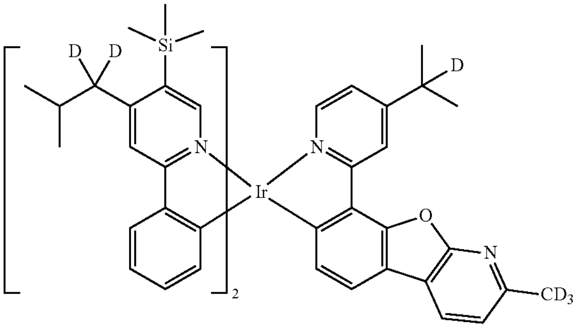
504
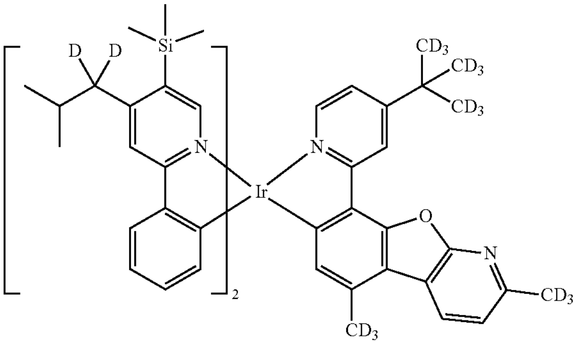
505
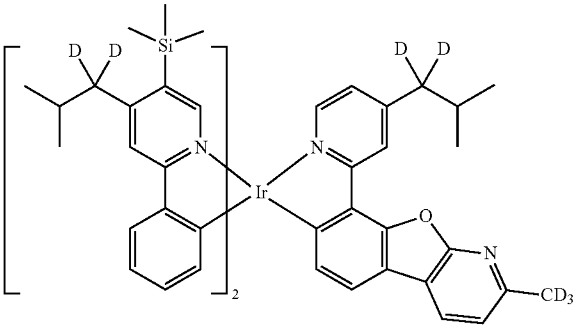

-continued
506
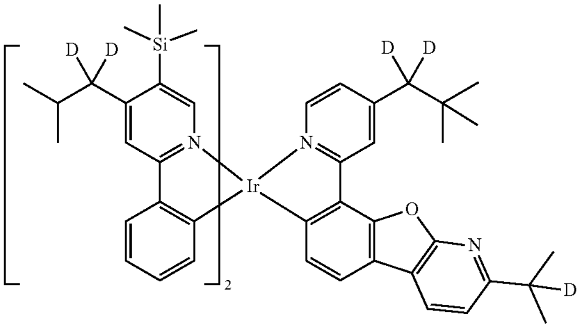
507
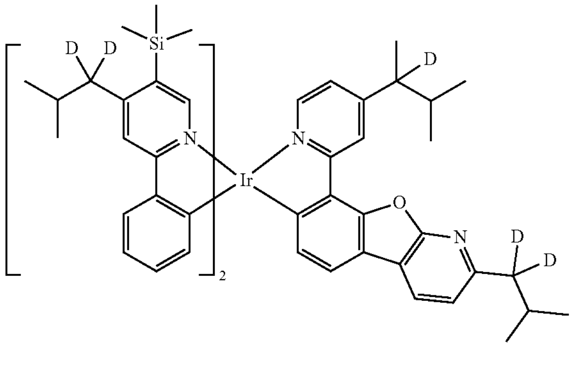
508
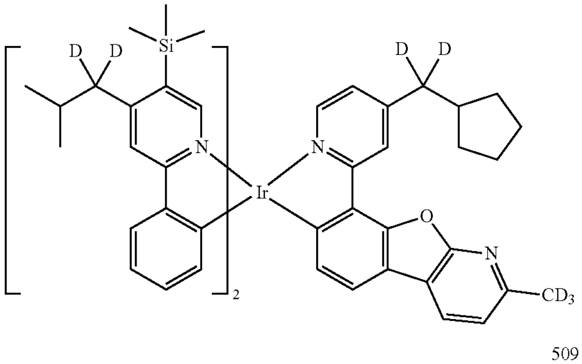
509
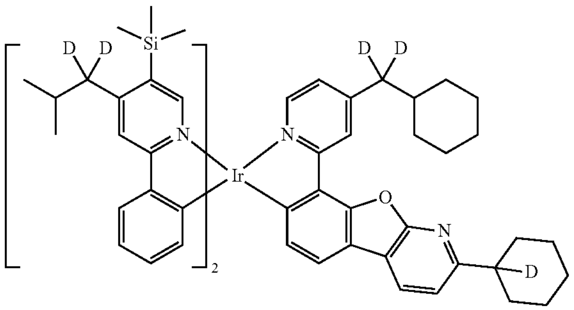
-continued
510
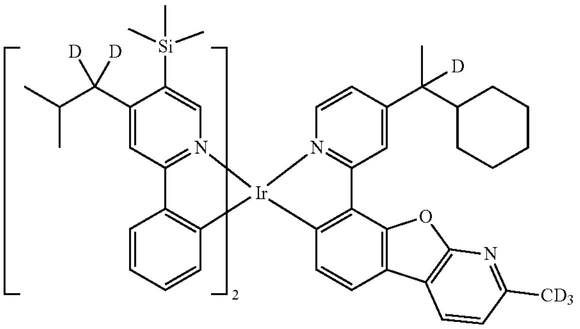
511
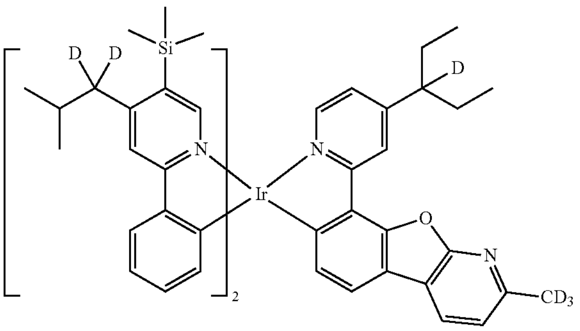
512
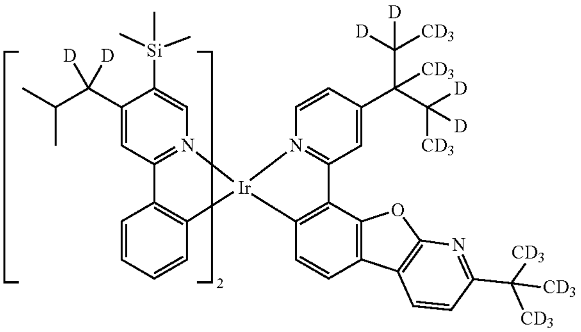
513
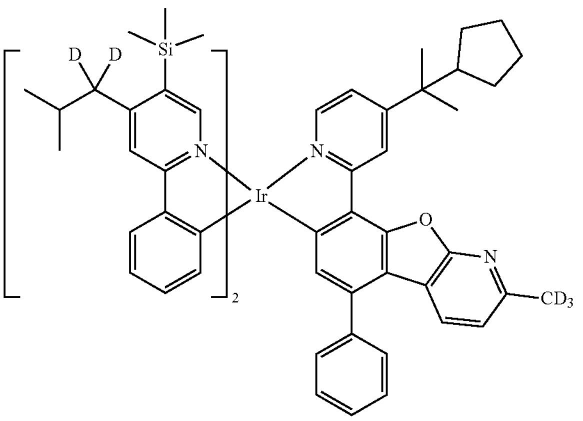

-continued
514
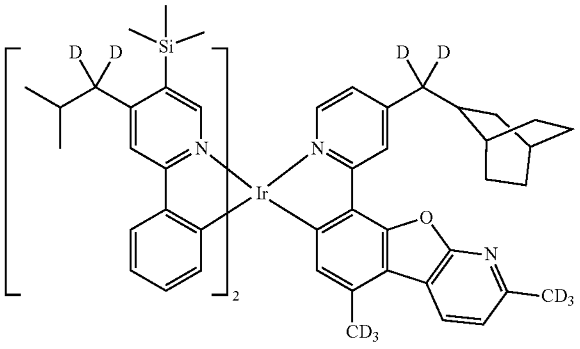
515
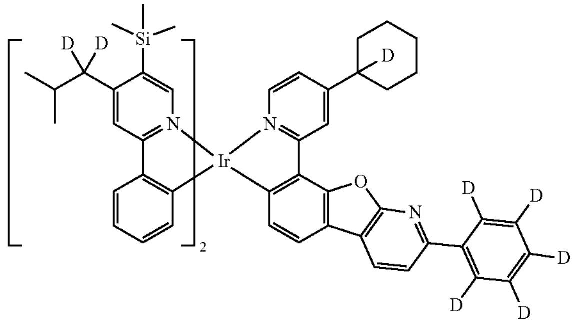
516
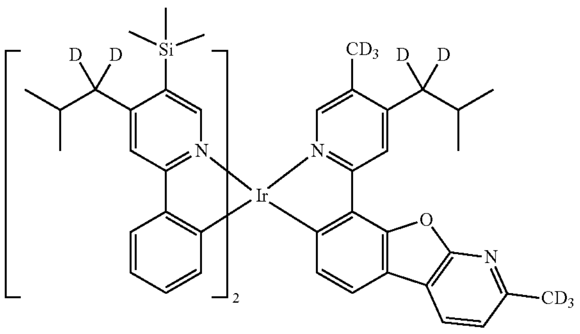
517
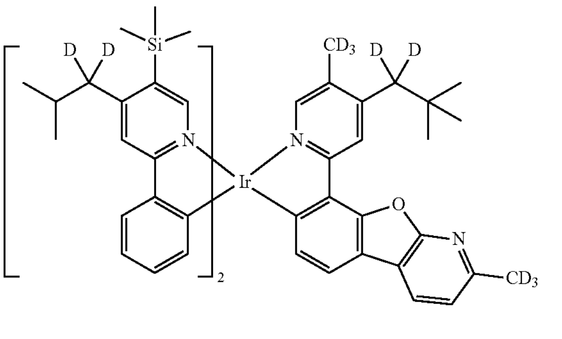
-continued
518
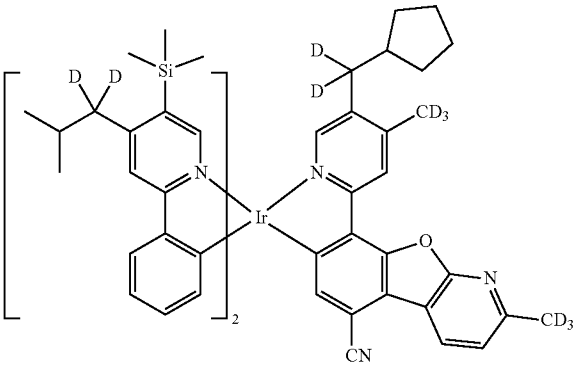
519
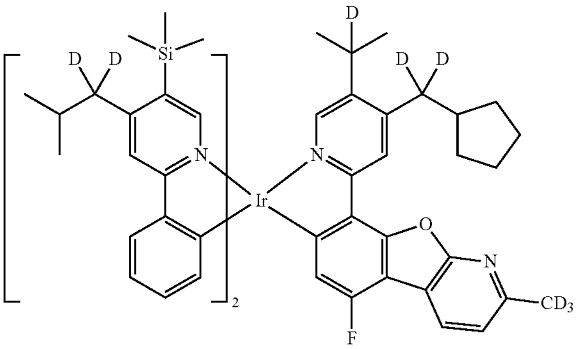
520
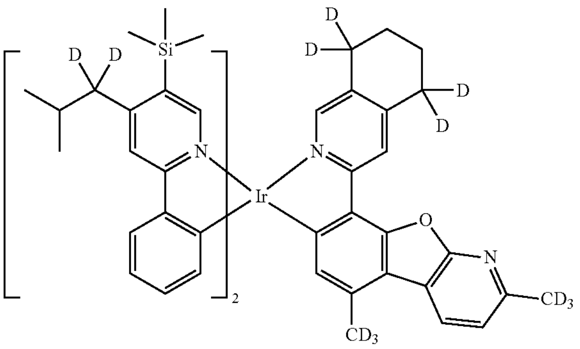
521
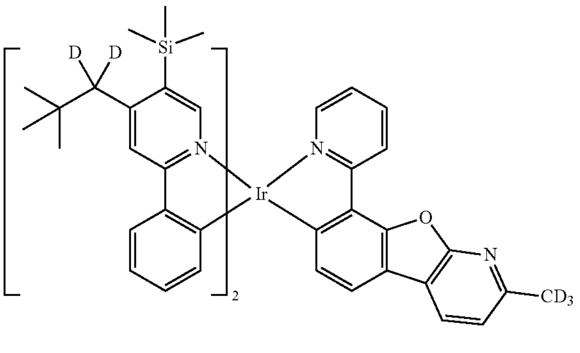

-continued
522
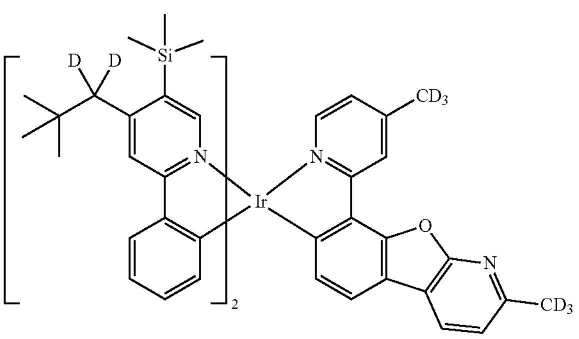
523
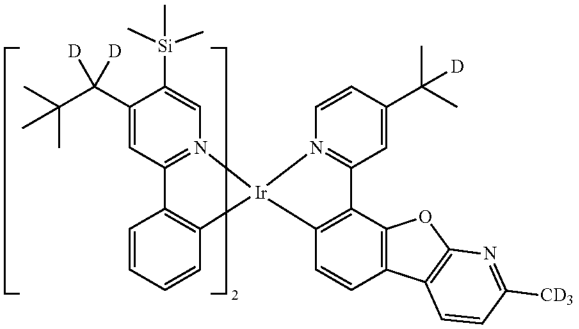
524
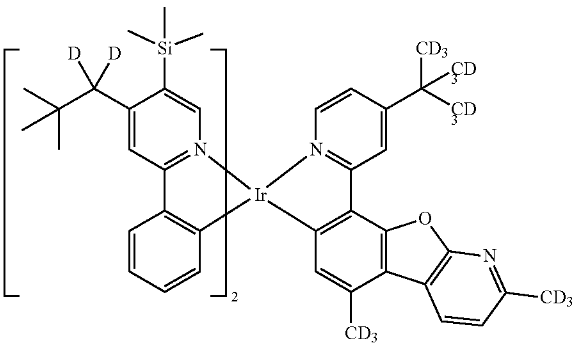
525
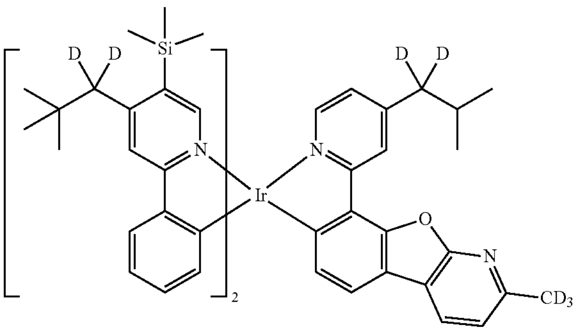
-continued
526
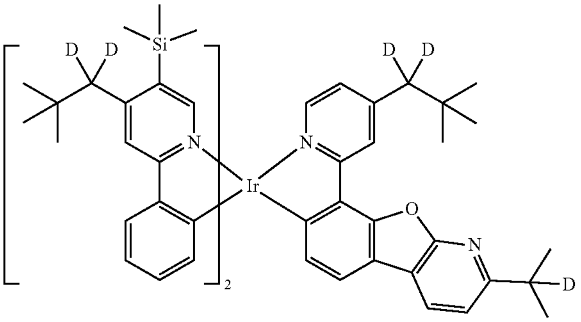
527
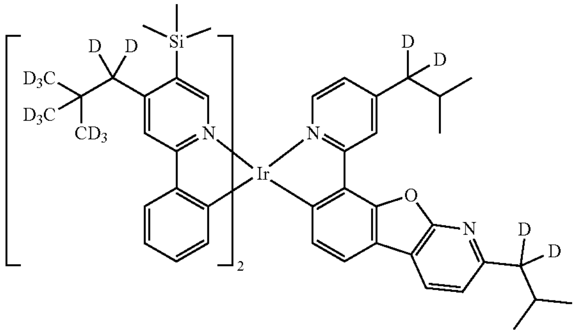
528
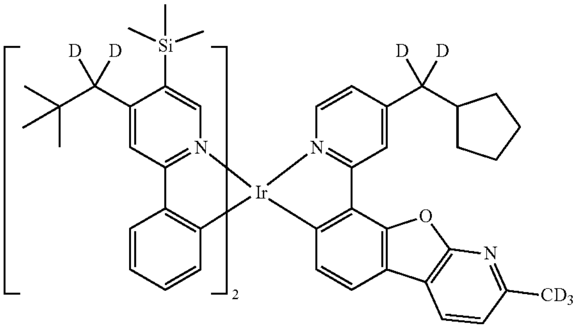
529
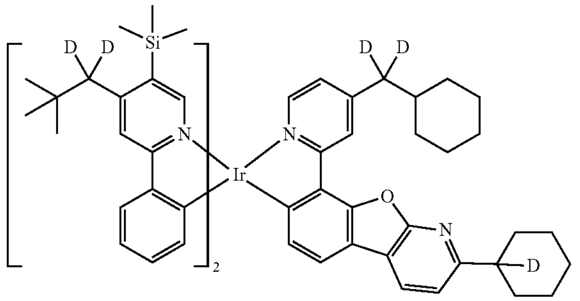

-continued
530
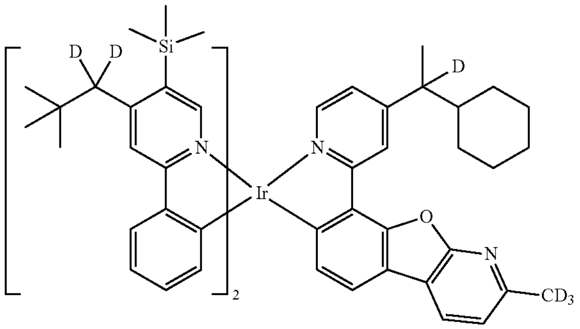
531
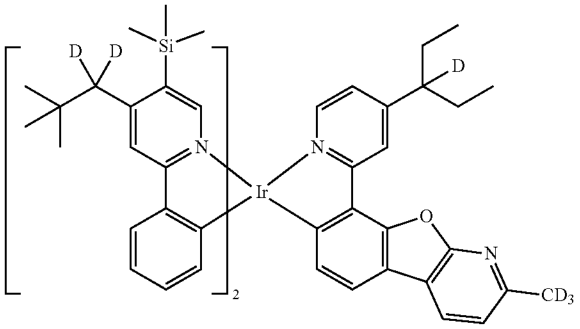
532
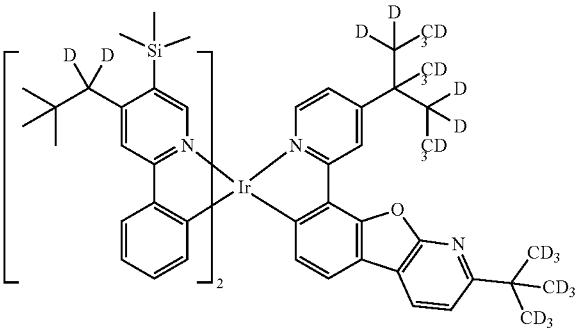
533
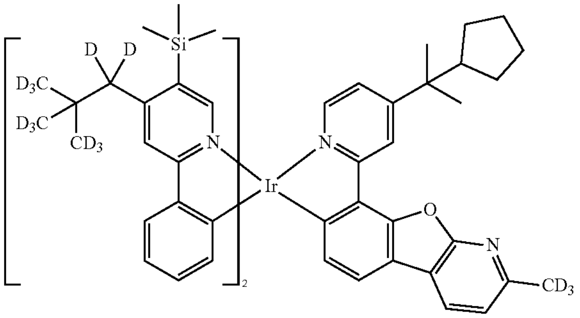
-continued
534
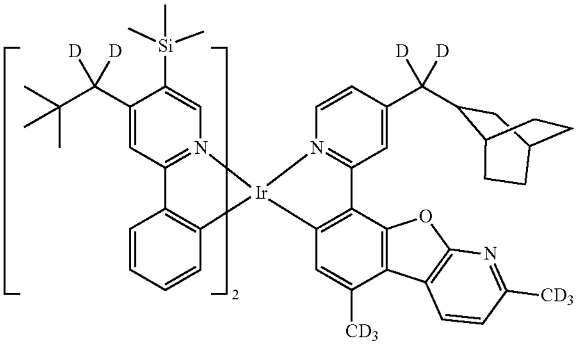
535
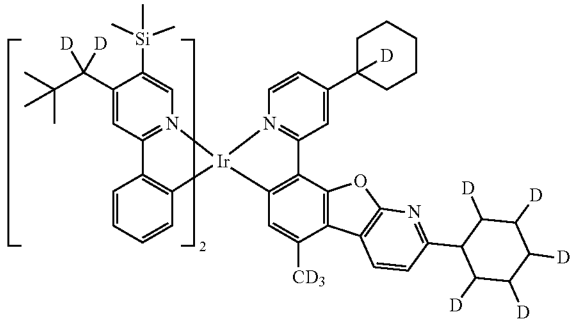
536
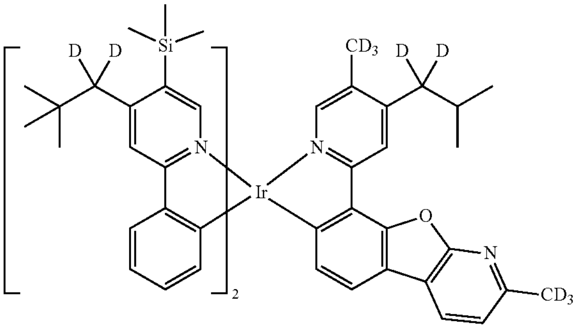
537
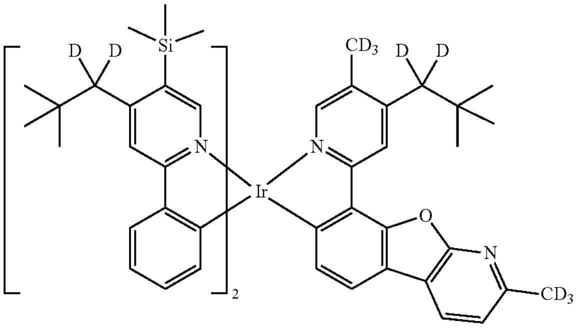

-continued
538
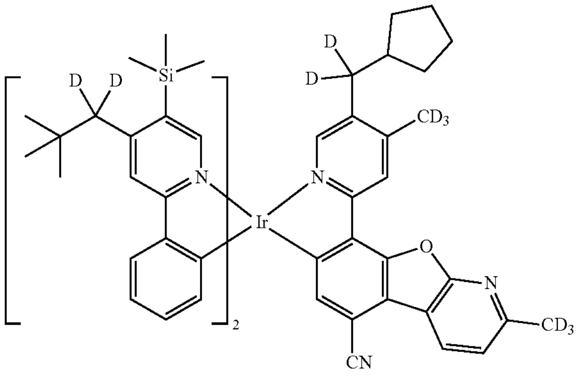
539
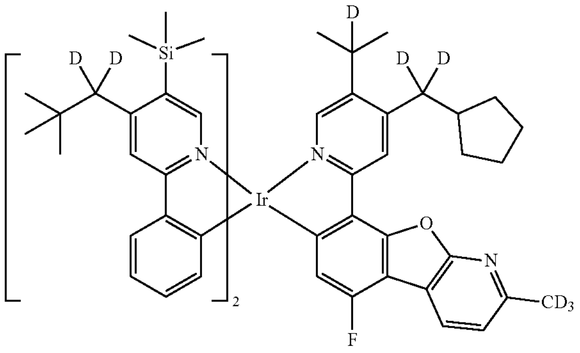
540
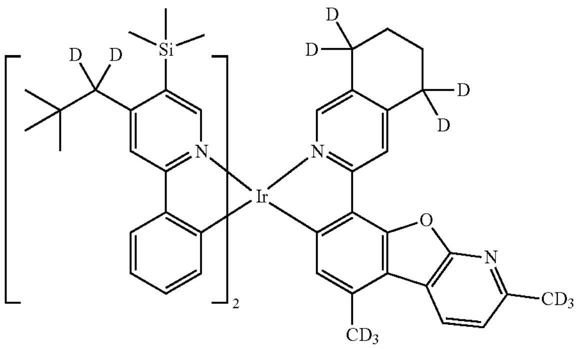
541
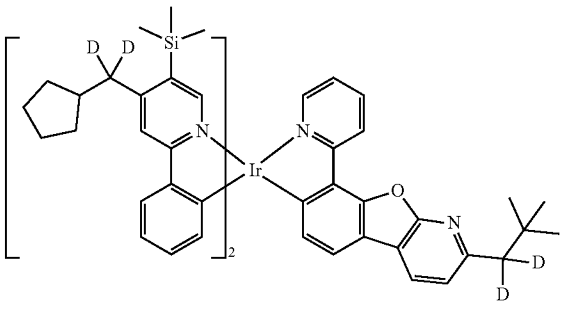
-continued
542
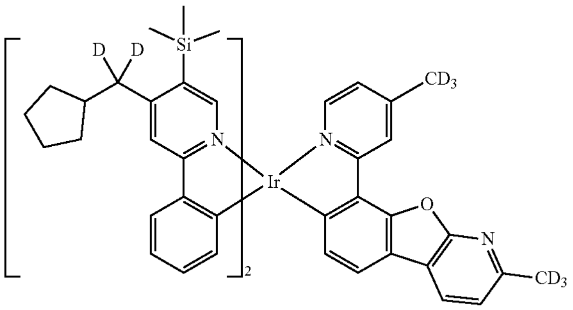
543
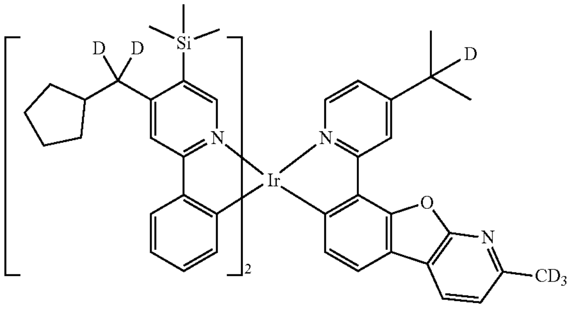
544
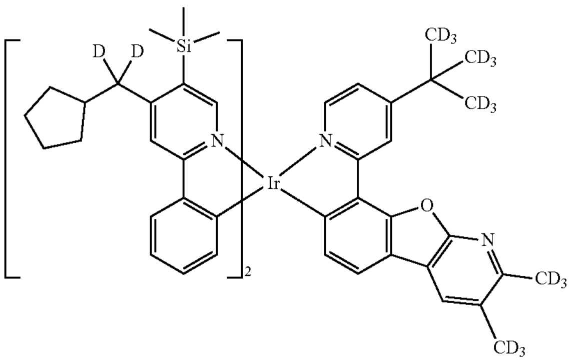
545
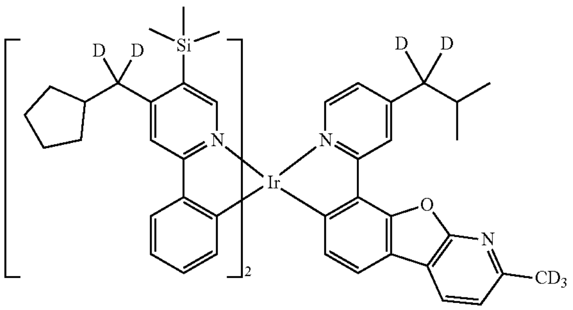

-continued
546
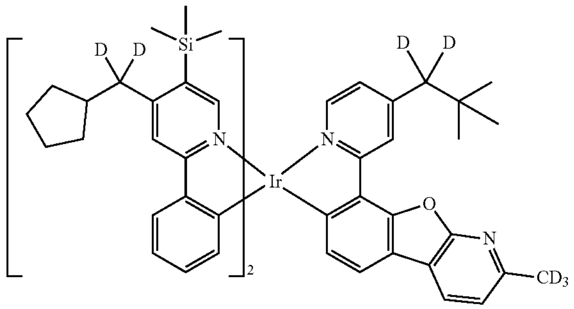
547
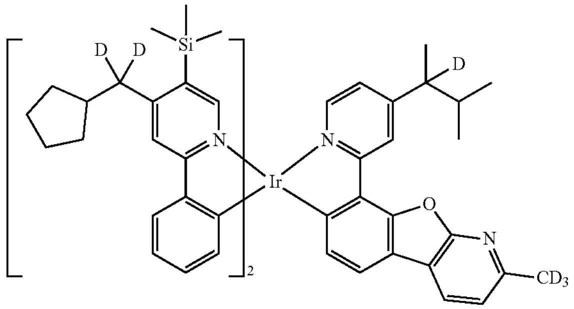
548
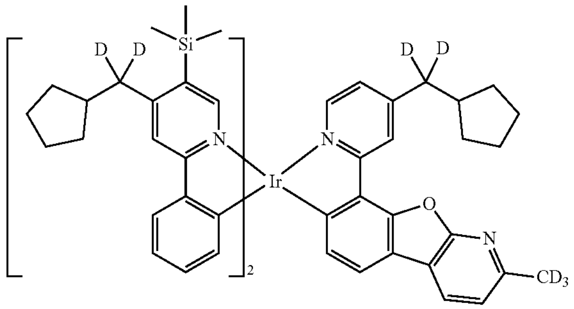
549
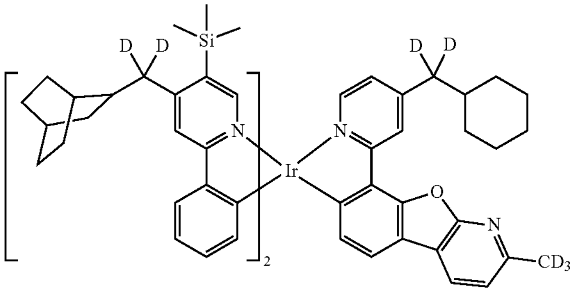
550
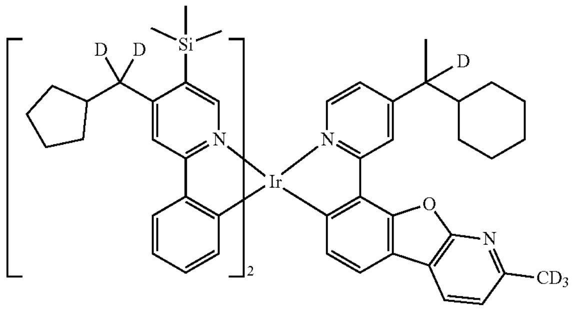
-continued
551
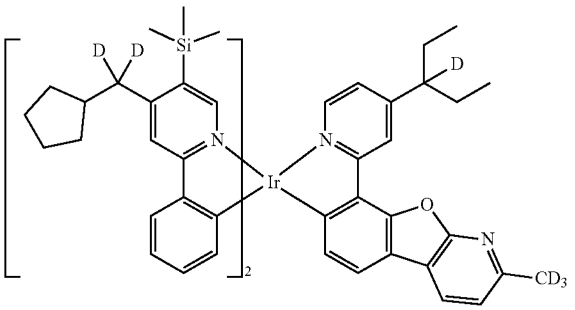
552
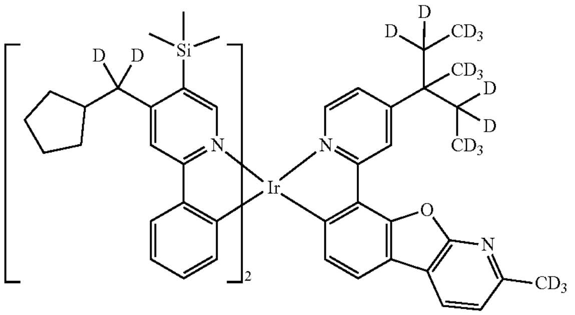
553
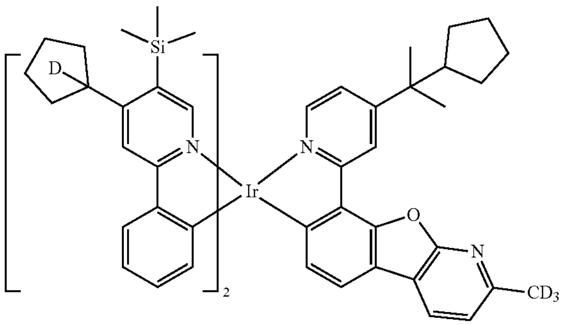
554
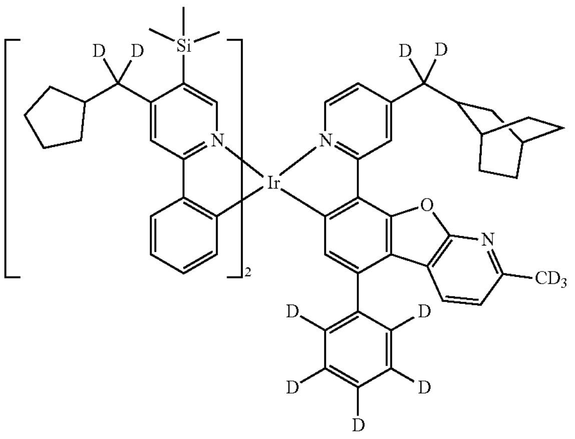

-continued
555
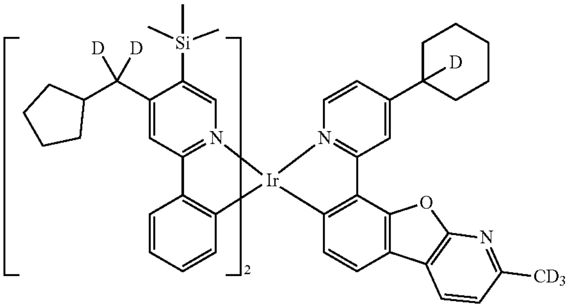
556
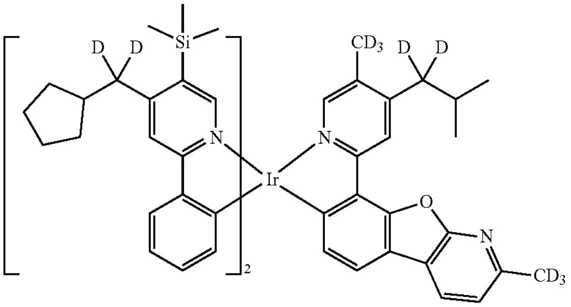
557
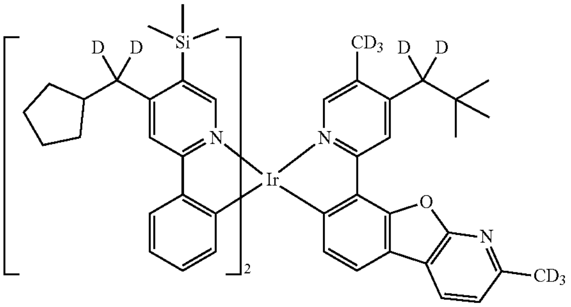
558
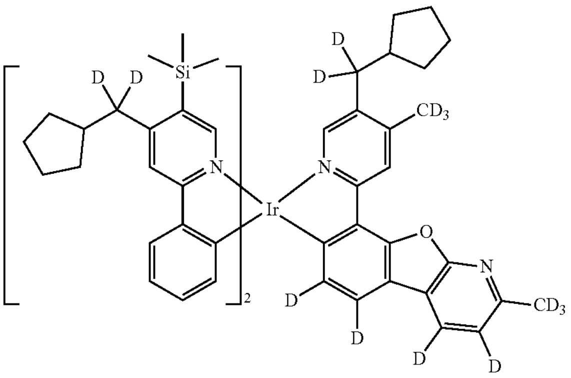
-continued
559
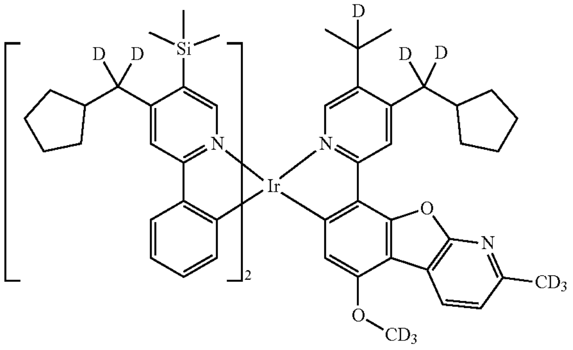
560
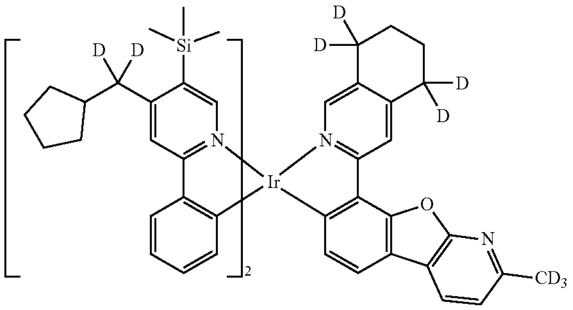
561
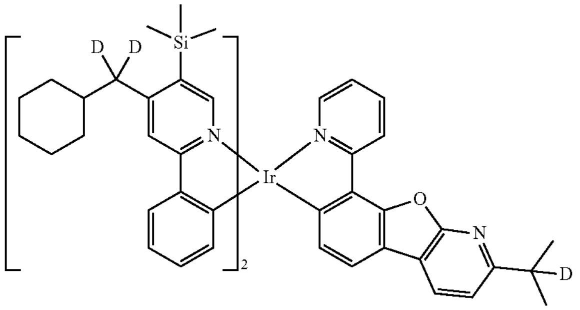
562
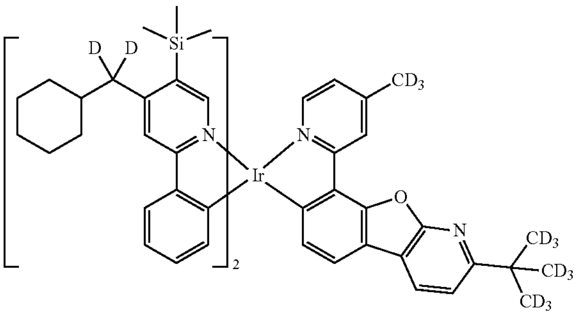

-continued
563
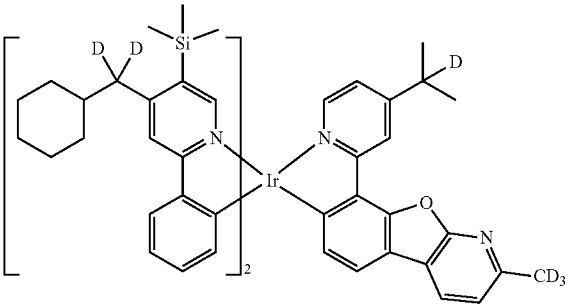
564
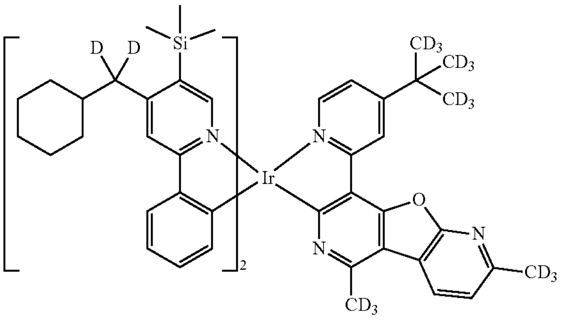
565
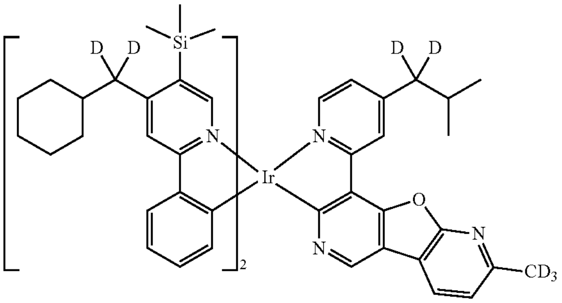
566
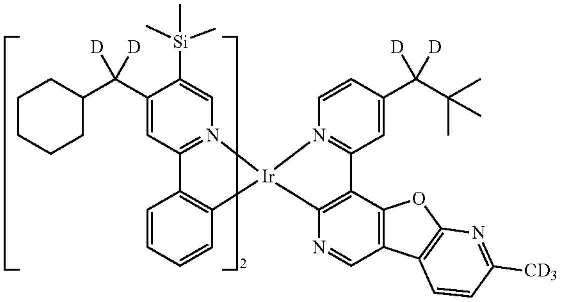
-continued
567
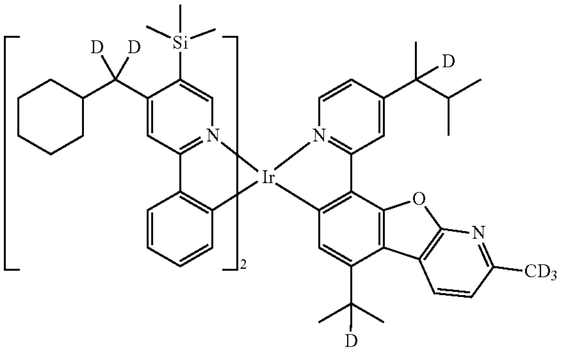
568
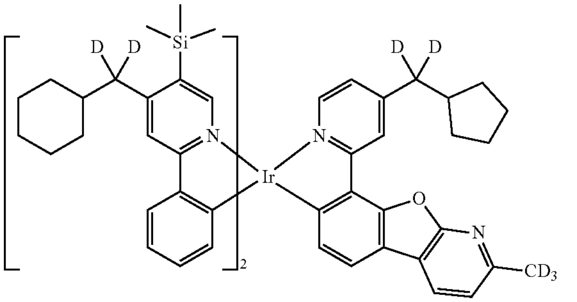
569
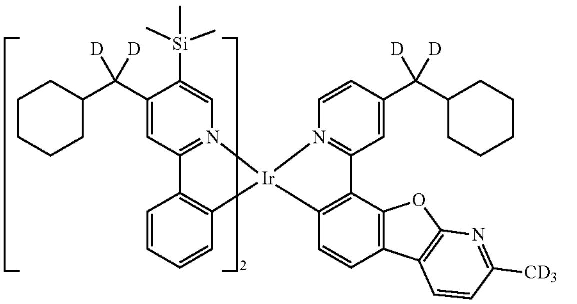
570
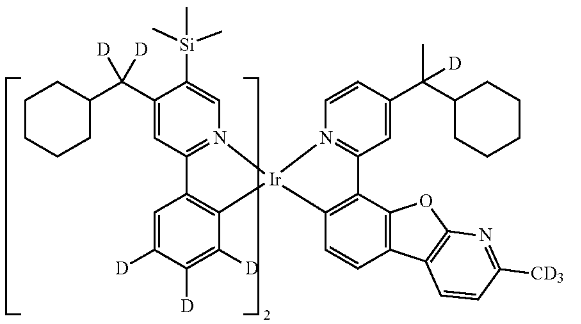

-continued
571
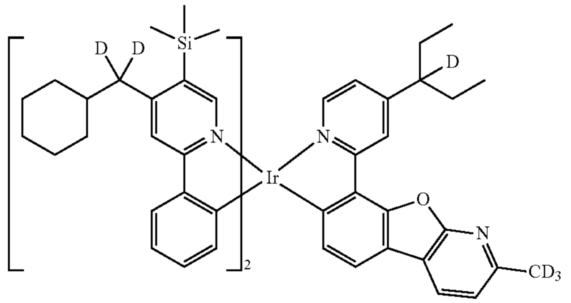
572
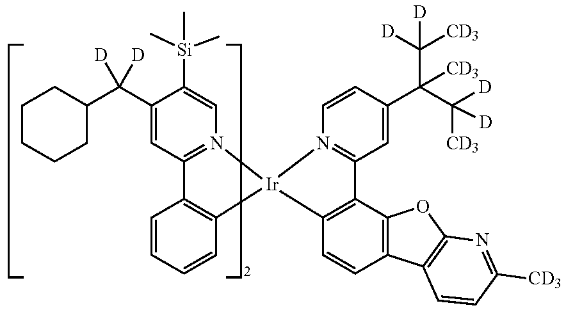
573
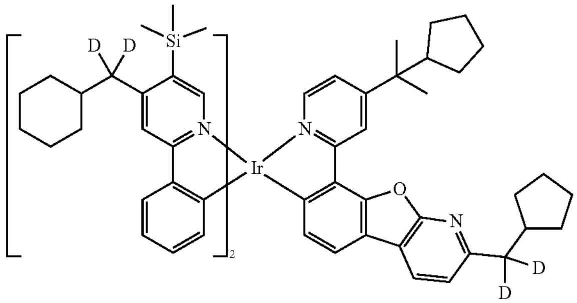
574
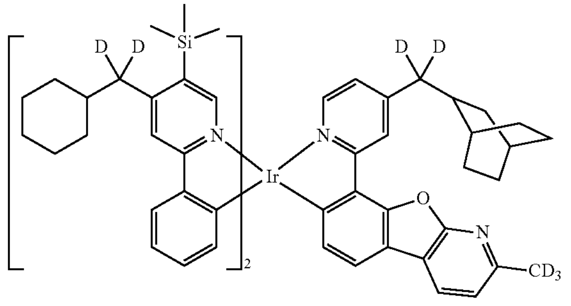
575
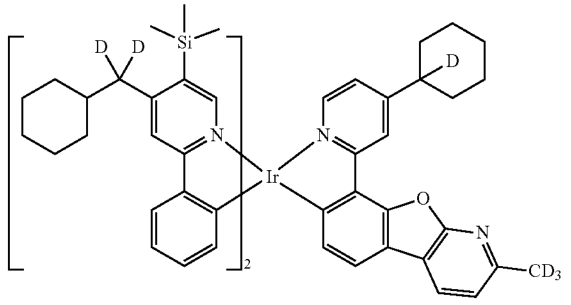
-continued
576
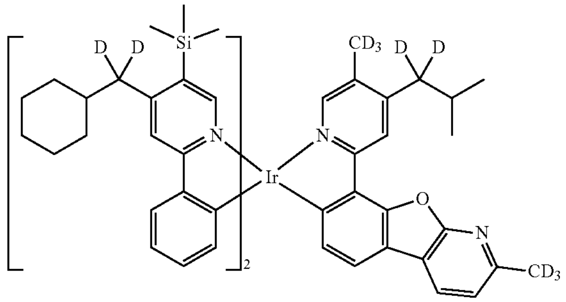
577
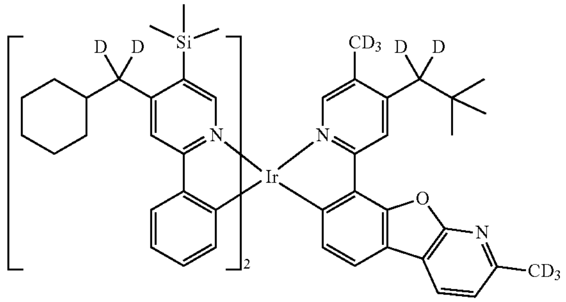
578
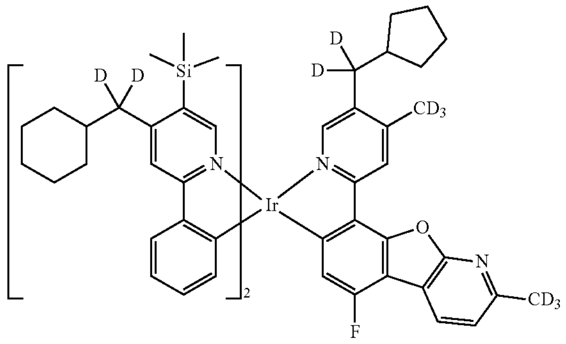
579
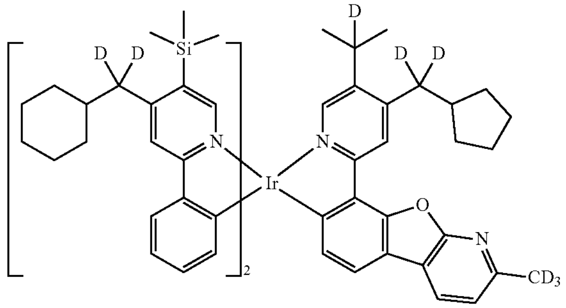

-continued
580
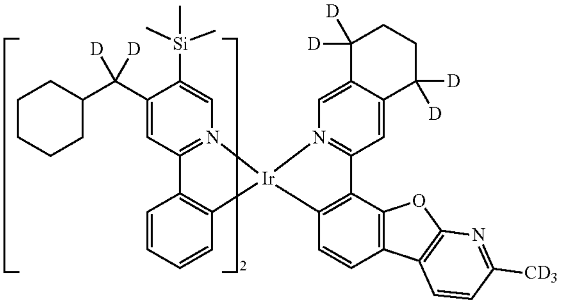
581
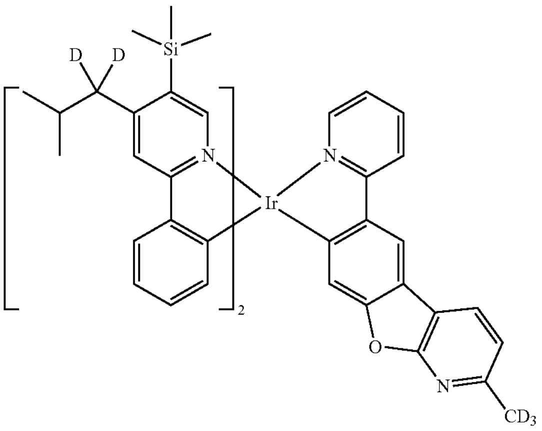
582
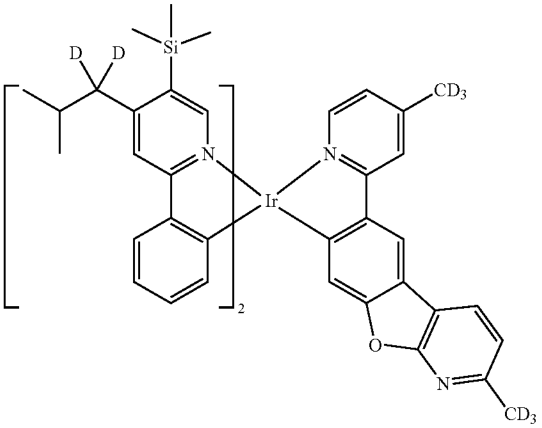
-continued
583
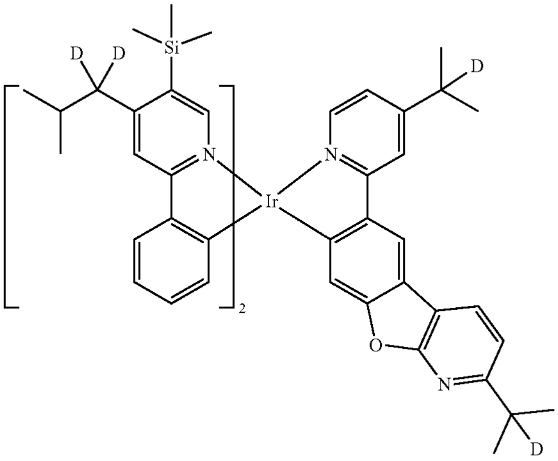
584
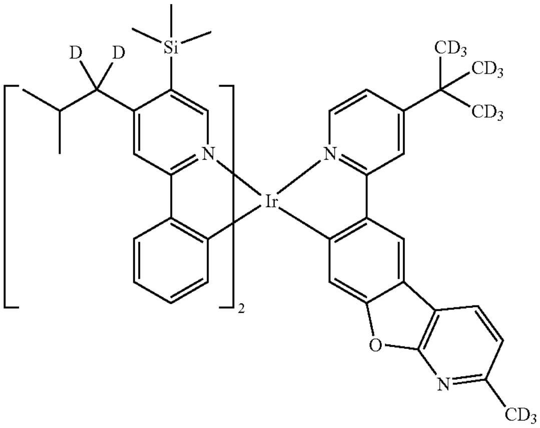
585
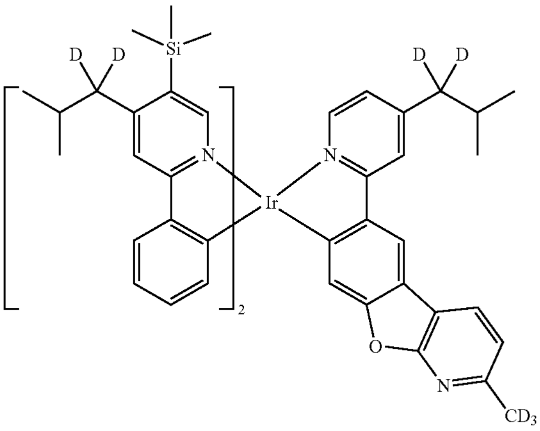

-continued
586
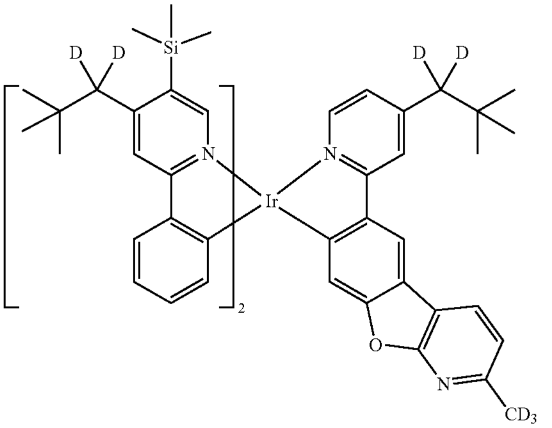
587
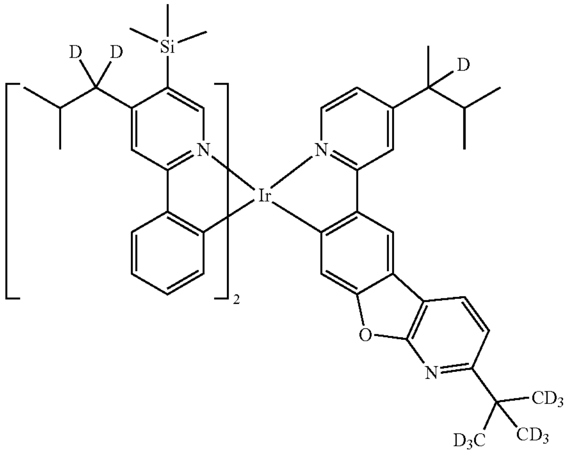
588
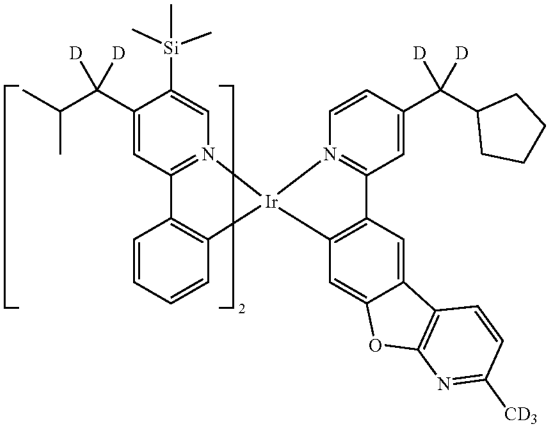
-continued
589
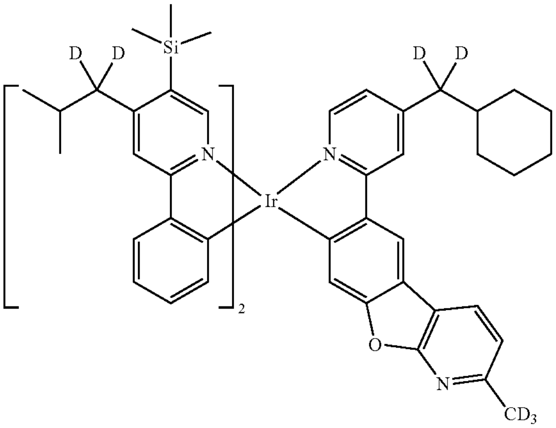
590
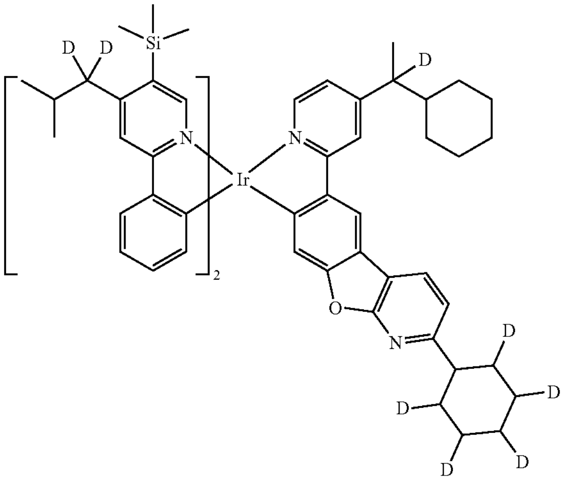
591
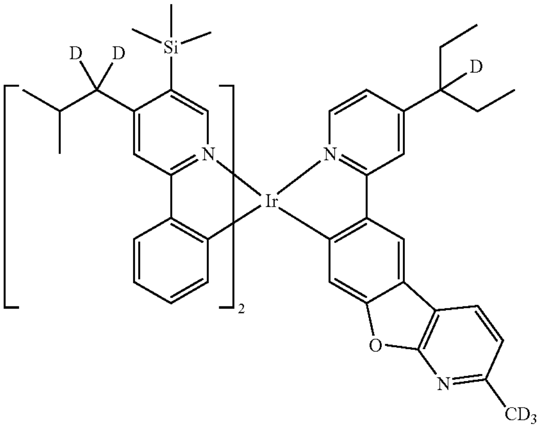

-continued
592
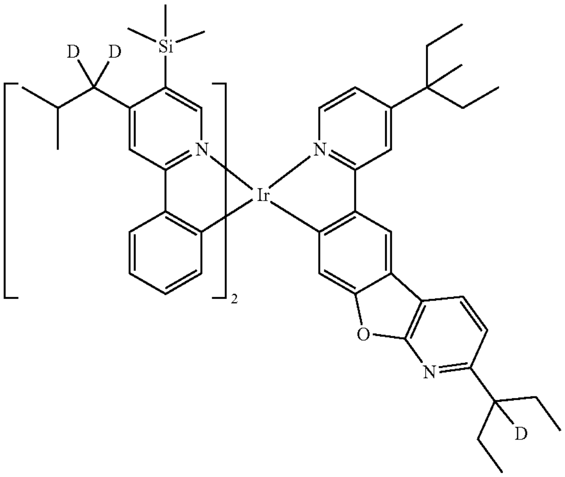
593
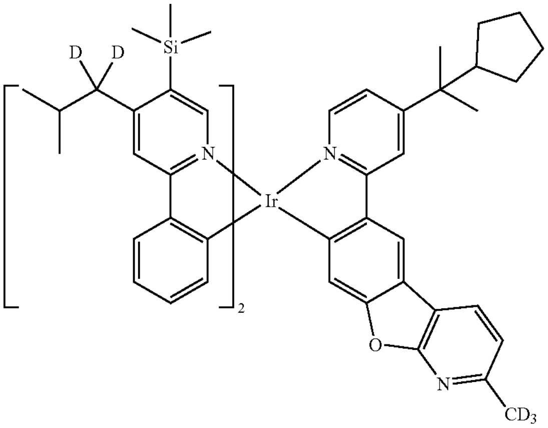
594
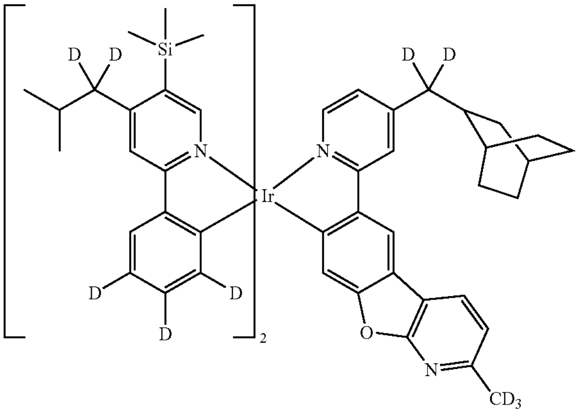
-continued
595
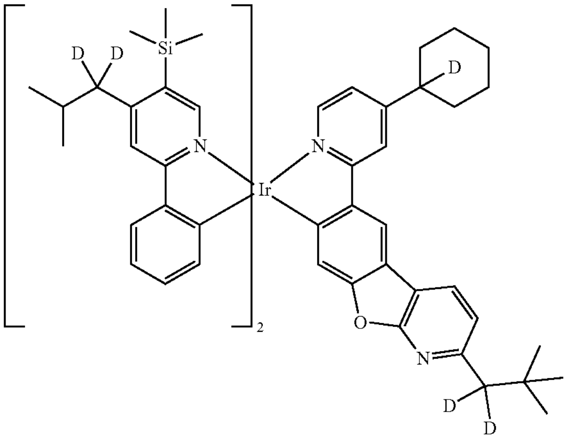
596
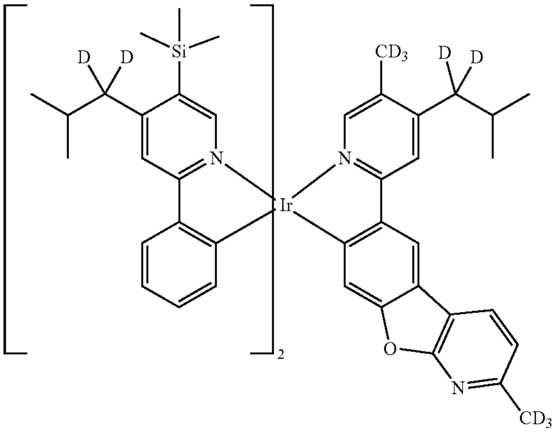
597
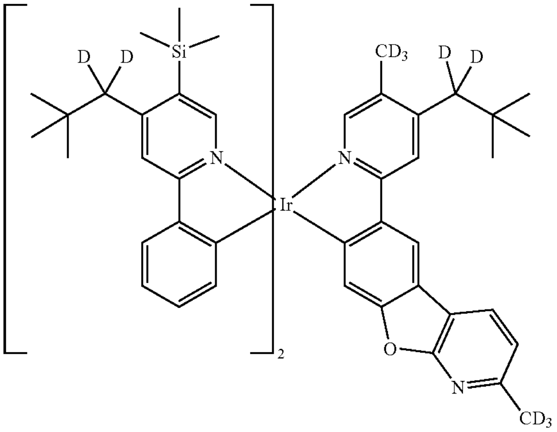

-continued
598
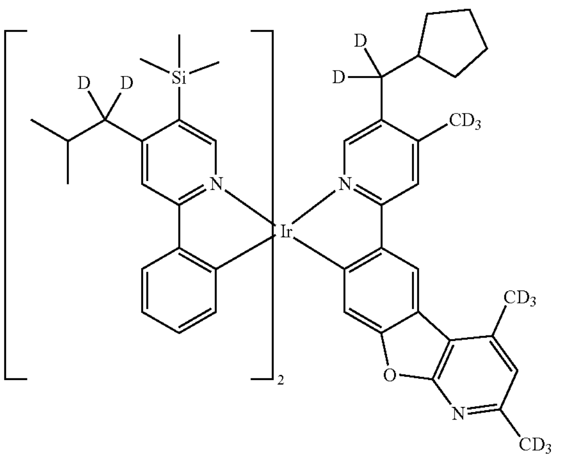
599
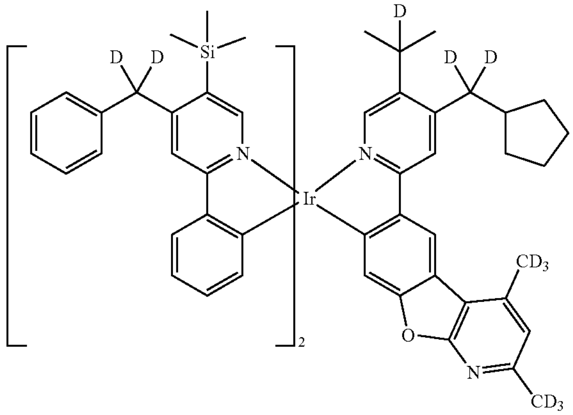
600
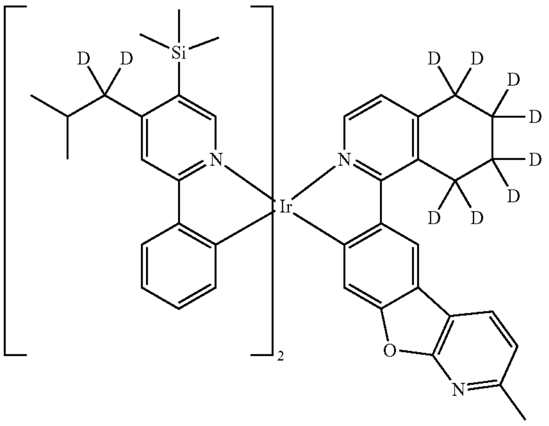
-continued
601
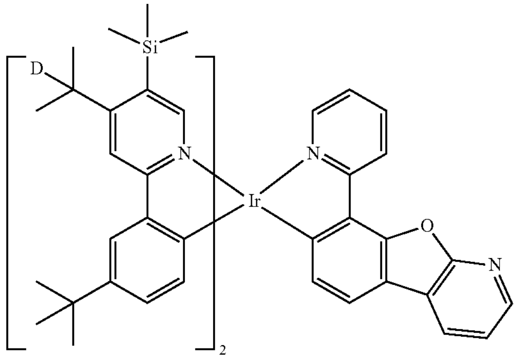
602
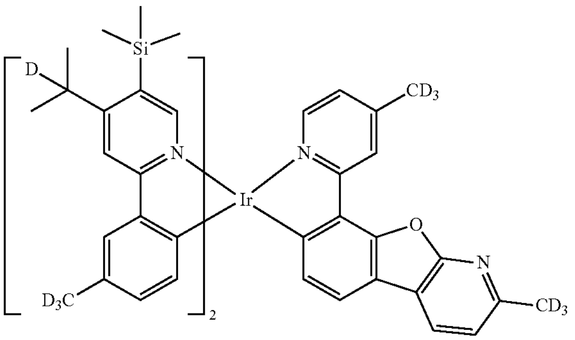
603
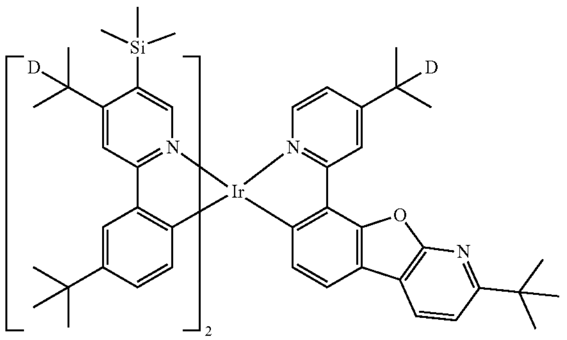
604
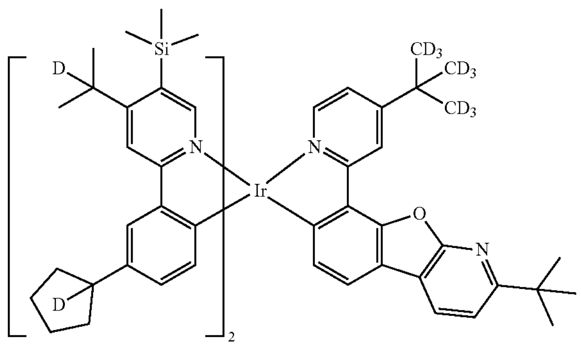

-continued
605
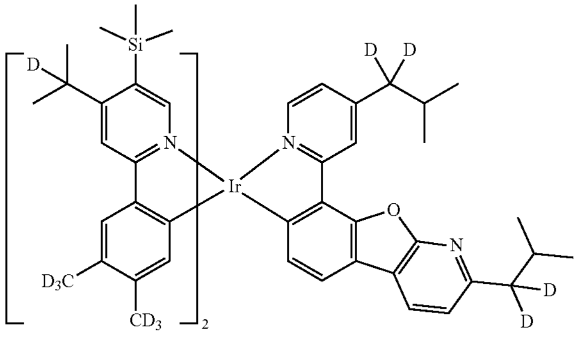
606
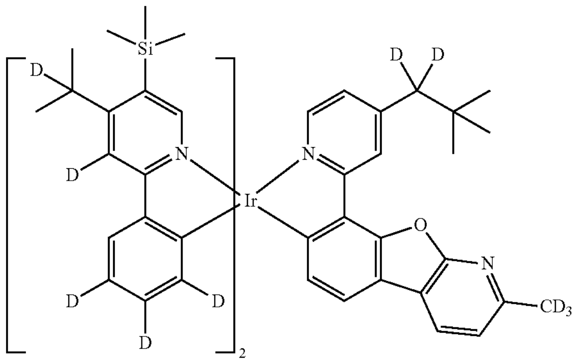
607
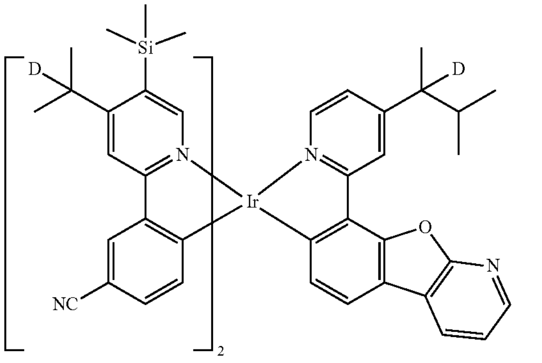
608
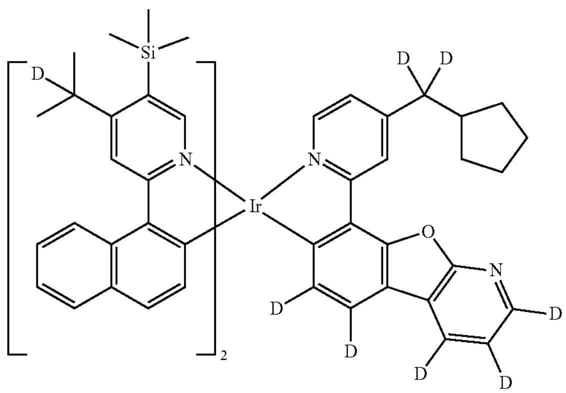
609
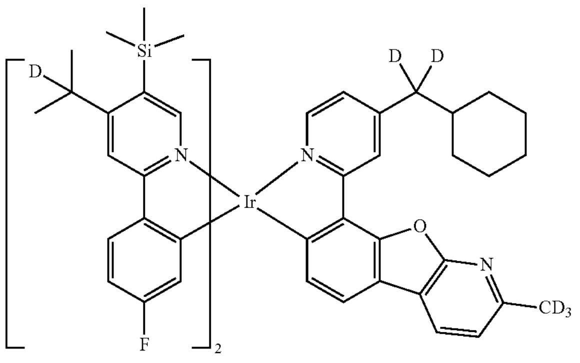
610
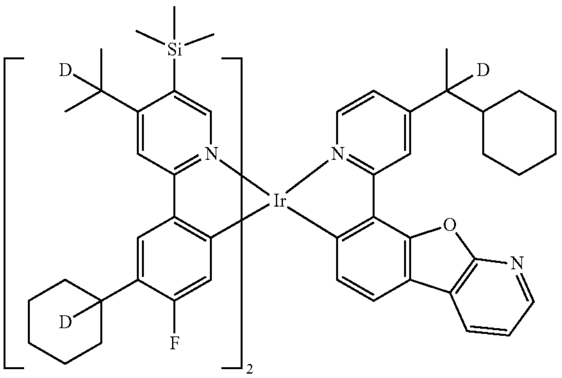
611
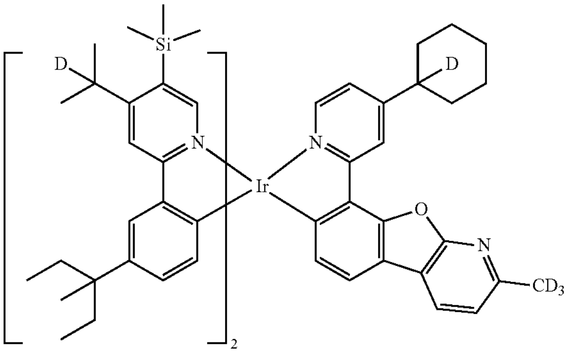
612
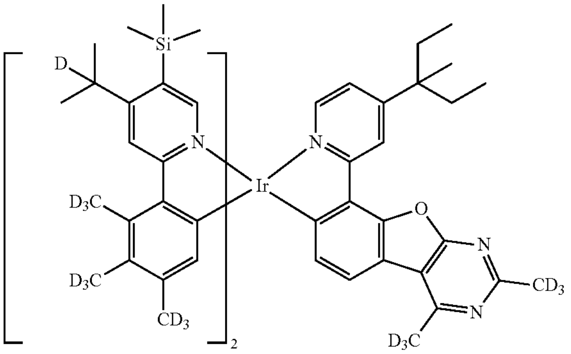

-continued
613
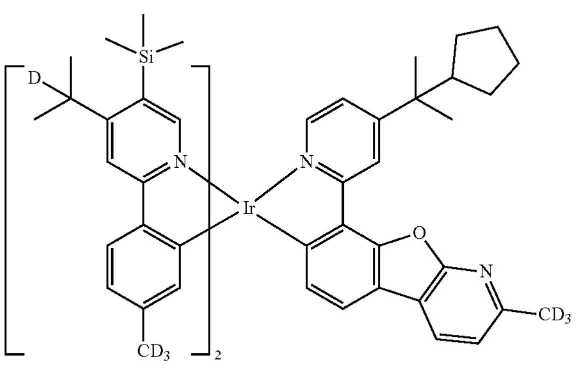
614
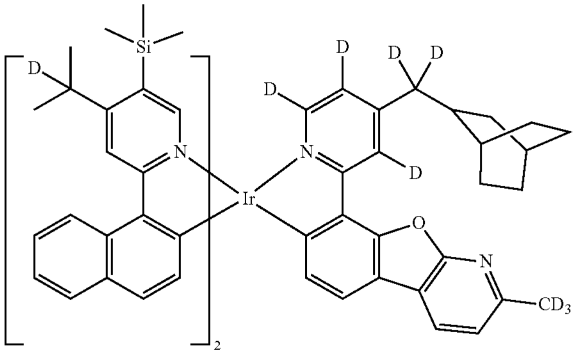
615
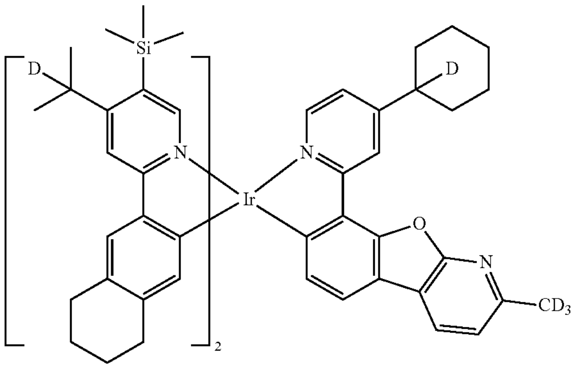
616
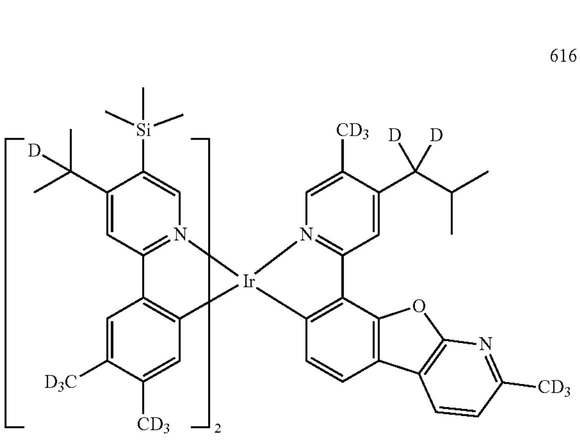
-continued
617
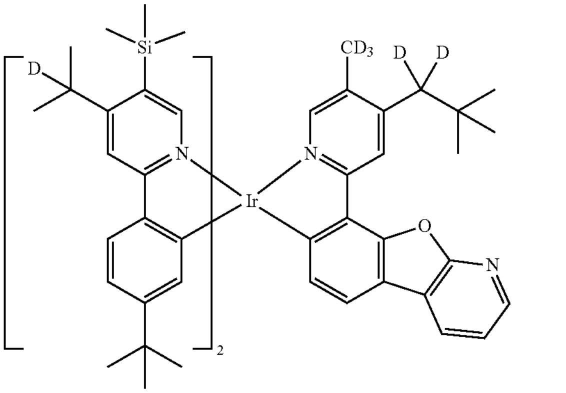
618
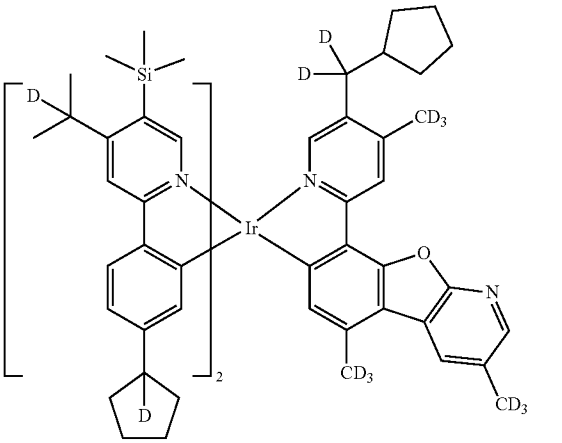
619
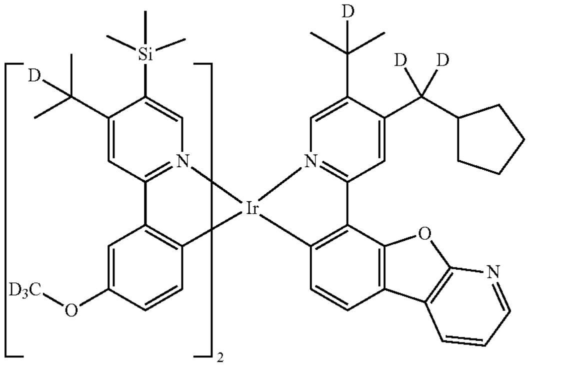
620
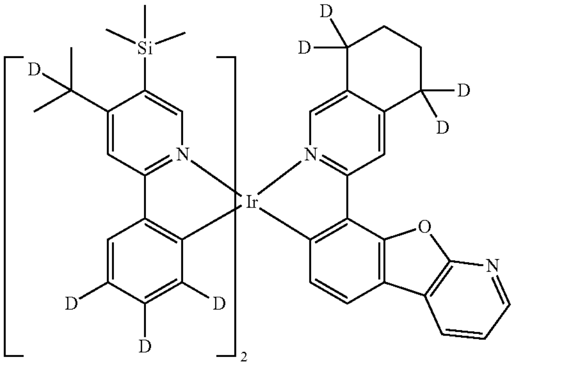

-continued
621
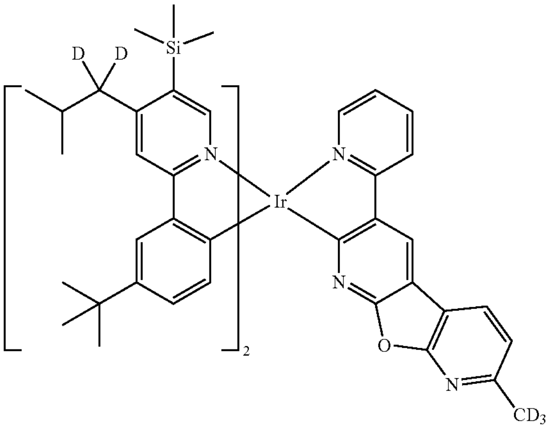
622
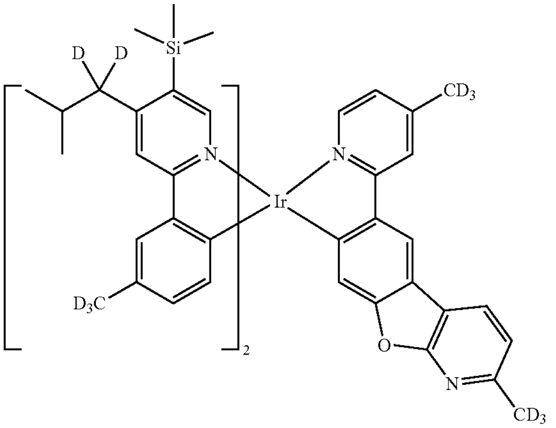
623
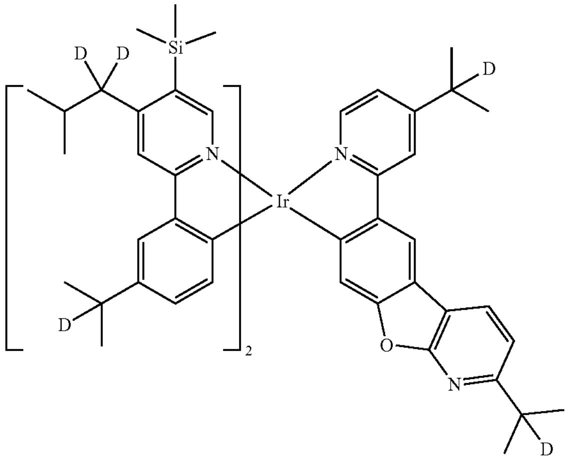
-continued
624
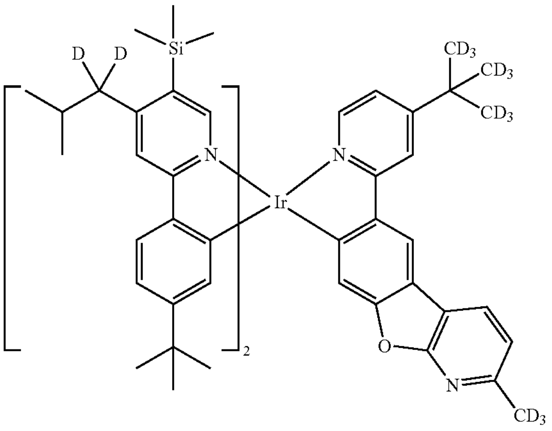
625
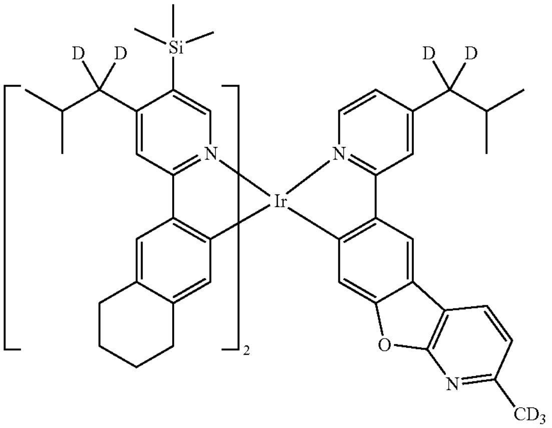
626
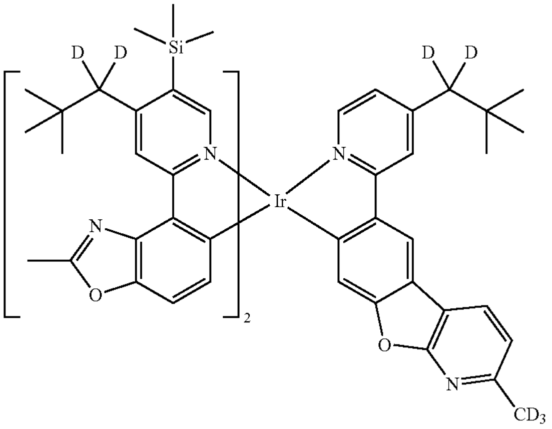

-continued
627
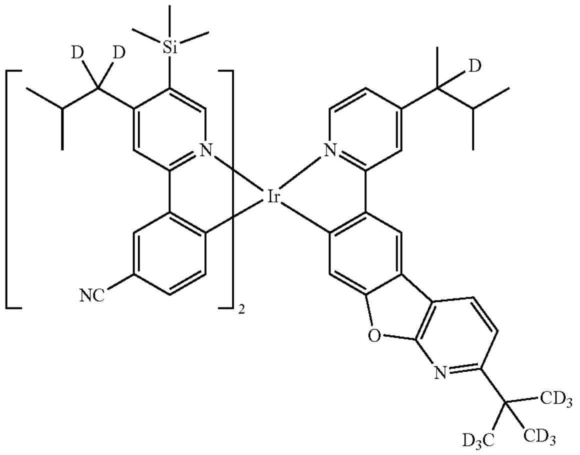
628
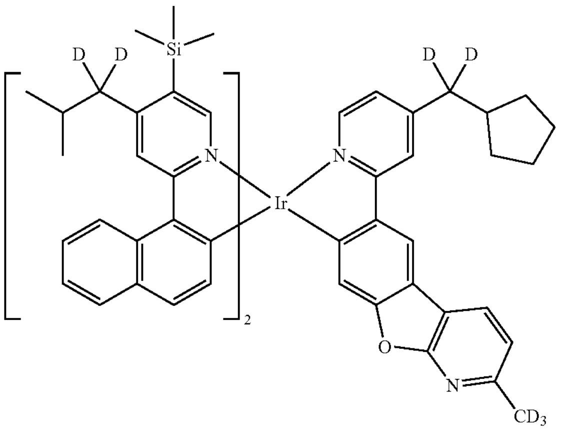
629
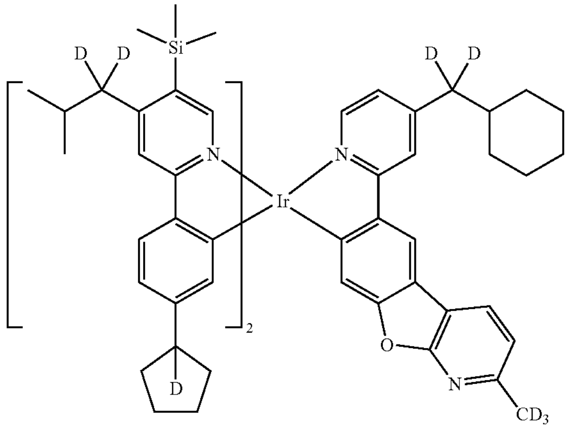
-continued
630
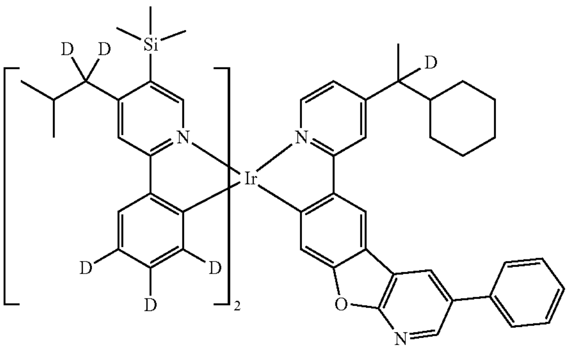
631
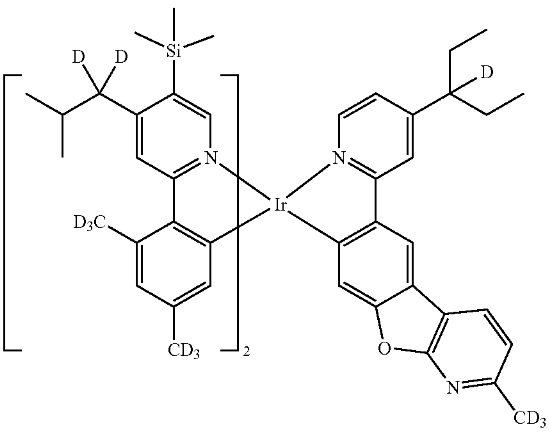
632
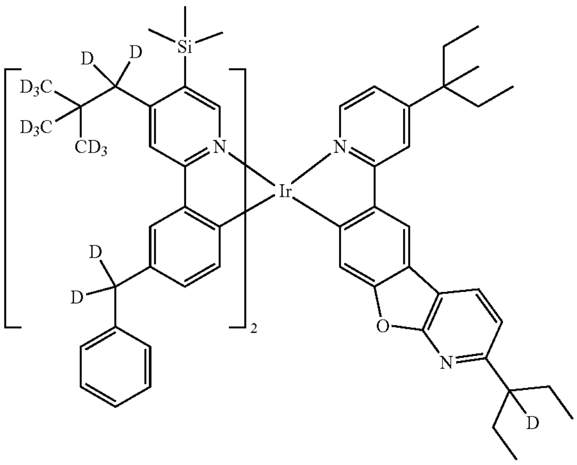

633
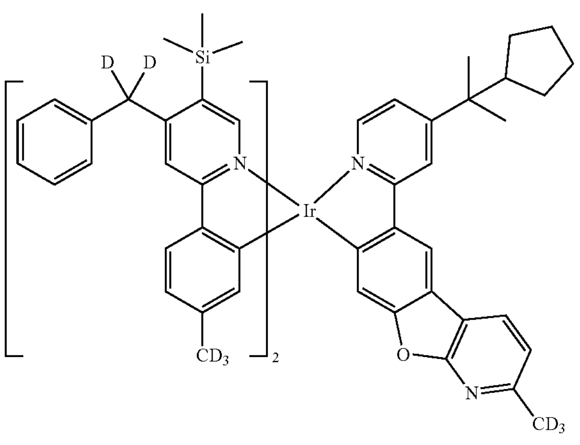
634
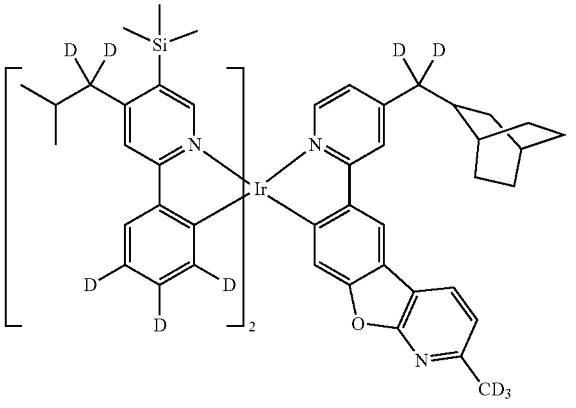
635
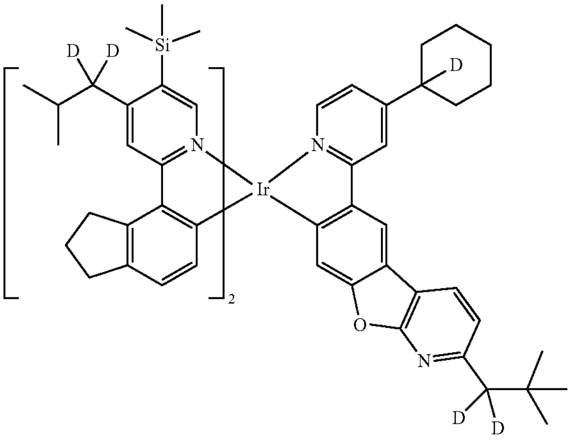
636
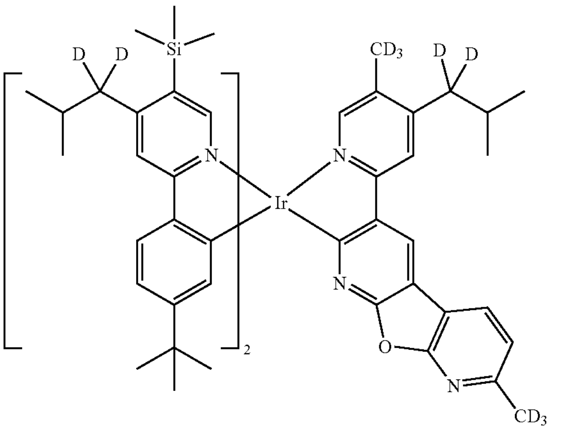
637
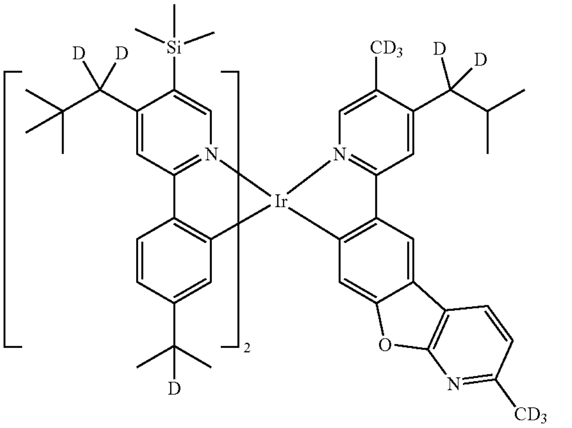
638
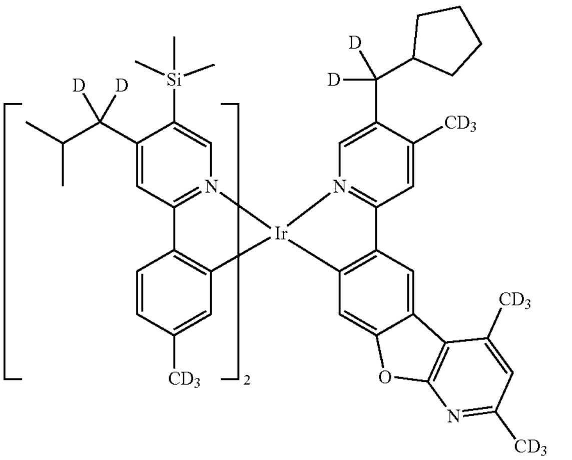

-continued
639
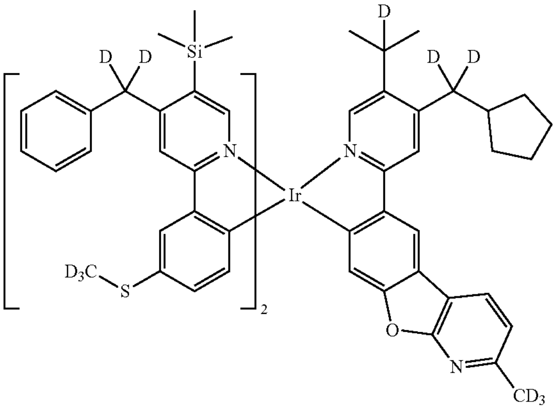
640
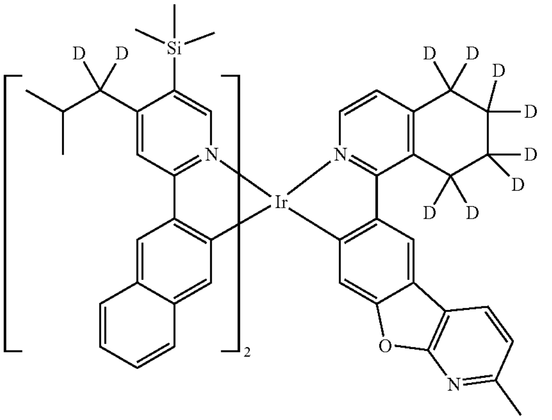
641
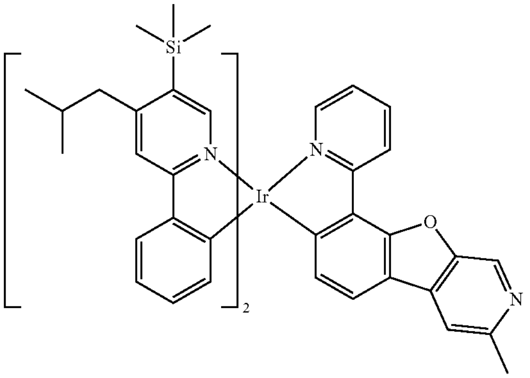
-continued
642
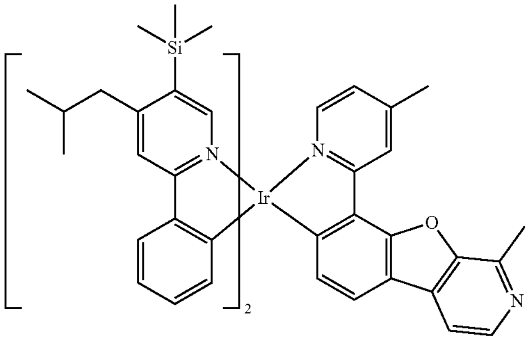
643
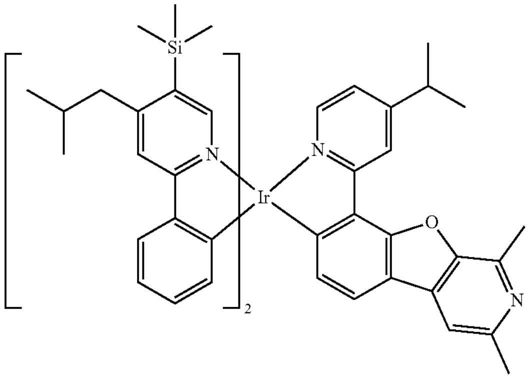
644
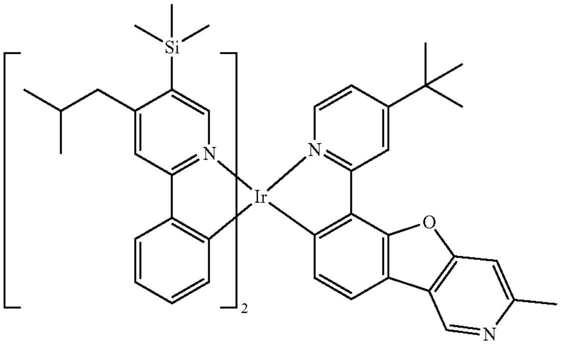
645
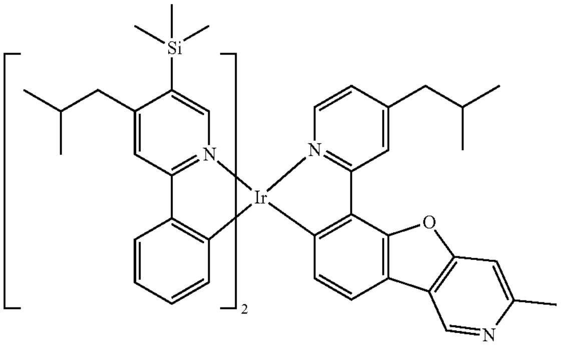

-continued
646
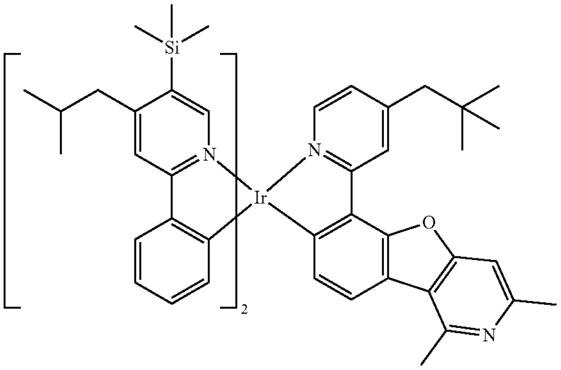
647
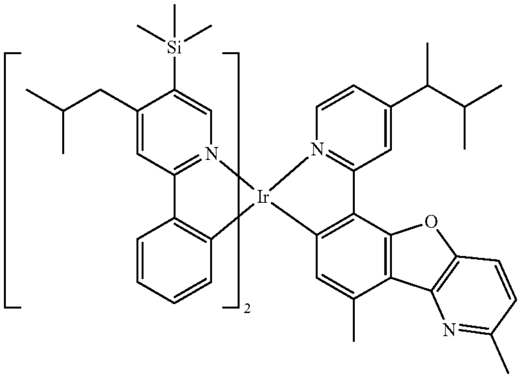
648
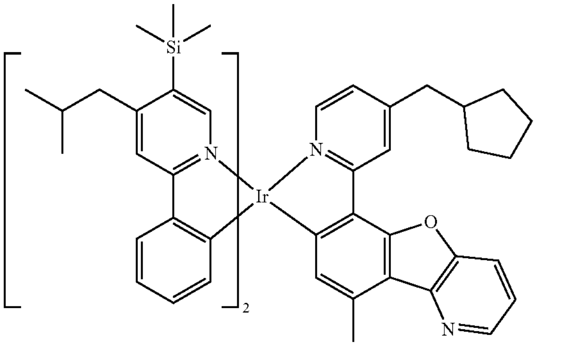
649
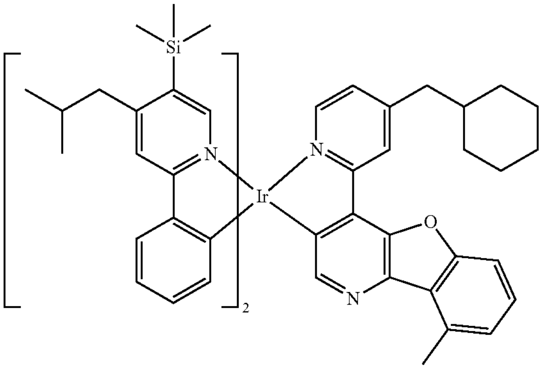
-continued
650
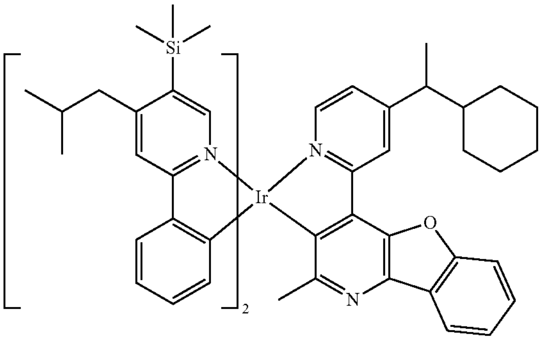
651
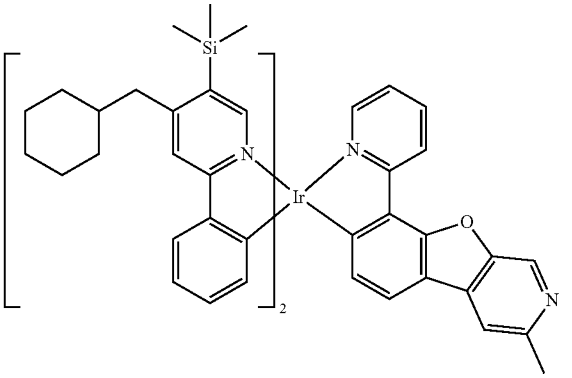
652
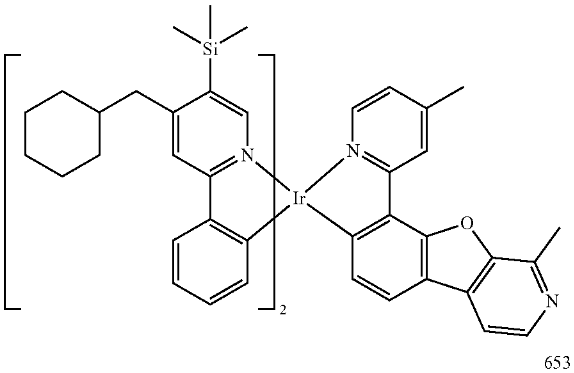
653
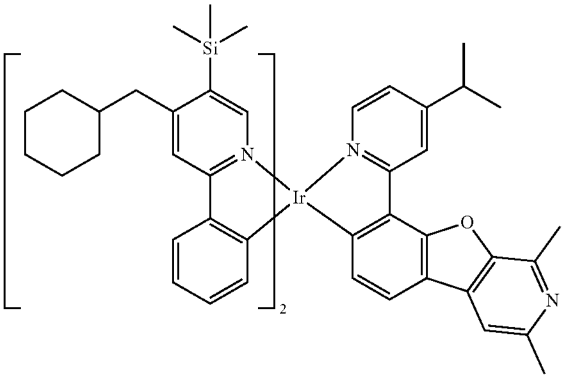

-continued
654
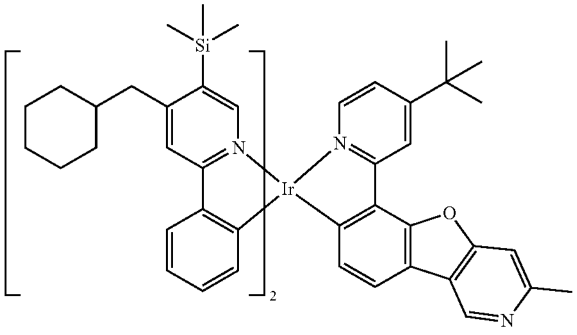
655
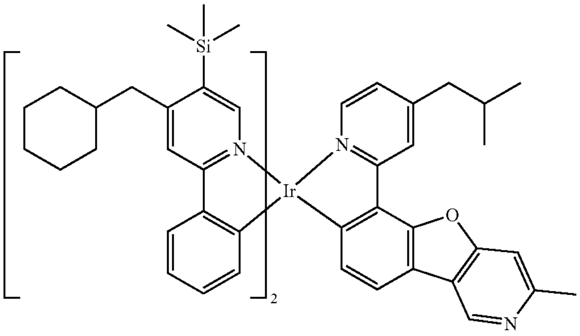
656
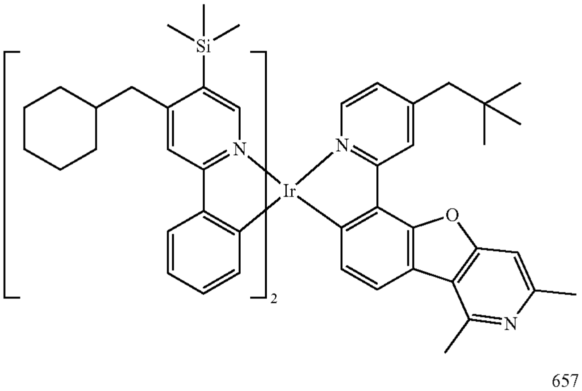
657
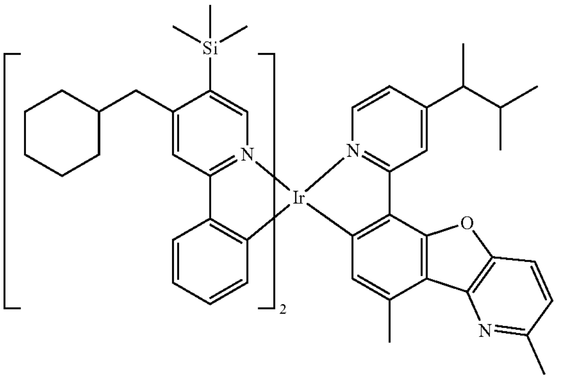
-continued
658
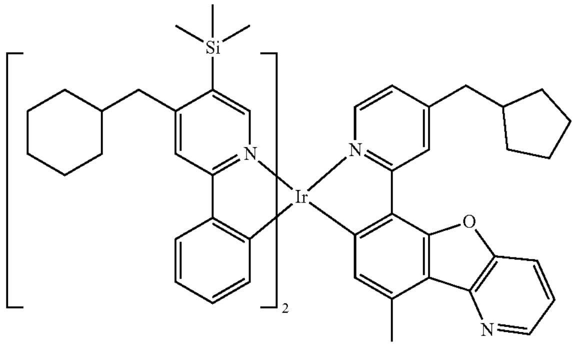
659
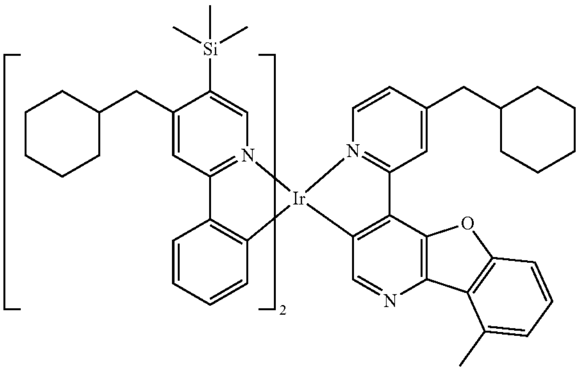
660
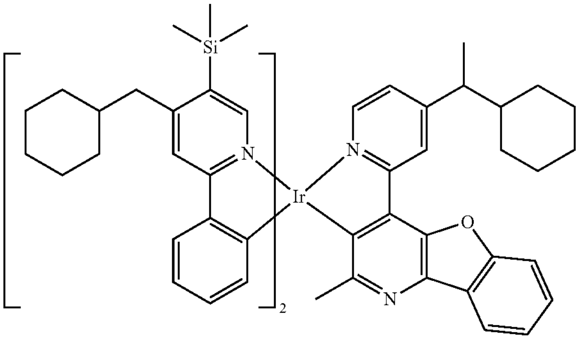
661
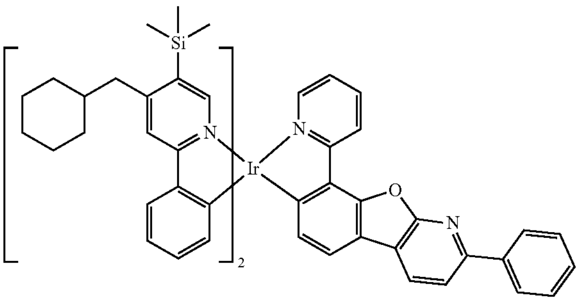

-continued
662
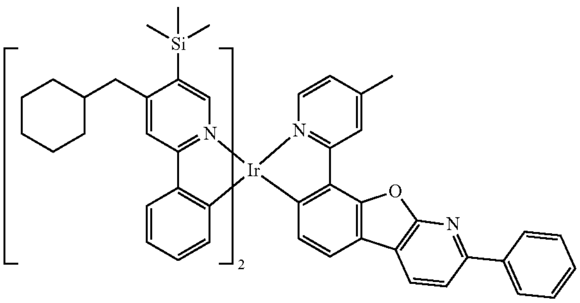
663
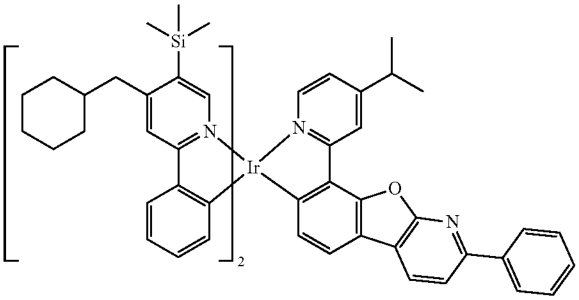
664
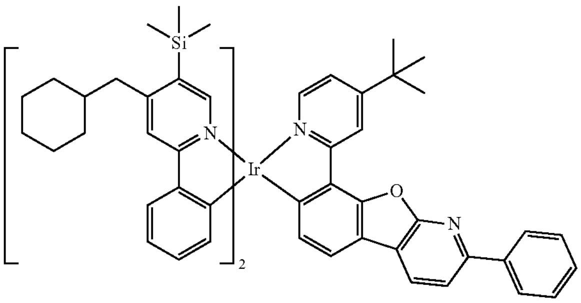
665
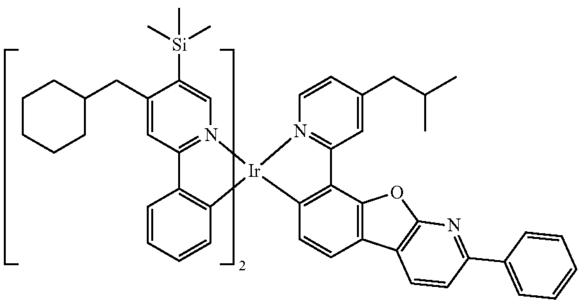
666
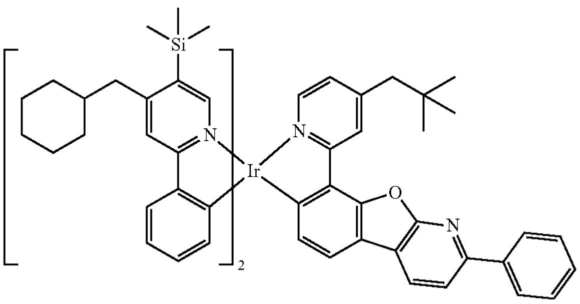
-continued
667
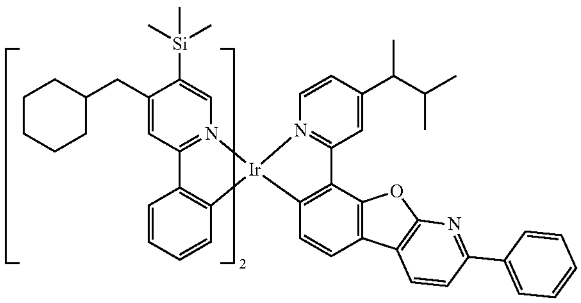
668
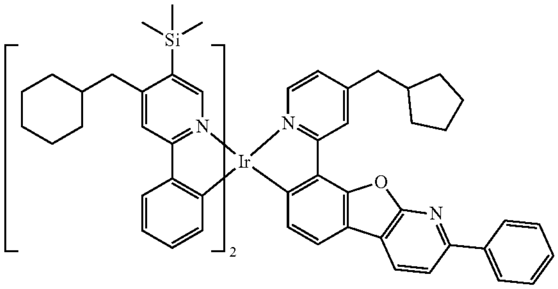
669
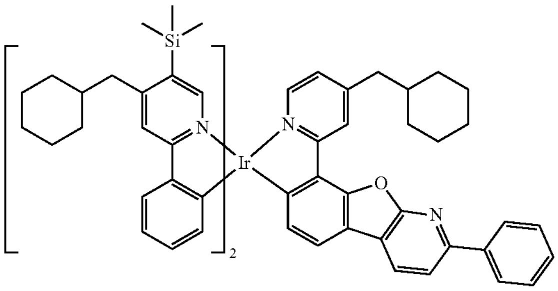
670
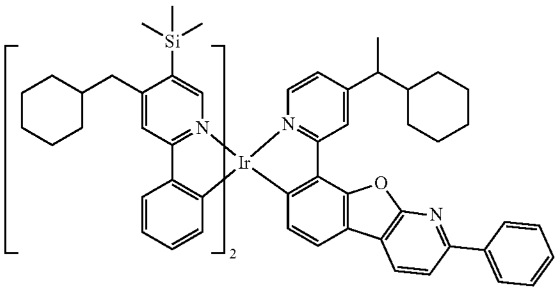
671
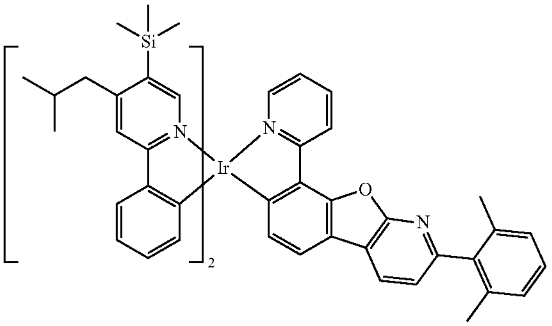

-continued
672
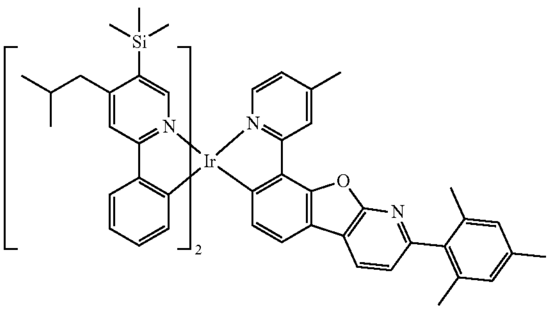
673
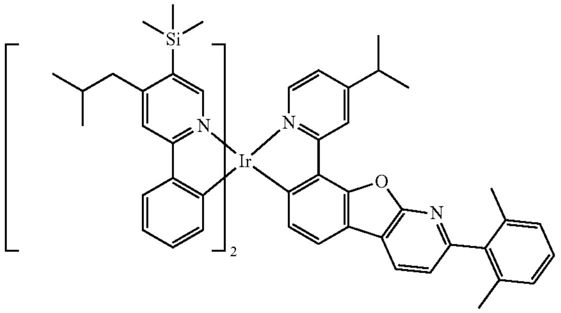
674
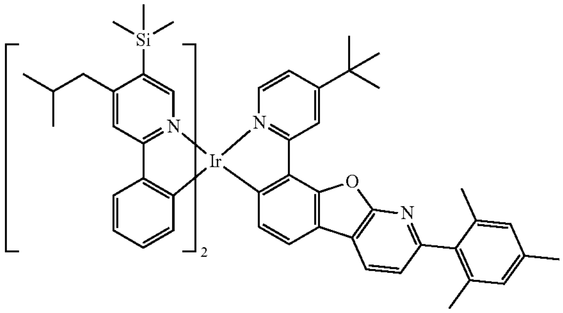
675
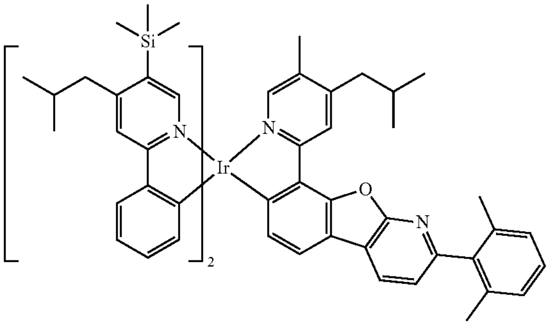
-continued
676
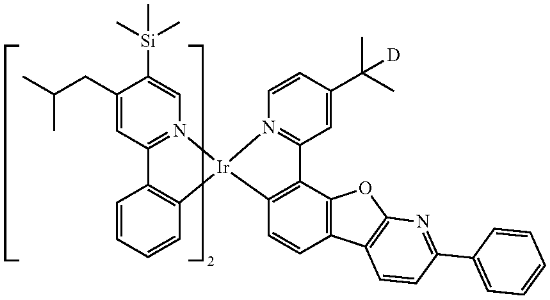
677
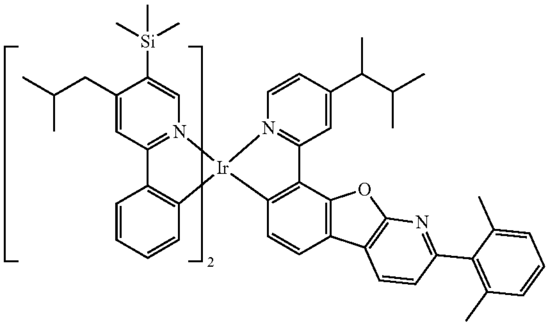
678
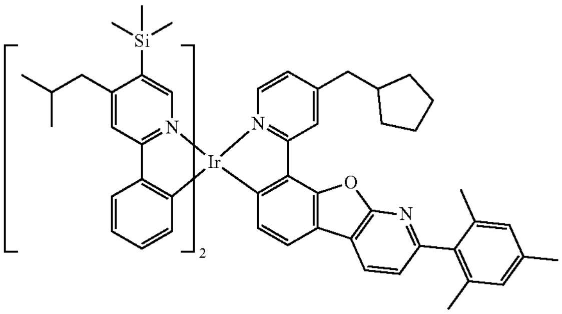
679
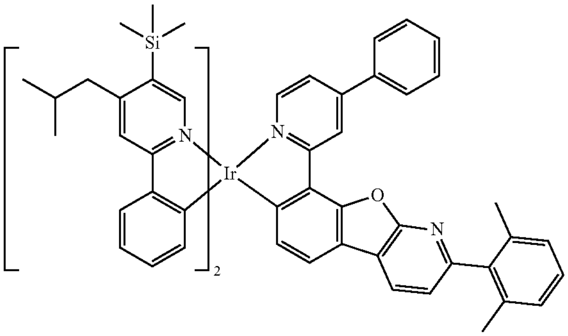

-continued
680
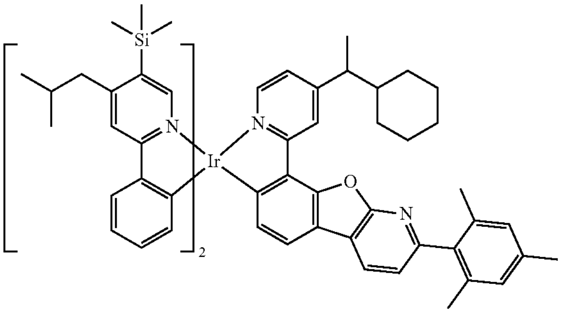
681
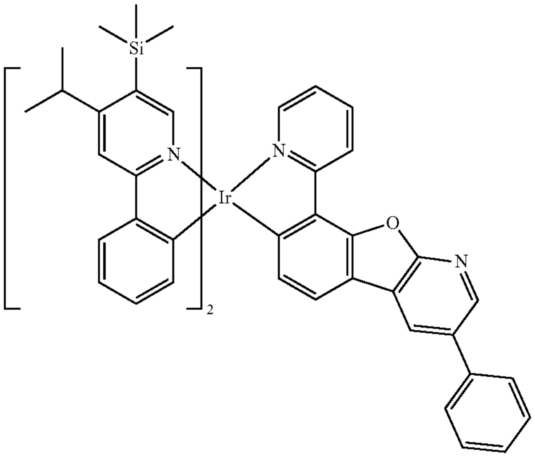
682
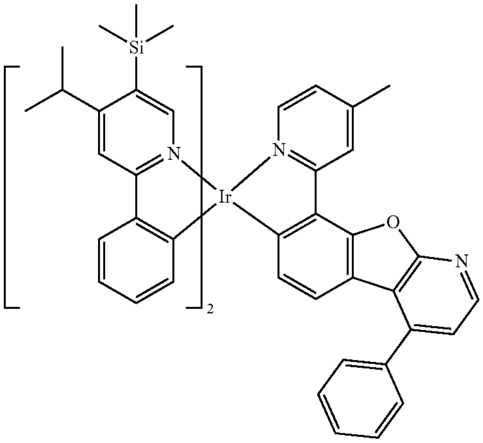
-continued
683
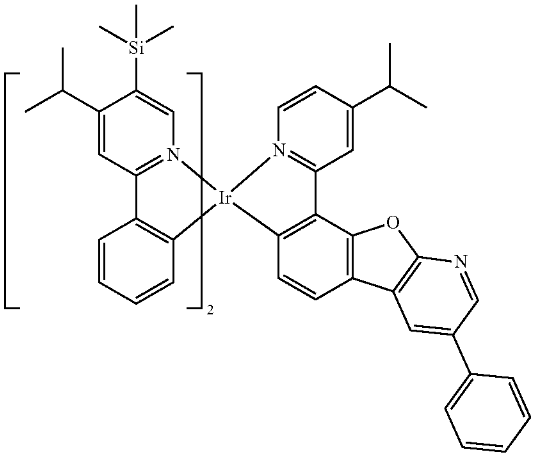
684
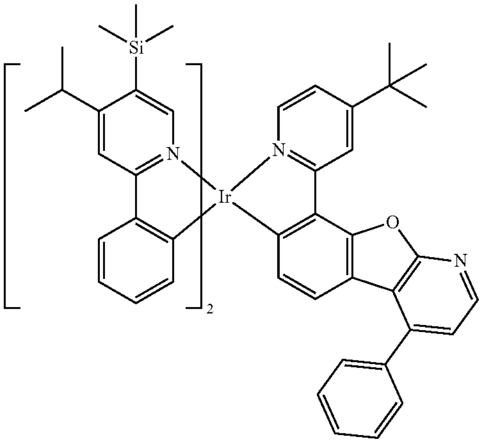
685
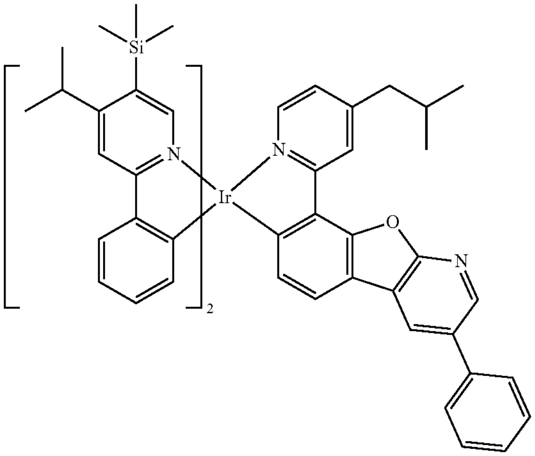

-continued
686
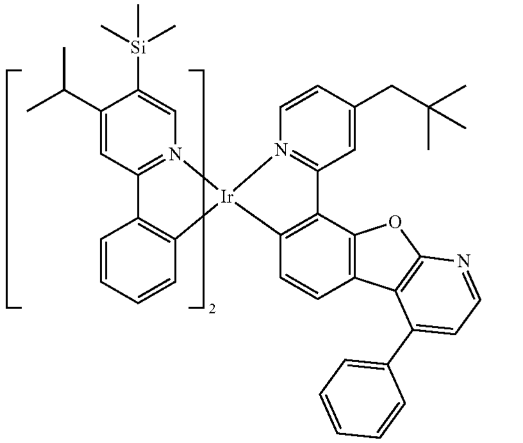
687
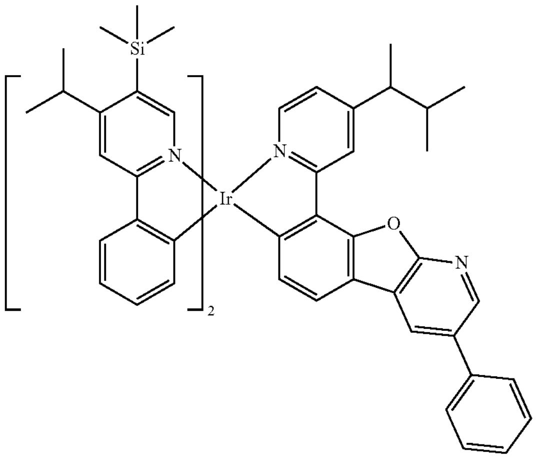
688
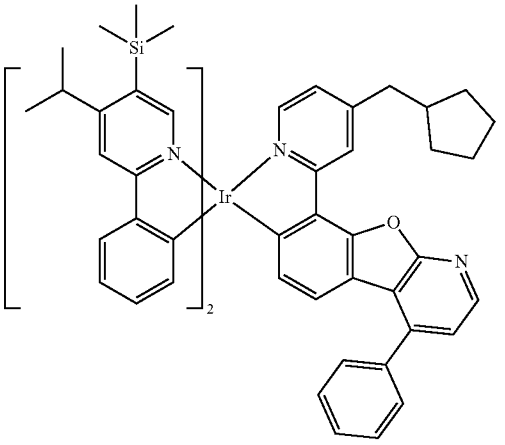
-continued
689
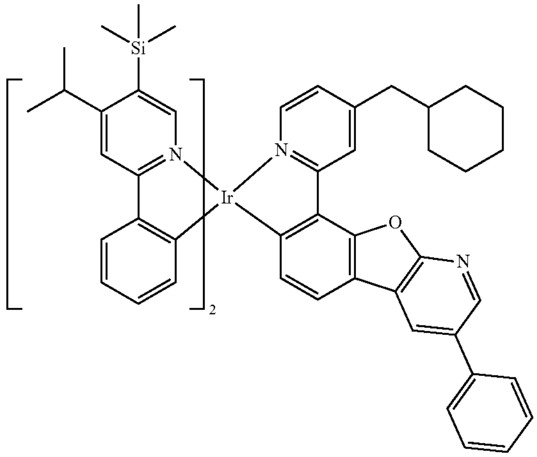
690
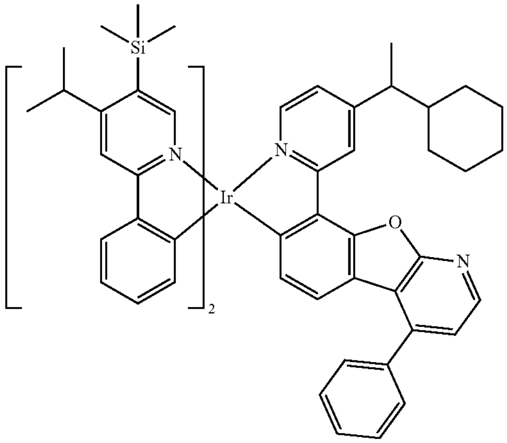
691
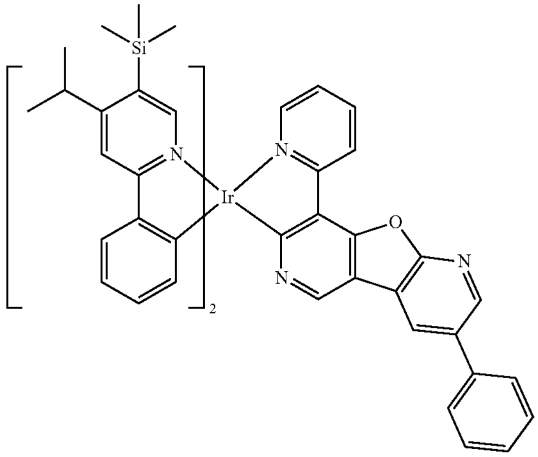

-continued
692
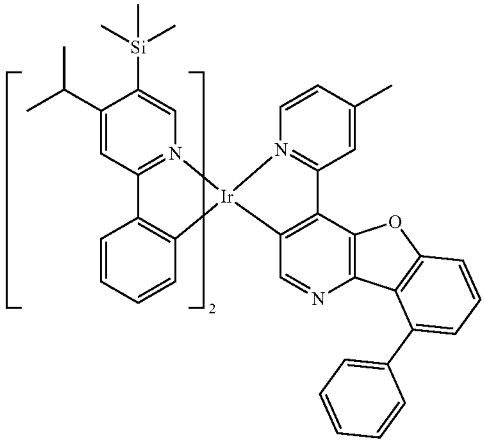
693
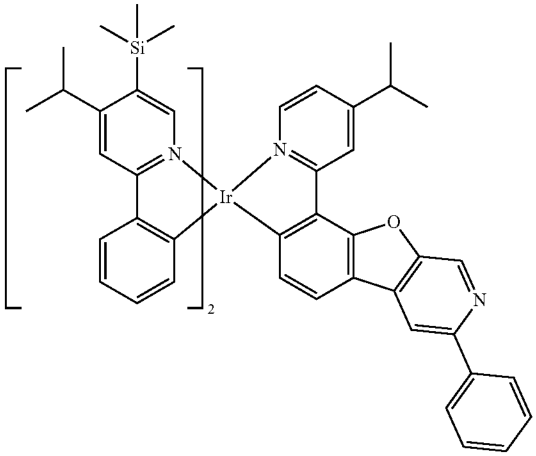
694
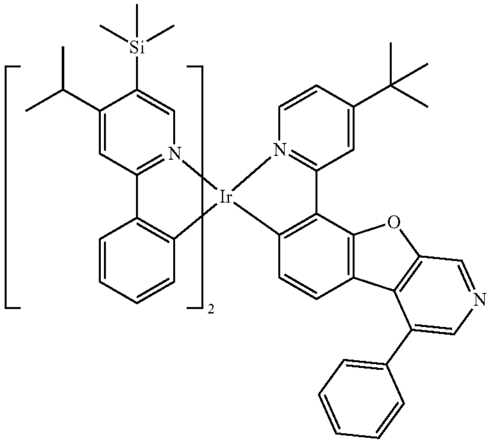
-continued
695
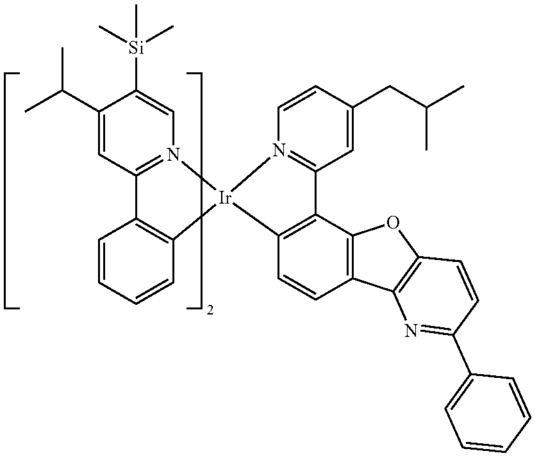
696
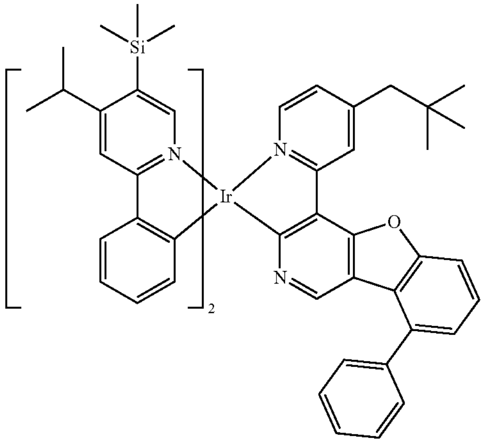
697
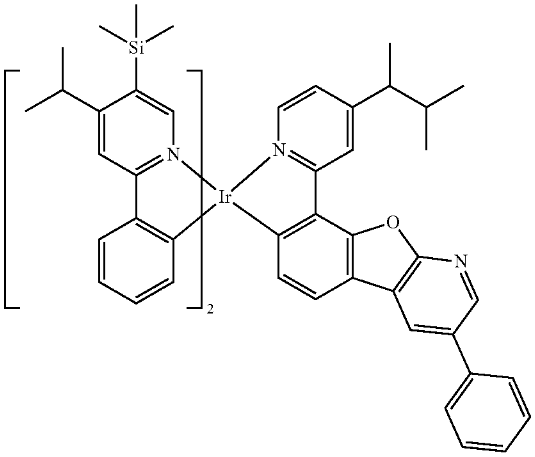

-continued
698
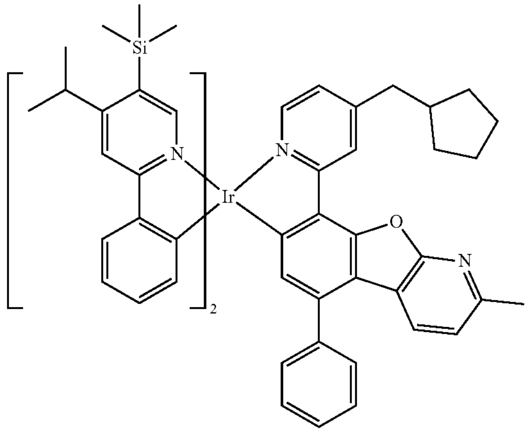
699
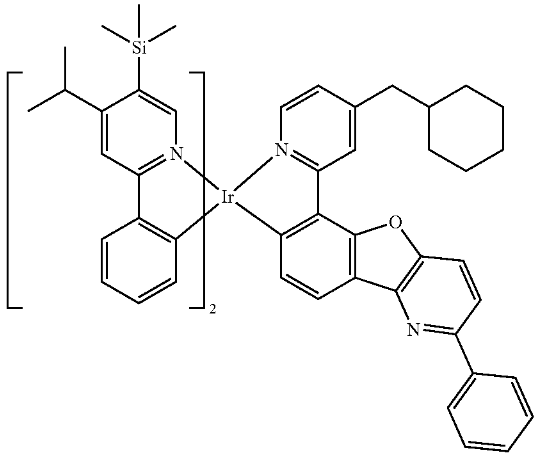
700
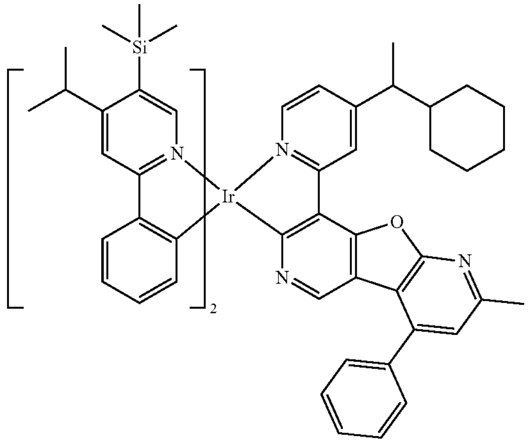
-continued
701
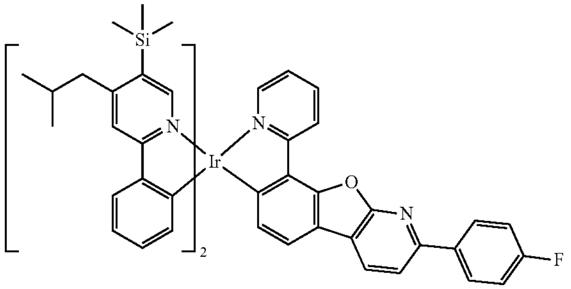
702
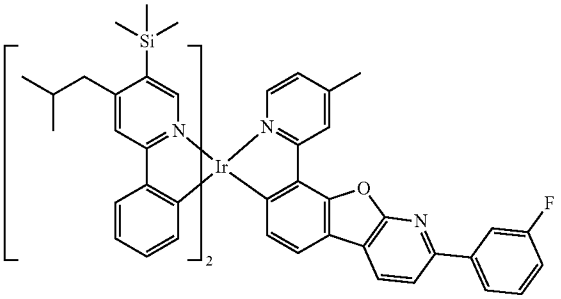
703
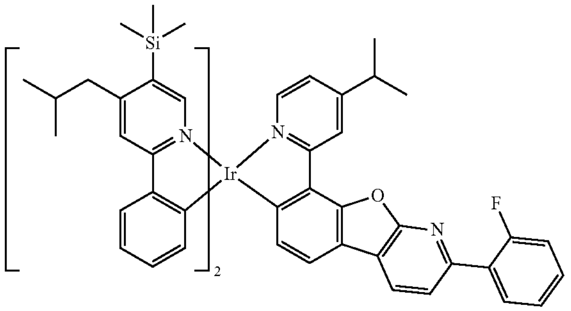
704
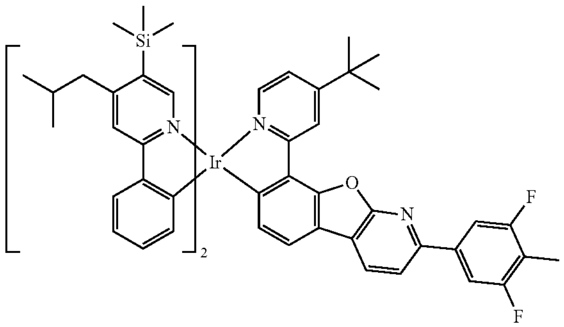

-continued
705
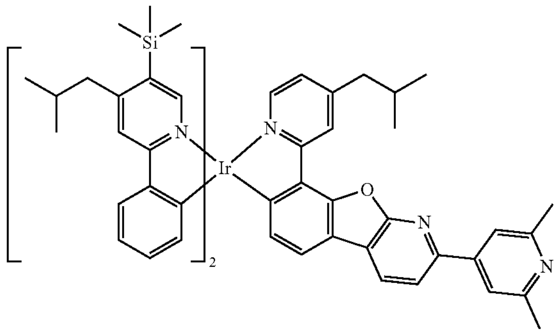
706
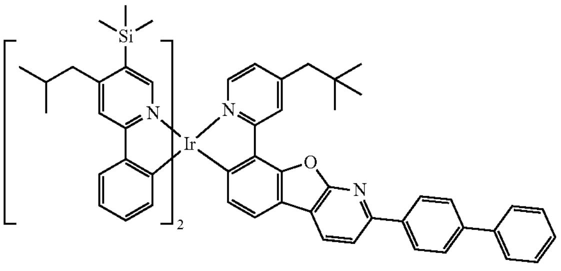
707
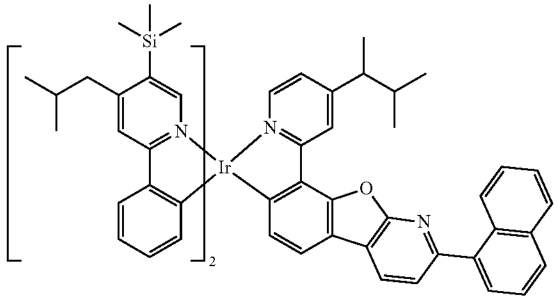
708
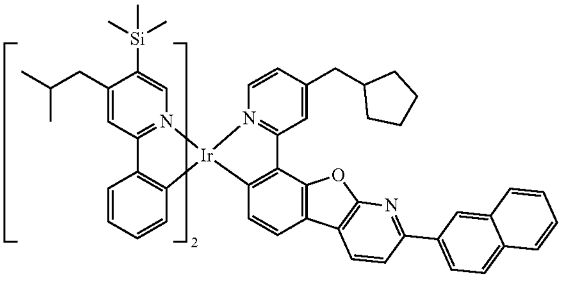
709
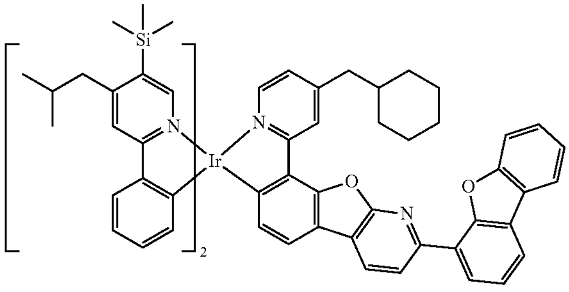
-continued
710
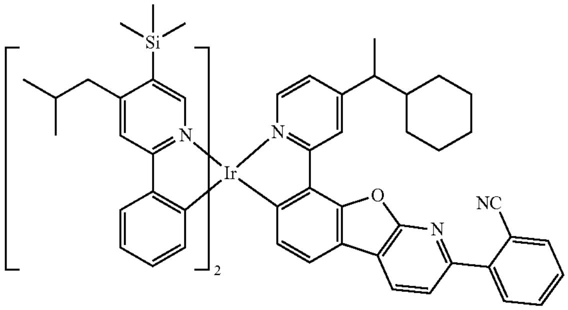
711
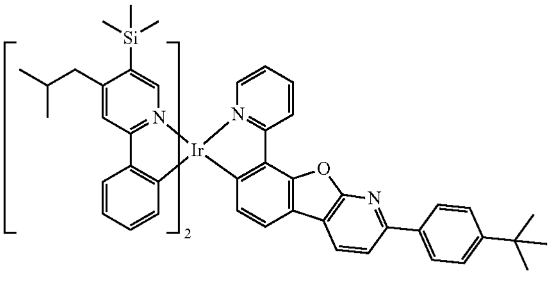
712
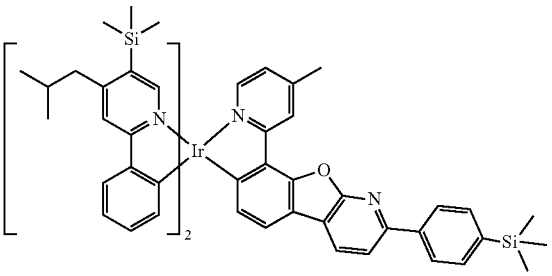
713
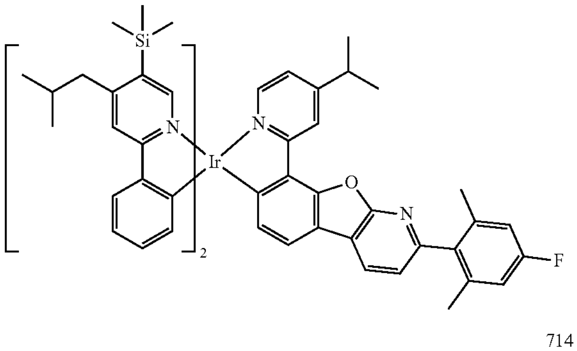
714
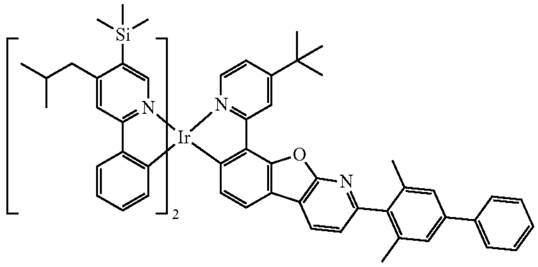

-continued
715
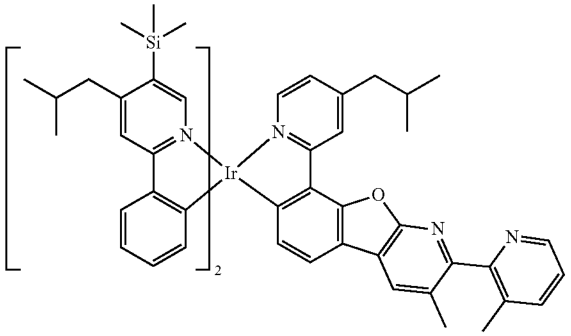
716
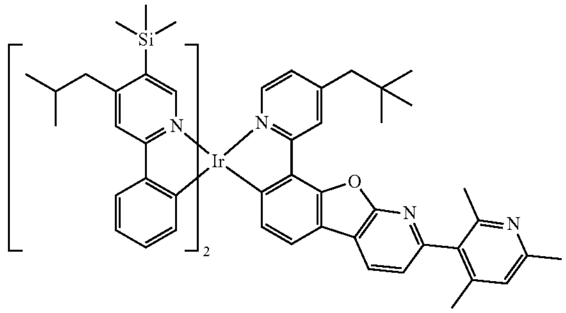
717
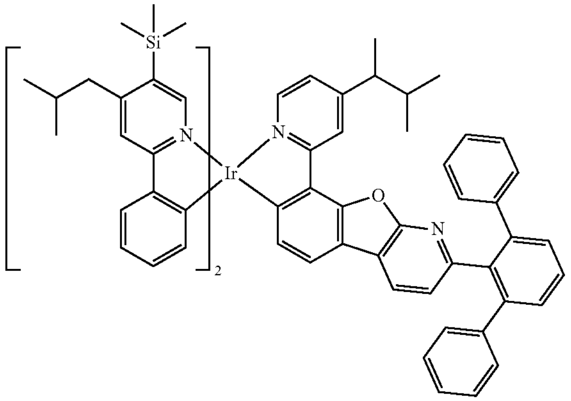
718
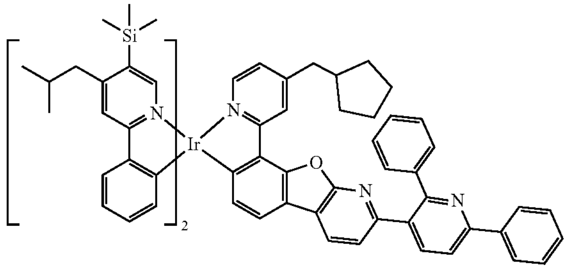
-continued
719
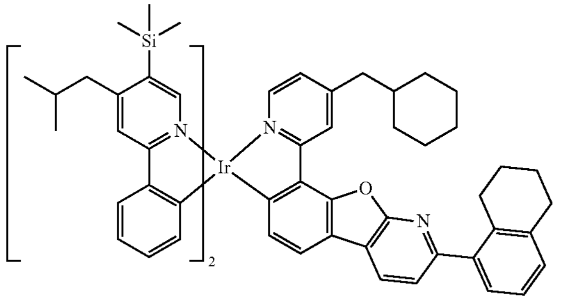
720
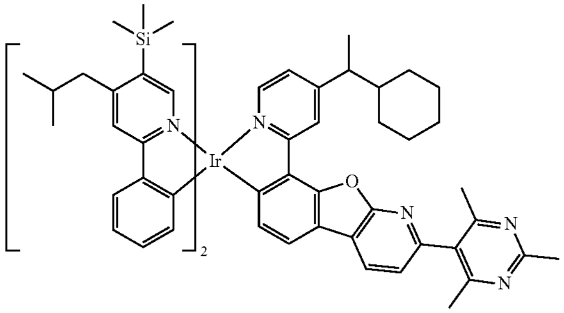
721
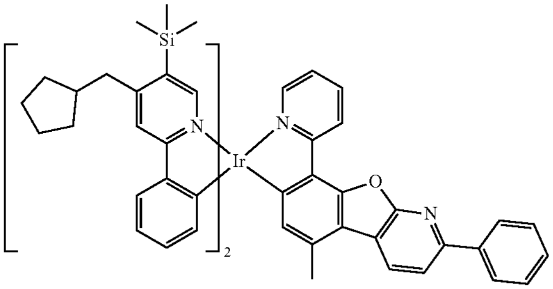
722
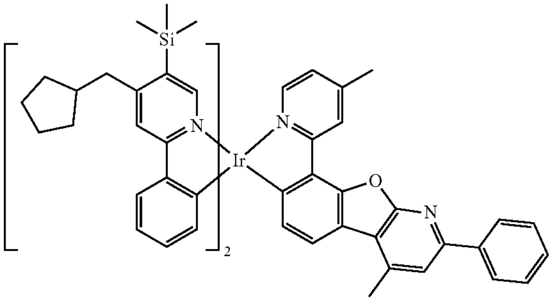
723
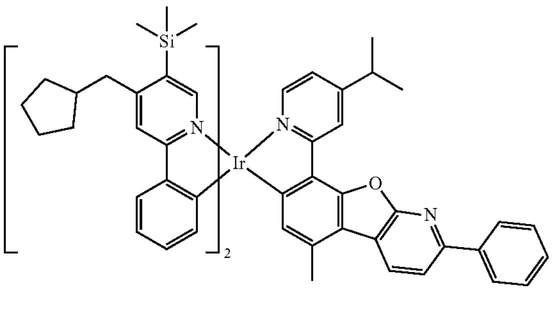

-continued
724
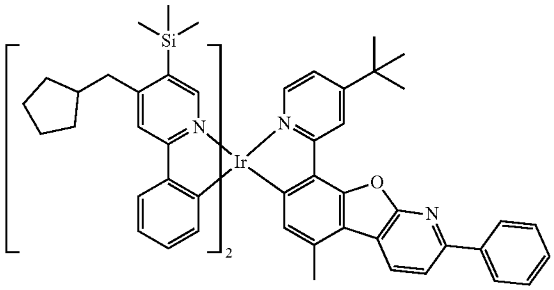
725
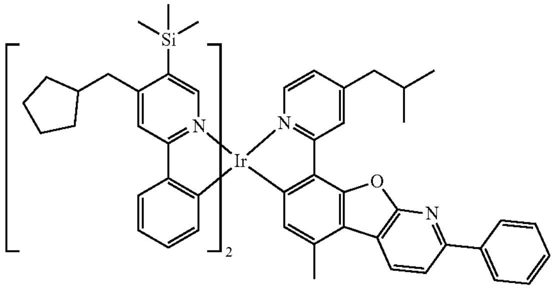
726
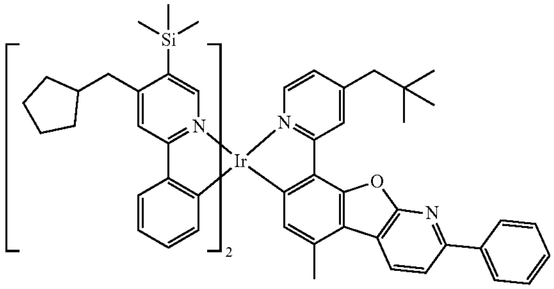
727
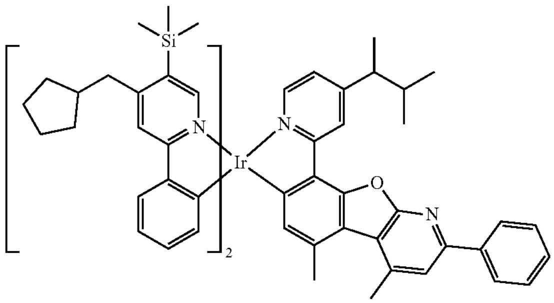
728
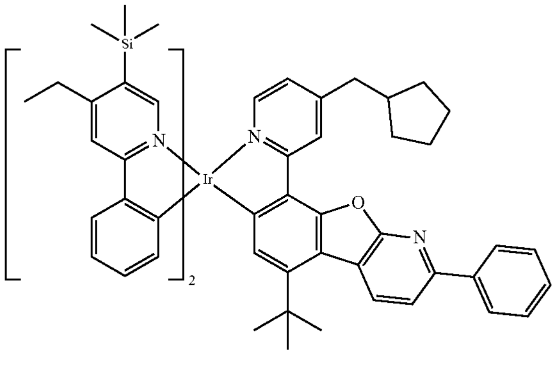
-continued
729
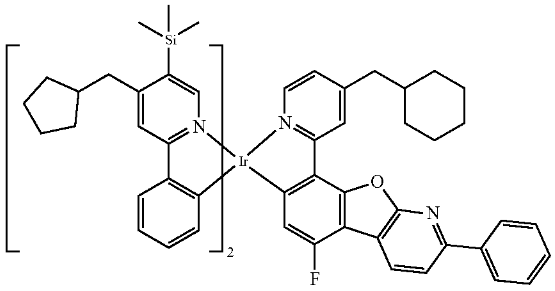
730
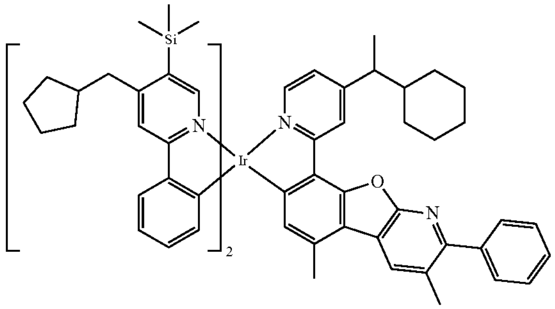
731
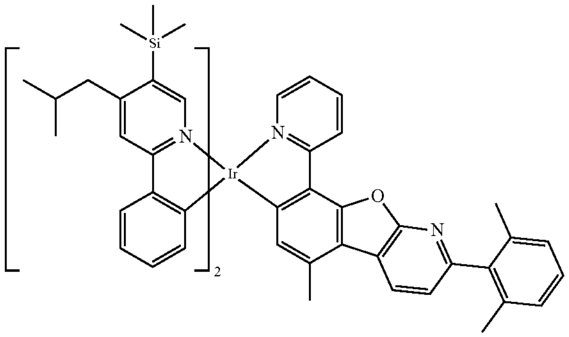
732
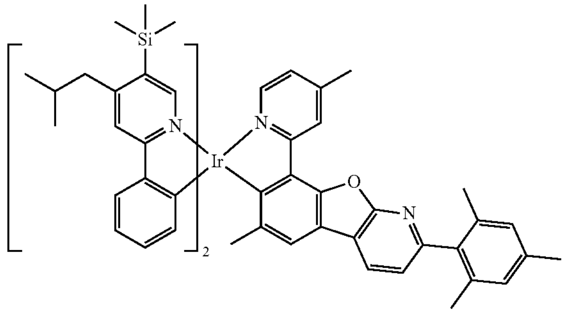

733
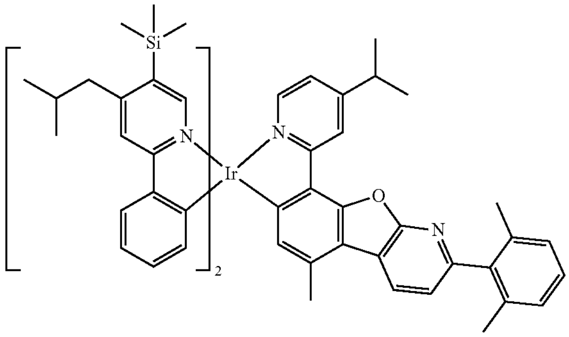
734
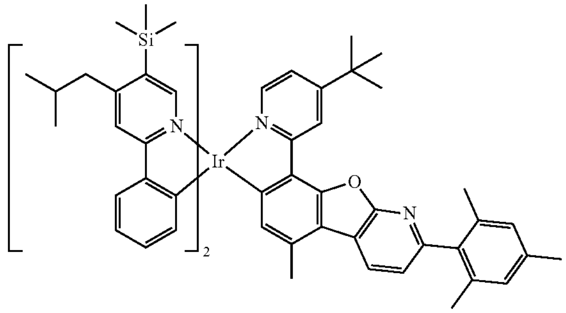
735
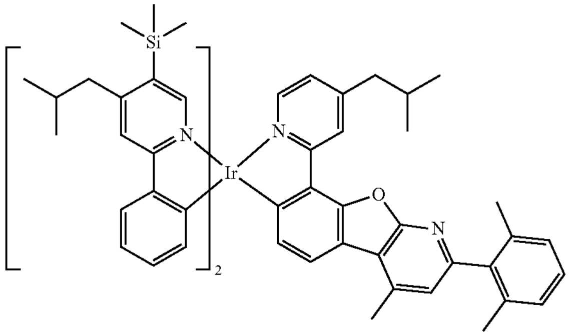
736
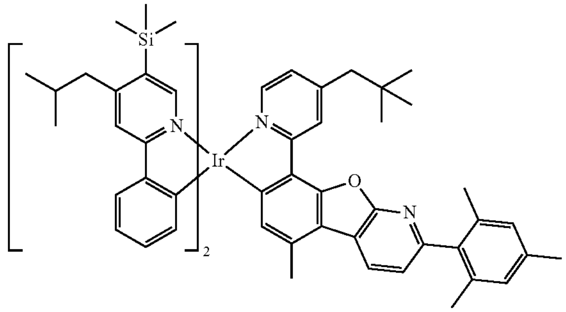
737
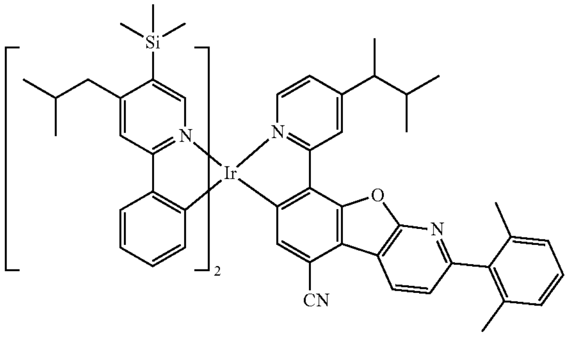
738
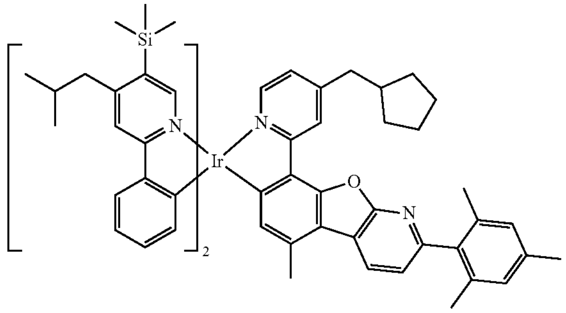
739
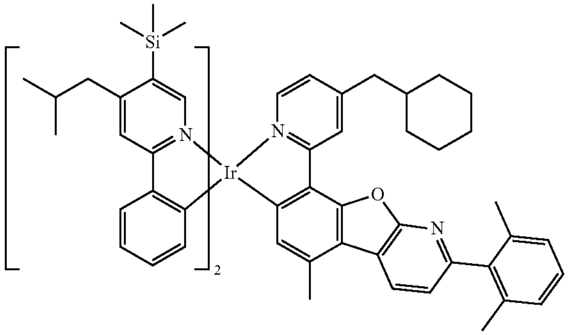
740
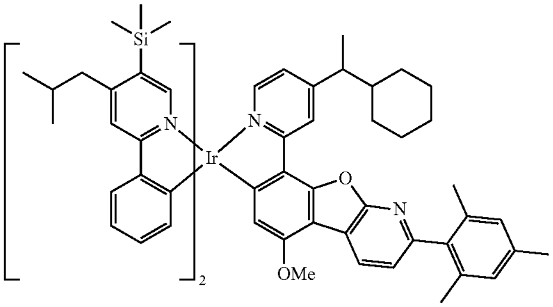

-continued
741
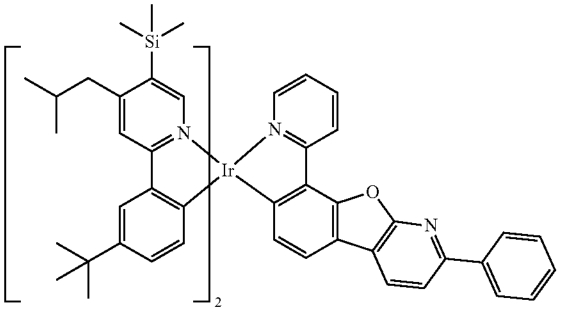
742
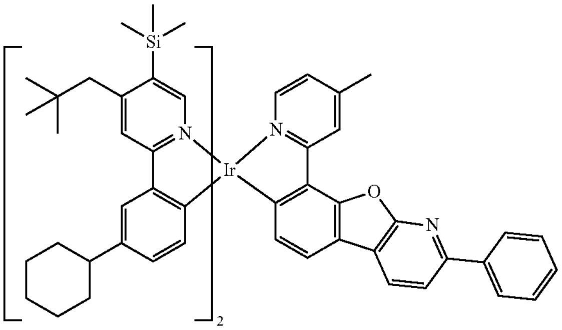
743
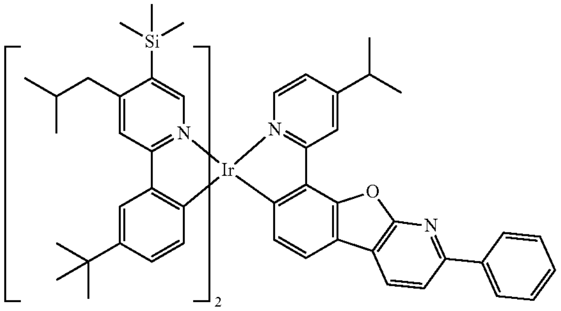
744
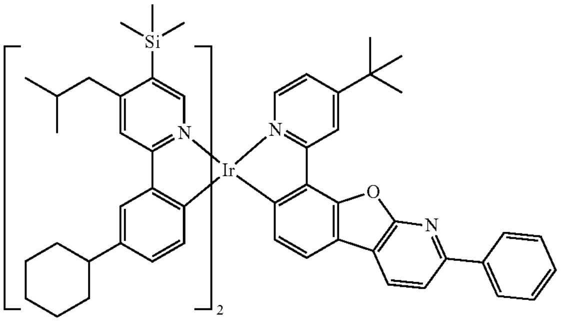
-continued
745
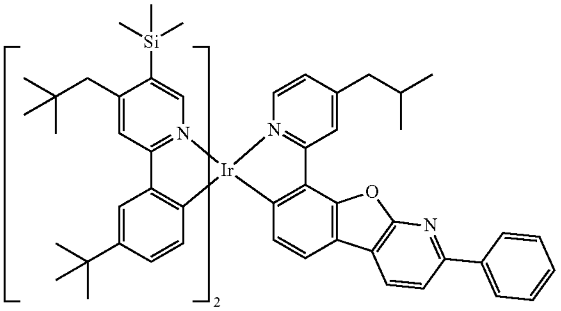
746
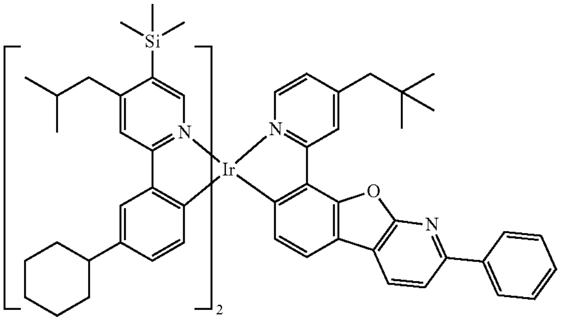
747
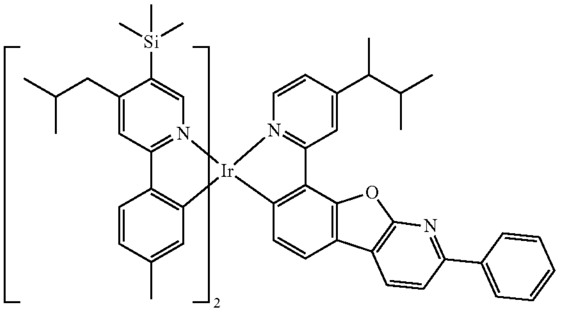
748
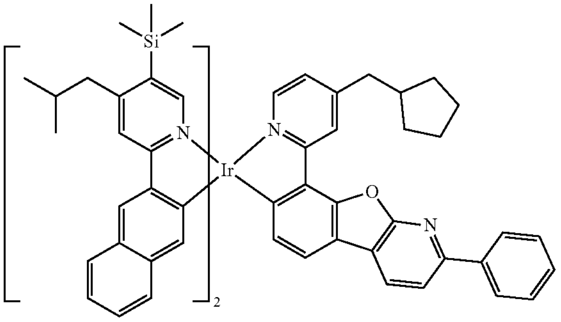

-continued
749
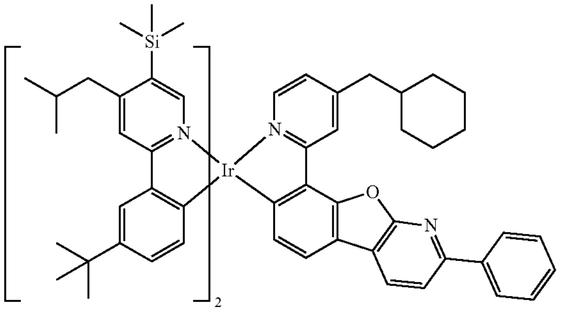
750
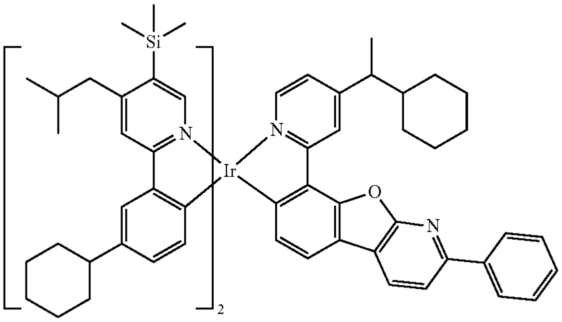
751
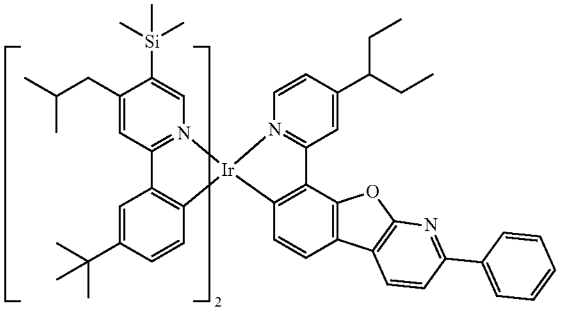
752
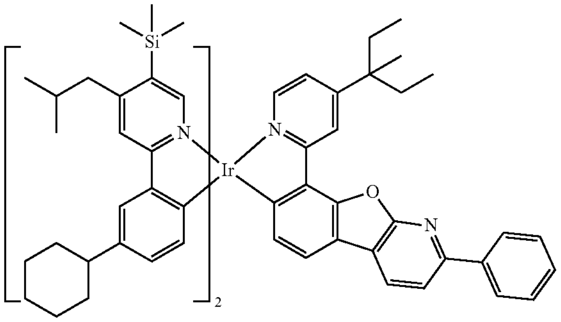
-continued
753
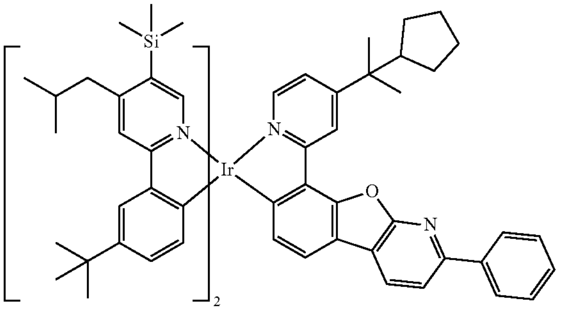
754
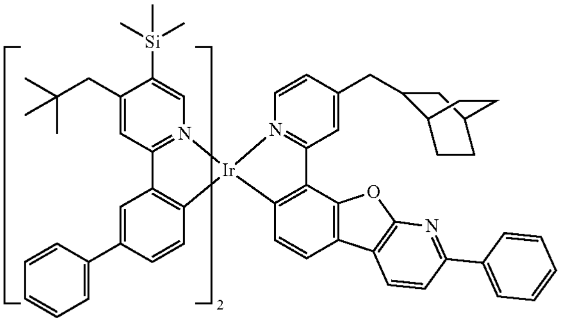
755
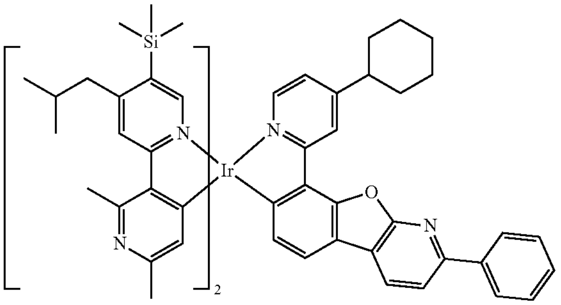
756
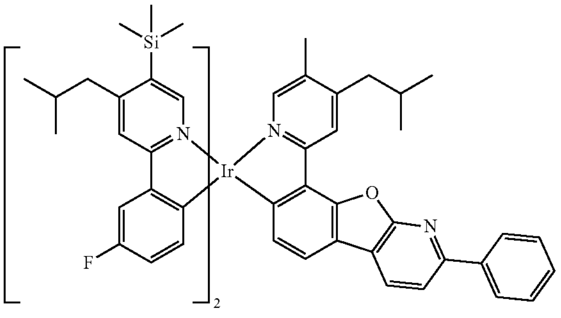

-continued
757
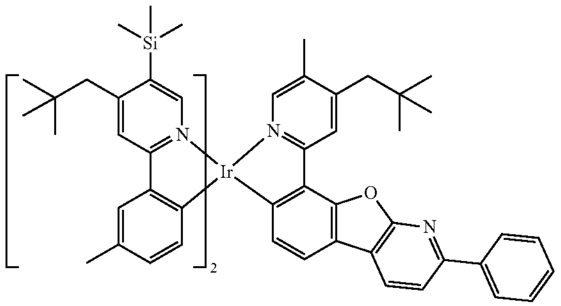
758
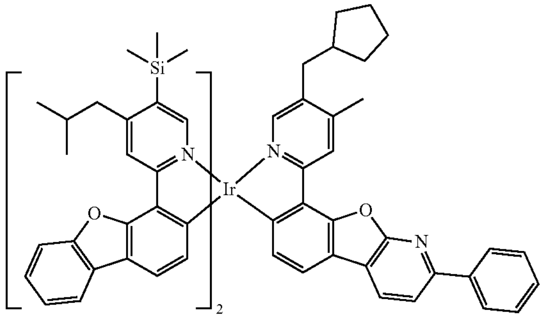
759
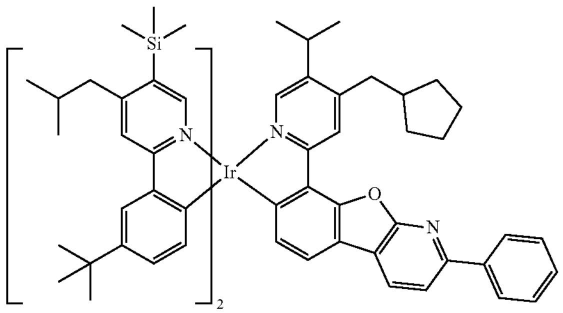
760
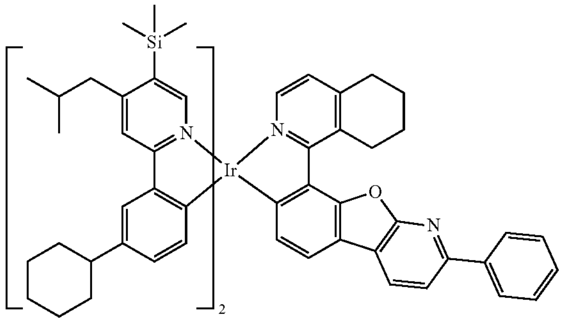
-continued
761
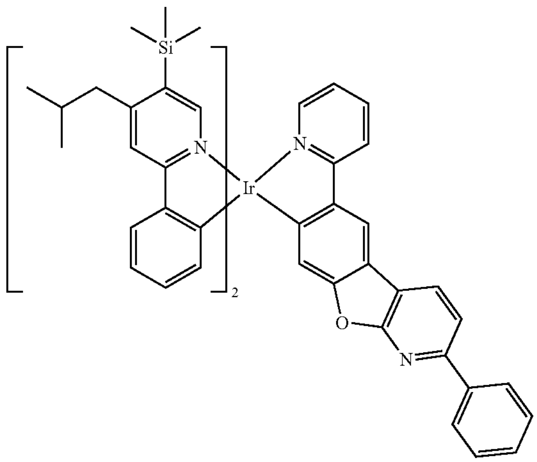
762
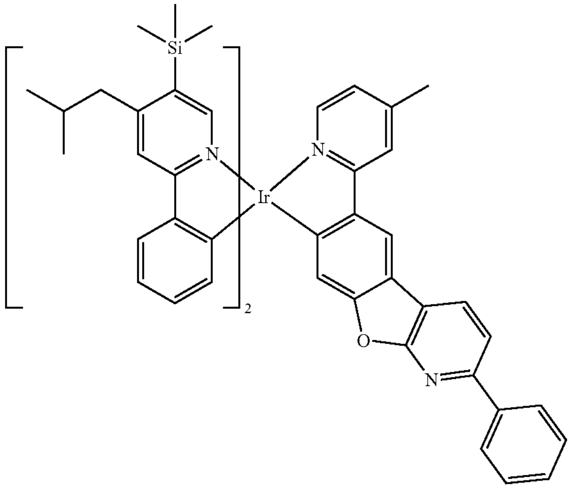
763
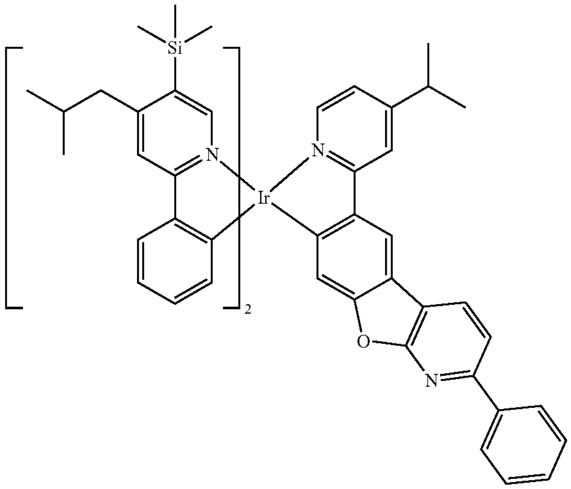

-continued
764
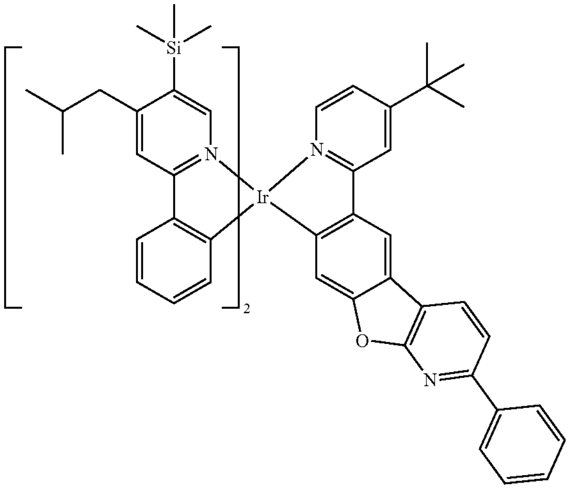
765
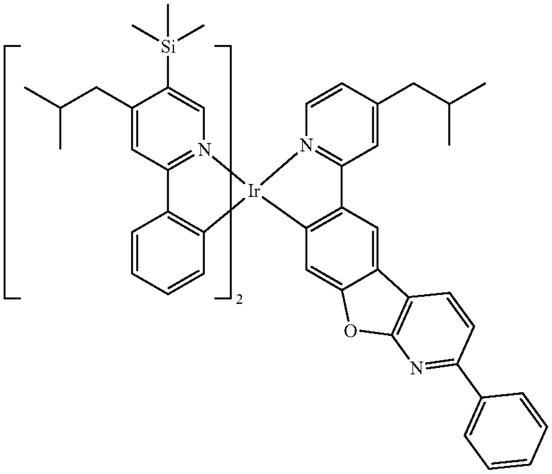
766
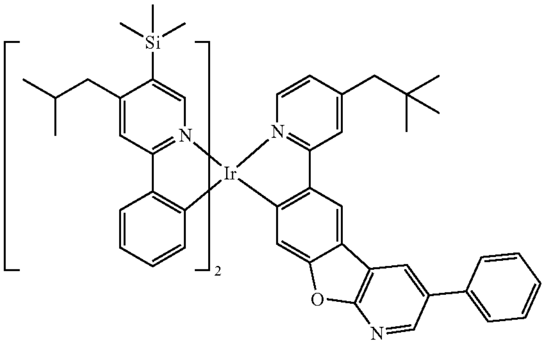
-continued
767
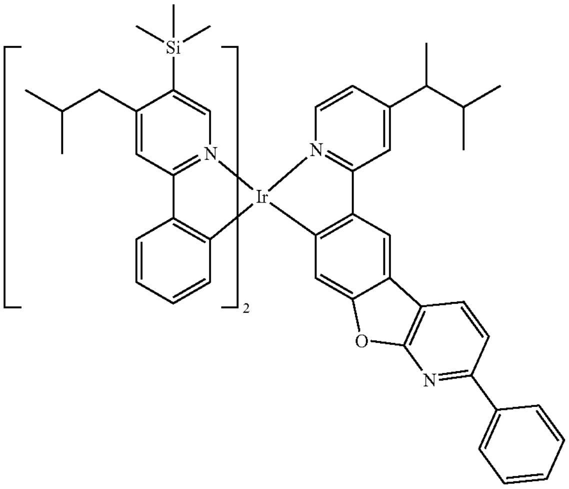
768
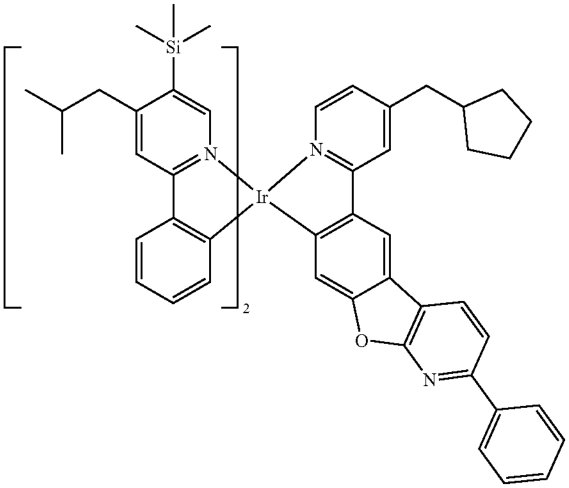
769
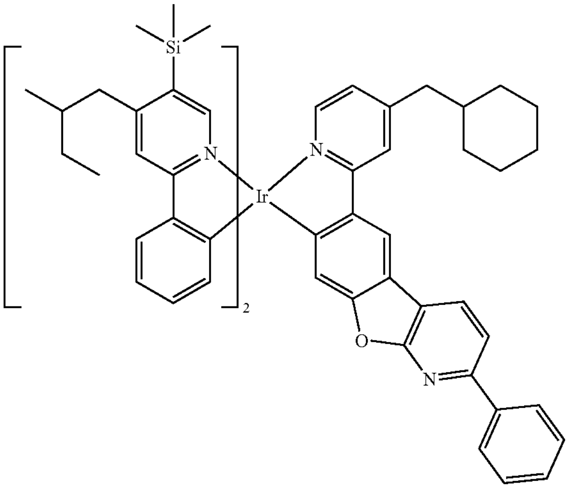

-continued
770
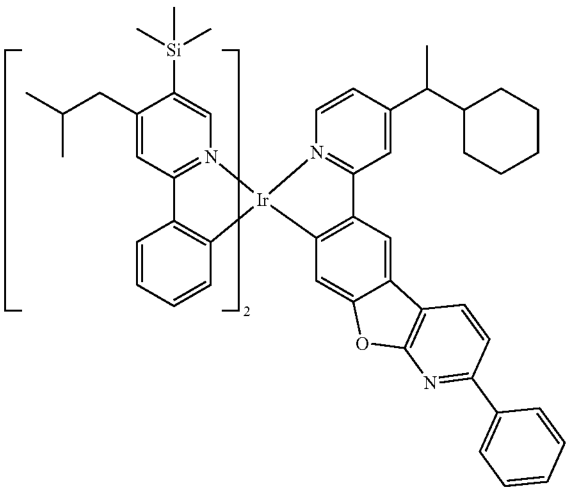
771
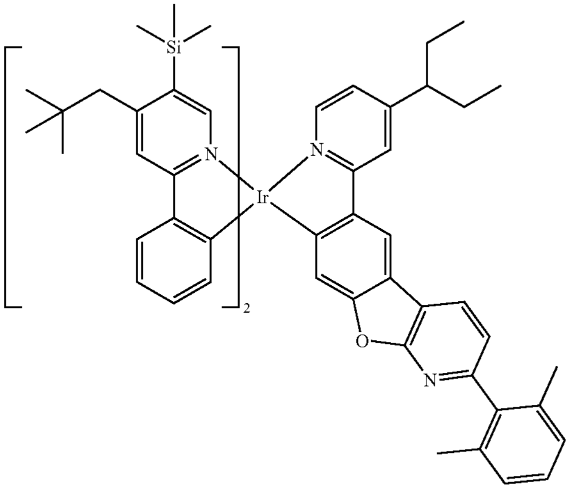
772
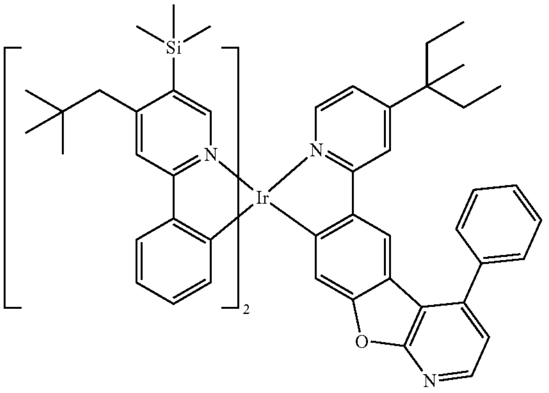
-continued
773
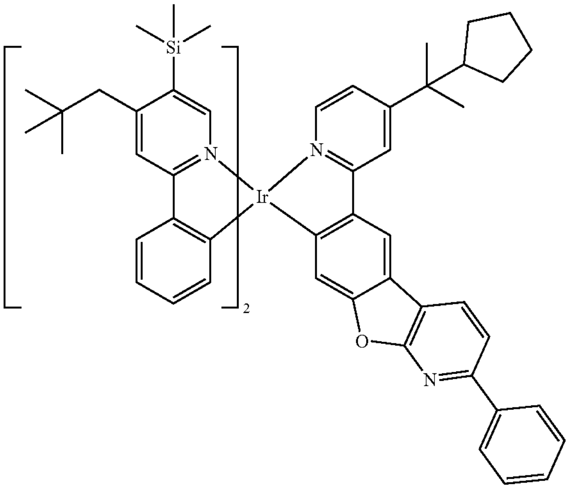
774
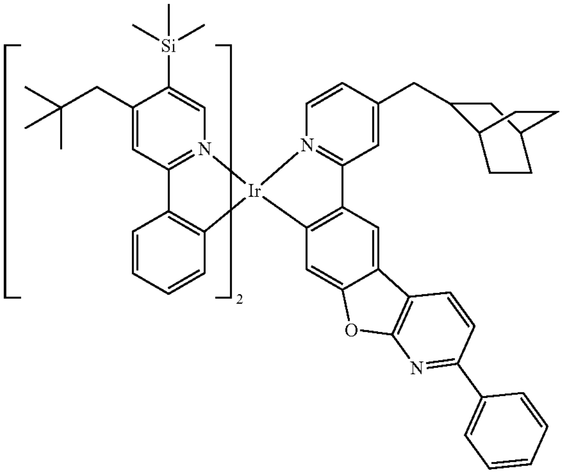
775
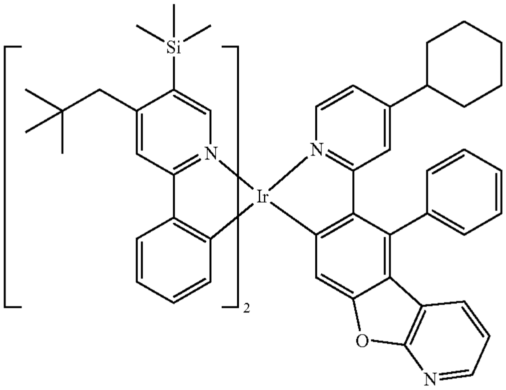

-continued
776
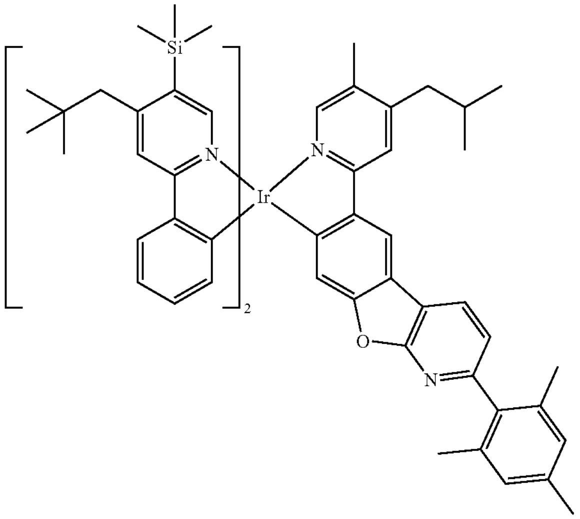
777
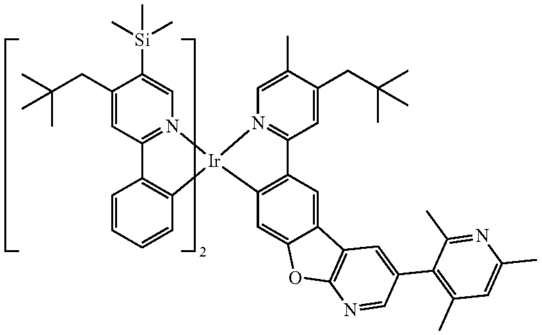
778
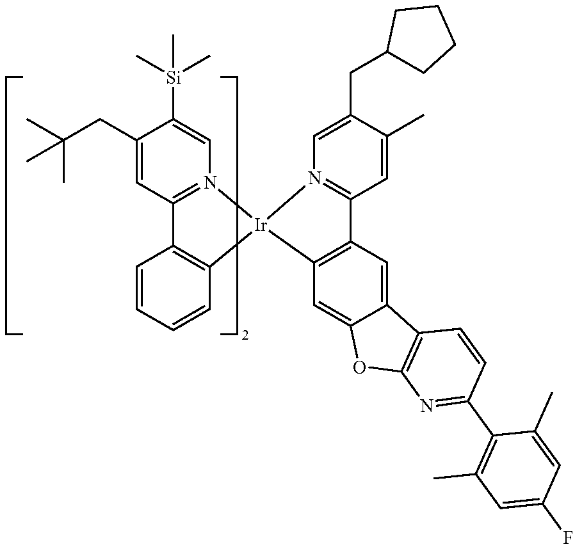
-continued
779
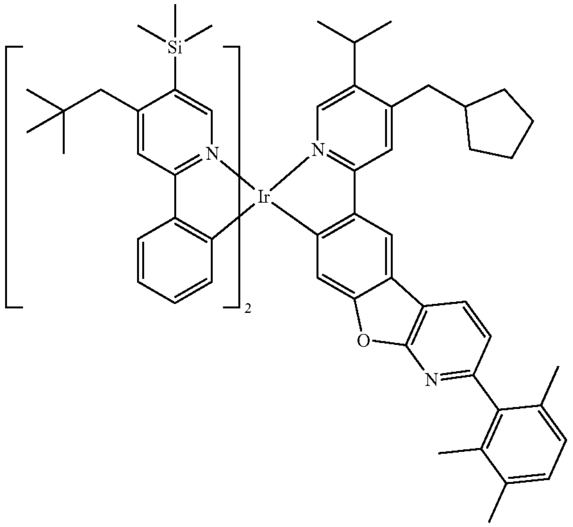
780
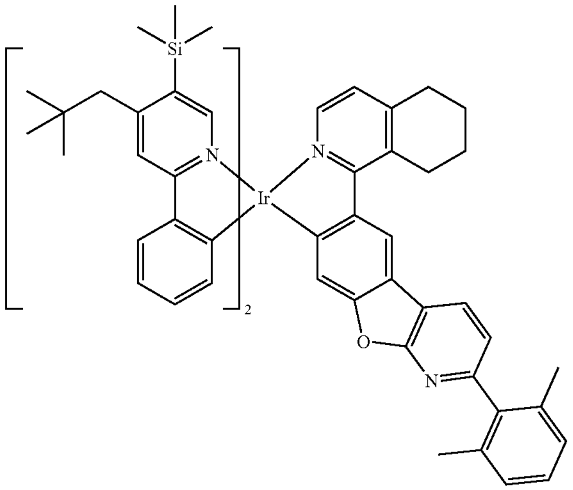
781
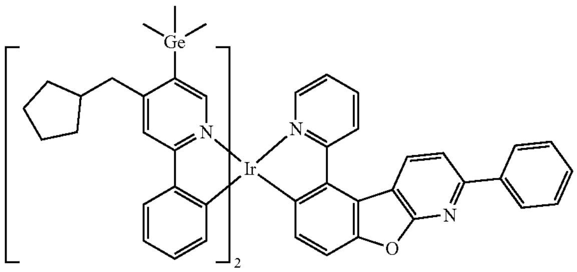

-continued
782
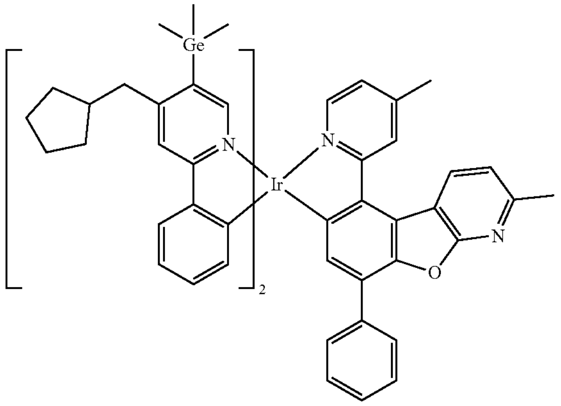
783
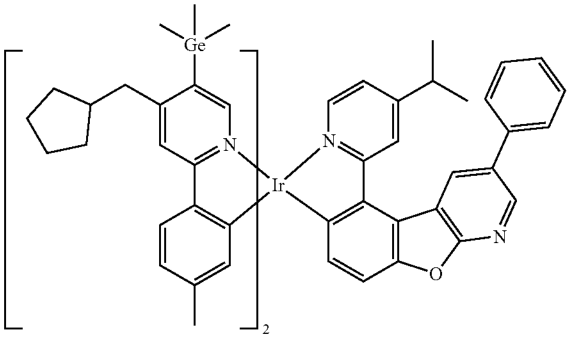
784
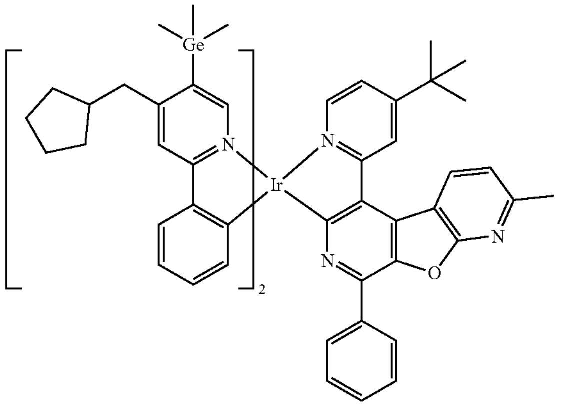
785
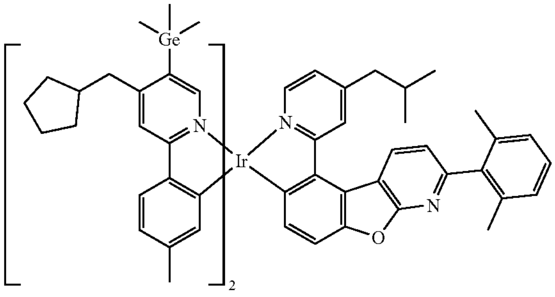
-continued
786
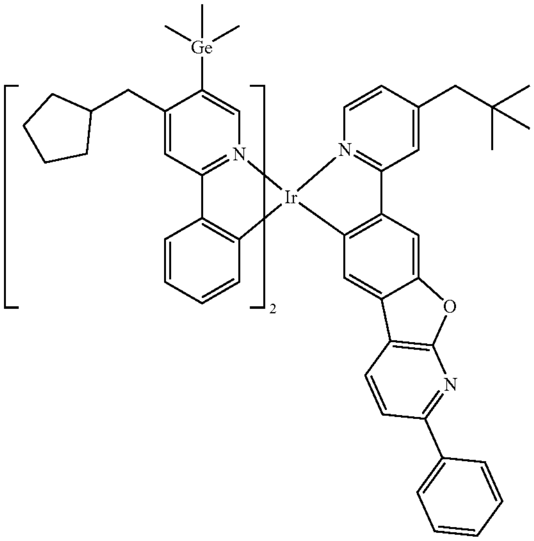
787
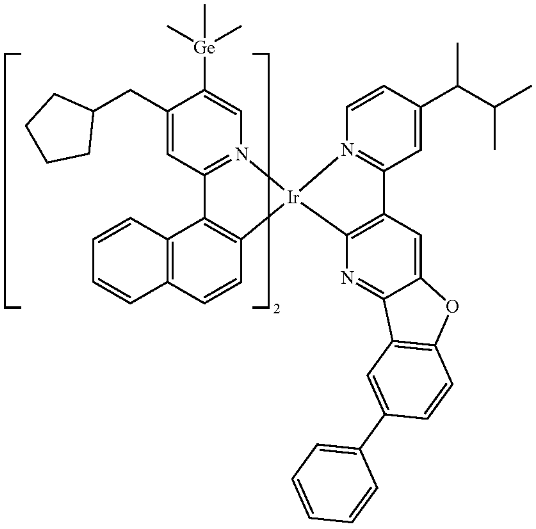
788
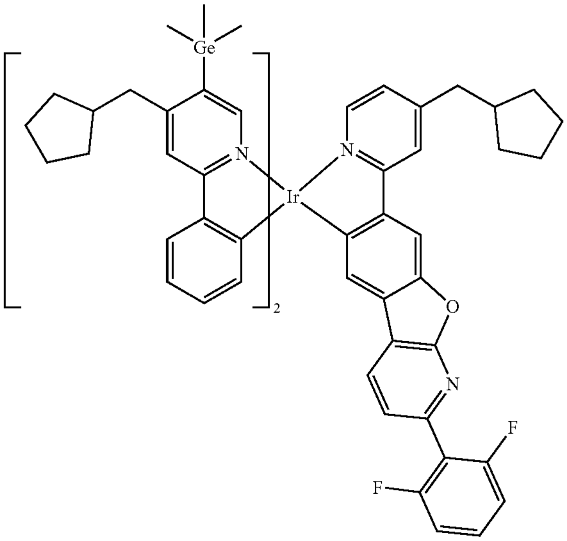

-continued
789
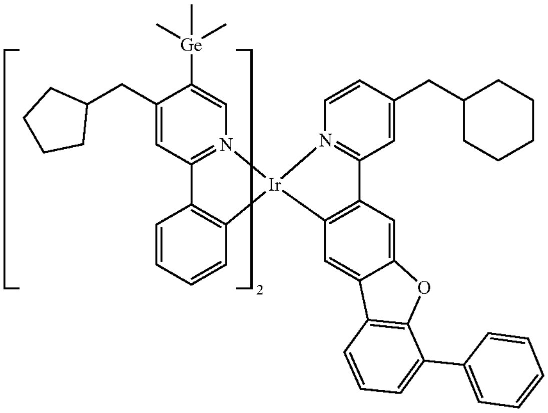
790
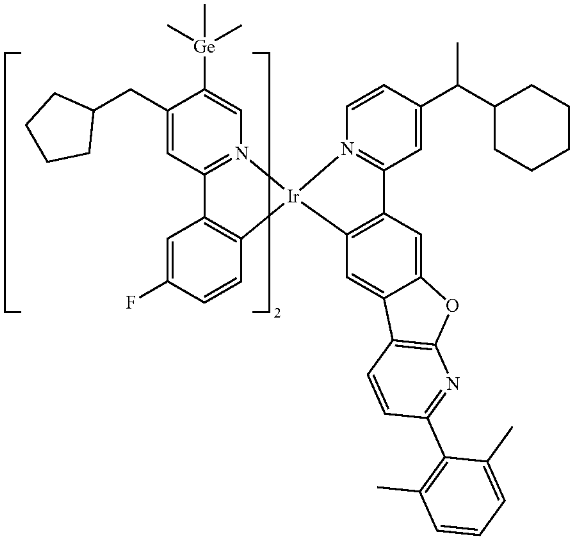
791
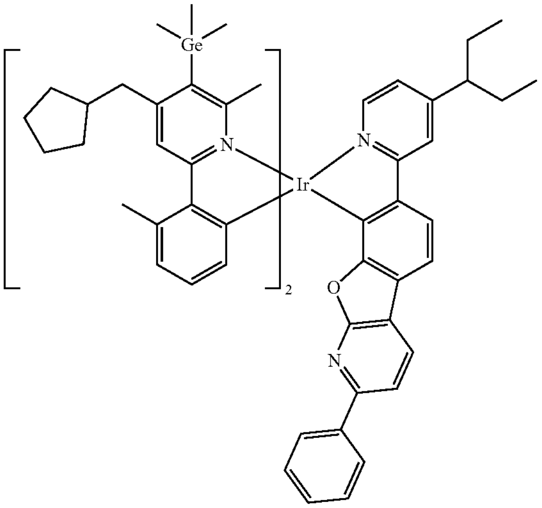
-continued
792
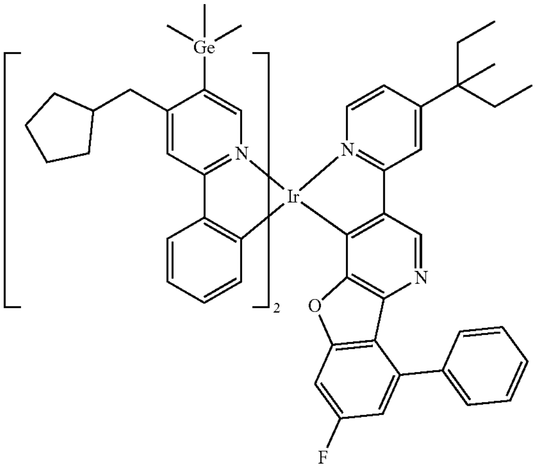
793
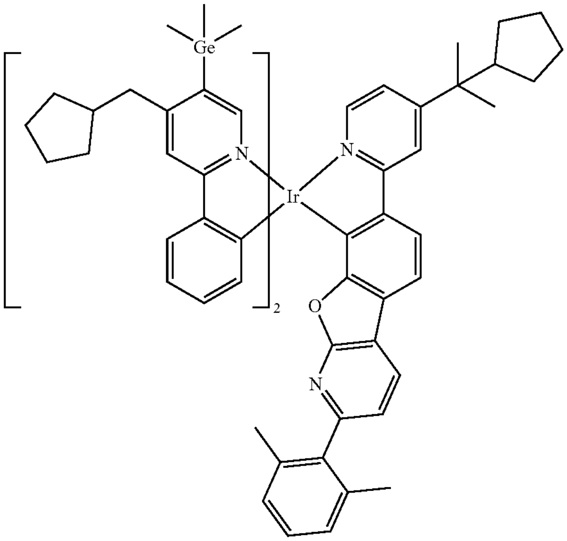
794
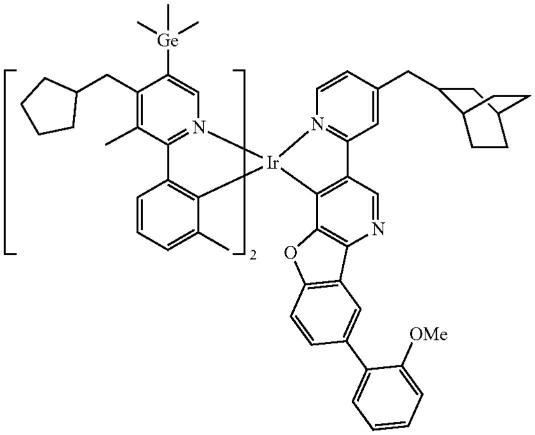

-continued
795
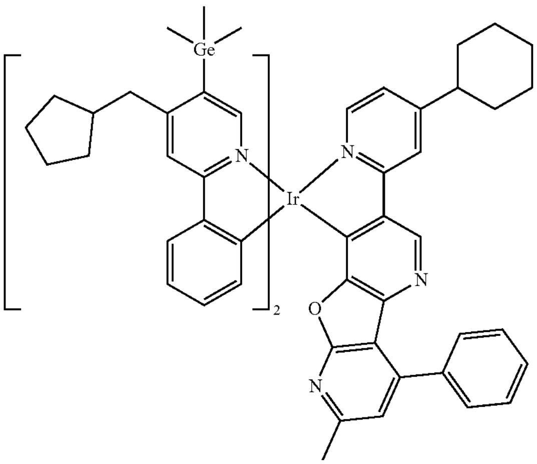
796
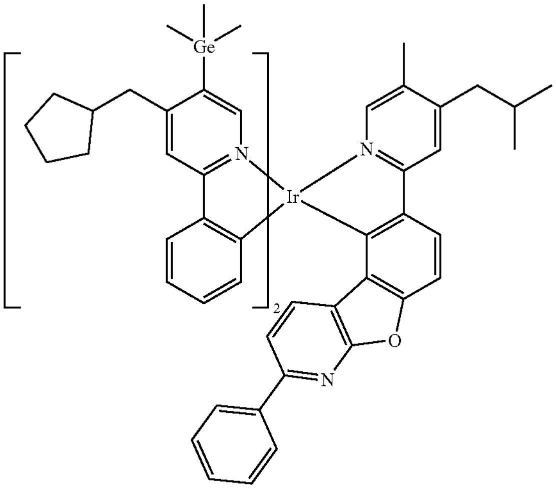
797
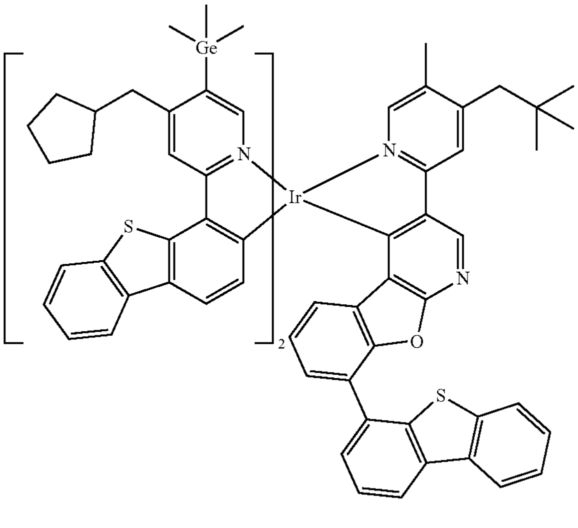
-continued
798
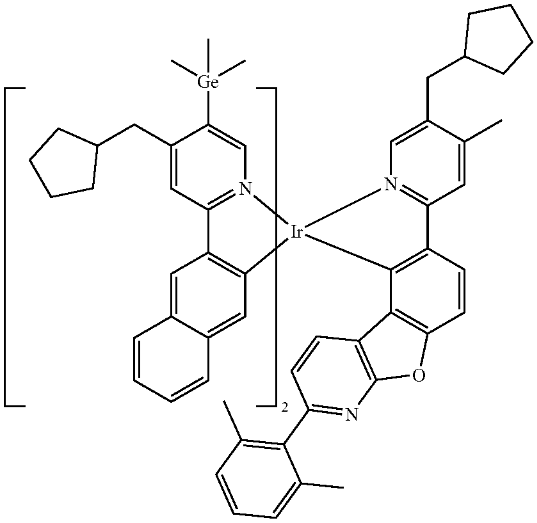
799
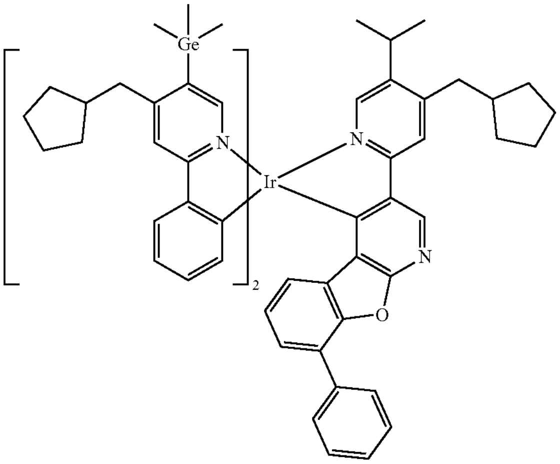
800
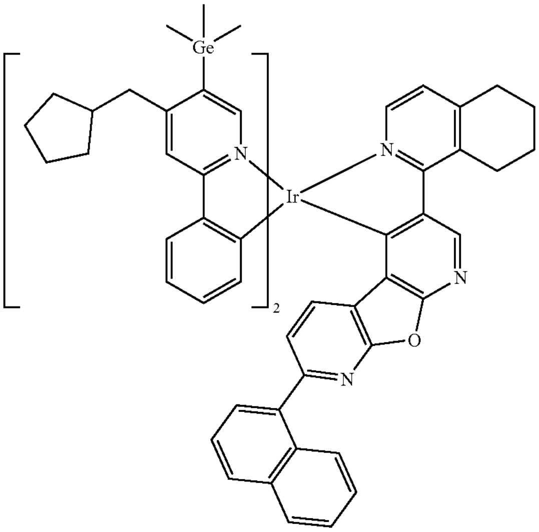

-continued
801
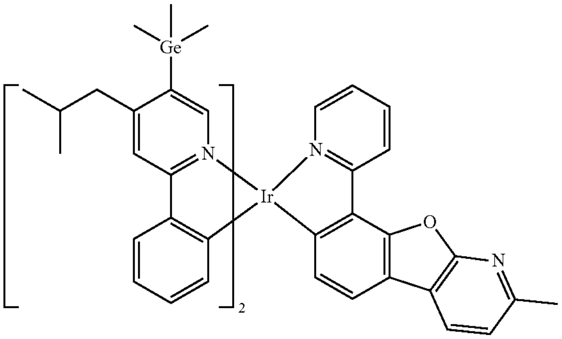
802
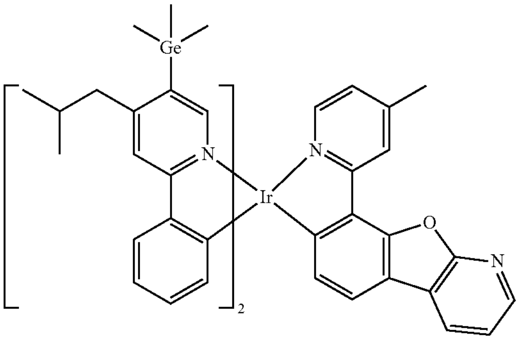
803
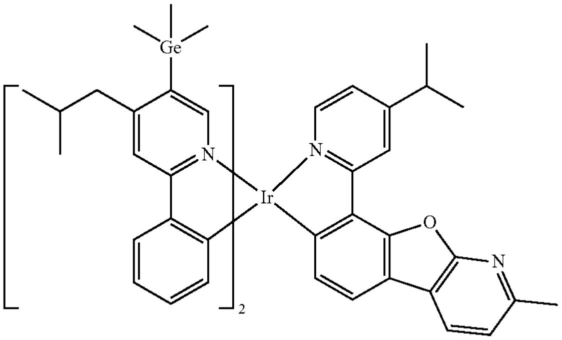
804
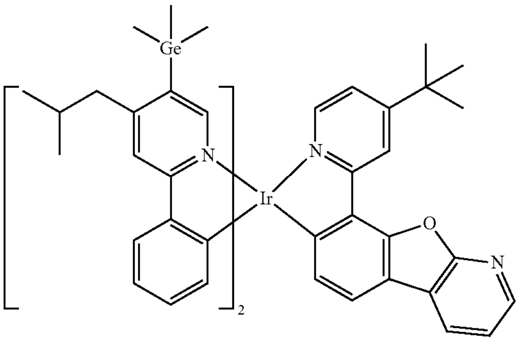
-continued
805
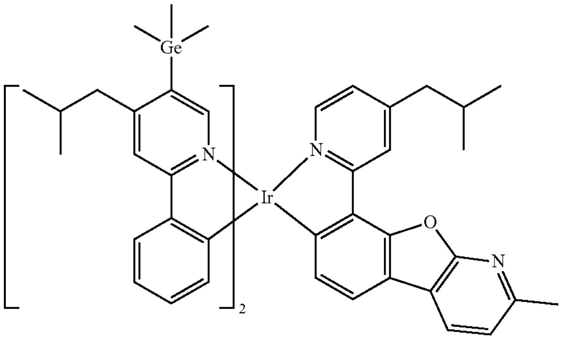
806
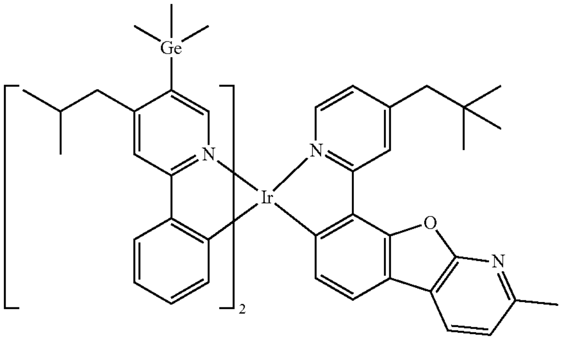
807
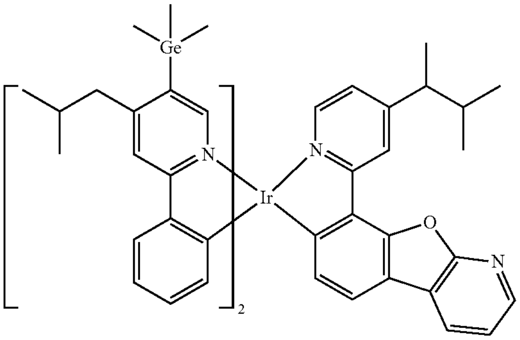
808
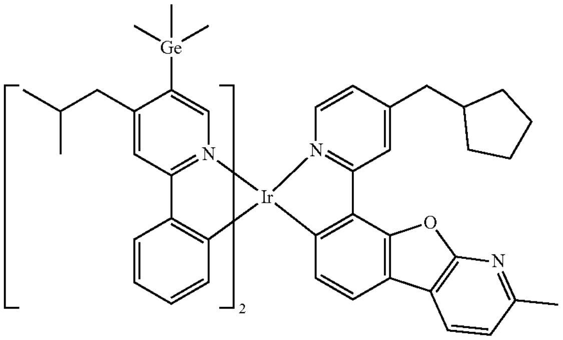

-continued
809
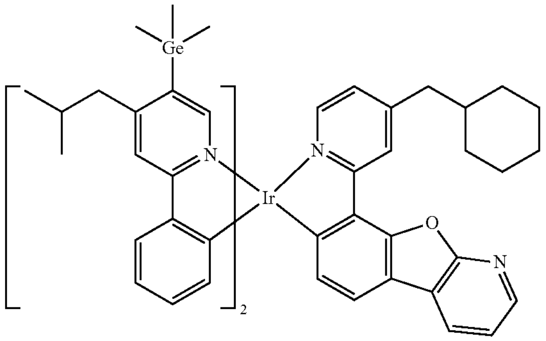
810
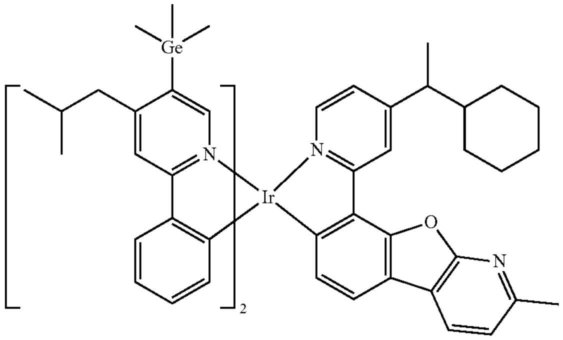
811
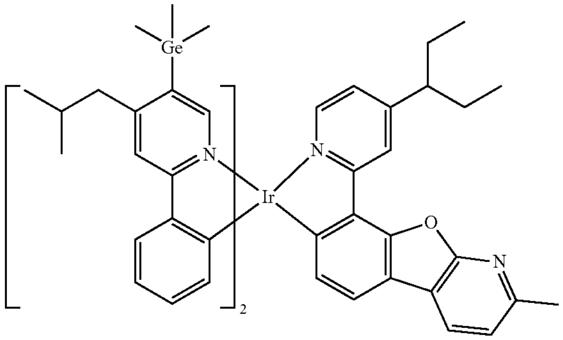
812
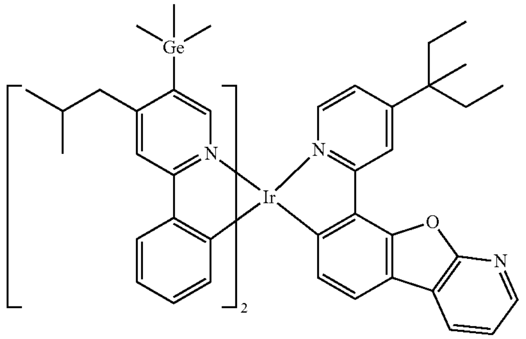
-continued
813
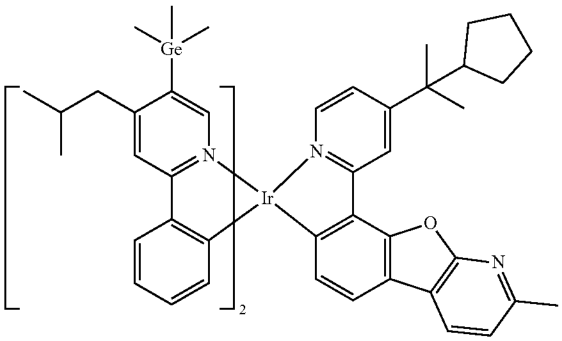
814
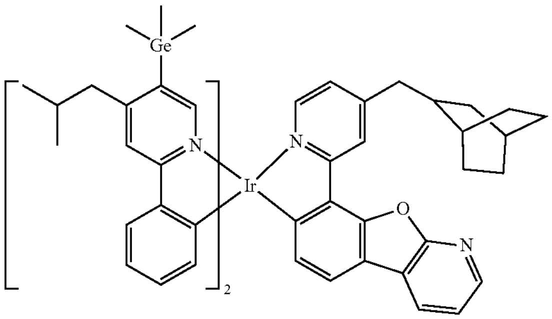
815
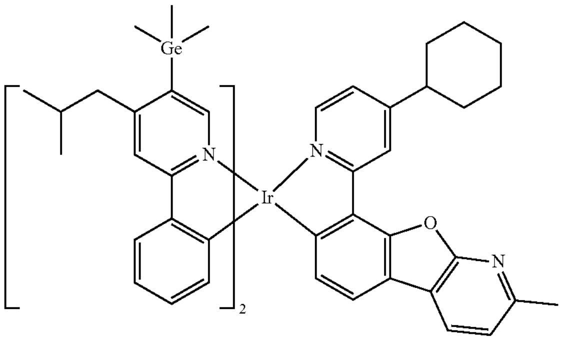
816
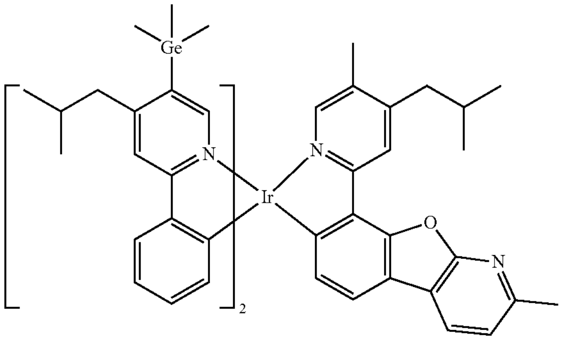

-continued
817
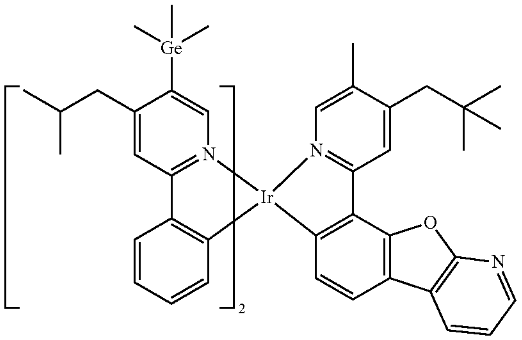
818
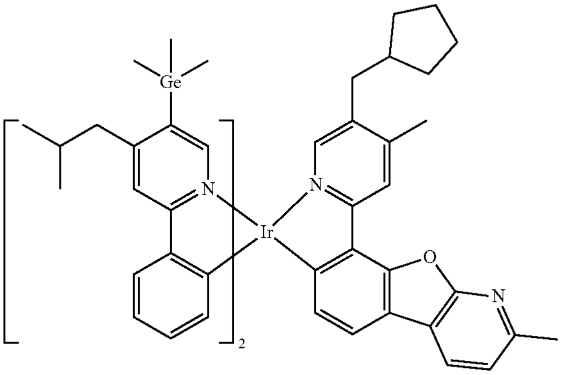
819
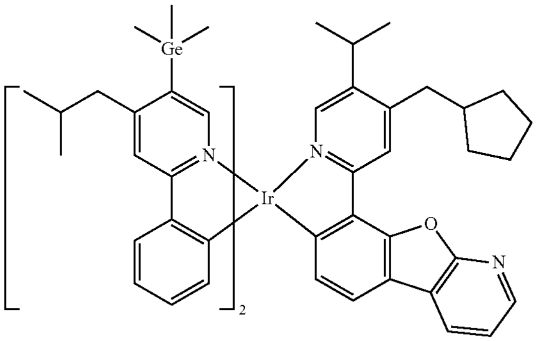
820
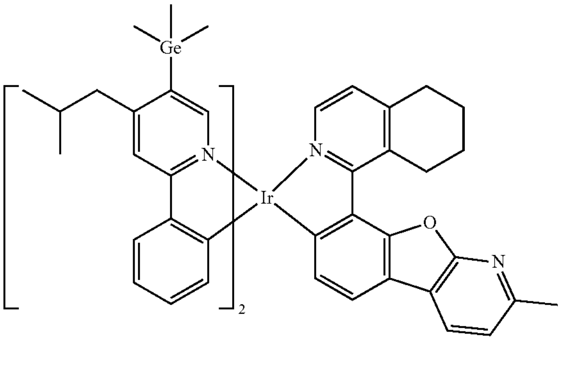
-continued
821
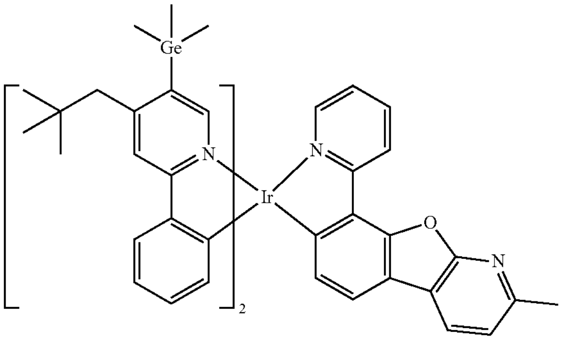
822
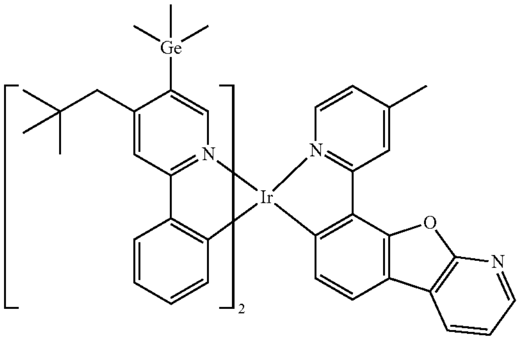
823
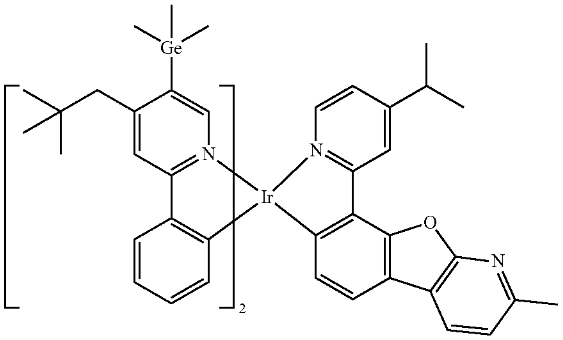
824
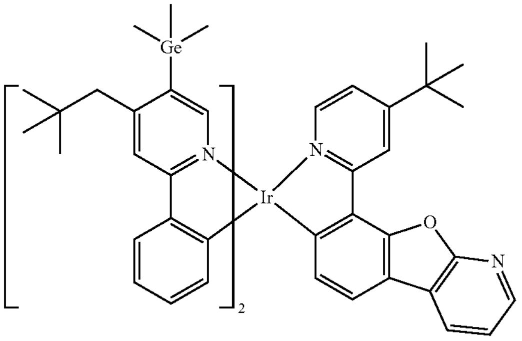

-continued
825
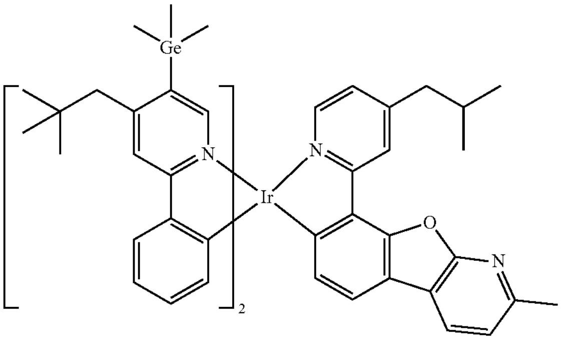
826
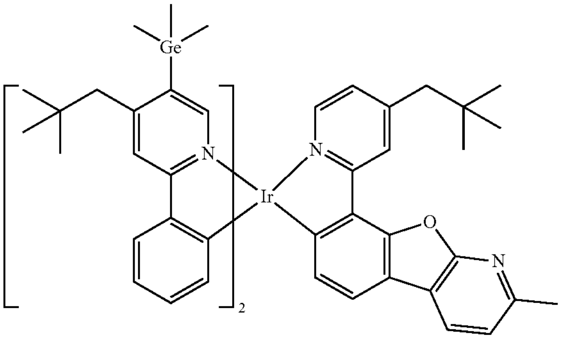
827
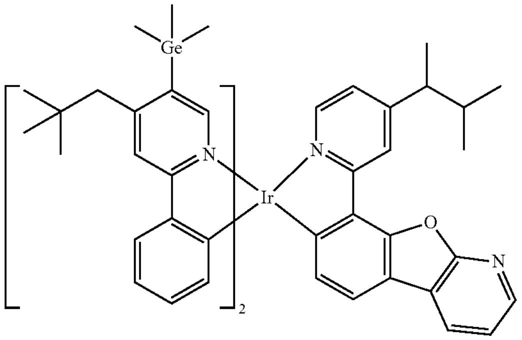
828
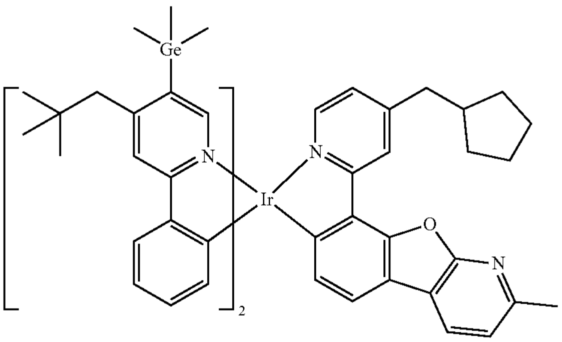
-continued
829
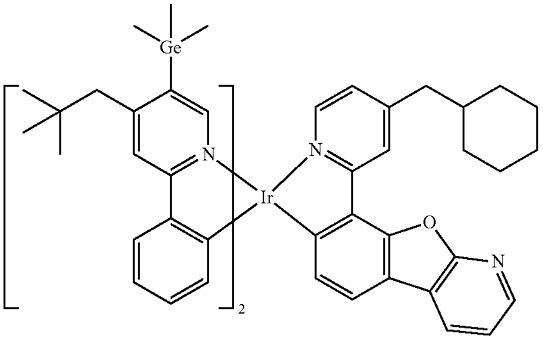
830
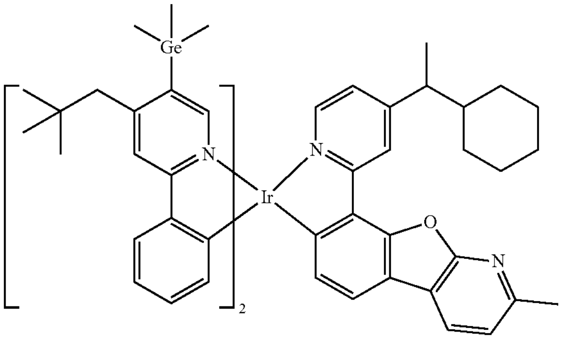
831
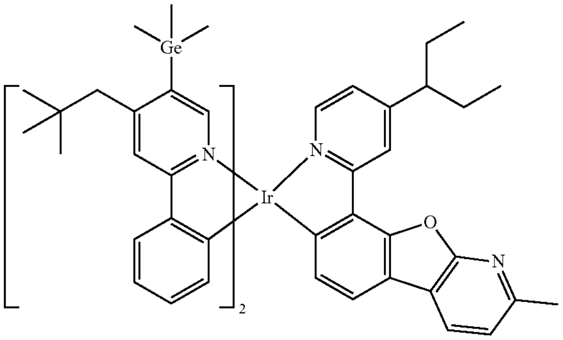
832
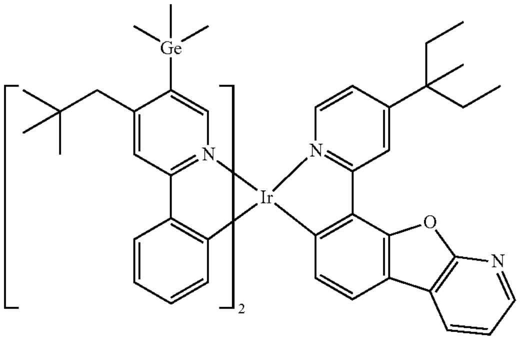

-continued
833
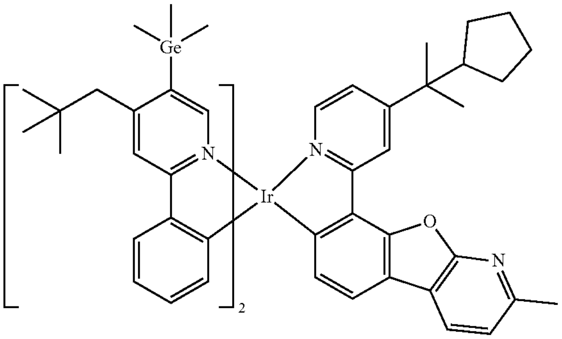
834
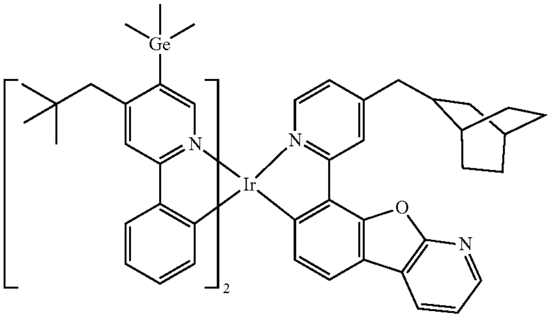
835
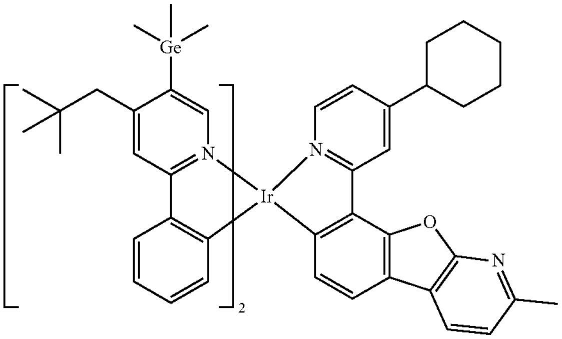
836
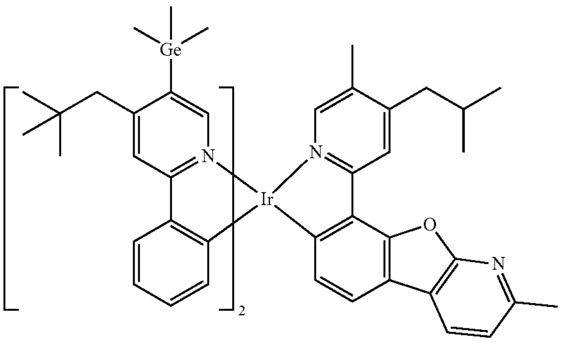
-continued
837
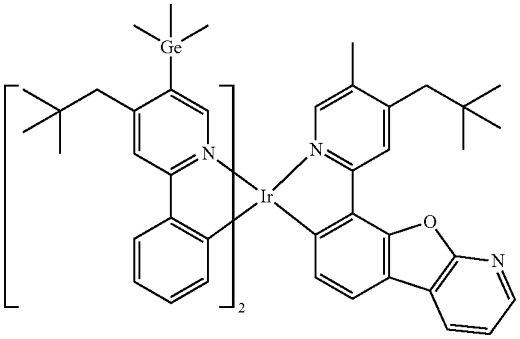
838
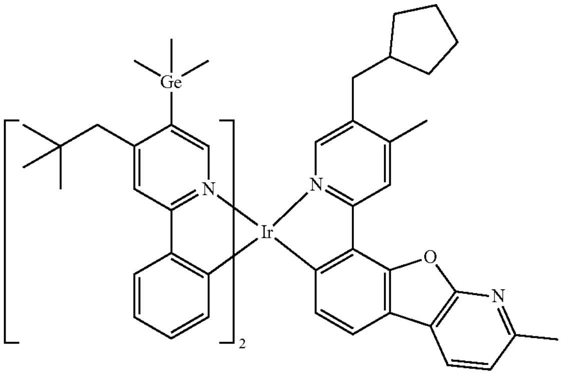
839
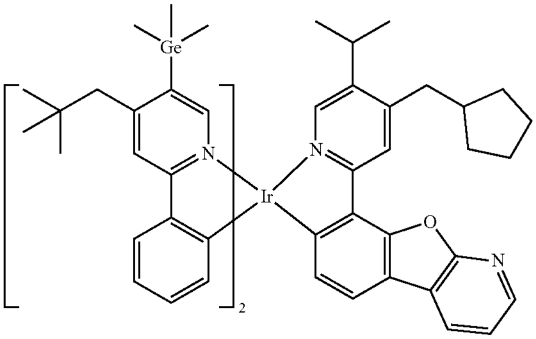
840
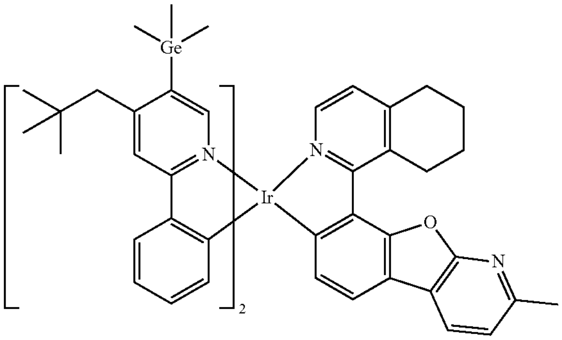

-continued
841
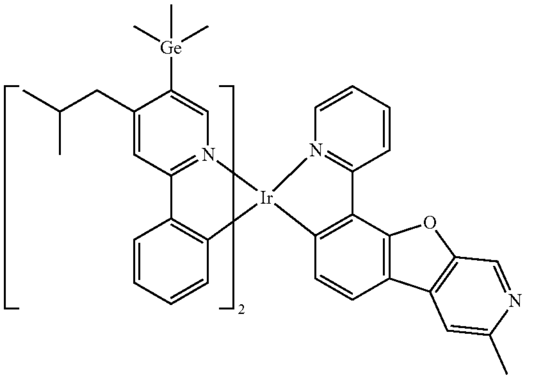
842
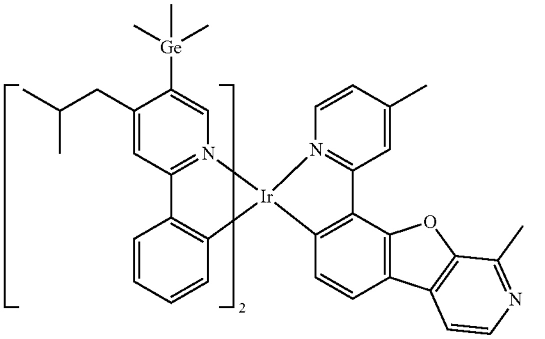
843
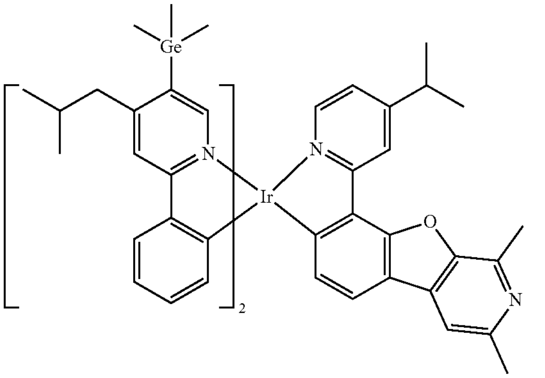
844
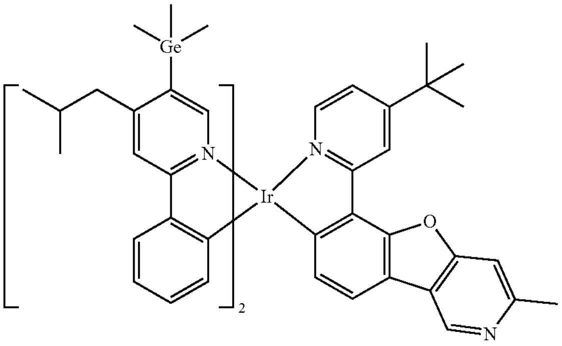
-continued
845
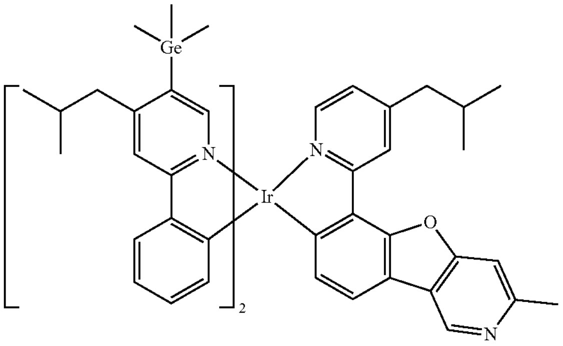
846
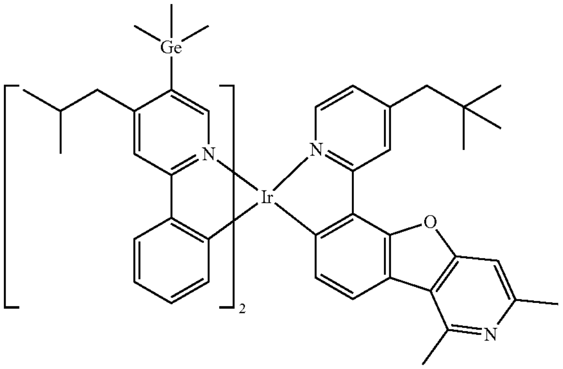
847
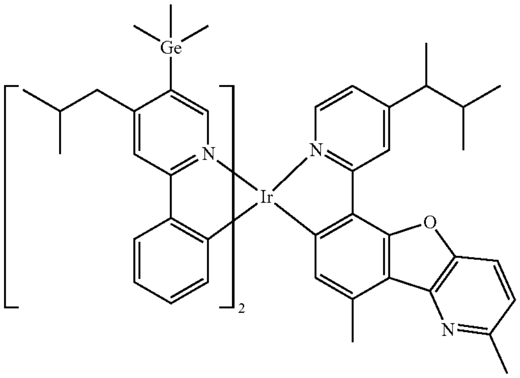
848
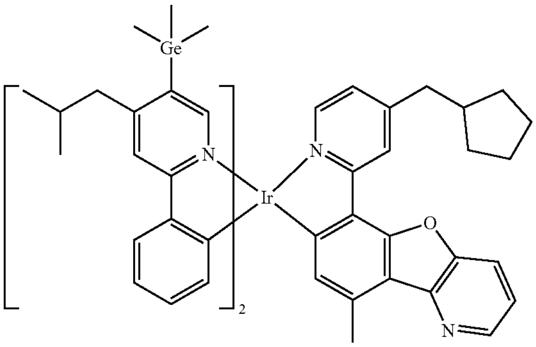

-continued
849
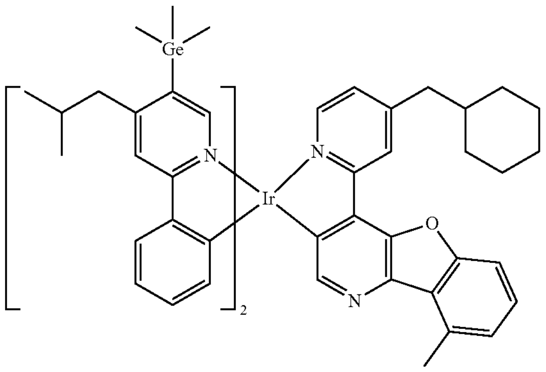
850
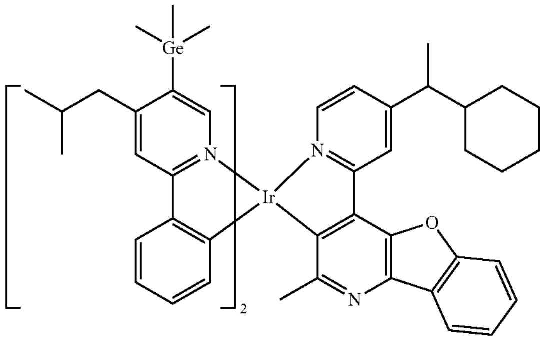
851
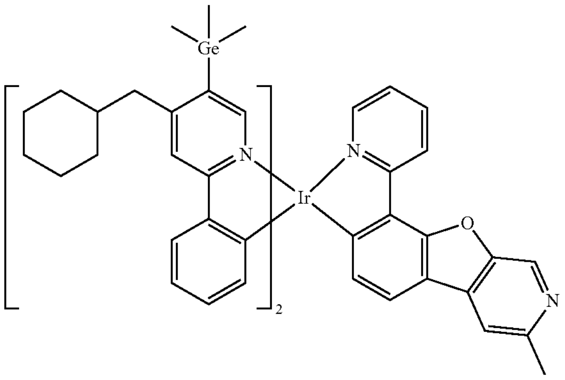
852
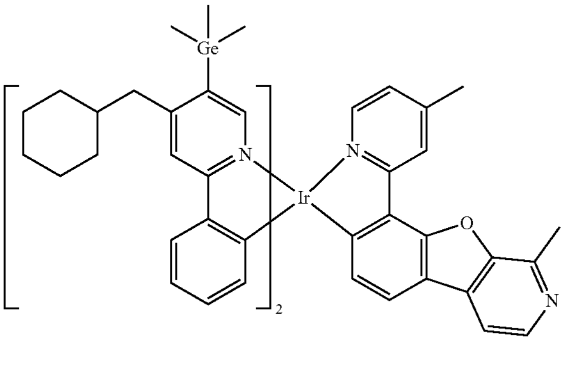
-continued
853
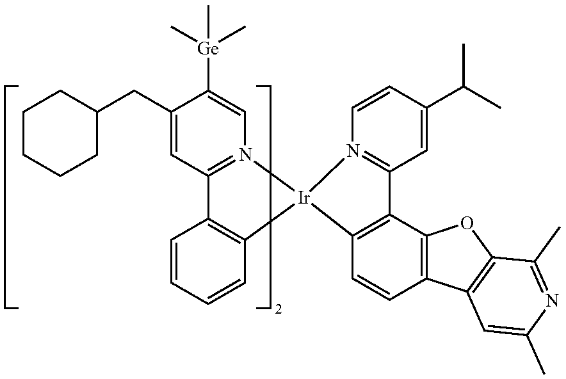
854
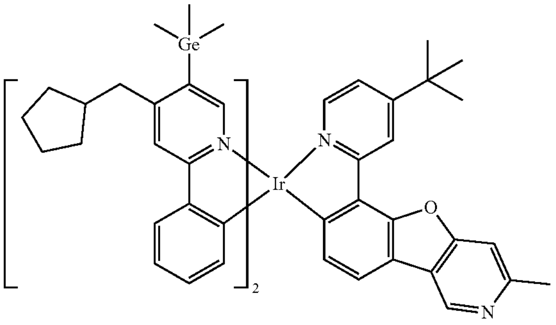
855
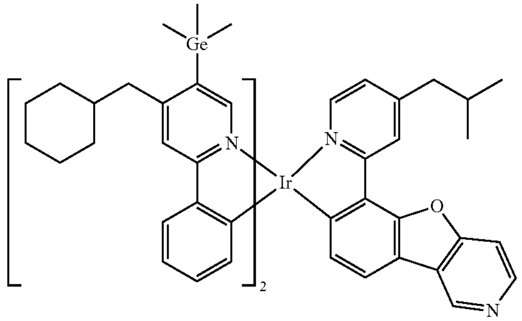
856
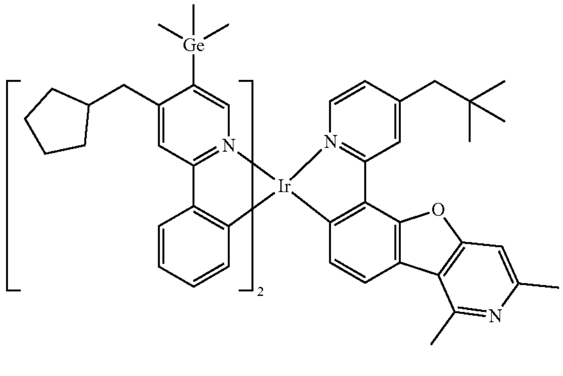

-continued
857
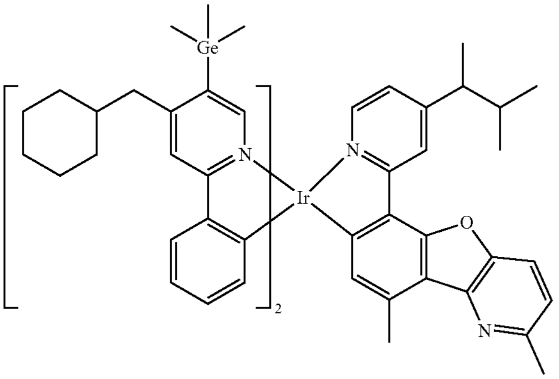
858
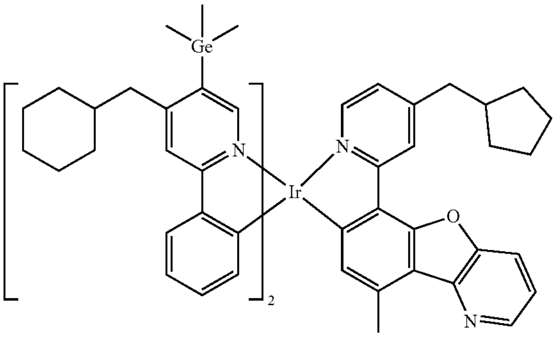
859
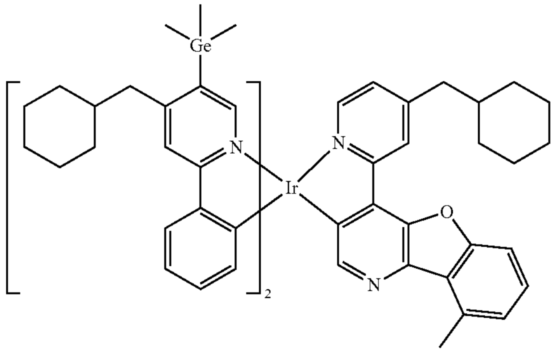
860
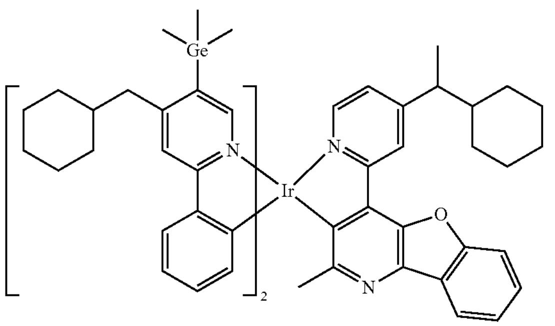
-continued
861
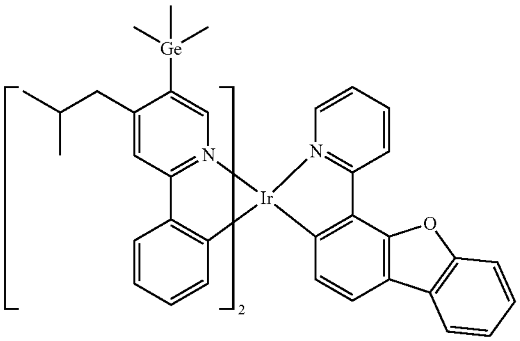
862
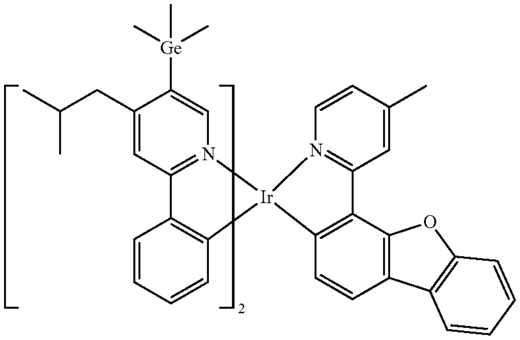
863
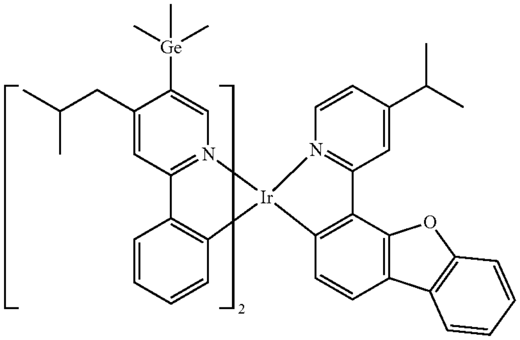
864
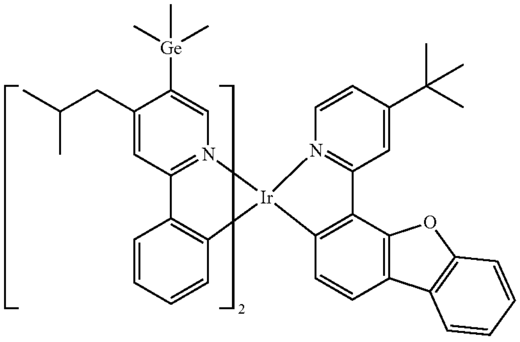

-continued
865
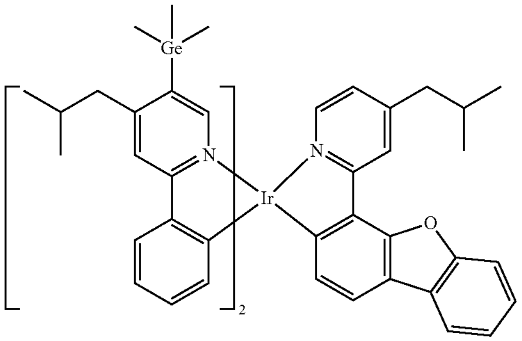
866
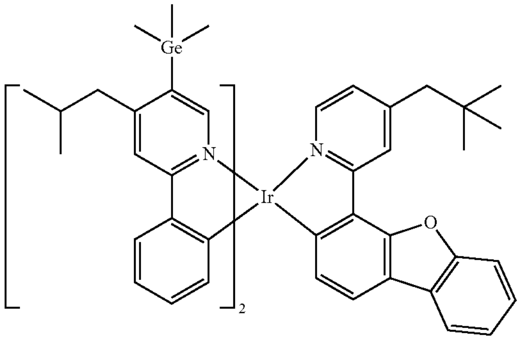
867
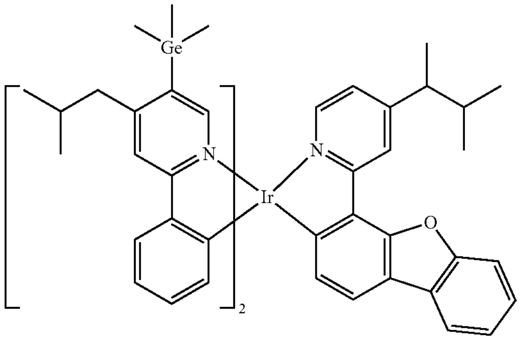
868
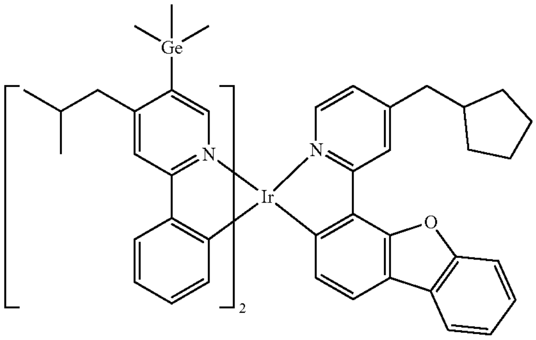
-continued
869
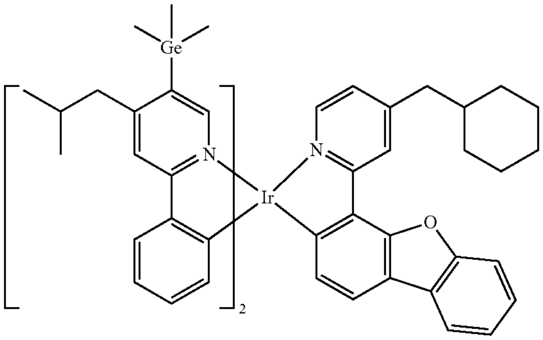
870
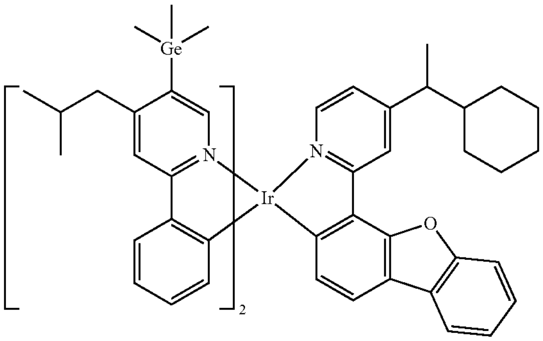
871
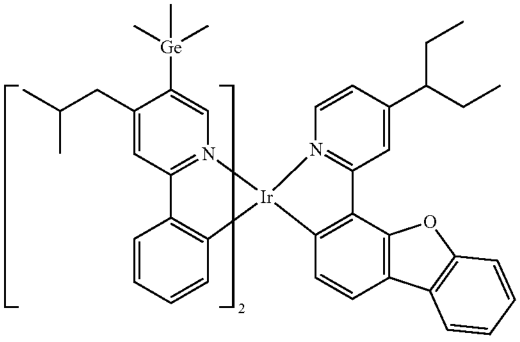
872
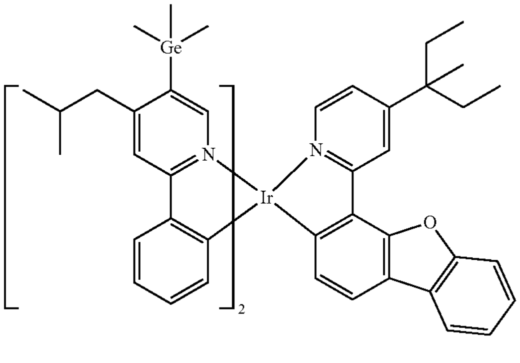

-continued
873
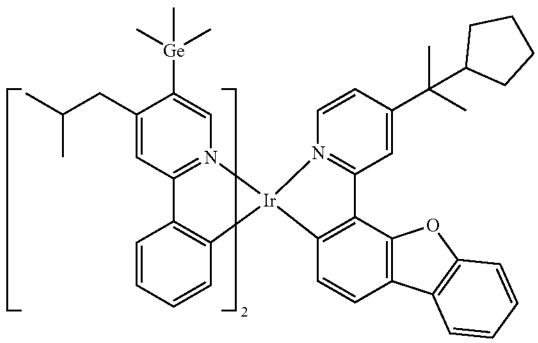
874
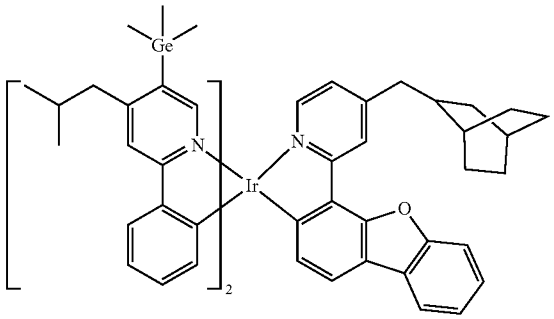
875
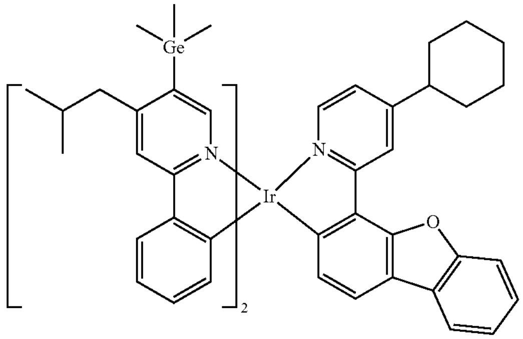
876
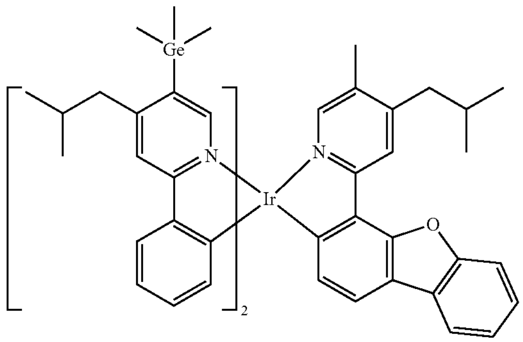
-continued
877
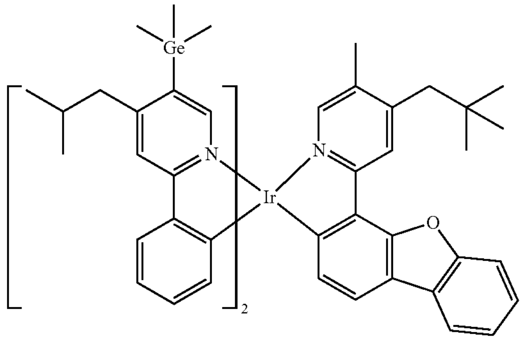
878
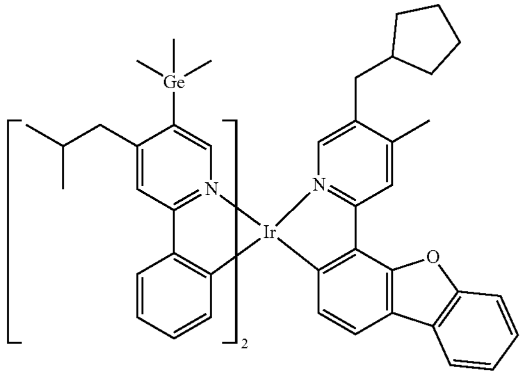
879
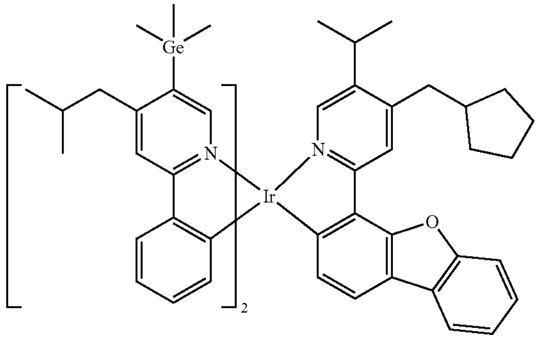
880
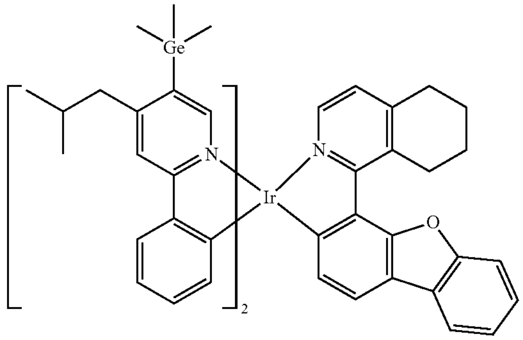

881
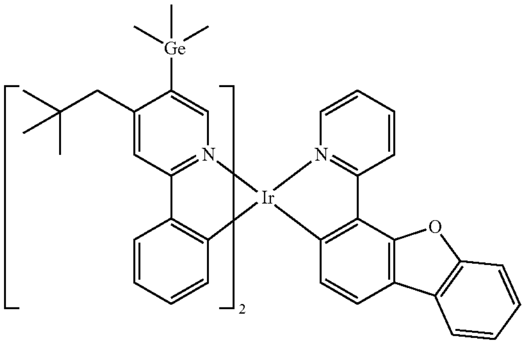
882
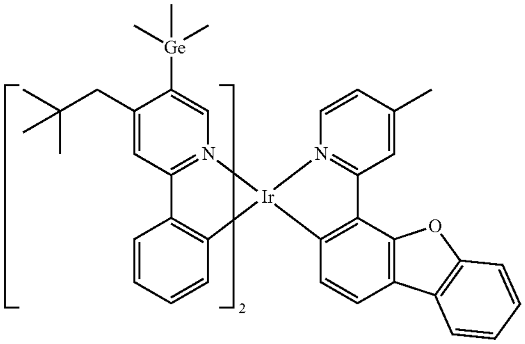
883
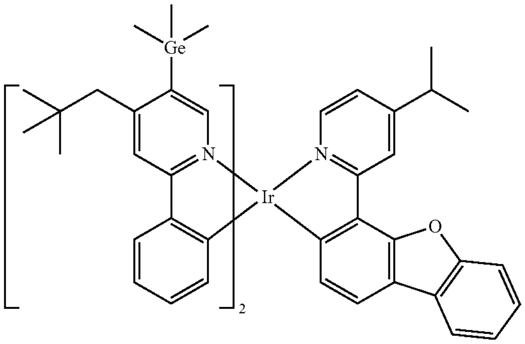
884
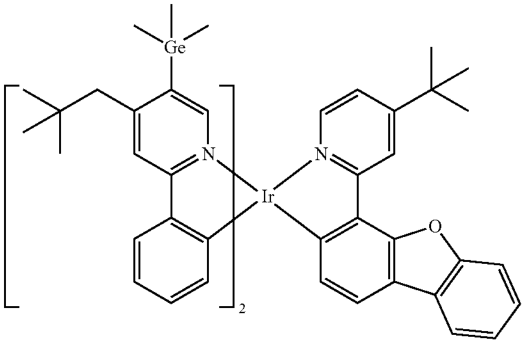
-continued
885
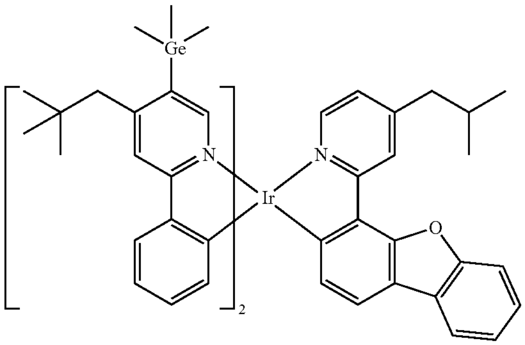
886
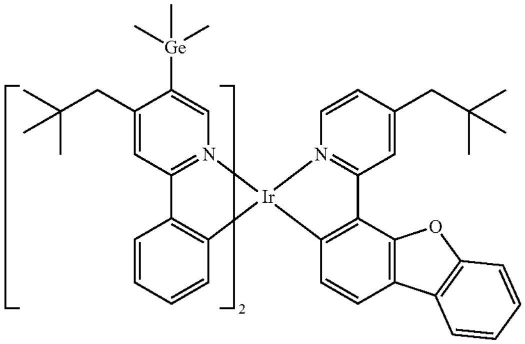
887
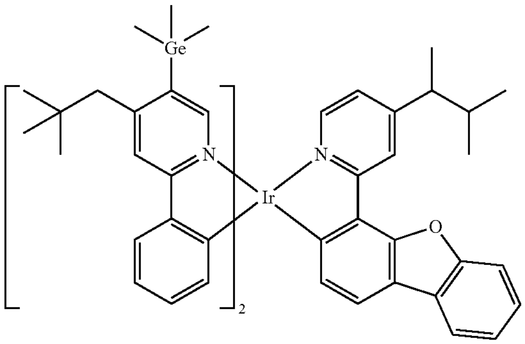
888
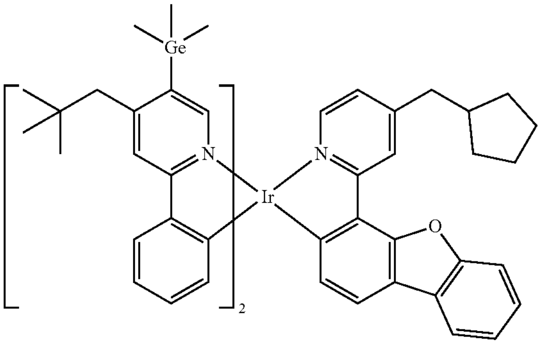

-continued
889
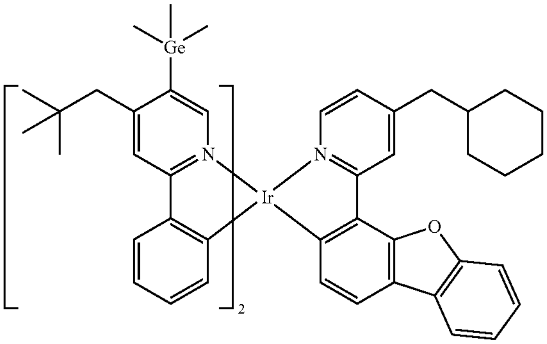
890
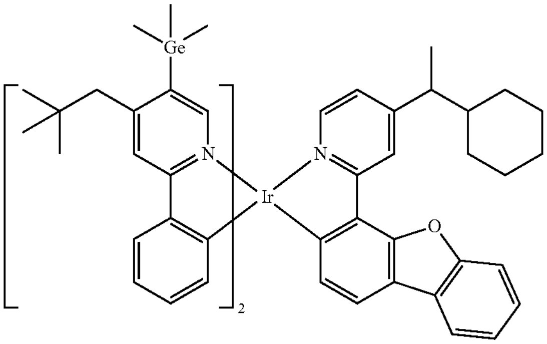
891
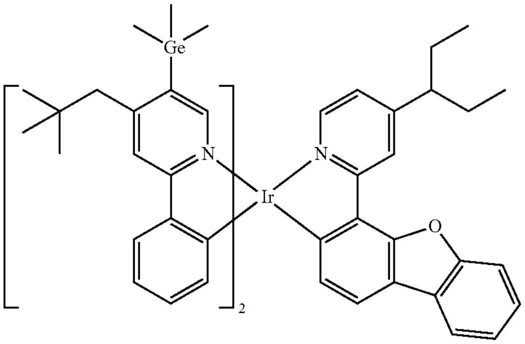
892
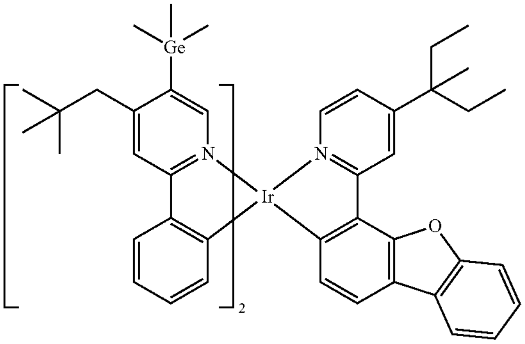
-continued
893
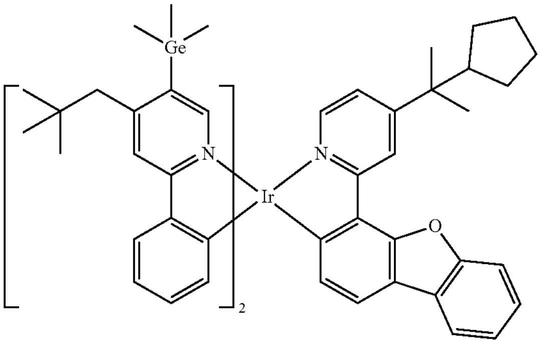
894
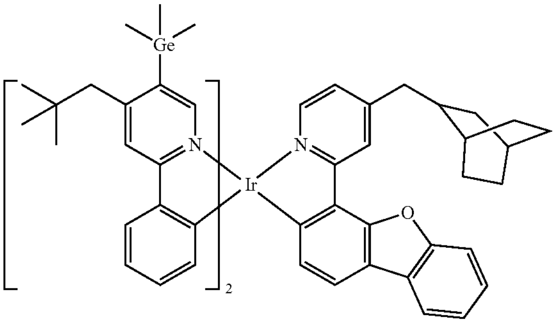
895
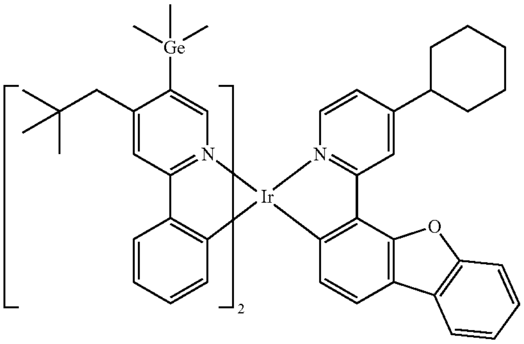
896
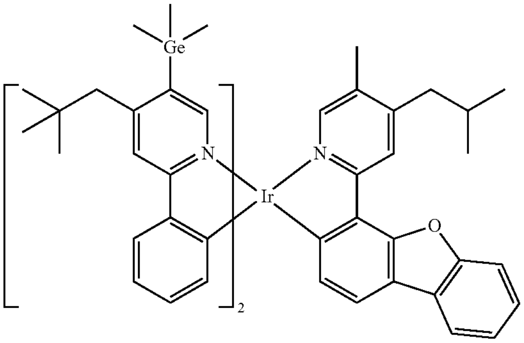

-continued
897
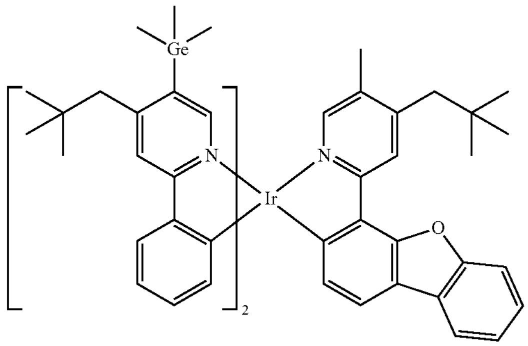
898
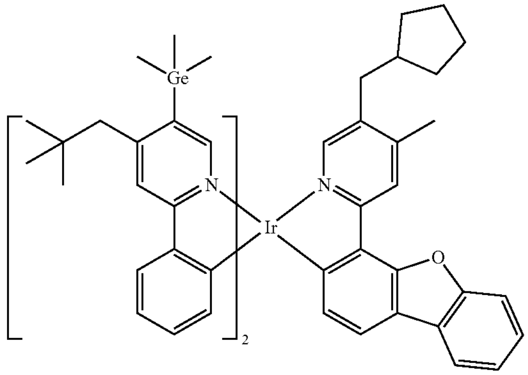
899
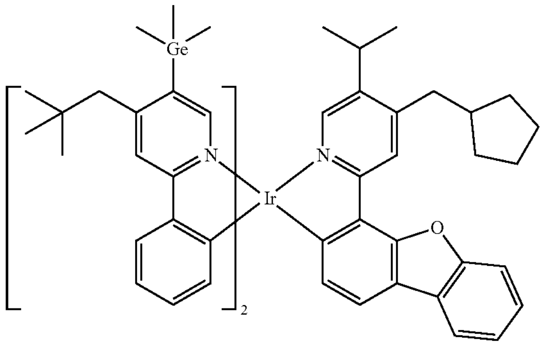
900
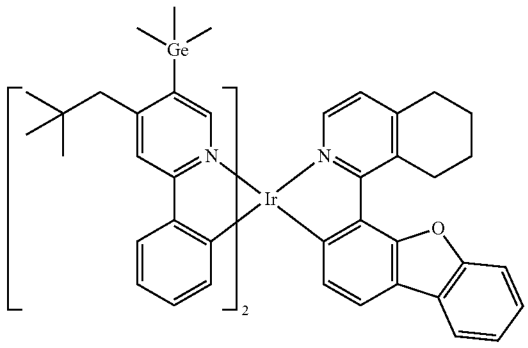
-continued
901
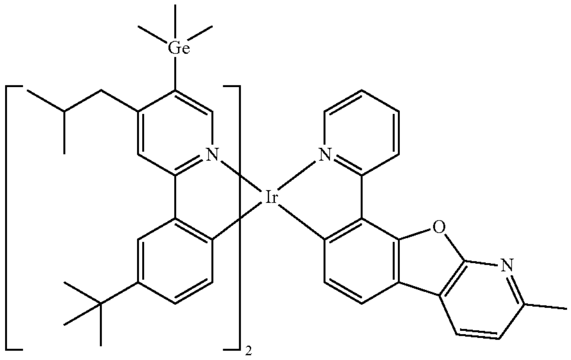
902
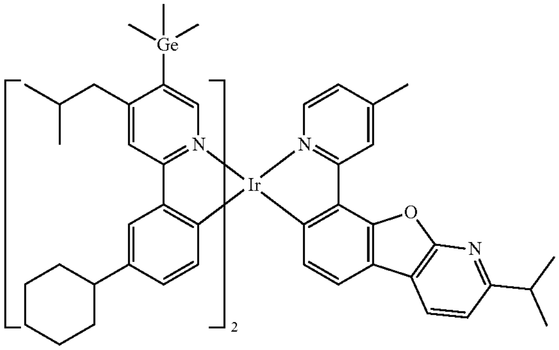
903
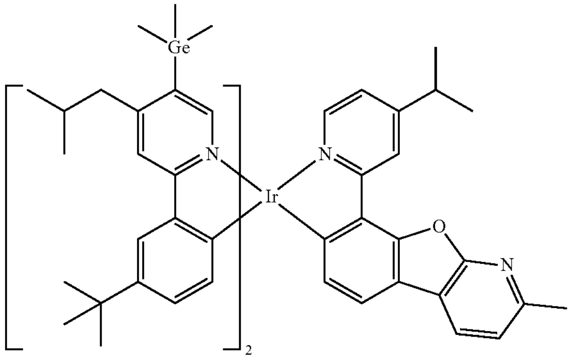
904
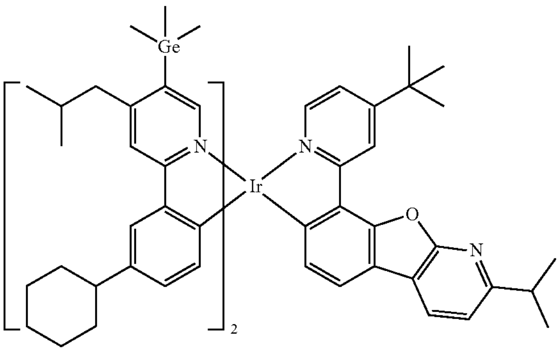

-continued
905
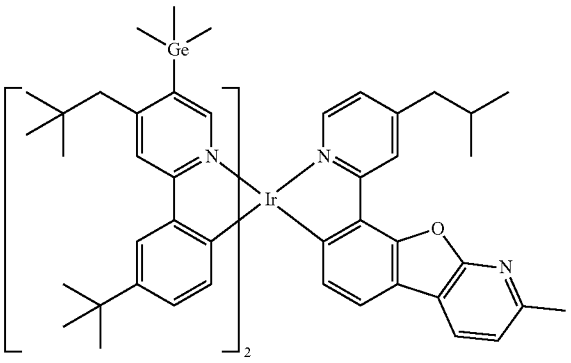
906
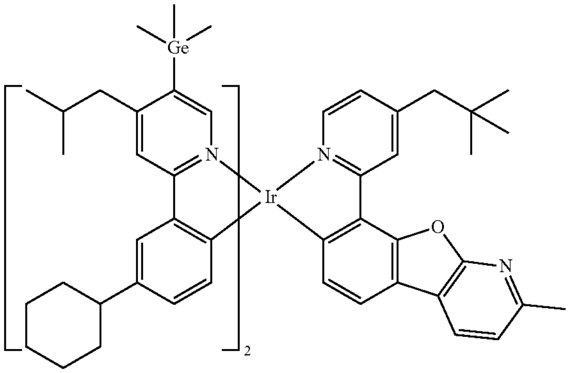
907
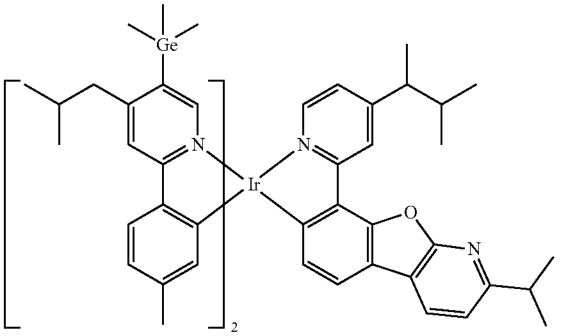
908
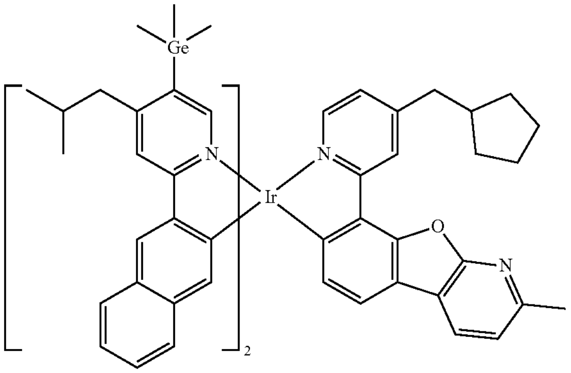
-continued
909
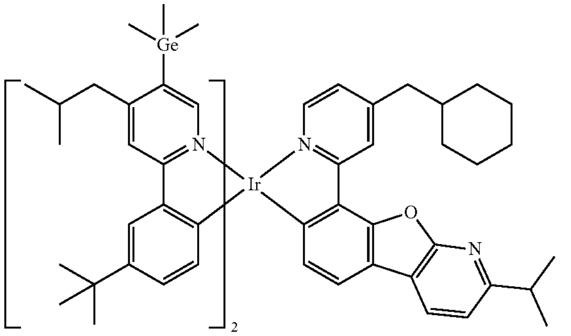
910
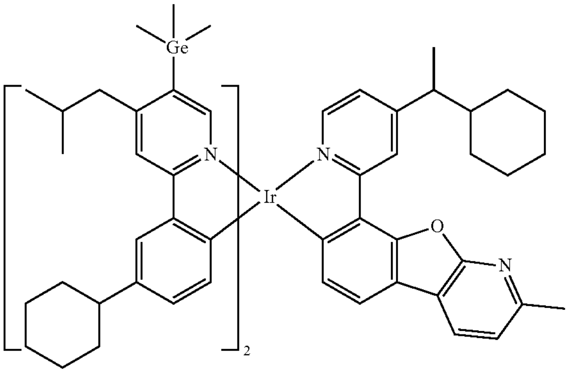
911
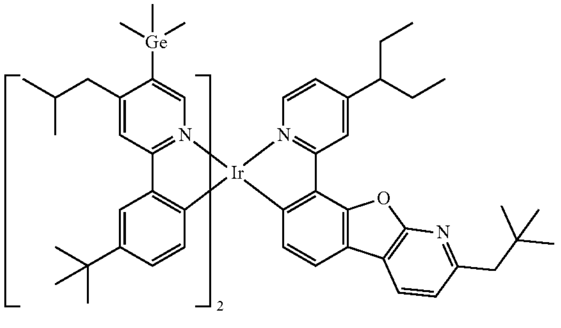
912
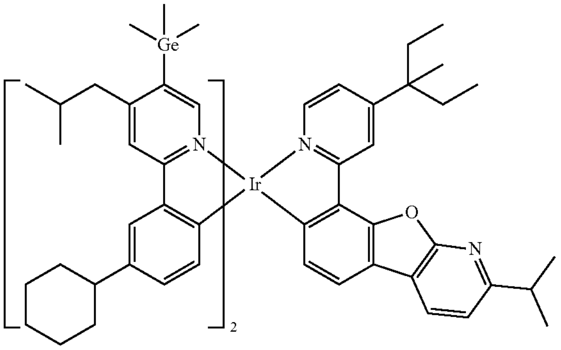

-continued
913
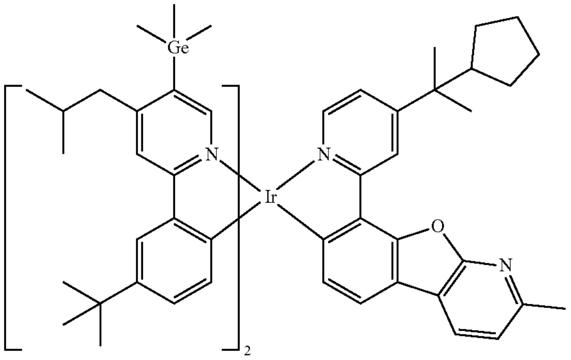
914
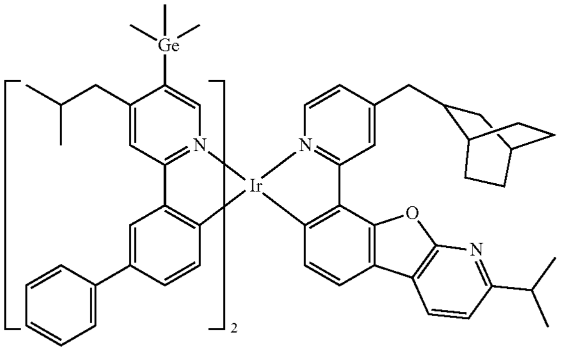
915
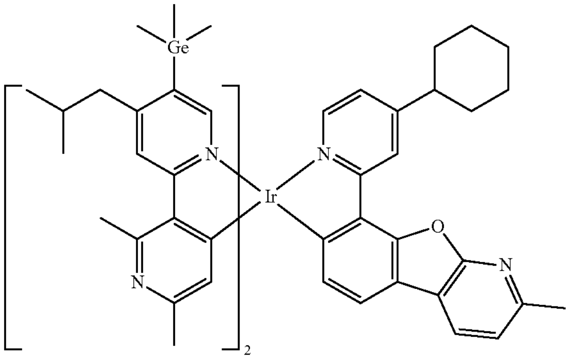
916
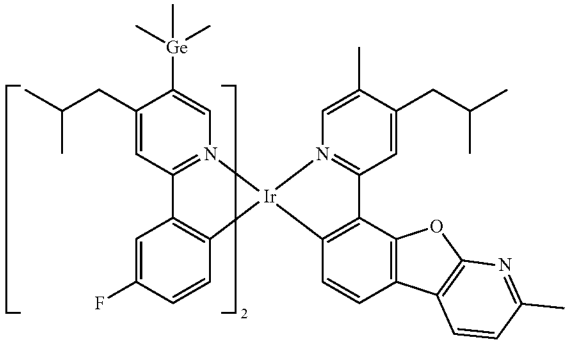
-continued
917
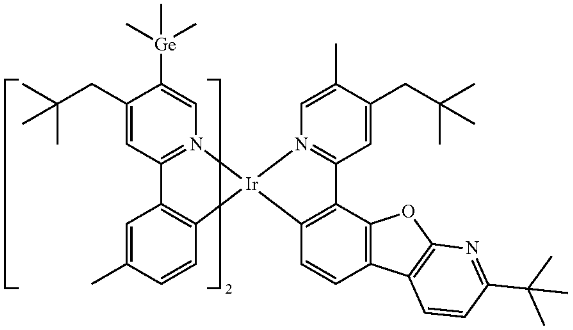
918
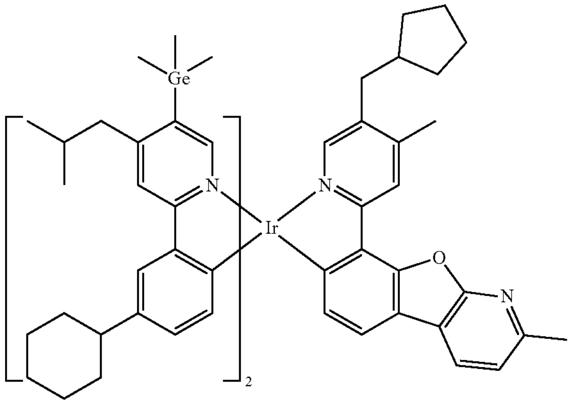
919
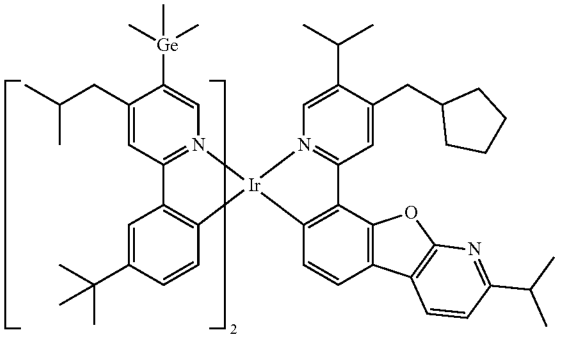
920
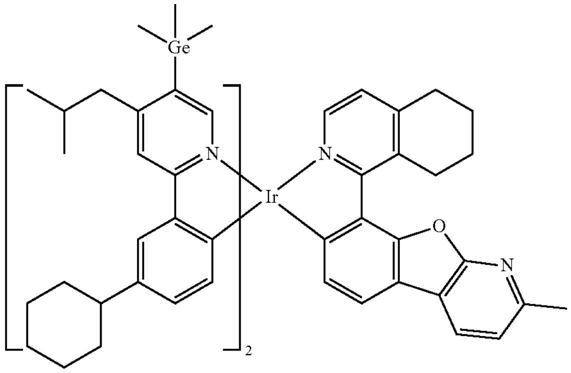

-continued
921
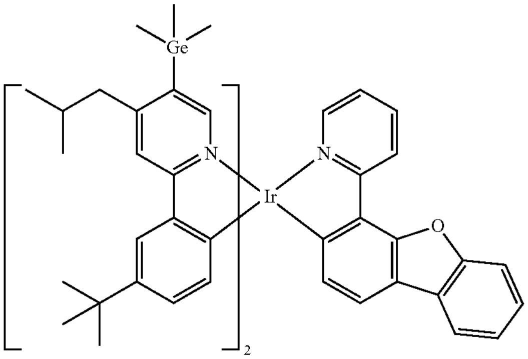
922
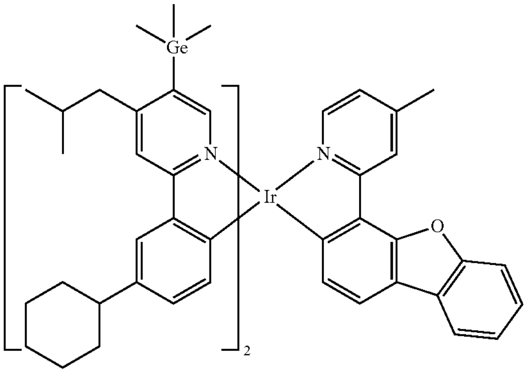
923
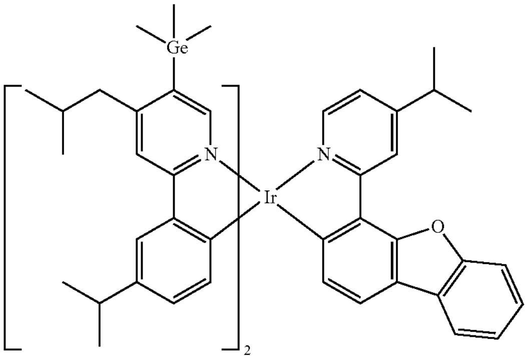
924
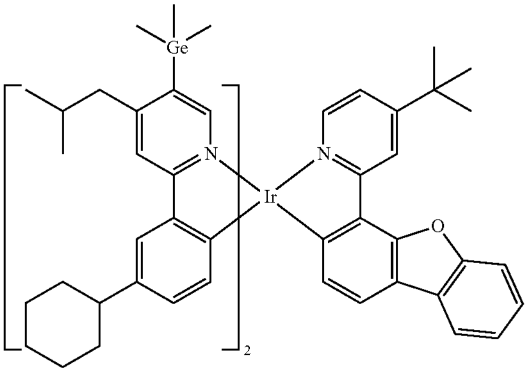
-continued
925
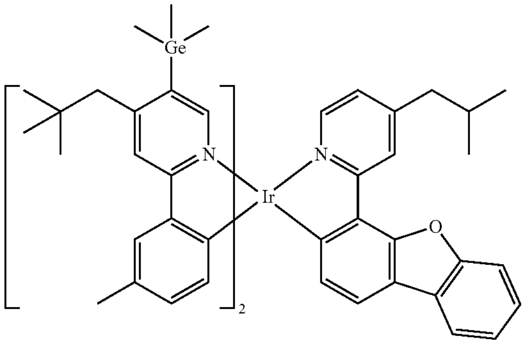
926
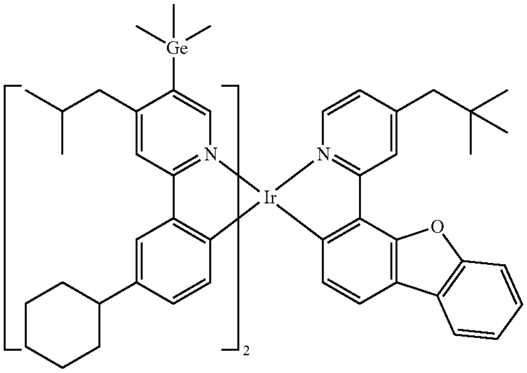
927
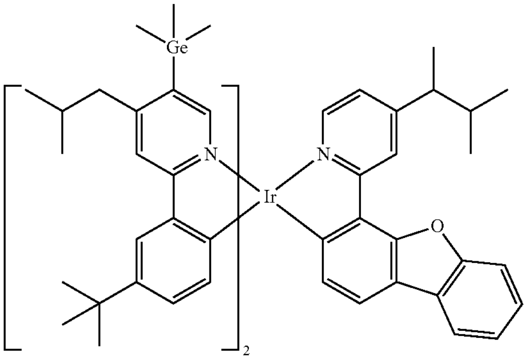
928
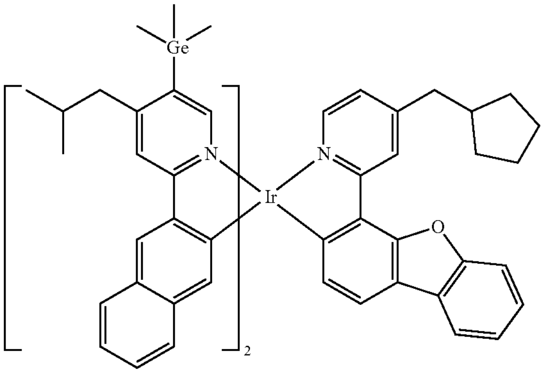

-continued
929
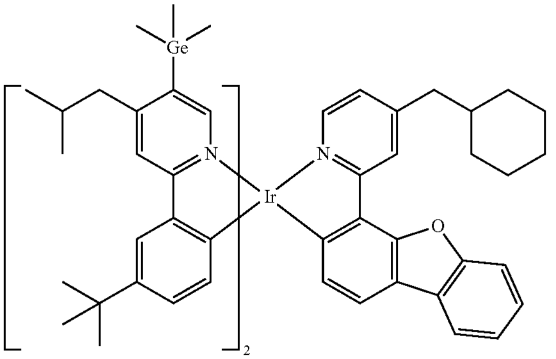
930
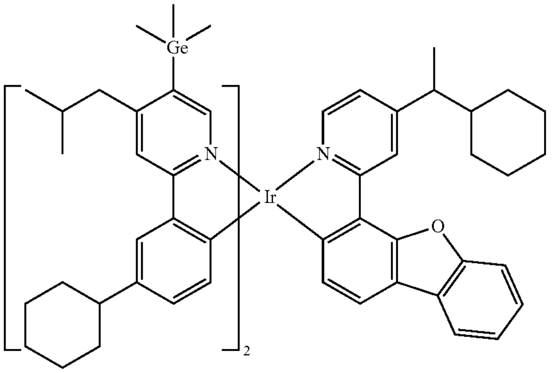
931
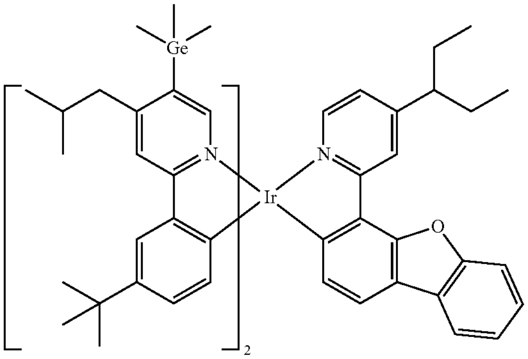
932
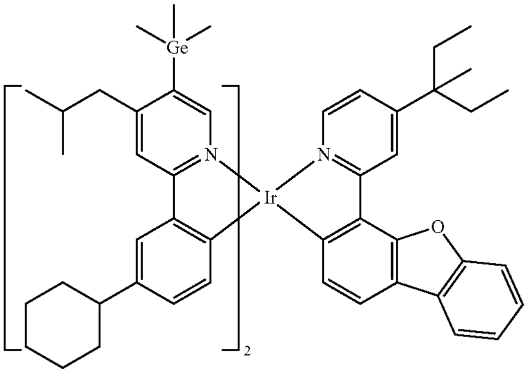
-continued
933
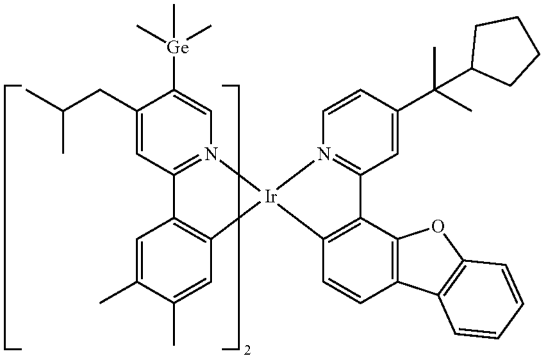
934
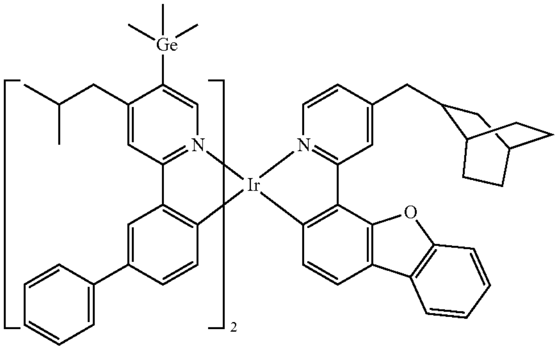
935
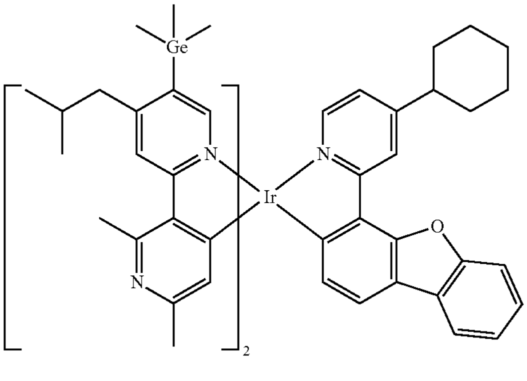
936
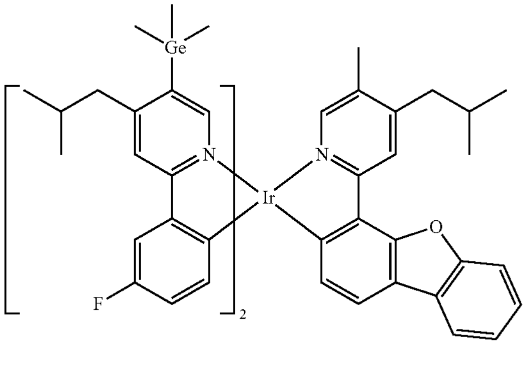

-continued
937
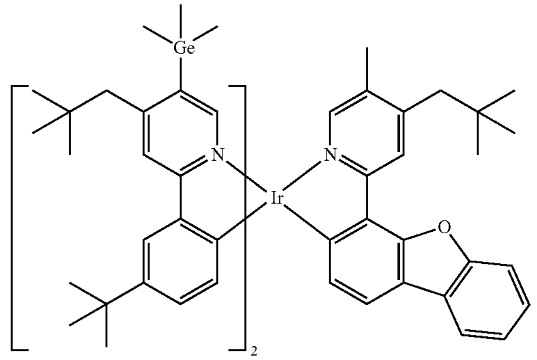
938
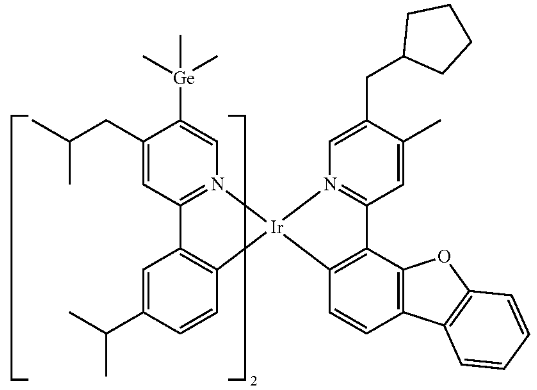
939
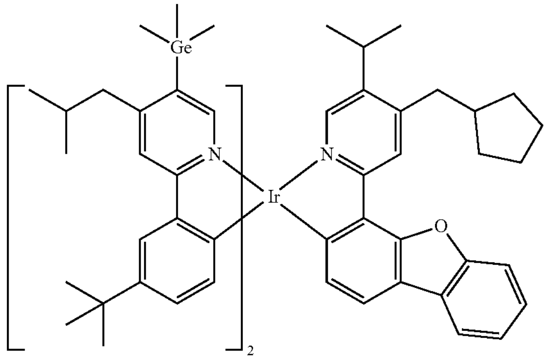
940
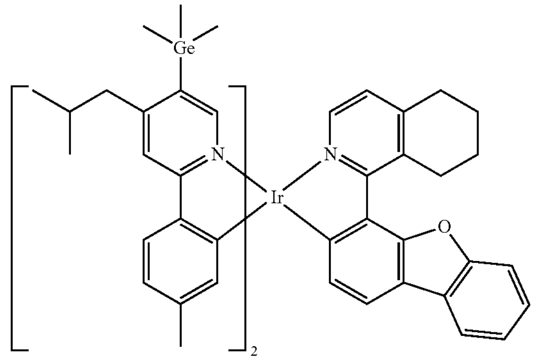
-continued
941
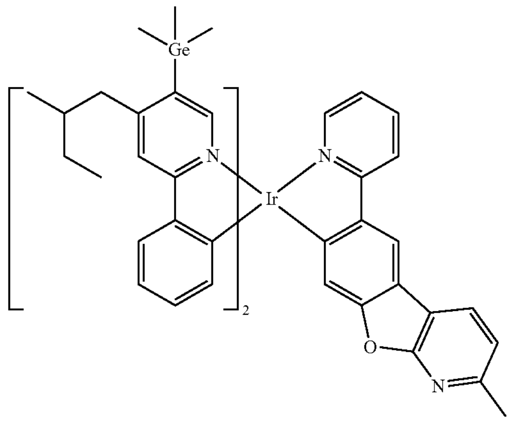
942
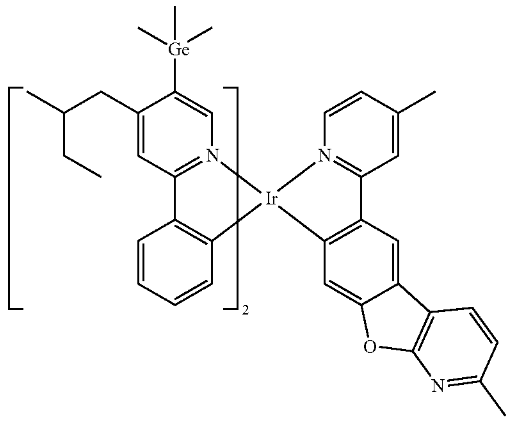
943
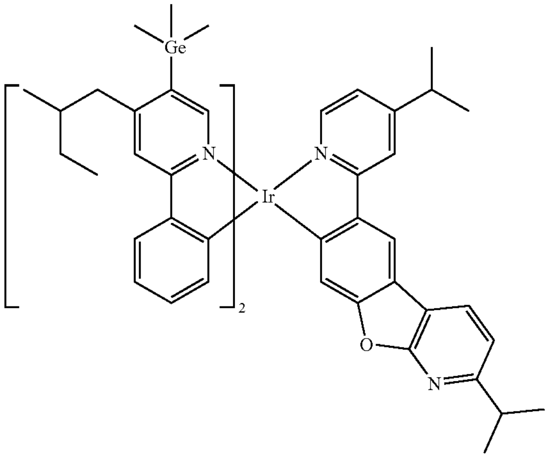

-continued
944
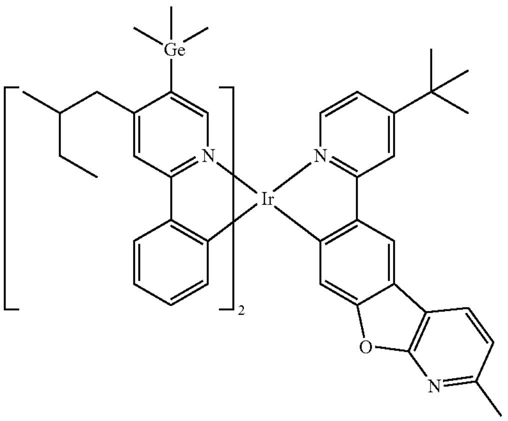
945
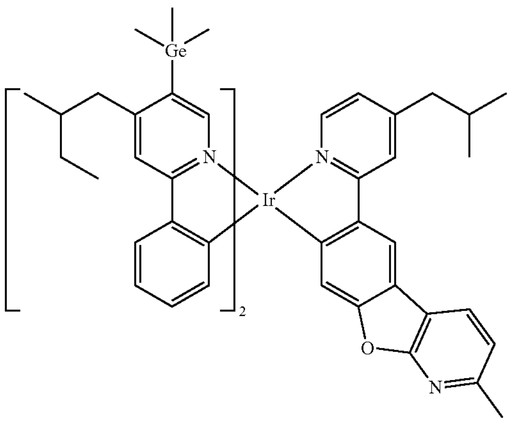
946
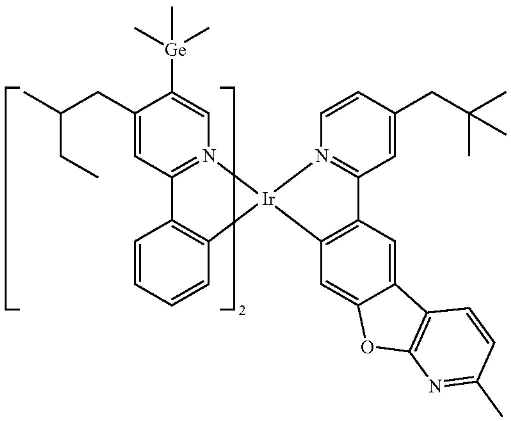
-continued
947
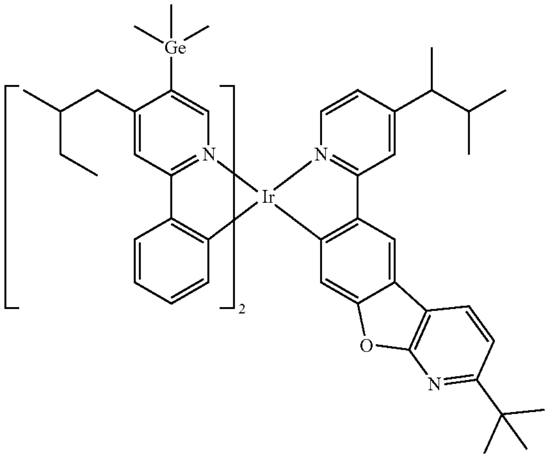
948
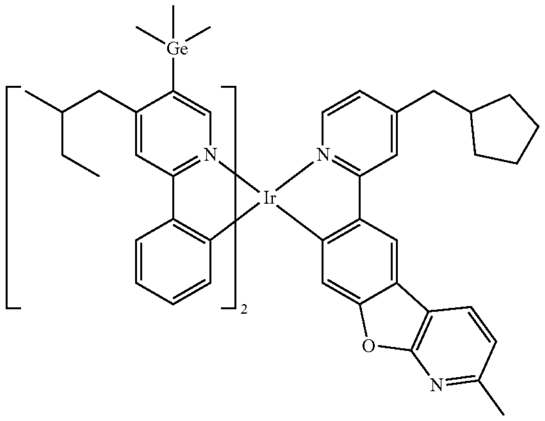
949
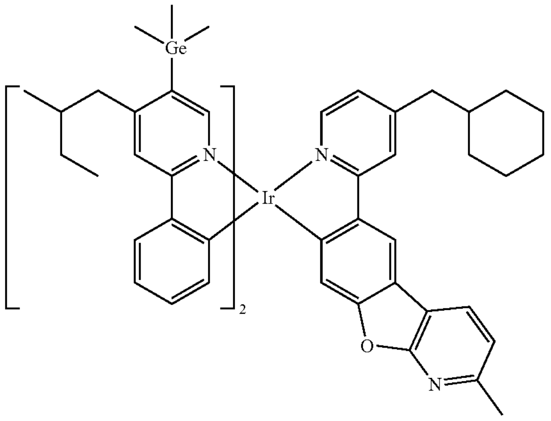

-continued
950
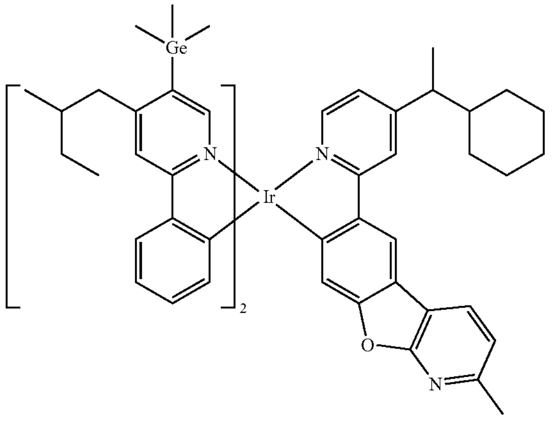
951
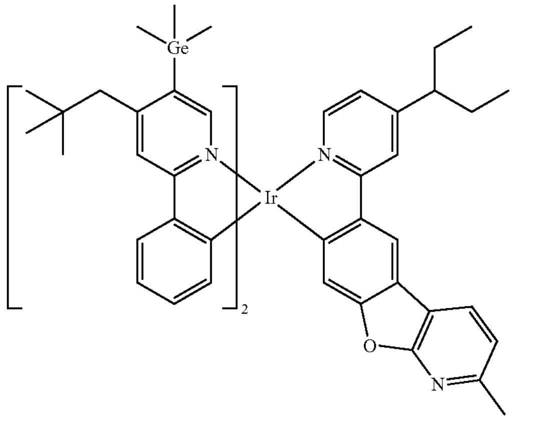
952
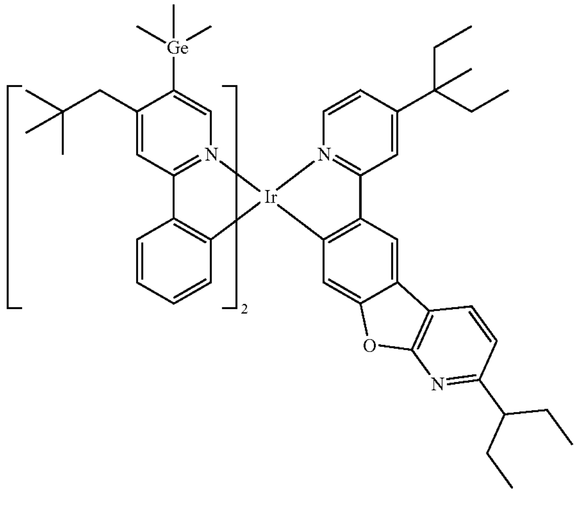
-continued
953
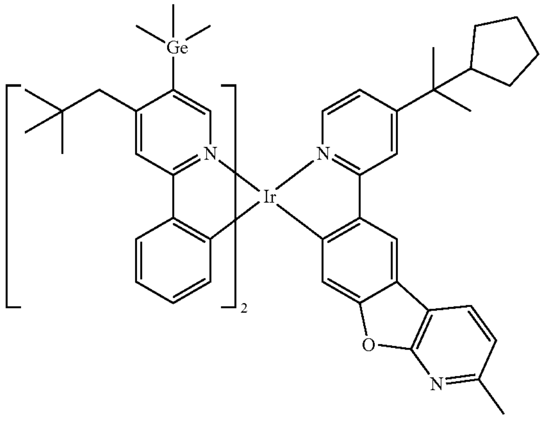
954
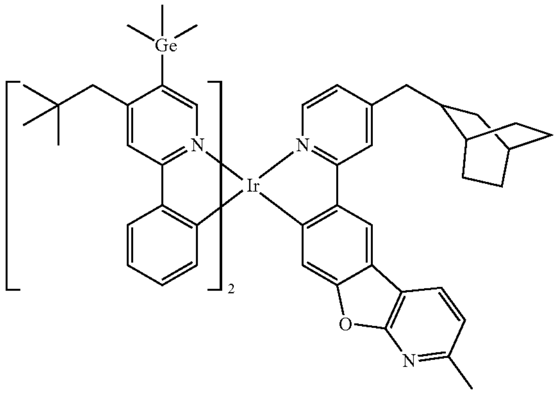
955
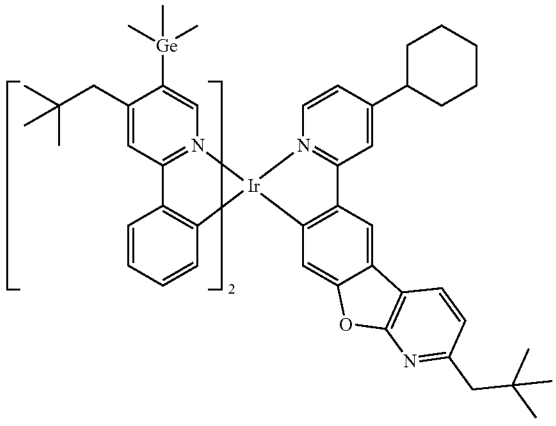

-continued
956
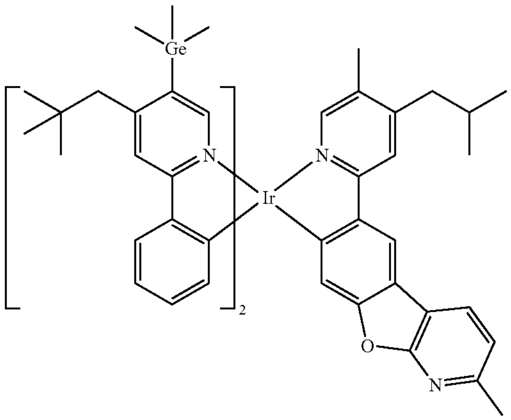
957
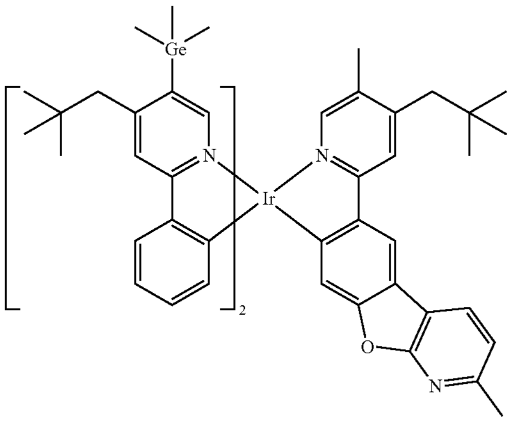
958
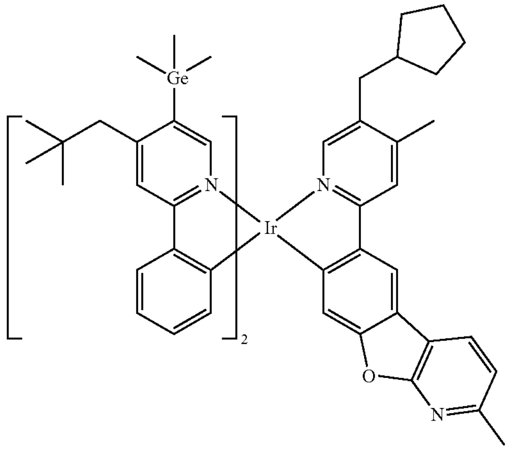
-continued
959
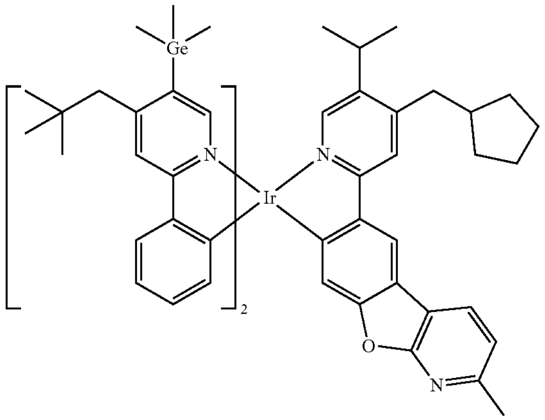
960
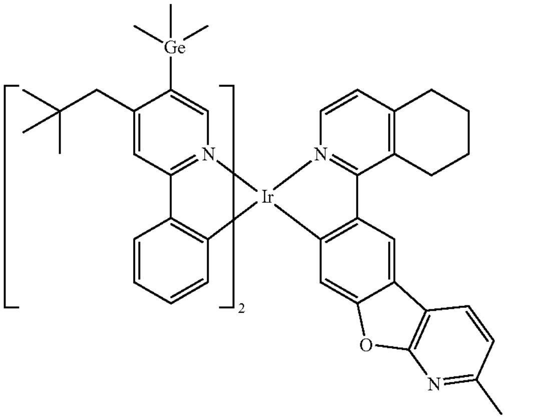
961
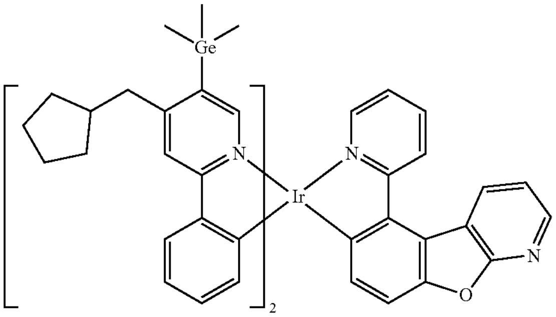
962
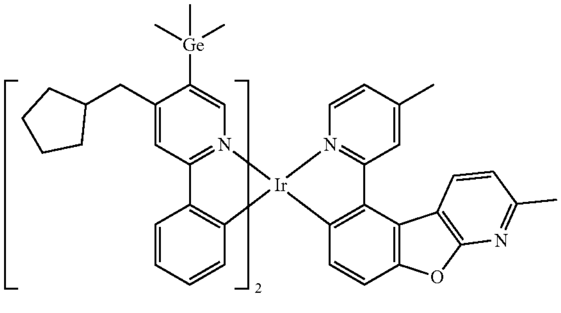

-continued
963
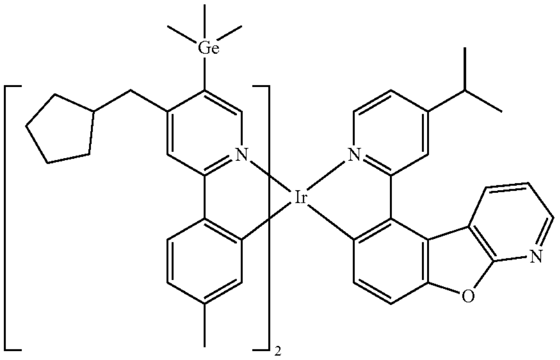
964
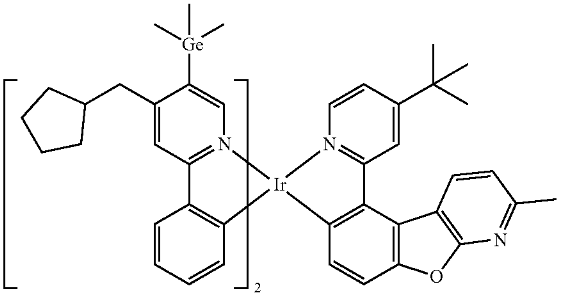
965
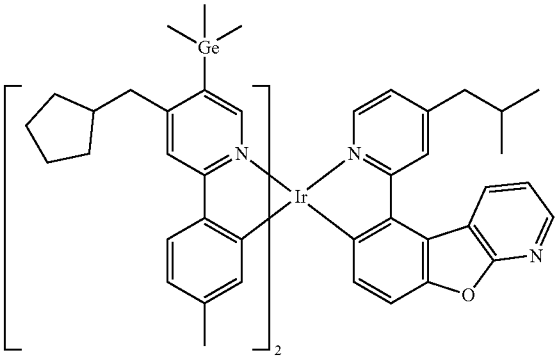
966
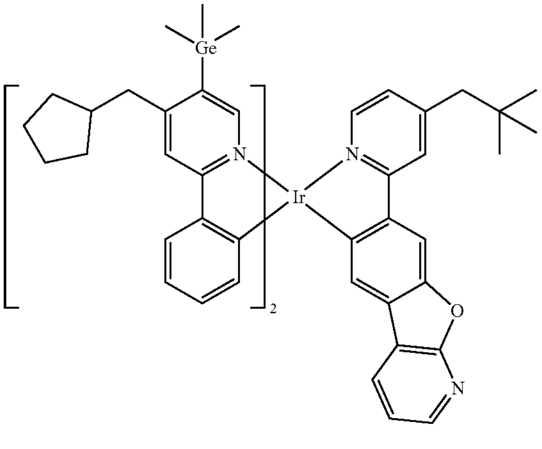
-continued
967
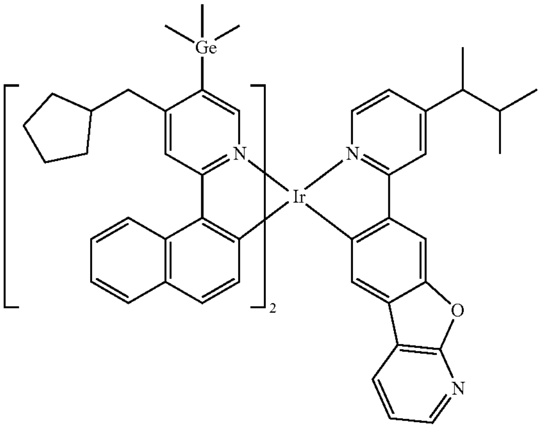
968
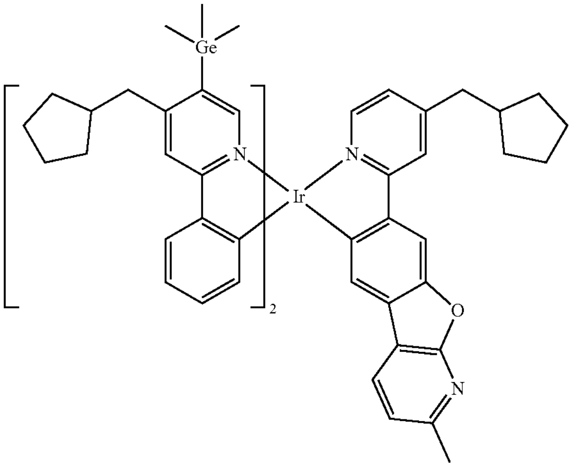
969
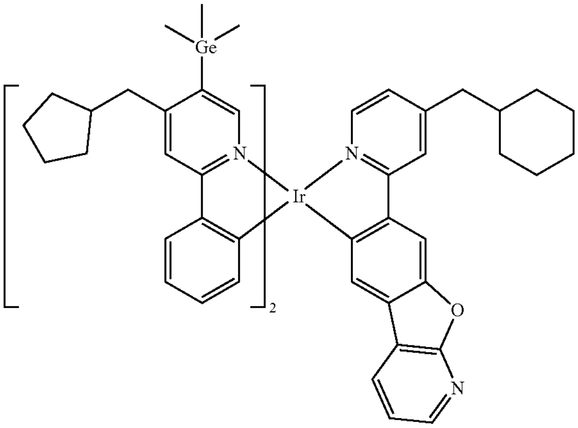

-continued
970
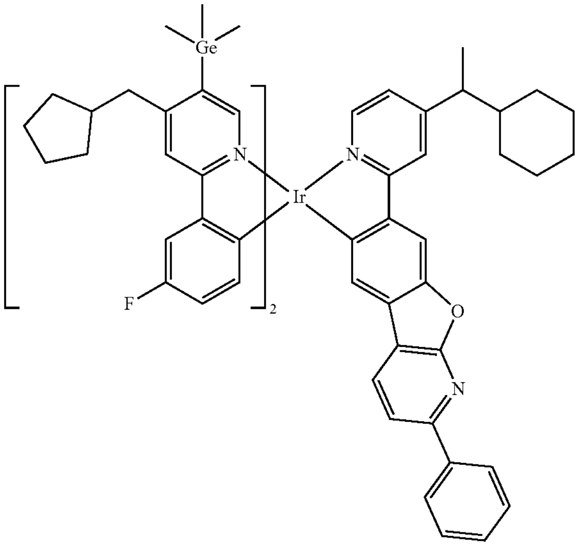
971
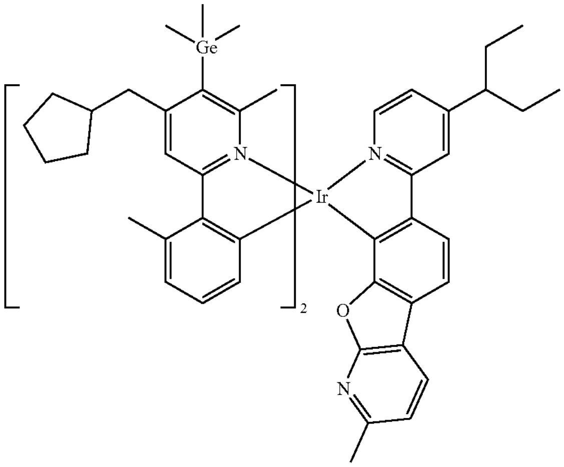
972
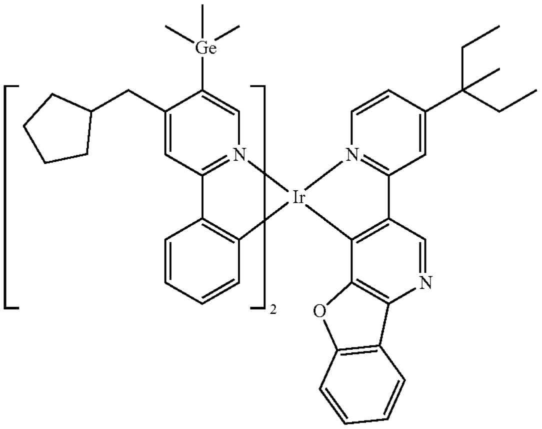
-continued
973
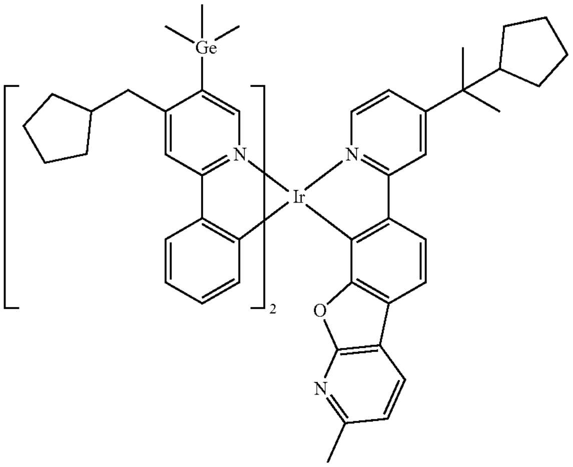
974
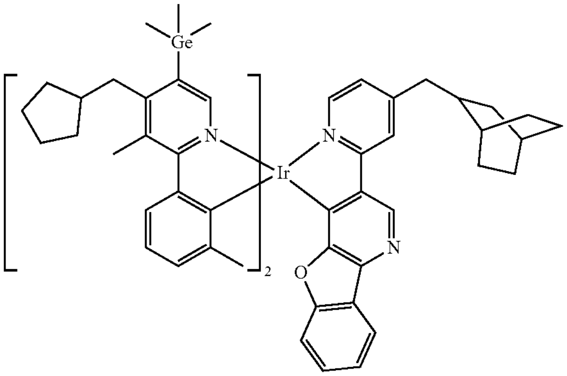
975
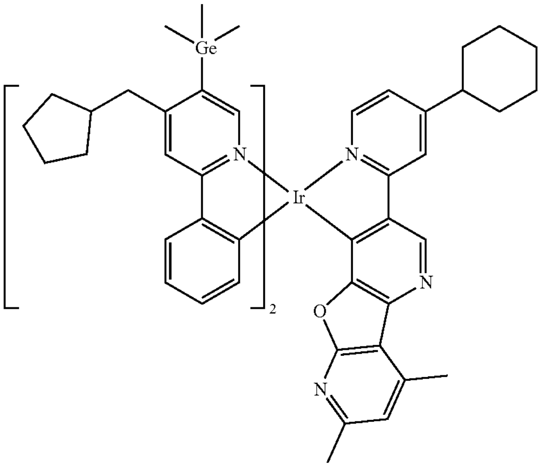

-continued
976
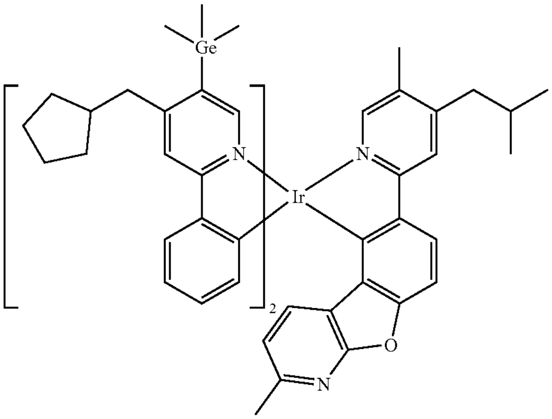
977
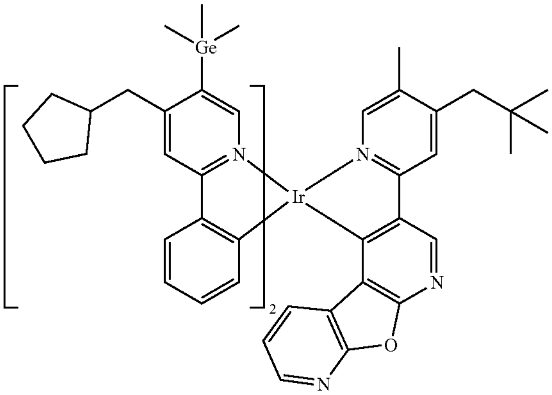
978
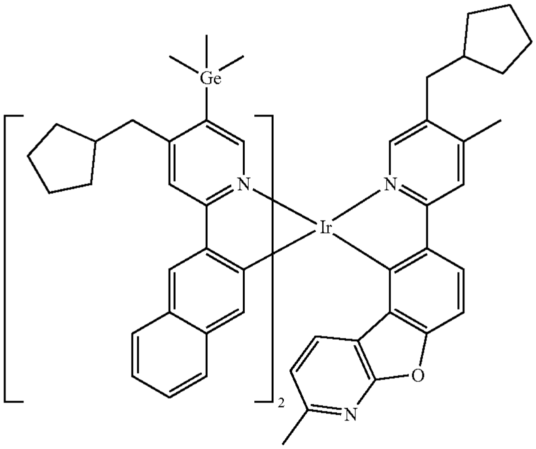
-continued
979
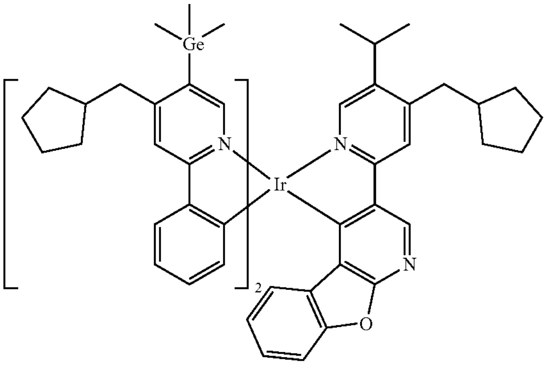
980
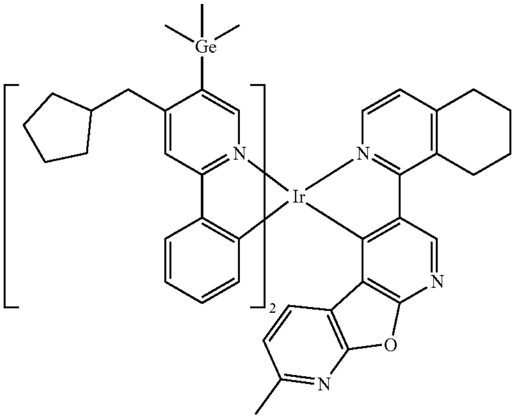
981
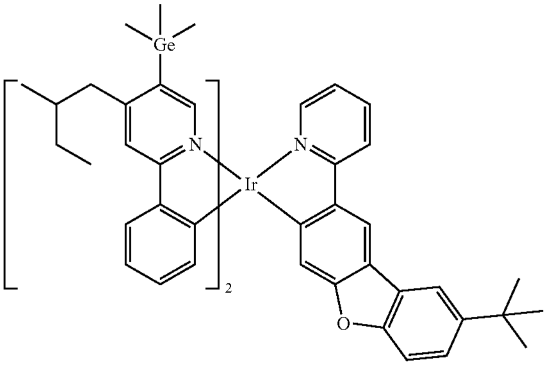
982
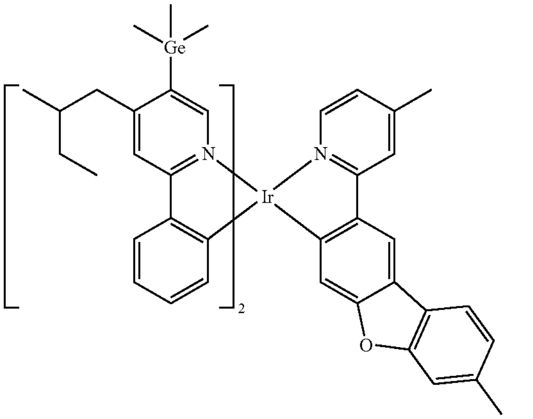

-continued
983
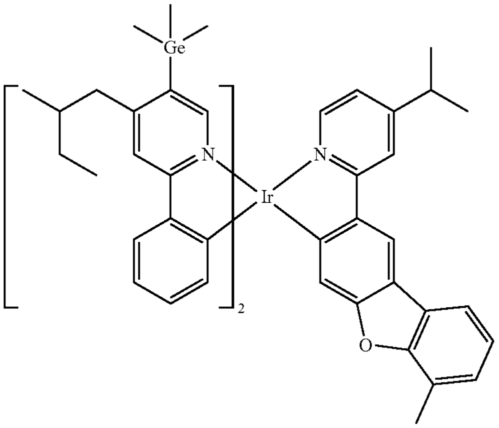
984
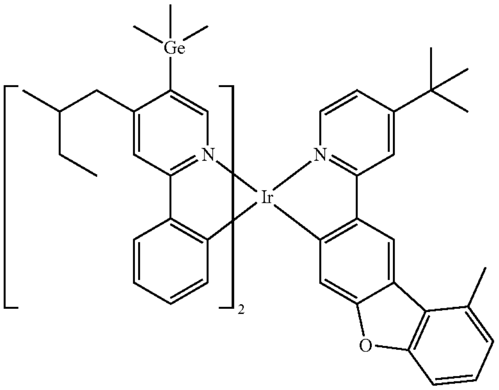
985
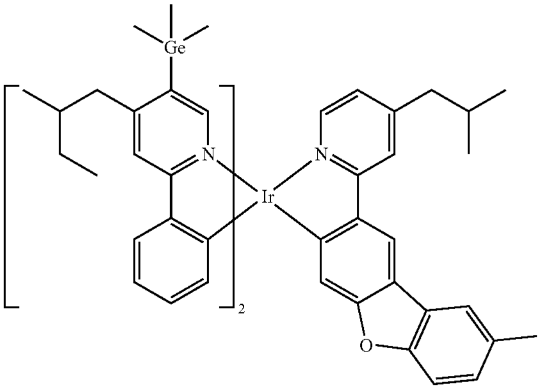
986
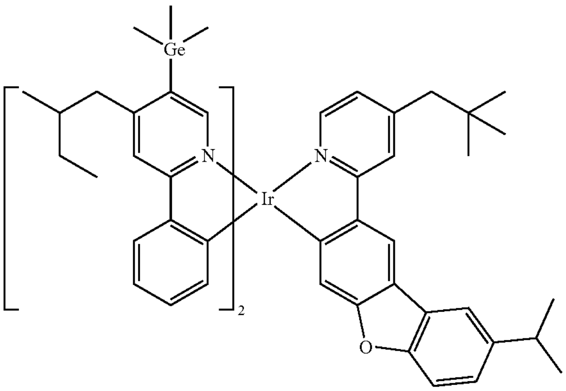
987
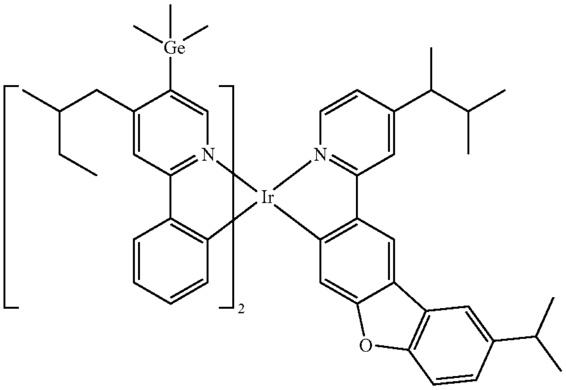
988
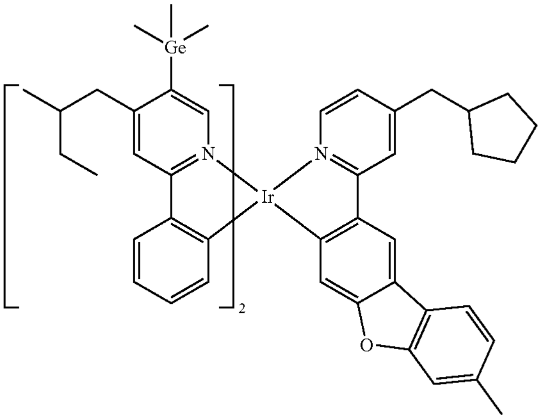
989
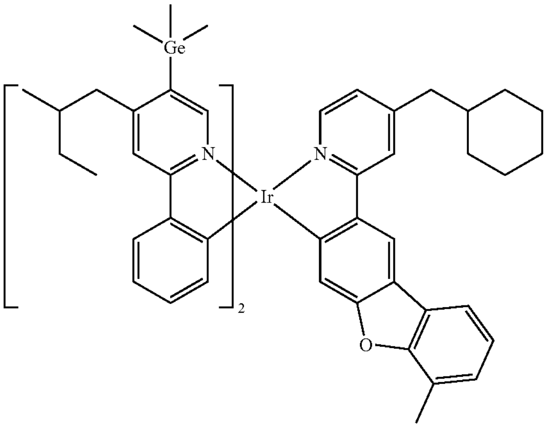

-continued
990
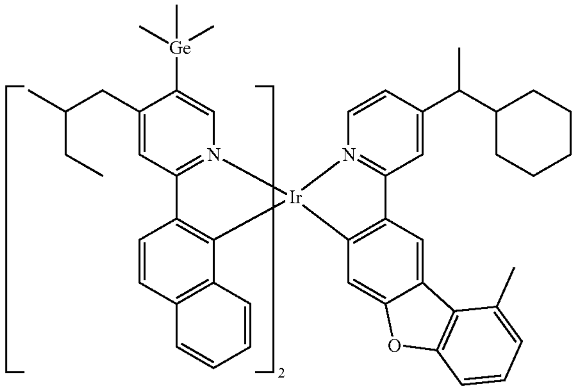
991
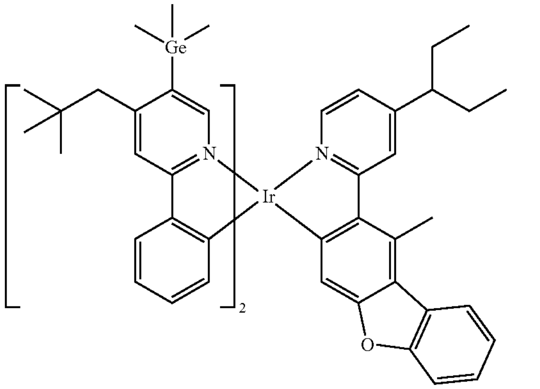
992
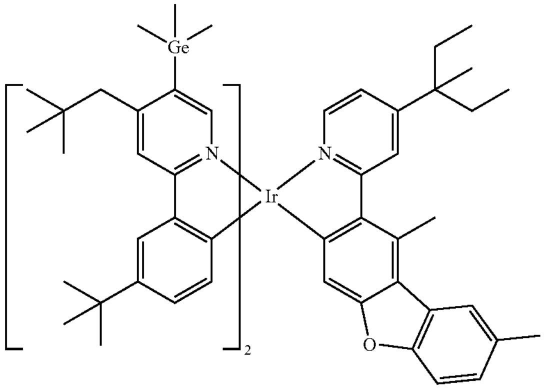
993
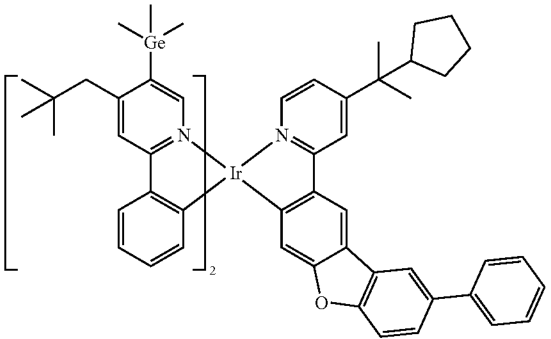
-continued
994
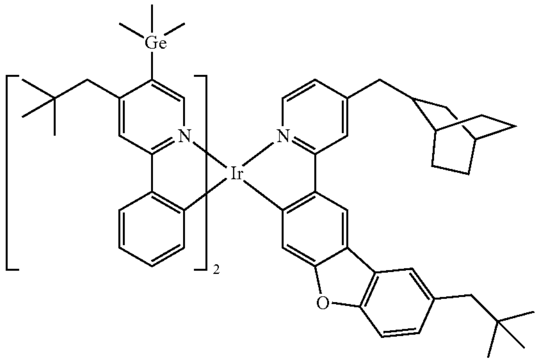
995
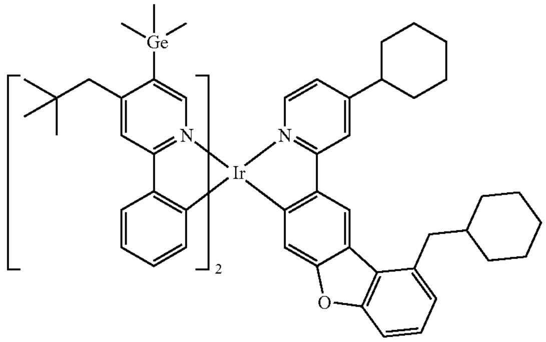
996
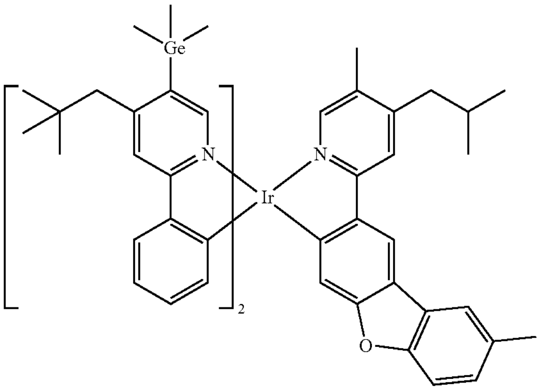
997
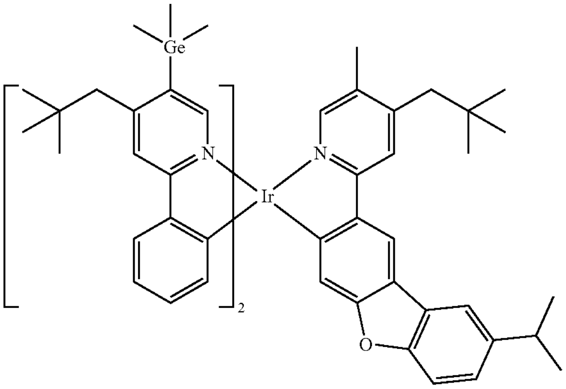

-continued
998
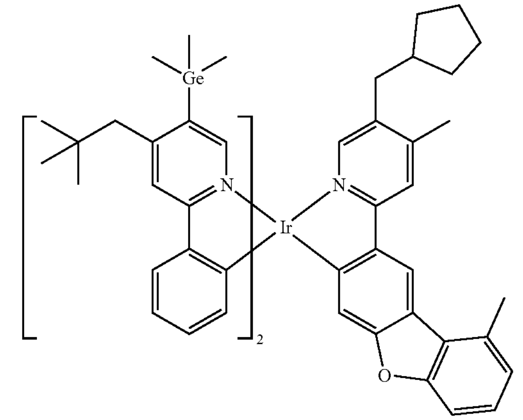
999
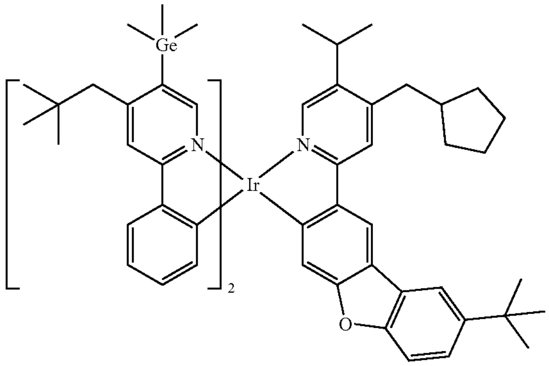
1000
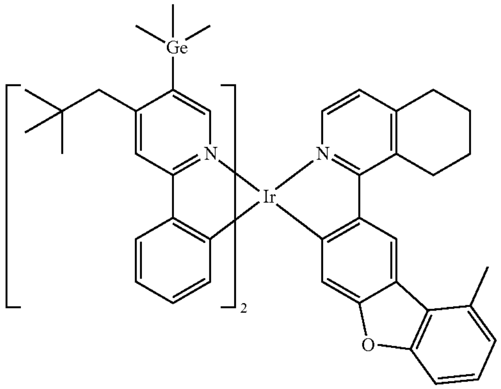
1001
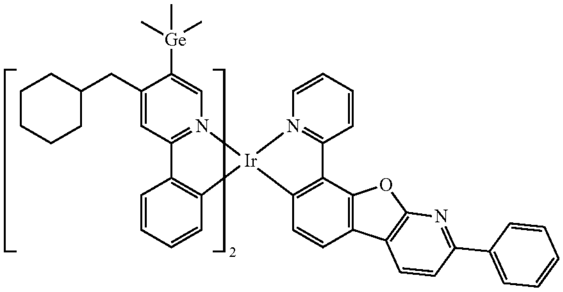
-continued
1002
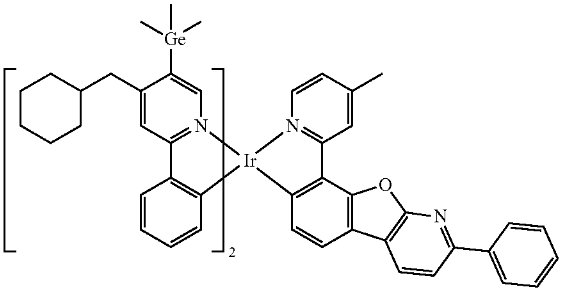
1003
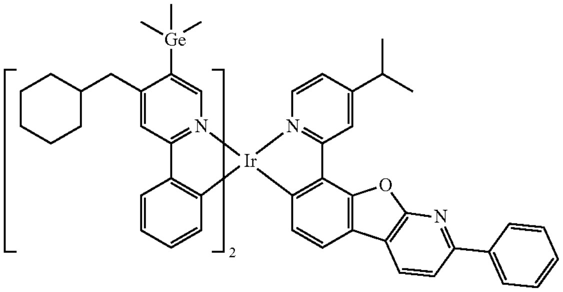
1004
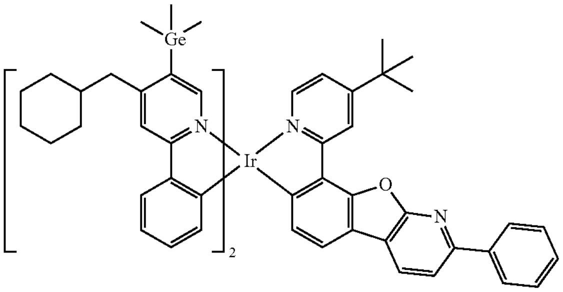
1005
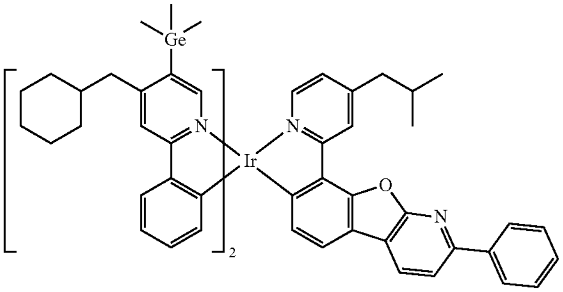
1006
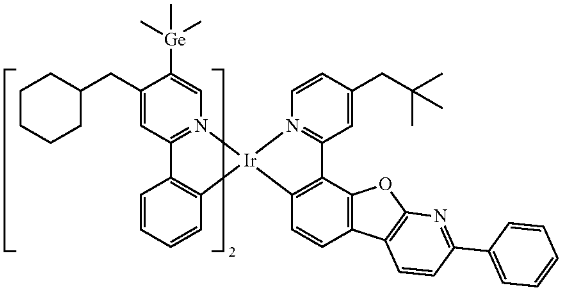

-continued
1007
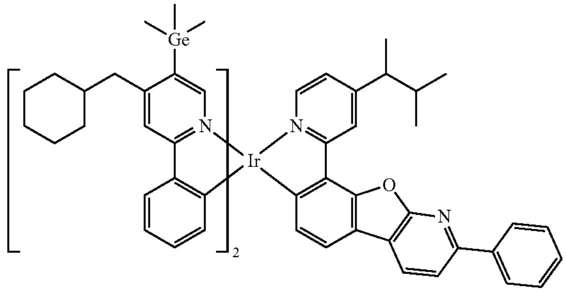
1008
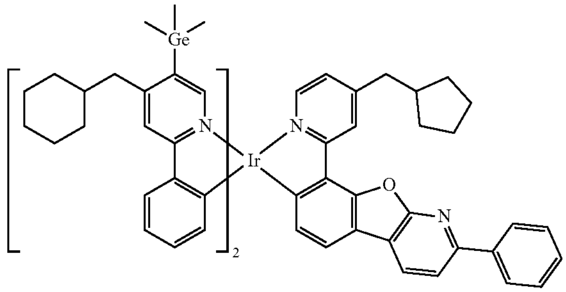
1009
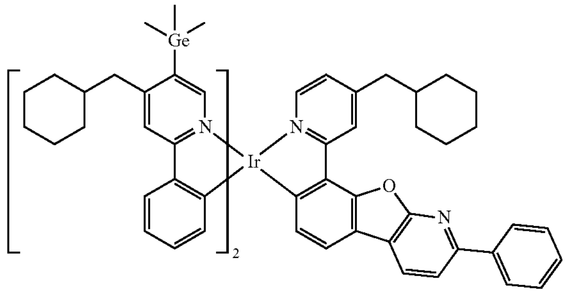
1010
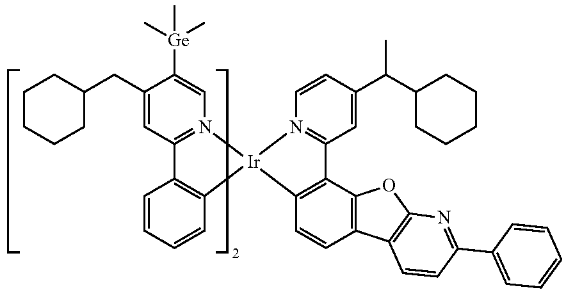
1011
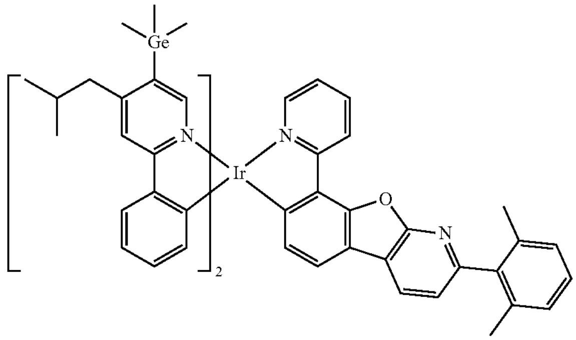
-continued
1012
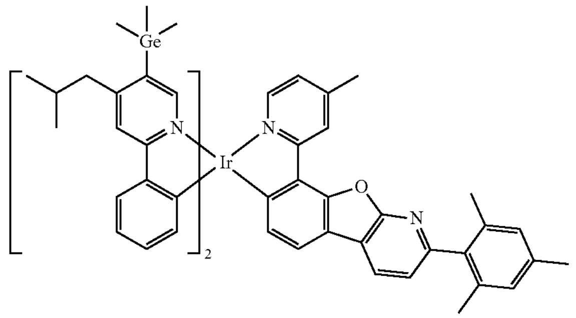
1013
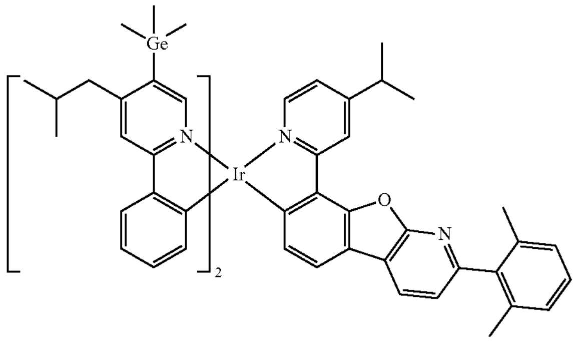
1014
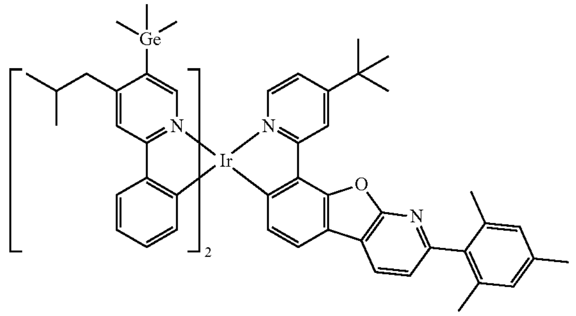
1015
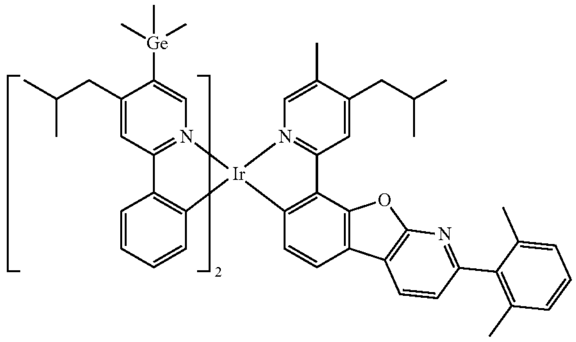

-continued
1016
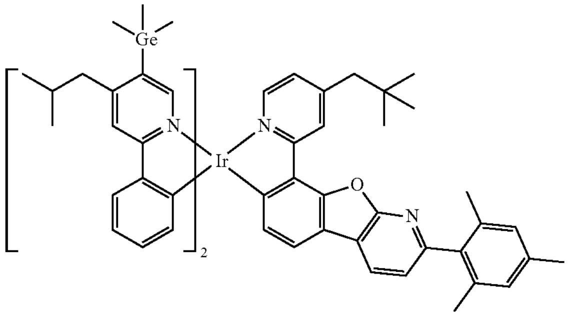
1017
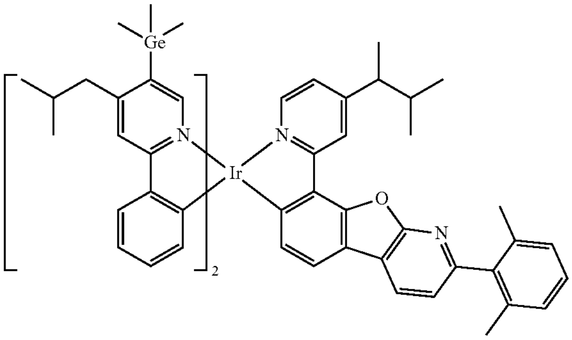
1018
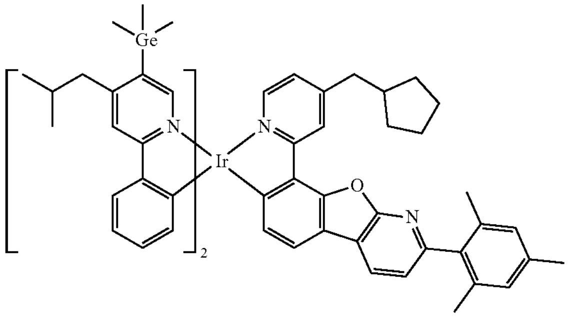
1019
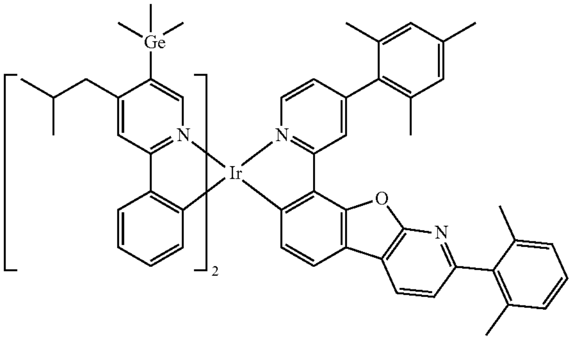
-continued
1020
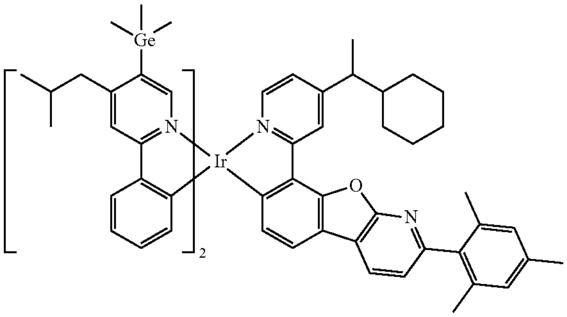
1021
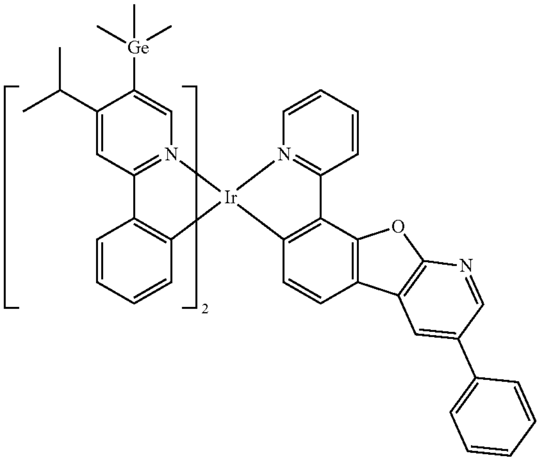
1022
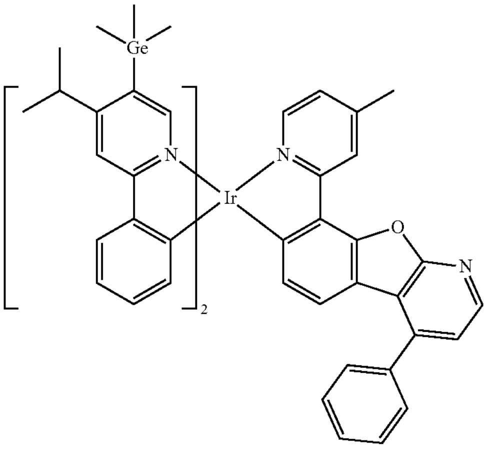

-continued
1023
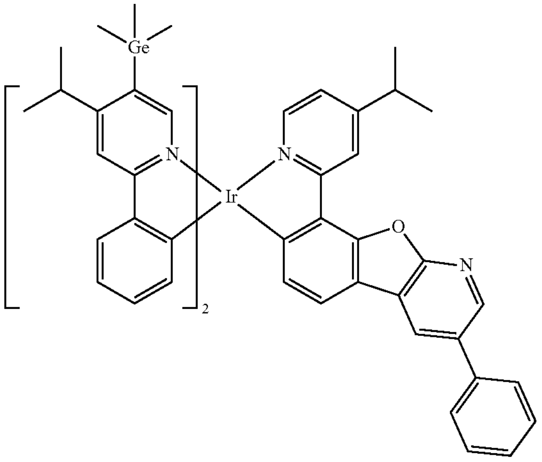
1024
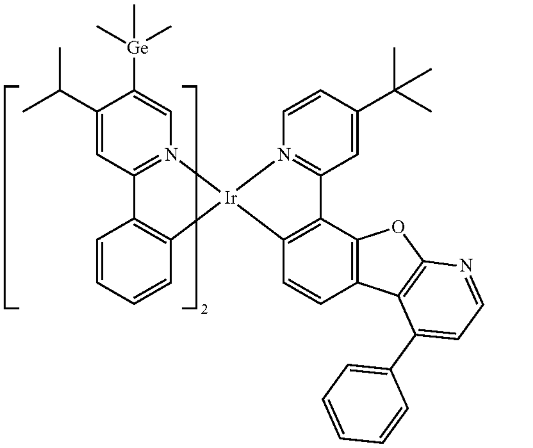
1025
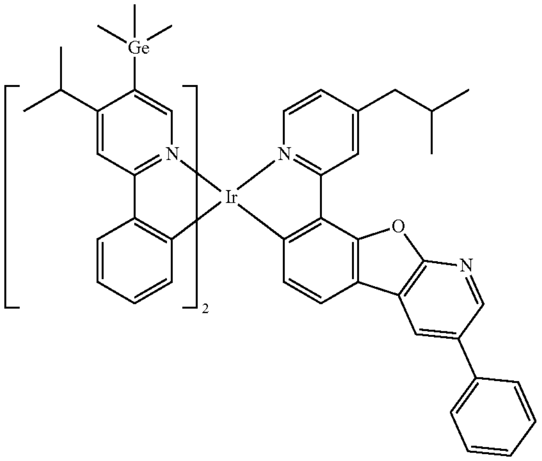
-continued
1026
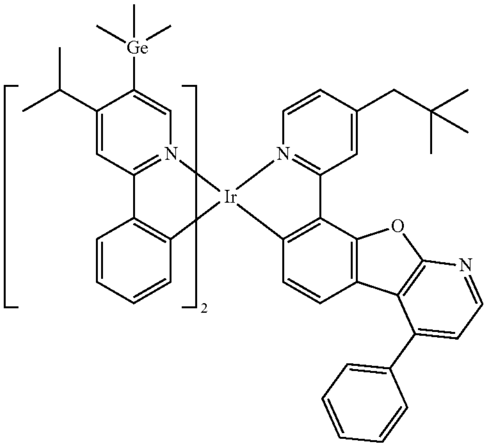
1027
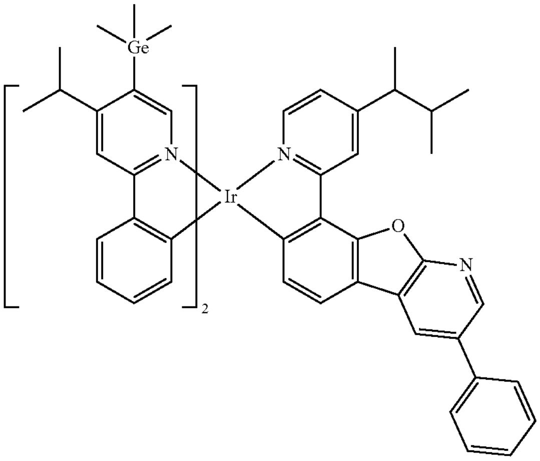
1028
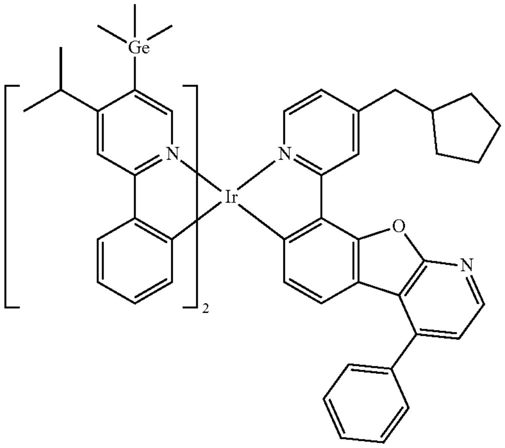

-continued
1029
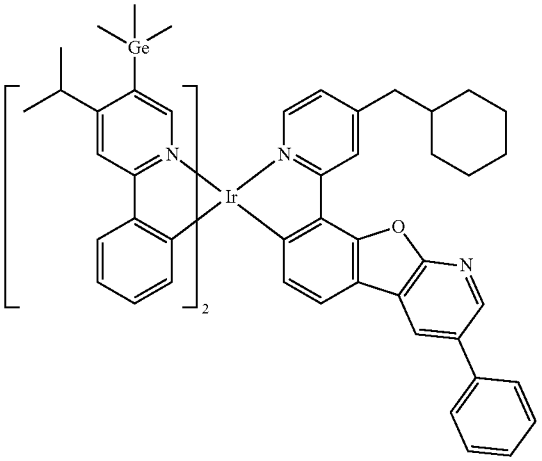
1030
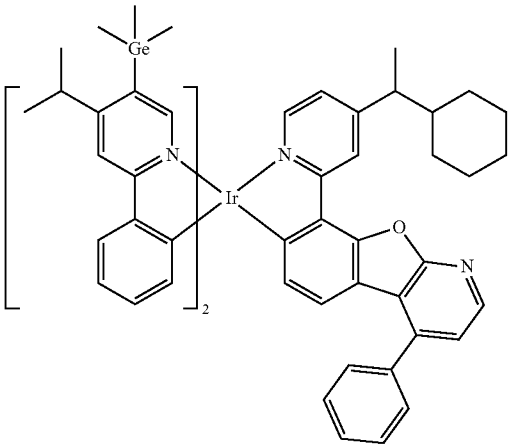
1031
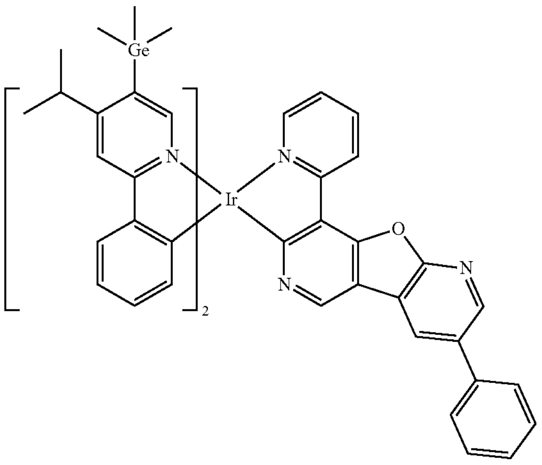
-continued
1032
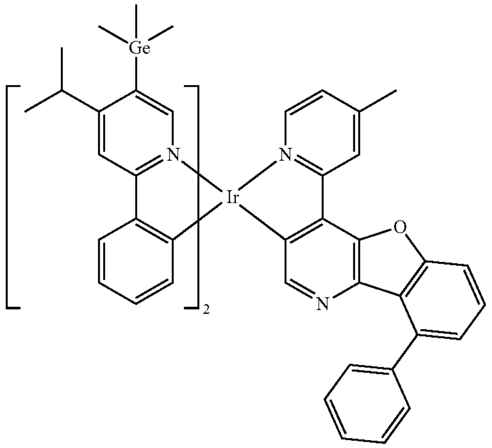
1033
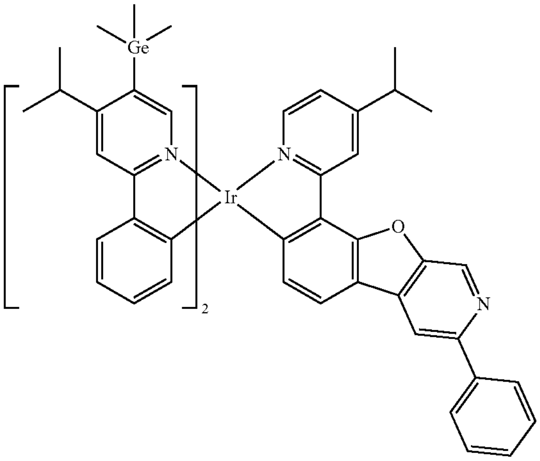
1034
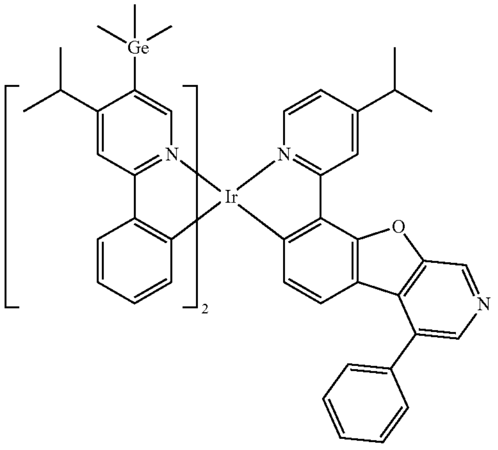

-continued
1035
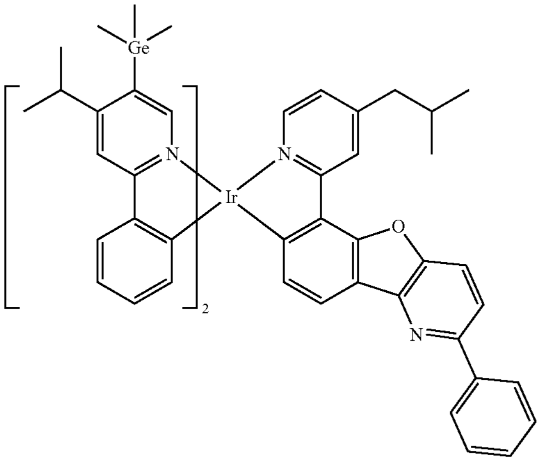
1036
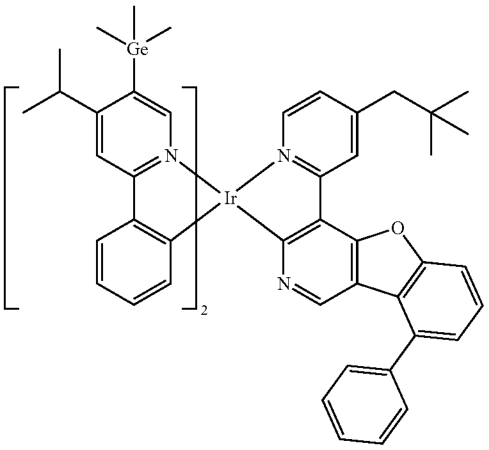
1037
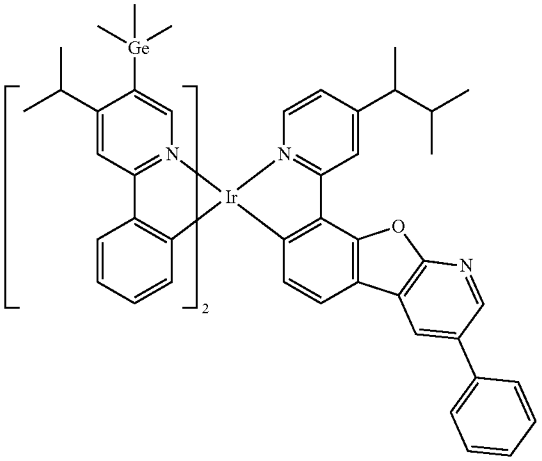
-continued
1038
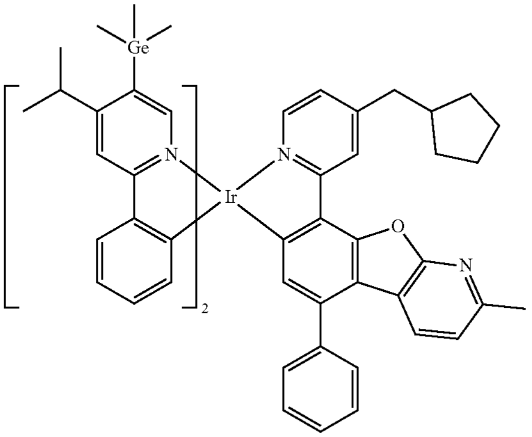
1039
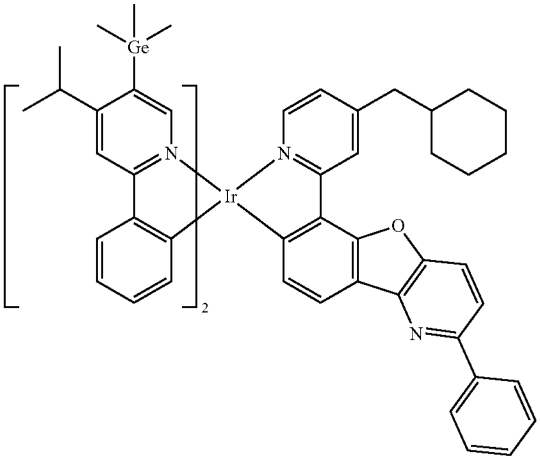
1040
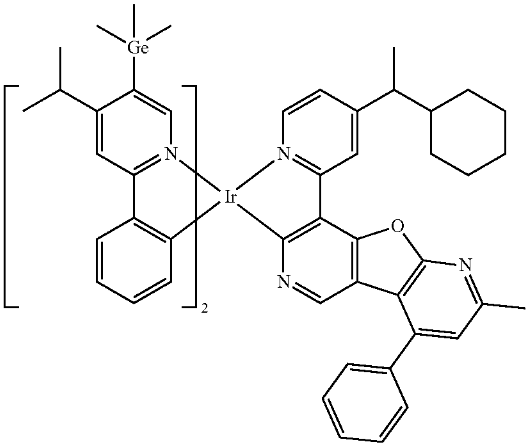

-continued
1041
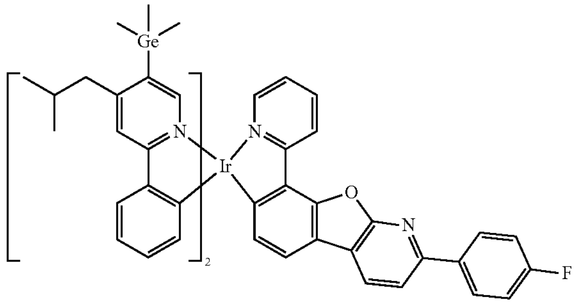
1042
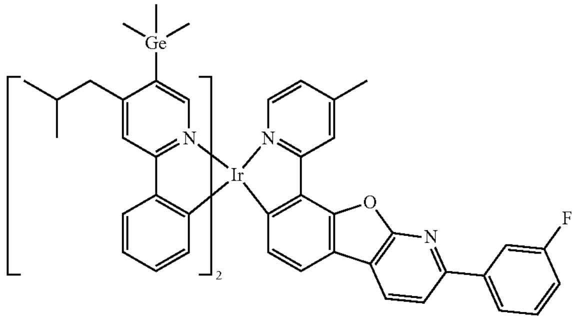
1043
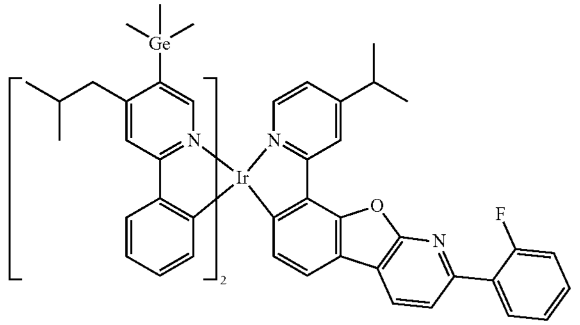
1044
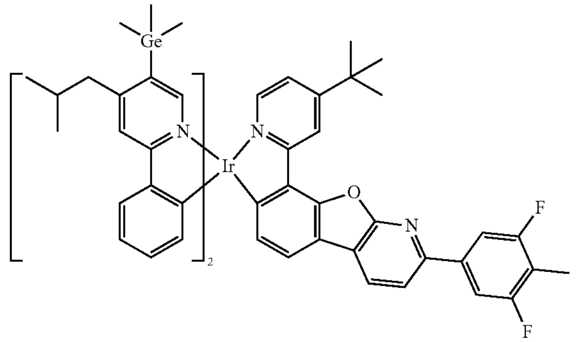
1045
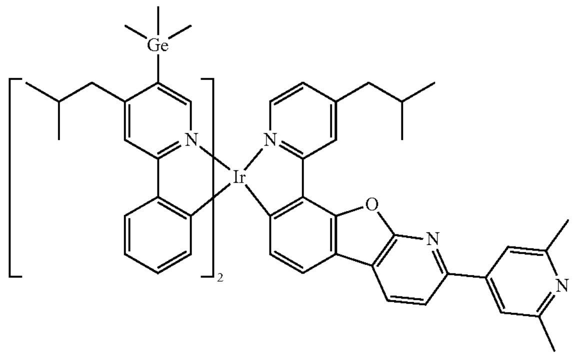
1046
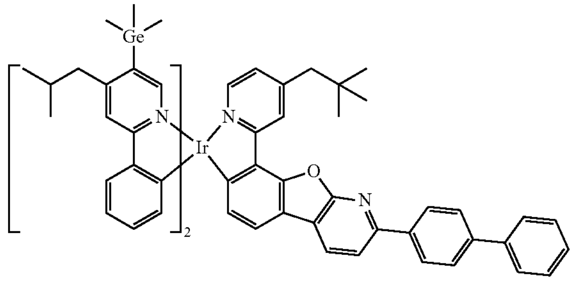
1047
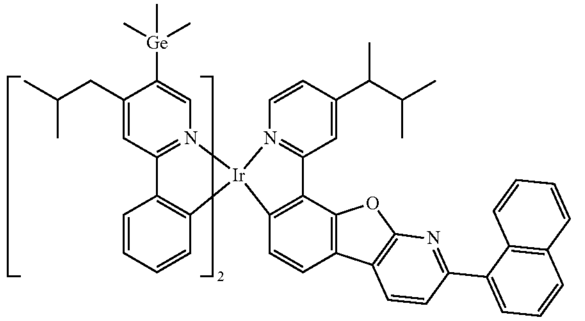
1048
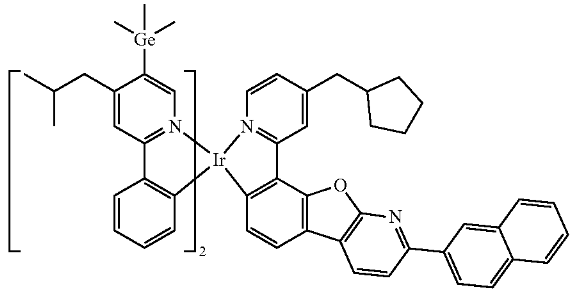

-continued
1049
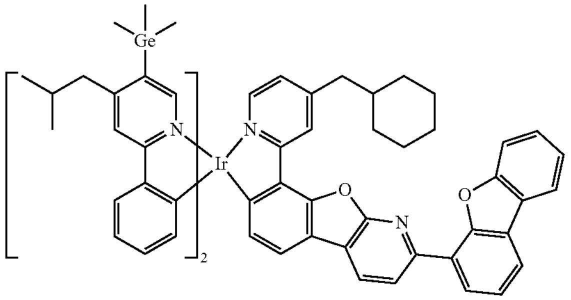
1050
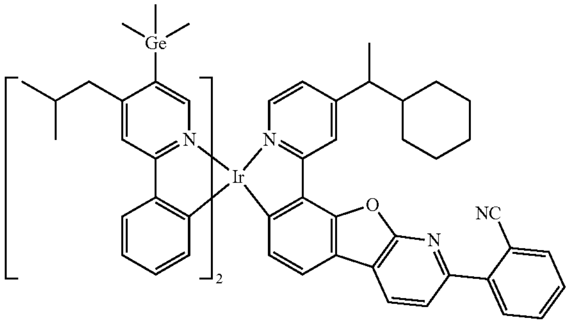
1051
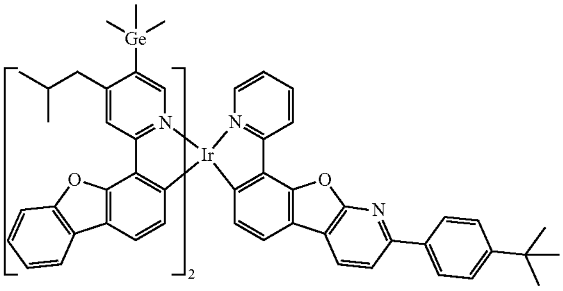
1052
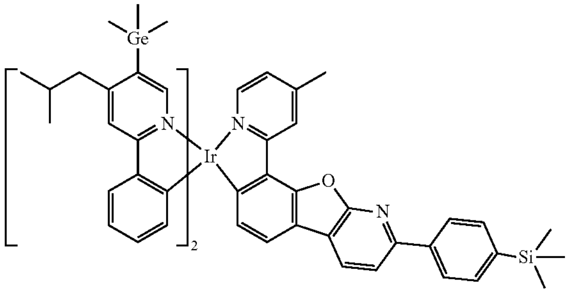
-continued
1053
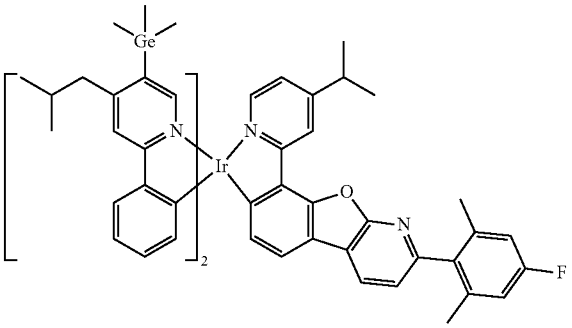
1054
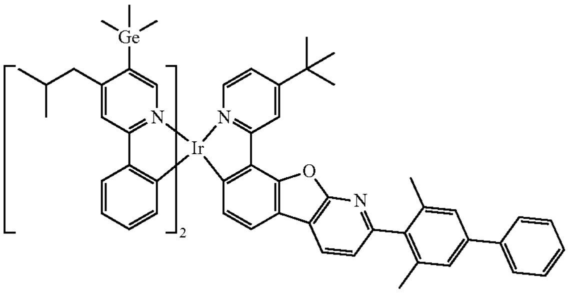
1055
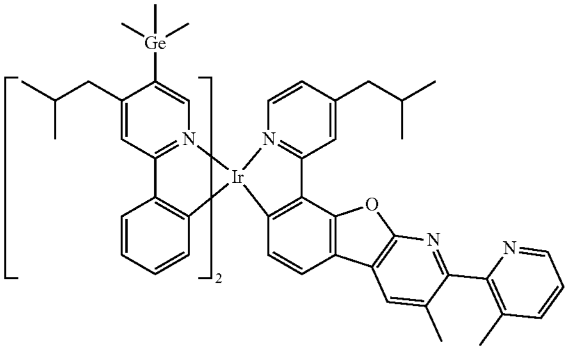
1056
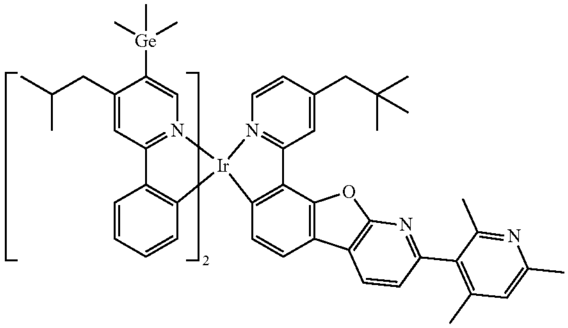

-continued
1057
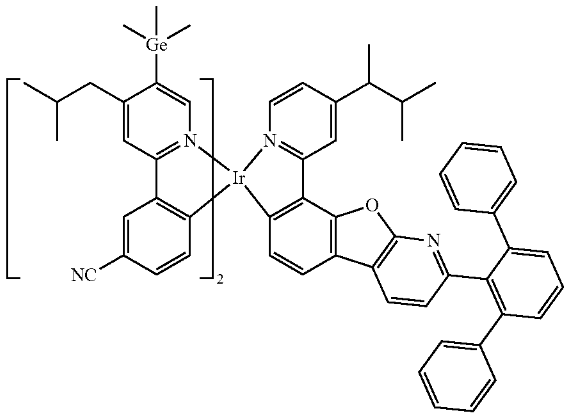
1058
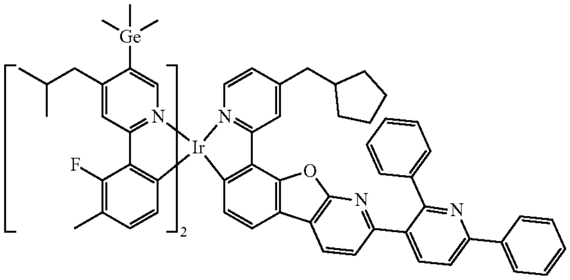
1059
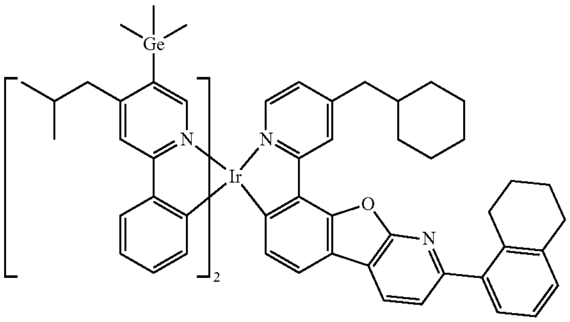
1060
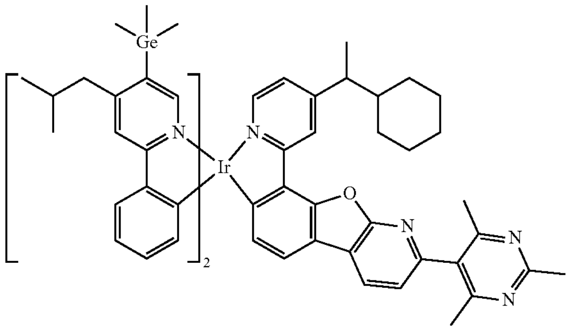
-continued
1061
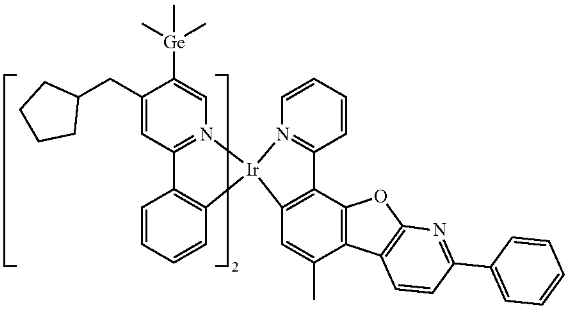
1062
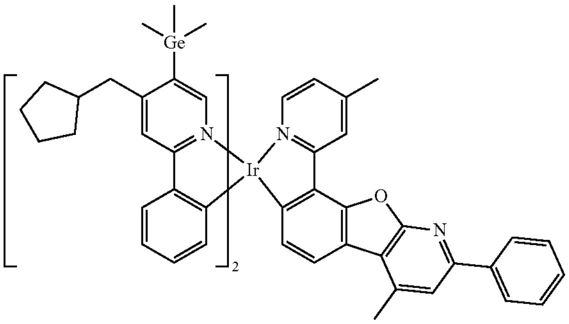
1063
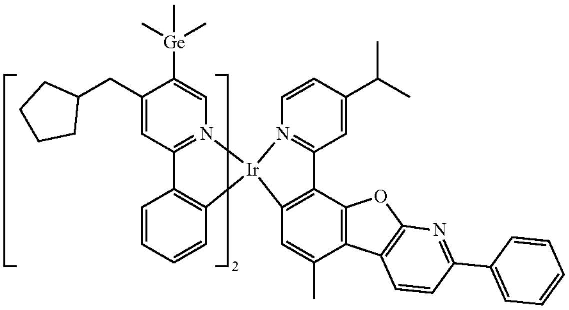
1064
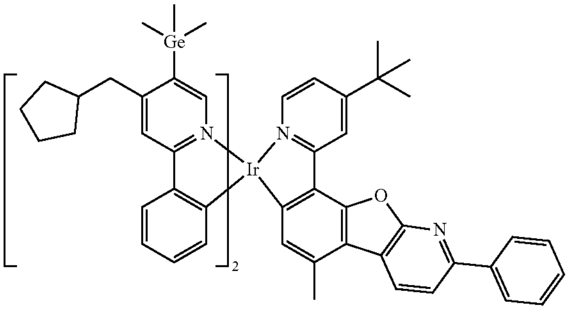

1065
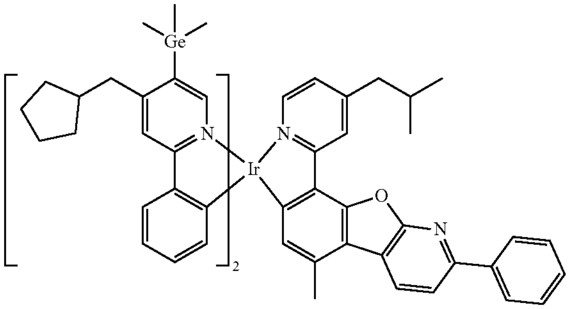
1066
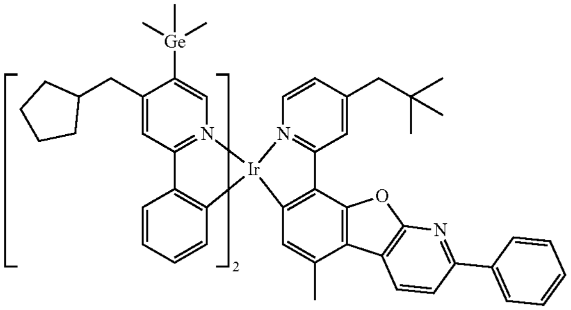
1067
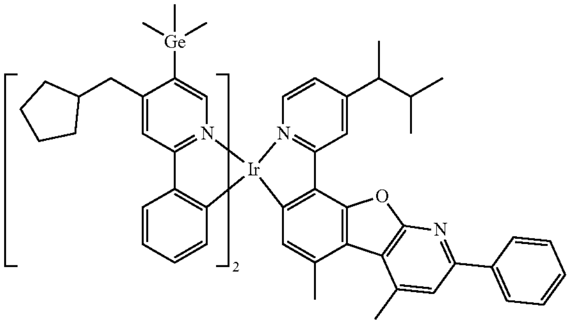
1068
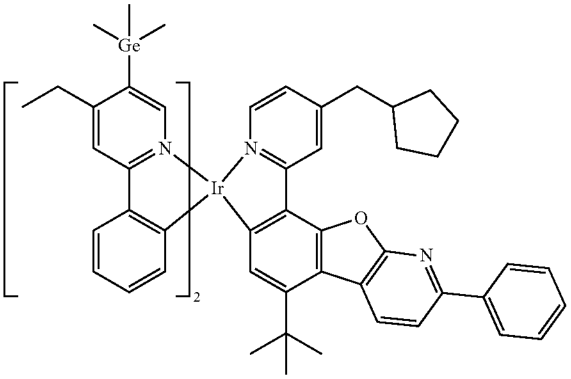
1069
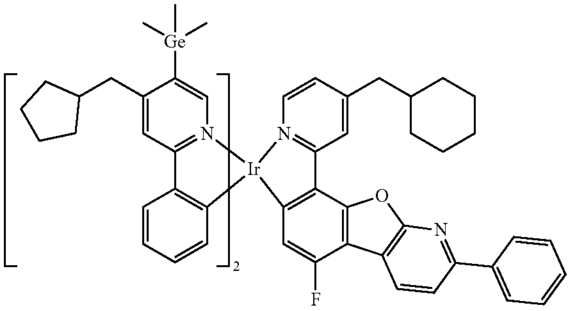
1070
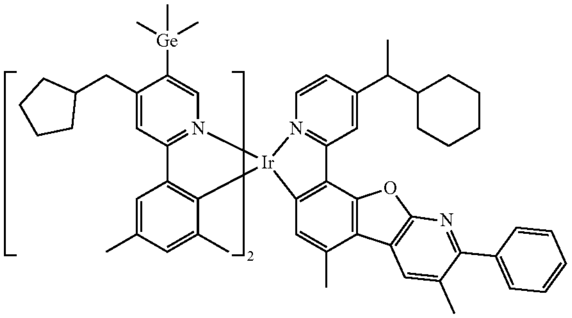
1071
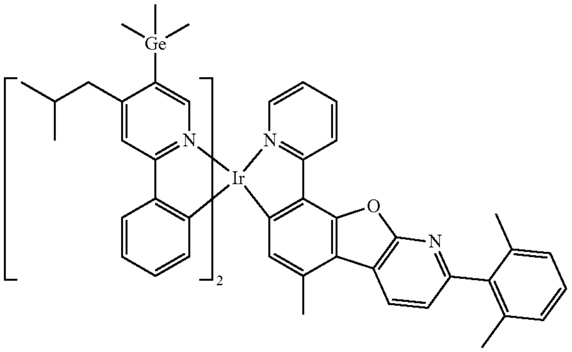
1072
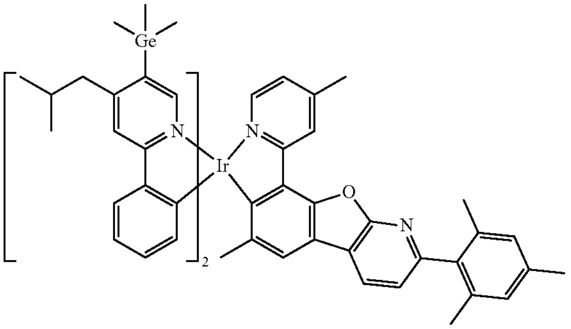

-continued
1073
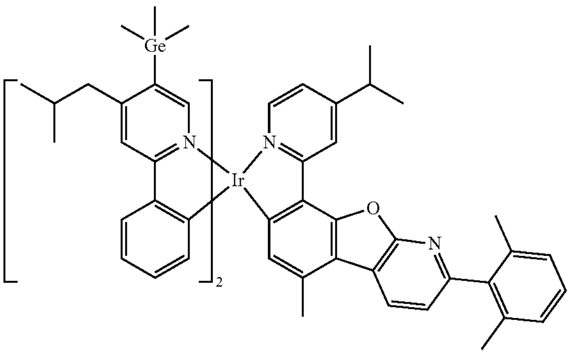
1074
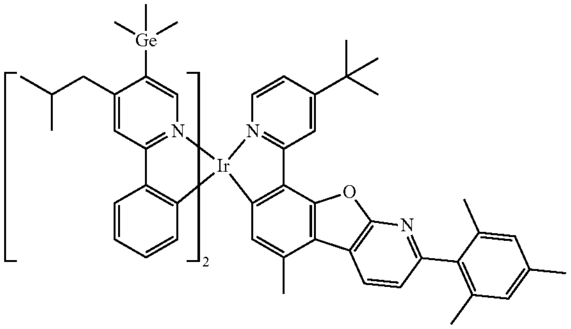
1075
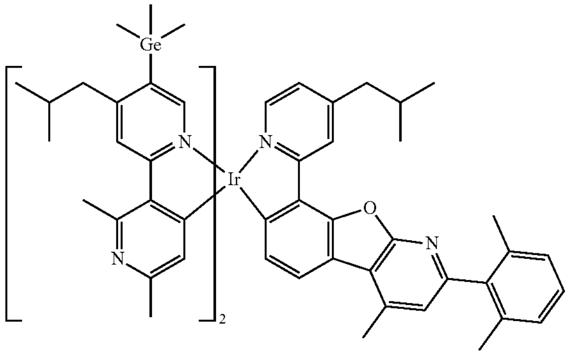
1076
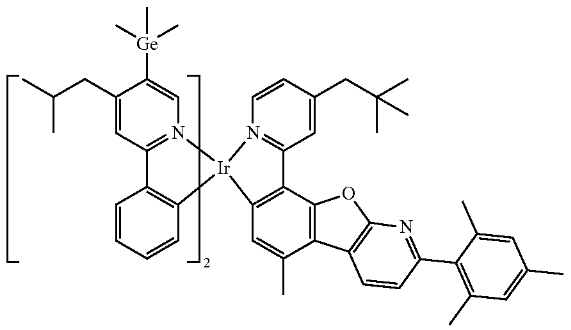
-continued
1077
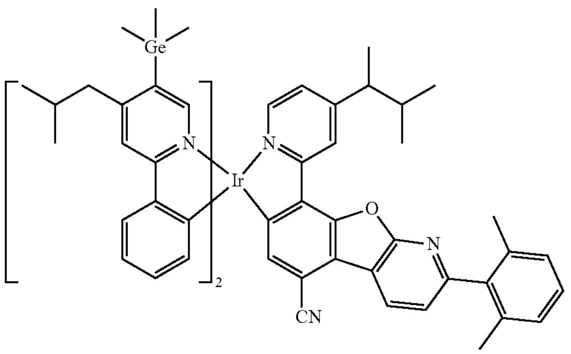
1078
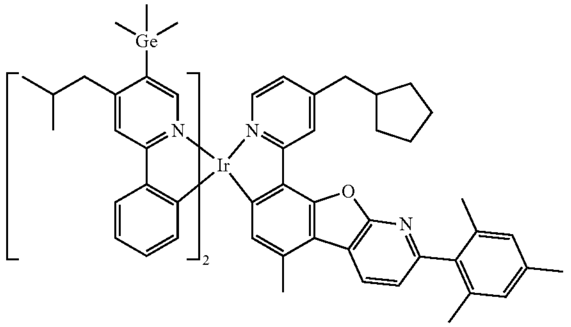
1079
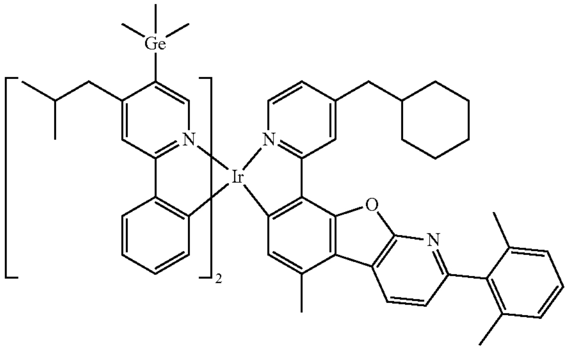
1080
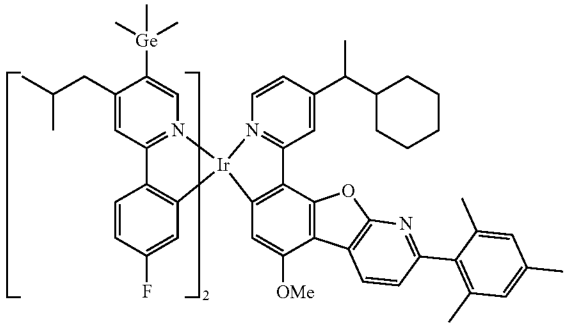

-continued
1081
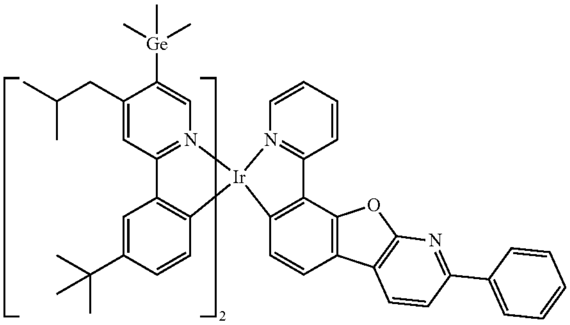
1082
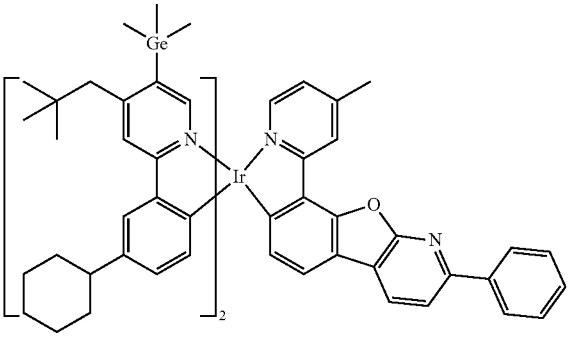
1083
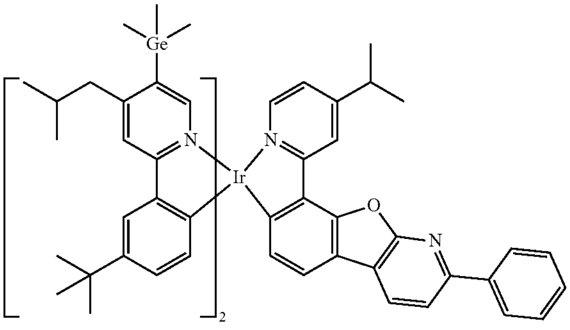
1084
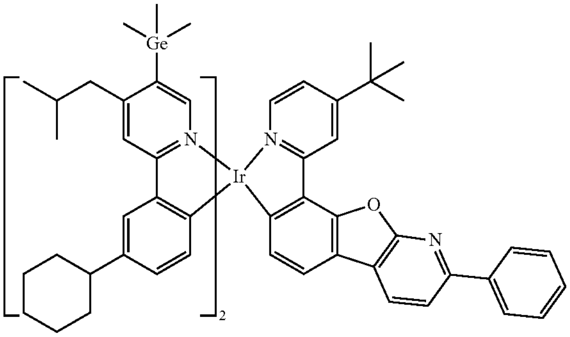
-continued
1085
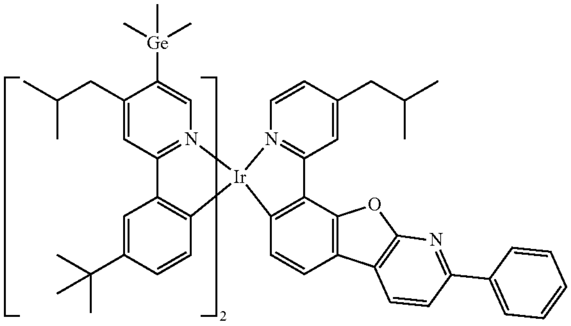
1086
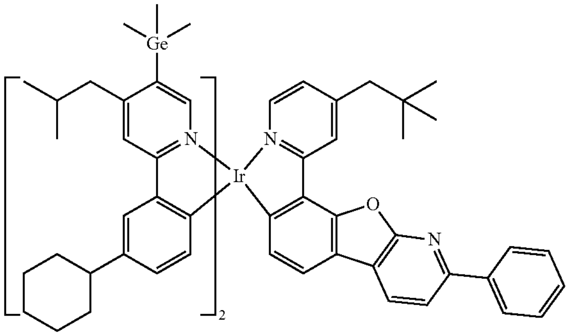
1087
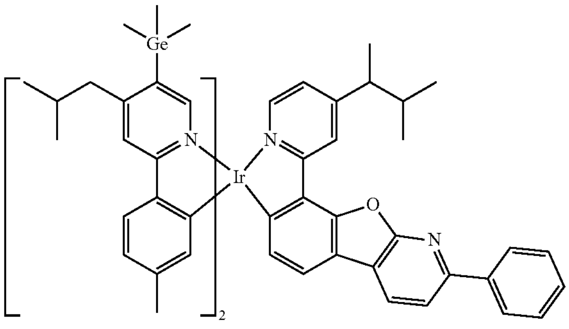
1088
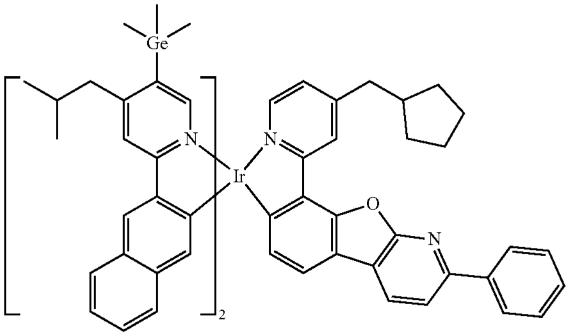

-continued
1089
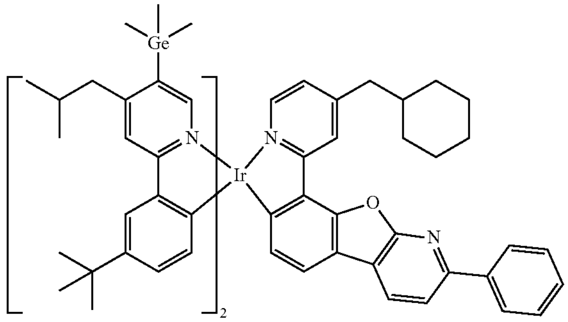
1090
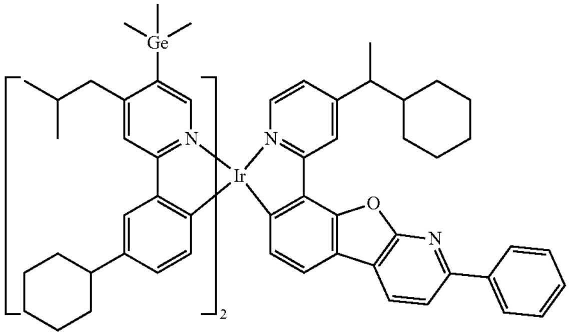
1091
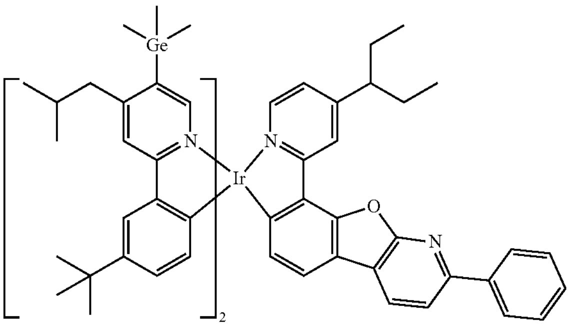
1092
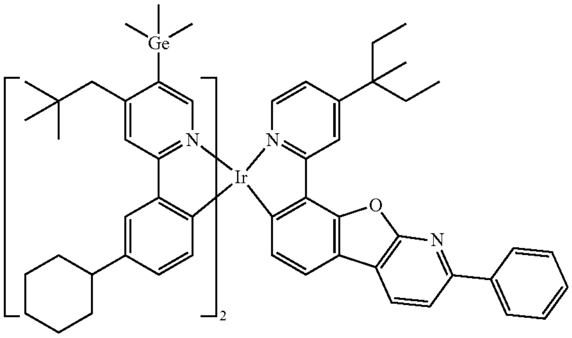
-continued
1093
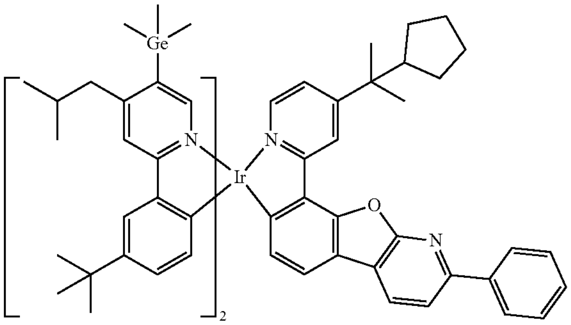
1094
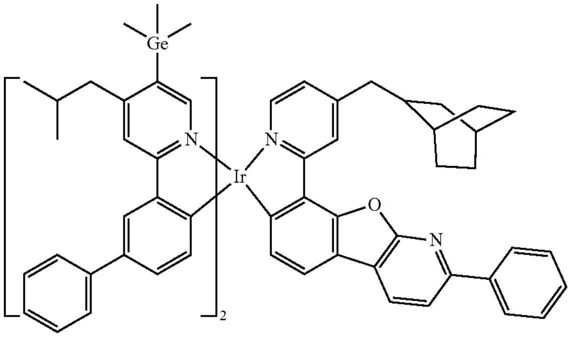
1095
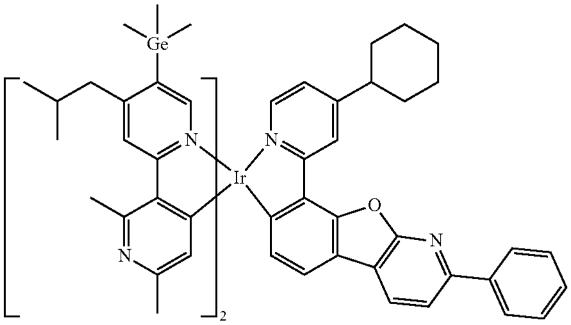
1096
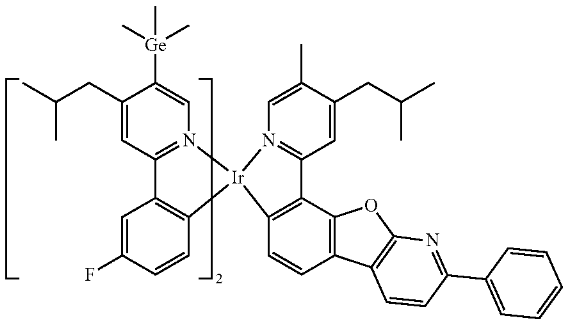

-continued
1097
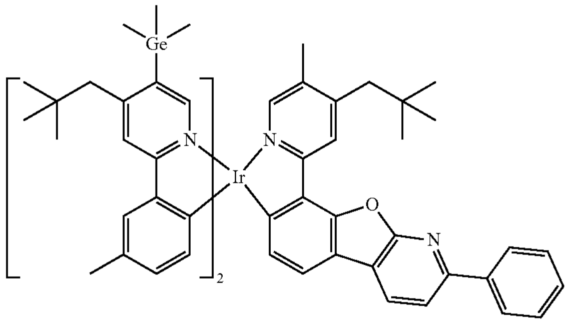
1098
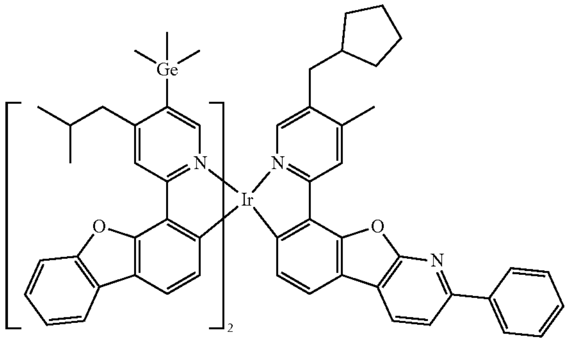
1099
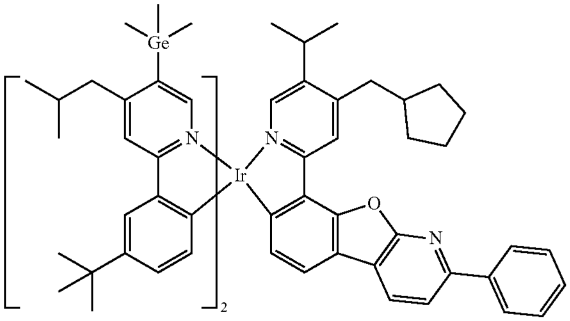
1100
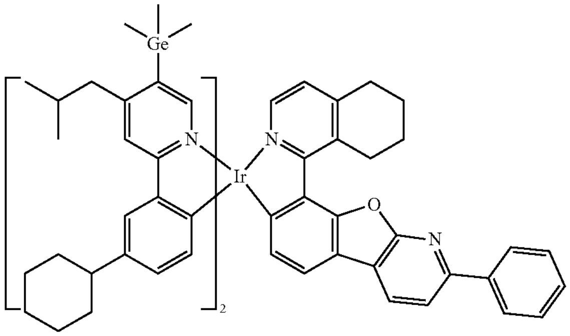
-continued
1101
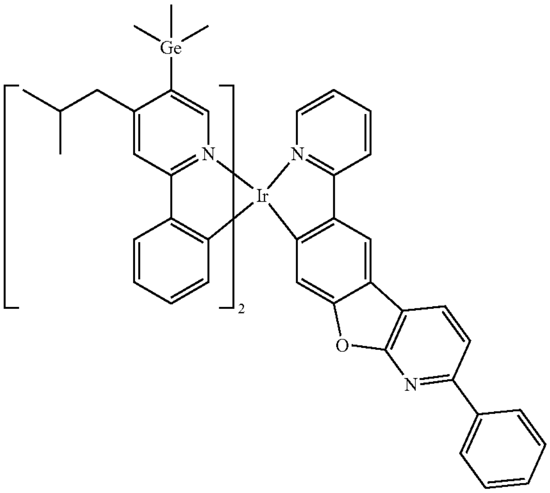
1102
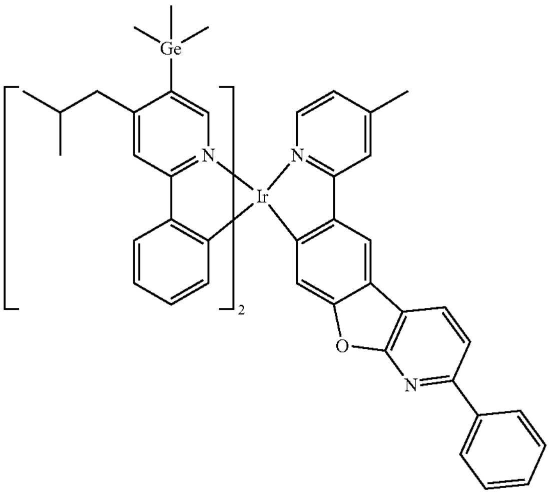
1103
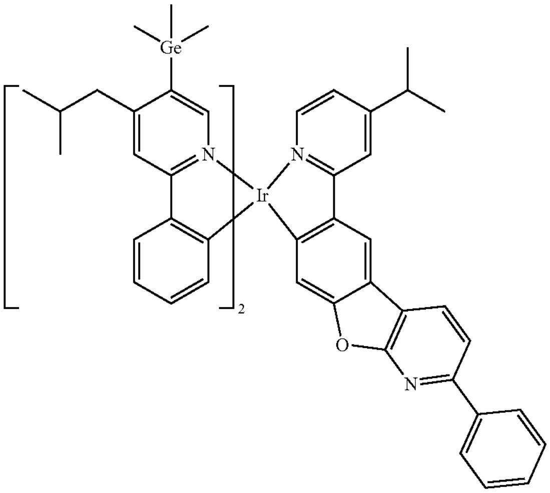

1104
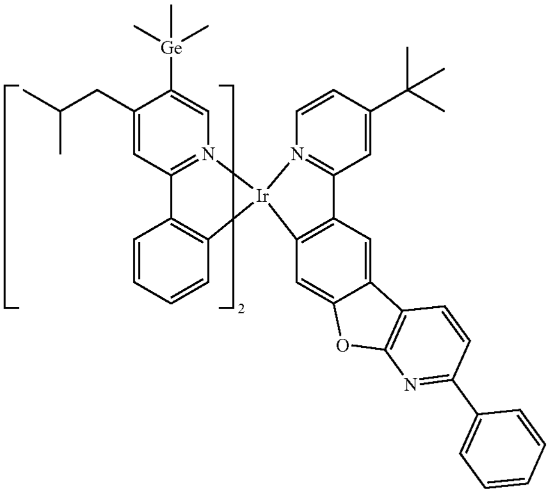
1105
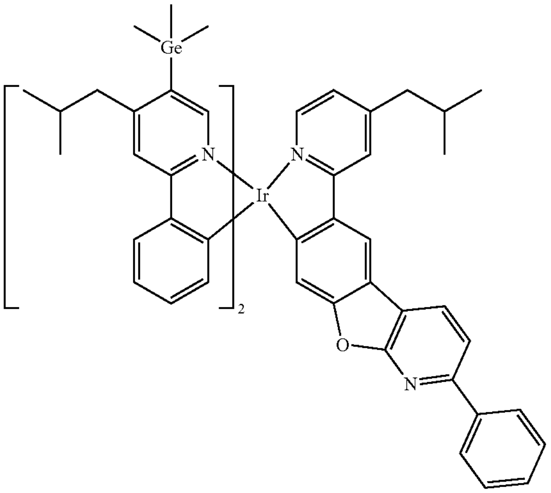
1106
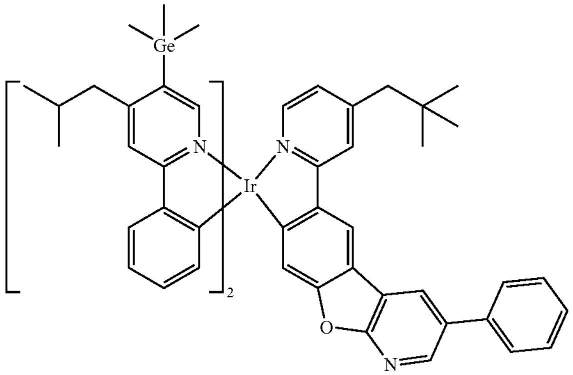
1107
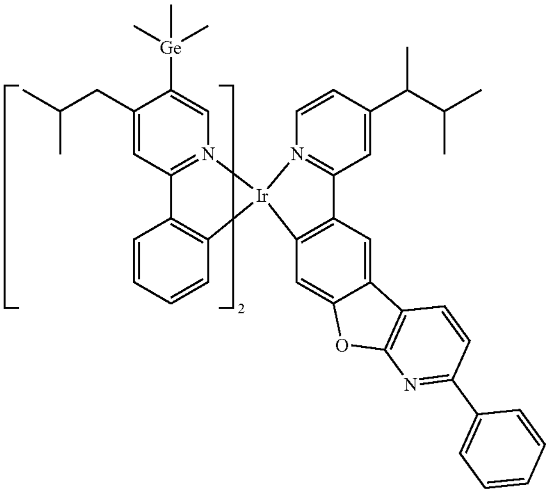
1108
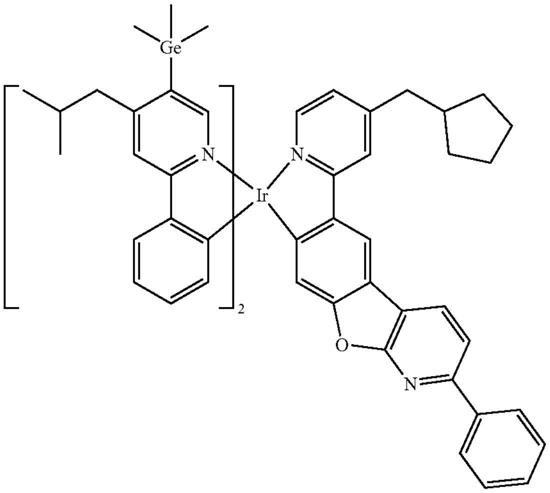
1109
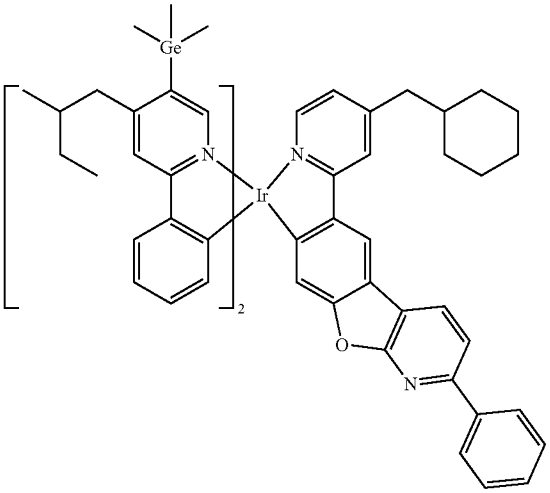

-continued
1110
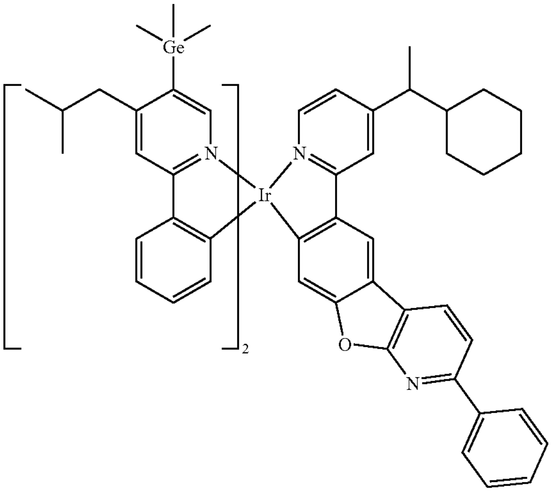
1111
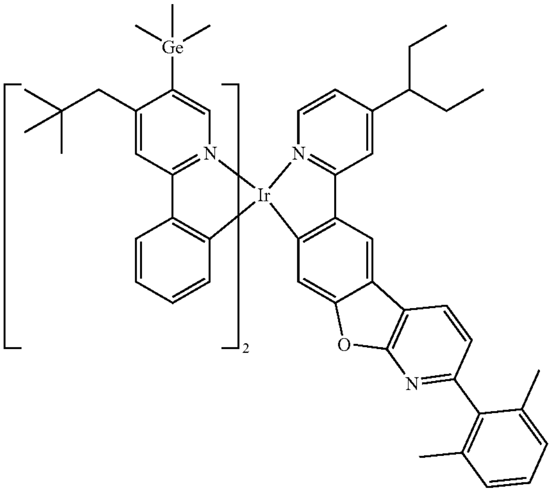
1112
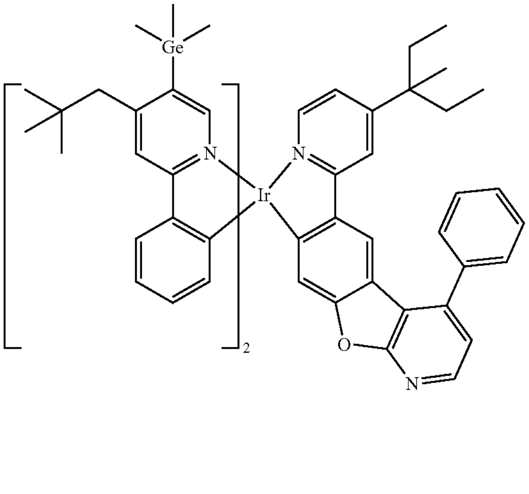
-continued
1113
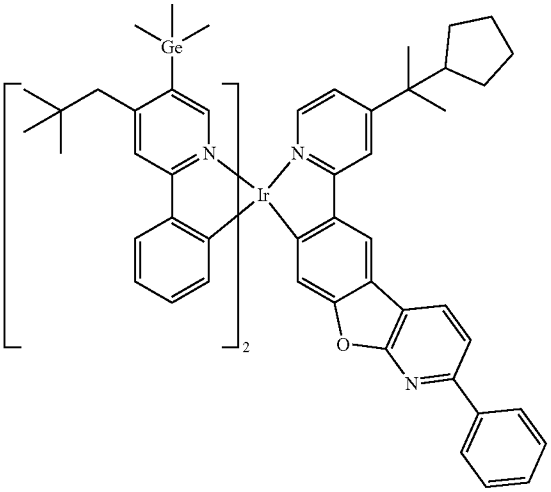
1114
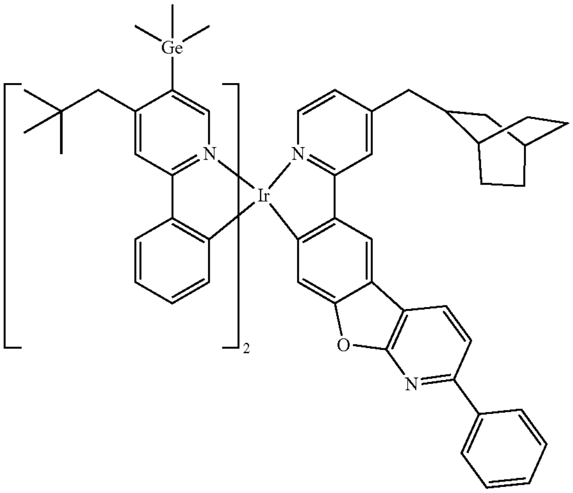
1115
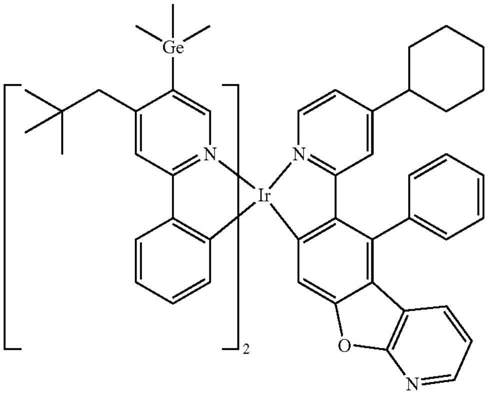

-continued
1116
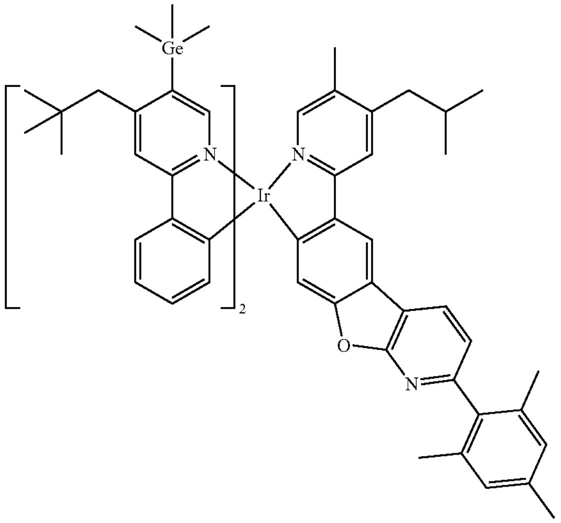
1117
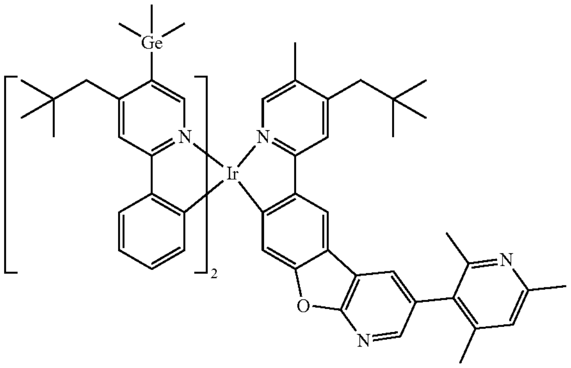
1118
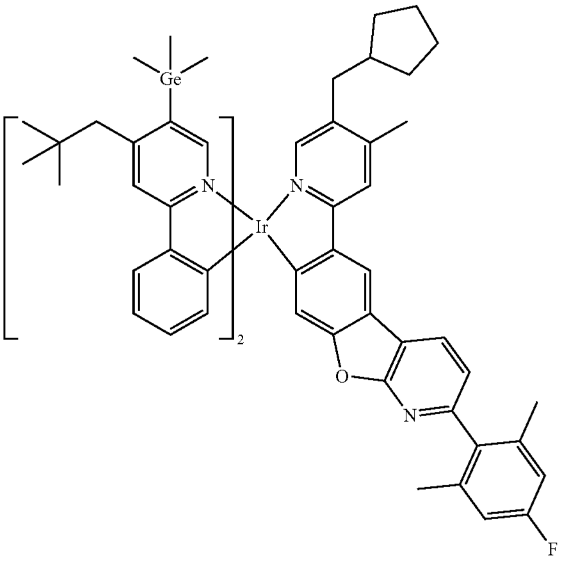
-continued
1119
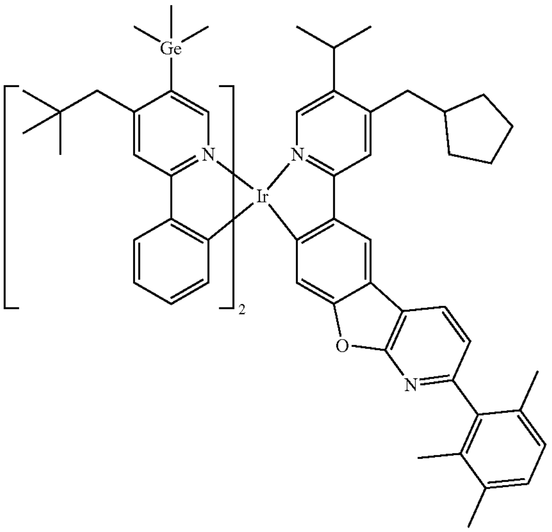
1120
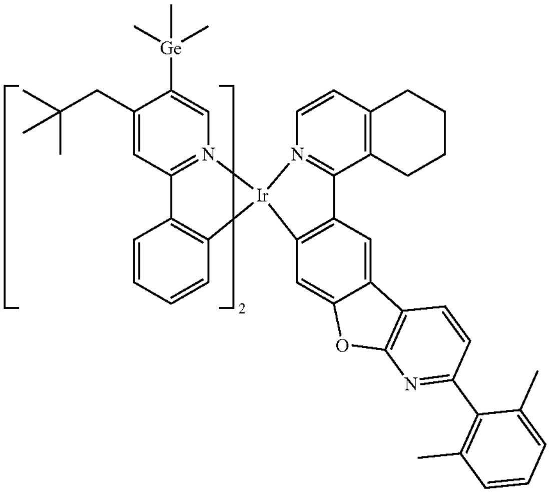
1121
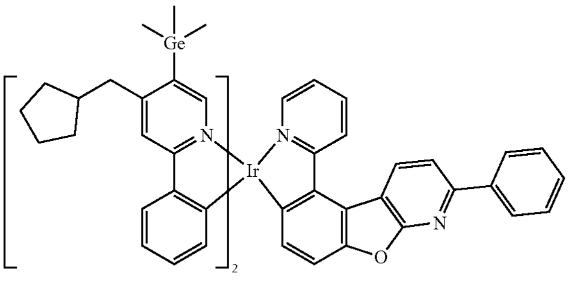

-continued
1122
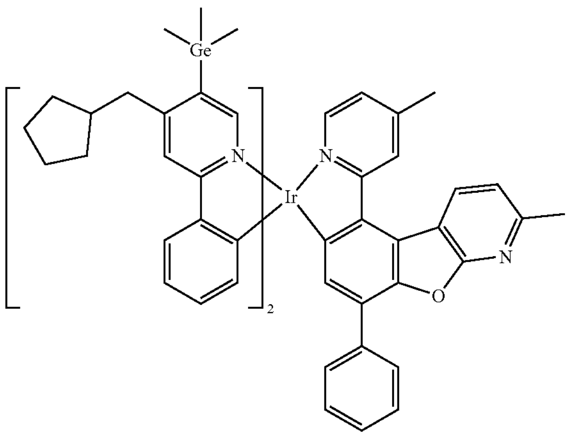
1123
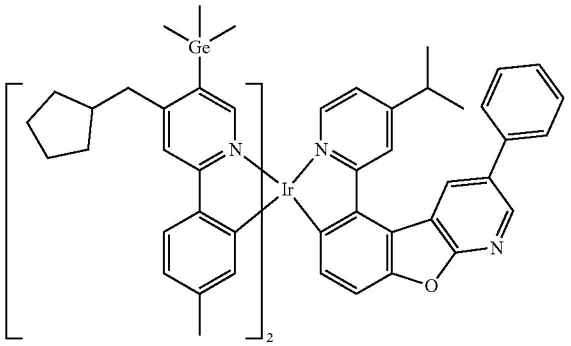
1124
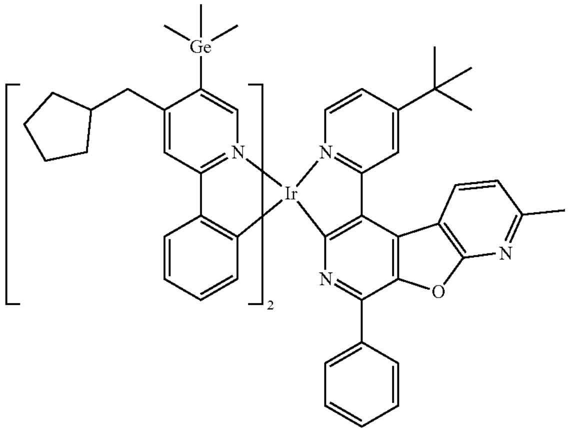
1125
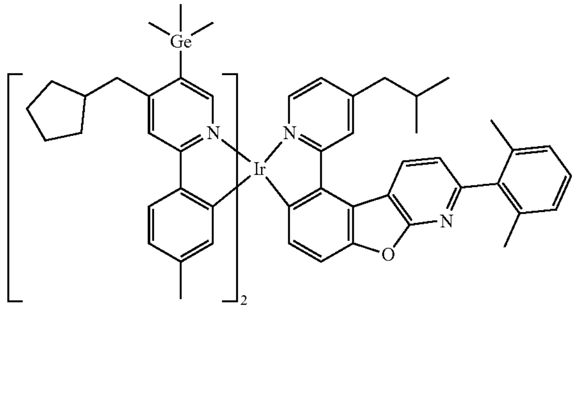
-continued
1126
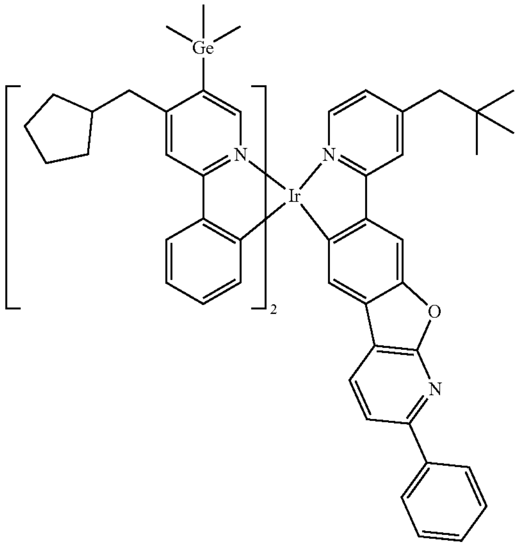
1127
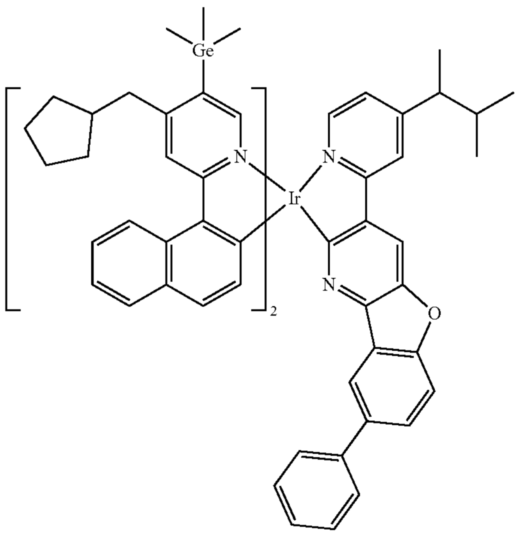

-continued
1128
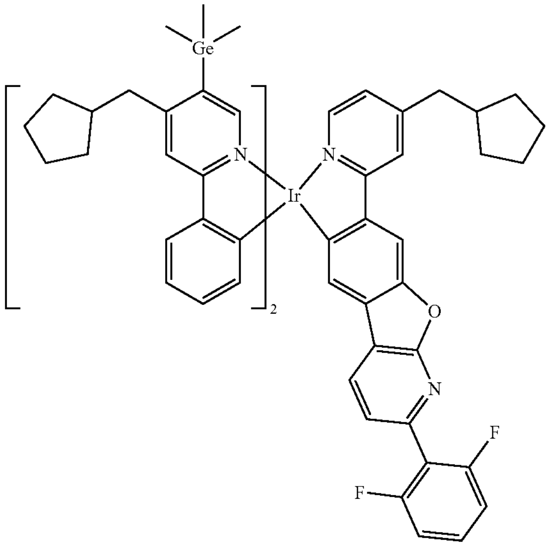
1129
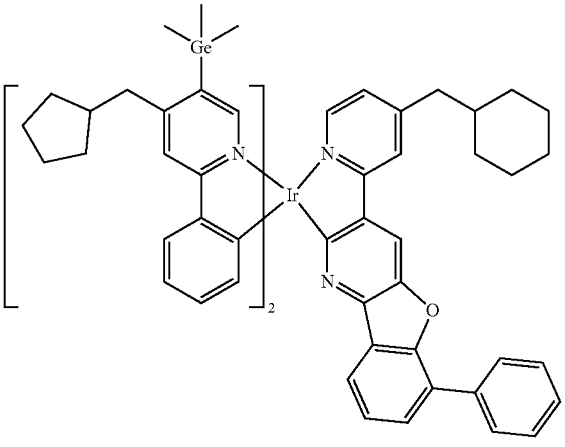
1130
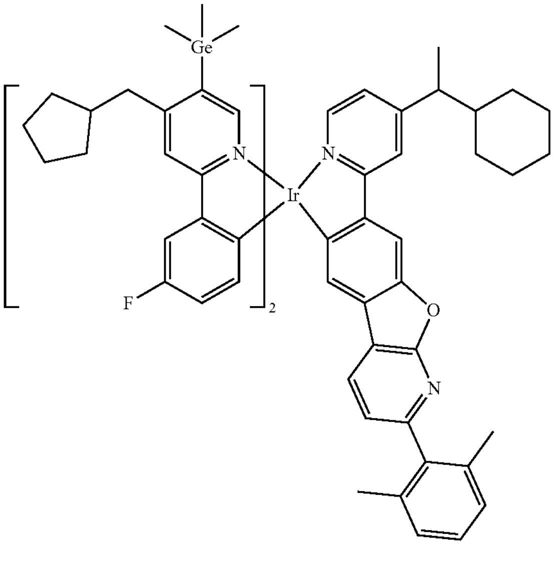
-continued
1131
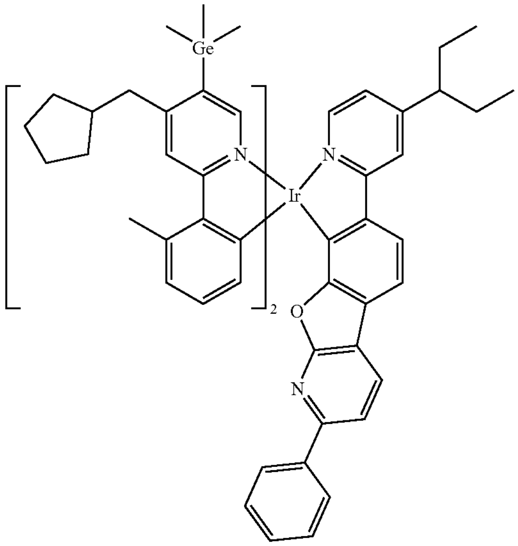
1132
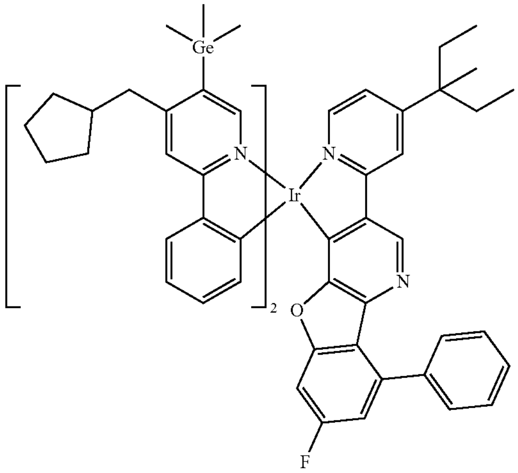
1133
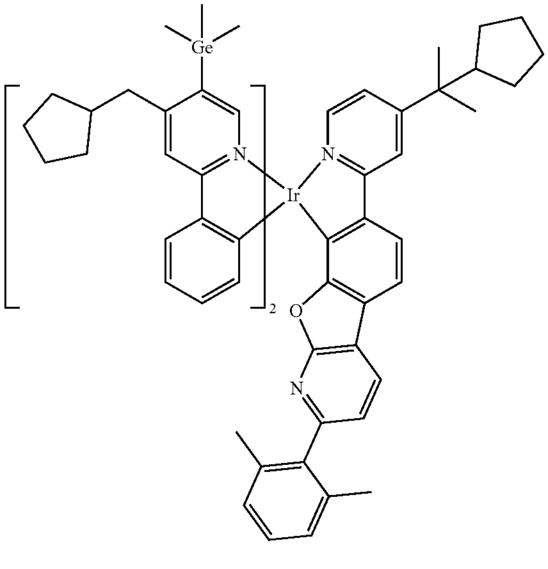

-continued
1134
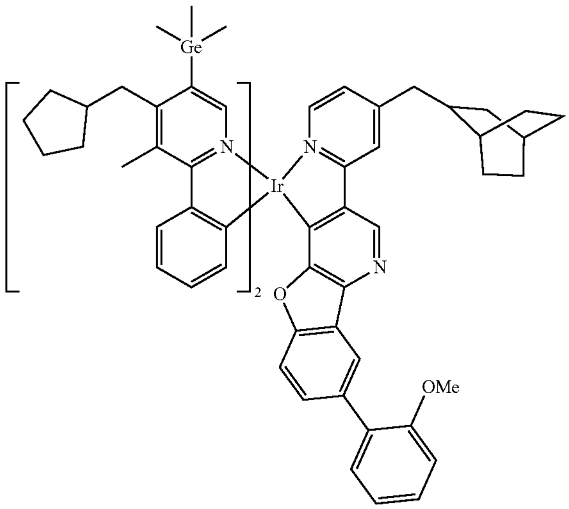
1135
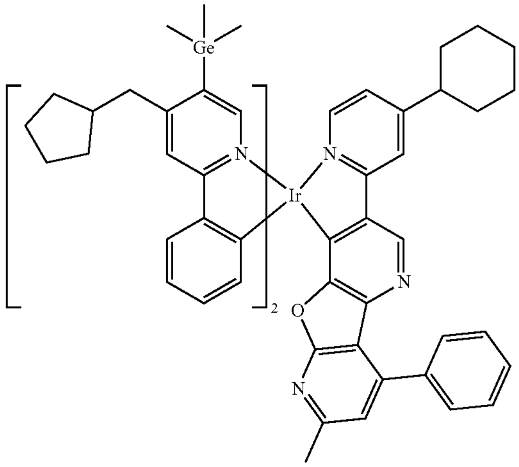
1136
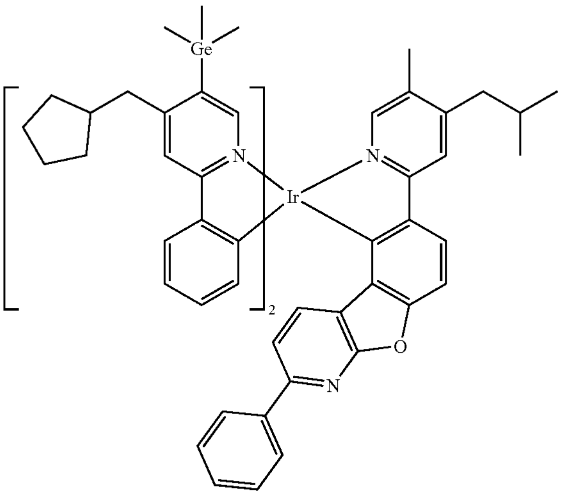
-continued
1137
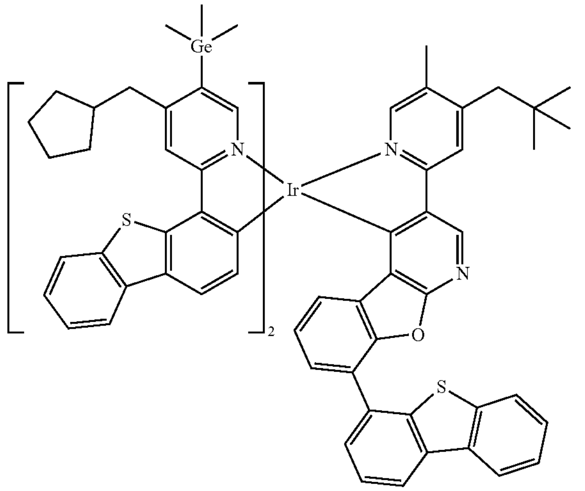
1138
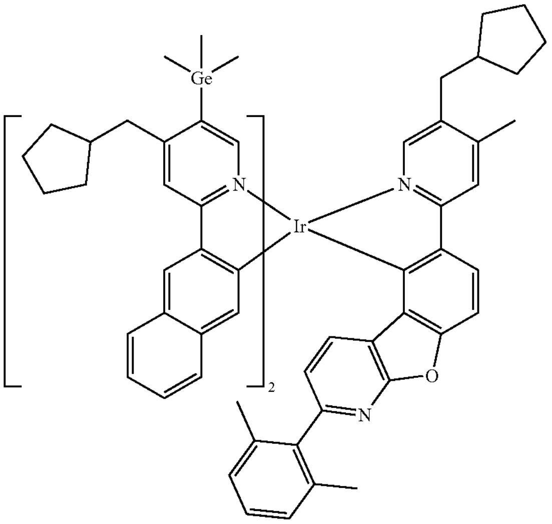
1139
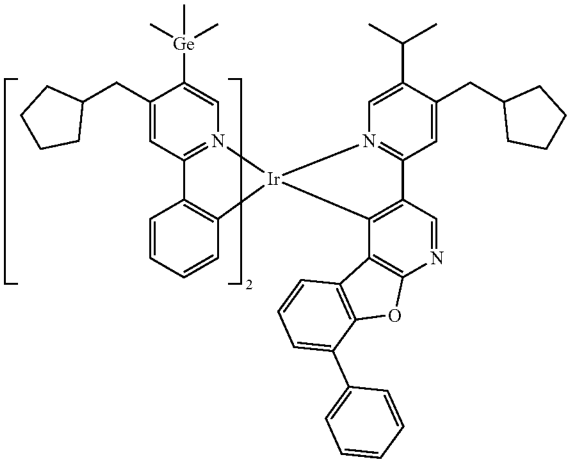

-continued
1140
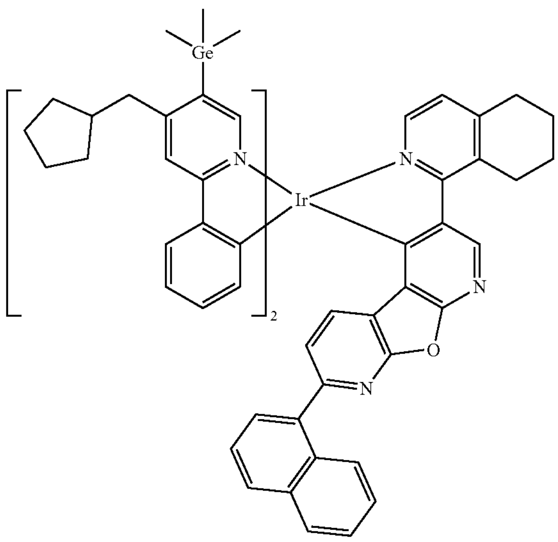
1141
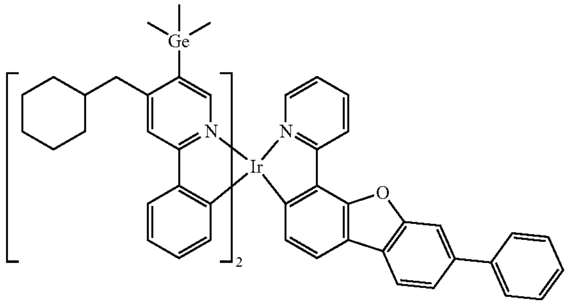
1142
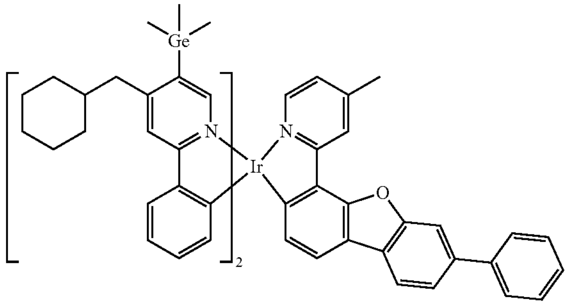
1143
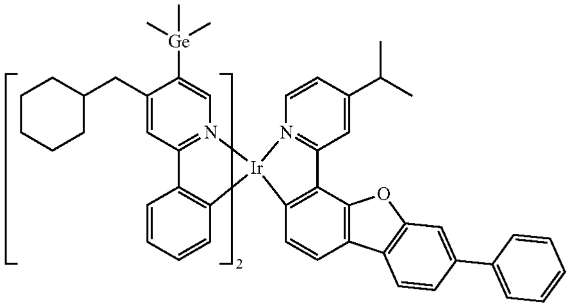
-continued
1144
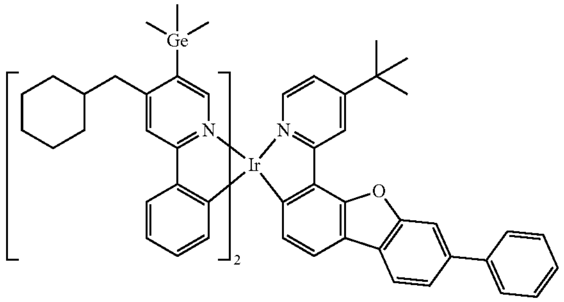
1145
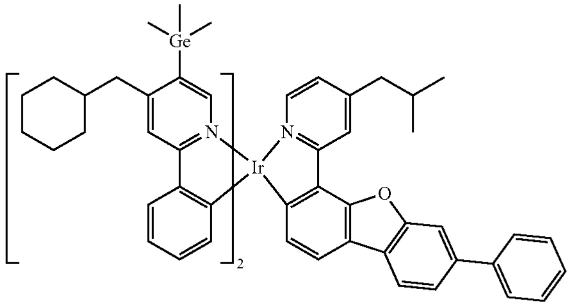
1146
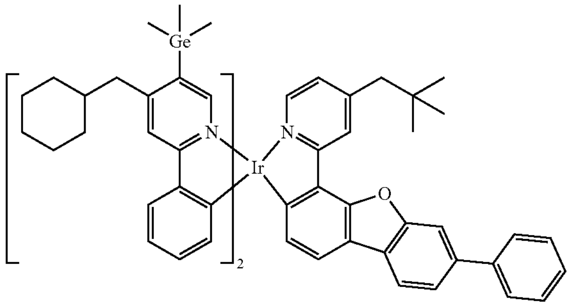
1147
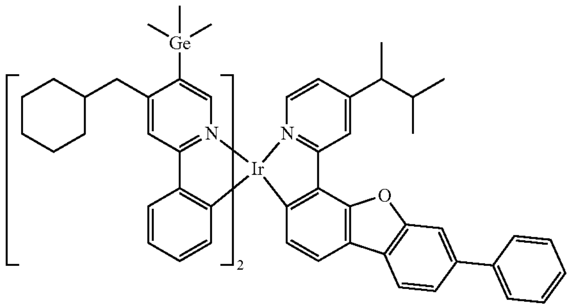
1148
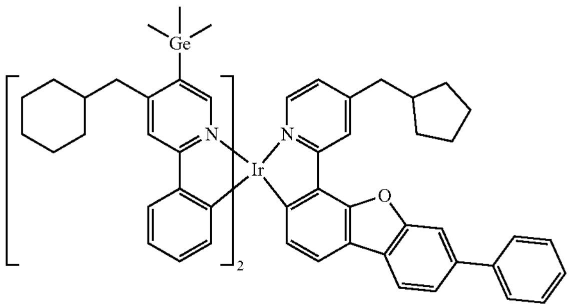

1149
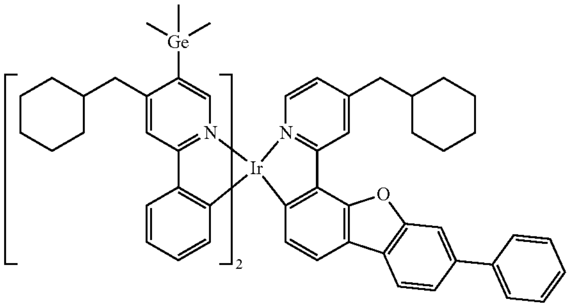
1150
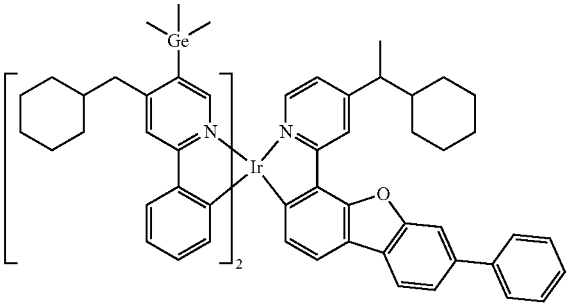
1151
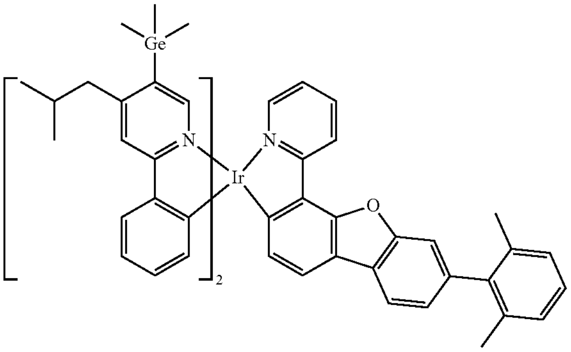
1152
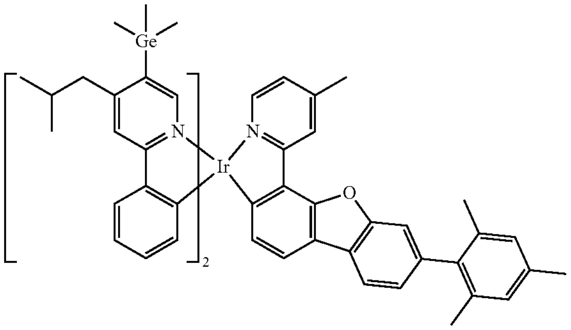
1153
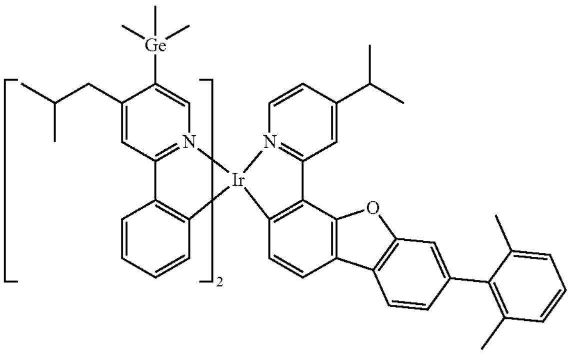
1154
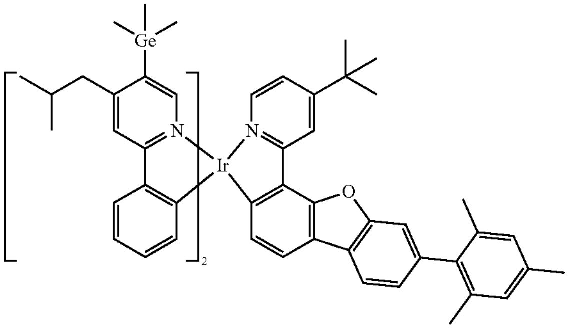
1155
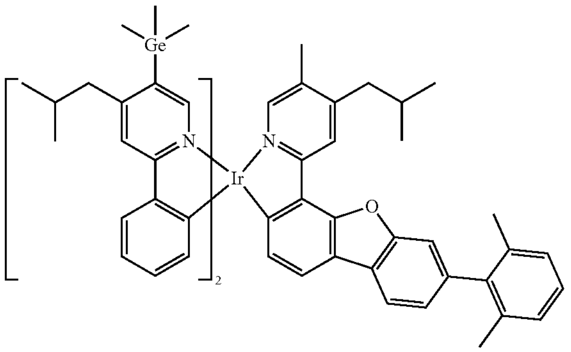
1156
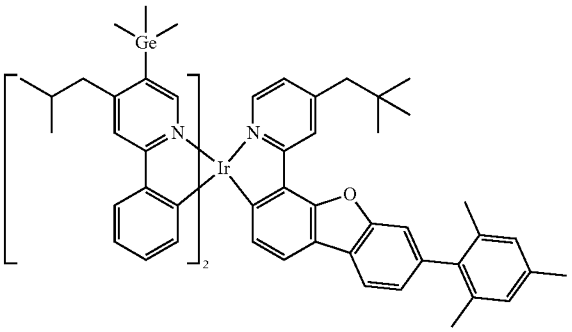

-continued
1157
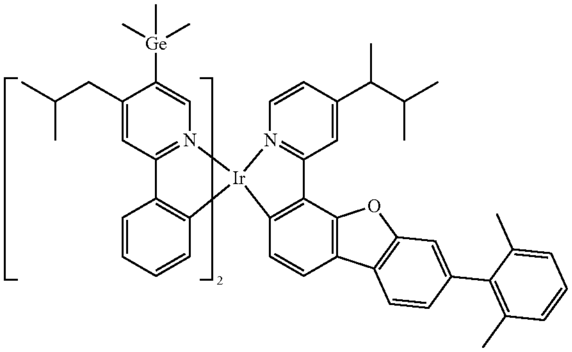
1158
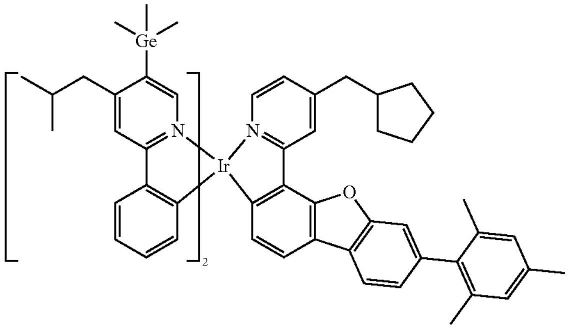
1159
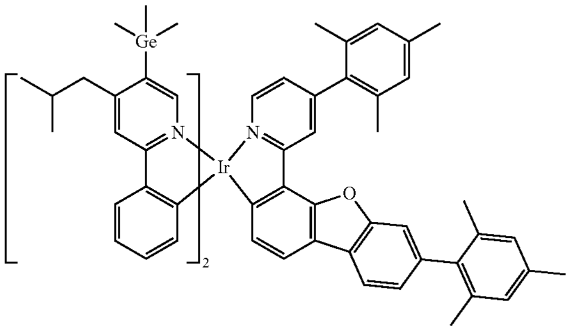
1160
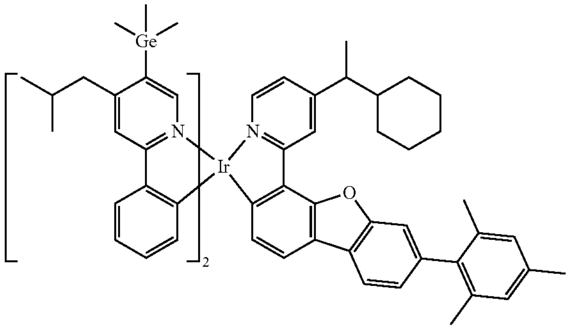
-continued
1161
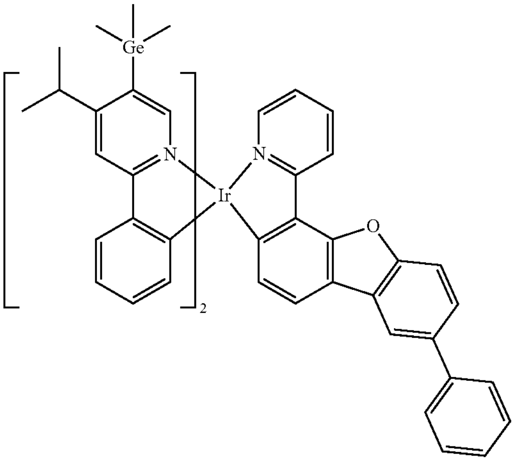
1162
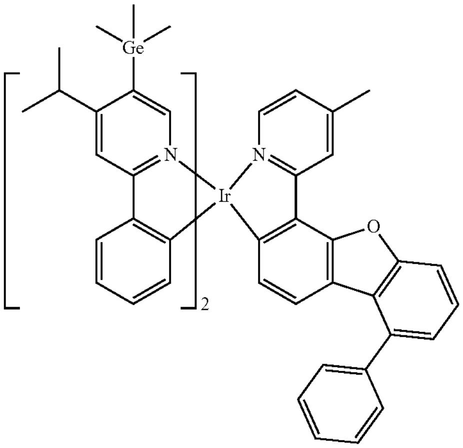
1163
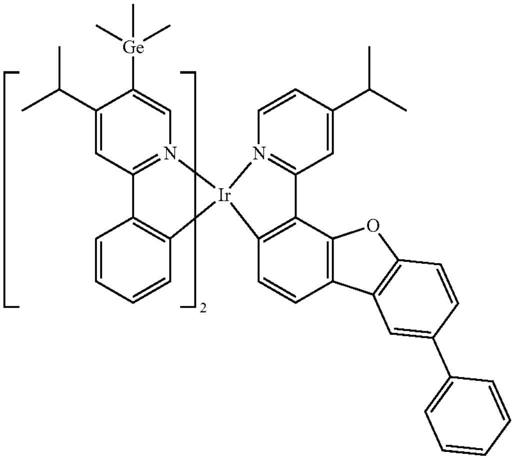

-continued
1164
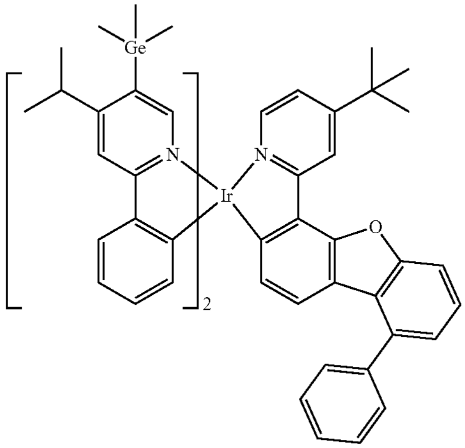
1165
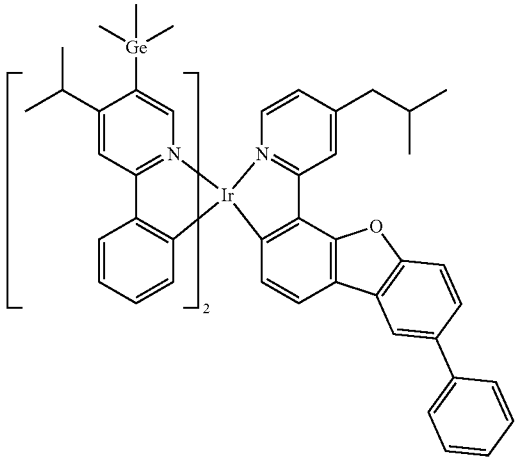
1166
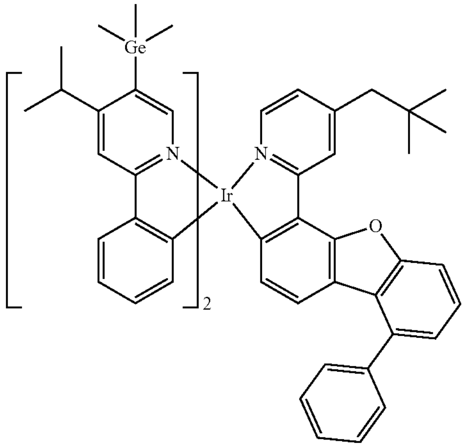
-continued
1167
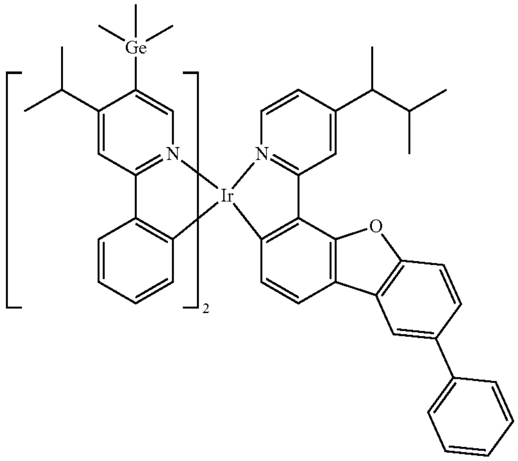
1168
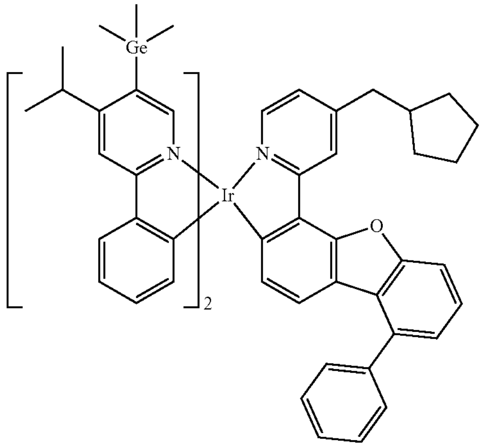
1169
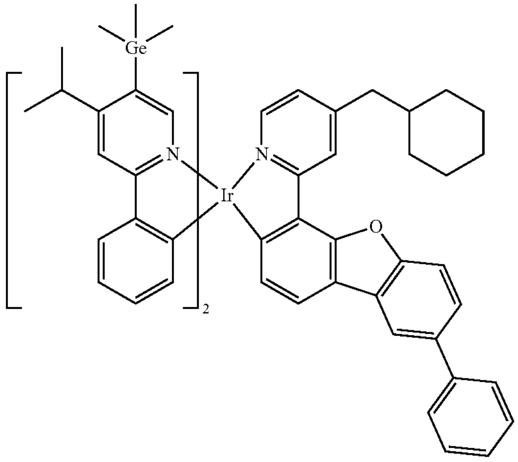

-continued
1170
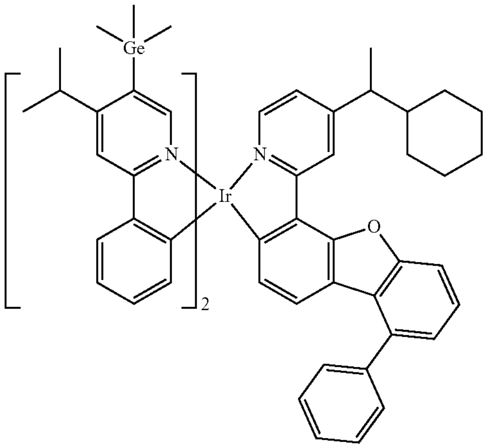
1171
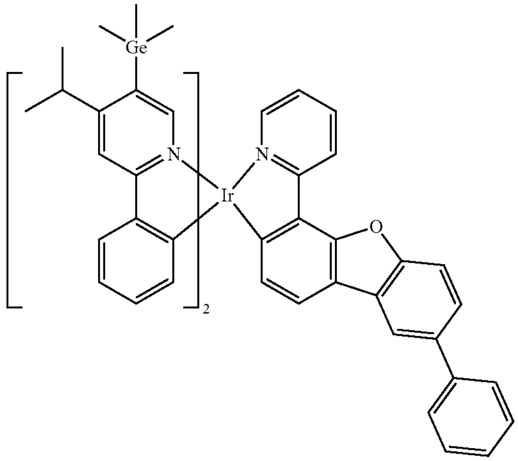
1172
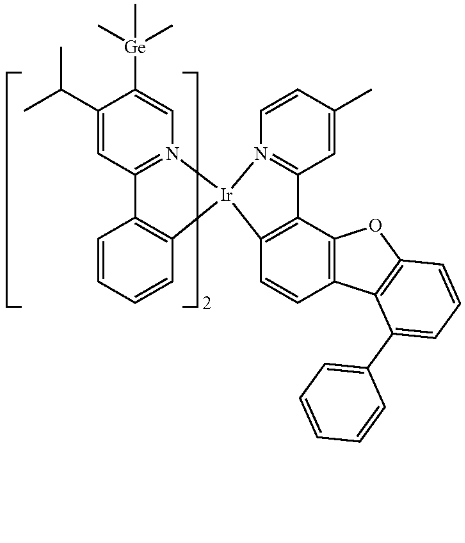
-continued
1173
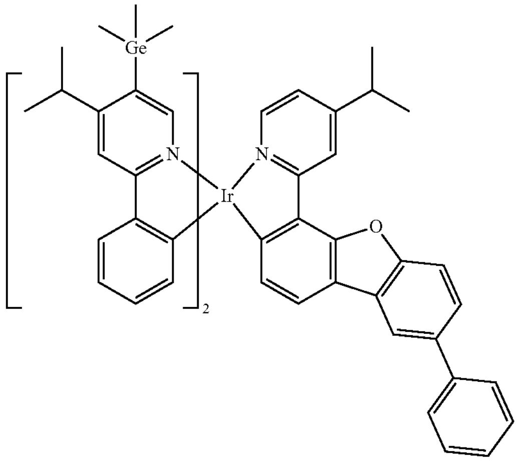
1174
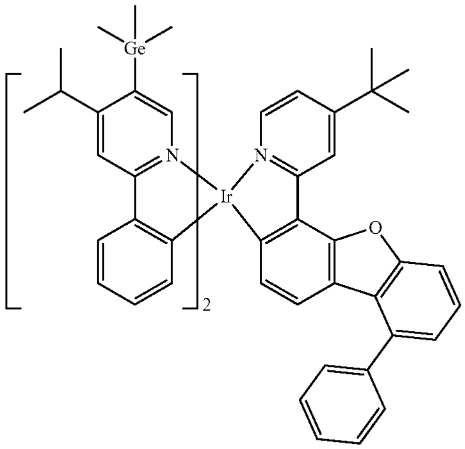
1175
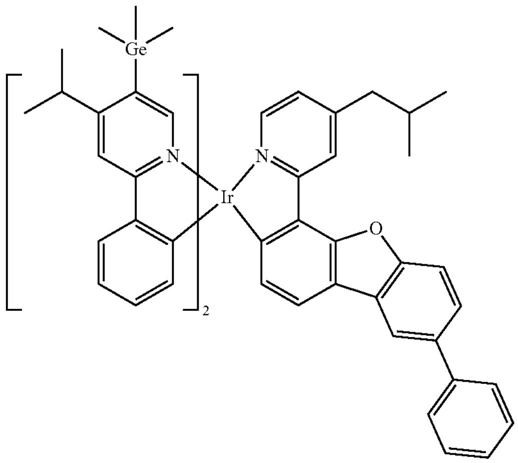

-continued
1176
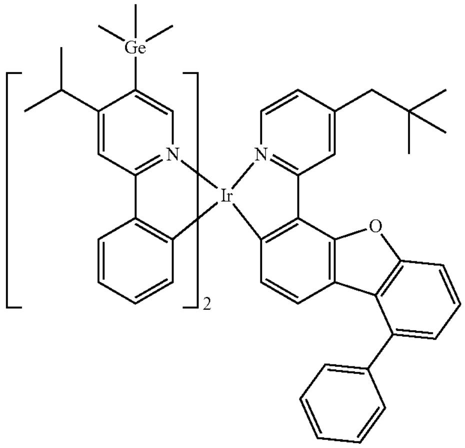
1177
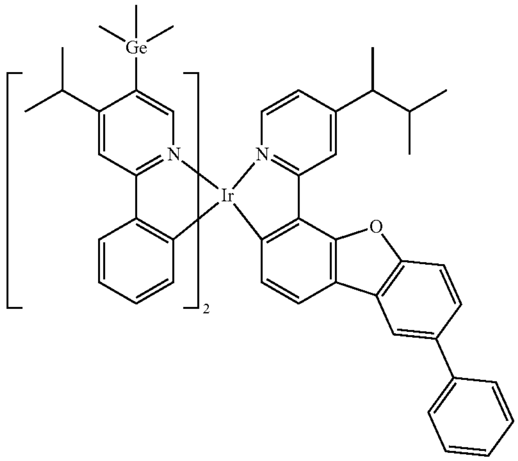
1178
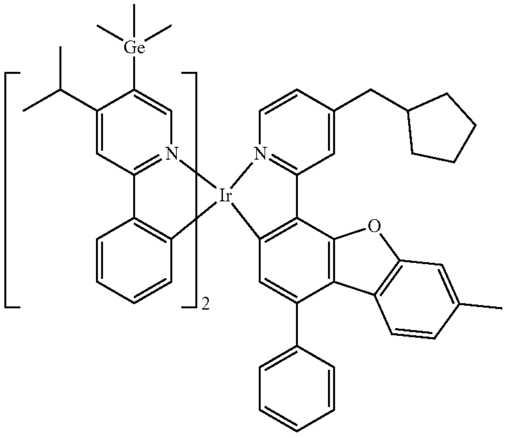
-continued
1179
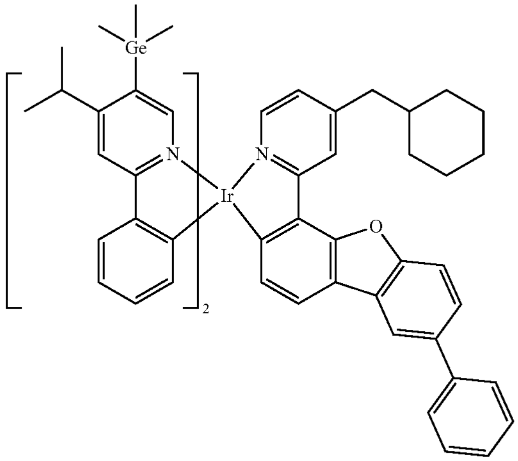
1180
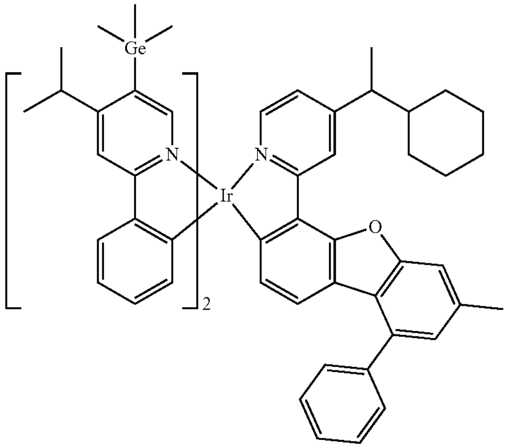
1181
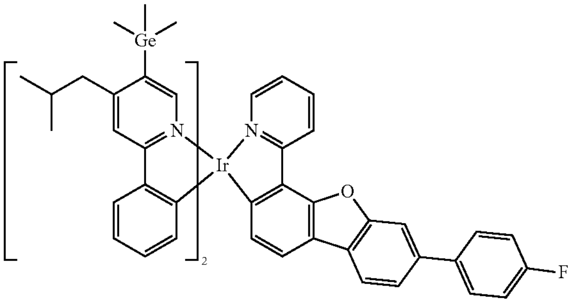
1182
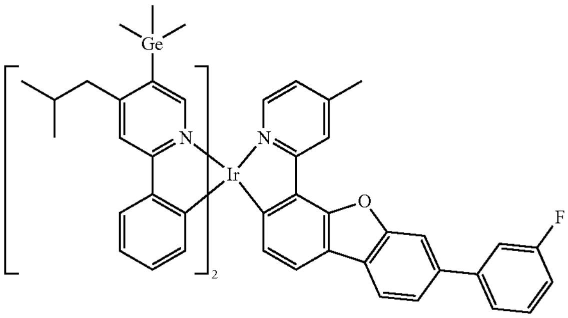

-continued
1183
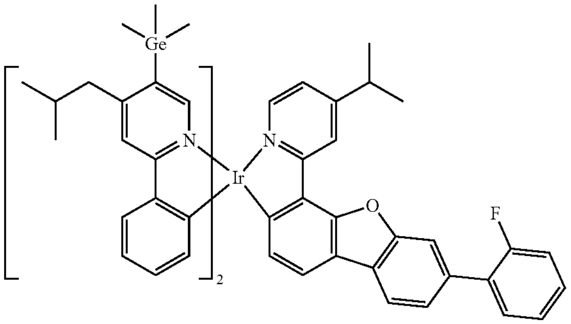
1184
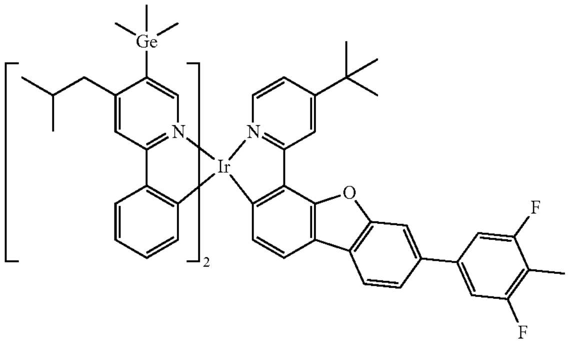
1185
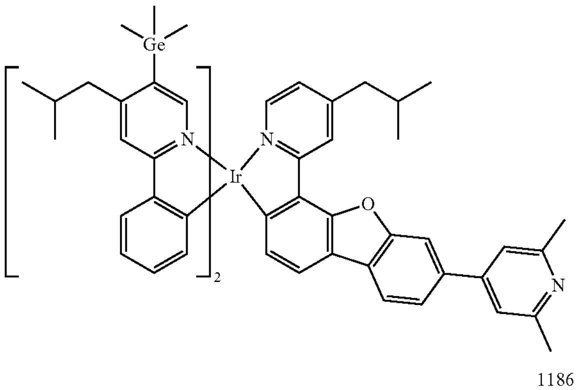
1186
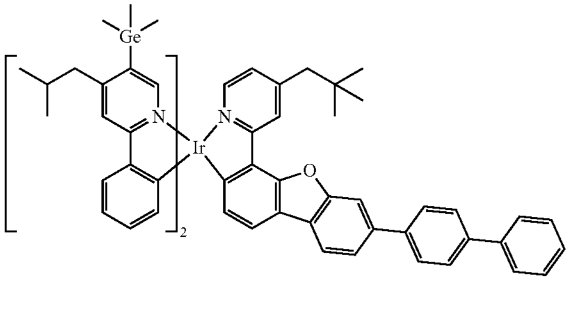
-continued
1187
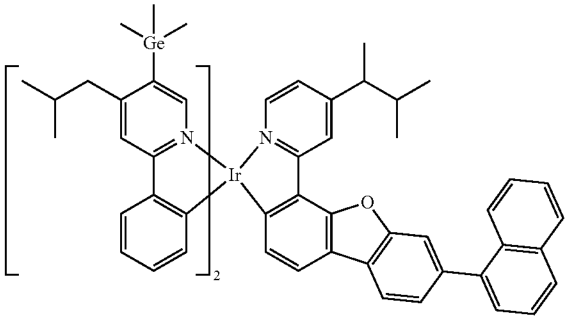
1188
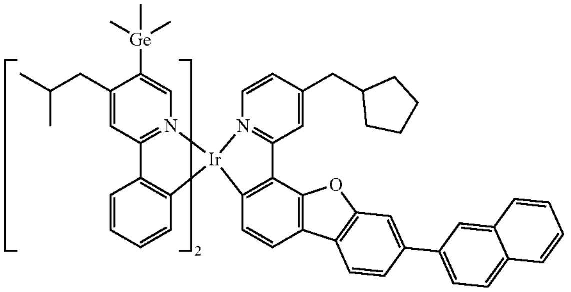
1189
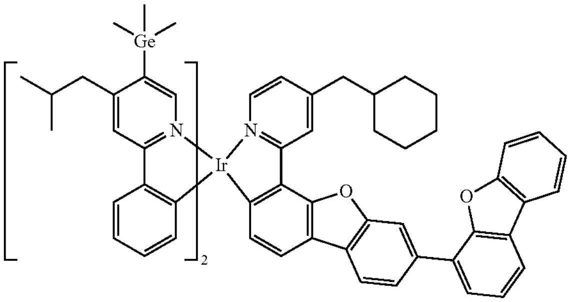
1190
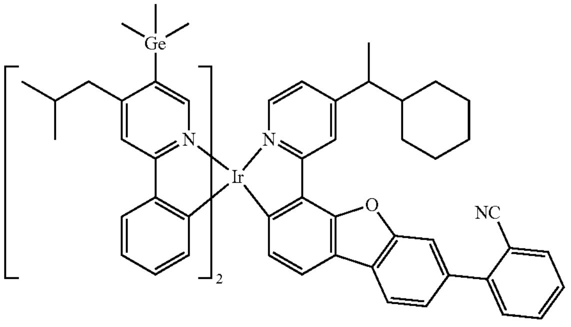
1191
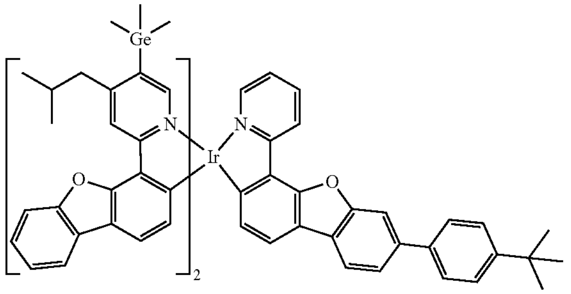

-continued
1192
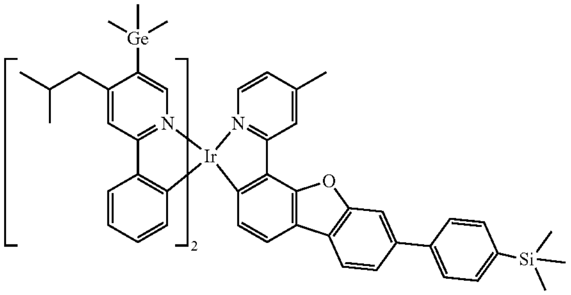
1193
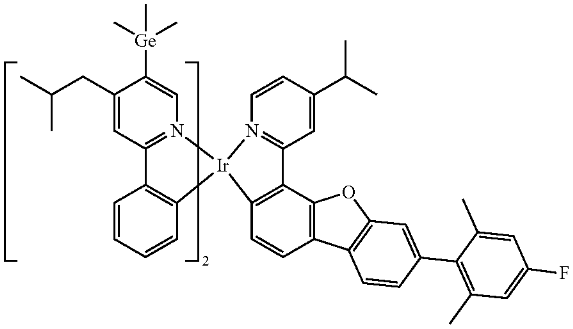
1194
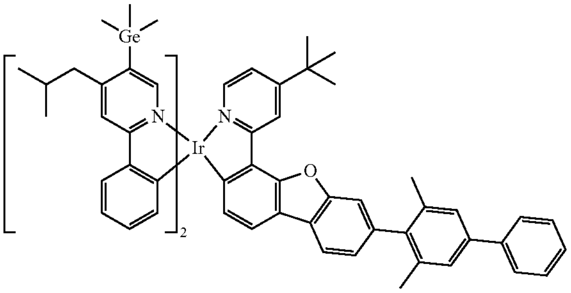
1195
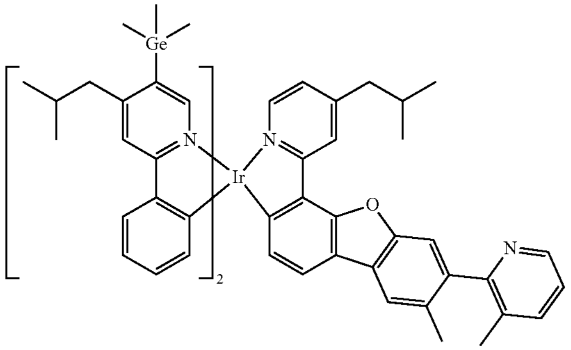
-continued
1196
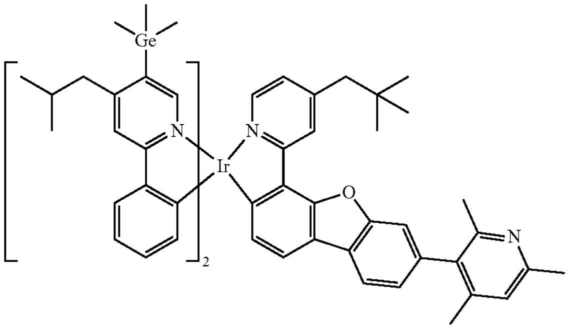
1197
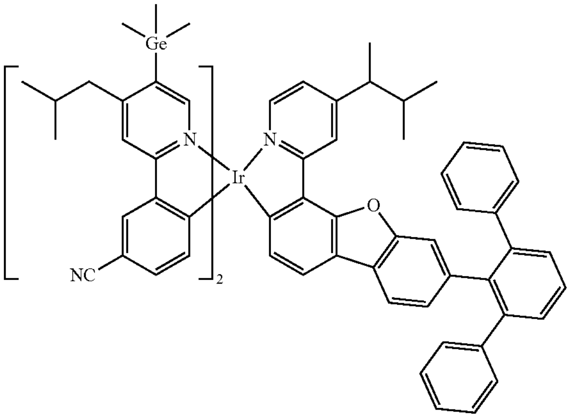
1198
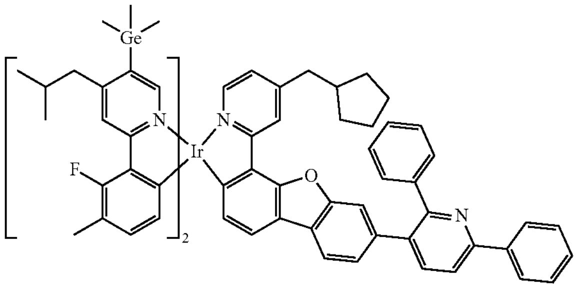
1199
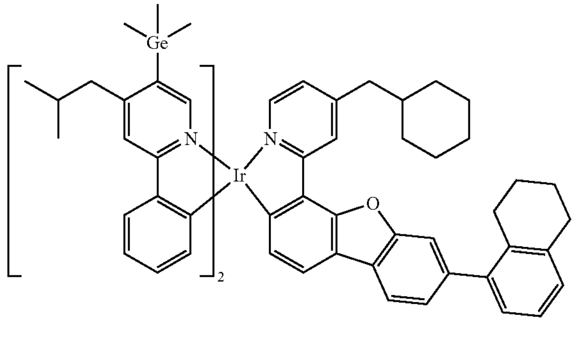

-continued
1200
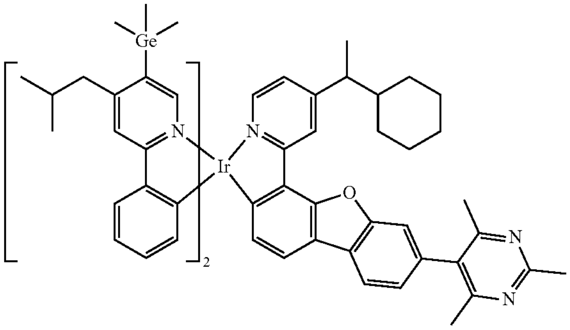
1201
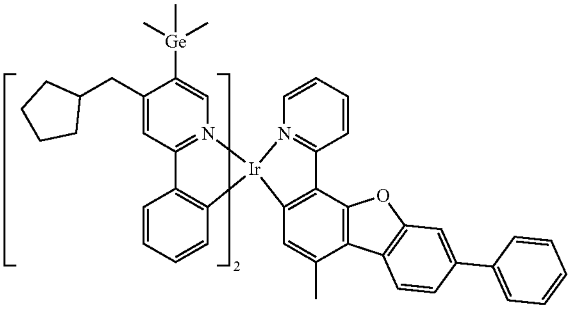
1202
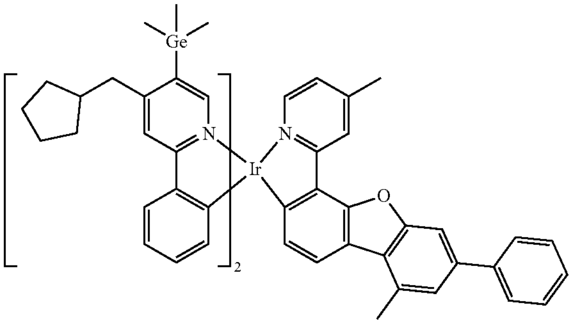
1203
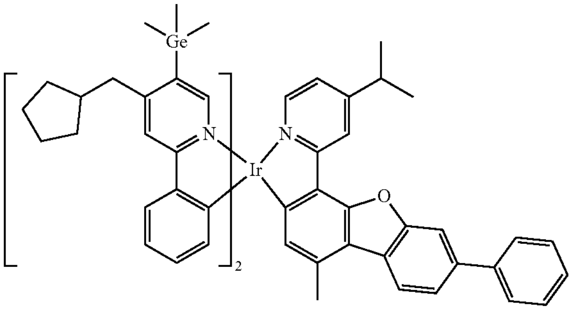
-continued
1204
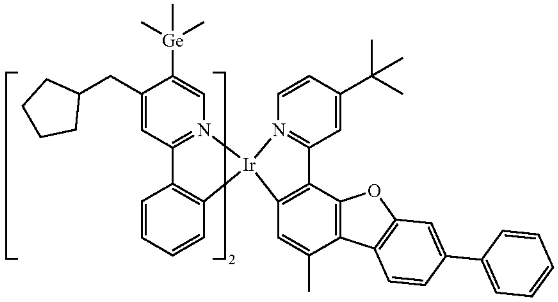
1205
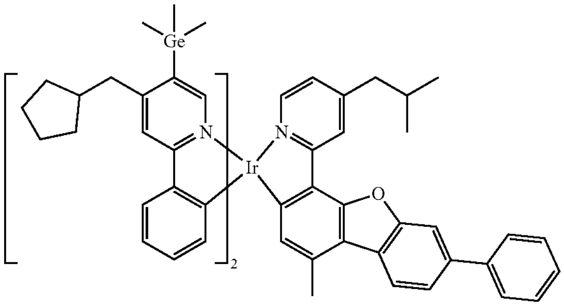
1206
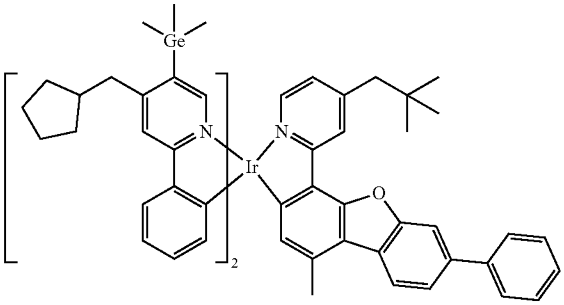
1207
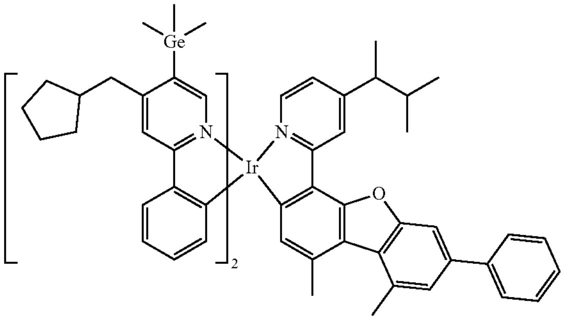

-continued
1208
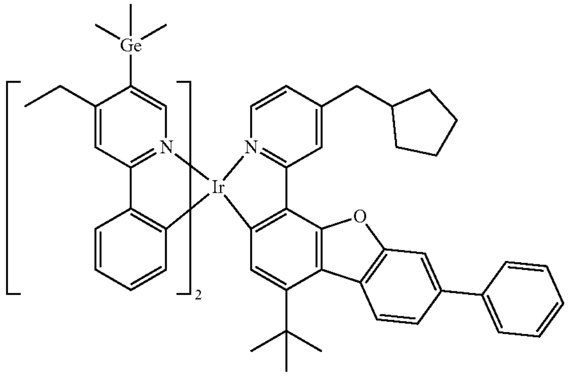
1209
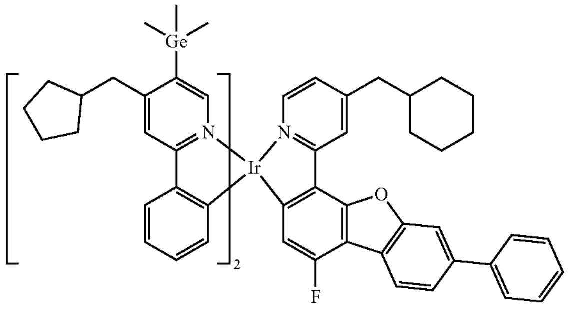
1210
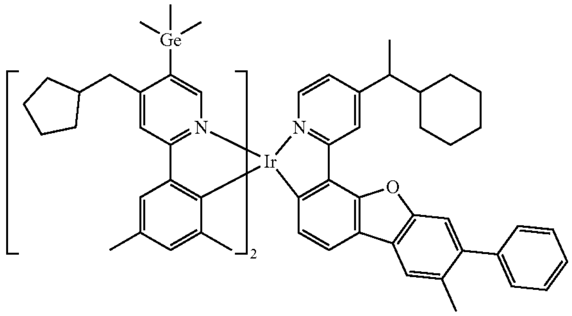
1211
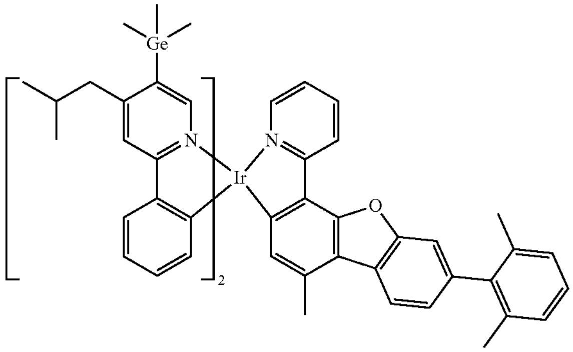
-continued
1212
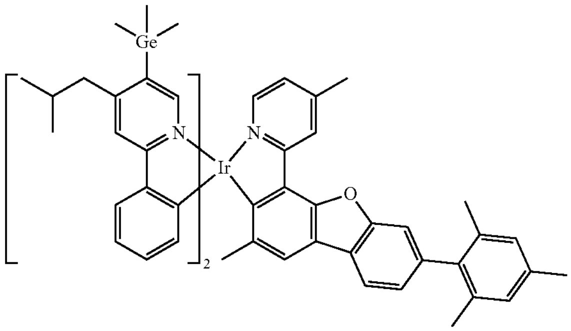
1213
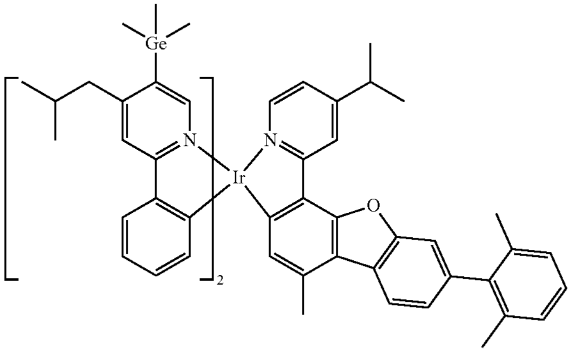
1214
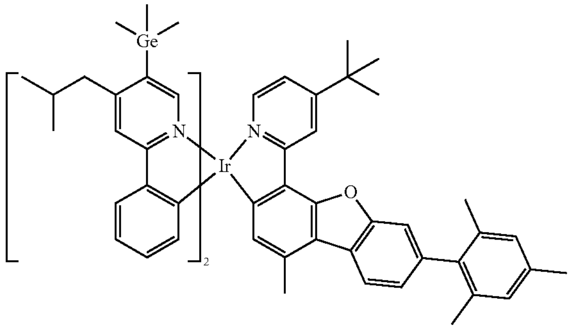
1215
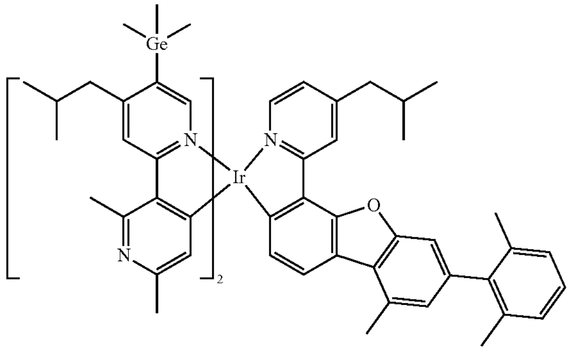

1216
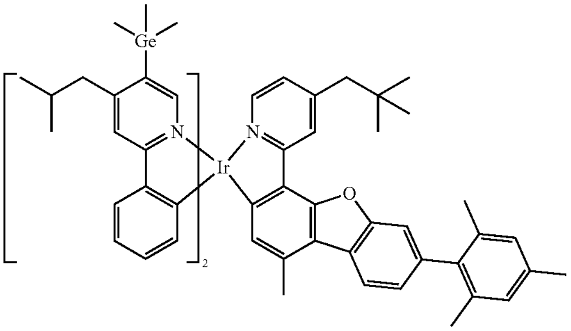
1217
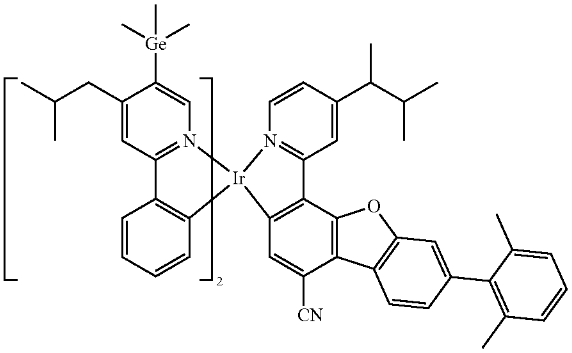
1218
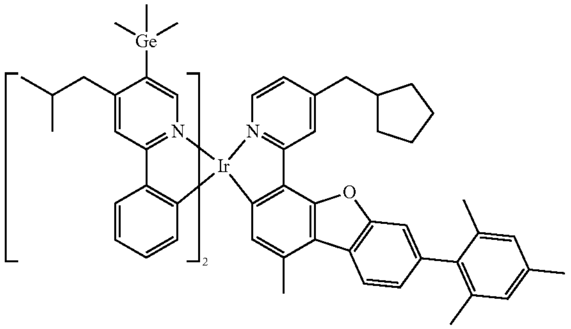
1219
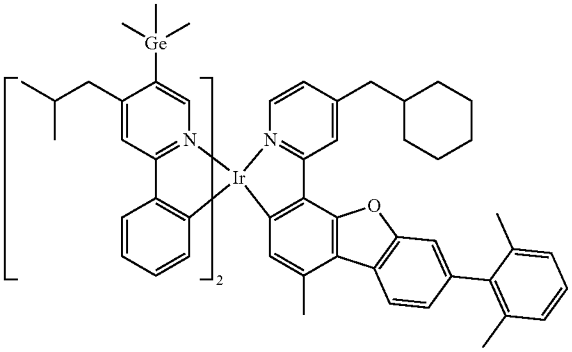
1220
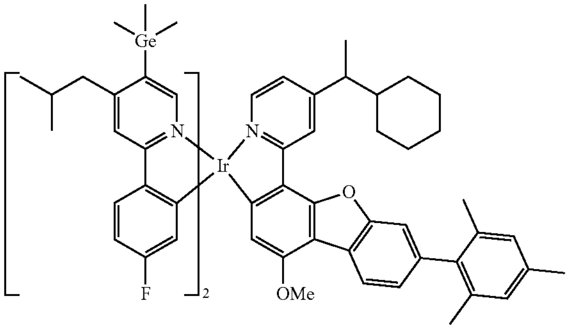
1221
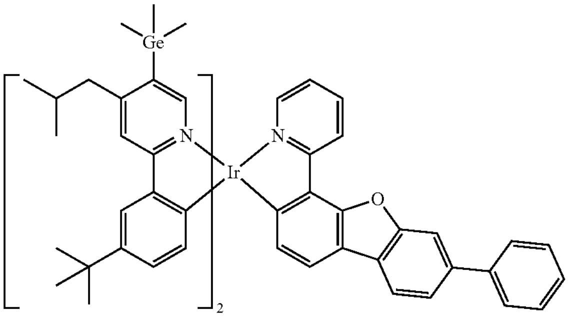
1222
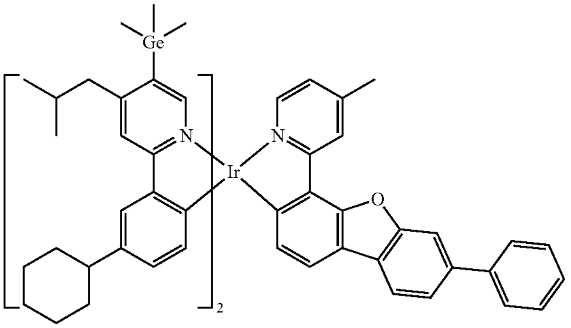
1223
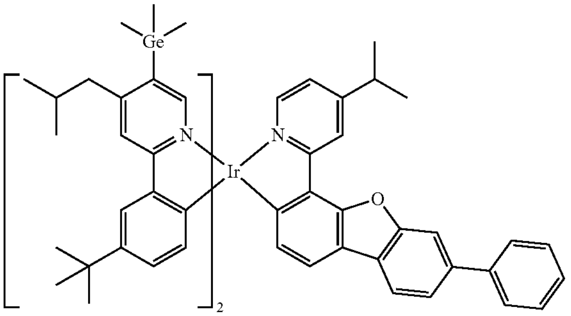

-continued
1224
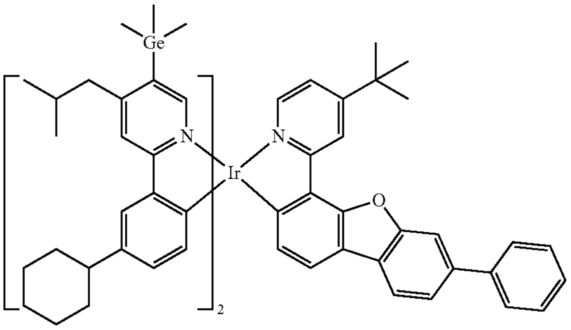
1225
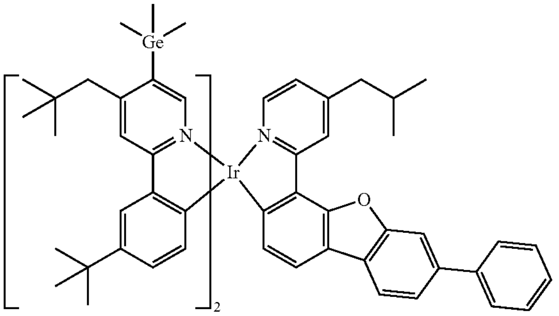
1226
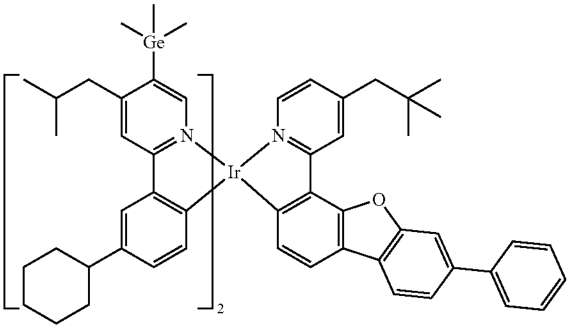
1227
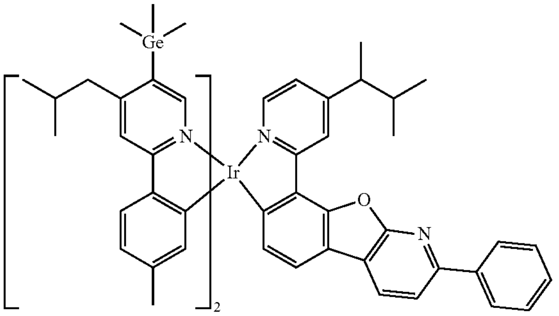
-continued
1228
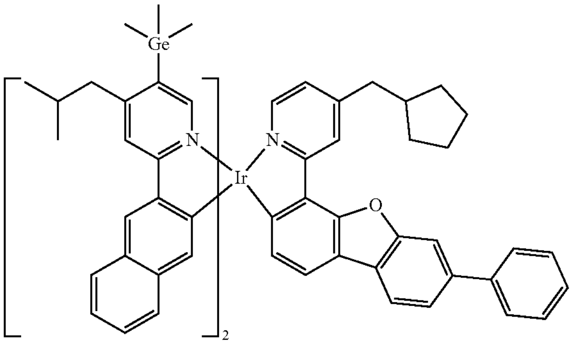
1229
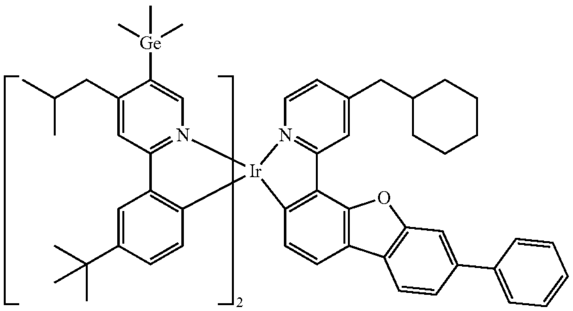
1230
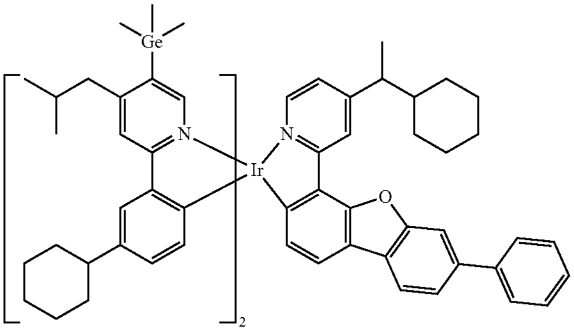
1231
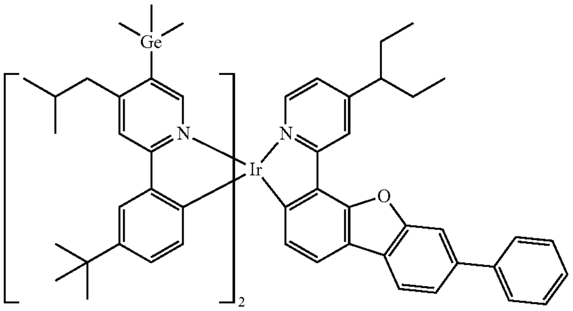

-continued
1232
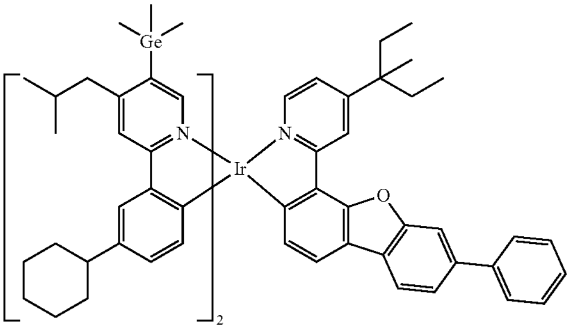
1233
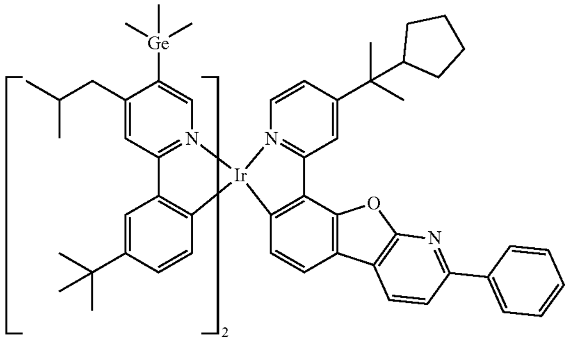
1234
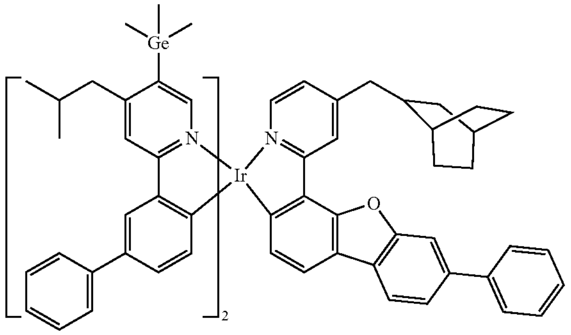
1235
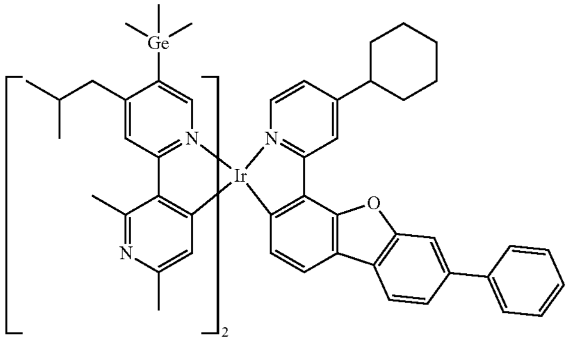
-continued
1236
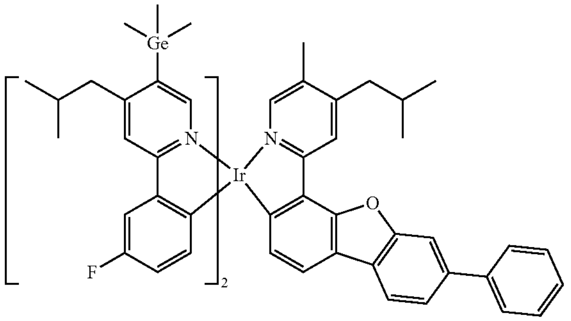
1237
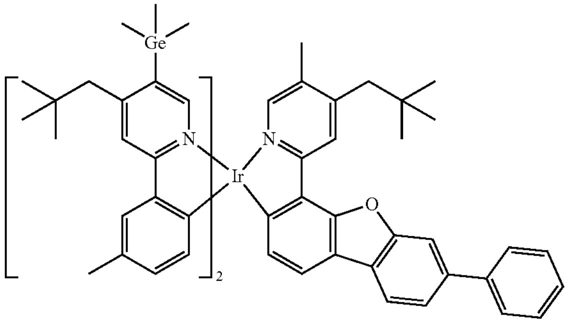
1238
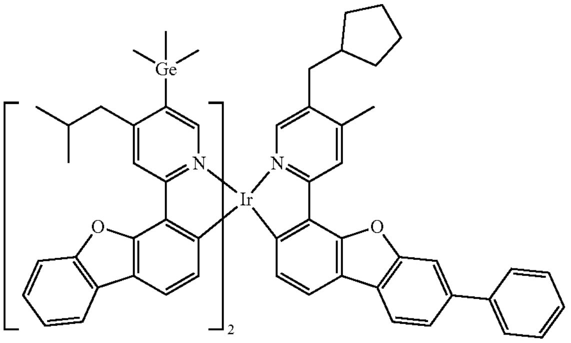
1239
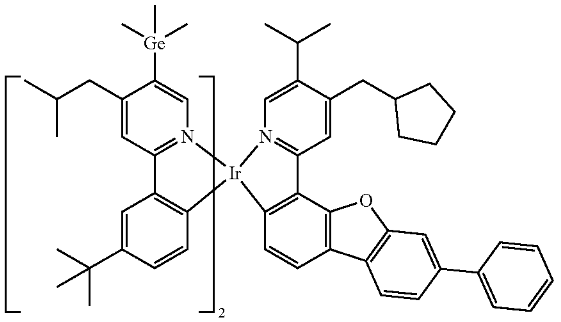

-continued
1240
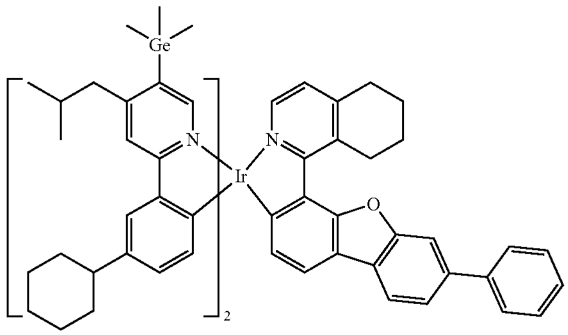
1241
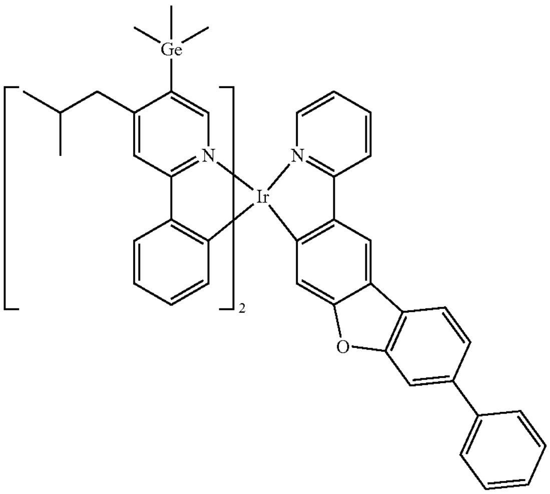
1242
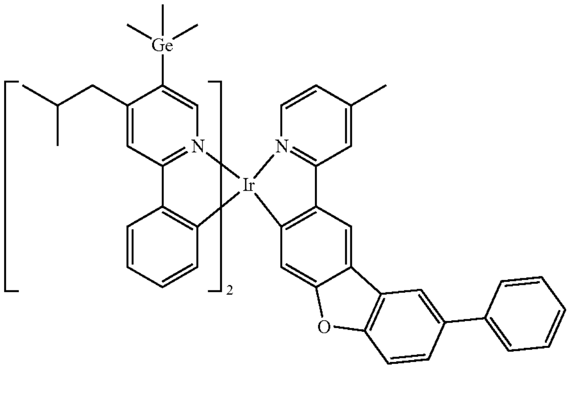
-continued
1243
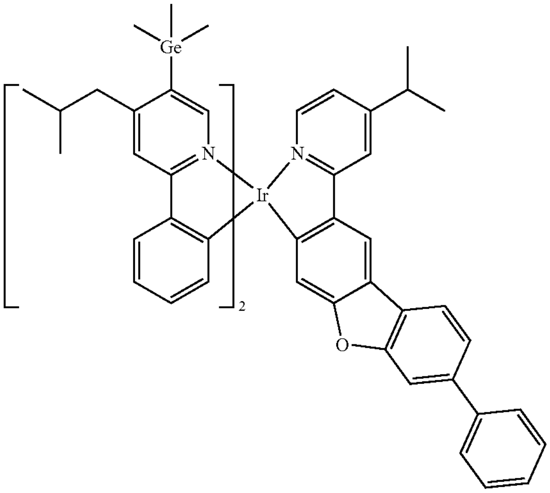
1244
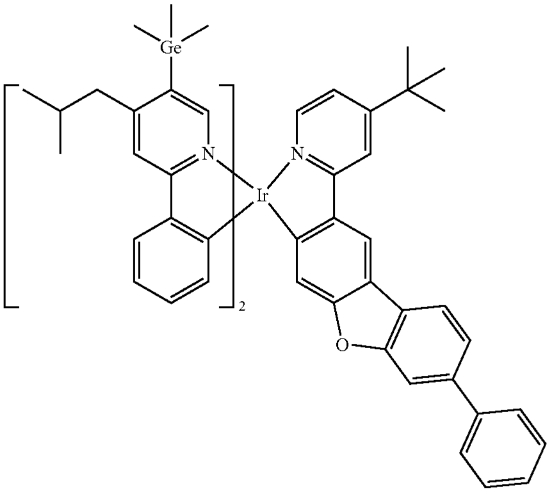
1245
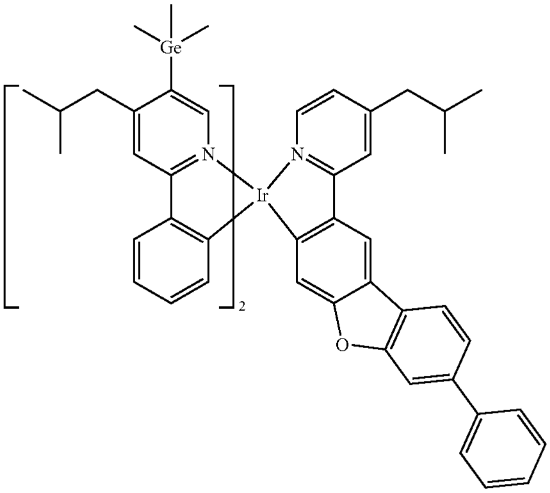

-continued
1246
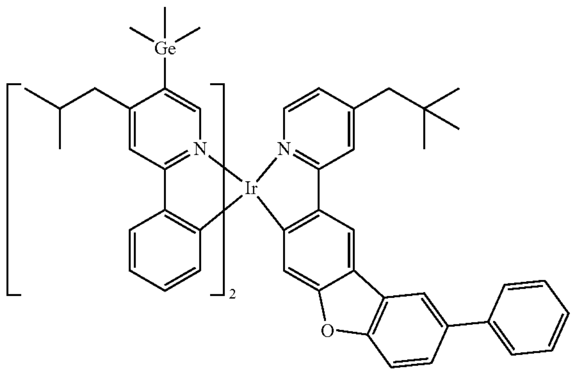
1247
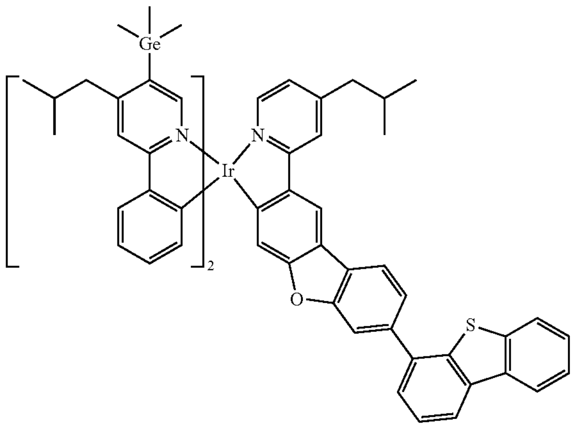
1248
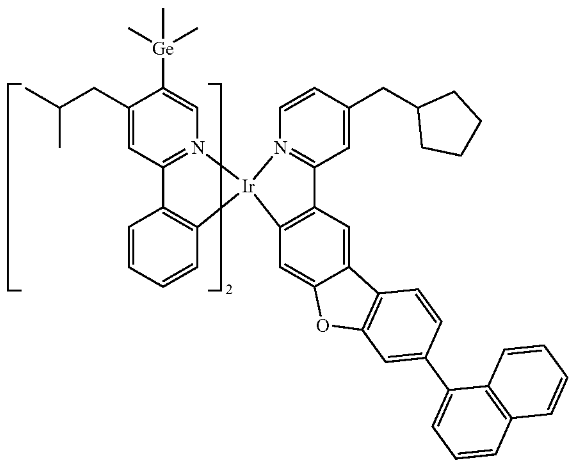
-continued
1249
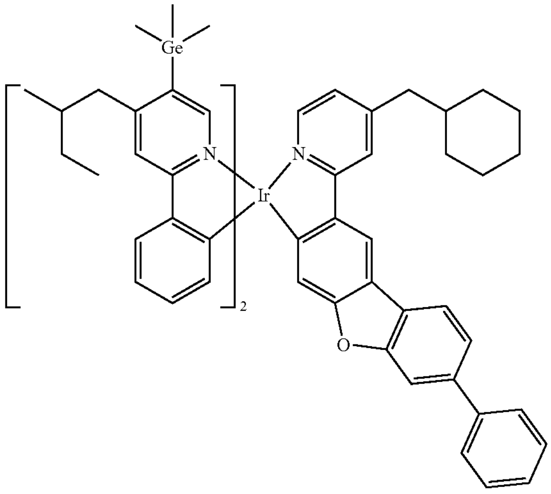
1250
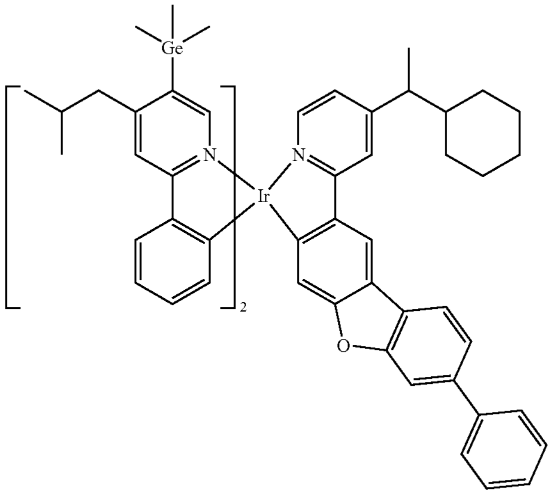
1251
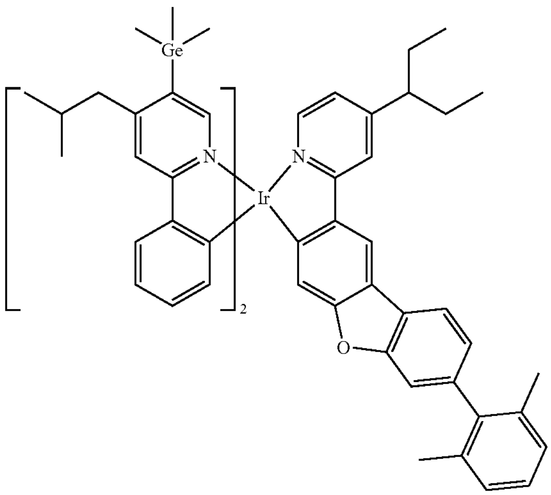

-continued
1252
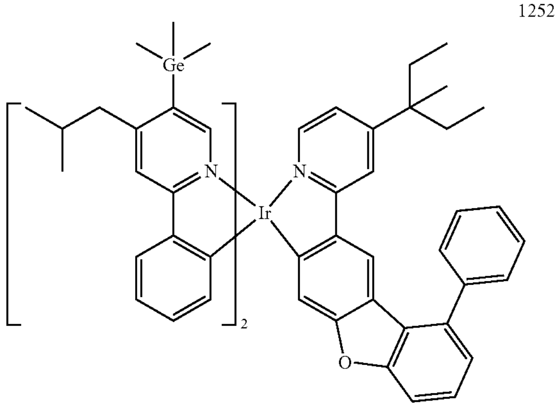
1253
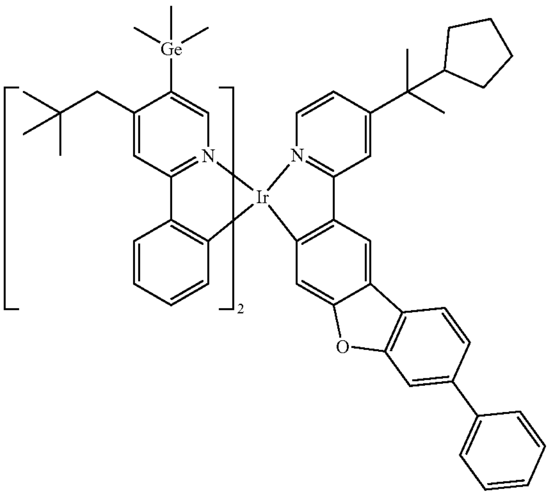
1254
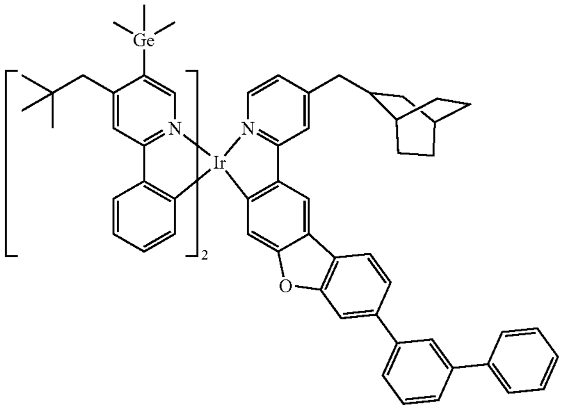
-continued
1255
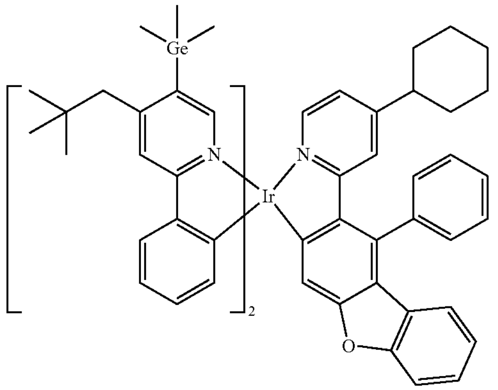
1256
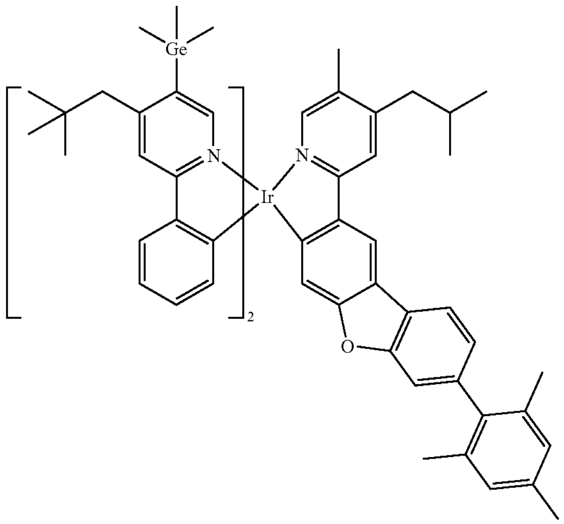
1257
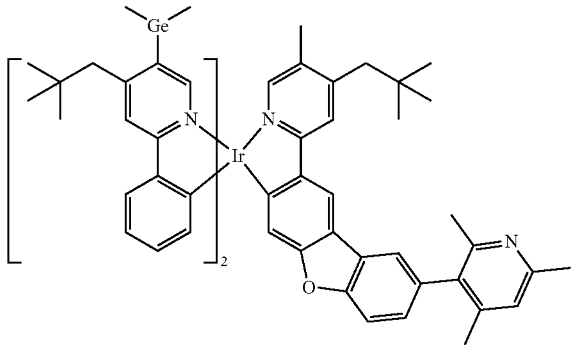

-continued
1258
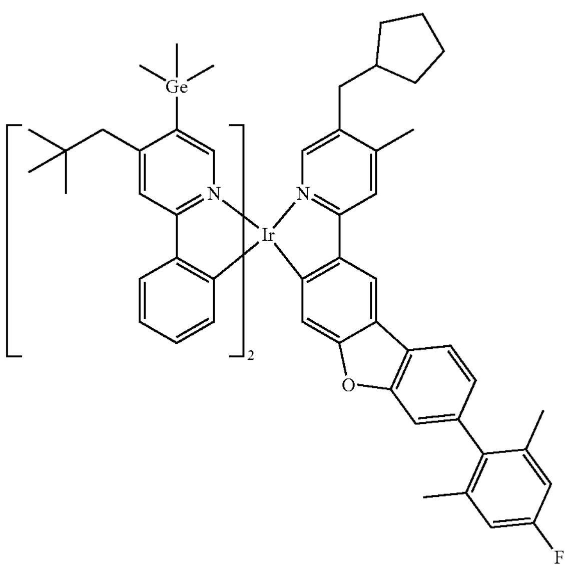
1259
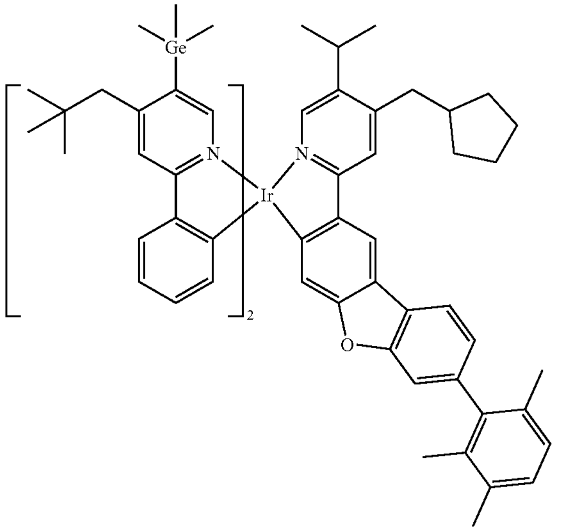
1260
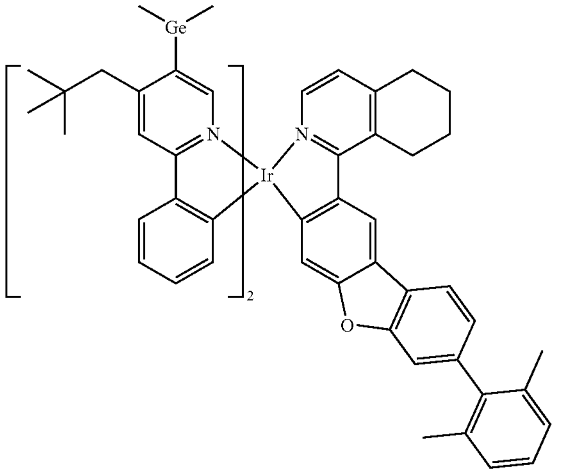
-continued
1261
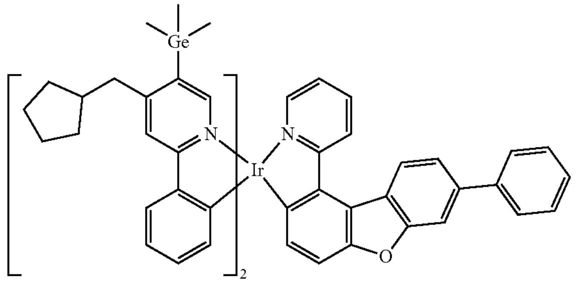
1262
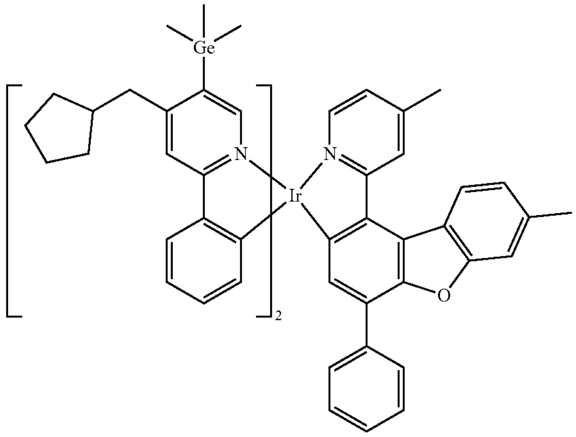
1263
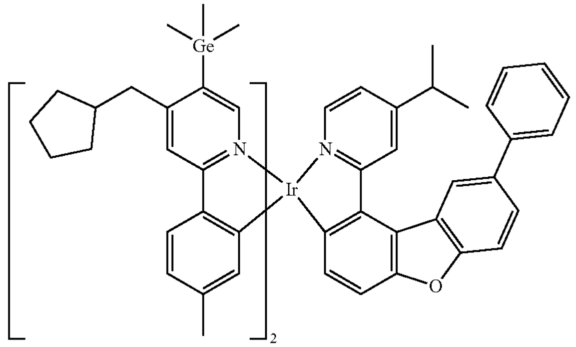
1264
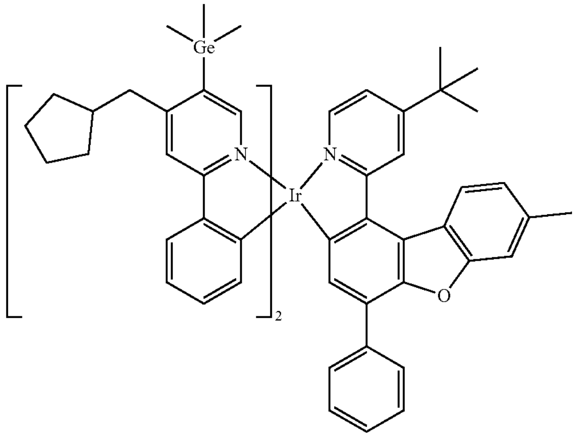

-continued
1265
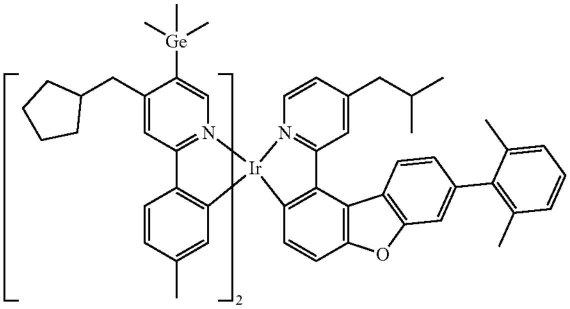
1266
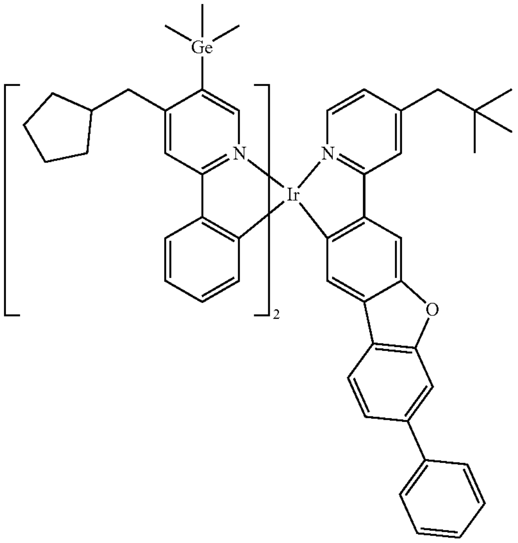
1267
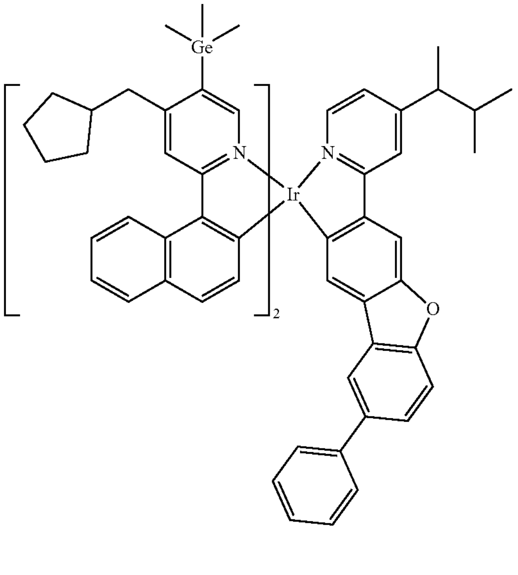
-continued
1268
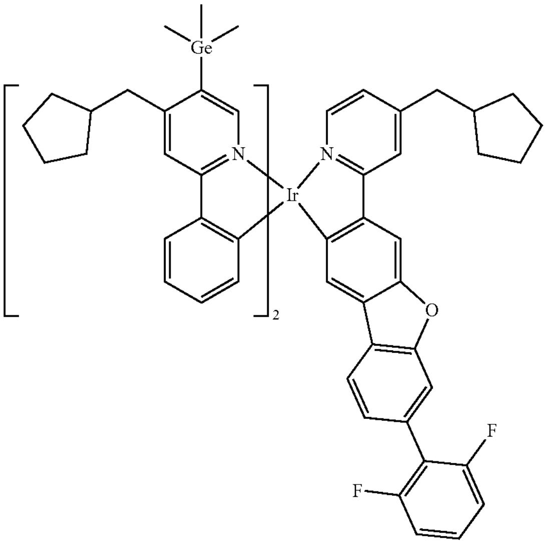
1269
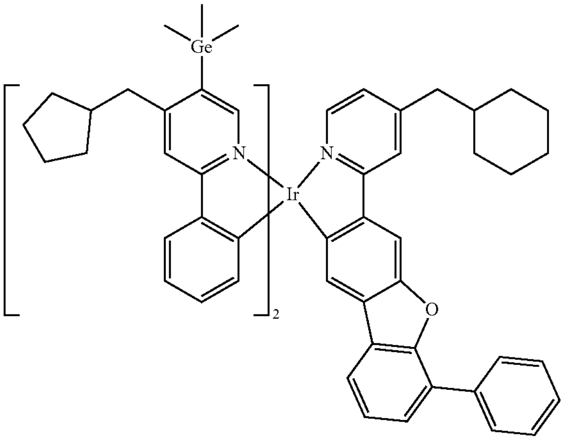
1270
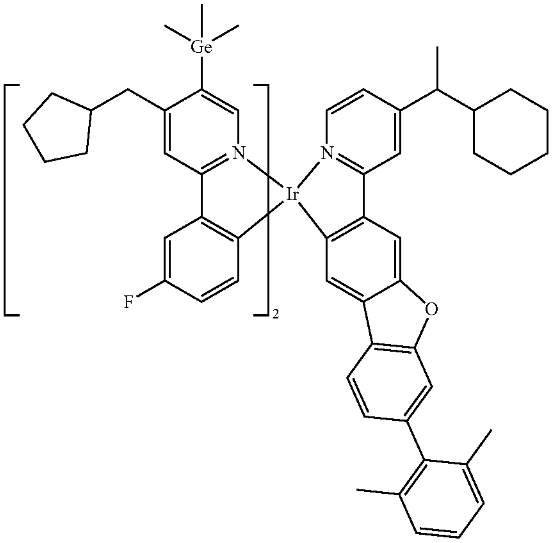

1271
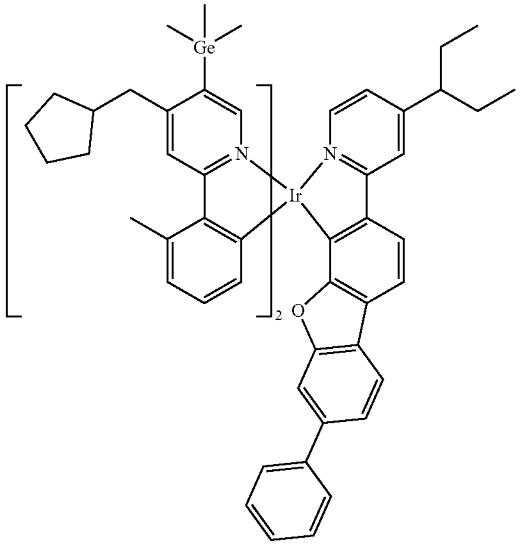
1272
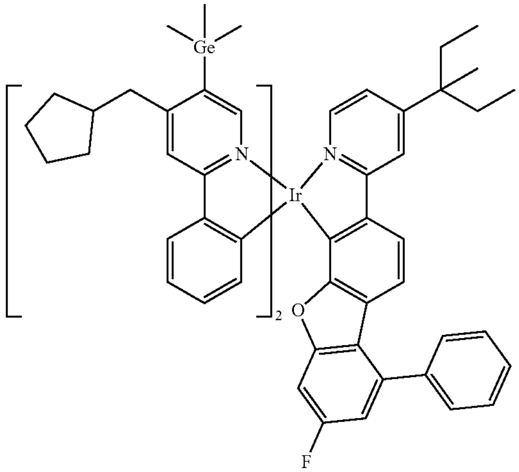
1273
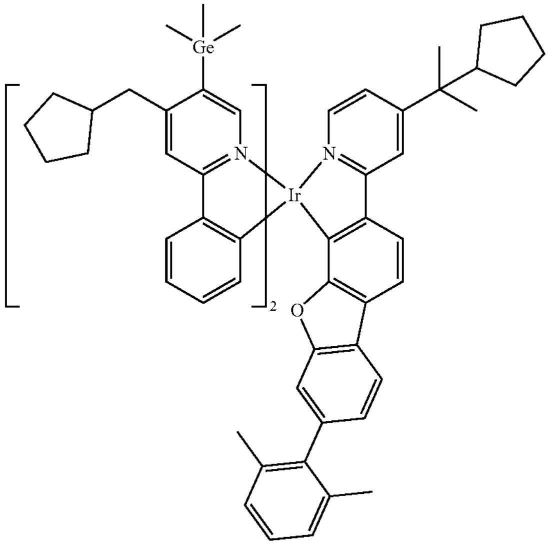
1274
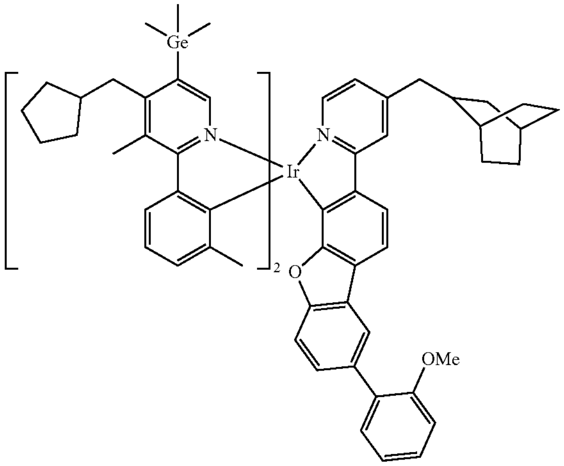
1275
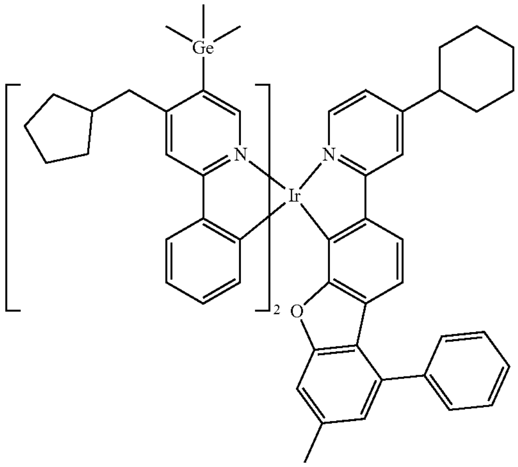
1276
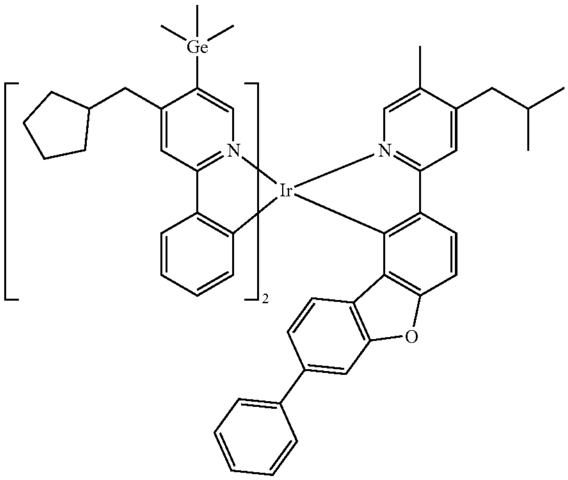

-continued
1277
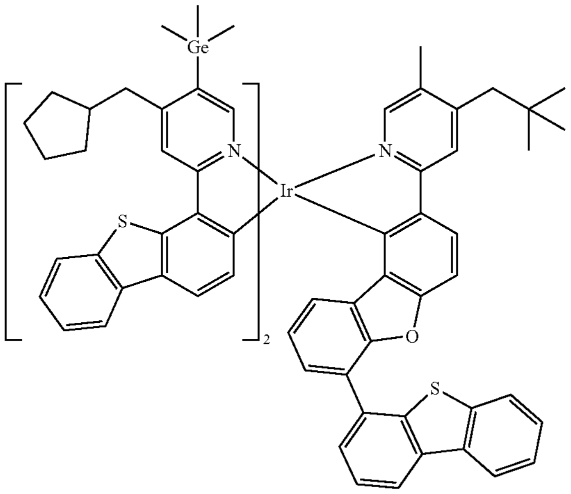
1278
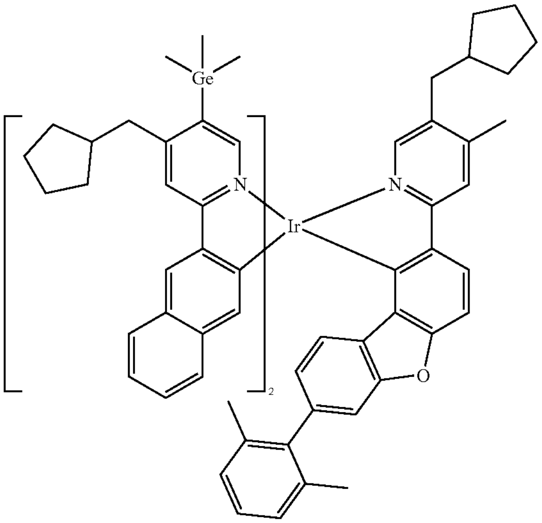
1279
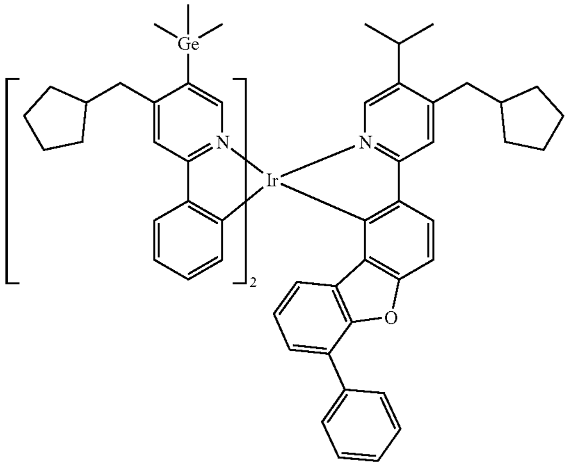
-continued
1280
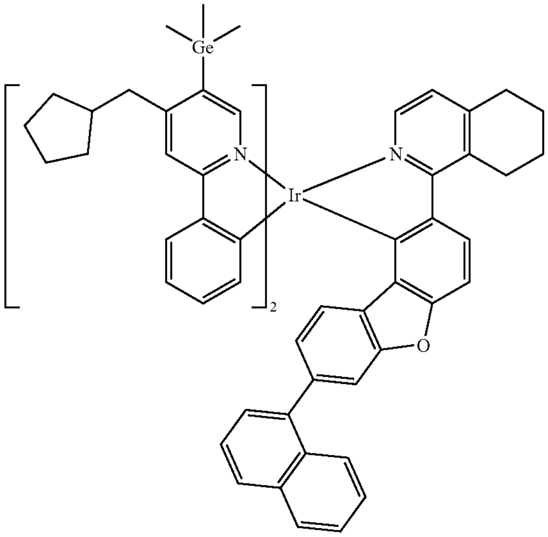
1281
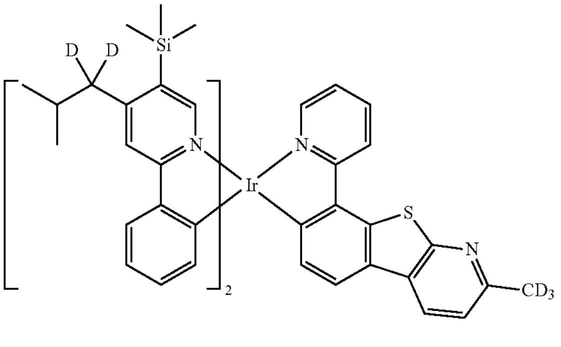
1282
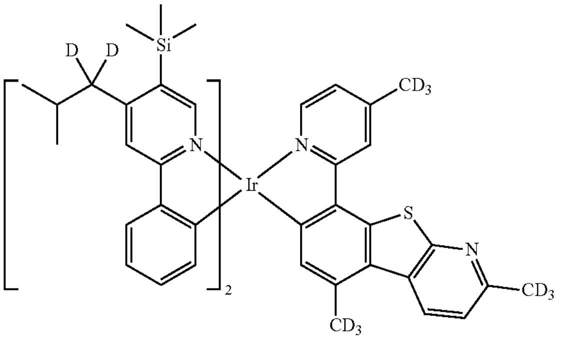

-continued
1283
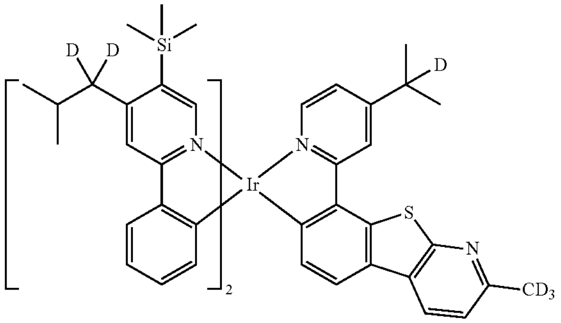
1284
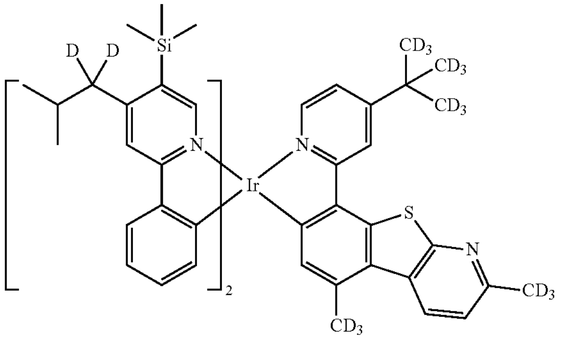
1285
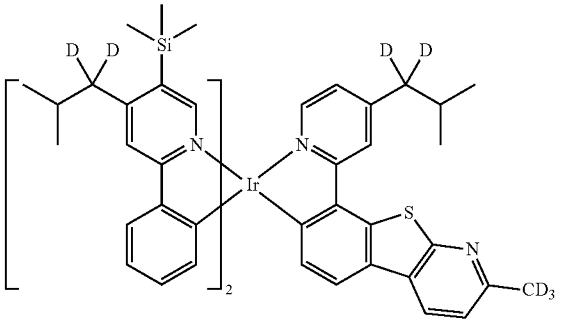
1286
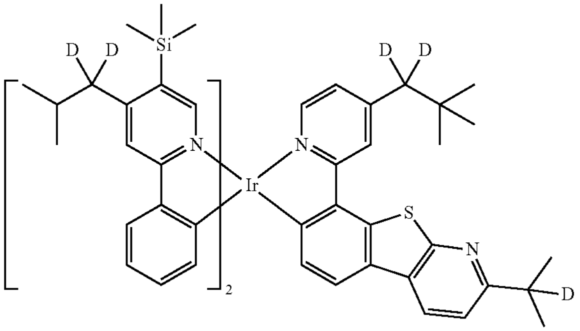
-continued
1287
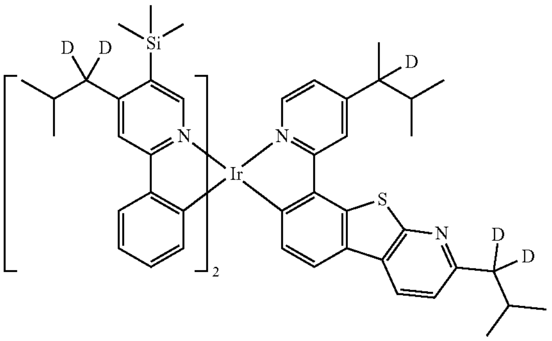
1288
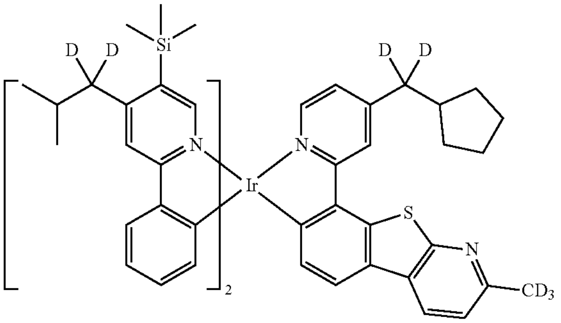
1289
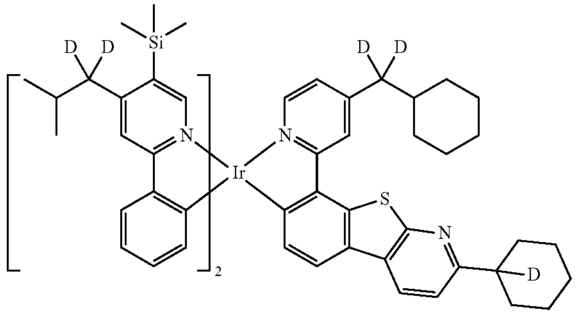
1290
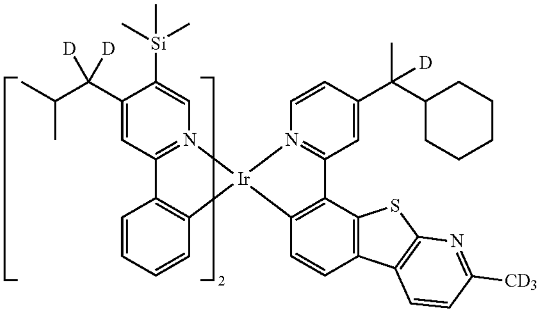

-continued
1291
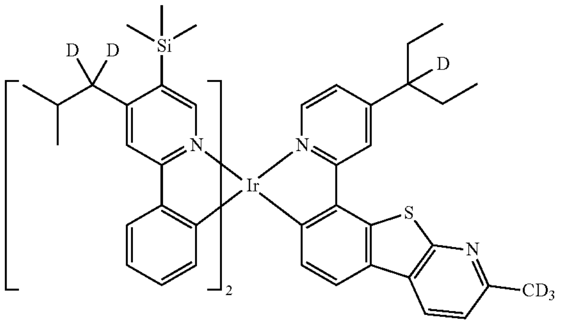
1292
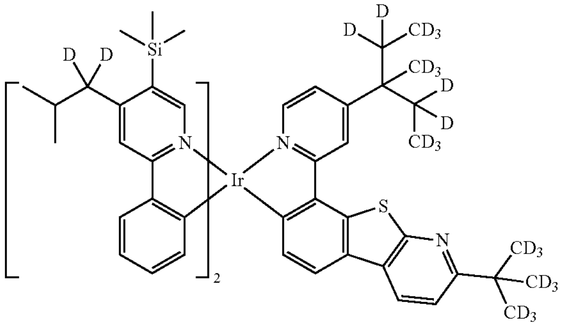
1293
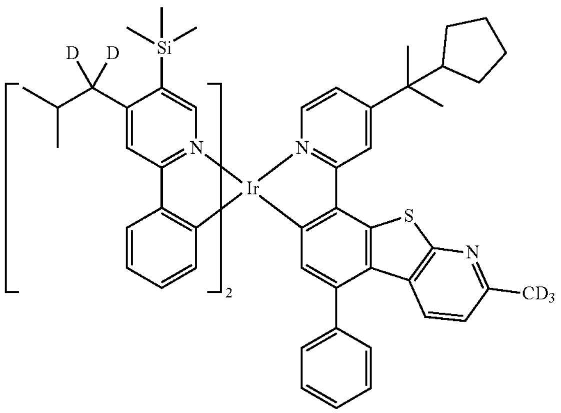
1294
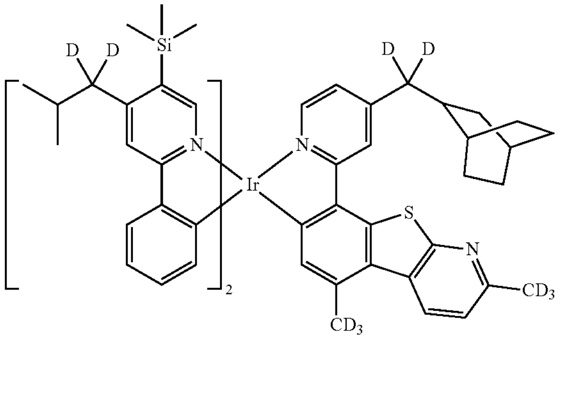
-continued
1295
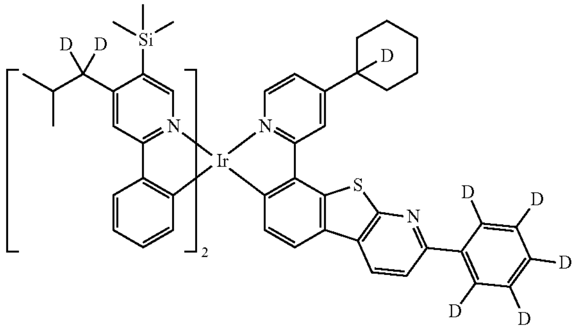
1296
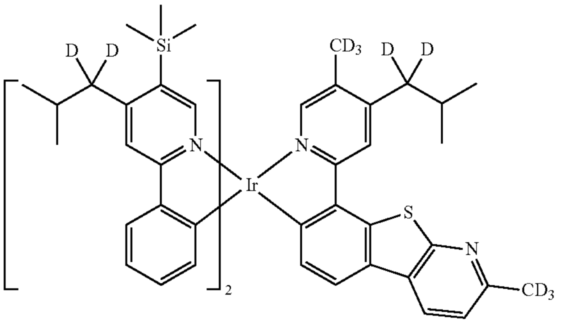
1297
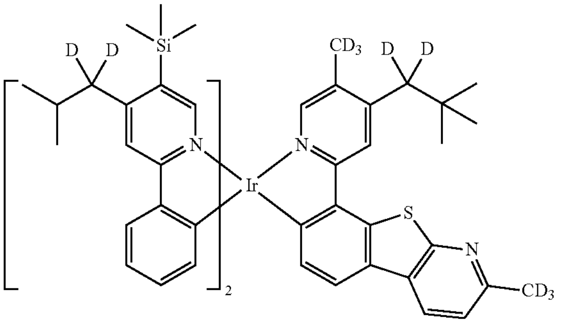
1298
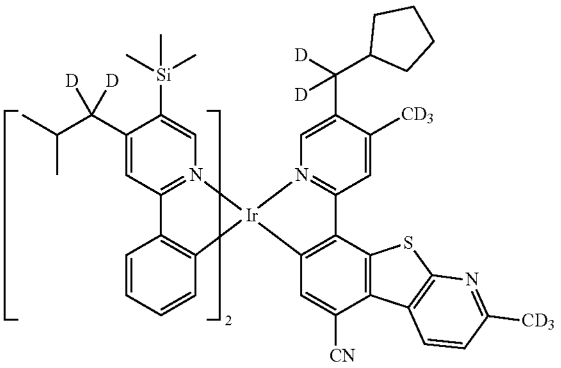

-continued
1299
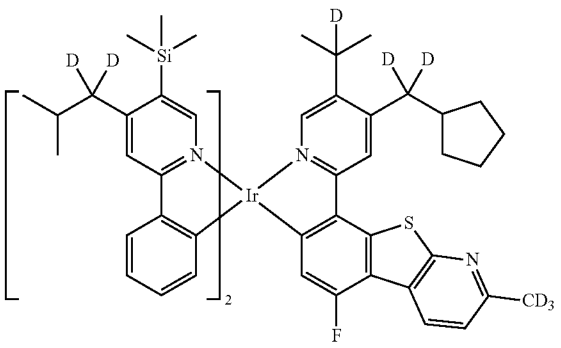
1300
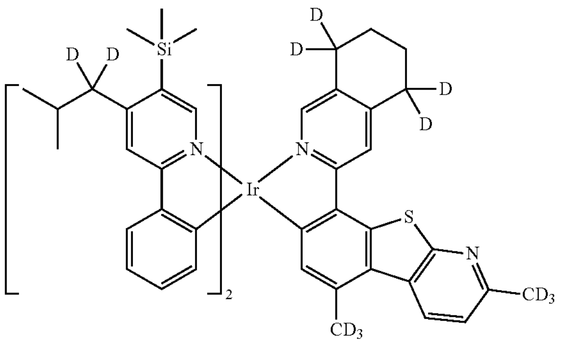
1301
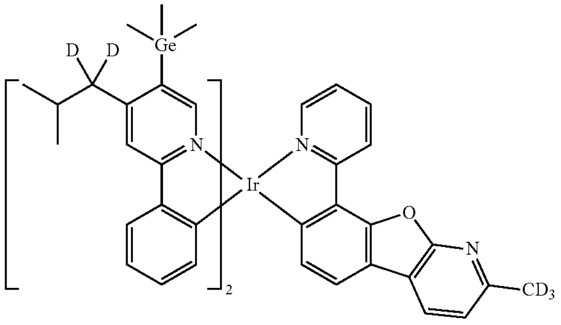
1302
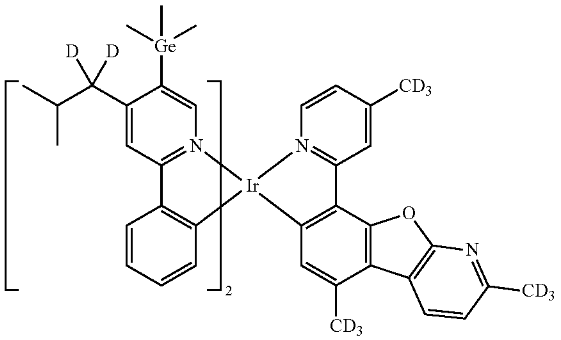
-continued
1303
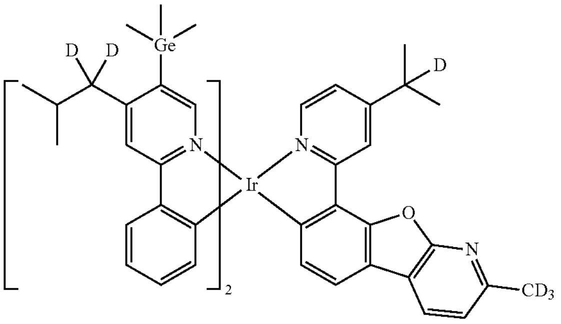
1304
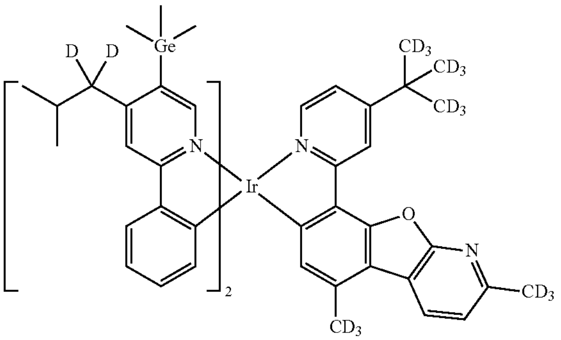
1305
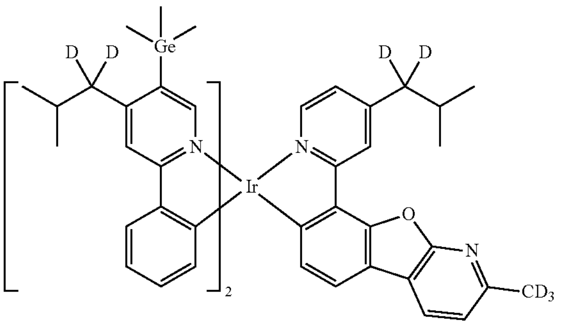
1306
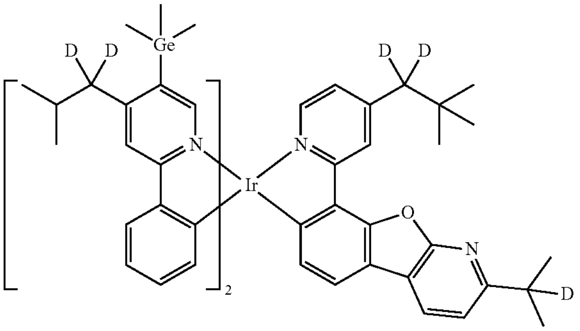

-continued
1307
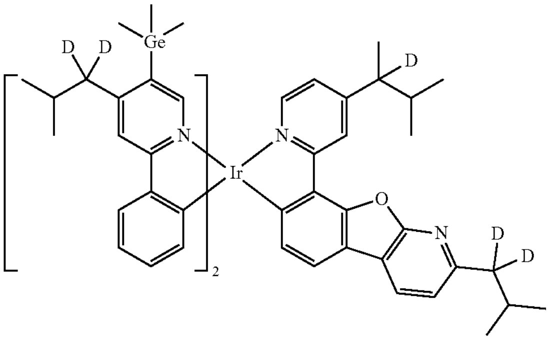
1308
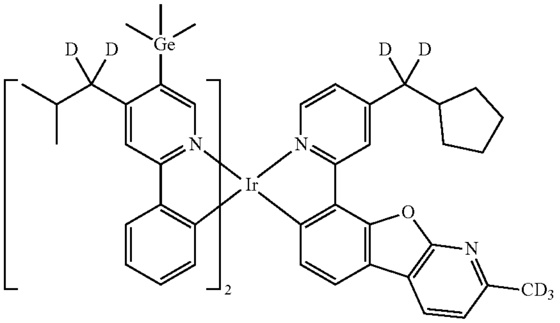
1309
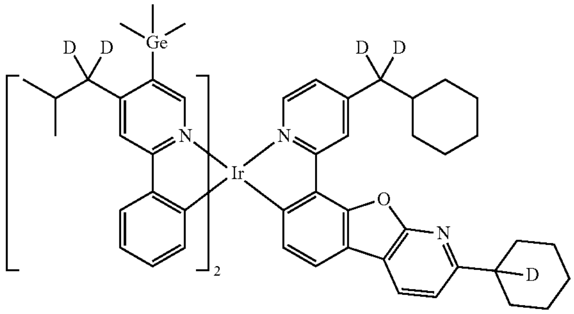
1310
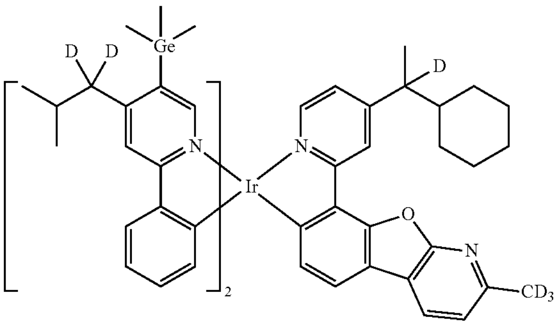
-continued
1311
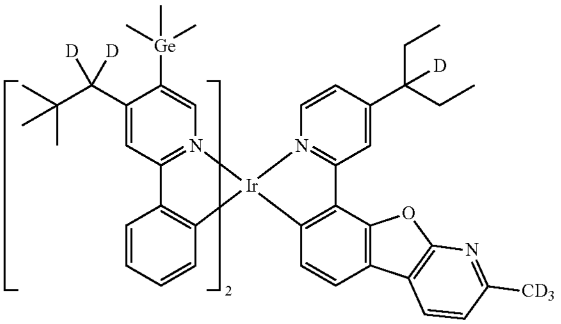
1312
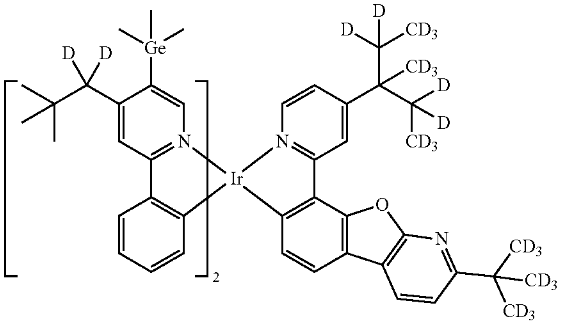
1313
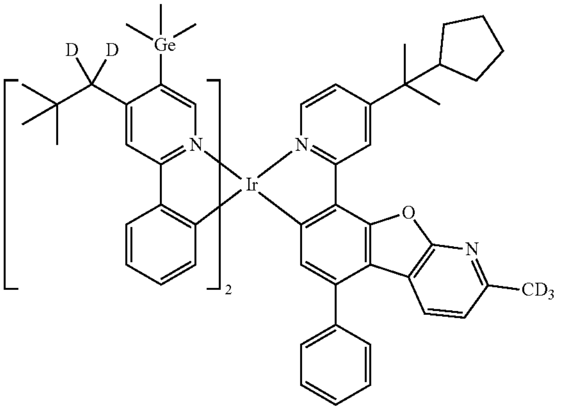
1314
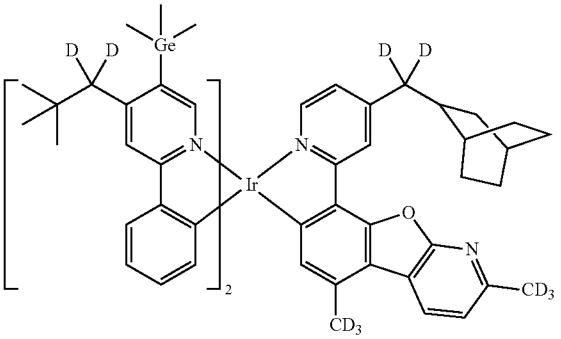

-continued
1315
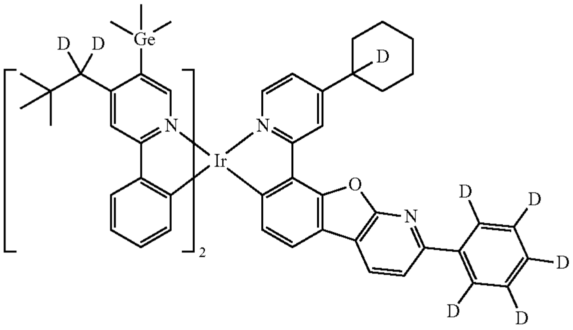
1316
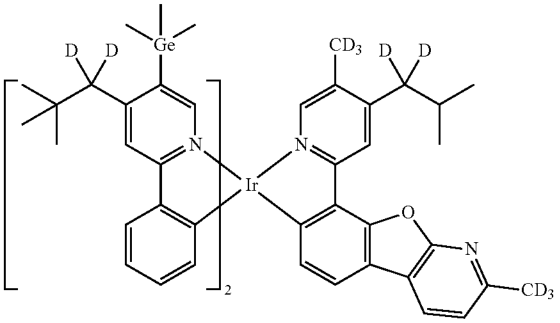
1317
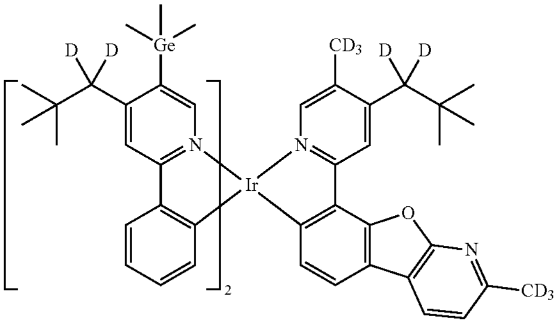
1318
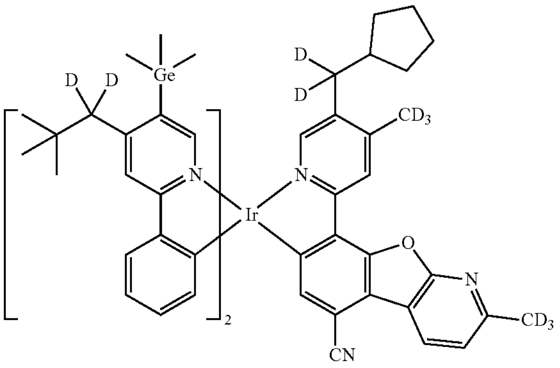
-continued
1319
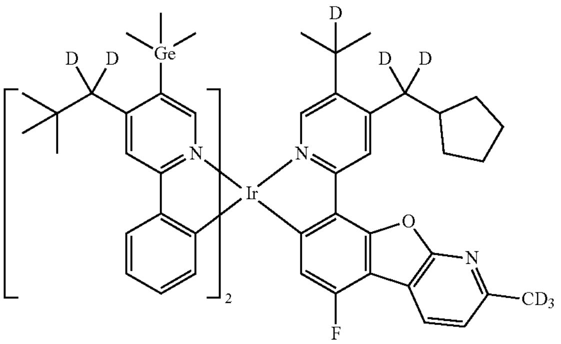
1320
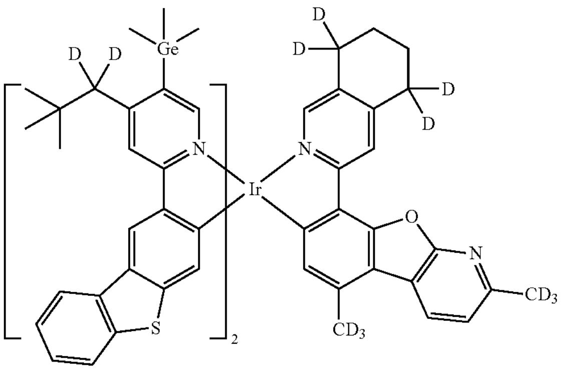
1321
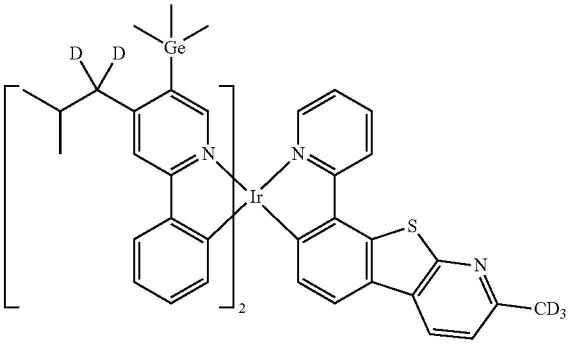
1322
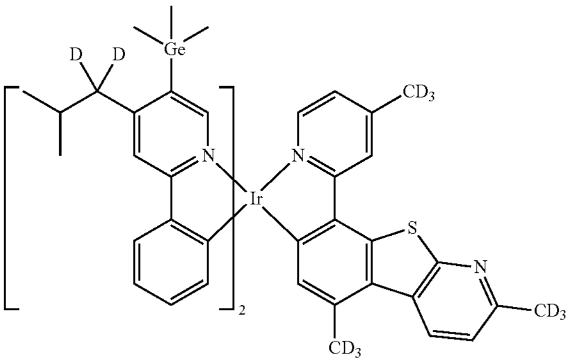

-continued
1323
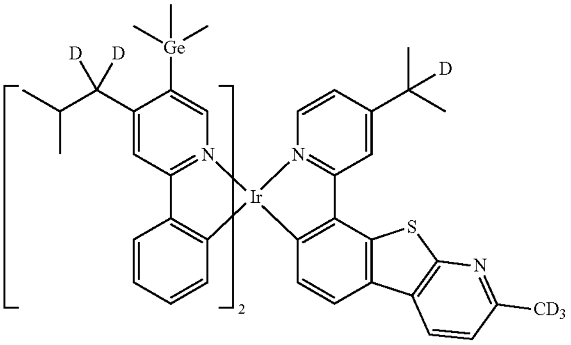
1324
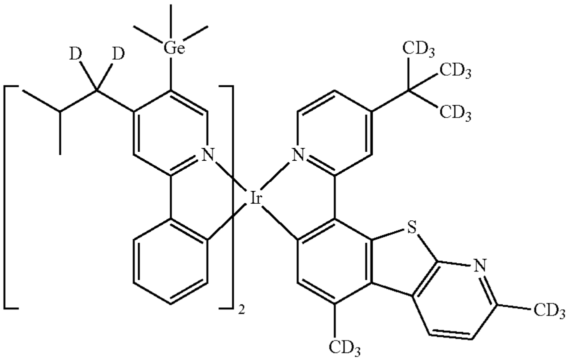
1325
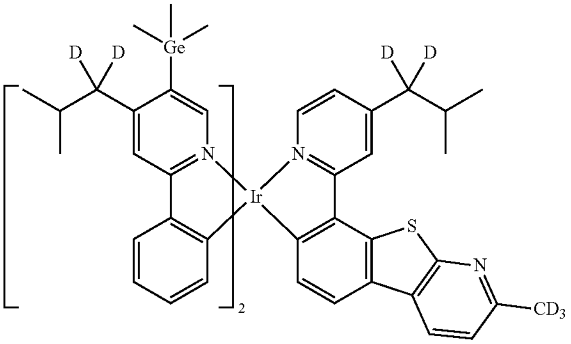
1326
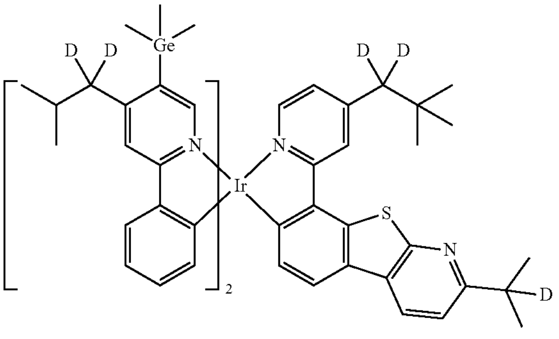
-continued
1327
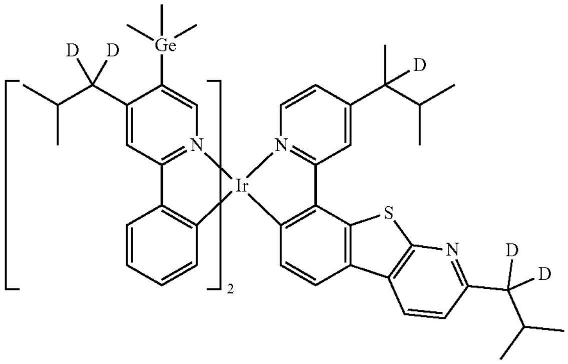
1328
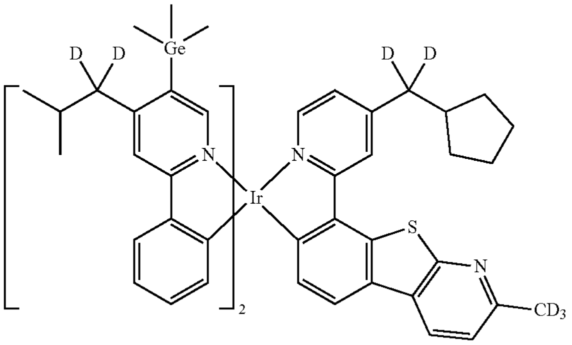
1329
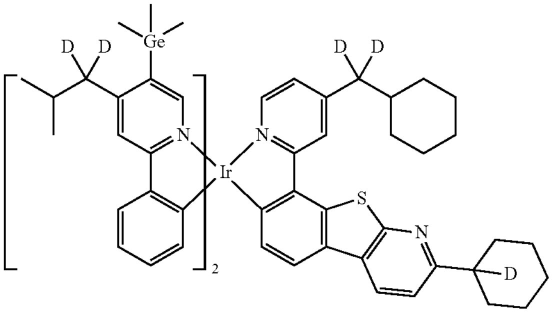
1330
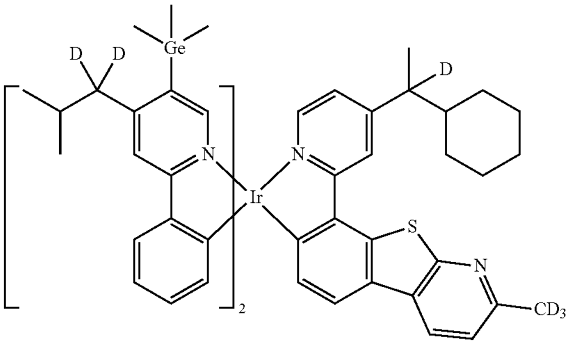

-continued
1331
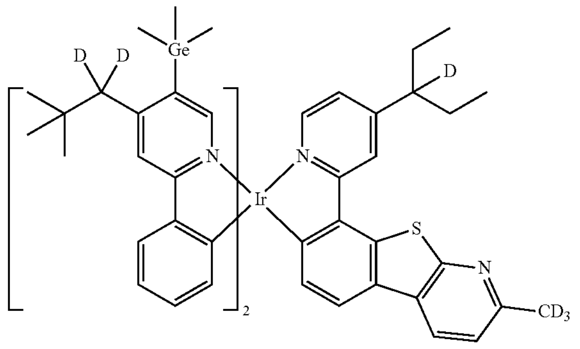
1332
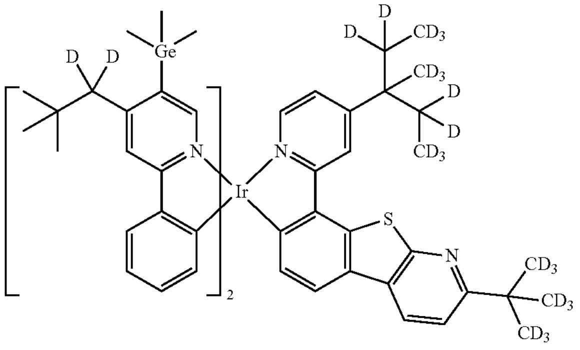
1333
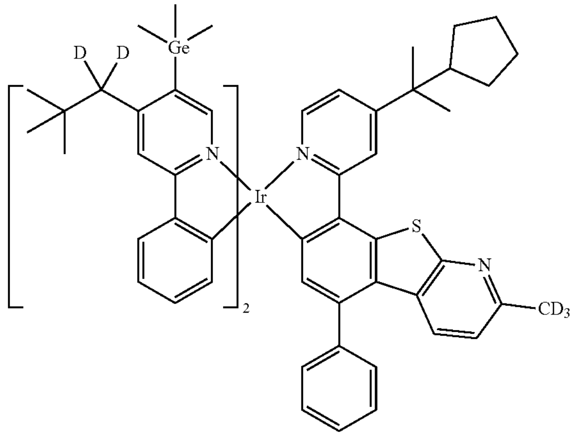
1334
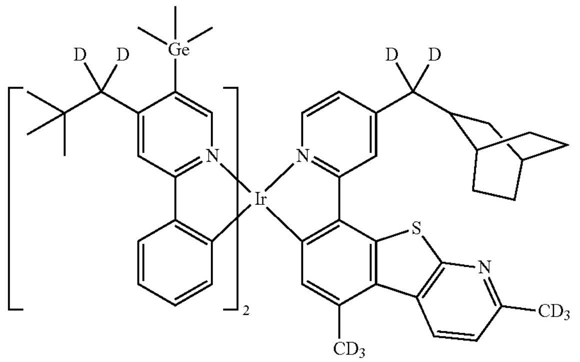
-continued
1335
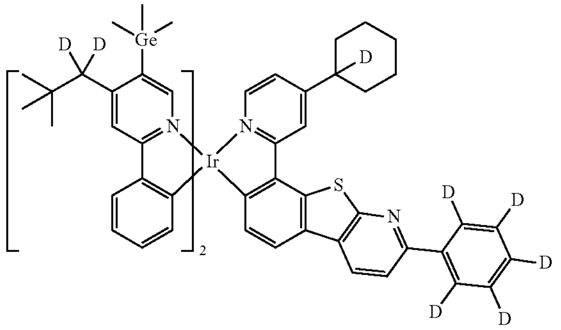
1336
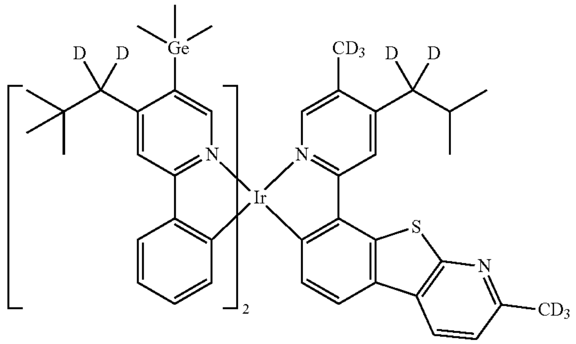
1337
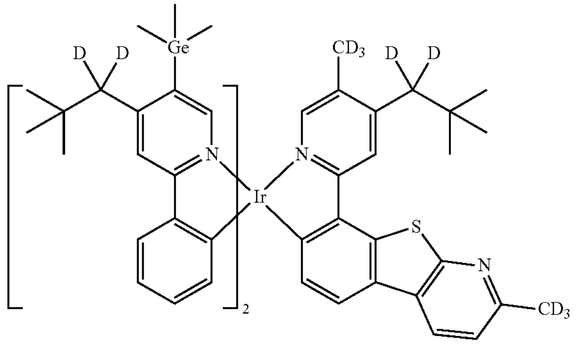
1338
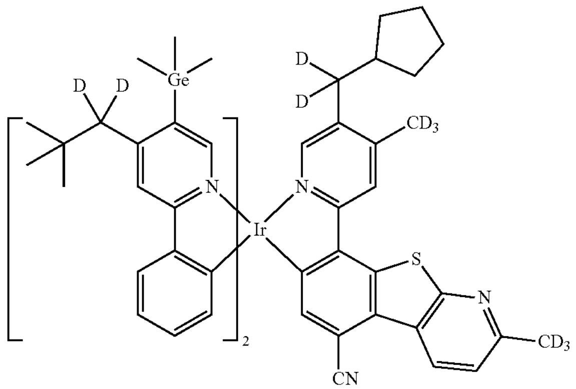

-continued
1339
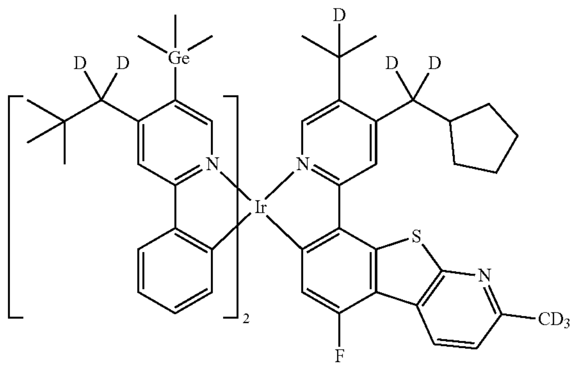
1340
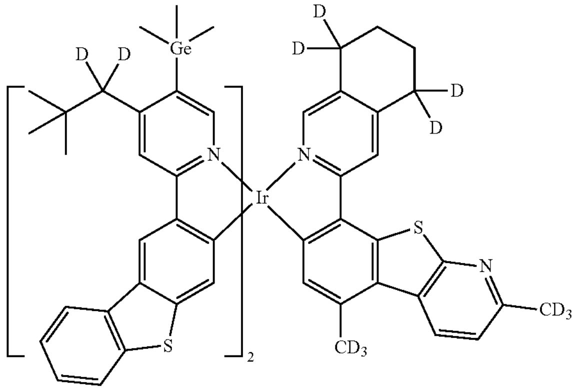
1341
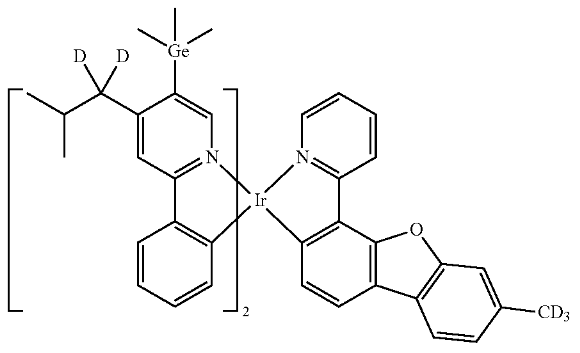
1342
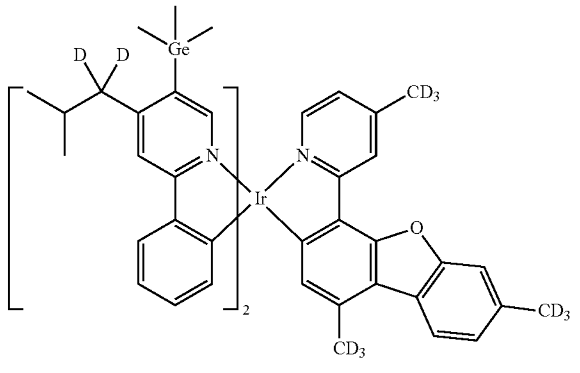
-continued
1343
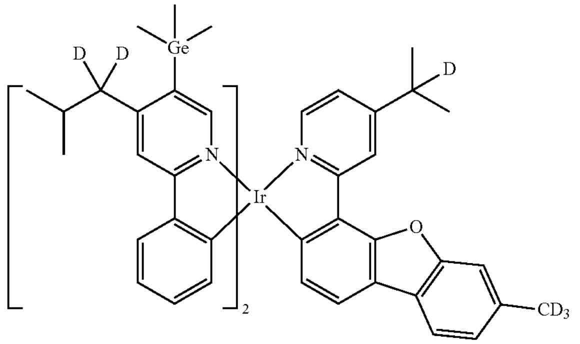
1344
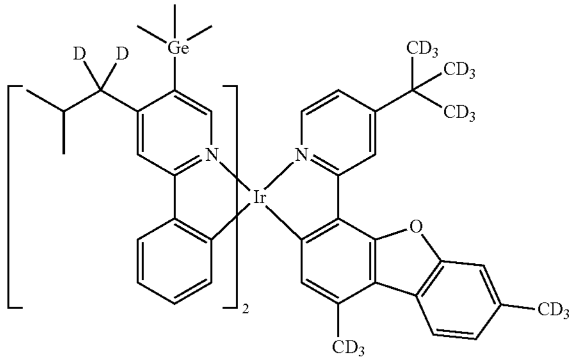
1345
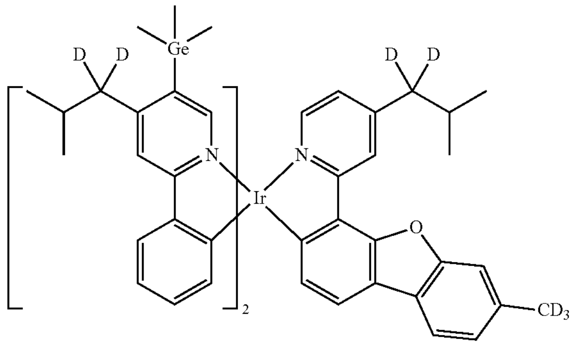
1346
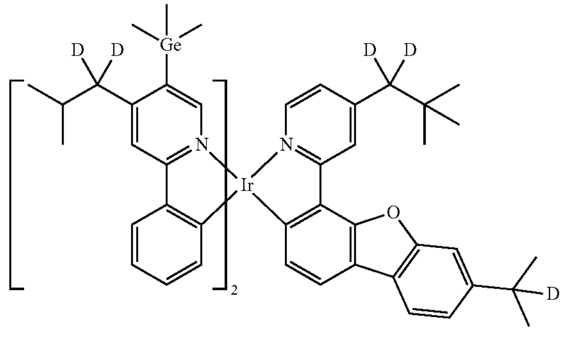

-continued
1347
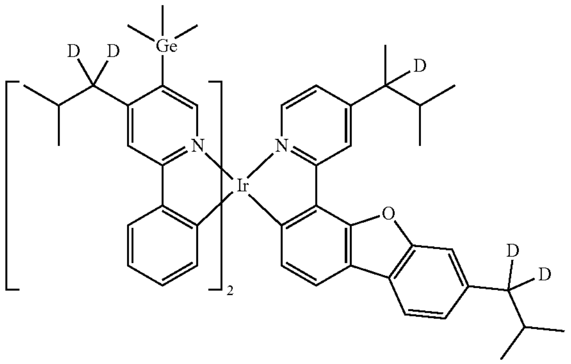
1348
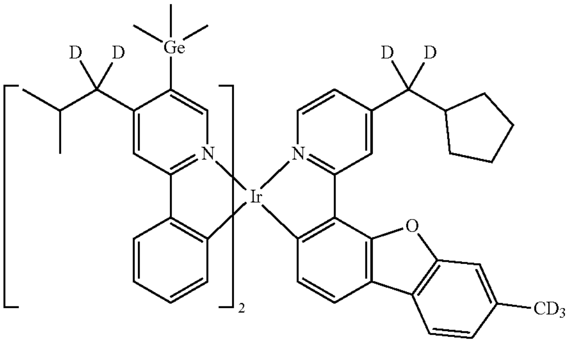
1349
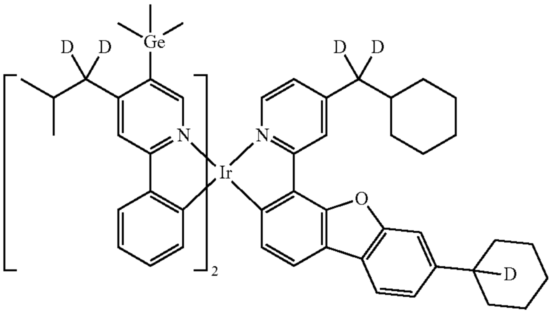
1350
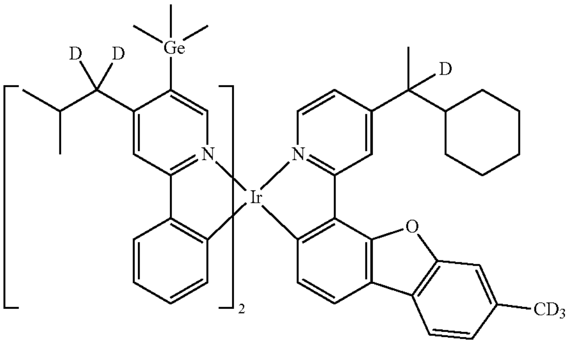
-continued
1351
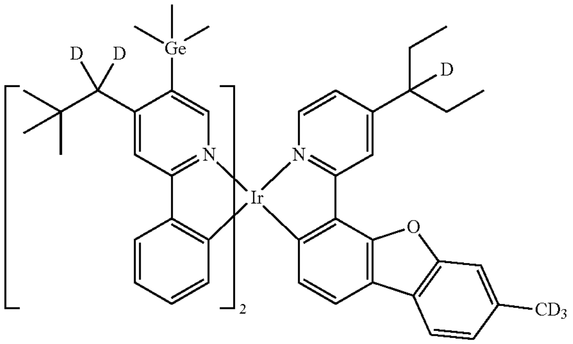
1352
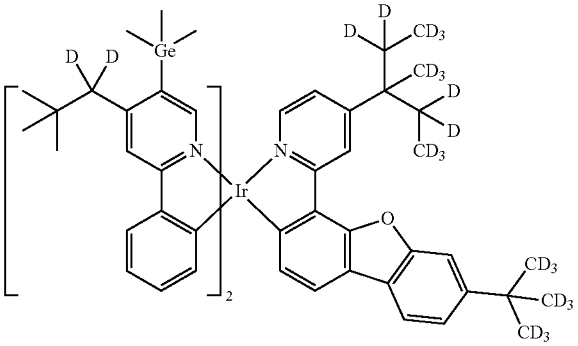
1353
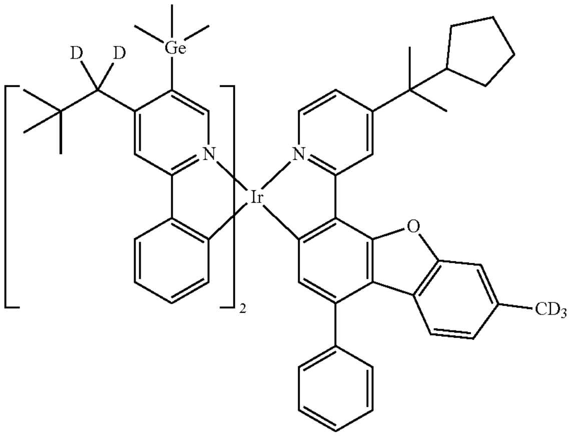
1354
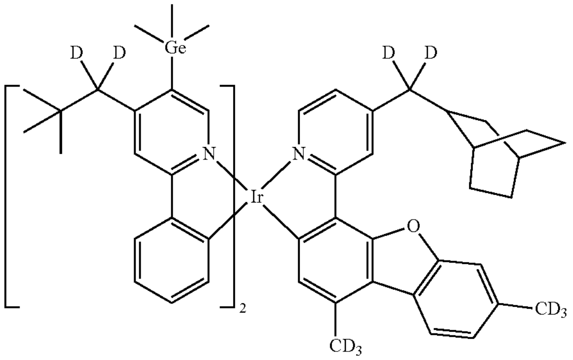

-continued
1355
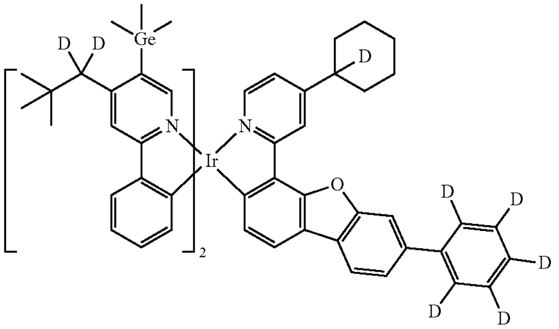
1356
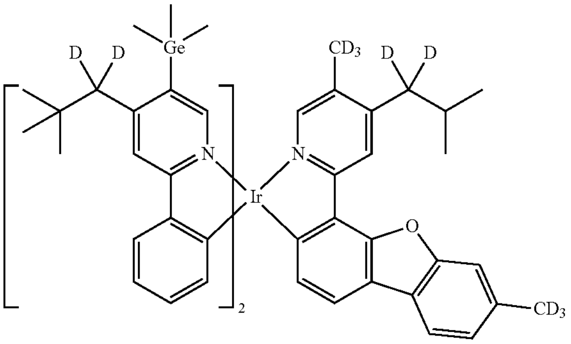
1357
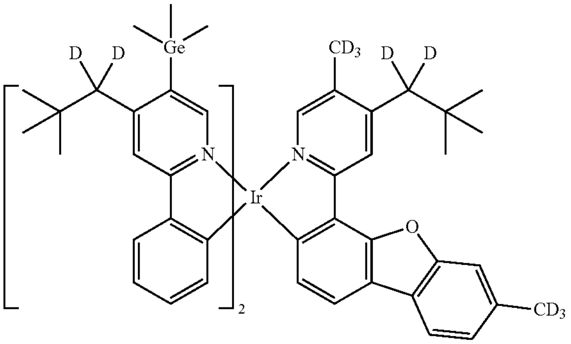
1358
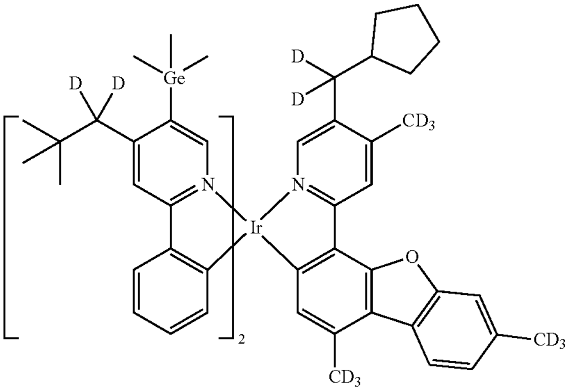
1359
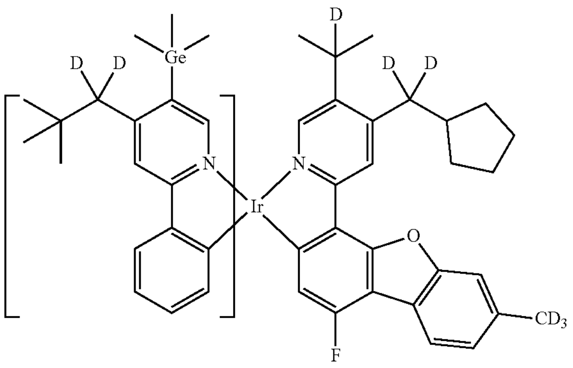
1360
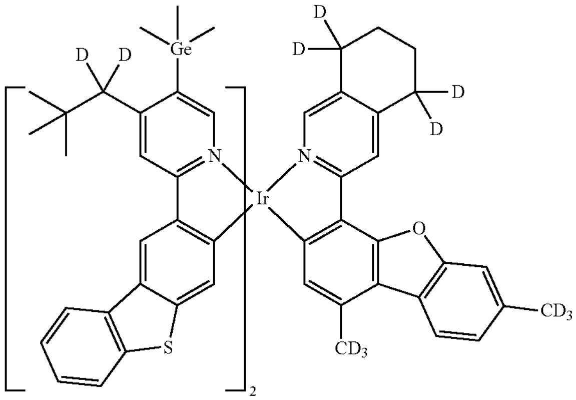
1361
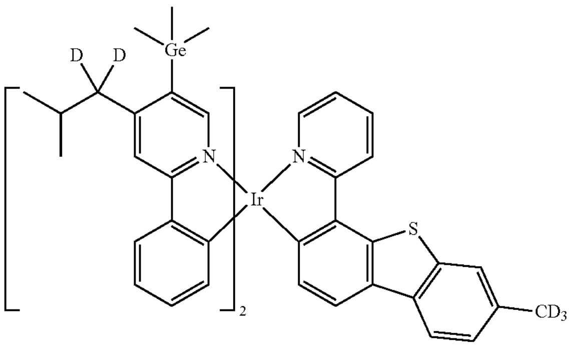
1362
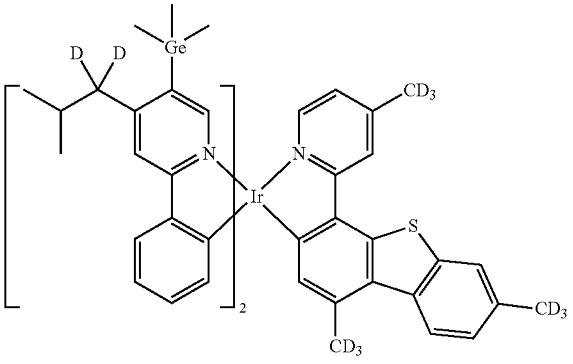

-continued
1363
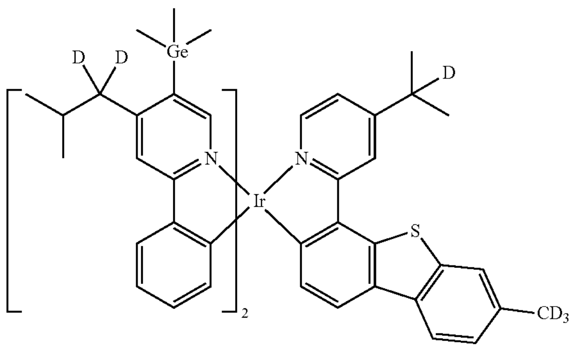
1364
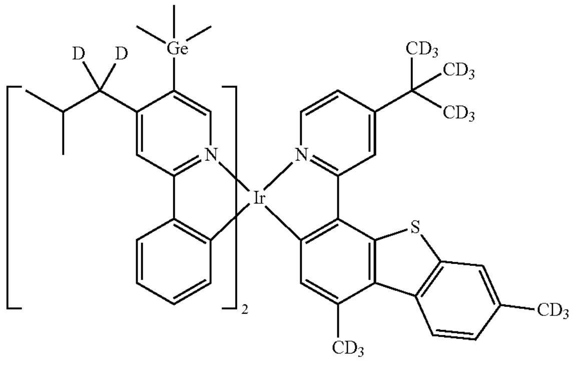
1365
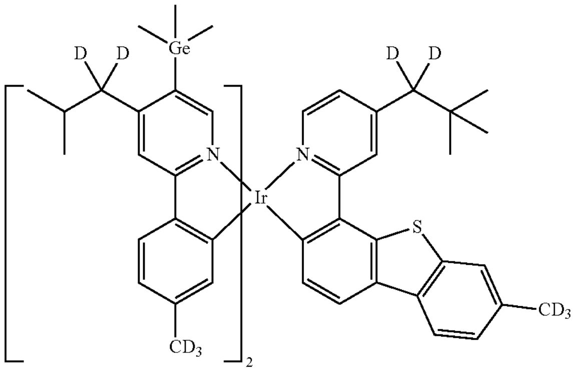
1366
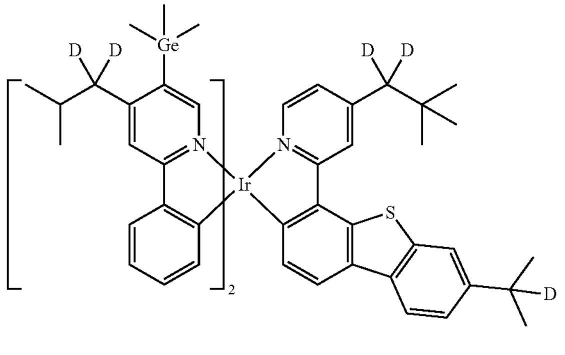
-continued
1367
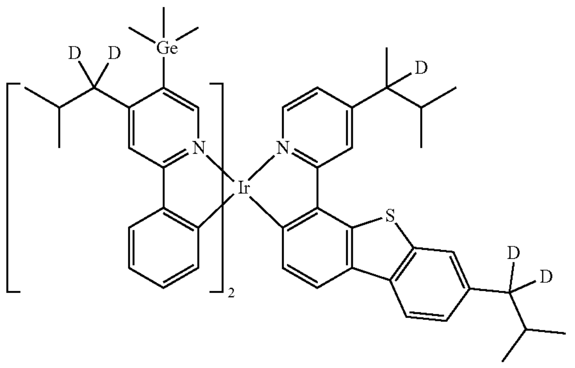
1368
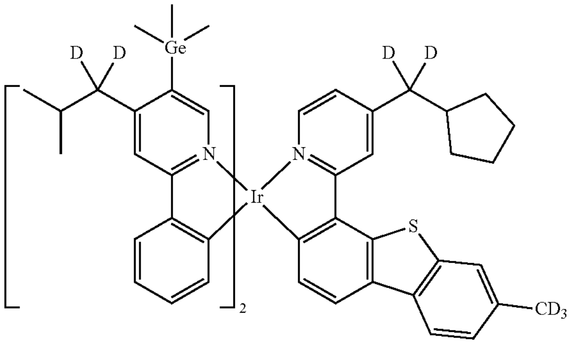
1369
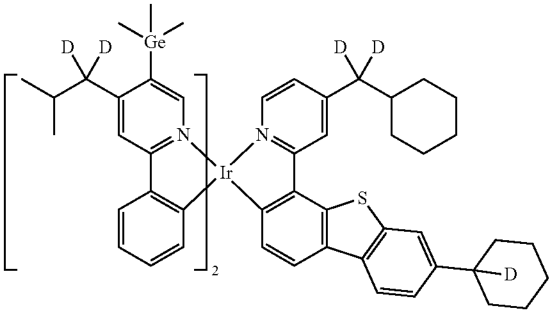
1370
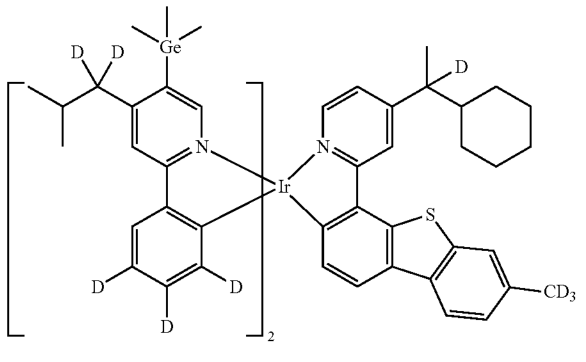

-continued
1371
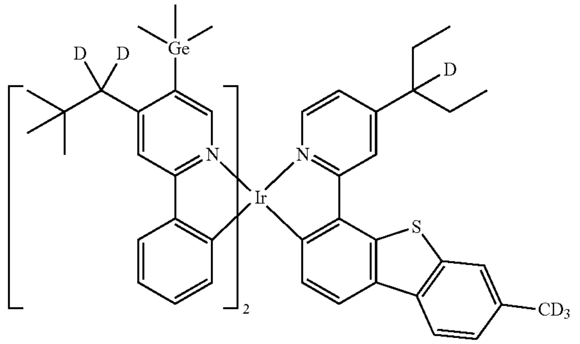
1372
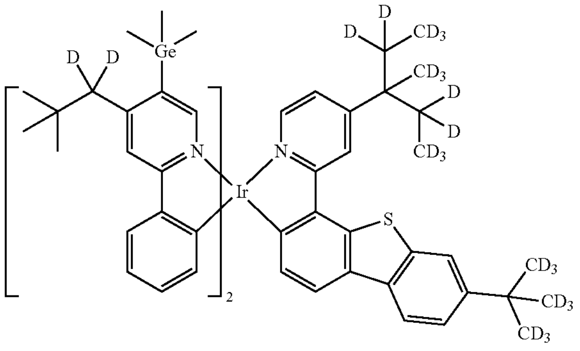
1373
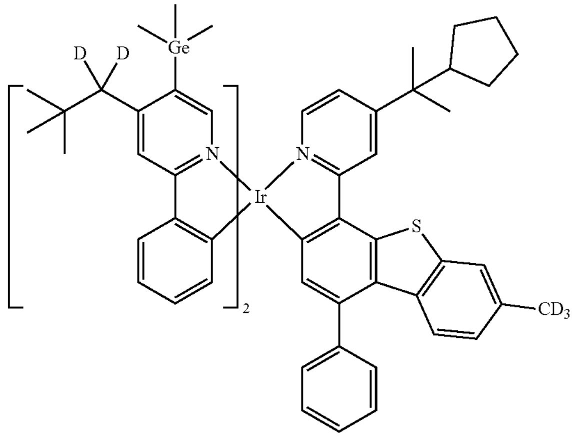
1374
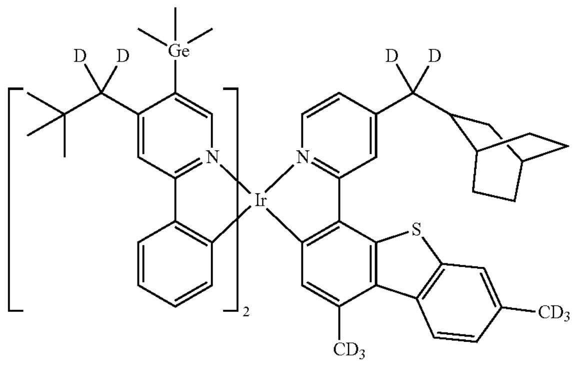
-continued
1375
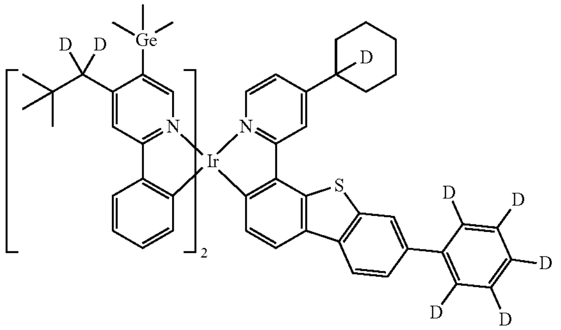
1376
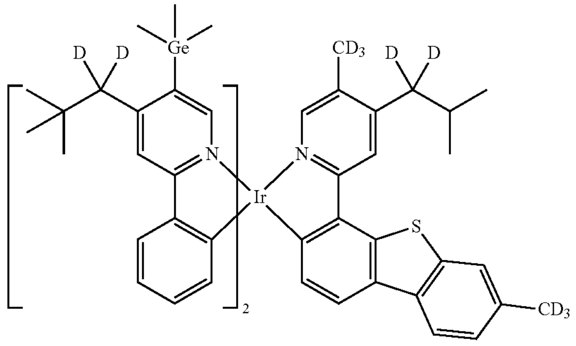
1377
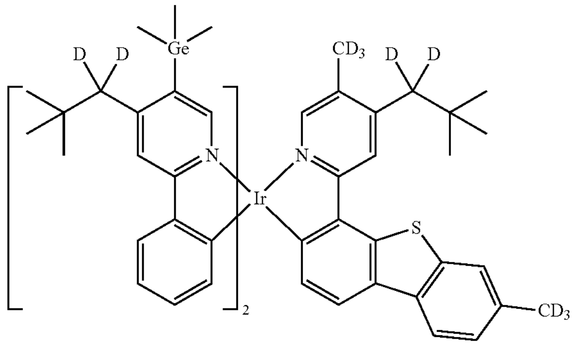
1378
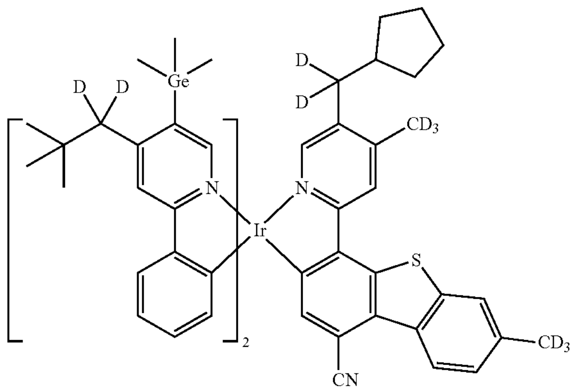

-continued
1379
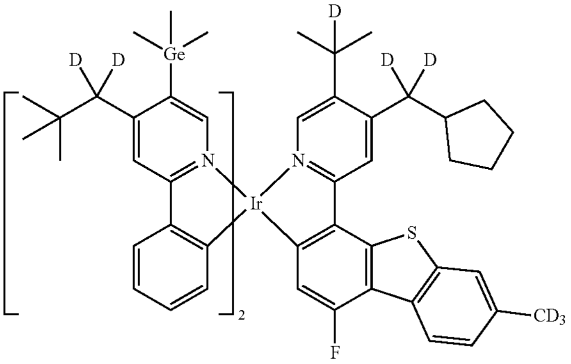
1380
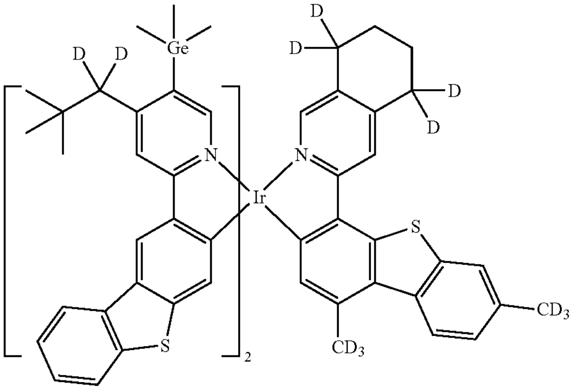
1381
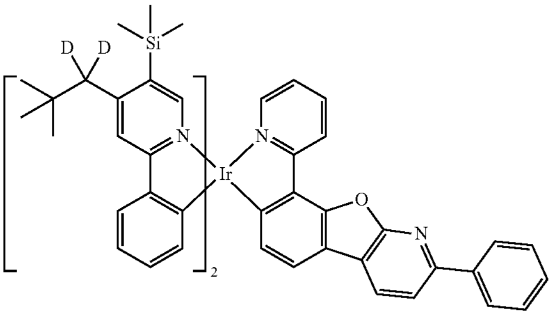
1382
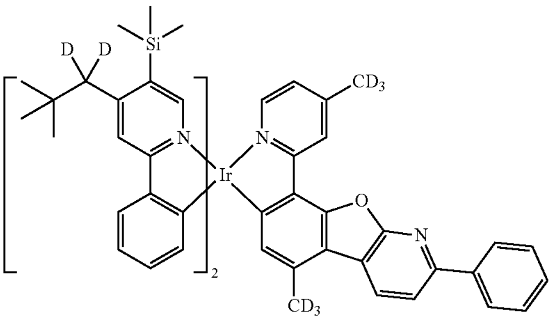
-continued
1383
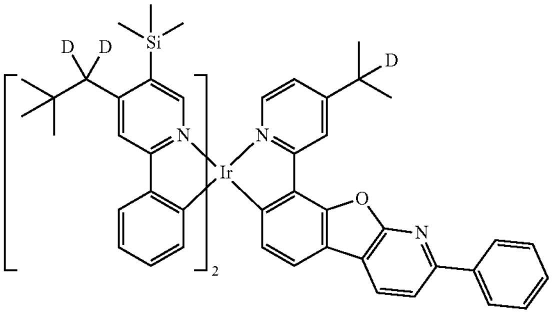
1384
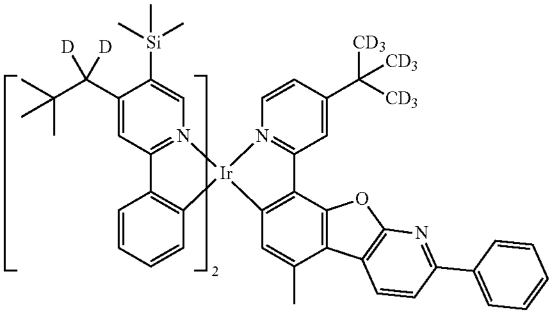
1385
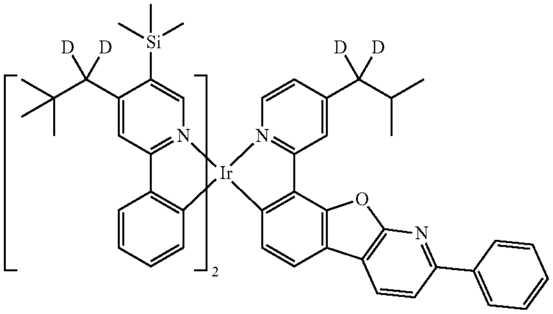
1386
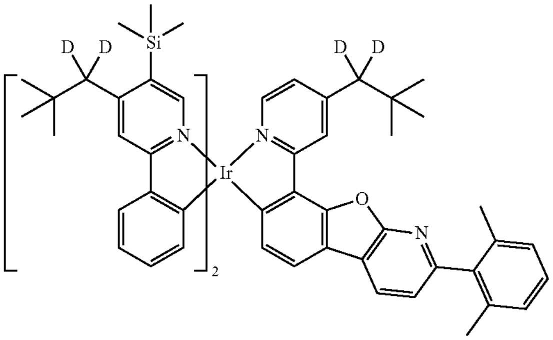

1387
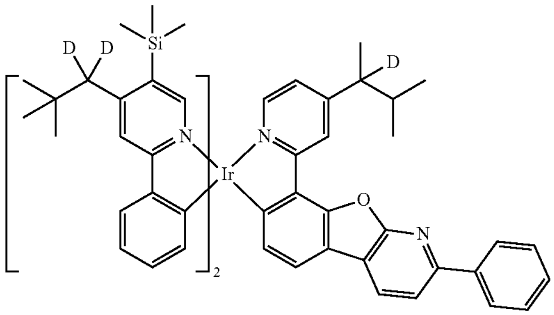
1388
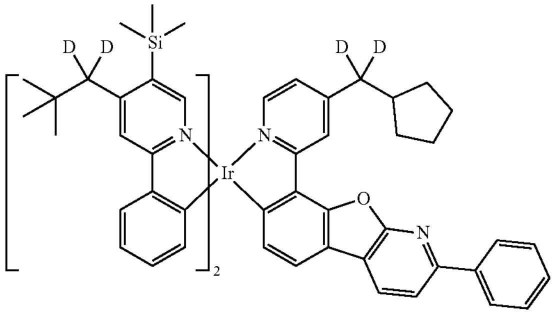
1389
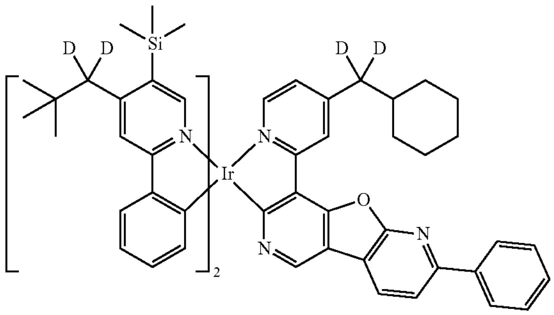
1390
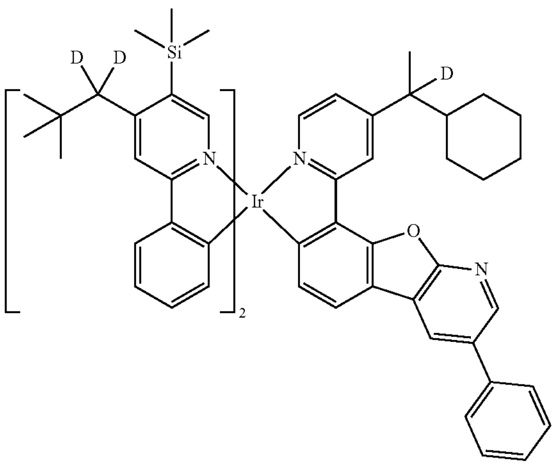
1391
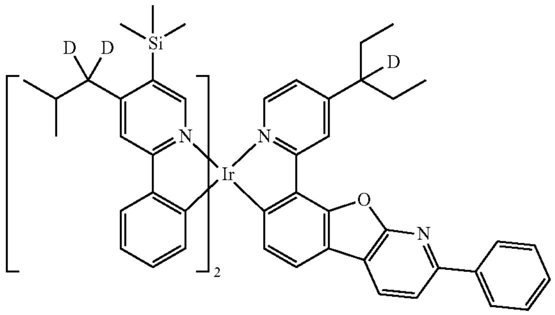
1392
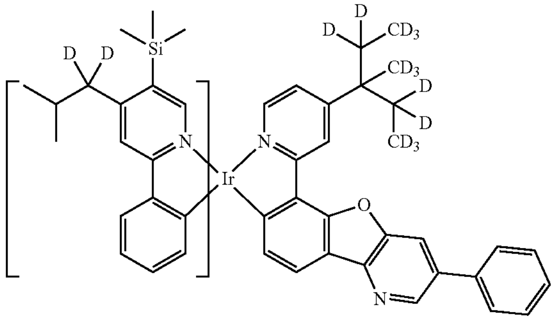
1393
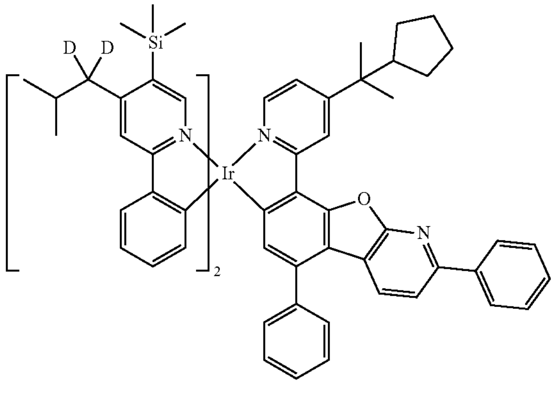
1394
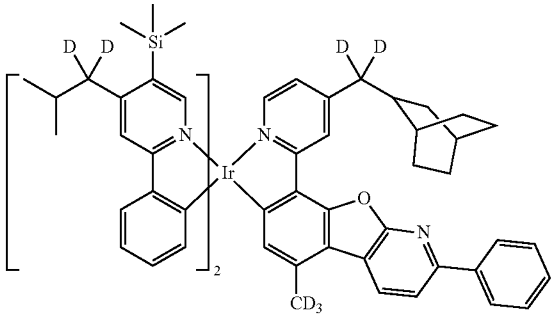

-continued
1395
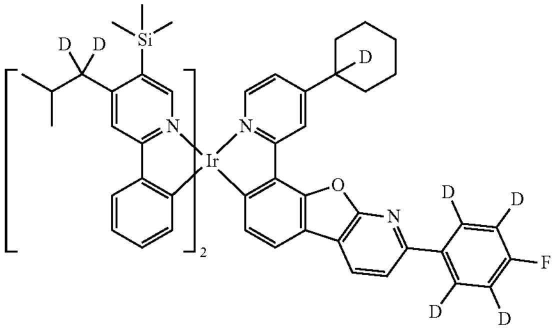
1396
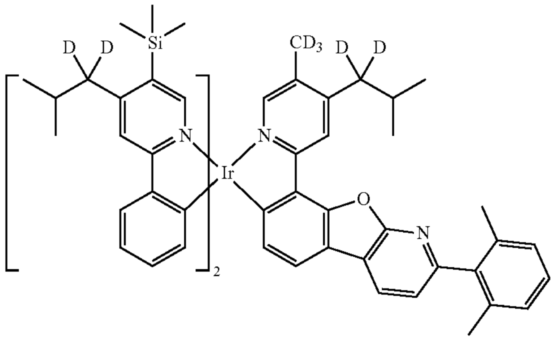
1397
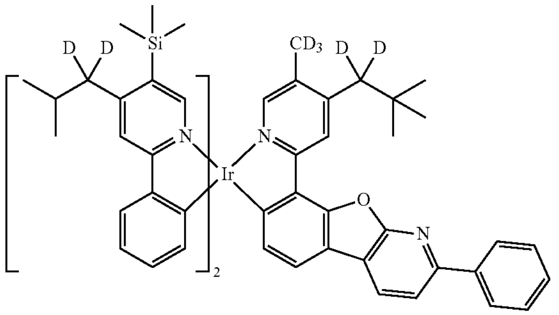
1398
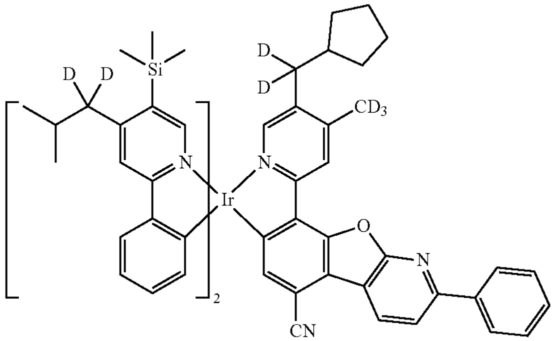
-continued
1399
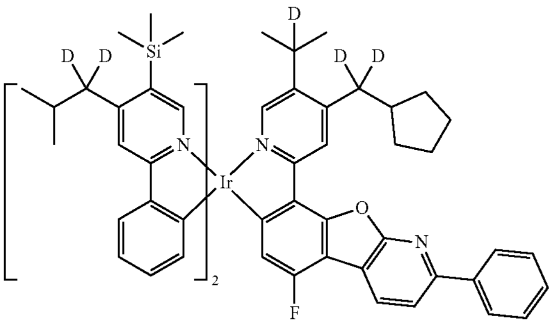
1400
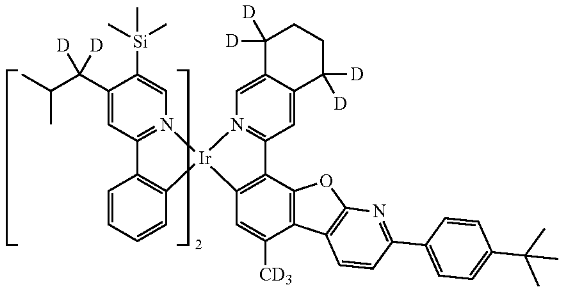
1401
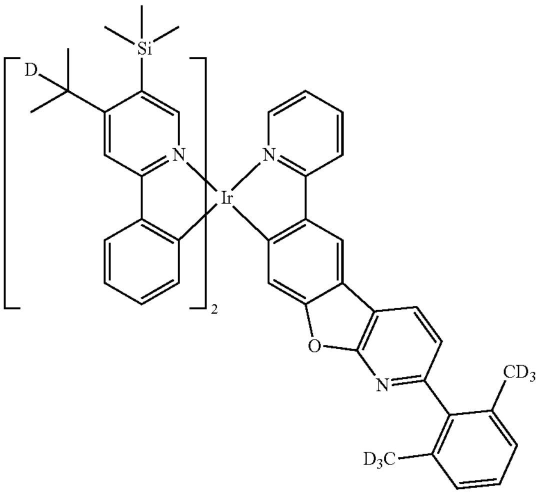

-continued
1402
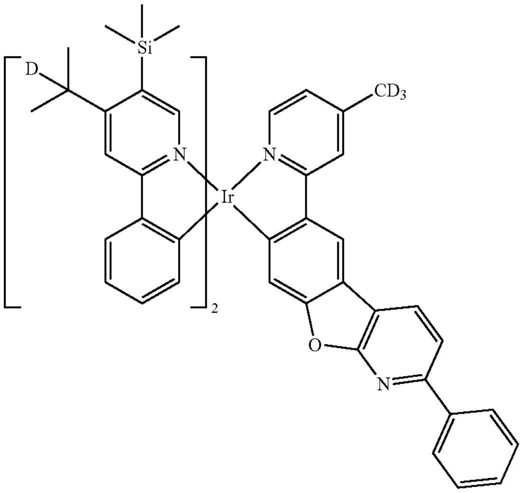
1403
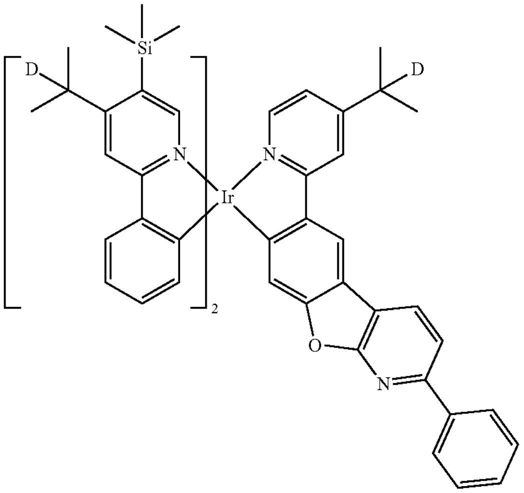
1404
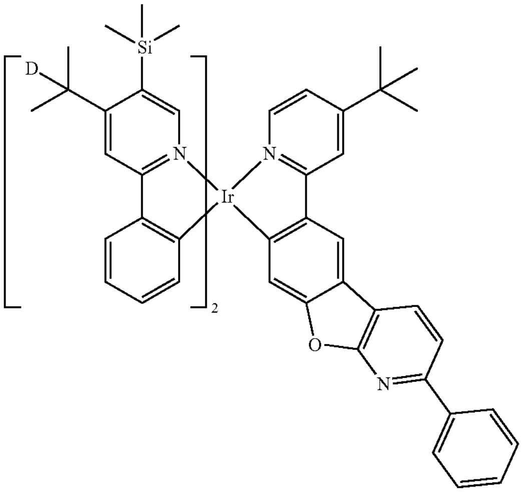
-continued
1405
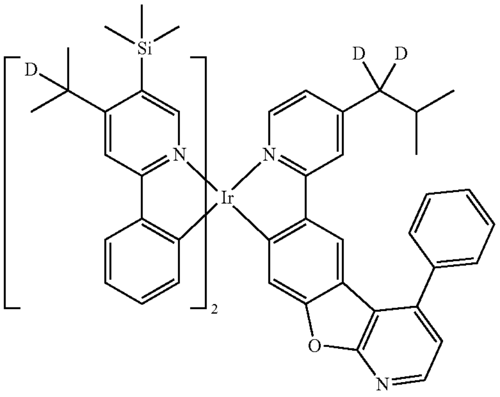
1406
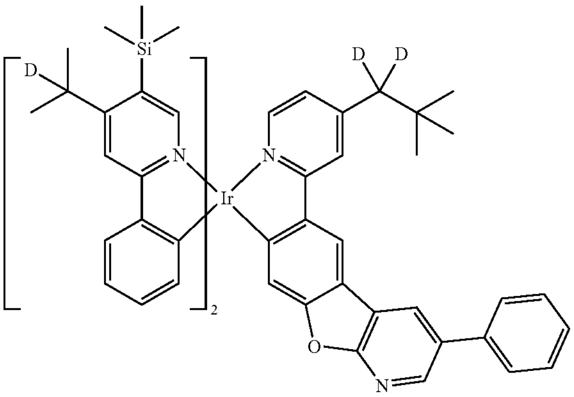
1407
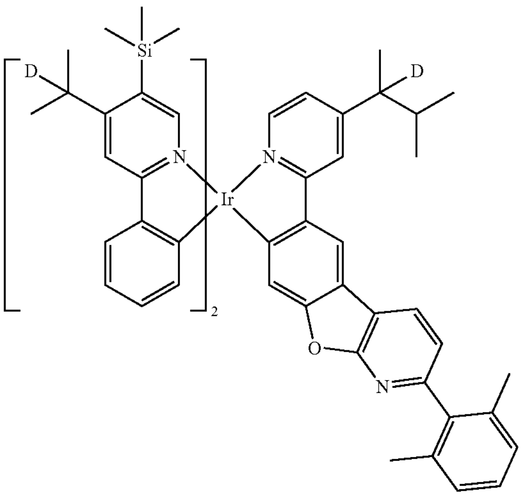

-continued
1408
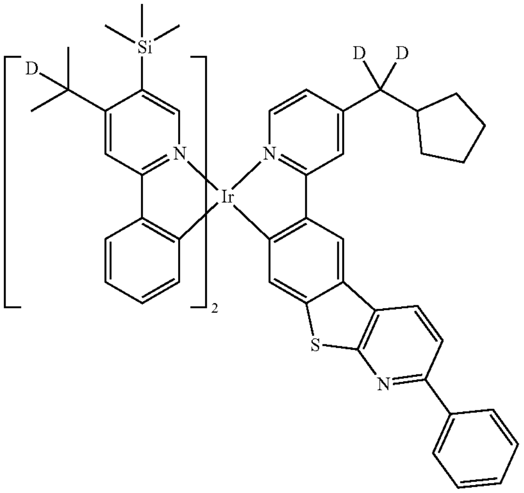
1409
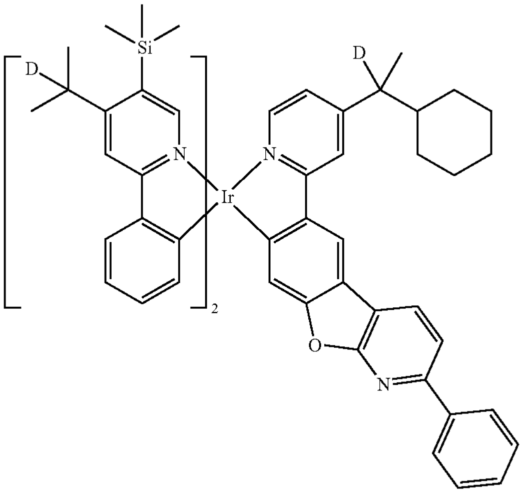
1410
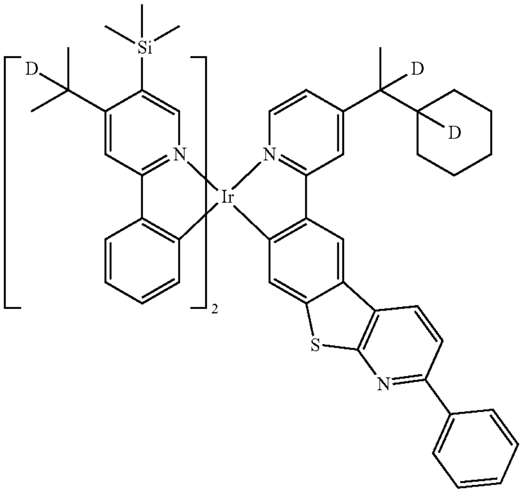
-continued
1411
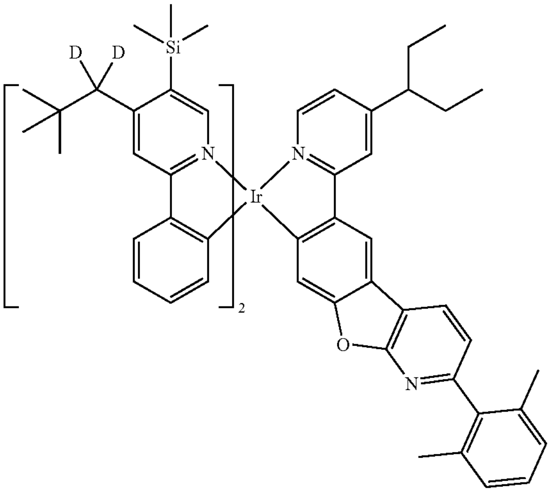
1412
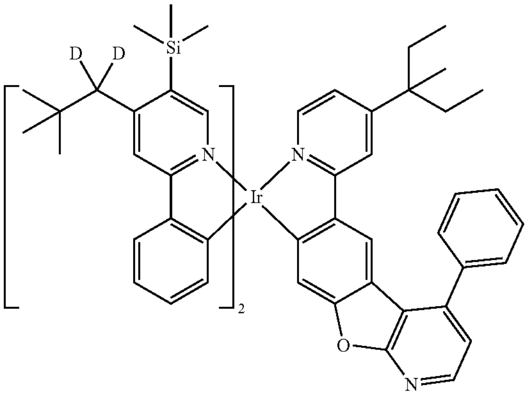
1413
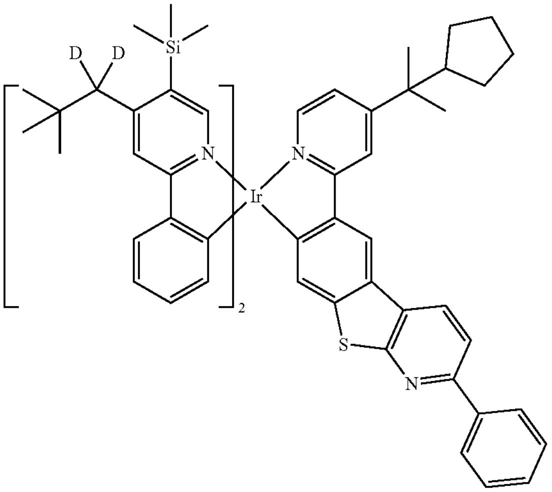

-continued
1414
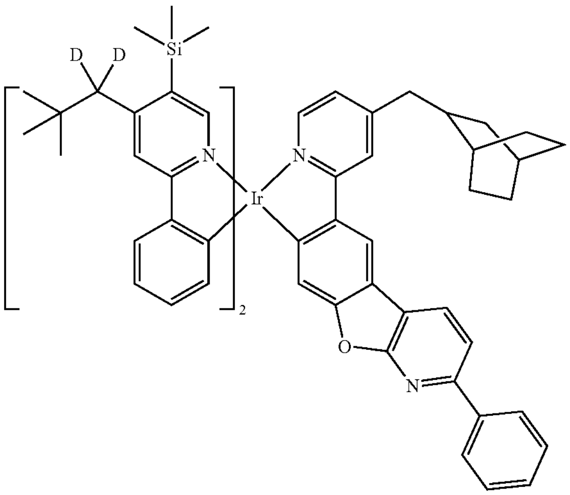
1415
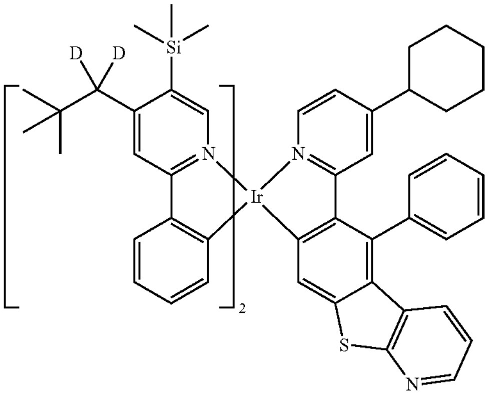
1416
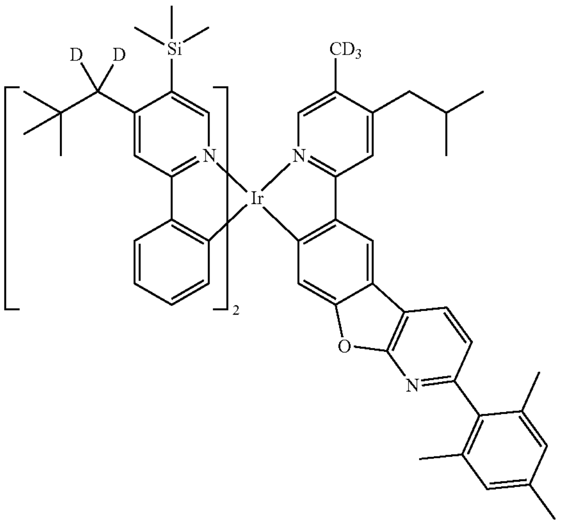
-continued
1417
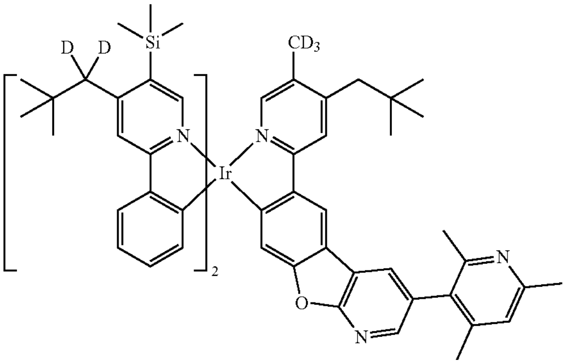
1418
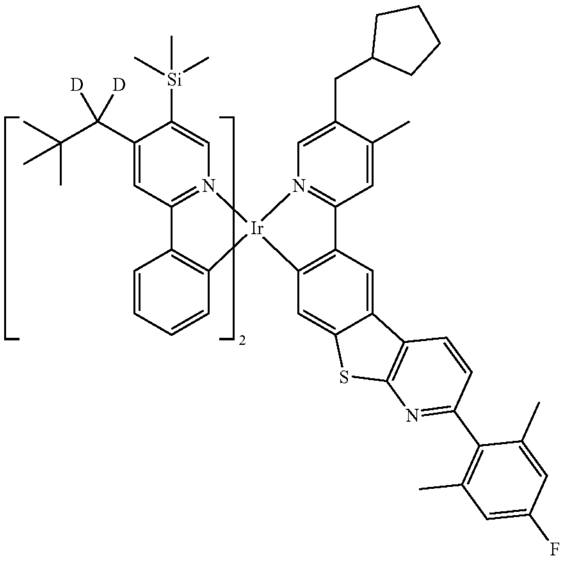
1419
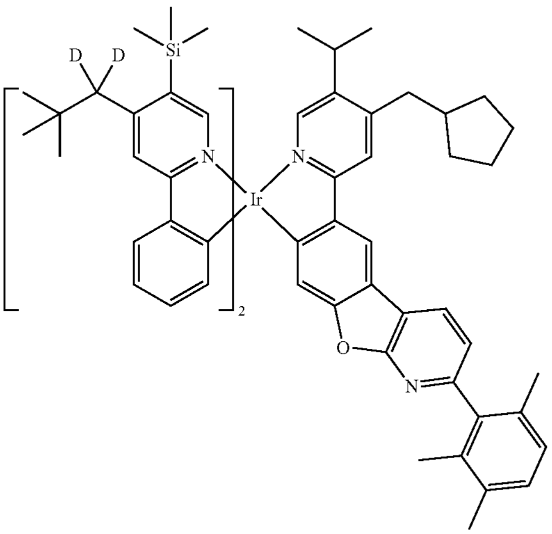

-continued
1420
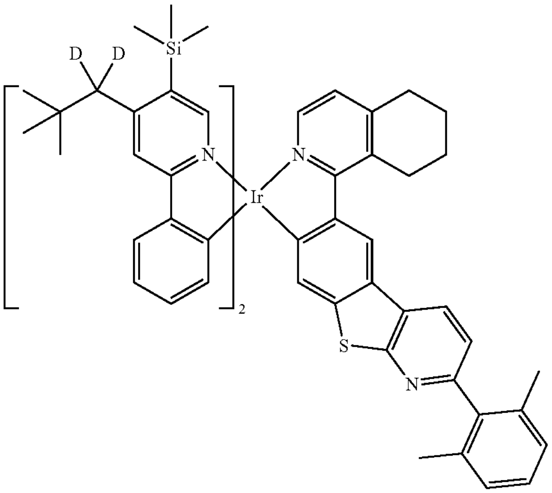
1421
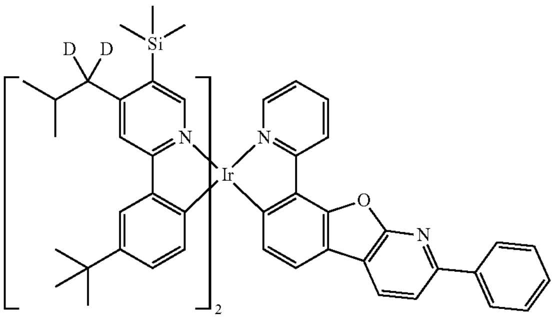
1422
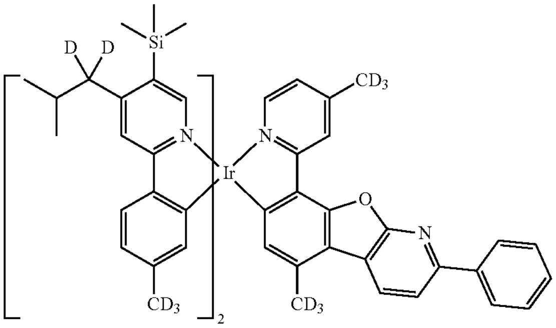
1423
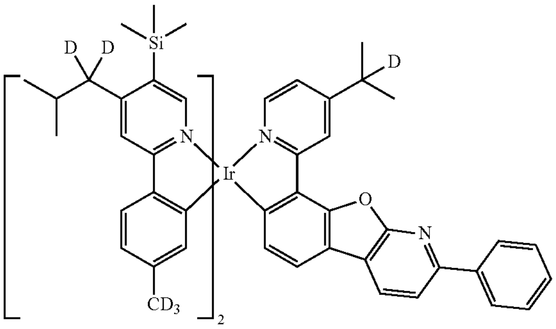
-continued
1424
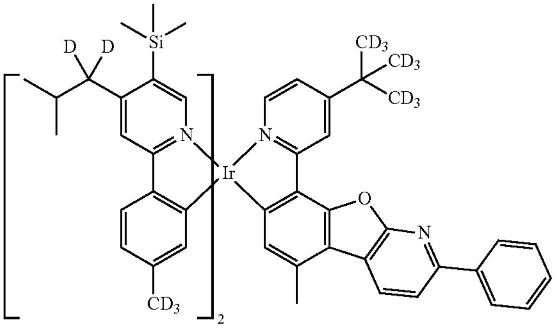
1425
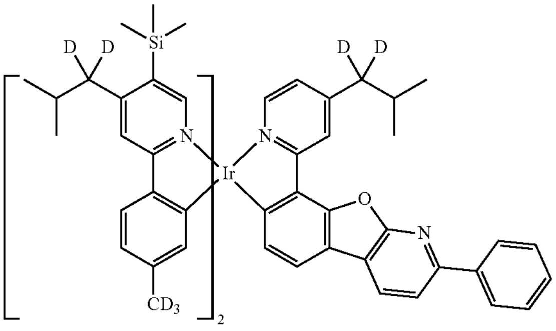
1426
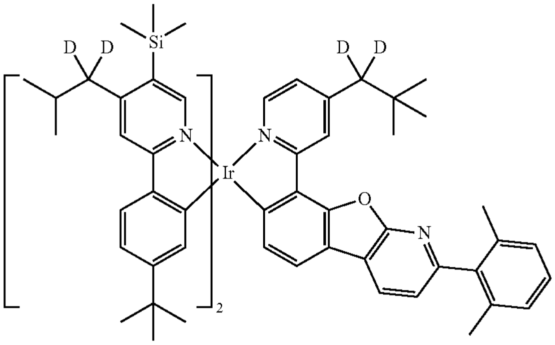
1427
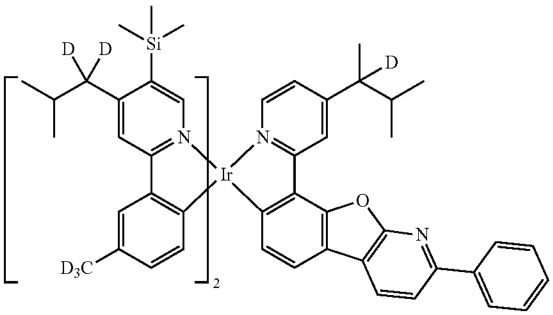

-continued
1428
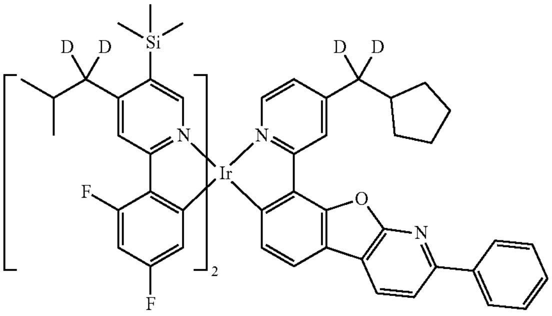
1429
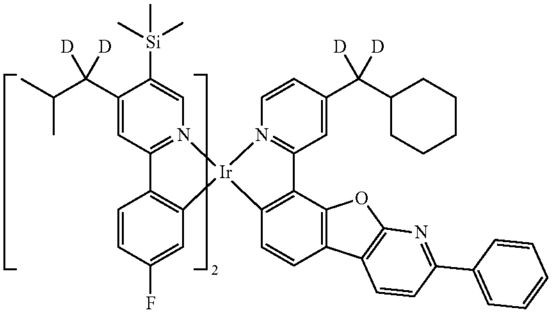
1430
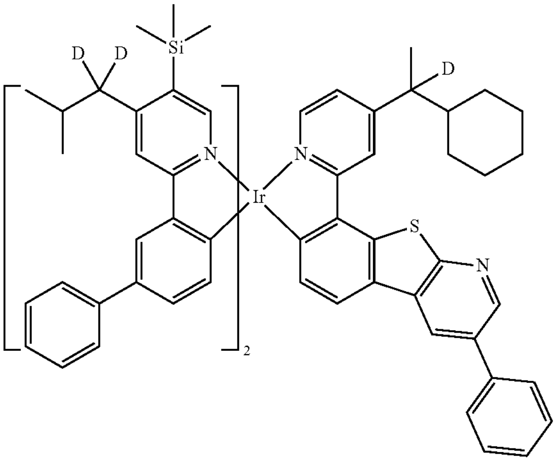
1431
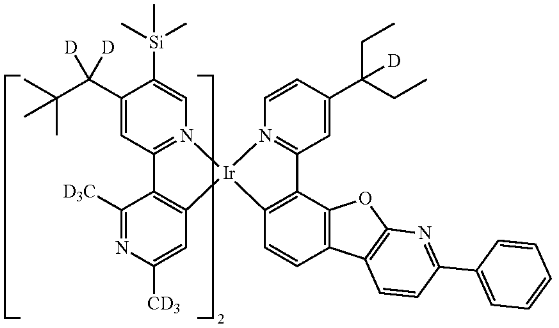
-continued
1432
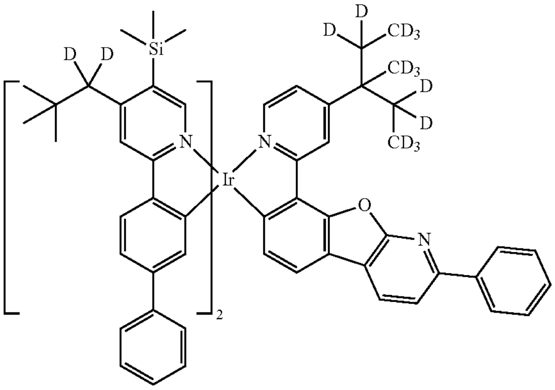
1433
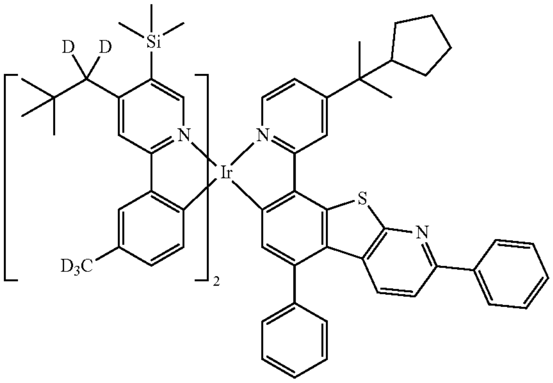
1434
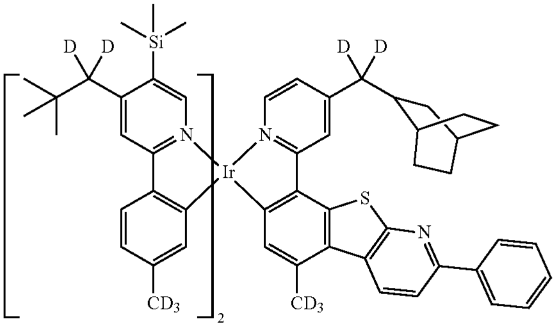
1435
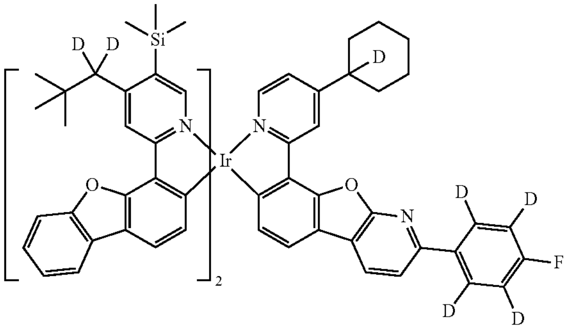

-continued
1436
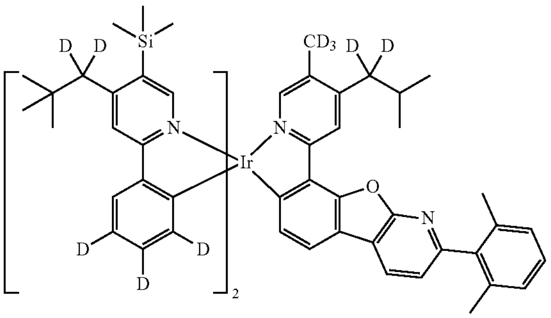
1437
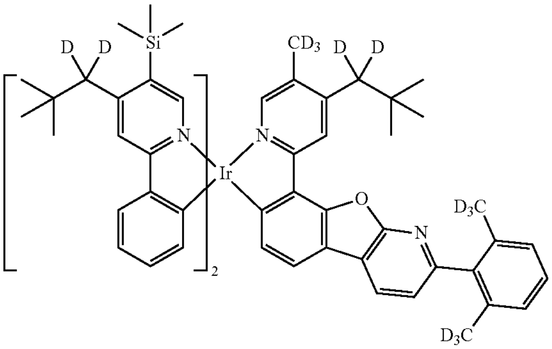
1438
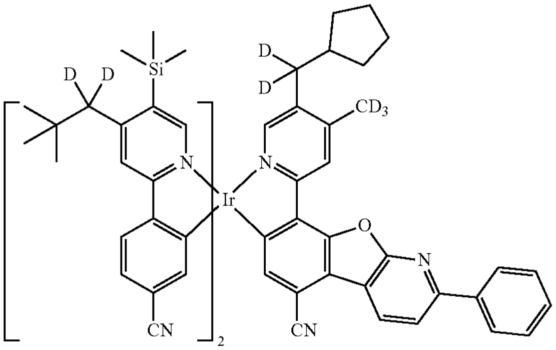
1439
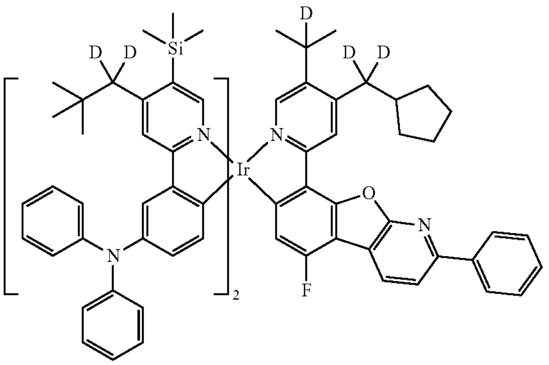
-continued
1440
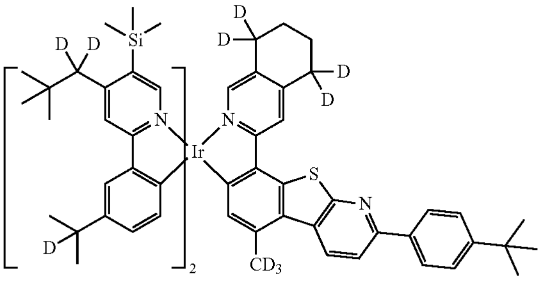
1441
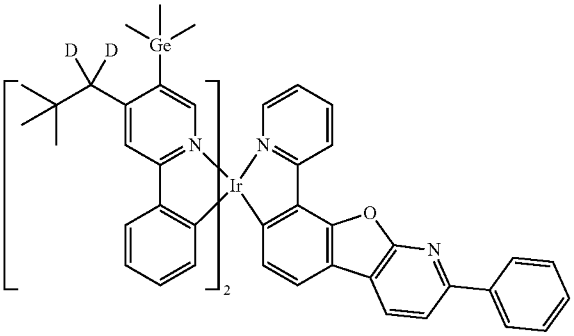
1442
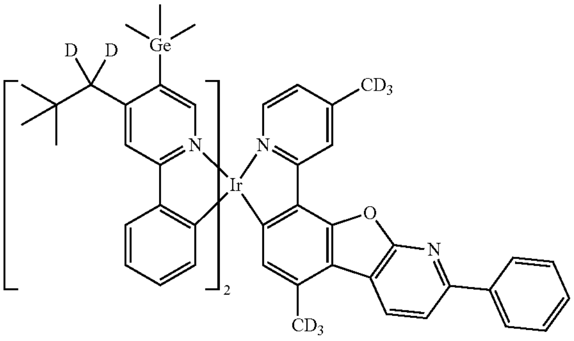
1443
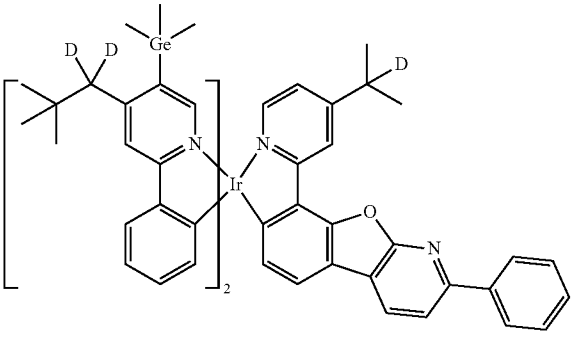

-continued
1444
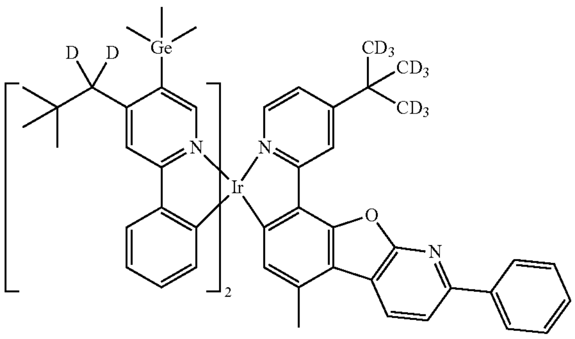
1445
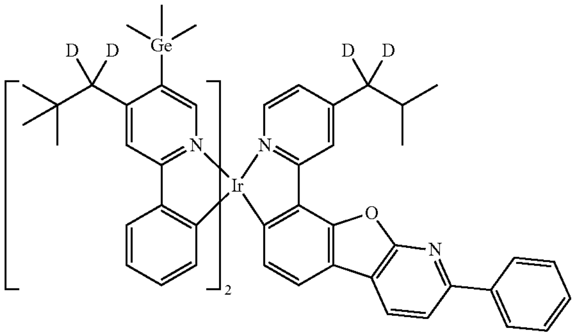
1446
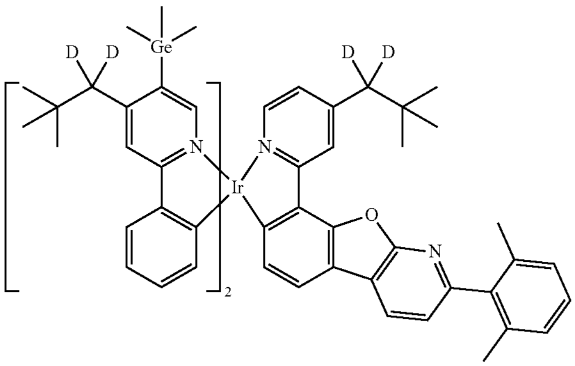
1447
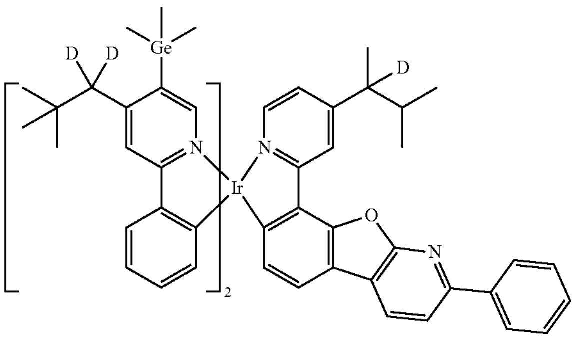
-continued
1448
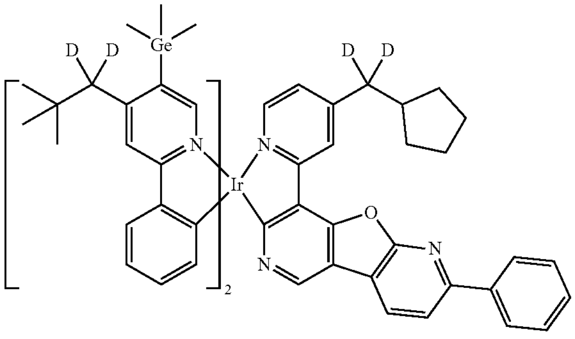
1449
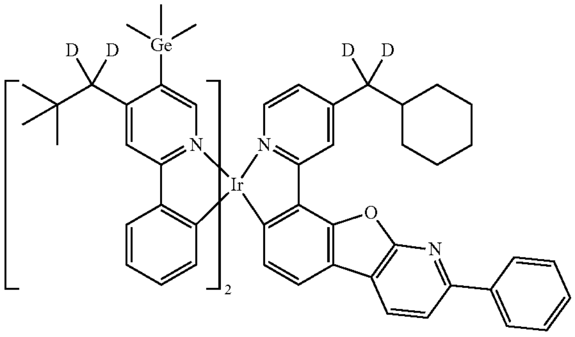
1450
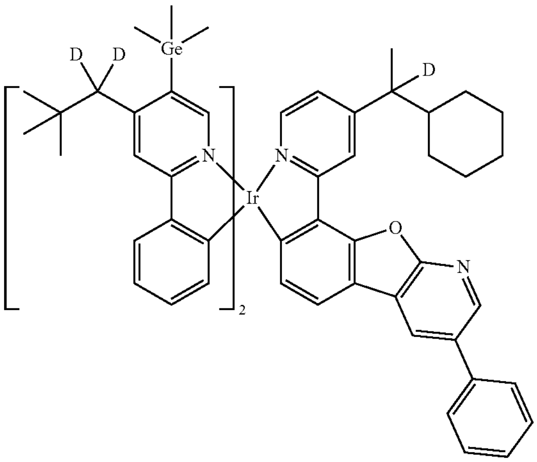
1451
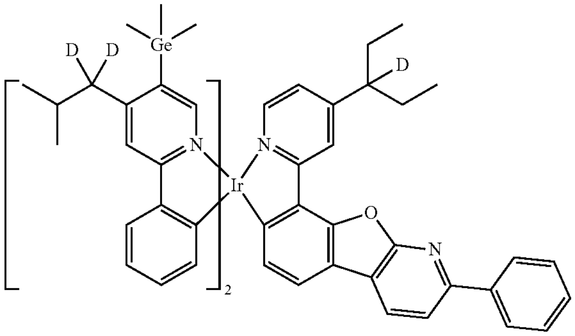

-continued
1452
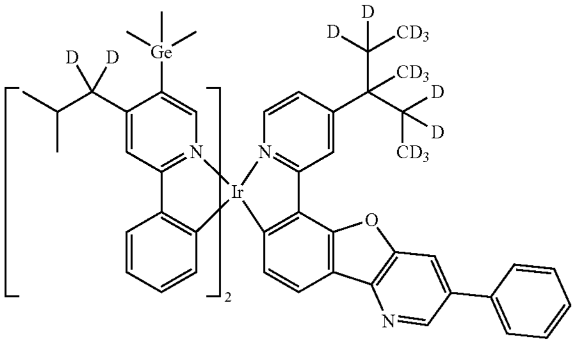
1453
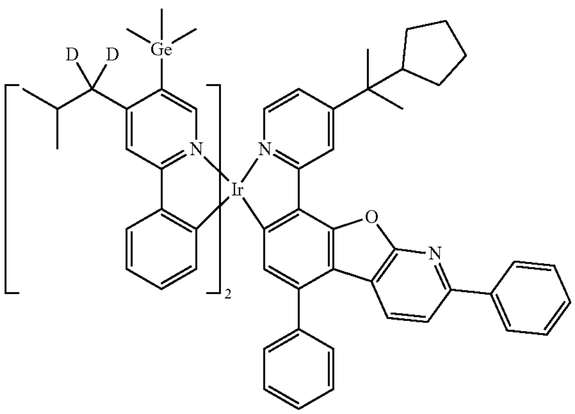
1454
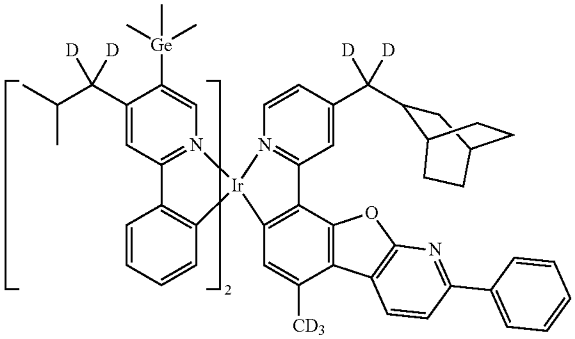
1455
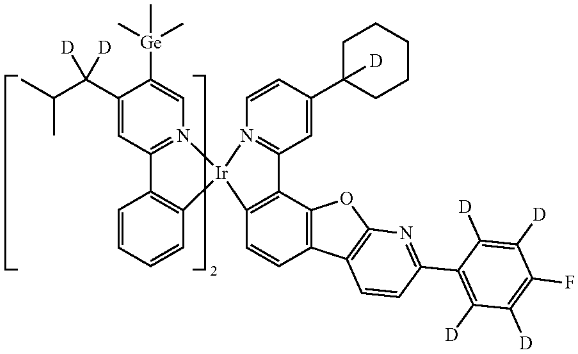
-continued
1456
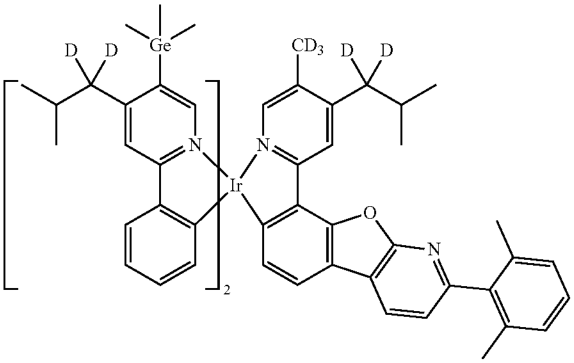
1457
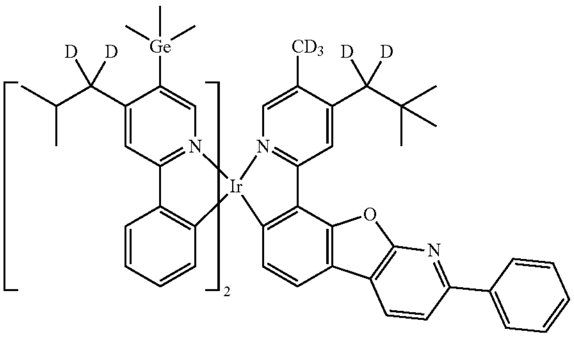
1458
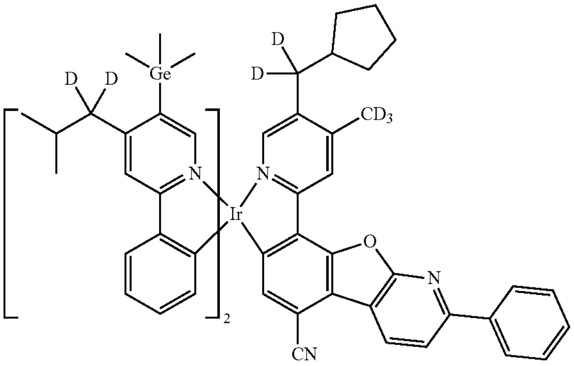
1459
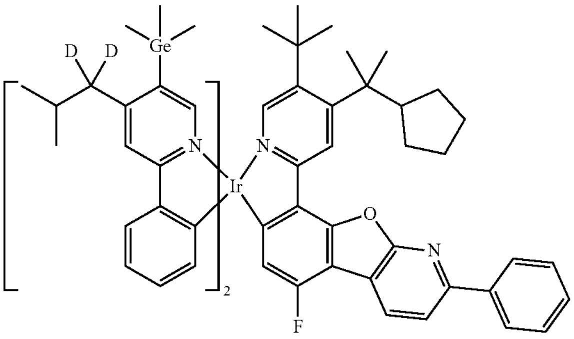

-continued
1460
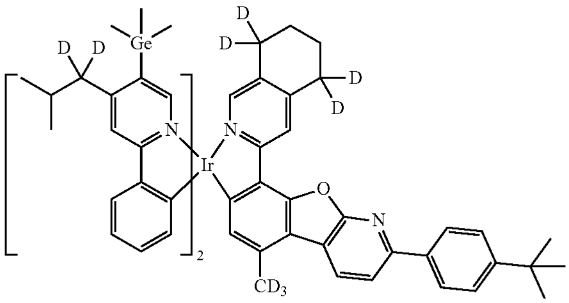
1461
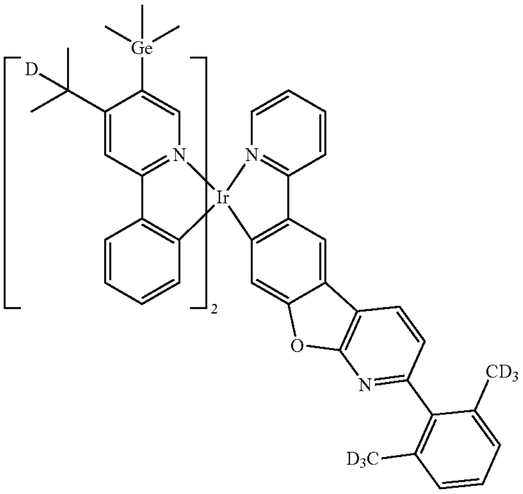
1462
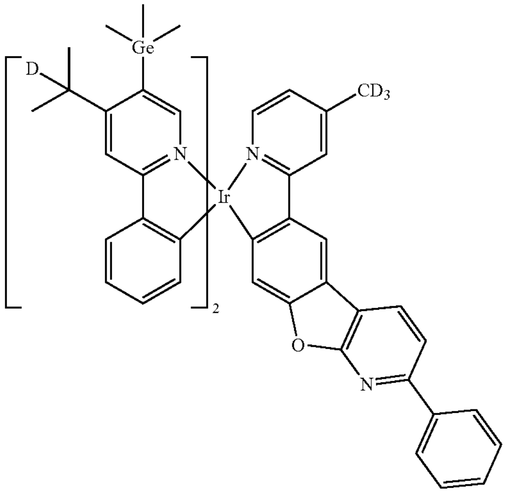
-continued
1463
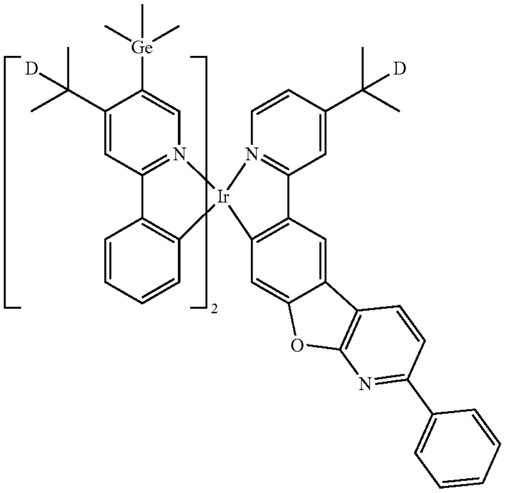
1464
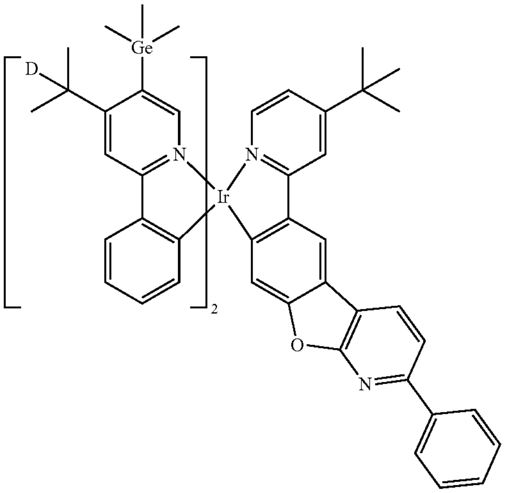
1465
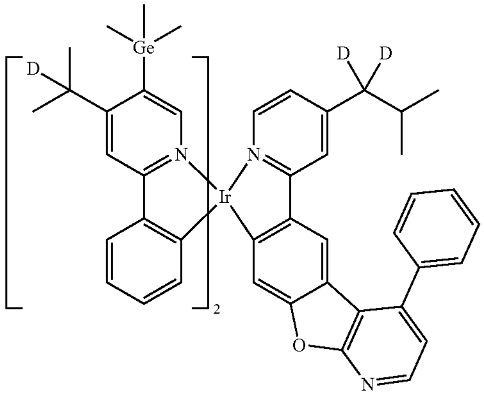

1466
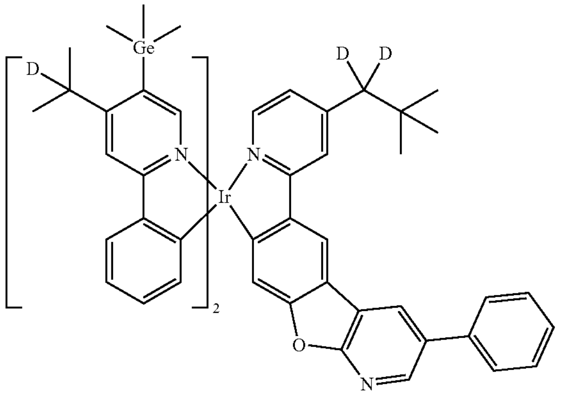
1467
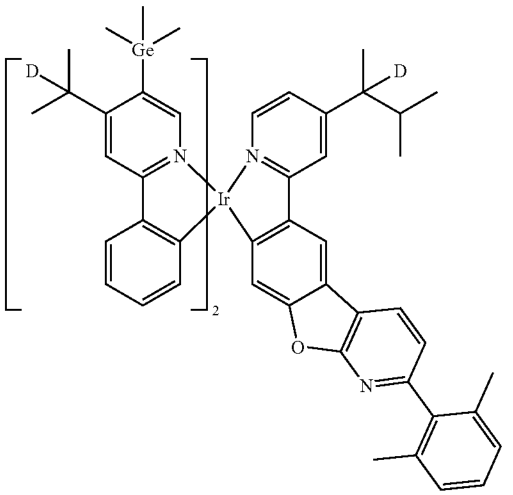
1468
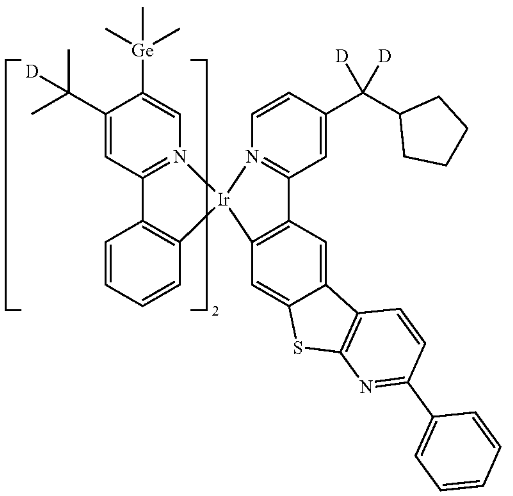
1469
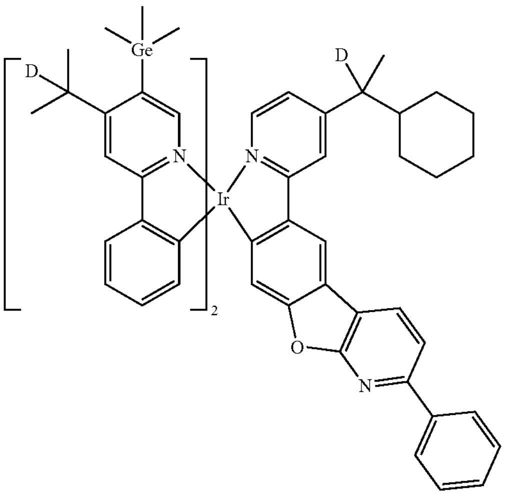
1470
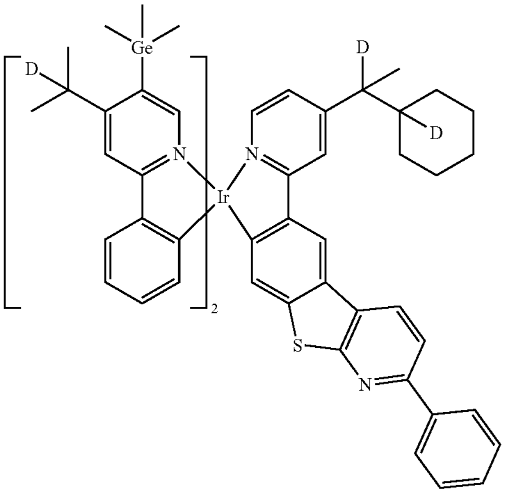
1471
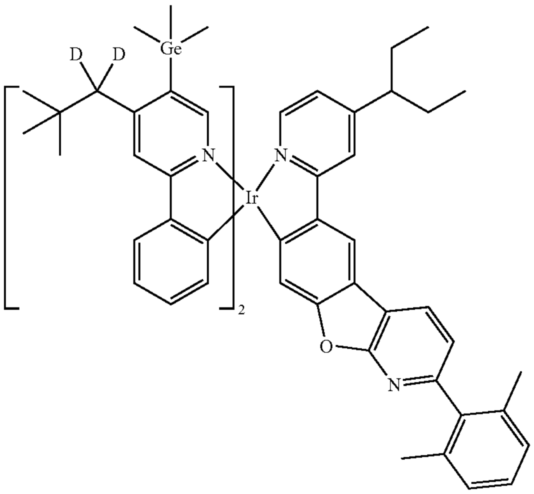

-continued
1472
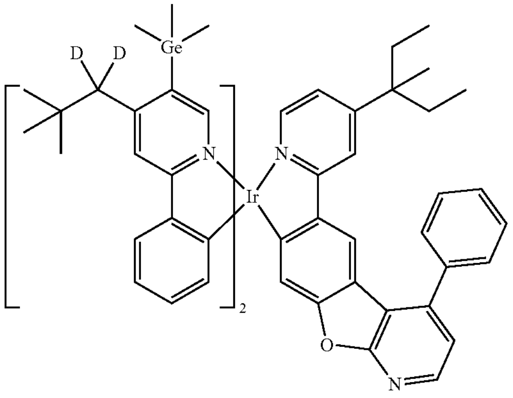
1473
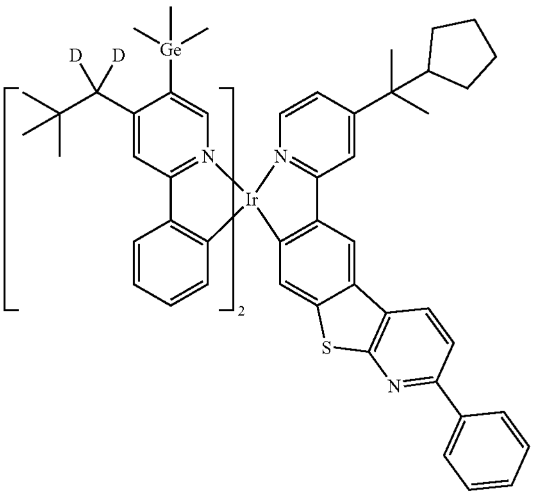
1474
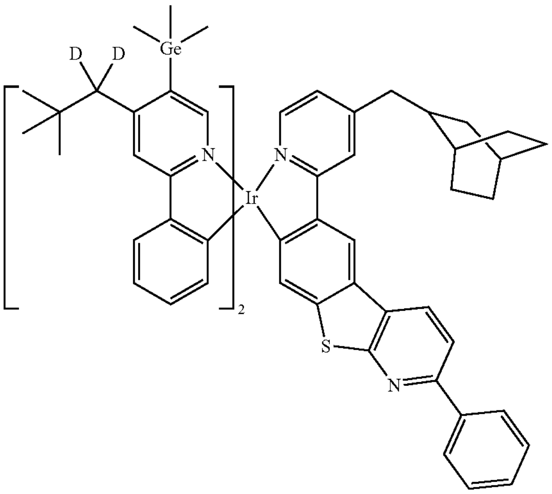
-continued
1475
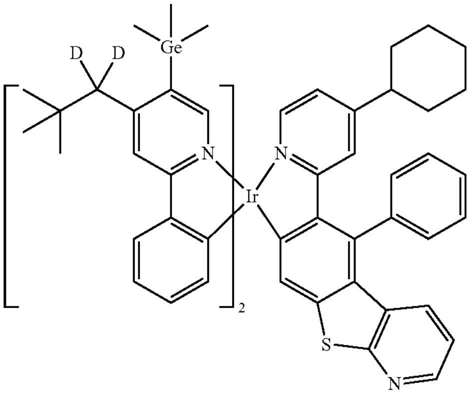
1476
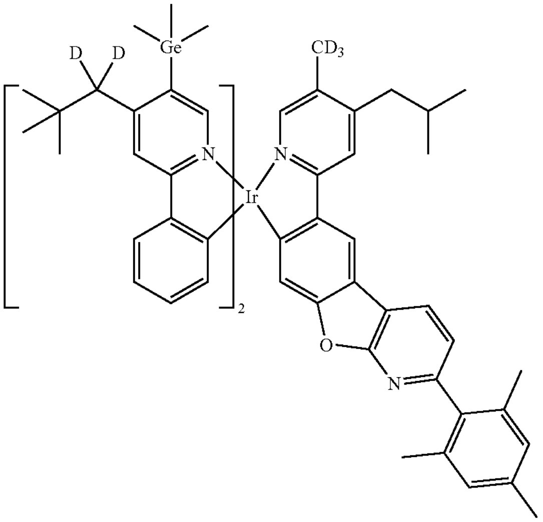
1477
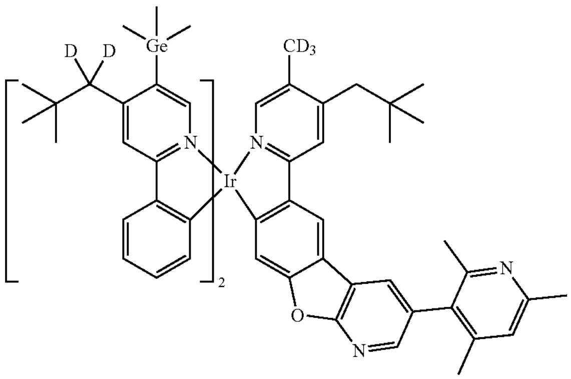

-continued
1478
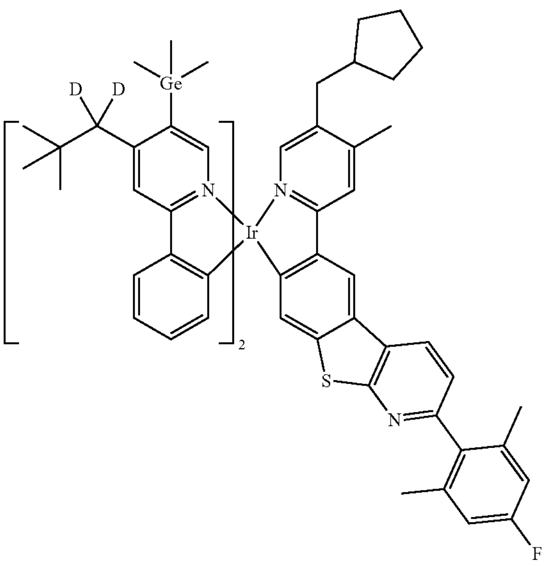
1479
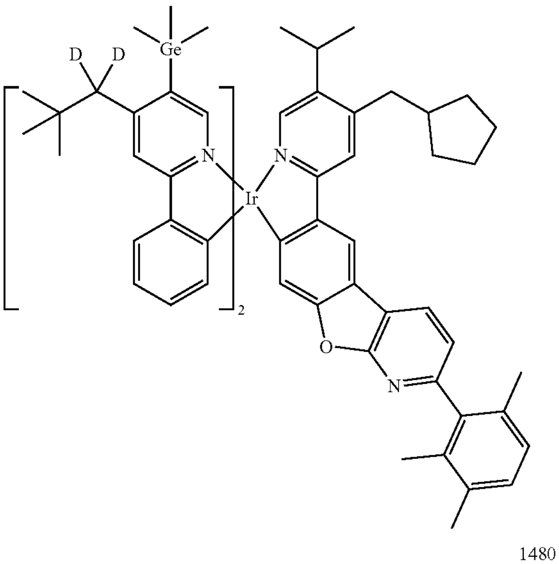
1480
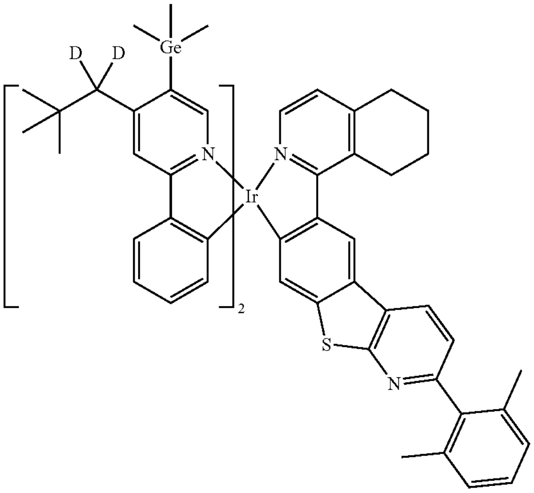
-continued
1481
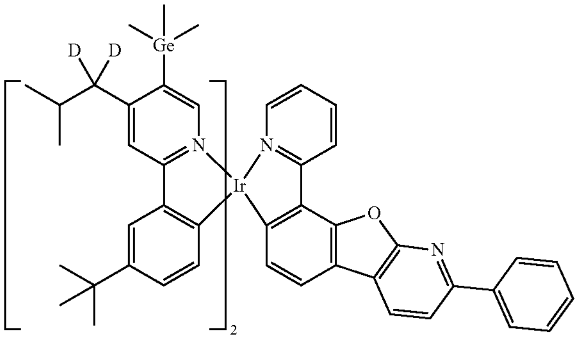
1482
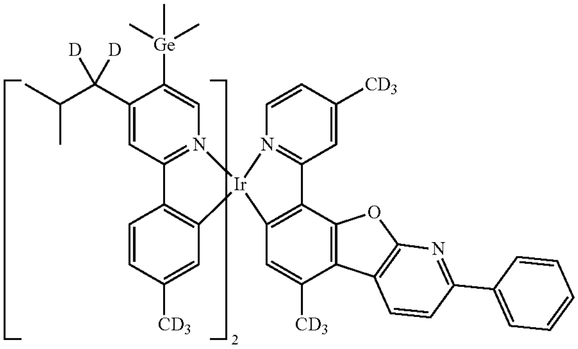
1483
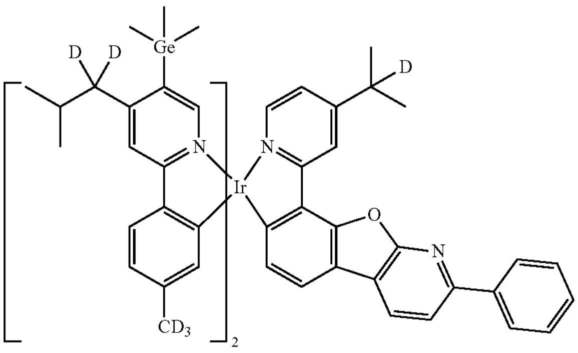
1484
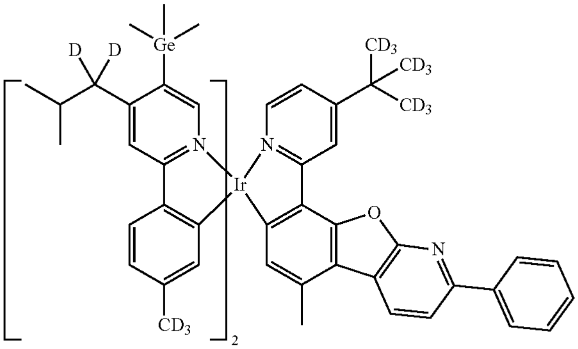

-continued
1485
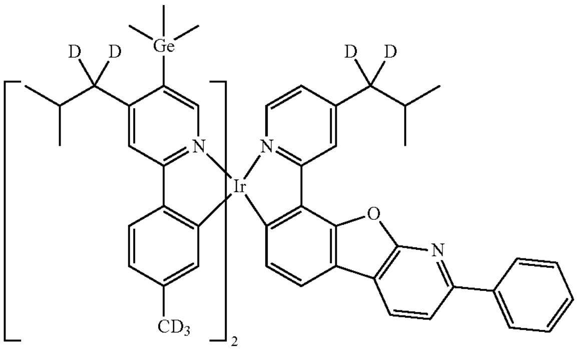
1486
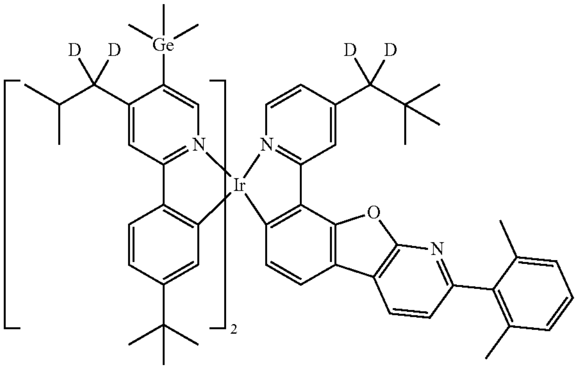
1487
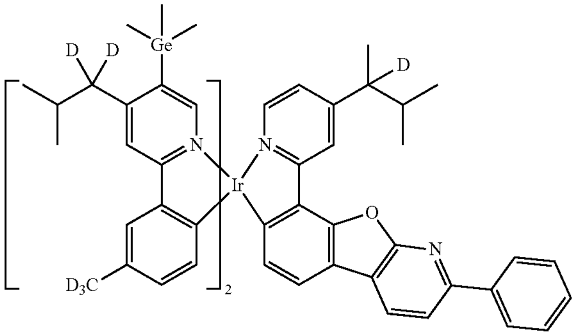
1488
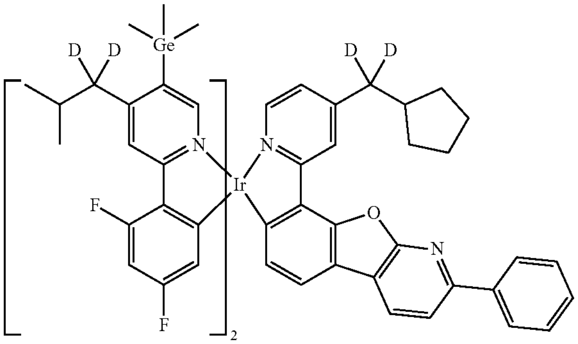
-continued
1489
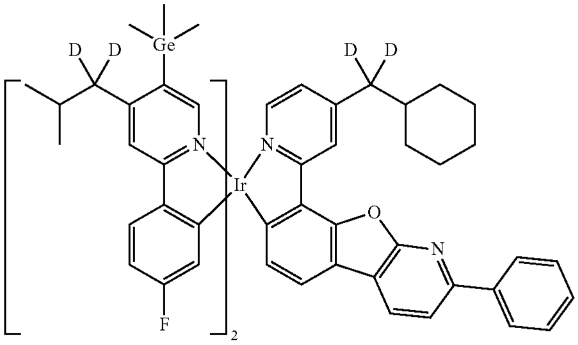
1490
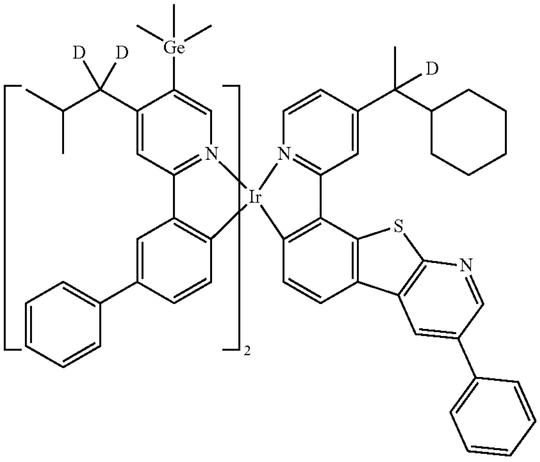
1491
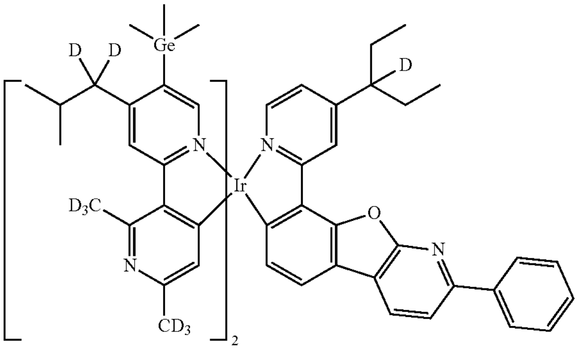

-continued
1492
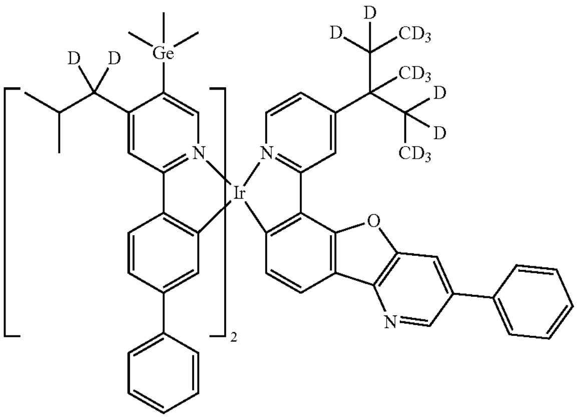
1493
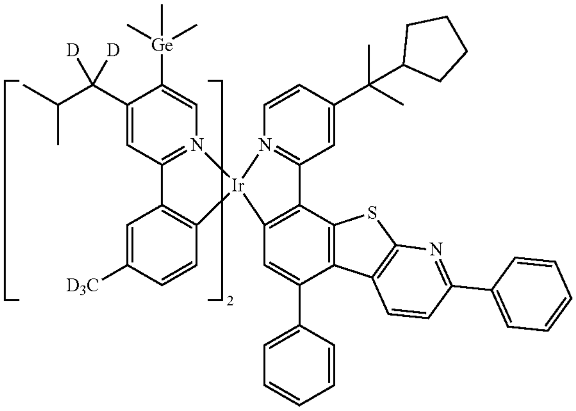
1494
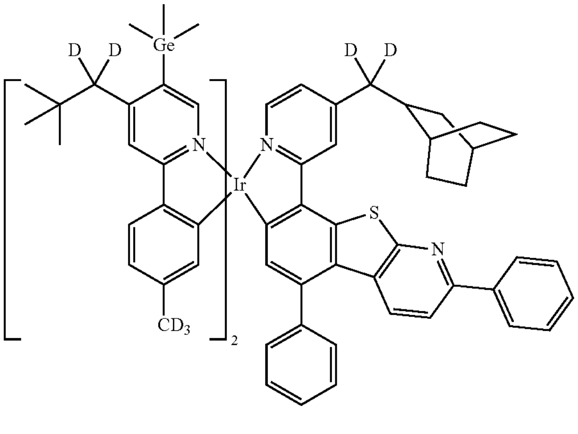
-continued
1495
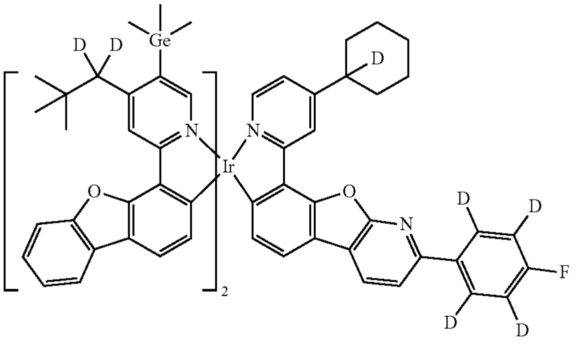
1496
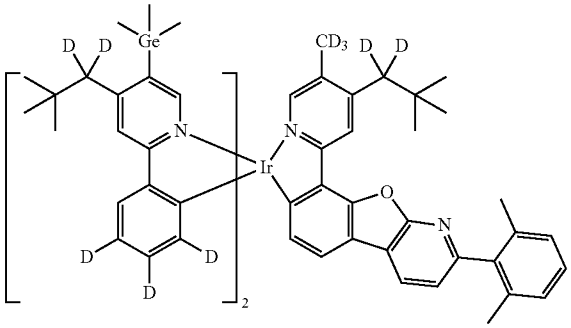
1497
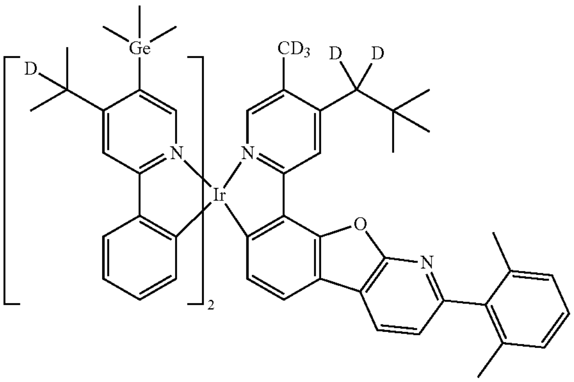
1498
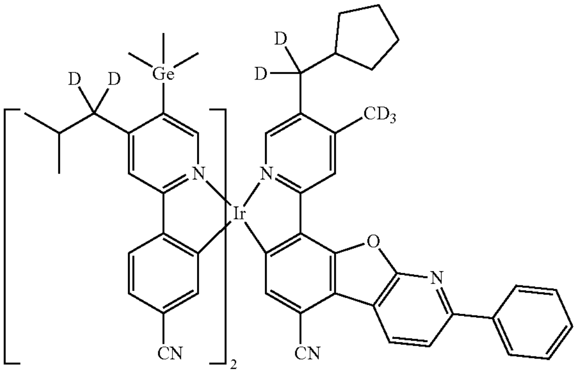

-continued
1499
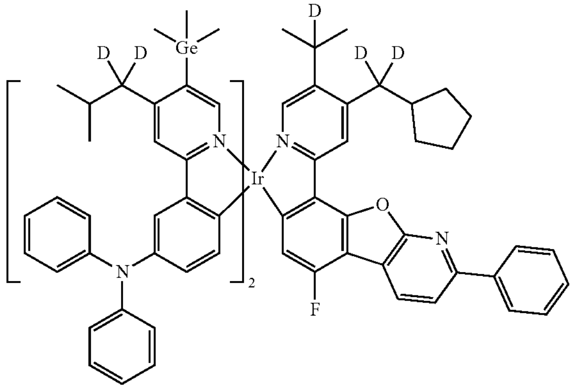
1500
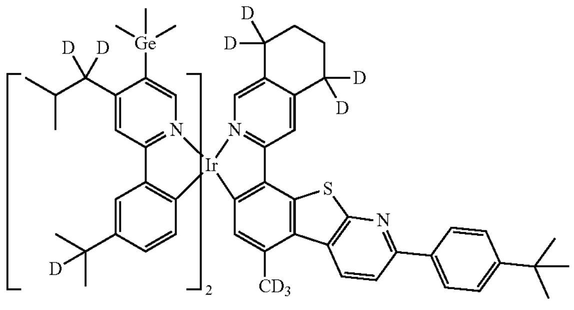
1501
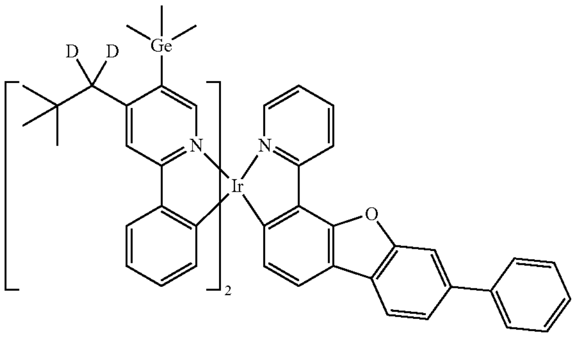
1502
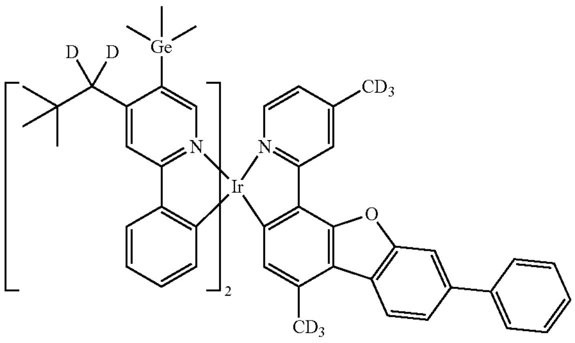
-continued
1503
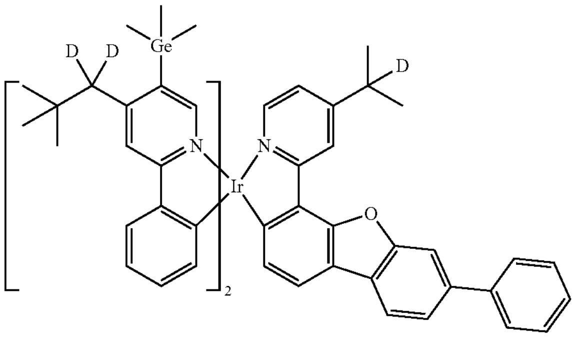
1504
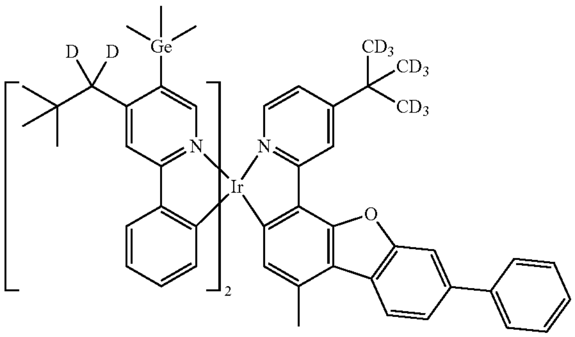
1505
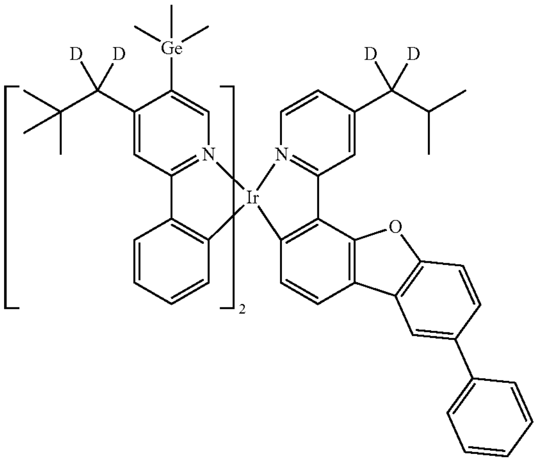
1506
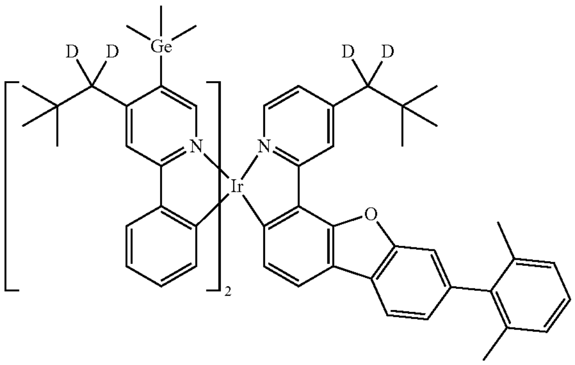

-continued
1507
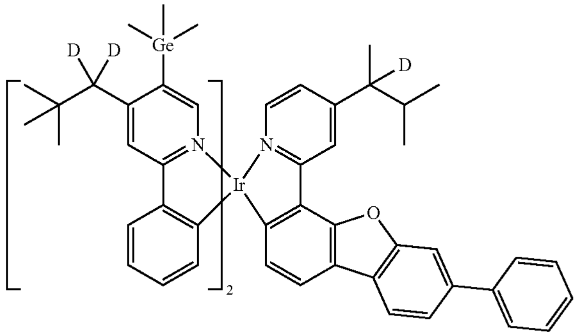
1508
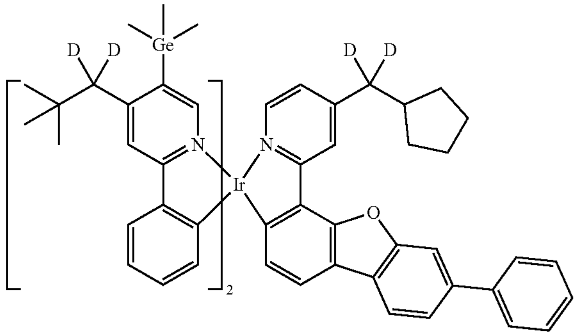
1509
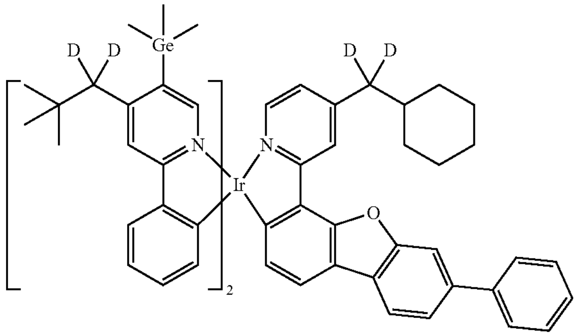
1510
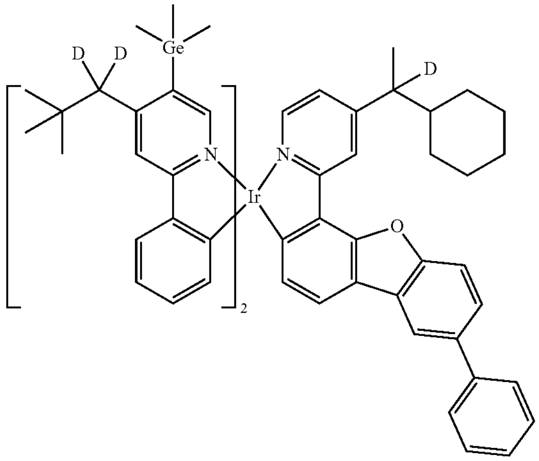
-continued
1511
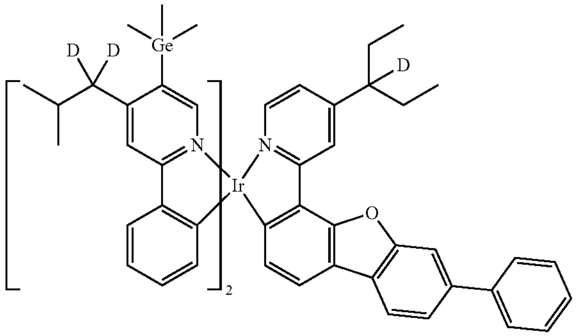
1512
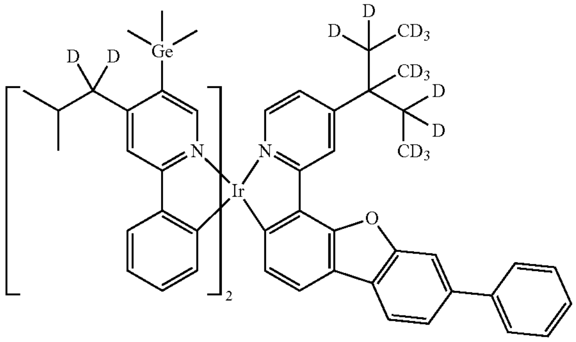
1513
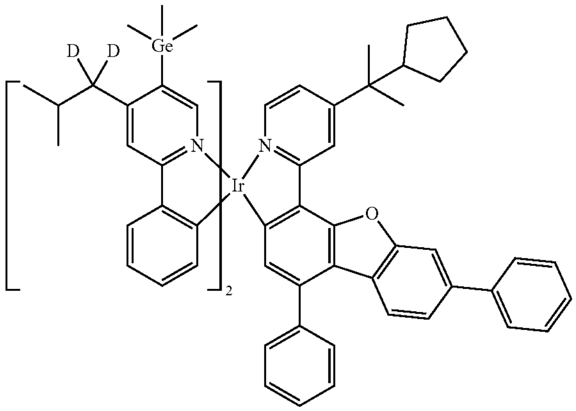
1514
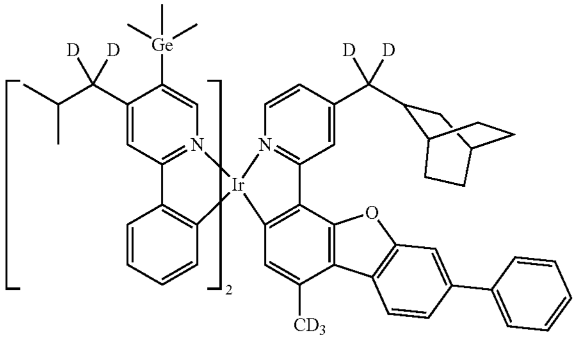

-continued
1515
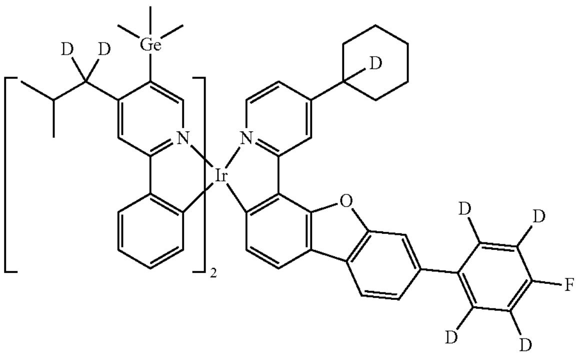
1516
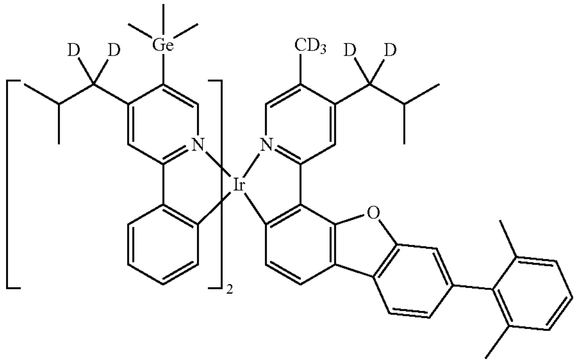
1517
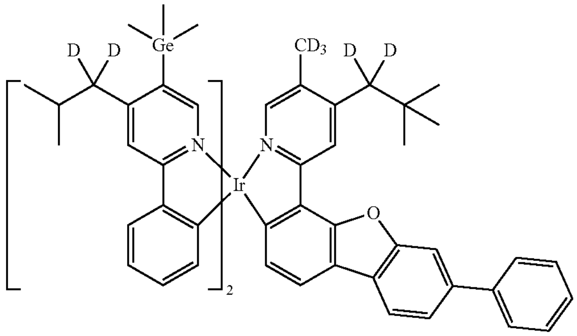
1518
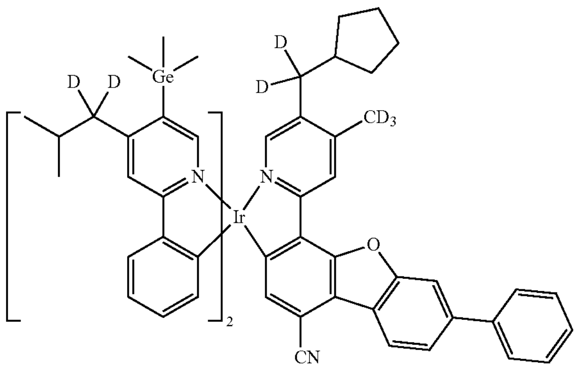
-continued
1519
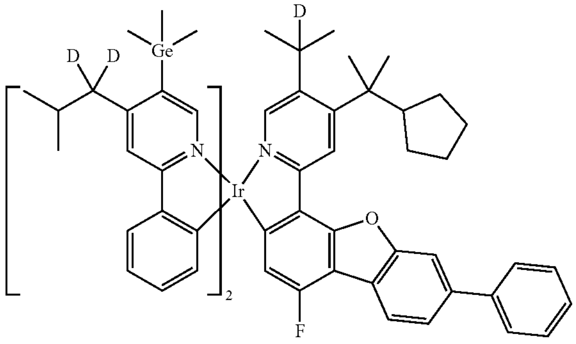
1520
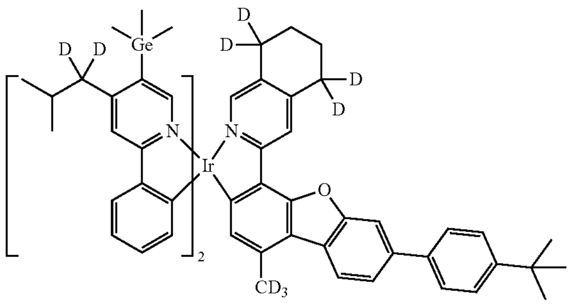
1521
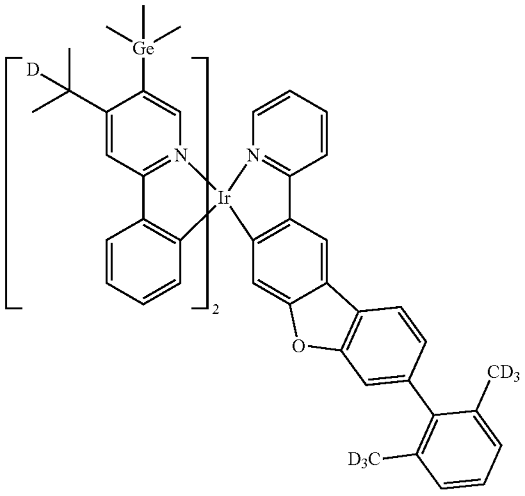

-continued
1522
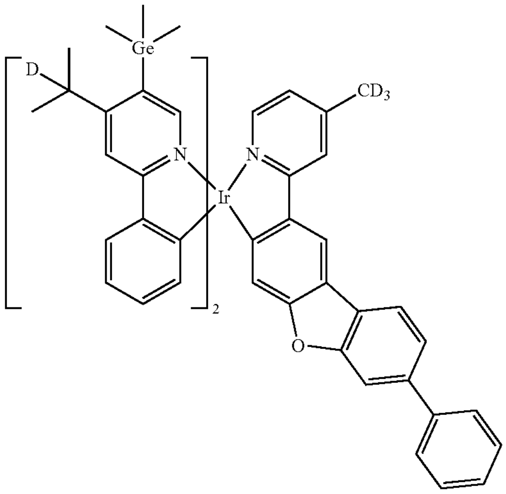
1523
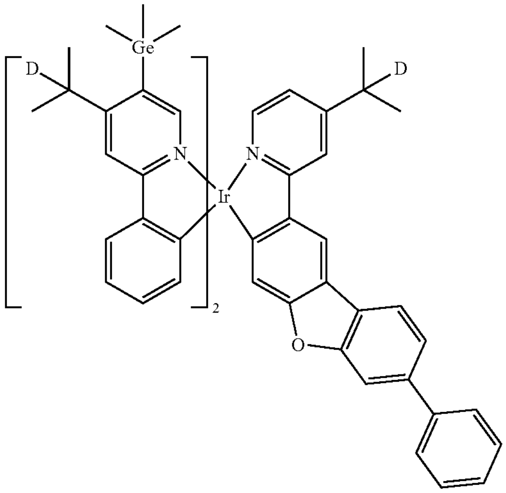
1524
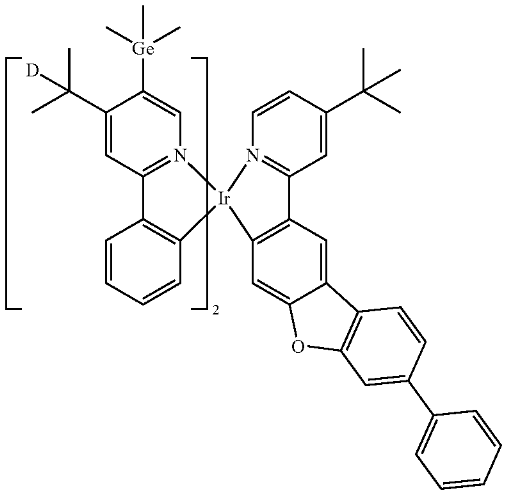
-continued
1525
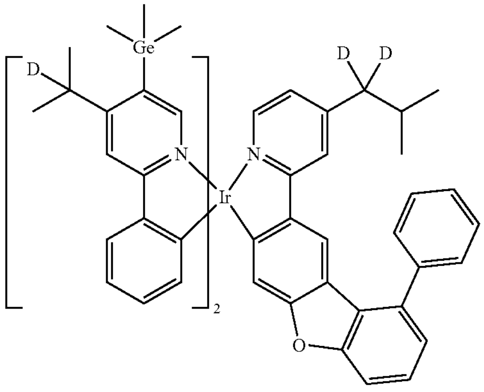
1526
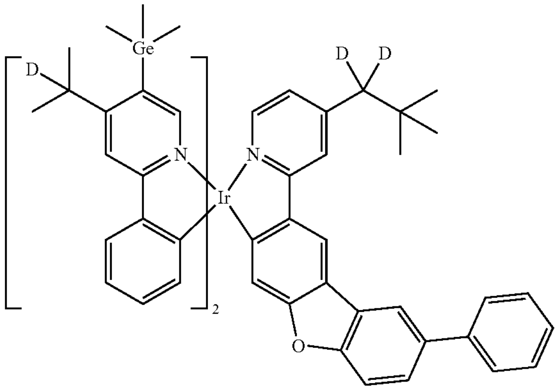
1527
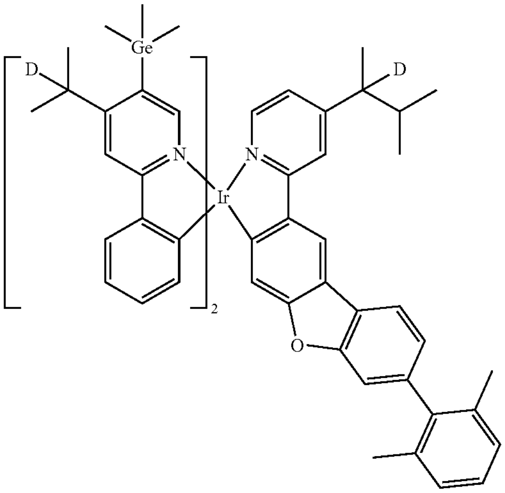

-continued
1528
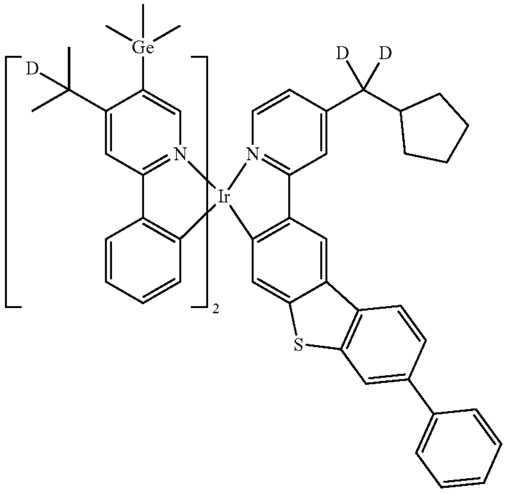
1529
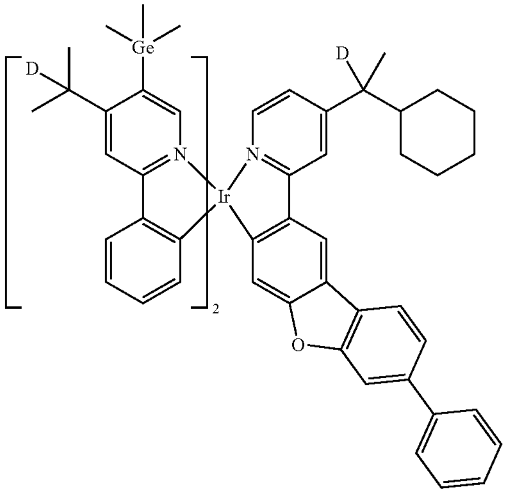
1530
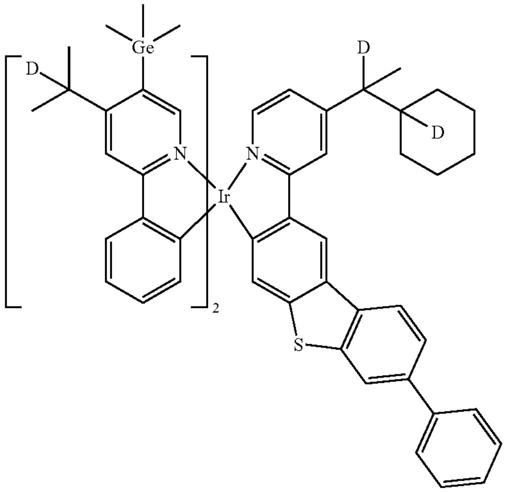
-continued
1531
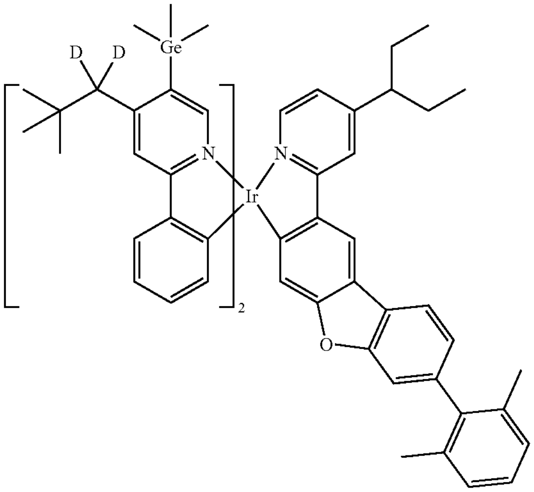
1532
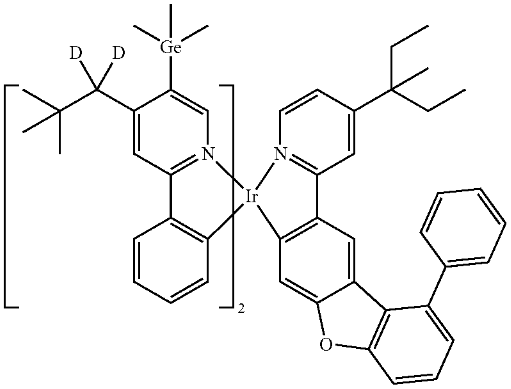
1533
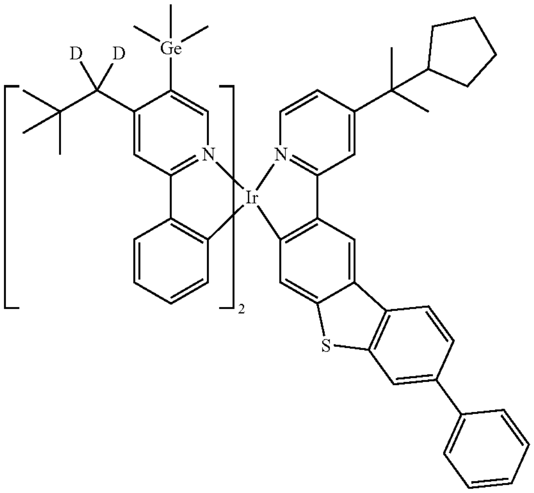

-continued
1534
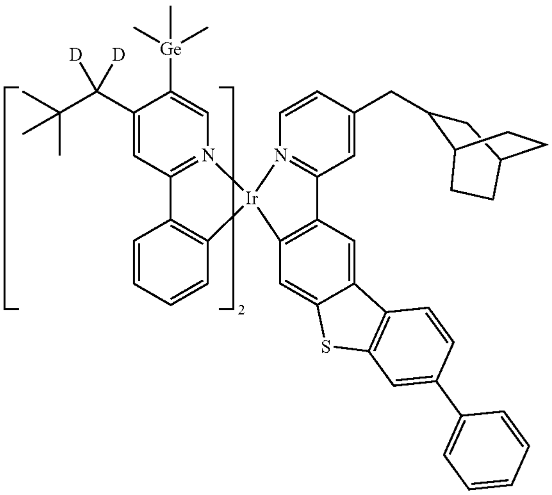
1535
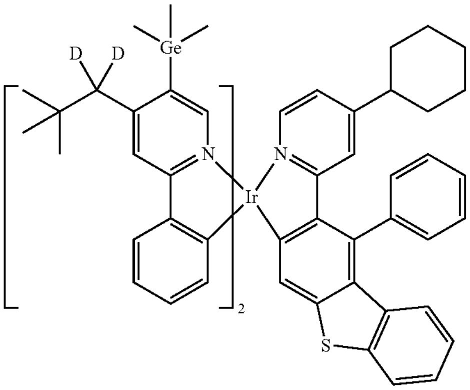
1536
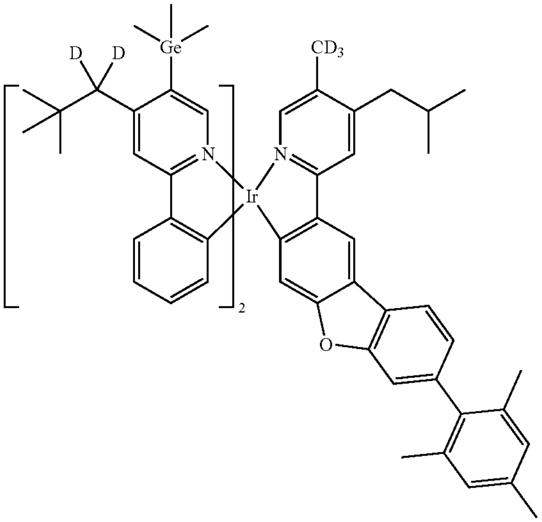
-continued
1537
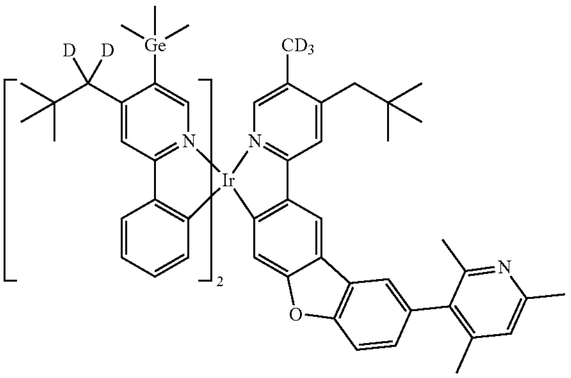
1538
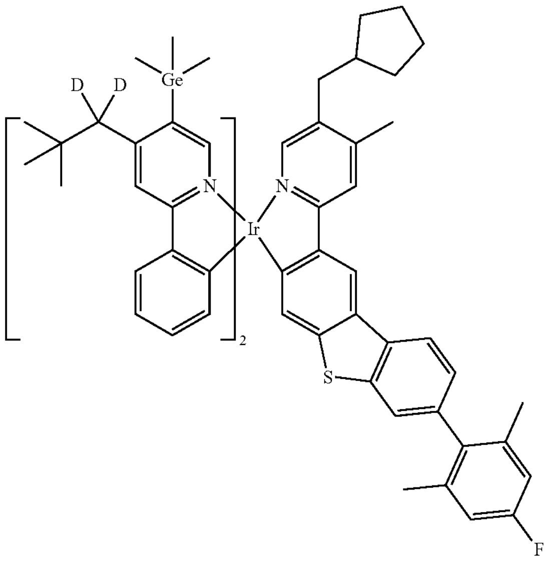
1539
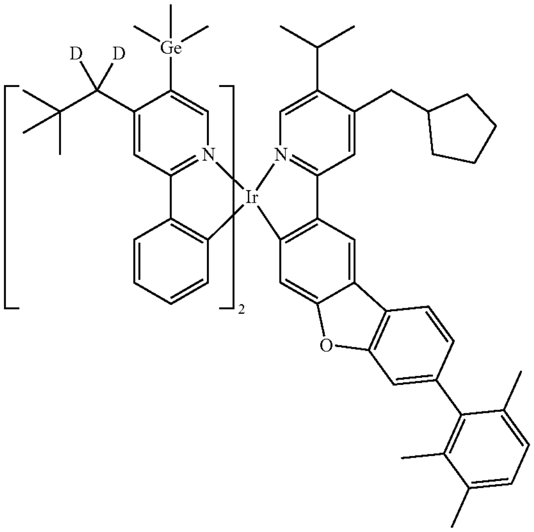

1540
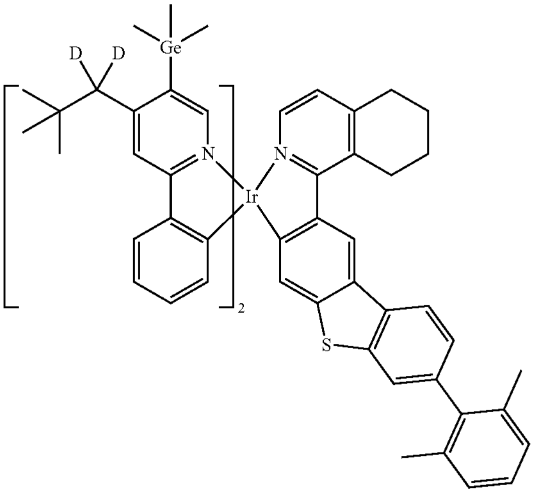
1541
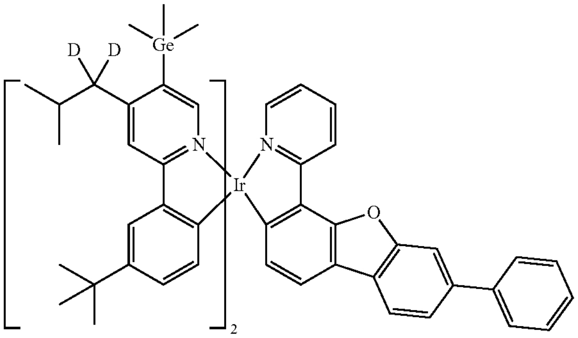
1542
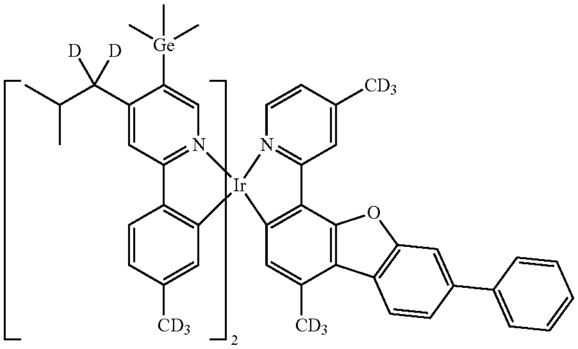
1543
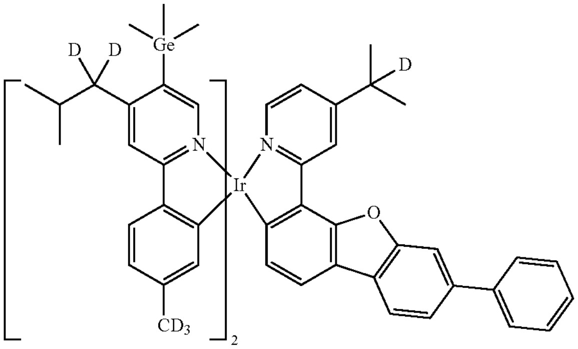
1544
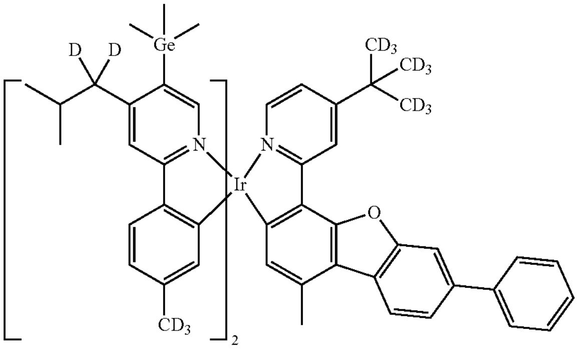
1545
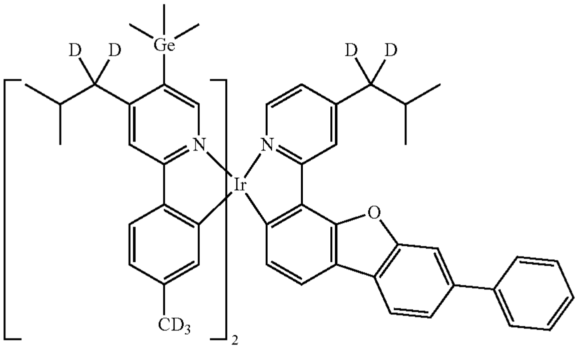
1546
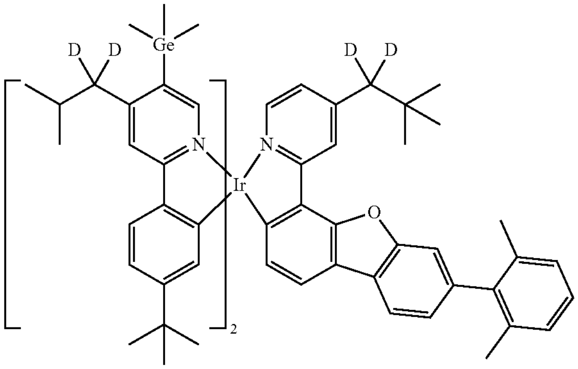
1547
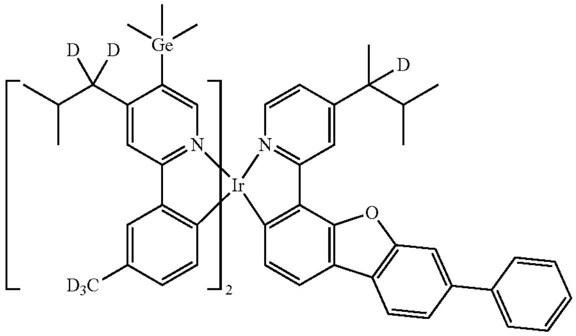

1548
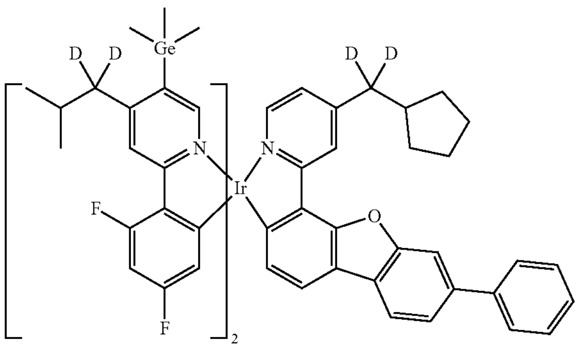
1549
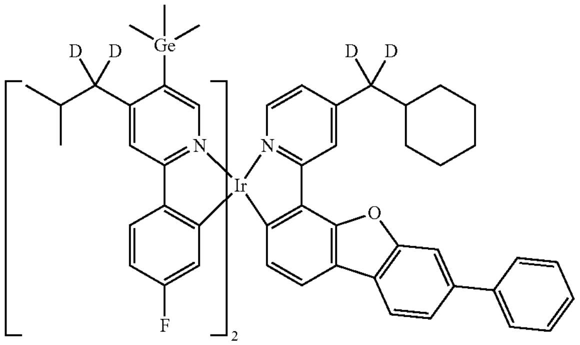
1550
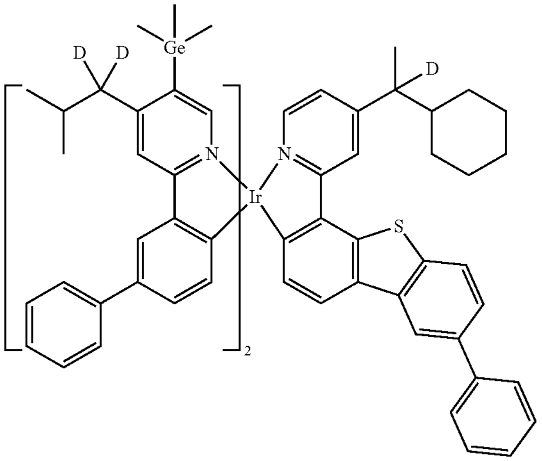
1551
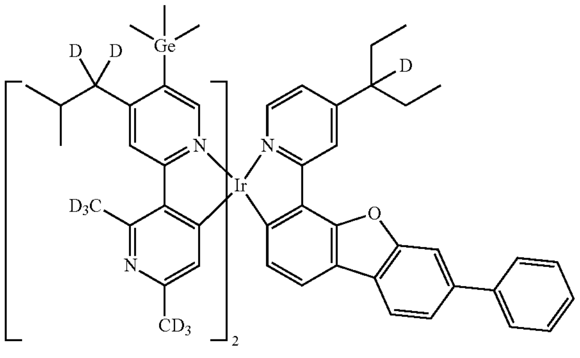
1552
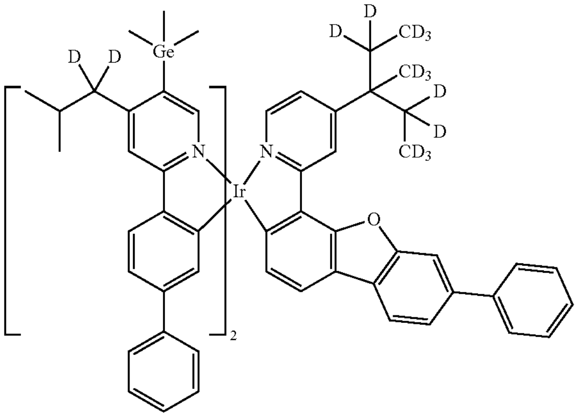
1553
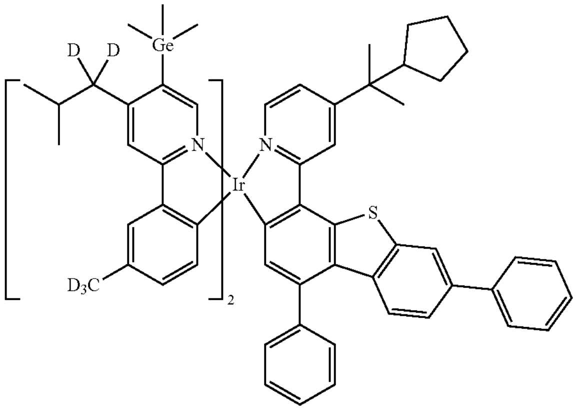
1554
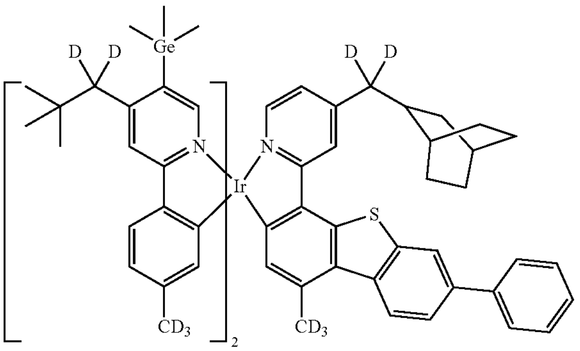
1555
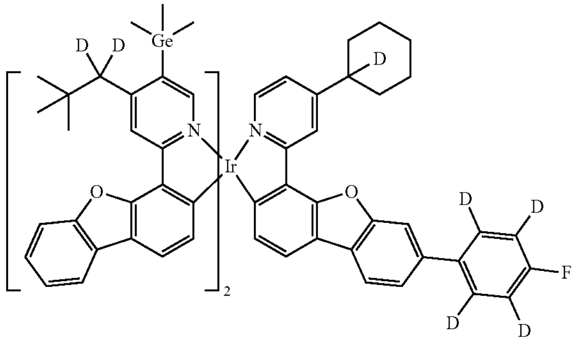

1556
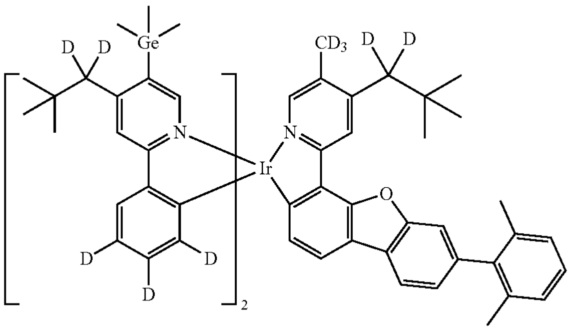
1557
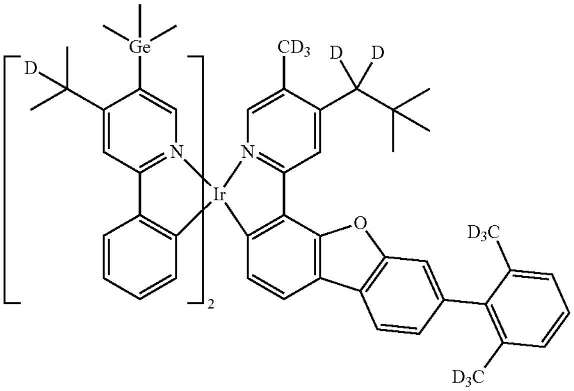
1558
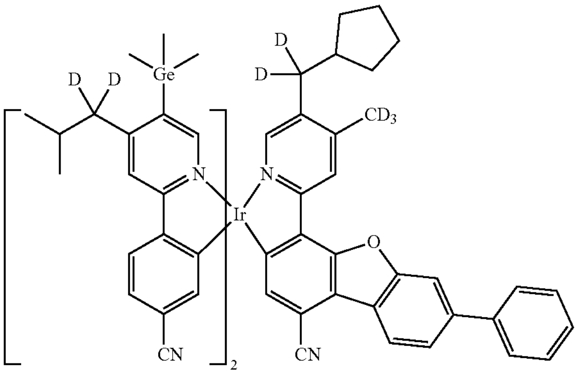
1559
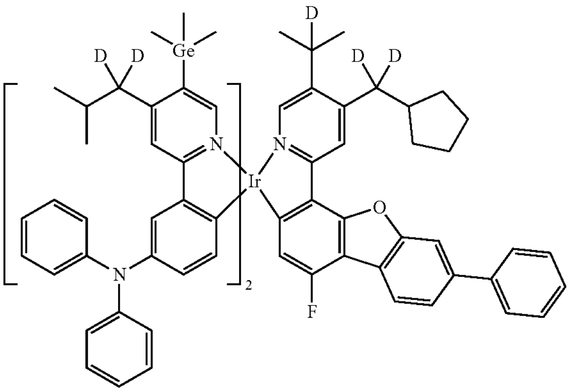
1560
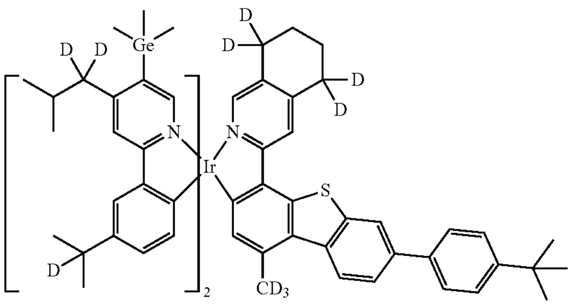
1561
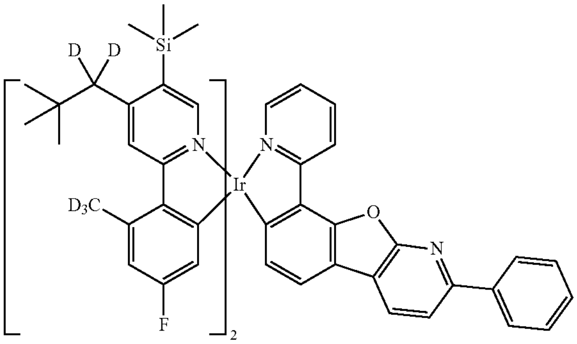
1562
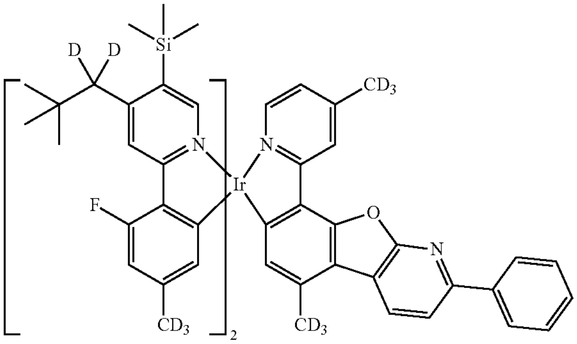
1563
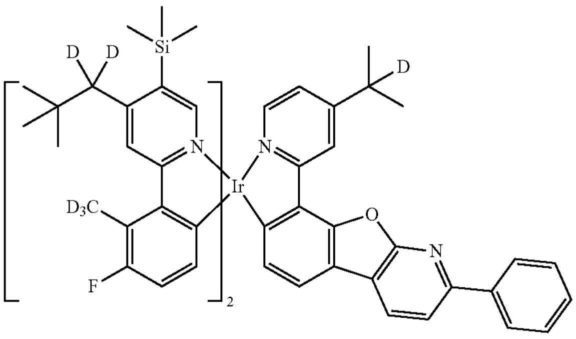

-continued
1564
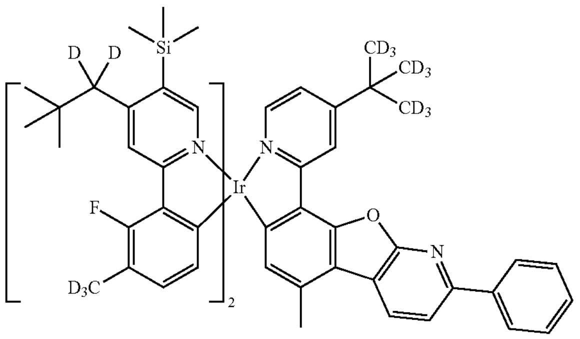
1565
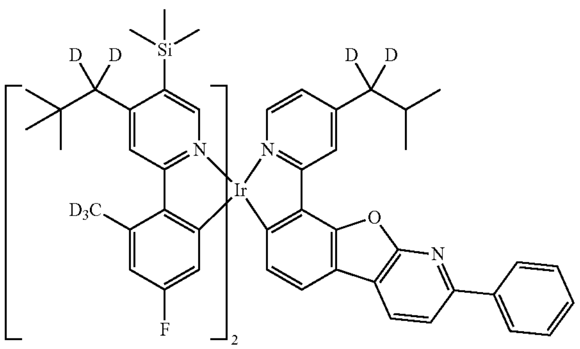
1566
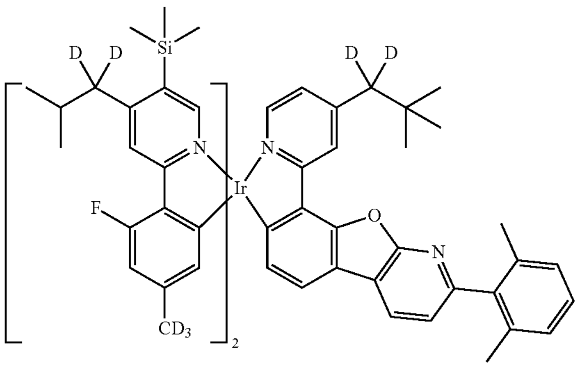
1567
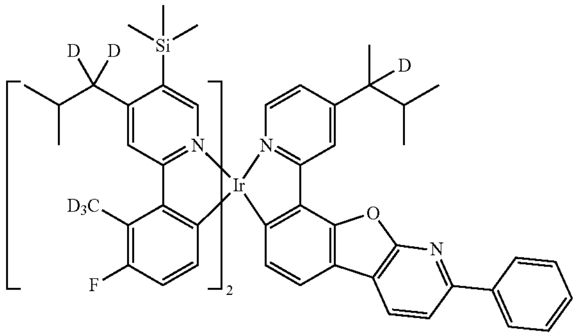
-continued
1568
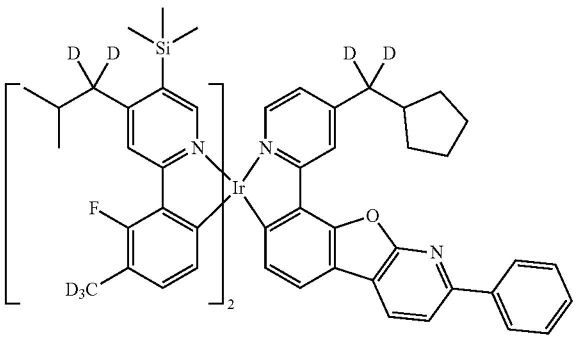
1569
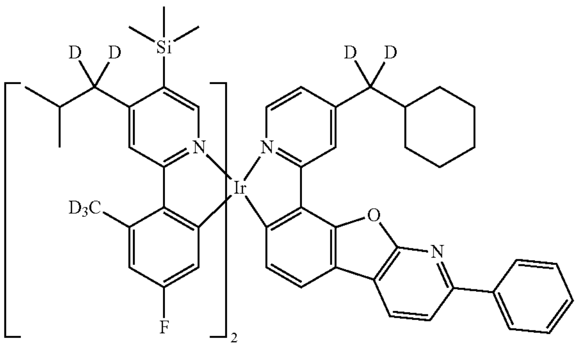
1570
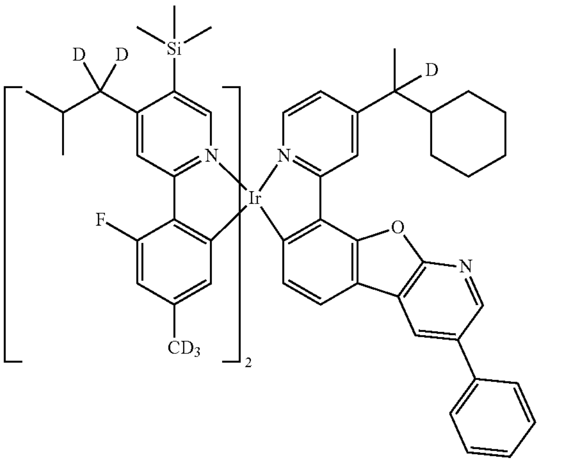
1571
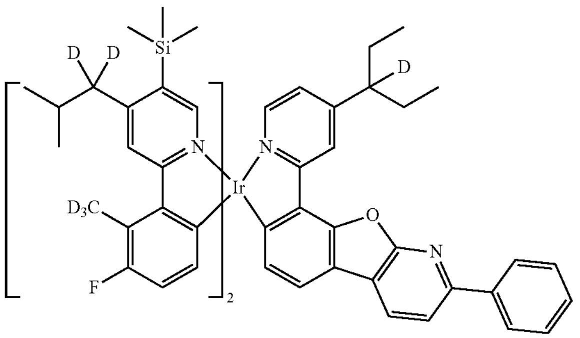

-continued
1572
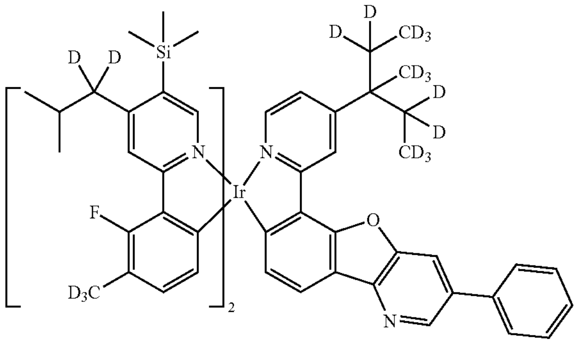
1573
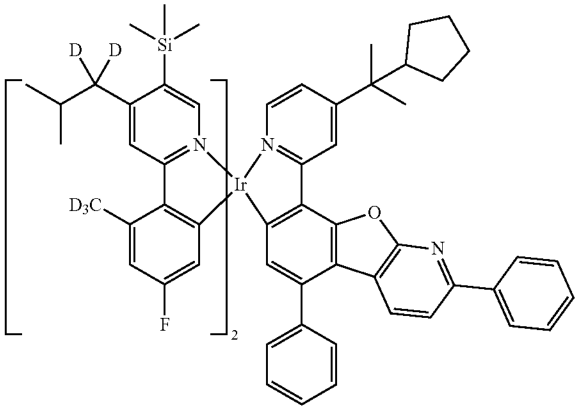
1574
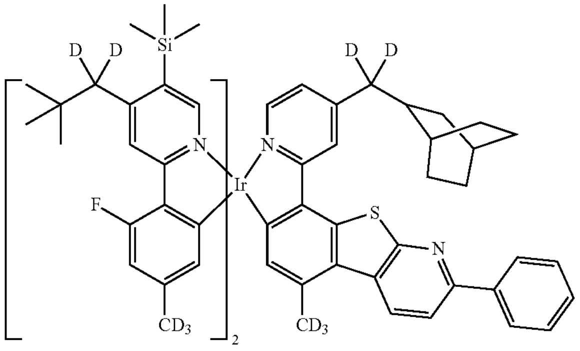
1575
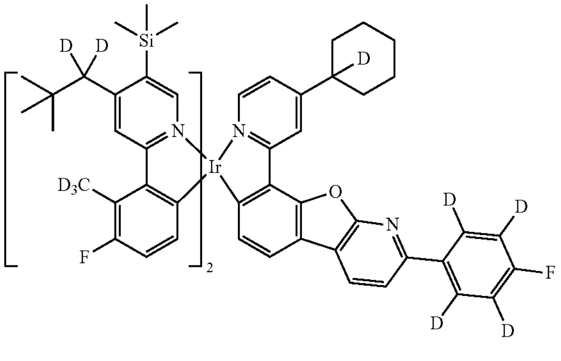
-continued
1576
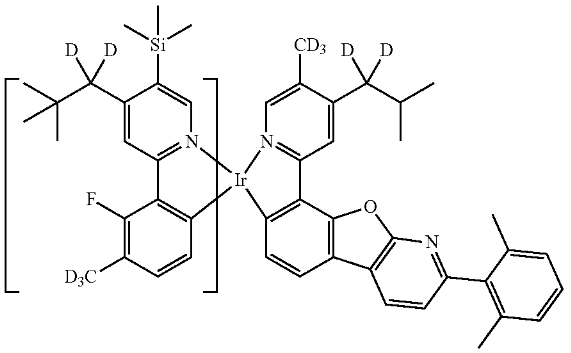
1577
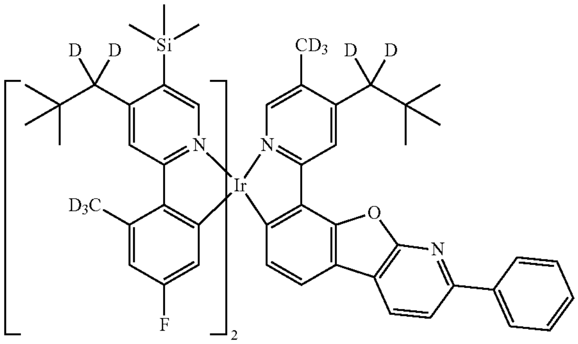
1578
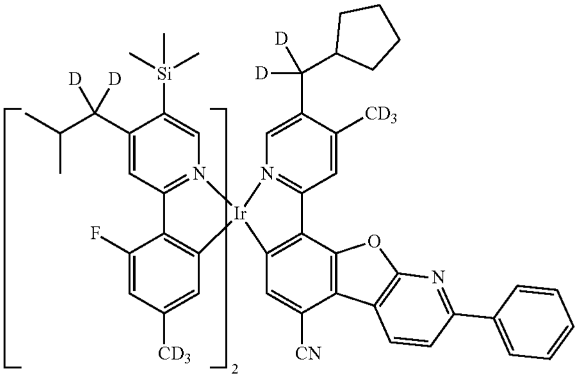
1579
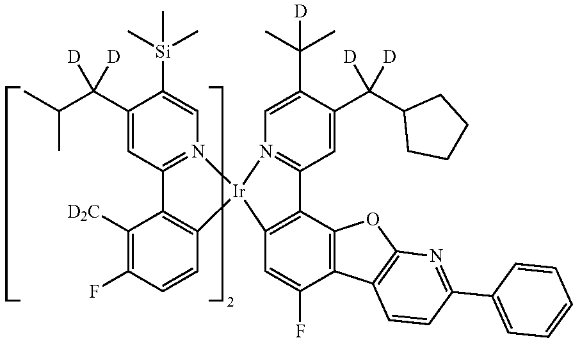

-continued
1580
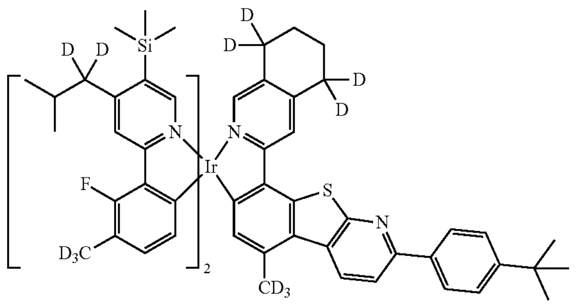
1581
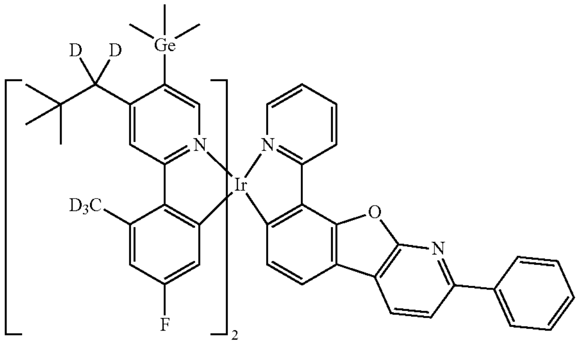
1582
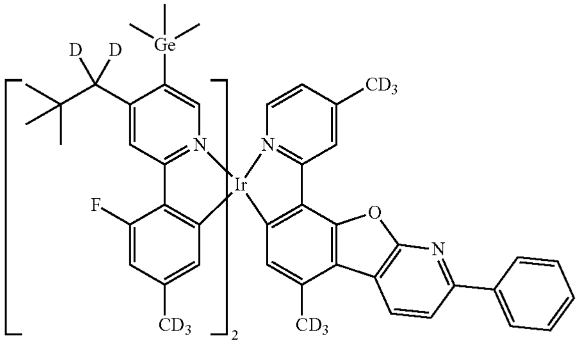
1583
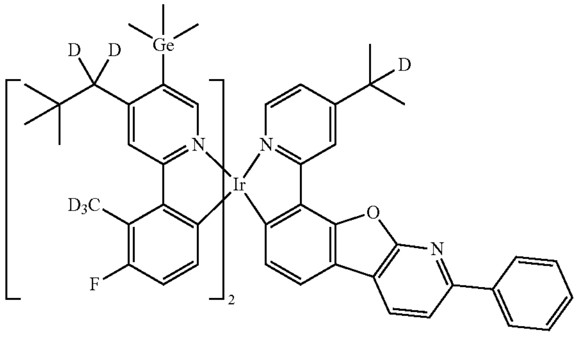
-continued
1584
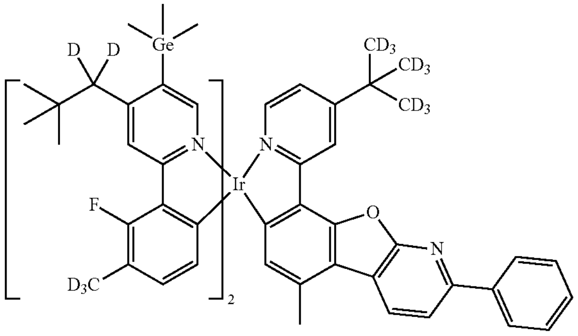
1585
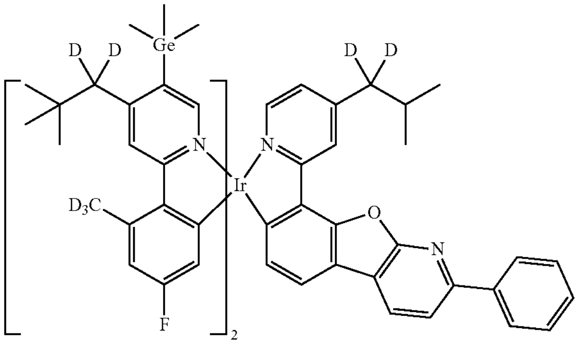
1566
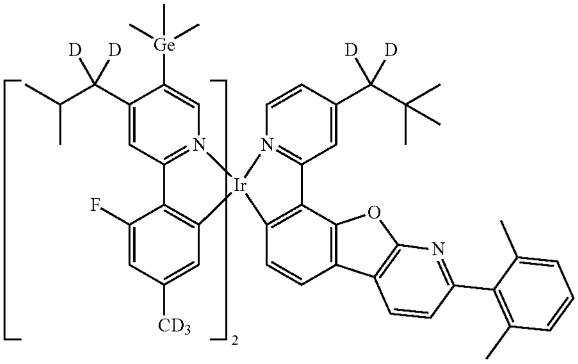
1567
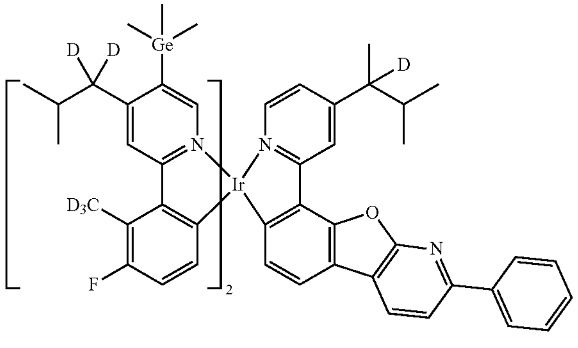

-continued
1568
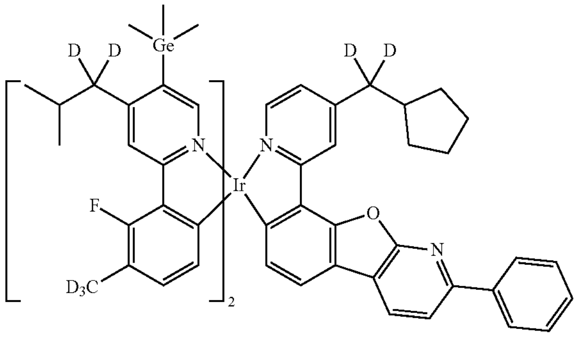
1569
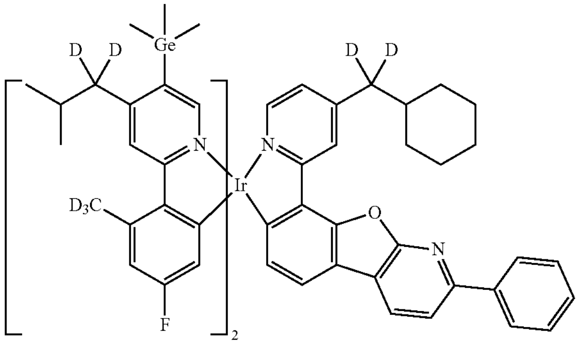
1570
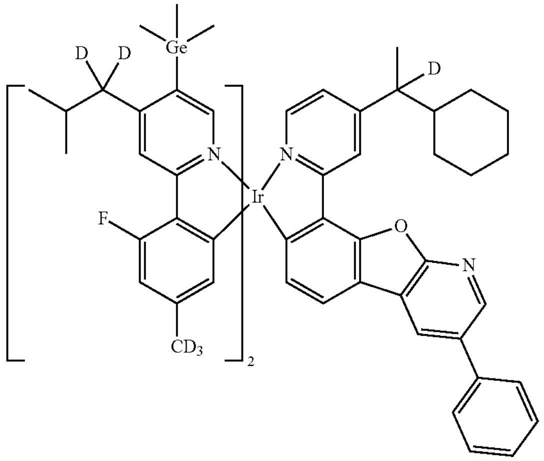
1591
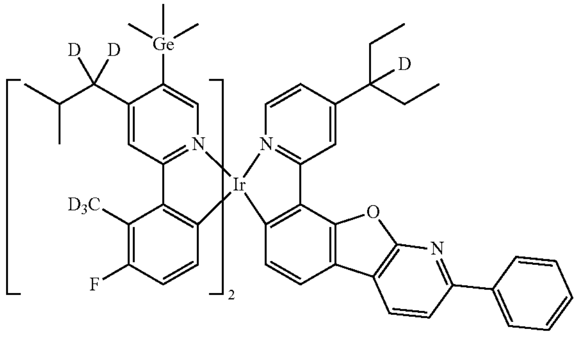
-continued
1592
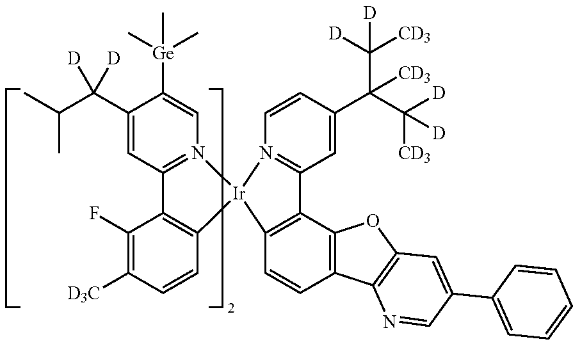
1593
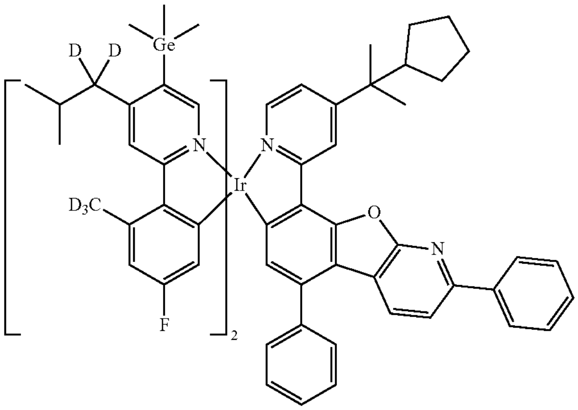
1594
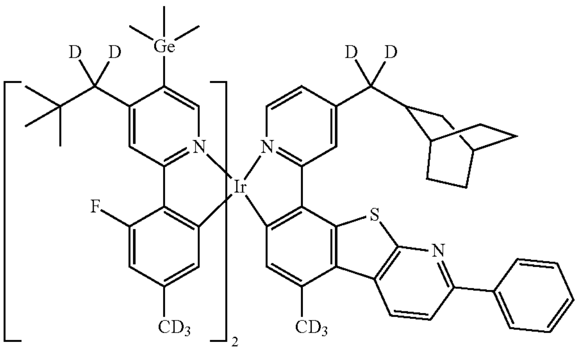
1595
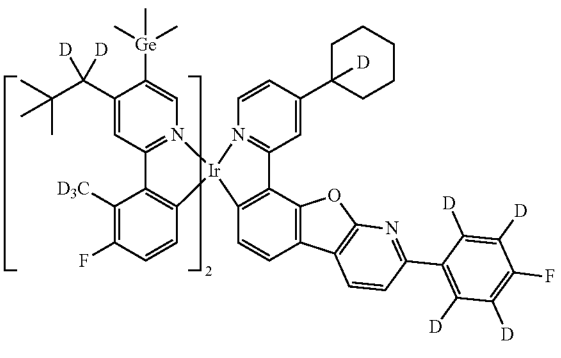

-continued
1596
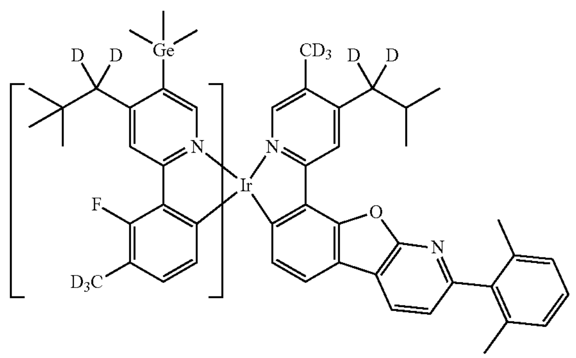
1597
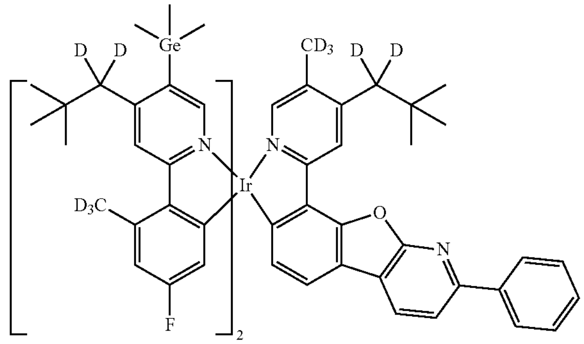
1598
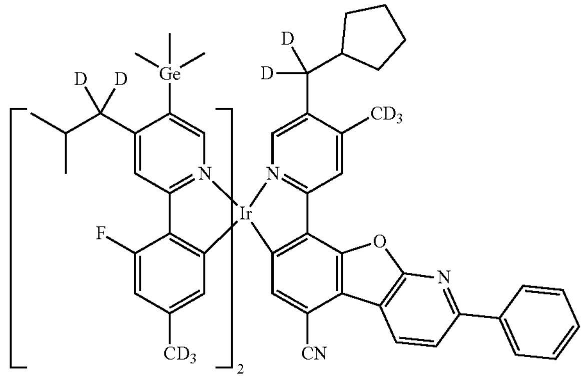
1599
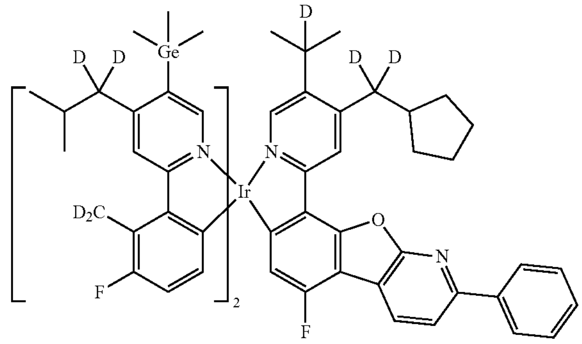
-continued
1600
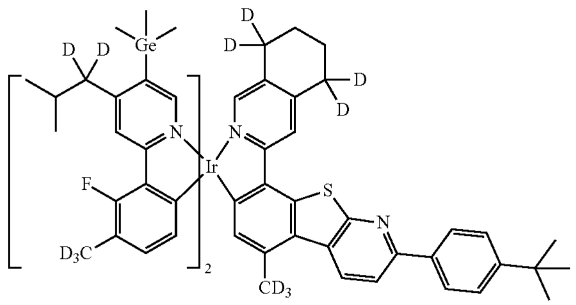
1601
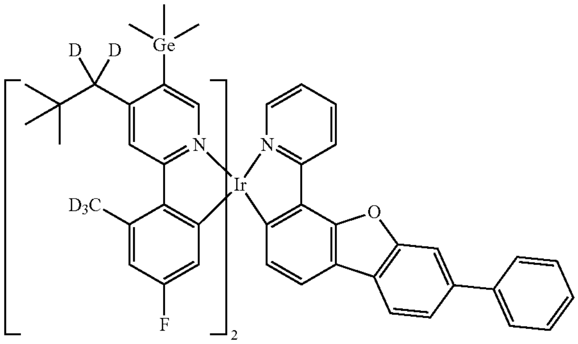
1602
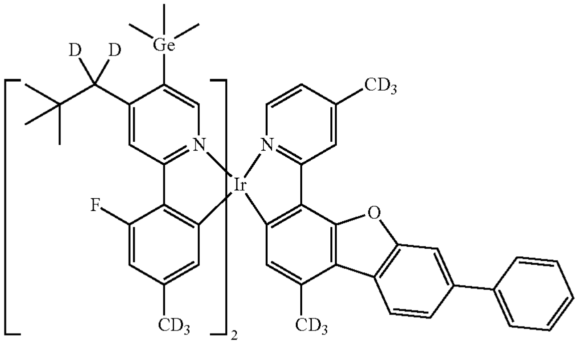
1603
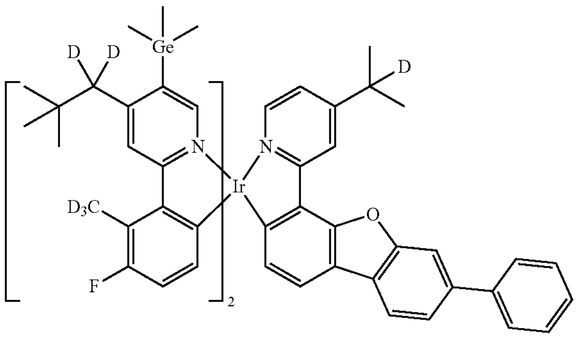

-continued
1604
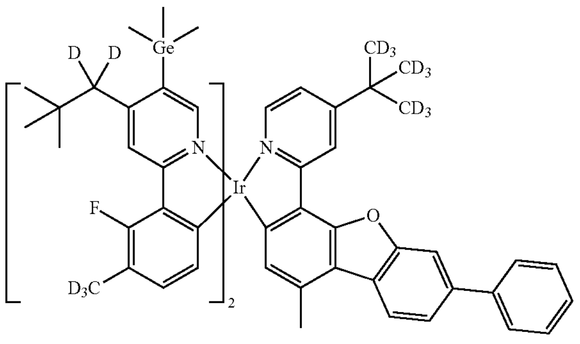
1605
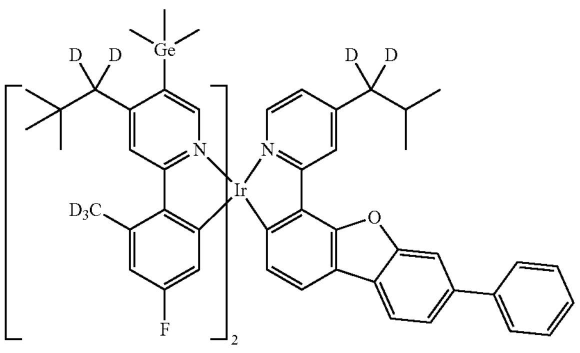
1606
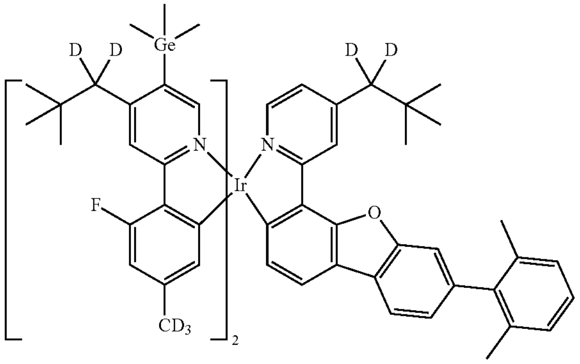
1607
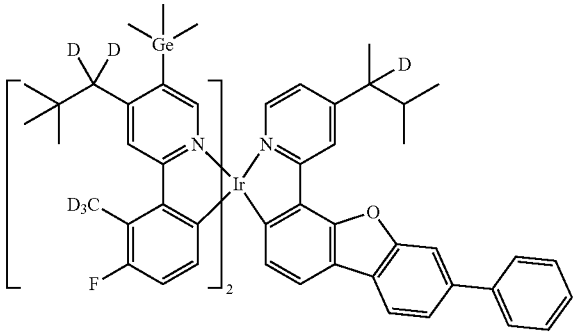
-continued
1608
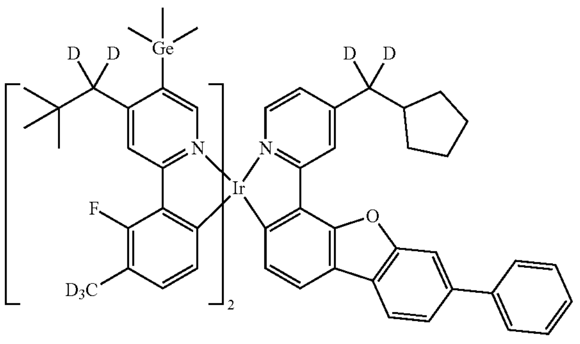
1609
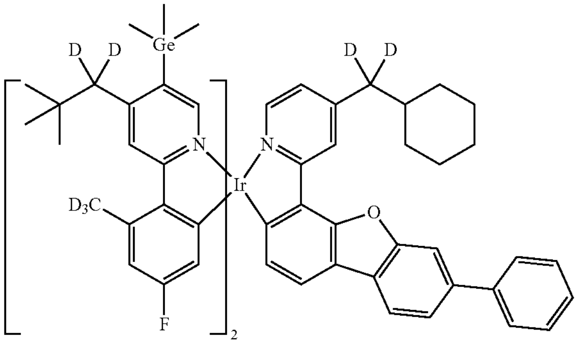
1610
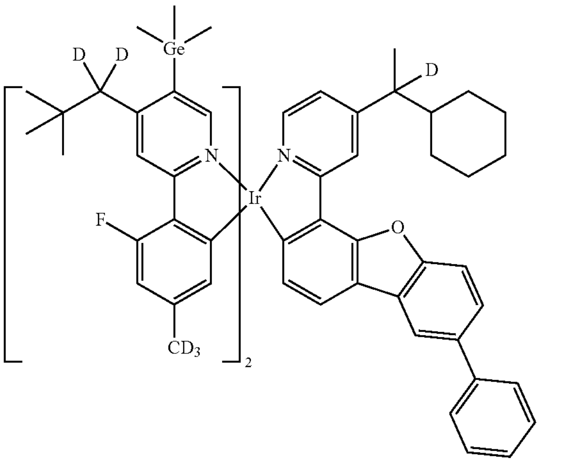
1611
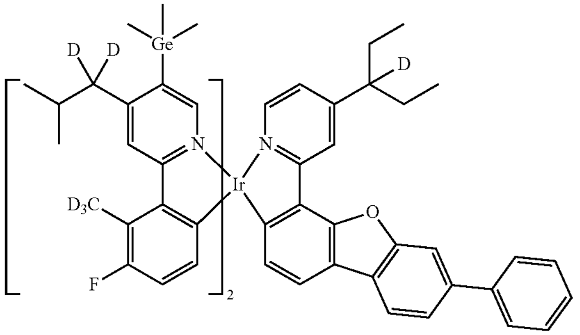

-continued
1612
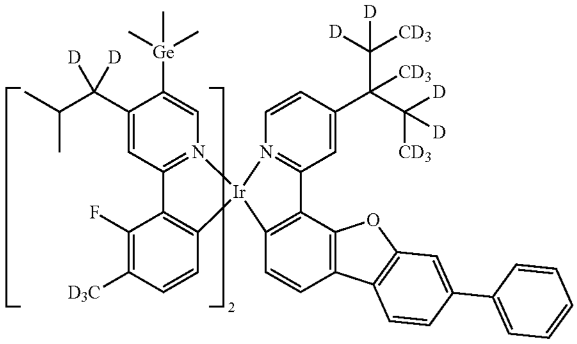
1613
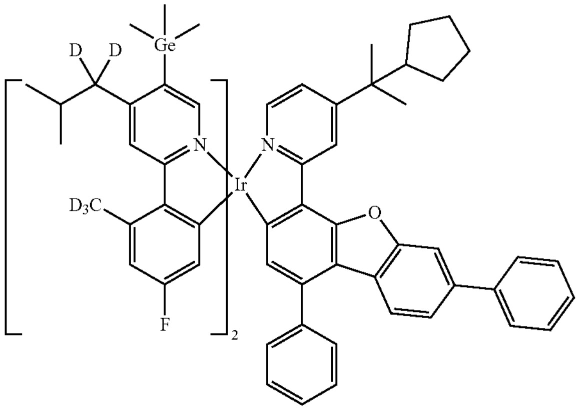
1614
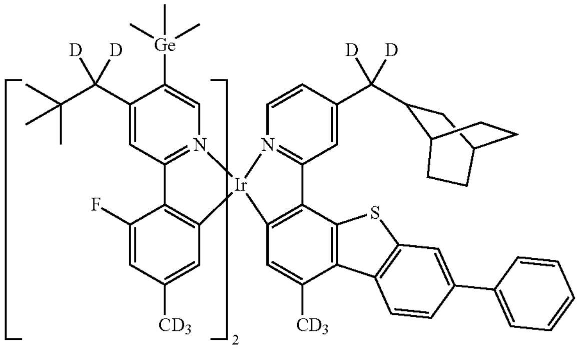
1615
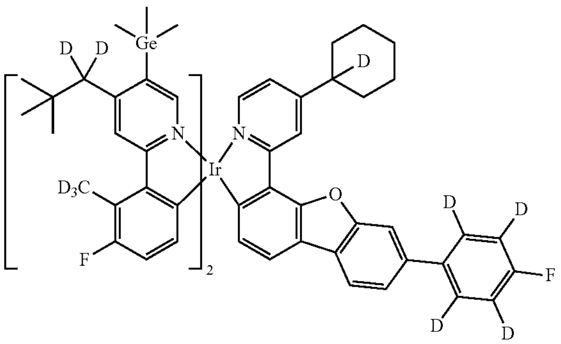
-continued
1616
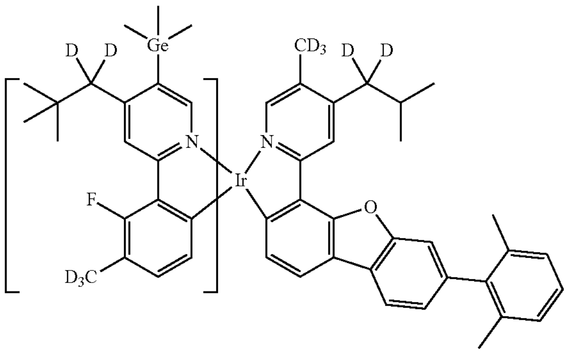
1617
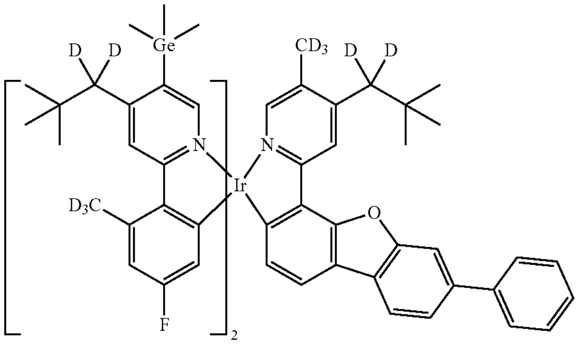
1618
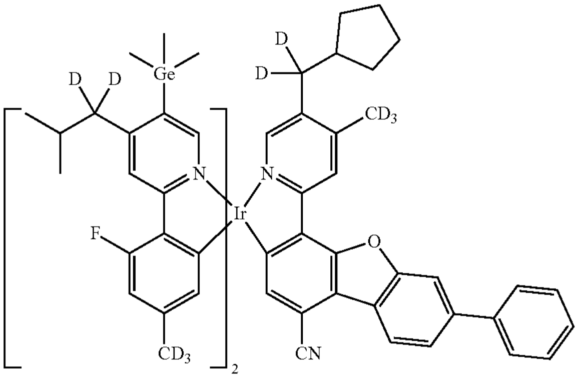
1619
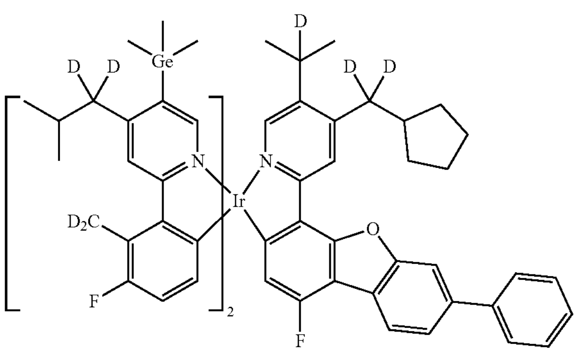

-continued
1620
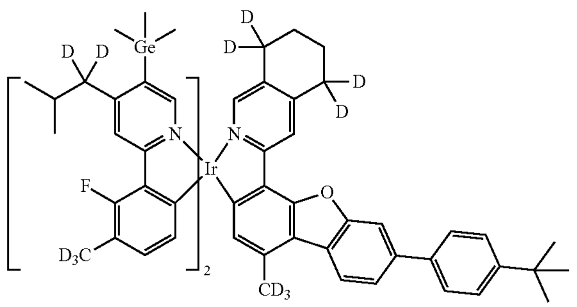
Group 2-3
1
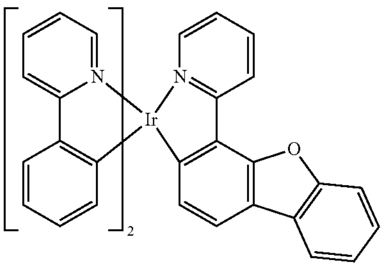
2
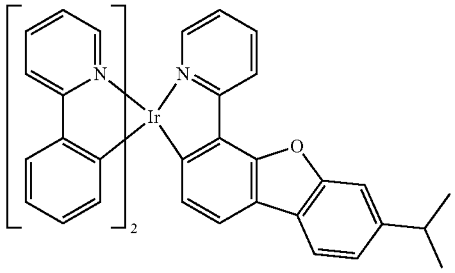
3
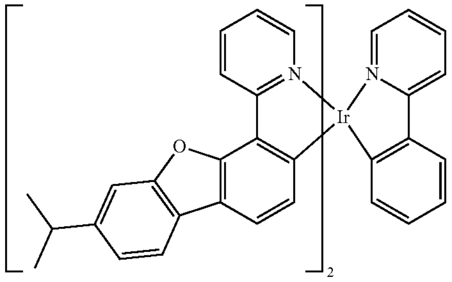
4
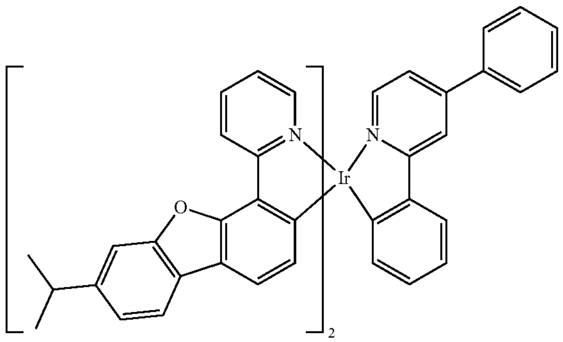
-continued
5
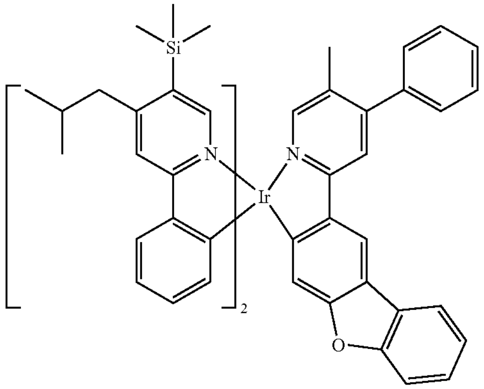
6
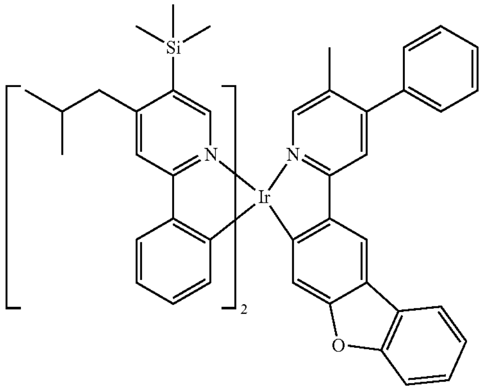
7
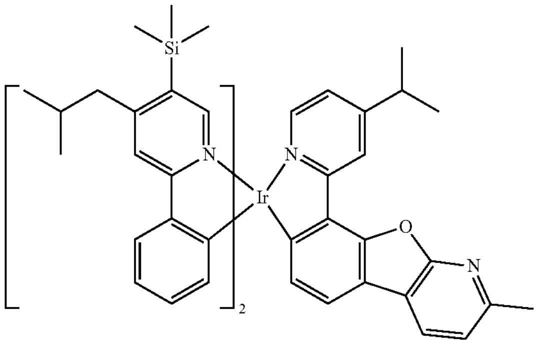
8
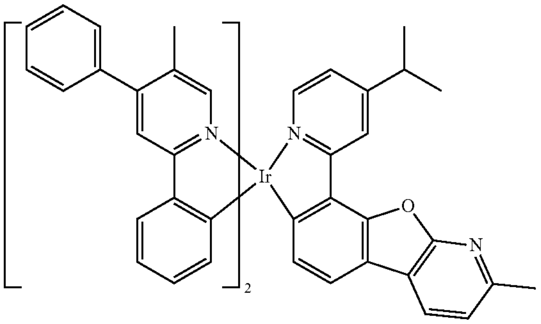

-continued
9
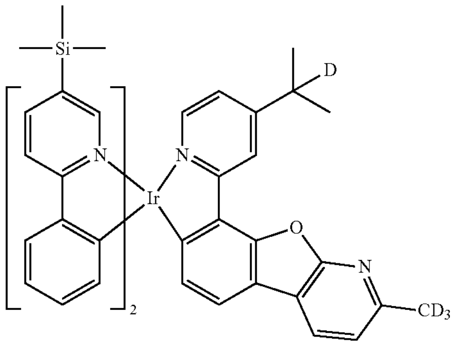
10
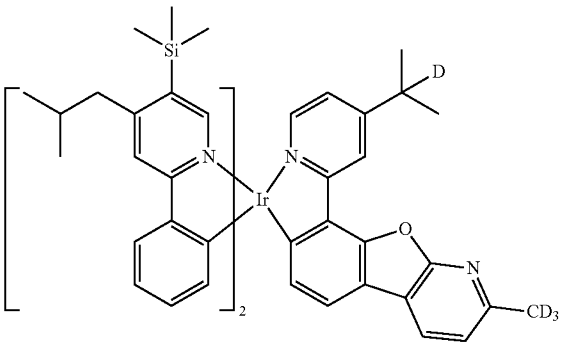
11
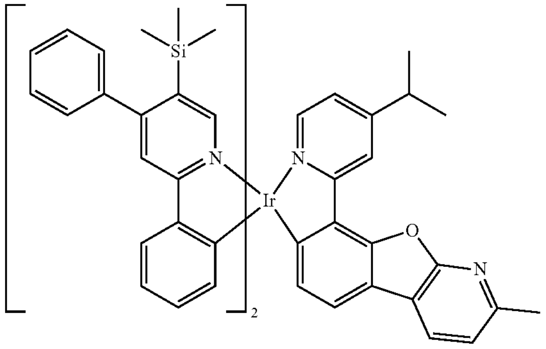
12
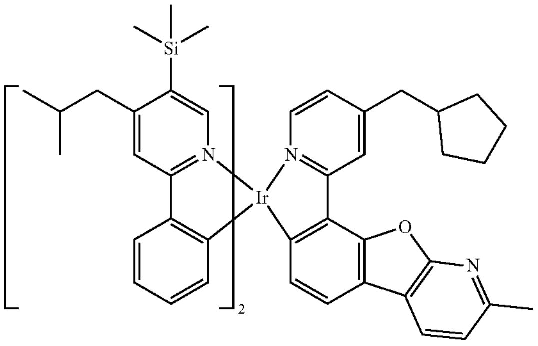
-continued
13
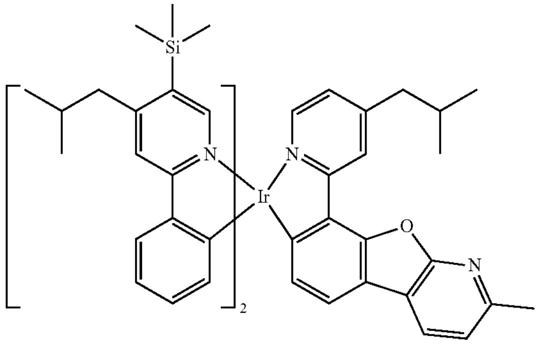
14
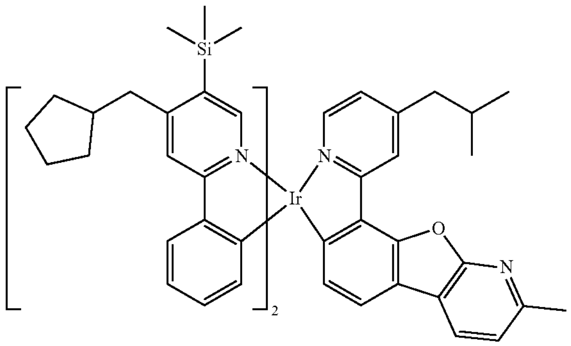
15
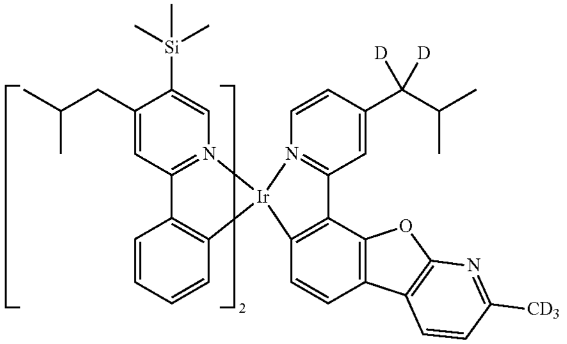
16
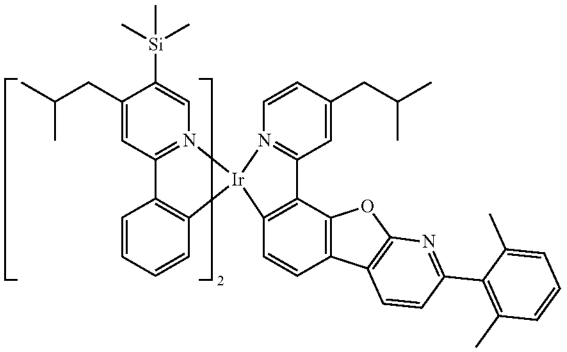

-continued
17
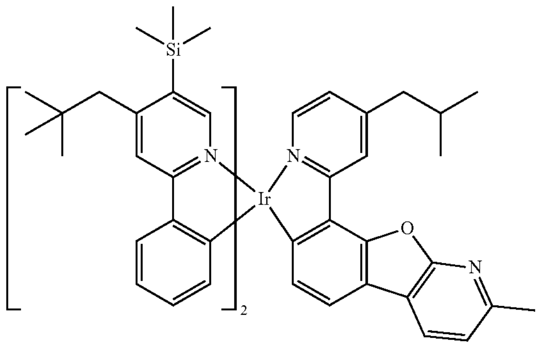
18
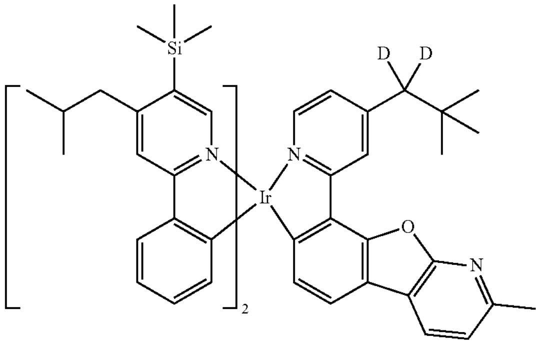
19
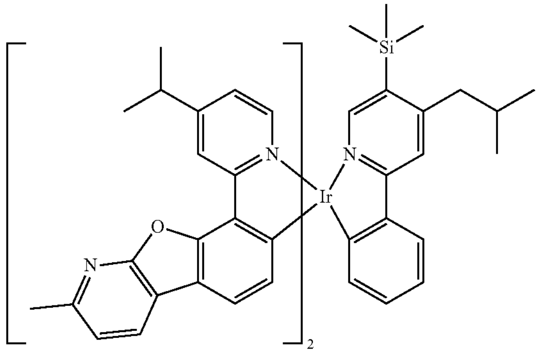
20
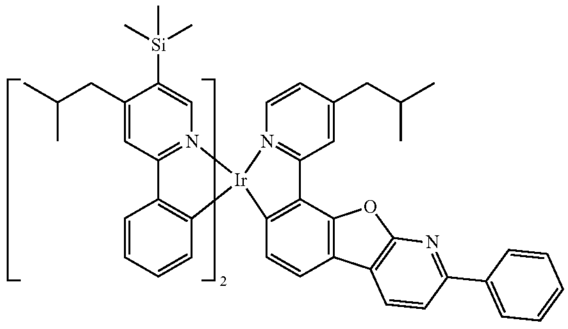
-continued
21
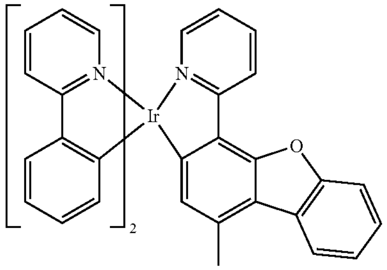
22
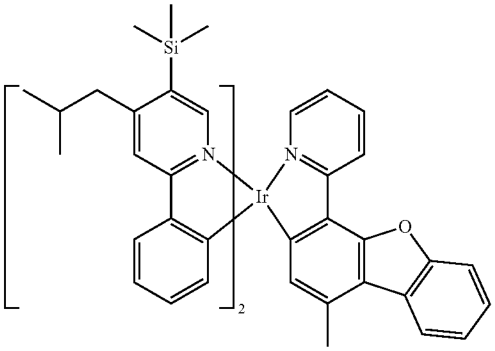
23
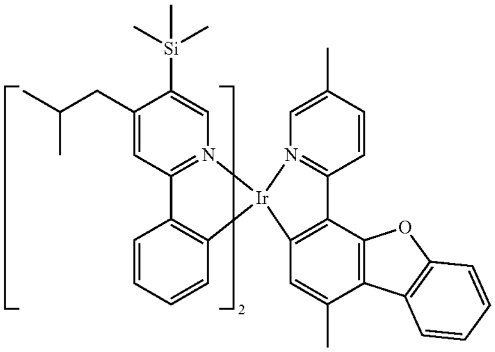
24
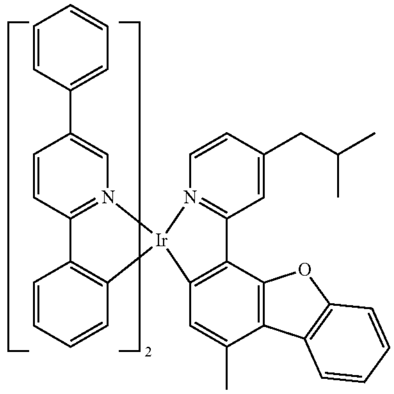

-continued
25
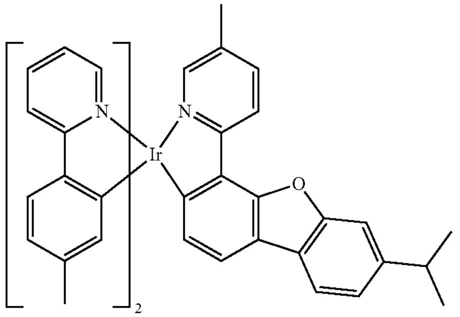
26
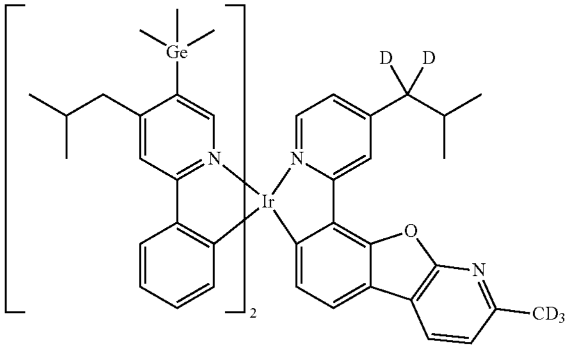
27
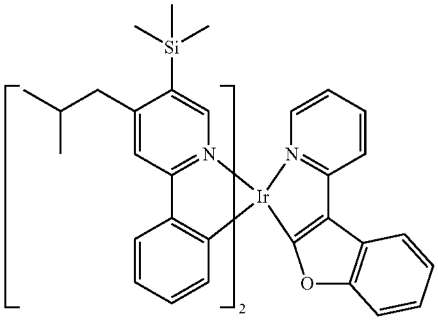
28
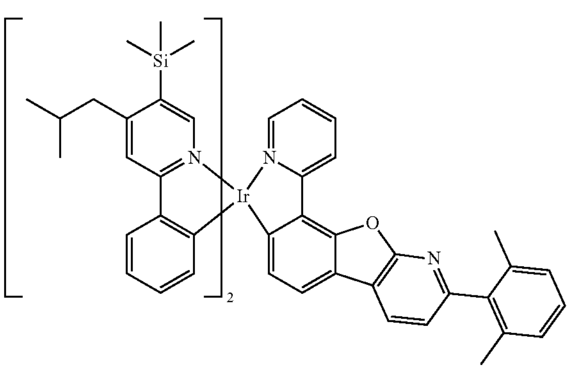
-continued
29
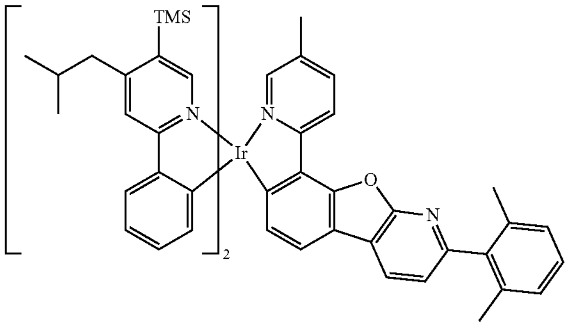
30
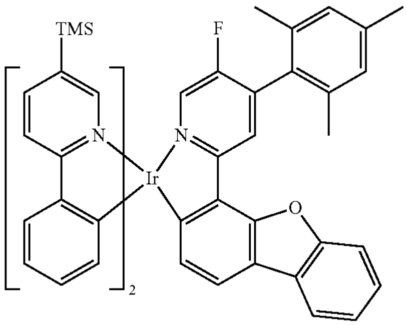
31
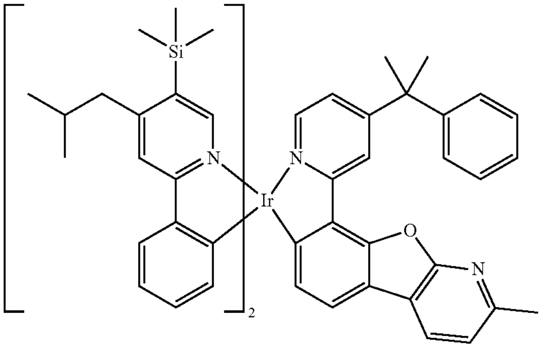
32
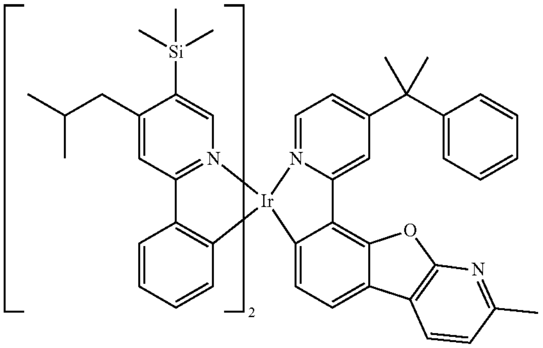

-continued
33
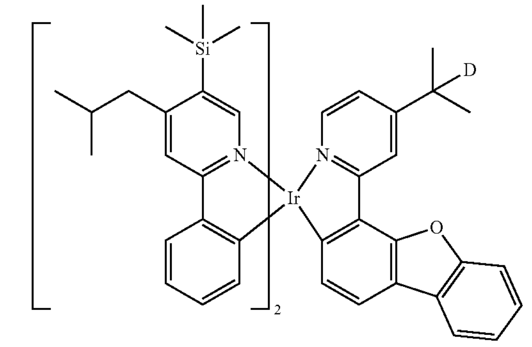
34
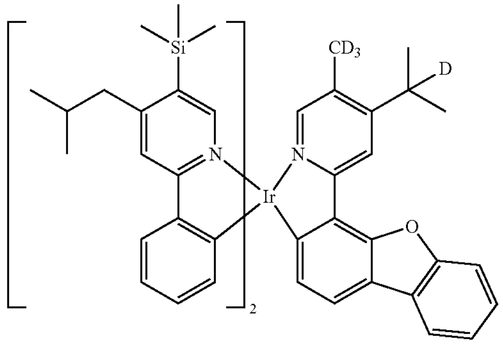
35
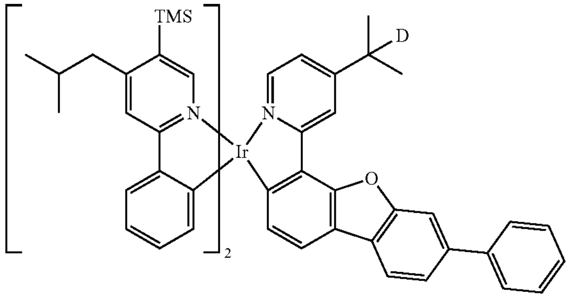
36
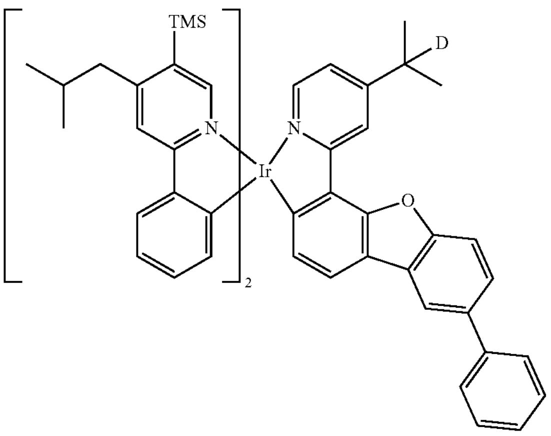
37
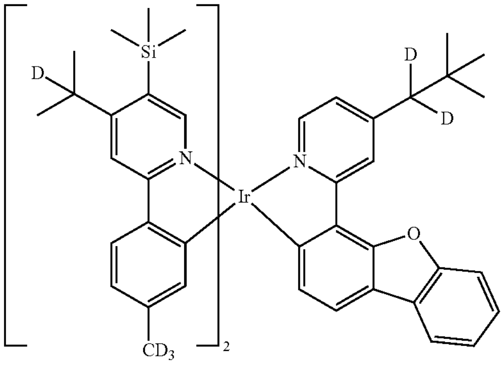
38
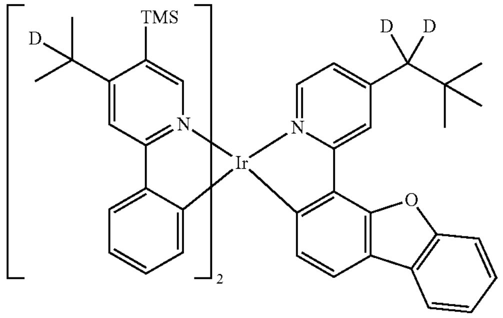
39
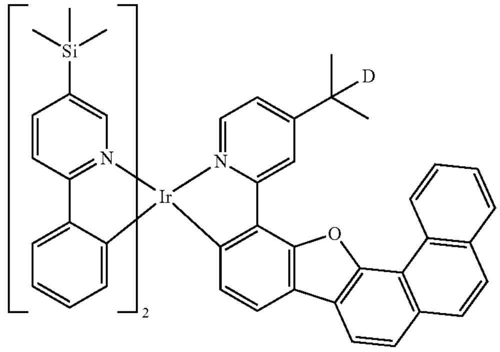
40
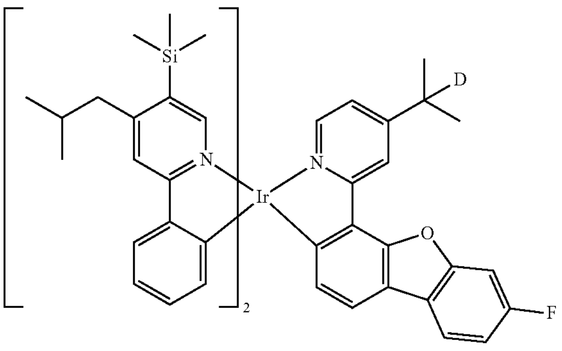

-continued
41
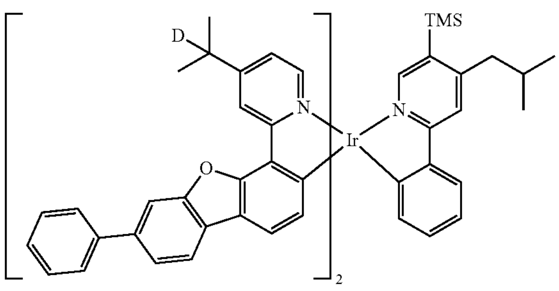
42
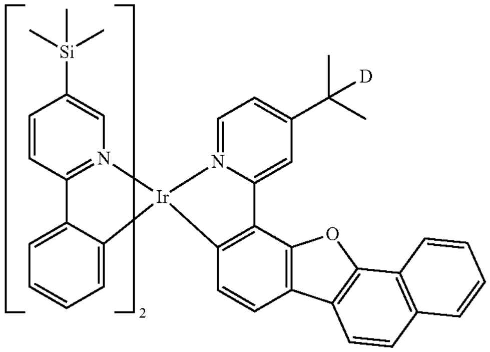
43
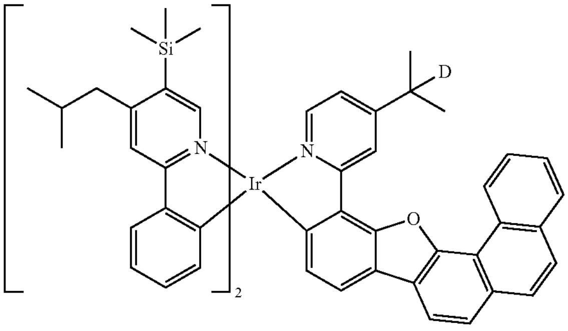
44
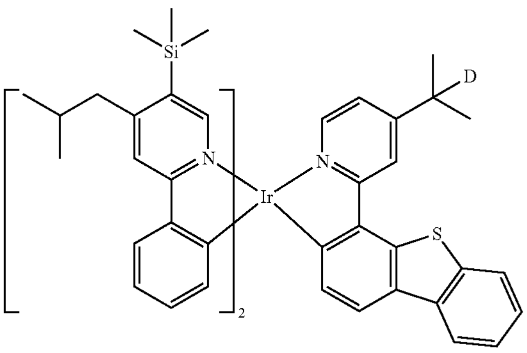
-continued
45
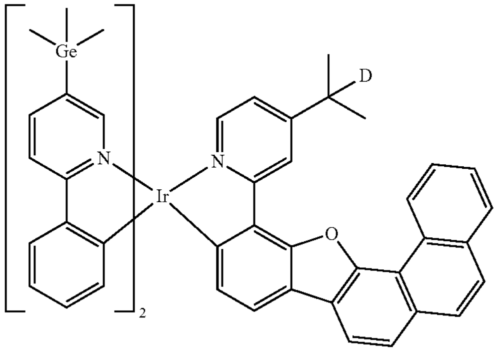
46
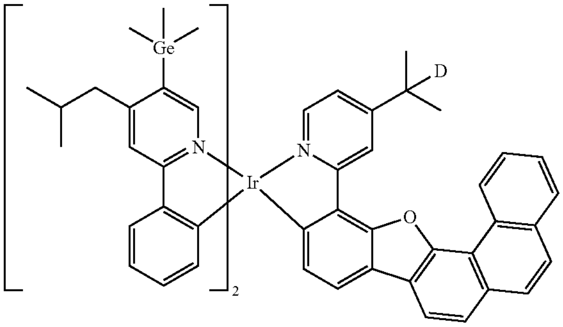
47
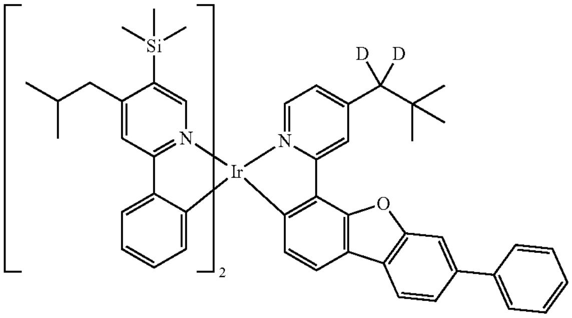
48
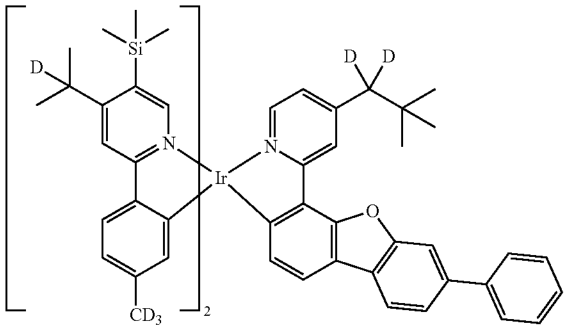

-continued
49
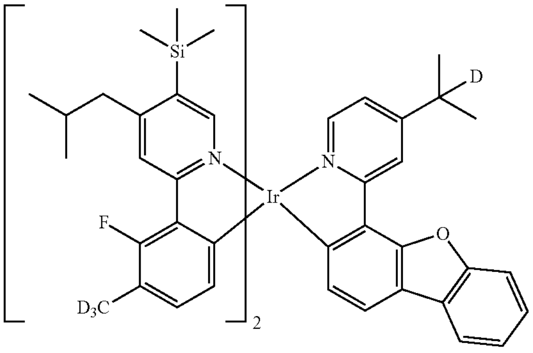
50
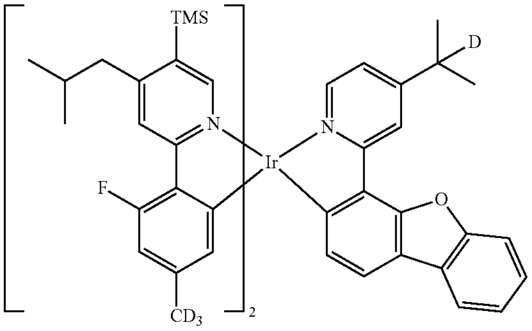
51
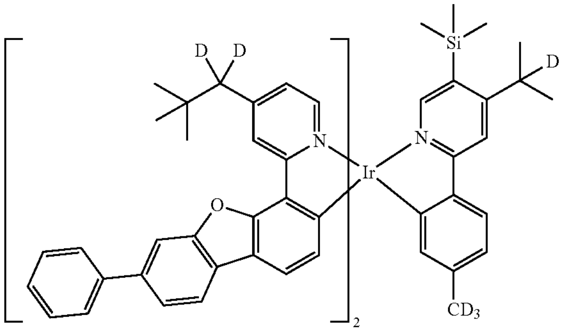
52
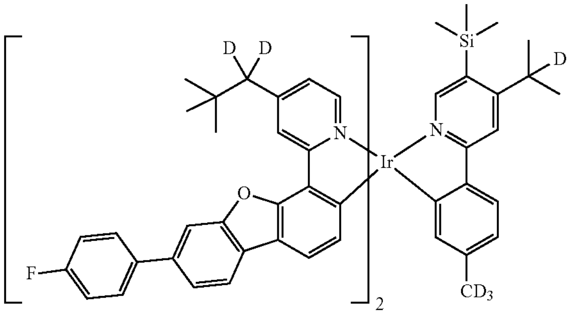
-continued
53
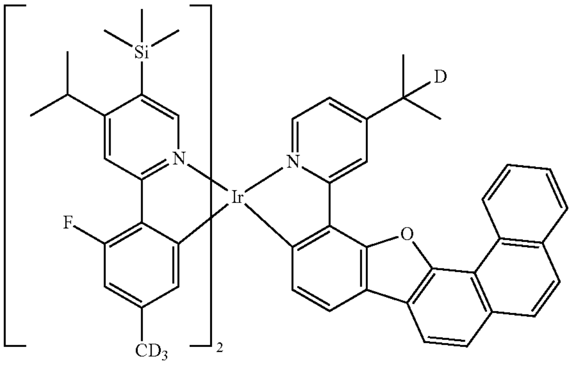
54
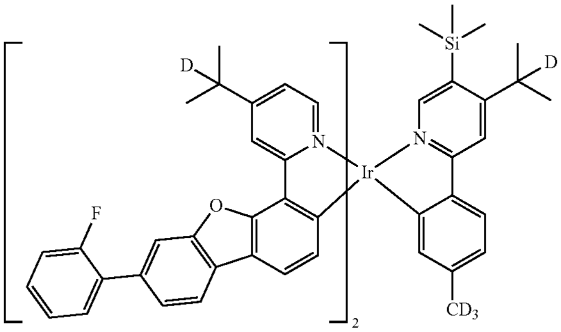
55
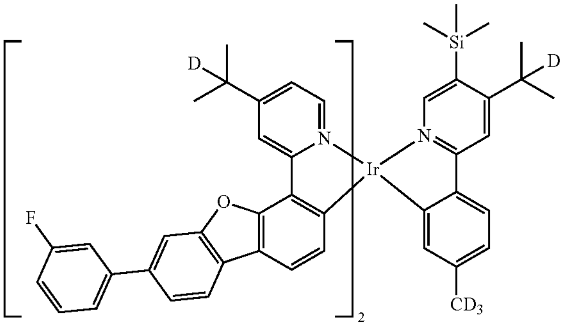
56
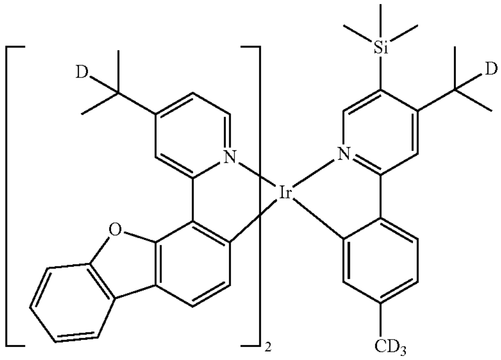

-continued
57
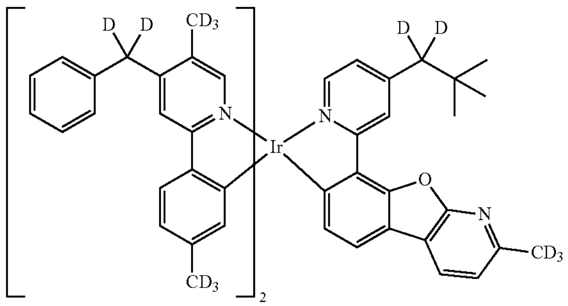
58
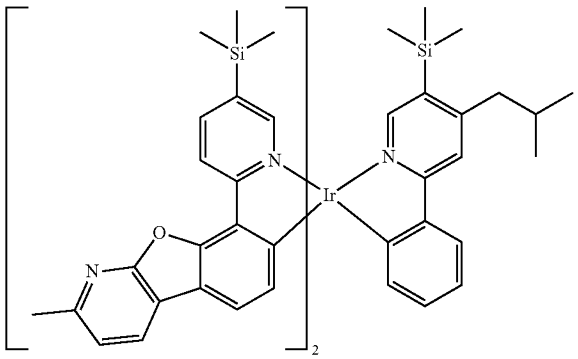
59
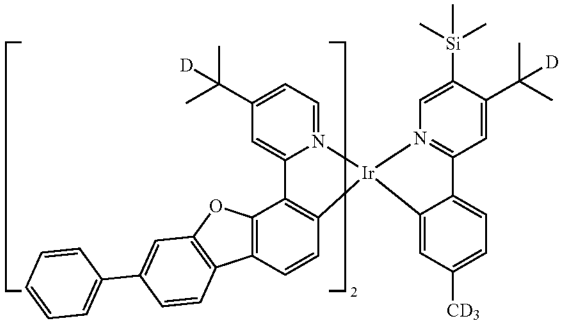
60
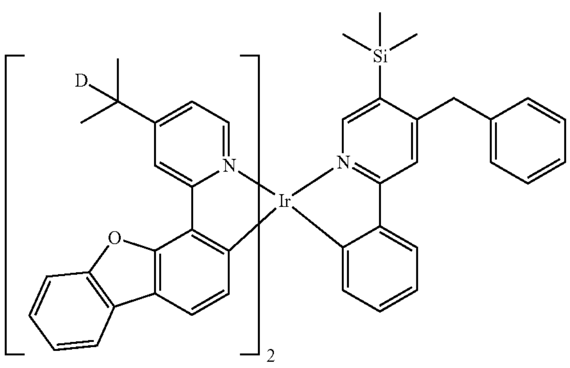
-continued
61
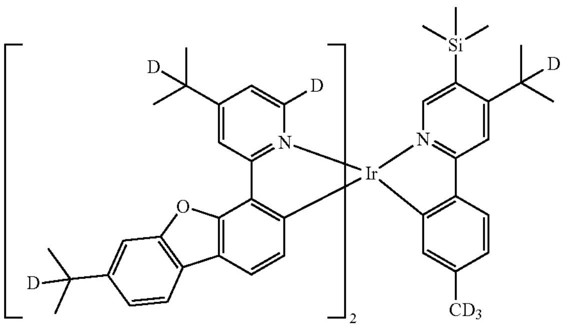
62
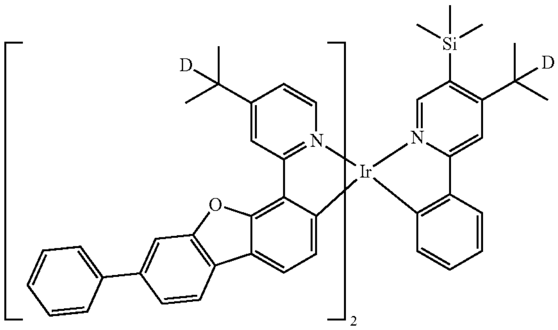
63
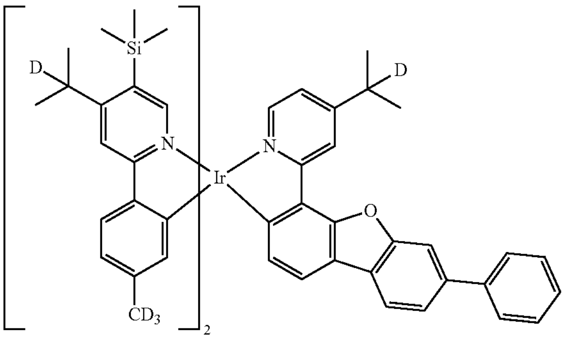
64
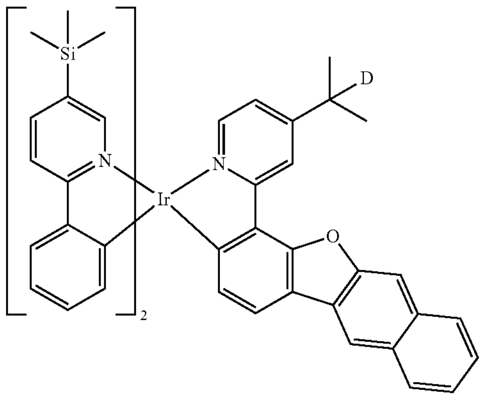

-continued
65
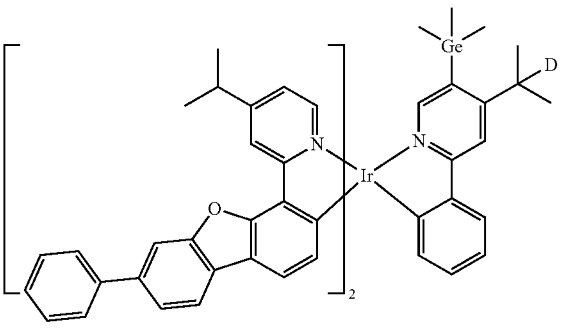
66
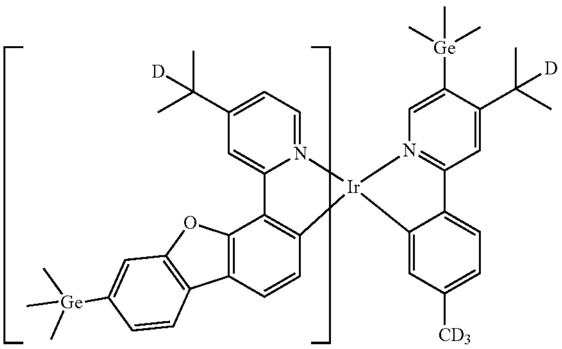
67
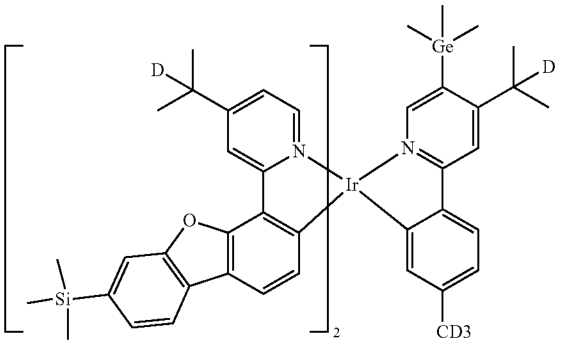
68
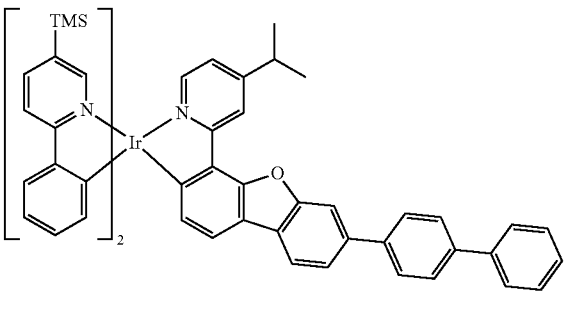
-continued
69
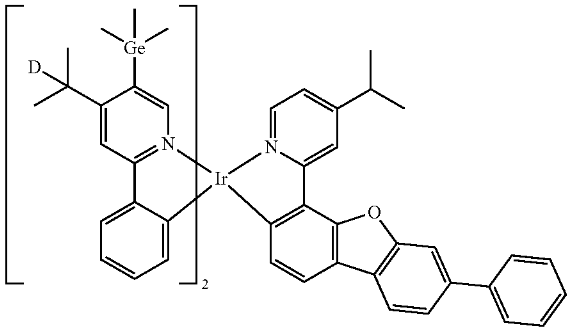
70
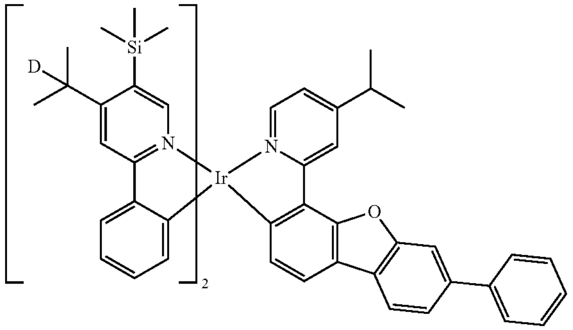
71
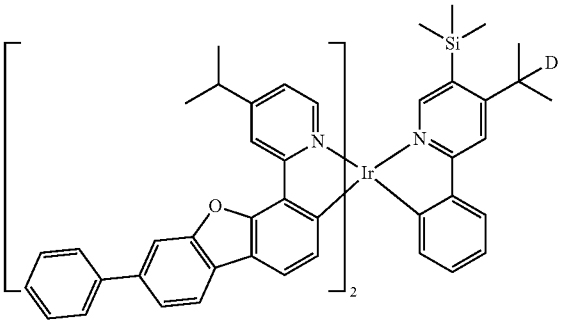
72
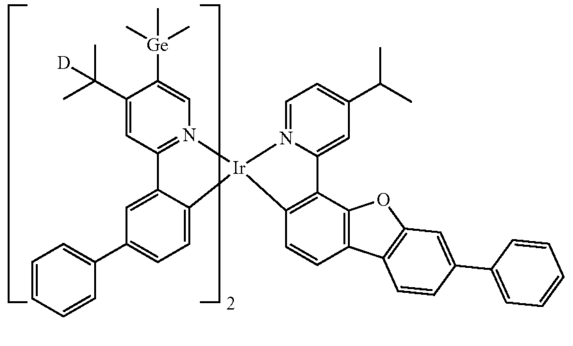

-continued
73
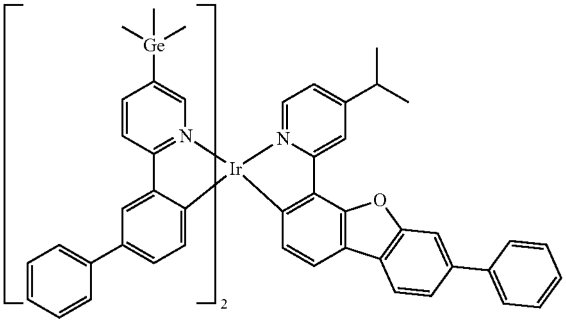
74
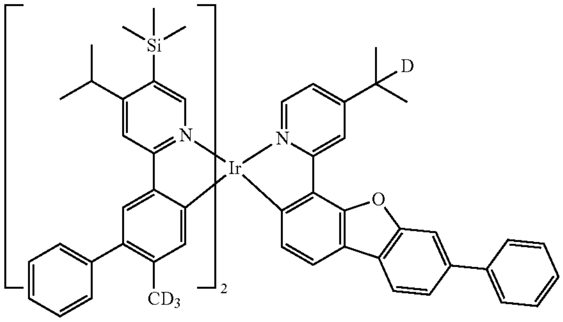
75
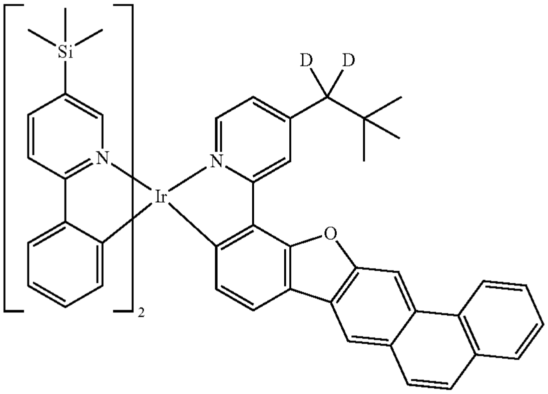
76
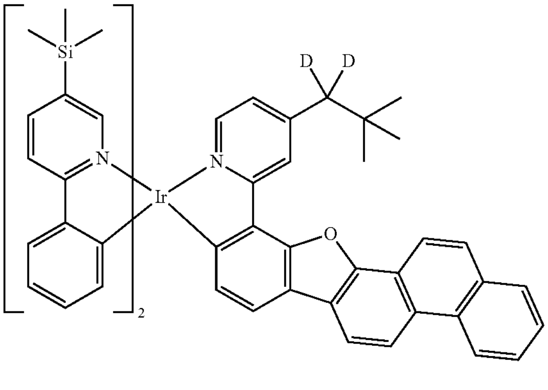
-continued
77
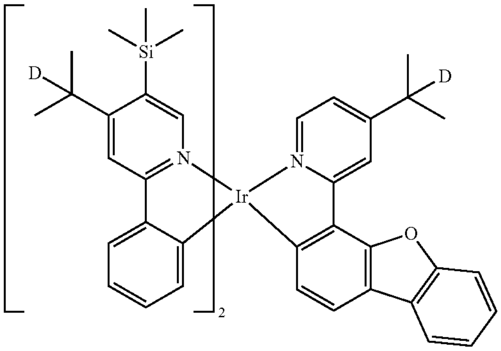
78
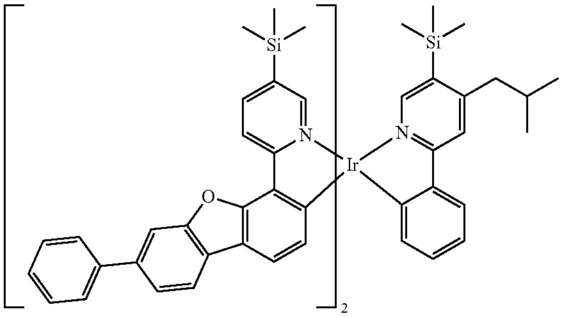
79
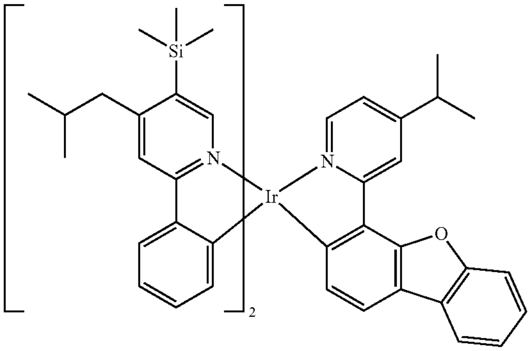
Group 2-4
1
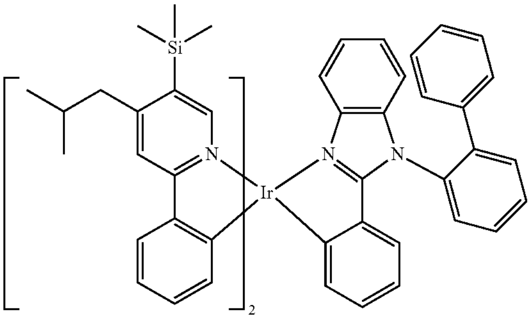

-continued
2
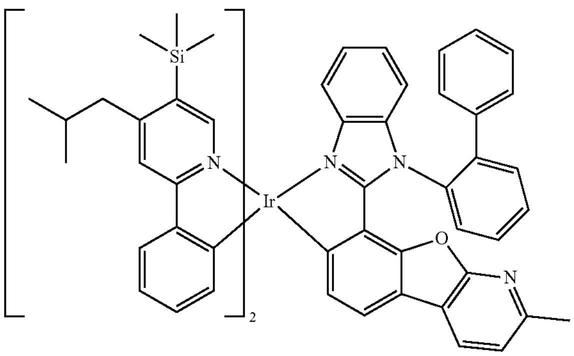
3
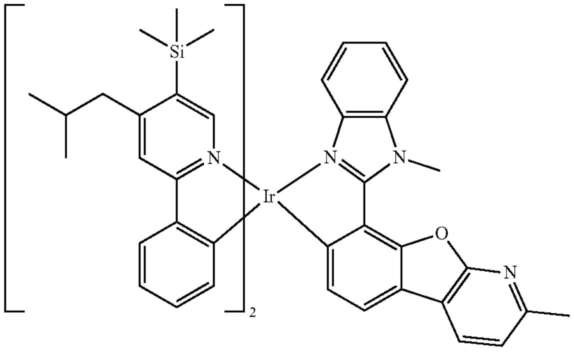
4
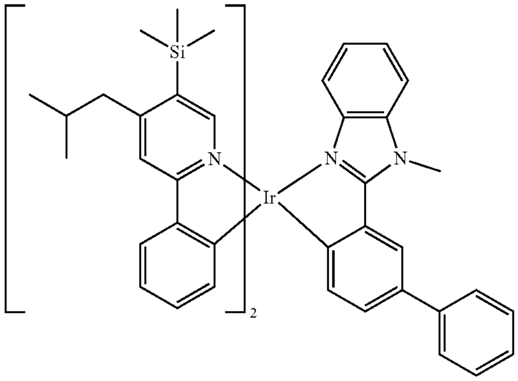
5
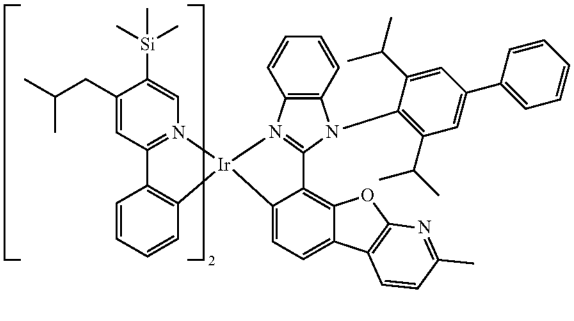
-continued
6
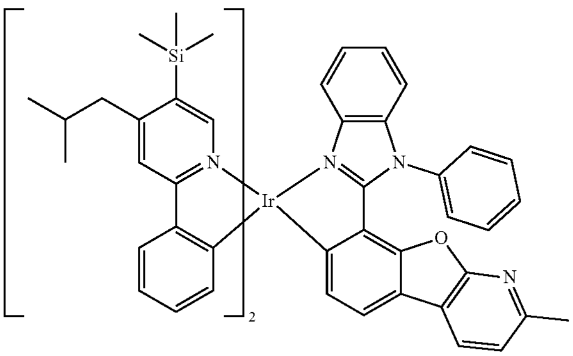
7
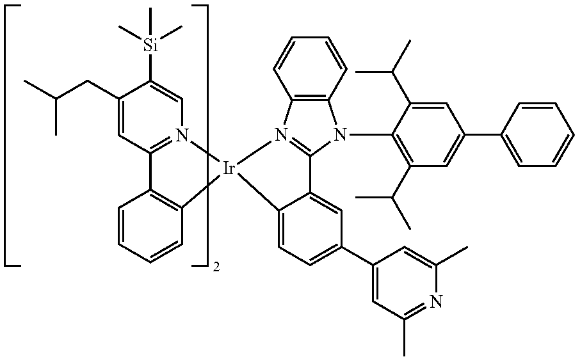
8
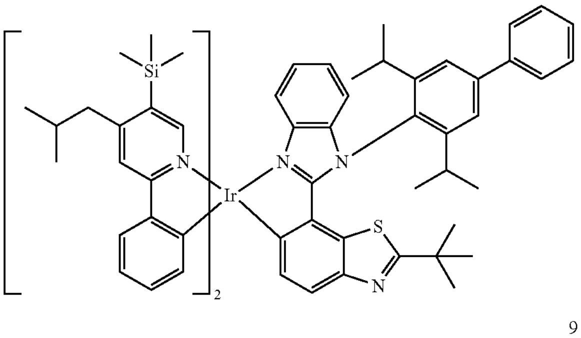
9
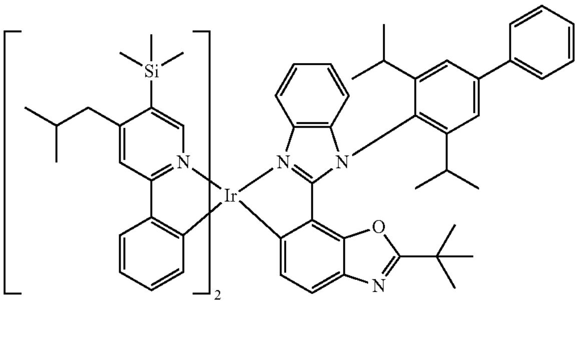

-continued
10
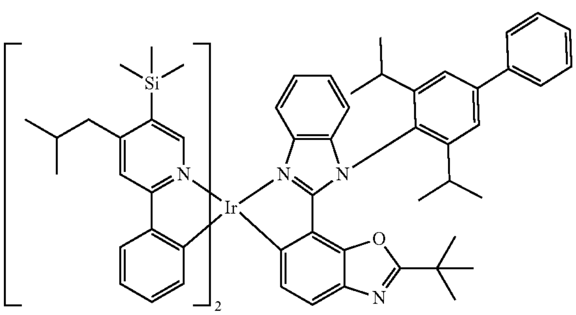
11
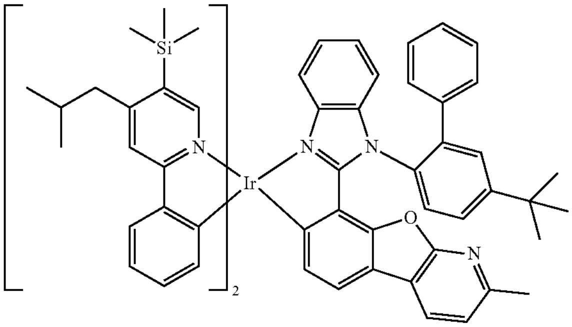
12
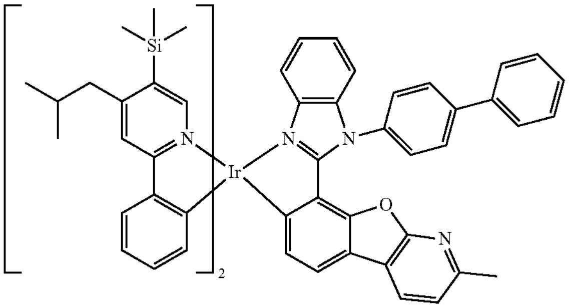
13
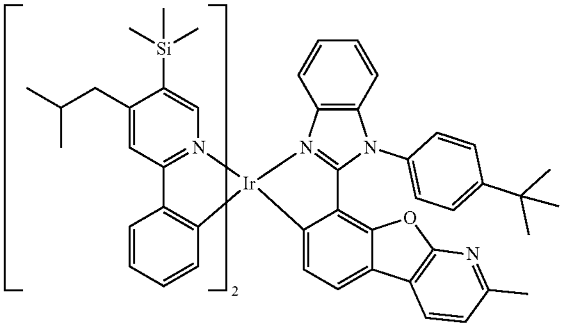
-continued
14
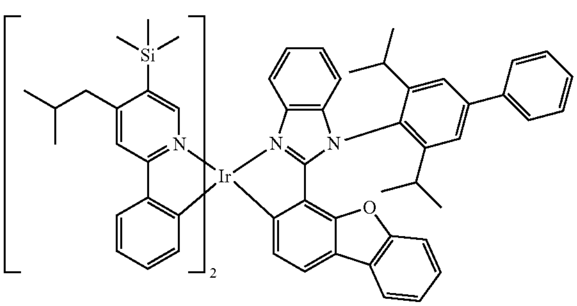
15
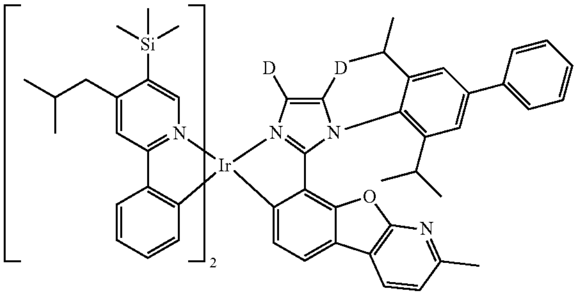
16
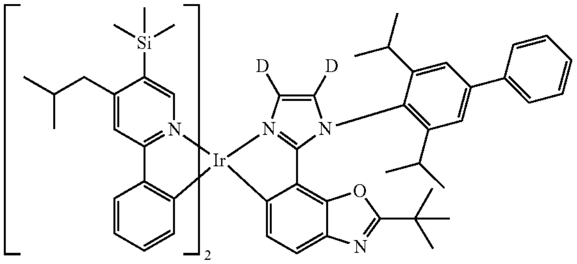
17
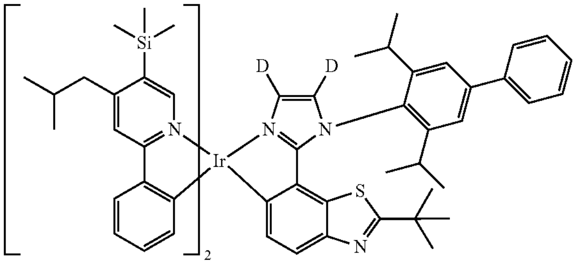
18
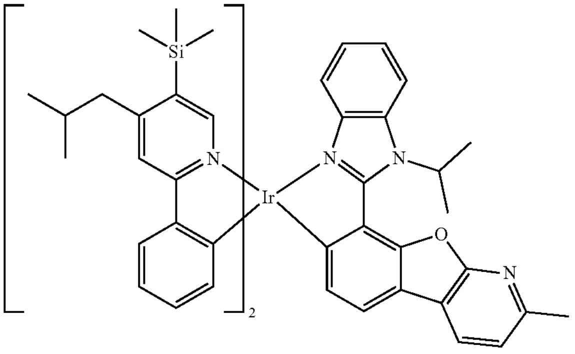

-continued
19
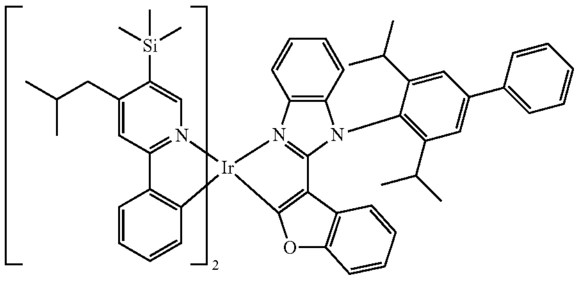
20
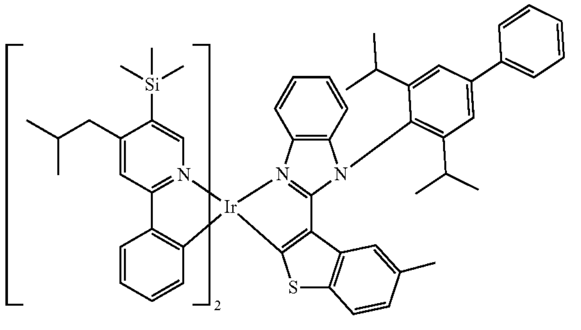
21
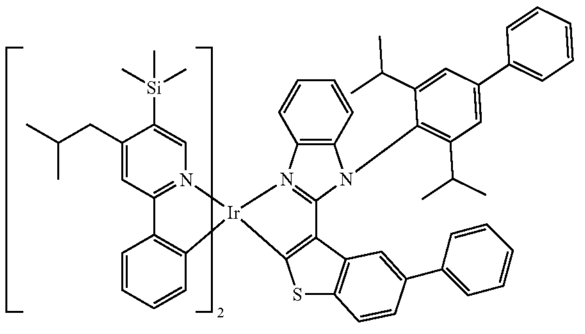
22
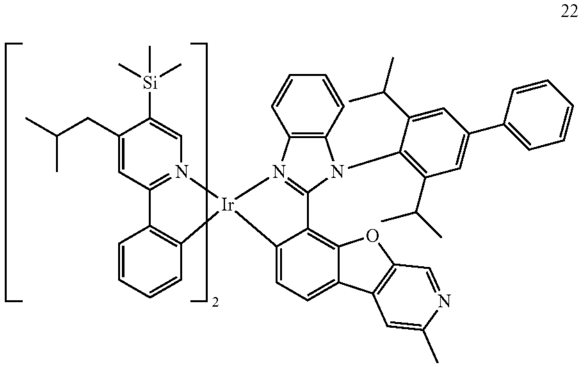
-continued
23
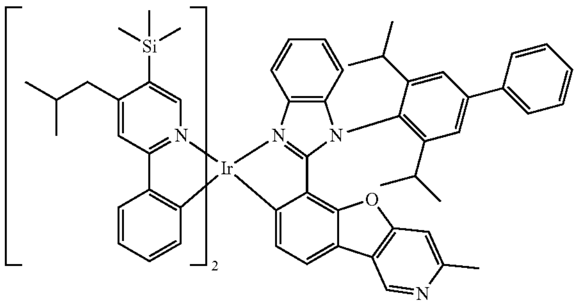
24
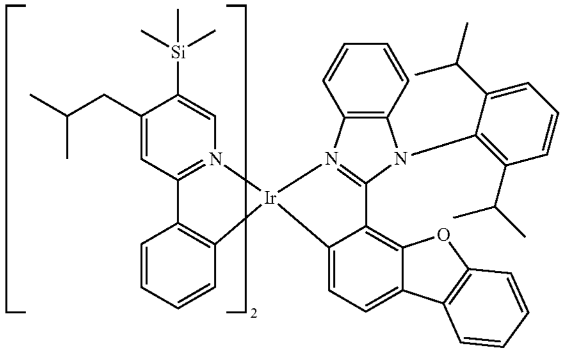
25
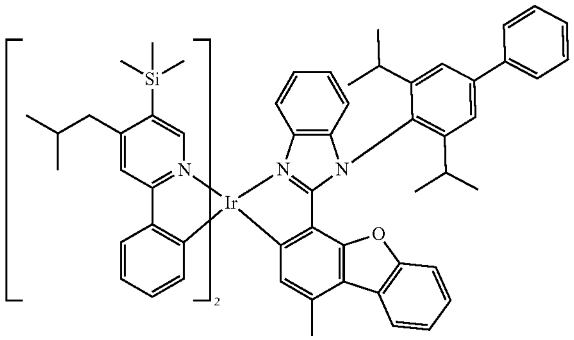
26
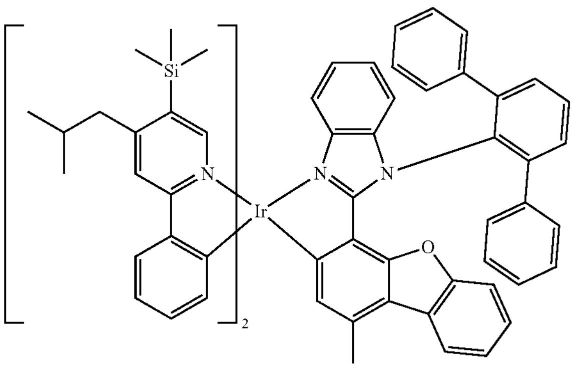

27
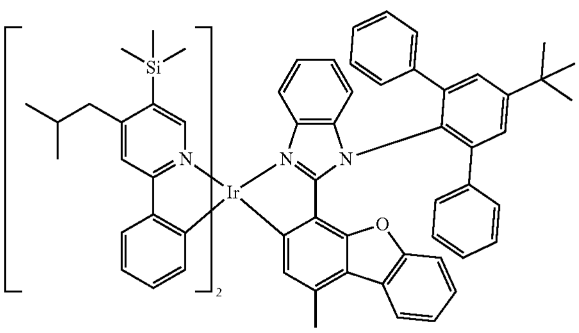
28
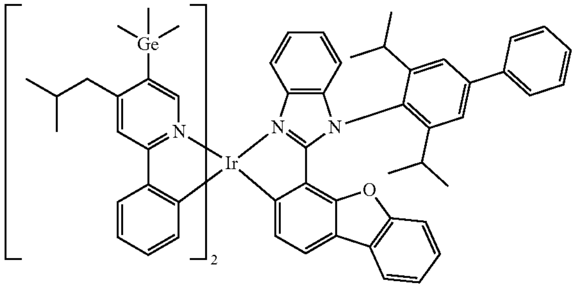
29
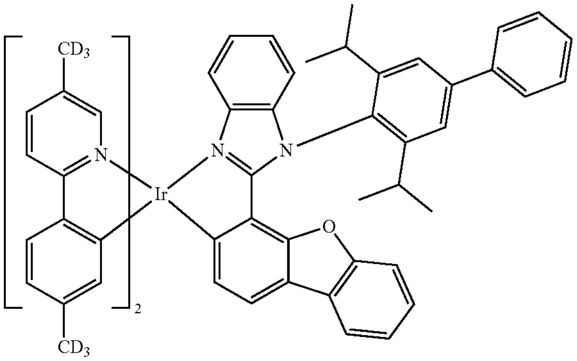
30
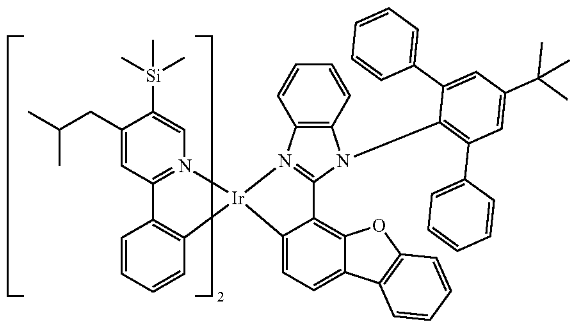
31
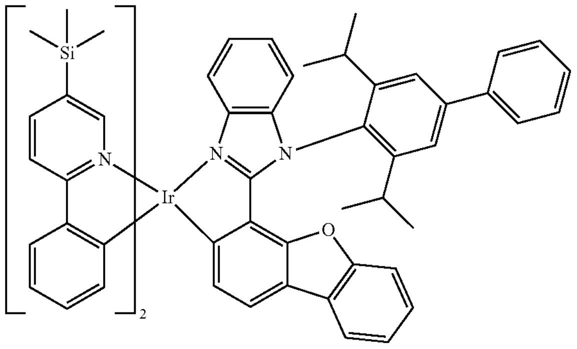
32
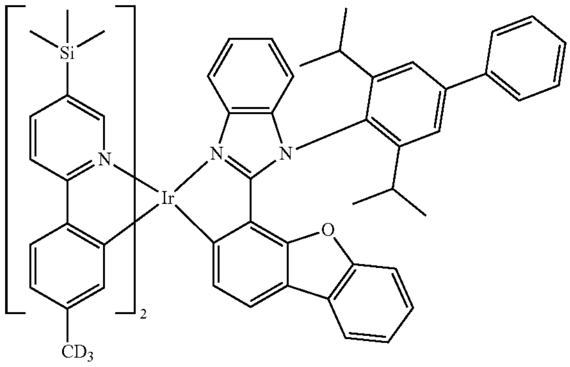
33
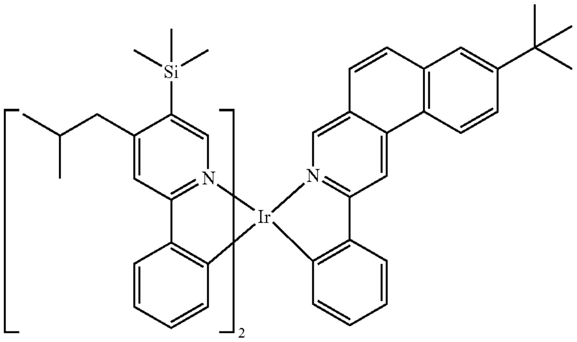
34
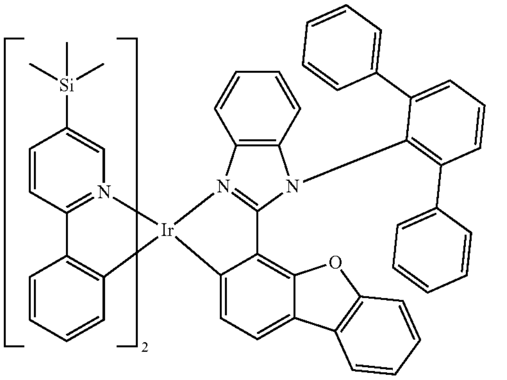

-continued
35
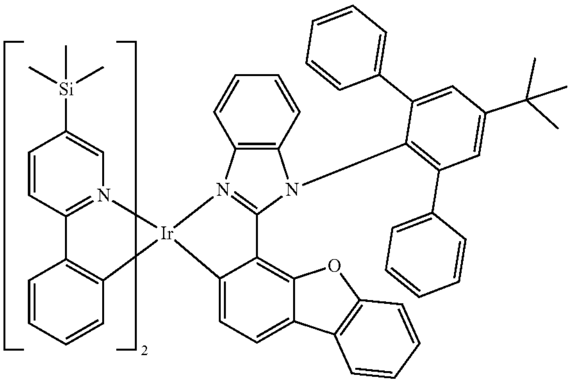
36
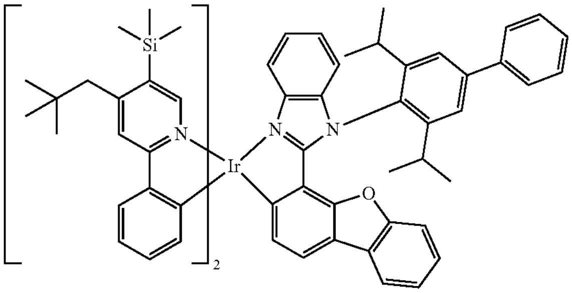
37
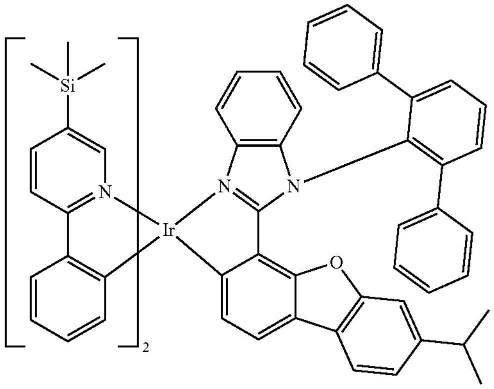
38
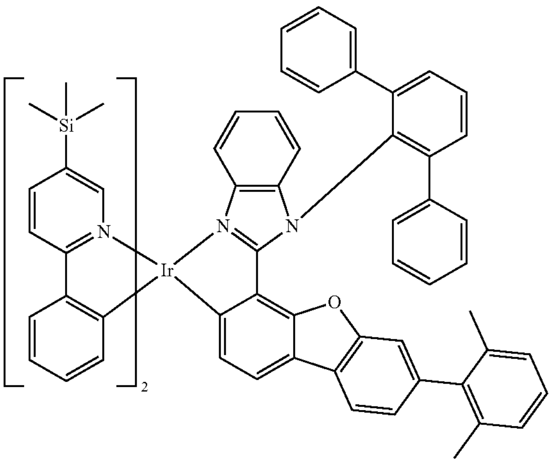
-continued
39
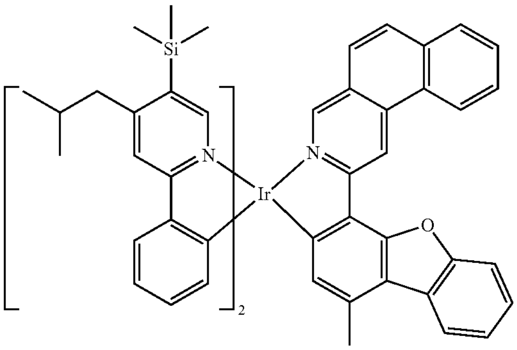
40
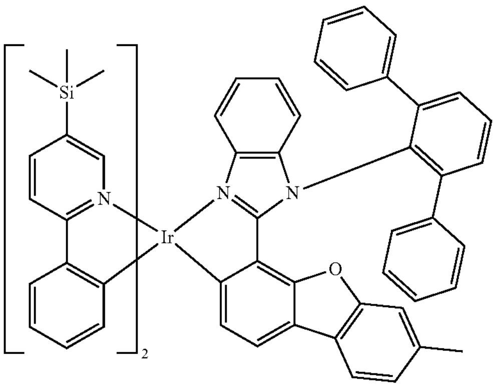
41
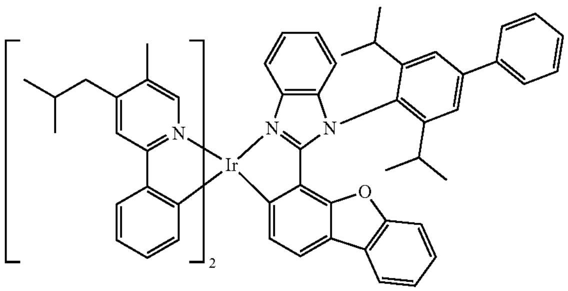
42
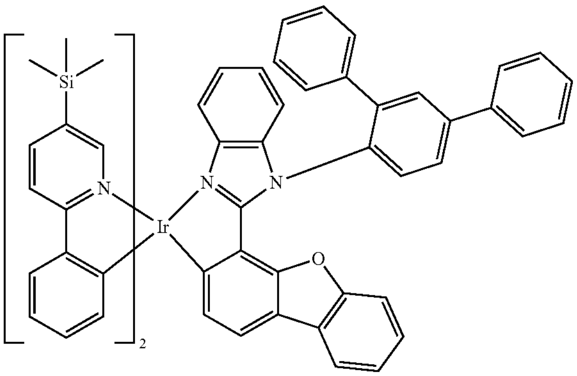

-continued
43
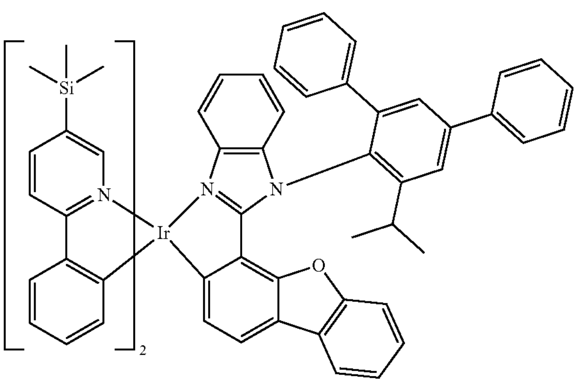
44
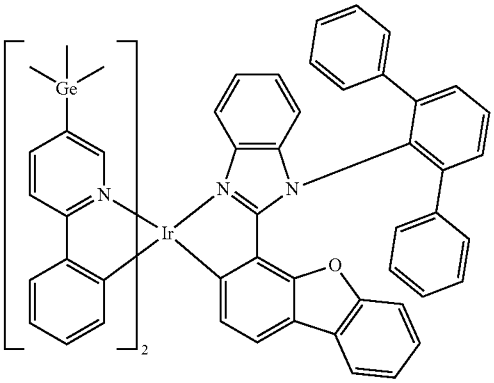
45
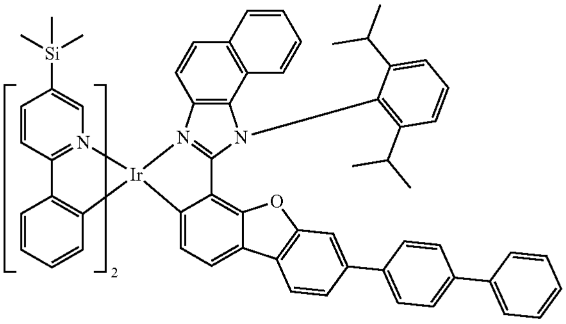
46
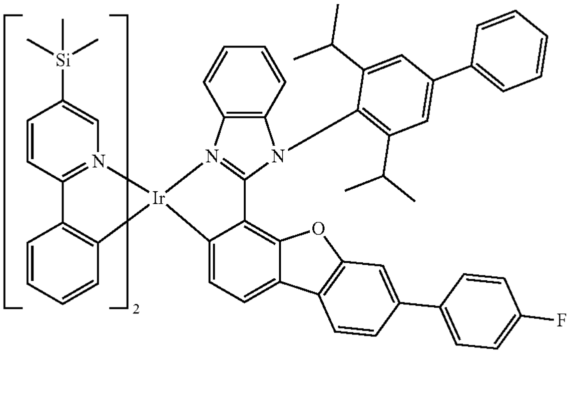
-continued
47
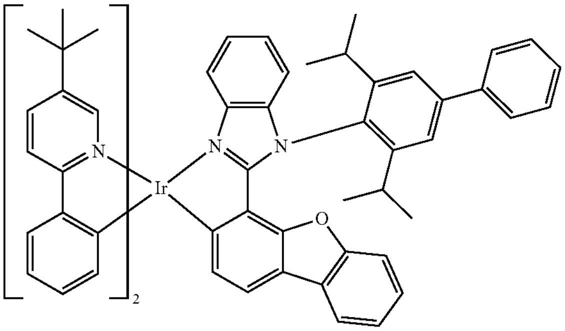
48
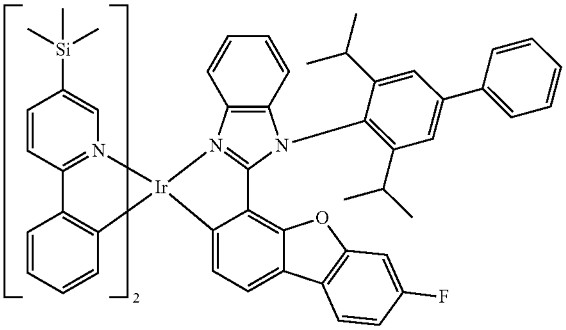
49
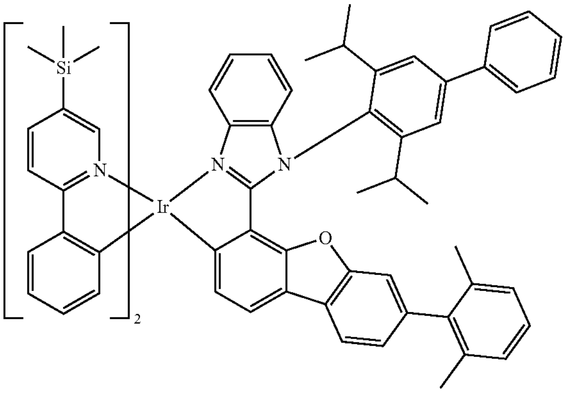
50
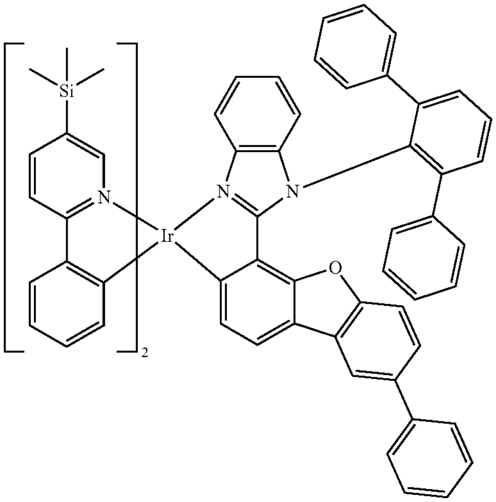

-continued
51
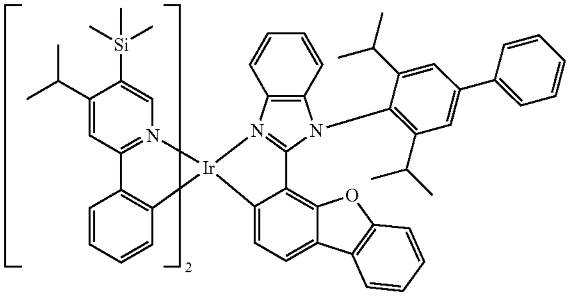
52
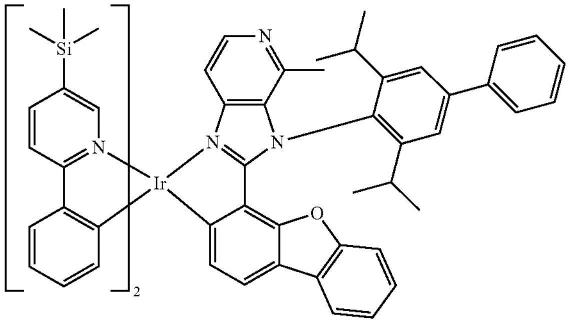
53
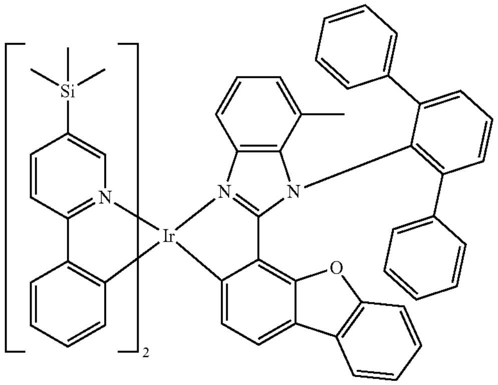
54
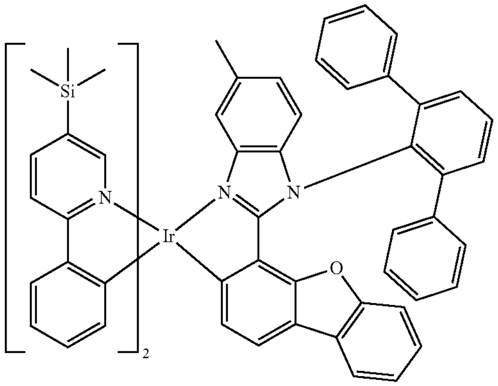
-continued
55
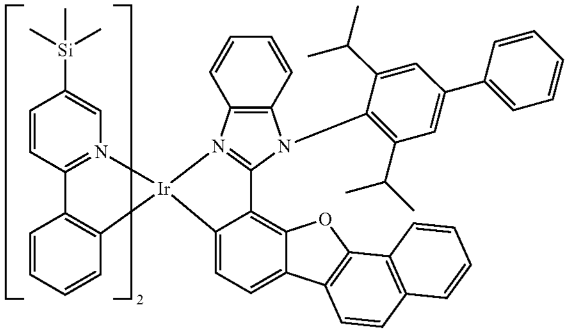
56
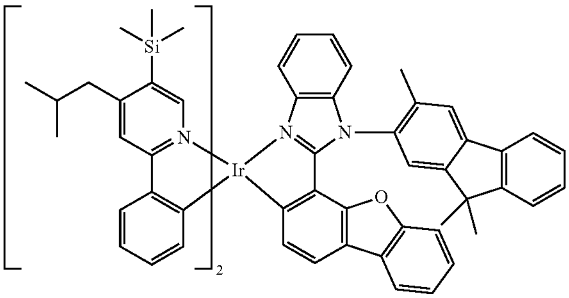
57
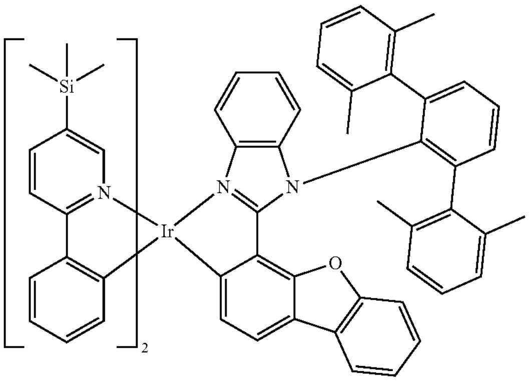
58
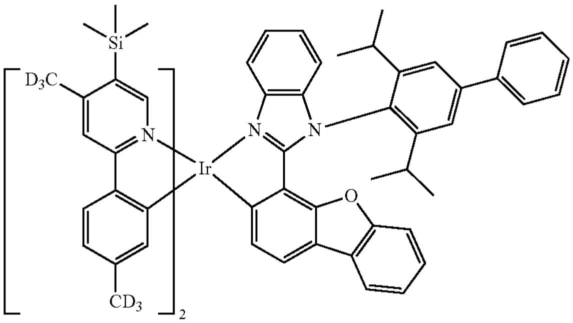

-continued
59
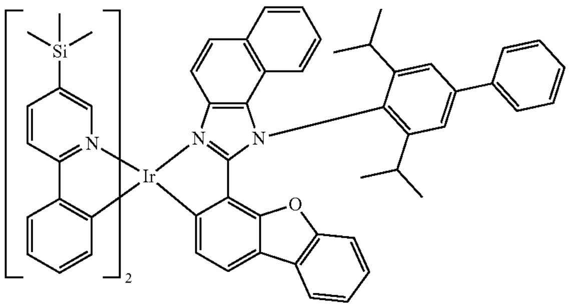
60
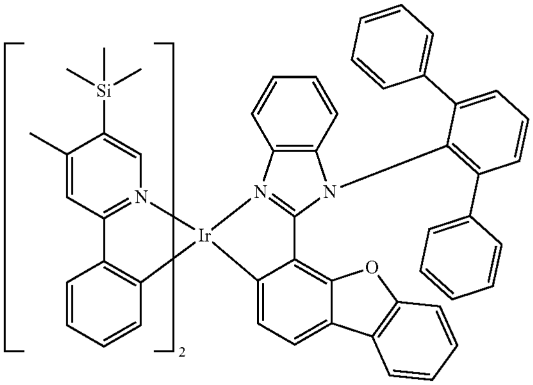
61
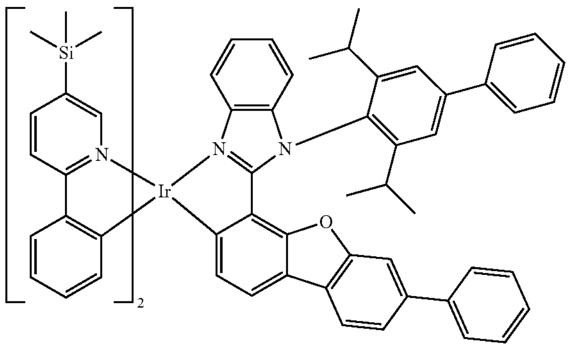
62
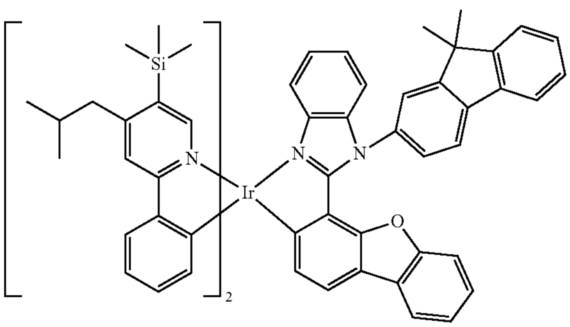
-continued
63
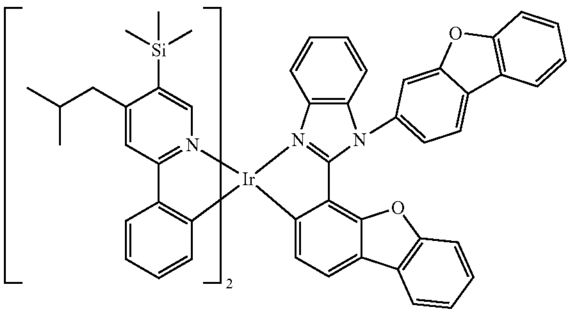
64
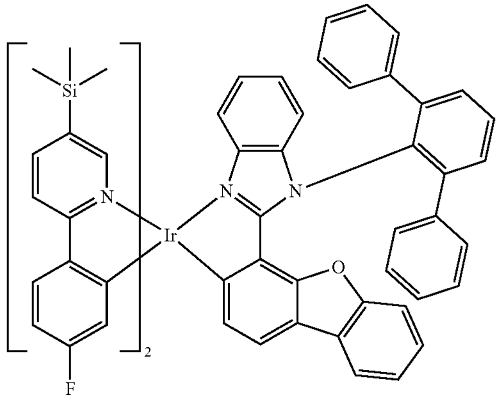
65
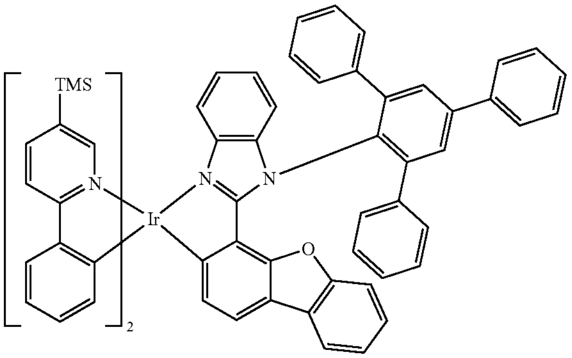
66
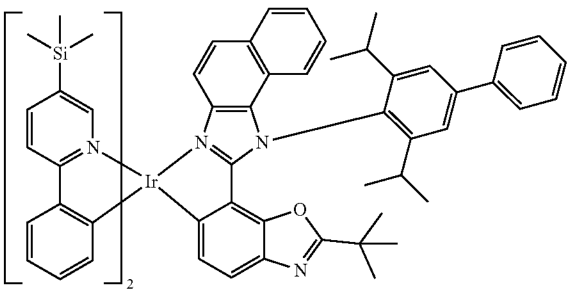

67
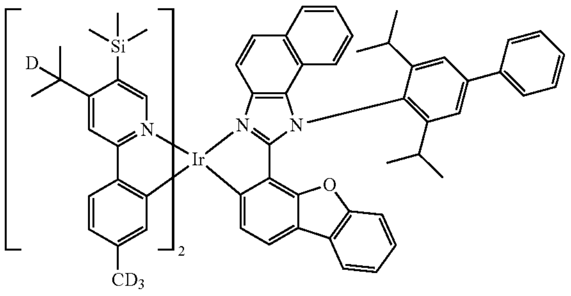
68
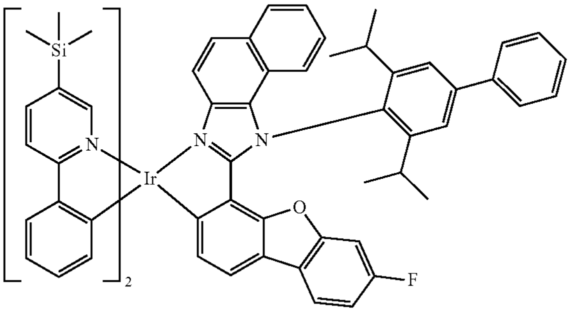
69
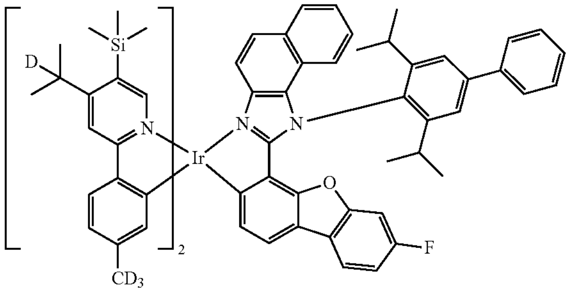
70
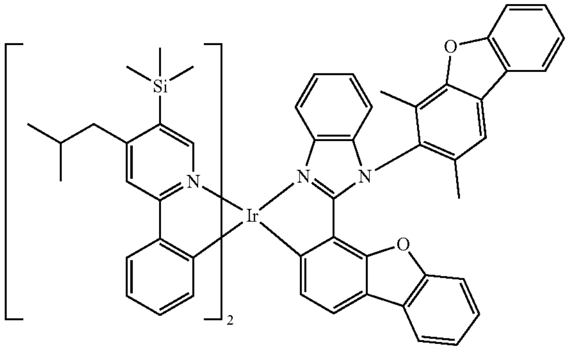
71
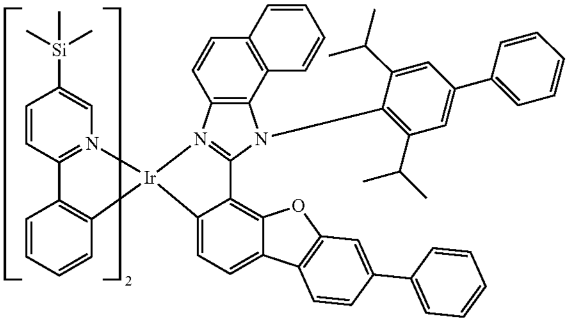
72
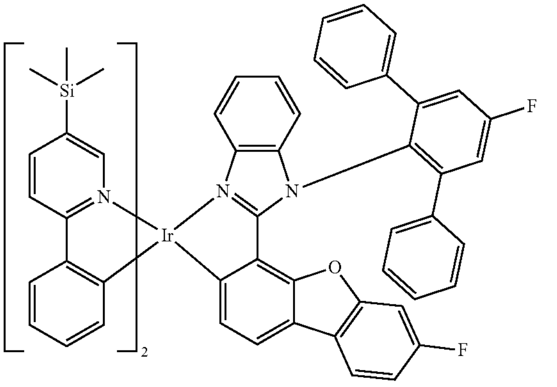
73
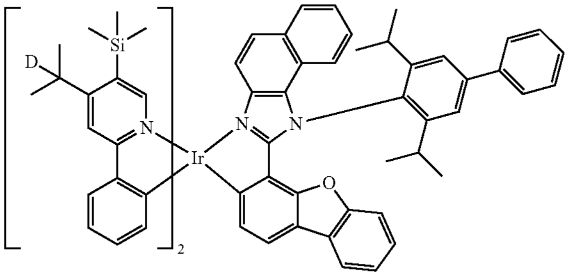
74
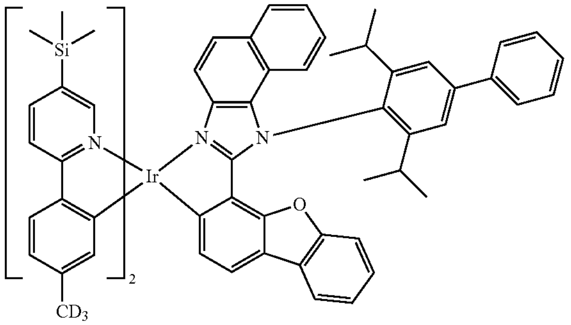

-continued
75
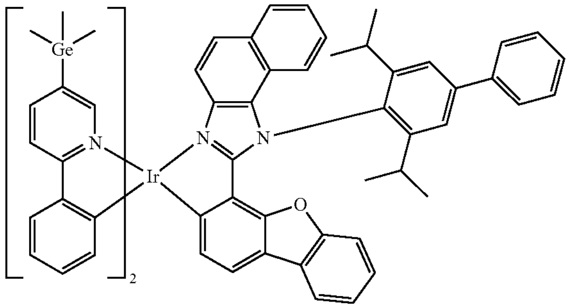
76
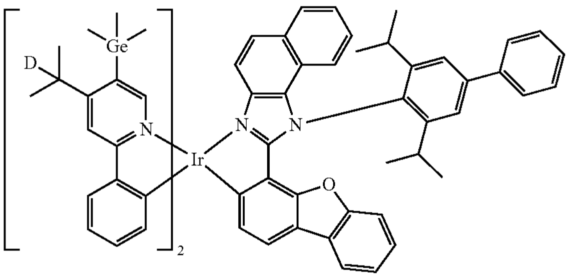
77
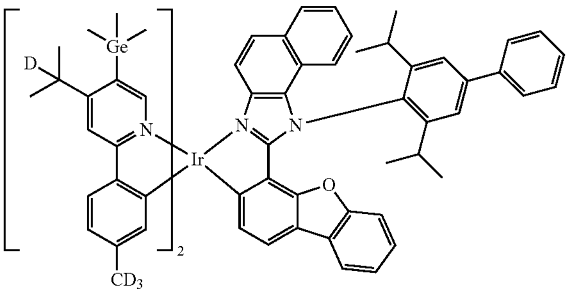
78
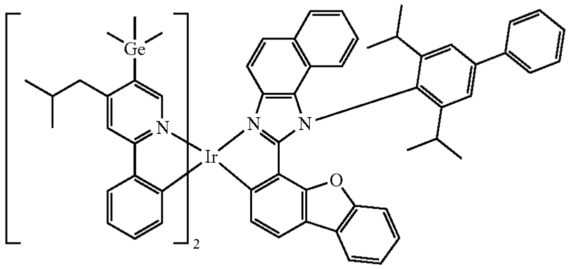
79
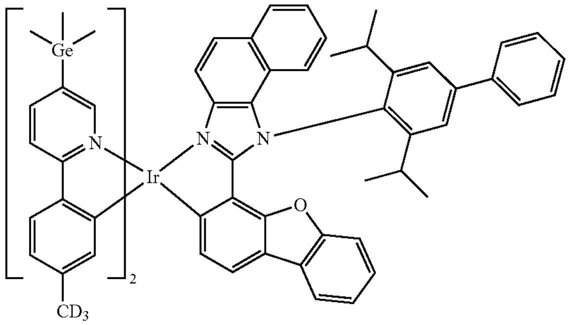
-continued
80
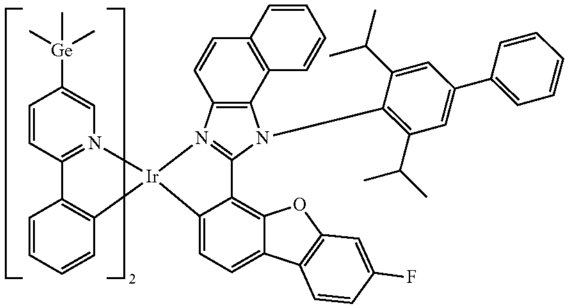
81
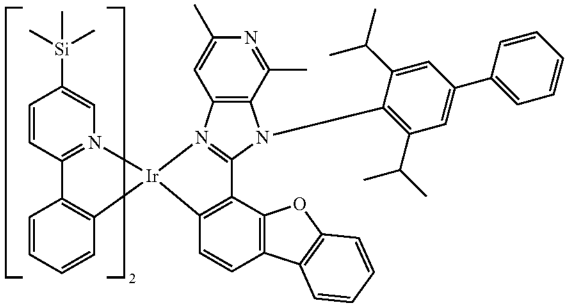
82
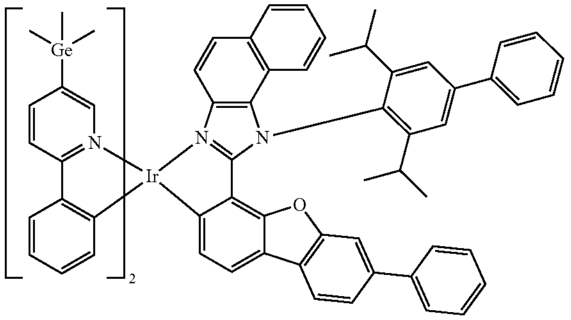
83
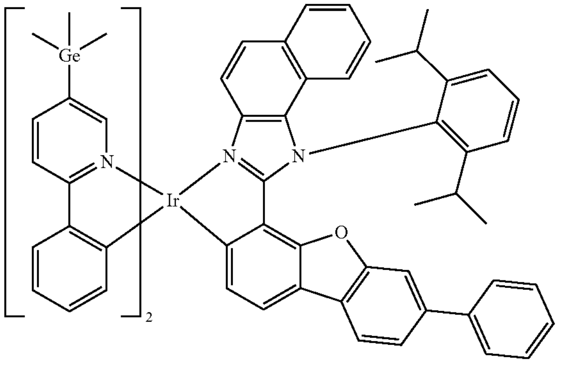

-continued
84
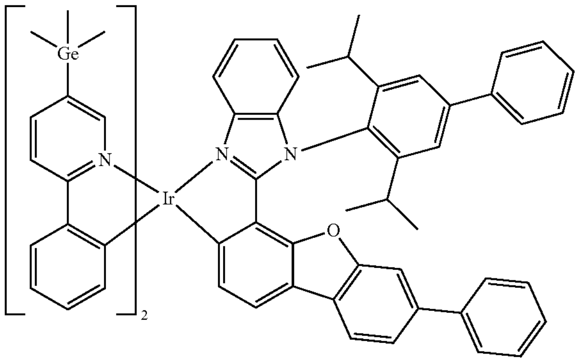
85
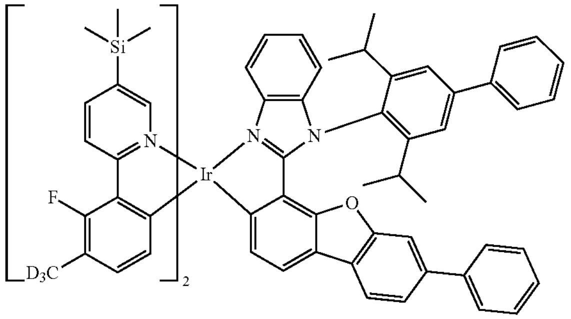
86
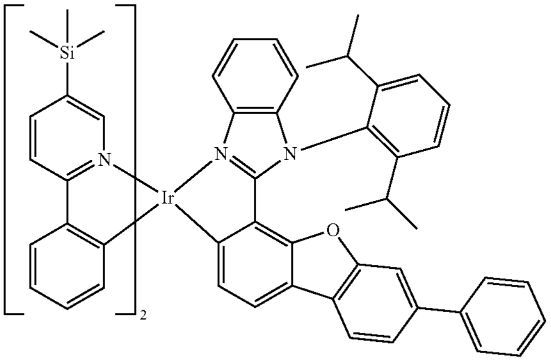
87
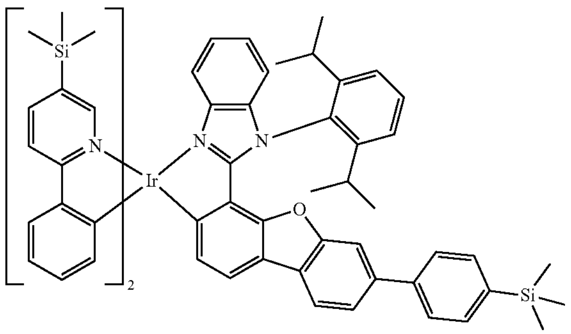
-continued
88
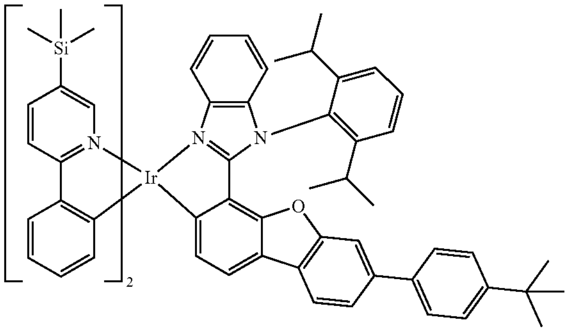
89
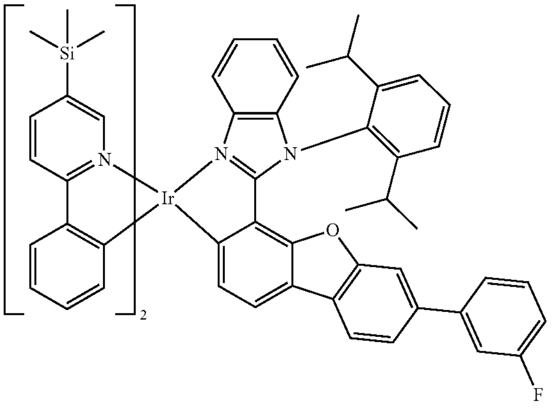
90
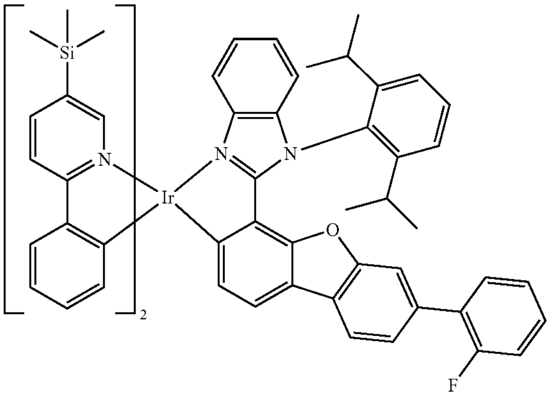
91
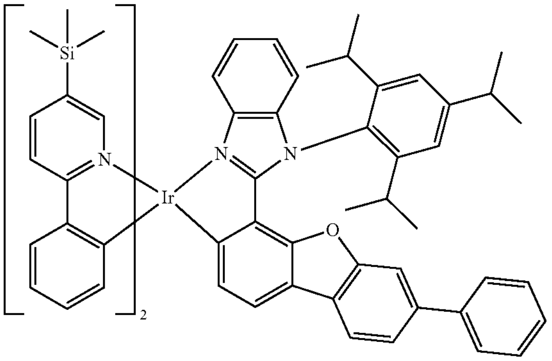

-continued
92
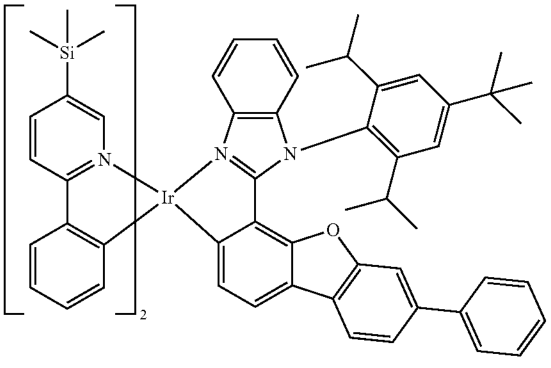
93
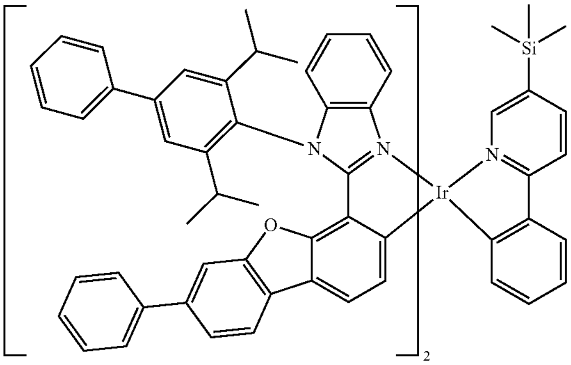
94
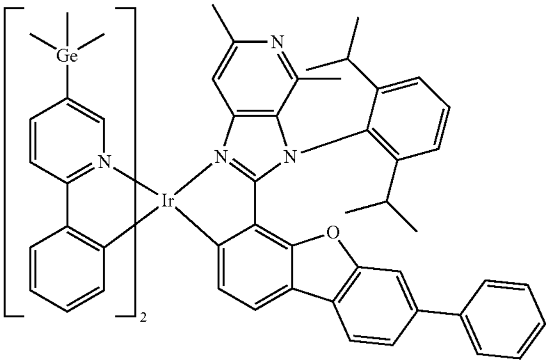
95
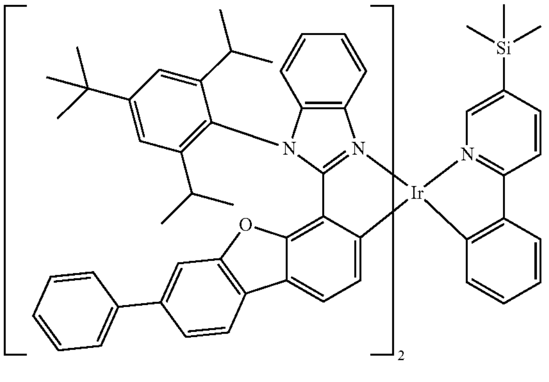
-continued
96
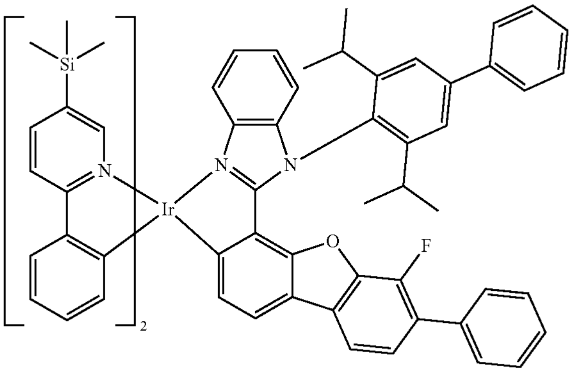
97
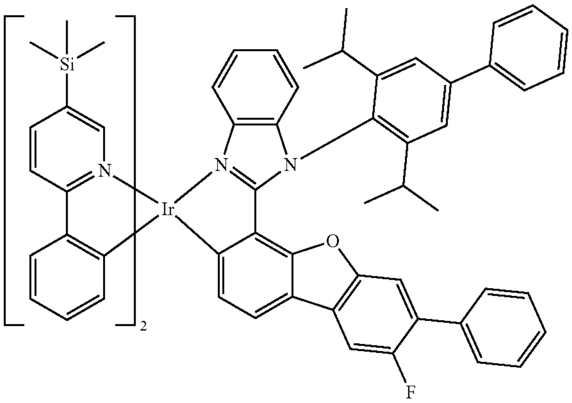
98
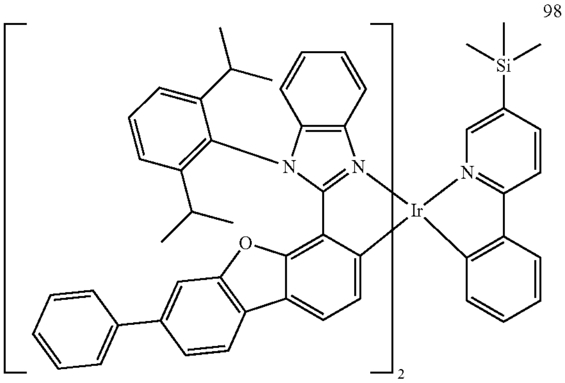
99
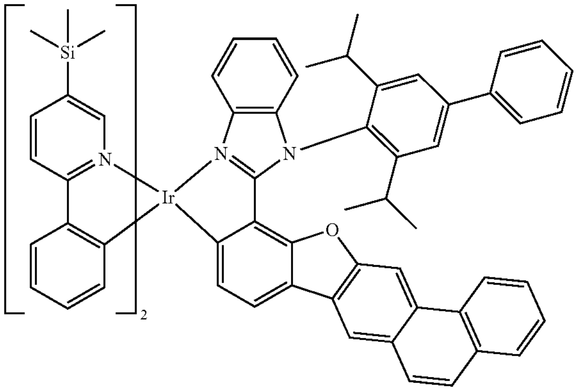

-continued
100
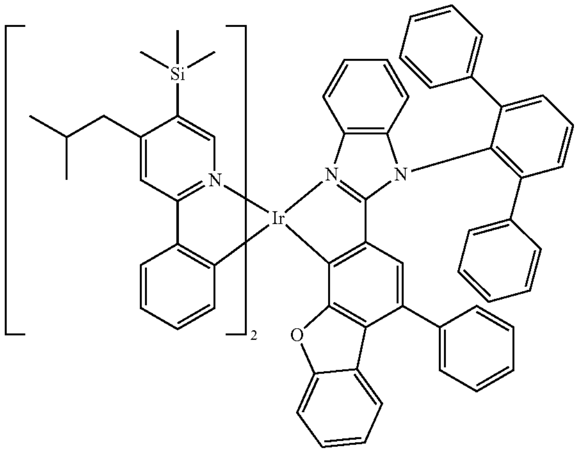
101
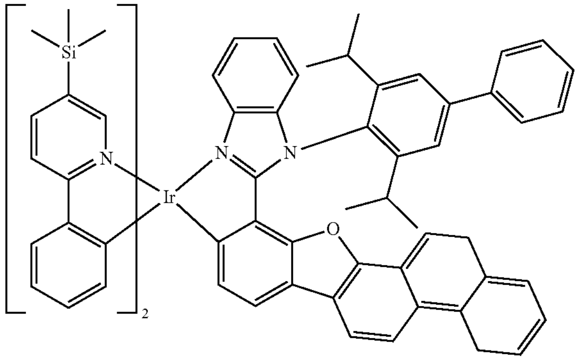
102
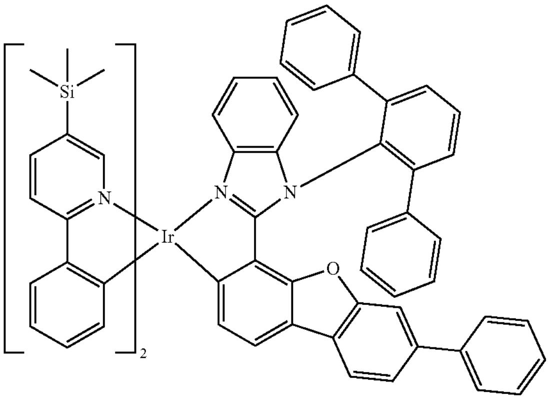
103
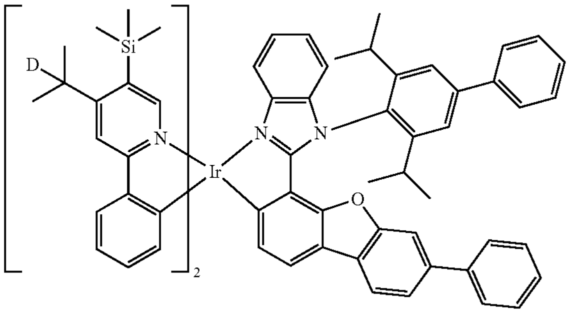
-continued
104
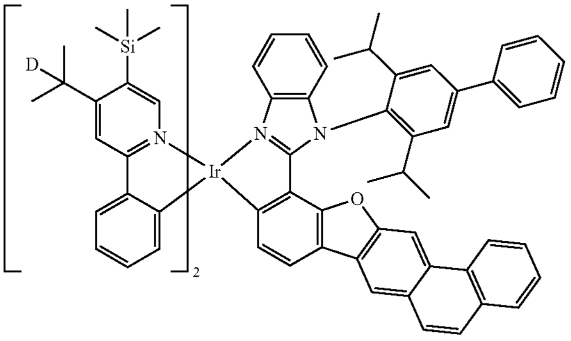
105
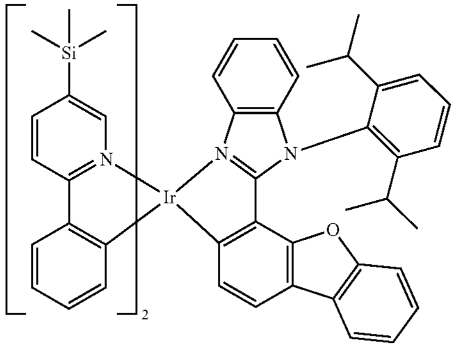
106
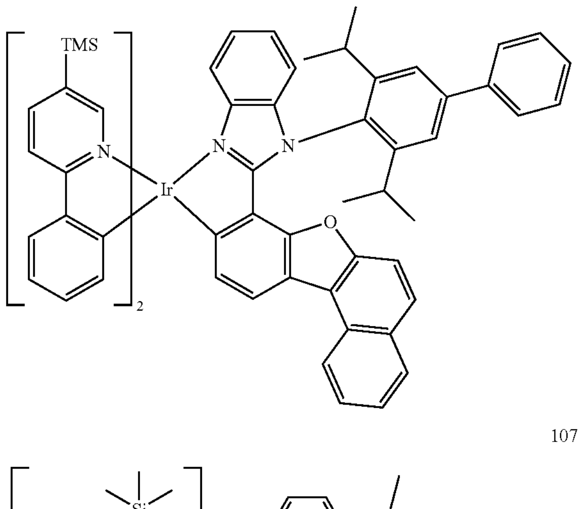
107
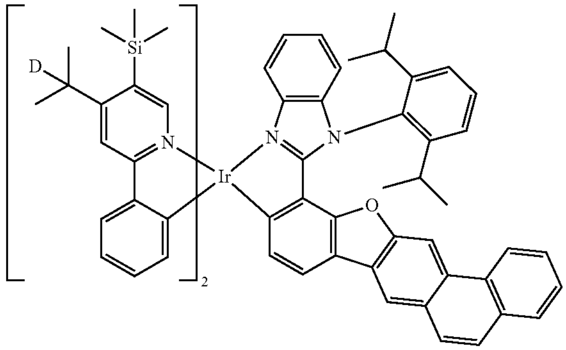

-continued
108
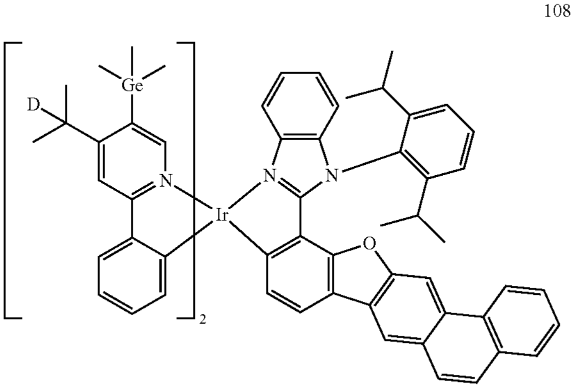
109
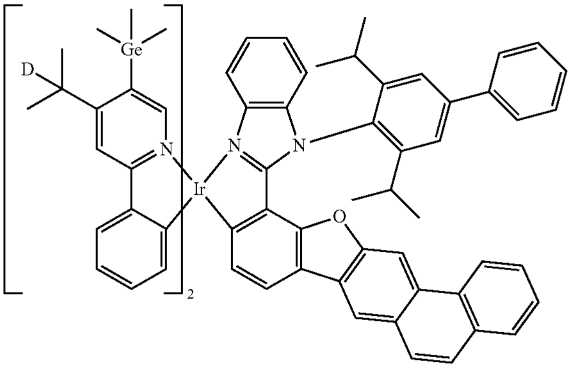
110
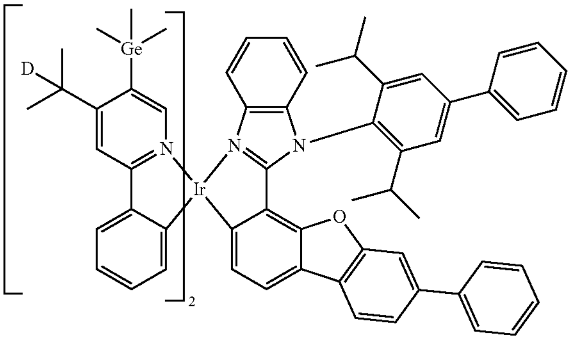
111
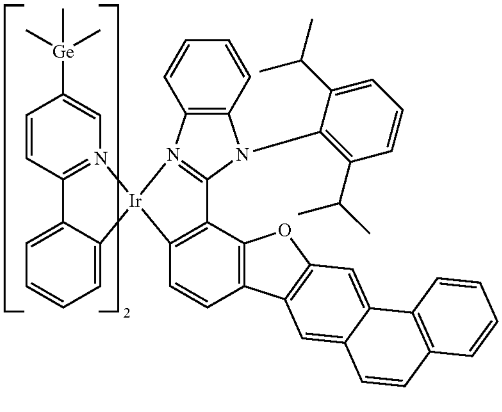
-continued
112
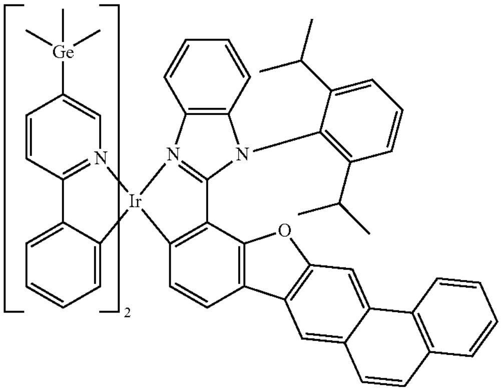
113
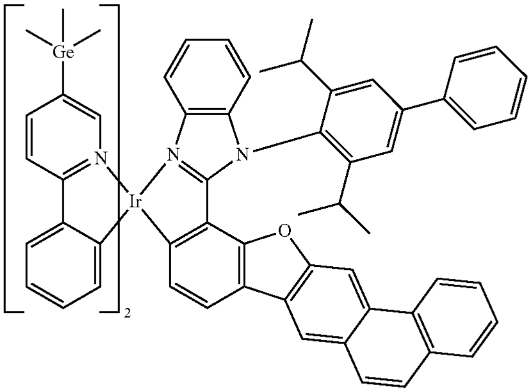
114
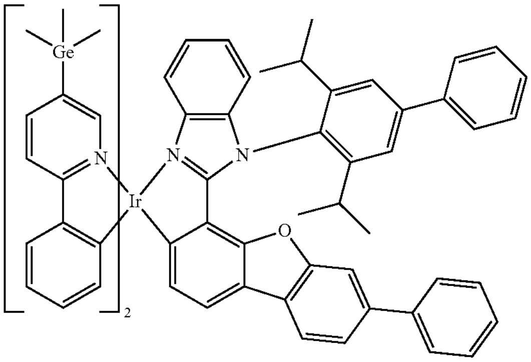
115
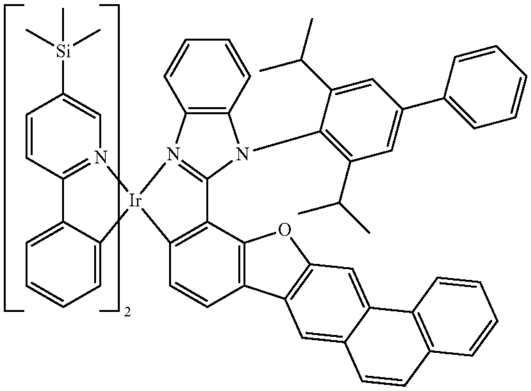

-continued
116
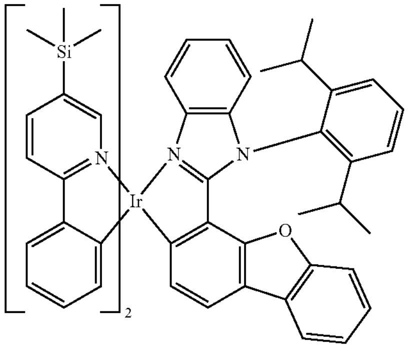
Group 2-5
1
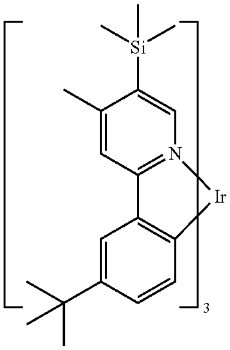
2
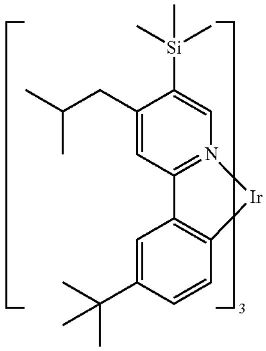
3
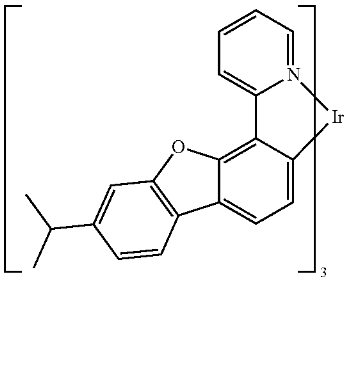
-continued
4
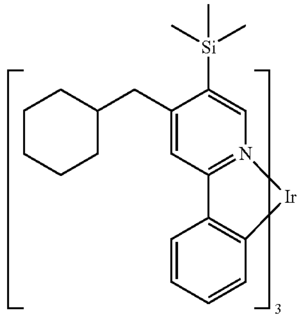
5
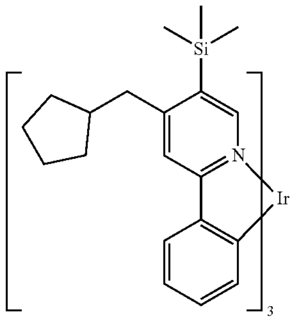
6
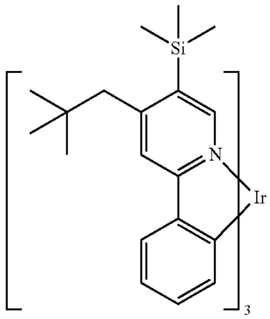
7
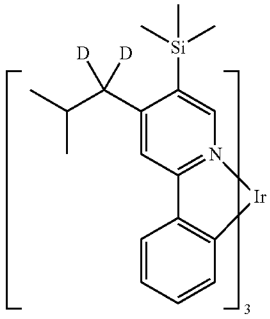
8
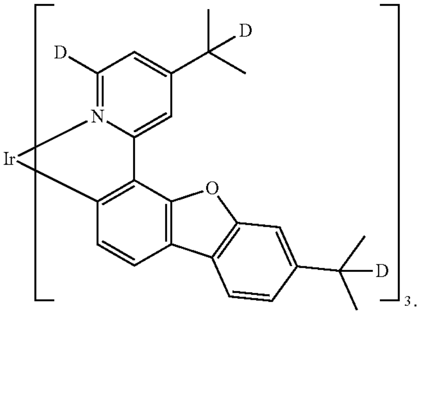

In the present specification, OMe refers to a methoxy group, TMS refers to a trimethylsilyl group, and TMG refers to a trimethylgermyl group.

In an embodiment, the first emission layer may include a first dopant and a first host, the second emission layer may include a second dopant and a second host, the first dopant may include the first compound, and the second dopant may include the second compound.

In an embodiment, the first host and the second host may be identical to each other.

In an embodiment, the first host and the second host may be different from each other.

The first host and the second host may each include a hole transport compound, an electron transport compound, a bipolar compound, or any combination thereof.

In an embodiment, the first host and the second host may each include a hole transport compound and an electron transport compound, and the hole transport compound and the electron transport compound may be different from each other.

In an embodiment, the hole transport compound may include at least one π electron-rich $C_3$-$C_{60}$ cyclic group (e.g., a carbazole group, an indolocarbazole group, a benzene group, etc.), and may not include an electron transport group. Examples of the electron transport group may include a cyano group, a fluoro group, a π electron-deficient nitrogen-containing $C_1$-$C_{60}$ cyclic group, a phosphine oxide group, and a sulfoxide group.

In an embodiment, the electron transport compound may be a compound including at least one electron transport group. The electron transport group may be a cyano group, a fluoro group, a π electron-deficient nitrogen-containing $C_1$-$C_{60}$ cyclic group, a phosphine oxide group, a sulfoxide group, or a combination thereof.

In an embodiment, the hole transport compound may be at least one of Compounds H1-1 to H1-72 of Group 5-1 and Compounds H1-1 to H1-20 of Group 5-2:

Group 5-1

H1-1

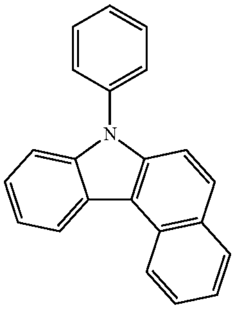

H1-2

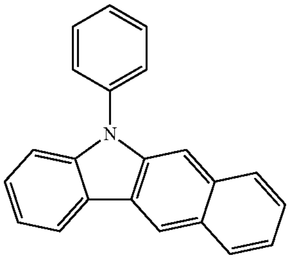

-continued

H1-3

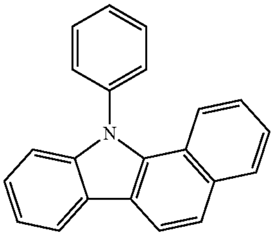

H1-4

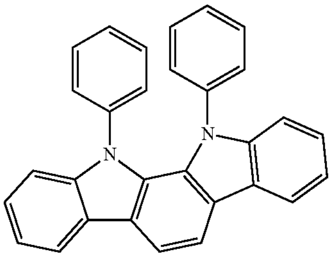

H1-5

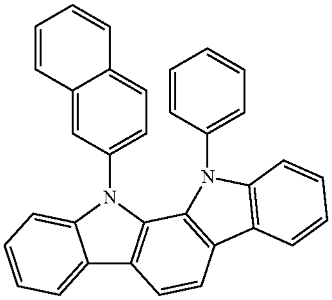

H1-6

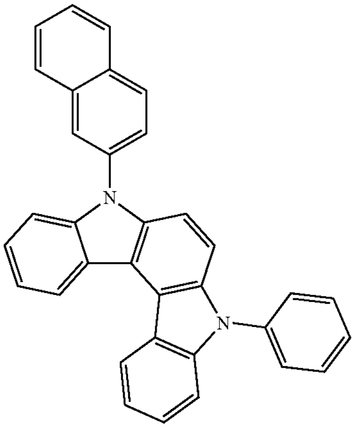

-continued
H1-7
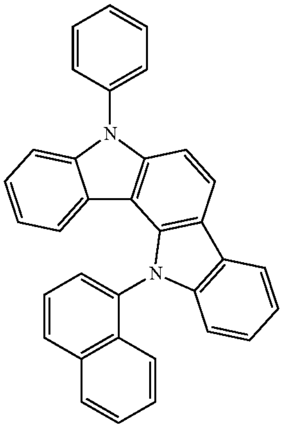
H1-8
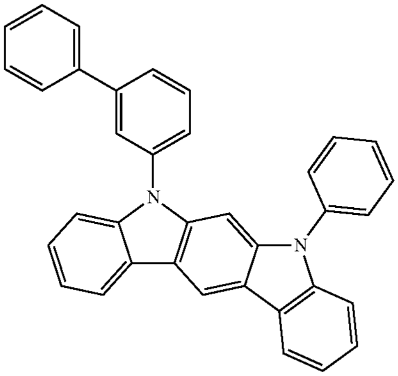
H1-9
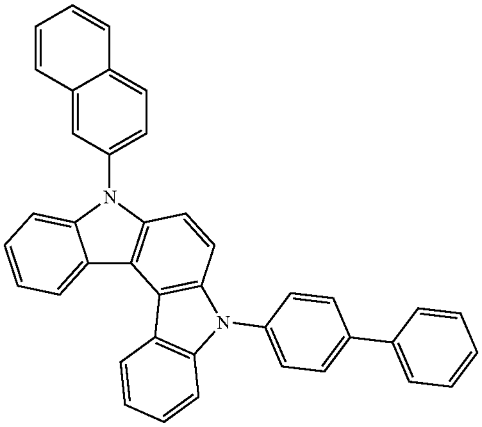
H1-10
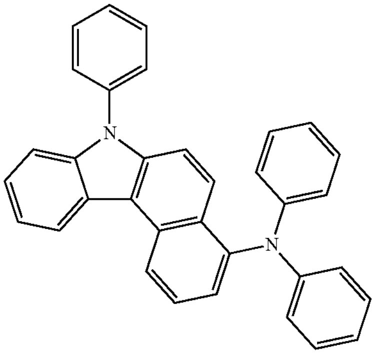
-continued
H1-11
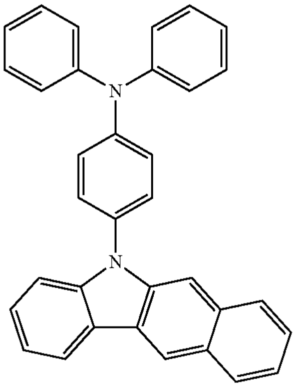
H1-12
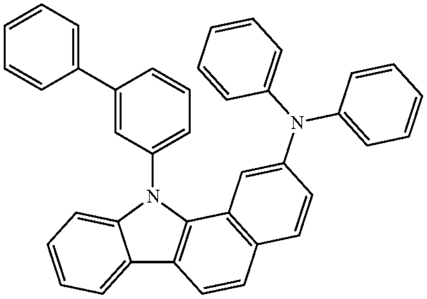
H1-13
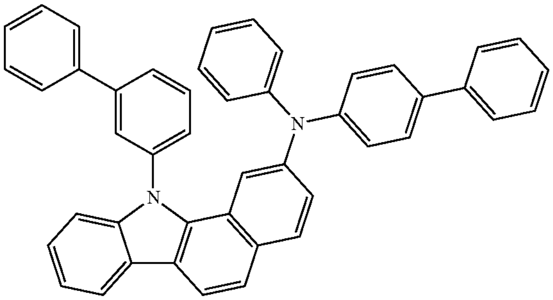
H1-14
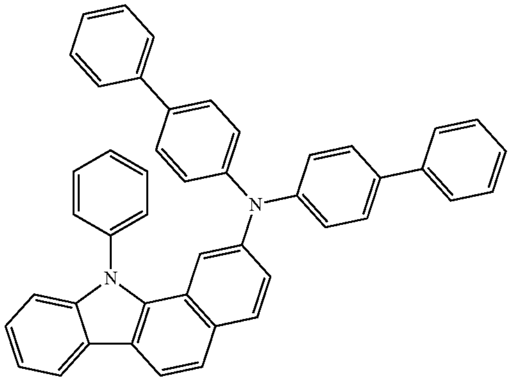

-continued
H1-15
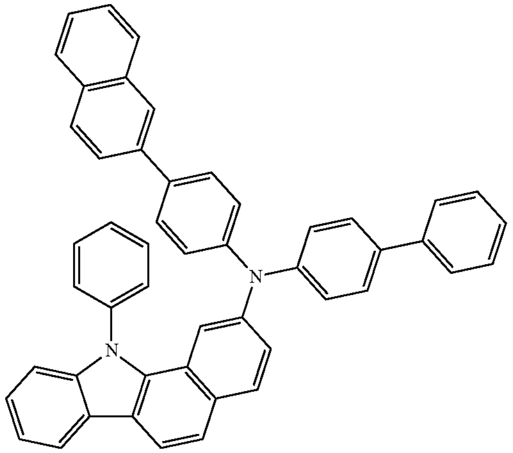
H1-16
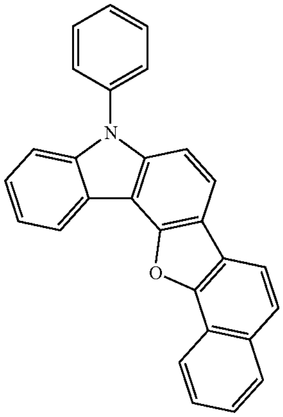
H1-17
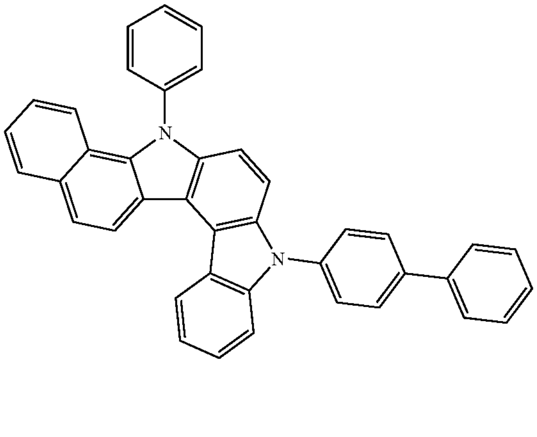
-continued
H1-18
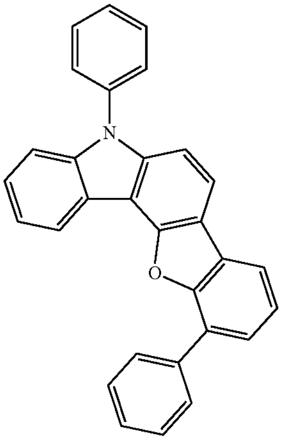
H1-19
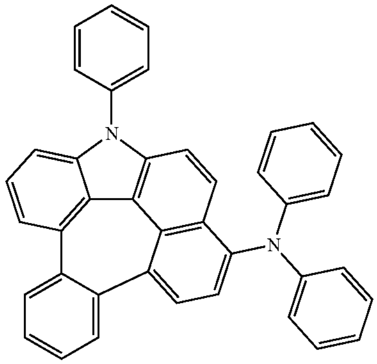
H1-20
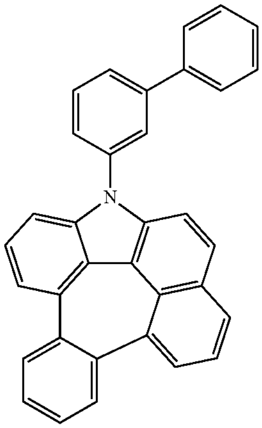
H1-21
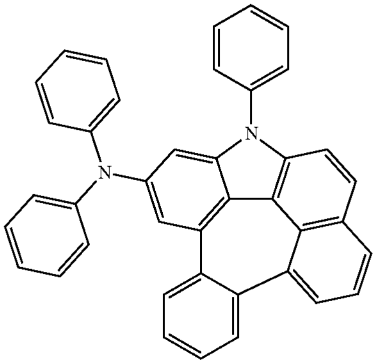

-continued
H1-22
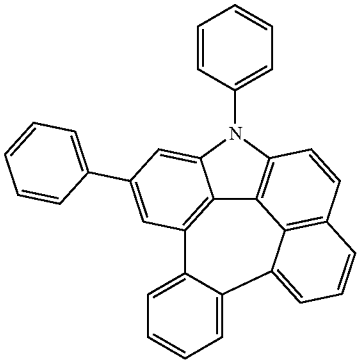
H1-23
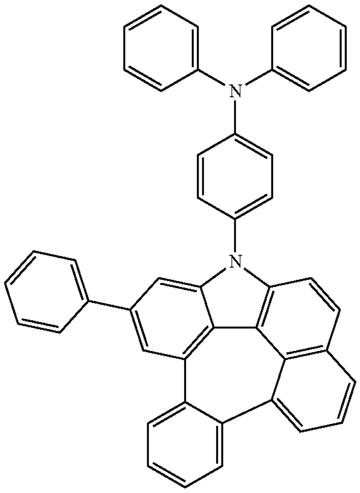
H1-24
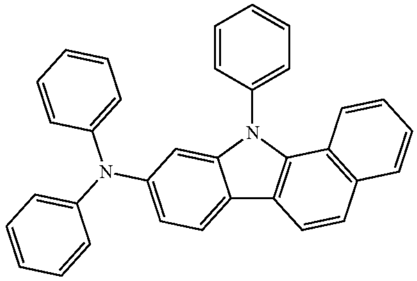
H1-25
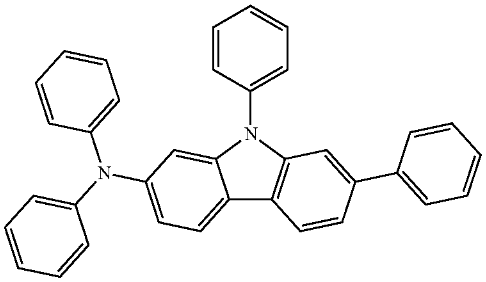
-continued
H1-26
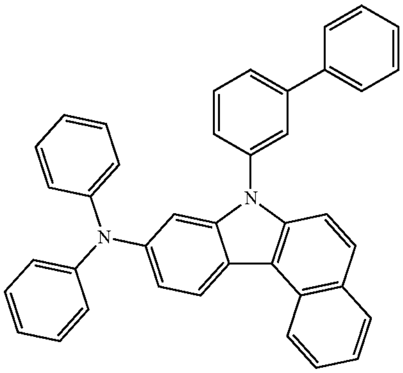
H1-27
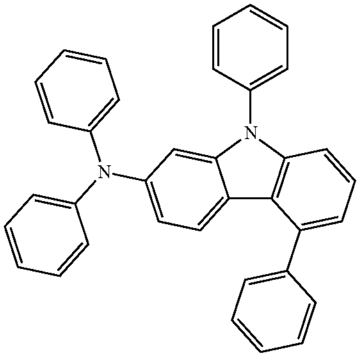
H1-28
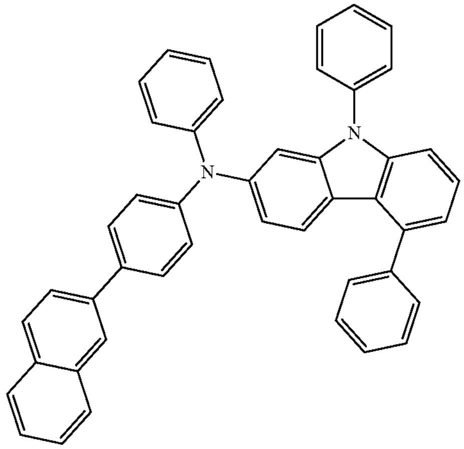
H1-29
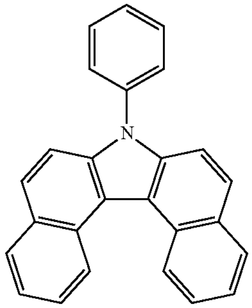

-continued
H1-30
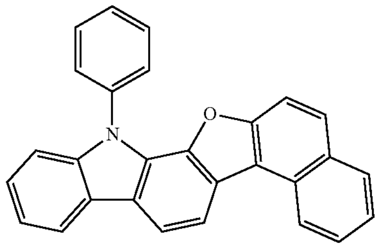
H1-31
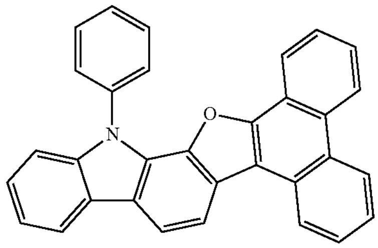
H1-32
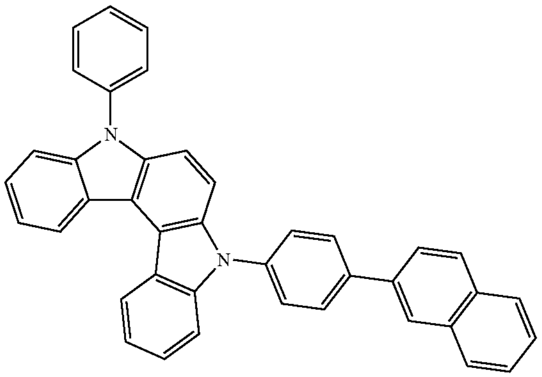
H1-33
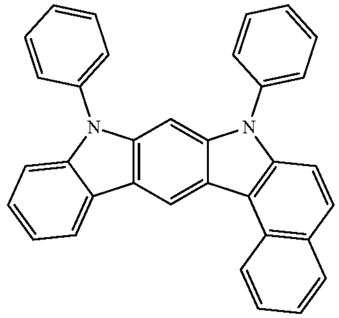
-continued
H1-34
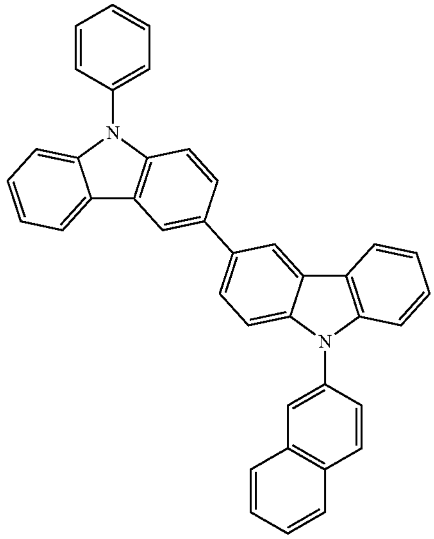
H1-35
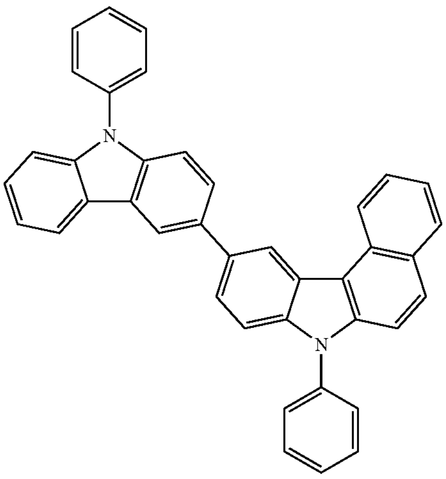
H1-36
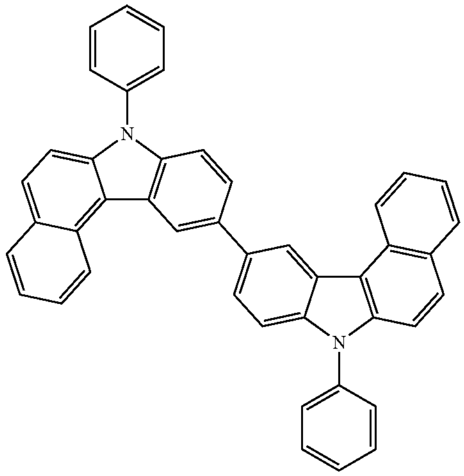

-continued
H1-37
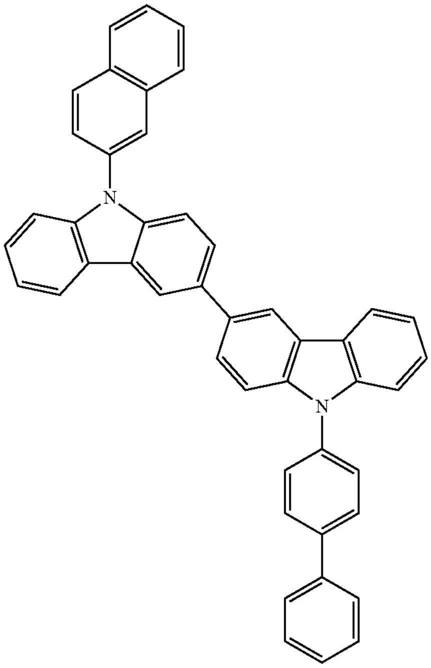
H1-38
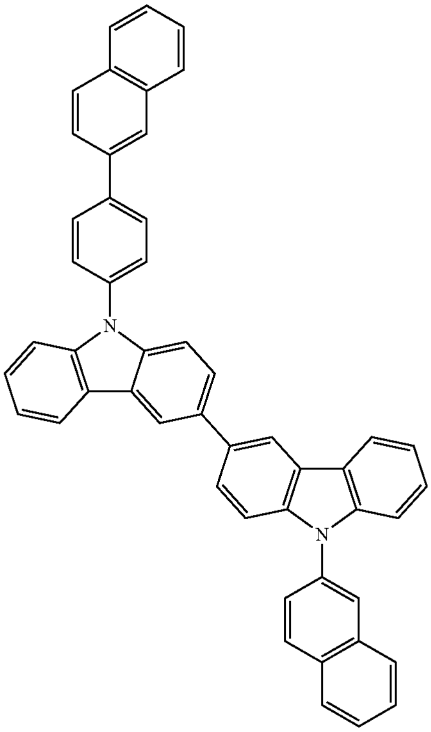
-continued
H1-39
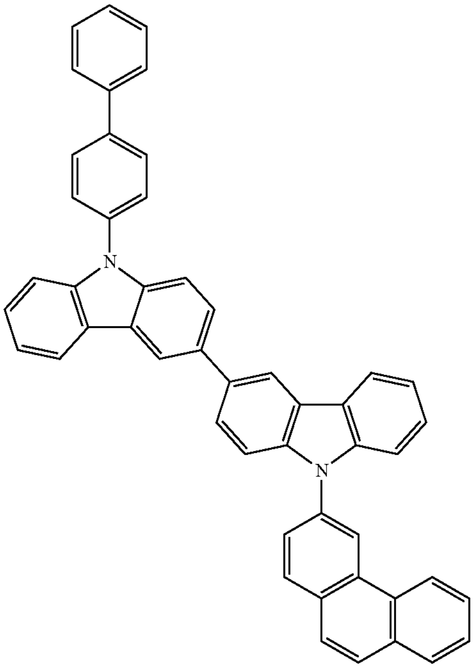
H1-40
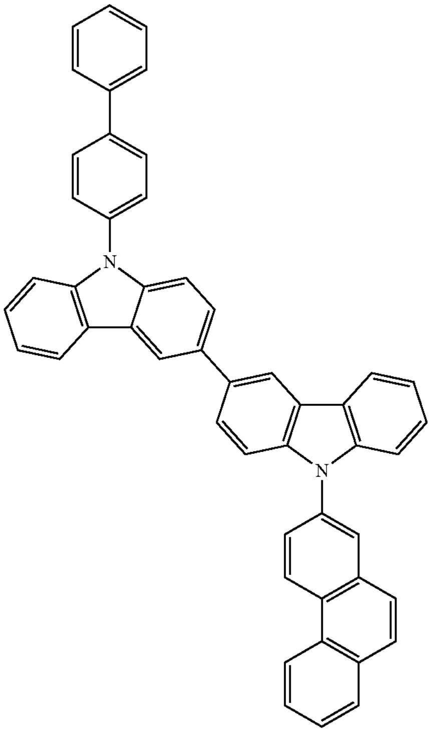

-continued
H1-41
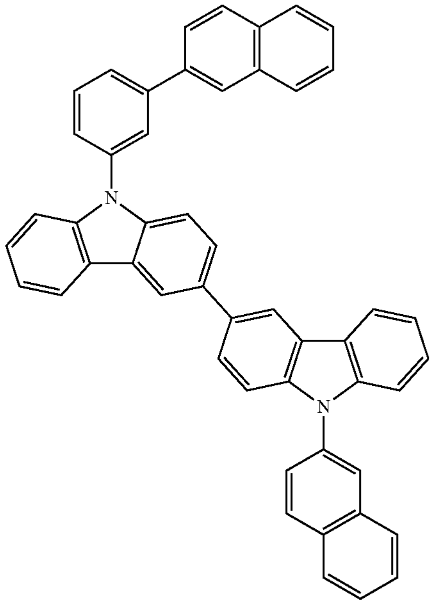
H1-42
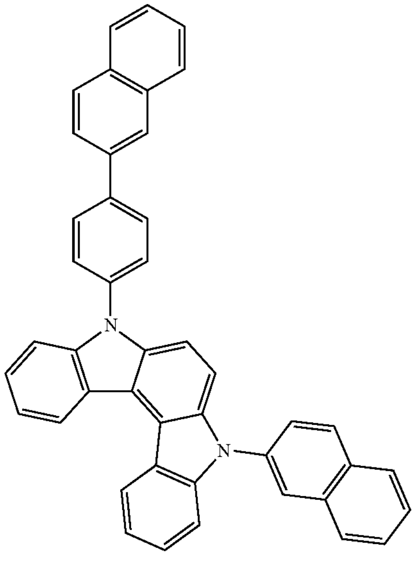
-continued
H1-43
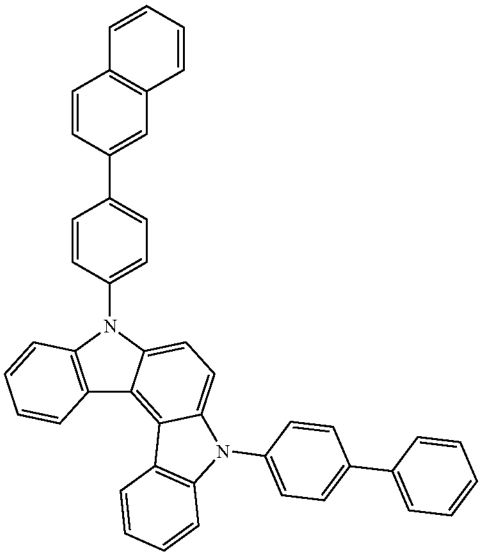
H1-44
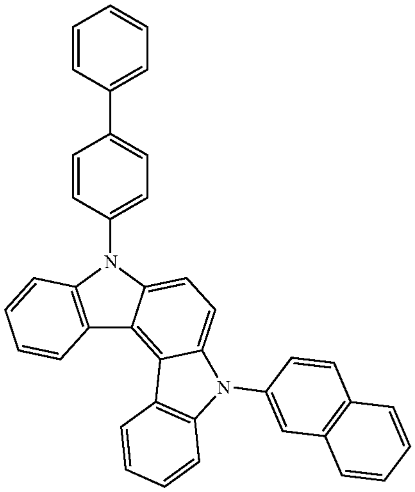
H1-45
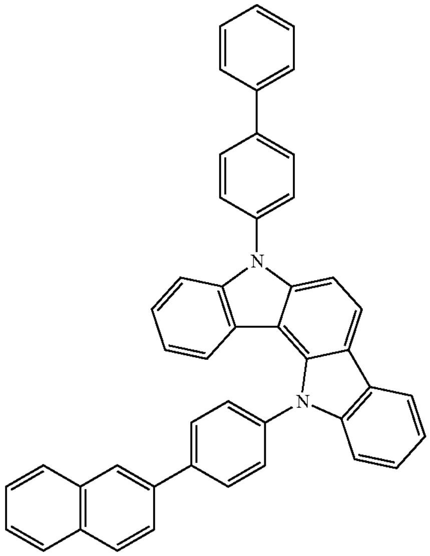

-continued
H1-46
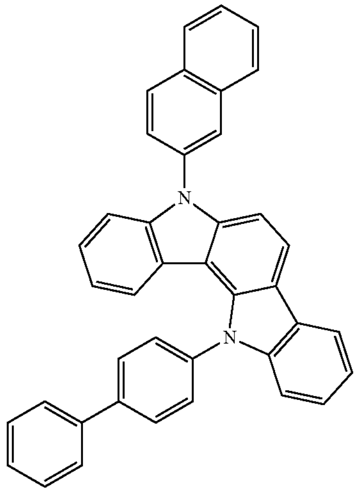
H1-47
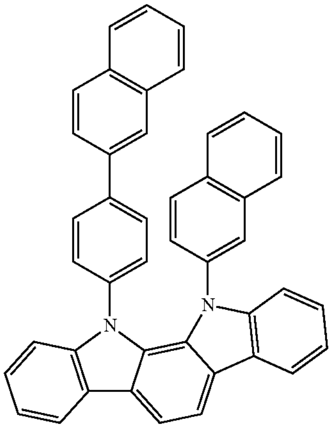
H1-48
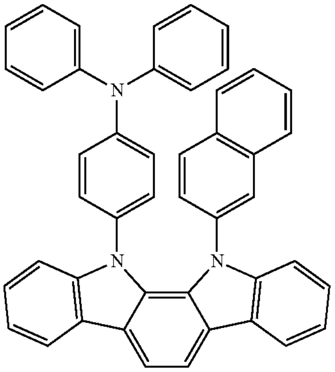
-continued
H1-49
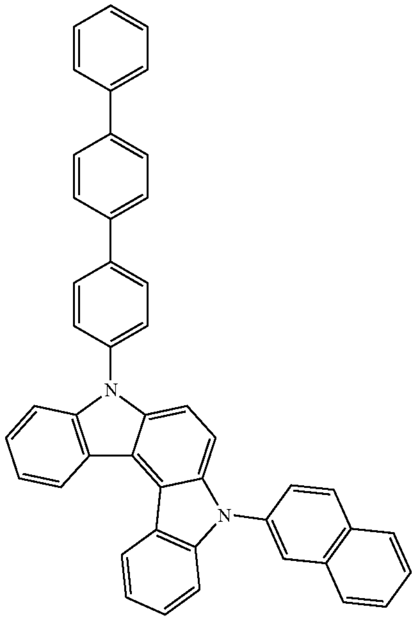
H1-50
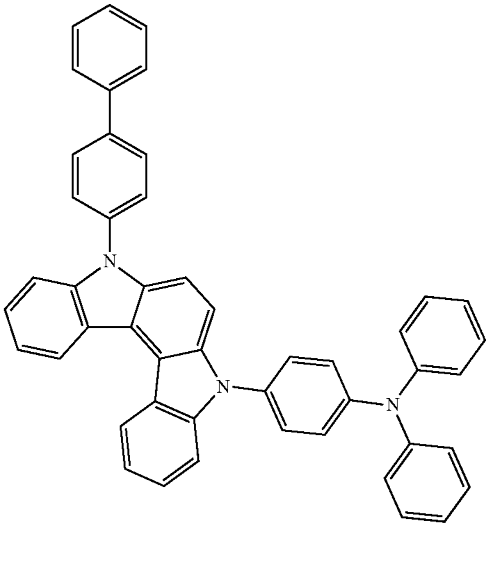

-continued
H1-51
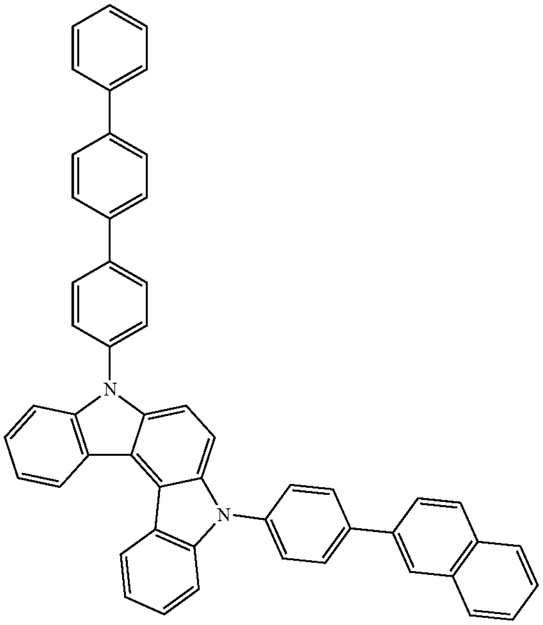
H1-52
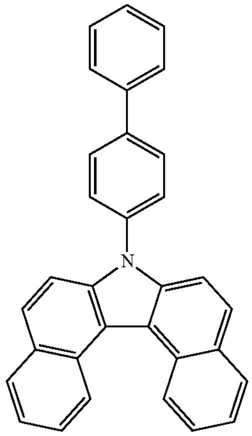
H1-53
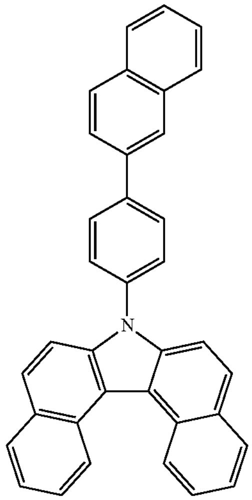
-continued
H1-54
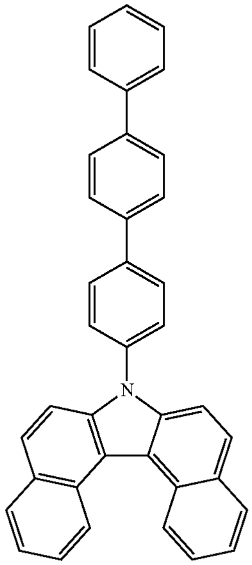
H1-55
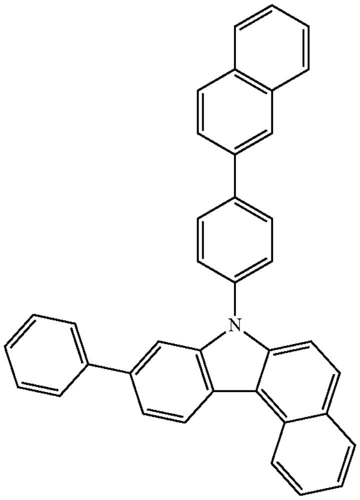
H1-56
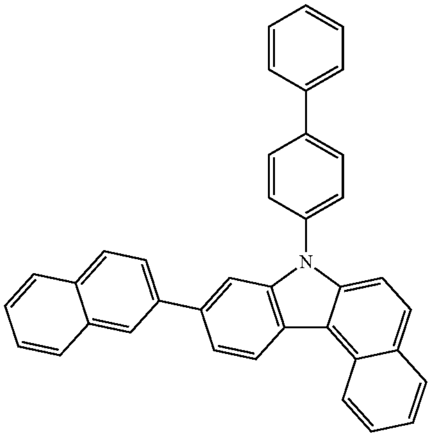

-continued
H1-57
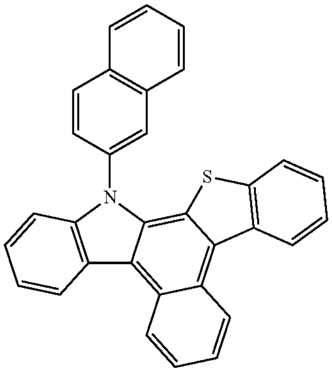
H1-58
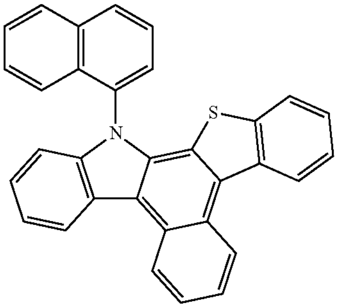
H1-59
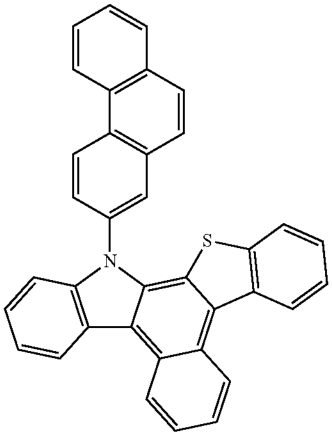
H1-60
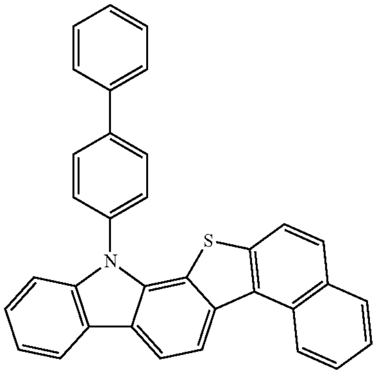
-continued
H1-61
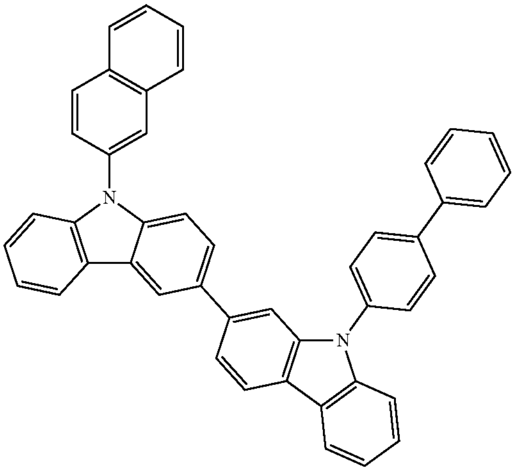
H1-62
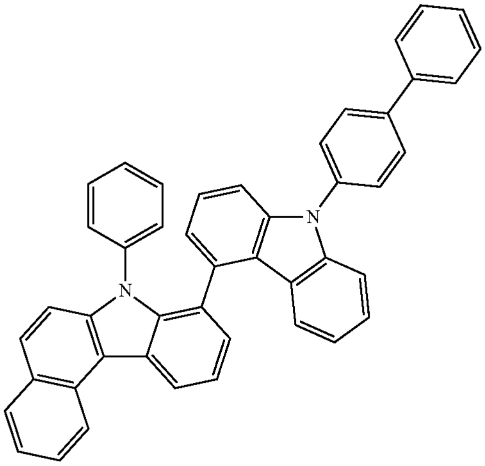
H1-63
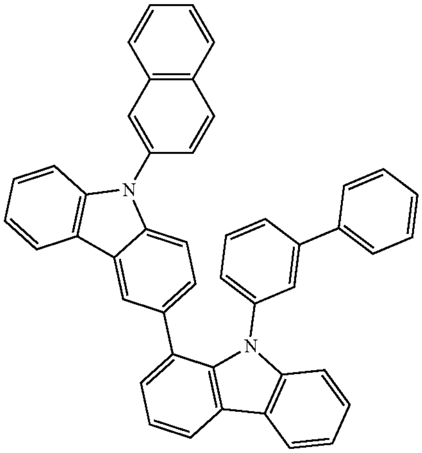

-continued
H1-64
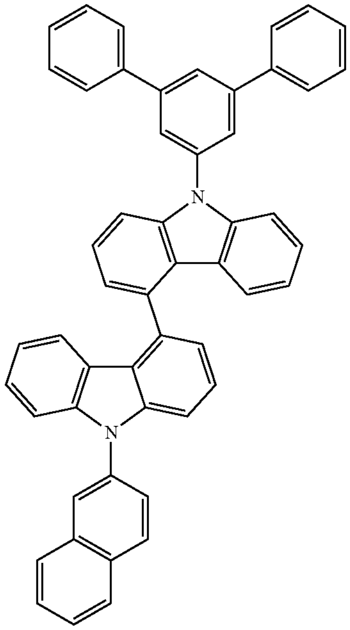
H1-65
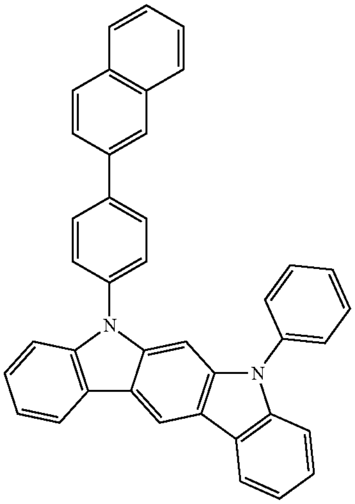
H1-66
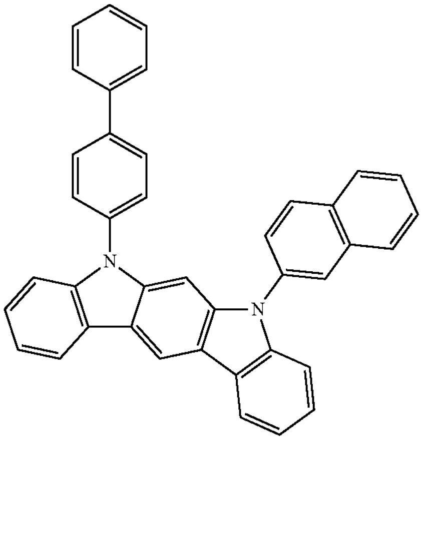
-continued
H1-67
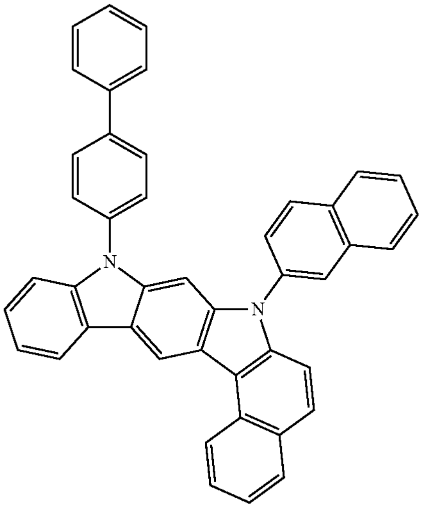
H1-68
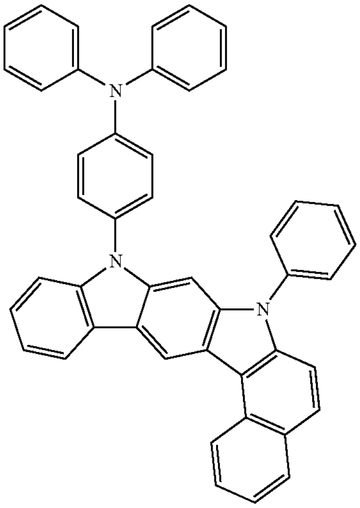
H1-69
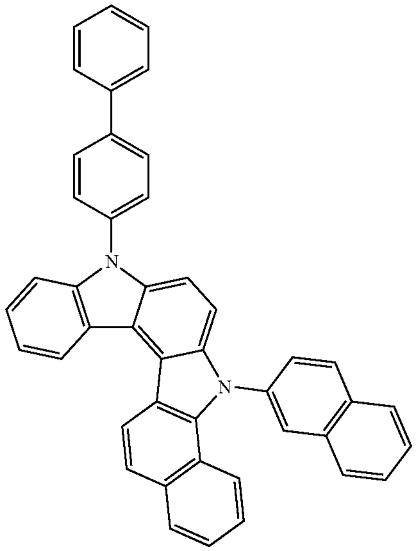

-continued
H1-70
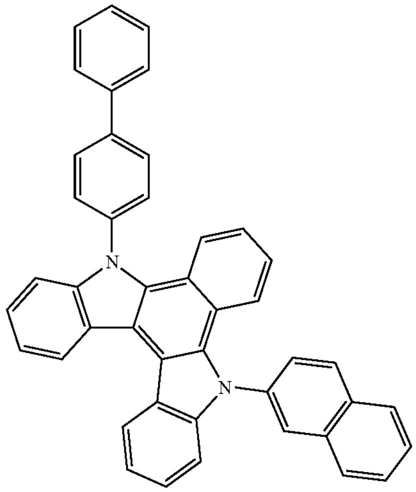
H1-71
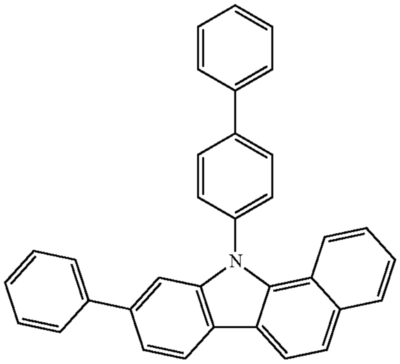
H1-72
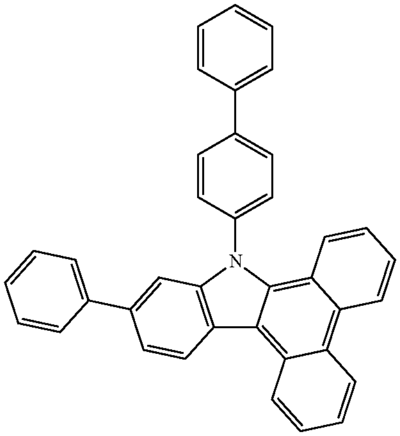
H1-1
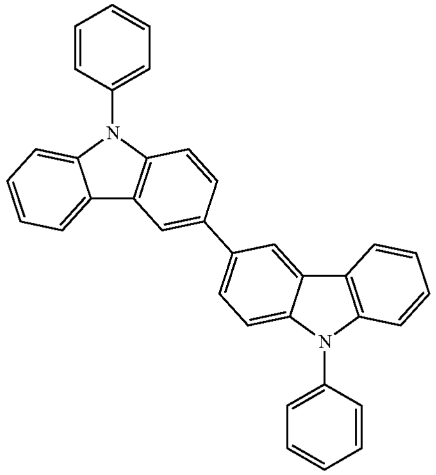
H1-2
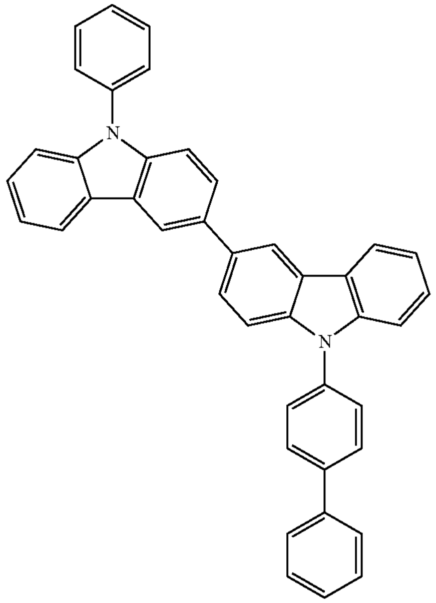
H1-3
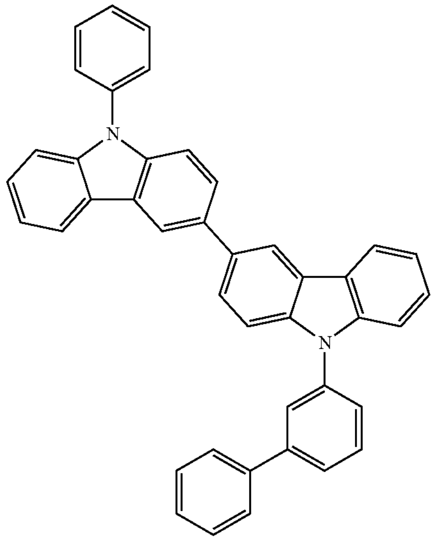

-continued
H1-4
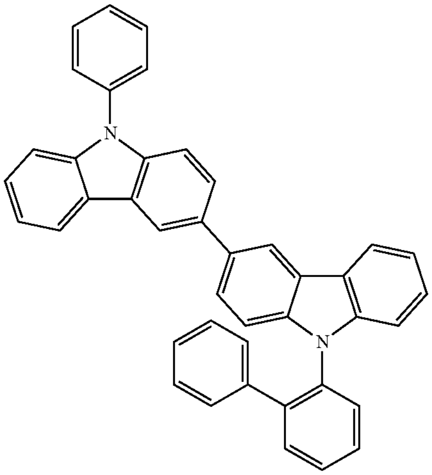
H1-5
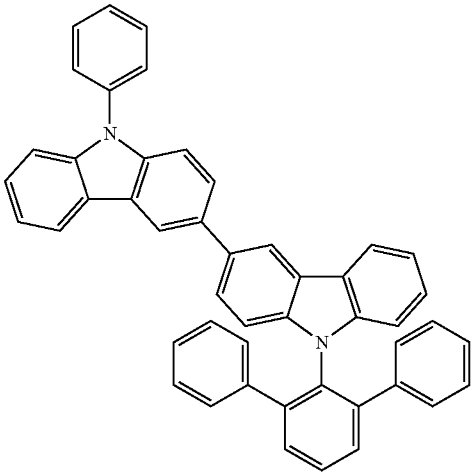
H1-6
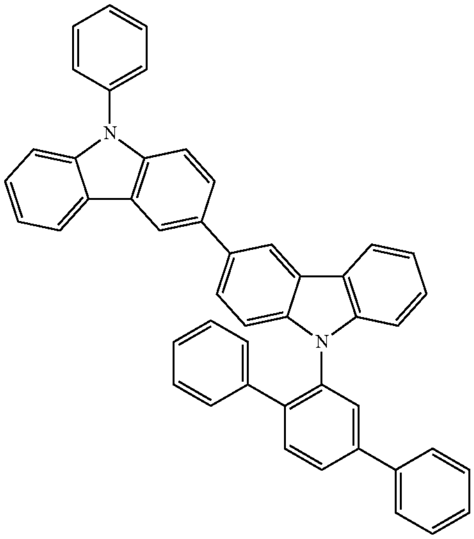
-continued
H1-7
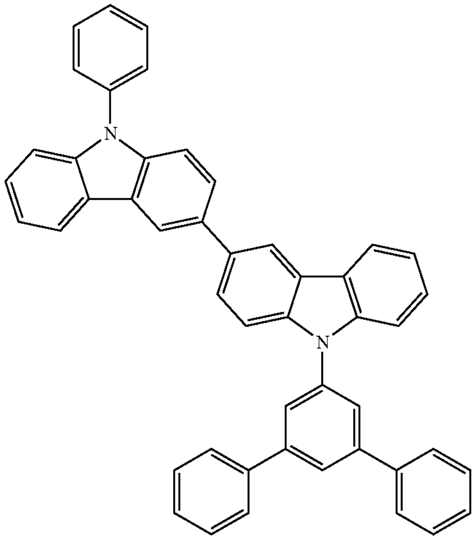
H1-8
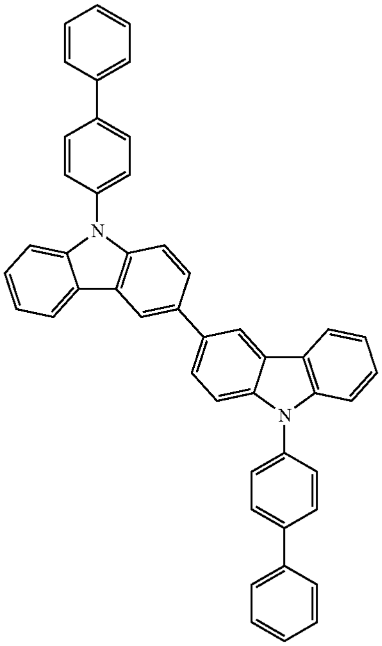

-continued
H1-9
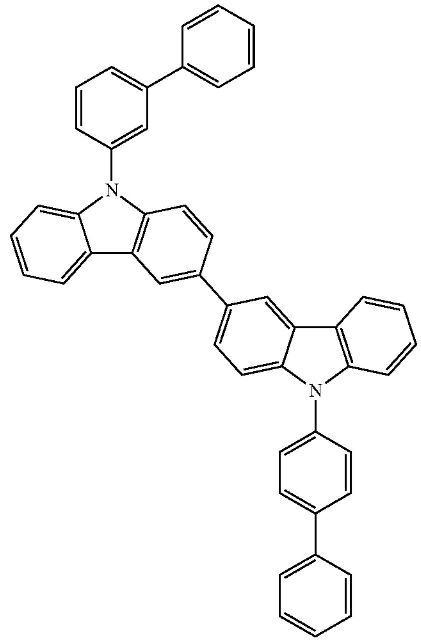
H1-10
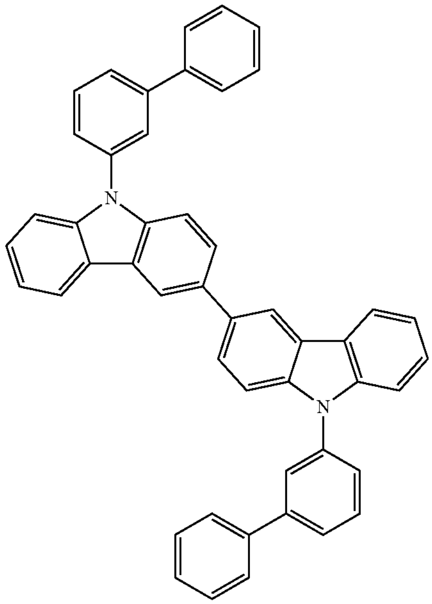
-continued
H1-11
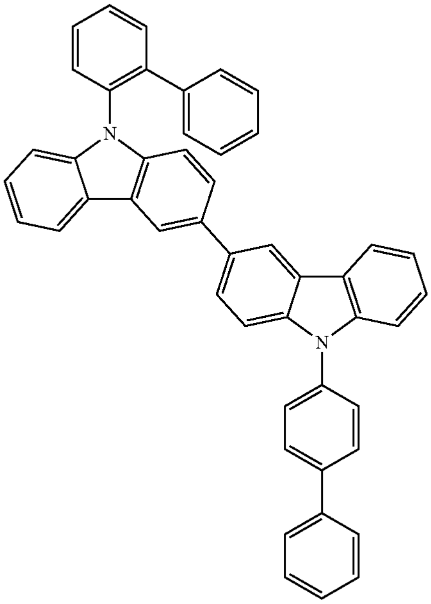
H1-12
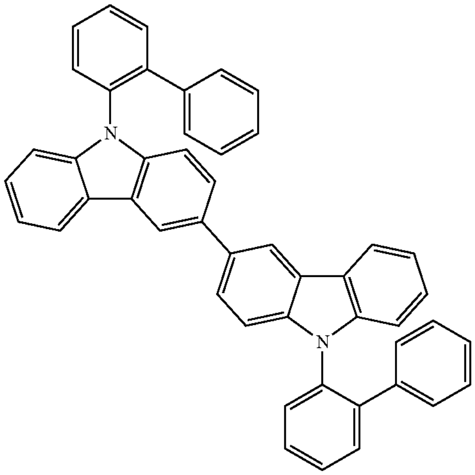
H1-13
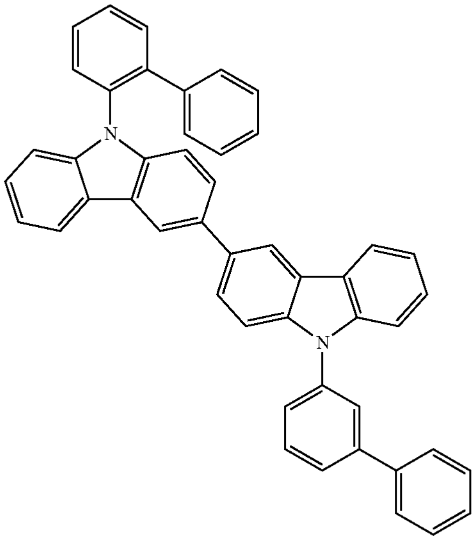

-continued
H1-14
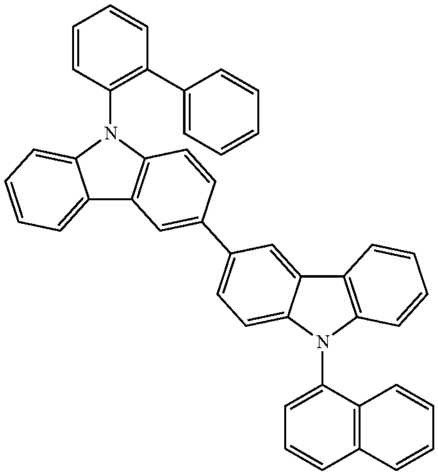
H1-15
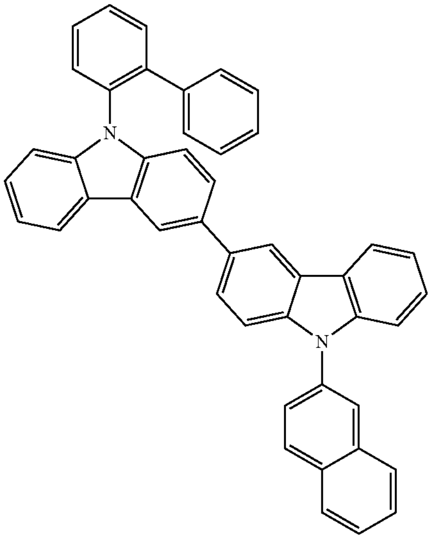
H1-16
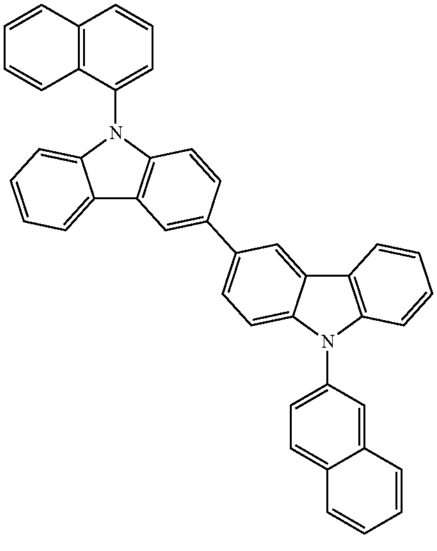
-continued
H1-17
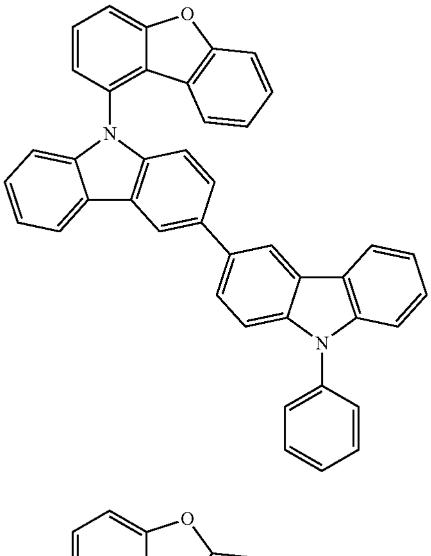
H1-18
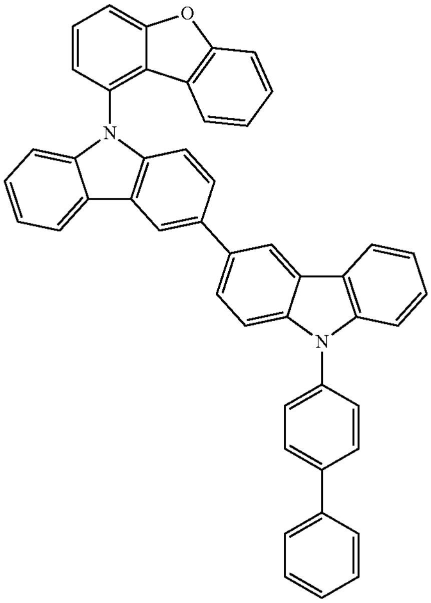
H1-19
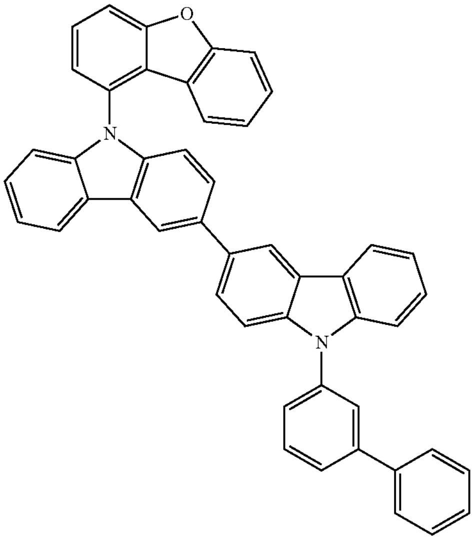

-continued
H1-20
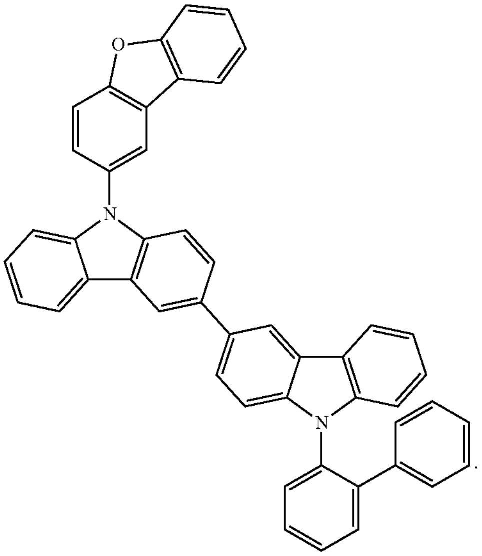
In an embodiment, the electron transport compound may be at least one of Compounds E1-1 to E1-62:
E1-1
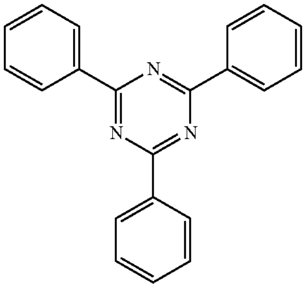
E1-2
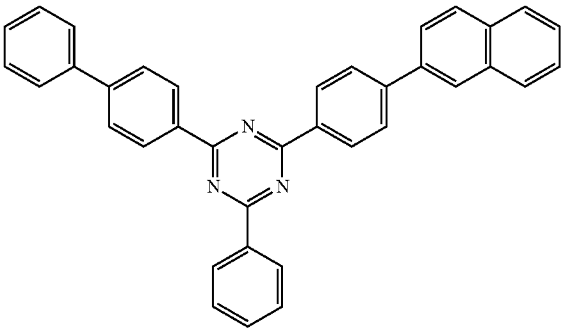
-continued
E1-3
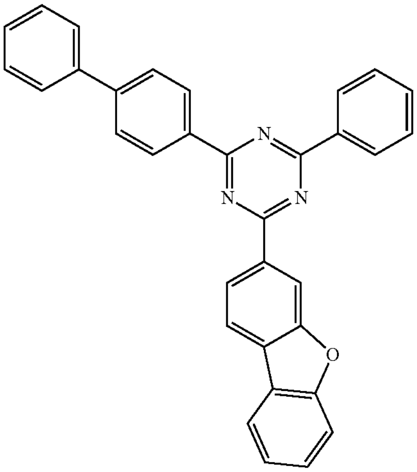
E1-4
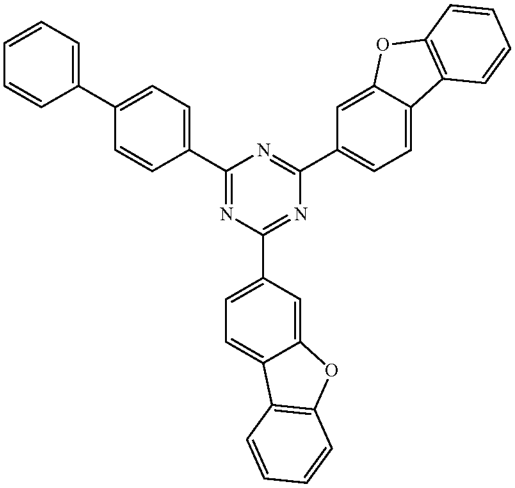
E1-5
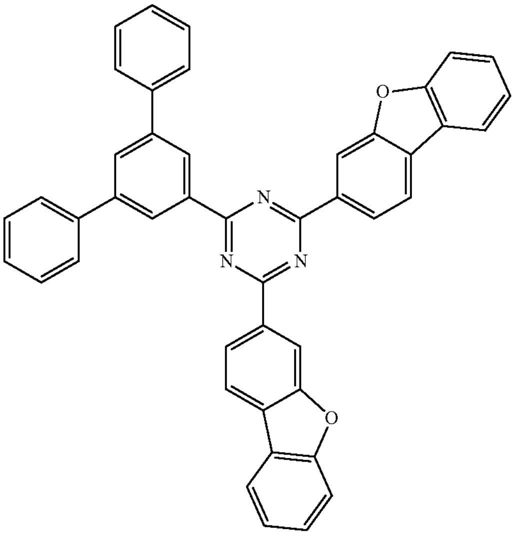

-continued
E1-6
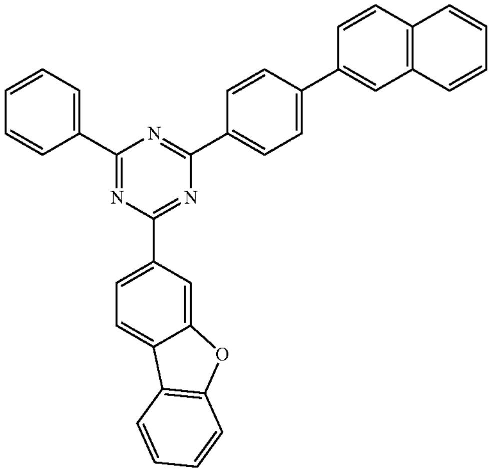
E1-7
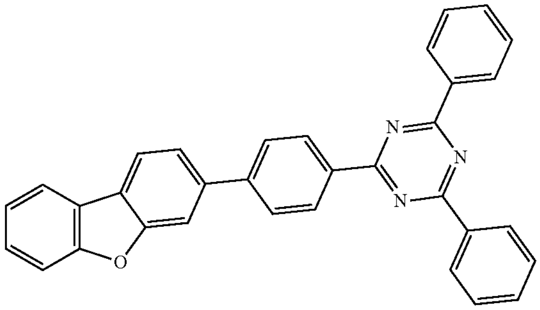
E1-8
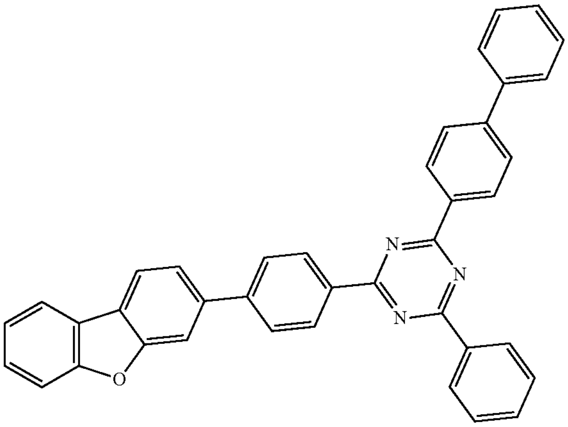
E1-9
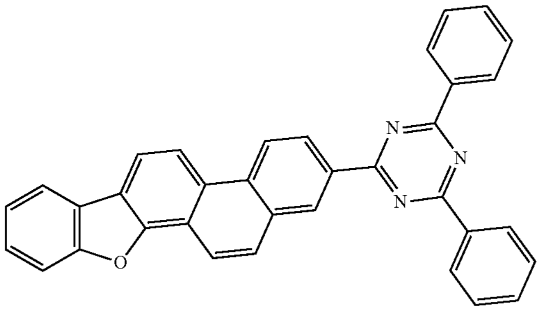
-continued
E1-10
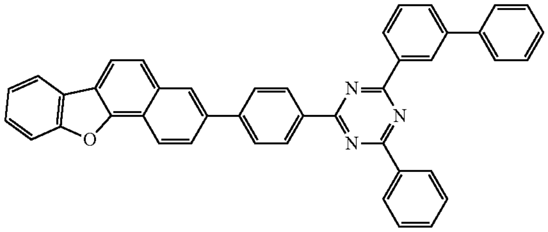
E1-11
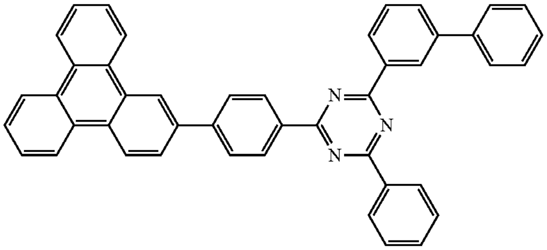
E1-12
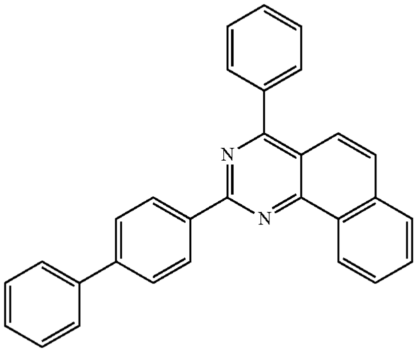
E1-13
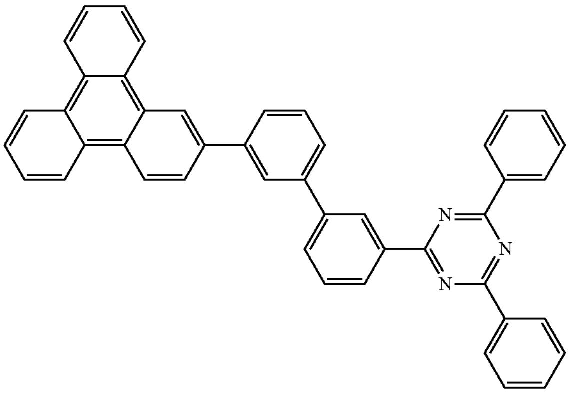

-continued
E1-14
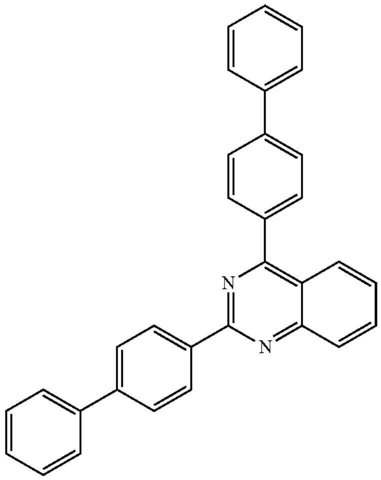
E1-15
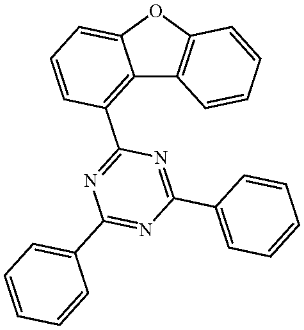
E1-16
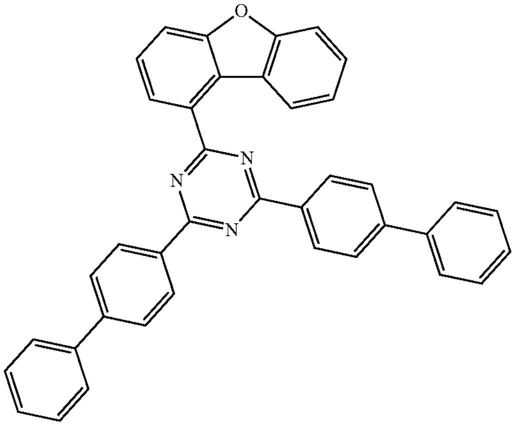
E1-17
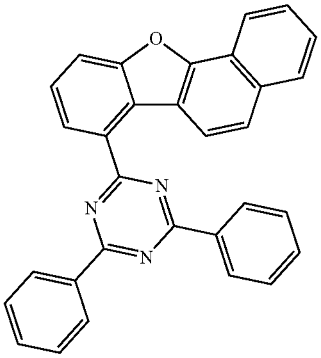
-continued
E1-18
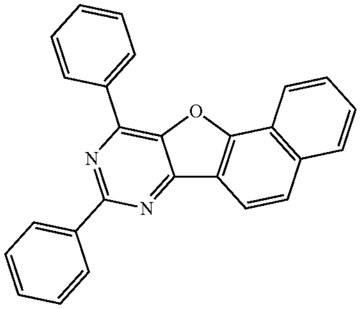
E1-19
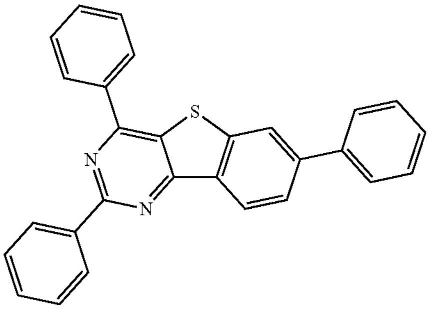
E1-20
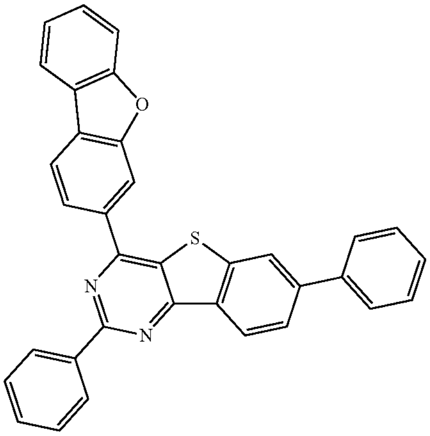
E1-21
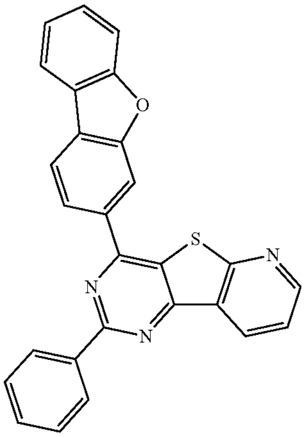

-continued
E1-22
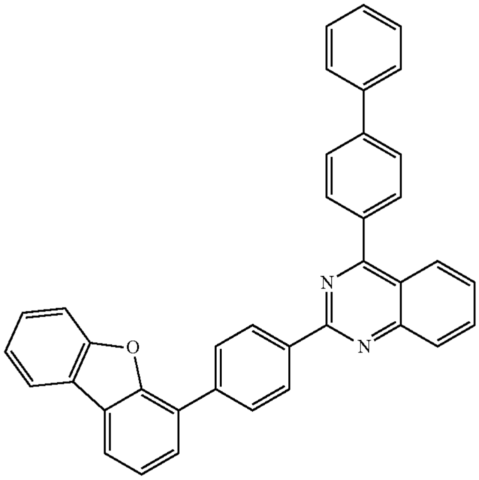
E1-23
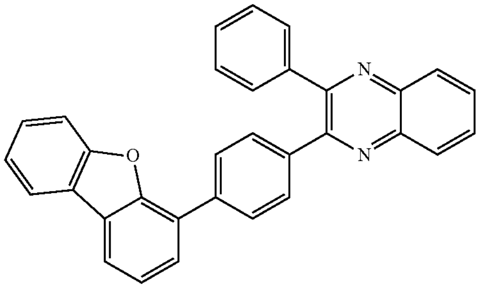
E1-24
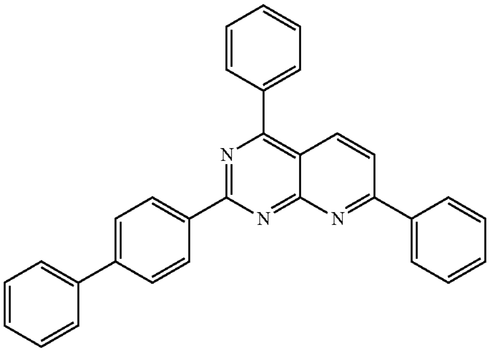
E1-25
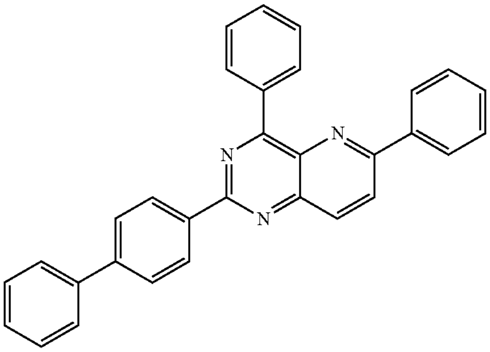
-continued
E1-26
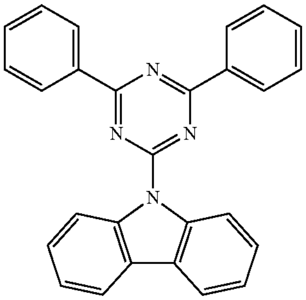
E1-27
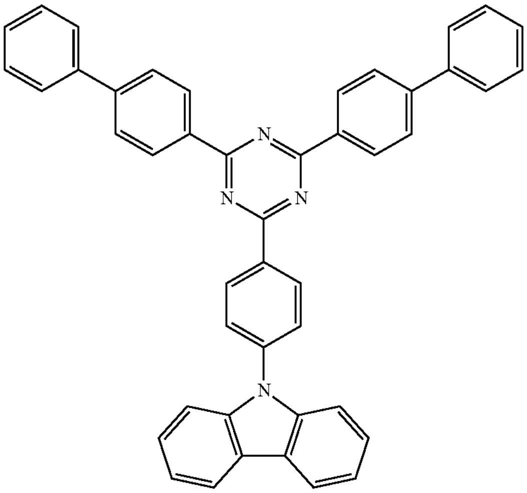
E1-28
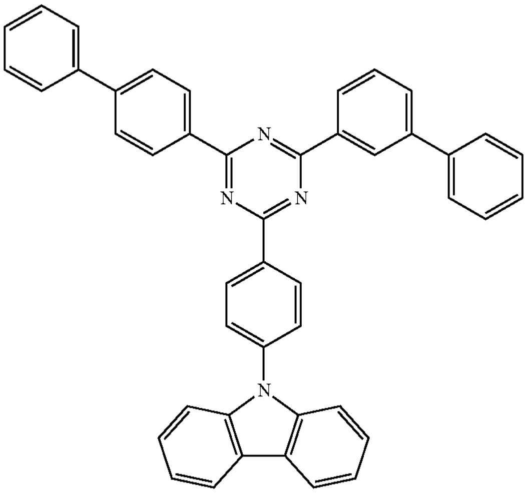

-continued
E1-29
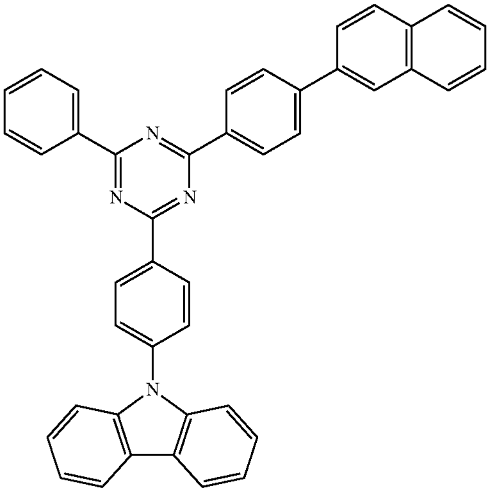
E1-30
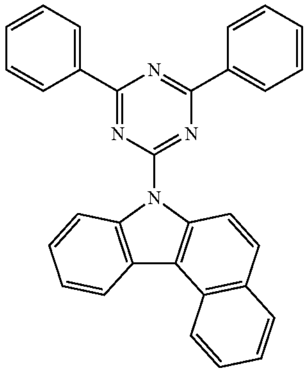
E1-31
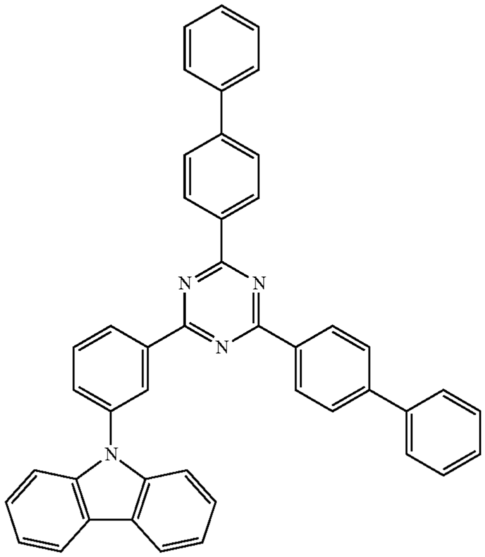
-continued
E1-32
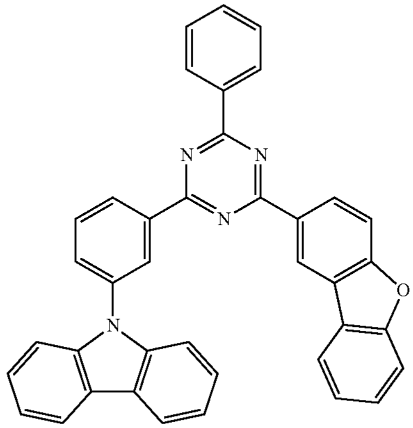
E1-33
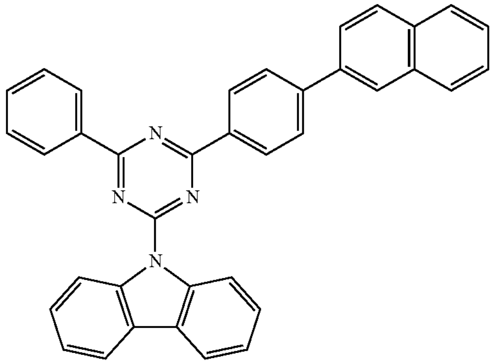
E1-34
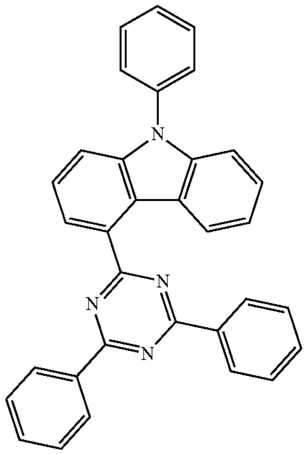

-continued
E1-35
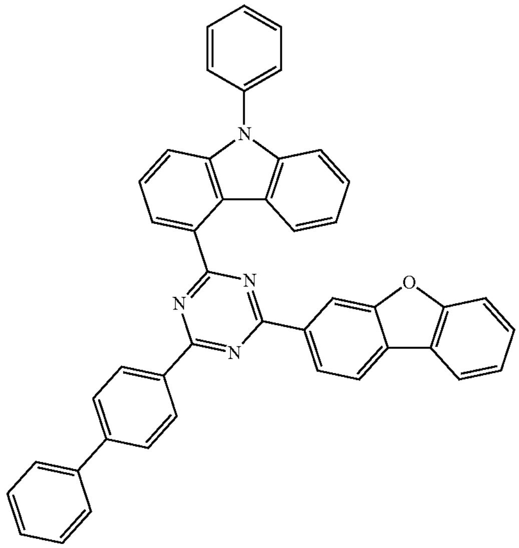
E1-36
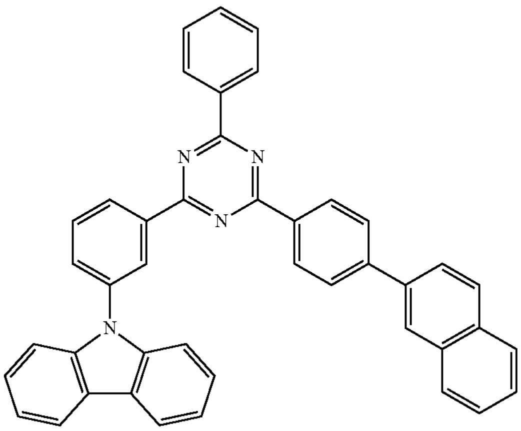
E1-37
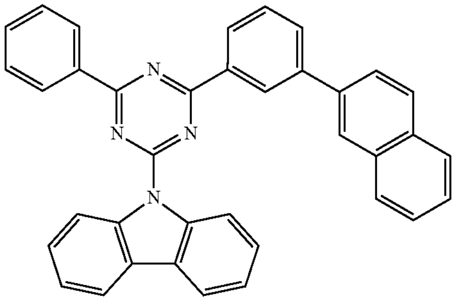
-continued
E1-38
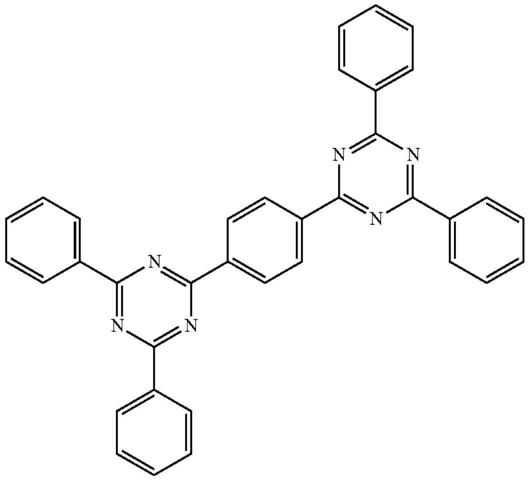
E1-39
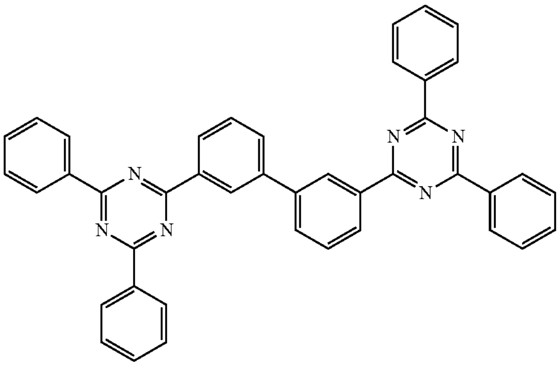
E1-40
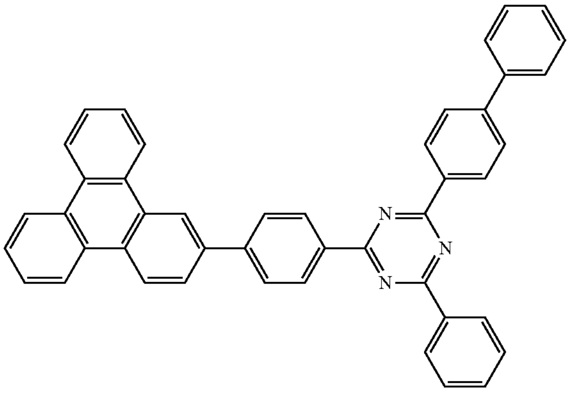

-continued
E1-41
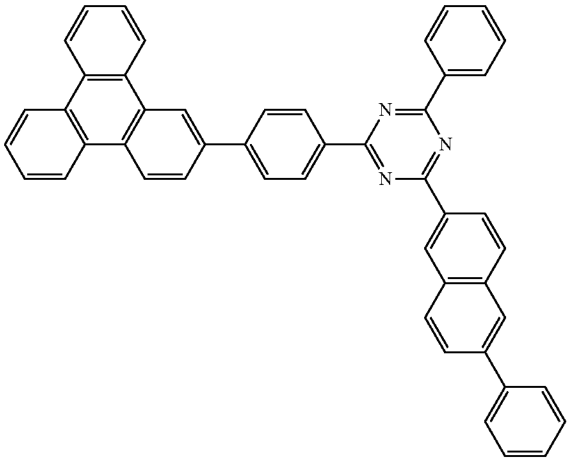
E1-42
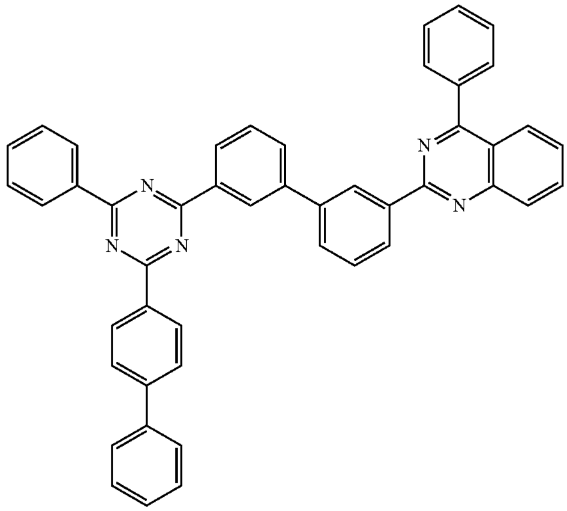
E1-43
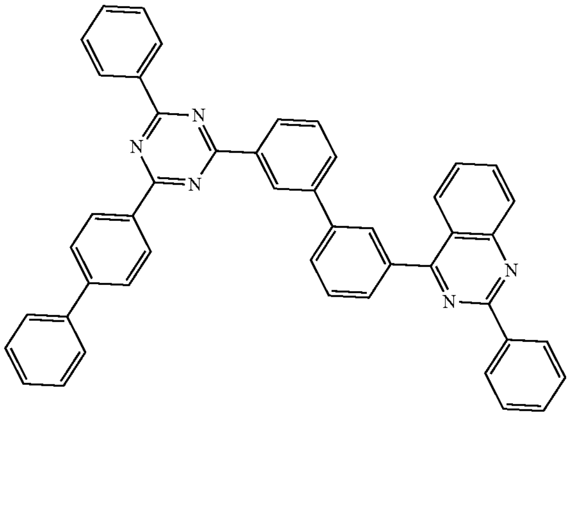
-continued
E1-44
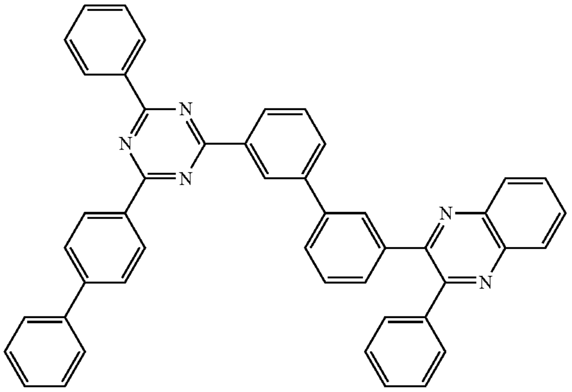
E1-45
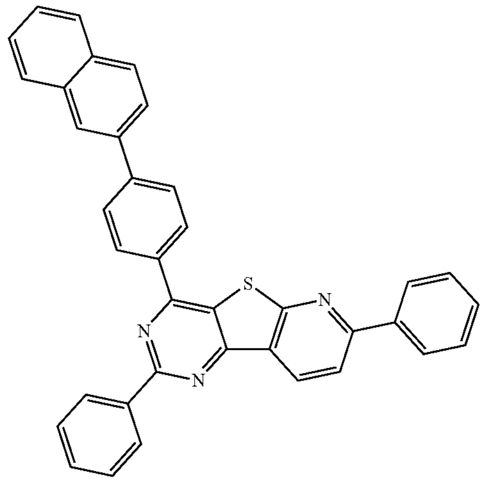
E1-46
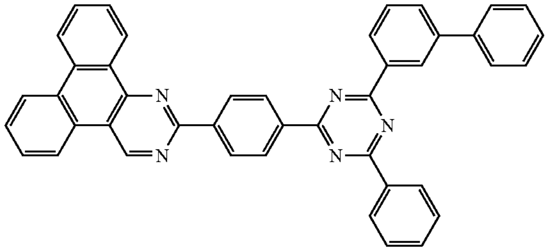
E1-47
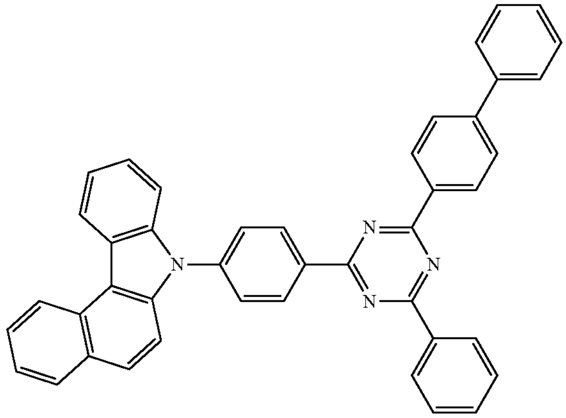

-continued
E1-48
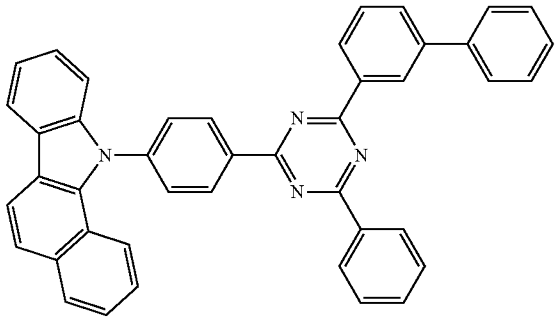
E1-49
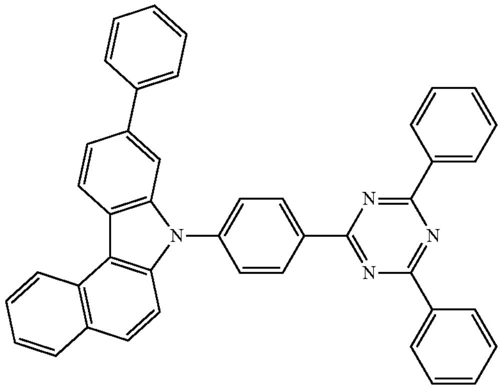
E1-50
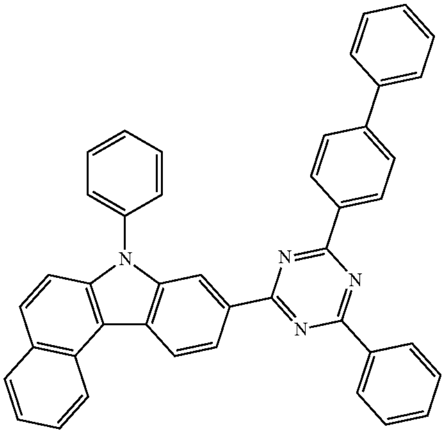
-continued
E1-51
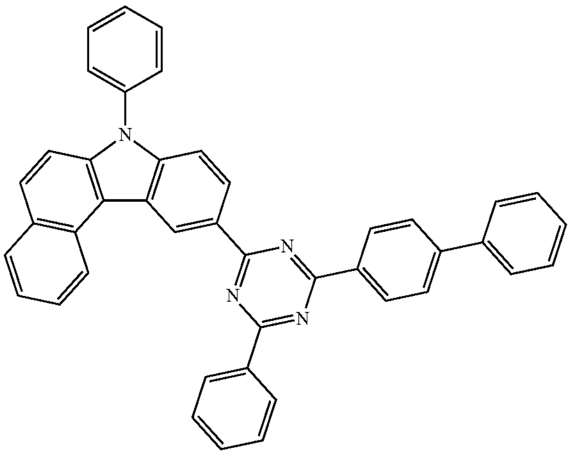
E1-52
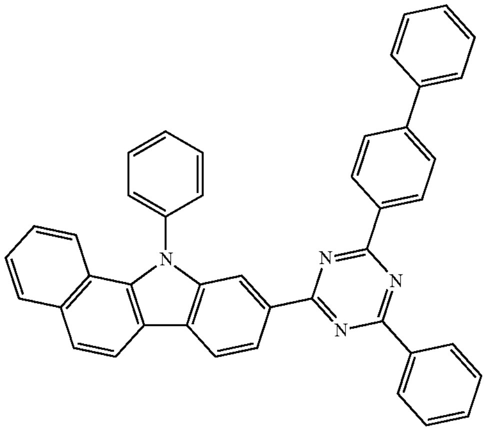
E1-53
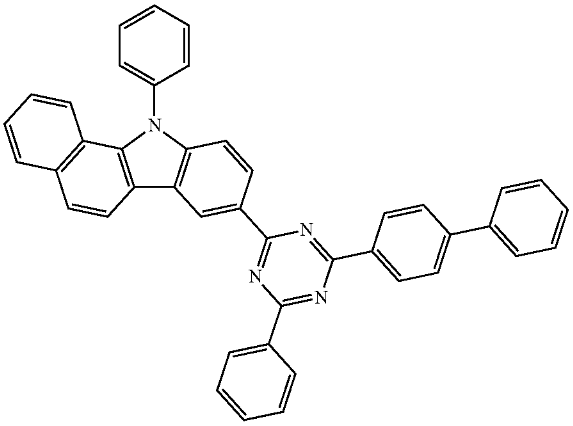

E1-54
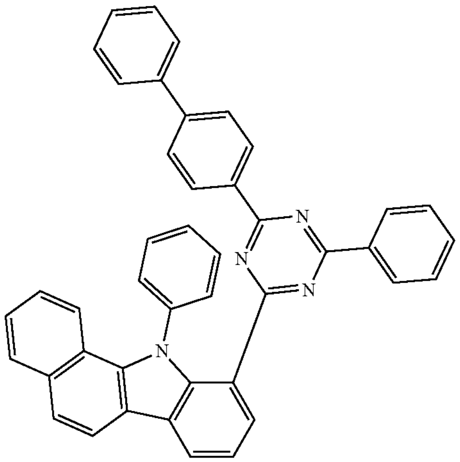
E1-55
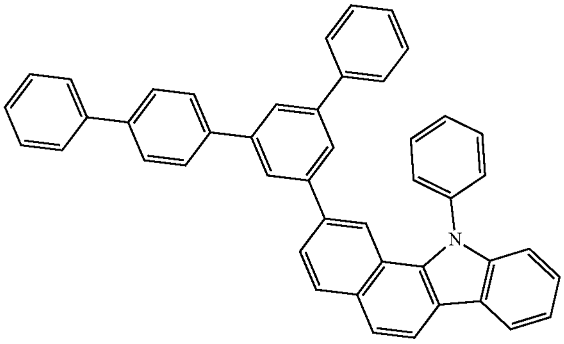
E1-56
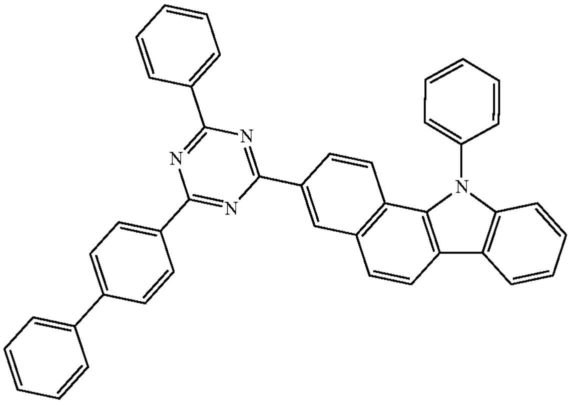
E1-57
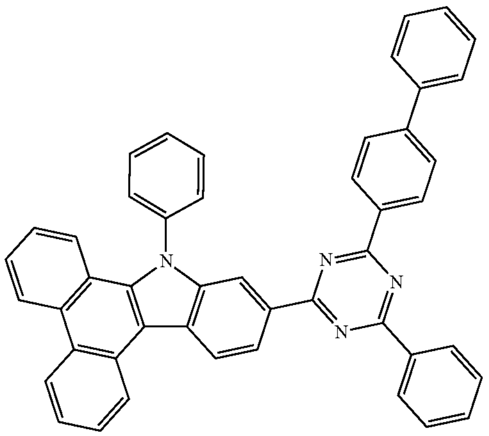
E1-58
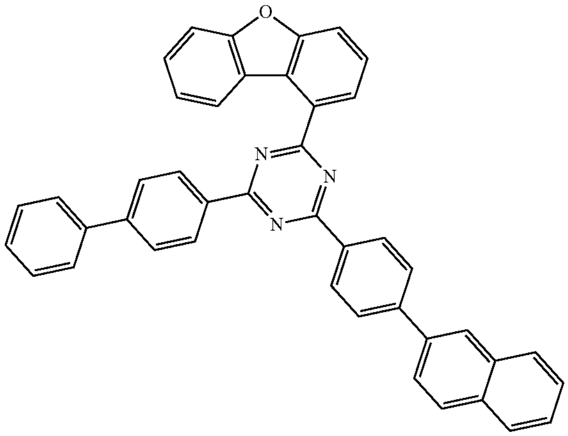
E1-59
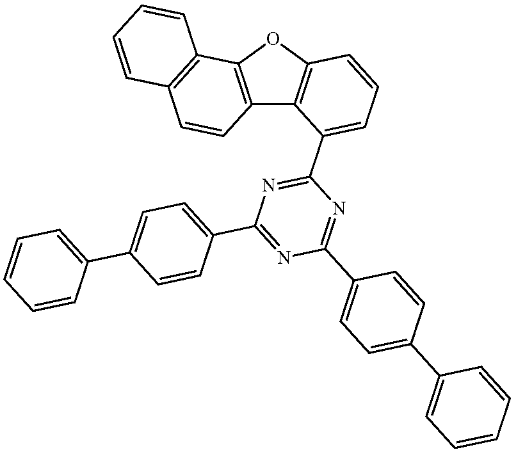

-continued
E1-60
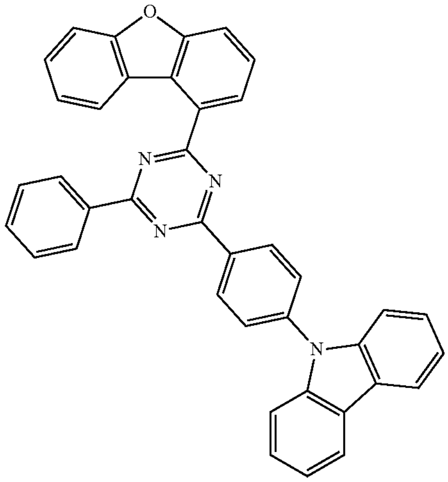
E1-61
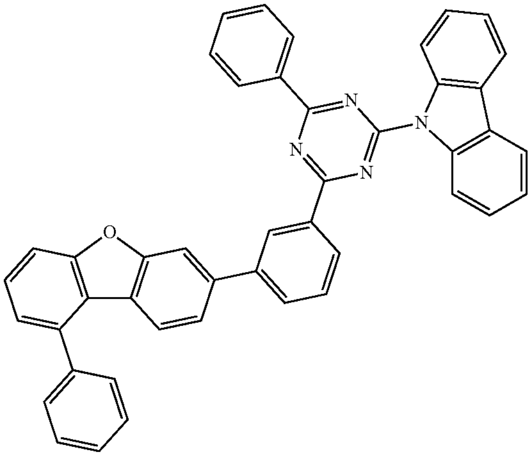
E1-62
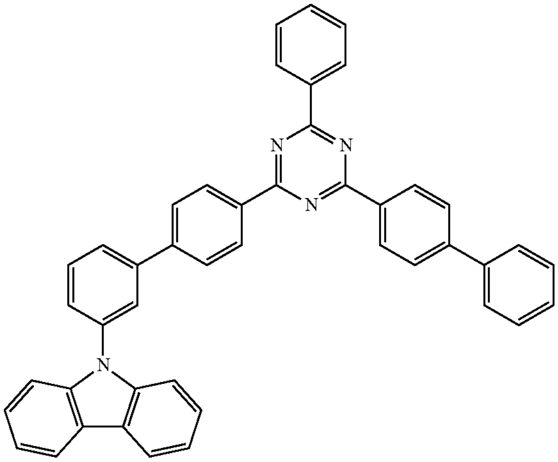
.
In one or more embodiments, the bipolar compound may be at least one of Compounds BP1-1 to BP1-17:
BP1-1
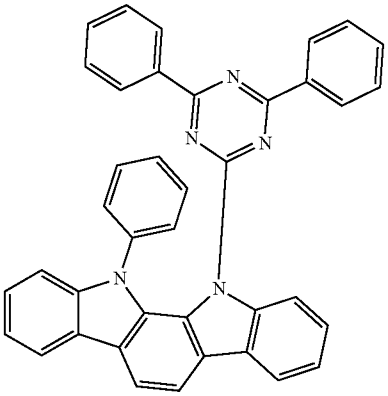
BP1-2
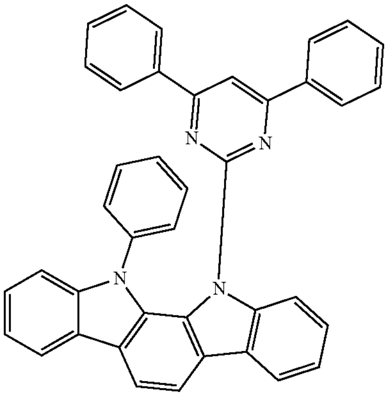
BP1-3
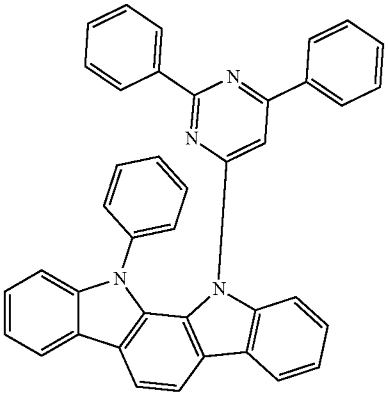
BP1-4
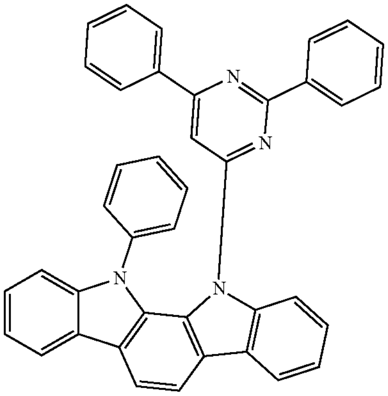

-continued
BP1-5
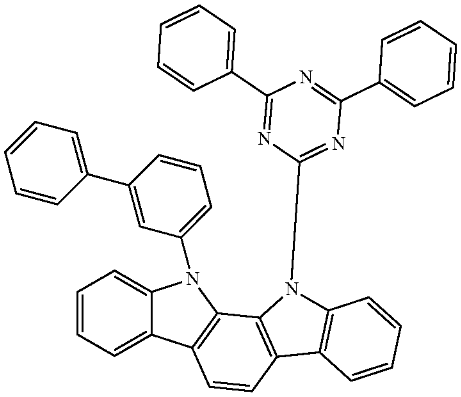
BP1-6
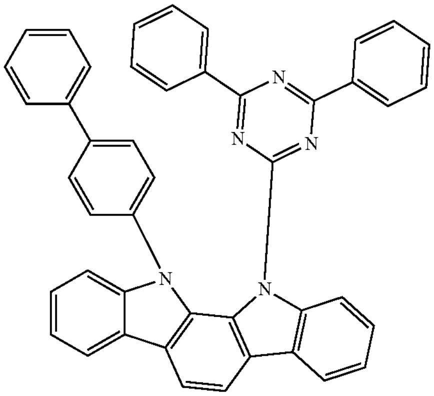
BP1-7
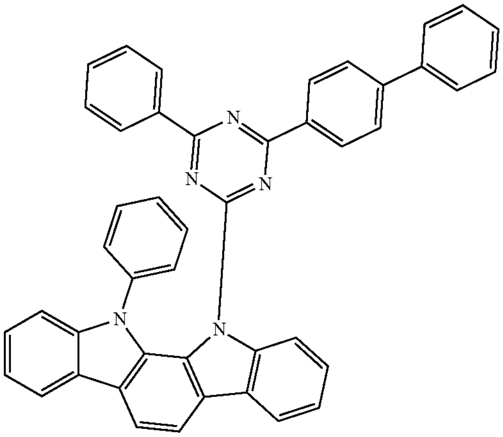
-continued
BP1-8
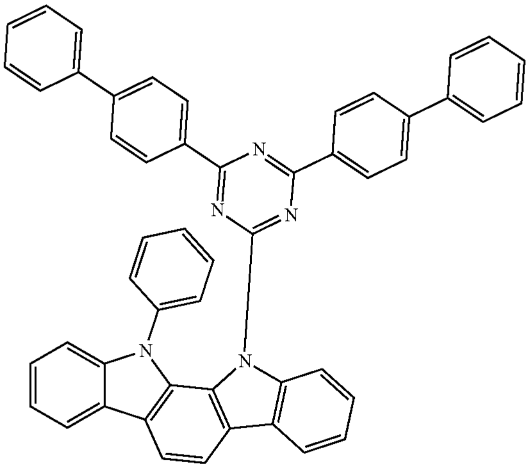
BP1-9
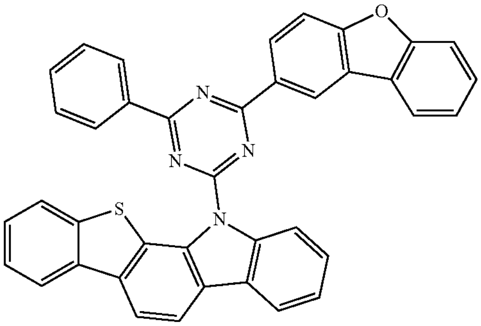
BP1-10
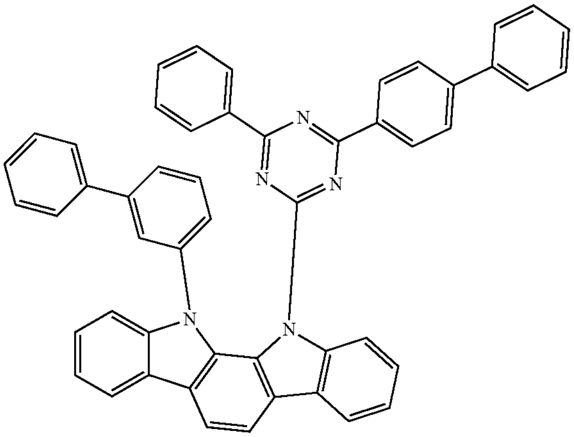

-continued
BP1-11
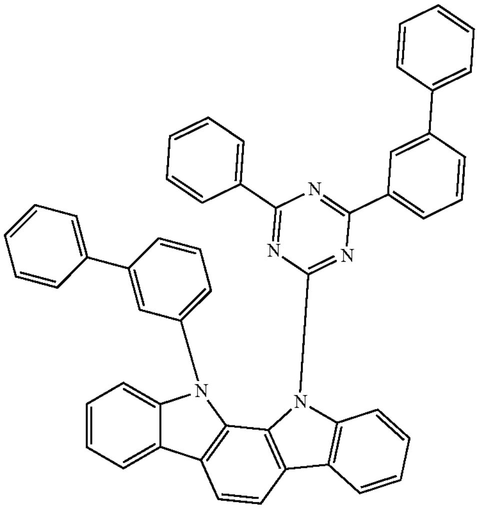
BP1-12
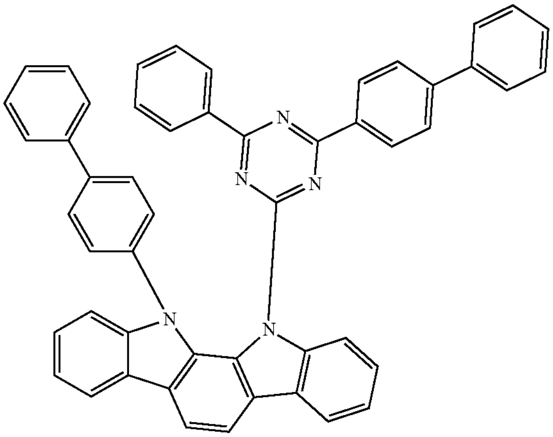
BP1-13
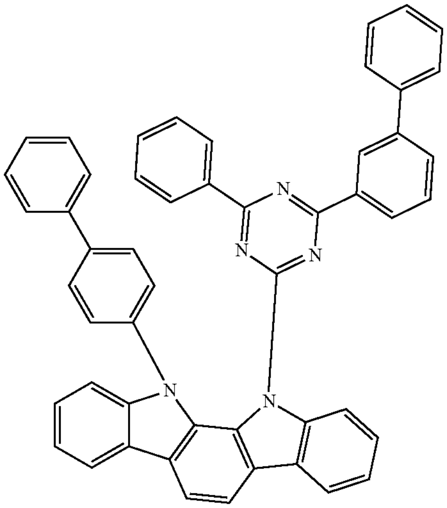
-continued
BP1-14
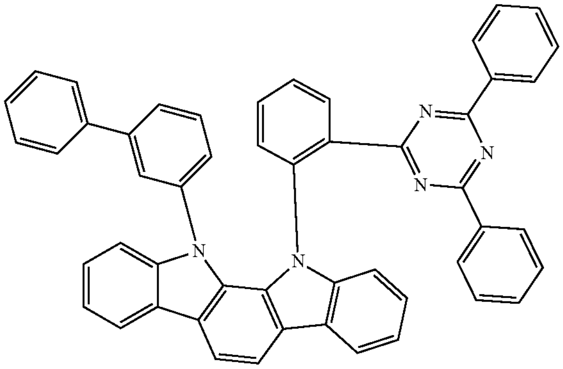
BP1-14
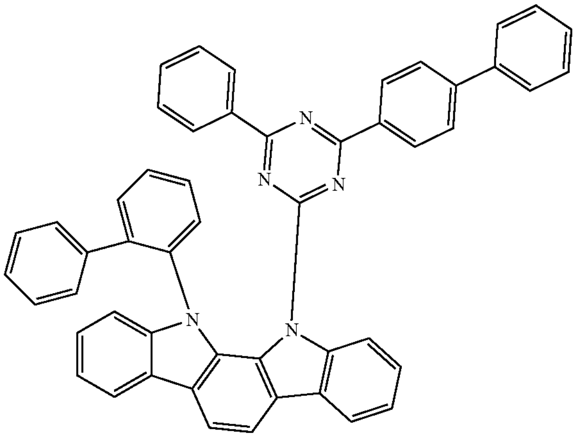
BP1-16
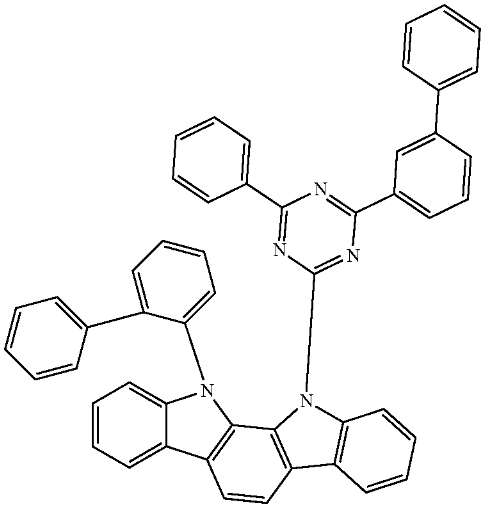

BP1-17
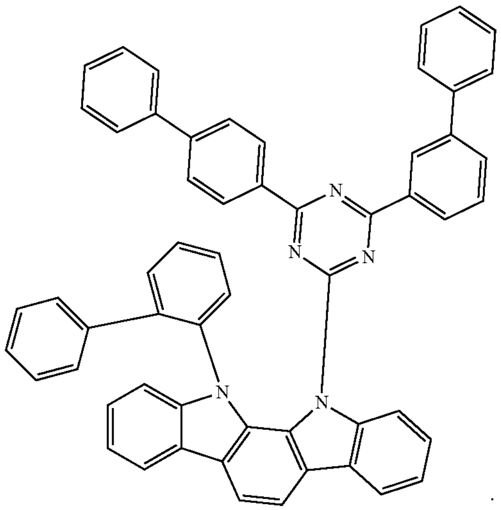
In an embodiment, the emission layer may not include compounds of Group A:
Group A
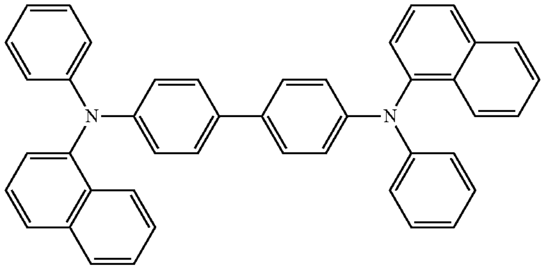
NPB
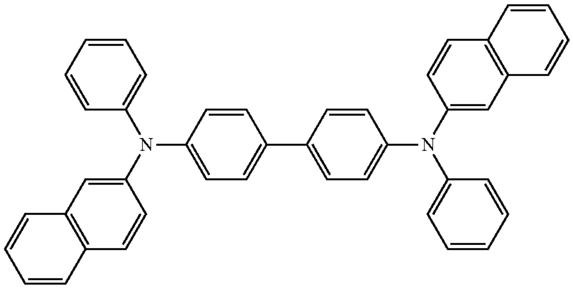
β-NPB
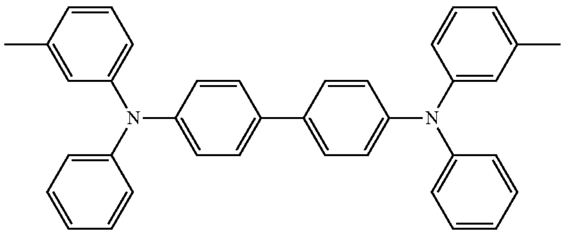
TPD
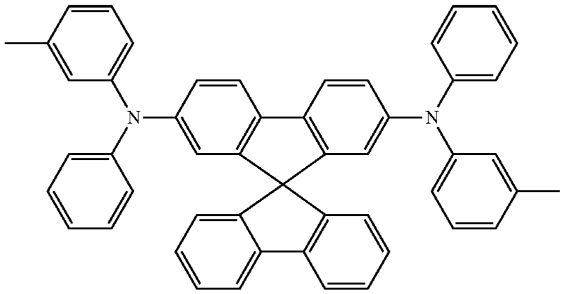
Spiro-TPD
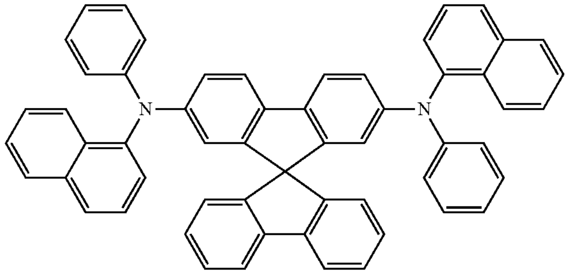
Spiro-NPB
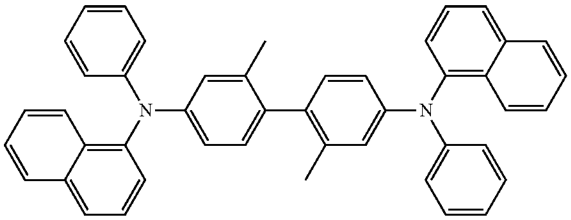
methylated NPB
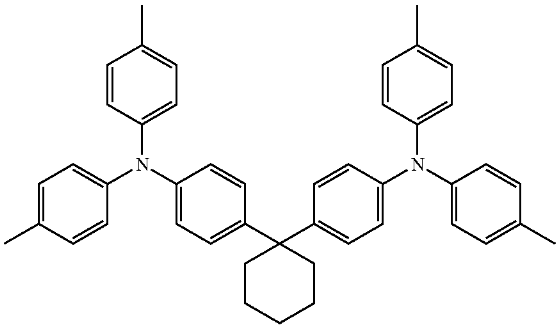
TAPC
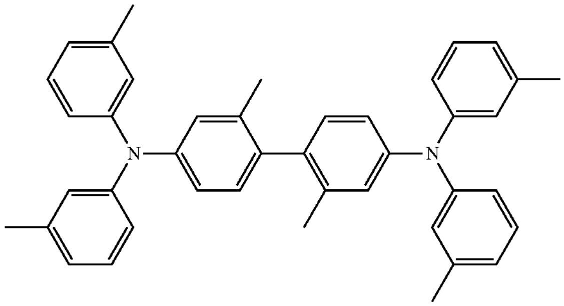
HMTPD -continued
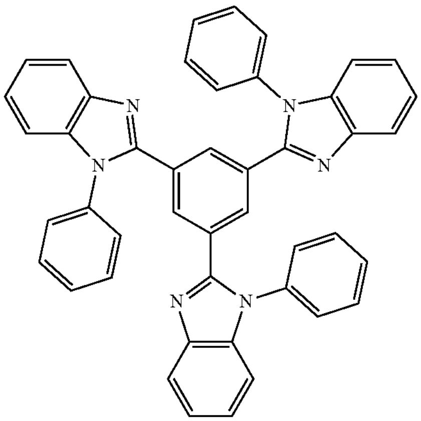
TPBi
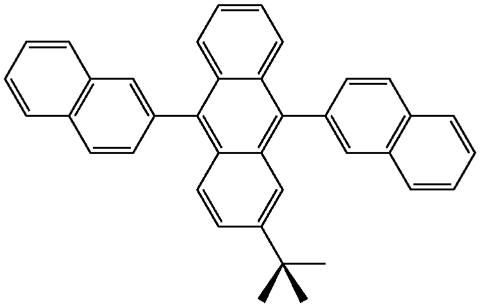
TBADN
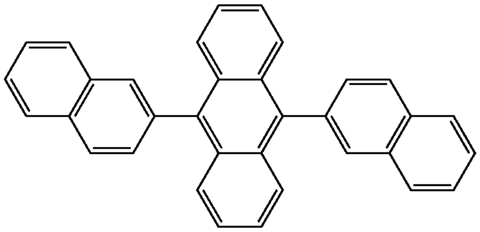
ADN
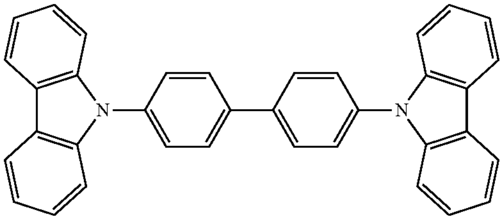
CBP
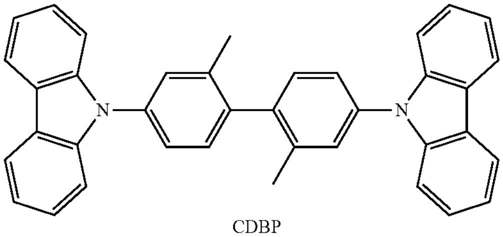
CDBP
-continued
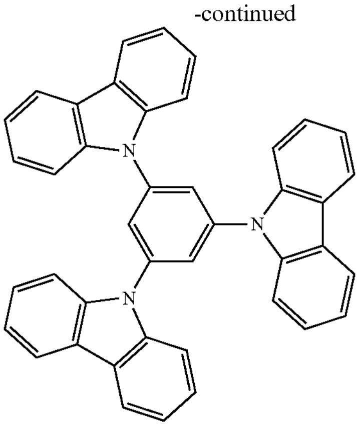
TCP
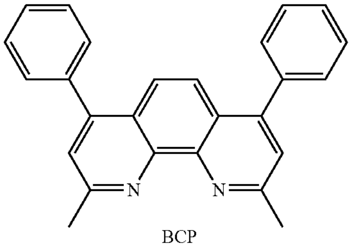
BCP
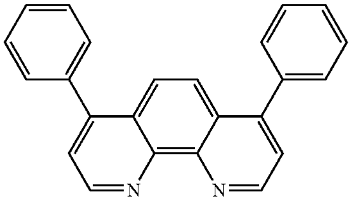
Bphen
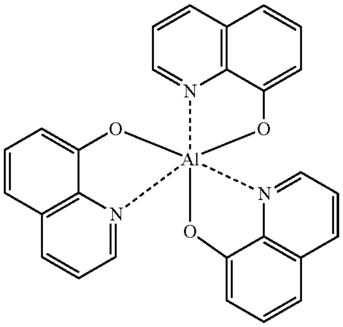
$Alq_3$
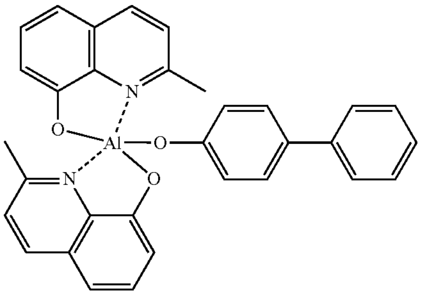
BAlq -continued

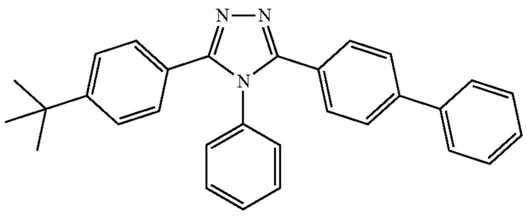

TAZ

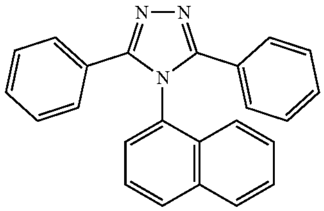

NTAZ

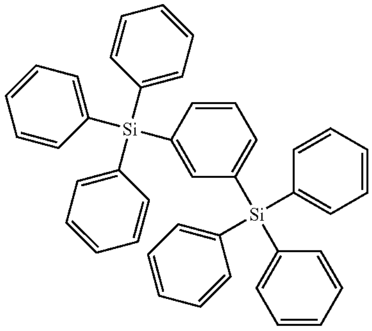

m-bis-(triphenylsilyl)benzene

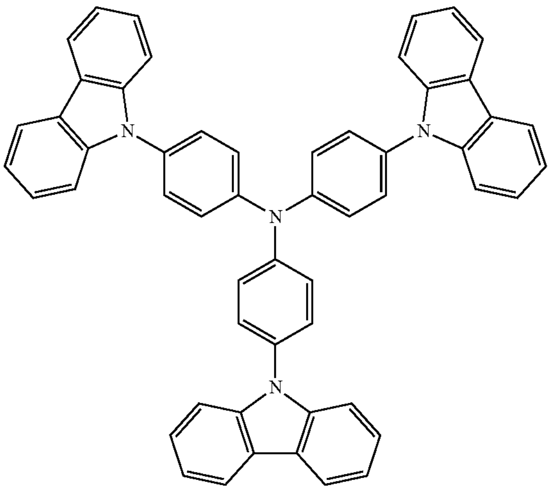

TCTA(4,4′4″-tris(carbazol-9-yl)triphenylamine)

-continued

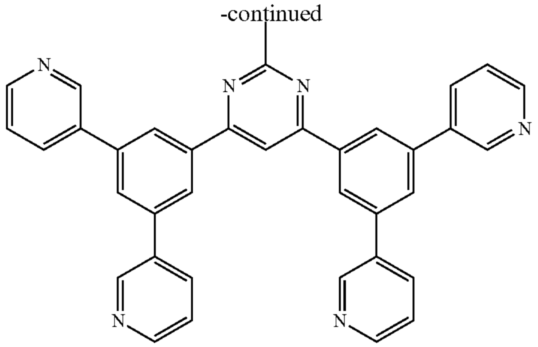

B3PYMPM(4,6-bis(3,5-di(pyridine-3-yl)phenyl)-2-methylpyrimidine

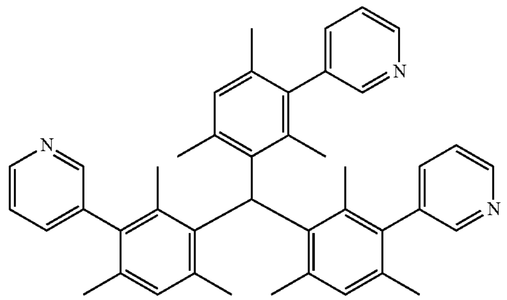

3TPYMB(tris(2,4,6-trimethyl-3-(pyridine-3-yl)phenyl)borane

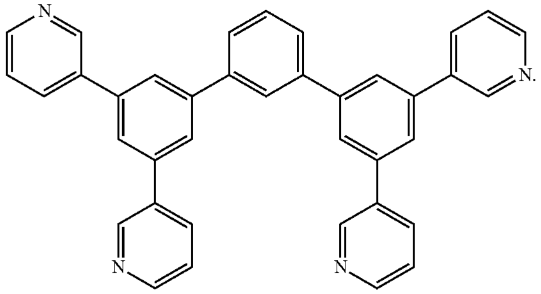

BmPyPhB(1,3-bis[3,5-di(pyridine-3-yl)phenyl]benzene)

In an embodiment, the light-emitting device may further include a hole transport region between the first electrode and the emission layer and an electron transport region between the emission layer and the second electrode. The hole transport region may be the first region described in this disclosure.

The hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" used herein refers to a single layer and/or a plurality of layers between the first electrode and the second electrode of the light-emitting device. The "organic layer" may include, in addition to an organic compound, an organometallic complex including metal.

Description of FIG. 1

FIG. 1 schematically illustrates a cross-sectional view of an organic light-emitting device 10, which is a light-emitting device according to an exemplary embodiment of the disclosure. Hereinafter, a structure and manufacturing method of an organic light-emitting device according to an embodiment of the disclosure will be described in connection with FIG. 1.

The organic light-emitting device 10 of FIG. 1 has a structure in which a first electrode 11, a hole transport region 13, an emission layer 15, an electron transport region 17, and a second electrode 19 are sequentially stacked. The emission layer 15 includes a first emission layer 15-1 and a second emission layer 15-2.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode. The material for forming the first electrode 11 may be indium tin oxide (ITO), indium zinc oxide (IZO), tin oxide ($SnO_2$), or zinc oxide (ZnO). In an embodiment, the material for forming the first electrode 11 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In an embodiment, the first electrode 11 may have a three-layered structure of ITO/Ag/ITO.

The hole transport region 13 may be located between the first electrode 11 and the emission layer 15.

The hole transport region 13 may include a hole injection layer, a hole transport layer, an electron blocking layer, a buffer layer, or a combination thereof.

The hole transport region 13 may include only a hole injection layer or only a hole transport layer. In one or more embodiments, the hole transport region 13 may have a hole injection layer/hole transport layer structure or a hole injection layer/hole transport layer/electron blocking layer structure, which are sequentially stacked in this stated order from the first electrode 11.

When the hole transport region 13 includes a hole injection layer, the hole injection layer may be formed on the first electrode 11 by using one or more suitable methods, for example, a vacuum deposition method, a spin coating method, a casting method, a Langmuir-Blodgett (LB) method, and/or an ink-jet printing method.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C.

The conditions for forming the hole transport layer and the electron blocking layer may be the same as the conditions for forming the hole injection layer.

The hole transport region 13 may include m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate)(PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

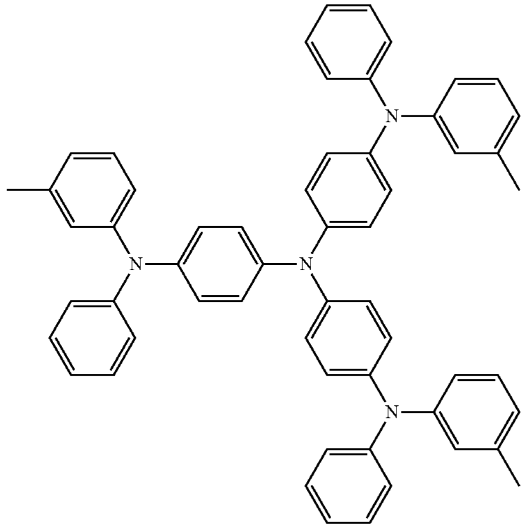

m-MTDATA

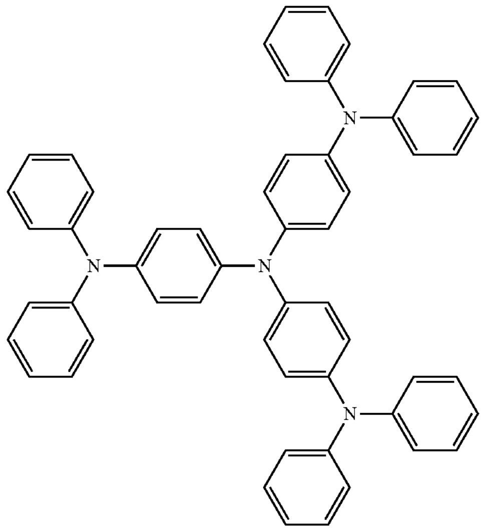

TDATA

-continued
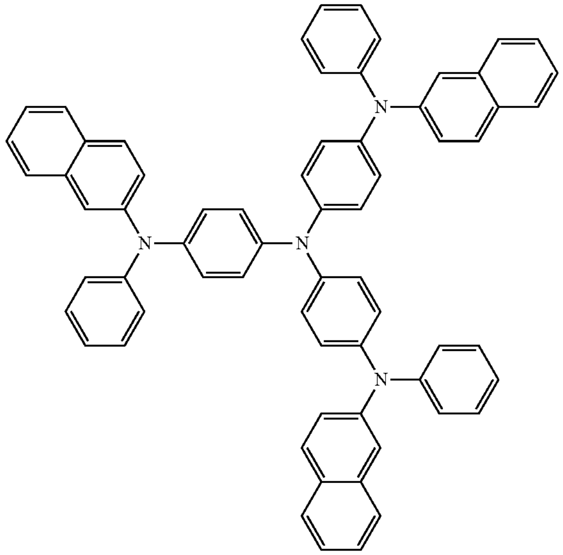
2-TNATA.
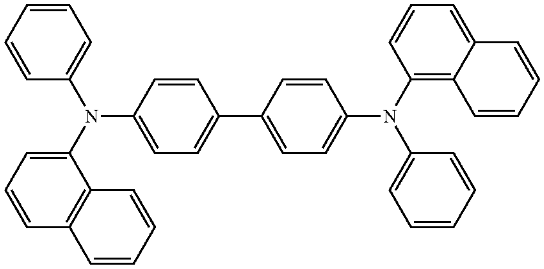
NPB
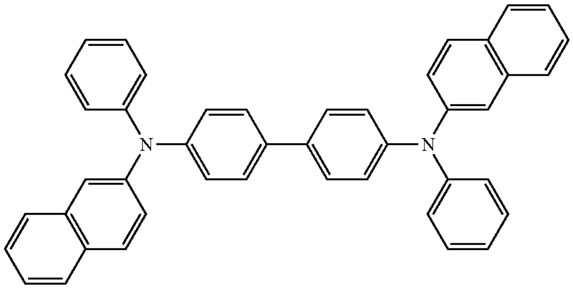
β-NPB
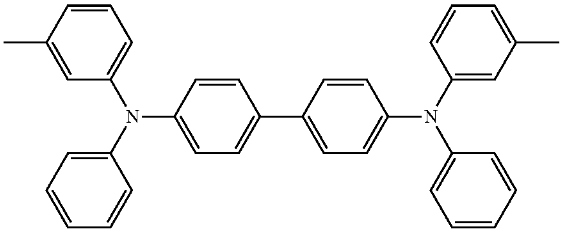
TPD
-continued
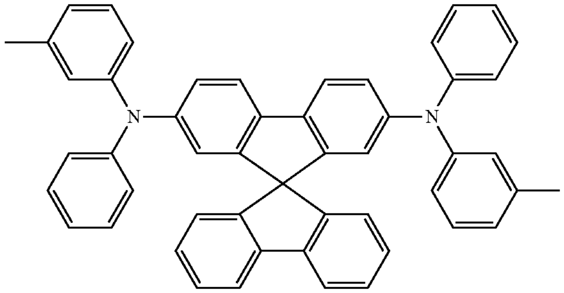
Spiro-TPD
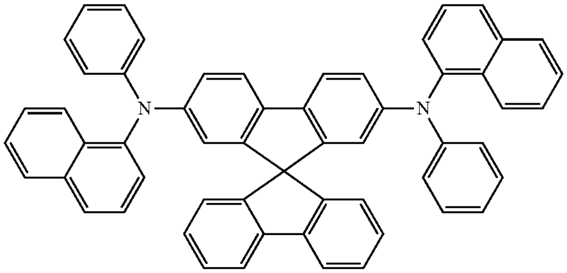
Spiro-NPB
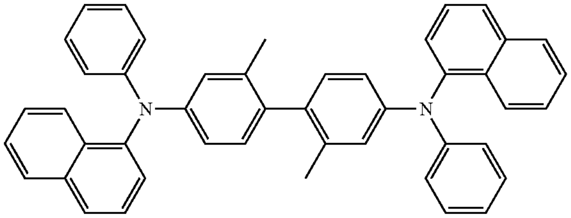
methylated NPB
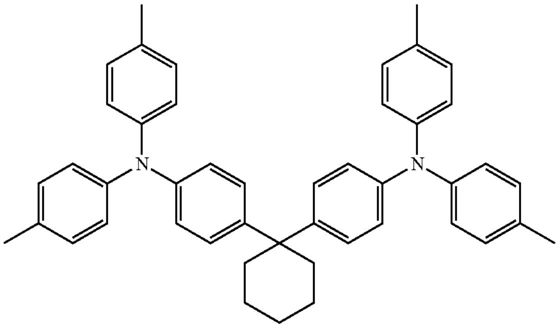
TAPC
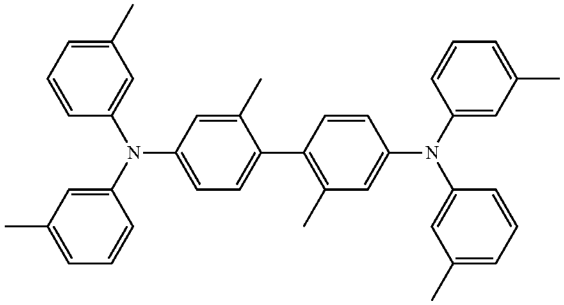
HMTPD -continued Formula 201

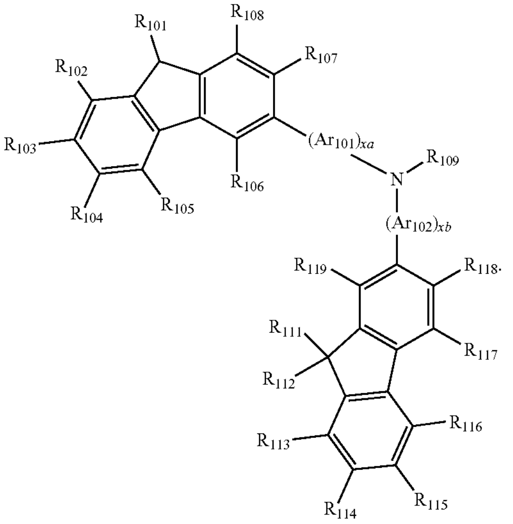

Formula 202

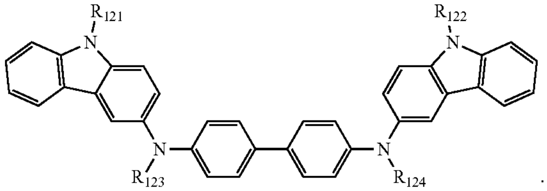

.

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. In an embodiment, xa may be 1 and xb may be 0.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, a $C_1$-$C_{10}$ alkyl group (for example, a methyl group, an ethyl group, a propyl group, a butyl group, a pentyl group, a hexyl group), or a $C_1$-$C_{10}$ alkoxy group (for example, a methoxy group, an ethoxy group, a propoxy group, a butoxy group, a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A:

Formula 201A

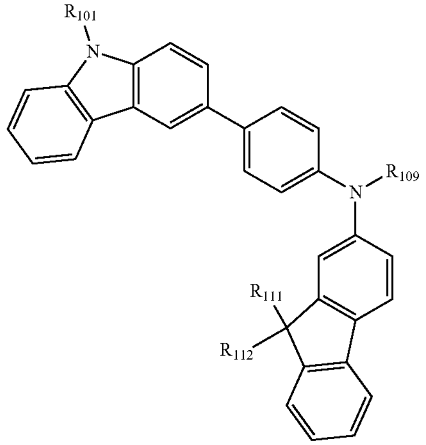

wherein $R_{101}$, $R_{111}$, $R_{112}$, and $R_{109}$ in Formula 201A are each the same as described above.

In an embodiment, the hole transport region 13 may include one of Compounds HT1 to HT20 or any combination thereof:

HT1

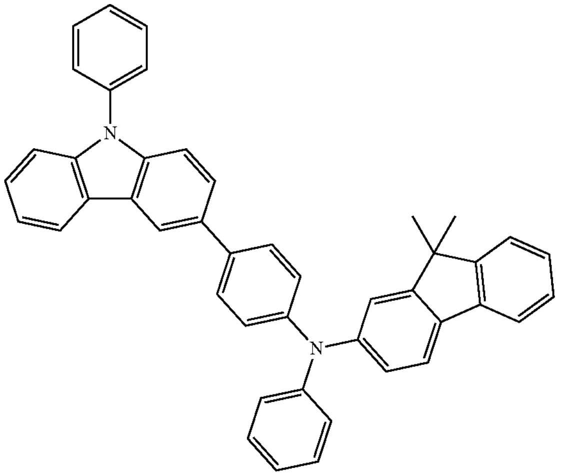

-continued
HT2
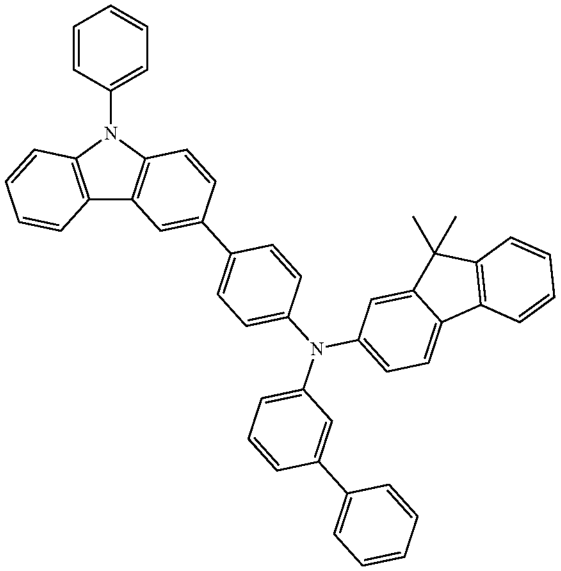
HT3
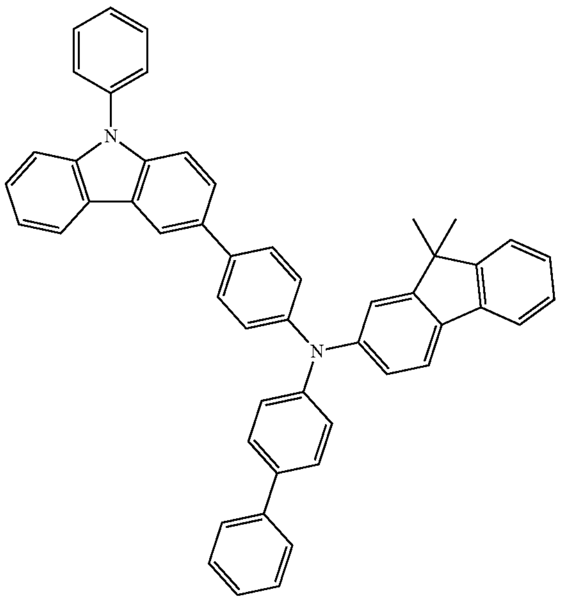
-continued
HT4
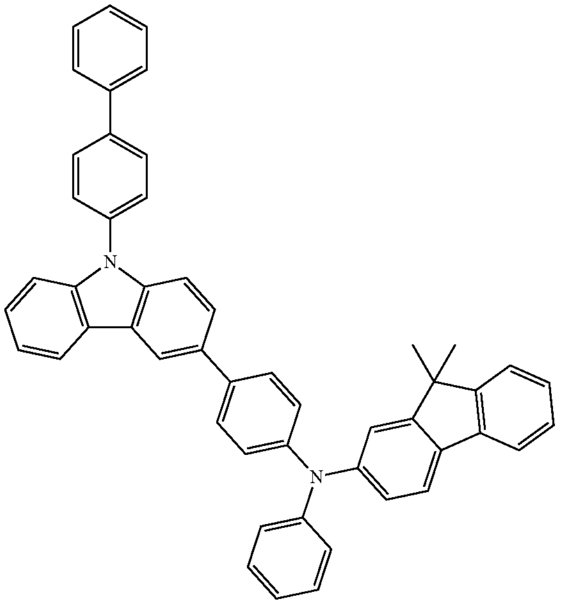
HT5
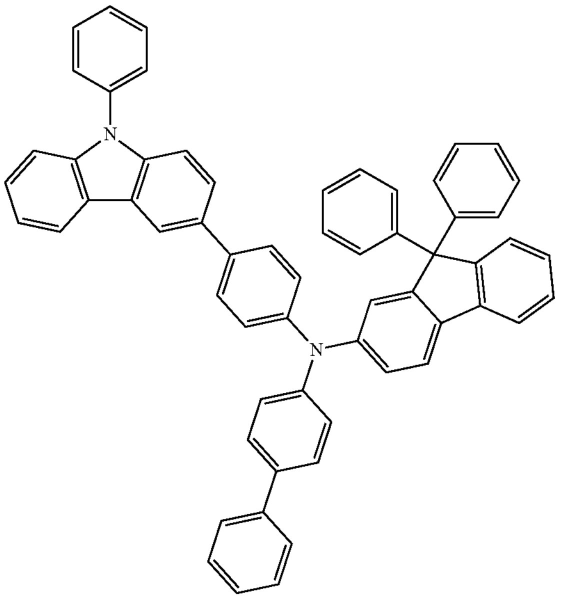

-continued
HT6
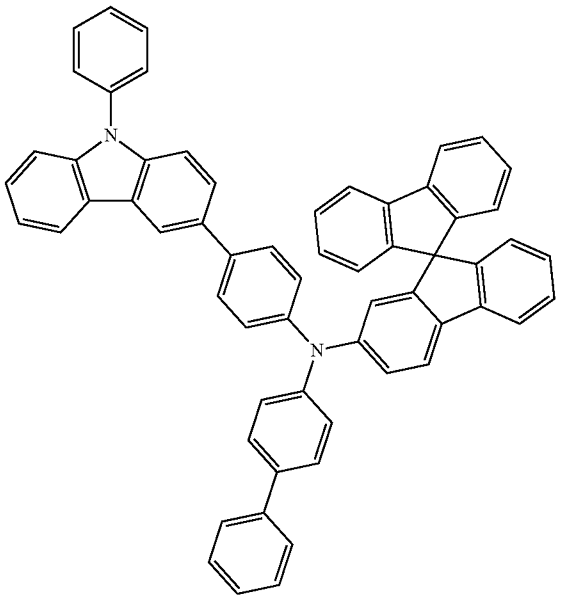
HT7
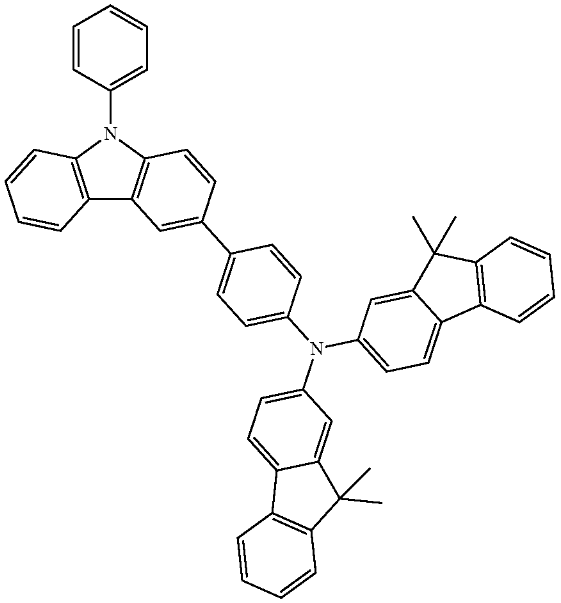
-continued
HT8
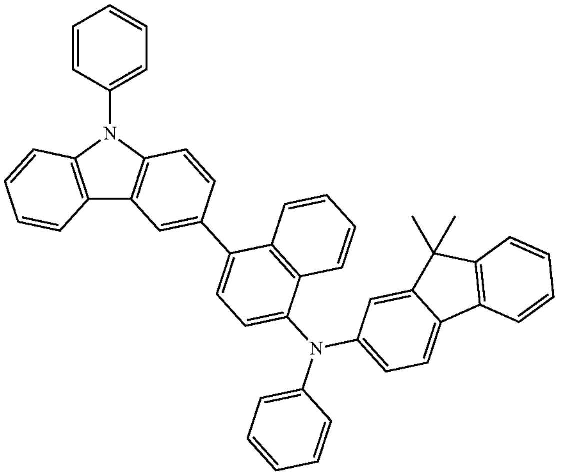
HT9
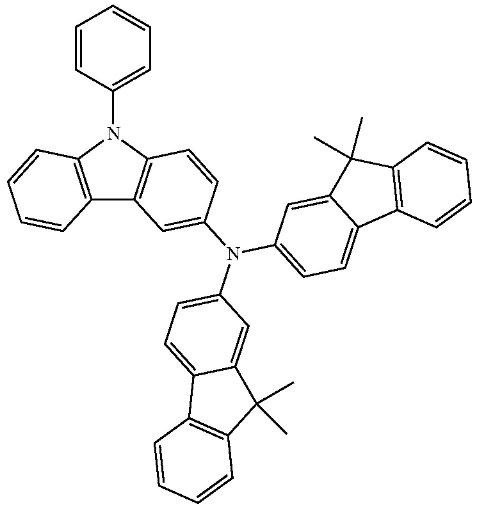
HT10
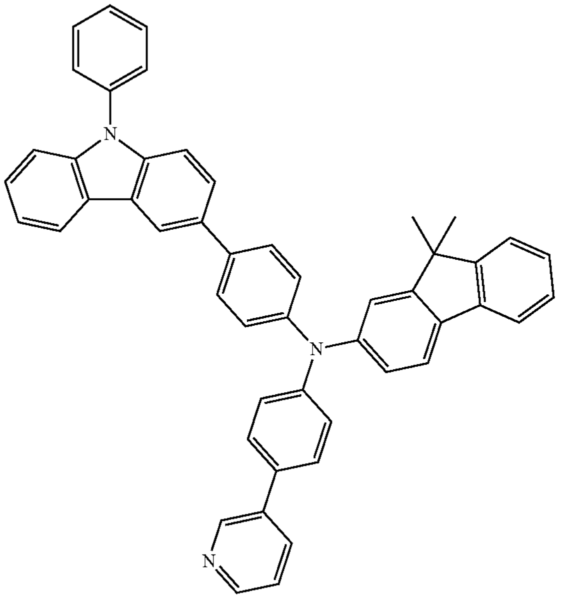

-continued
HT11
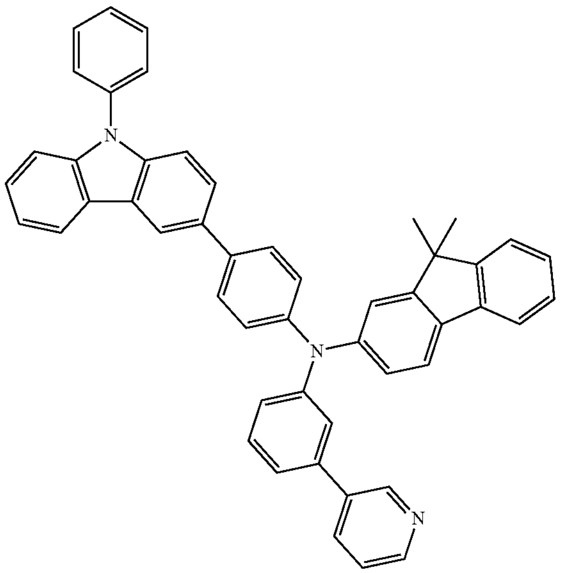
HT12
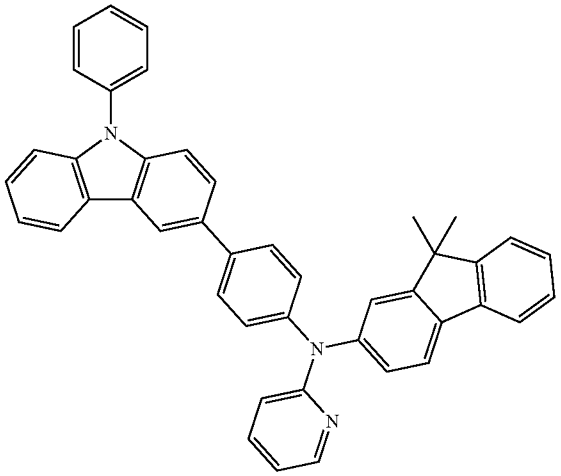
HT13
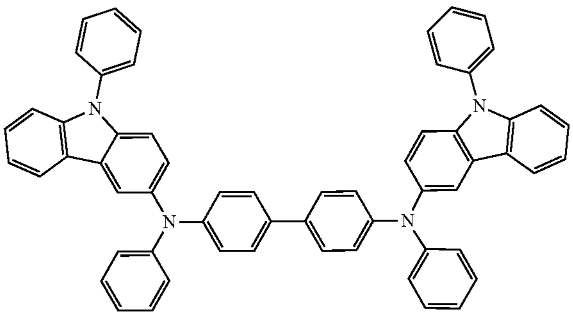
-continued
HT14
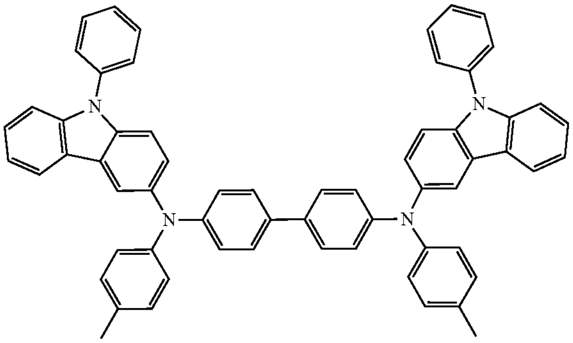
HT15
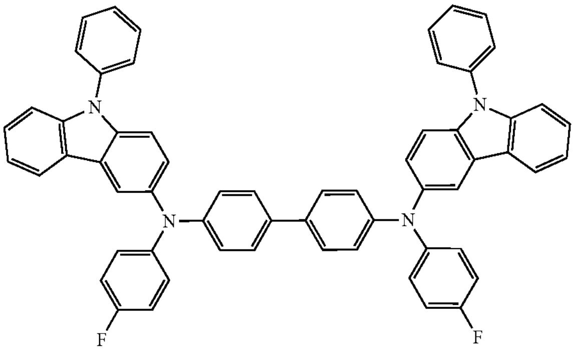
HT16
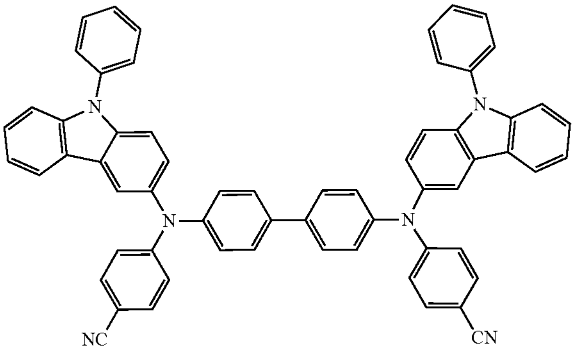
HT17
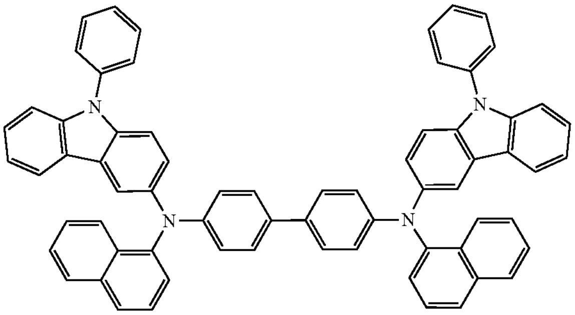

-continued

HT18

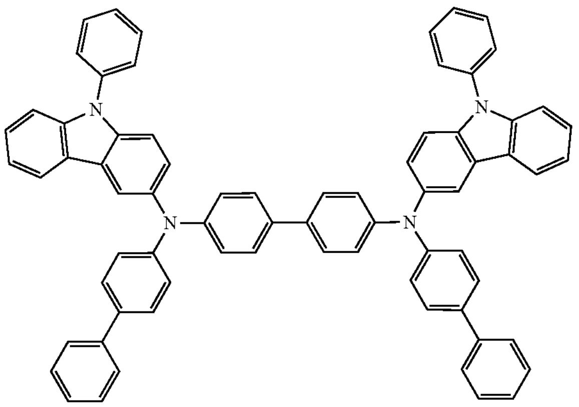

HT19

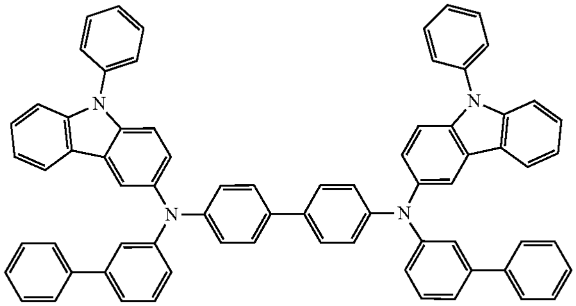

HT20

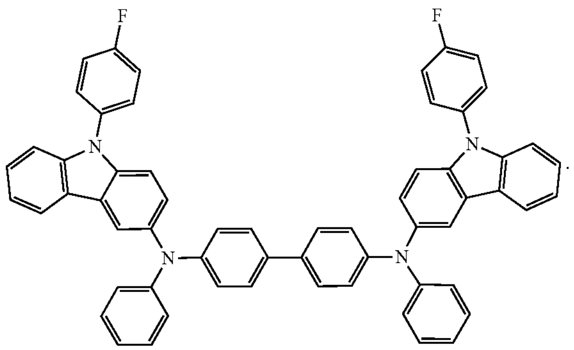

A thickness of the hole transport region 13 may be from about 100 Å to about 10,000 Å, for example, from about 100 Å to about 1,000 Å. When the hole transport region 13 includes a hole injection layer, a hole transport layer, an electron blocking layer, or a combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region 13, the hole injection layer, and the hole transport layer are within these ranges, satisfactory hole transporting characteristics may be obtained without a substantial increase in driving voltage.

In addition to the above-described materials, the hole transport region 13 may further include a charge-generation material to improve conductivity. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof. In an embodiment, the p-dopant may be: a quinone derivative such as tetracyanoquinodimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof:

HT-D1

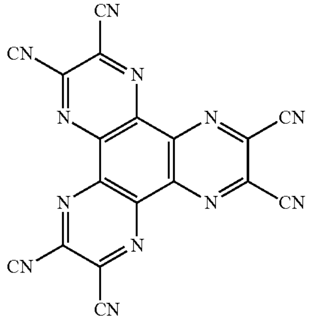

F4-TCNQ

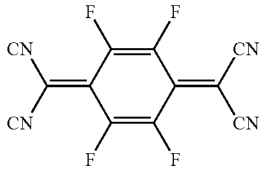

F6-TCNNQ

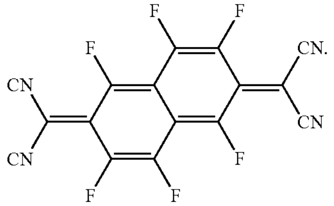

The hole transport region 13 may further include a buffer layer.

Also, the buffer layer may compensate for an optical resonance distance according to a wavelength of light emitted from the emission layer, and thus, luminescence efficiency of a light-emitting device may be improved.

Meanwhile, when the hole transport region 13 includes an electron blocking layer, the material for the electron blocking layer may include a material, a host material, or a combination thereof that can be used in the hole transport region 13 as described above. In an embodiment, when the hole transport region includes an electron blocking layer, mCP, Compound H1-8 of Group 5-2, or the like may be used as a material for the electron blocking layer.

The emission layer 15 may be formed on the hole transport region 13 by using, for example, a vacuum deposition method, a spin coating method, a cast method, an LB method, and/or an ink-jet printing method. When the emission layer 15 is formed by a vacuum deposition method or a spin coating method, the deposition or coating conditions may be similar to those applied in forming the hole injection layer although the deposition or coating conditions may vary depending on a material that is used to form the emission layer.

The emission layer 15 may include a first emission layer 15-1 and a second emission layer 15-2 as described herein.

In an embodiment, the first emission layer 15-1 may include a first dopant and a first host, the second emission layer 15-2 may include a second dopant and a second host, the first dopant may include the first compound, and the second dopant may include the second compound. The first dopant, the first host, the second dopant, the second host, the first compound, and the second compound are each the same as described in the present specification.

An amount (weight) of the first dopant in the first emission layer 15-1 may be from about 0.01 parts by weight to about 20 parts by weight based on 100 parts by weight, based on the total weight of the first host.

An amount (weight) of the second dopant in the second emission layer 15-2 may be from about 0.01 parts by weight to about 20 parts by weight based on 100 parts by weight, based on the total weight of the second host.

A thickness of the emission layer 15 may be in a range of about 100 Å to about 1,000 Å, for example, about 200 Å to about 600 Å. When the thickness of the emission layer 15 is within these ranges, excellent light-emission characteristics may be obtained without a substantial increase in driving voltage.

A thickness ratio of the first emission layer 15-1 to the second emission layer 15-2 may be 8:2 to 2:8, 7:3 to 3:7, or 6:4 to 4:6.

When the light-emitting device is a full-color light-emitting device, the emission layer 15 may be patterned into a red emission layer, a green emission layer, and/or a blue emission layer.

Next, the electron transport region 17 may be located on the emission layer 15.

The electron transport region 17 may include a hole blocking layer, an electron transport layer, an electron injection layer, or a combination thereof.

In an embodiment, the electron transport region 17 may have a hole blocking layer/electron transport layer/electron injection layer structure or an electron transport layer/electron injection layer structure. The electron transport layer may have a single-layered structure or a multi-layered structure including two or more different materials.

The conditions for the formation of the hole blocking layer, the electron transport layer, and the electron injection layer in the electron transport region 17 are the same as the conditions for the formation of the hole injection layer.

When the electron transport region 17 includes a hole blocking layer, the hole blocking layer may include, for example, BCP, Bphen, BAlq, or any combination thereof:

BCP

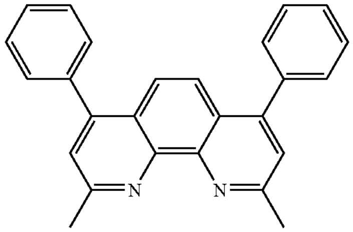

Bphen

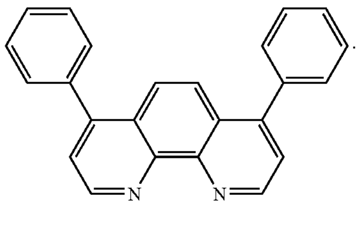

In an embodiment, the hole blocking layer may include any host material, and a material for an electron transport layer, a material for an electron injection layer, or a combination thereof, which will be described later.

A thickness of the hole blocking layer may be in a range of about 20 Å to about 1,000 Å, for example, about 30 Å to about 600 Å. When the thickness of the hole blocking layer is within these ranges, excellent hole blocking characteristics may be obtained without a substantial increase in driving voltage.

The electron transport layer may include BCP, Bphen, TPBi, $Alq_3$, BAlq, TAZ, NTAZ, or any combination thereof:

$Alq_3$

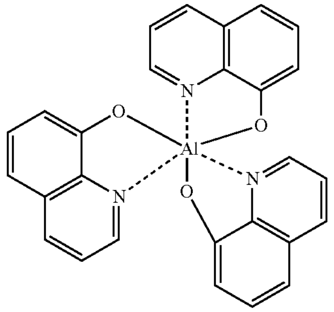

Balq

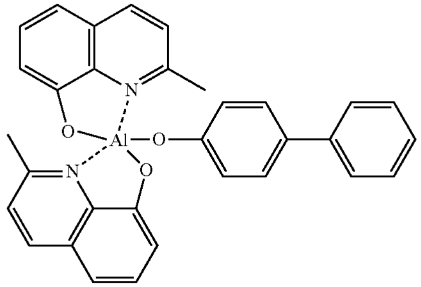

TAZ

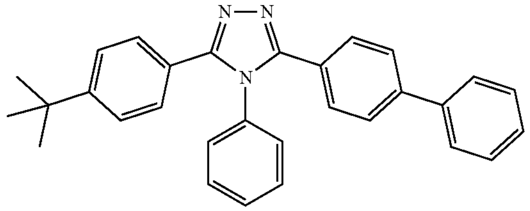

NTAZ

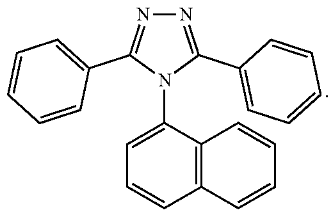

In an embodiment, the electron transport layer may include one of Compounds ET1 to ET25 or any combination thereof:

ET1
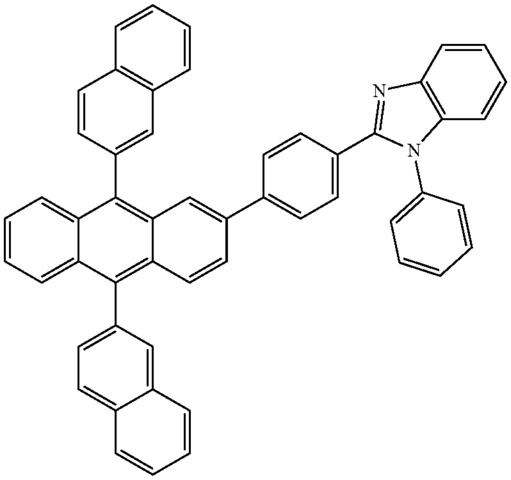
ET2
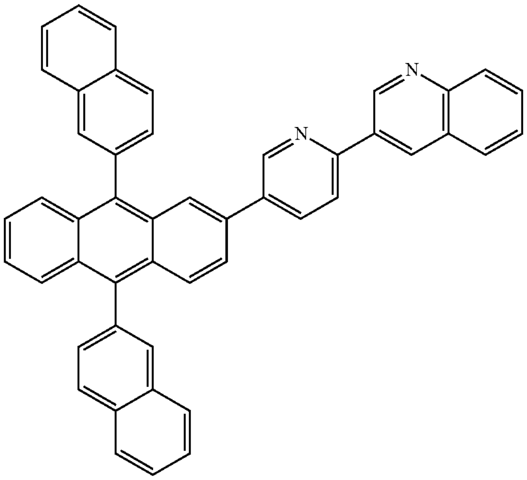
ET3
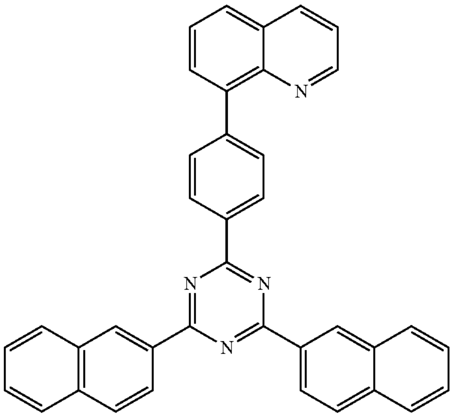
-continued
ET4
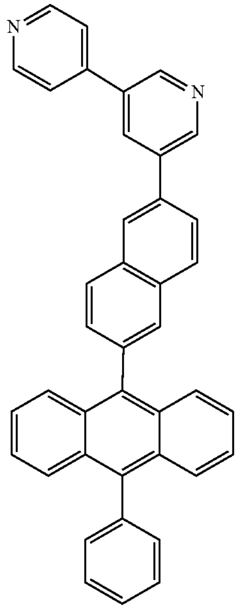
ET5
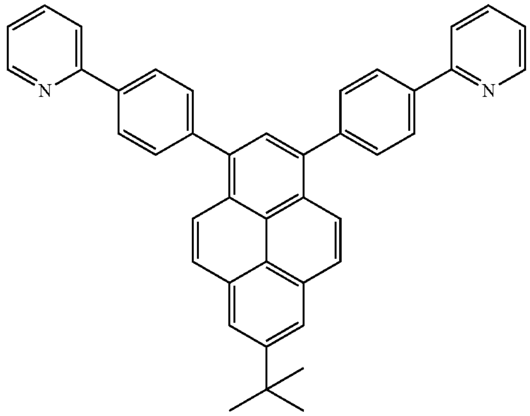
ET6
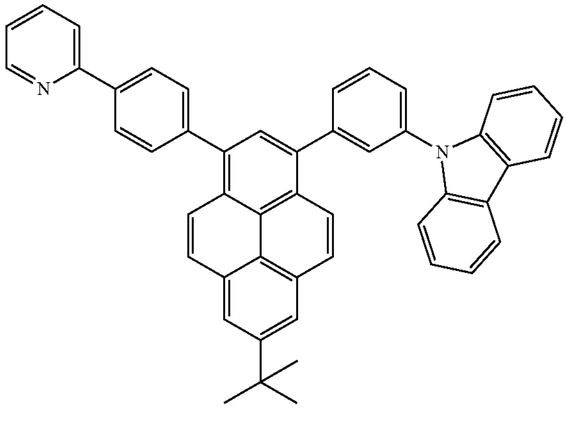

-continued
ET7
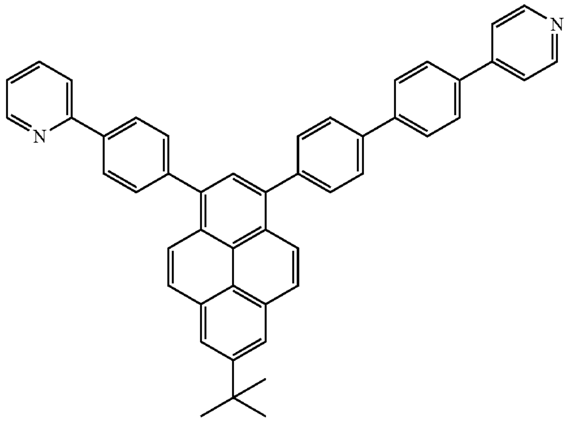
ET8
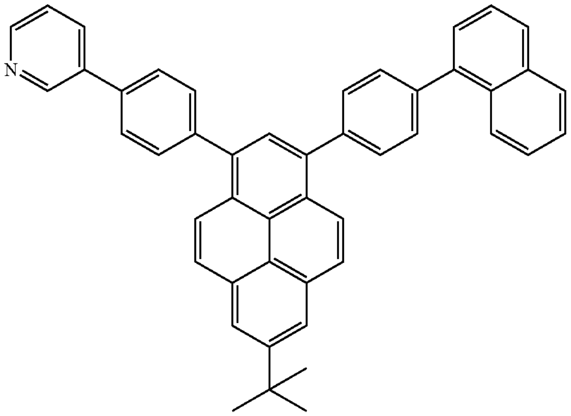
ET9
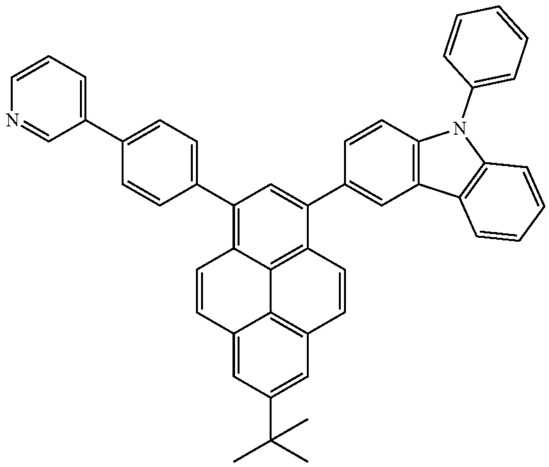
-continued
ET10
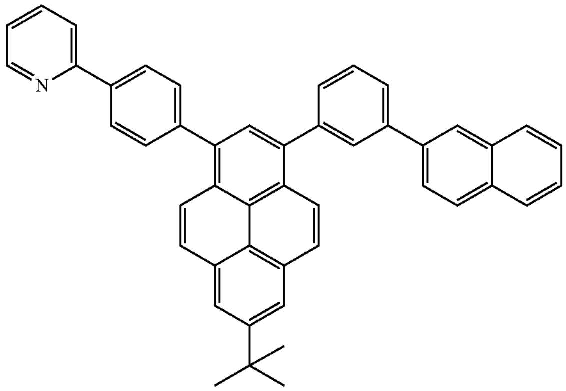
ET11
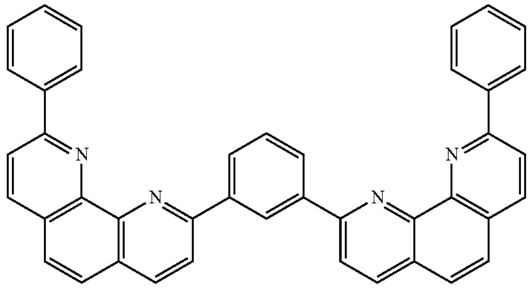
ET12
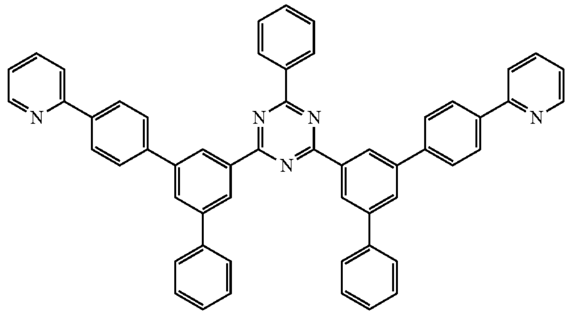
ET13
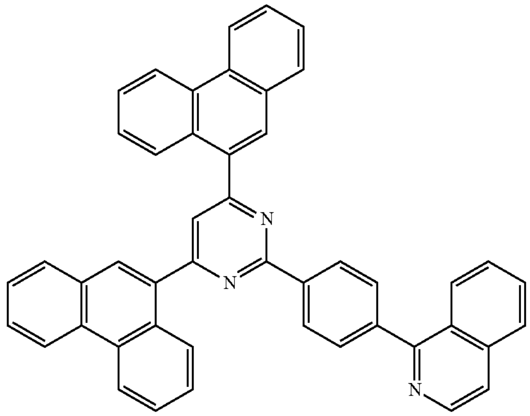

-continued
ET14
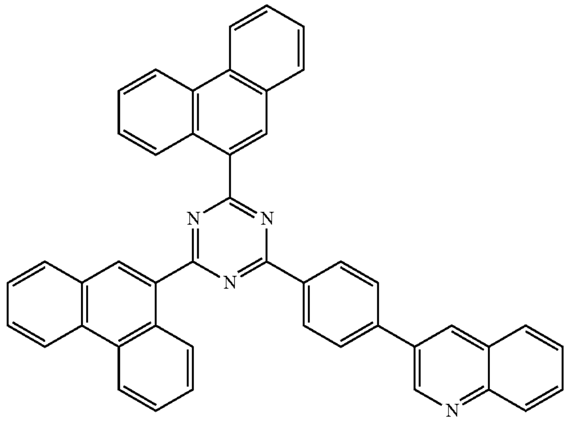
ET15
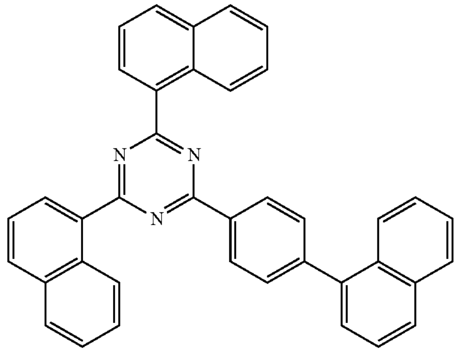
ET16
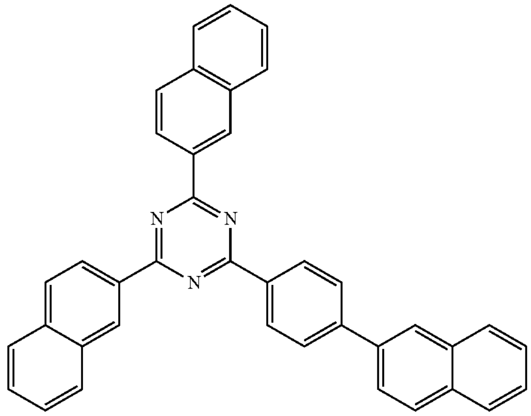
-continued
ET17
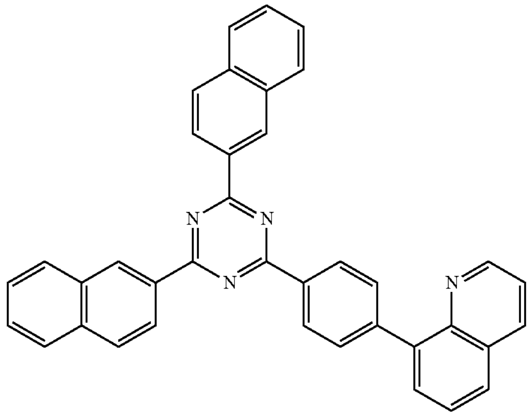
ET18
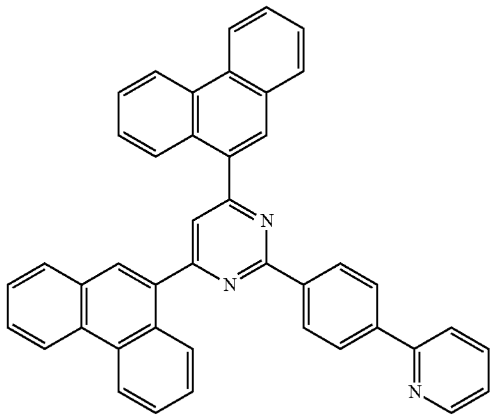
ET19
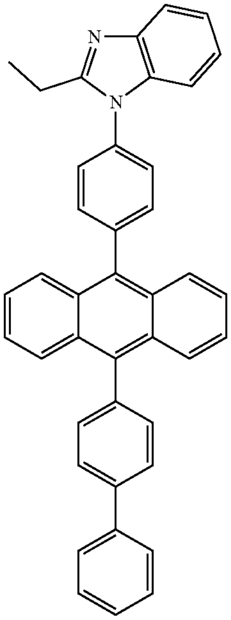

-continued
ET20
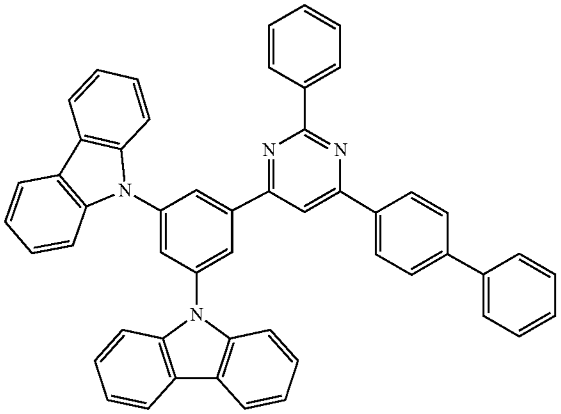
ET21
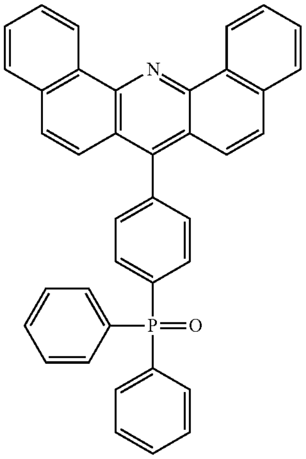
ET22
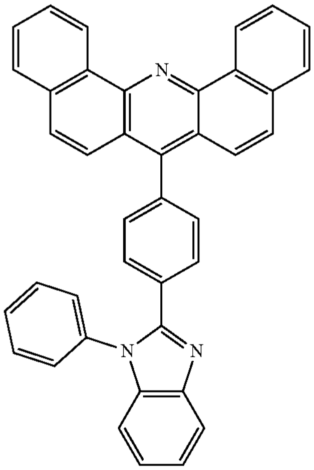
-continued
ET23
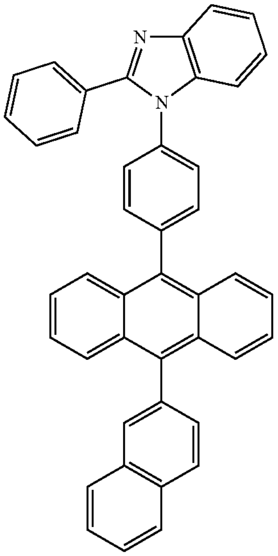
ET24
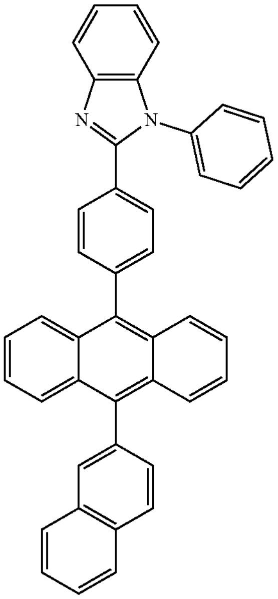
ET25
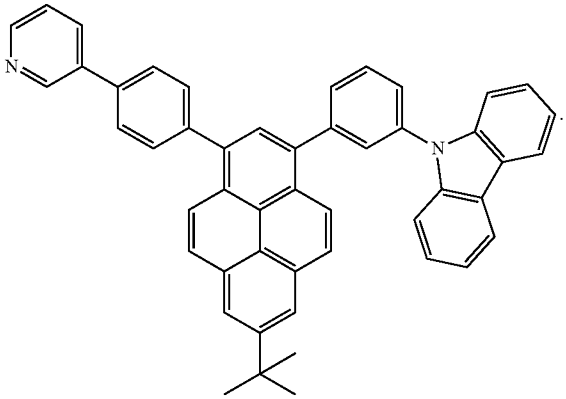
A thickness of the electron transport layer may be in the range of about 100 Å to about 1,000 Å, for example, about 150 Å to about 500 Å. When the thickness of the electron transport layer is within the range described above, the electron transport layer may have satisfactory electron transporting characteristics without a substantial increase in driving voltage.

The electron transport layer may include a metal-containing material in addition to the material as described above.

The metal-containing material may include a Li complex. The Li complex may include, for example, Compound ET-D1 or ET-D2:

ET-D1

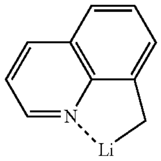

ET-D2

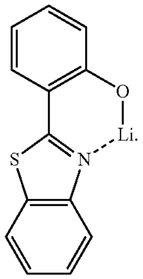

In an embodiment, the electron transport region 17 may include an electron injection layer that facilitates injection of electrons from the second electrode 19.

The electron injection layer may include LiF, NaCl, CsF, $Li_2O$, BaO, Yb, Compound ET-D1, Compound ET-D2, or any combination thereof.

A thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

The second electrode 19 may be provided on the electron transport region 17. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), silver (Ag), aluminum-lithium (Al—Li), calcium (Ca), magnesium-indium (Mg—In), magnesium-silver (Mg—Ag), or the like may be used as the material for forming the second electrode 19. In an embodiment, to manufacture a top-emission type light-emitting device, a transparent or semi-transparent electrode formed using ITO or IZO may be used as the second electrode 19.

Hereinbefore, the light-emitting device has been described in connection with FIG. 1, but embodiments of the disclosure are not limited thereto.

According to another aspect, the light-emitting device may be included in an electronic apparatus. Thus, an electronic apparatus including the light-emitting device is provided. The electronic apparatus may include, for example, a display, an illumination, a sensor, and the like.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group—as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by $-OA_{101}$ (wherein $A_{101}$ is the $C_1$-$C_{60}$ alkyl group), and examples thereof may include a methoxy group, an ethoxy group, a propoxy group, a butoxy group, a pentoxy group, or the like.

The term "$C_1$-$C_{60}$ alkylthio group" as used herein refers to a monovalent group having the formula of $-SA_{101}$ (where $A_{101}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group may include a cyclopropyl group, a cyclobutyl group, a cyclopentyl, cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, a bicyclo[2.2.2]octyl group, or the like.

The term "$C_1$-$C_{10}$ heterocycloalkyl group" as used herein refers to a monovalent saturated cyclic group that includes at least one hetero atom selected from N, O, P, Si, S, Se, Ge, and B as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group may include a silolanyl group, a silinanyl group, a tetrahydrofuranyl group, a tetrahydro-2H-pyranyl group, a tetrahydrothiophenyl group, or the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms, and at least one double bond in its ring. Examples of the $C_1$-$C_{10}$ heterocycloalkenyl group include a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include two or more rings, the rings may be fused to each other.

The $C_7$-$C_{60}$ alkylaryl group used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group that includes at least one hetero atom selected from N, O, P, Si, S, Se, Ge, and B as a ring-forming atom and a cyclic aromatic system having 1 to 60 carbon atoms, and the term "$C_1$-$C_{60}$ heteroarylene group" as used herein refers to a divalent group that includes at least one hetero atom selected from N, O, P, Si, S, Se, Ge, and B as a ring-forming atom and a cyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The $C_2$-$C_{60}$ alkylheteroaryl group used herein refers to a $C_1$-$C_{60}$ heteroaryl group substituted with at least one $C_1$-$C_{60}$ alkyl group.

The term "$C_6$-$C_{60}$ aryloxy group" as used herein indicates $-OA_{102}$ (wherein $A_{102}$ indicates the $C_6$-$C_{60}$ aryl group), the $C_6$-$C_{60}$ arylthio group indicates $-SA_{103}$ (wherein $A_{103}$ indicates the $C_6$-$C_{60}$ aryl group), and the $C_1$-$C_{60}$ alkylthio group indicates $-SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, including at least one hetero atom selected from N, O, P, Si, S, Se, Ge, and B, other than carbon atoms, as a ring-forming atom, and having no aromaticity in its entire molecular structure. Examples of the monovalent non-aromatic condensed heteropolycyclic group include a carbazolyl group or the like. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" used herein may include an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

In an embodiment, examples of the "$C_5$-$C_{30}$ carbocyclic group" and "$C_1$-$C_{30}$ heterocyclic group" as used herein include i) a first ring, ii) a second ring, iii) a condensed ring in which two or more first rings are condensed with each other, iv) a condensed ring in which two or more second rings are condensed with each other, or v) a condensed ring in which at least one first ring and at least one second ring are condensed with each other, the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "the fluorinated $C_3$-$C_{10}$ cycloalkyl group", "the fluorinated $C_1$-$C_{10}$ heterocycloalkyl group", or "the fluorinated phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include -$CD_3$, -$CD_2H$, and -$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein are substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon selected from ring-forming carbons is substituted with nitrogen.

The substituent of the substituted $C_5$-$C_{30}$ carbocyclic group, the substituted $C_2$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

- deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $-CD_3$, $-CD_2H$, $-CDH_2$, $—CF_3$, $—CF_2H$, $—CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;
- $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or
- any combination thereof.

$Q_1$ to $Q_9$, $Q_{11}$ to $Q_{19}$, $Q_{21}$ to $Q_{29}$, and $Q_{31}$ to $Q_{39}$ in the present specification may each independently be: hydrogen; deuterium; —F; —$C_1$; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with deuterium, a $C_1$-$C_{60}$ alkyl group, a $C_6$-$C_{60}$ aryl group, or any combination thereof.

For example, $Q_1$ to $Q_9$, $Q_{11}$ to $Q_{19}$, $Q_{21}$ to $Q_{29}$, and $Q_{31}$ to $Q_{39}$ described herein may each independently be:

- $—CH_3$, $-CD_3$, $-CD_2H$, $-CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $-CD_2CD_3$, $-CD_2CD_2H$, or $-CD_2CDH_2$; or
- an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a light-emitting device according to embodiments of the disclosure are described in detail with reference to Examples. However, the disclosure is not limited to the following examples.

EXAMPLES

Synthesis Example 1 (Synthesis of Compound GD-A or Compound 79 of Group 2-3)

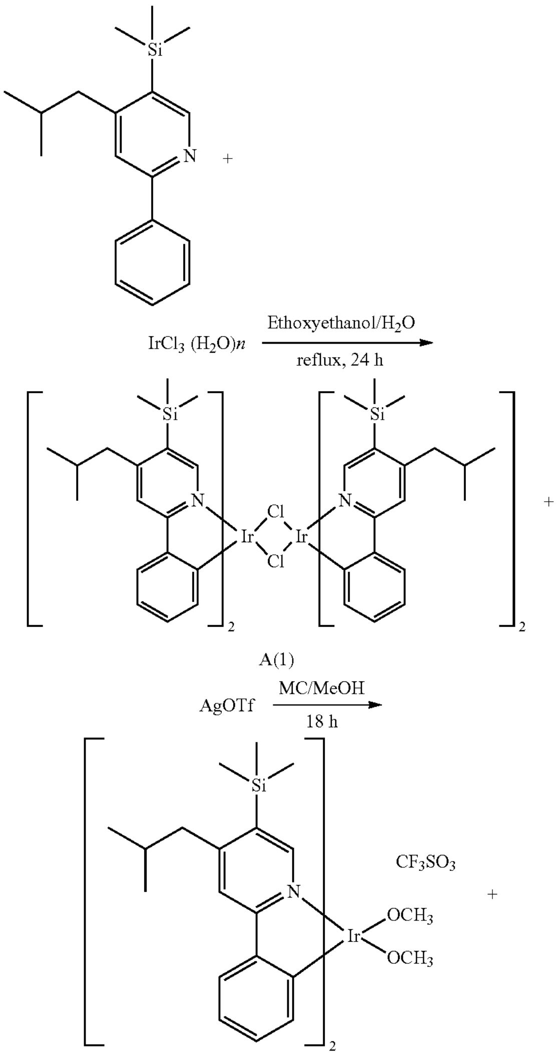

A(1)

A(2)

-continued

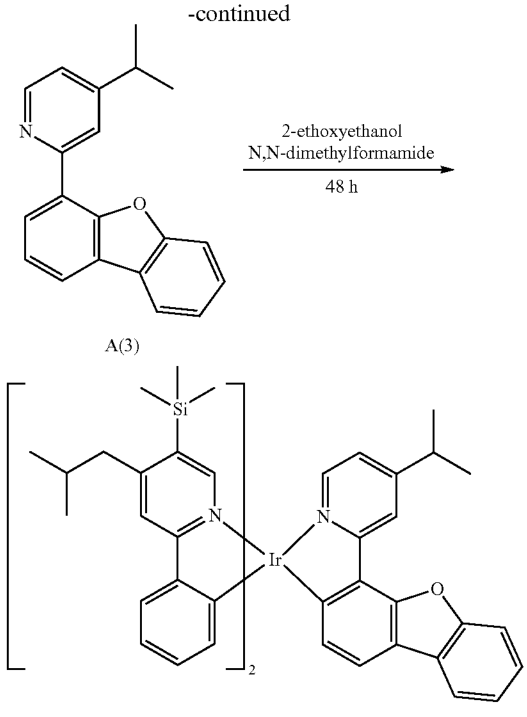

A(3)

GD-A

HRMS(MALDI) calcd for $C_{56}H_{64}IrN_3OSi_2$: m/z 1043.4217 Found: 1043.4223.

Synthesis Example 2 (Synthesis of Compound GD-B or Compound 14 of Group 2-4)

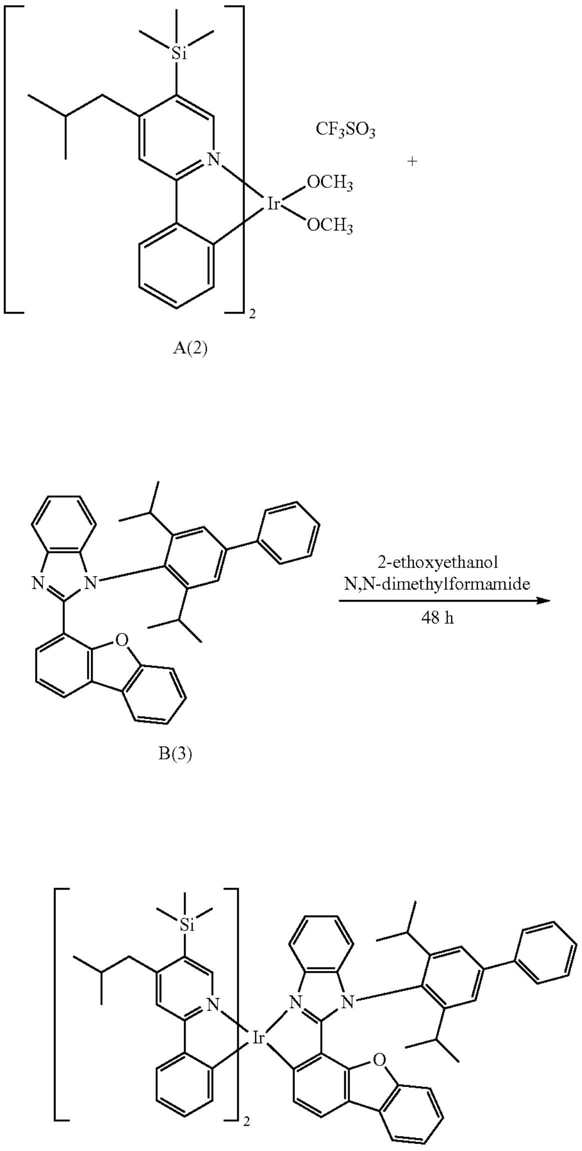

A(2)

B(3)

GD-B 2.5 g (yield of 36%) of Compound GD-B was obtained in the same manner as used to obtain Compound GD-A of Synthesis Example 1, except that Compound B(3) was used instead of Compound A(3).

HRMS(MALDI) calcd for $C_{73}H_{79}IrN_4OSi_2$: m/z 1276.5422 Found: 1276.5418.

Synthesis of Compound A(1)

4-isobutyl-2-phenyl-5-(trimethylsilyl)pyridine (8.05 g, 28.4 mmol) and iridium chloride hydrate (4.45 g, 12.6 mmol) were mixed with 120 ml of ethoxyethanol and 40 ml of distilled water and then stirred while refluxing for 24 hours, and then the temperature was lowered to room temperature. The resulting solid was separated by filtration, washed sufficiently with water, methanol, and hexane, in this stated order, and then dried in a vacuum oven to obtain 7.8 g (78% of yield) of Compound A(1).

Synthesis of Compound A(2)

Compound A(1)(6.54 g, 4.1 mmol) and 90 ml of methylene chloride (MC) were mixed together, and then, AgOTf (2.12 g, 8.24 mmol) and 30 ml of methanol (MeOH) were mixed together and added thereto. Afterwards, the mixture was stirred for 18 hours at room temperature while light was blocked with aluminum foil, and then filtered through Celite to remove the resulting solid, and the filtrate was subjected to reduced pressure to obtain a solid (Compound A(2)). Compound A(2) was used in the next reaction without an additional purification process.

Synthesis of Compound GD-A

Compound A(2)(7.25 g, 7.47 mmol) and Compound A(3)(2.36 g, 8.22 mmol) were mixed with 100 ml of 2-ethoxyethanol and N,N-dimethylformamide and then stirred while refluxing for 48 hours, and then the temperature was lowered. The obtained mixture was subjected to a reduced pressure to obtain a solid, on which column chromatography (eluent:methylene chloride (MC) and hexane) was performed to obtain 2.6 g (yield of 33%) of Compound GD-A.

Evaluation Example 1

On the quartz substrate, compounds shown in Table 1 below were vacuum-codeposited at a vacuum pressure of $10^{-7}$ torr at a weight ratio shown in Table 1 to manufacture films A and B each having a thickness of 40 nm. Compound HT(1) is a compound which is identical to Compound H1-8 of Group 5-2.

Subsequently, an emission spectrum of each of the films A and B was measured using a Quantaurus-QY Absolute PL quantum yield spectrometer of Hamamatsu company (on which a xenon light source, a monochromator, a photonic multichannel analyzer, and an integrating sphere are mounted and which includes PLQY measurement software (Hamamatsu Photonics, Ltd., Shizuoka, Japan). During the measurement, an excitation wavelength was scanned from 320 nm to 380 nm at 10 nm intervals, and a spectrum measured at the excitation wavelength of 320 nm was taken. Emission peak wavelengths of GD-A and GD-B included in the films A and B were evaluated and the results are shown in Table 1 below.

TABLE 1

| Film no. | Film composition (weight ratio) | Emission peak wavelength (nm) |
|---|---|---|
| A | HT(1):E1-62:GD-A (63:27:10) | 524 nm |
| B | HT(1):E1-62:GD-B (66.5:28.5:5) | 529 nm |

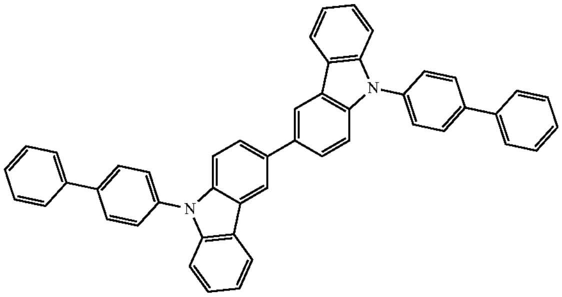

HT(1)

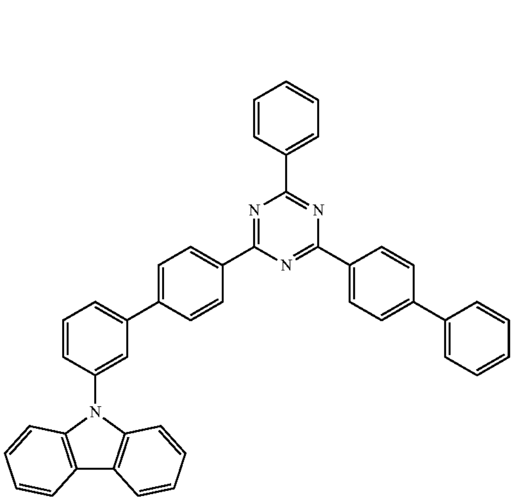

E1-62

TABLE 1-continued

| Film no. | Film composition (weight ratio) | Emission peak wavelength (nm) |
|---|---|---|

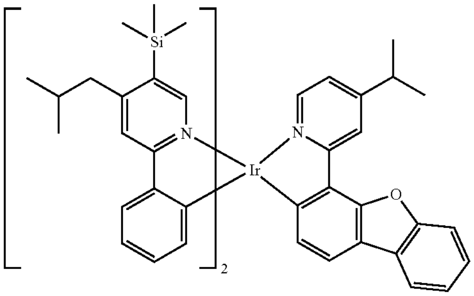

GD-A

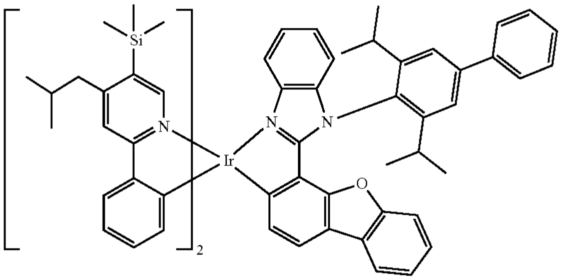

GD-B

Referring to Table 1, it was confirmed that an emission peak wavelength of GD-A was less than an emission peak wavelength of GD-B.

Evaluation Example 2

Manufacture of Light-Emitting Device A

As an anode, an ITO-patterned glass substrate was cut to a size of 50 mm×50 mm×0.5 mm, sonicated with isopropyl alcohol and pure water, each for 5 minutes, and then cleaned by irradiation of ultraviolet rays and exposure of ozone thereto for 30 minutes. The resultant glass substrate was loaded onto a vacuum deposition apparatus.

HT3 and F6-TCNNQ were vacuum-codeposited on the anode at a weight ratio of 98:2 to form a hole injection layer having a thickness of 10 nm, HT3 was vacuum-deposited on the hole injection layer to form a hole transport layer having a thickness of 135 nm, and HT(1) was vacuum-deposited on the hole transport layer to form an electron blocking layer having a thickness of 30 nm.

Next, compounds shown in Table 2 were co-deposited on the electron blocking layer at a weight ratio shown in Table 2 to form an emission layer EA having a thickness of 40 nm.

Afterwards, ET3 and ET-D1 were co-deposited on the emission layer EA at a volume ratio of 50:50 to form an electron transport layer having a thickness of 35 nm, ET-D1 was vacuum-deposited on the electron transport layer to form an electron injection layer having a thickness of 1 nm, and then Al was vacuum-deposited on the electron injection layer to form a cathode having a thickness of 100 nm, thereby completing manufacture of a light-emitting device A.

HT3

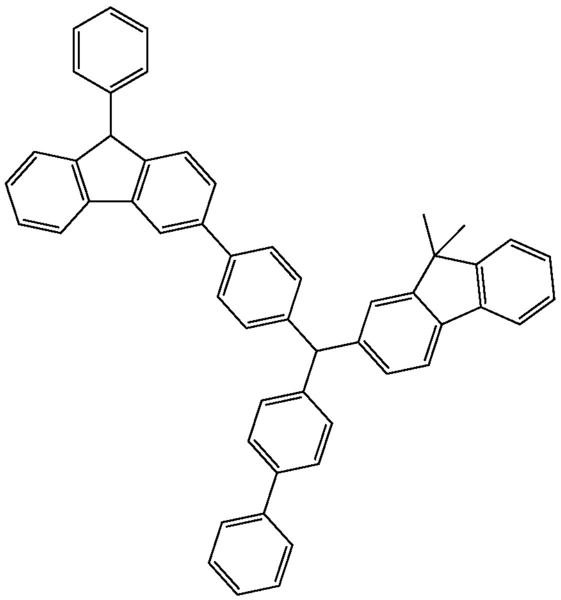

F6-TCNNQ

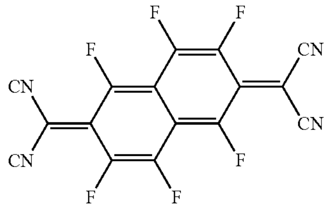

ET3

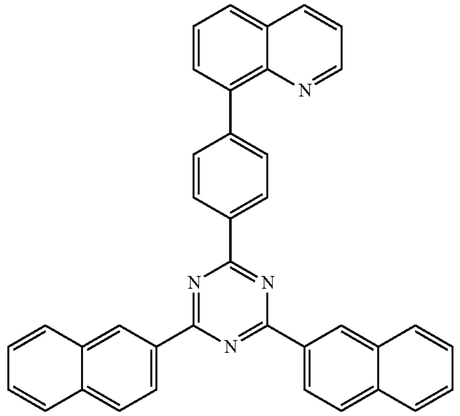

ET-D1

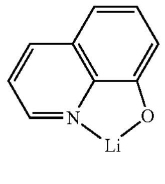

Manufacture of Light-Emitting Device B

A light-emitting device B was manufactured in the same manner as used to manufacture the light-emitting device A, except that compounds shown in Table 2 were co-deposited on the electron blocking layer at a weight ratio shown in Table 2 to form an emission layer EB having a thickness of 40 nm instead of the emission layer EA.

Evaluation on Current Densities of Light-Emitting Devices A and B

Figure 2:
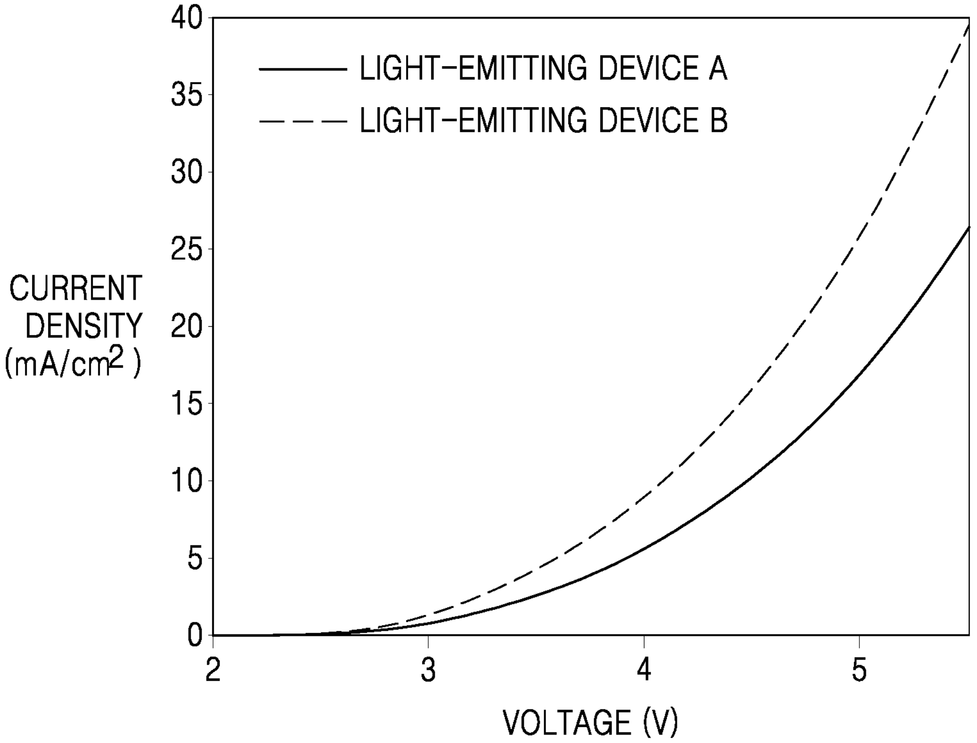
FIG. 2 is a diagram showing a voltage-current density graph of a light-emitting device A and a light-emitting device B manufactured in Evaluation Example 2.

Current densities according to voltages of the light-emitting devices A and B were measured in a range of −6 V to 5.5 V using a current-voltage meter (Keithley 2400), and then current densities at 5.5 V were measured and shown in Table 2 below. A graph of a voltage-current density of the light-emitting devices A and B is understood with reference to FIG. 2.

TABLE 2

| Light-emitting device No. | Emission layer composition (weight ratio) | Current density at 5.5 V (mA/cm$^2$) |
|---|---|---|
| A | HT(1):E1-62:GD-A (63:27:10) (composition and weight ratio of emission layer EA) | 26.5 |
| B | HT(1):E1-62:GD-B (66.5:28.5:5) (composition and weight ratio of emission layer EB) | 39.5 |

Referring to Table 2, it may be confirmed that the current density (at 5.5 V) of the light-emitting device B including only the emission layer EB as an emission layer is greater than the current density (at 5.5 V) of the light-emitting device A including only the emission layer EA as an emission layer.

Manufacture of OLED 1-1

As an anode, a glass substrate with ITO/Ag/ITO deposited thereon to a thickness of 70/1,000/70 Å was cut to a size of 50 mm×50 mm×0.5 mm, sonicated with isopropyl alcohol and pure water each for 5 minutes, and then cleaned by irradiation of ultraviolet rays and exposure of ozone thereto for 30 minutes. Then the resultant glass substrate was loaded onto a vacuum deposition apparatus.

HT3 and F6-TCNNQ were vacuum-codeposited on the anode at a weight ratio of 98:2 to form a hole injection layer having a thickness of 10 nm, HT3 was vacuum-deposited on the hole injection layer to form a hole transport layer having a thickness of 128 nm, and HT(1) was vacuum-deposited on the hole transport layer to form an electron blocking layer having a thickness of 30 nm.

Next, a dopant (GD-A) and a host (HT(1) and E1-62) were co-deposited on the electron blocking layer to form a first emission layer having a thickness of 15 nm, and a dopant (GD-B) and a host (HT(1) and E1-62) were co-deposited on the first emission layer to form a second emission layer having a thickness of 18 nm, thereby completing manufacture of an emission layer. An amount of the dopant in the first emission layer was 10 parts by weight based on 100 parts by weight of the first emission layer, an amount of the dopant in the second emission layer was 5 parts by weight based on 100 parts by weight of the second emission layer, and a weight ratio of HT(1) and E1-62 in the first emission layer and the second emission layer was 7:3.

Afterwards, ET3 and ET-D1 were co-deposited on the emission layer at a volume ratio of 50:50 to form an electron transport layer having a thickness of 35 nm, LiF was vacuum-deposited on the electron transport layer to form an electron injection layer having a thickness of 1 nm, and then Mg and Ag were co-deposited on the electron injection layer at a weight ratio of 90:10 to form a cathode having a thickness of 12 nm, thereby completing manufacture of a light-emitting device.

Manufacture of OLEDs 1-2 to 1-4

OLEDs 1-2 to 1-4 were manufactured in the same manner as used to manufacture the OLED 1-1, except that the thickness of the hole transport layer was changed as shown in Table 3 below.

TABLE 3

| | | | OLED 1-1 | OLED 1-2 | OLED 1-3 | OLED 1-4 |
|---|---|---|---|---|---|---|
| Cathode | | Composition | Mg:Ag (90:10) | | | |
| | | Thickness | 12 nm | | | |
| Emission layer | Second emission layer | Dopant | GD-B | | | |
| | | Amount of dopant | 5 parts by weight based on 100 parts by weight of second emission layer | | | |
| | | Host composition (weight ratio) | HT(1):E1-62 (7:3) | | | |
| | | Thickness | 18 nm | | | |
| | First emission layer | Dopant | GD-A | | | |
| | | Amount of dopant | 10 parts by weight based on 100 parts by weight of first emission layer | | | |
| | | Host composition (weight ratio) | HT(1):E1-62 (7:3) | | | |
| | | Thickness | 15 nm | | | |
| Hole transport layer | | Thickness of hole transport layer | 128 nm | 132 nm | 136 nm | 140 nm |
| Anode (reflective electrode) | | Composition and thickness | ITO/Ag/ITO (70 Å/1,000 Å/70 Å) | | | |

Manufacture of OLEDs C1-1 to C1-4

OLEDs C1-1 to C1-4 were manufactured in the same manner as used to manufacture the OLEDs 1-1 to 1-4, except that the configuration of the emission layer was changed as shown in Table 4 below.

TABLE 4

| | | OLED C1-1 | OLED C1-2 | OLED C1-3 | OLED C1-4 |
|---|---|---|---|---|---|
| cathode | Composition | Mg:Ag (90:10) | | | |
| | Thickness | 12 nm | | | |
| Emission layer | Dopant | GD-A | | | |
| | Amount of dopant | 10 parts by weight based on 100 parts by weight of emission layer | | | |
| | Host composition (weight ratio) | HT(1):E1-62 (7:3) | | | |
| | Thickness | 33 nm | | | |
| Hole transport layer | Thickness of hole transport layer | 128 nm | 132 nm | 136 nm | 140 nm |
| Anode (reflective electrode) | Composition and thickness | ITO/Ag/ITO (70 Å/1,000 Å/70 Å) | | | |

Manufacture of OLEDs C2-1 to C2-4

OLEDs C2-1 to C2-4 were manufactured in the same manner as used to manufacture the OLEDs 1-1 to 1-4, except that the configuration of the emission layer was changed as shown in Table 5 below.

TABLE 5

| | | OLED C2-1 | OLED C2-2 | OLED C2-3 | OLED C2-4 |
|---|---|---|---|---|---|
| Cathode | Composition | Mg:Ag (90:10) | | | |
| | Thickness | 12 nm | | | |
| Emission layer | Dopant | GD-B | | | |
| | Amount of dopant | 5 parts by weight based on 100 parts by weight of emission layer | | | |
| | Host composition (weight ratio) | HT(1):E1-62 (7:3) | | | |
| | Thickness | 33 nm | | | |
| Hole transport layer | Thickness of hole transport layer | 128 nm | 132 nm | 136 nm | 140 nm |

TABLE 5-continued

| | | OLED C2-1 | OLED C2-2 | OLED C2-3 | OLED C2-4 |
|---|---|---|---|---|---|
| Anode (reflective electrode) | Composition and thickness | ITO/Ag/ITO (70 Å/1,000 Å/70 Å) | | | |

Manufacture of OLEDs C3-1 to C3-4

OLEDs C3-1 to C3-4 were manufactured in the same manner as used to manufacture the OLEDs 1-1 to 1-4, except that the configuration of the emission layer was changed as shown in Table 6 below.

TABLE 6

| | | | OLED C3-1 | OLED C3-2 | OLED C3-3 | OLED C3-4 |
|---|---|---|---|---|---|---|
| Cathode | | Composition | Mg:Ag (90:10) | | | |
| | | Thickness | 12 nm | | | |
| Emission layer | Second emission layer | Dopant | GD-A | | | |
| | | Amount of dopant | 10 parts by weight based on 100 parts by weight of second emission layer | | | |
| | | Host composition (weight ratio) | HT(1):E1-62 (7:3) | | | |
| | | Thickness | 18 nm | | | |
| | First emission layer | Dopant | GD-B | | | |
| | | Amount of dopant | 5 parts by weight based on 100 parts by weight of first emission layer | | | |
| | | Host composition (weight ratio) | HT(1):E1-62 (7:3) | | | |
| | | Thickness | 15 nm | | | |
| Hole transport layer | | Thickness of hole transport layer | 128 nm | 132 nm | 136 nm | 140 nm |
| Anode (reflective electrode) | | Composition and thickness | ITO/Ag/ITO (70 Å/1,000 Å/70 Å) | | | |

Evaluation Example

For each of the OLEDs 1-1 to 1-4, the OLEDs C1-1 to C1-4, the OLEDs C2-1 to C2-4, and the OLEDs C3-1 to C3-4, an emission peak wavelength (nm) of an electroluminescence (EL) spectrum, x coordinate (CIEx) of CIE color coordinates, and luminescence efficiency (cd/A)(at 15,000 nit) relative to current density were evaluated, and the results are shown in Table 7. As evaluation apparatuses, a current-voltage meter (Keithley 2400) and a luminance meter (Minolta Cs-1000A) were used.

TABLE 7

| | Thickness of hole transport layer (nm) | Emission peak wavelength (nm) of EL spectrum | CIEx | Luminescence efficiency (cd/A @Op.) |
|---|---|---|---|---|
| OLED 1-1 | 128 | 525 | 0.195 | 143.0 |
| OLED 1-2 | 132 | 527 | 0.209 | 153.0 |
| OLED 1-3 | 136 | 529 | 0.232 | 169.3 |
| OLED 1-4 | 140 | 533 | 0.262 | 173.4 |
| OLED C1-1 | 128 | 521 | 0.192 | 107.7 |
| OLED C1-2 | 132 | 523 | 0.205 | 134.0 |
| OLED C1-3 | 136 | 526 | 0.226 | 153.8 |
| OLED C1-4 | 140 | 529 | 0.251 | 165.5 |
| OLED C2-1 | 128 | 527 | 0.213 | 117.6 |
| OLED C2-2 | 132 | 528 | 0.226 | 147.8 |
| OLED C2-3 | 136 | 530 | 0.244 | 172.9 |
| OLED C2-4 | 140 | 532 | 0.265 | 180.0 |
| OLED C3-1 | 128 | 525 | 0.211 | 97.3 |
| OLED C3-2 | 132 | 527 | 0.219 | 122.7 |
| OLED C3-3 | 136 | 528 | 0.232 | 152.4 |
| OLED C3-4 | 140 | 530 | 0.249 | 168.2 |

Next, 1) a CIEx-luminescence efficiency curve (see "curve 1" of FIG. 3) of a light-emitting device including the emission layer of the OLEDs 1-1 to 1-4 (hereinafter, referred to as "OLED 1") was obtained from CIEx and luminescence efficiency data of each of the OLEDs 1-1 to 1-4 of Table 7, 2) a CIEx-luminescence efficiency curve (see "curve C1" of FIG. 3) of a light-emitting device including the emission layer of the OLEDs C1-1 to C1-4 (hereinafter, referred to as "OLED C1") was obtained from CIEx and luminescence efficiency data of each of the OLEDs C1-1 to C1-4 of Table 7, 3) a CIEx-luminescence efficiency curve (see "curve C2" of FIG. 3) of a light-emitting device including the emission layer of the OLEDs C2-1 to C2-4 (hereinafter, referred to as "OLED C2") was obtained from CIEx and luminescence efficiency data of each of the OLEDs C2-1 to C2-4 of Table 7, and 4) a CIEx-luminescence efficiency curve (see "curve C3" of FIG. 3) of a light-emitting device including the emission layer of the OLEDs C3-1 to C3-4 (hereinafter, referred to as "OLED C3") was obtained from CIEx and luminescence efficiency data of each of the OLEDs C3-1 to C3-4 of Table 7.

Referring to FIG. 3, it may be confirmed that the curve 1 has a gentler curvature than the curves C1 to C3. That is, it may be confirmed that the OLED 1 has a smaller amount of change in luminescence efficiency with respect to the change in CIEx resulting from a change in a resonance distance (e.g., a change in a resonance distance due to a change in a thickness of a hole transport layer) than that that of each of the OLEDs C1 to C3, and thus, a luminescence efficiency deviation according to the change in color coordinates is improved.

Also, referring to FIG. 3, it may be confirmed that the OLED 1 has improved luminescence efficiency in all CIEx ranges compared to the OLED C1.

The light-emitting device according to embodiments of the disclosure has excellent luminescence efficiency sensitivity according to emission color, excellent luminescence efficiency, and an excellent side luminance ratio. Accordingly, a high-quality electronic apparatus may be manufactured using the light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode;

a second electrode facing the first electrode; and an emission layer between the first electrode and the second electrode, wherein the first electrode is a reflective electrode, the emission layer comprises: i) a first emission layer; and ii) a second emission layer between the first emission layer and the second electrode, and the second electrode is a transparent electrode or a semi-transparent electrode, the first emission layer comprises a first compound that emits a first light having an emission peak wavelength λP(1) in nm, the second emission layer comprises a second compound that emits a second light having an emission peak wavelength λP(2) in nm, wherein the first compound and the second compound are different from each other, wherein the emission layer emits a third light having an emission peak wavelength λP(3) in nm, λP(1) is less than λP(2),

|λP(1)−λP(2)| is greater than 0 nm and less than or equal to about 30 nm, each of |λP(2)−λP(3)| and |λP(3)−λP(1)| is greater than or equal to 0 nm and less than or equal to about 30 nm, λP(1) and λP(2) are evaluated from photoluminescence spectra measured for a first film and a second film, respectively, the first film comprises a first compound, the second film comprises a second compound, and λP(3) is evaluated from an electroluminescence spectrum of the light-emitting device, wherein the third light is extracted to outside through the second electrode, and wherein at least one of condition i) or condition ii) is true:

i) the first compound and the second compound are independently organometallic phosphorescent compounds including platinum or iridium; and ii) each of λP(1), λP(2), and λP(3) is about 500 nm to 570 nm, or each of λP(1), λP(2), and λP(3) is about 570 nm to 630 nm.

2. The light-emitting device of claim 1, wherein the first electrode is an anode, and the second electrode is a cathode.

3. The light-emitting device of claim 1, wherein |λP(1)−λP(2)| is greater than 0 nm and less than or equal to about 10 nm.

4. The light-emitting device of claim 1, wherein each of |λP(2)−λP(3)| and |λP(3)−λP(1)| is greater than or equal to 0 nm and less than or equal to about 15 nm.

5. The light-emitting device of claim 1, wherein $$\lambda P(1)<\lambda P(2)\leq\lambda P(3), \quad i)$$

$$\lambda P(1)\leq\lambda P(3)<\lambda P(2), \quad ii)$$

$$\lambda P(1)<\lambda P(3)\leq\lambda P(2), \text{ or} \quad iii)$$

$$\lambda P(3)\leq\lambda P(1)<\lambda P(2). \quad iv)$$

6. The light-emitting device of claim 1, wherein condition ii) is true, and each of λP(1), λP(2), and λP(3) is about 500 nm to about 570 nm.

7. The light-emitting device of claim 6, wherein i) λP(1) is about 510 nm to about 530 nm, λP(2) is about 520 nm to about 540 nm, and λP(3) is about 510 nm to about 540 nm, or ii) λP(1) is about 540 nm to about 560 nm, λP(2) is about 550 nm to about 570 nm, and λP(3) is about 540 nm to about 570 nm.

8. The light-emitting device of claim 1, wherein condition ii) is true, and each of λP(1), λP(2), and λP(3) is about 570 nm to about 650 nm.

9. The light-emitting device of claim 8, wherein λP(1) is about 590 nm to about 630 nm, λP(2) is about 620 nm to about 650 nm, and λP(3) is about 590 nm to about 650 nm.

10. The light-emitting device of claim 1, wherein condition i) is true, and each of λP(1), λP(2), and λP(3) is about 400 nm to about 500 nm.

11. The light-emitting device of claim 10, wherein λP(1) is 430 nm to 480 nm, λP(2) is about 460 nm to about 500 nm, and λP(3) is about 430 nm to about 500 nm.

12. The light-emitting device of claim 1, wherein Condition A is satisfied:

$$CD(1)<CD(2) \quad \text{Condition A}$$

wherein, in Condition A,

CD(1) is a current density in $mA/cm^2$ of a first light-emitting device,

CD(2) is a current density in $mA/cm^2$ of a second light-emitting device,

CD(1) and CD(2) are evaluated by measuring current densities of the first light-emitting device and the second light-emitting device under same voltage, the first light-emitting device comprises:

a first electrode; a second electrode facing the first electrode; and an emission layer E1 between the first electrode and the second electrode, the emission layer E1 of the first light-emitting device corresponds to the first emission layer, and does not comprise the second emission layer, the second light-emitting device comprises:

a first electrode; a second electrode facing the first electrode, and an emission layer E2 between the first electrode and the second electrode, the emission layer E2 of the second light-emitting device corresponds to the second emission layer, and does not comprise the first emission layer, and a structure of the first light-emitting device excluding the emission layer E1 and a structure of the second light-emitting device excluding the emission layer E2 are identical to each other.

13. The light-emitting device of claim 1, wherein the third spectrum comprises a main emission peak having λP(3), and the third spectrum does not comprise an additional emission peak having an emission peak wavelength of λP(3)+about 50 nm or more or λP(3)−about 50 nm or less.

14. The light-emitting device of claim 1, further comprising a hole transport region between the first electrode and the emission layer and an electron transport region between the emission layer and the second electrode.

15. The light-emitting device of claim 1, wherein the first emission layer further comprises a first host, and the second emission layer further comprises a second host.

16. An electronic apparatus comprising the light-emitting device of claim 1.

17. A light-emitting device comprising:

a first electrode; a second electrode facing the first electrode; and an emission layer between the first electrode and the second electrode, wherein the first electrode is a reflective electrode, the emission layer comprises: i) a first emission layer; and ii) a second emission layer between the first emission layer and the second electrode, and the second electrode is a transparent electrode or a semi-transparent electrode, the first emission layer comprises a first compound capable of emitting a first light having a first spectrum, and λP(1) is an emission peak wavelength in nm, the second emission layer comprises a second compound capable of emitting a second light having a second spectrum, and λP(2) is an emission peak wavelength in nm, wherein the first compound and the second compound are different from each other, the emission layer emits a third light having a third spectrum, and λP(3) is an emission peak wavelength in nm, λP(1) is less than λP(2), and |λP(1)−λP(2)| is greater than 0 nm and less than or equal to about 30 nm, each of |λP(2)−λP(3)| and |λP(3)−λP(1)| is greater than or equal to 0 nm and less than or equal to about 30 nm, λP(1) and λP(2) are evaluated from photoluminescence spectra measured for a first film and a second film, respectively, the first film comprises a first compound, the second film comprises a second compound, and λP(3) is evaluated from an electroluminescence spectrum of the light-emitting device, wherein the third light is extracted to outside through the second electrode, and Condition A is satisfied:

$$CD(1)<CD(2) \qquad \text{Condition A}$$

wherein, in Condition A,

CD(1) is a current density in $mA/cm^2$ of a first light-emitting device,

CD(2) is a current density in $mA/cm^2$ of a second light-emitting device,

CD(1) and CD(2) are evaluated by measuring current densities of the first light-emitting device and the second light-emitting device under same voltage, wherein the first light-emitting device comprises:

a first electrode; a second electrode facing the first electrode; and an emission layer E1 between the first electrode and the second electrode, the emission layer E1 of the first light-emitting device corresponds to the first emission layer, and does not comprise the second emission layer, wherein the second light-emitting device comprises:

a first electrode; a second electrode facing the first electrode, and an emission layer E2 between the first electrode and the second electrode, the emission layer E2 of the second light-emitting device corresponds to the second emission layer, and does not comprise the first emission layer, and a structure of the first light-emitting device excluding the emission layer E1 and a structure of the second light-emitting device excluding the emission layer E2 are identical to each other.

18. The light-emitting device of claim 17, wherein i) λP(1) is about 510 nm to about 530 nm, λP(2) is about 520 nm to about 540 nm, and λP(3) is about 510 nm to about 540 nm;

ii) λP(1) is about 540 nm to about 560 nm, λP(2) is about 550 nm to about 570 nm, and λP(3) is about 540 nm to about 570 nm;

iii) λP(1) is about 590 nm to about 630 nm, λP(2) is about 620 nm to about 650 nm, and λP(3) is about 590 nm to about 650 nm; or iv) λP(1) is 430 nm to 480 nm, λP(2) is about 460 nm to about 500 nm, and λP(3) is about 430 nm to about 500 nm.

19. The light-emitting device of claim 17, wherein

|λP(1)−λP(2)| may be greater than 0 nm and less than or equal to about 10 nm, and

|λP(2)−λP(3)| and |λP(3)−λP(1)| may be greater than or equal to 0 nm and less than or equal to about 15 nm.

* * * * *